US012048243B2

(12) United States Patent
Kim et al.

(10) Patent No.: US 12,048,243 B2
(45) Date of Patent: Jul. 23, 2024

(54) ORGANIC LIGHT-EMITTING DEVICE

(71) Applicants: Samsung Electronics Co., Ltd., Suwon-si (KR); Research & Business Foundation SUNGKYUNKWAN UNIVERSITY, Suwon-si (KR)

(72) Inventors: Jiwhan Kim, Seoul (KR); Kyunghyung Lee, Seoul (KR); Junyeob Lee, Seongnam-si (KR); Soonok Jeon, Suwon-si (KR); Eunsuk Kwon, Suwon-si (KR); Jong Soo Kim, Seoul (KR); Joonghyuk Kim, Seoul (KR); Sungho Nam, Daegu (KR); Yusuke Maruyama, Hwaseong-si (KR); Dmitry Androsov, Hwaseong-si (KR); Hasup Lee, Seoul (KR); Sooghang Ihn, Hwaseong-si (KR); Yeonsook Chung, Seoul (KR); Hyeonho Choi, Seoul (KR)

(73) Assignees: SAMSUNG ELECTRONICS CO., LTD., Gyeonggi-Do (KR); RESEARCH & BUSINESS FOUNDATION SUNGKYUNKWAN UNIVERSITY, Gyeonggi-Do (KR)

( * ) Notice: Subject to any disclaimer, the term of this patent is extended or adjusted under 35 U.S.C. 154(b) by 388 days.

(21) Appl. No.: 17/239,871

(22) Filed: Apr. 26, 2021

(65) Prior Publication Data

US 2022/0149287 A1 May 12, 2022

(30) Foreign Application Priority Data

Apr. 27, 2020 (KR) ........................ 10-2020-0051054
Apr. 19, 2021 (KR) ........................ 10-2021-0050745

(51) Int. Cl.
*H10K 85/30* (2023.01)
*C09K 11/06* (2006.01)
(Continued)

(52) U.S. Cl.
CPC ............ *H10K 85/654* (2023.02); *C09K 11/06* (2013.01); *H10K 85/322* (2023.02);
(Continued)

(58) Field of Classification Search
CPC .... H10K 85/654; H10K 85/322; H10K 50/11; H10K 2101/10; H10K 2101/90; C09K 11/06
(Continued)

(56) References Cited

U.S. PATENT DOCUMENTS 7,466,073 B2 12/2008 Kishino et al.
8,945,722 B2 2/2015 Thompson et al.
(Continued)

FOREIGN PATENT DOCUMENTS

JP 2006128632 A 5/2006
JP 2015015261 A 1/2015
(Continued)

OTHER PUBLICATIONS

Soon Ok Jeon, et al., High-efficiency, long-lifetime deep-blue organic light-emitting diodes, Nature Photonics, vol. 15, Mar. 2021, pp. 208-215.

*Primary Examiner* — Ruiyun Zhang
(74) *Attorney, Agent, or Firm* — Cantor Colburn LLP

(57) ABSTRACT

Provided is an organic light-emitting device including an emission layer including a first compound, a second compound, a third compound, and a fourth compound, each satisfying a certain condition.

8 Claims, 3 Drawing Sheets

(51) Int. Cl.

| | |
|---|---|
| ***H10K 85/60*** | (2023.01) |
| *H10K 50/11* | (2023.01) |
| *H10K 50/15* | (2023.01) |
| *H10K 50/16* | (2023.01) |
| *H10K 101/00* | (2023.01) |
| *H10K 101/10* | (2023.01) |

(52) U.S. Cl.
CPC ..... *H10K 85/6572* (2023.02); *H10K 85/6574* (2023.02); *H10K 50/11* (2023.02); *H10K 50/15* (2023.02); *H10K 50/16* (2023.02); *H10K 2101/10* (2023.02); *H10K 2101/90* (2023.02)

(58) Field of Classification Search
USPC .................................................. 428/690, 917
See application file for complete search history.

(56) References Cited

U.S. PATENT DOCUMENTS

| | | | | |
|---|---|---|---|---|
| 9,905,779 | B2 | 2/2018 | Ogiwara et al. | |
| 10,240,085 | B2 | 3/2019 | Ihn et al. | |
| 10,297,764 | B2 | 5/2019 | Ihn et al. | |
| 10,862,047 | B2 | 12/2020 | Nakanotani et al. | |
| 2017/0062752 | A1 | 3/2017 | Ihn et al. | |
| 2017/0077421 | A1 | 3/2017 | Ihn et al. | |
| 2020/0002315 | A1 | 1/2020 | Chung et al. | |
| 2020/0035922 | A1 | 1/2020 | Ogiwara et al. | |
| 2020/0052212 | A1 | 2/2020 | Tasaki et al. | |
| 2020/0203652 | A1 | 6/2020 | Duan et al. | |
| 2020/0243776 | A1 | 7/2020 | Li | |
| 2020/0308209 | A1 | 10/2020 | Yoon et al. | |
| 2020/0321537 | A1* | 10/2020 | Jeon | H10K 85/6572 |
| 2020/0335709 | A1 | 10/2020 | Nishimura | |
| 2021/0005825 | A1 | 1/2021 | Tasaki et al. | |
| 2021/0005826 | A1 | 1/2021 | Tasaki et al. | |

FOREIGN PATENT DOCUMENTS

| | | | |
|---|---|---|---|
| KR | 1020200001439 | A | 1/2020 |
| WO | 2018181188 | A1 | 10/2018 |
| WO | 2018186374 | A1 | 10/2018 |
| WO | 2018186396 | A1 | 10/2018 |
| WO | 2018186404 | A1 | 10/2018 |
| WO | 2020042626 | A1 | 3/2020 |

* cited by examiner

ORGANIC LIGHT-EMITTING DEVICE

CROSS-REFERENCE TO RELATED APPLICATION

This application claims priority under 35 U.S.C. § 119 to Korean Patent Application No. 10-2020-0051054, filed on Apr. 27, 2020, in the Korean Intellectual Property Office, and Korean Patent Application No. 10-2021-0050745, filed on Apr. 19, 2021, in the Korean Intellectual Property Office, the contents of which are incorporated by reference herein in their entirety.

The presently claimed invention was made by or on behalf of the below listed parties to a joint research agreement. The joint research agreement was in effect on or before the date the claimed invention was made, and the claimed invention was part of the joint research agreement and made as a result of activities undertaken within the scope of the joint research agreement. The parties to the joint research agreement are Samsung Electronics Co., Ltd. and Research & Business Foundation, Sungkyunkwan University.

BACKGROUND

1. Field

Provided are a composition satisfying a certain condition and an organic light-emitting device including the same.

2. Description of the Related Art

Organic light-emitting devices are self-emission devices that produce full-color images, and also have wide viewing angles, high contrast ratios, short response times, and excellent characteristics in terms of luminance, driving voltage, and response speed, compared to devices in the art.

In an example, an organic light-emitting device includes an anode, a cathode, and an organic layer between the anode and the cathode, wherein the organic layer includes an emission layer. A hole-transporting region may be located between the anode and the emission layer, and an electron-transporting region may be located between the emission layer and the cathode. Holes provided from the anode may move toward the emission layer through the hole-transporting region, and electrons provided from the cathode may move toward the emission layer through the electron-transporting region. The holes and the electrons recombine in the emission layer to produce excitons. These excitons transition from an excited state to a ground state to thereby generate light.

SUMMARY

Provided are a composition satisfying a certain condition and an organic light-emitting device including the same.

Additional aspects will be set forth in part in the description which follows and, in part, will be apparent from the description, or may be learned by practice of the presented embodiments of the disclosure.

According to an aspect, an organic light-emitting device includes a first electrode, a second electrode, and an organic layer between the first electrode and the second electrode, wherein the organic layer includes an emission layer, the emission layer includes a first compound, a second compound, a third compound, and a fourth compound, the first compound and the second compound forms an exciplex, the exciplex and the third compound satisfy Conditions 1-1 and 1-2, and the fourth compound is represented by Formula 503.

$$T_1(Ex) \leq T_1(C3) < S_1(Ex) \quad \text{Condition 1-1}$$

$$T_1(C3) - T_1(Ex) < 0.3 \text{ eV} \quad \text{Condition 1-2}$$

In Conditions 1-1 and 1-2, $T_1$(Ex) is a lowest excited triplet energy level of the exciplex, $T_1$(C3) is a lowest excited triplet energy level of the third compound, and $S_1$(Ex) is a lowest excited singlet energy level of the exciplex, Formula 503

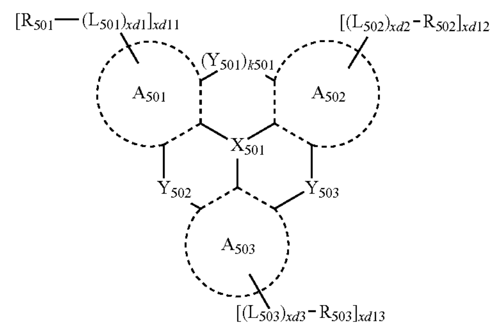

in Formula 503, $X_{501}$ is N, B, P(═O)($R_{504}$), or P(═S)($R_{504}$), $Y_{501}$ to $Y_{502}$ are each independently O, S, N($R_{505}$), B($R_{505}$), C($R_{505}$)($R_{506}$), or Si($R_{505}$)($R_{506}$), k501 is 0 or 1, wherein, when k501 is 0, —$(Y_{501})_{k501}$— may not exist, $A_{501}$ to $A_{503}$ are each independently a $C_5$-$C_{30}$ carbocyclic group and a $C_1$-$C_{30}$ heterocyclic group, $L_{501}$ to $L_{503}$ are each independently a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycydic group, or a substituted or unsubstituted divalent non-aromatic condensed heteropolycyclic group, xd1 to xd3 are each independently an integer from 0, 1, 2 or 3, $R_{501}$ to $R_{506}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{10}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, and $R_{501}$ to $R_{506}$ are optionally linked to each other to form a substituted or unsubstituted $C_5$-$C_{30}$ carbocyclic group and a substituted or unsubstituted $C_1$-$C_{30}$ heterocyclic group, xd11 and xd12 are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

According to another aspect, an organic light-emitting device includes a first electrode, a second electrode, and an organic layer between the first electrode and the second electrode, wherein the organic layer includes an emission layer, the emission layer includes a first compound, a third compound, and a fourth compound, the first compound and the third compound satisfy Conditions 1-3 and 1-4, and the fourth compound is represented by Formula 503.

$$T_1(C1) \le T_1(C3) < S_1(C1) \quad \text{Condition 1-3}$$

$$T_1(C3) - T_1(C1) < 0.3\ \text{eV} \quad \text{Condition 1-4}$$

In Conditions 1-3 and 1-4, $T_1(C1)$ is a lowest excited triplet energy level of the first compound, $T_1(C3)$ is a lowest excited triplet energy level of the third compound, and $S_1(C1)$ is a lowest excited singlet energy level of the first compound, Formula 503

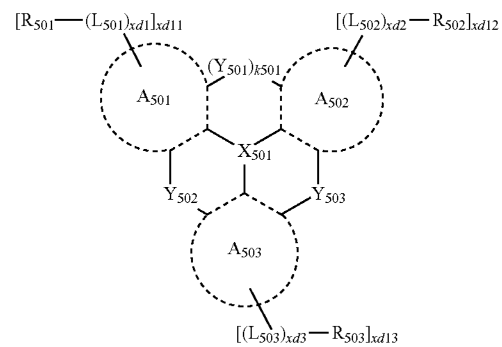

in Formula 503, $X_{501}$ is N, B, $P(=O)(R_{504})$, or $P(=S)(R_{504})$, $Y_{501}$ to $Y_{502}$ are each independently O, S, $N(R_{505})$, $B(R_{505})$, $C(R_{505})(R_{506})$, or $Si(R_{505})(R_{506})$, k501 is 0 or 1, wherein, when k501 is 0, —$(Y_{501})_{k501}$— may not exist, $A_{501}$ to $A_{503}$ are each independently be a $C_5$-$C_{30}$ carbocyclic group or a $C_1$-$C_{30}$ heterocyclic group, $L_{501}$ to $L_{503}$ are each independently a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd3 are each independently 0, 1, 2 or 3, $R_{501}$ to $R_{506}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, and $R_{501}$ to $R_{506}$ are optionally linked to each other to form a substituted or unsubstituted $C_5$-$C_{30}$ carbocyclic group and a substituted or unsubstituted $C_1$-$C_{30}$ heterocyclic group, xd11 and xd12 are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{10}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

According to another aspect, an organic light-emitting device includes a first electrode, a second electrode, m light-emitting units located between the first electrode and the second electrode and including at least one emission layer, and m−1 charge generating layers located between neighboring two light-emitting units of the m light-emitting units and including an n-type charge generating layer and a p-type charge generating layer, wherein m is an integer of 2 or more, a maximum emission wavelength of light emitted from at least one light-emitting unit of the m light-emitting units is different from a maximum emission wavelength of light emitted from at least one light-emitting unit of the remaining light-emitting units, at least one of the emission layers includes a first compound, a second compound, a third compound, and a fourth compound, the first compound and the second compound form an exciplex, the exciplex and the third compound satisfy Conditions 1-1 and 1-2, and the fourth compound is represented by Formula 503.

According to another aspect, an organic light-emitting device includes a first electrode, a second electrode, m light-emitting units located between the first electrode and the second electrode and including at least one emission layer, and m−1 charge generating layers located between neighboring two light-emitting units of the m light-emitting units and including an n-type charge generating layer and a p-type charge generating layer, wherein m is an integer of 2 or more, a maximum emission wavelength of light emitted from at least one light-emitting unit of the m light-emitting units is different from a maximum emission wavelength of light emitted from at least one light-emitting unit of the remaining light-emitting units, at least one of the emission layers includes a first compound, a third compound, and a fourth compound, the first compound and the third compound satisfy Conditions 1-3 and 1-4, and the fourth compound is represented by Formula 503.

According to another aspect, an organic light-emitting device includes a first electrode, a second electrode, and m emission layers between the first electrode and the second electrode, wherein m is an integer of 2 or more, a maximum emission wavelength of light emitted from at least one emission layer of the m emission layers is different from a maximum emission wavelength of light emitted from at least one emission layer of the remaining emission layers, at least one of the m emission layers includes a first compound, a second compound, a third compound, and a fourth compound, the first compound and the second compound form an exciplex, the exciplex and the third compound satisfy Conditions 1-1 and 1-2, and the fourth compound is represented by Formula 503.

According to another aspect, an organic light-emitting device includes a first electrode, a second electrode, m emission layers between the first electrode and the second electrode, wherein m is an integer of 2 or more, a maximum emission wavelength of light emitted from at least one emission layer of the m emission layers is different from a maximum emission wavelength of light emitted from at least one emission layer of the remaining emission layers, at least one of the m emission layers includes a first compound, a third compound, and a fourth compound, the first compound and the third compound satisfy Conditions 1-3 and 1-4, and the fourth compound is represented by Formula 503.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
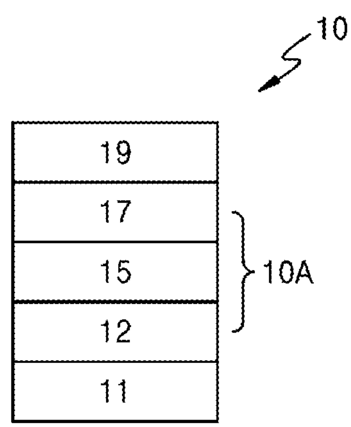
FIG. 1 shows a schematic cross-sectional view of an organic light-emitting device, according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or a group thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

Description of FIG. 1

FIG. 1 is a schematic view of an organic light-emitting device 10, according to an exemplary embodiment of the disclosure. Hereinafter, a structure and a manufacturing method of an organic light-emitting device according to an embodiment of the disclosure will be described with reference to FIG. 1.

The organic light-emitting device 10 of FIG. 1 includes a first electrode 11, a second electrode 19 facing the first electrode 11, and an organic layer 10A between the first electrode 11 and the second electrode 19.

The organic layer 10A includes an emission layer 15, a hole-transporting region 12 may be located between the first electrode 11 and the emission layer 15, and an electron-transporting region 17 may be located between the emission layer 15 and the second electrodes 19.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

First Electrode 11

In one or more embodiments, the first electrode 11 may be formed by depositing or sputtering a material for forming the first electrode 11 on the substrate. The first electrode 11 may be an anode. The material for forming the first electrode 11 may be a material with a high work function to facilitate hole injection.

The first electrode 11 may be a reflective electrode, a semi-transmissive electrode, or a transmissive electrode. When the first electrode 11 is a transmissive electrode, a material for forming a first electrode may be indium tin oxide (ITO), indium zinc oxide (IZO), tin oxide ($SnO_2$), zinc oxide (ZnO), or any combinations thereof, but embodiments of the disclosure are not limited thereto. In an embodiment, when the first electrode 110 is a semi-transmissive electrode or a reflective electrode, a material for forming the first electrode 110 may be magnesium (Mg), silver (Ag), aluminum (Al), aluminum-lithium (Al—Li), calcium (Ca), magnesium-indium (Mg—In), magnesium-silver (Mg—Ag), or any combination thereof, but embodiments of the disclosure are not limited thereto.

The first electrode 11 may have a single-layered structure or a multi-layered structure including two or more layers.

Emission Layer 15

First Embodiment

The emission layer 15 includes a first compound, a second compound, a third compound, and a fourth compound. In an embodiment, the emission layer 15 may consist of a first compound, a second compound, a third compound, and a fourth compound. That is, the emission layer 15 may not further include a material other than the first compound, the second compound, the third compound, and the fourth compound.

The first compound and the second compound form an exciplex. The exciplex is a complex in an excited state and formed between the first compound and the second compound.

Because the first compound and the second compound form an exciplex, despite a relatively high $T_1$ energy level, the first compound and the second compound may be stable.

Accordingly, the lifespan of an organic light-emitting device including the first compound and the second compound may be improved.

The exciplex and the third compound may satisfy Condition 1-1:

$$T_1(Ex) \leq T_1(C3) < S_1(Ex) \quad \text{Condition 1-1}$$

wherein, in Condition 1-1, $T_1$(Ex) is a lowest excited triplet energy level of the exciplex, $T_1$(C3) is a lowest excited triplet energy level of the third compound, and $S_1$(Ex) is a lowest excited singlet energy level of the exciplex.

$T_1$(Ex) is a value calculated from an onset wavelength of a photoluminescence (PL) spectrum at low temperature with respect to a film (hereinafter, referred to as a "film (Ex)") having a thickness of 40 nm obtained by vacuum-codepositing, on a quartz substrate, the first compound and the second compound included in the emission layer 15 at a certain weight ratio and a vacuum pressure of $10^{-7}$ torr. A detailed method of evaluating $T_1$(Ex) is the same as described in connection with examples below.

$T_1$(C3) is a value calculated from an onset wavelength of a PL spectrum at low temperature with respect to a sample (hereinafter, referred to as a "sample (C3)") obtained by dissolving the third compound included in the emission layer 15 in toluene at a concentration of $1\times10^{-4}$M in a quartz cell. A detailed method of evaluating $T_1$(C3) is the same as described in connection with examples below.

$S_1$(Ex) is a value calculated from an onset wavelength of a PL spectrum at room temperature with respect to a film (hereinafter, referred to as a "film (Ex)") having a thickness of 40 nm obtained by vacuum-codepositing, on a quartz substrate, the first compound and the second compound included in the emission layer 15 at a certain weight ratio and a vacuum pressure of $10^{-7}$ torr. A detailed method of evaluating $S_1$(Ex) is the same as described in connection with examples below.

By satisfying Condition 1-1, the organic light-emitting device may have an improved lifespan. In general, it is known that since triplet excitons stay long in an excited state, they influence the decrease in the lifespan of organic light-emitting devices. However, in the disclosure, a lowest excited triplet energy level of an exciplex is reduced to improve the lifespan of organic light-emitting devices including the exciplex.

The exciplex and the third compound may satisfy Condition 1-2:

$$T_1(C3) - T_1(Ex) < 0.3 \text{ eV} \quad \text{Condition 1-2}$$

wherein, in Conditions 1-1 and 1-2, $T_1$(Ex) is a lowest excited triplet energy level of the exciplex, and $T_1$(C3) is a lowest excited triplet energy level of the third compound.

The organic light-emitting device satisfies Condition 1-2, and thus because a triplet exciton of the exciplex may be rapidly converted to a triplex exciton of the third compound, the organic light-emitting device may have an implementable level of efficiency.

That is, the organic light-emitting device satisfies Conditions 1-1 and 1-2 at the same time, and thus, may have an improved lifespan and an improved efficiency.

In an embodiment, the exciplex and the third compound may further satisfy Condition 1-2-1:

$$T_1(C3) - T_1(Ex) \leq 0.15 \text{ eV} \quad \text{Condition 1-2-1}$$

wherein, in Condition 1-2-1, definitions of $T_1$(Ex) and $T_1$(C3) are each the same as described above.

Each of the first compound and the second compound may not include a metal atom.

In an embodiment, the first compound may be a hole transporting host, and the second compound may be an electron transporting host.

The electron transporting host may include at least one electron transporting moiety. The hole transporting host may not include an electron transporting moiety.

The electron transporting moiety used herein may be a cyano group, —F, $—CFH_2$, $—CF_2H$, $—CF_3$, a π electron-deficient nitrogen-containing cyclic group, and a group represented by one of the following formulae:

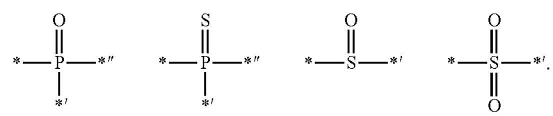

In the formulae, *, *' and *" are each binding sites to neighboring atoms.

In an embodiment, the electron transporting host may include at least one of a cyano group, a π electron-deficient nitrogen-containing cyclic group, or a combination thereof.

In an embodiment, the electron transporting host may include at least one cyano group.

In an embodiment, the electron transporting host may include at least one cyano group, at least one π electron-deficient nitrogen-containing cyclic group, or a combination thereof.

In an embodiment, the hole transporting host may include at least one u electron-deficient nitrogen-free cyclic group, and may not include an electron transporting moiety.

The term "electron-deficient nitrogen-containing cyclic group" used herein refers to a cyclic group having at least one *—N═*' moiety, and for example, may be: an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, and an azacarbazole group; and a condensed cyclic group in which two or more π electron-deficient nitrogen-containing cyclic a group are condensed with each other.

The term "T electron-deficient nitrogen-free cyclic group" used herein may be, for example: a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group; and a condensed cyclic group in which two or more π electron-deficient nitrogen-free cyclic a group are condensed with each other, but embodiments of the disclosure are not limited thereto.

In an embodiment, the electron transporting host may be a compound represented by Formula E-1, and the hole transporting host may be a compound represented by Formula H-1, but embodiments of the disclosure are not limited thereto:

$$[Ar_{301}]_{xb11}\text{-}[(L_{301})_{xb1}\text{-}R_{301}]_{xb21}$$ Formula E-1 wherein, in Formula E-1, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may each independently be a single bond, a group represented by the following formula, a substituted or unsubstituted $C_5$-$C_{60}$ carbocyclic group, or a substituted or unsubstituted $C_1$-$C_{60}$ heterocyclic group, and *, *' and *" in the following formulae are each a binding site to a neighboring atom,

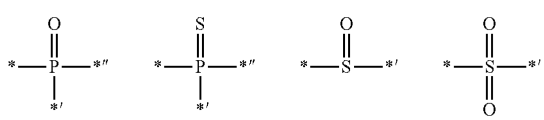

xb1 may be an integer from 1 to 5, $R_{301}$ may be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, $—S(=O)(Q_{301})$, $—P(=O)(Q_{301})(Q_{302})$, or $—P(=S)(Q_{301})(Q_{302})$, xb21 may be an integer from 1 to 5, $Q_{301}$ to $Q_{303}$ may each independently be a $C_1$-$C_{10}$ alkyl group, a $C_1$-$C_{10}$ alkoxy group, a phenyl group, a biphenyl group, a terphenyl group, or a naphthyl group, and at least one of Condition A to Condition C may be satisfied:

Condition A $Ar_{301}$, $L_{301}$, and $R_{301}$ in Formula E-1 each independently include a π electron-deficient nitrogen-containing cyclic group Condition B $L_{301}$ in Formula E-1 is a group represented by one of the following a group

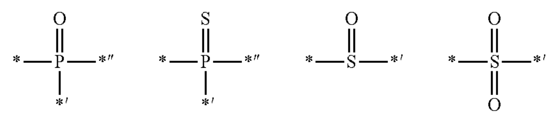

Condition C $R_{301}$ in Formula E-1 may be a cyano group, $—S(=O)_2(Q_{301})$, $—S(=O)(Q_{301})$, $—P(=O)(Q_{301})(Q_{302})$, or $—P(=S)(Q_{301})(Q_{302})$.

Formula H-1

$$Ar_{401}—(L_{401})_{xd1}—(Ar_{402})_{xd11}$$

11

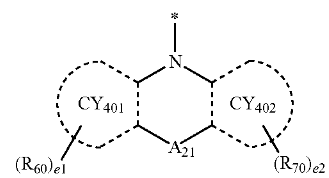

12

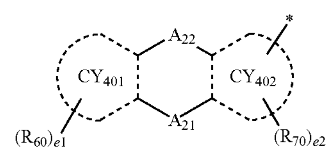

In Formulae H-1, 11, and 12, $L_{401}$ may be: a single bond; or a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group, each unsubstituted or substituted with at least one deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, $—Si(Q_{401})(Q_{402})(Q_{403})$, or any combination thereof, xd1 may be an integer from 1 to 10, wherein when xd1 is 2 or more, two or more of $L_{401}$(s) may be identical to or different from each other, $Ar_{401}$ may be a group represented by Formulae 11 or 12, $Ar_{402}$ may be: a group represented by Formulae 11 or 12, a phenyl group, a naphthyl group, a fluorenyl group, a carbazolyl group, a dibenzofuranyl group, a dibenzothiophenyl group, a biphenyl group, a terphenyl group, or a triphenylenyl group; or a phenyl group, a naphthyl group, a fluorenyl group, a carbazolyl group, a dibenzofuranyl group, a dibenzothiophenyl group, a biphenyl group, a terphenyl group, or a triphenylenyl group, each substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, a terphenyl group, a triphenylenyl group, or any combination thereof, $CY_{401}$ and $CY_{402}$ may each independently be a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, or a benzonaphthosilole group, $A_{21}$ may be a single bond, O, S, $N(R_{51})$, $C(R_{51})(R_{52})$, or $Si(R_{51})(R_{52})$, $A_{22}$ may be a single bond, O, S, $N(R_{53})$, $C(R_{53})(R_{54})$, or $Si(R_{53})(R_{54})$, at least one of $A_{21}$, $A_{22}$, or any combination thereof in Formula 12 may not be a single bond, $R_{51}$ to $R_{54}$, $R_{60}$, and $R_{70}$ may each independently be:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, or any combination thereof;

a π electron-deficient nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, or a triphenylenyl group);

a π electron-deficient nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, or a triphenylenyl group), each substituted with at least one deuterium, a hydroxyl group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, or any combination thereof; or $Si(Q_{404})(Q_{405})(Q_{406})$, e1 and e2 may each independently be an integer from 0 to 10, $Q_{401}$ to $Q_{406}$ may each independently be hydrogen, deuterium, a hydroxyl group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a carbazolyl group, a dibenzofuranyl group, a dibenzothiophenyl group, a biphenyl group, a terphenyl group, or a triphenylenyl group, and

* indicates a binding site to an adjacent atom.

In an embodiment, $Ar_{301}$ and $L_{301}$ in Formula E-1 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, at least one of $L_{301}$(s) in the number of xb1 may each independently be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, or any combination thereof, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyrdinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl) pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof, and $R_{301}$ may be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a tetraphenyl group, a naphthyl group, a cyano-containing phenyl group, a cyano-containing biphenyl group, a cyano-containing terphenyl group, a cyano-containing tetraphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl) pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, but embodiments of the disclosure are not limited thereto.

In an embodiment, $Ar_{301}$ may be: a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, or a dibenzothiophene group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof; or a group represented by one of Formulae 5-1 to 5-3 and Formulae 6-1 to 6-33, and $L_{301}$ may be a group represented by one of Formulae 5-1 to 5-3 and Formulae 6-1 to 6-33:

5-1

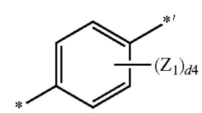

5-2

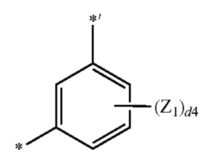

5-3

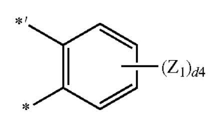

6-1

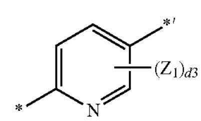

6-2

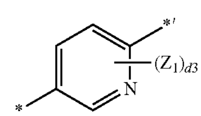

6-3

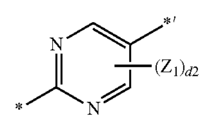

6-4

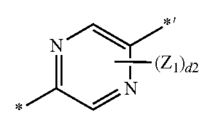

6-5

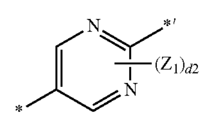

-continued
6-6
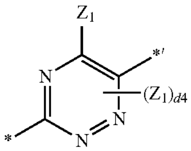
6-7
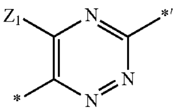
6-8
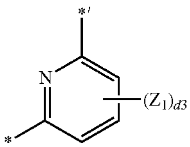
6-9
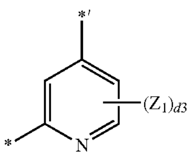
6-10
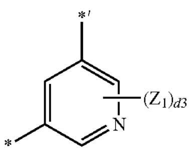
6-11
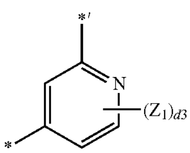
6-12
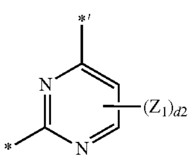
6-13
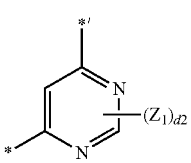
6-14
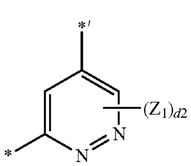
6-15
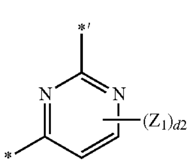
-continued
6-16
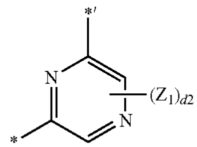
6-17
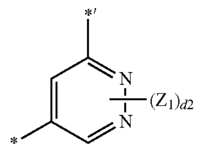
6-18
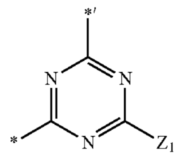
6-19
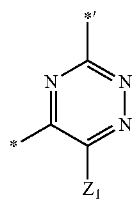
6-20
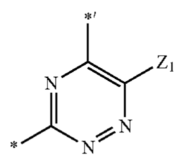
6-21
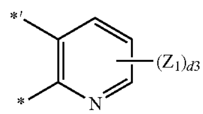
6-22
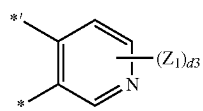
6-23
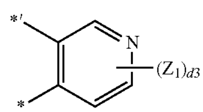
6-24
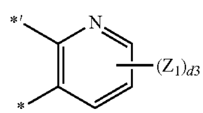
6-25
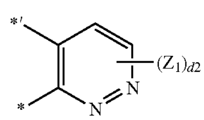
6-26
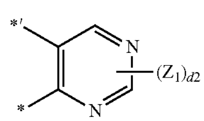

-continued 6-27

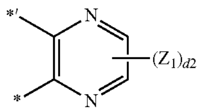

6-28

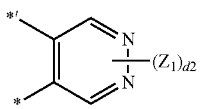

6-29

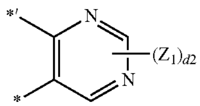

6-30

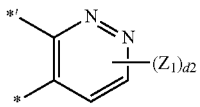

6-31

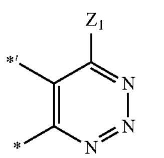

6-32

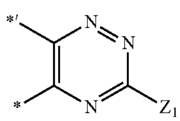

6-33

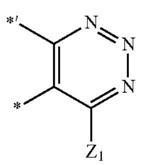

wherein, in Formulae 5-1 to 5-3 and 6-1 to 6-33, $Z_1$ may be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), d4 may be 0, 1, 2, 3, or 4, d3 may be 0, 1, 2, or 3, d2 may be 0, 1, or 2, and

* and *' each indicate a binding site to a neighboring atom.

$Q_{31}$ to $Q_{33}$ are each the same as described above.

In an embodiment, $L_{301}$ may be a group represented by Formulae 5-2, 5-3, or 6-8 to 6-33.

In an embodiment, $R_{301}$ may be a cyano group or a group represented by Formulae 7-1 to 7-18, and at least one of $Ar_{402}$(s) in the number of xd11 may be a group represented by Formulae 7-1 to 7-18, but embodiments of the disclosure are not limited thereto:

7-1

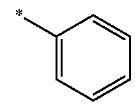

7-2

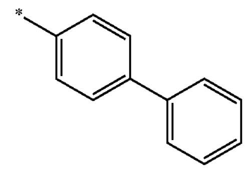

7-3

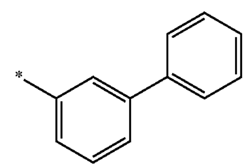

7-4

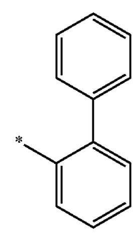

7-5

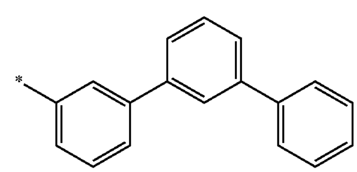

7-6

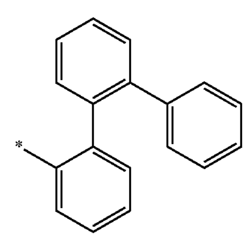

7-7

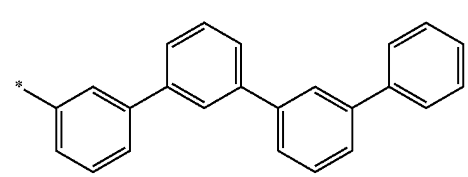

-continued 7-8

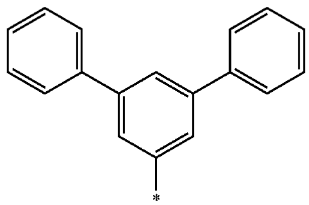

7-9

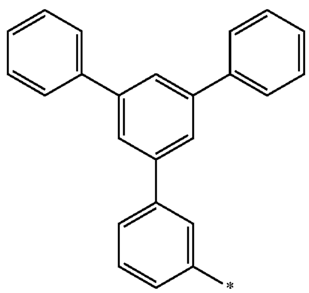

7-10

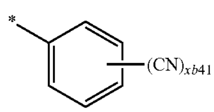

7-11

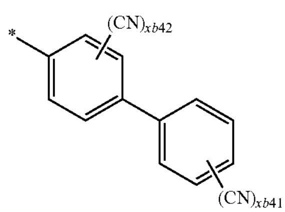

7-12

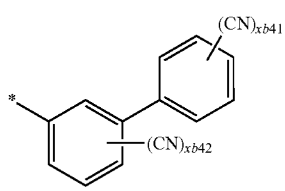

7-13

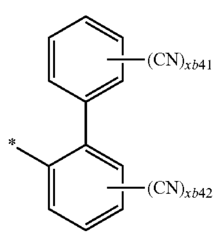

7-14

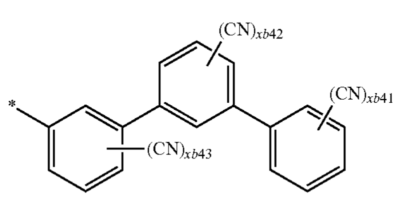

-continued 7-15

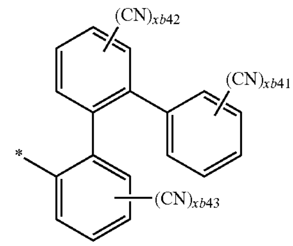

7-16

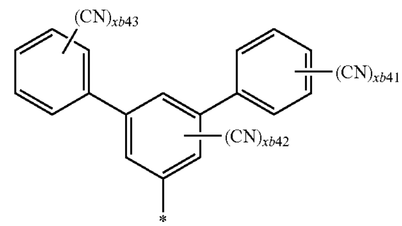

7-17

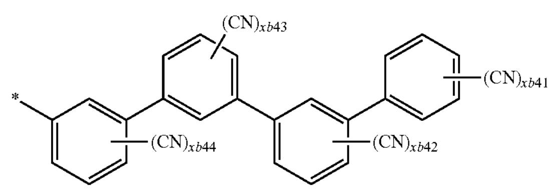

7-18

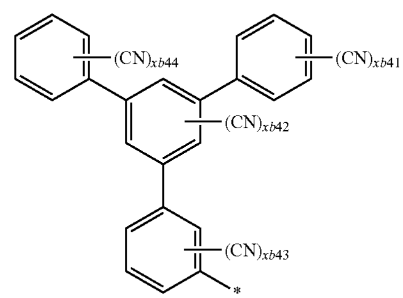

wherein, in Formulae 7-1 to 7-18, xb41 to xb44 may each be 0, 1, or 2, wherein xb41 in Formula 7-10 is not 0, the sum of xb41 and xb42 in Formulae 7-11 to 7-13 is not 0, the sum of xb41, xb42, and xb43 in Formulae 7-14 to 7-16 is not 0, the sum of xb41, xb42, xb43, and xb44 in Formulae 7-17 and 7-18 is not 0, and * indicates a binding site to a neighboring atom.

Two or more $Ar_{301}$(s) in Formula E-1 may be identical to or different from each other, two or more of $L_{301}$(s) may be identical to or different from each other, two or more of $L_{401}$(s) in Formula H-1 may be identical to or different from each other, and two or more of $Ar_{402}$(s) in Formula H-1 may be identical to or different from each other.

The electron transporting host may be, for example, a group HE1 to HE7, but embodiments of the disclosure are not limited thereto:

Group HE1
H-E1
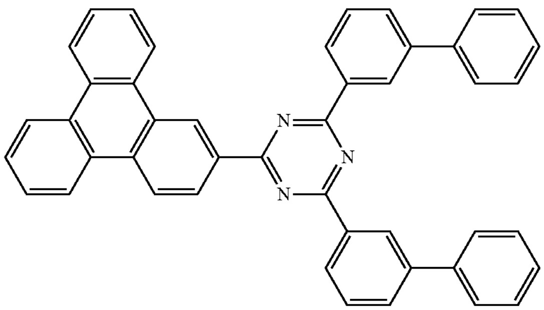
H-E2
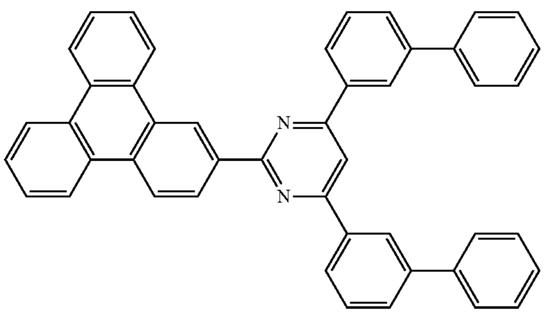
H-E3
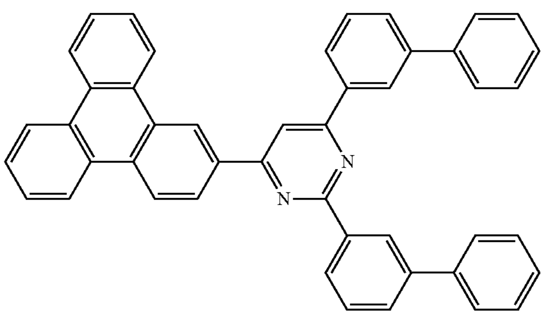
H-E4
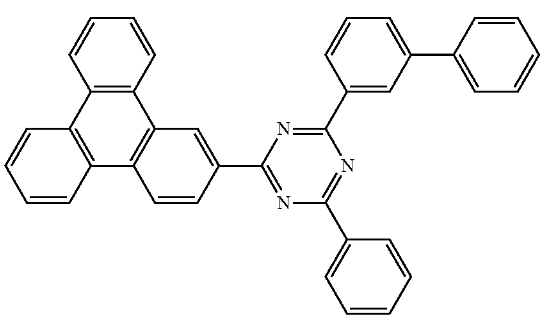
-continued
H-E5
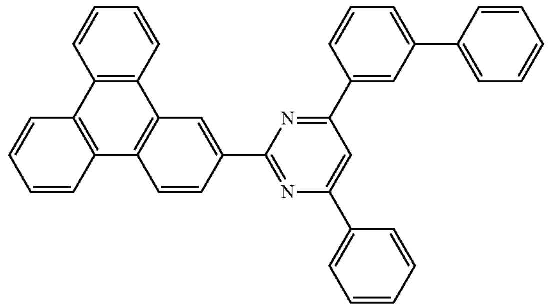
H-E6
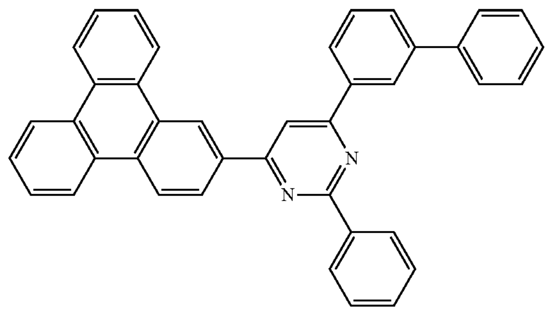
H-E7
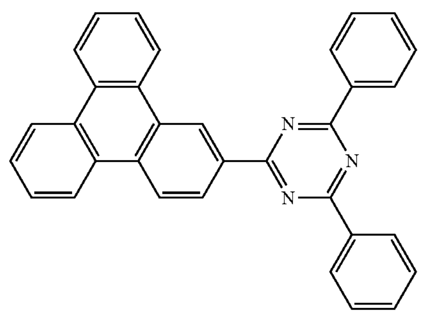
H-E8
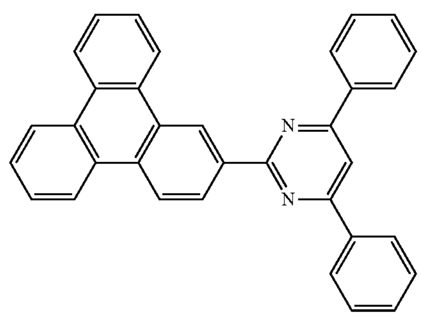
H-E9
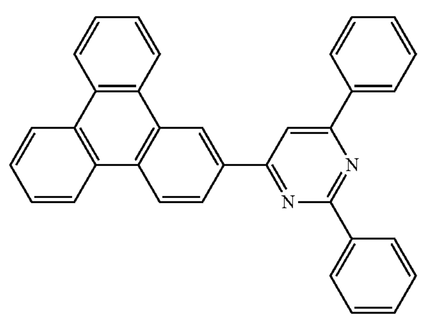

-continued
H-E10
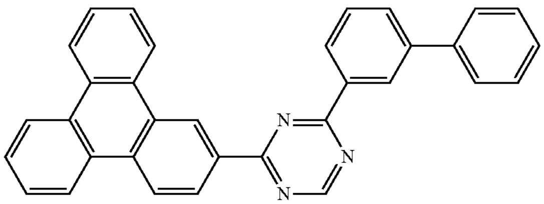
H-E11
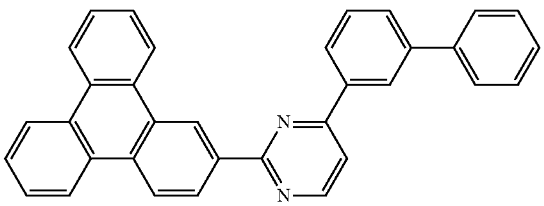
H-E12
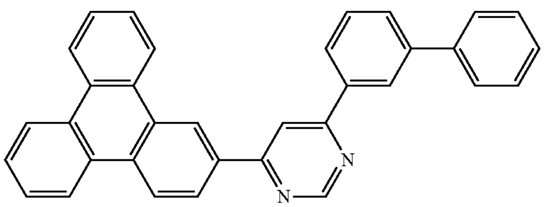
H-E13
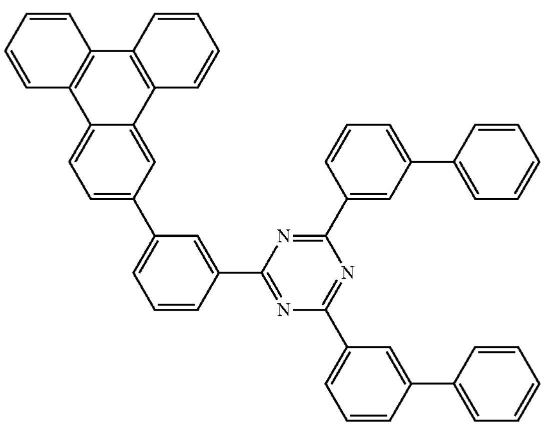
H-E14
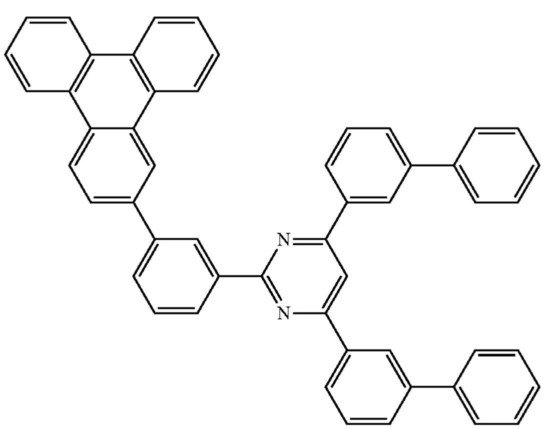
-continued
H-E15
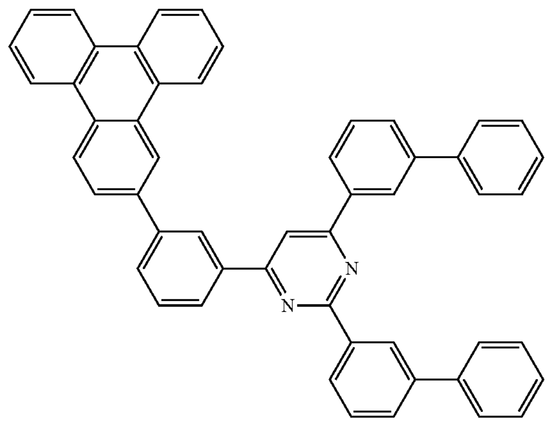
H-E16
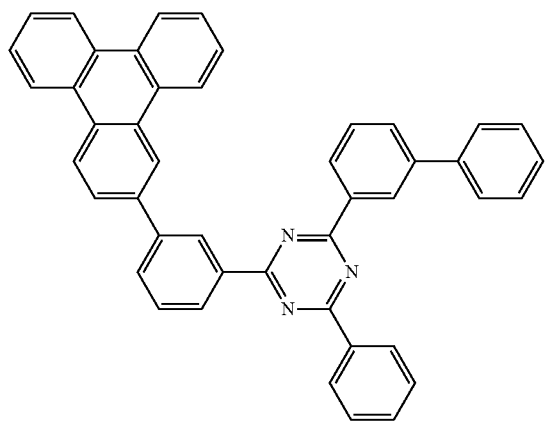
H-E17
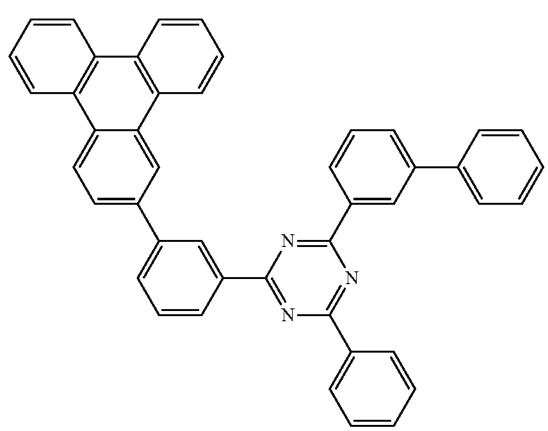

-continued
H-E18
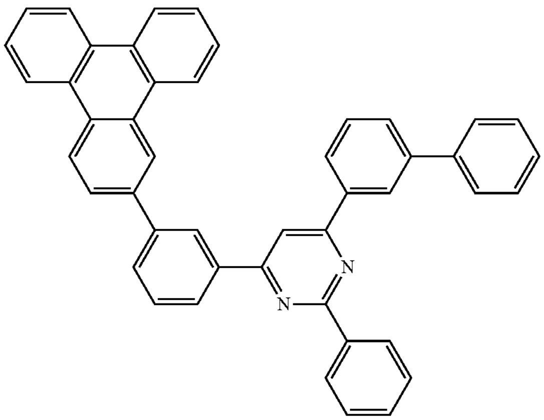
H-E19
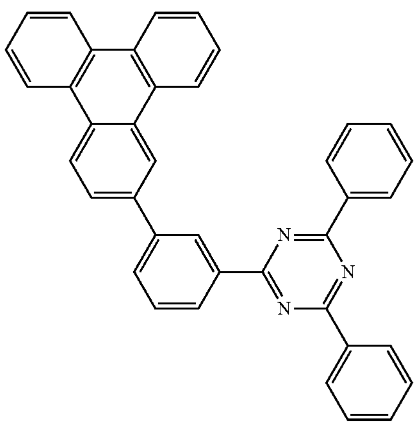
H-E20
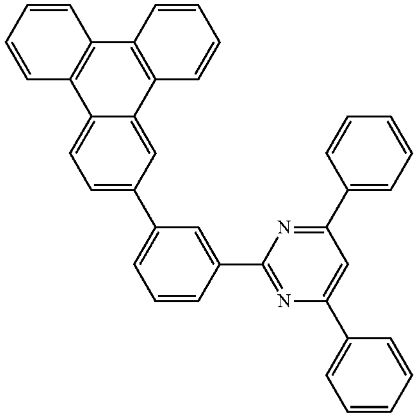
-continued
H-E21
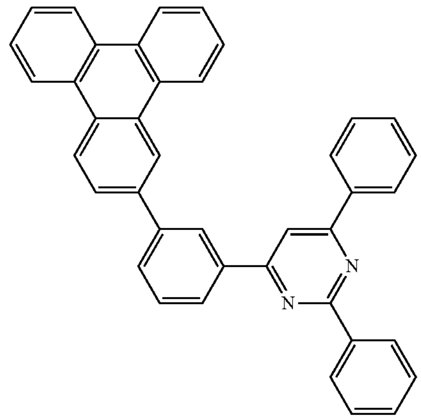
H-E22
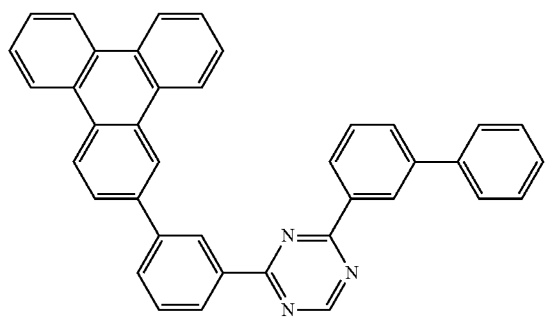
H-E23
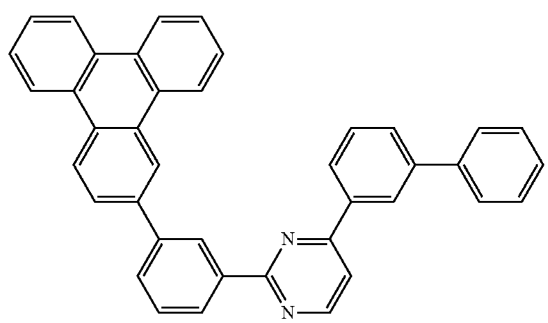
H-E24
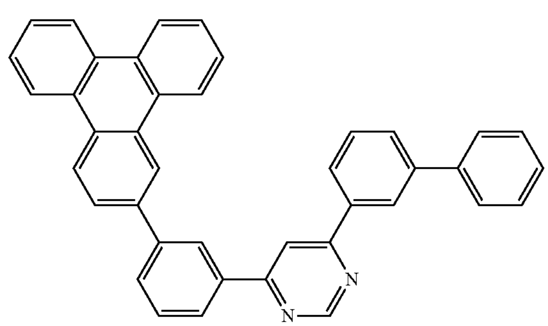

-continued
H-E25
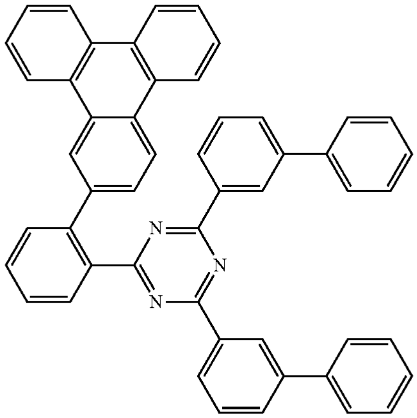
H-E26
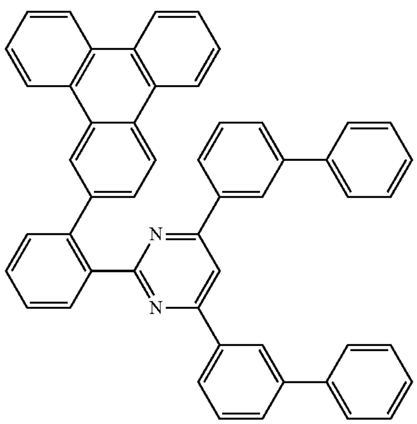
H-E27
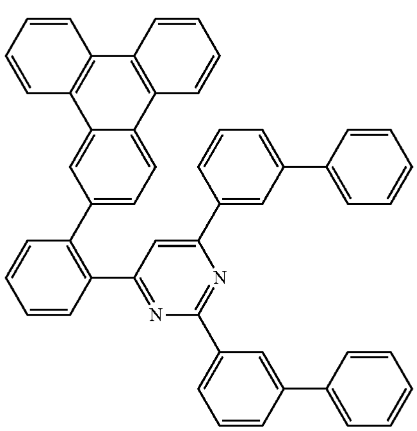
-continued
H-E28
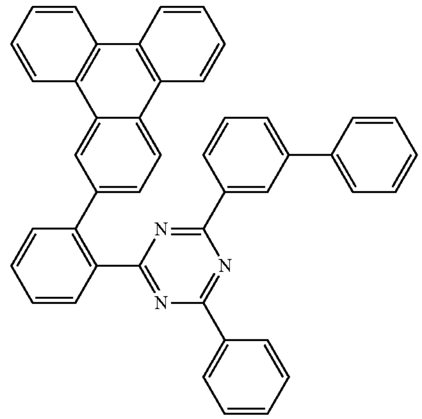
H-E29
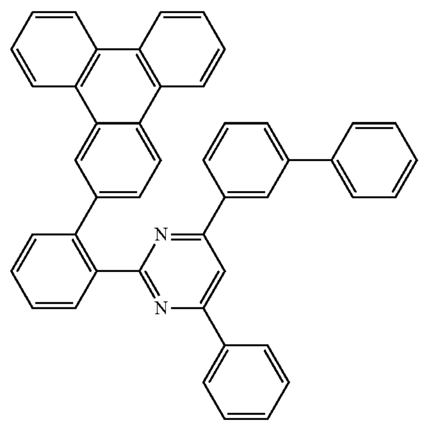
H-E30
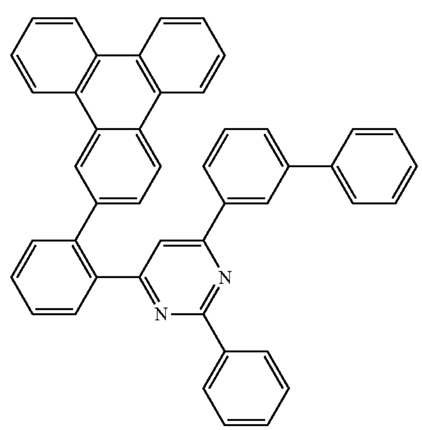

-continued
H-E31
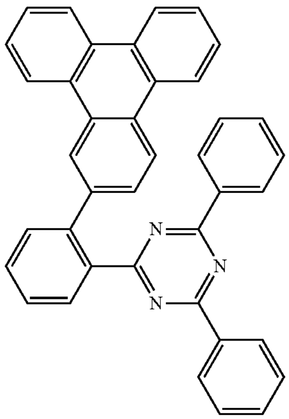
H-E32
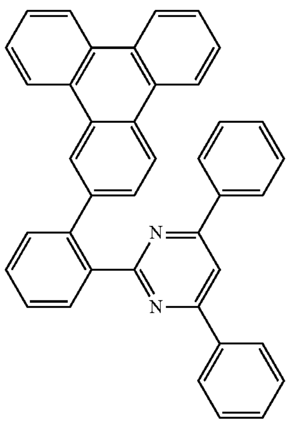
H-E33
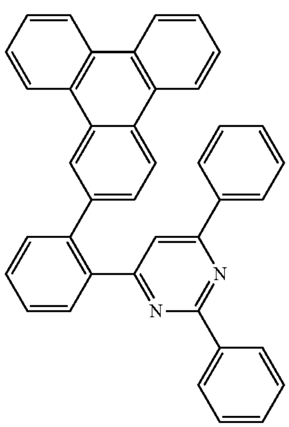
H-E34
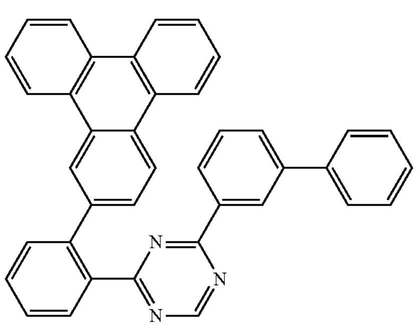
-continued
H-E35
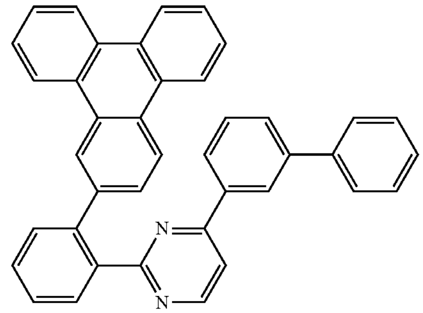
H-E36
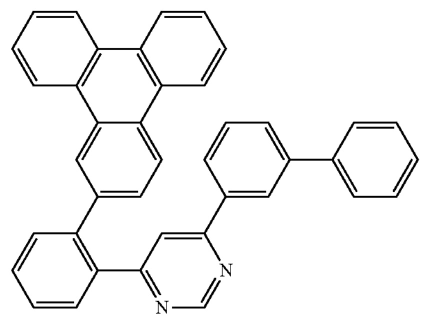
H-E37
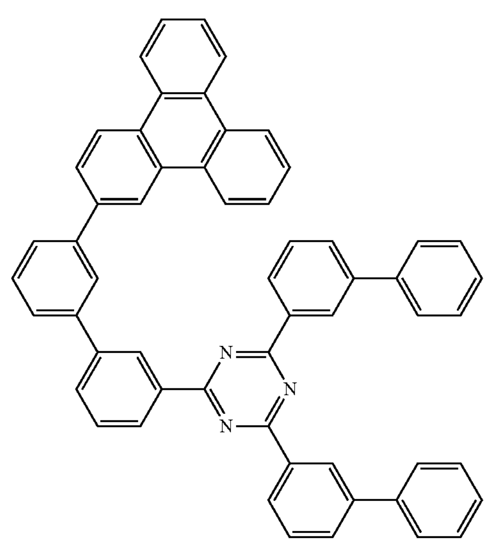

-continued
H-E38
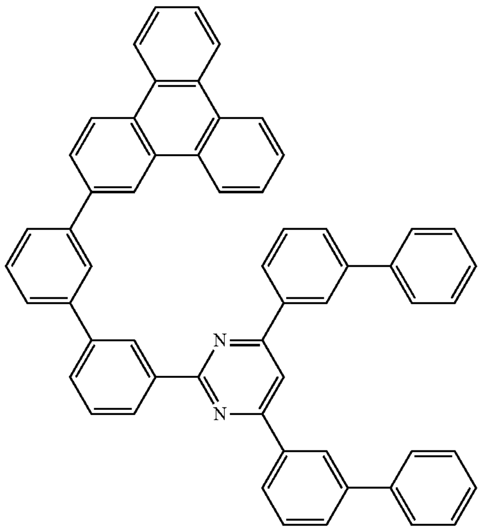
H-E39
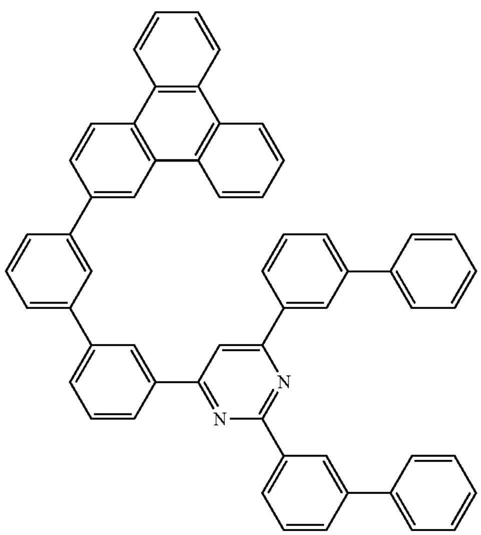
H-E40
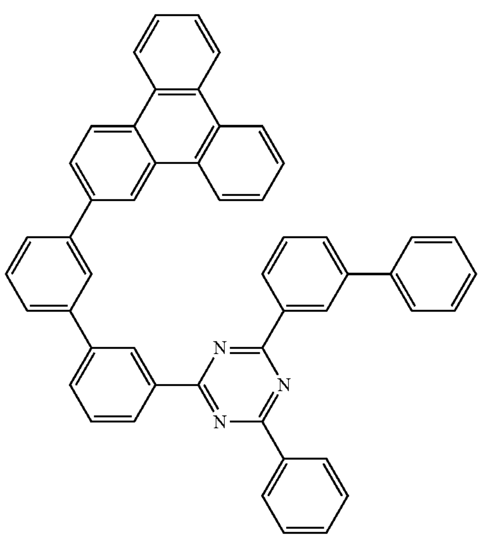
-continued
H-E41
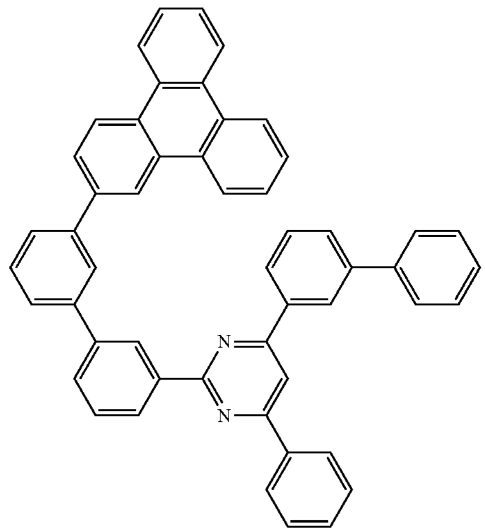
H-E42
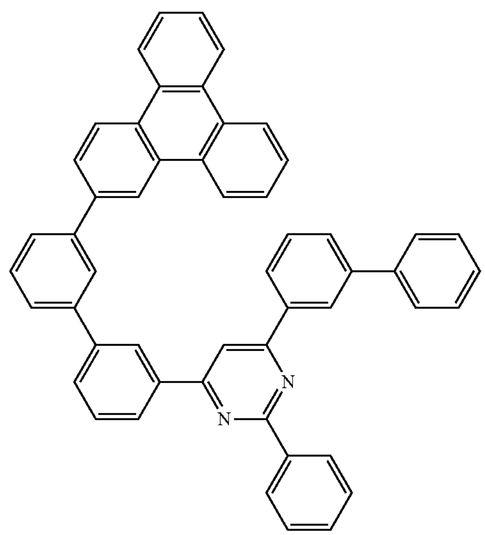
H-E43
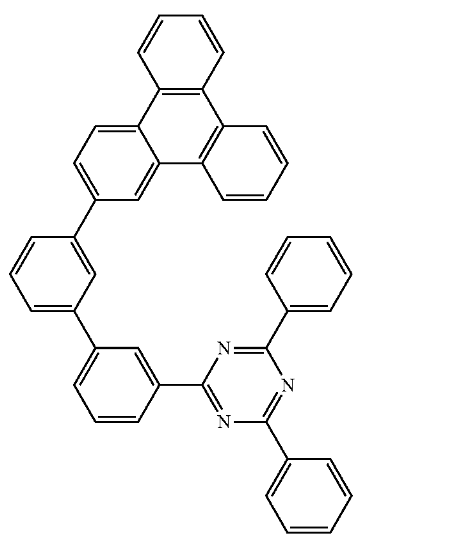

H-E44
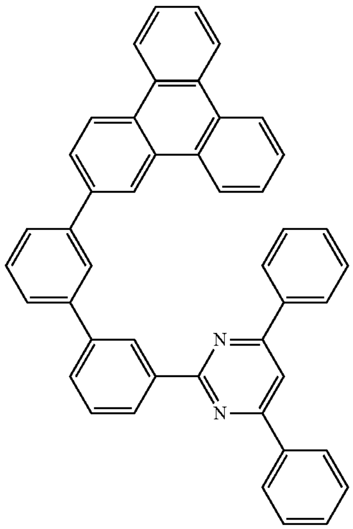
H-E45
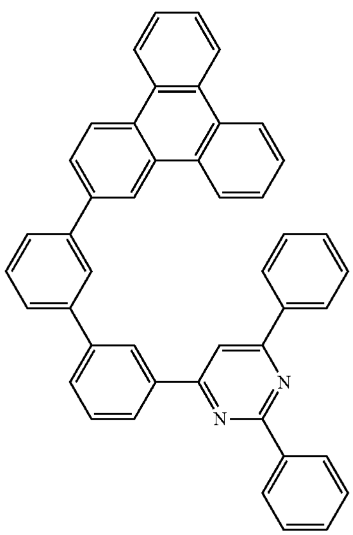
H-E46
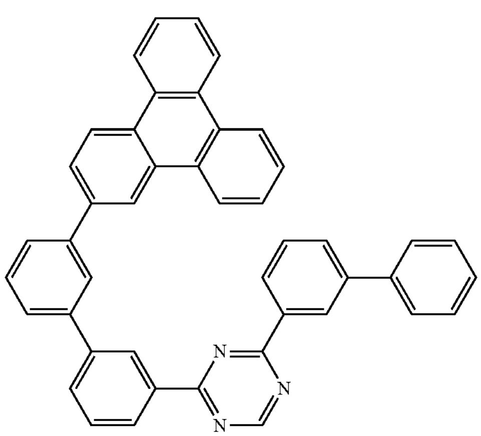
H-E47
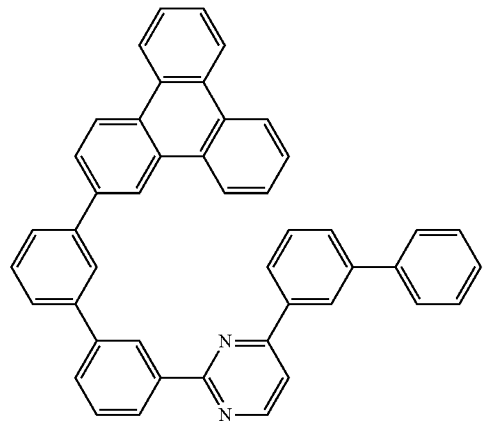
H-E48
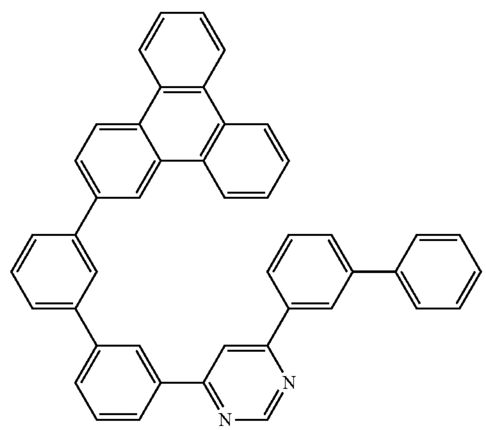
H-E49
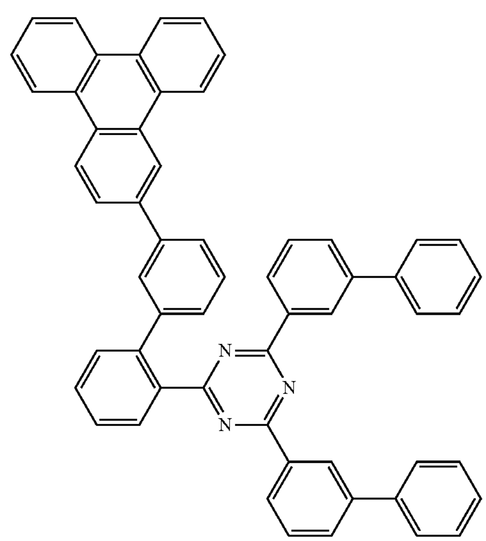

-continued
H-E50
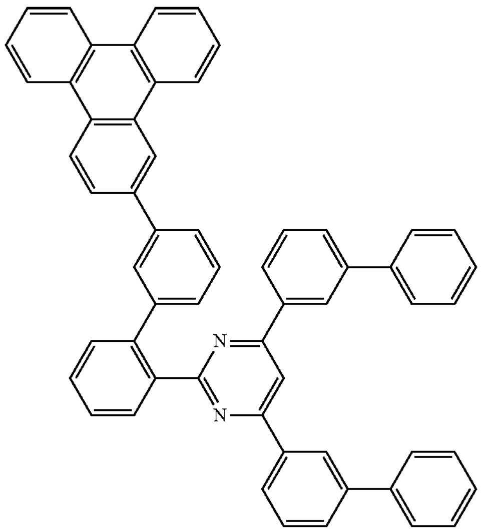
H-E51
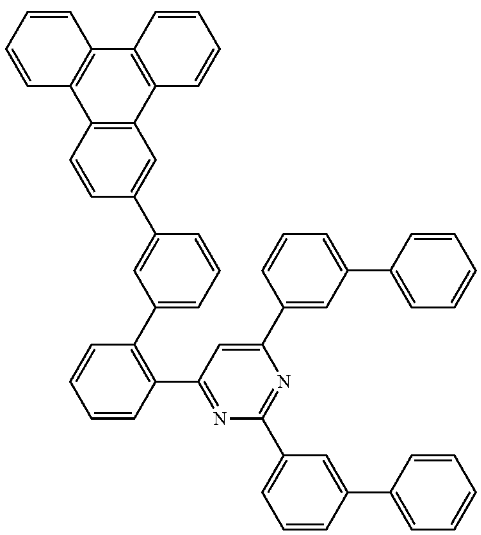
H-E52
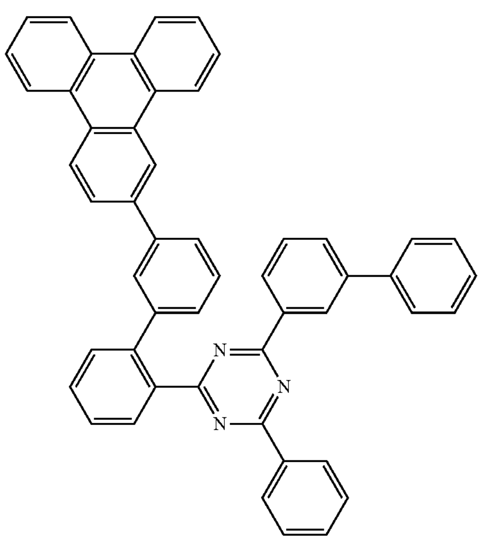
-continued
H-E53
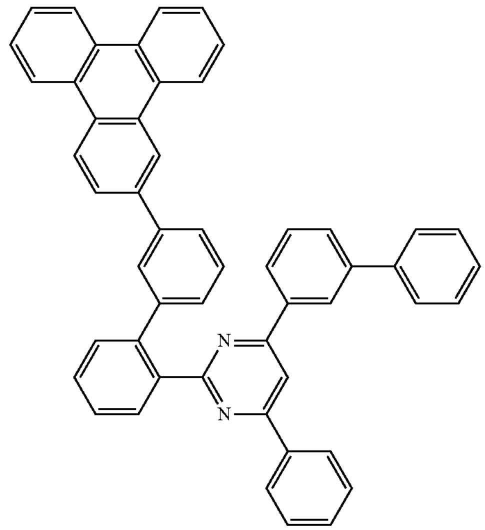
H-E54
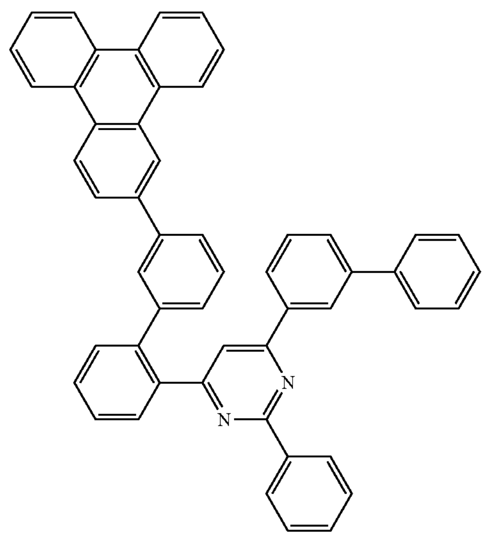
H-E55
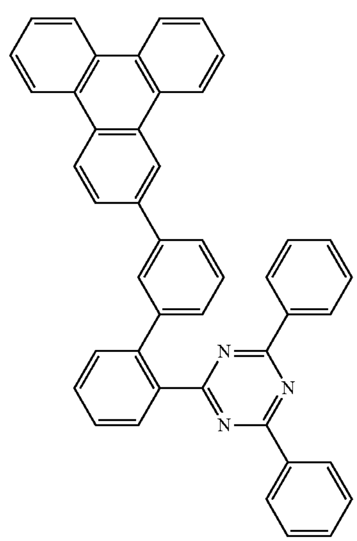

H-E56
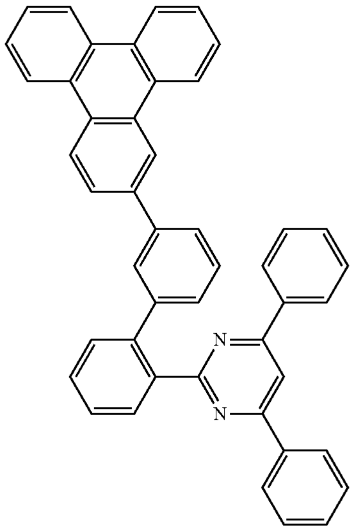
H-E57
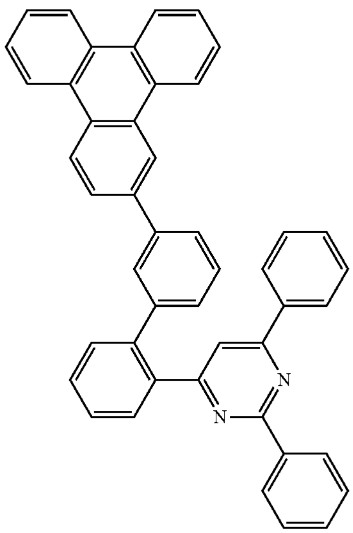
H-E58
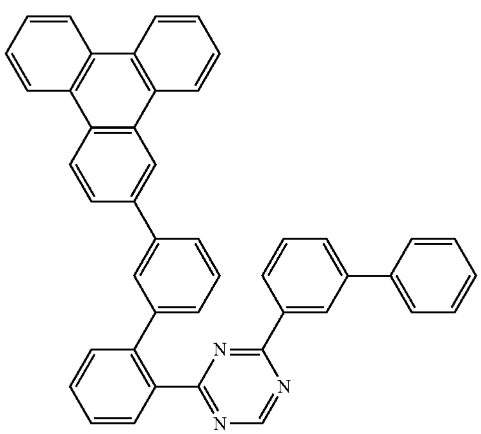
H-E59
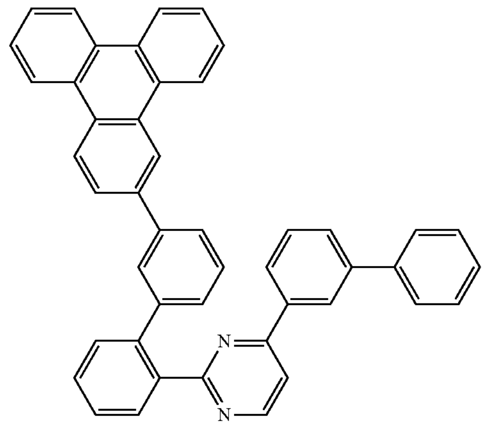
H-E60
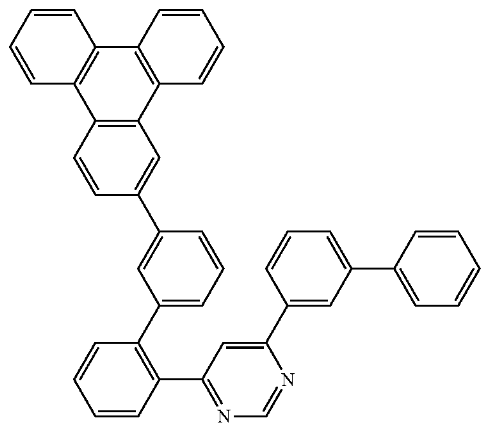
H-E61
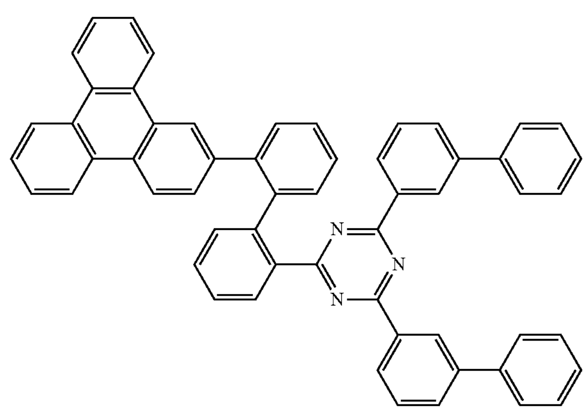

-continued
H-E62
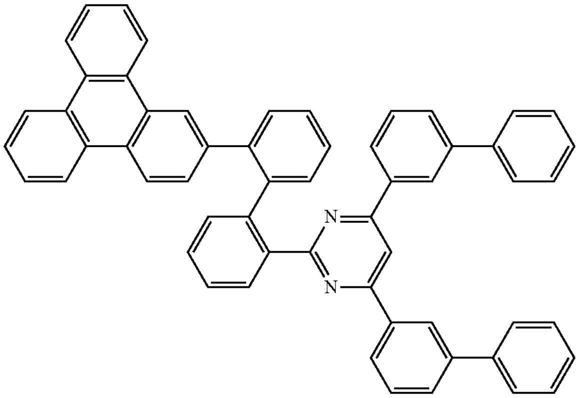
H-E63
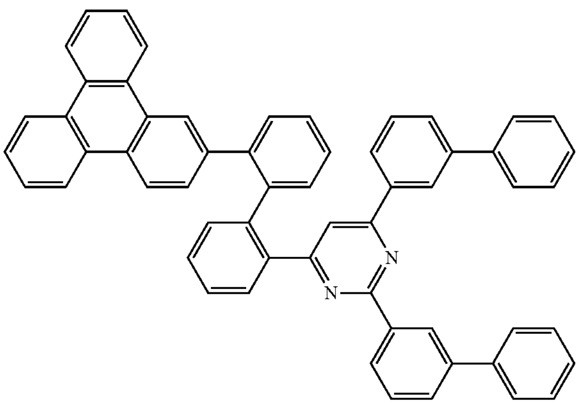
H-E64
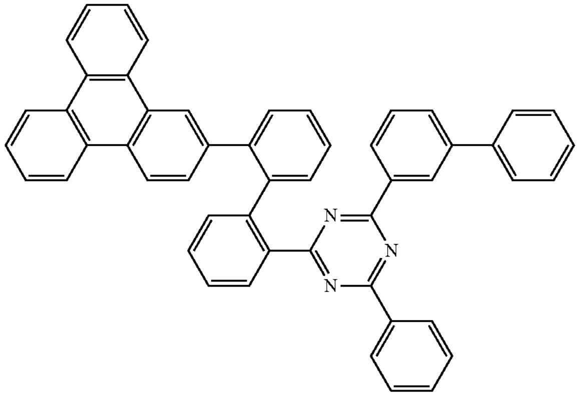
-continued
H-E65
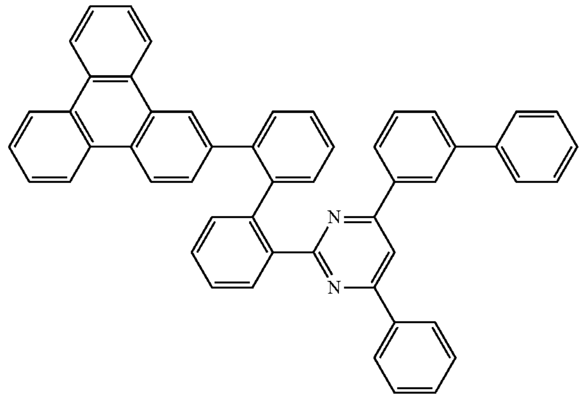
H-E66
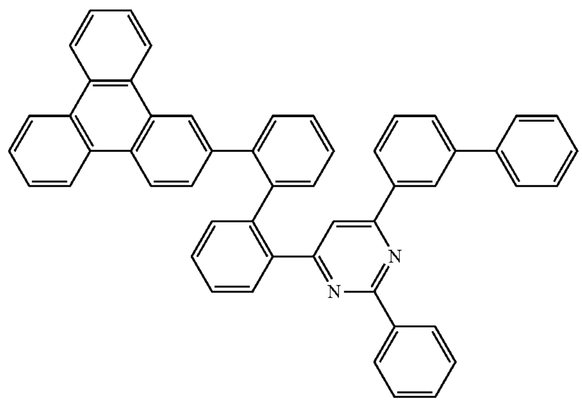
H-E67
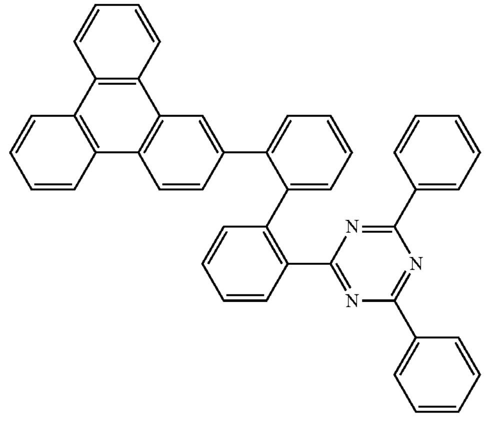

-continued
H-E68
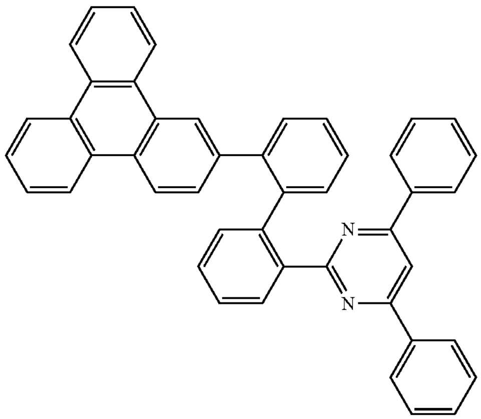
H-E69
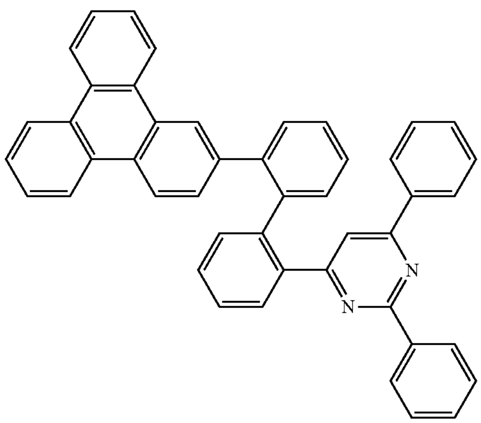
H-E70
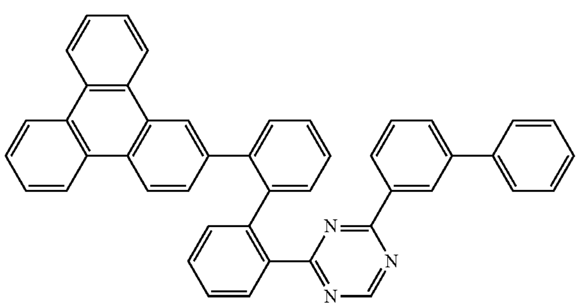
H-E71
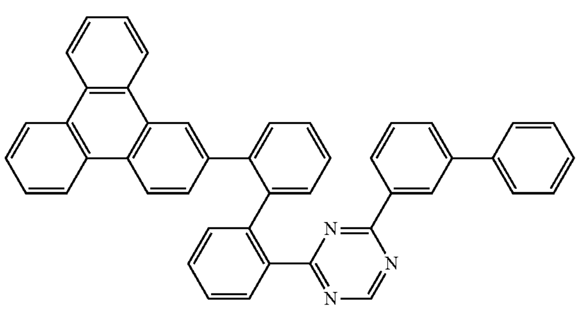
-continued
H-E72
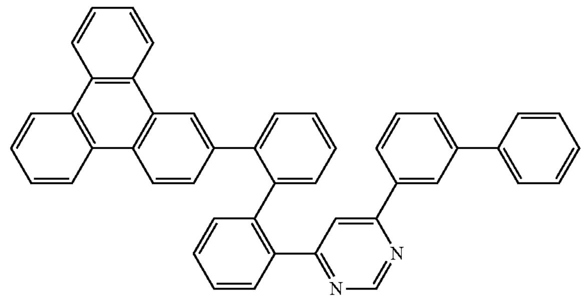
H-E73
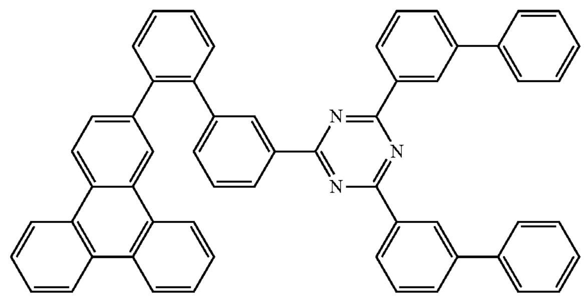
H-E74
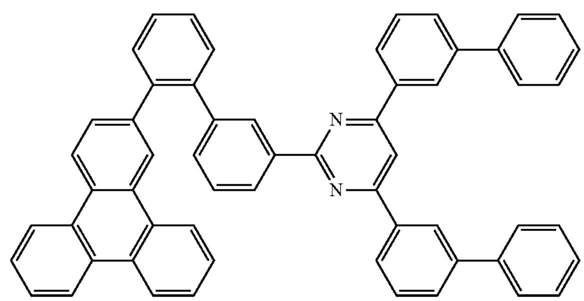
H-E75
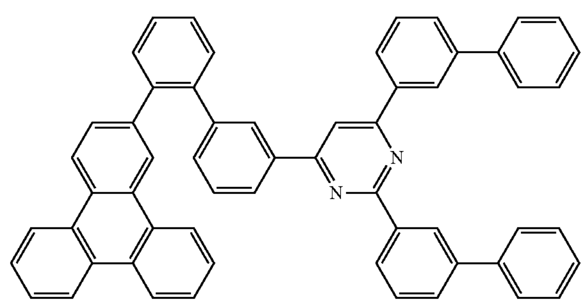
H-E76
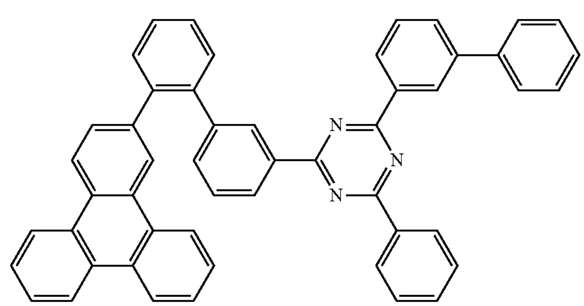

H-E77
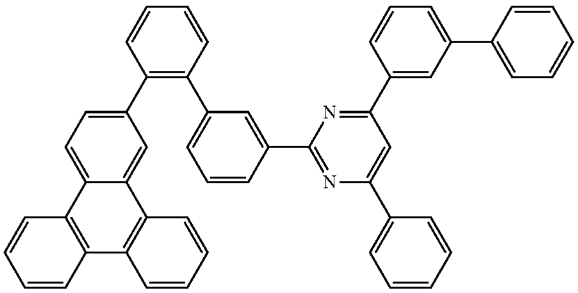
H-E78
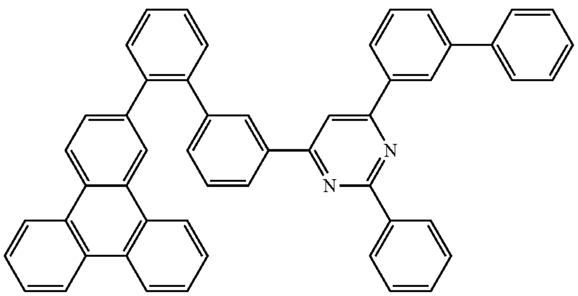
H-E79
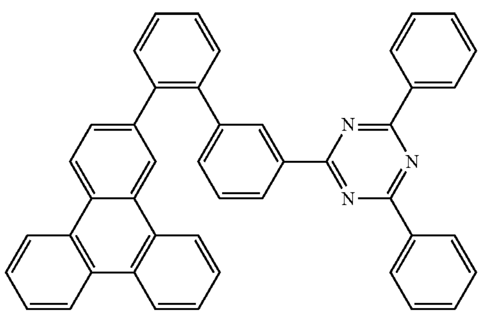
H-E80
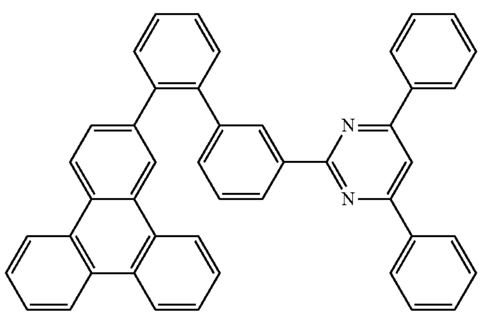
H-E81
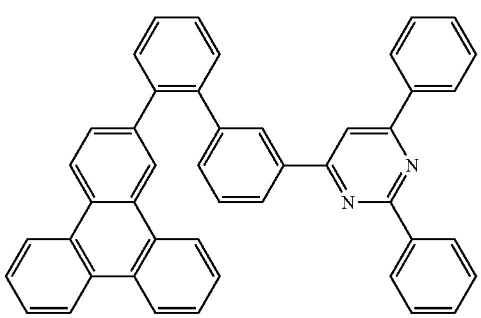
H-E82
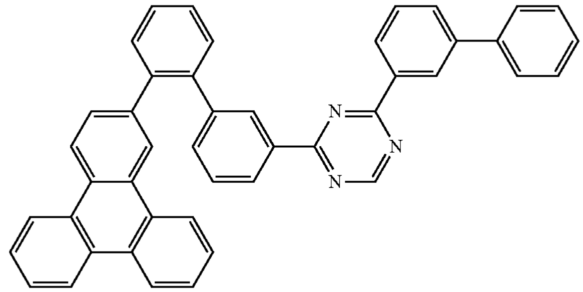
H-E83
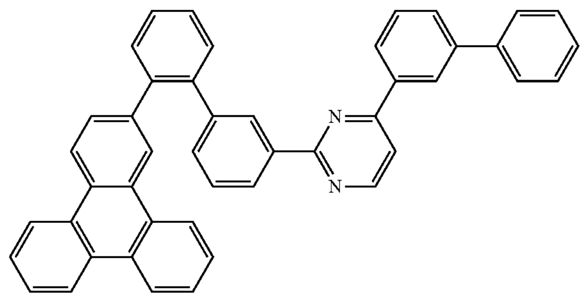
H-E84
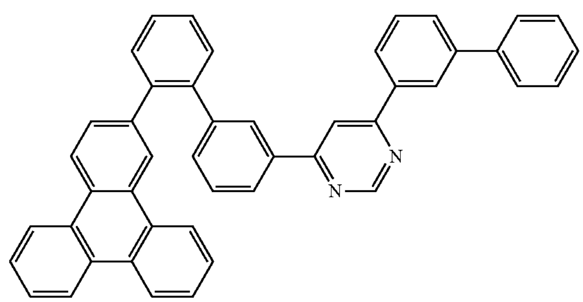
H-E(1)
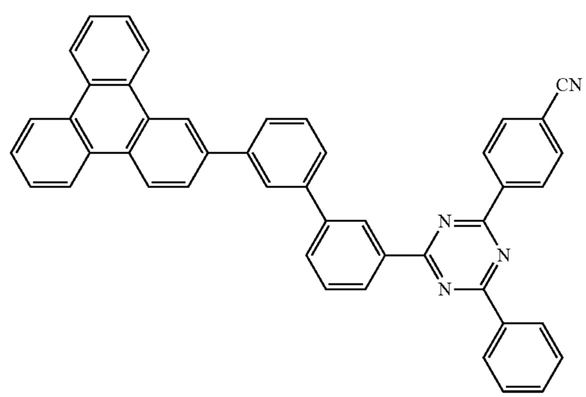

-continued
H-E(2)
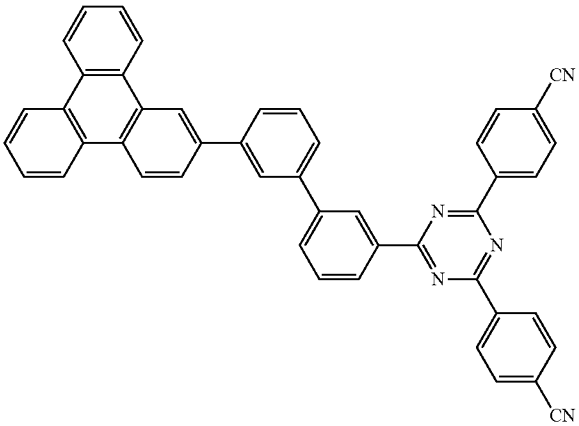
H-E(3)
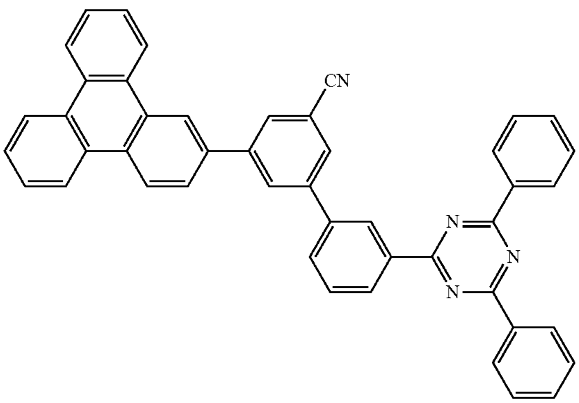
H-E(4)
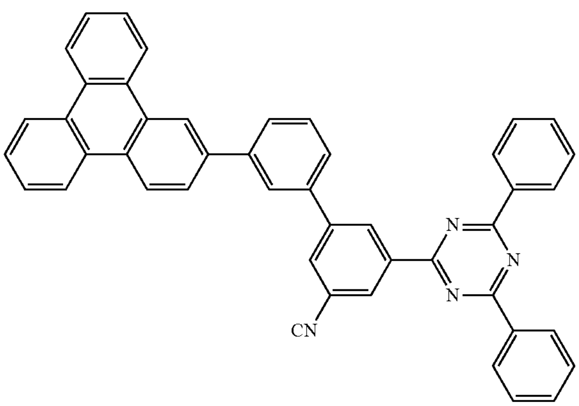
A-1
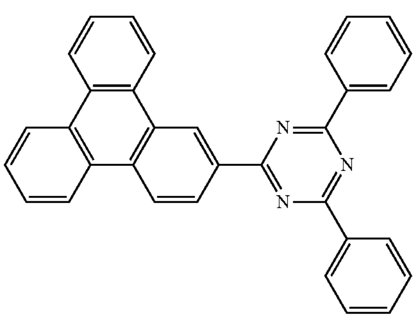
-continued
A-2
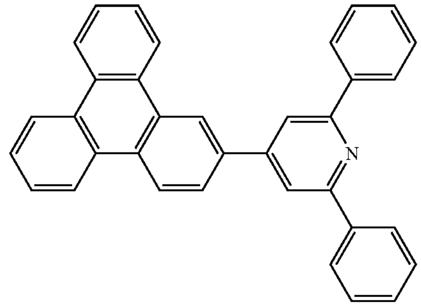
A-3
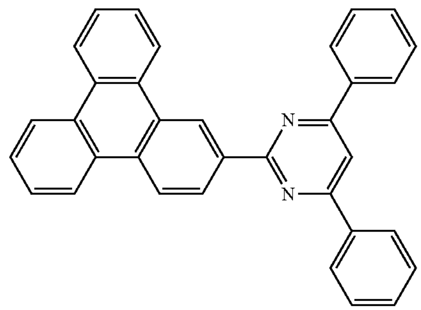
A-4
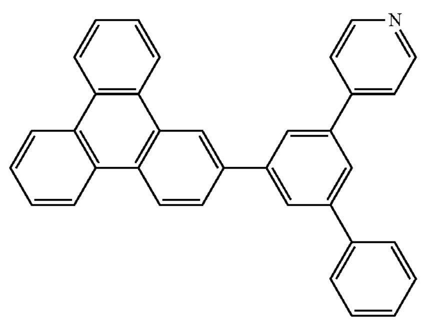
A-5
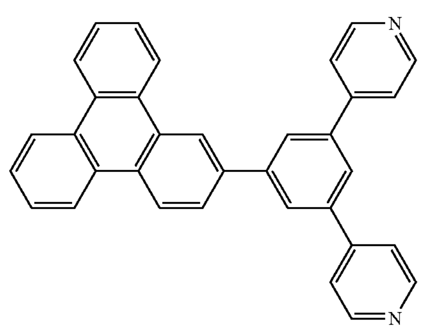
A-6
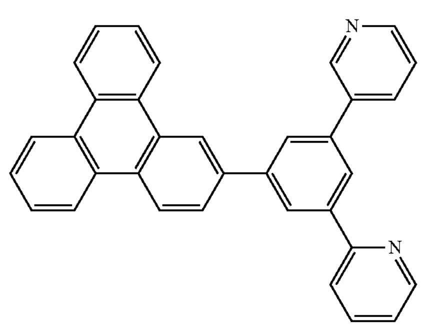

A-7
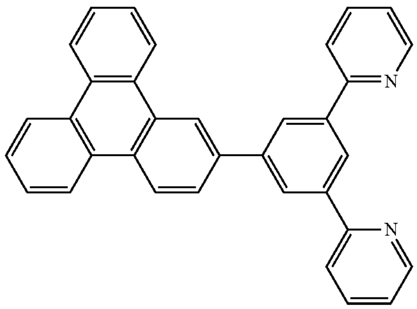
A-8
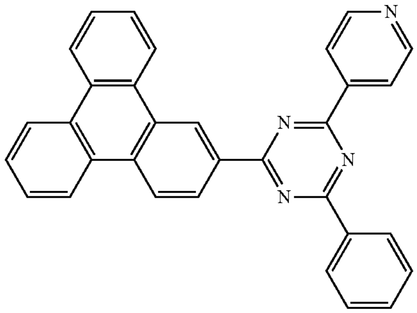
A-9
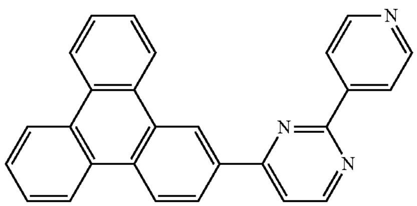
A-10
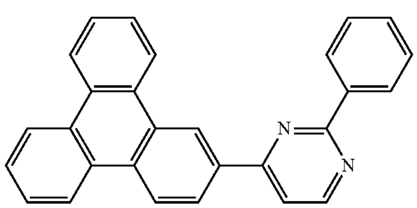
A-11
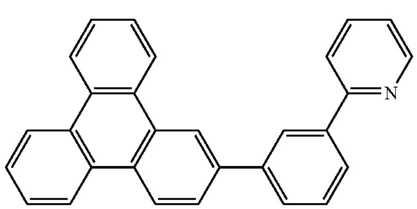
A-12
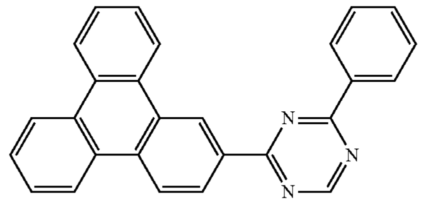
A-13
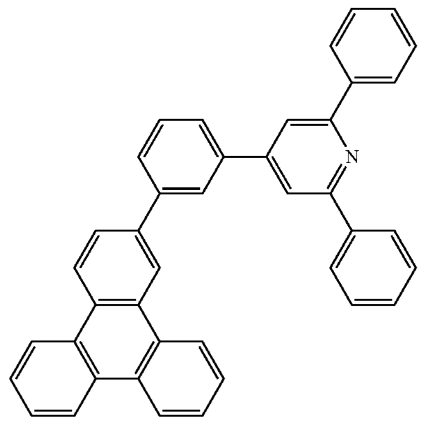
A-14
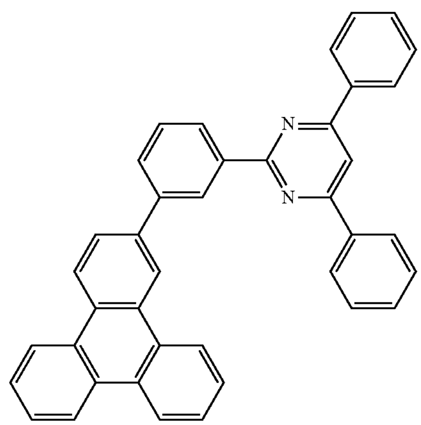
A-15
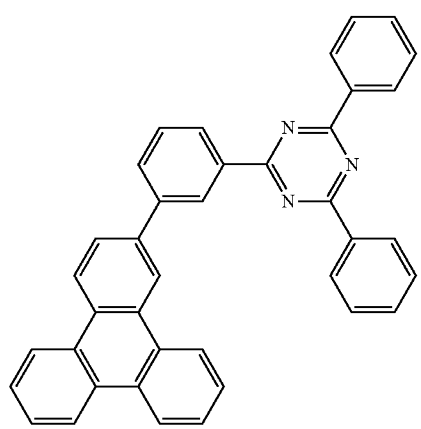

-continued
A-16
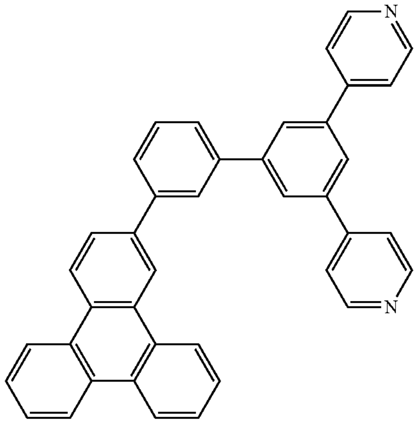
A-17
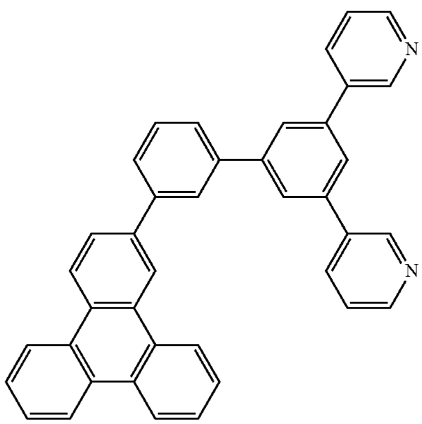
A-18
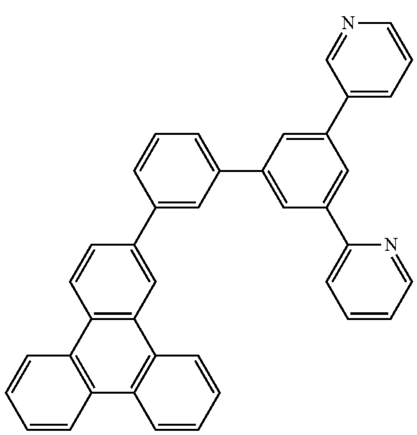
-continued
A-19
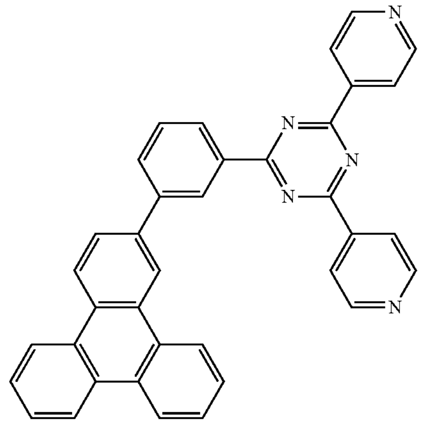
A-20
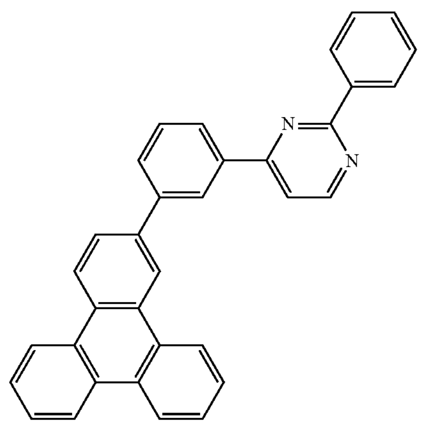
A-21
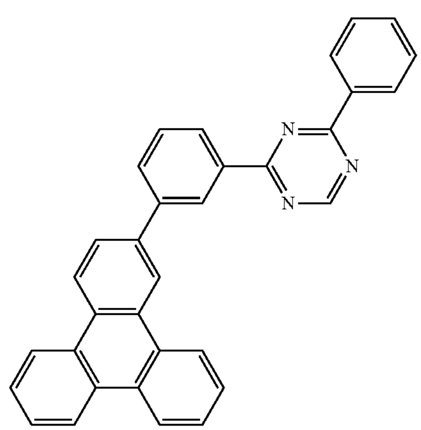

-continued
A-22
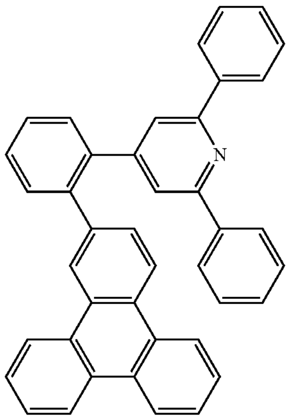
A-23
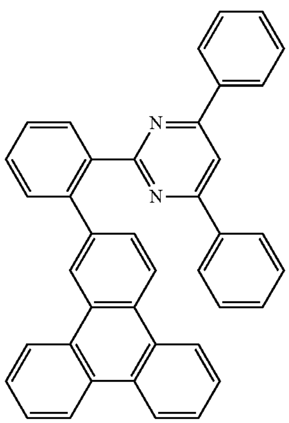
A-24
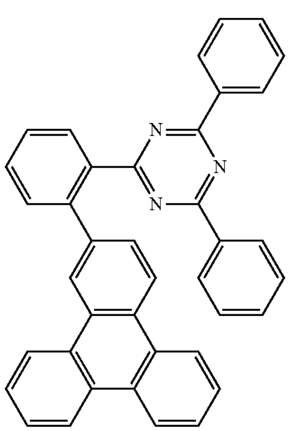
-continued
A-25
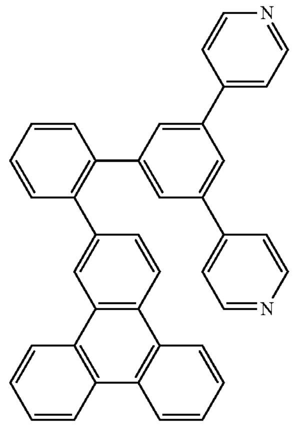
A-26
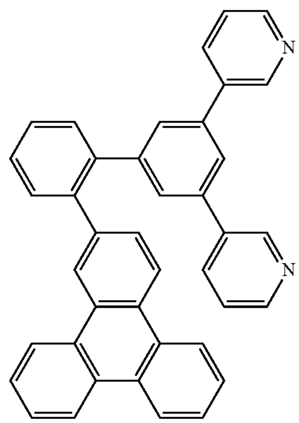
A-27
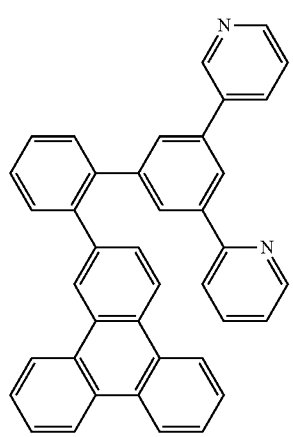

-continued
A-28
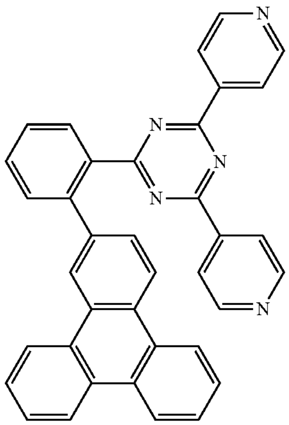
A-29
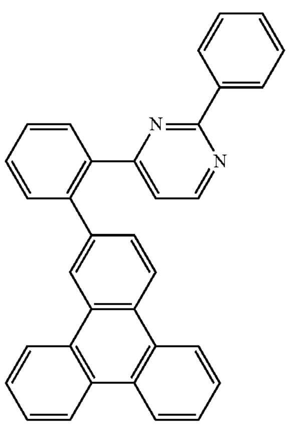
A-30
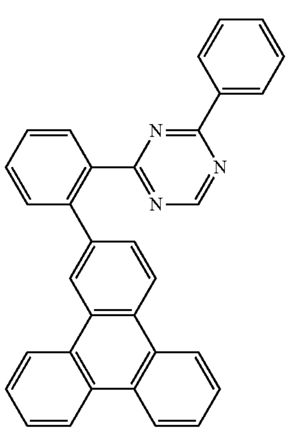
-continued
A-31
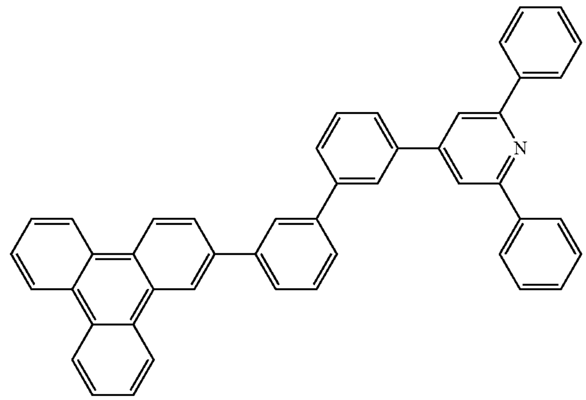
A-32
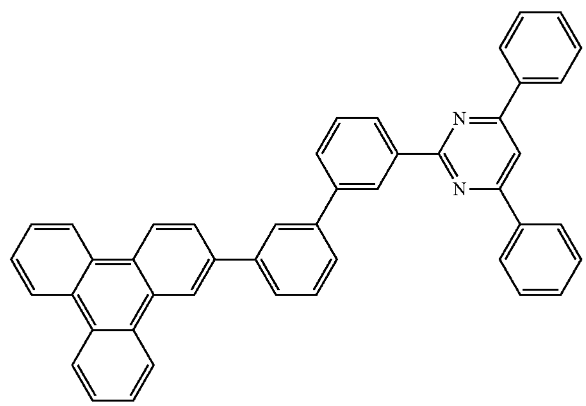
A-33
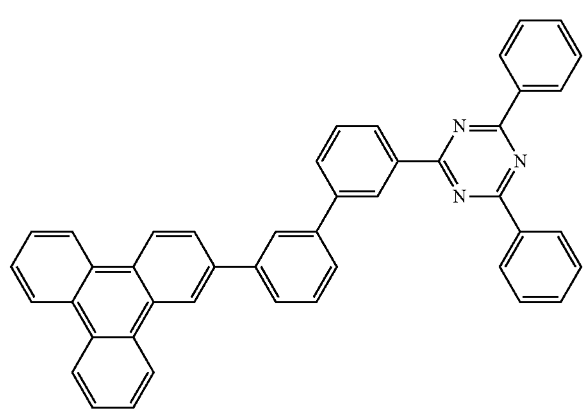

-continued
A-34
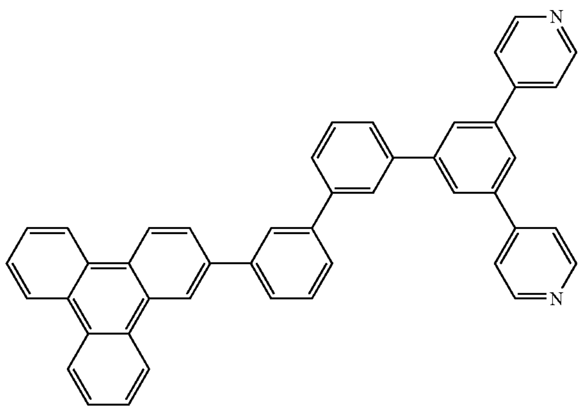
A-35
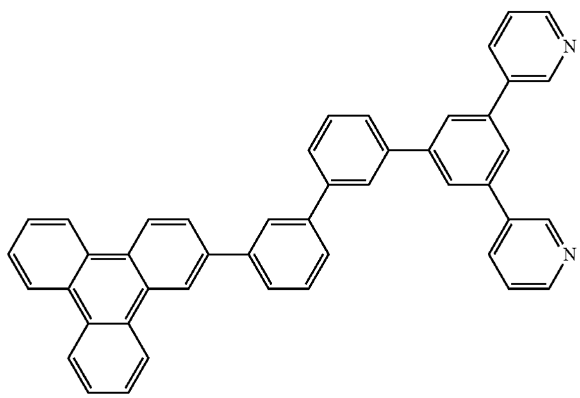
A-36
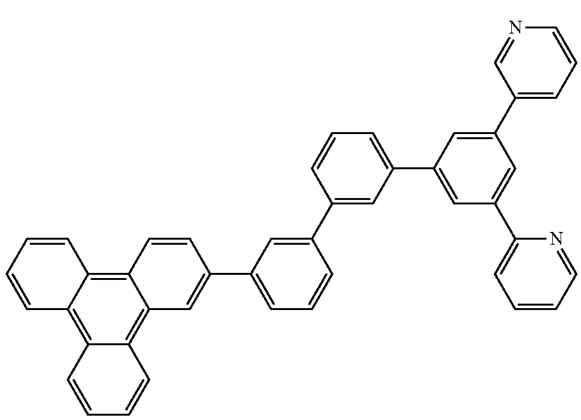
-continued
A-37
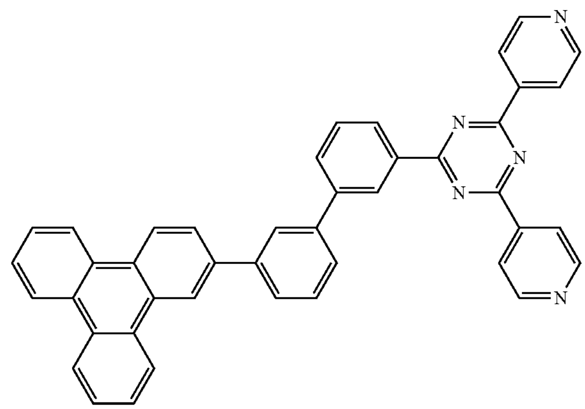
A-38
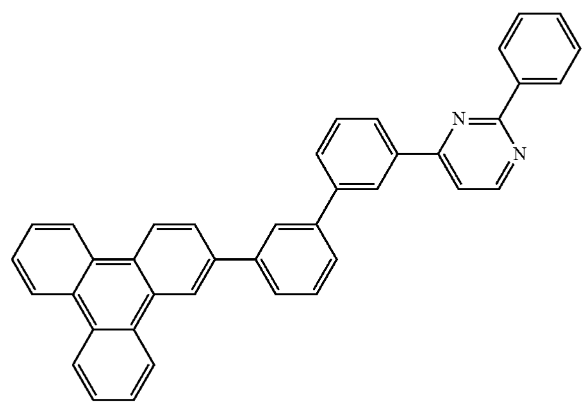
A-39
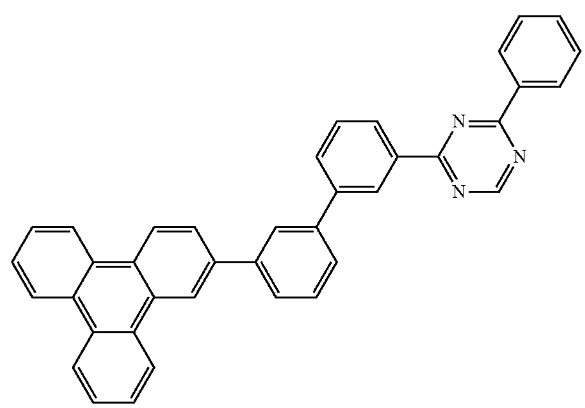
A-40
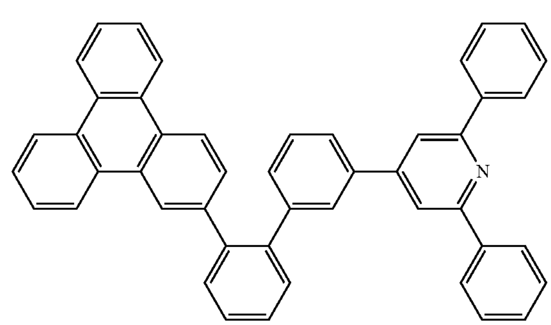

A-41
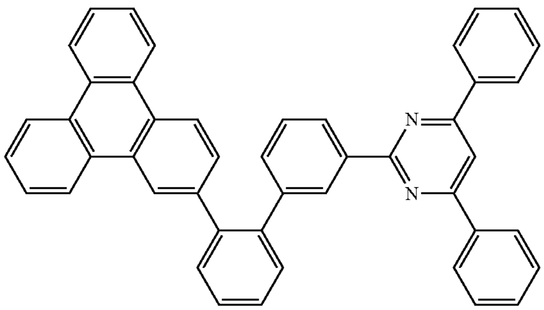
A-42
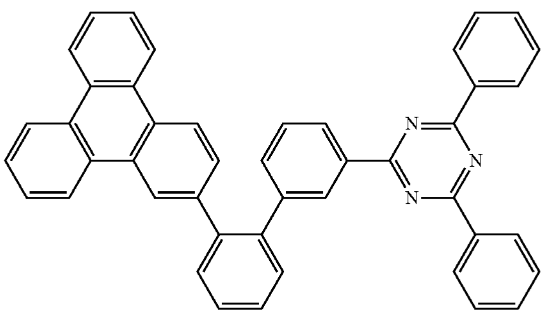
A-43
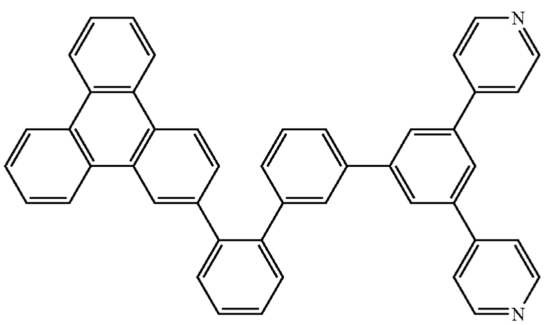
A-44
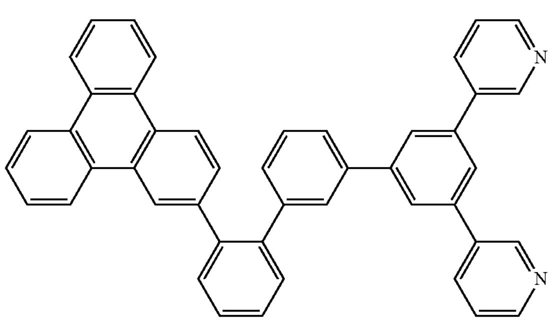
A-45
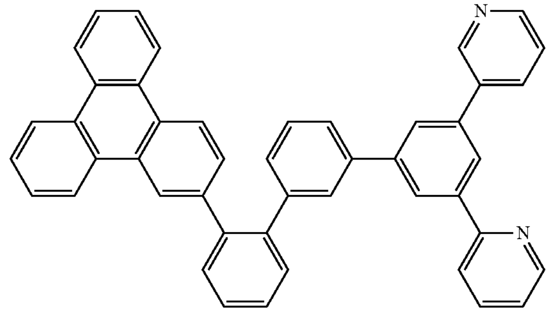
A-46
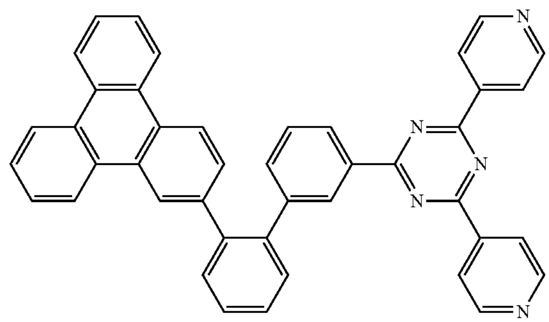
A-47
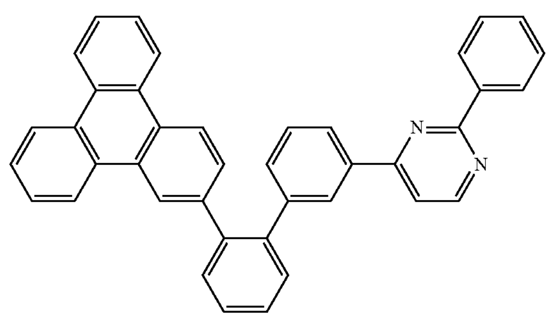
A-48
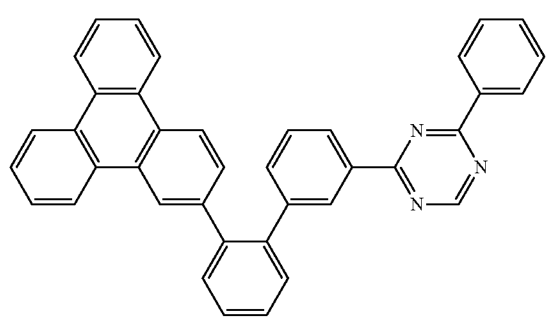

-continued
A-49
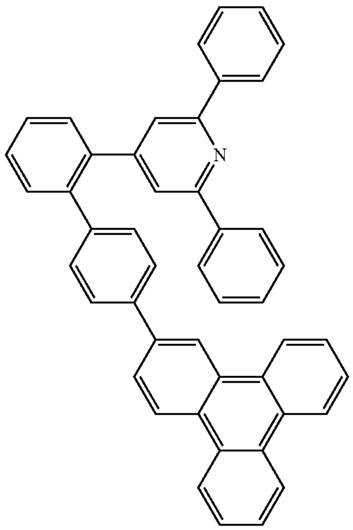
A-50
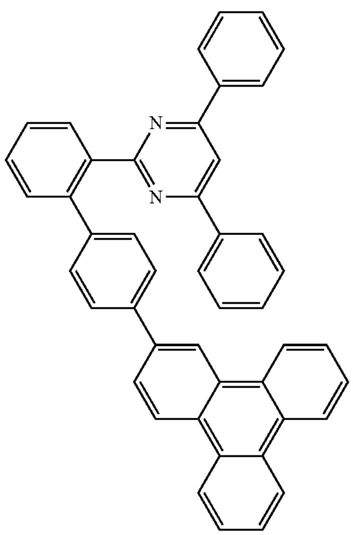
A-51
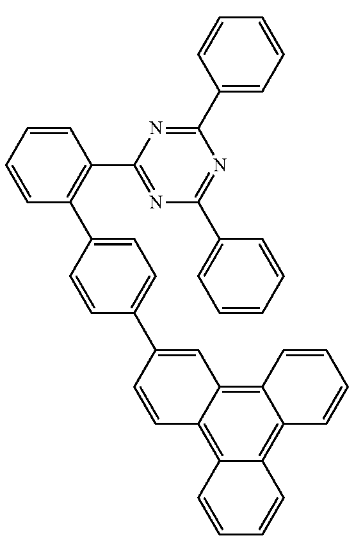
-continued
A-52
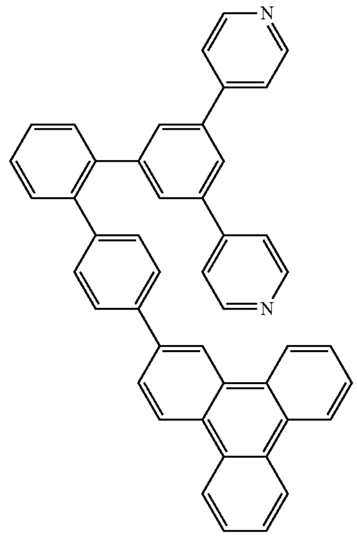
A-53
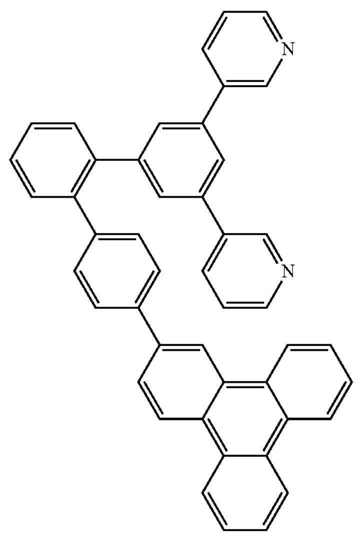
A-54
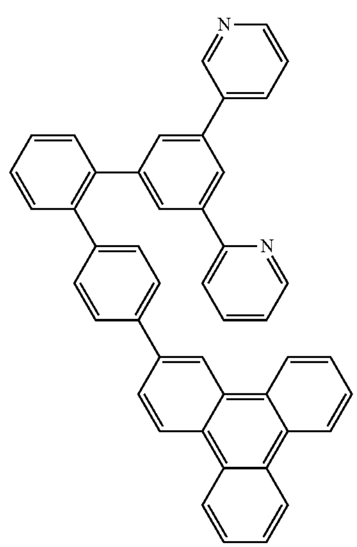

-continued
A-55
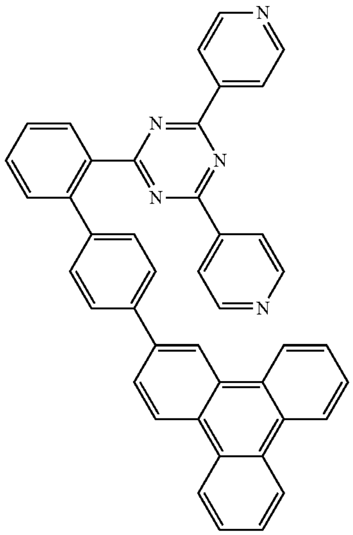
A-56
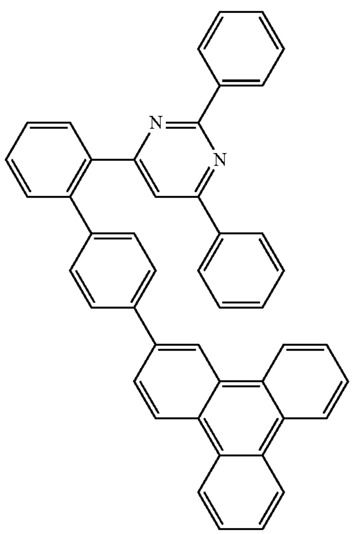
A-57
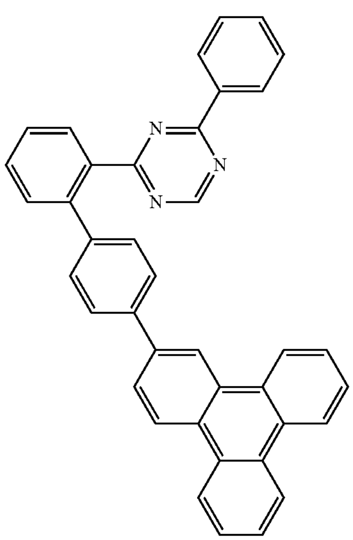
-continued
A-58
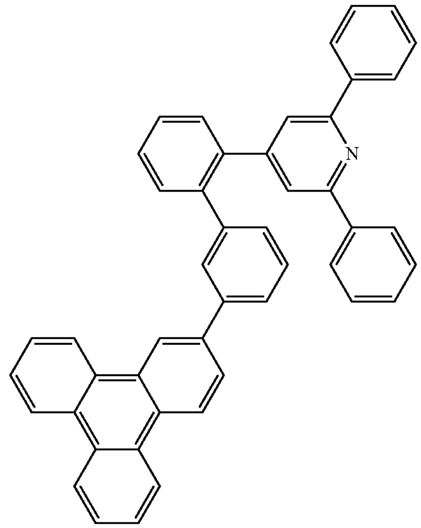
A-59
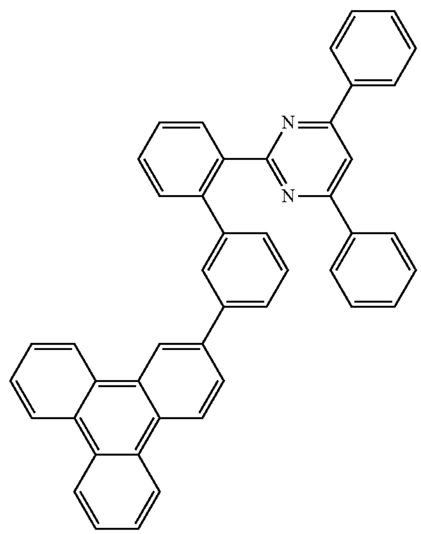
A-60
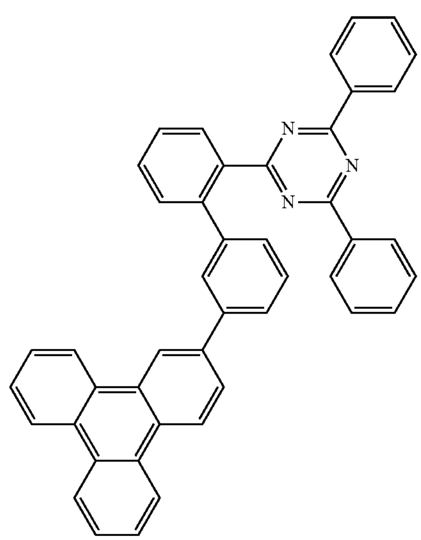

-continued
A-61
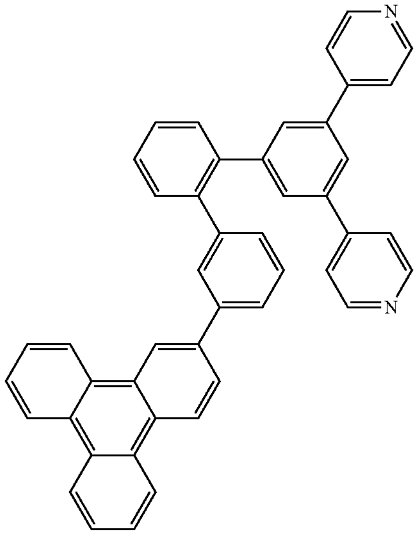
A-62
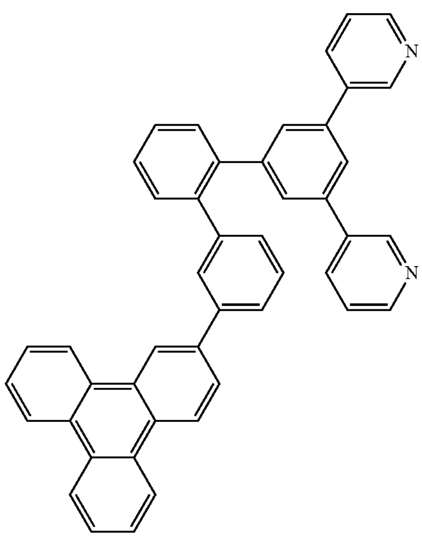
A-63
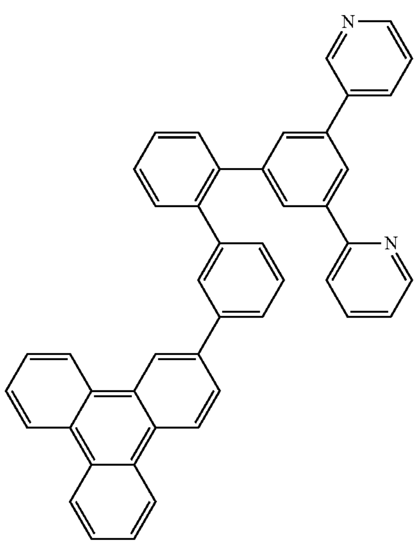
-continued
A-64
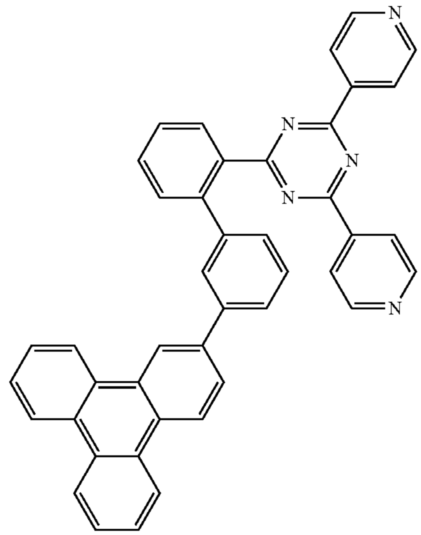
A-65
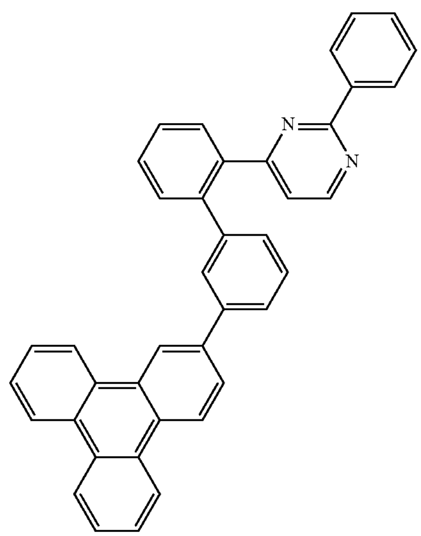
A-66
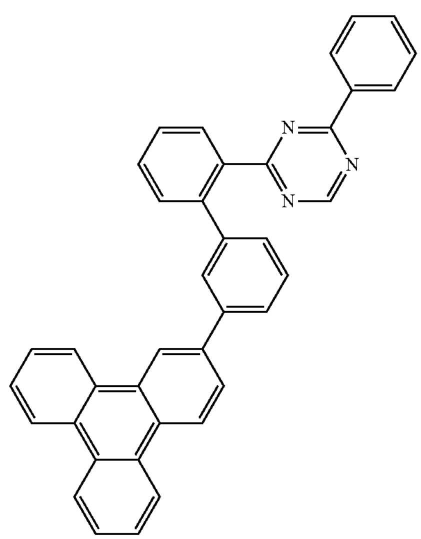

-continued
A-67
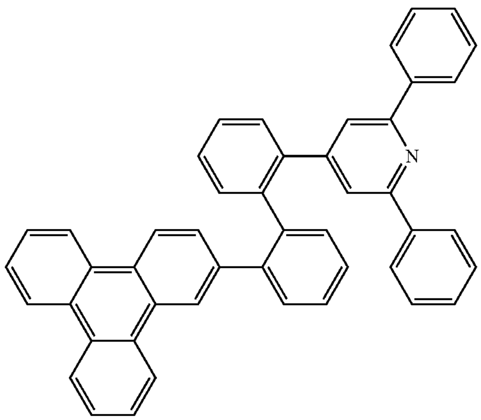
A-68
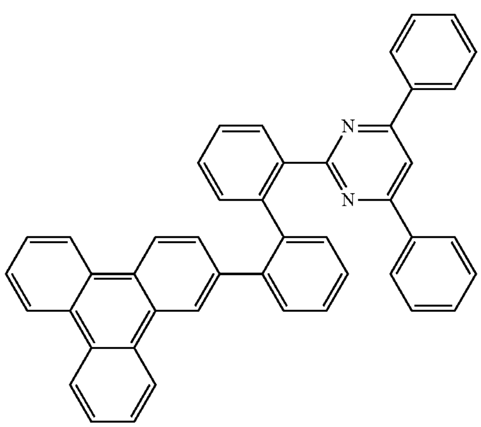
A-69
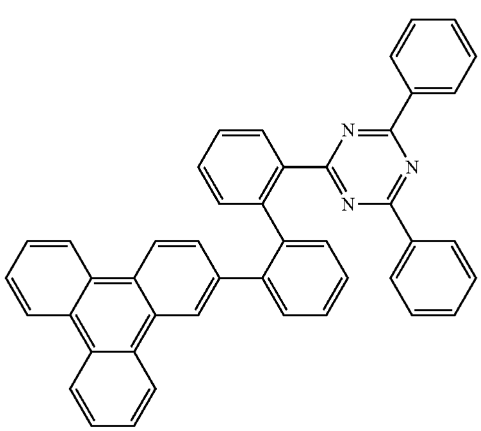
-continued
A-70
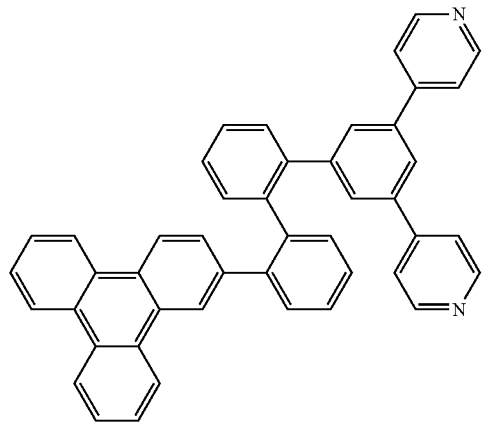
A-71
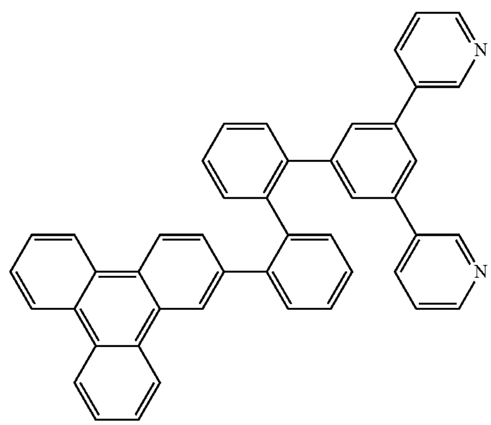
A-72
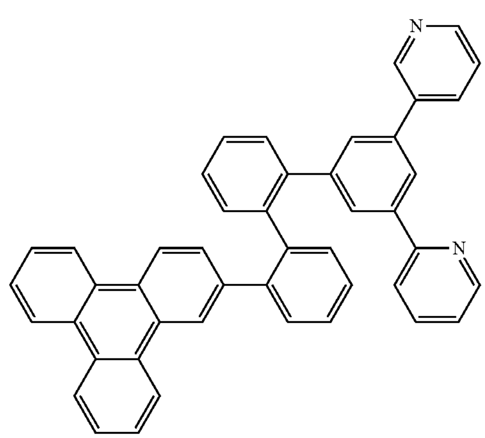

A-73
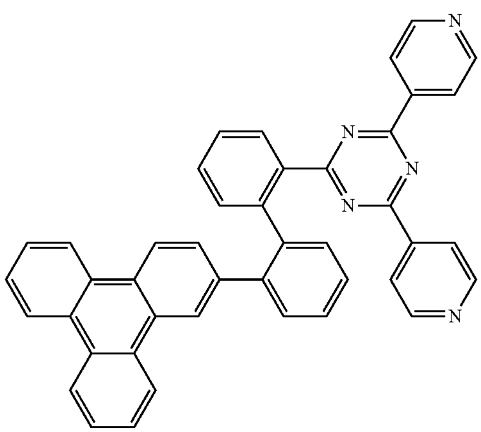
A-74
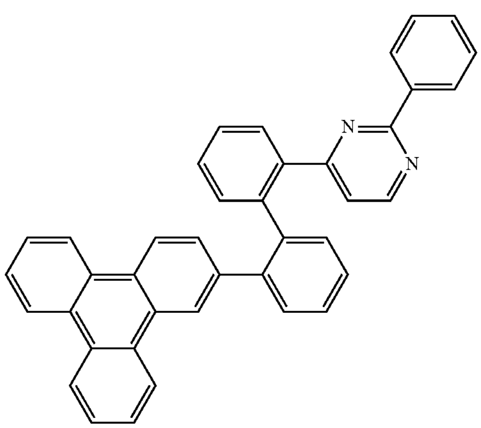
A-75
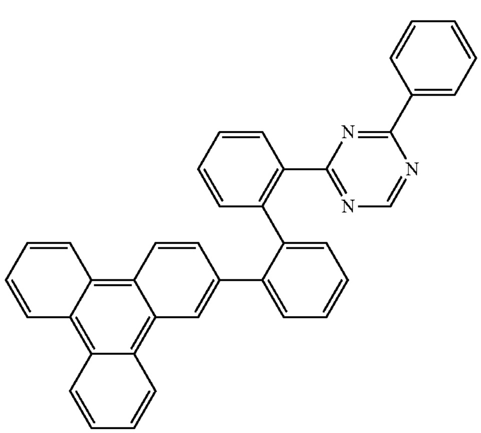
A-76
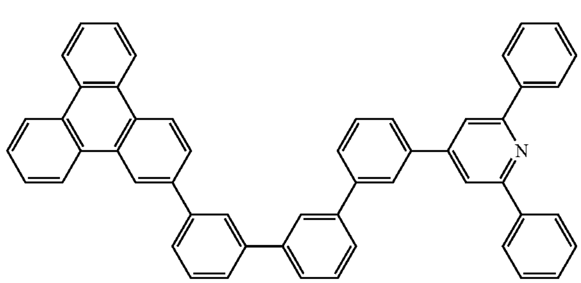
A-77
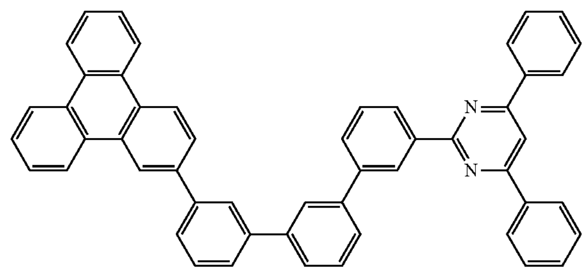
A-78
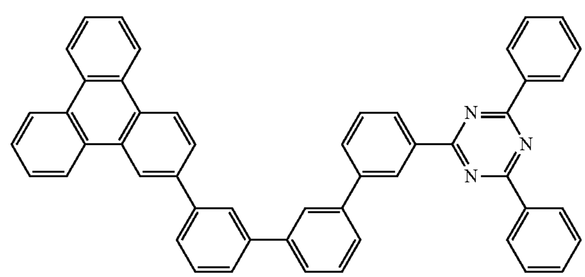
A-79
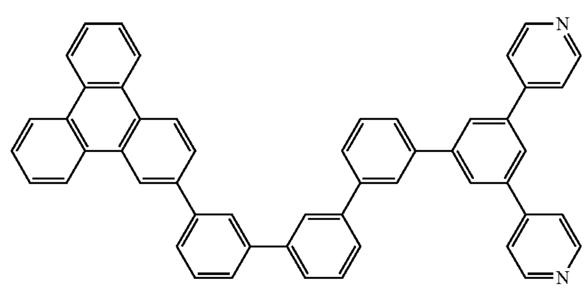
A-80
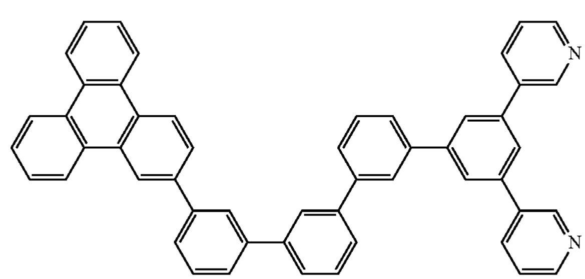
A-81
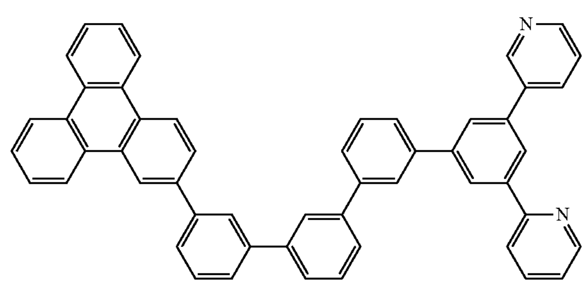

A-82
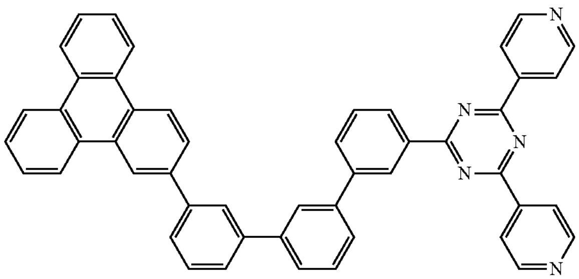
A-83
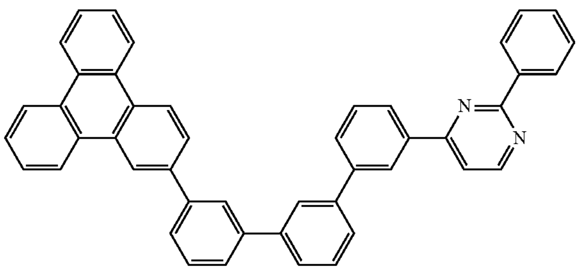
A-84
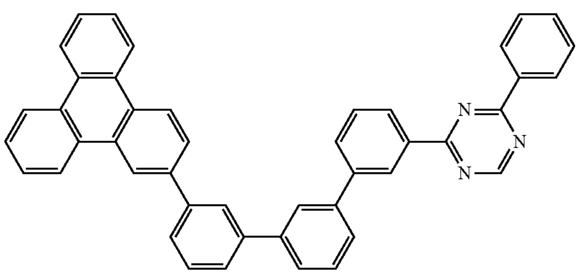
A-85
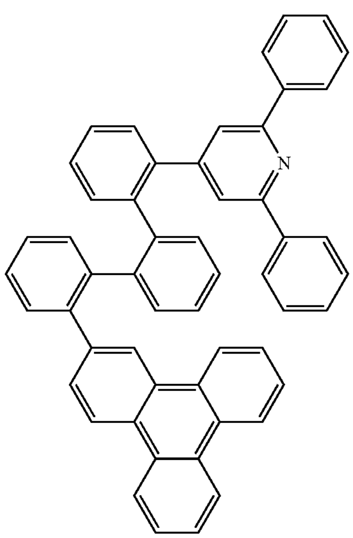
A-86
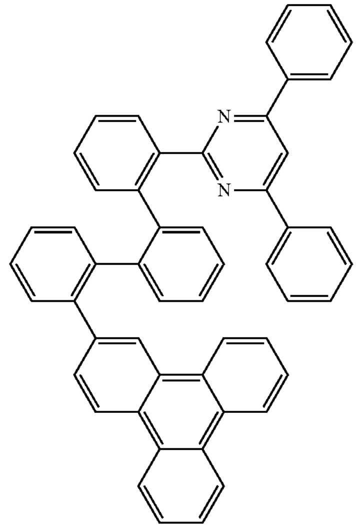
A-87
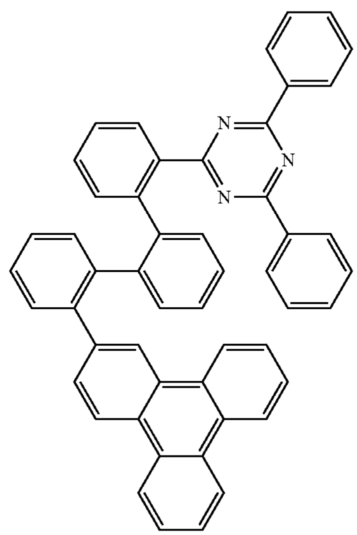
A-88
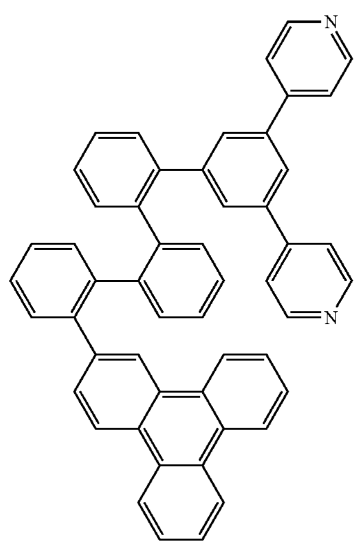

-continued
A-89
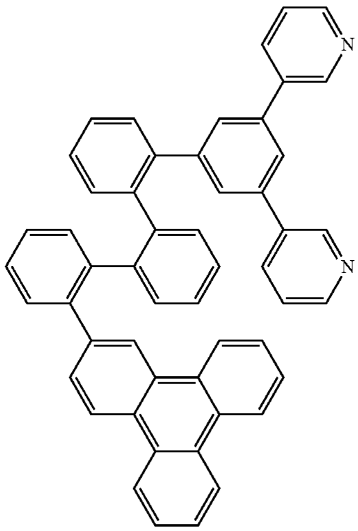
A-90
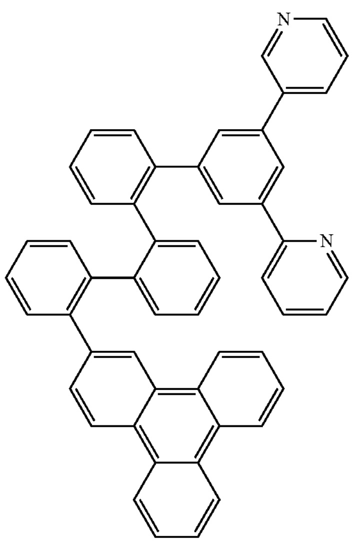
A-91
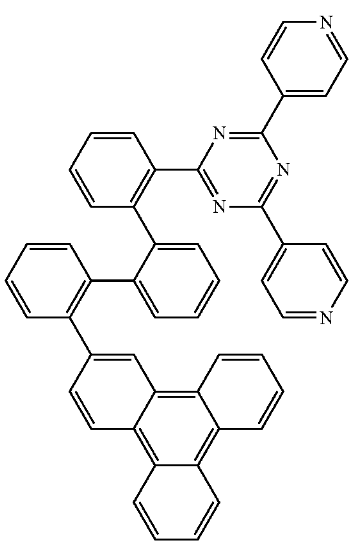
-continued
A-92
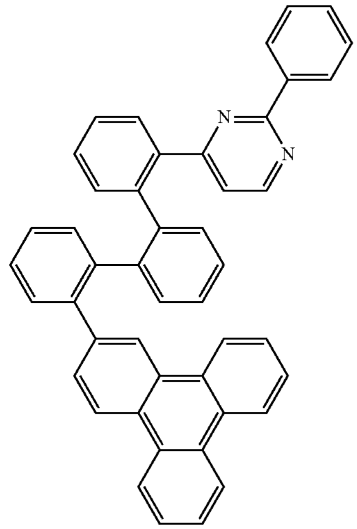
A-93
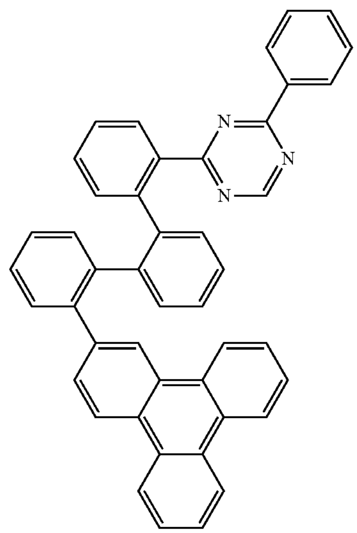
A-94
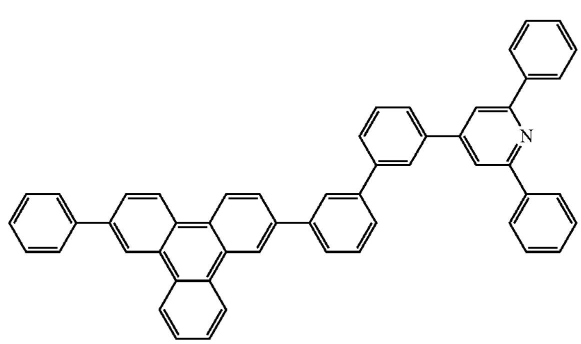

-continued
A-95
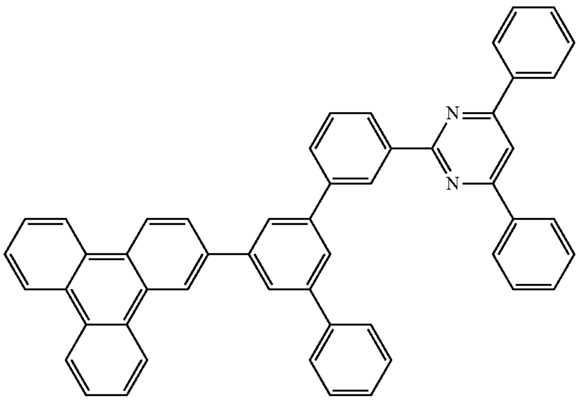
A-96
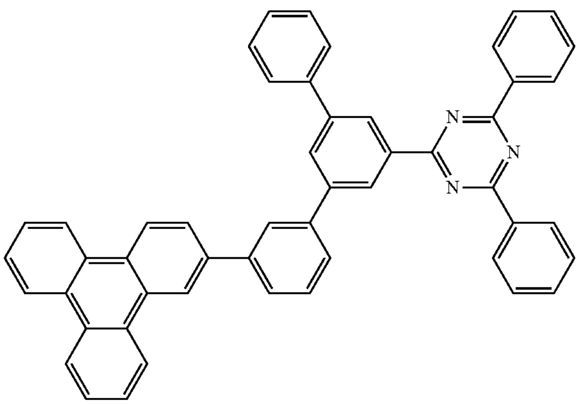
A-97
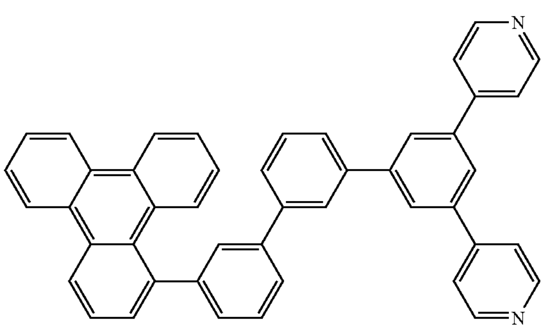
A-98
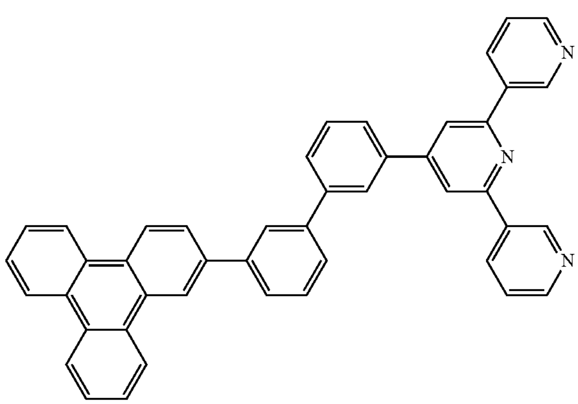
-continued
A-99
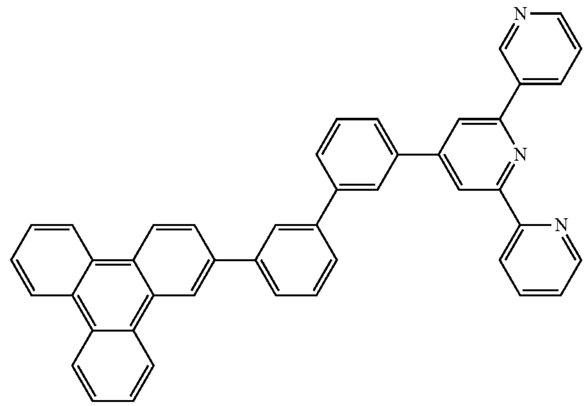
A-100
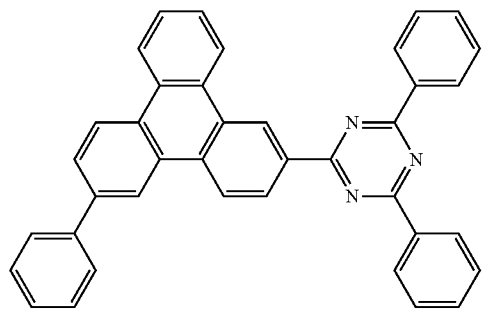
A-101
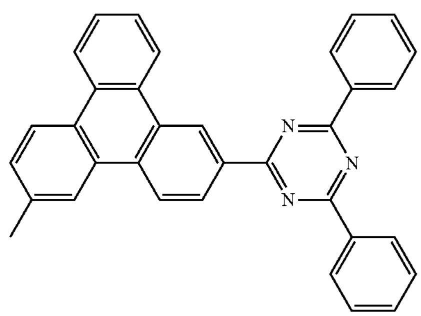
A-102
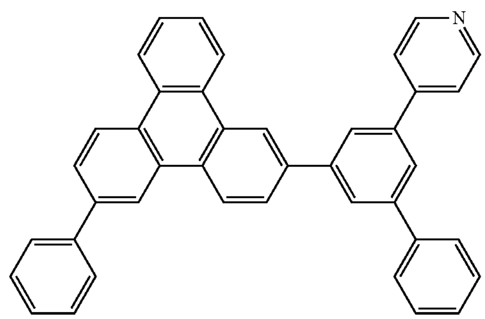

A-103
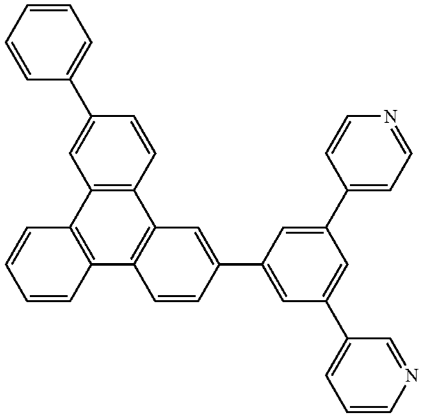
A-104
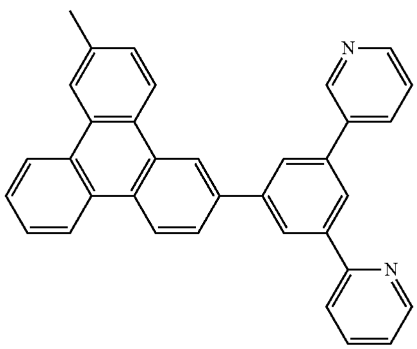
A-105
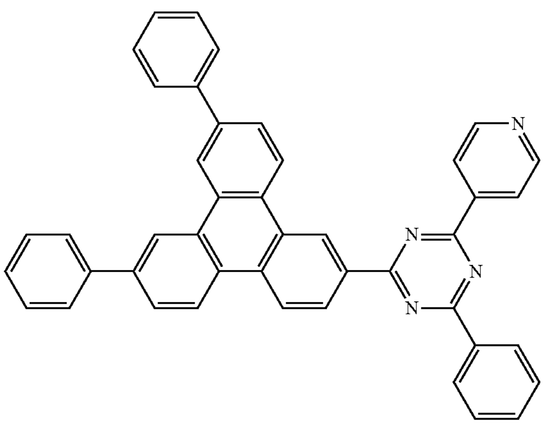
A-106
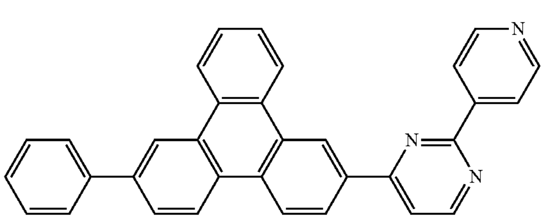
A-107
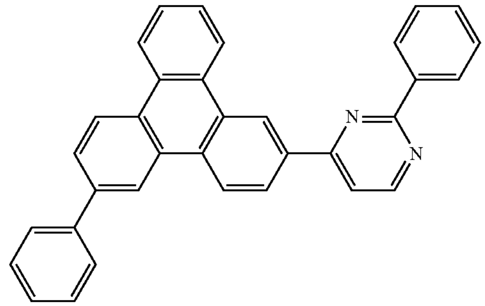
A-108
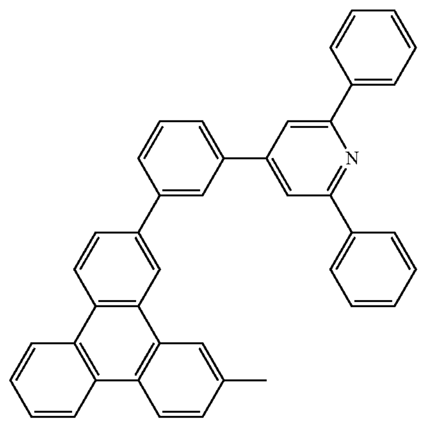
A-109
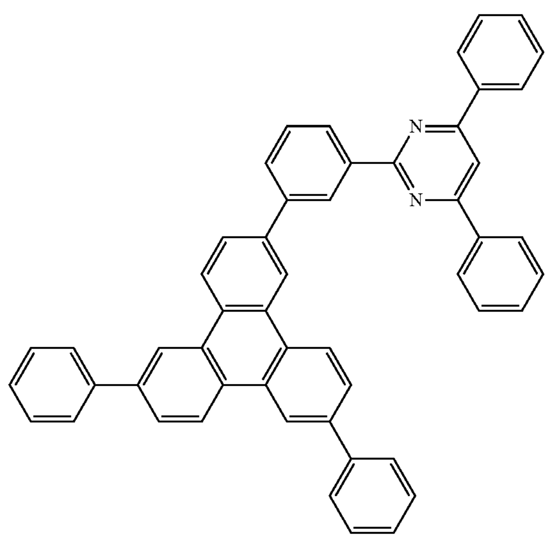

A-110
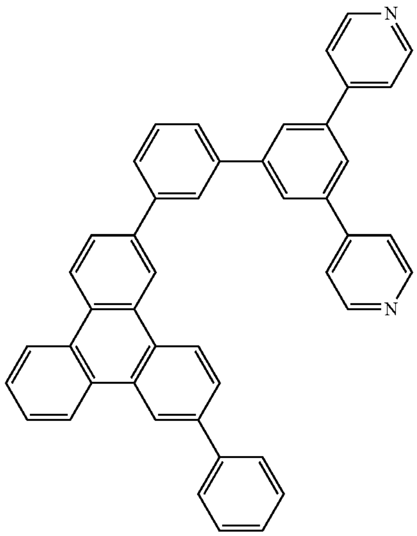
A-111
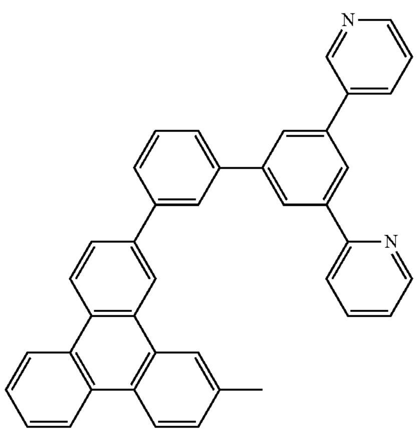
A-112
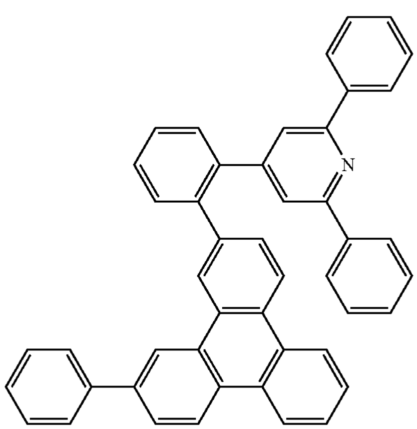
A-113
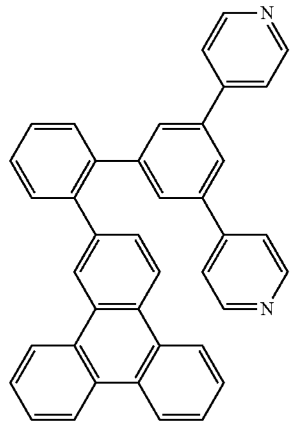
A-114
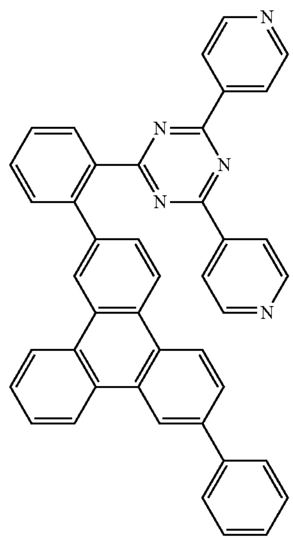
A-115
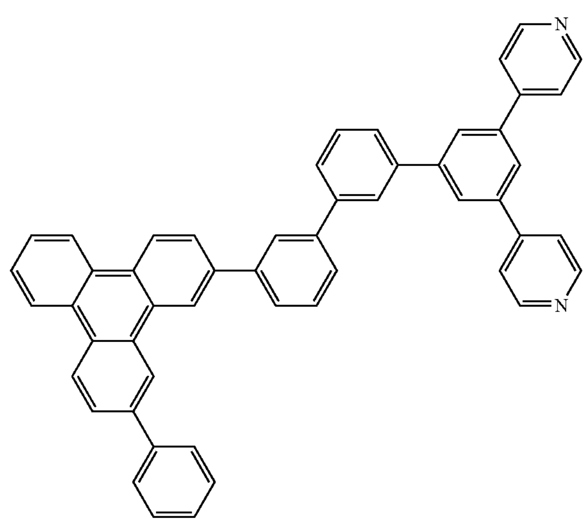

-continued
A-116
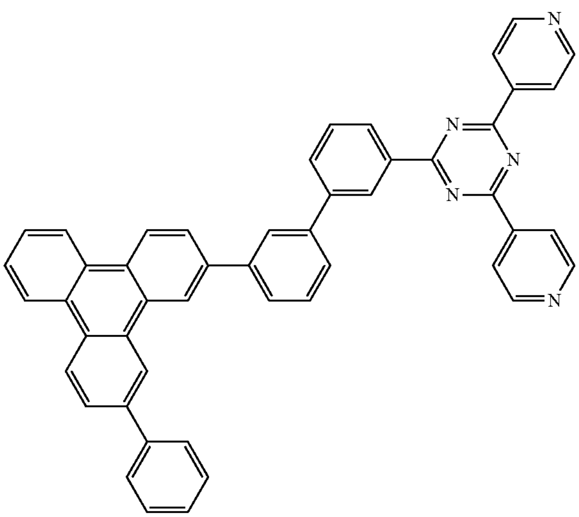
A-117
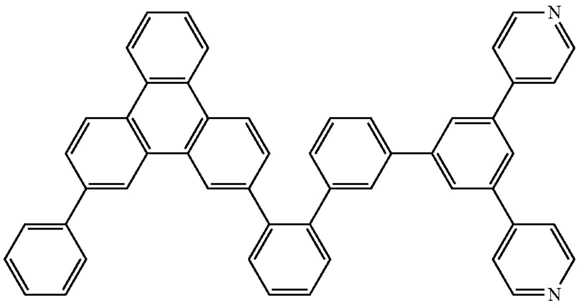
A-118
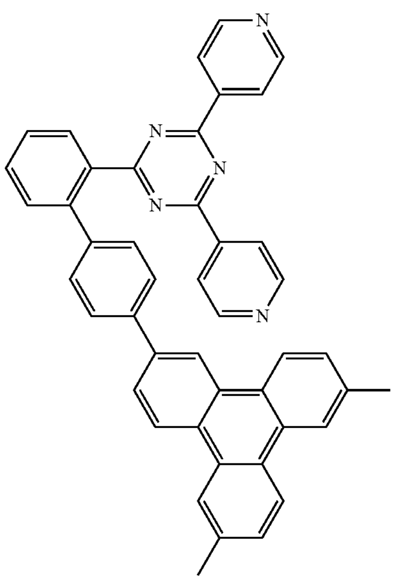
-continued
A-119
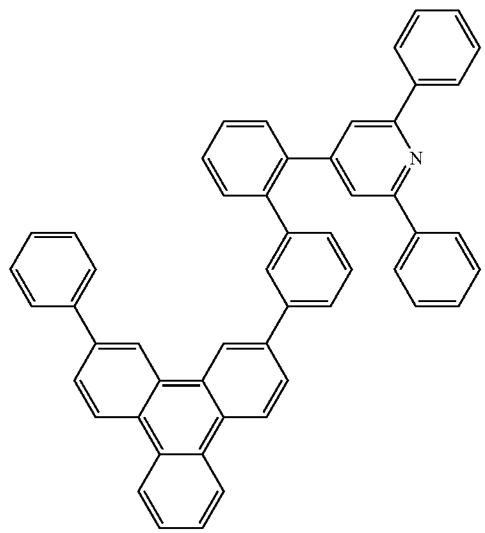
A-120
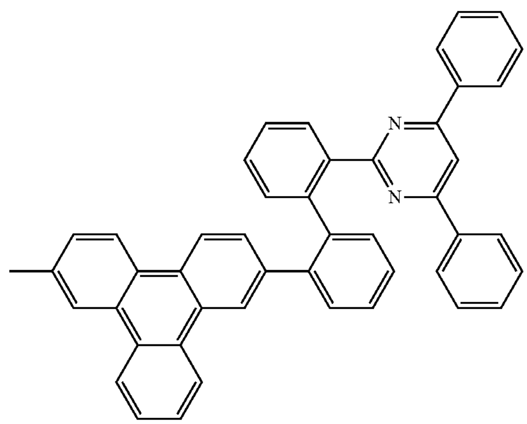
A-121
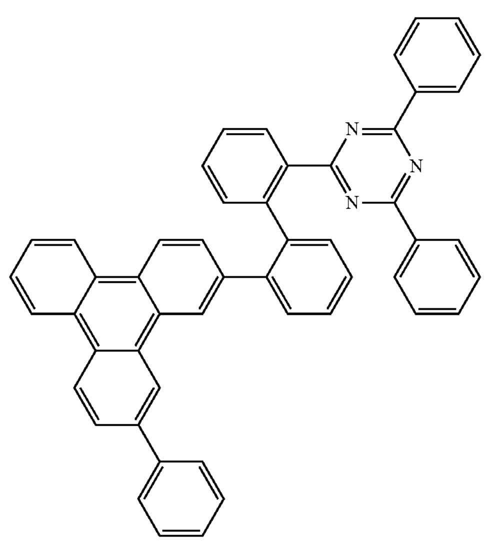

-continued
A-122
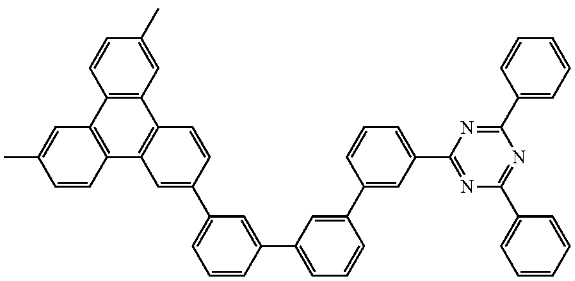
A-123
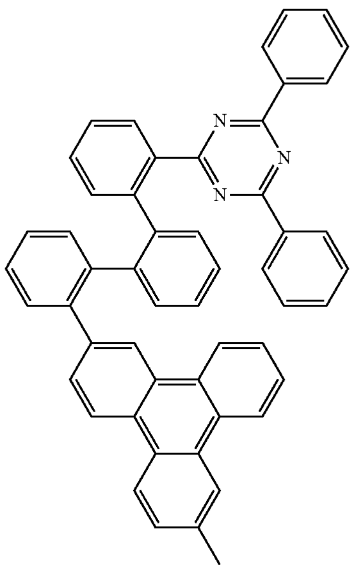
A-124
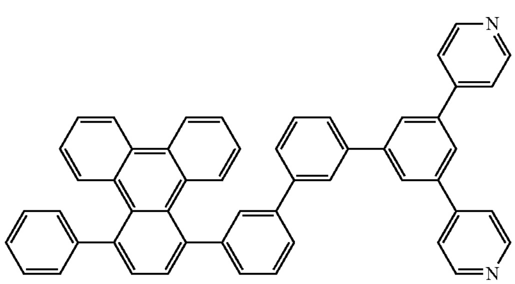
A-125
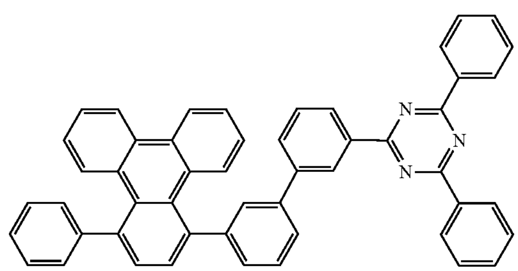
A(1)
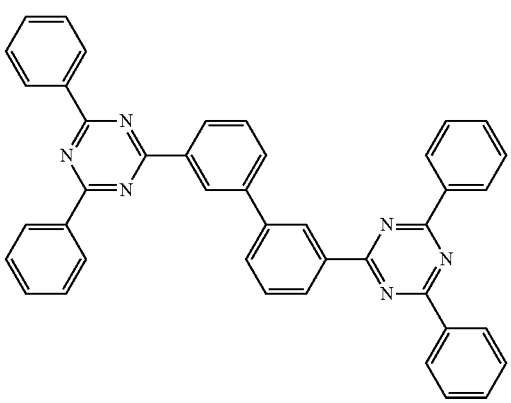
A(2)
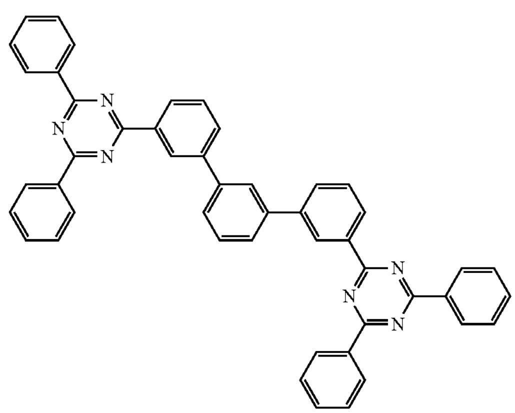

-continued
A(3)
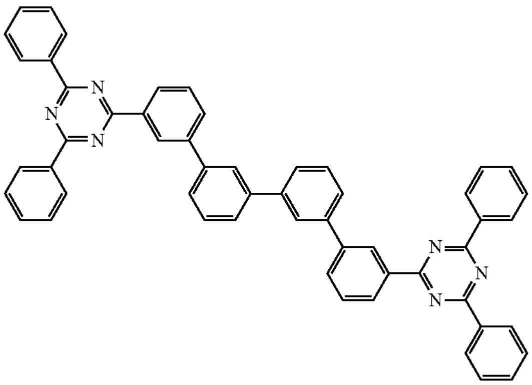
A(4)
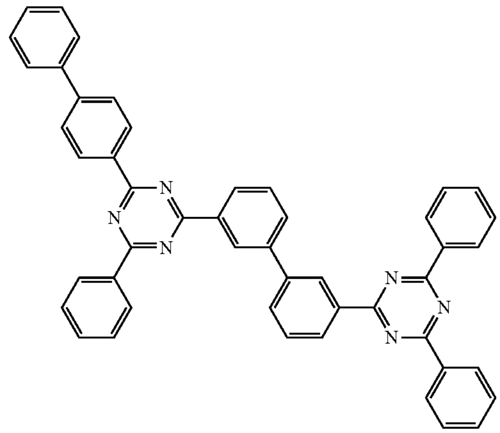
A(5)
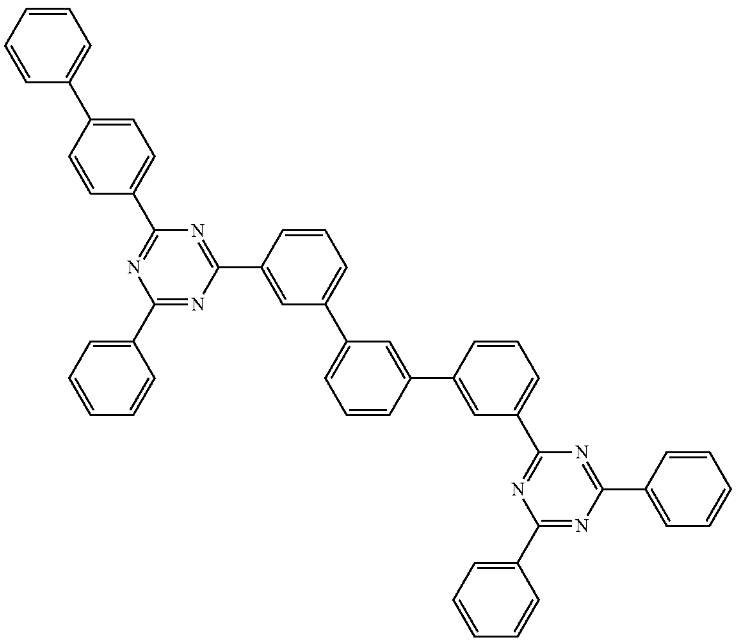
A(6)
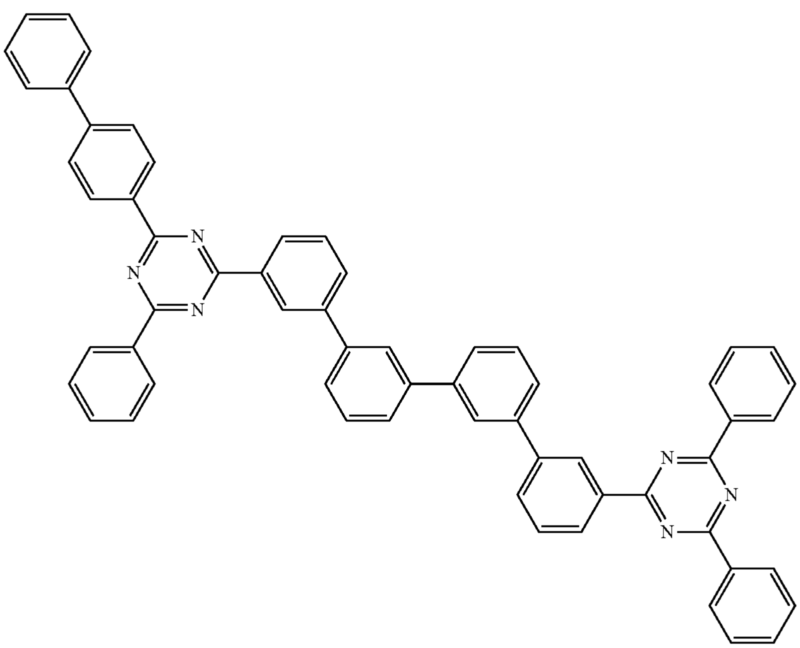

-continued
A(7)
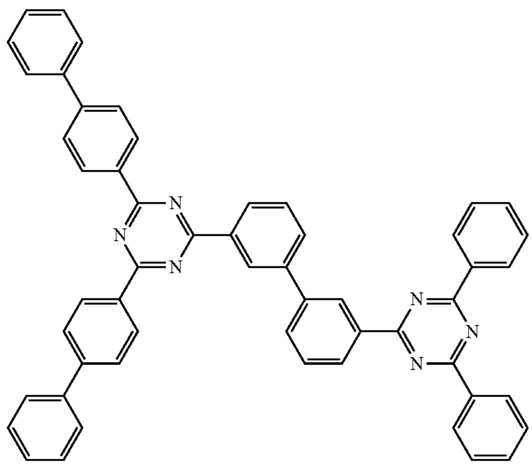
A(8)
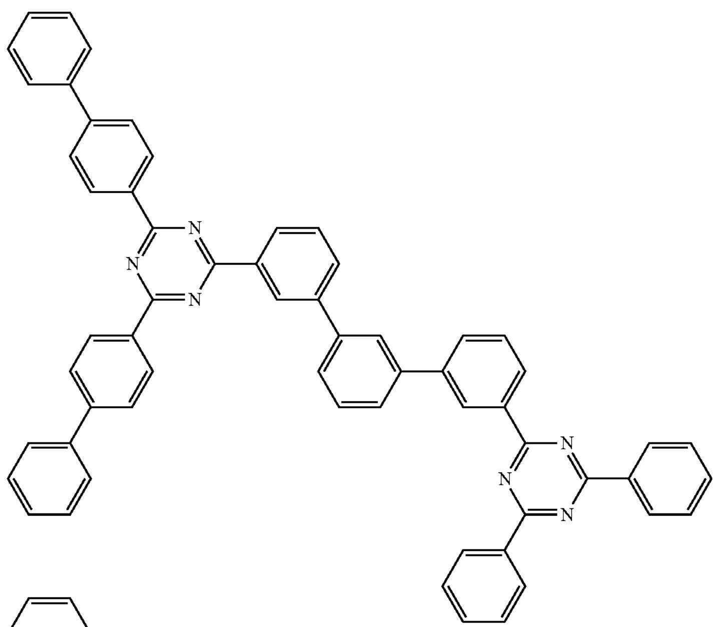
A(9)
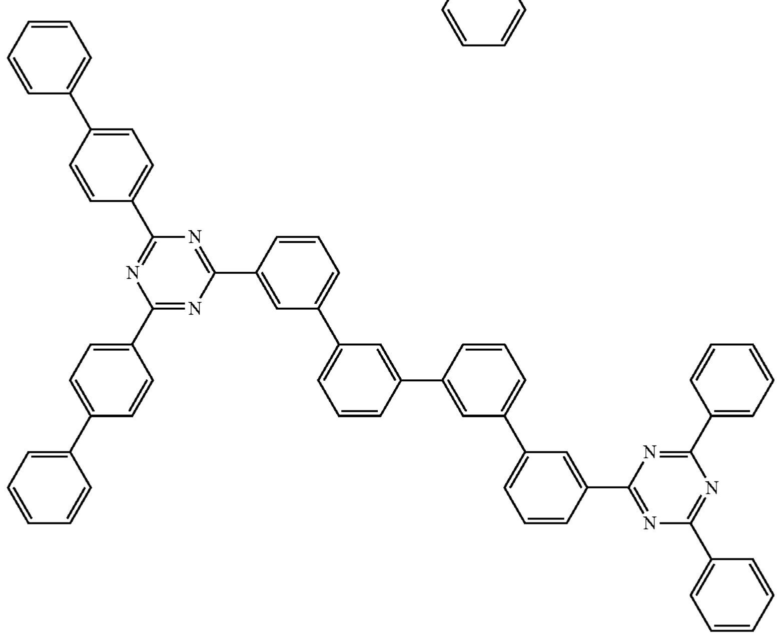

-continued
A(10)
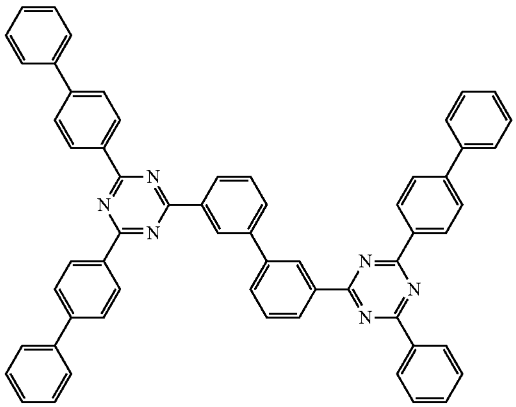
A(11)
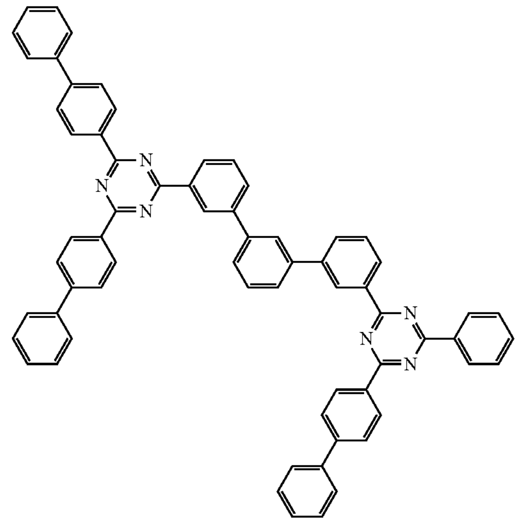
A(12)
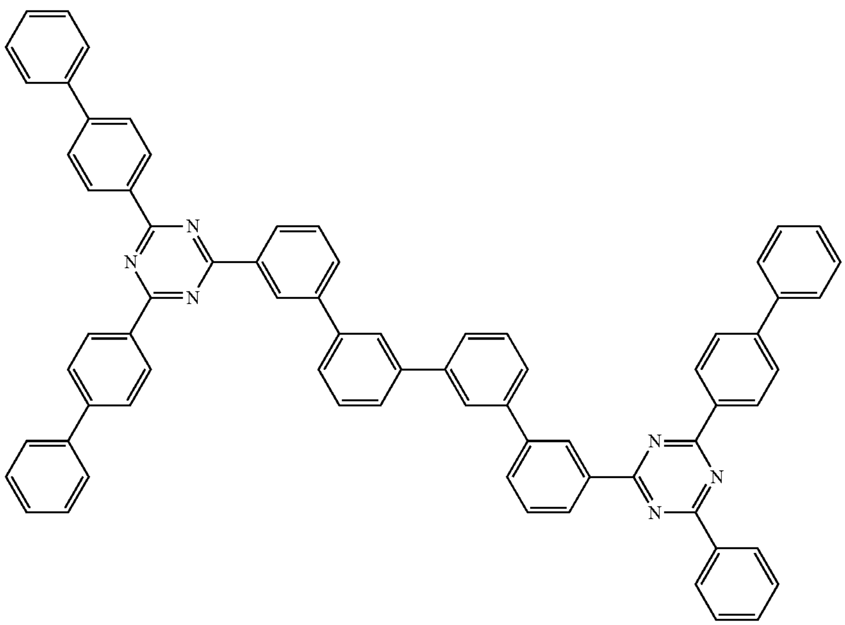
A(13)
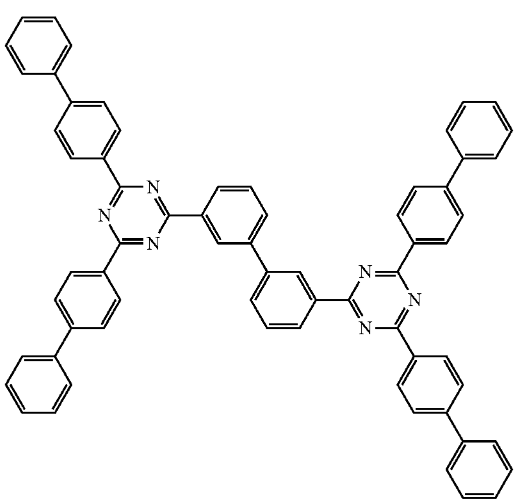

-continued
A(14)
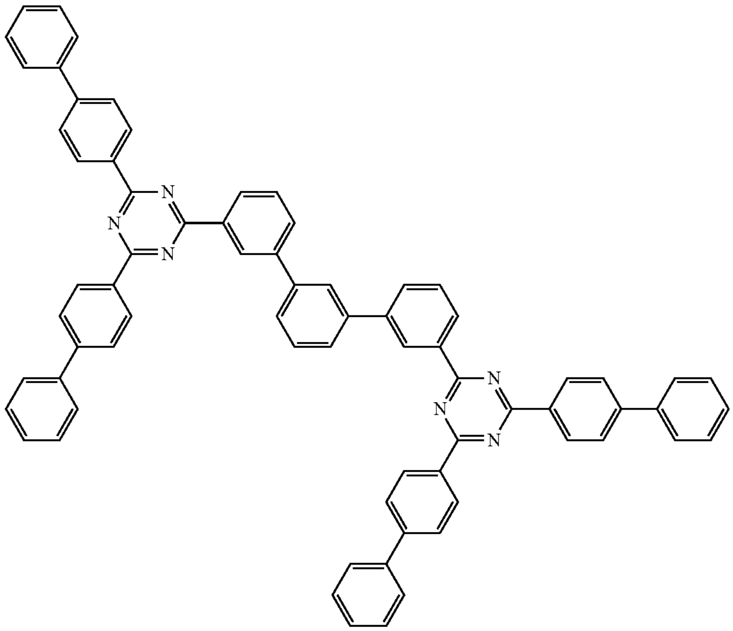
A(15)
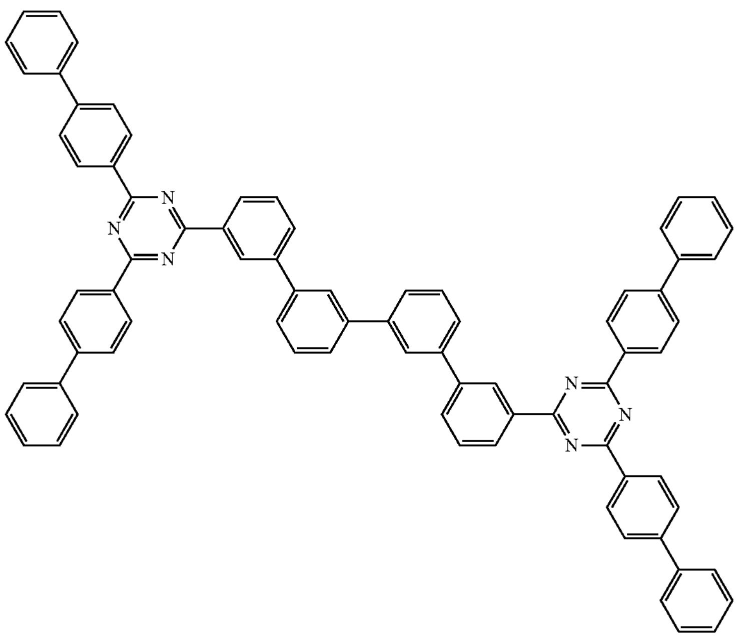
A(16)
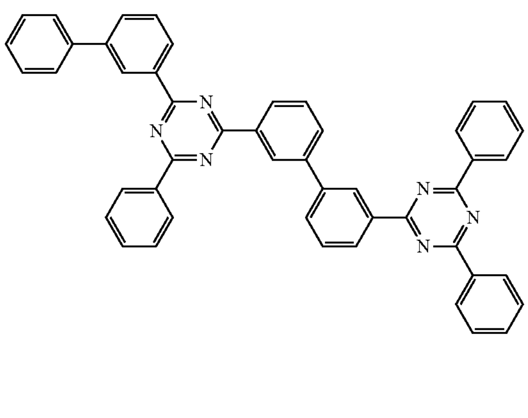

-continued
A(17)
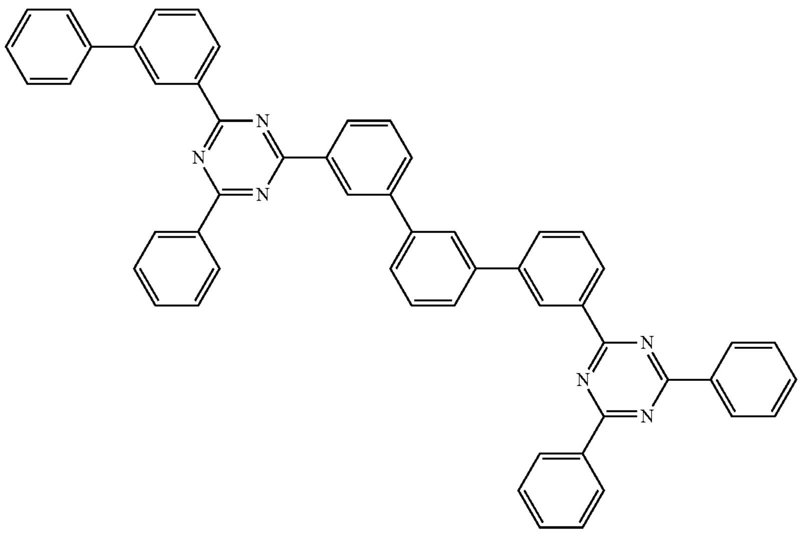
A(18)
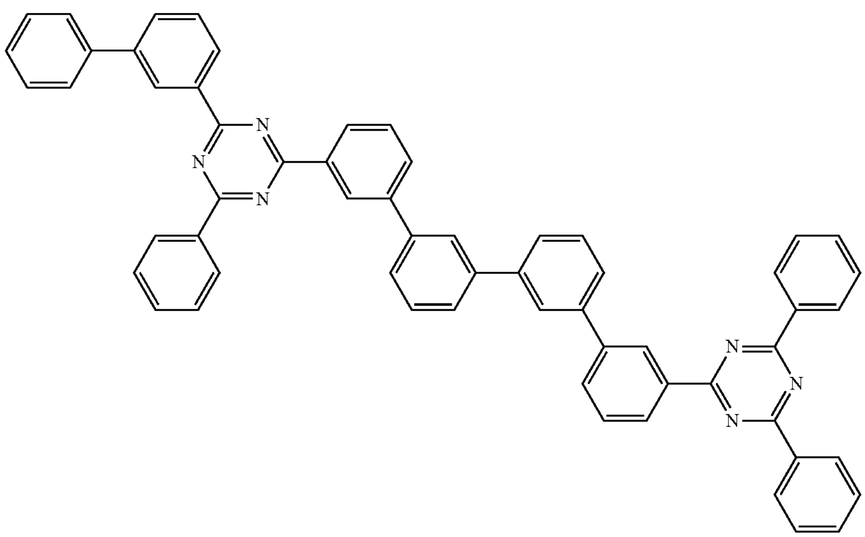
A(19)
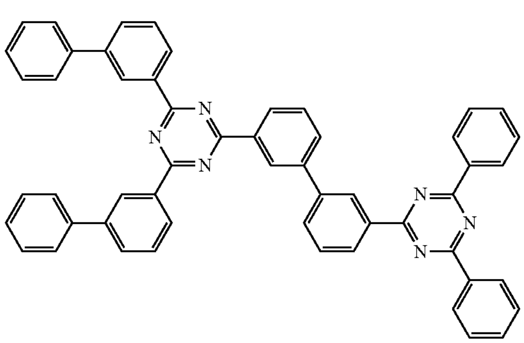

-continued
A(20)
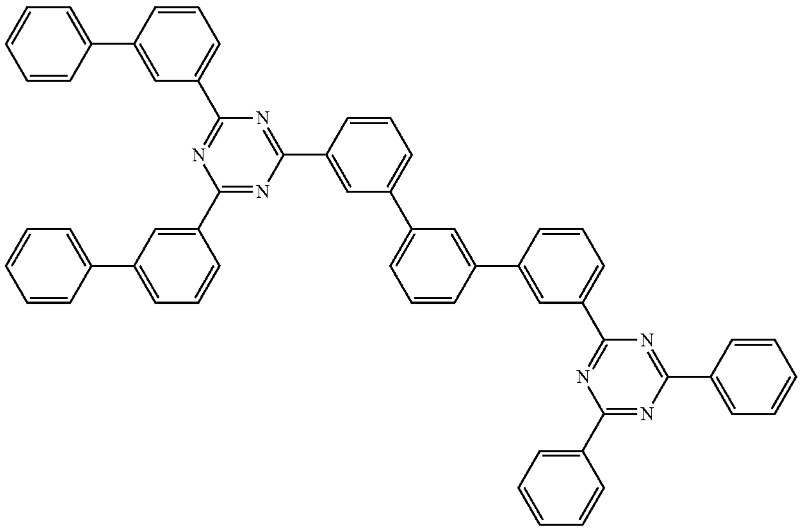
A(21)
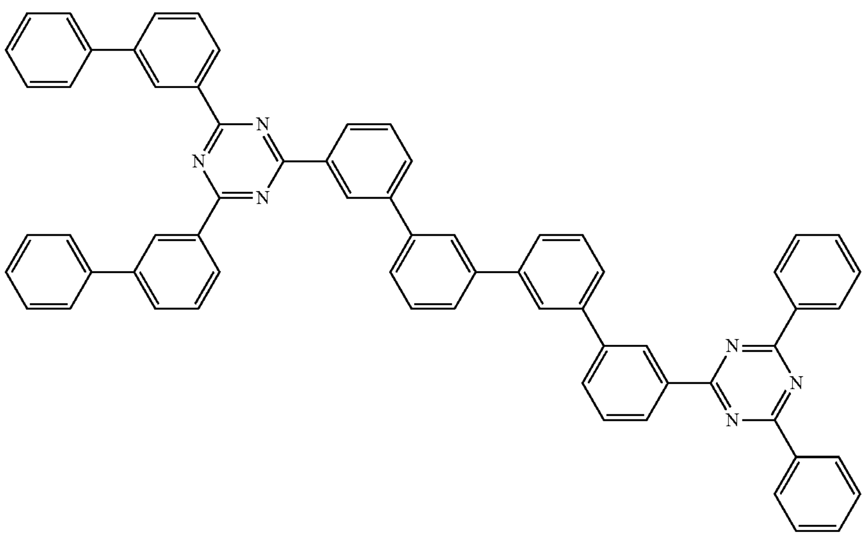
A(22)
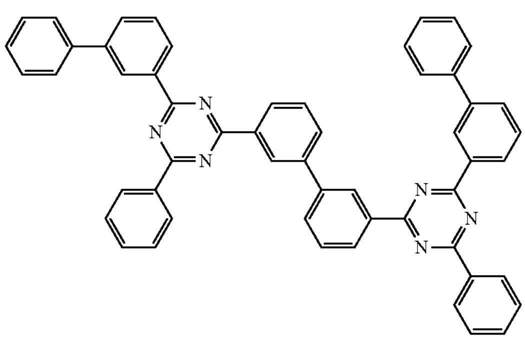

-continued
A(23)
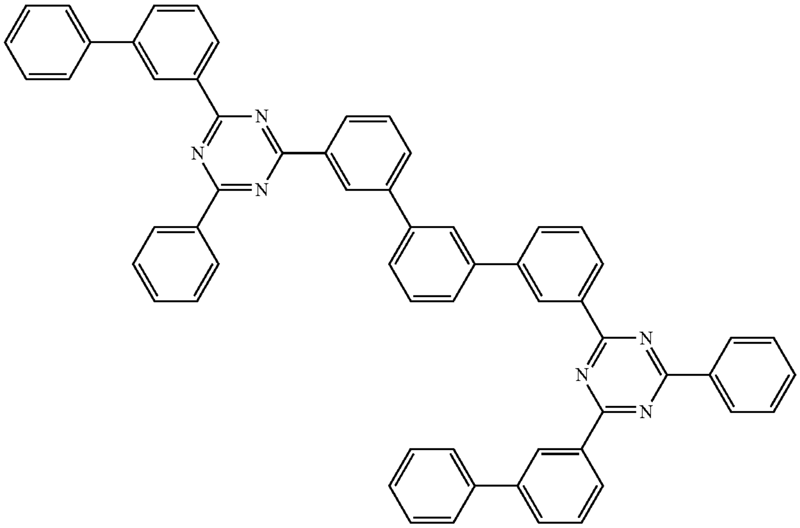
A(24)
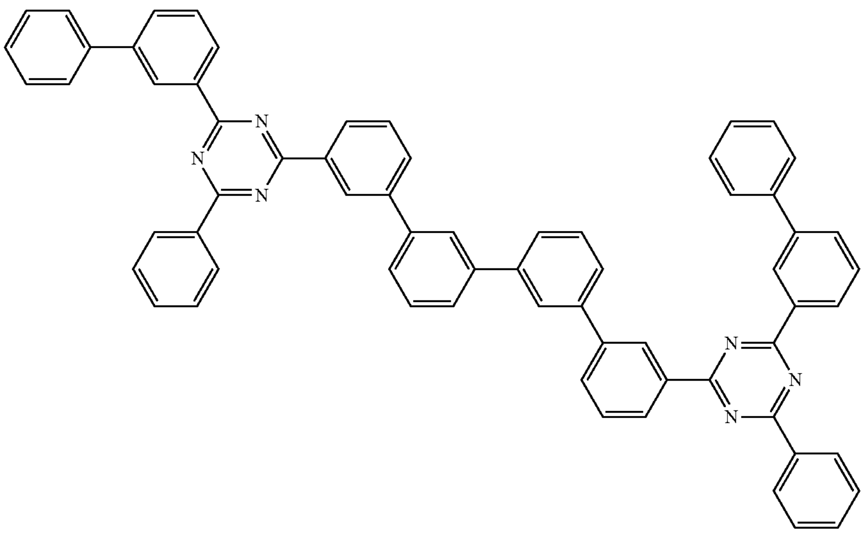
A(25)
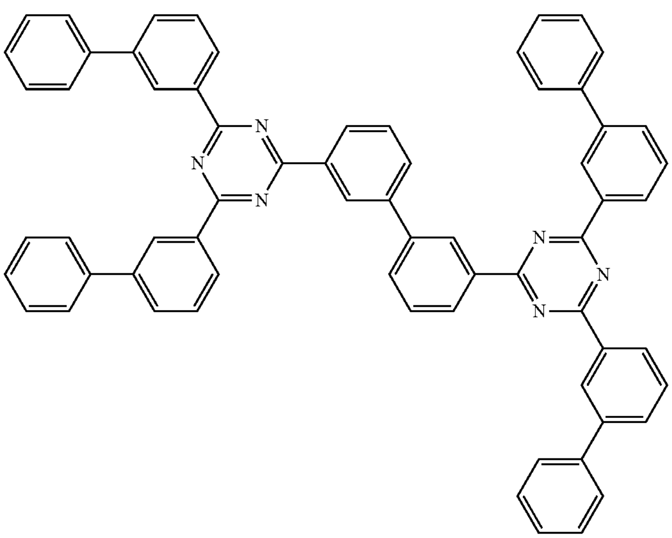

-continued
A(26)
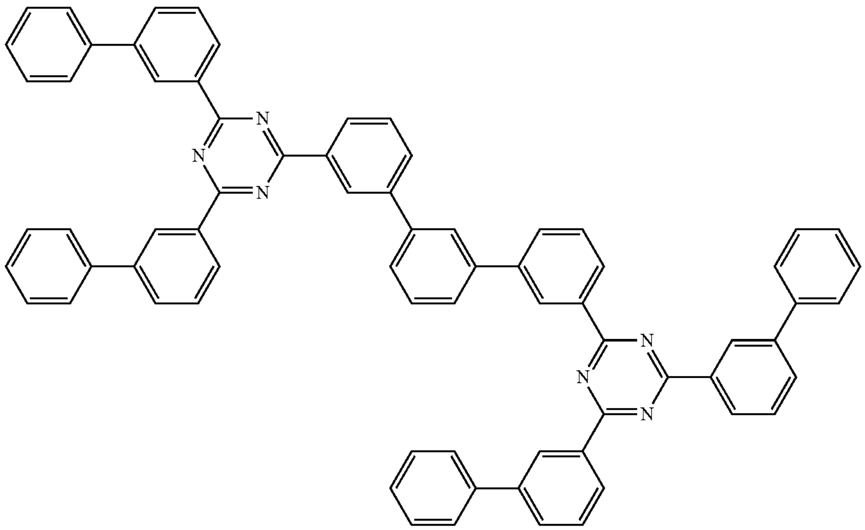
A(27)
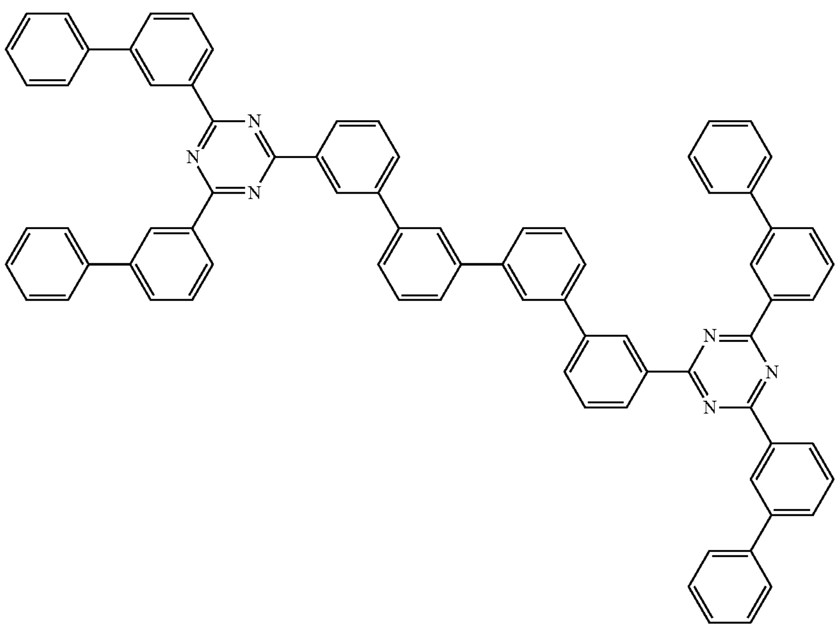
A(28)
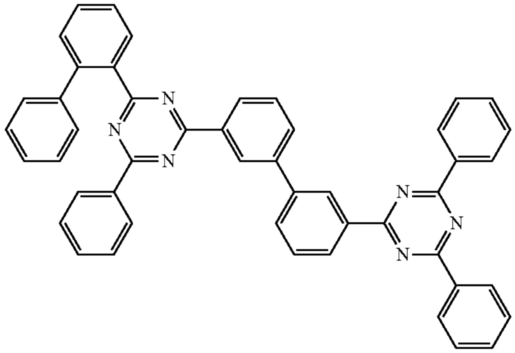

-continued
A(29)
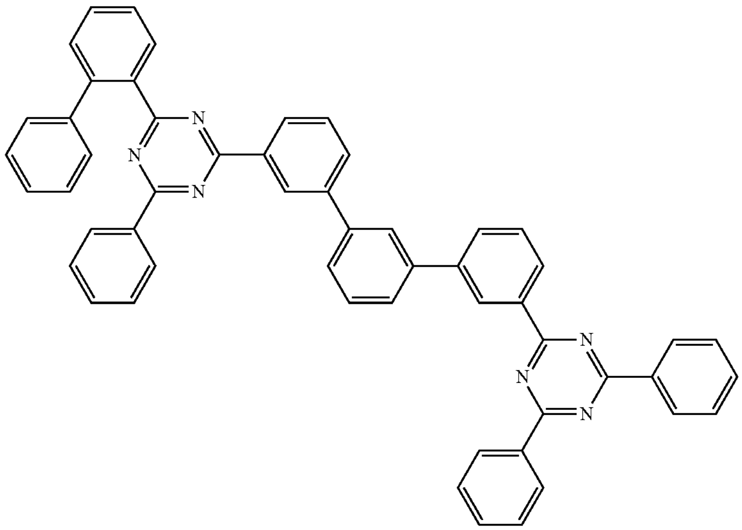
A(30)
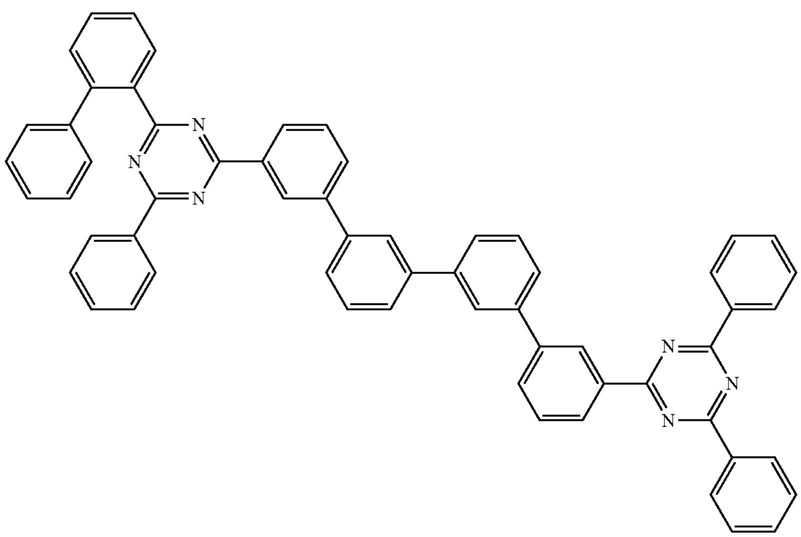
A(31)
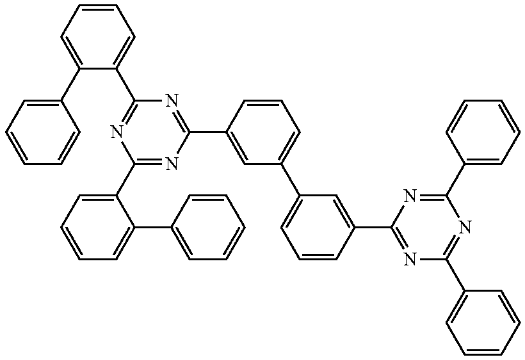

-continued
A(32)
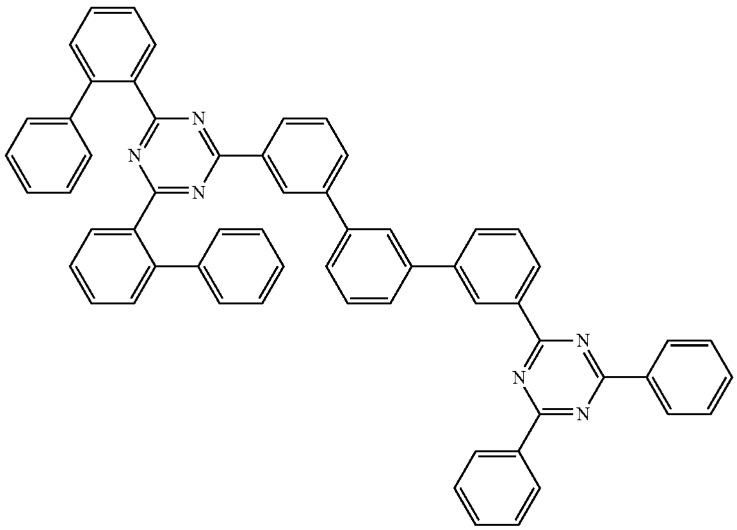
A(33)
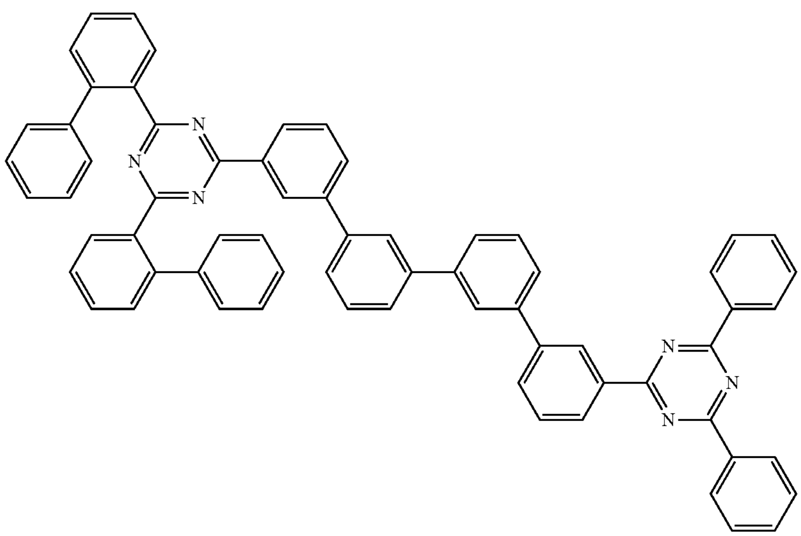
A(34)
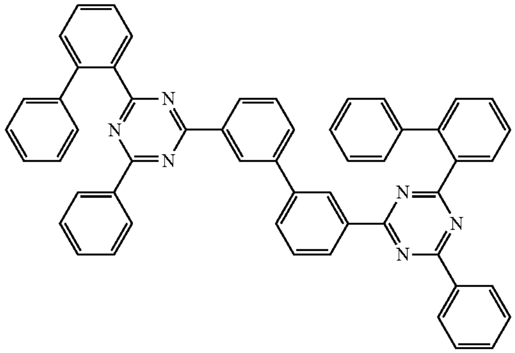

-continued
A(35)
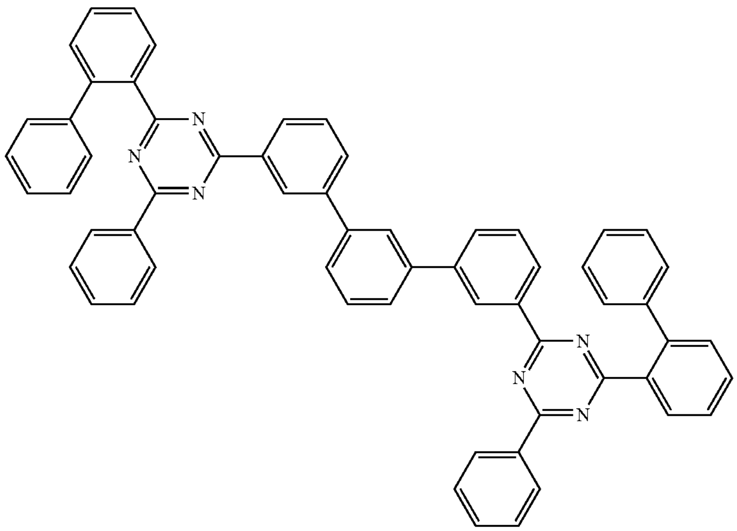
A(36)
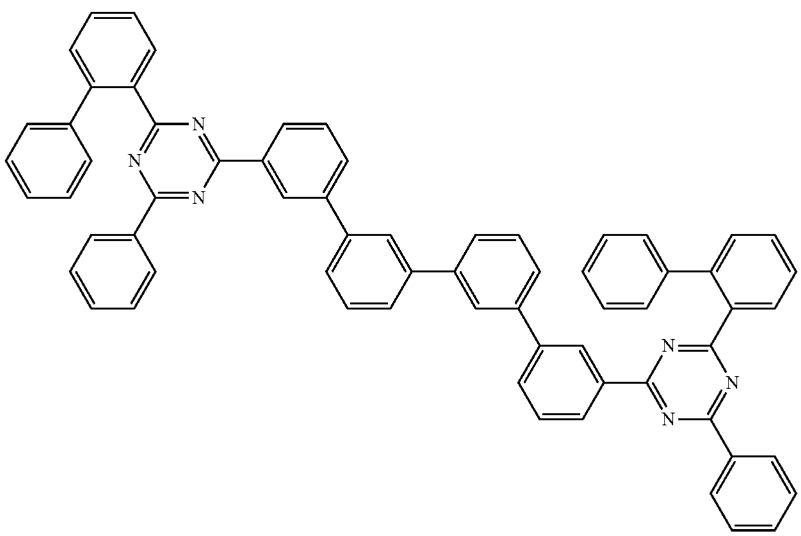
A(37)
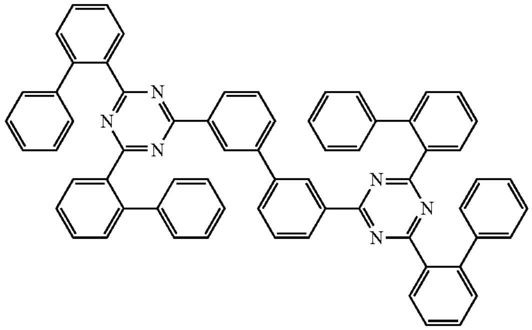

-continued
A(38)
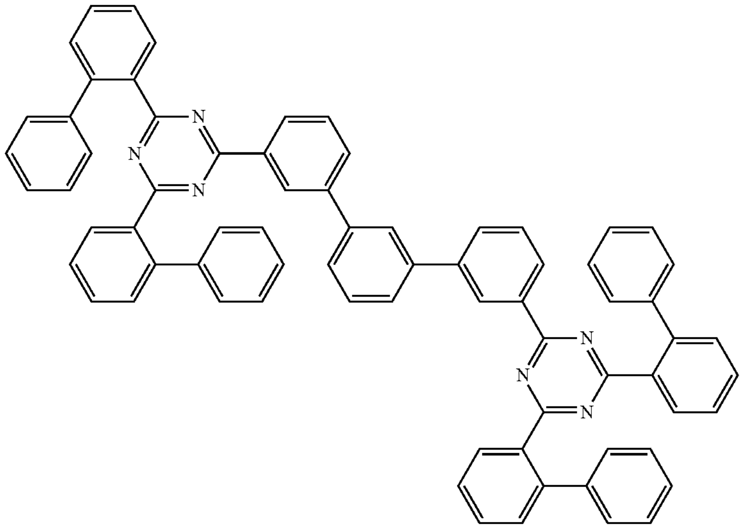
A(39)
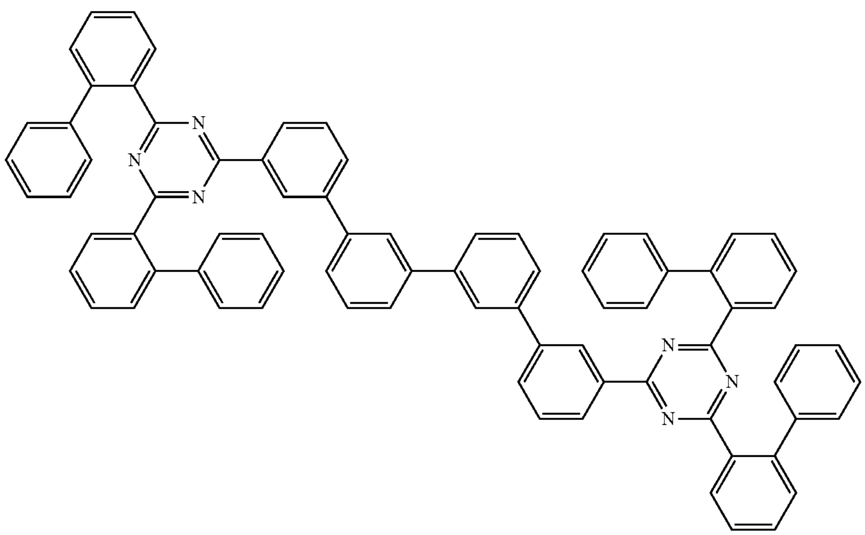
A(40)
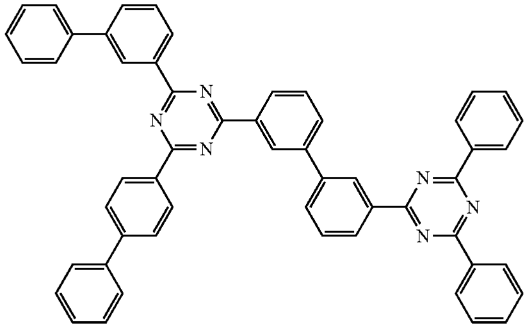

-continued
A(41)
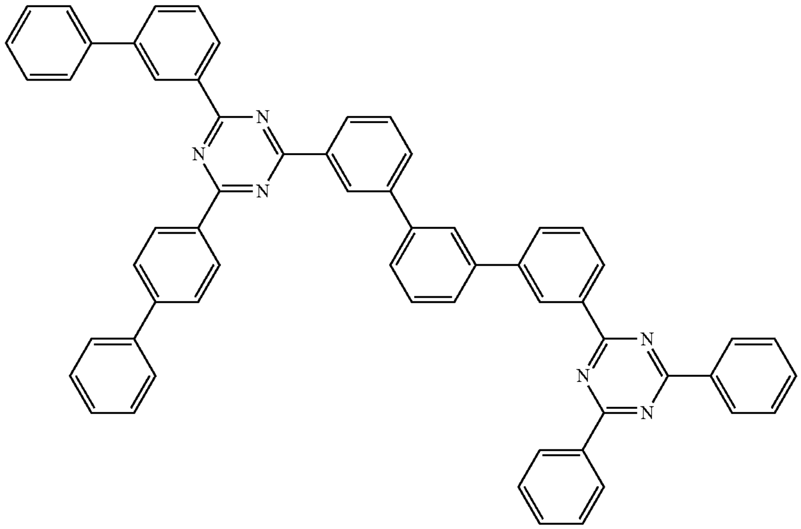
A(42)
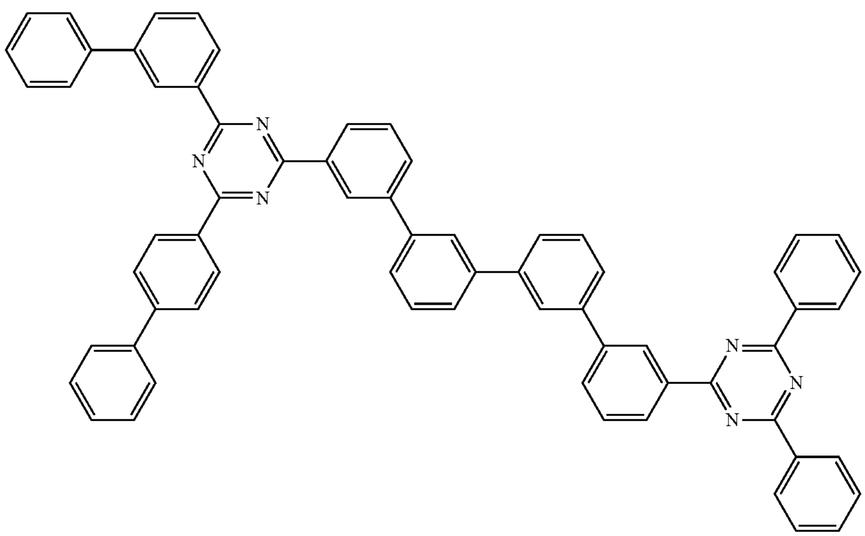
A(43)
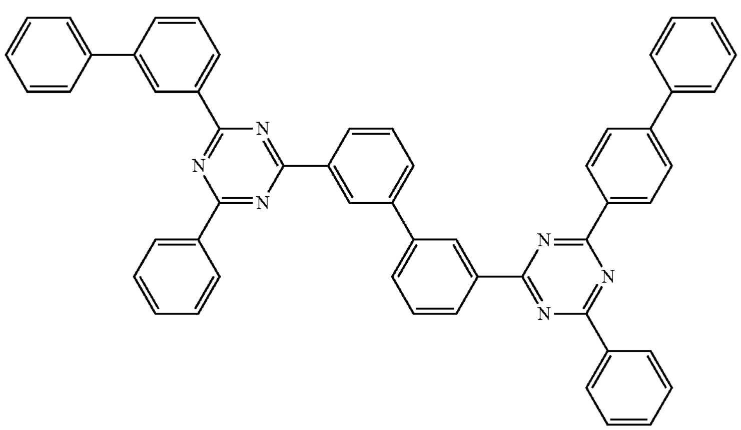

-continued
A(44)
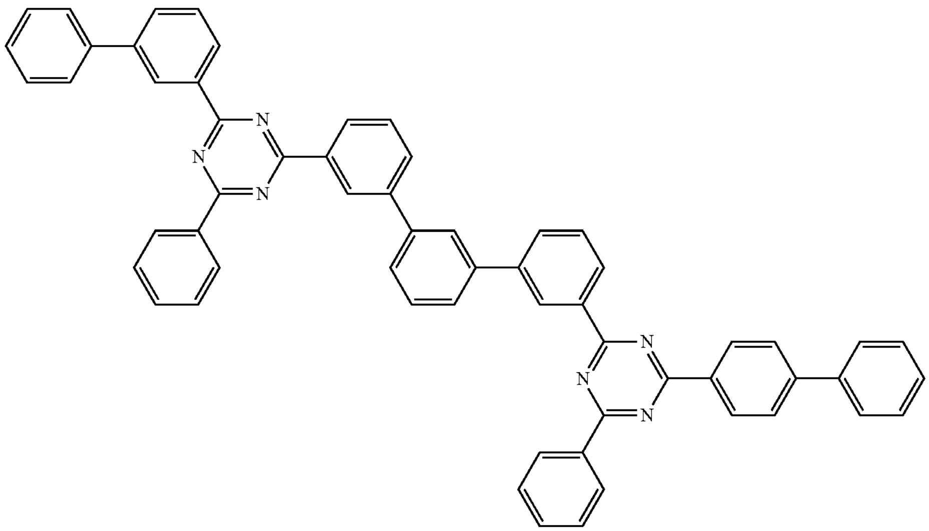
A(45)
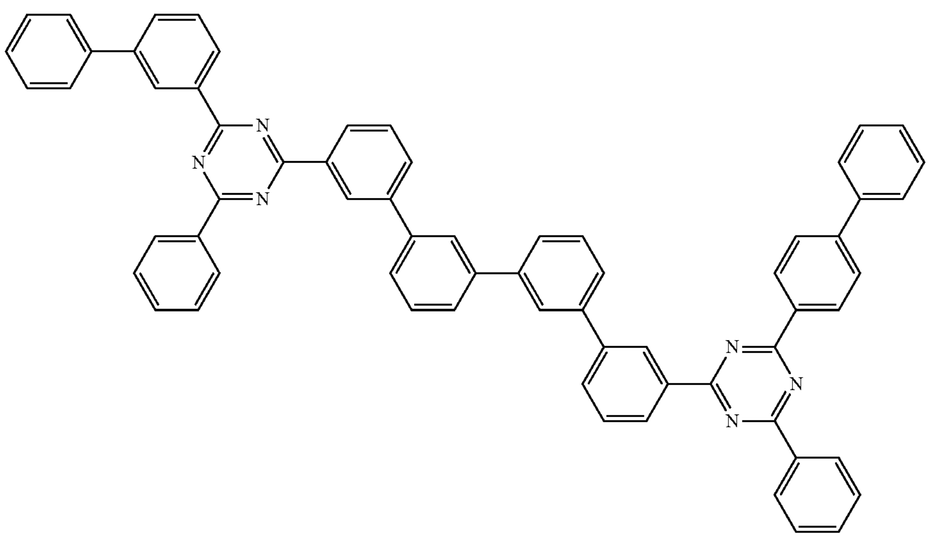
A(46)
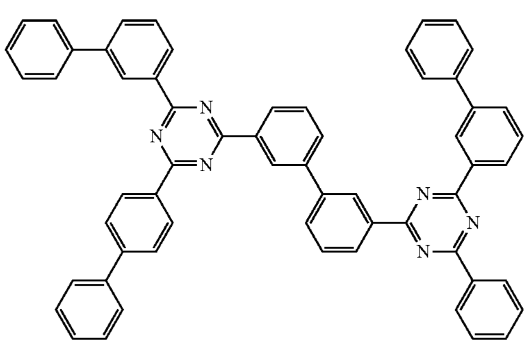

-continued
A(47)
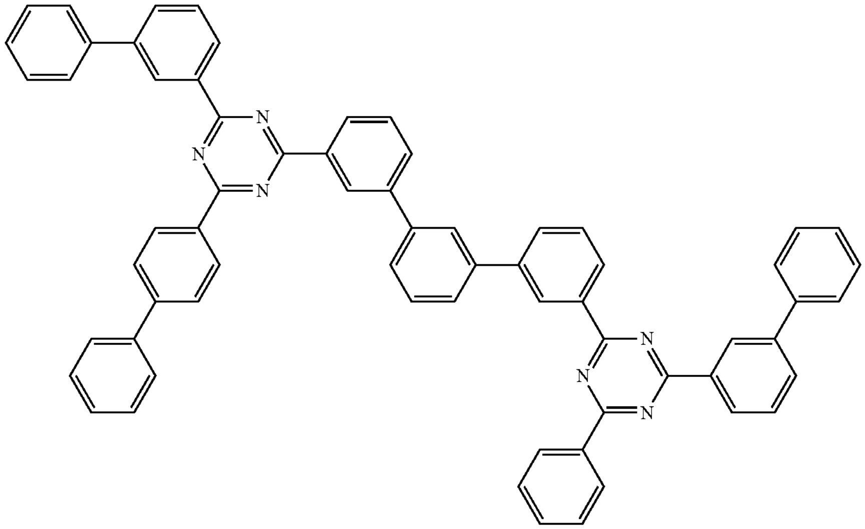
A(48)
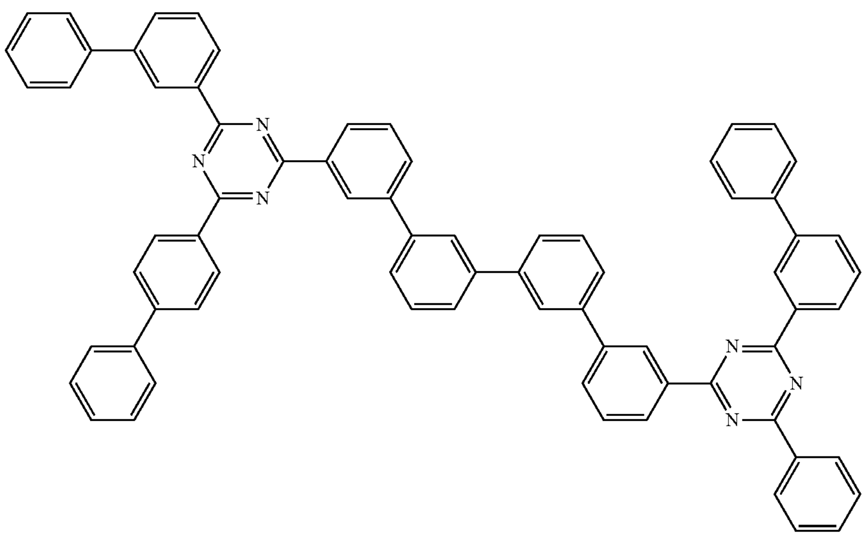
A(49)
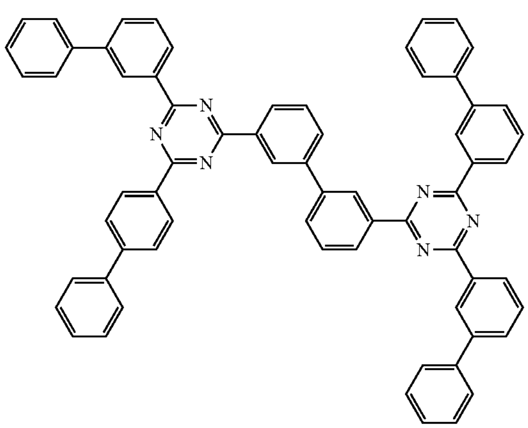

-continued
A(50)
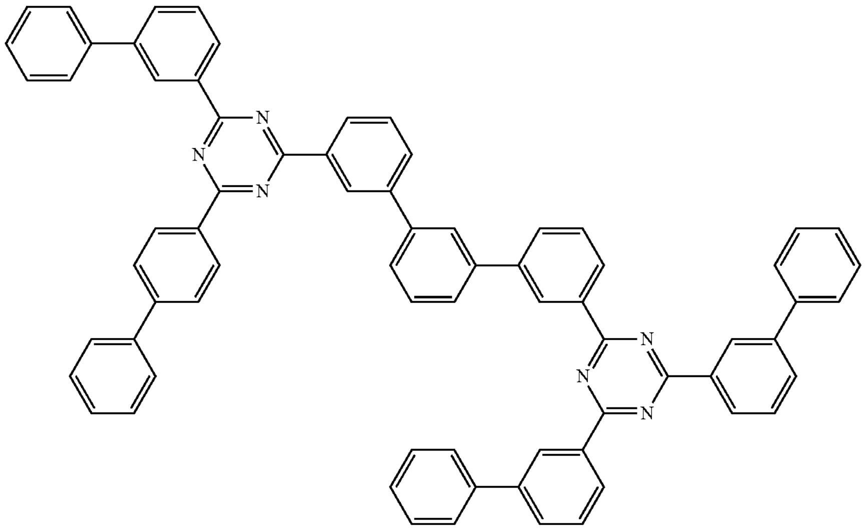
A(51)
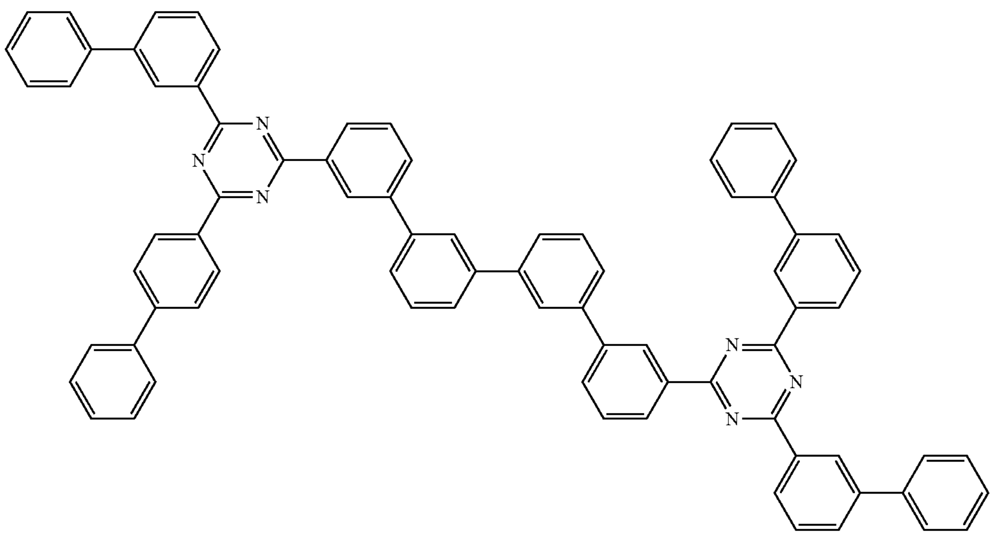
A(52)
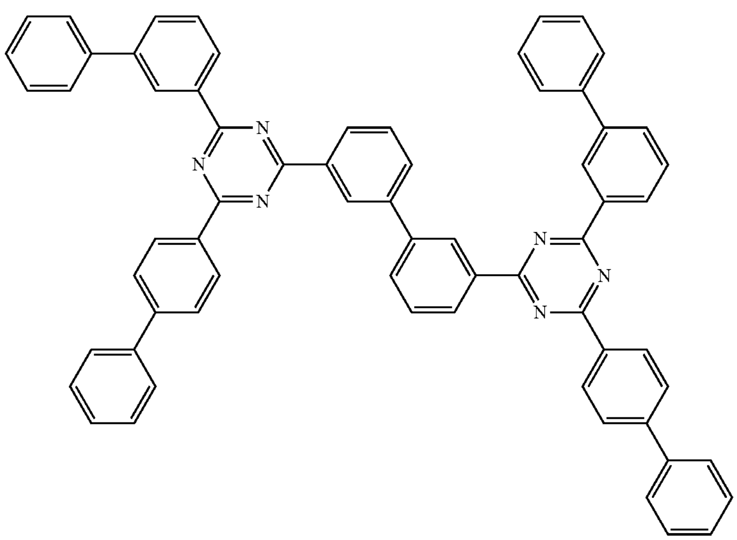

-continued
A(53)
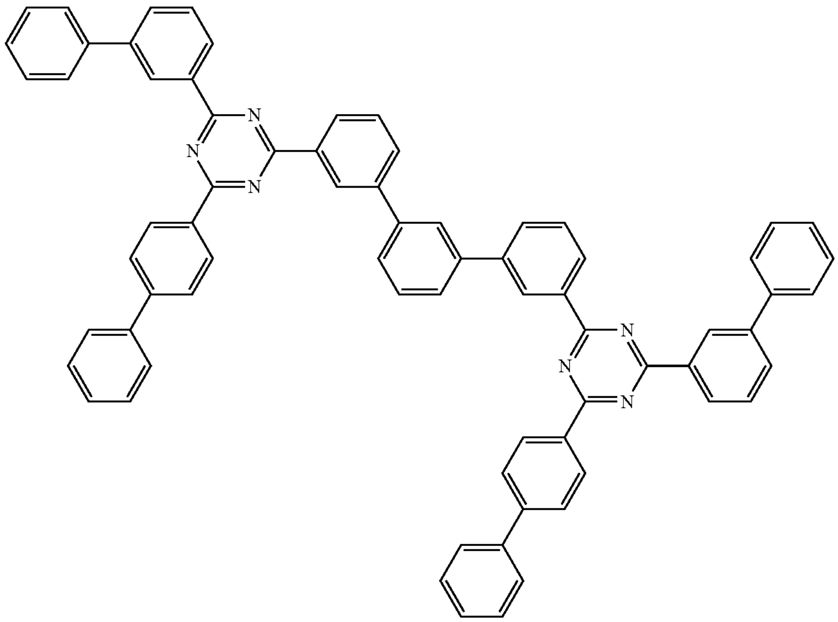
A(54)
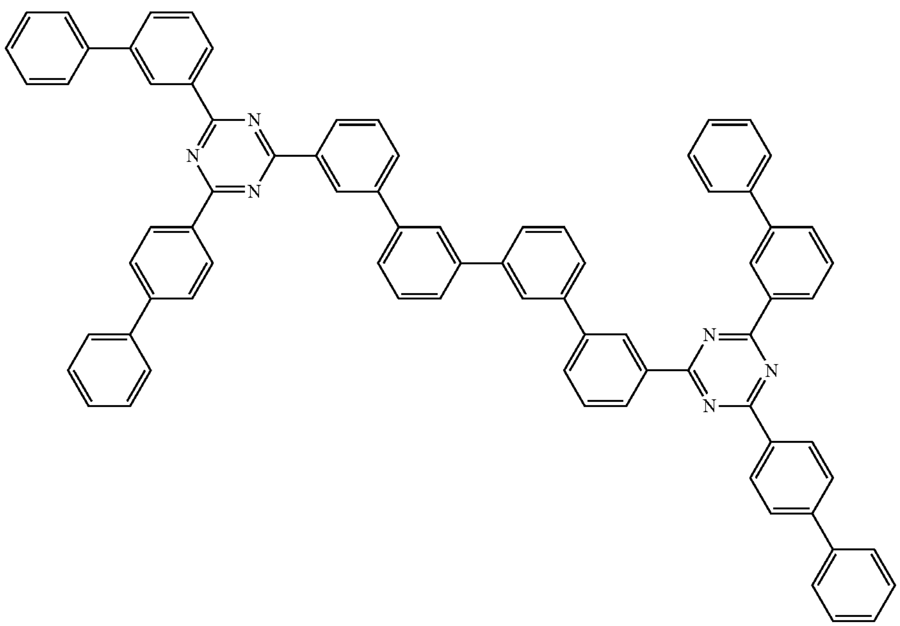
A(55)
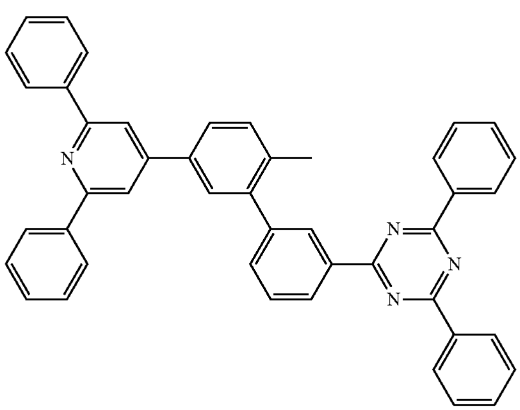
A(56)
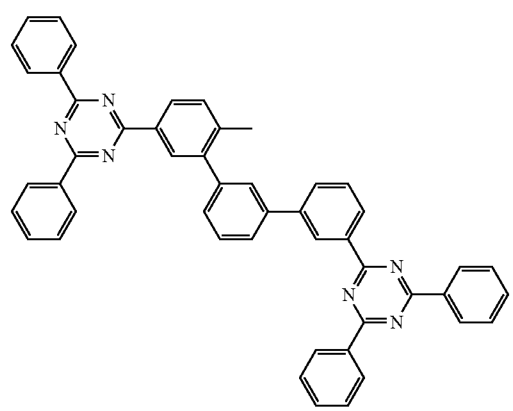

-continued
A(57)
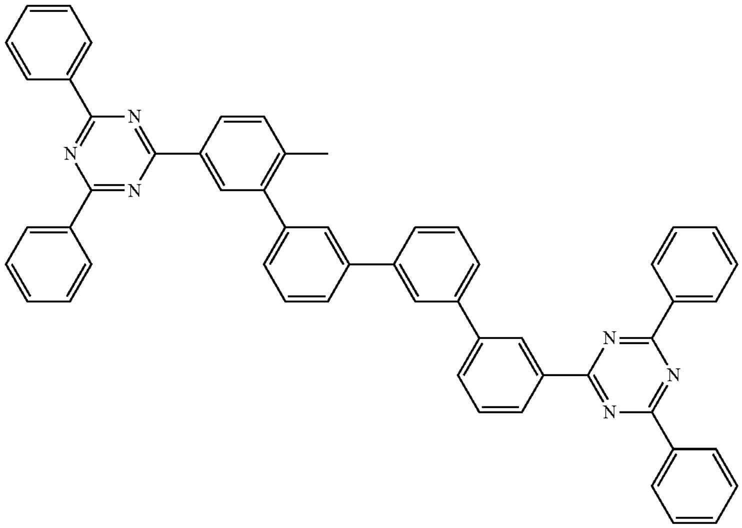
A(58)
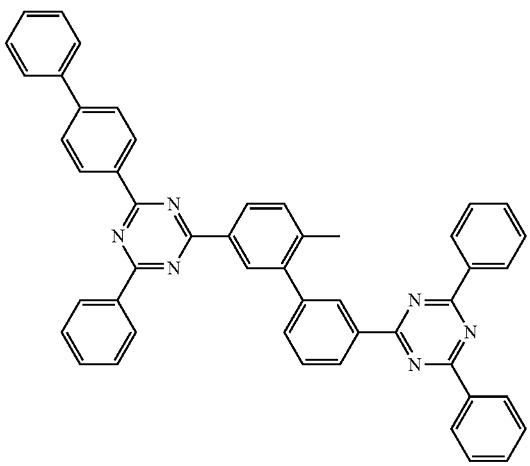
A(59)
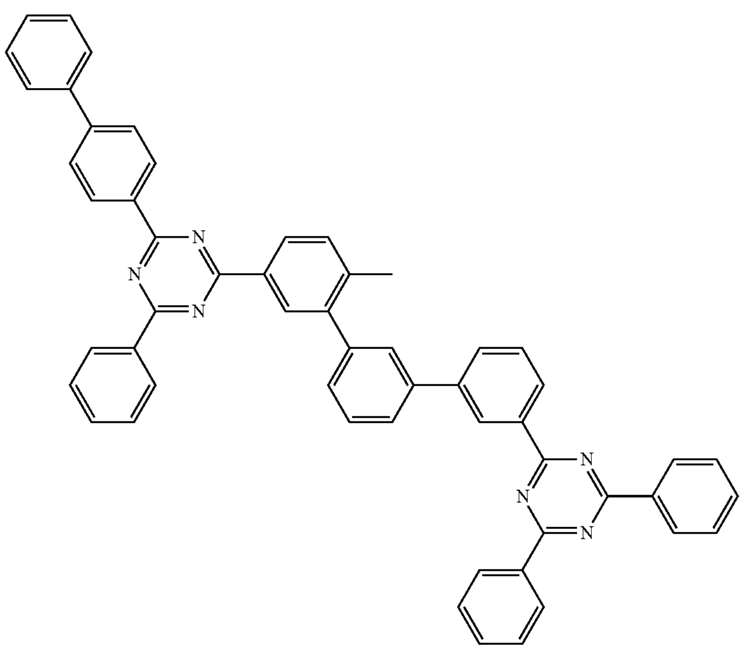

-continued
A(60)
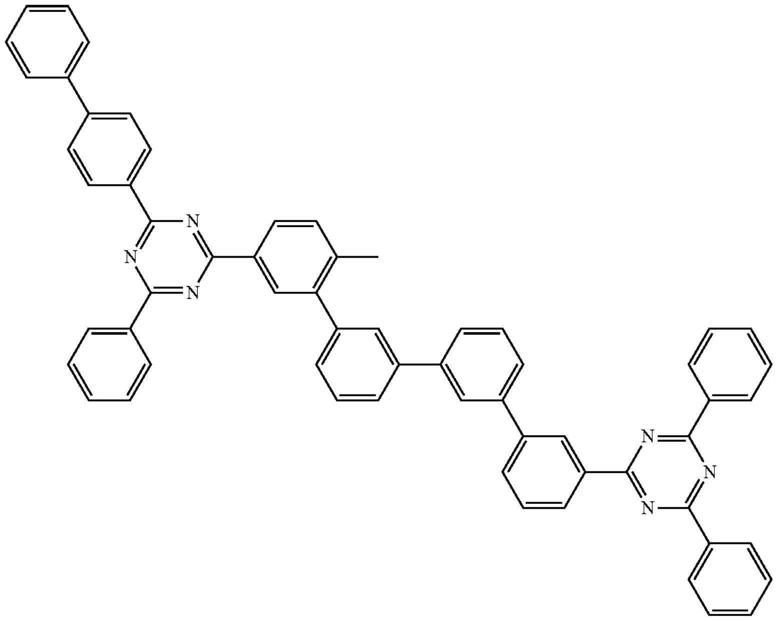
A(61)
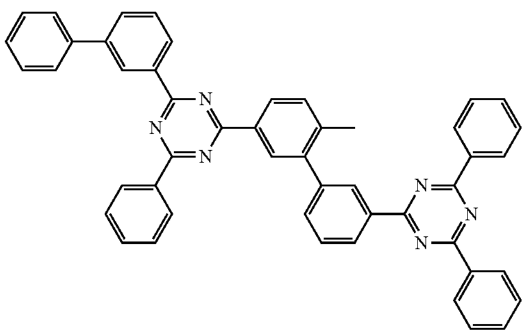
A(62)
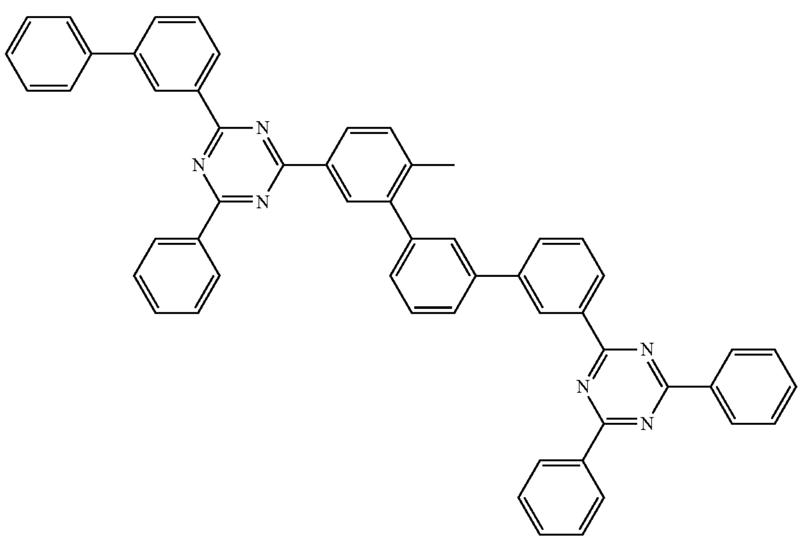

-continued
A(63)
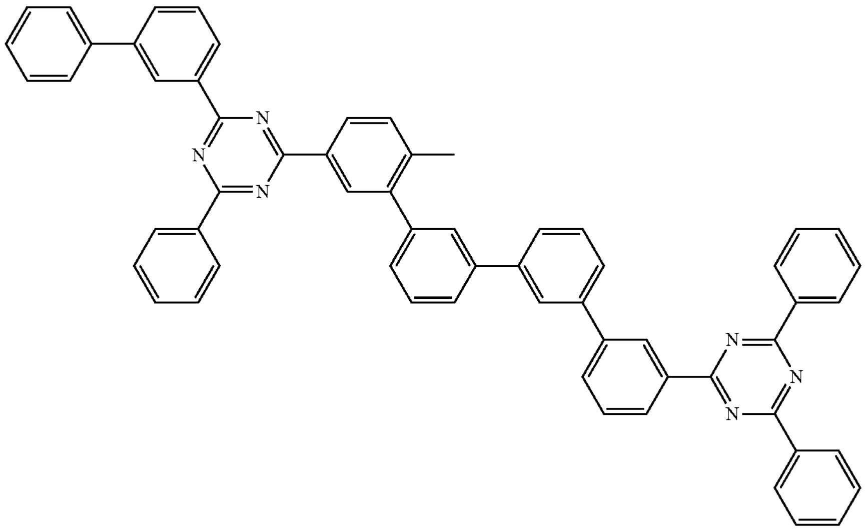
A(64)
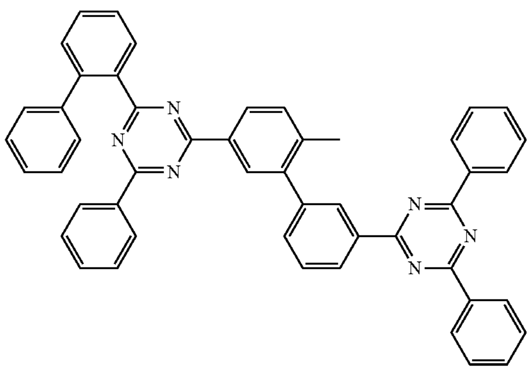
A(65)
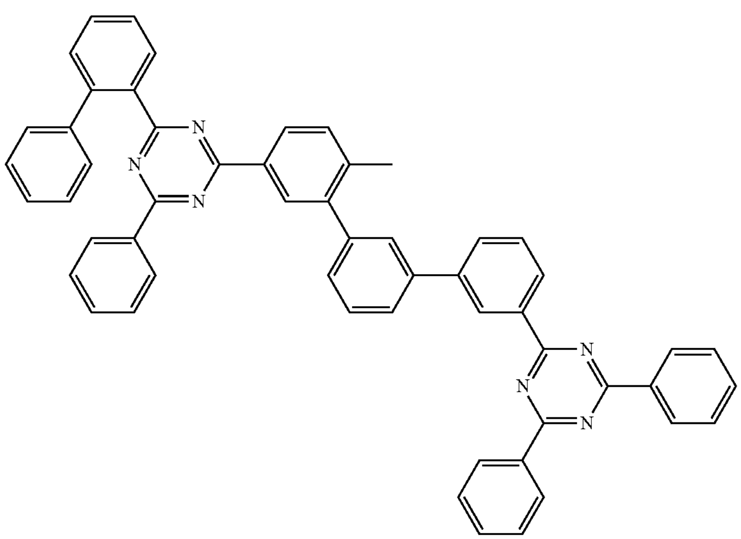

-continued
A(66)
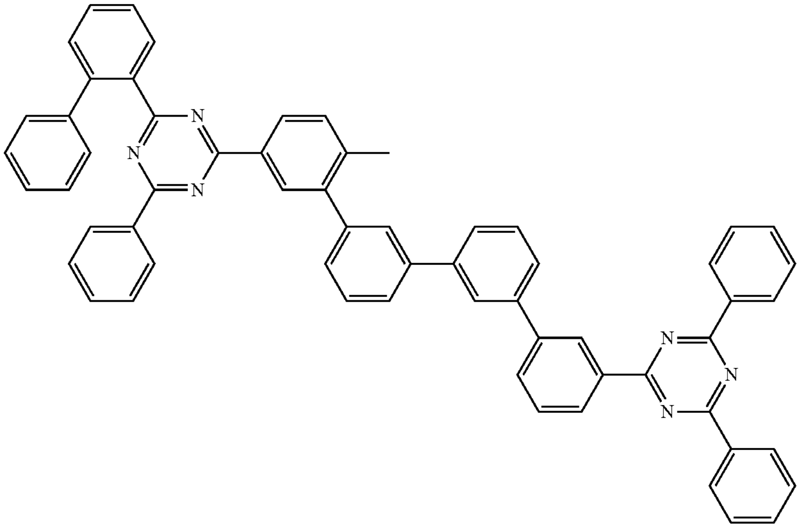
A(67)
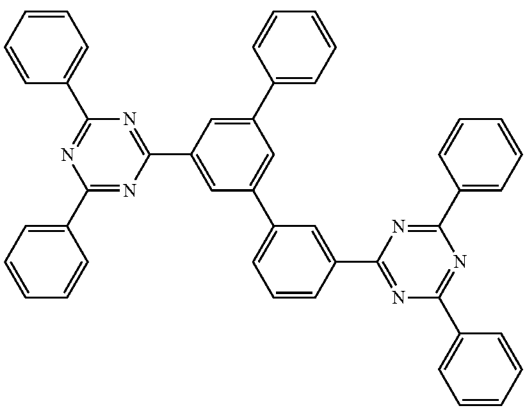
A(68)
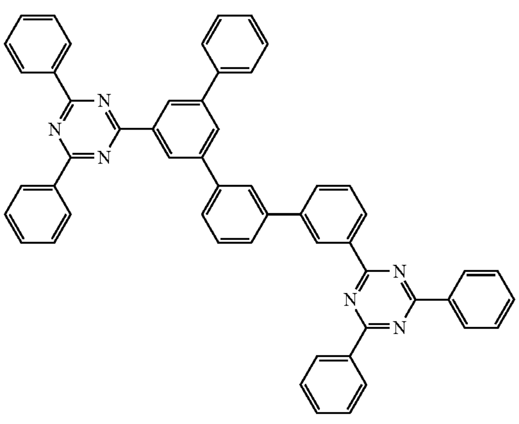

-continued
A(69)
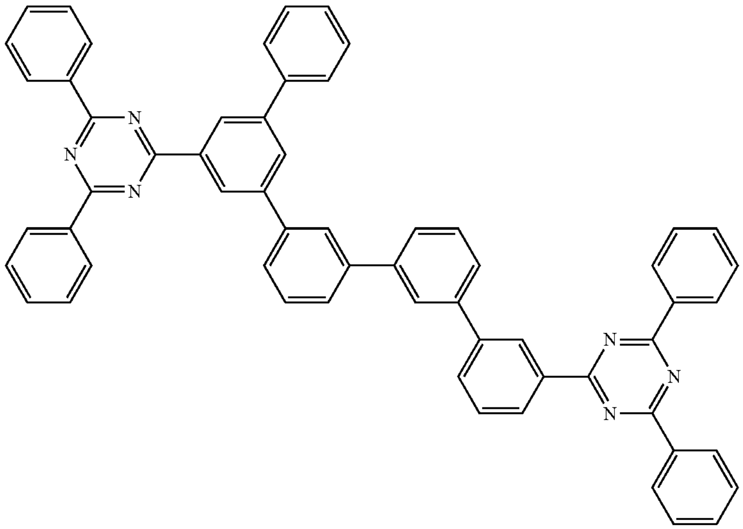
A(70)
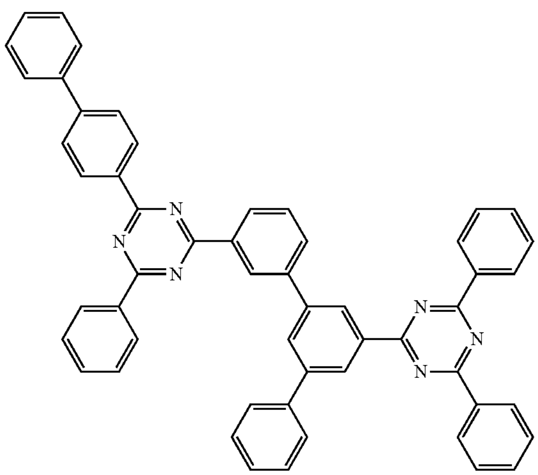
A(71)
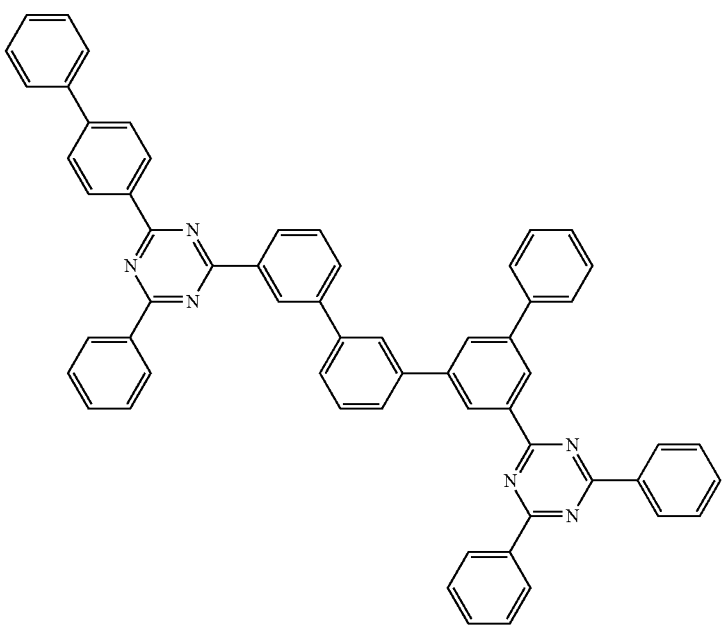

-continued
A(72)
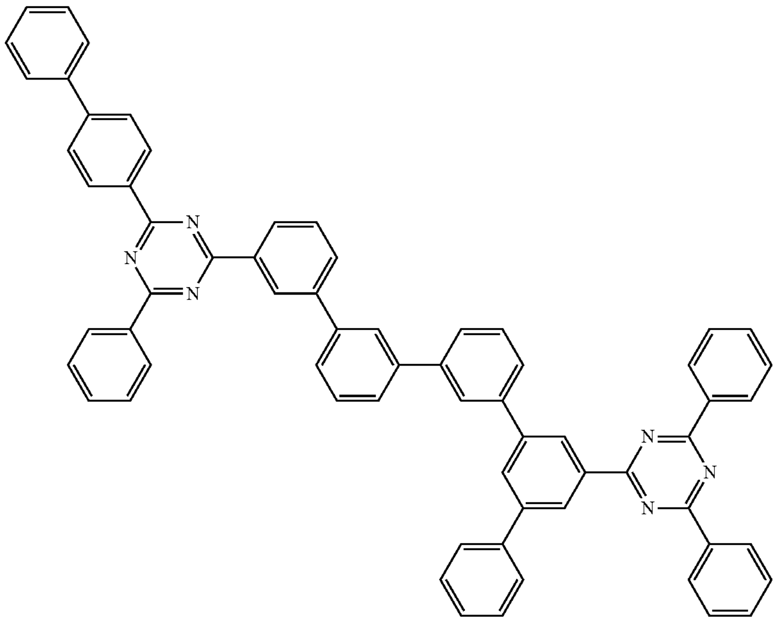
A(73)
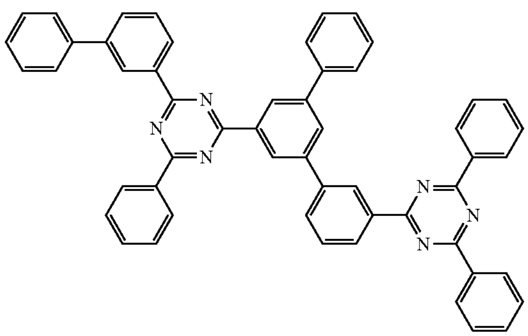
A(74)
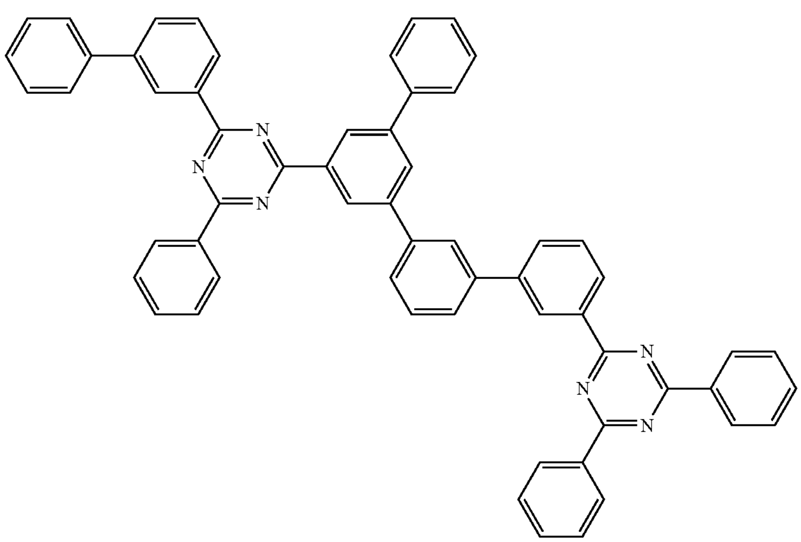

-continued
A(75)
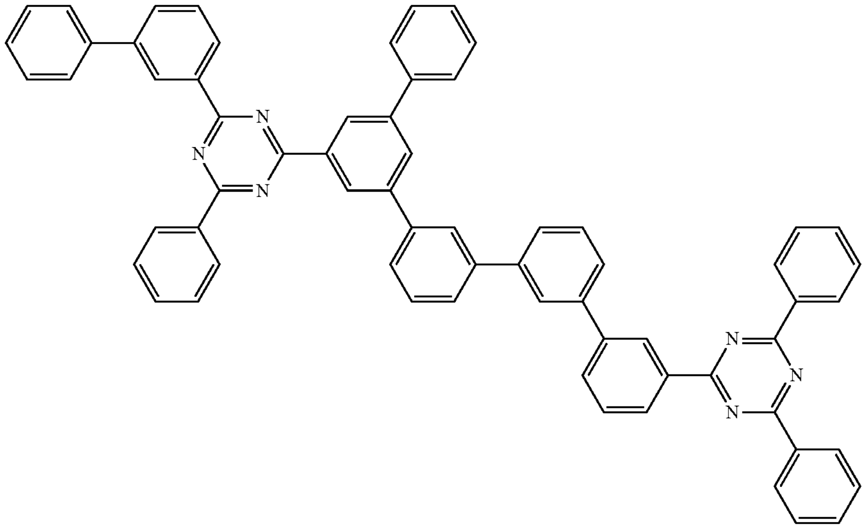
A(76)
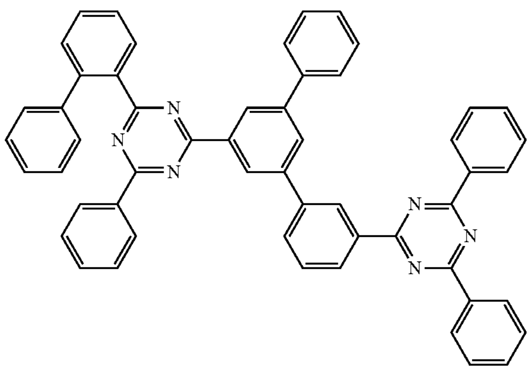
A(77)
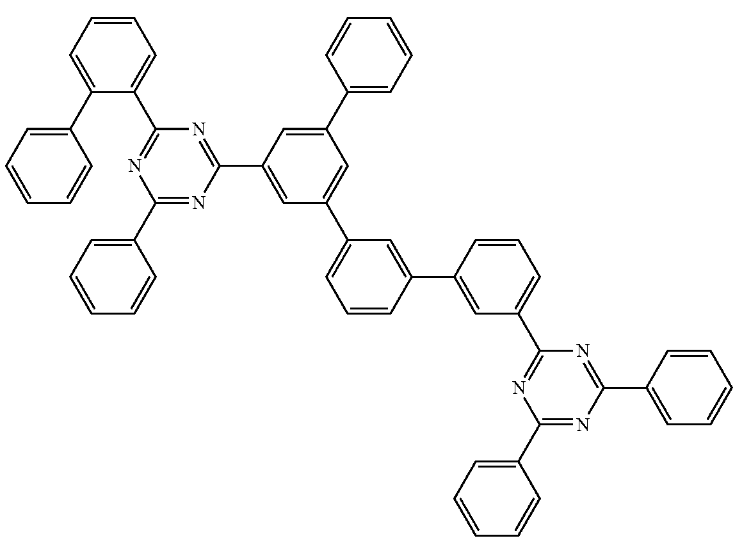

-continued
A(78)
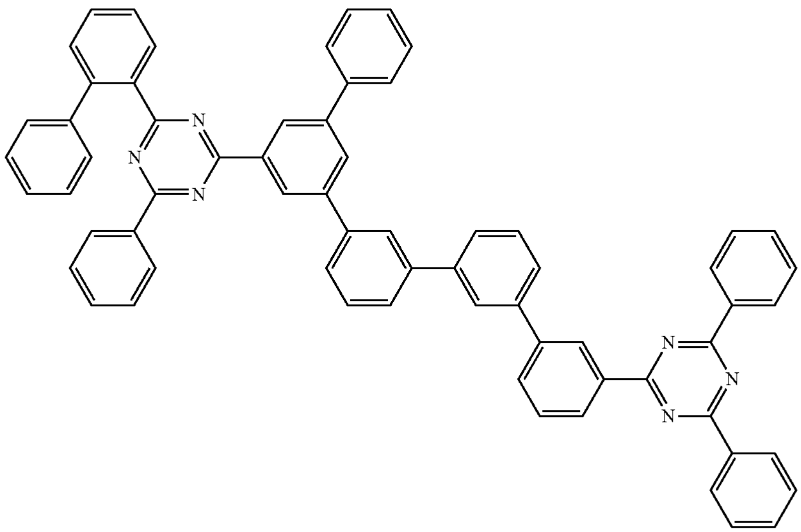
A(79)
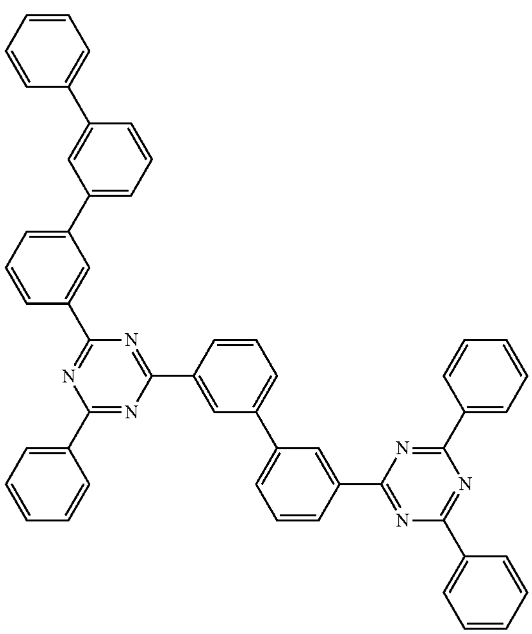
A(80)
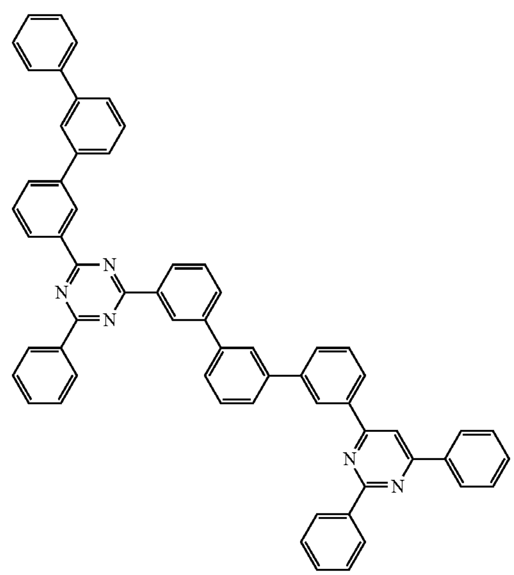

-continued
A(81)
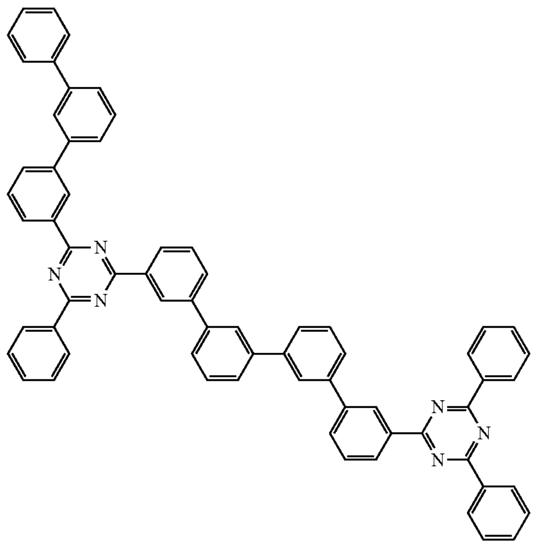
A(82)
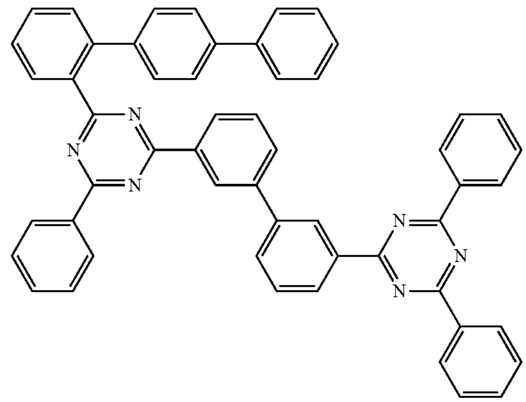
A(83)
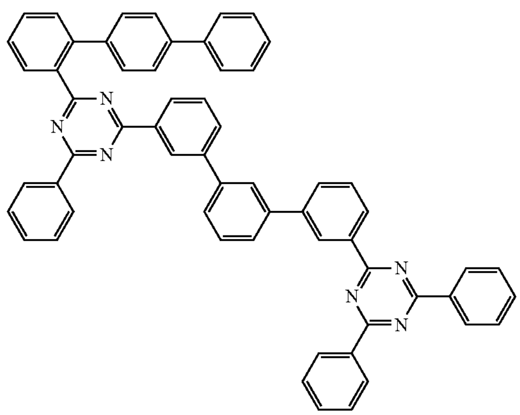
A(84)
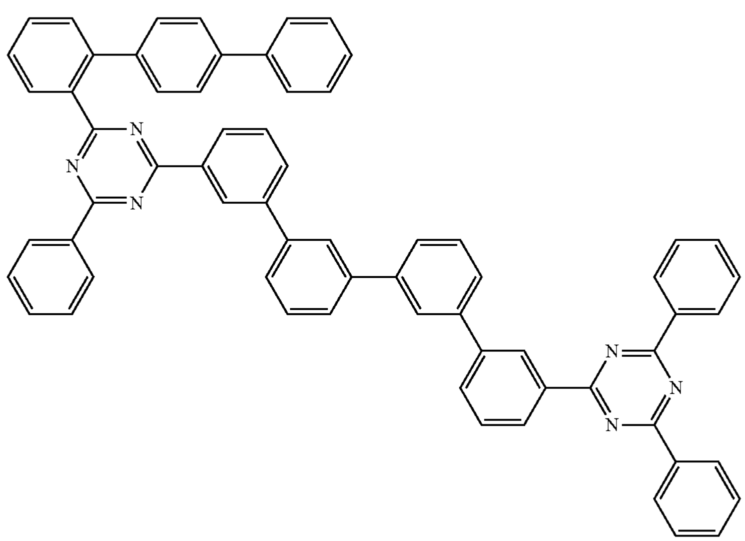

-continued
A(85)
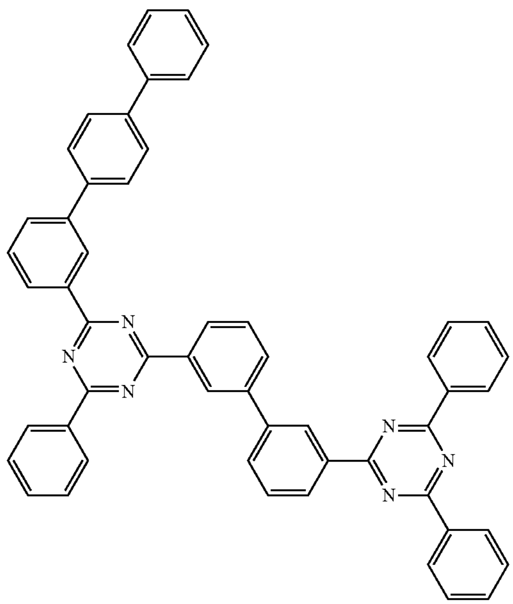
A(86)
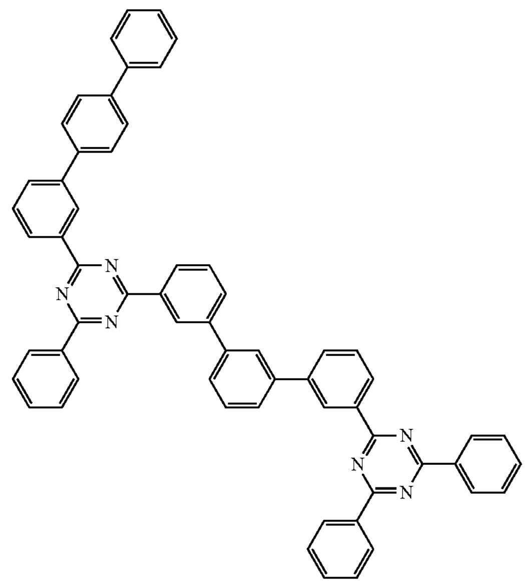
A(87)
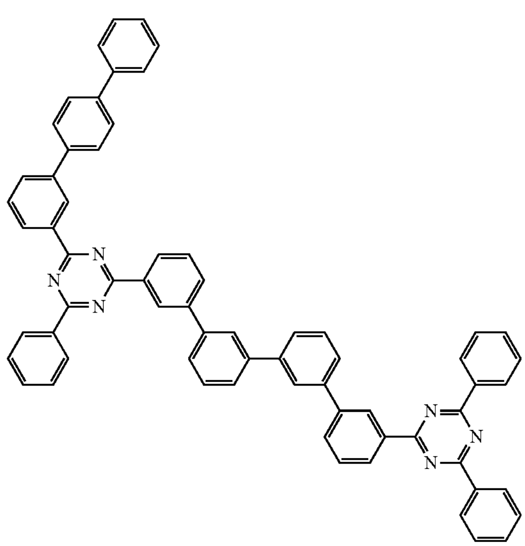
A(88)
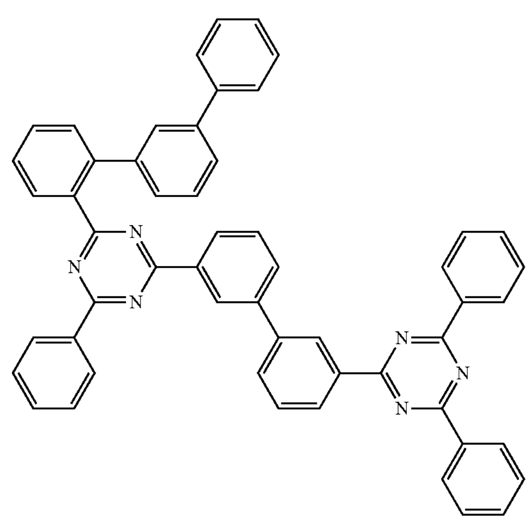

-continued
A(89)
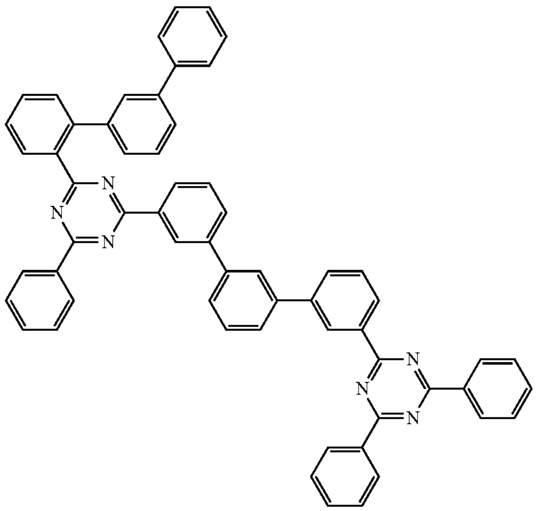
A(90)
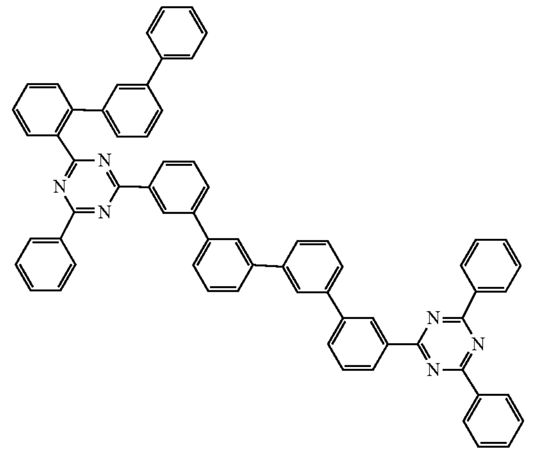
A(91)
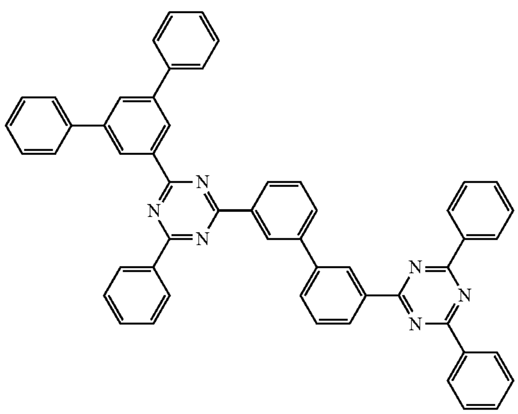
A(92)
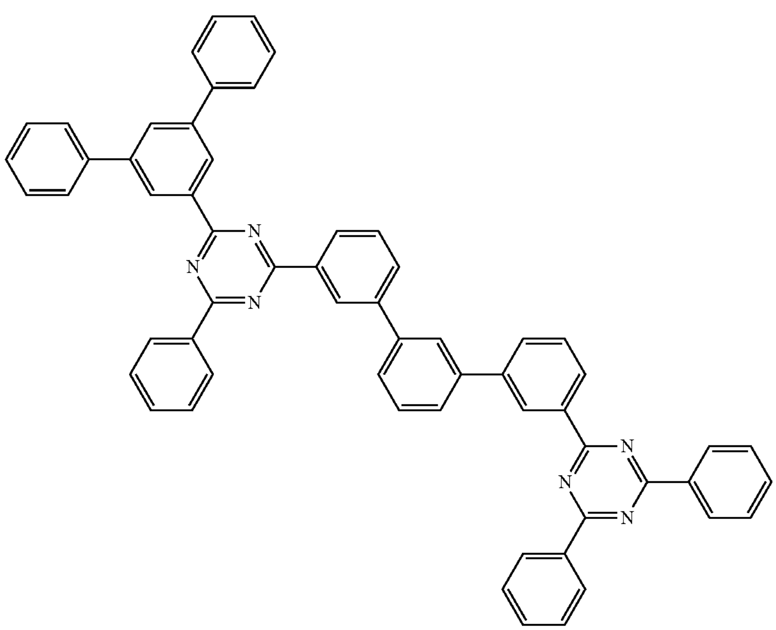

-continued
A(93)
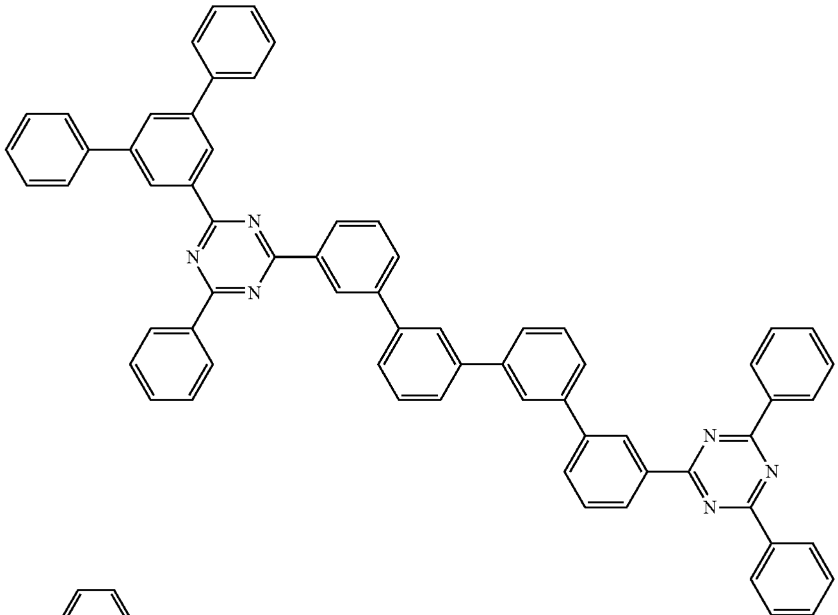
A(94)
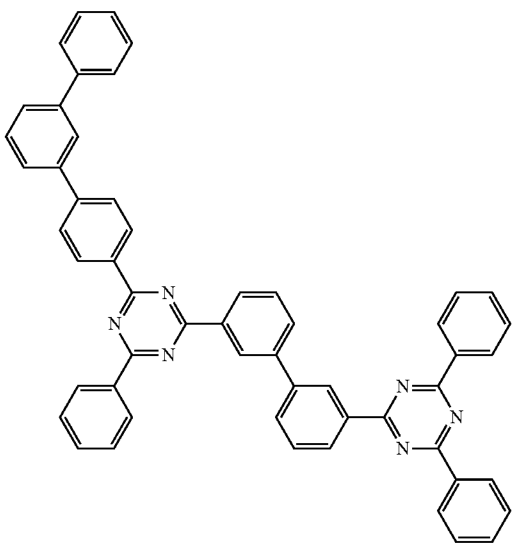
A(95)
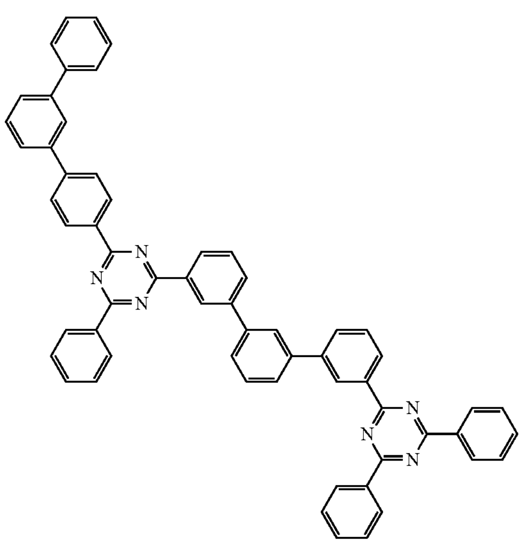
A(96)
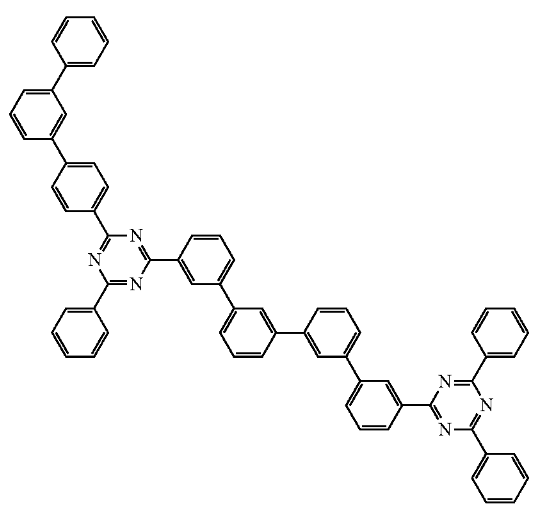

-continued
A(97)
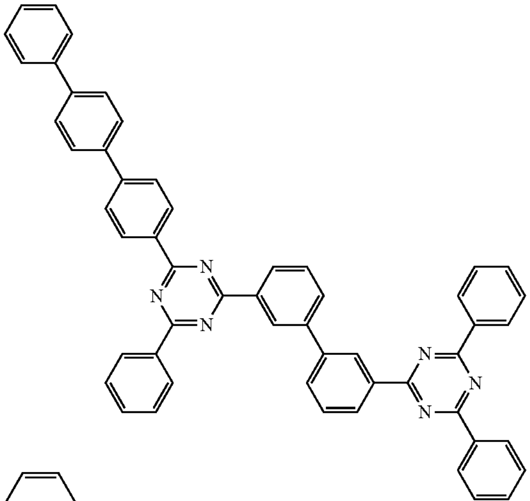
A(98)
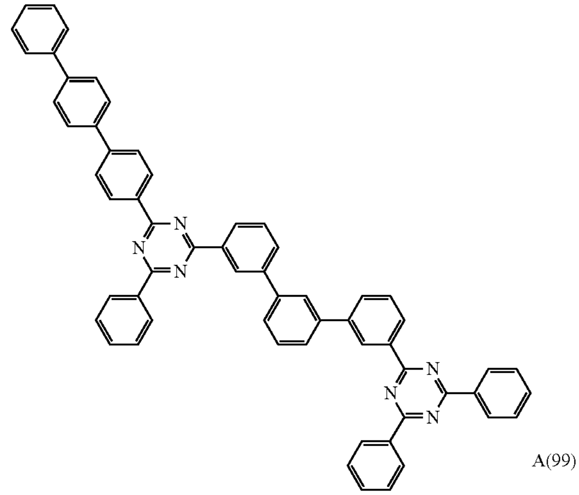
A(99)
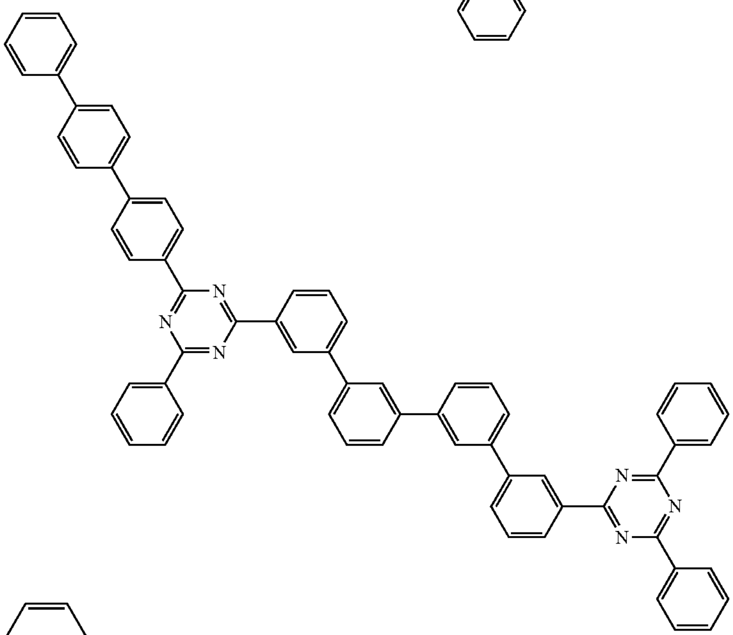
A(100)
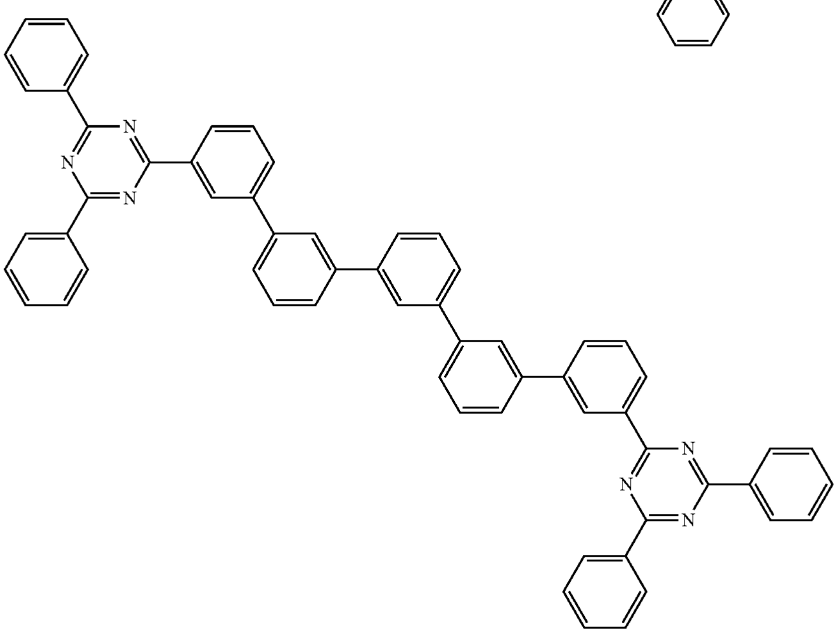

-continued
A(101)
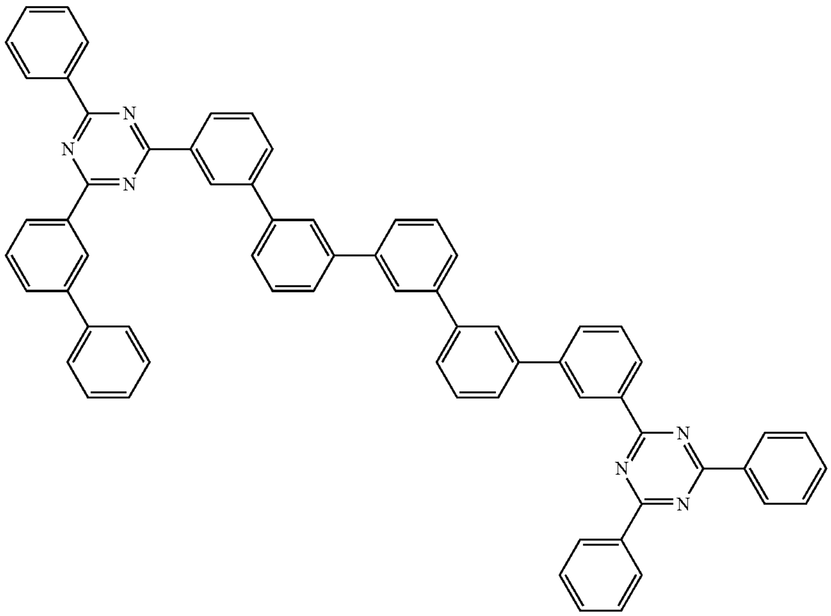
A(102)
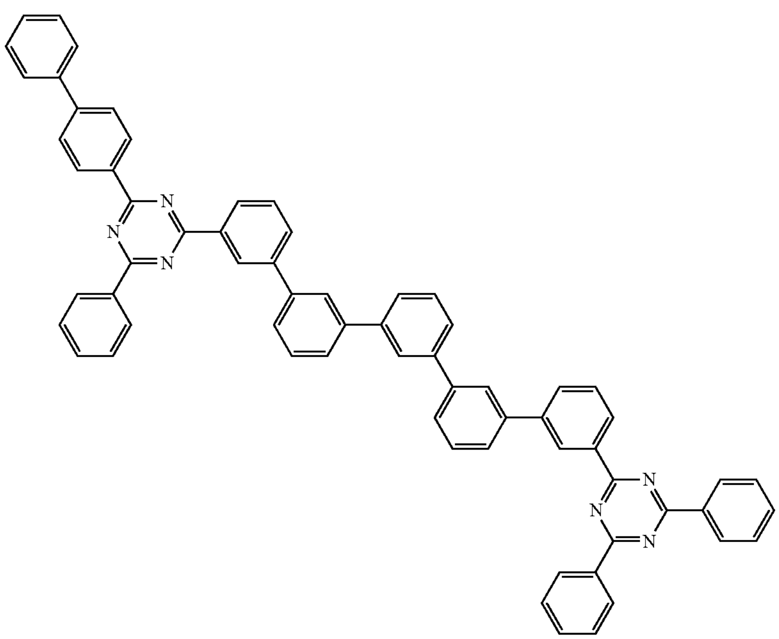

-continued
A(103)
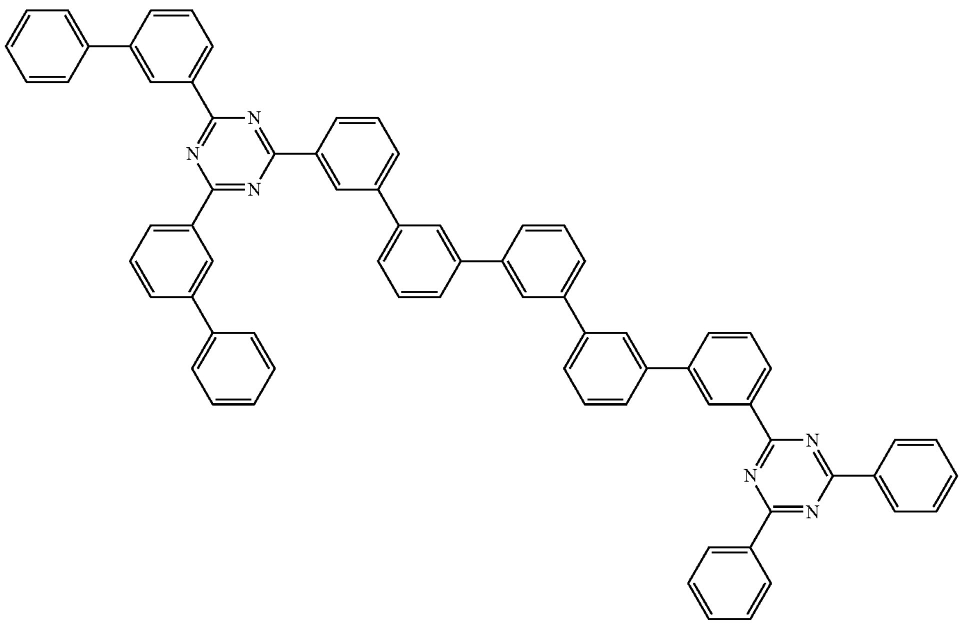
A(104)
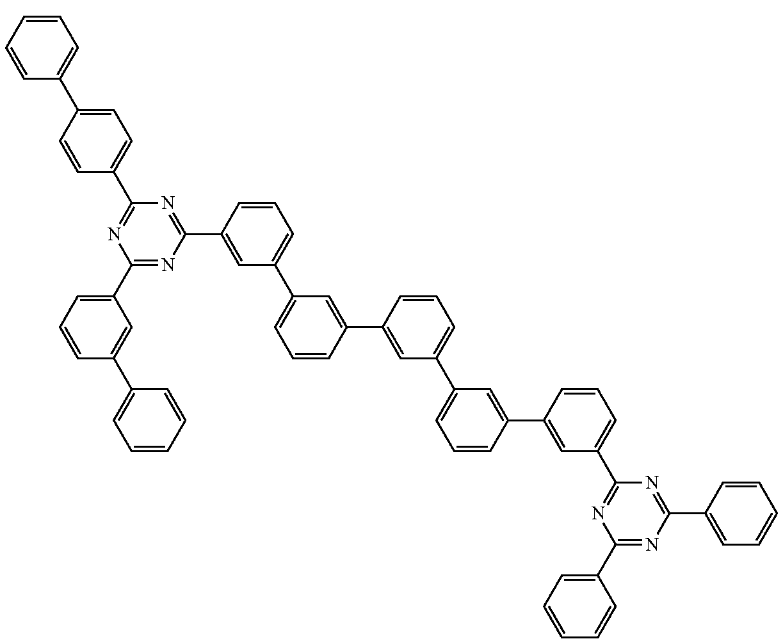

-continued
A(105)
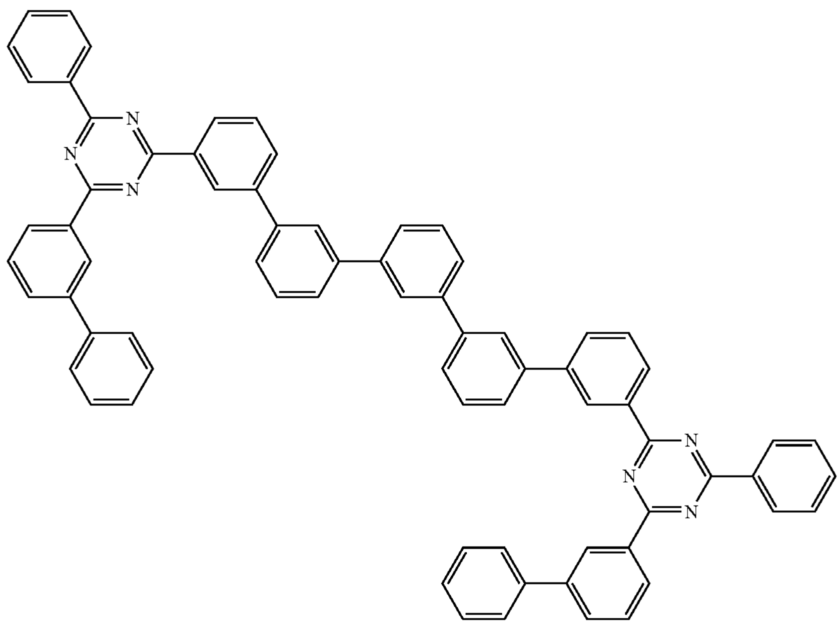
A(106)
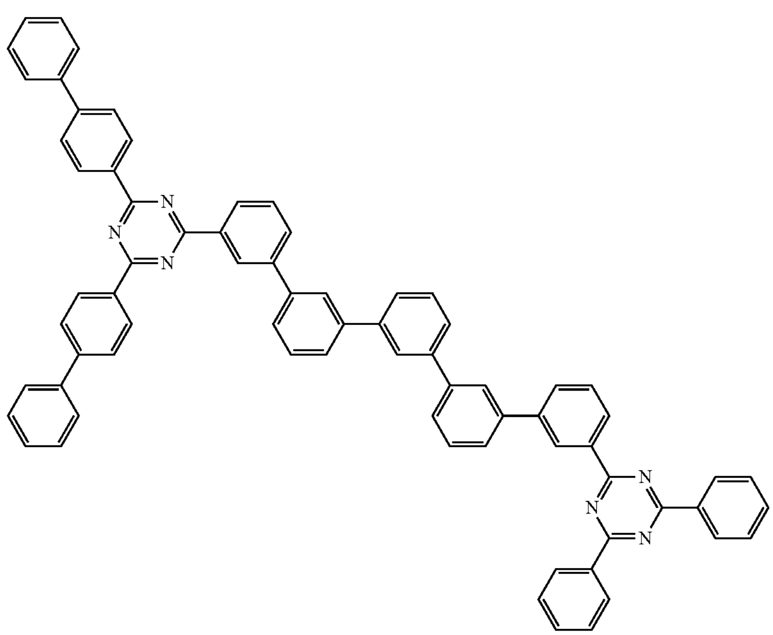

-continued
A(107)
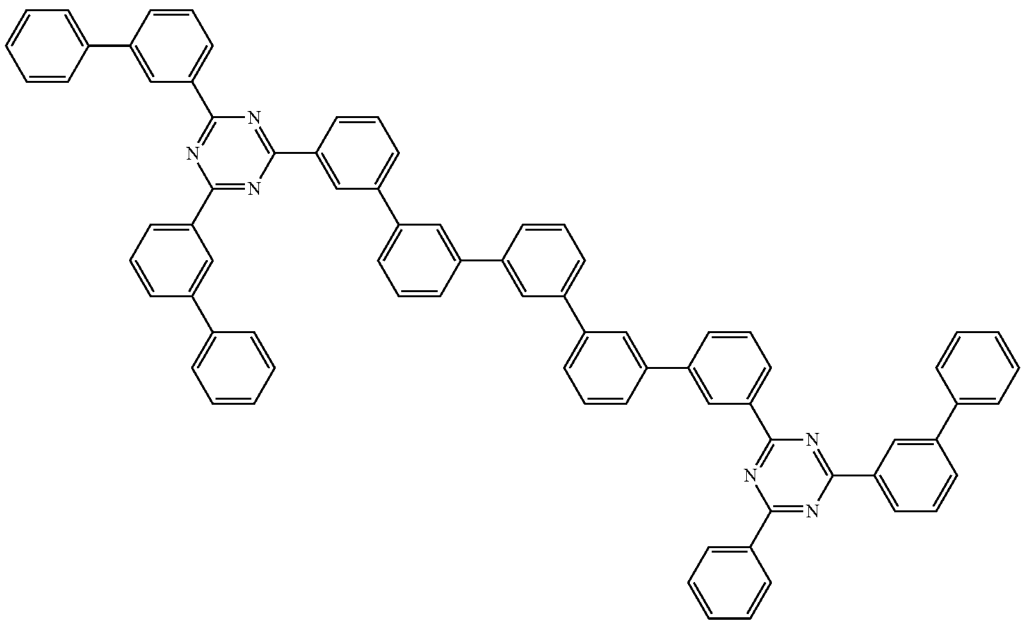
A(108)
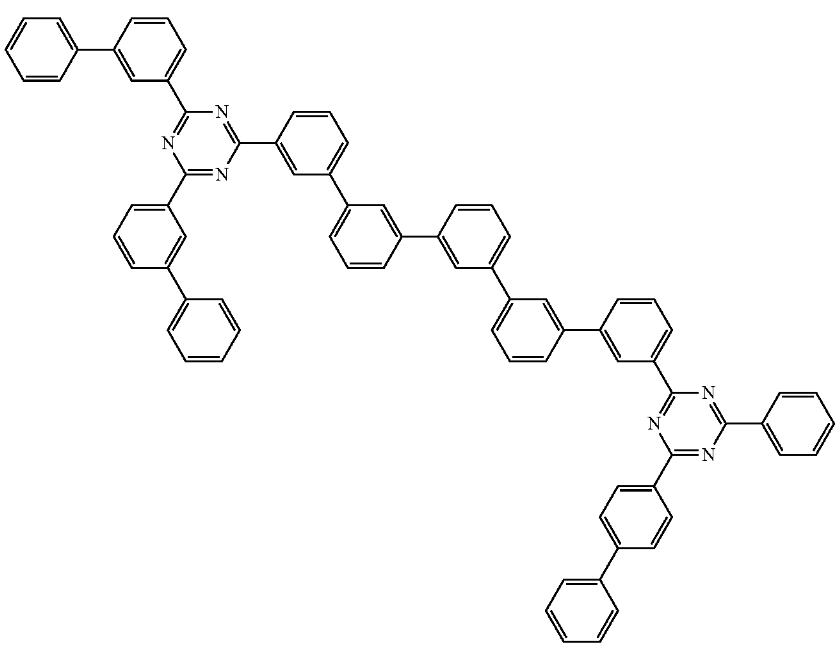

-continued
A(109)
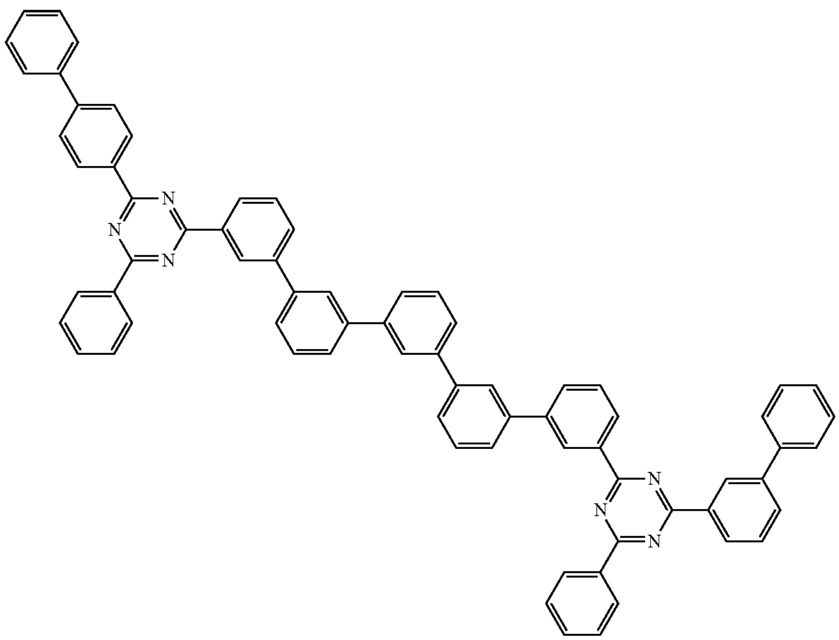
A(110)
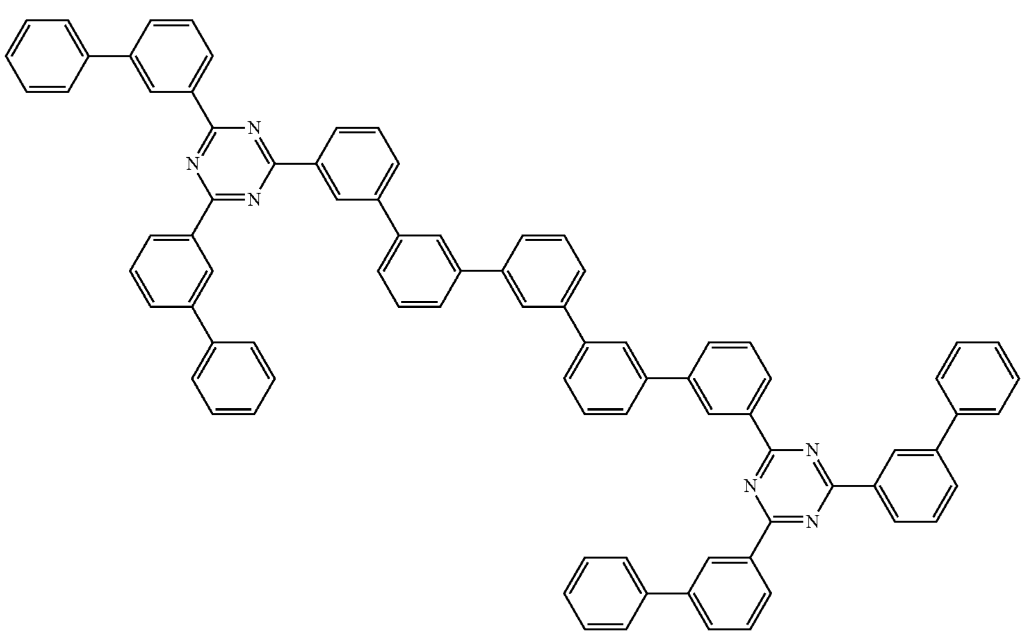

-continued
A(111)
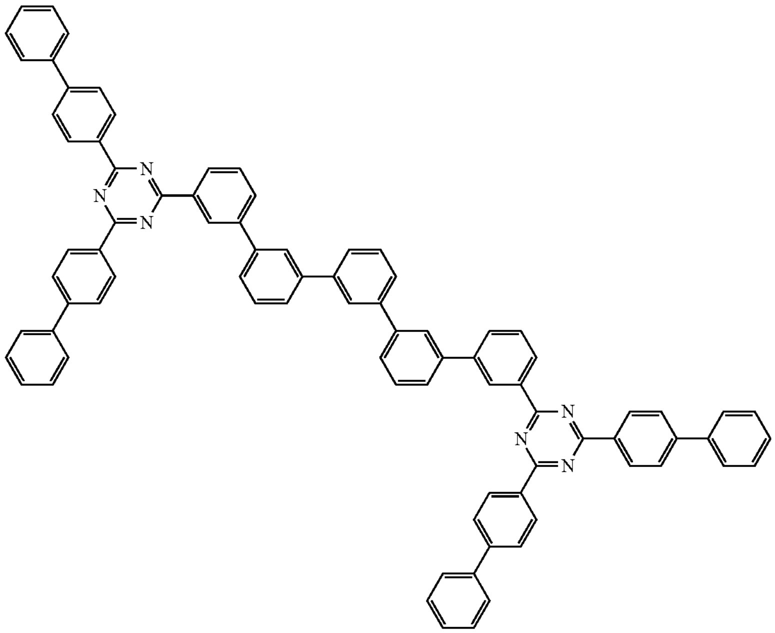
A(112)
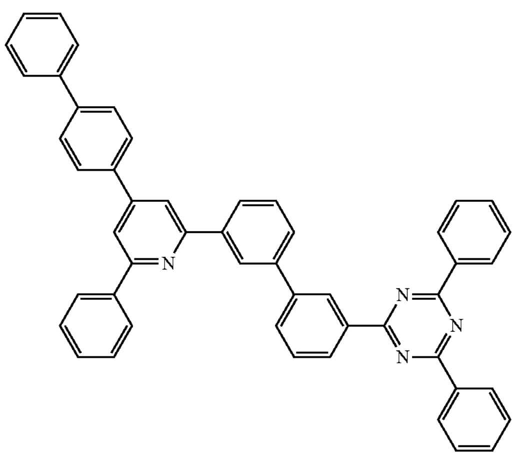
A(113)
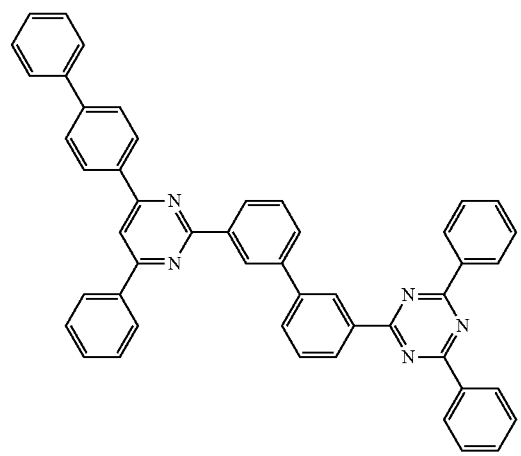
A(114)
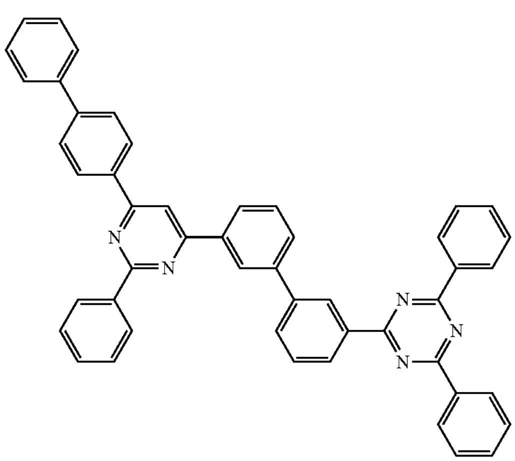
A(115)
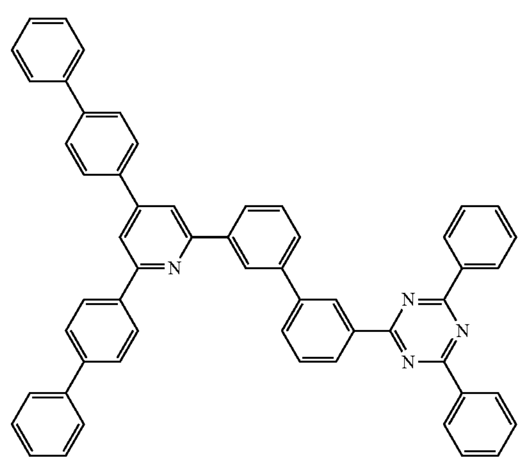

-continued
A(116)
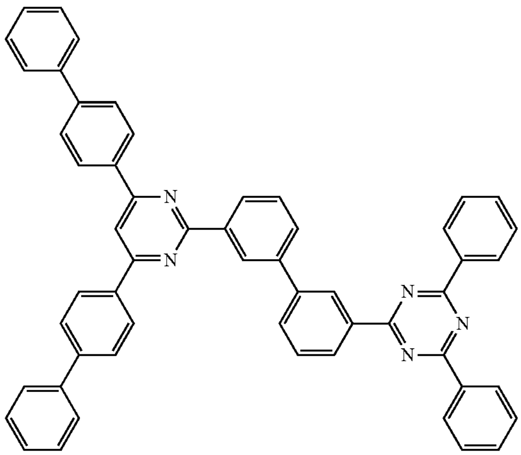
A(117)
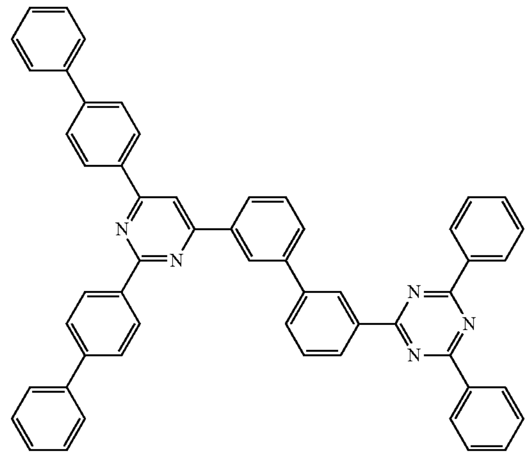
A(118)
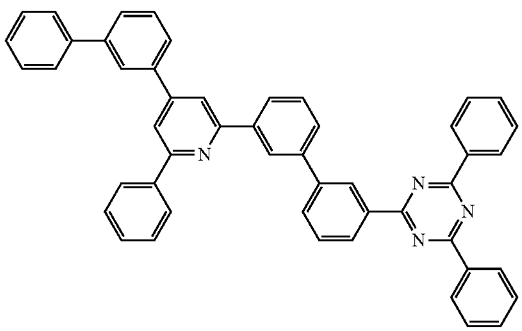
A(119)
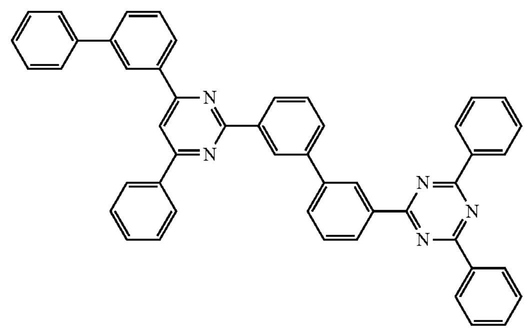
A(120)
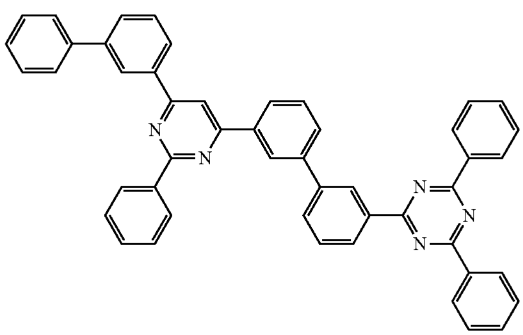
A(121)
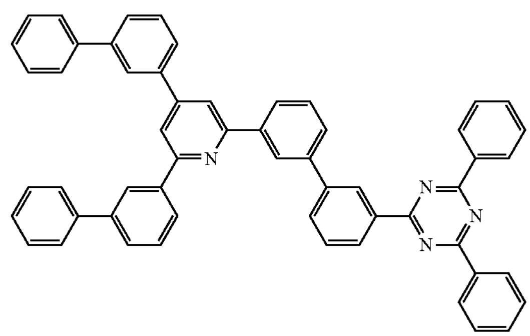
A(122)
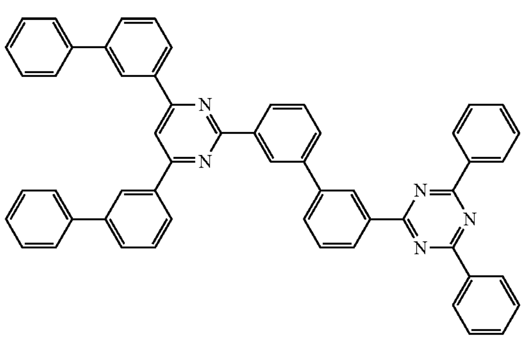
A(123)
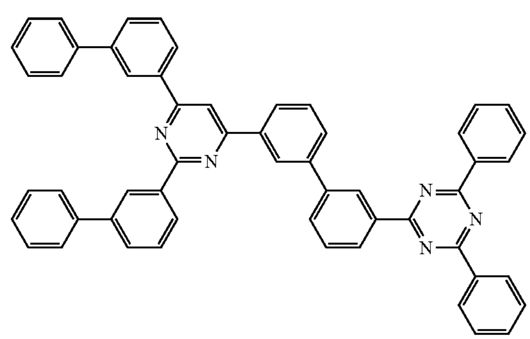

-continued
A(124)
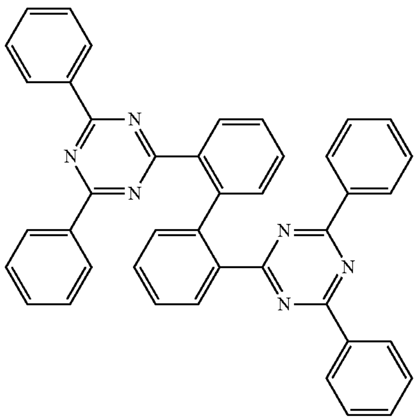
A(125)
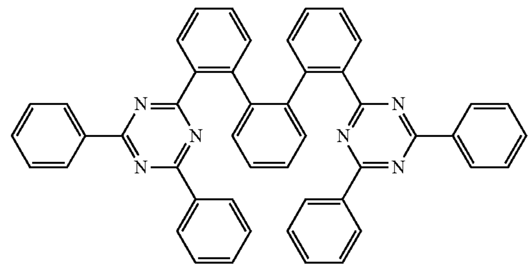
A(126)
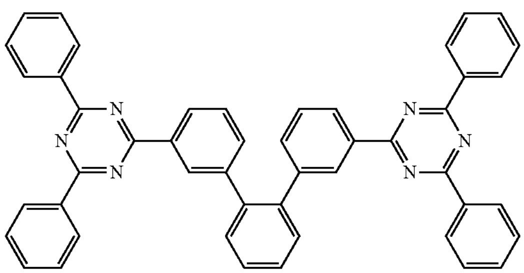
A(127)
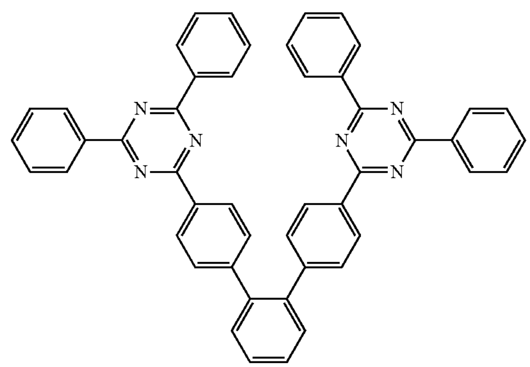
A(128)
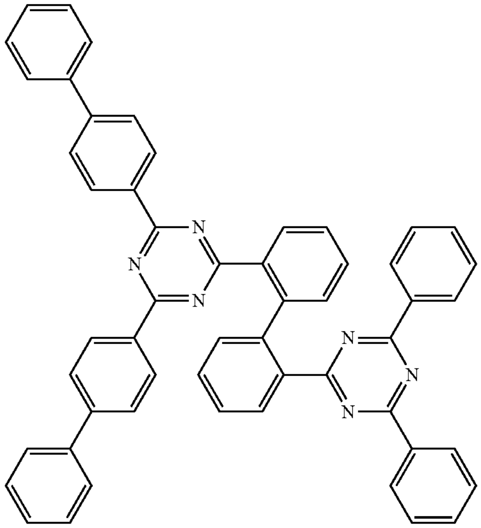

-continued
A(129)
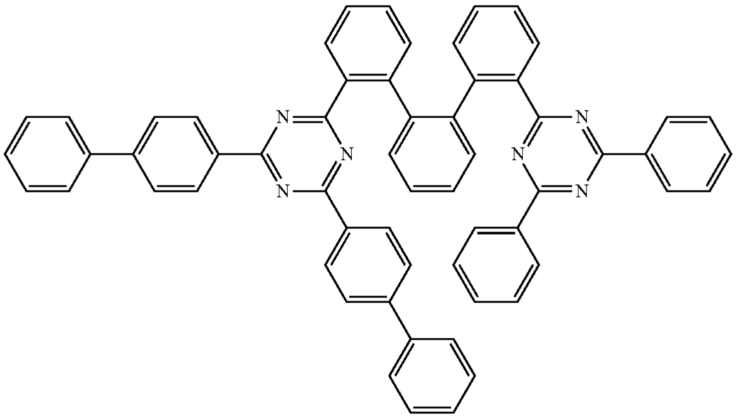
A(130)
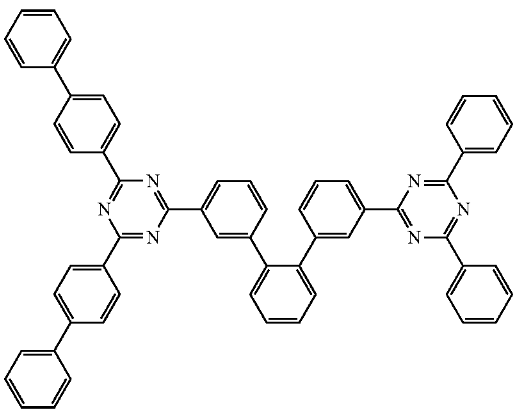
A(131)
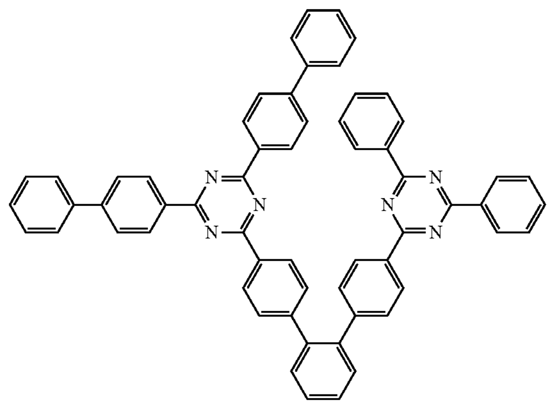
A(132)
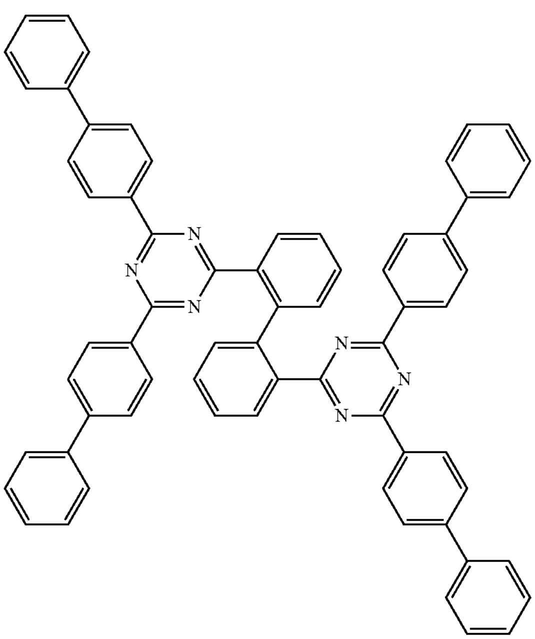

-continued
A(133)
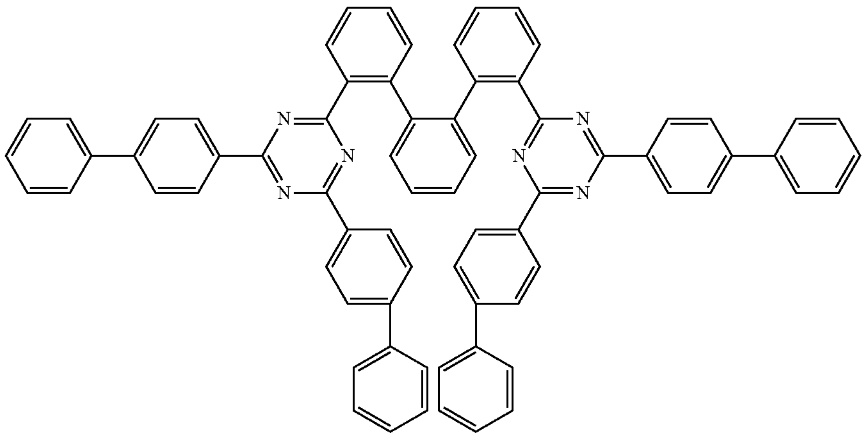
A(134)
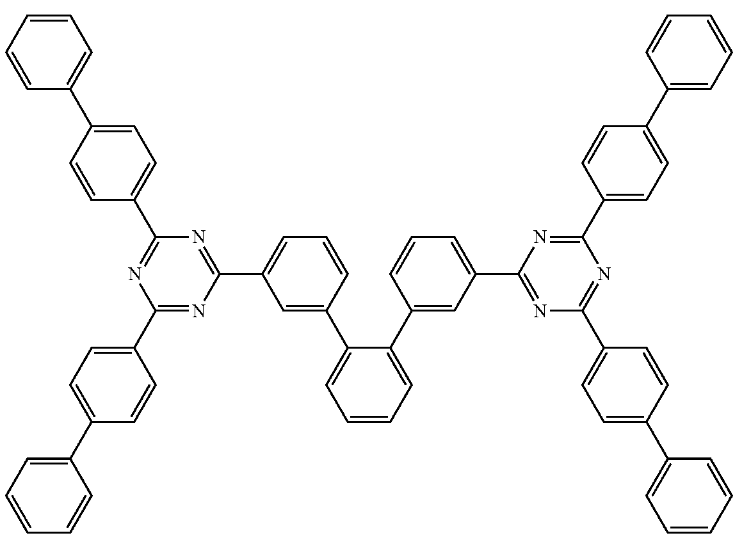
A(135)
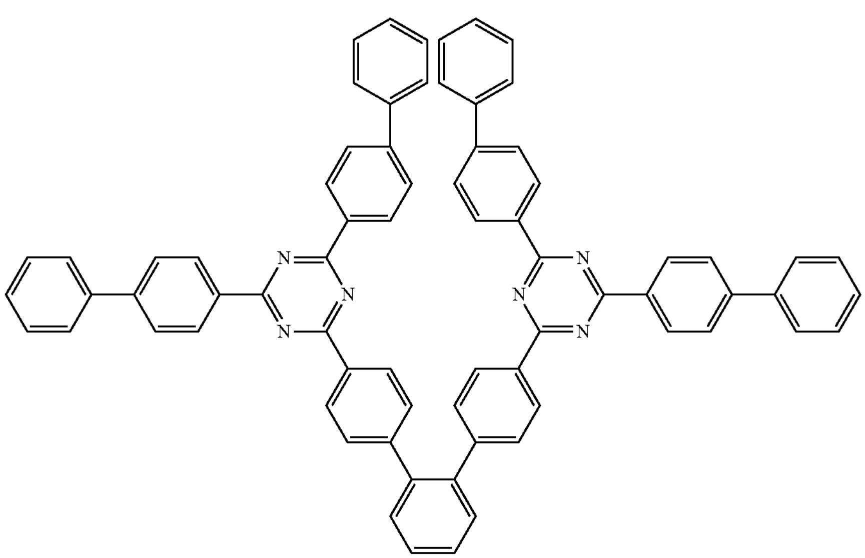

-continued
A(136)
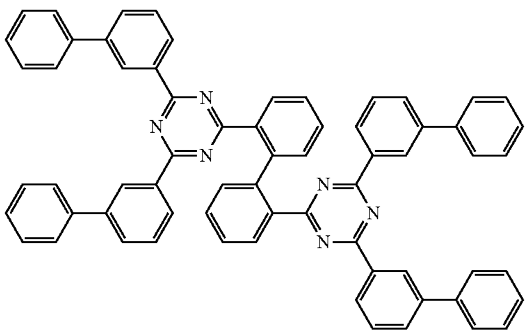
A(137)
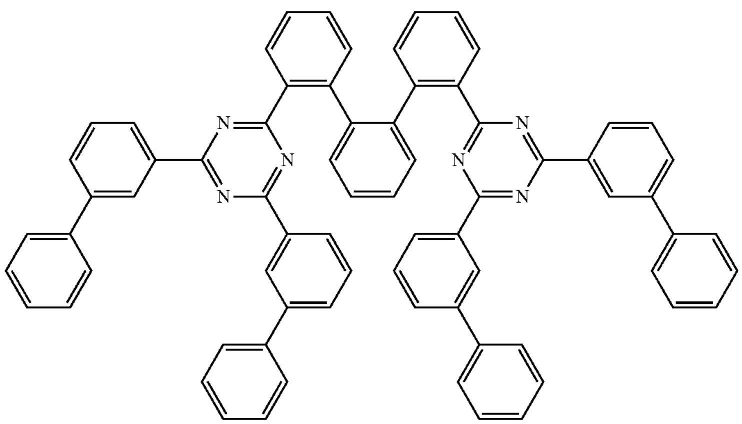
A(138)
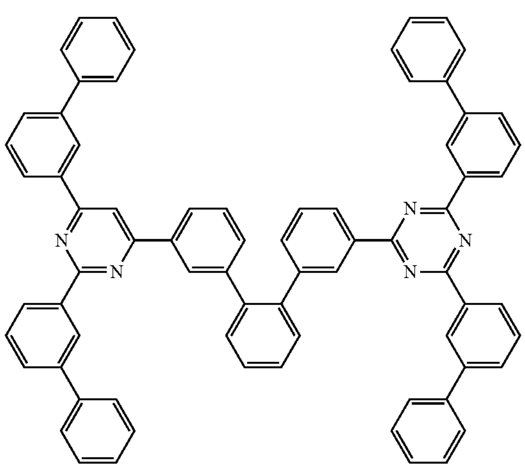

-continued
A(139)
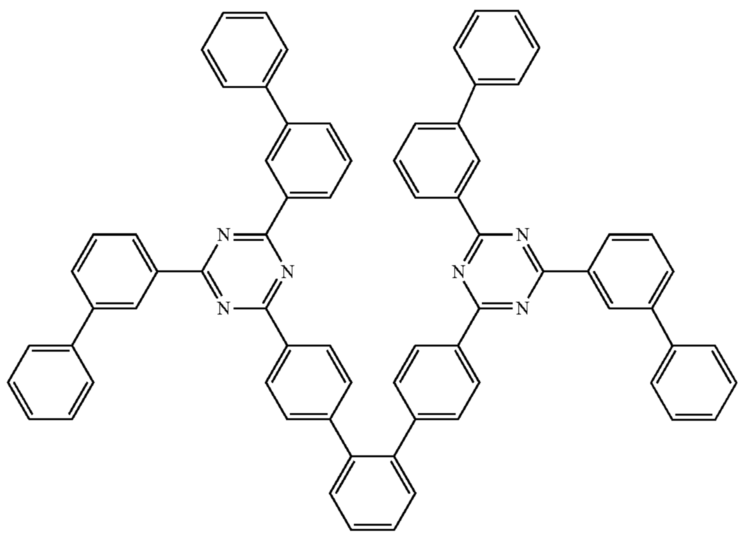
A(140)
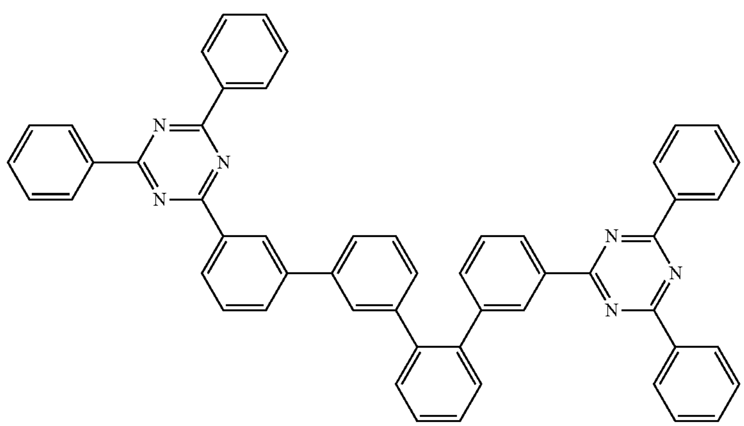
A(141)
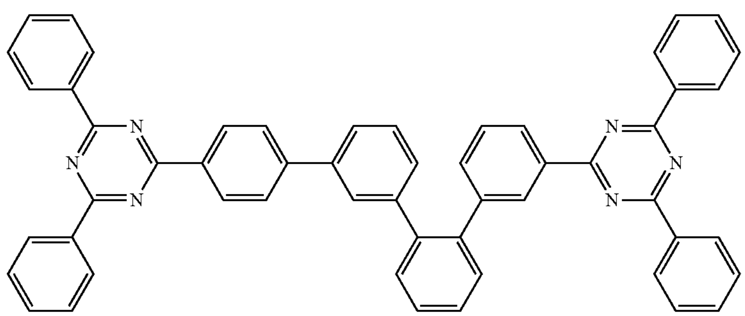

-continued
A(142)
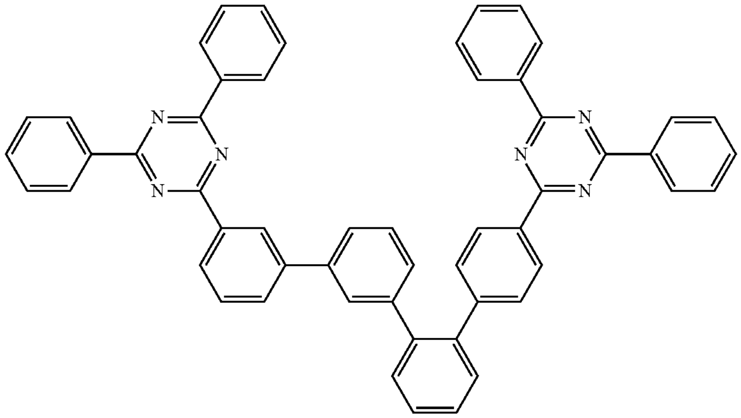
A(143)
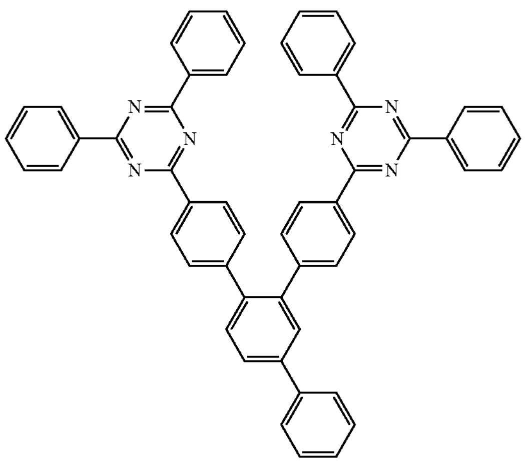
A(144)
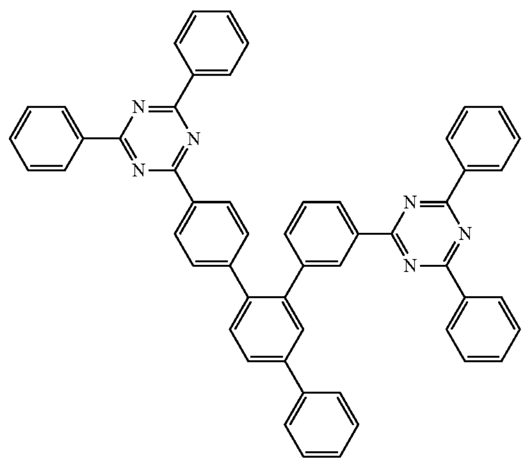
A(145)
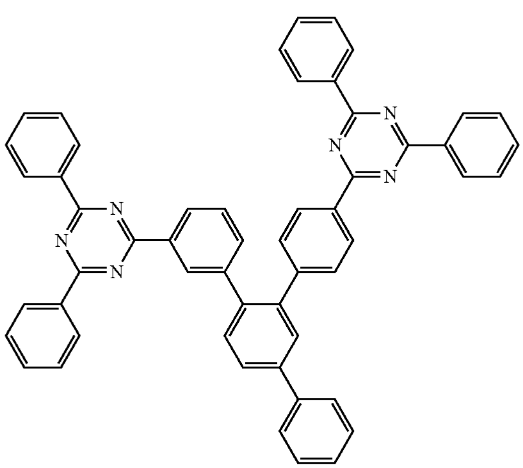
A(146)
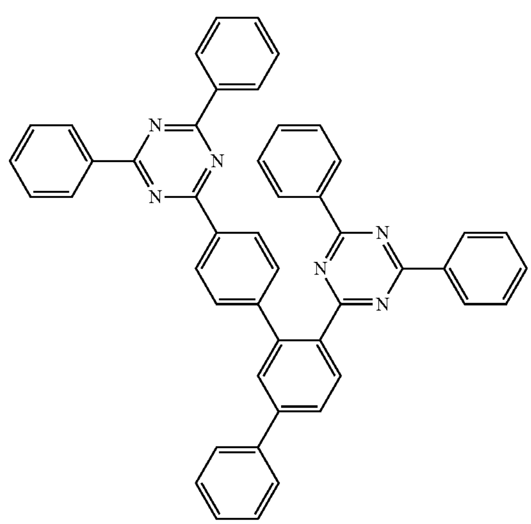

-continued
A(147)
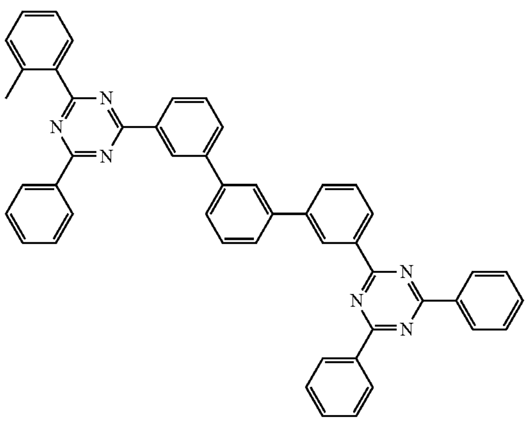
A(148)
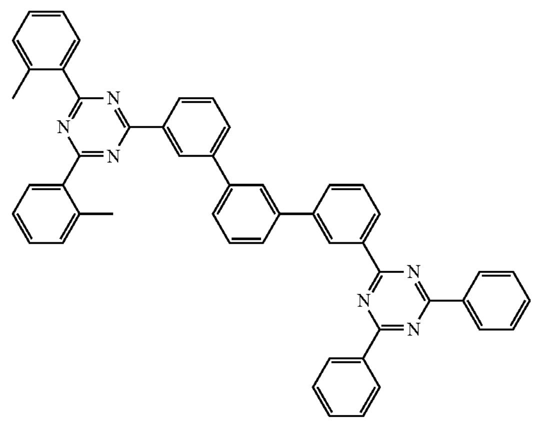
A(149)
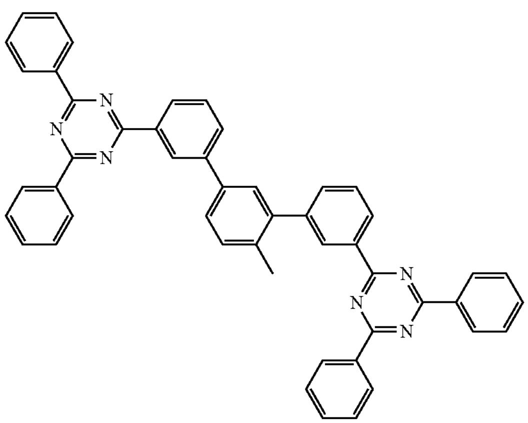
A(150)
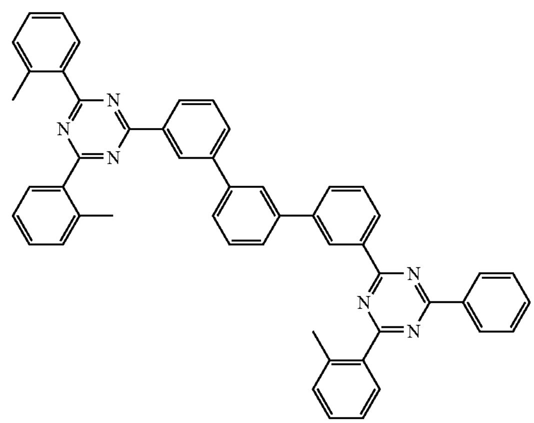
A((151)
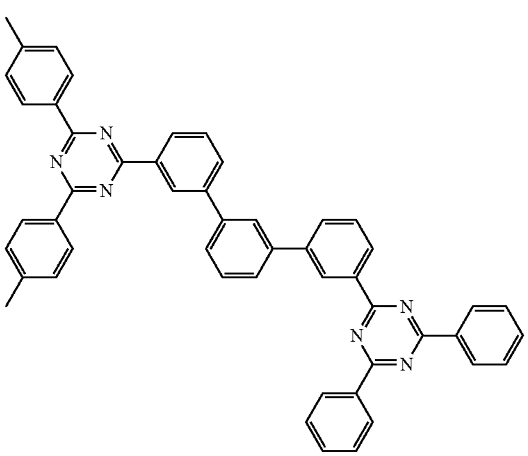
A(152)
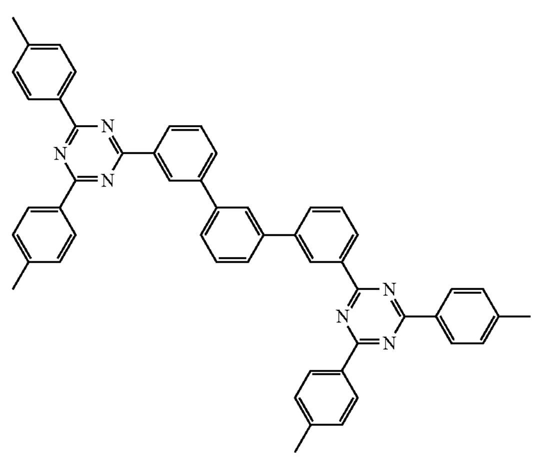

-continued
A(153)
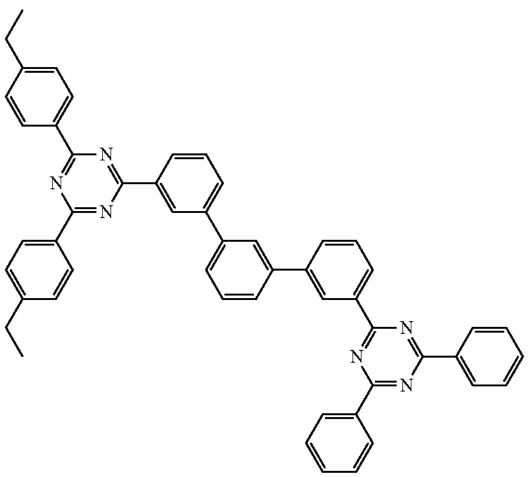
A(154)
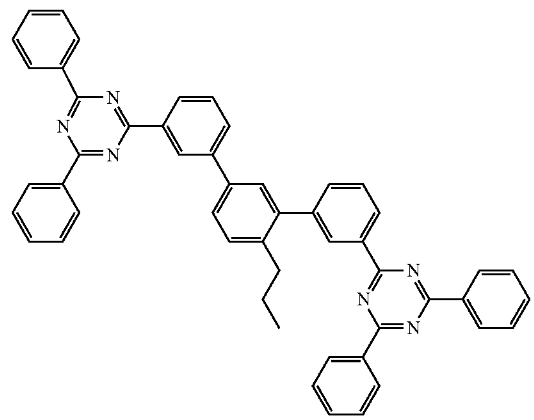
Group HE2
1
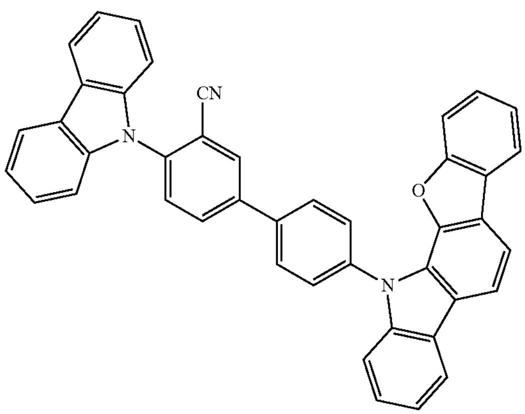
2
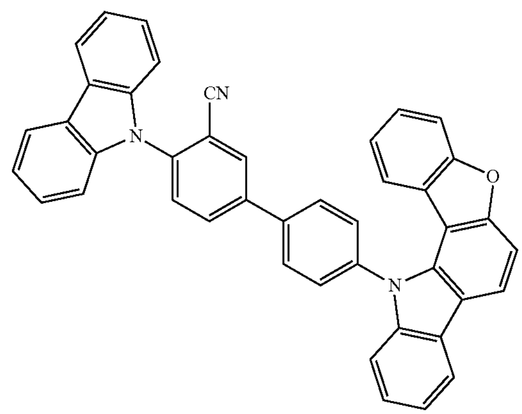
3
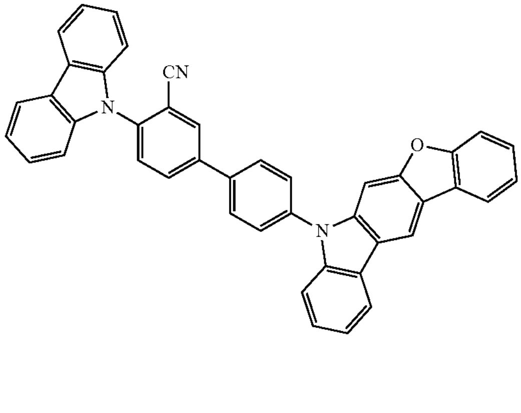
4
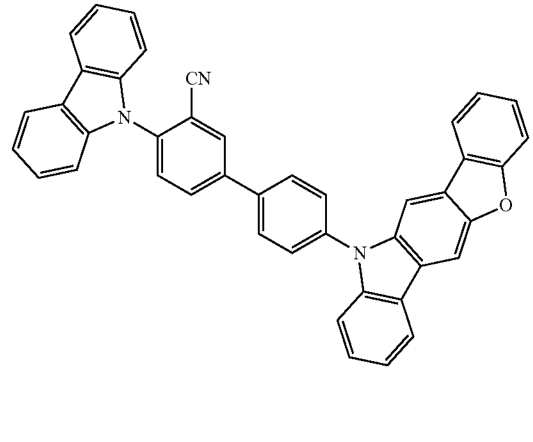

-continued
5
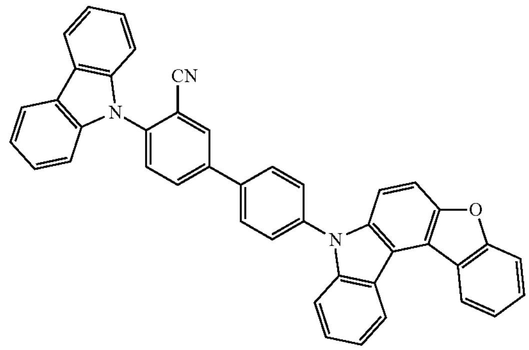
6
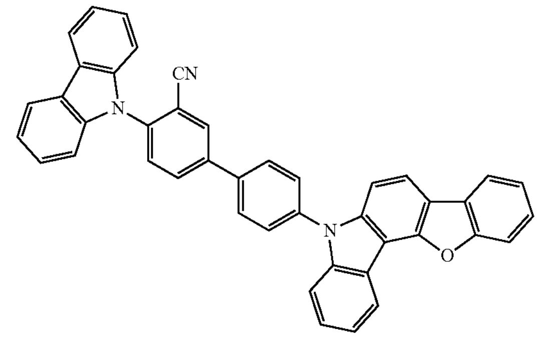
7
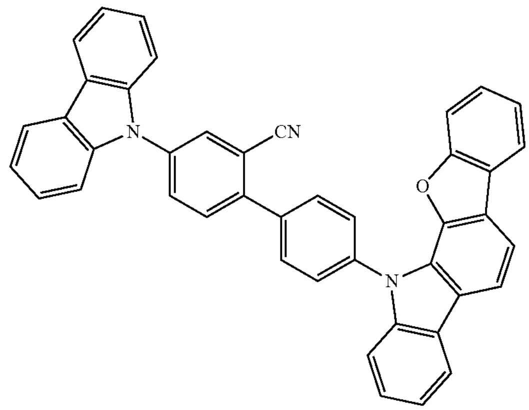
8
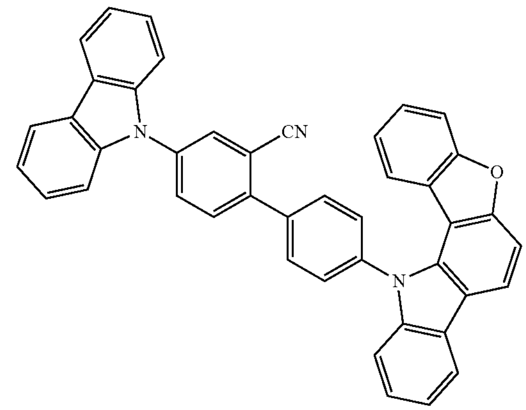
9
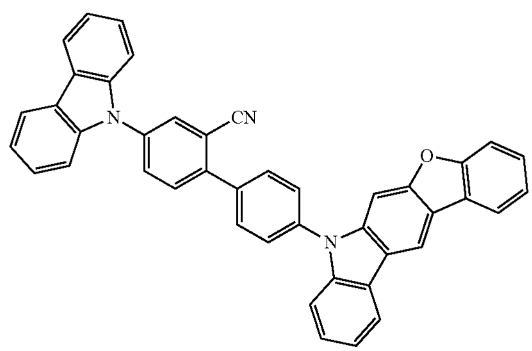
10
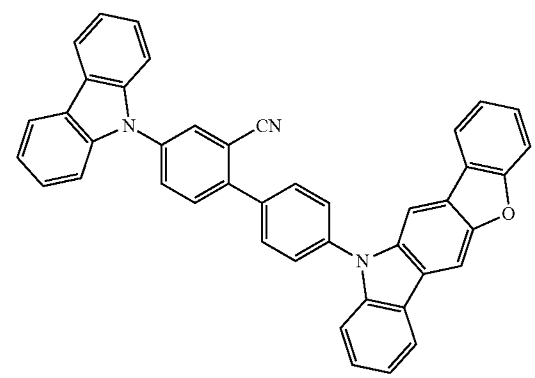
11
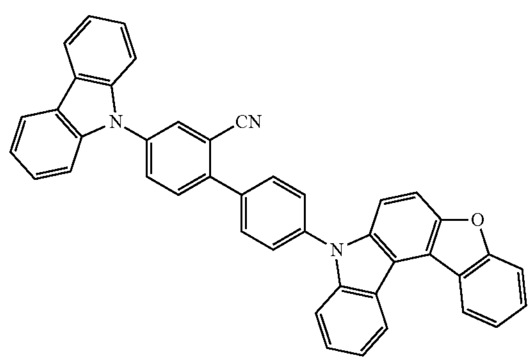
12
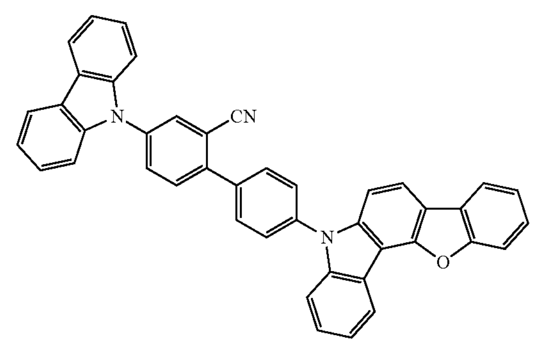

-continued
13
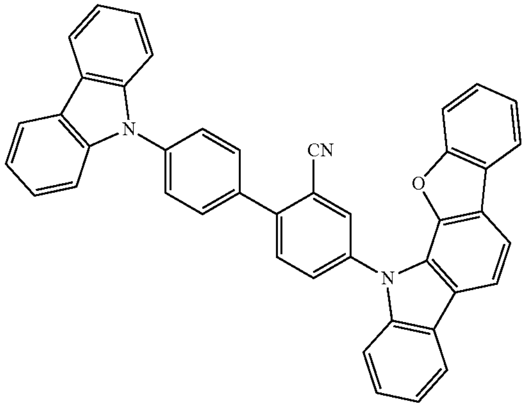
14
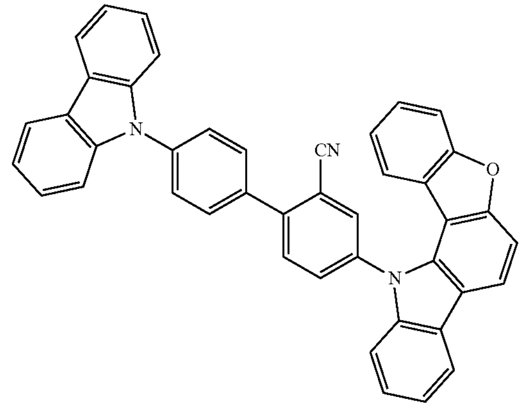
15
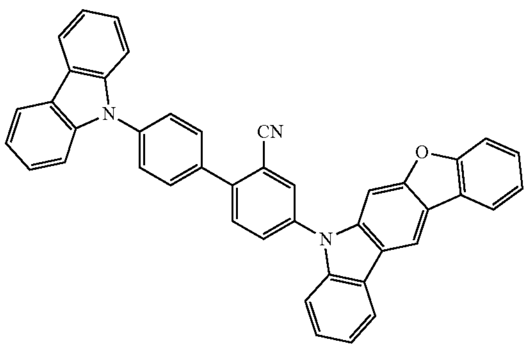
16
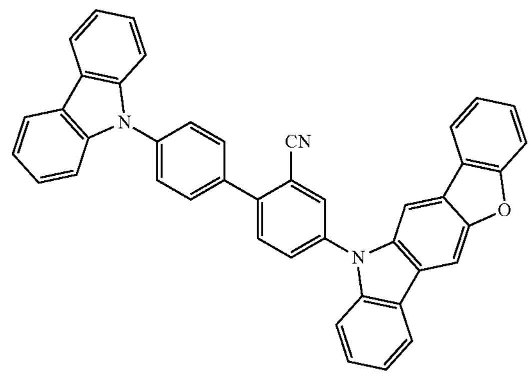
17
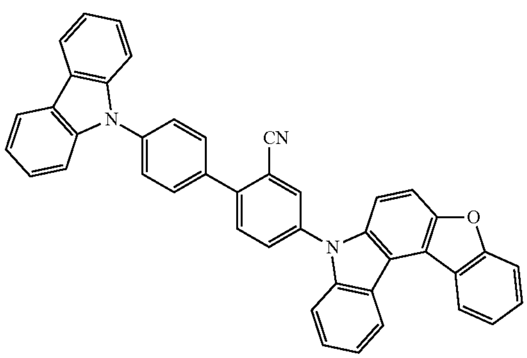
18
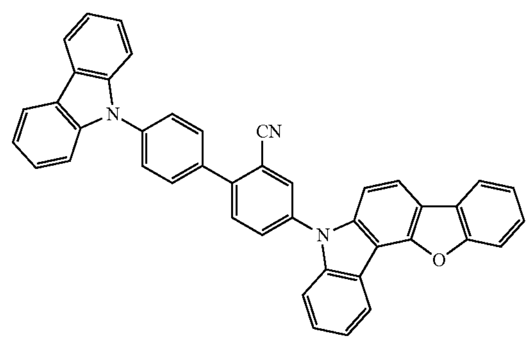
19
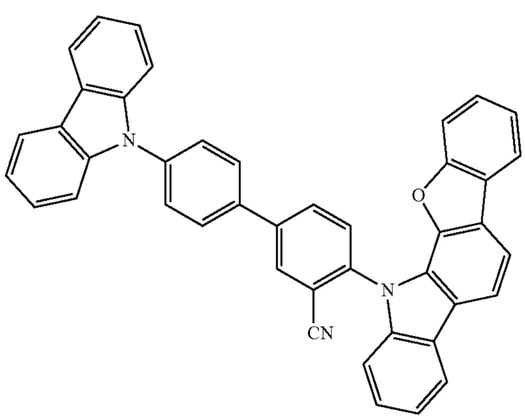
20
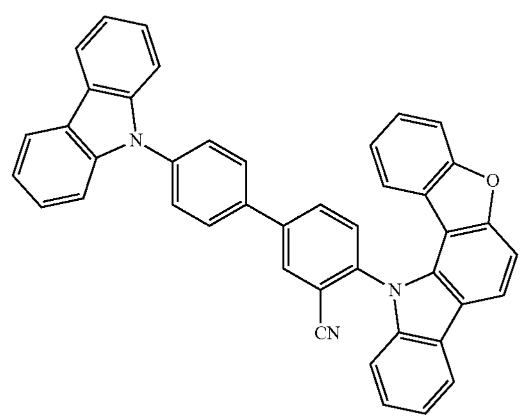

-continued
21
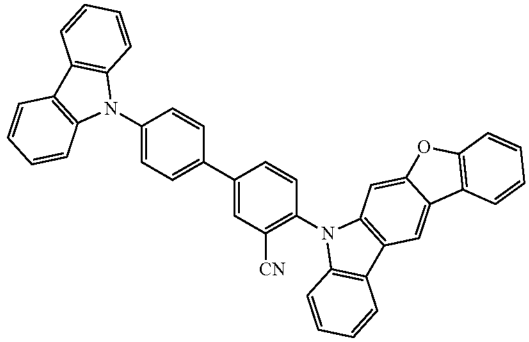
22
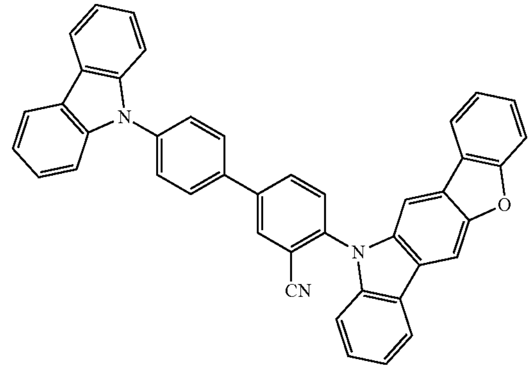
23
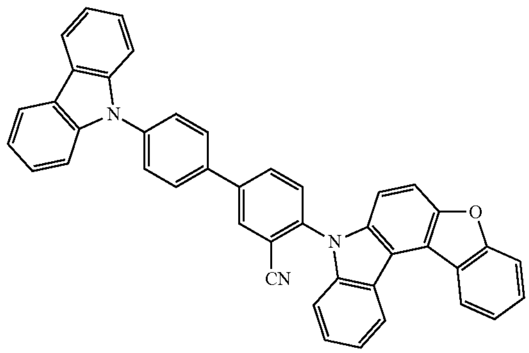
24
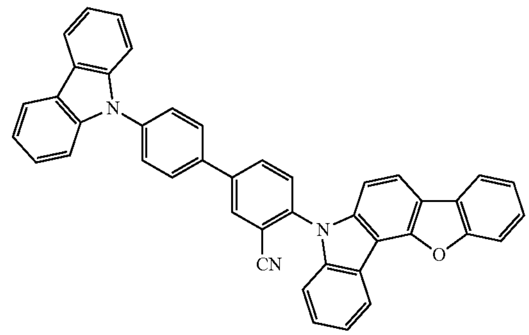
25
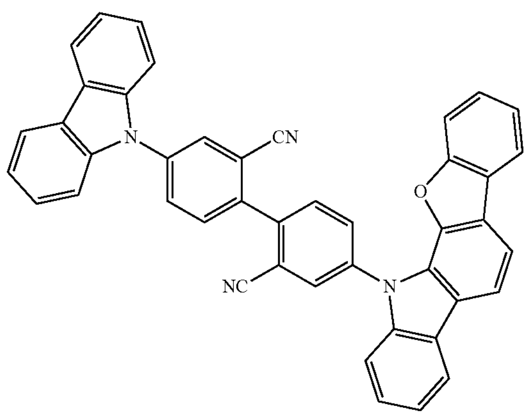
26
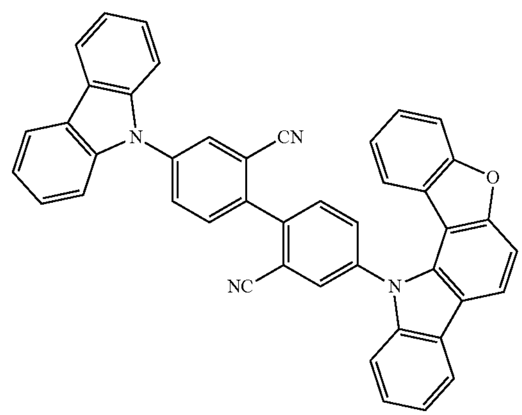
27
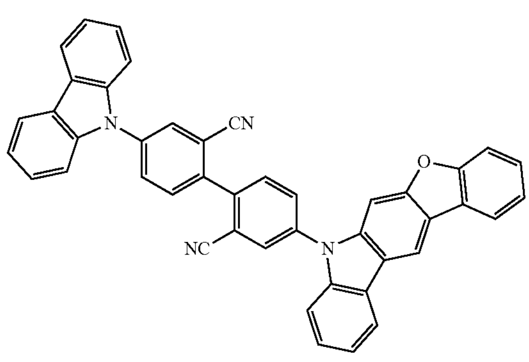
28
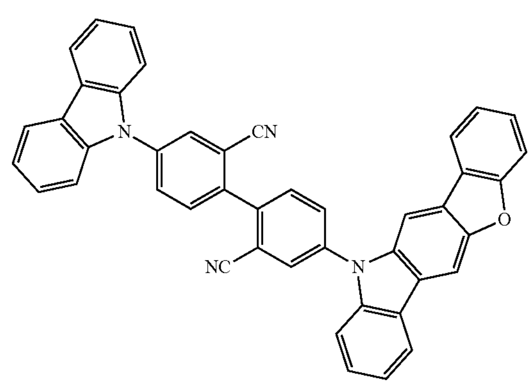

-continued
29
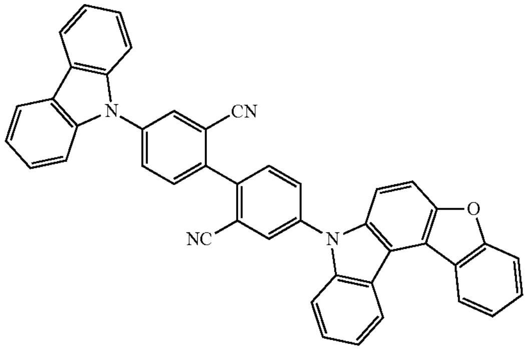
30
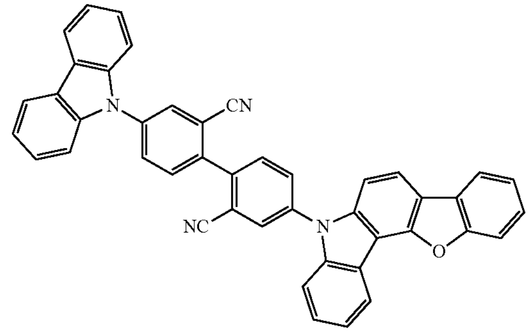
31
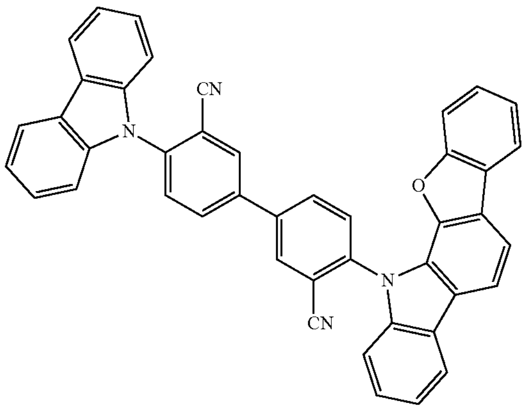
32
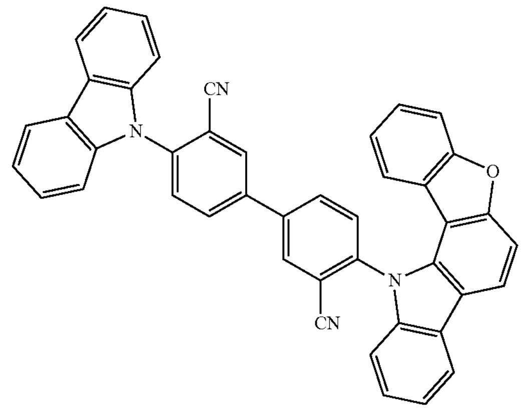
33
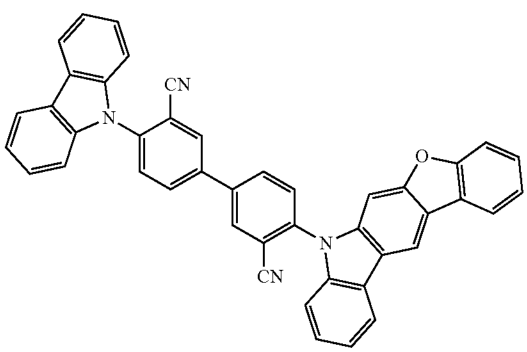
34
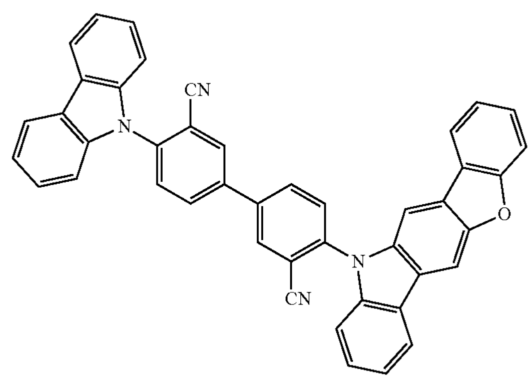
35
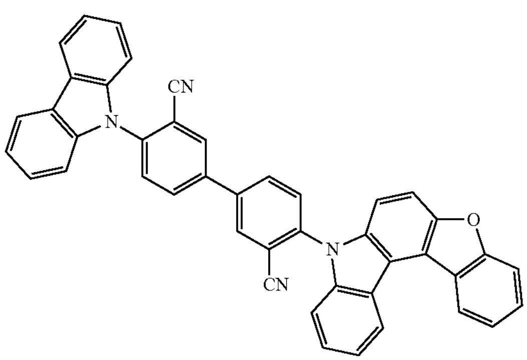
36
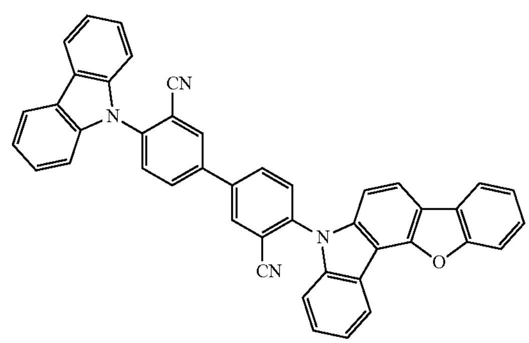

-continued
37
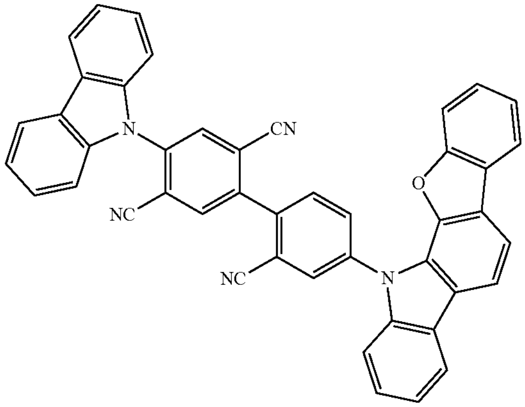
38
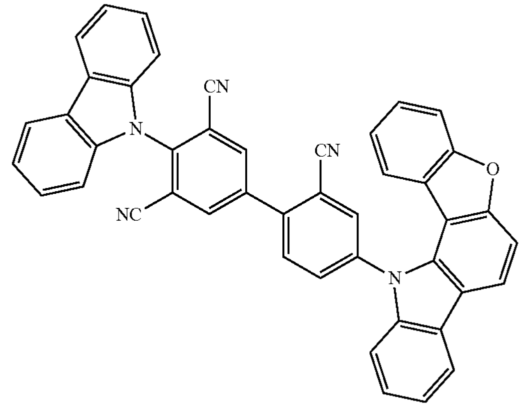
39
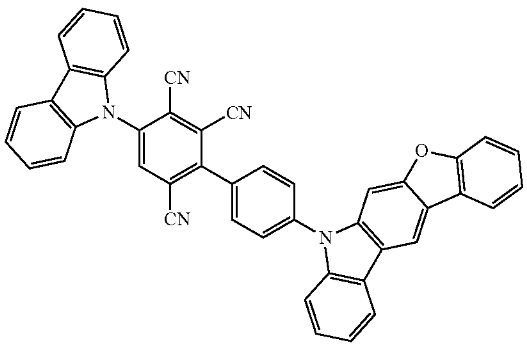
40
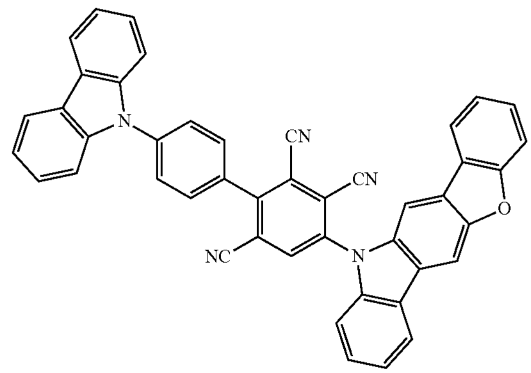
41
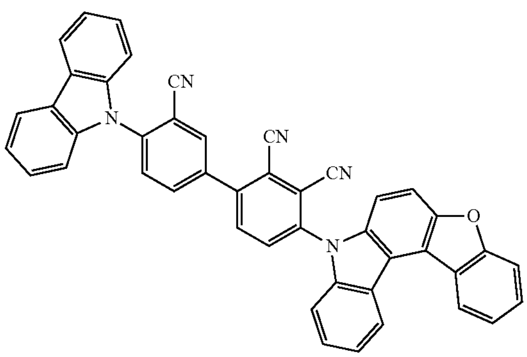
42
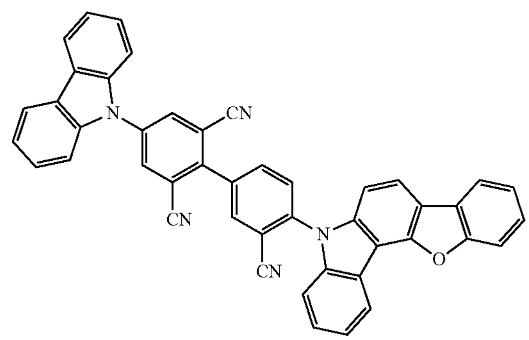
43
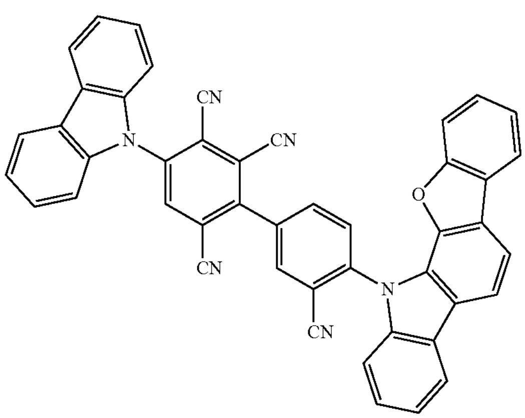
44
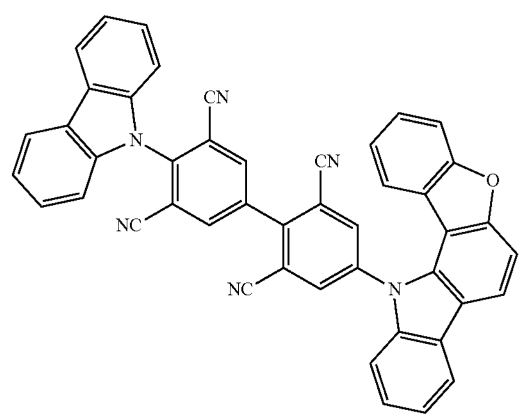

-continued
45
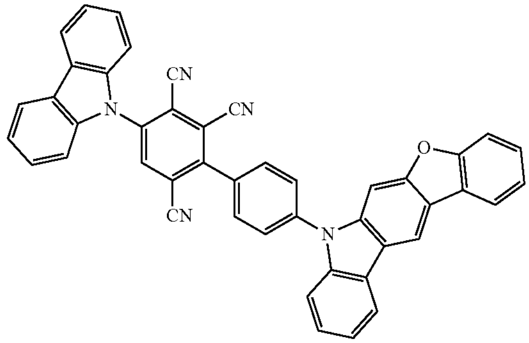
46
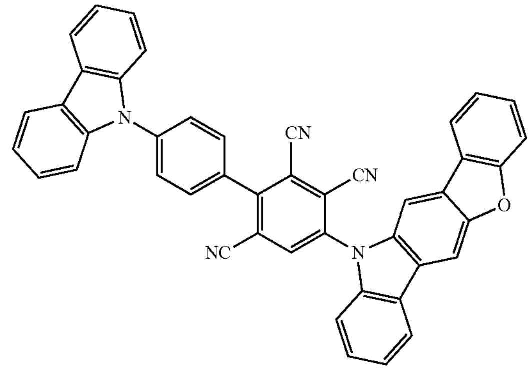
47
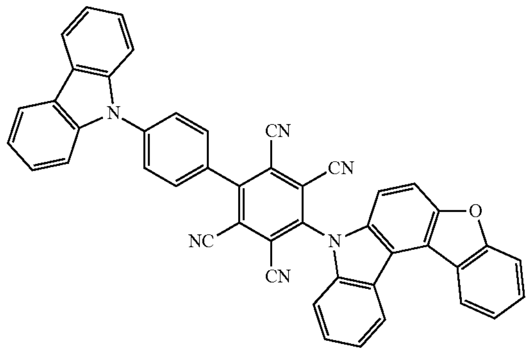
48
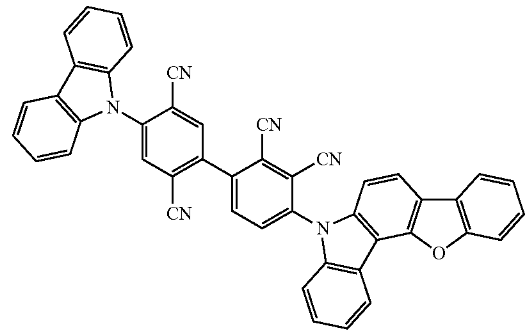
49
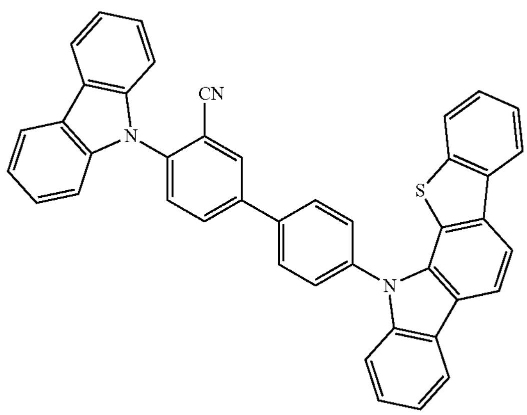
50
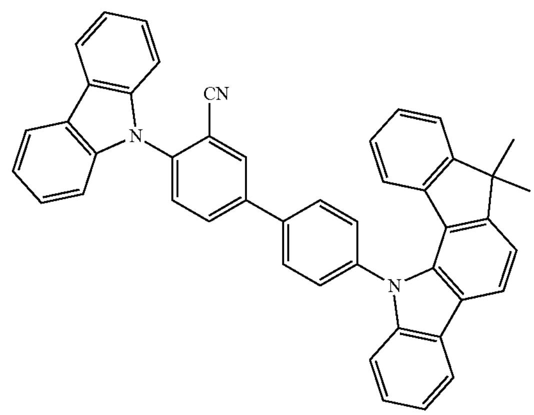
51
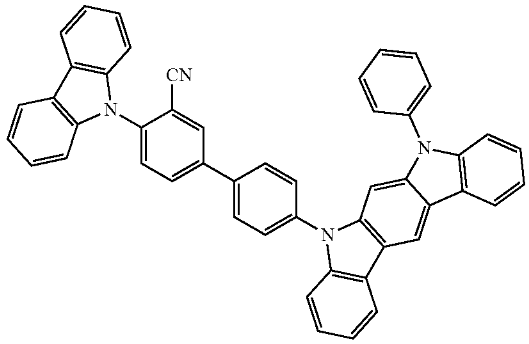
52
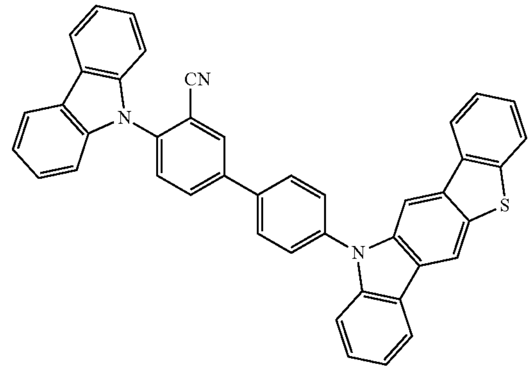

-continued
53
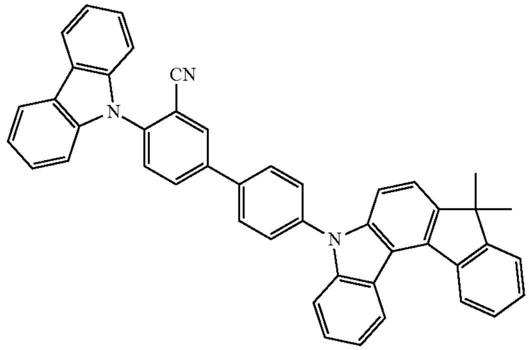
54
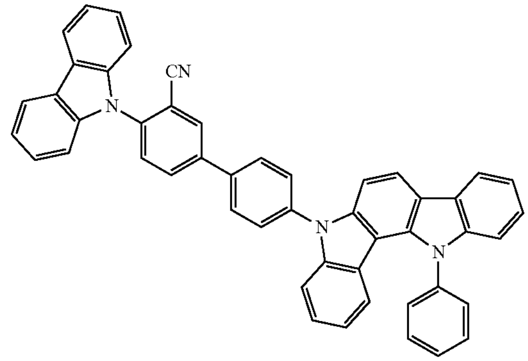
55
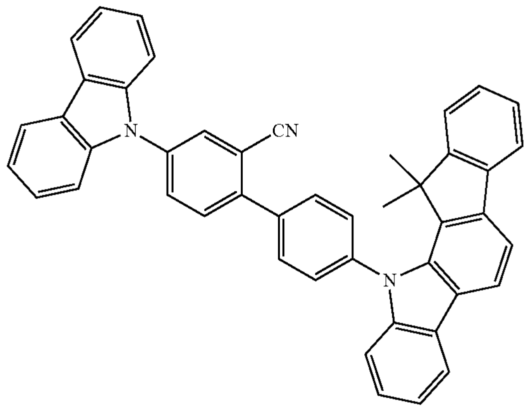
56
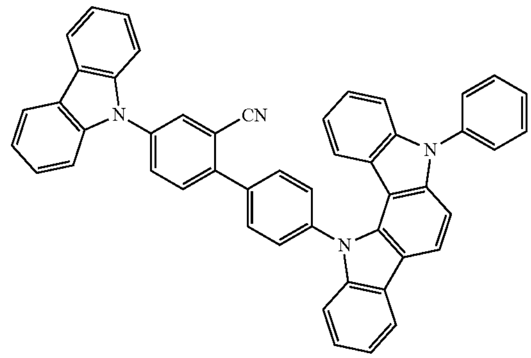
57
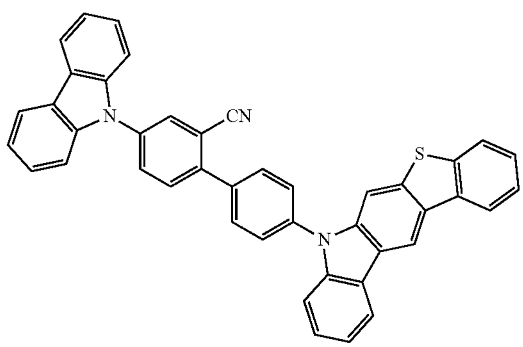
58
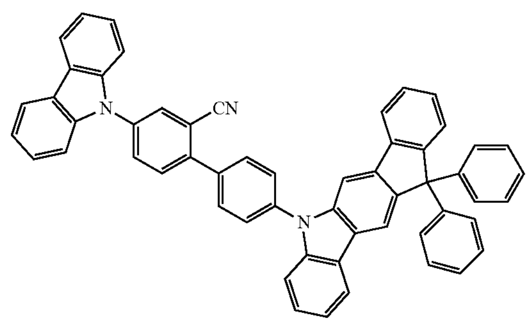
59
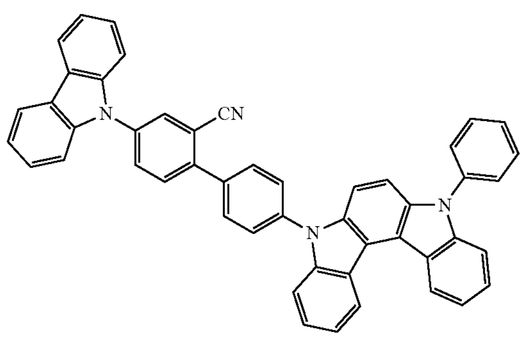
60
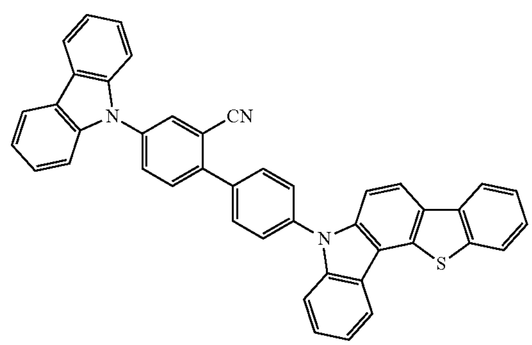

-continued
61
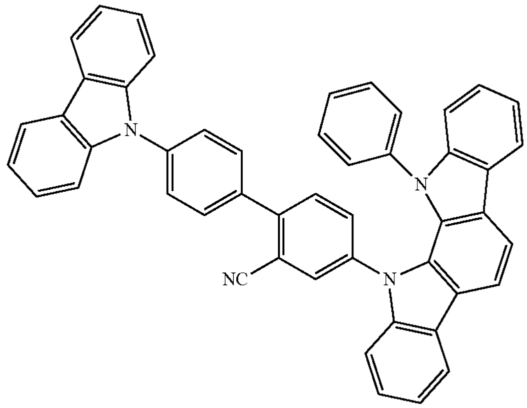
62
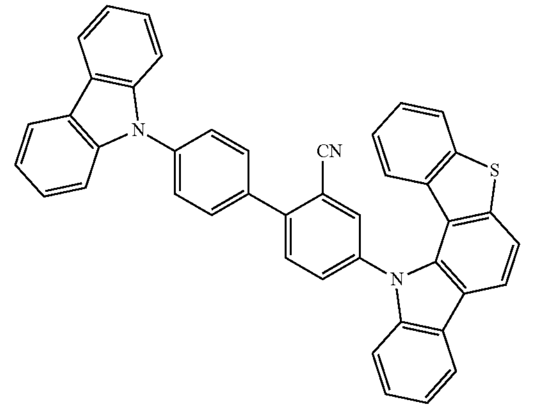
63
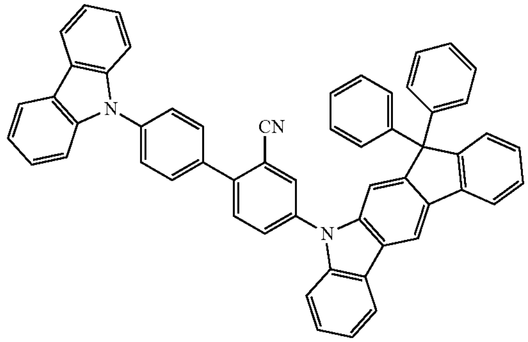
64
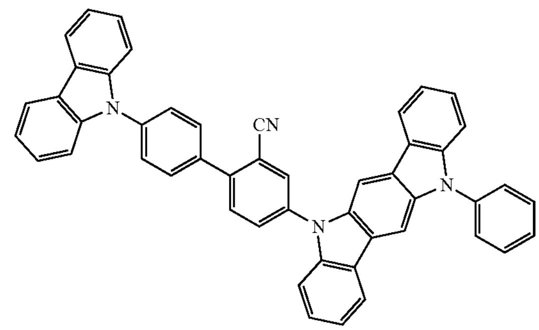
65
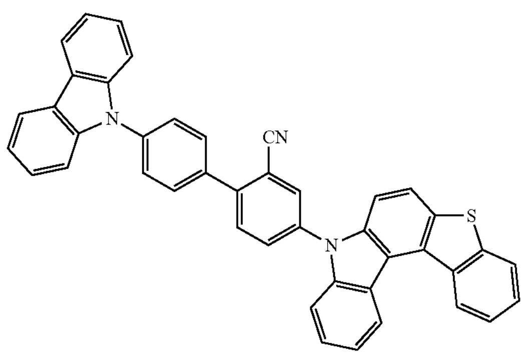
66
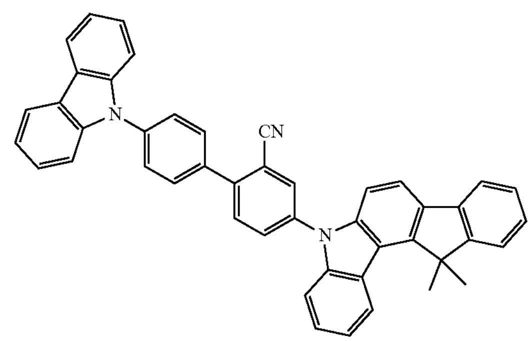
67
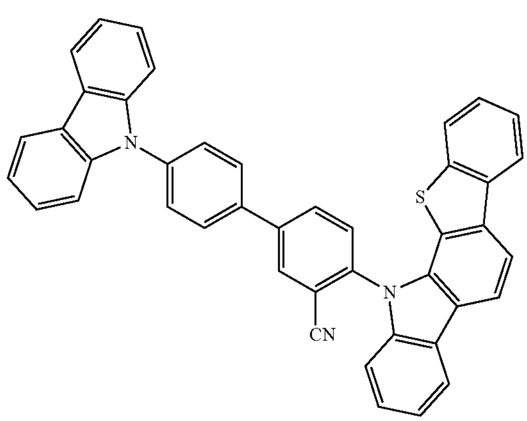
68
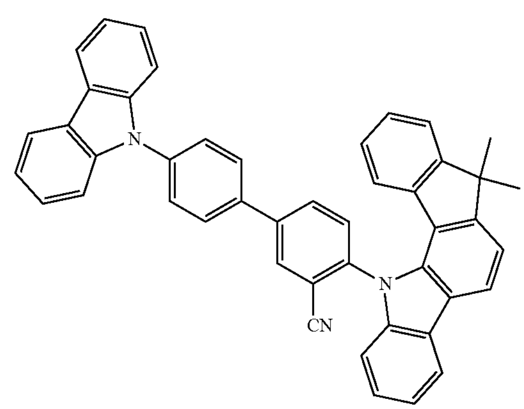

-continued
69
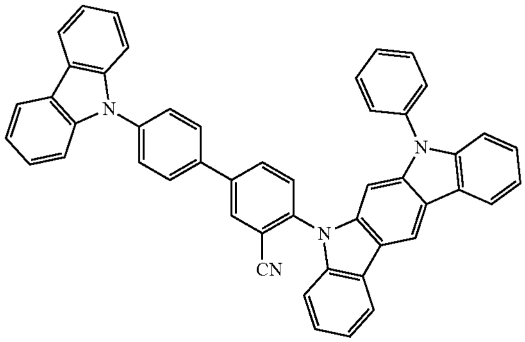
70
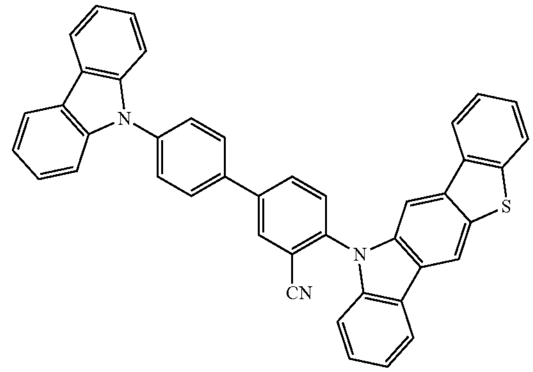
71
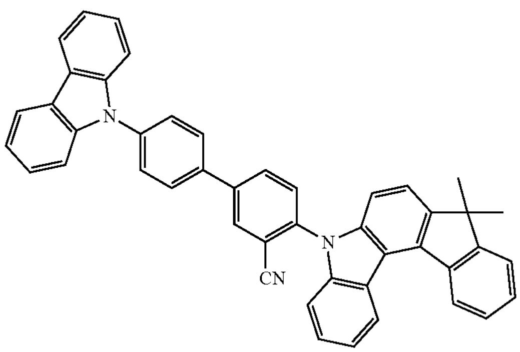
72
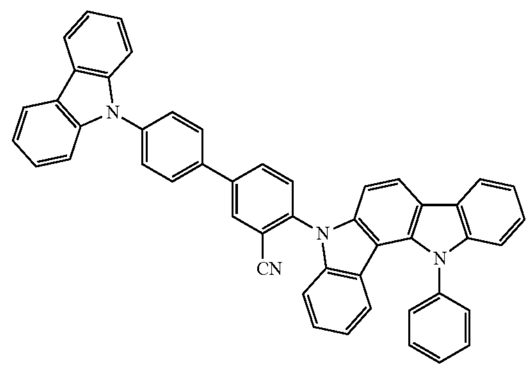
73
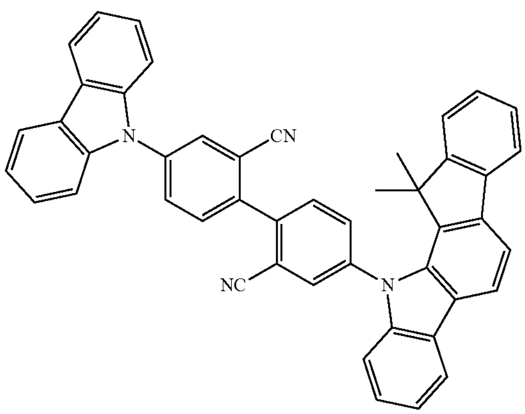
74
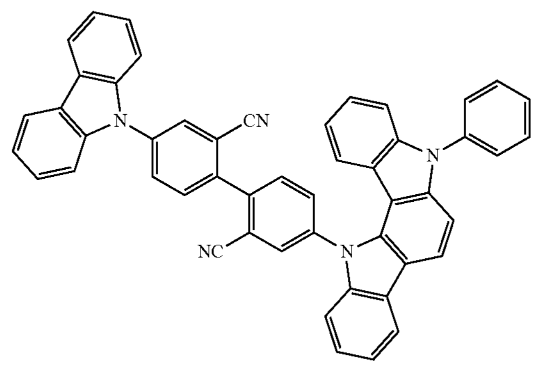
75
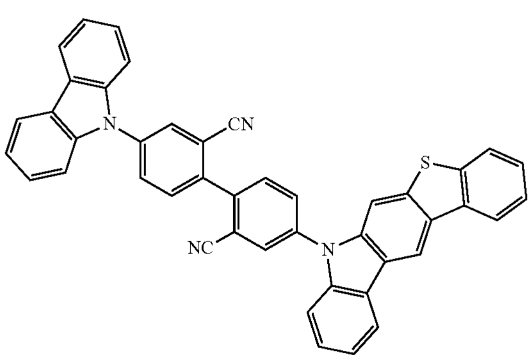
76
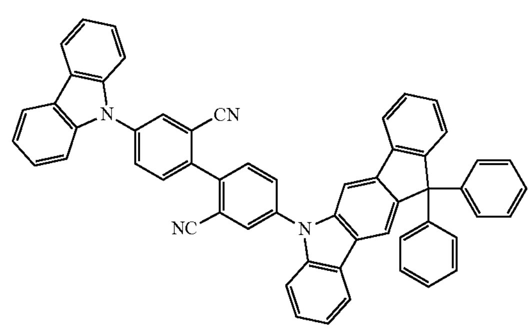

-continued
77
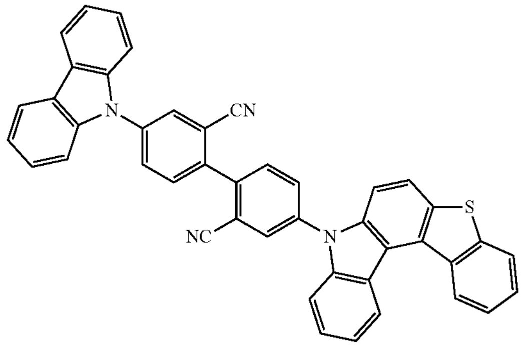
78
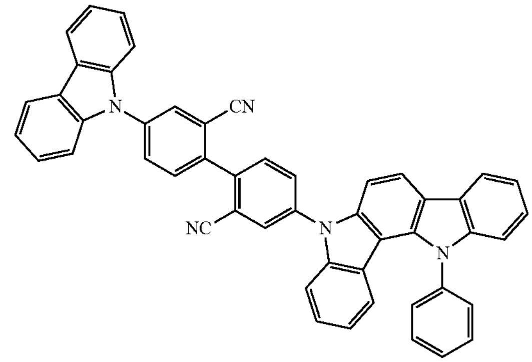
79
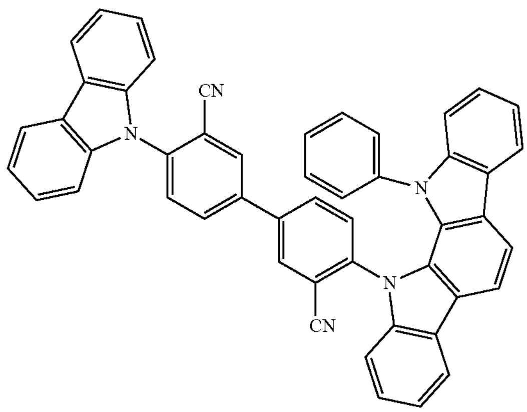
80
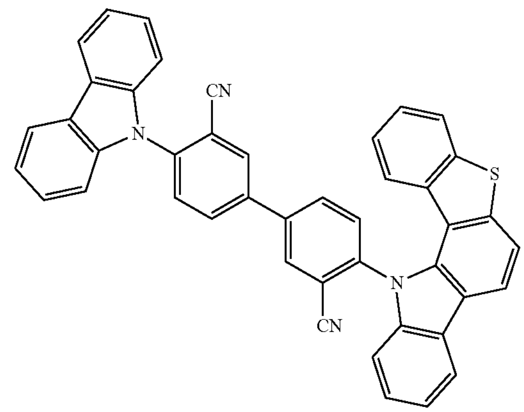
81
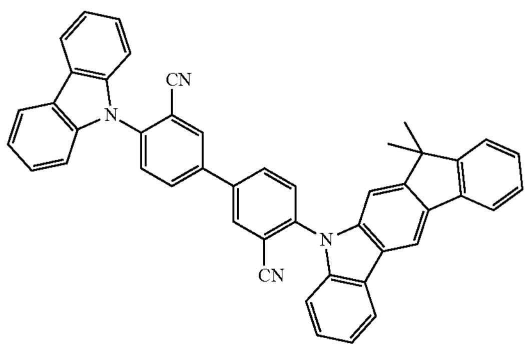
82
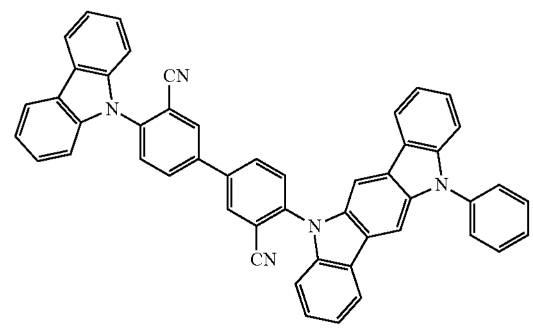
83
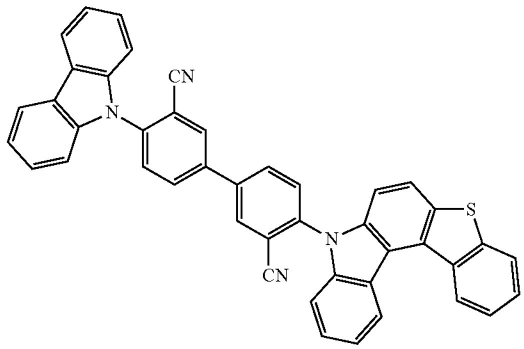
84
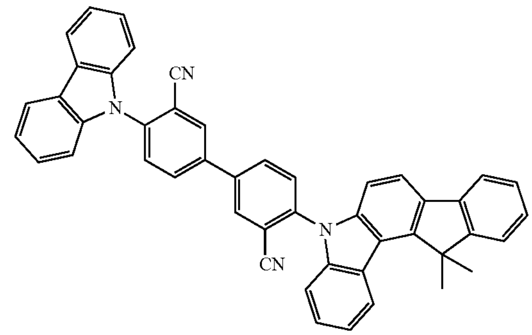

-continued
85
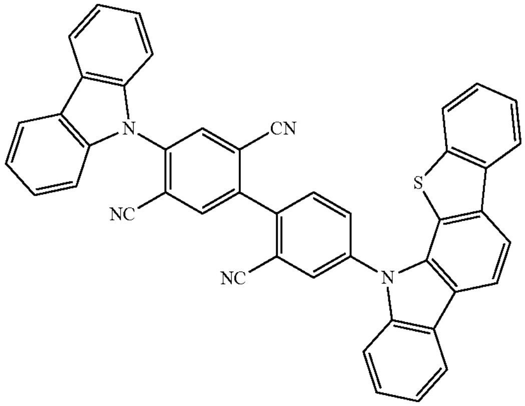
86
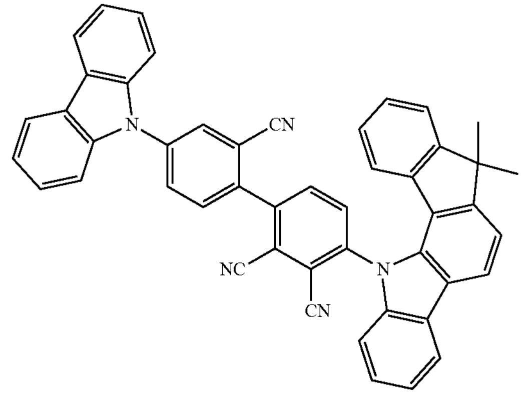
87
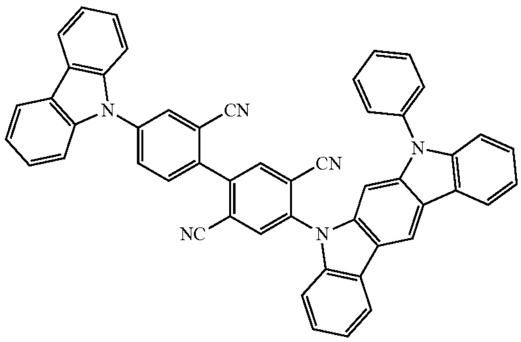
88
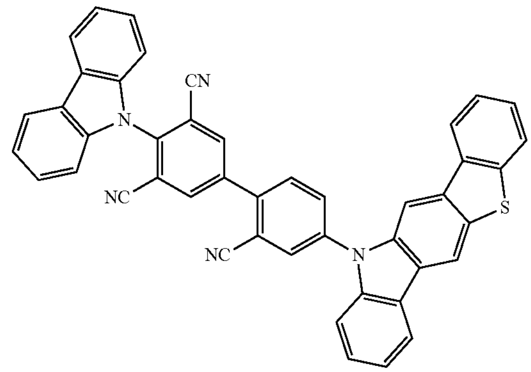
89
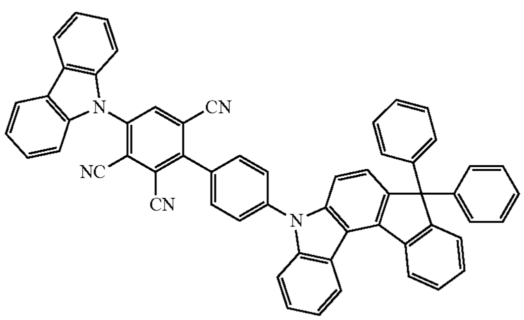
90
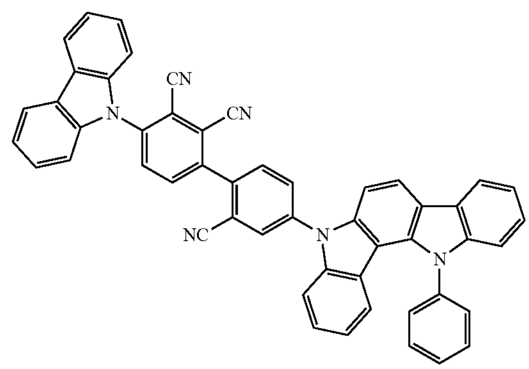
91
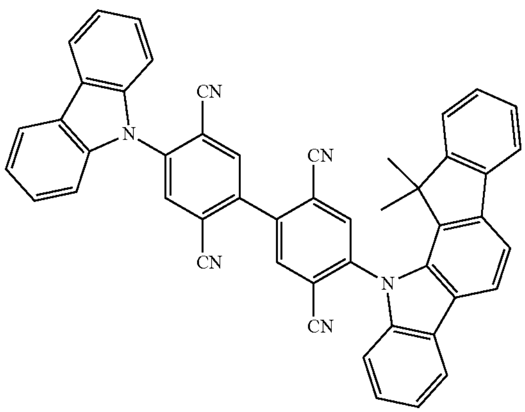
92
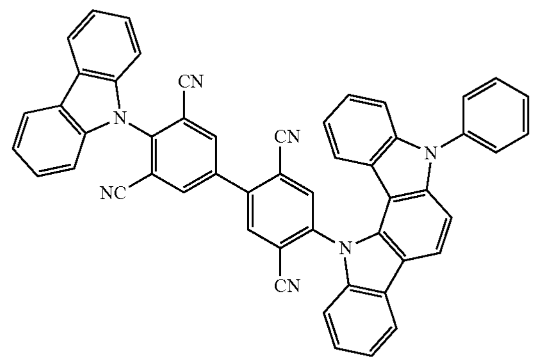

-continued
93
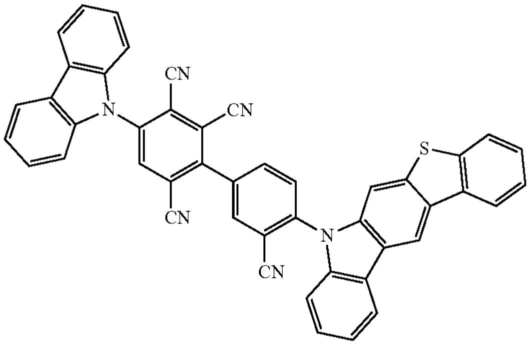
94
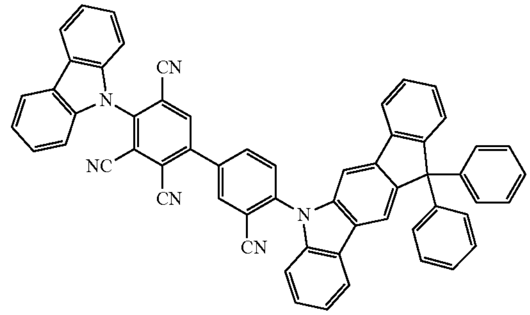
95
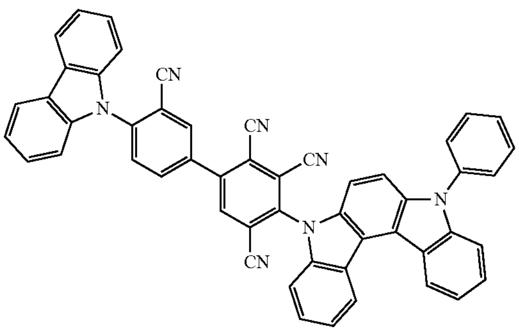
96
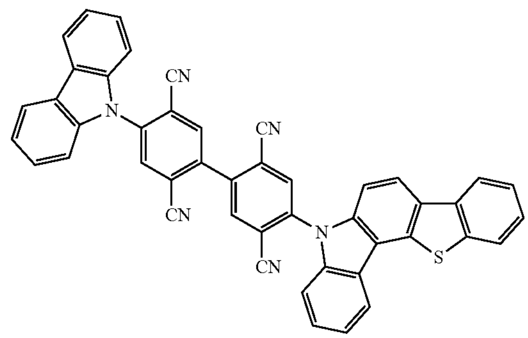
97
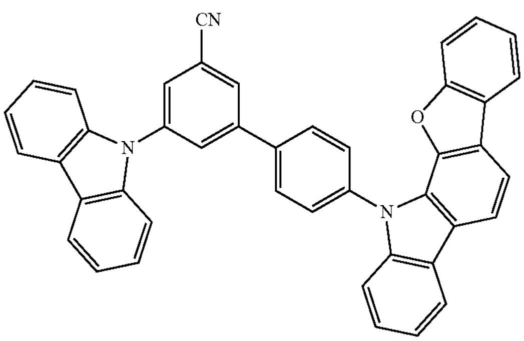
98
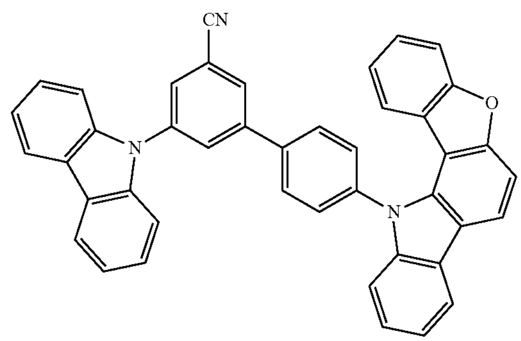
99
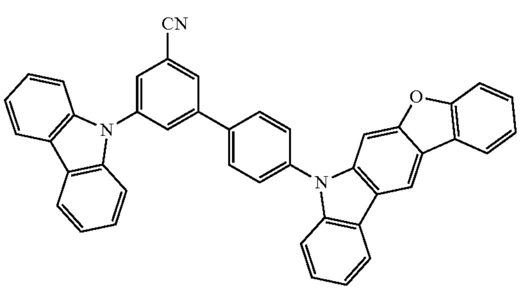
100
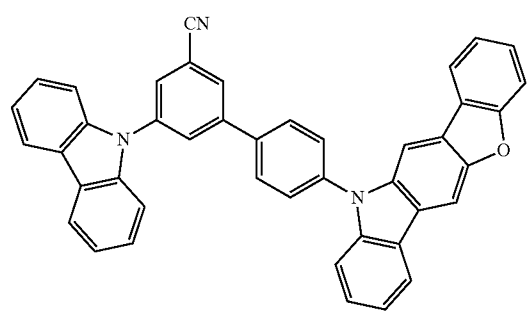
101
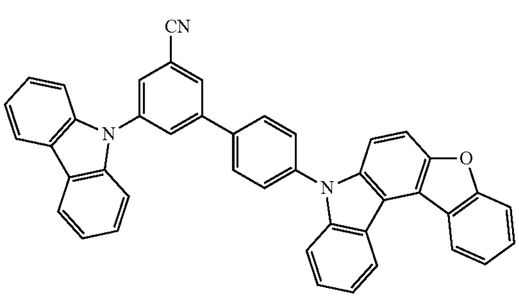
102
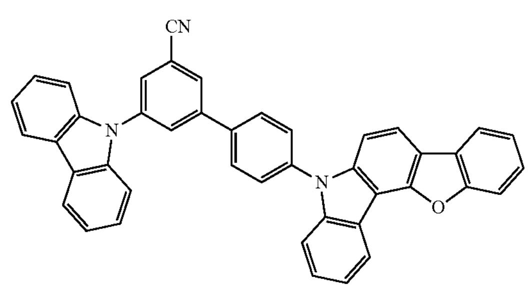

-continued
103
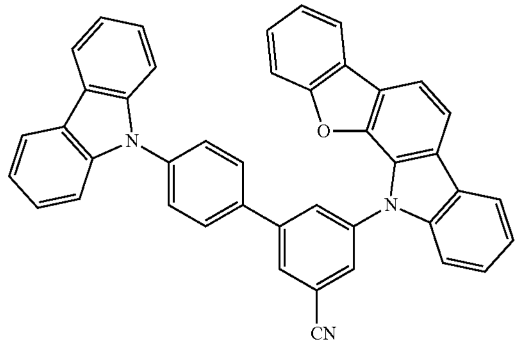
104
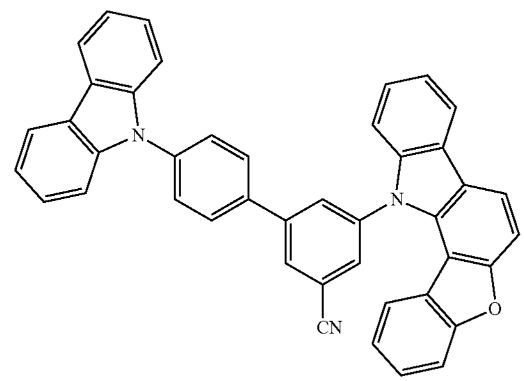
105
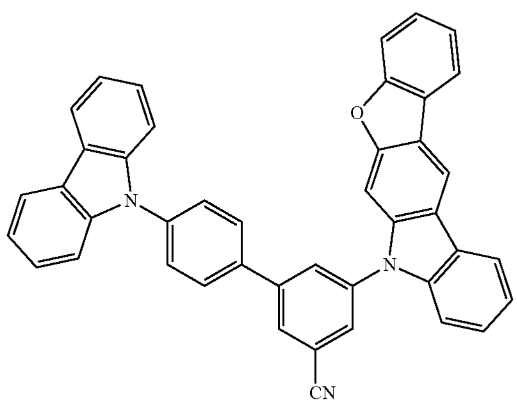
106
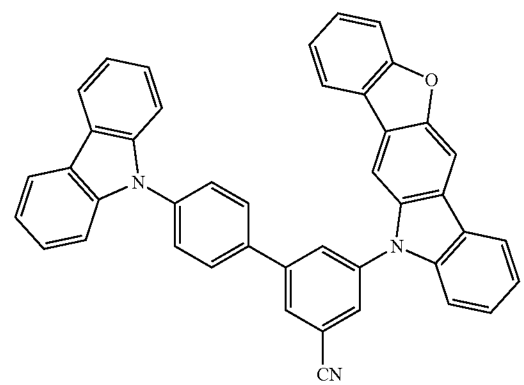
107
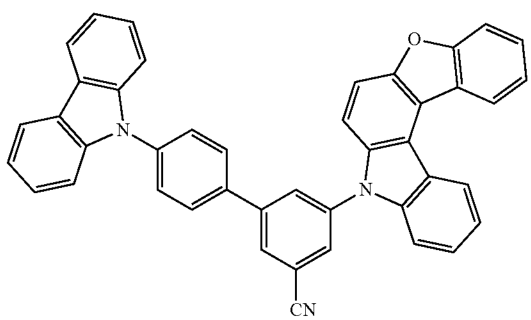
108
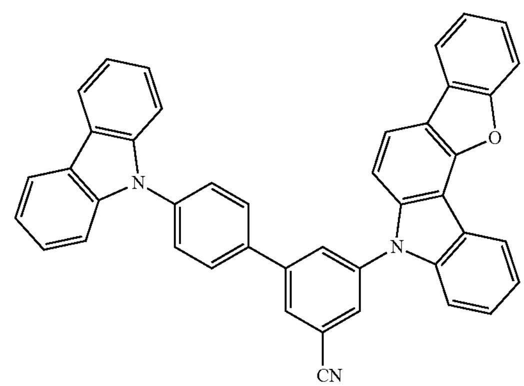
109
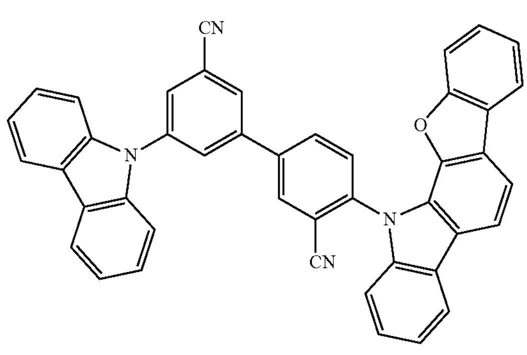
110
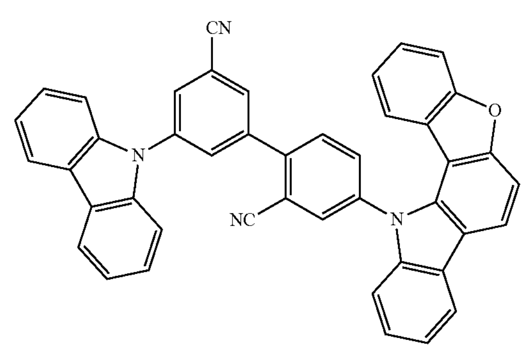

-continued
111
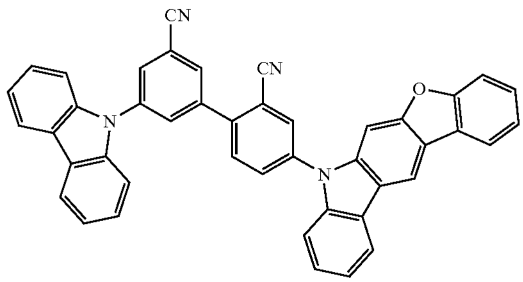
112
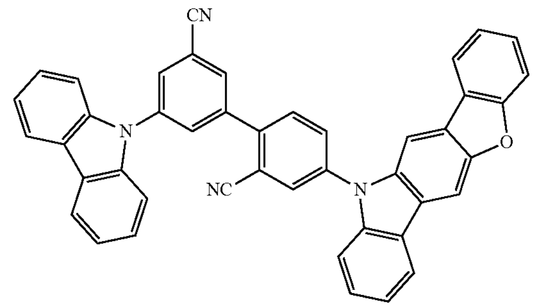
113
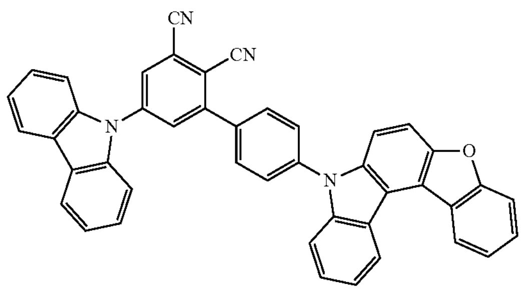
114
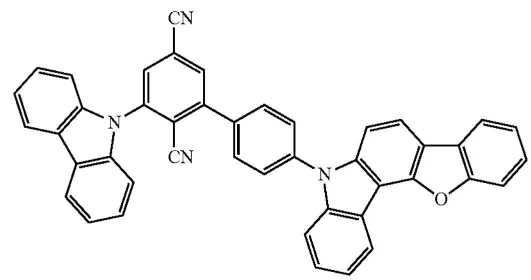
115
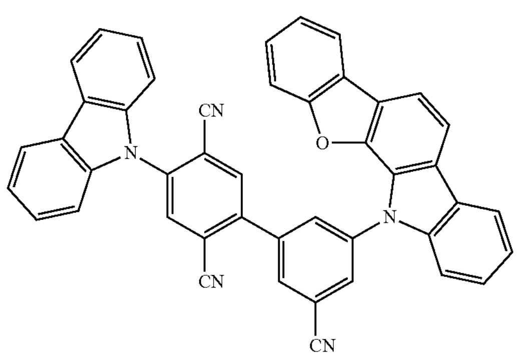
116
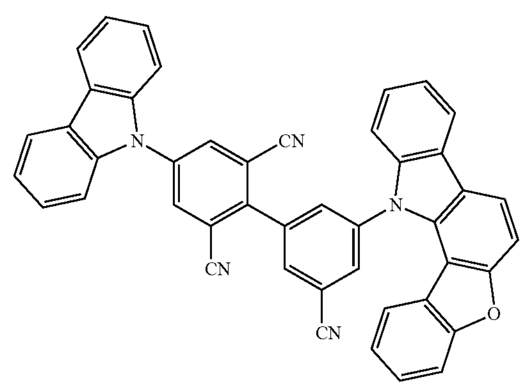
117
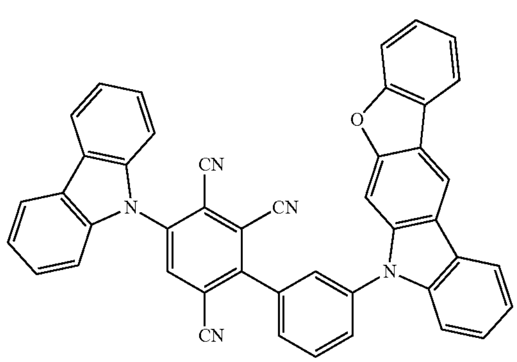
118
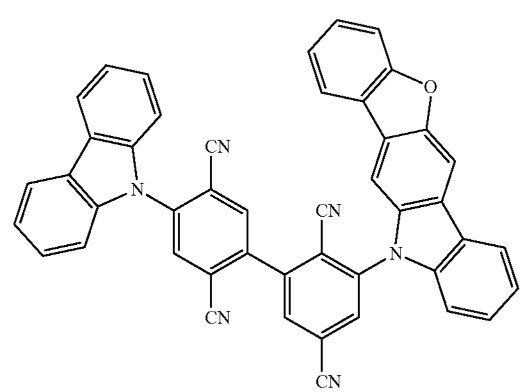

-continued
119
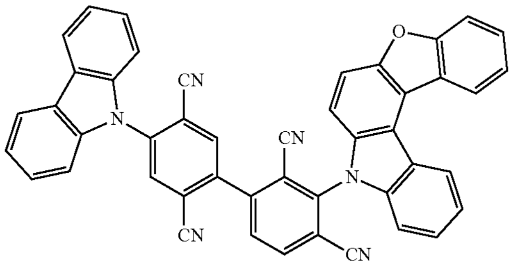
120
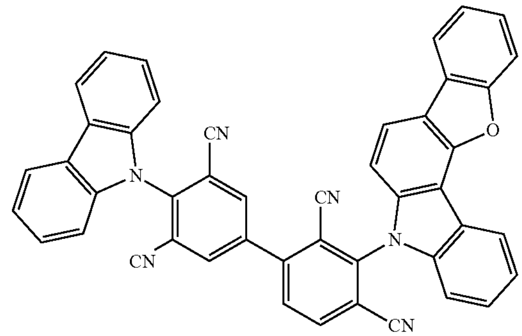
121
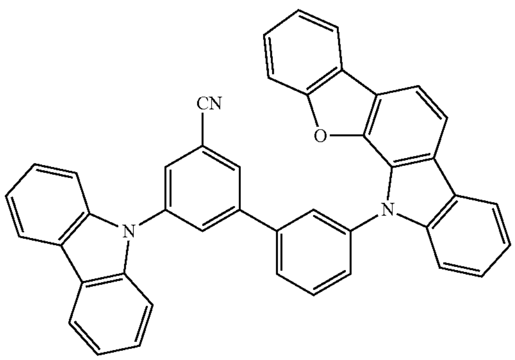
122
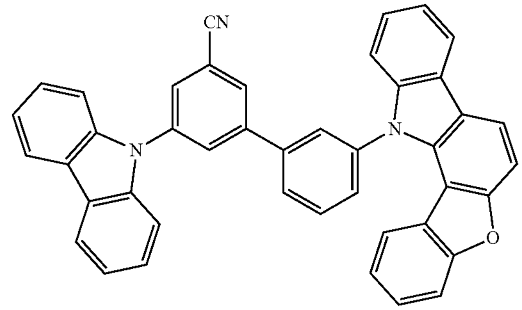
123
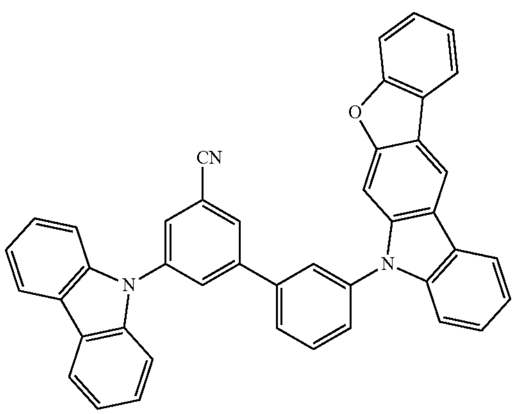
124
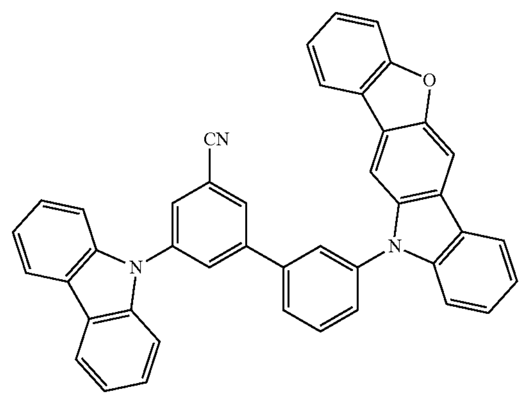
125
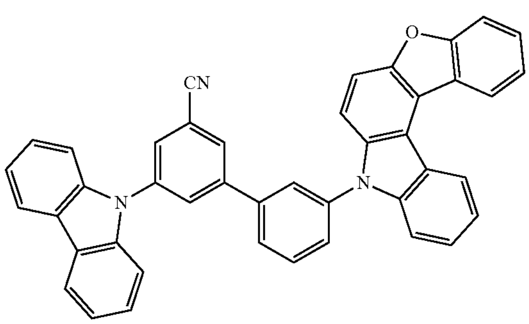
126
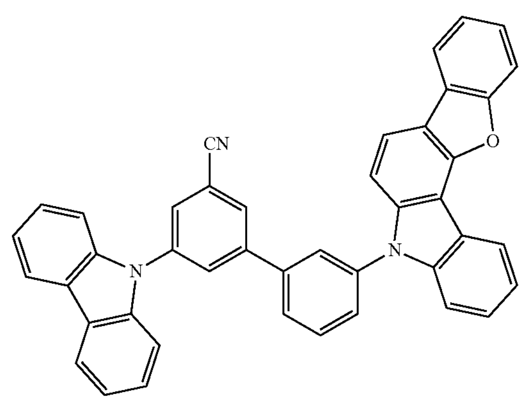

-continued
127
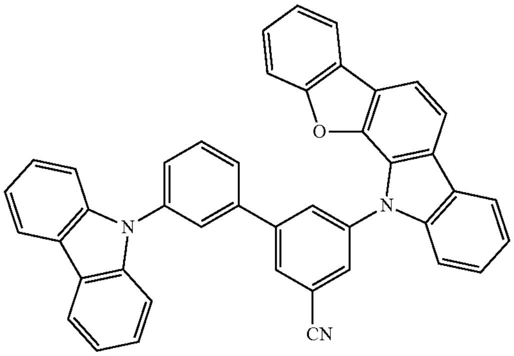
128
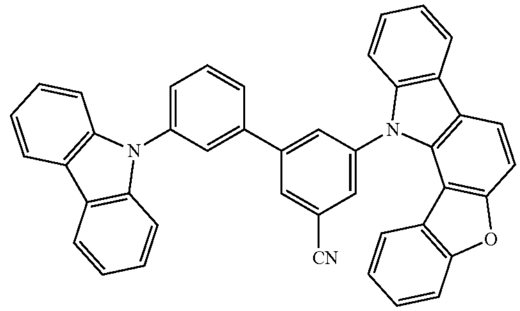
129
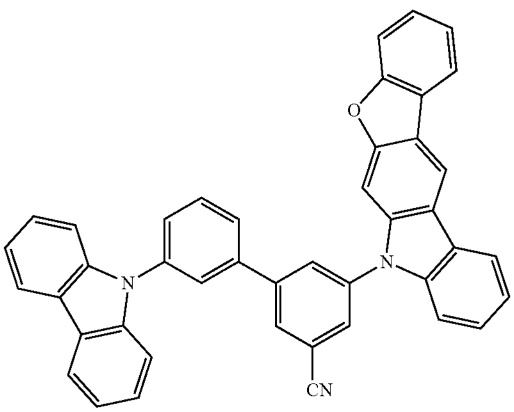
130
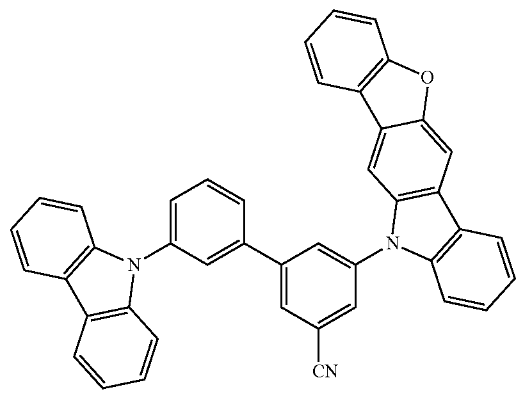
131
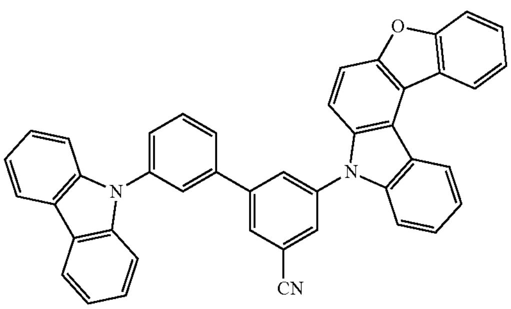
132
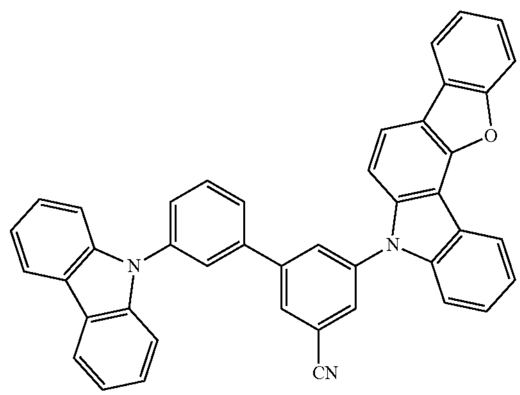
-continued
133
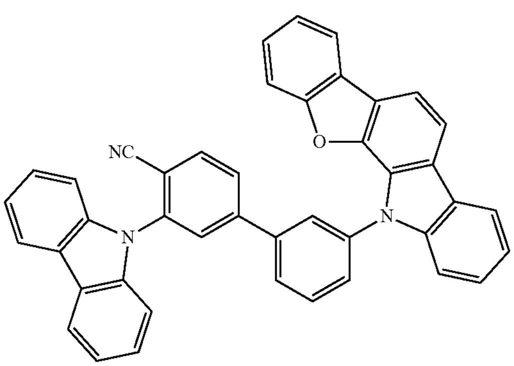
134
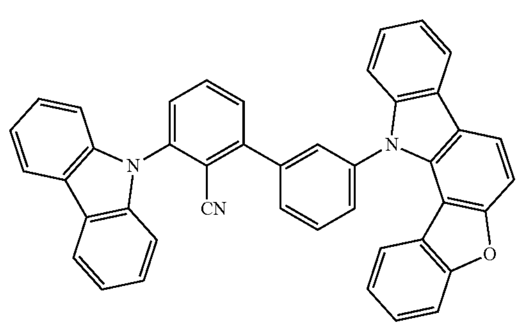

135
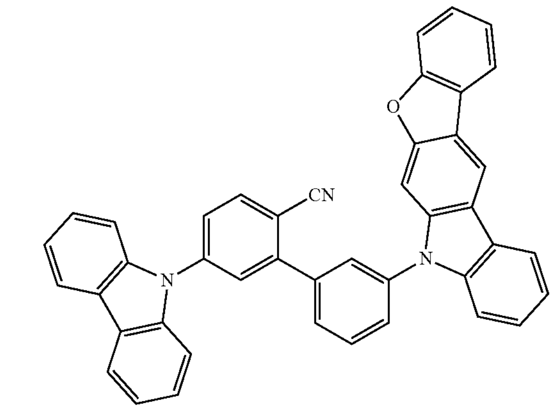
136
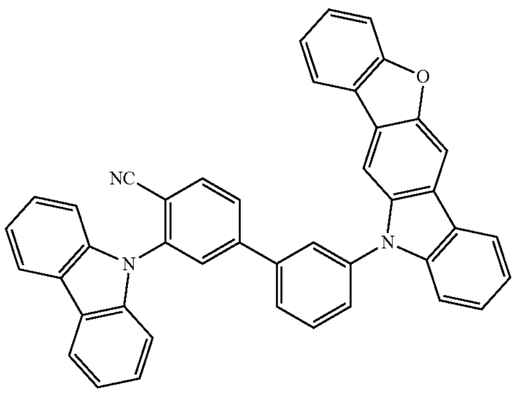
137
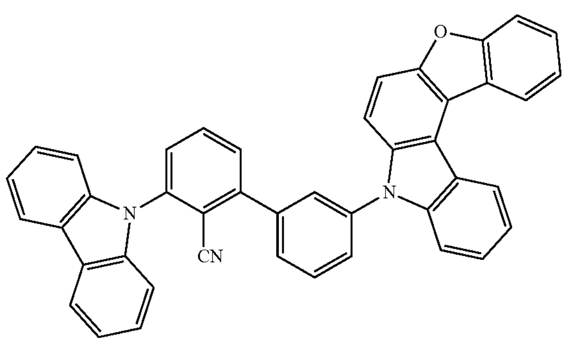
138
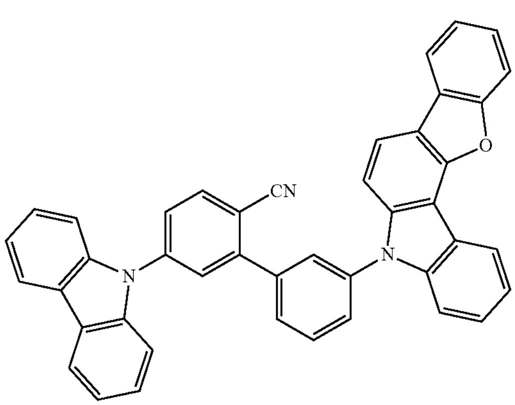
139
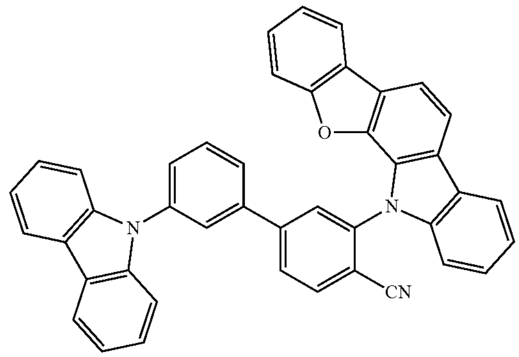
140
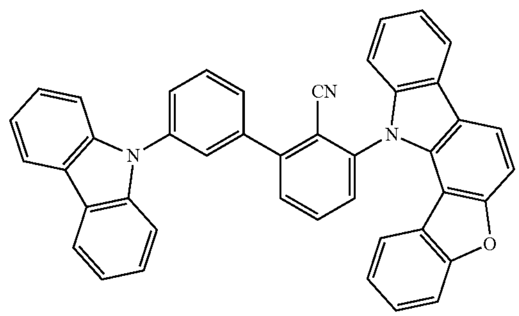
141
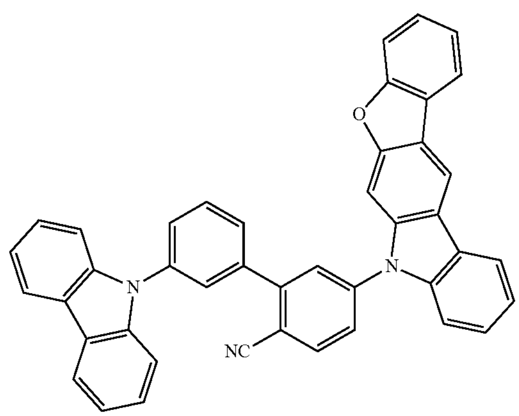
142
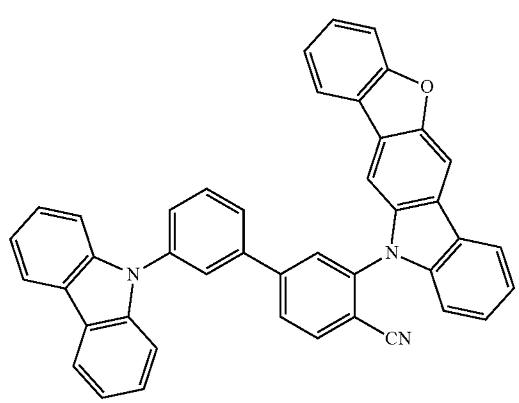

-continued
143
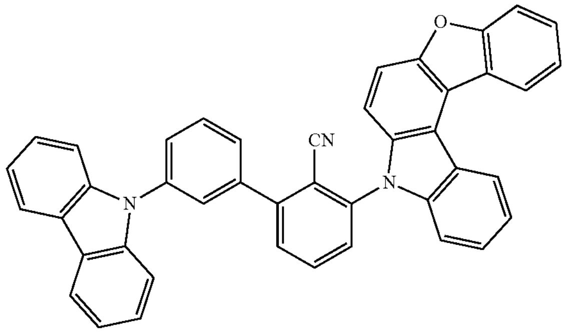
144
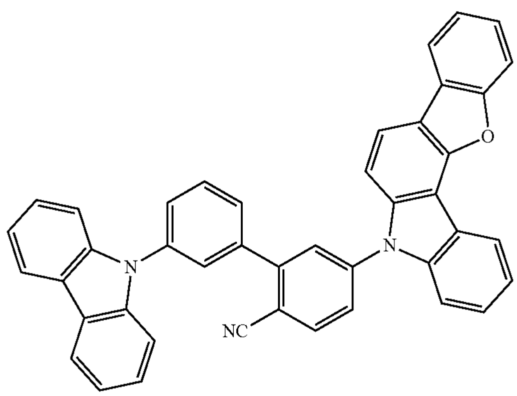
145
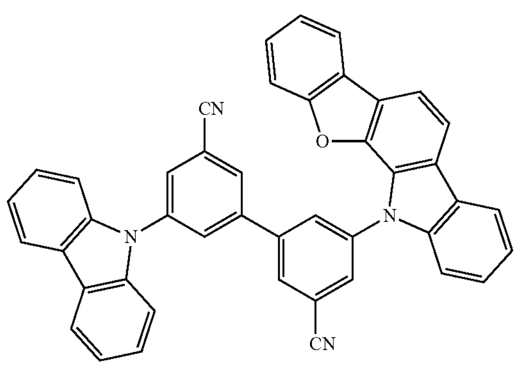
146
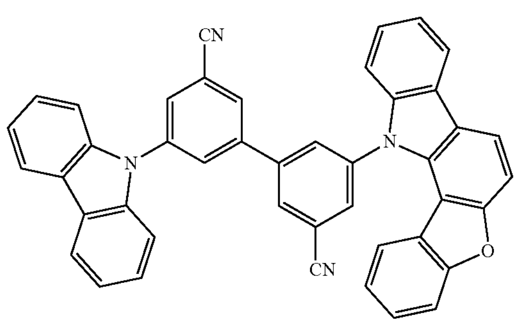
-continued
147
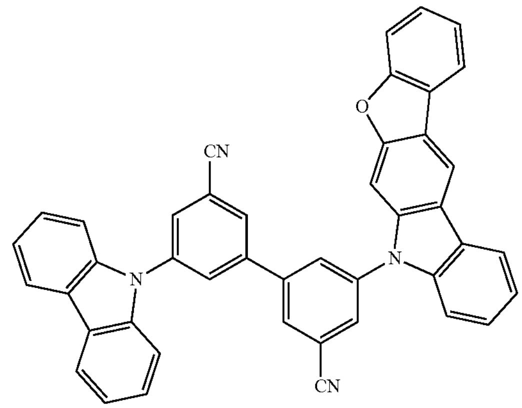
148
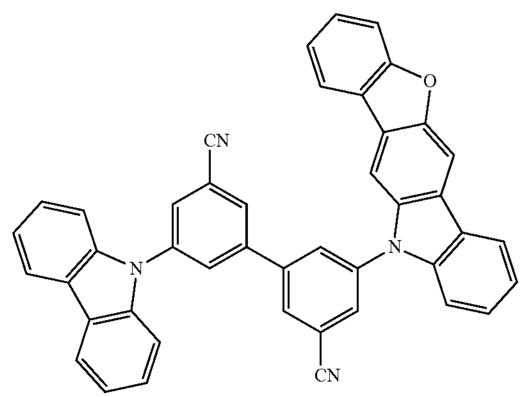
149
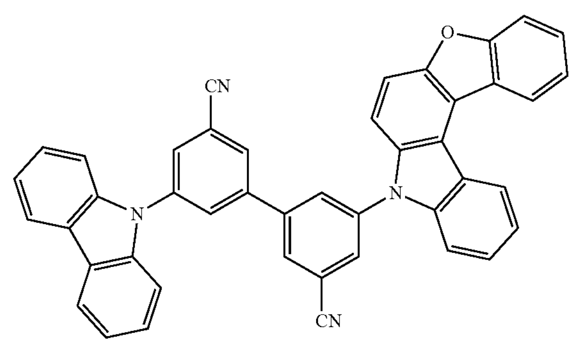
150
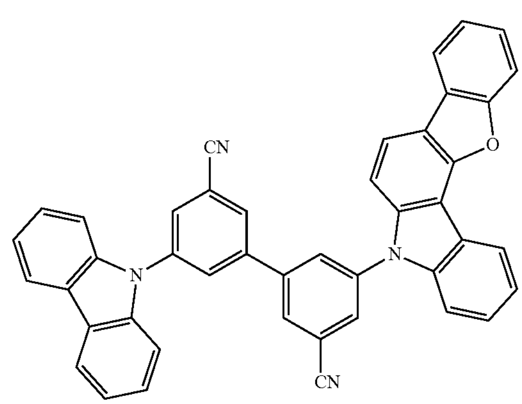

151
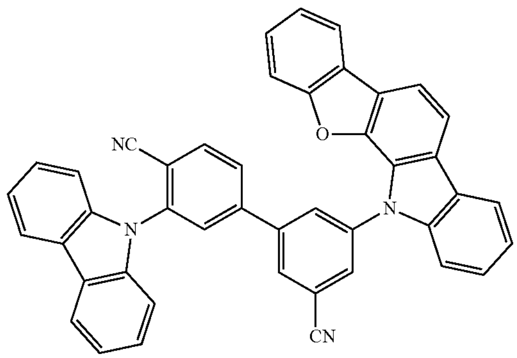
152
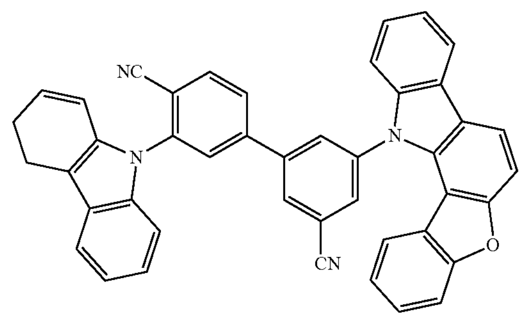
153
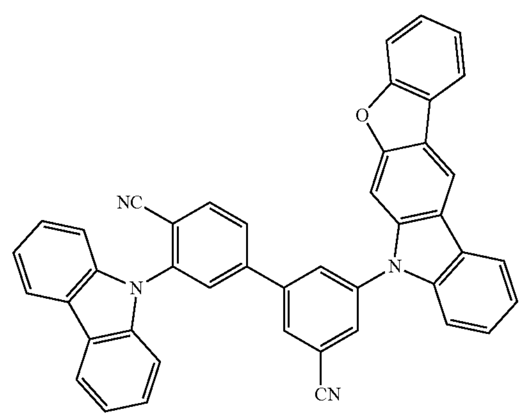
154
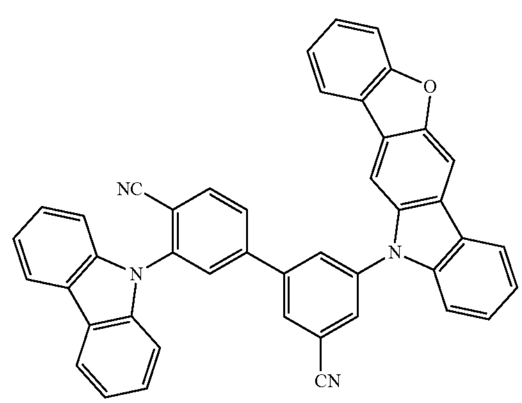
155
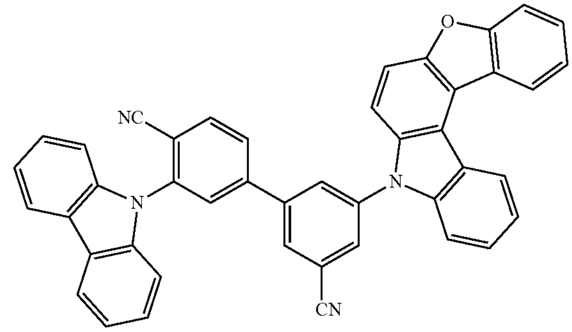
156
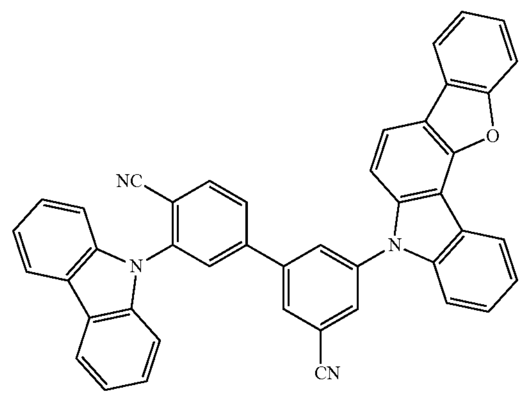
157
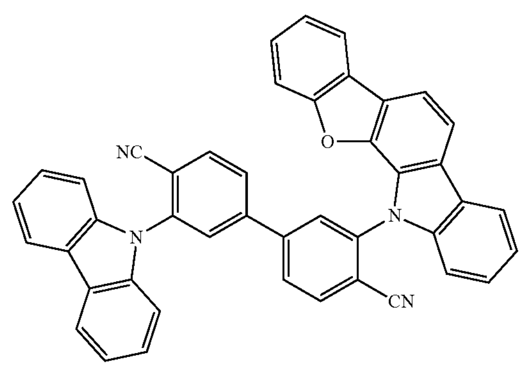
158
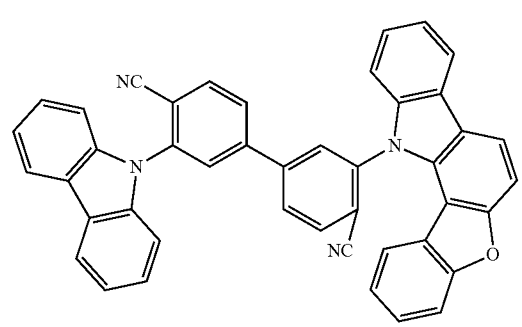

-continued
159
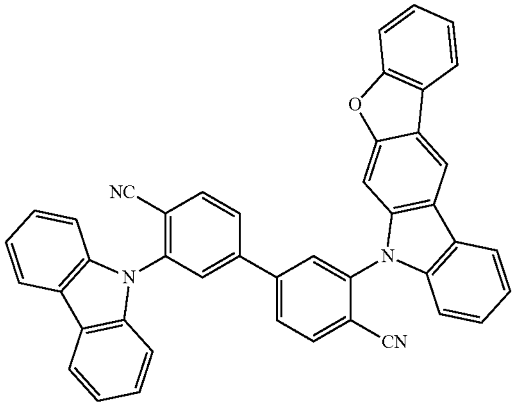
160
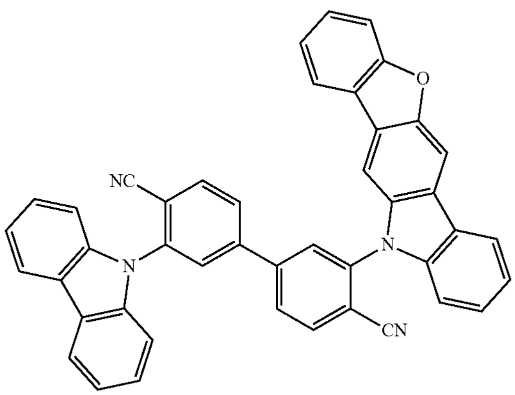
161
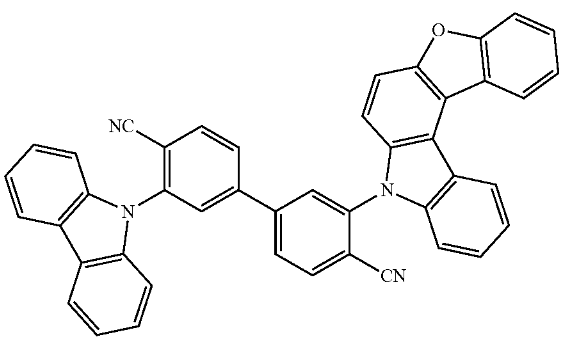
162
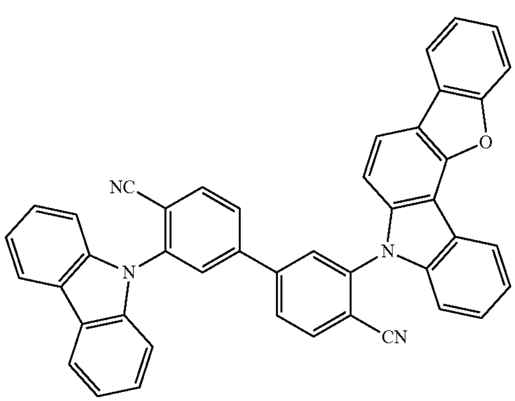
-continued
163
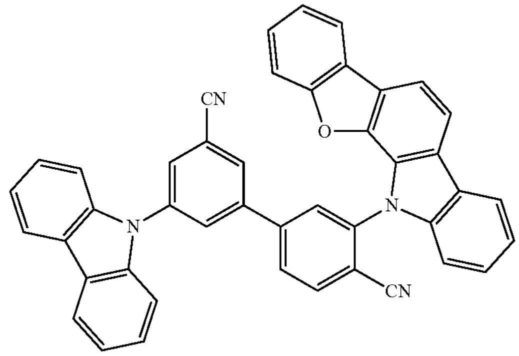
164
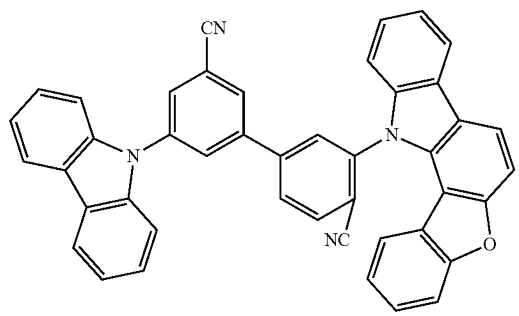
165
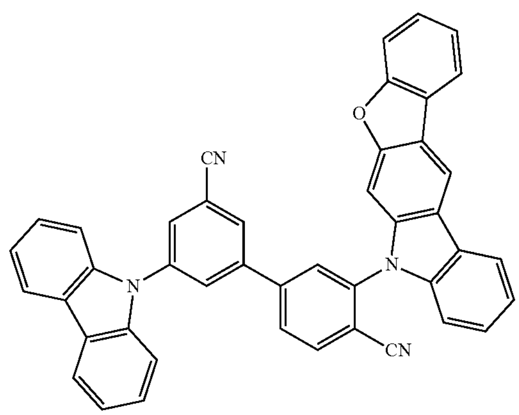
166
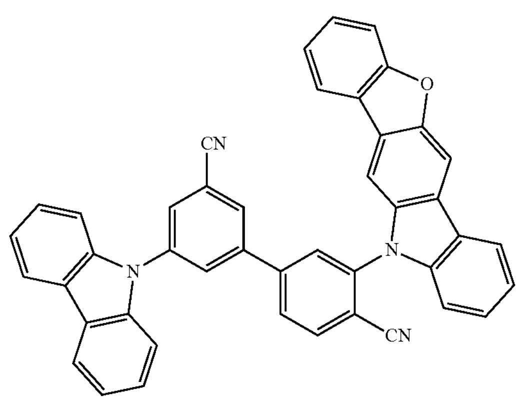

-continued
167
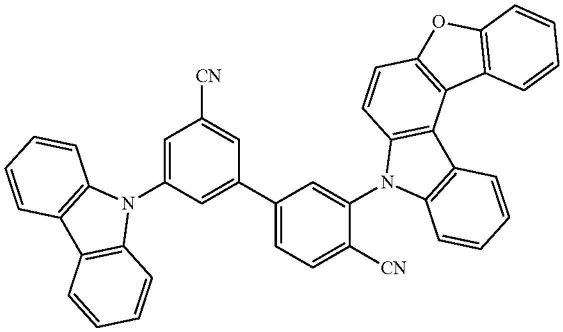
168
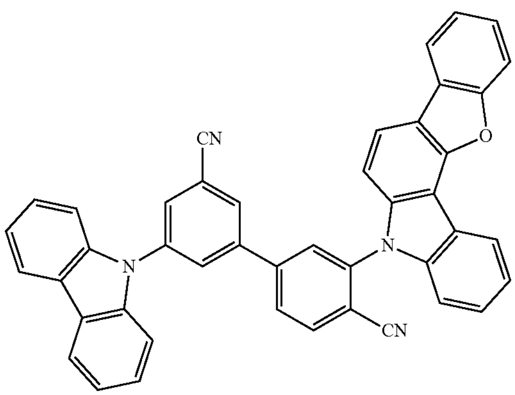
169
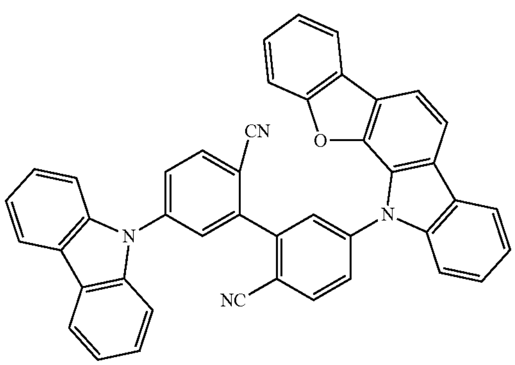
170
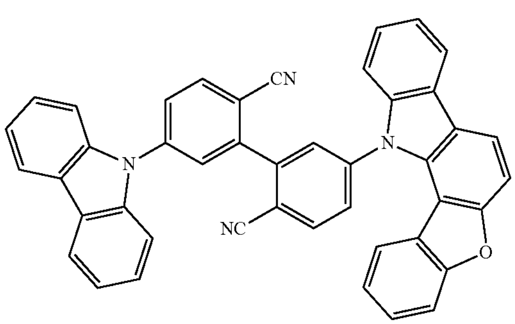
-continued
171
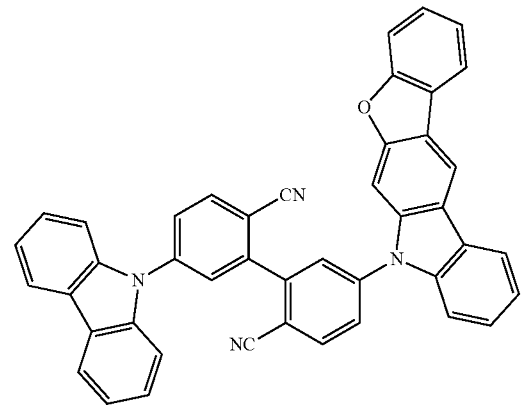
172
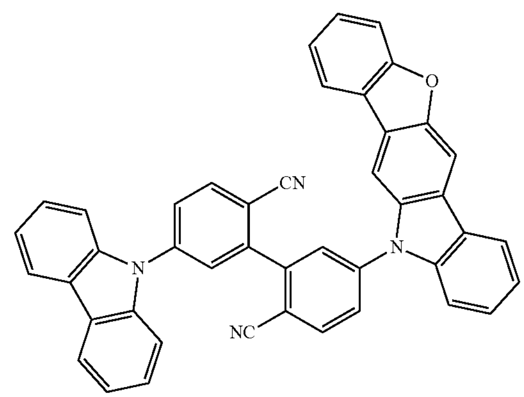
173
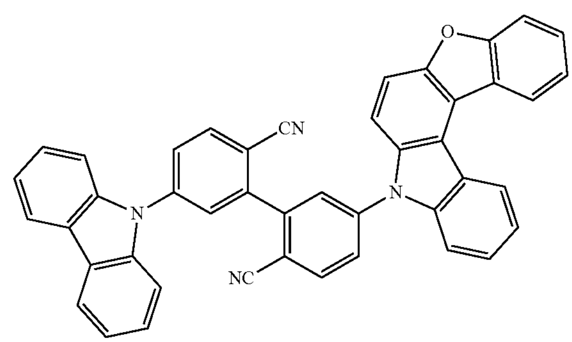
174
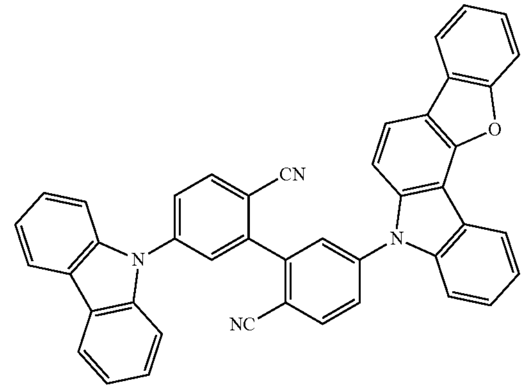

-continued
175
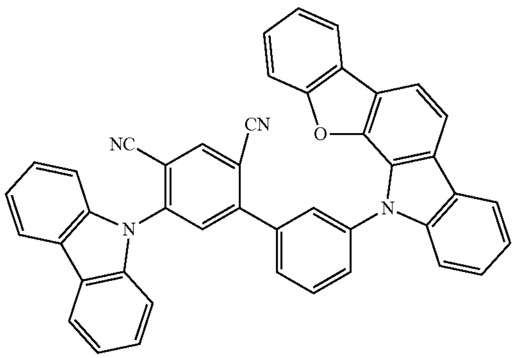
176
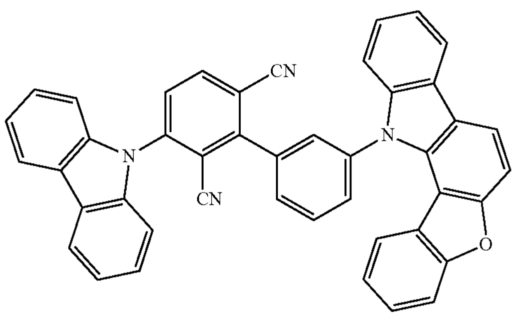
177
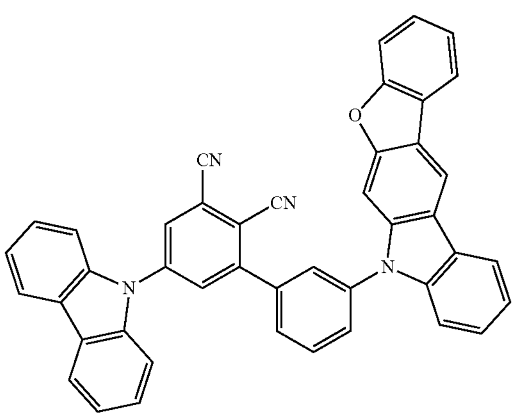
178
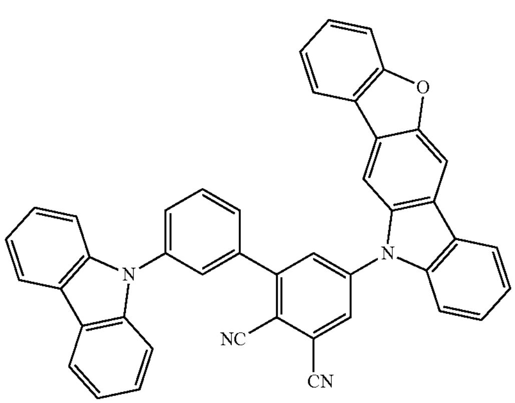
-continued
179
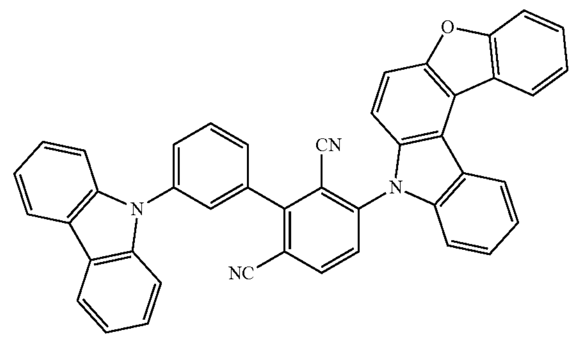
180
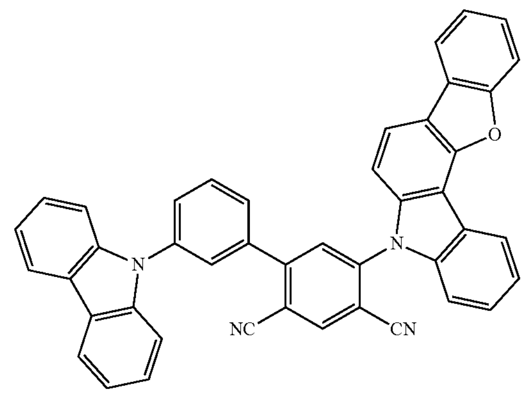
181
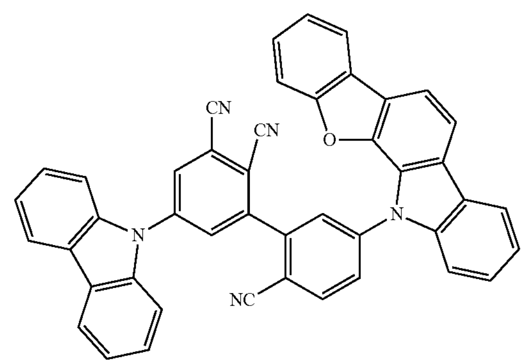
182
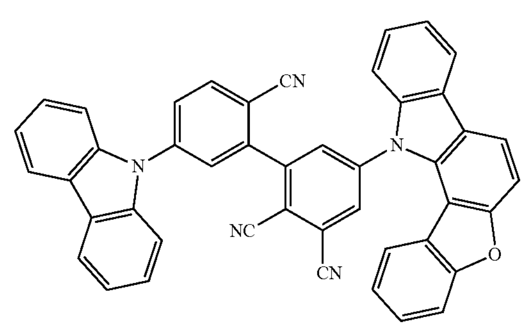

-continued
183
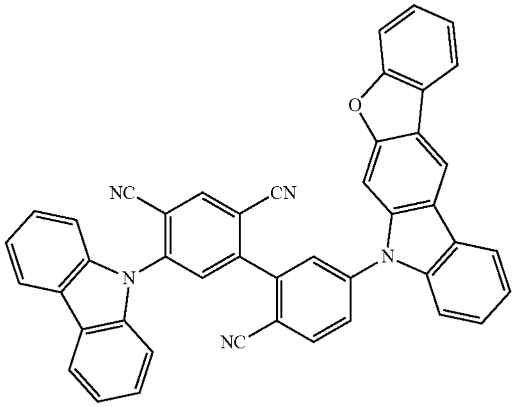
184
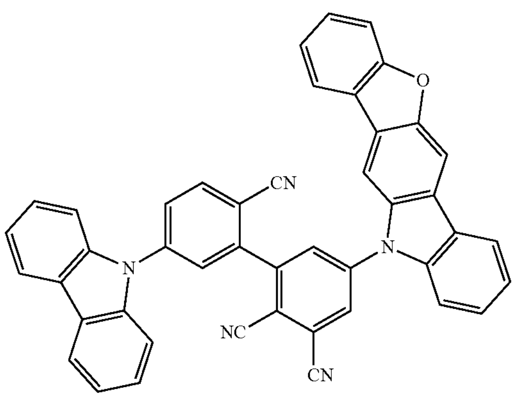
185
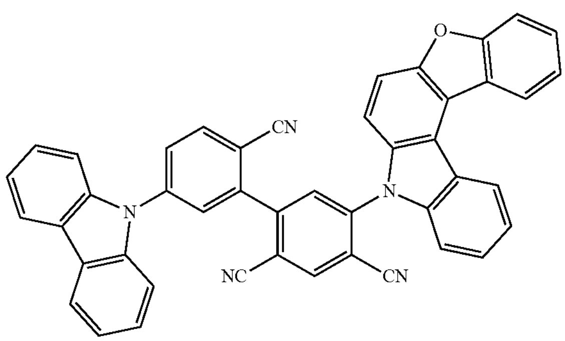
186
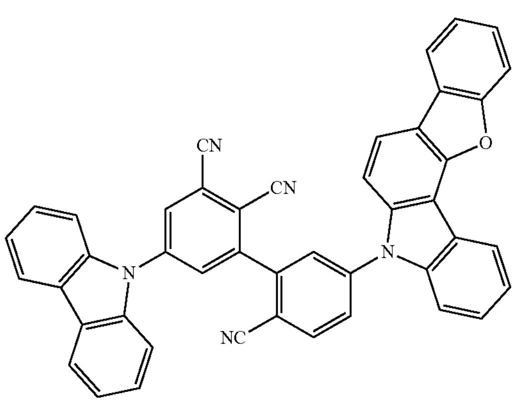
-continued
187
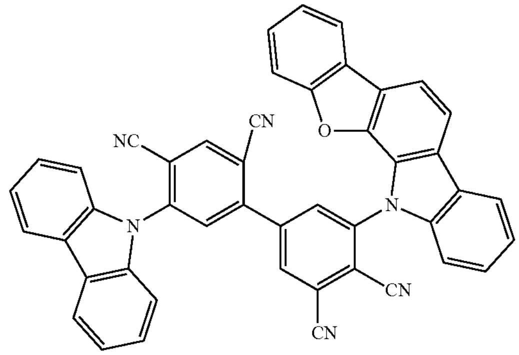
188
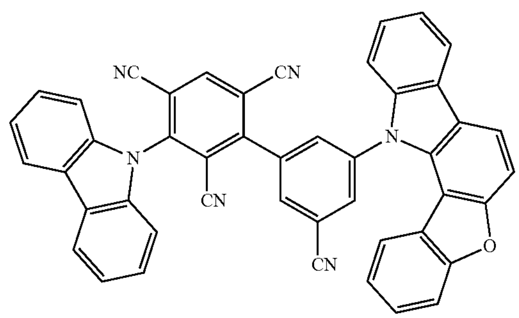
189
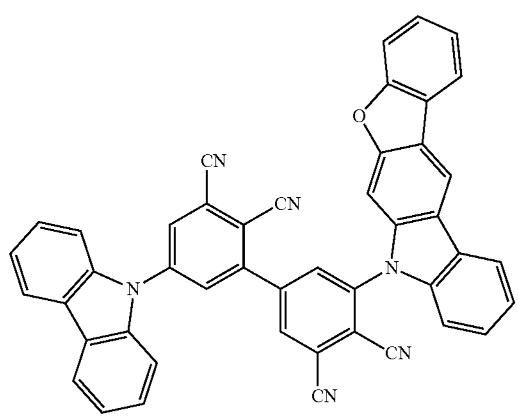
190
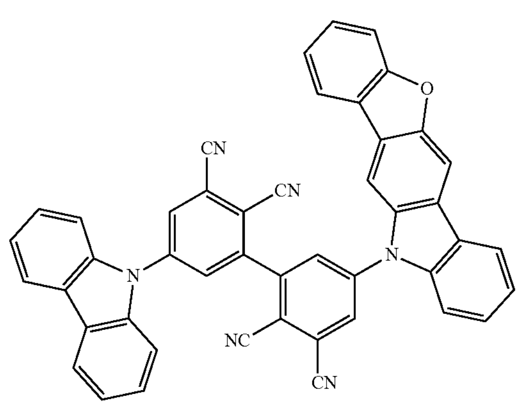

-continued
191
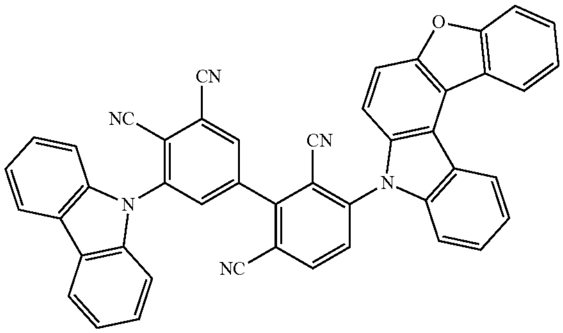
192
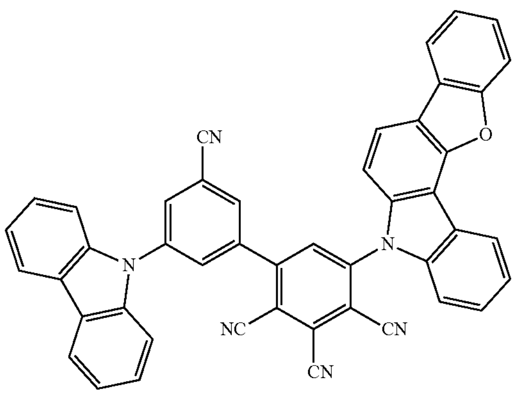
193
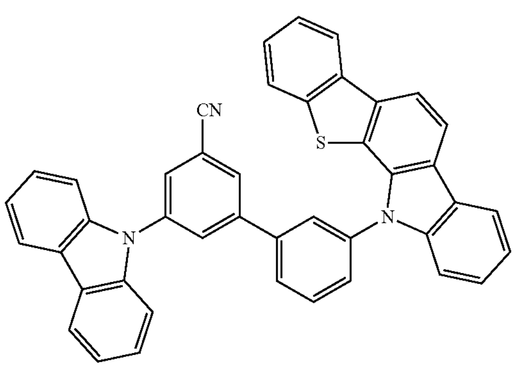
194
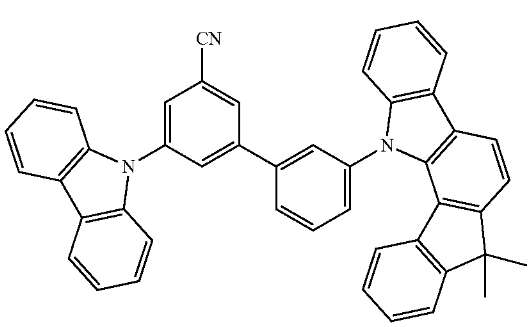
-continued
195
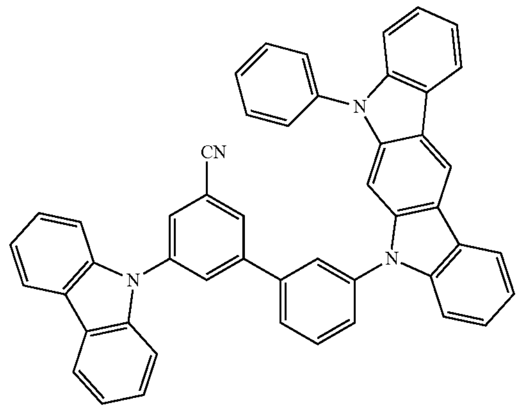
196
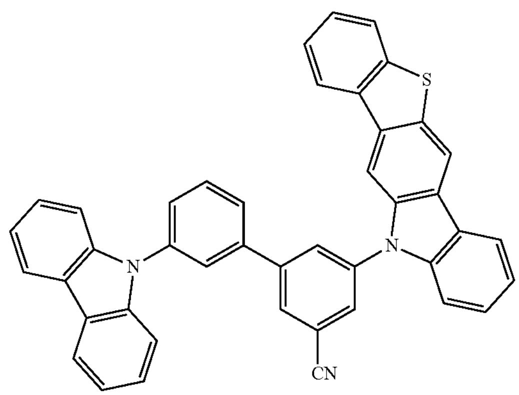
197
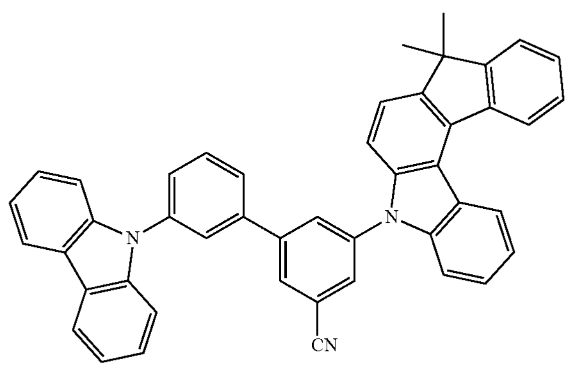
198
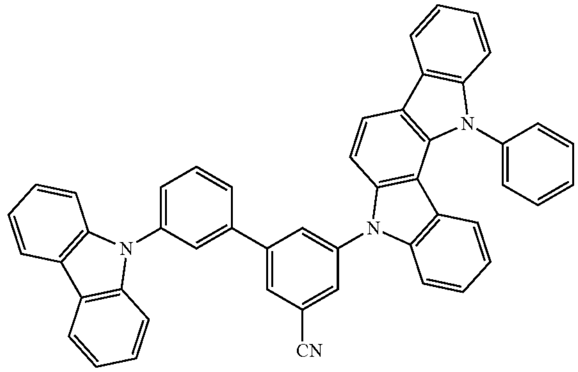

-continued
199
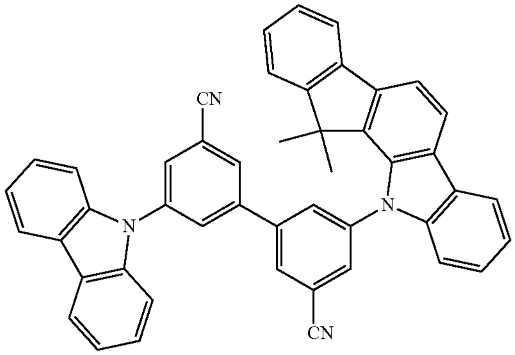
200
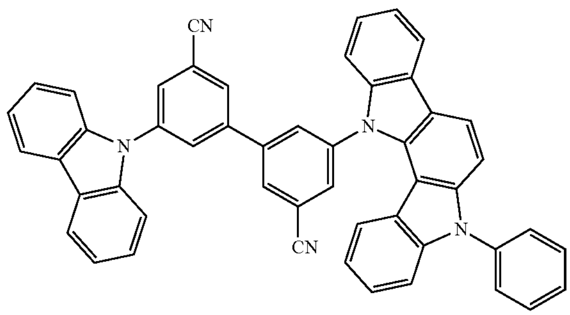
201
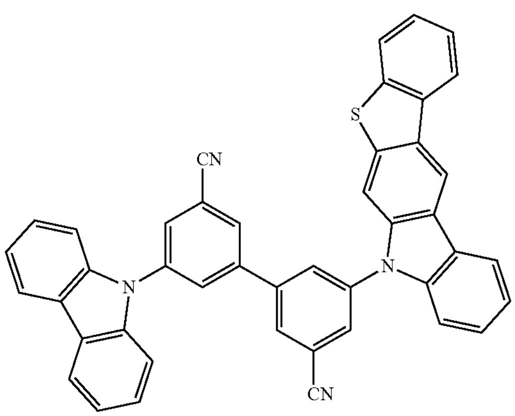
202
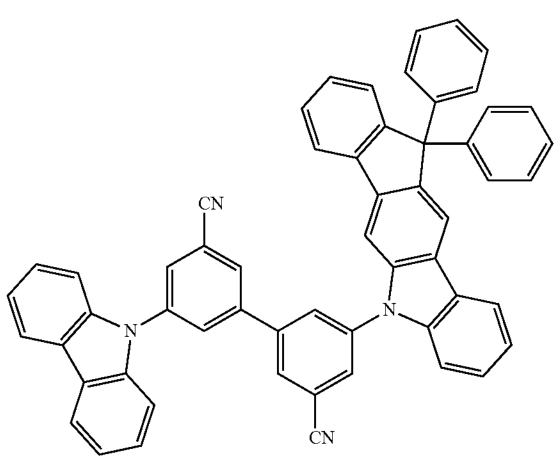
-continued
203
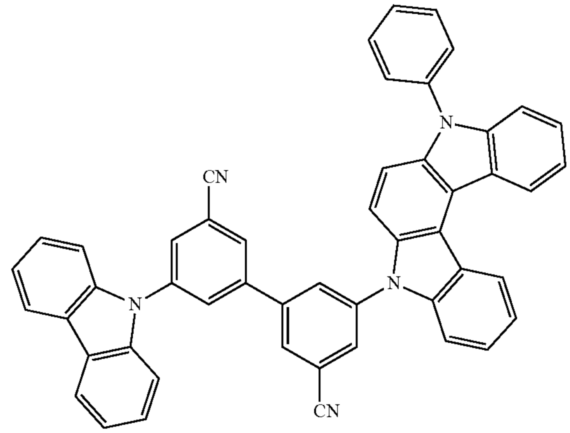
204
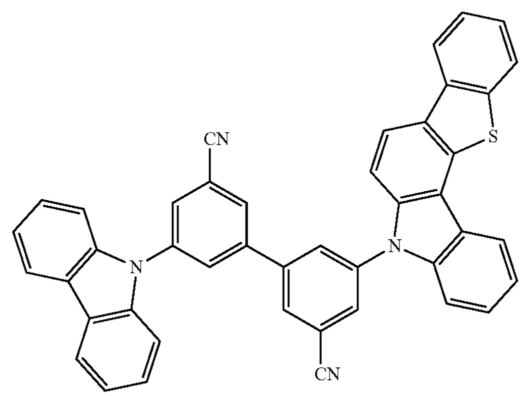
205
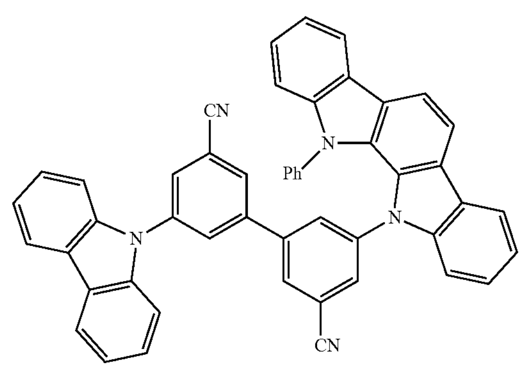
206
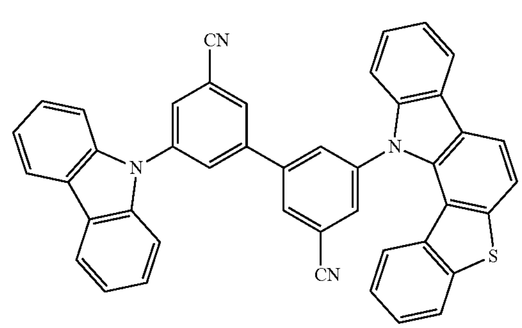

-continued
207
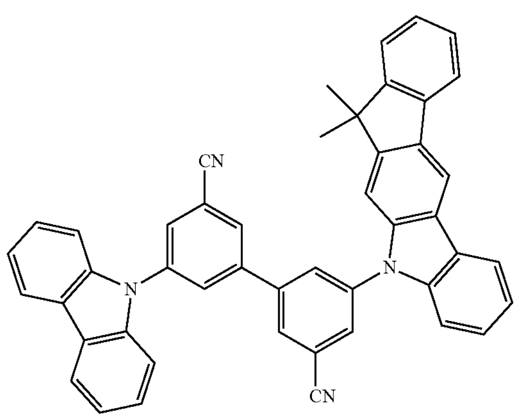
208
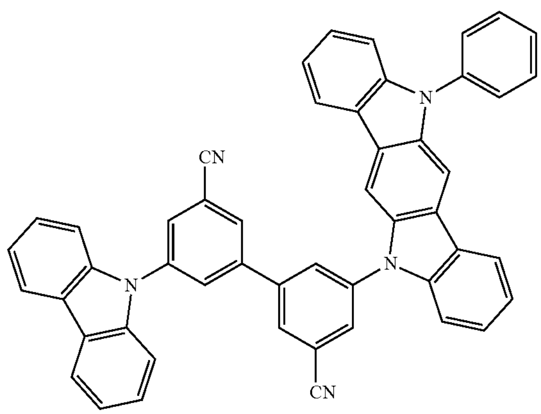
209
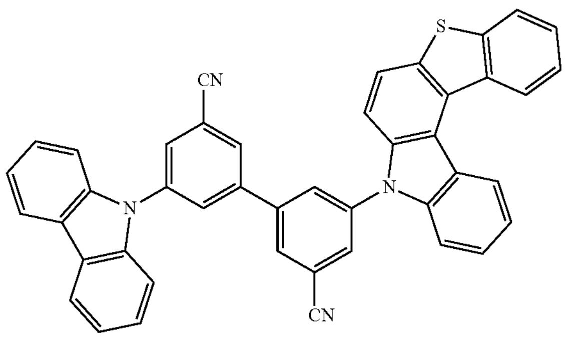
210
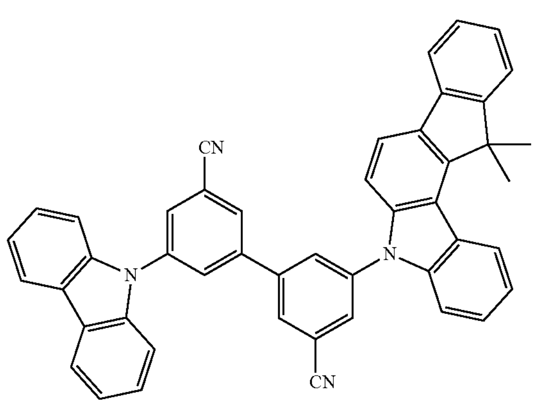
-continued
211
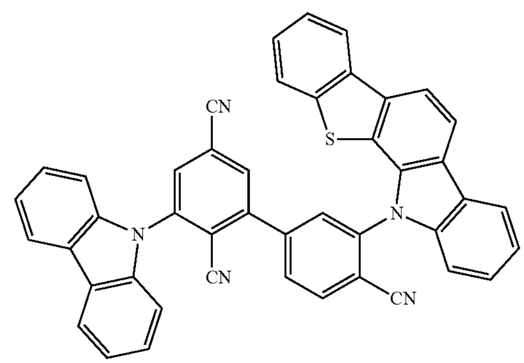
212
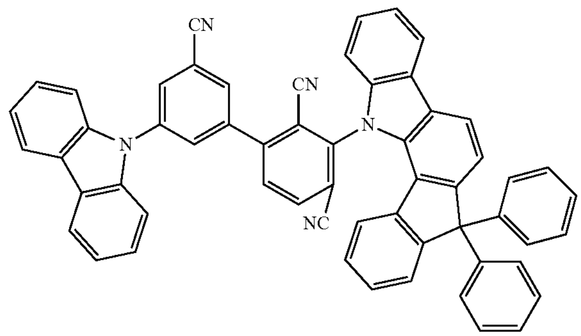
213
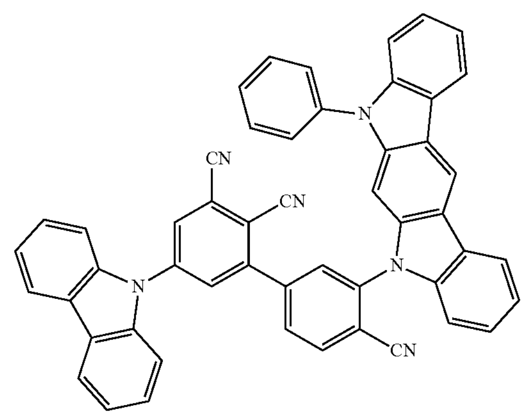
214
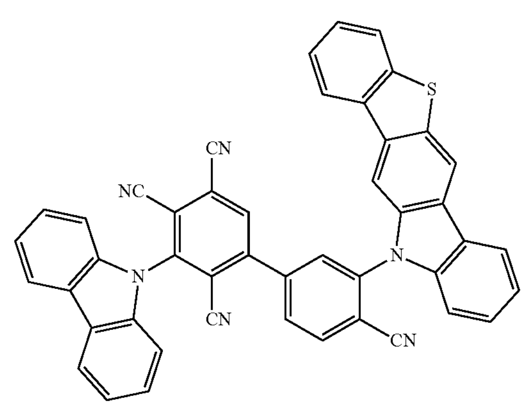

-continued
215
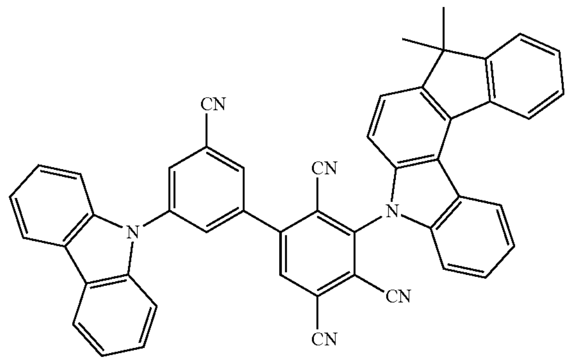
216
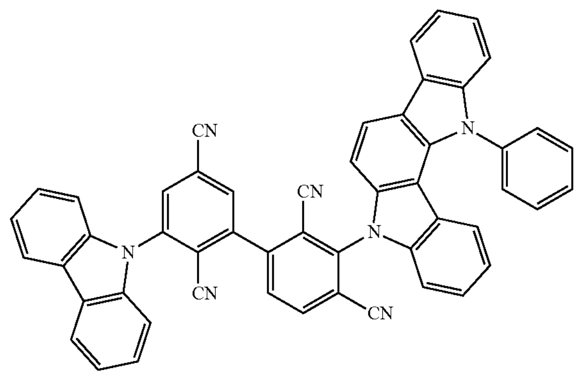
217
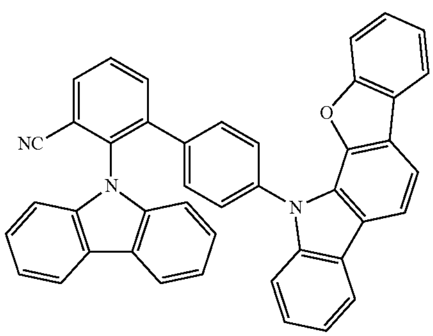
218
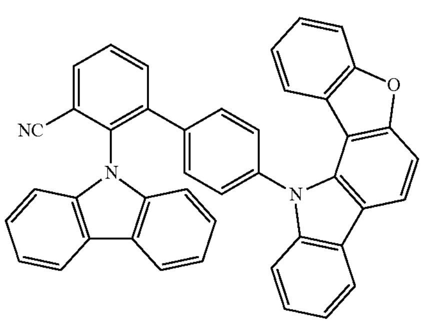
-continued
219
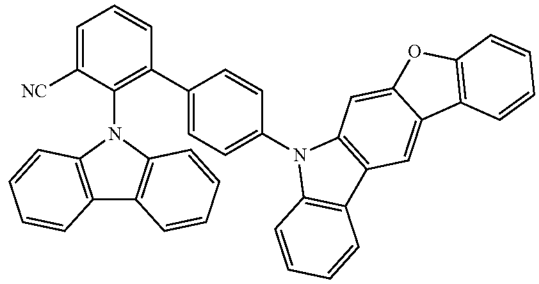
220
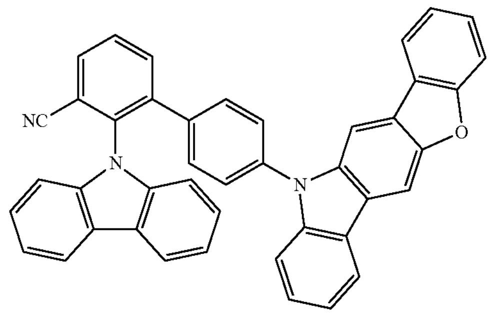
221
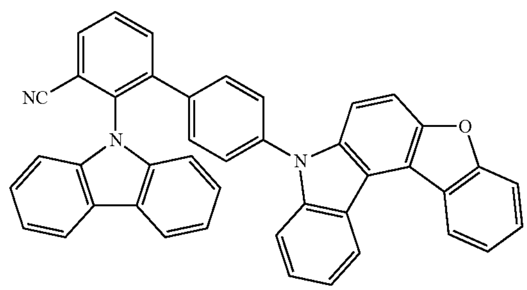
222
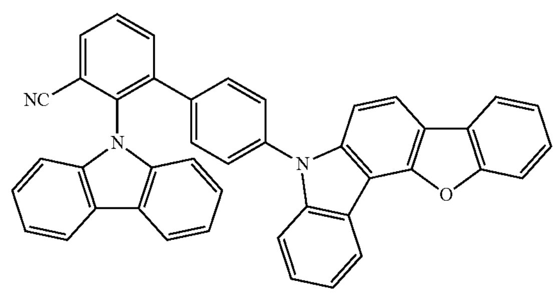
223
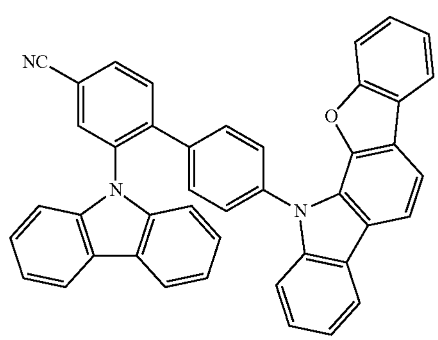

224
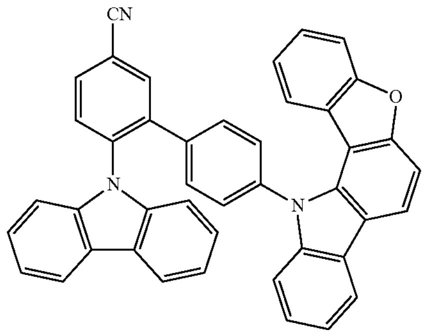
225
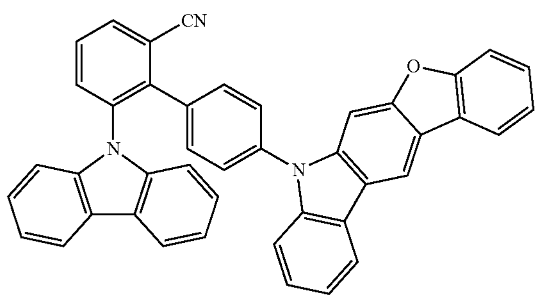
226
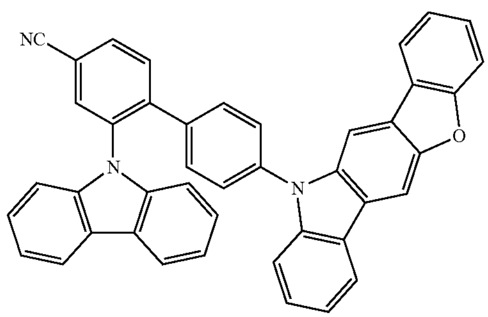
227
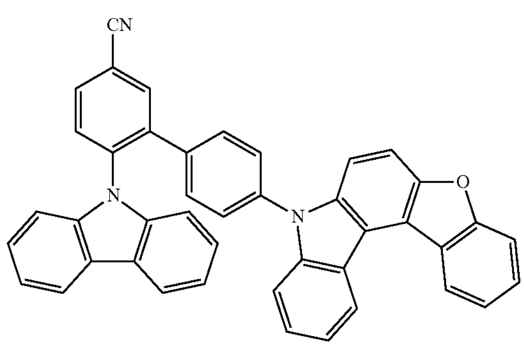
228
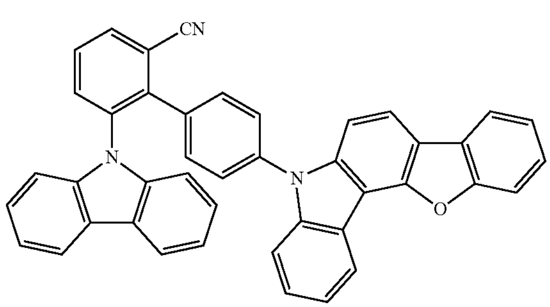
229
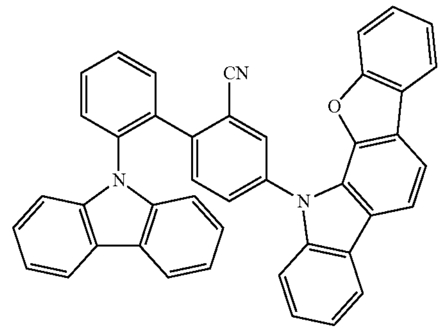
230
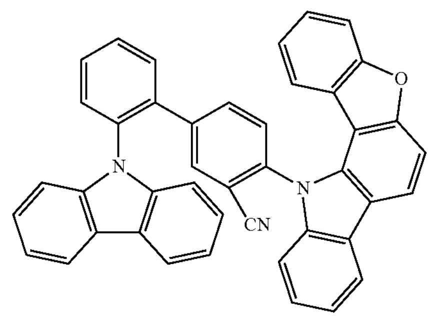
231
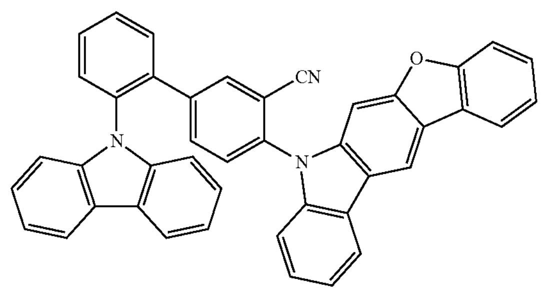
232
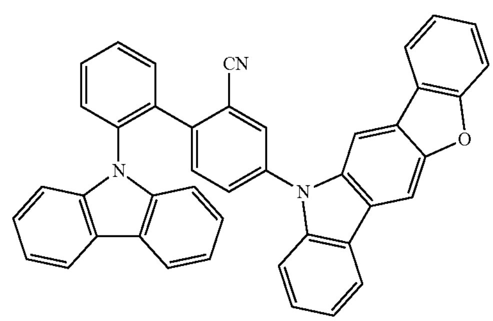
233
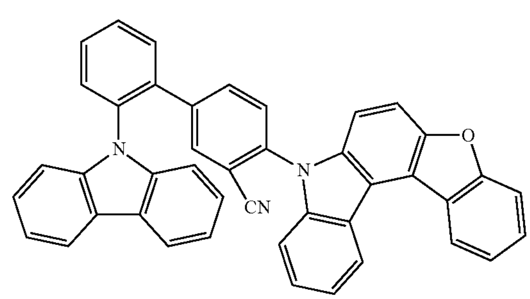

-continued
234
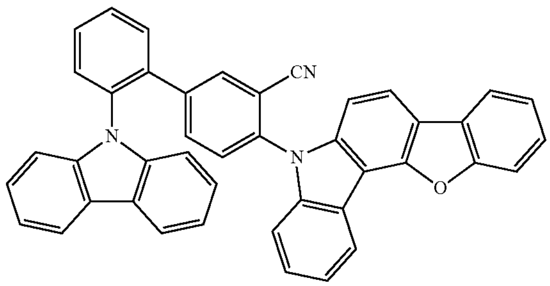
235
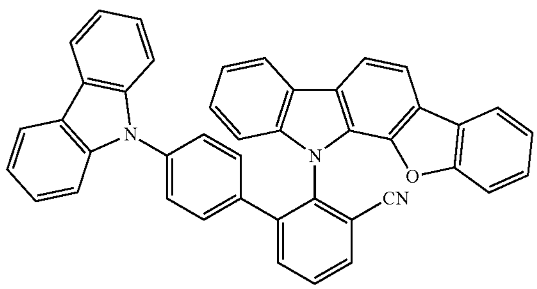
236
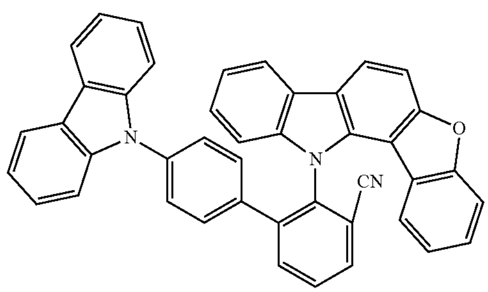
237
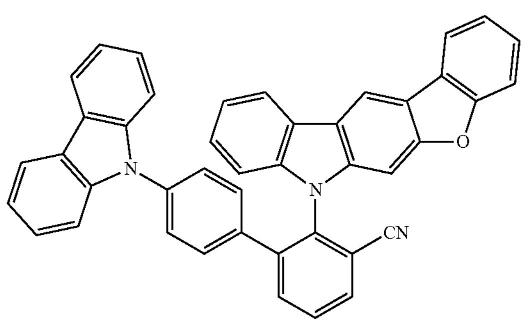
238
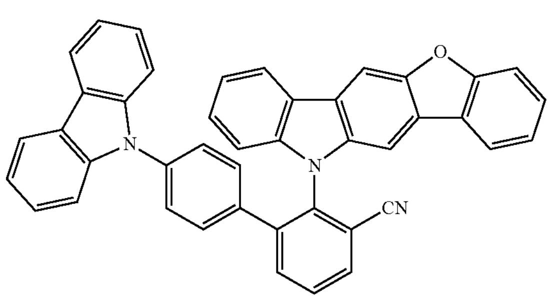
-continued
239
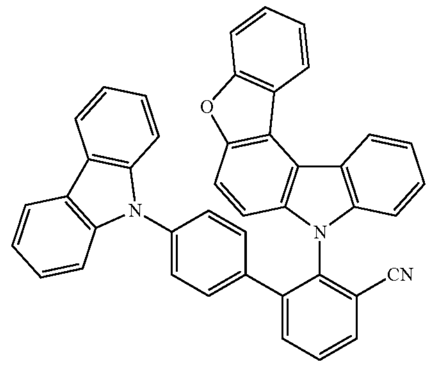
240
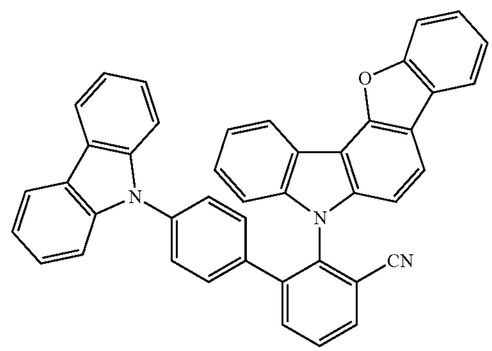
241
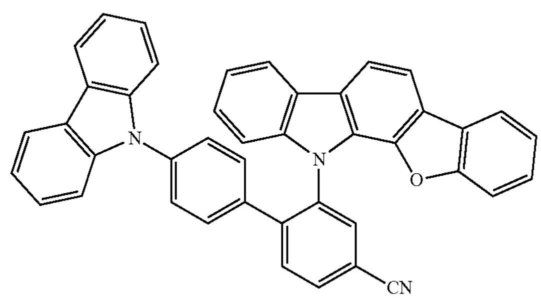
242
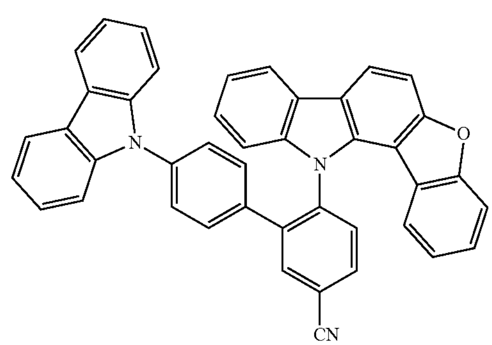

243
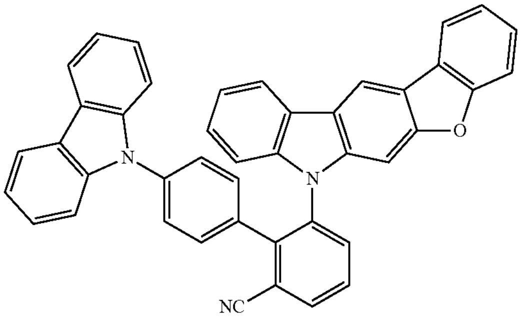
244
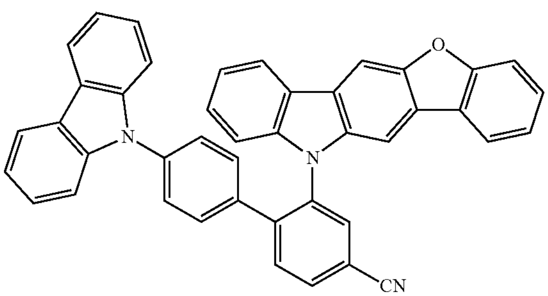
245
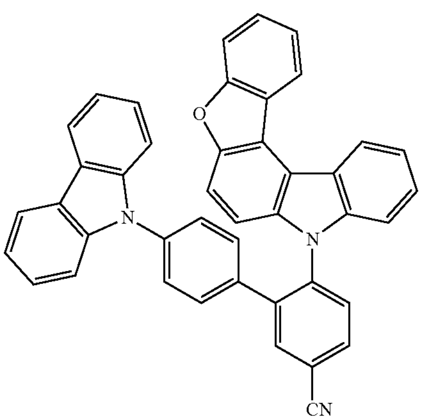
246
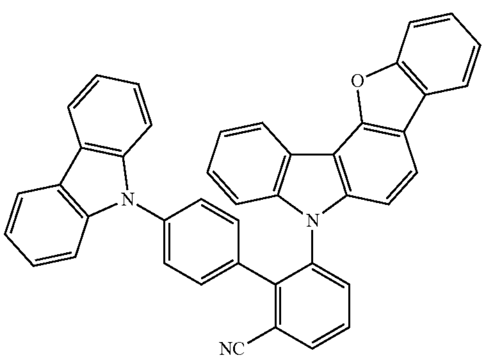
247
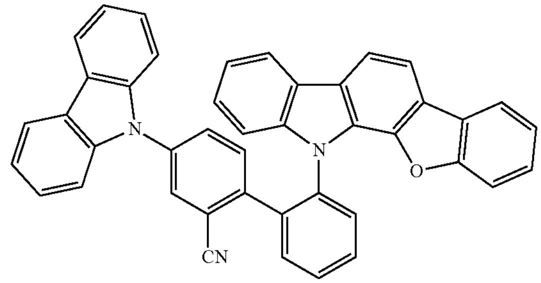
248
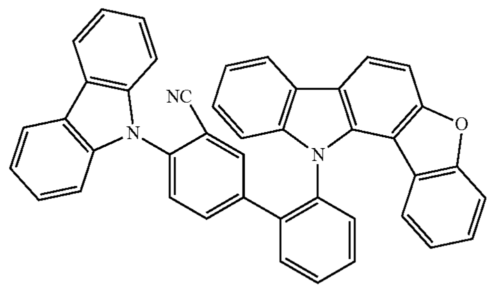
249
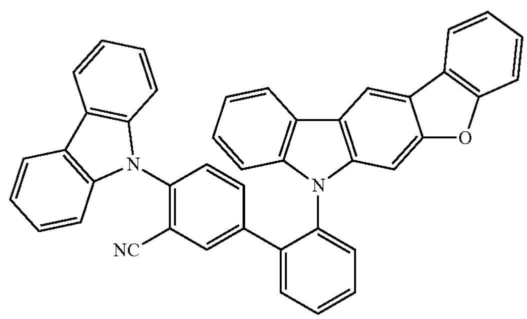
250
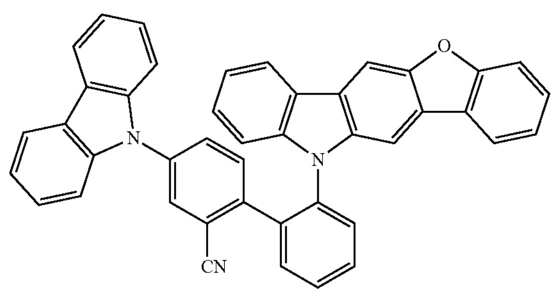
251
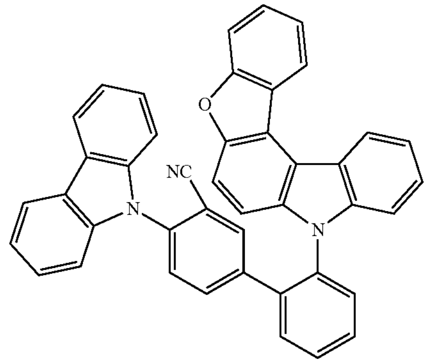

-continued
252
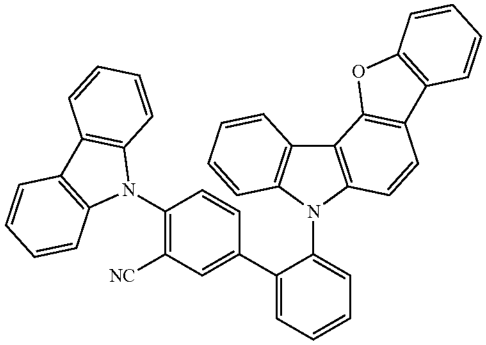
253
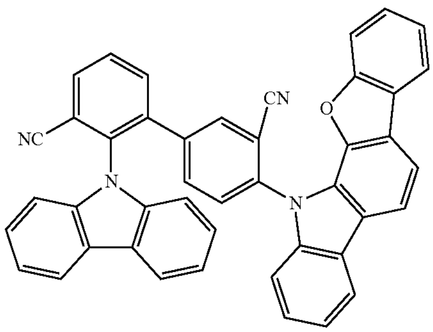
254
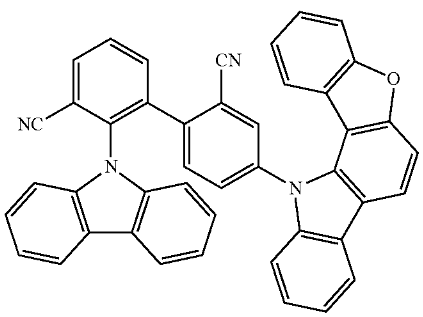
255
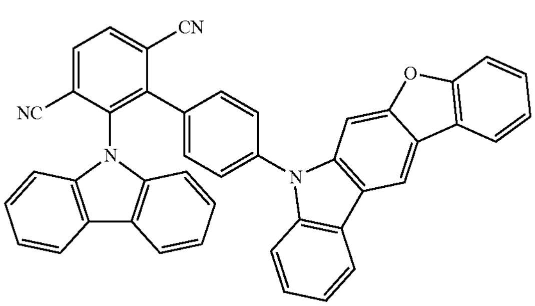
256
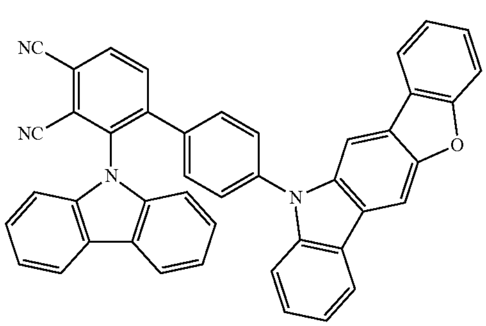
-continued
257
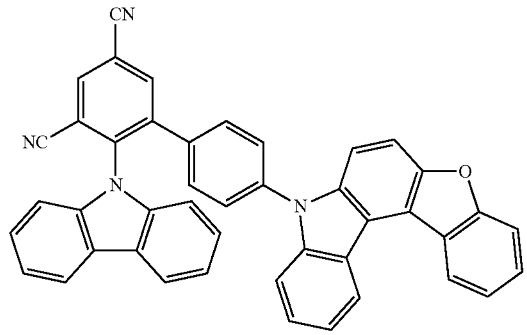
258
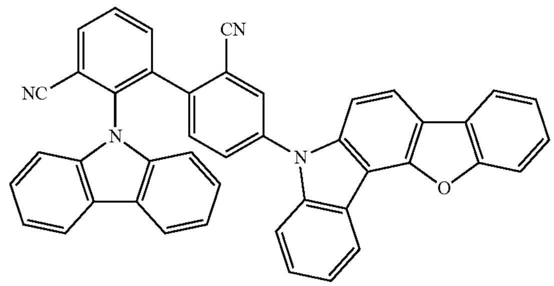
259
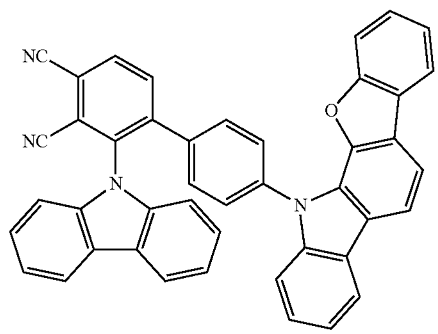
260
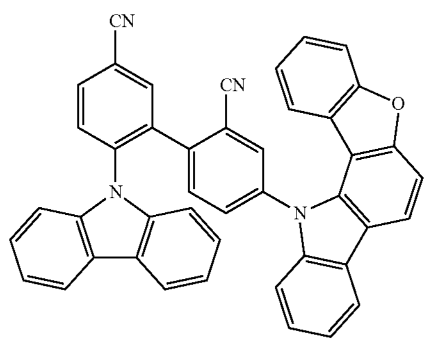
261
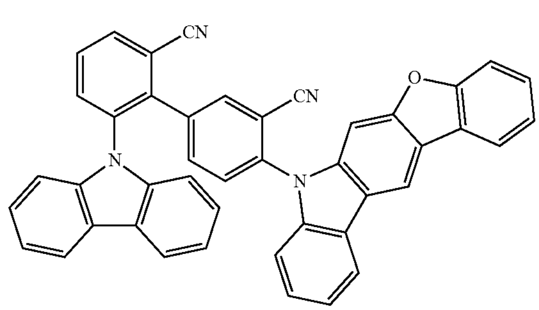

-continued
262
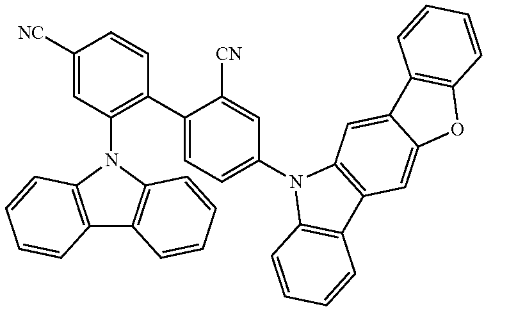
263
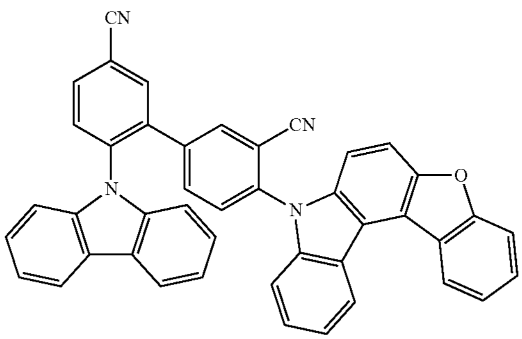
264
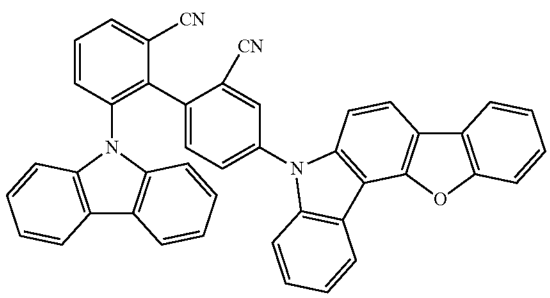
265
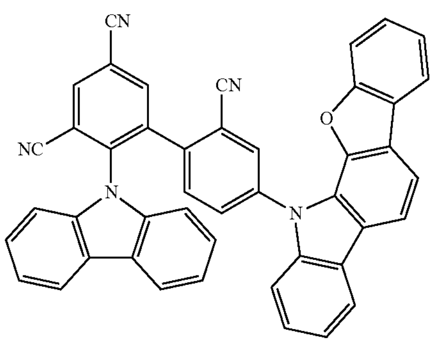
266
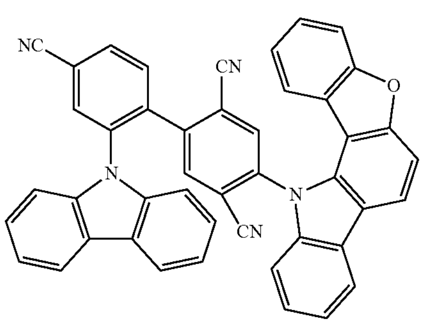
-continued
267
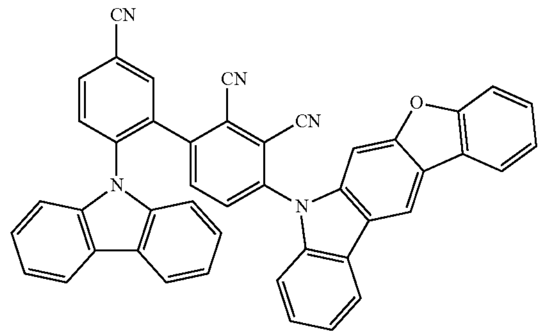
268
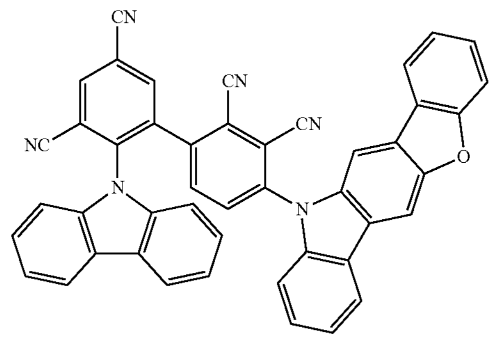
269
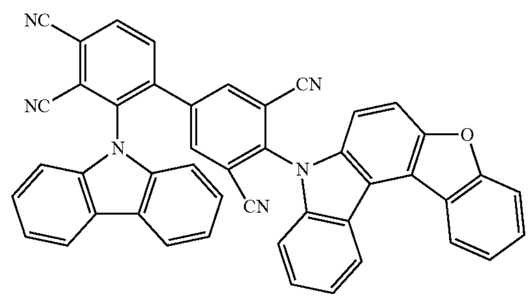
270
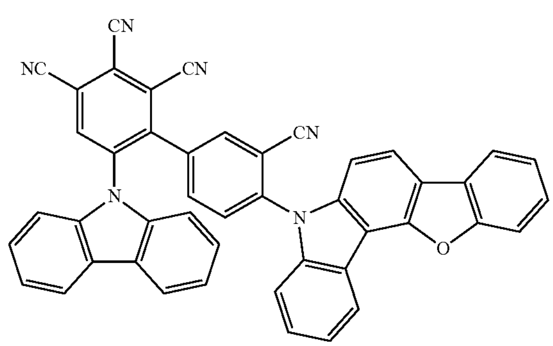

271
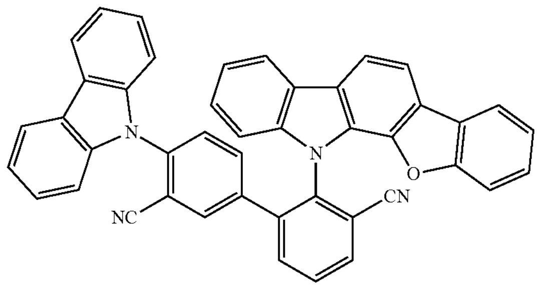
272
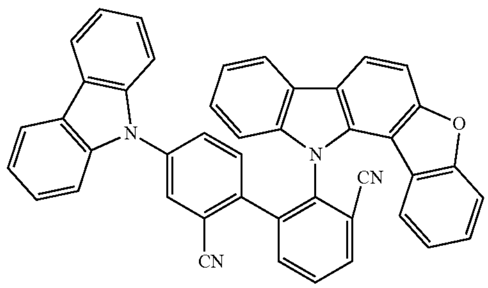
273
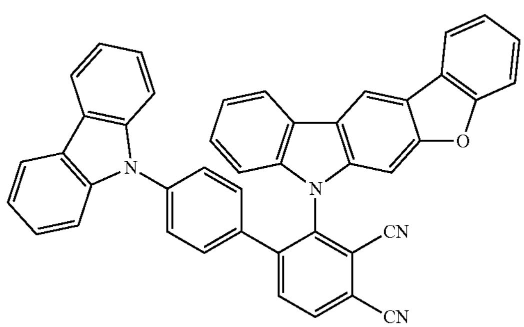
274
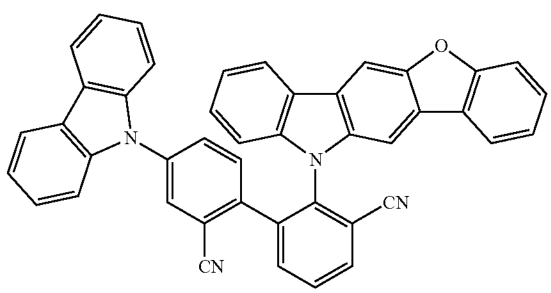
275
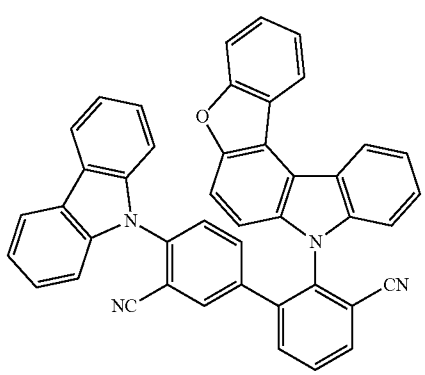
276
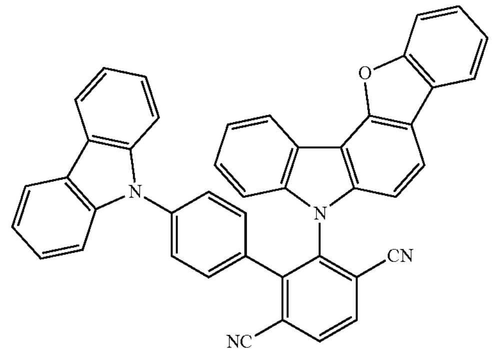
277
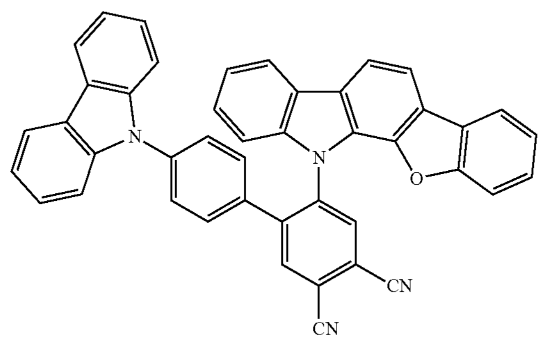
278
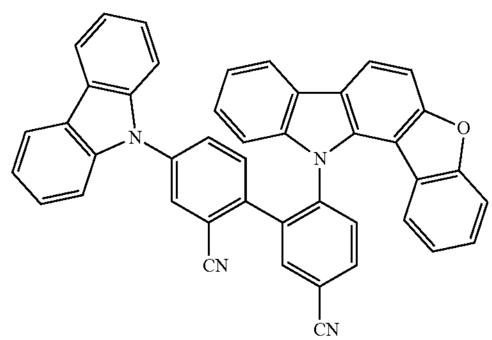
279
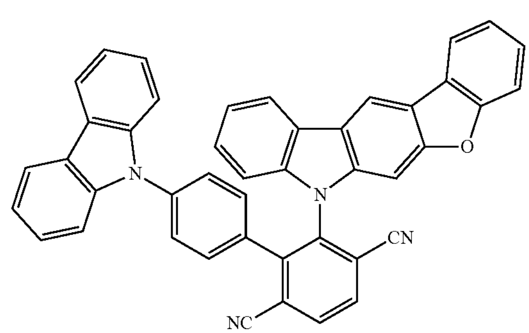

-continued
280
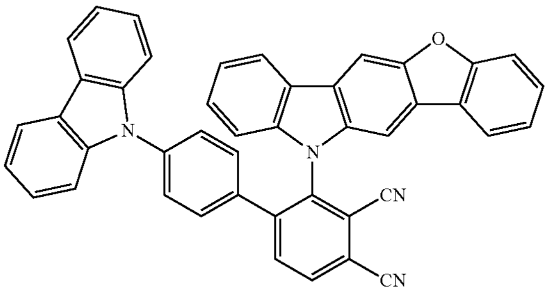
281
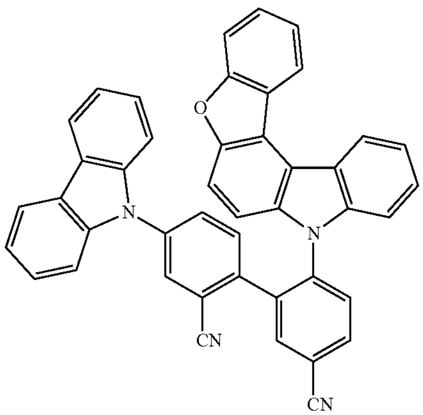
282
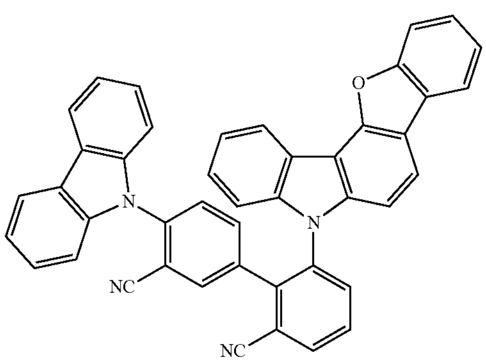
283
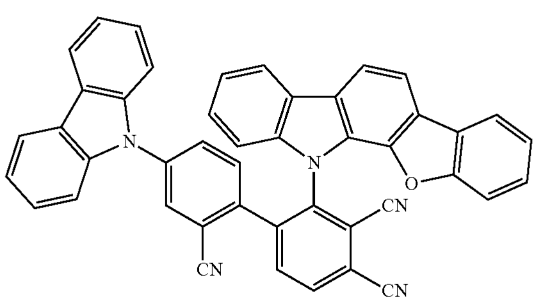
-continued
284
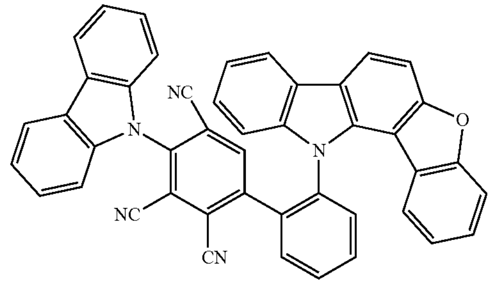
285
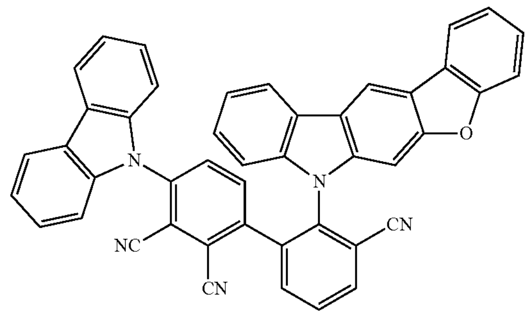
286
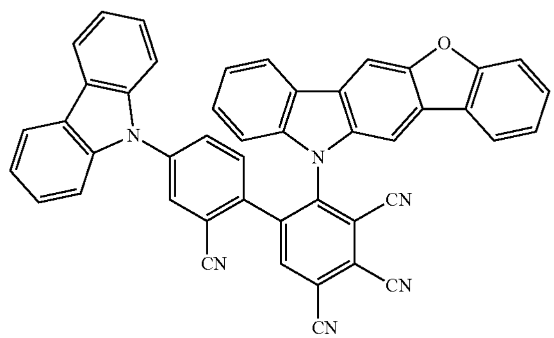
287
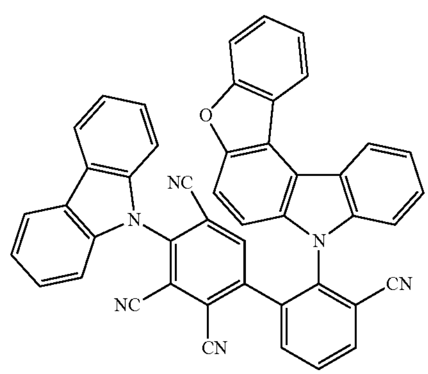

-continued
288
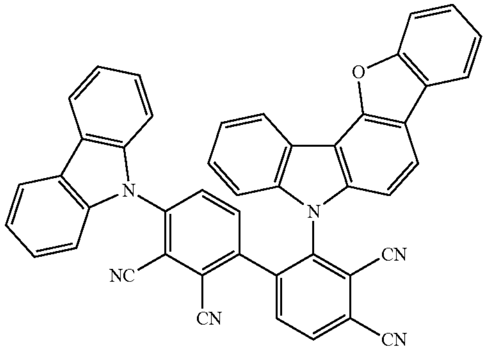
289
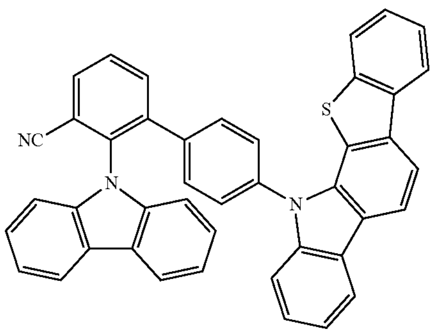
290
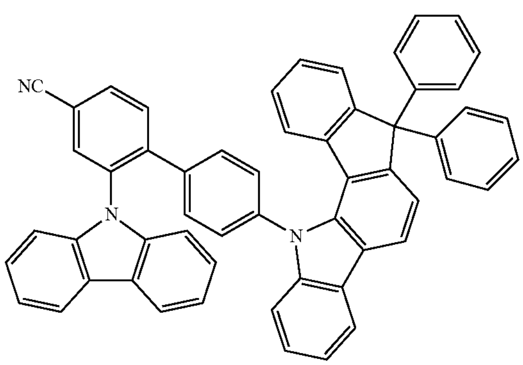
291
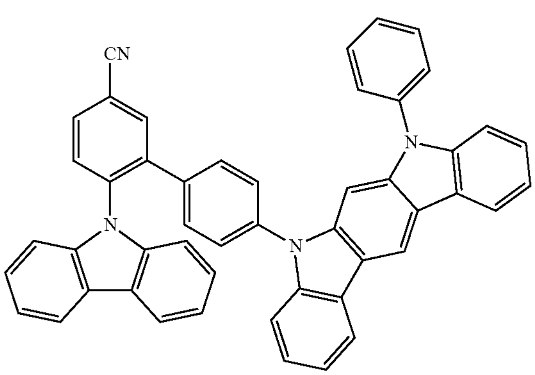
-continued
292
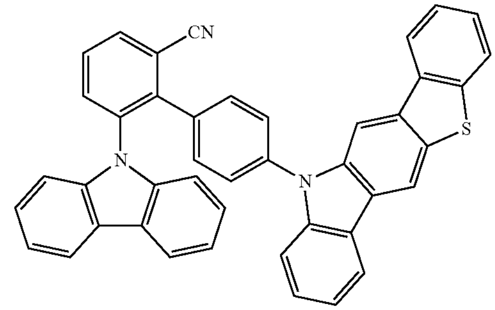
293
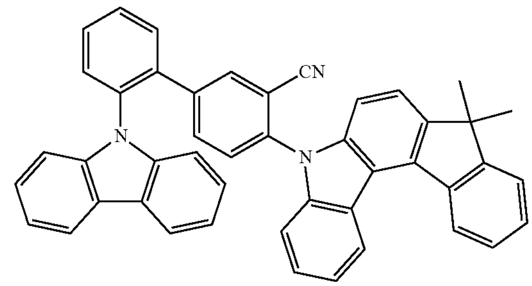
294
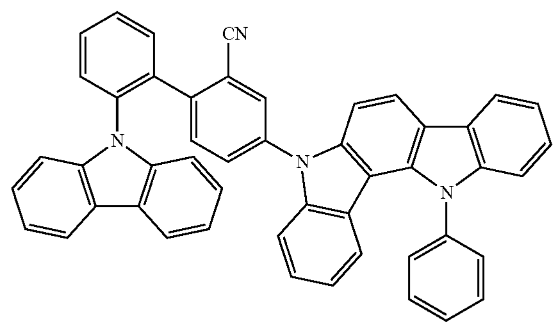
295
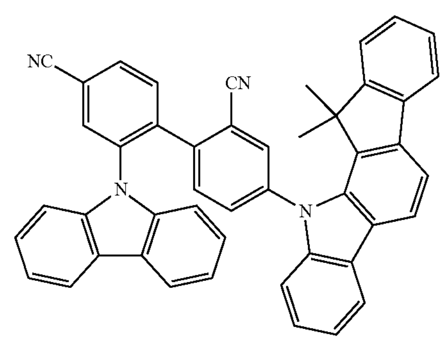

-continued
296
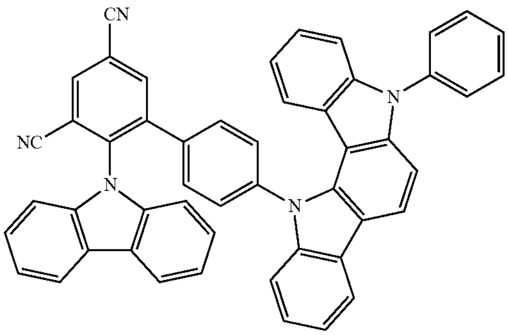
297
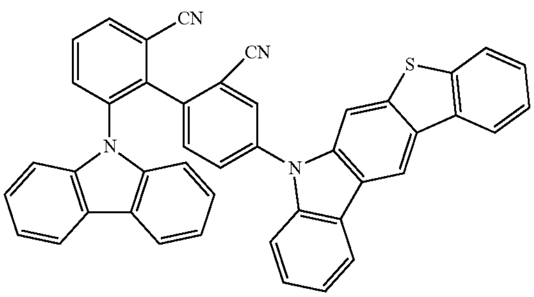
298
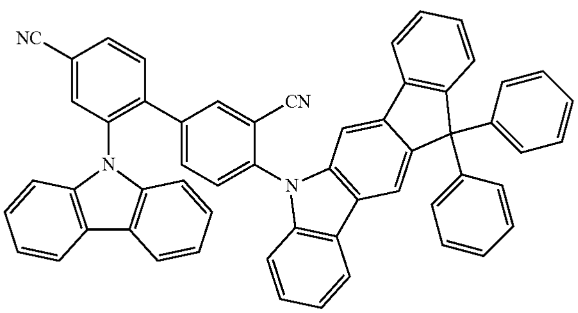
299
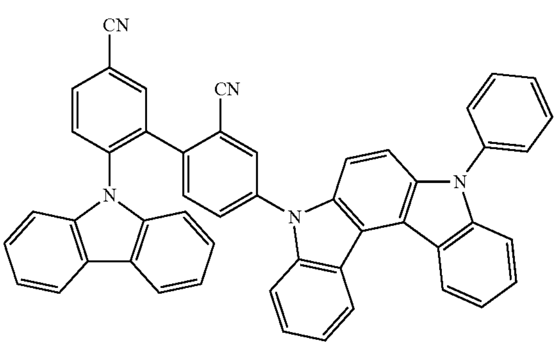
-continued
300
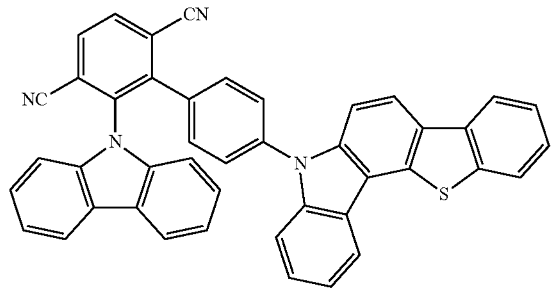
301
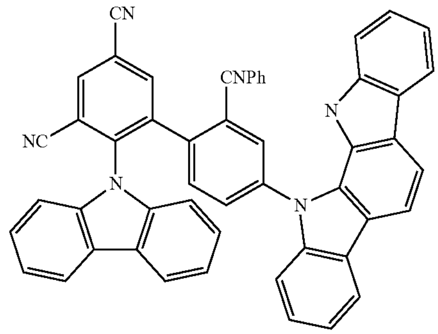
302
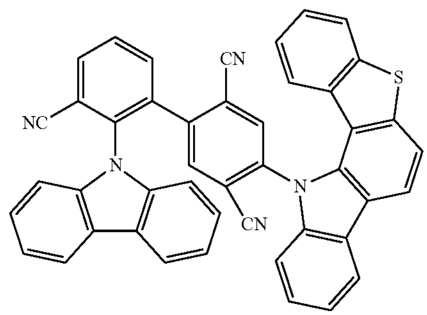
303
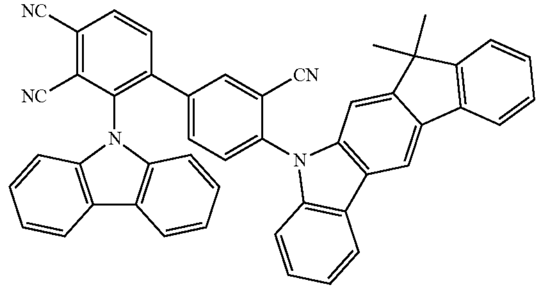
304
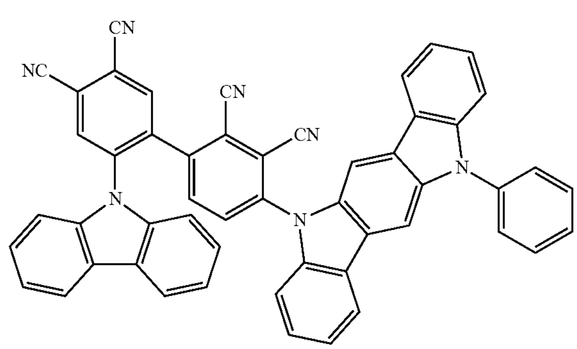

305
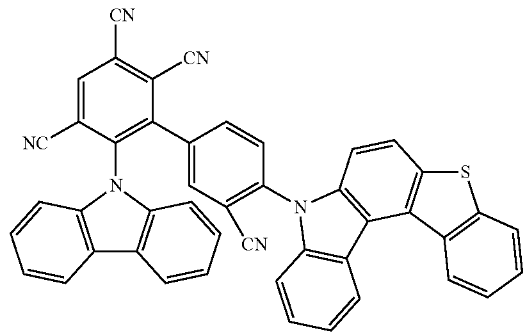
306
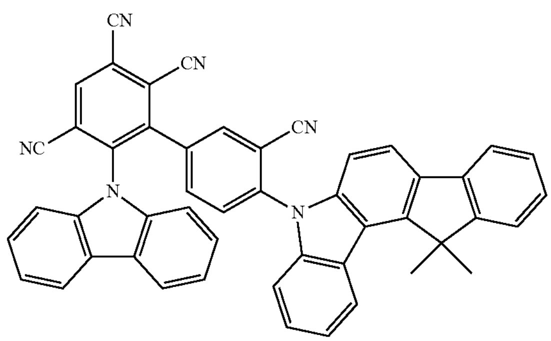
307
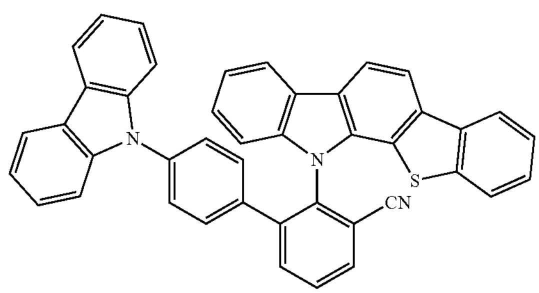
308
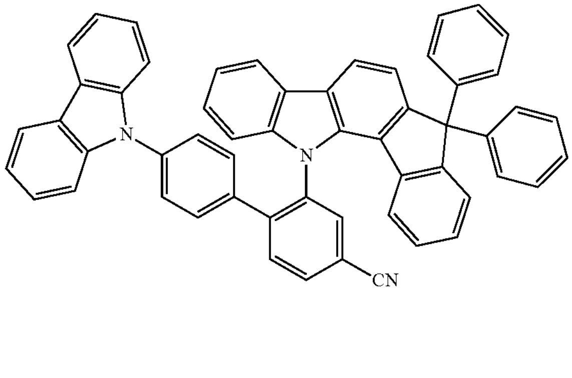
309
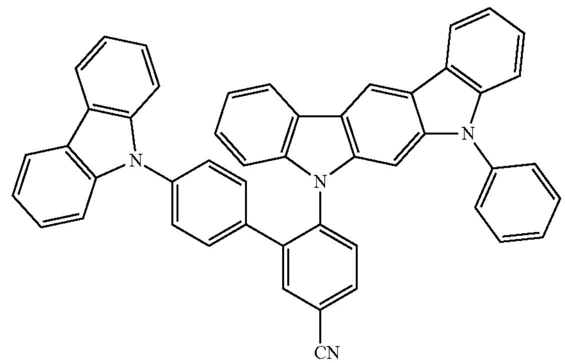
310
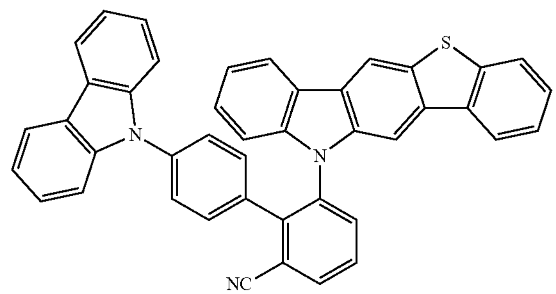
311
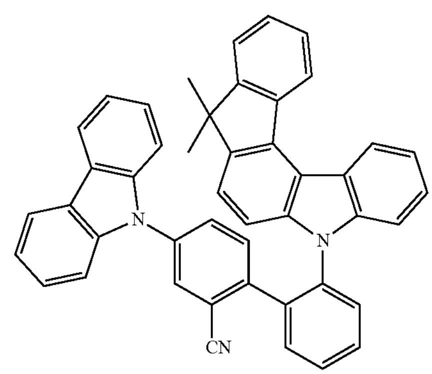
312
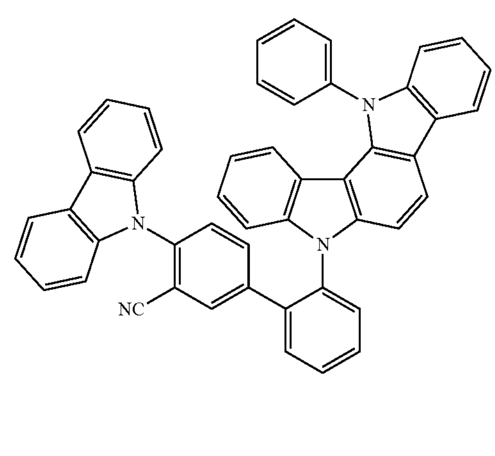

-continued
313
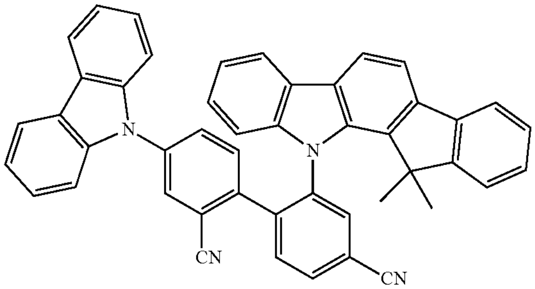
314
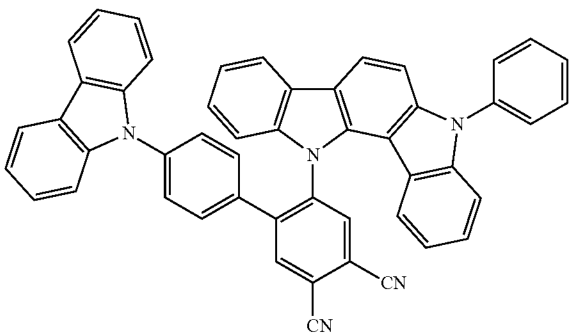
315
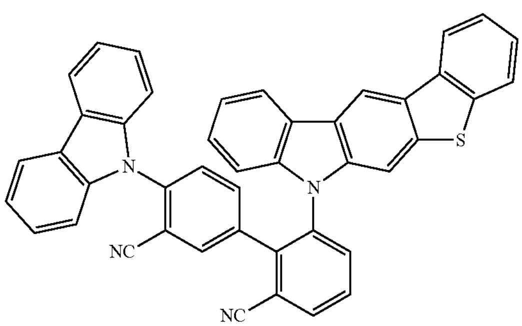
316
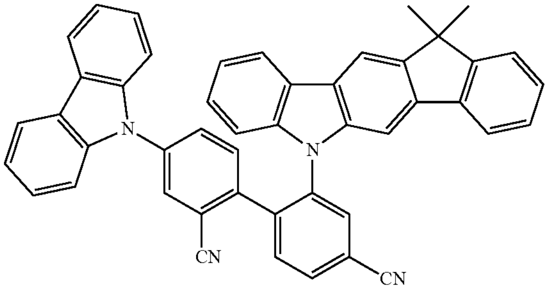
-continued
317
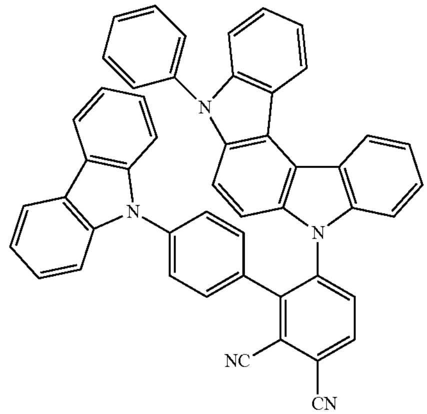
318
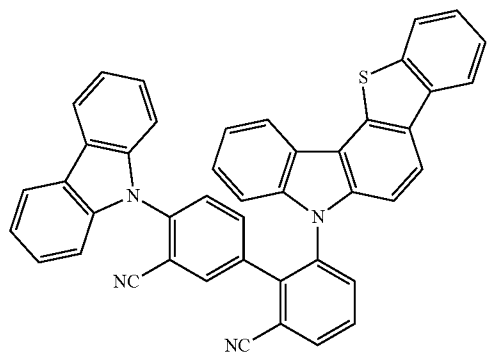
319
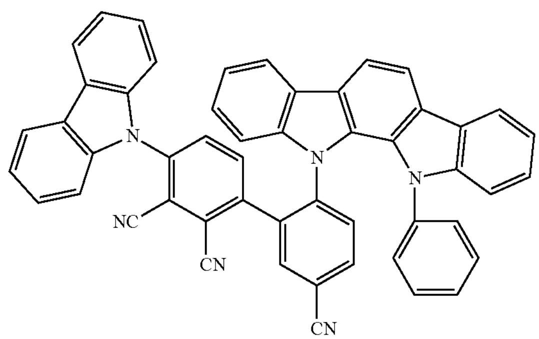
320
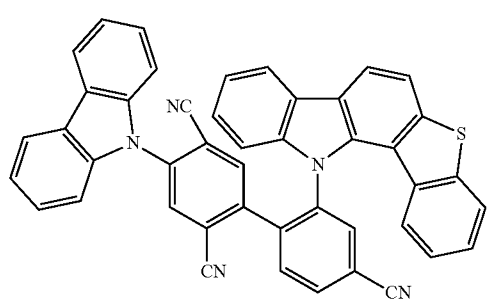

-continued
321
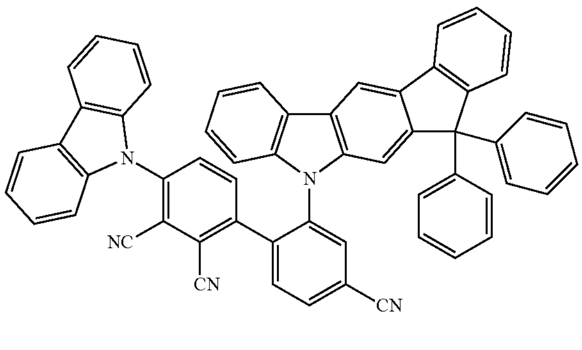
322
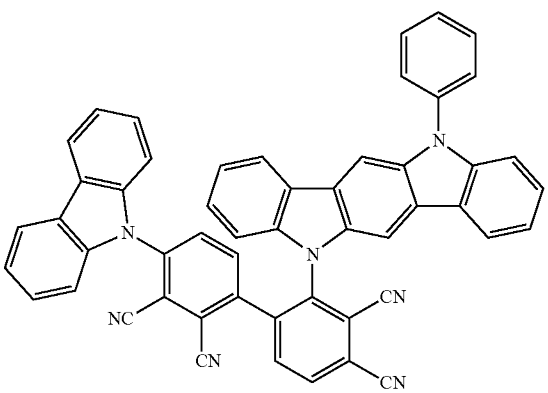
323
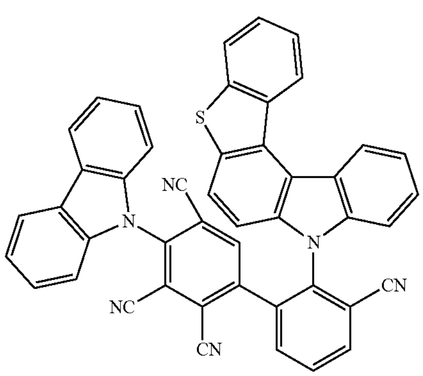
324
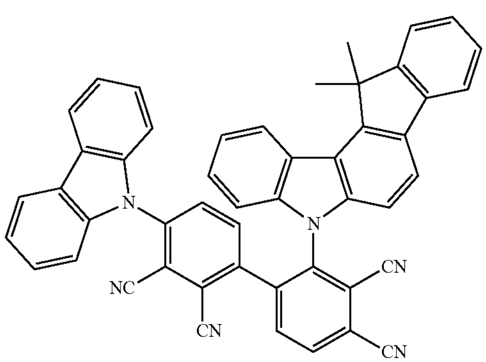
-continued
325
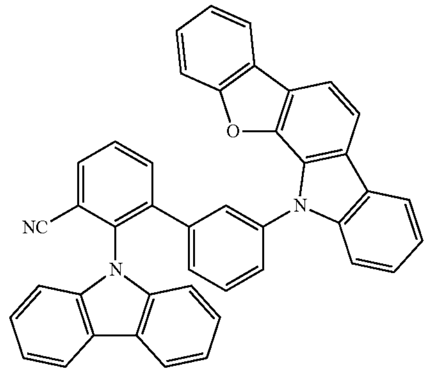
326
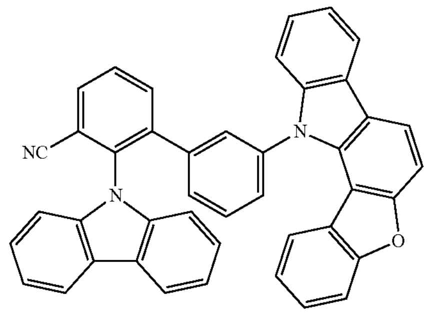
327
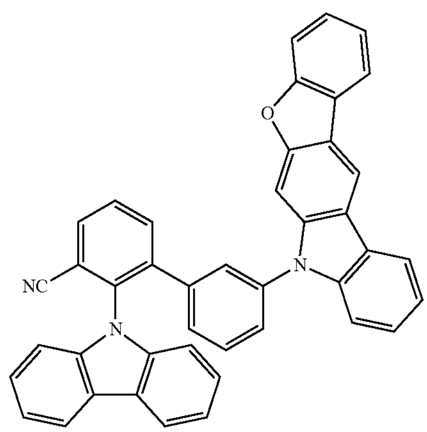
328
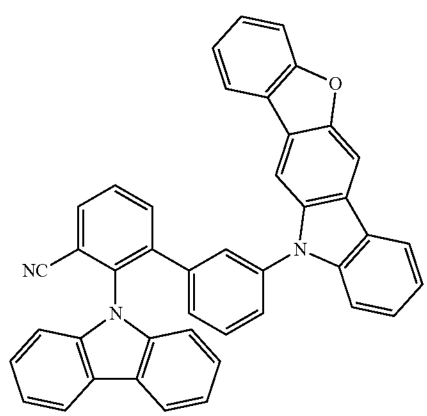

-continued
329
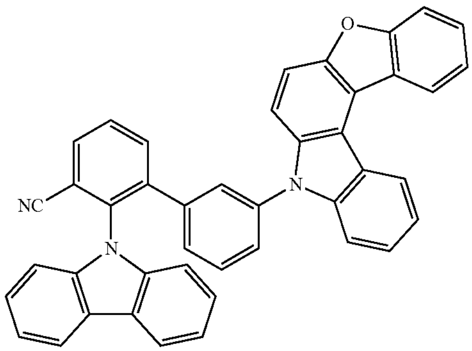
330
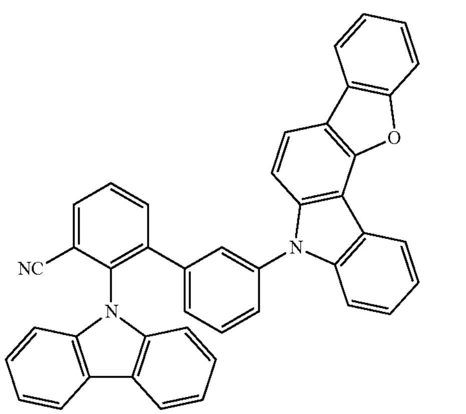
331
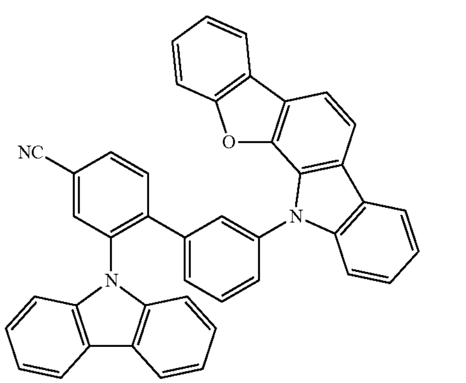
332
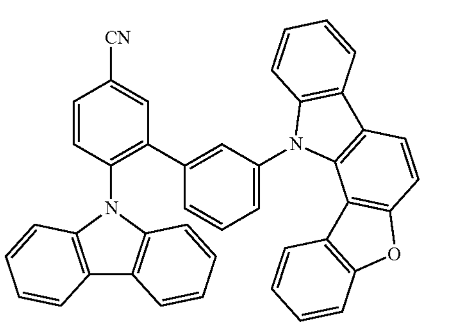
-continued
333
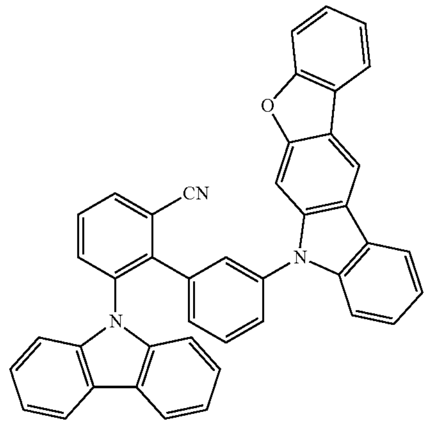
334
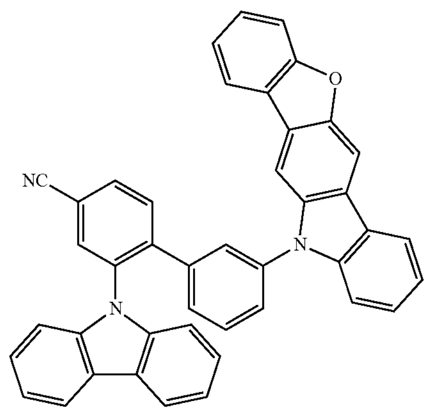
335
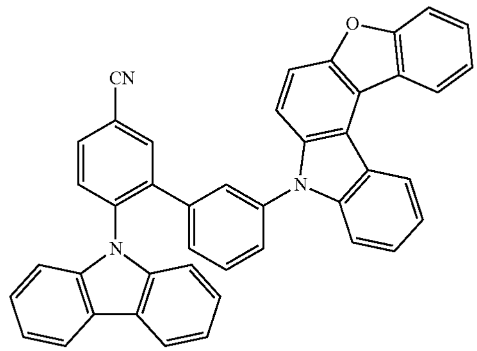
336
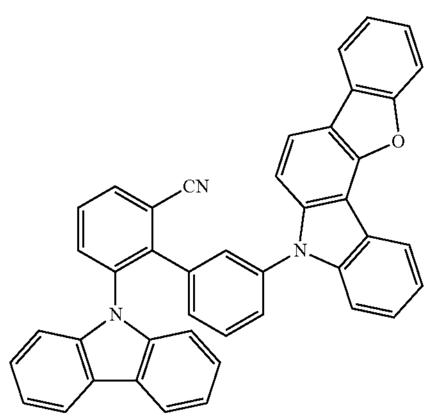

-continued
337
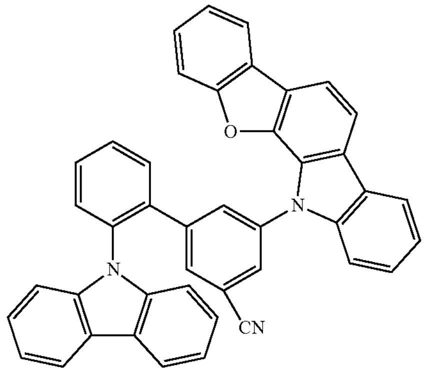
338
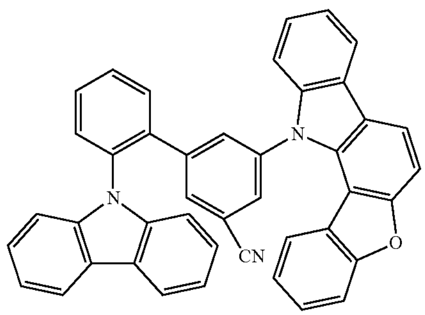
339
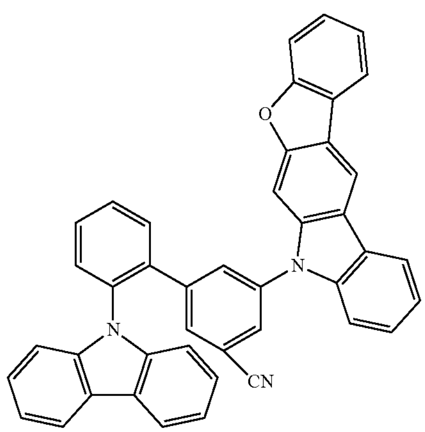
340
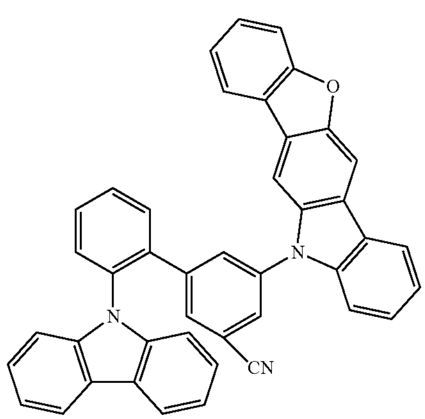
-continued
341
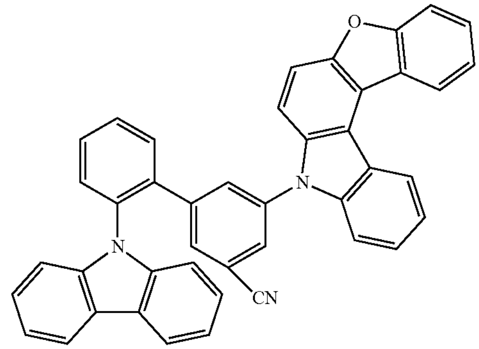
342
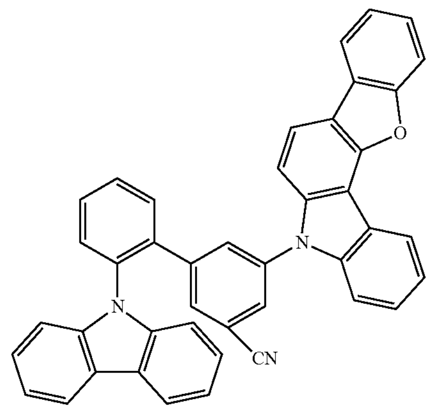
343
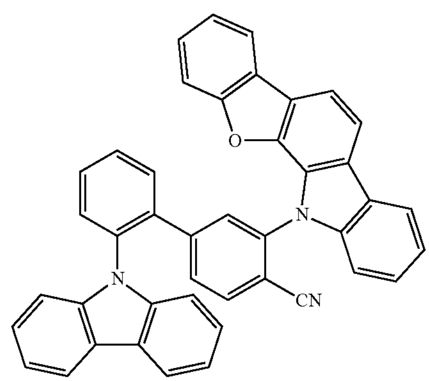
344
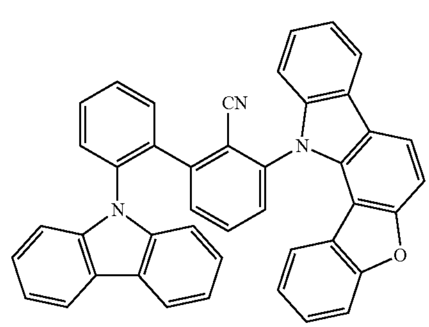

-continued
345
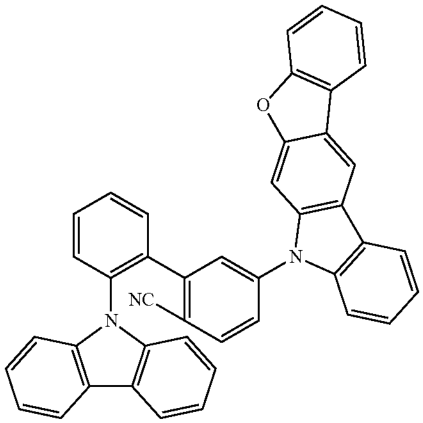
346
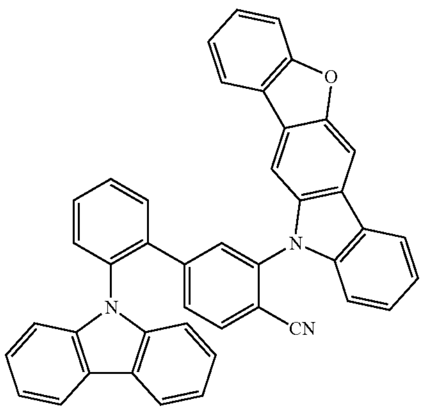
347
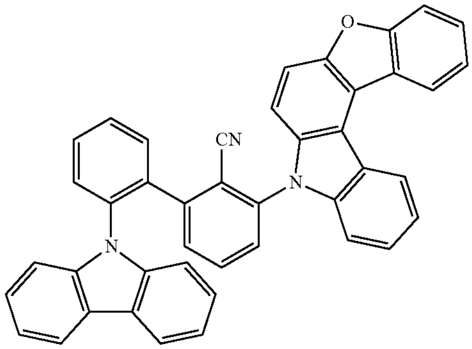
348
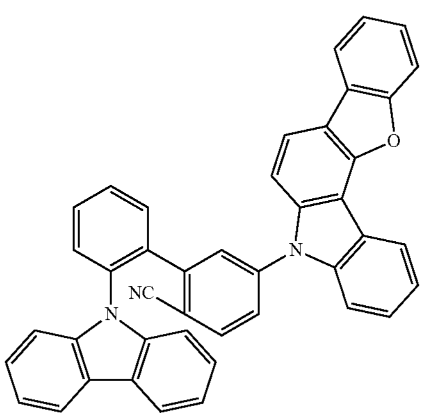
-continued
349
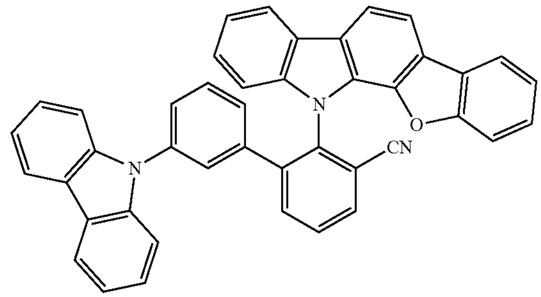
350
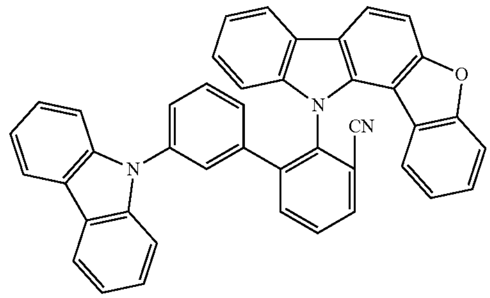
351
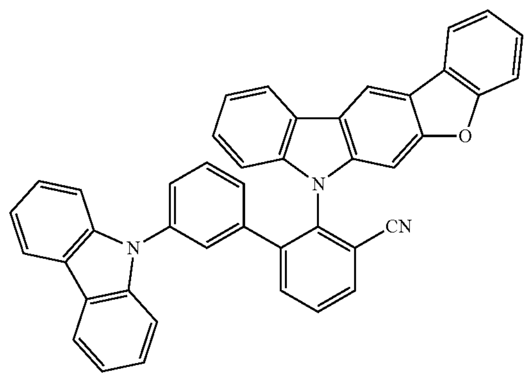
352
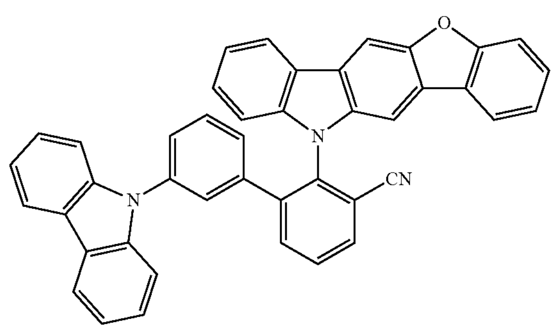

353
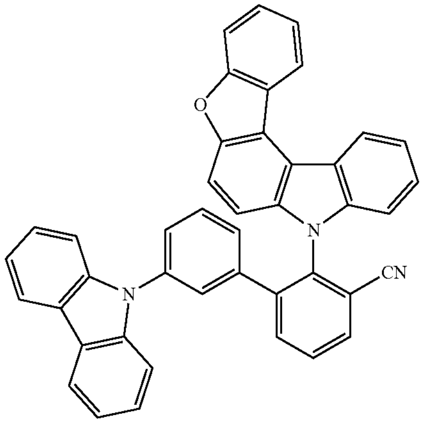
354
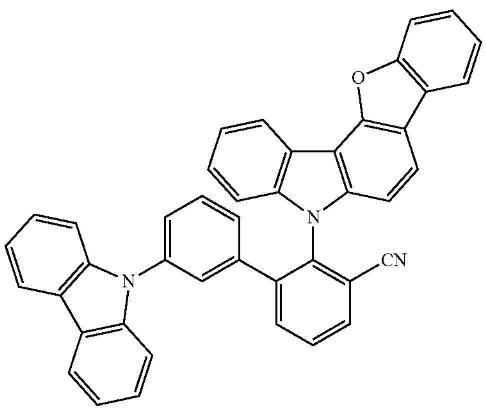
355
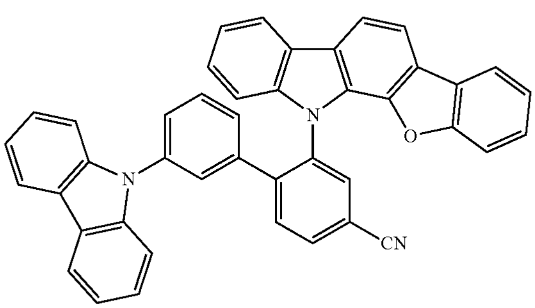
356
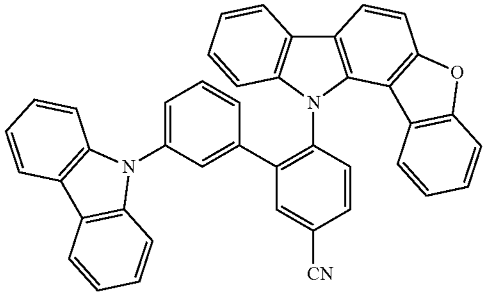
357
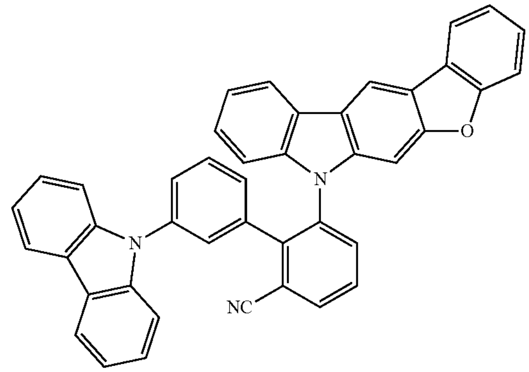
358
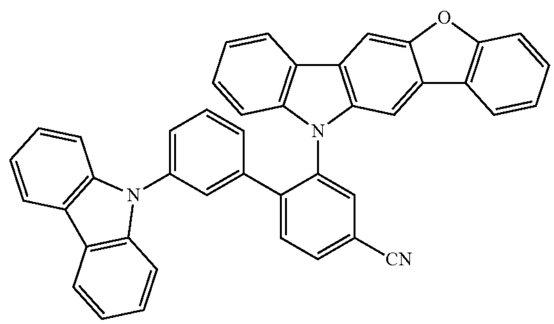
359
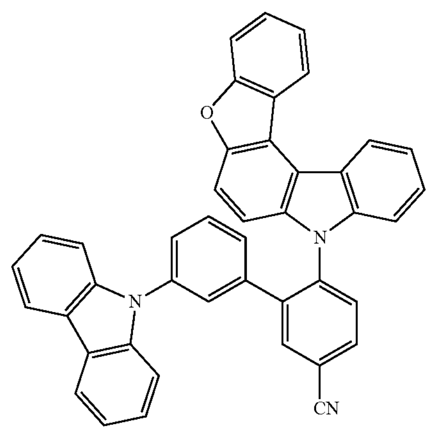
360
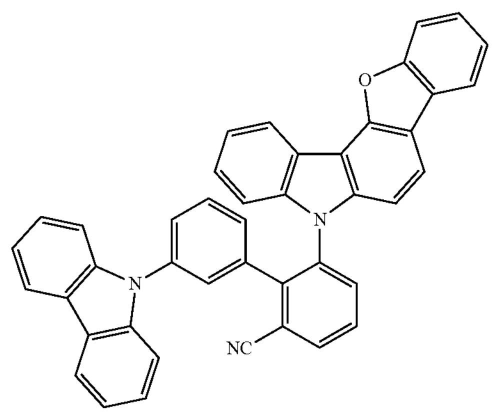

361
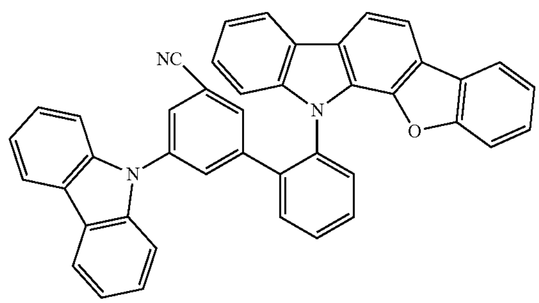
362
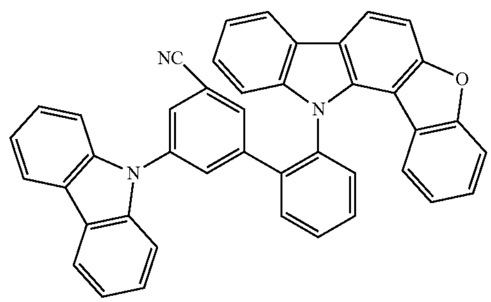
363
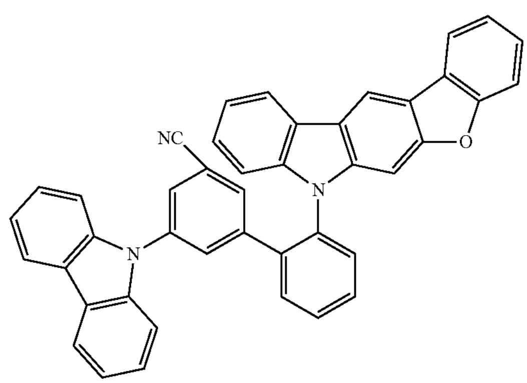
364
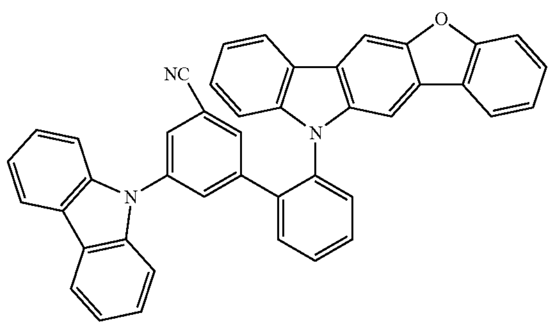
365
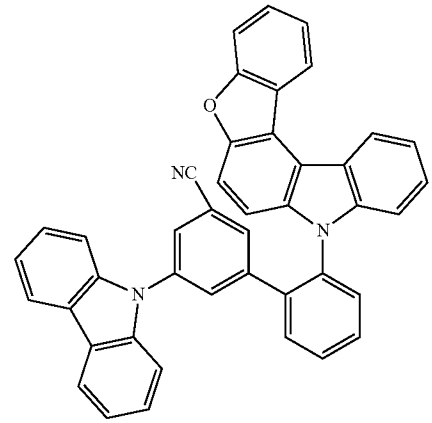
366
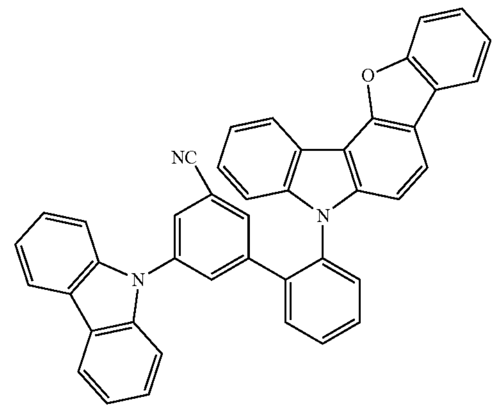
367
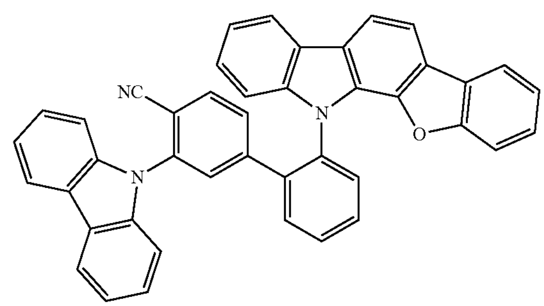
368
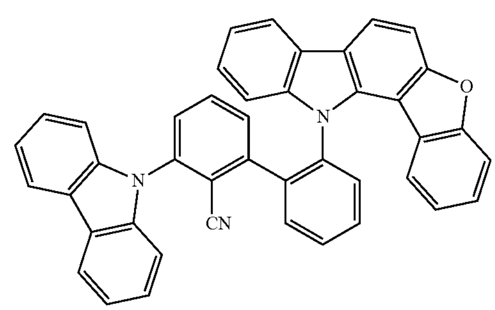

-continued
369
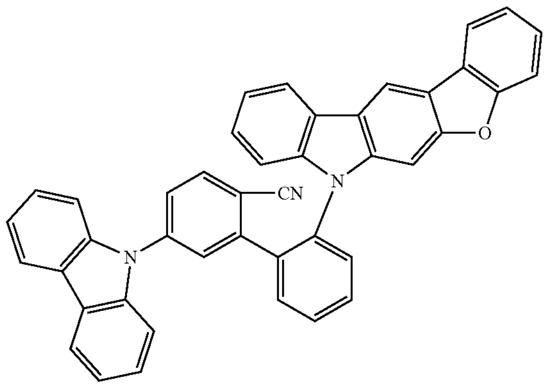
370
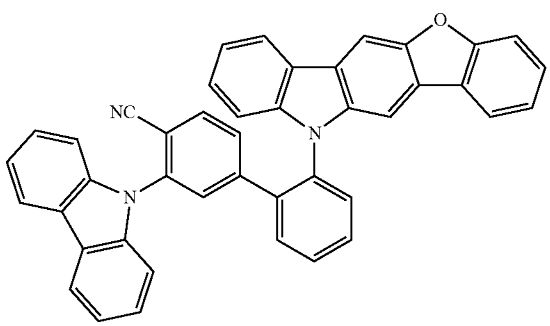
371
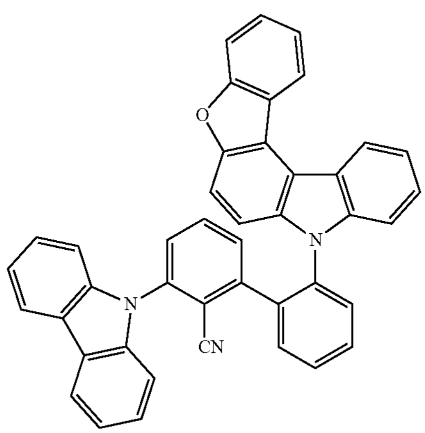
372
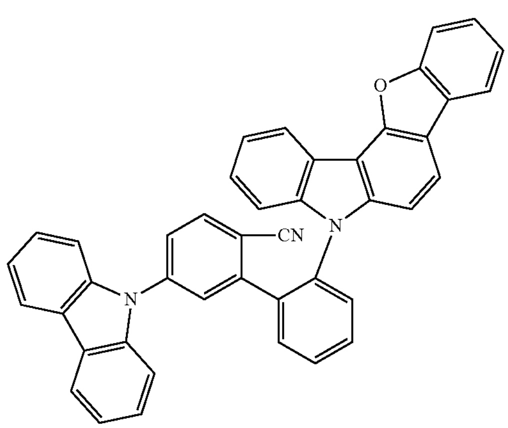
-continued
373
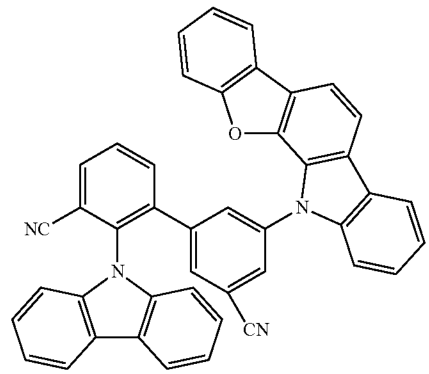
374
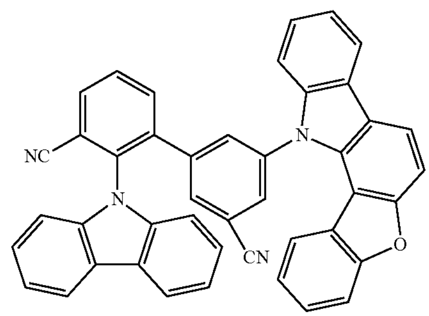
375
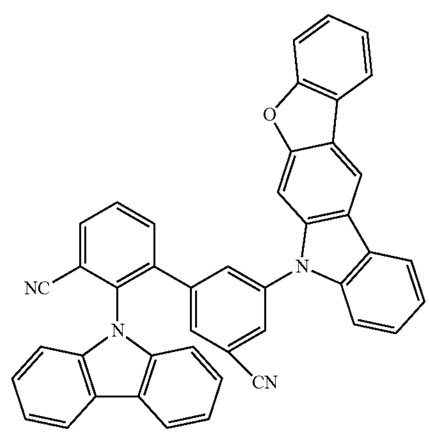
376
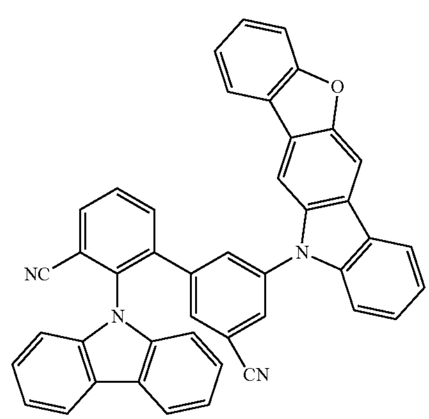

-continued
377
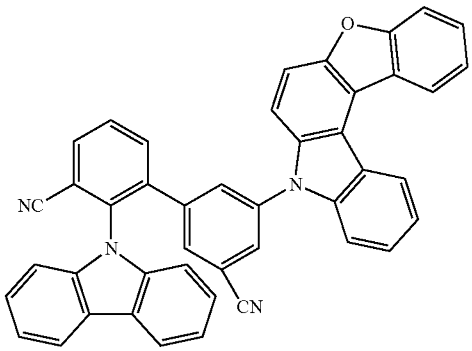
378
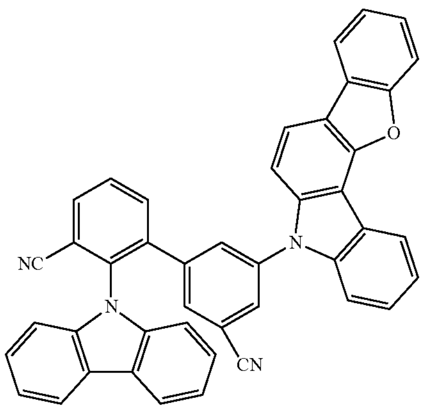
379
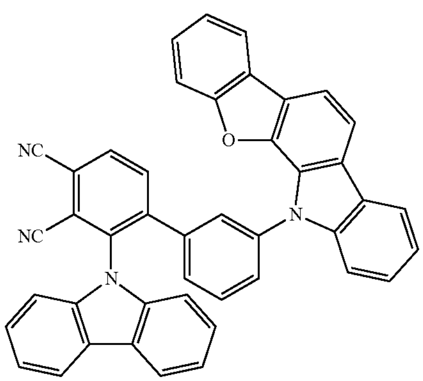
380
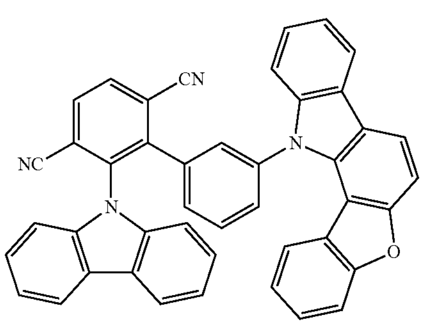
-continued
381
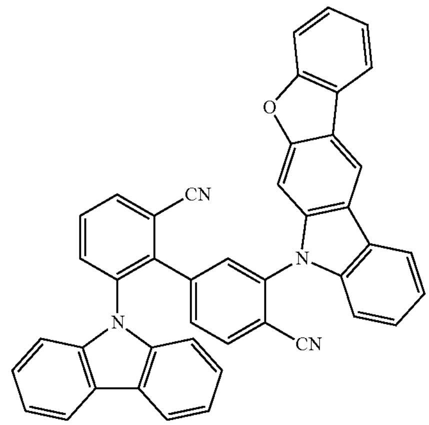
382
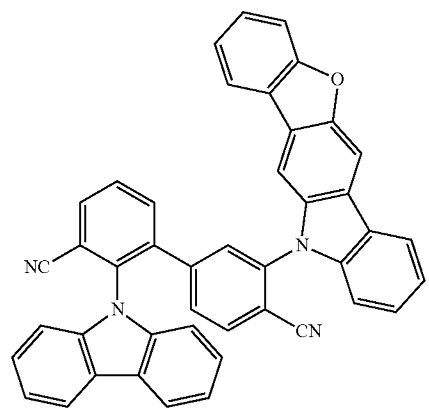
383
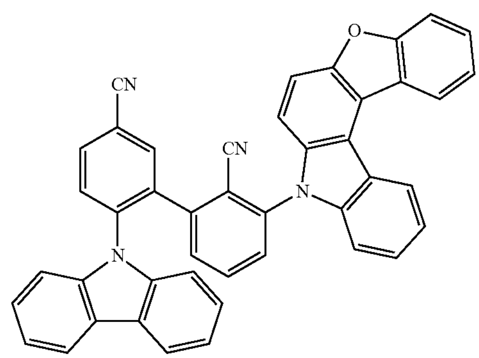
384
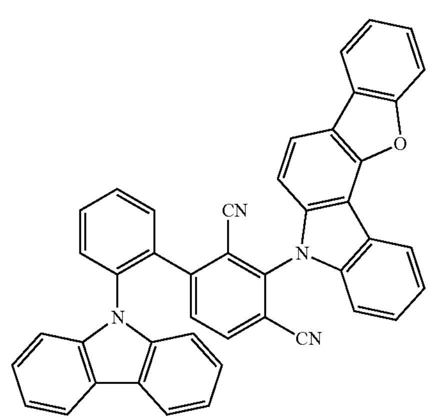

385
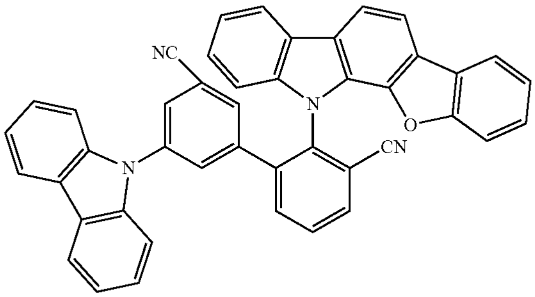
386
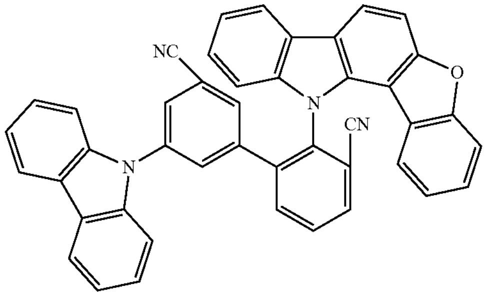
387
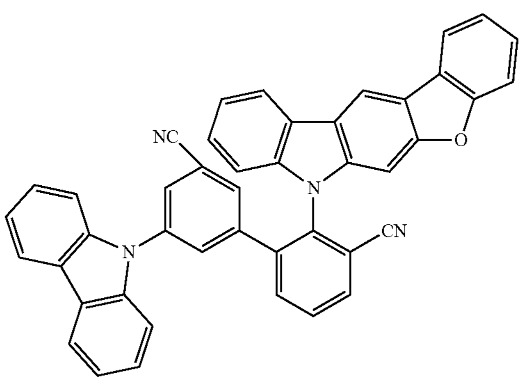
388
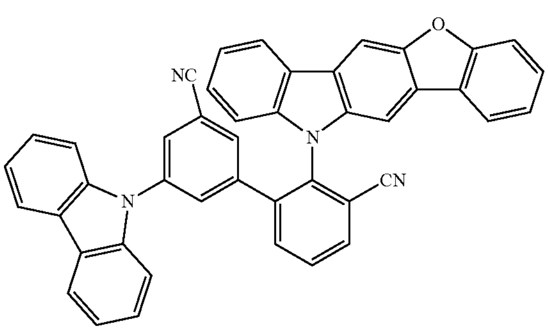
389
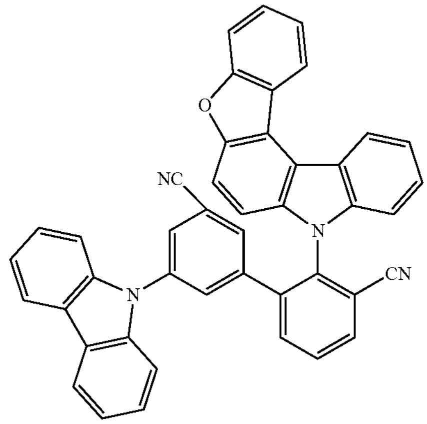
390
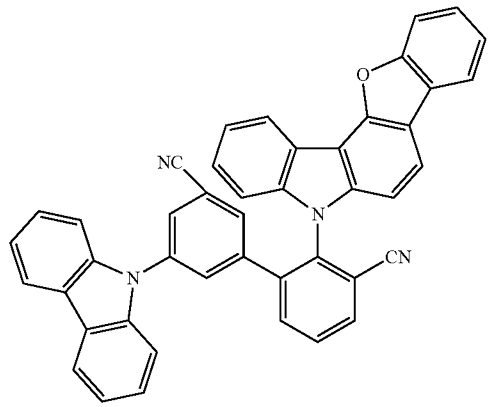
391
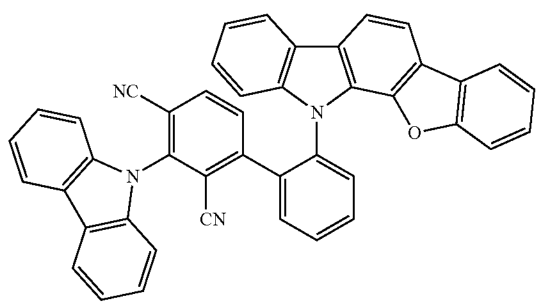
392
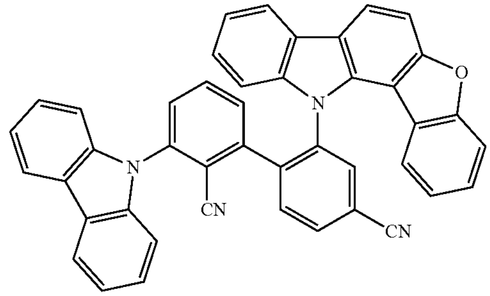

-continued
393
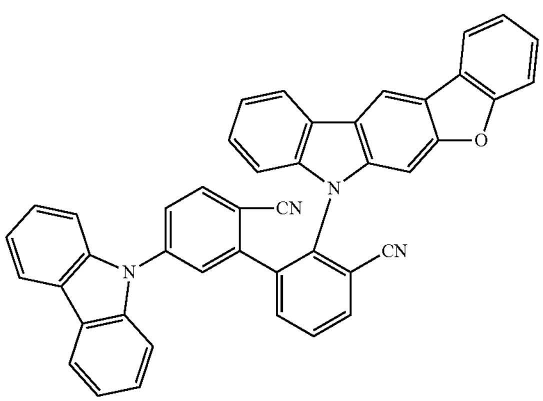
394
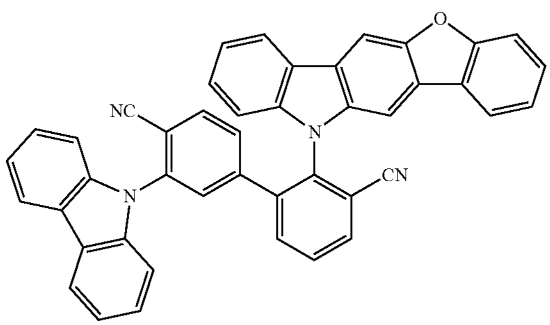
395
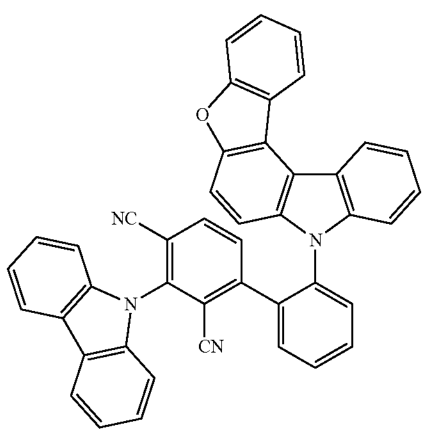
396
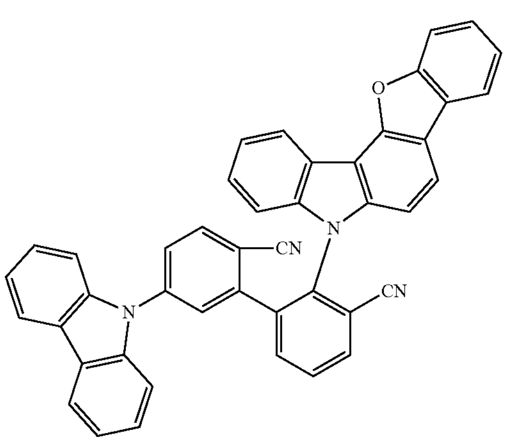
-continued
397
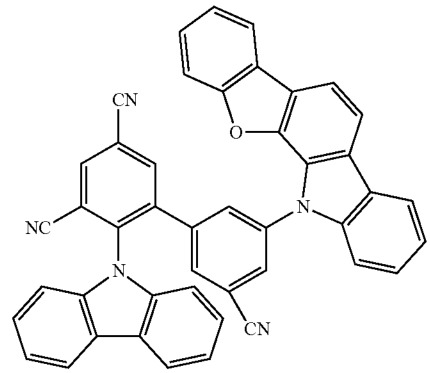
398
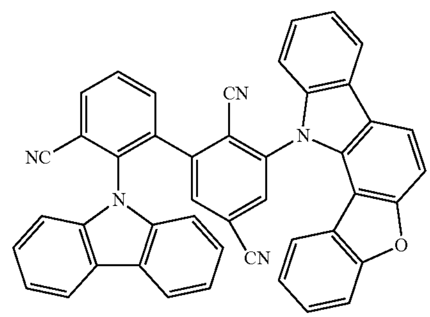
399
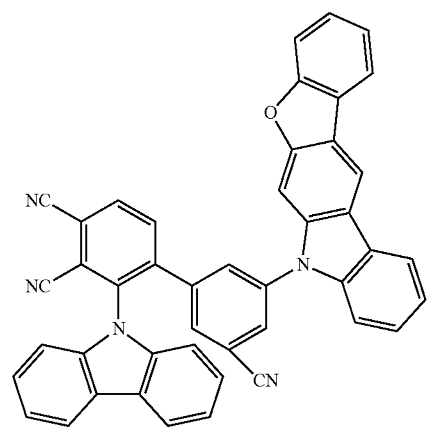
400
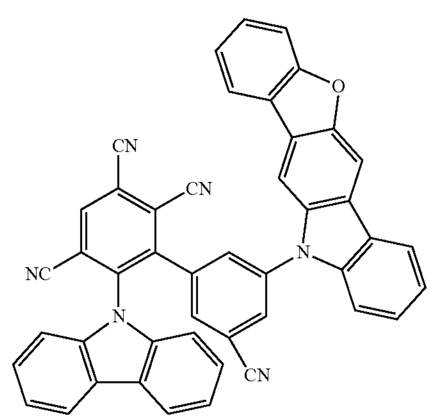

-continued
401
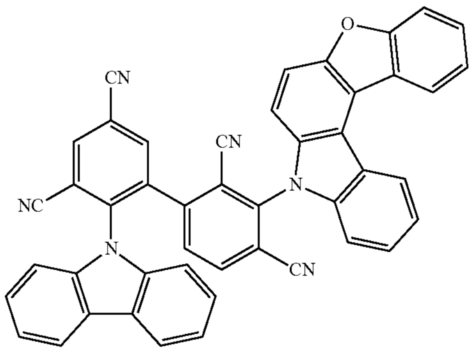
402
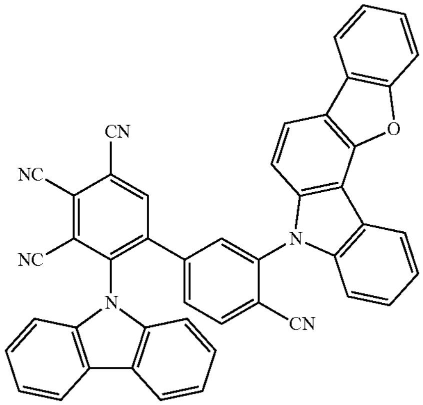
403
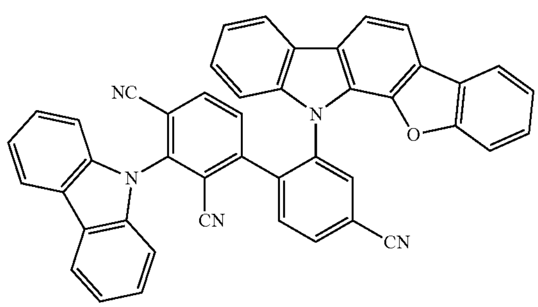
404
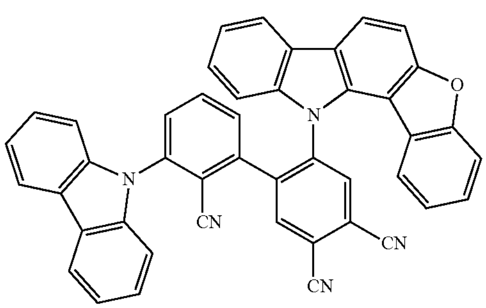
-continued
405
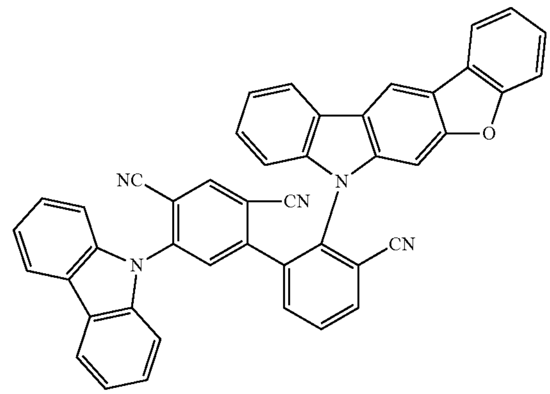
406
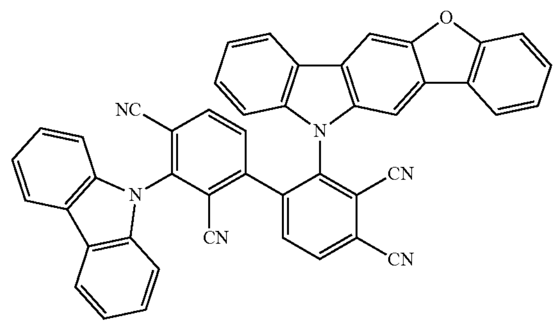
407
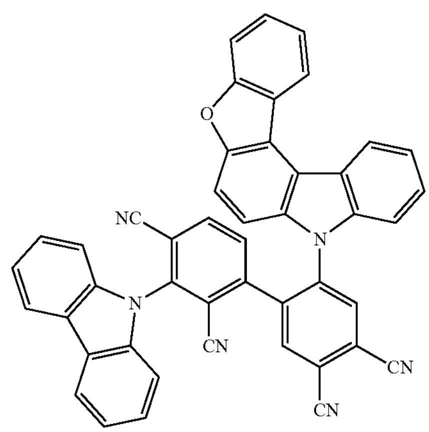
408
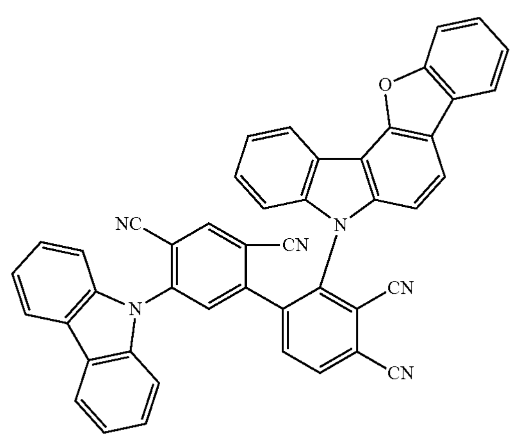

-continued
409
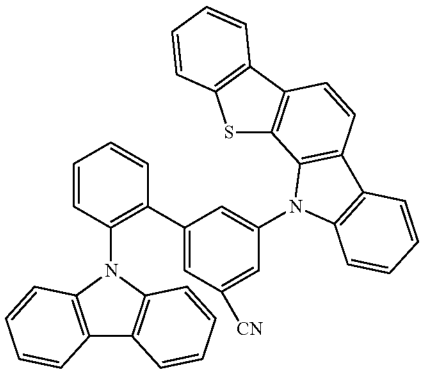
410
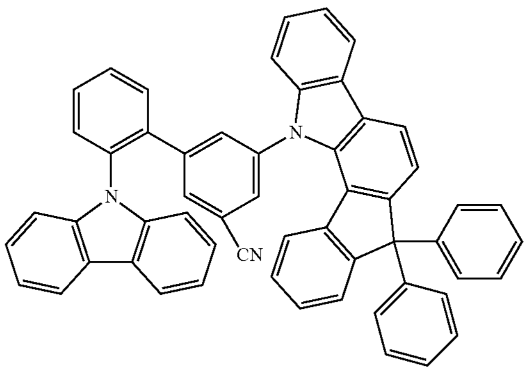
411
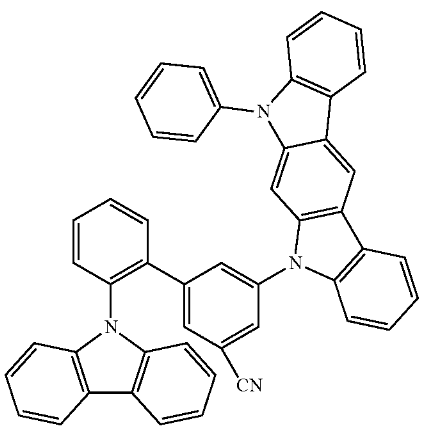
412
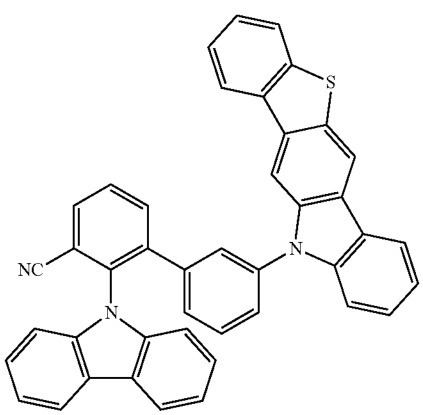
-continued
413
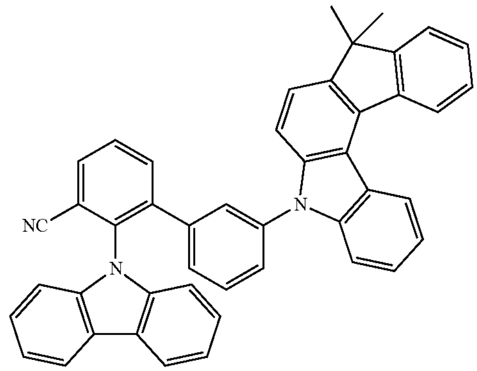
414
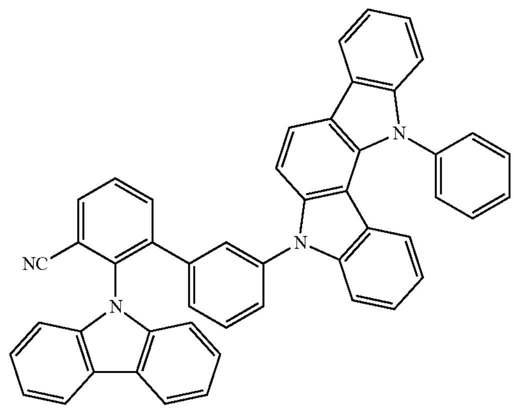
415
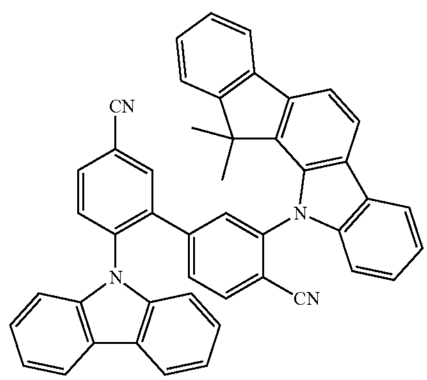
416
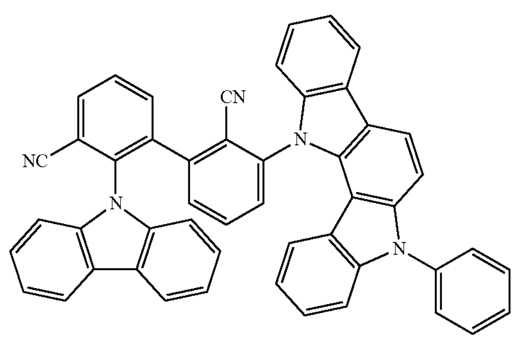

417
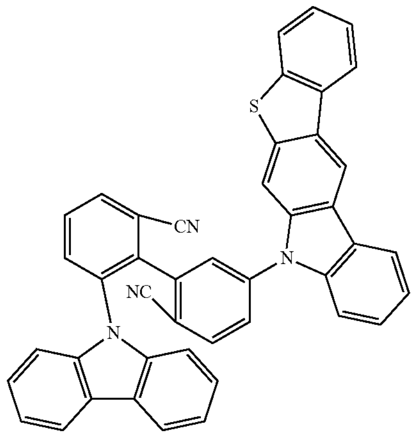
418
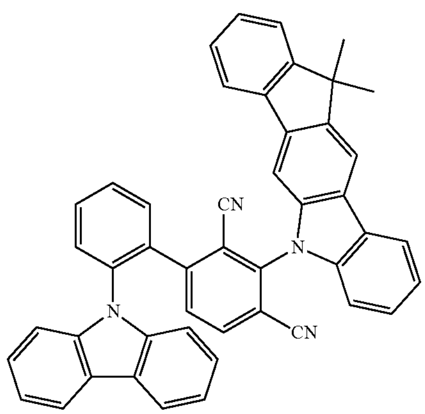
419
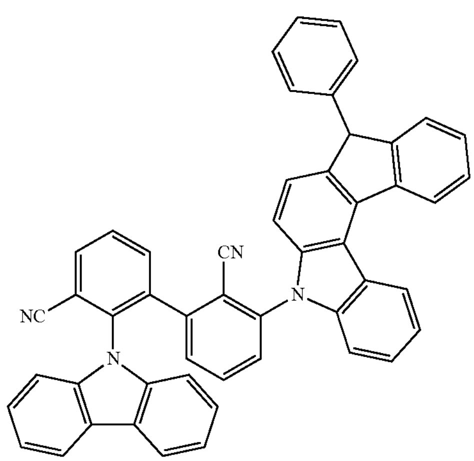
420
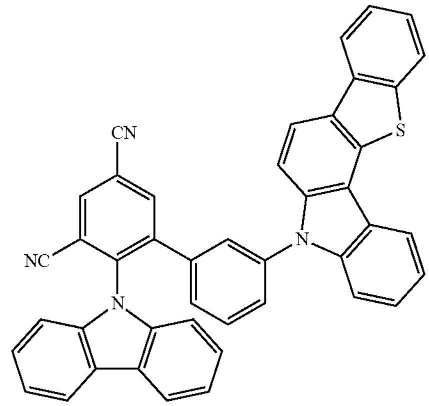
421
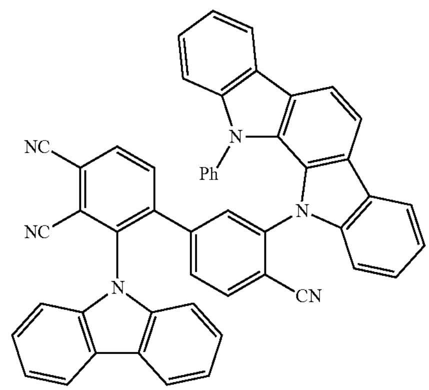
422
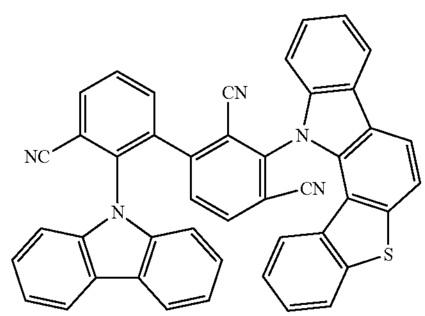
423
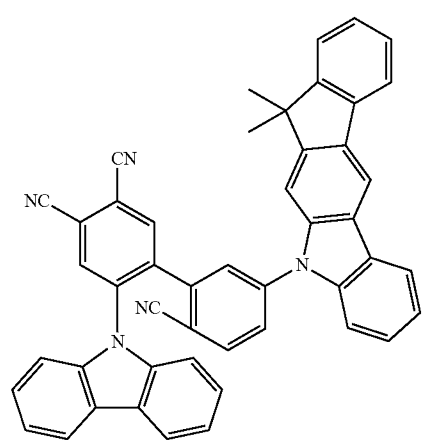

-continued
424
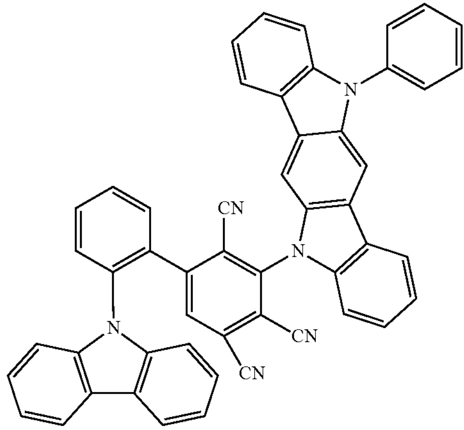
425
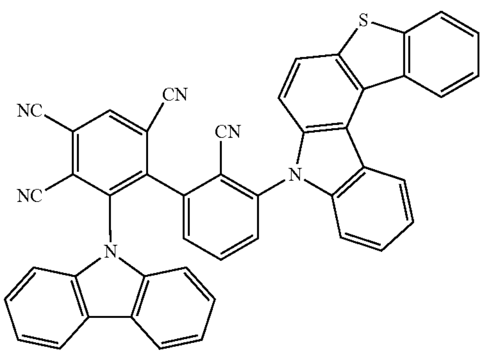
426
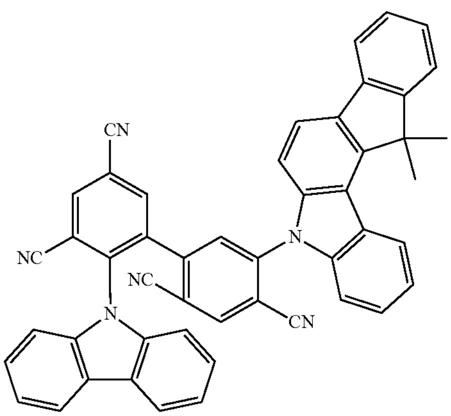
427
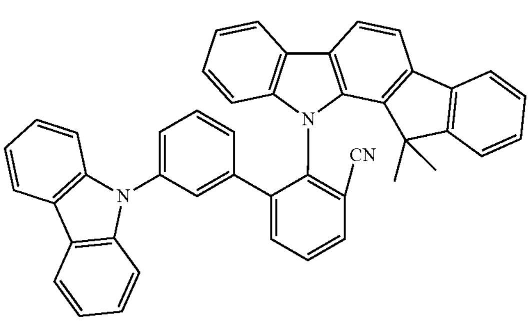
-continued
428
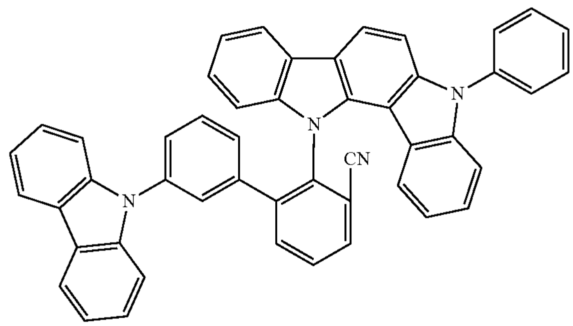
429
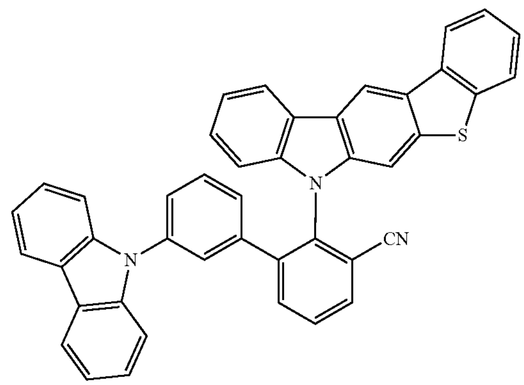
430
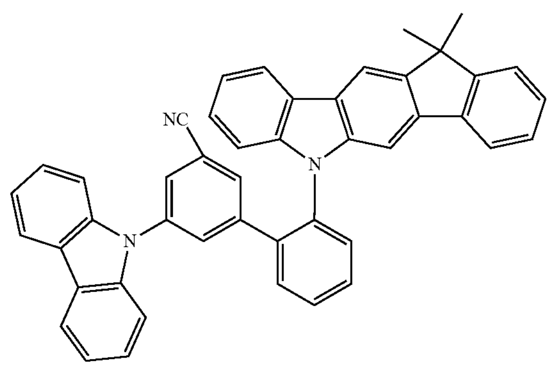
431
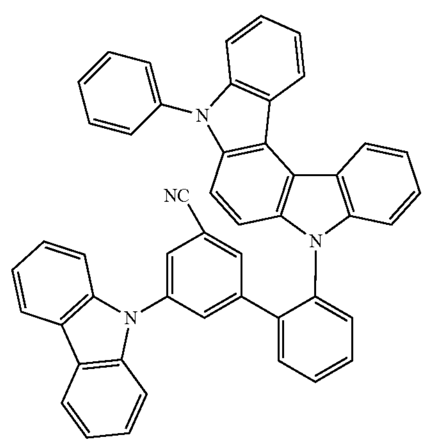

-continued
432
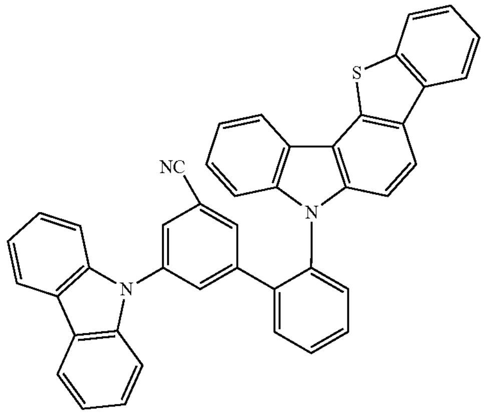
433
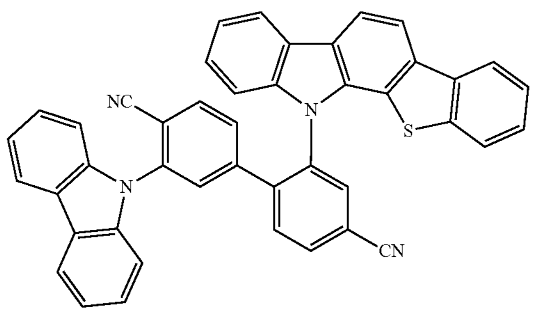
434
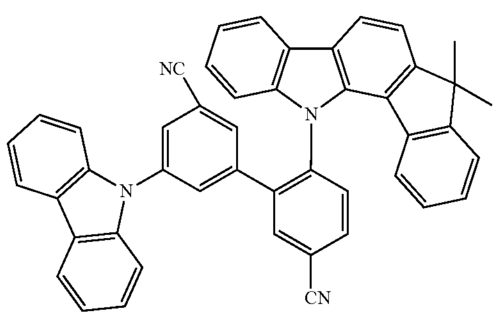
435
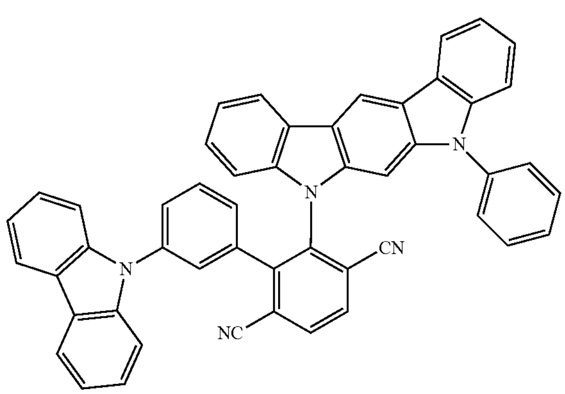
-continued
436
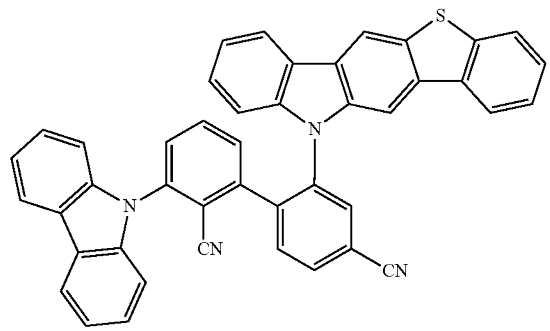
437
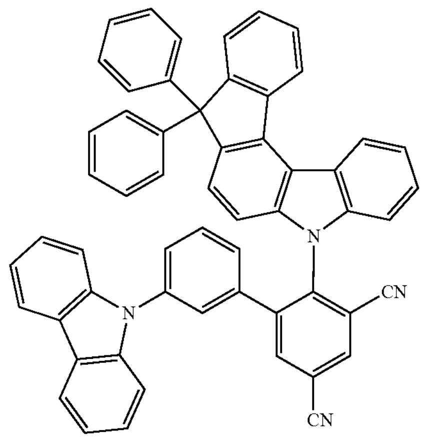
438
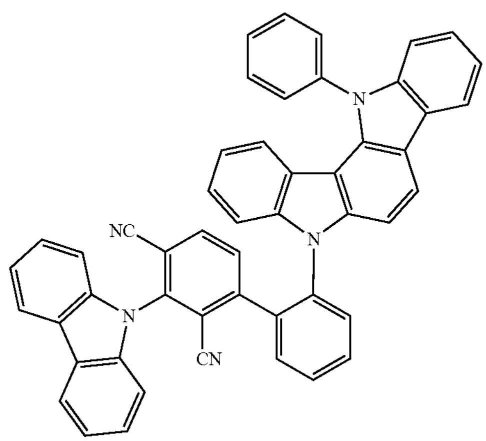
439
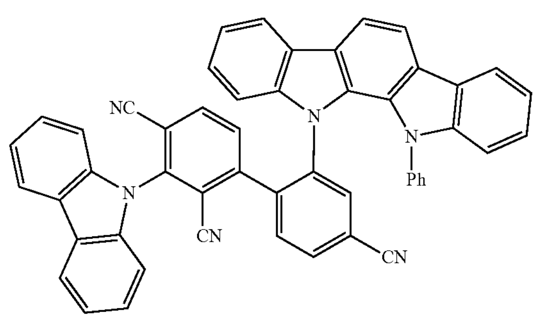

-continued
440
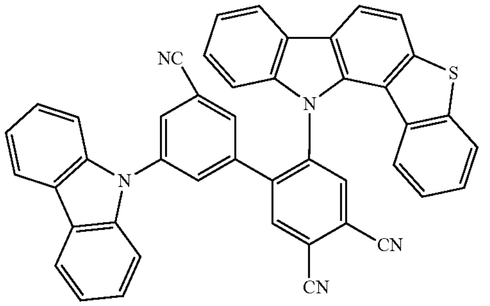
441
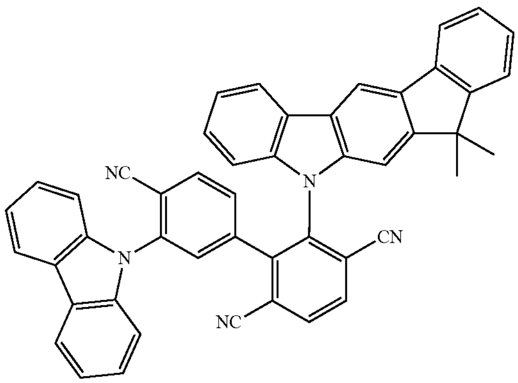
442
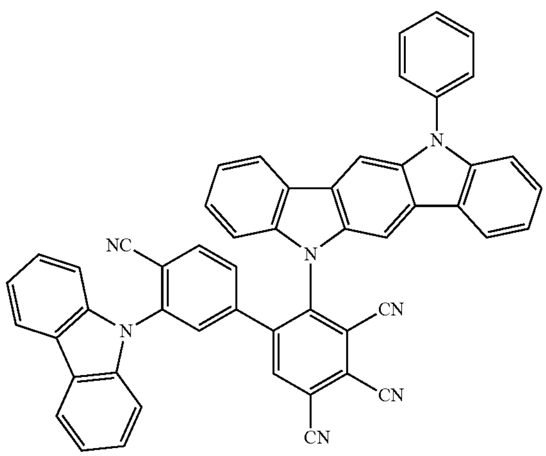
443
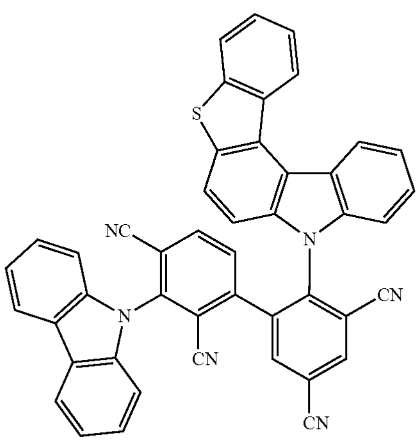
-continued
444
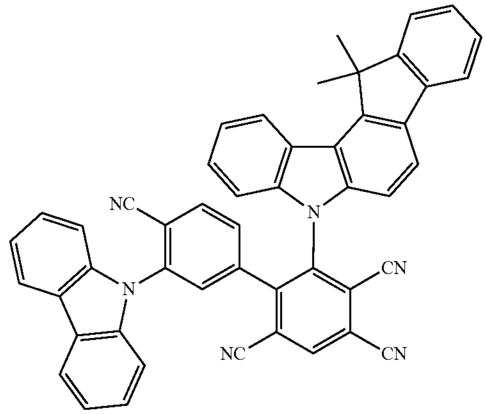
445
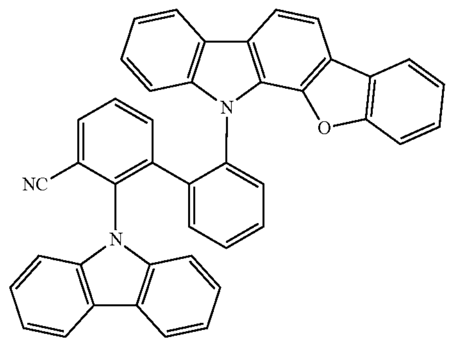
446
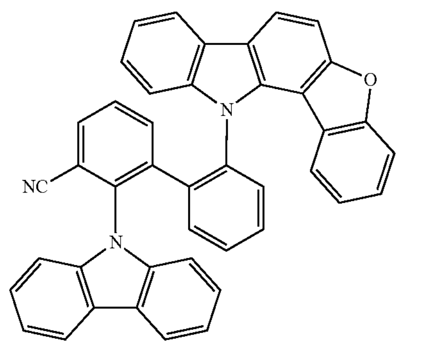
447
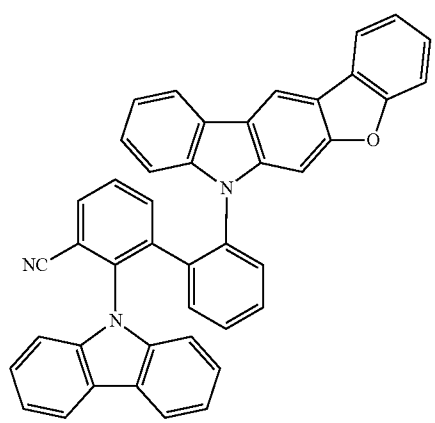

-continued
448
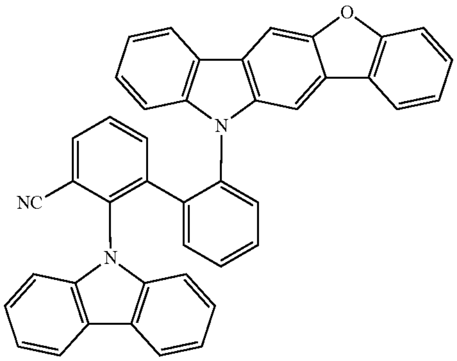
449
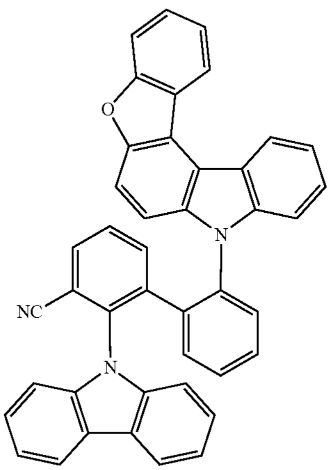
450
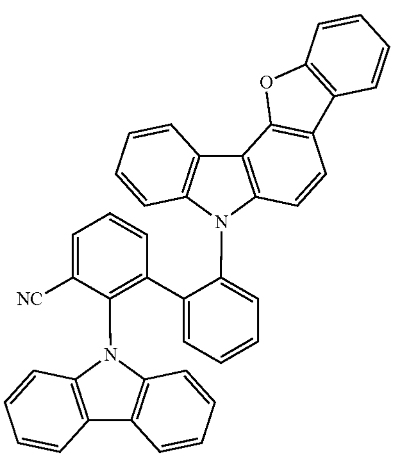
451
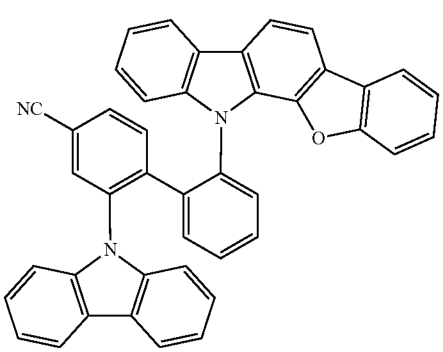
-continued
452
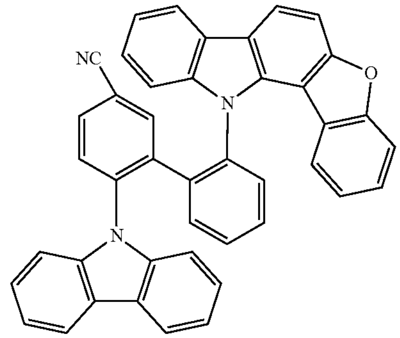
453
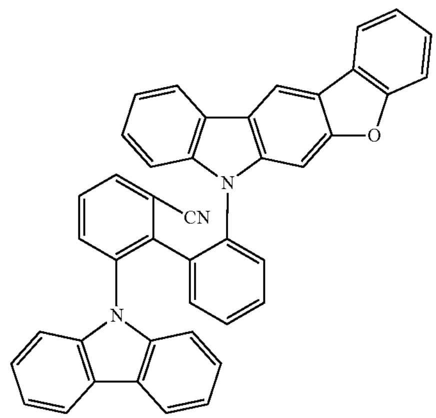
454
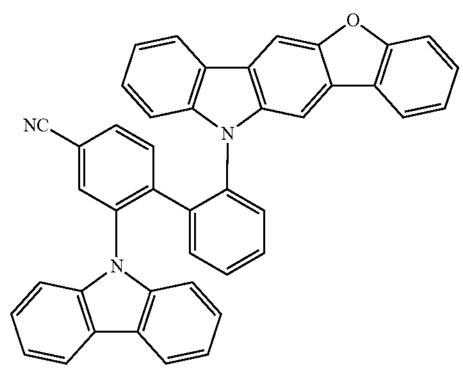
455
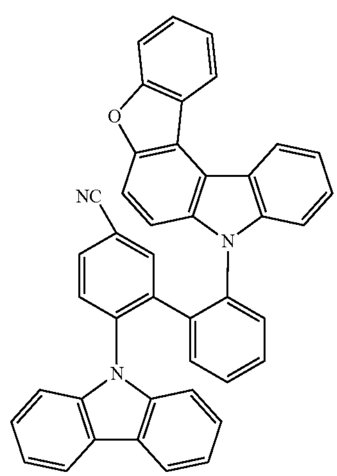

456
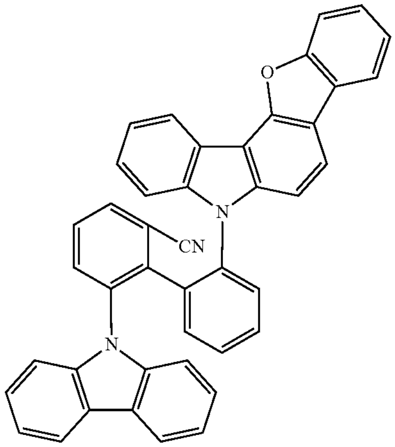
457
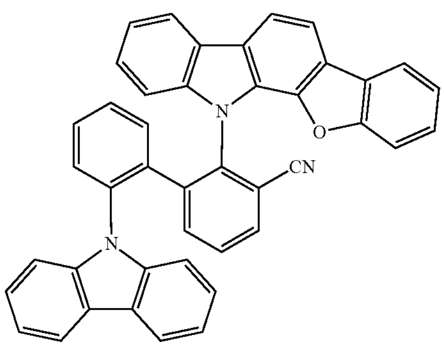
458
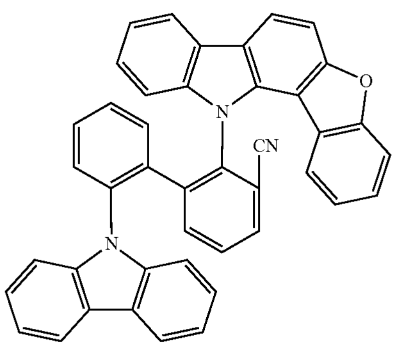
459
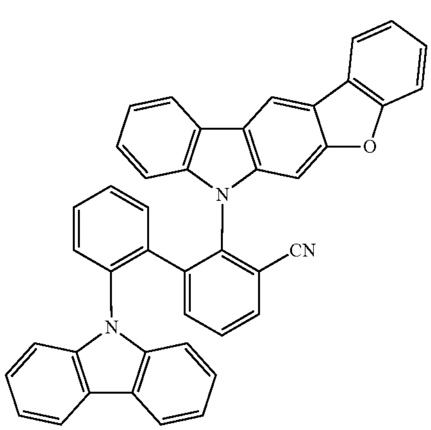
460
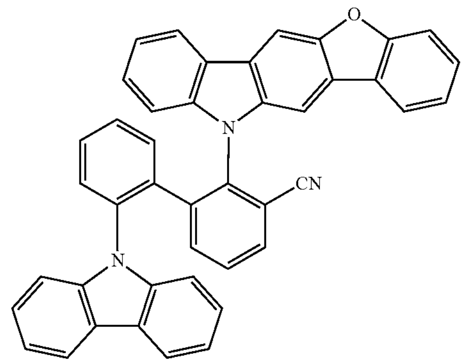
461
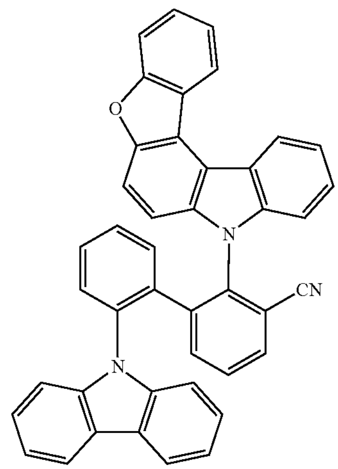
462
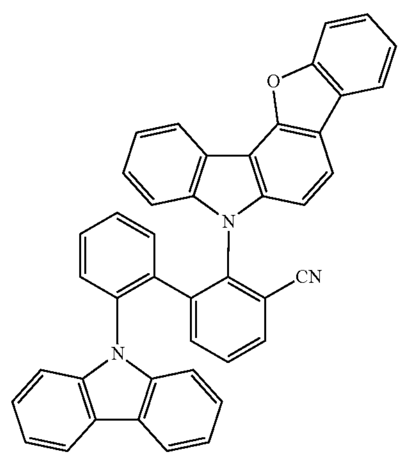
463
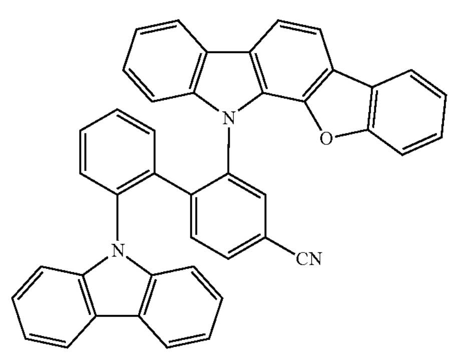

464
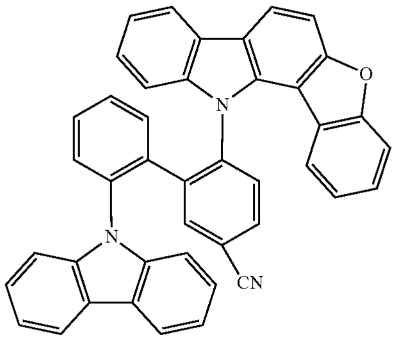
465
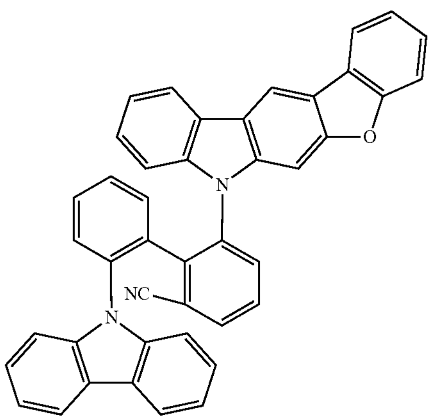
466
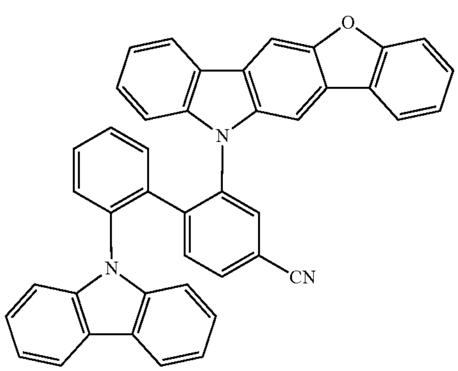
467
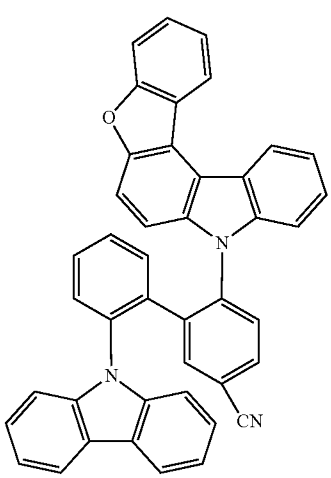
468
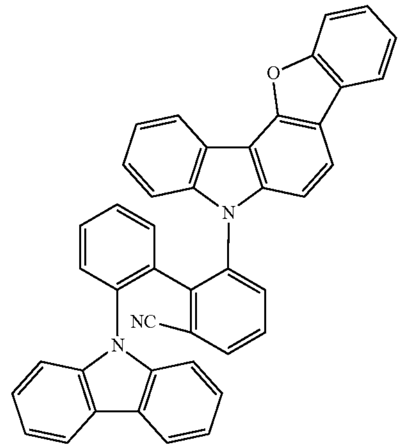
469
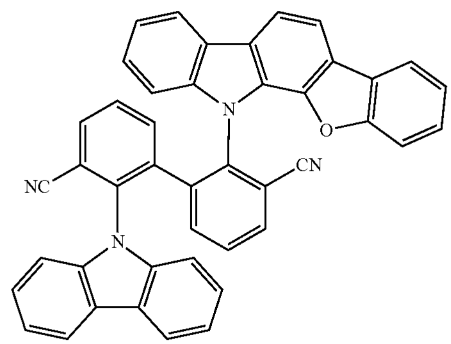
470
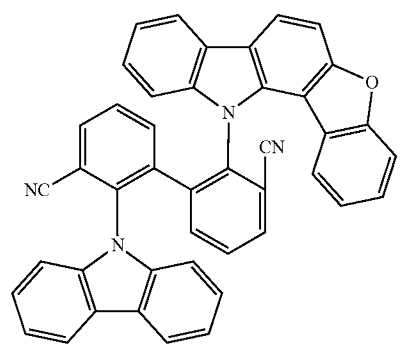
471
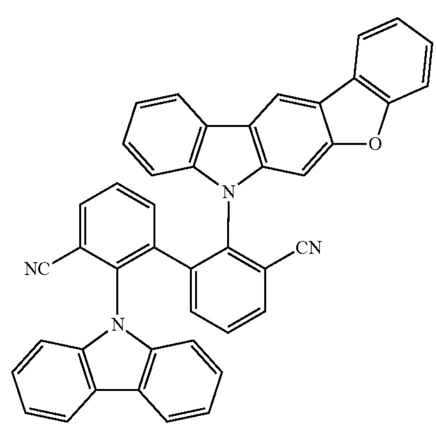

-continued
472
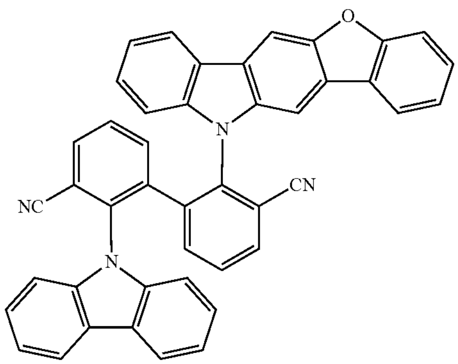
473
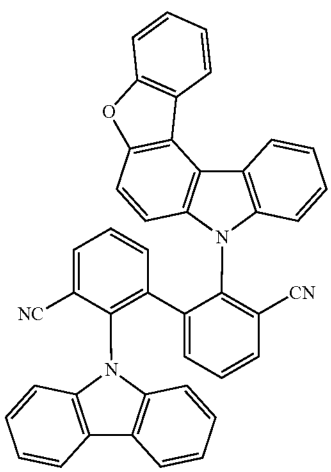
474
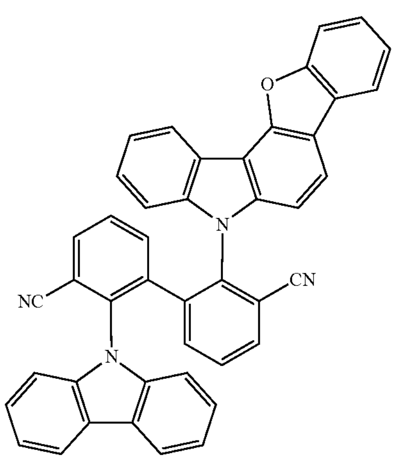
475
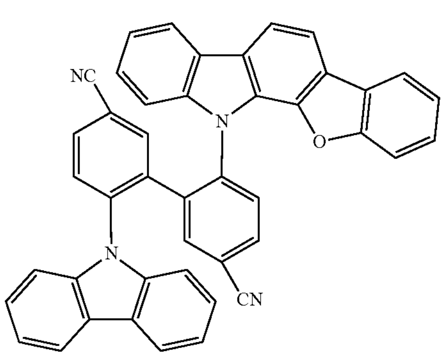
-continued
476
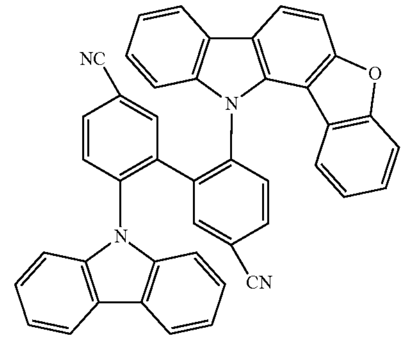
477
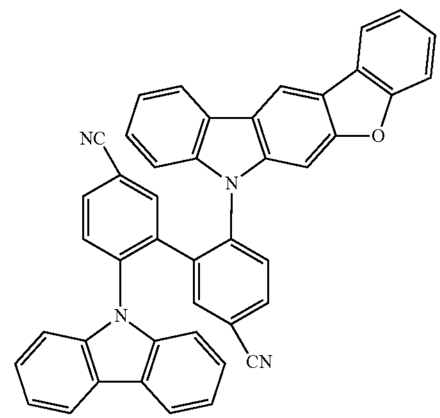
478
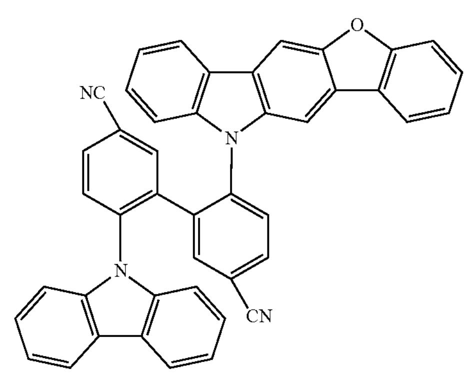
479
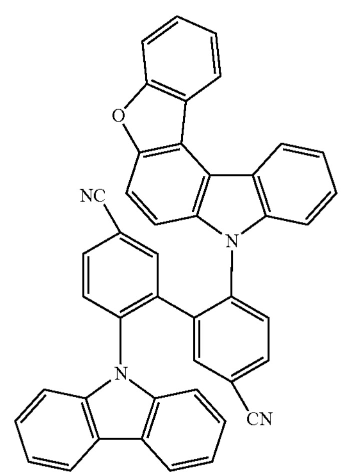

-continued
480
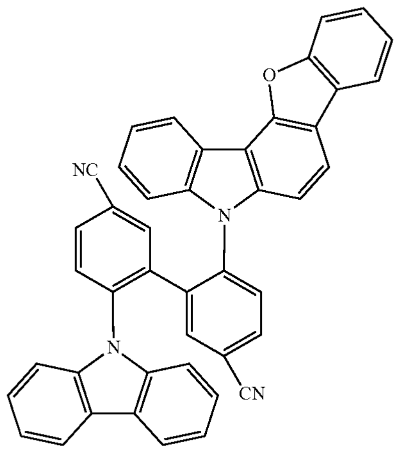
481
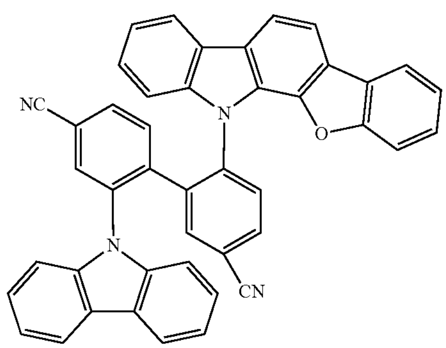
482
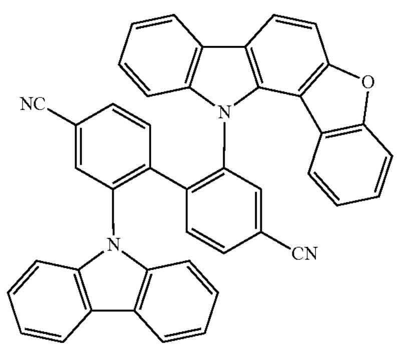
483
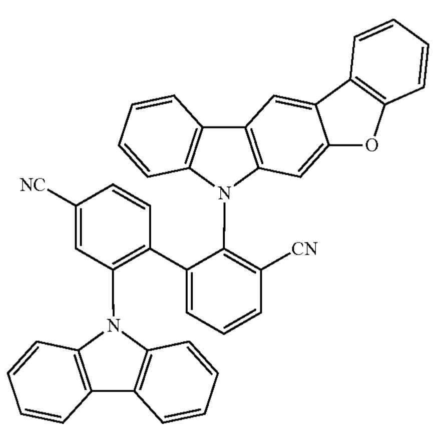
-continued
484
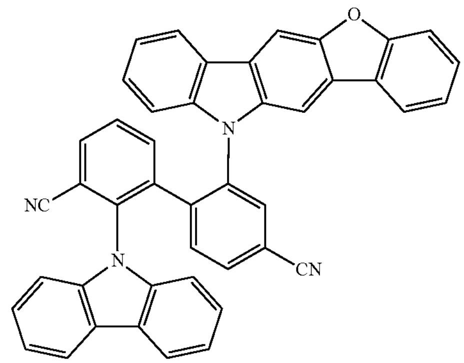
485
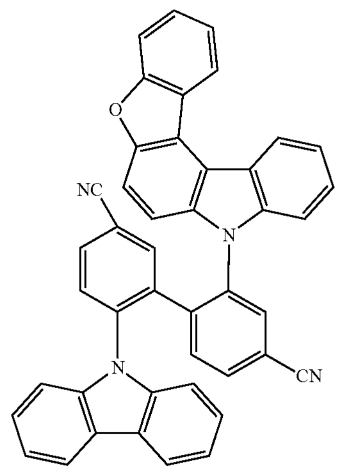
486
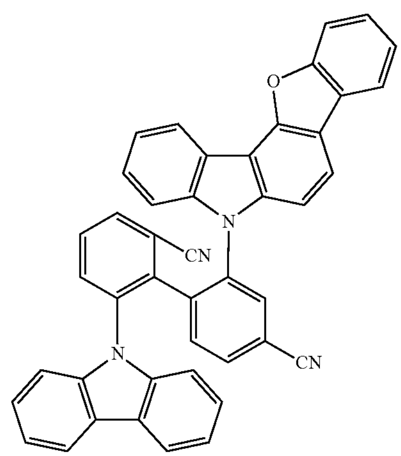
487
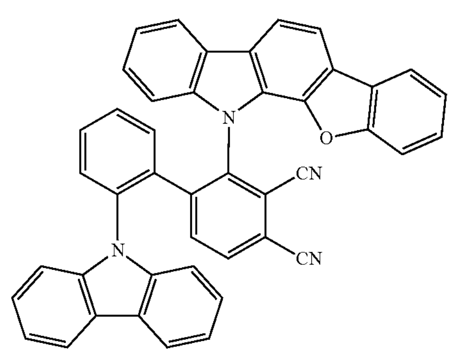

-continued
488
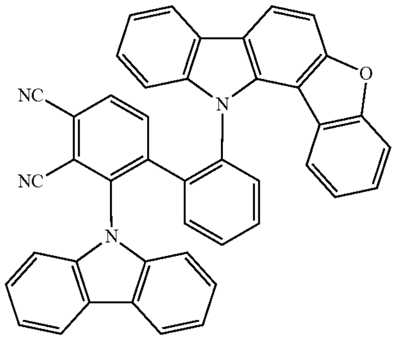
489
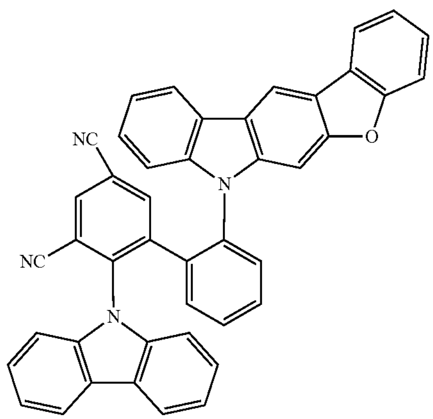
490
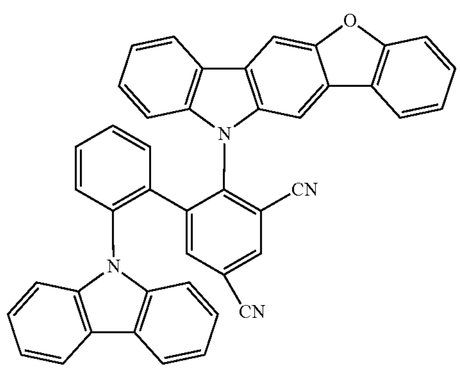
491
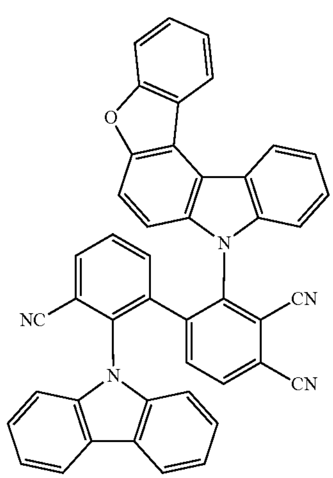
-continued
492
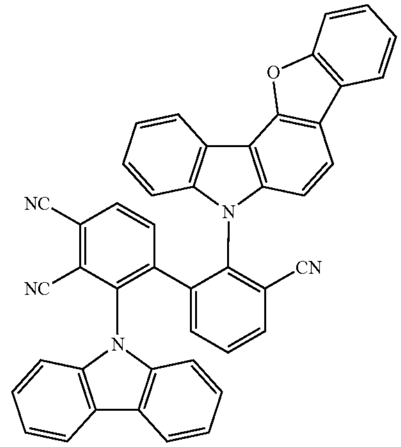
493
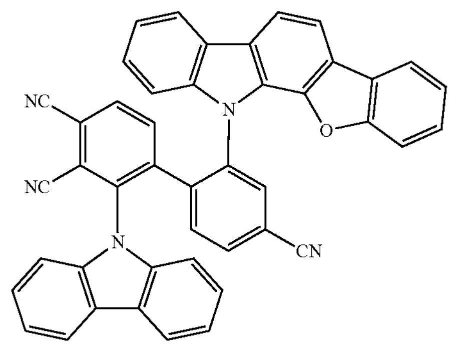
494
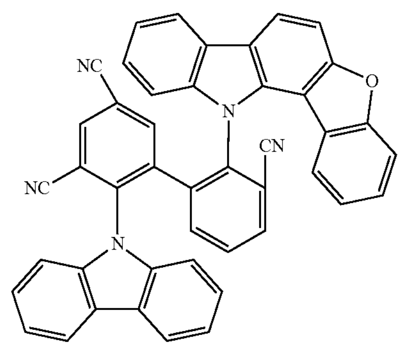
495
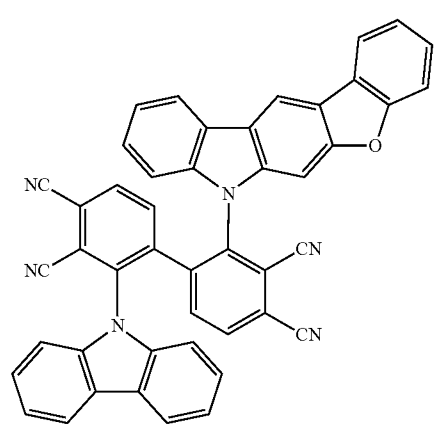

-continued
496
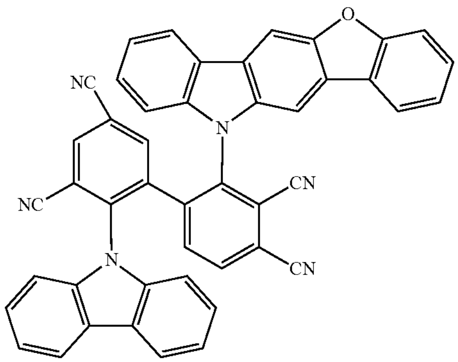
497
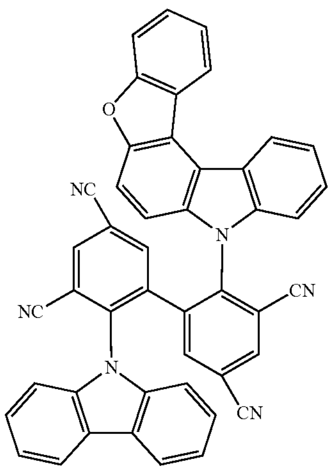
498
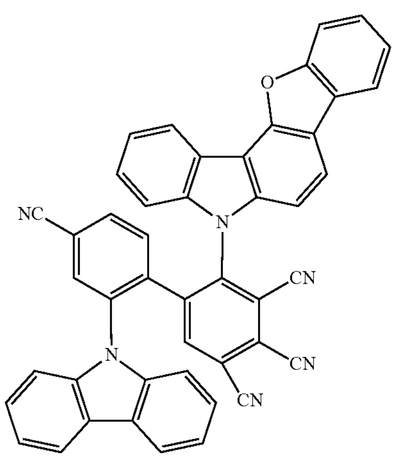
499
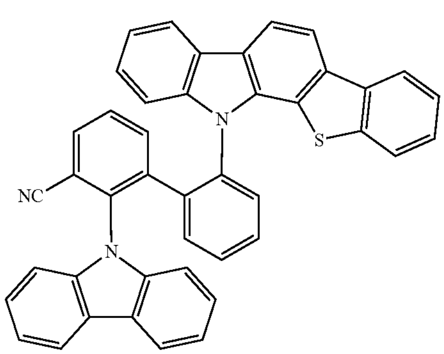
-continued
500
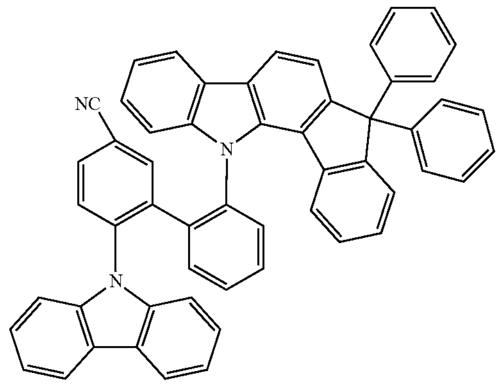
501
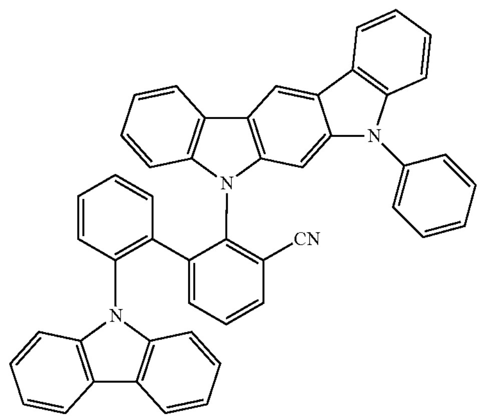
502
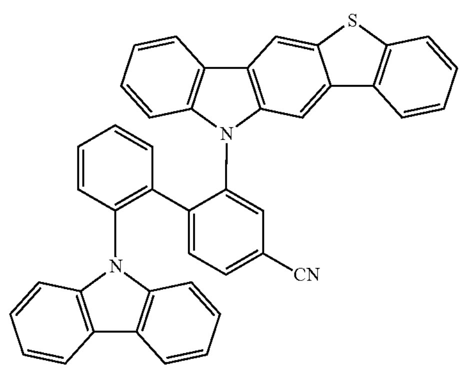
503
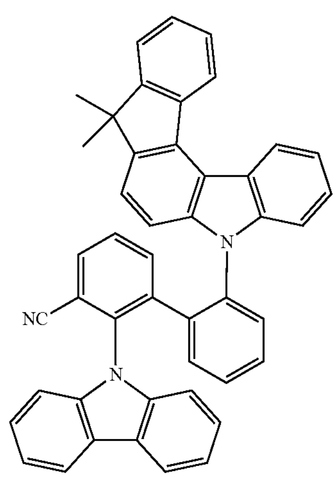

504
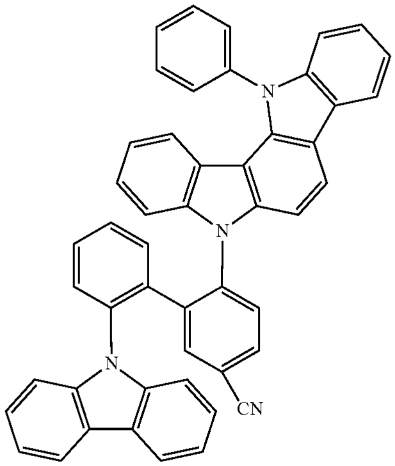
505
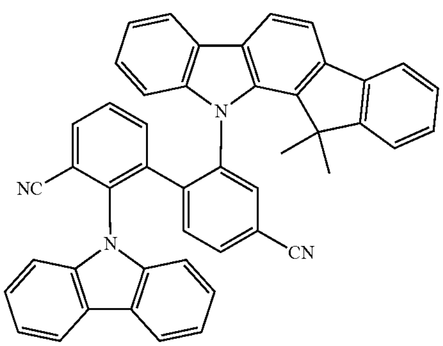
506
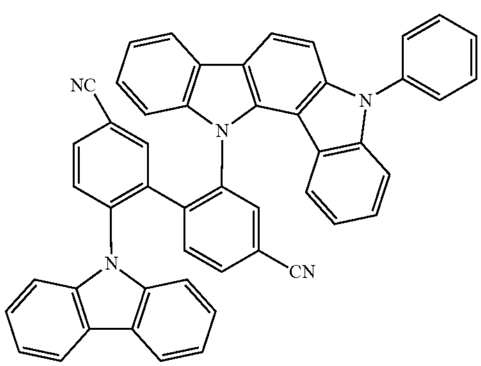
507
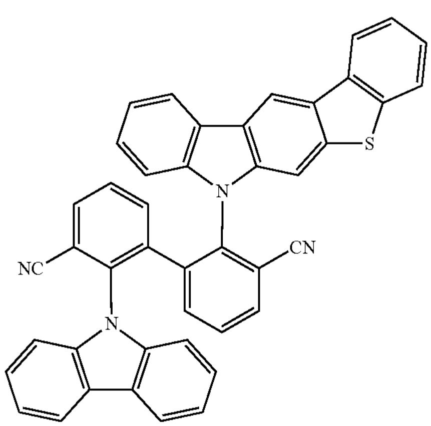
508
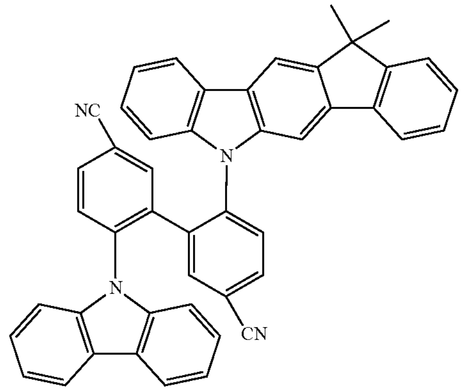
509
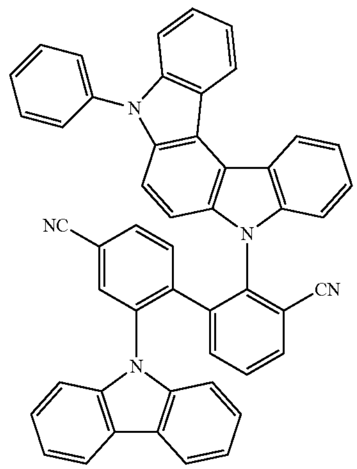
510
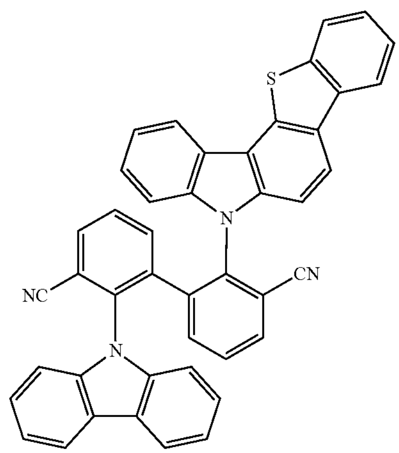
511
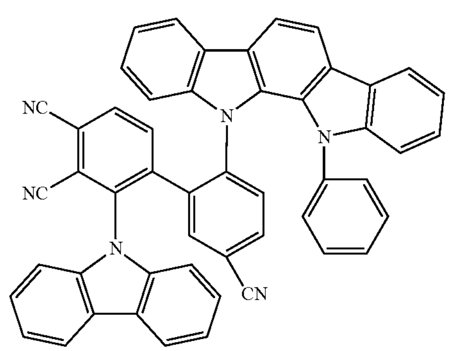

512
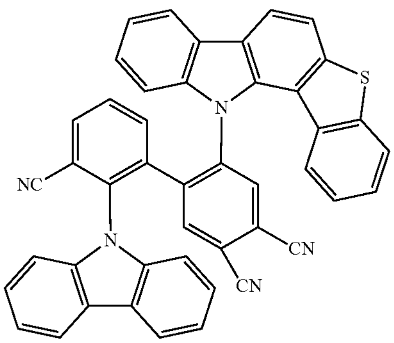
513
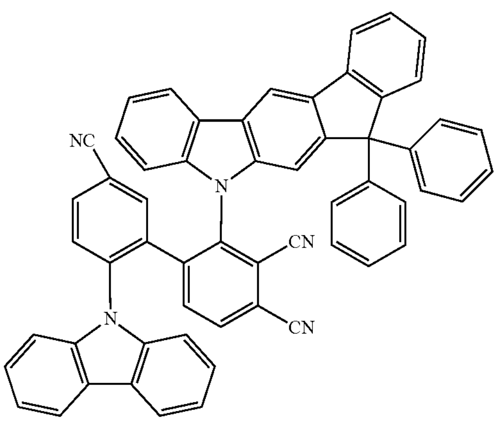
514
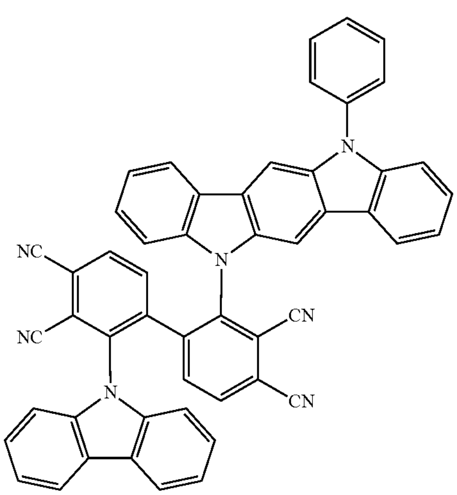
515
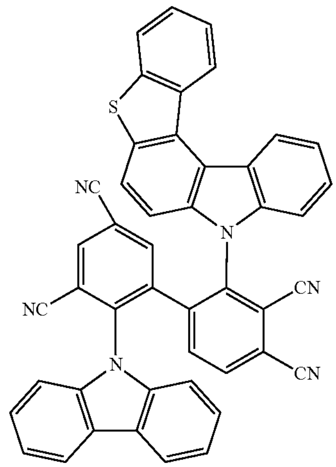
516
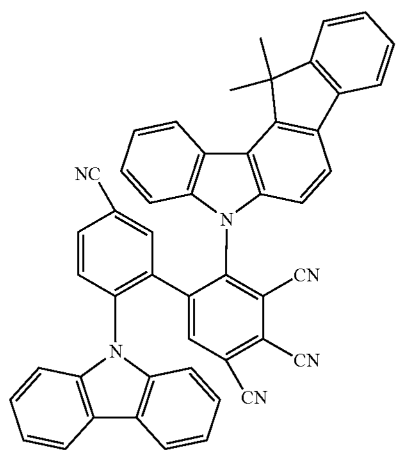
517
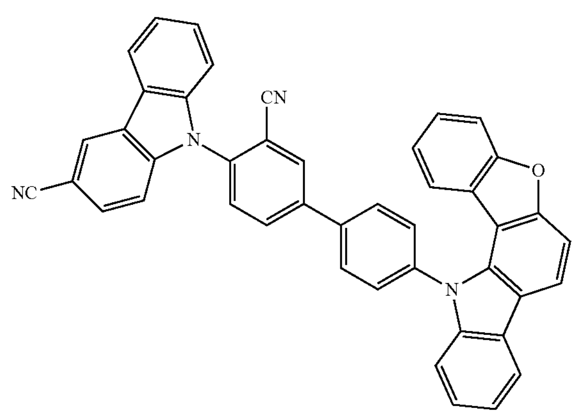

-continued
518
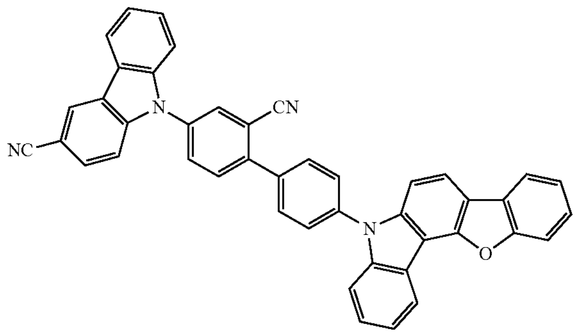
519
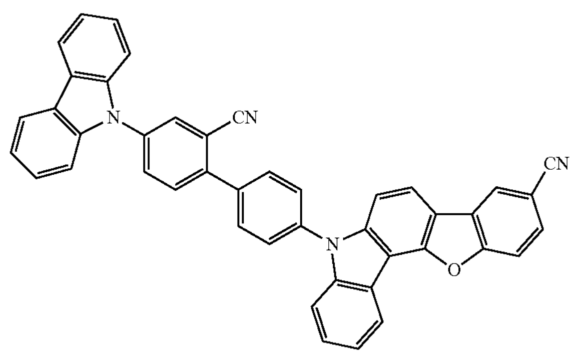
520
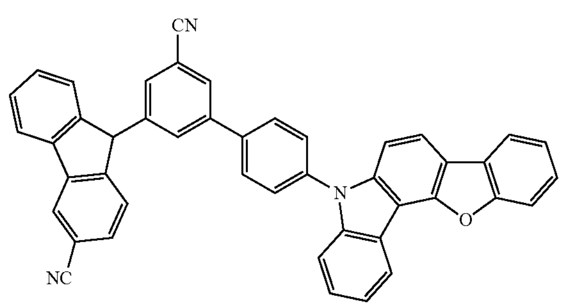
521
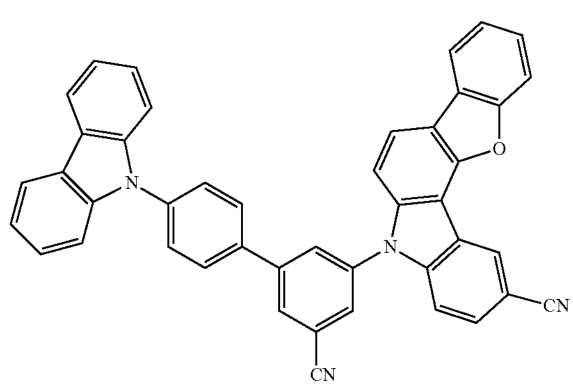
-continued
522
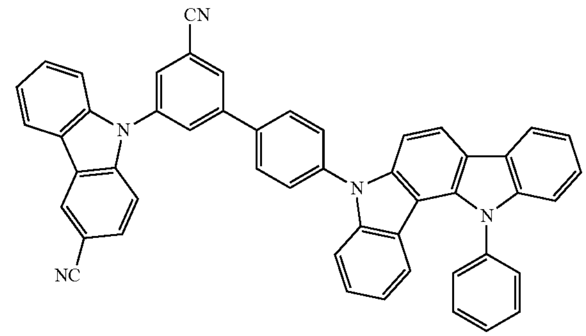
523
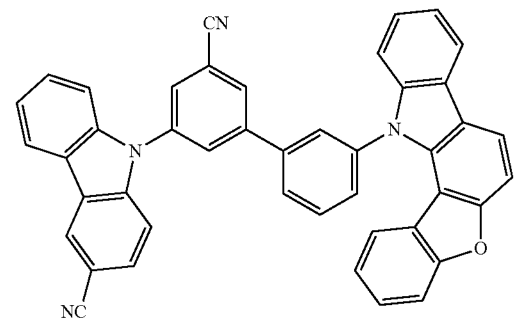
524
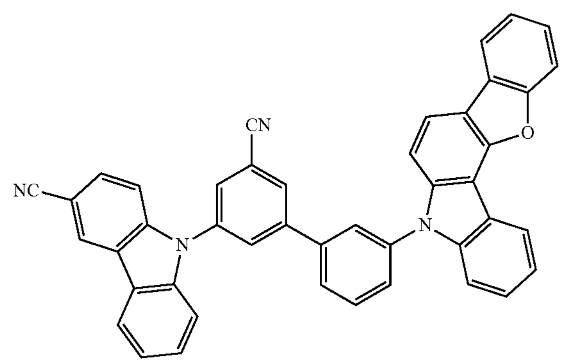
525
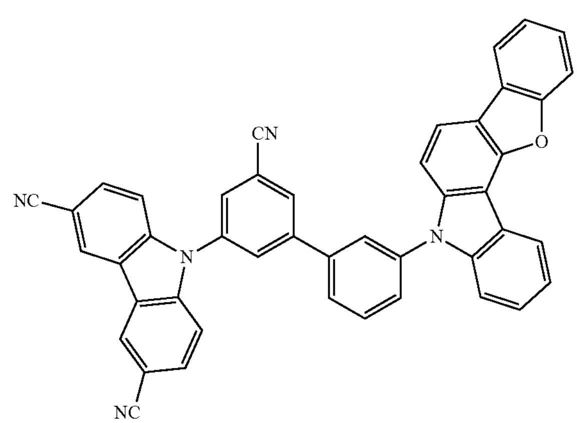

-continued
526
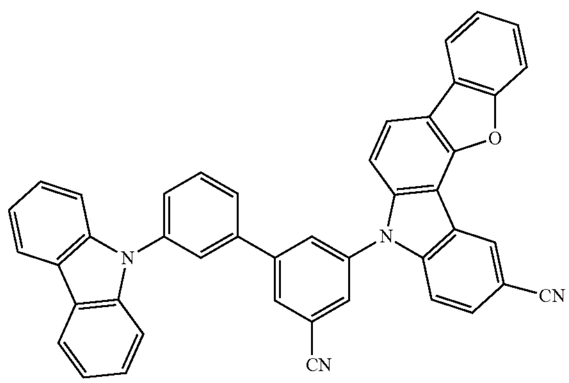
527
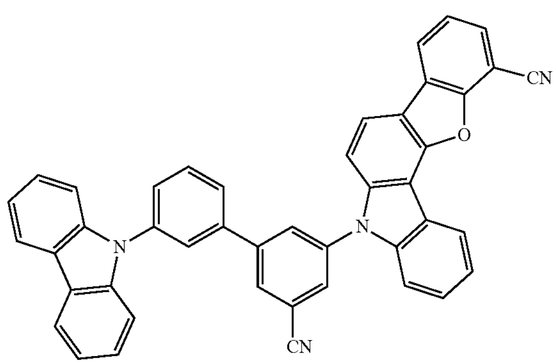
528
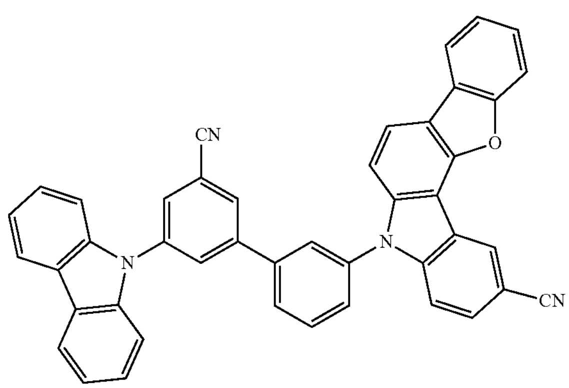
529
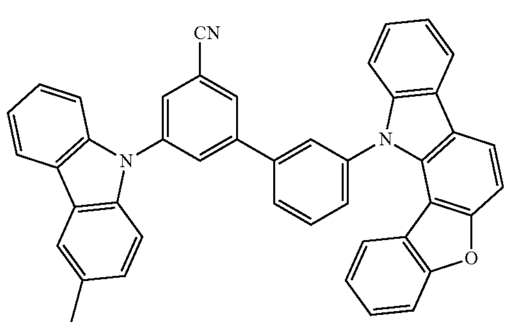
-continued
530
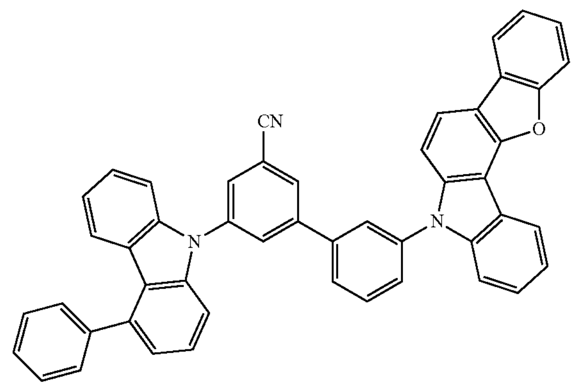
531
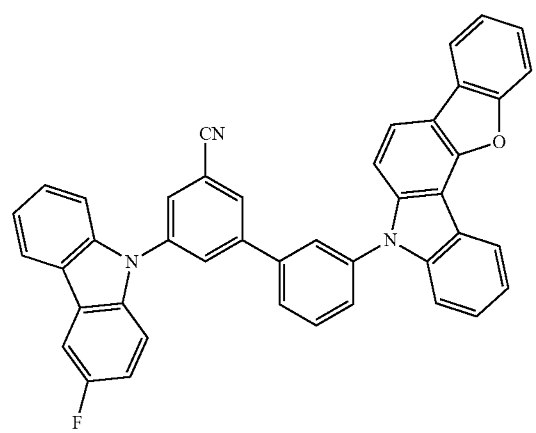
532
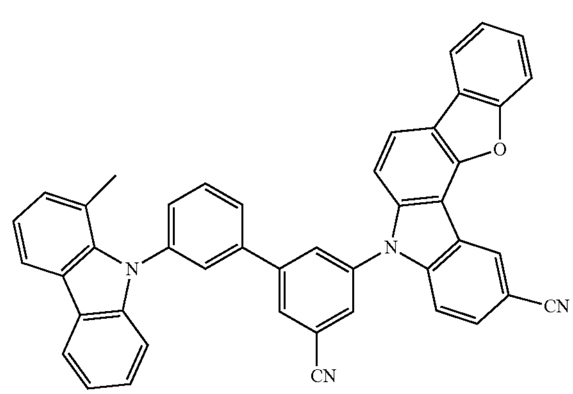

-continued
533
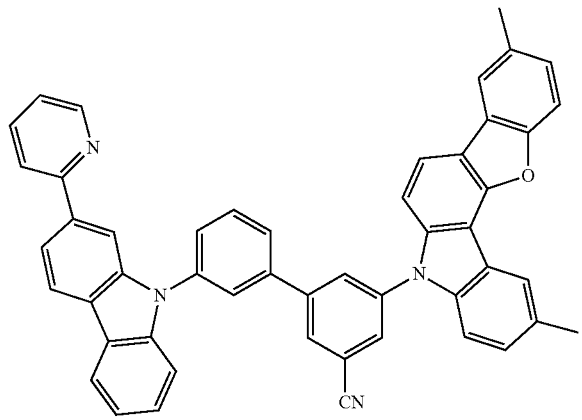
534
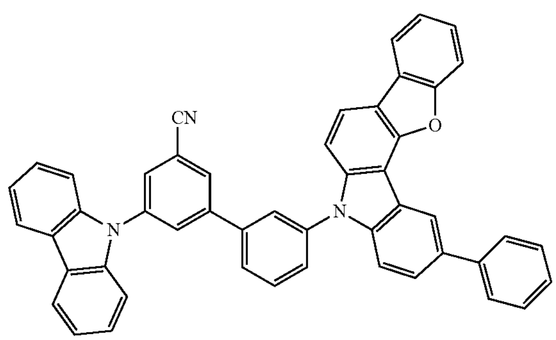
535
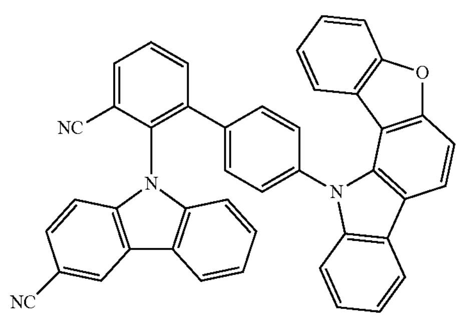
536
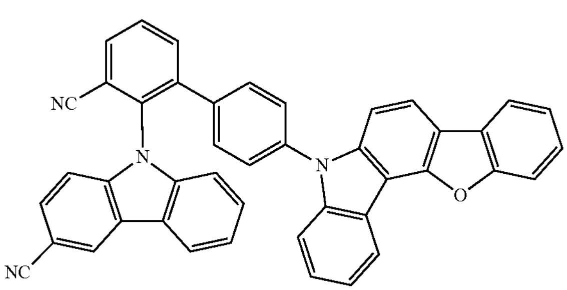
-continued
537
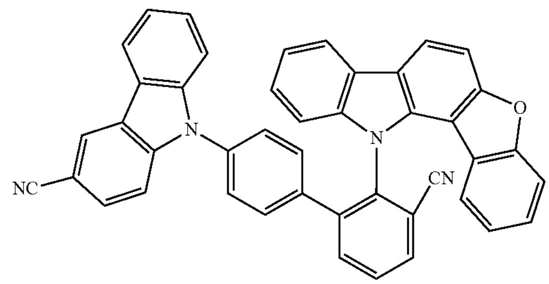
538
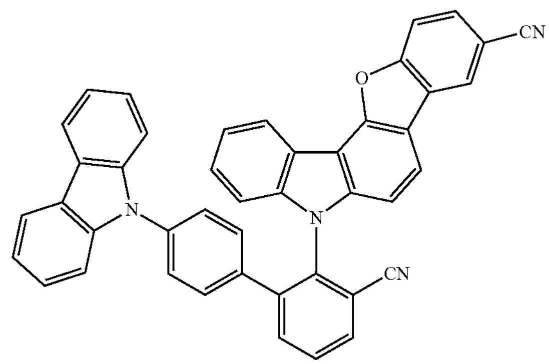
539
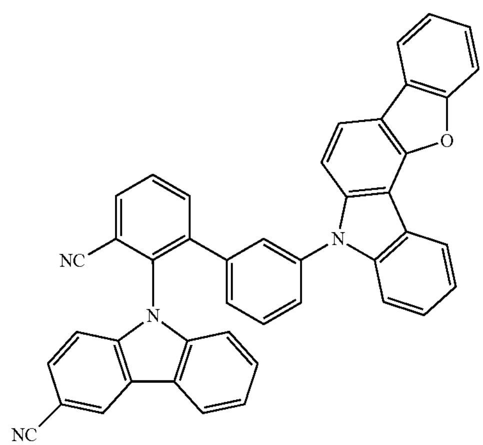
540
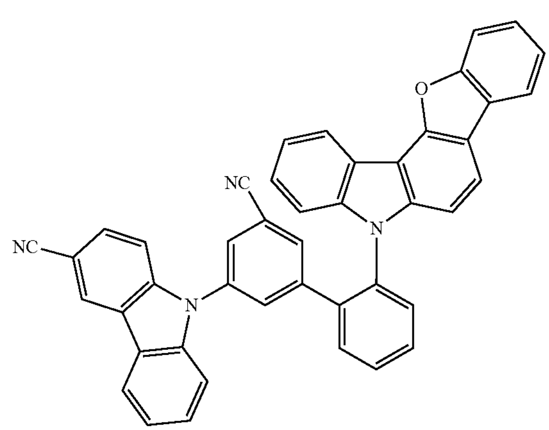

-continued
541
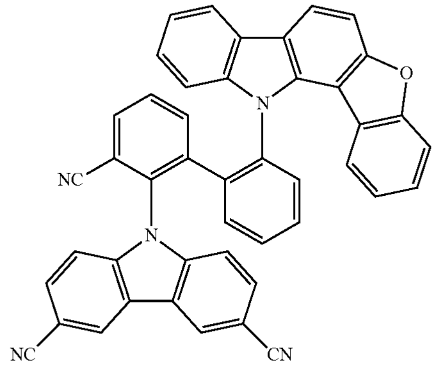
542
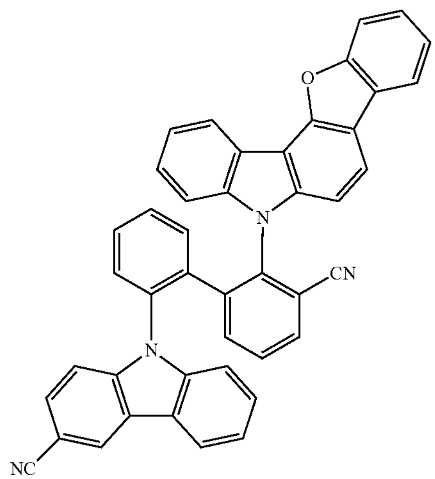
543
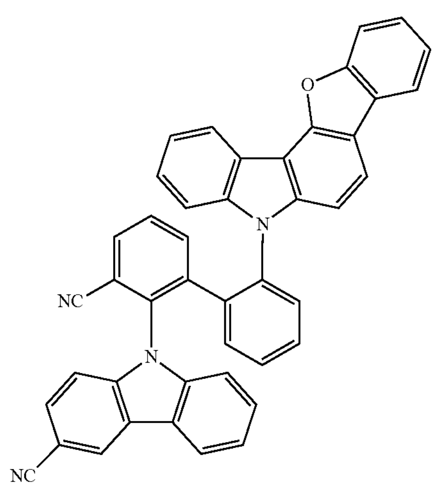
-continued
544
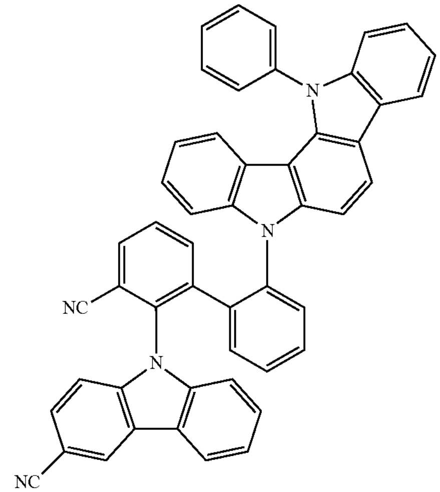
545
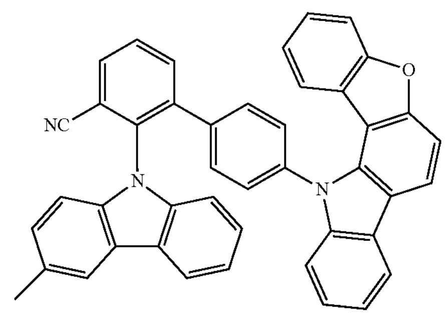
546
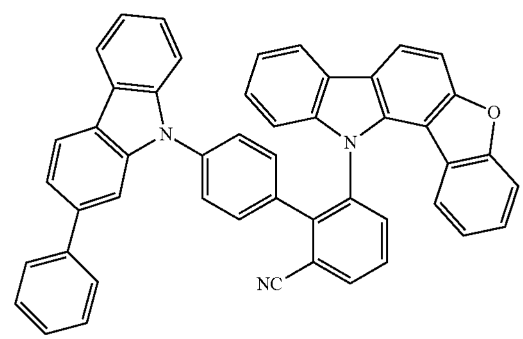
547
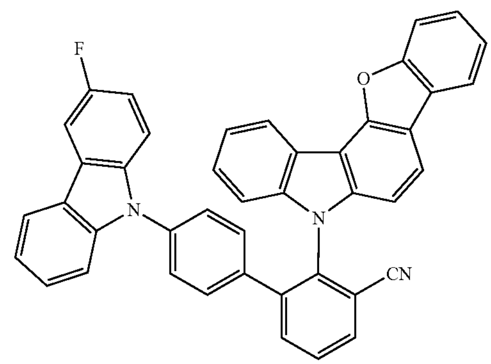

-continued
548
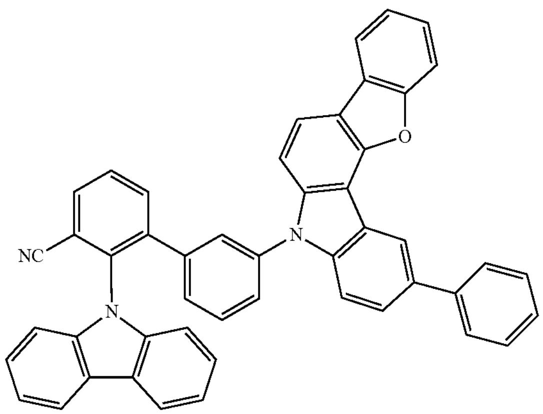
549
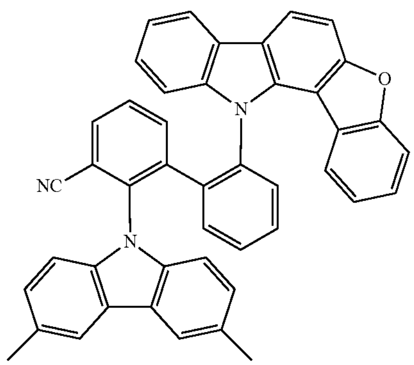
550
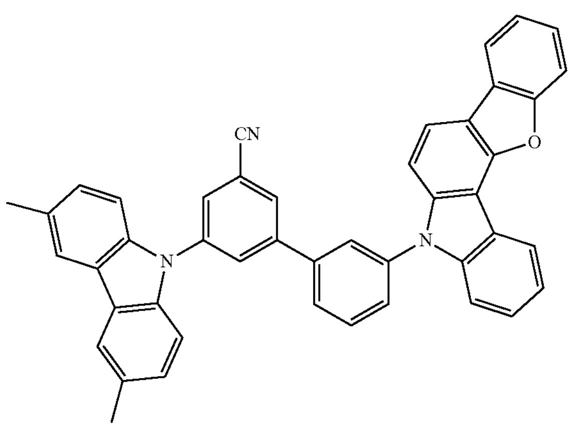
551
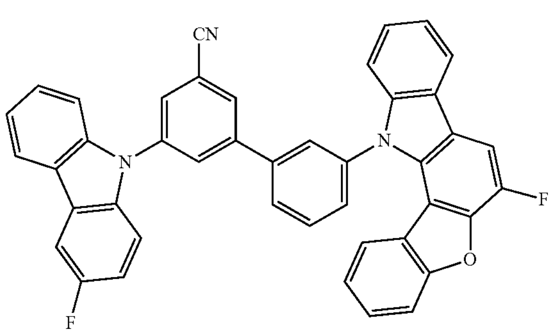
-continued
552
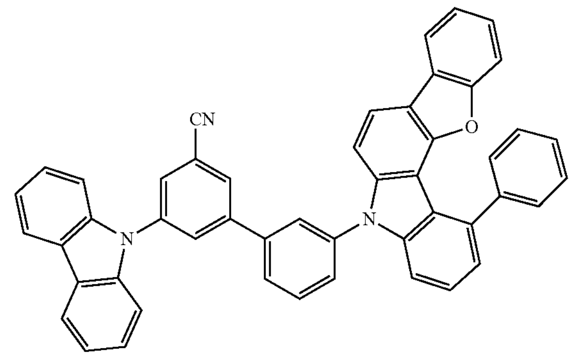
553
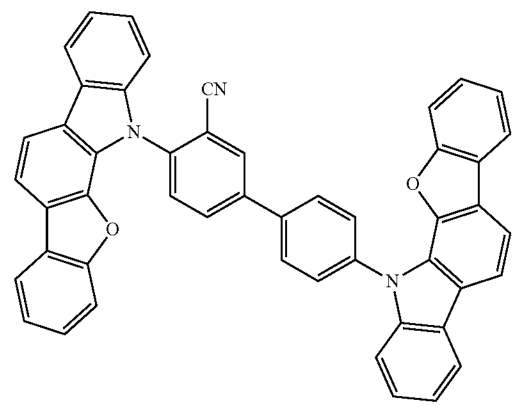
554
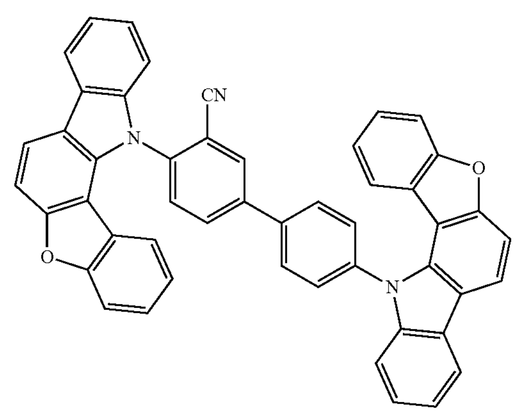
555
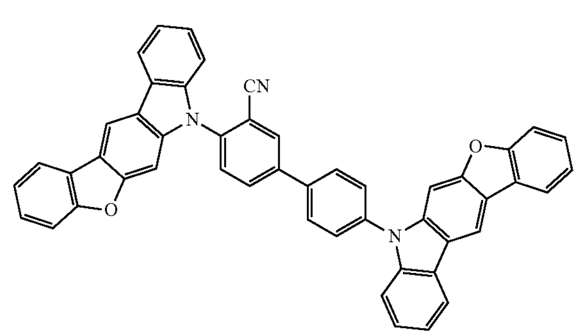

556
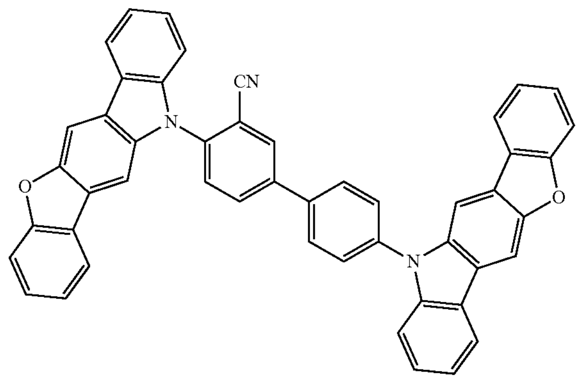
557
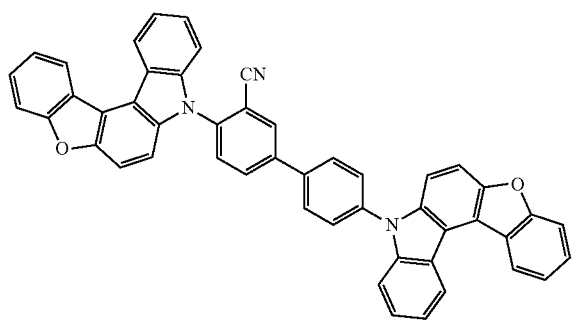
558
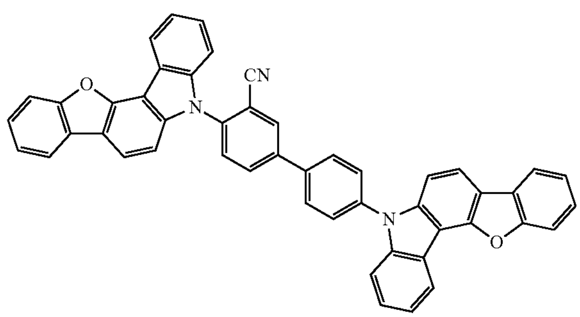
559
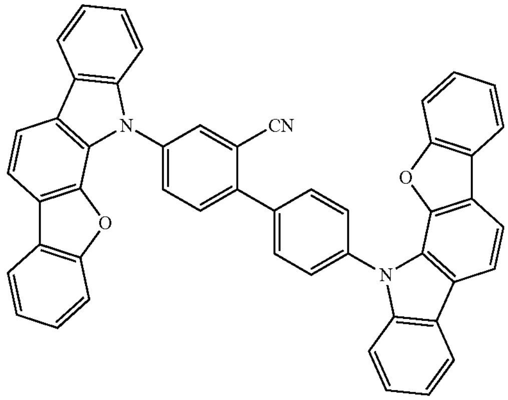
560
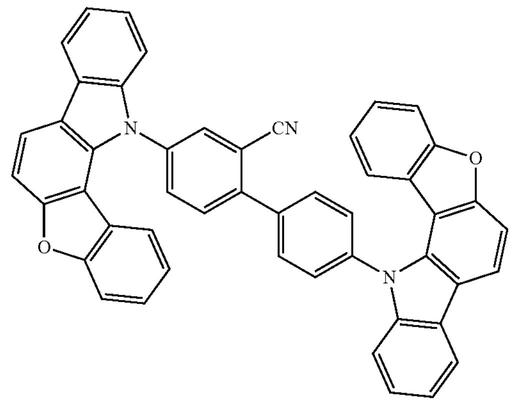
561
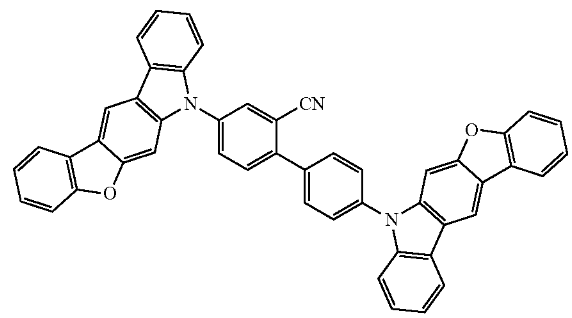
562
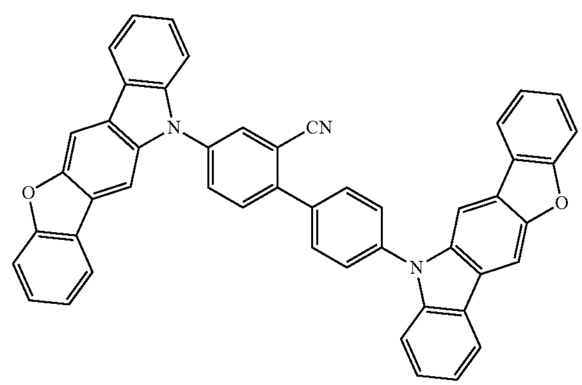
563
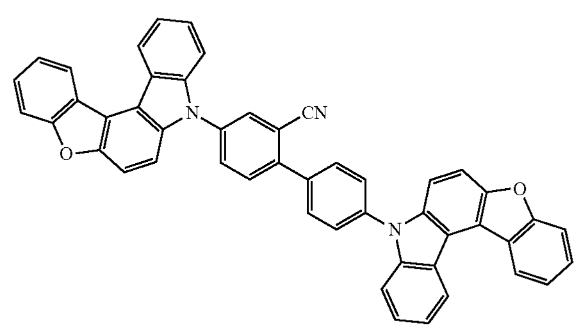

564
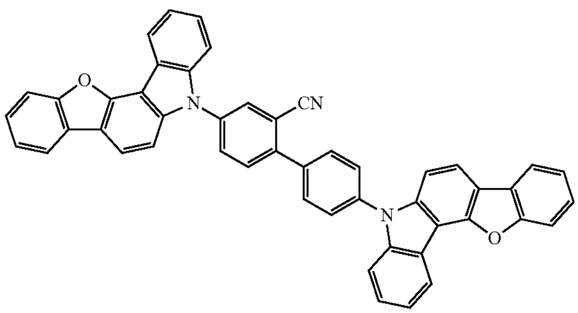
565
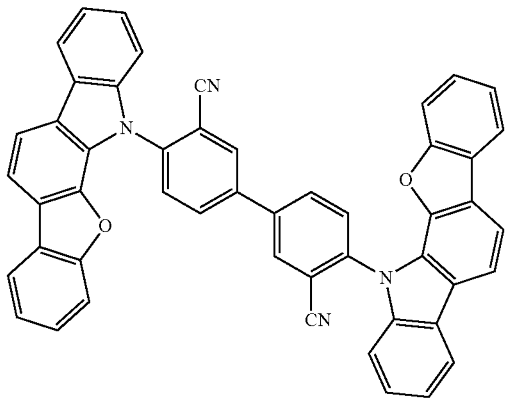
566
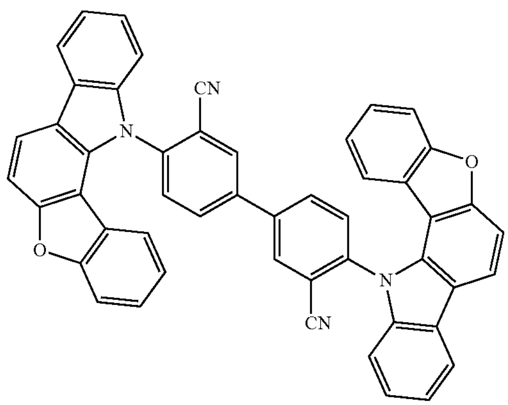
567
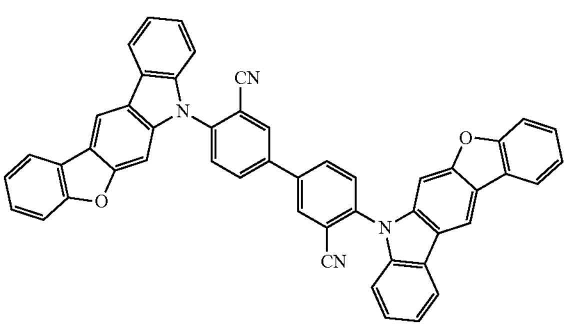
568
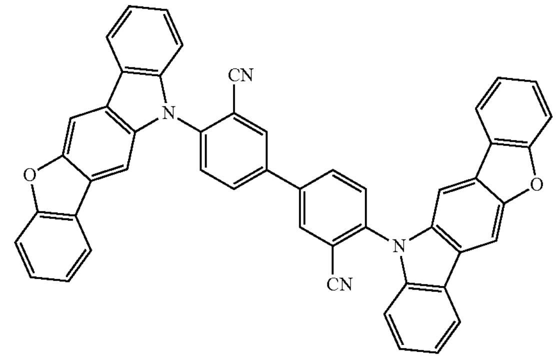
569
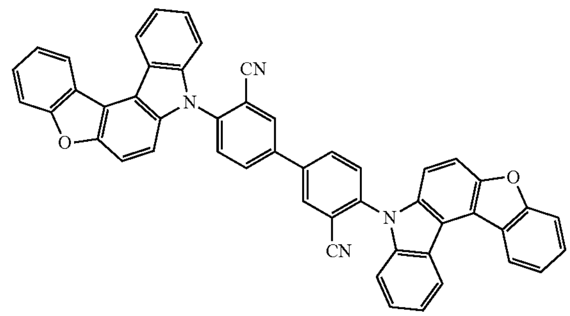
570
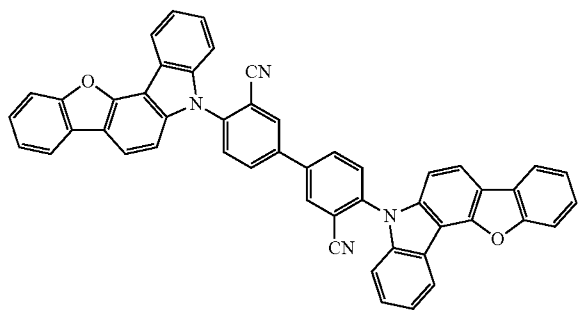
571
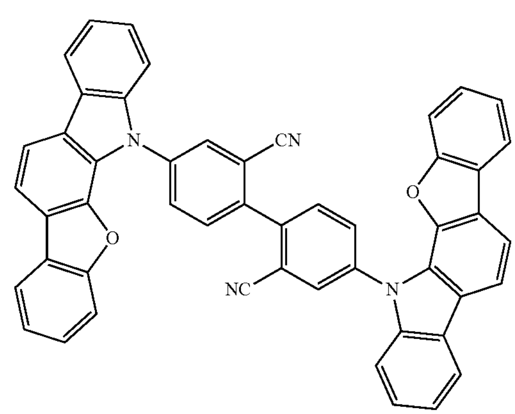

572
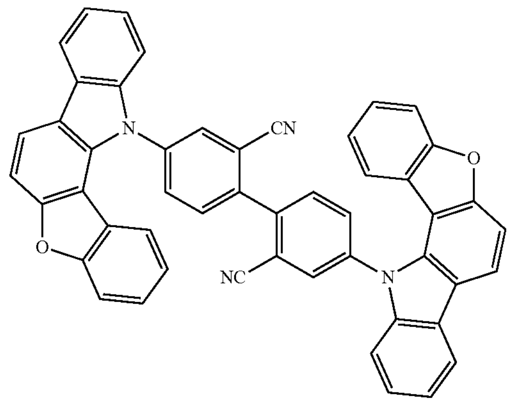
573
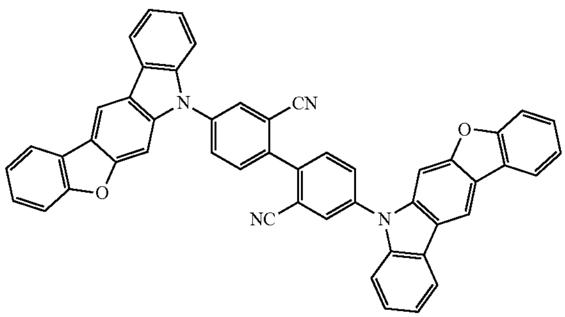
574
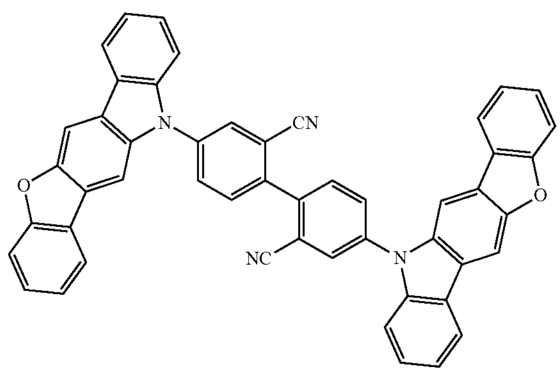
575
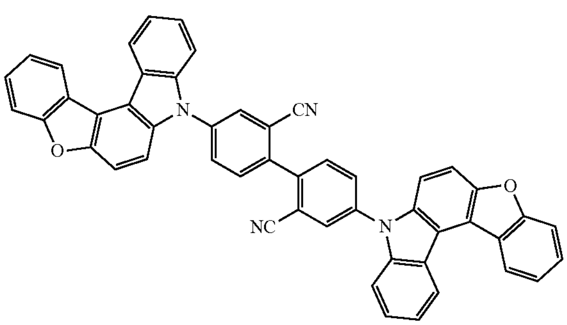
576
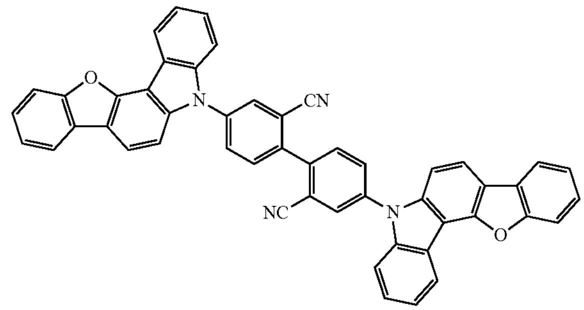
577
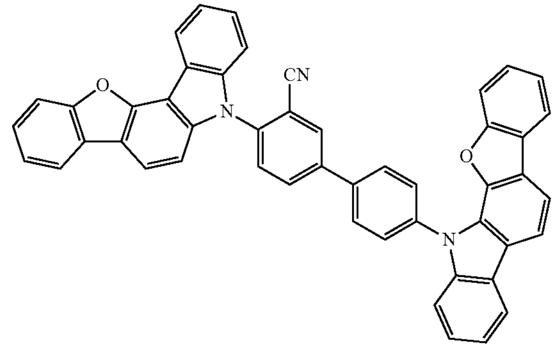
578
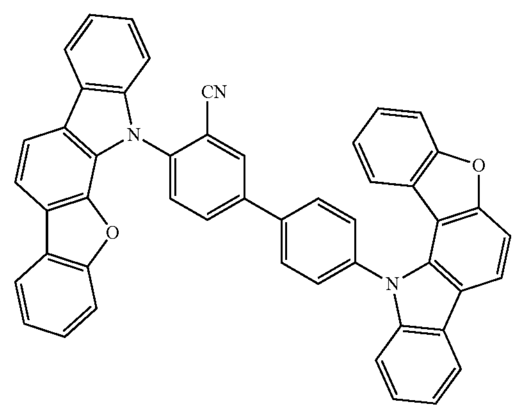
579
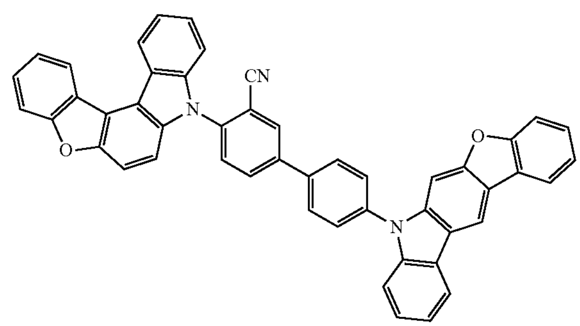

580
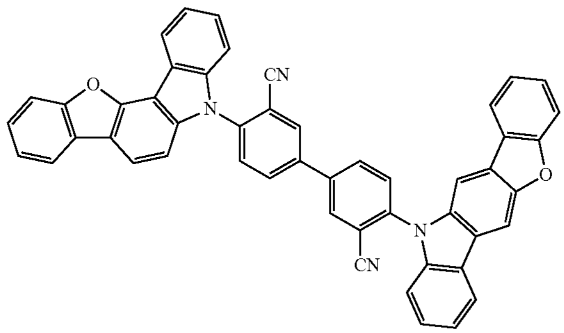
581
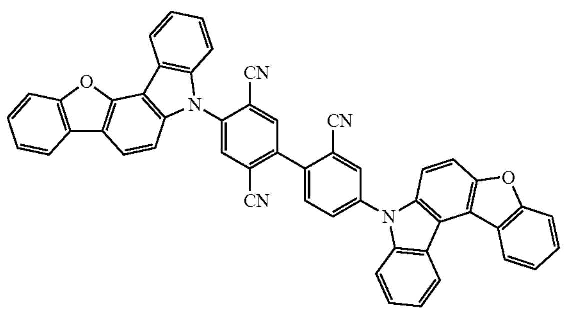
582
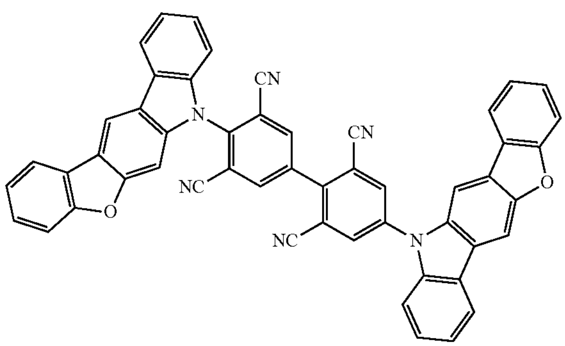
583
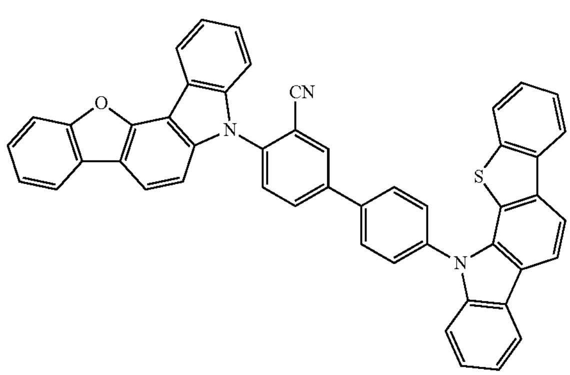
584
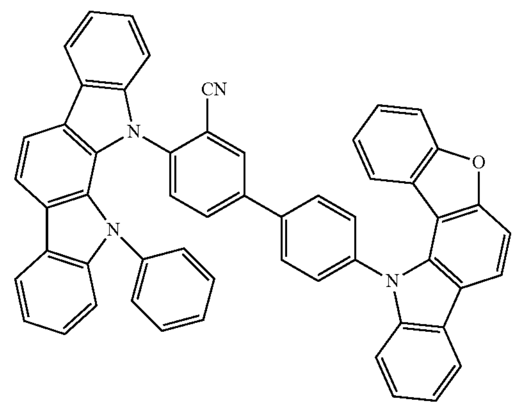
585
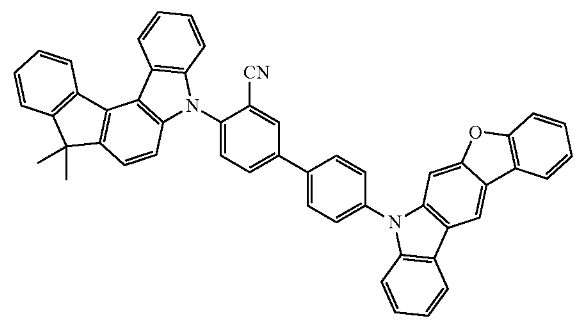
586
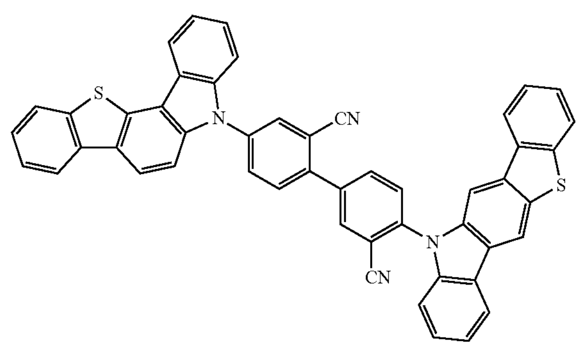
587
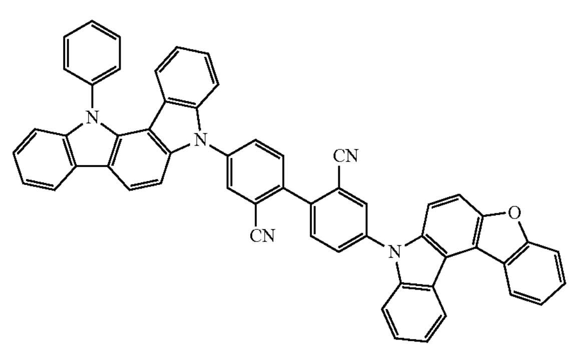

-continued
588
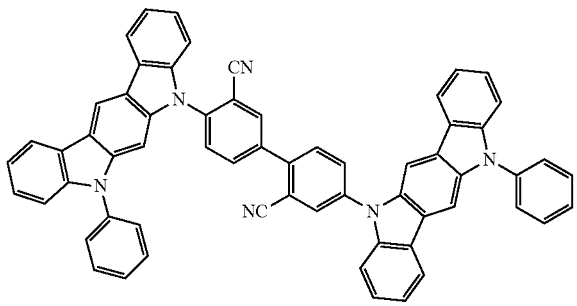
589
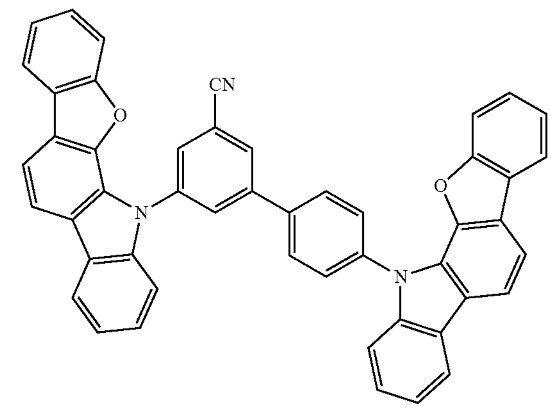
590
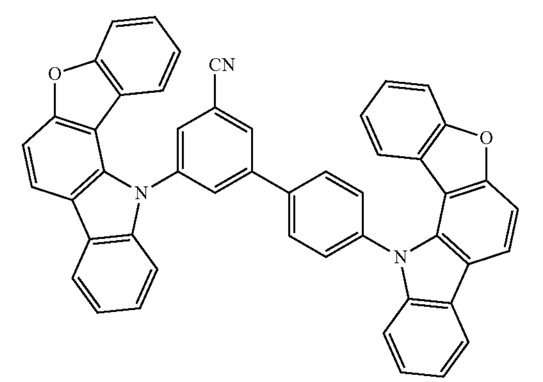
591
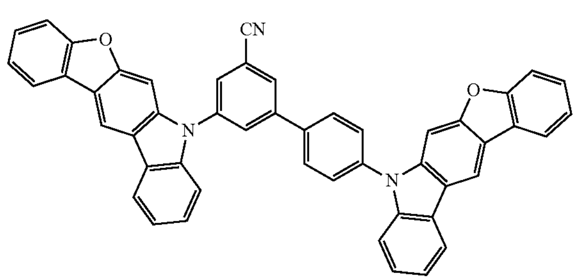
-continued
592
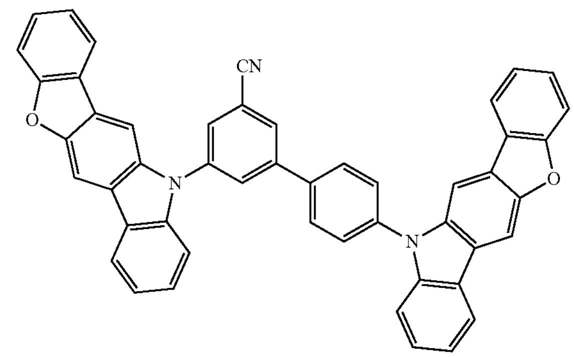
593
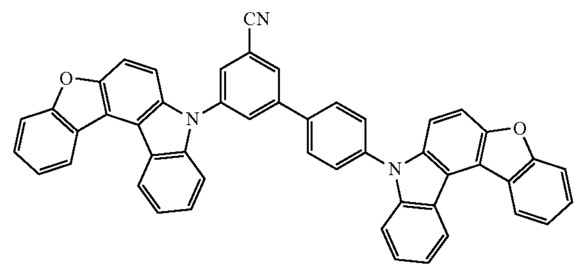
594
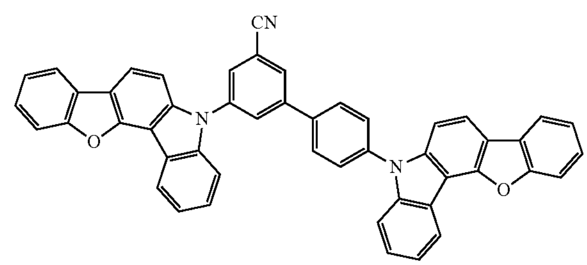
595
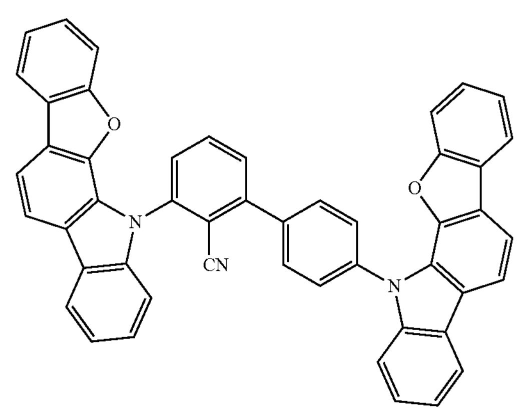

-continued
596
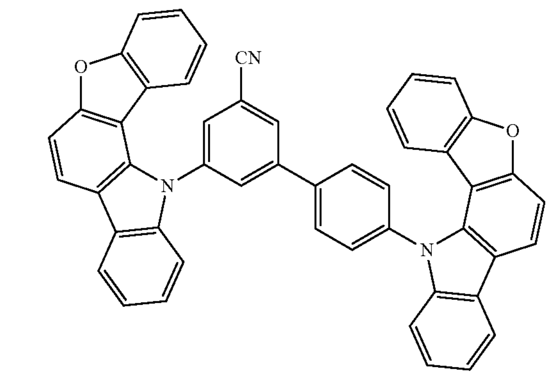
597
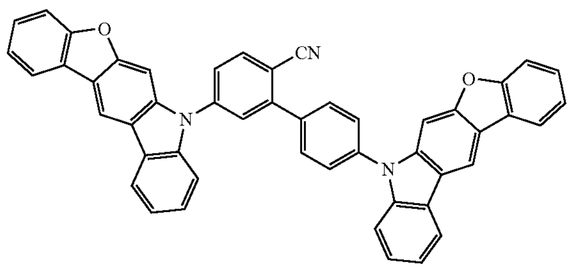
598
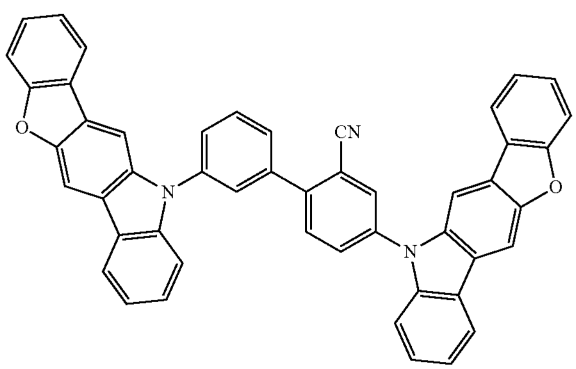
599
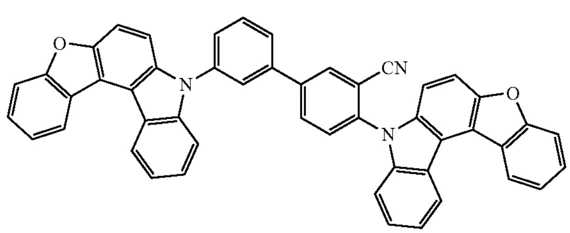
600
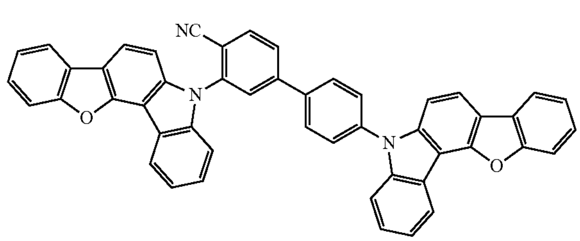
-continued
601
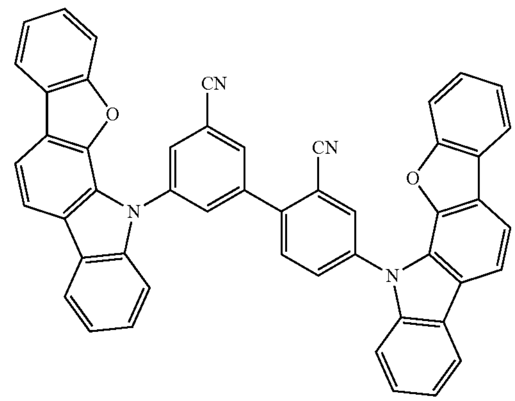
602
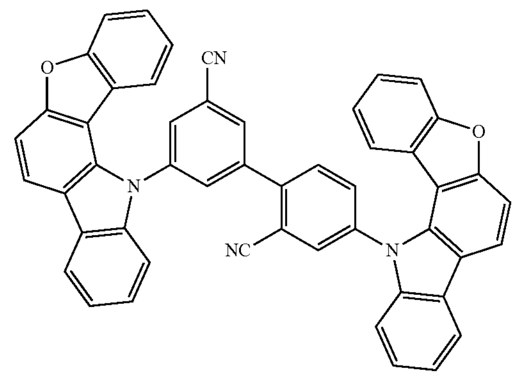
603
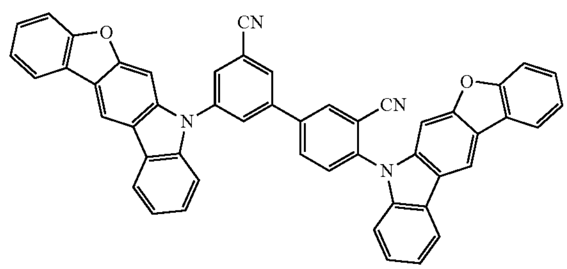
604
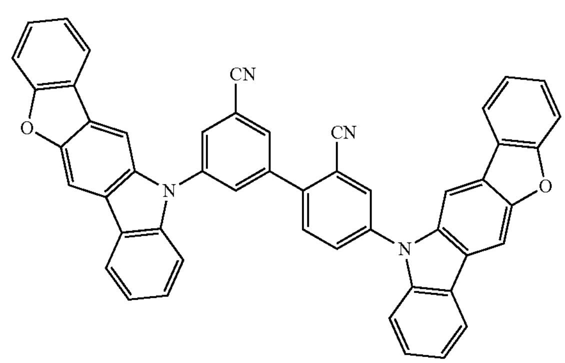

-continued
605
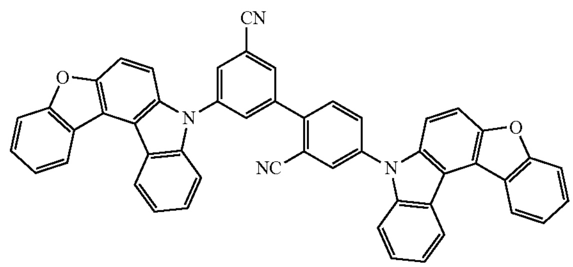
606
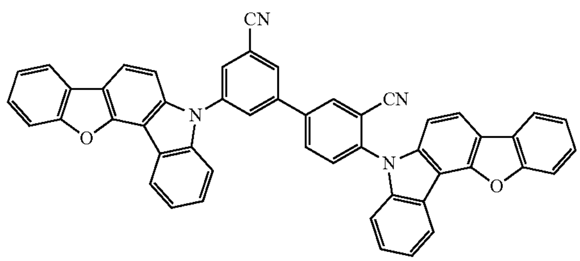
607
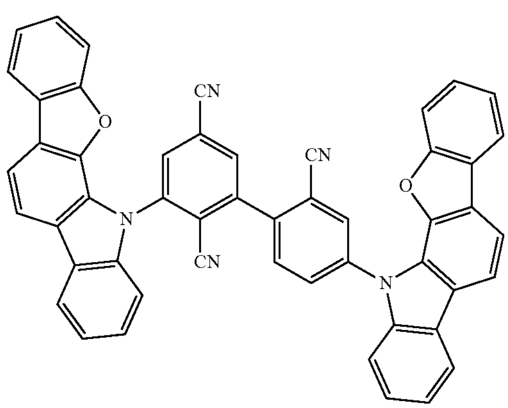
608
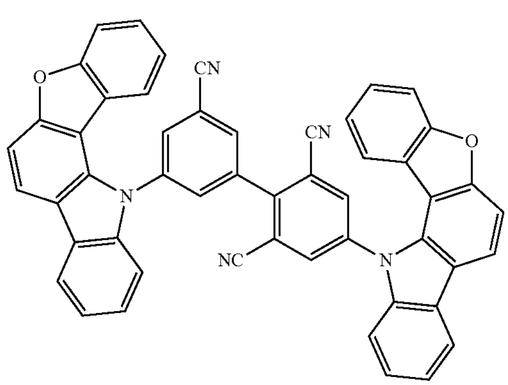
-continued
609
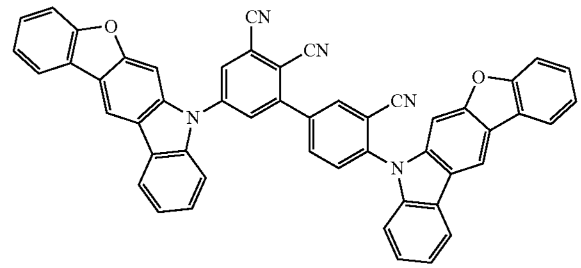
610
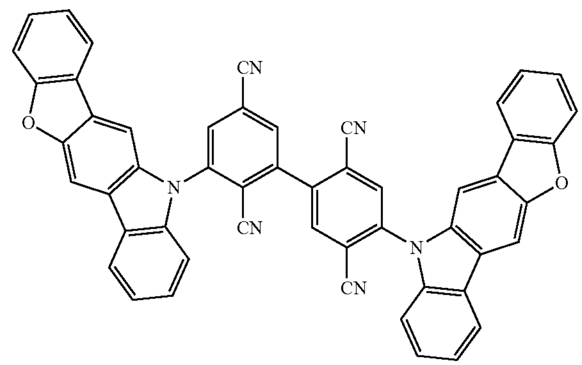
611
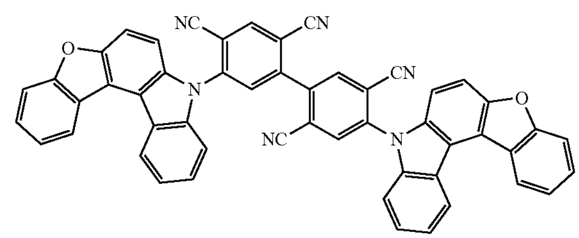
612
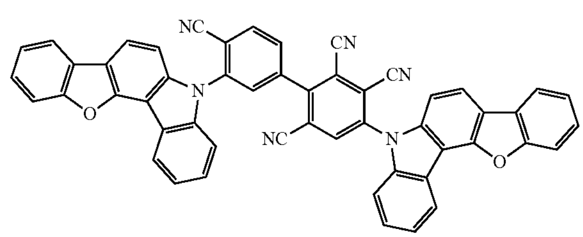
613
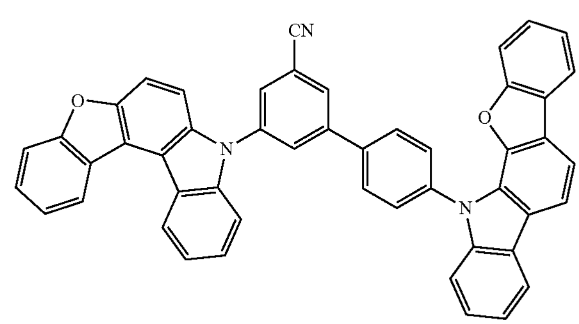

-continued
614
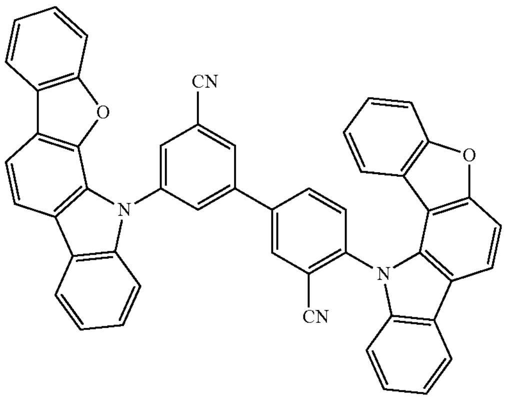
615
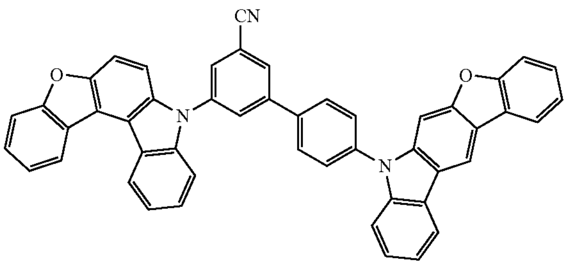
616
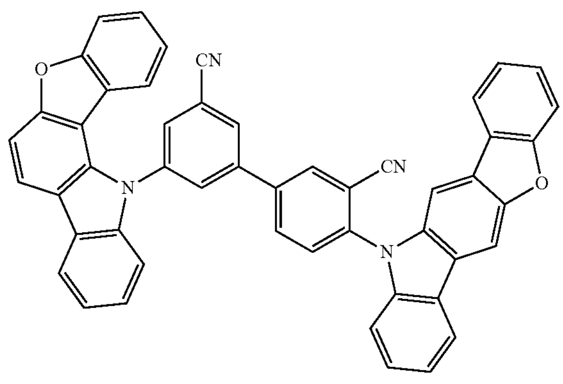
617
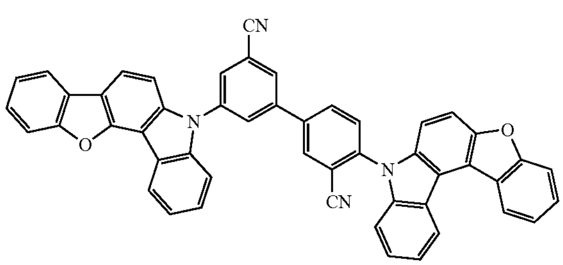
-continued
618
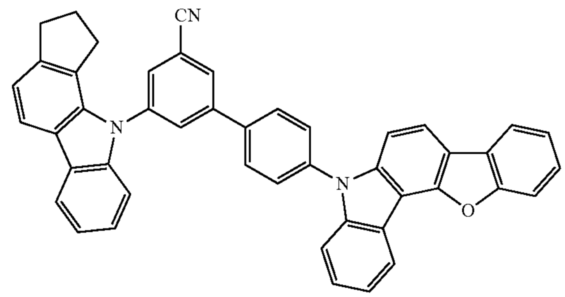
619
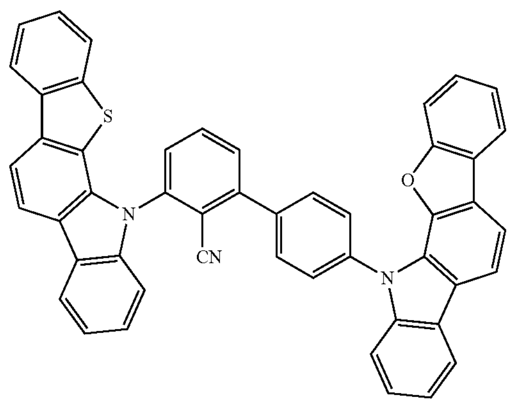
620
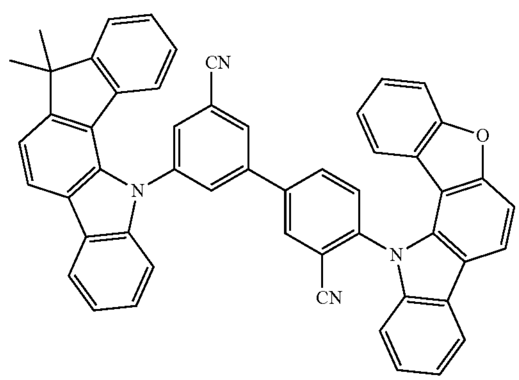
621
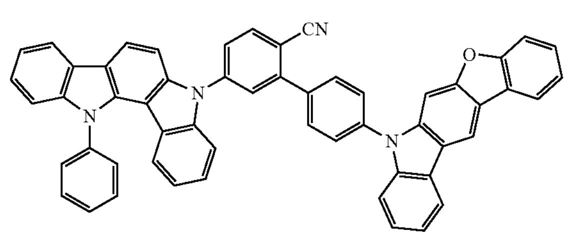

-continued
622
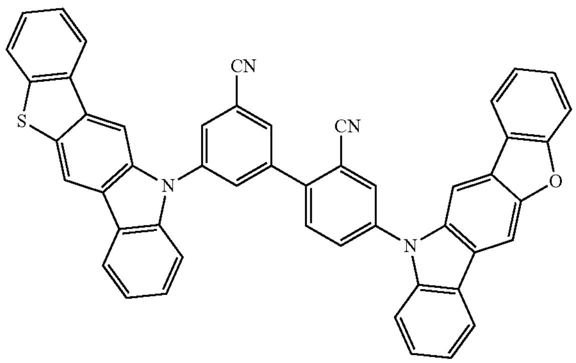
623
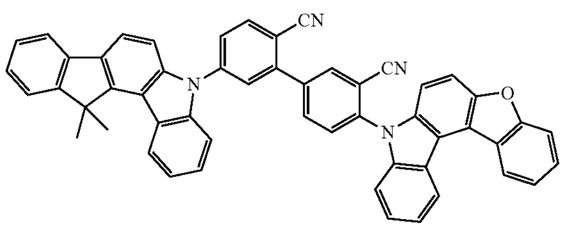
624
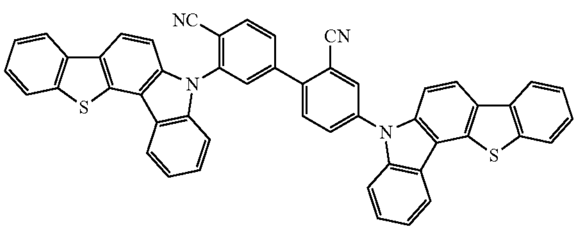
625
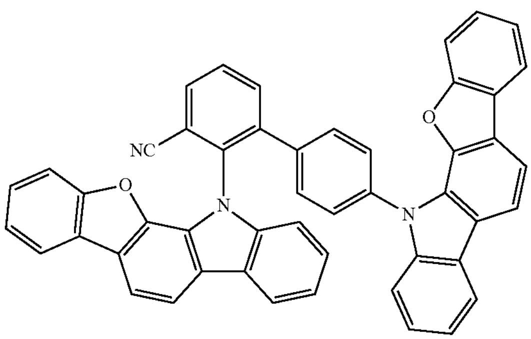
626
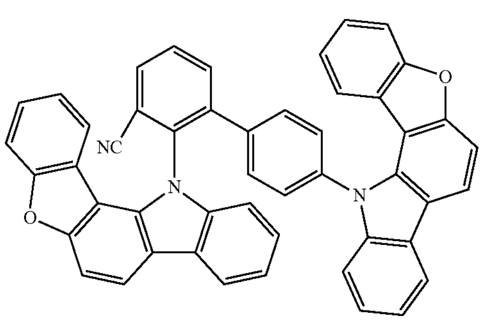
-continued
627
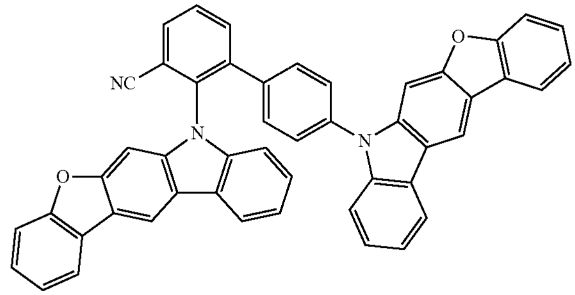
628
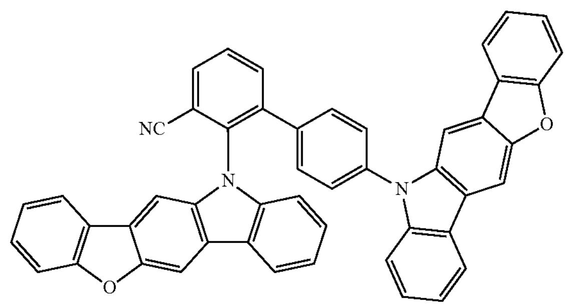
629
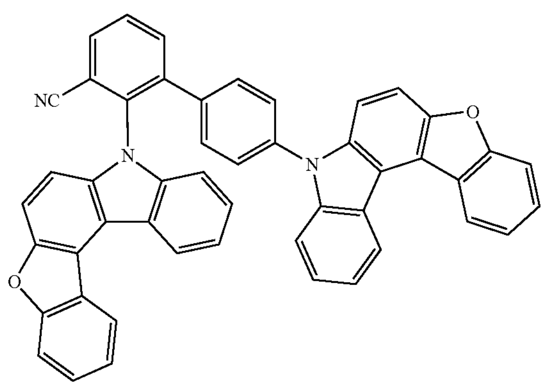
630
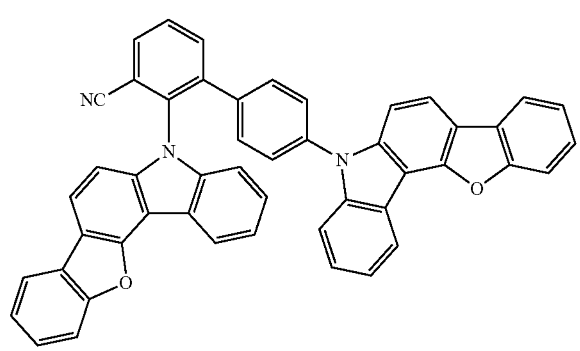

-continued
631
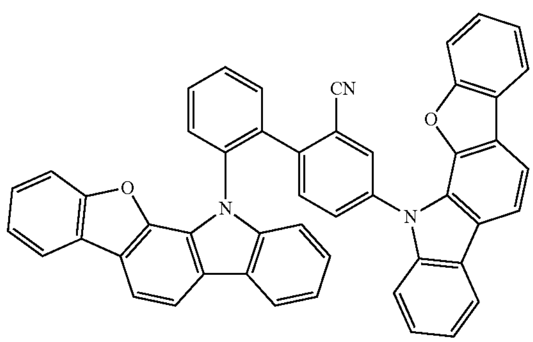
632
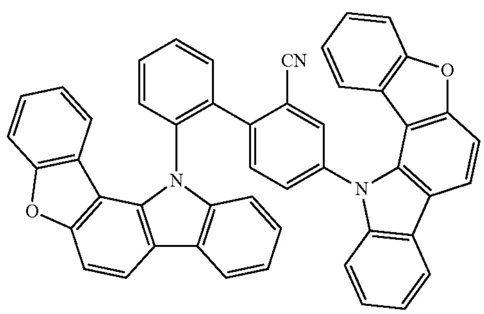
633
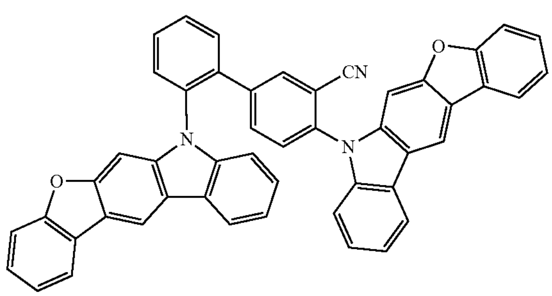
634
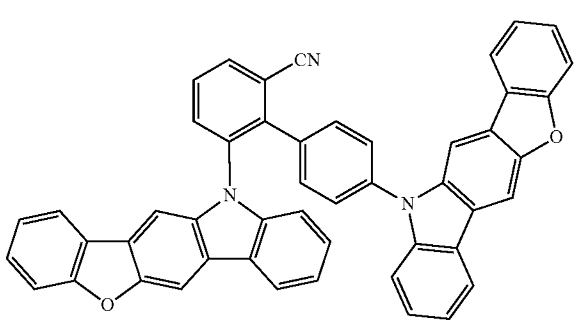
-continued
635
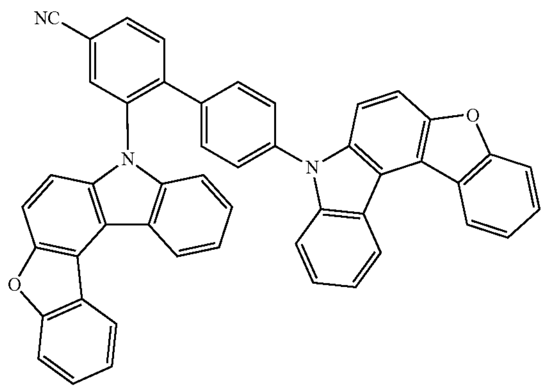
636
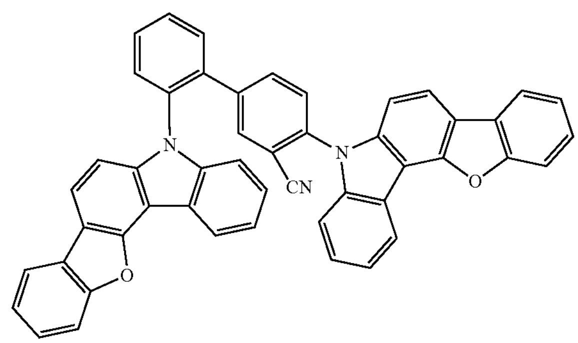
637
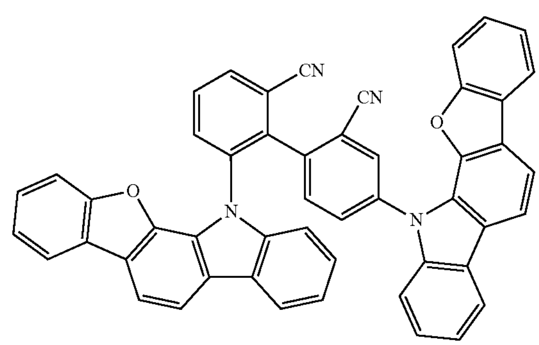
638
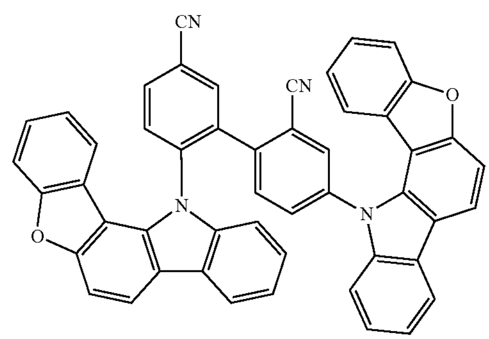

639
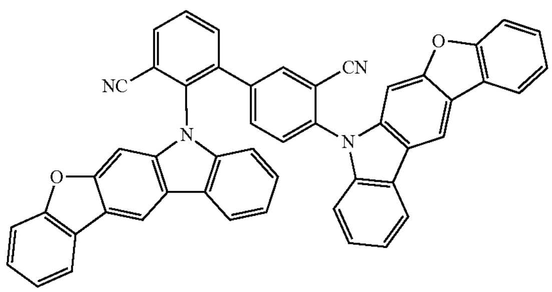
640
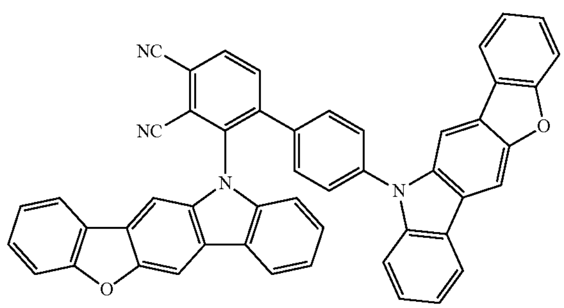
641
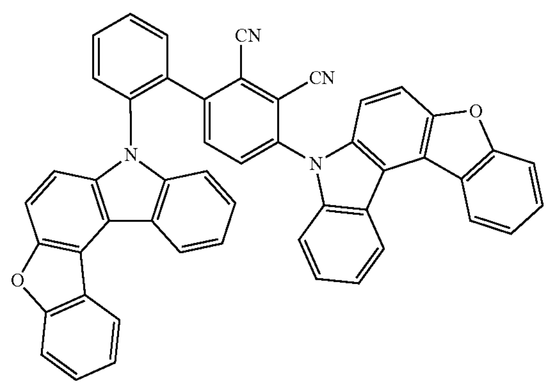
642
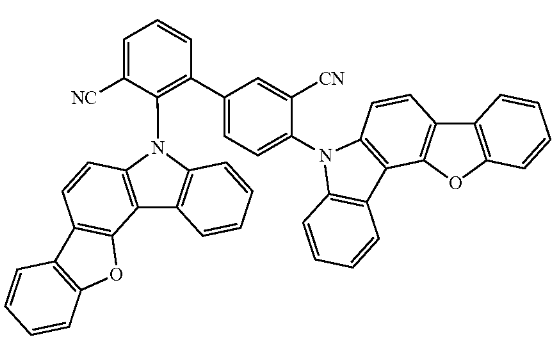
643
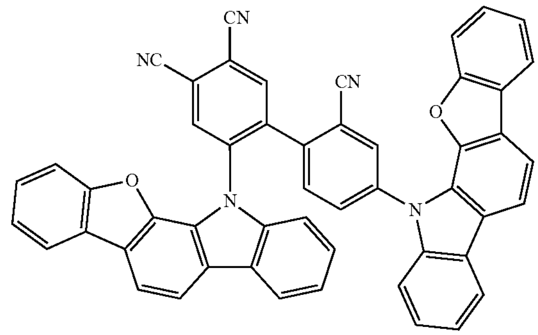
644
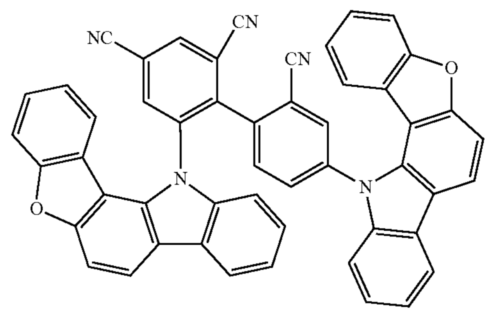
645
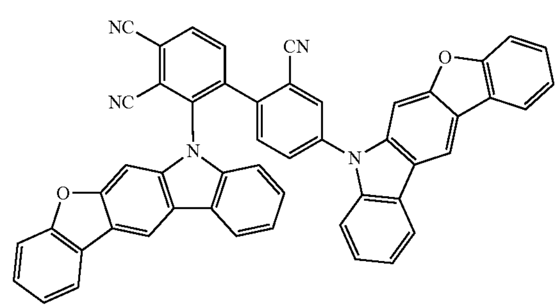
646
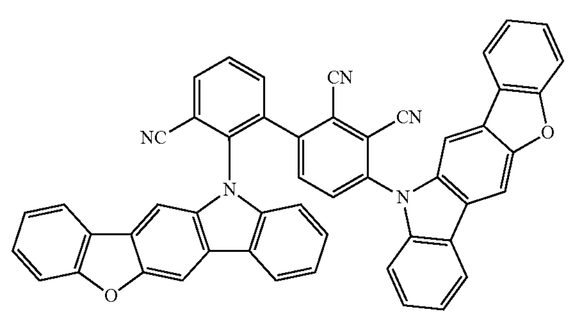

-continued
647
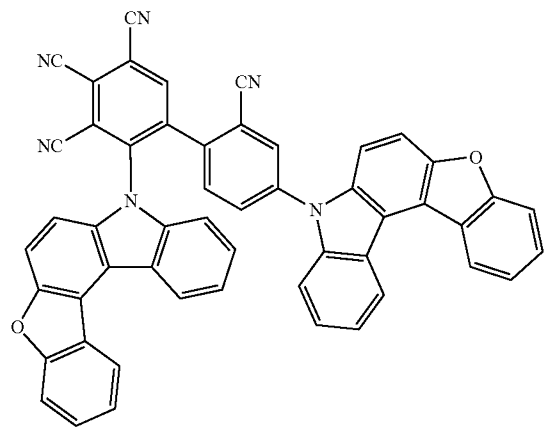
648
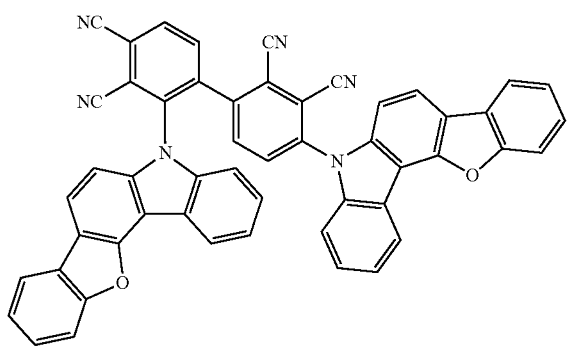
649
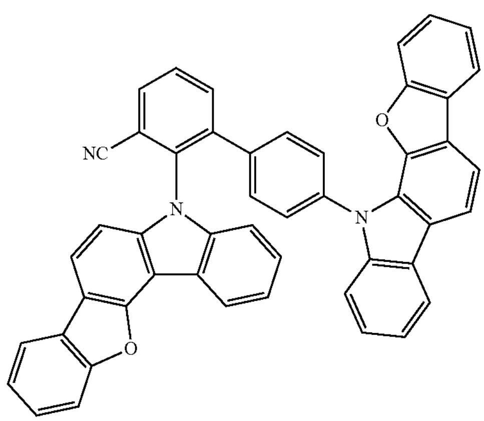
650
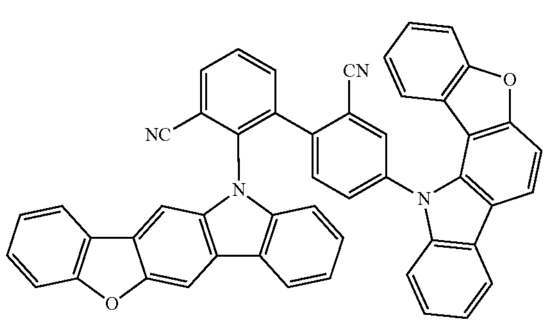
-continued
651
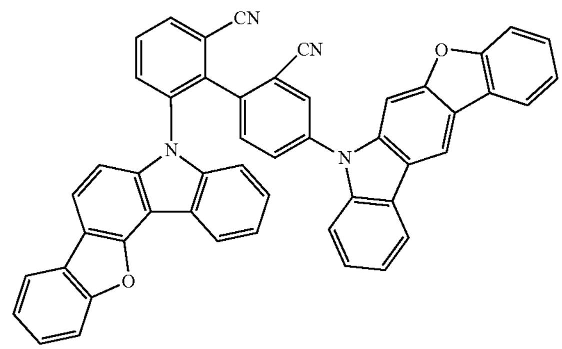
652
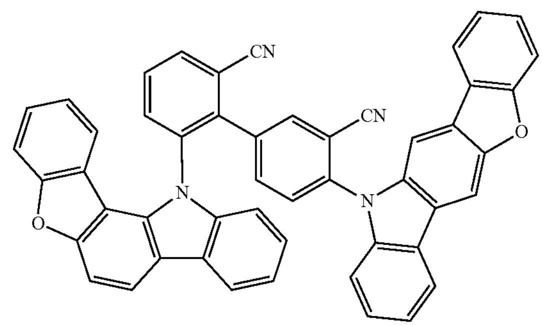
653
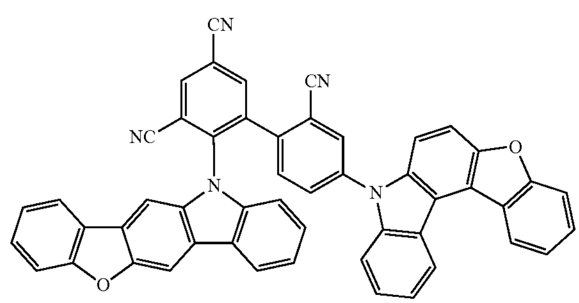
654
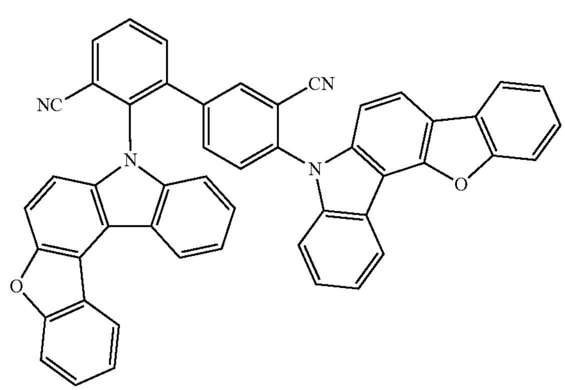

-continued
655
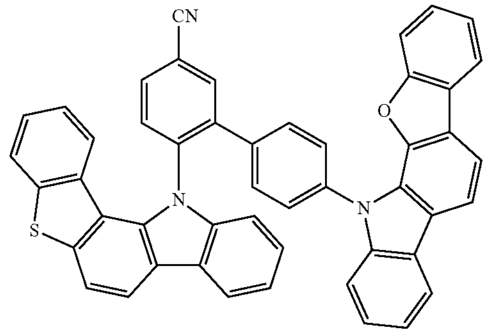
656
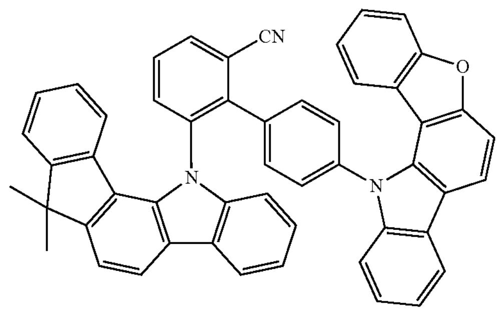
657
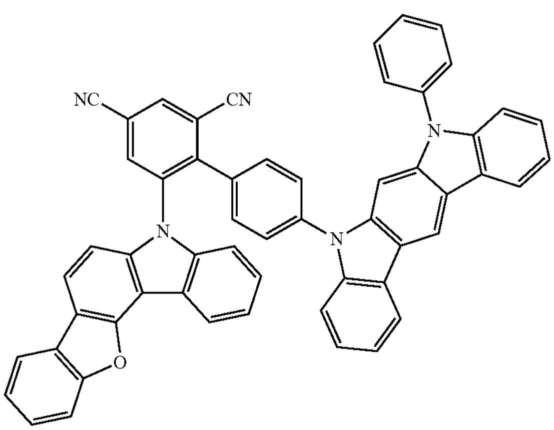
658
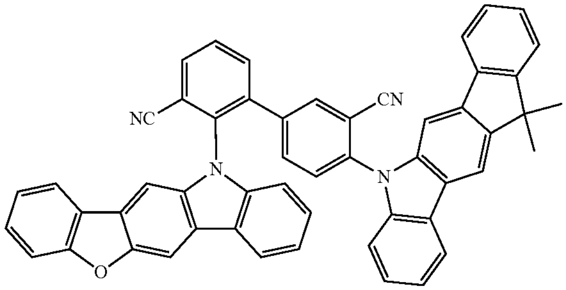
-continued
659
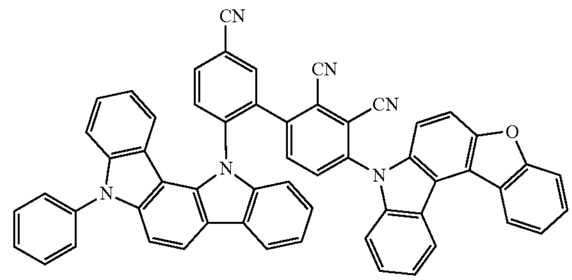
660
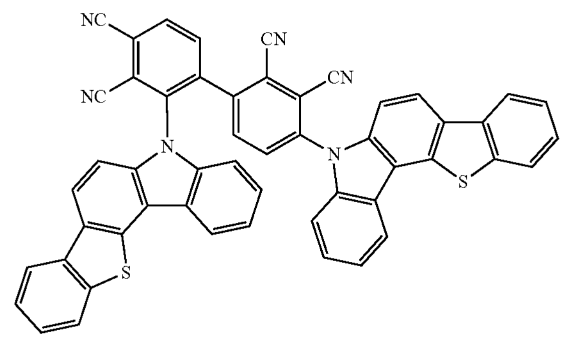
661
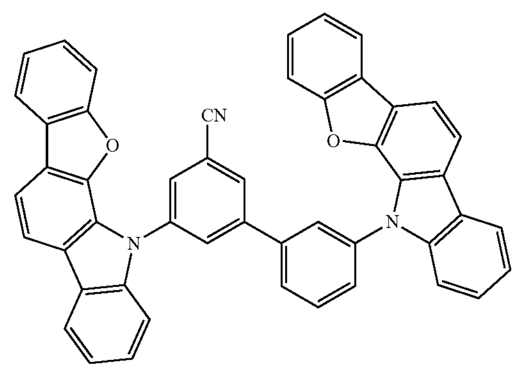
662
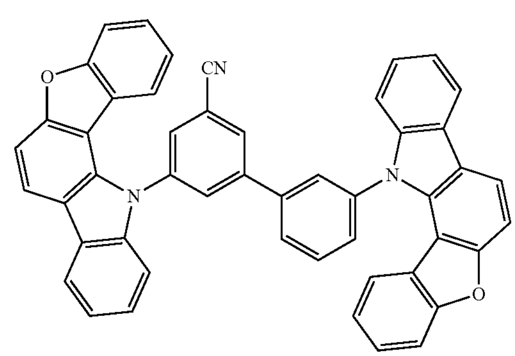

663
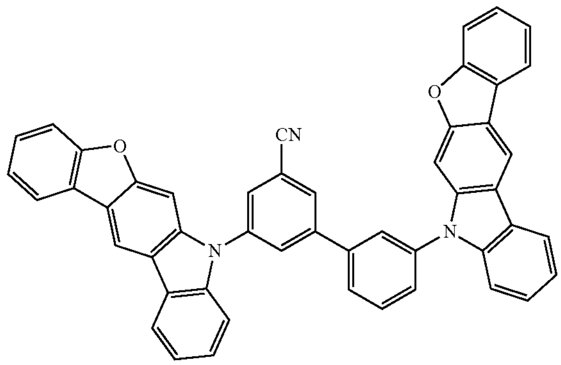
664
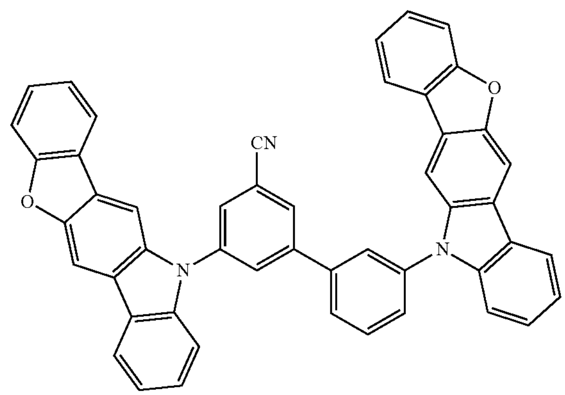
665
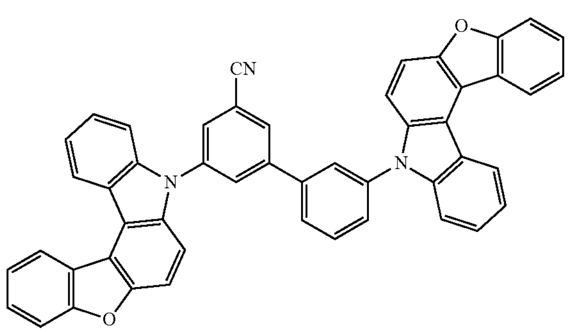
666
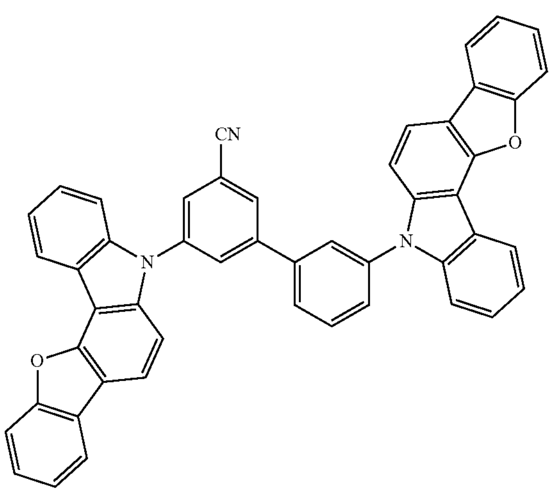
667
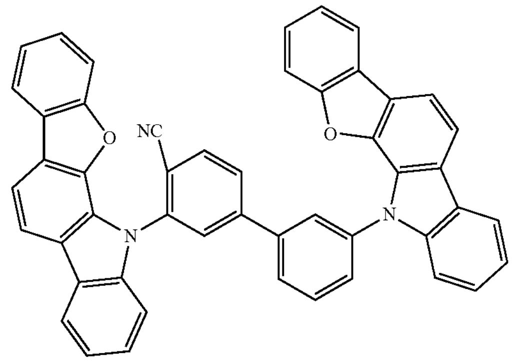
668
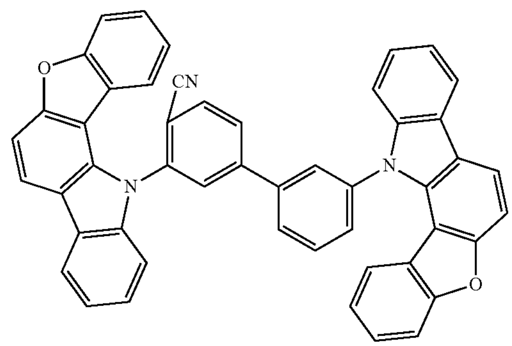
669
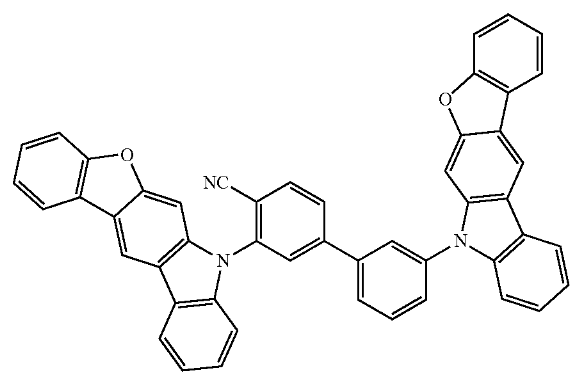
670
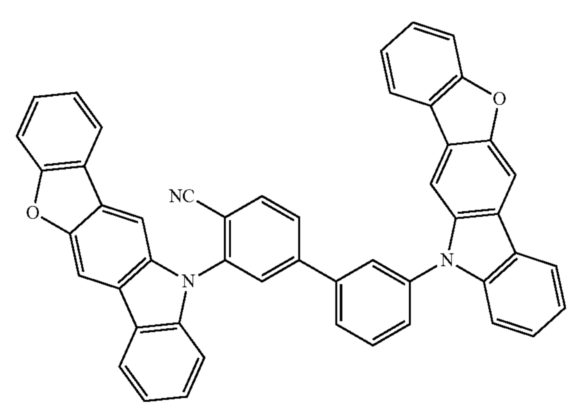

-continued
671
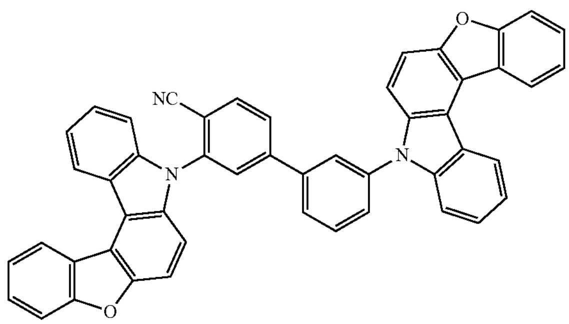
672
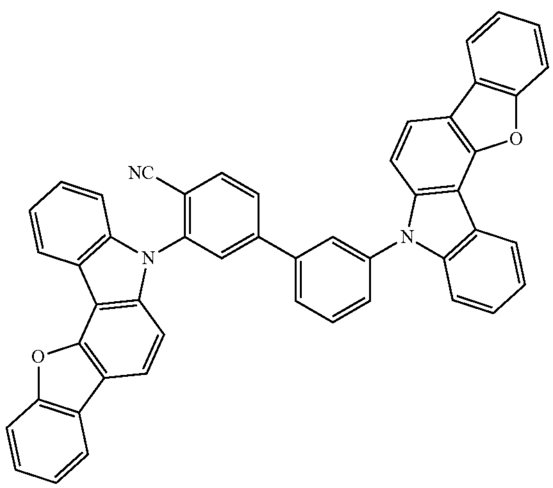
673
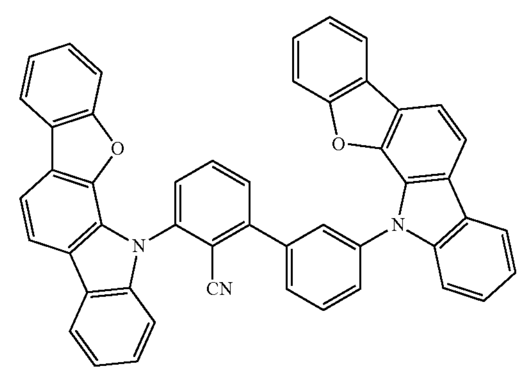
674
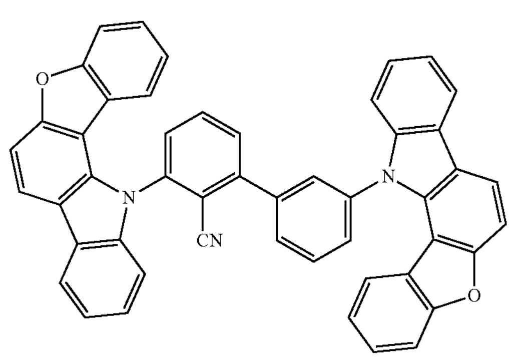
-continued
675
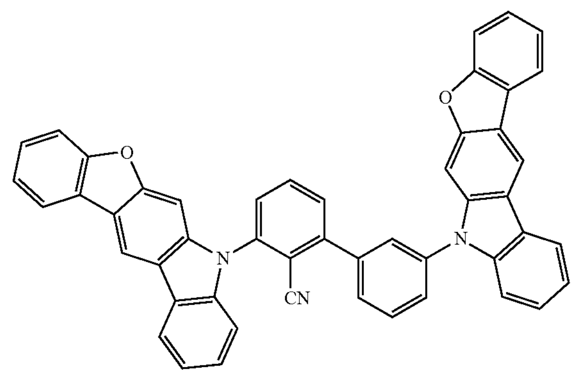
676
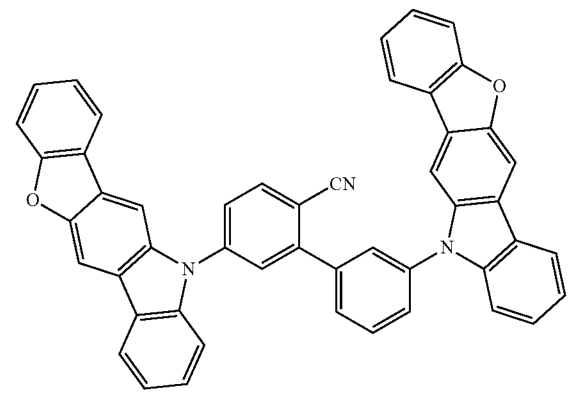
677
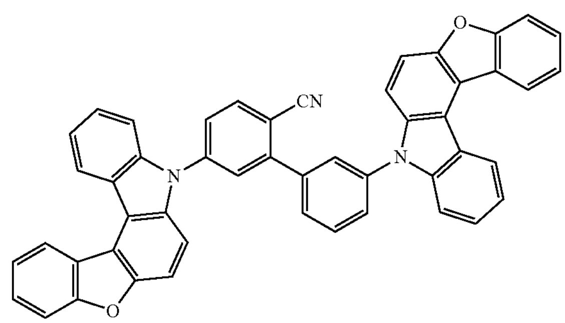
678
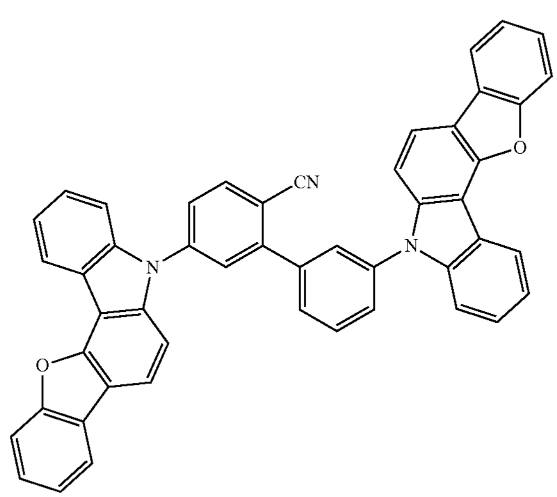

-continued
679
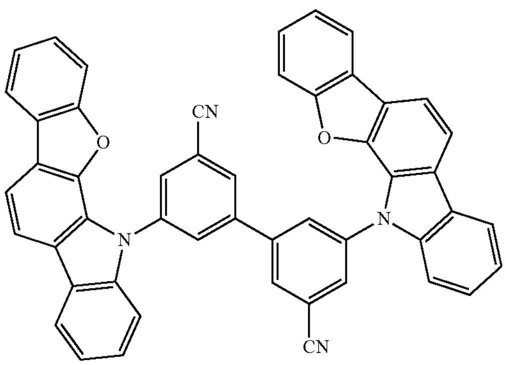
680
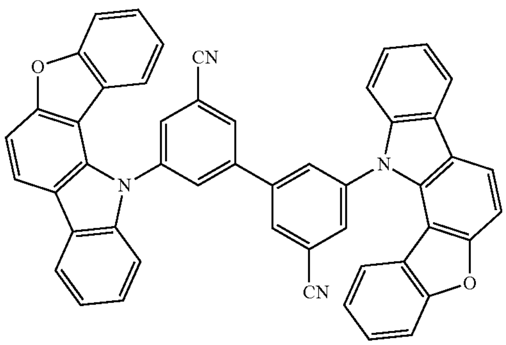
681
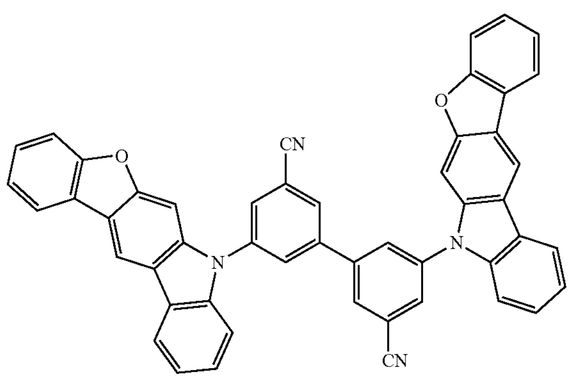
682
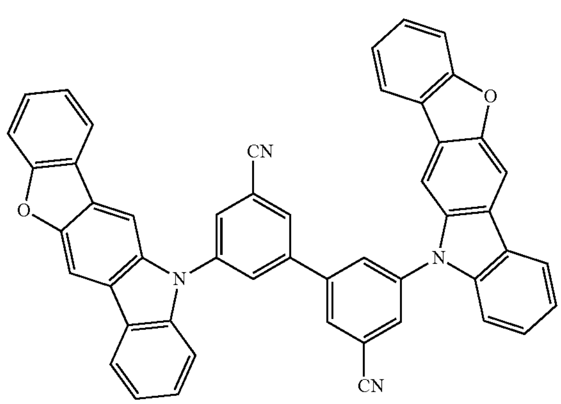
-continued
683
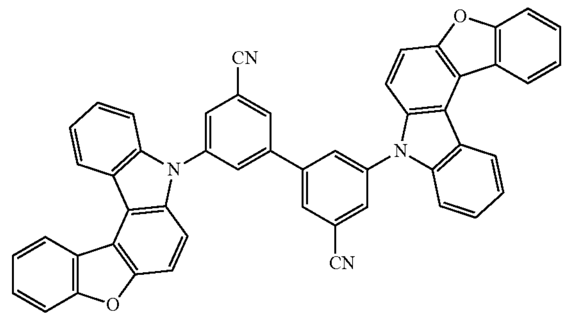
684
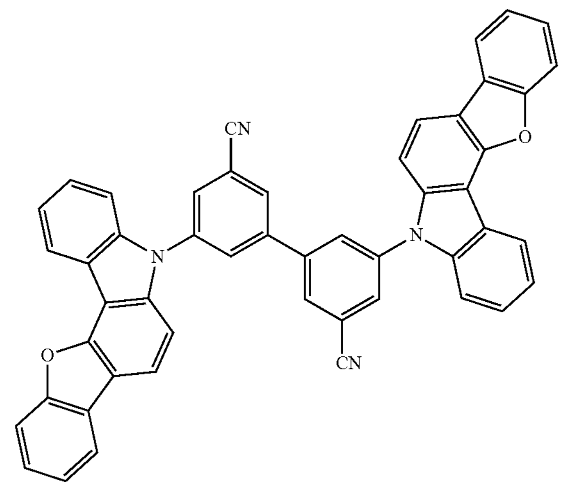
685
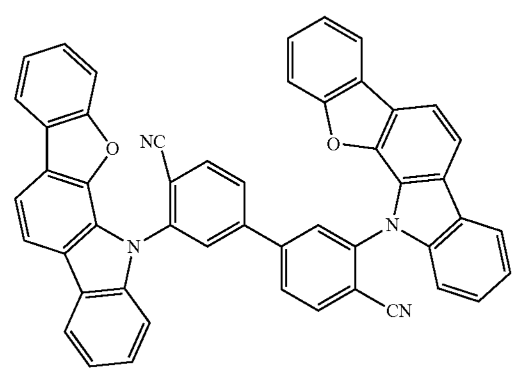
686
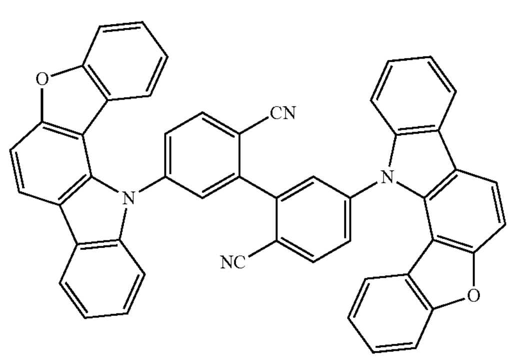

-continued
687
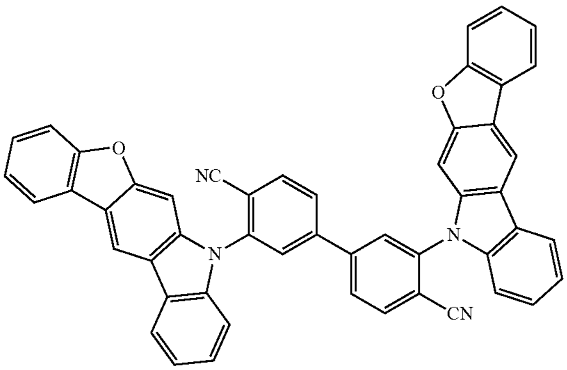
688
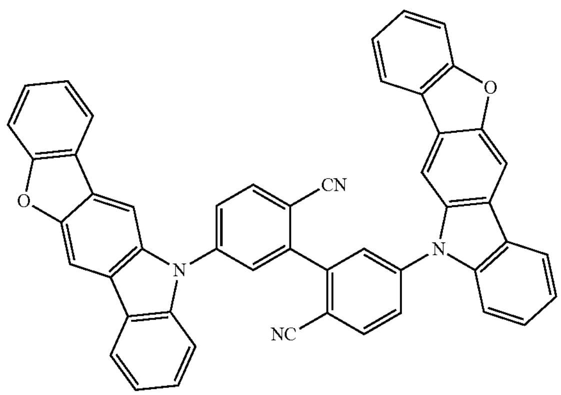
689
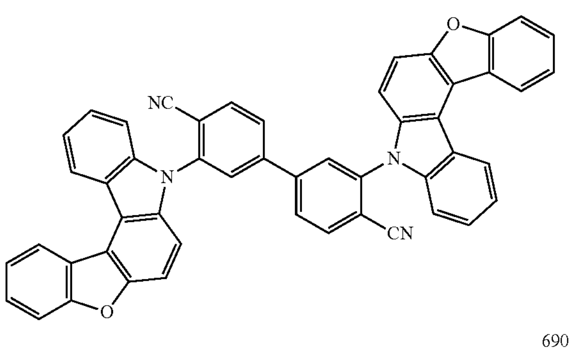
690
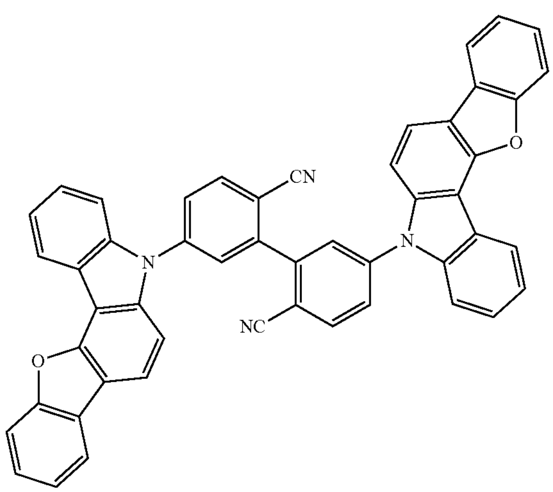
-continued
691
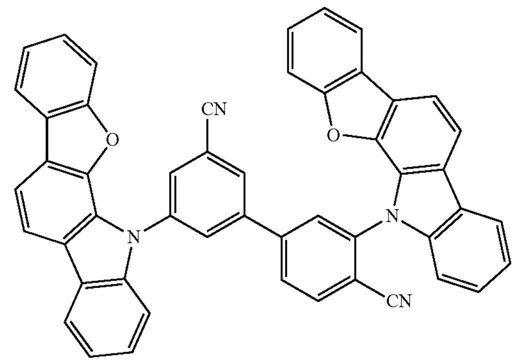
692
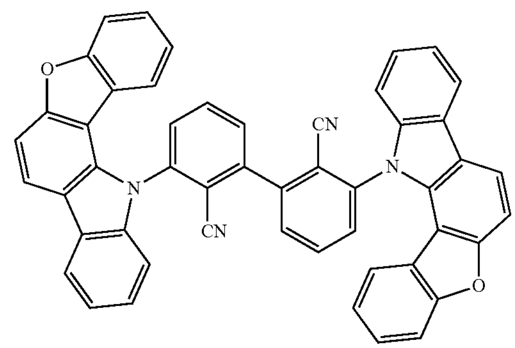
693
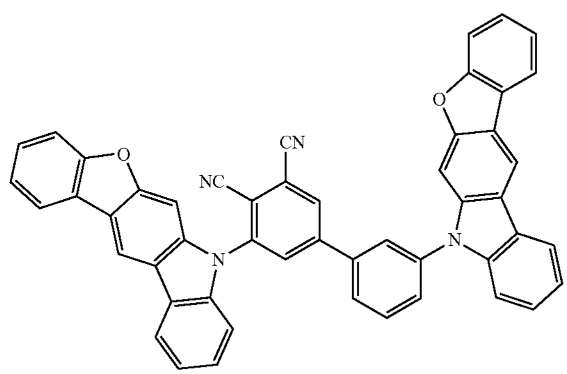
694
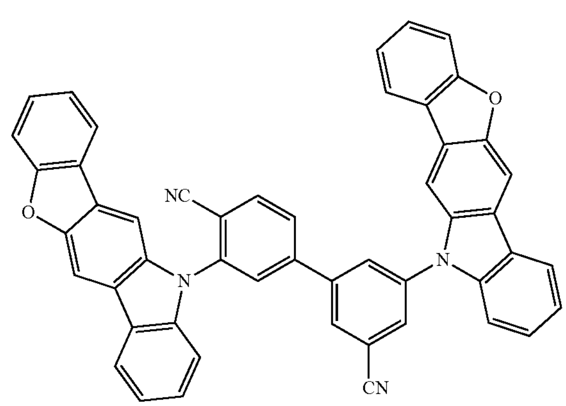

-continued
695
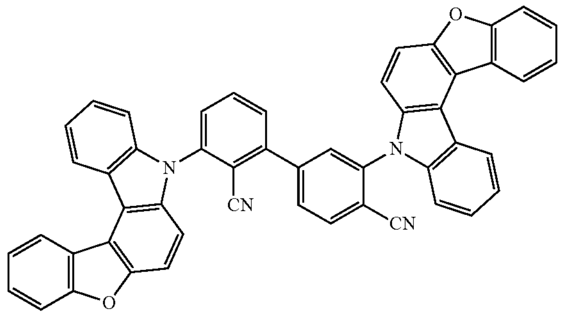
696
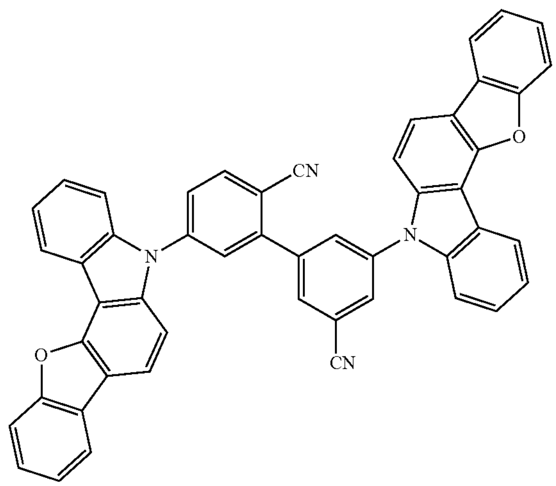
697
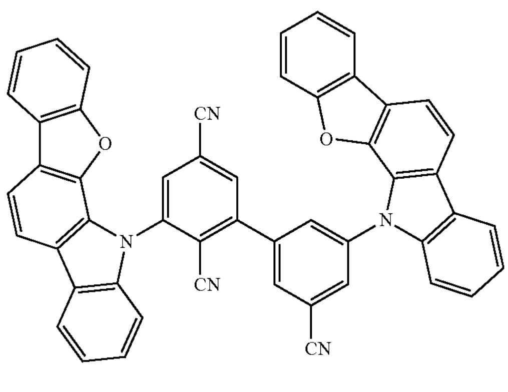
698
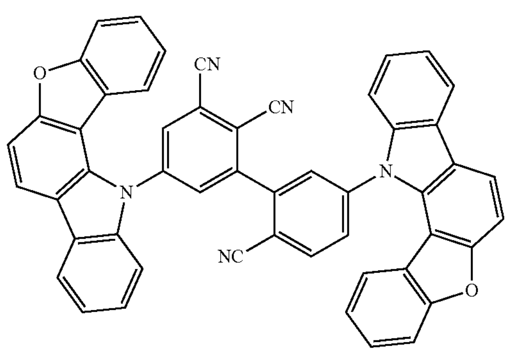
-continued
699
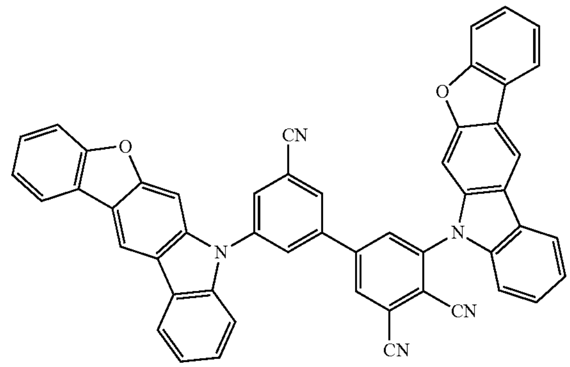
700
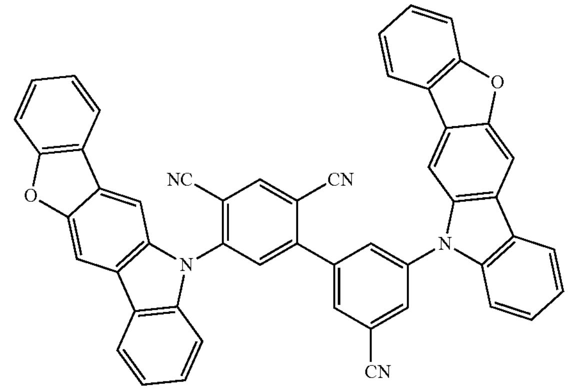
701
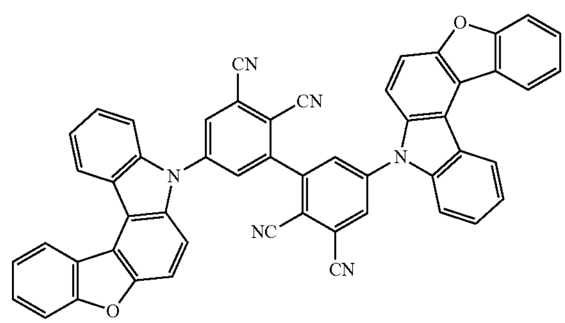
702
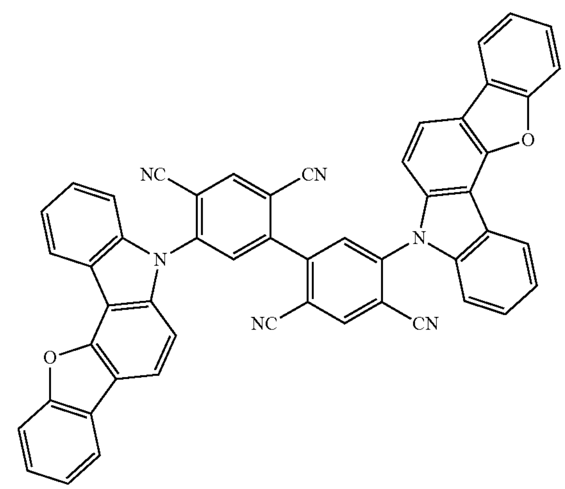

-continued
703
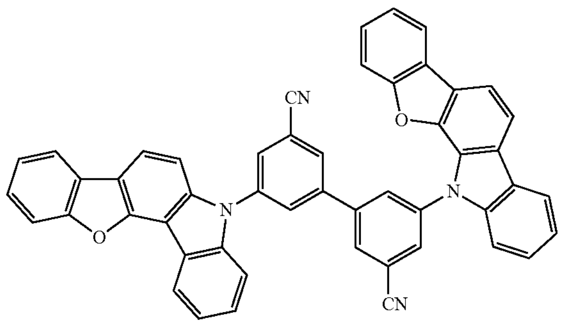
704
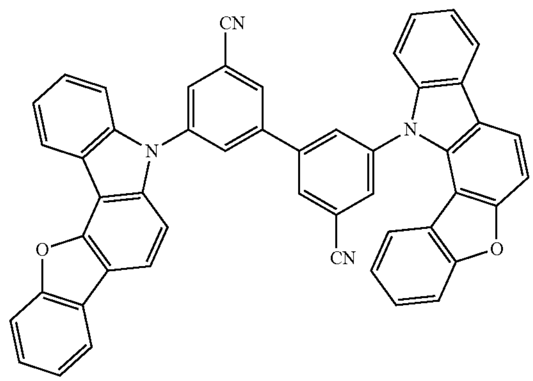
705
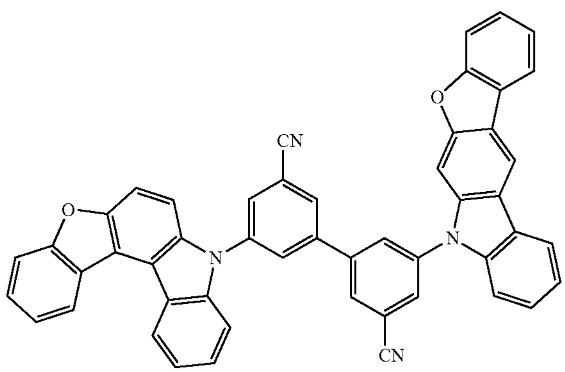
706
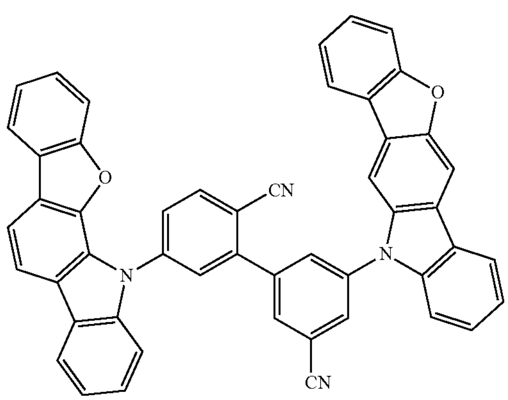
-continued
707
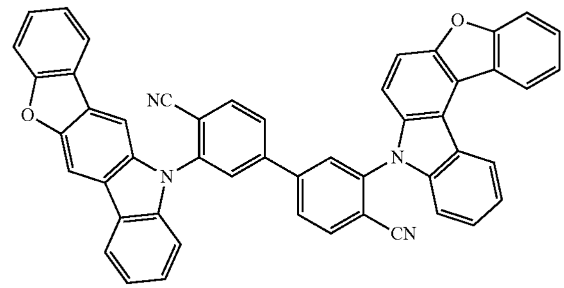
708
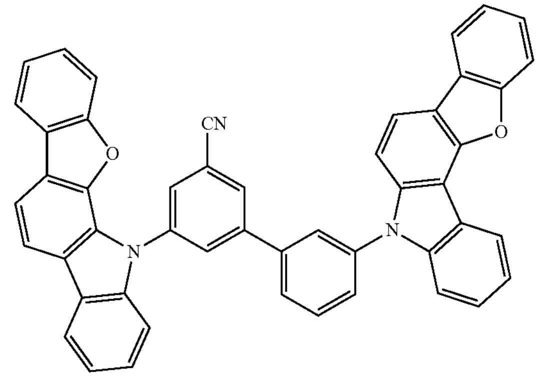
709
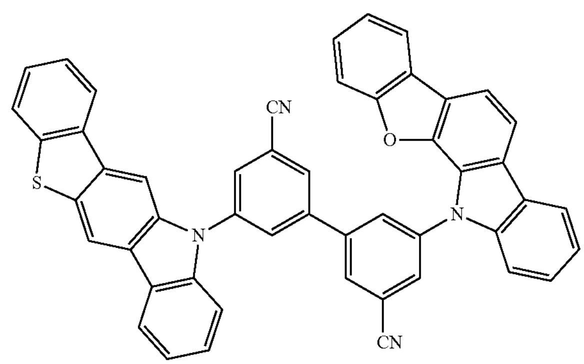
710
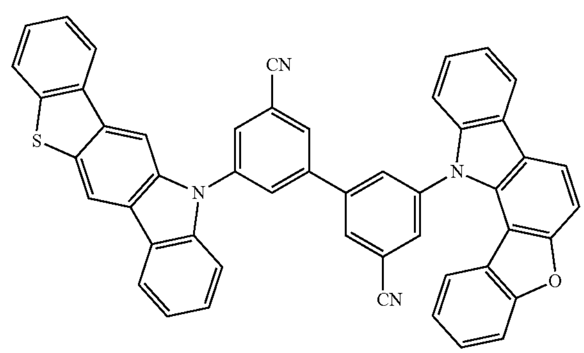

-continued
711
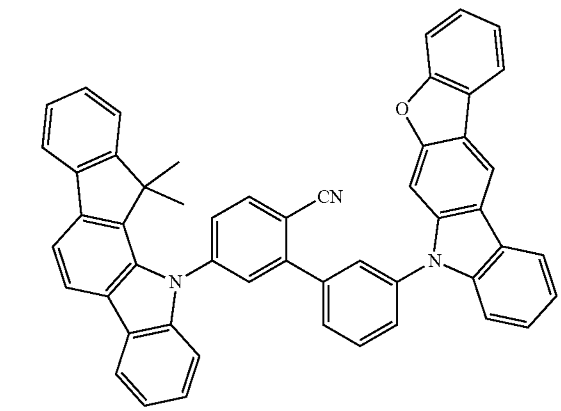
712
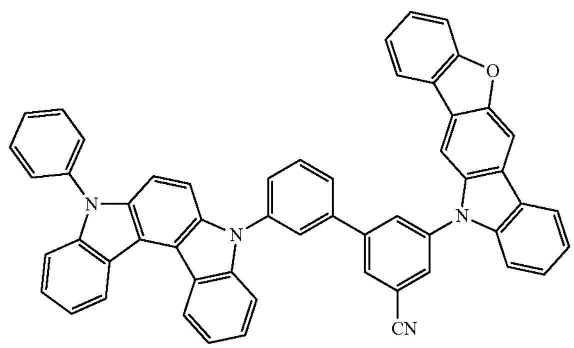
713
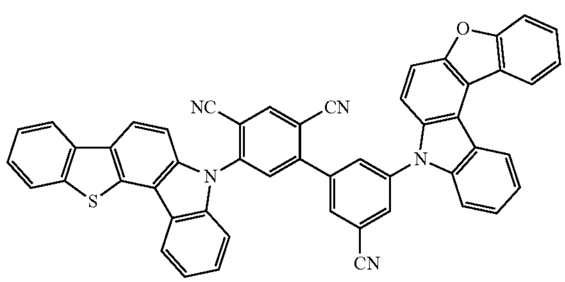
714
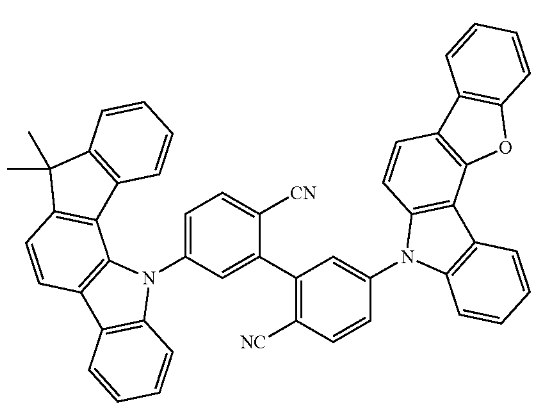
-continued
715
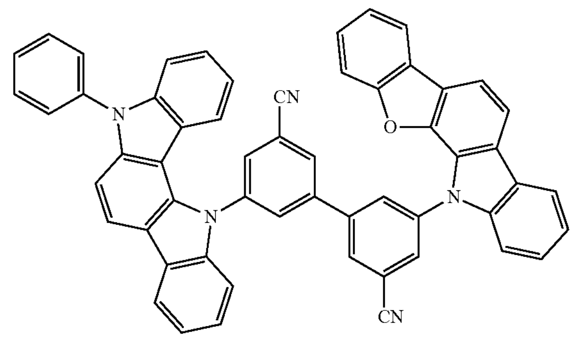
716
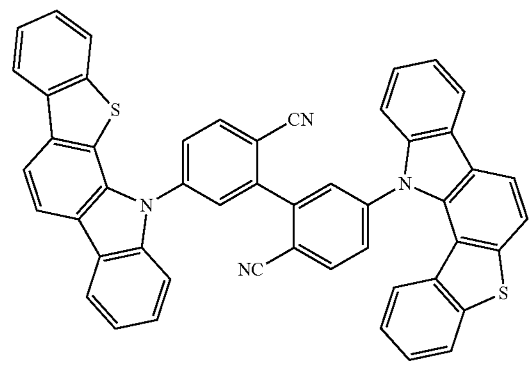
717
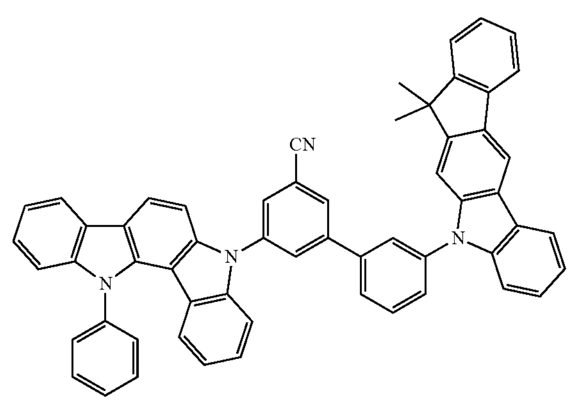
718
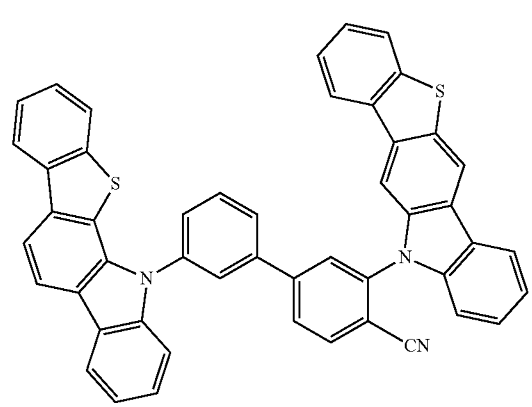

-continued
719
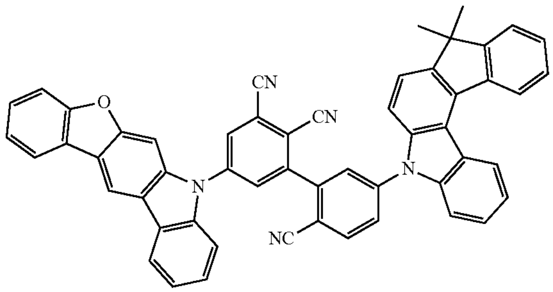
720
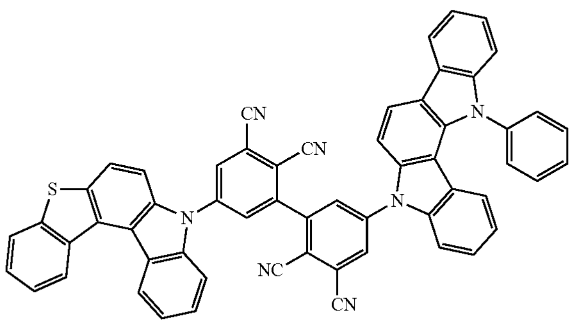
721
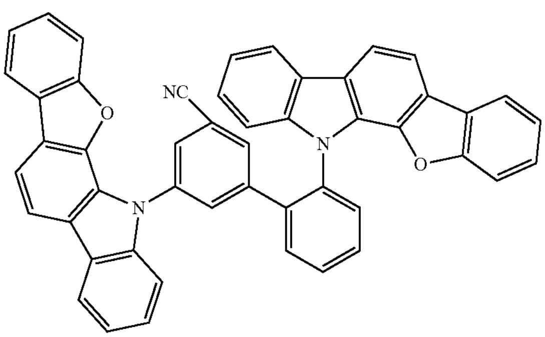
722
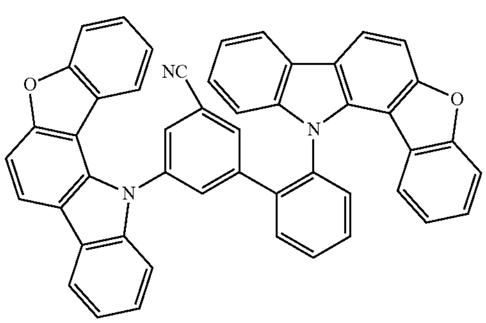
-continued
723
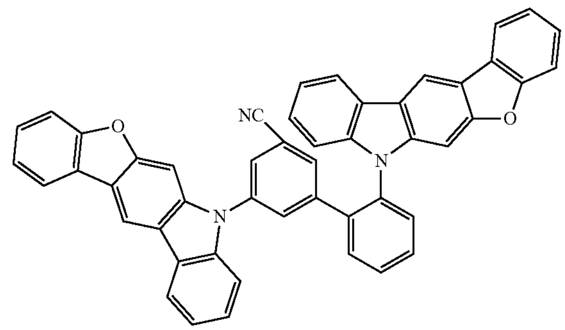
724
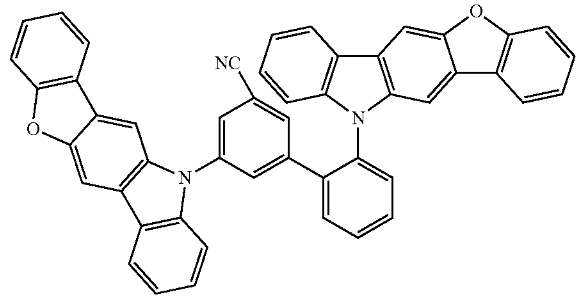
725
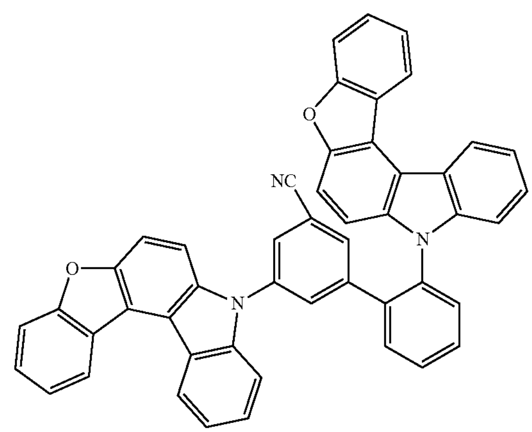
726
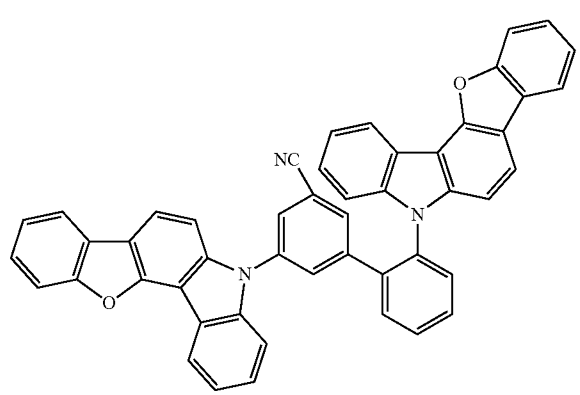

-continued
727
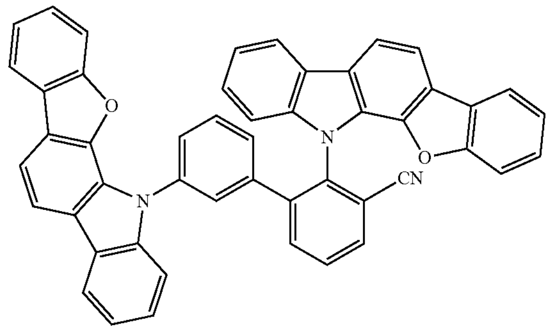
728
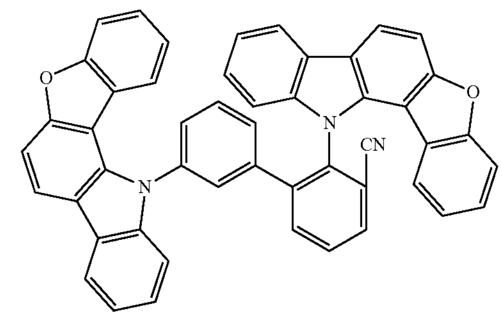
729
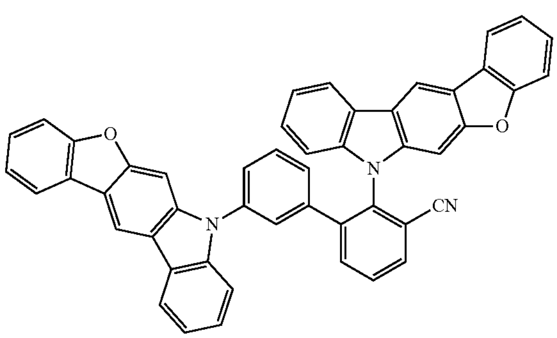
730
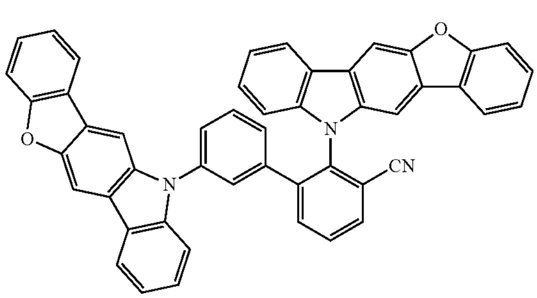
-continued
731
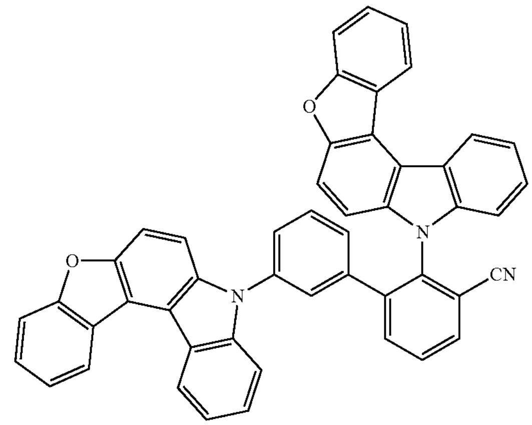
732
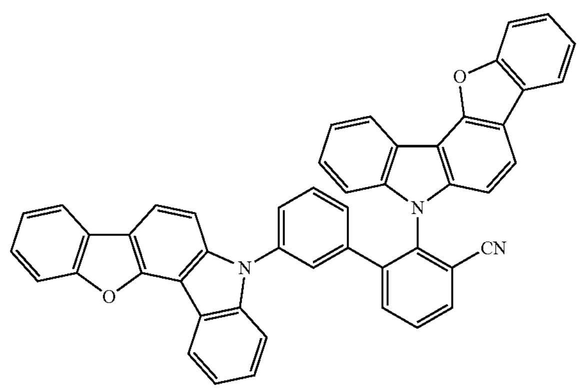
733
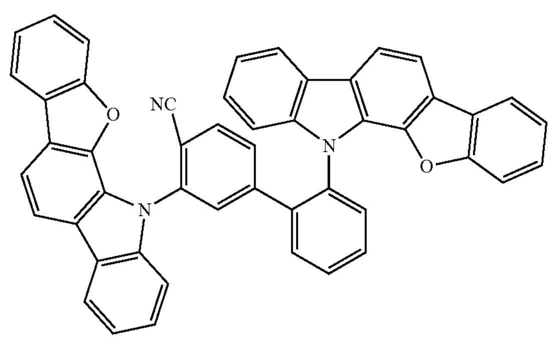
734
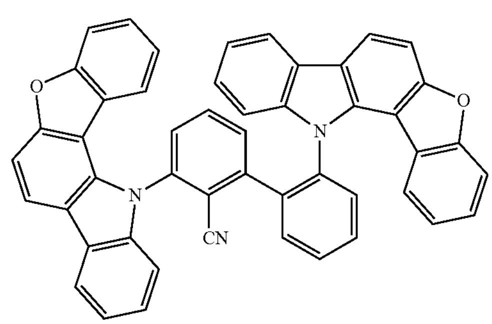

-continued
735
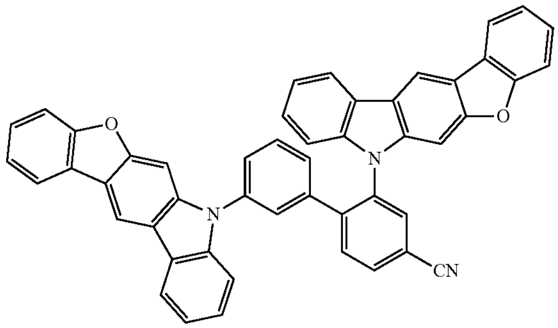
736
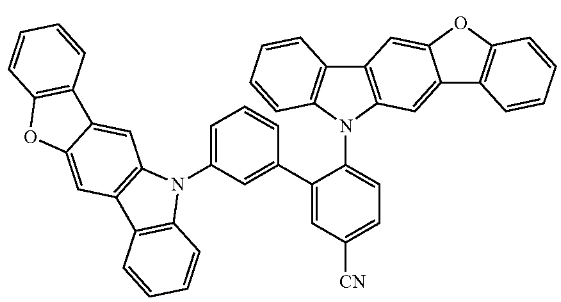
737
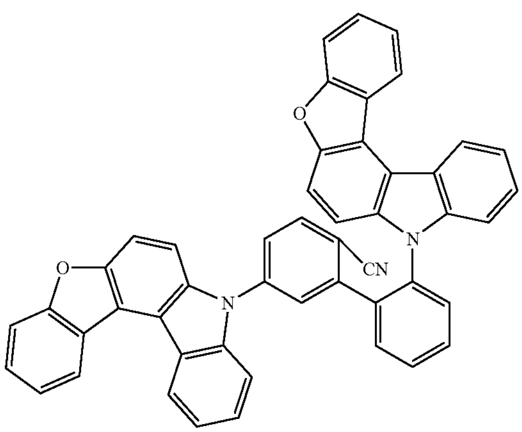
738
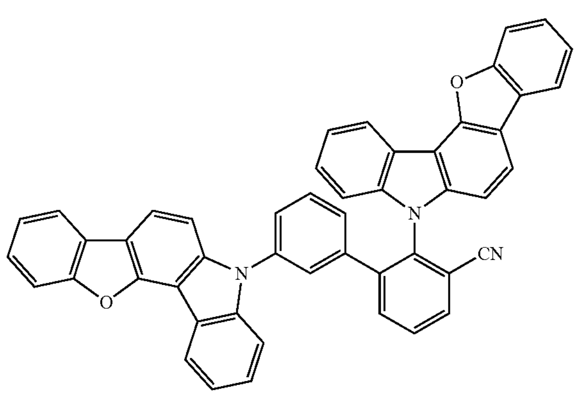
-continued
739
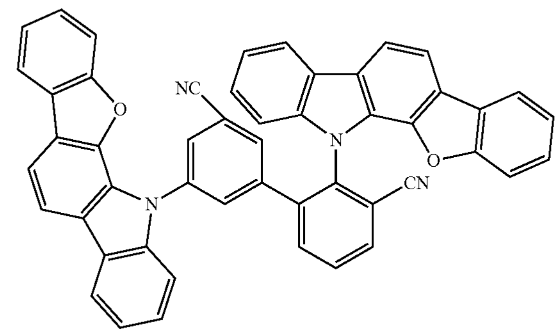
740
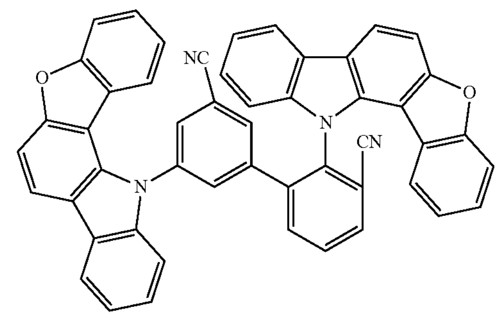
741
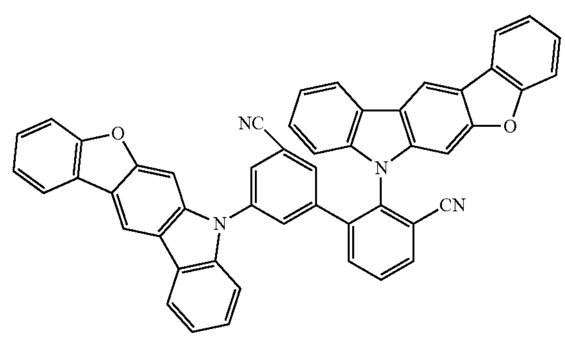
742
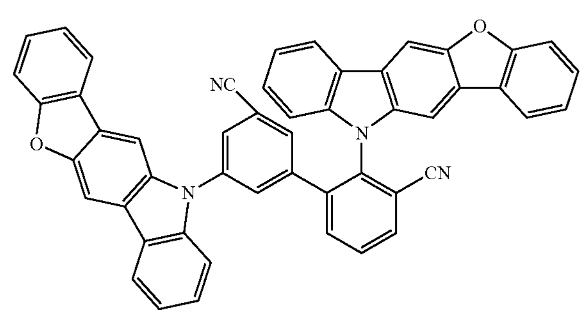

-continued
743
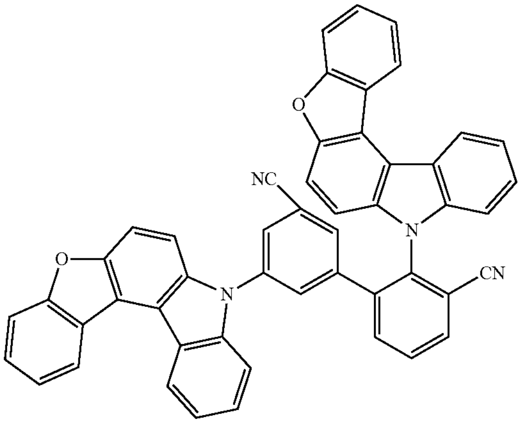
744
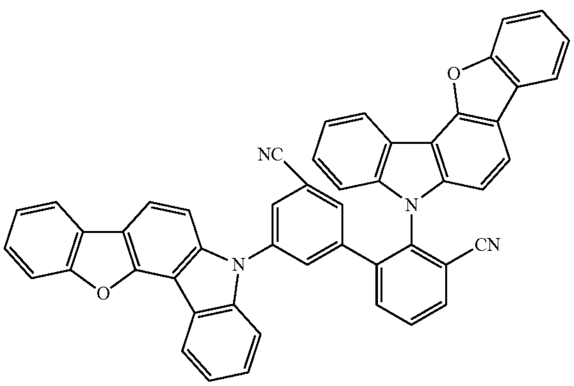
745
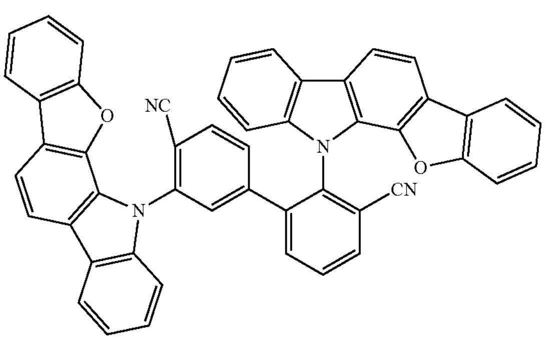
746
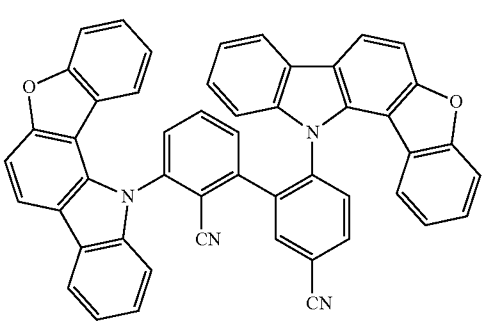
-continued
747
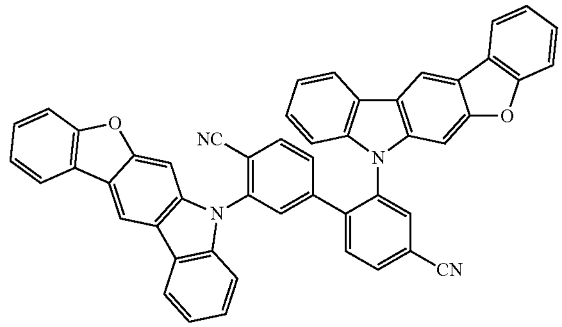
748
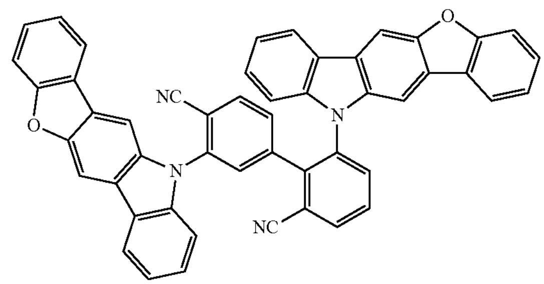
749
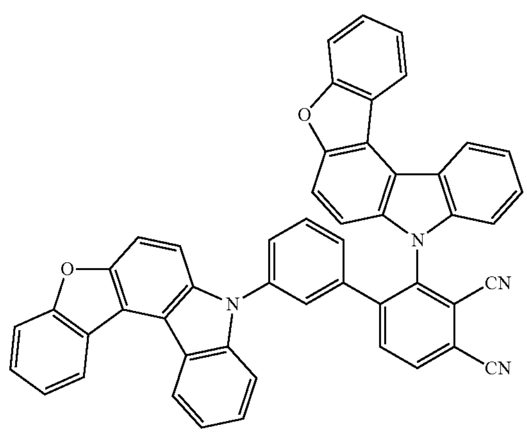
750
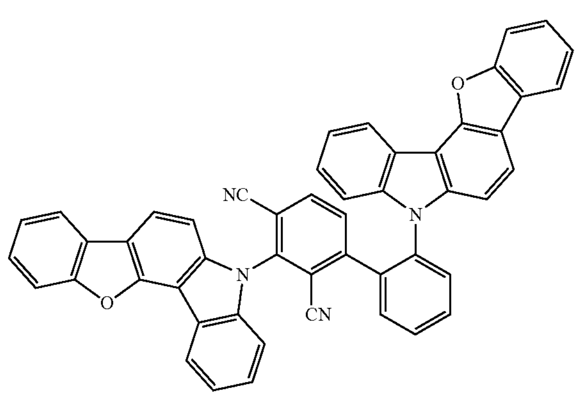

-continued
751
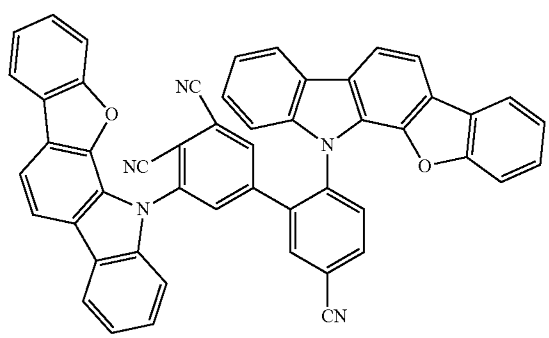
752
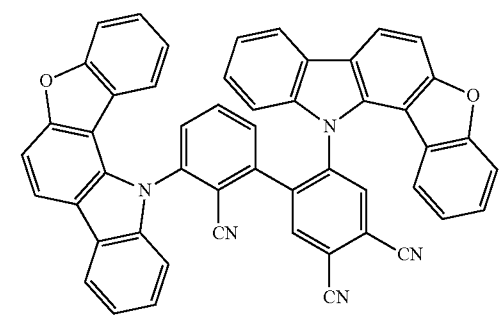
753
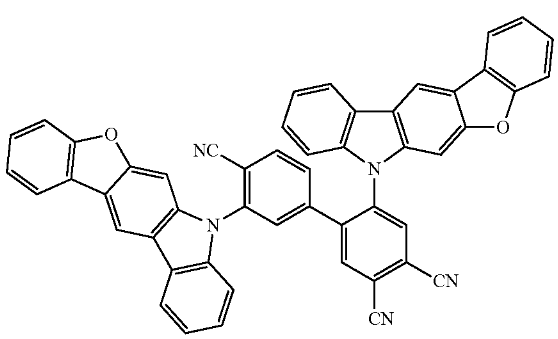
754
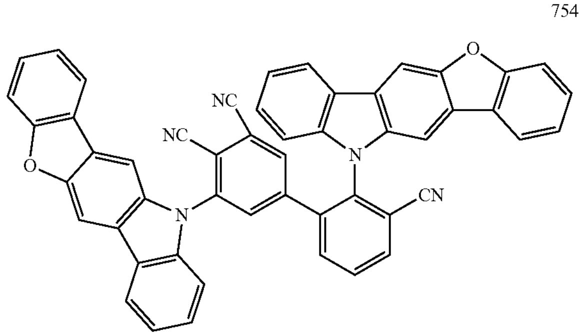
-continued
755
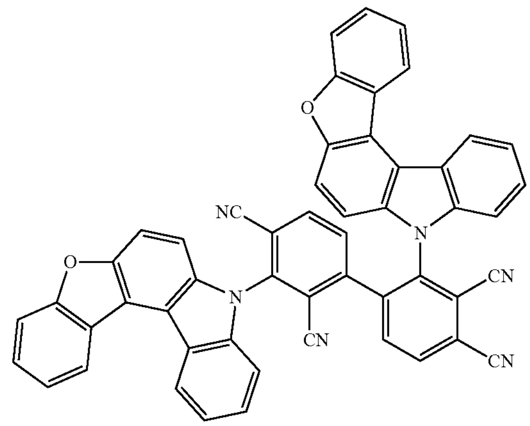
756
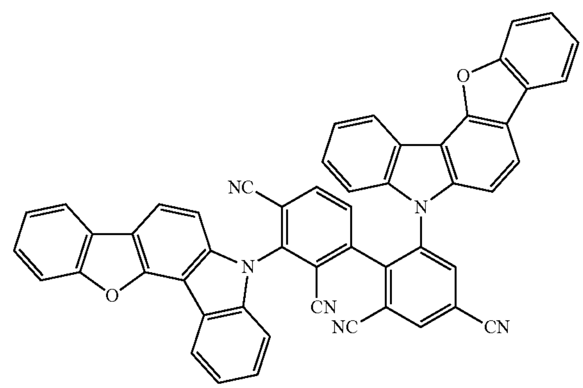
757
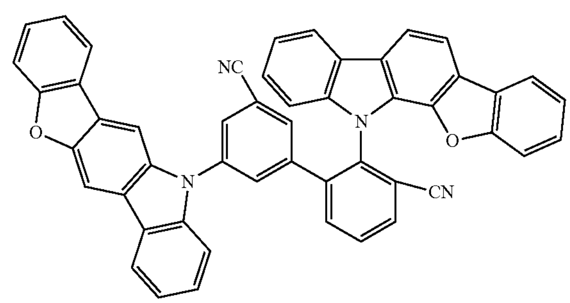
758
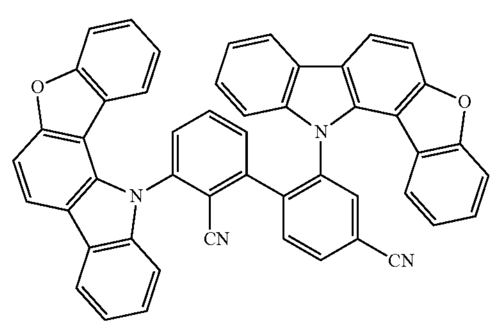

759
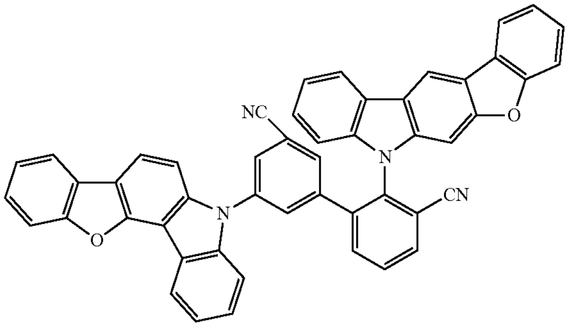
763
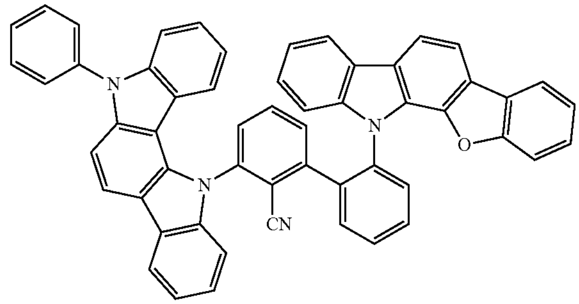
760
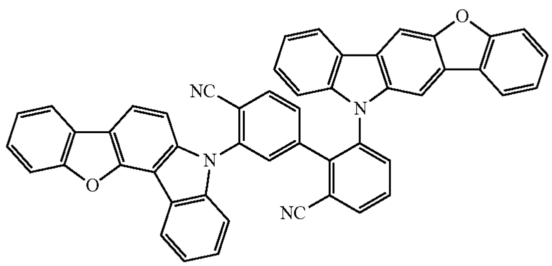
764
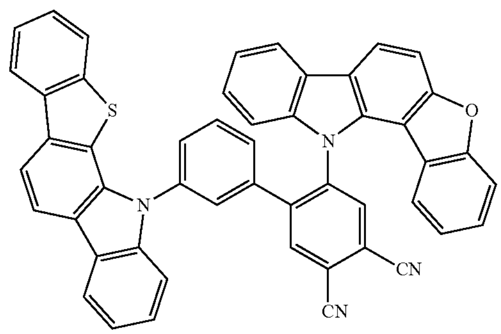
761
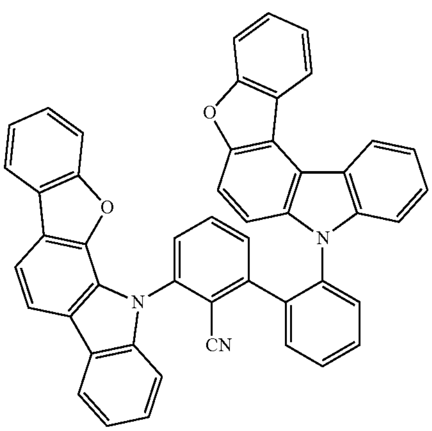
765
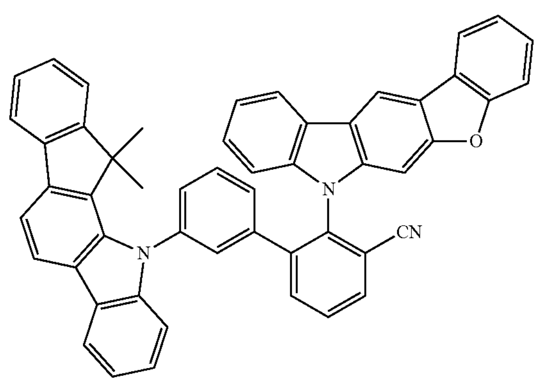
762
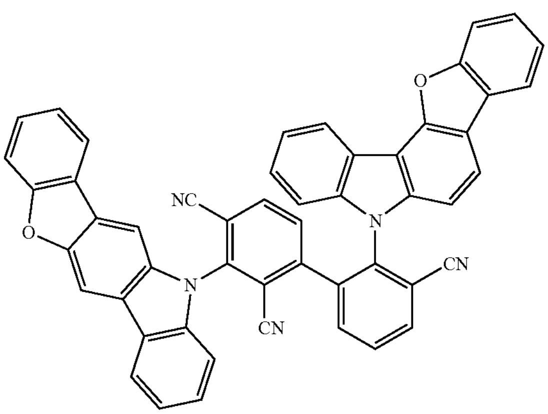
766
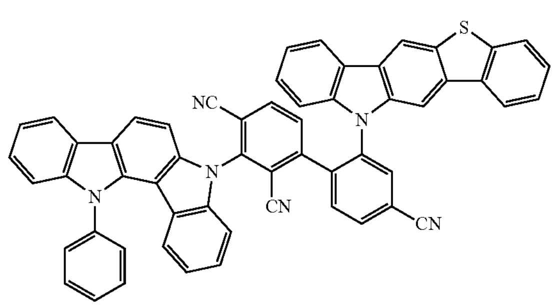

767
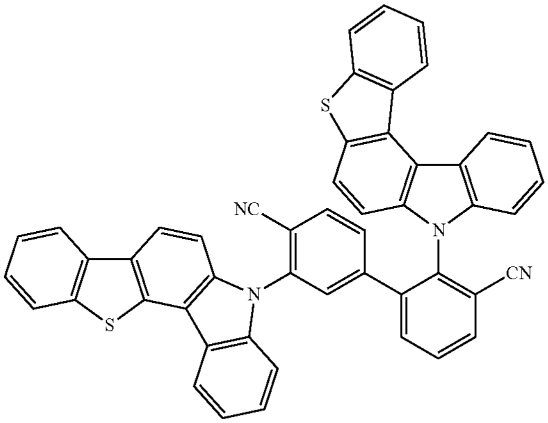
768
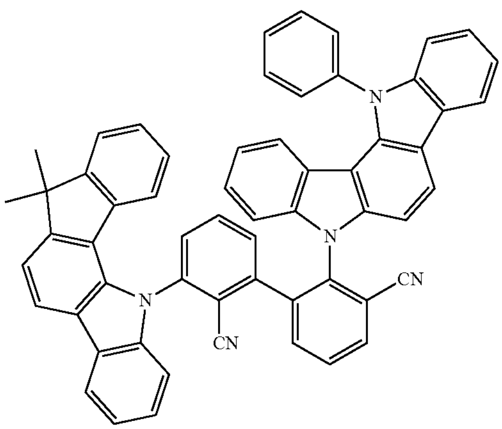
769
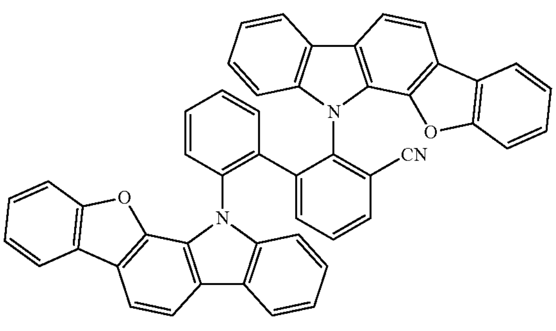
770
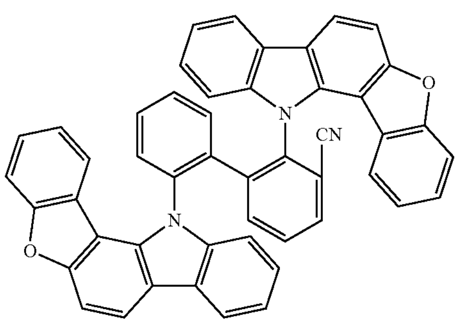
771
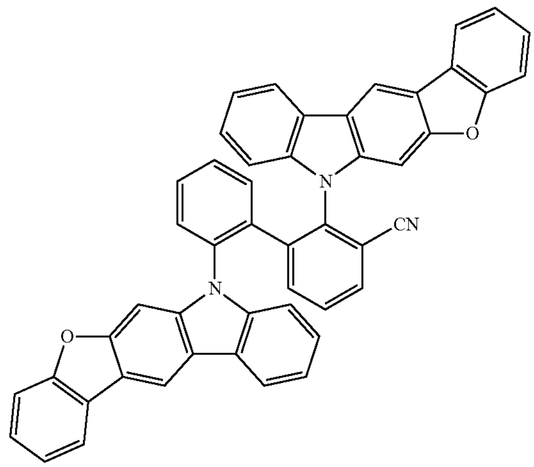
772
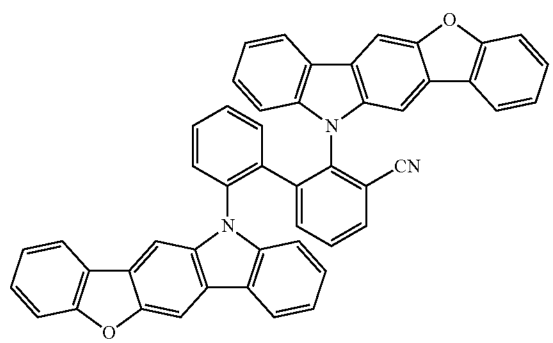
773
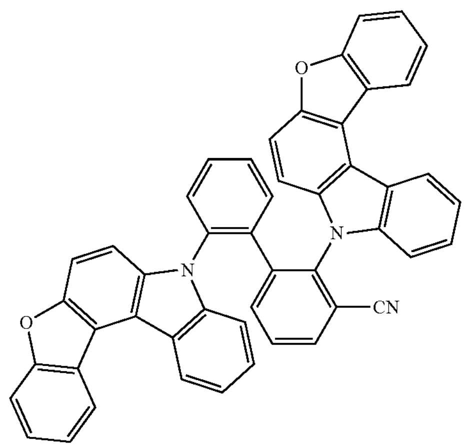
774
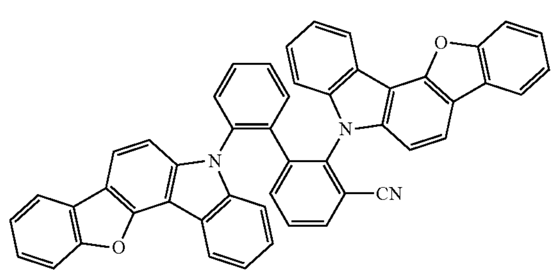

-continued
775
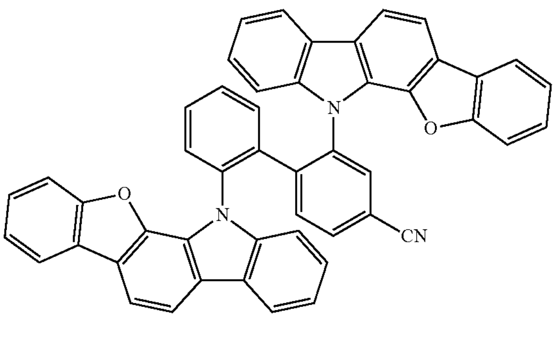
776
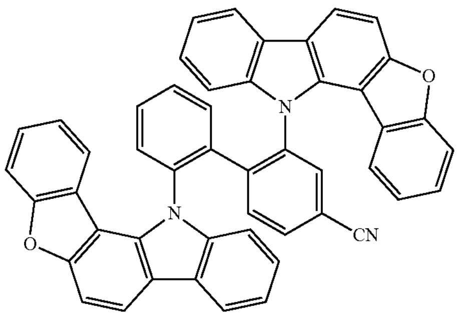
777
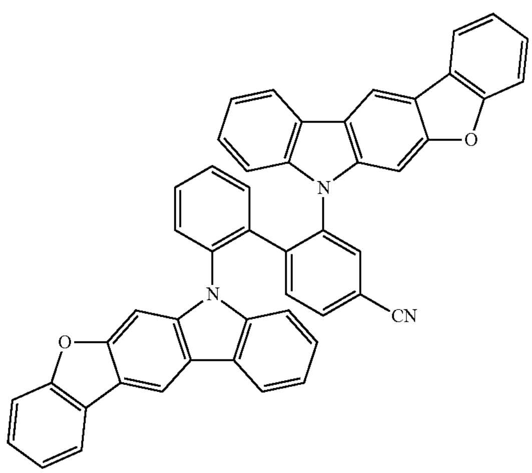
778
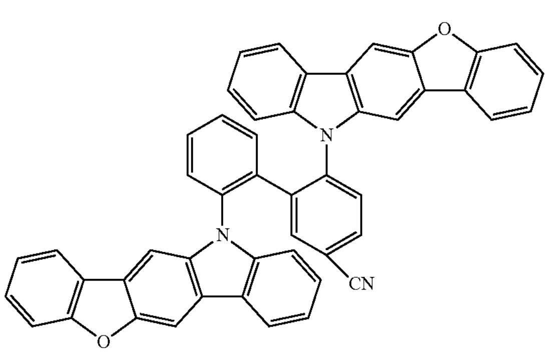
-continued
779
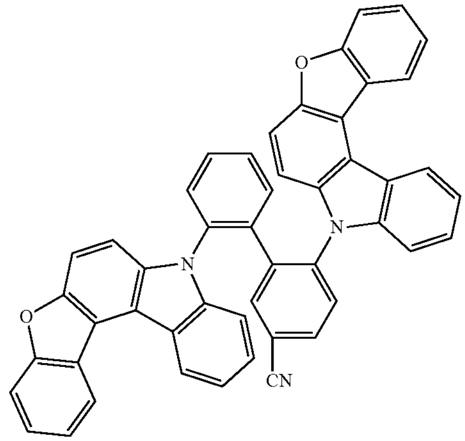
780
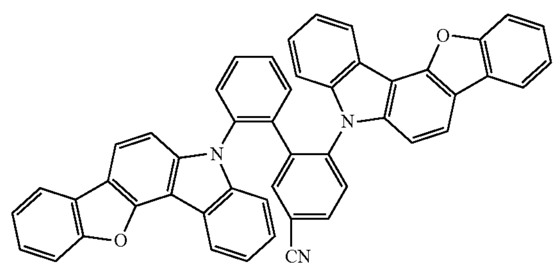
781
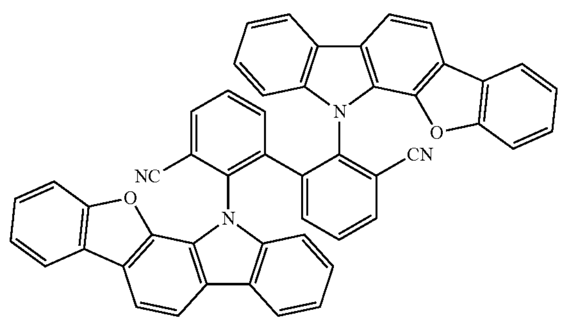
782
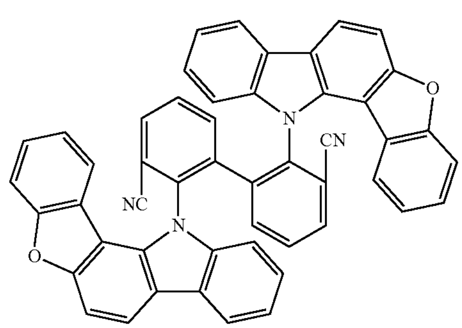

783
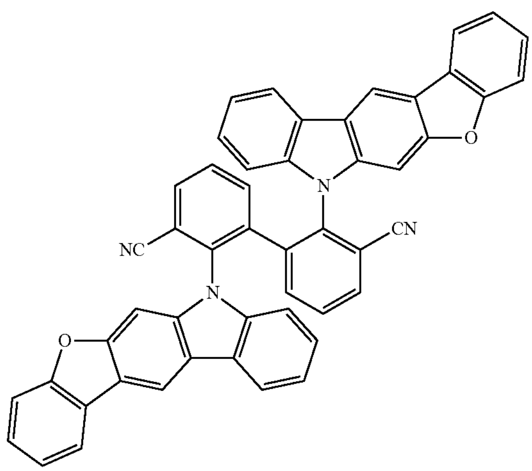
784
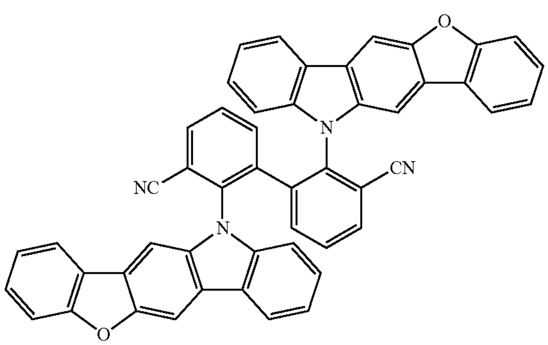
785
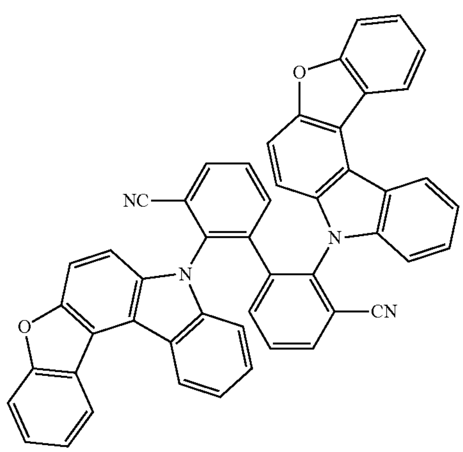
786
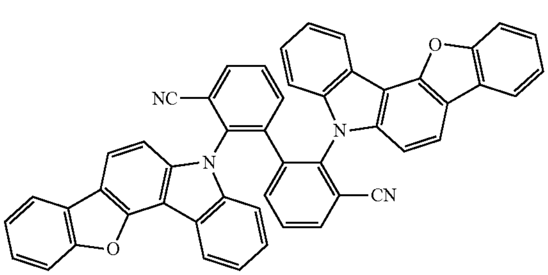
787
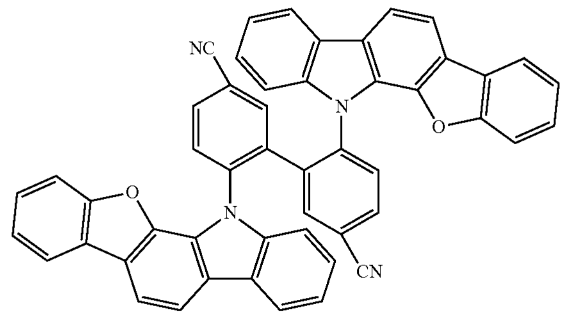
788
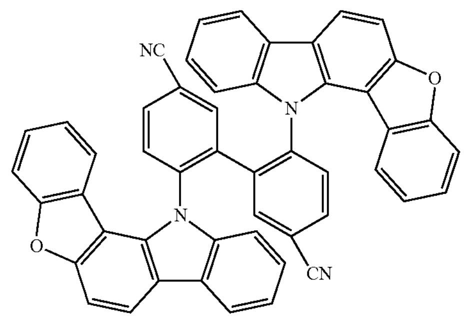
789
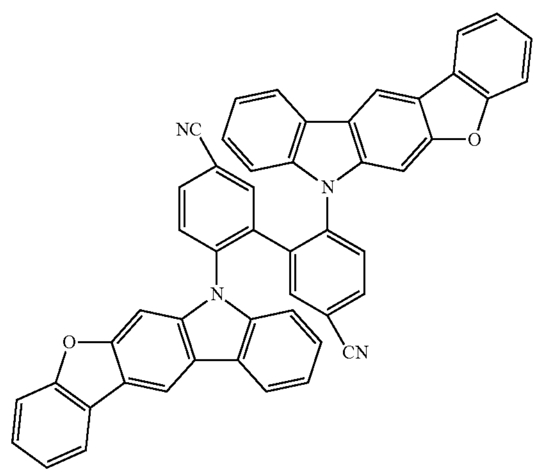
790
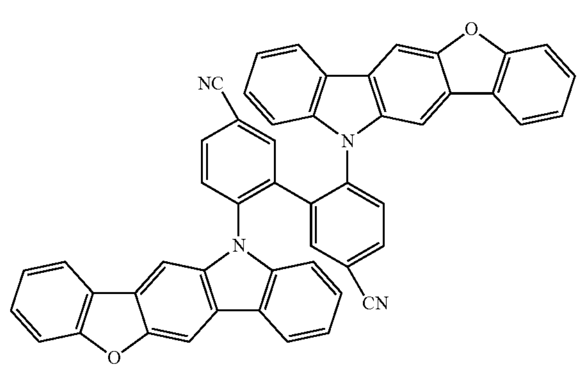

-continued
791
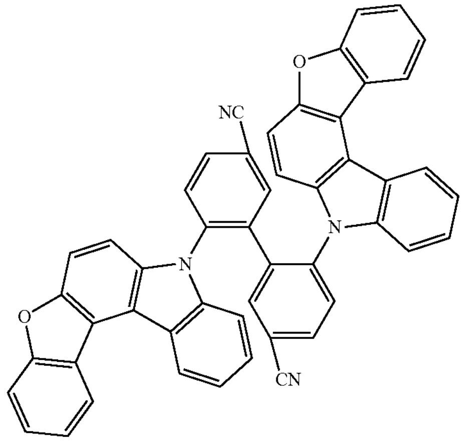
792
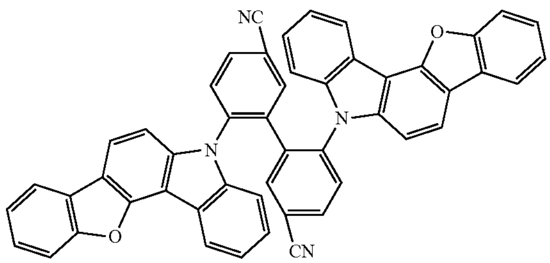
793
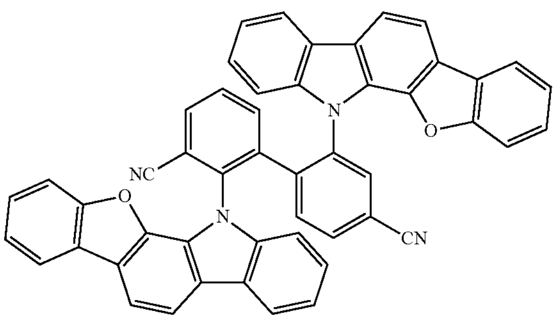
794
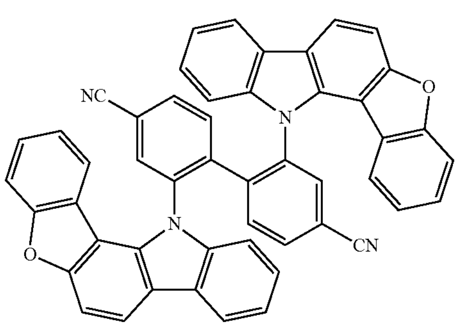
-continued
795
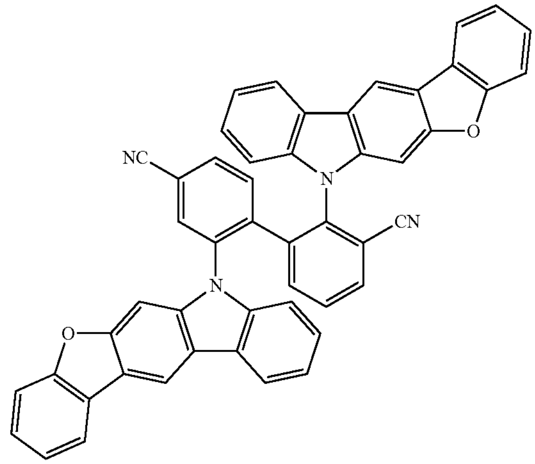
796
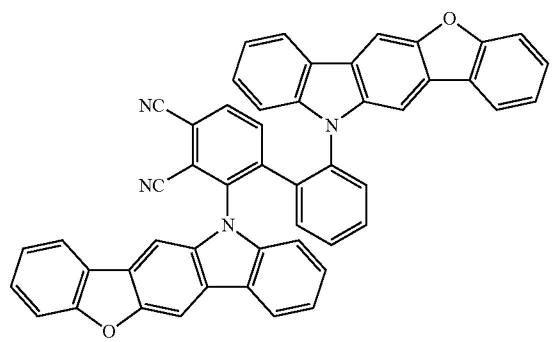
797
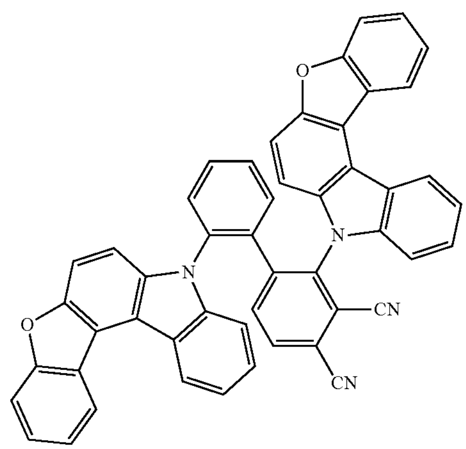
798
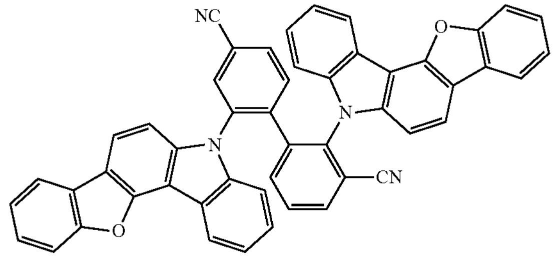

-continued
799
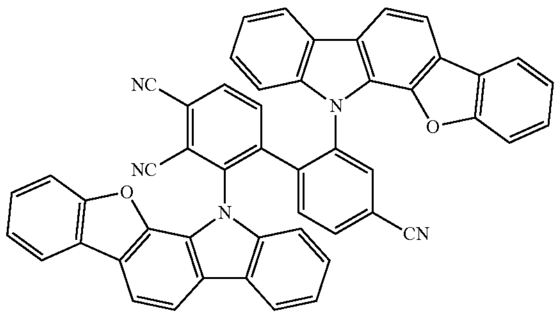
800
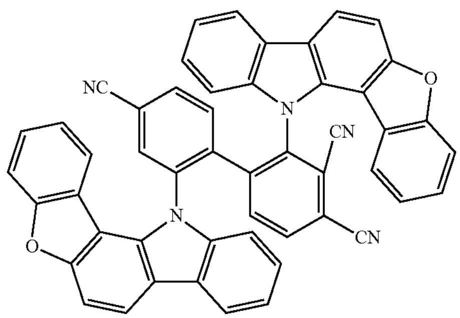
801
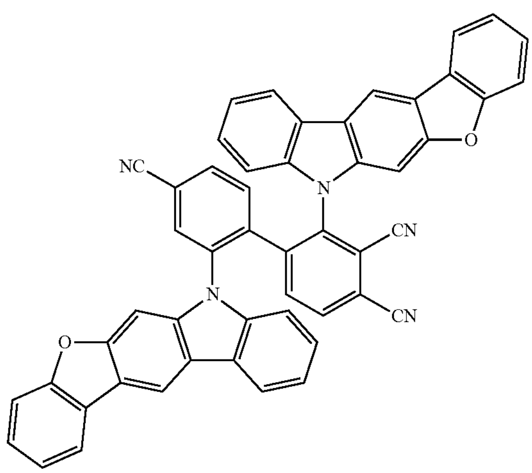
802
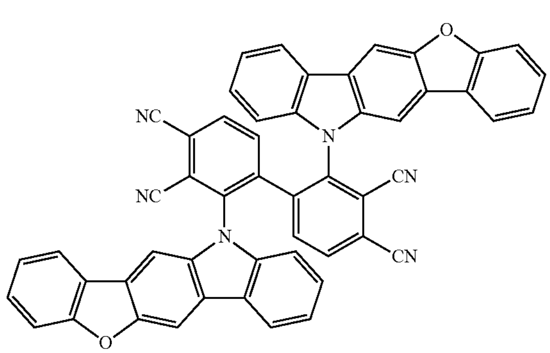
-continued
803
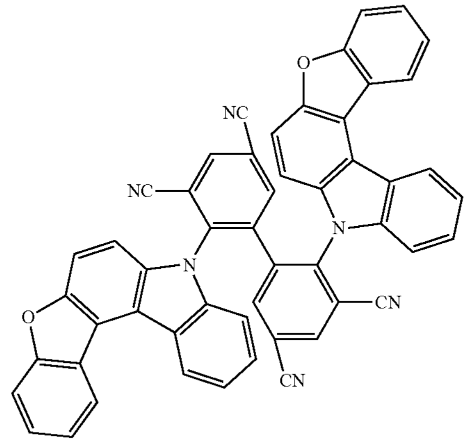
804
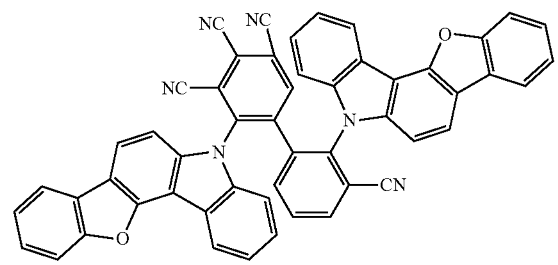
805
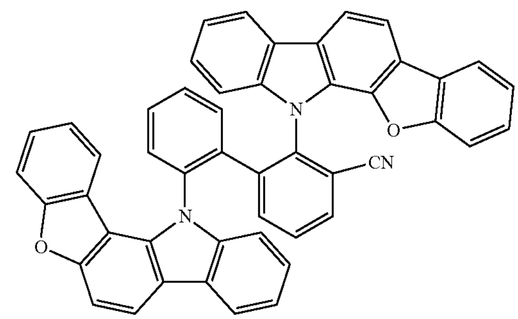
806
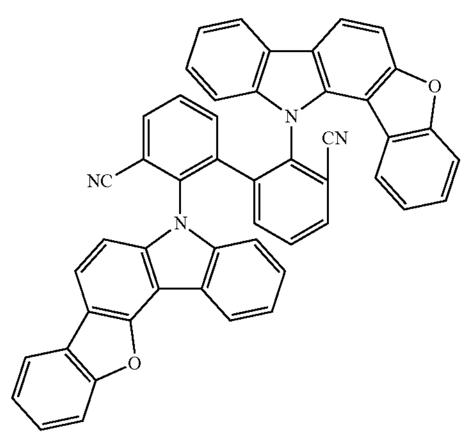

-continued
807
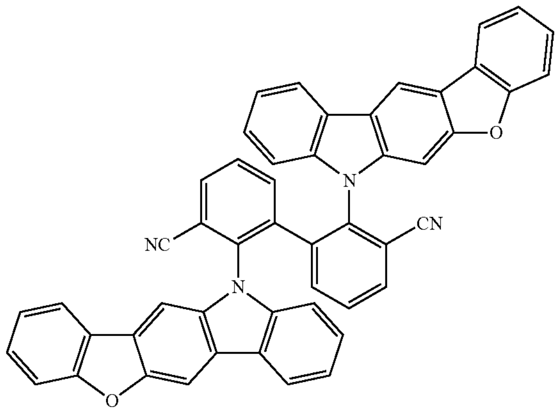
808
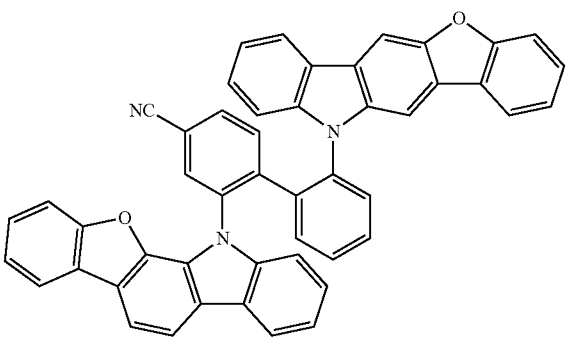
809
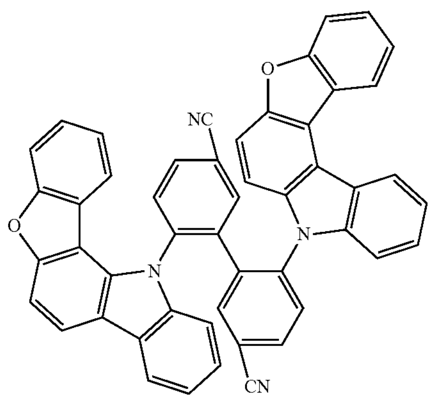
810
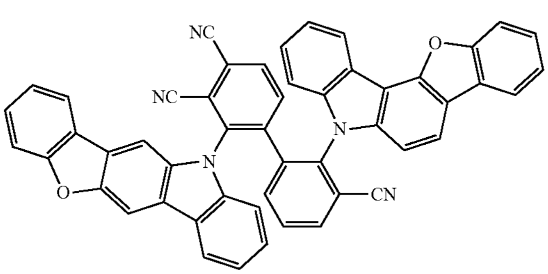
-continued
811
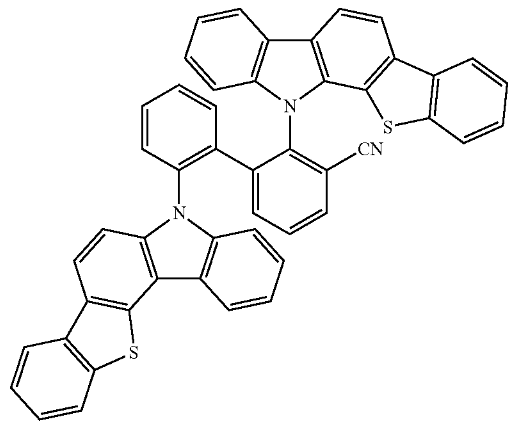
812
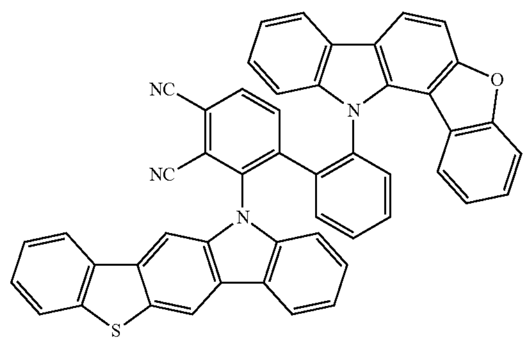
813
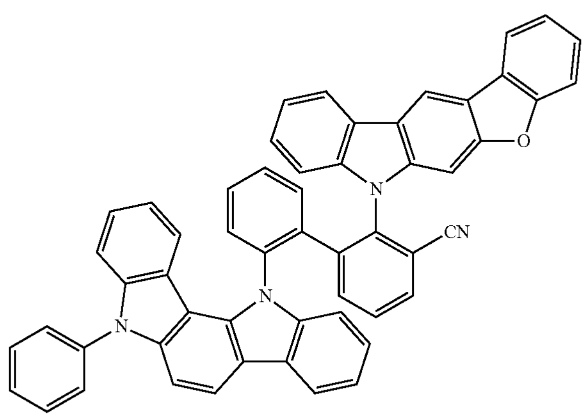

-continued
814
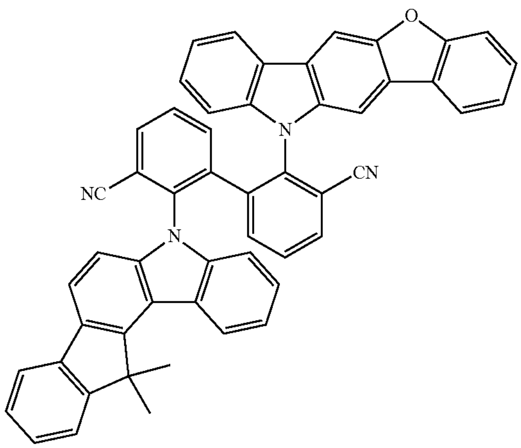
815
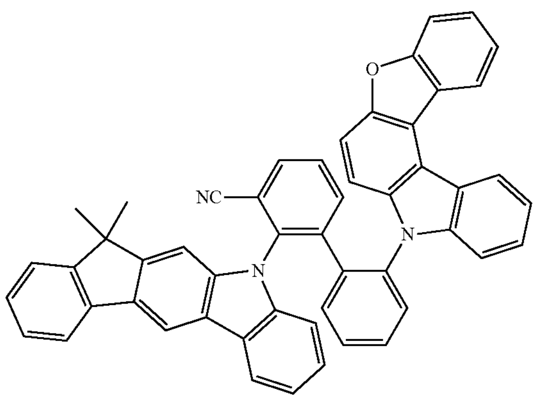
816
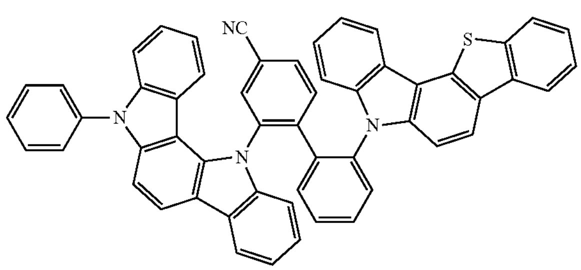
817
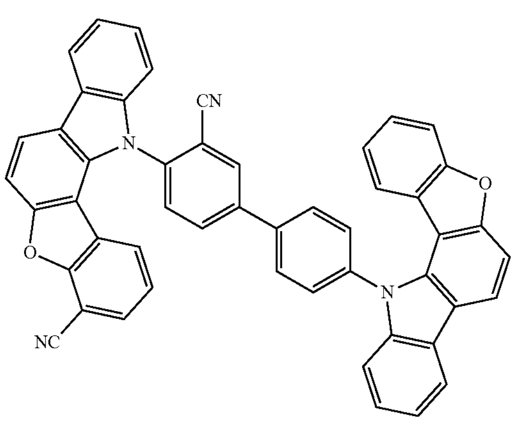
-continued
818
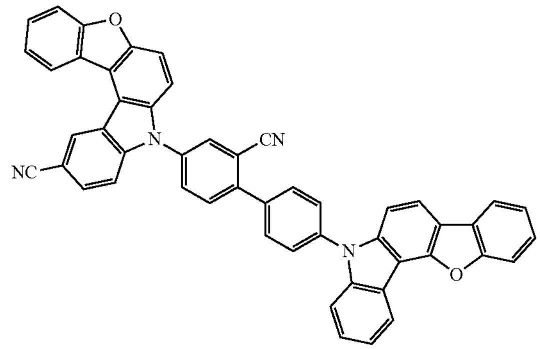
819
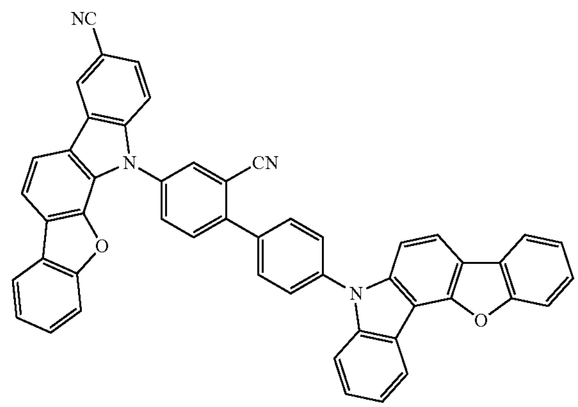
820
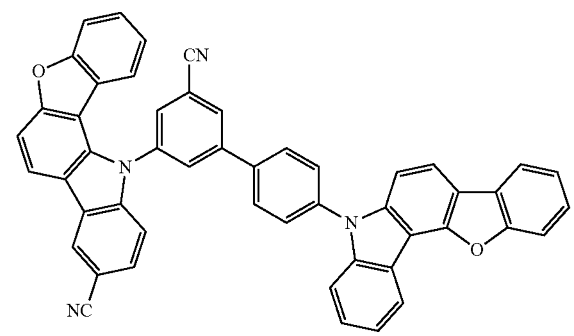
821
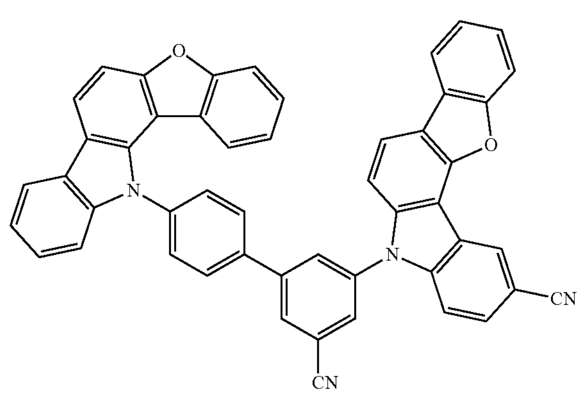

-continued
822
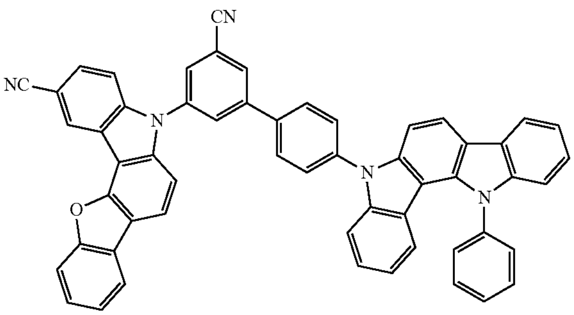
823
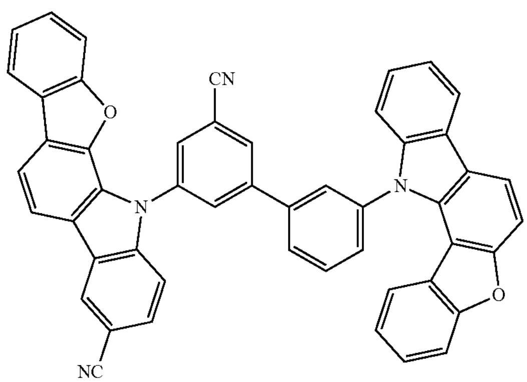
824
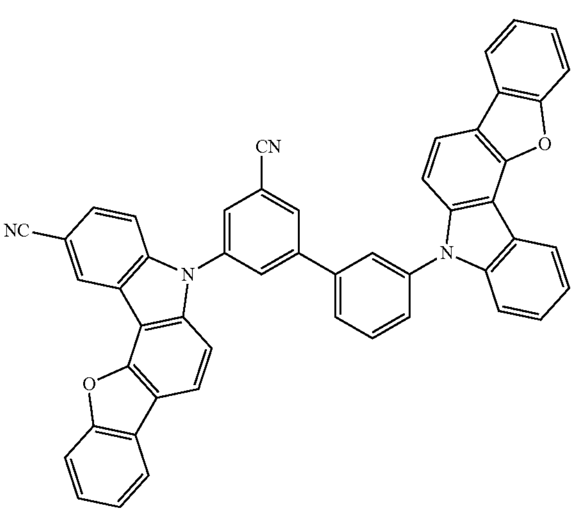
-continued
825
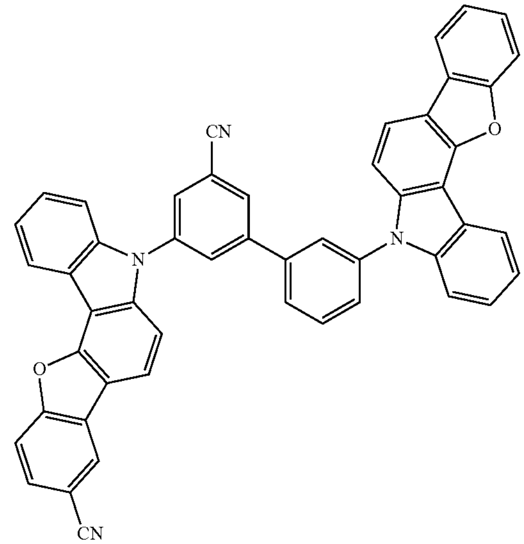
826
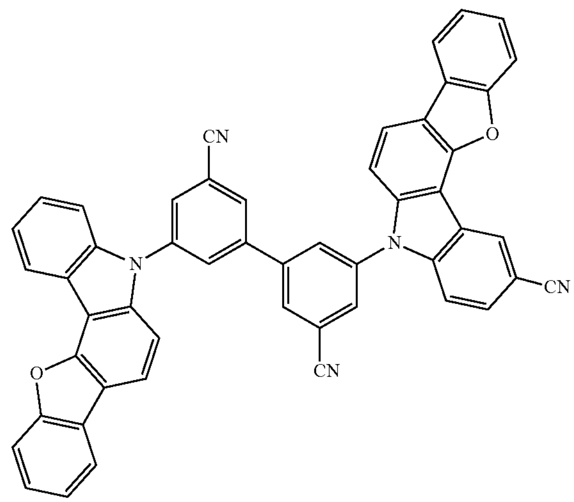
827
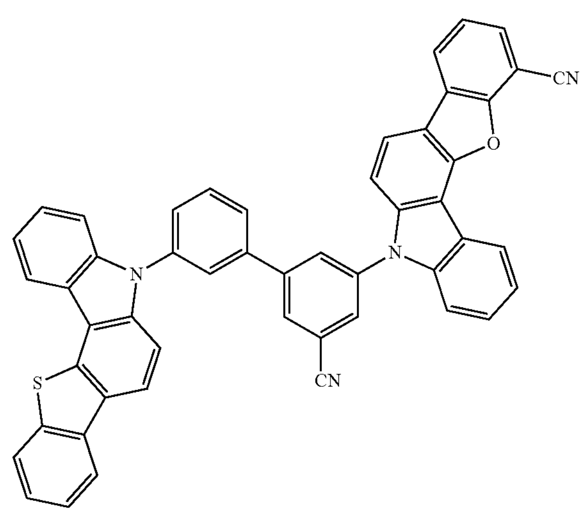

-continued
828
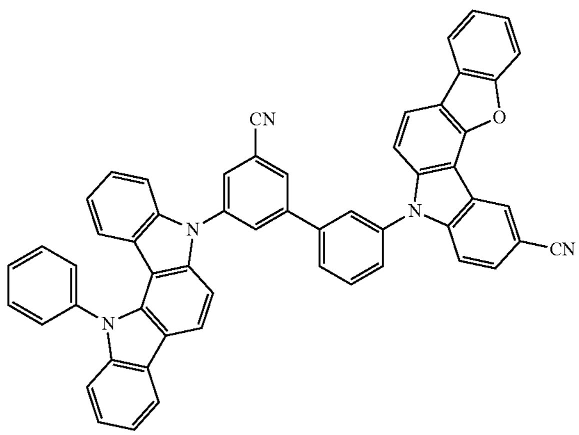
829
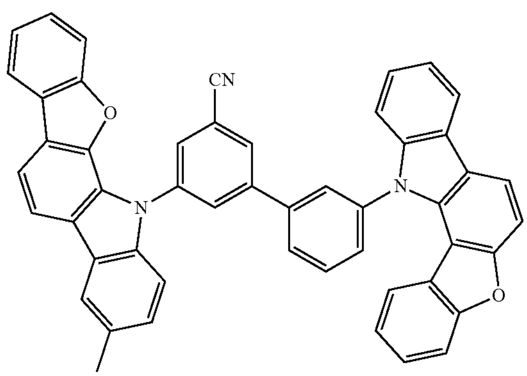
830
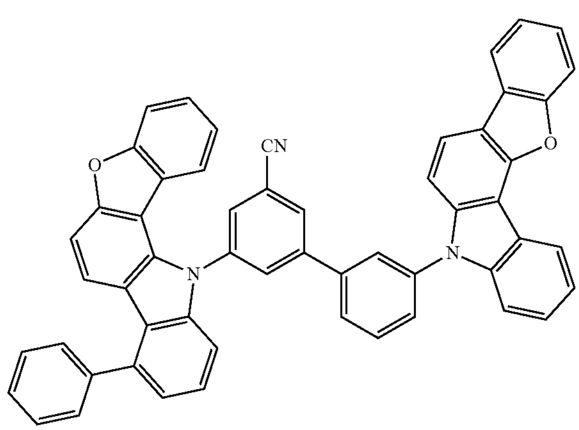
-continued
831
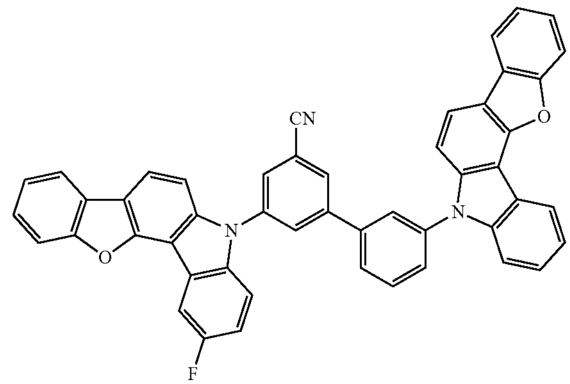
832
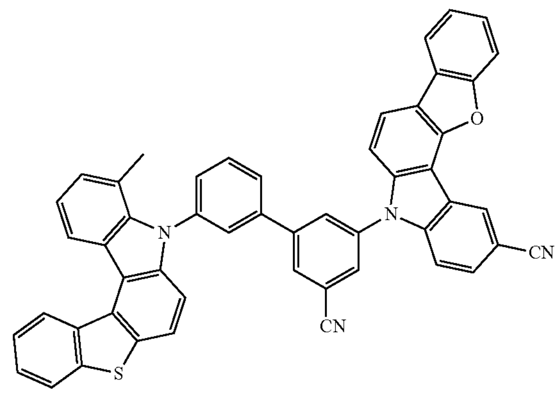
833
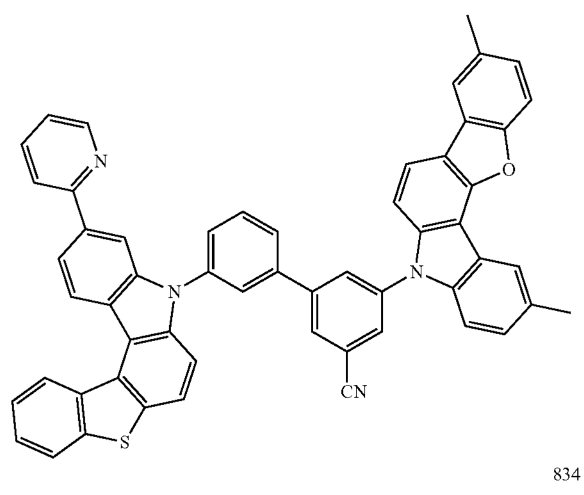
834
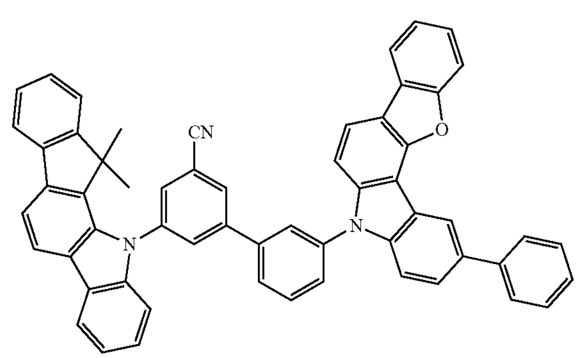

-continued
835
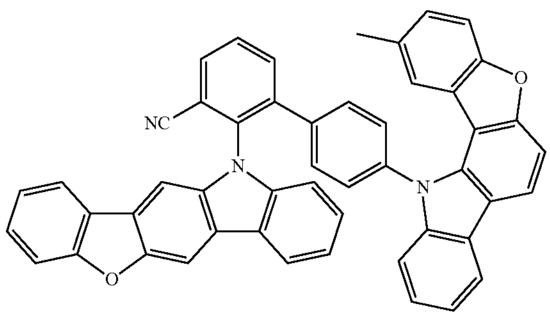
836
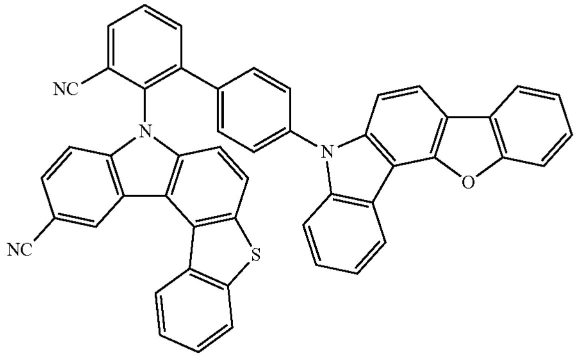
837
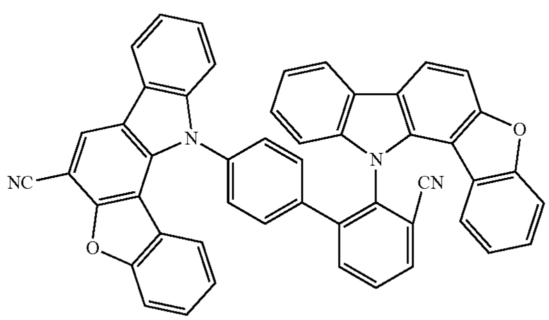
838
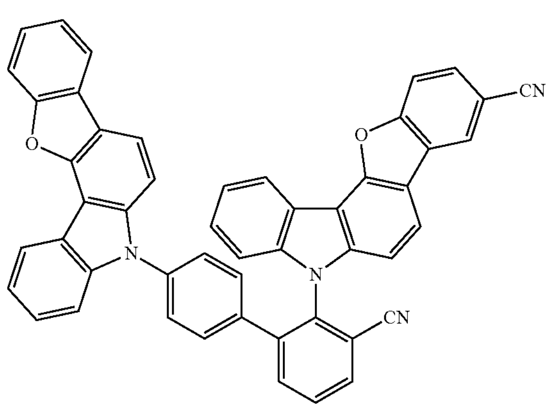
-continued
839
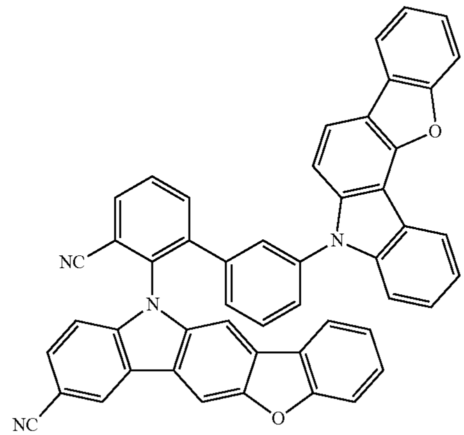
840
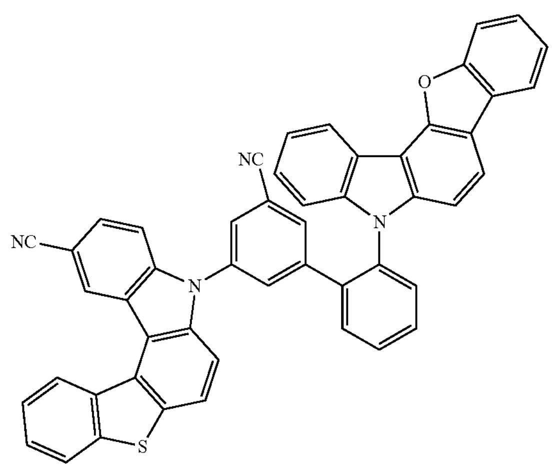
841
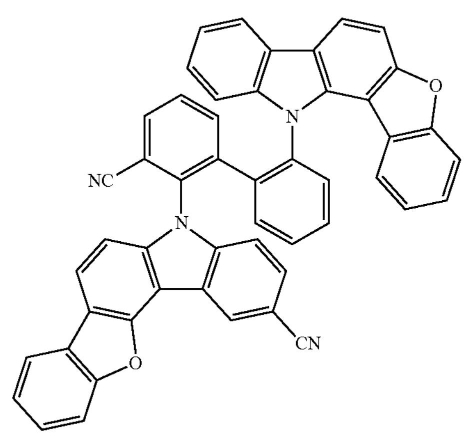

-continued
842
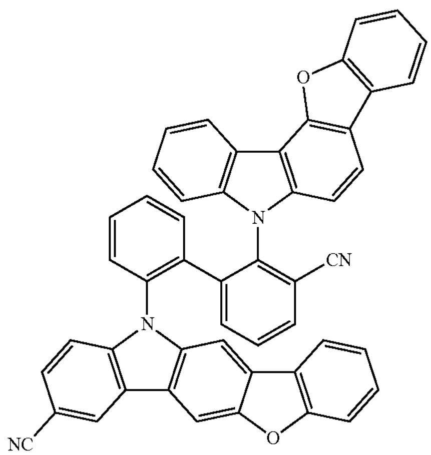
843
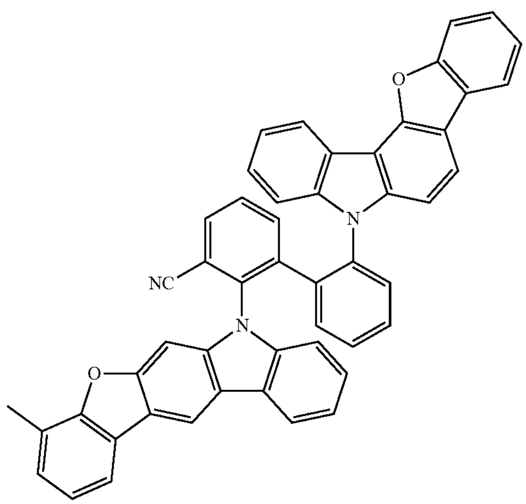
844
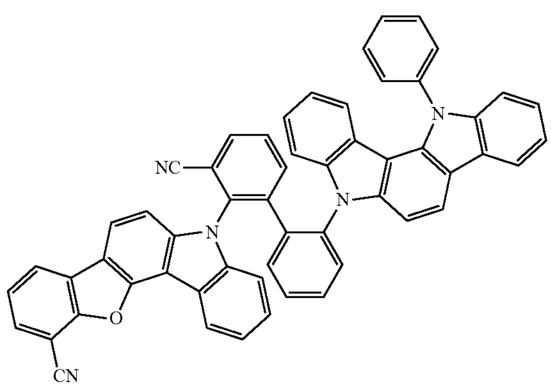
-continued
845
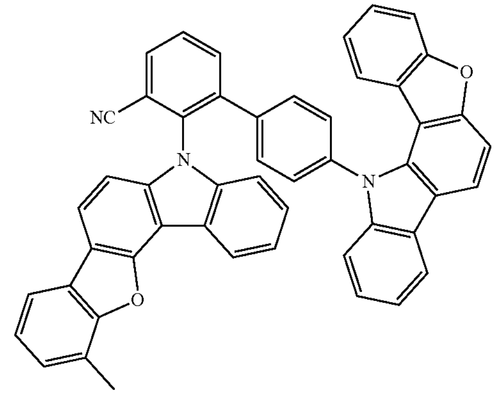
846
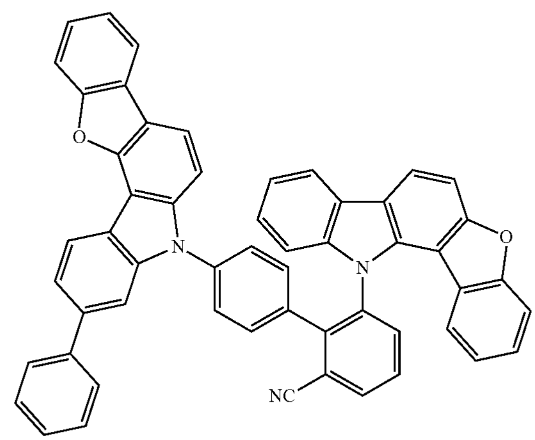
847
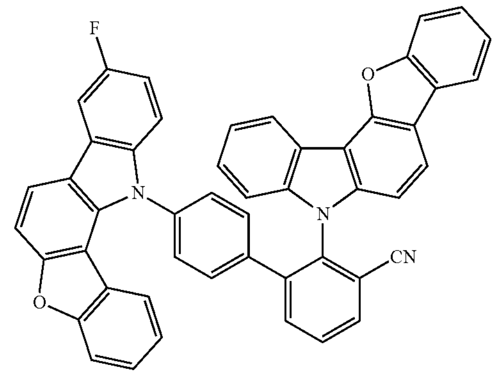

-continued
848
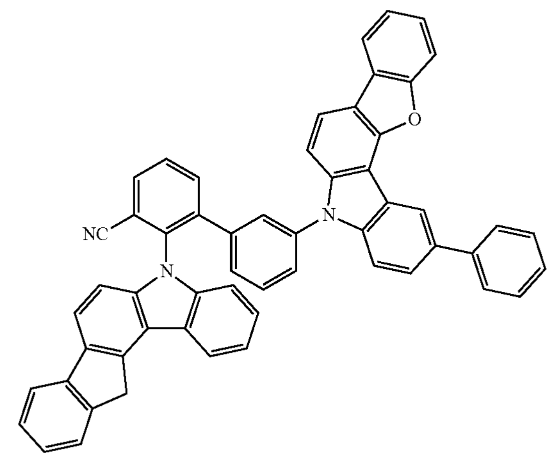
849
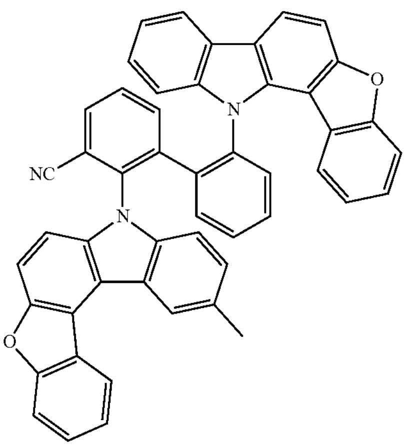
850
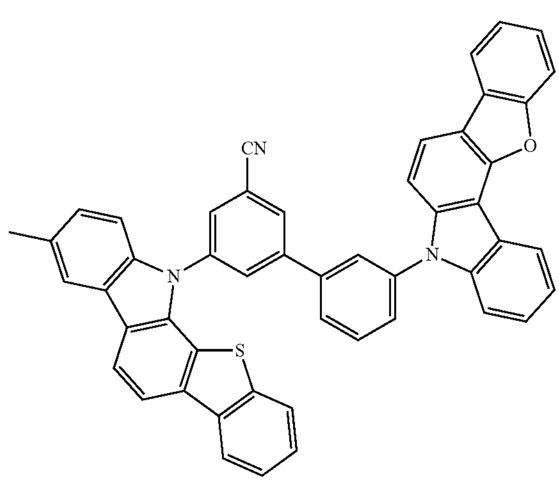
-continued
851
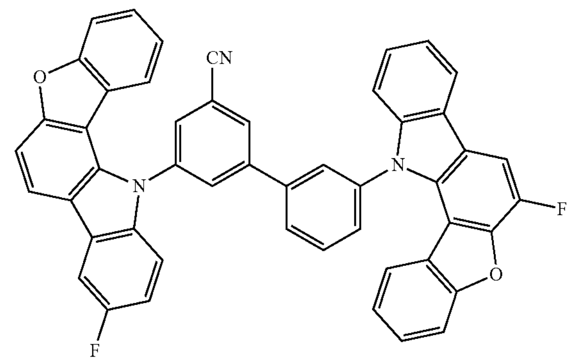
852
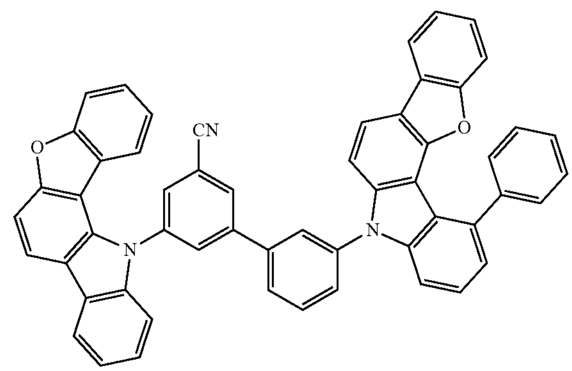
Group HE3
1
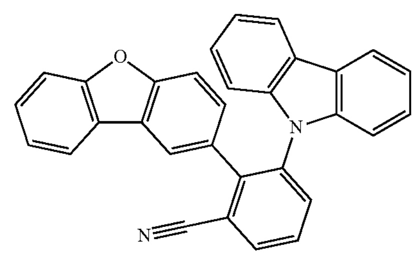
2
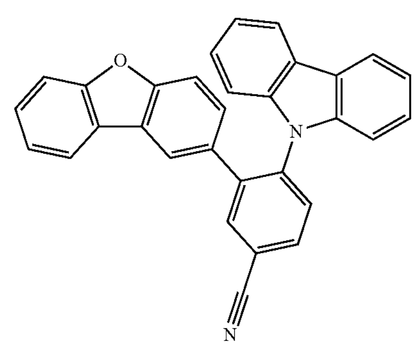

-continued
3
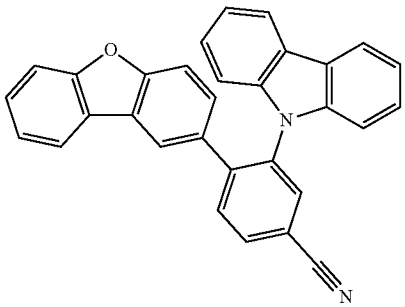
4
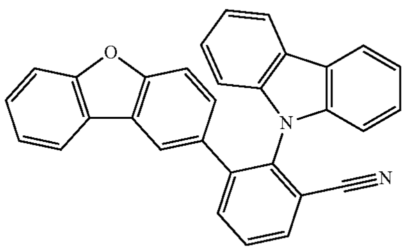
5
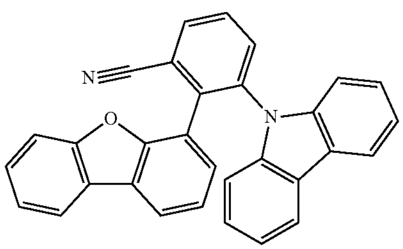
6
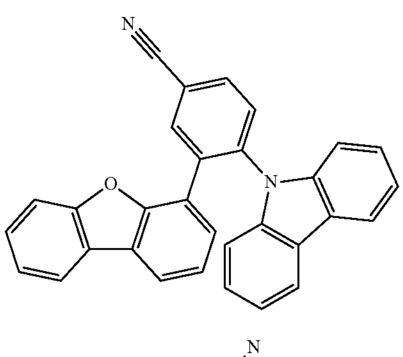
7
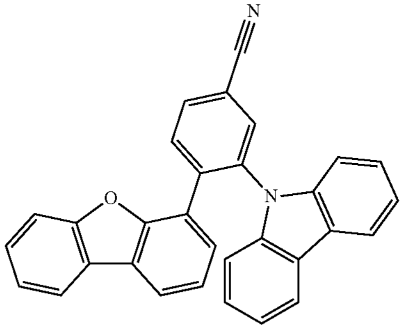
-continued
8
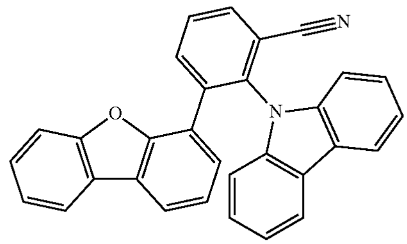
9
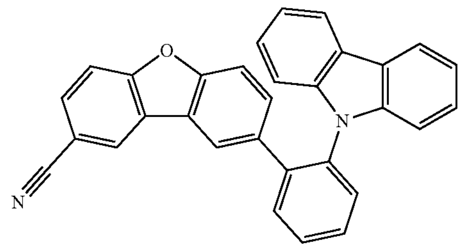
10
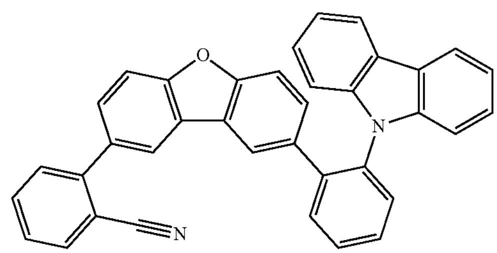
11
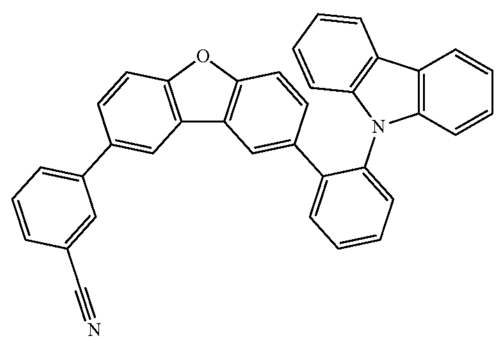
12
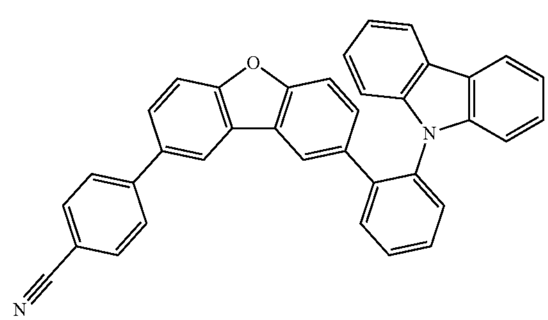

-continued
13
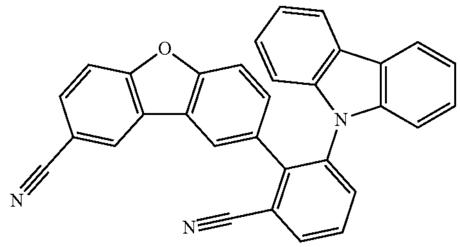
14
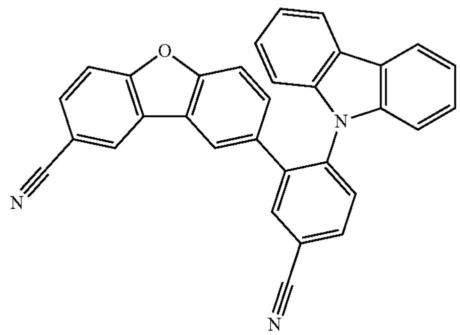
15
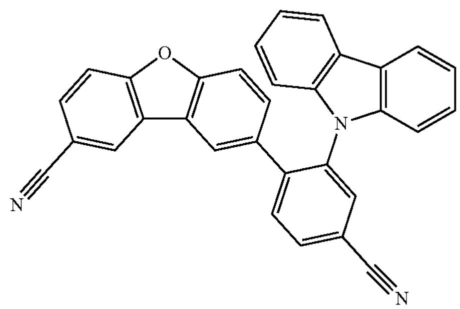
16
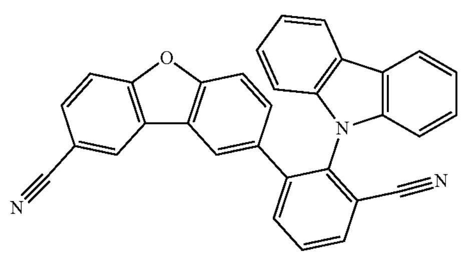
17
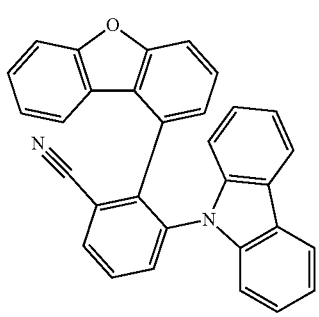
-continued
18
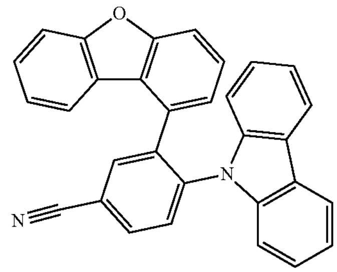
19
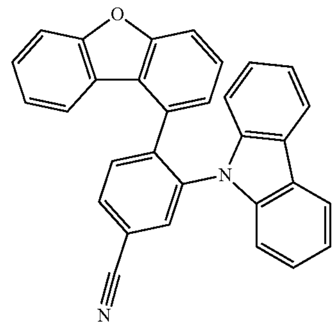
20
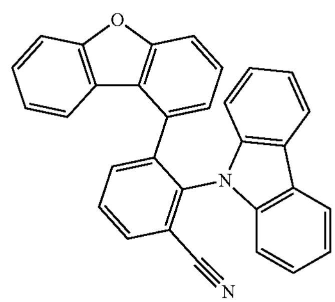
21
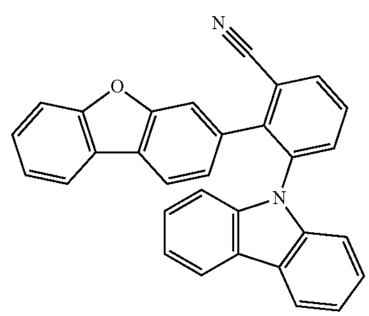
22
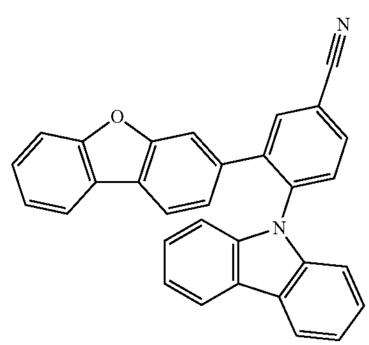

23
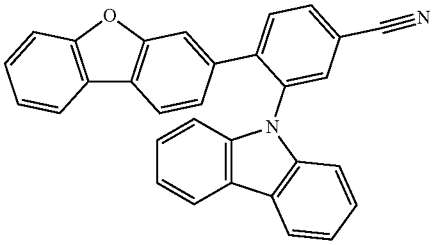
24
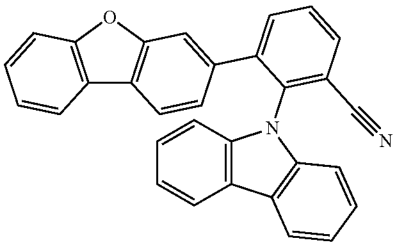
25
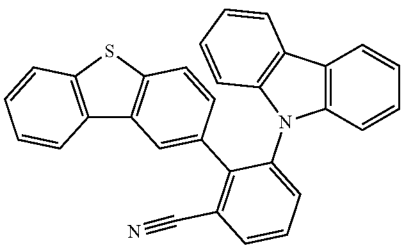
26
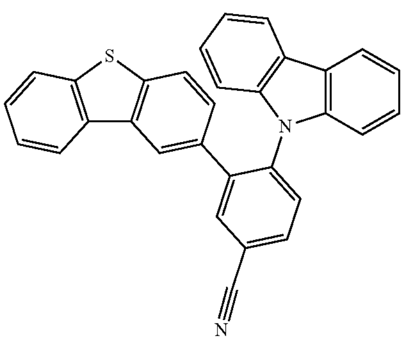
27
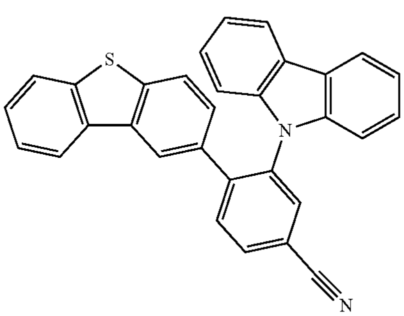
28
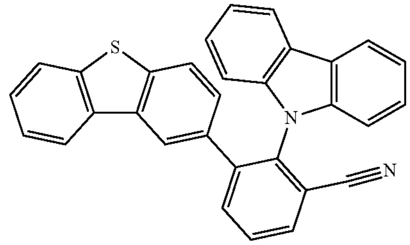
29
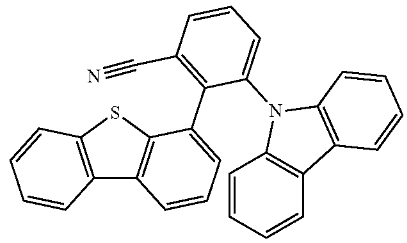
30
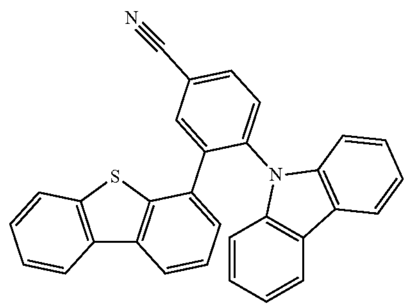
31
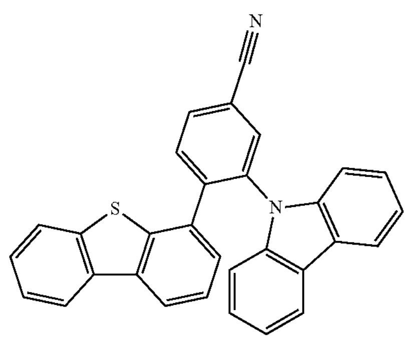
32
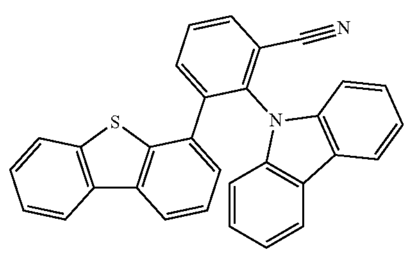

33
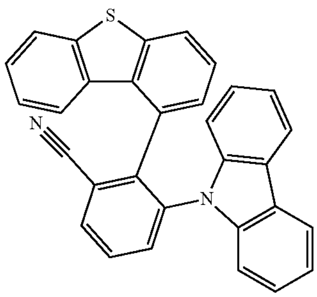
34
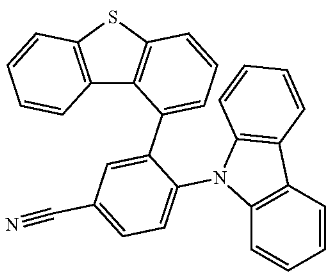
35
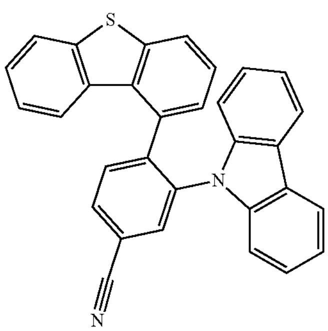
36
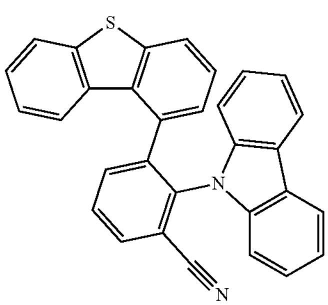
37
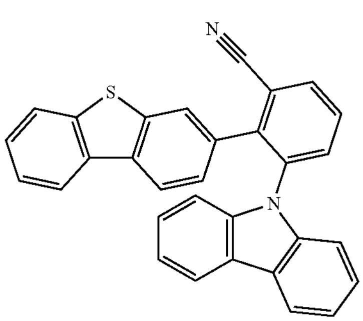
38
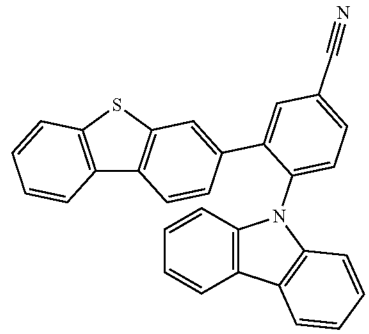
39
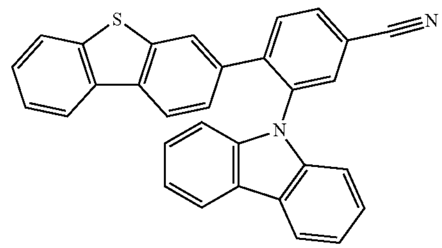
40
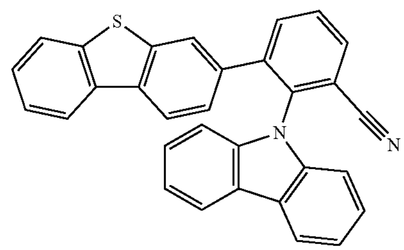
41
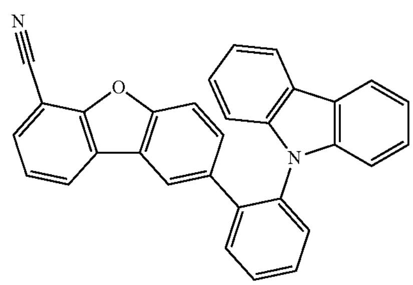
42
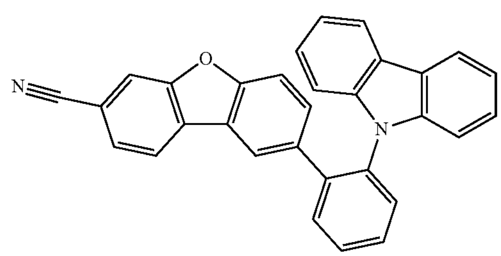
43
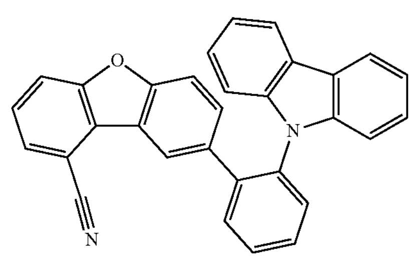

-continued
44
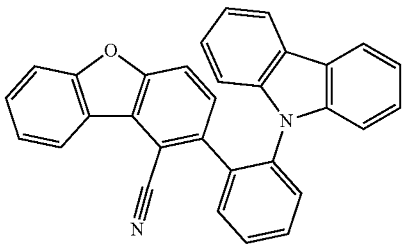
45
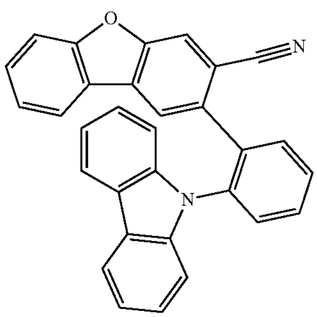
46
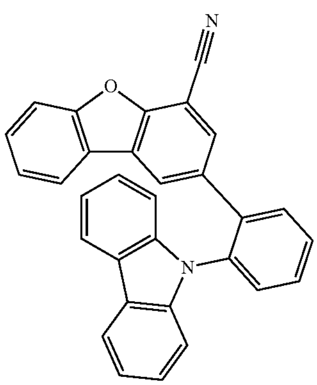
47
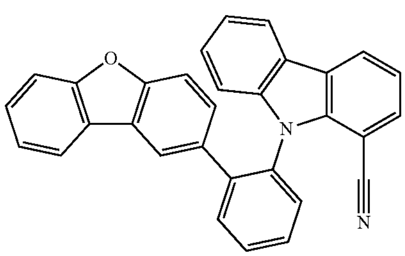
48
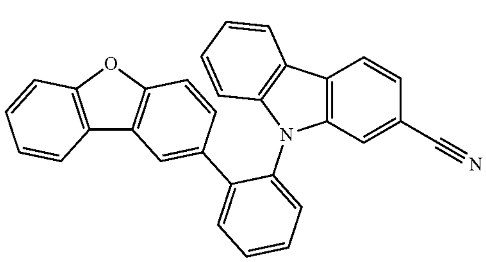
-continued
49
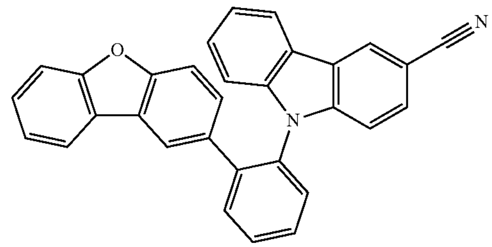
50
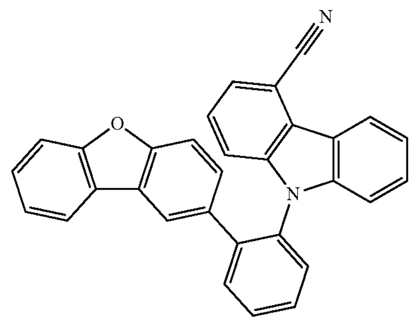
51
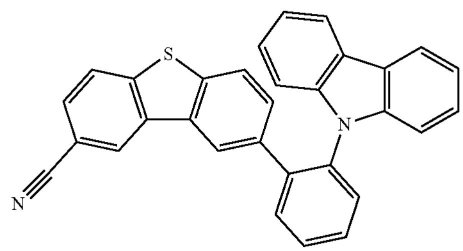
52
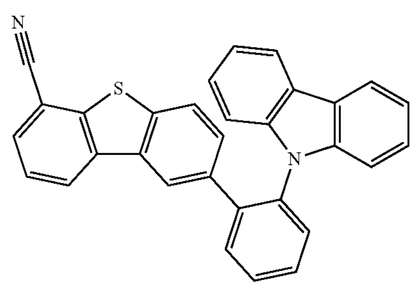
53
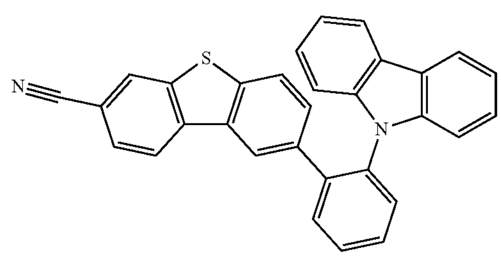
54
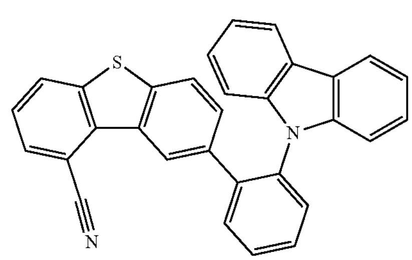

55
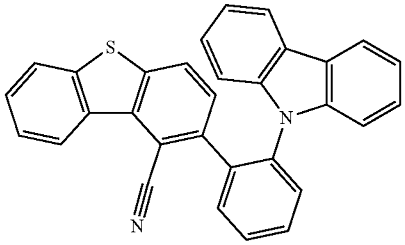
56
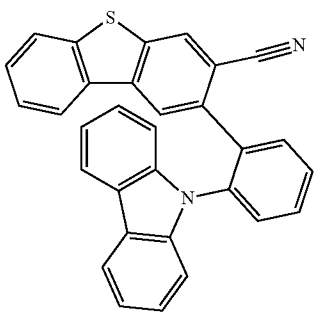
57
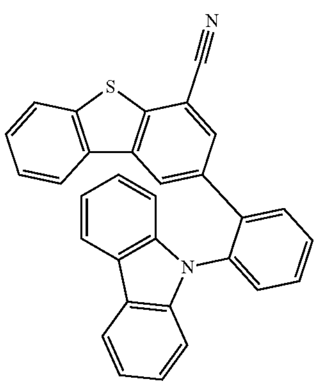
58
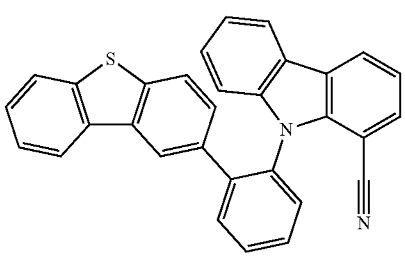
59
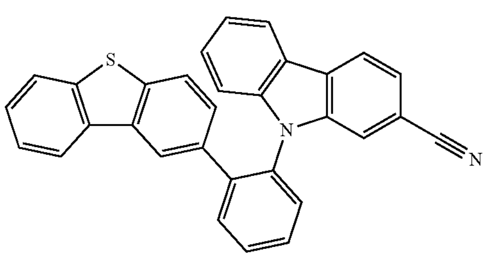
60
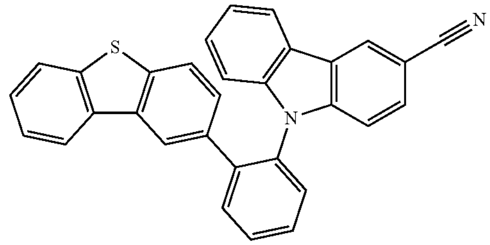
61
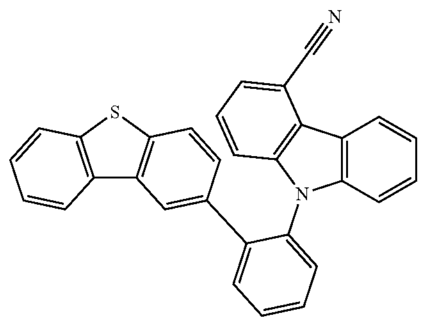
62
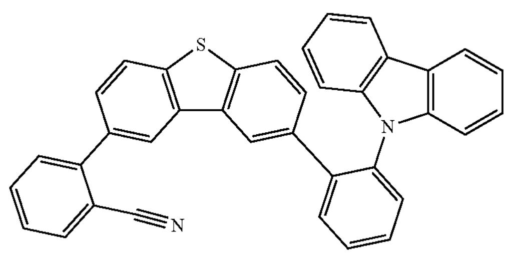
63
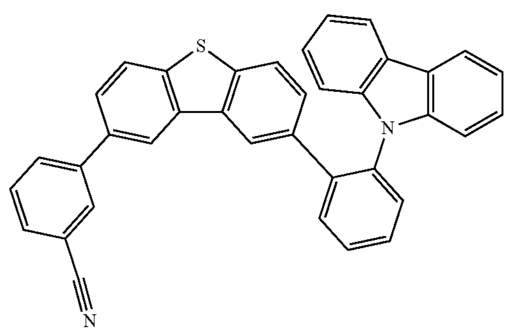
64
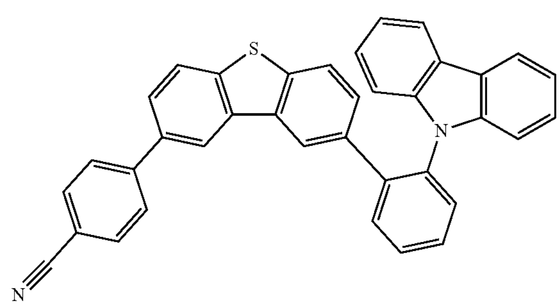

-continued
65
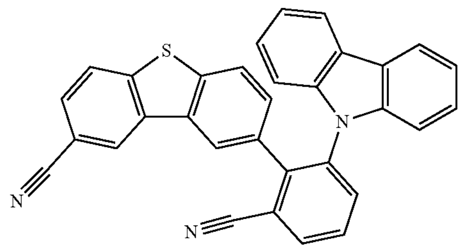
66
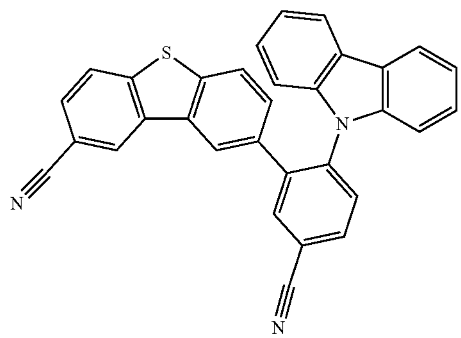
67
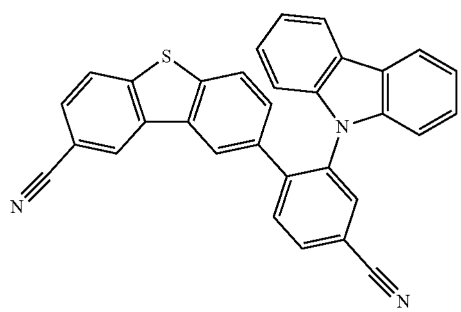
68
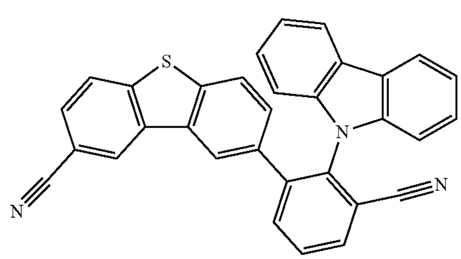
69
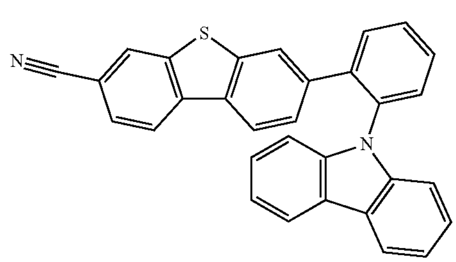
70
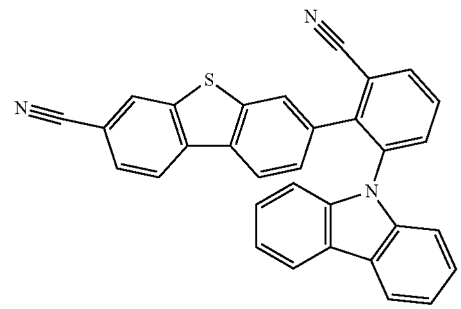
71
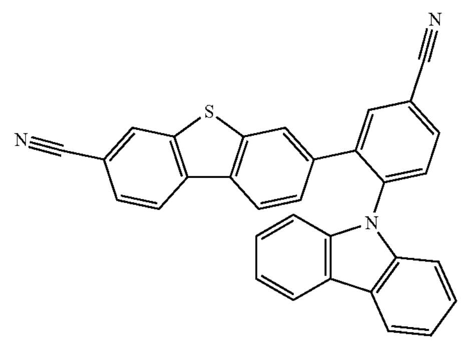
72
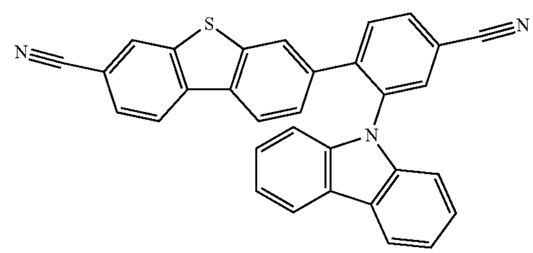
73
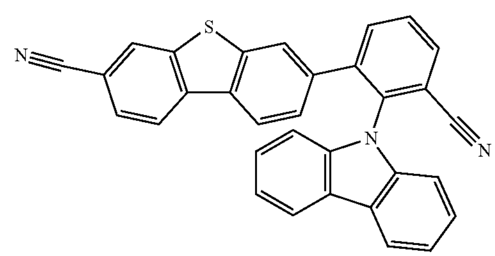
74
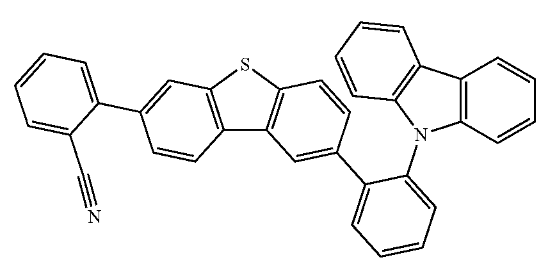

-continued
75
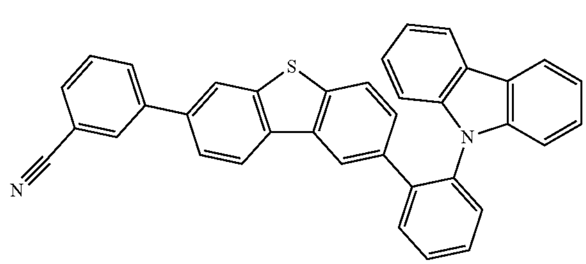
76
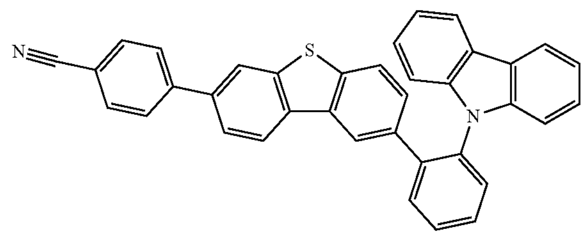
77
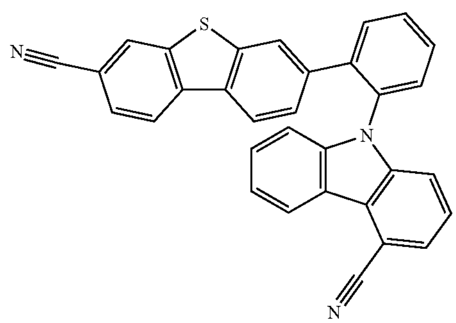
78
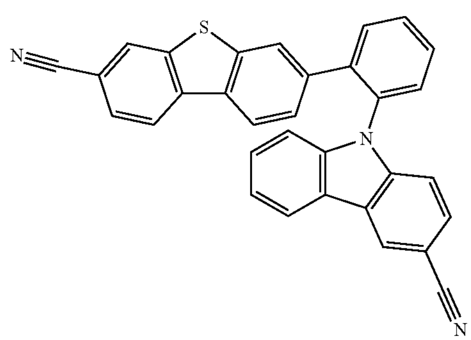
79
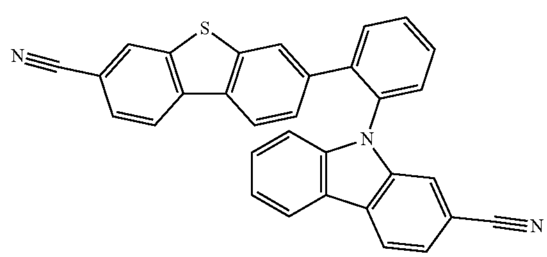
-continued
80
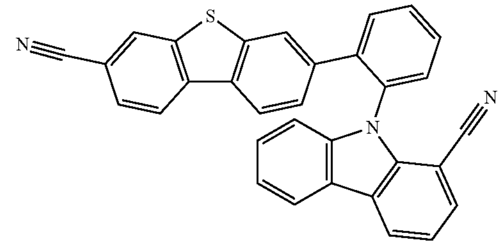
81
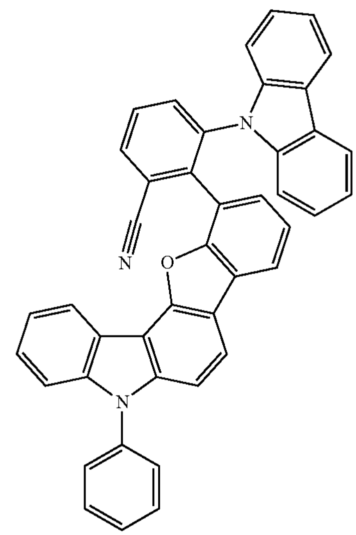
82
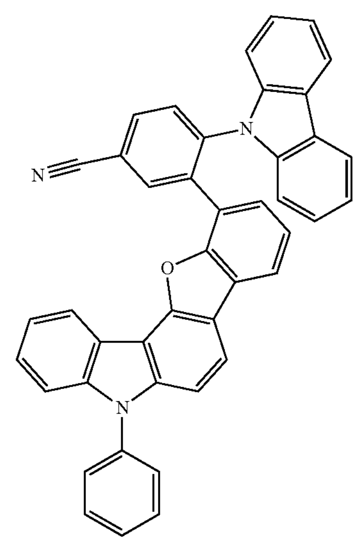

83
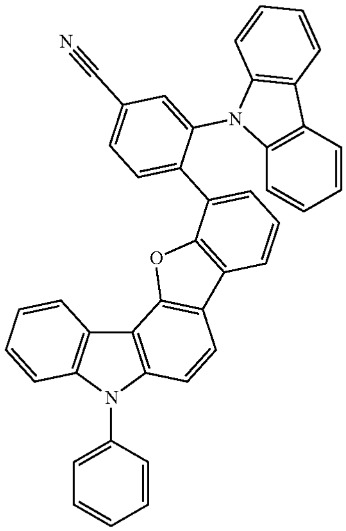
84
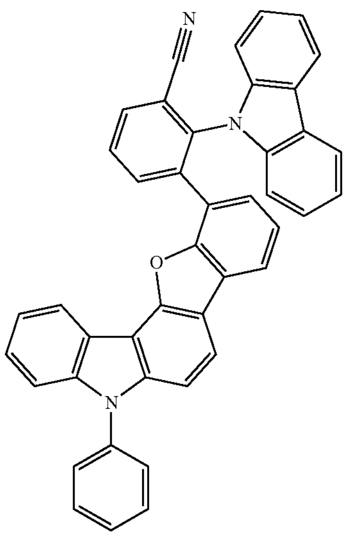
85
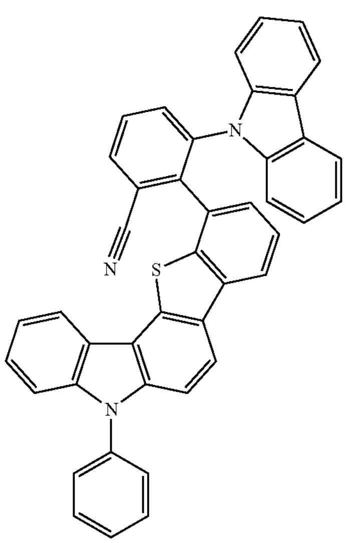
86
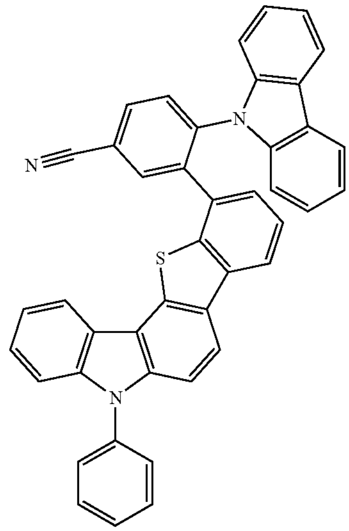
87
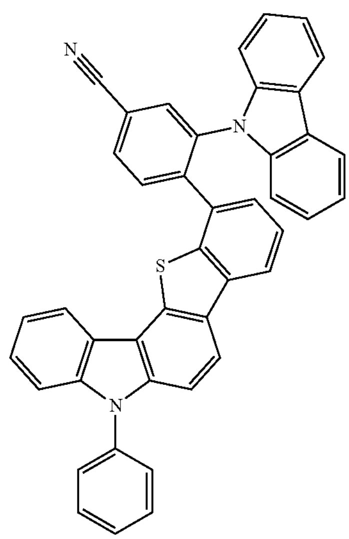
88
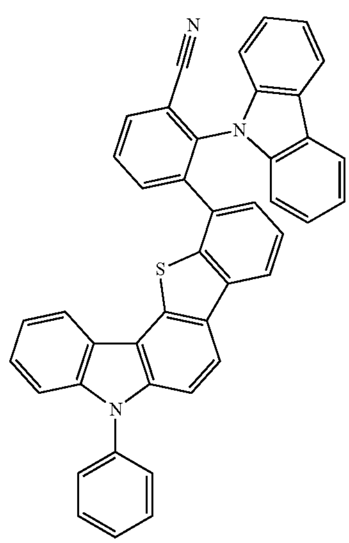

89
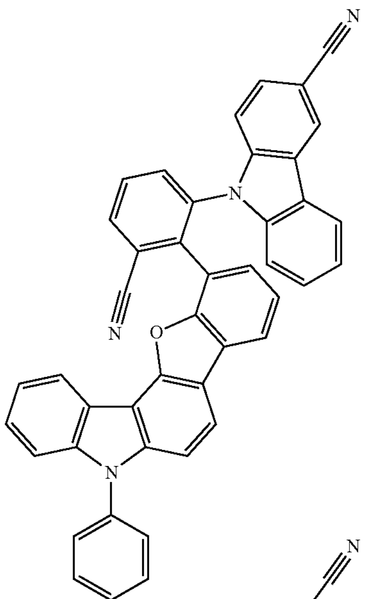
90
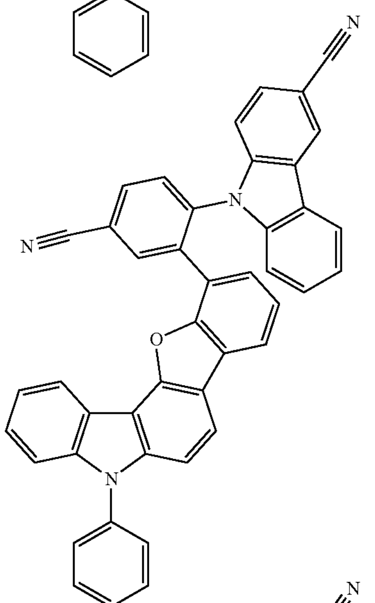
91
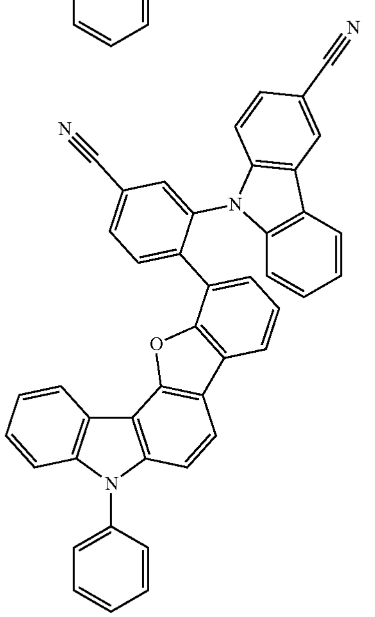
92
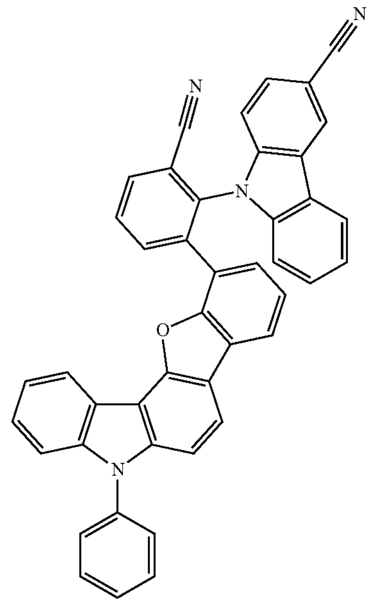
93
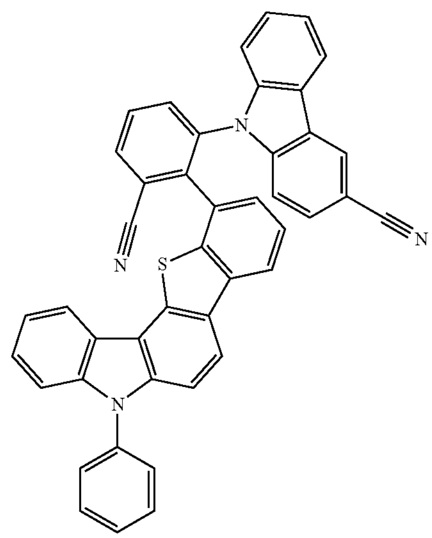
94
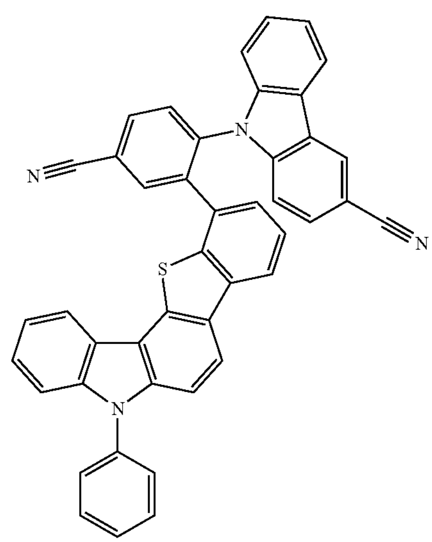

-continued
95
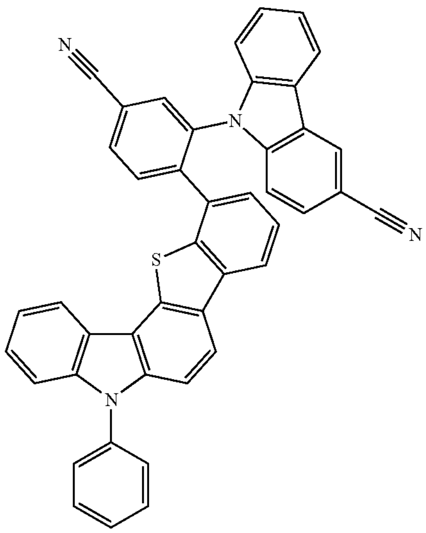
96
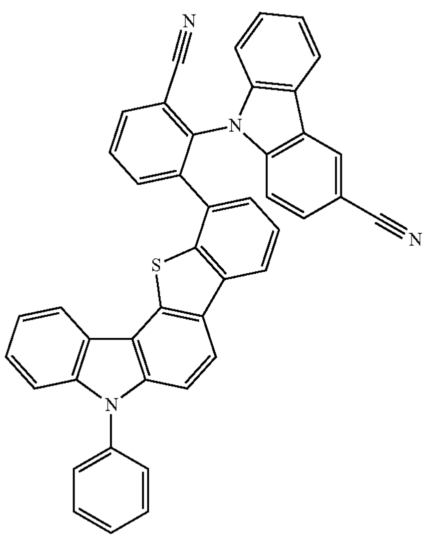
97
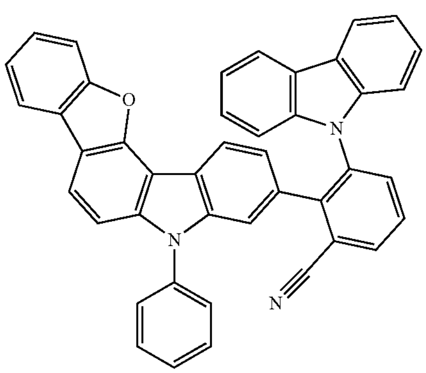
-continued
98
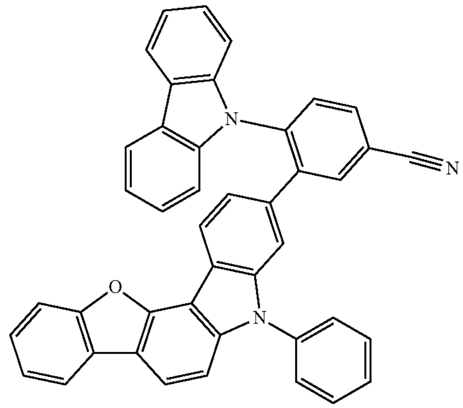
99
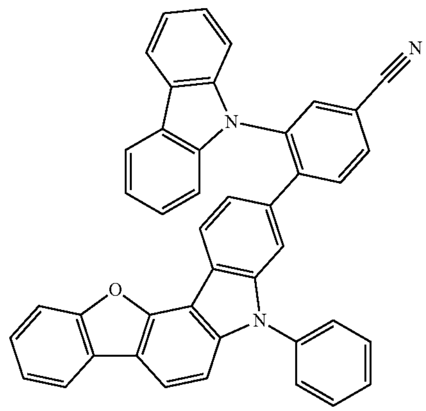
100
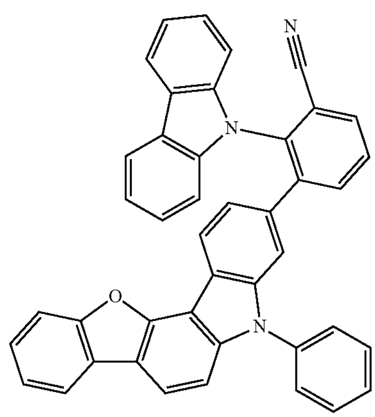
101
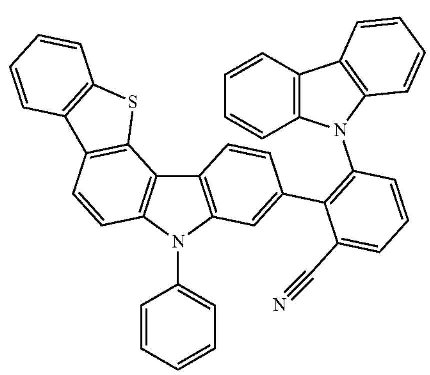

-continued
102
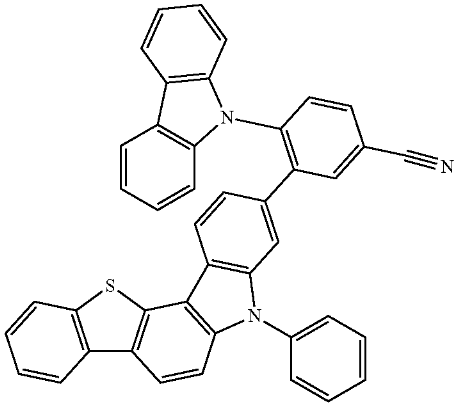
103
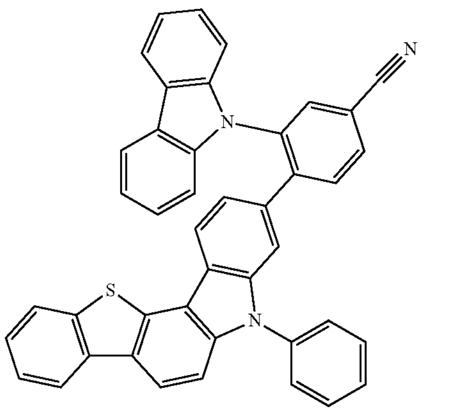
104
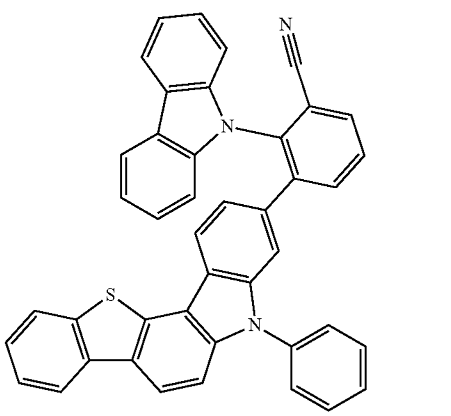
105
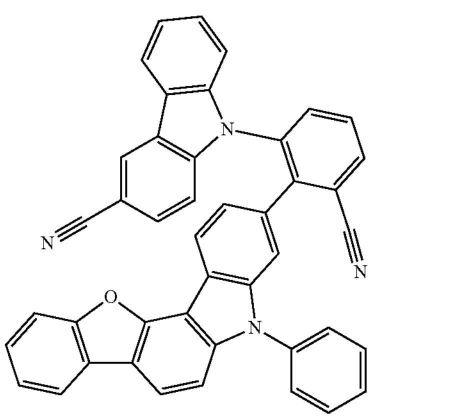
-continued
106
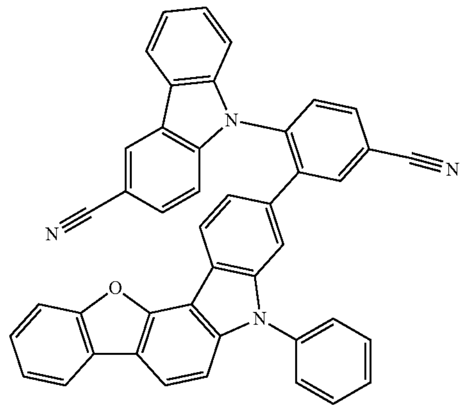
107
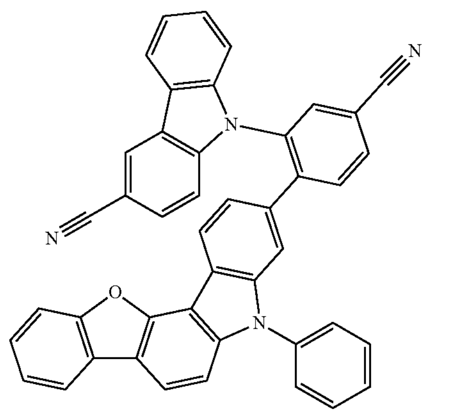
108
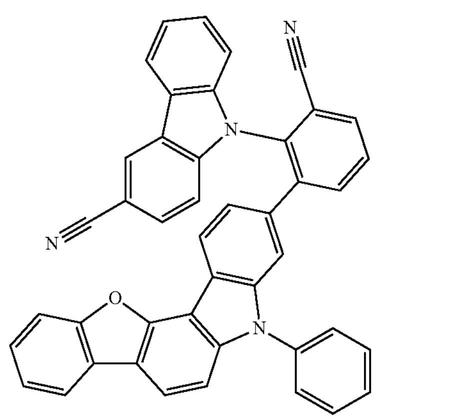
109
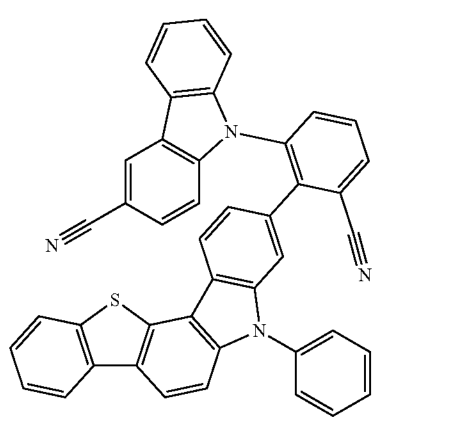

-continued
110
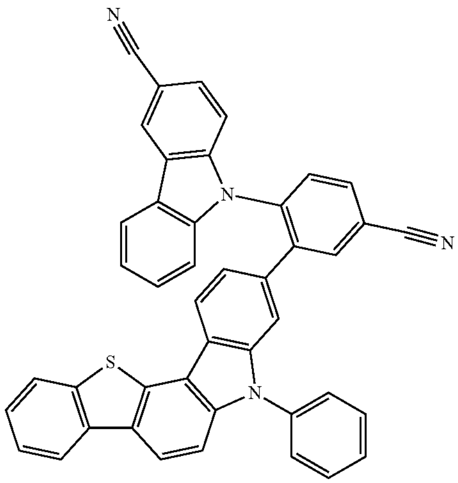
111
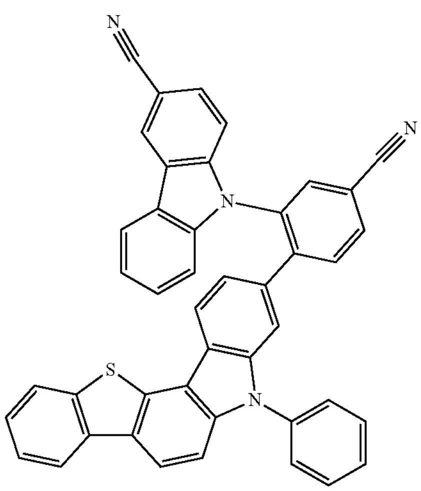
112
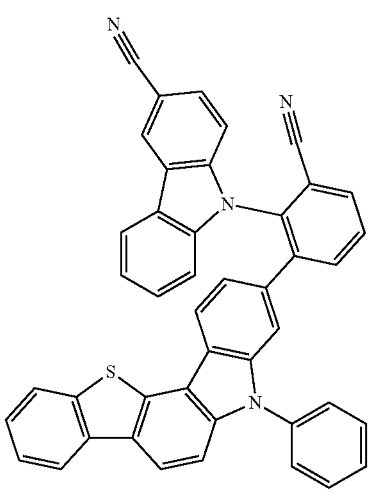
-continued
113
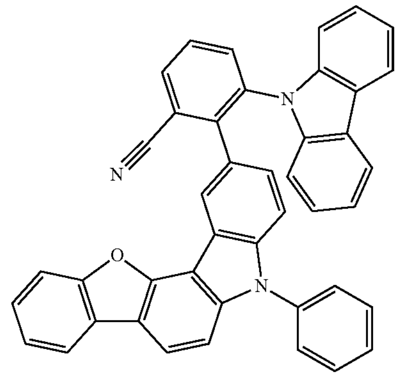
114
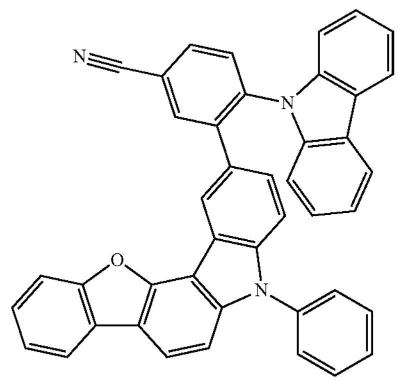
115
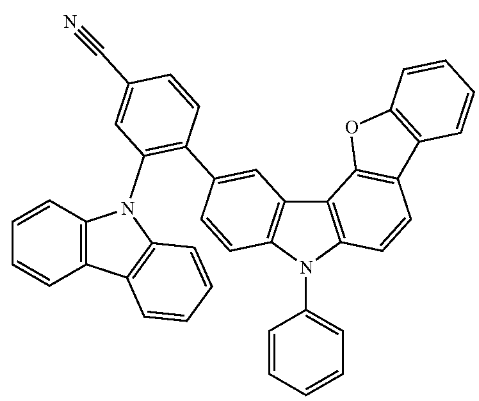
116
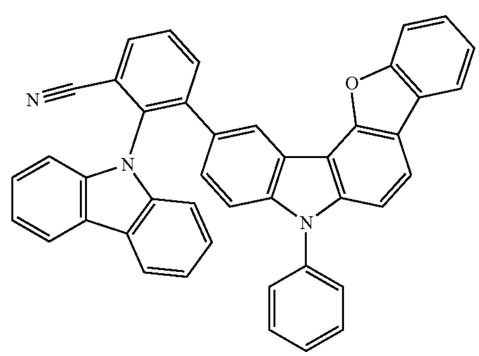

-continued
117
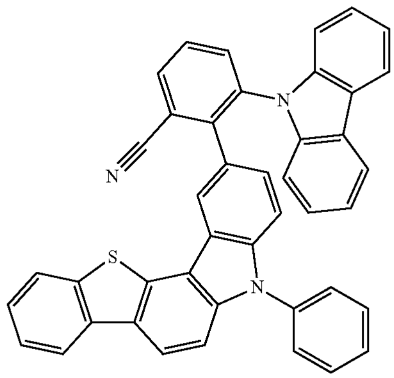
118
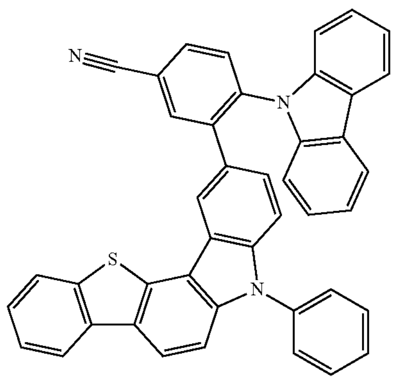
119
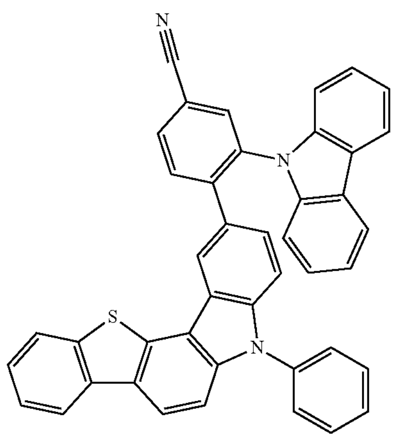
120
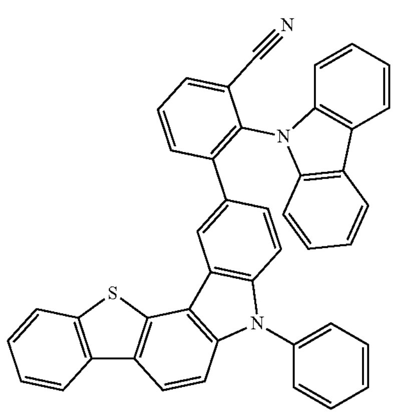
-continued
121
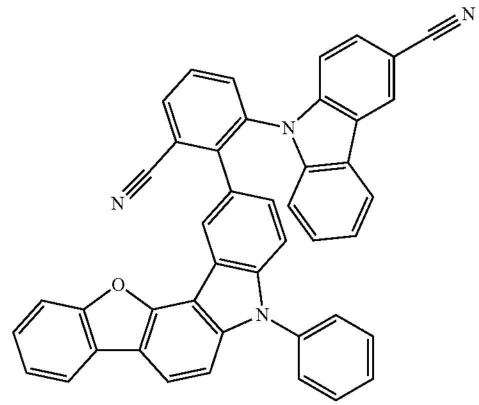
122
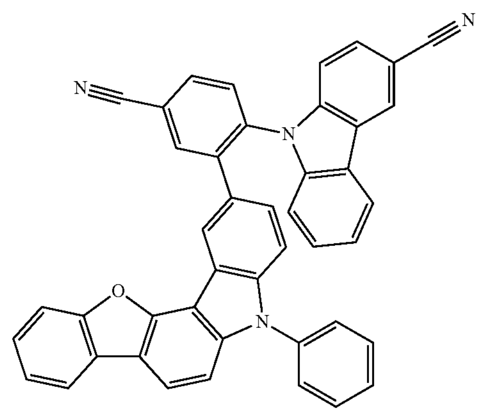
123
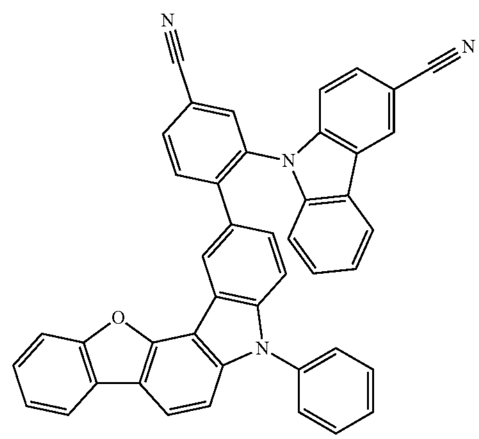
124
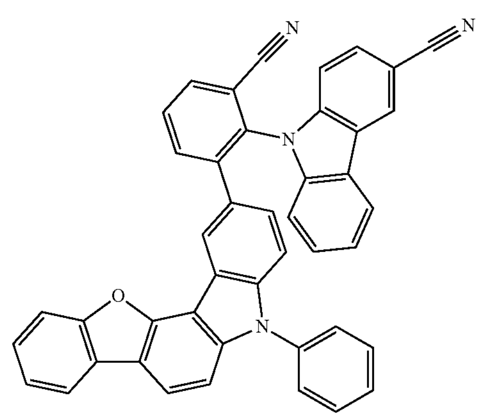

-continued
125
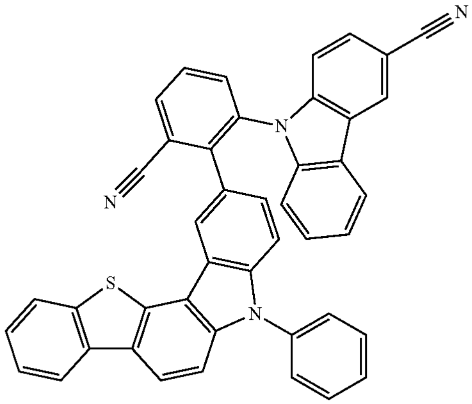
126
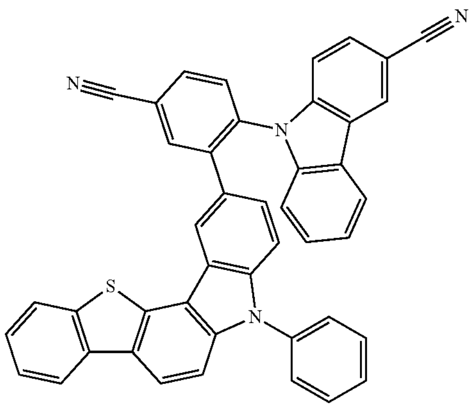
127
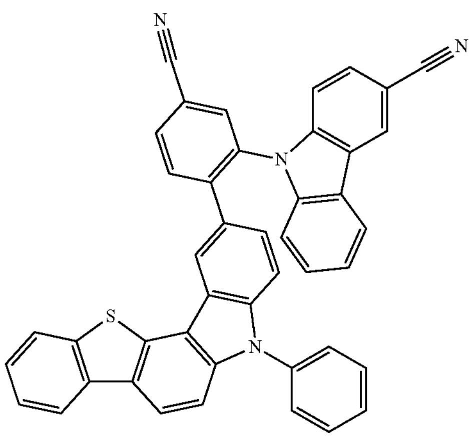
128
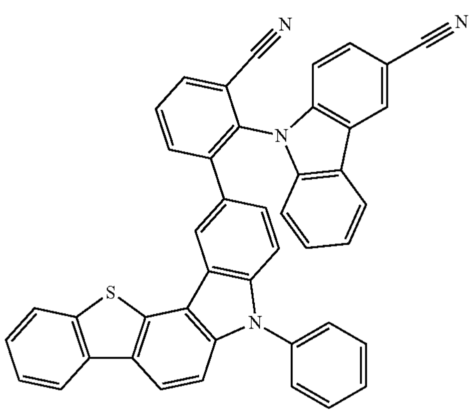
-continued
129
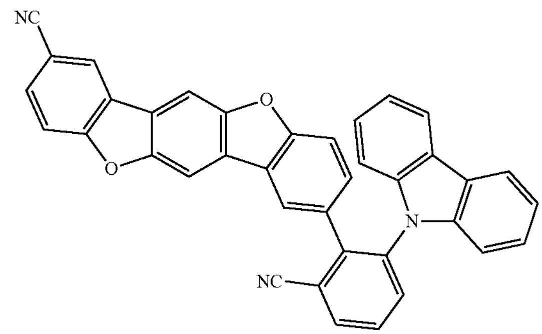
130
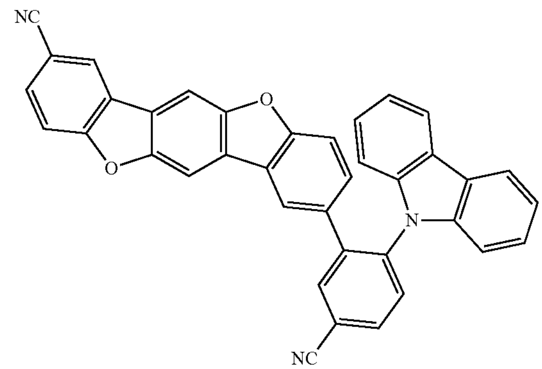
131
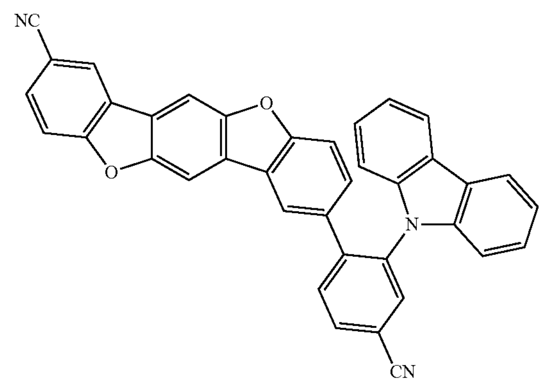
132
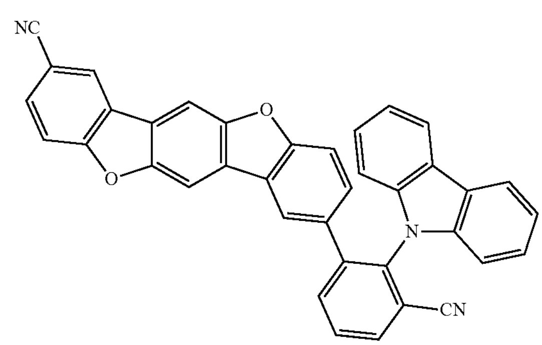

-continued
133
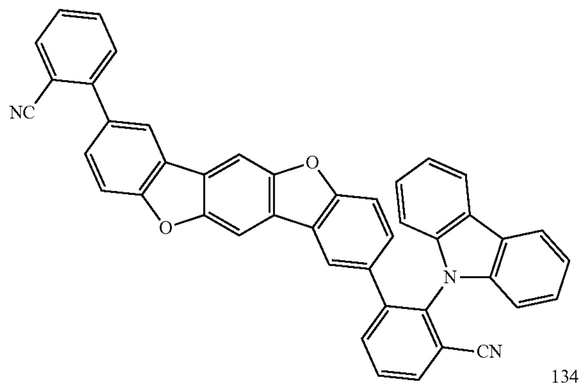
134
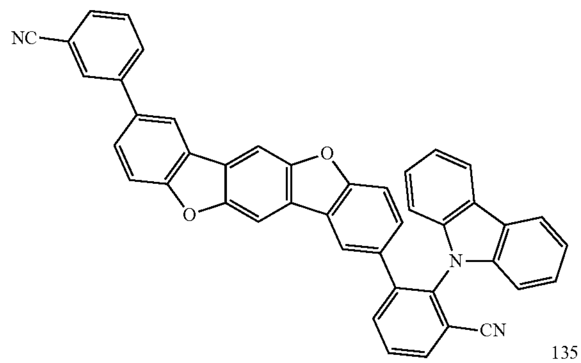
135
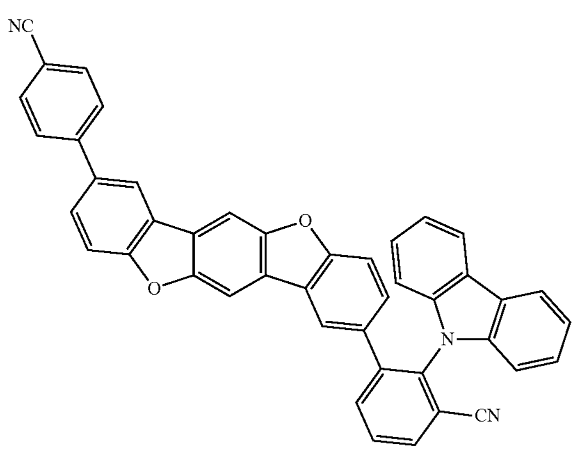
136
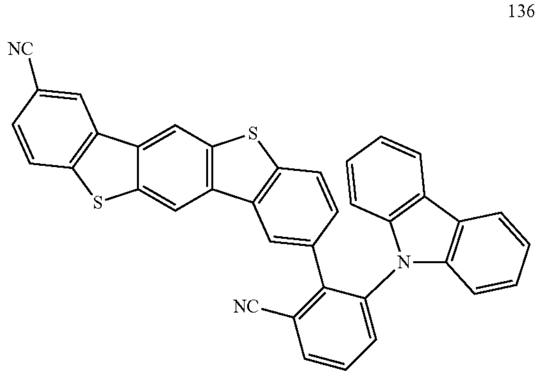
-continued
137
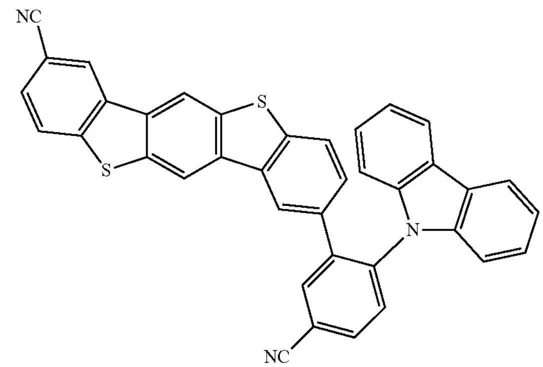
138
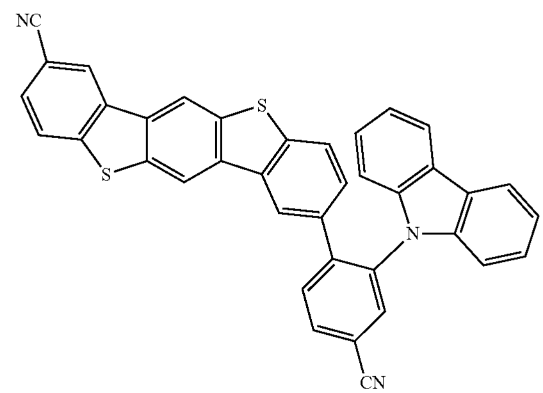
139
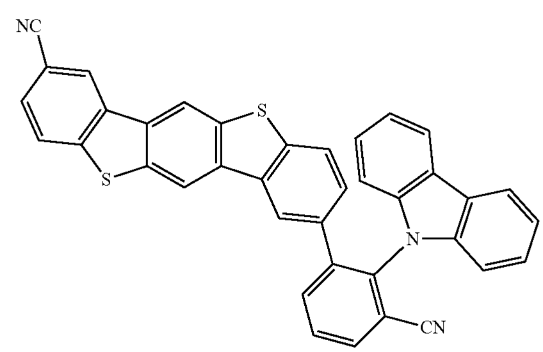
140
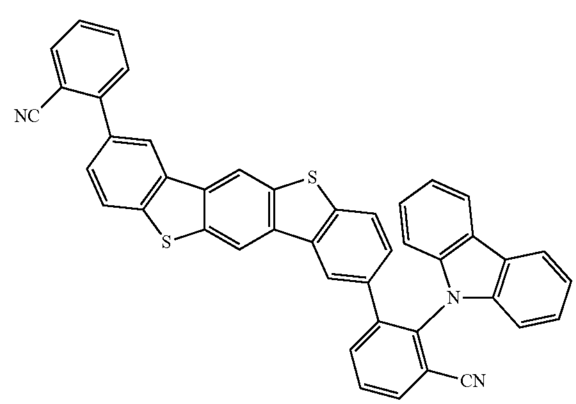

-continued
141
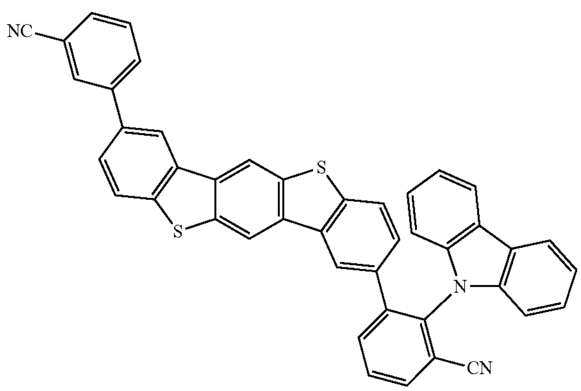
142
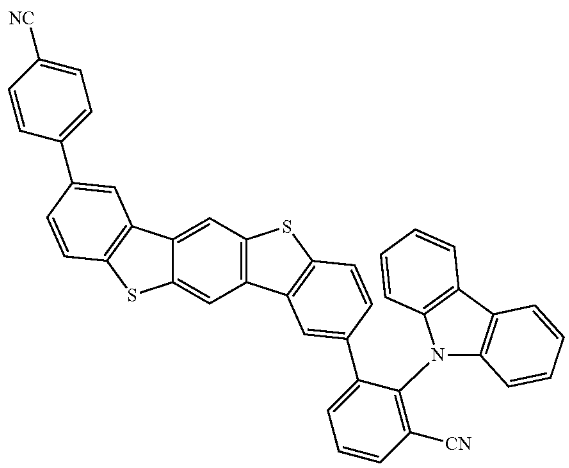
143
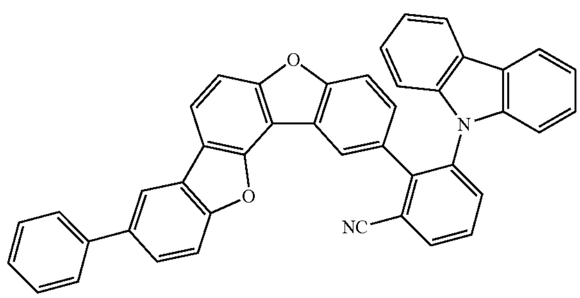
144
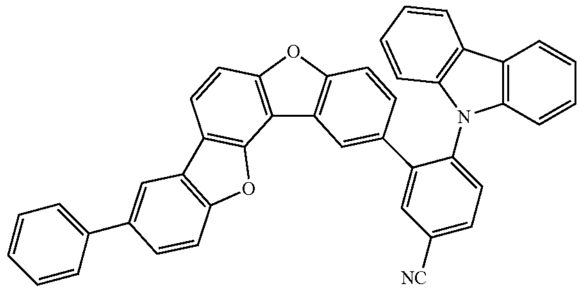
-continued
145
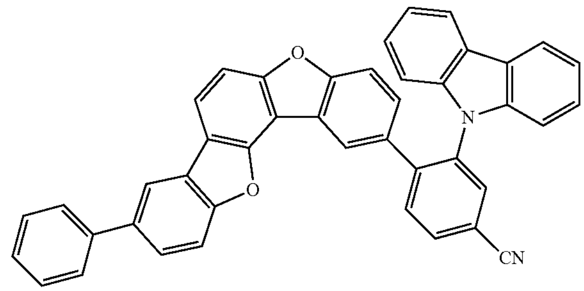
146
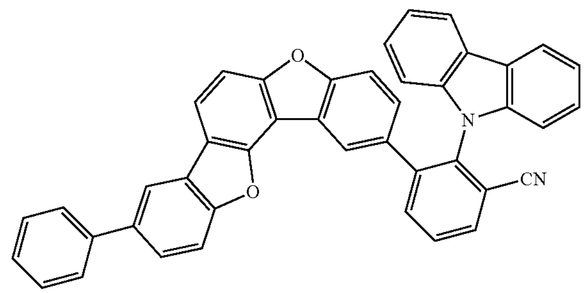
147
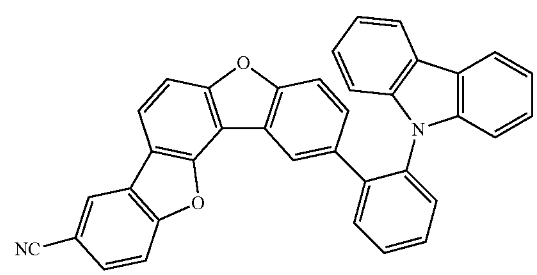
148
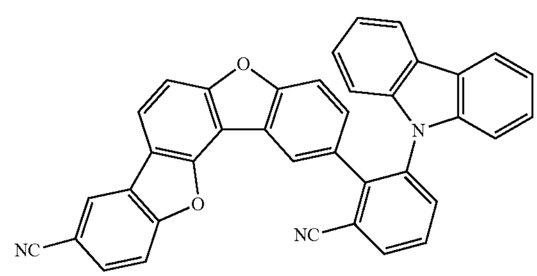
149
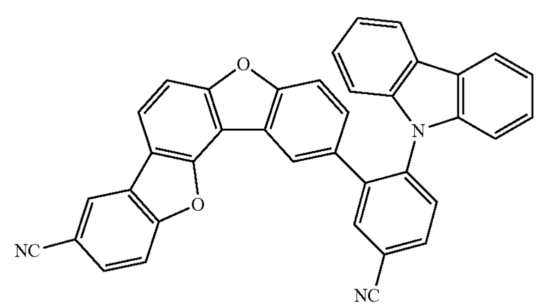

150
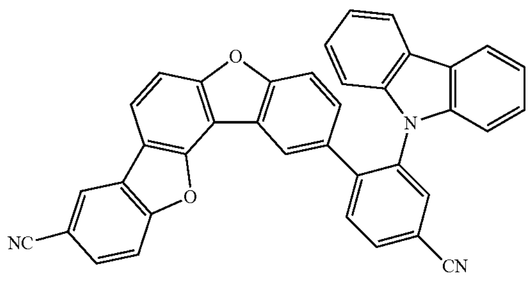
151
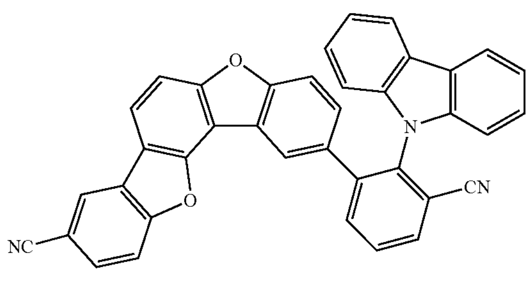
152
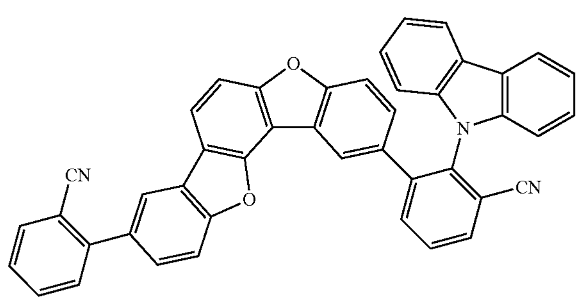
153
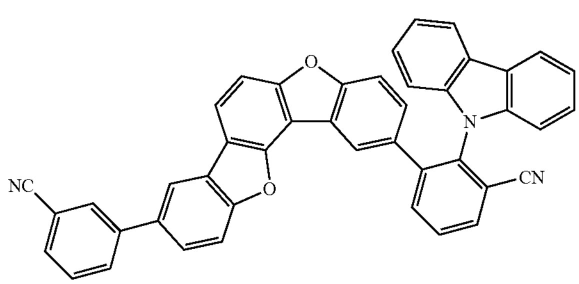
154
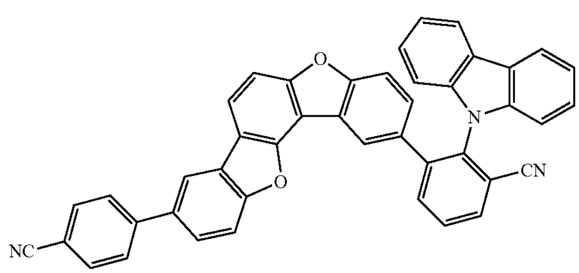
155
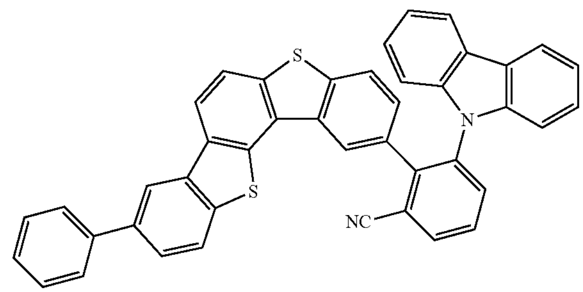
156
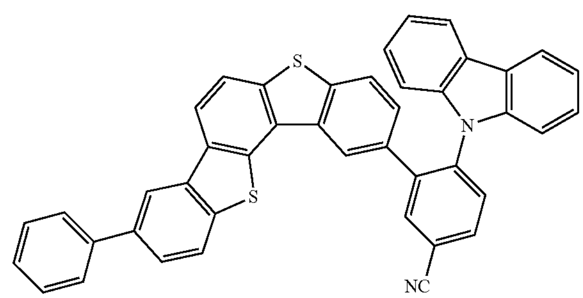
157
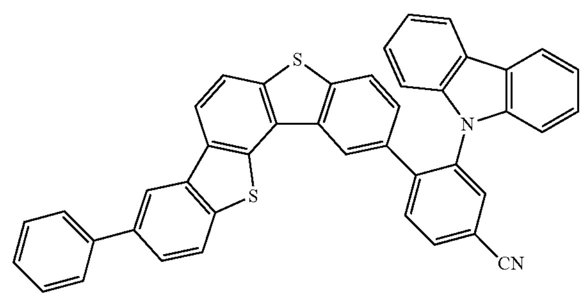
158
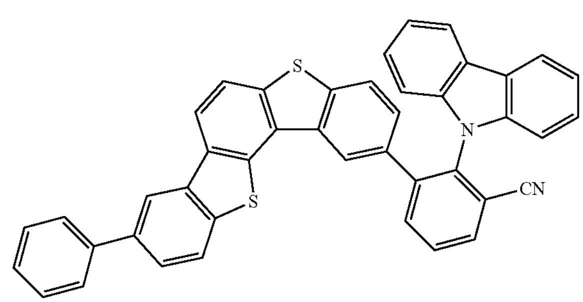
159
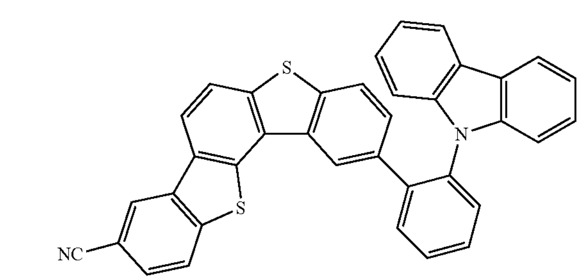

160
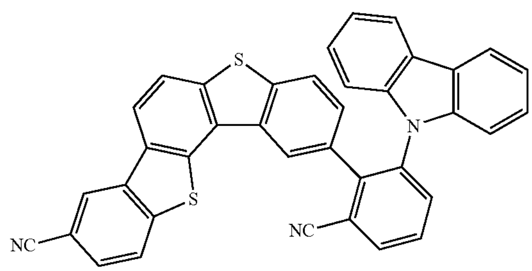
161
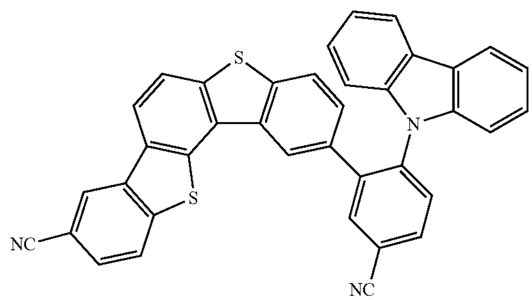
162
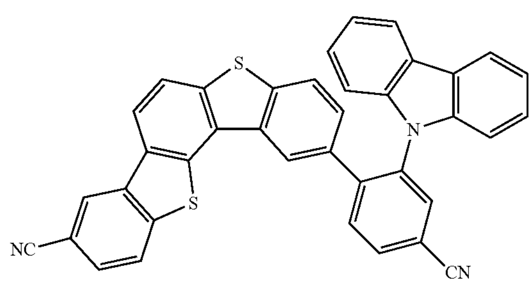
163
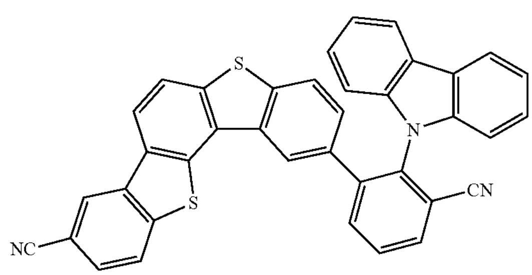
164
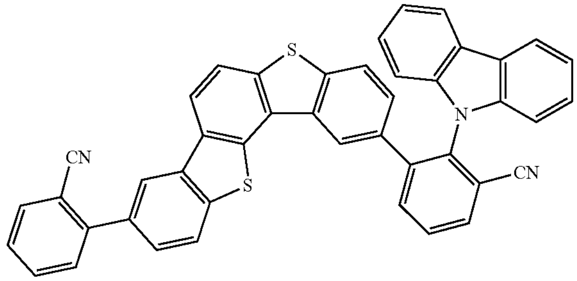
165
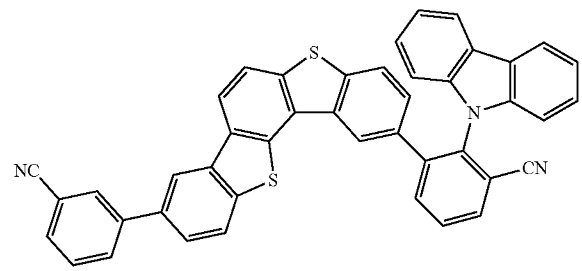
166
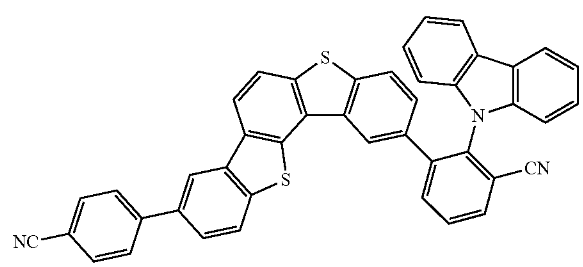
167
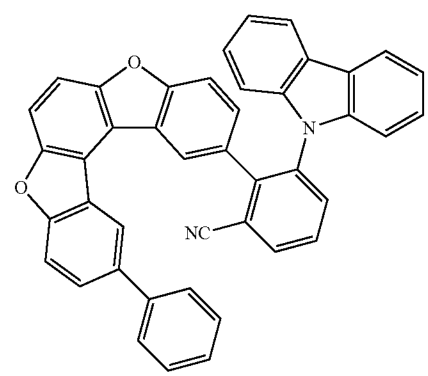
168
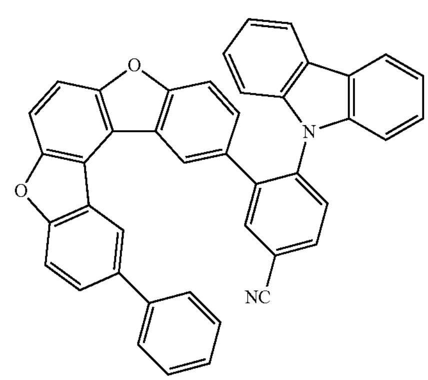

-continued
169
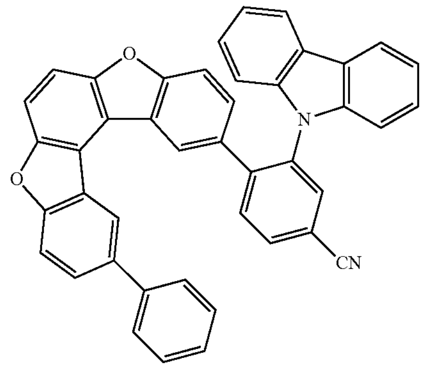
170
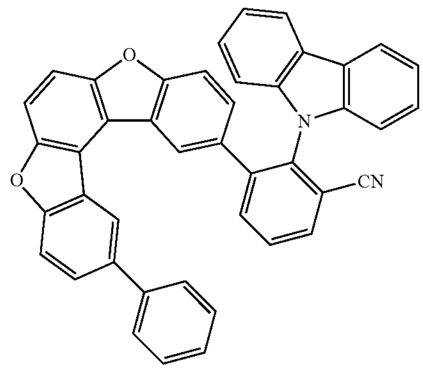
171
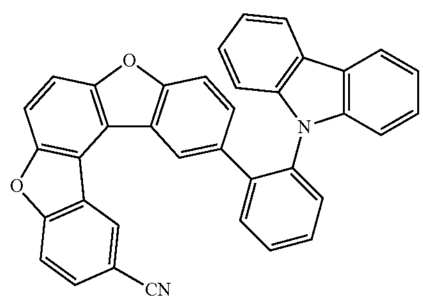
172
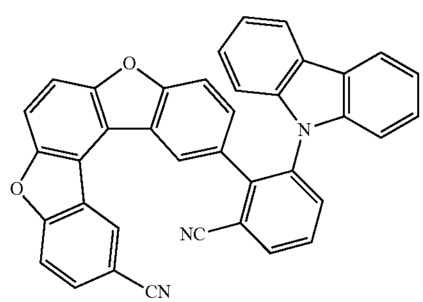
173
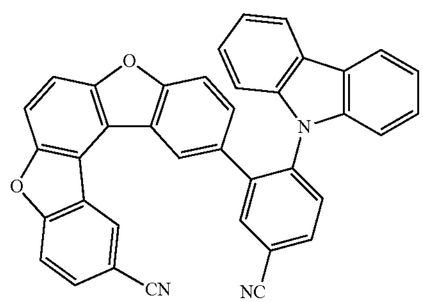
-continued
174
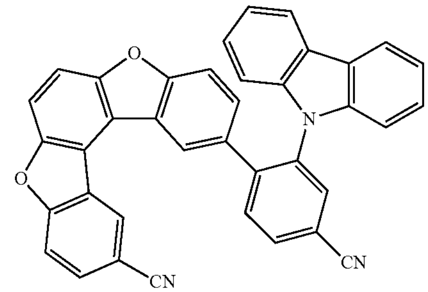
175
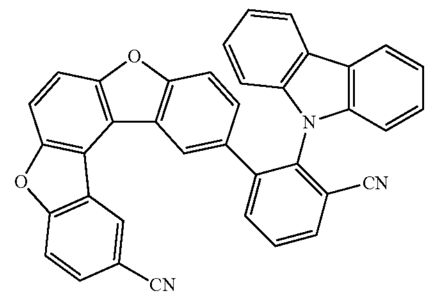
176
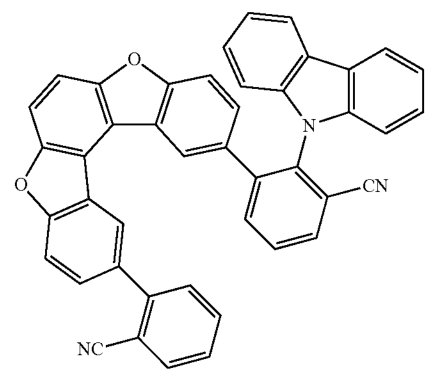
177
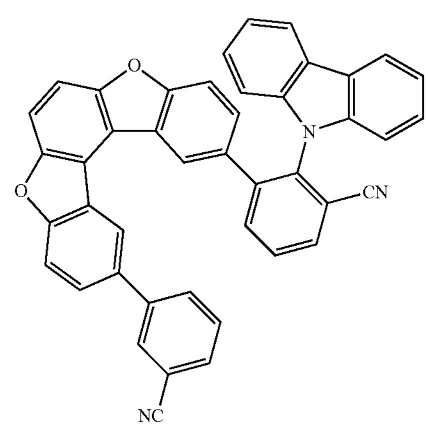

-continued
178
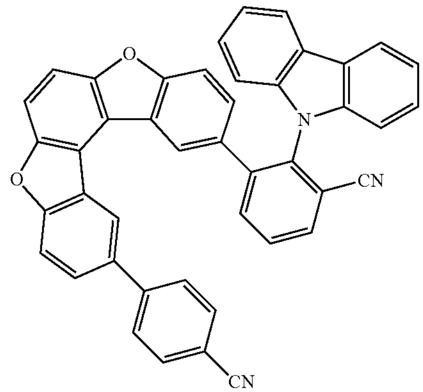
179
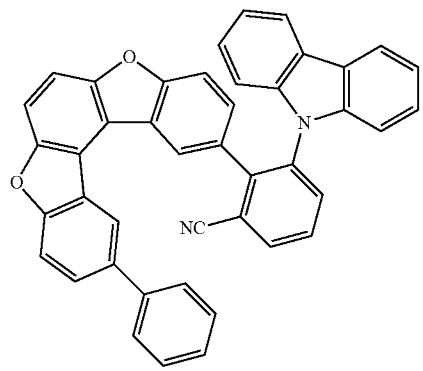
180
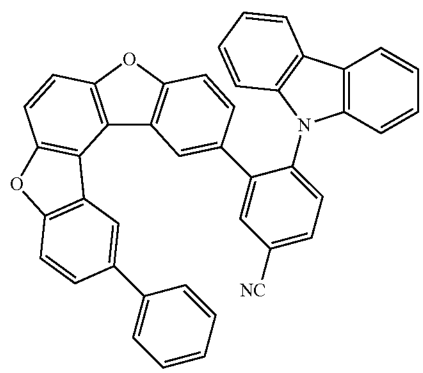
181
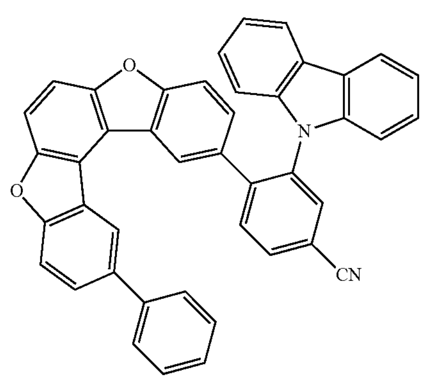
-continued
182
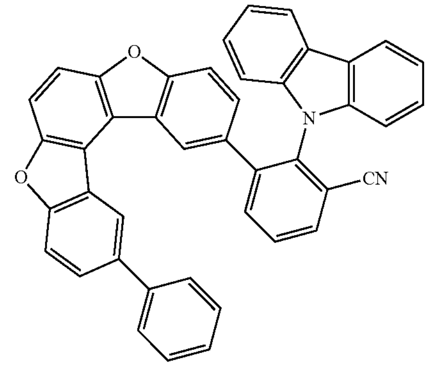
183
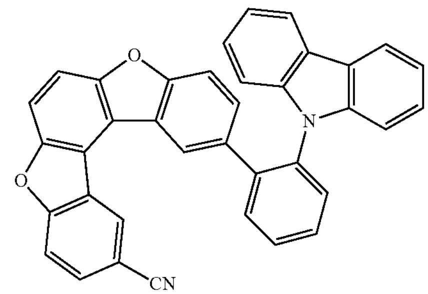
184
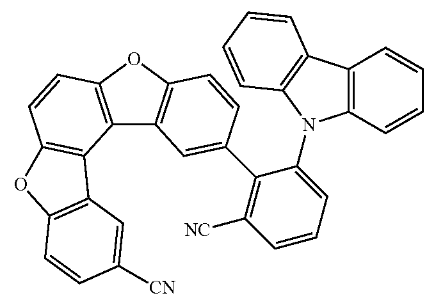
185
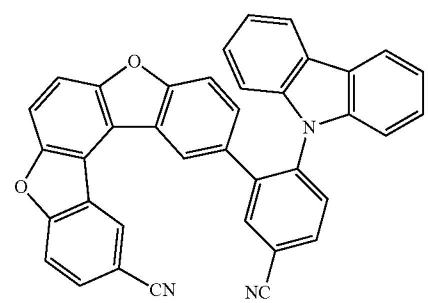
186
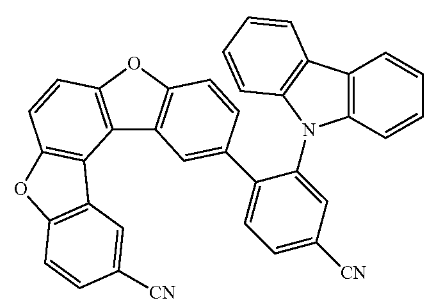

-continued
187
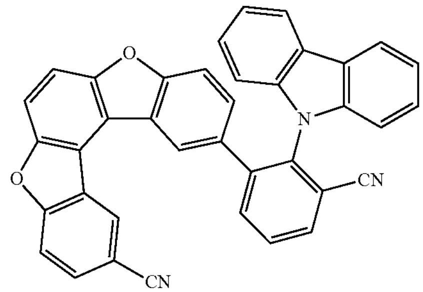
188
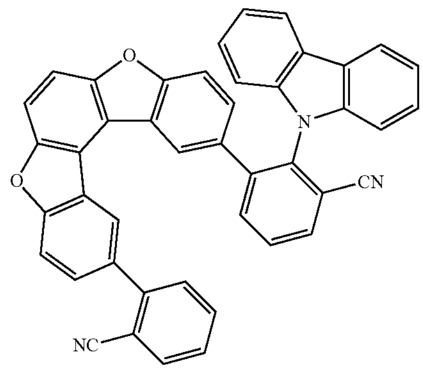
189
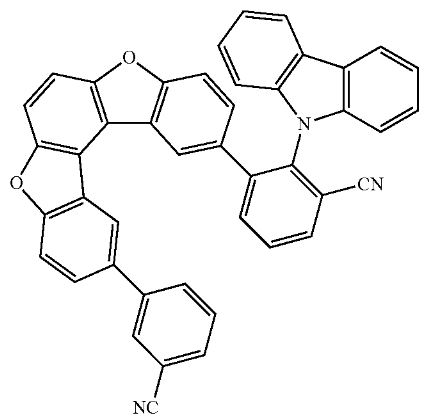
190
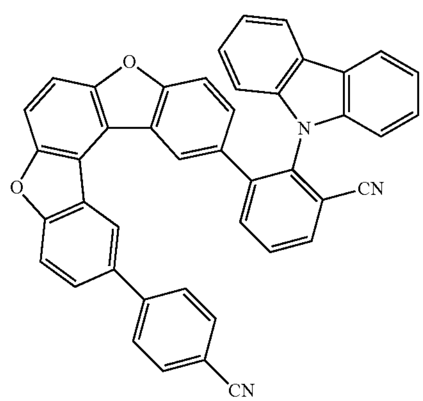
-continued
191
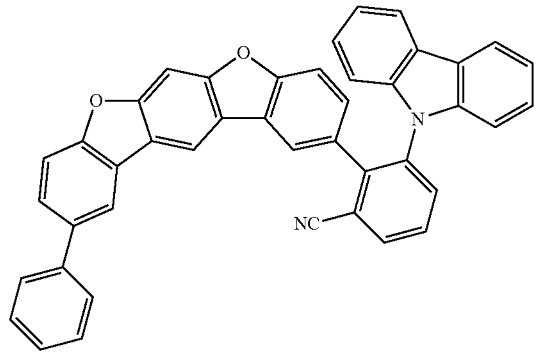
192
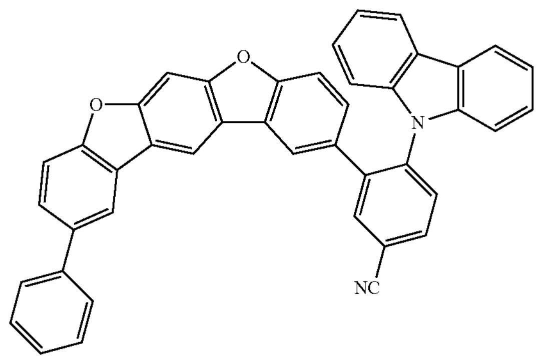
193
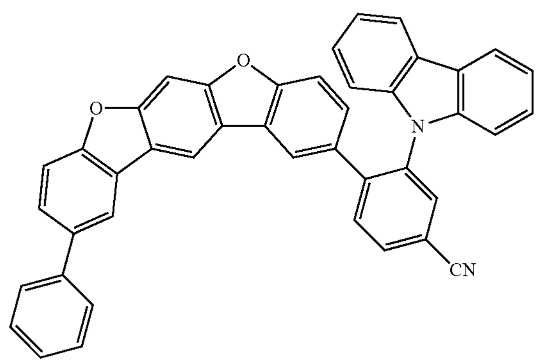
194
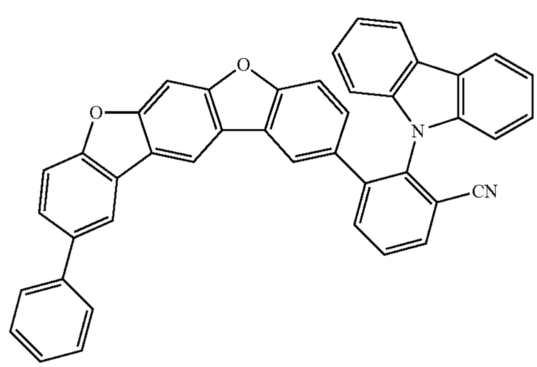

195
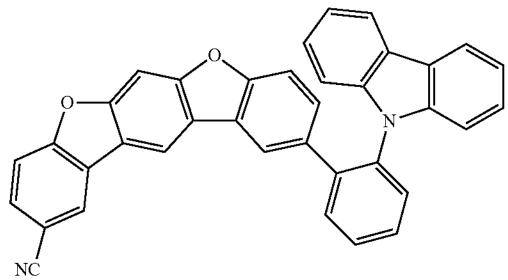
196
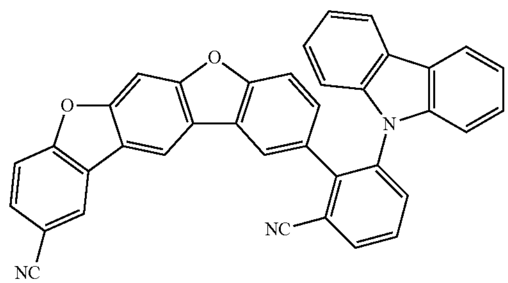
197
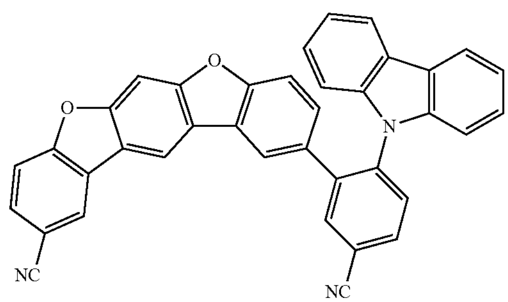
198
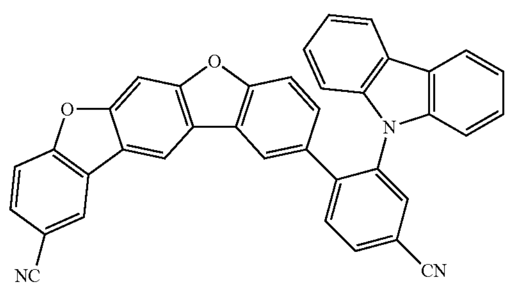
199
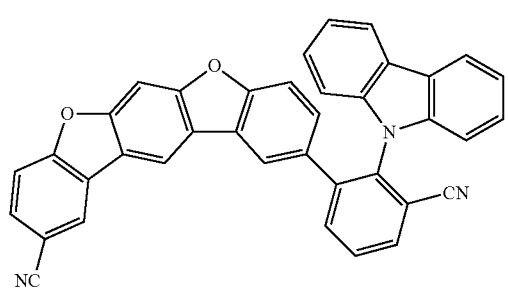
200
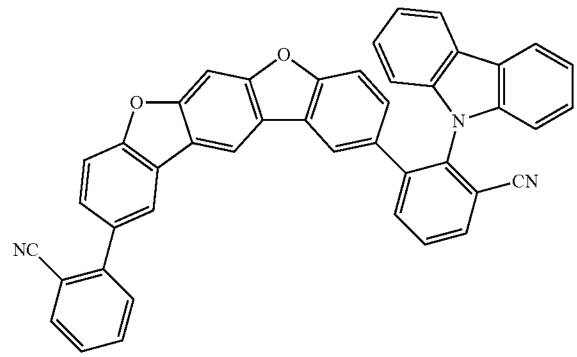
201
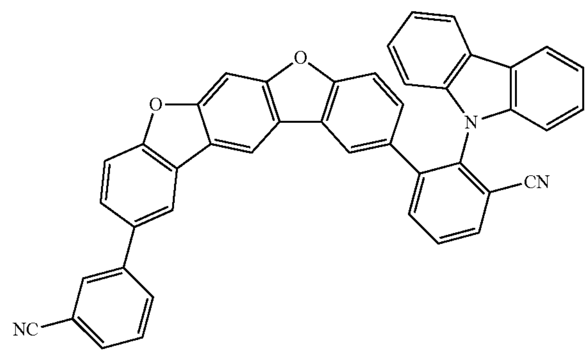
202
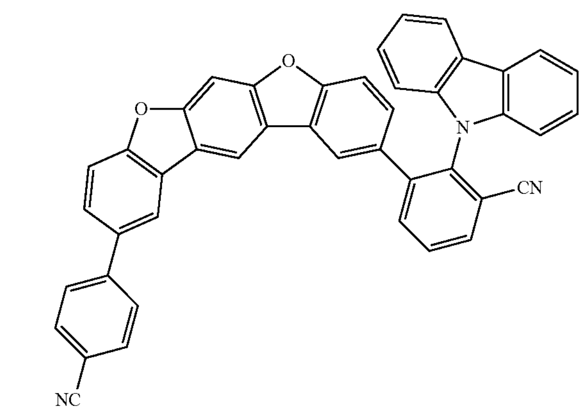
203
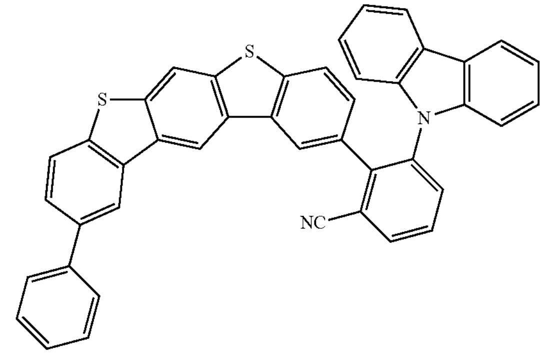

-continued
204
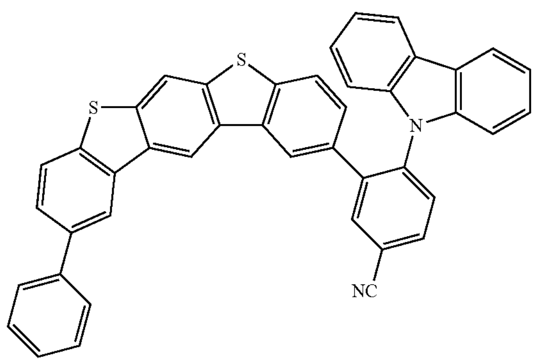
205
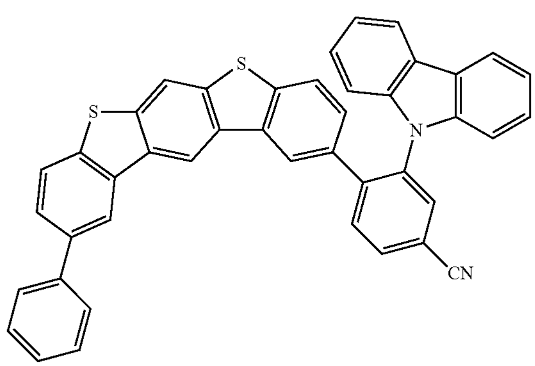
206
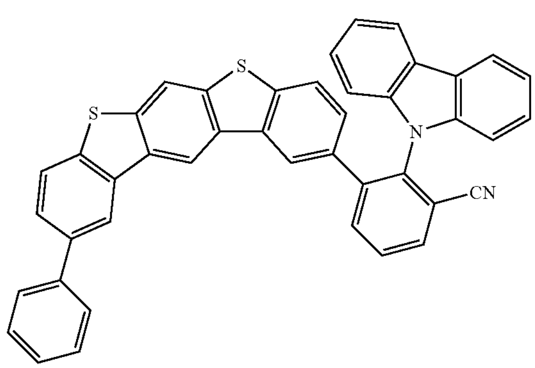
207
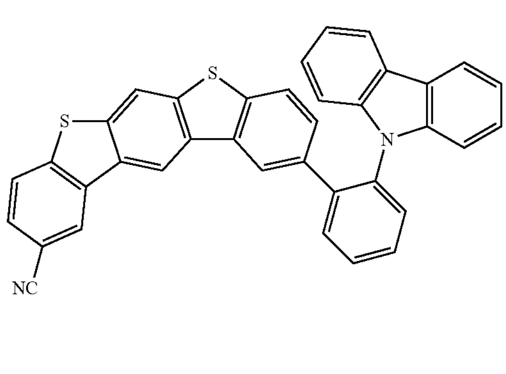
-continued
208
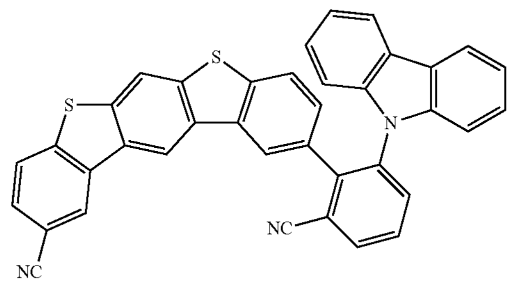
209
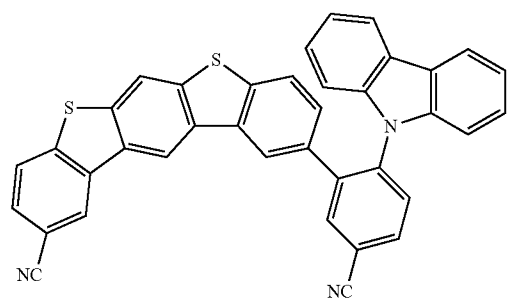
210
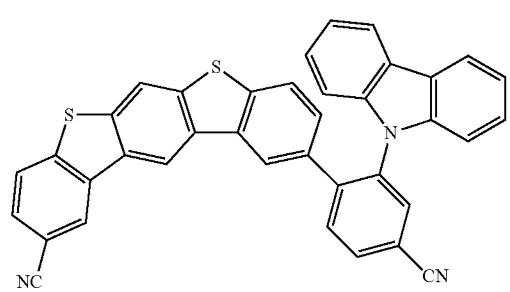
211
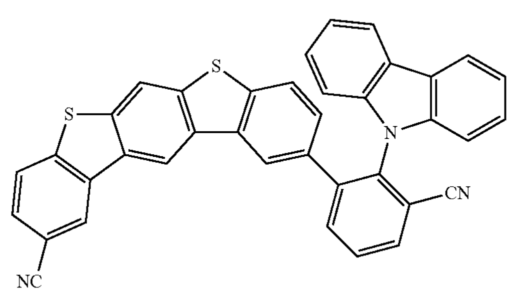
212
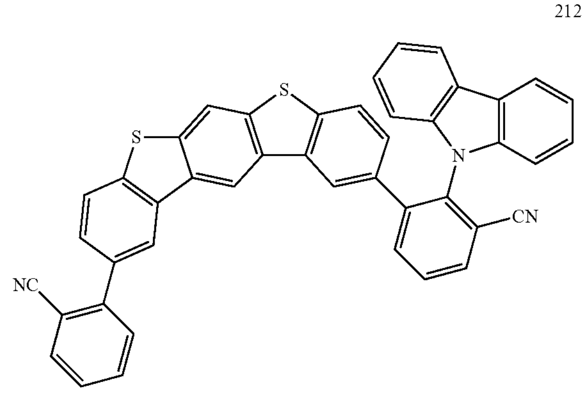

-continued
213
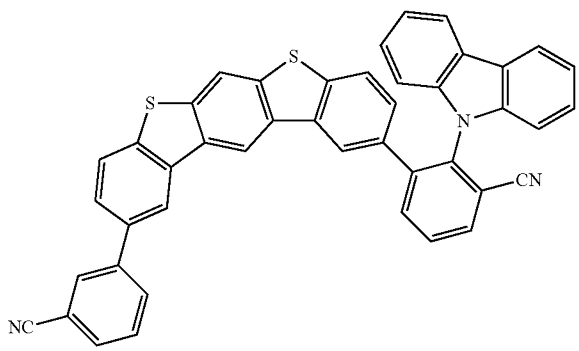
214
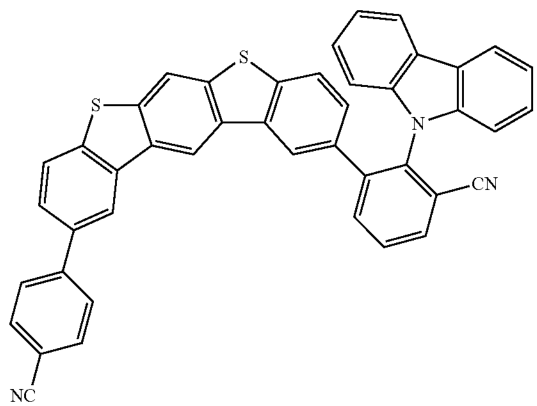
215
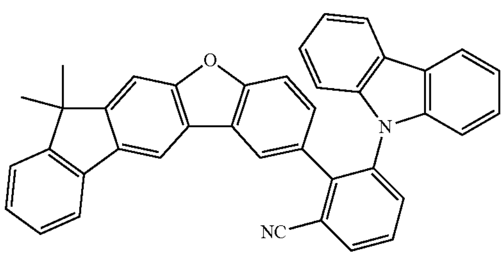
216
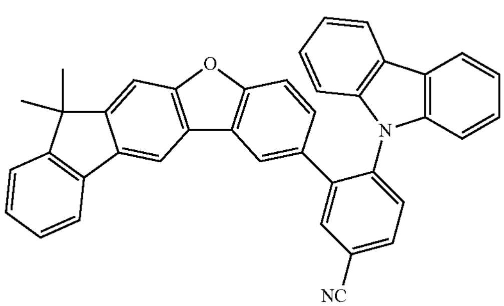
-continued
217
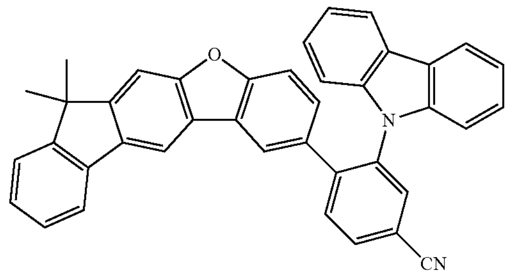
218
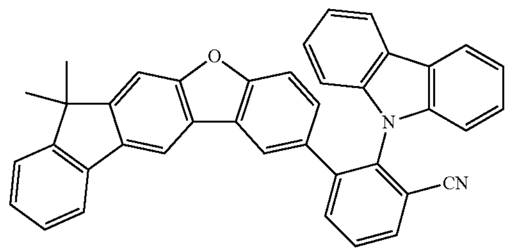
219
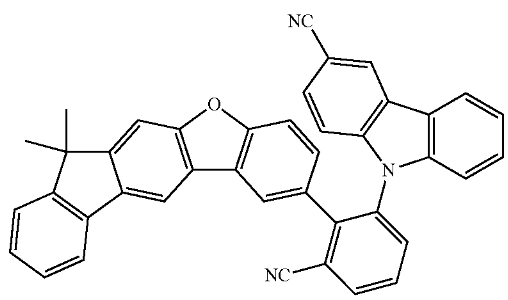
220
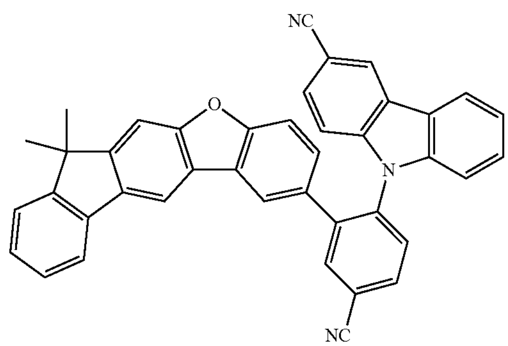
221
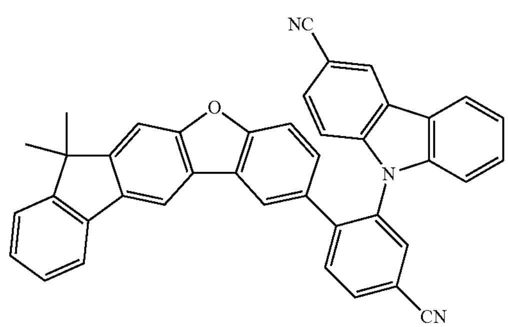

-continued
222
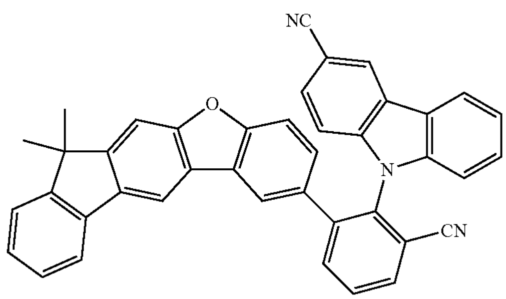
223
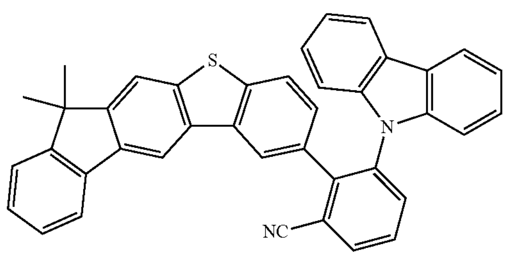
224
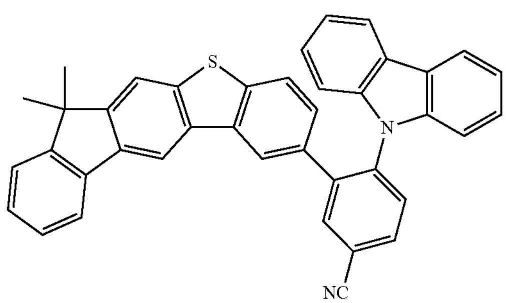
225
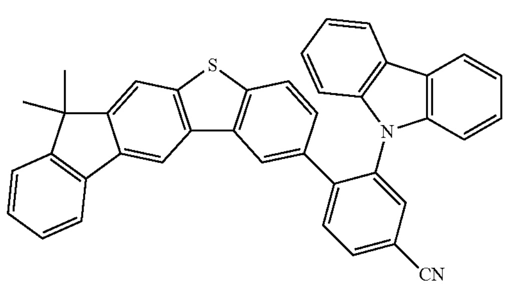
226
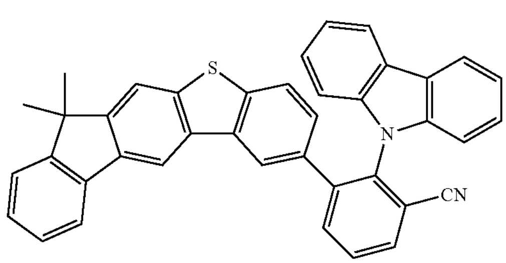
-continued
227
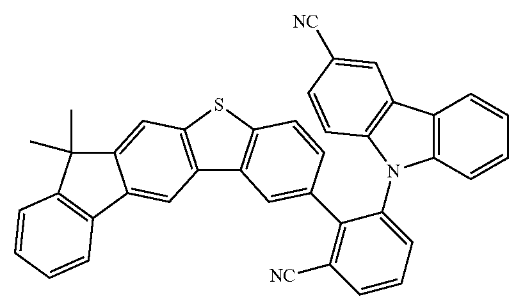
228
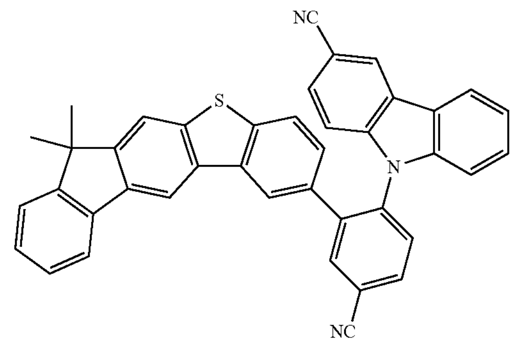
229
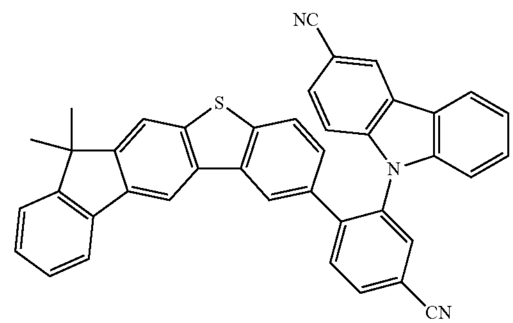
230
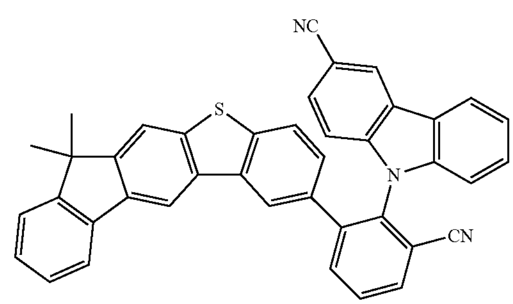
231
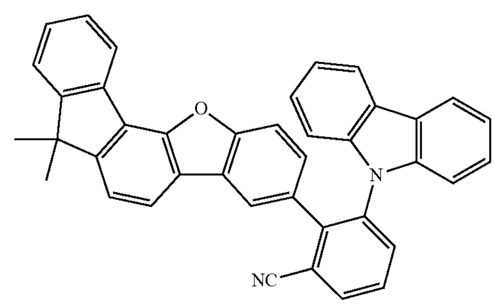

-continued
232
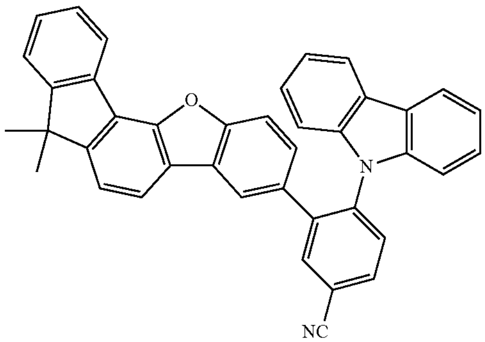
233
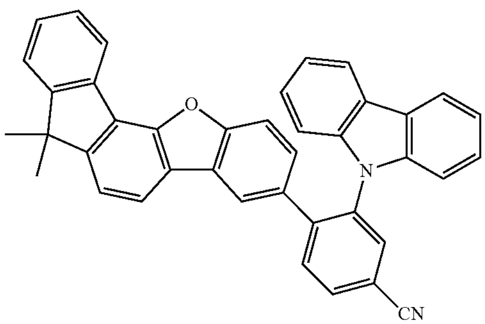
234
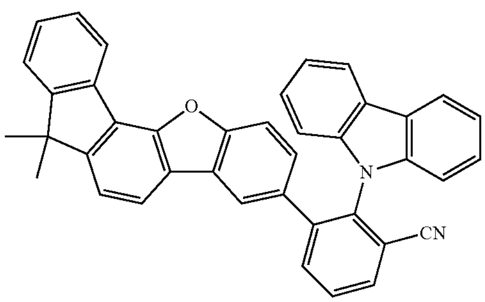
235
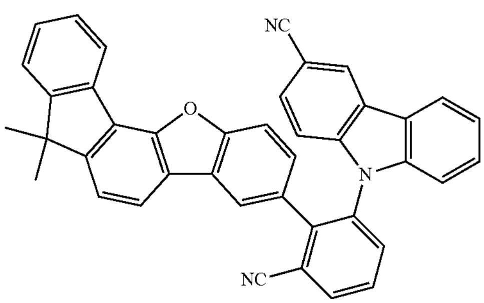
236
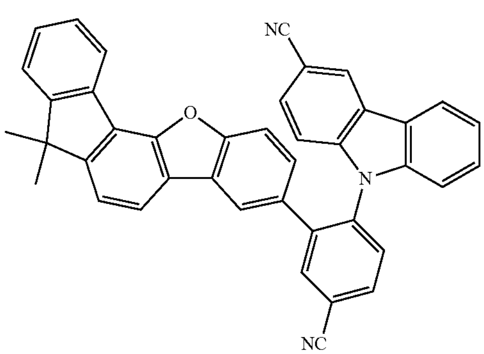
-continued
237
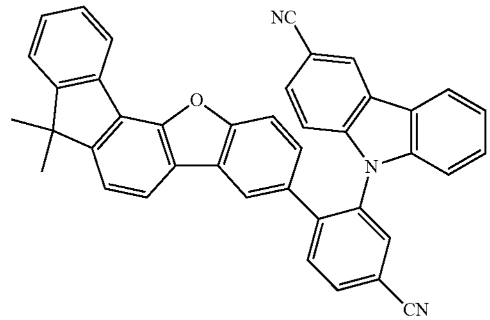
238
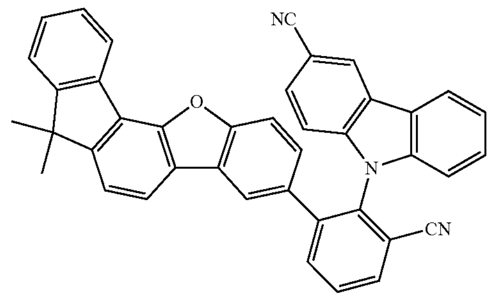
239
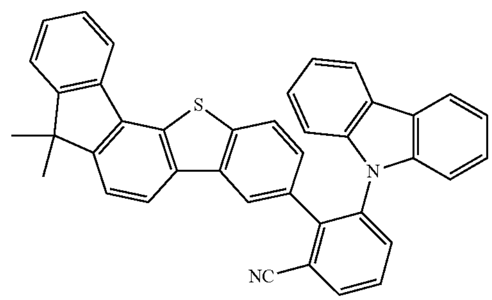
240
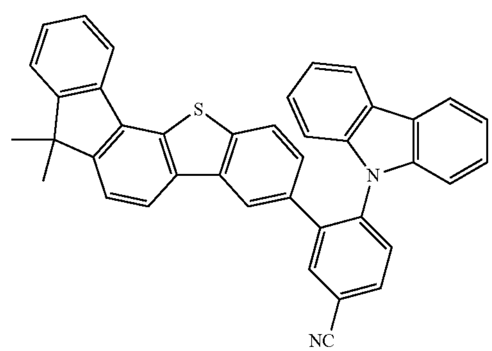
241
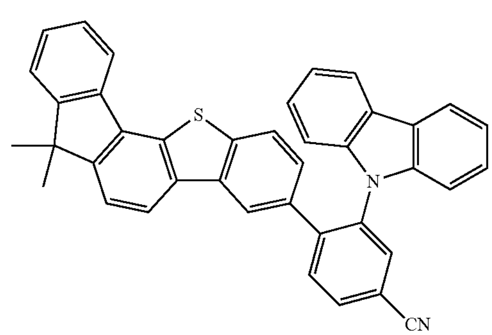

242
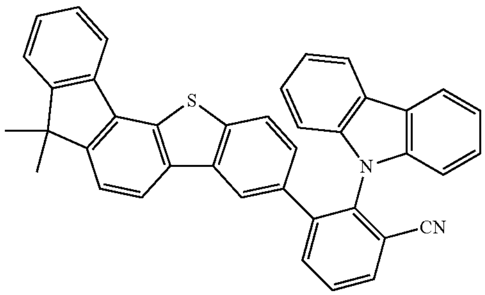
243
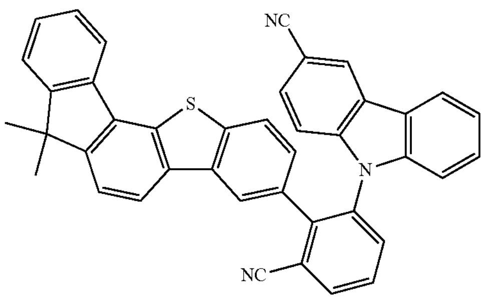
244
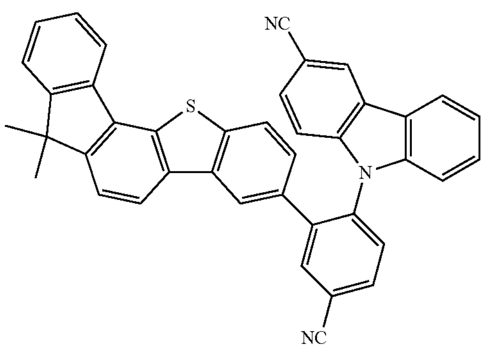
245
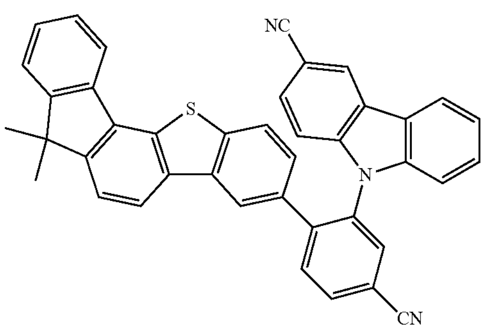
246
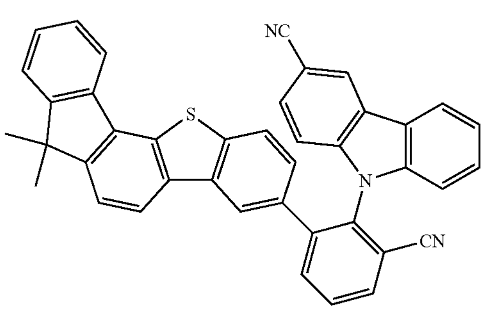
247
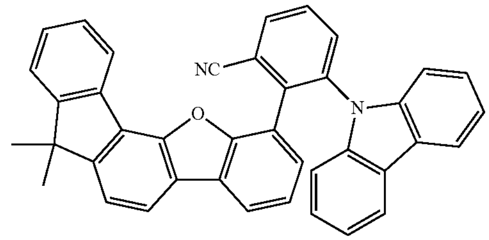
248
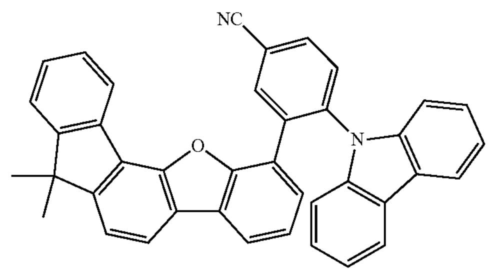
249
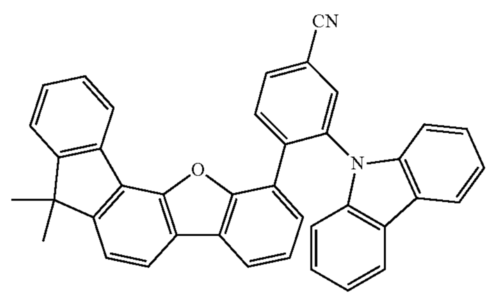
250
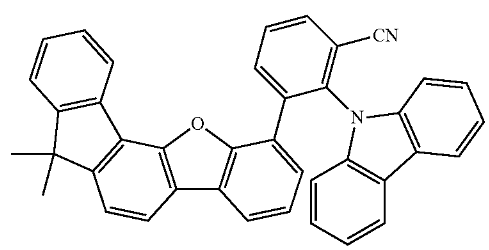
251
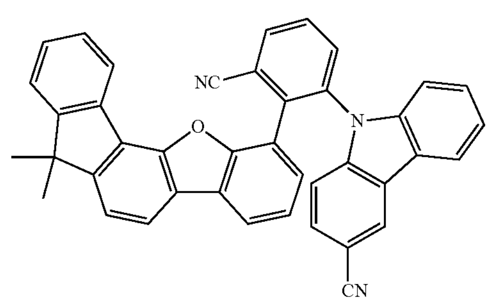

-continued
252
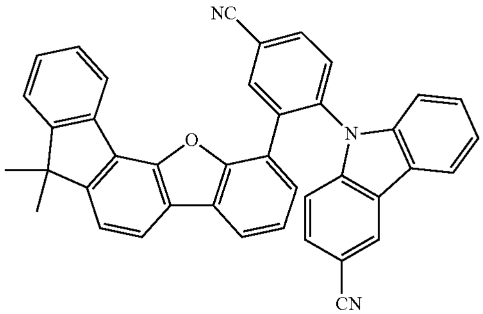
253
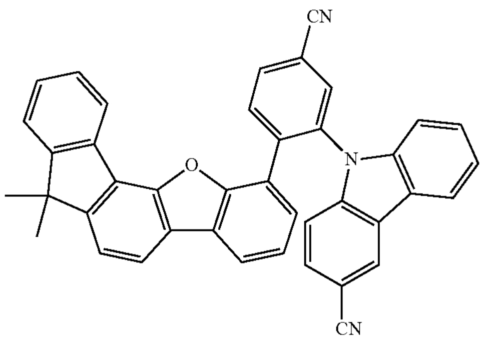
254
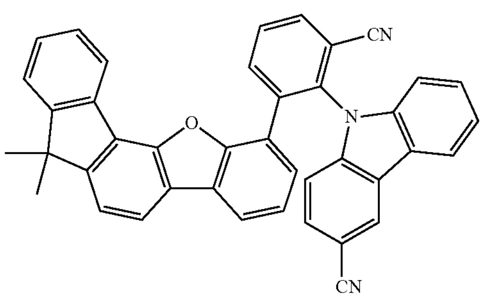
255
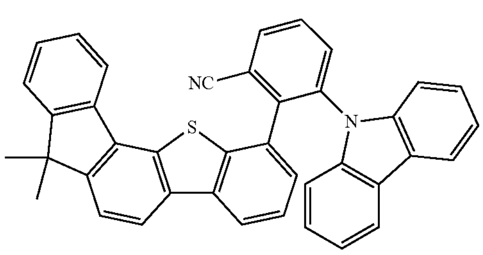
256
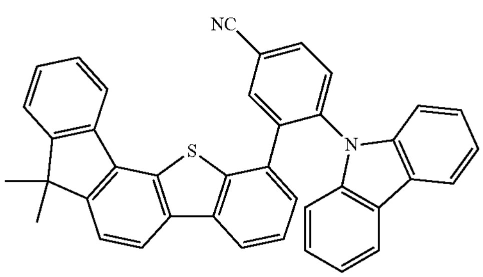
-continued
257
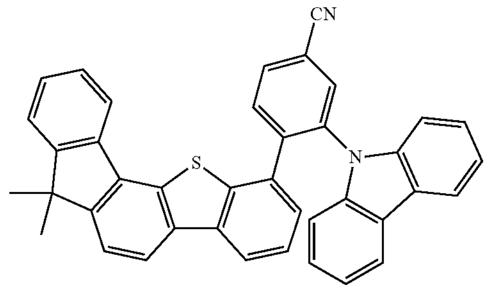
258
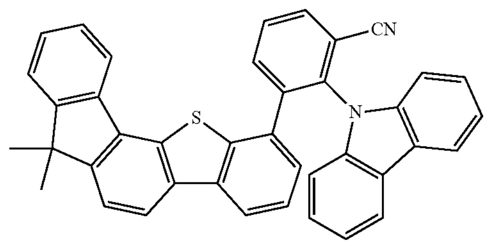
259
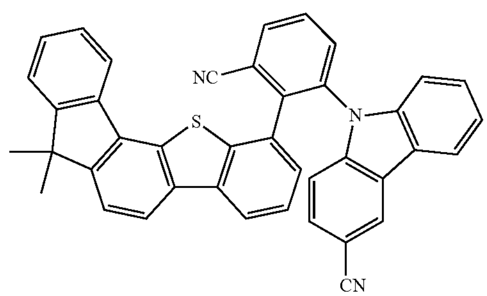
260
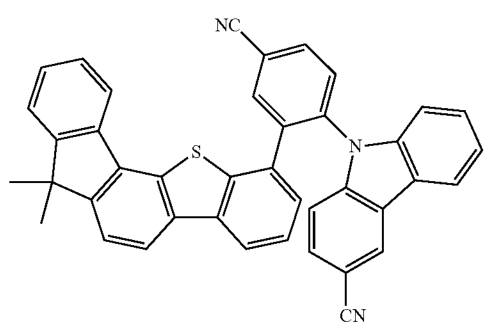
261
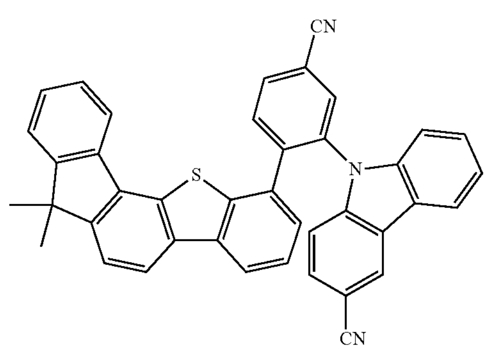

-continued
262
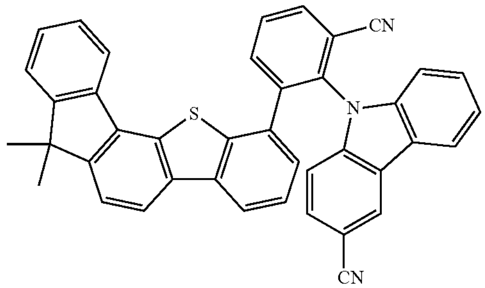
263
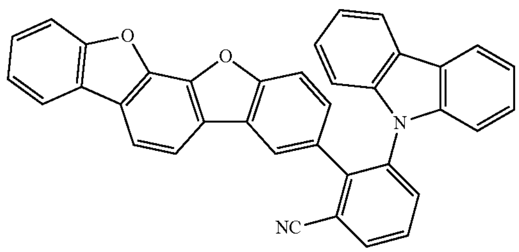
264
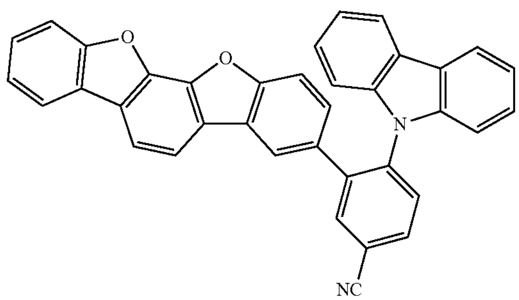
265
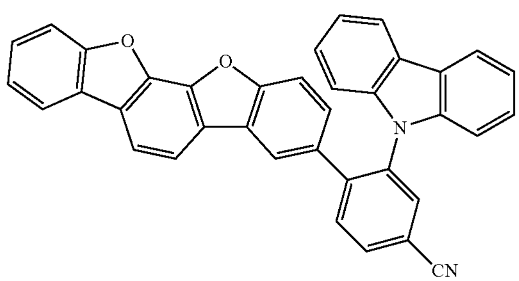
266
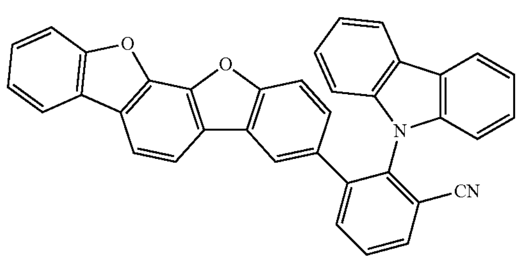
-continued
267
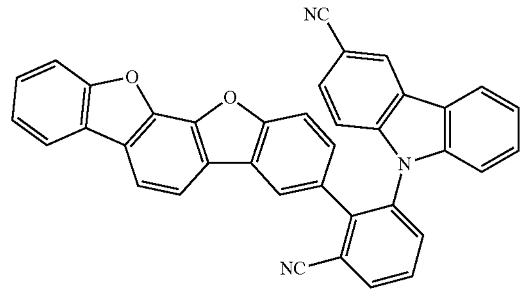
268
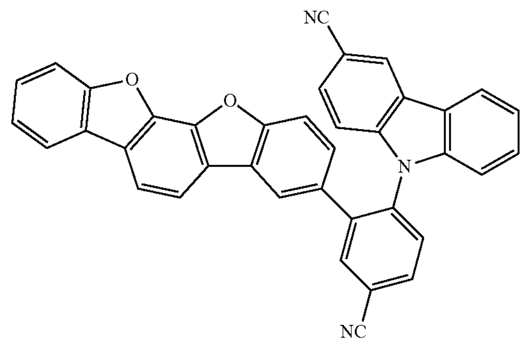
269
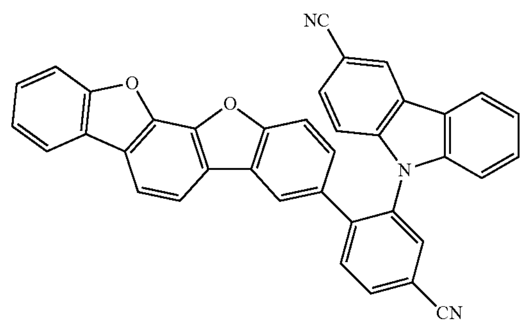
270
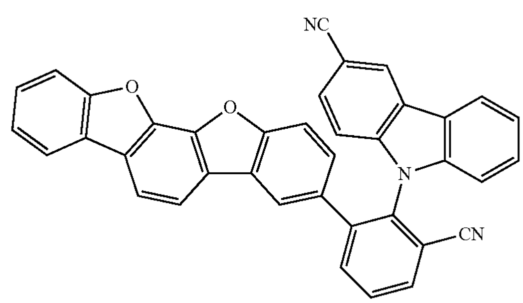
271
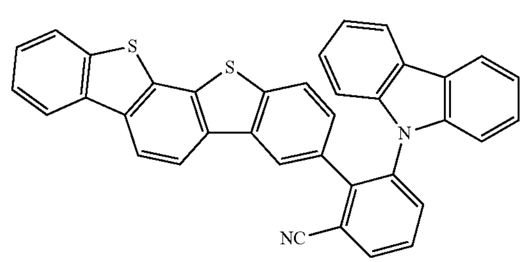

-continued
272
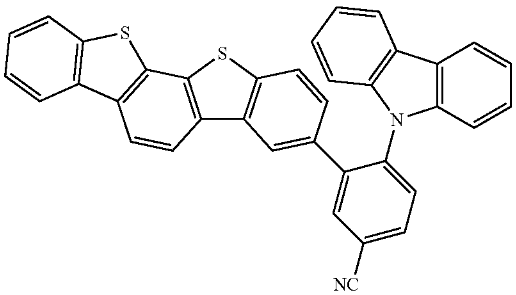
273
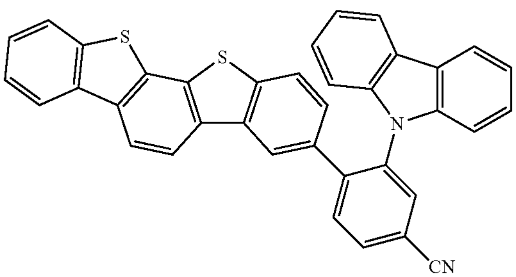
274
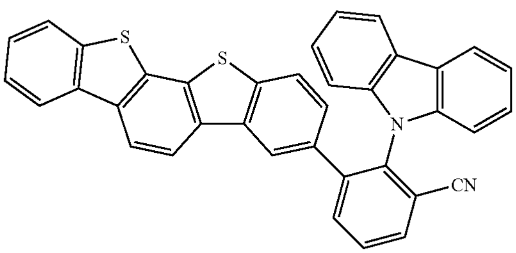
275
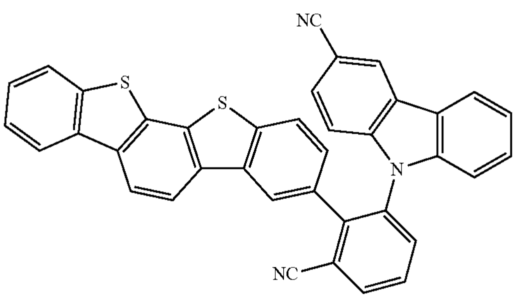
276
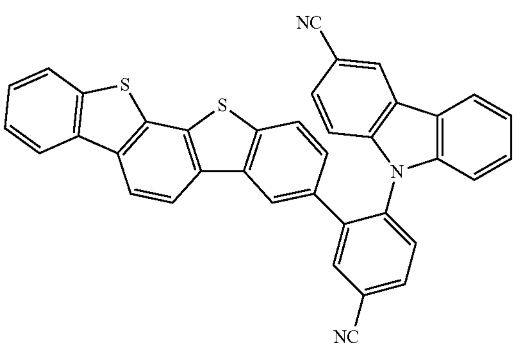
-continued
277
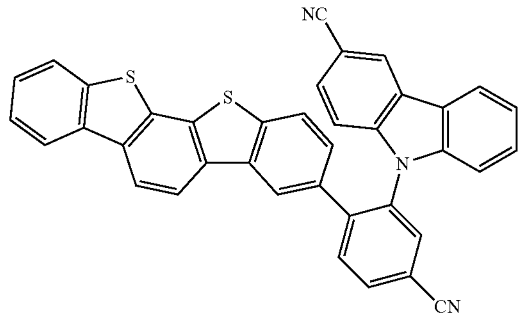
278
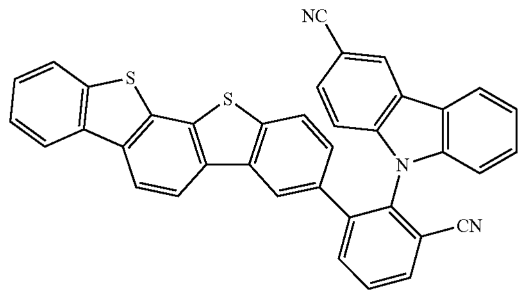
279
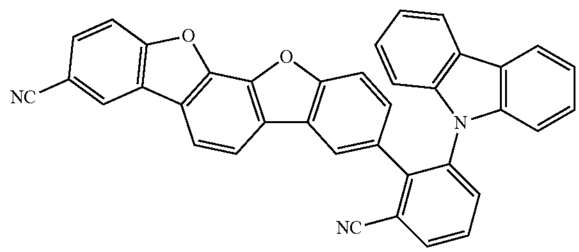
280
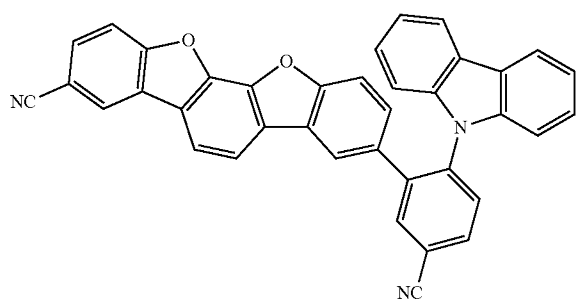
281
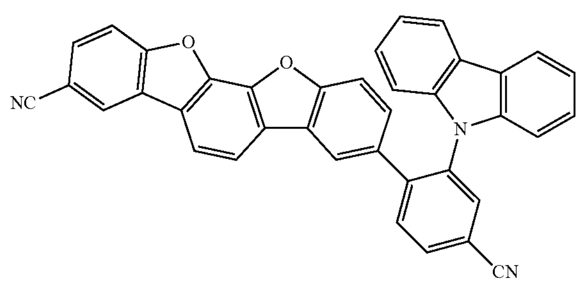

-continued
282
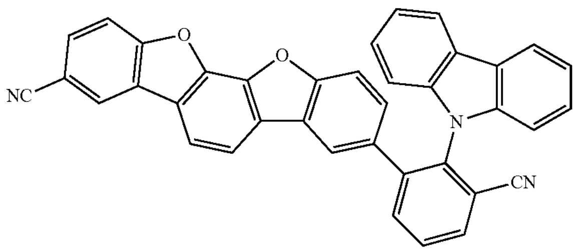
283
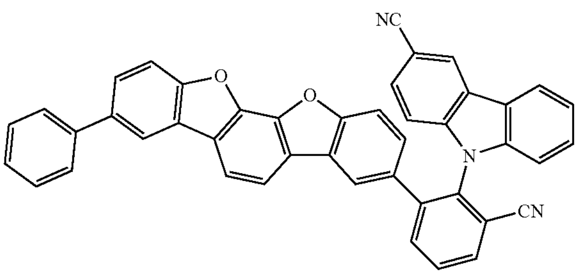
284
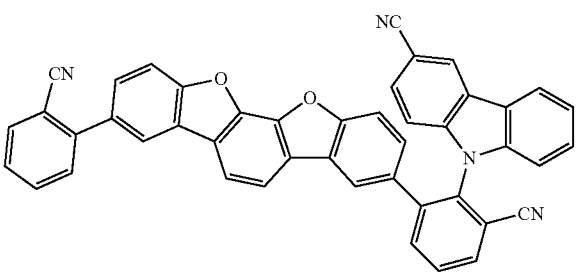
285
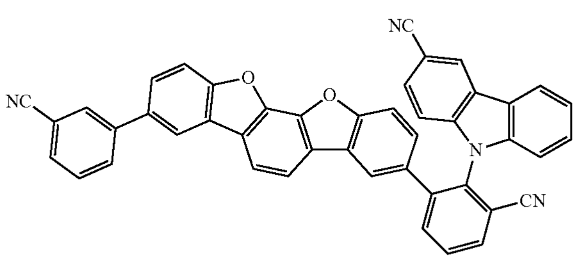
286
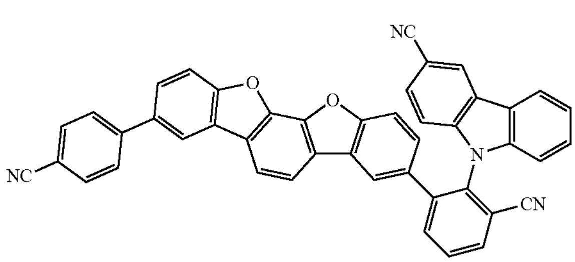
-continued
287
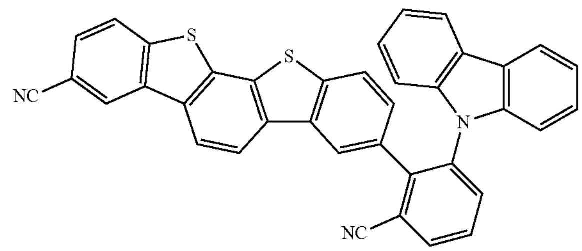
288
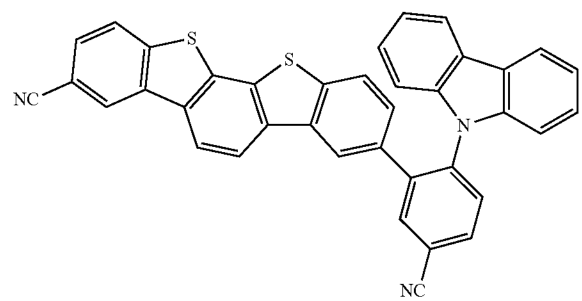
289
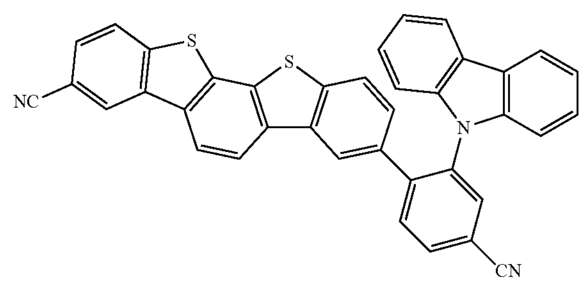
290
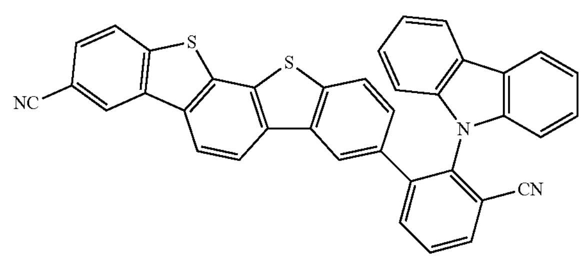
291
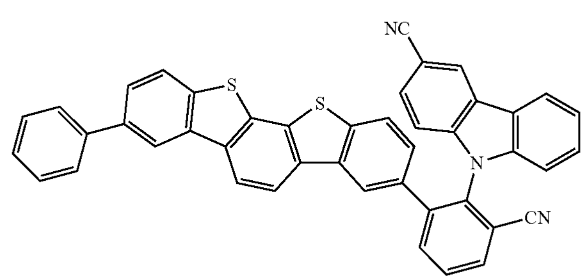

-continued
292
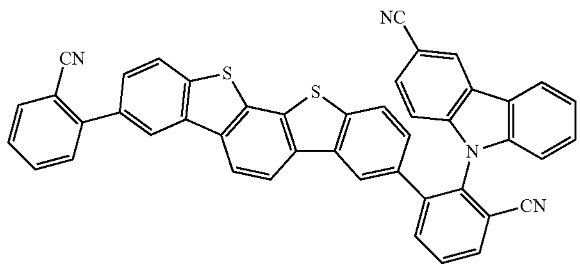
293
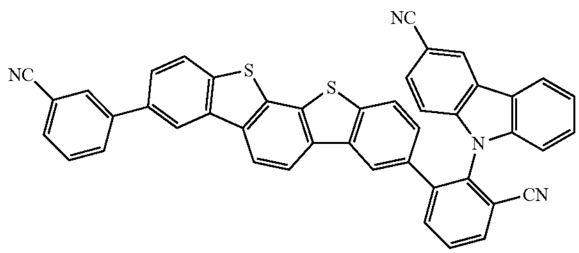
294
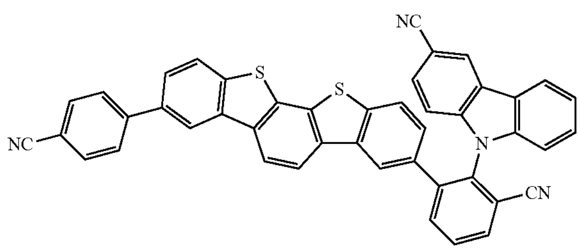
295
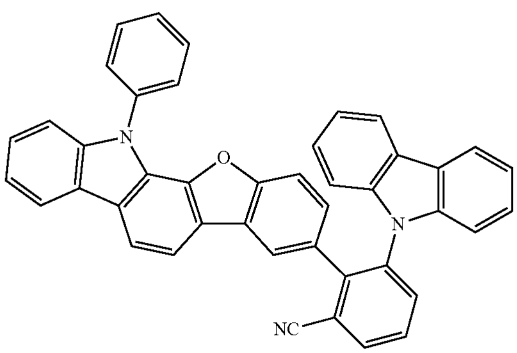
296
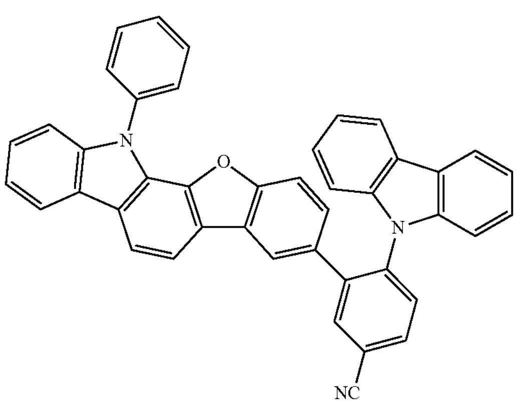
-continued
297
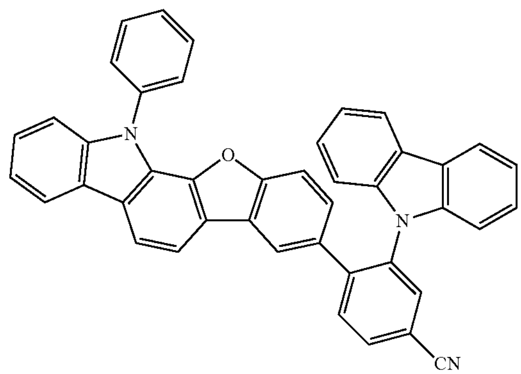
298
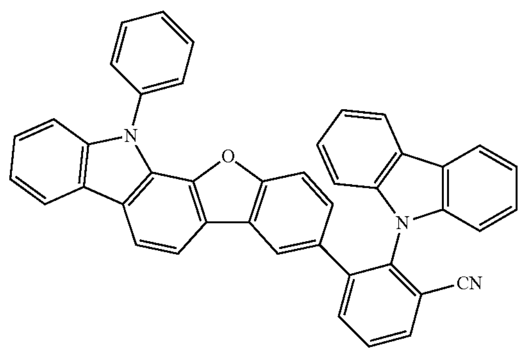
299
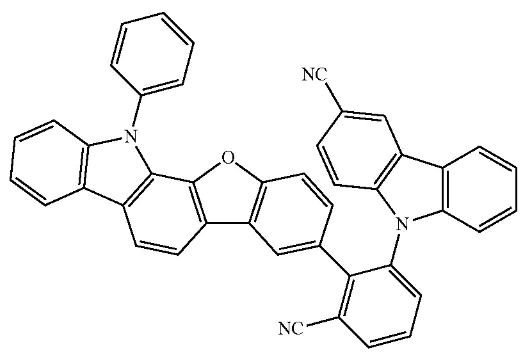
300
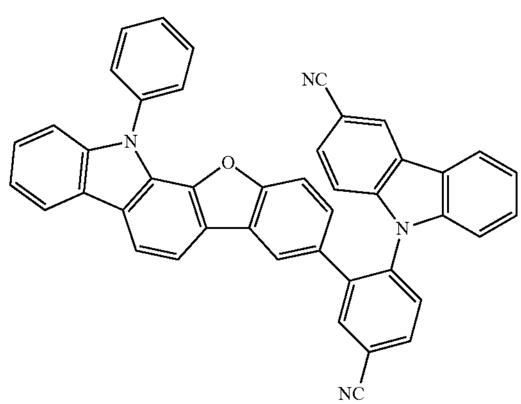

-continued
301
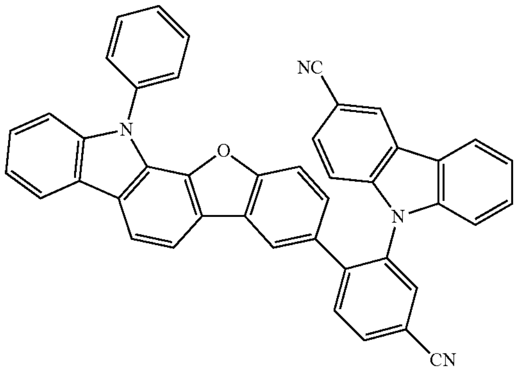
302
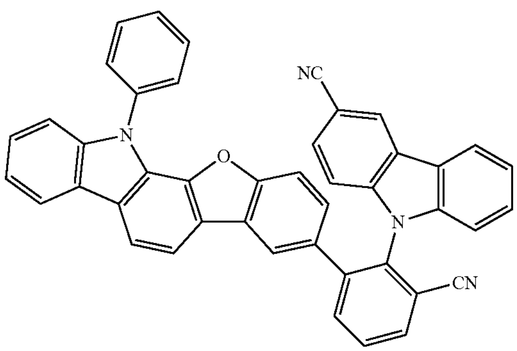
303
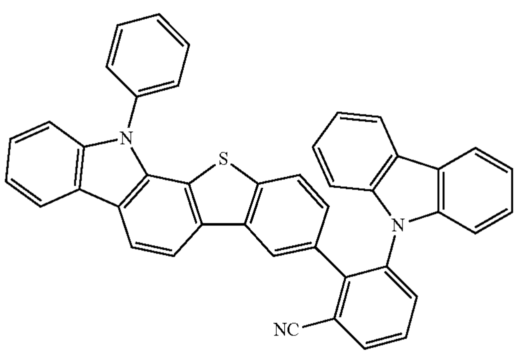
304
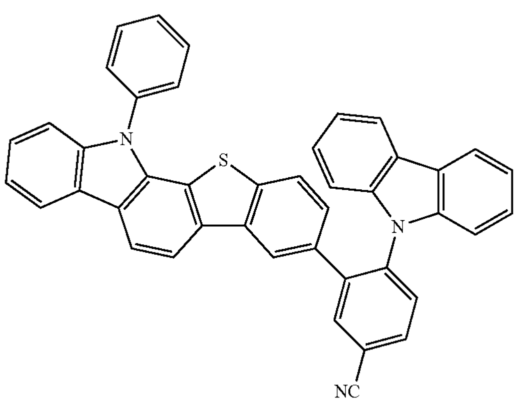
-continued
305
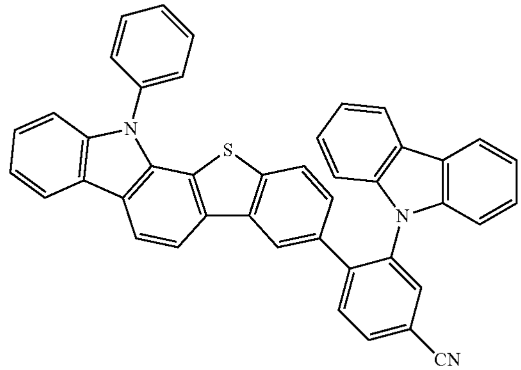
306
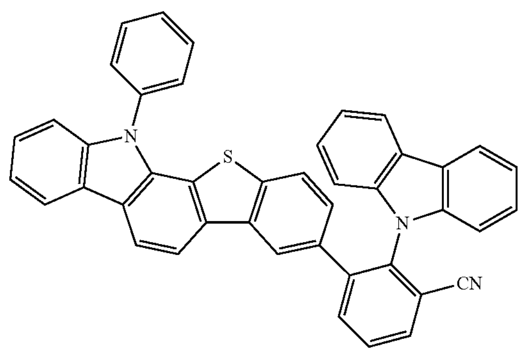
307
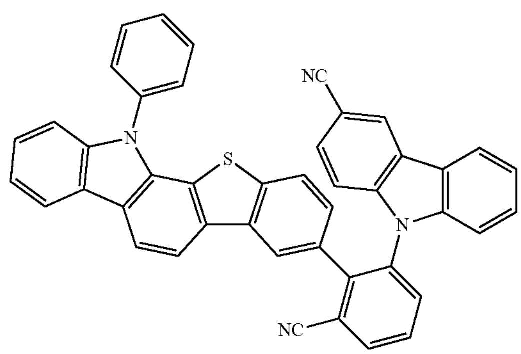
308
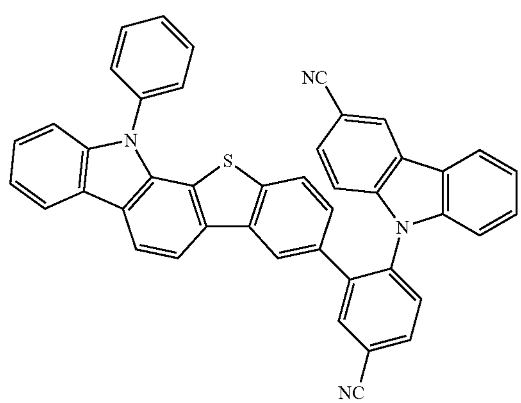

-continued
309
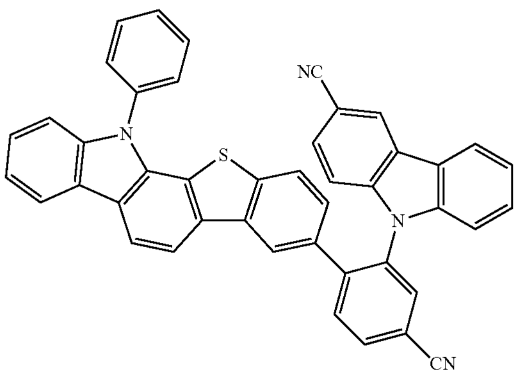
310
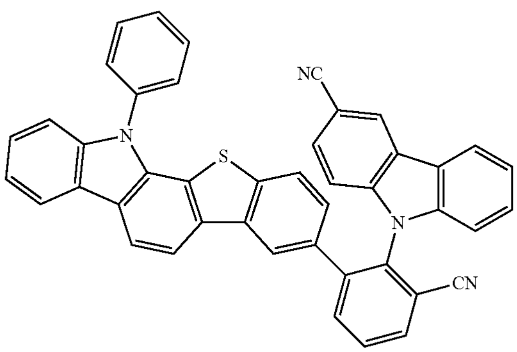
311
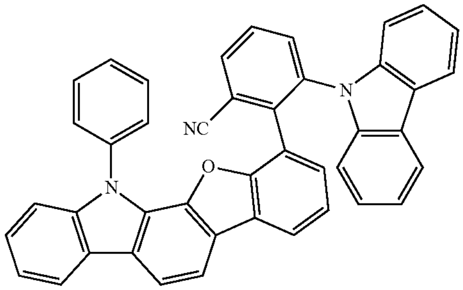
312
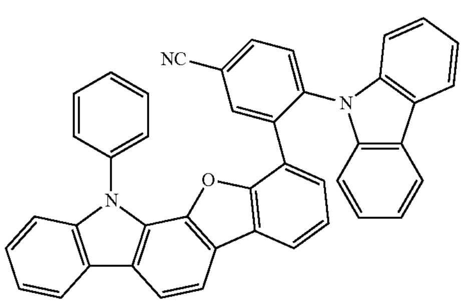
-continued
313
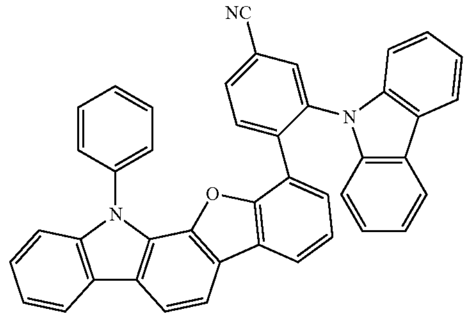
314
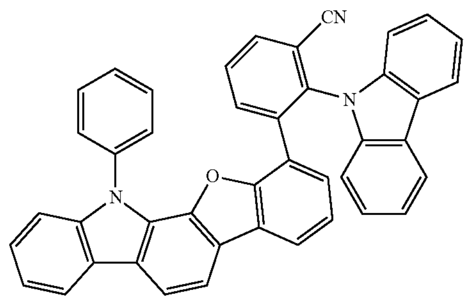
315
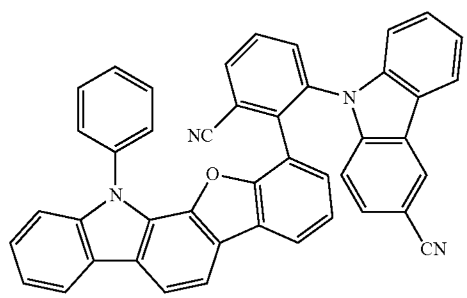
316
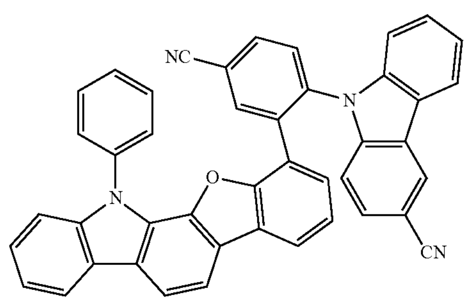
317
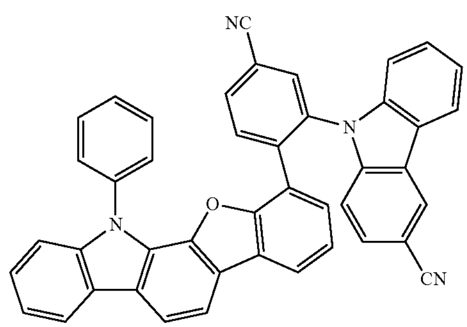

-continued
318
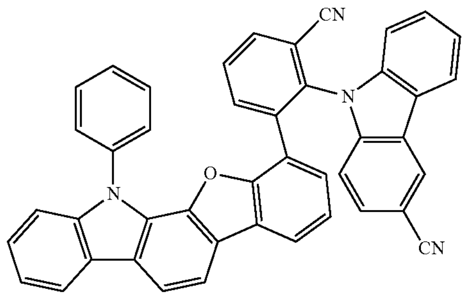
319
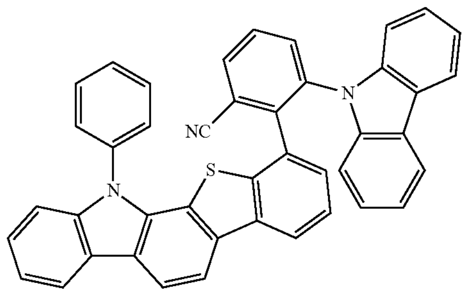
320
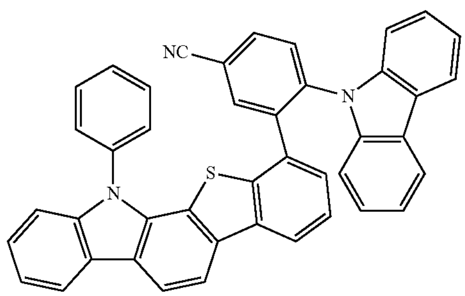
321
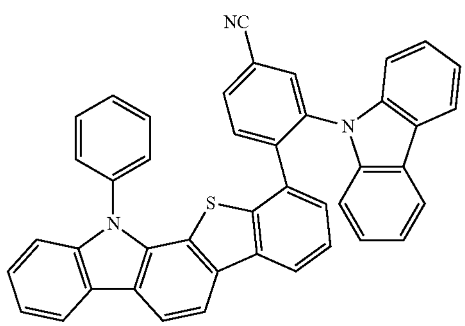
322
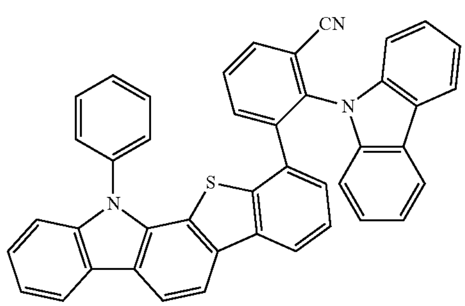
-continued
323
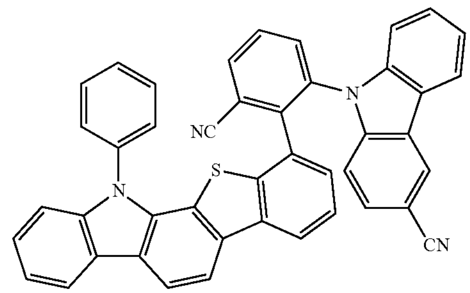
324
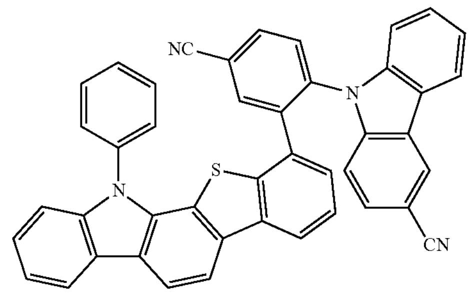
325
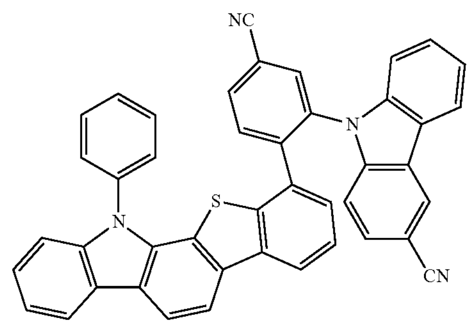
326
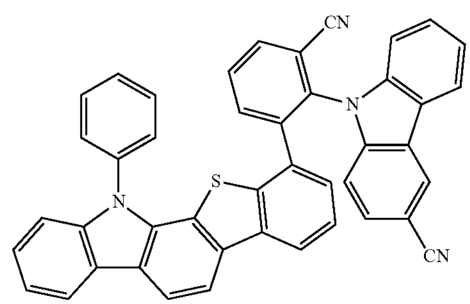
327
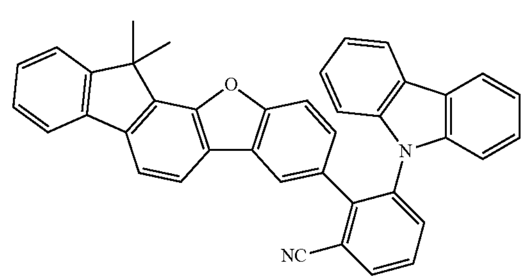

-continued
328
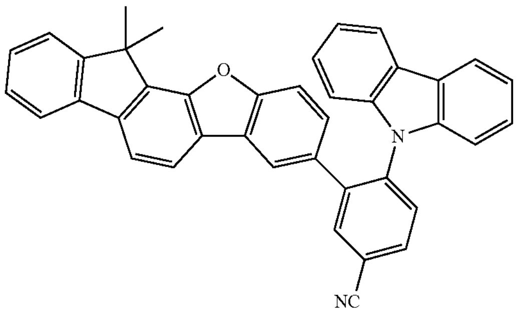
329
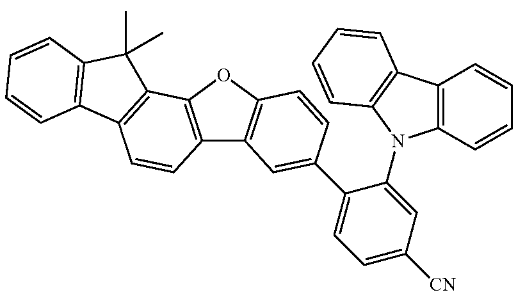
330
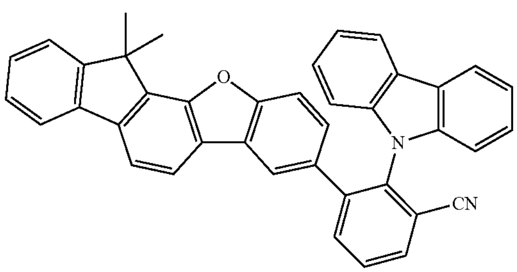
331
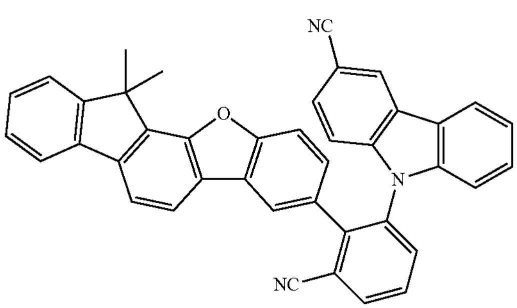
332
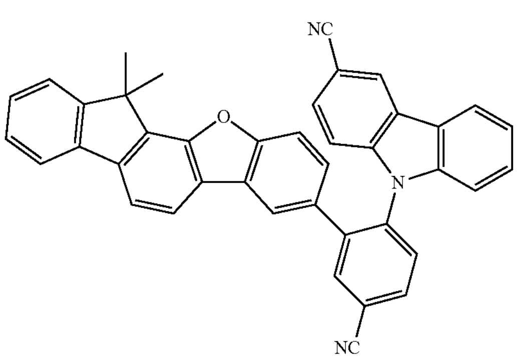
-continued
333
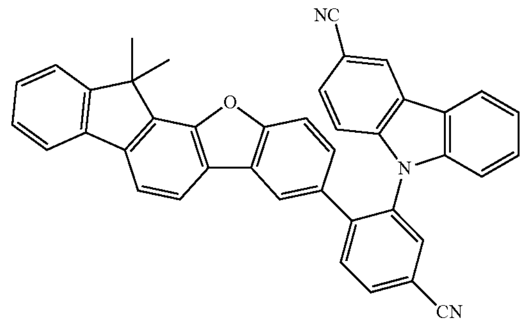
334
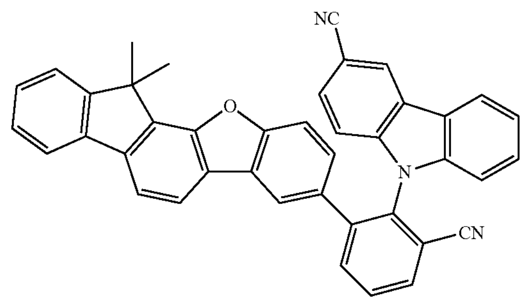
335
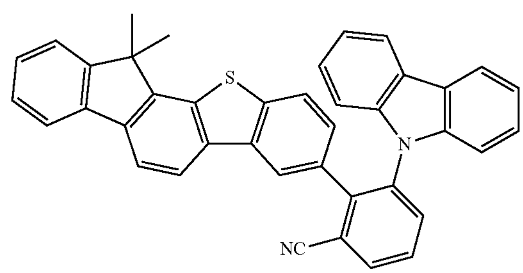
336
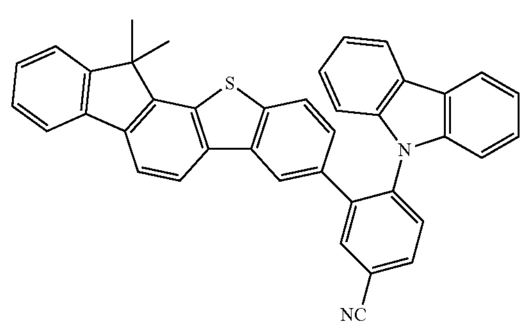
337
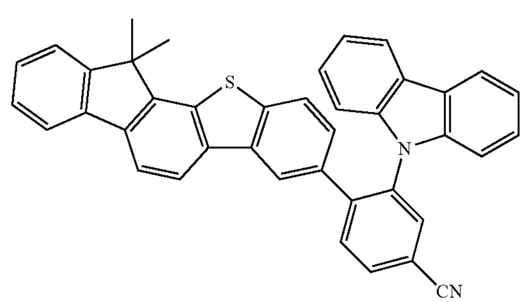

-continued
338
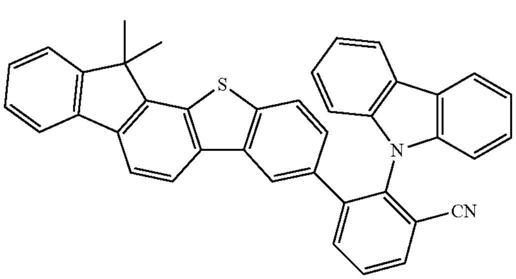
339
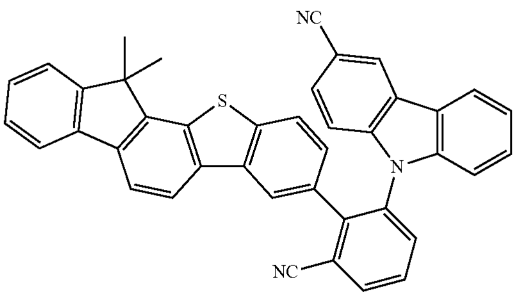
340
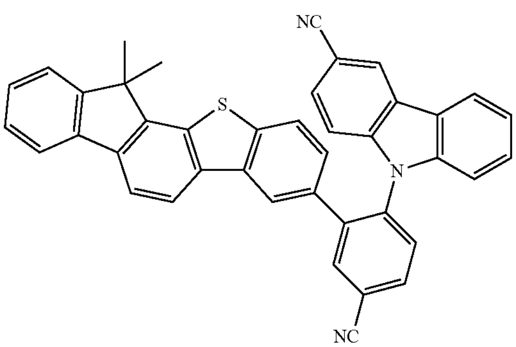
341
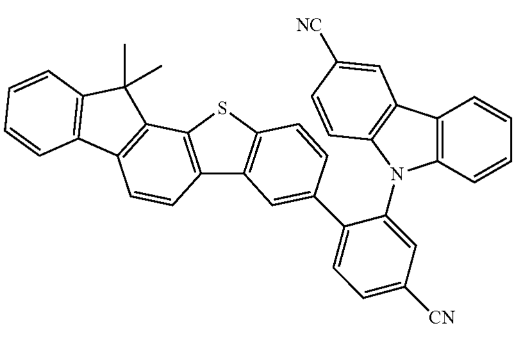
342
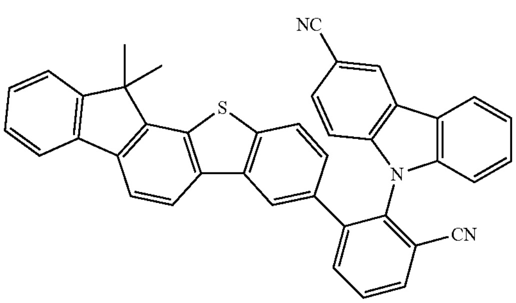
-continued
343
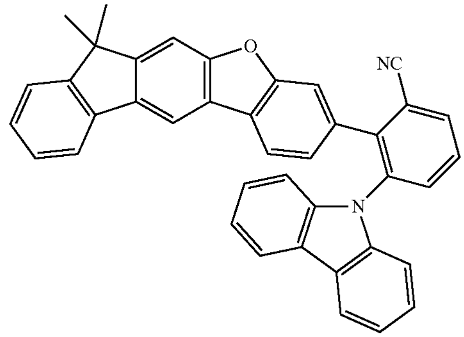
344
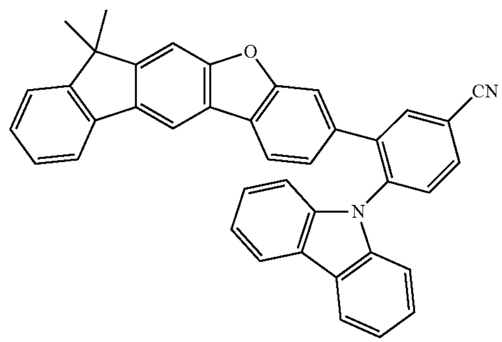
345
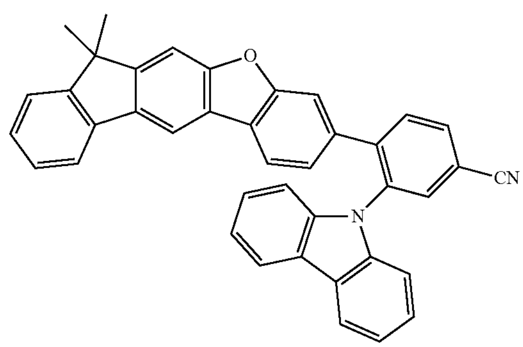
346
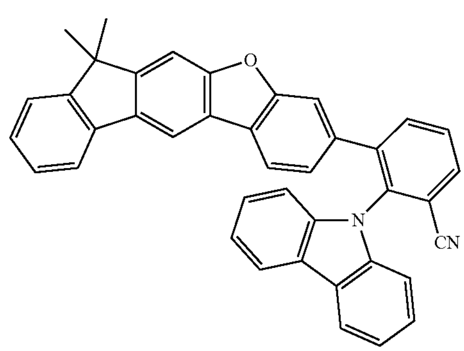

-continued
347
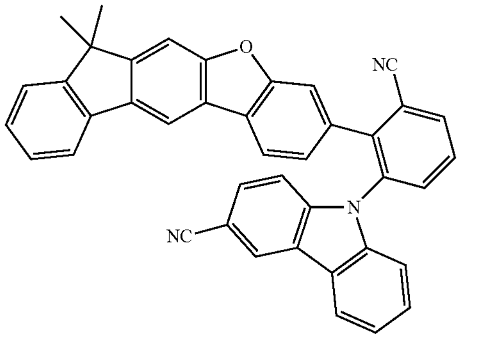
348
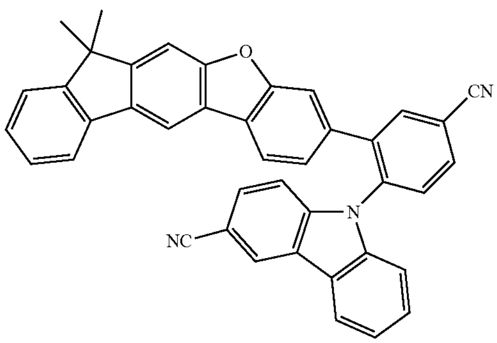
349
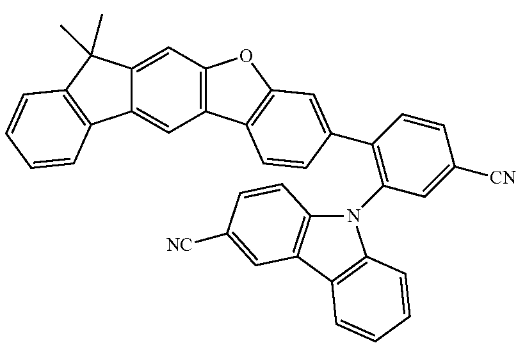
350
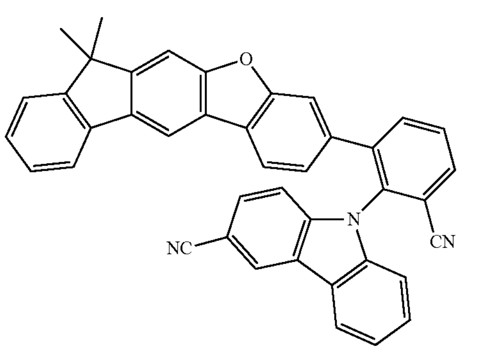
-continued
351
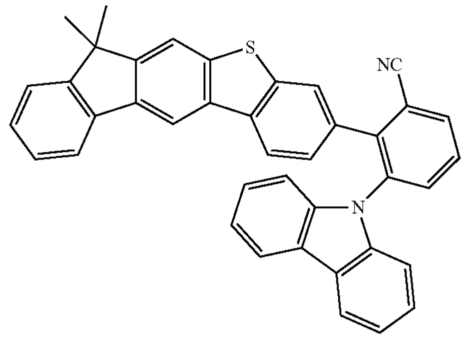
352
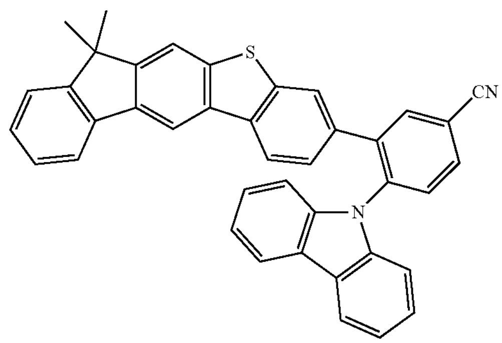
353
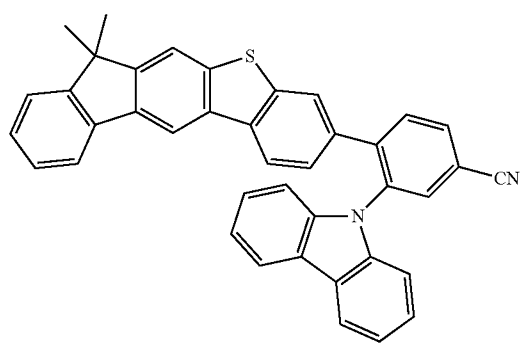
354
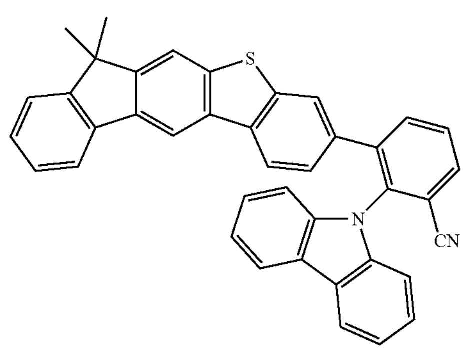

-continued
355
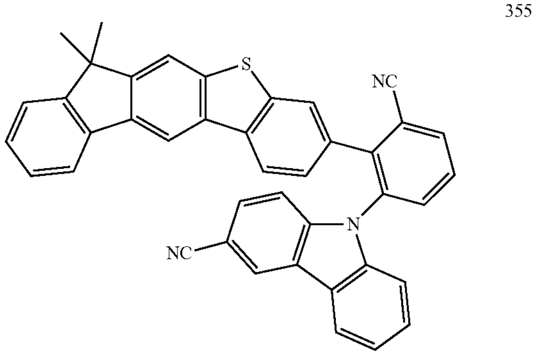
356
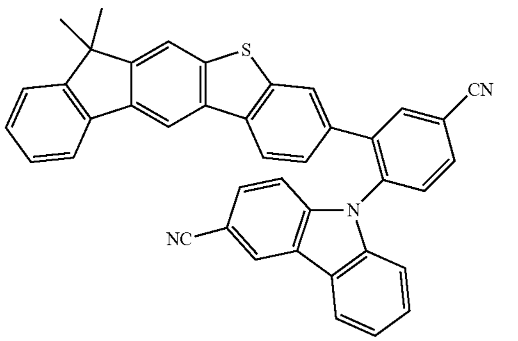
357
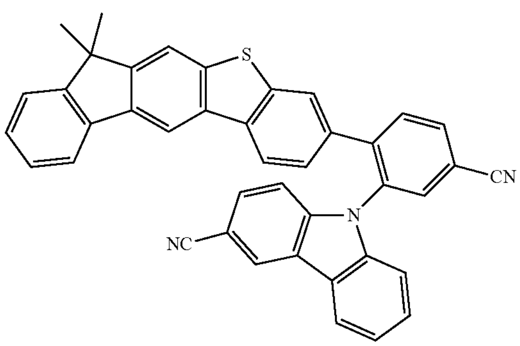
358
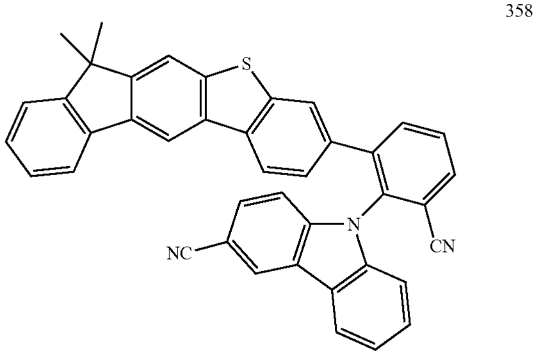
-continued
359
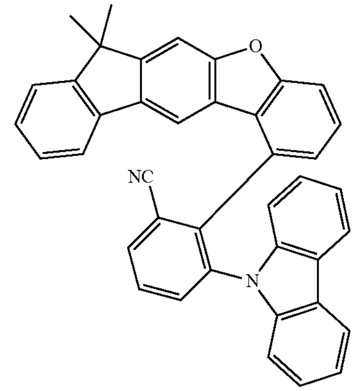
360
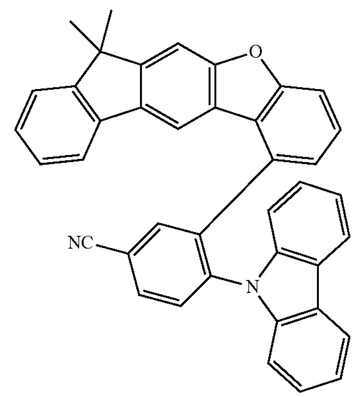
361
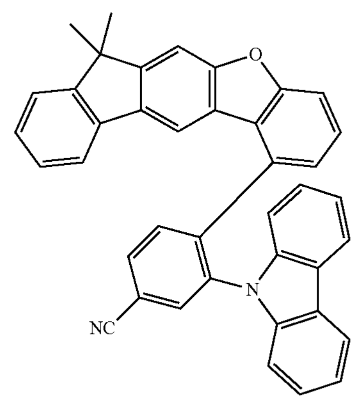
362
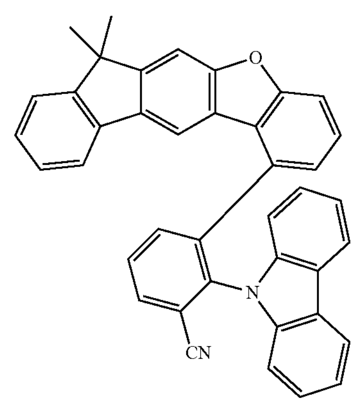

-continued
363
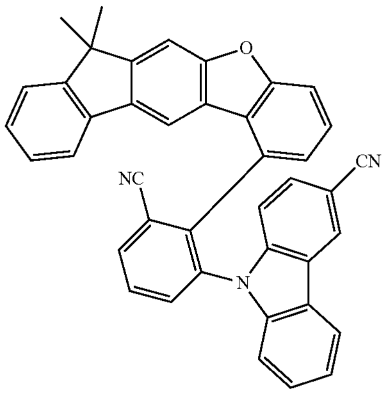
364
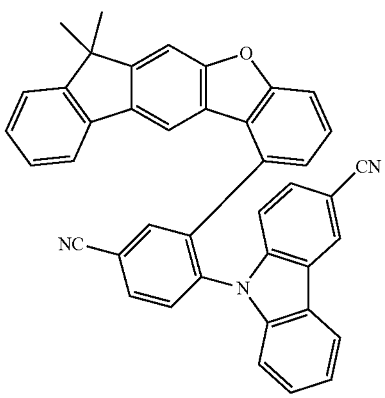
365
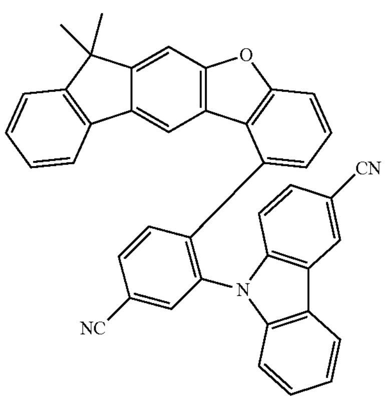
366
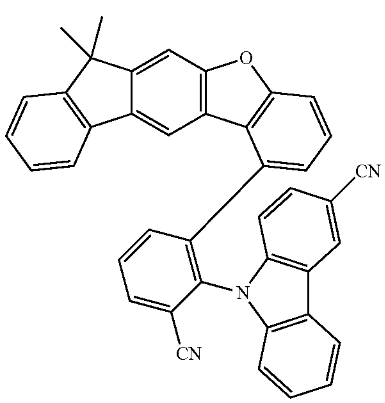
-continued
367
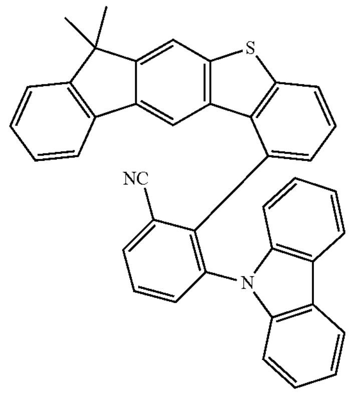
368
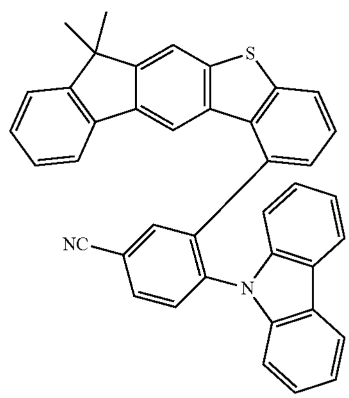
369
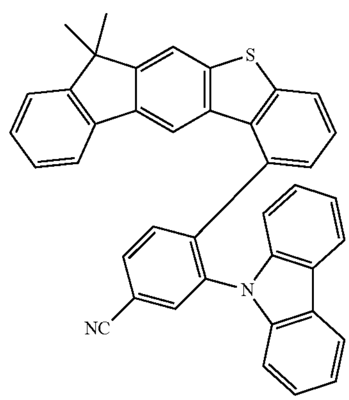
370
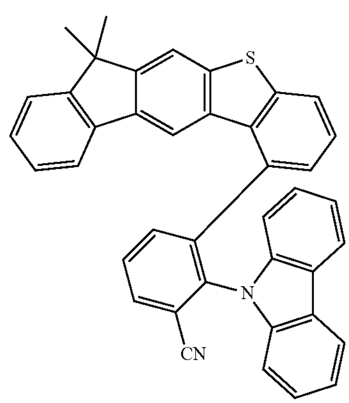

371
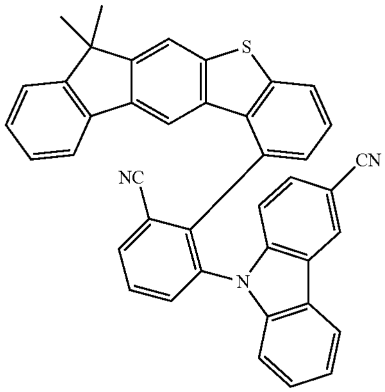
372
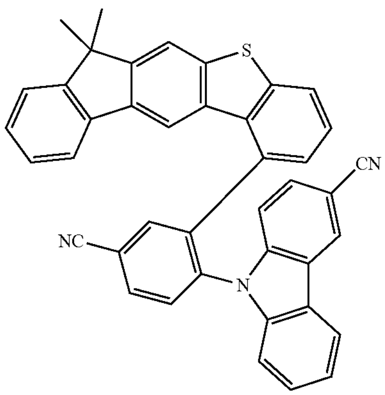
373
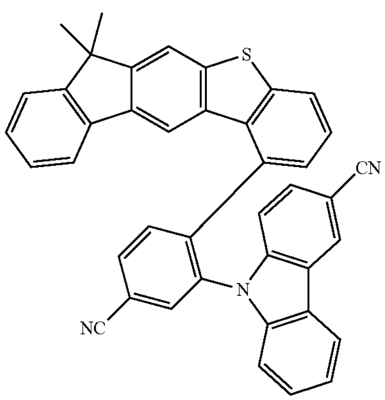
374
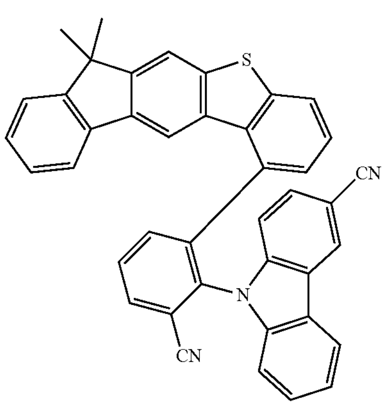
375
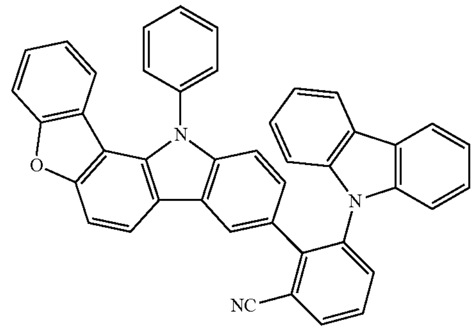
376
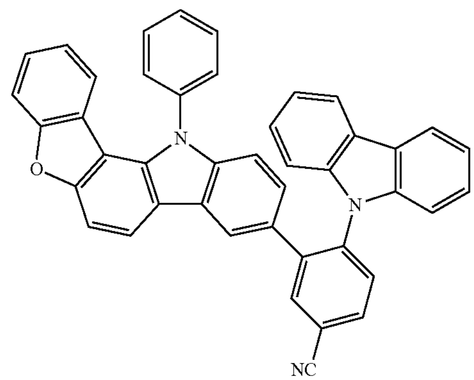
377
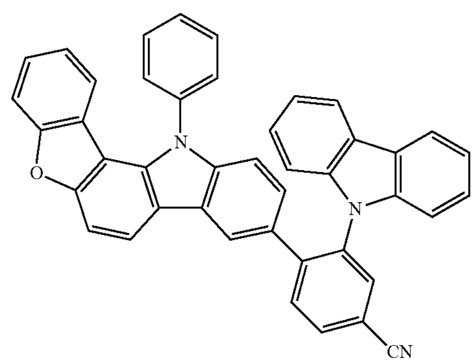
378
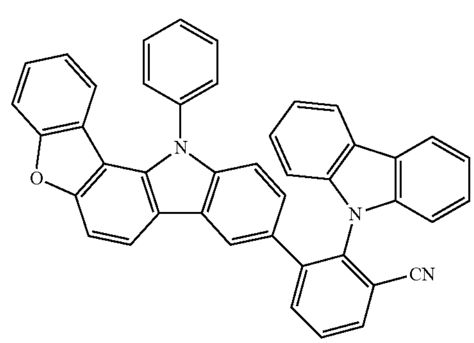

-continued
379
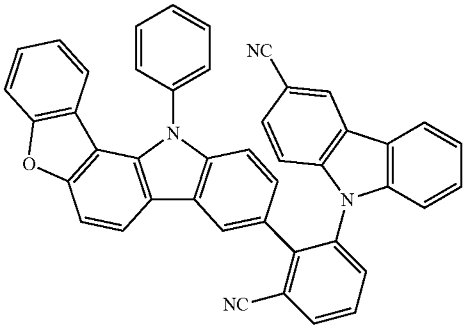
380
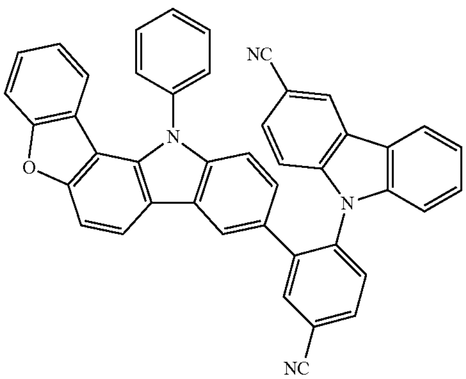
381
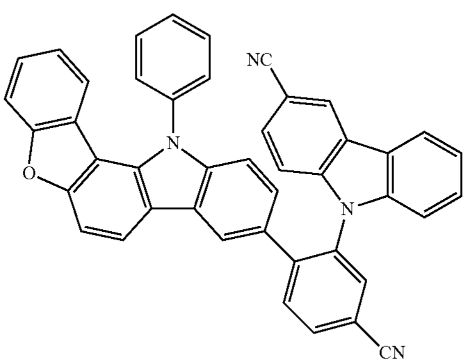
382
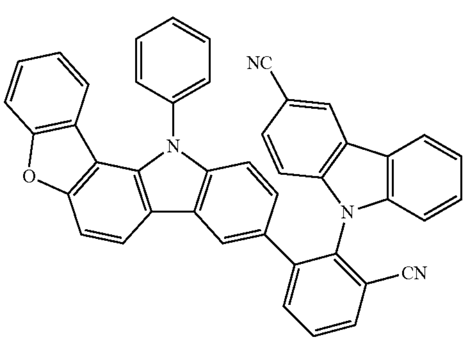
-continued
383
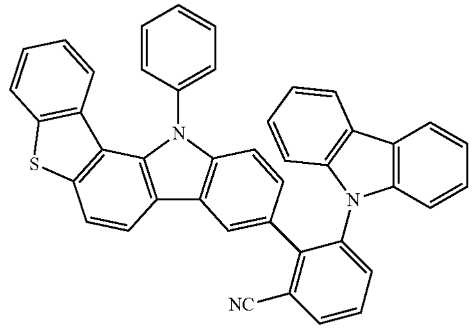
384
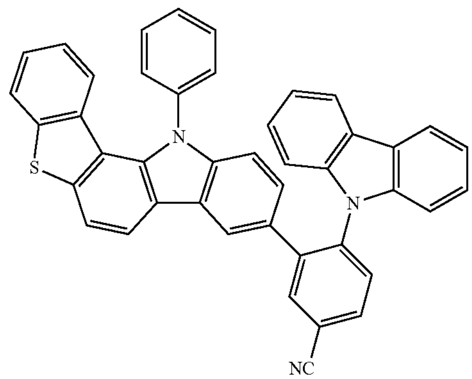
385
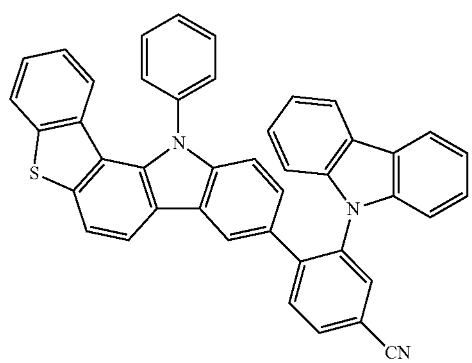
386
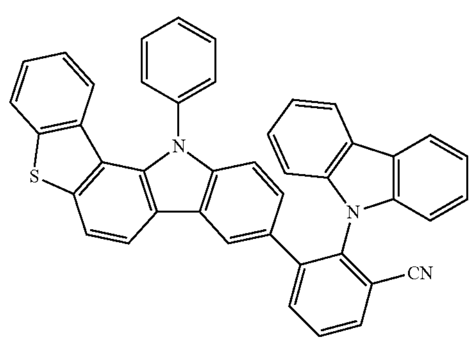

-continued
387
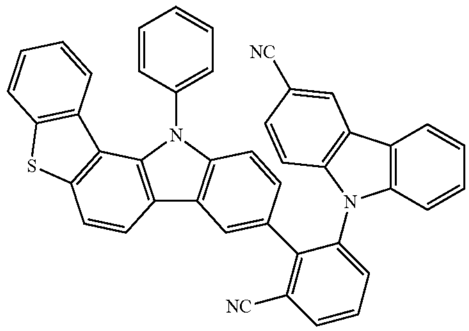
388
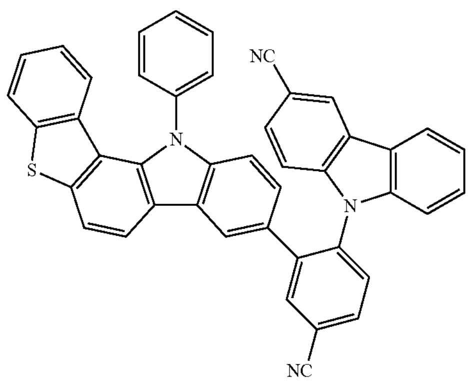
389
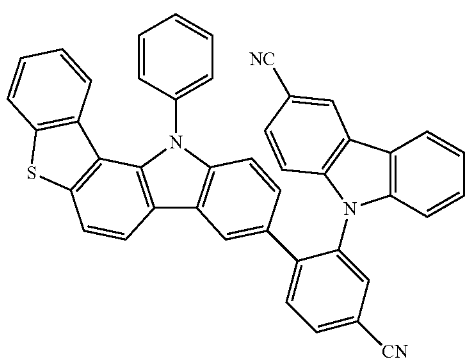
390
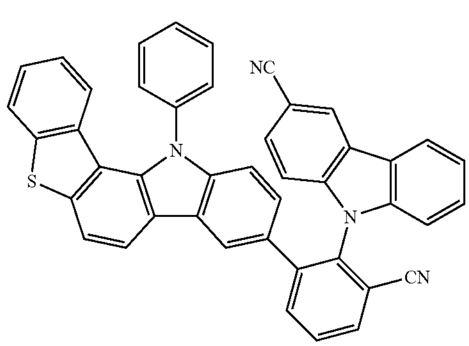
-continued
391
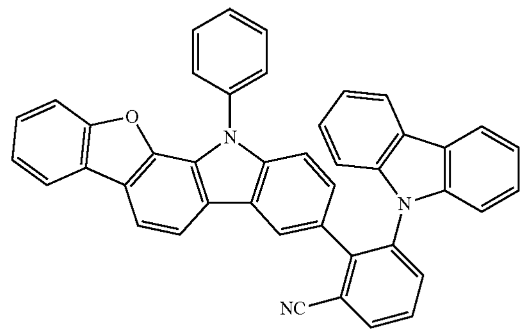
392
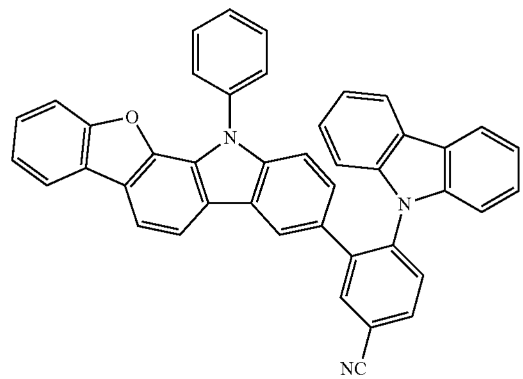
393
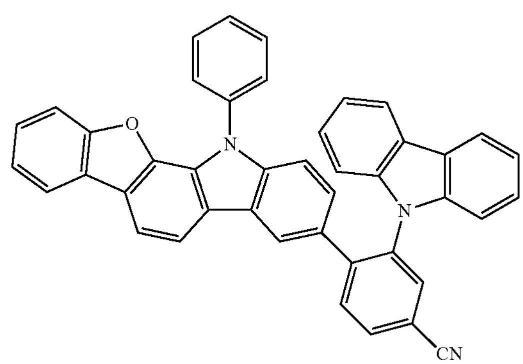
394
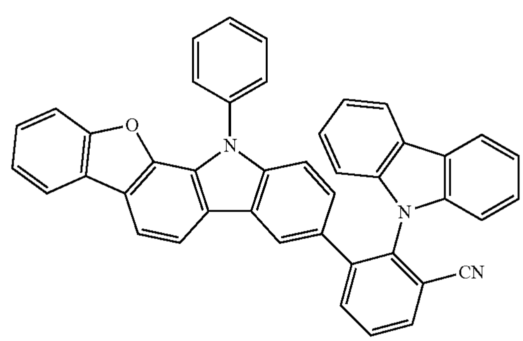

395
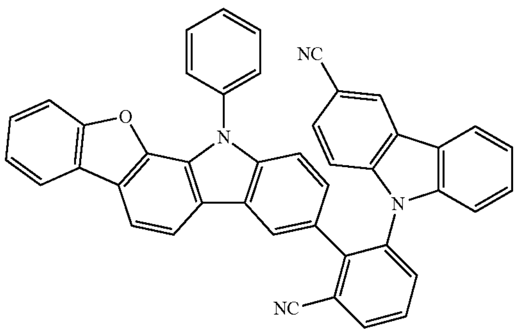
396
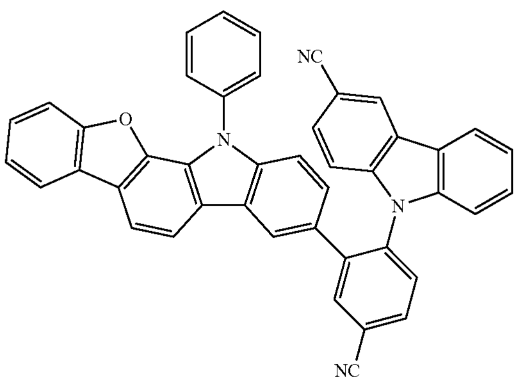
397
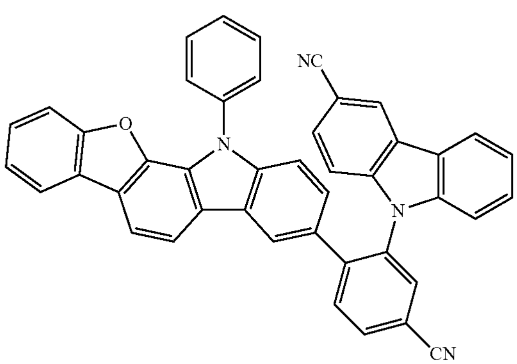
398
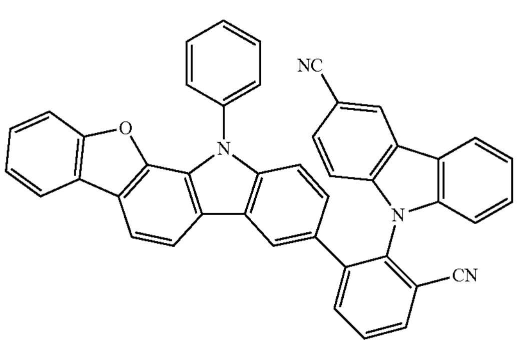
399
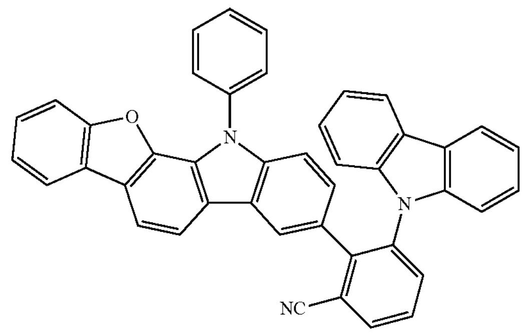
400
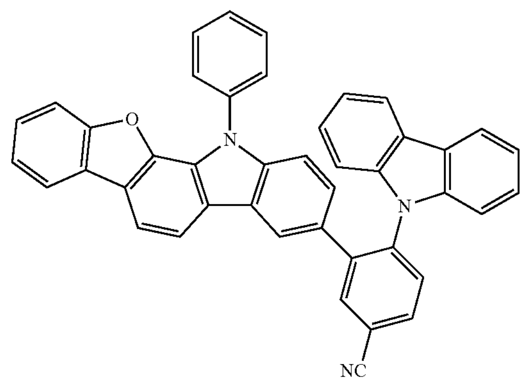
401
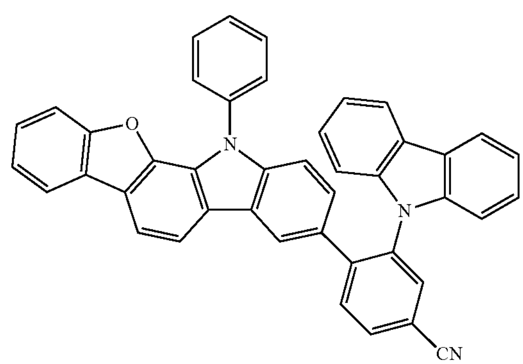
402
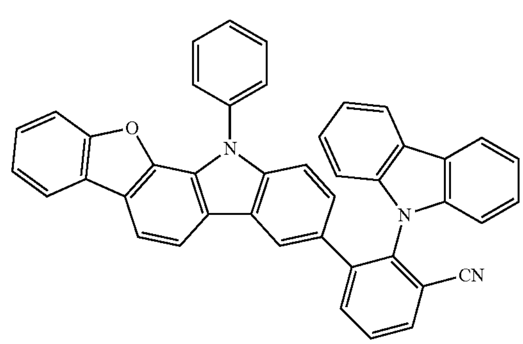

-continued
403
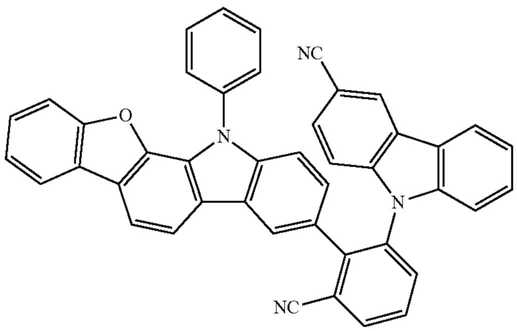
404
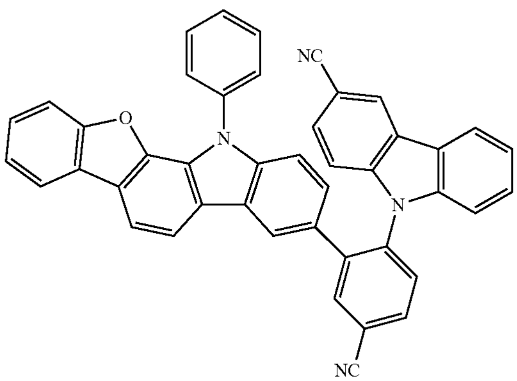
405
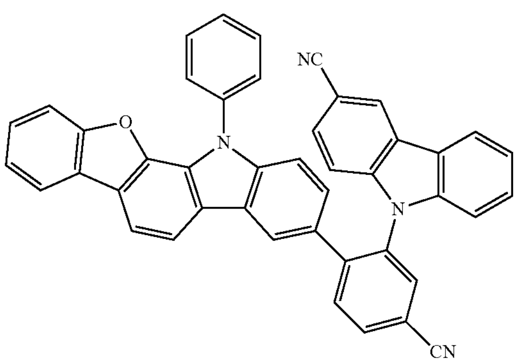
406
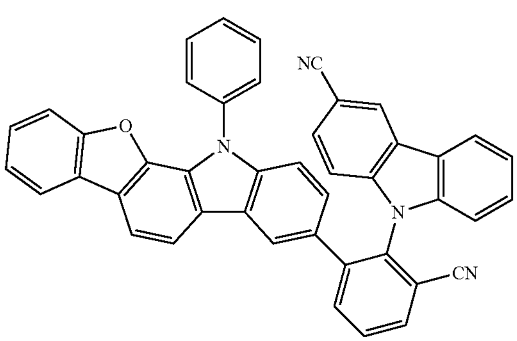
407
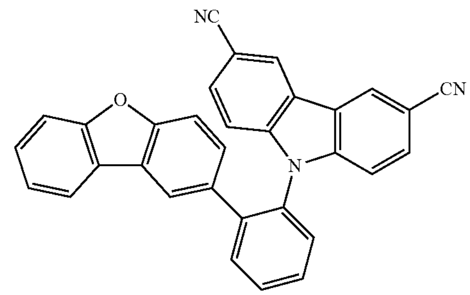
408
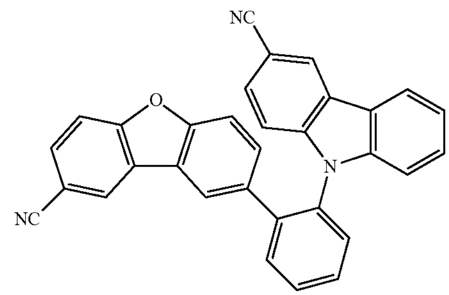
409
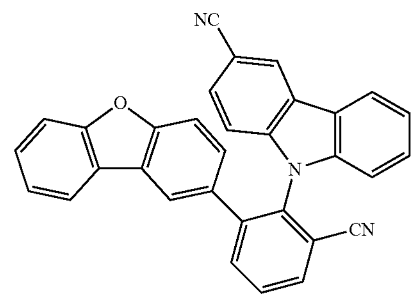
410
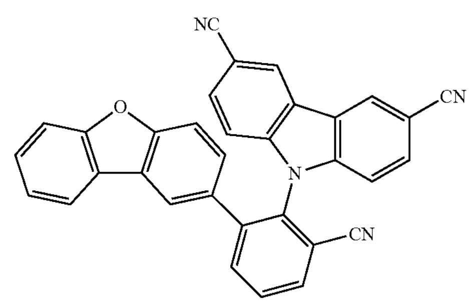
411
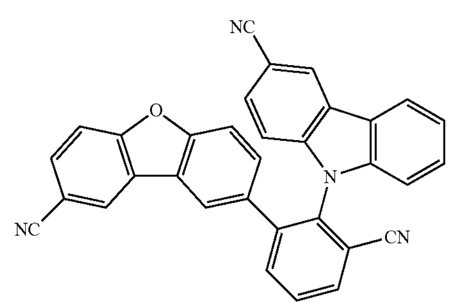

-continued
412
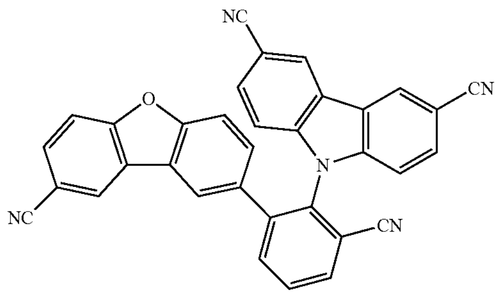
413
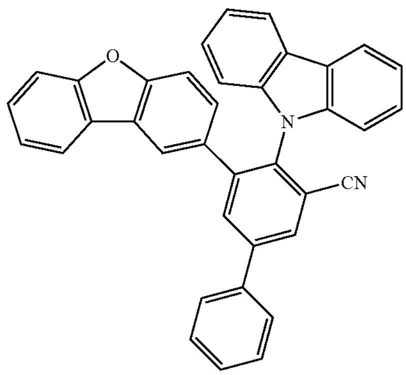
414
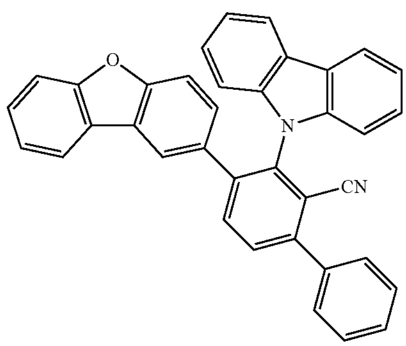
415
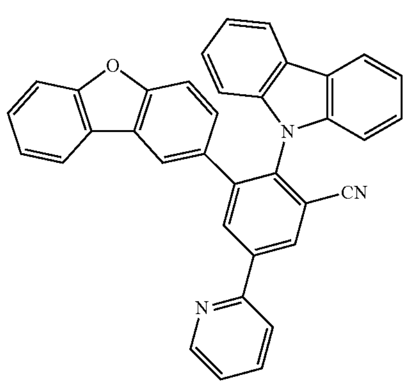
-continued
416
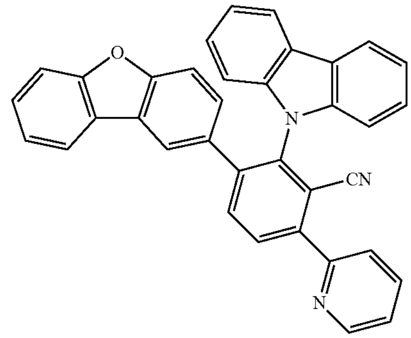
417
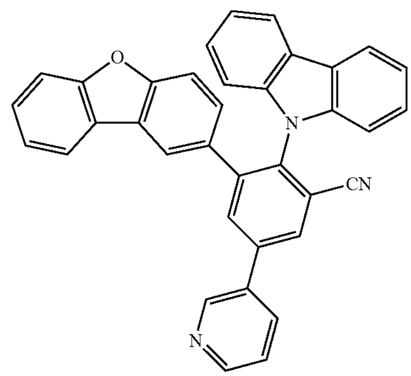
418
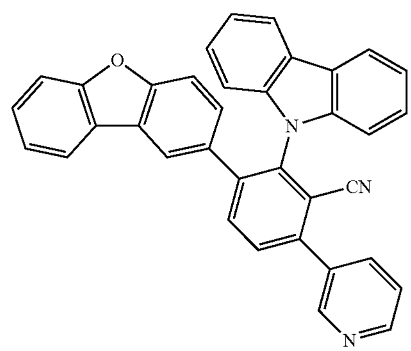
419
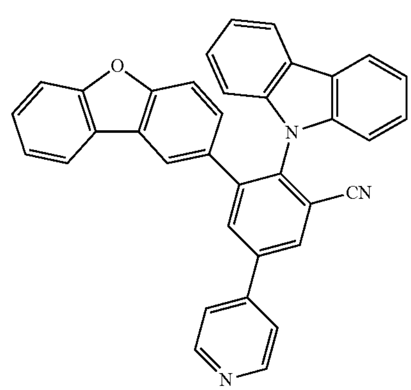

-continued
420
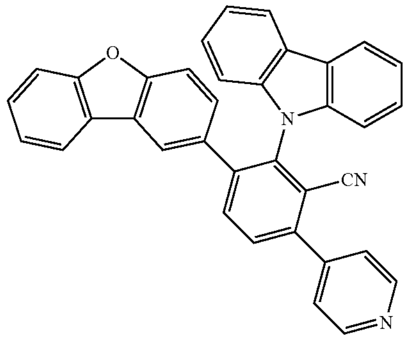
421
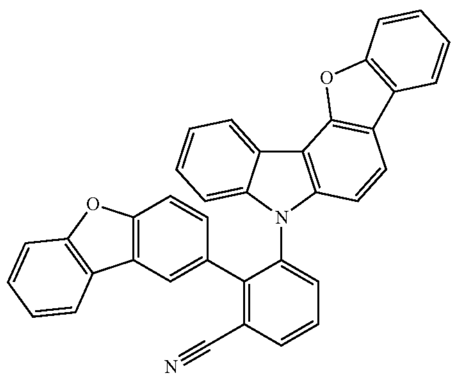
422
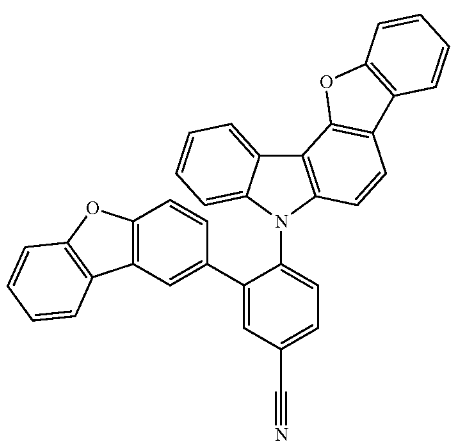
423
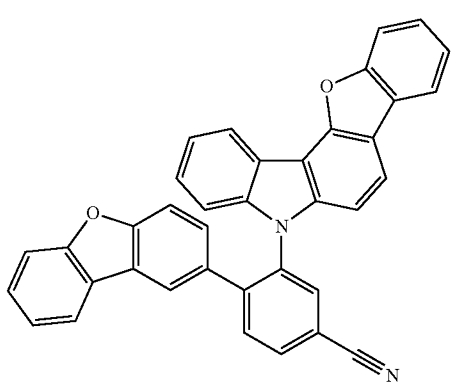
-continued
424
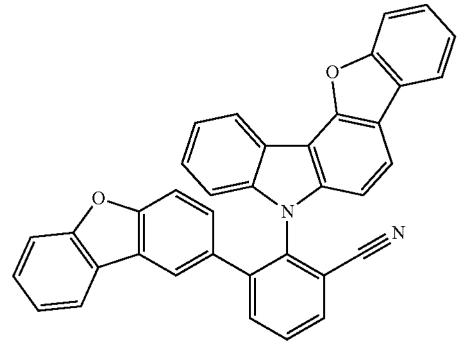
425
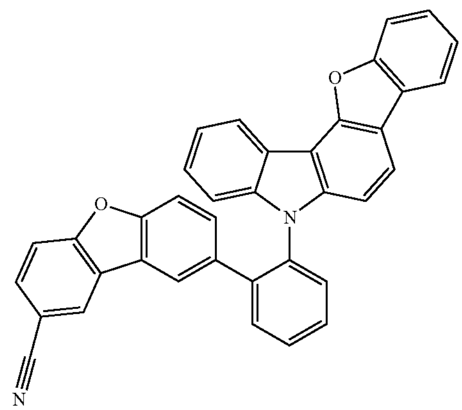
426
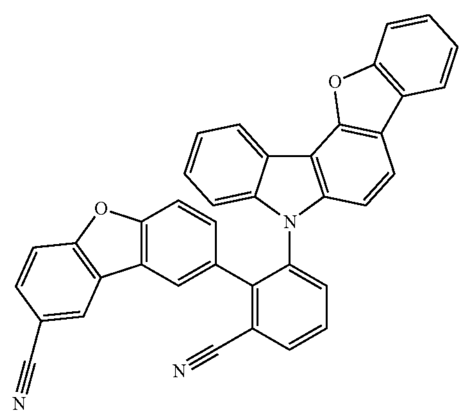
427
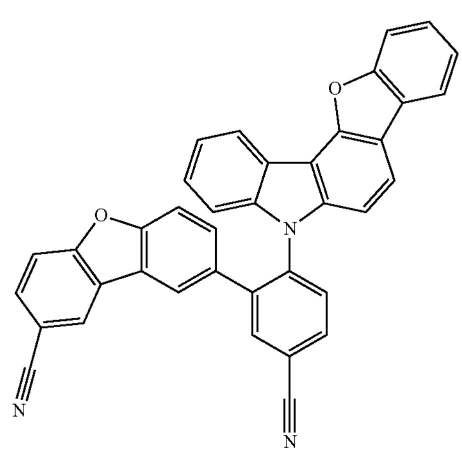

-continued
428
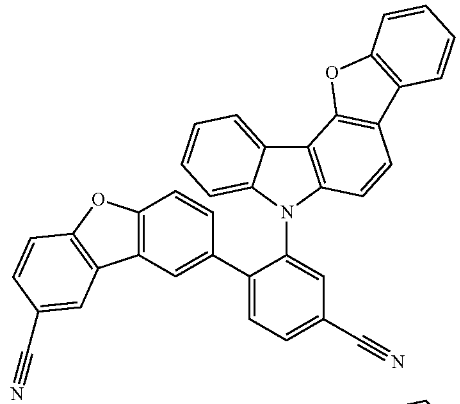
429
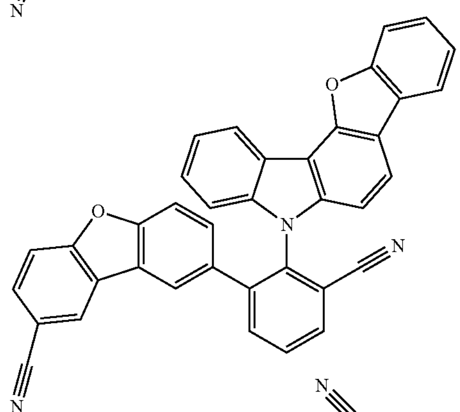
430
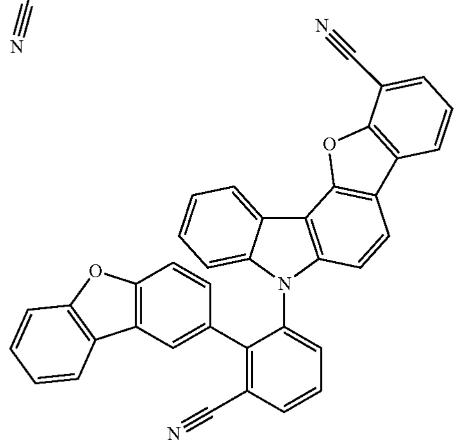
431
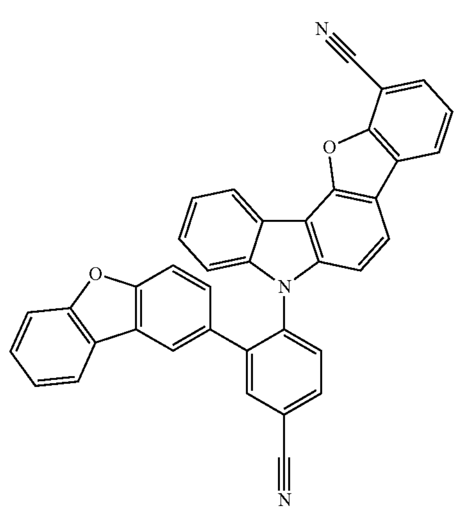
-continued
432
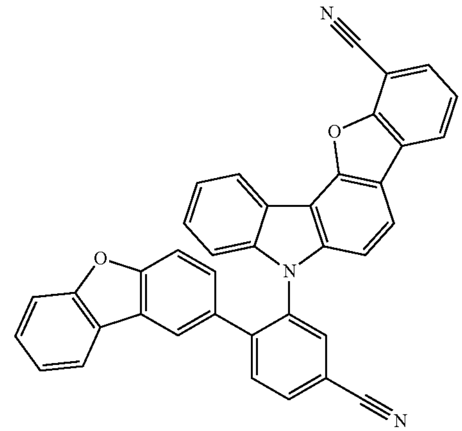
433
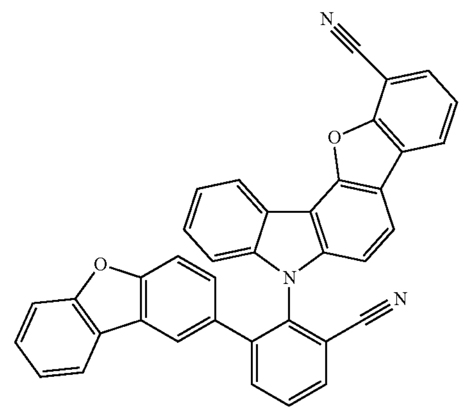
434
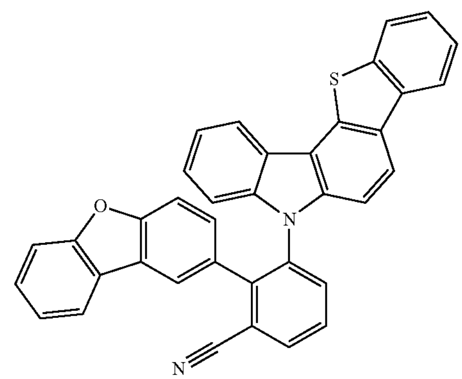
435
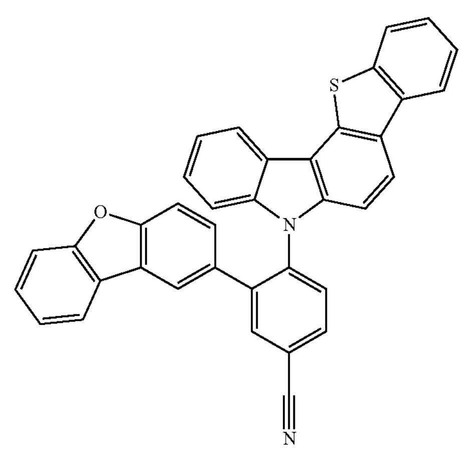

436
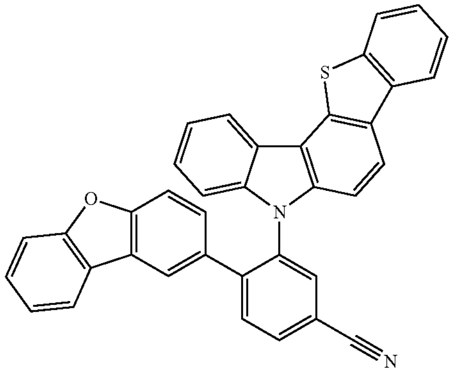
437
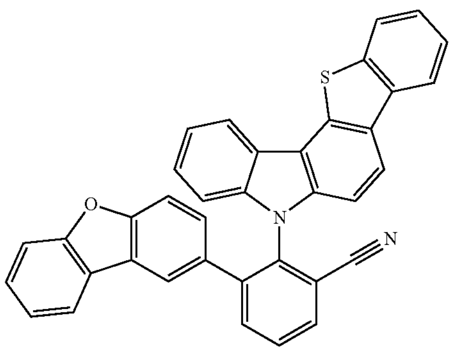
438
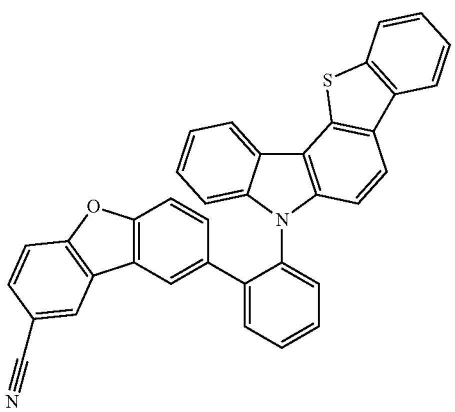
439
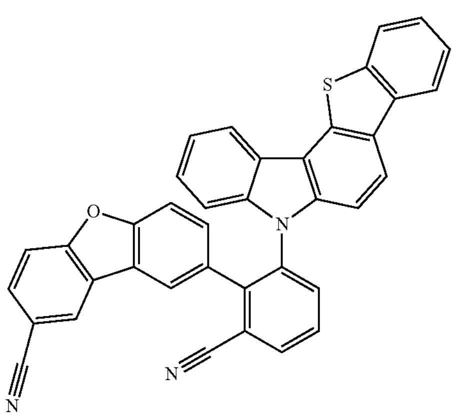
440
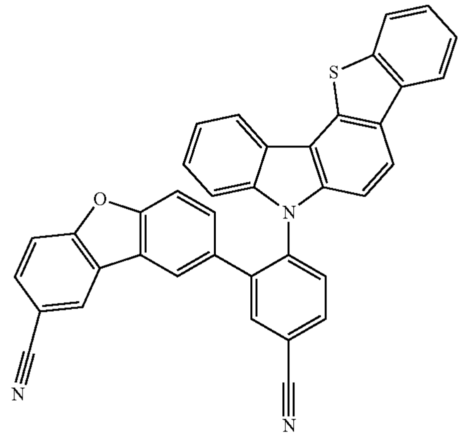
441
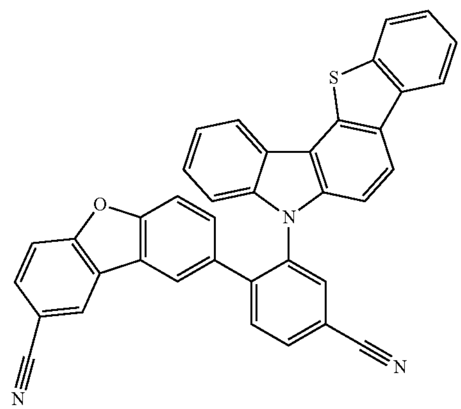
442
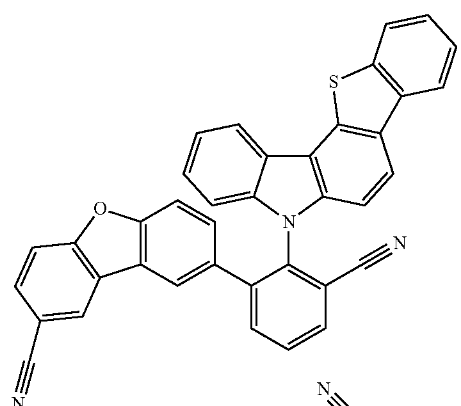
443
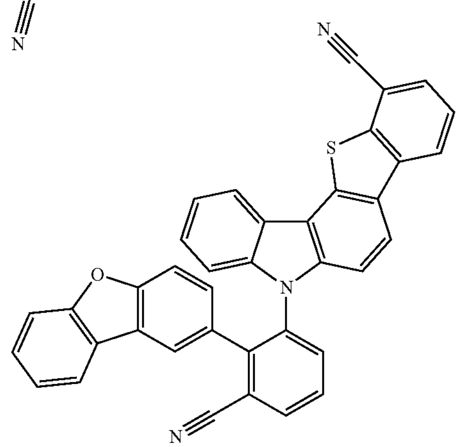

-continued
444
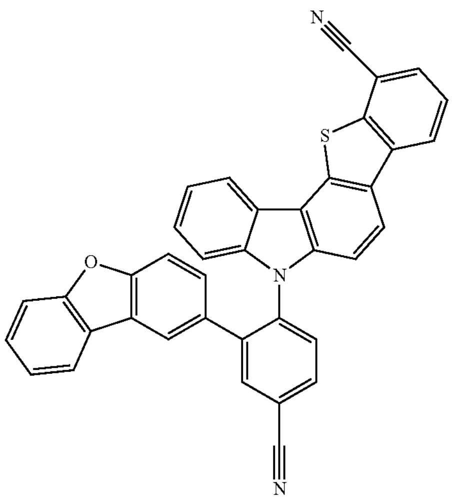
445
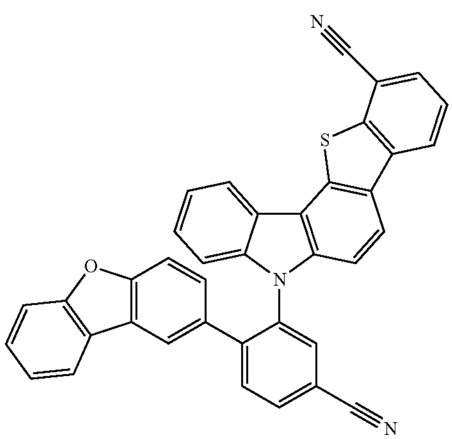
446
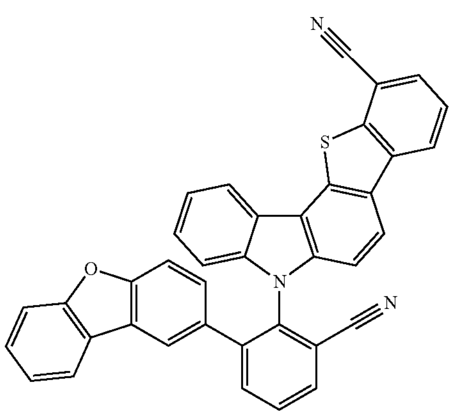
-continued
447
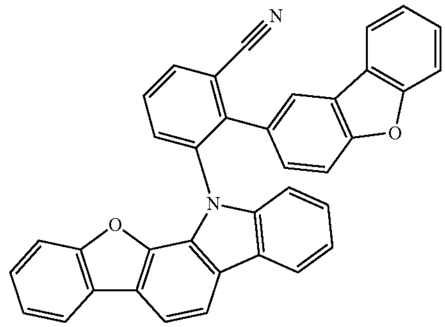
448
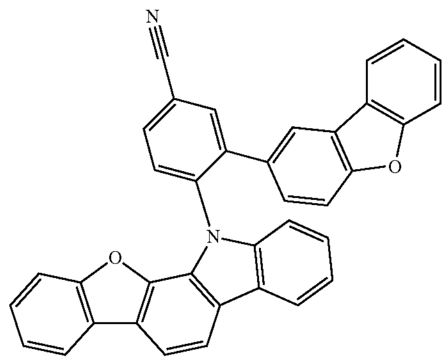
449
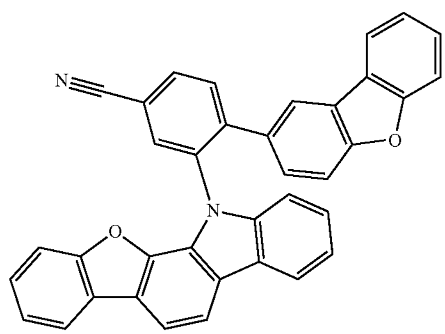
450
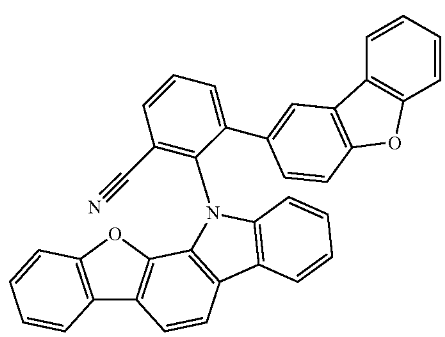

-continued
451
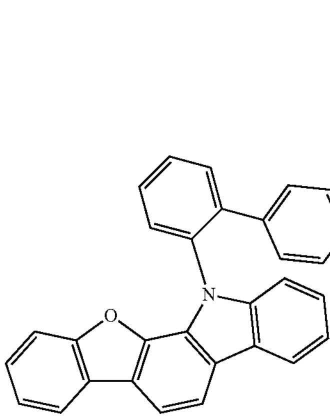
452
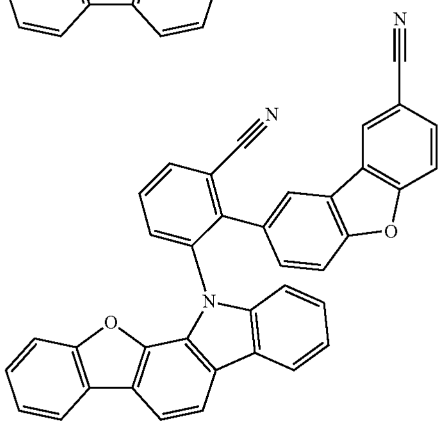
453
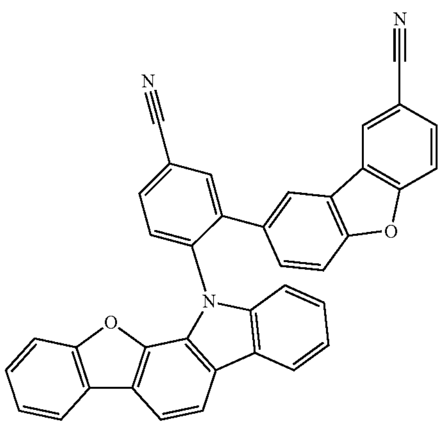
454
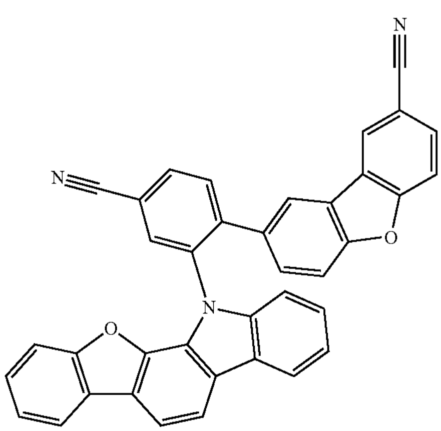
-continued
455
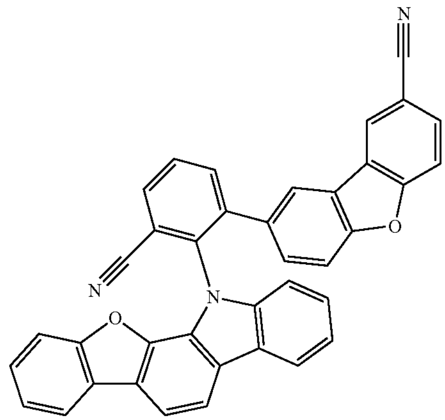
456
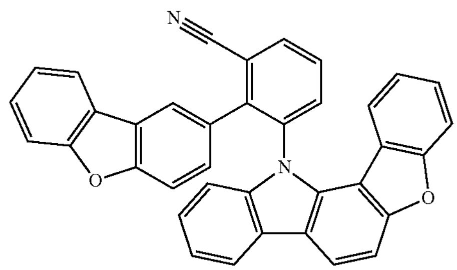
457
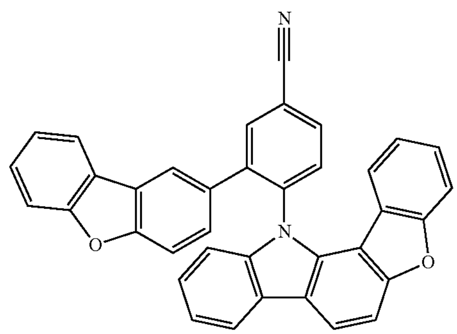
458
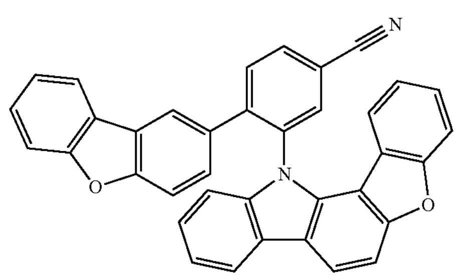
459
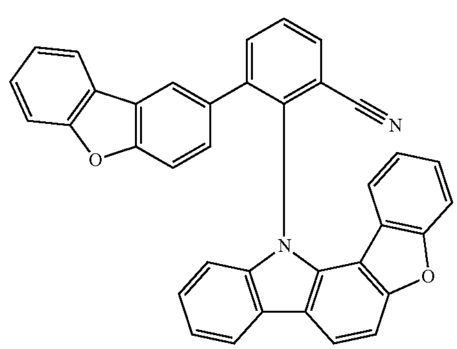

-continued
460
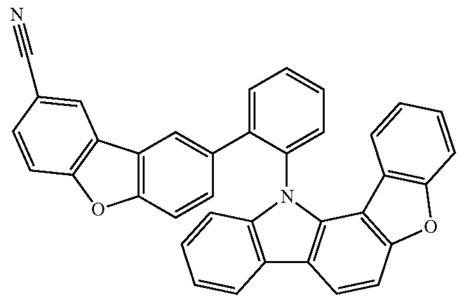
461
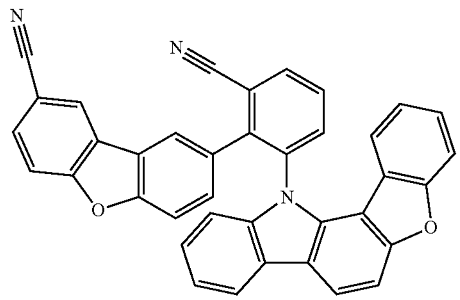
462
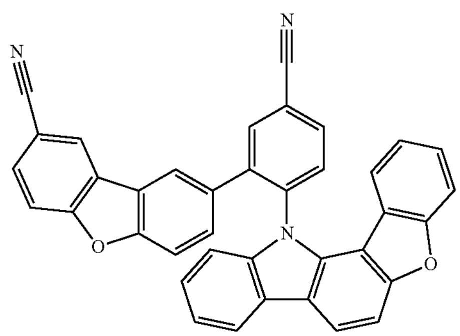
463
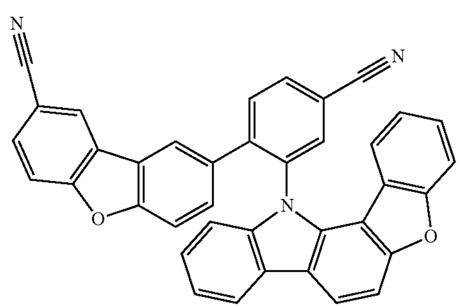
464
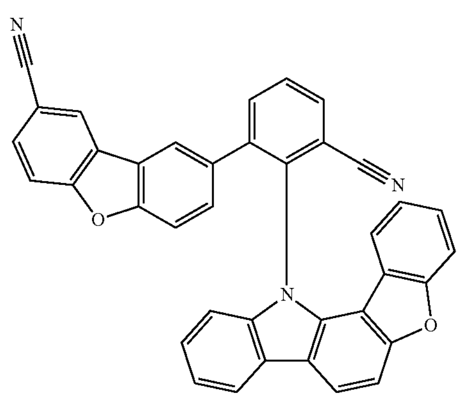
-continued
465
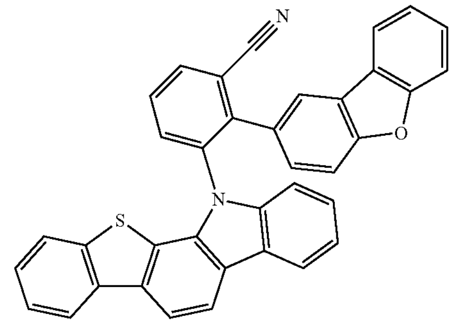
466
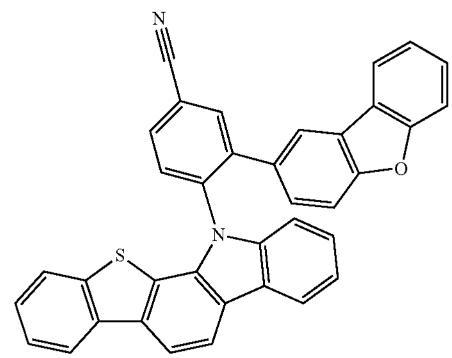
467
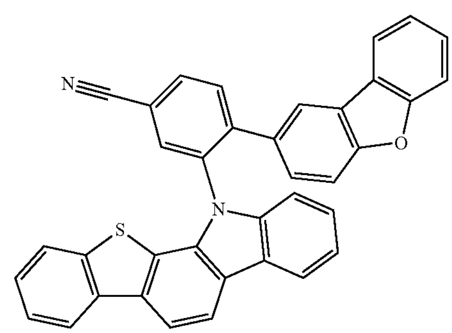
468
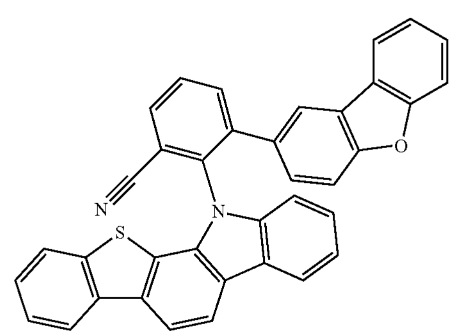

-continued
469
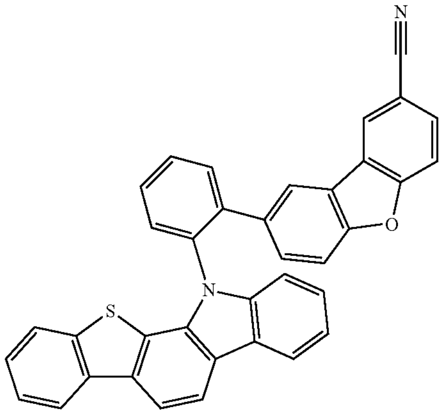
470
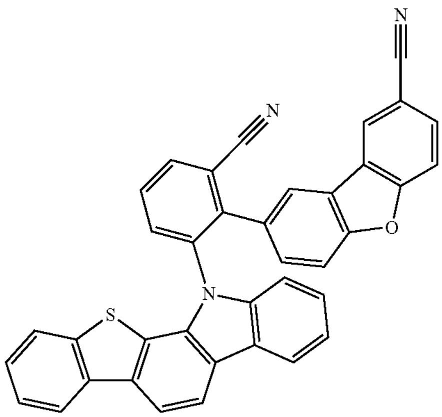
471
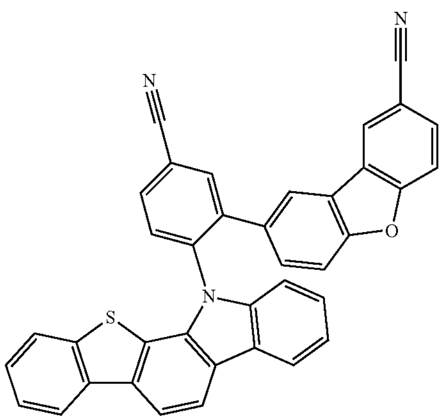
472
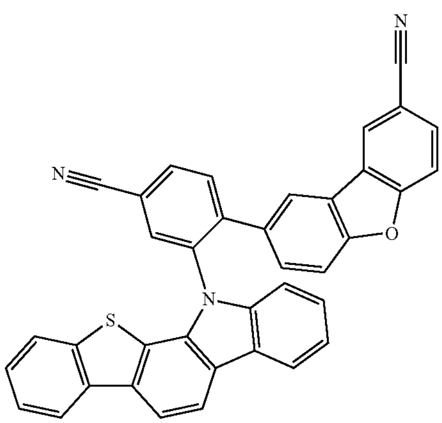
-continued
473
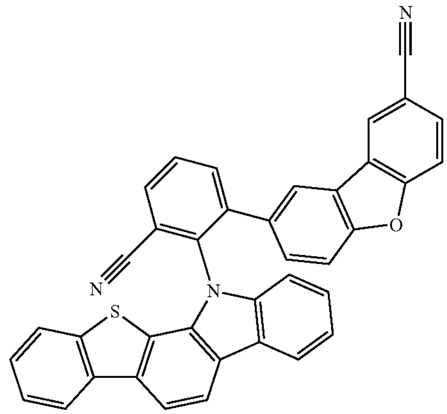
474
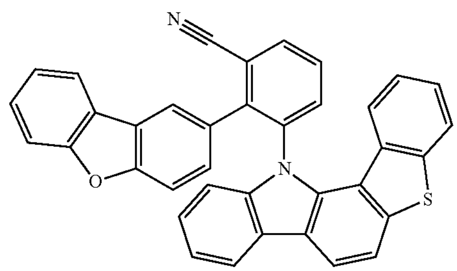
475
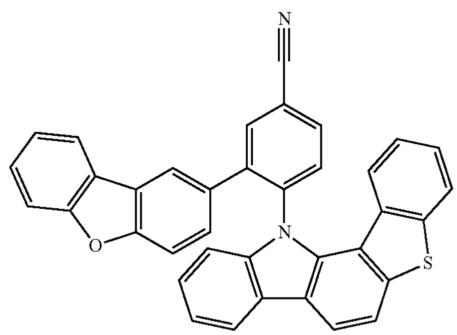
476
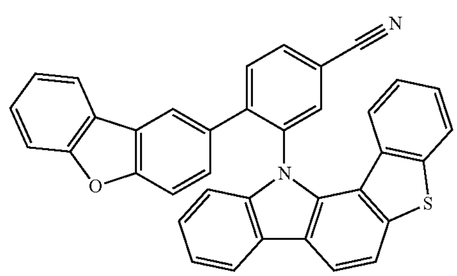
477
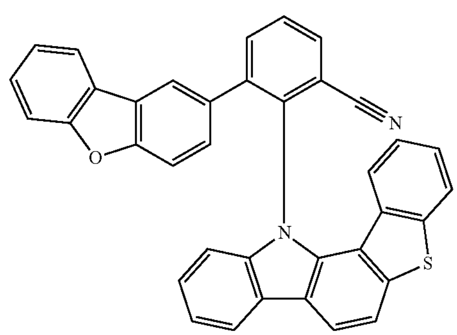

-continued
478
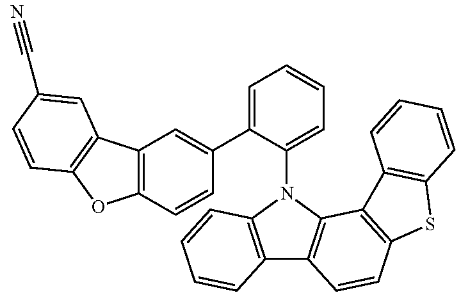
479
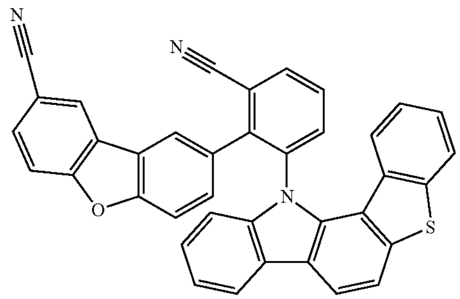
480
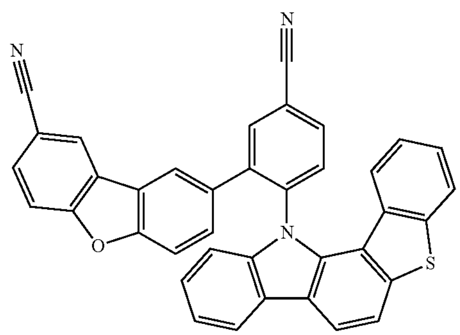
481
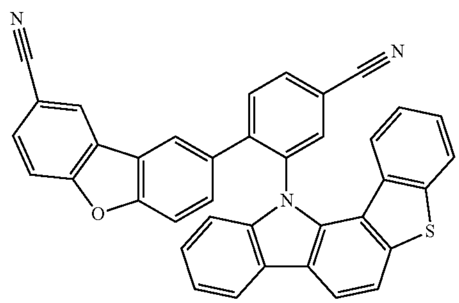
482
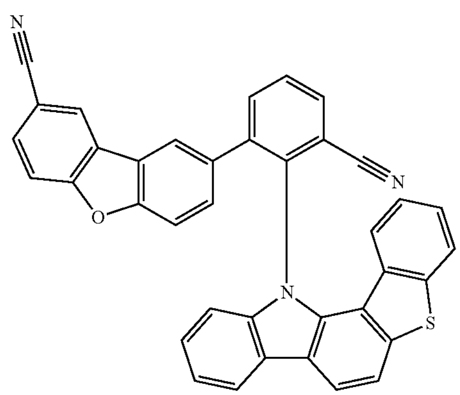
-continued
Group HE4
1
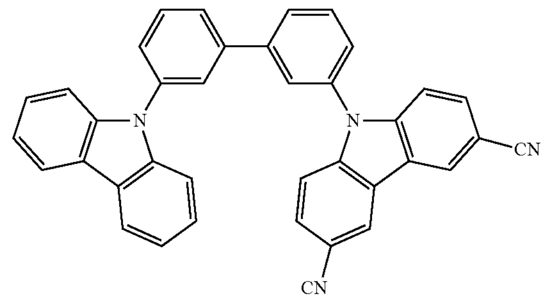
2
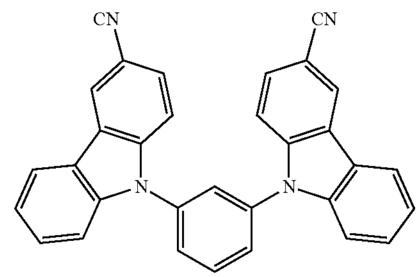
3
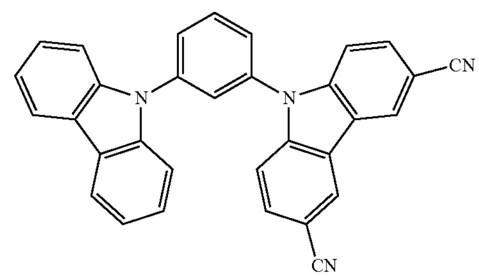
4
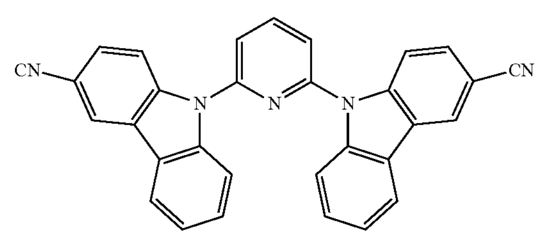
5
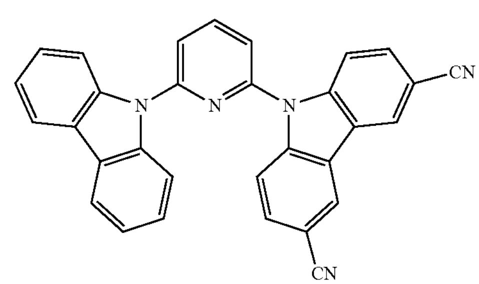

-continued
6
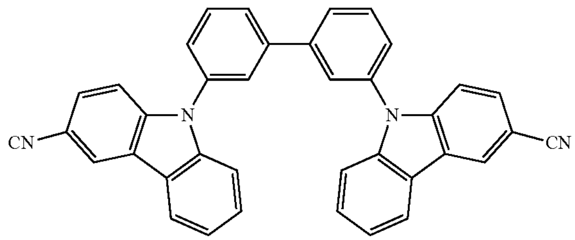
7
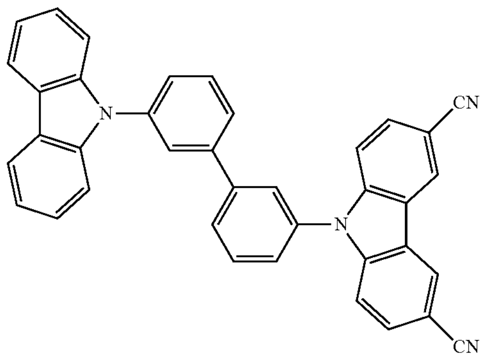
8
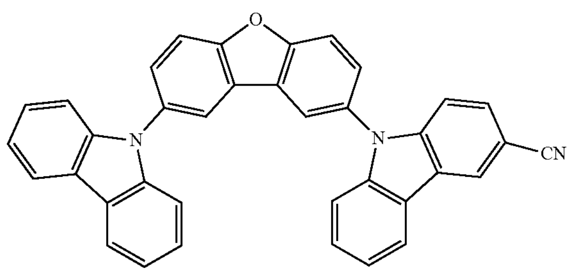
9
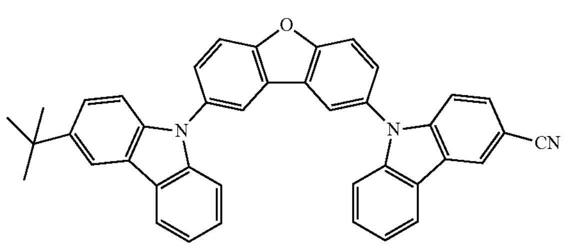
10
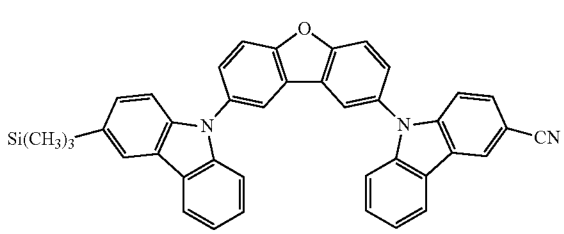
-continued
11
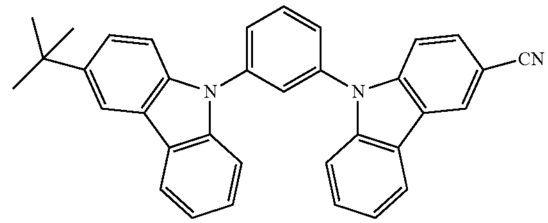
12
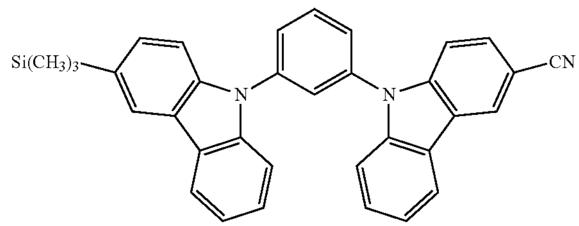
13
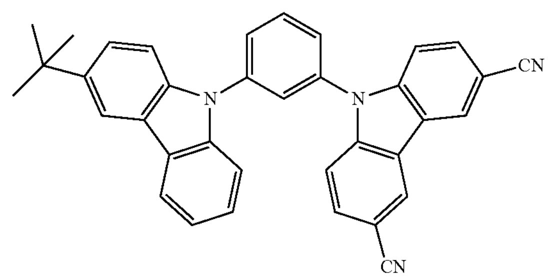
14
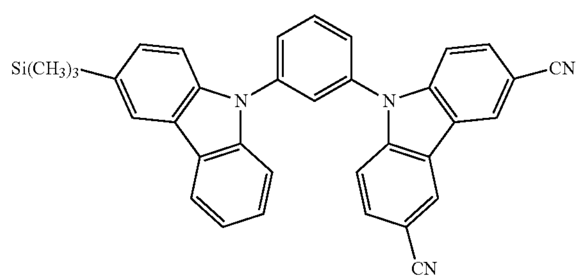
15
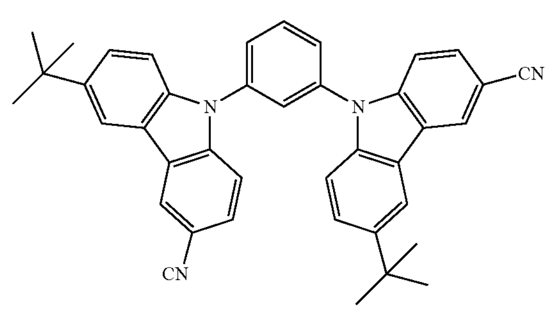

16
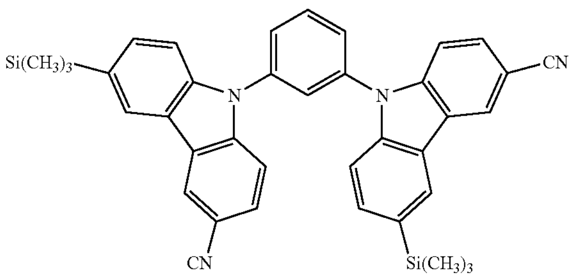
17
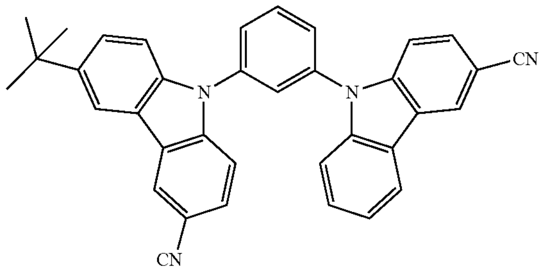
18
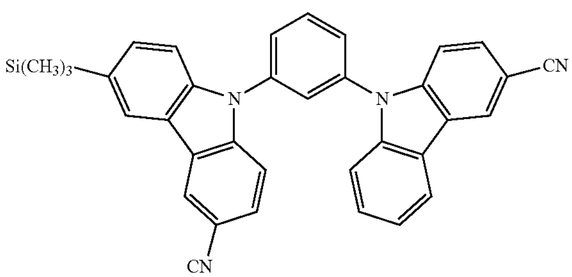
19
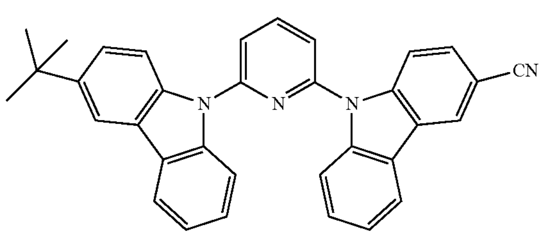
20
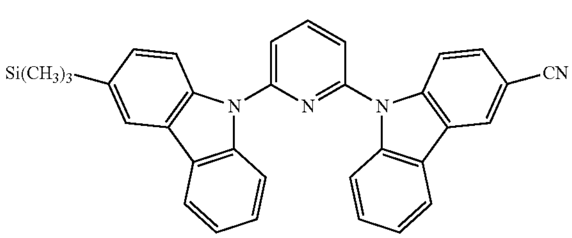
21
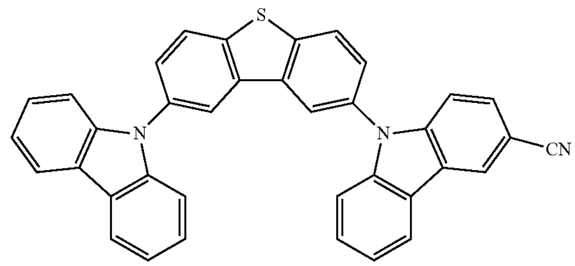
22
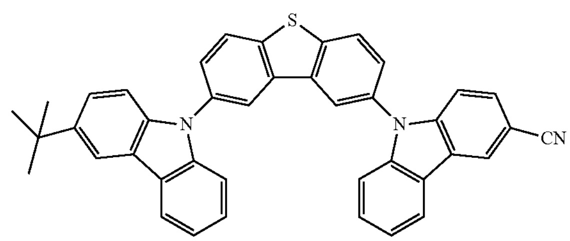
23
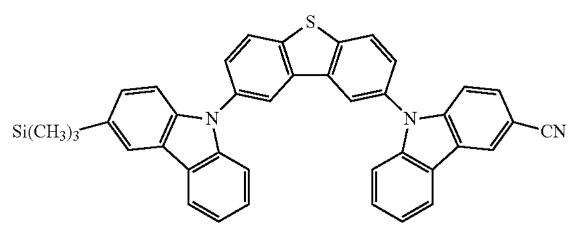
24
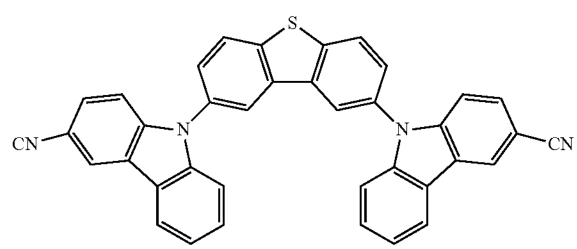
25
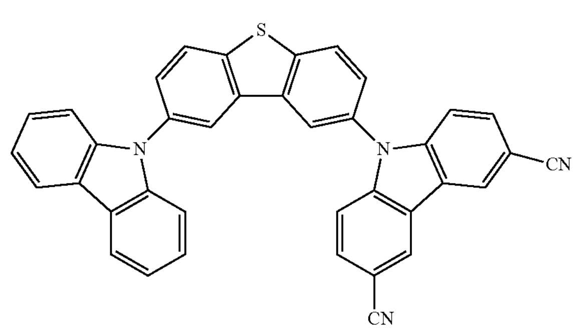

-continued
26
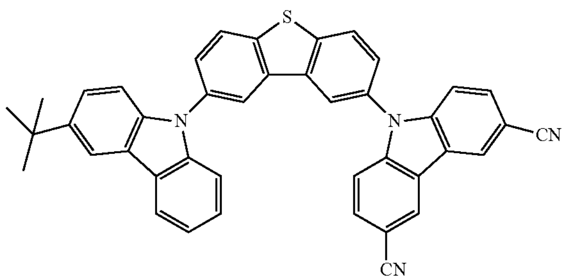
27
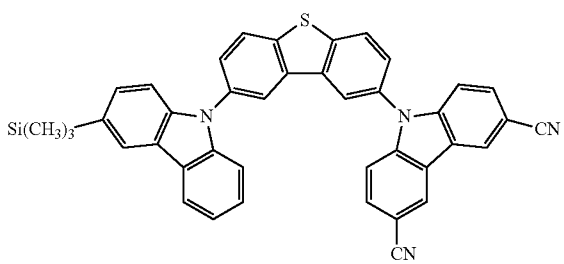
28
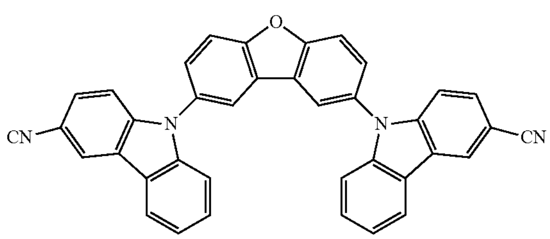
29
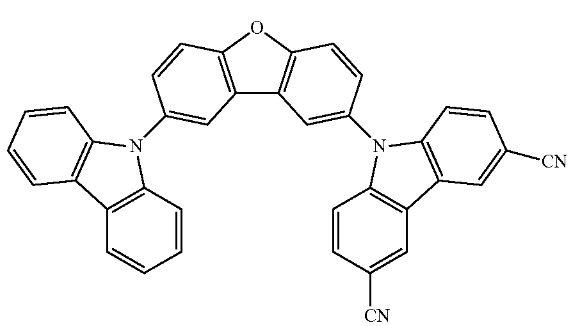
30
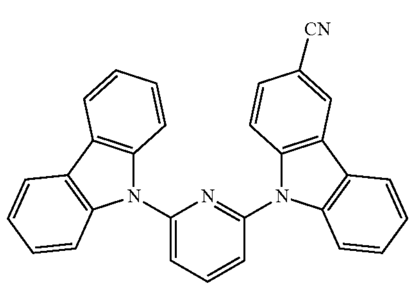
-continued
31
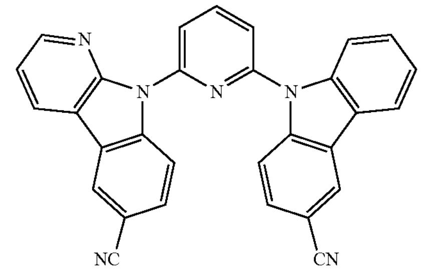
32
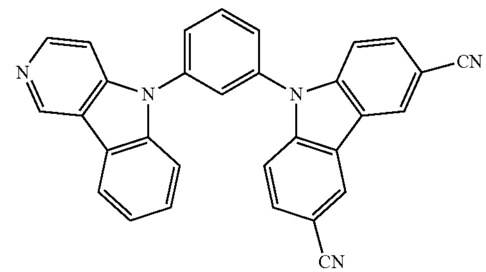
33
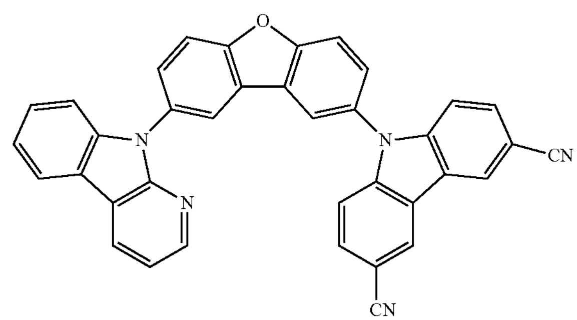
34
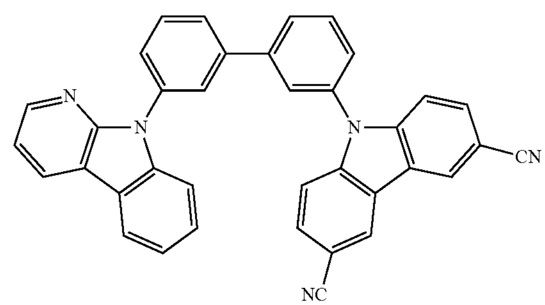
35
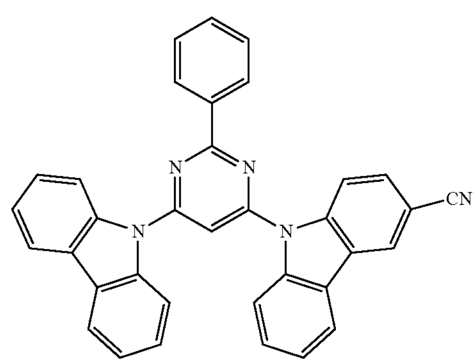

-continued
36
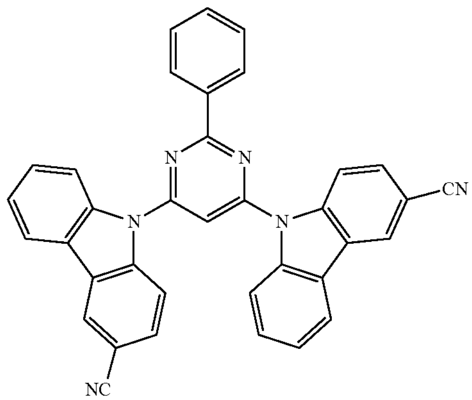
37
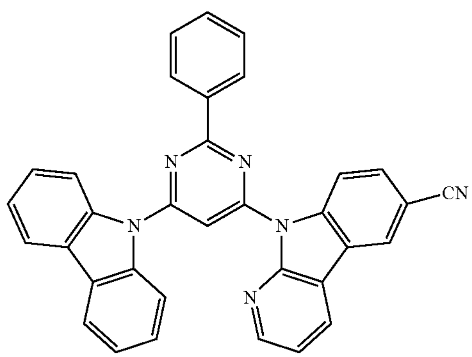
38
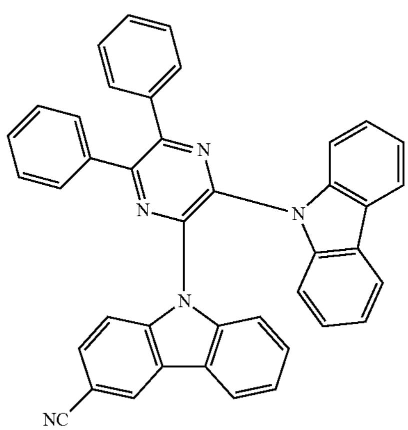
39
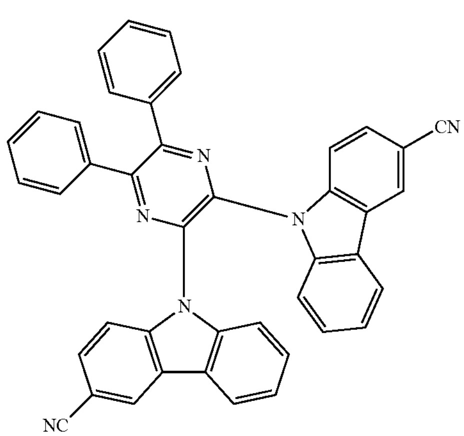
-continued
40
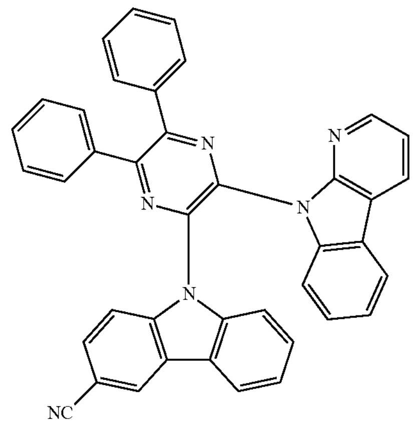
41
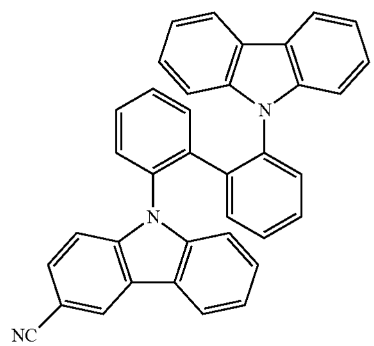
42
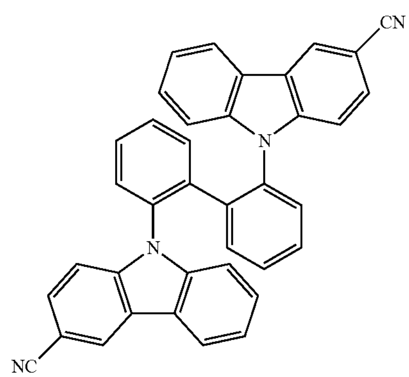
43
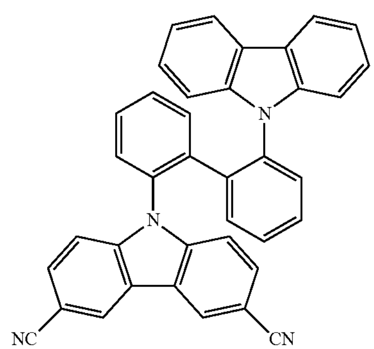

-continued
44
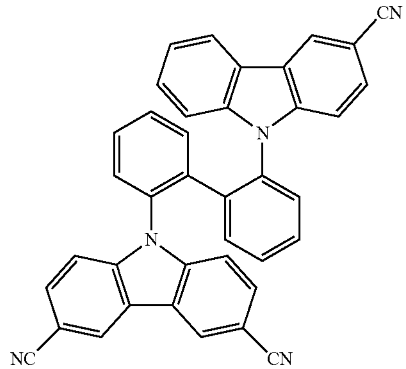
45
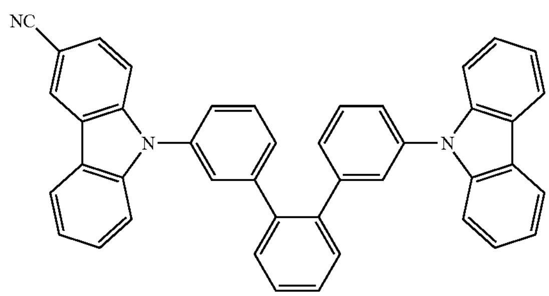
46
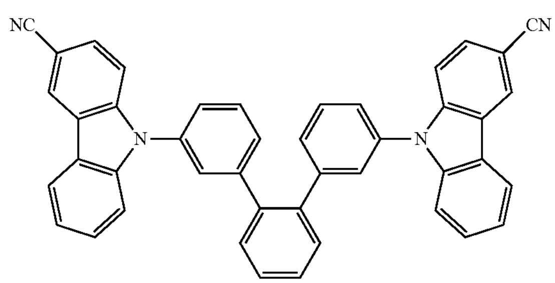
47
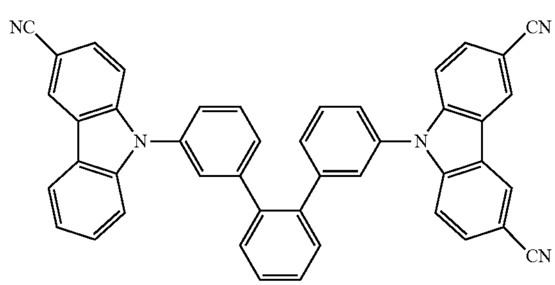
48
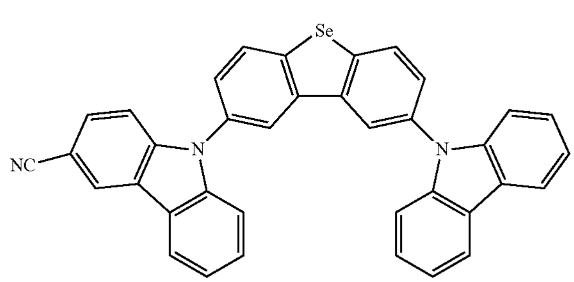
-continued
49
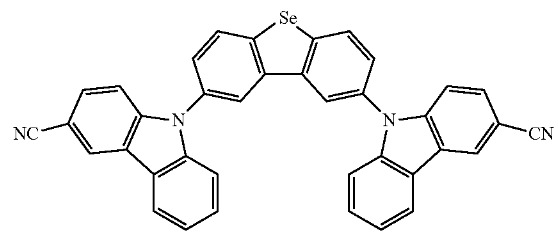
50
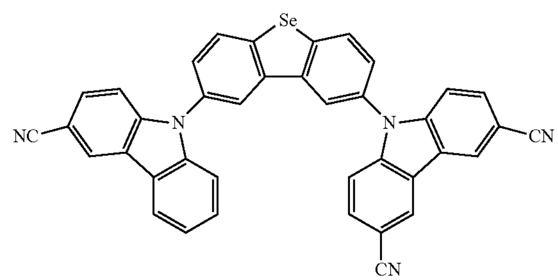
51
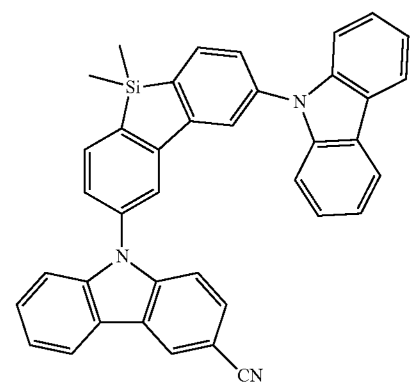
52
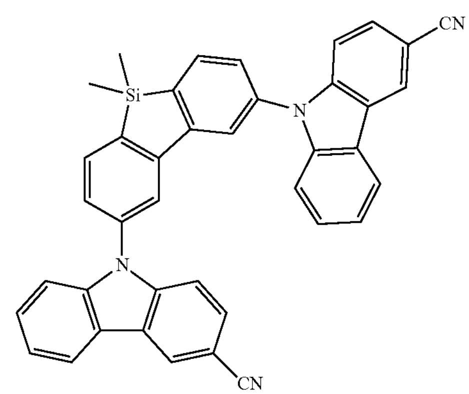

53
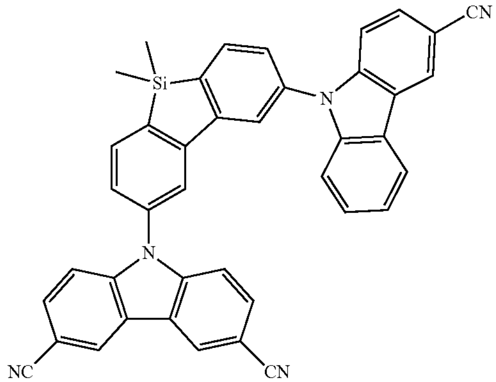
54
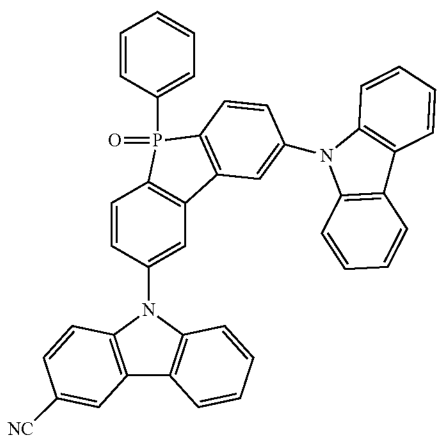
55
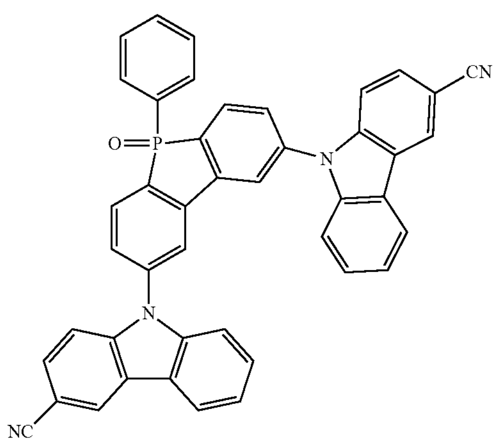
56
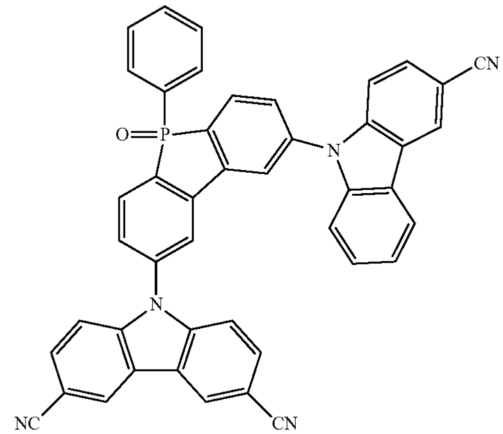
Group HE5
1
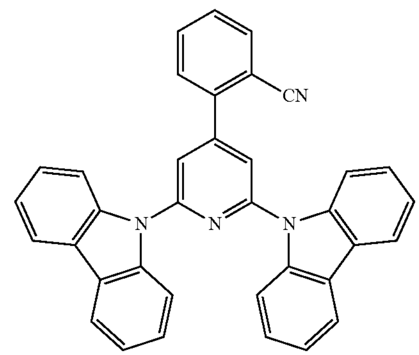
2
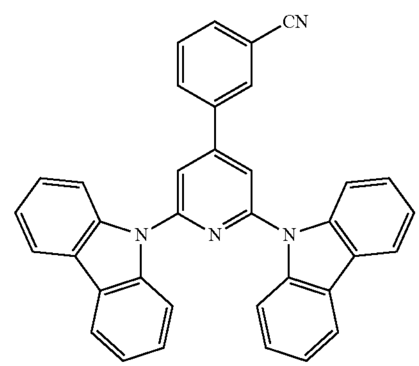
3
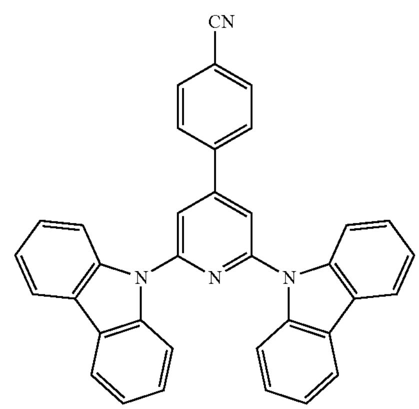

-continued
4
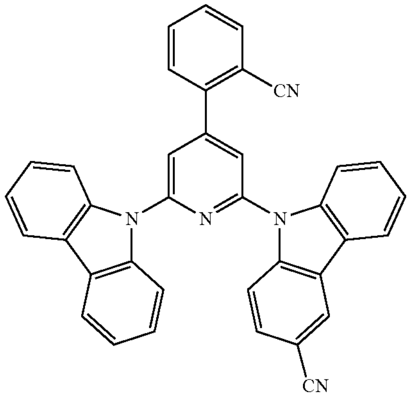
5
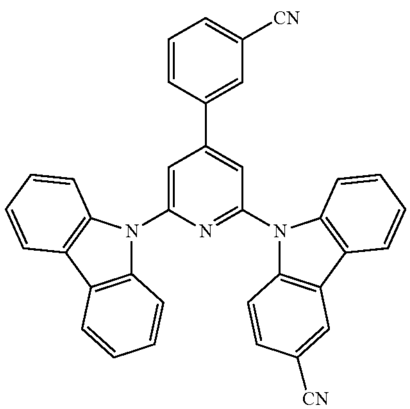
6
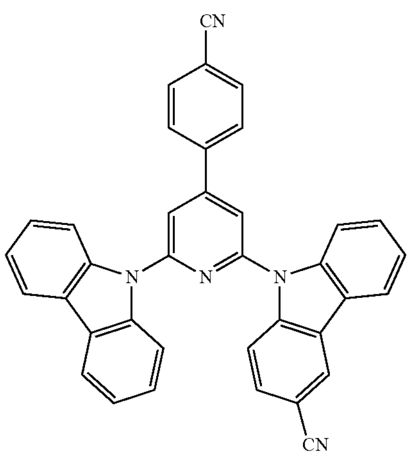
7
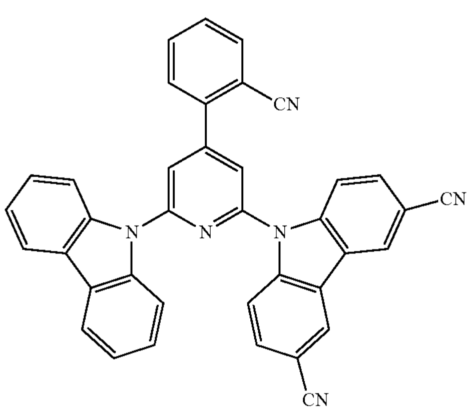
-continued
8
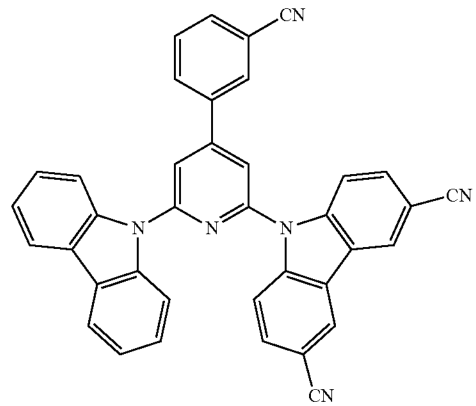
9
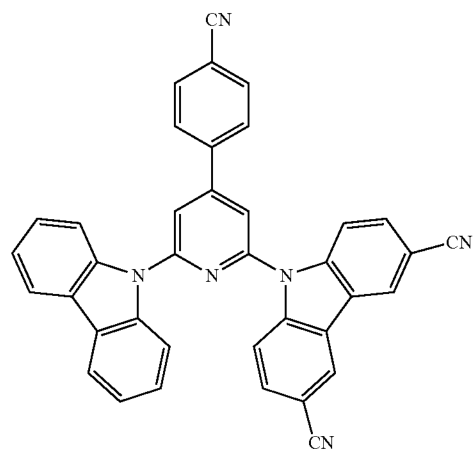
10
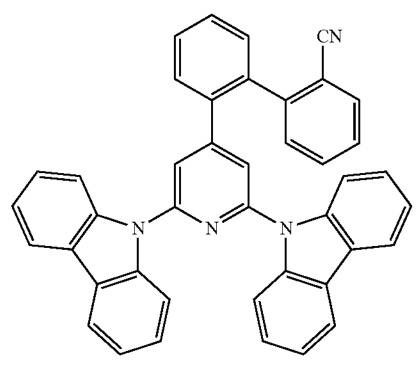
11
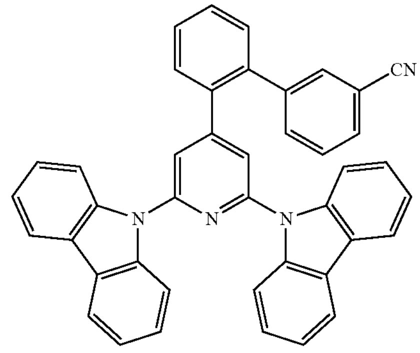

-continued
12
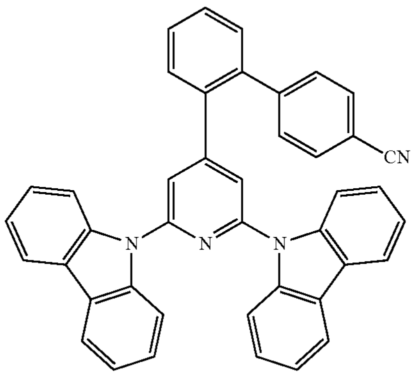
13
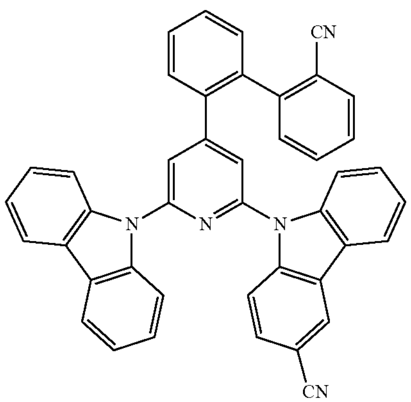
14
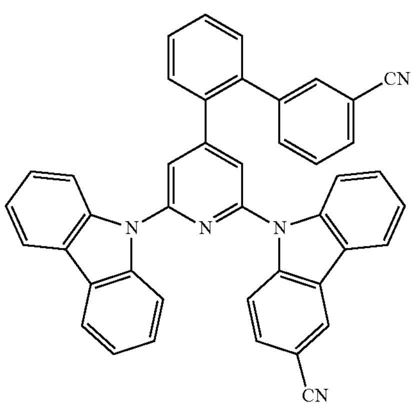
15
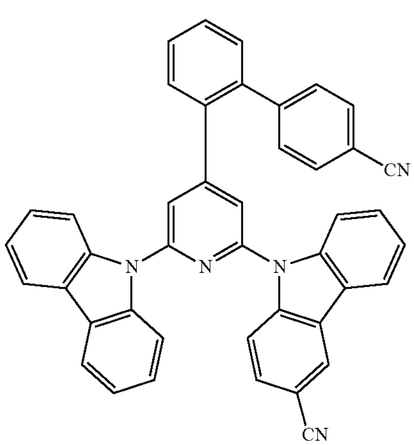
-continued
16
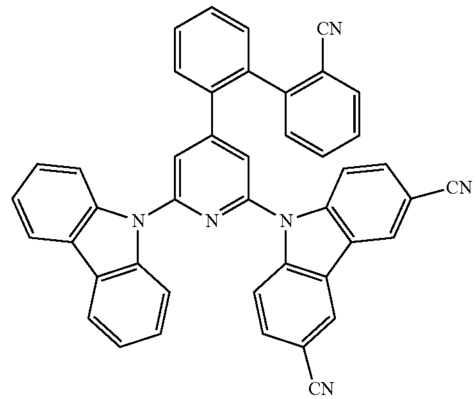
17
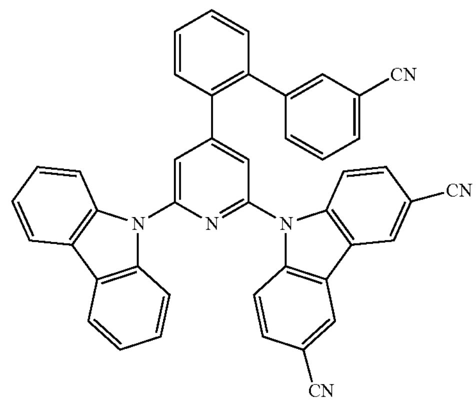
18
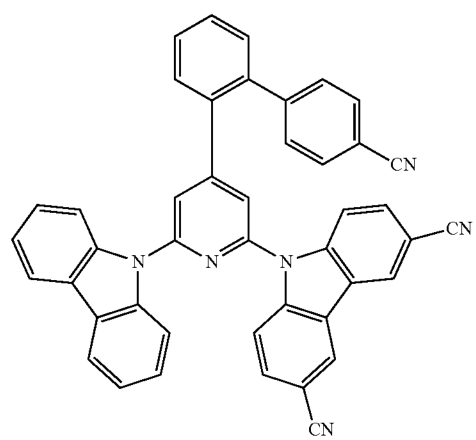
19
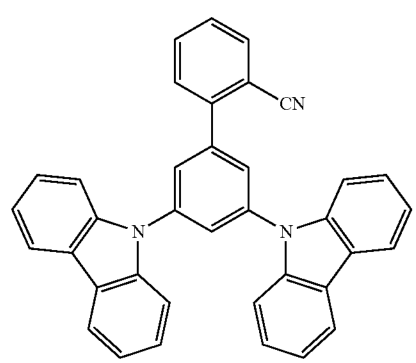

-continued
20
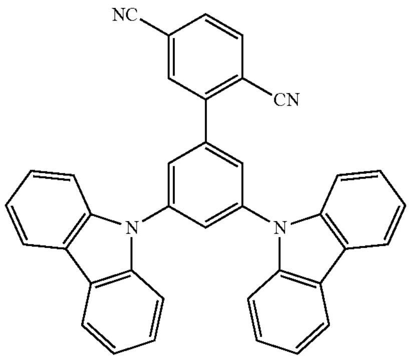
21
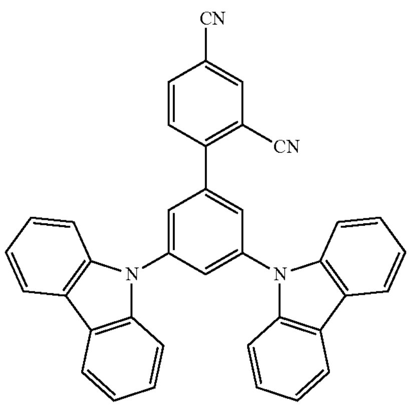
22
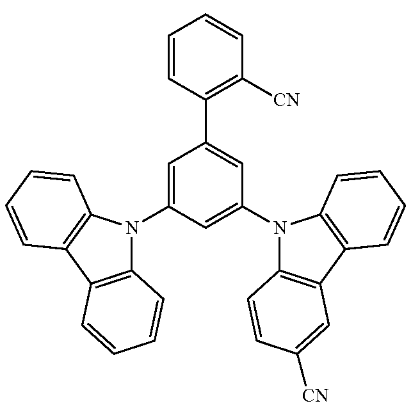
23
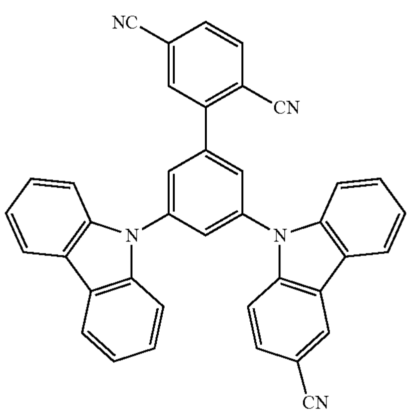
-continued
24
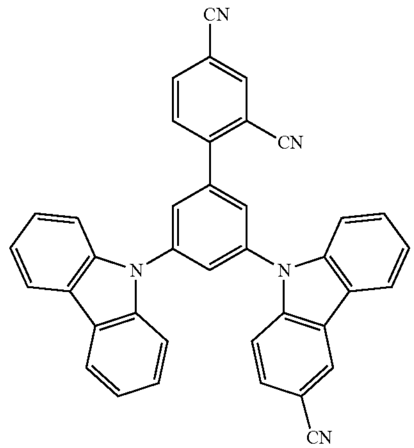
25
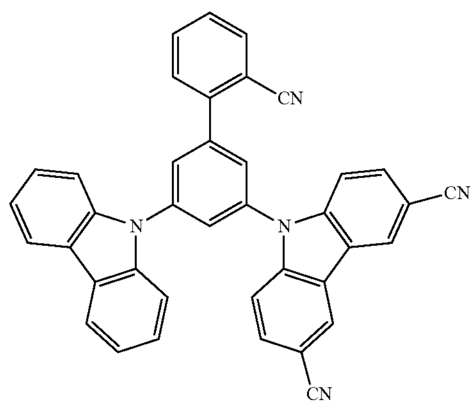
26
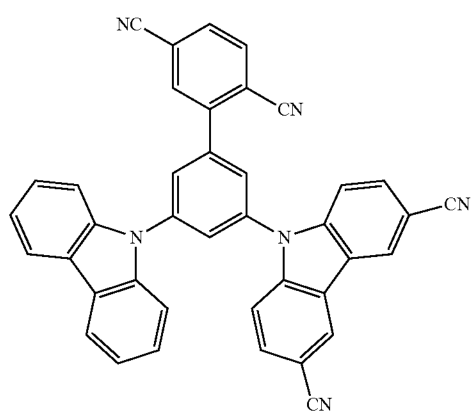

-continued
27
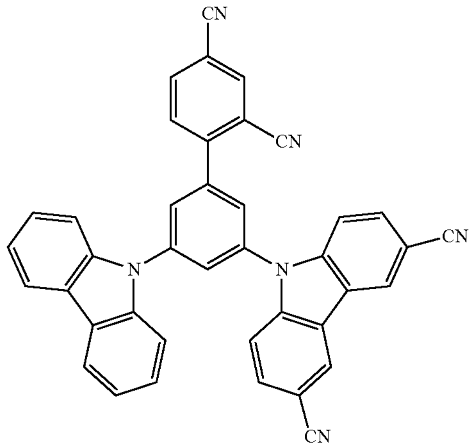
28
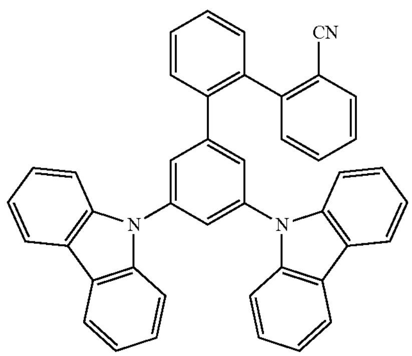
29
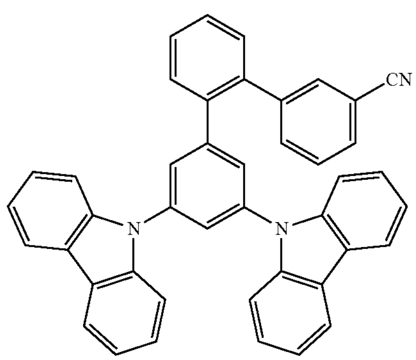
30
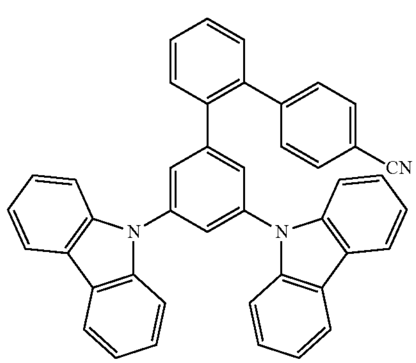
-continued
31
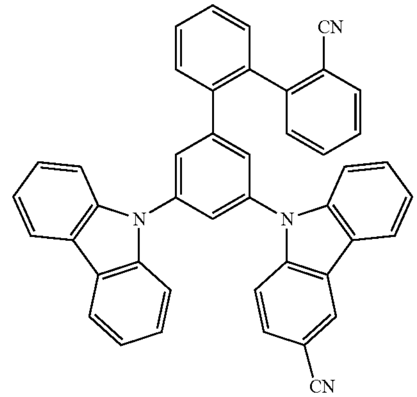
32
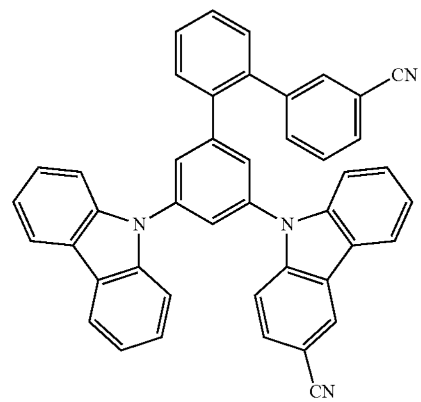
33
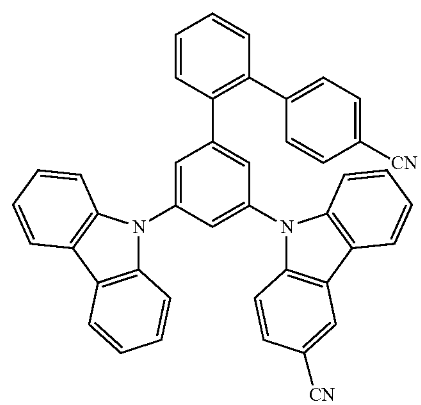
34
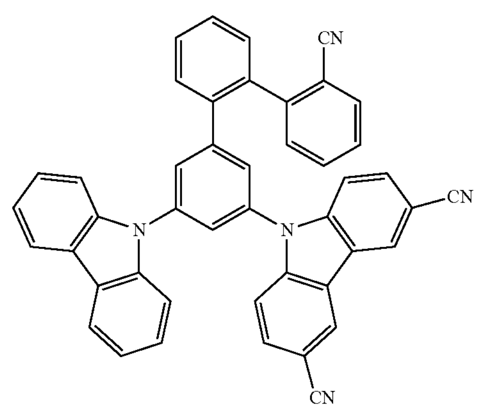

35
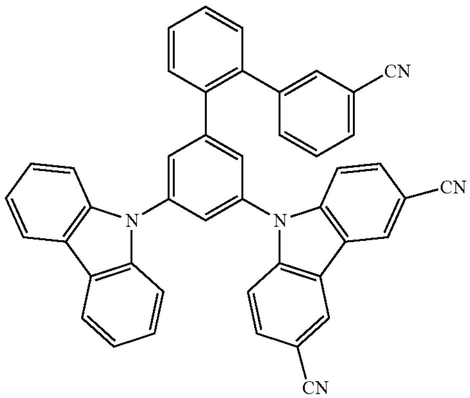
36
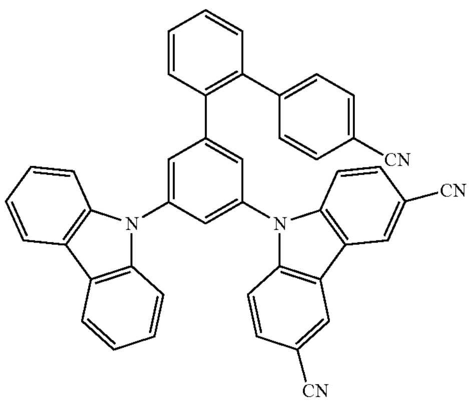
37
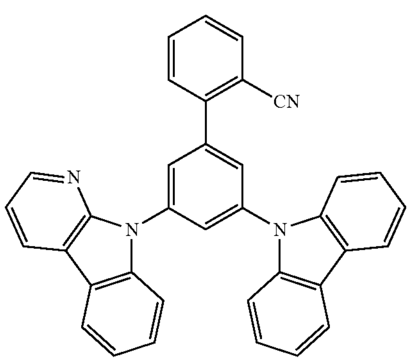
38
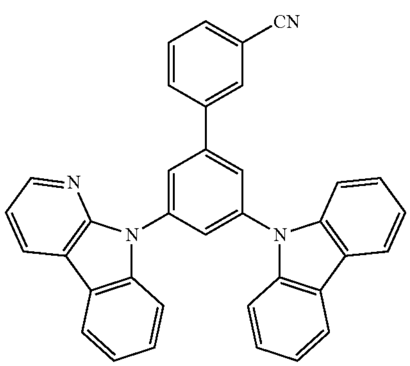
39
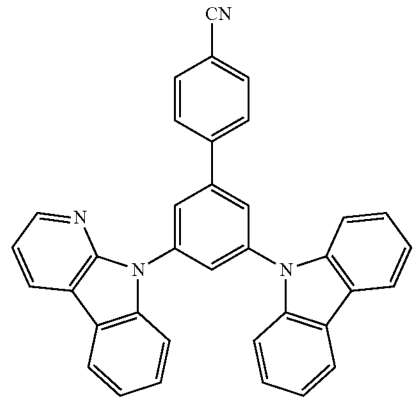
40
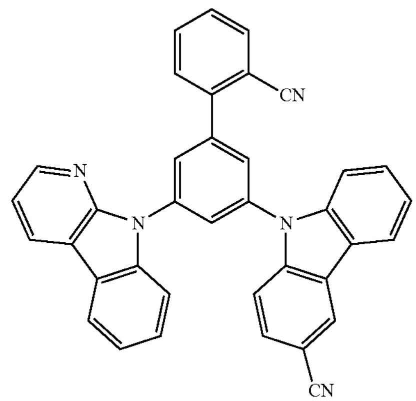
41
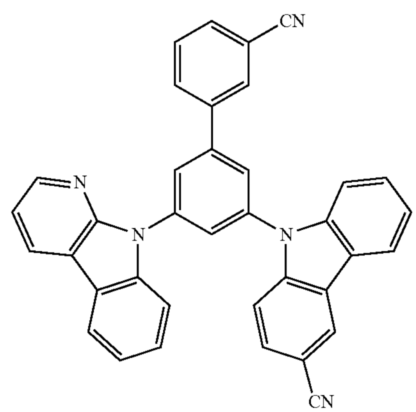
42
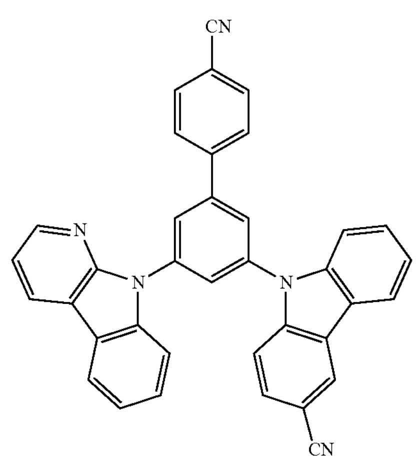

-continued
43
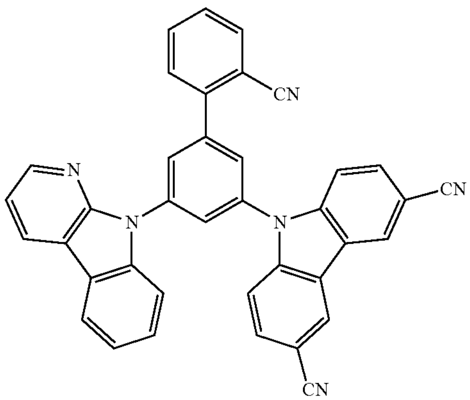
44
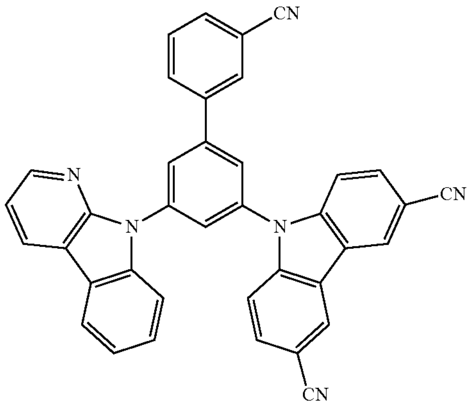
45
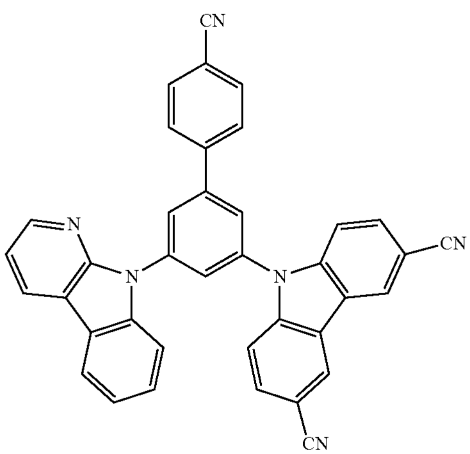
46
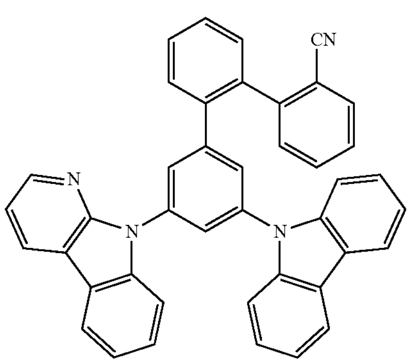
-continued
47
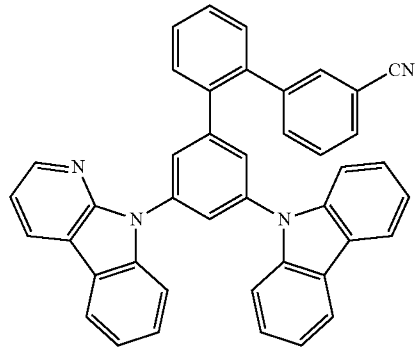
48
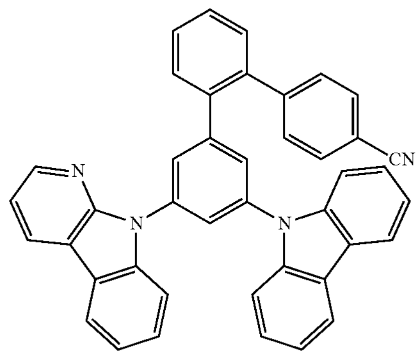
49
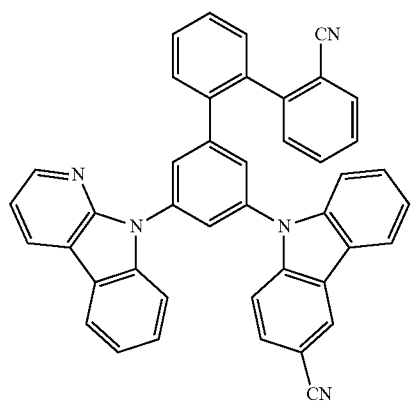
50
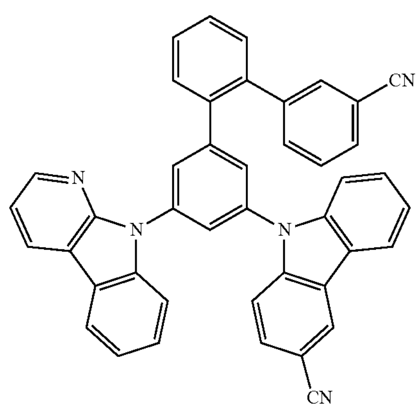

-continued
51
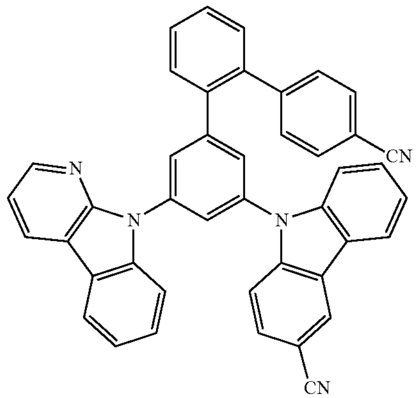
52
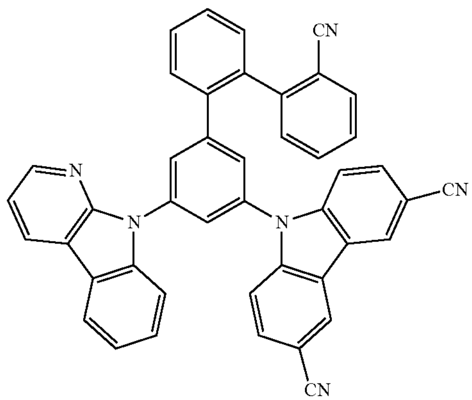
53
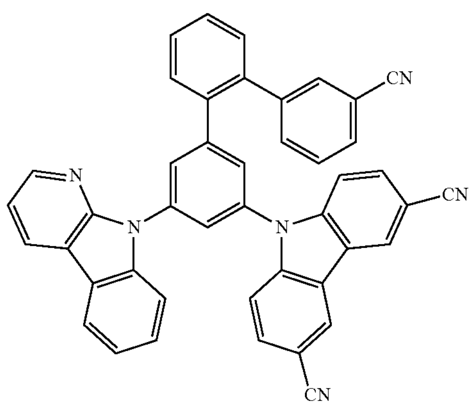
54
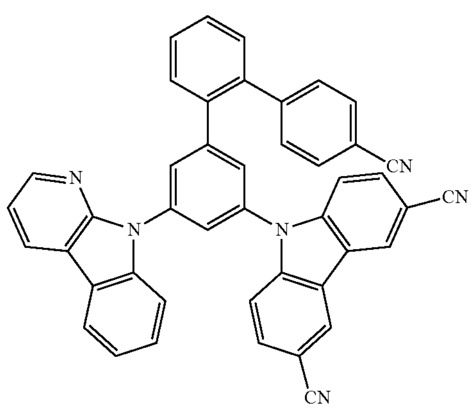
-continued
55
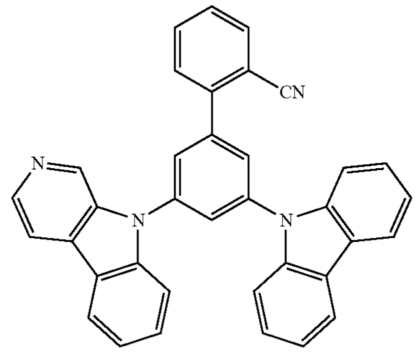
56
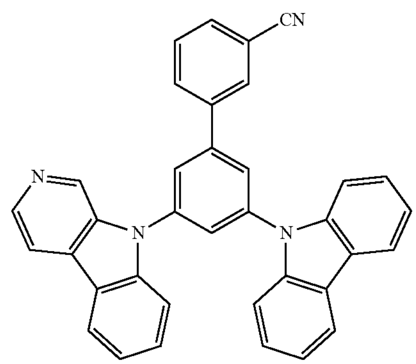
57
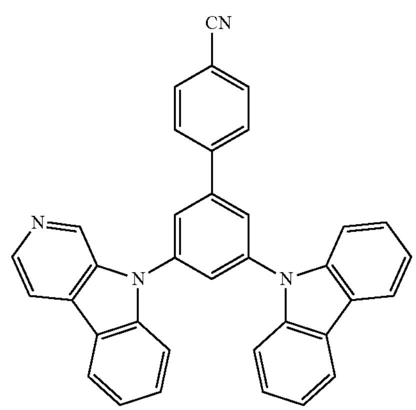
58
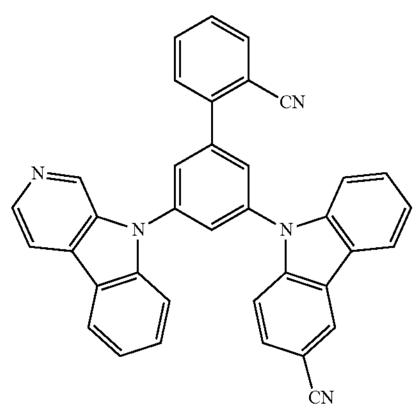

-continued
59
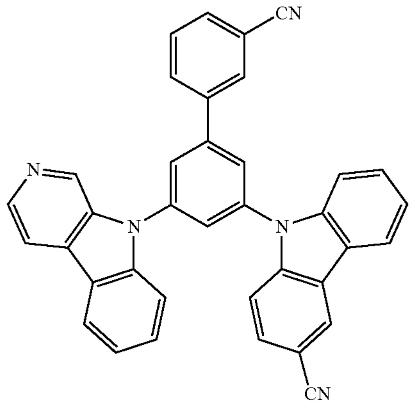
60
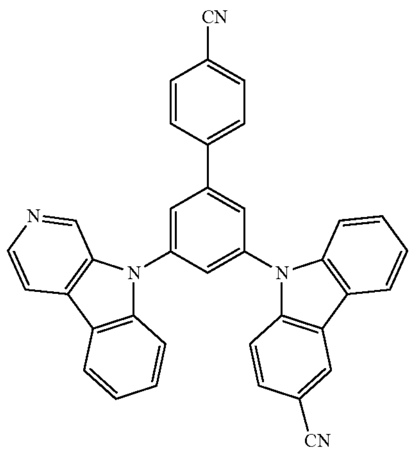
61
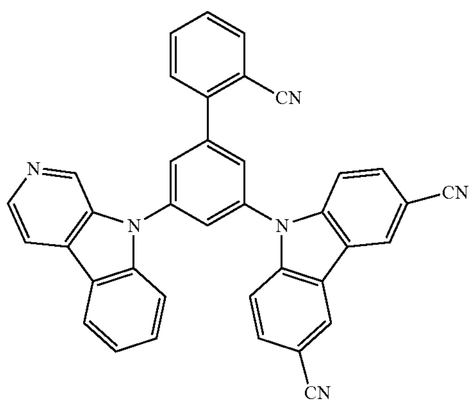
62
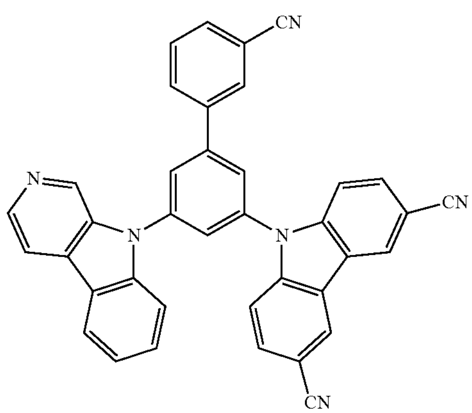
-continued
63
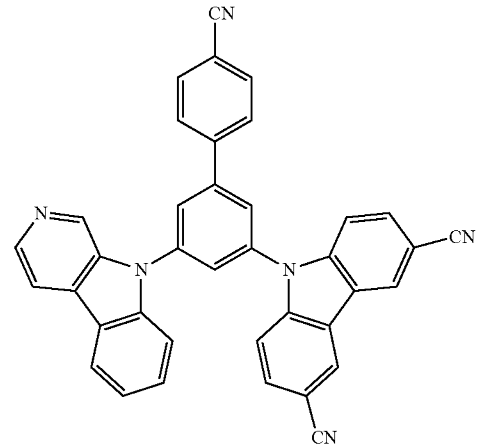
64
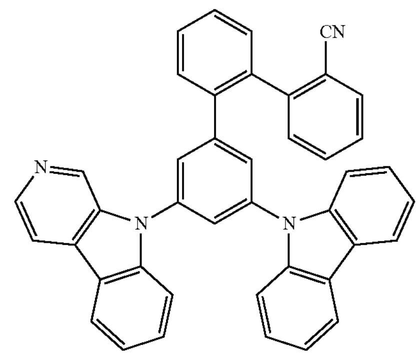
65
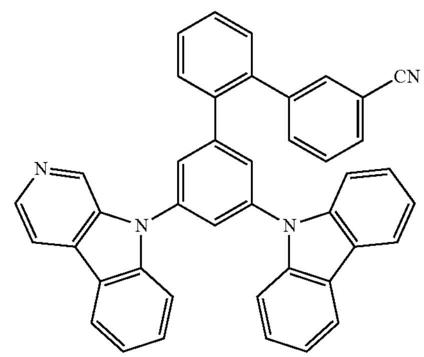
66
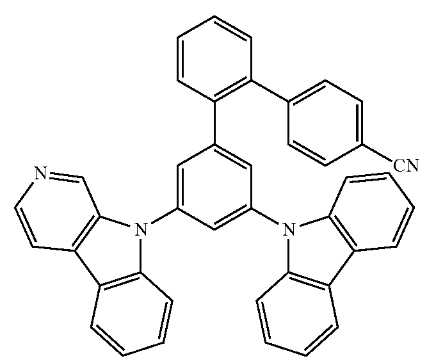

-continued
67
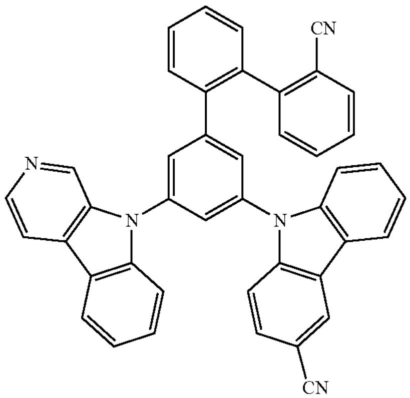
68
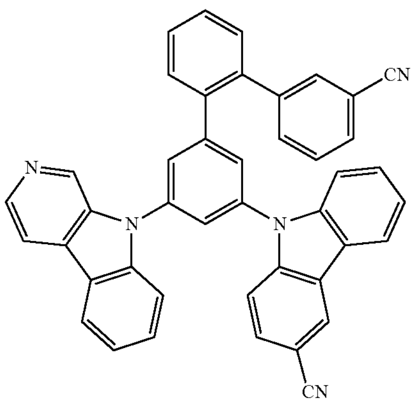
69
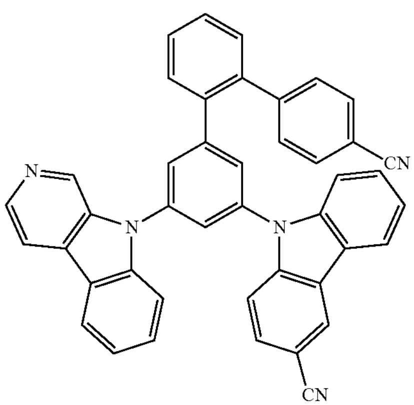
70
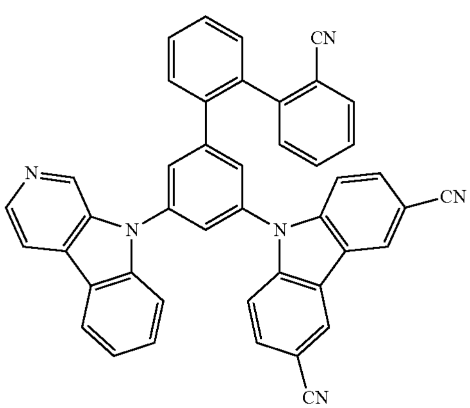
-continued
71
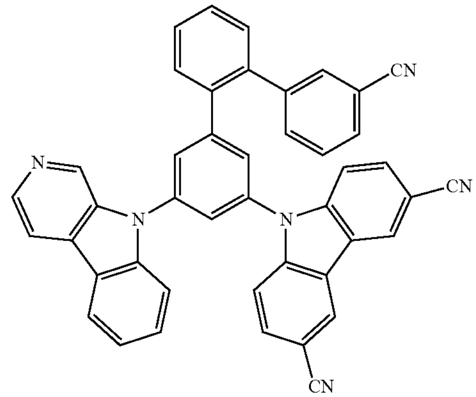
72
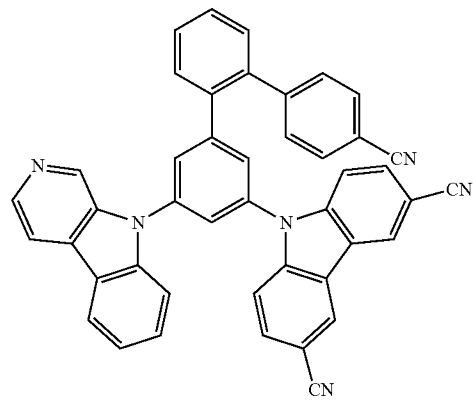
73
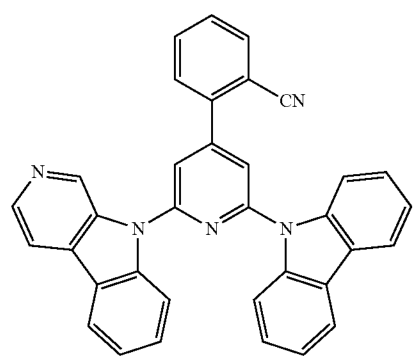
74
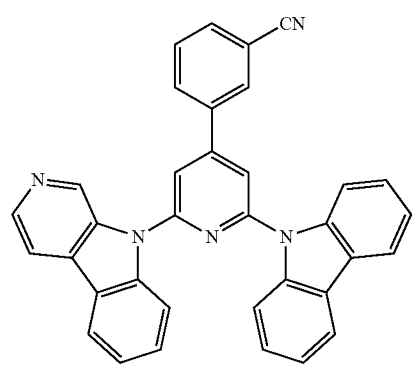

75
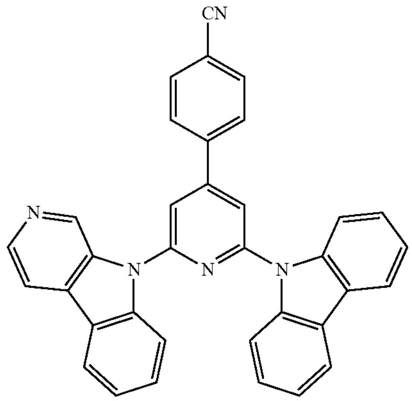
76
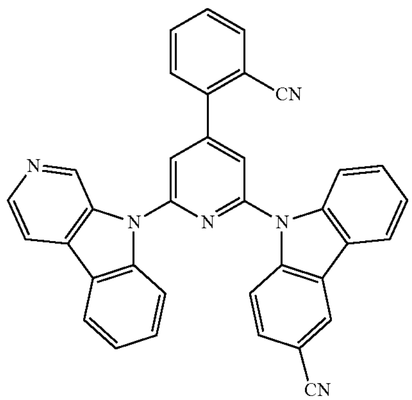
77
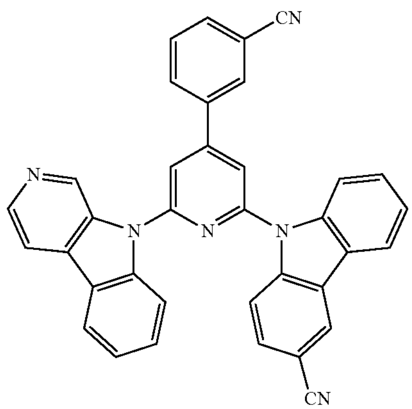
78
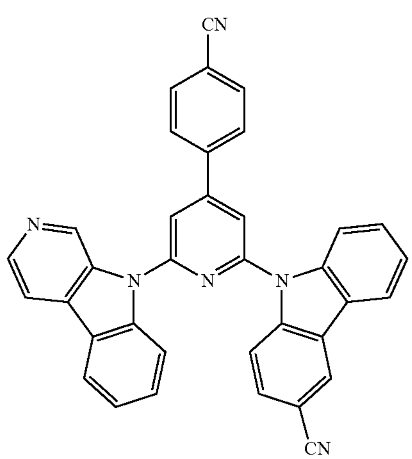
79
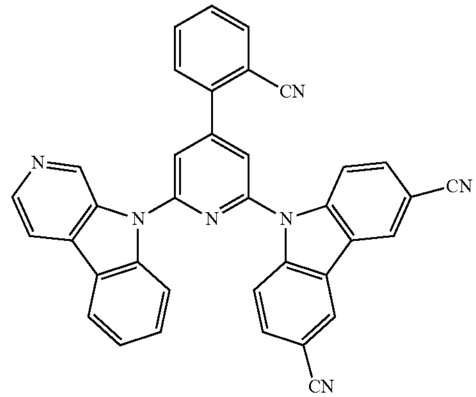
80
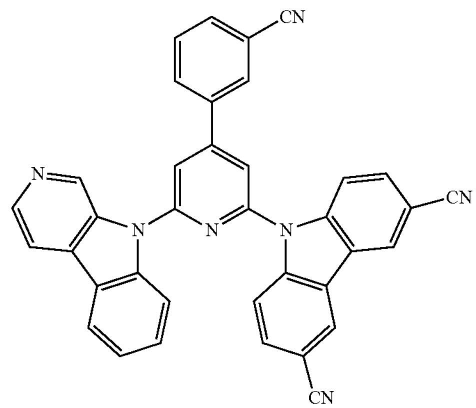
81
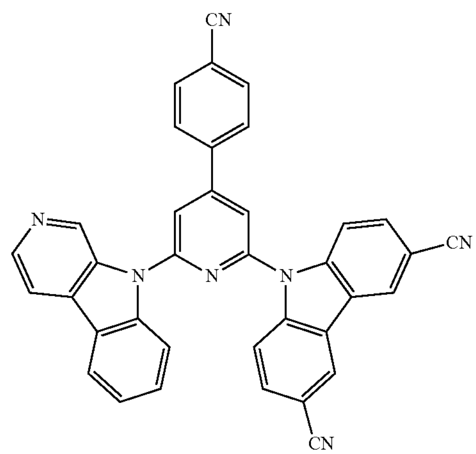
82
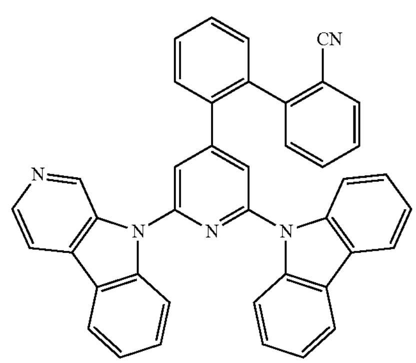

-continued
83
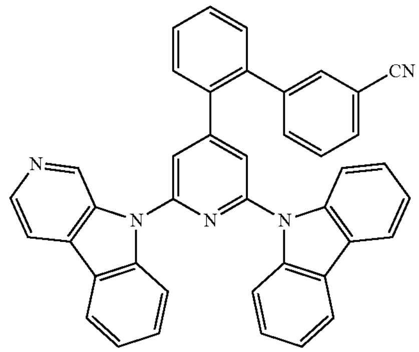
84
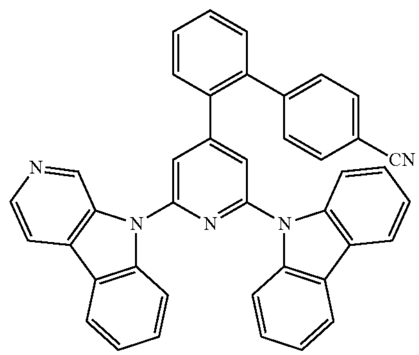
85
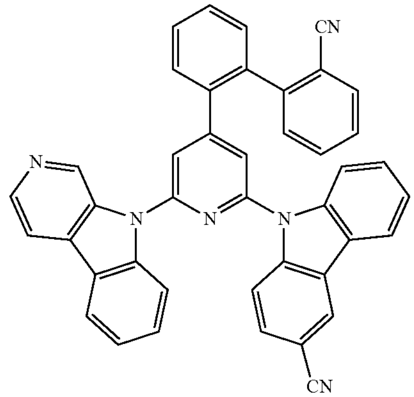
86
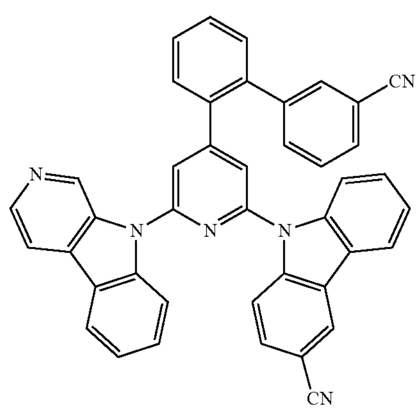
-continued
87
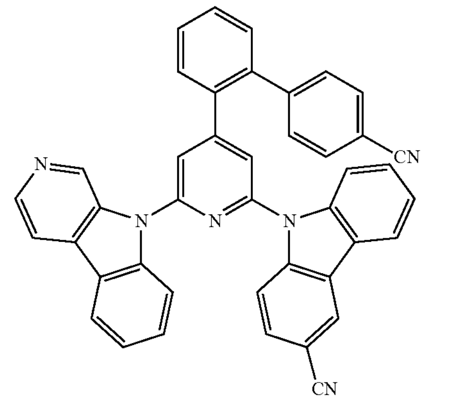
88
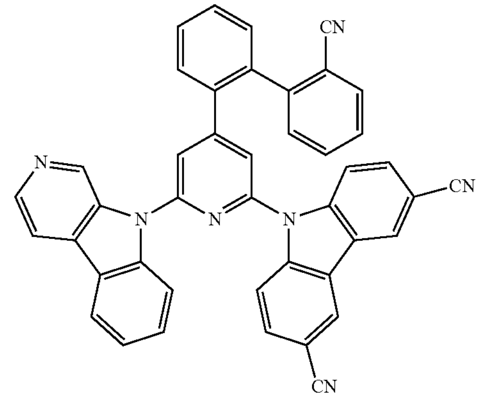
89
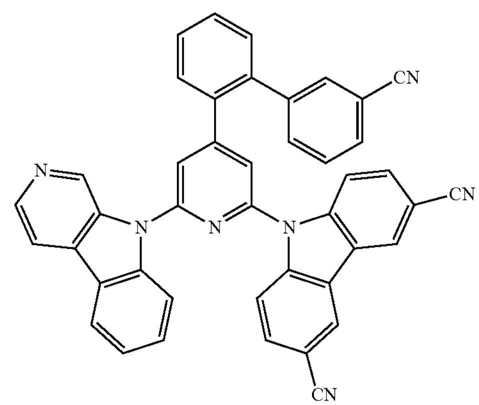
90
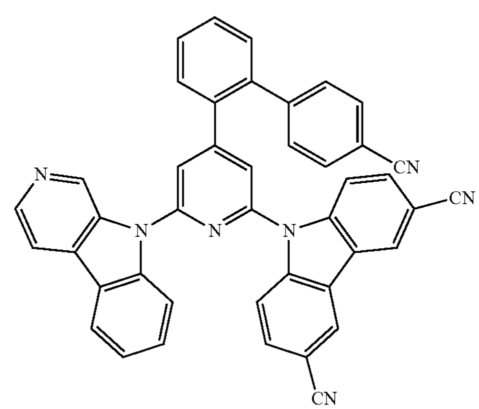

-continued
91
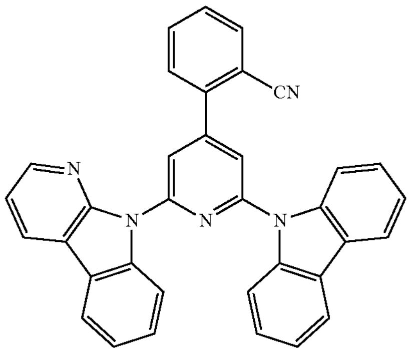
92
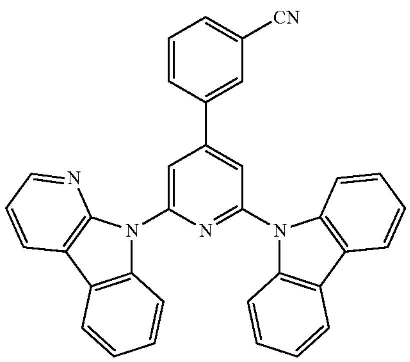
93
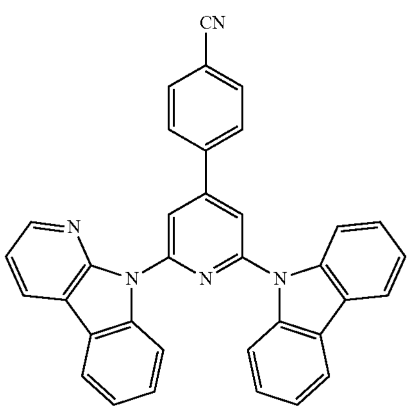
94
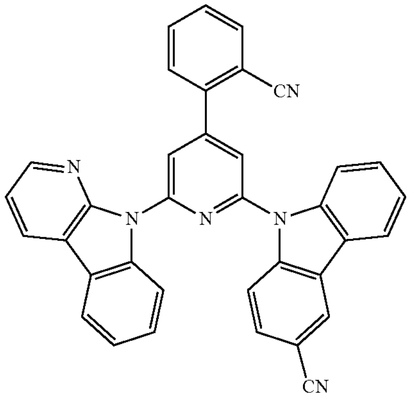
-continued
95
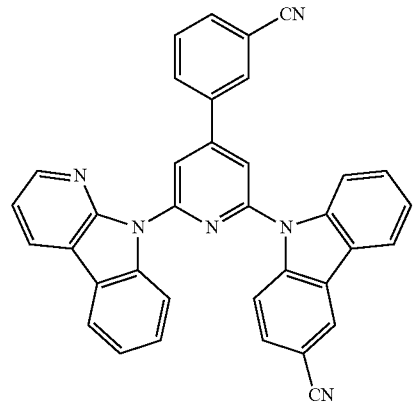
96
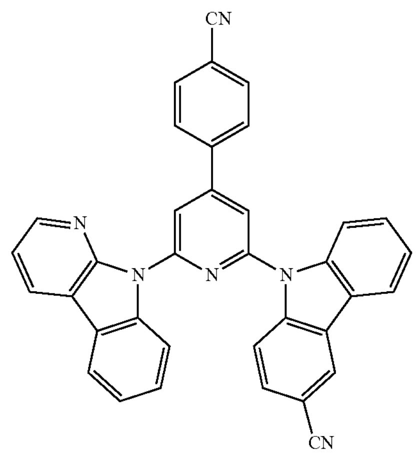
97
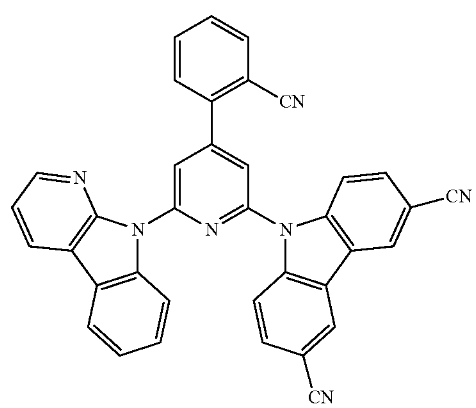
98
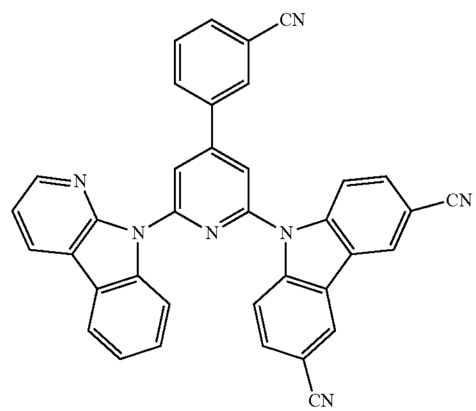

99
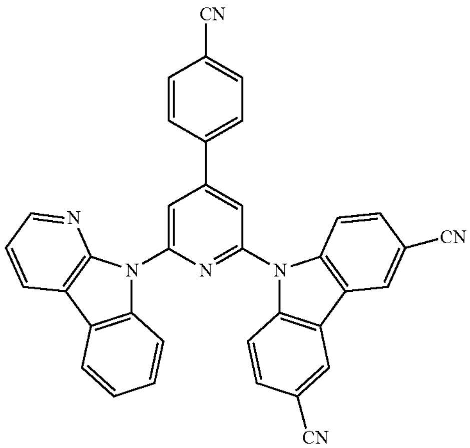
100
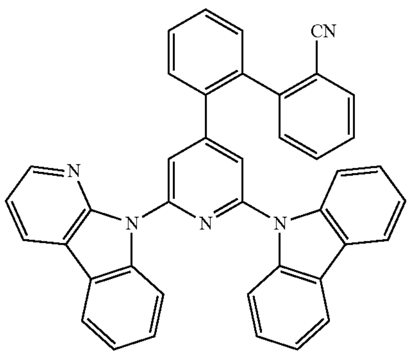
101
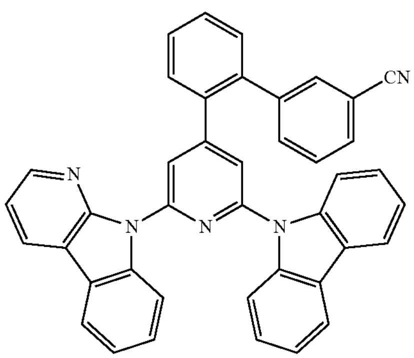
102
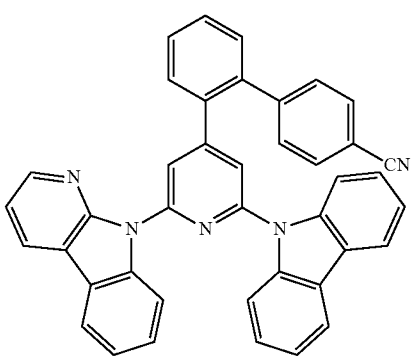
103
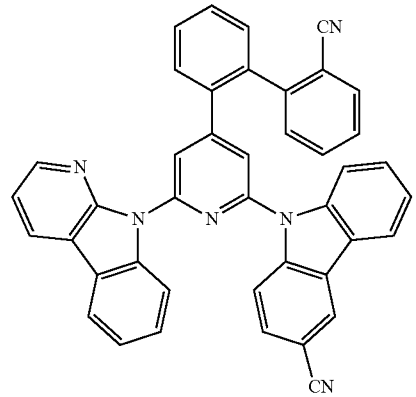
104
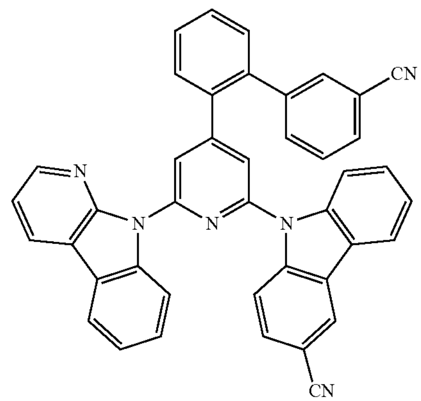
105
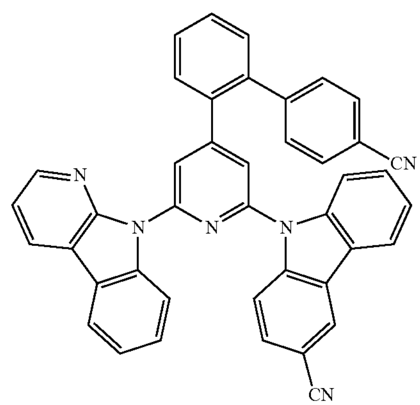
106
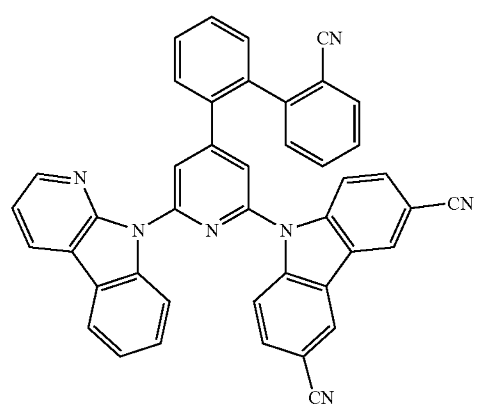

-continued
107
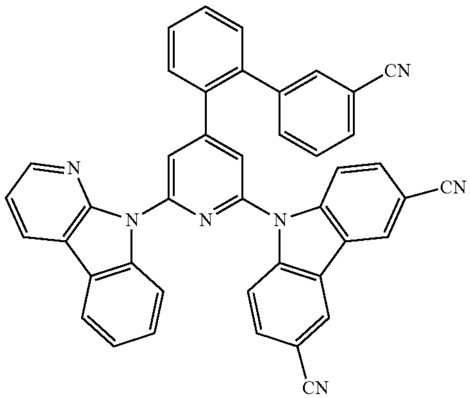
108
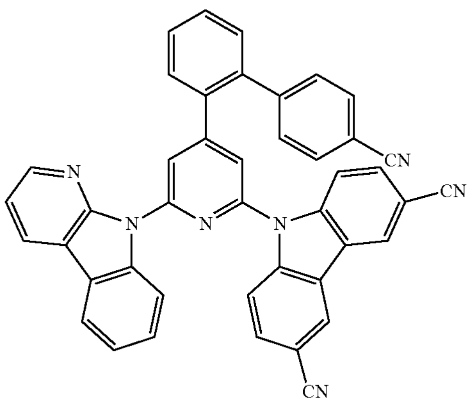
109
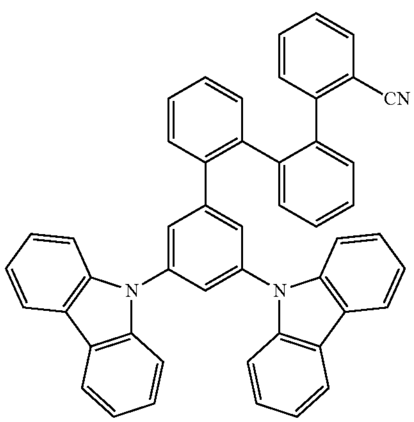
110
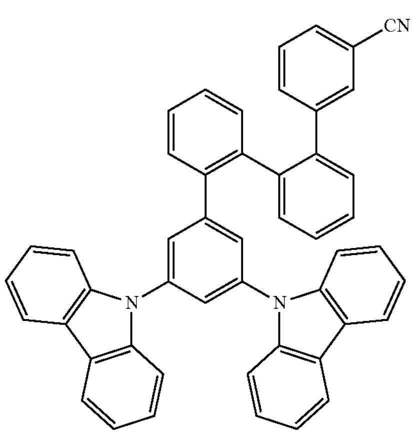
-continued
111
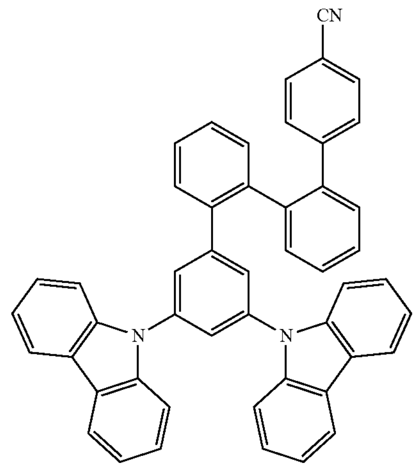
112
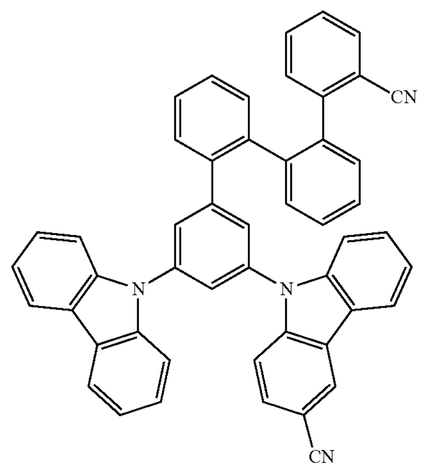
113
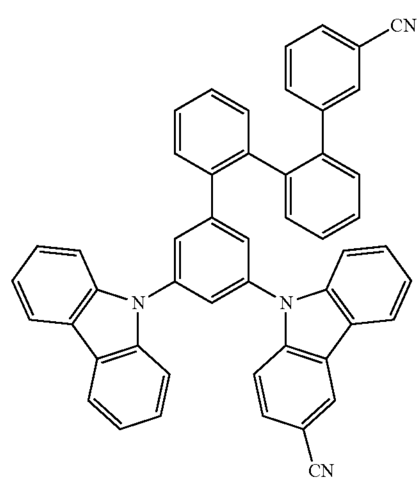

114
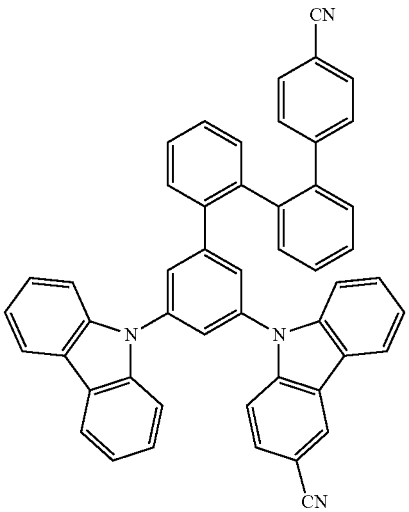
115
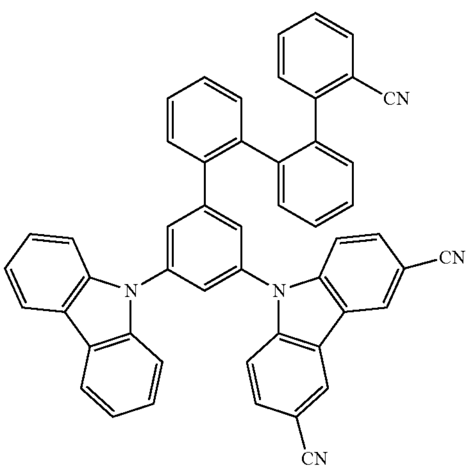
116
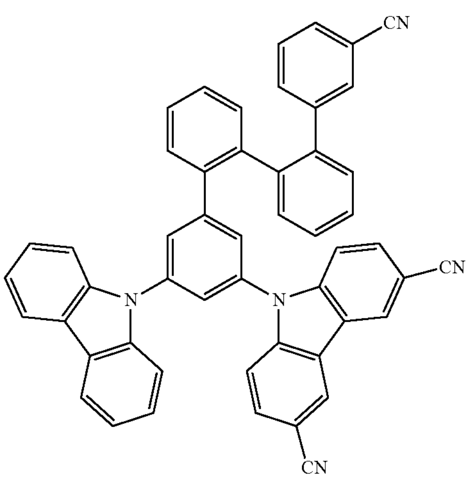
117
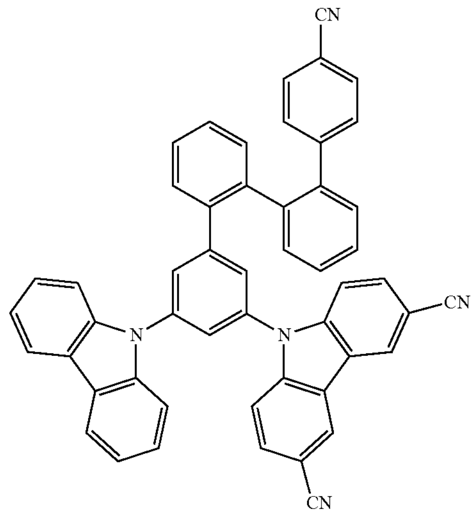
118
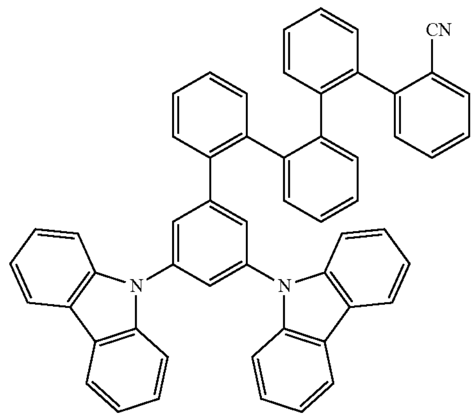
119
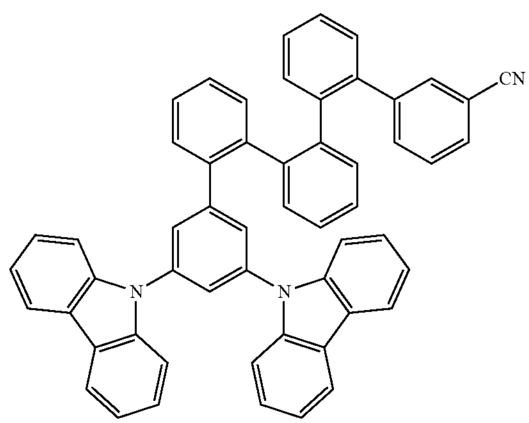

-continued
120
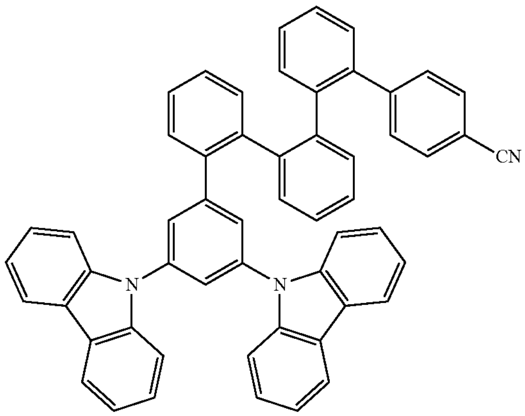
121
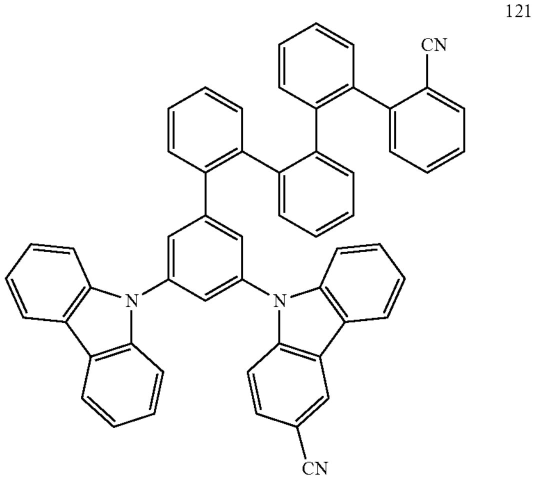
122
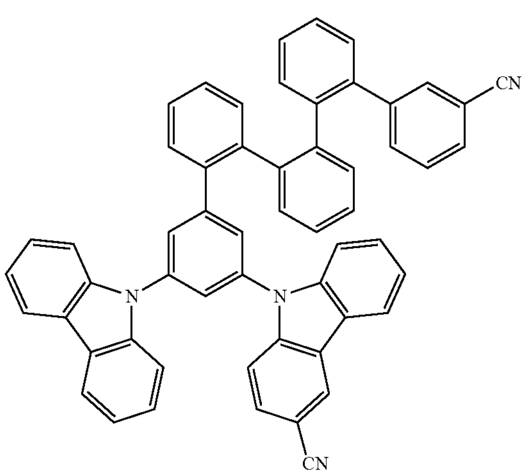
-continued
123
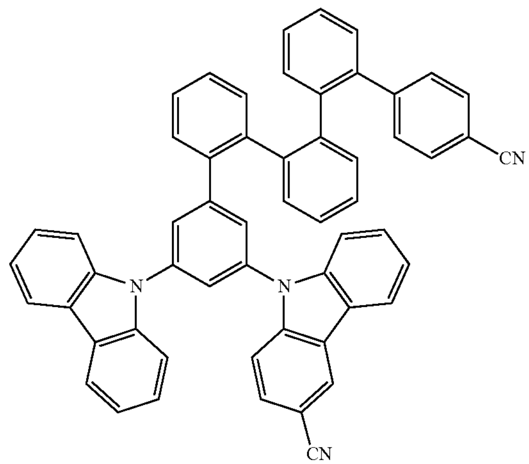
124
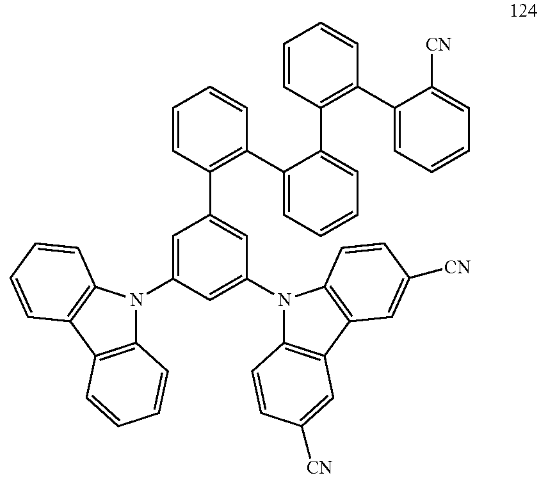
125
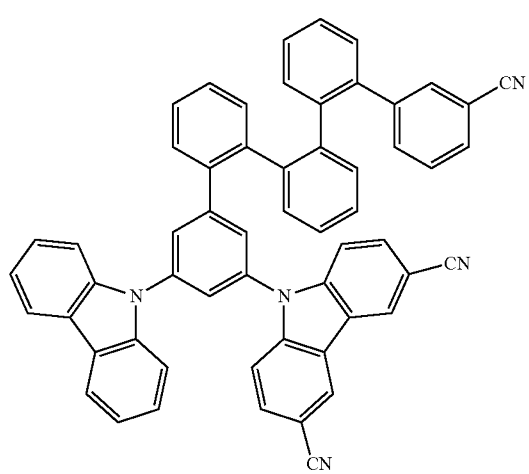

-continued
126
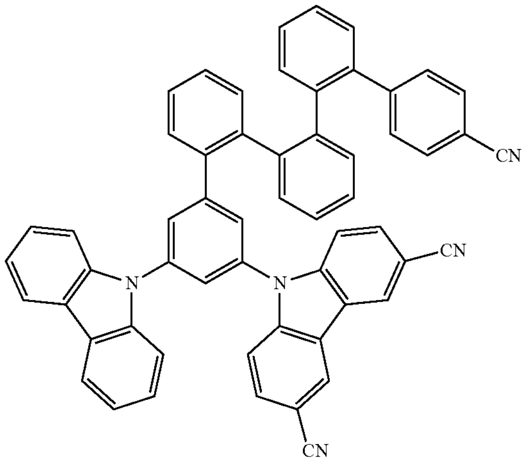
127
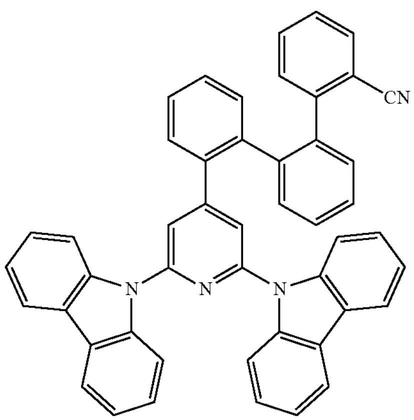
128
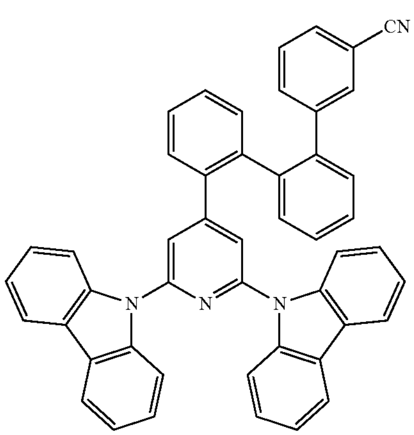
-continued
129
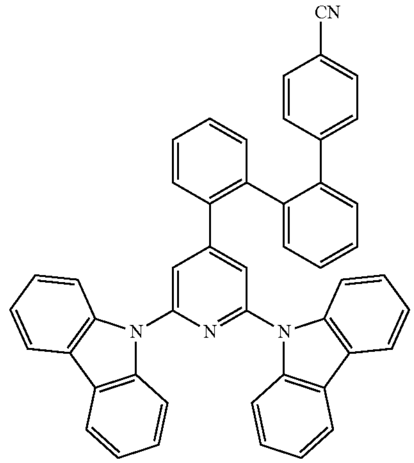
130
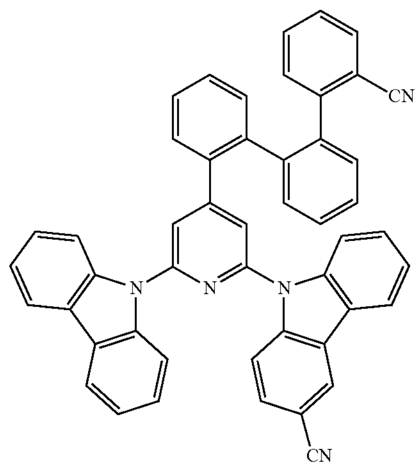
131
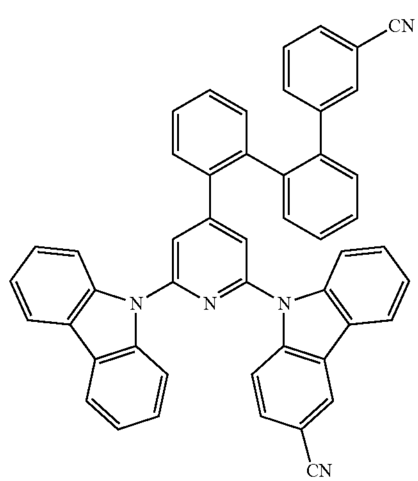

132
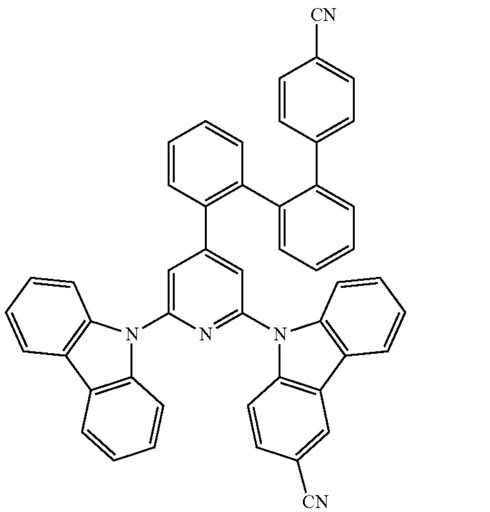
133
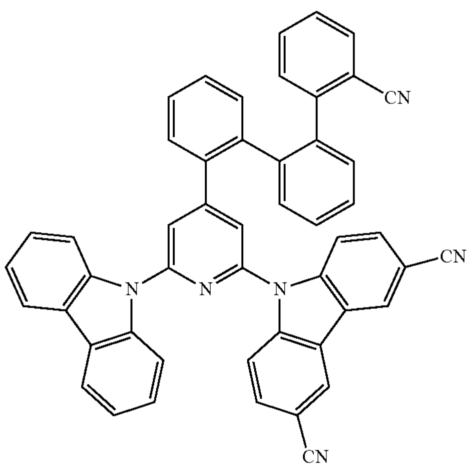
134
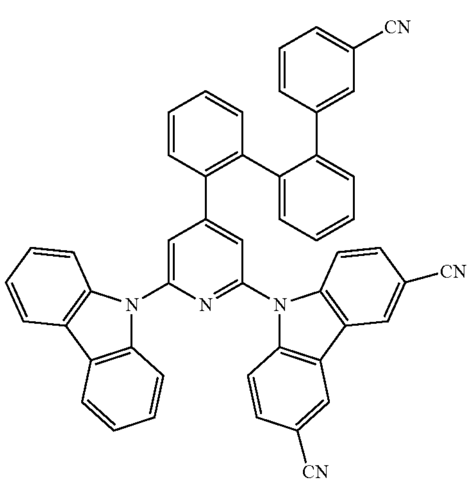
135
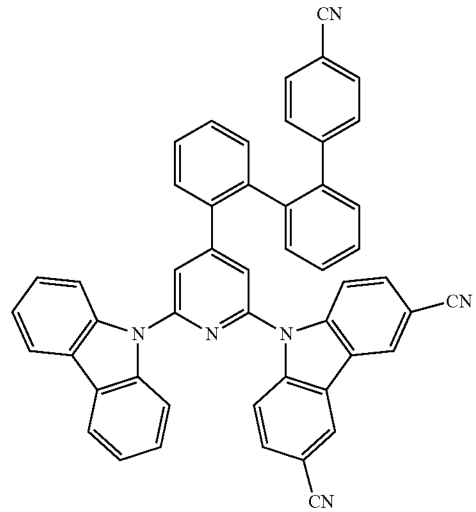
136
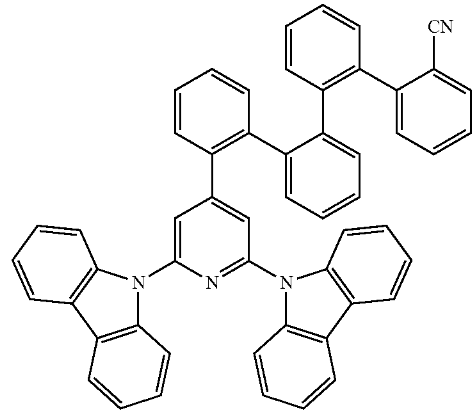
137
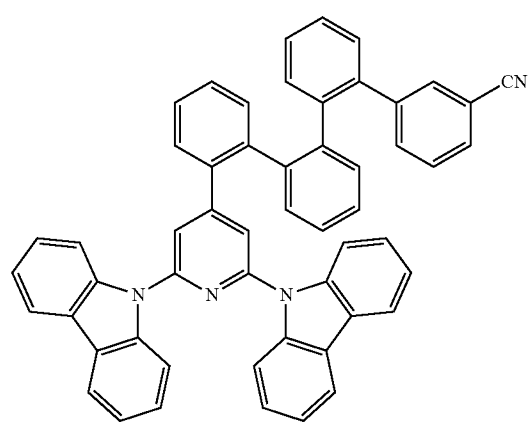

-continued
138
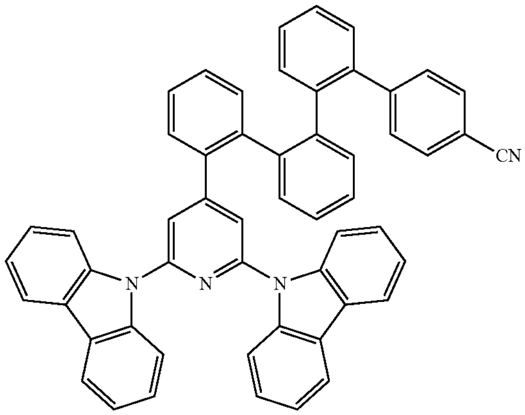
139
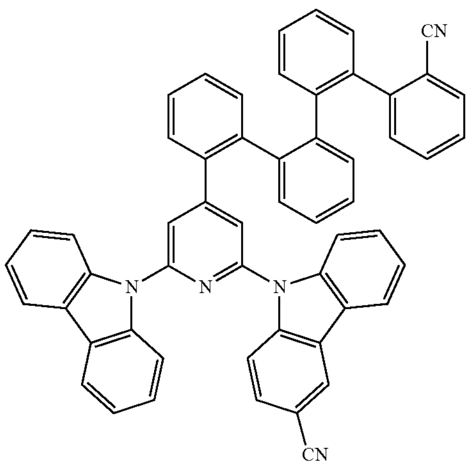
140
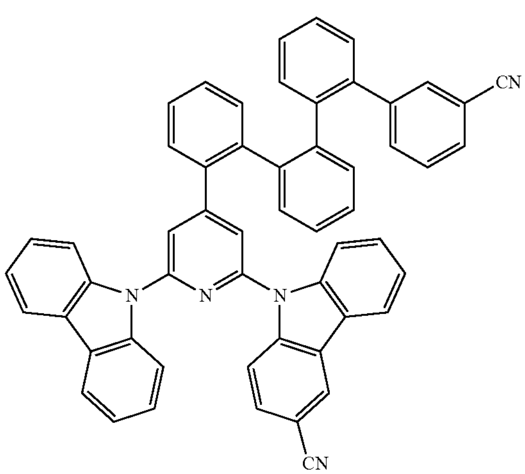
-continued
141
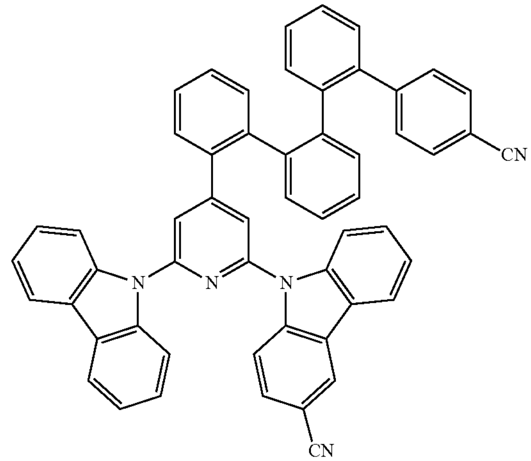
142
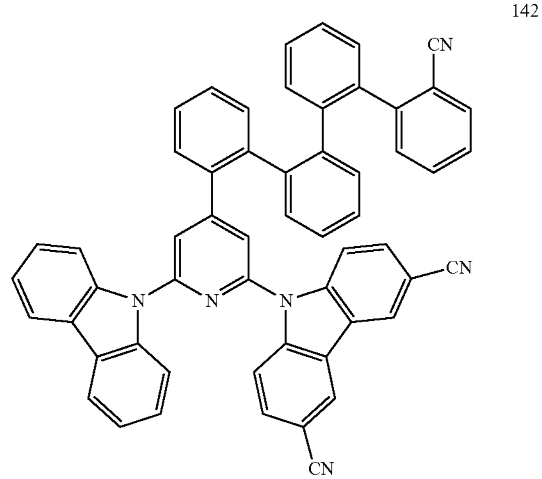
143
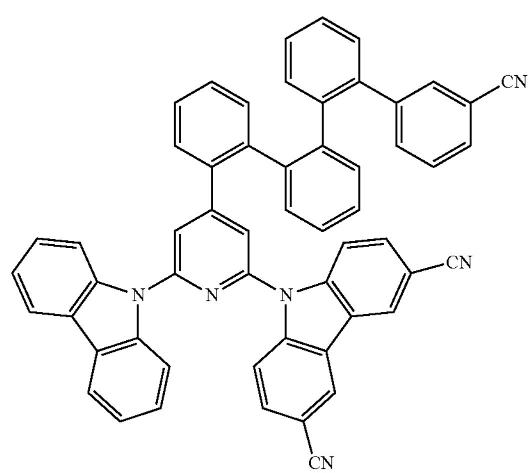

144
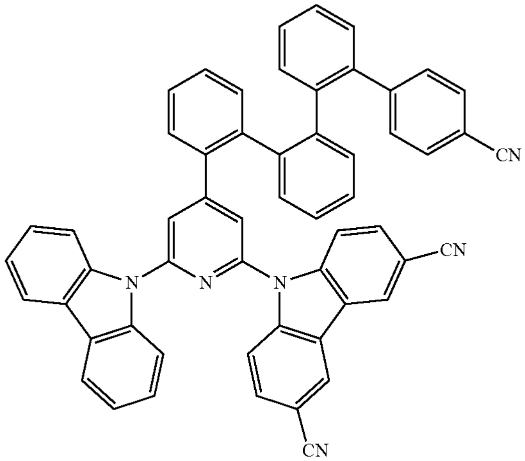
145
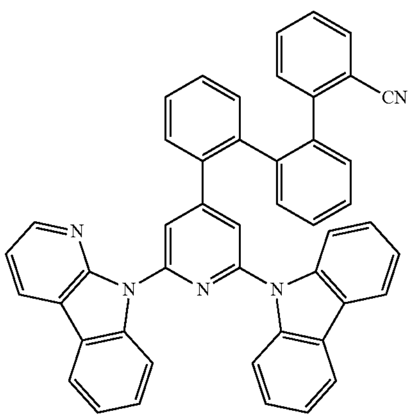
146
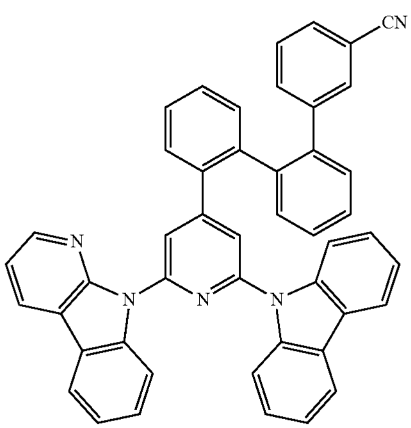
147
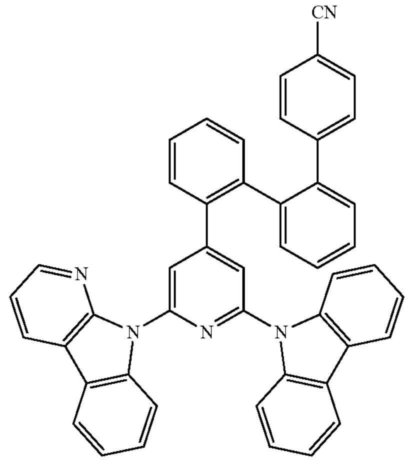
148
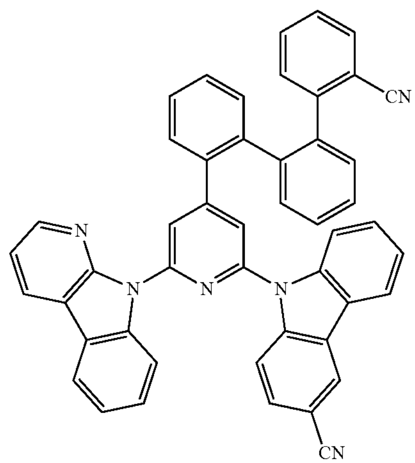
149
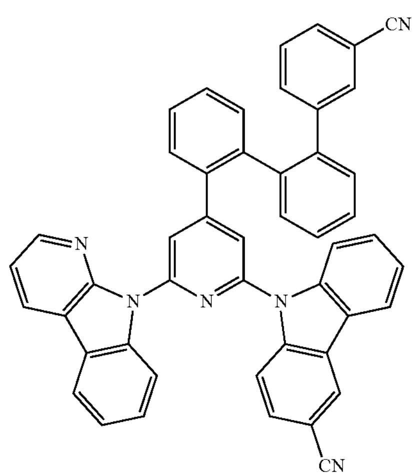

-continued
150
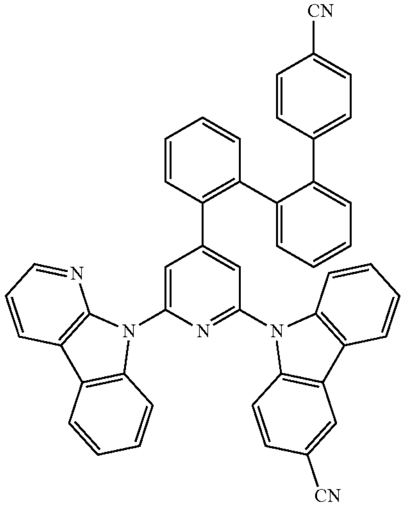
151
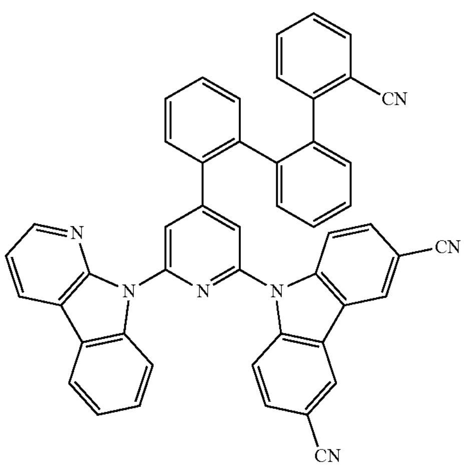
152
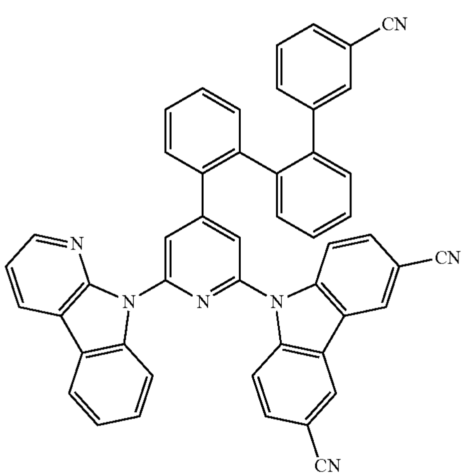
-continued
153
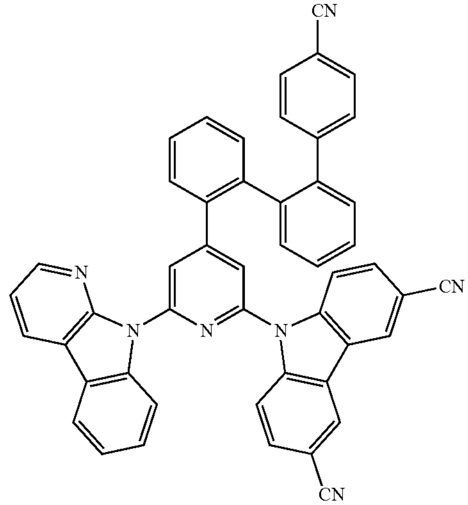
154
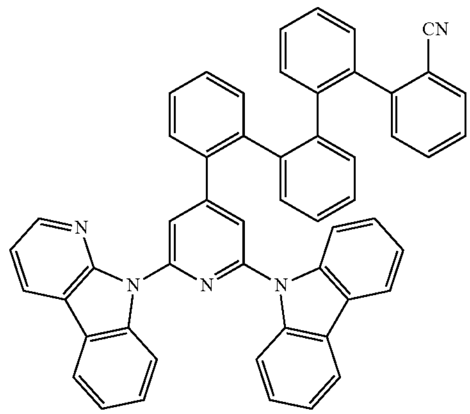
155
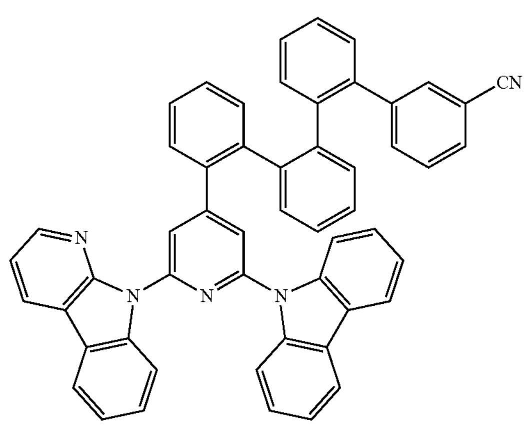

156
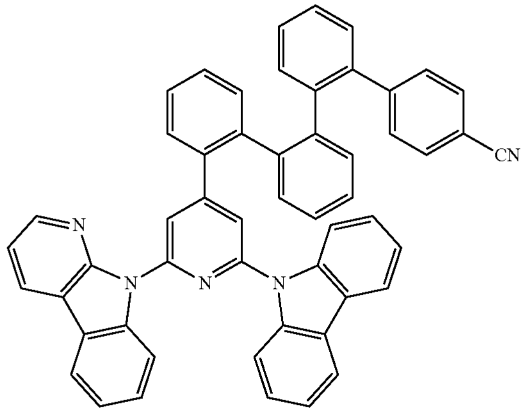
157
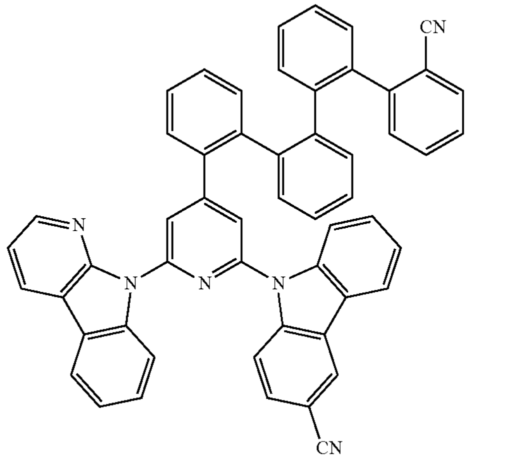
158
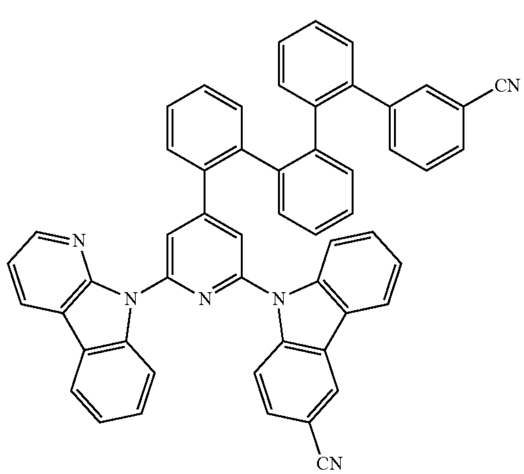
159
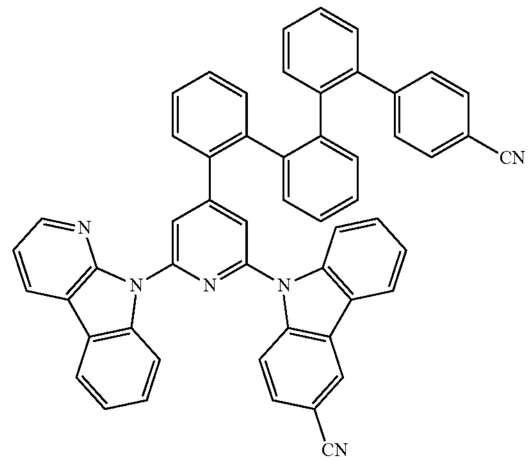
160
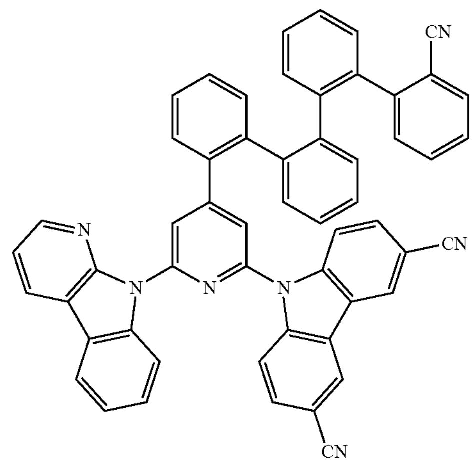
161
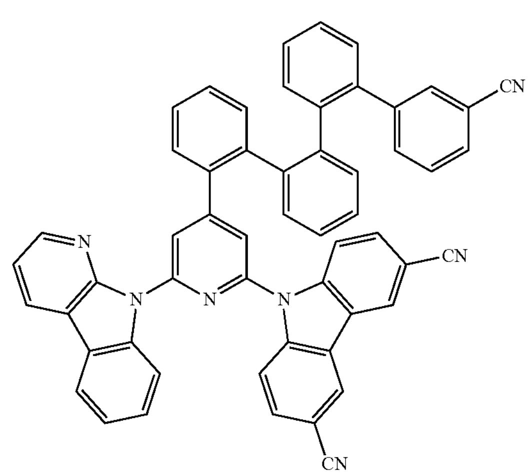

-continued
162
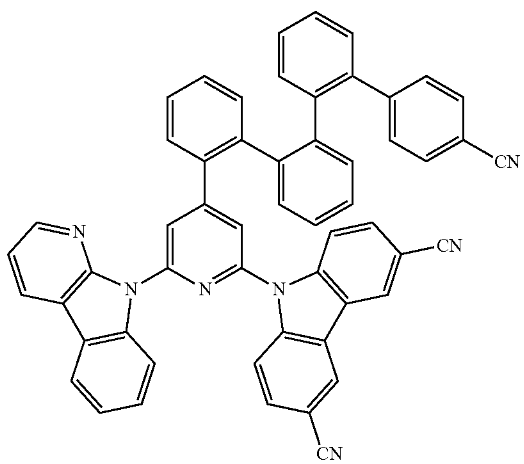
163
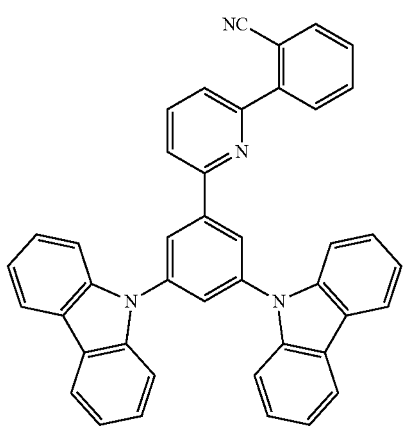
164
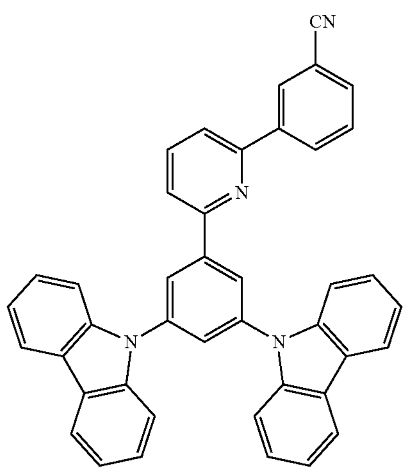
-continued
165
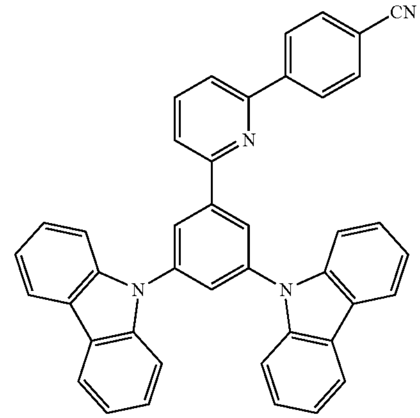
166
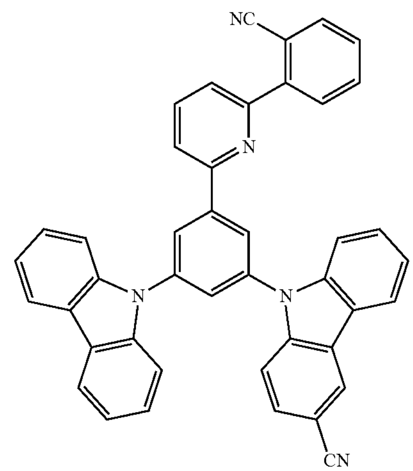
167
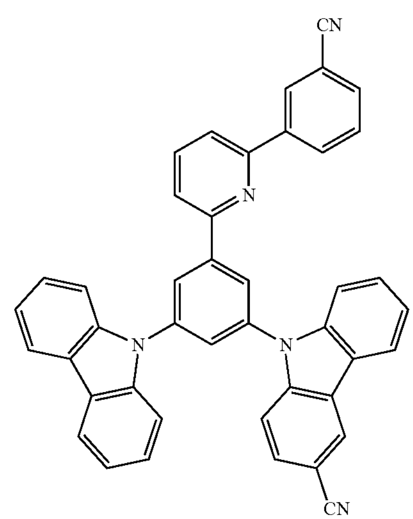

-continued
168
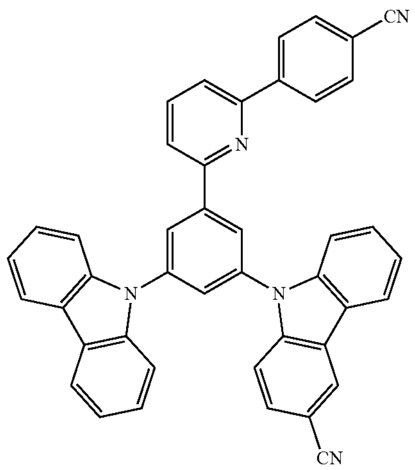
169
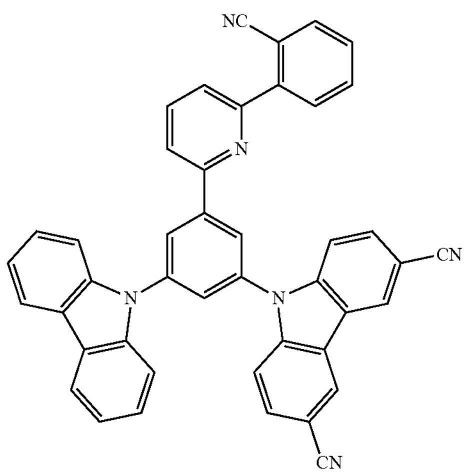
170
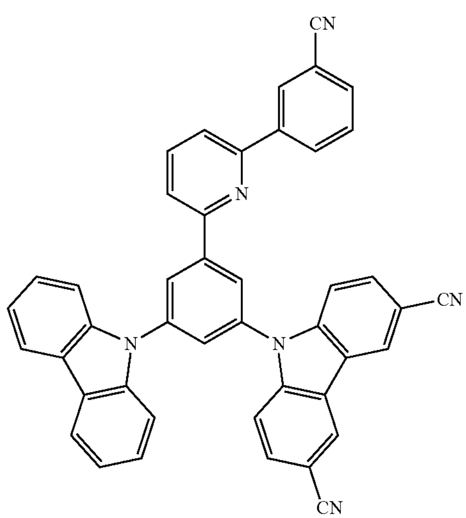
-continued
171
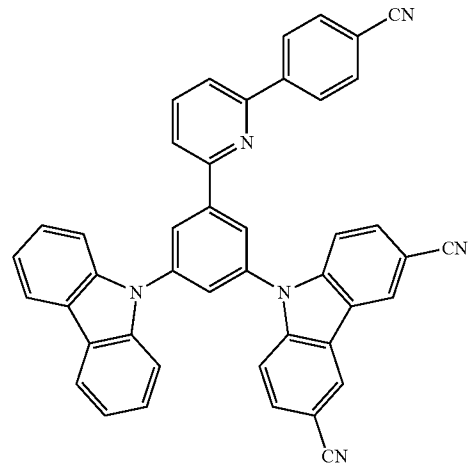
172
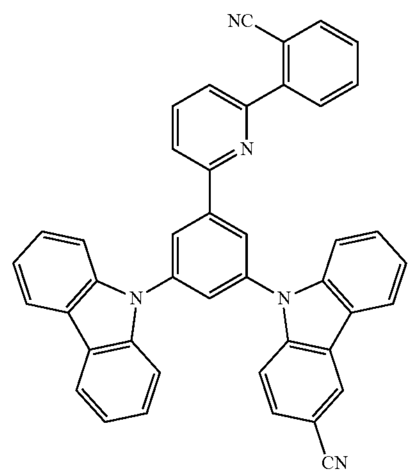
173
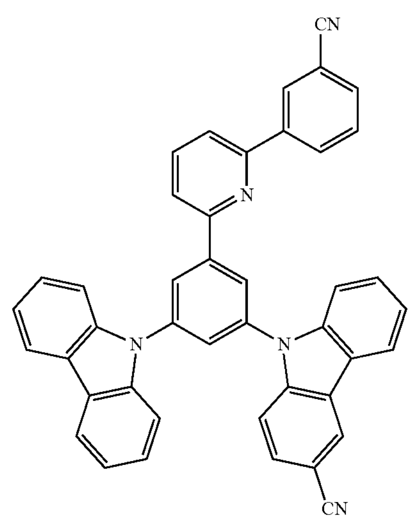

-continued
174
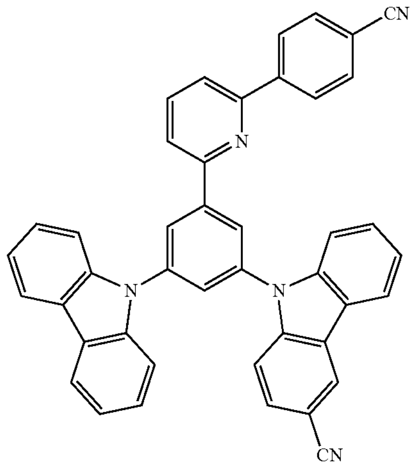
175
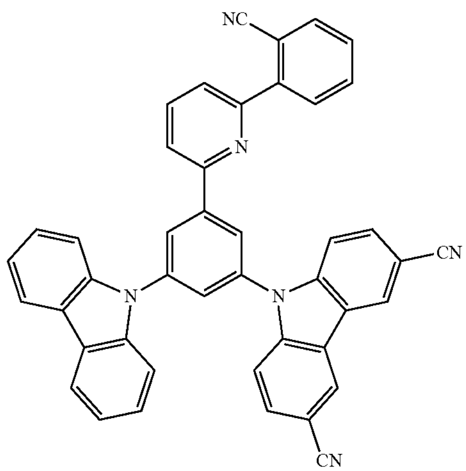
176
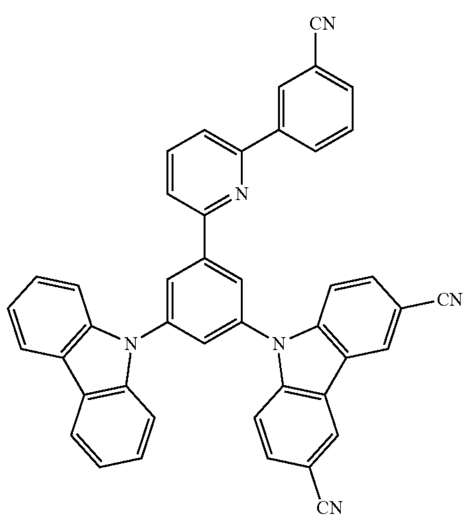
-continued
177
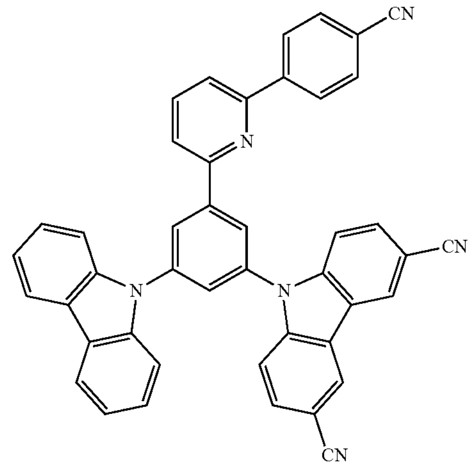
178
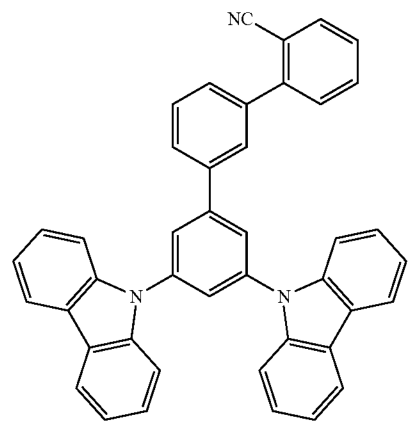
179
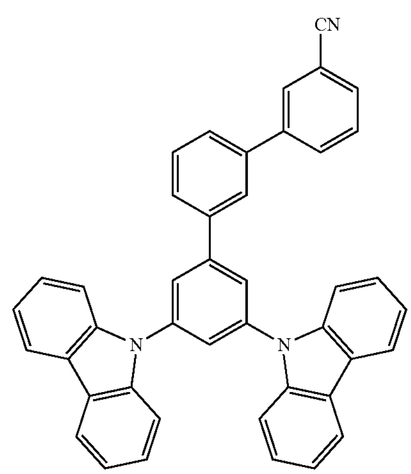

180
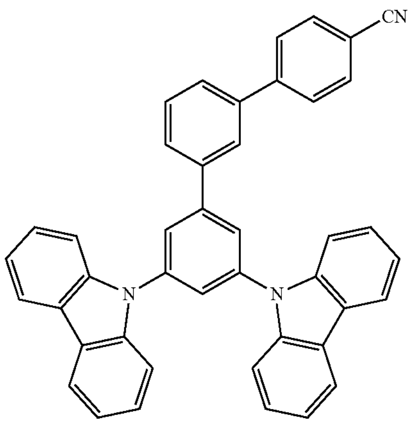
181
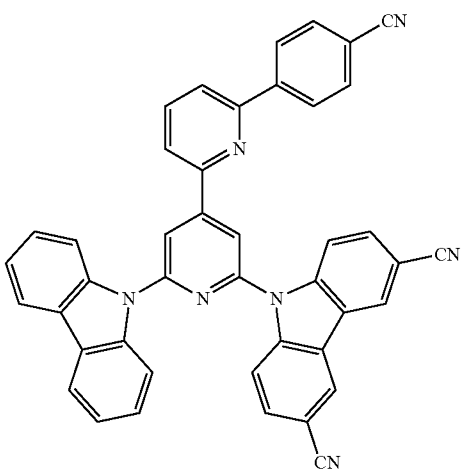
182
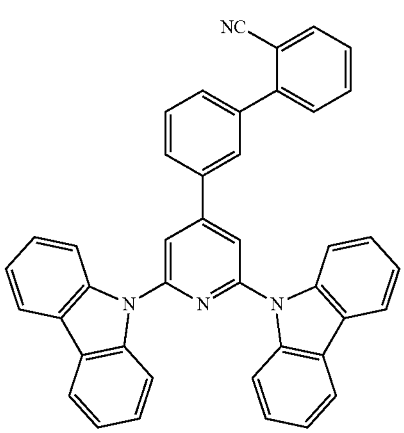
183
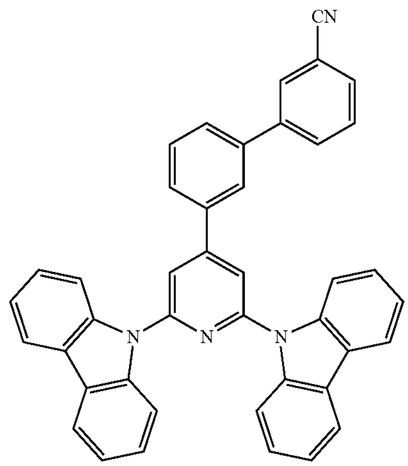
184
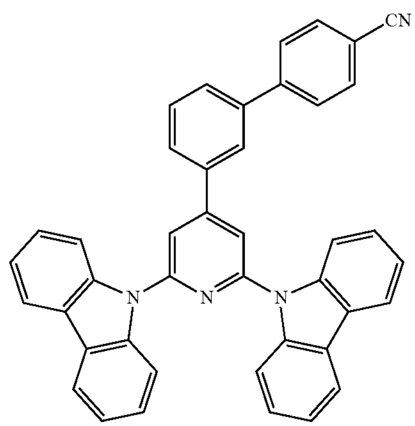
185
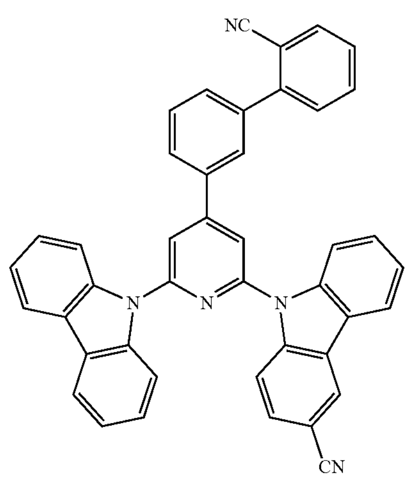

-continued
186
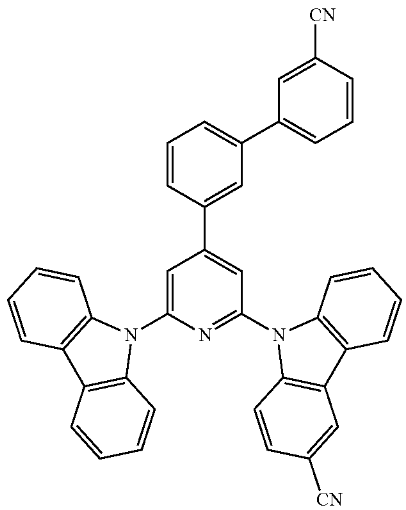
187
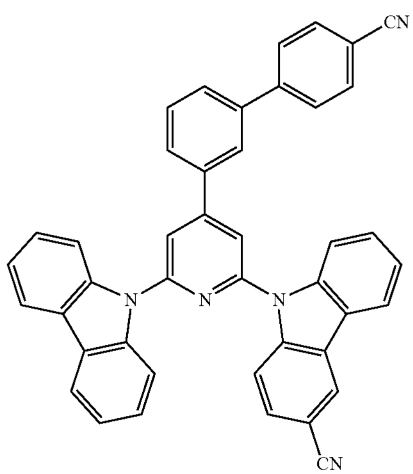
188
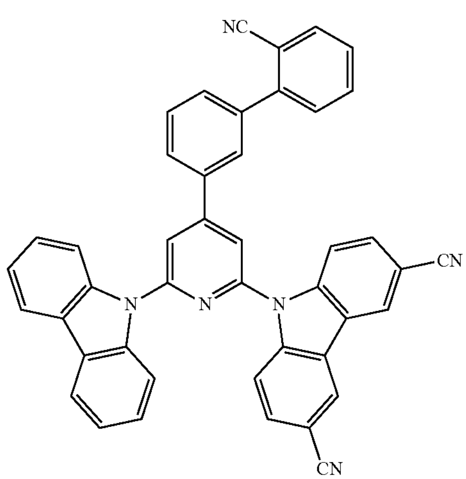
-continued
189
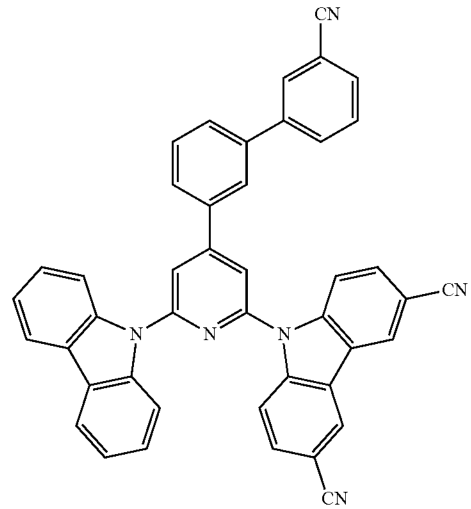
190
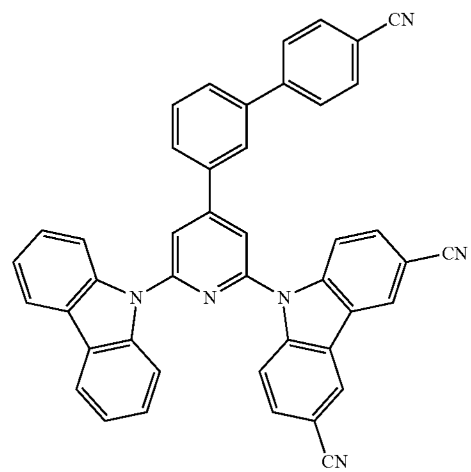
191
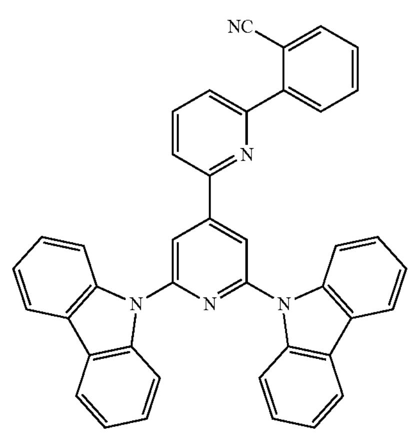

-continued
192
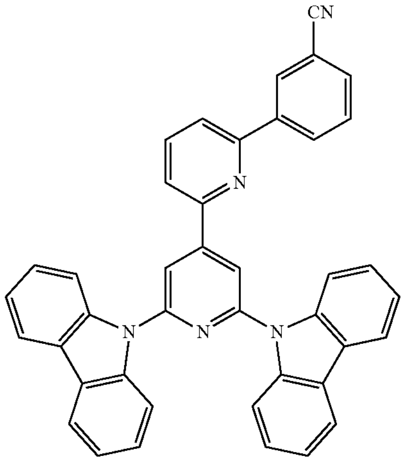
193
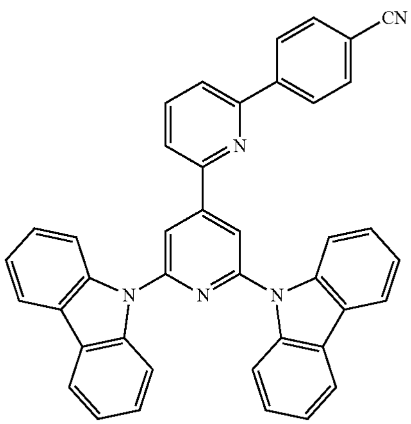
194
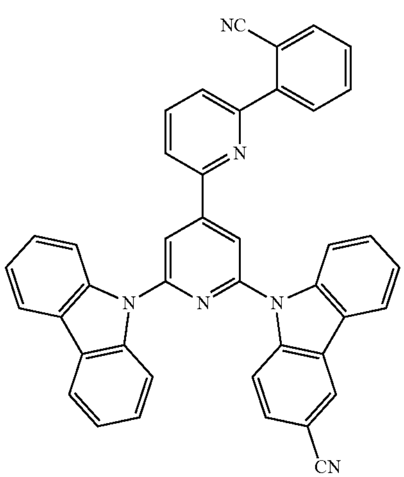
-continued
195
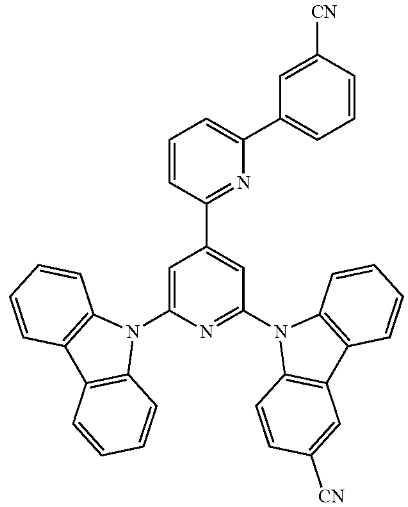
196
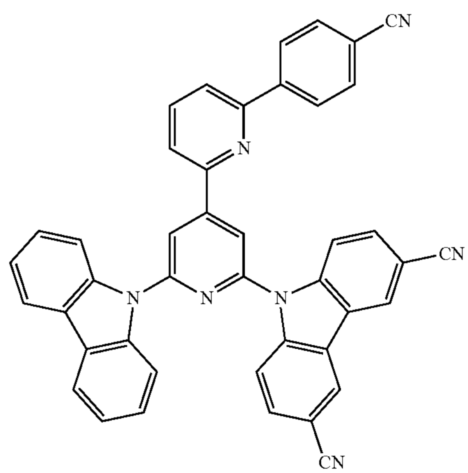
197
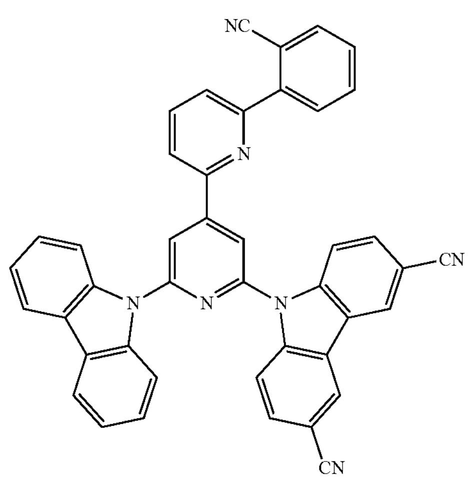

-continued
198
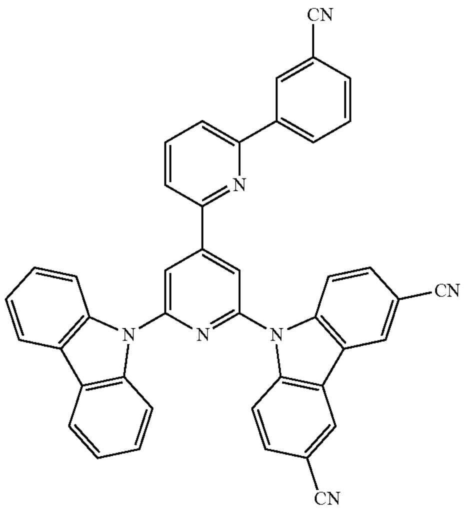
199
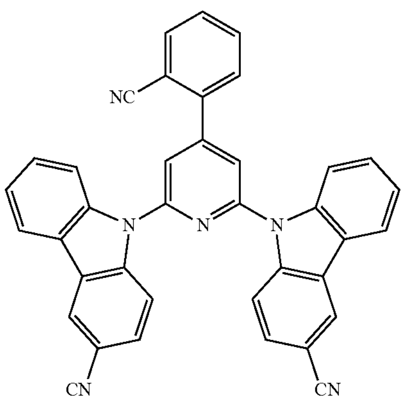
200
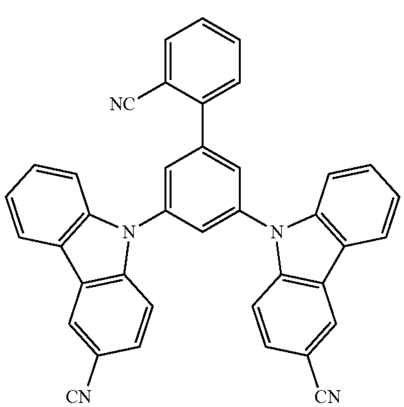
-continued
201
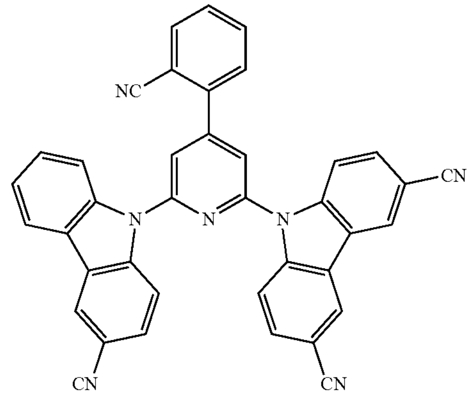
202
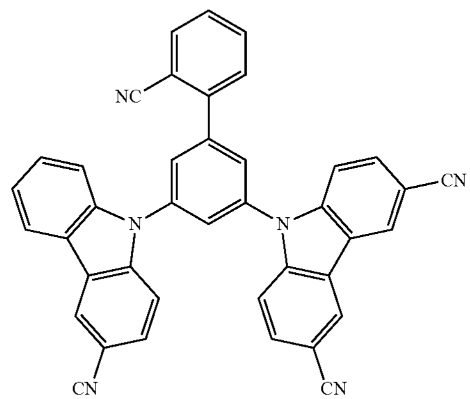
Group HE6
1
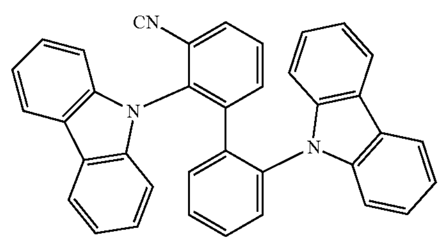
2
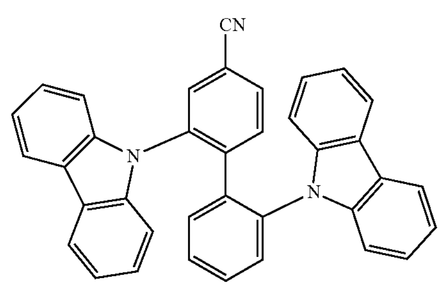
3
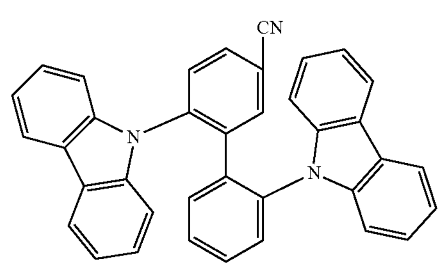

4
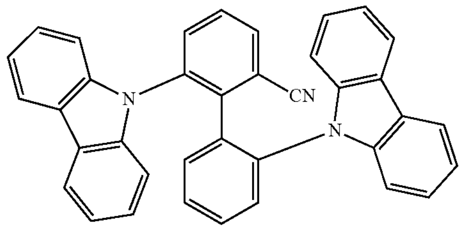
5
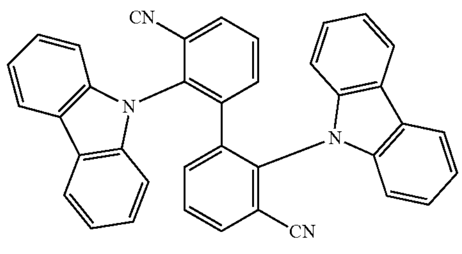
6
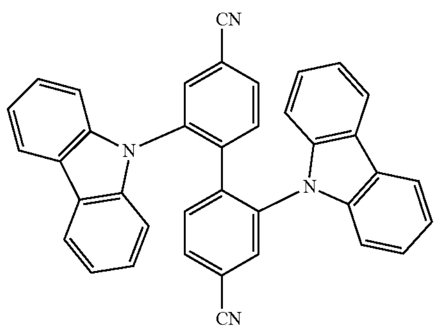
7
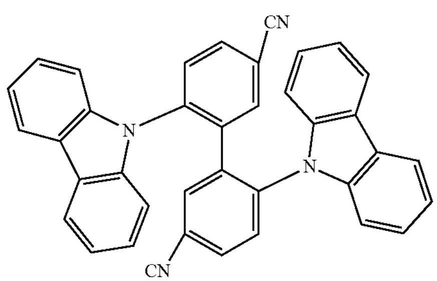
8
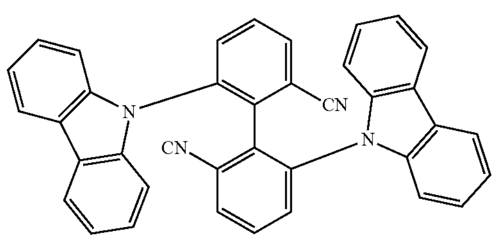
9
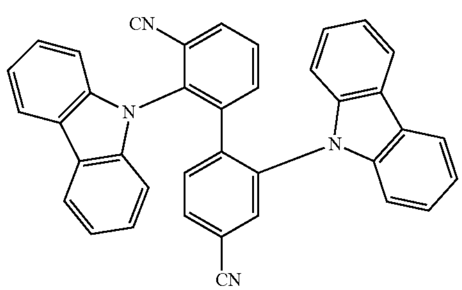
10
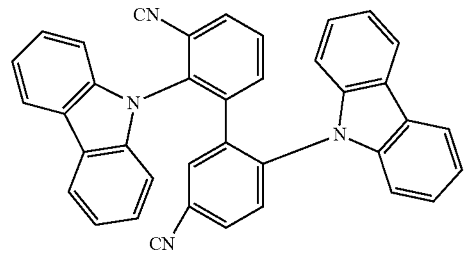
11
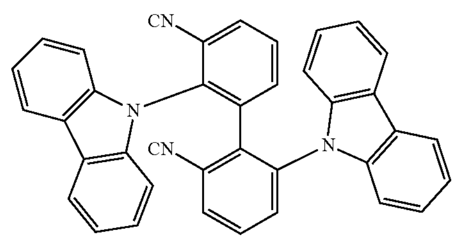
12
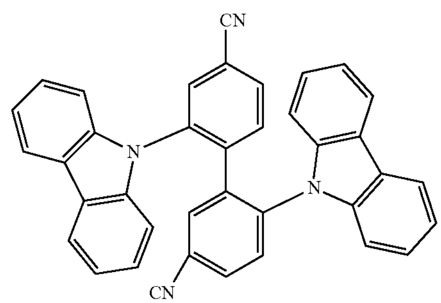
13
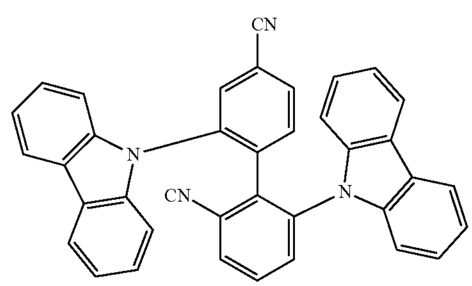
14
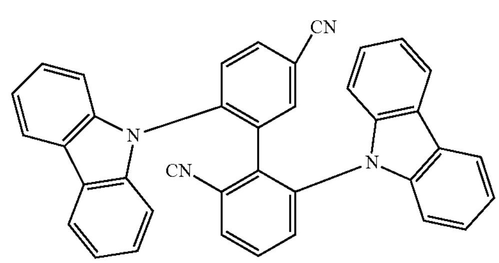
15
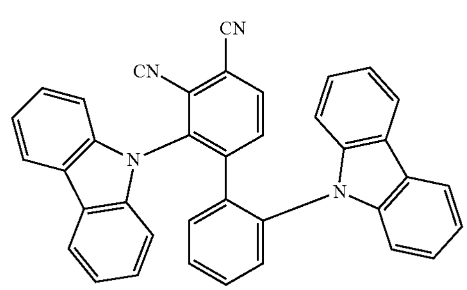

-continued
16
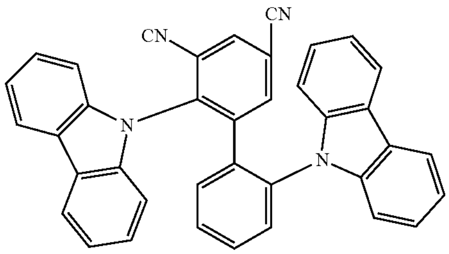
17
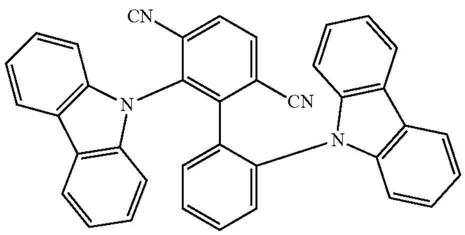
18
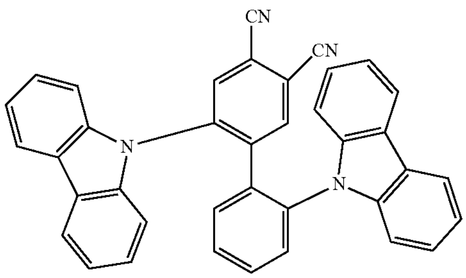
19
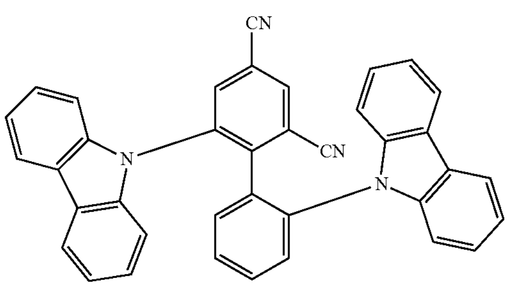
20
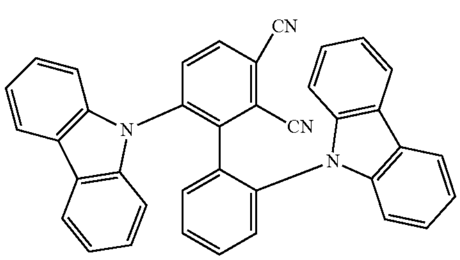
21
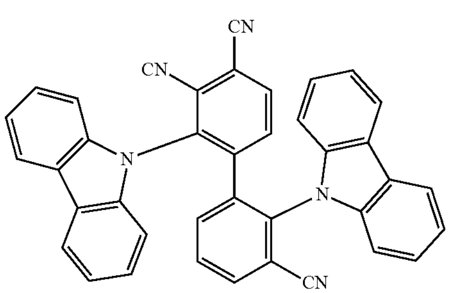
-continued
22
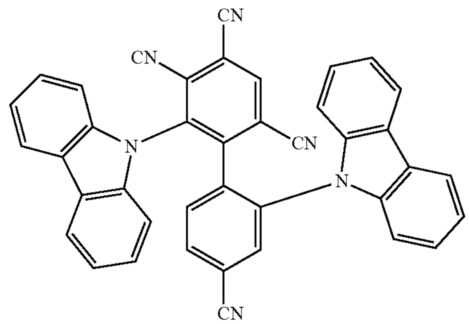
23
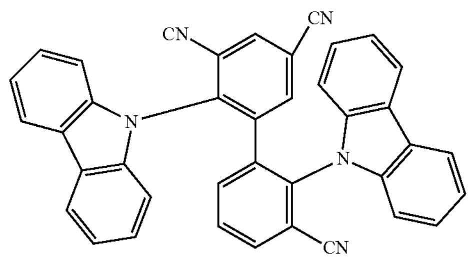
24
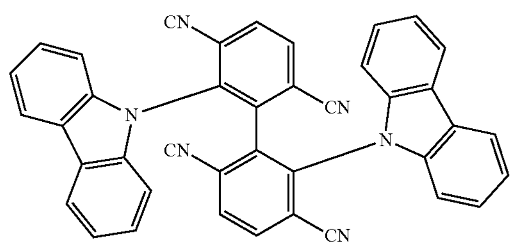
25
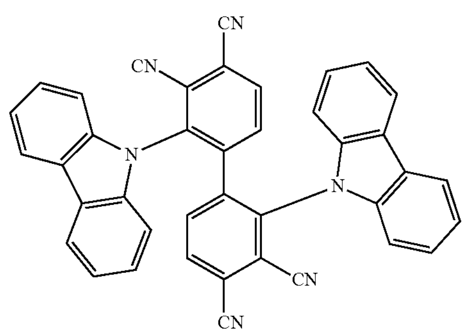
26
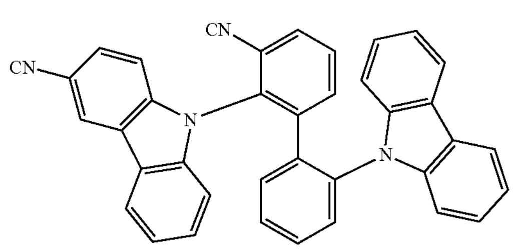

-continued
27
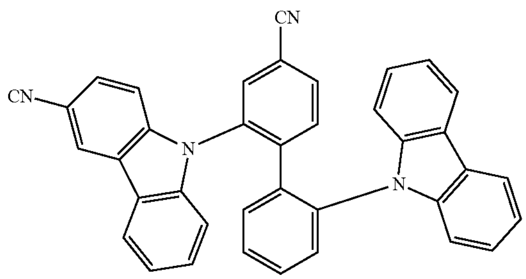
28
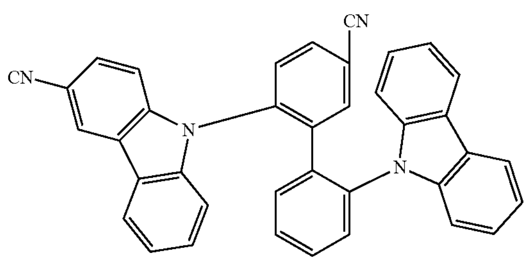
29
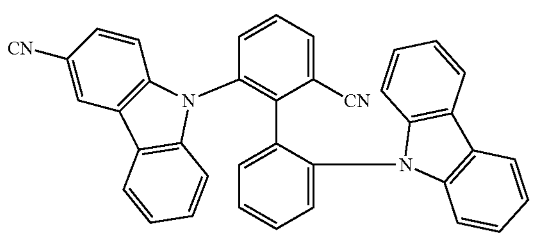
30
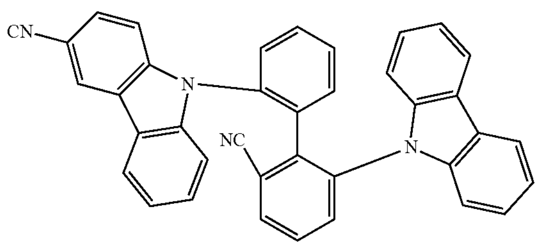
31
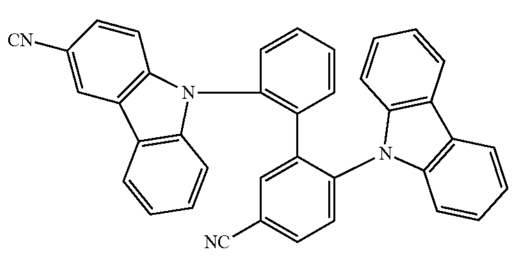
-continued
32
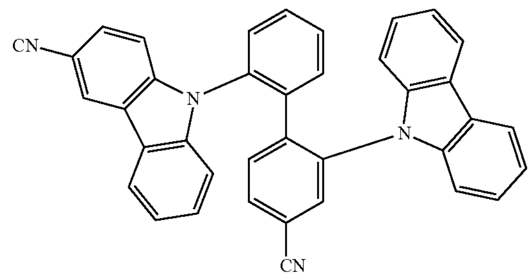
33
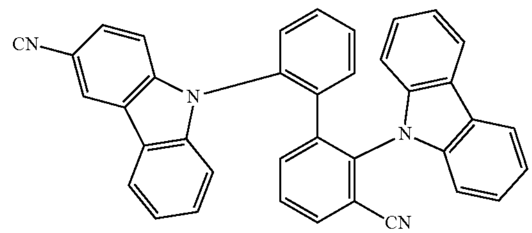
34
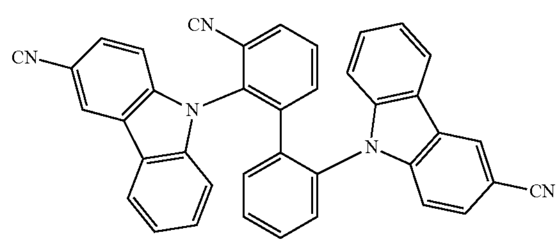
35
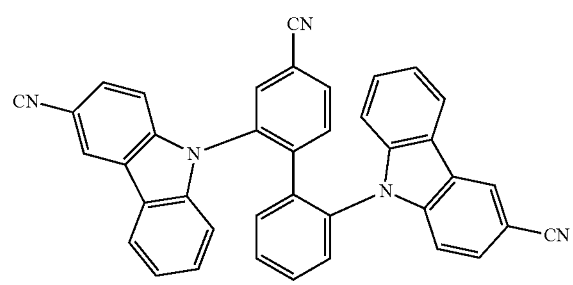
36
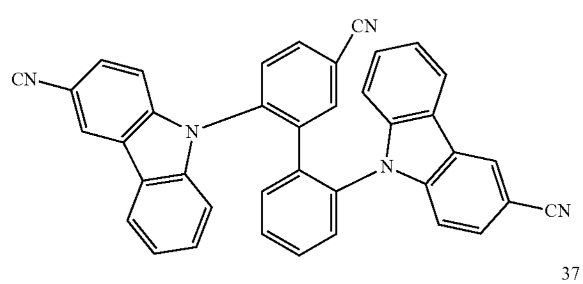
37
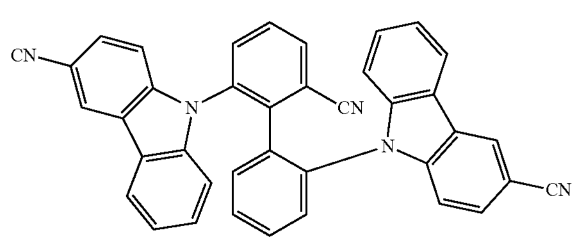

-continued
38
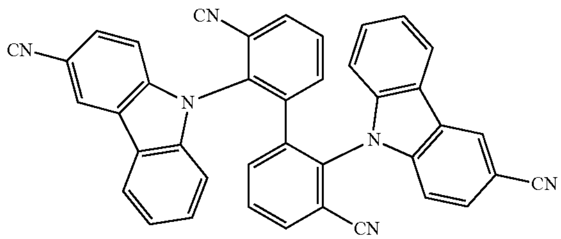
39
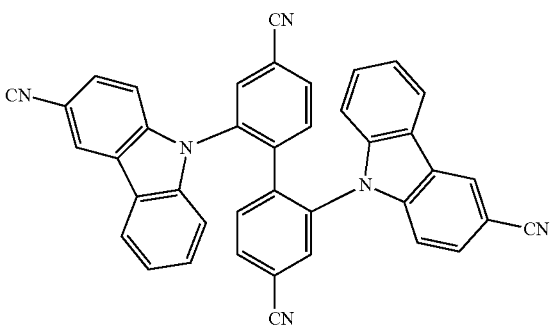
40
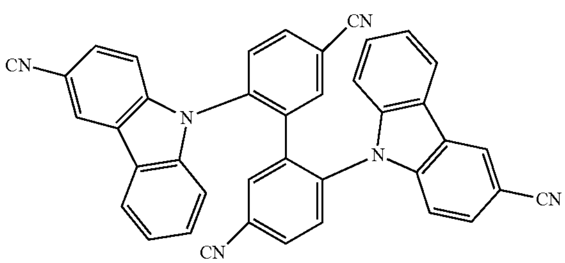
41
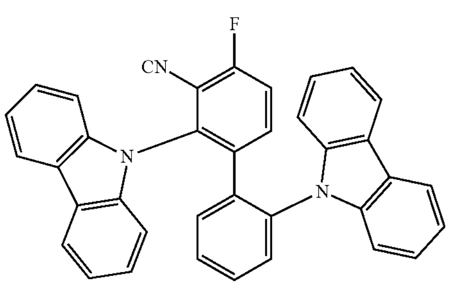
42
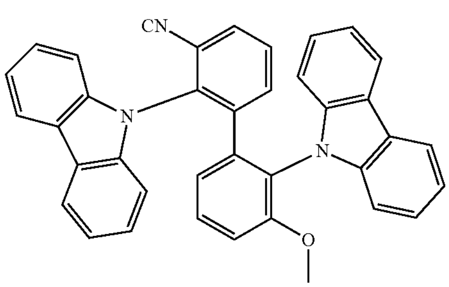
-continued
43
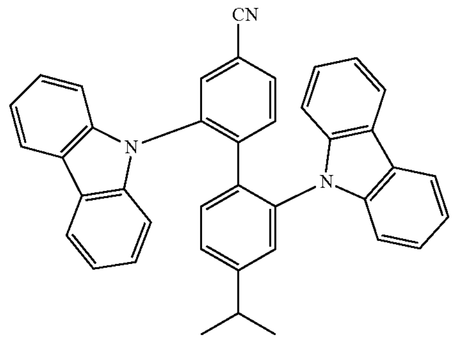
44
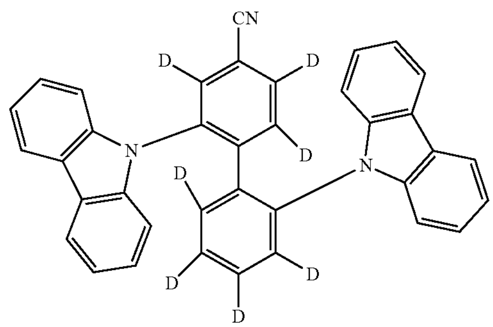
45
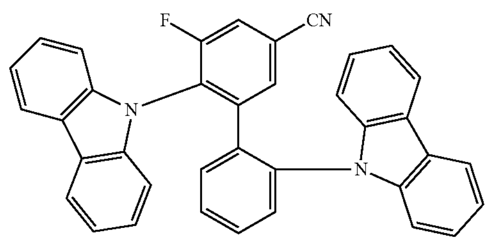
46
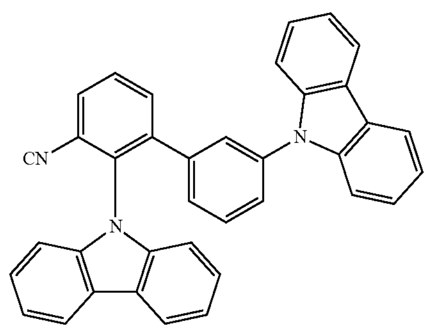
47
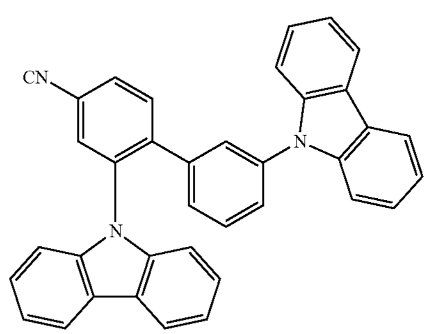

48
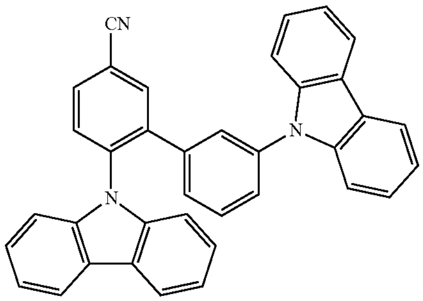
49
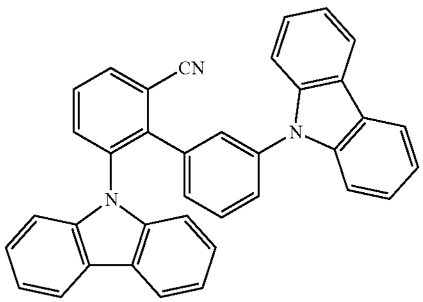
50
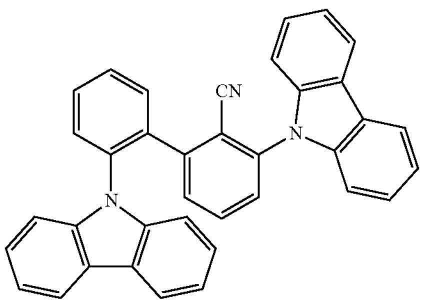
51
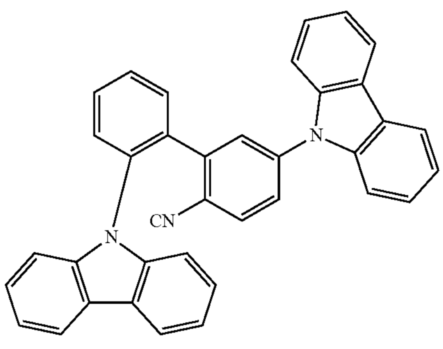
52
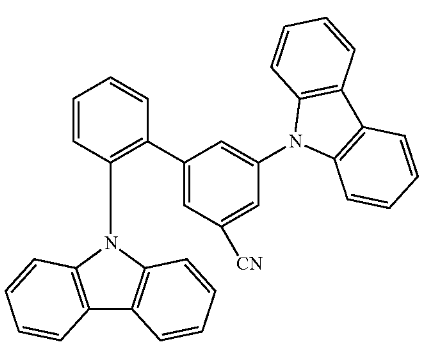
53
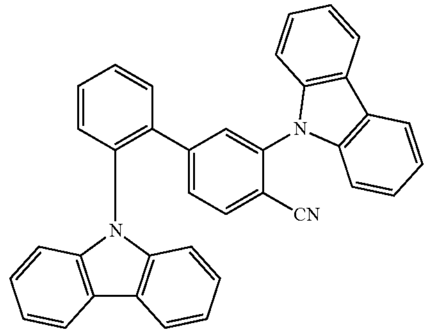
54
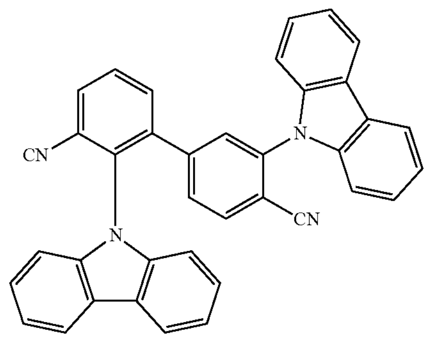
55
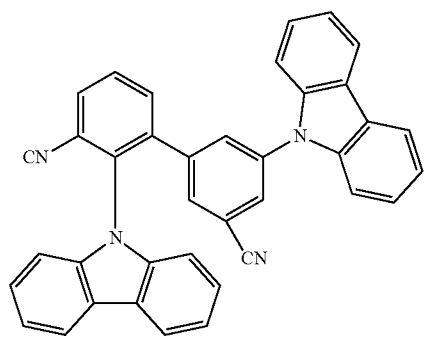
56
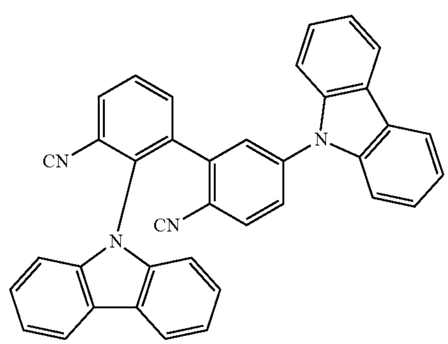

57
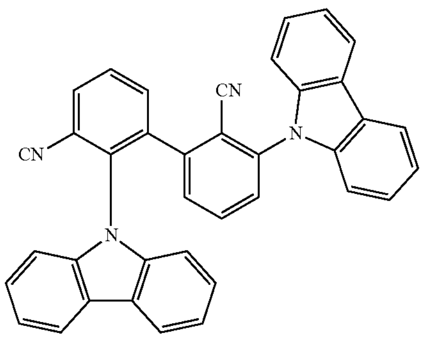
58
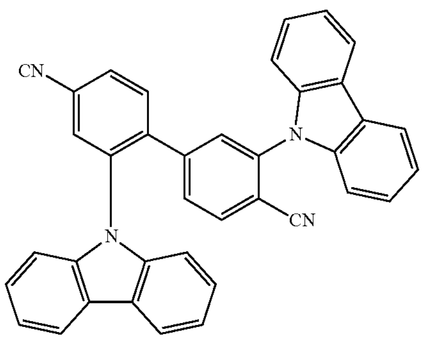
59
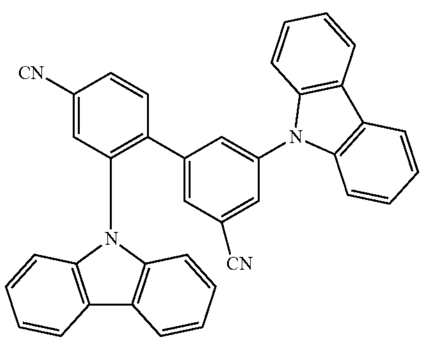
60
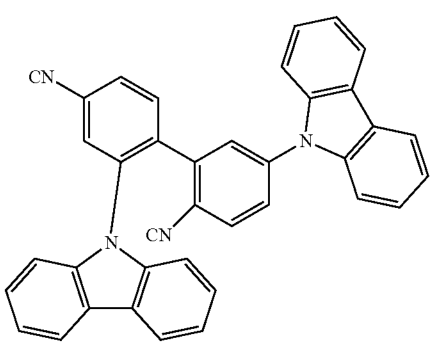
61
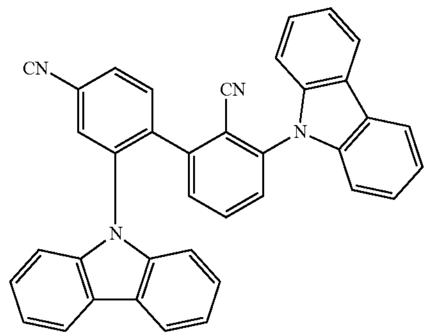
62
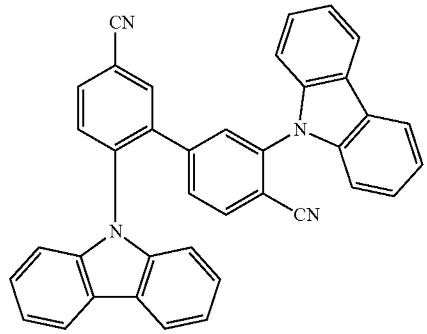
63
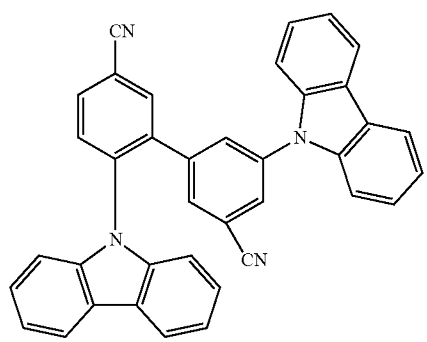
64
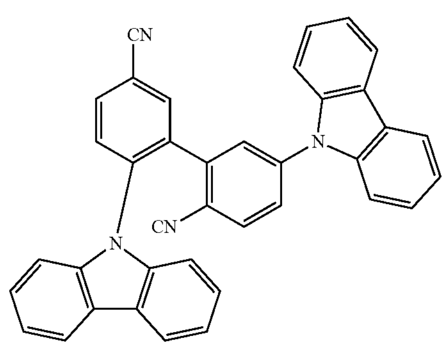

-continued
65
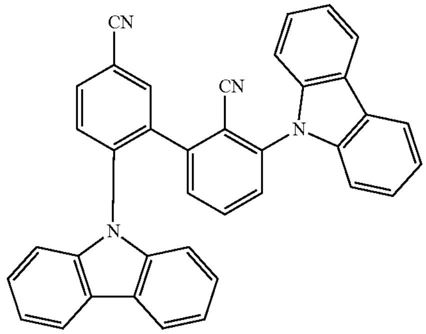
66
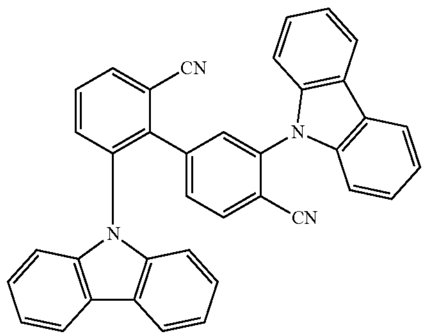
67
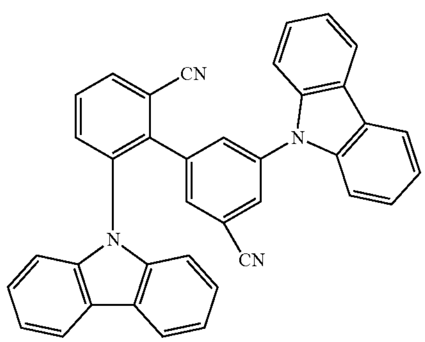
68
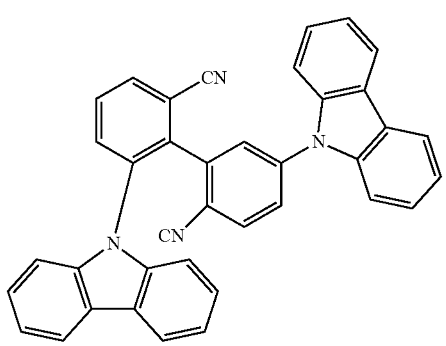
-continued
69
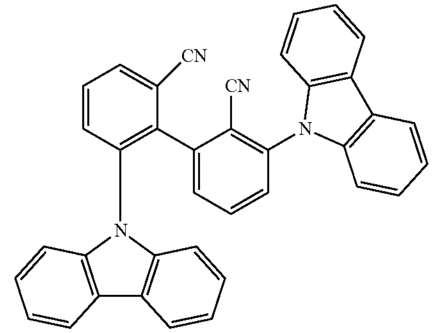
70
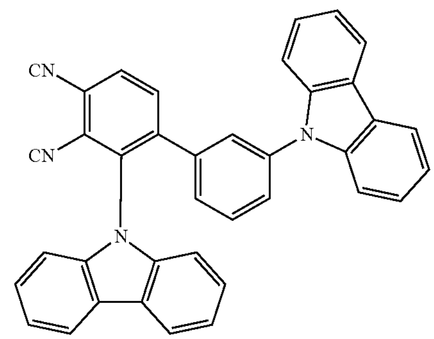
71
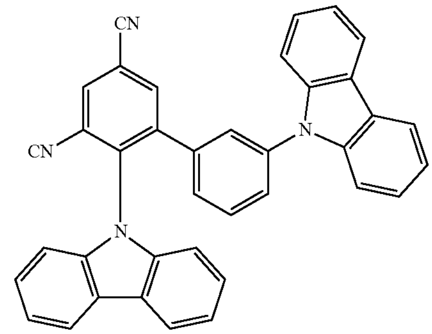
72
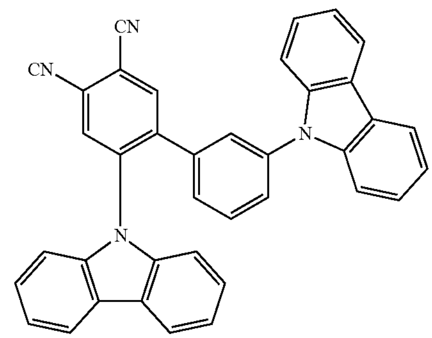

-continued
73
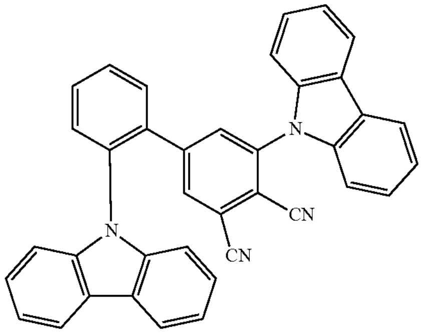
74
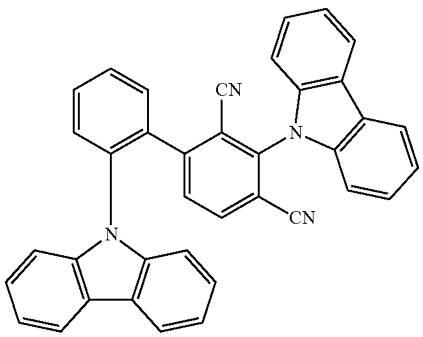
75
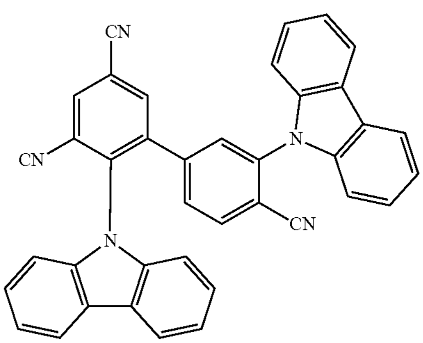
76
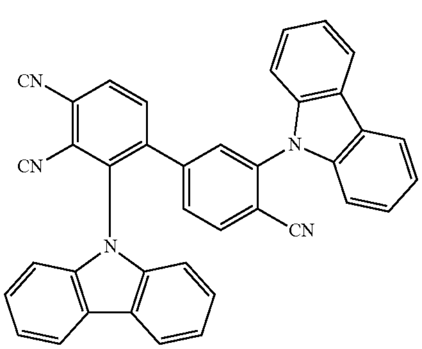
-continued
77
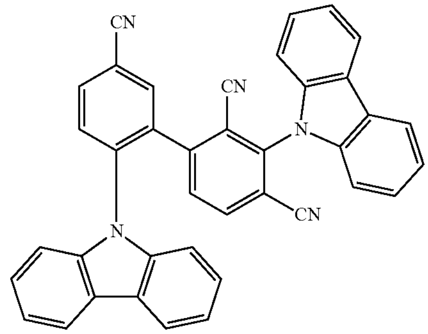
78
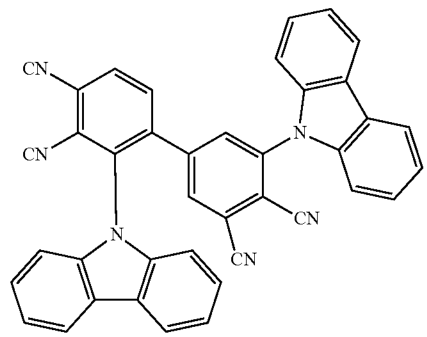
79
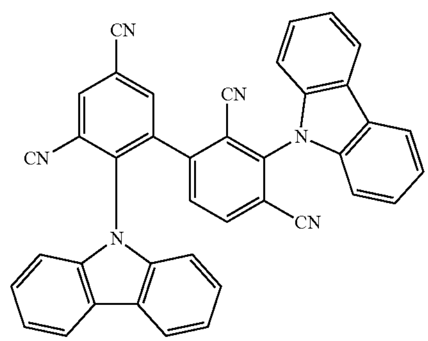
80
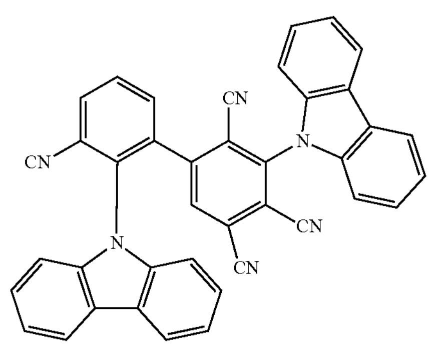

-continued
81
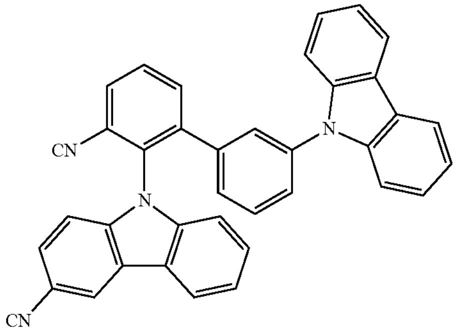
82
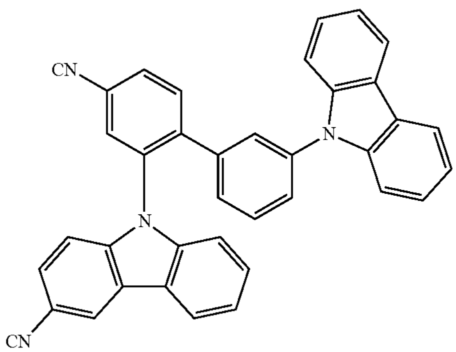
83
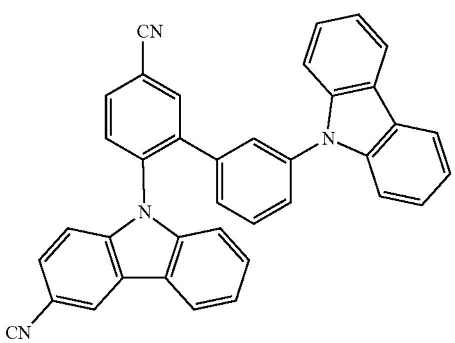
84
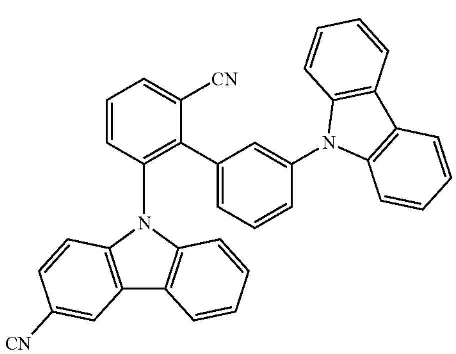
-continued
85
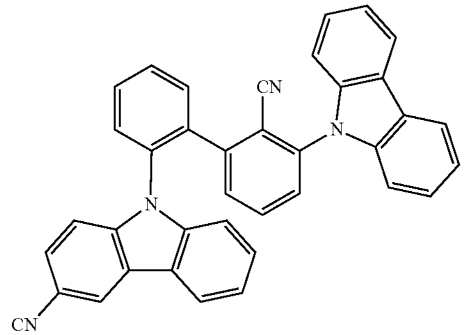
86
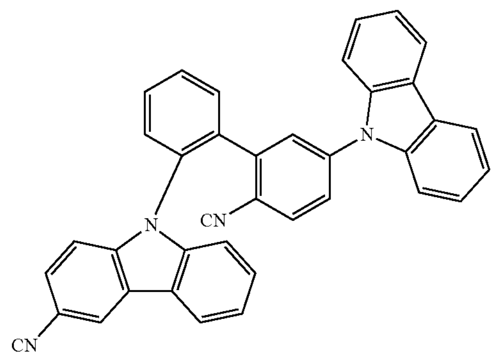
87
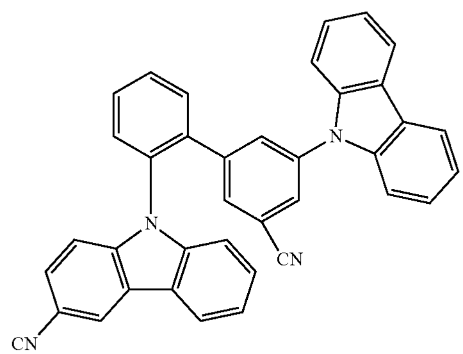
88
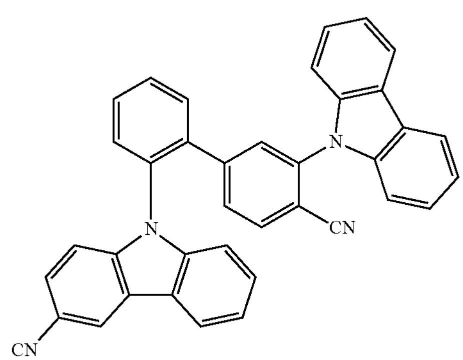

-continued
89
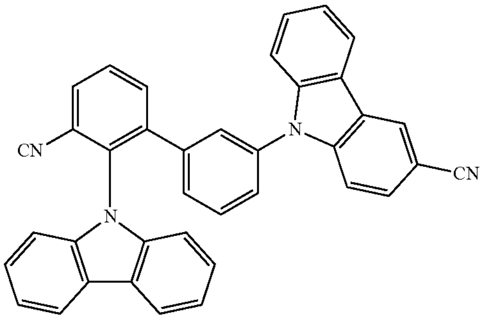
90
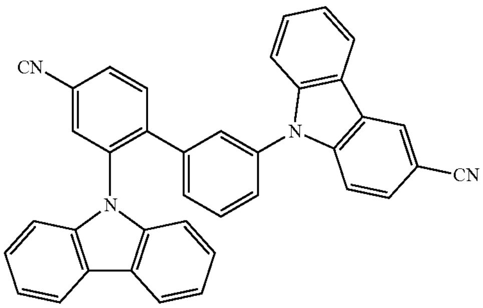
91
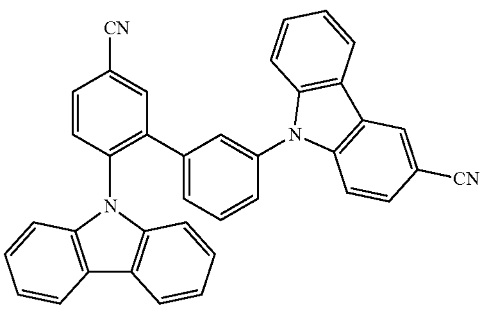
92
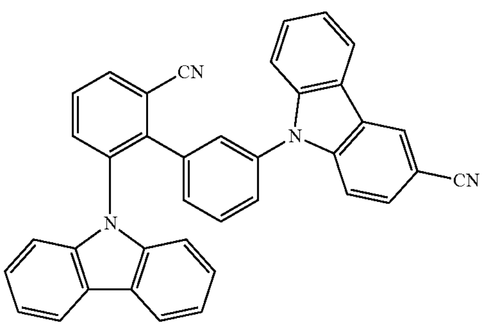
93
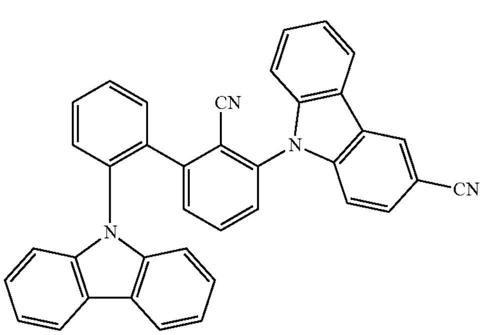
-continued
94
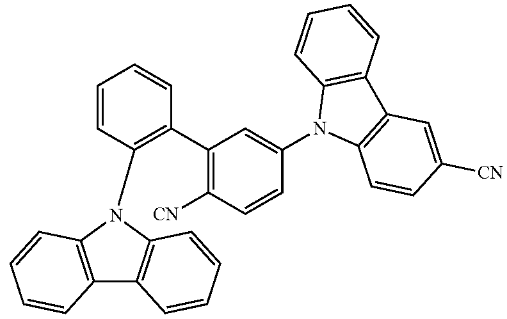
95
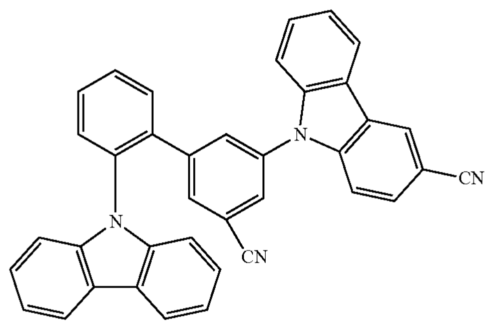
96
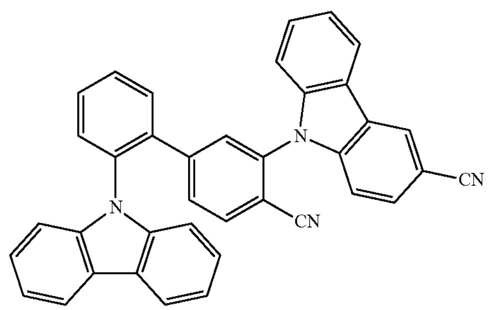
97
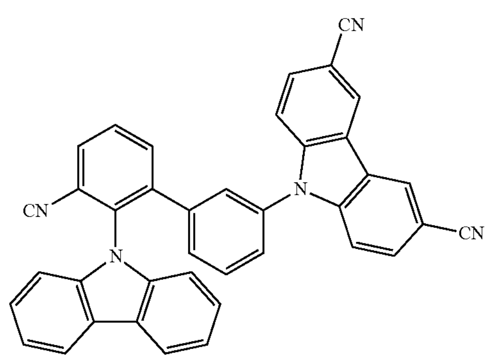

-continued
98
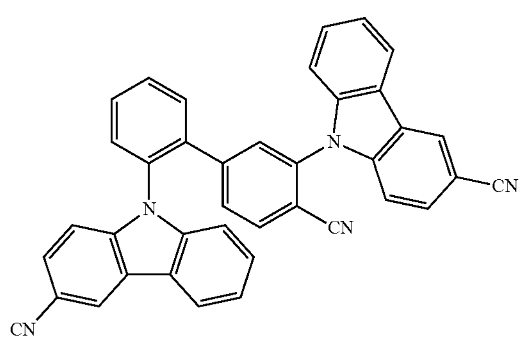
99
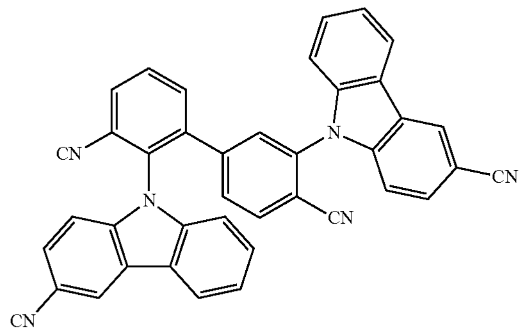
100
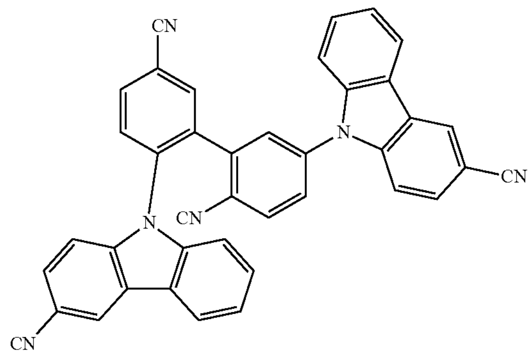
101
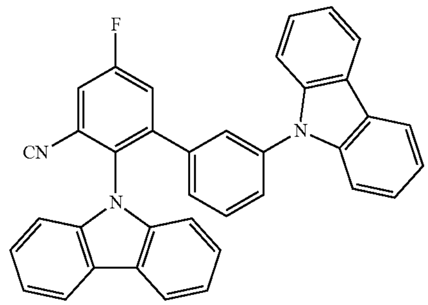
-continued
102
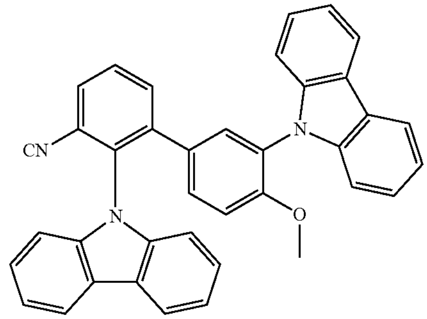
103
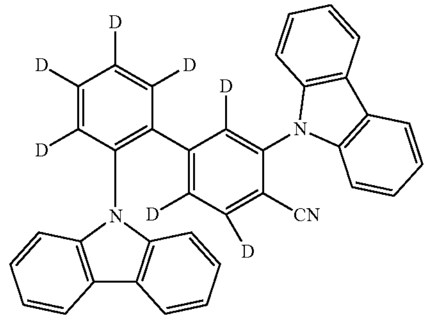
104
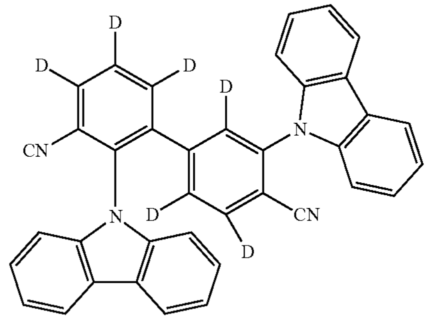
105
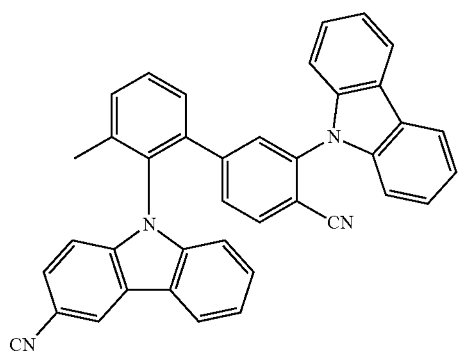
106
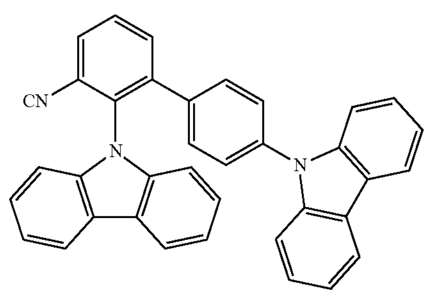

-continued
107
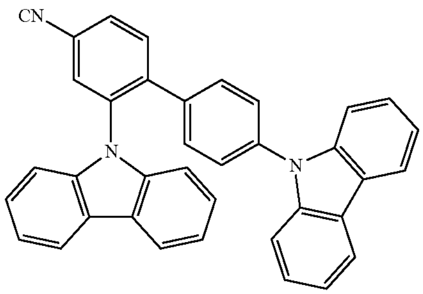
108
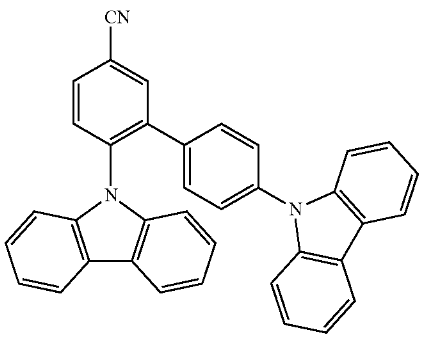
109
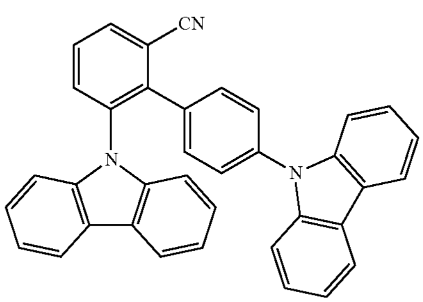
110
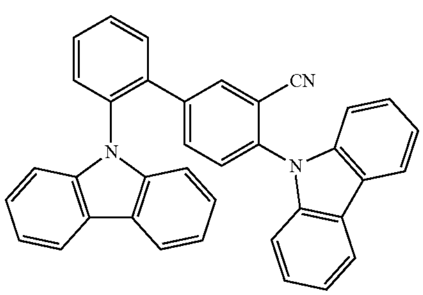
111
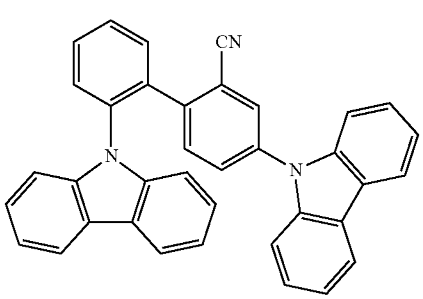
-continued
112
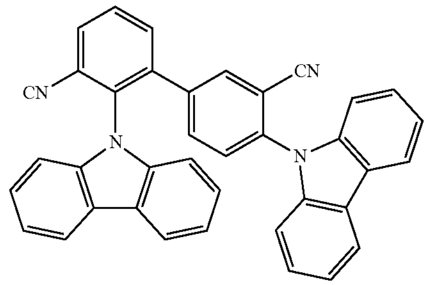
113
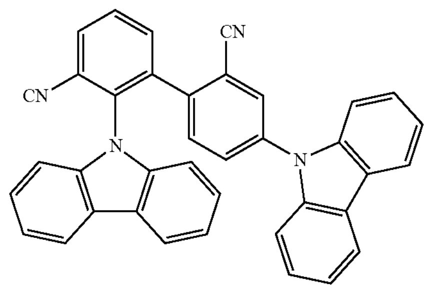
114
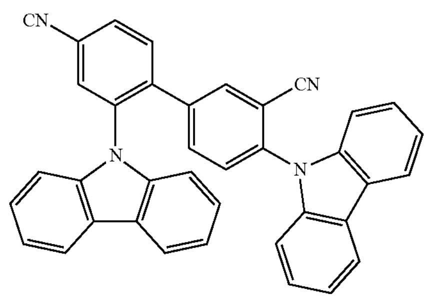
115
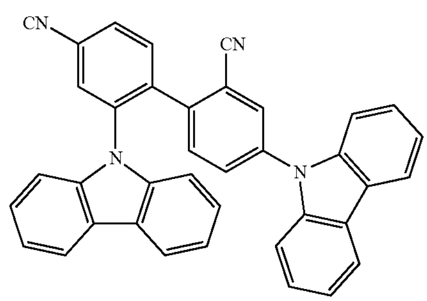
116
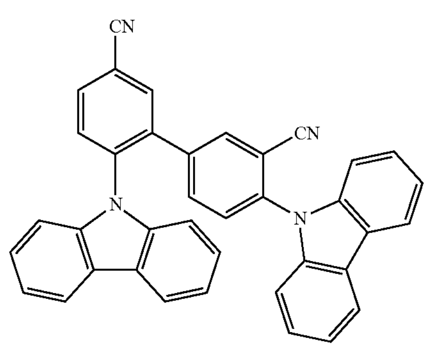

-continued
117
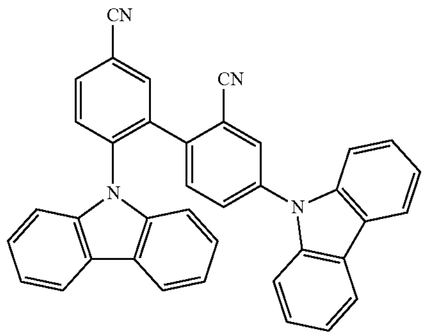
118
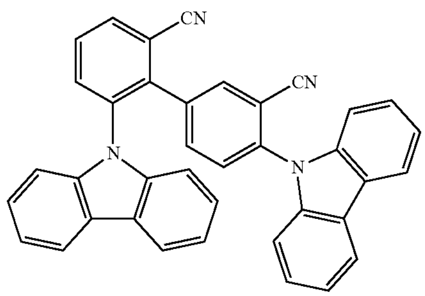
119
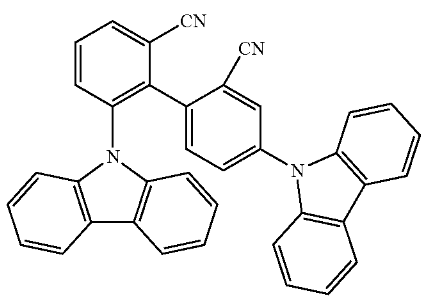
120
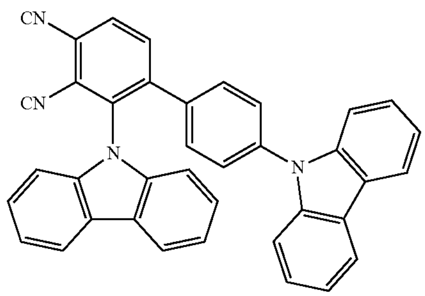
121
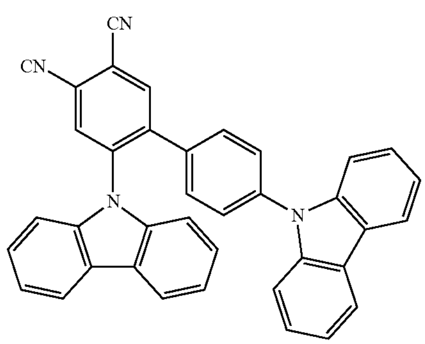
-continued
122
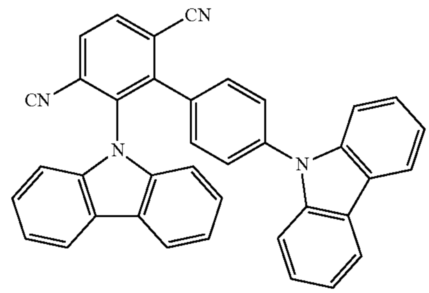
123
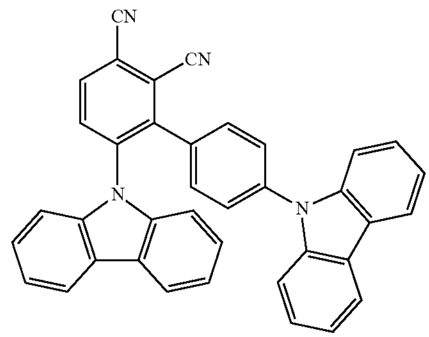
124
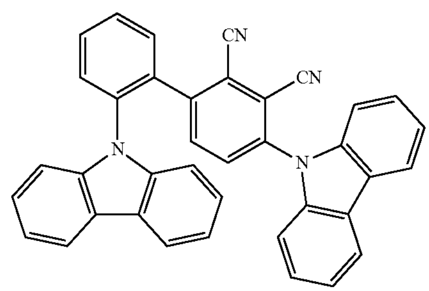
125
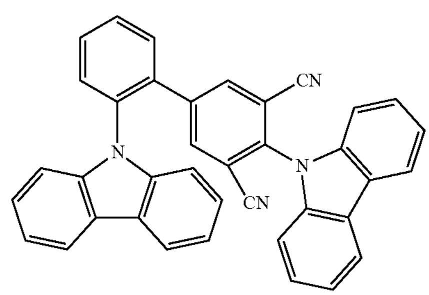
126
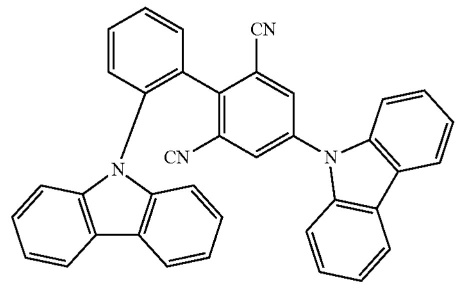

-continued
127
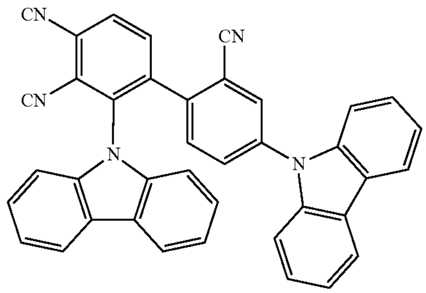
128
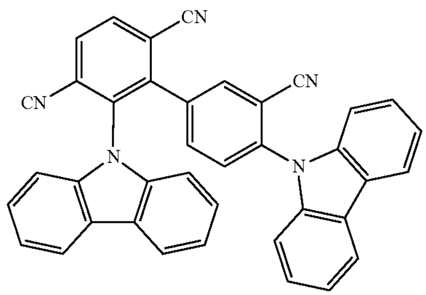
129
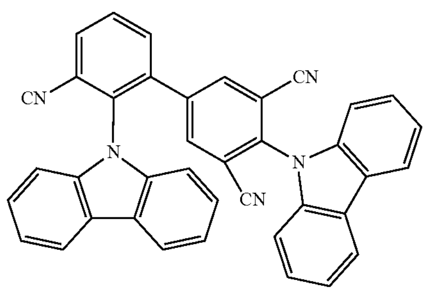
130
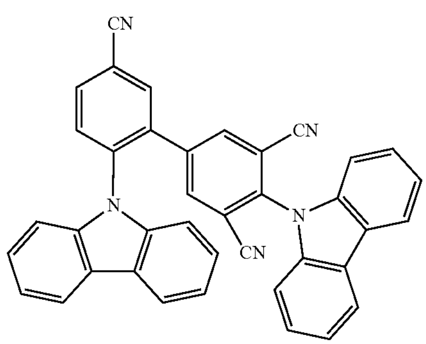
131
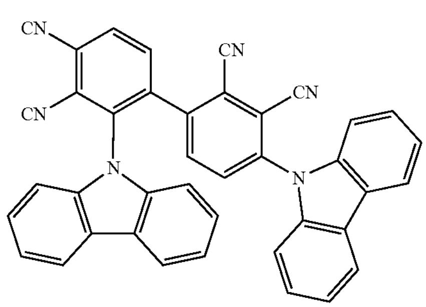
-continued
132
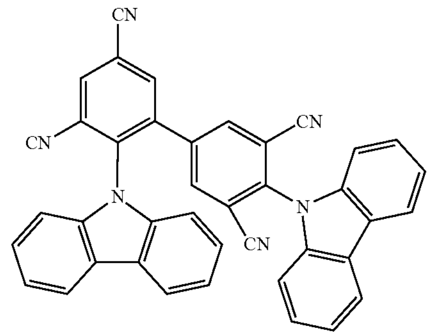
133
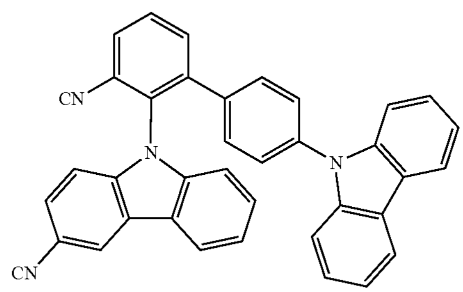
134
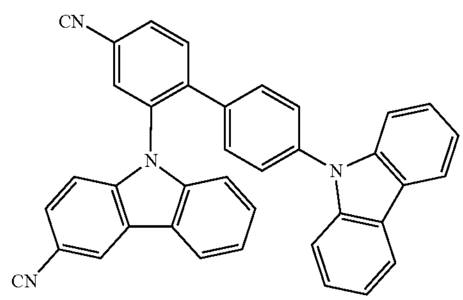
135
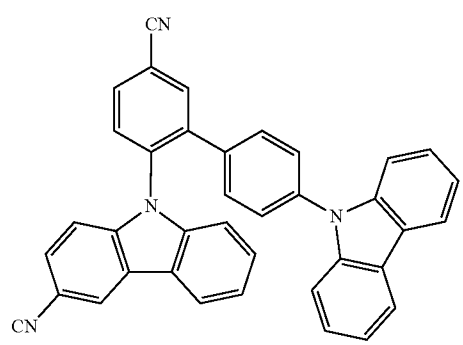
136
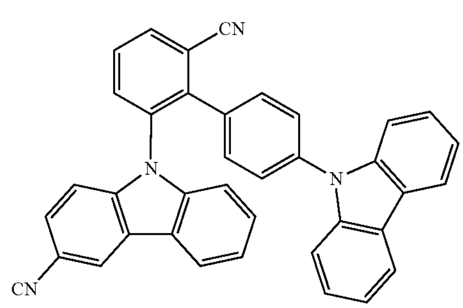

-continued
137
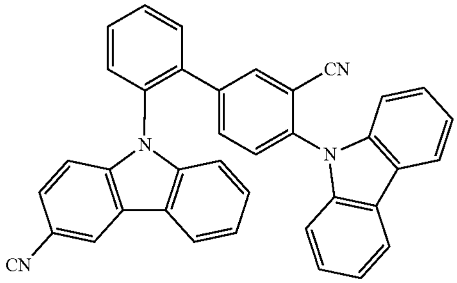
138
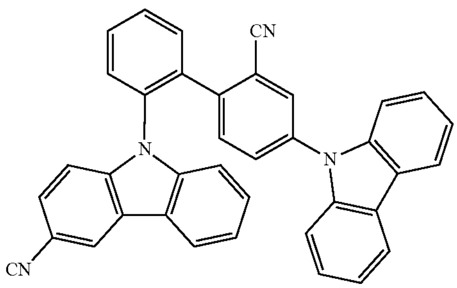
139
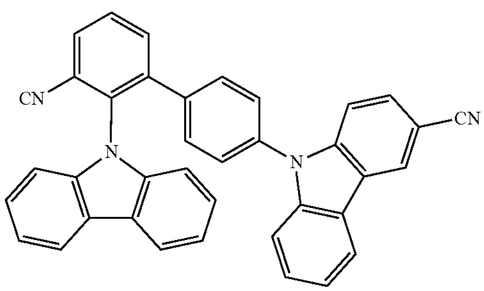
140
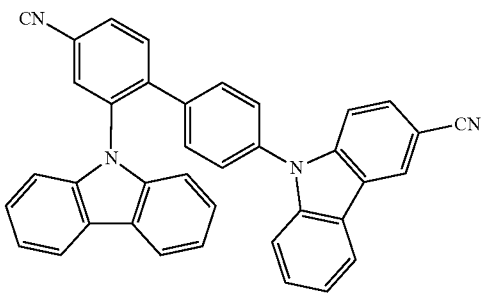
141
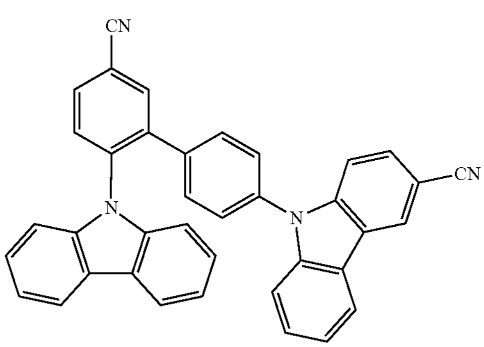
-continued
142
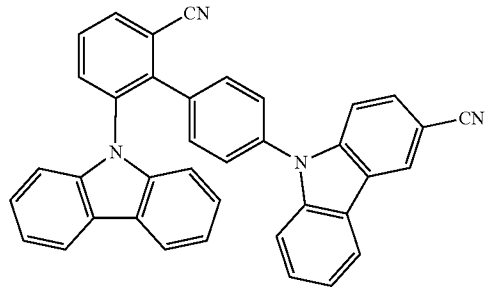
143
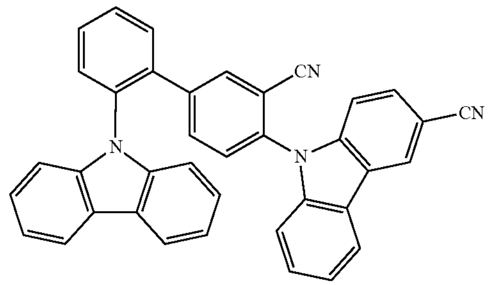
144
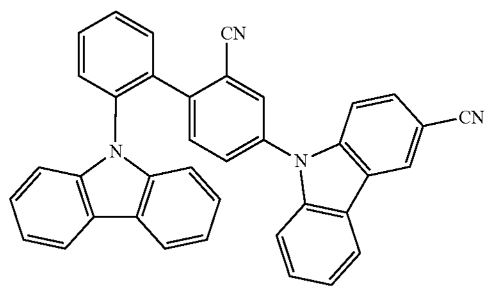
145
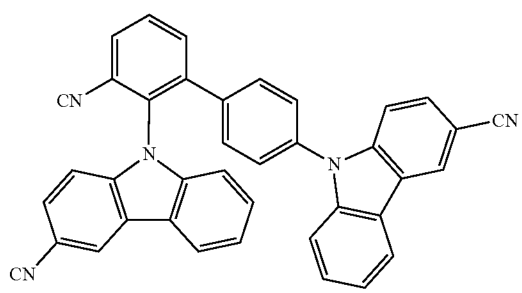
146
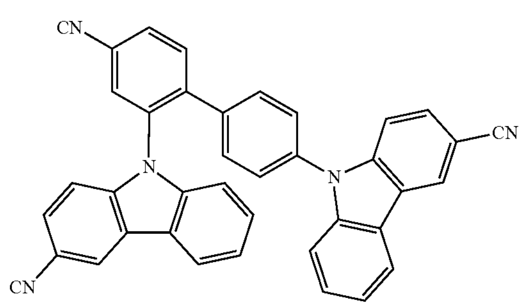

-continued
147
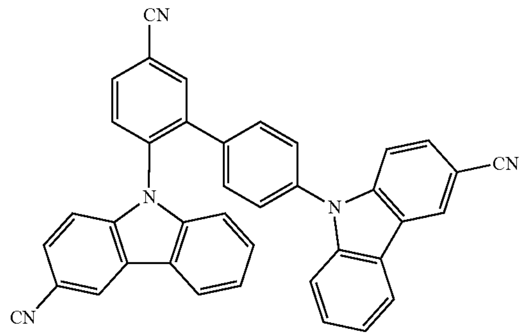
148
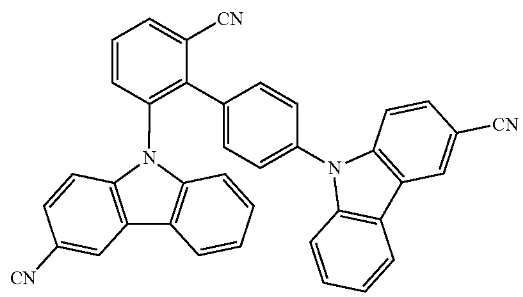
149
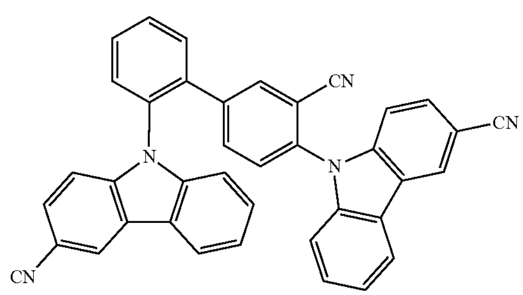
150
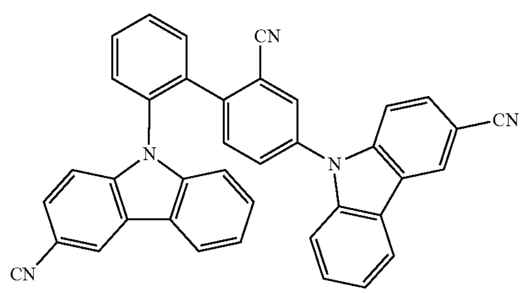
151
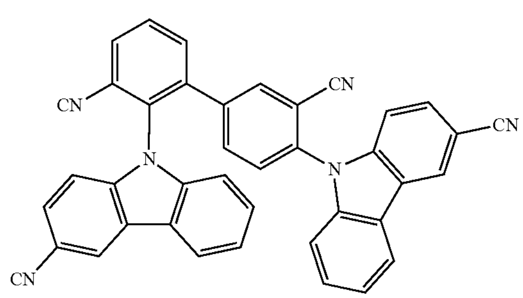
-continued
152
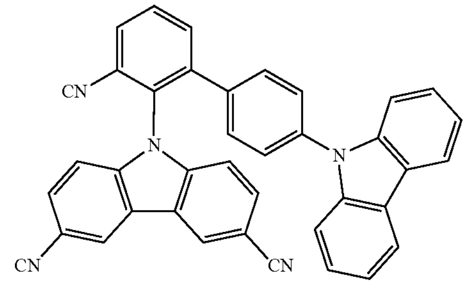
153
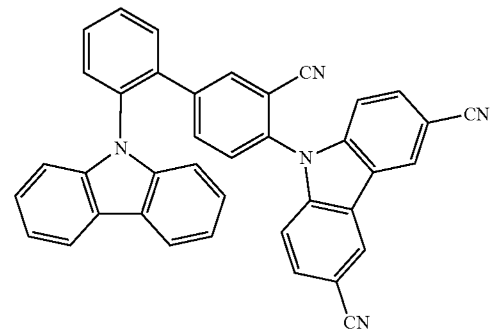
154
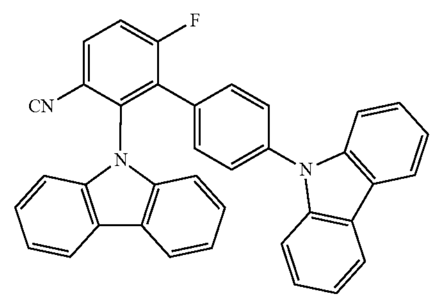
155
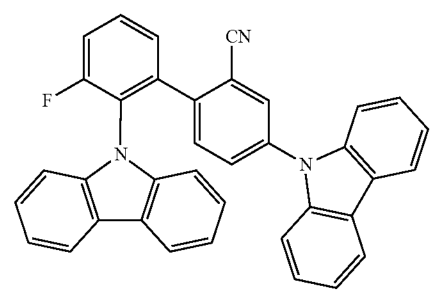
156
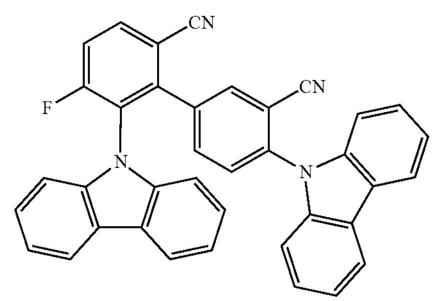

157
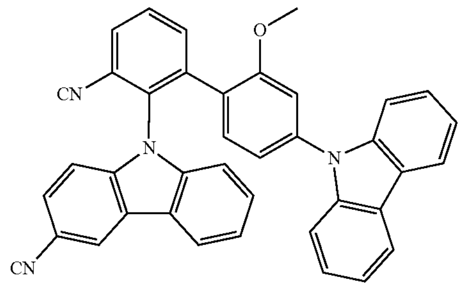
158
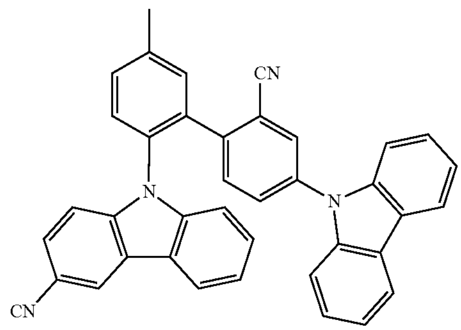
159
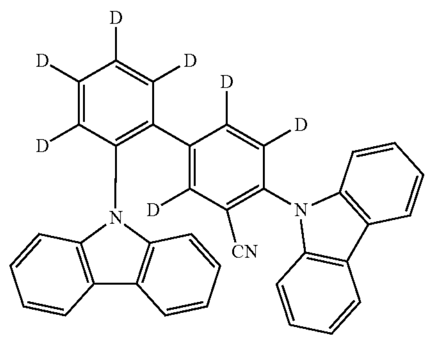
160
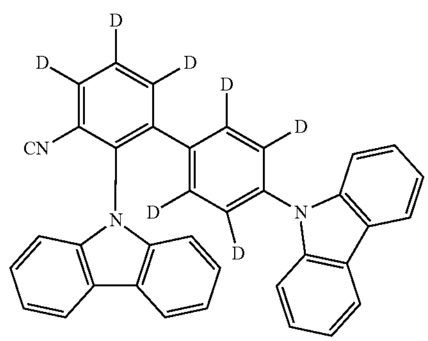
161
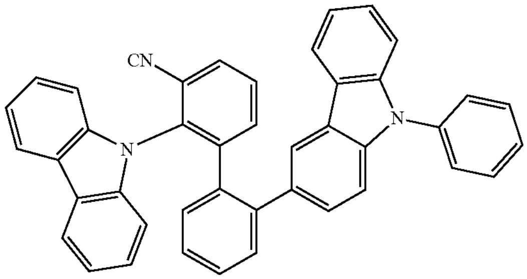
162
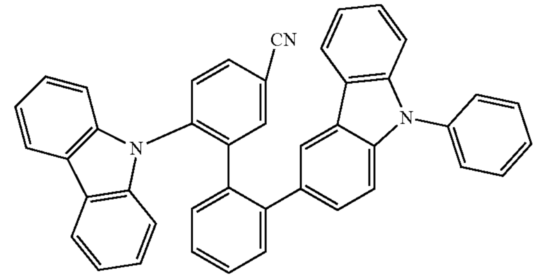
163
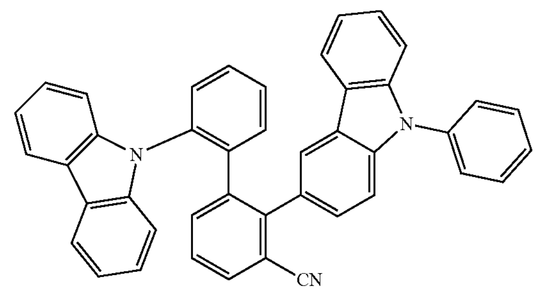
164
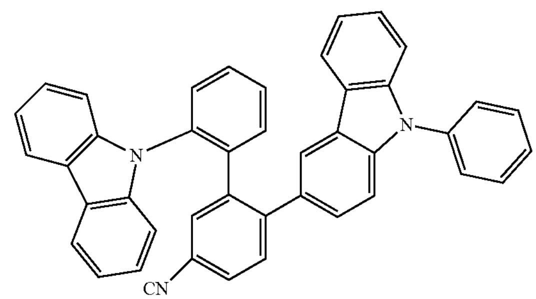
165
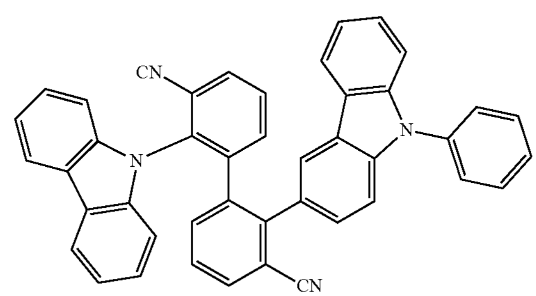
166
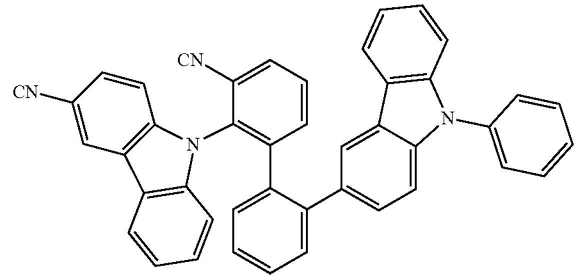

-continued
167
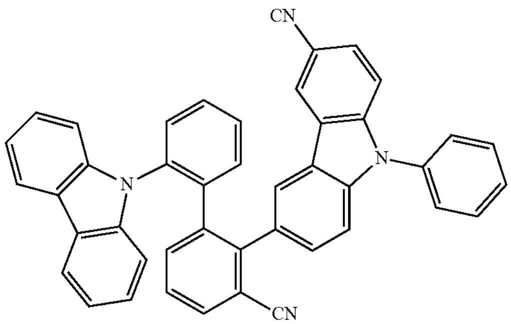
168
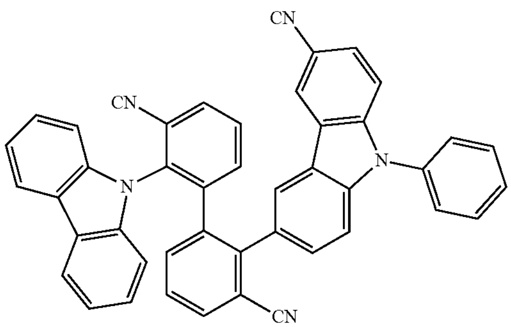
169
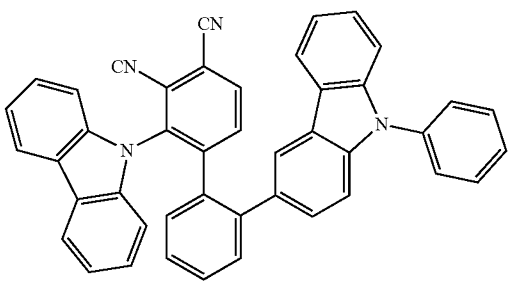
170
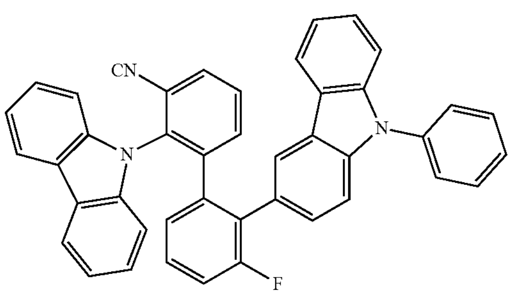
171
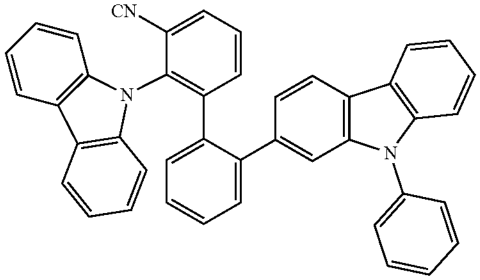
-continued
172
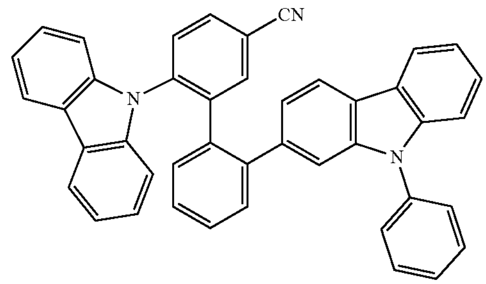
173
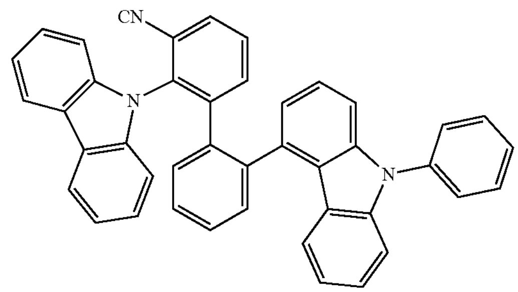
174
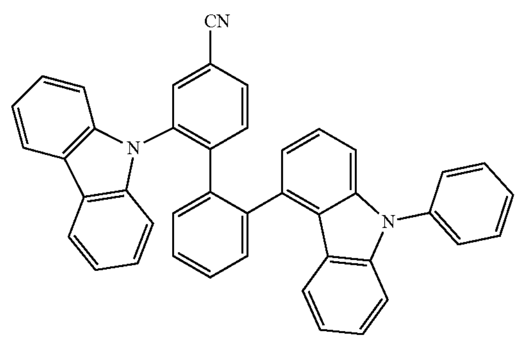
175
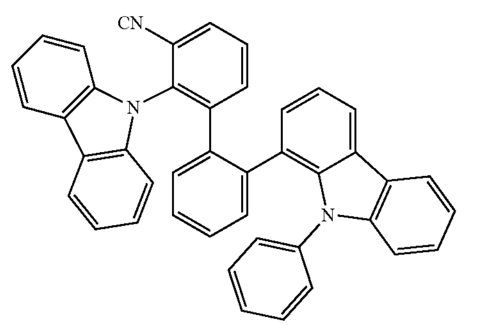
176
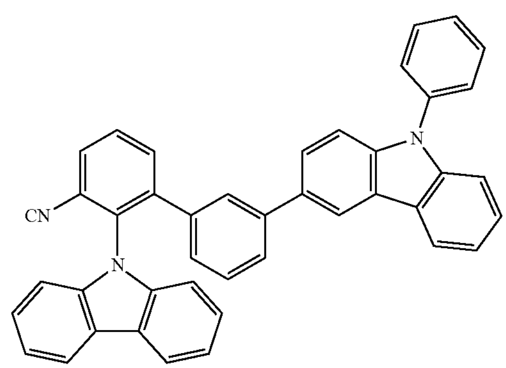

-continued
177
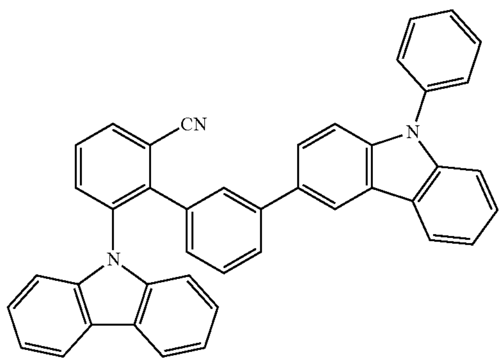
178
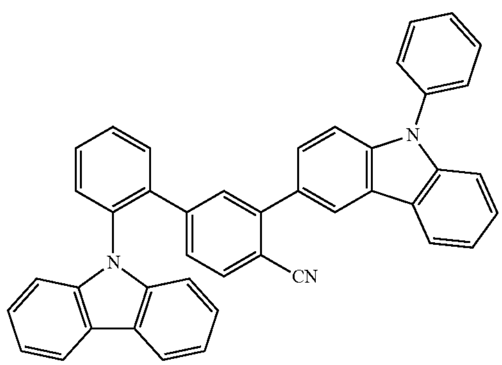
179
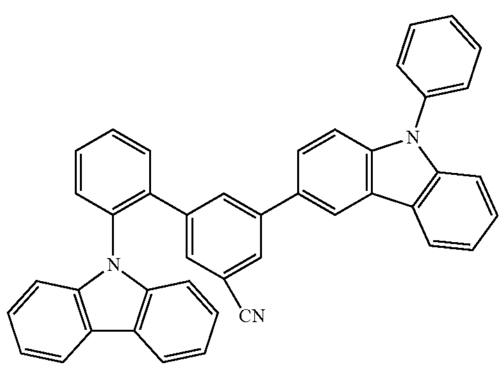
180
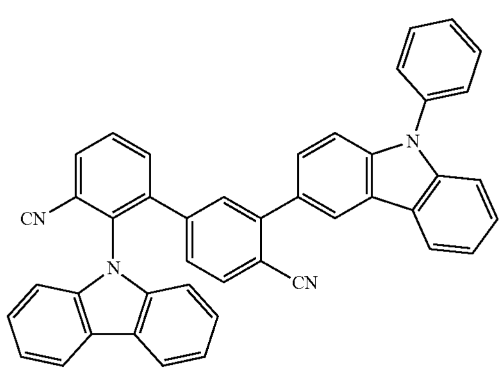
-continued
181
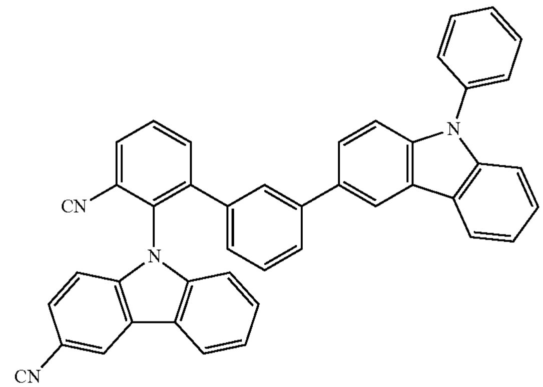
182
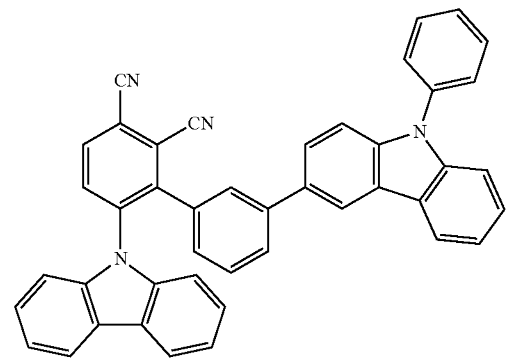
183
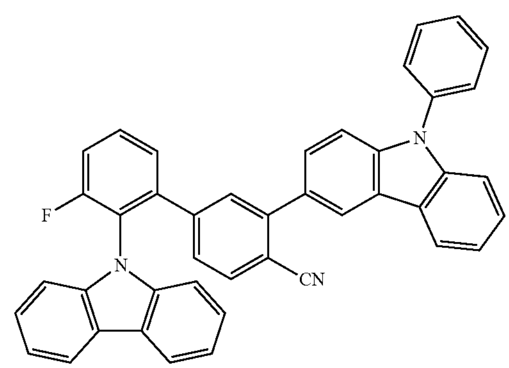
184
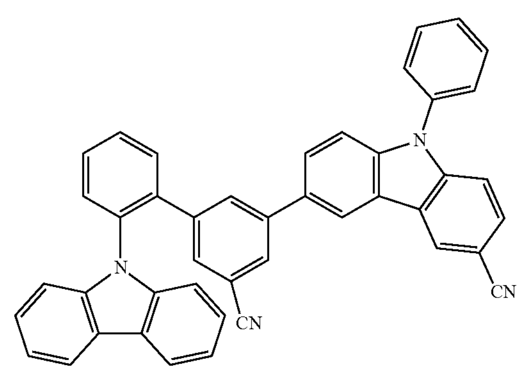

-continued
185
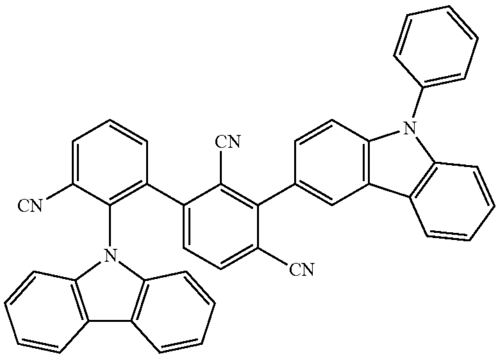
186
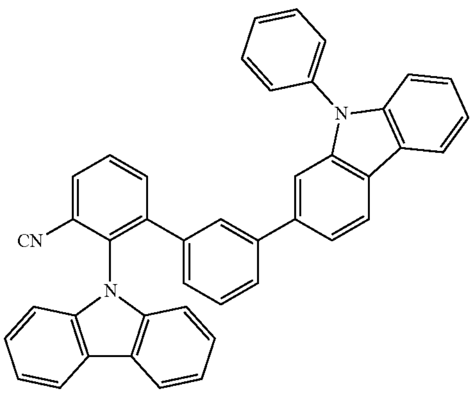
187
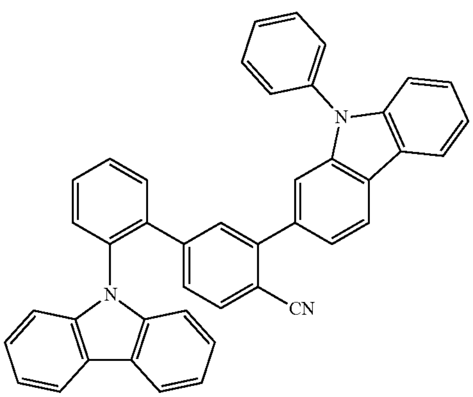
188
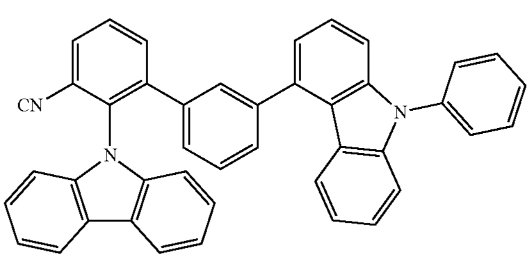
-continued
189
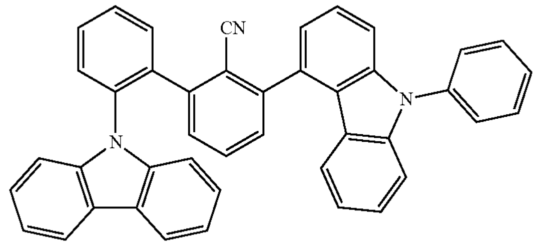
190
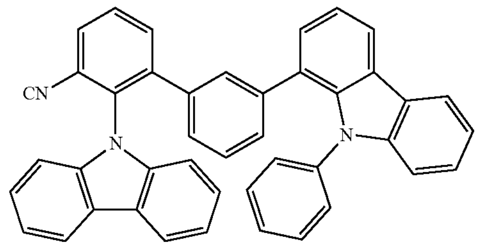
191
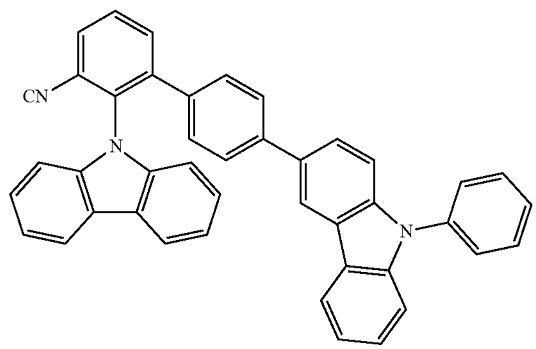
192
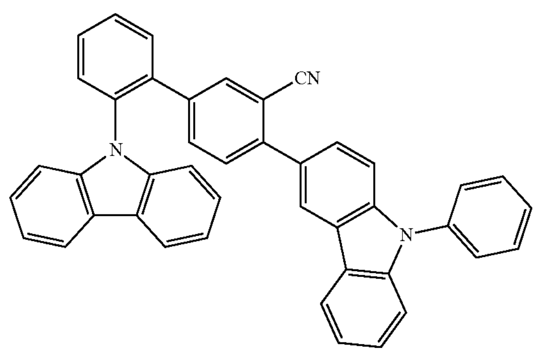
193
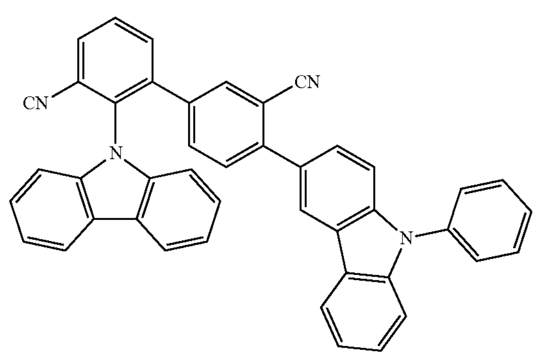

-continued
194
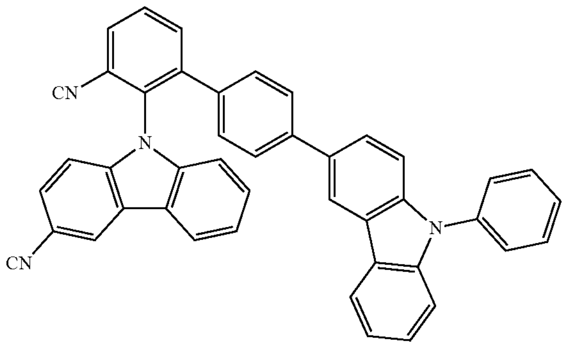
195
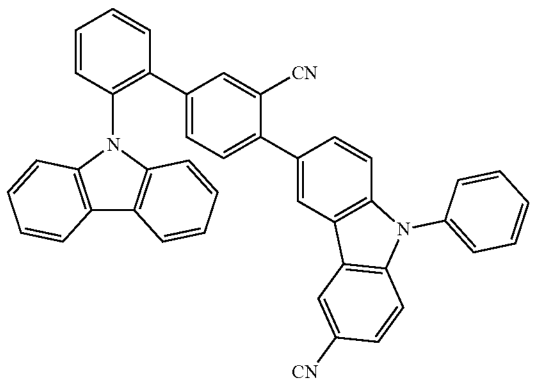
196
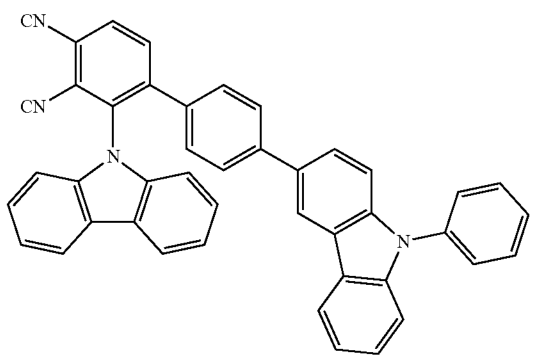
197
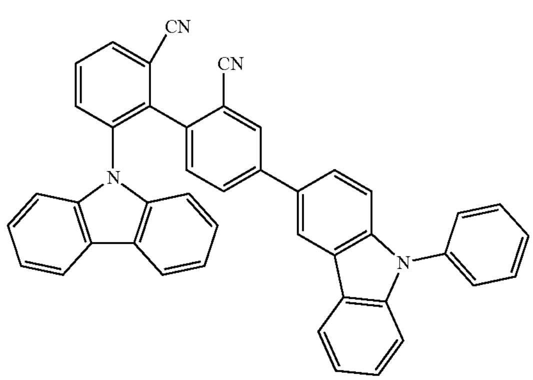
-continued
198
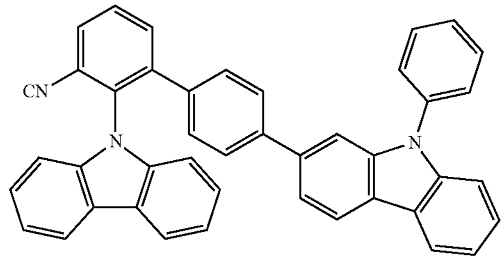
199
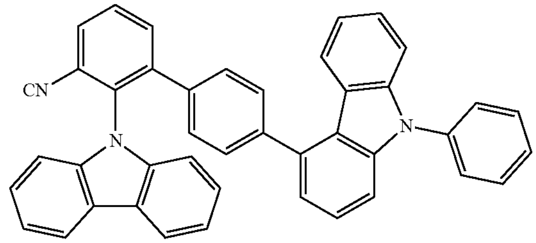
200
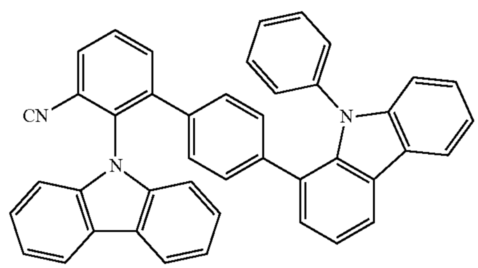
201
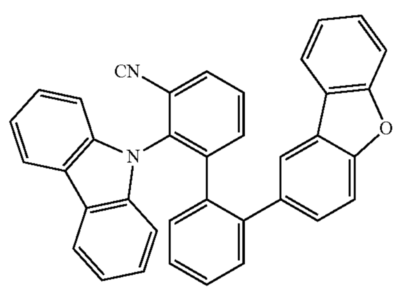
202
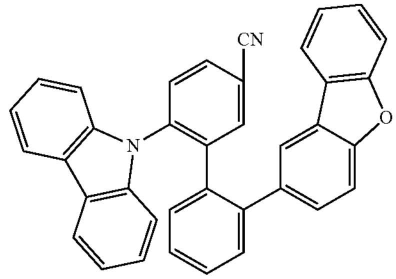

-continued
203
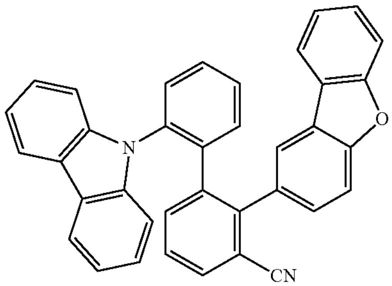
204
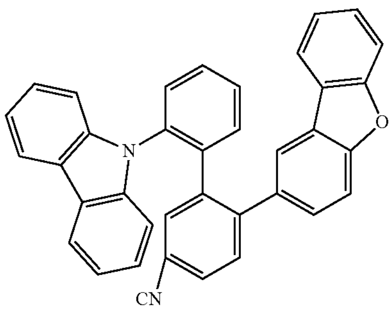
205
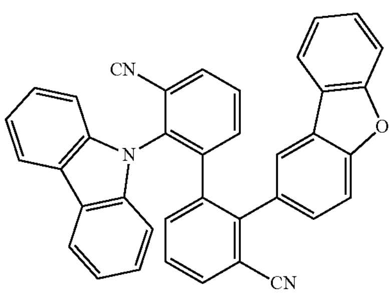
206
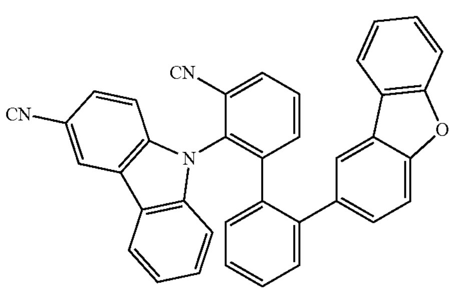
207
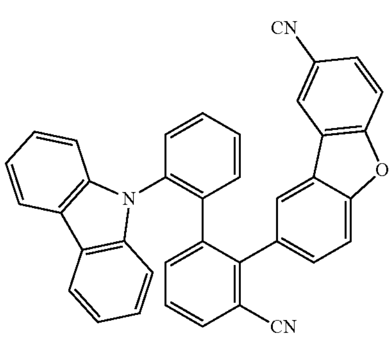
-continued
208
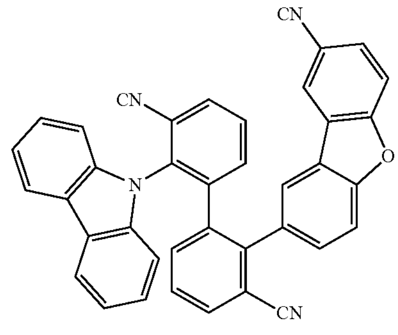
209
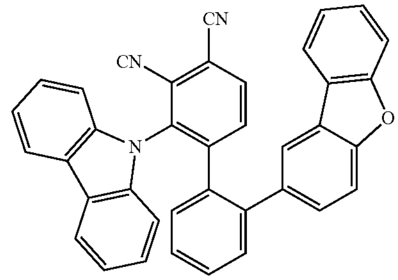
210
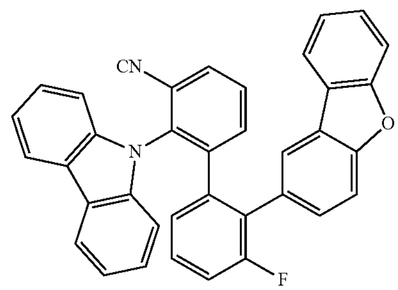
211
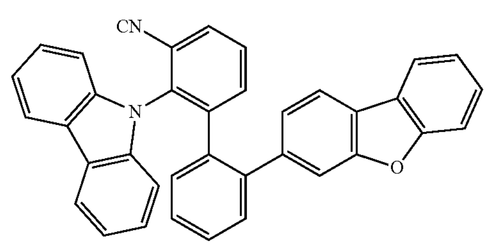
212
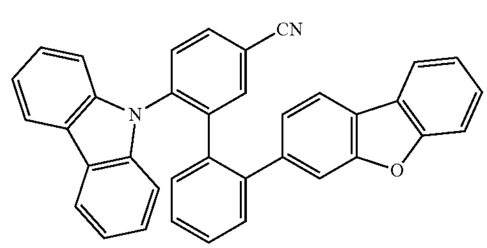

-continued
213
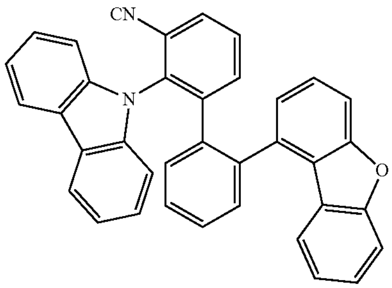
214
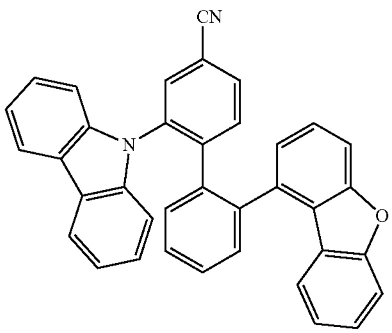
215
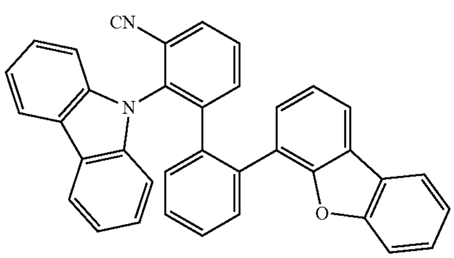
216
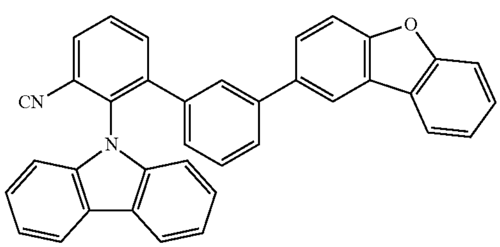
217
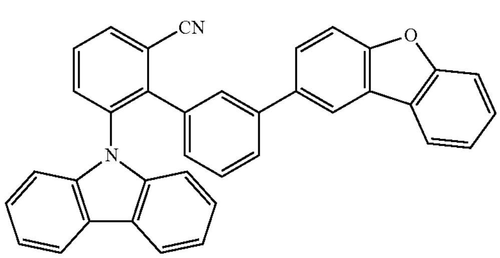
-continued
218
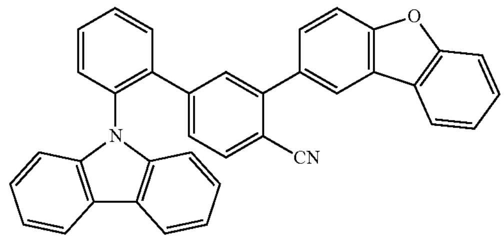
219
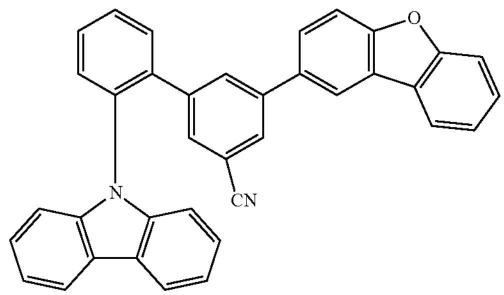
220
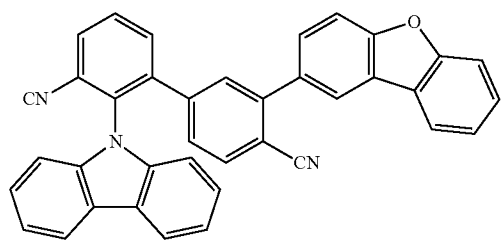
221
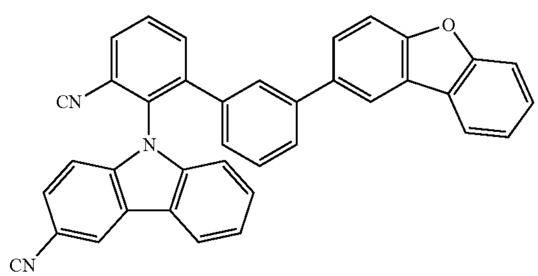
222
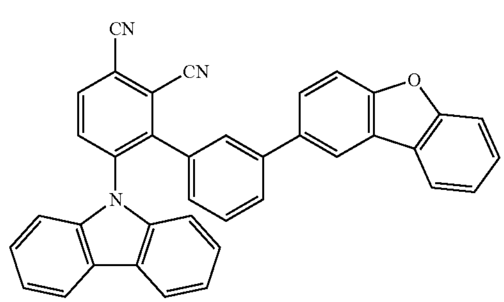

-continued
223
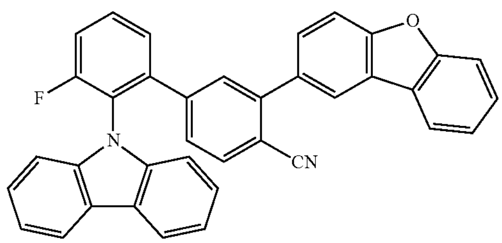
224
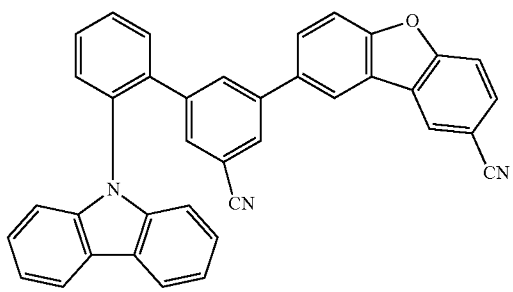
225
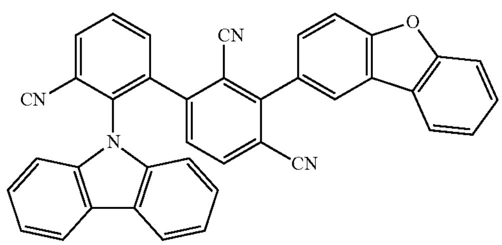
226
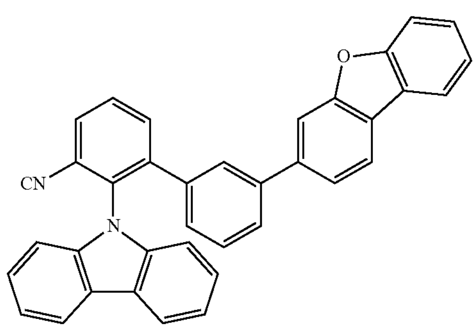
227
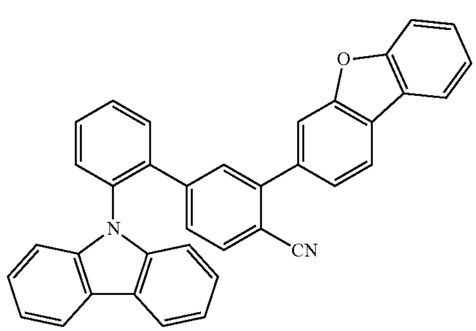
-continued
228
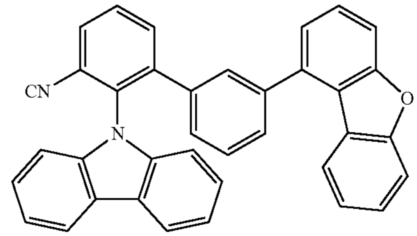
229
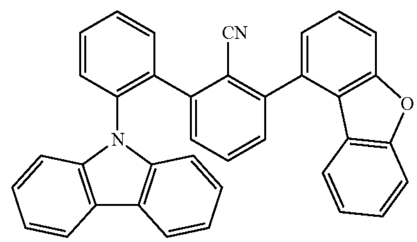
230
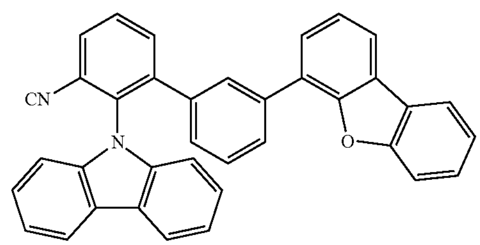
231
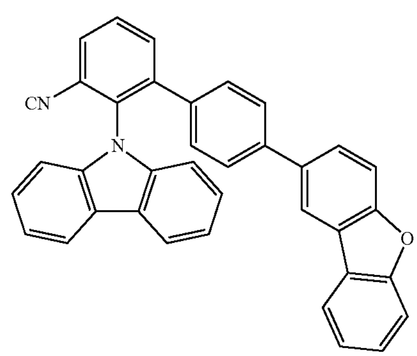
232
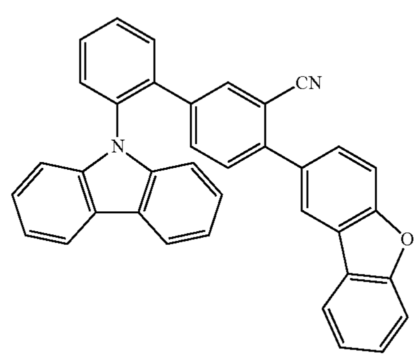

-continued
233
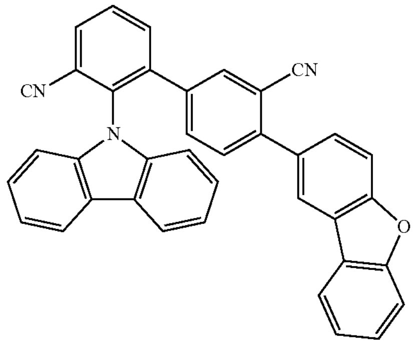
234
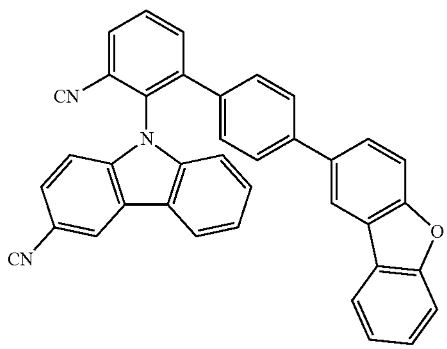
235
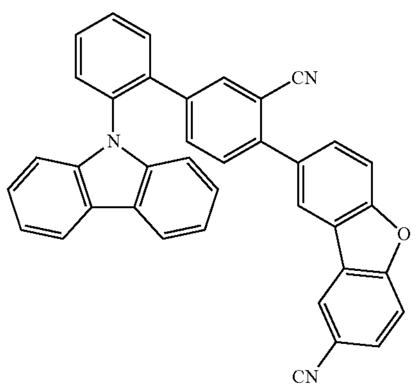
236
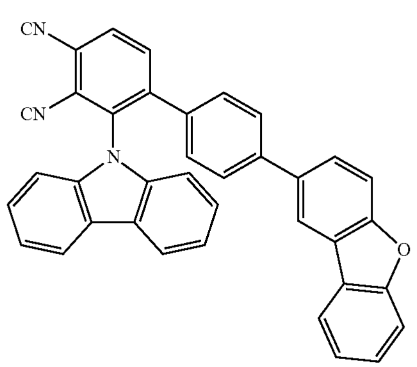
-continued
237
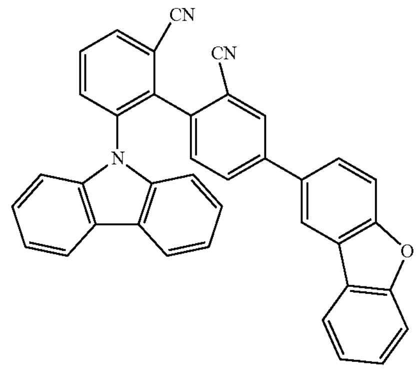
238
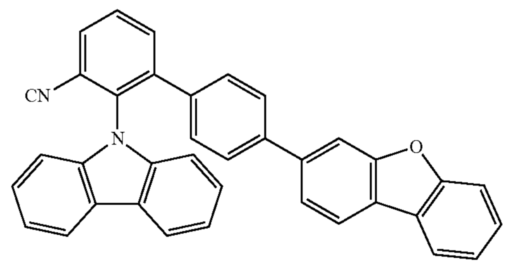
239
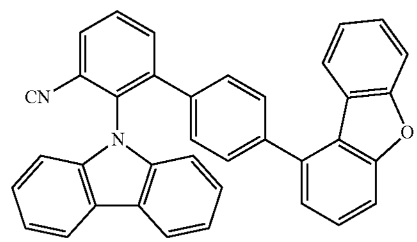
240
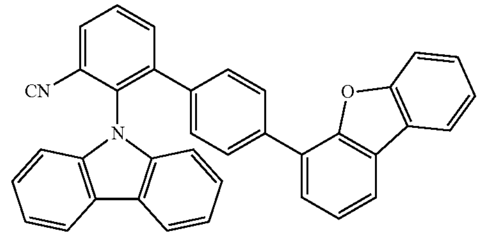
241
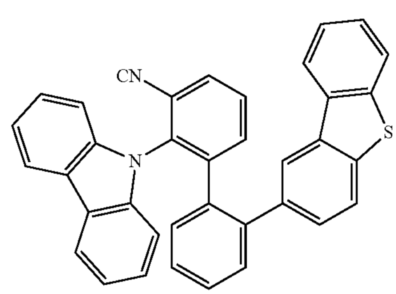

-continued
242
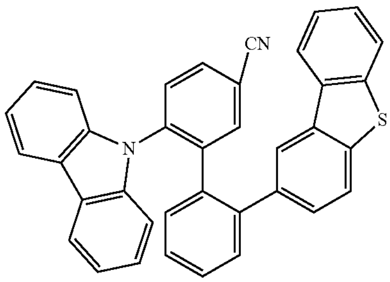
243
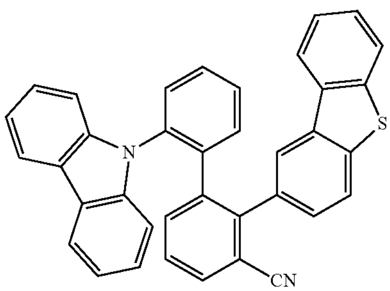
244
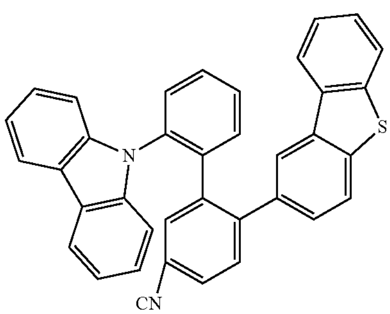
245
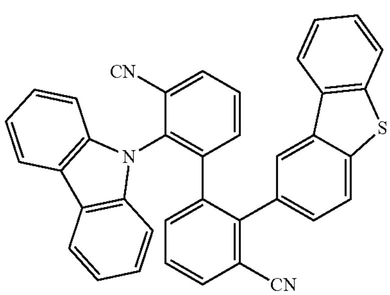
246
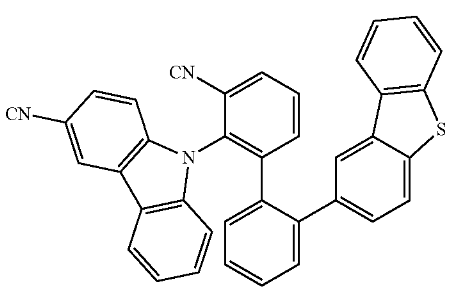
-continued
247
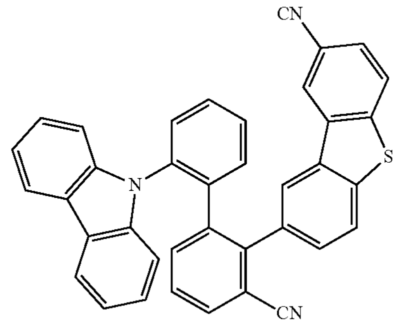
248
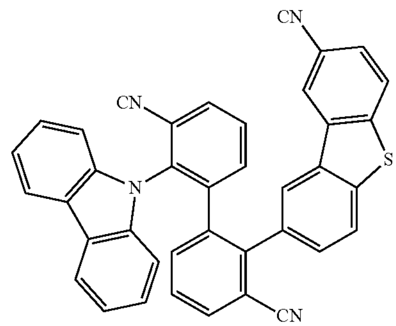
249
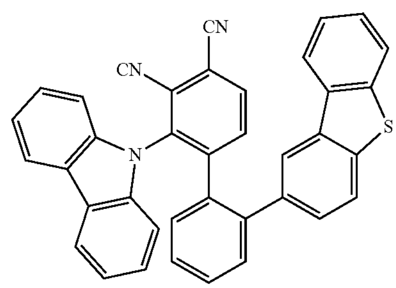
250
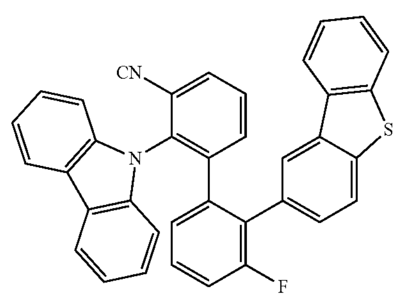
251
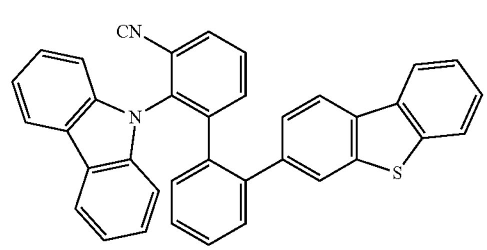

-continued
252
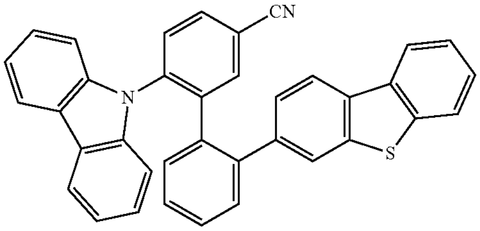
253
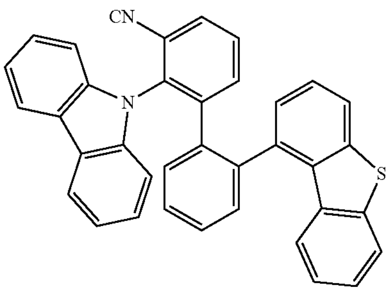
254
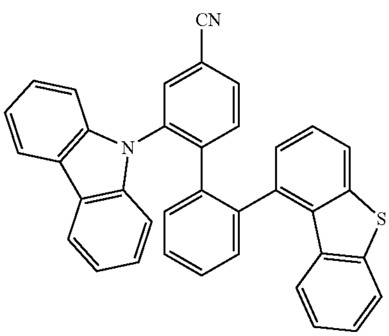
255
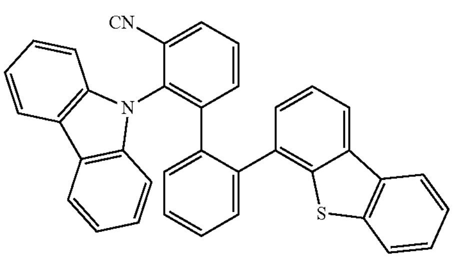
256
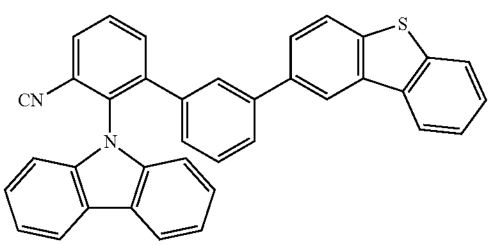
257
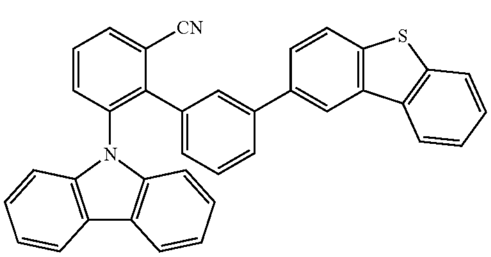
-continued
258
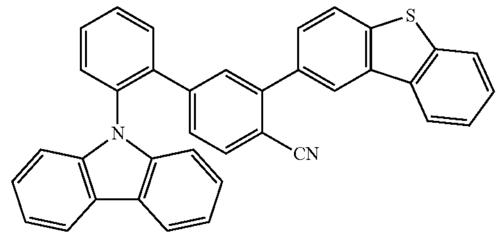
259
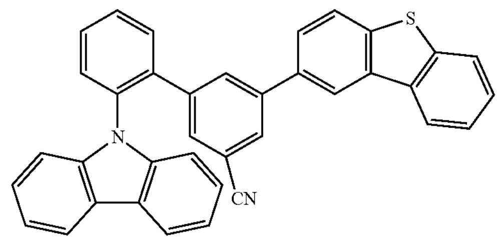
260
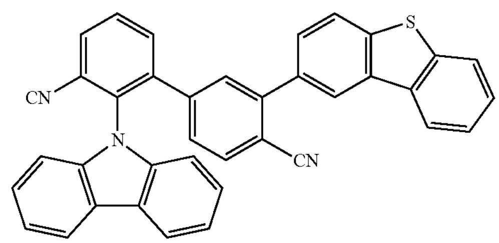
261
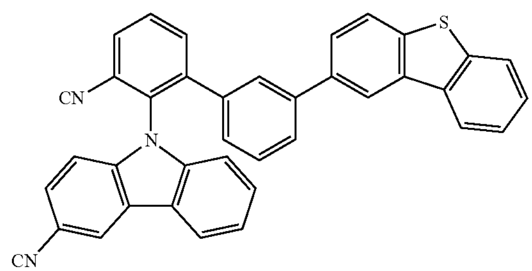
262
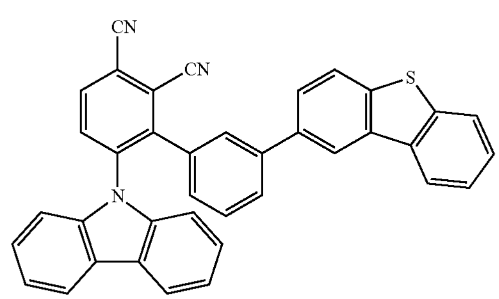
263
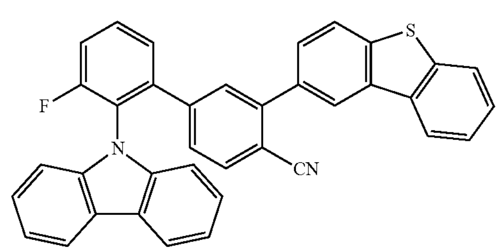

-continued
264
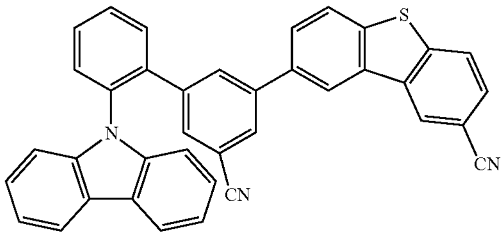
265
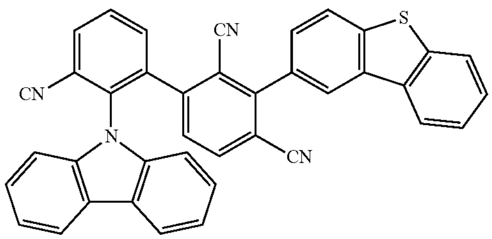
266
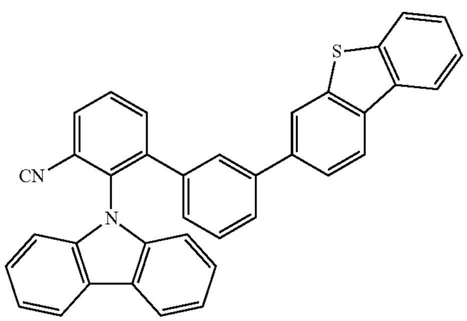
267
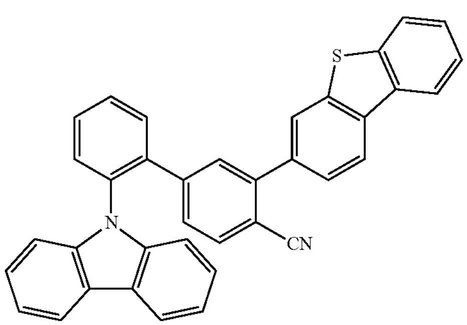
268
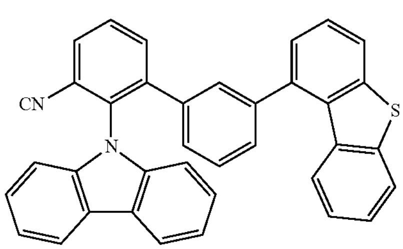
-continued
269
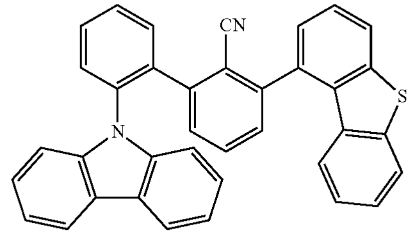
270
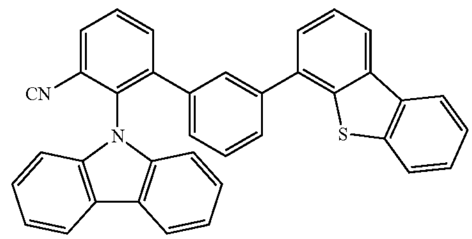
271
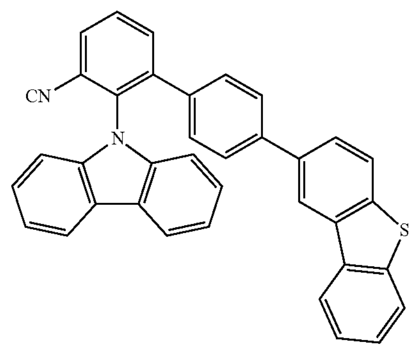
272
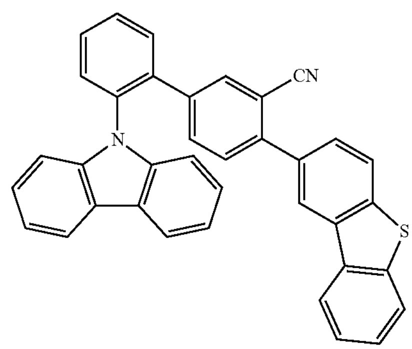
273
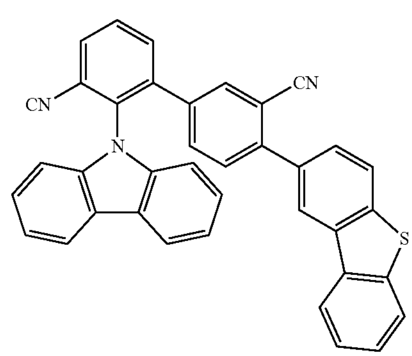

-continued
274
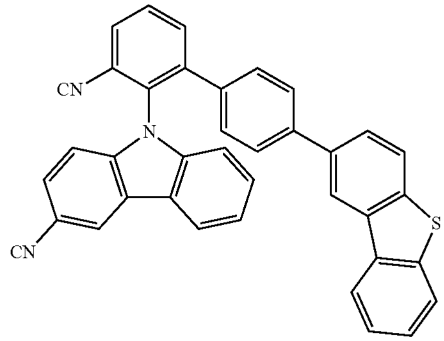
275
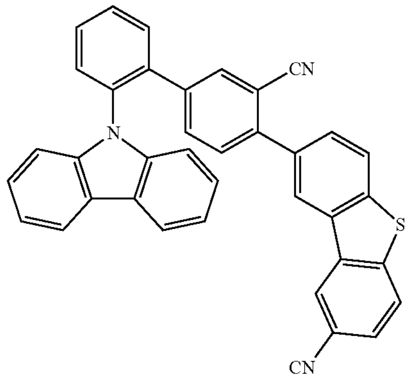
276
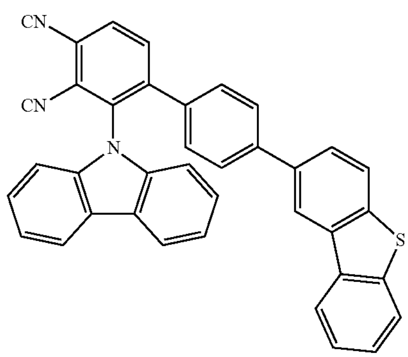
277
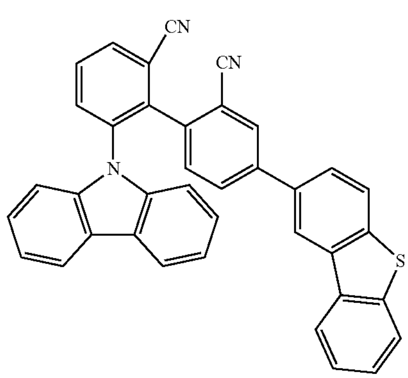
-continued
278
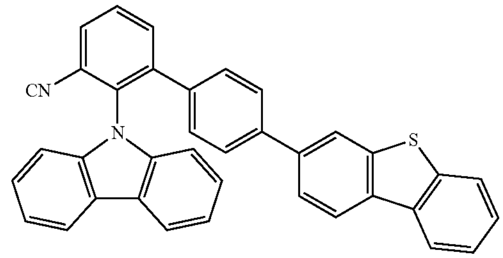
279
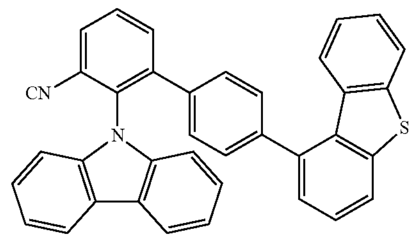
280
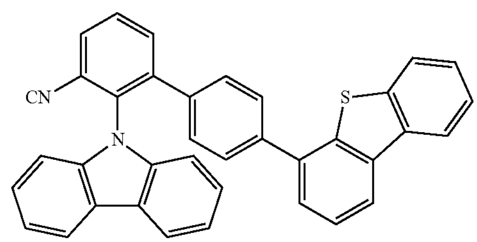
281
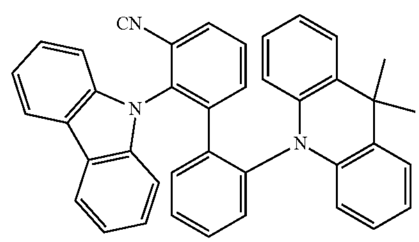
282
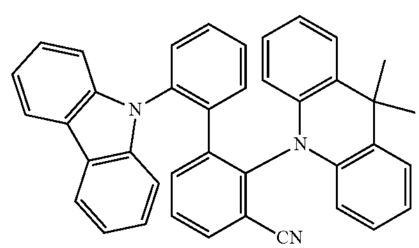
283
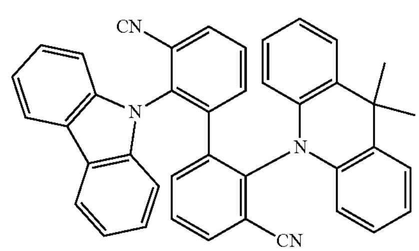

284
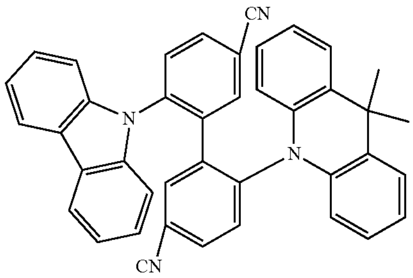
285
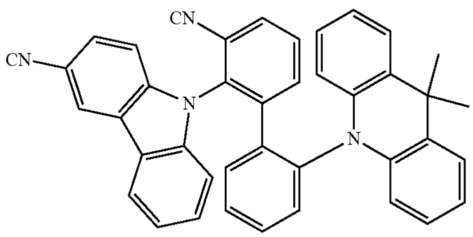
286
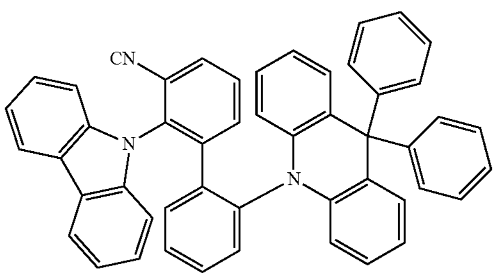
287
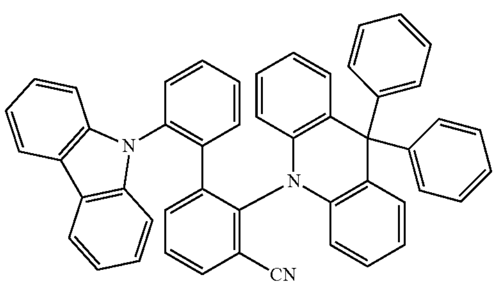
288
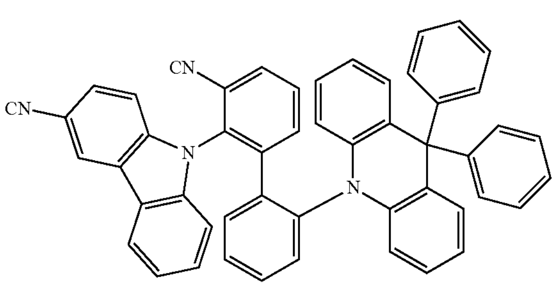
289
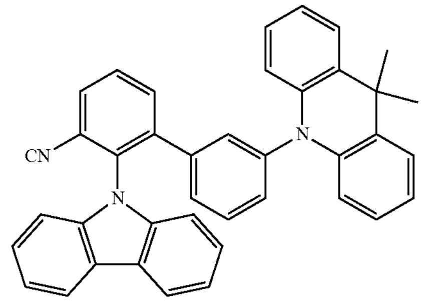
290
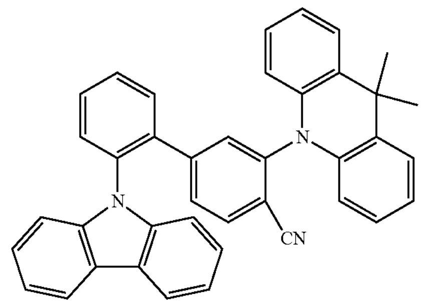
291
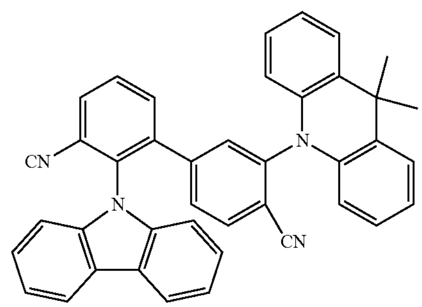
292
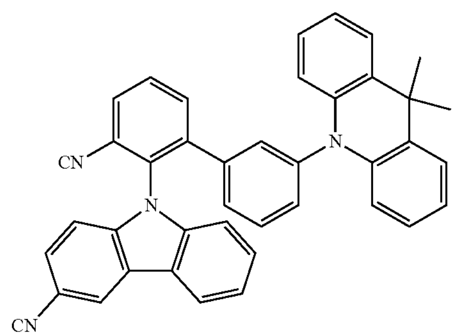
293
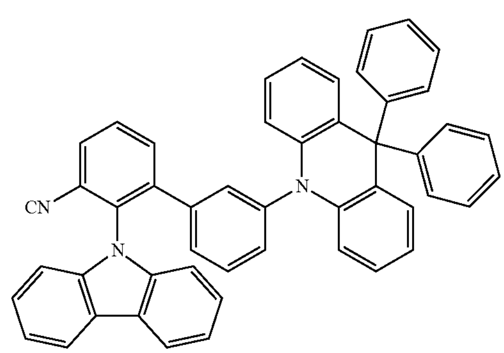

-continued
294
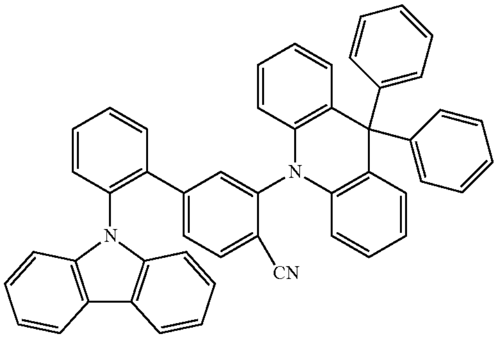
295
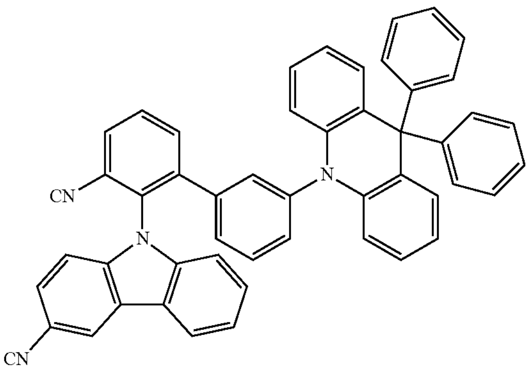
296
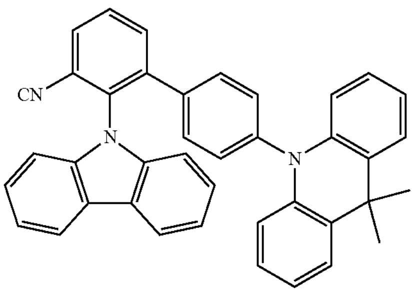
297
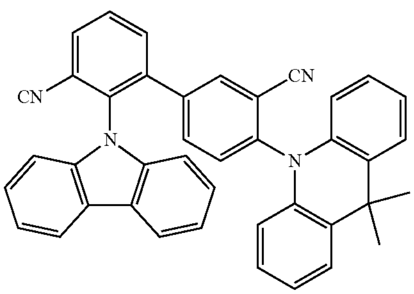
298
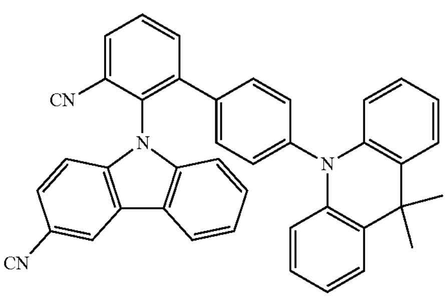
-continued
299
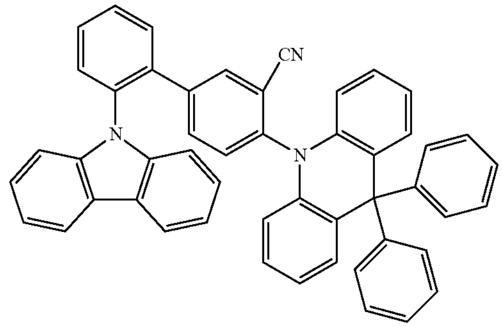
300
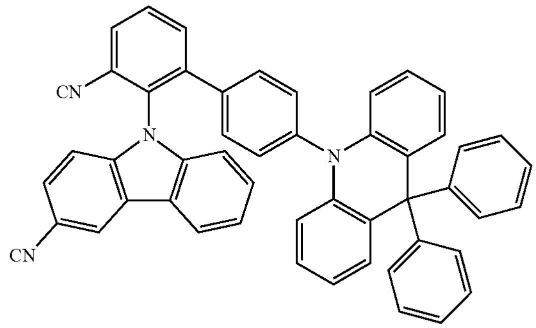
301
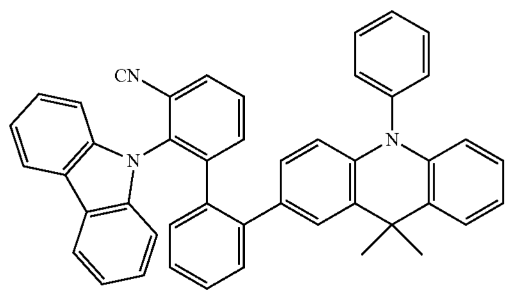
302
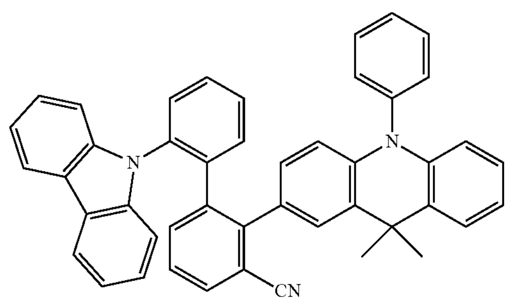
303
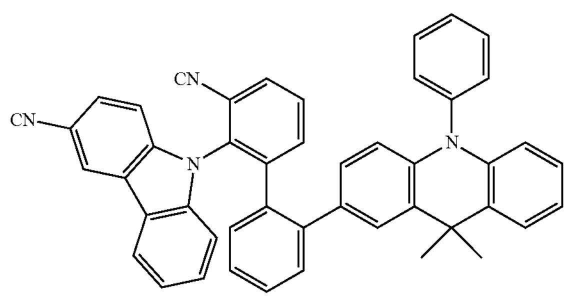

-continued
304
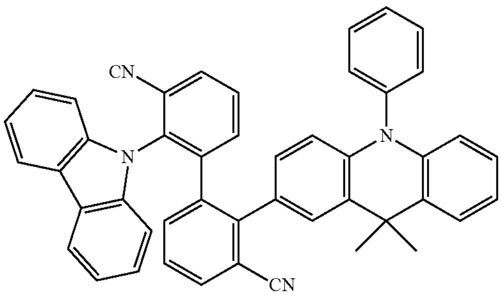
305
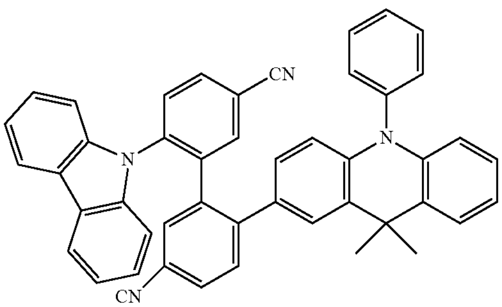
306
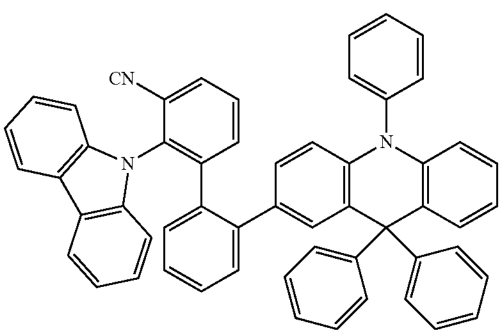
307
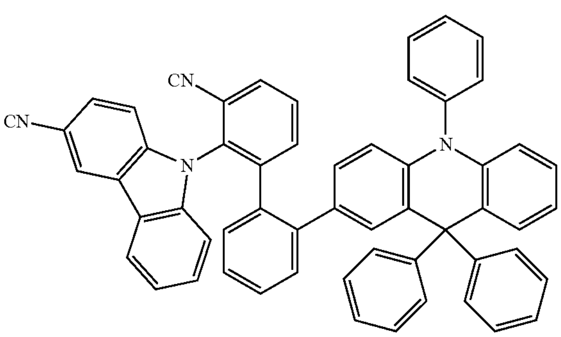
-continued
308
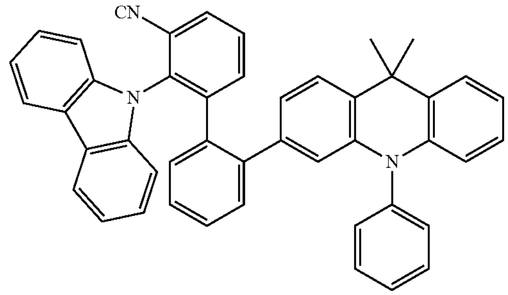
309
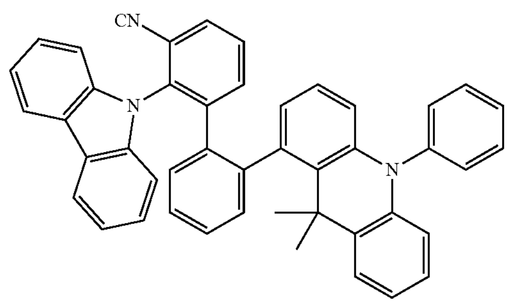
310
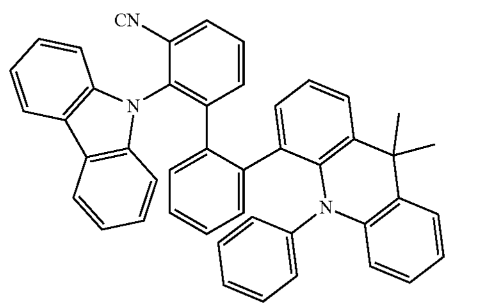
311
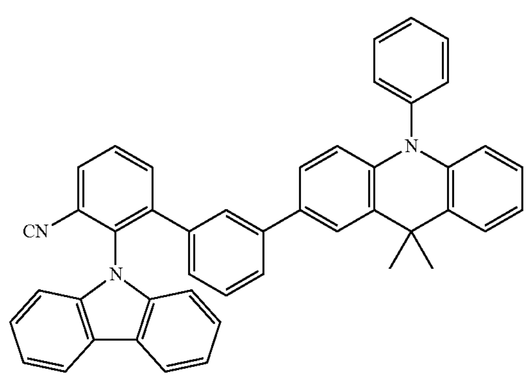

312
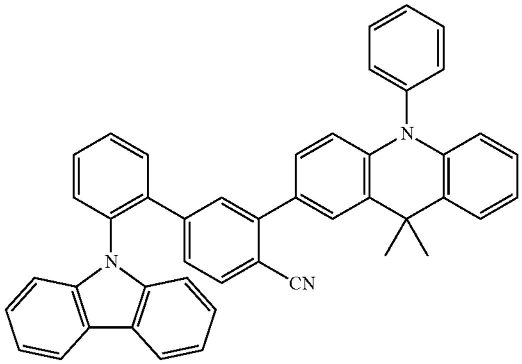
313
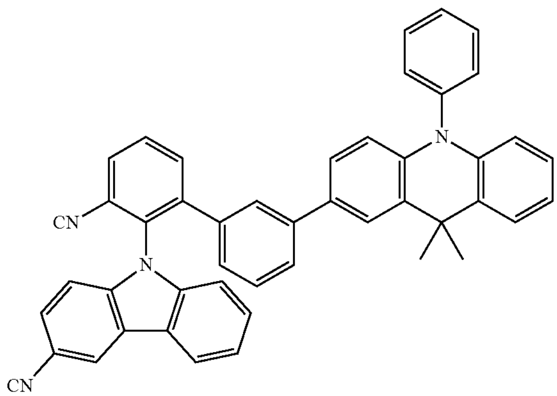
314
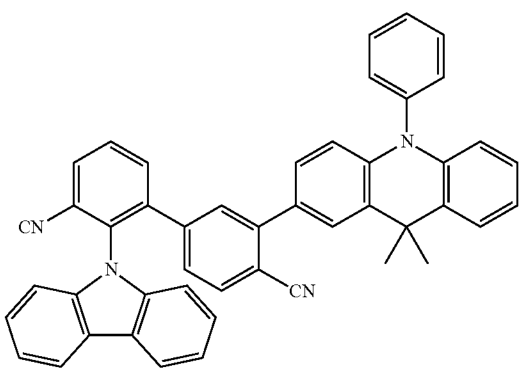
315
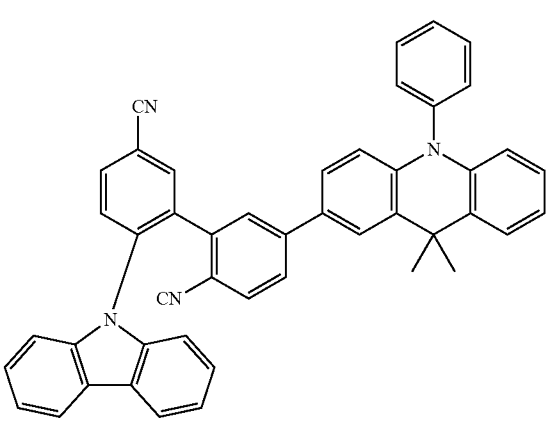
316
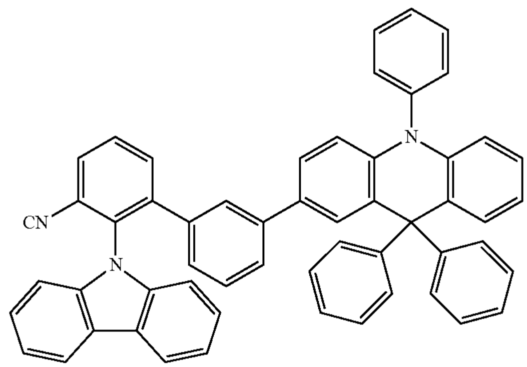
317
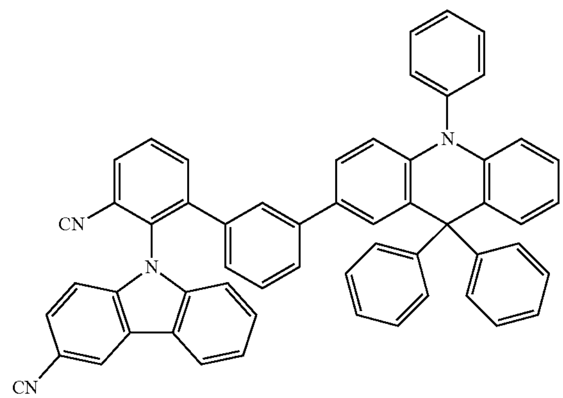
318
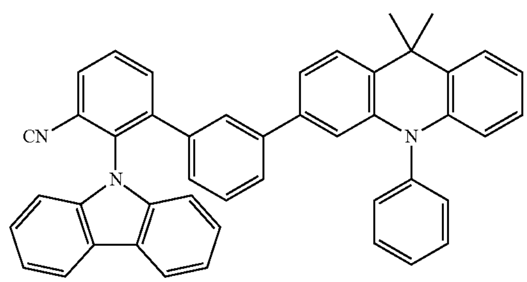
319
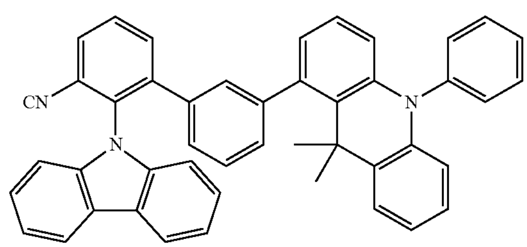
320
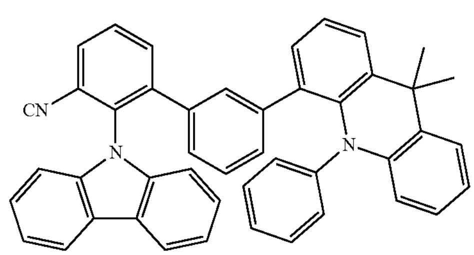

-continued
321
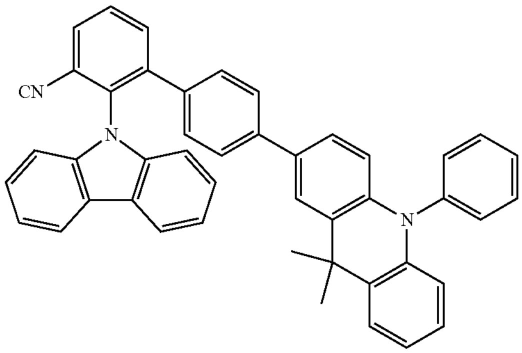
322
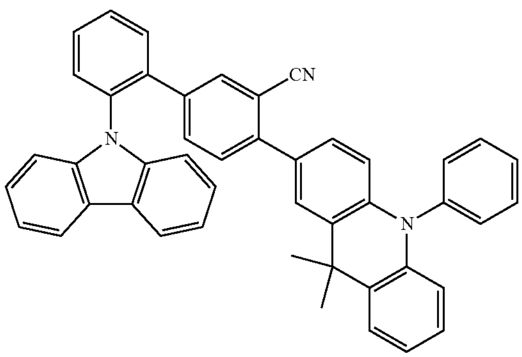
323
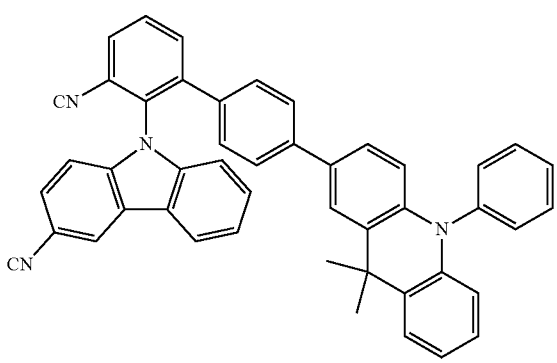
324
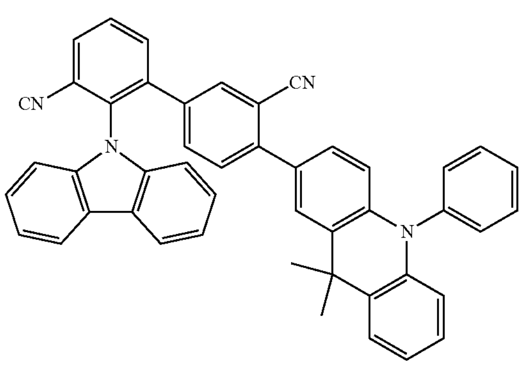
-continued
325
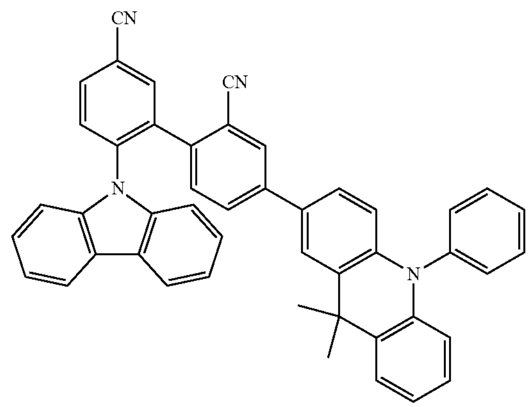
326
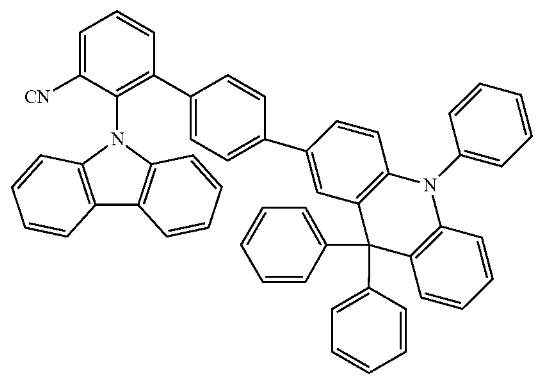
327
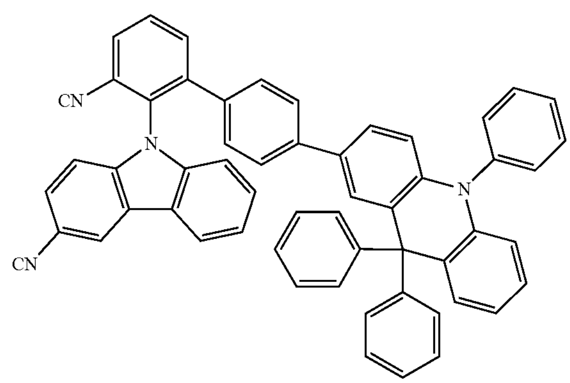
328
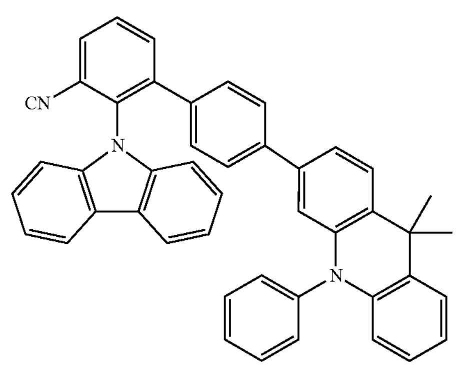

329
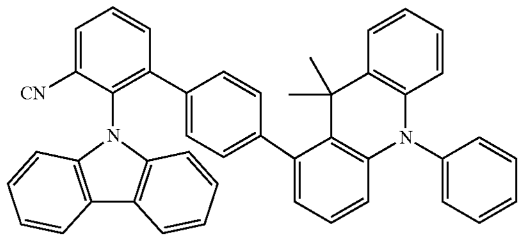
330
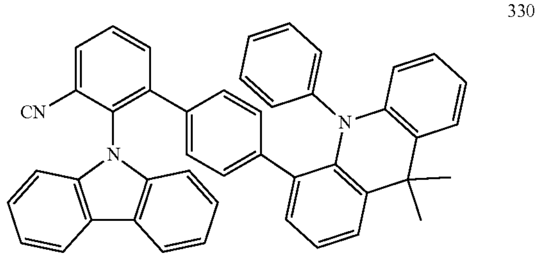
Group HE7
1
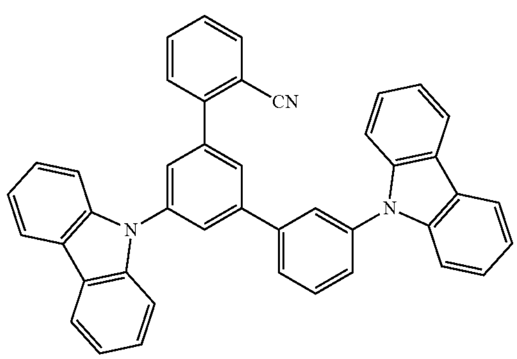
2
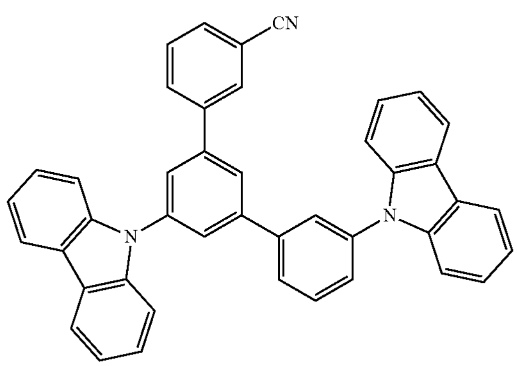
3
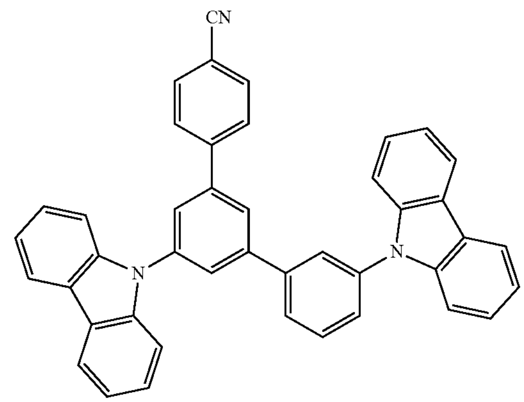
4
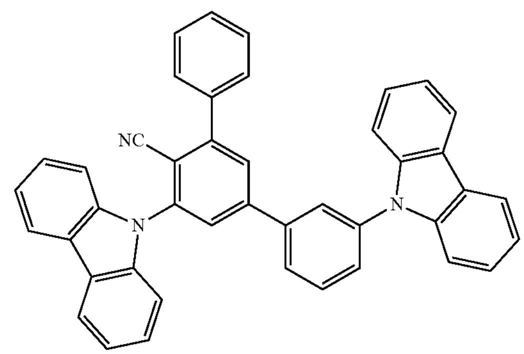
5
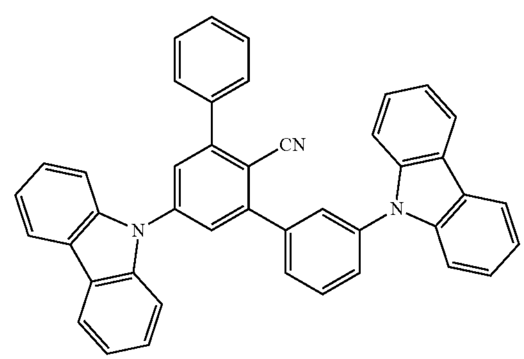
6
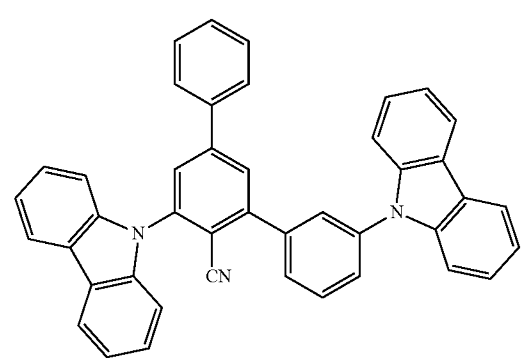

-continued
7
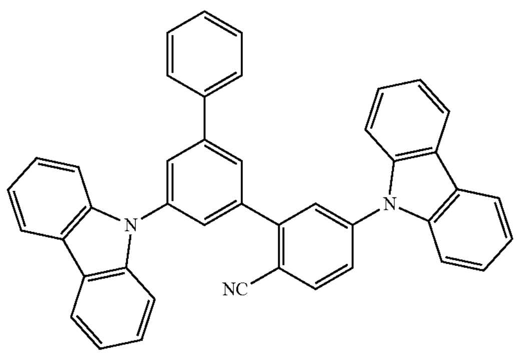
8
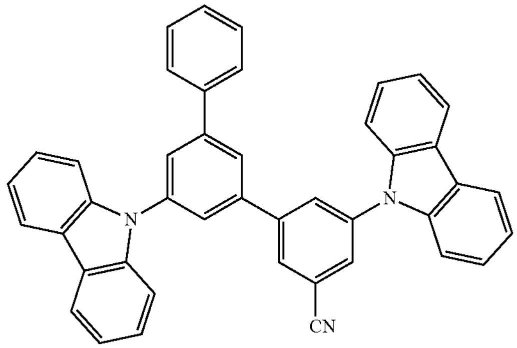
9
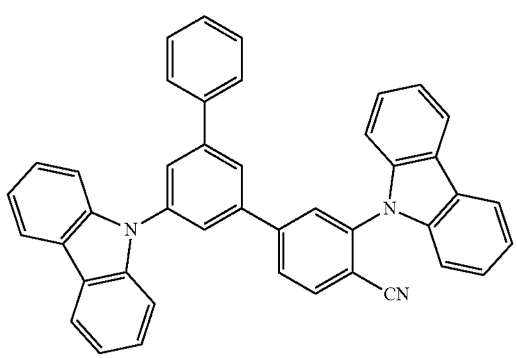
10
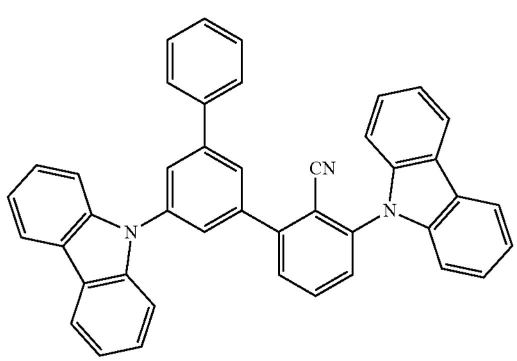
-continued
11
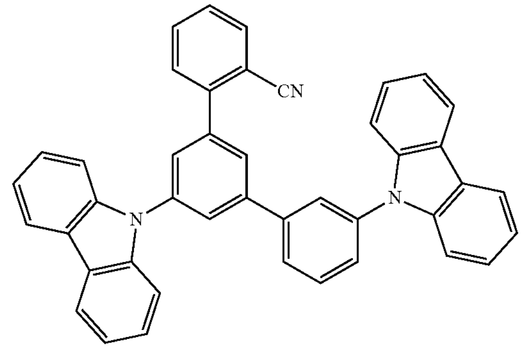
12
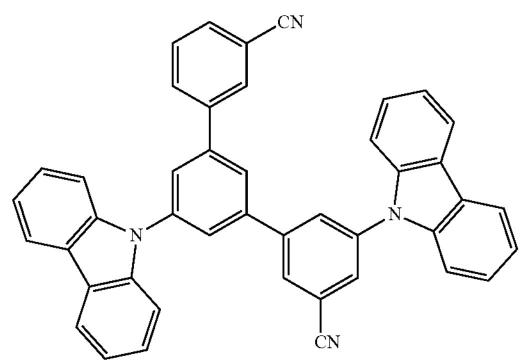
13
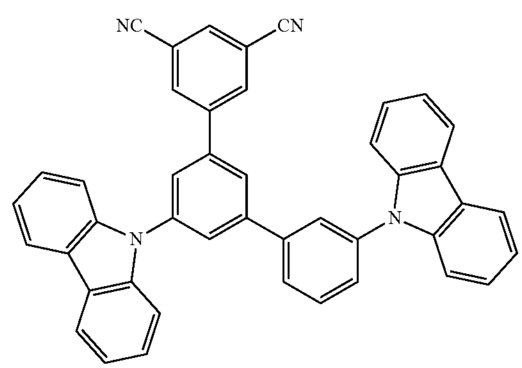
14
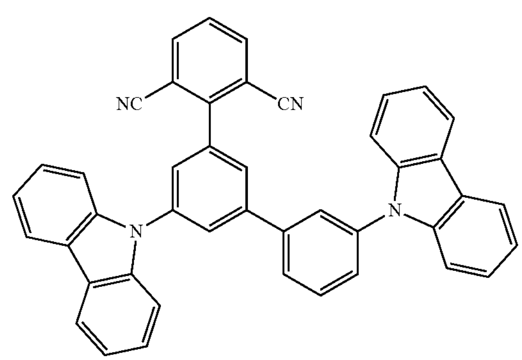

-continued
15
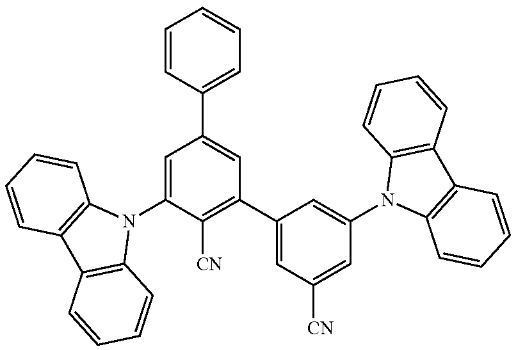
16
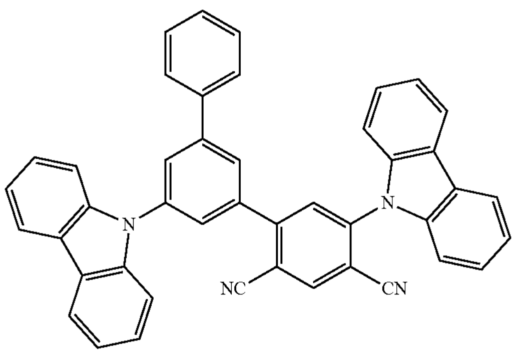
17
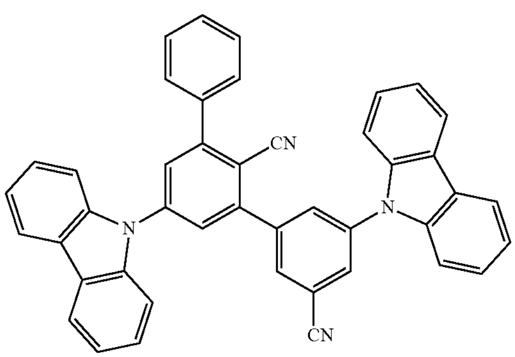
18
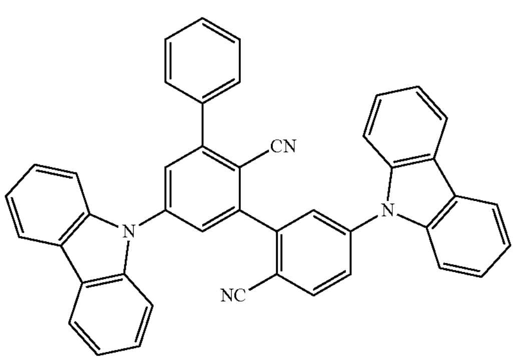
-continued
19
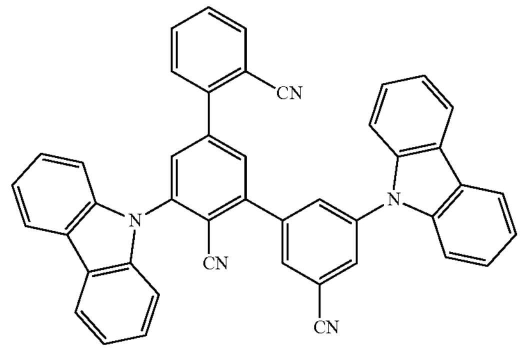
20
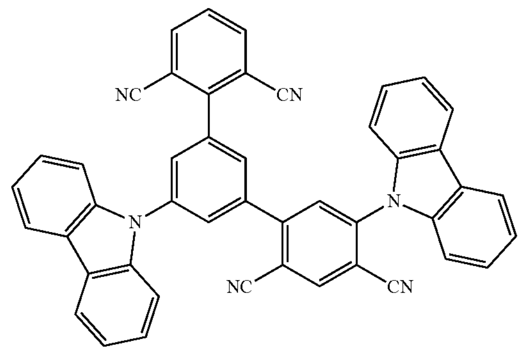
21
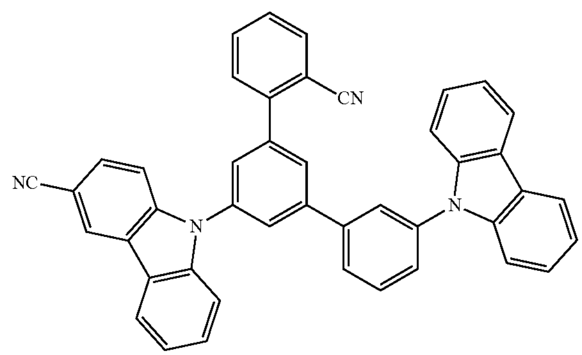
22
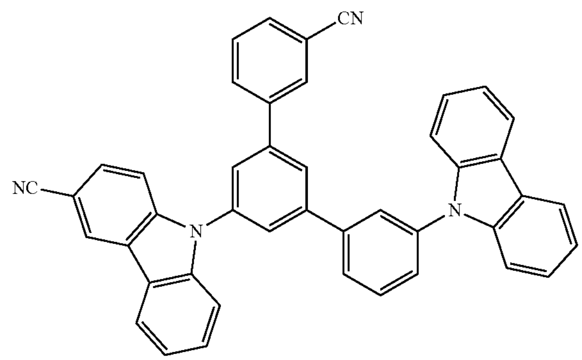

23
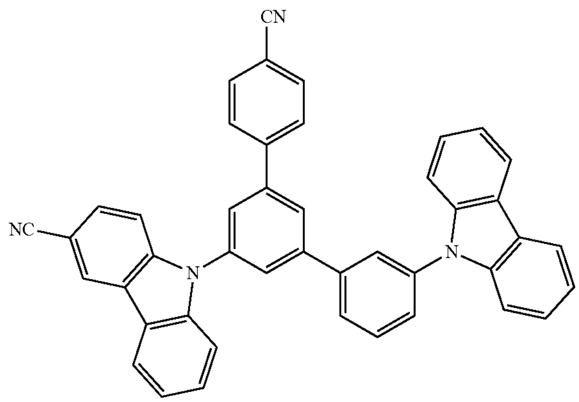
24
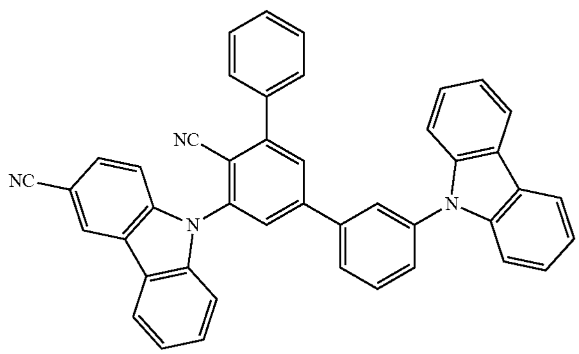
25
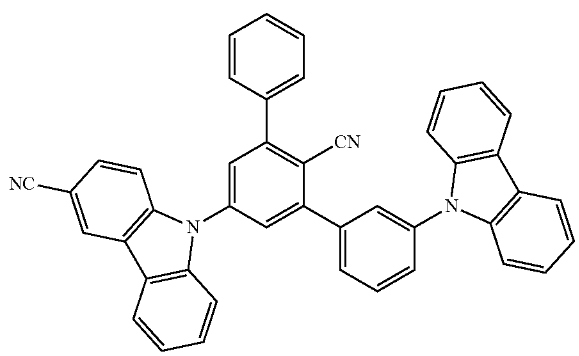
26
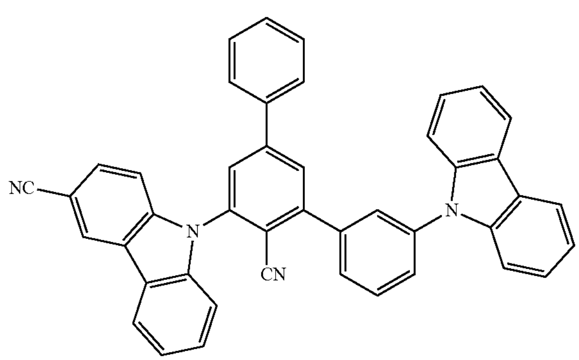
27
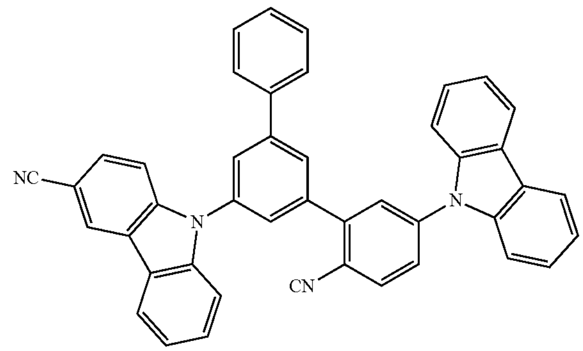
28
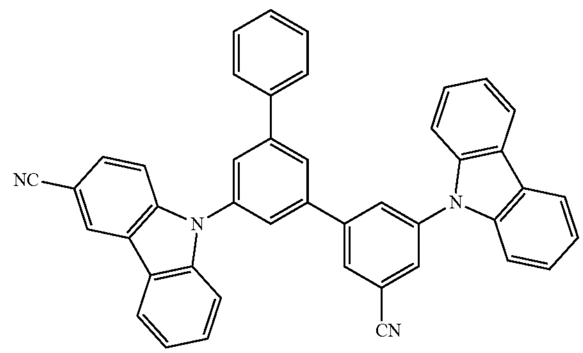
29
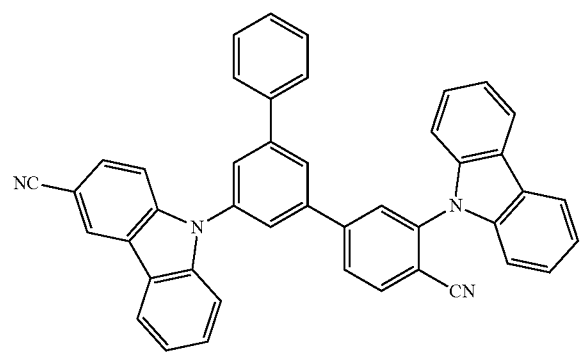
30
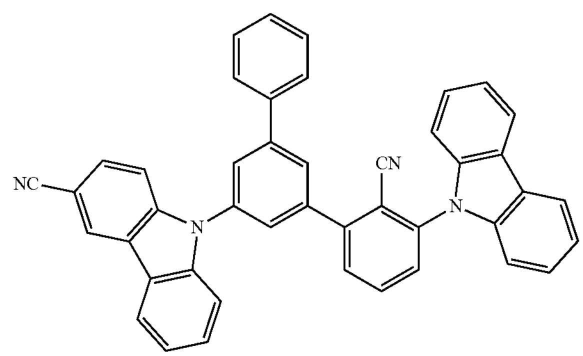

-continued
31
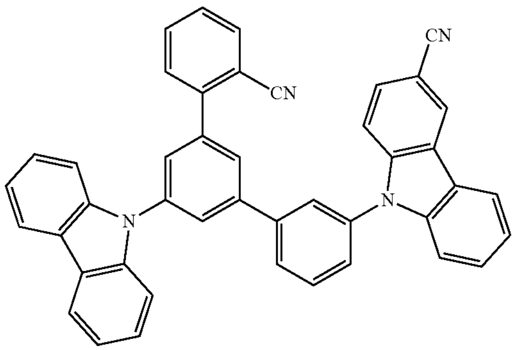
32
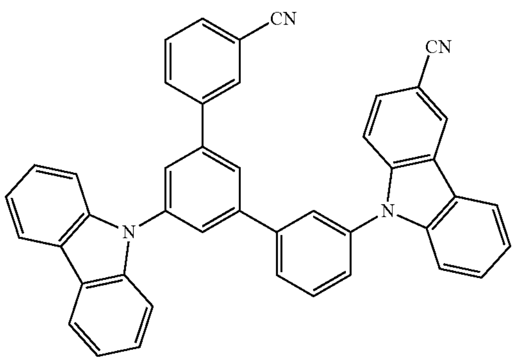
33
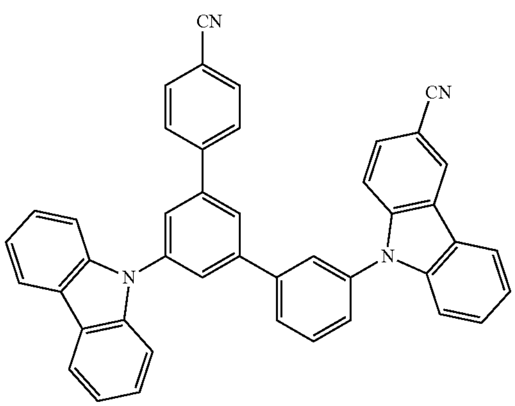
34
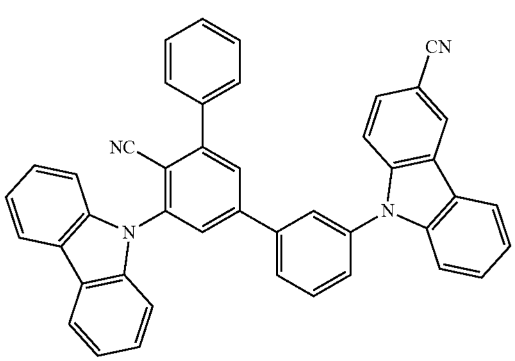
-continued
35
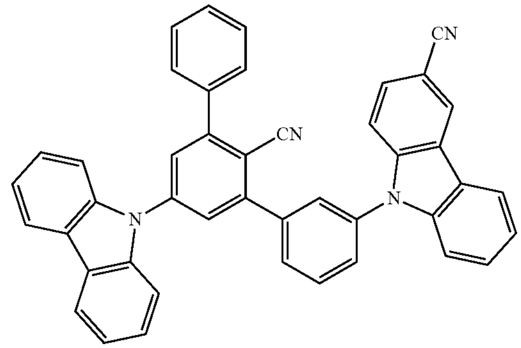
36
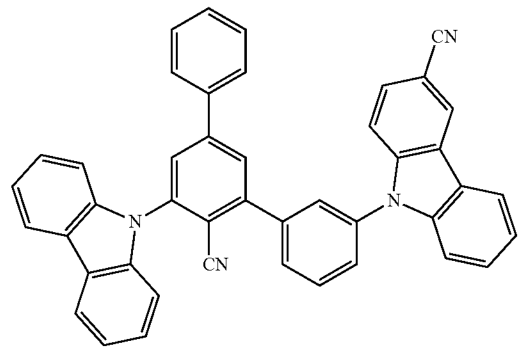
37
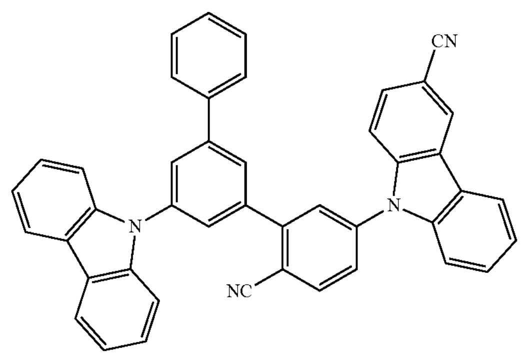
38
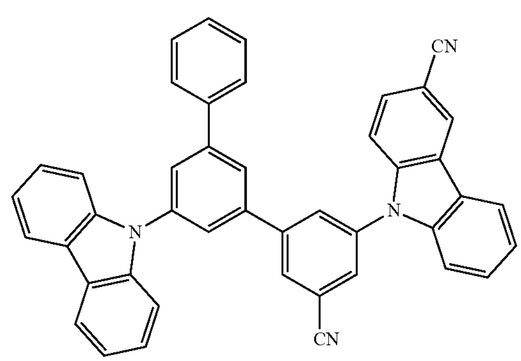

-continued
39
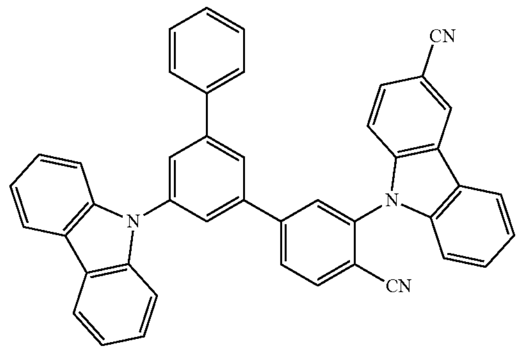
40
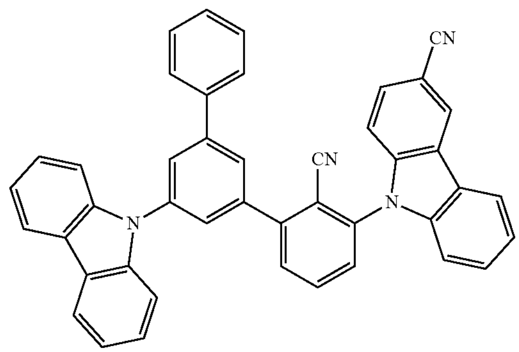
41
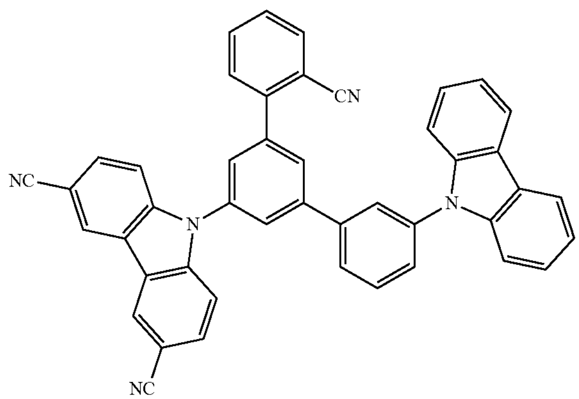
42
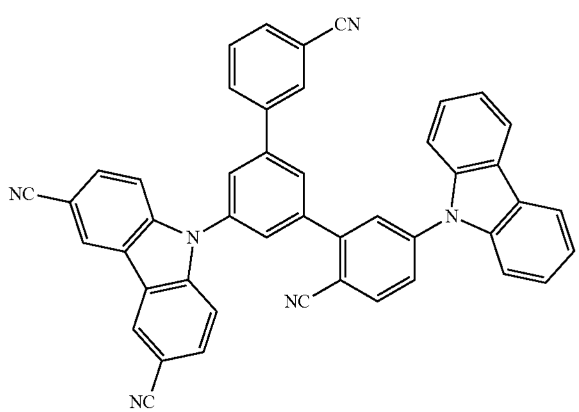
-continued
43
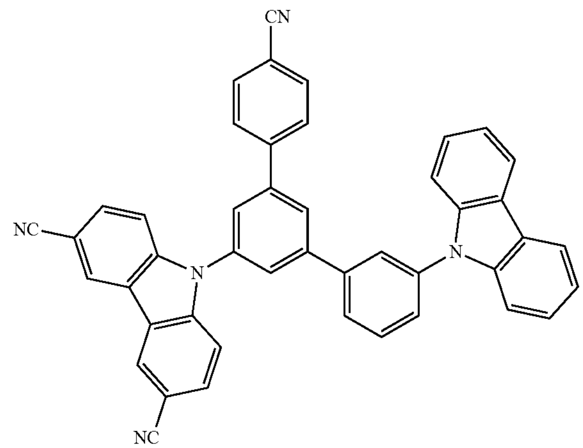
44
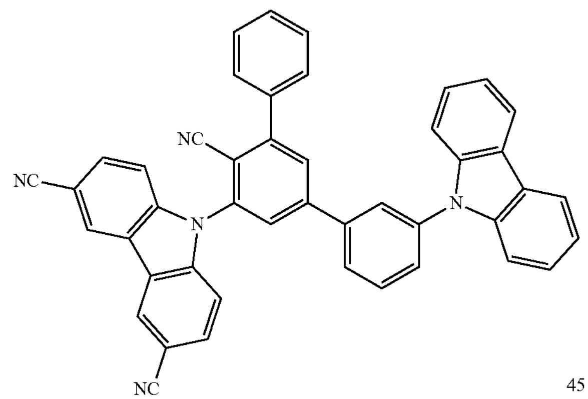
45
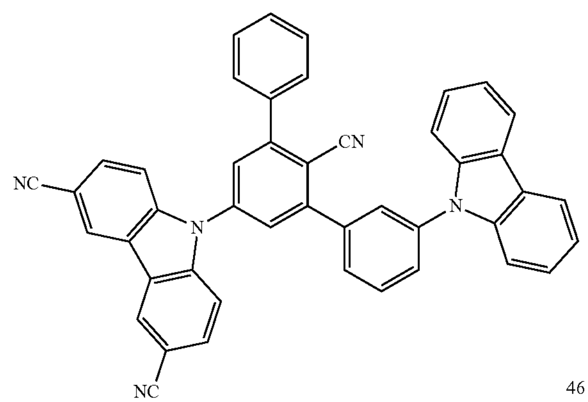
46
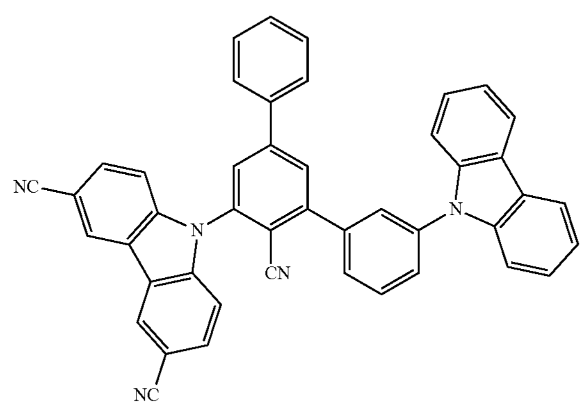

-continued
47
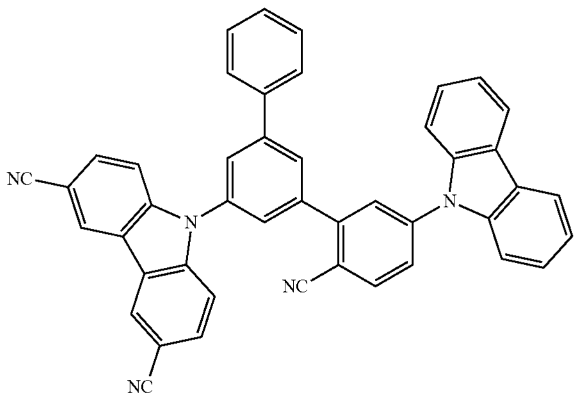
48
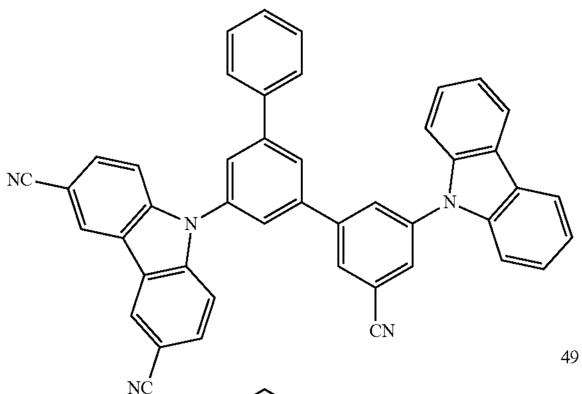
49
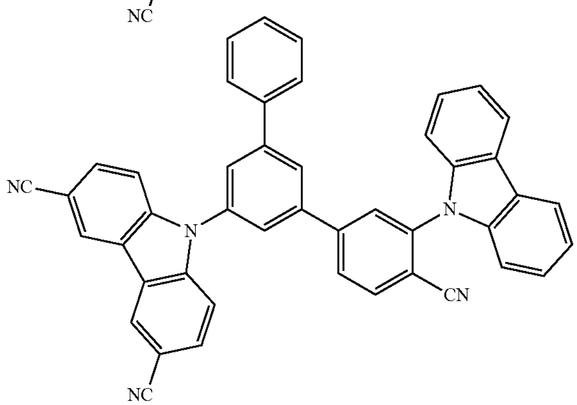
50
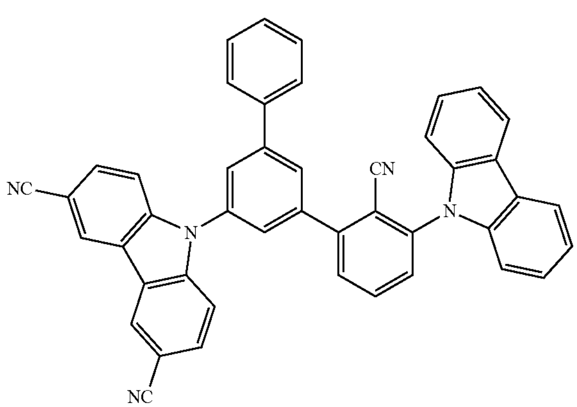
-continued
51
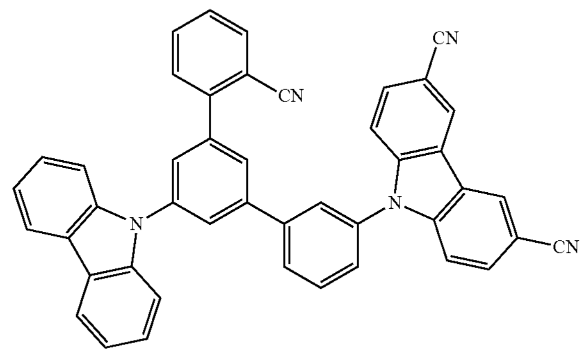
52
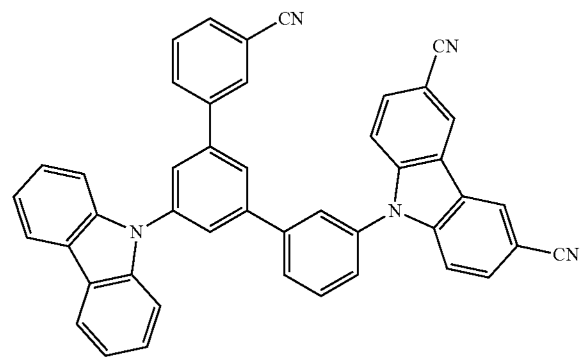
53
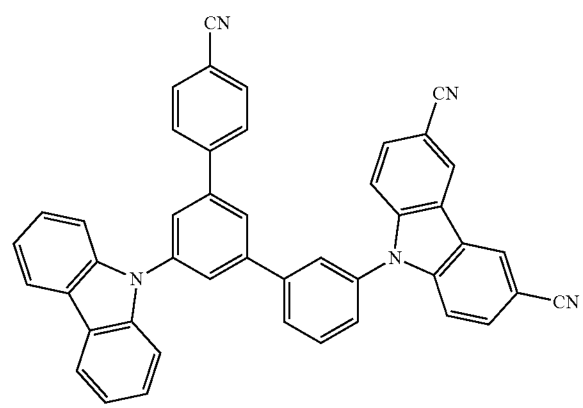
54
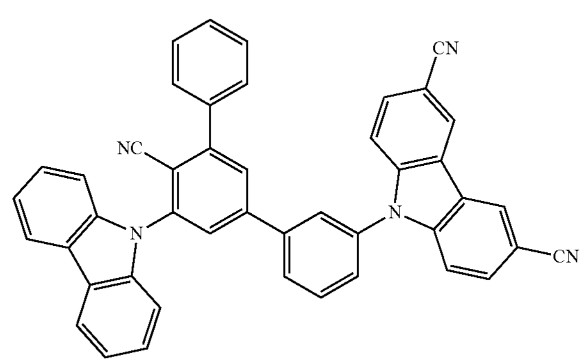

-continued
55
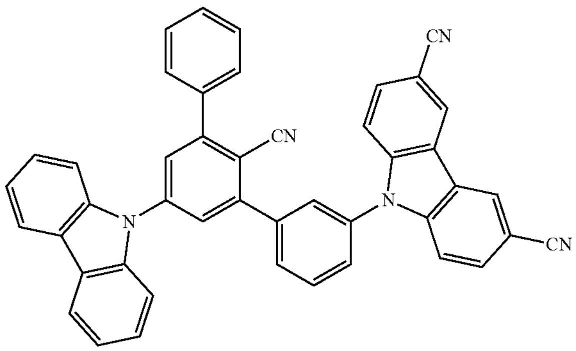
56
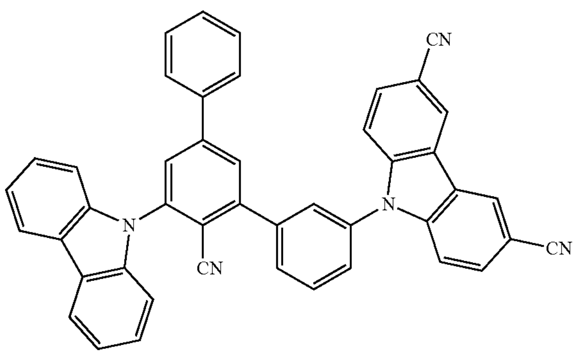
57
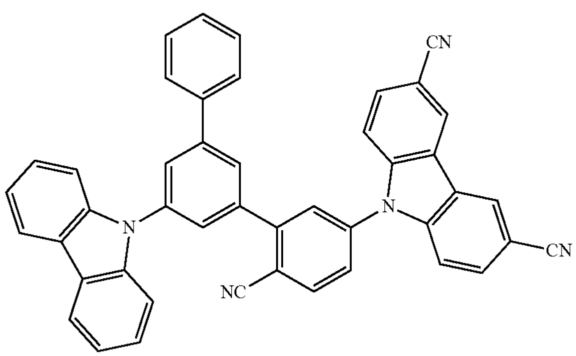
58
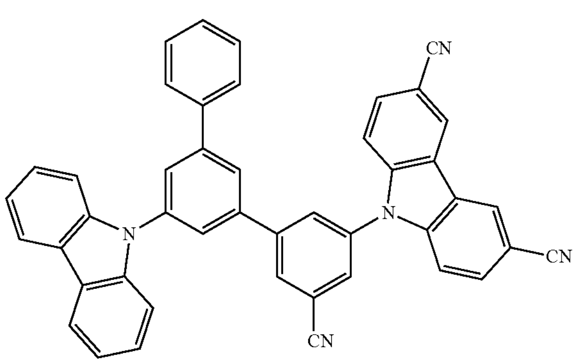
-continued
59
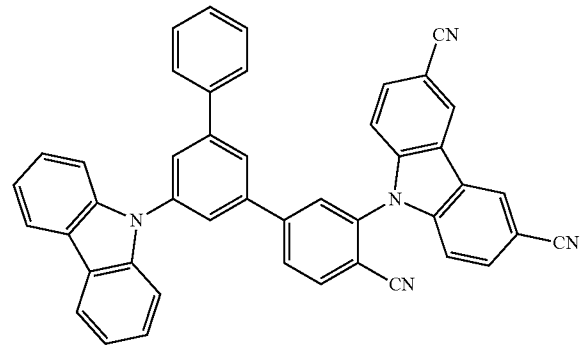
60
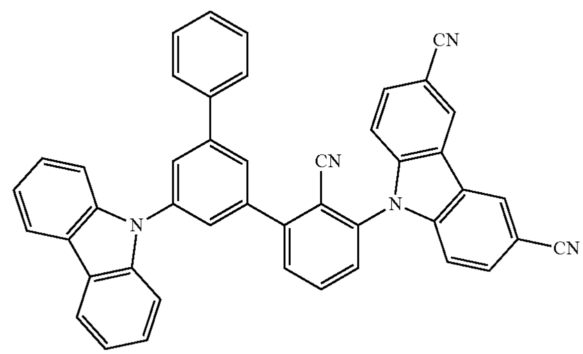
61
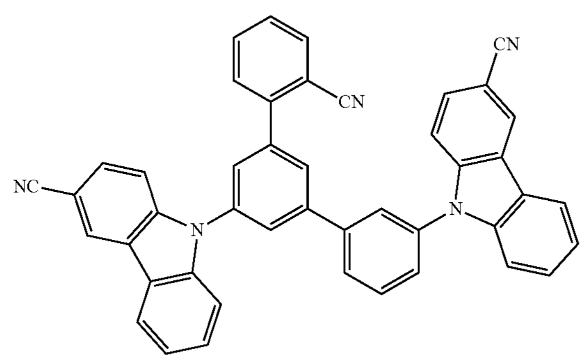
62
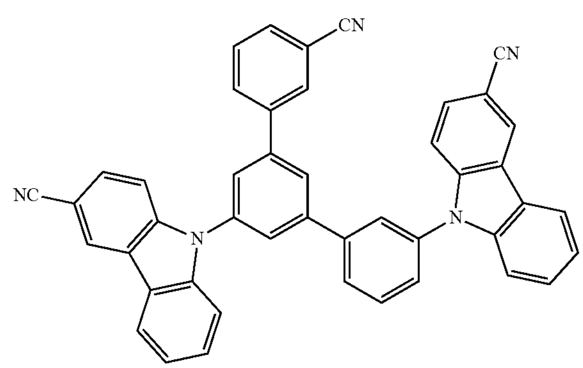

-continued
63
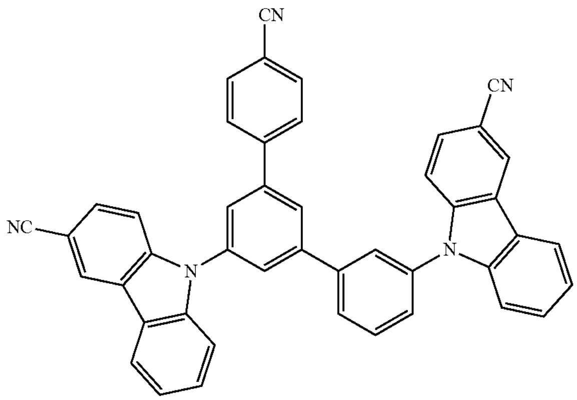
64
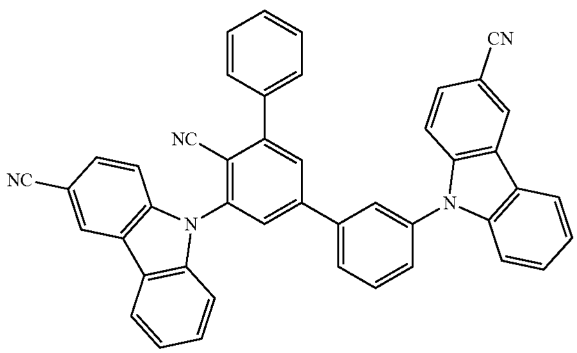
65
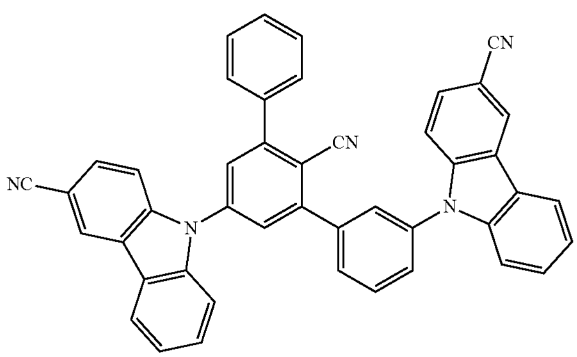
66
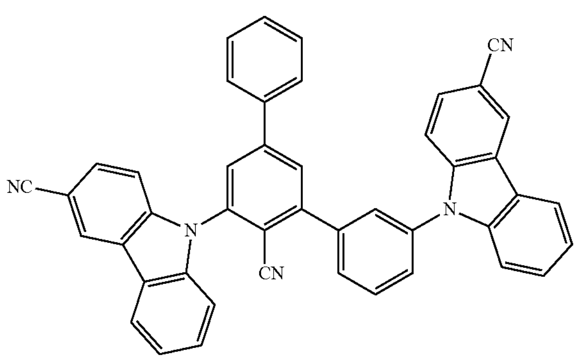
-continued
67
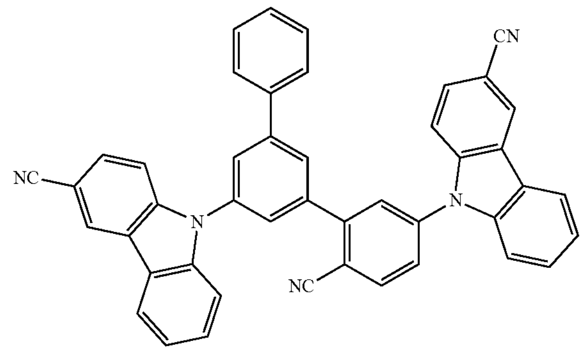
68
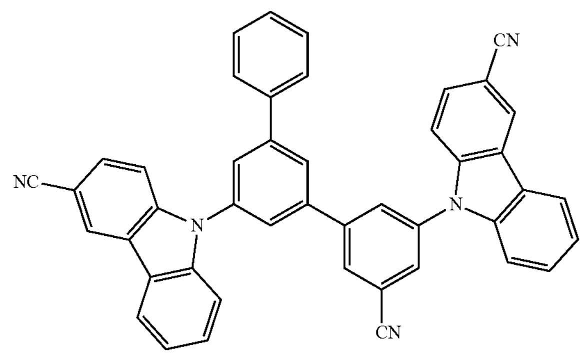
69
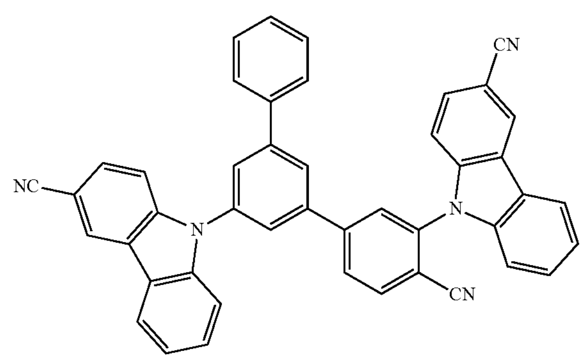
70
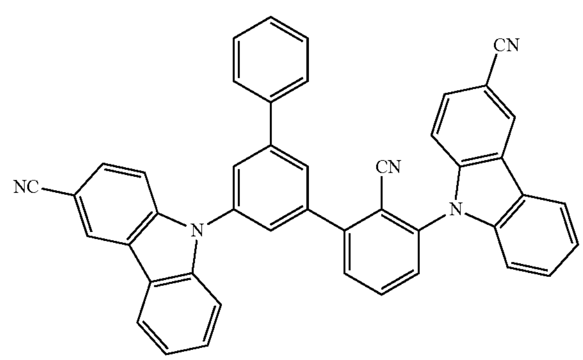

71
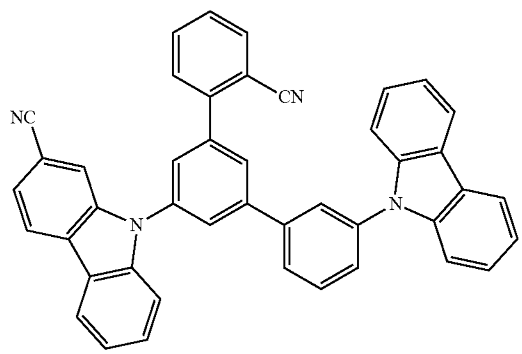
72
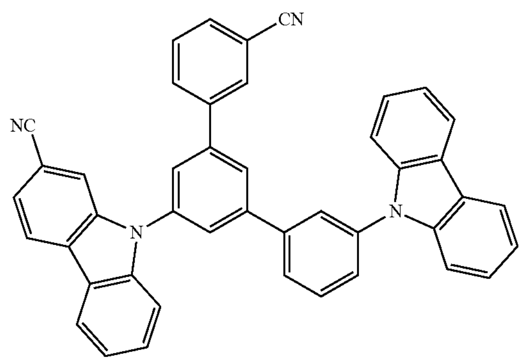
73
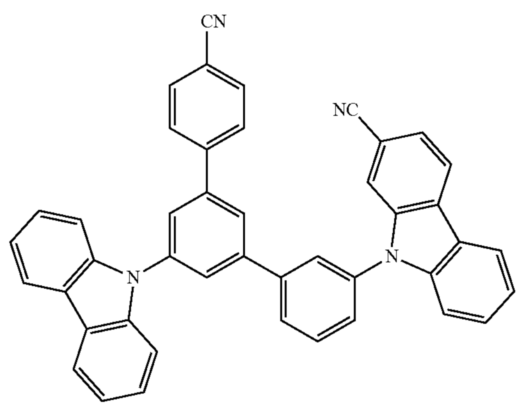
74
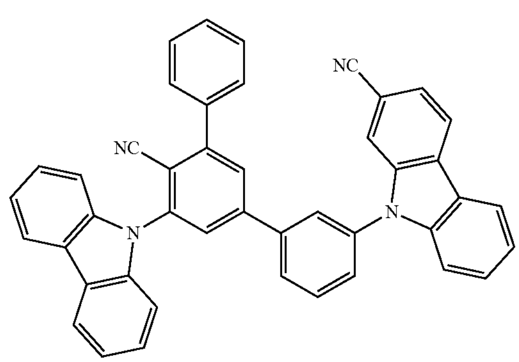
75
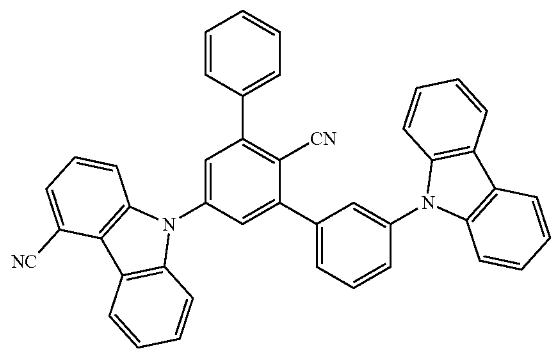
76
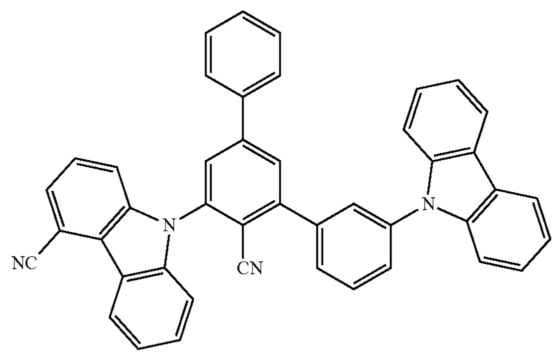
77
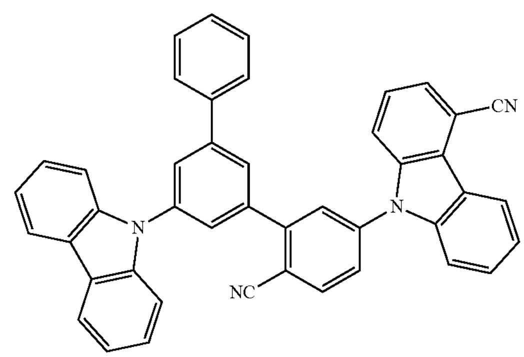
78
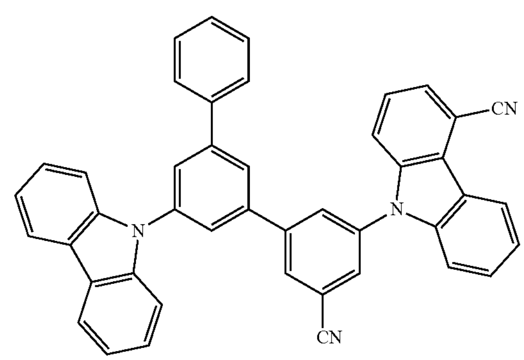

79
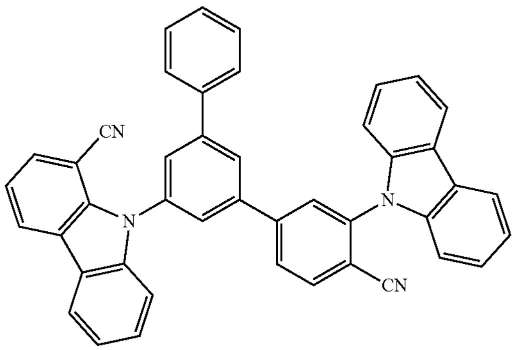
80
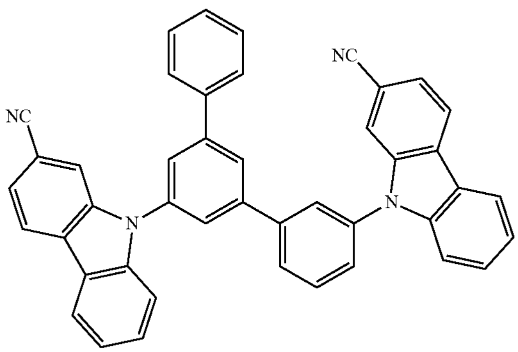
81
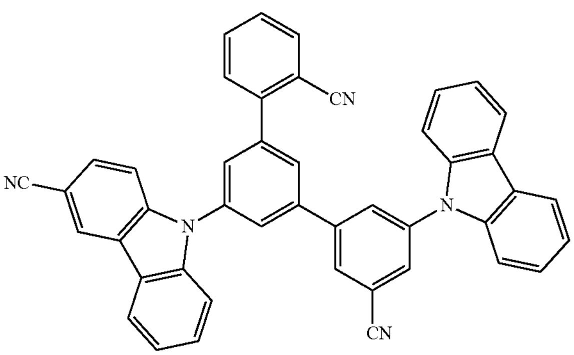
82
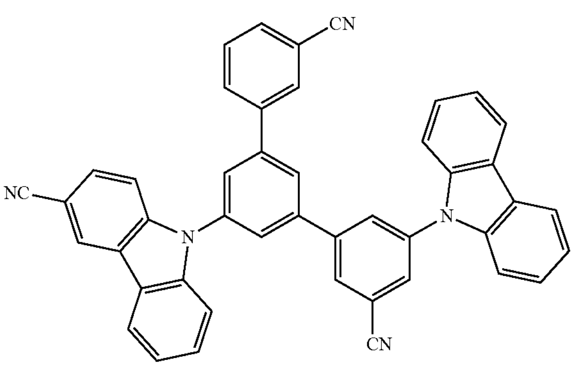
83
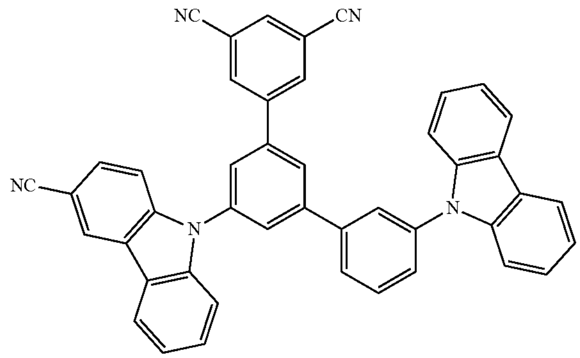
84
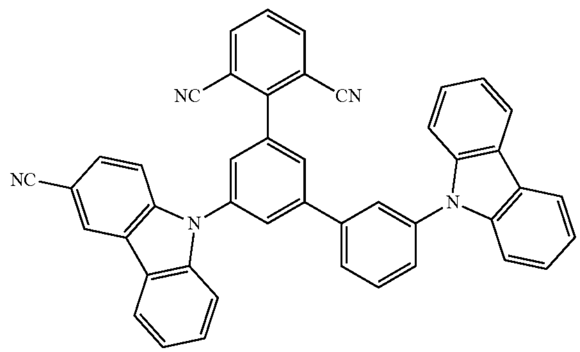
85
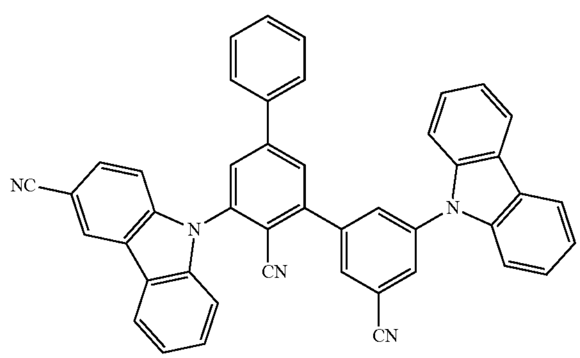
86
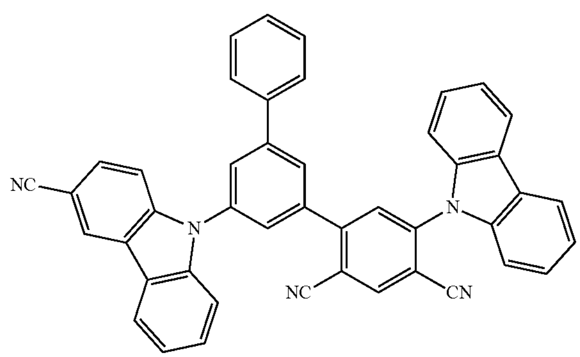

-continued
87
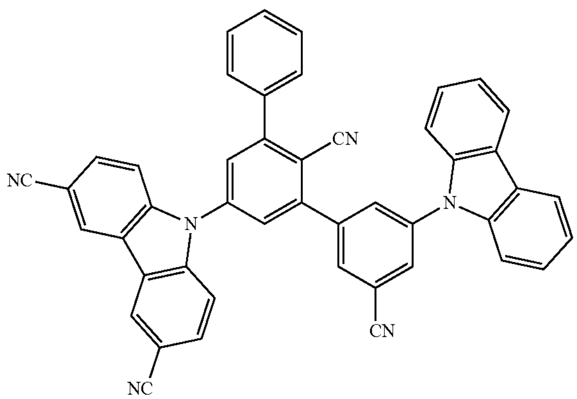
88
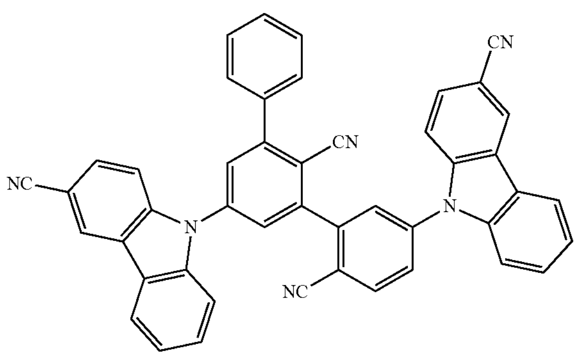
89
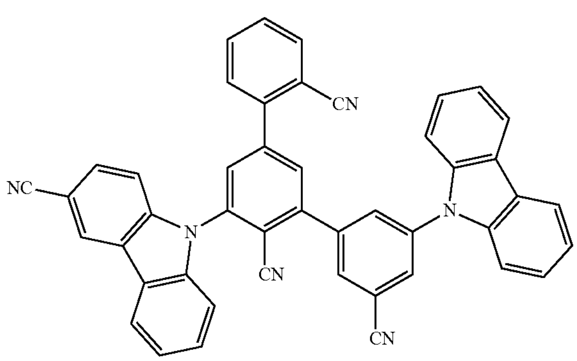
90
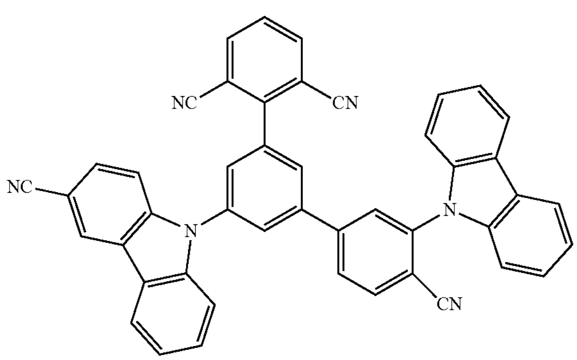
-continued
91
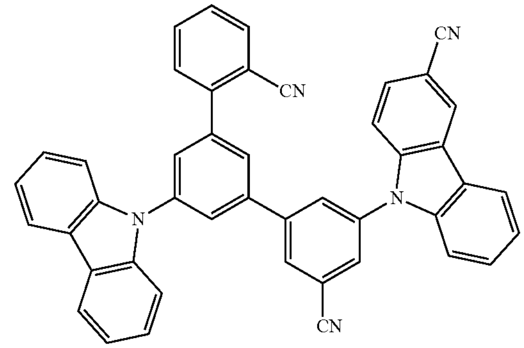
92
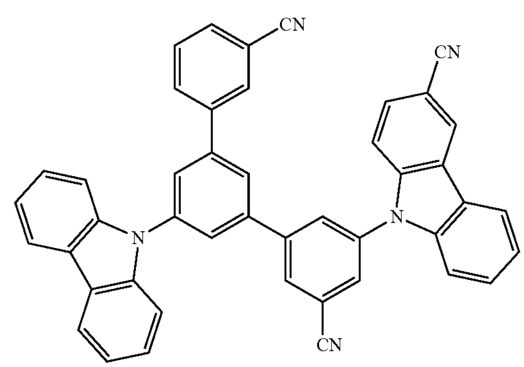
93
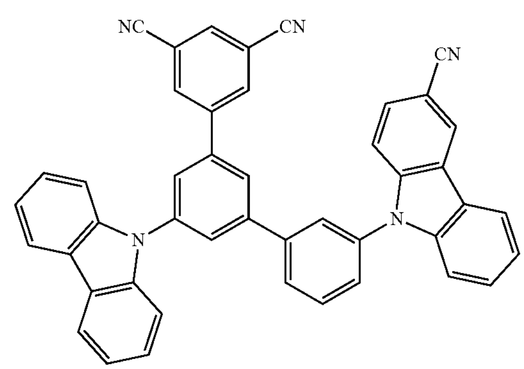
94
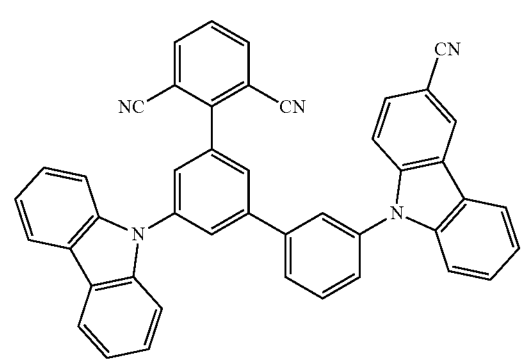

95
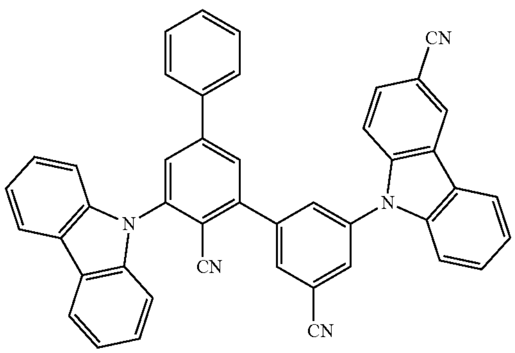
96
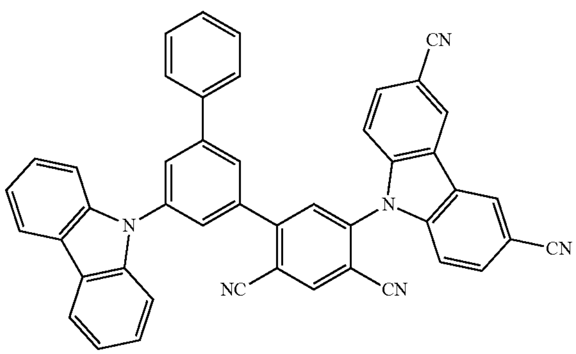
97
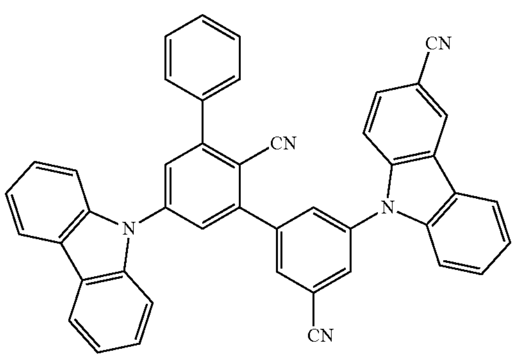
98
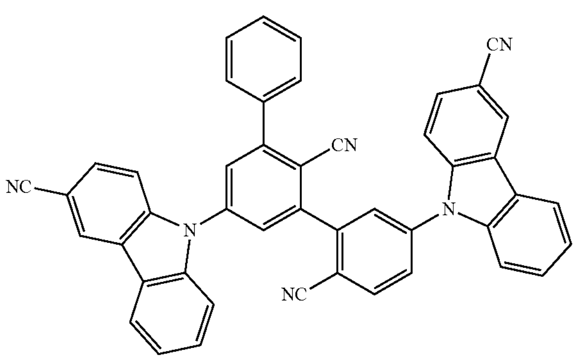
99
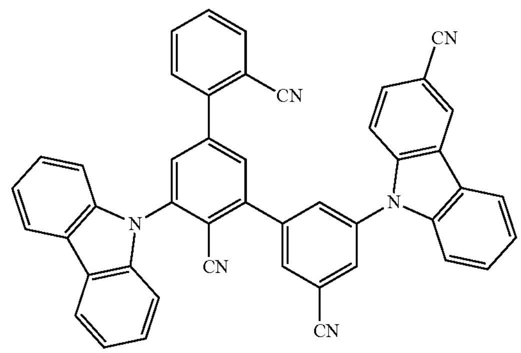
100
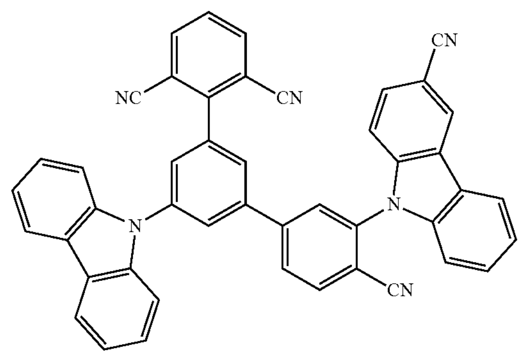
101
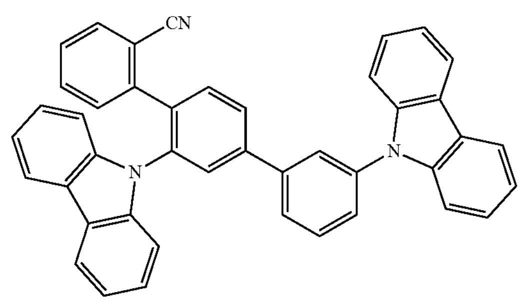
102
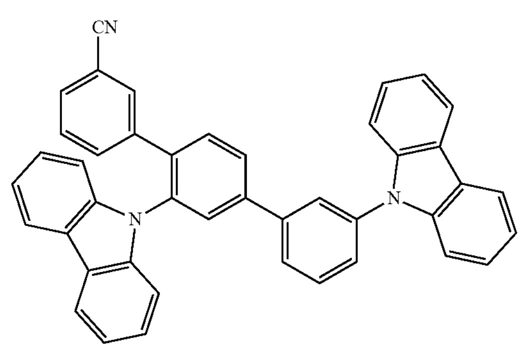

-continued
103
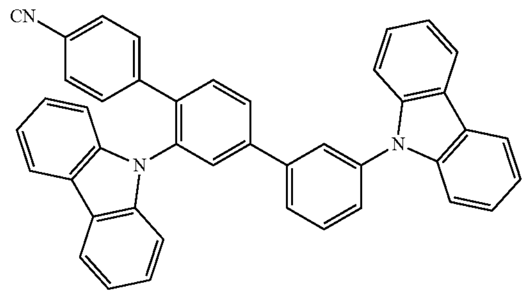
104
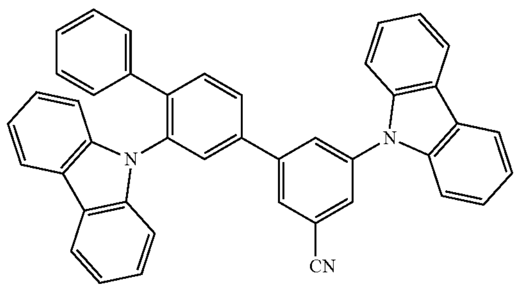
105
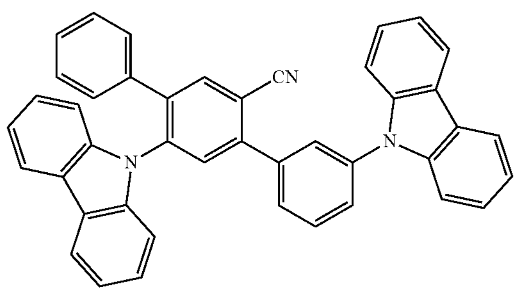
106
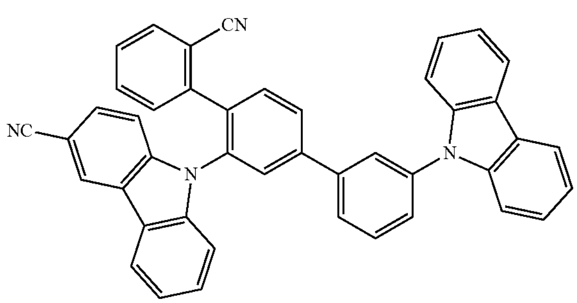
107
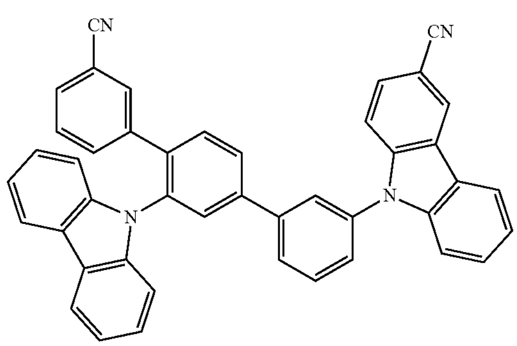
-continued
108
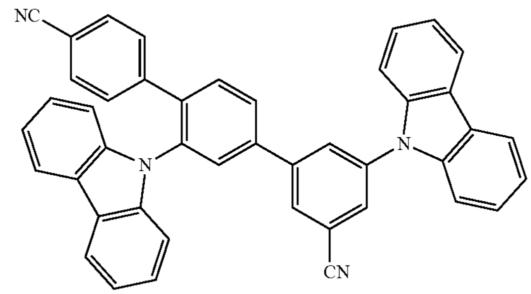
109
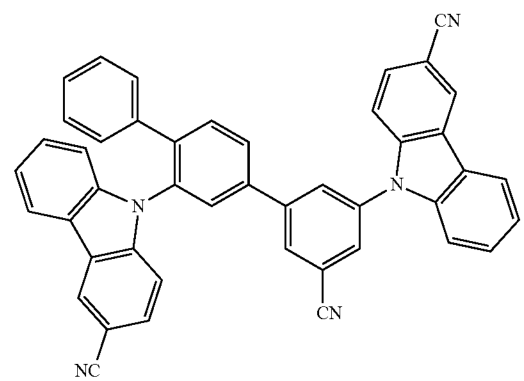
110
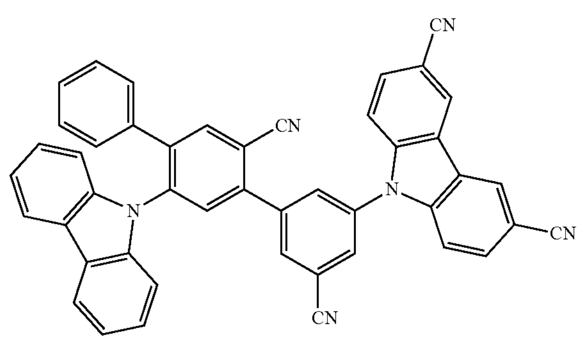
111
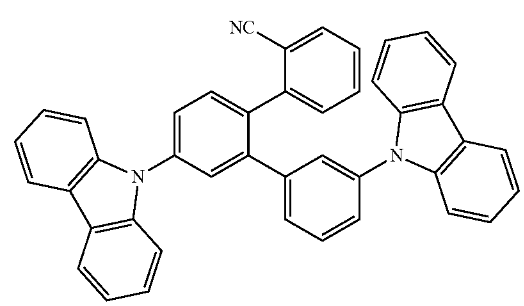

-continued
112
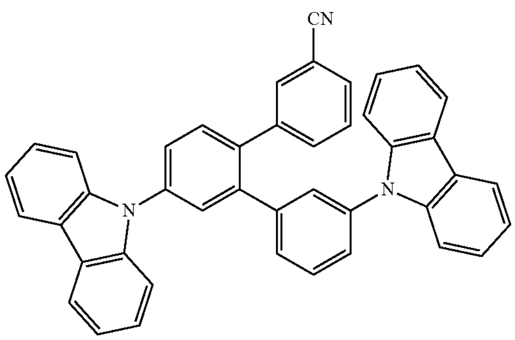
113
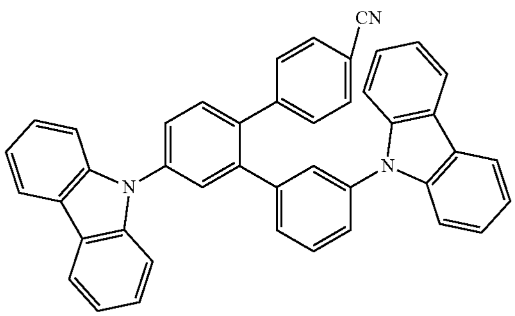
114
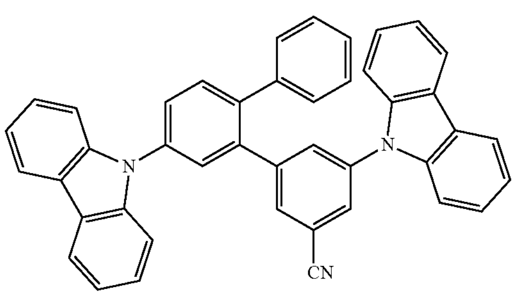
115
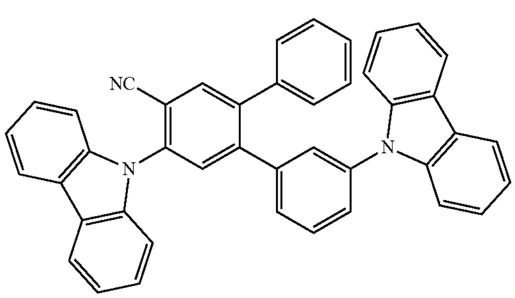
116
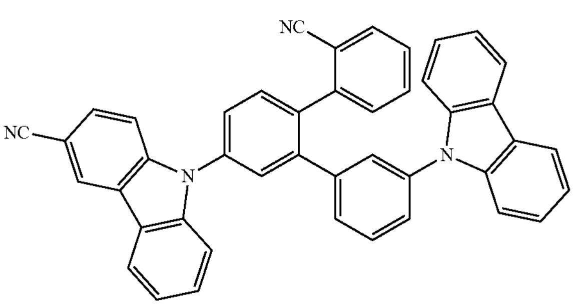
-continued
117
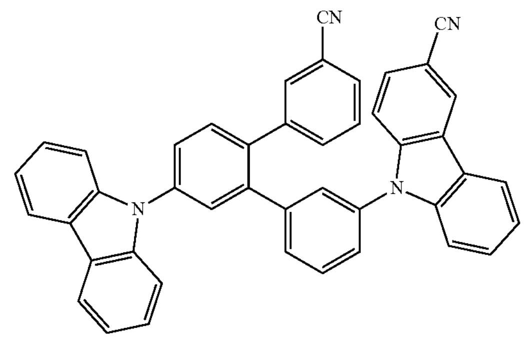
118
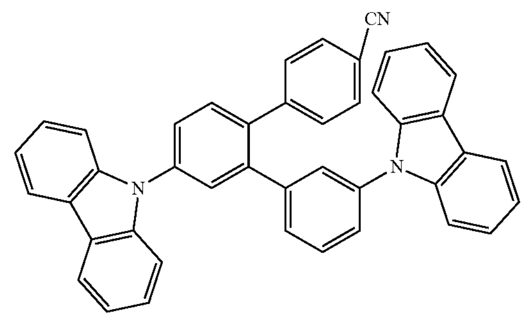
119
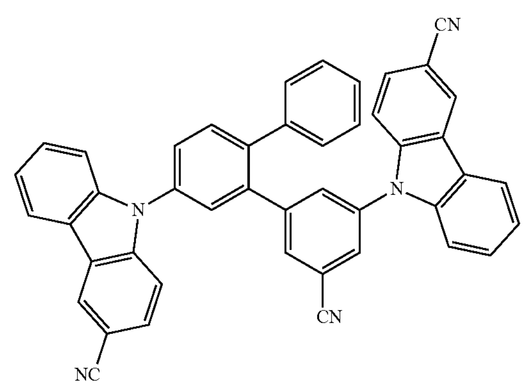
120
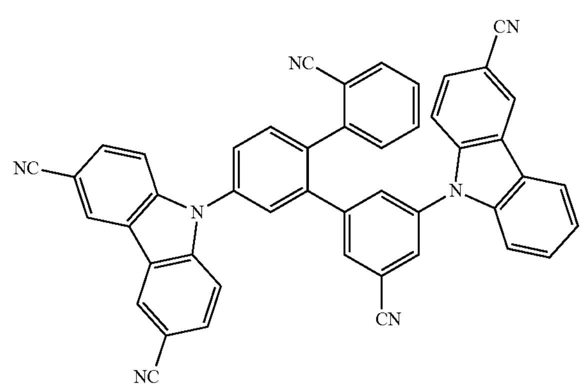

-continued
121
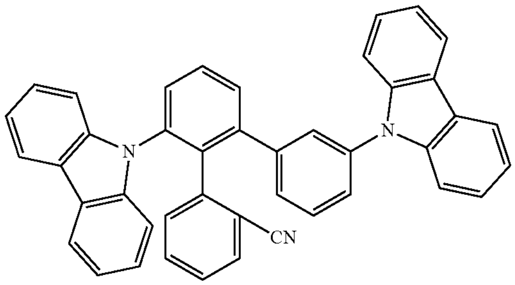
122
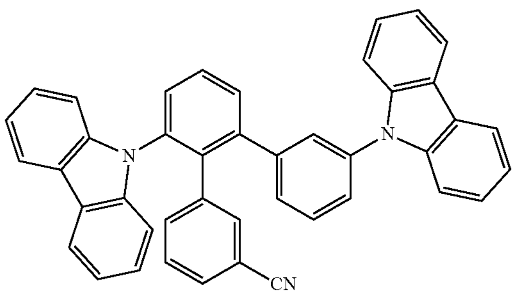
123
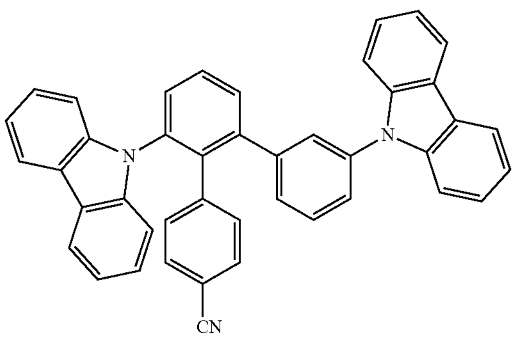
124
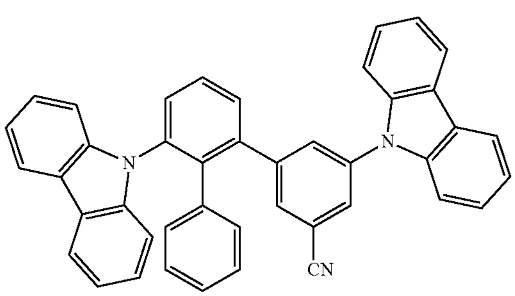
125
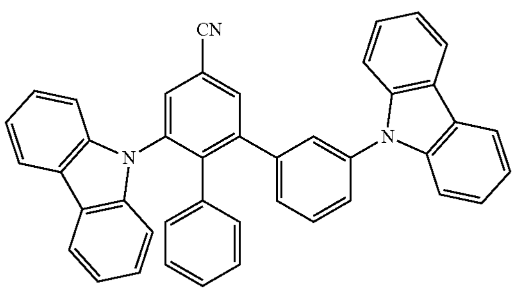
-continued
126
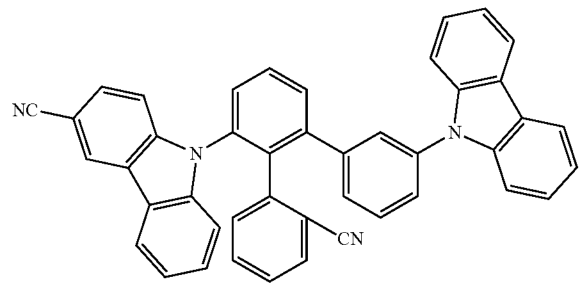
127
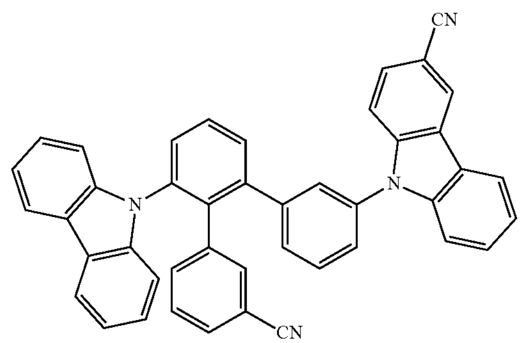
128
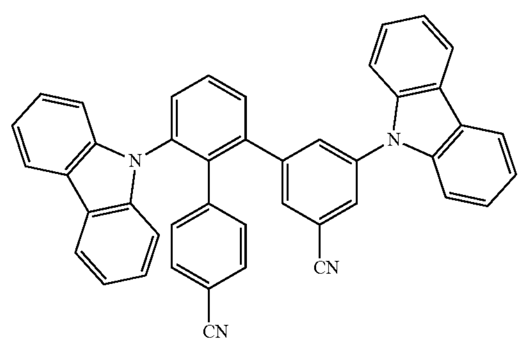
129
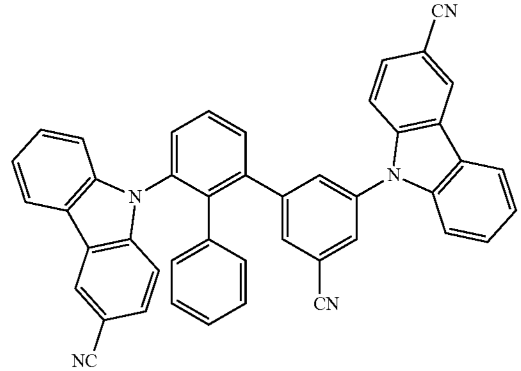

-continued
130
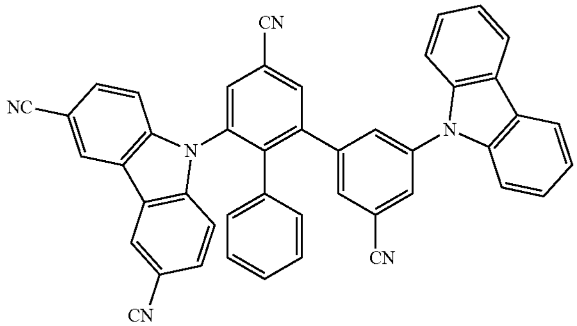
131
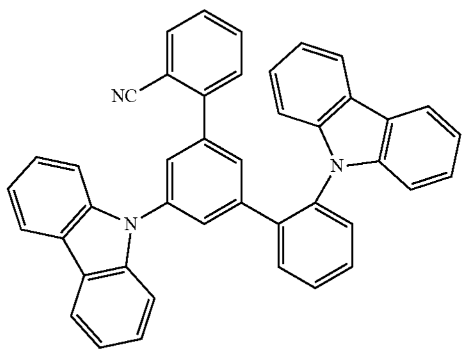
132
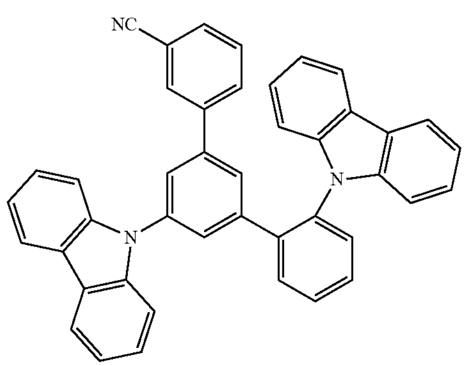
133
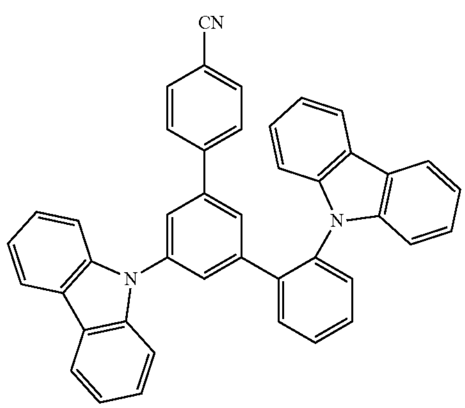
-continued
134
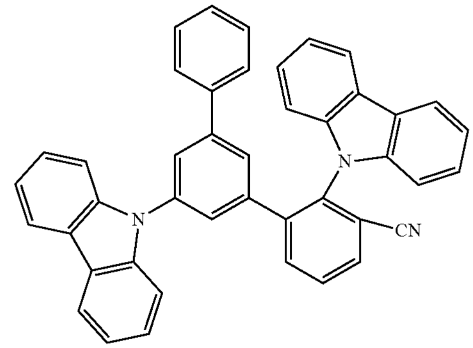
135
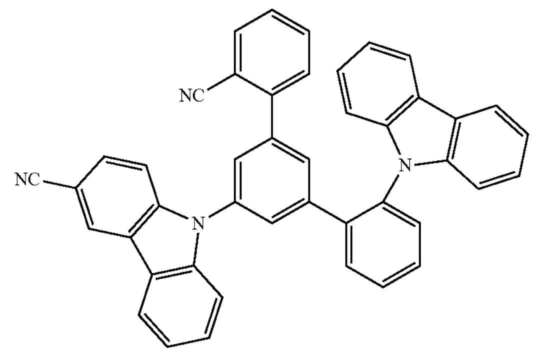
136
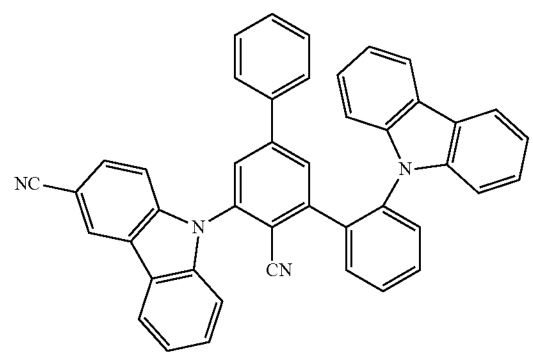
137
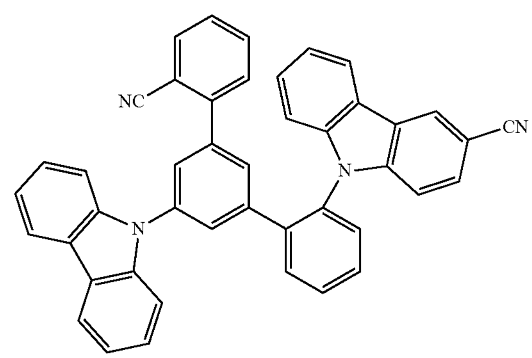

-continued
138
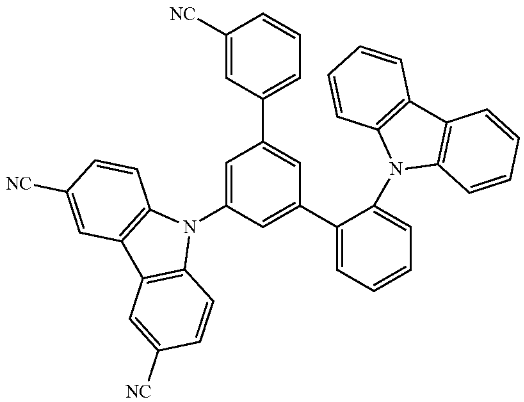
139
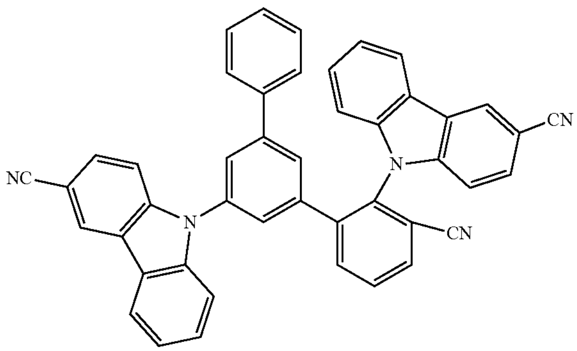
140
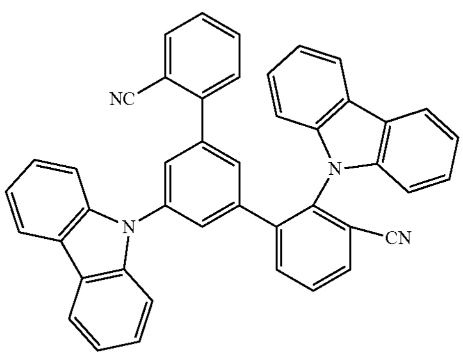
141
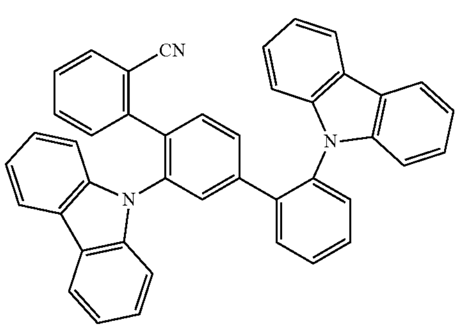
-continued
142
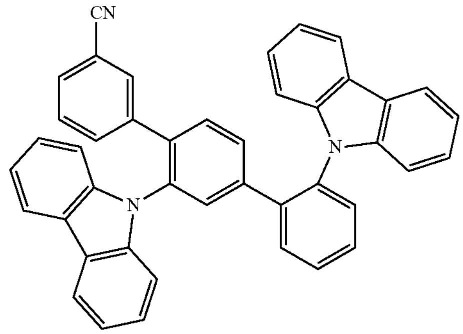
143
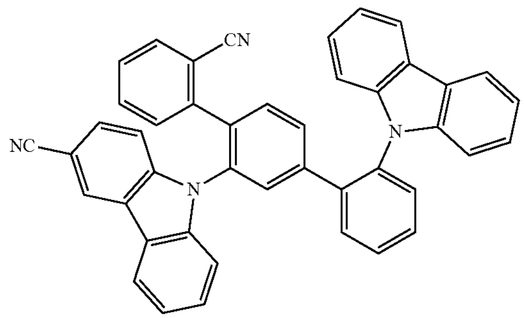
144
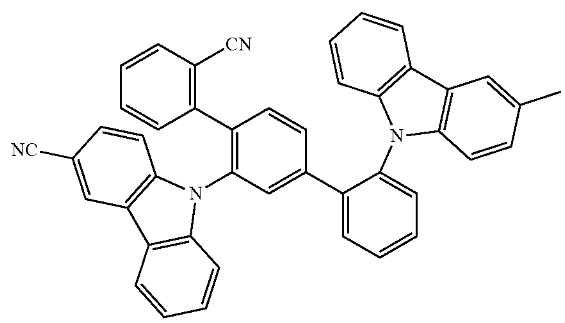
145
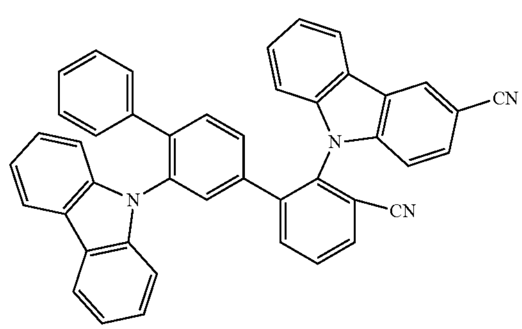

-continued
146
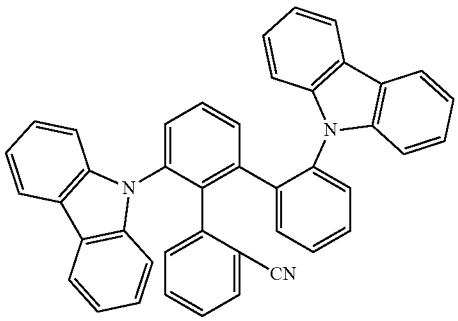
147
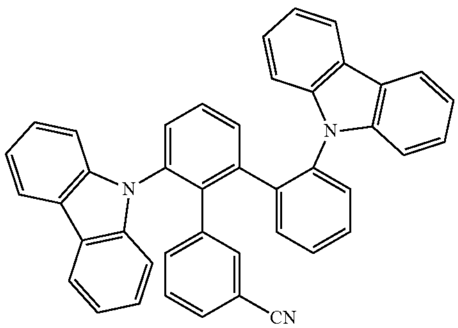
148
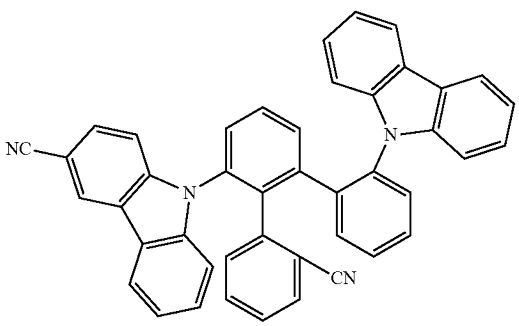
149
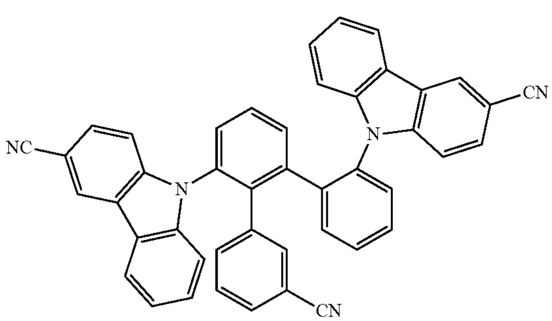
-continued
150
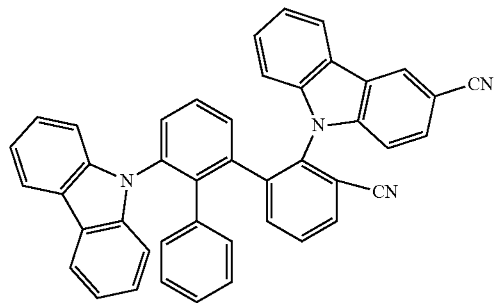
151
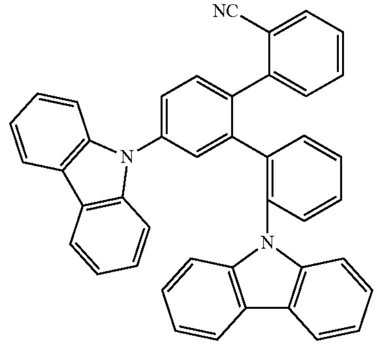
152
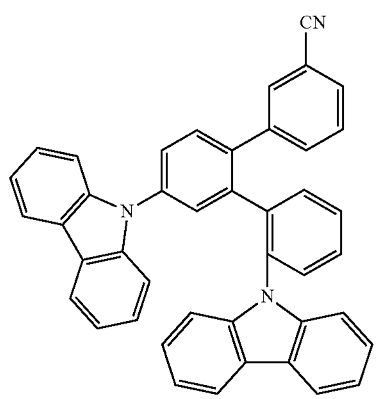
153
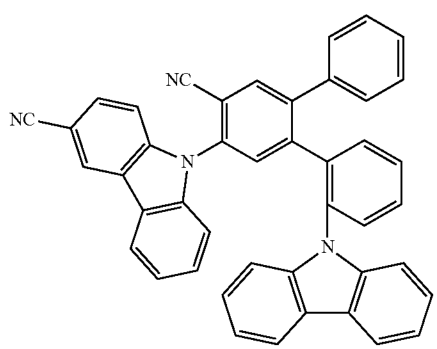

-continued
154
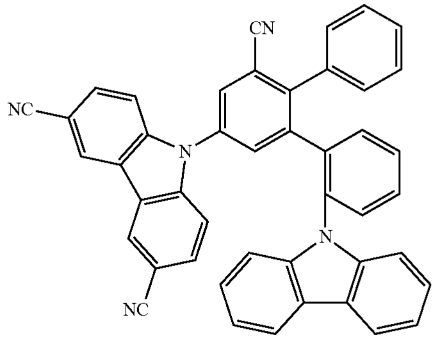
155
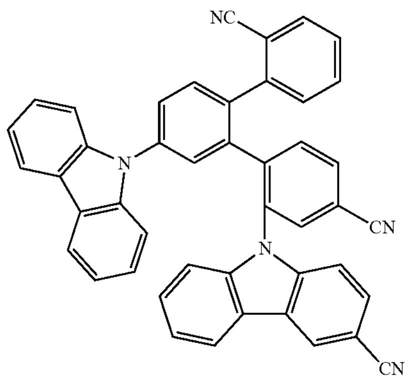
156
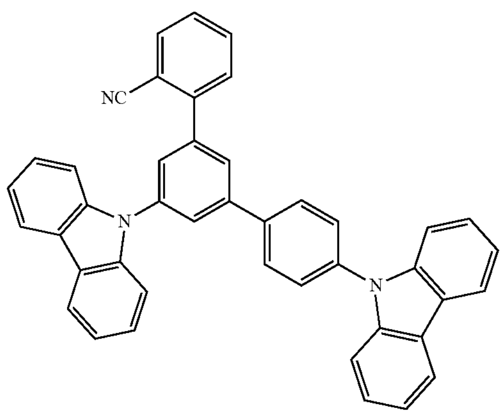
157
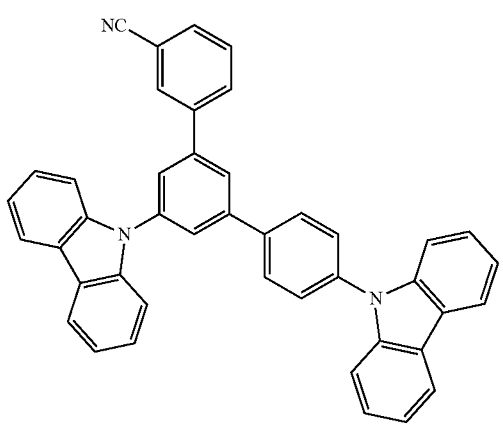
-continued
158
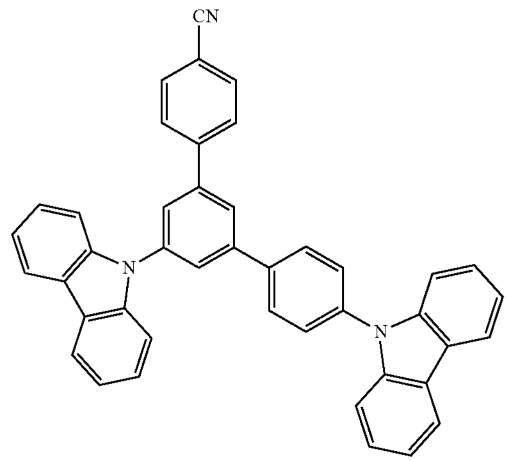
159
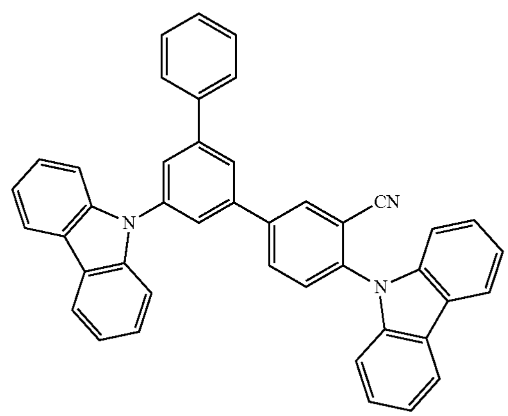
160
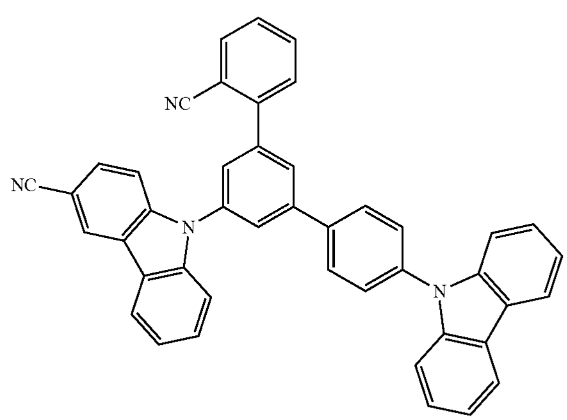

161
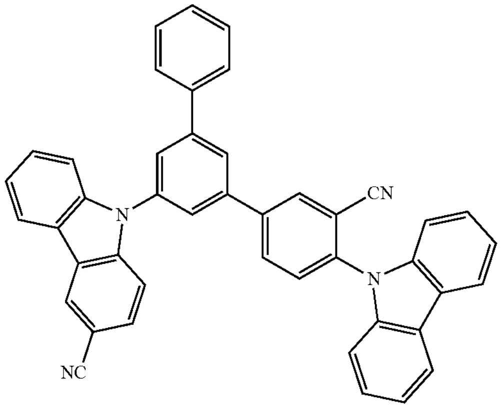
164
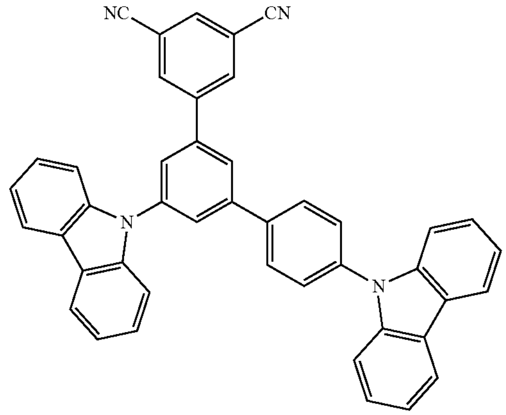
162
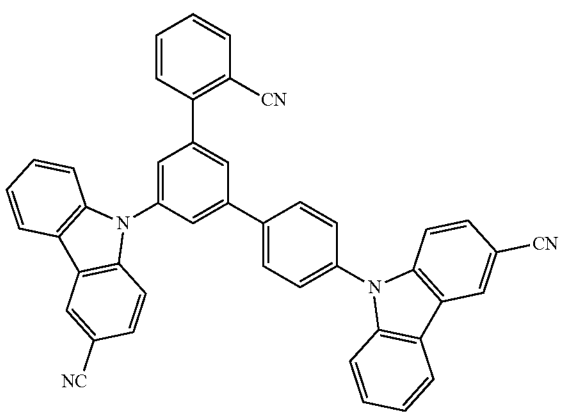
165
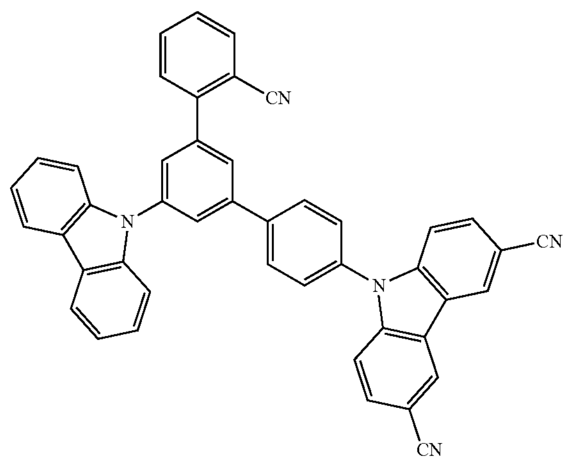
163
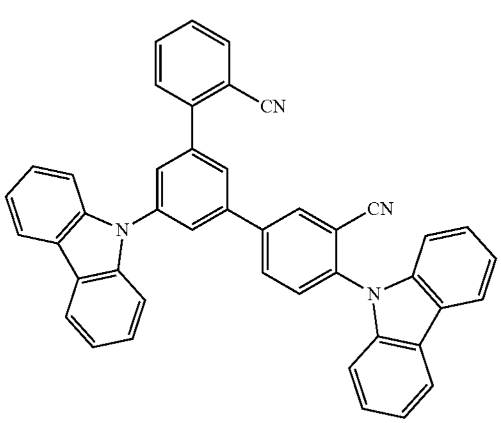
166
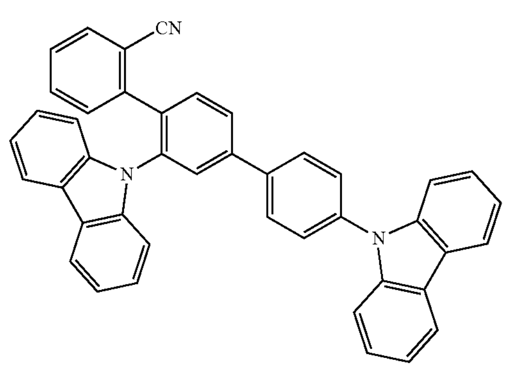

-continued
167
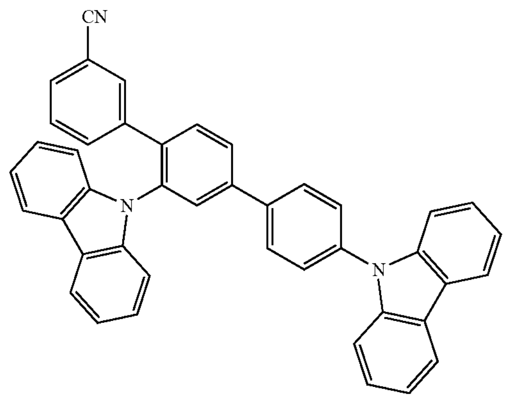
168
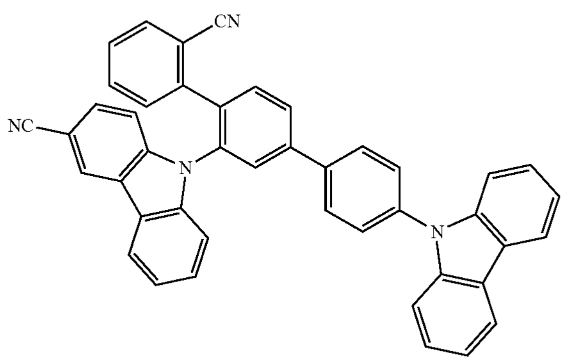
169
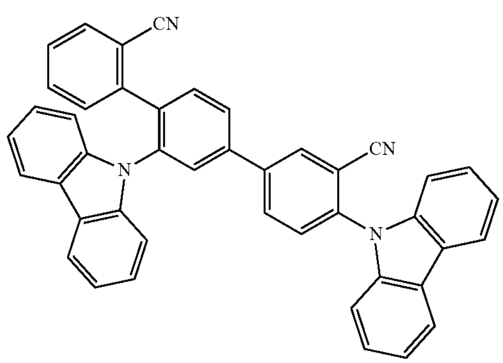
170
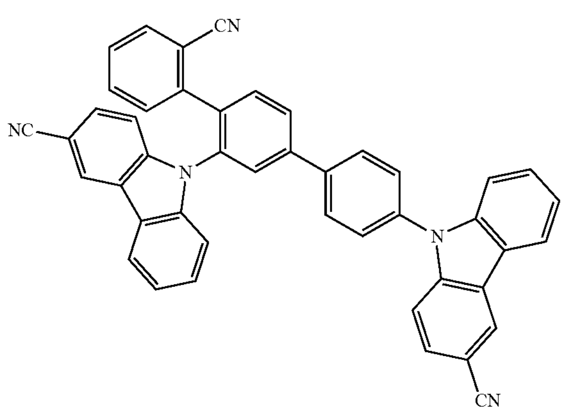
-continued
171
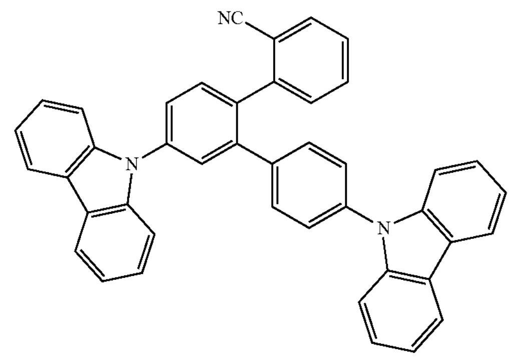
172
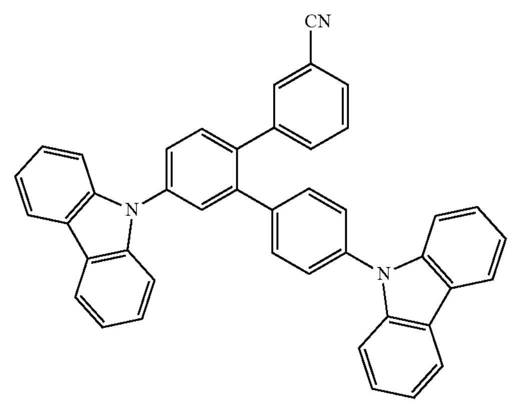
173
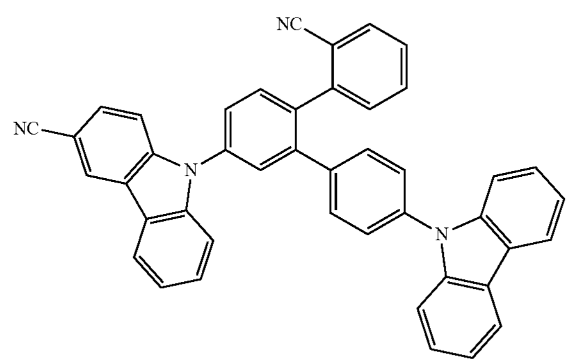
174
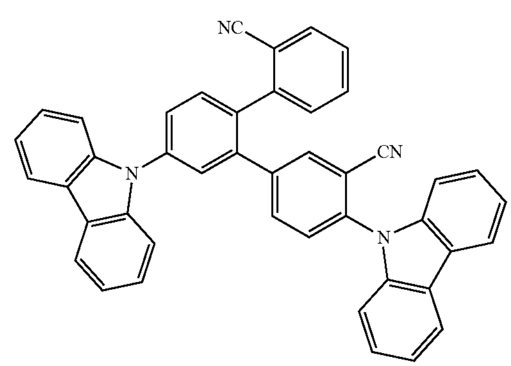

-continued
175
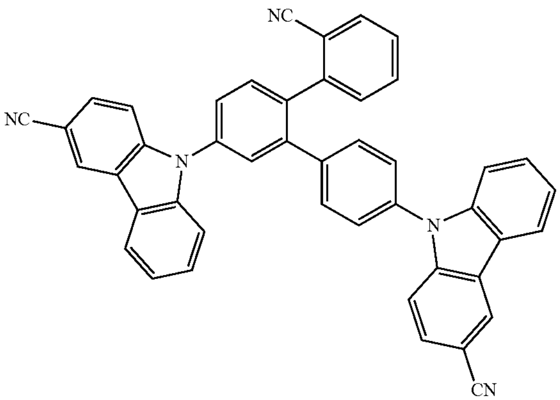
176
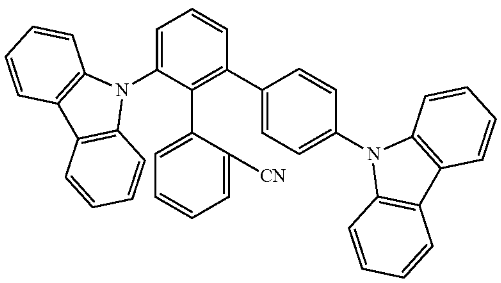
177
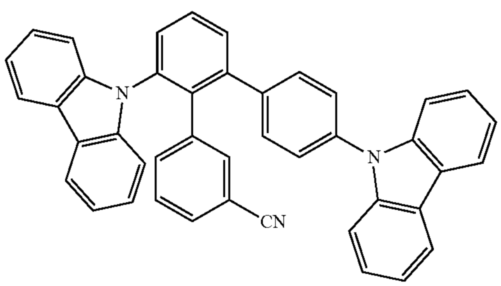
178
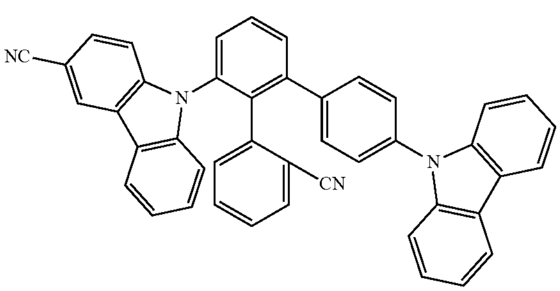
179
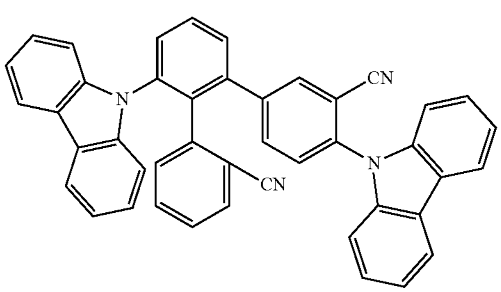
-continued
180
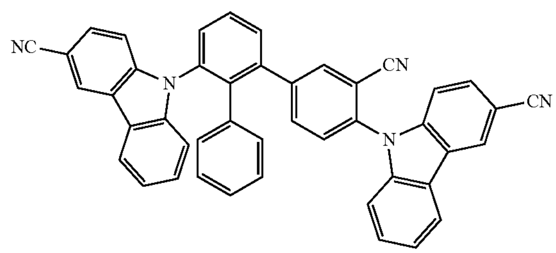
181
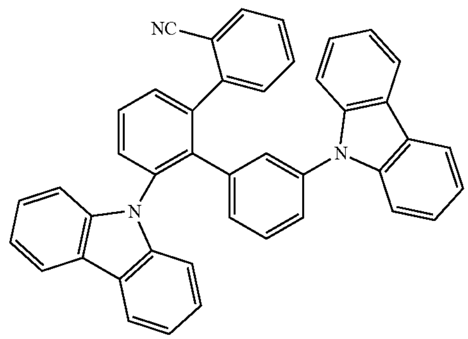
182
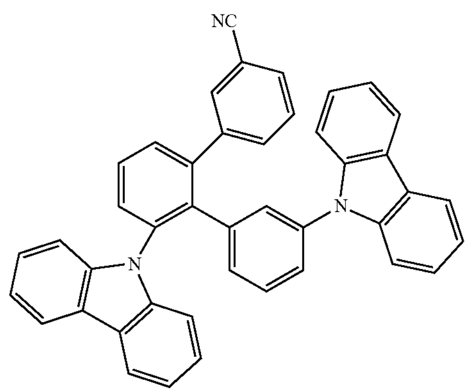
183
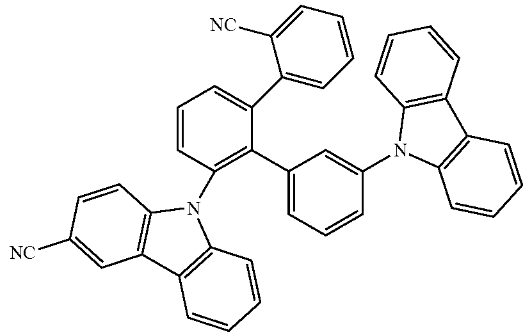

-continued
184
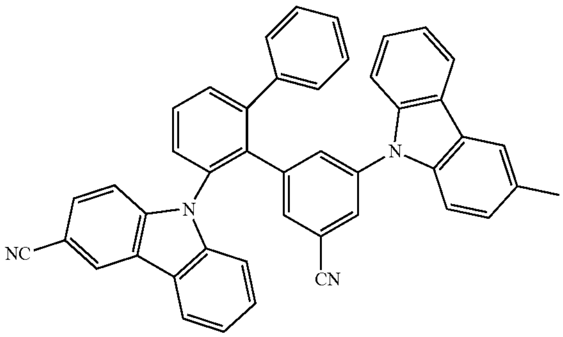
185
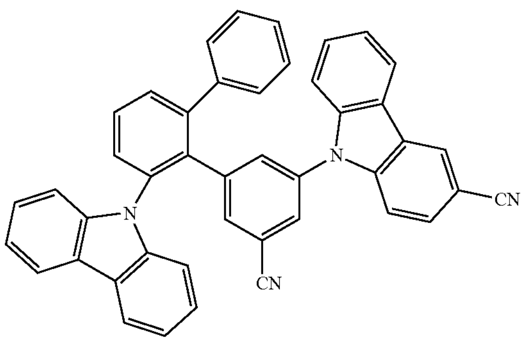
186
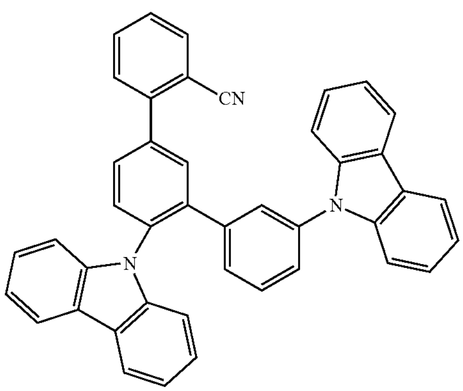
187
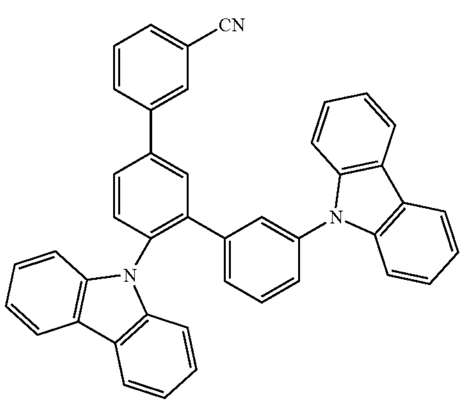
-continued
188
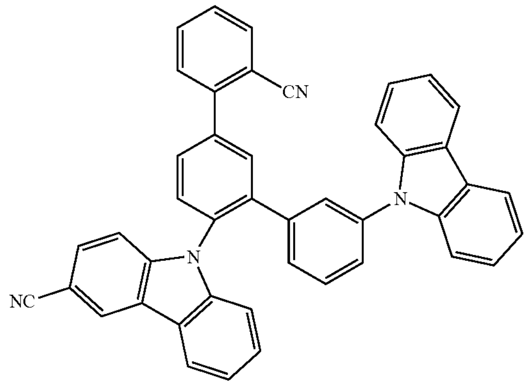
189
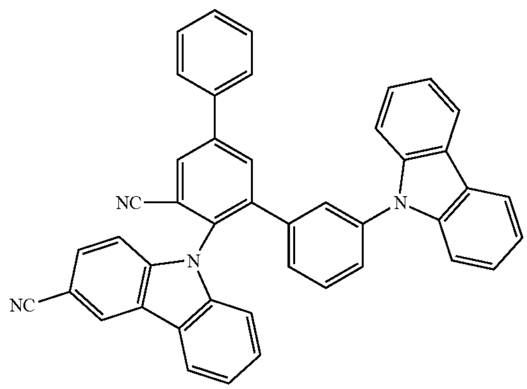
190
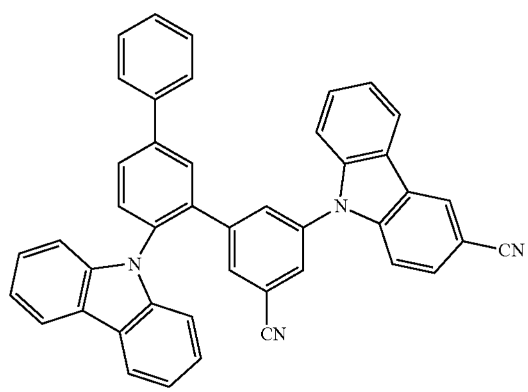
191
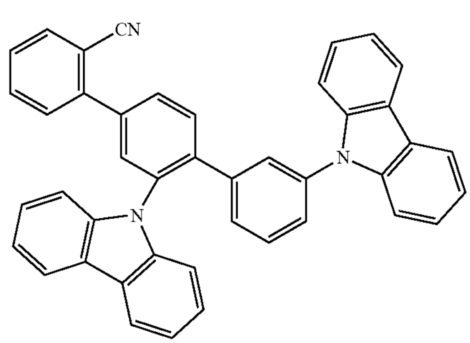

192
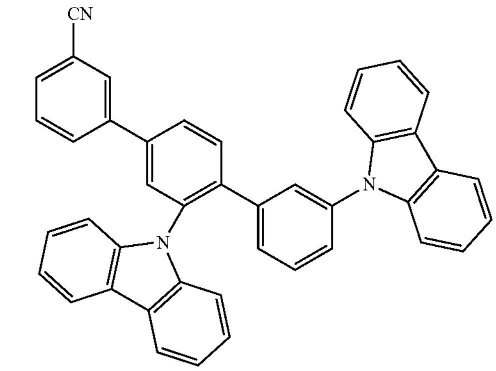
193
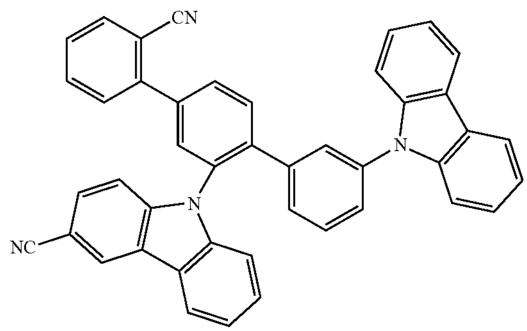
194
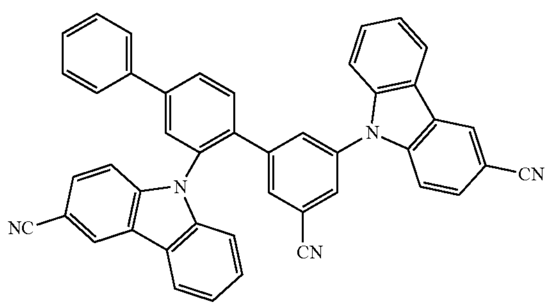
195
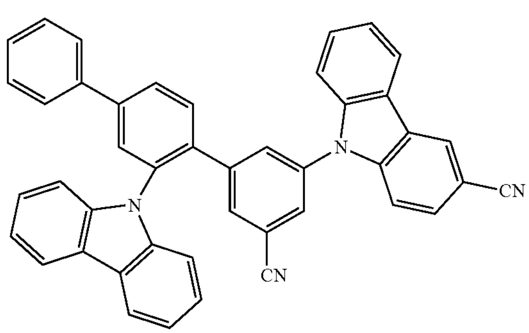
196
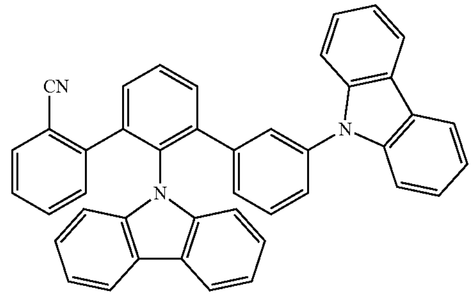
197
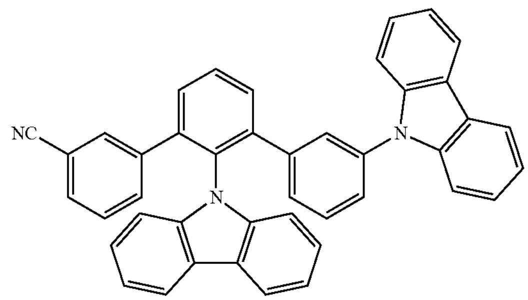
198
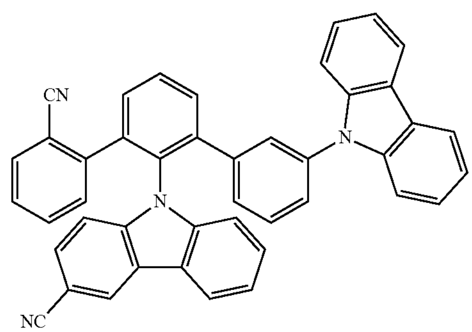
199
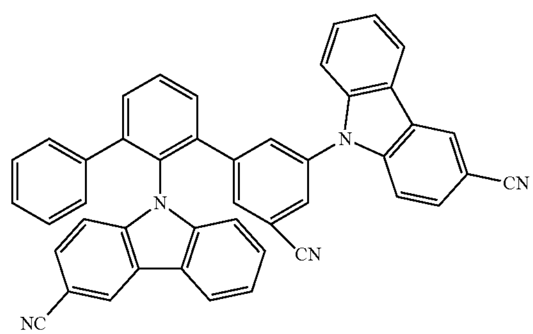
200
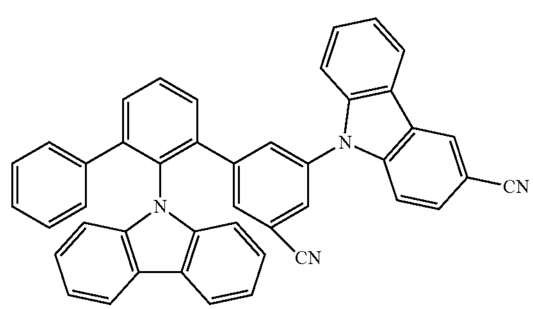

-continued
201
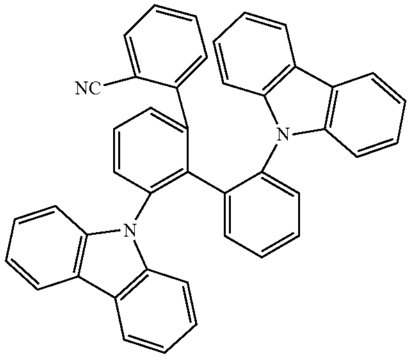
202
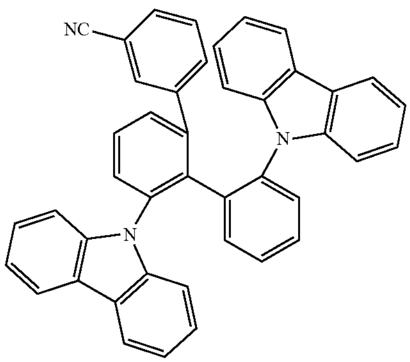
203
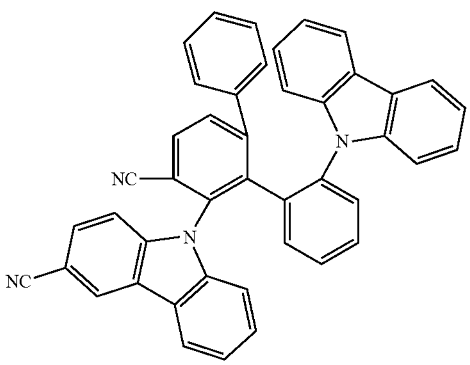
204
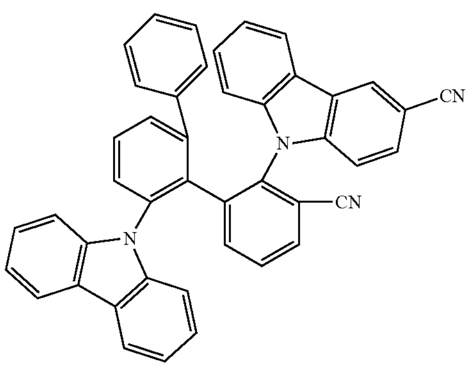
-continued
205
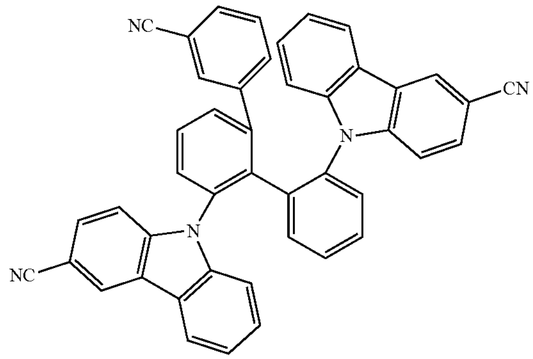
206
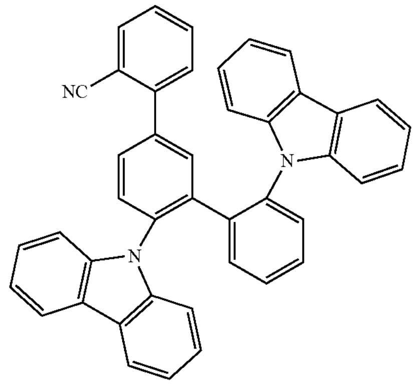
207
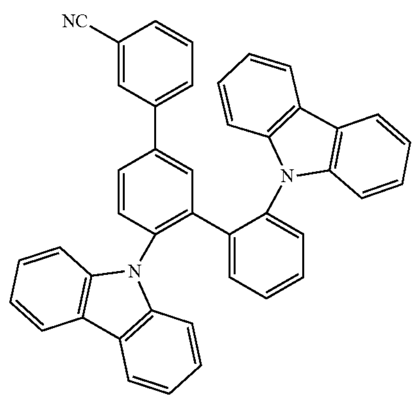
208
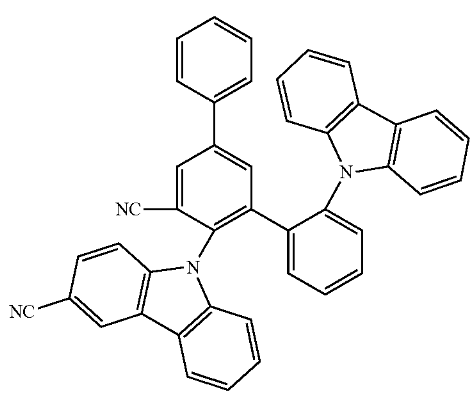

-continued
209
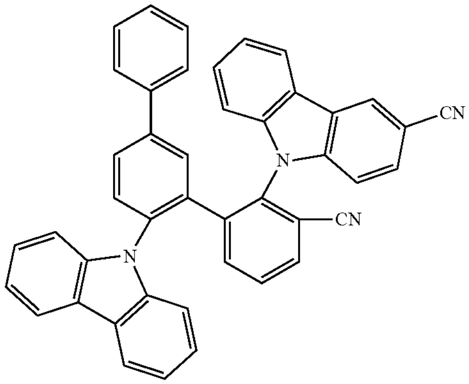
210
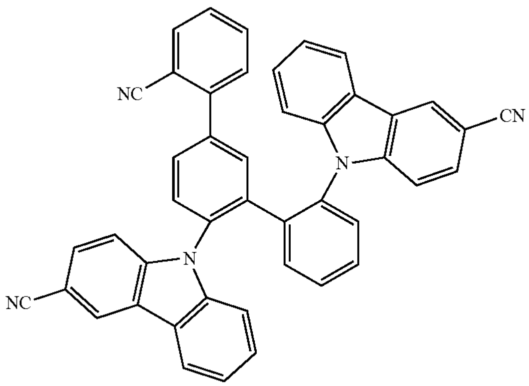
211
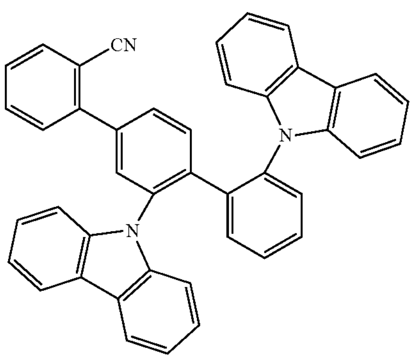
212
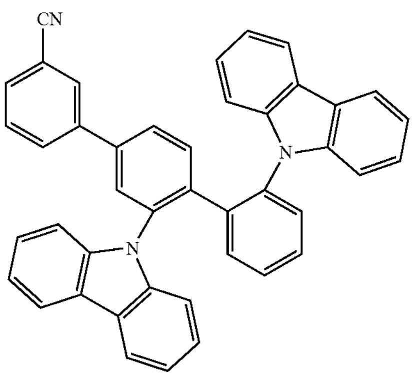
-continued
213
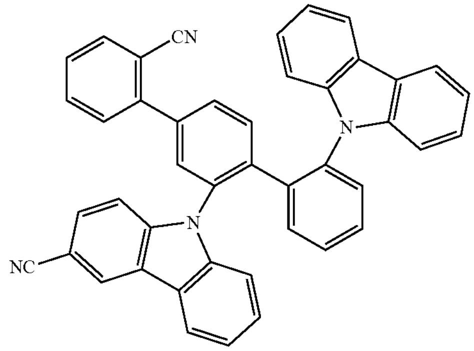
214
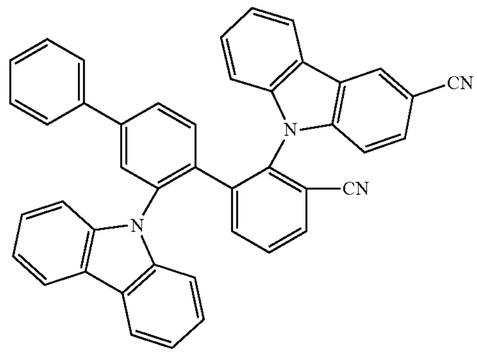
215
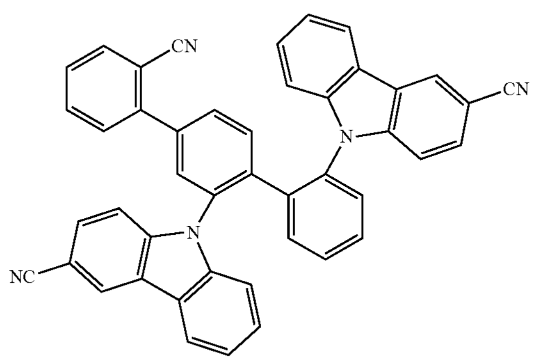
216
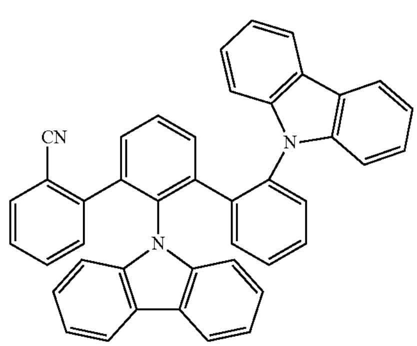

-continued
217
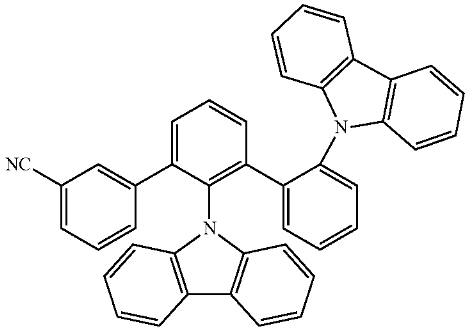
218
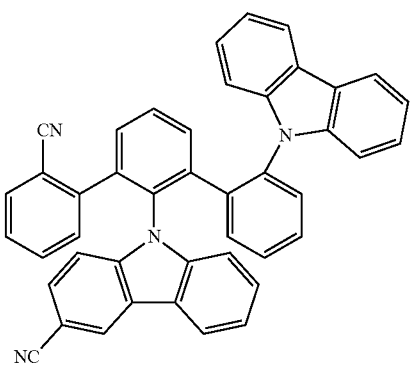
219
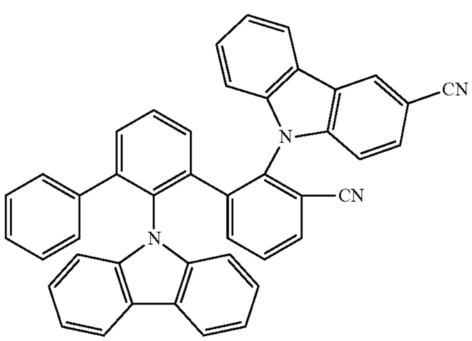
220
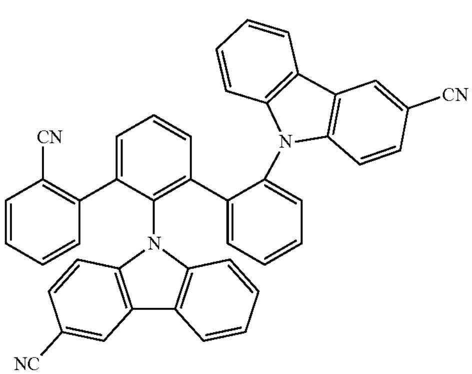
-continued
221
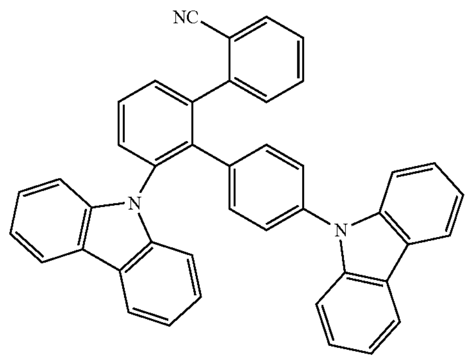
222
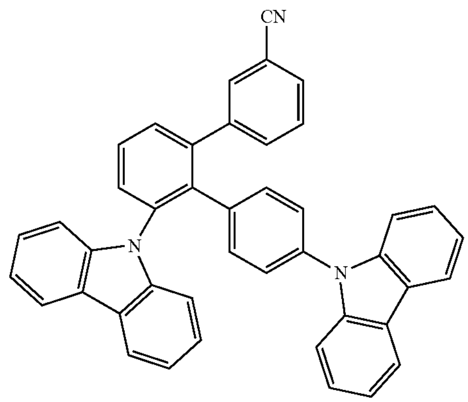
223
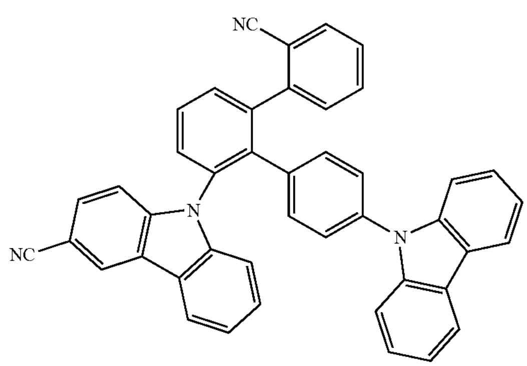
224
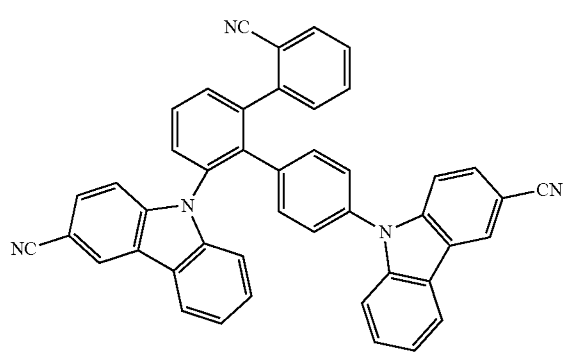

-continued
225
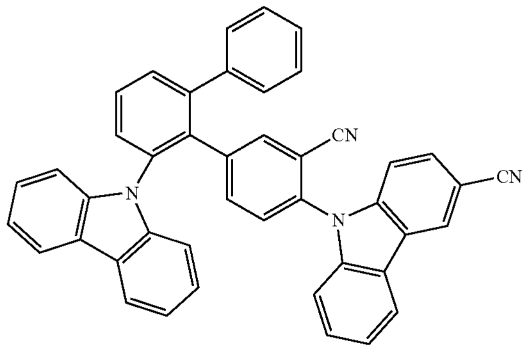
226
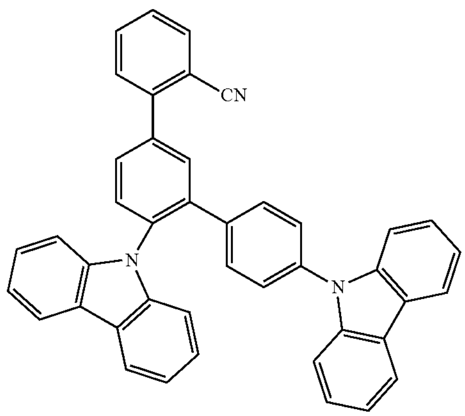
227
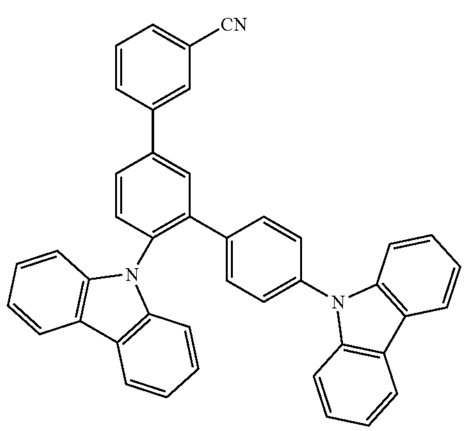
228
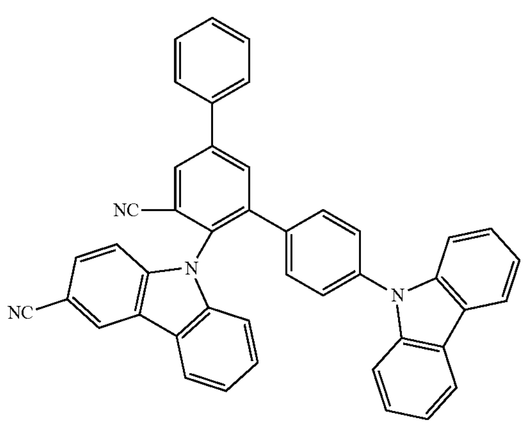
-continued
229
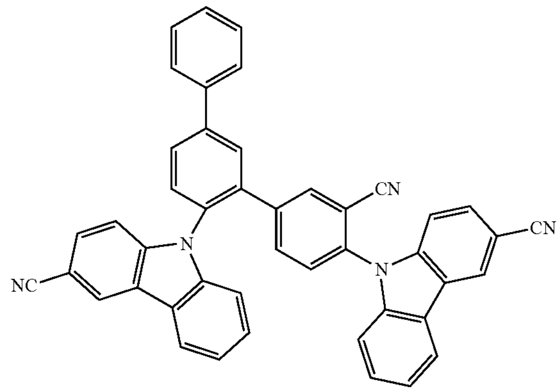
230
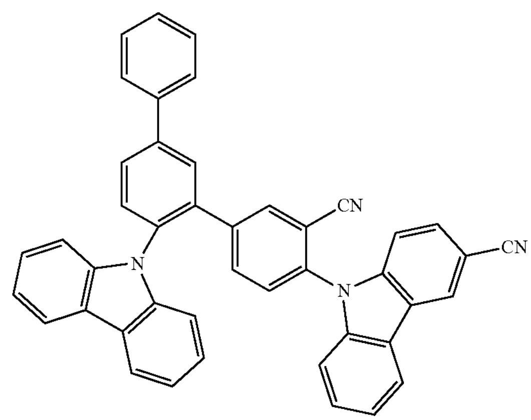
231
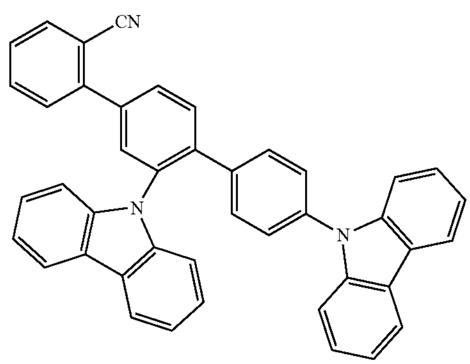
232
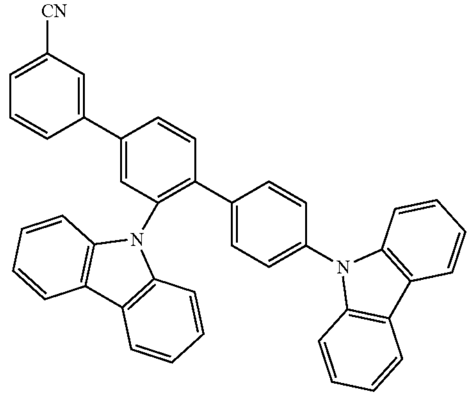

-continued
233
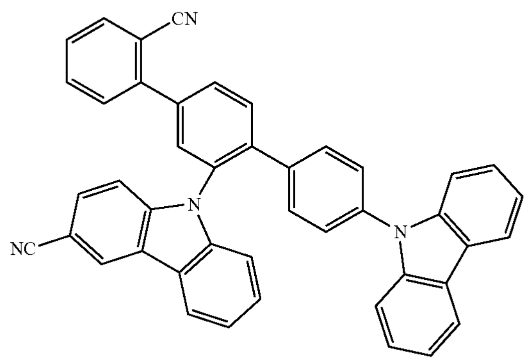
234
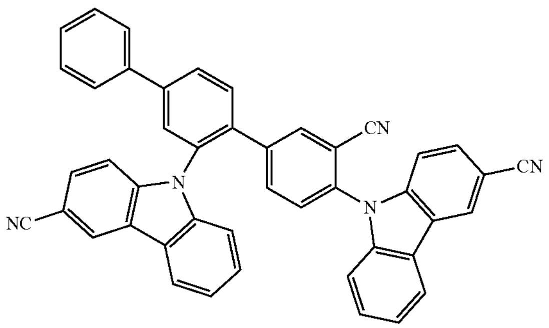
235
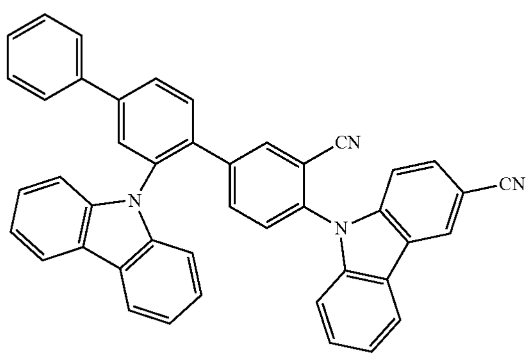
236
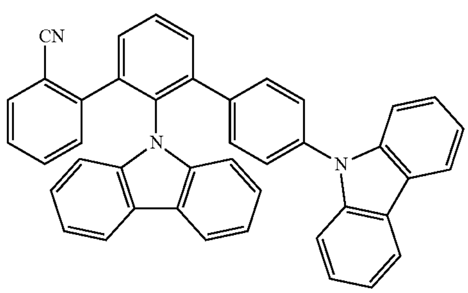
-continued
237
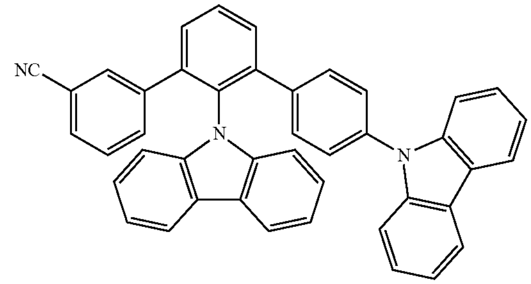
238
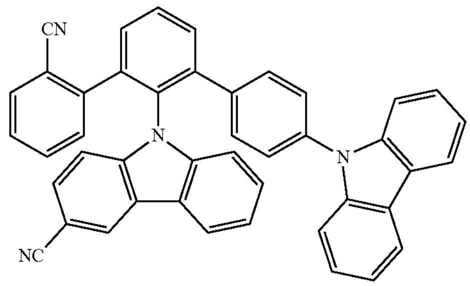
239
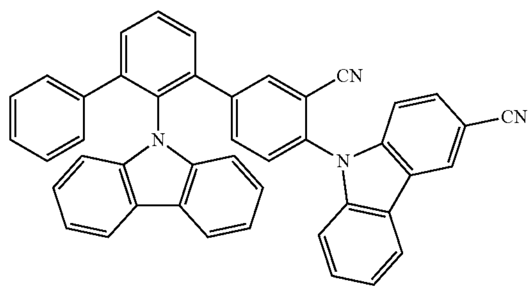
240
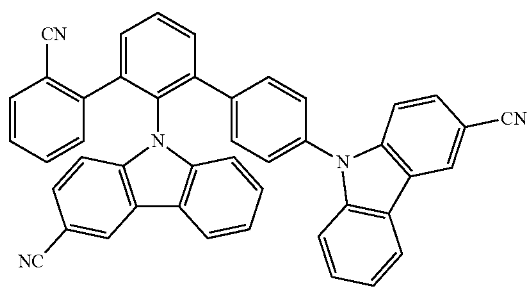
241
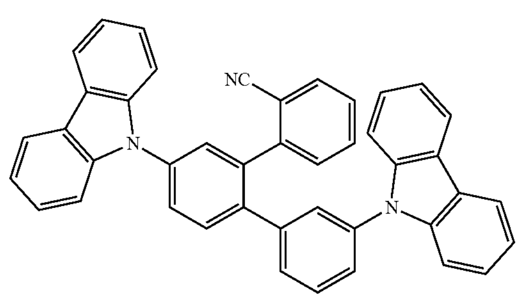

-continued
242
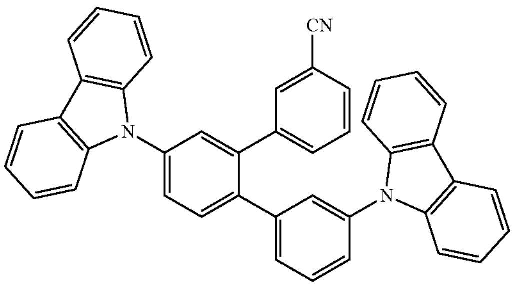
243
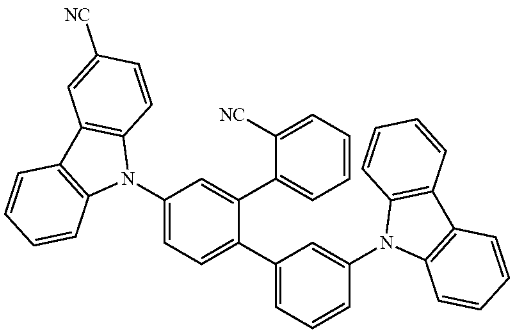
244
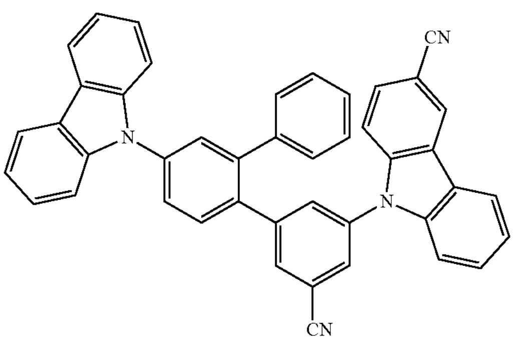
245
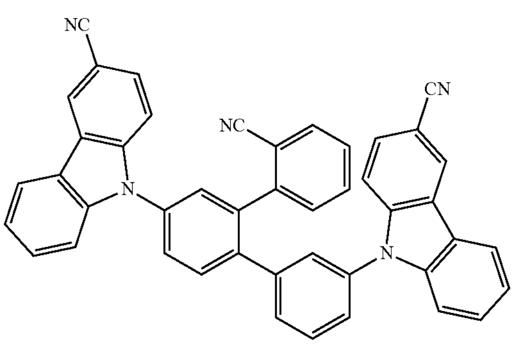
-continued
246
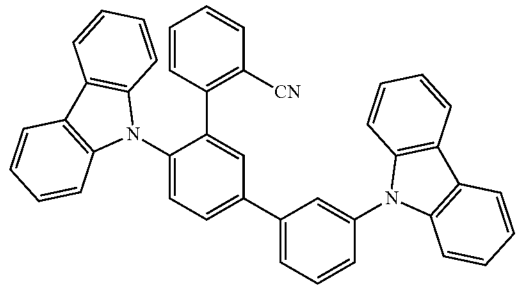
247
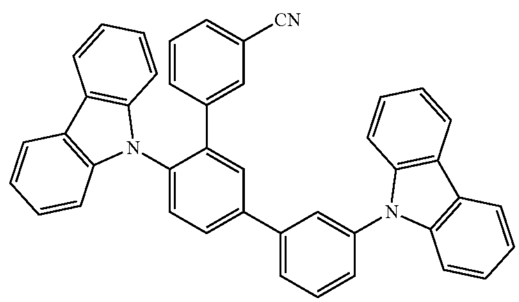
248
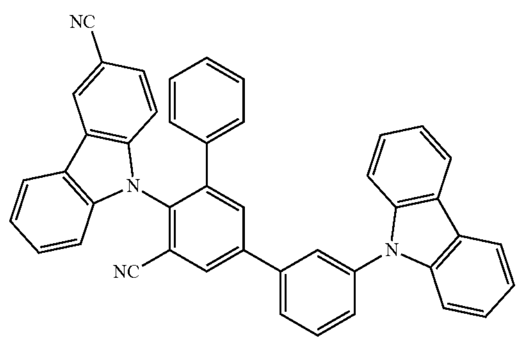
249
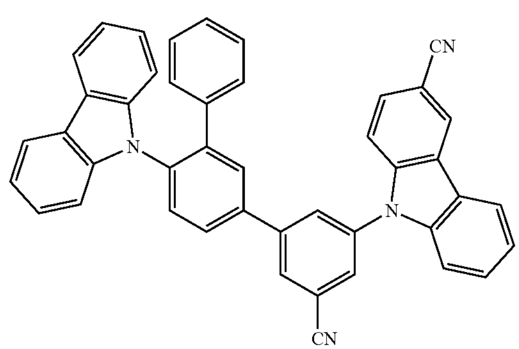

-continued
250
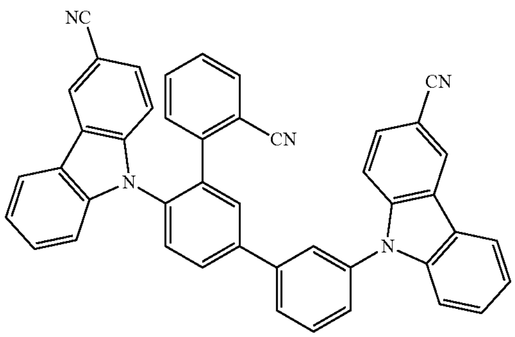
251
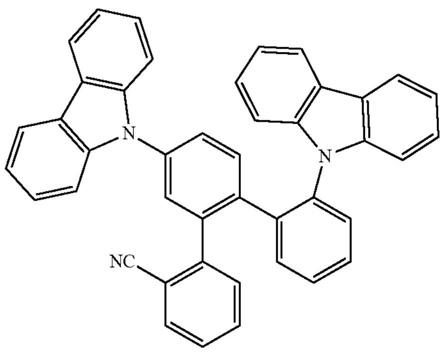
252
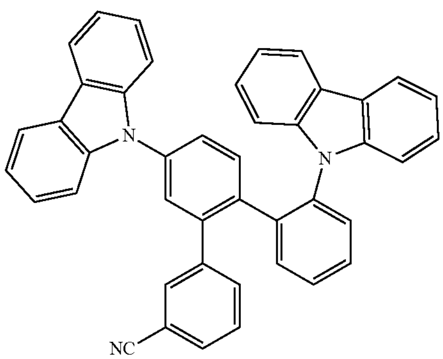
253
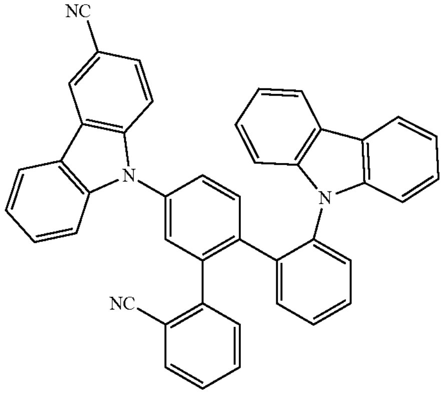
-continued
254
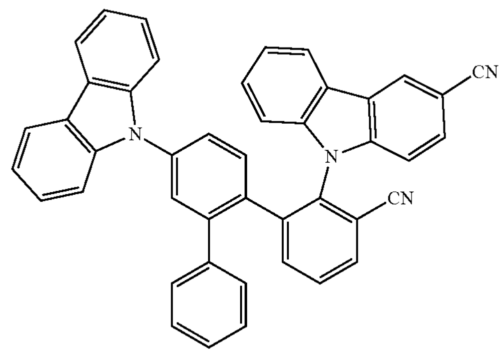
255
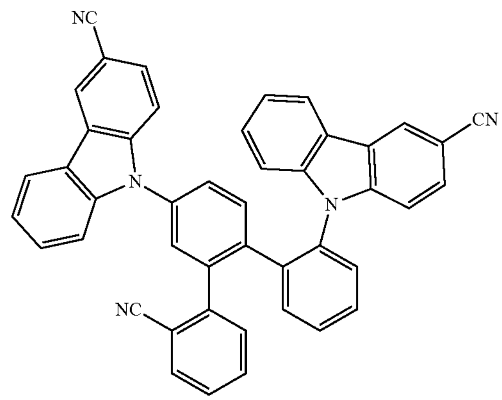
256
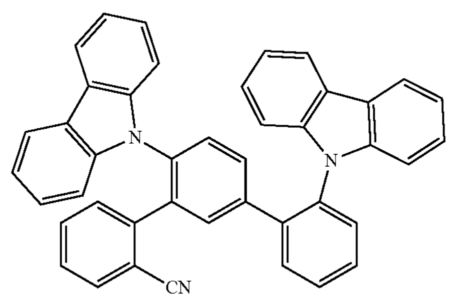
257
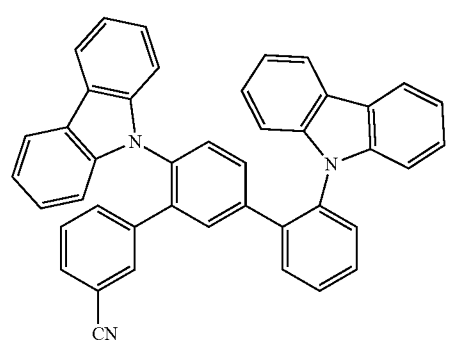

258
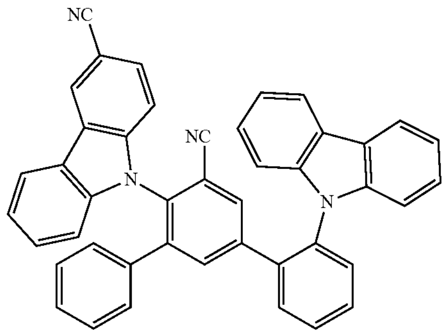
259
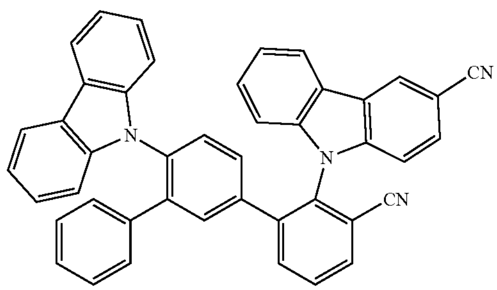
260
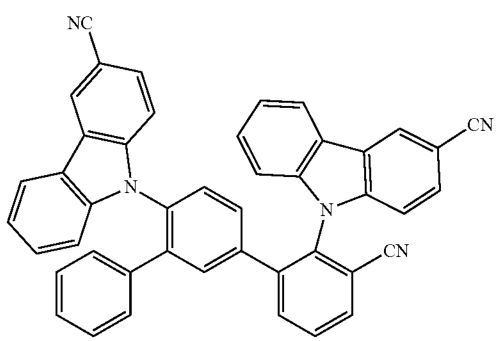
Group HH1
H-H1
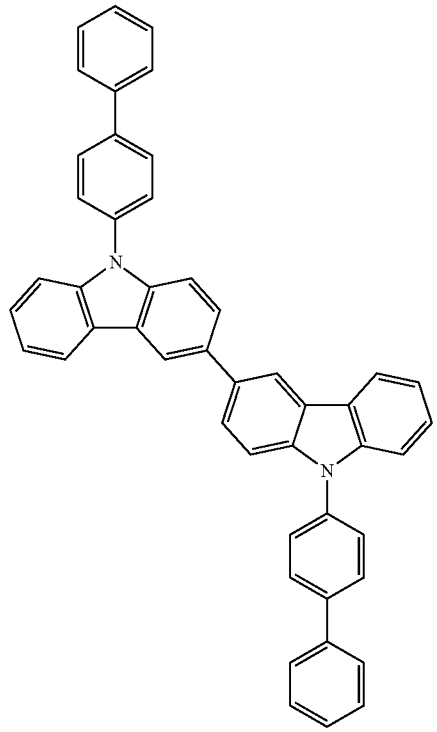
H-H2
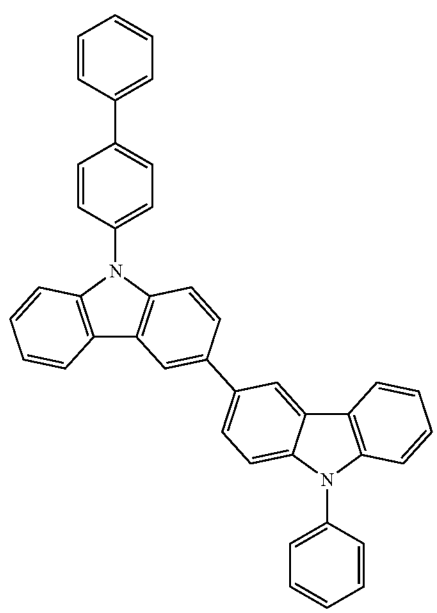

-continued
H-H3
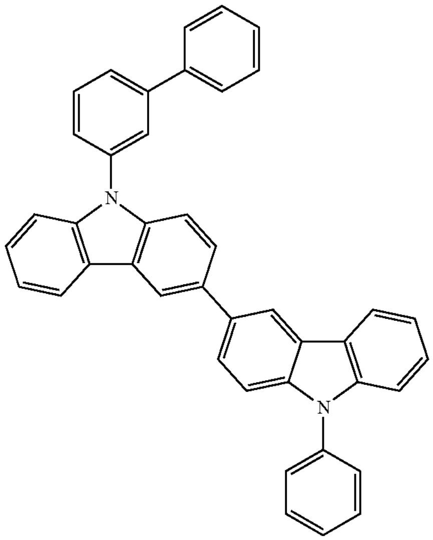
H-H4
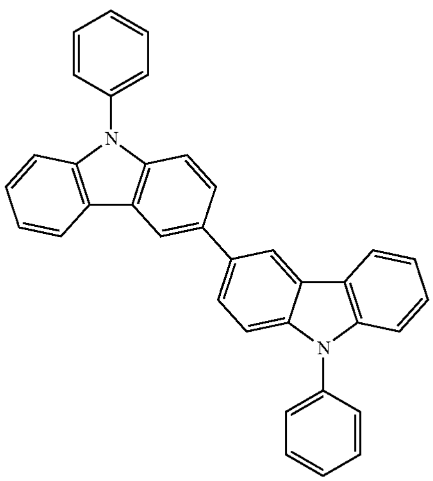
H-H5
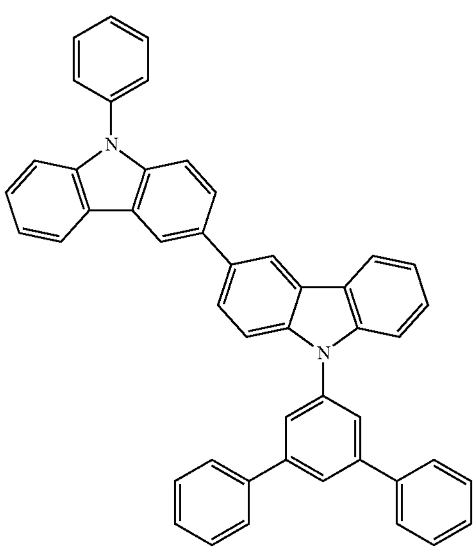
-continued
H-H6
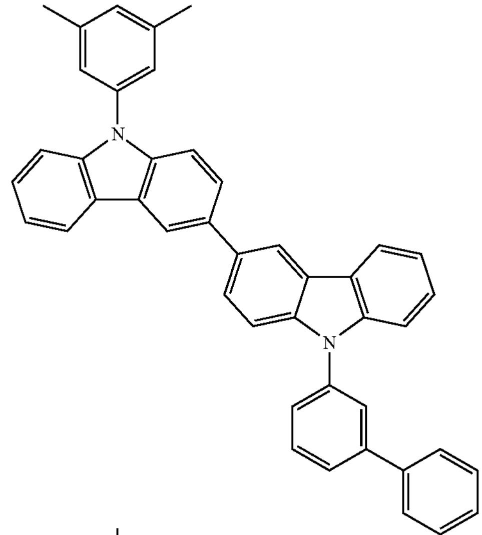
H-H7
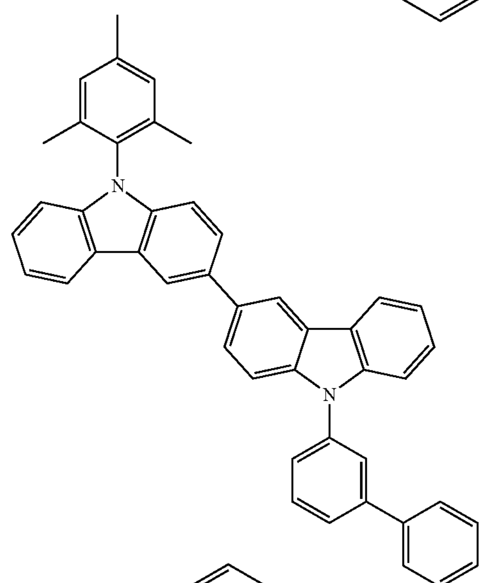
H-H8
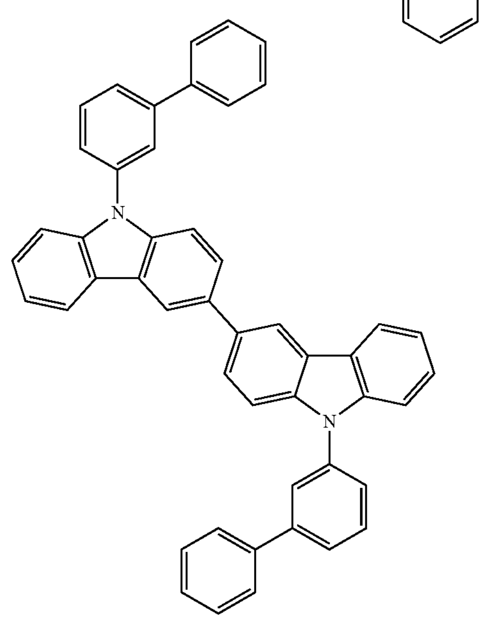

-continued
H-H9
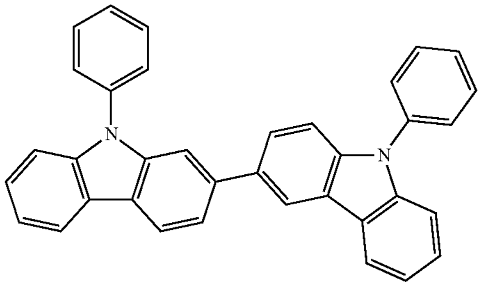
H-H10
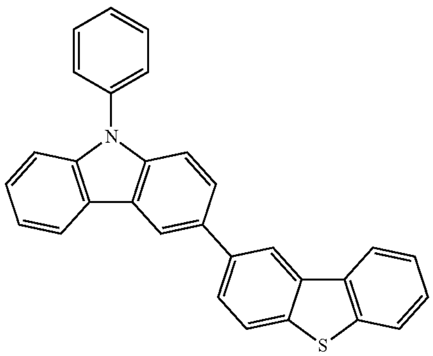
H-H11
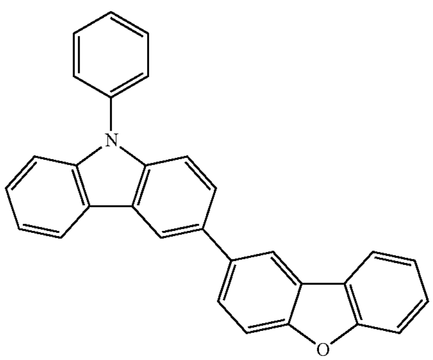
H-H12
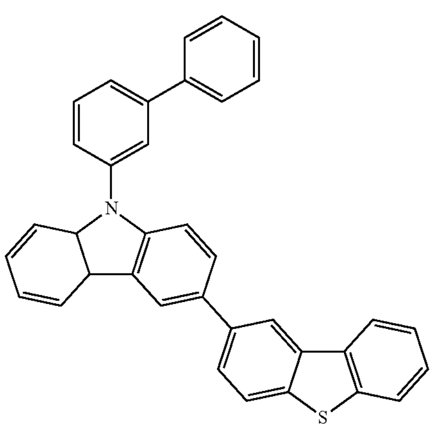
-continued
H-H13
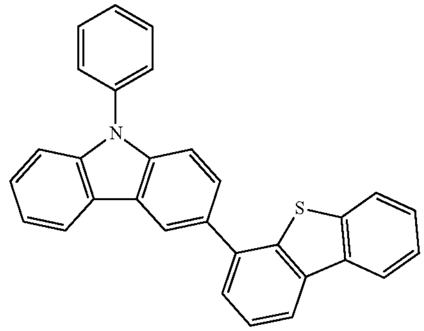
H-H14
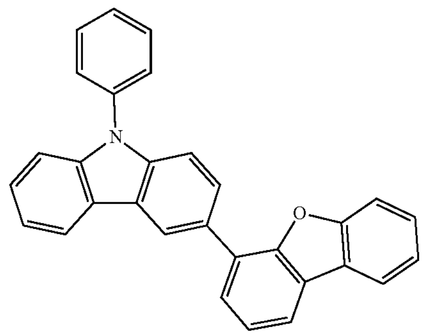
H-H15
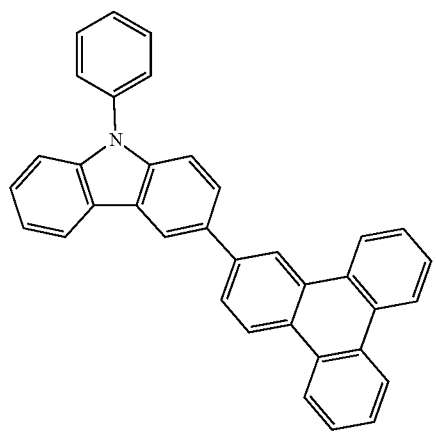
H-H16
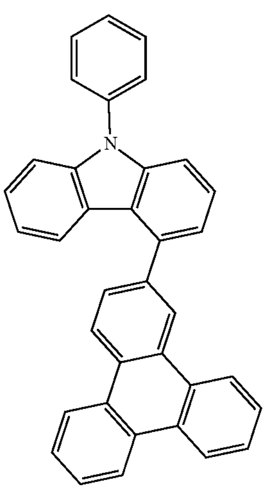

-continued
H-H17
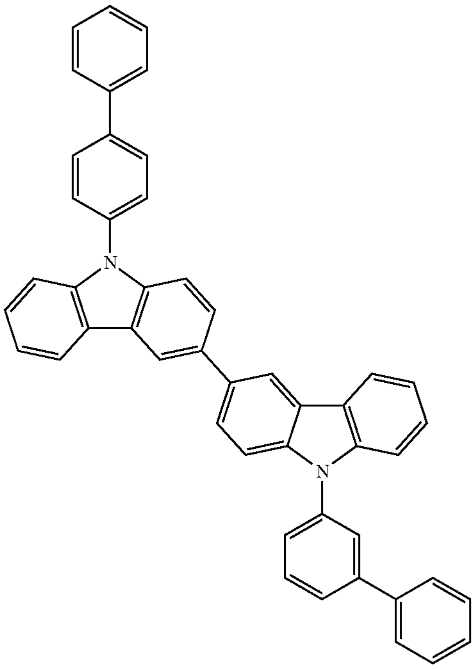
H-H18
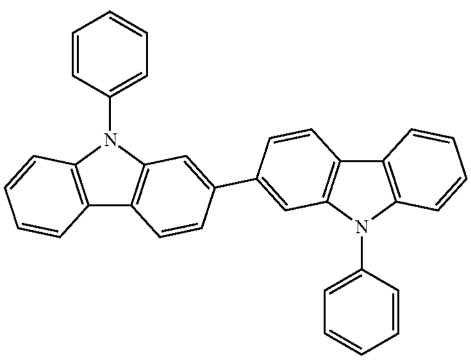
H-H19
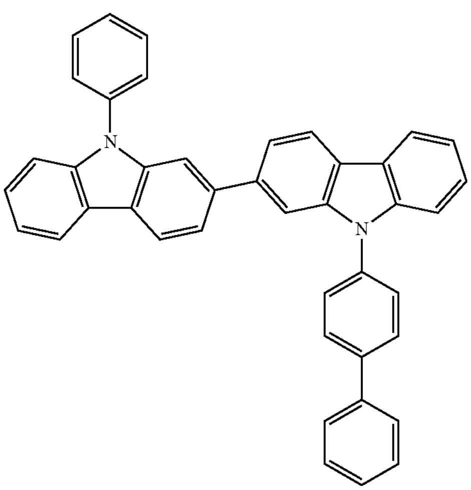
-continued
H-H20
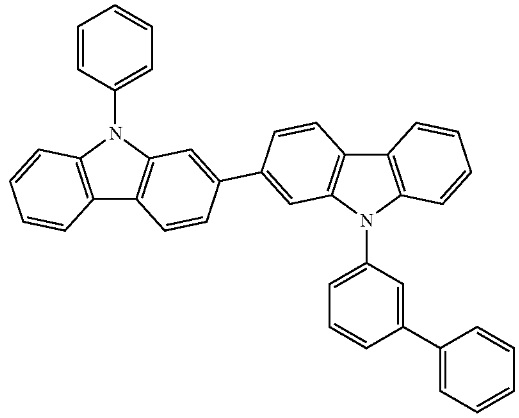
H-H21
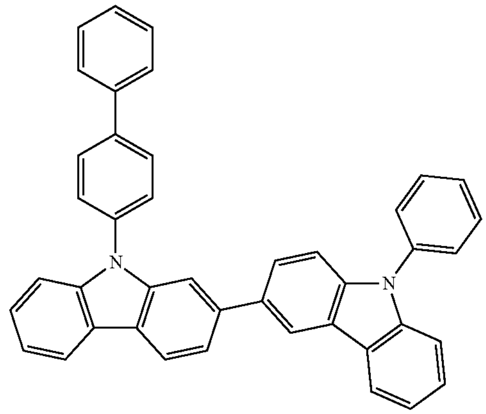
H-H22
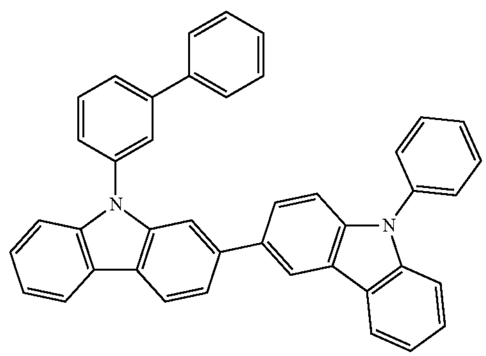
H-H23
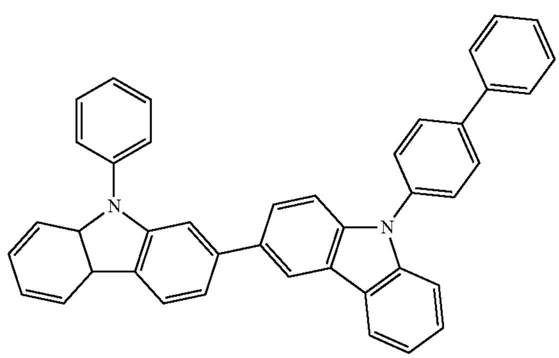

-continued
H-H24
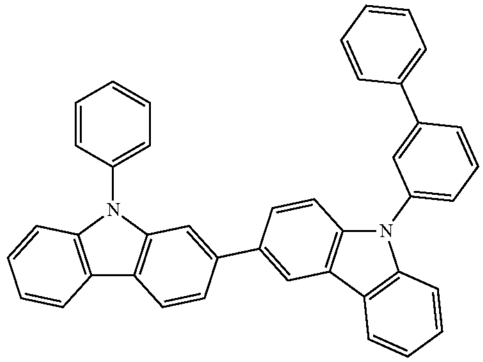
H-H25
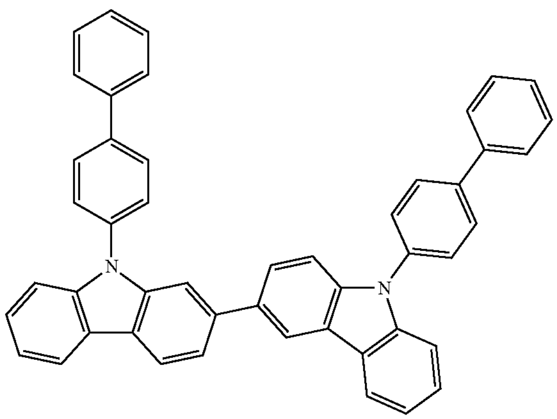
H-H26
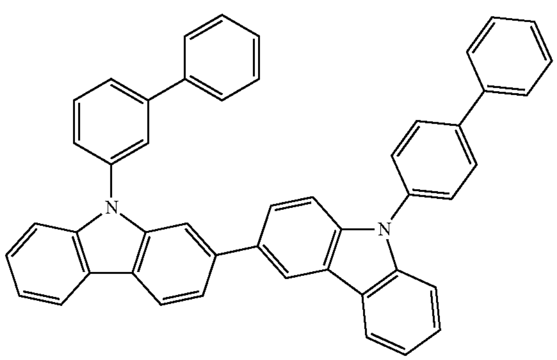
H-H27
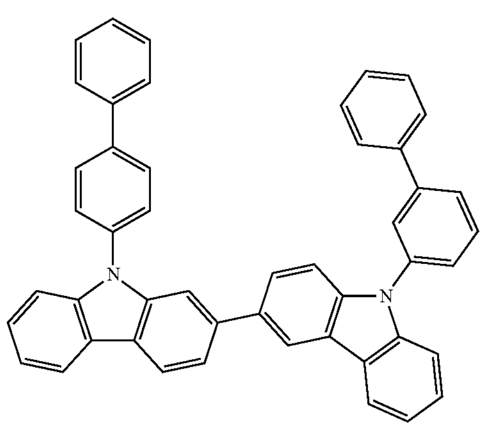
-continued
H-H28
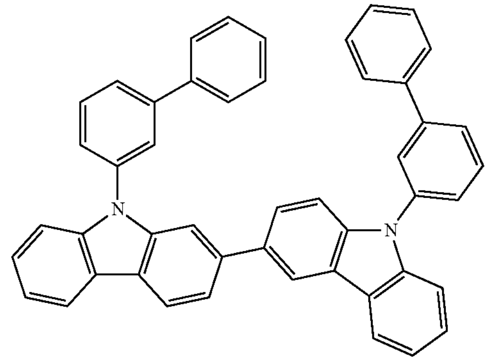
H-H29
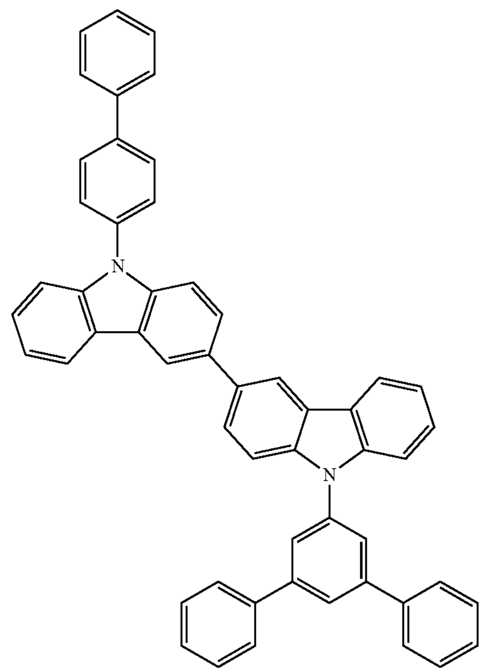
H-H30
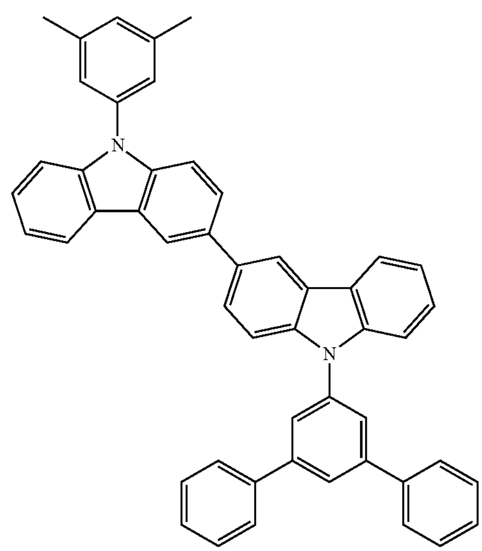

-continued
H-H31
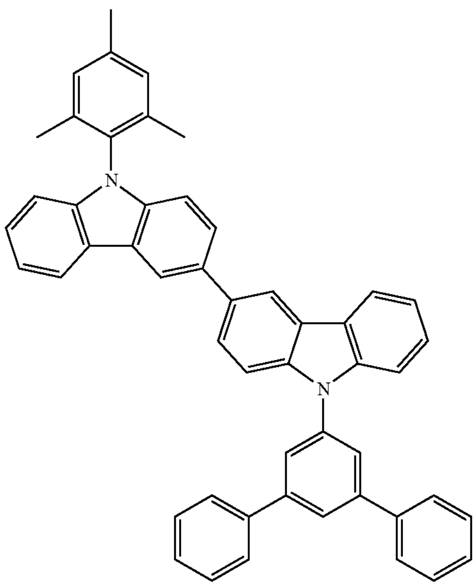
H-H32
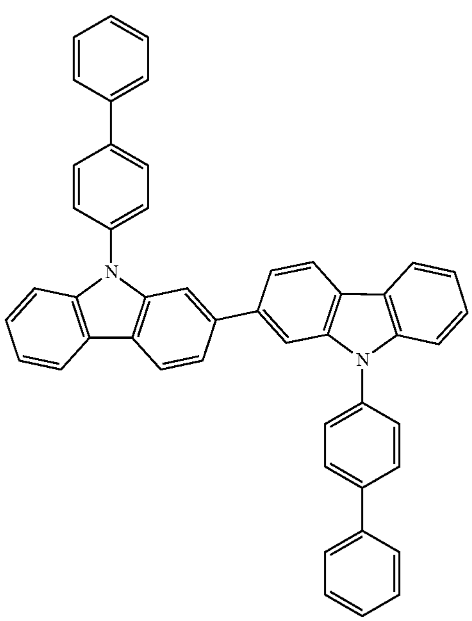
-continued
H-H33
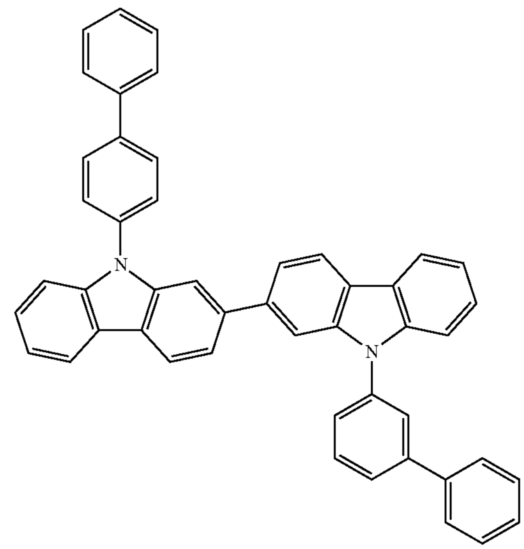
H-H34
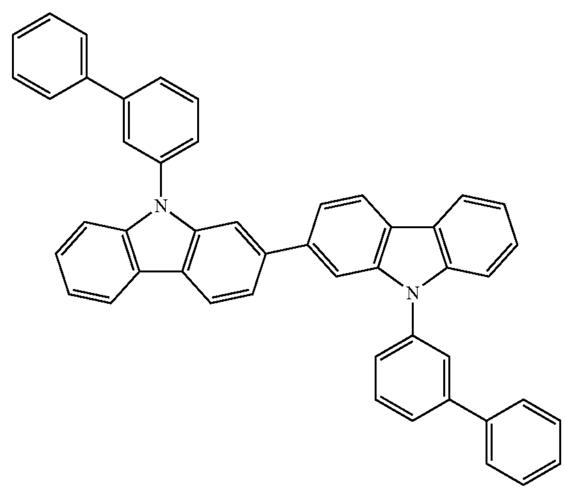
H-H35
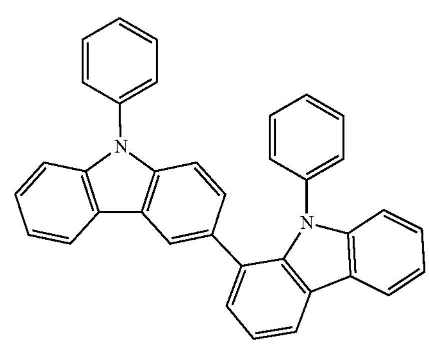

-continued
H-H36
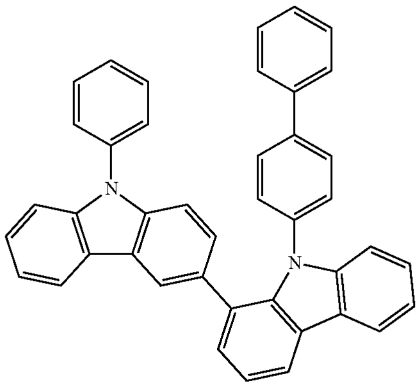
H-H37
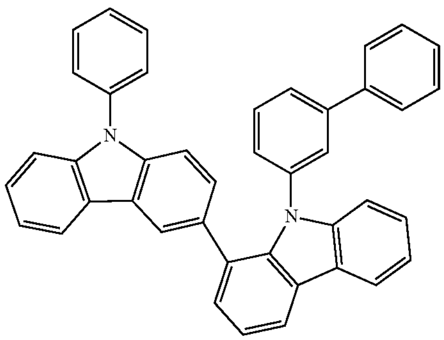
H-H38
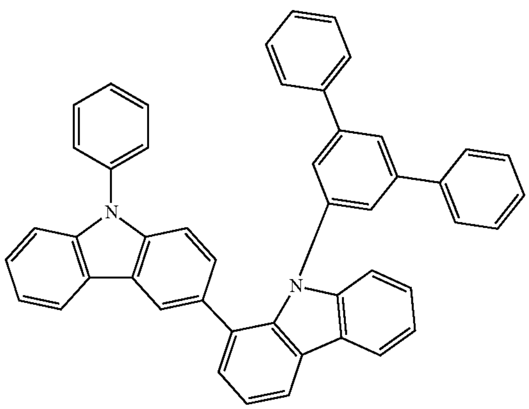
H-H39
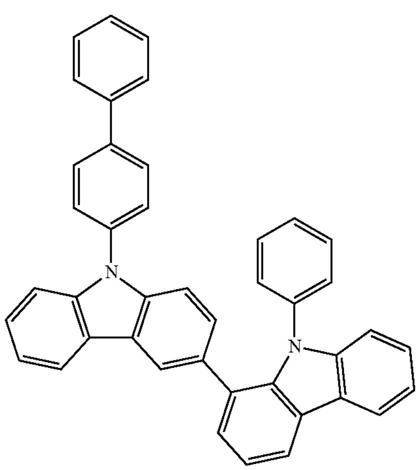
-continued
H-H40
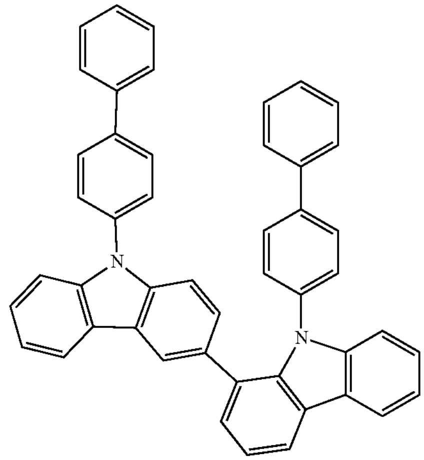
H-H41
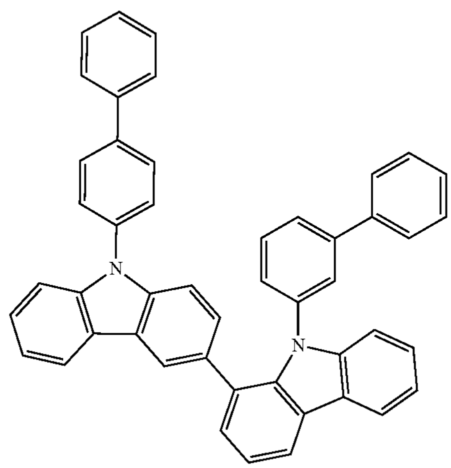
H-H42
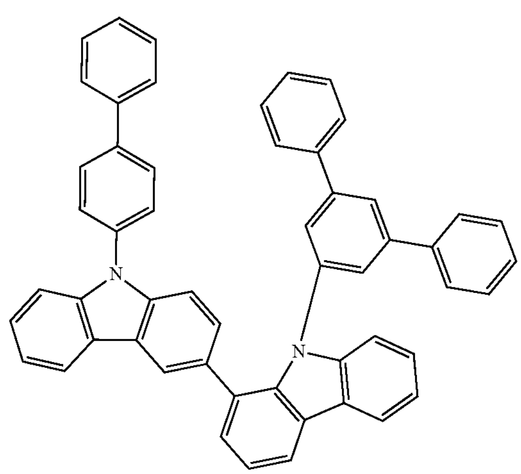

H-H43
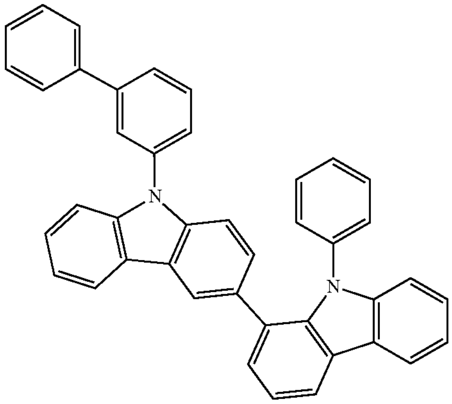
H-H44
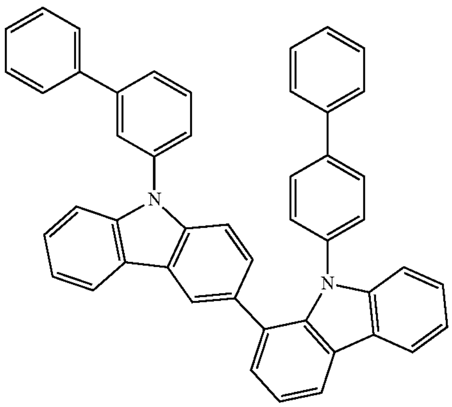
H-H45
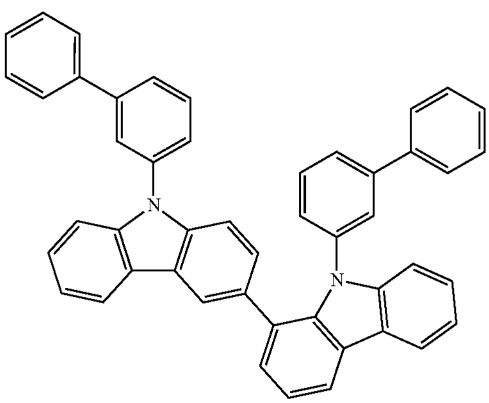
H-H46
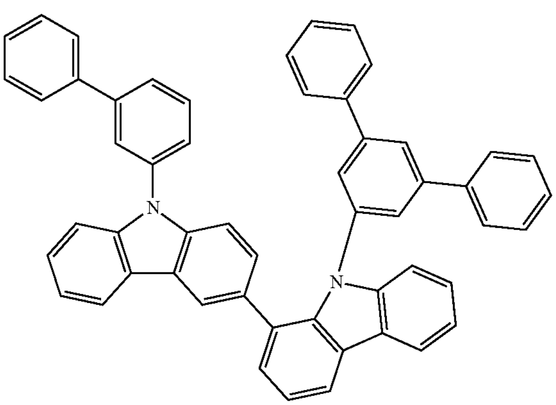
H-H47
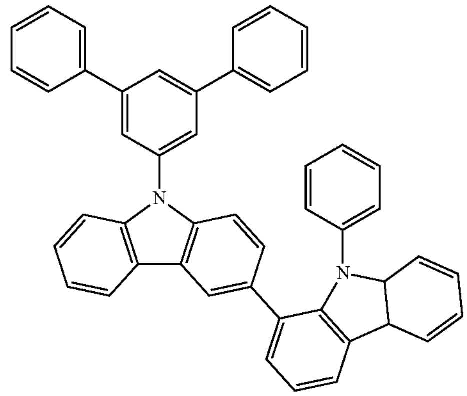
H-H48
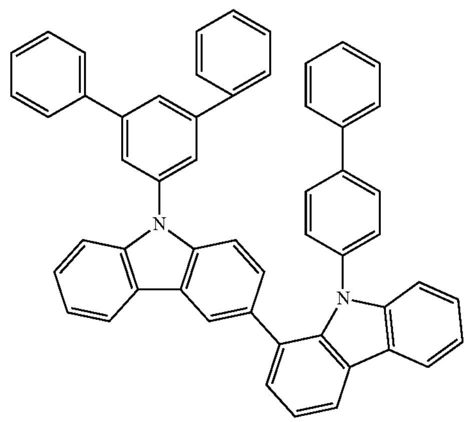
H-H49
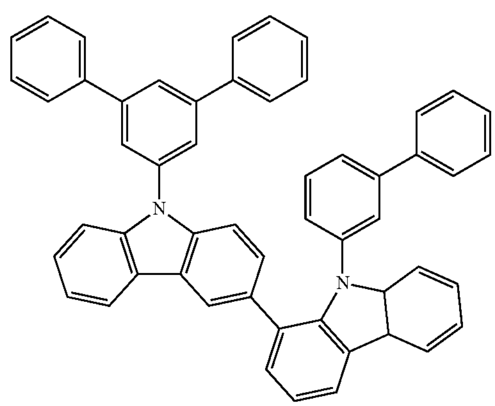

-continued
H-H50
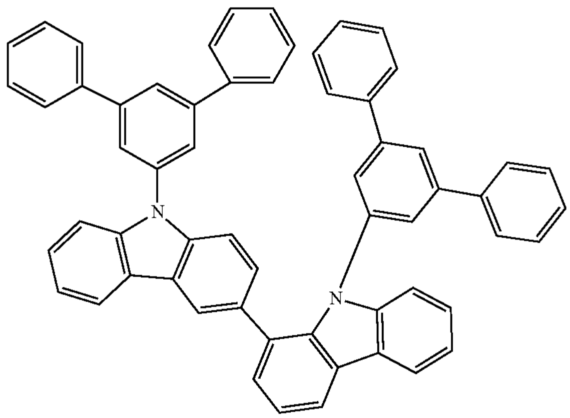
H-H51
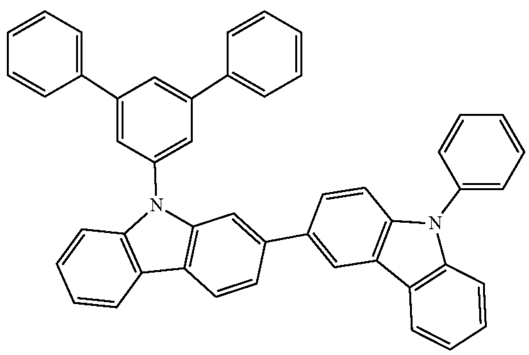
H-H52
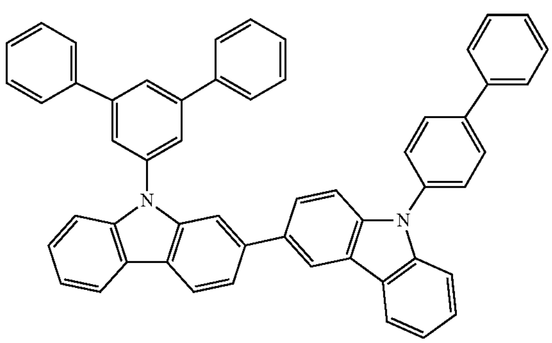
H-H53
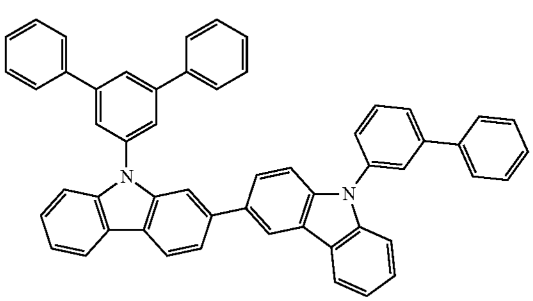
-continued
H-H54
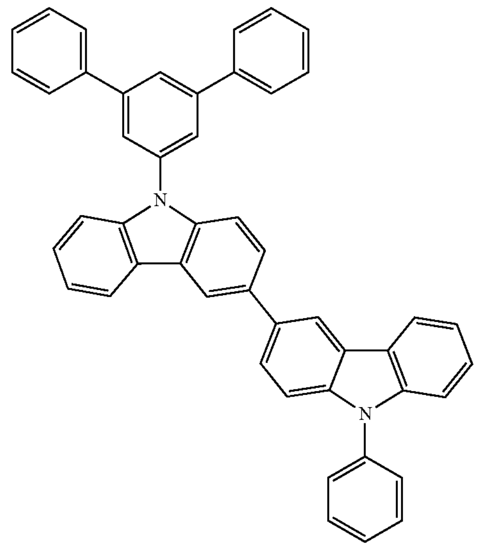
H-H55
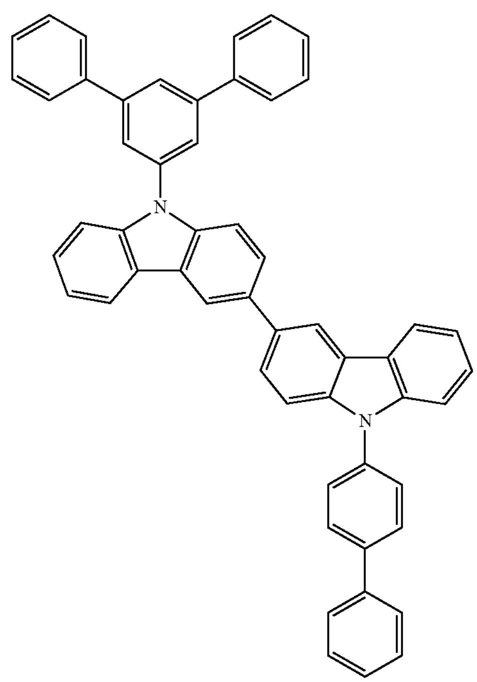

-continued
H-H56
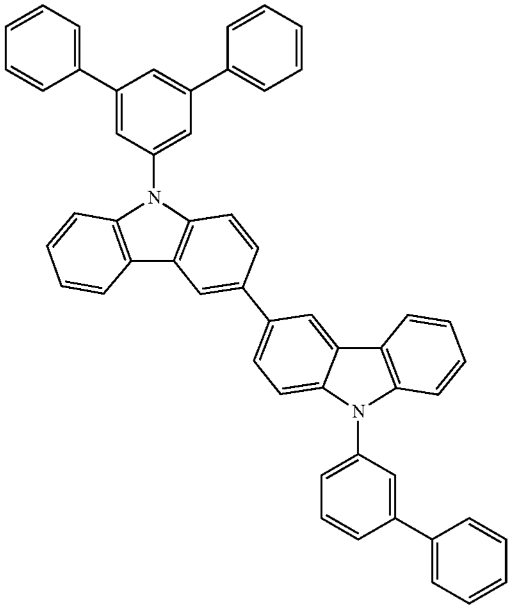
H-H57
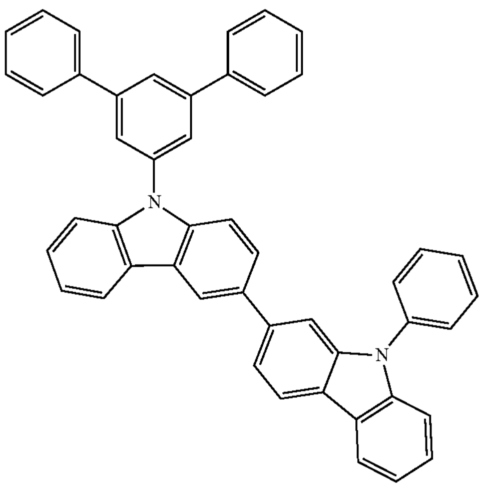
H-H58
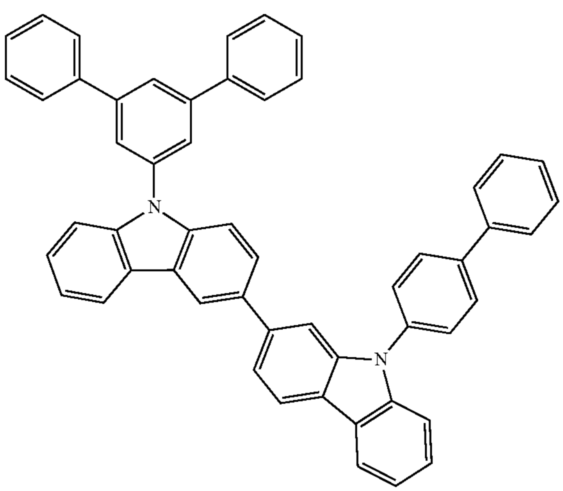
-continued
H-H59
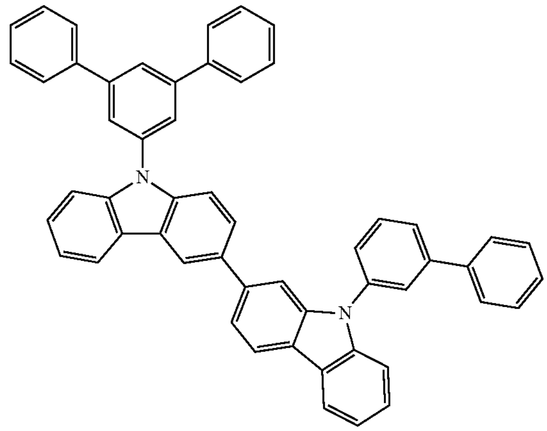
H-H60
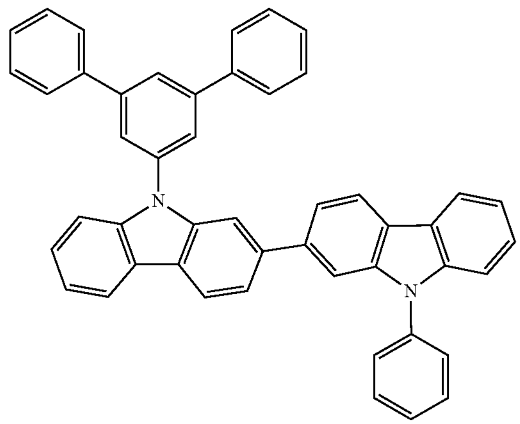
H-H61
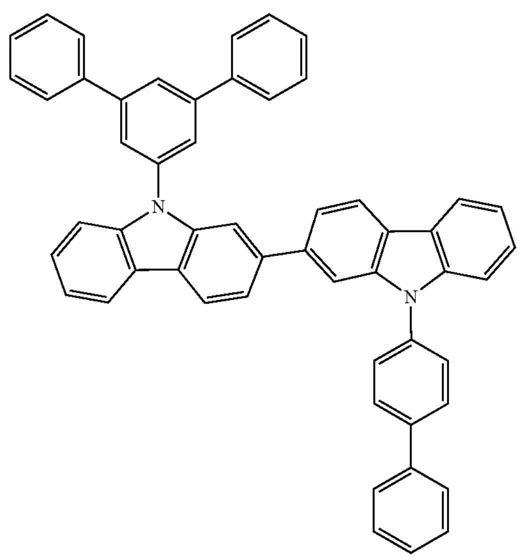

-continued
H-H62
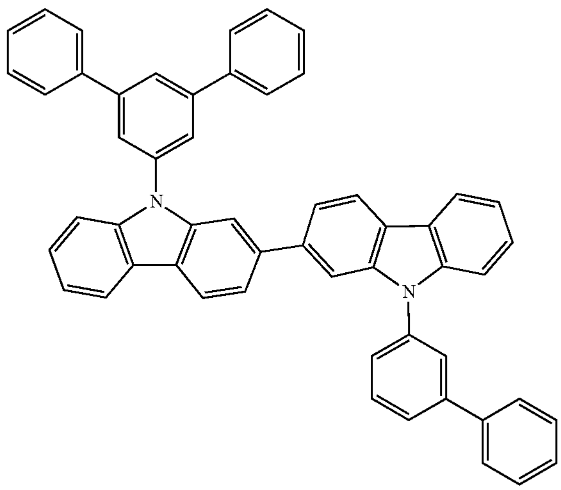
H-H63
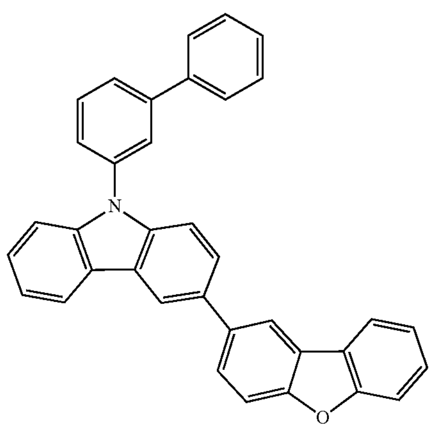
H-H64
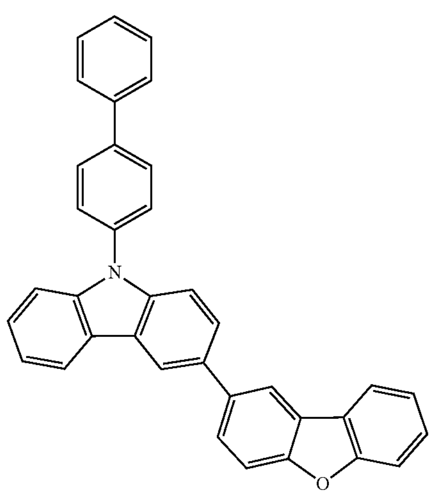
-continued
H-H65
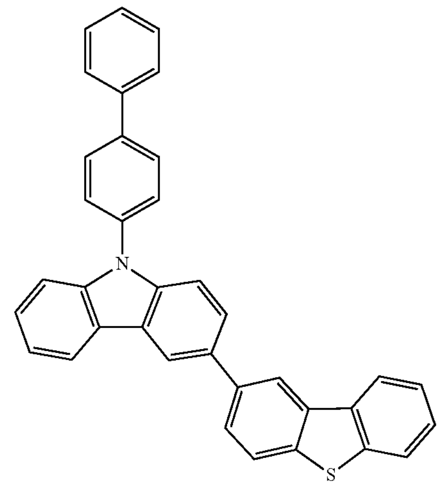
H-H66
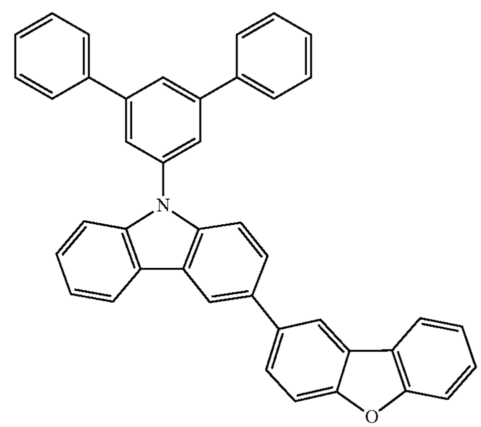
H-H67
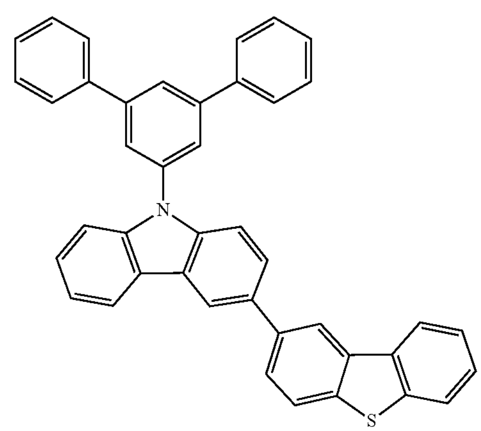

-continued
H-H68
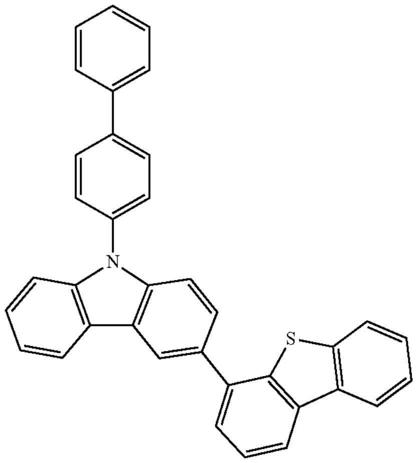
H-H69
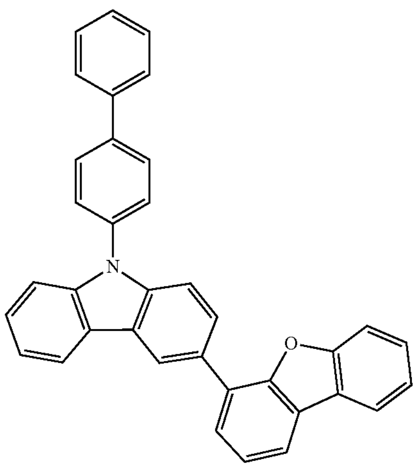
H-H70
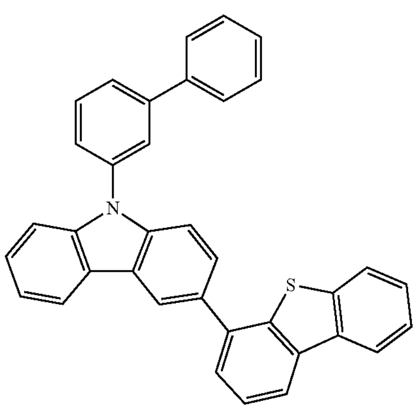
-continued
H-H71
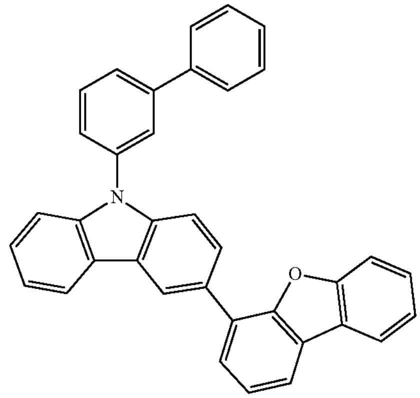
H-H72
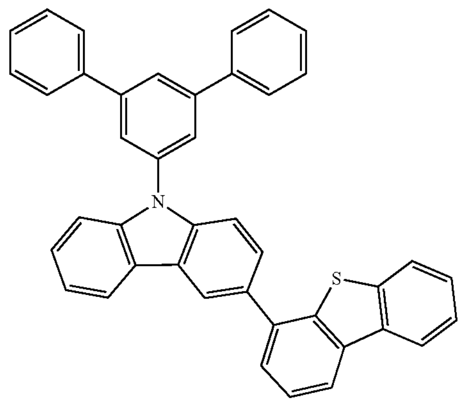
H-H73
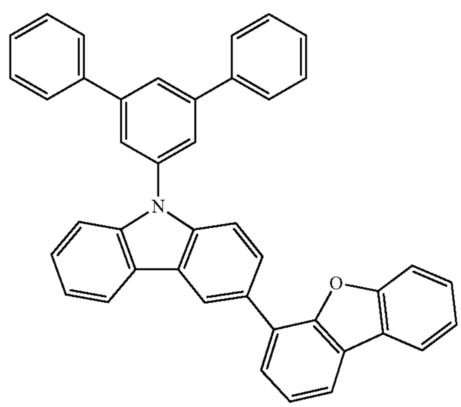
H-H74
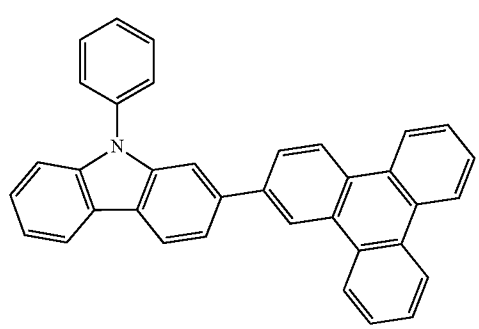

-continued
H-H75
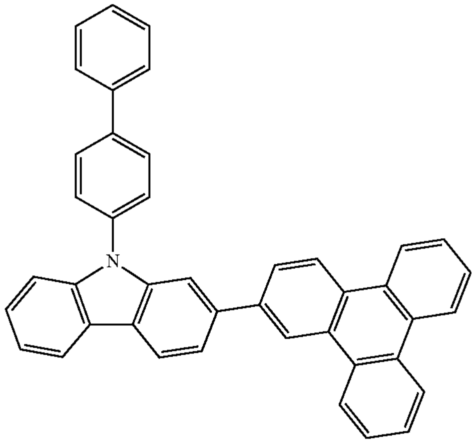
H-H76
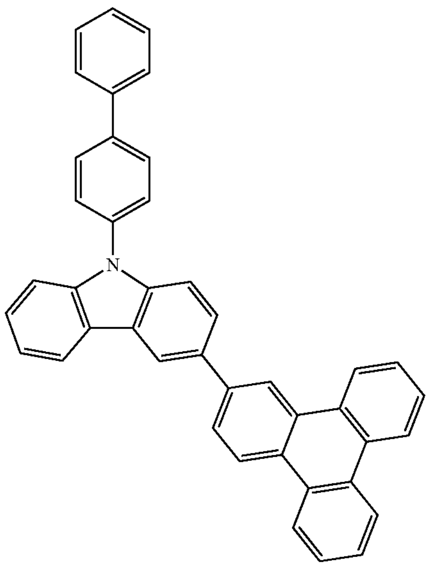
H-H77
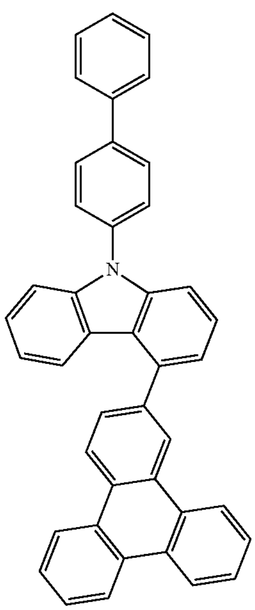
-continued
H-H78
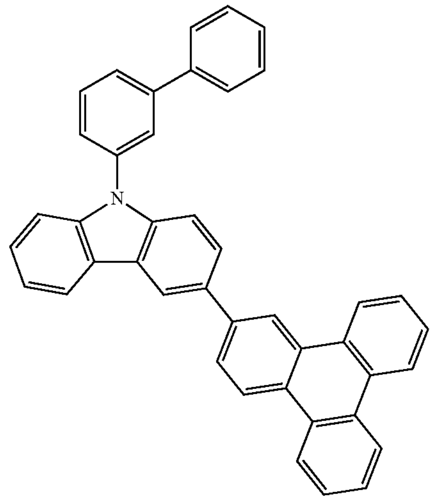
H-H79
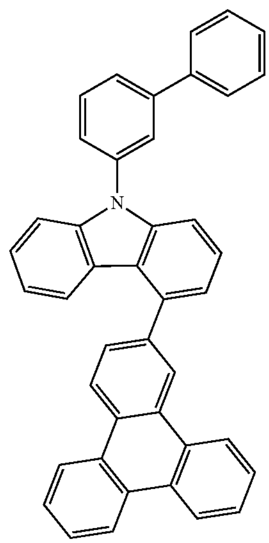
H-H80
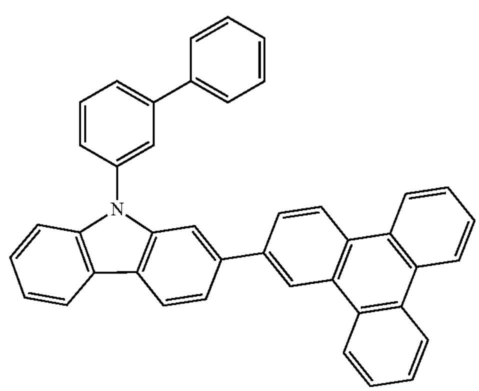

-continued
H-H81
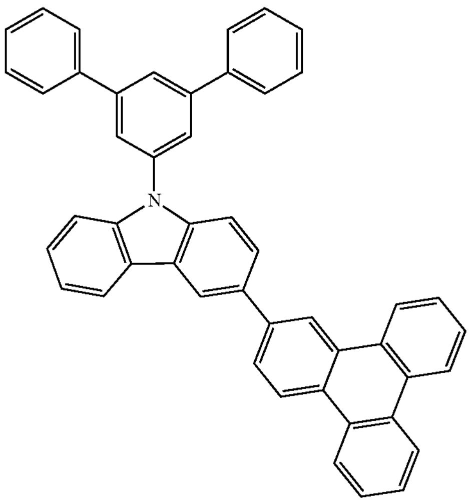
H-H82
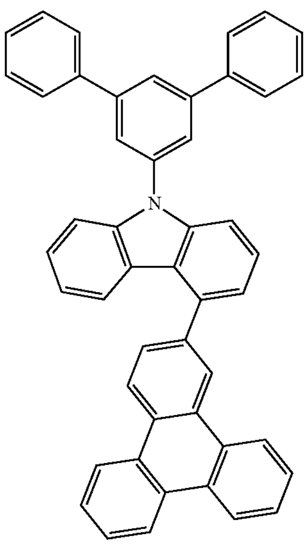
H-H83
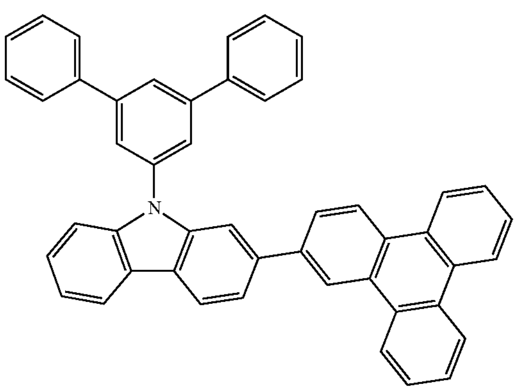
-continued
H-H84
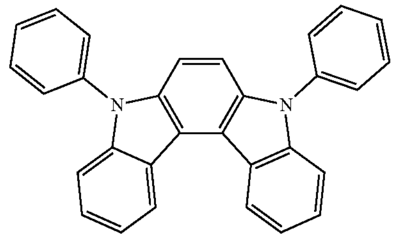
H-H85
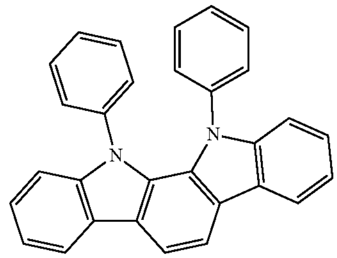
H-H86
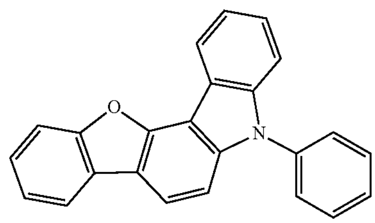
H-H87
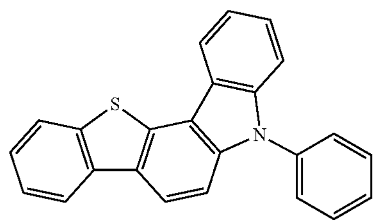
H-H88
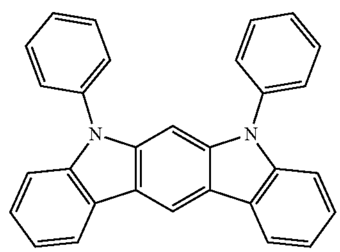
H-H89
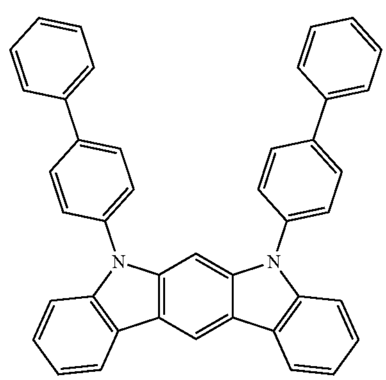

H-H90
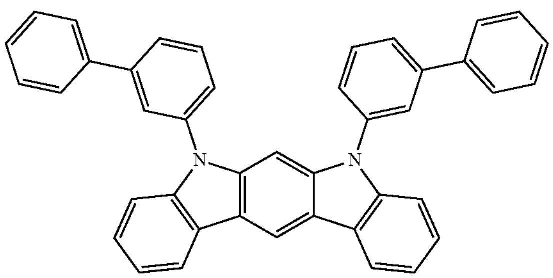
H-H91
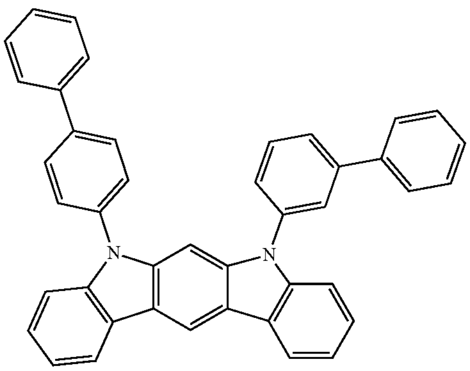
H-H92
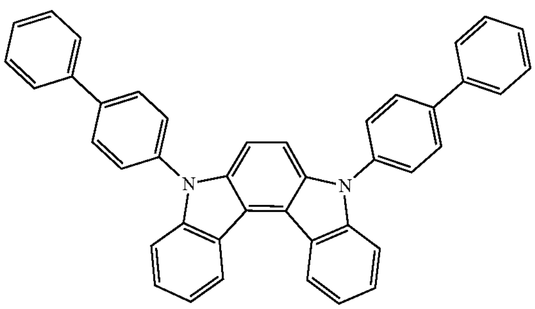
H-H93
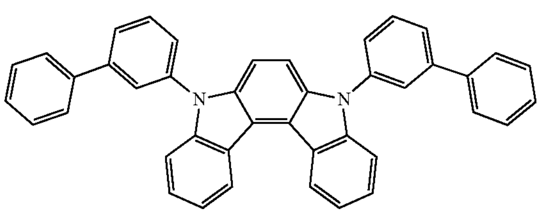
H-H94
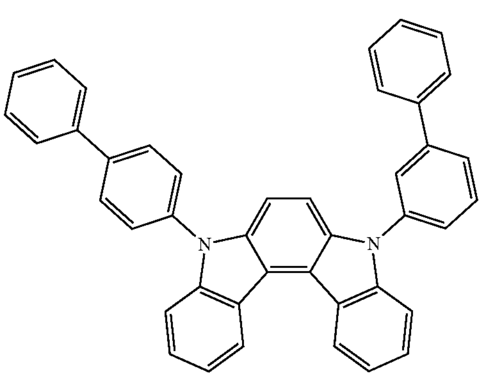
H-H95
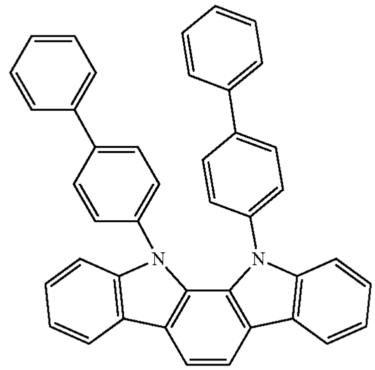
H-H96
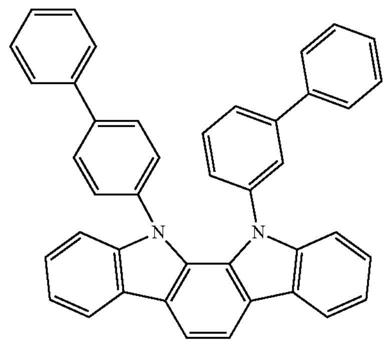
H-H97
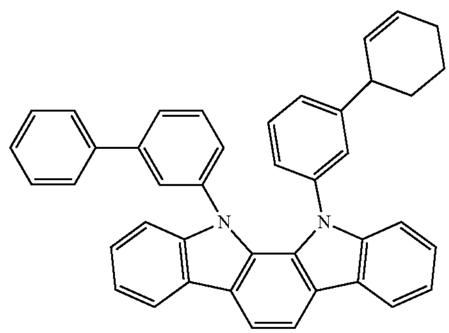
H-H98
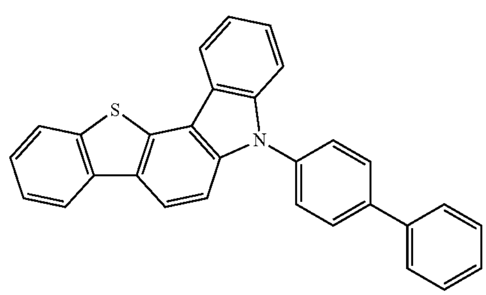
H-H99
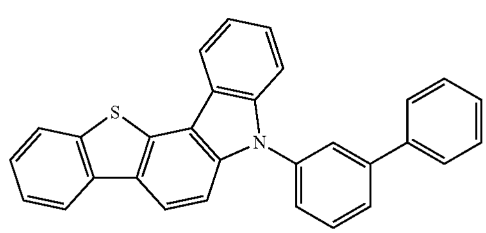

-continued

H-H100

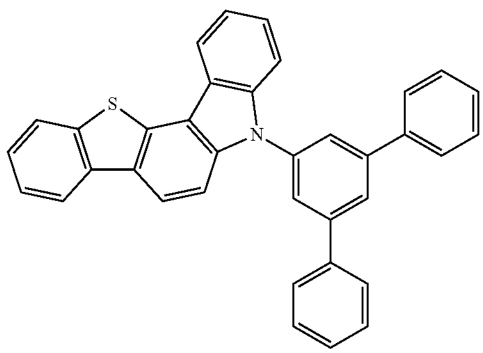

H-H101

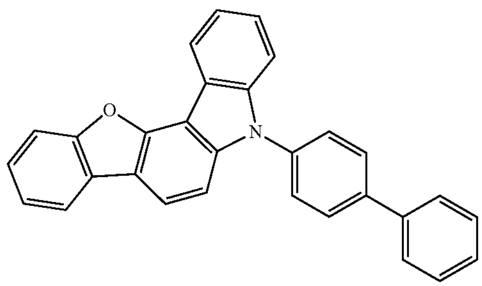

H-H102

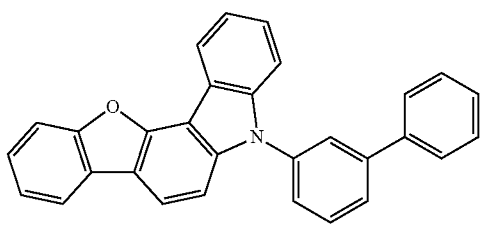

H-H103

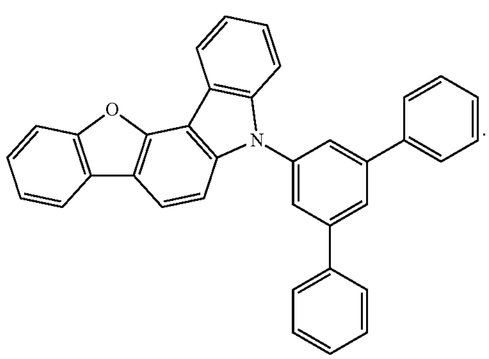

A weight ratio of the first compound to the second compound may be 1:9 to 9:1, for example, 2:8 to 8:2, for example, 4:6 to 6:4, for example, 5:5.

The third compound may be a phosphorescent dopant or a delayed fluorescence dopant. However, the third compound may not substantially emit light.

The phosphorescent dopant may be an organic metal compound including at least one metal a first-row transition metal of the Periodic Table of Elements, a second-row transition metal of the Periodic Table of Elements, a third-row transition metal of the Periodic Table of Elements, or a combination thereof.

In an embodiment, the phosphorescent dopant may include metal ($M_{11}$) of at least one a first-row transition metal of the Periodic Table of Elements, a second-row transition metal of the Periodic Table of Elements, a third-row transition metal of the Periodic Table of Elements, or a combination thereof, and an organic ligand ($L_{11}$), and $L_{11}$ and $M_{11}$, may form 1, 2, 3, or 4 cyclometallated rings.

In an embodiment, the phosphorescent dopant may include an organometallic compound represented by Formula 101:

$$M_{11}(L_{11})_{n11}(L_{12})_{n12} \quad \text{Formula 101}$$

wherein, in Formula 101, $M_{11}$ may be a first-row transition metal of the Periodic Table of Elements, a second-row transition metal of the Periodic Table of Elements, or a third-row transition metal of the Periodic Table of Elements;

$L_{11}$ may be a ligand represented by one of Formulae 1-1 to 1-4;

$L_{12}$ may be a monodentate ligand or a bidentate ligand;

$n_{11}$ may be 1, and $n_{12}$ may be 0, 1, or 2;

1-1

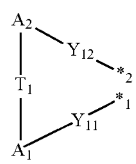

1-2

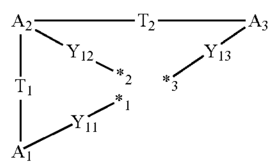

1-3

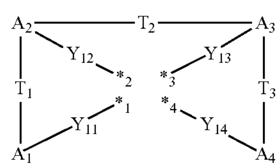

1-4

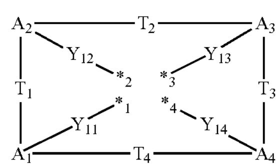

wherein, in Formulae 1-1 to 1-4, $A_1$ to $A_4$ may each independently be a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ may each independently be a chemical bond, O, S, $N(R_{91})$, $B(R_{91})$, $P(R_{91})$, or $C(R_{91})(R_{92})$, $T_1$ to $T_4$ may each independently be a single bond, a double bond, *—$N(R_{93})$—*', *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', *—O—*', *—C(═O)—*', *—S(═O)—*', *—$S(═O)_2$—*', *—$C(R_{93})$═*', *═$C(R_{93})$—*', *—$C(R_{93})$═$C(R_{94})$—*', *—C(═S)—*', or *—C≡C—*', a substituent of the substituted $C_5$-$C_{30}$ carbocyclic group, a substituent of substituted $C_1$-$C_{30}$ heterocyclic group, and $R_{91}$ to $R_{94}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, wherein each of a substituent of the substituted $C_5$-$C_{30}$ carbocyclic group and a substituent of substituted $C_1$-$C_{30}$ heterocyclic group is not hydrogen, $*_1$, $*_2$, $*_3$, and $*_4$ each indicate a binding site to $M_{11}$, and $Q_1$ to $Q_3$ may each independently be hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a $C_6$-$C_{60}$ aryl group that is substituted with deuterium, —F, a cyano group, a $C_1$-$C_{60}$ alkyl group, a $C_6$-$C_{60}$ aryl group, or a combination thereof.

In an embodiment, the phosphorescent dopant may be a group of PD1 to PD6, but embodiments of the disclosure are not limited thereto:

Group PD1

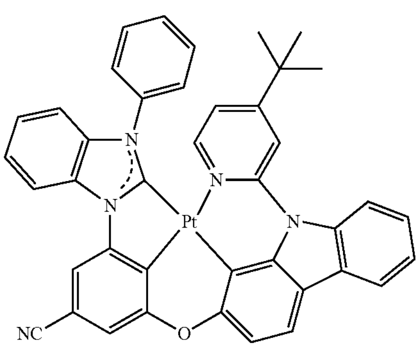

-continued

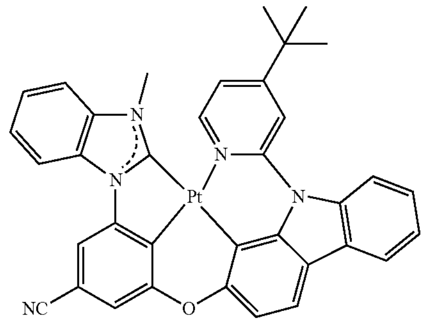

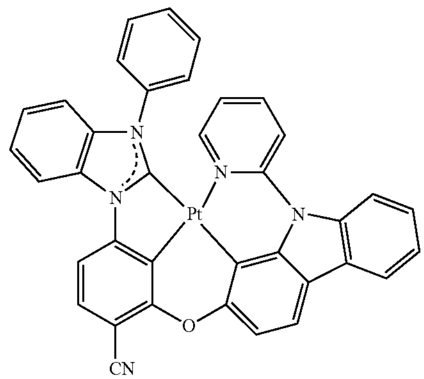

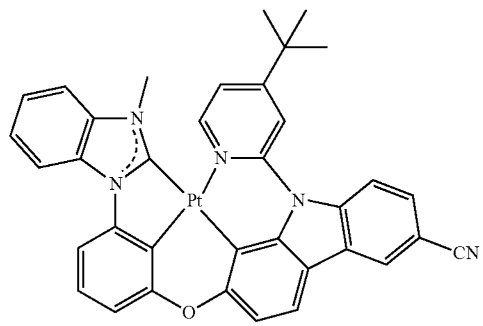

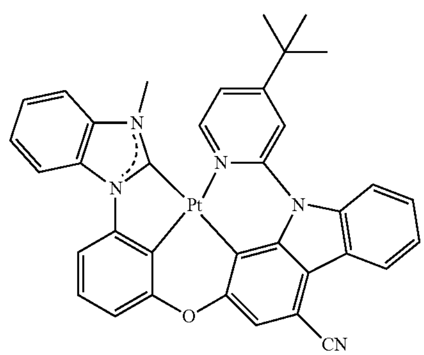

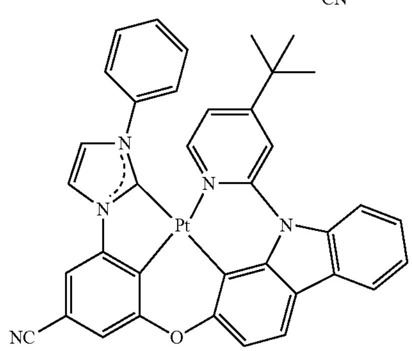

-continued
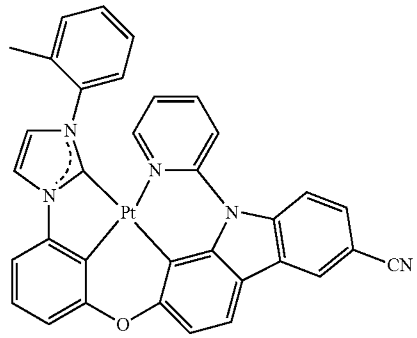
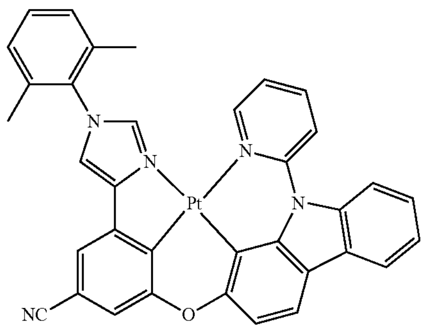
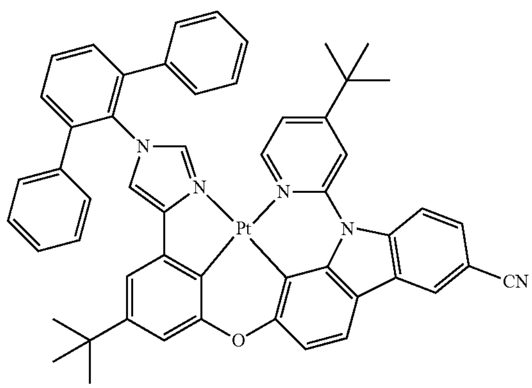
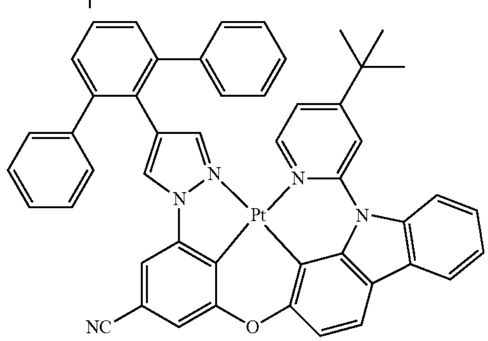
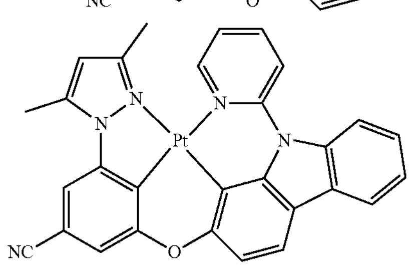
-continued
Group PD2
1
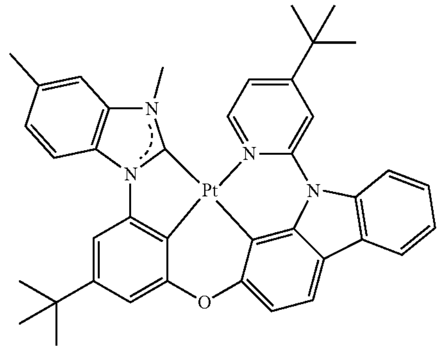
2
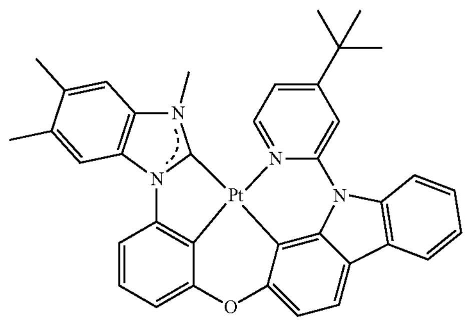
3
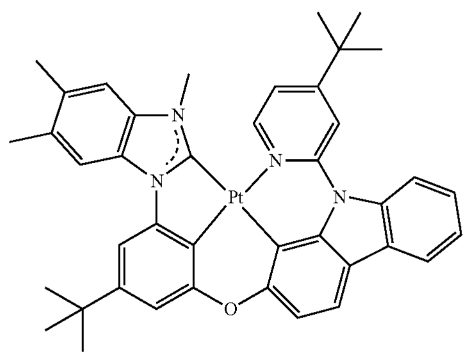
4
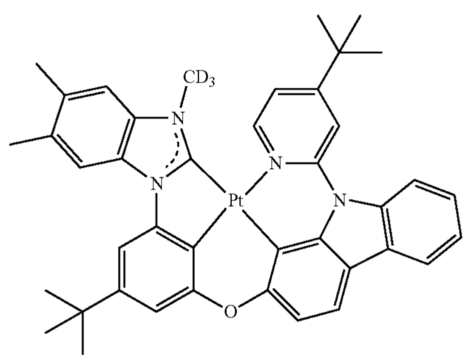

5
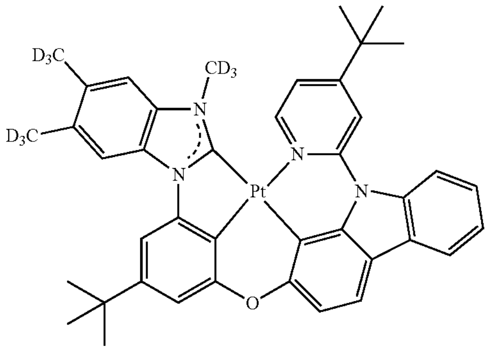
6
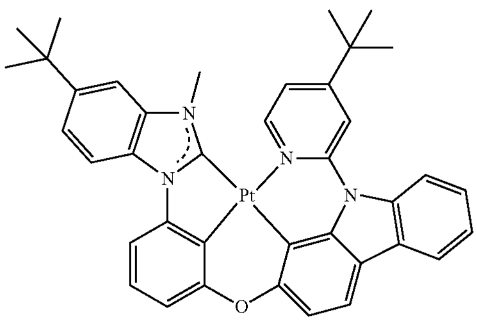
7
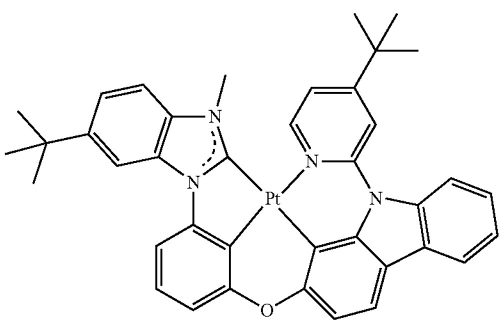
8
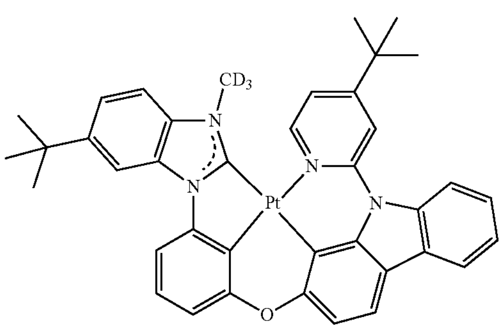
9
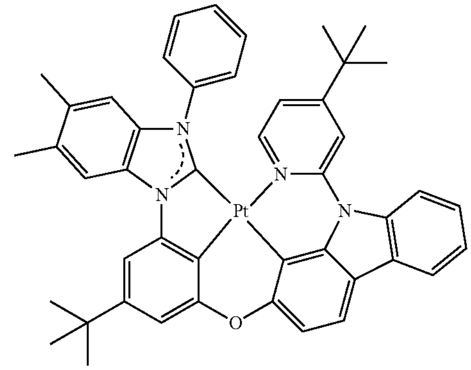
10
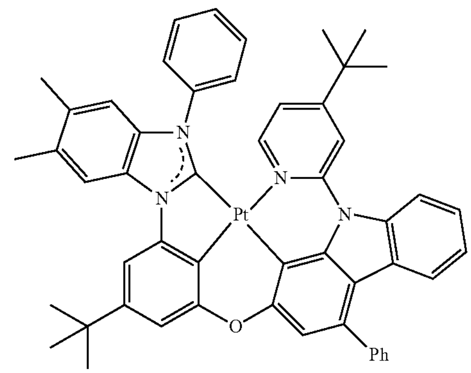
11
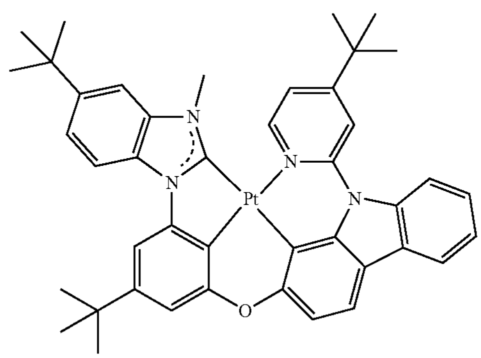
12
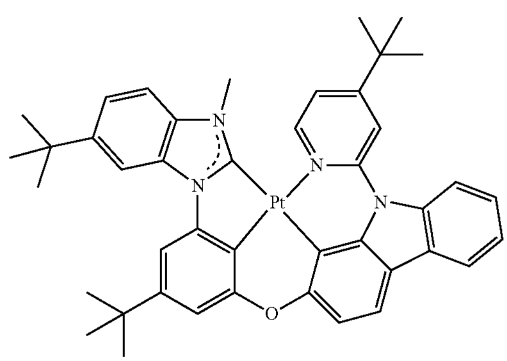

-continued
13
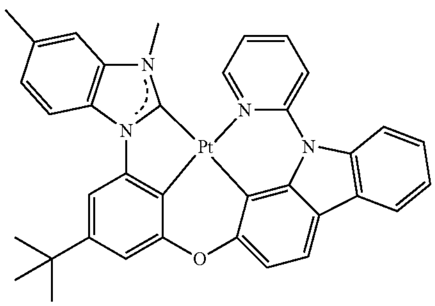
14
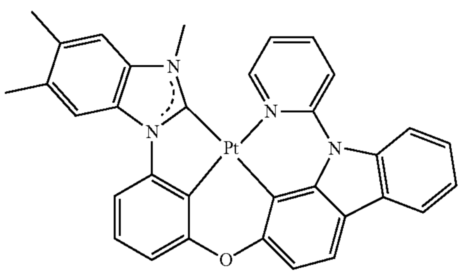
15
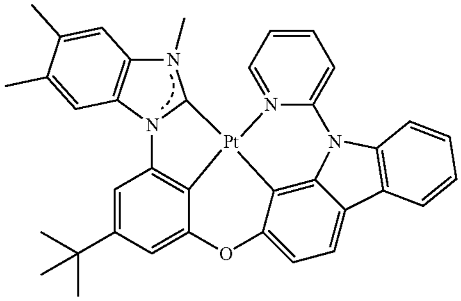
16
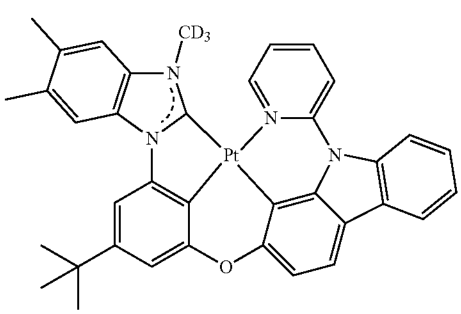
17
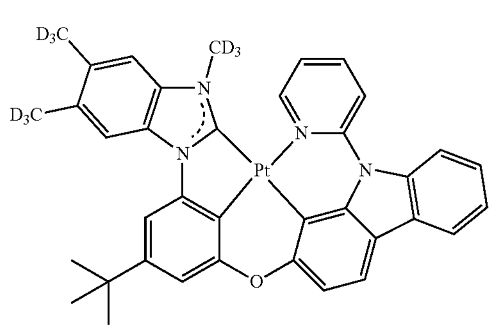
-continued
18
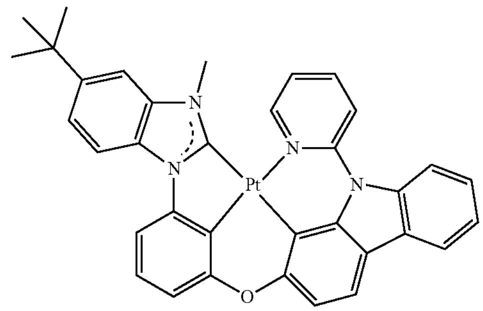
19
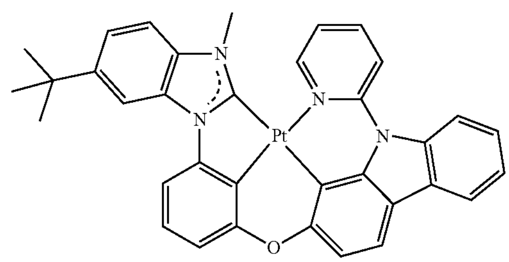
20
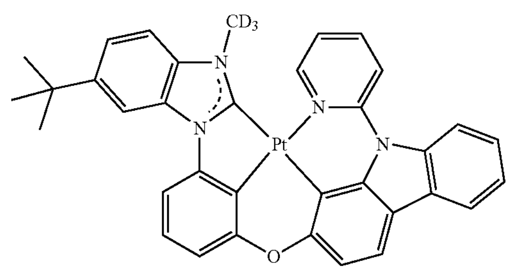
21
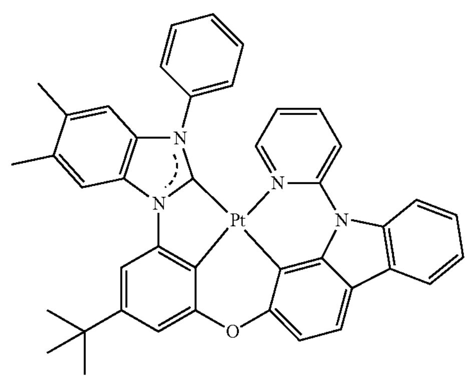
22
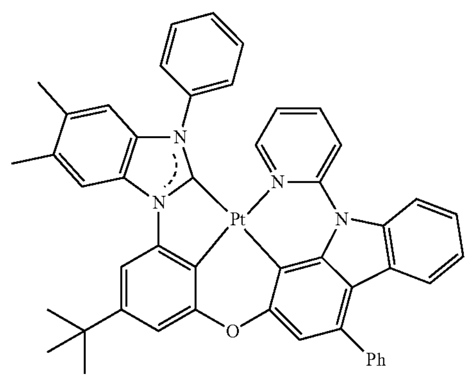

-continued
23
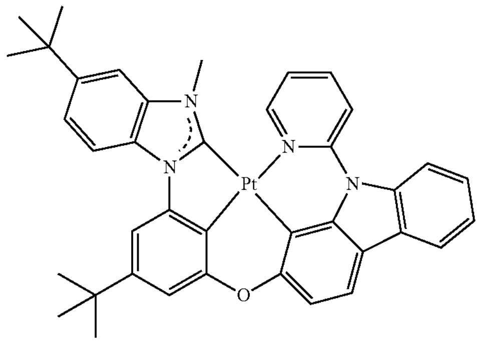
24
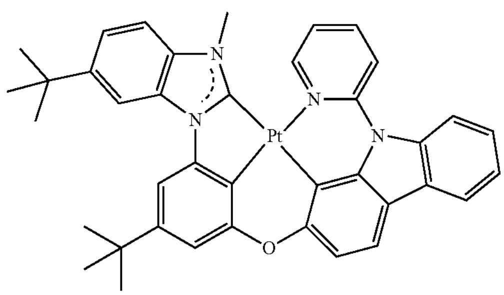
25
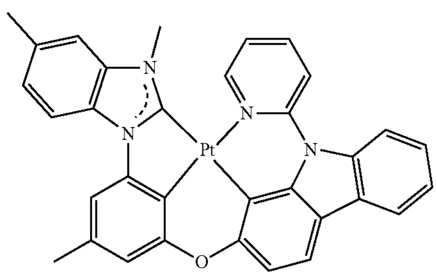
26
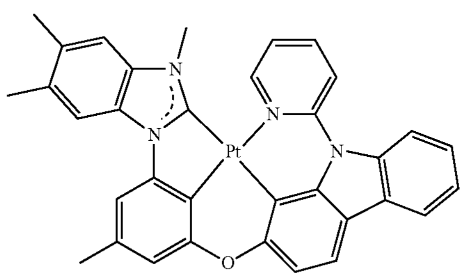
27
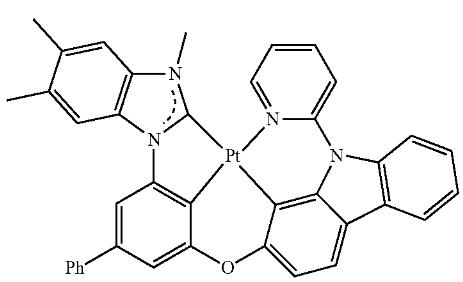
-continued
28
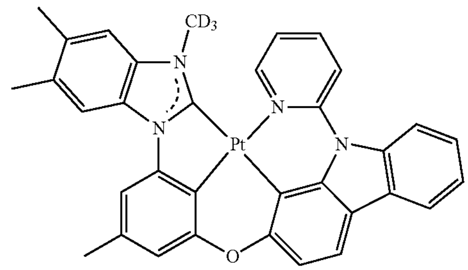
29
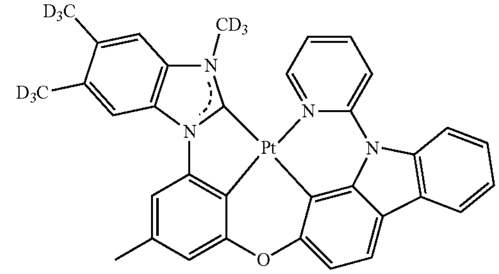
30
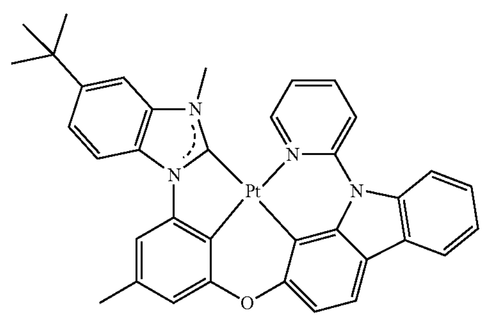
31
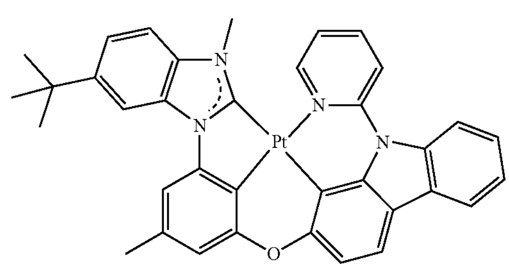
32
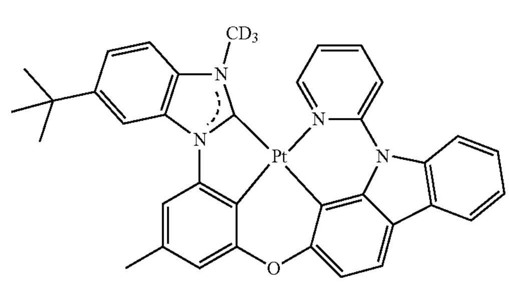

-continued
33
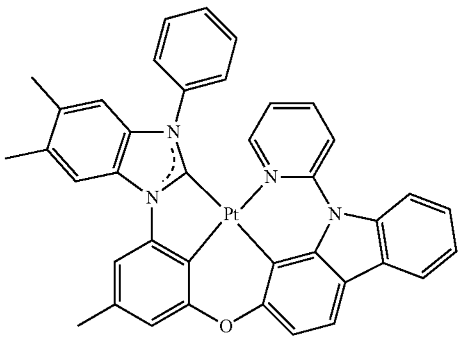
34
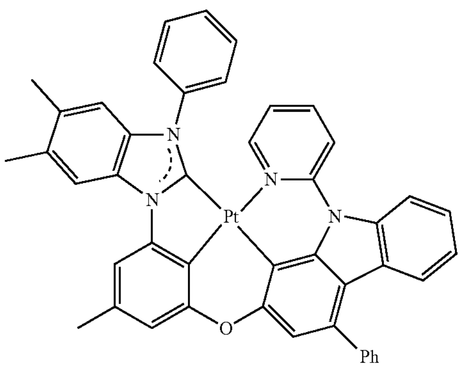
35
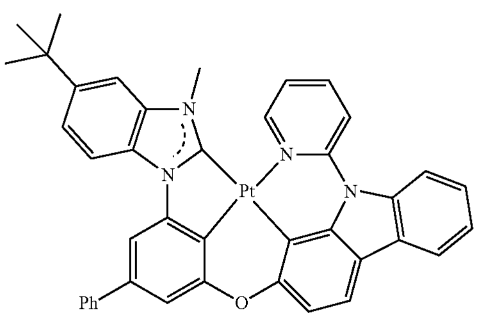
36
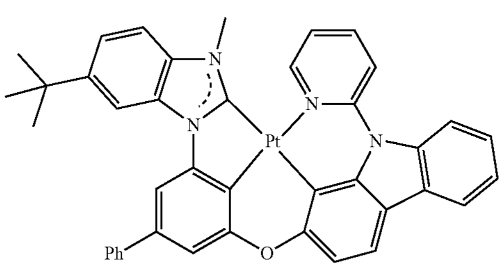
-continued
37
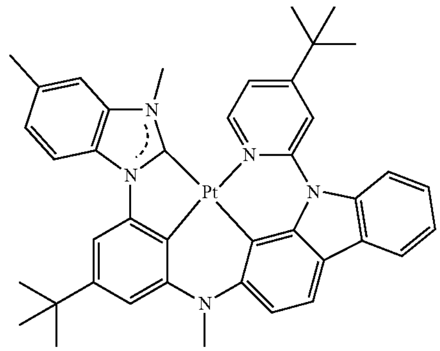
38
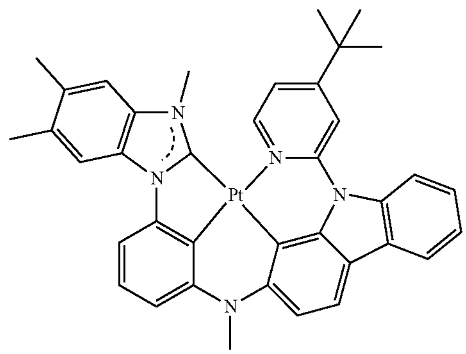
39
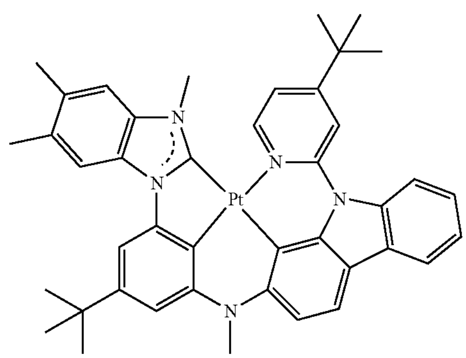
40
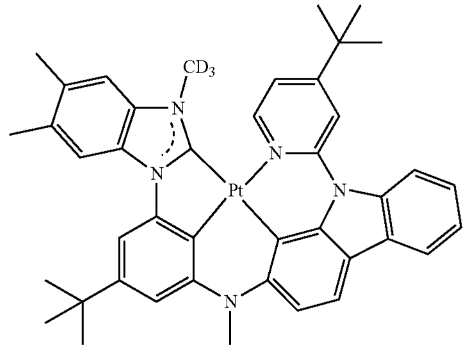

-continued
41
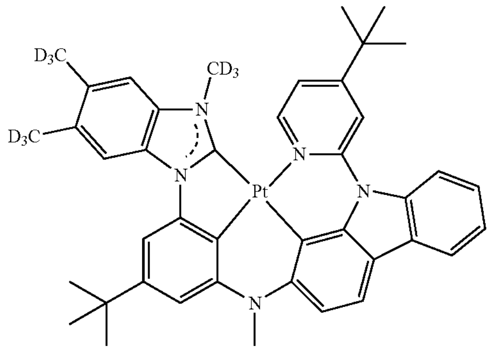
42
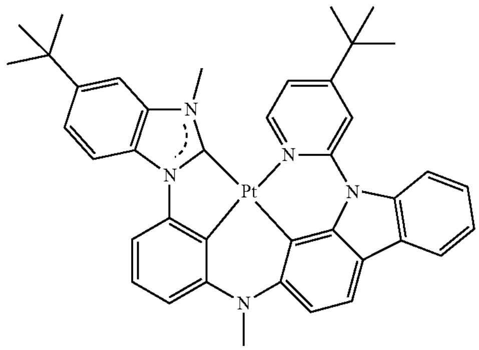
43
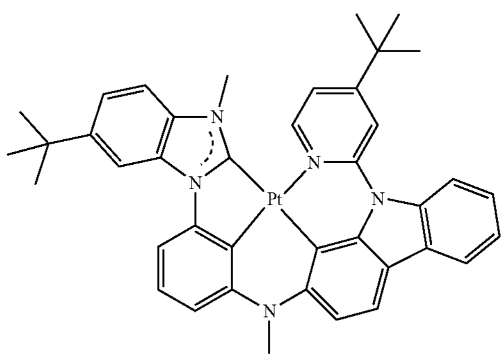
44
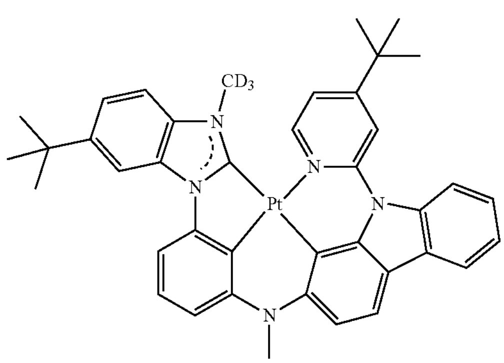
-continued
45
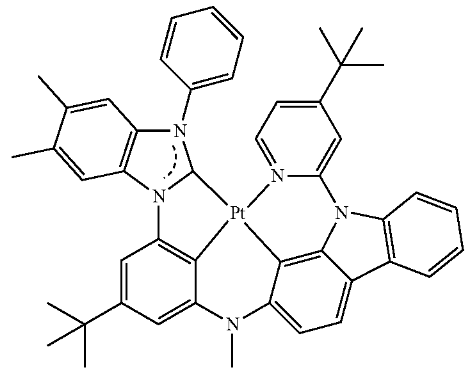
46
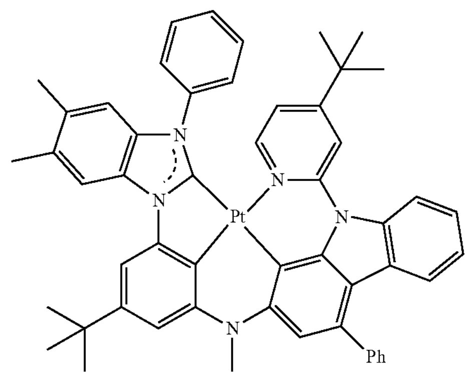
47
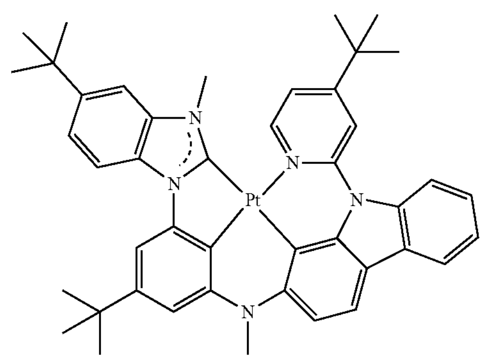
48
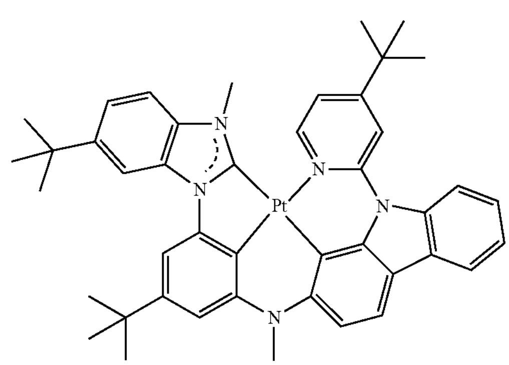

-continued
49
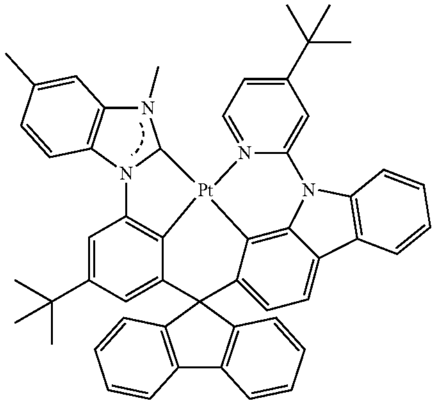
50
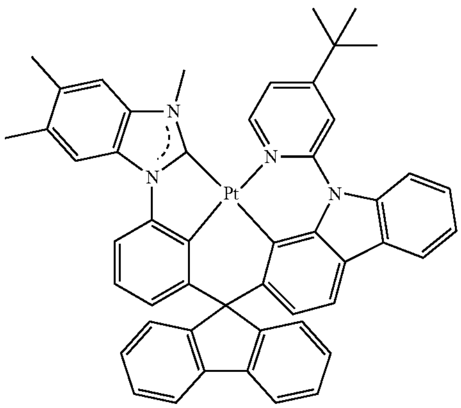
51
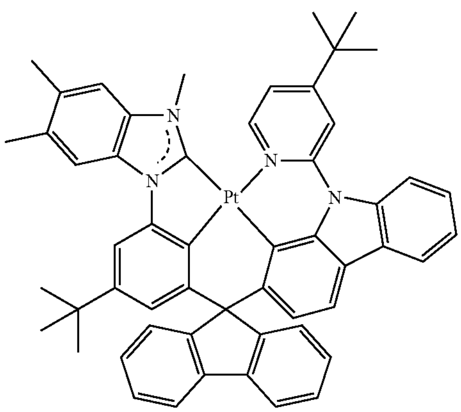
52
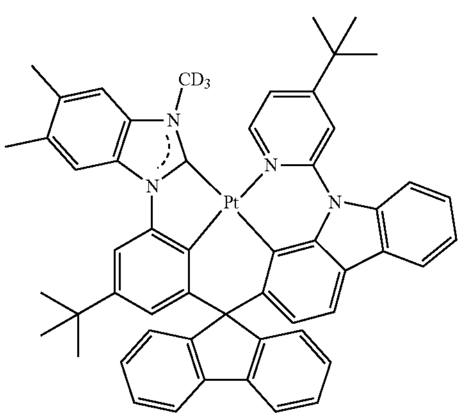
-continued
53
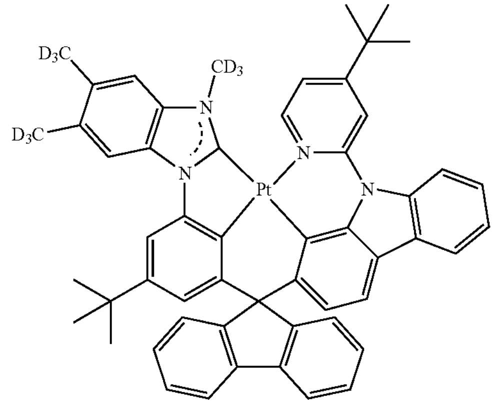
54
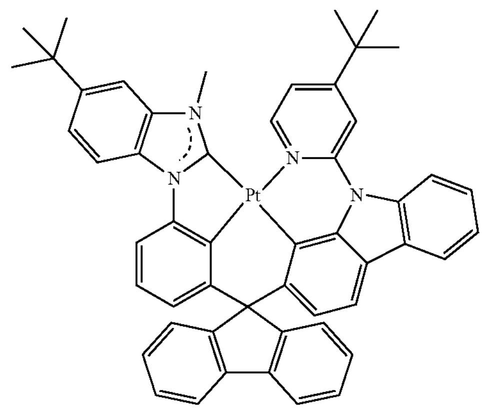
55
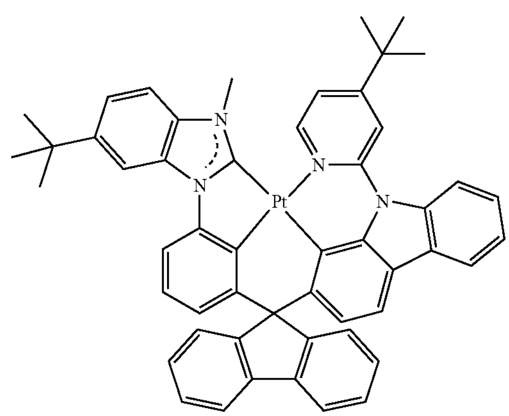

56
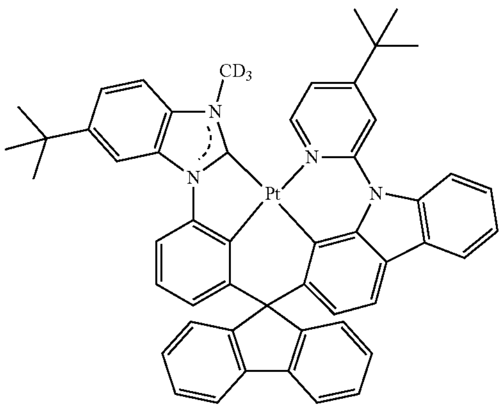
57
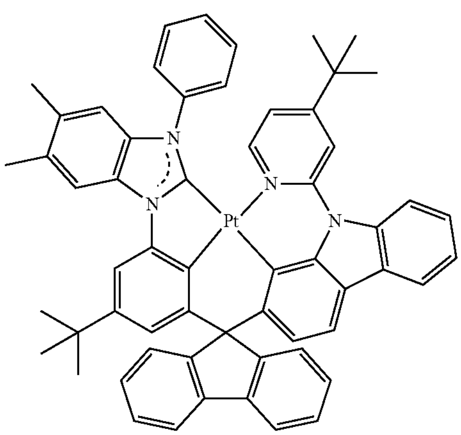
58
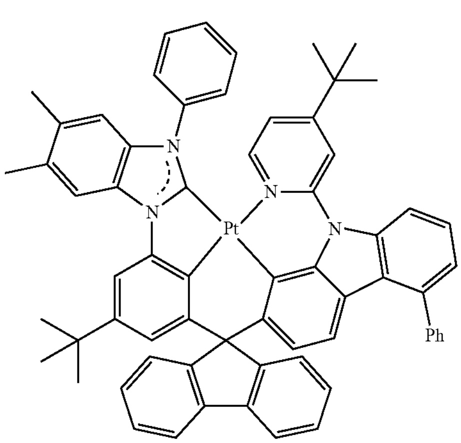
59
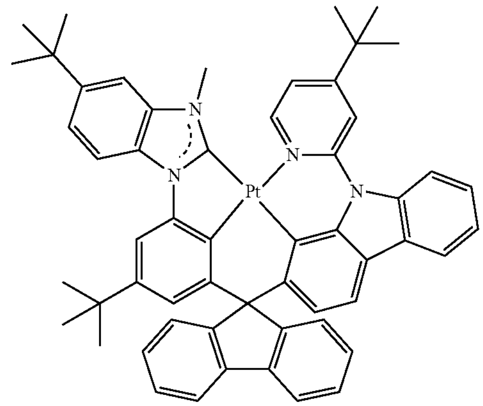
60
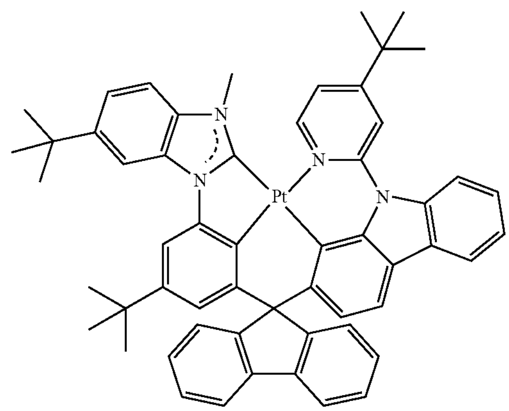
61
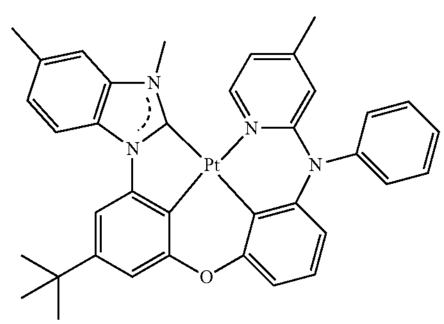
62
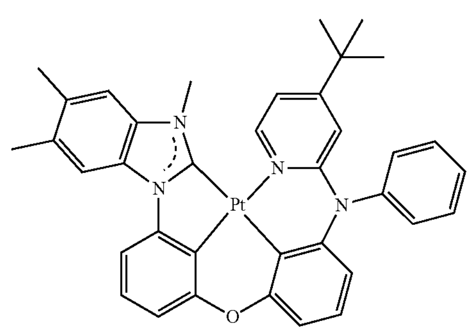

-continued
63
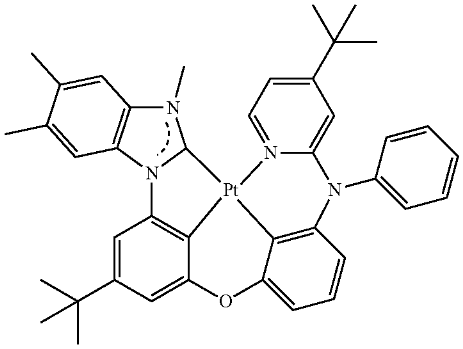
64
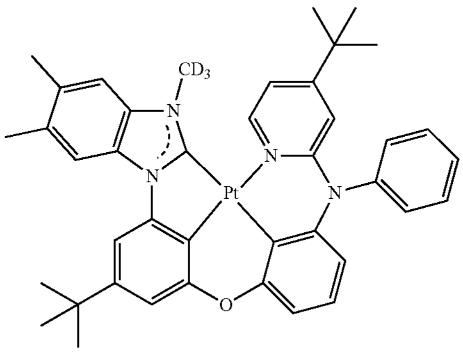
65
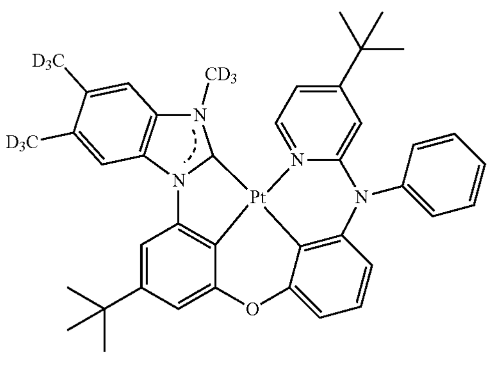
66
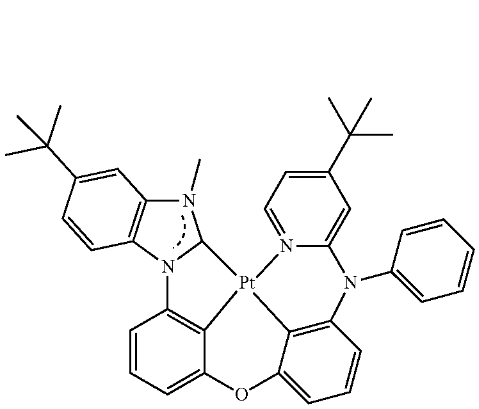
-continued
67
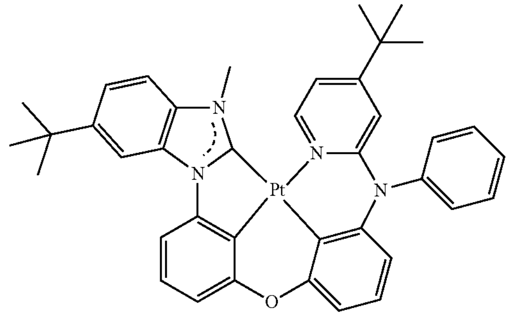
68
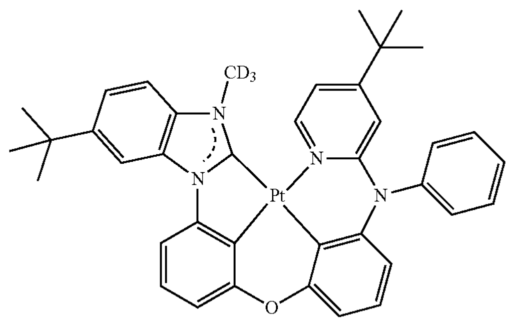
69
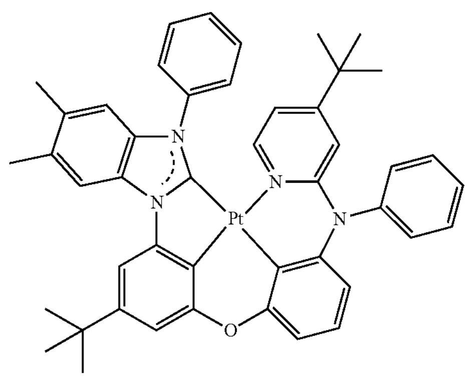
70
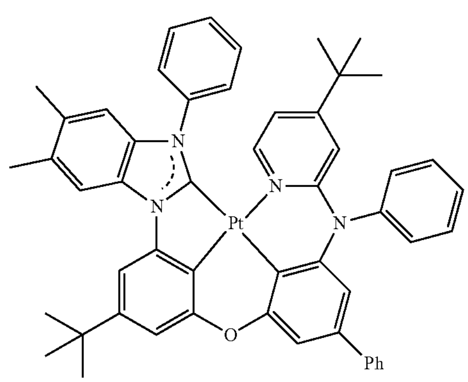

-continued
71
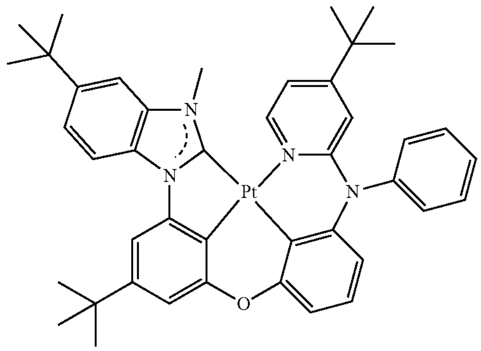
72
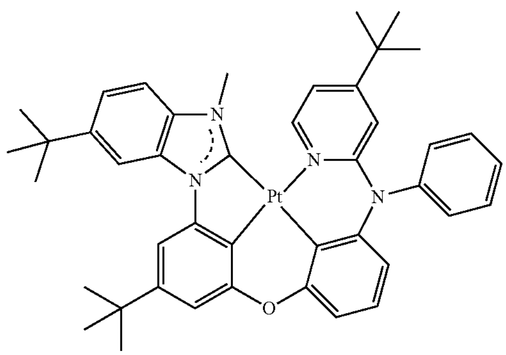
73
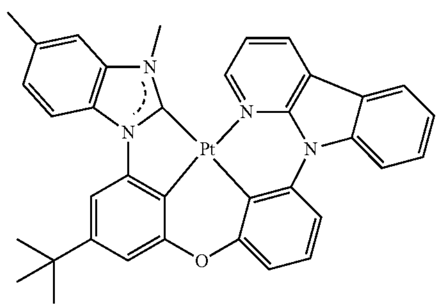
74
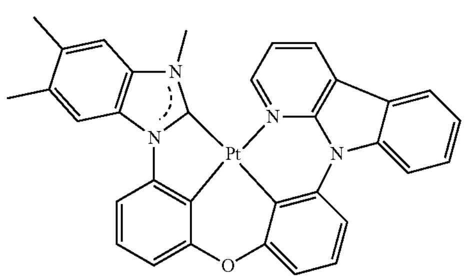
75
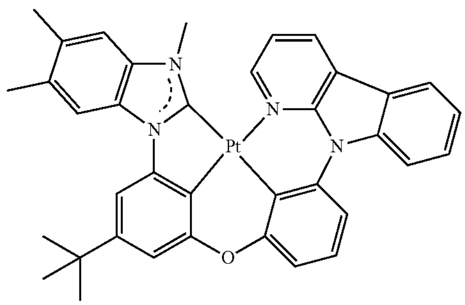
-continued
76
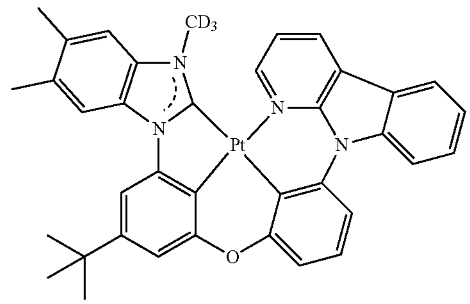
77
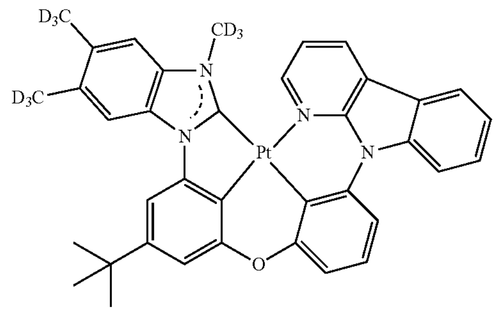
78
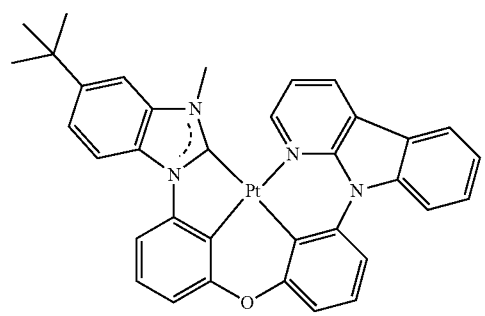
79
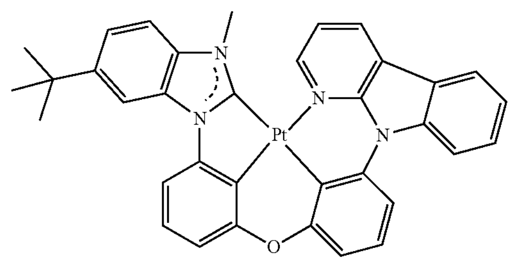
89
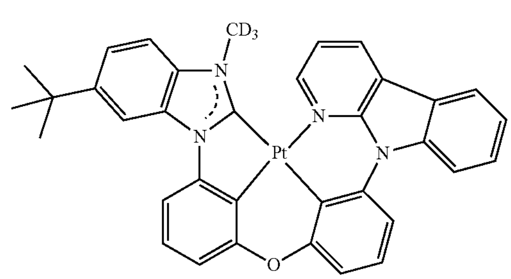

-continued
81
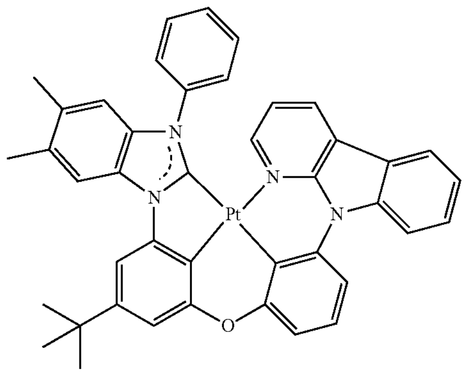
82
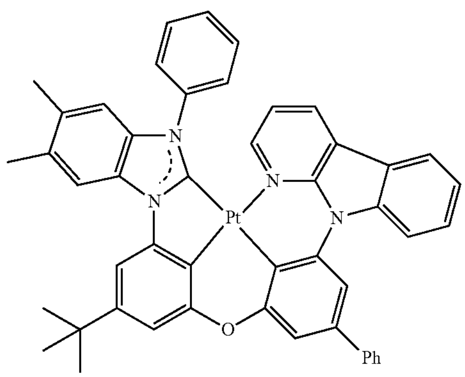
83
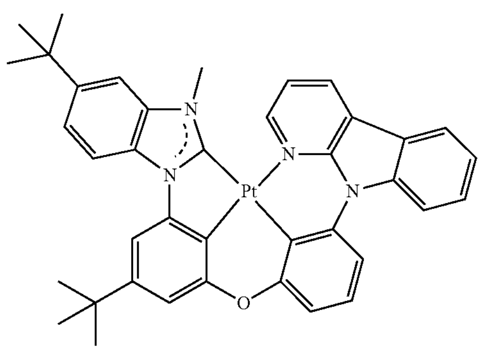
84
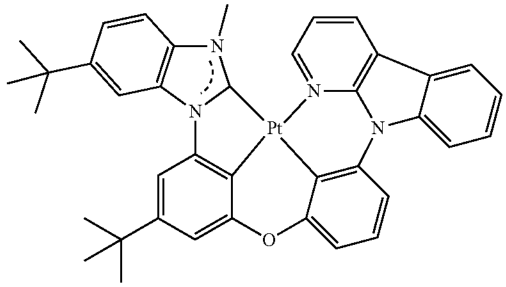
-continued
85
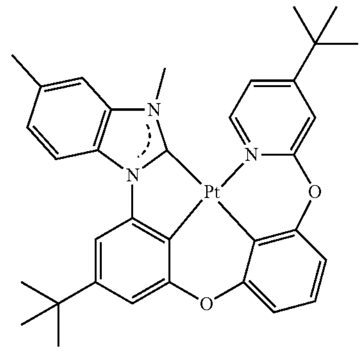
86
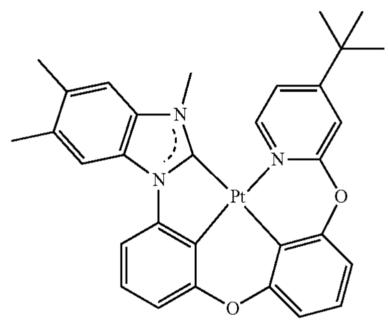
87
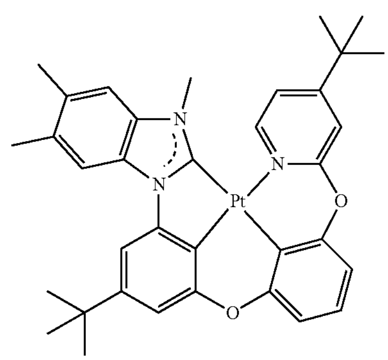
88
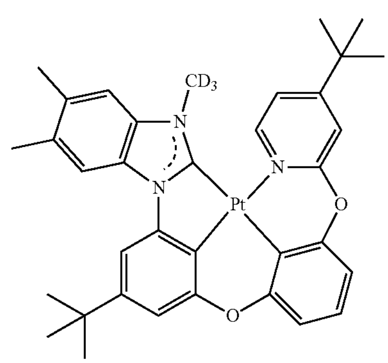

-continued
89
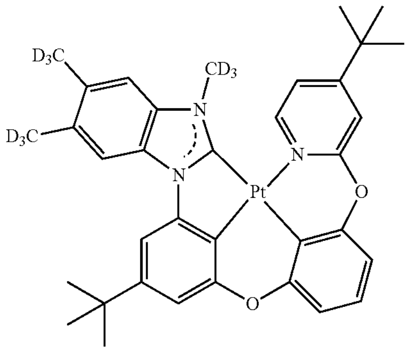
90
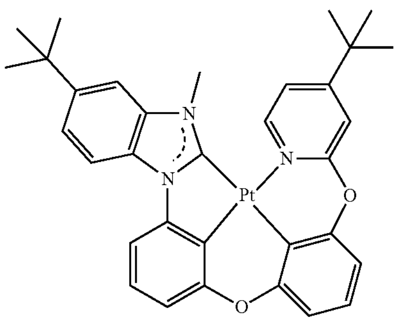
91
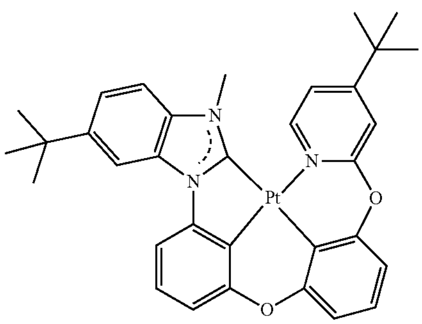
92
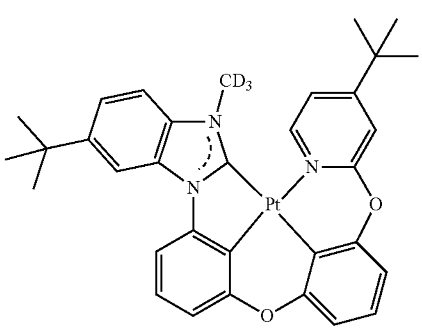
-continued
93
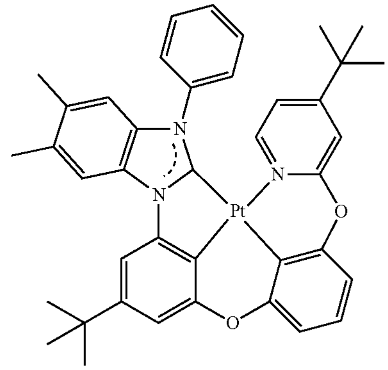
94
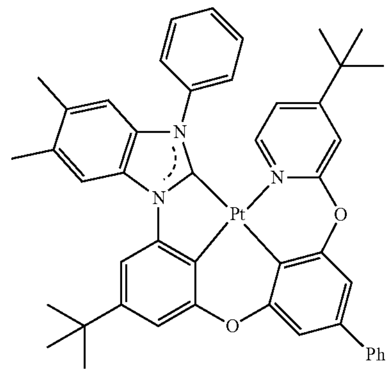
95
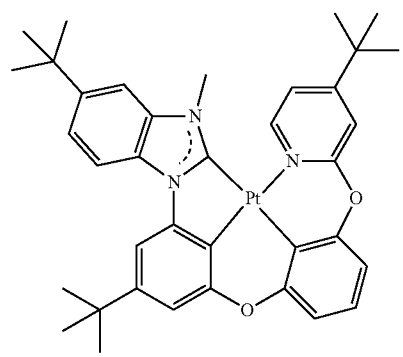
96
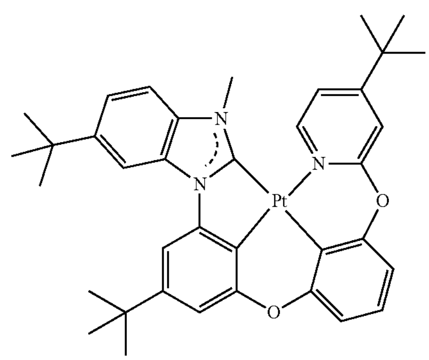

-continued
97
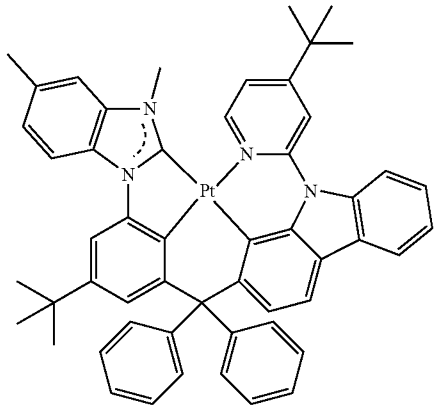
98
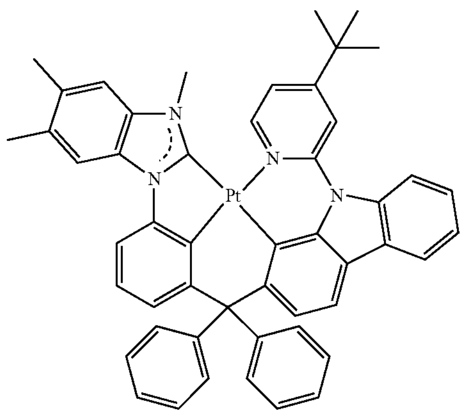
99
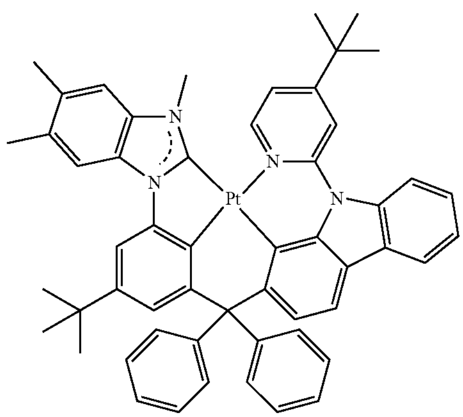
100
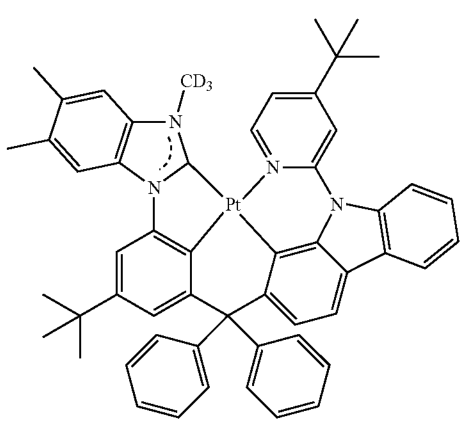
-continued
101
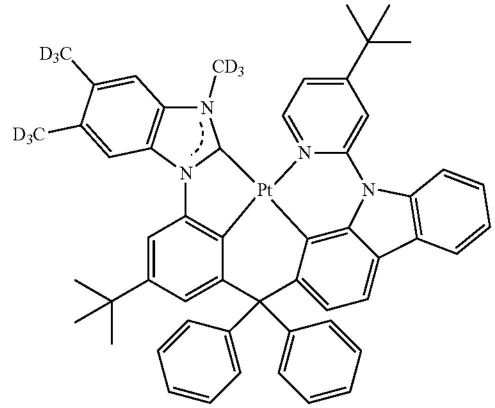
102
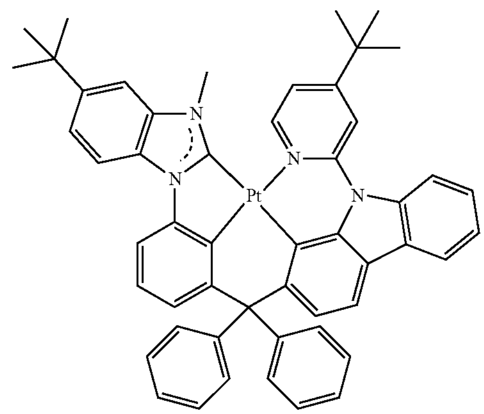
103
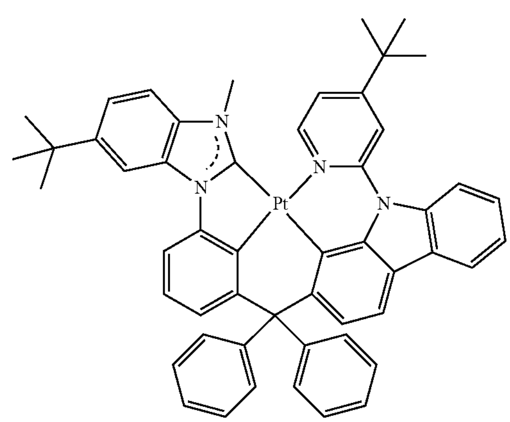

104
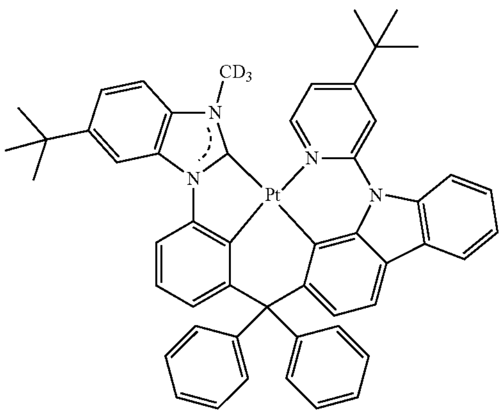
105
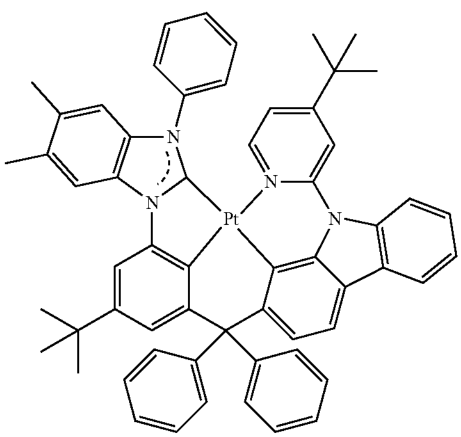
106
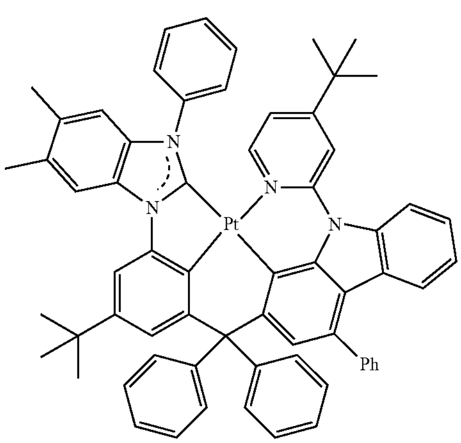
107
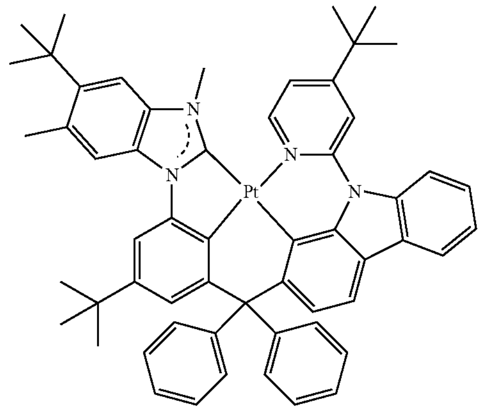
108
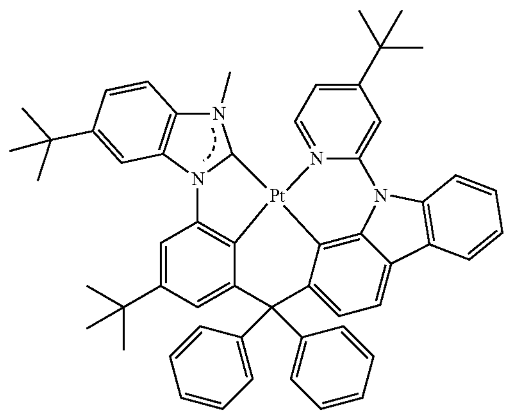
109
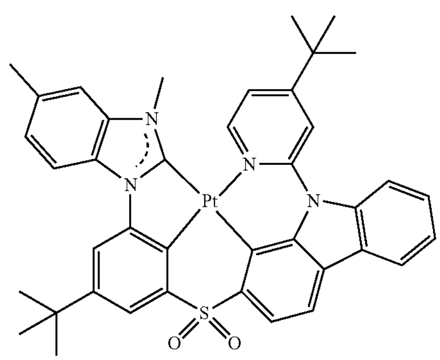
110
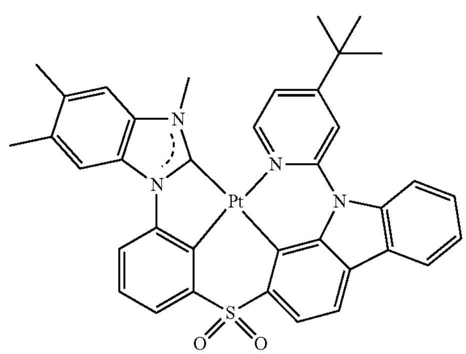

111
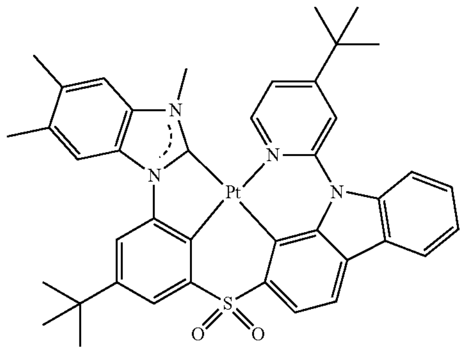
112
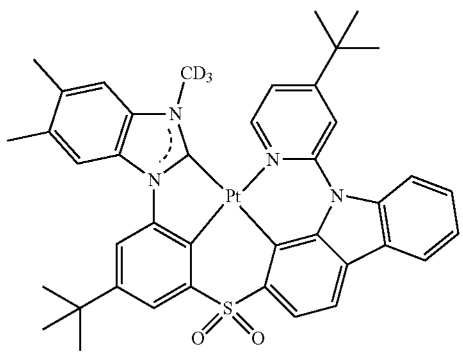
113
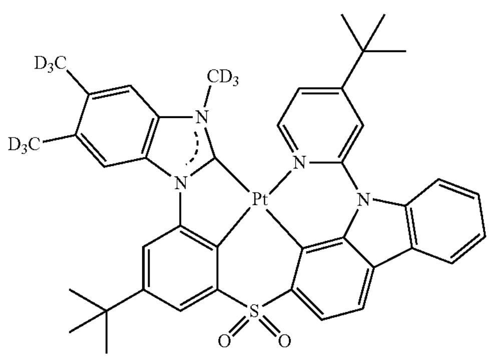
114
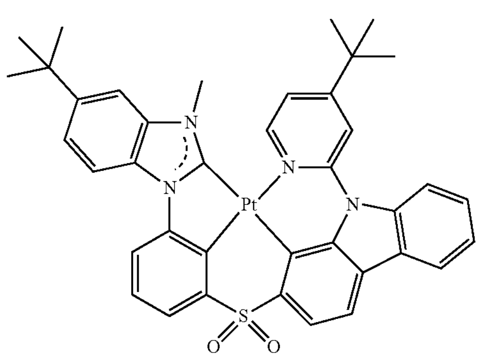
115
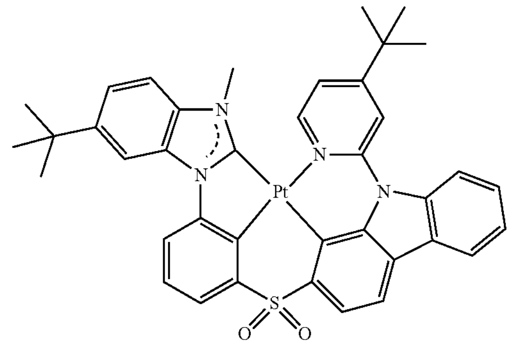
116
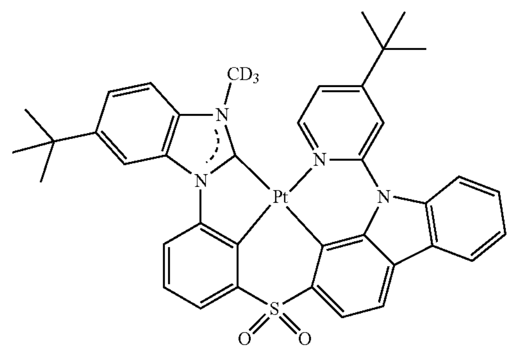
117
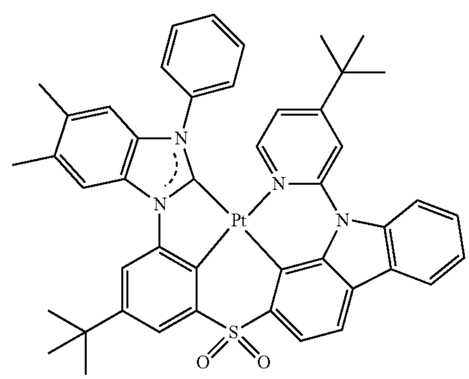
118
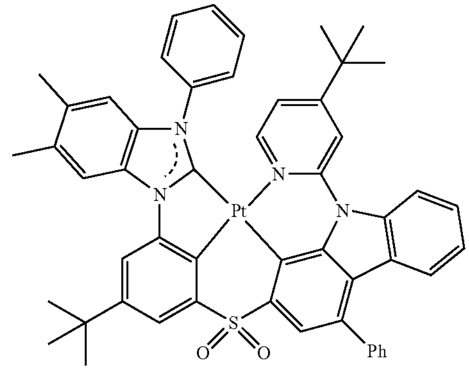

-continued
119
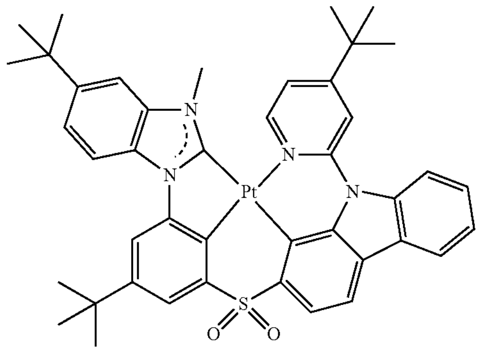
120
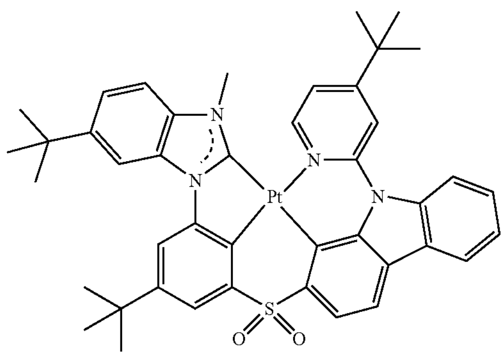
Group PD3
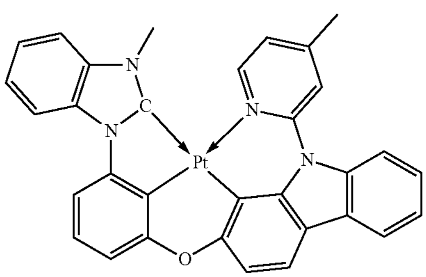
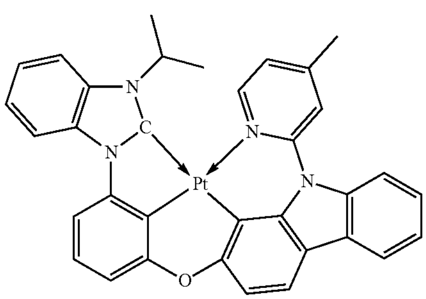
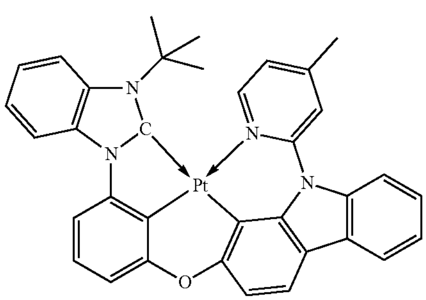
-continued
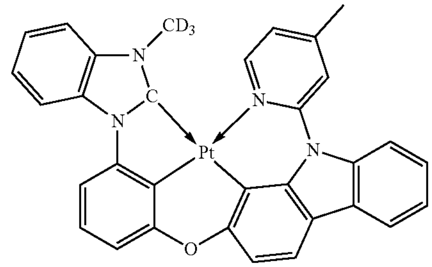
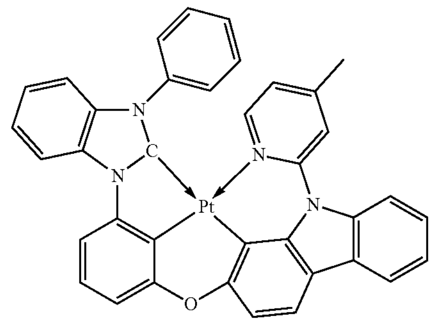
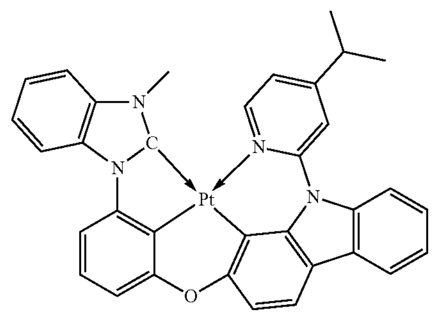
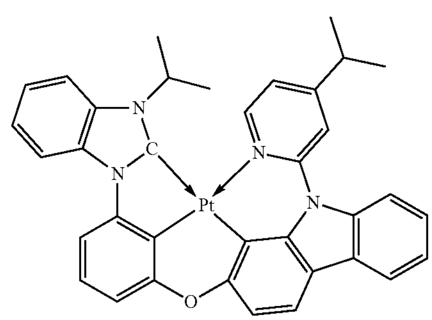
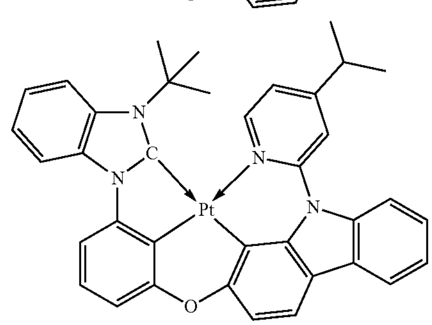

-continued
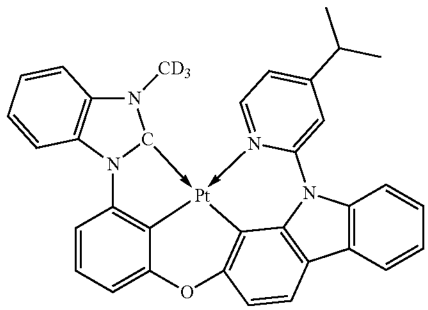
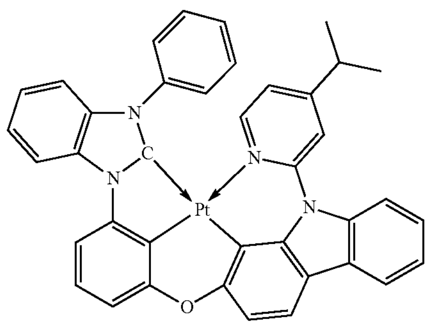
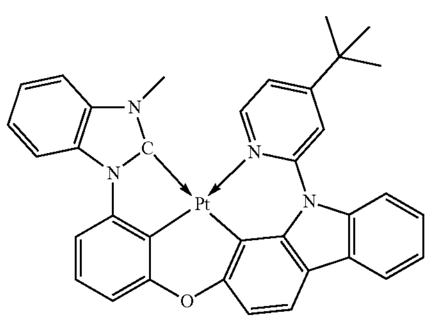
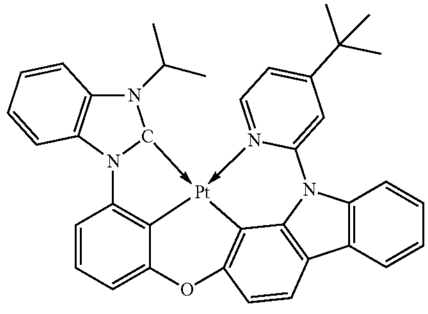
-continued
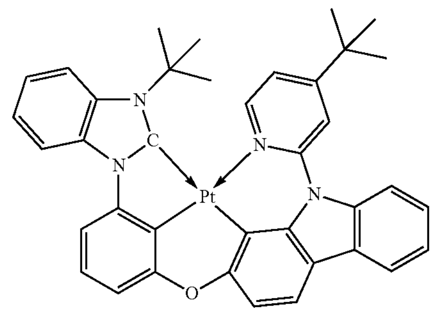
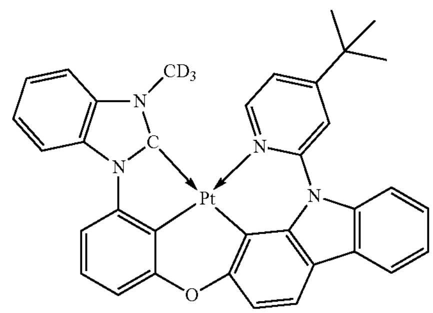
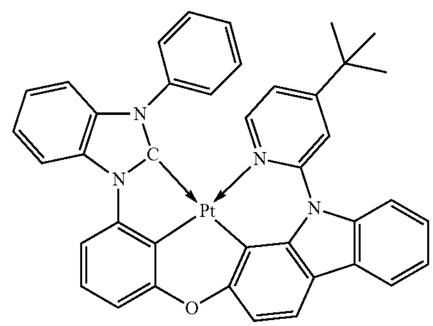
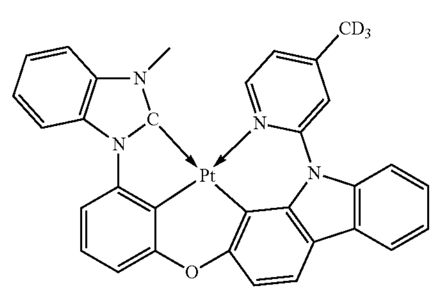
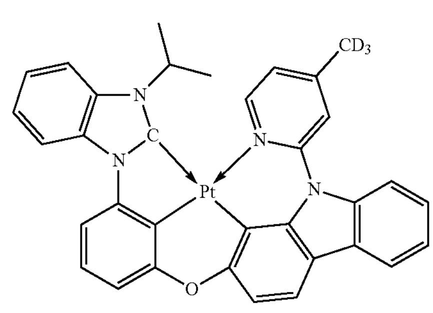

-continued
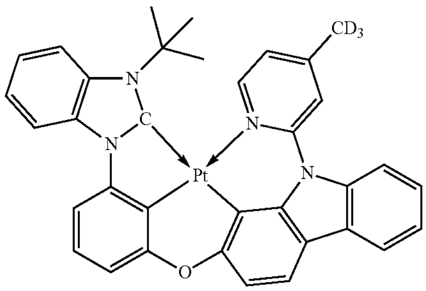
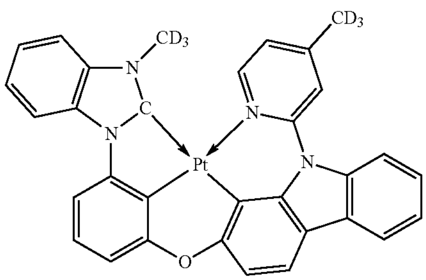
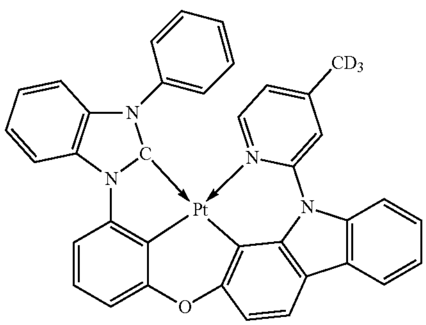
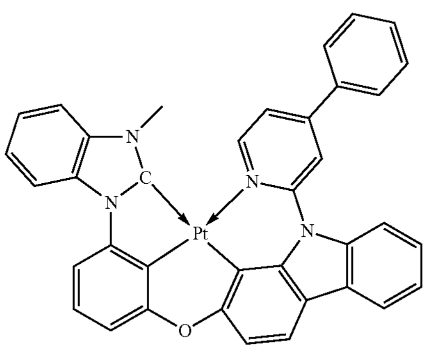
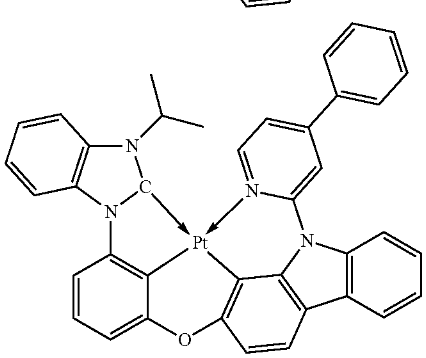
-continued
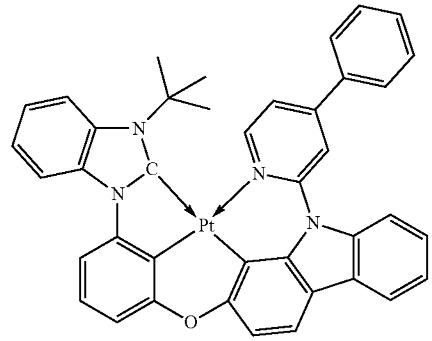
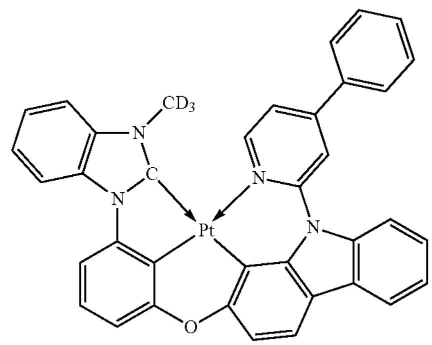
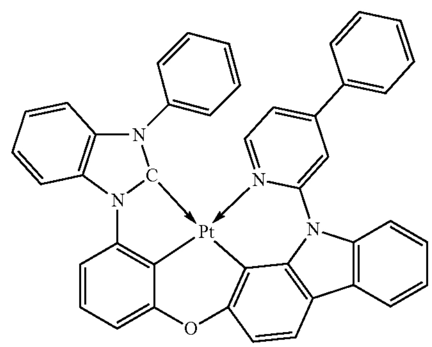
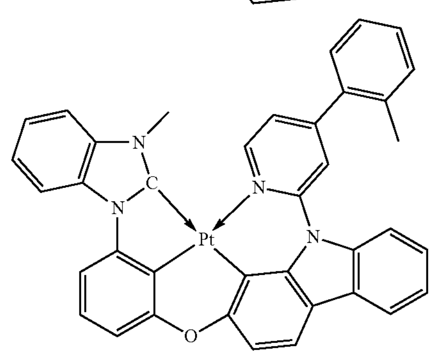
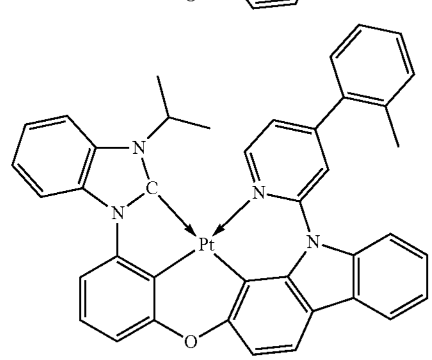

-continued
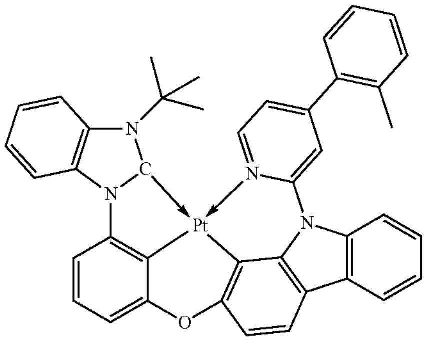
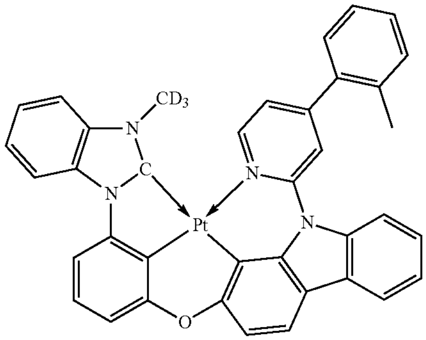
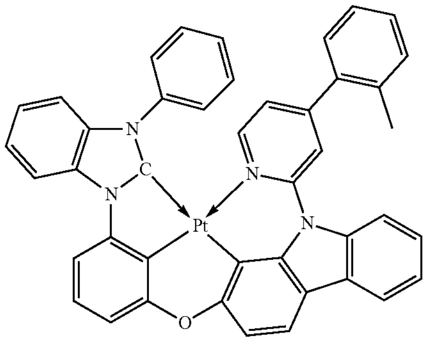
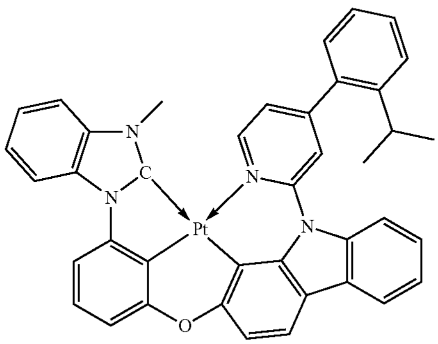
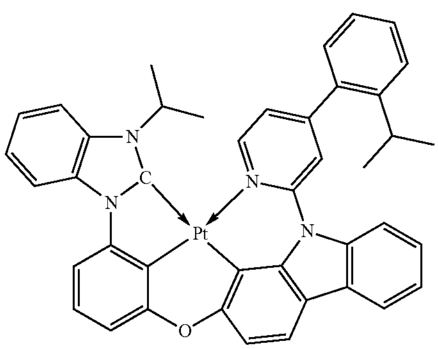
-continued
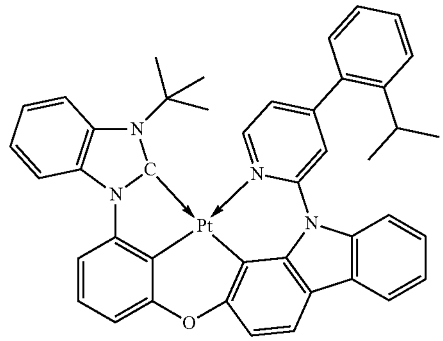
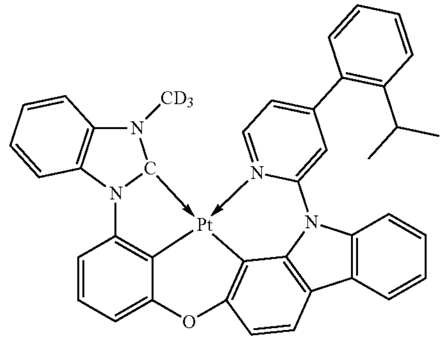
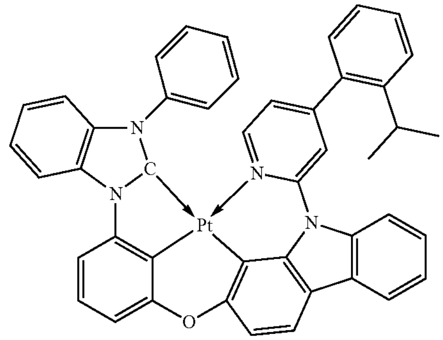
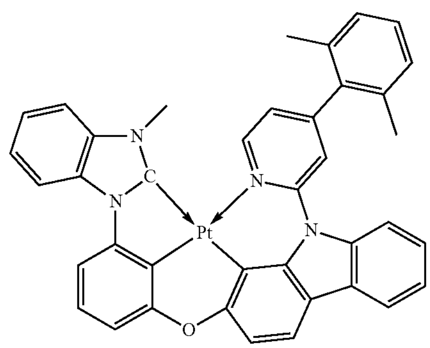
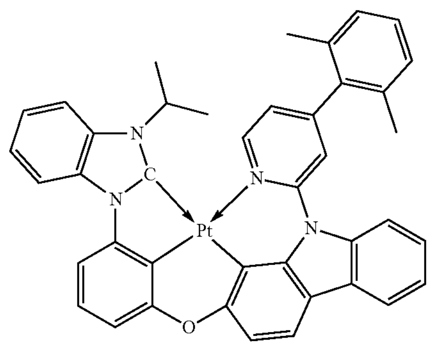

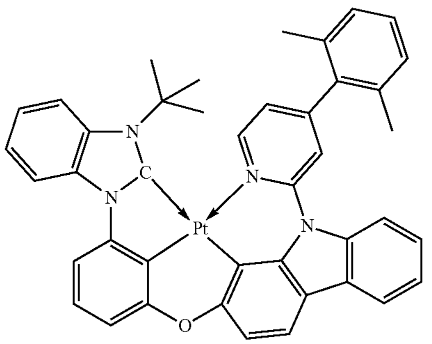
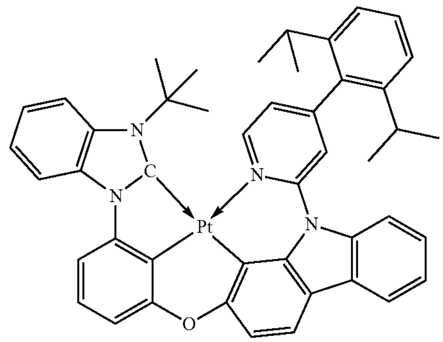
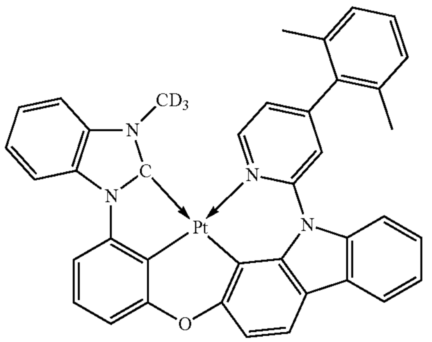
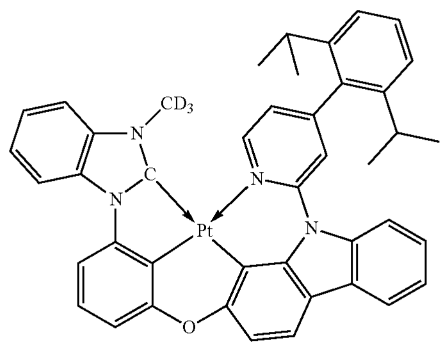
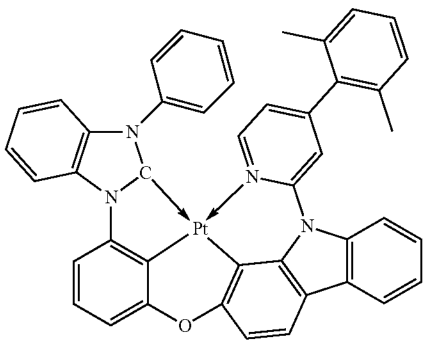
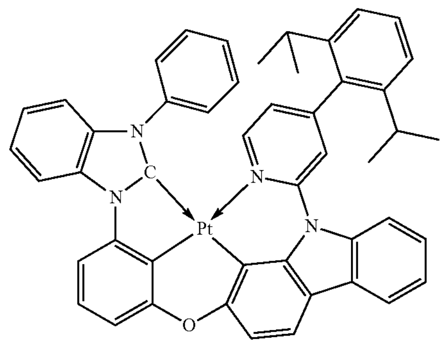
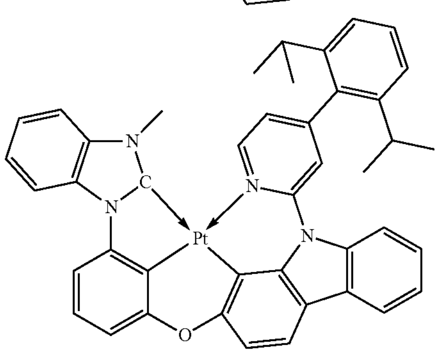
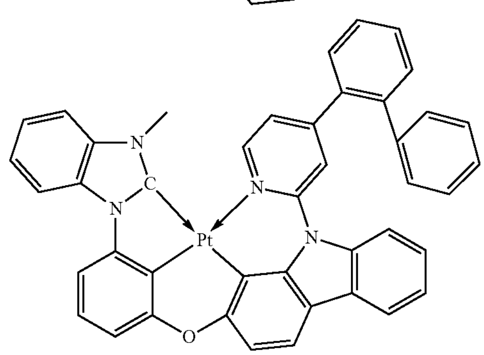
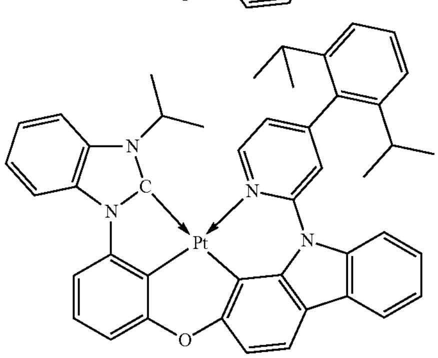
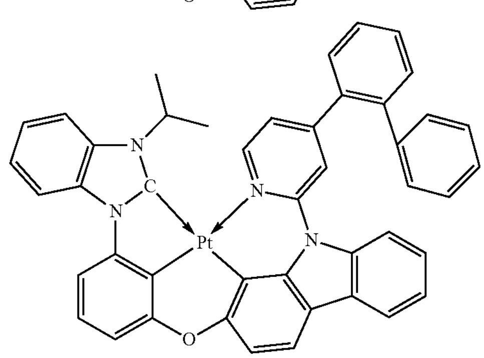

-continued
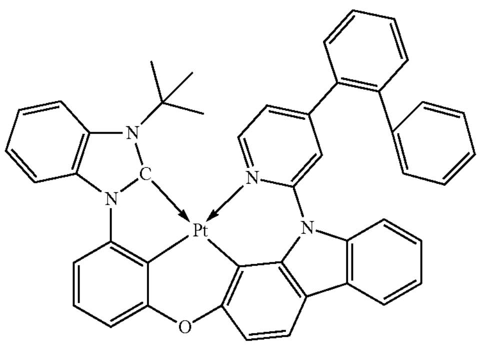
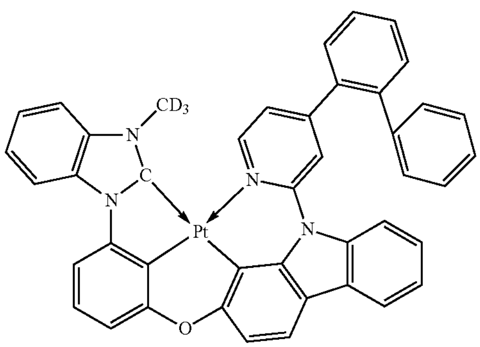
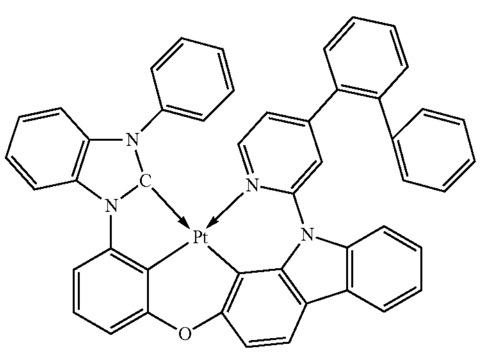
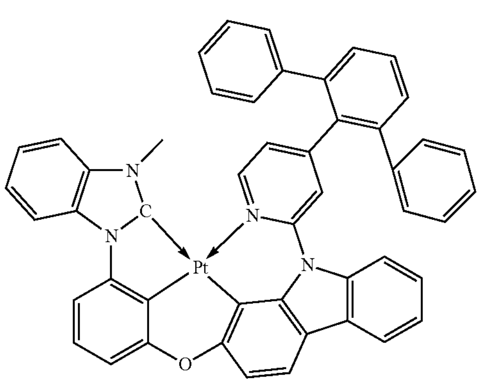
-continued
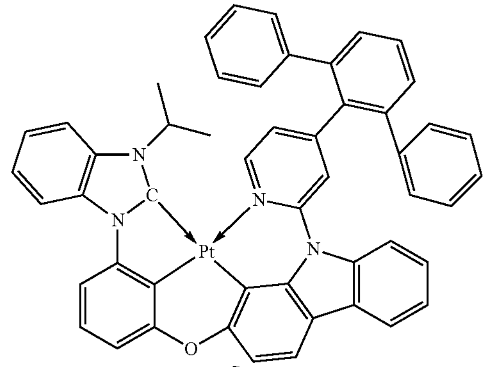
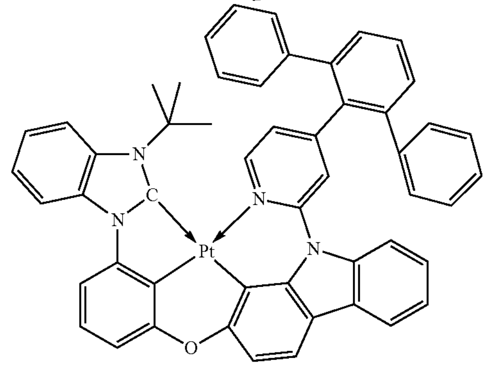
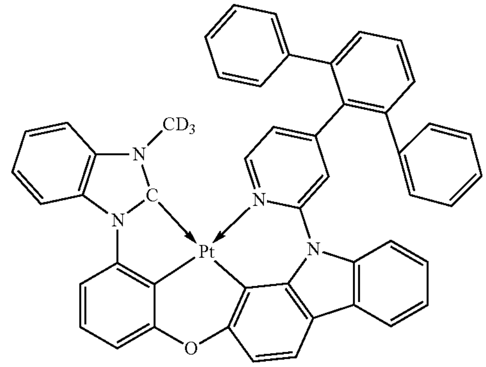
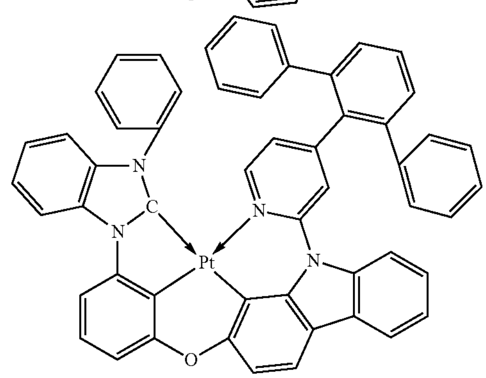
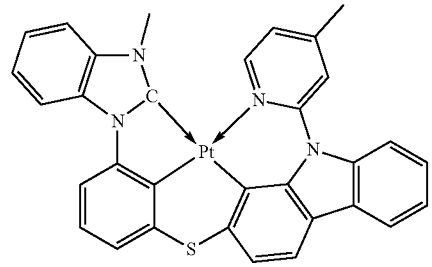

-continued
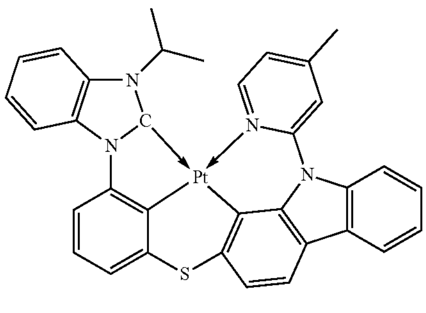
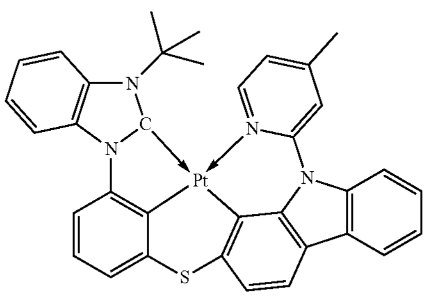
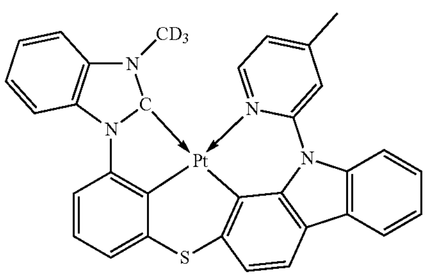
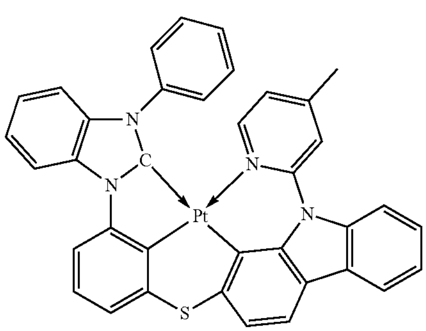
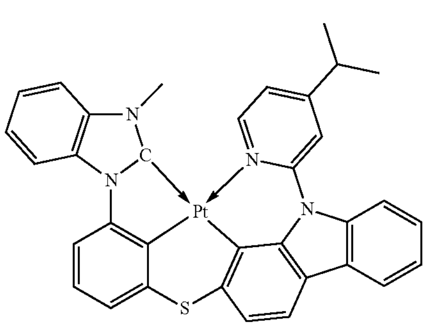
-continued
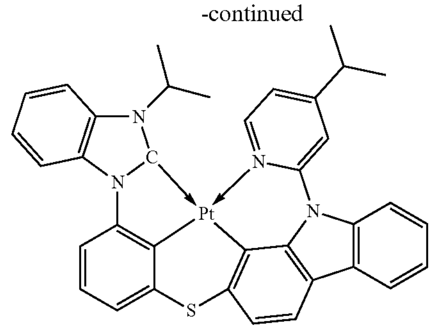
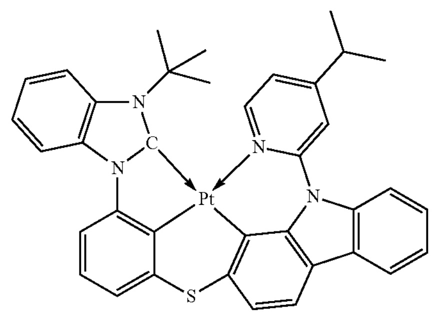
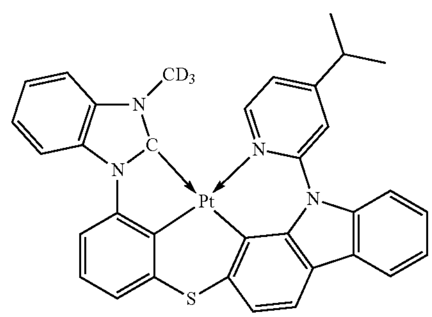
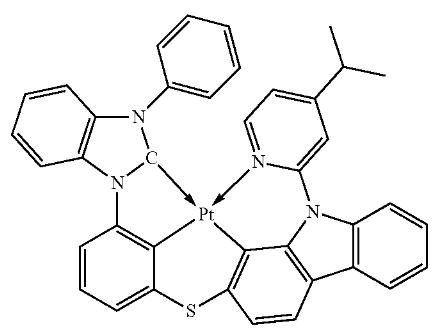
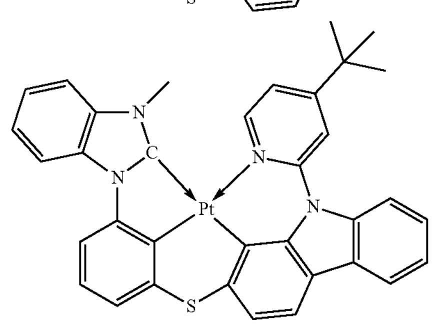

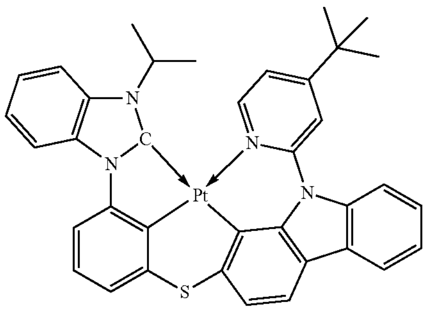
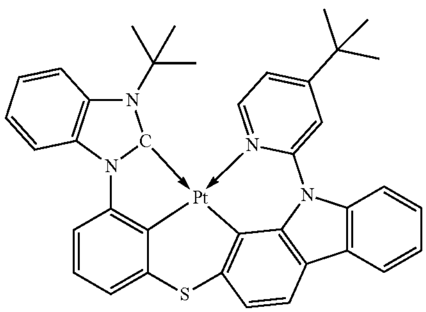
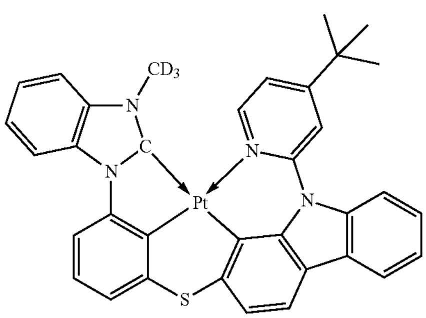
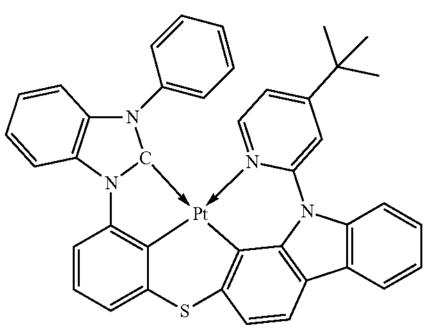
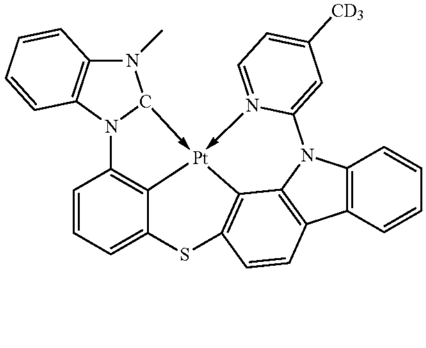
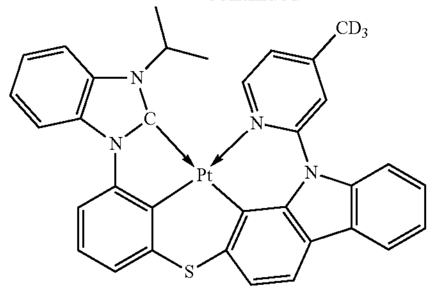
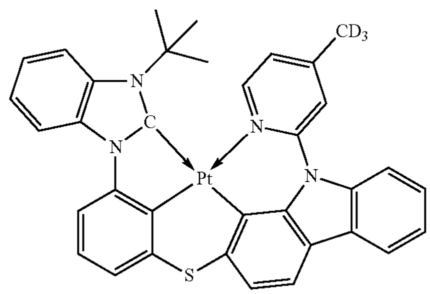
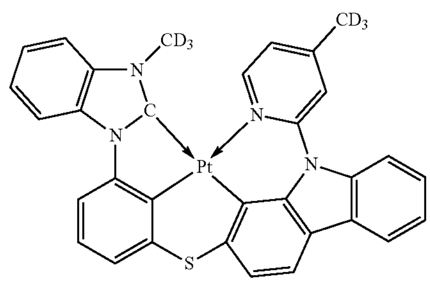
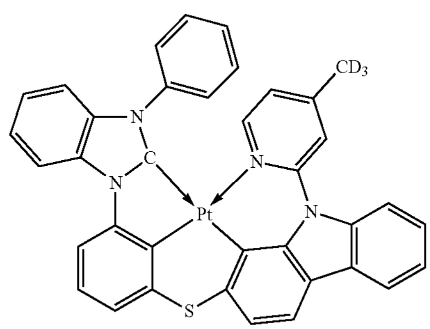
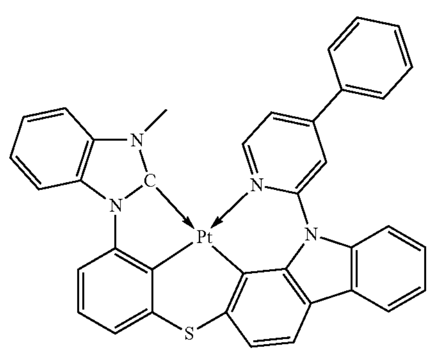

-continued
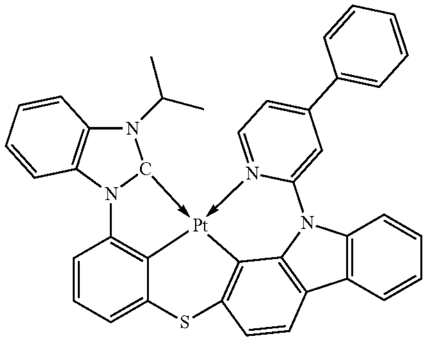
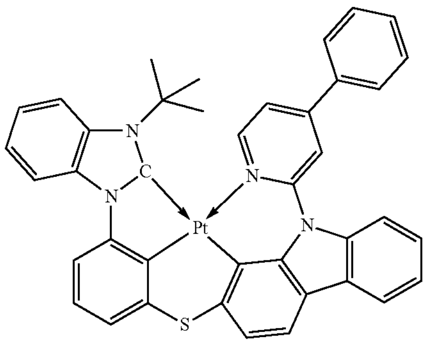
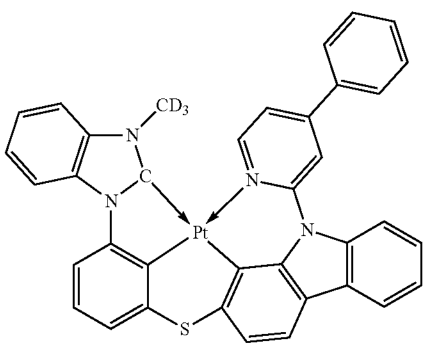
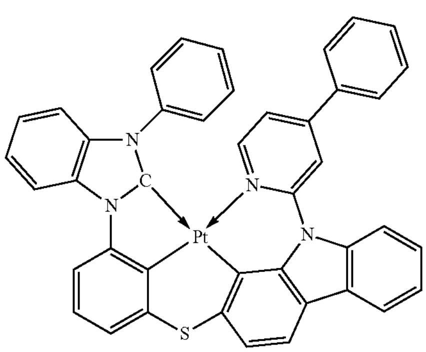
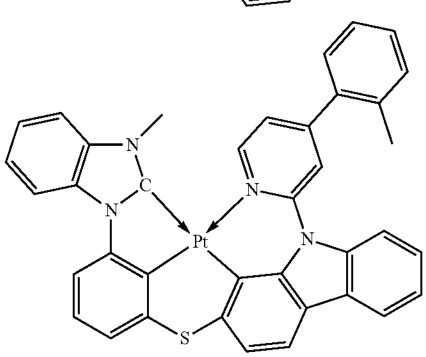
-continued
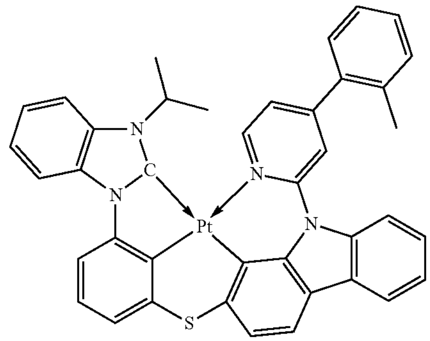
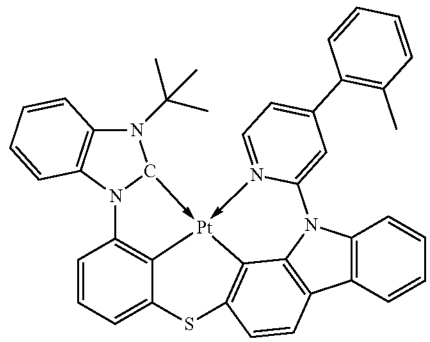
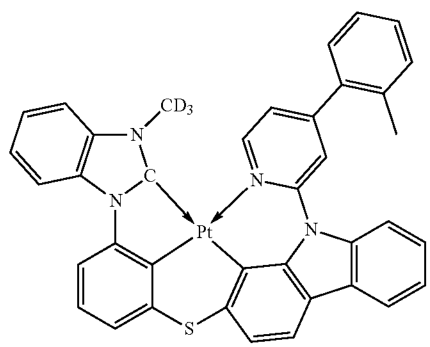
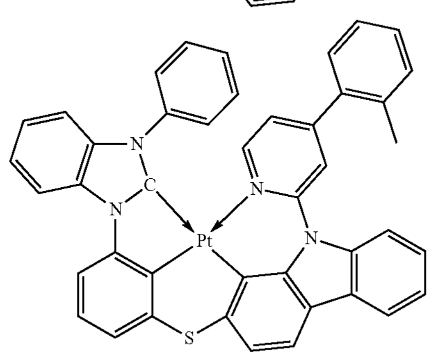
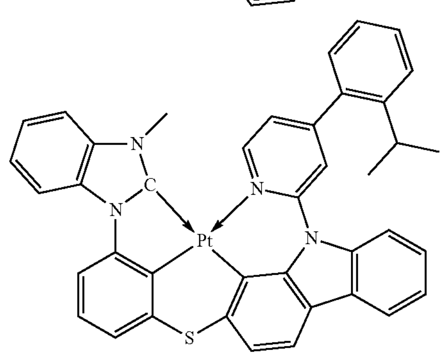

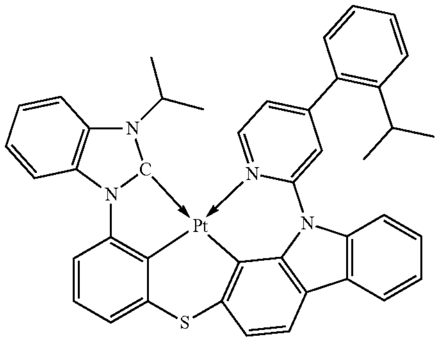
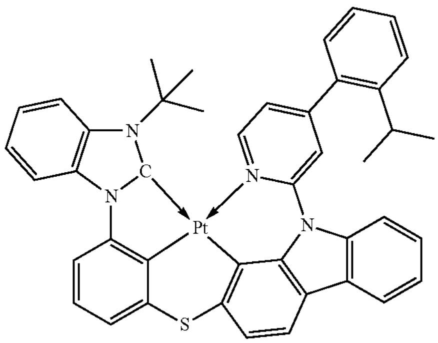
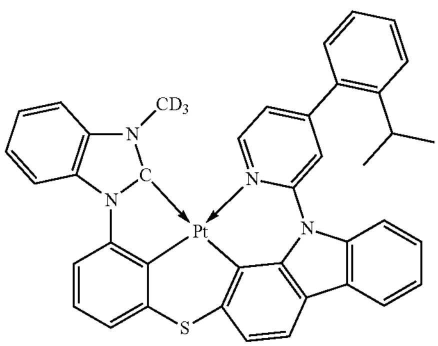
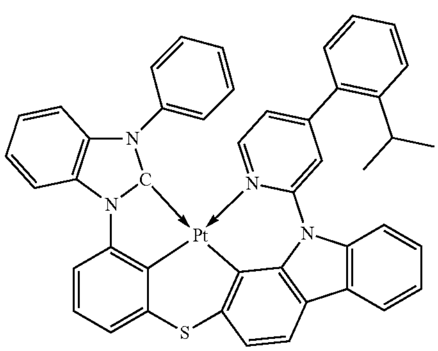
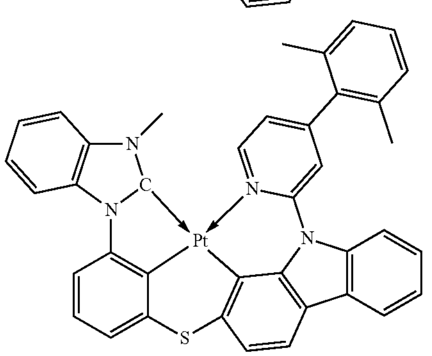
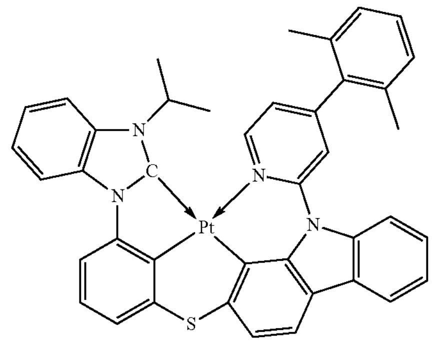
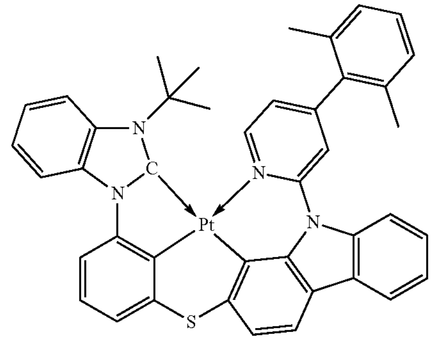
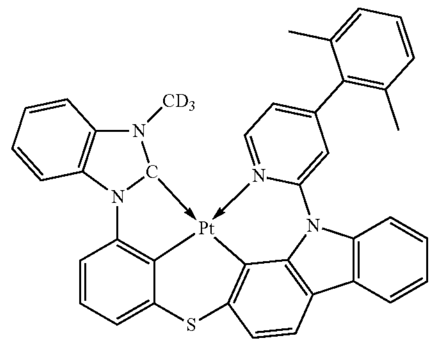
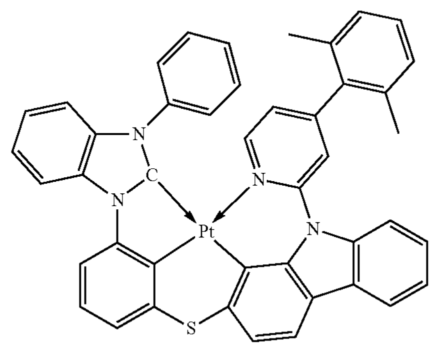
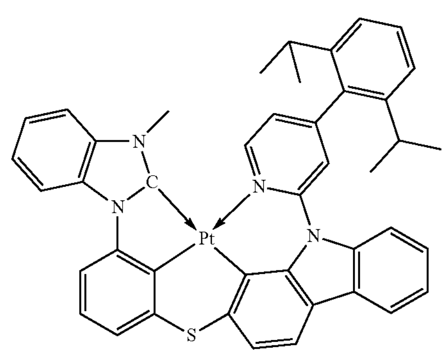

-continued
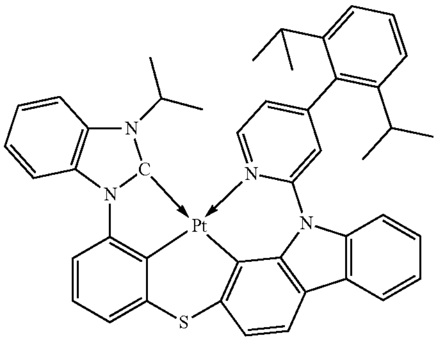
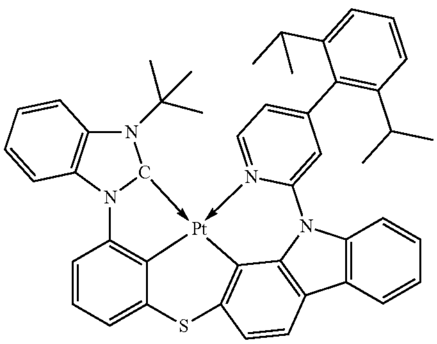
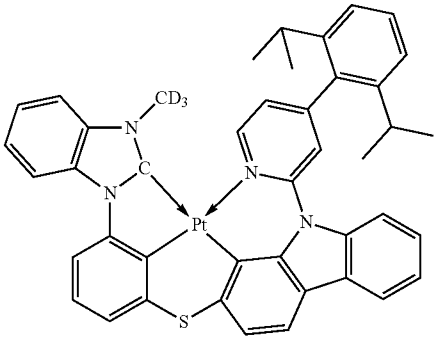
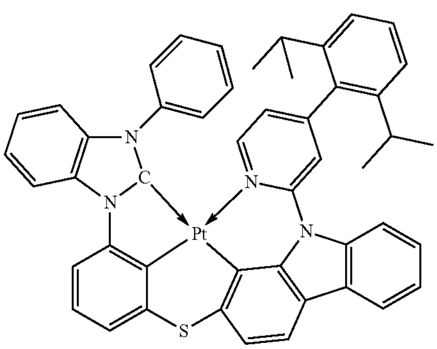
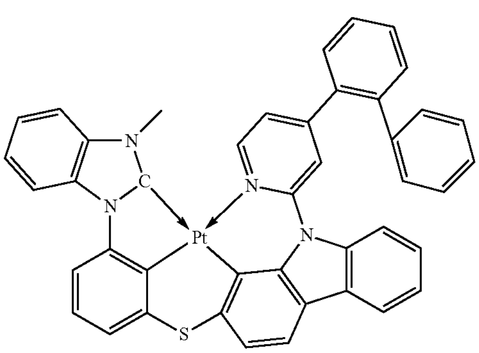
-continued
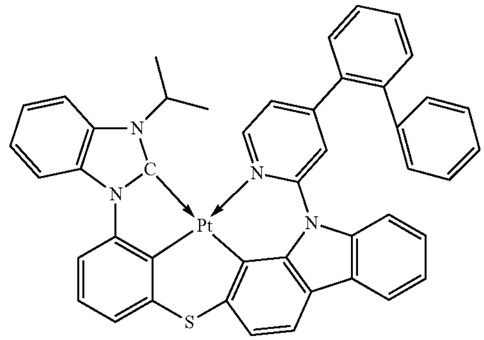
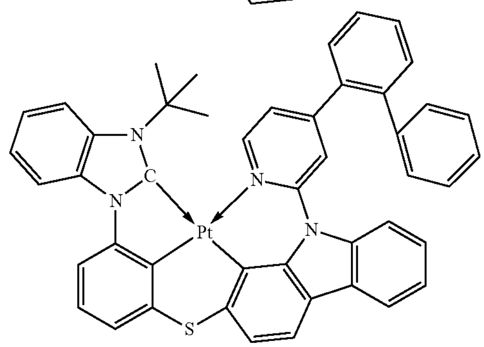
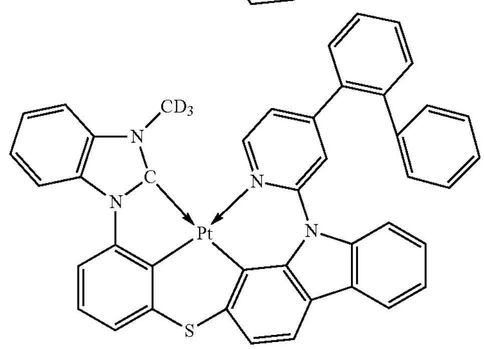
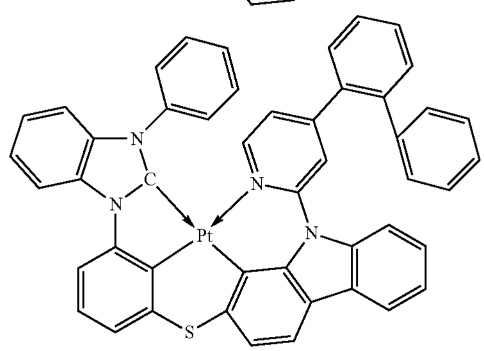
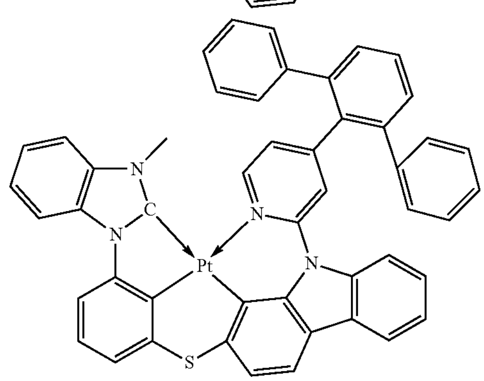

-continued
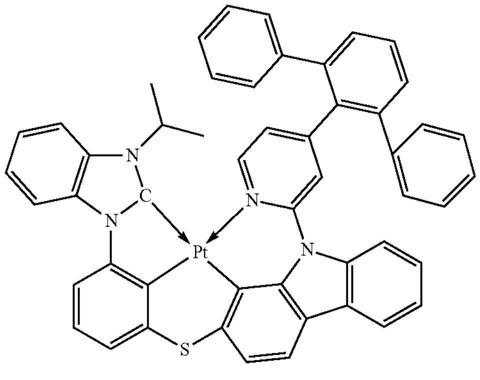
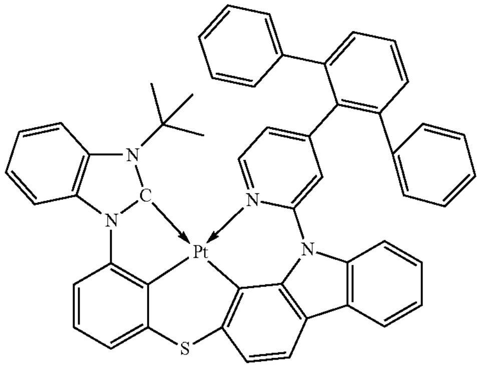
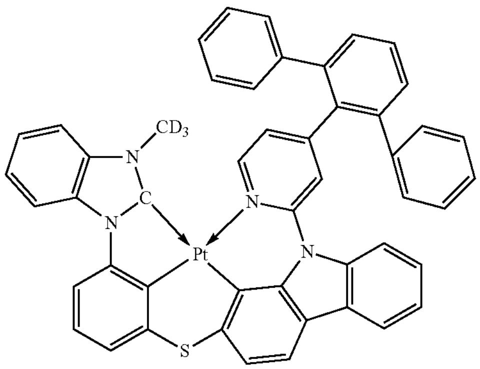
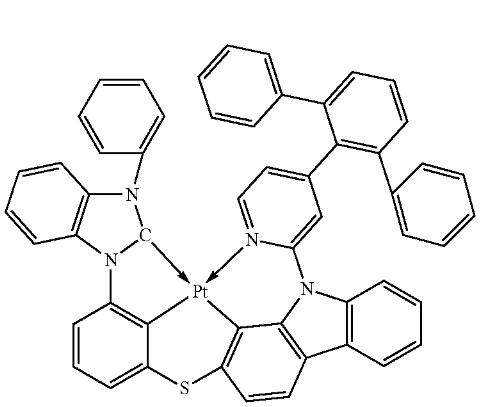
-continued
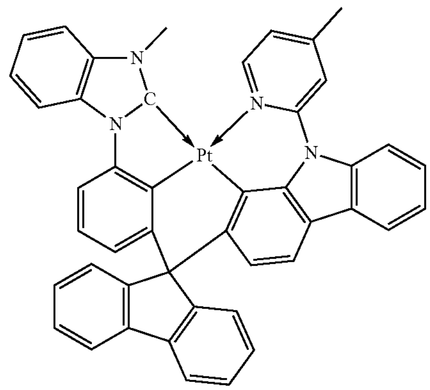
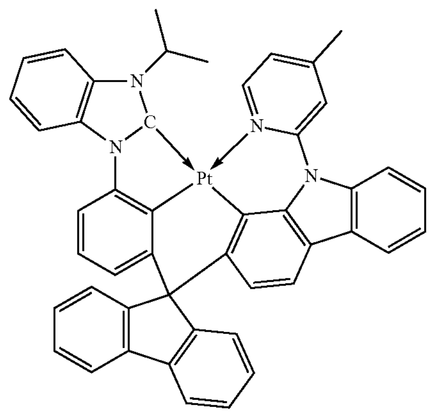
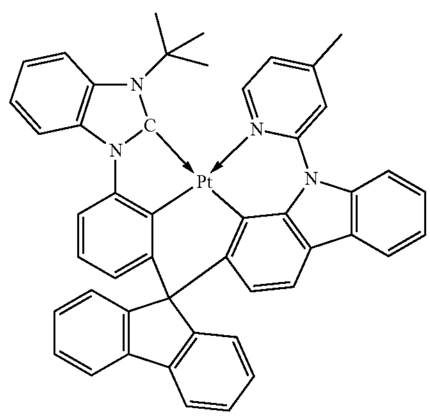
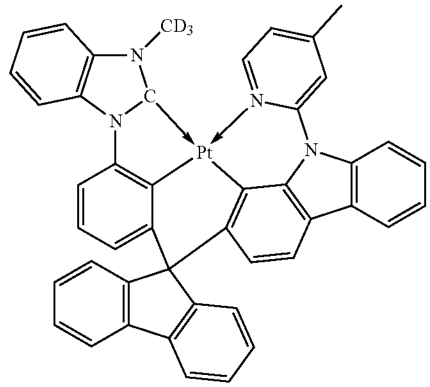

-continued
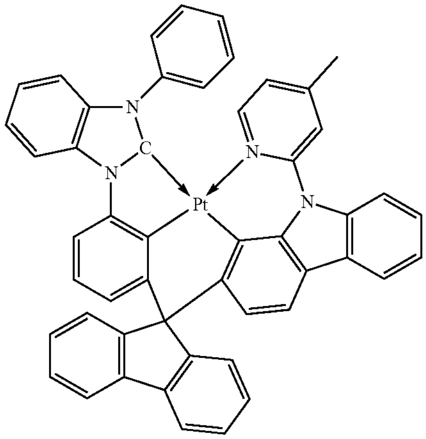
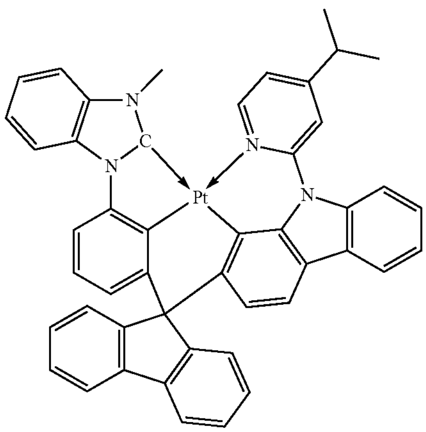
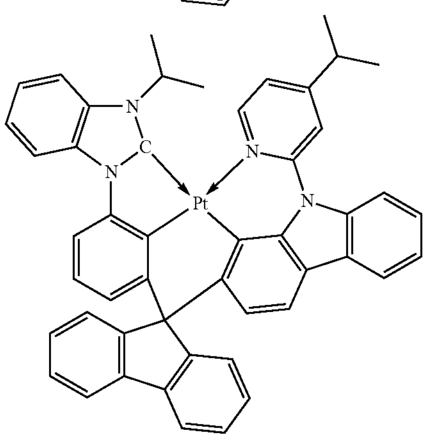
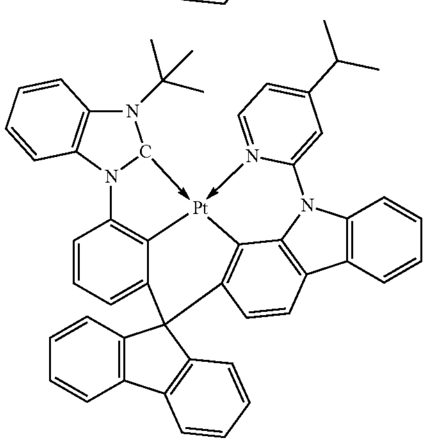
-continued
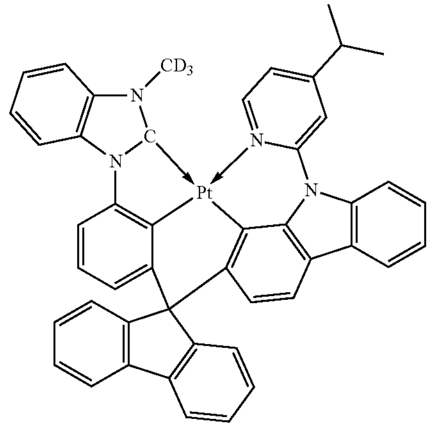
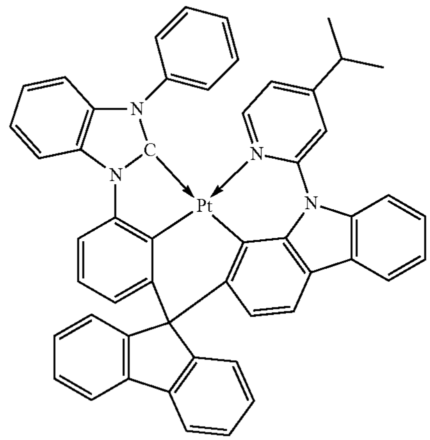
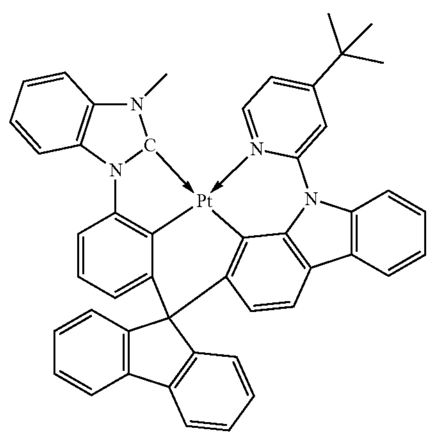
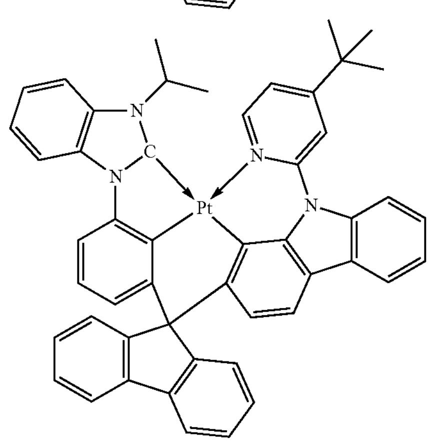

-continued
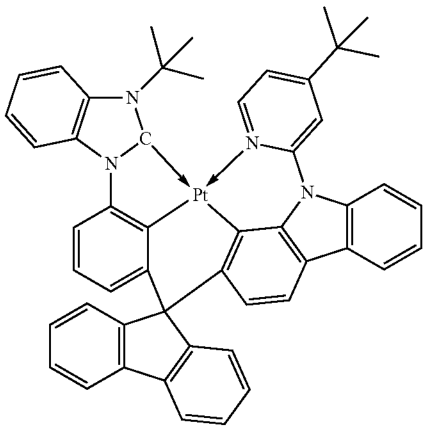
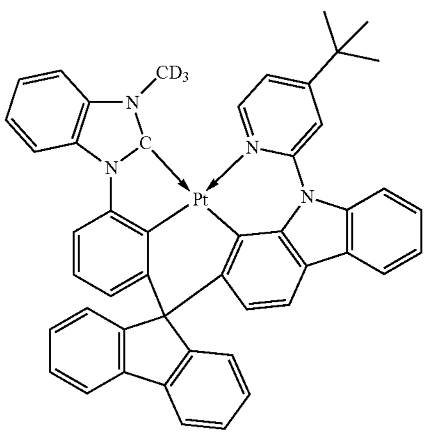
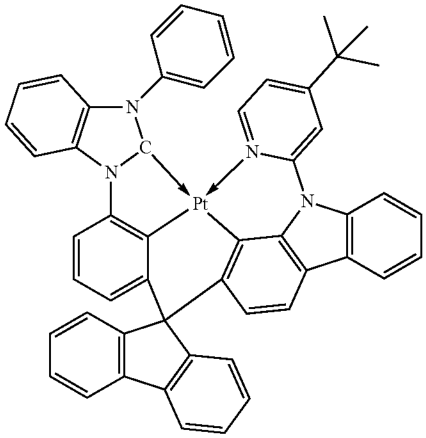
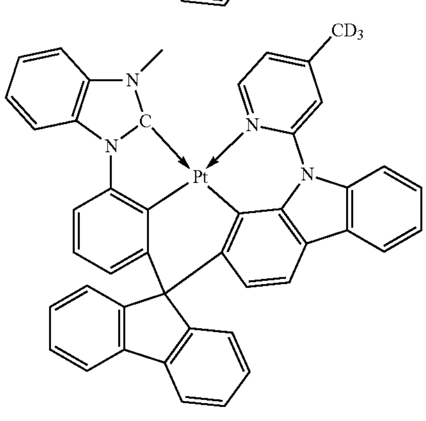
-continued
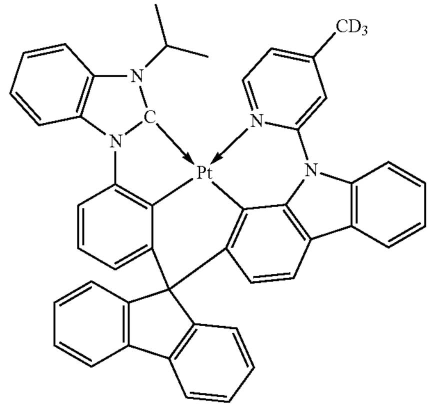
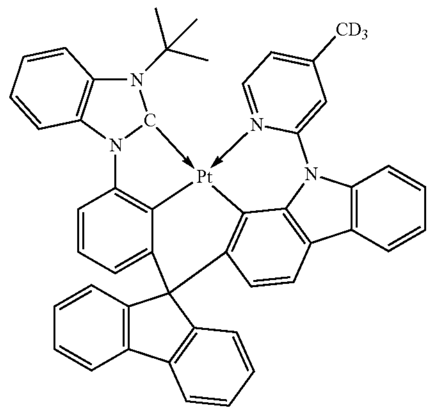
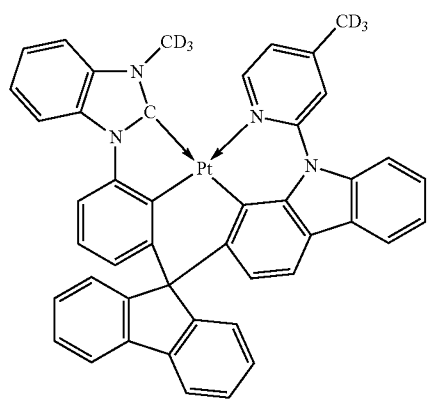
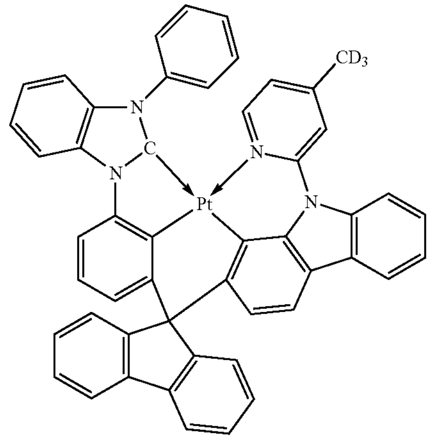

-continued
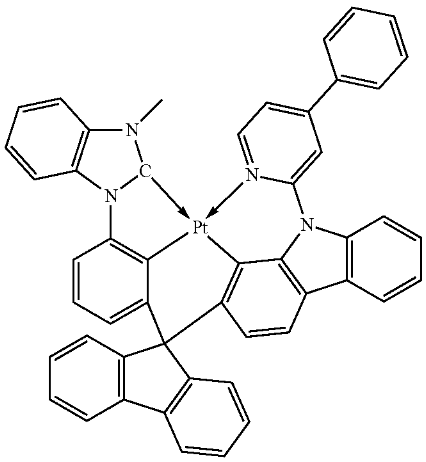
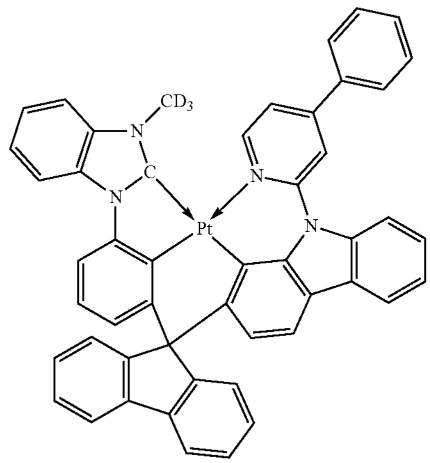
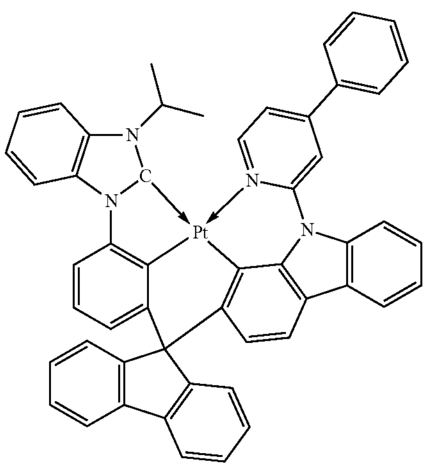
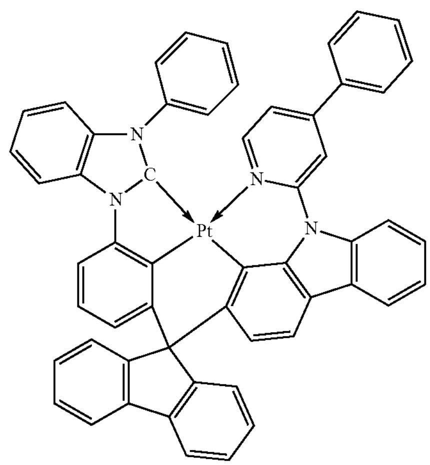
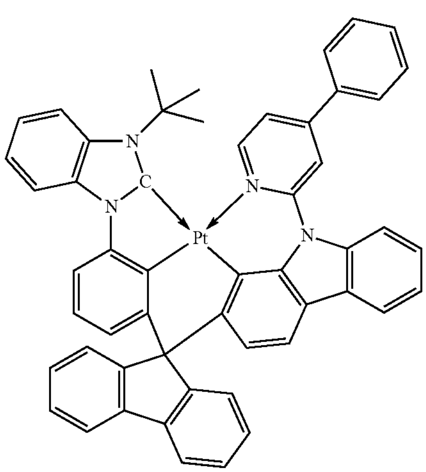
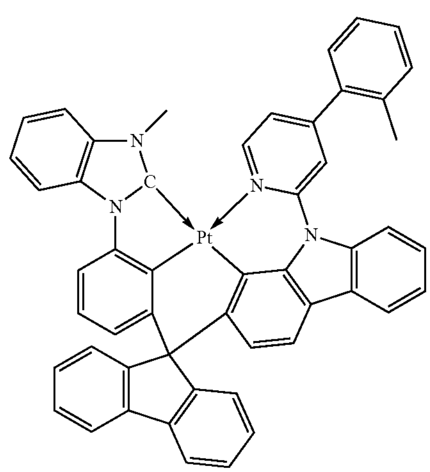

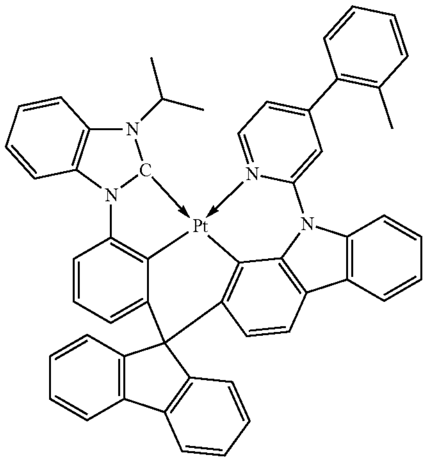
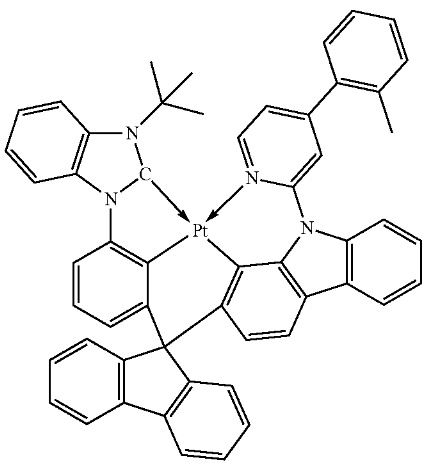
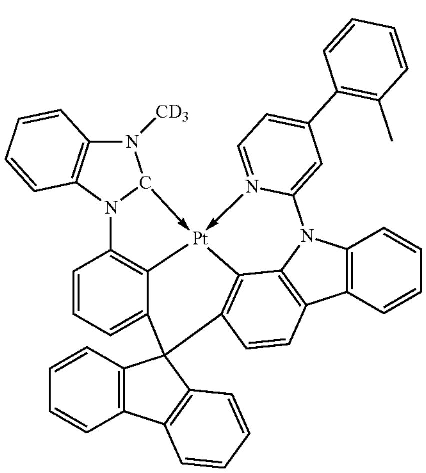
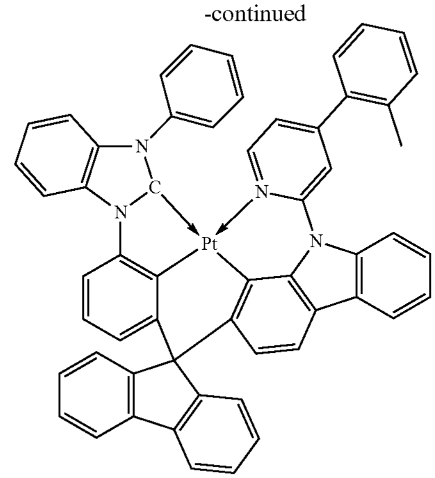
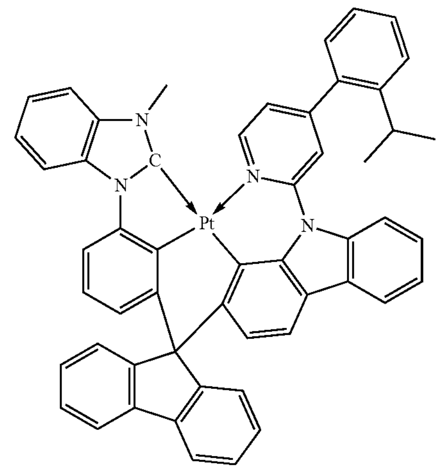
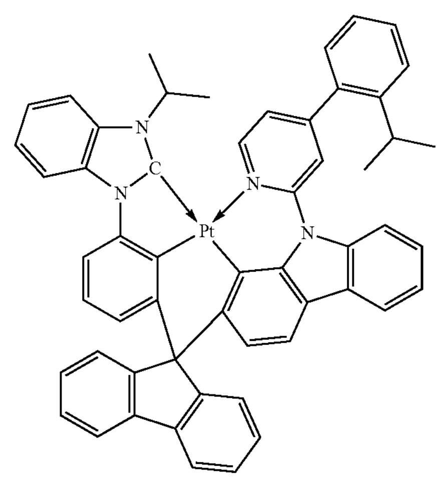

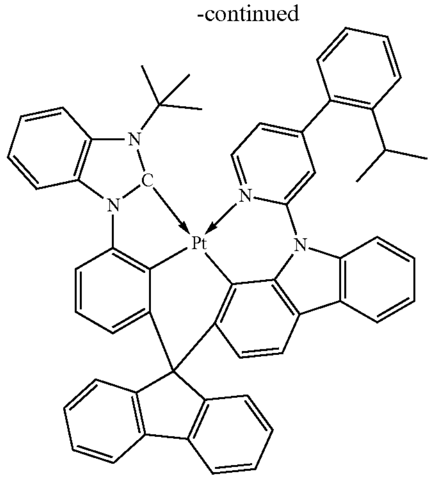
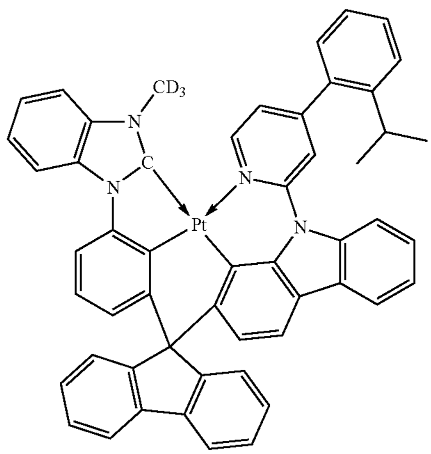
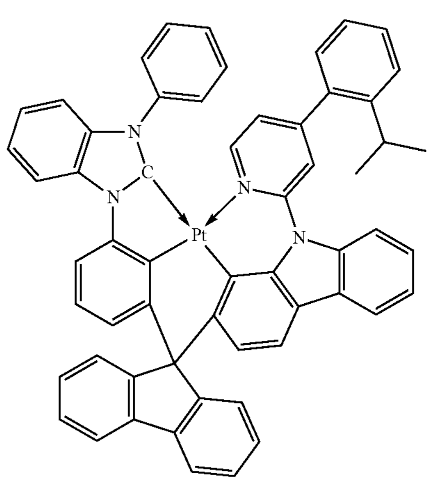
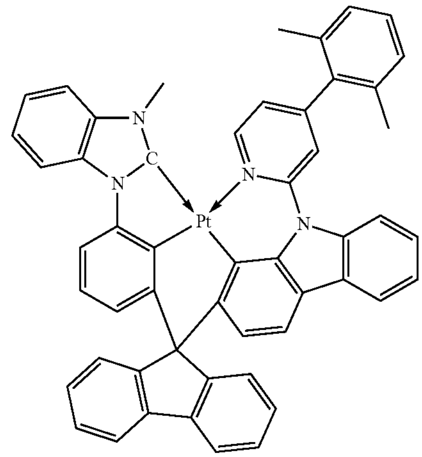
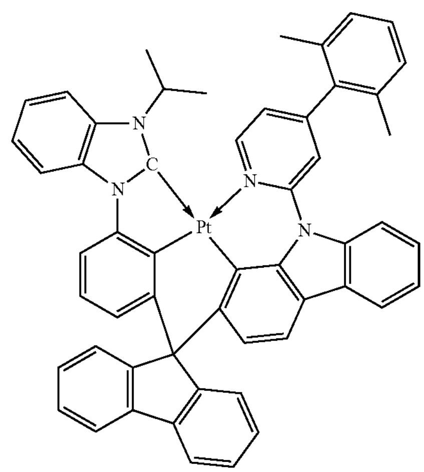
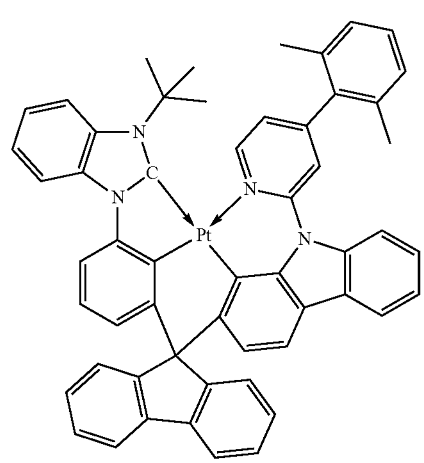

-continued
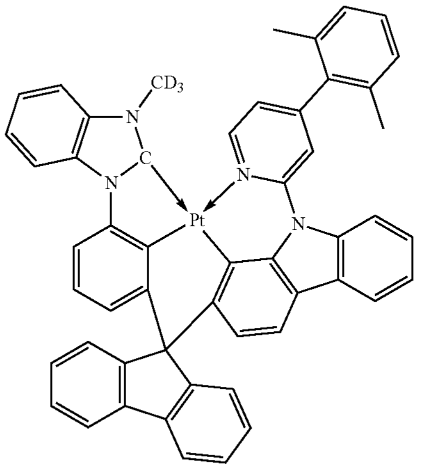
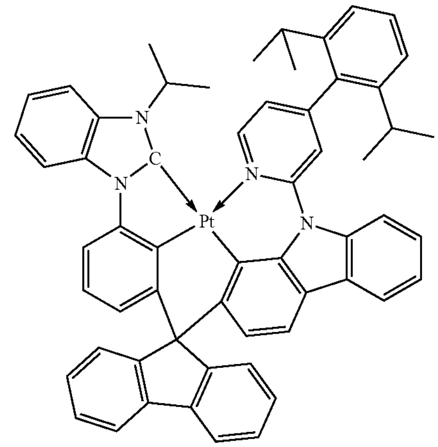
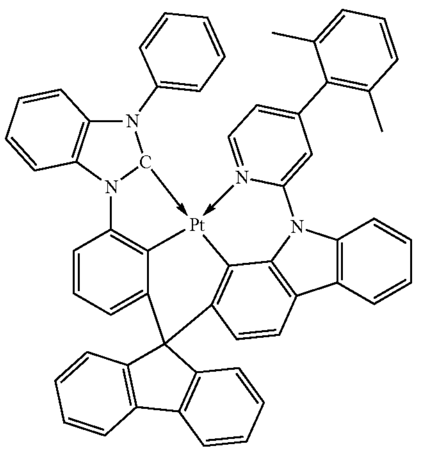
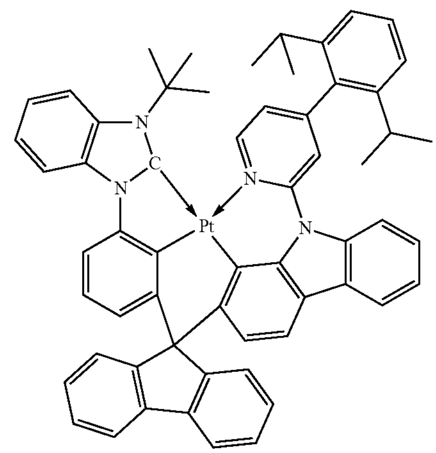
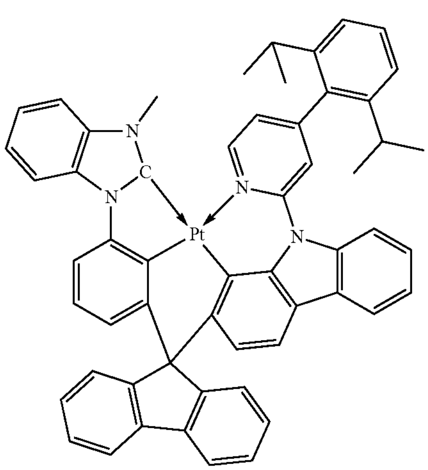
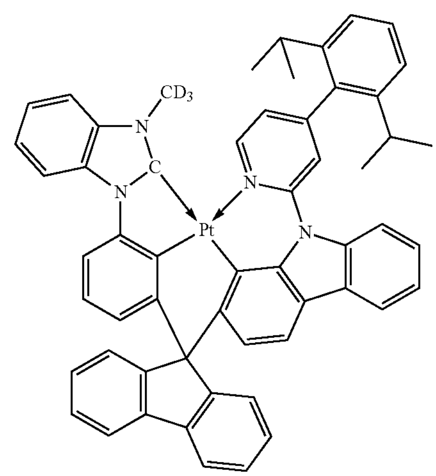

-continued
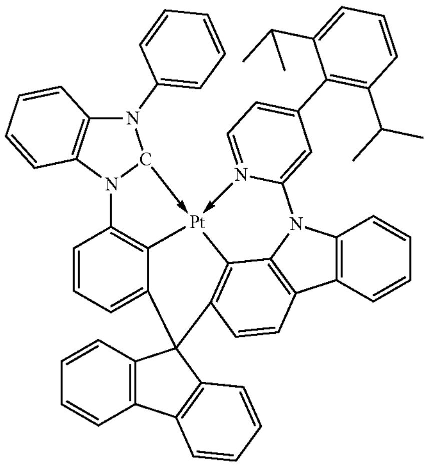
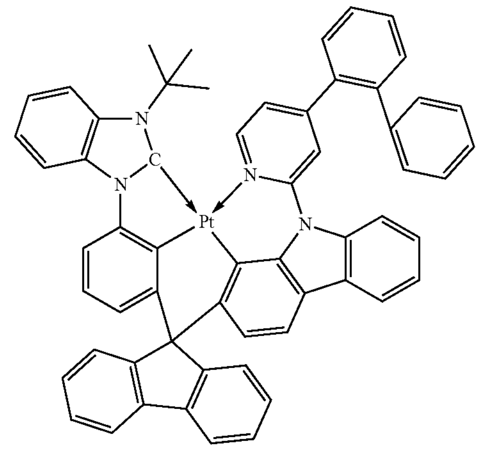
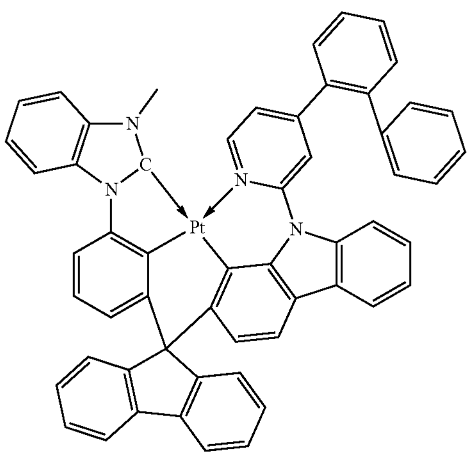
-continued
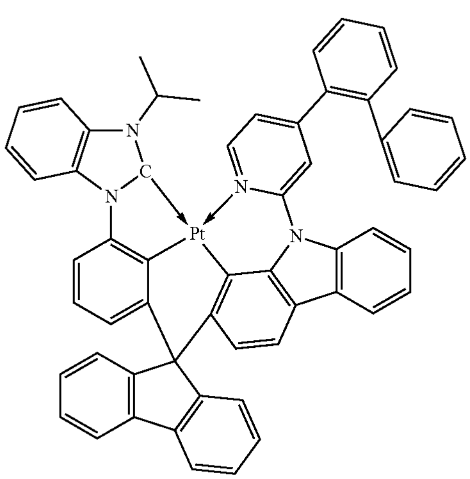
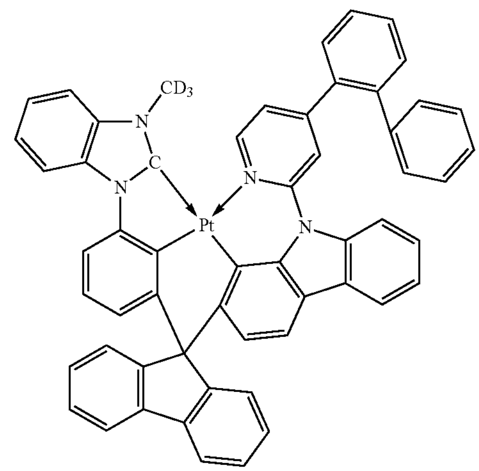
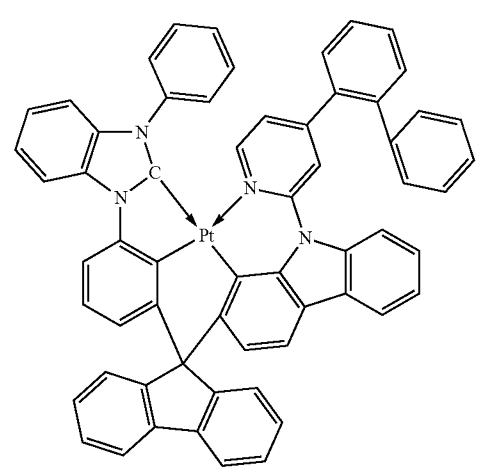

-continued
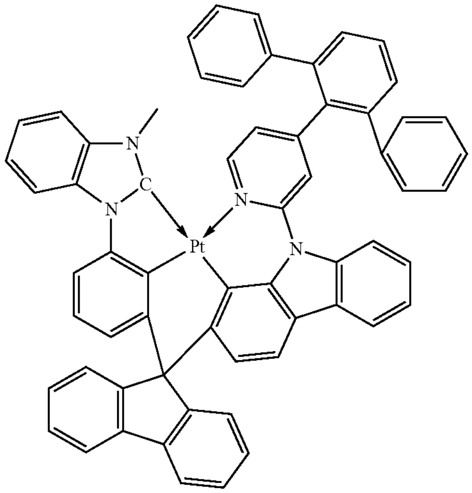
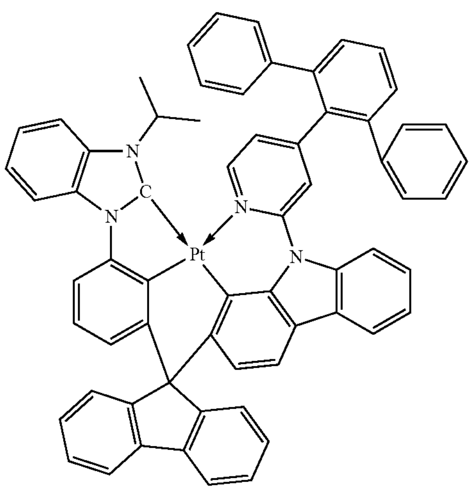
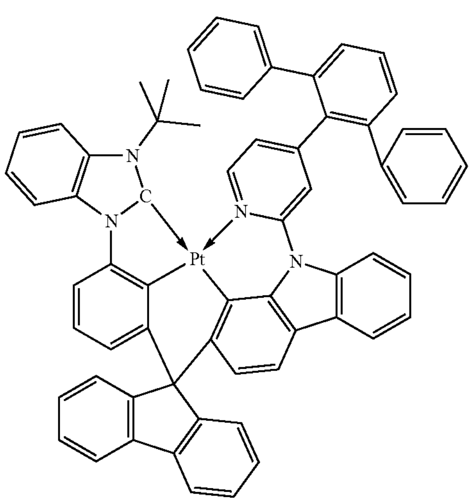
-continued
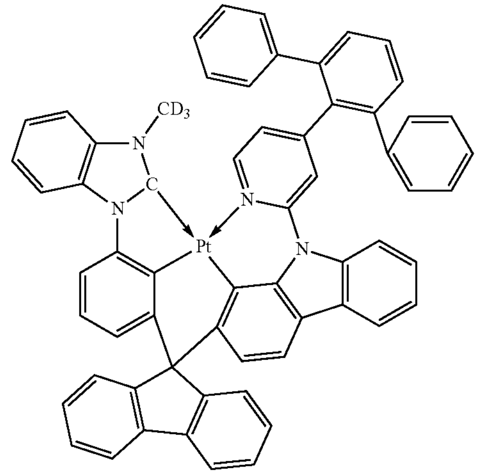
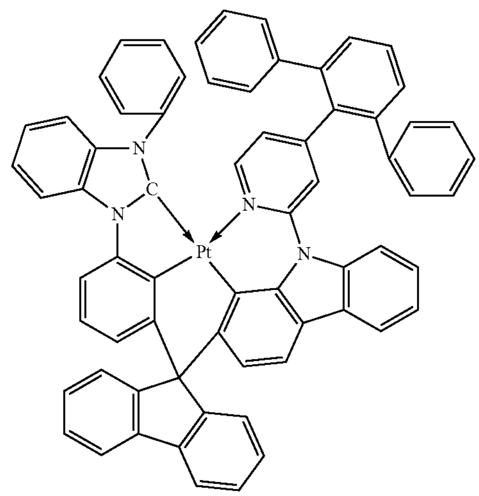
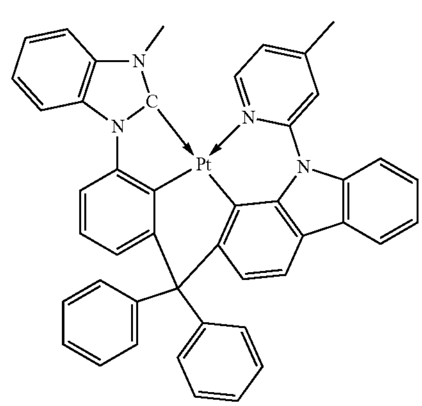

-continued
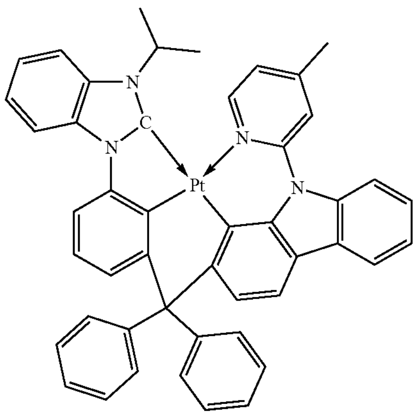
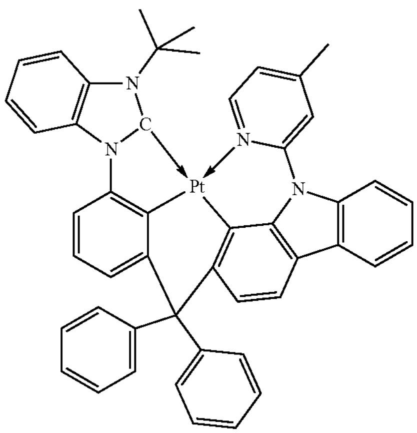
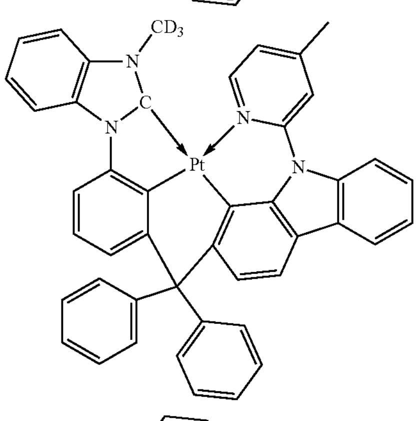
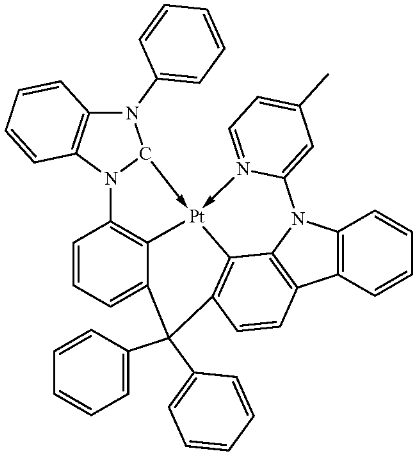
-continued
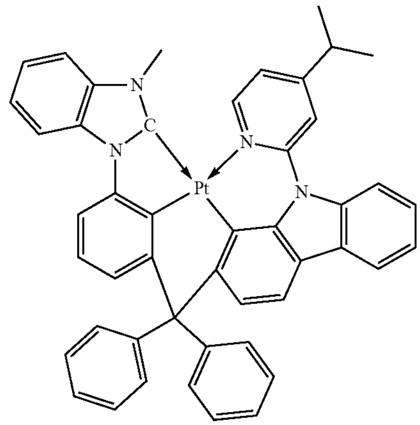
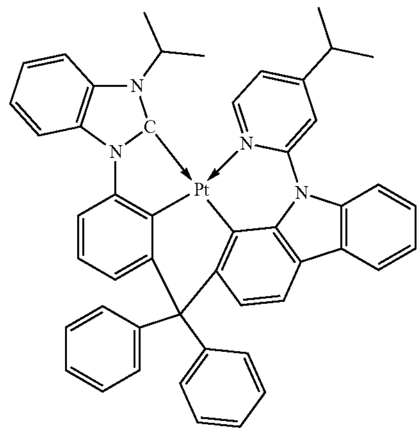
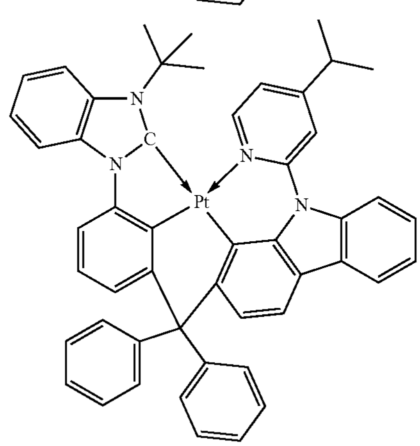
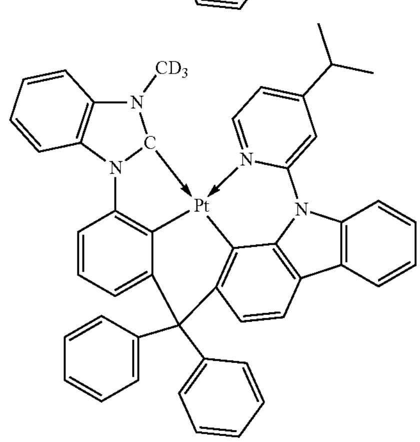

-continued
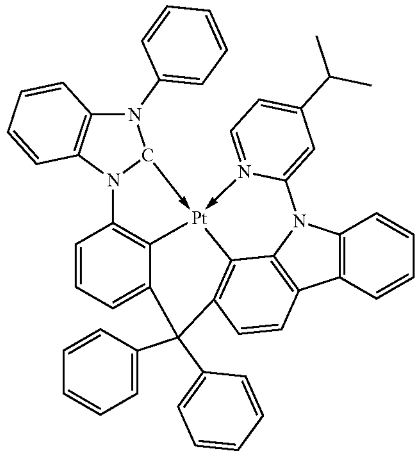
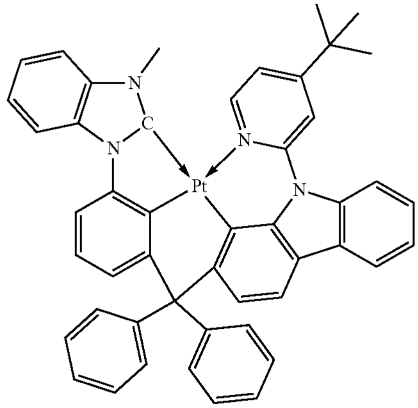
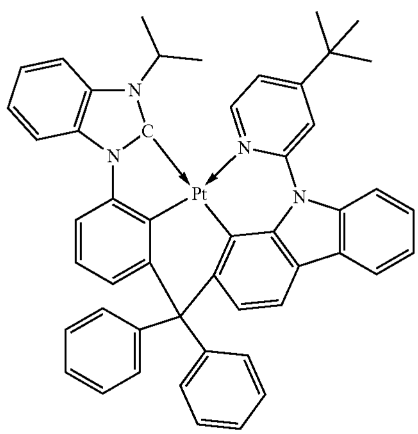
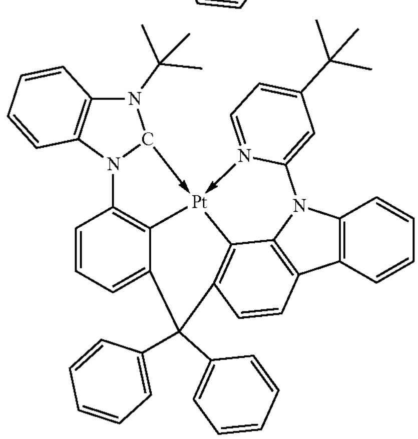
-continued
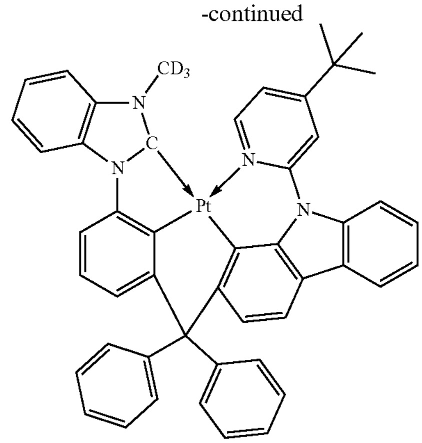
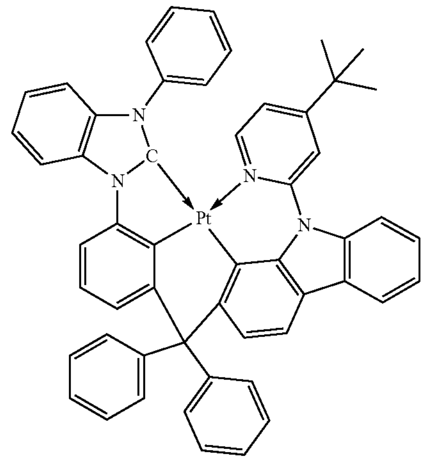
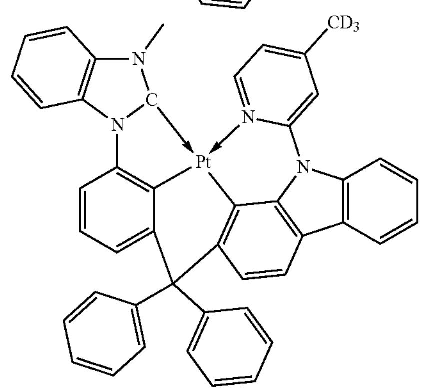
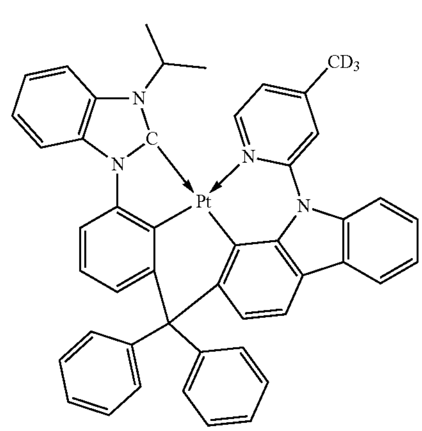

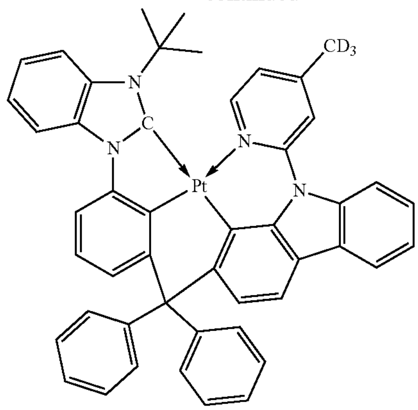
CD3
N
C
N
N
Pt
N
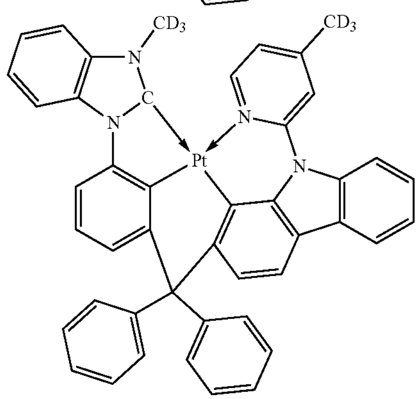
CD3
CD3
N
C
N
N
Pt
N
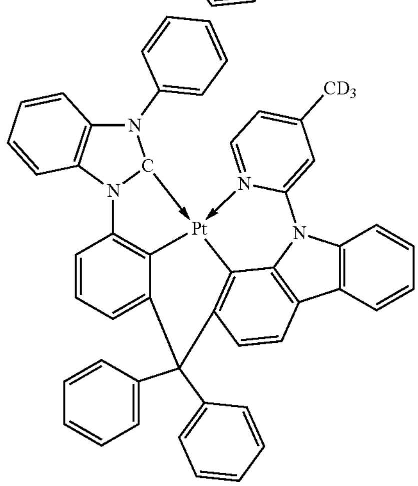
CD3
N
C
N
N
Pt
N
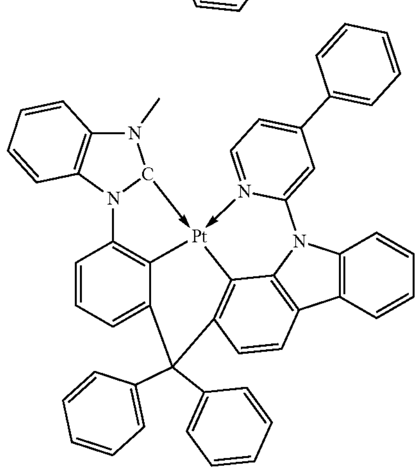
N
C
N
N
Pt
N
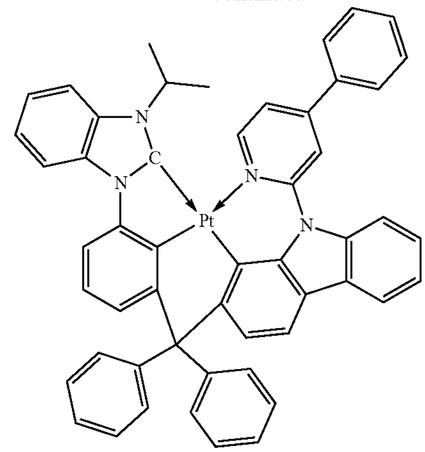
N
C
N
N
Pt
N
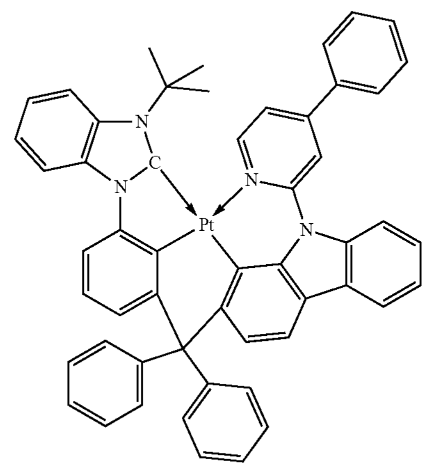
N
C
N
N
Pt
N
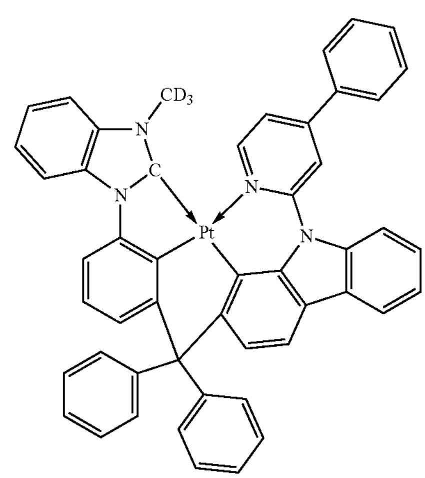
CD3
N
C
N
N
Pt
N -continued
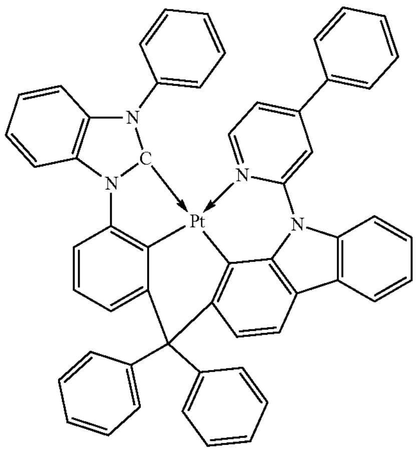
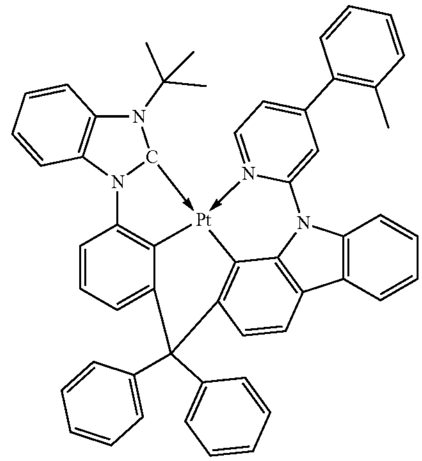
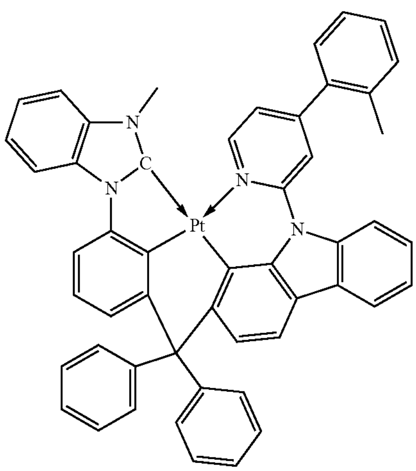
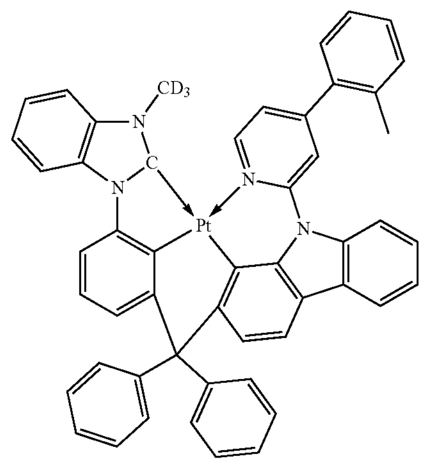
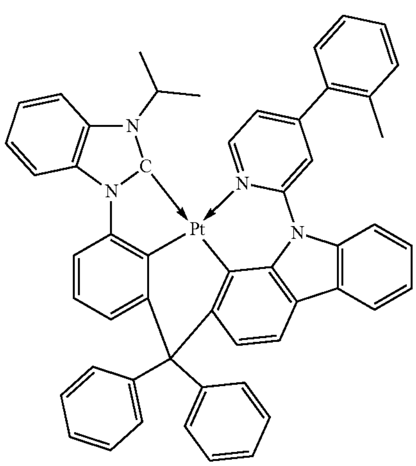
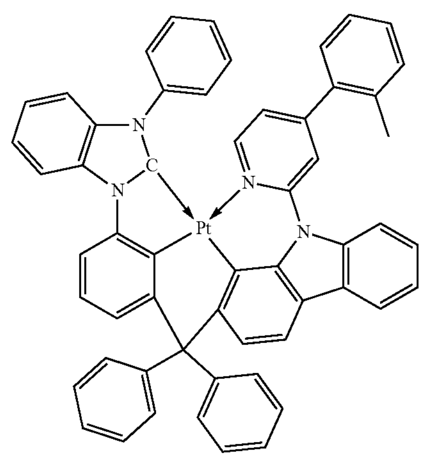

-continued
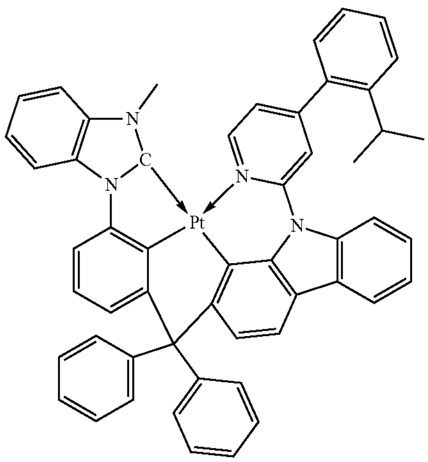
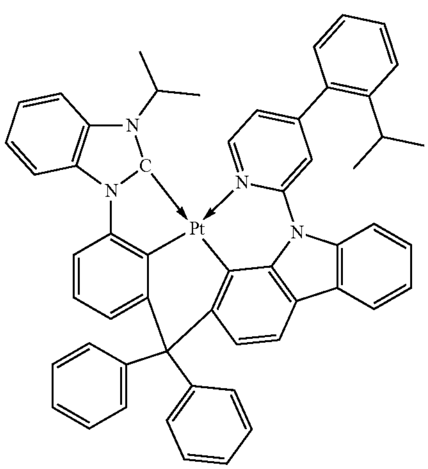
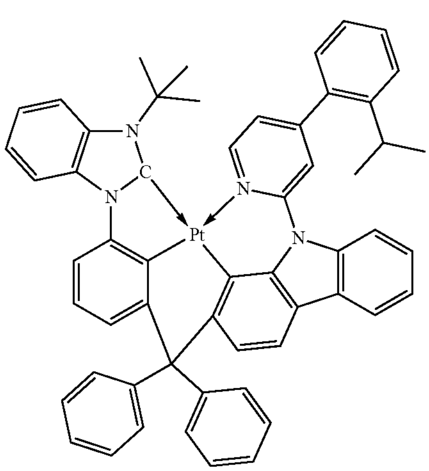
-continued
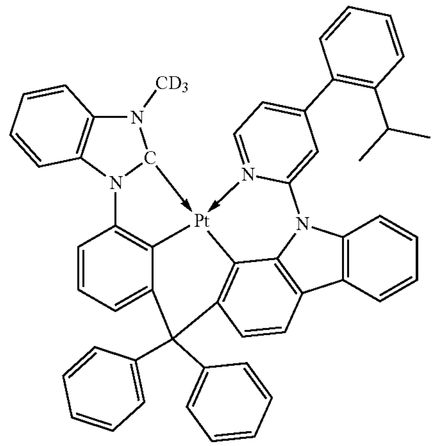
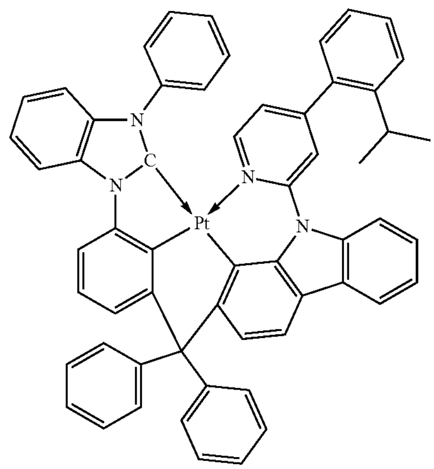
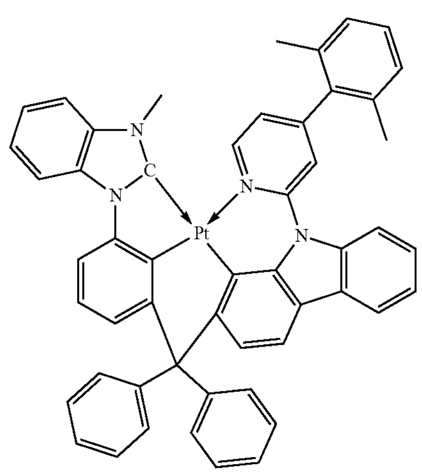

-continued
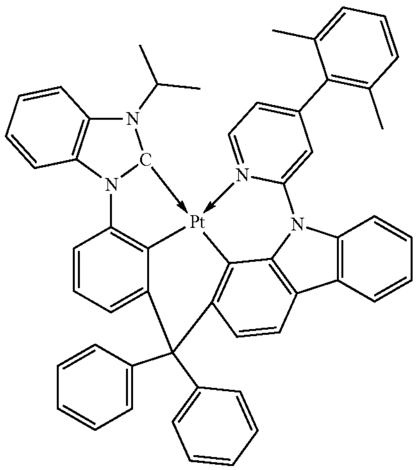
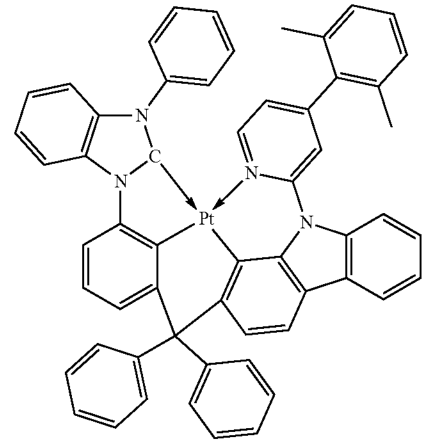
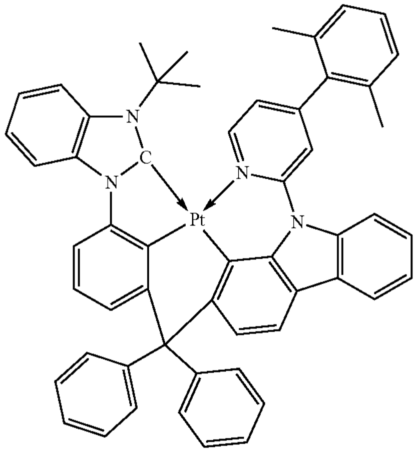
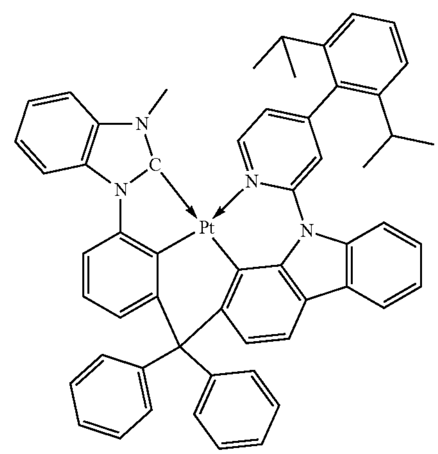
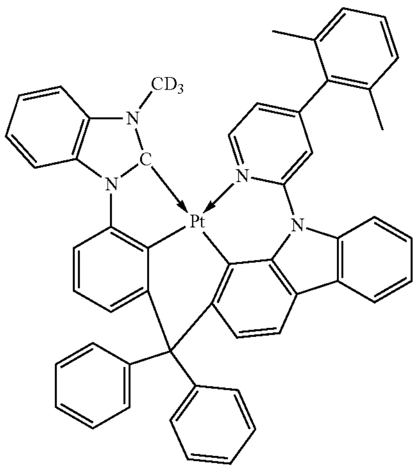
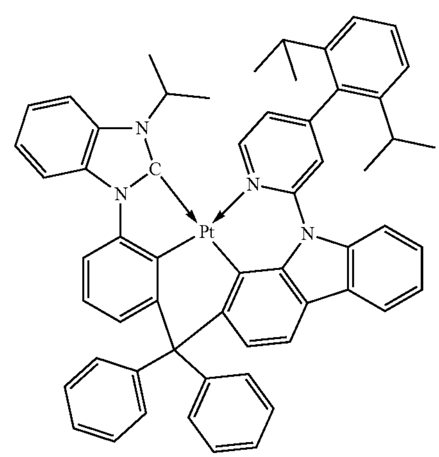

-continued
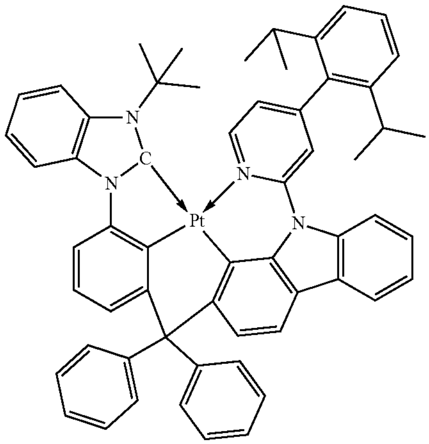
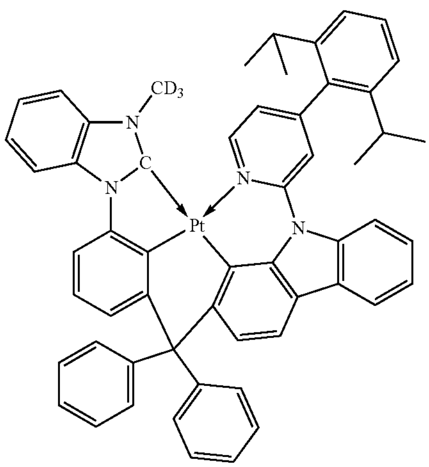
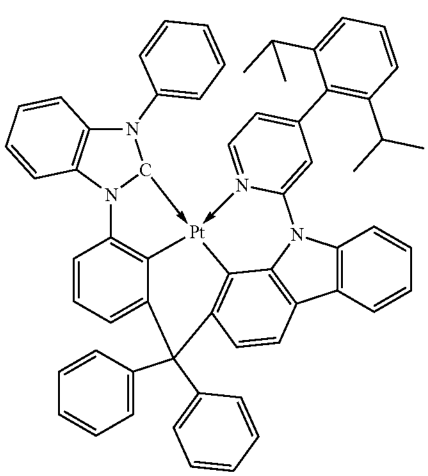
-continued
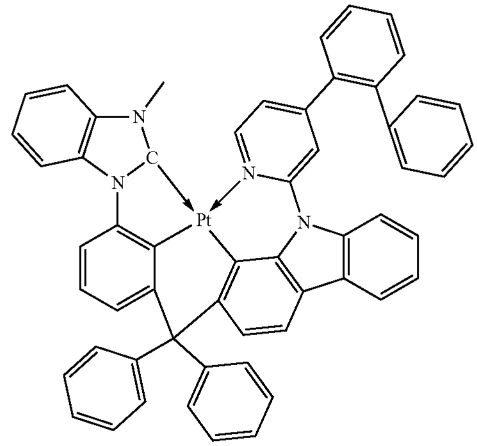
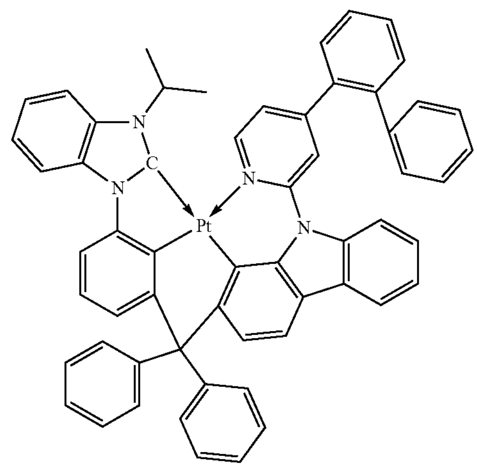
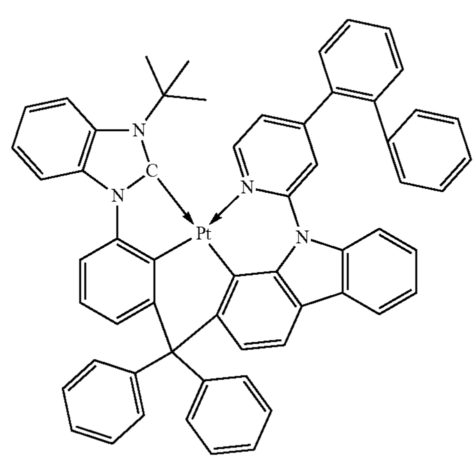

-continued
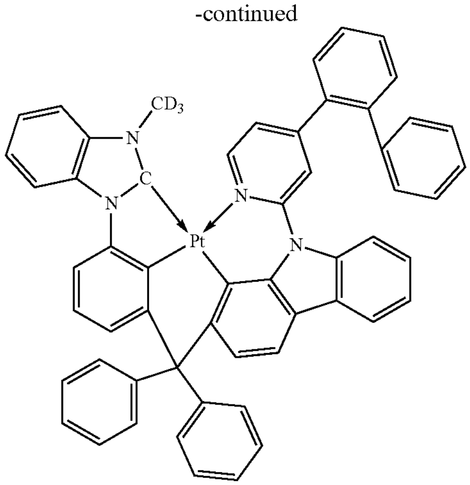
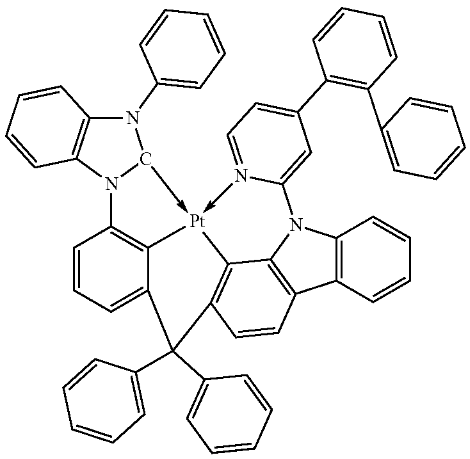
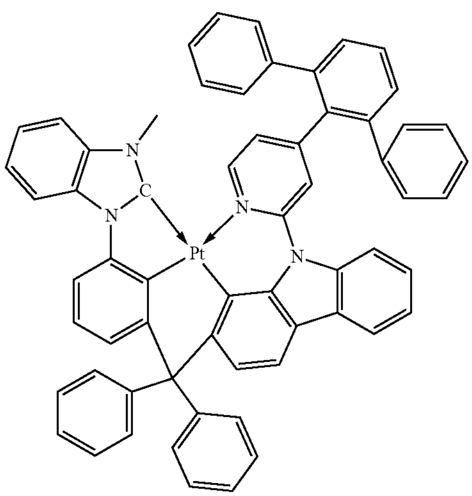
-continued
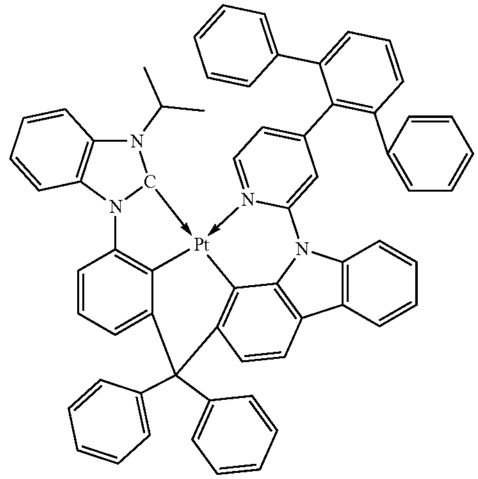
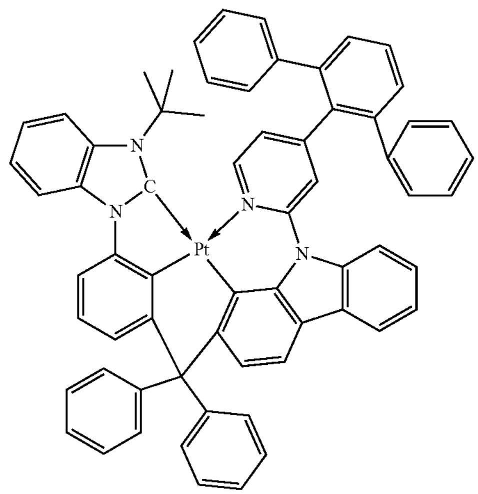
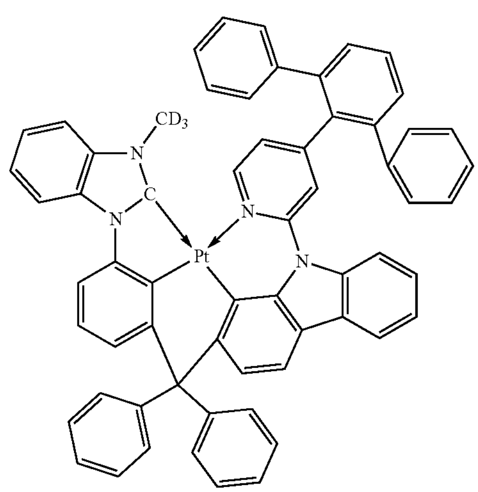

-continued
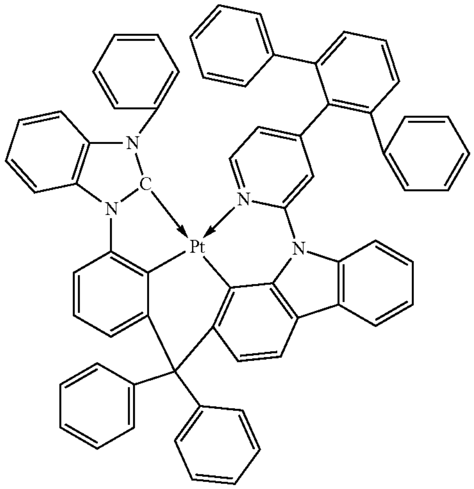
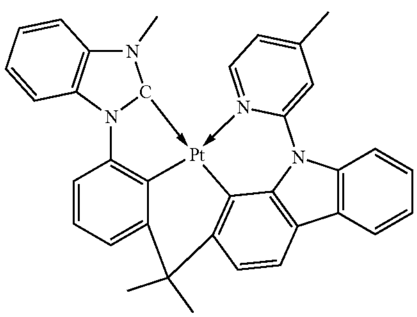
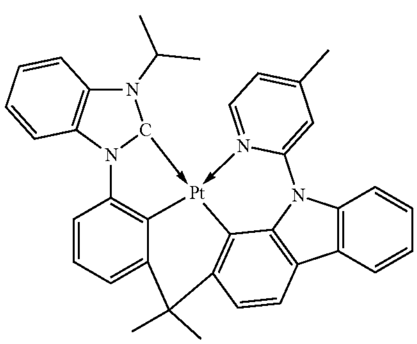
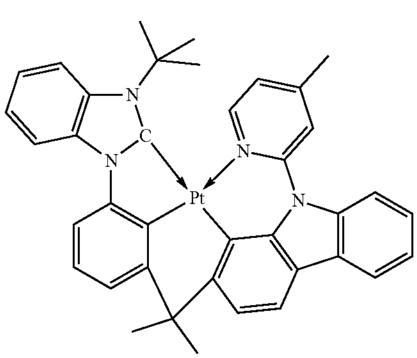
-continued
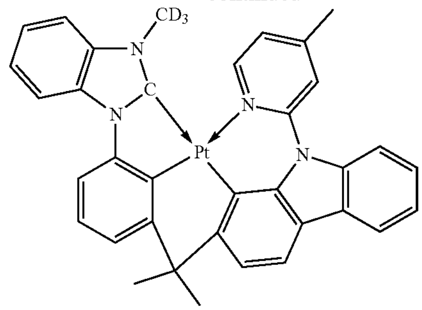
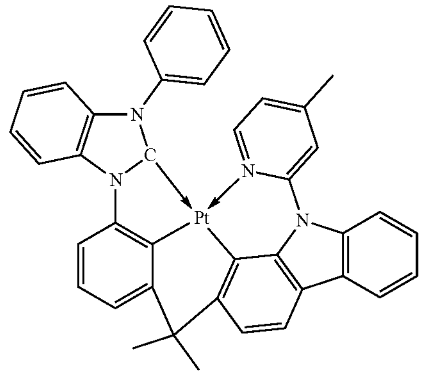
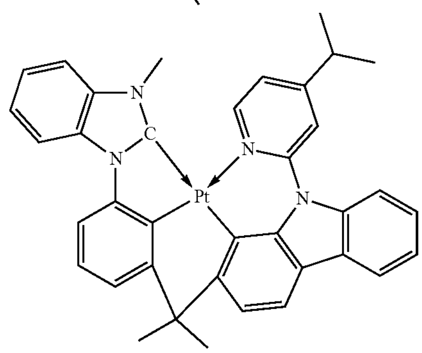
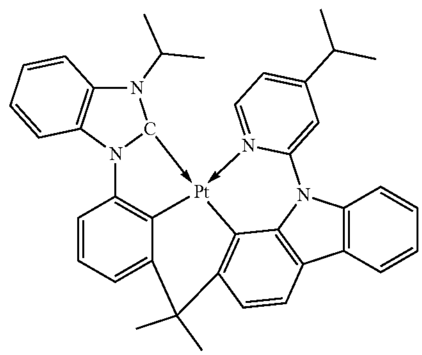
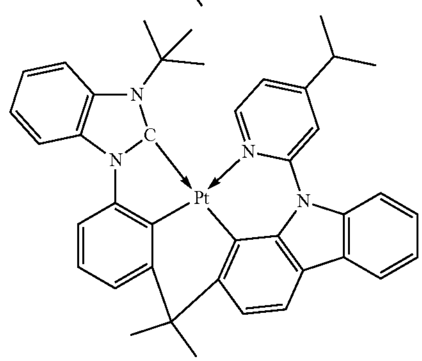

-continued
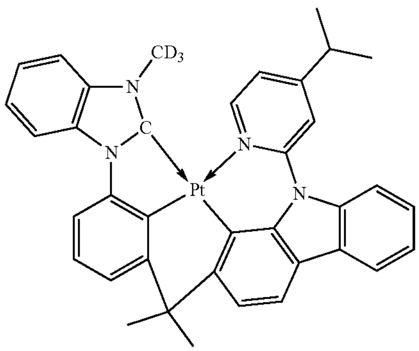
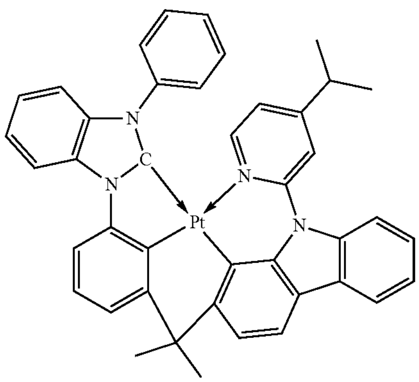
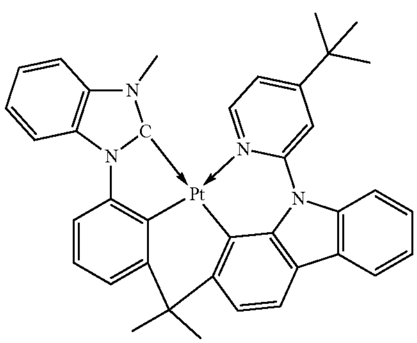
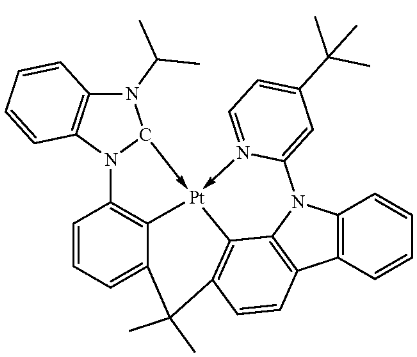
-continued
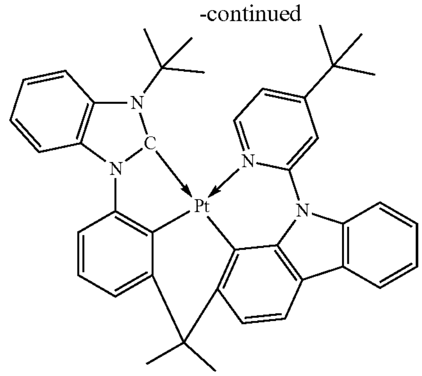
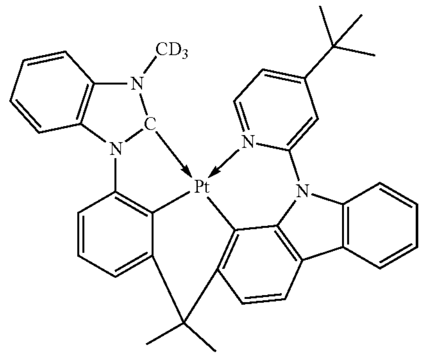
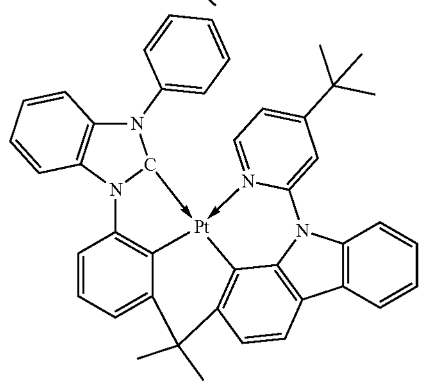
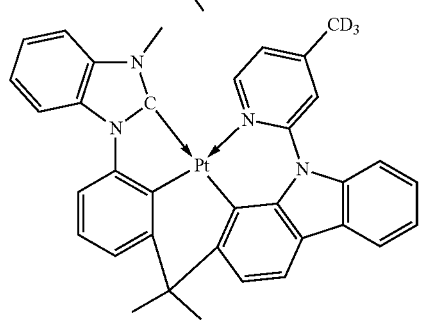
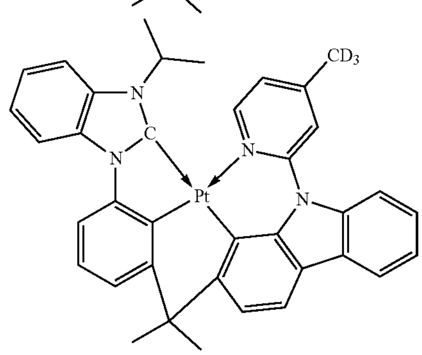

-continued
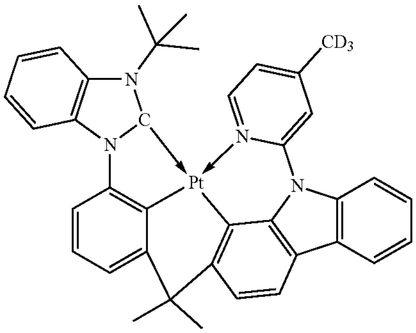
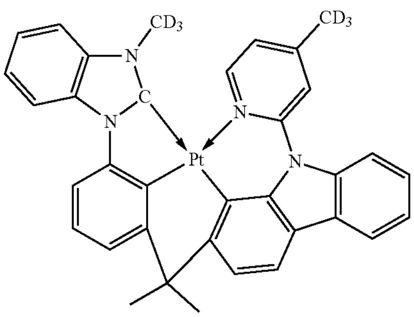
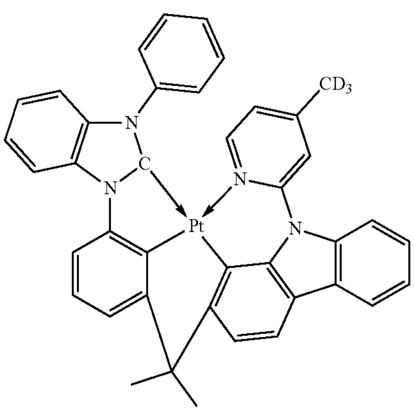
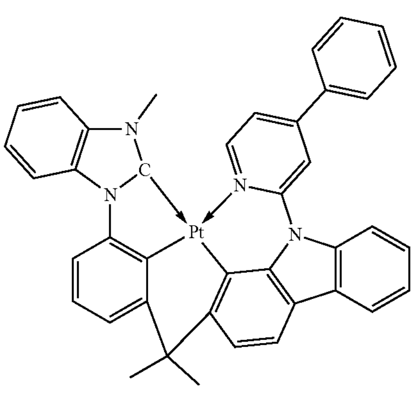
-continued
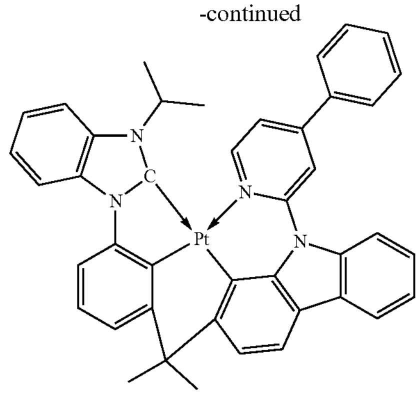
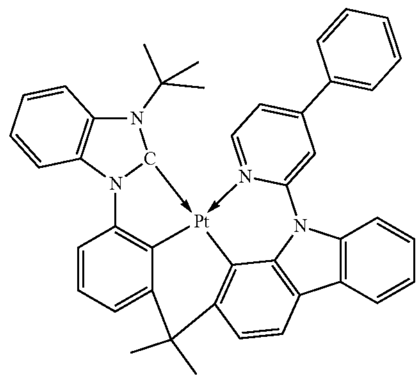
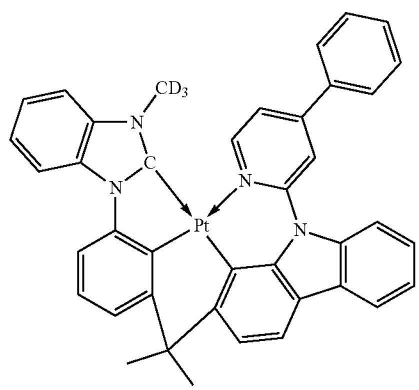
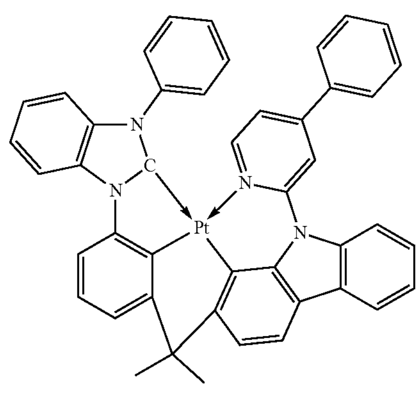

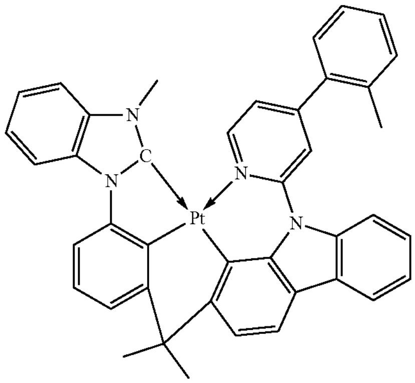
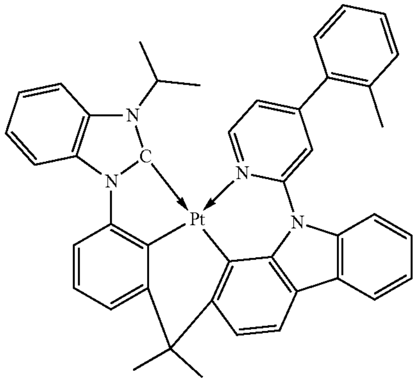
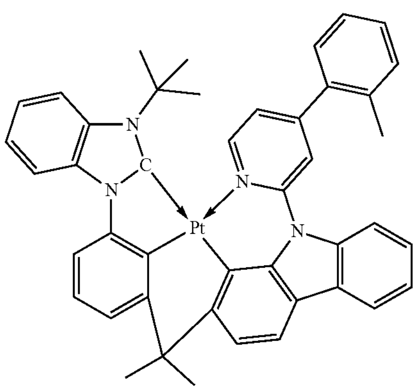
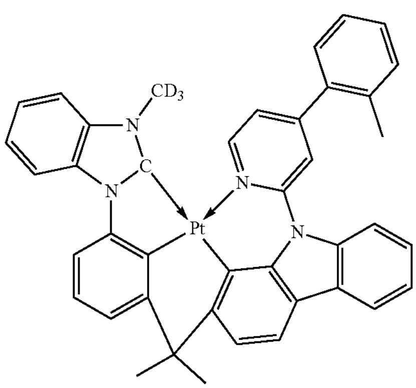
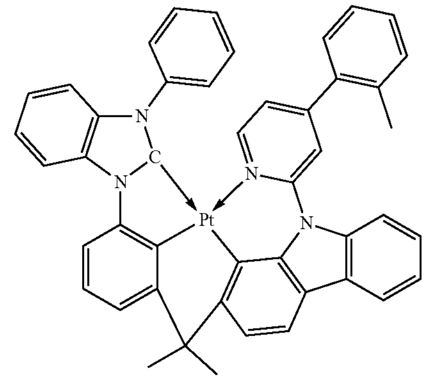
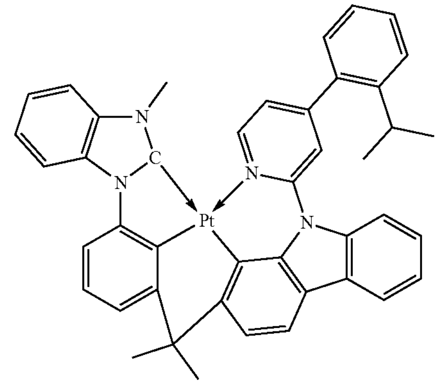
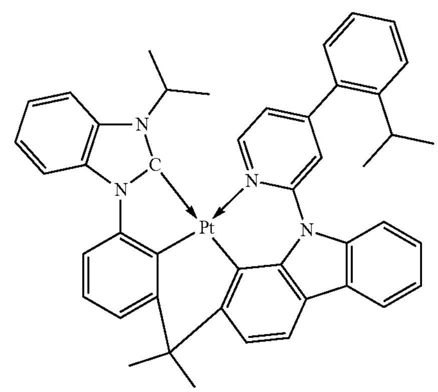
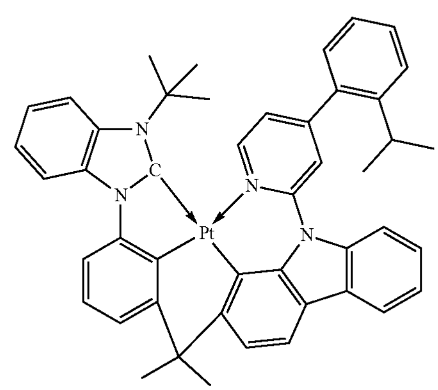

-continued
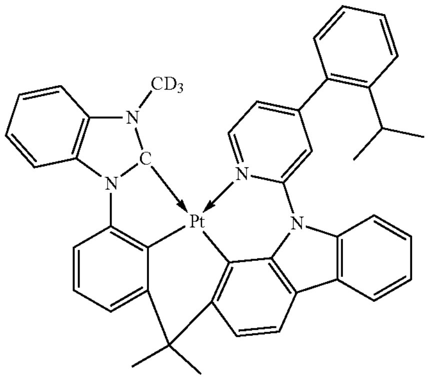
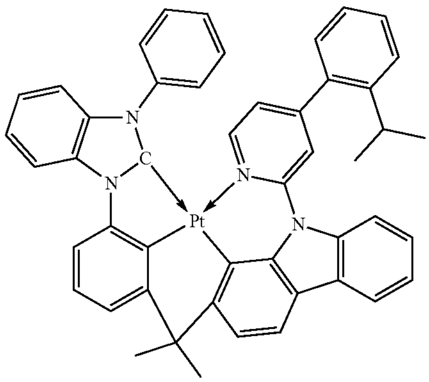
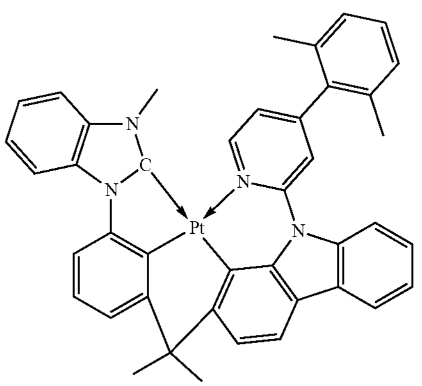
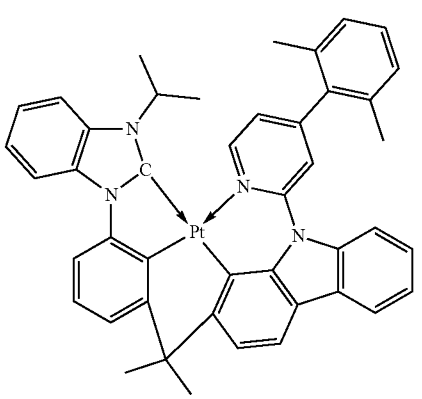
-continued
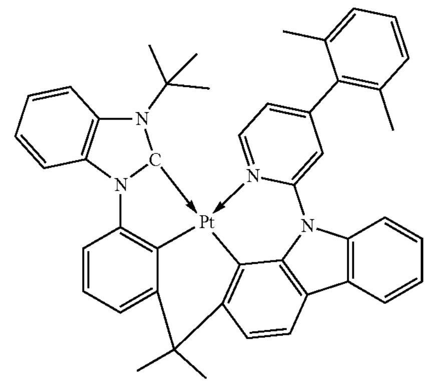
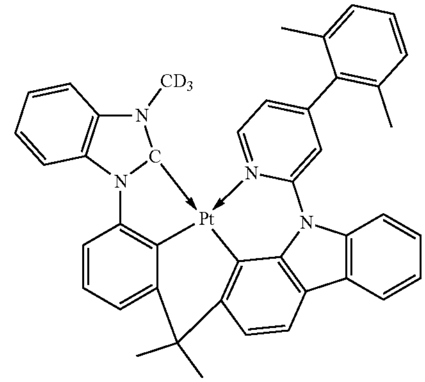
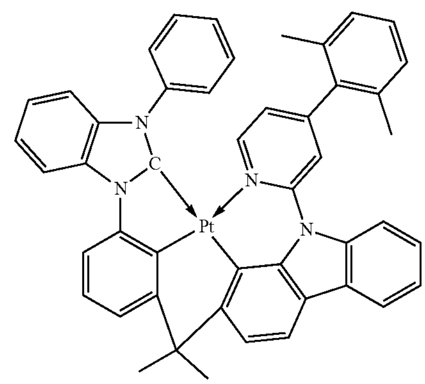
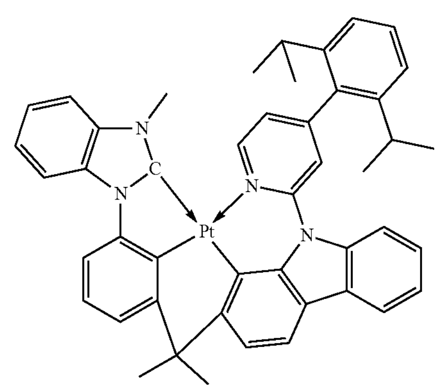

-continued
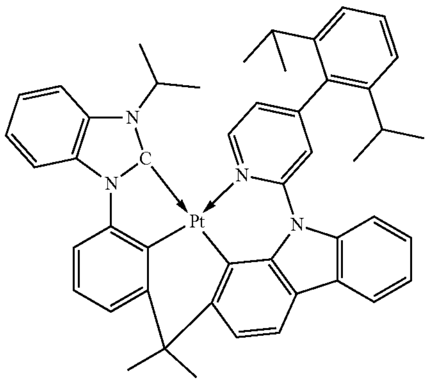
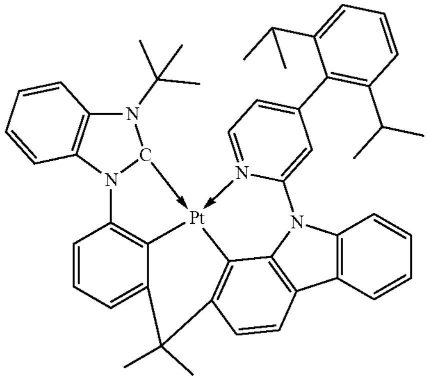
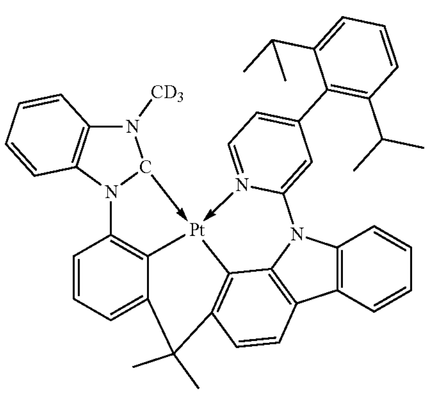
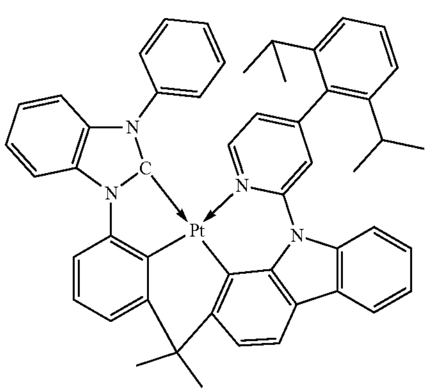
-continued
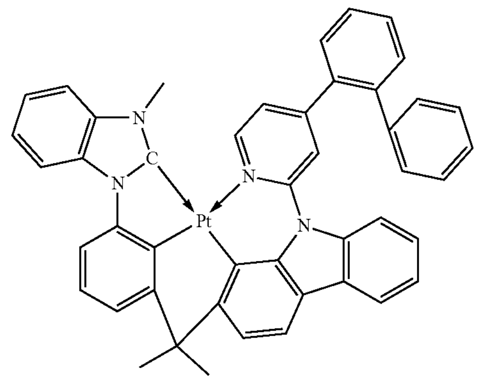
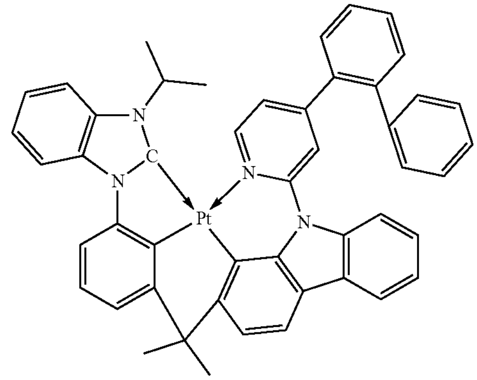
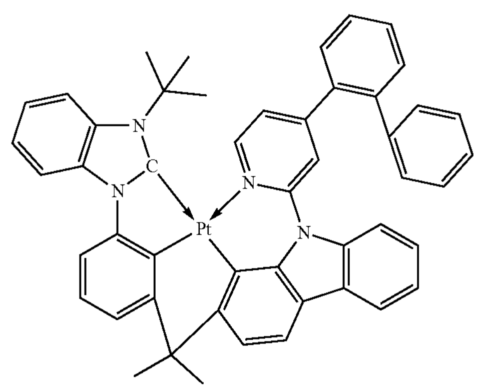
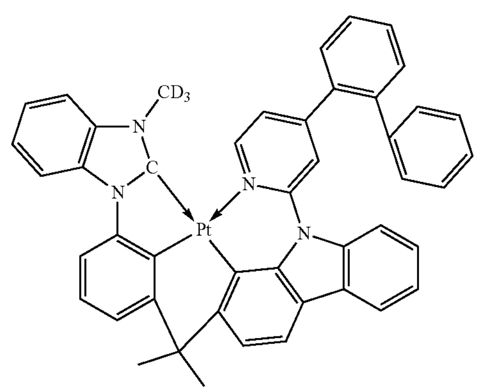

-continued
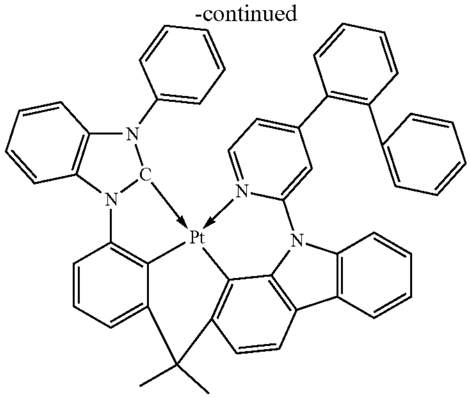
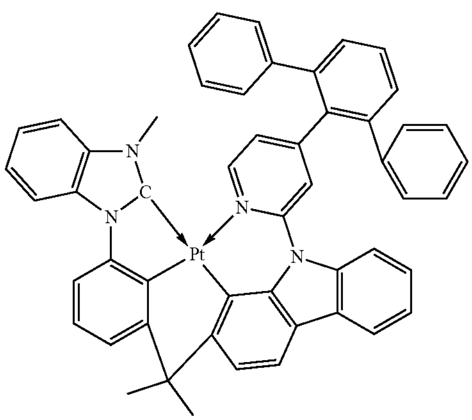
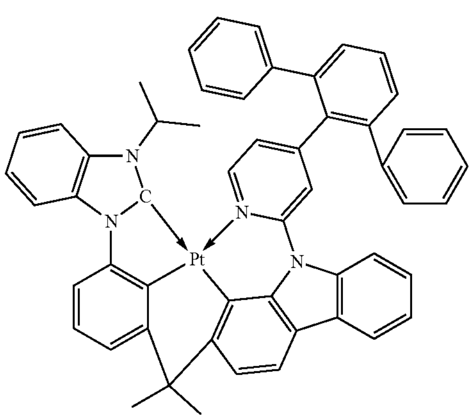
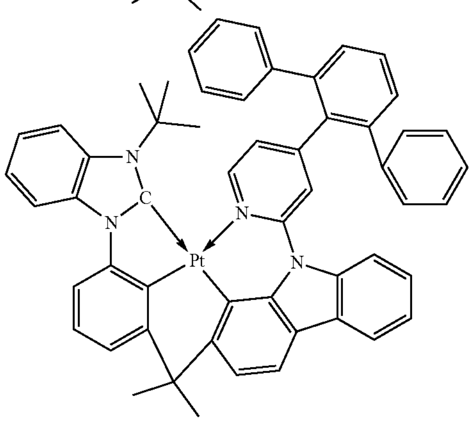
-continued
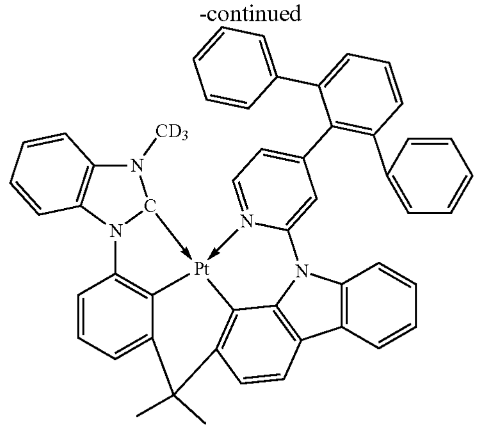
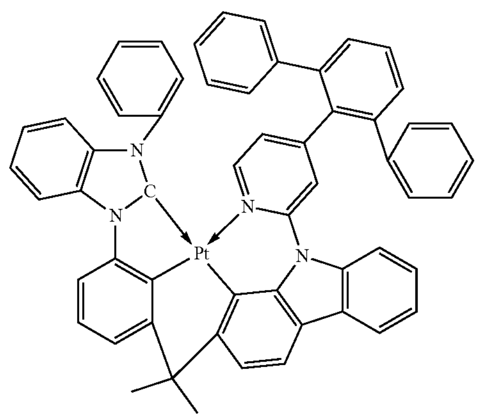
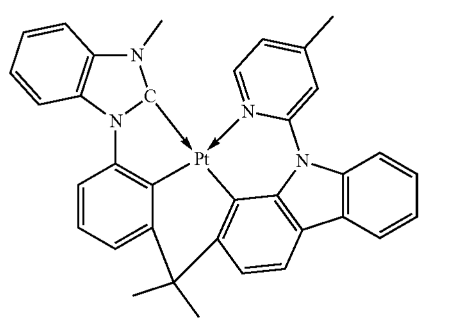
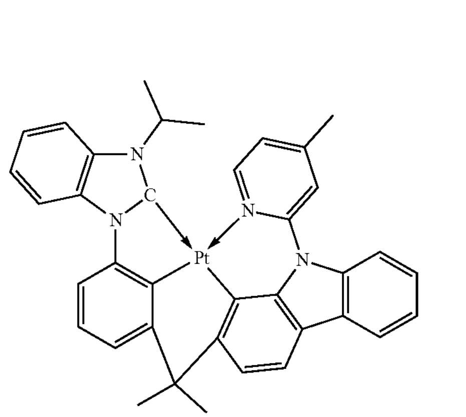

-continued
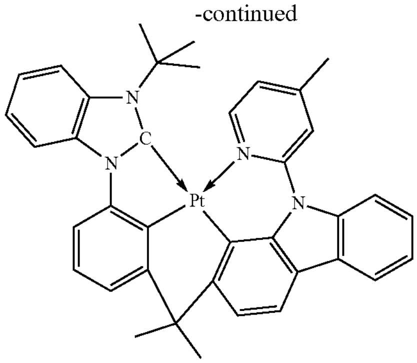
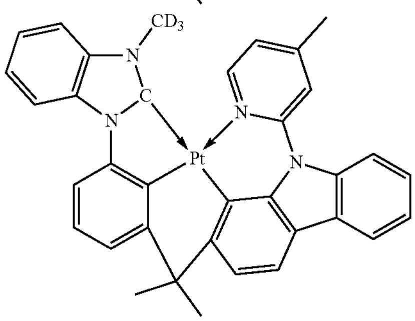
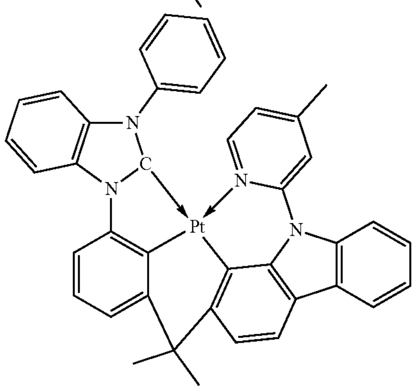
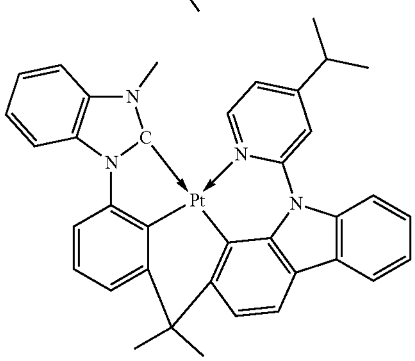
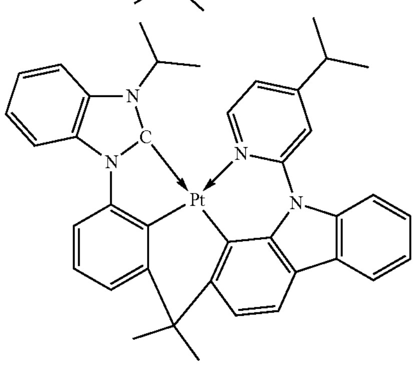
-continued
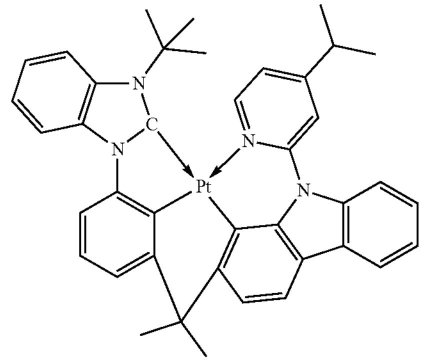
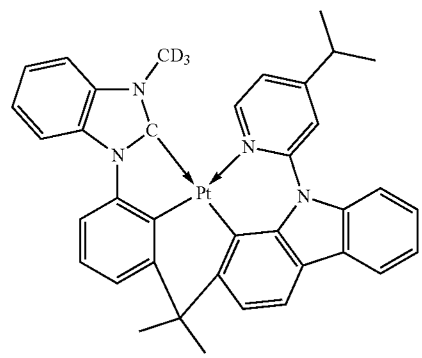
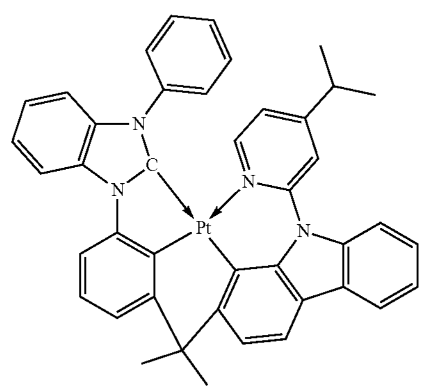
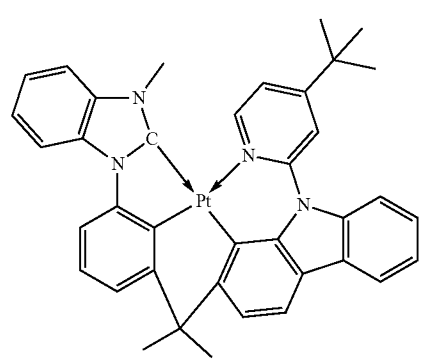

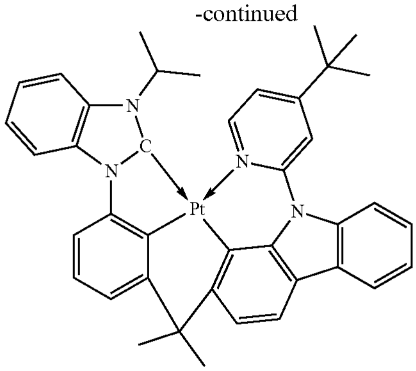
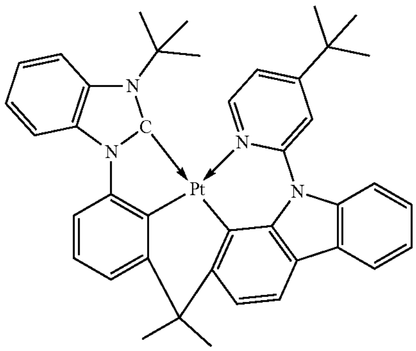
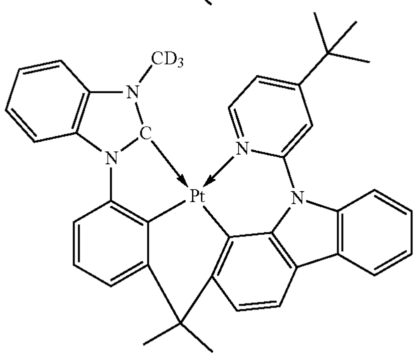
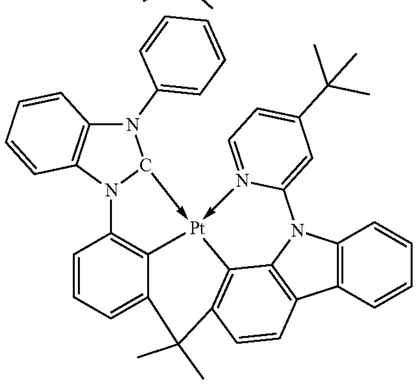
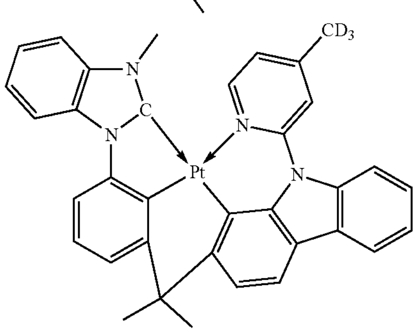
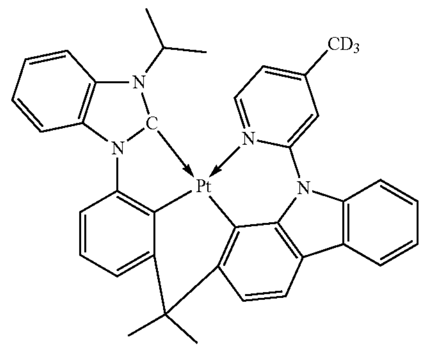
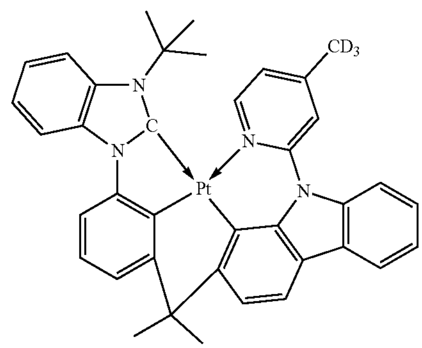
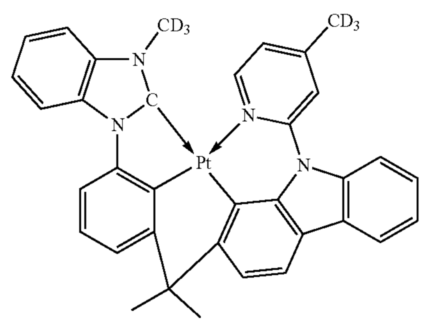
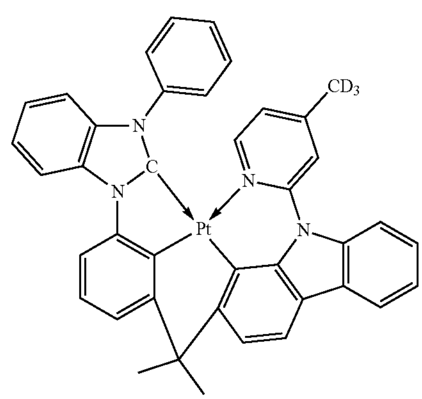

-continued
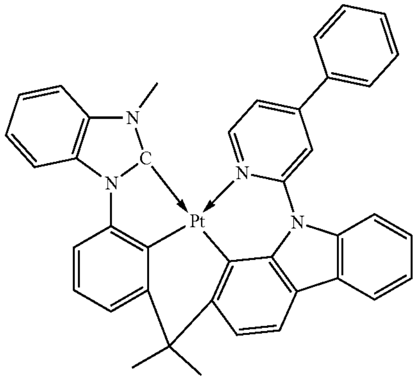
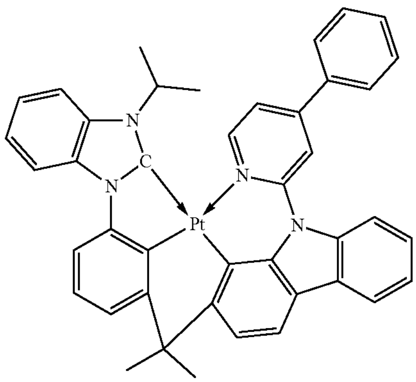
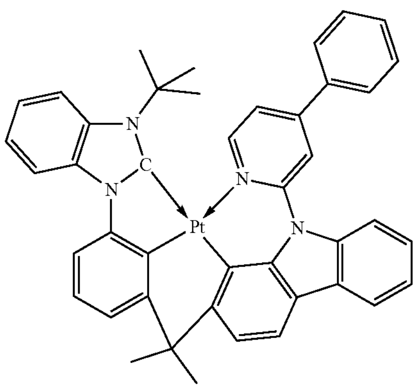
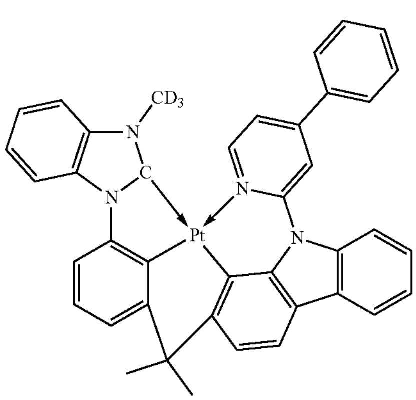
-continued
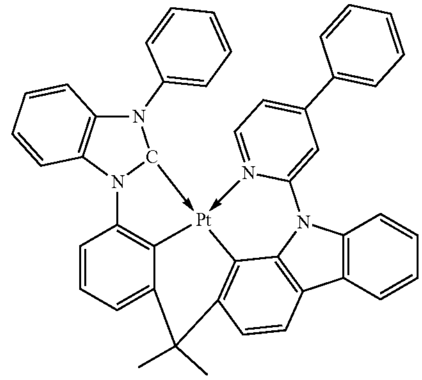
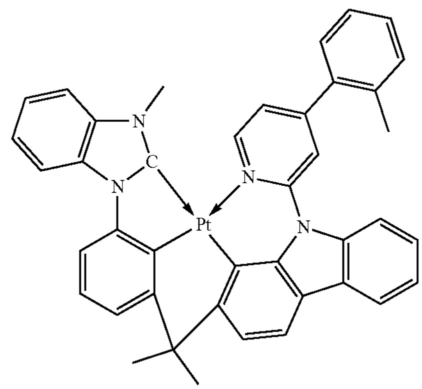
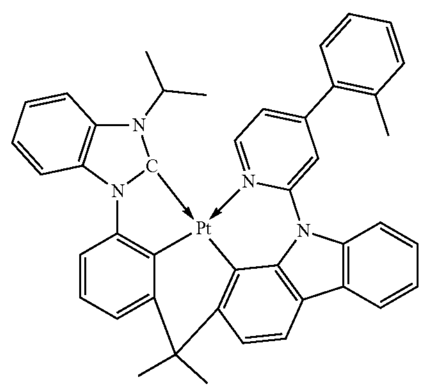
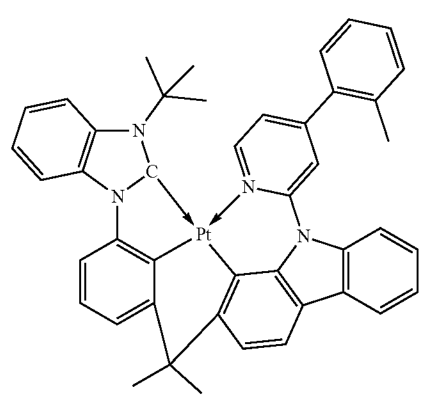

-continued
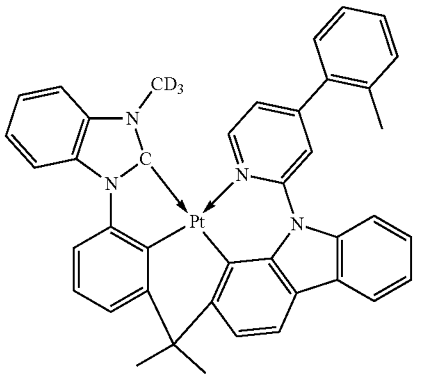
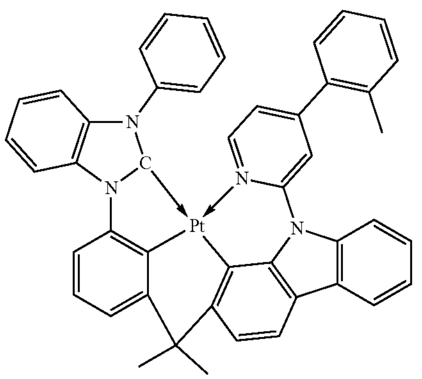
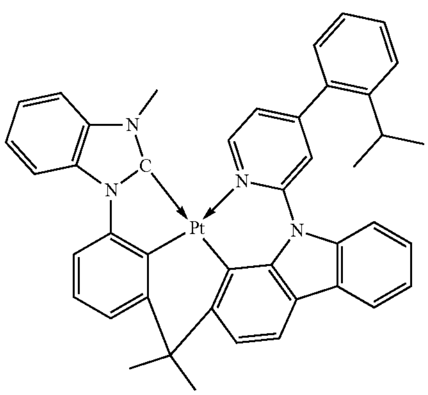
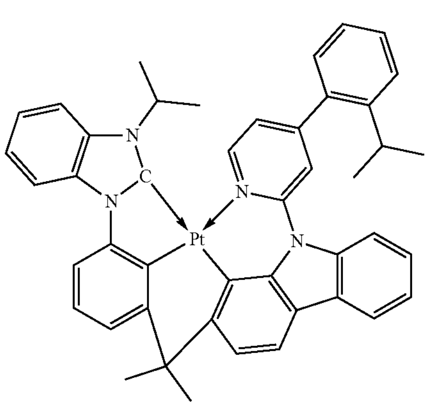
-continued
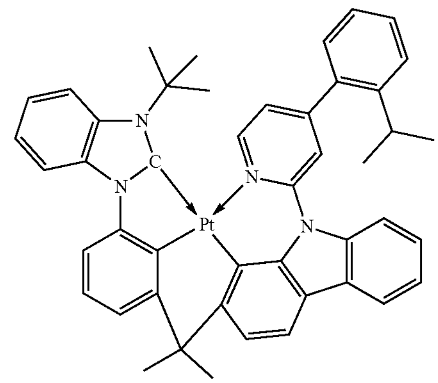
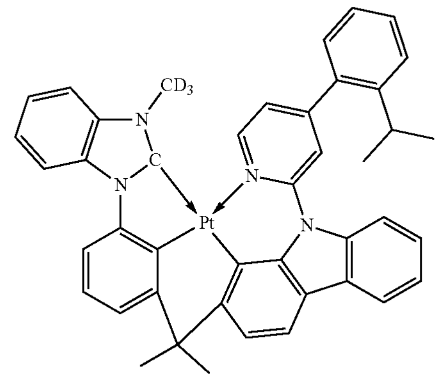
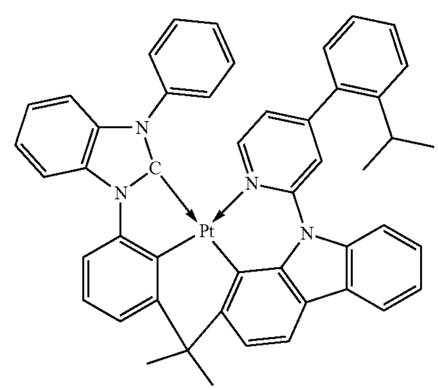
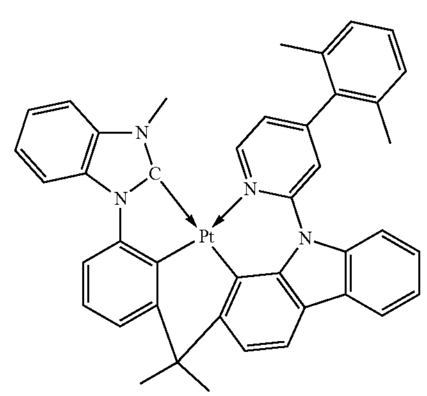

-continued
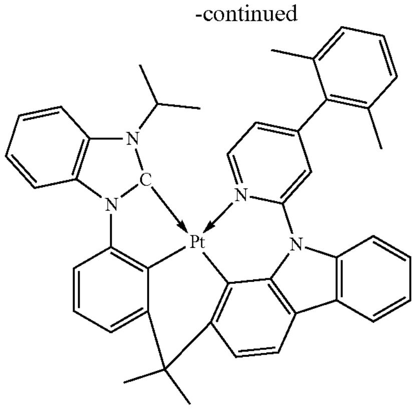
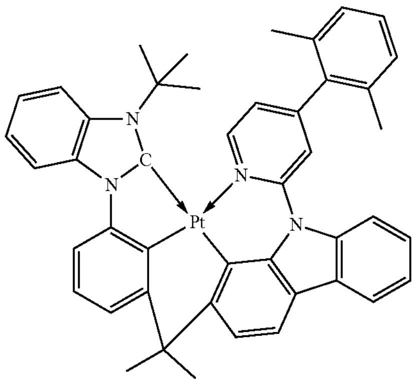
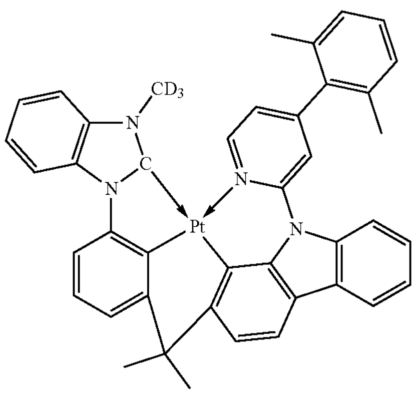
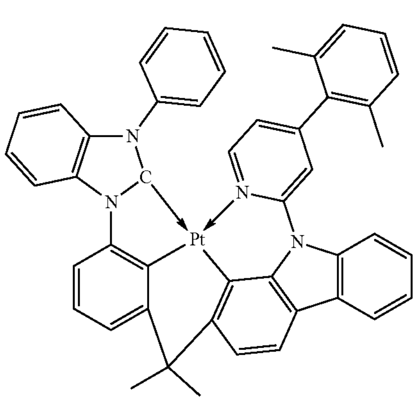
-continued
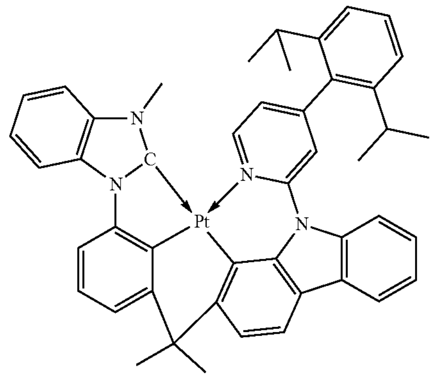
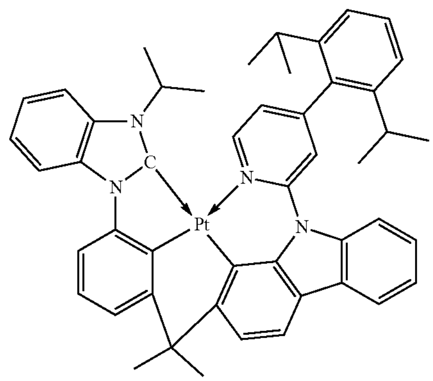
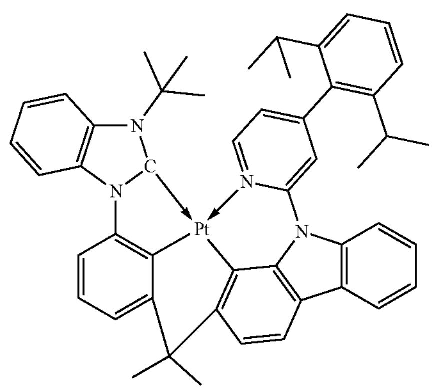
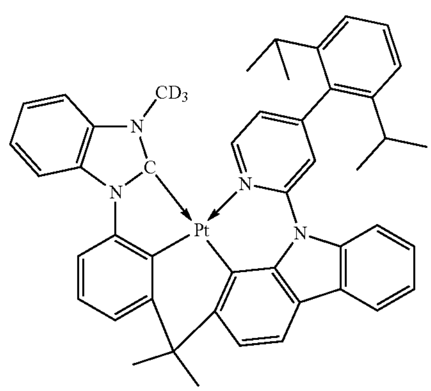

-continued
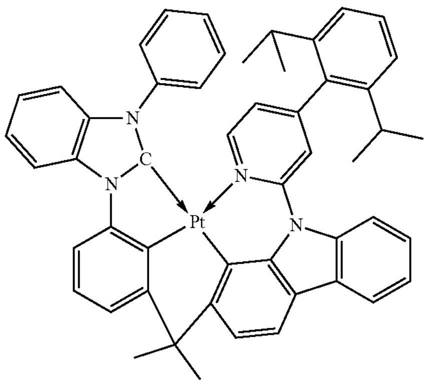
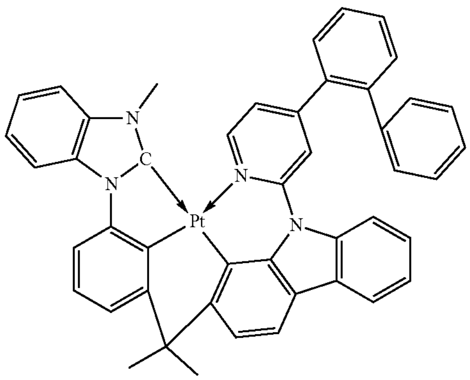
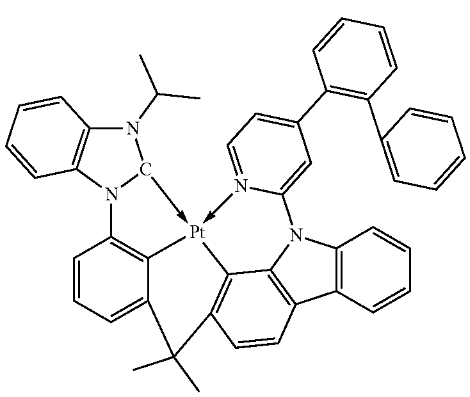
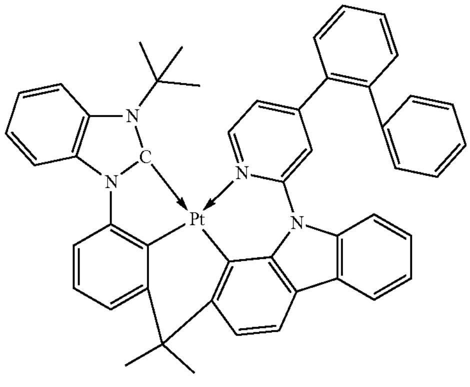
-continued
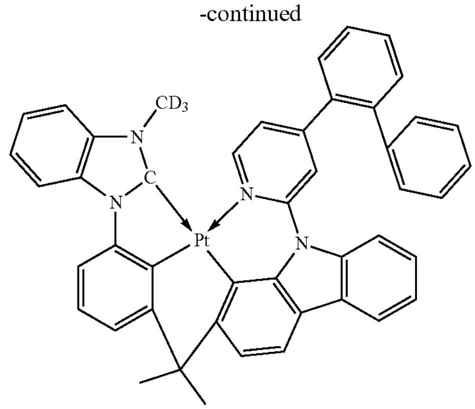
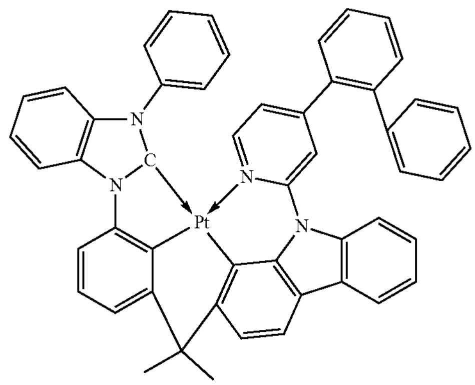
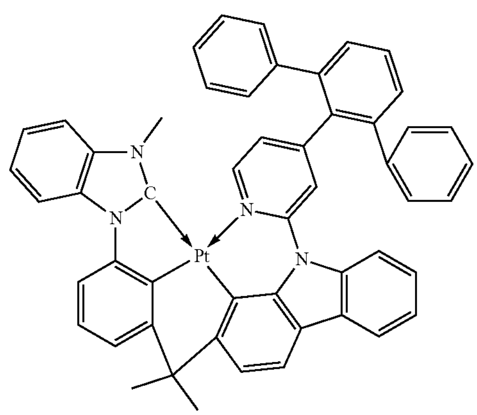
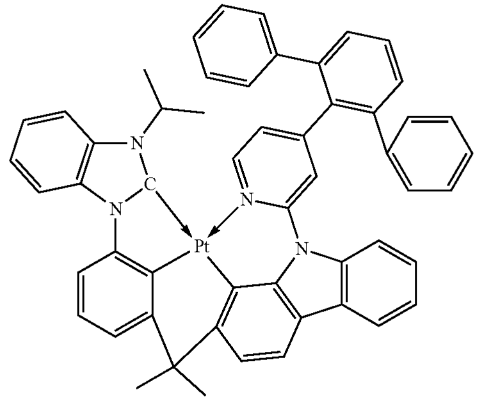

-continued
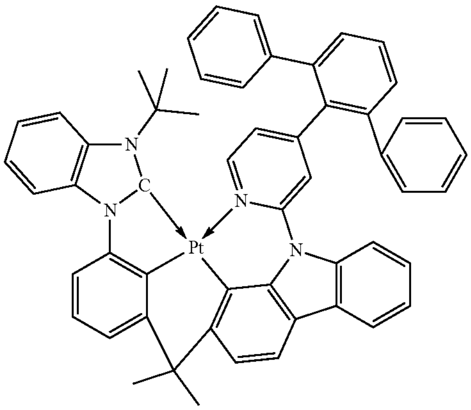
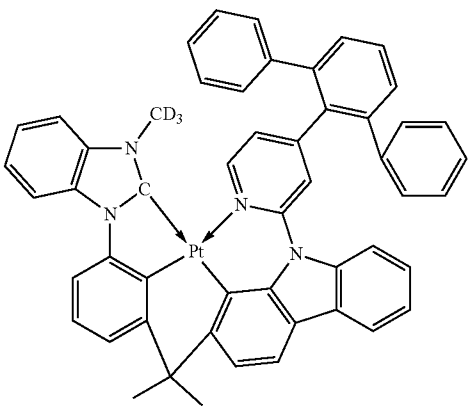
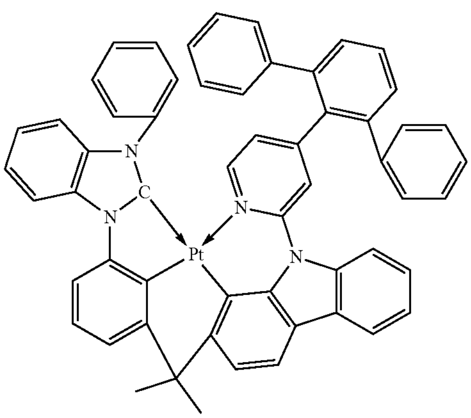
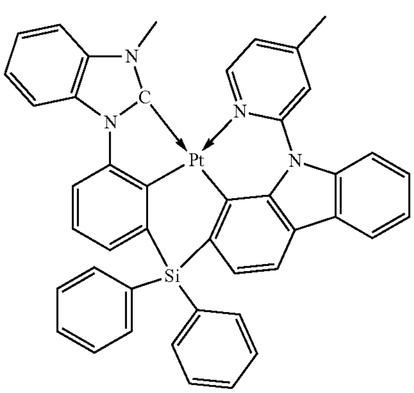
-continued
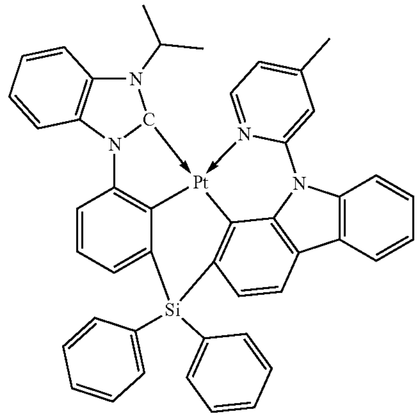
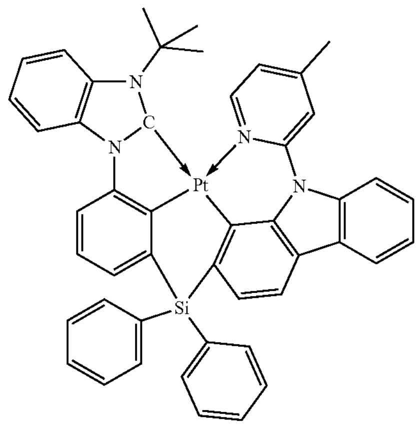
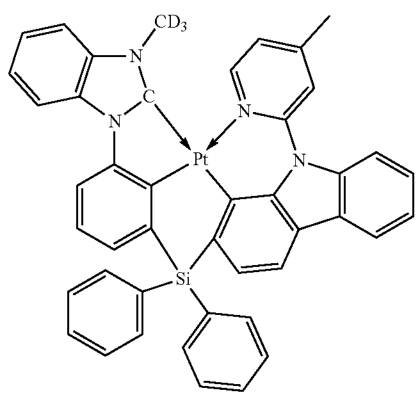
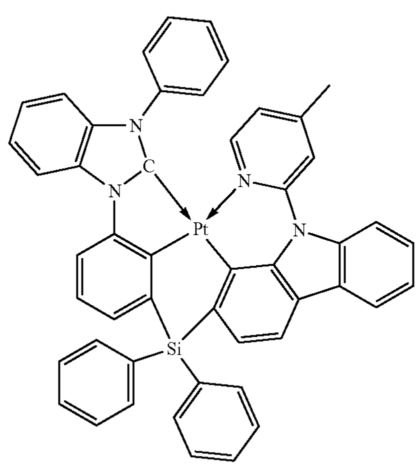

-continued
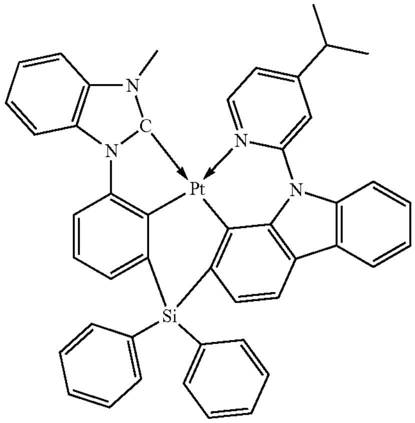
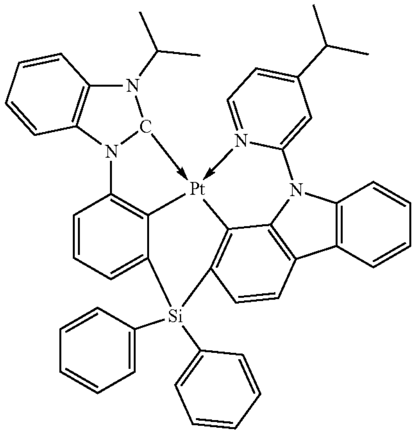
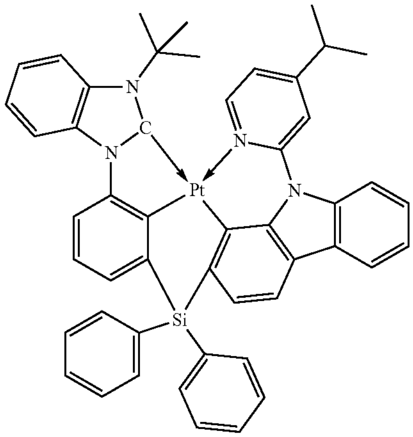
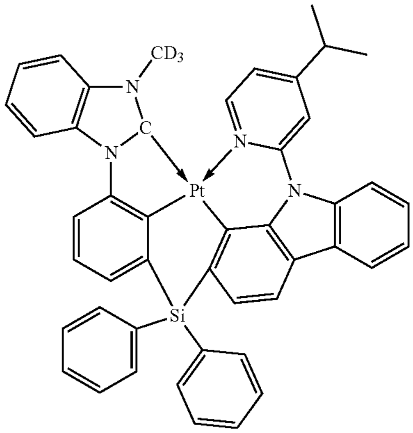
-continued
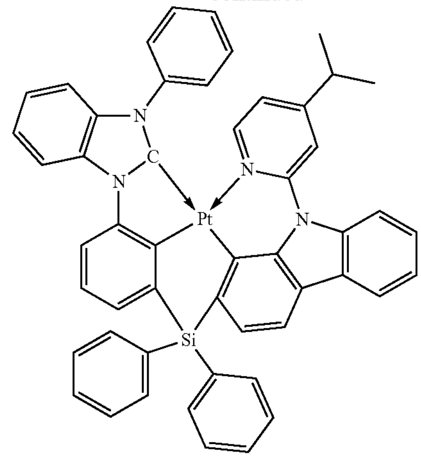
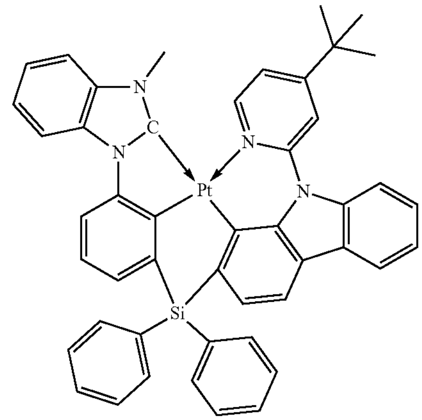
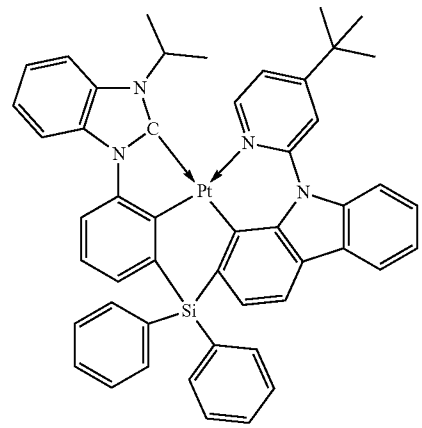
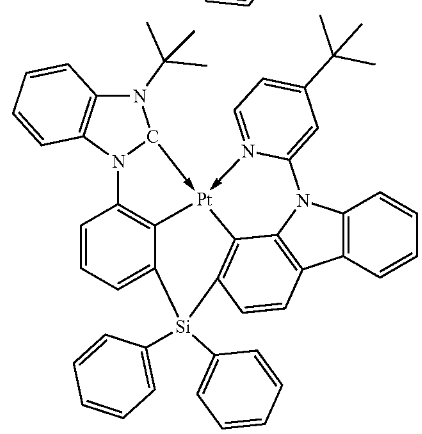

-continued
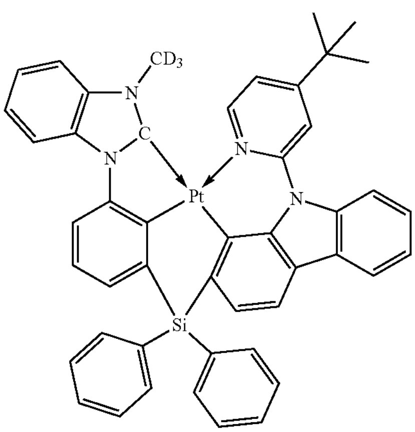
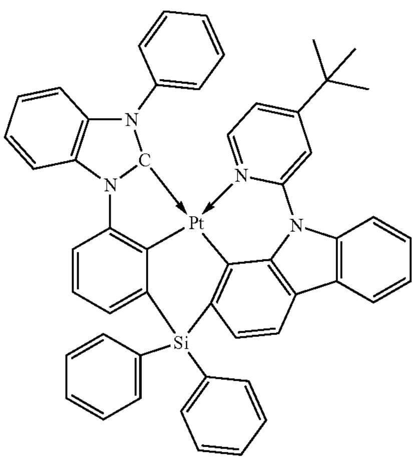
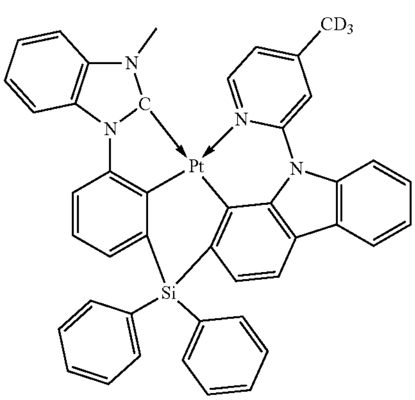
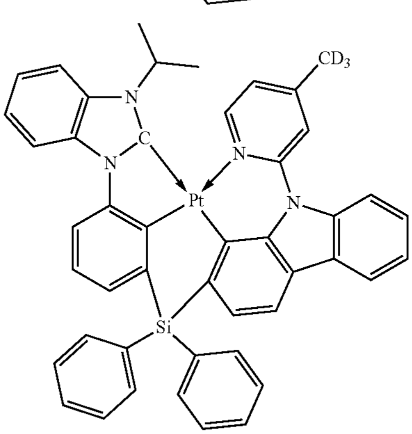
-continued
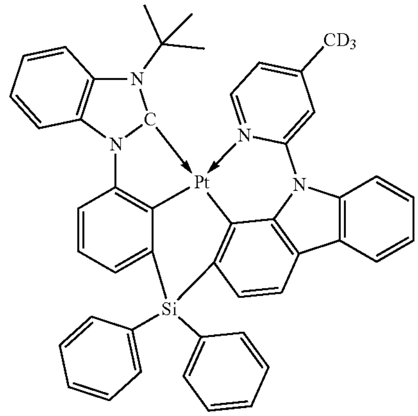
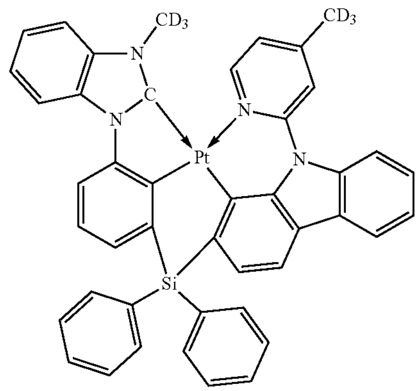
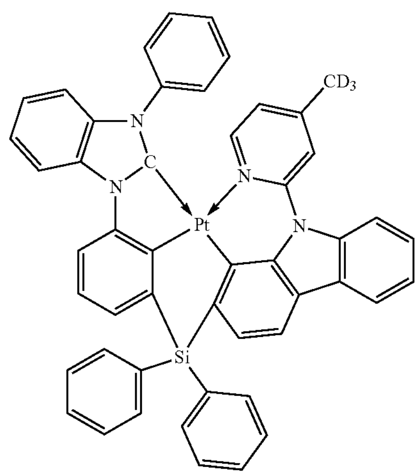
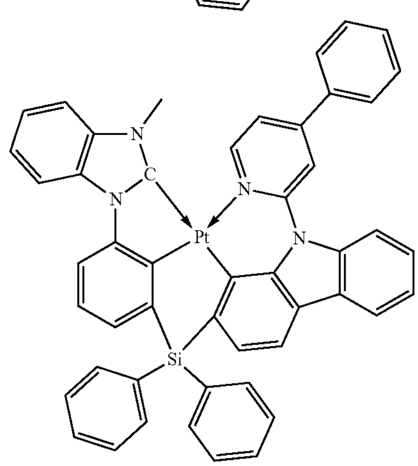

-continued
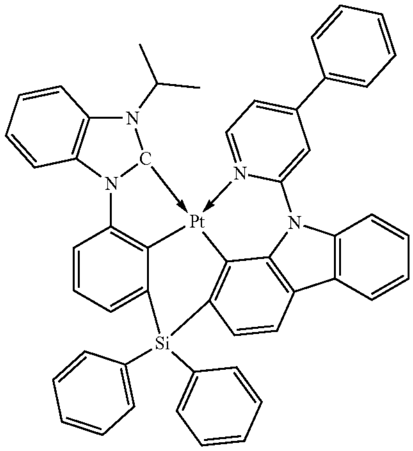
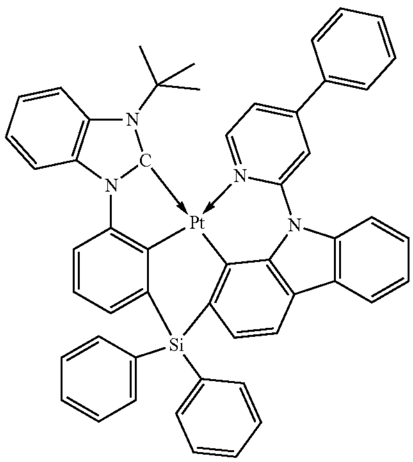
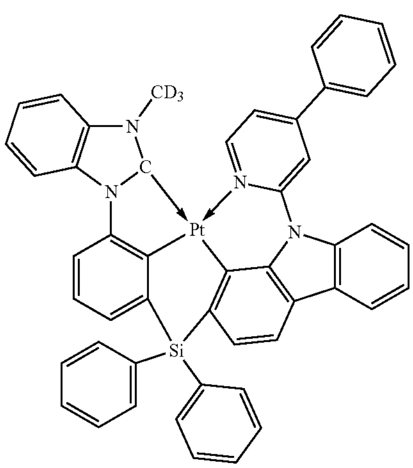
-continued
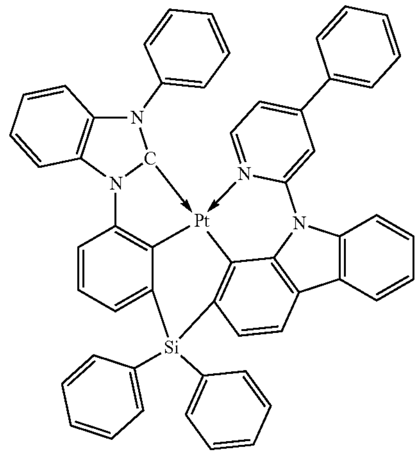
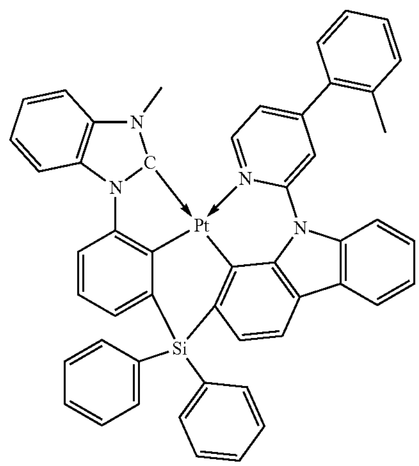
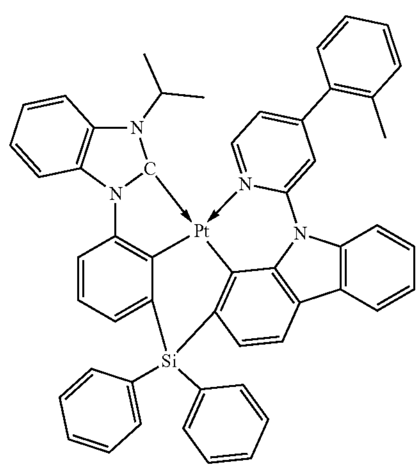

-continued
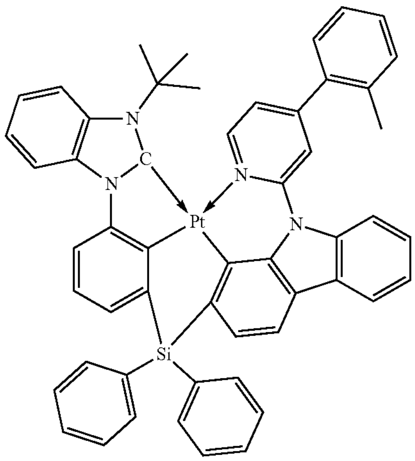
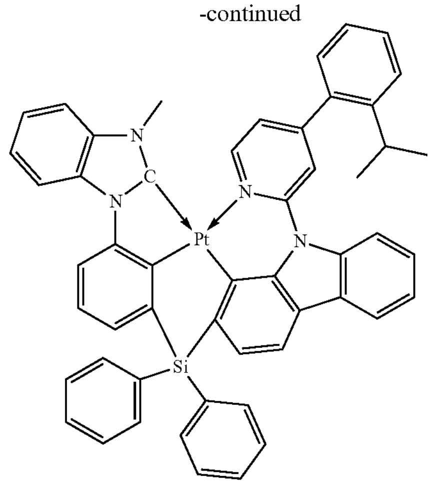
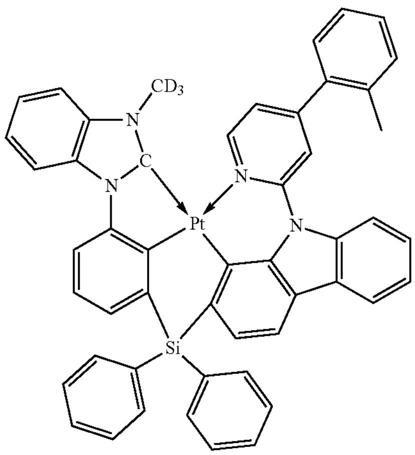
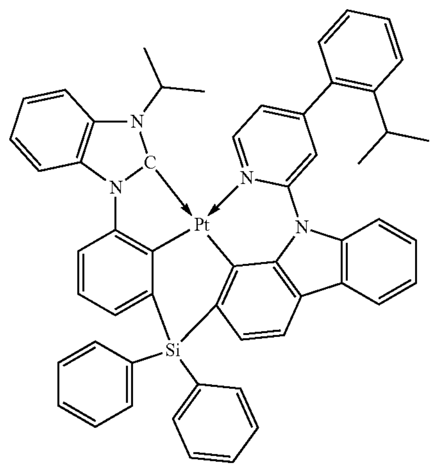
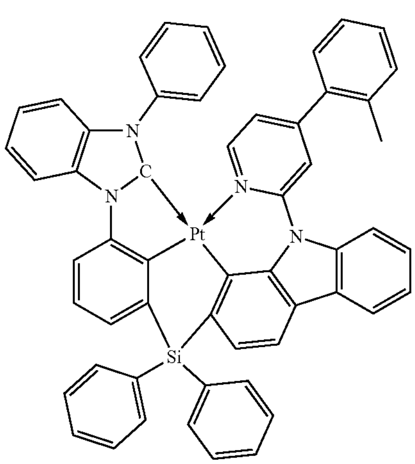
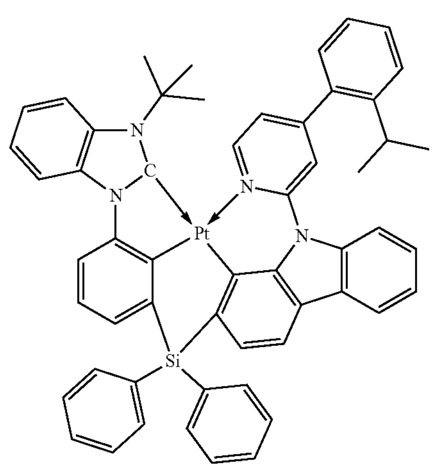

-continued
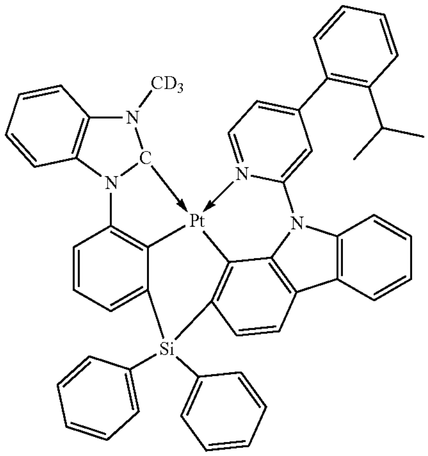
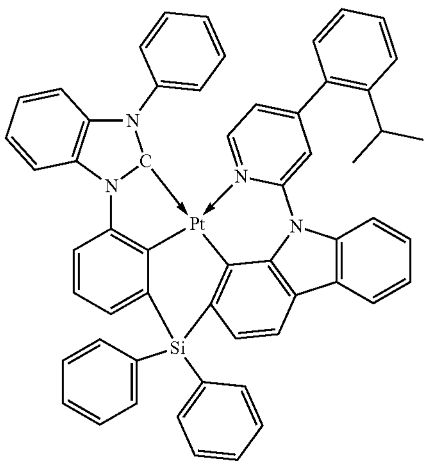
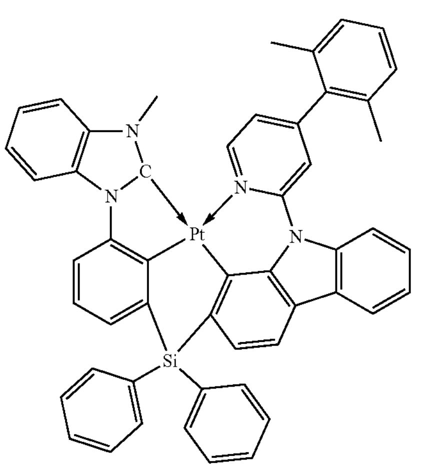
-continued
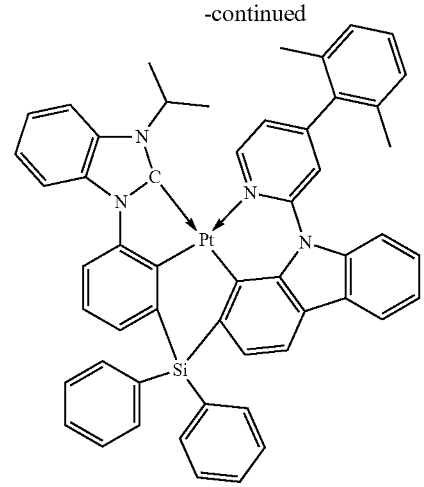
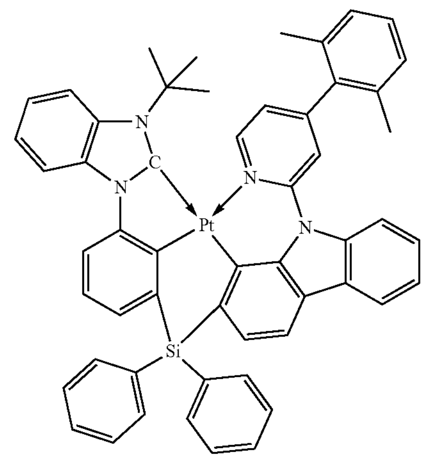
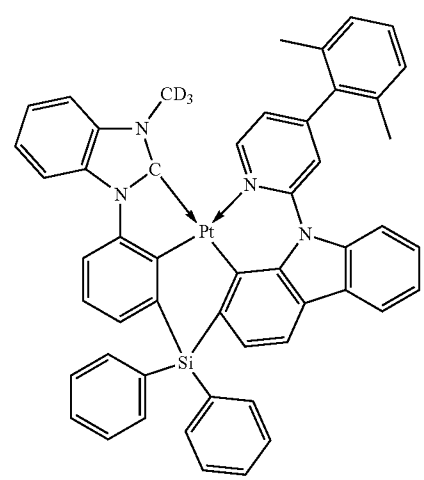

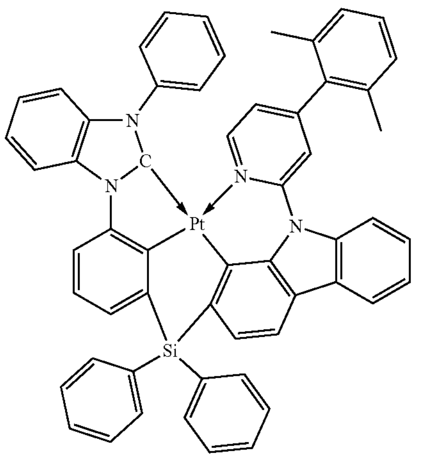
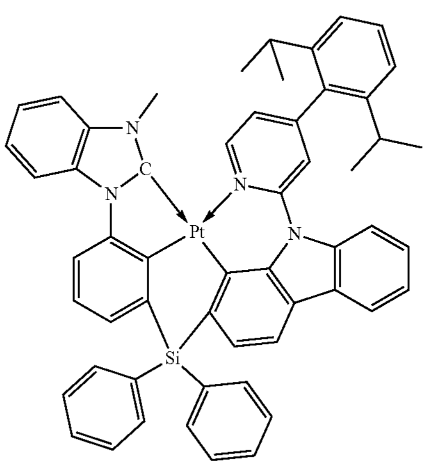
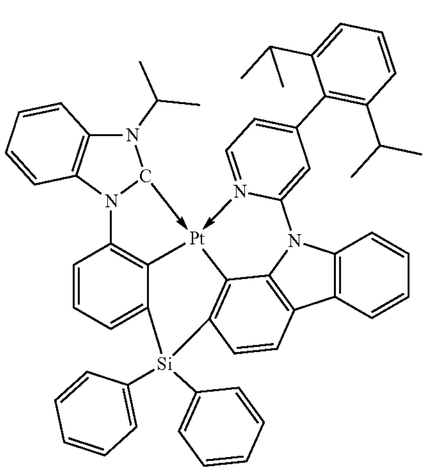
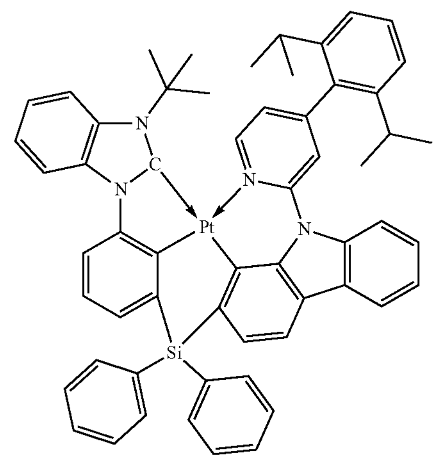
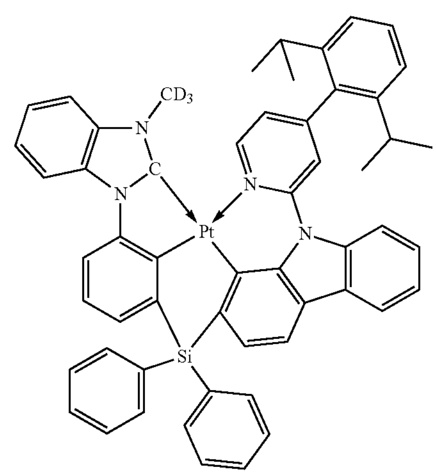
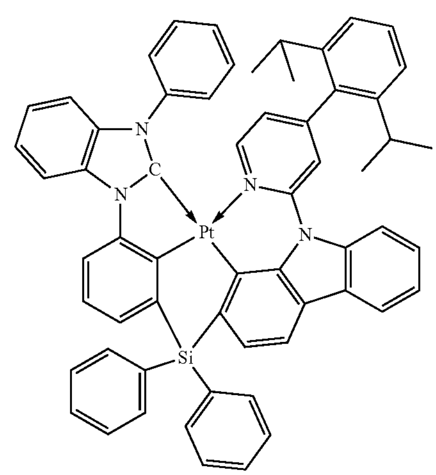

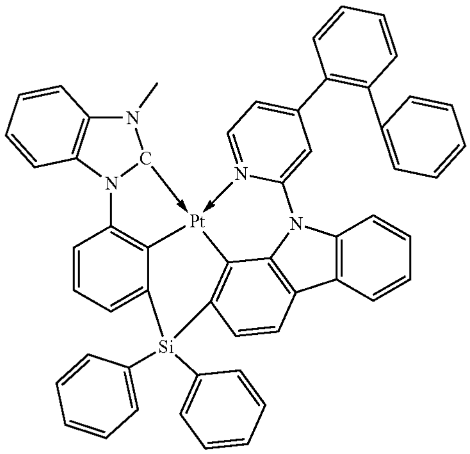
N
C
N
Pt
N
N
Si
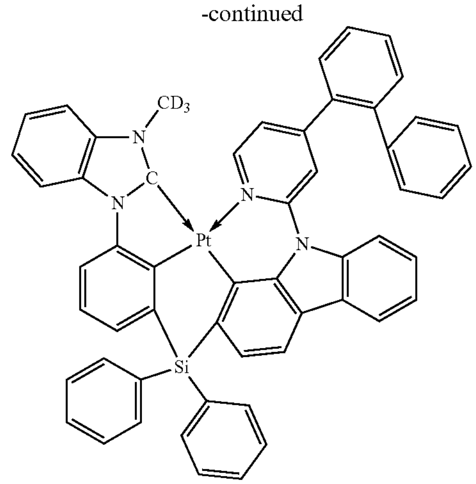
CD3
N
C
N
Pt
N
N
Si
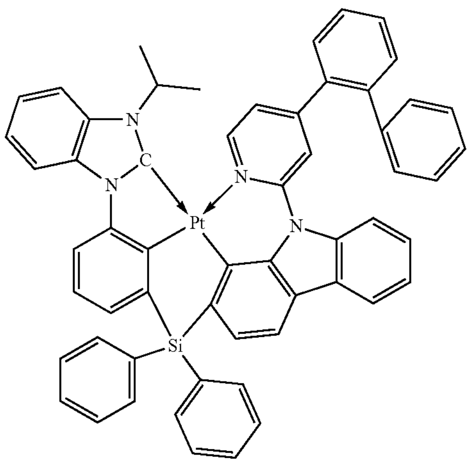
N
C
N
Pt
N
N
Si
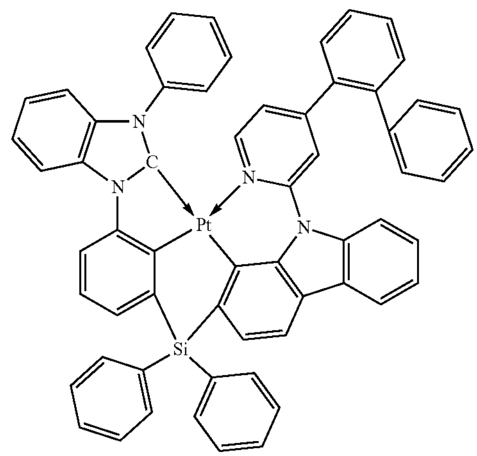
N
C
N
Pt
N
N
Si
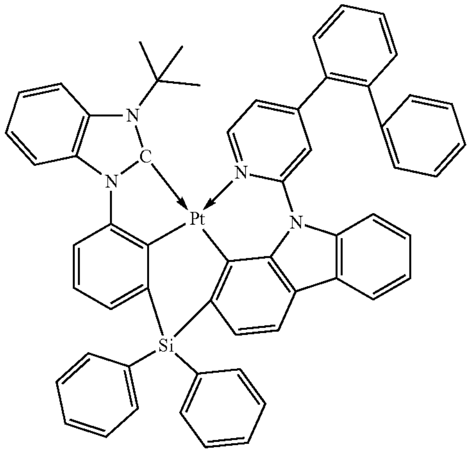
N
C
N
Pt
N
N
Si
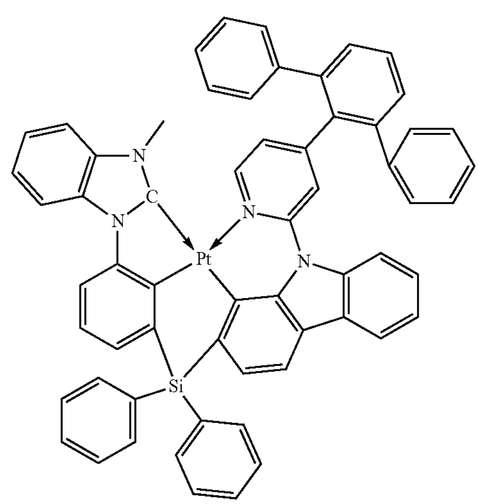
N
C
N
Pt
N
N
Si

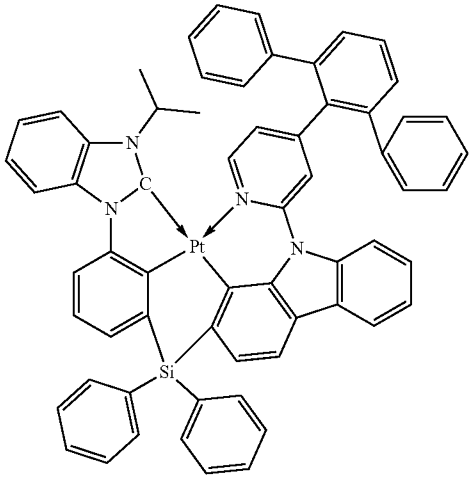
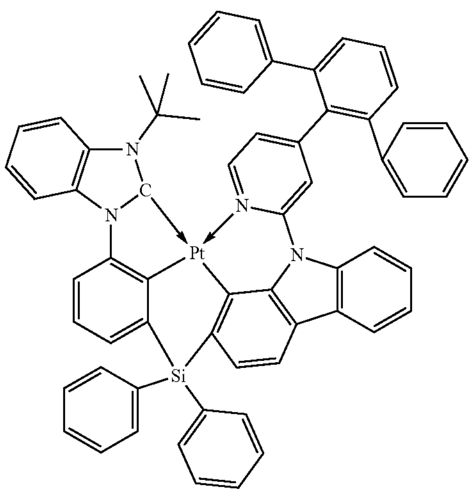
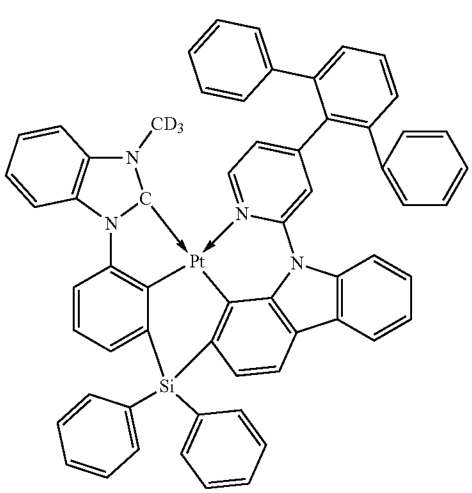
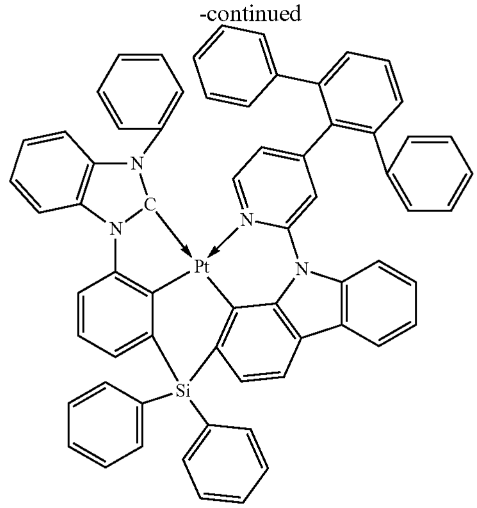
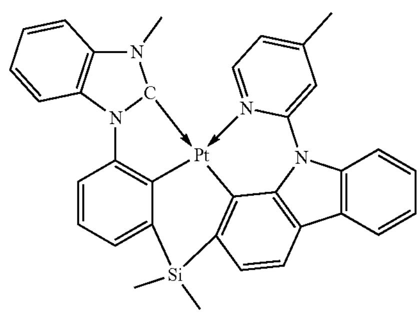
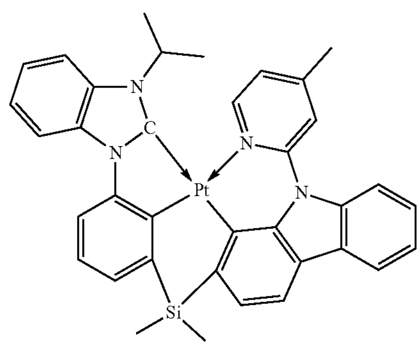
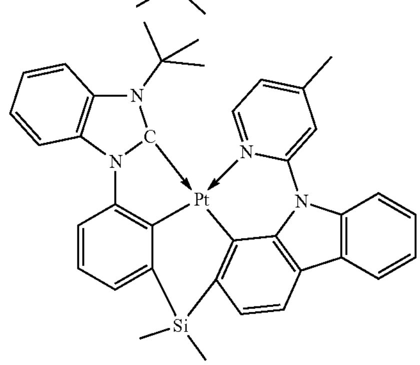

-continued
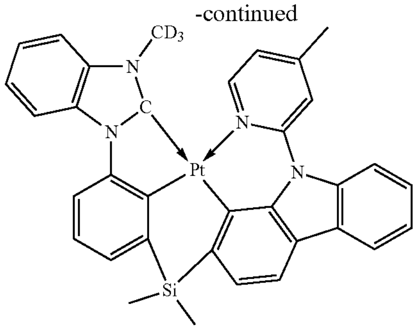
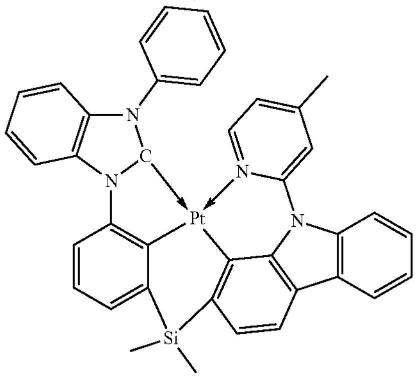
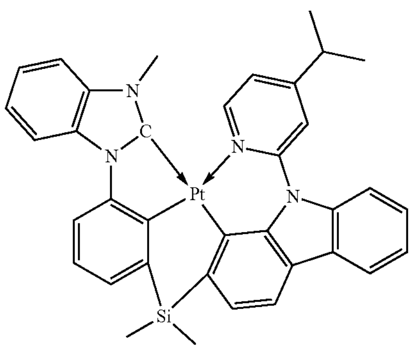
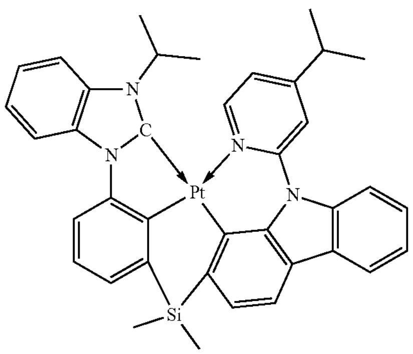
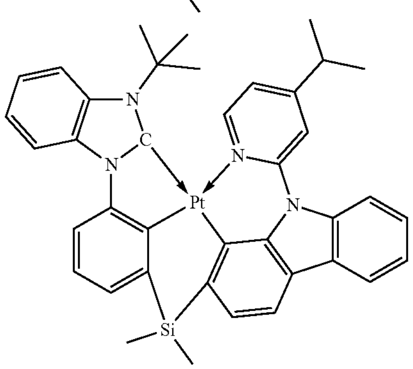
-continued
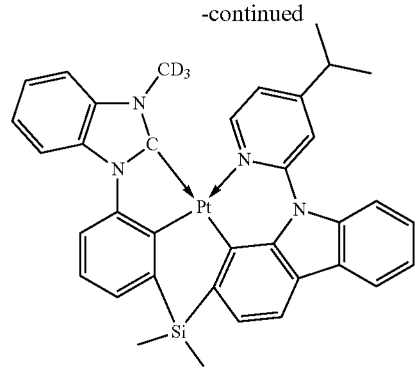
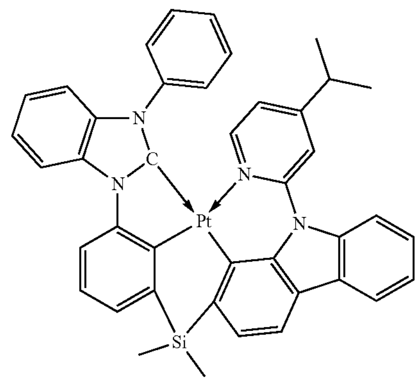
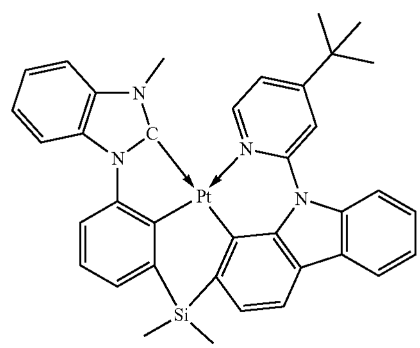
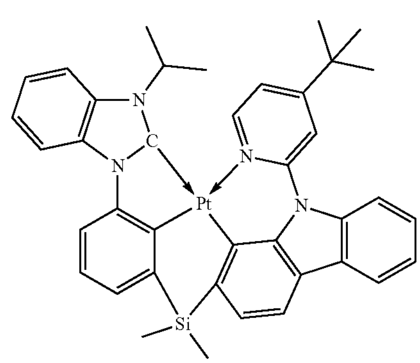

-continued
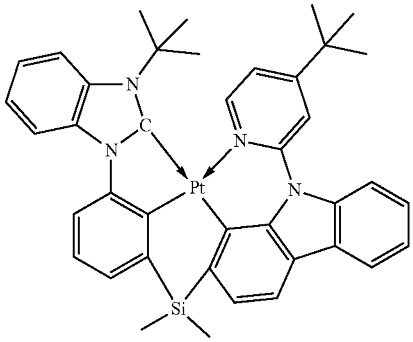
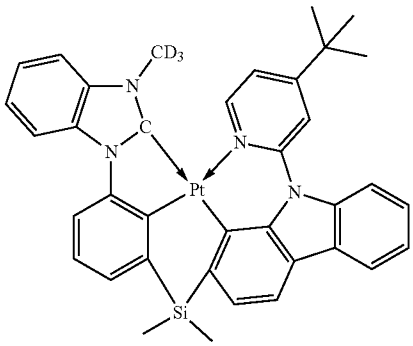
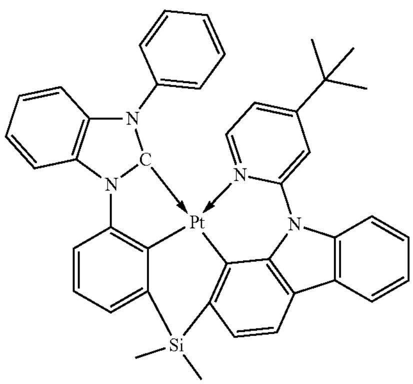
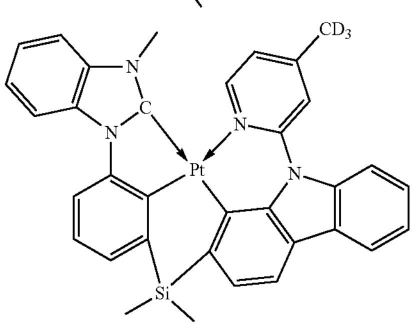
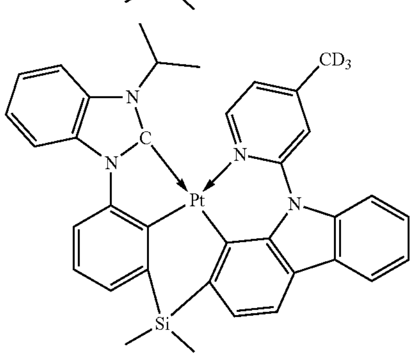
-continued
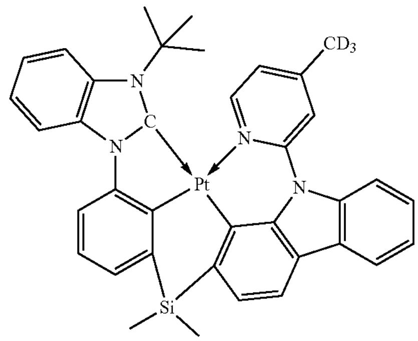
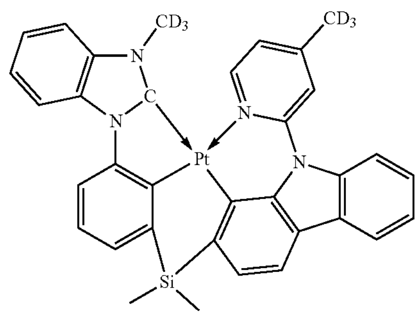
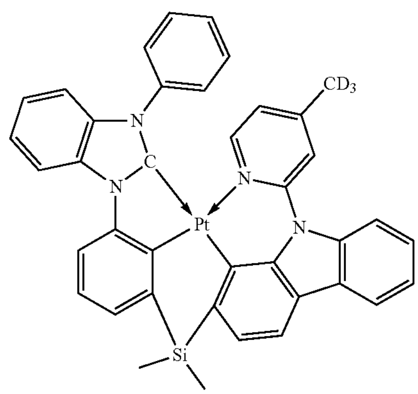
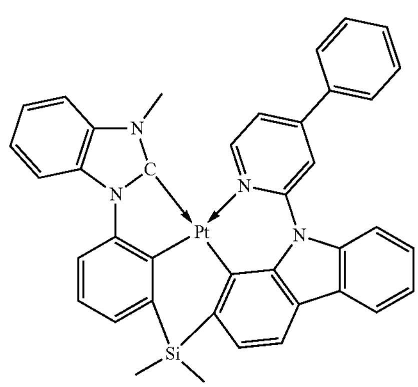

-continued
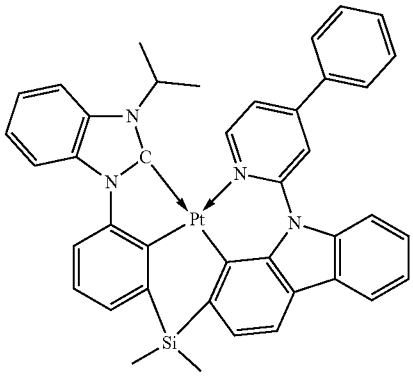
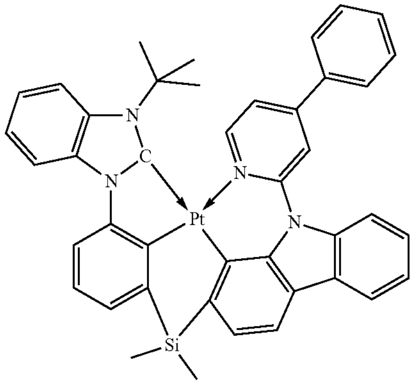
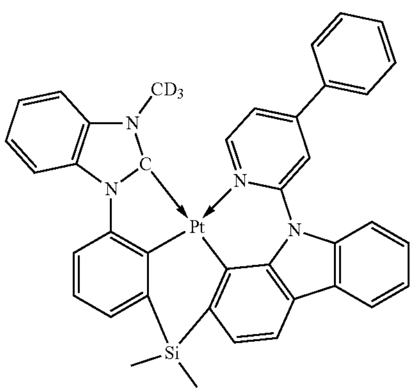
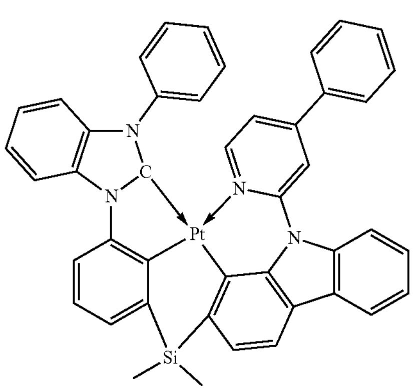
-continued
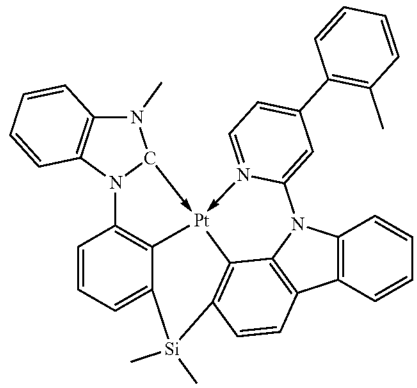
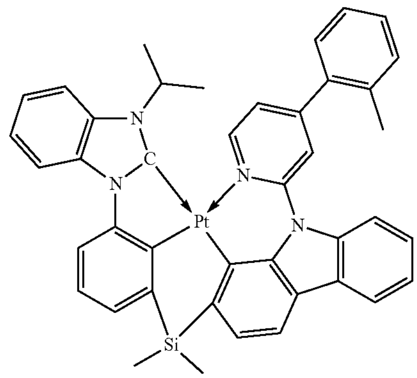
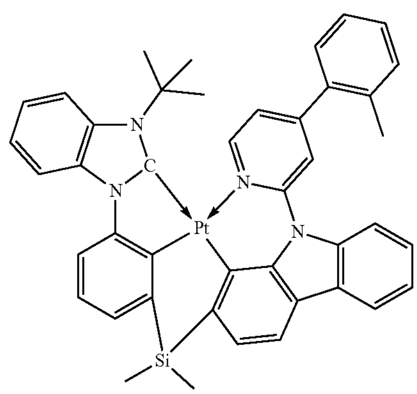
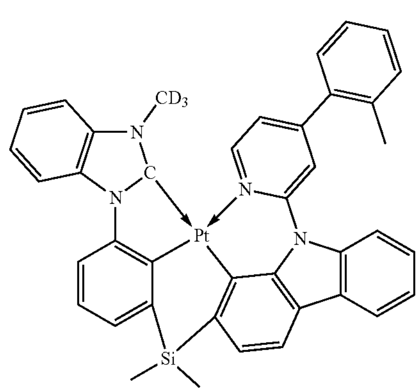

-continued
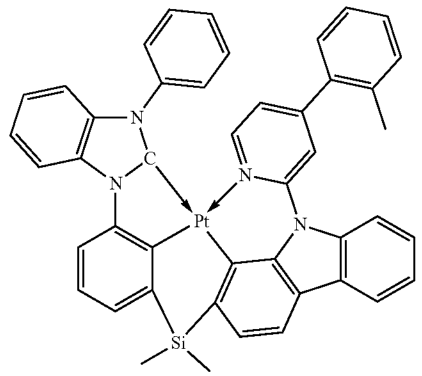
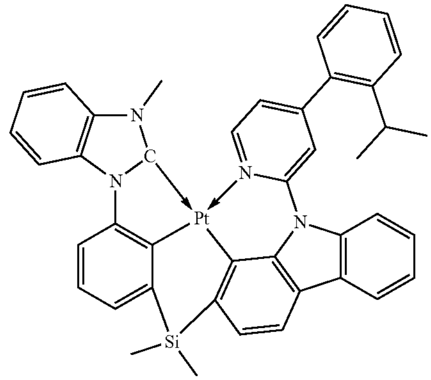
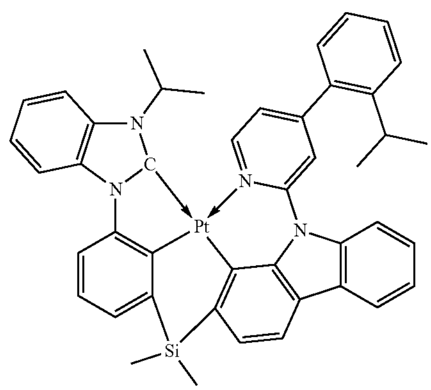
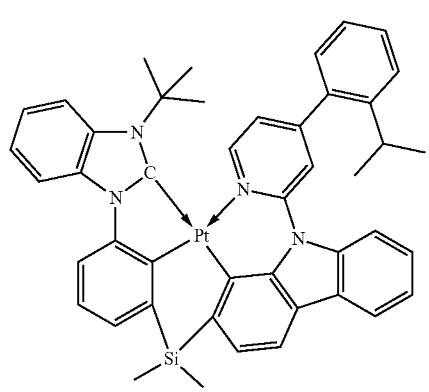
-continued
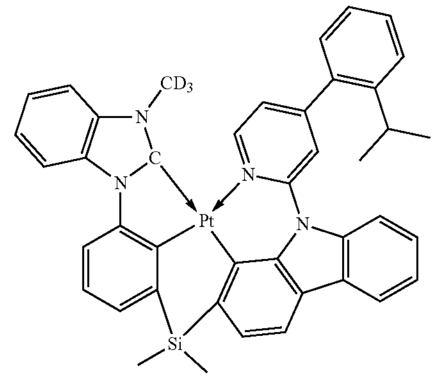
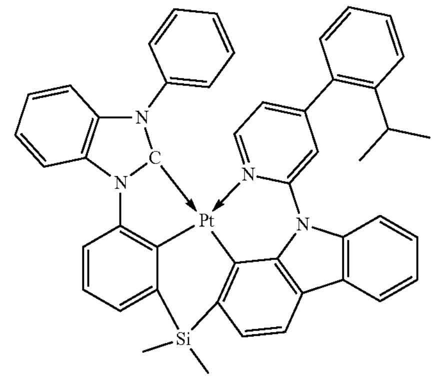
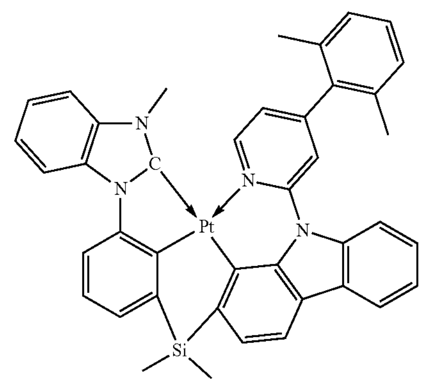
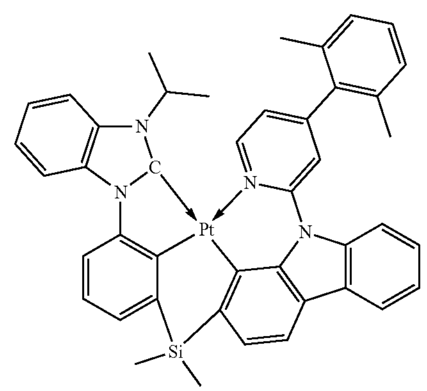

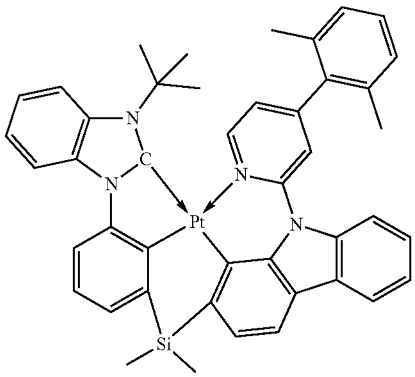
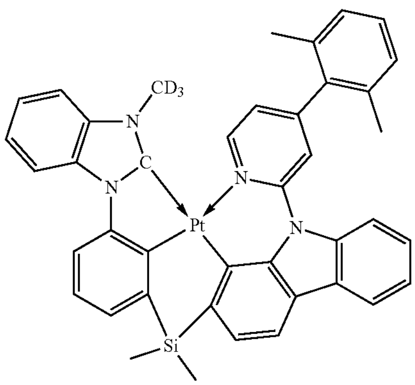
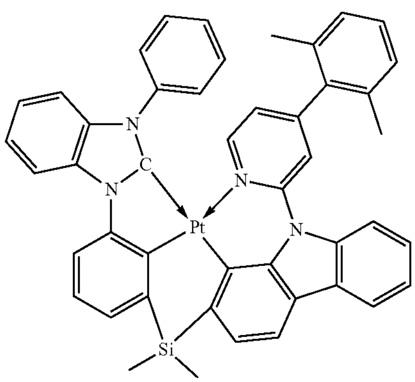
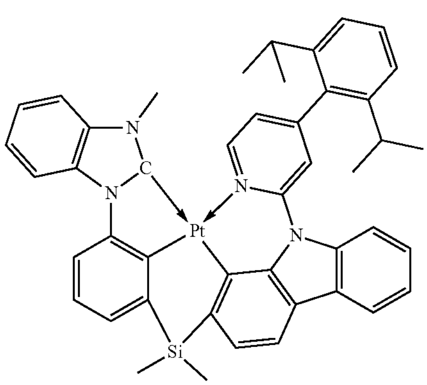
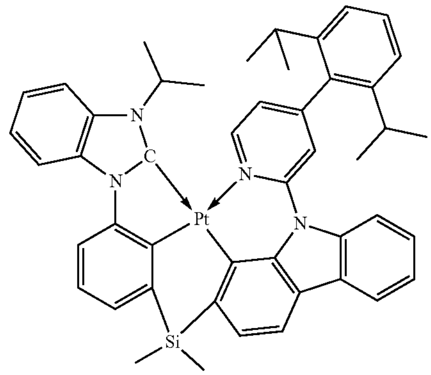
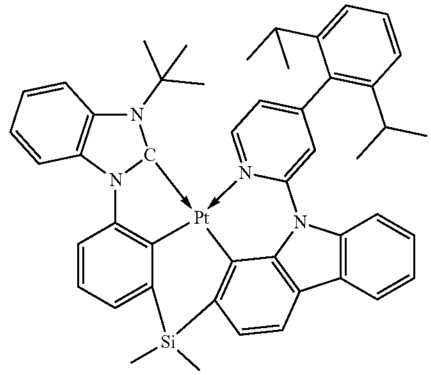
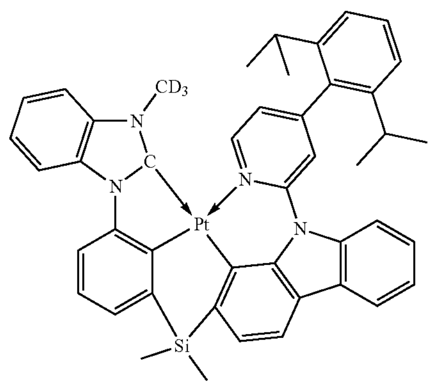
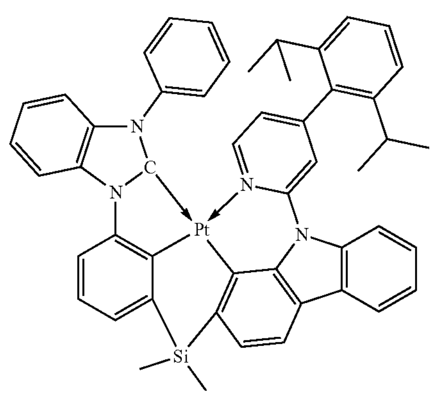

-continued
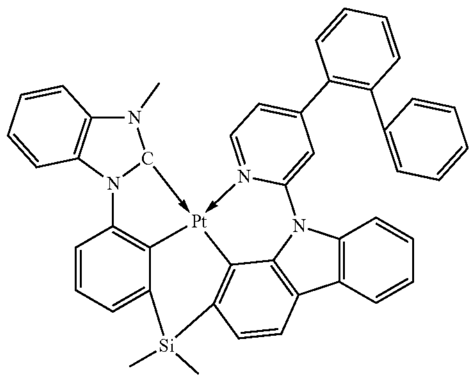
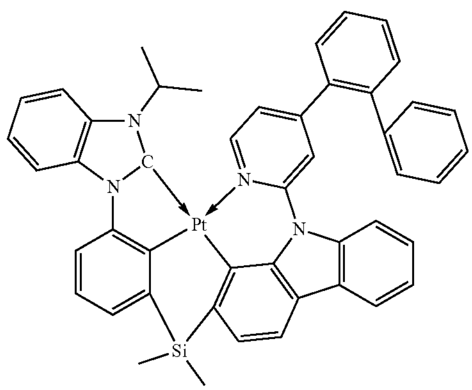
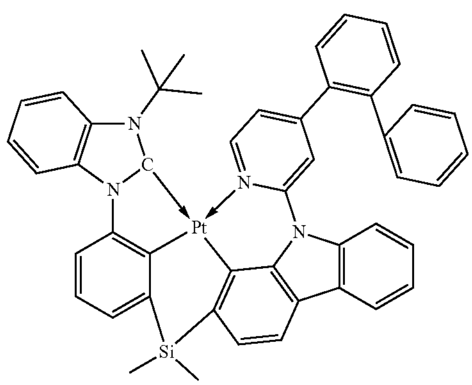
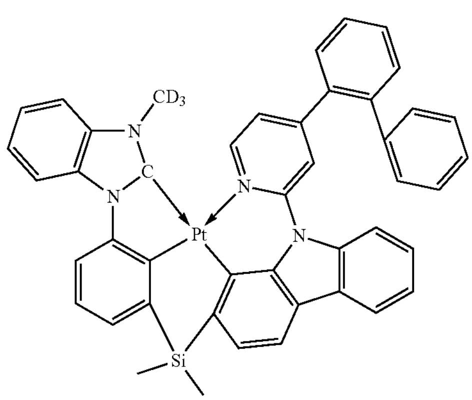
-continued
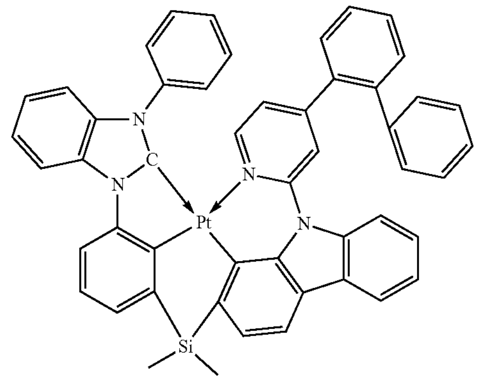
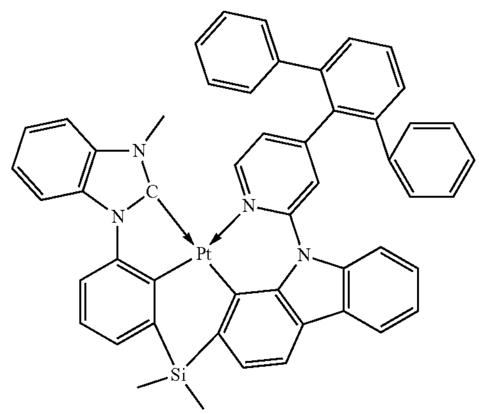
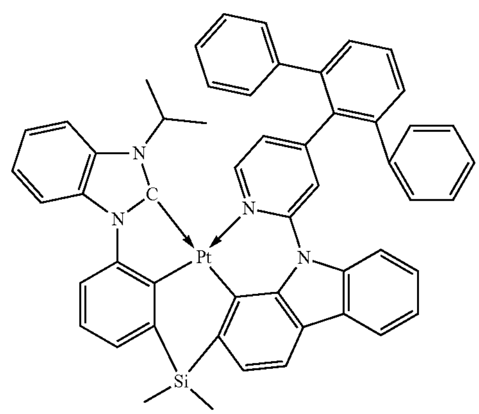
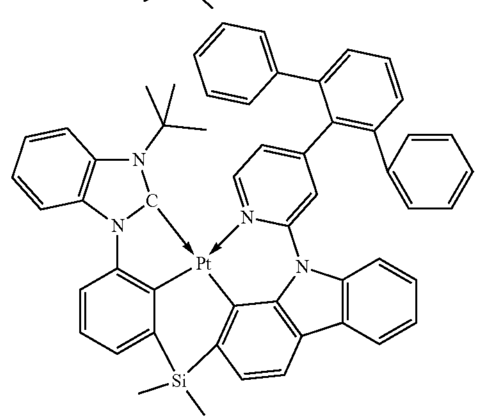

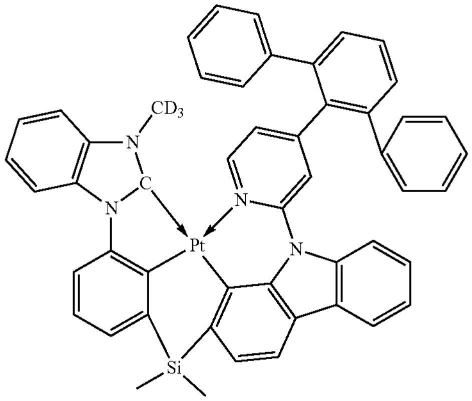
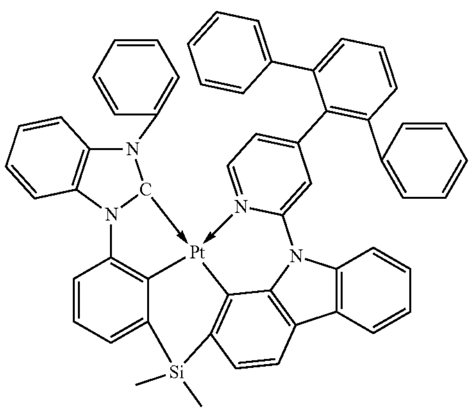
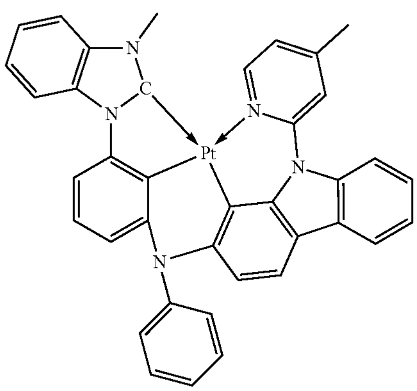
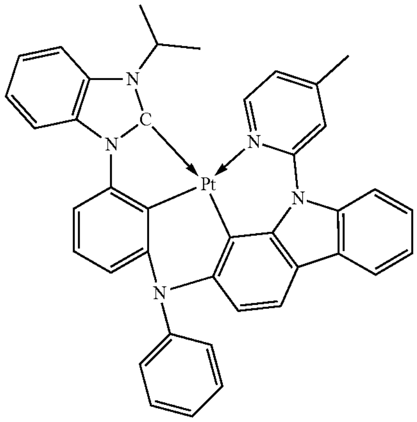
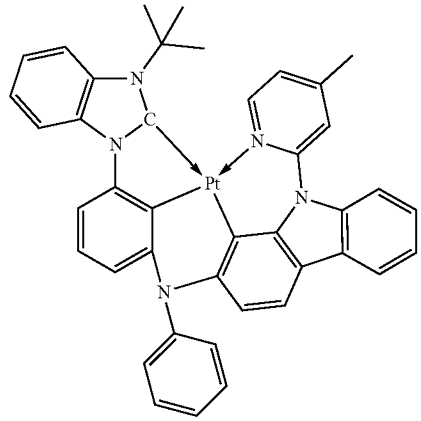
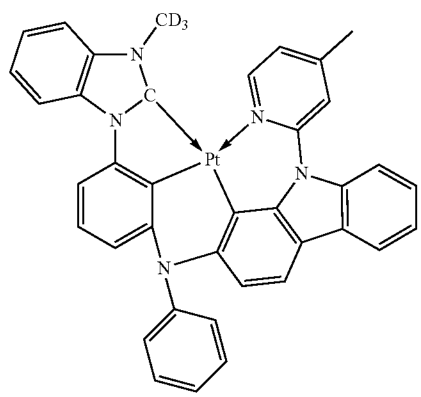
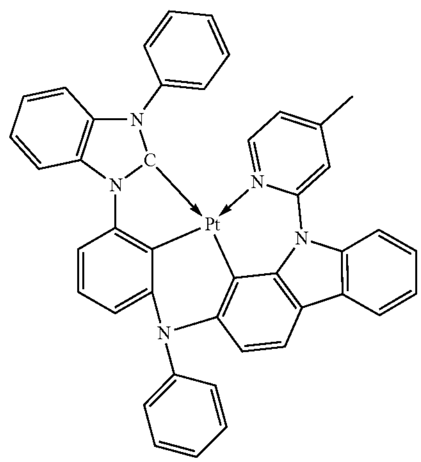
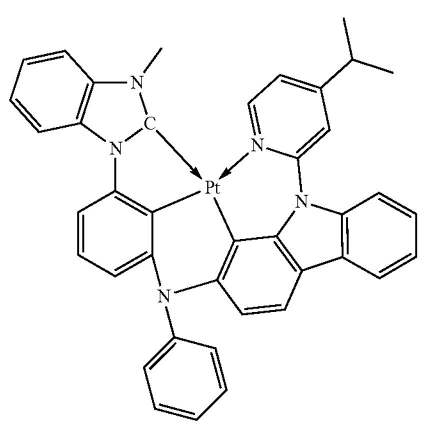

-continued
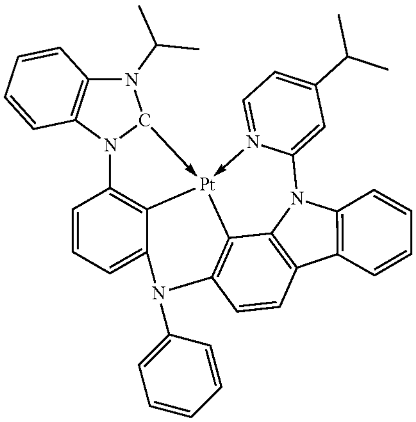
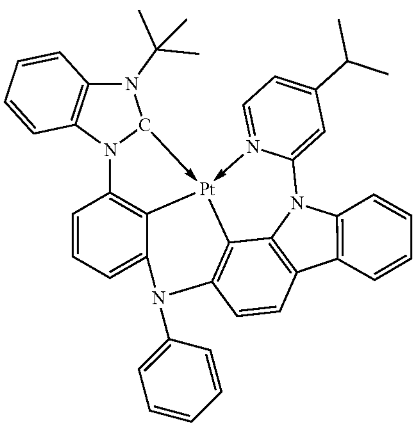
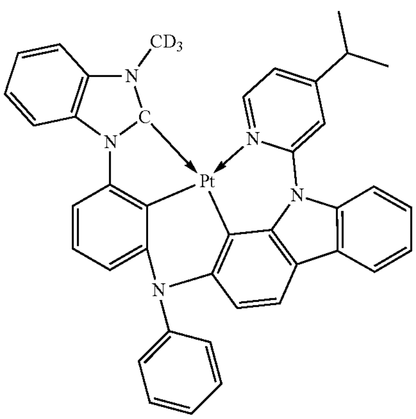
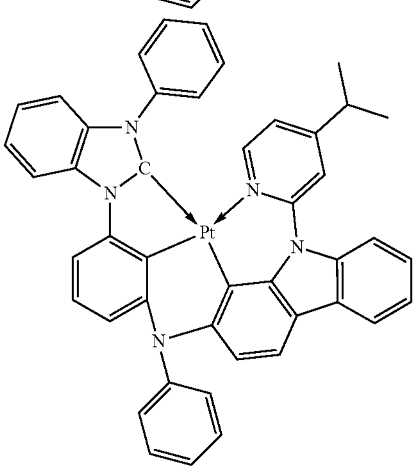
-continued
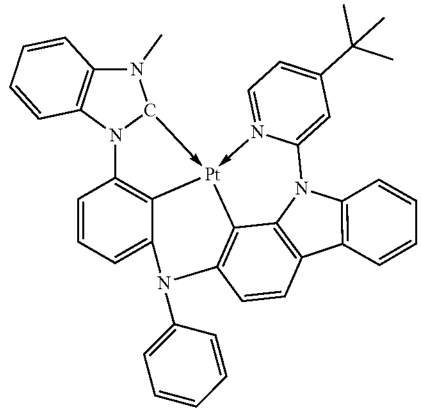
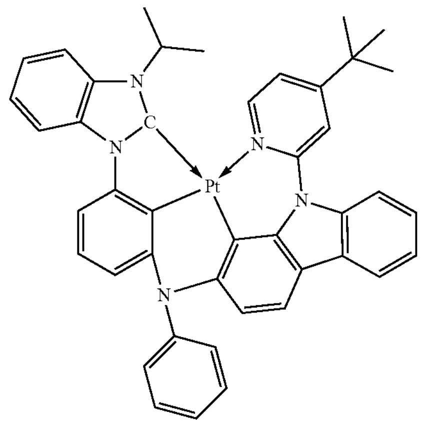
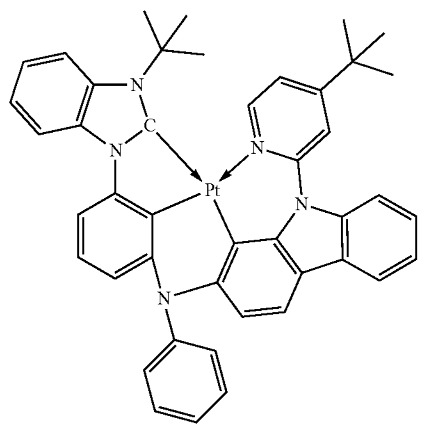
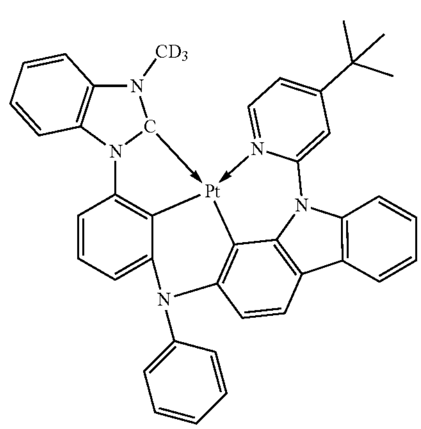

-continued
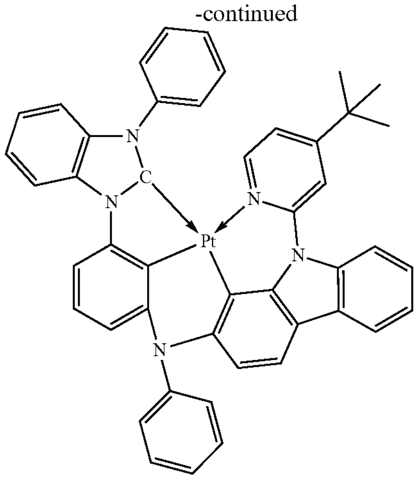
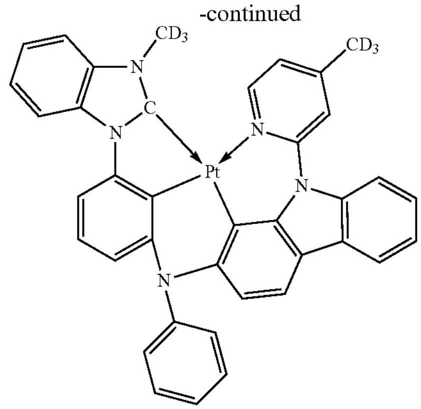
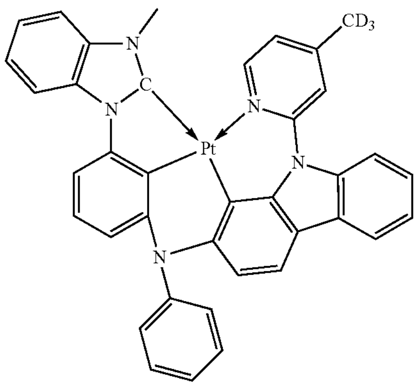
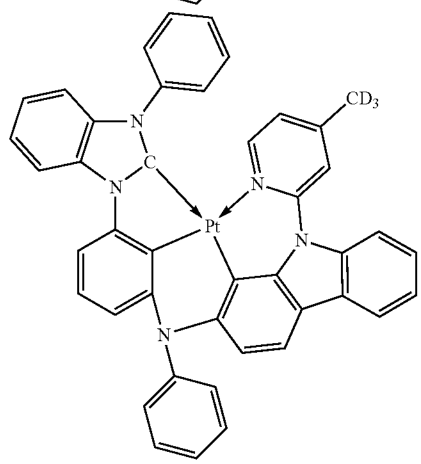
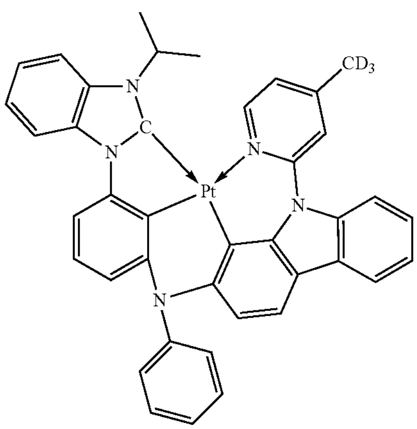
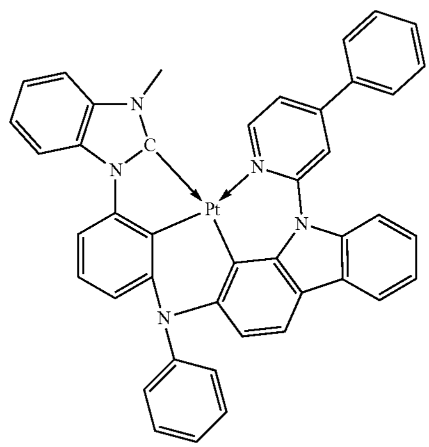
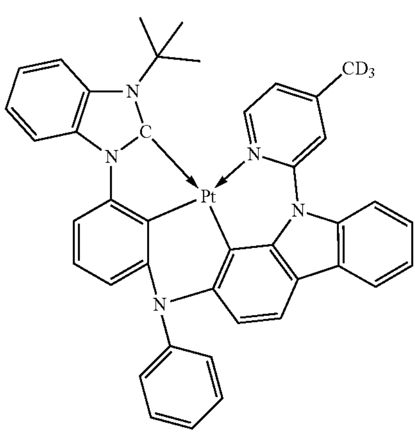
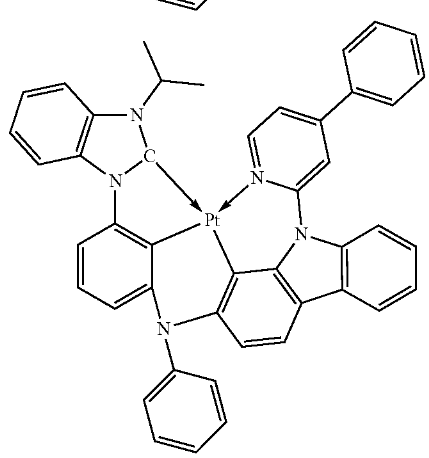

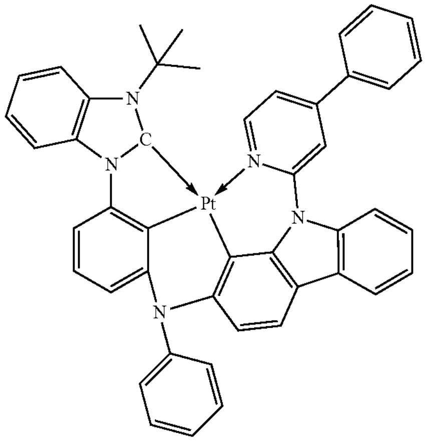
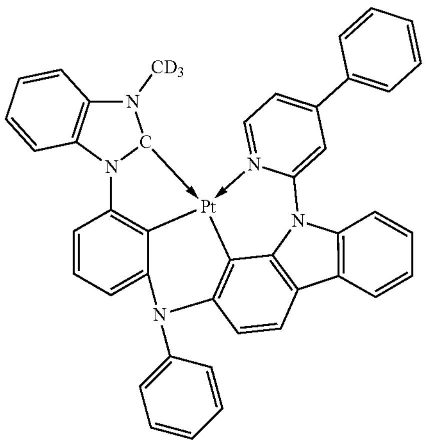
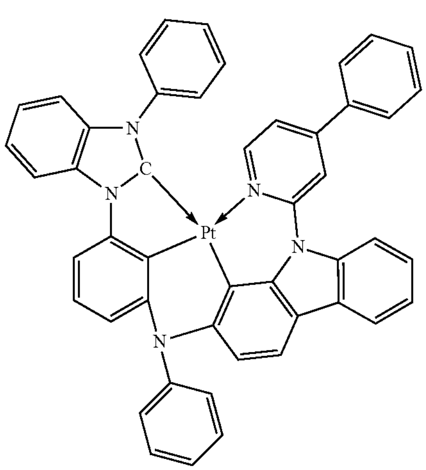
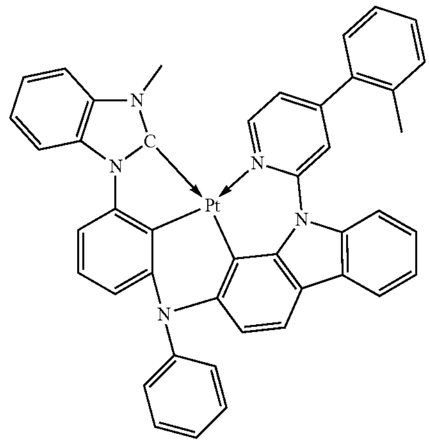
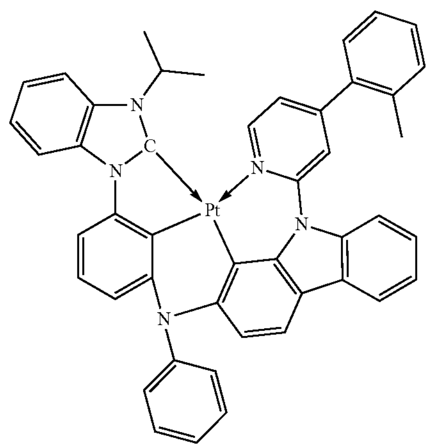
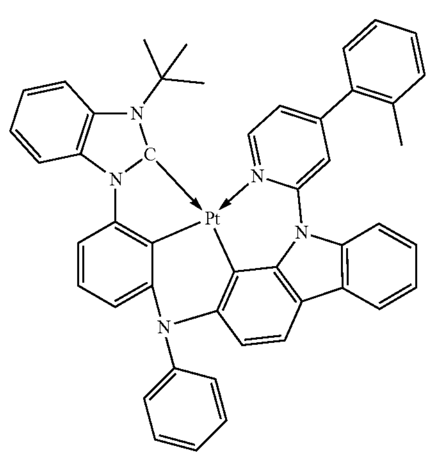

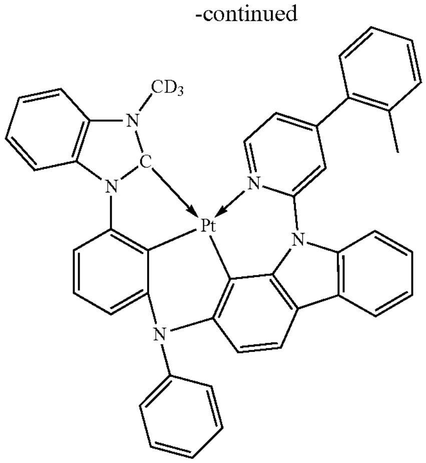
CD3
N
C
N
Pt
N
N
N
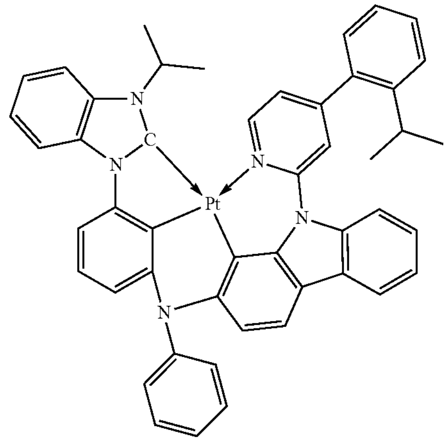
N
C
N
Pt
N
N
N
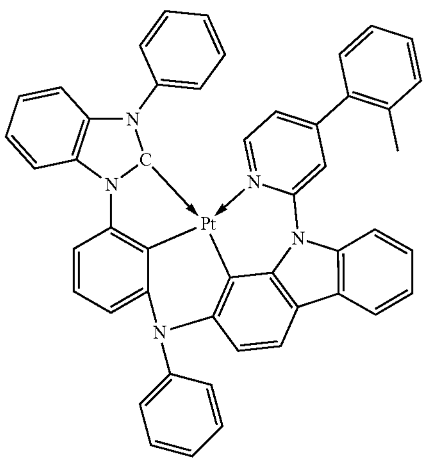
N
C
N
Pt
N
N
N
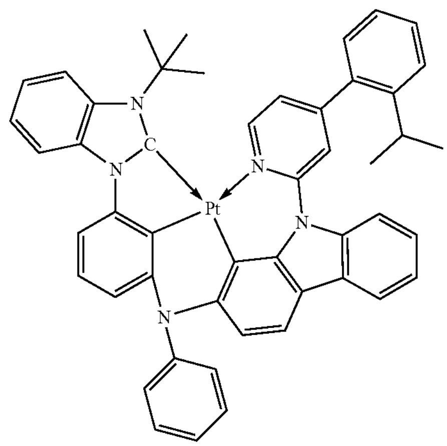
N
C
N
Pt
N
N
N
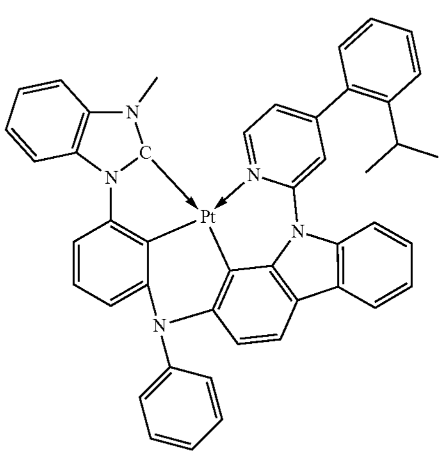
N
C
N
Pt
N
N
N
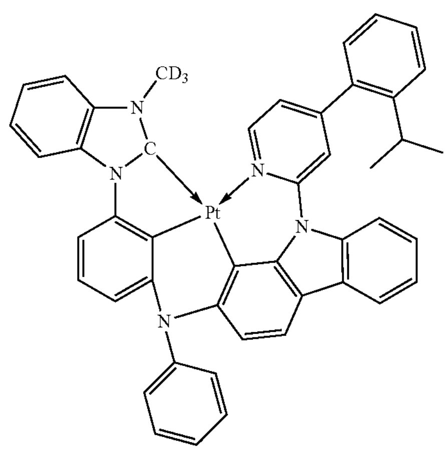
CD3
N
C
N
Pt
N
N
N -continued
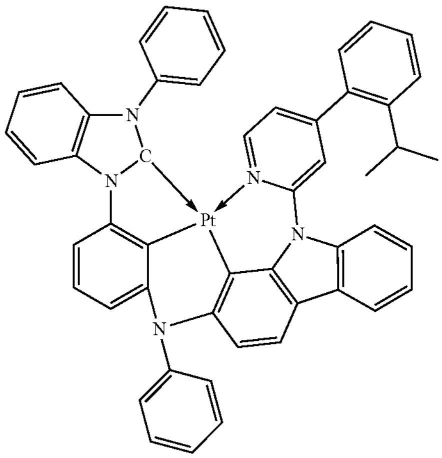
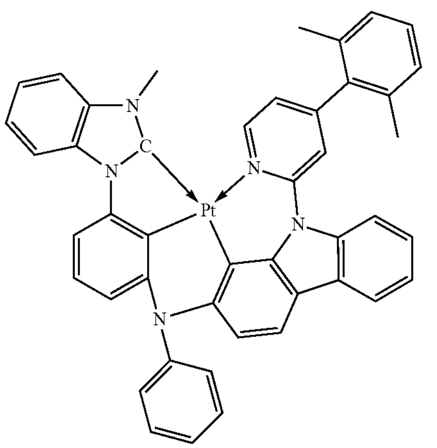
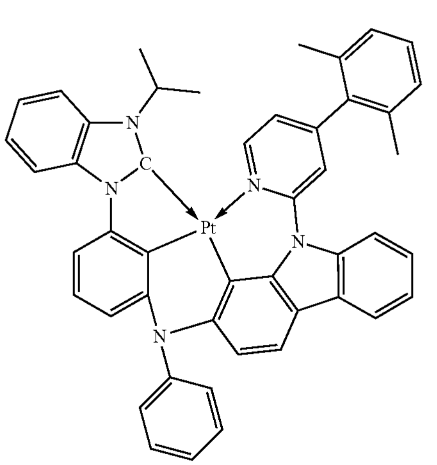
-continued
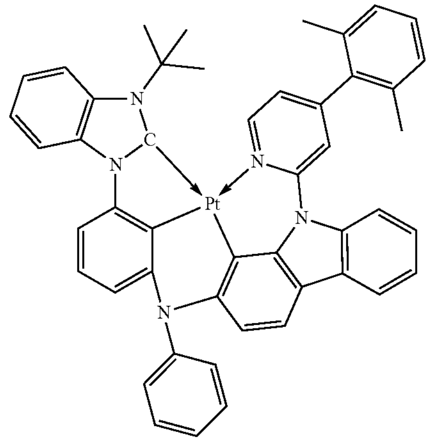
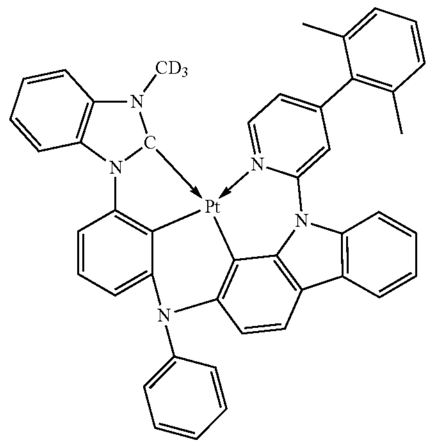
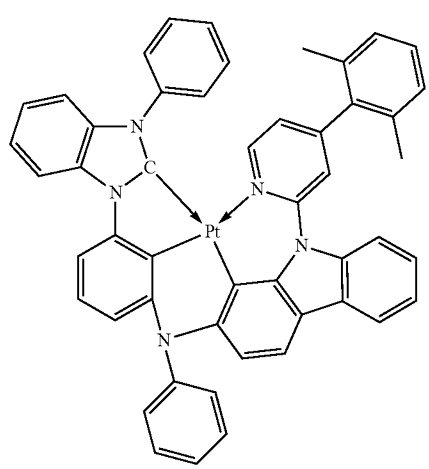

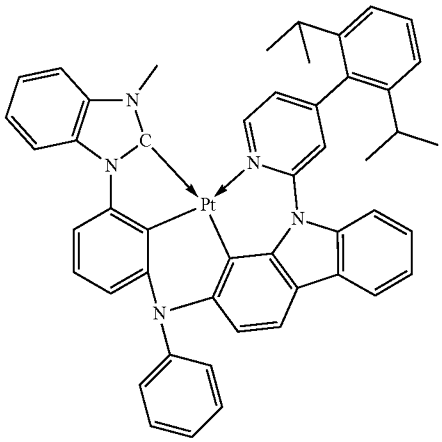
N
C
N
Pt
N
N
N
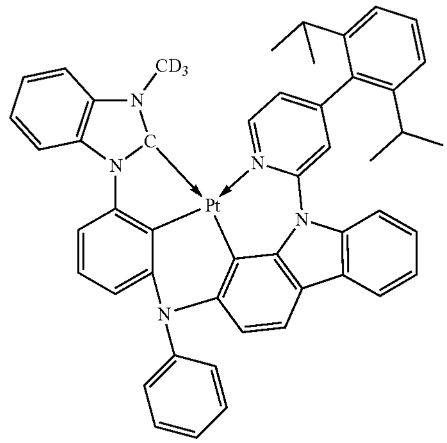
$CD_3$
N
C
N
Pt
N
N
N
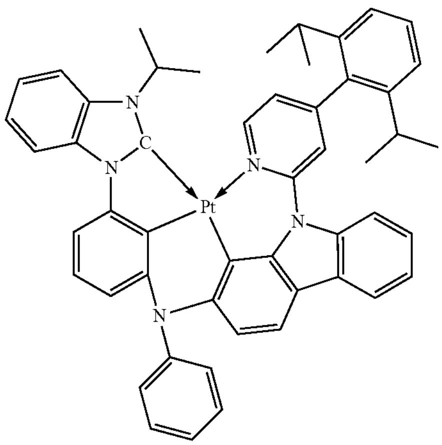
N
C
N
Pt
N
N
N
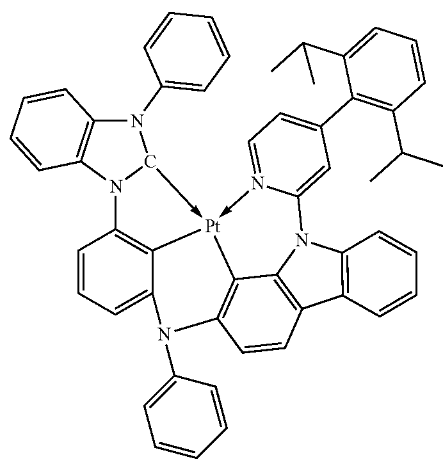
N
C
N
Pt
N
N
N
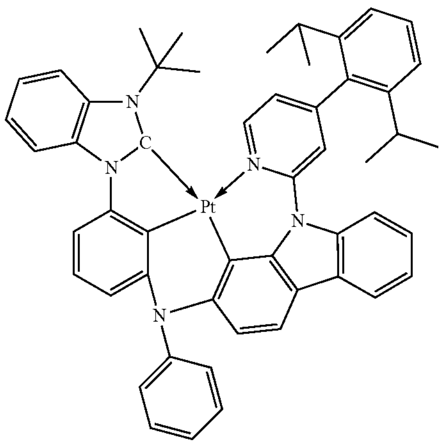
N
C
N
Pt
N
N
N
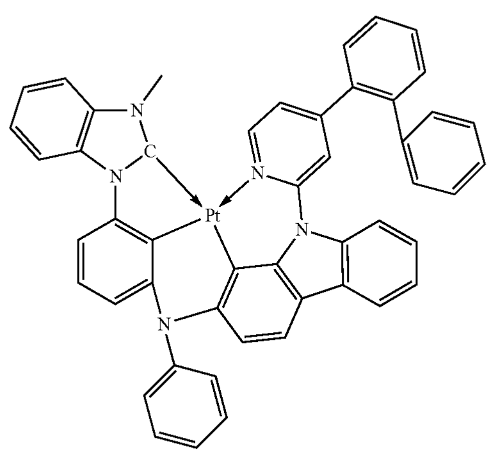
N
C
N
Pt
N
N
N

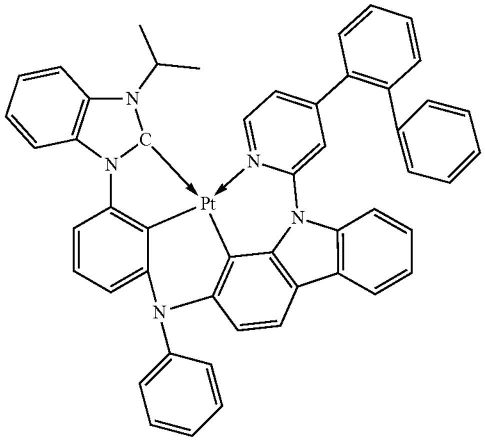
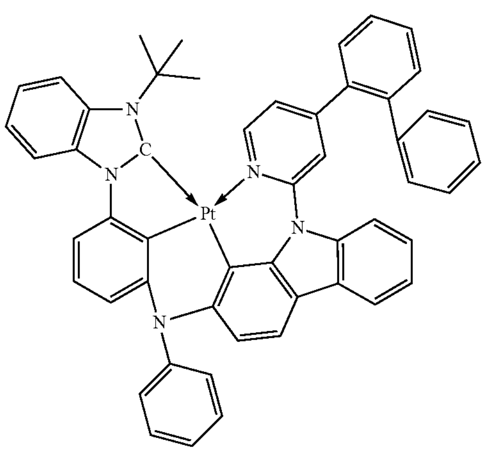
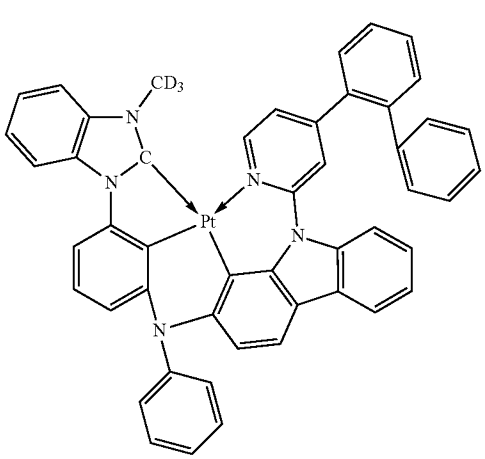
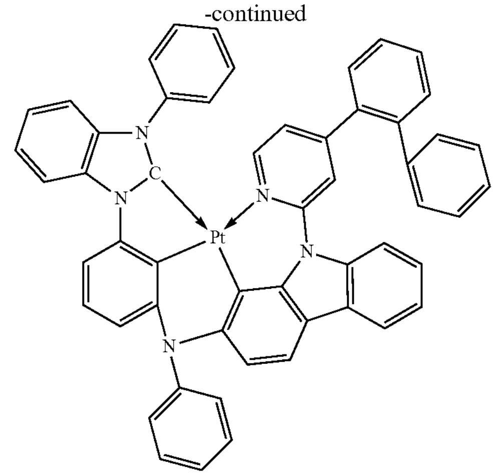
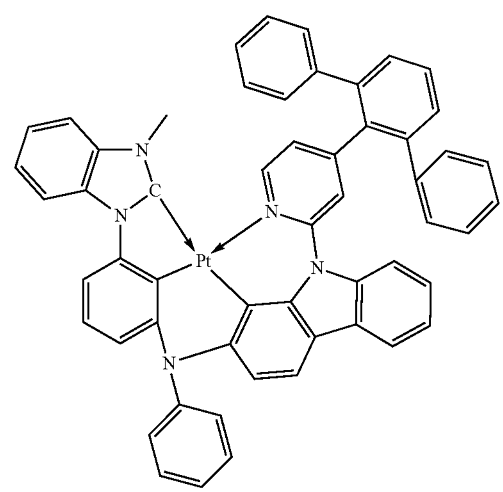
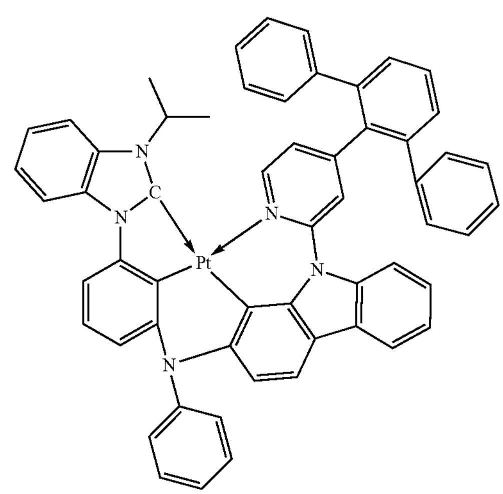

-continued
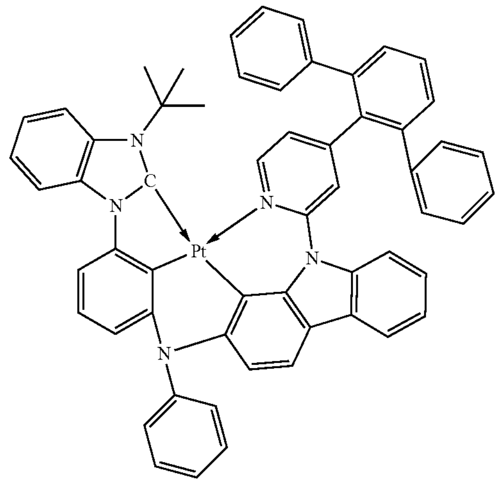
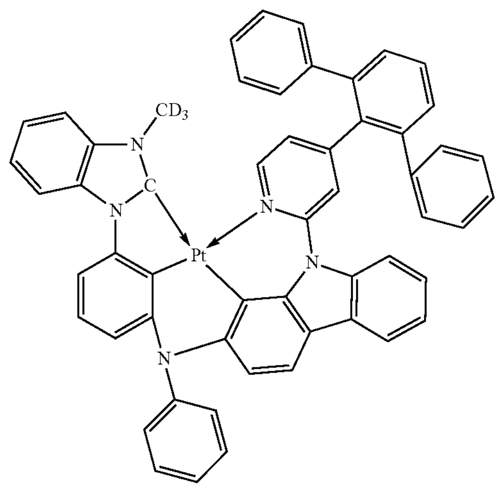
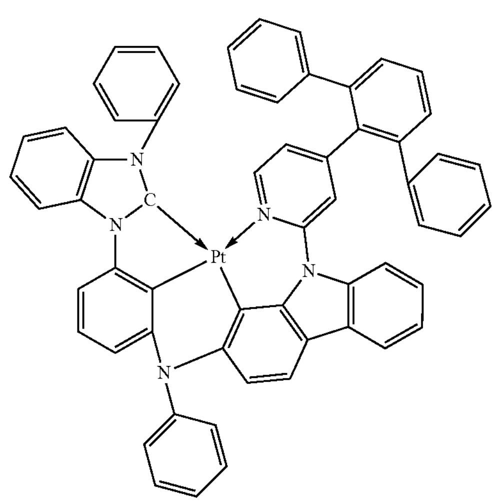
-continued
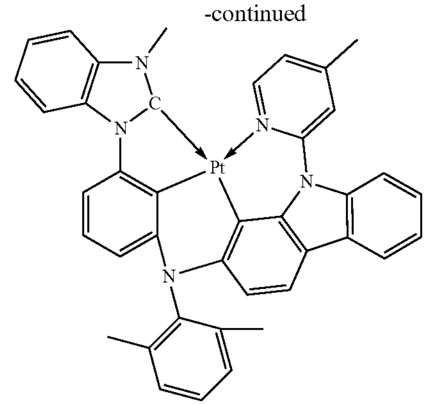
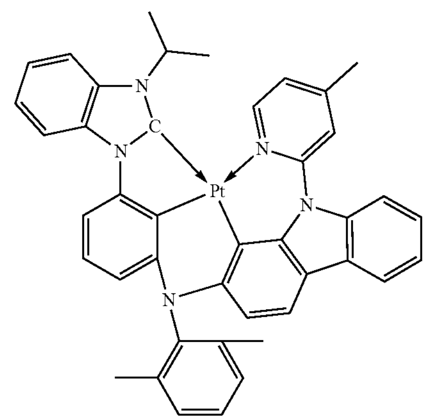
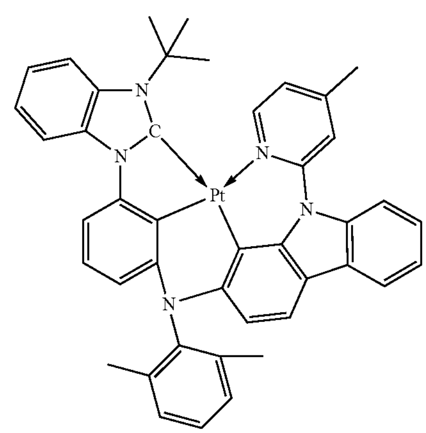
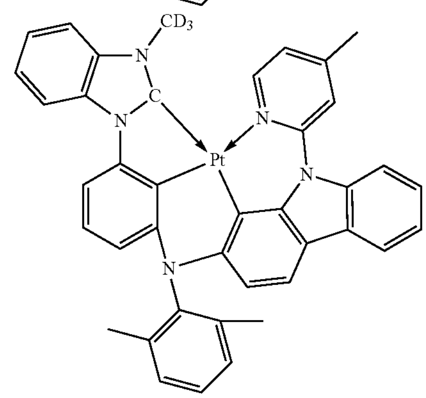

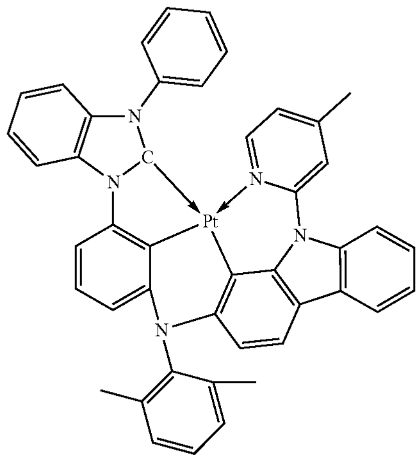
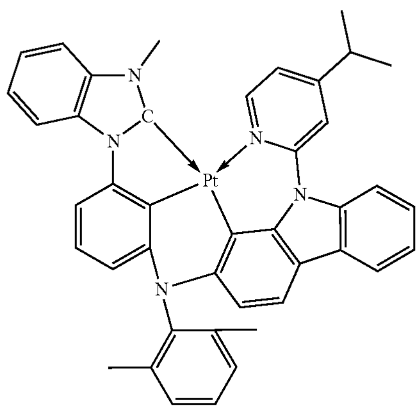
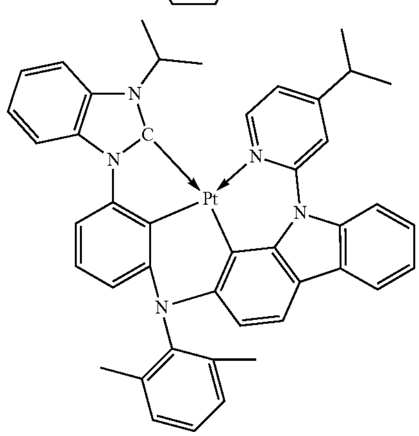
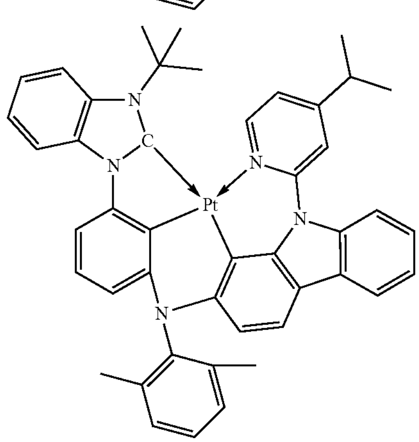
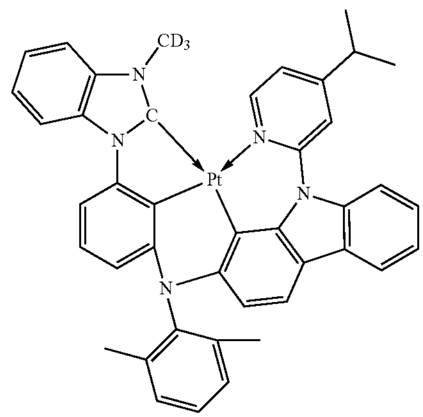
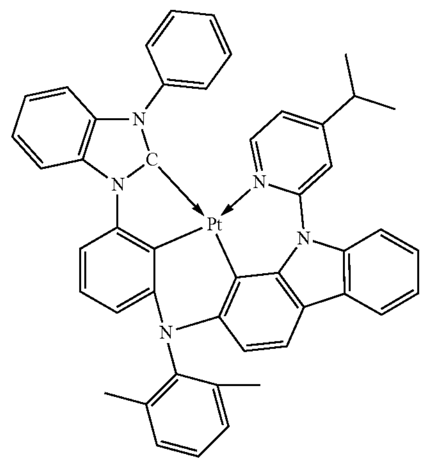
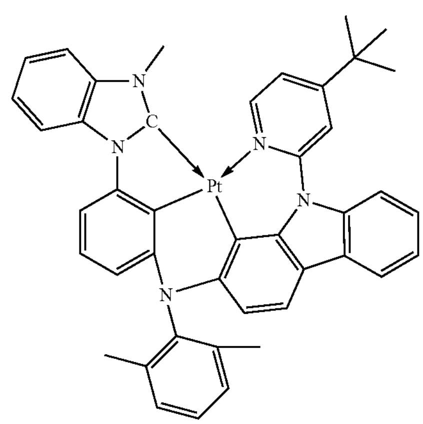
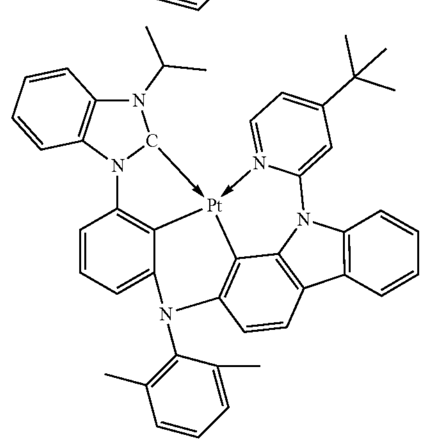

-continued
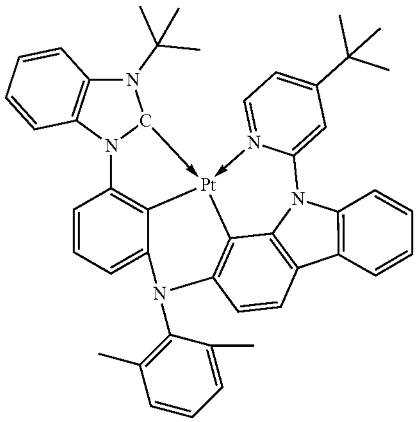
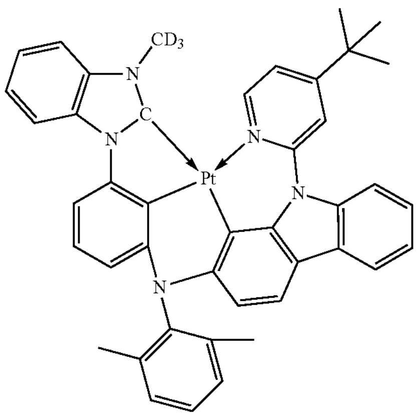
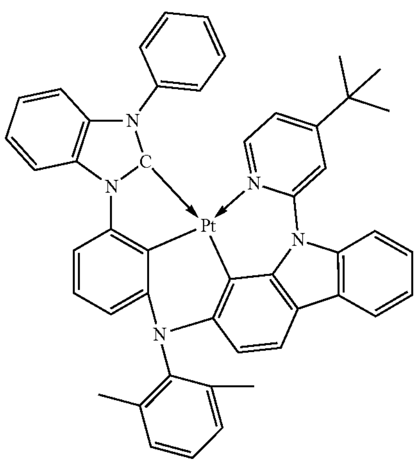
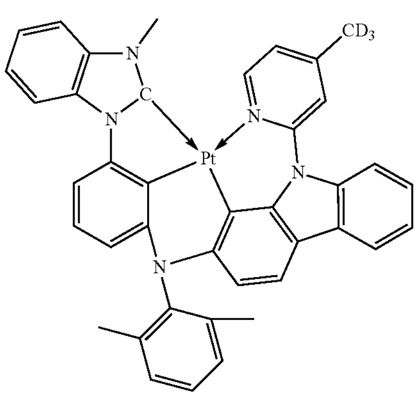
-continued
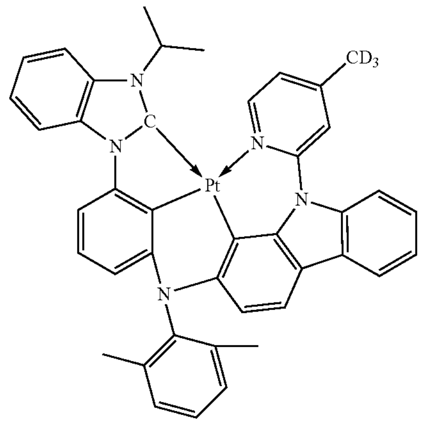
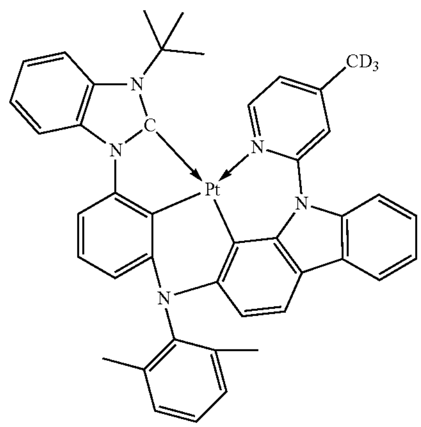
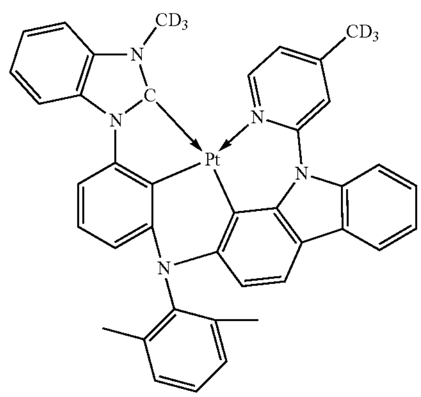
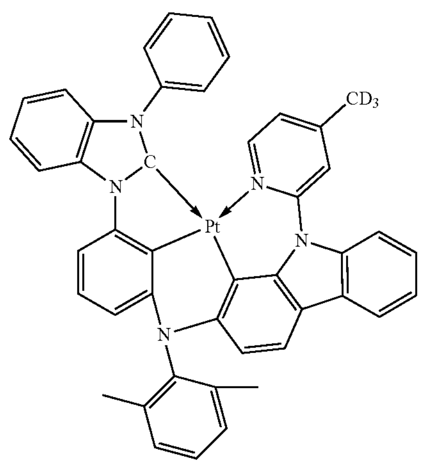

-continued
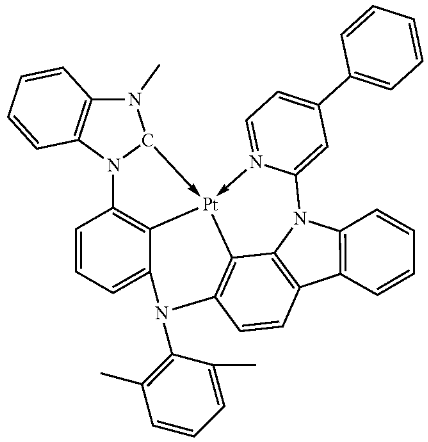
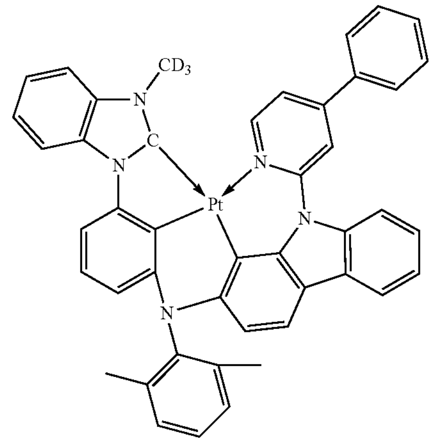
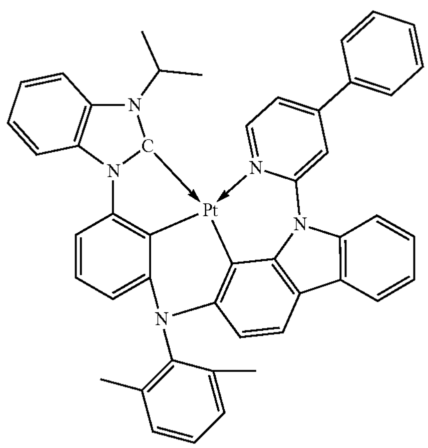
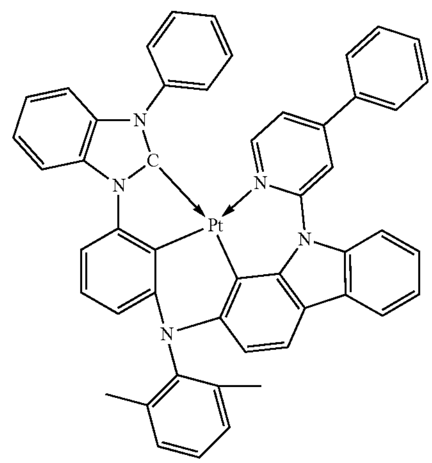
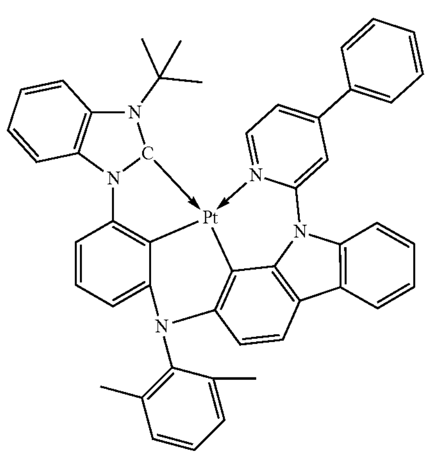
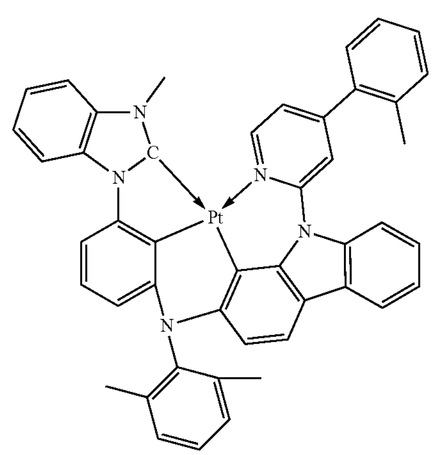

-continued
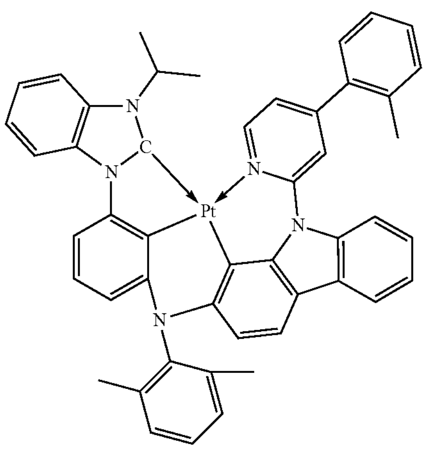
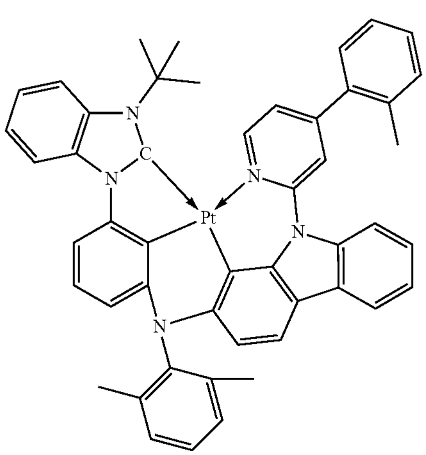
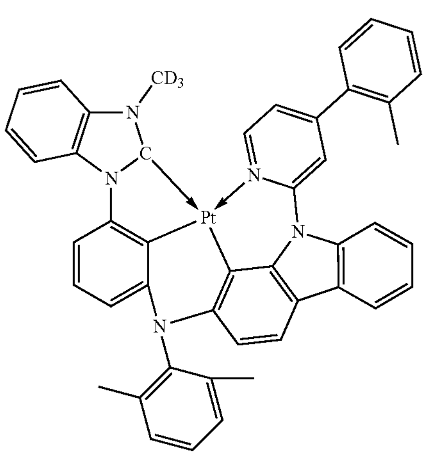
-continued
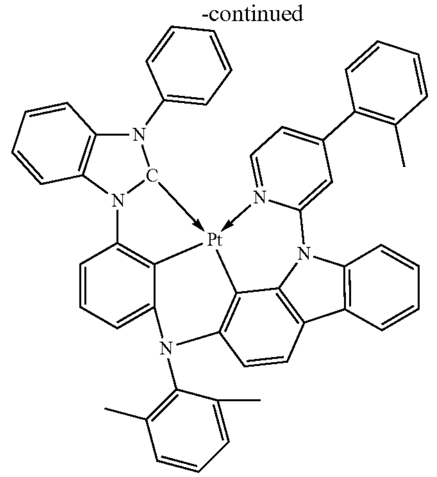
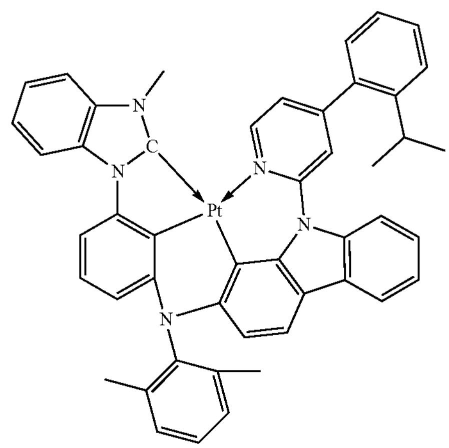
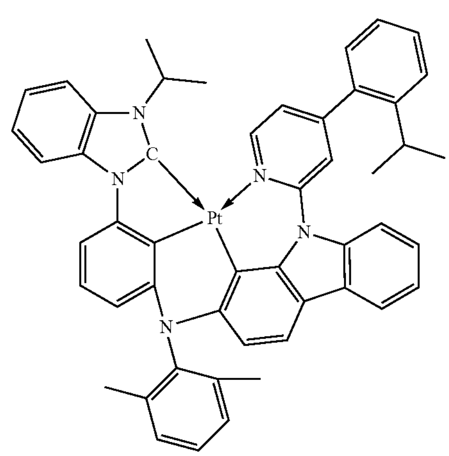

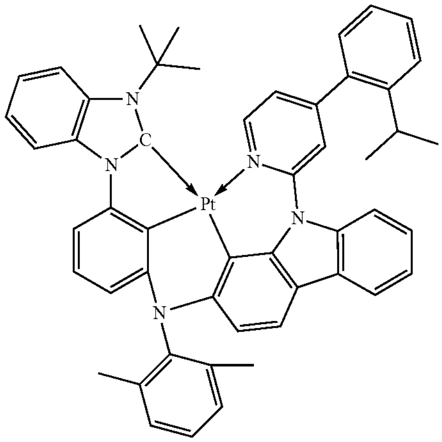
N
C
N
Pt
N
N
N
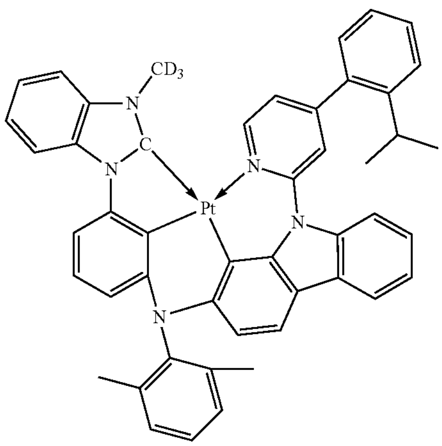
CD3
N
C
N
Pt
N
N
N
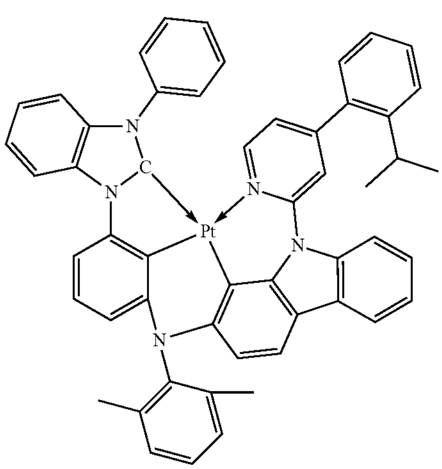
N
C
N
Pt
N
N
N
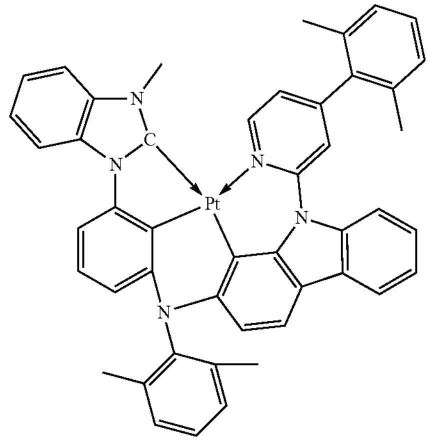
N
C
N
Pt
N
N
N
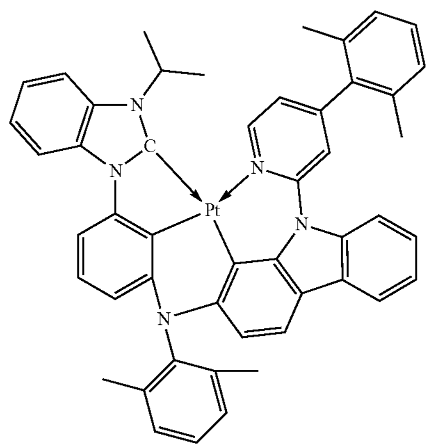
N
C
N
Pt
N
N
N
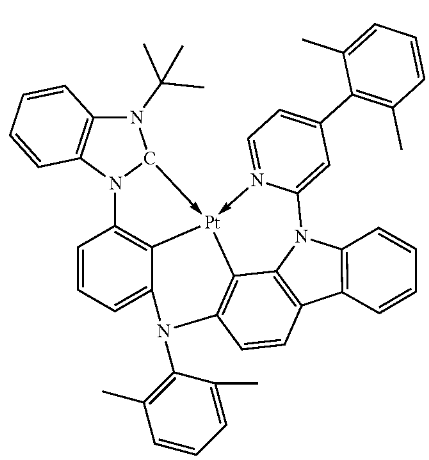
N
C
N
Pt
N
N
N

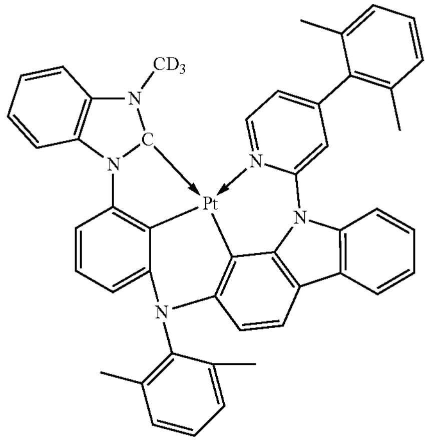
CD3
N
C
N
Pt
N
N
N
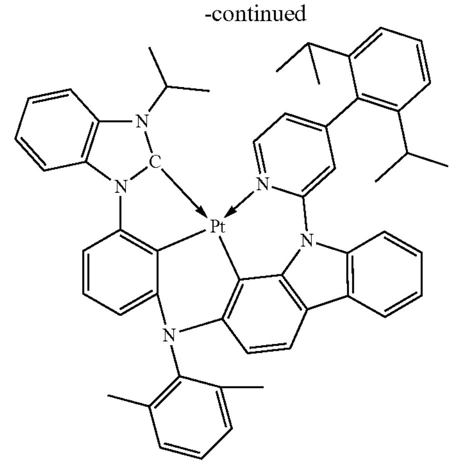
N
C
N
Pt
N
N
N
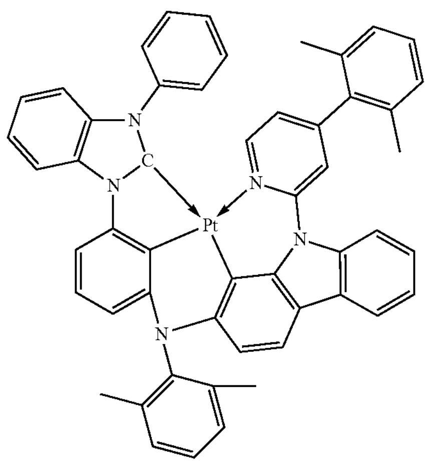
N
C
N
Pt
N
N
N
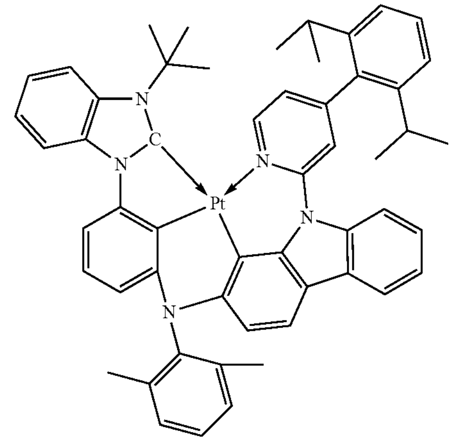
N
C
N
Pt
N
N
N
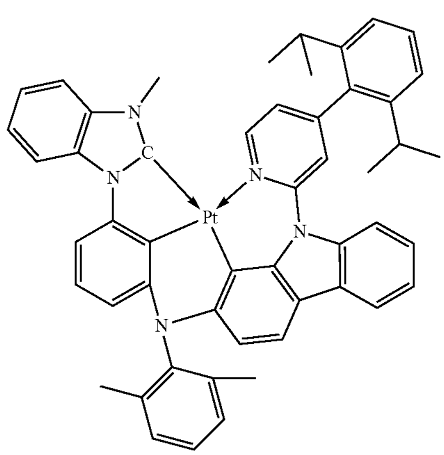
N
C
N
Pt
N
N
N
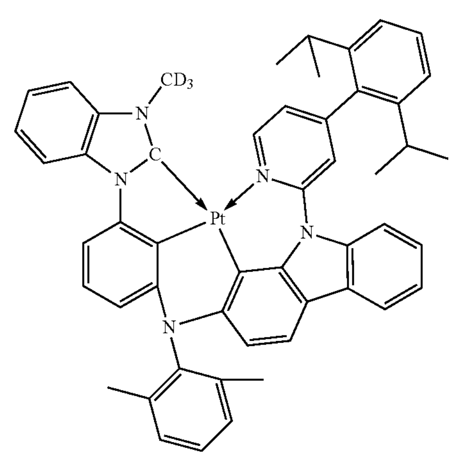
CD3
N
C
N
Pt
N
N
N

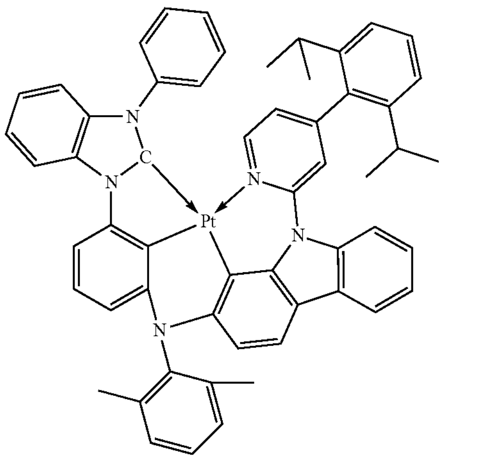
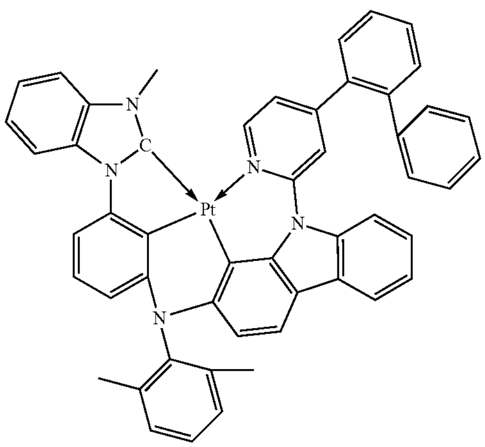
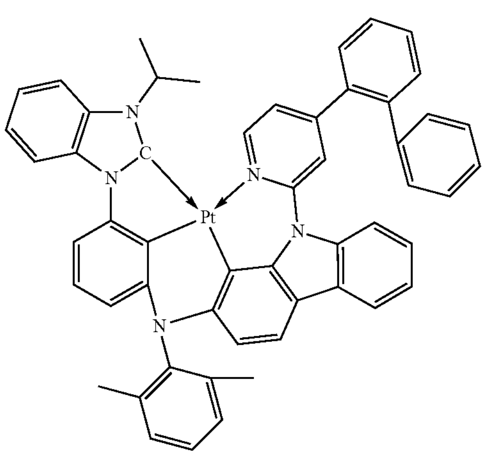
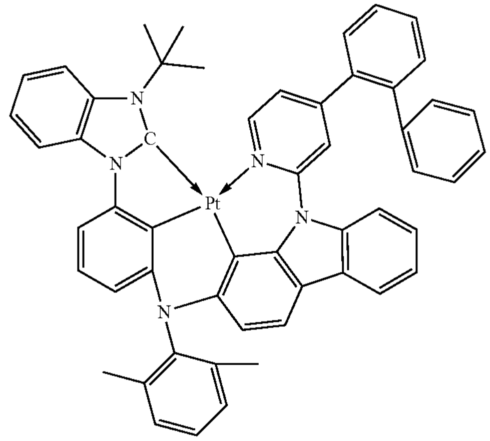
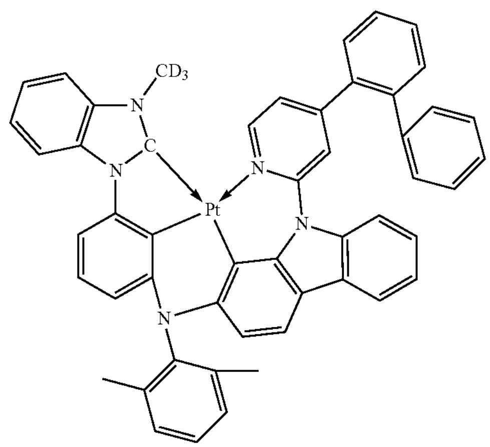
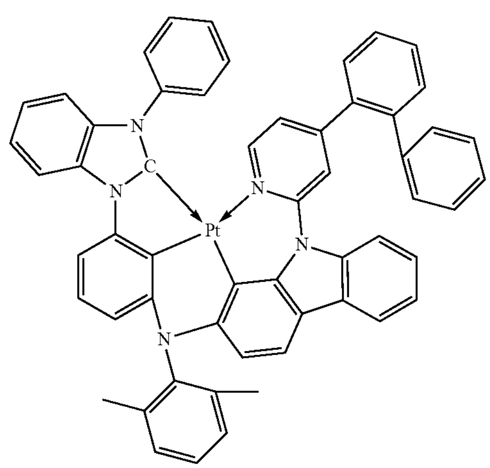

-continued
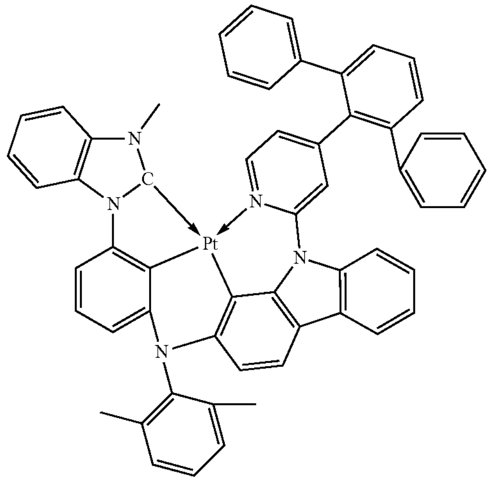
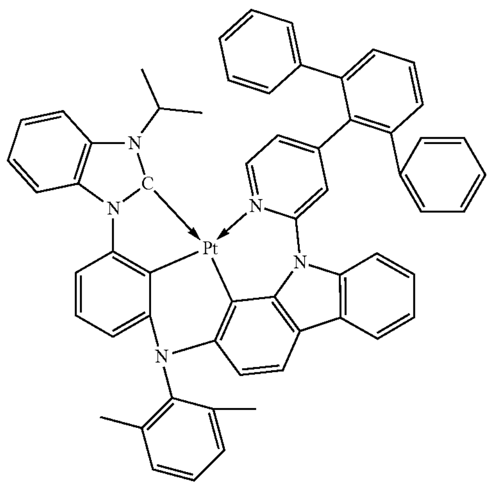
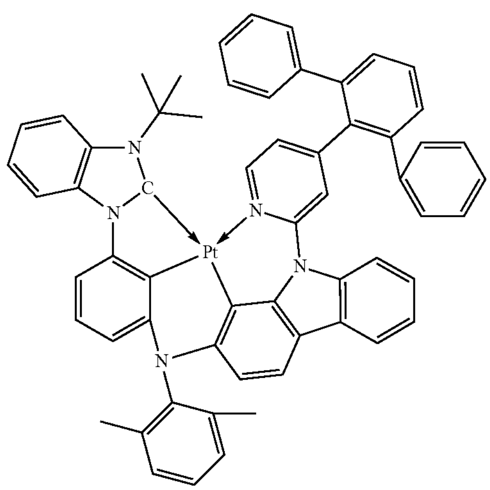
-continued
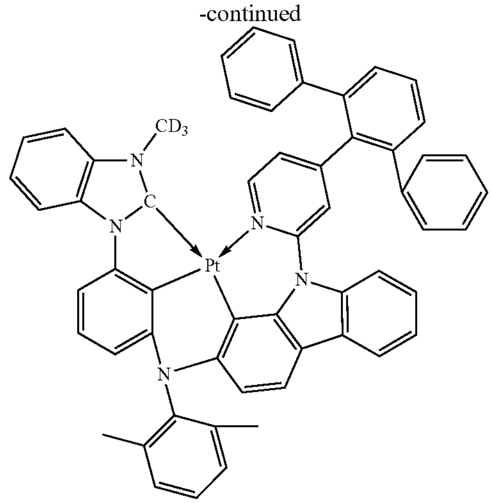
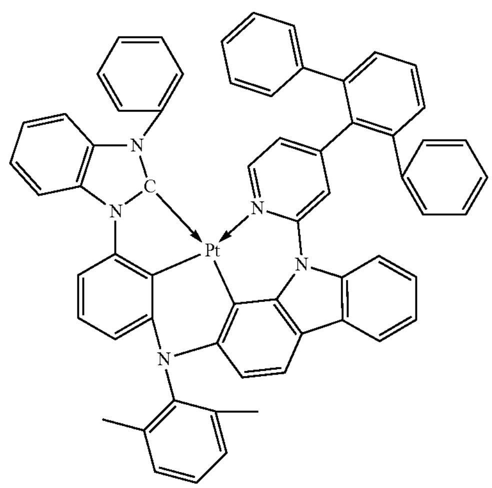
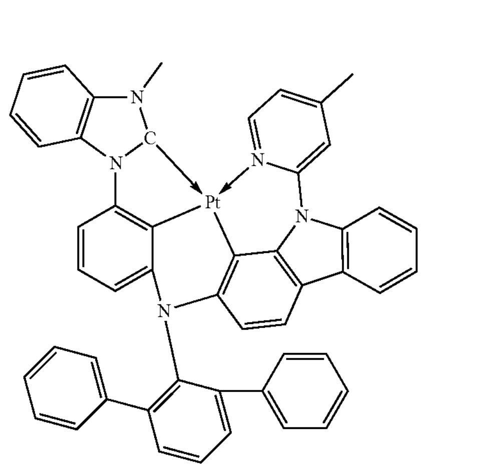

-continued
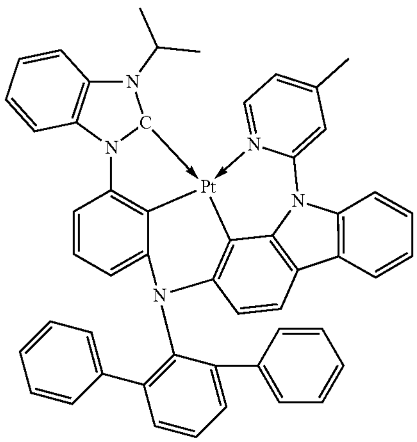
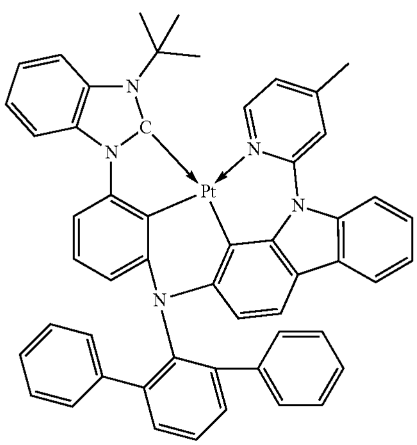
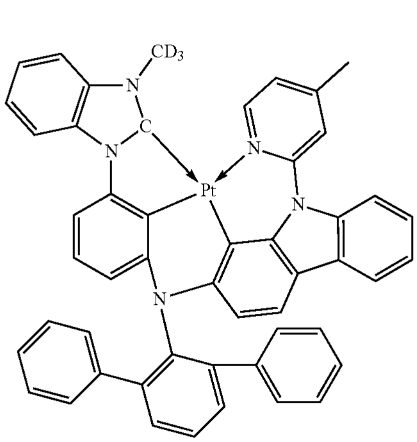
-continued
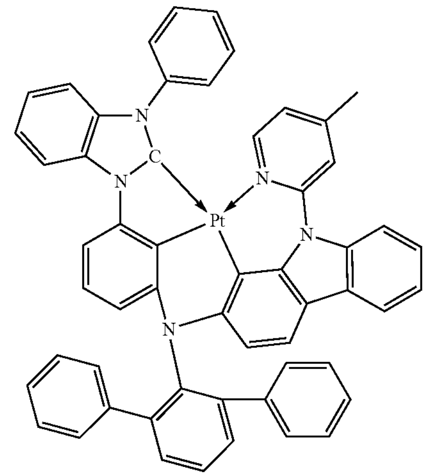
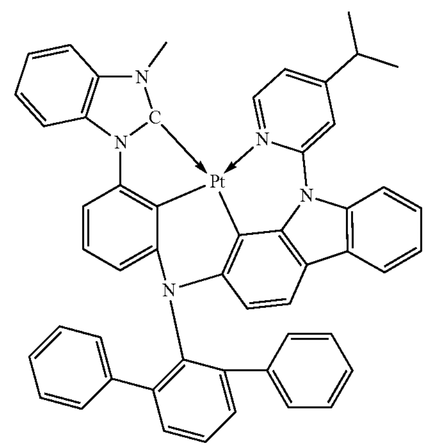
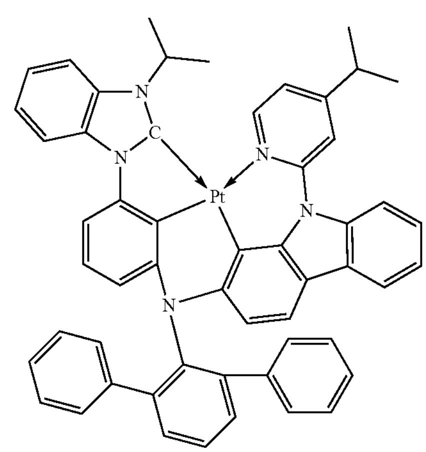

-continued
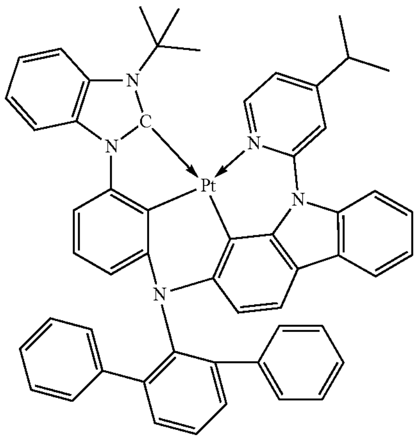
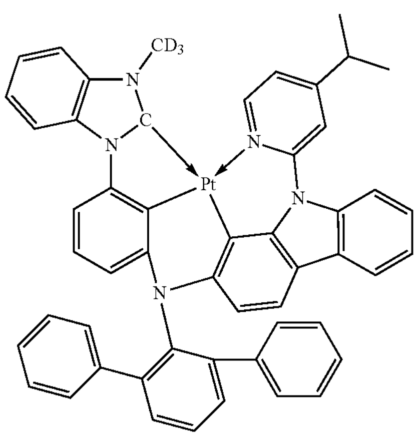
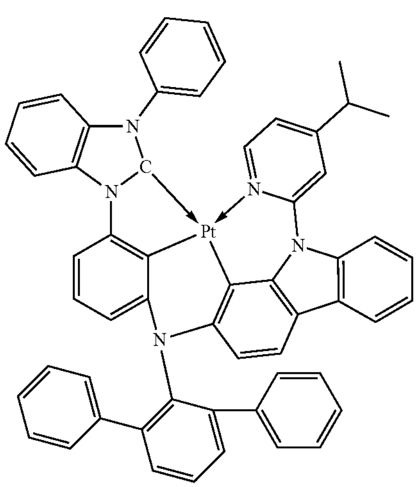
-continued
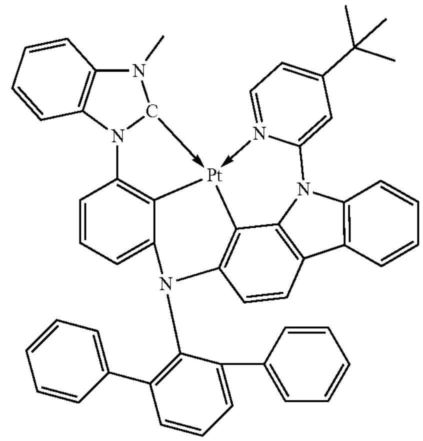
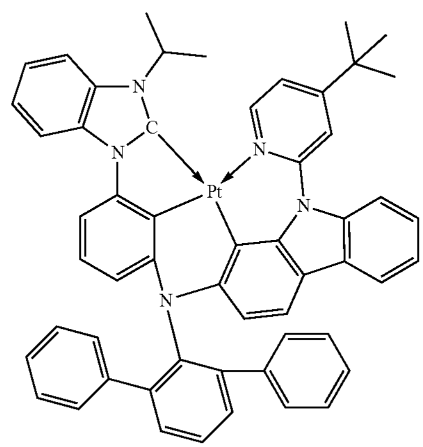
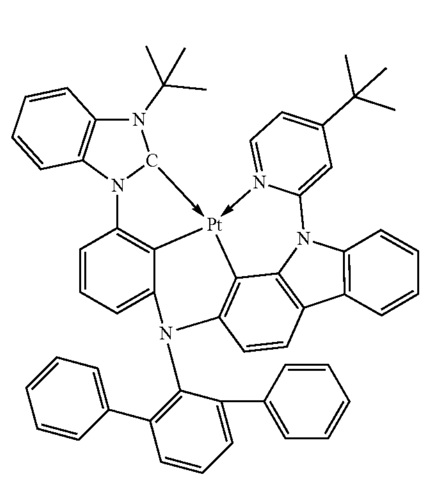

-continued
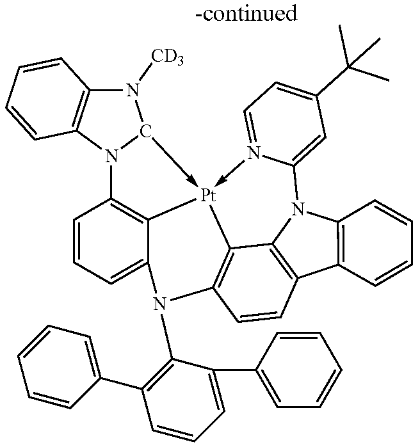
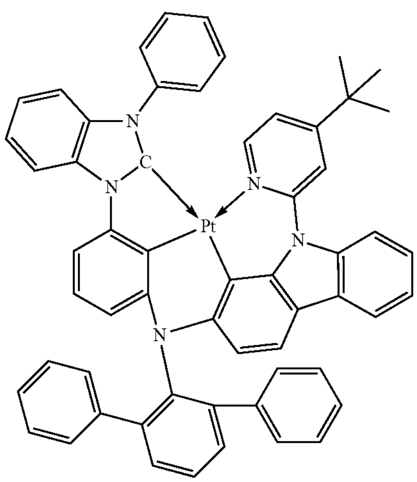
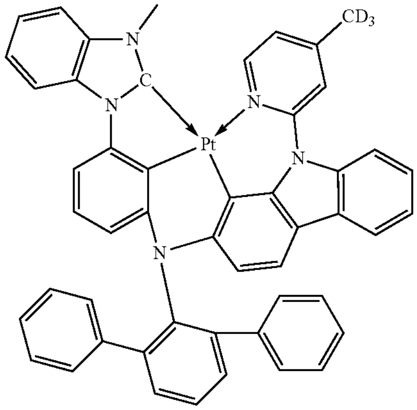
-continued
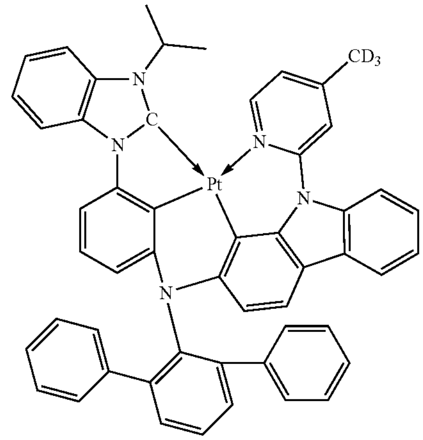
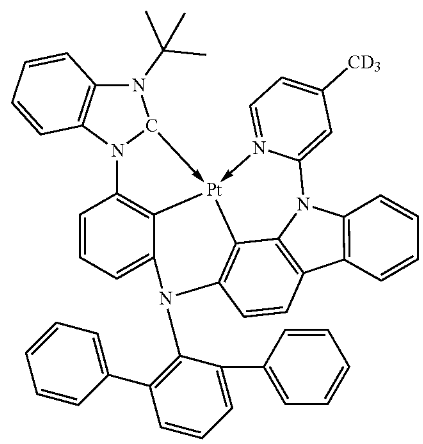
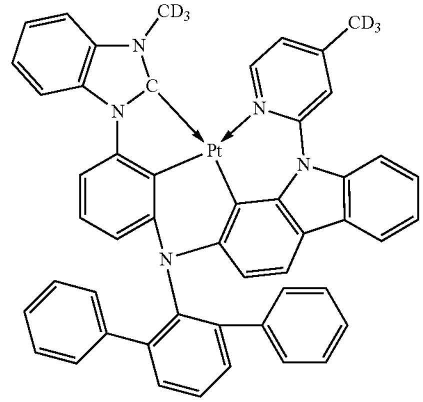

-continued
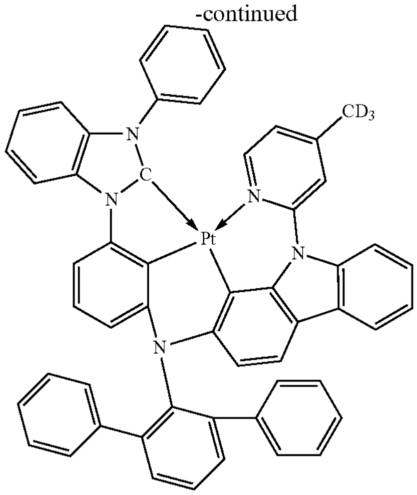
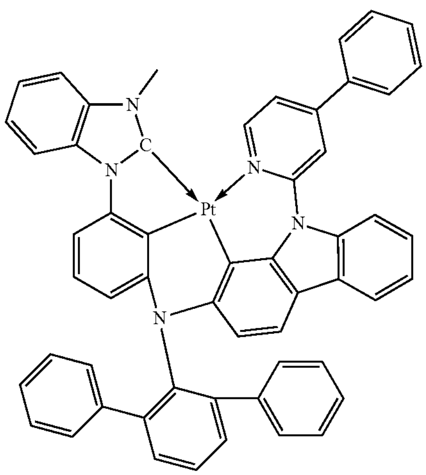
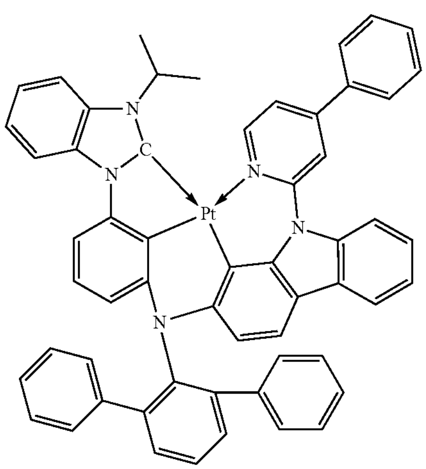
-continued
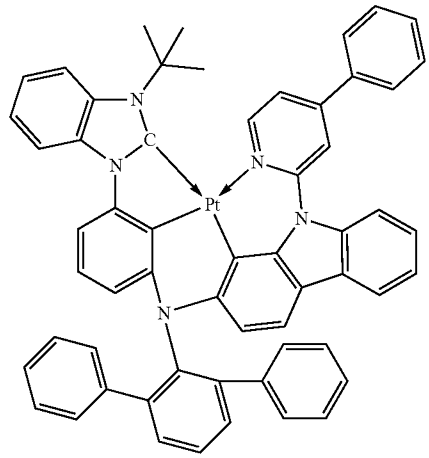
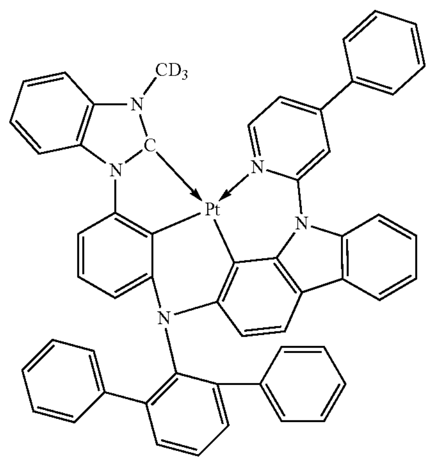
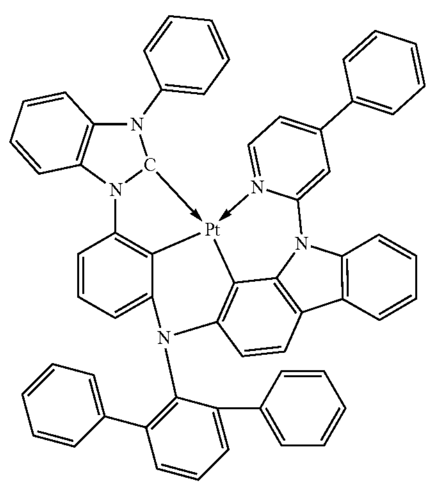

-continued
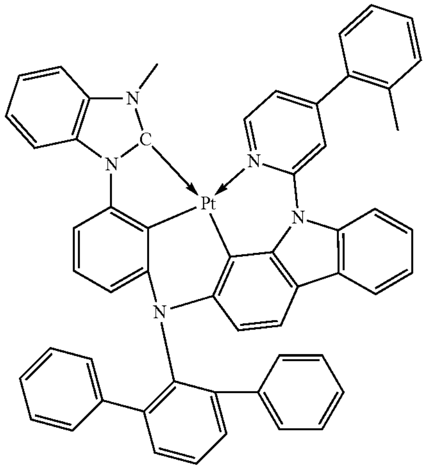
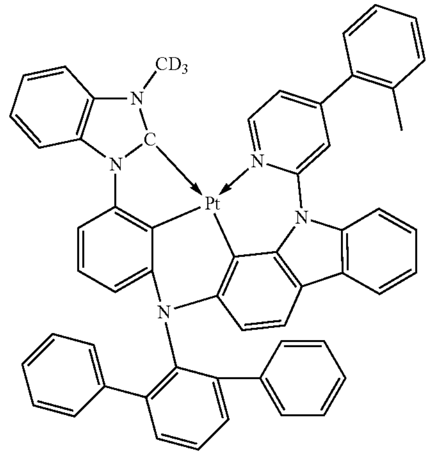
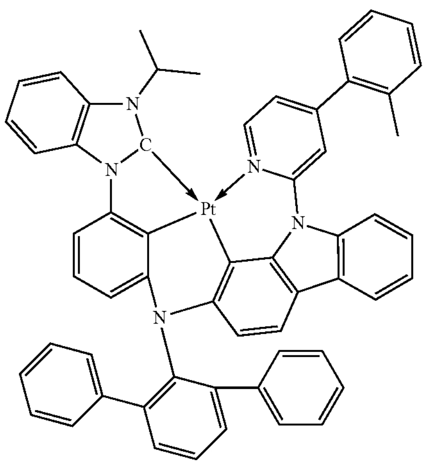
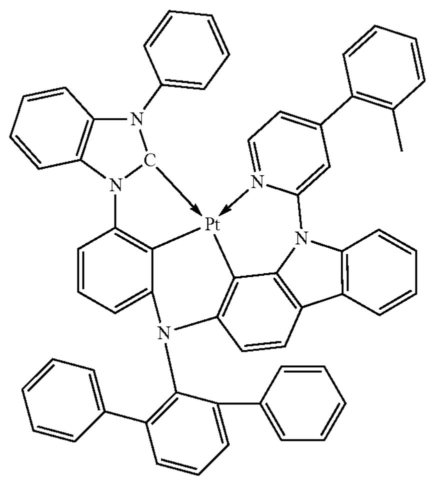
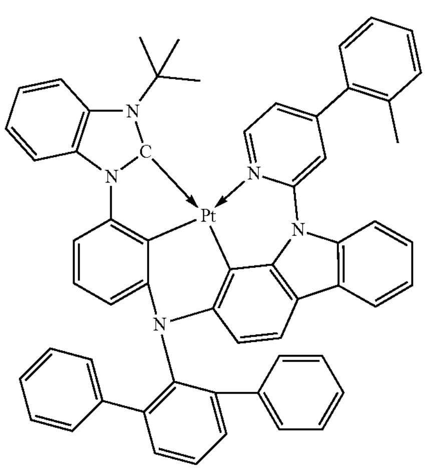
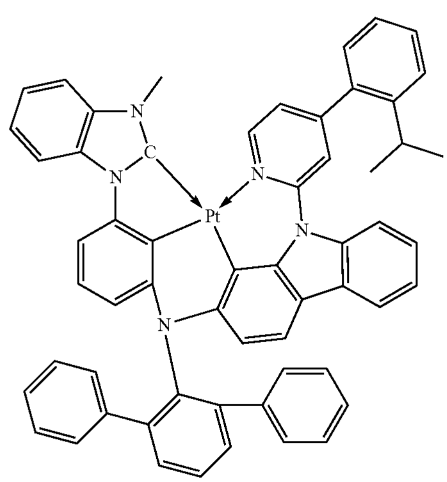

-continued
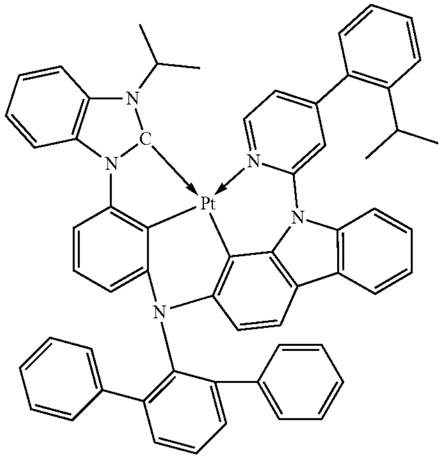
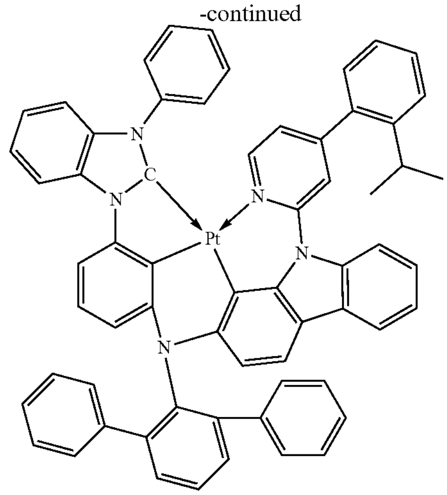
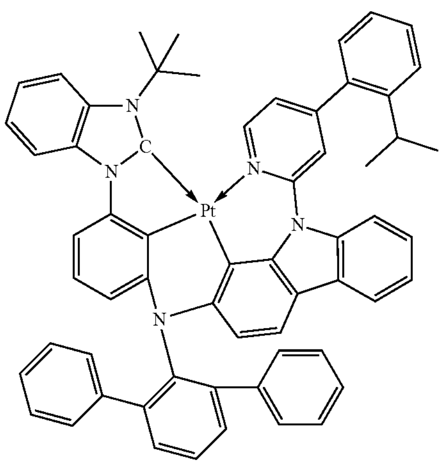
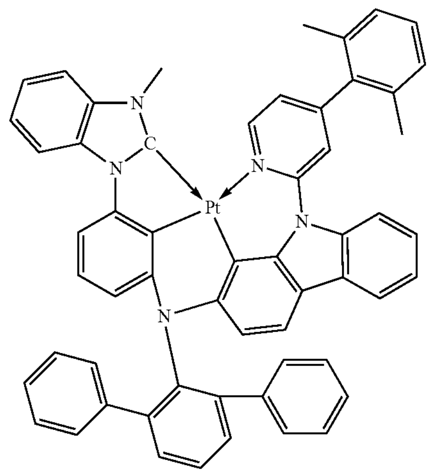
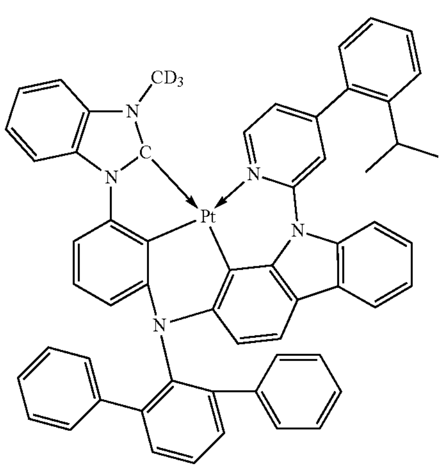
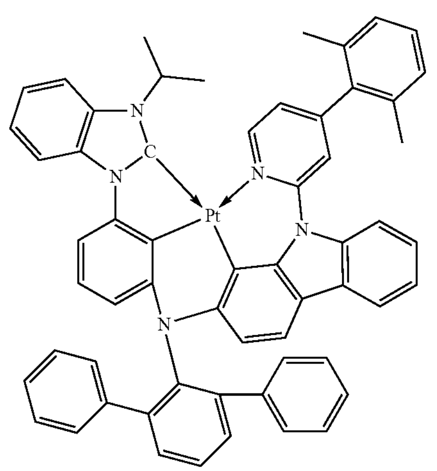

-continued
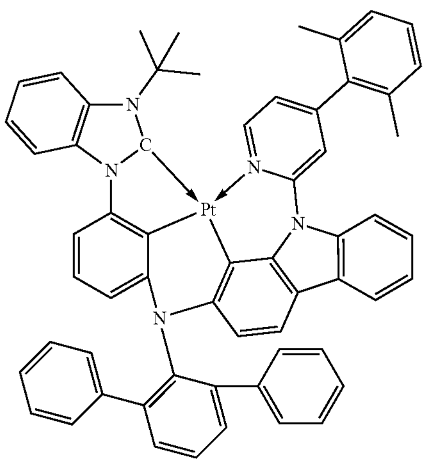
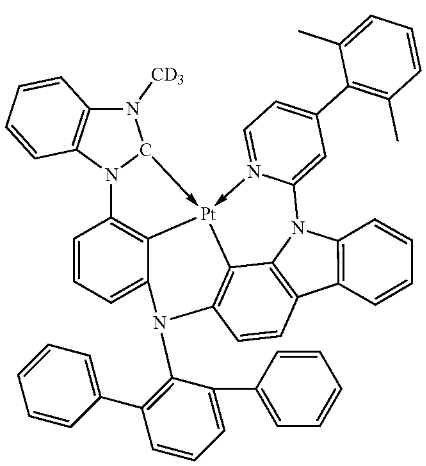
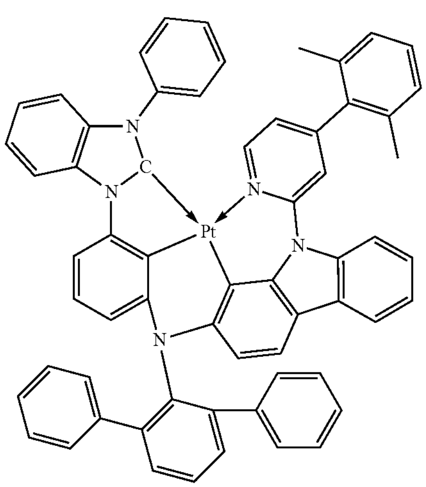
-continued
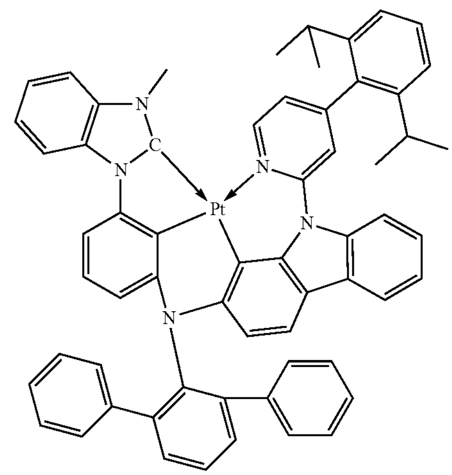
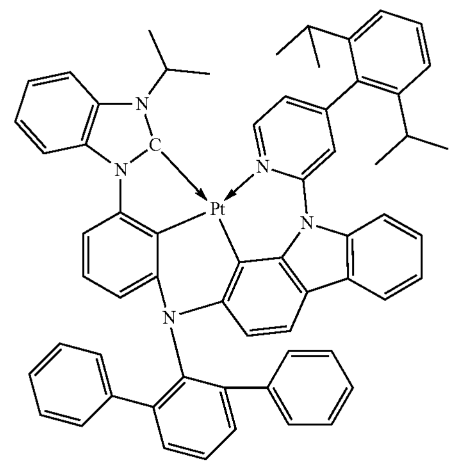
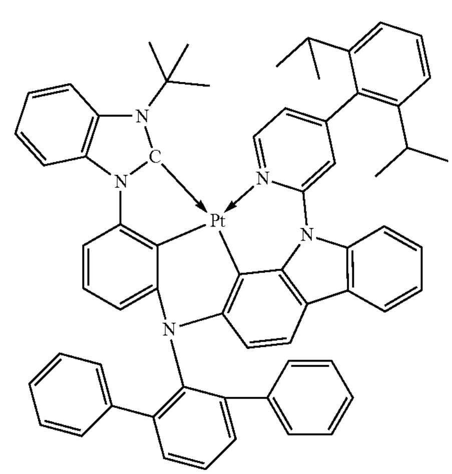

-continued
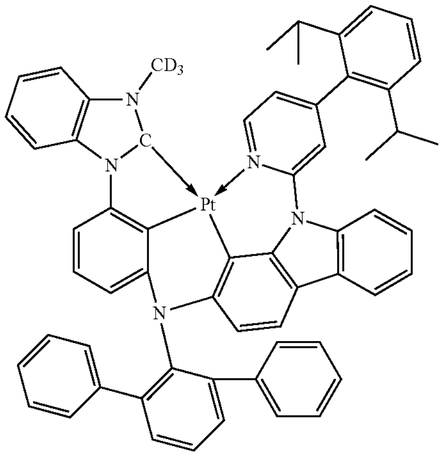
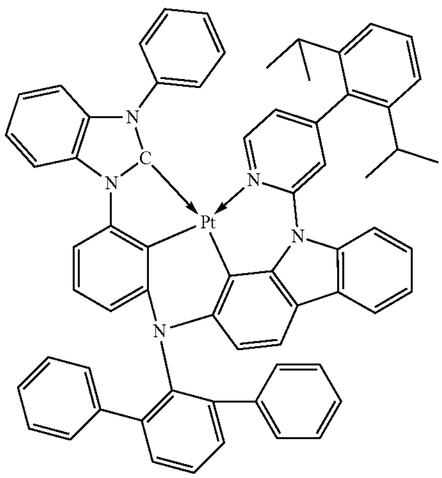
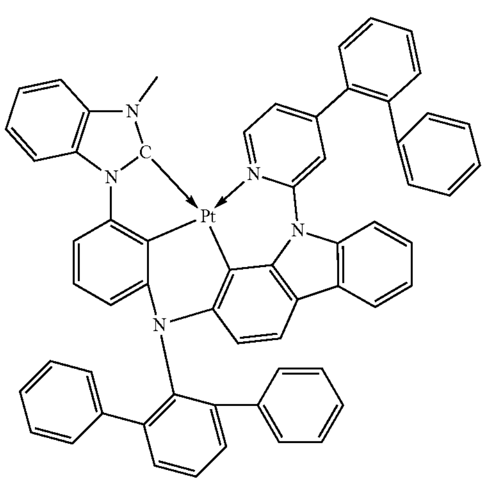
-continued
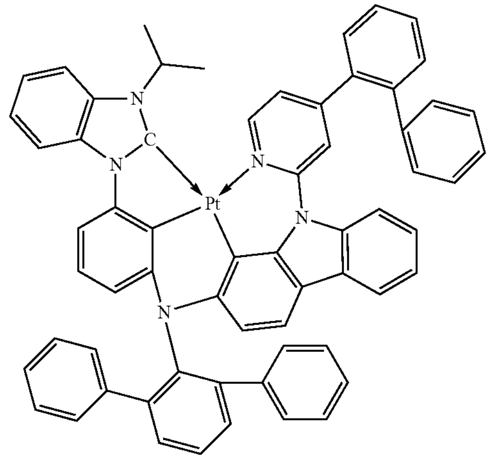
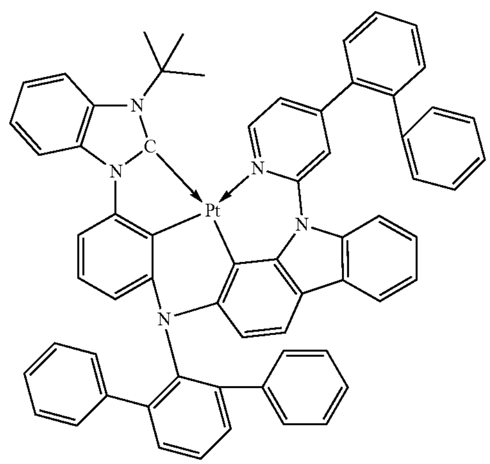
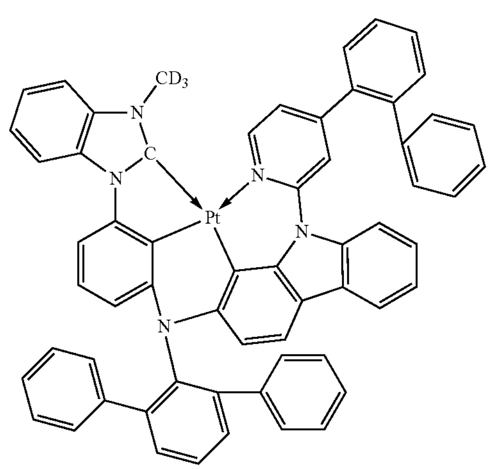

-continued
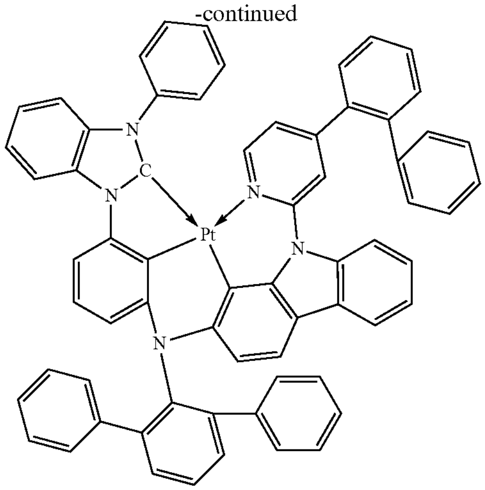
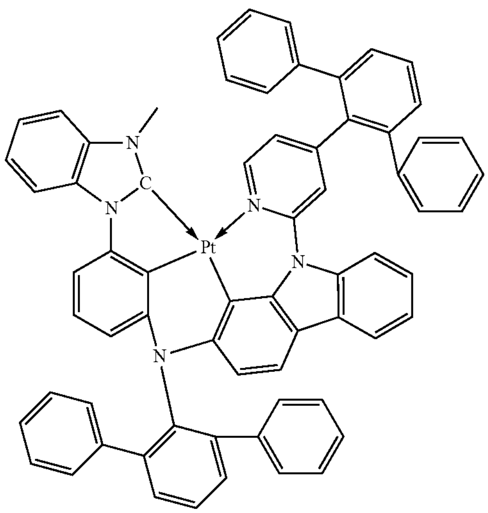
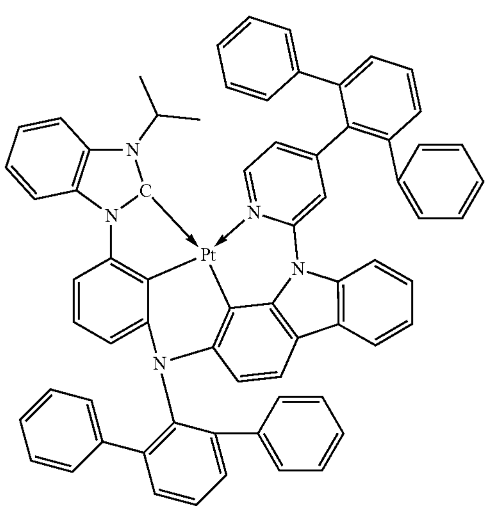
-continued
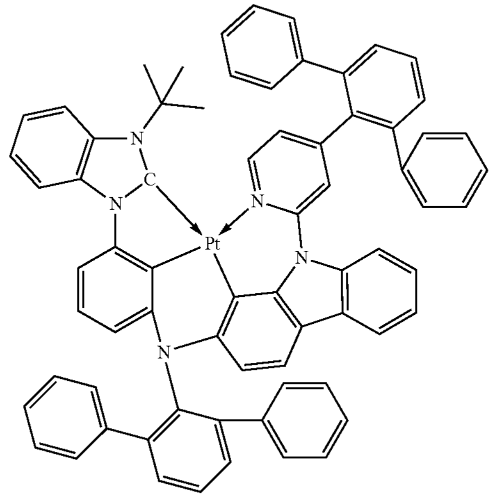
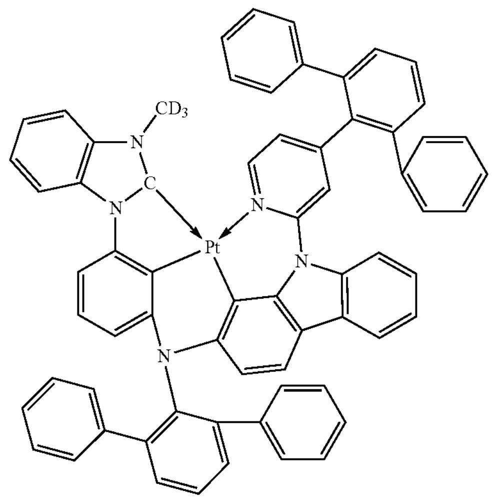
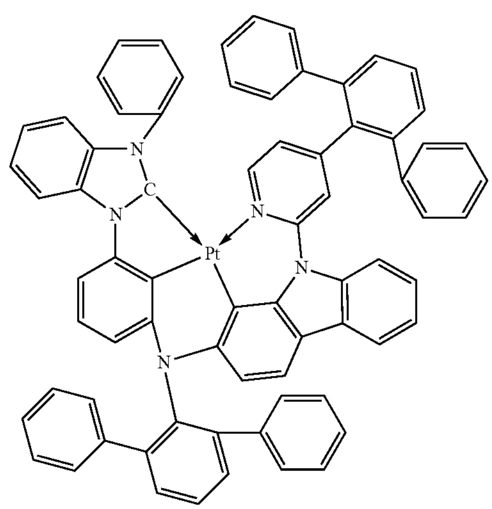

-continued
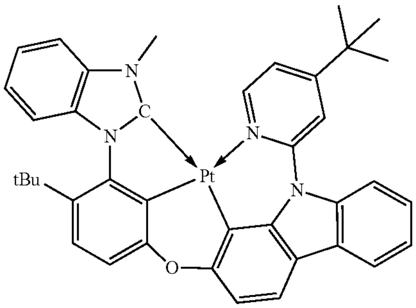
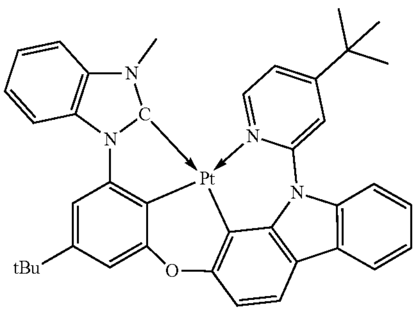
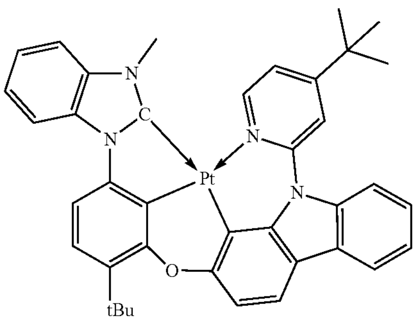
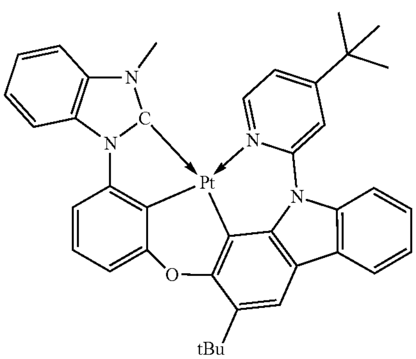
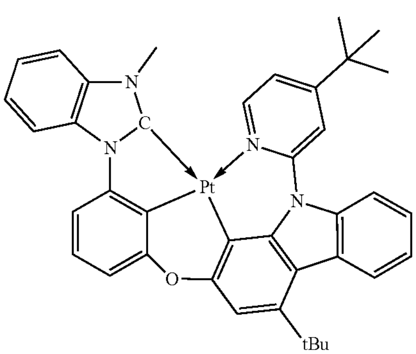
-continued
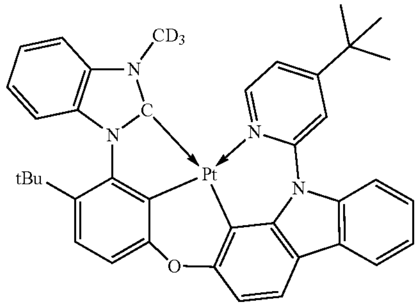
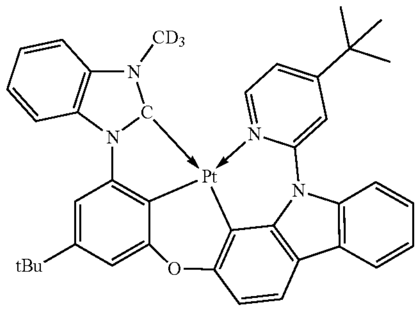
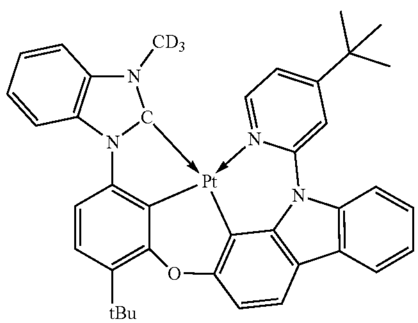
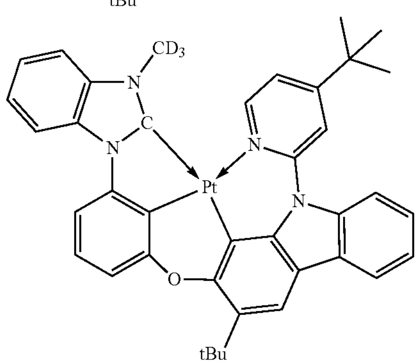
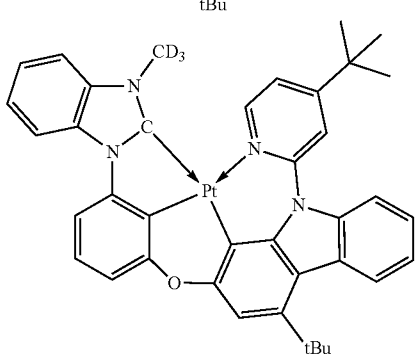

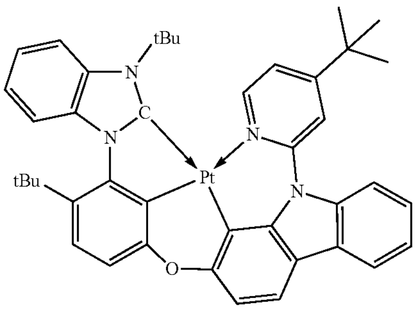
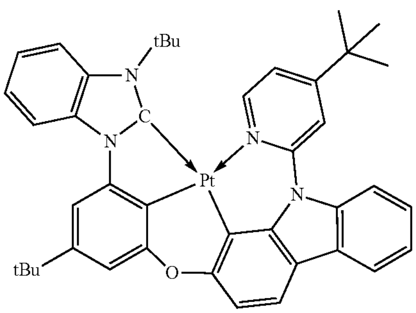
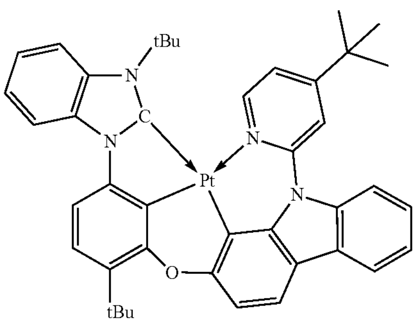
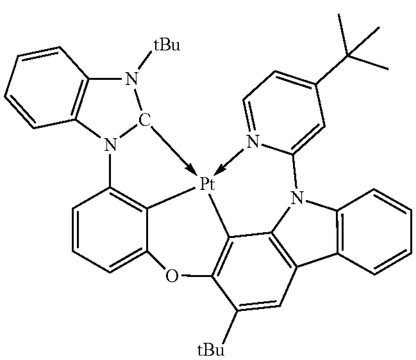
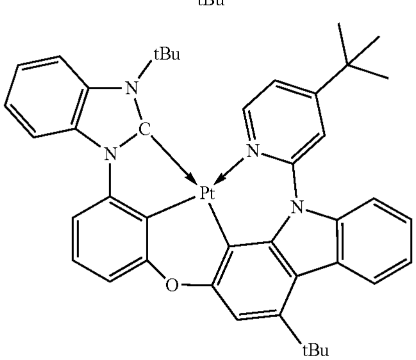
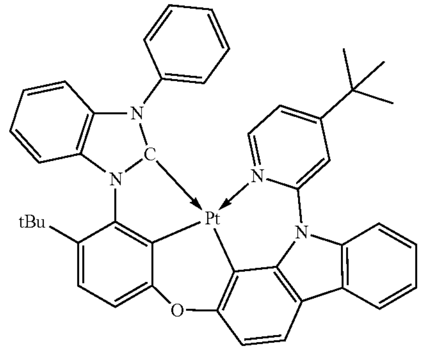
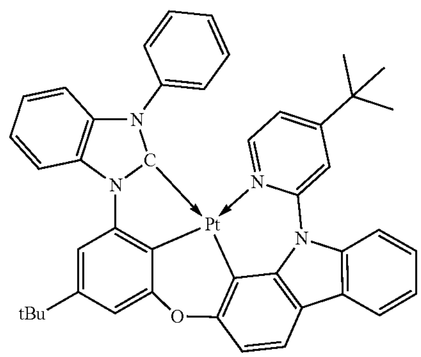
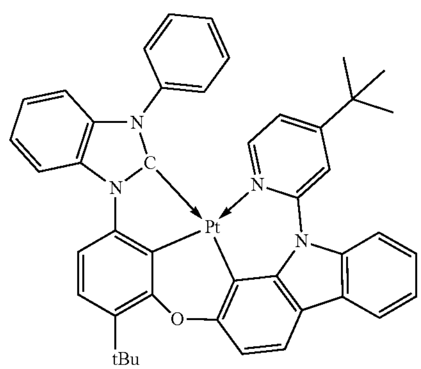
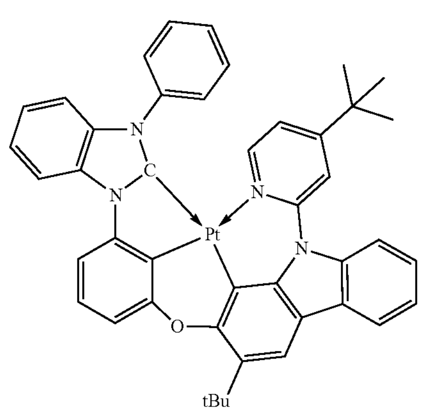

-continued
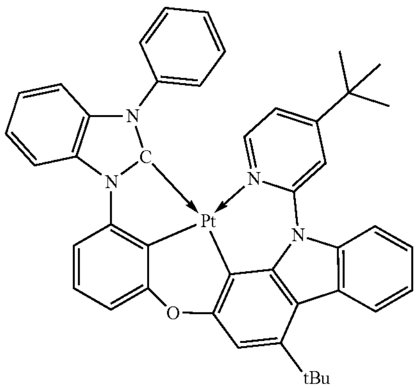
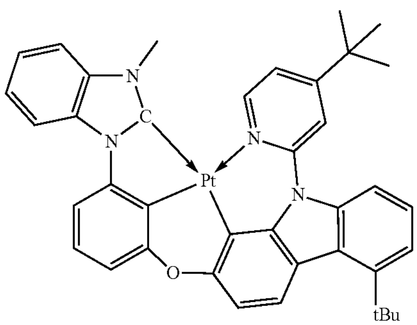
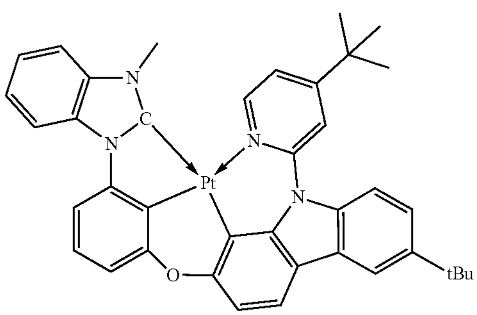
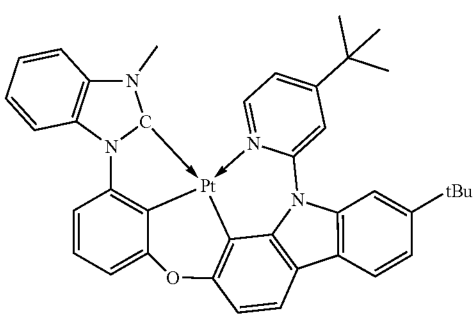
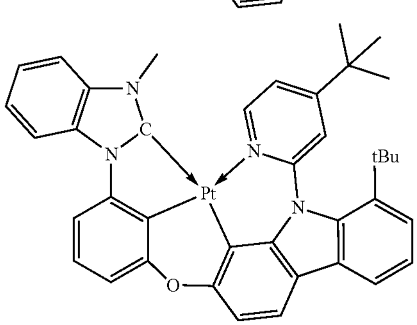
-continued
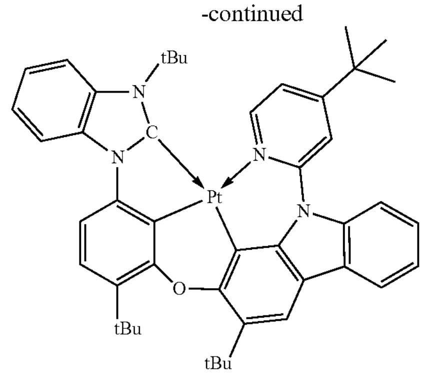
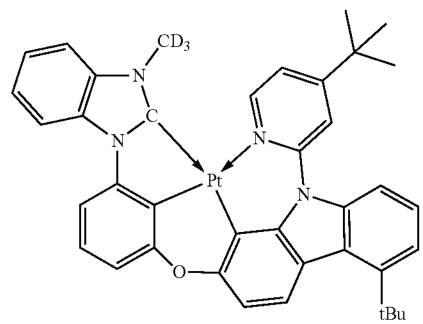
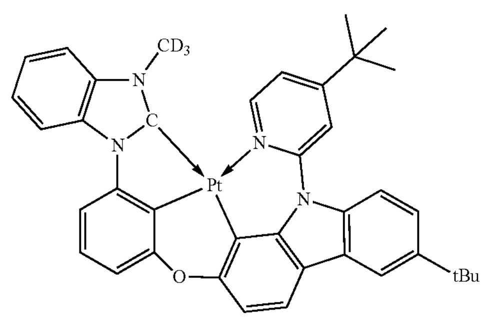
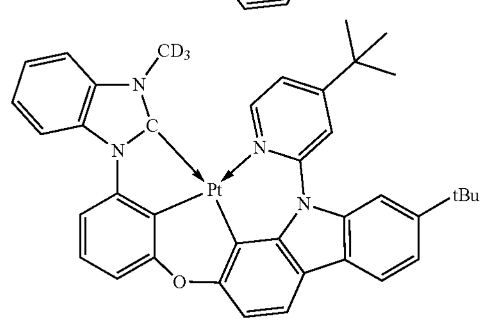
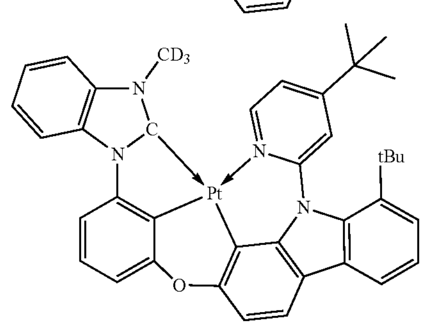

-continued
-continued
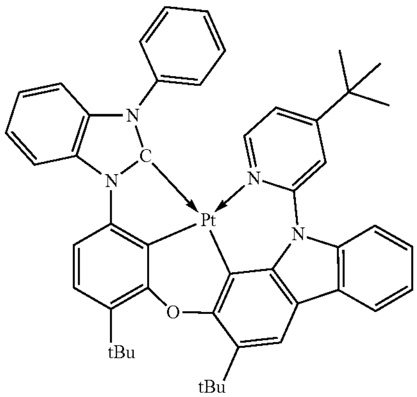
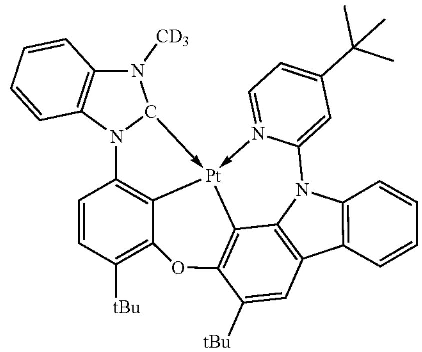
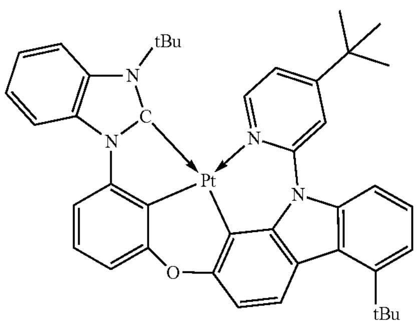
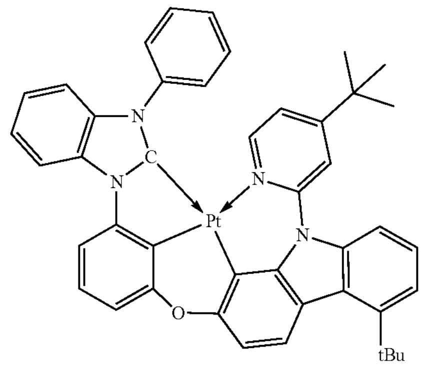
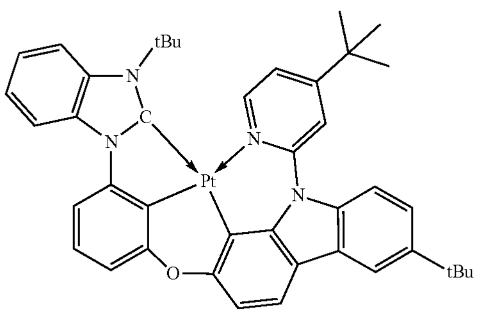
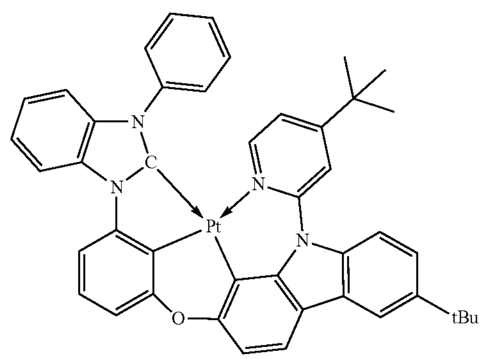
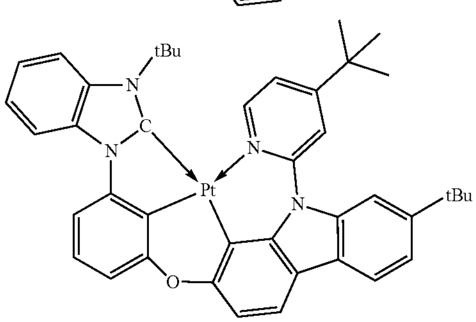
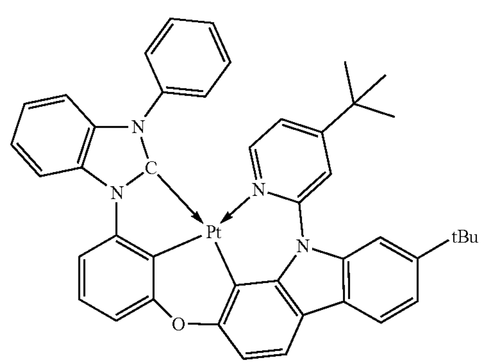
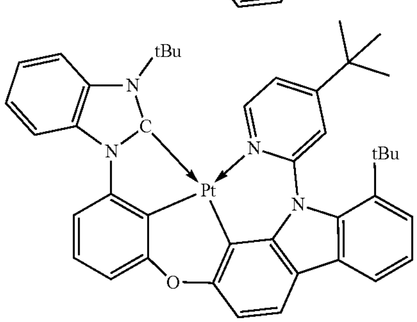

-continued
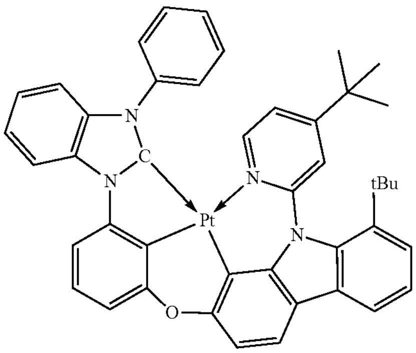
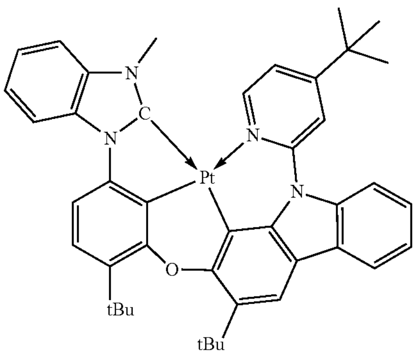
Group PD4
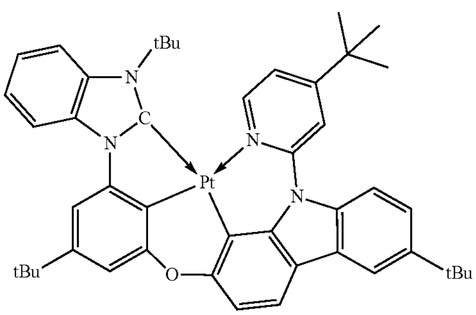
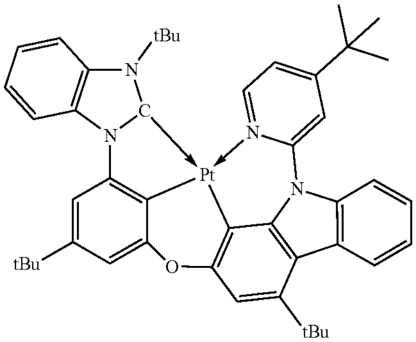
-continued
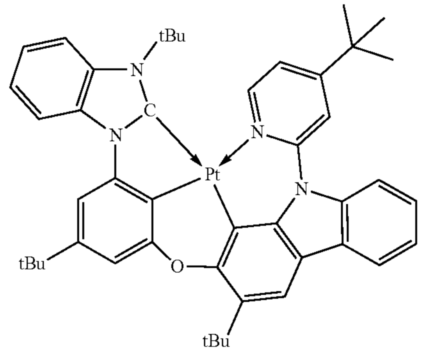
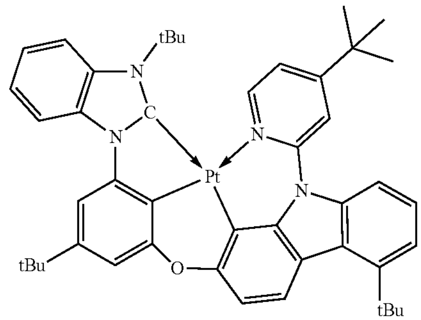
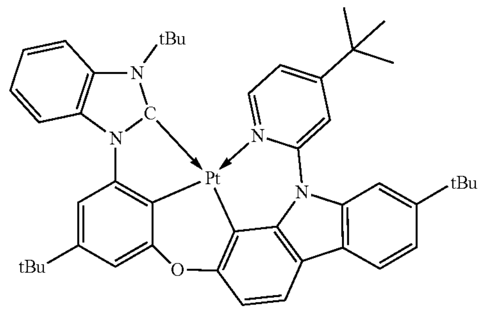
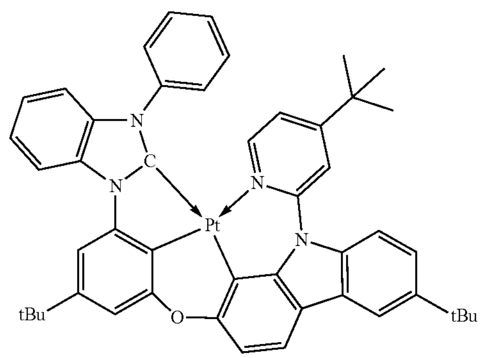
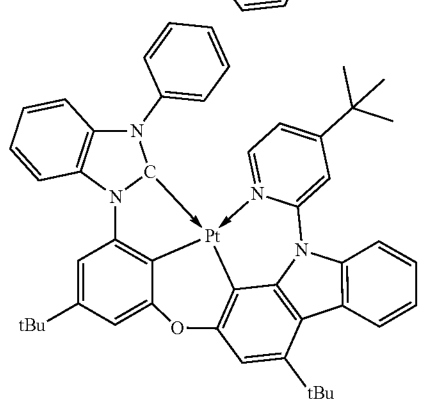

-continued
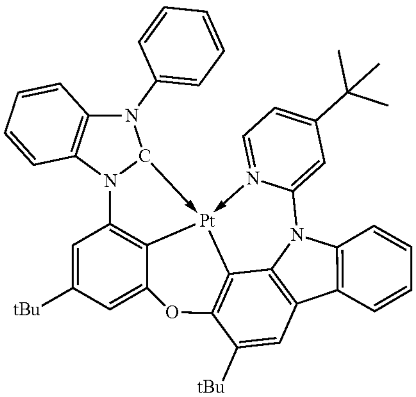
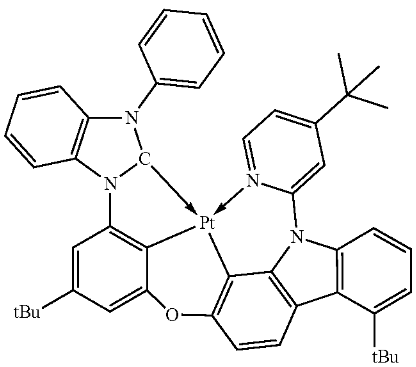
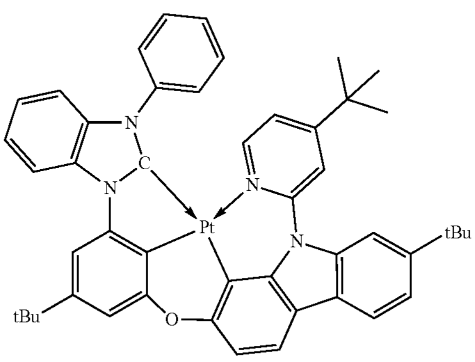
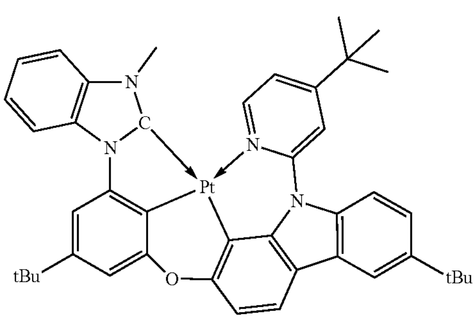
-continued
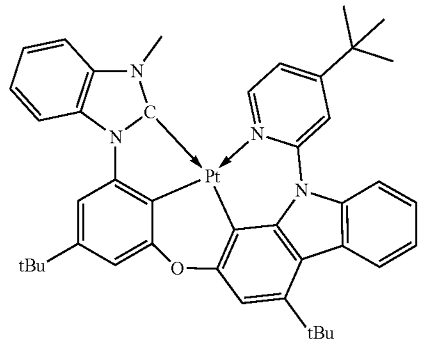
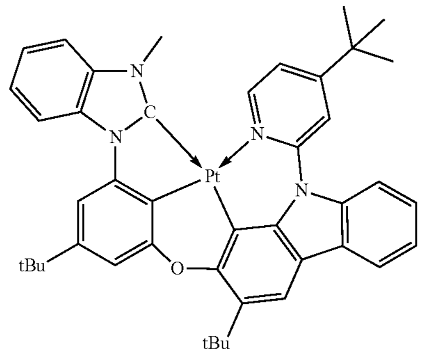
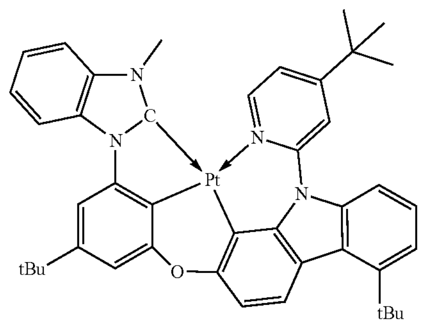
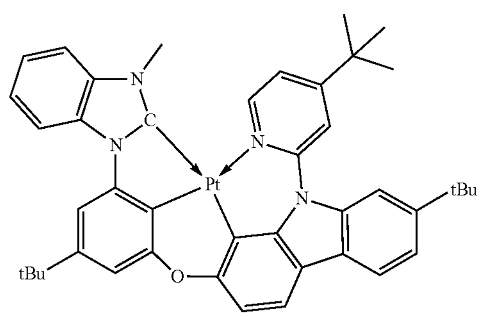
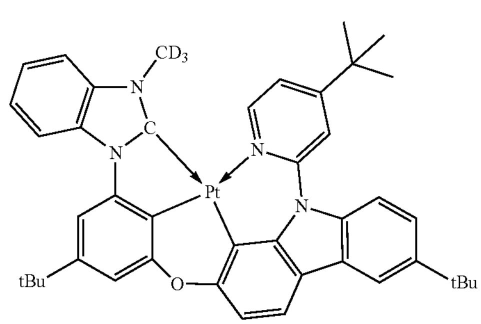

-continued
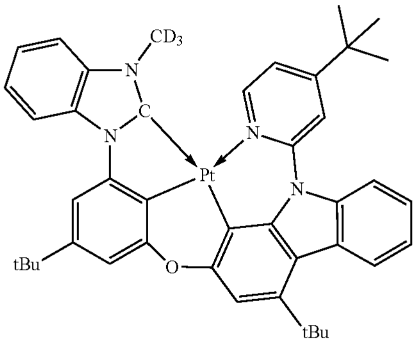
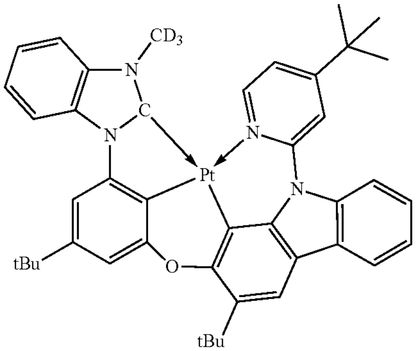
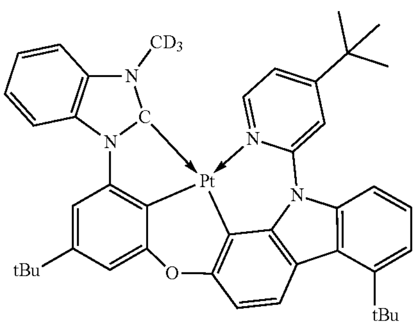
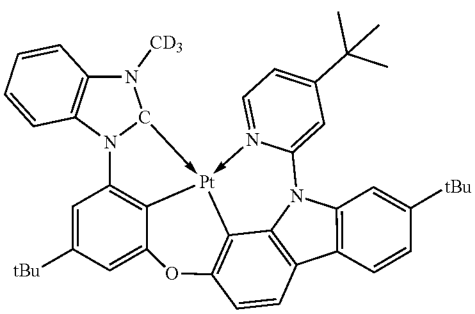
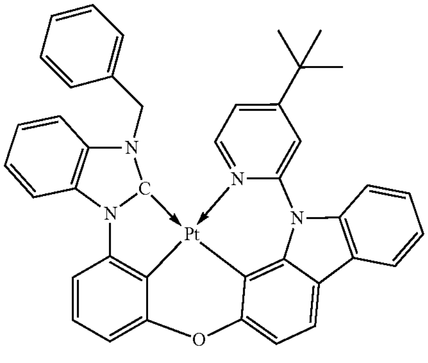
-continued
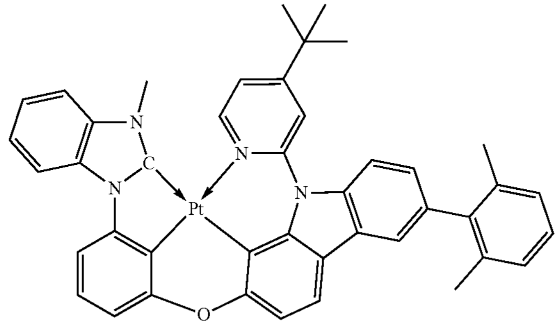
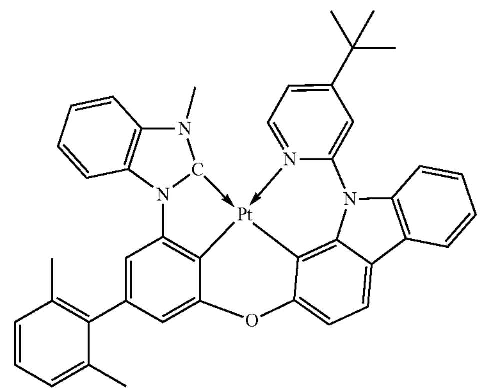
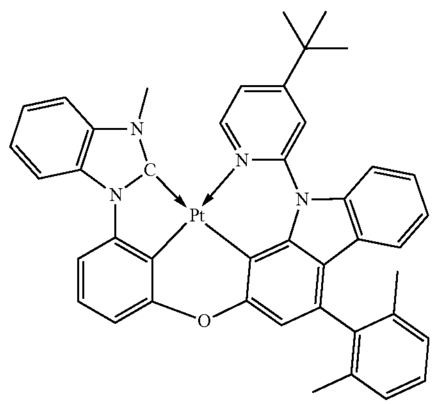
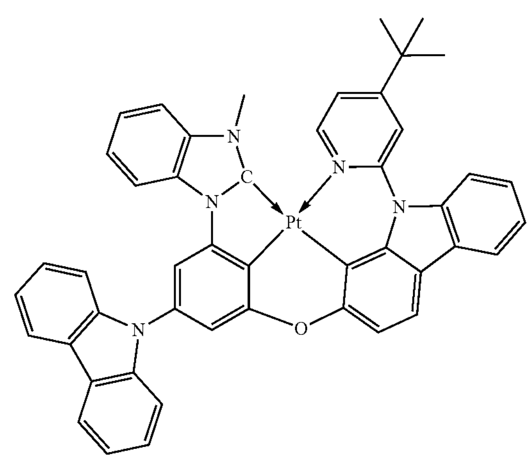

-continued
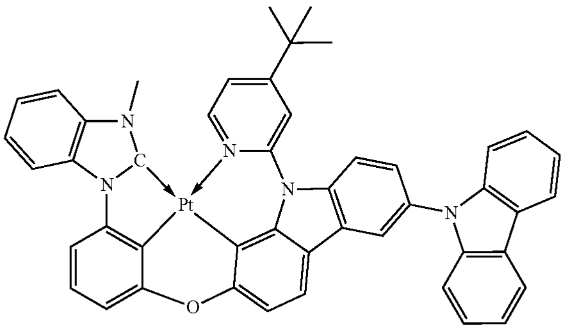
Group PD5
1
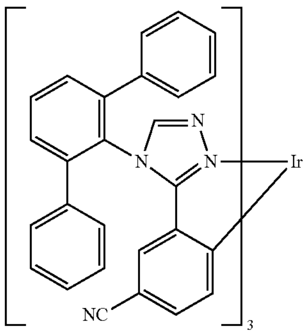
2
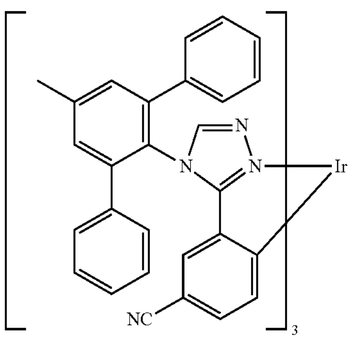
3
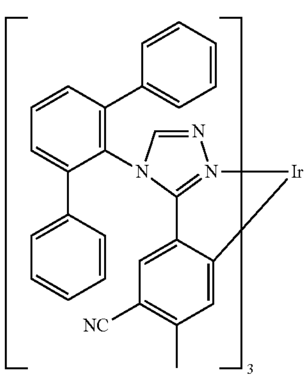
-continued
4
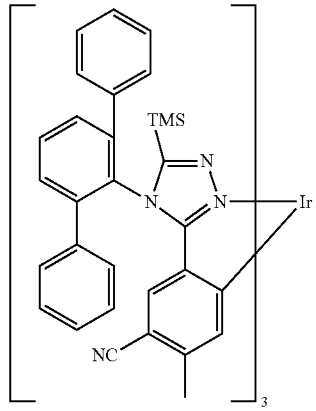
5
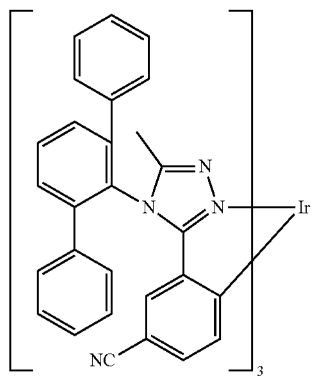
6
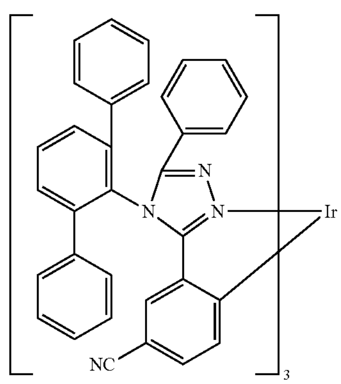
7
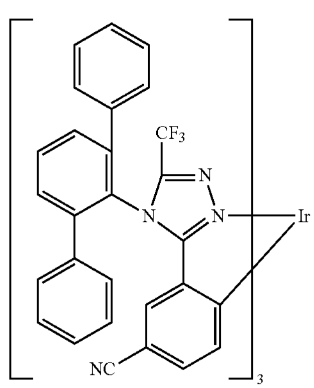

-continued

8

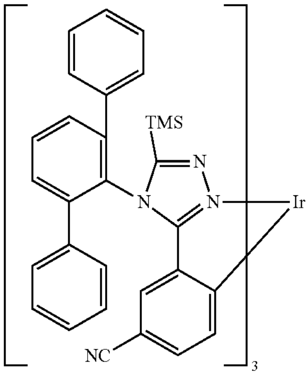

9

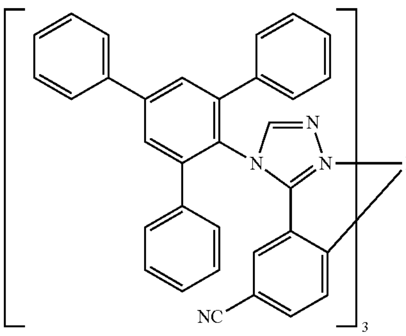

10

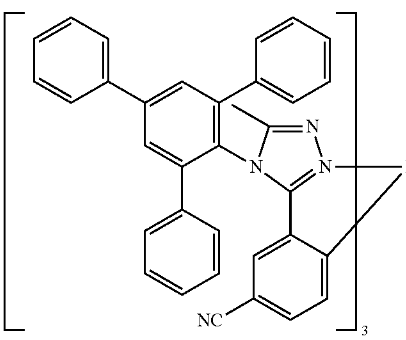

A compound represented by Formula A below:

$(L_{101})_{n101}$-$M_{101}$-$(L_{102})_{m101}$ Formula A wherein $L_{101}$, n101, $M_{101}$, $L_{102}$, and m101 in Formula A are the same as described in connection with Tables 1 to 3:

TABLE 1

| Compound name | $L_{101}$ | n101 | $M_{101}$ | $L_{102}$ | m101 |
|---|---|---|---|---|---|
| BD001 | LM1 | 3 | Ir | — | 0 |
| BD002 | LM2 | 3 | Ir | — | 0 |
| BD003 | LM3 | 3 | Ir | — | 0 |
| BD004 | LM4 | 3 | Ir | — | 0 |
| BD005 | LM5 | 3 | Ir | — | 0 |
| BD006 | LM6 | 3 | Ir | — | 0 |
| BD007 | LM7 | 3 | Ir | — | 0 |
| BD008 | LM8 | 3 | Ir | — | 0 |
| BD009 | LM9 | 3 | Ir | — | 0 |
| BD010 | LM10 | 3 | Ir | — | 0 |
| BD011 | LM11 | 3 | Ir | — | 0 |
| BD012 | LM12 | 3 | Ir | — | 0 |
| BD013 | LM13 | 3 | Ir | — | 0 |
| BD014 | LM14 | 3 | Ir | — | 0 |
| BD015 | LM15 | 3 | Ir | — | 0 |

TABLE 1-continued

| Compound name | $L_{101}$ | n101 | $M_{101}$ | $L_{102}$ | m101 |
|---|---|---|---|---|---|
| BD016 | LM16 | 3 | Ir | — | 0 |
| BD017 | LM17 | 3 | Ir | — | 0 |
| BD018 | LM18 | 3 | Ir | — | 0 |
| BD019 | LM19 | 3 | Ir | — | 0 |
| BD020 | LM20 | 3 | Ir | — | 0 |
| BD021 | LM21 | 3 | Ir | — | 0 |
| BD022 | LM22 | 3 | Ir | — | 0 |
| BD023 | LM23 | 3 | Ir | — | 0 |
| BD024 | LM24 | 3 | Ir | — | 0 |
| BD025 | LM25 | 3 | Ir | — | 0 |
| BD026 | LM26 | 3 | Ir | — | 0 |
| BD027 | LM27 | 3 | Ir | — | 0 |
| BD028 | LM28 | 3 | Ir | — | 0 |
| BD029 | LM29 | 3 | Ir | — | 0 |
| BD030 | LM30 | 3 | Ir | — | 0 |
| BD031 | LM31 | 3 | Ir | — | 0 |
| BD032 | LM32 | 3 | Ir | — | 0 |
| BD033 | LM33 | 3 | Ir | — | 0 |
| BD034 | LM34 | 3 | Ir | — | 0 |
| BD035 | LM35 | 3 | Ir | — | 0 |
| BD038 | LM36 | 3 | Ir | — | 0 |
| BD037 | LM37 | 3 | Ir | — | 0 |
| BD038 | LM38 | 3 | Ir | — | 0 |
| BD039 | LM39 | 3 | Ir | — | 0 |
| BD040 | LM40 | 3 | Ir | — | 0 |
| BD041 | LM41 | 3 | Ir | — | 0 |
| BD042 | LM42 | 3 | Ir | — | 0 |
| BD043 | LM43 | 3 | Ir | — | 0 |
| BD044 | LM44 | 3 | Ir | — | 0 |
| BD045 | LM45 | 3 | Ir | — | 0 |
| BD046 | LM46 | 3 | Ir | — | 0 |
| BD047 | LM47 | 3 | Ir | — | 0 |
| BD048 | LM48 | 3 | Ir | — | 0 |
| BD049 | LM49 | 3 | Ir | — | 0 |
| BD050 | LM50 | 3 | Ir | — | 0 |
| BD051 | LM51 | 3 | Ir | — | 0 |
| BD052 | LM52 | 3 | Ir | — | 0 |
| BD053 | LM53 | 3 | Ir | — | 0 |
| BD054 | LM54 | 3 | Ir | — | 0 |
| BD055 | LM55 | 3 | Ir | — | 0 |
| BD056 | LM56 | 3 | Ir | — | 0 |
| BD057 | LM57 | 3 | Ir | — | 0 |
| BD058 | LM58 | 3 | Ir | — | 0 |
| BD059 | LM59 | 3 | Ir | — | 0 |
| BD060 | LM60 | 3 | Ir | — | 0 |
| BD061 | LM61 | 3 | Ir | — | 0 |
| BD062 | LM62 | 3 | Ir | — | 0 |
| BD063 | LM63 | 3 | Ir | — | 0 |
| BD064 | LM64 | 3 | Ir | — | 0 |
| BD065 | LM65 | 3 | Ir | — | 0 |
| BD066 | LM66 | 3 | Ir | — | 0 |
| BD067 | LM67 | 3 | Ir | — | 0 |
| BD068 | LM68 | 3 | Ir | — | 0 |
| BD069 | LM69 | 3 | Ir | — | 0 |
| BD070 | LM70 | 3 | Ir | — | 0 |
| BD071 | LM71 | 3 | Ir | — | 0 |
| BD072 | LM72 | 3 | Ir | — | 0 |
| BD073 | LM73 | 3 | Ir | — | 0 |
| BD074 | LM74 | 3 | Ir | — | 0 |
| BD075 | LM75 | 3 | Ir | — | 0 |
| BD076 | LM76 | 3 | Ir | — | 0 |
| BD077 | LM77 | 3 | Ir | — | 0 |
| BD078 | LM78 | 3 | Ir | — | 0 |
| BD079 | LM79 | 3 | Ir | — | 0 |
| BD080 | LM80 | 3 | Ir | — | 0 |
| BD081 | LM81 | 3 | Ir | — | 0 |
| BD082 | LM82 | 3 | Ir | — | 0 |
| BD083 | LM83 | 3 | Ir | — | 0 |
| BD084 | LM84 | 3 | Ir | — | 0 |
| BD085 | LM85 | 3 | Ir | — | 0 |
| BD086 | LM86 | 3 | Ir | — | 0 |
| BD087 | LM87 | 3 | Ir | — | 0 |
| BD088 | LM88 | 3 | Ir | — | 0 |
| BD089 | LM89 | 3 | Ir | — | 0 |
| BD090 | LM90 | 3 | Ir | — | 0 |
| BD091 | LM91 | 3 | Ir | — | 0 |
| BD092 | LM92 | 3 | Ir | — | 0 |
| BD093 | LM93 | 3 | Ir | — | 0 |

TABLE 1-continued

| Compound name | $L_{101}$ | n101 | $M_{101}$ | $L_{102}$ | m101 |
|---|---|---|---|---|---|
| BD094 | LM94 | 3 | Ir | — | 0 |
| BD095 | LM95 | 3 | Ir | — | 0 |
| BD096 | LM96 | 3 | Ir | — | 0 |
| BD097 | LM97 | 3 | Ir | — | 0 |
| BD098 | LM98 | 3 | Ir | — | 0 |
| BD099 | LM99 | 3 | Ir | — | 0 |
| BD100 | LM100 | 3 | Ir | — | 0 |

TABLE 2

| Compound name | $L_{101}$ | n101 | $M_{101}$ | $L_{102}$ | m101 |
|---|---|---|---|---|---|
| BD101 | LM101 | 3 | Ir | — | 0 |
| BD102 | LM102 | 3 | Ir | — | 0 |
| BD103 | LM103 | 3 | Ir | — | 0 |
| BD104 | LM104 | 3 | Ir | — | 0 |
| BD105 | LM105 | 3 | Ir | — | 0 |
| BD106 | LM106 | 3 | Ir | — | 0 |
| BD107 | LM107 | 3 | Ir | — | 0 |
| BD108 | LM108 | 3 | Ir | — | 0 |
| BD109 | LM109 | 3 | Ir | — | 0 |
| BD110 | LM110 | 3 | Ir | — | 0 |
| BD111 | LM111 | 3 | Ir | — | 0 |
| BD112 | LM112 | 3 | Ir | — | 0 |
| BD113 | LM113 | 3 | Ir | — | 0 |
| BD114 | LM114 | 3 | Ir | — | 0 |
| BD115 | LM115 | 3 | Ir | — | 0 |
| BD116 | LM116 | 3 | Ir | — | 0 |
| BD117 | LM117 | 3 | Ir | — | 0 |
| BD118 | LM118 | 3 | Ir | — | 0 |
| BD119 | LM119 | 3 | Ir | — | 0 |
| BD120 | LM120 | 3 | Ir | — | 0 |
| BD121 | LM121 | 3 | Ir | — | 0 |
| BD122 | LM122 | 3 | Ir | — | 0 |
| BD123 | LM123 | 3 | Ir | — | 0 |
| BD124 | LM124 | 3 | Ir | — | 0 |
| BD125 | LM125 | 3 | Ir | — | 0 |
| BD126 | LM126 | 3 | Ir | — | 0 |
| BD127 | LM127 | 3 | Ir | — | 0 |
| BD128 | LM128 | 3 | Ir | — | 0 |
| BD129 | LM129 | 3 | Ir | — | 0 |
| BD130 | LM130 | 3 | Ir | — | 0 |
| BD131 | LM131 | 3 | Ir | — | 0 |
| BD132 | LM132 | 3 | Ir | — | 0 |
| BD133 | LM133 | 3 | Ir | — | 0 |
| BD134 | LM134 | 3 | Ir | — | 0 |
| BD135 | LM135 | 3 | Ir | — | 0 |
| BD136 | LM136 | 3 | Ir | — | 0 |
| BD137 | LM137 | 3 | Ir | — | 0 |
| BD138 | LM138 | 3 | Ir | — | 0 |
| BD139 | LM139 | 3 | Ir | — | 0 |
| BD140 | LM140 | 3 | Ir | — | 0 |
| BD141 | LM141 | 3 | Ir | — | 0 |
| BD142 | LM142 | 3 | Ir | — | 0 |
| BD143 | LM143 | 3 | Ir | — | 0 |
| BD144 | LM144 | 3 | Ir | — | 0 |
| BD145 | LM145 | 3 | Ir | — | 0 |
| BD146 | LM146 | 3 | Ir | — | 0 |
| BD147 | LM147 | 3 | Ir | — | 0 |
| BD148 | LM148 | 3 | Ir | — | 0 |
| BD149 | LM149 | 3 | Ir | — | 0 |
| BD150 | LM150 | 3 | Ir | — | 0 |
| BD151 | LM151 | 3 | Ir | — | 0 |
| BD152 | LM152 | 3 | Ir | — | 0 |
| BD153 | LM153 | 3 | Ir | — | 0 |
| BD154 | LM154 | 3 | Ir | — | 0 |
| BD155 | LM155 | 3 | Ir | — | 0 |
| BD156 | LM156 | 3 | Ir | — | 0 |
| BD157 | LM157 | 3 | Ir | — | 0 |
| BD158 | LM158 | 3 | Ir | — | 0 |
| BD159 | LM159 | 3 | Ir | — | 0 |
| BD160 | LM160 | 3 | Ir | — | 0 |
| BD161 | LM161 | 3 | Ir | — | 0 |
| BD162 | LM162 | 3 | Ir | — | 0 |
| BD163 | LM163 | 3 | Ir | — | 0 |

TABLE 2-continued

| Compound name | $L_{101}$ | n101 | $M_{101}$ | $L_{102}$ | m101 |
|---|---|---|---|---|---|
| BD164 | LM164 | 3 | Ir | — | 0 |
| BD165 | LM165 | 3 | Ir | — | 0 |
| BD166 | LM166 | 3 | Ir | — | 0 |
| BD167 | LM167 | 3 | Ir | — | 0 |
| BD168 | LM168 | 3 | Ir | — | 0 |
| BD169 | LM169 | 3 | Ir | — | 0 |
| BD170 | LM170 | 3 | Ir | — | 0 |
| BD171 | LM171 | 3 | Ir | — | 0 |
| BD172 | LM172 | 3 | Ir | — | 0 |
| BD173 | LM173 | 3 | Ir | — | 0 |
| BD174 | LM174 | 3 | Ir | — | 0 |
| BD175 | LM175 | 3 | Ir | — | 0 |
| BD176 | LM176 | 3 | Ir | — | 0 |
| BD177 | LM177 | 3 | Ir | — | 0 |
| BD178 | LM178 | 3 | Ir | — | 0 |
| BD179 | LM179 | 3 | Ir | — | 0 |
| BD180 | LM180 | 3 | Ir | — | 0 |
| BD181 | LM181 | 3 | Ir | — | 0 |
| BD182 | LM182 | 3 | Ir | — | 0 |
| BD183 | LM183 | 3 | Ir | — | 0 |
| BD184 | LM184 | 3 | Ir | — | 0 |
| BD185 | LM185 | 3 | Ir | — | 0 |
| BD186 | LM186 | 3 | Ir | — | 0 |
| BD187 | LM187 | 3 | Ir | — | 0 |
| BD188 | LM188 | 3 | Ir | — | 0 |
| BD189 | LM189 | 3 | Ir | — | 0 |
| BD190 | LM190 | 3 | Ir | — | 0 |
| BD191 | LM191 | 3 | Ir | — | 0 |
| BD192 | LM192 | 3 | Ir | — | 0 |
| BD193 | LM193 | 3 | Ir | — | 0 |
| BD194 | LM194 | 3 | Ir | — | 0 |
| BD195 | LM195 | 3 | Ir | — | 0 |
| BD196 | LM196 | 3 | Ir | — | 0 |
| BD197 | LM197 | 3 | Ir | — | 0 |
| BD198 | LM198 | 3 | Ir | — | 0 |
| BD199 | LM199 | 3 | Ir | — | 0 |
| BD200 | LM200 | 3 | Ir | — | 0 |

TABLE 3

| Compound name | $L_{101}$ | n101 | $M_{101}$ | $L_{102}$ | m101 |
|---|---|---|---|---|---|
| BD201 | LM201 | 3 | Ir | — | 0 |
| BD202 | LM202 | 3 | Ir | — | 0 |
| BD203 | LM203 | 3 | Ir | — | 0 |
| BD204 | LM204 | 3 | Ir | — | 0 |
| BD205 | LM205 | 3 | Ir | — | 0 |
| BD206 | LM206 | 3 | Ir | — | 0 |
| BD207 | LM207 | 3 | Ir | — | 0 |
| BD208 | LM208 | 3 | Ir | — | 0 |
| BD209 | LM209 | 3 | Ir | — | 0 |
| BD210 | LM210 | 3 | Ir | — | 0 |
| BD211 | LM211 | 3 | Ir | — | 0 |
| BD212 | LM212 | 3 | Ir | — | 0 |
| BD213 | LM213 | 3 | Ir | — | 0 |
| BD214 | LM214 | 3 | Ir | — | 0 |
| BD215 | LM215 | 3 | Ir | — | 0 |
| BD216 | LM216 | 3 | Ir | — | 0 |
| BD217 | LM217 | 3 | Ir | — | 0 |
| BD218 | LM218 | 3 | Ir | — | 0 |
| BD219 | LM219 | 3 | Ir | — | 0 |
| BD220 | LM220 | 3 | Ir | — | 0 |
| BD221 | LM221 | 3 | Ir | — | 0 |
| BD222 | LM222 | 3 | Ir | — | 0 |
| BD223 | LM223 | 3 | Ir | — | 0 |
| BD224 | LM224 | 3 | Ir | — | 0 |
| BD225 | LM225 | 3 | Ir | — | 0 |
| BD226 | LM226 | 3 | Ir | — | 0 |
| BD227 | LM227 | 3 | Ir | — | 0 |
| BD228 | LM228 | 3 | Ir | — | 0 |
| BD229 | LM229 | 3 | Ir | — | 0 |
| BD230 | LM230 | 3 | Ir | — | 0 |
| BD231 | LM231 | 3 | Ir | — | 0 |
| BD232 | LM232 | 3 | Ir | — | 0 |
| BD233 | LM233 | 3 | Ir | — | 0 |

TABLE 3-continued

| Compound name | $L_{101}$ | n101 | $M_{101}$ | $L_{102}$ | m101 |
|---|---|---|---|---|---|
| BD234 | LM234 | 3 | Ir | — | 0 |
| BD235 | LM235 | 3 | Ir | — | 0 |
| BD236 | LM236 | 3 | Ir | — | 0 |
| BD237 | LM237 | 3 | Ir | — | 0 |
| BD238 | LM238 | 3 | Ir | — | 0 |
| BD239 | LM239 | 3 | Ir | — | 0 |
| BD240 | LM240 | 3 | Ir | — | 0 |
| BD241 | LM241 | 3 | Ir | — | 0 |
| BD242 | LM242 | 3 | Ir | — | 0 |
| BD243 | LM243 | 3 | Ir | — | 0 |
| BD244 | LFM1 | 3 | Ir | — | 0 |
| BD245 | LFM2 | 3 | Ir | — | 0 |
| BD246 | LFM3 | 3 | Ir | — | 0 |
| BD247 | LFM4 | 3 | Ir | — | 0 |
| BD248 | LFM5 | 3 | Ir | — | 0 |
| BD249 | LFM6 | 3 | Ir | — | 0 |
| BD250 | LFM7 | 3 | Ir | — | 0 |
| BD251 | LFP1 | 3 | Ir | — | 0 |
| BD252 | LFP2 | 3 | Ir | — | 0 |
| BD253 | LFP3 | 3 | Ir | — | 0 |
| BD254 | LFP4 | 3 | Ir | — | 0 |
| BD255 | LFP5 | 3 | Ir | — | 0 |
| BD256 | LFP6 | 3 | Ir | — | 0 |
| BD257 | LFP7 | 3 | Ir | — | 0 |
| BD258 | LM47 | 2 | Ir | AN1 | 1 |
| BD259 | LM47 | 2 | Ir | AN2 | 1 |
| BD260 | LM47 | 2 | Ir | AN3 | 1 |
| BD261 | LM47 | 2 | Ir | AN4 | 1 |
| BD262 | LM47 | 2 | Ir | AN5 | 1 |
| BD263 | LM11 | 2 | Pt | — | 0 |
| BD264 | LM13 | 2 | Pt | — | 0 |
| BD265 | LM15 | 2 | Pt | — | 0 |
| BD266 | LM45 | 2 | Pt | — | 0 |
| BD267 | LM47 | 2 | Pt | — | 0 |
| BD268 | LM49 | 2 | Pt | — | 0 |
| BD269 | LM98 | 2 | Pt | — | 0 |
| BD270 | LM100 | 2 | Pt | — | 0 |
| BD271 | LM102 | 2 | Pt | — | 0 |
| BD272 | LM132 | 2 | Pt | — | 0 |
| BD273 | LM134 | 2 | Pt | — | 0 |
| BD274 | LM136 | 2 | Pt | — | 0 |
| BD275 | LM151 | 2 | Pt | — | 0 |
| BD276 | LM153 | 2 | Pt | — | 0 |
| BD277 | LM158 | 2 | Pt | — | 0 |
| BD278 | LM180 | 2 | Pt | — | 0 |
| BD279 | LM182 | 2 | Pt | — | 0 |
| BD280 | LM187 | 2 | Pt | — | 0 |
| BD281 | LM201 | 2 | Pt | — | 0 |
| BD282 | LM206 | 2 | Pt | — | 0 |
| BD283 | LM211 | 2 | Pt | — | 0 |
| BD284 | LM233 | 2 | Pt | — | 0 |
| BD285 | LM235 | 2 | Pt | — | 0 |
| BD286 | LM240 | 2 | Pt | — | 0 |
| BD287 | LFM5 | 2 | Pt | — | 0 |
| BD288 | LFM6 | 2 | Pt | — | 0 |
| BD289 | LFM7 | 2 | Pt | — | 0 |
| BD290 | LFP5 | 2 | Pt | — | 0 |
| BD291 | LFP6 | 2 | Pt | — | 0 |
| BD292 | LFP7 | 2 | Pt | — | 0 |
| BD293 | LM47 | 1 | Pt | AN1 | 1 |
| BD294 | LM47 | 1 | Pt | AN2 | 1 |
| BD295 | LM47 | 1 | Pt | AN3 | 1 |
| BD296 | LM47 | 1 | Pt | AN4 | 1 |
| BD297 | LM47 | 1 | Pt | AN5 | 1 |

In Table 1, AN1 to AN5 are each the same as described below:

AN1

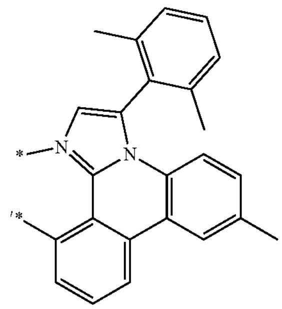

AN2

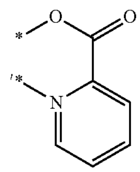

AN3

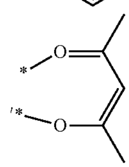

AN4

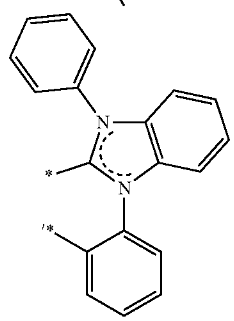

AN5

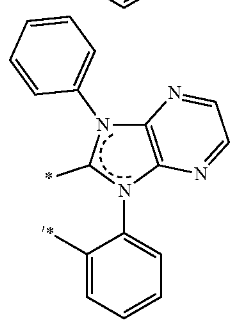

LM1 to LM243 in Tables 1 to 3 may be understood by referring to Formulae 1-1 to 1-3 and Tables 4 to 6:

1-1

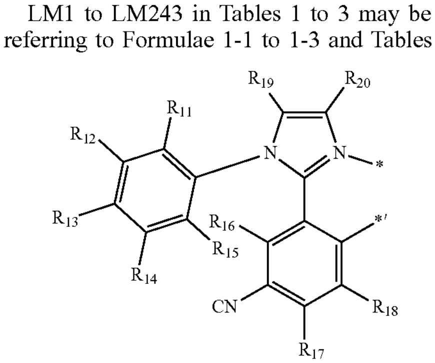

-continued 1-2

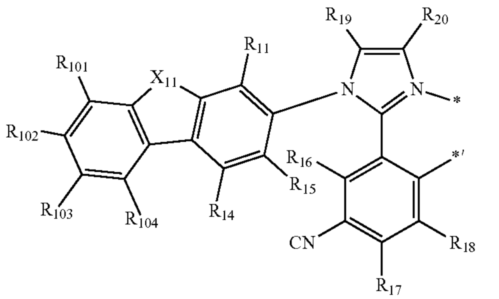

-continued 1-3

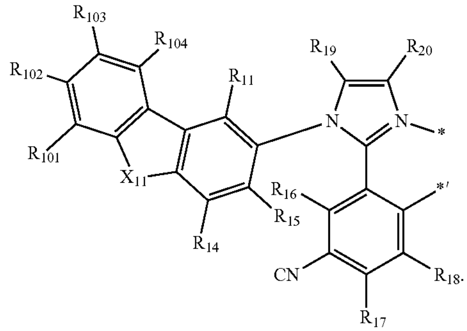

TABLE 4

| Formula 1-1 | | | | | | | | | | |
|---|---|---|---|---|---|---|---|---|---|---|
| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM1 | X1 | H | X3 | H | X1 | H | H | H | H | D |
| LM2 | X1 | H | X3 | H | X1 | H | H | H | D | H |
| LM3 | X1 | H | X3 | H | X1 | H | H | H | D | D |
| LM4 | Y1 | H | X3 | H | Y1 | H | H | H | D | D |
| LM5 | Y2 | H | X3 | H | Y2 | H | H | H | D | D |
| LM6 | Y3 | H | X3 | H | Y3 | H | H | H | D | D |
| LM7 | Y3 | D | X3 | D | Y3 | H | H | H | D | D |
| LM8 | Y3 | D | X3 | D | Y3 | D | H | H | D | D |
| LM9 | Y3 | D | X3 | D | Y3 | D | D | H | D | D |
| LM10 | Y3 | D | X3 | D | Y3 | D | D | D | D | D |
| LM11 | Y3 | D | Y11 | D | Y3 | D | D | D | D | D |
| LM12 | Y3 | D | Y11 | D | Y3 | H | X1 | H | D | D |
| LM13 | Y3 | D | Y11 | D | Y3 | D | Y3 | D | D | D |
| LM14 | Y3 | D | Y11 | D | Y3 | H | X4 | H | D | D |
| LM15 | Y3 | D | Y11 | D | Y3 | D | Y12 | D | D | D |
| LM16 | X2 | H | X3 | H | X2 | H | H | H | H | D |
| LM17 | X2 | H | X3 | H | X2 | H | H | H | D | H |
| LM18 | X2 | H | X3 | H | X2 | H | H | H | D | D |
| LM19 | Y4 | H | X3 | H | Y4 | H | H | H | D | D |
| LM20 | Y5 | H | X3 | H | Y5 | H | H | H | D | D |
| LM21 | Y6 | H | X3 | H | Y6 | H | H | H | D | D |
| LM22 | Y7 | H | X3 | H | Y7 | H | H | H | D | D |
| LM23 | Y8 | H | X3 | H | Y8 | H | H | H | D | D |
| LM24 | Y9 | H | X3 | H | Y9 | H | H | H | D | D |
| LM25 | Y10 | H | X3 | H | Y10 | H | H | H | D | D |
| LM26 | Y10 | D | X3 | D | Y10 | H | H | H | D | D |
| LM27 | Y10 | D | X3 | D | Y10 | D | H | H | D | D |
| LM28 | Y10 | D | X3 | D | Y10 | D | D | H | D | D |
| LM29 | Y10 | D | X3 | D | Y10 | D | D | D | D | D |
| LM30 | Y10 | D | Y11 | D | Y10 | D | D | D | D | D |
| LM31 | Y10 | D | Y11 | D | Y10 | H | X1 | H | D | D |
| LM32 | Y10 | D | Y11 | D | Y10 | D | Y3 | D | D | D |
| LM33 | Y10 | D | Y11 | D | Y10 | H | X4 | H | D | D |
| LM34 | Y10 | D | Y11 | D | Y10 | D | Y12 | D | D | D |
| LM35 | X1 | H | X4 | H | X1 | H | H | H | H | D |
| LM36 | X1 | H | X4 | H | X1 | H | H | H | D | H |
| LM37 | X1 | H | X4 | H | X1 | H | H | H | D | D |
| LM38 | Y1 | H | X4 | H | Y1 | H | H | H | D | D |
| LM39 | Y2 | H | X4 | H | Y2 | H | H | H | D | D |
| LM40 | Y3 | H | X4 | H | Y3 | H | H | H | D | D |
| LM41 | Y3 | D | X4 | D | Y3 | H | H | H | D | D |
| LM42 | Y3 | D | X4 | D | Y3 | D | H | H | D | D |
| LM43 | Y3 | D | X4 | D | Y3 | D | D | H | D | D |
| LM44 | Y3 | D | X4 | D | Y3 | D | D | D | D | D |
| LM45 | Y3 | D | Y12 | D | Y3 | D | D | D | D | D |
| LM46 | Y3 | D | Y12 | D | Y3 | H | X1 | H | D | D |
| LM47 | Y3 | D | Y12 | D | Y3 | D | Y3 | D | D | D |
| LM48 | Y3 | D | Y12 | D | Y3 | H | X4 | H | D | D |
| LM49 | Y3 | D | Y12 | D | Y3 | D | Y12 | D | D | D |
| LM50 | X2 | H | X4 | H | X2 | H | H | H | H | D |
| LM51 | X2 | H | X4 | H | X2 | H | H | H | D | H |
| LM52 | X2 | H | X4 | H | X2 | H | H | H | D | D |
| LM53 | Y4 | H | X4 | H | Y4 | H | H | H | D | D |
| LM54 | Y5 | H | X4 | H | Y5 | H | H | H | D | D |
| LM55 | Y6 | H | X4 | H | Y6 | H | H | H | D | D |

TABLE 4-continued

| Formula 1-1 | | | | | | | | | | |
|---|---|---|---|---|---|---|---|---|---|---|
| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM56 | Y7 | H | X4 | H | Y7 | H | H | H | D | D |
| LM57 | Y8 | H | X4 | H | Y8 | H | H | H | D | D |
| LM58 | Y9 | H | X4 | H | Y9 | H | H | H | D | D |
| LM59 | Y10 | H | X4 | H | Y10 | H | H | H | D | D |
| LM60 | Y10 | D | X4 | D | Y10 | H | H | H | D | D |
| LM61 | Y10 | D | X4 | D | Y10 | D | H | H | D | D |
| LM62 | Y10 | D | X4 | D | Y10 | D | D | H | D | D |
| LM63 | Y10 | D | X4 | D | Y10 | D | D | D | D | D |
| LM64 | Y10 | D | Y12 | D | Y10 | D | D | D | D | D |
| LM65 | Y10 | D | Y12 | D | Y10 | H | X1 | H | D | D |
| LM66 | Y10 | D | Y12 | D | Y10 | D | Y3 | D | D | D |
| LM67 | Y10 | D | Y12 | D | Y10 | H | X4 | H | D | D |
| LM68 | Y10 | D | Y12 | D | Y10 | D | Y12 | D | D | D |
| LM69 | X1 | H | X5 | H | X1 | H | H | H | H | D |
| LM70 | X1 | H | X5 | H | X1 | H | H | H | D | H |
| LM71 | X1 | H | X5 | H | X1 | H | H | H | D | D |
| LM72 | Y1 | H | X5 | H | Y1 | H | H | H | D | D |
| LM73 | Y2 | H | X5 | H | Y2 | H | H | H | D | D |
| LM74 | Y3 | H | X5 | H | Y3 | H | H | H | D | D |
| LM75 | Y3 | D | X5 | D | Y3 | H | H | H | D | D |
| LM76 | Y3 | D | X5 | D | Y3 | D | H | H | D | D |
| LM77 | Y3 | D | X5 | D | Y3 | D | D | H | D | D |
| LM78 | Y3 | D | X5 | D | Y3 | D | D | D | D | D |
| LM79 | Y3 | D | Y13 | D | Y3 | D | D | D | D | D |
| LM80 | Y3 | D | Y13 | D | Y3 | H | X1 | H | D | D |
| LM81 | Y3 | D | Y13 | D | Y3 | D | Y3 | D | D | D |
| LM82 | Y3 | D | Y13 | D | Y3 | H | X4 | H | D | D |
| LM83 | Y3 | D | Y13 | D | Y3 | D | Y12 | D | D | D |
| LM84 | X2 | H | X5 | H | X2 | H | H | H | H | D |
| LM85 | X2 | H | X5 | H | X2 | H | H | H | D | H |
| LM86 | X2 | H | X5 | H | X2 | H | H | H | D | D |
| LM87 | Y4 | H | X5 | H | Y4 | H | H | H | D | D |
| LM88 | Y5 | H | X5 | H | Y5 | H | H | H | D | D |
| LM89 | Y6 | H | X5 | H | Y6 | H | H | H | D | D |
| LM90 | Y7 | H | X5 | H | Y7 | H | H | H | D | D |
| LM91 | Y8 | H | X5 | H | Y8 | H | H | H | D | D |
| LM92 | Y9 | H | X5 | H | Y9 | H | H | H | D | D |
| LM93 | Y10 | H | X5 | H | Y10 | H | H | H | D | D |
| LM94 | Y10 | D | X5 | D | Y10 | H | H | H | D | D |
| LM95 | Y10 | D | X5 | D | Y10 | D | H | H | D | D |
| LM96 | Y10 | D | X5 | D | Y10 | D | D | H | D | D |
| LM97 | Y10 | D | X5 | D | Y10 | D | D | D | D | D |
| LM98 | Y10 | D | Y13 | D | Y10 | D | D | D | D | D |
| LM99 | Y10 | D | Y13 | D | Y10 | H | X1 | H | D | D |
| LM100 | Y10 | D | Y13 | D | Y10 | D | Y3 | D | D | D |
| LM101 | Y10 | D | Y13 | D | Y10 | H | X4 | H | D | D |
| LM102 | Y10 | D | Y13 | D | Y10 | D | Y12 | D | D | D |
| LM103 | X1 | H | X6 | H | X1 | H | H | H | H | D |
| LM104 | X1 | H | X6 | H | X1 | H | H | H | D | H |
| LM105 | X1 | H | X6 | H | X1 | H | H | H | D | D |
| LM106 | Y1 | H | X6 | H | Y1 | H | H | H | D | D |
| LM107 | Y2 | H | X6 | H | Y2 | H | H | H | D | D |
| LM108 | Y3 | H | X6 | H | Y3 | H | H | H | D | D |
| LM109 | Y3 | D | X6 | D | Y3 | H | H | H | D | D |
| LM110 | Y3 | D | X6 | D | Y3 | D | H | H | D | D |
| LM111 | Y3 | D | X6 | D | Y3 | D | D | H | D | D |
| LM112 | Y3 | D | X6 | D | Y3 | D | D | D | D | D |
| LM113 | Y3 | D | Y14 | D | Y3 | D | D | D | D | D |
| LM114 | Y3 | D | Y14 | D | Y3 | H | X1 | H | D | D |
| LM115 | Y3 | D | Y14 | D | Y3 | D | Y3 | D | D | D |
| LM116 | Y3 | D | Y14 | D | Y3 | H | X4 | H | D | D |
| LM117 | Y3 | D | Y14 | D | Y3 | D | Y12 | D | D | D |
| LM118 | X2 | H | X6 | H | X2 | H | H | H | H | D |
| LM119 | X2 | H | X6 | H | X2 | H | H | H | D | H |
| LM120 | X2 | H | X6 | H | X2 | H | H | H | D | D |
| LM121 | Y4 | H | X6 | H | Y4 | H | H | H | D | D |
| LM122 | Y5 | H | X6 | H | Y5 | H | H | H | D | D |
| LM123 | Y6 | H | X6 | H | Y6 | H | H | H | D | D |
| LM124 | Y7 | H | X6 | H | Y7 | H | H | H | D | D |
| LM125 | Y8 | H | X6 | H | Y8 | H | H | H | D | D |
| LM126 | Y9 | H | X6 | H | Y9 | H | H | H | D | D |
| LM127 | Y10 | H | X6 | H | Y10 | H | H | H | D | D |
| LM128 | Y10 | D | X6 | D | Y10 | H | H | H | D | D |
| LM129 | Y10 | D | X6 | D | Y10 | D | H | H | D | D |
| LM130 | Y10 | D | X6 | D | Y10 | D | D | H | D | D |
| LM131 | Y10 | D | X6 | D | Y10 | D | D | D | D | D |

TABLE 4-continued

| Formula 1-1 | | | | | | | | | | |
|---|---|---|---|---|---|---|---|---|---|---|
| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM132 | Y10 | D | Y14 | D | Y10 | D | D | D | D | D |
| LM133 | Y10 | D | Y14 | D | Y10 | H | X1 | H | D | D |
| LM134 | Y10 | D | Y14 | D | Y10 | D | Y3 | D | D | D |
| LM135 | Y10 | D | Y14 | D | Y10 | H | X4 | H | D | D |
| LM136 | Y10 | D | Y14 | D | Y10 | D | Y12 | D | D | D |
| LM137 | X1 | H | X7 | H | X1 | H | H | H | H | D |
| LM138 | X1 | H | X7 | H | X1 | H | H | H | D | H |
| LM139 | X1 | H | X7 | H | X1 | H | H | H | D | D |
| LM140 | Y1 | H | X7 | H | Y1 | H | H | H | D | D |
| LM141 | Y2 | H | X7 | H | Y2 | H | H | H | D | D |
| LM142 | Y3 | H | X7 | H | Y3 | H | H | H | D | D |
| LM143 | Y3 | D | X7 | D | Y3 | H | H | H | D | D |
| LM144 | Y3 | D | X7 | D | Y3 | D | H | H | D | D |
| LM145 | Y3 | D | X7 | D | Y3 | D | D | H | D | D |
| LM146 | Y3 | D | X7 | D | Y3 | D | D | D | D | D |
| LM147 | Y3 | D | X8 | D | Y3 | D | D | D | D | D |
| LM148 | Y3 | D | Y16 | D | Y3 | D | D | D | D | D |
| LM149 | Y3 | D | Y17 | D | Y3 | D | D | D | D | D |
| LM150 | Y3 | D | Y18 | D | Y3 | D | D | D | D | D |
| LM151 | Y3 | D | Y15 | D | Y3 | D | D | D | D | D |
| LM152 | Y3 | D | Y15 | D | Y3 | H | X1 | H | D | D |
| LM153 | Y3 | D | Y15 | D | Y3 | D | Y3 | D | D | D |
| LM154 | Y3 | D | Y16 | D | Y3 | D | Y3 | D | D | D |
| LM155 | Y3 | D | Y17 | D | Y3 | D | Y3 | D | D | D |
| LM156 | Y3 | D | Y18 | D | Y3 | D | Y3 | D | D | D |
| LM157 | Y3 | D | Y15 | D | Y3 | H | X4 | H | D | D |
| LM158 | Y3 | D | Y15 | D | Y3 | D | Y12 | D | D | D |
| LM159 | Y3 | D | Y16 | D | Y3 | D | Y12 | D | D | D |
| LM160 | Y3 | D | Y17 | D | Y3 | D | Y12 | D | D | D |
| LM161 | Y3 | D | Y18 | D | Y3 | D | Y12 | D | D | D |
| LM162 | X2 | H | X7 | H | X2 | H | H | H | H | D |
| LM163 | X2 | H | X7 | H | X2 | H | H | H | D | H |
| LM164 | X2 | H | X7 | H | X2 | H | H | H | D | D |
| LM165 | Y4 | H | X7 | H | Y4 | H | H | H | D | D |
| LM166 | Y5 | H | X7 | H | Y5 | H | H | H | D | D |
| LM167 | Y6 | H | X7 | H | Y6 | H | H | H | D | D |
| LM168 | Y7 | H | X7 | H | Y7 | H | H | H | D | D |
| LM169 | Y8 | H | X7 | H | Y8 | H | H | H | D | D |
| LM170 | Y9 | H | X7 | H | Y9 | H | H | H | D | D |
| LM171 | Y10 | H | X7 | H | Y10 | H | H | H | D | D |
| LM172 | Y10 | D | X7 | D | Y10 | H | H | H | D | D |
| LM173 | Y10 | D | X7 | D | Y10 | D | H | H | D | D |
| LM174 | Y10 | D | X7 | D | Y10 | D | D | H | D | D |
| LM175 | Y10 | D | X7 | D | Y10 | D | D | D | D | D |
| LM176 | Y10 | D | X8 | D | Y10 | D | D | D | D | D |
| LM177 | Y10 | D | Y16 | D | Y10 | D | D | D | D | D |
| LM178 | Y10 | D | Y17 | D | Y10 | D | D | D | D | D |
| LM179 | Y10 | D | Y18 | D | Y10 | D | D | D | D | D |
| LM180 | Y10 | D | Y15 | D | Y10 | D | D | D | D | D |
| LM181 | Y10 | D | Y15 | D | Y10 | H | X1 | H | D | D |
| LM182 | Y10 | D | Y15 | D | Y10 | D | Y3 | D | D | D |
| LM183 | Y10 | D | Y16 | D | Y10 | D | Y3 | D | D | D |
| LM184 | Y10 | D | Y17 | D | Y10 | D | Y3 | D | D | D |
| LM185 | Y10 | D | Y18 | D | Y10 | D | Y3 | D | D | D |
| LM186 | Y10 | D | Y15 | D | Y10 | H | X4 | H | D | D |
| LM187 | Y10 | D | Y15 | D | Y10 | D | Y12 | D | D | D |
| LM188 | Y10 | D | Y16 | D | Y10 | D | Y12 | D | D | D |
| LM189 | Y10 | D | Y17 | D | Y10 | D | Y12 | D | D | D |
| LM190 | Y10 | D | Y18 | D | Y10 | D | Y12 | D | D | D |
| LM191 | X1 | X7 | H | H | X1 | H | H | H | H | D |
| LM192 | X1 | X7 | H | H | X1 | H | H | H | D | H |
| LM193 | X1 | X7 | H | H | X1 | H | H | H | D | D |
| LM194 | Y1 | X7 | H | H | Y1 | H | H | H | D | D |
| LM195 | Y2 | X7 | H | H | Y2 | H | H | H | D | D |
| LM196 | Y3 | X7 | H | H | Y3 | H | H | H | D | D |
| LM197 | Y3 | X7 | D | D | Y3 | H | H | H | D | D |
| LM198 | Y3 | X7 | D | D | Y3 | D | H | H | D | D |
| LM199 | Y3 | X7 | D | D | Y3 | D | D | H | D | D |
| LM200 | Y3 | X7 | D | D | Y3 | D | D | D | D | D |
| LM201 | Y3 | Y15 | D | D | Y3 | D | D | D | D | D |
| LM202 | Y3 | Y16 | D | D | Y3 | D | D | D | D | D |
| LM203 | Y3 | Y17 | D | D | Y3 | D | D | D | D | D |
| LM204 | Y3 | Y18 | D | D | Y3 | D | D | D | D | D |
| LM205 | Y3 | Y15 | D | D | Y3 | H | X1 | H | D | D |
| LM206 | Y3 | Y15 | D | D | Y3 | D | Y3 | D | D | D |
| LM207 | Y3 | Y16 | D | D | Y3 | D | Y3 | D | D | D |

TABLE 4-continued

| Formula 1-1 | | | | | | | | | | |
|---|---|---|---|---|---|---|---|---|---|---|
| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM208 | Y3 | Y17 | D | D | Y3 | D | Y3 | D | D | D |
| LM209 | Y3 | Y18 | D | D | Y3 | D | Y3 | D | D | D |
| LM210 | Y3 | Y15 | D | D | Y3 | H | X4 | H | D | D |
| LM211 | Y3 | Y15 | D | D | Y3 | D | Y12 | D | D | D |
| LM212 | Y3 | Y16 | D | D | Y3 | D | Y12 | D | D | D |
| LM213 | Y3 | Y17 | D | D | Y3 | D | Y12 | D | D | D |
| LM214 | Y3 | Y18 | D | D | Y3 | D | Y12 | D | D | D |
| LM215 | X2 | X7 | H | H | X2 | H | H | H | H | D |
| LM216 | X2 | X7 | H | H | X2 | H | H | H | D | H |
| LM217 | X2 | X7 | H | H | X2 | H | H | H | D | D |
| LM218 | Y4 | X7 | H | H | Y4 | H | H | H | D | D |
| LM219 | Y5 | X7 | H | H | Y5 | H | H | H | D | D |
| LM220 | Y6 | X7 | H | H | Y6 | H | H | H | D | D |
| LM221 | Y7 | X7 | H | H | Y7 | H | H | H | D | D |
| LM222 | Y8 | X7 | H | H | Y8 | H | H | H | D | D |
| LM223 | Y9 | X7 | H | H | Y9 | H | H | H | D | D |
| LM224 | Y10 | X7 | H | H | Y10 | H | H | H | D | D |
| LM225 | Y10 | X7 | D | D | Y10 | H | H | H | D | D |
| LM226 | Y10 | X7 | D | D | Y10 | D | H | H | D | D |
| LM227 | Y10 | X7 | D | D | Y10 | D | D | H | D | D |
| LM228 | Y10 | X7 | D | D | Y10 | D | D | D | D | D |
| LM229 | Y10 | X8 | D | D | Y10 | D | D | D | D | D |
| LM230 | Y10 | Y16 | D | D | Y10 | D | D | D | D | D |
| LM231 | Y10 | Y17 | D | D | Y10 | D | D | D | D | D |
| LM232 | Y10 | Y18 | D | D | Y10 | D | D | D | D | D |
| LM233 | Y10 | Y15 | D | D | Y10 | D | D | D | D | D |
| LM234 | Y10 | Y15 | D | D | Y10 | H | X1 | H | D | D |
| LM235 | Y10 | Y15 | D | D | Y10 | D | Y3 | D | D | D |
| LM236 | Y10 | Y16 | D | D | Y10 | D | Y3 | D | D | D |
| LM237 | Y10 | Y17 | D | D | Y10 | D | Y3 | D | D | D |
| LM238 | Y10 | Y18 | D | D | Y10 | D | Y3 | D | D | D |
| LM239 | Y10 | Y15 | D | D | Y10 | H | X4 | H | D | D |
| LM240 | Y10 | Y15 | D | D | Y10 | D | Y12 | D | D | D |
| LM241 | Y10 | Y16 | D | D | Y10 | D | Y12 | D | D | D |
| LM242 | Y10 | Y17 | D | D | Y10 | D | Y12 | D | D | D |
| LM243 | Y10 | Y18 | D | D | Y10 | D | Y12 | D | D | D |

TABLE 5

| Formula 1-2 | | | | | | | | | | | | |
|---|---|---|---|---|---|---|---|---|---|---|---|---|
| Ligand name | $R_{11}$ | $X_{11}$ | $R_{101}$ | $R_{102}$ | $R_{103}$ | $R_{104}$ | $R_{14}$ | $R_{15}$ | $R_{16}$ | $R_{17}$ | $R_{18}$ | $R_{19}$ | $R_{20}$ |
| LFM1 | Y10 | N-Ph | D | D | D | D | D | Y10 | D | D | D | D | D |
| LFM2 | Y10 | S | D | D | D | D | D | Y10 | D | D | D | D | D |
| LFM3 | Y10 | O | D | D | D | D | D | Y10 | D | D | D | D | D |
| LFM4 | Y3 | O | D | D | D | D | D | Y3 | D | D | D | D | D |
| LFM5 | Y10 | O | D | D | D | D | D | Y10 | D | D | D | D | D |
| LFM6 | Y10 | O | D | D | D | D | D | Y10 | D | Y3 | D | D | D |
| LFM7 | Y10 | O | D | D | D | D | D | Y10 | D | Y12 | D | D | D |

TABLE 6

| Formula 1-3 | | | | | | | | | | | | |
|---|---|---|---|---|---|---|---|---|---|---|---|---|
| Ligand name | $R_{11}$ | $X_{11}$ | $R_{101}$ | $R_{102}$ | $R_{103}$ | $R_{104}$ | $R_{14}$ | $R_{15}$ | $R_{16}$ | $R_{17}$ | $R_{18}$ | $R_{19}$ | $R_{20}$ |
| LFP1 | Y10 | N-Ph | D | D | D | D | D | Y10 | D | D | D | D | D |
| LFP2 | Y10 | S | D | D | D | D | D | Y10 | D | D | D | D | D |
| LFP3 | Y10 | O | D | D | D | D | D | Y10 | D | D | D | D | D |
| LFP4 | Y3 | O | D | D | D | D | D | Y3 | D | D | D | D | D |
| LFP5 | Y10 | O | D | D | D | D | D | Y10 | D | D | D | D | D |
| LFP6 | Y10 | O | D | D | D | D | D | Y10 | D | Y3 | D | D | D |
| LFP7 | Y10 | O | D | D | D | D | D | Y10 | D | Y12 | D | D | D |

X1 to X10 and Y1 to Y18 in Tables 4 to 6 are each the same as described below, and Ph in the tables refers to a phenyl group:
X1
$*—CH_3$
X2
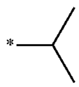
X3
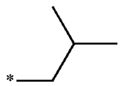
X4
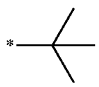
X5
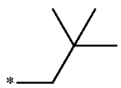
X6
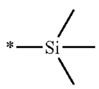
X7
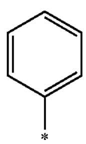
X8
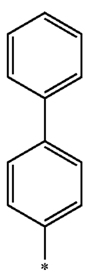
X9
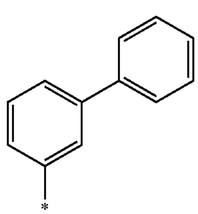
X10
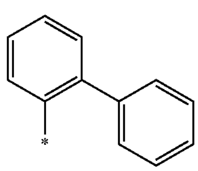
Y1
$*—CH_2D$
Y2
$*—CHD_2$
Y3
$*—CD_3$
-continued
Y4
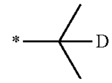
Y5
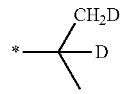
Y6
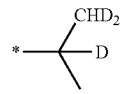
Y7
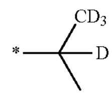
Y8
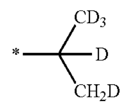
Y9
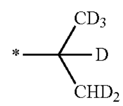
Y10
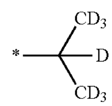
Y11
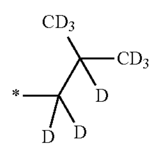
Y12
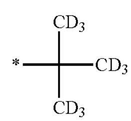
Y13
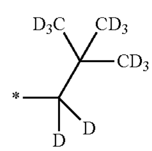
Y14
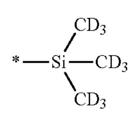
Y15
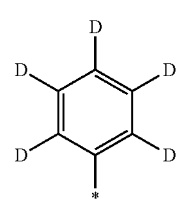

-continued
Y16
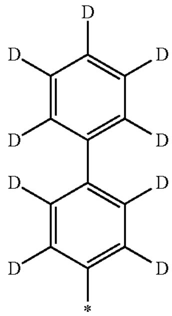
Y17
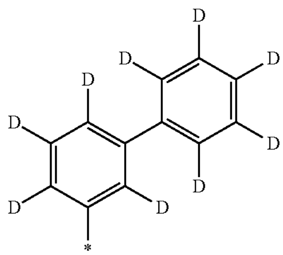
Y18
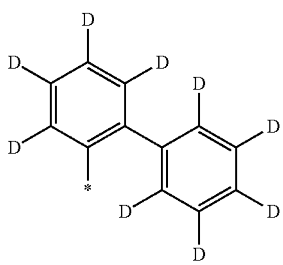
Group PD6
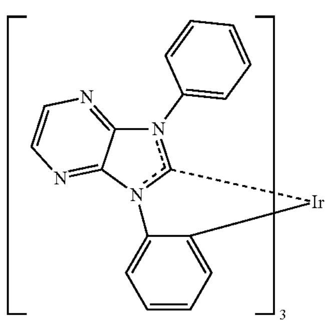
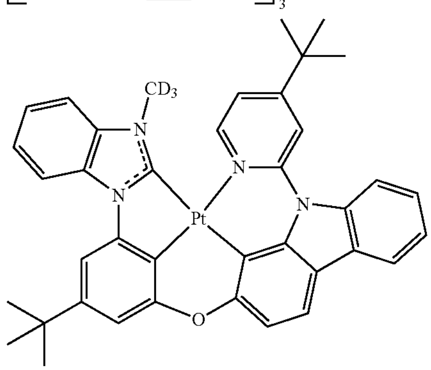
-continued
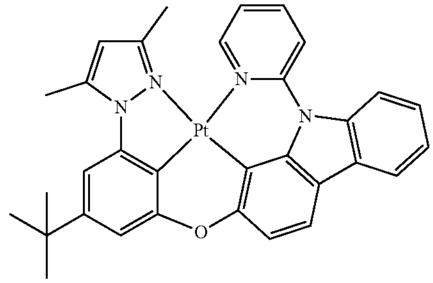
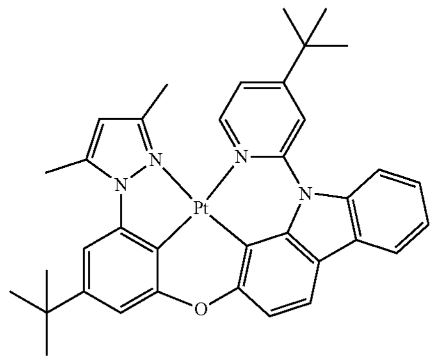
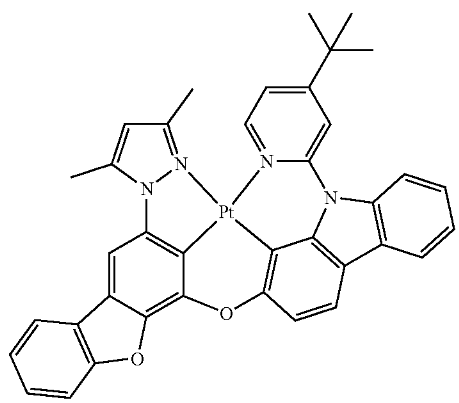
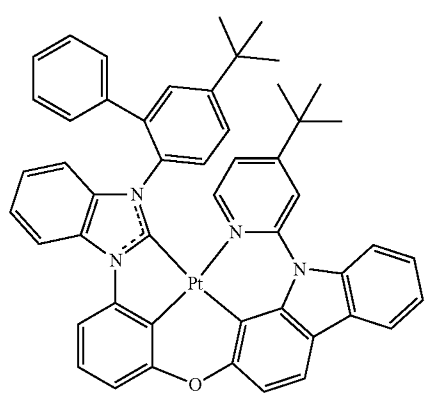

-continued

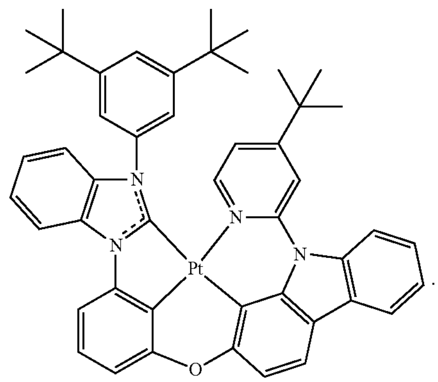

The delayed fluorescence dopant may be a metal atom-free compound of which $\Delta E_{ST}$ is 0.2 eV or less. When $\Delta E_{ST}$ of the delayed fluorescence dopant is 0.2 eV or less, an up-conversion process due to reverse intersystem crossing (RISC) is advantageous, and thus, the efficiency of an organic light-emitting device including the delayed fluorescence dopant may be improved.

In an embodiment, the delayed fluorescence dopant may be represented by Formula 201 or 202:

Formula 201

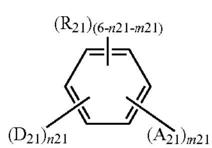

Formula 202

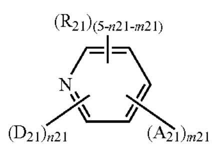

wherein, in Formulae 201 and 202, $A_{21}$ may be an acceptor group, $D_{21}$ may be a donor group, m21 may be 1, 2, or 3, and n21 may be 1, 2, or 3, the sum of n21 and m21 in Formula 201 may be 6 or less, and the sum of n21 and m21 in Formula 202 may be 5 or less;

$R_{21}$ may be hydrogen, deuterium, —F, —Cl, —Br, —I, $SF_5$, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ alkylheteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), and a plurality of $R_{21}$(s) may optionally be bonded to form a substituted or unsubstituted $C_5$-$C_{30}$ carbocyclic group or a substituted or unsubstituted $C_1$-$C_{30}$ heterocyclic group, $Q_1$ to $Q_3$ may each independently be hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a $C_6$-$C_{60}$ aryl group that is substituted with deuterium, —F, a cyano group, a $C_1$-$C_{60}$ alkyl group, a $C_6$-$C_{60}$ aryl group, or a combination thereof.

In an embodiment, $A_{21}$ in Formulae 201 and 202 may be a substituted or unsubstituted π electron-deficient nitrogen-free cyclic group.

In an embodiment, $D_{21}$ in Formulae 201 and 202 may be: —F, a cyano group, or a π electron-deficient nitrogen-containing cyclic group;

a $C_1$-$C_{60}$ alkyl group, a it electron-deficient nitrogen-containing cyclic group, or an it electron-deficient nitrogen-free cyclic group, each substituted with at least one —F, a cyano group, or a combination thereof; or a π electron-deficient nitrogen-containing cyclic group, substituted with at least one deuterium, a $C_1$-$C_{60}$ alkyl group, a π electron-deficient nitrogen-containing cyclic group, a π electron-deficient nitrogen-free cyclic group, or a combination thereof.

In an embodiment, the π electron-deficient nitrogen-free cyclic group and the π electron-deficient nitrogen-containing cyclic group are each the same as described above.

In an embodiment, the delayed fluorescence dopant may be a group of DF1 to DF5, but embodiments of the disclosure are not limited thereto:

Group DF1
1
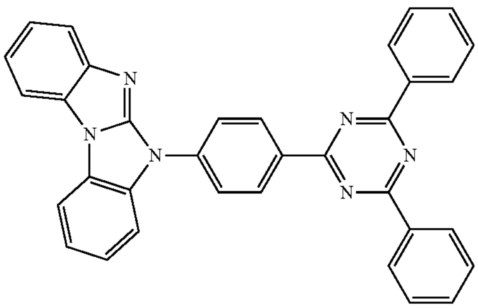
2
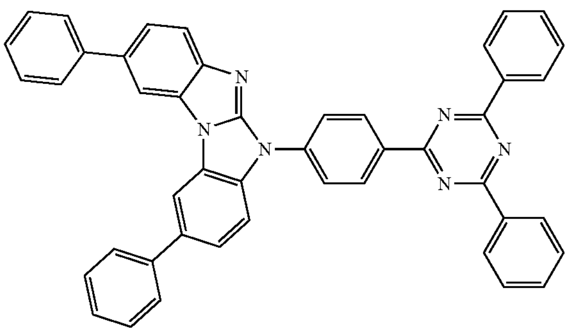
3
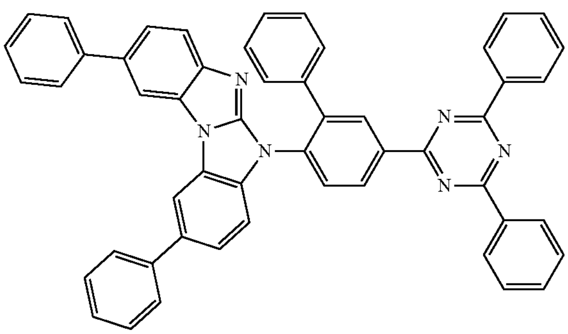
4
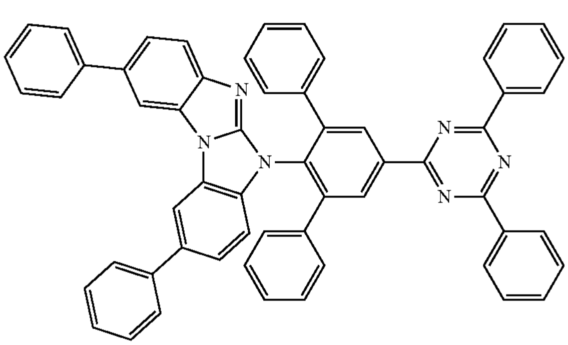
-continued
5
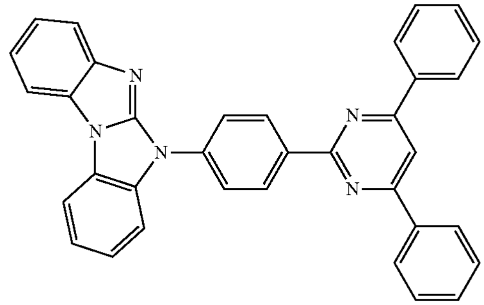
6
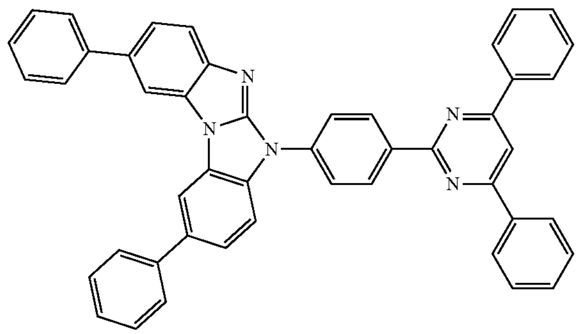
7
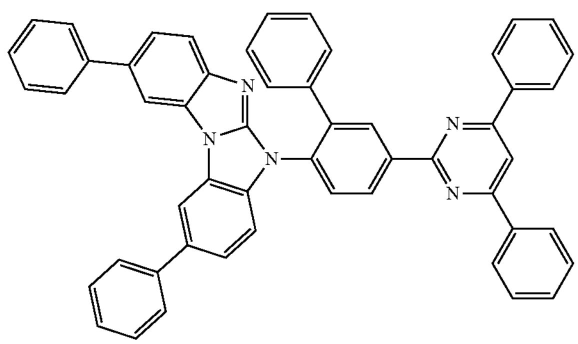
8
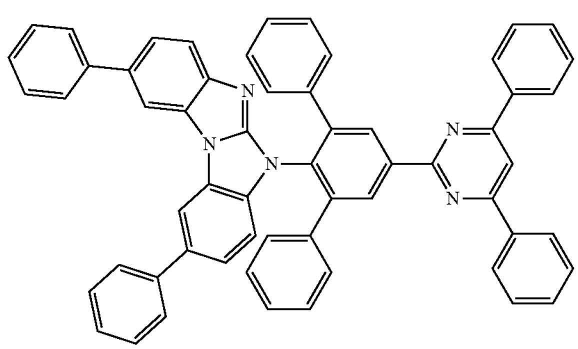

-continued
9
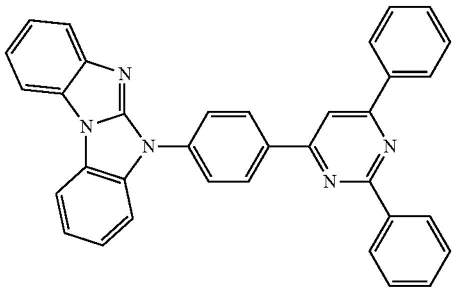
10
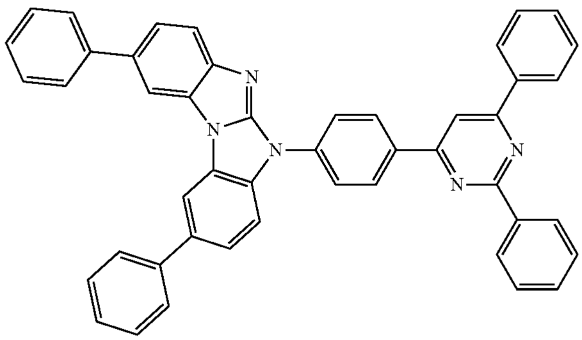
11
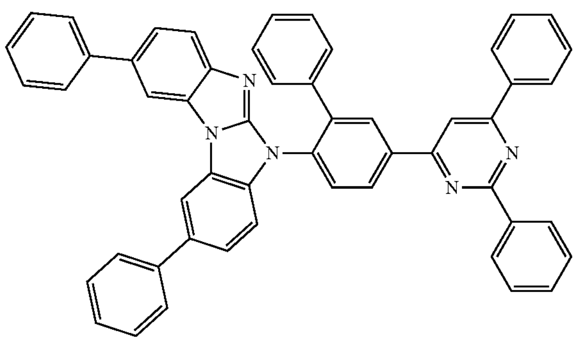
12
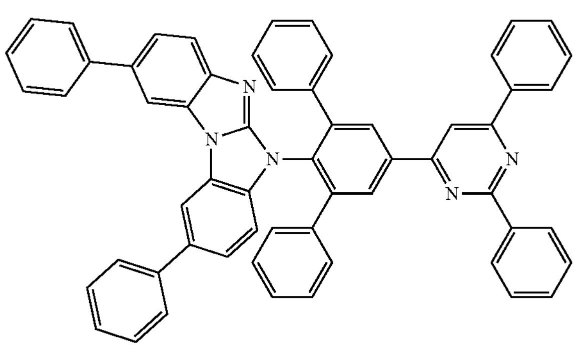
-continued
13
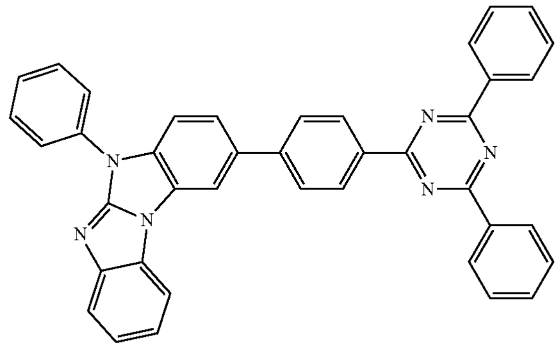
14
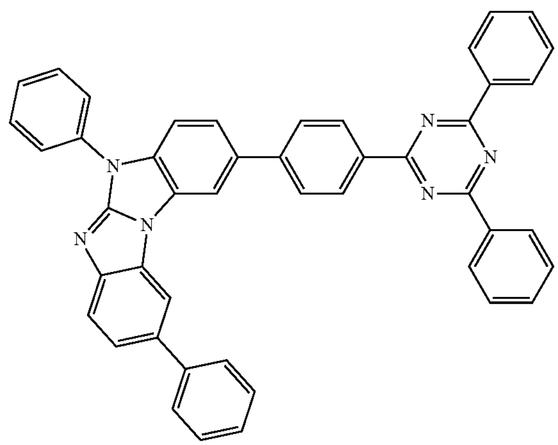
15
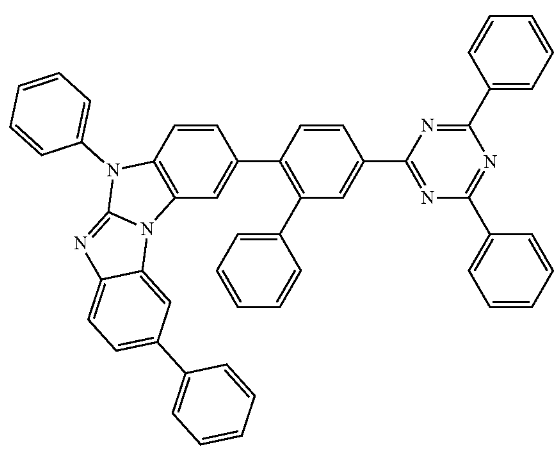

16
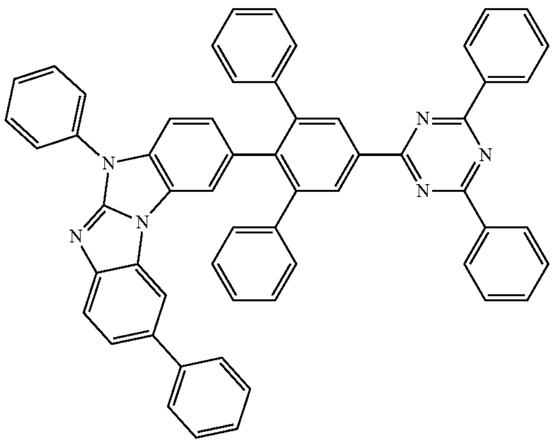
17
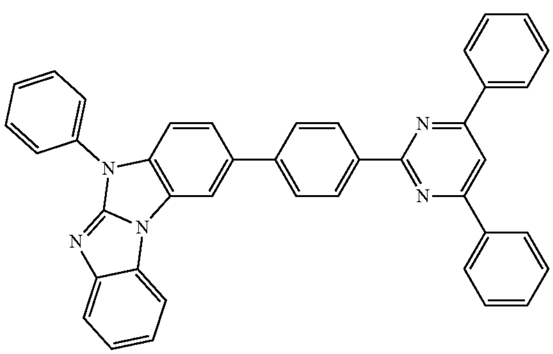
18
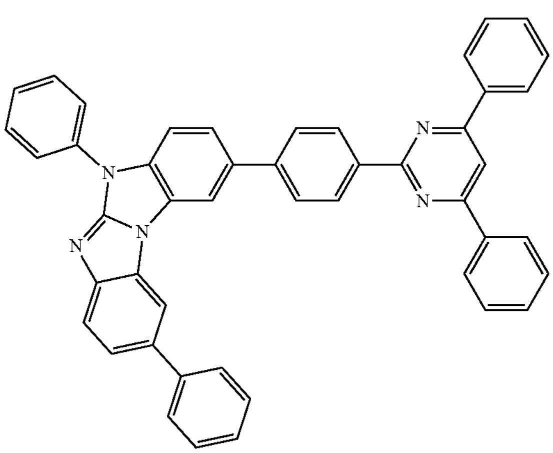
19
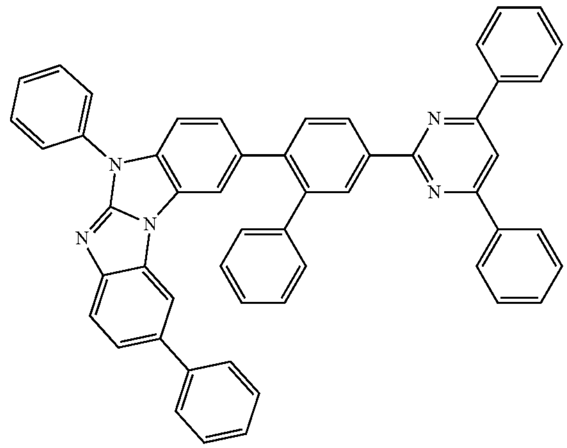
20
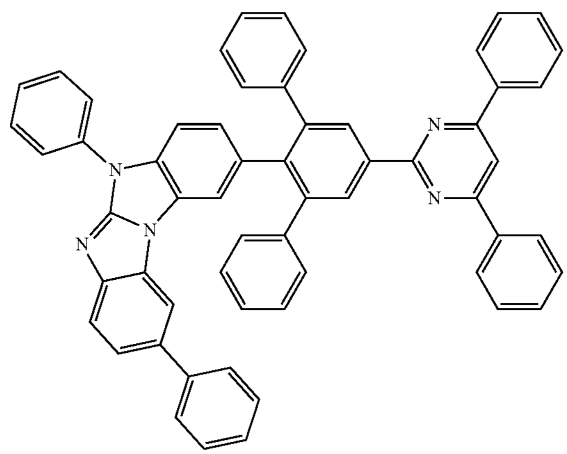
21
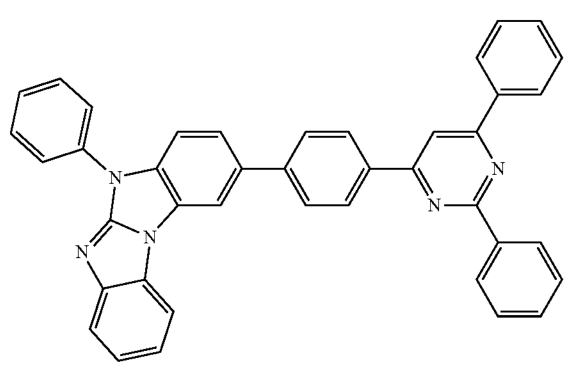

-continued
22
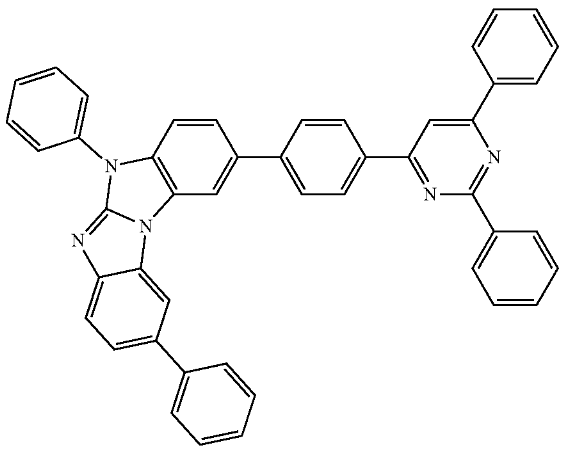
23
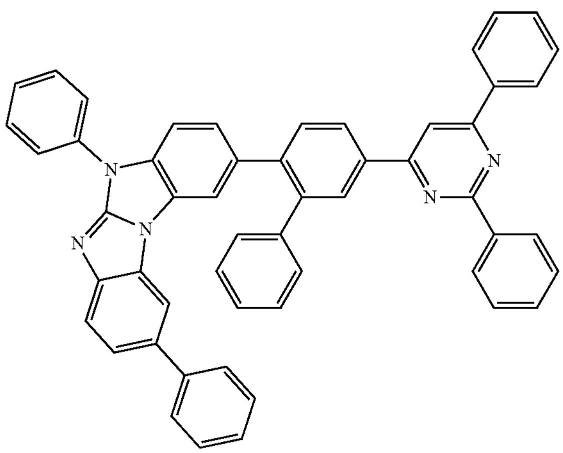
24
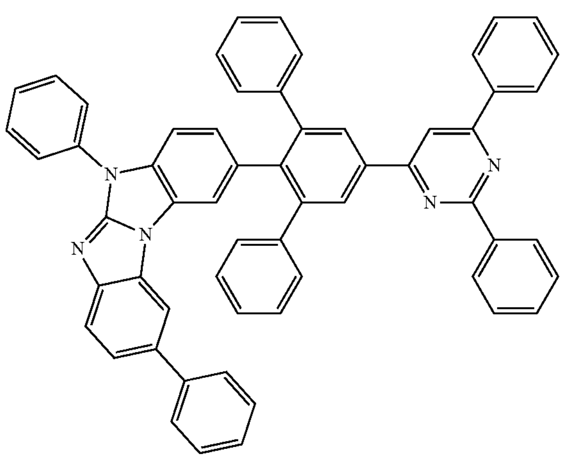
-continued
25
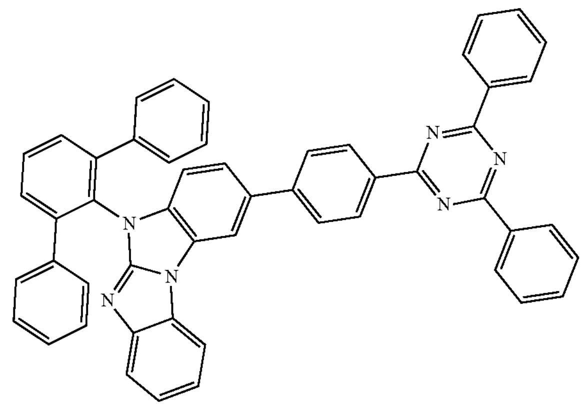
26
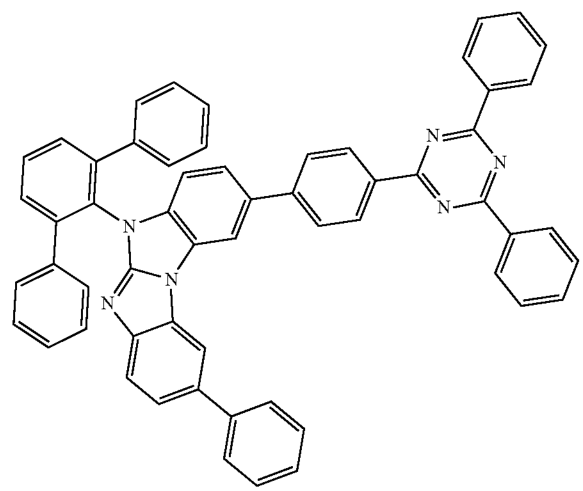
27
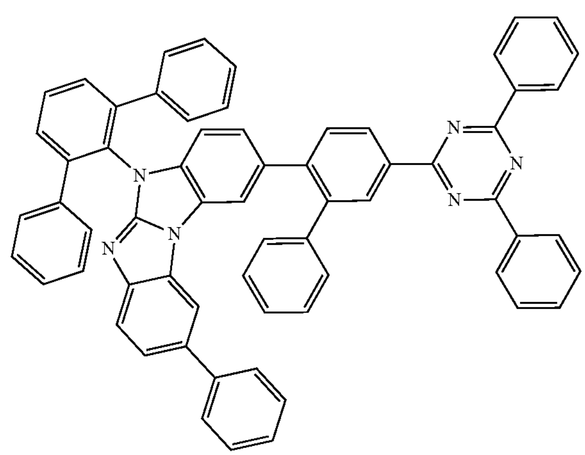

-continued
28
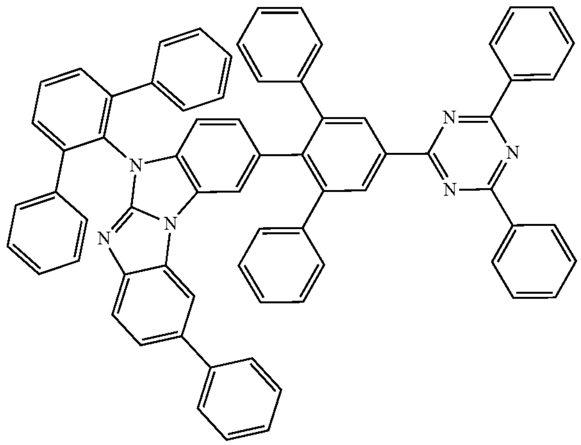
29
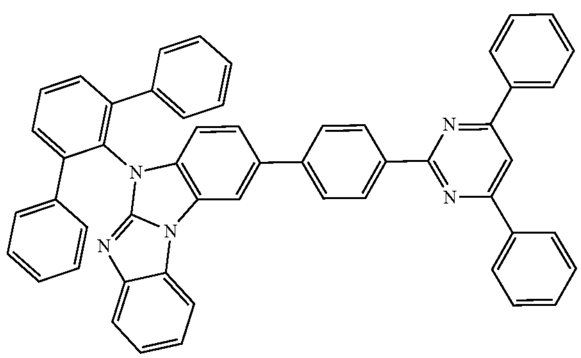
30
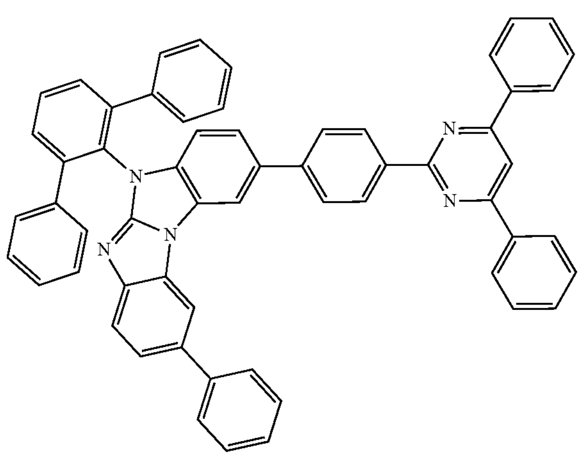
-continued
31
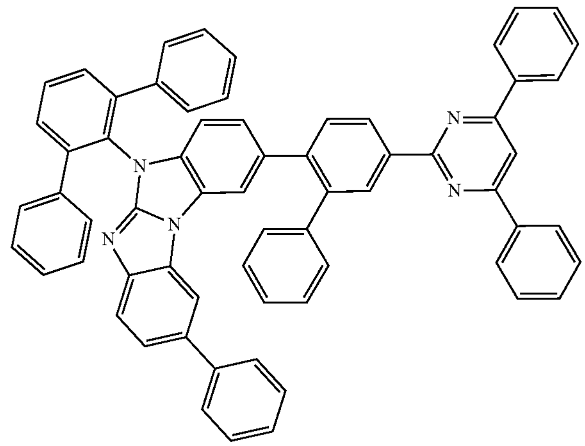
32
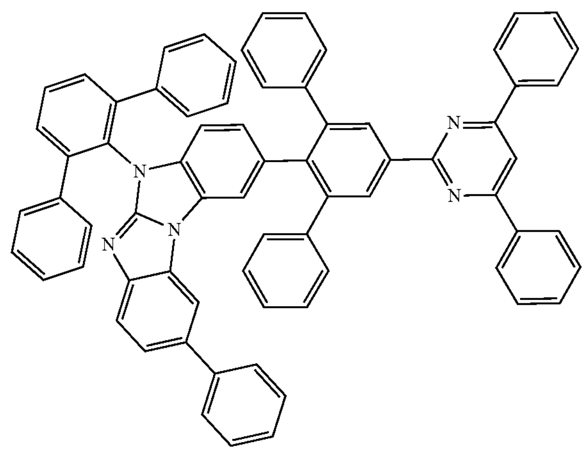
33
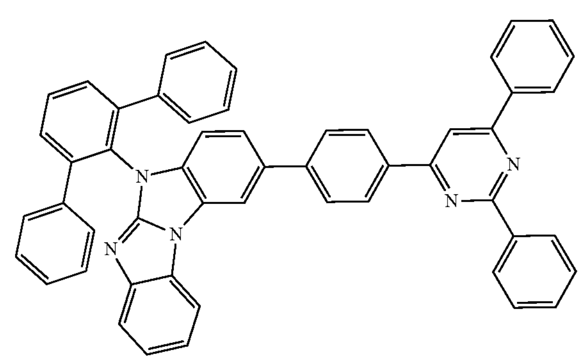

-continued
34
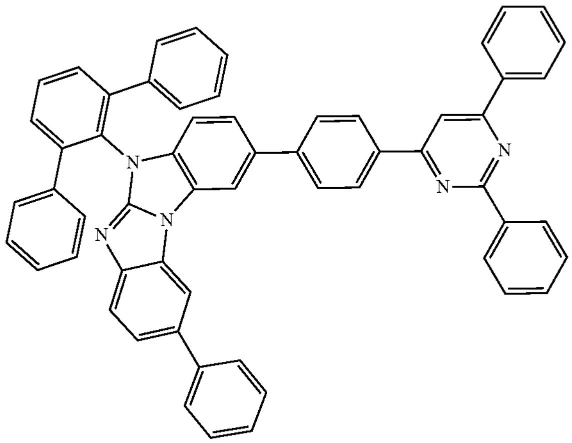
35
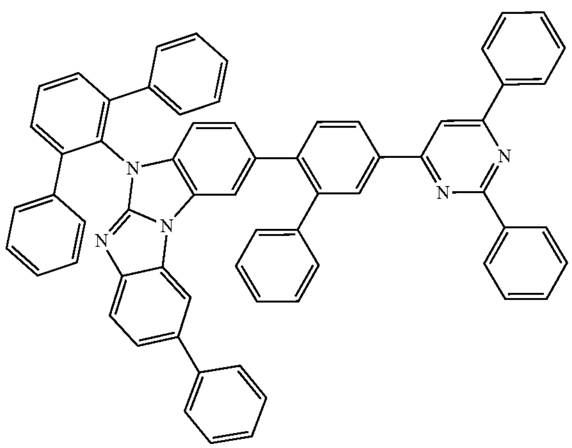
36
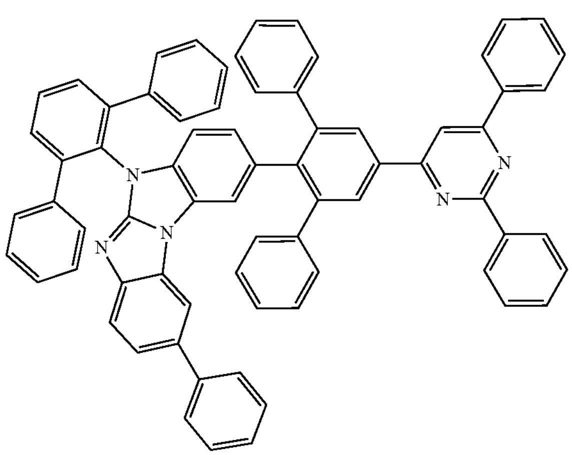
-continued
37
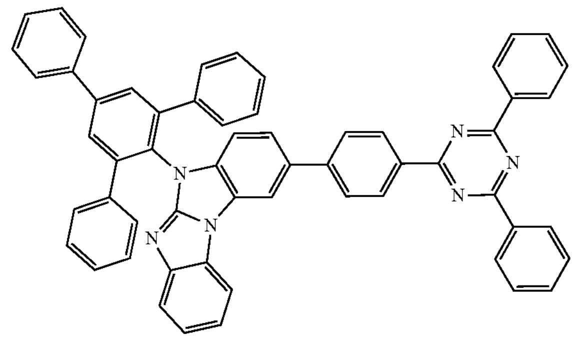
38
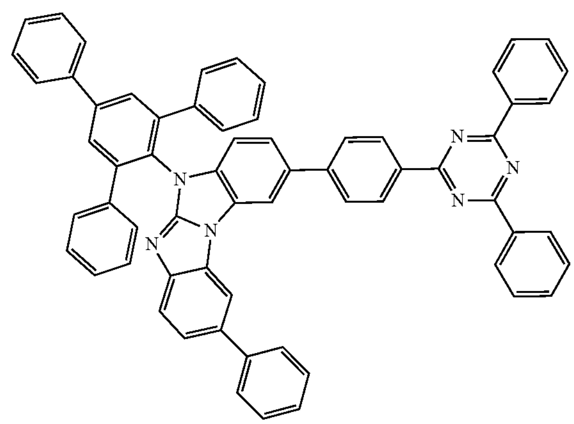
39
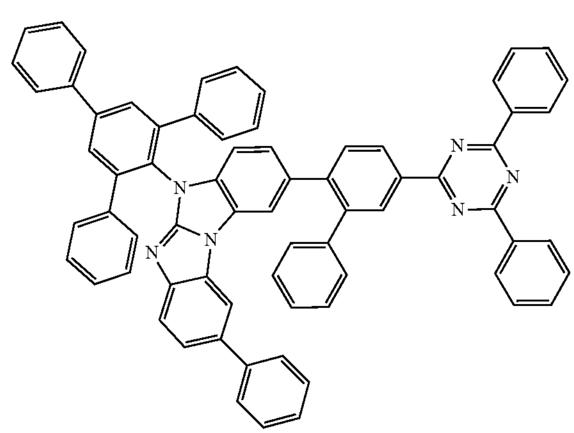

-continued
40
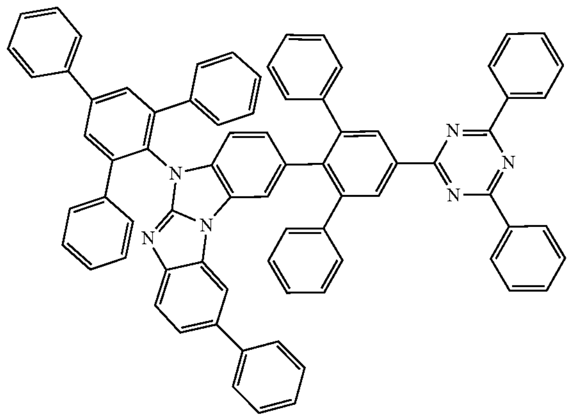
41
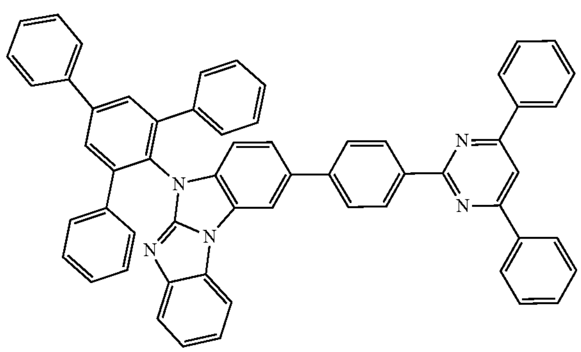
42
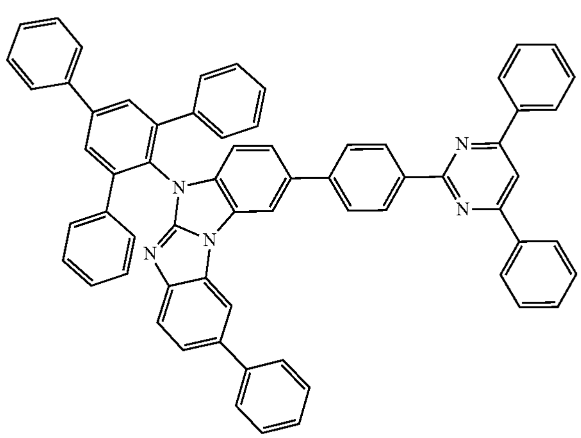
-continued
43
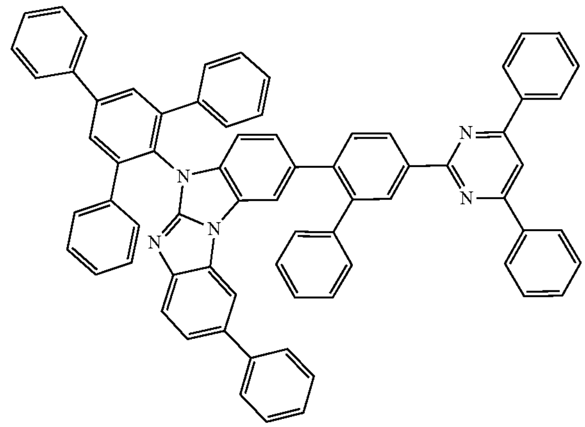
44
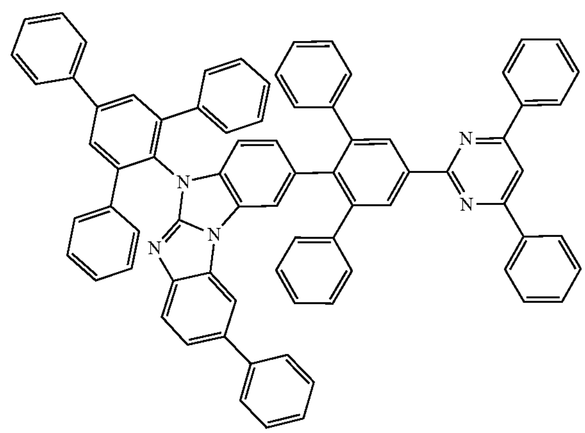
45
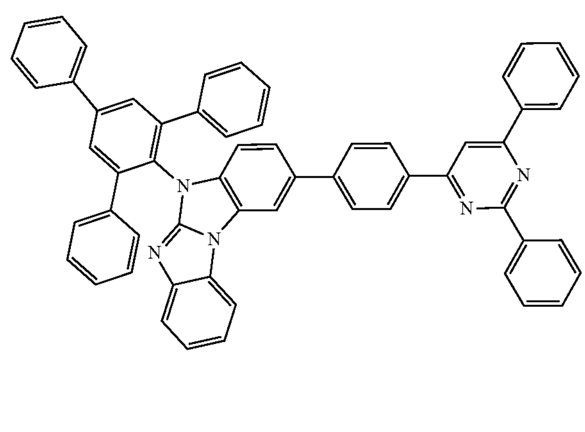

-continued
46
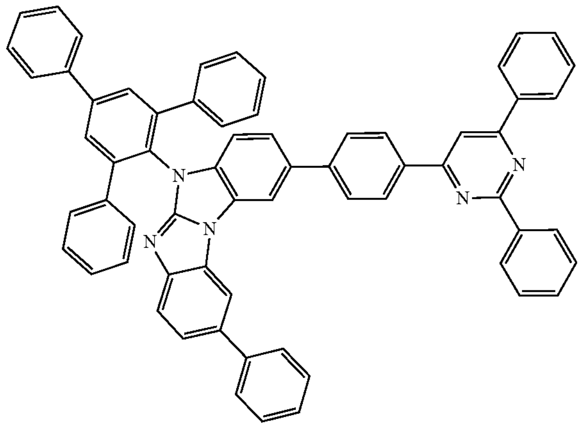
47
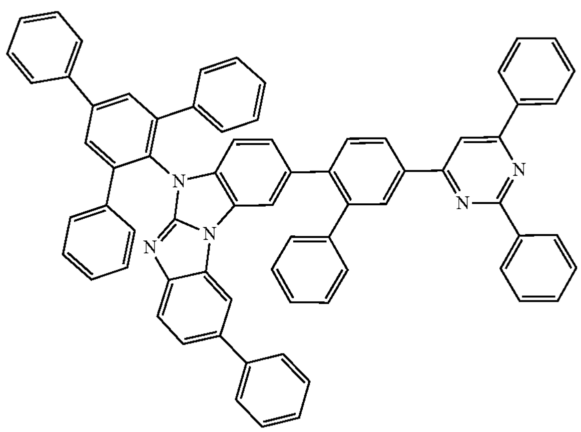
48
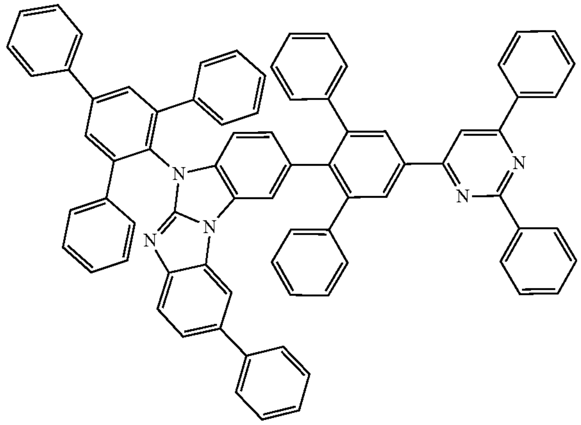
-continued
49
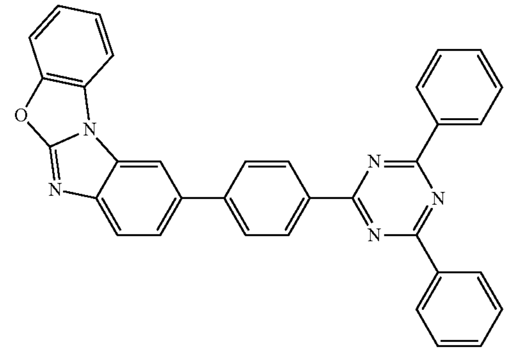
50
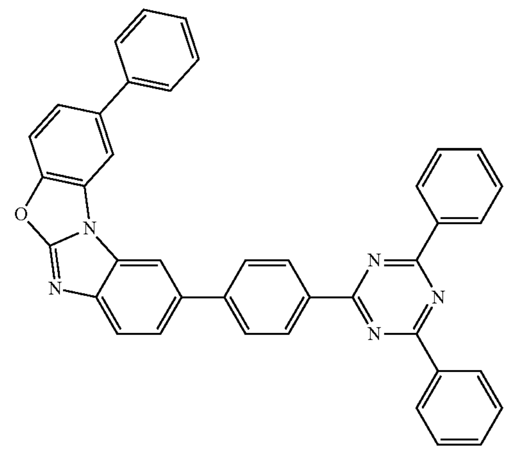
51
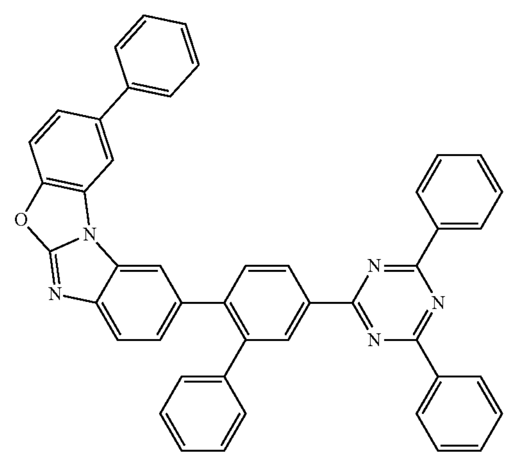

-continued
52
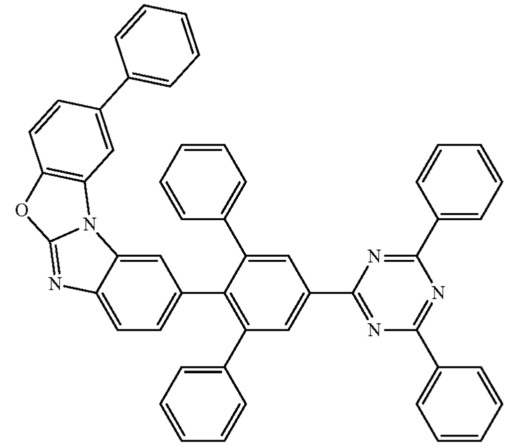
53
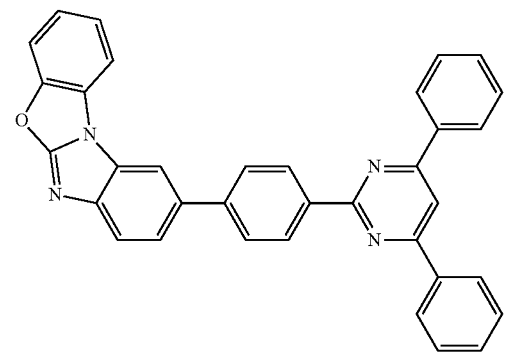
54
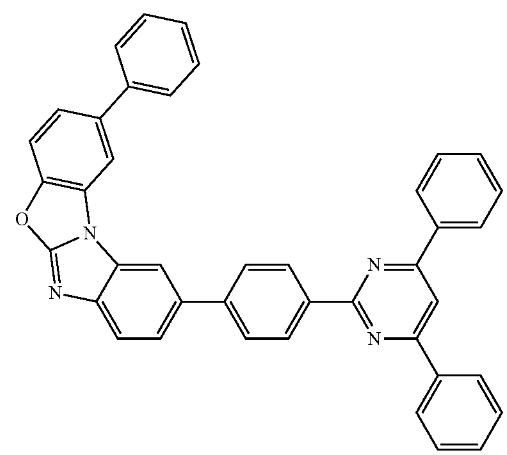
-continued
55
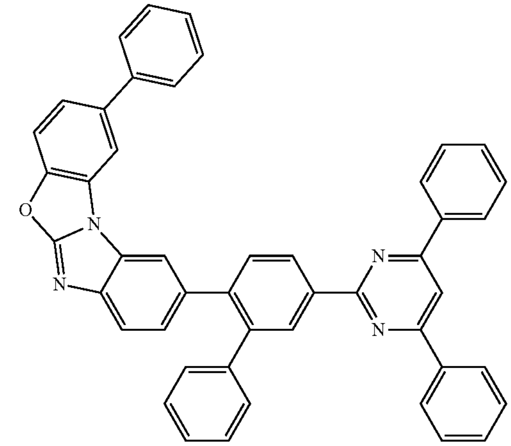
56
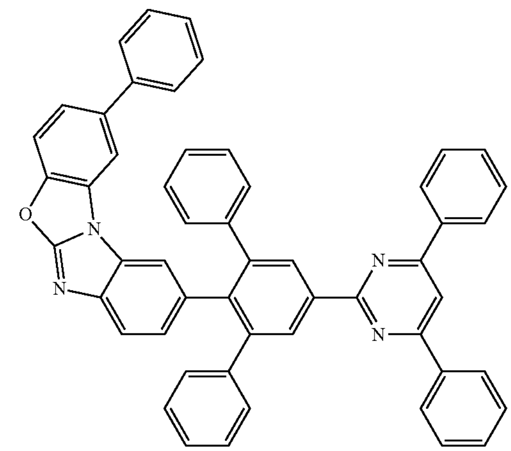
57
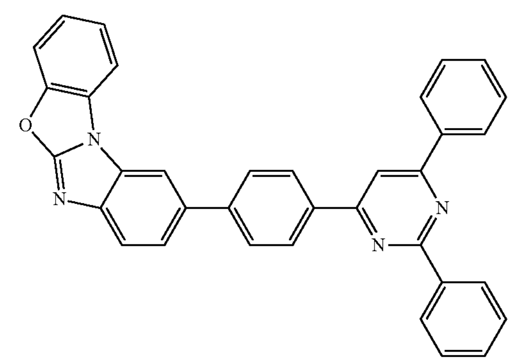

-continued
58
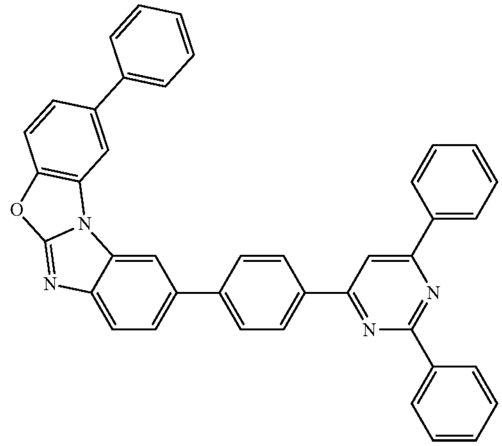
59
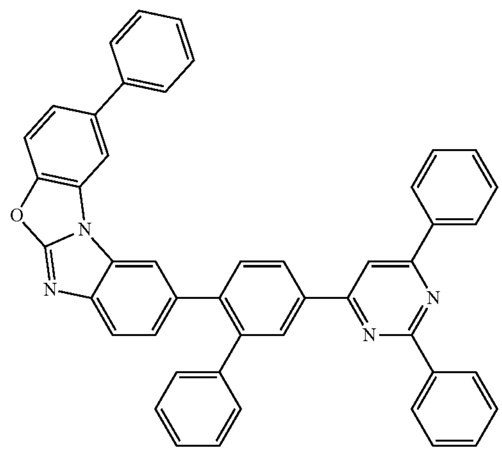
60
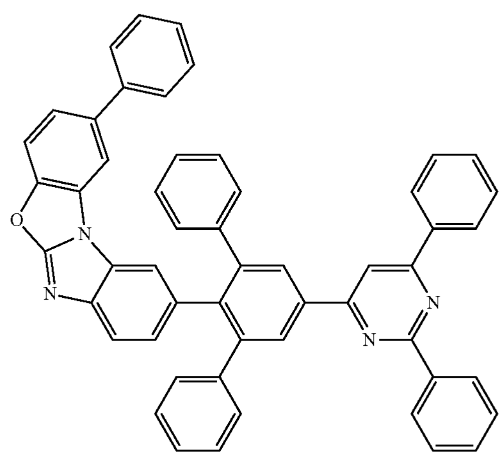
-continued
61
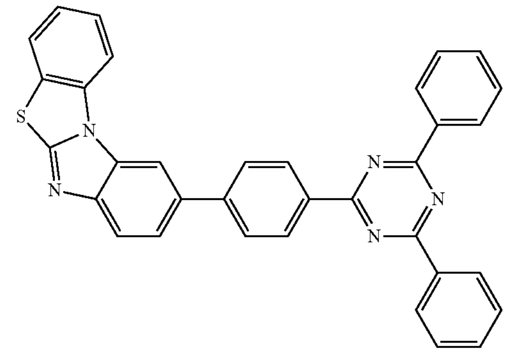
62
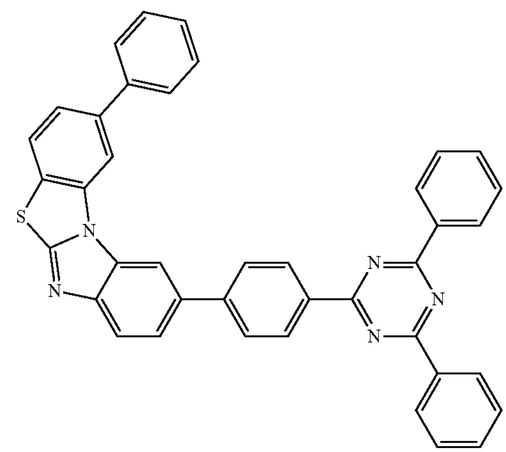
63
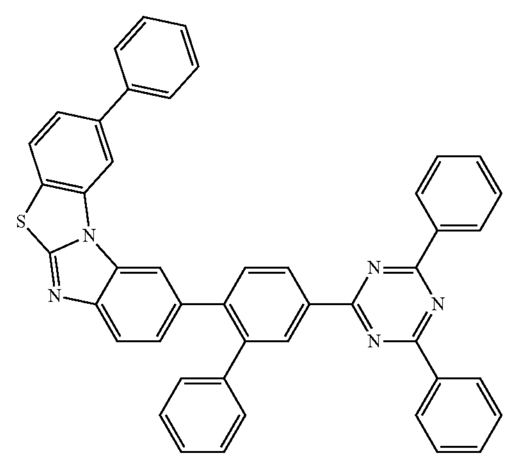

-continued
64
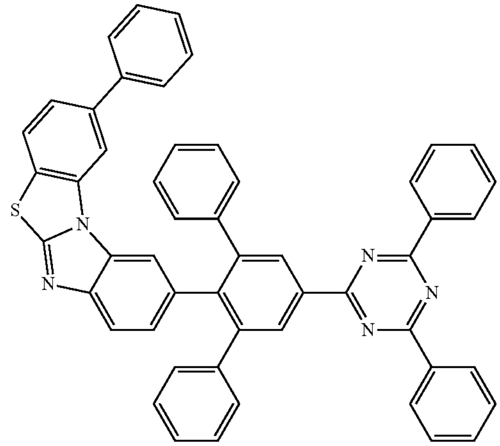
65
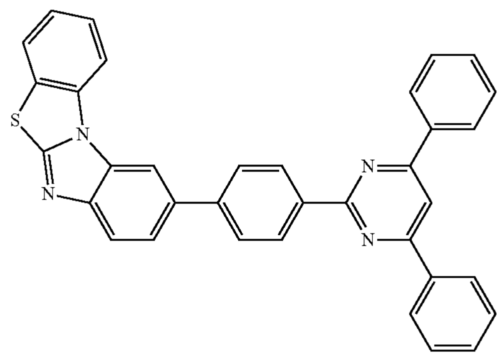
66
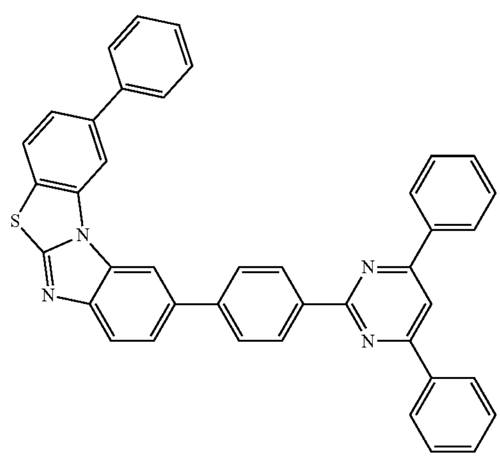
-continued
67
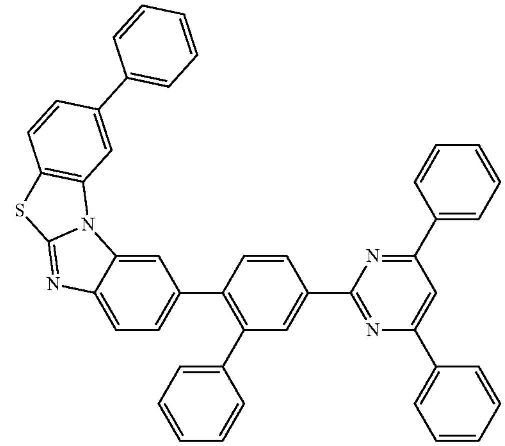
68
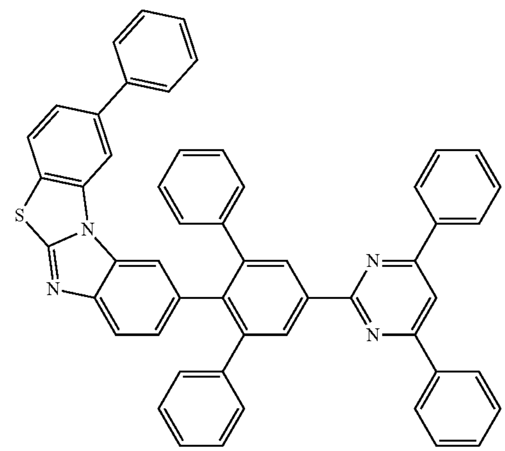
69
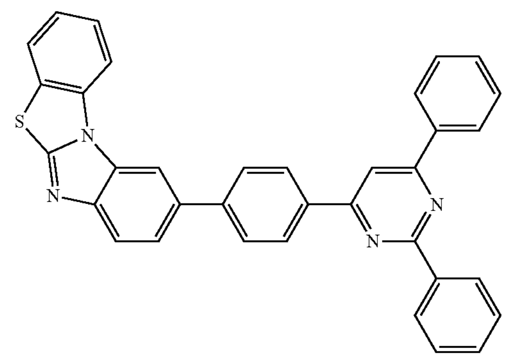

-continued
70
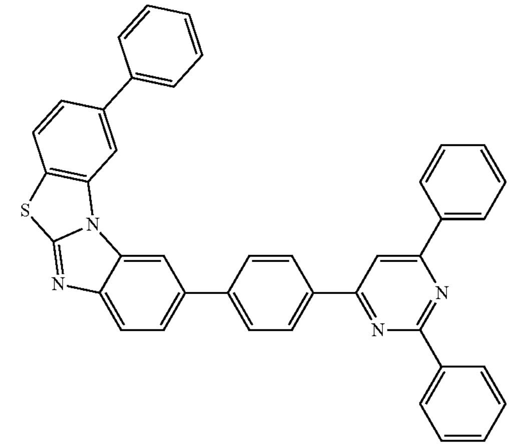
71
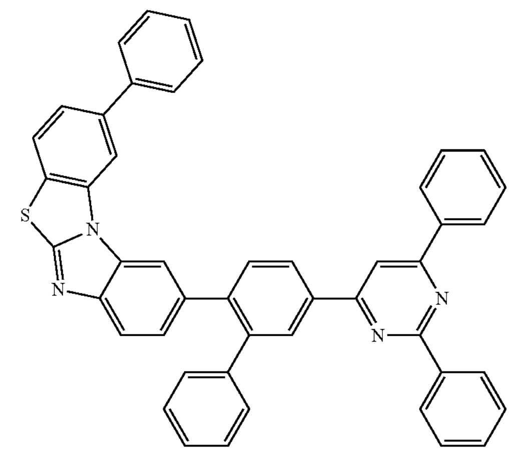
72
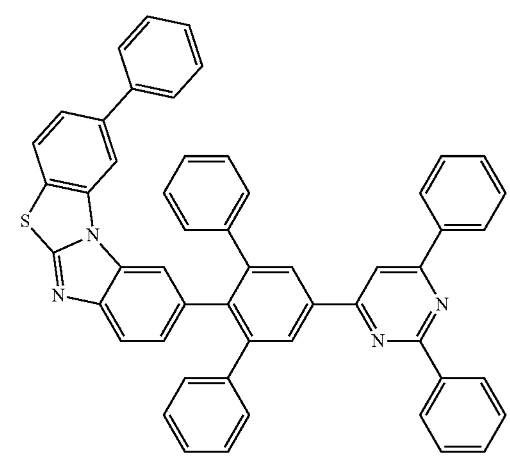
-continued
73
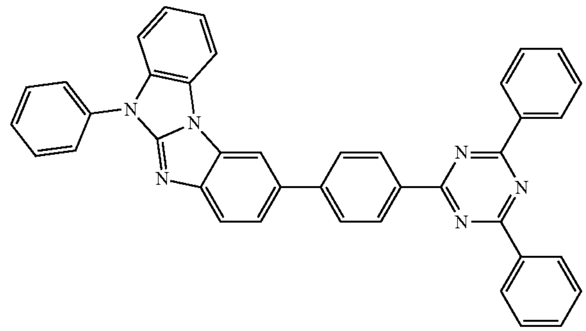
74
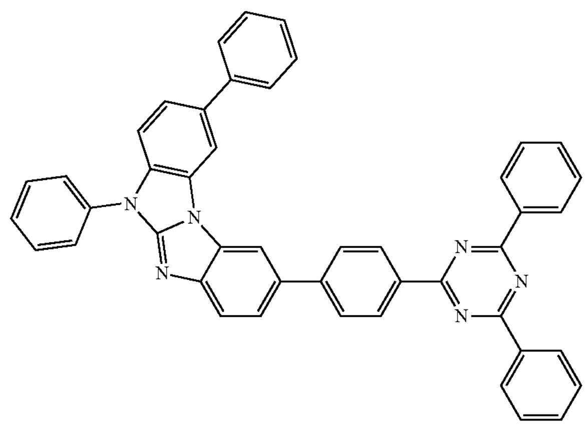
75
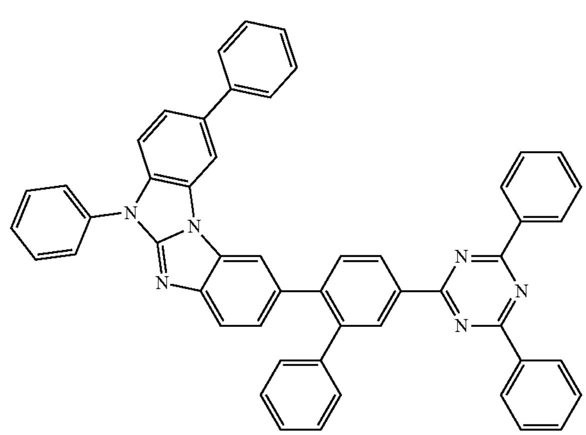

76
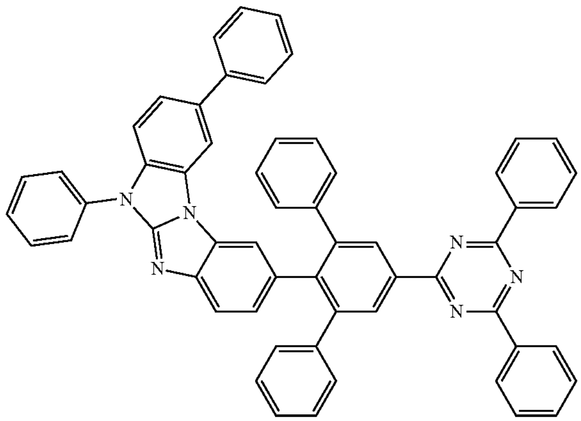
77
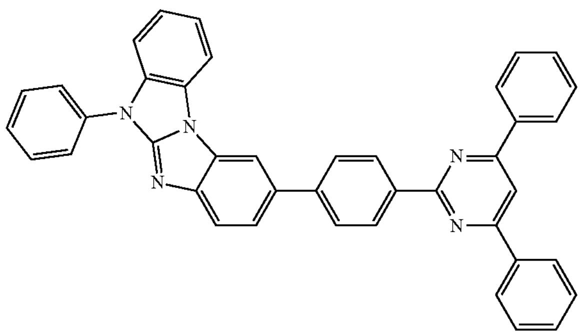
78
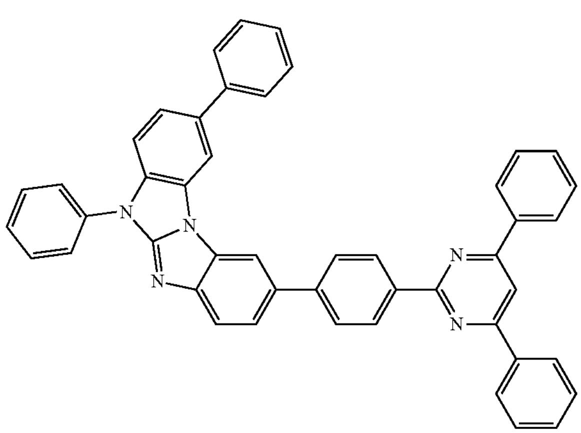
79
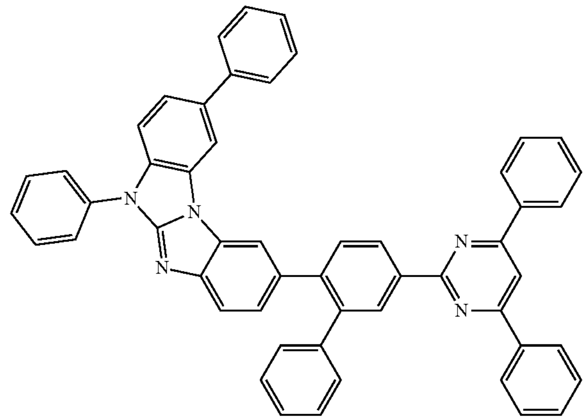
80
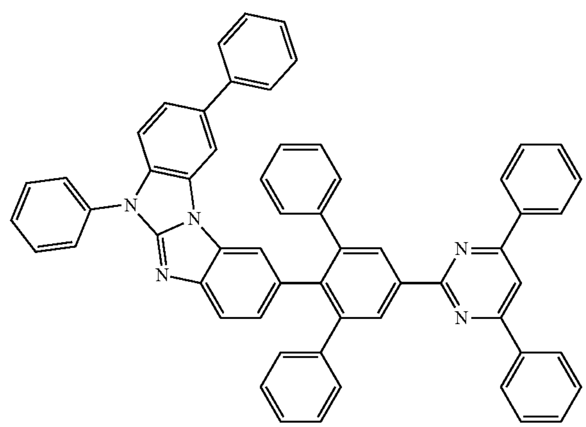
81
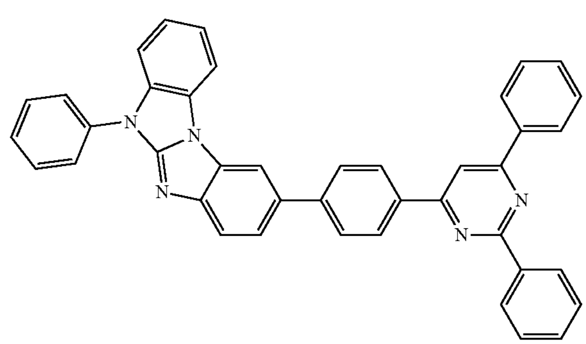

-continued
82
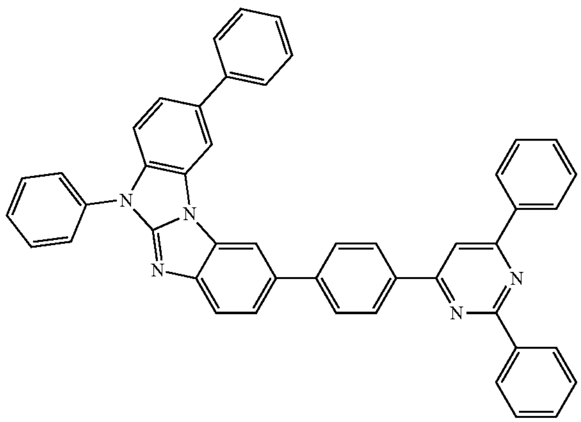
83
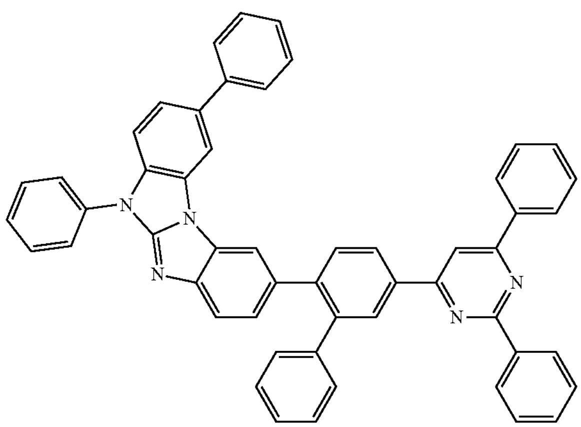
84
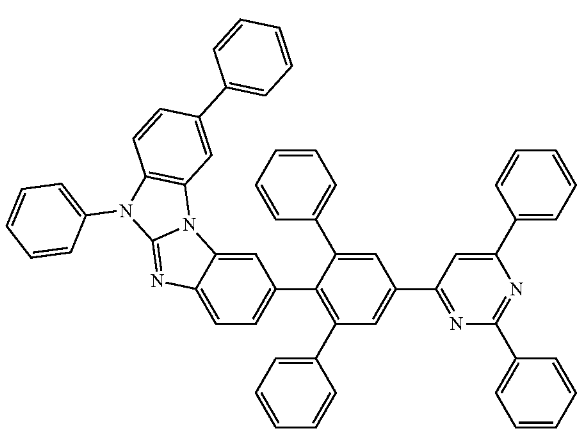
-continued
85
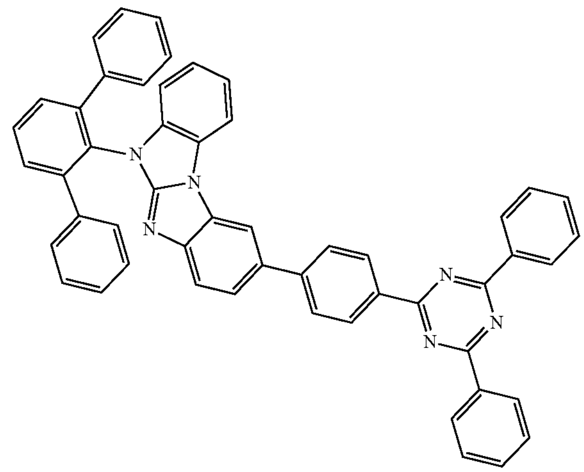
86
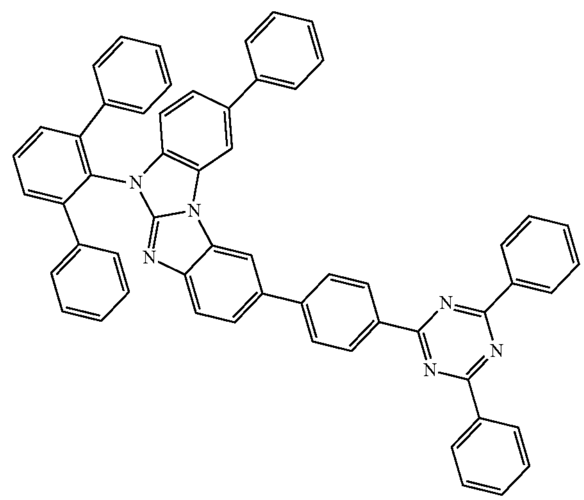
87
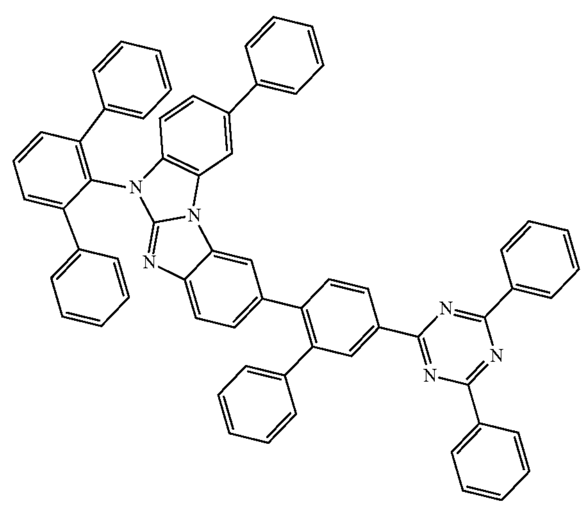

-continued
88
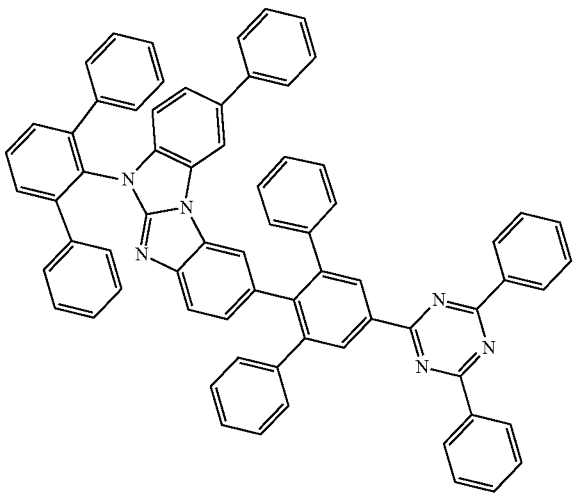
89
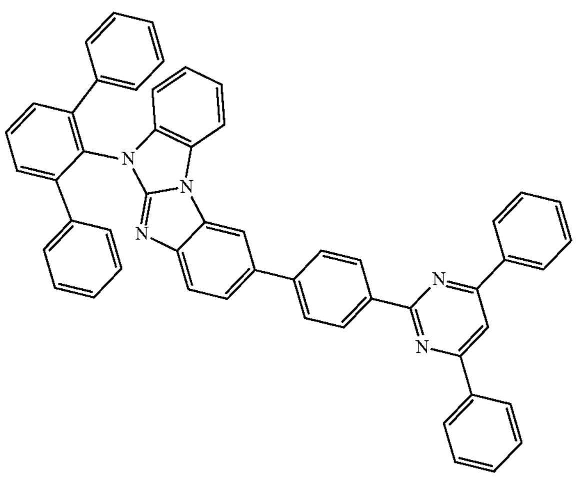
90
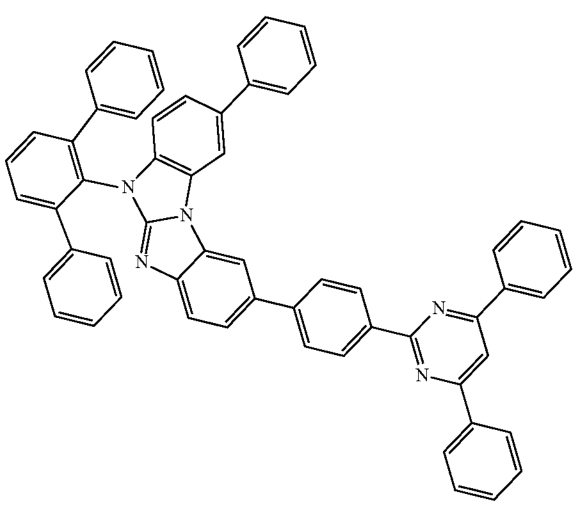
-continued
91
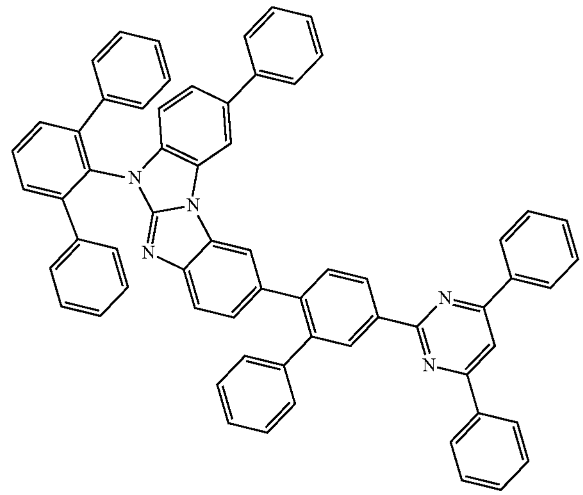
92
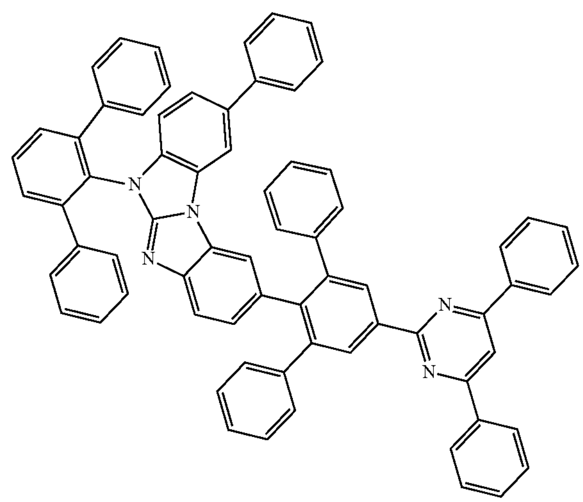
93
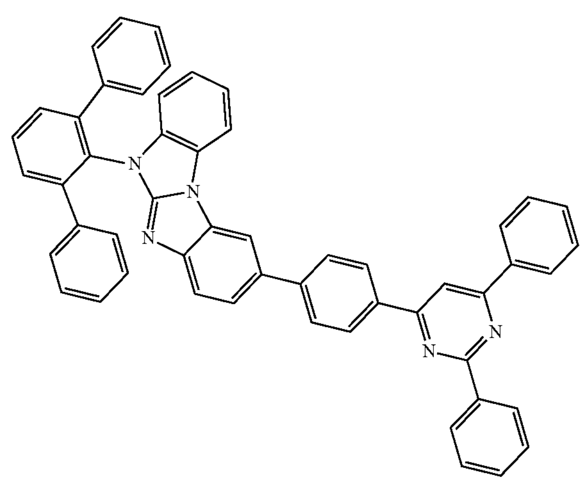

94
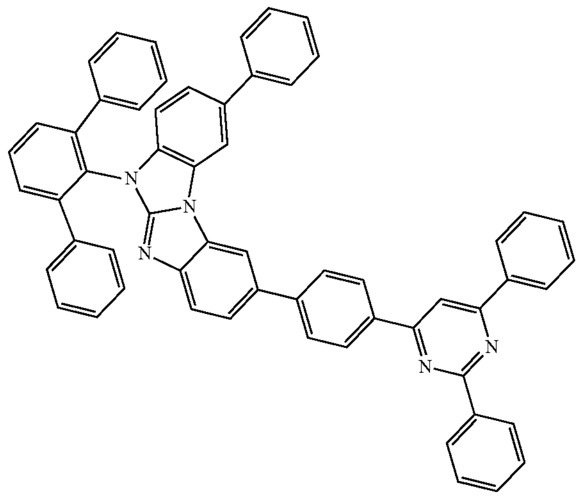
95
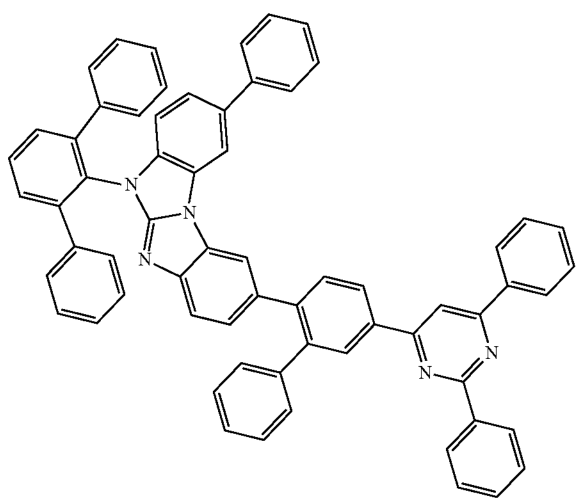
96
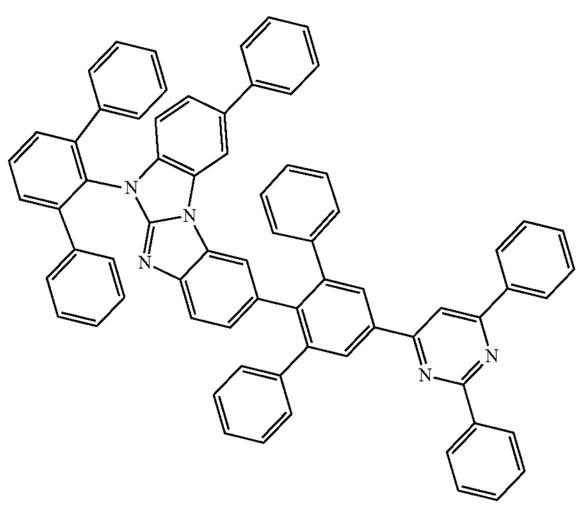
97
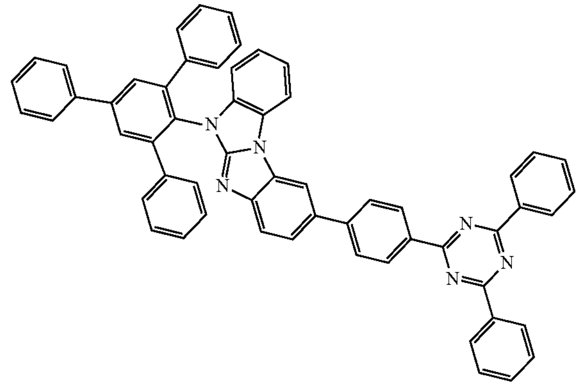
98
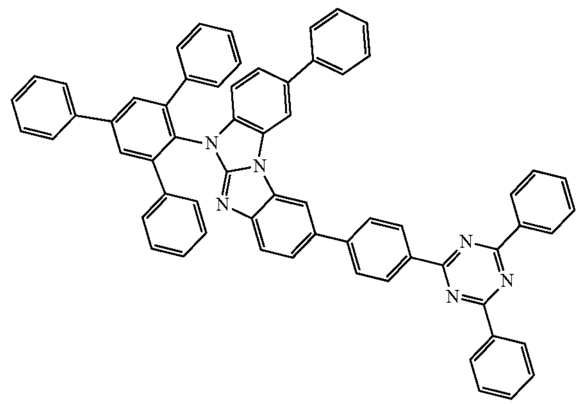
99
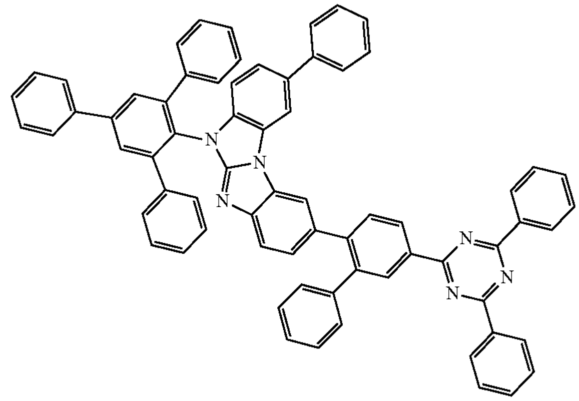

-continued
100
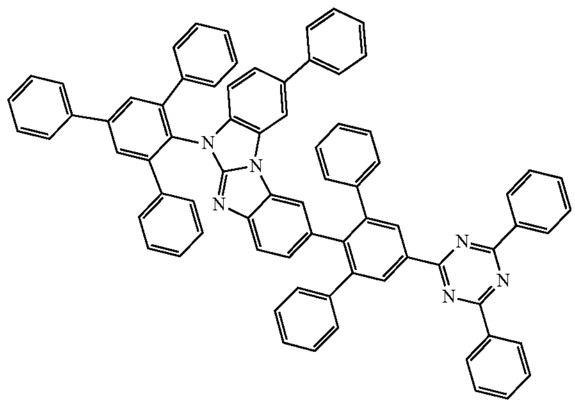
101
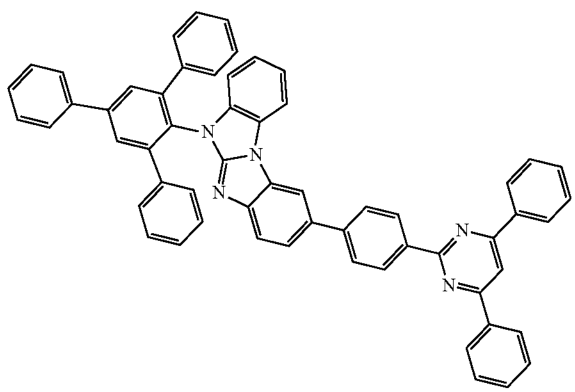
102
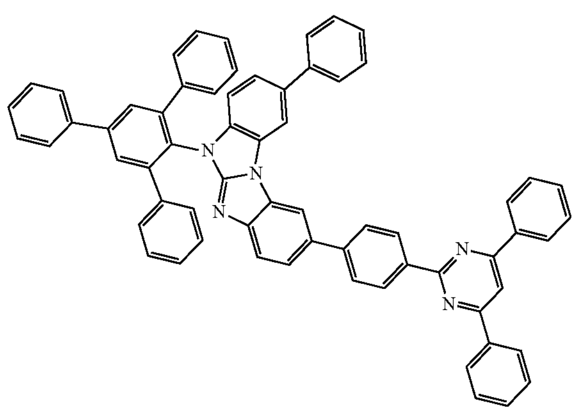
-continued
103
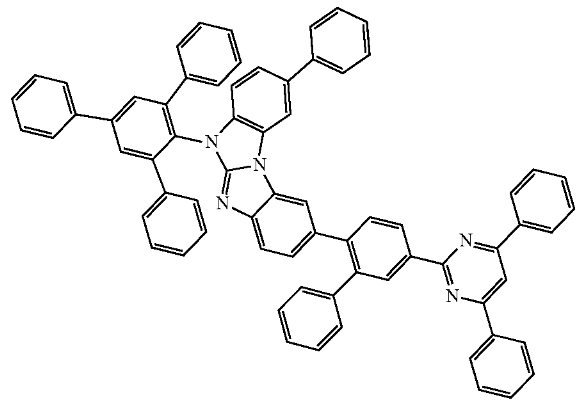
104
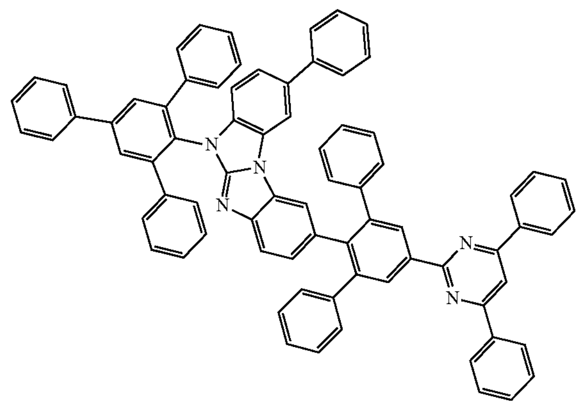
105
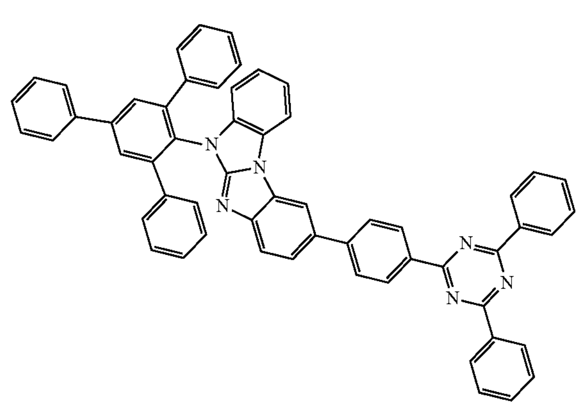

-continued
106
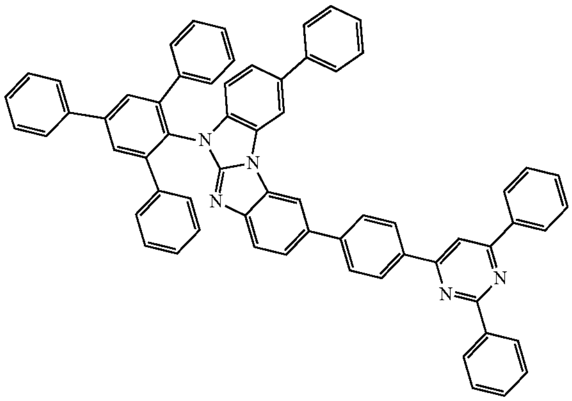
107
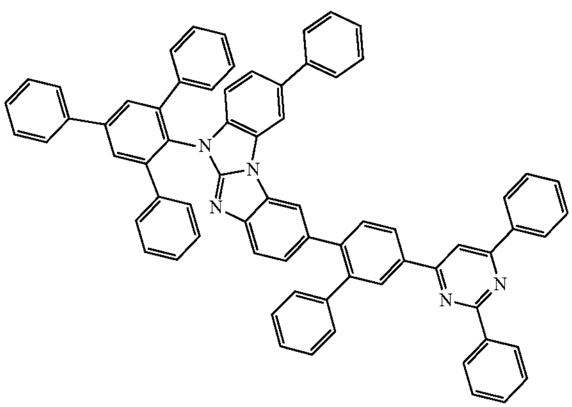
108
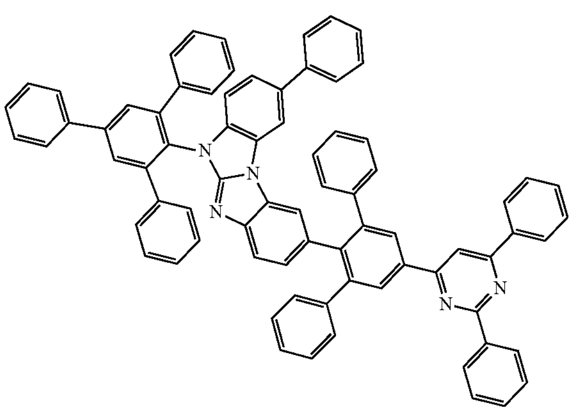
-continued
109
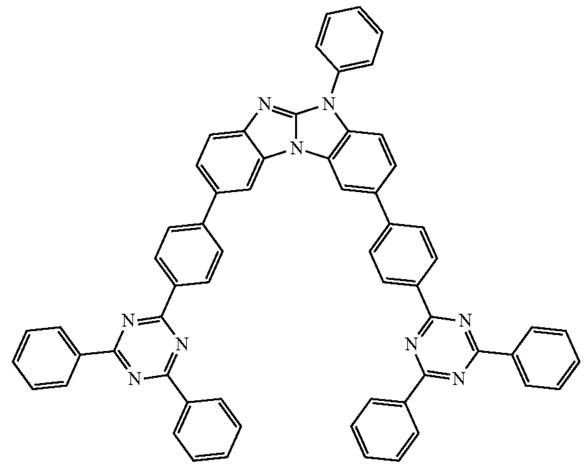
110
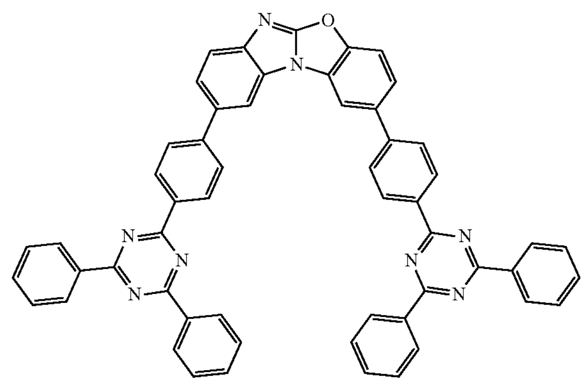
111
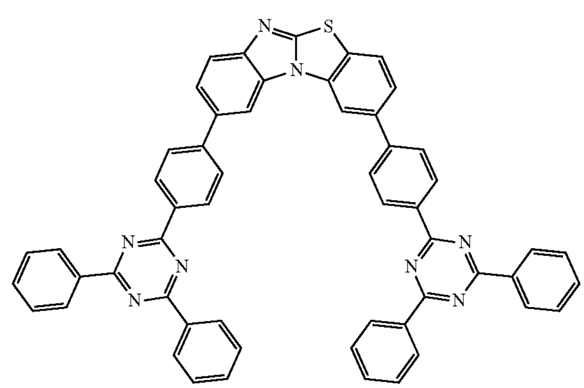

-continued
112
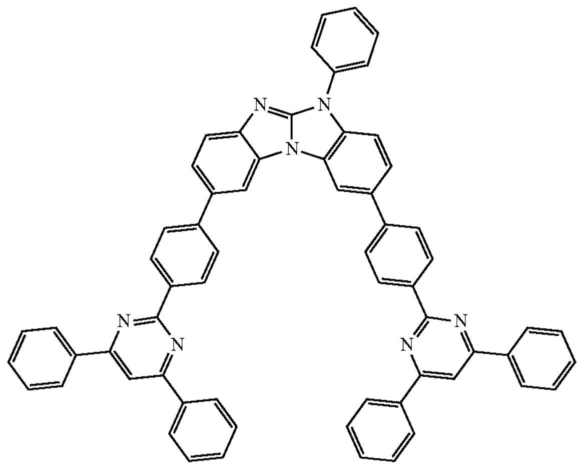
113
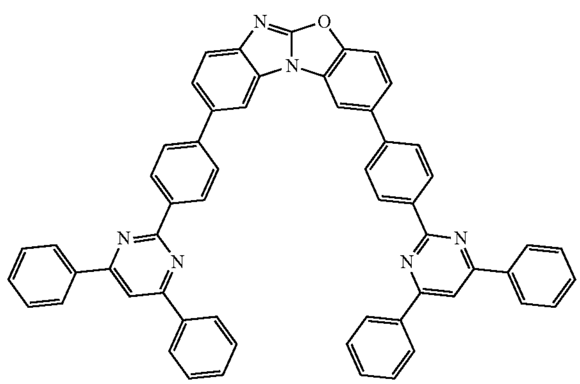
114
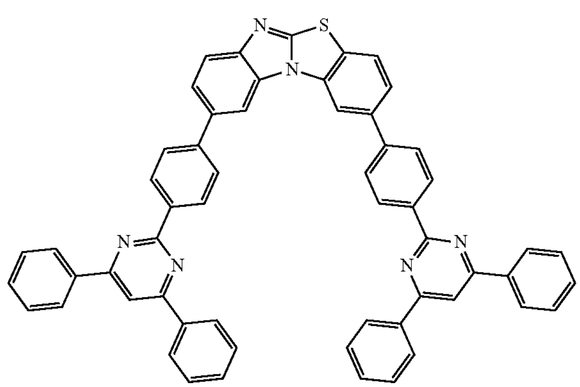
-continued
115
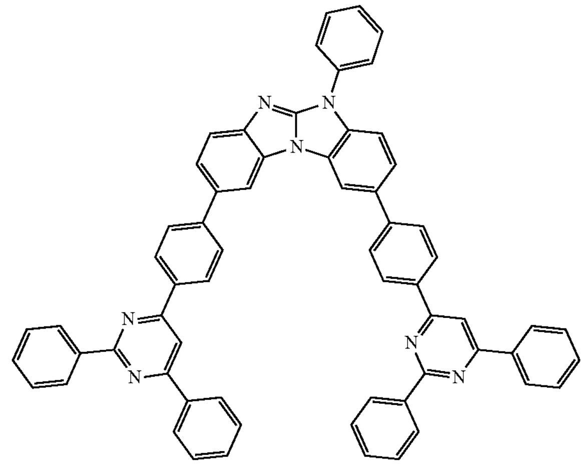
116
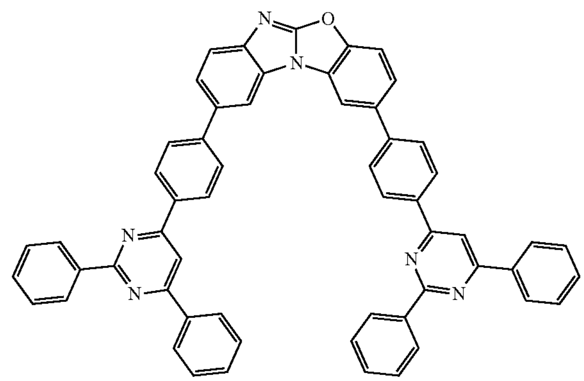
117
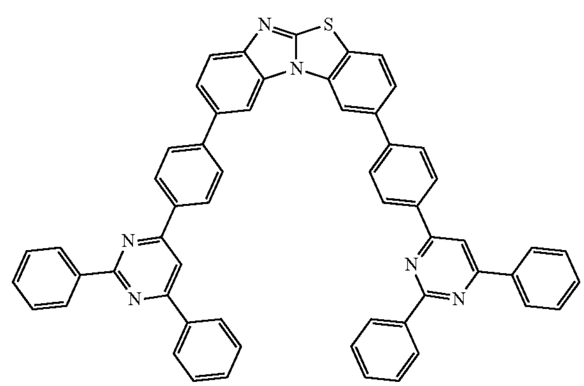

-continued
Group DF2
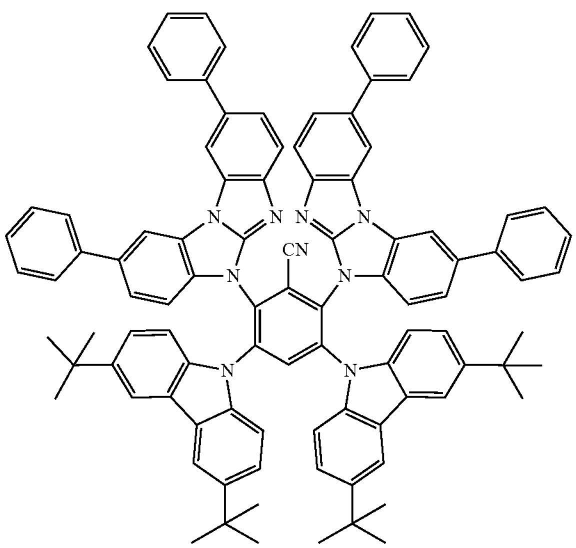
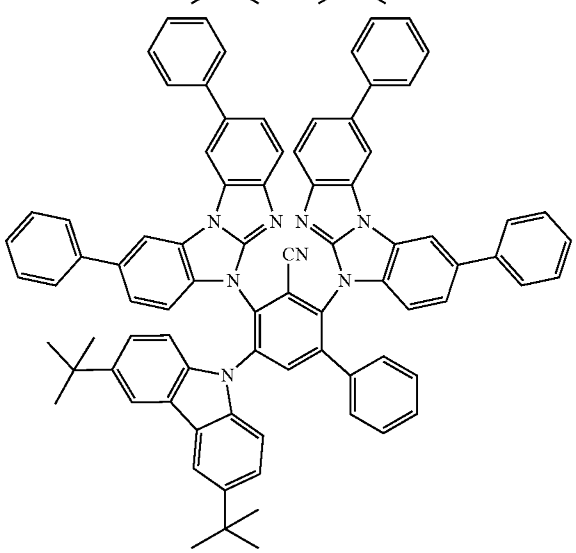
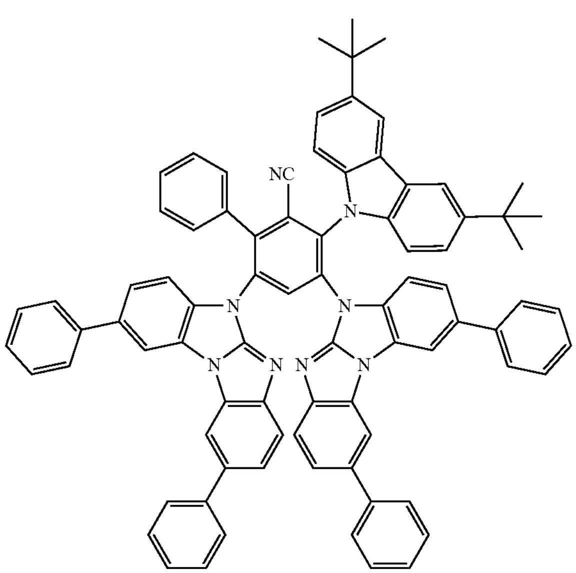
-continued
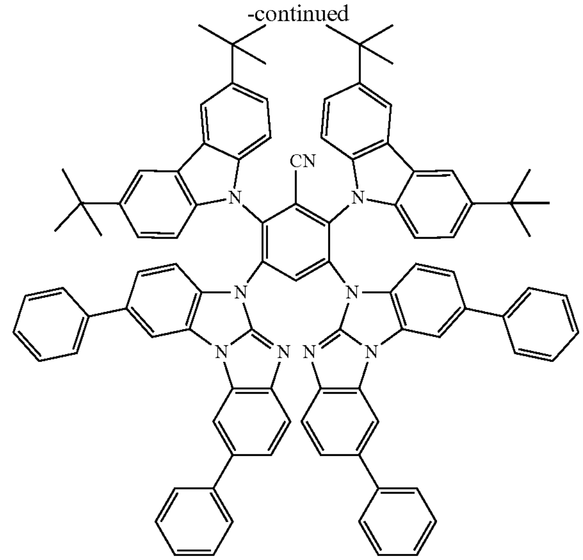
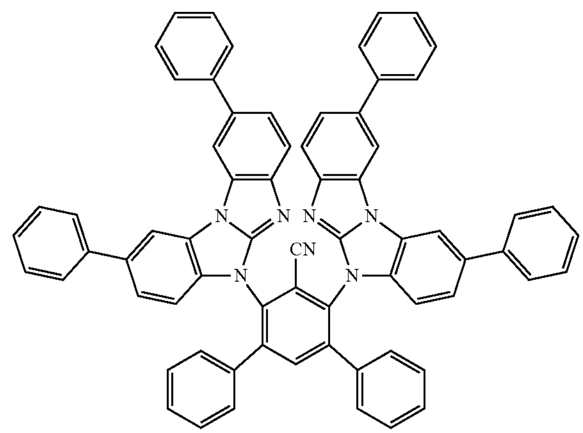
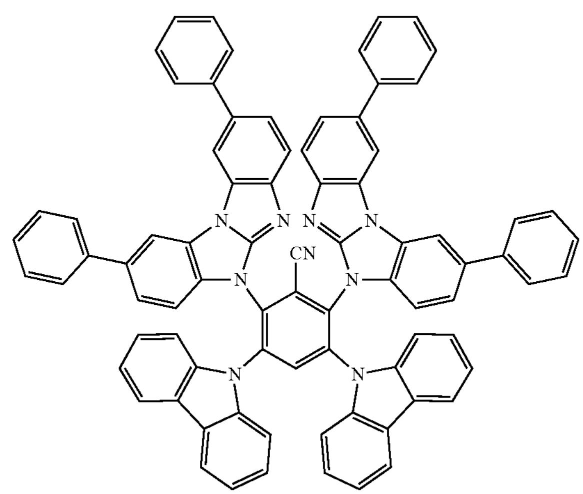

-continued
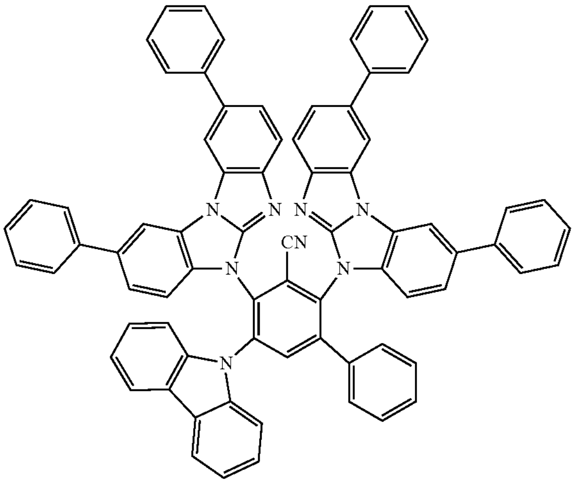
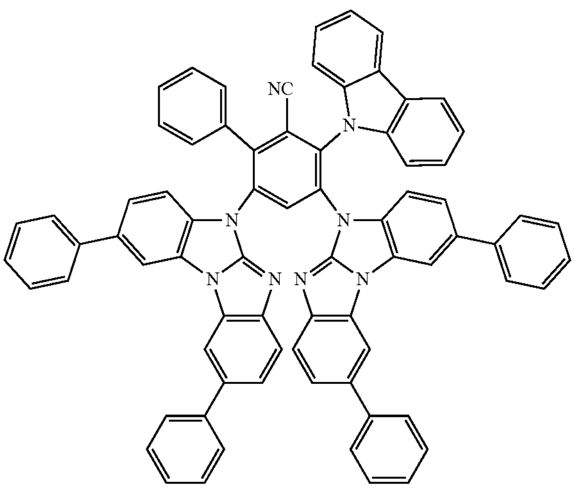
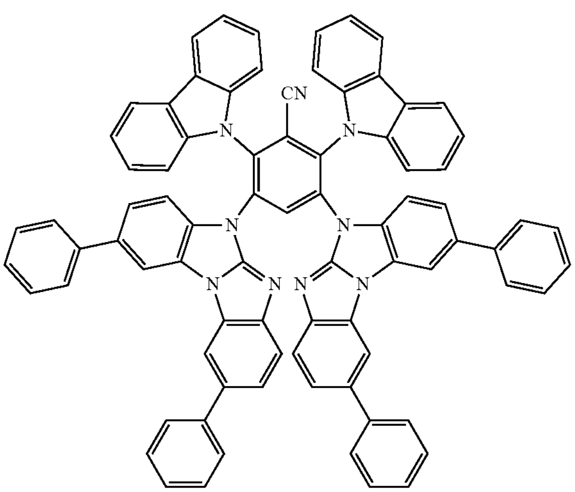
-continued
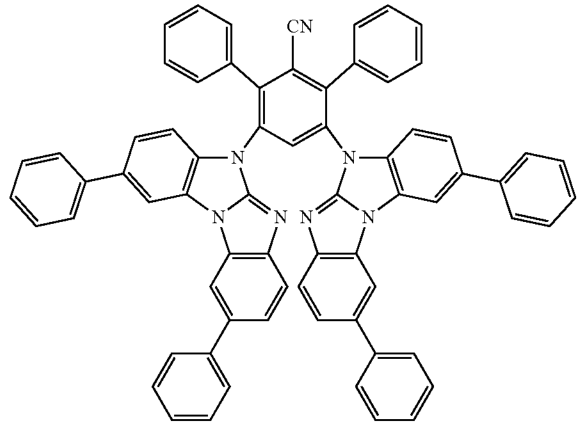
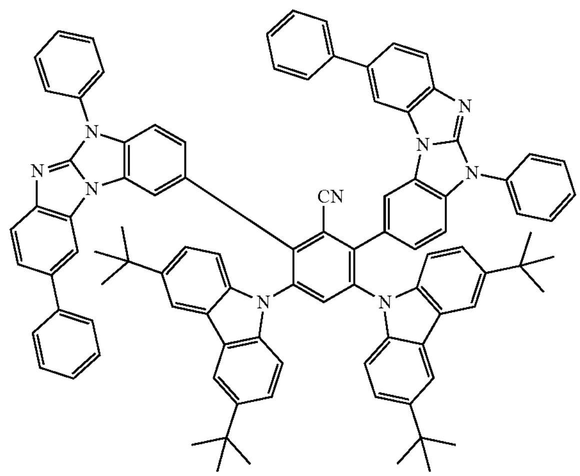
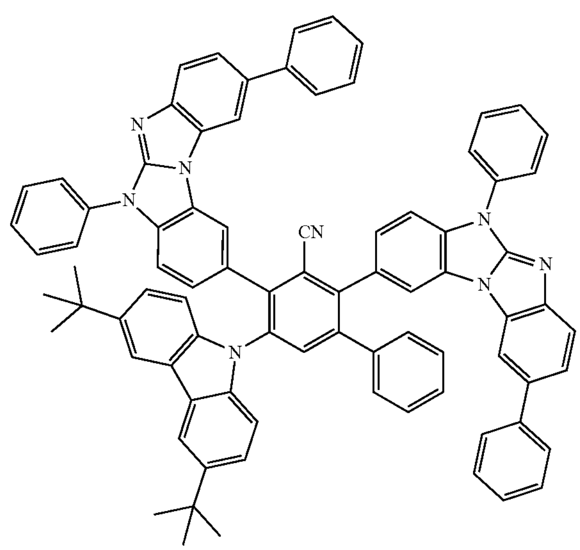

-continued
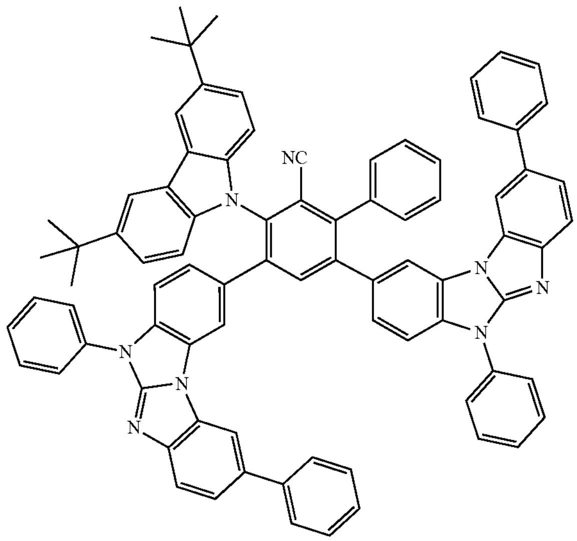
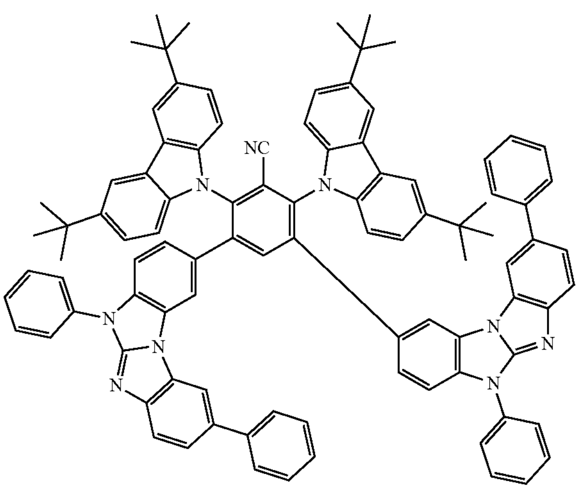
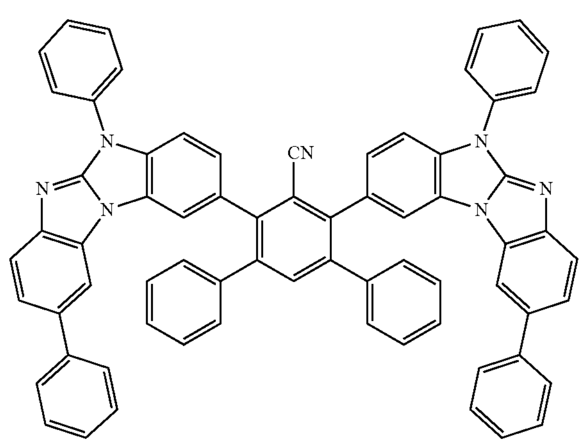
-continued
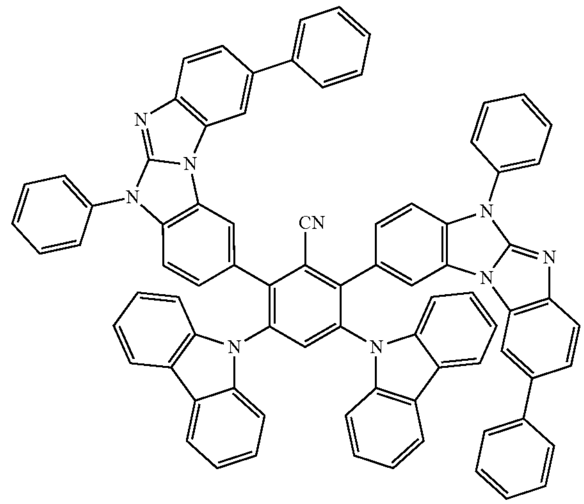
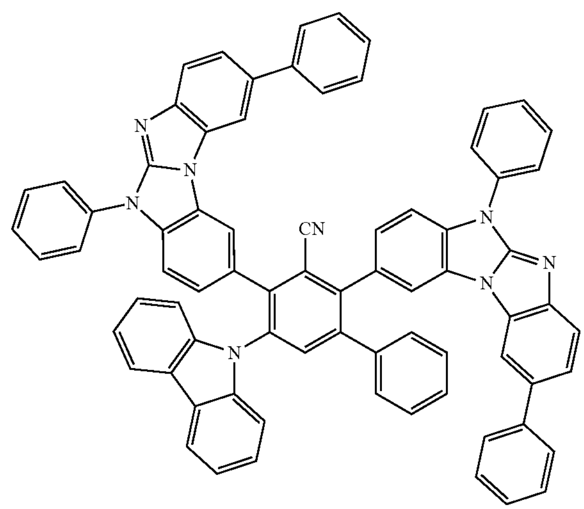
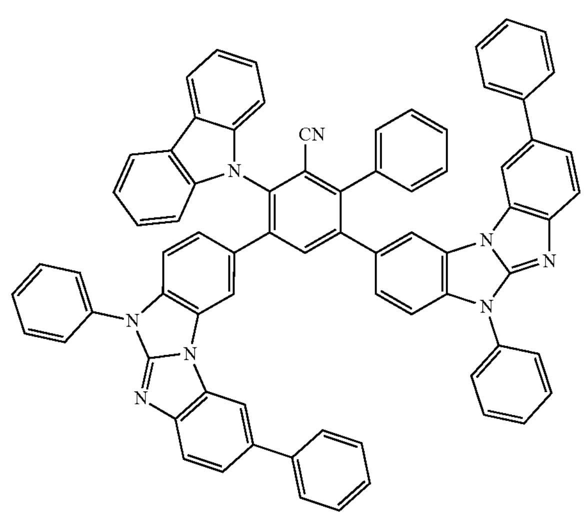

-continued
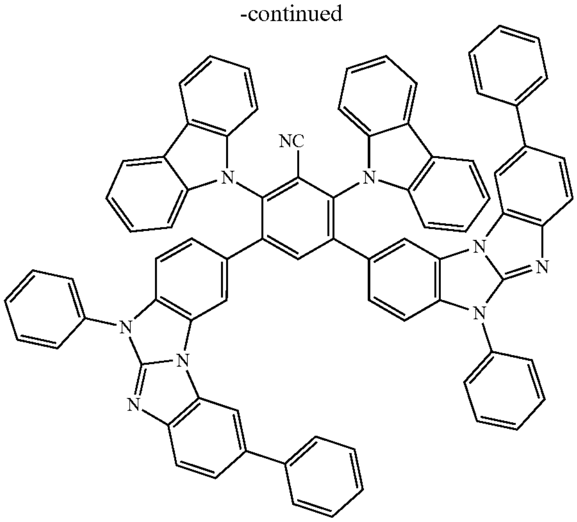
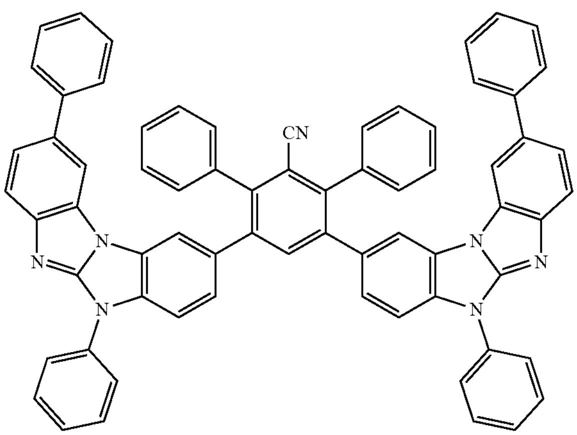
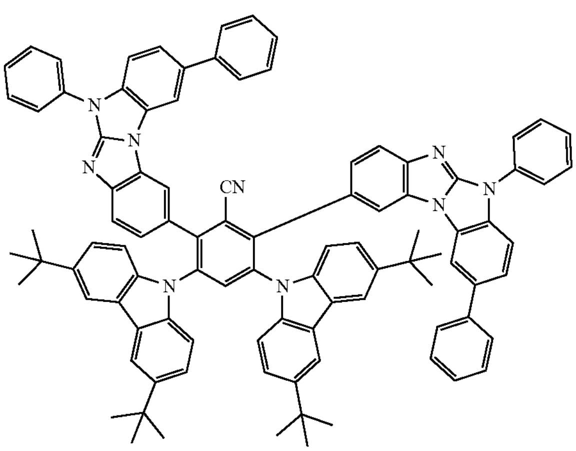
-continued
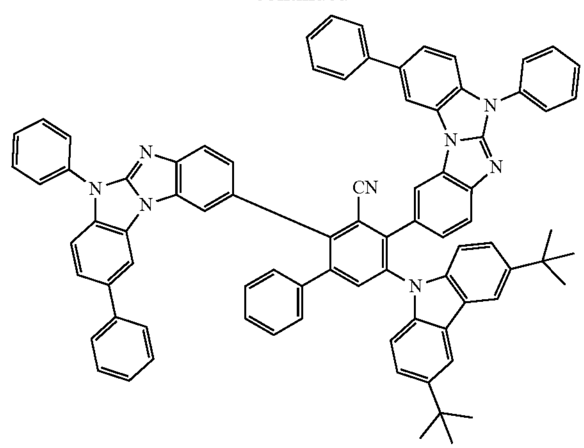
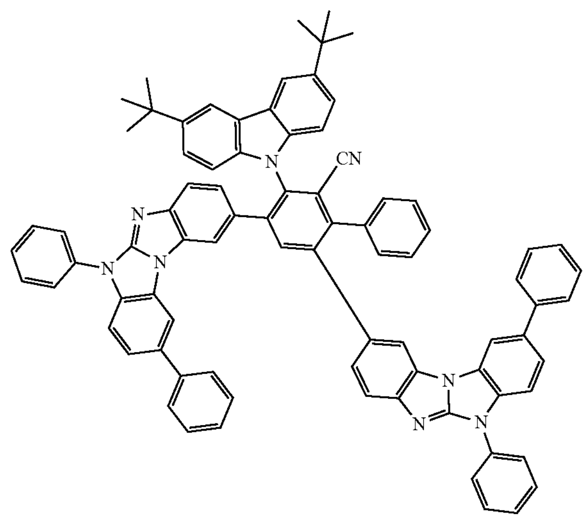
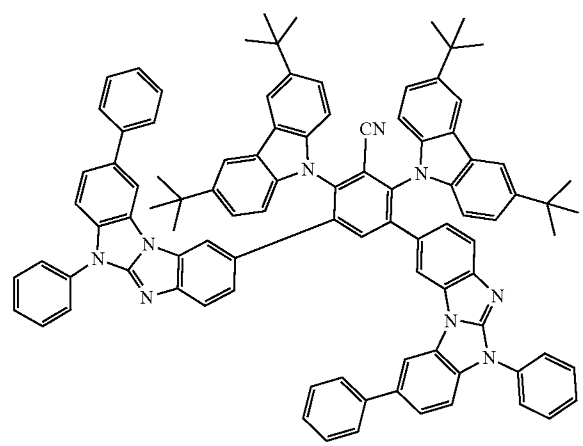

-continued
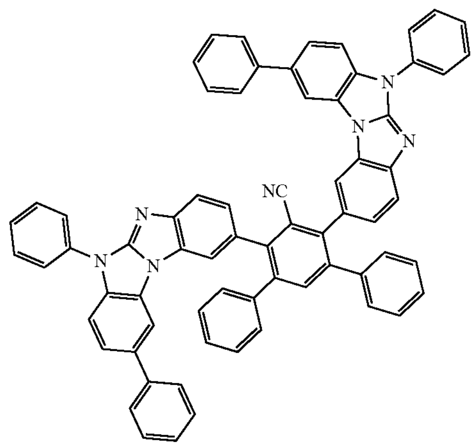
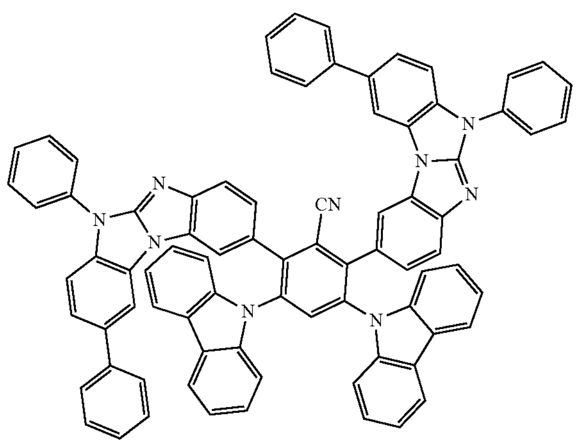
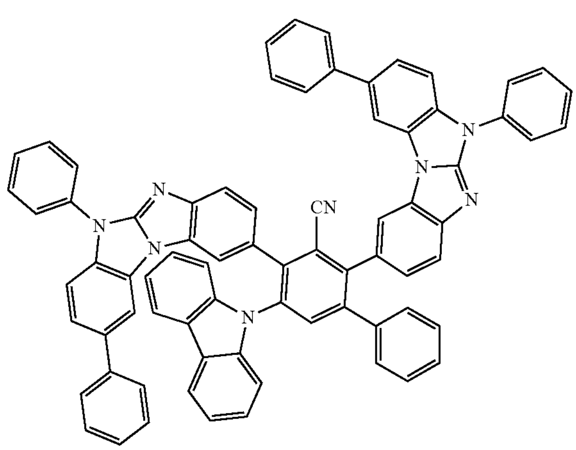
-continued
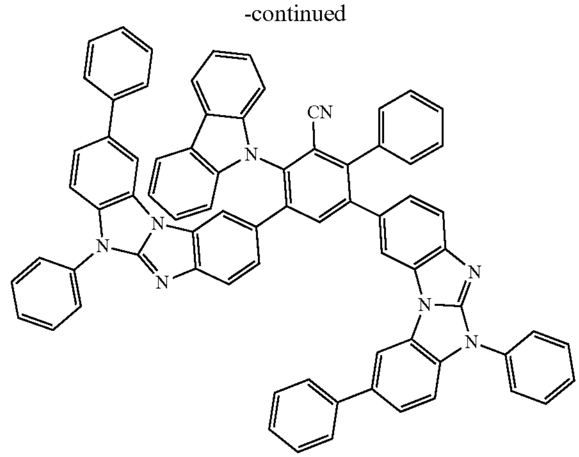
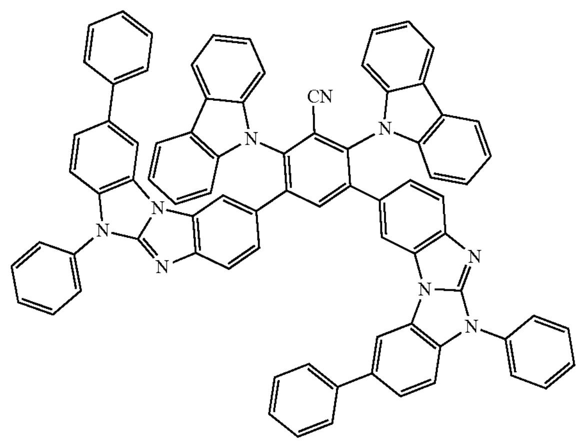
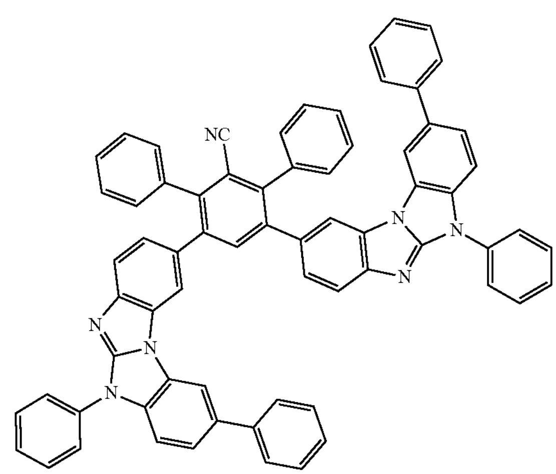

-continued
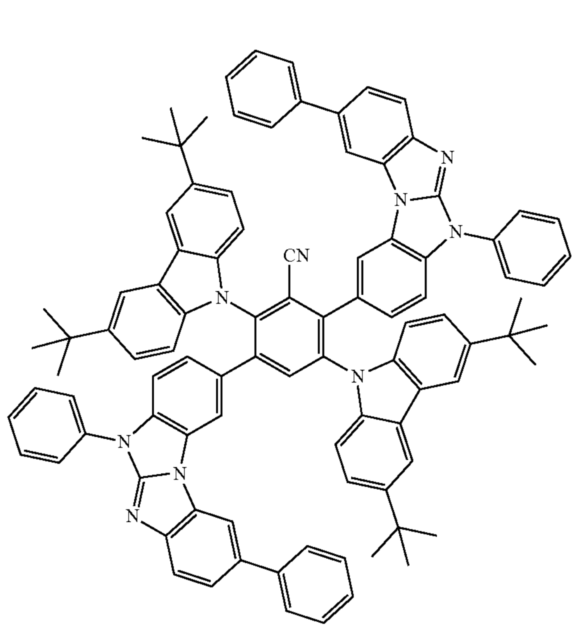
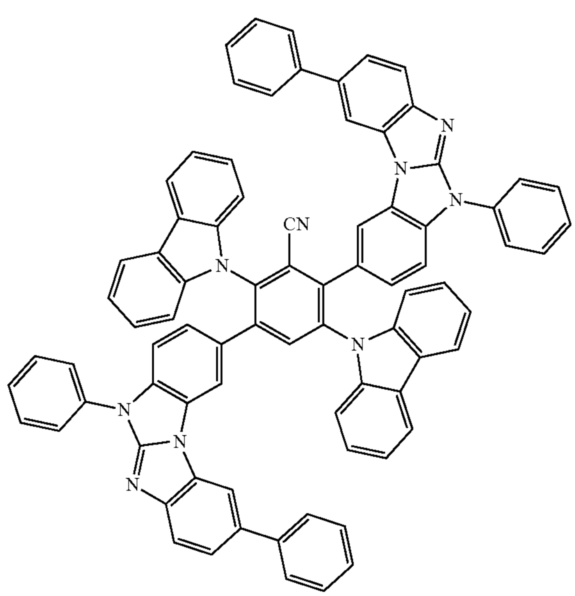
-continued
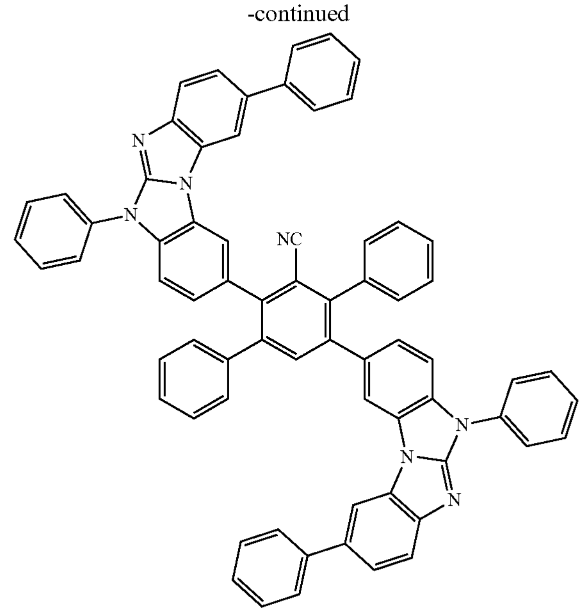
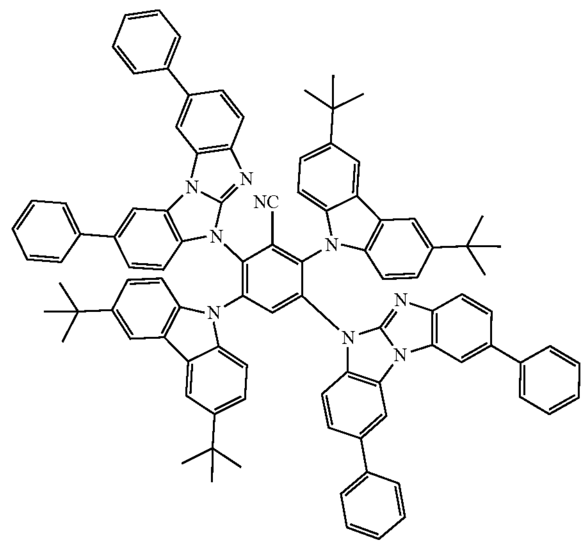
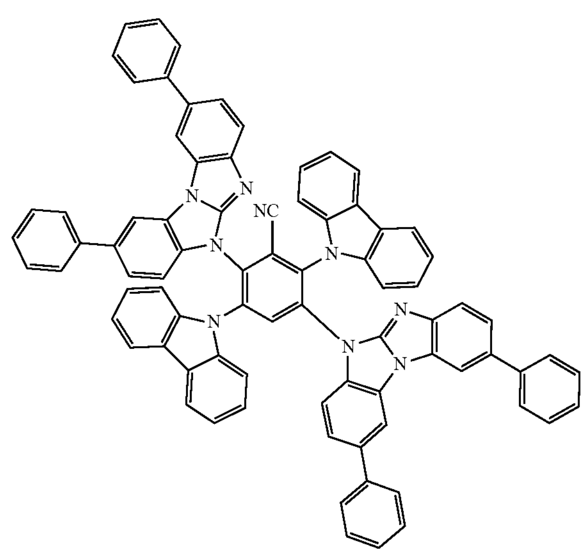

-continued
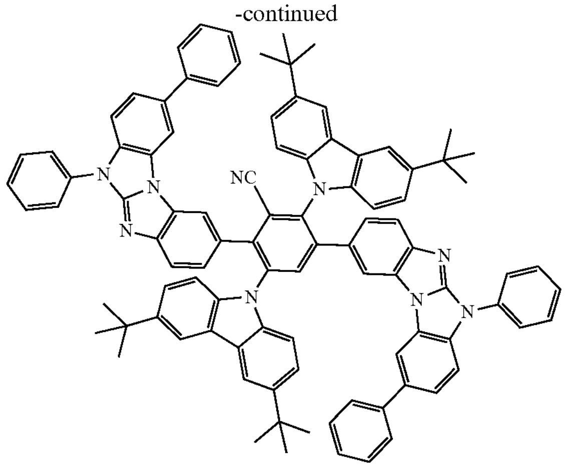
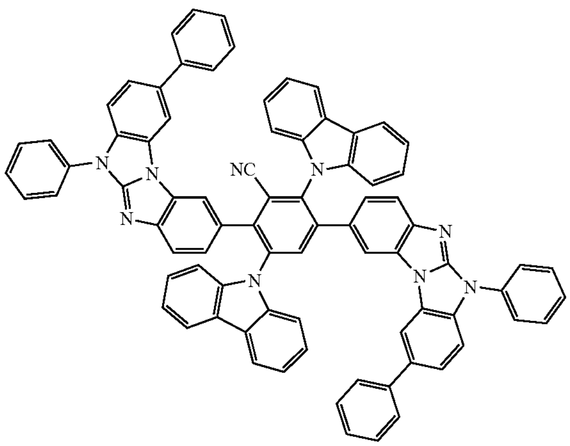
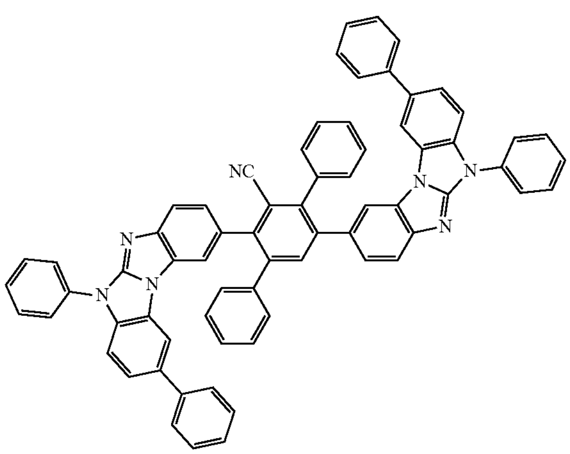
-continued
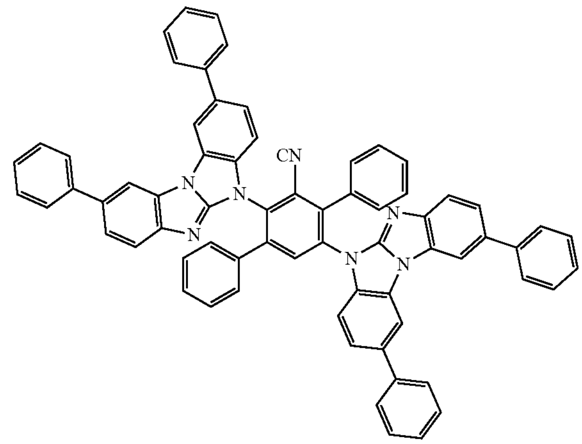
Group DF3
Group DF3
1
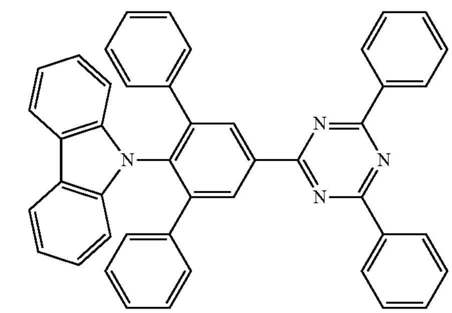
2
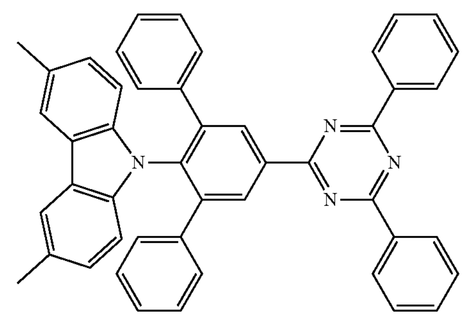
3
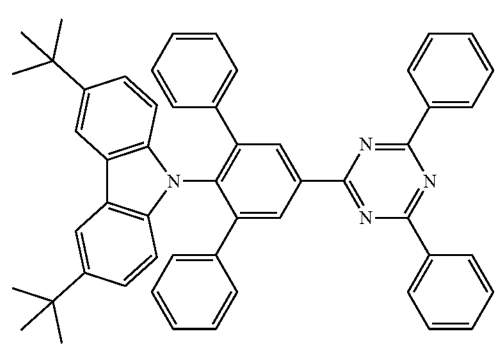

-continued
4
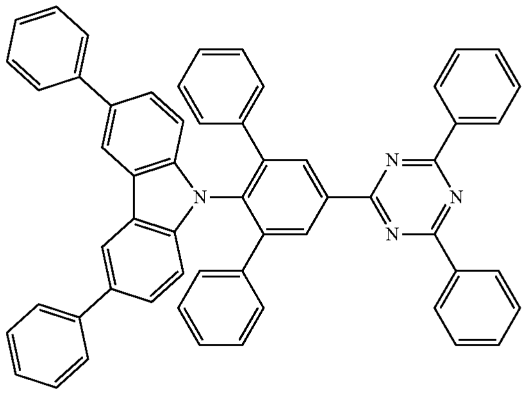
5
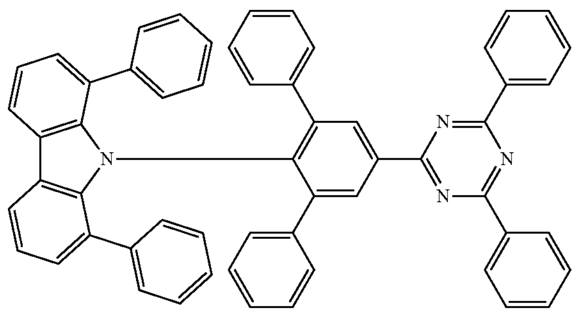
6
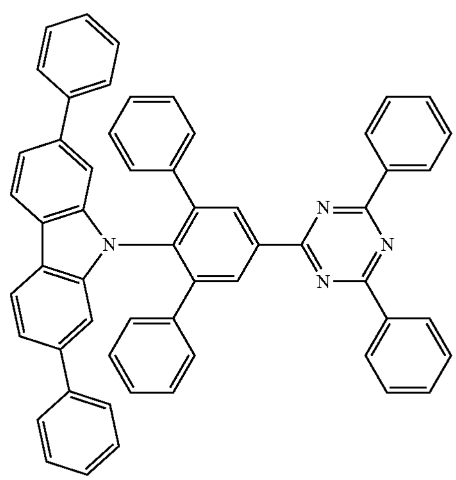
7
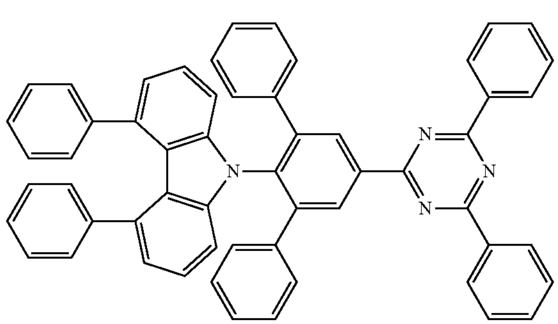
-continued
8
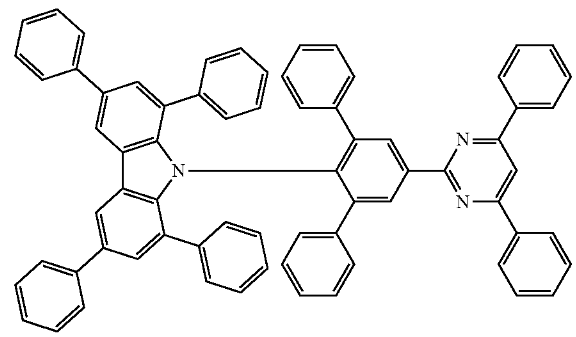
9
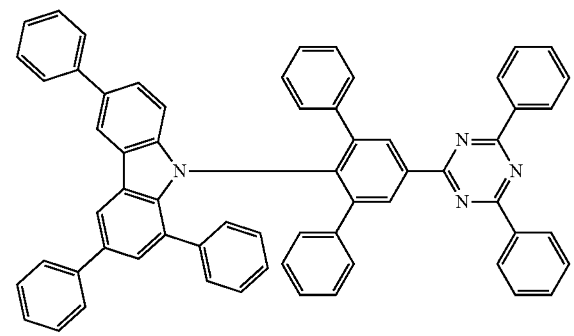
10
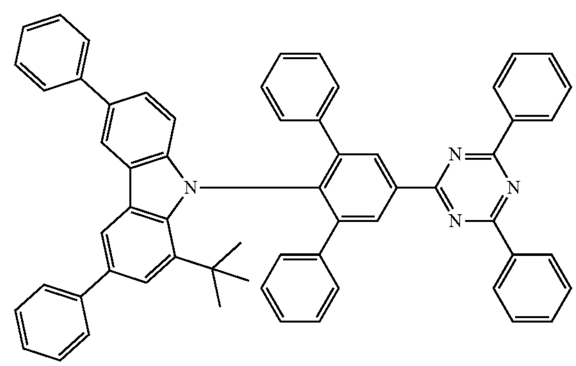
11
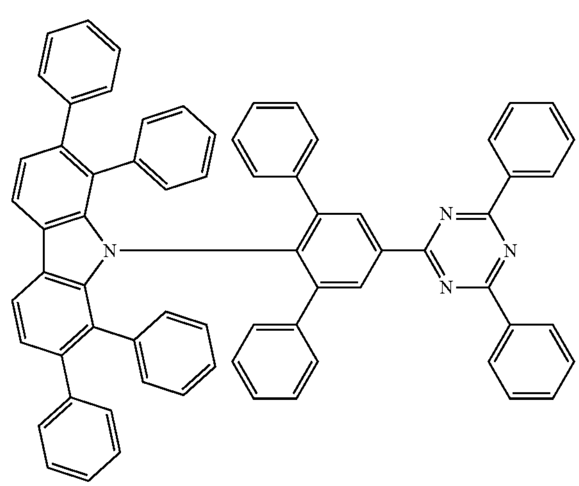

12
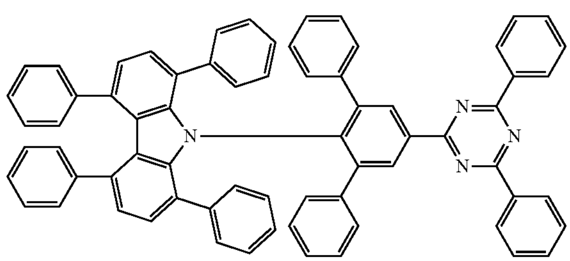
13
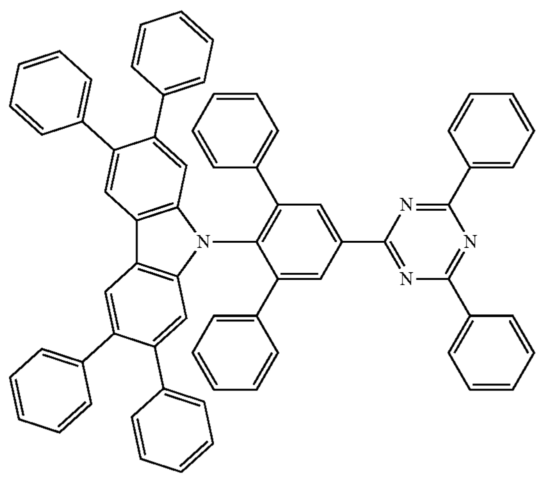
14
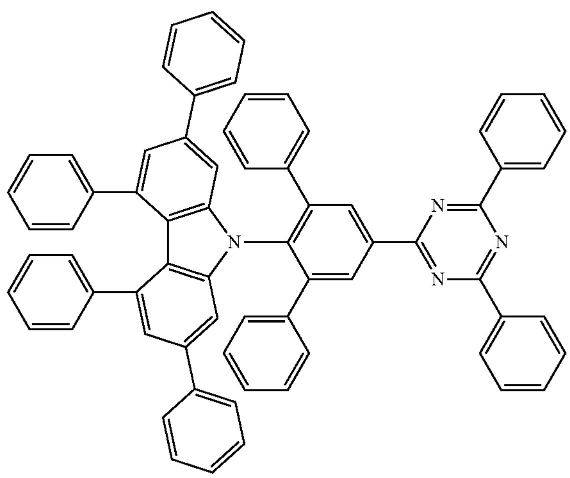
15
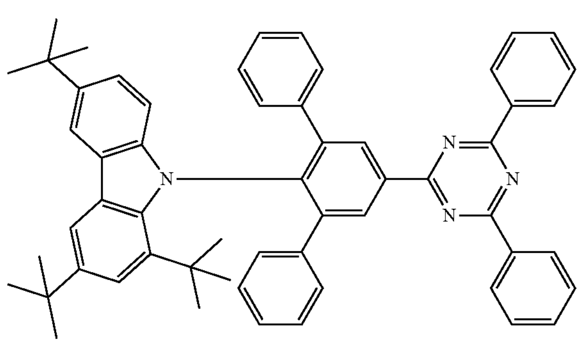
16
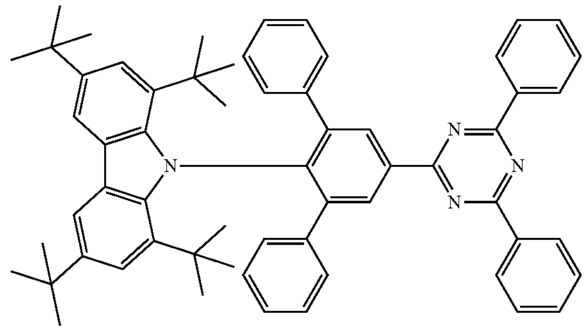
17
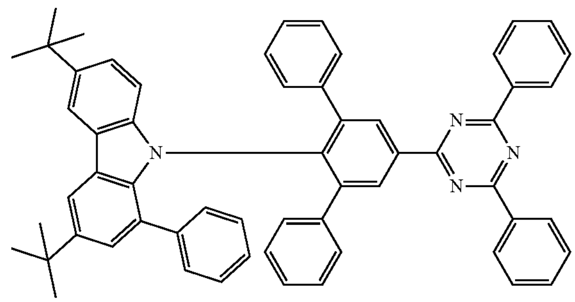
18
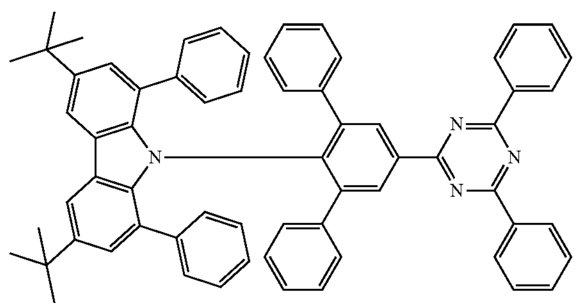
19
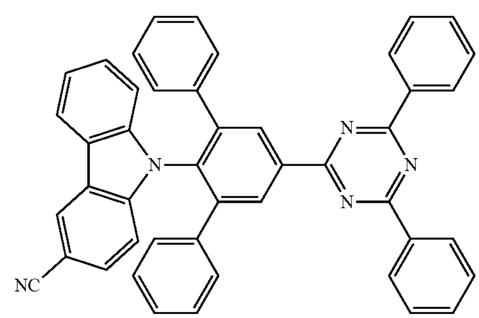
20
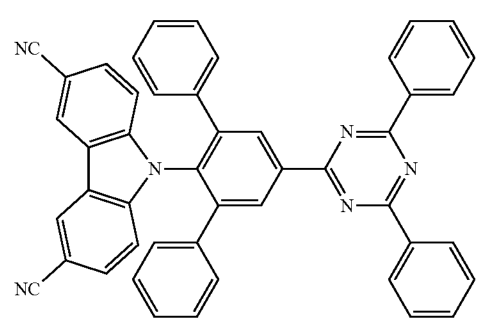

-continued
21
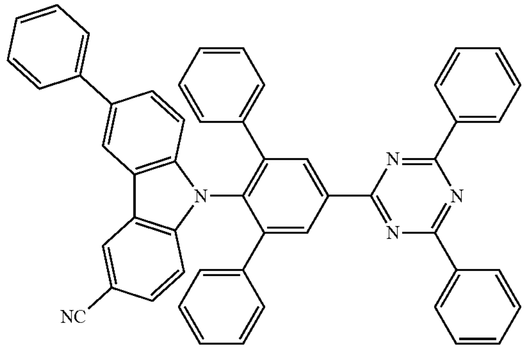
22
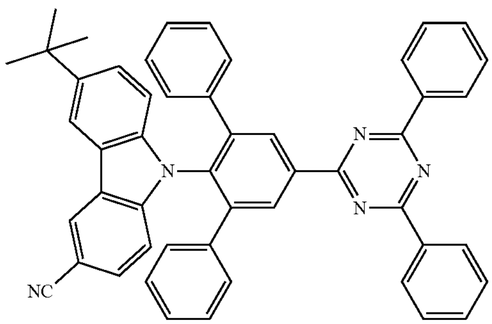
23
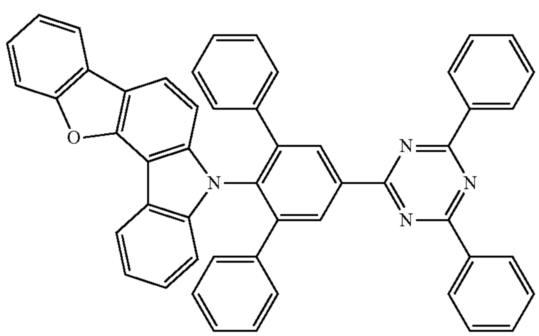
24
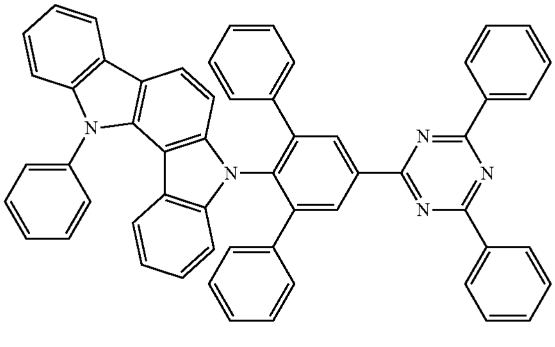
-continued
25
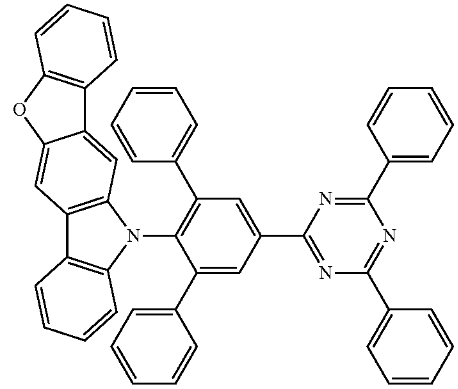
26
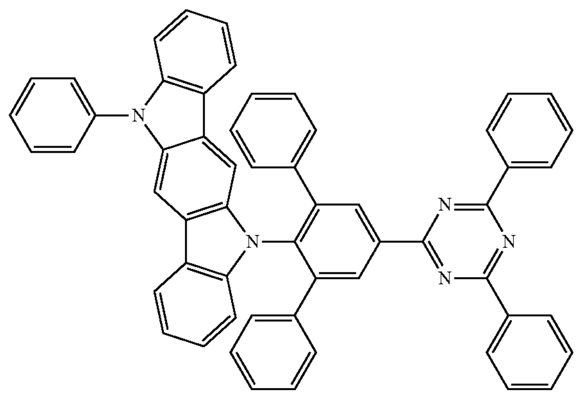
27
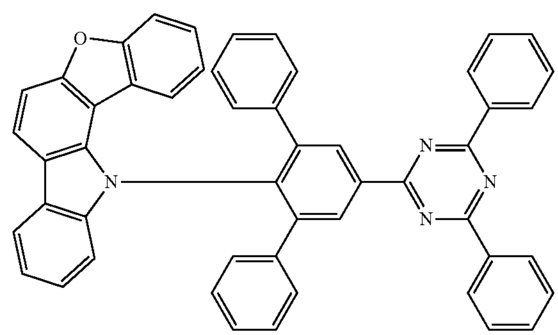
28
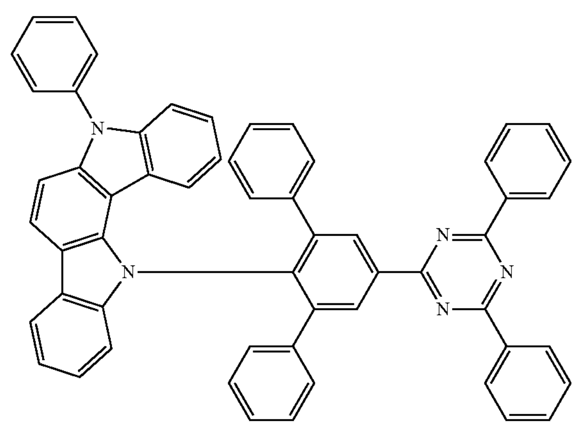

-continued
29
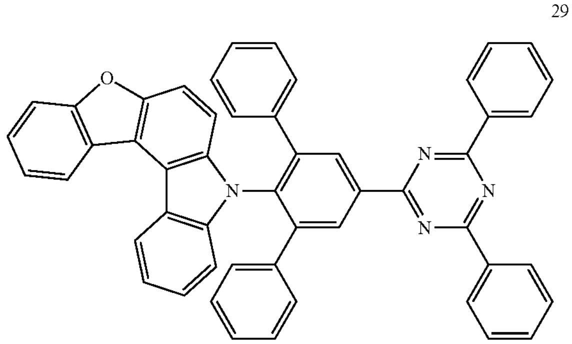
30
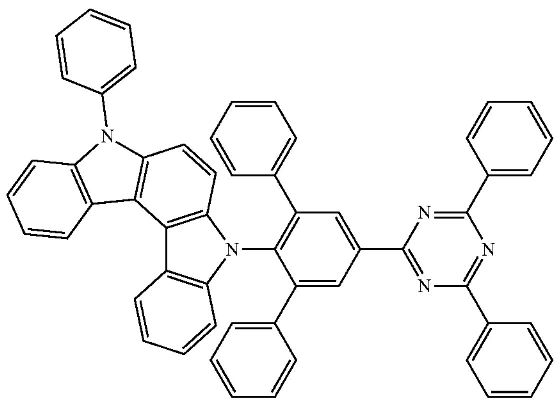
31
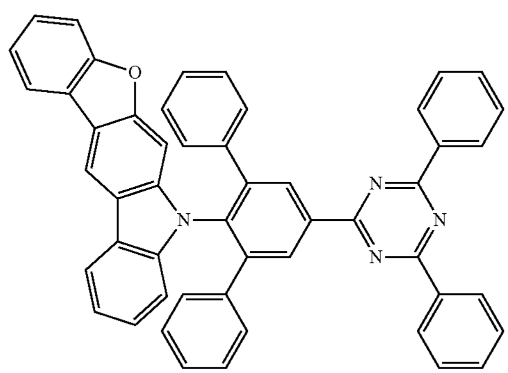
32
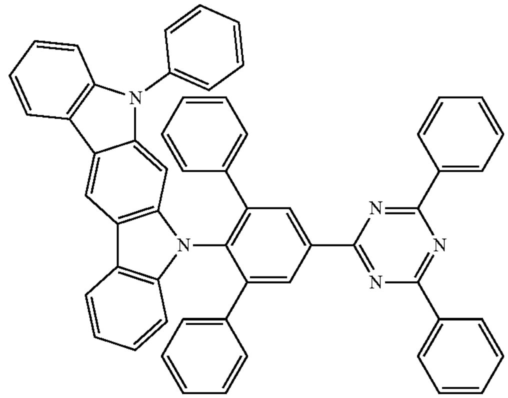
-continued
33
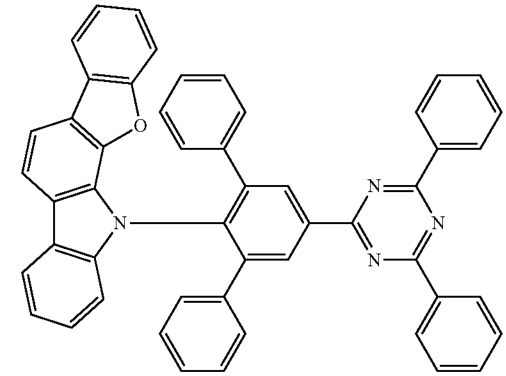
34
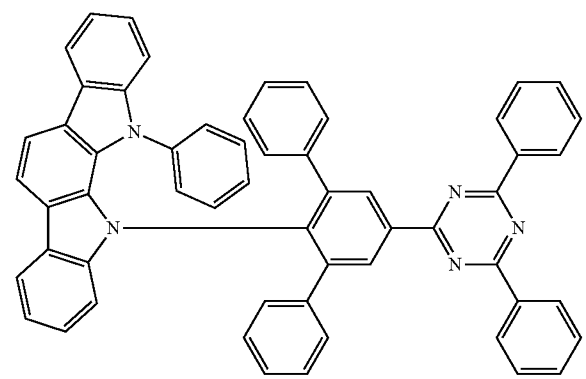
35
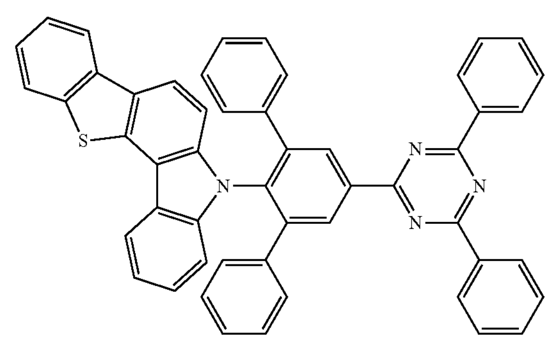
36
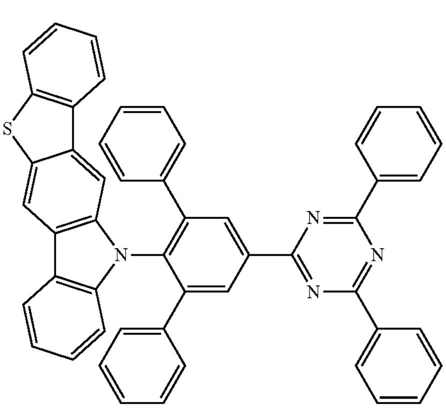

-continued
37
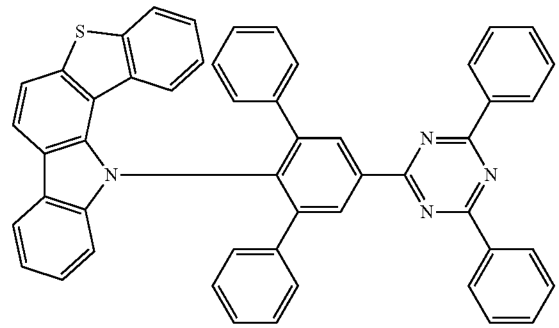
38
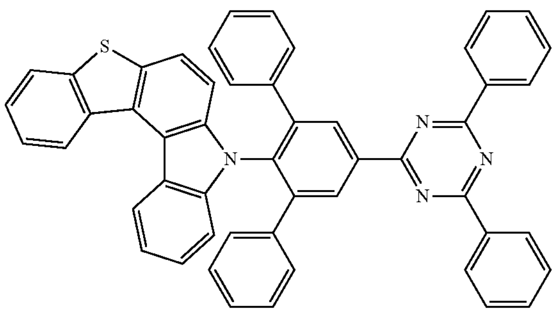
39
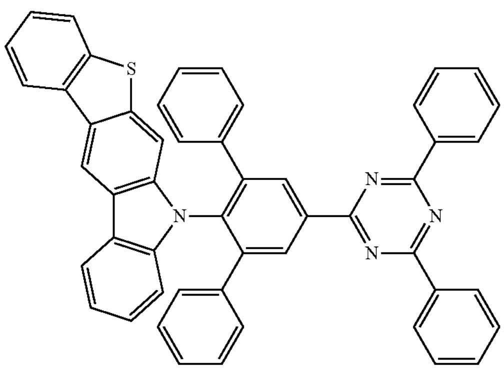
40
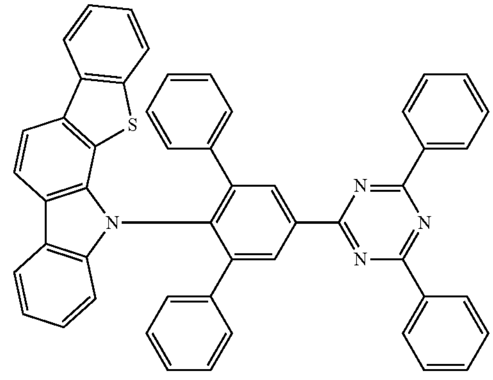
-continued
41
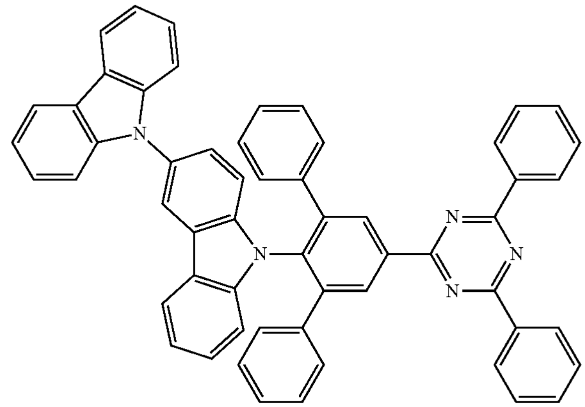
42
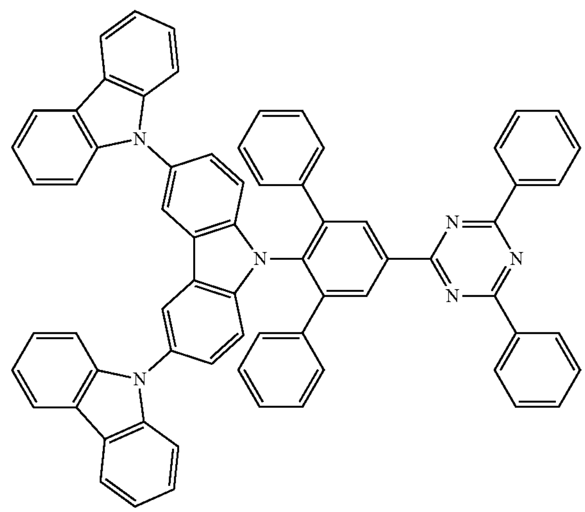
43
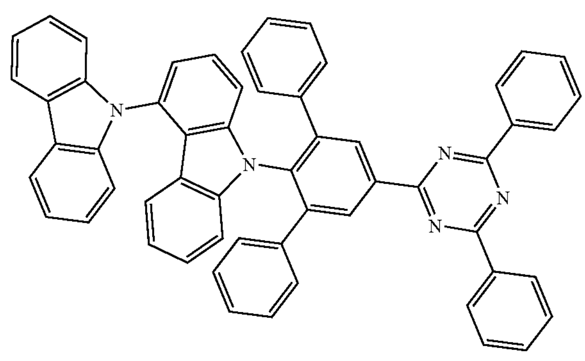

-continued
44
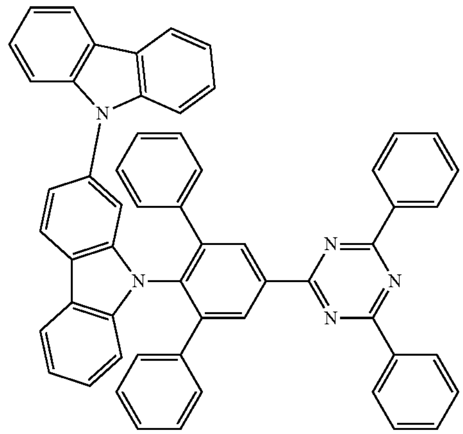
45
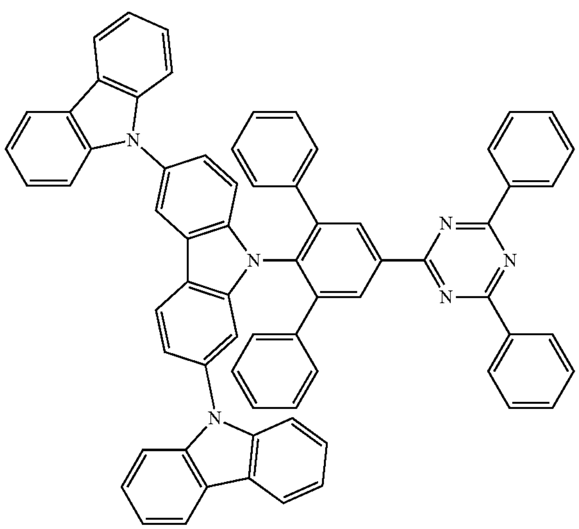
46
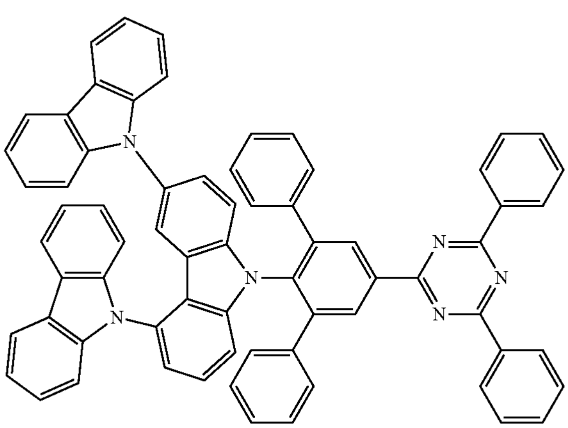
-continued
47
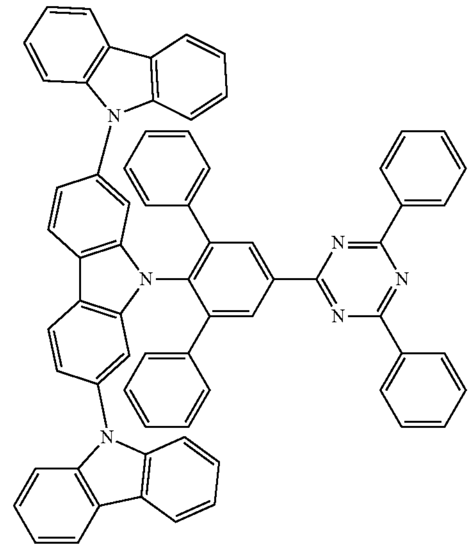
48
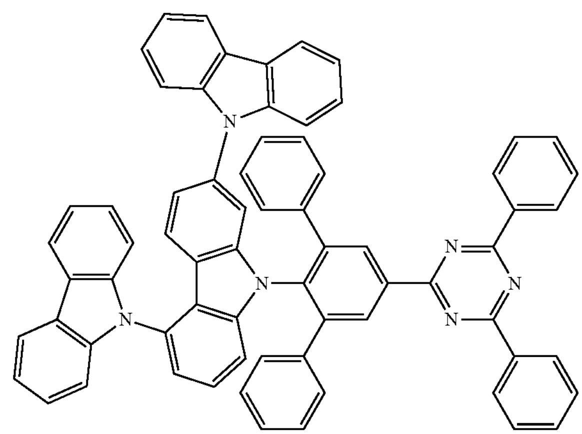
49
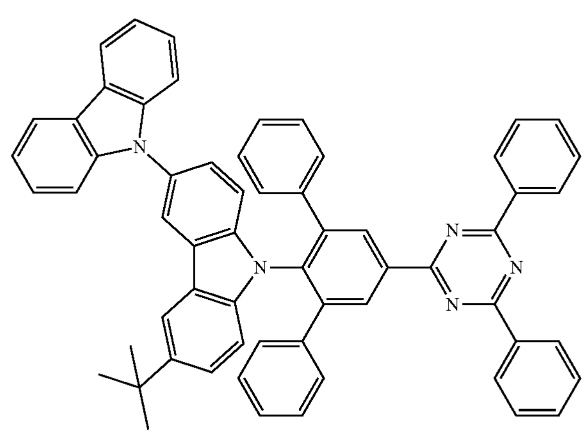

-continued
50
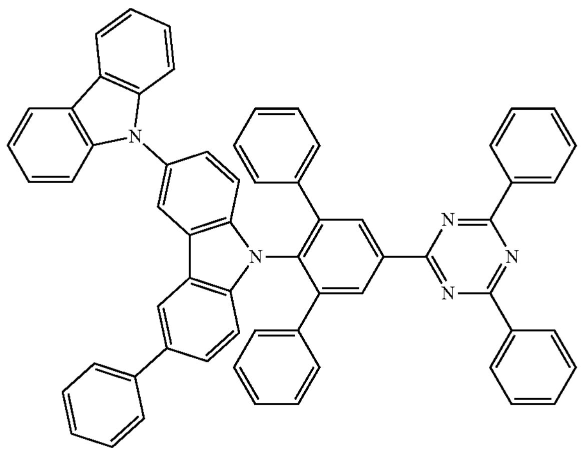
51
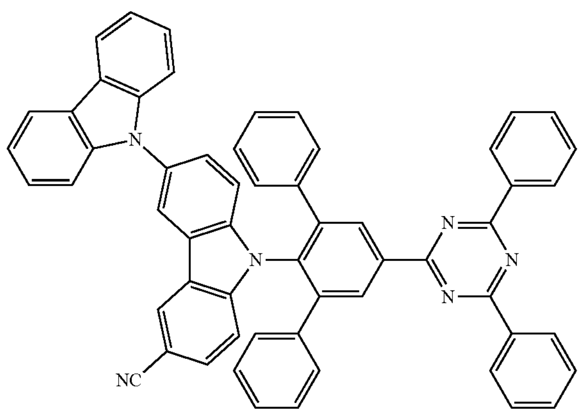
52
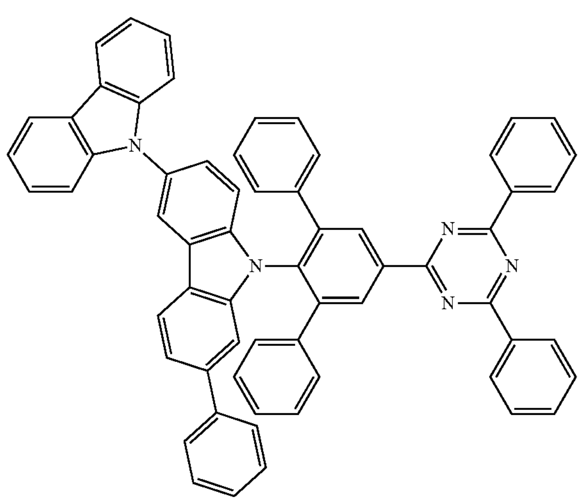
-continued
53
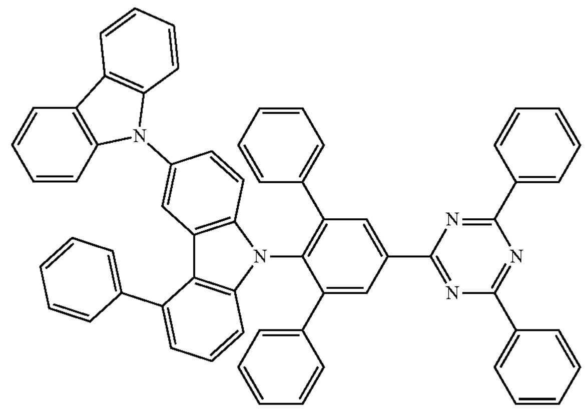
54
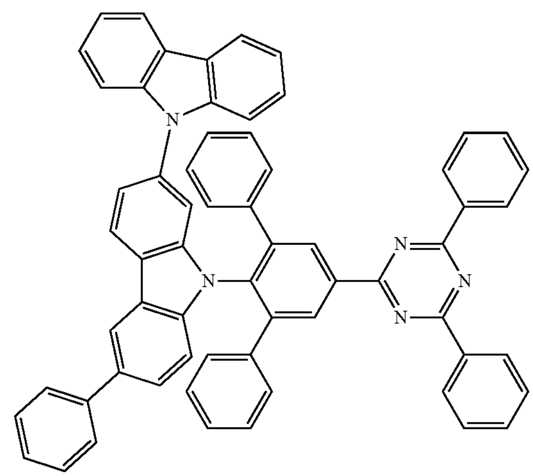
55
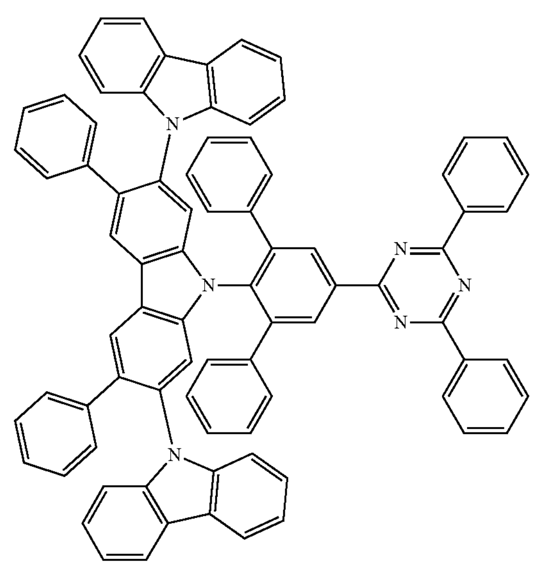

-continued
56
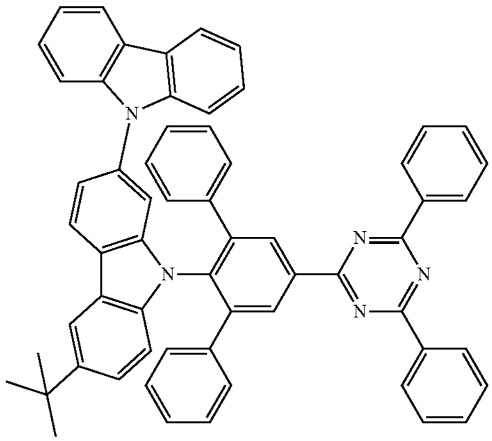
57
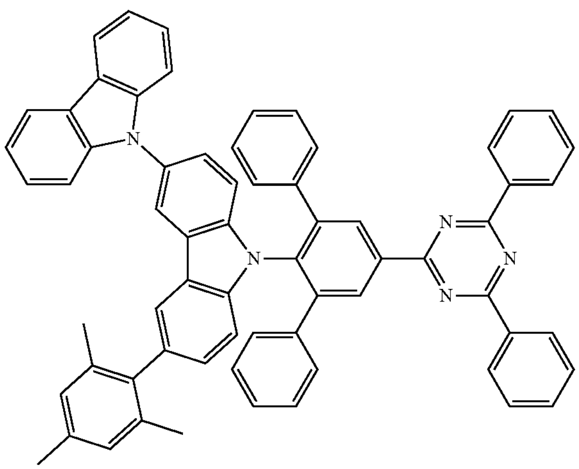
58
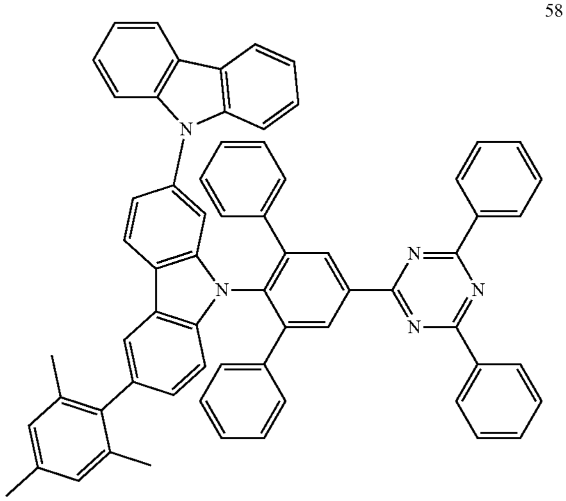
-continued
59
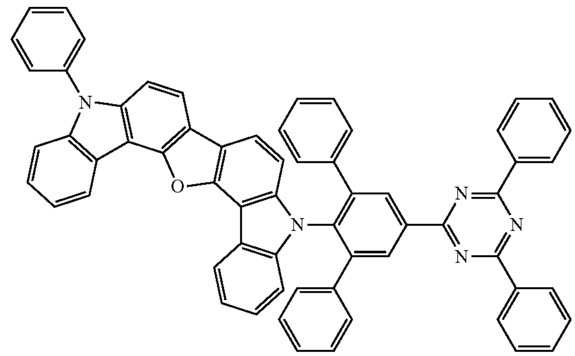
60
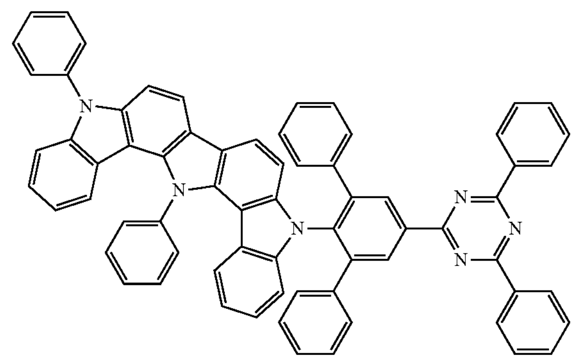
61
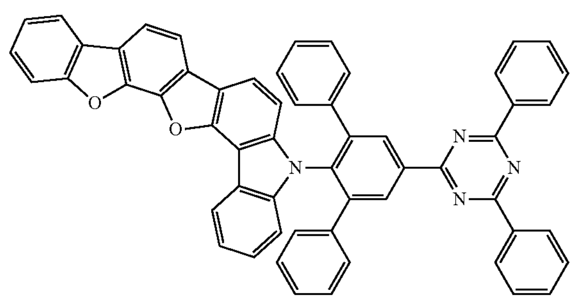
62
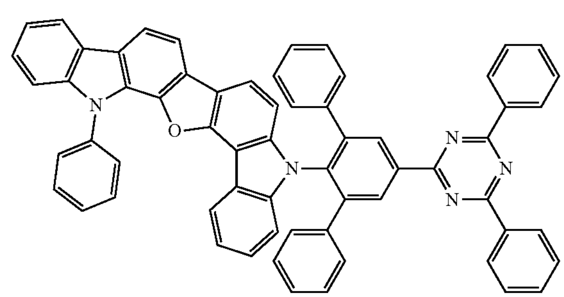

-continued
63
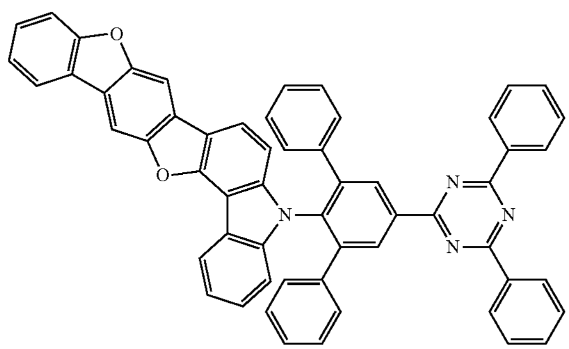
64
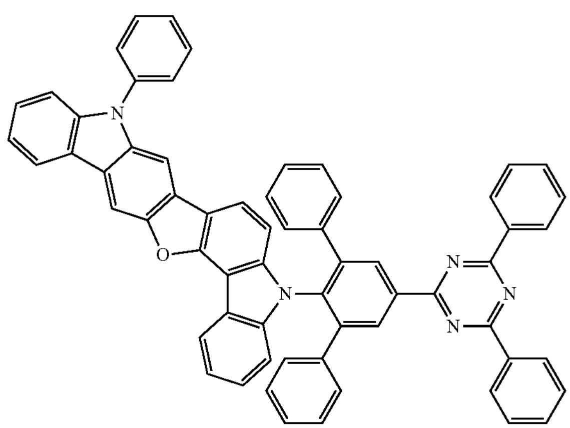
65
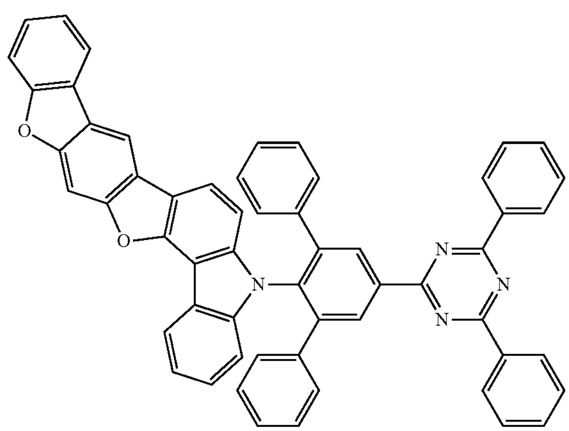
66
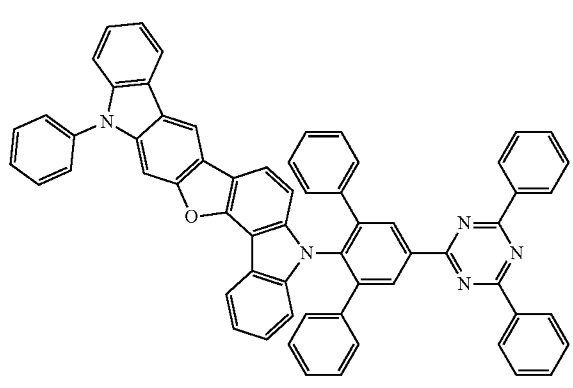
67
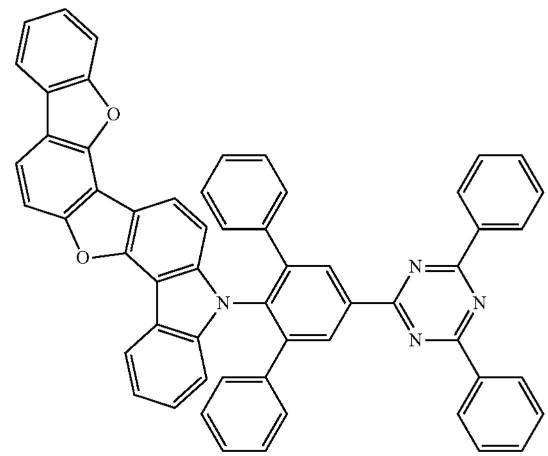
68
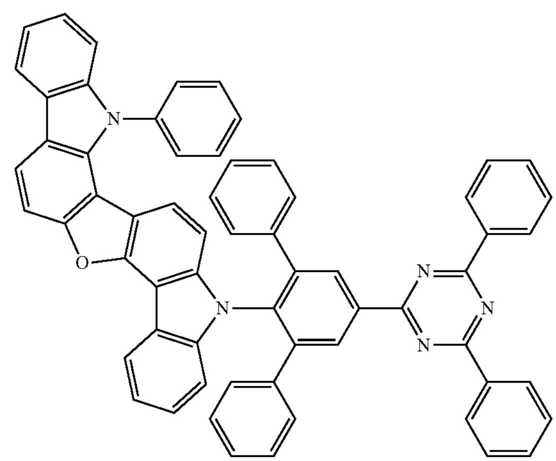
69
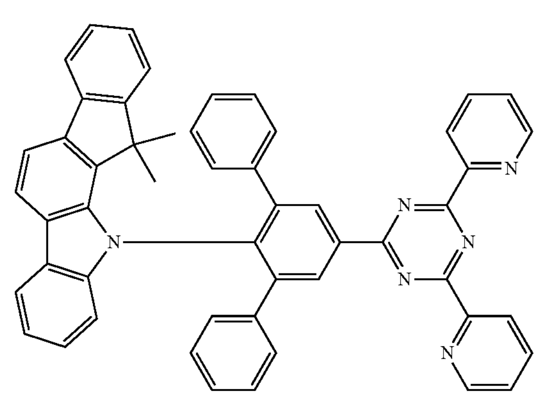

-continued
70
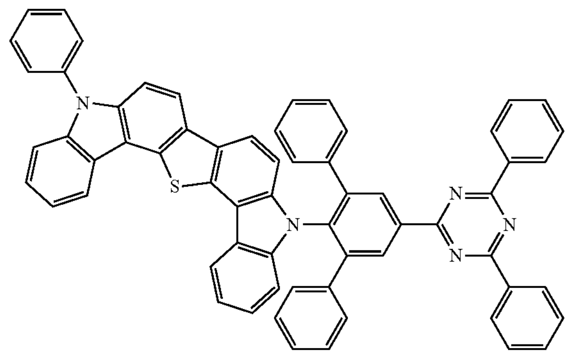
71
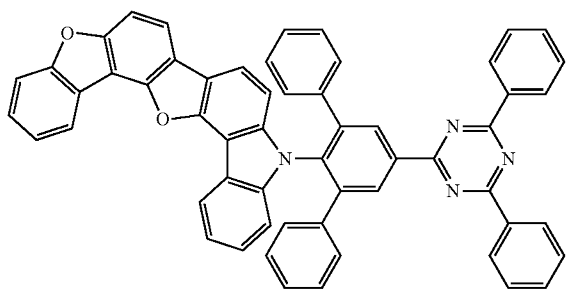
72
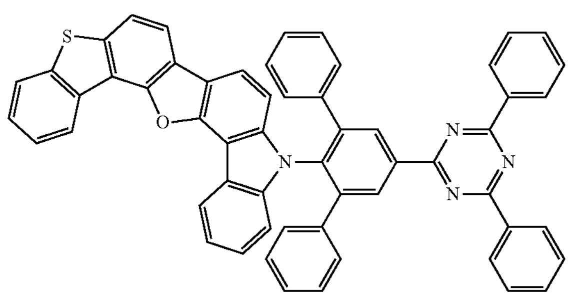
73
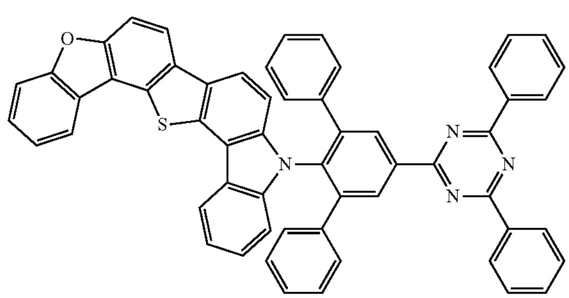
74
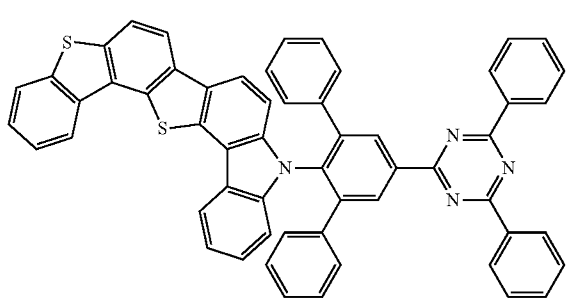
-continued
75
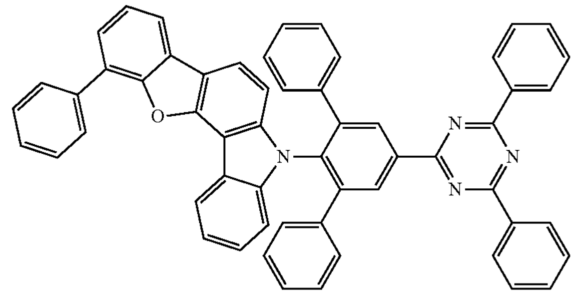
76
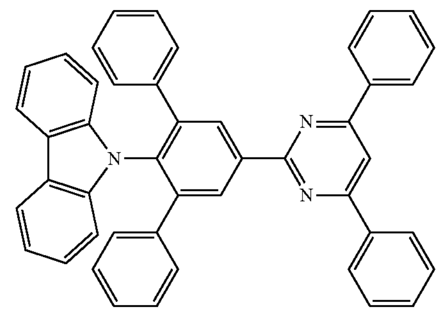
77
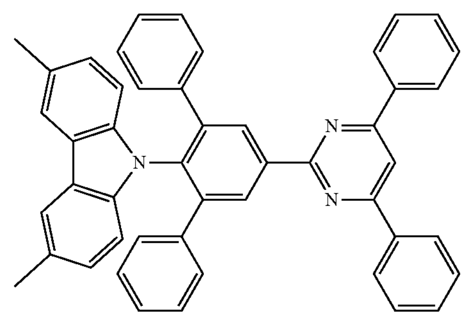
78
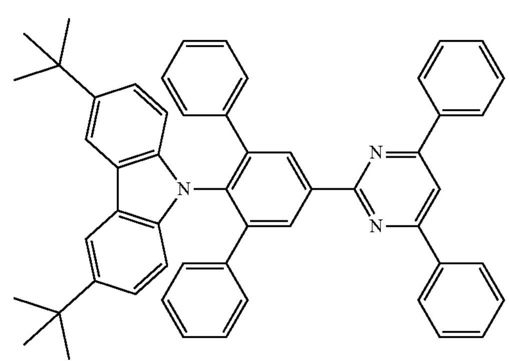

79
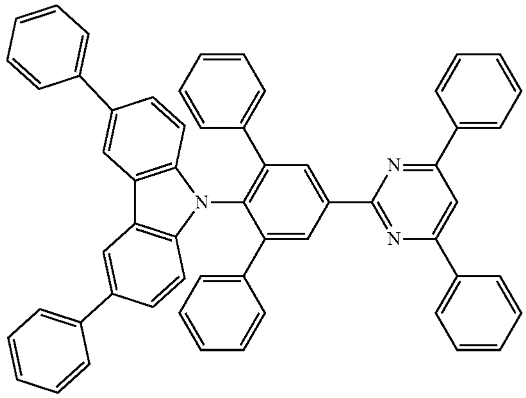
80
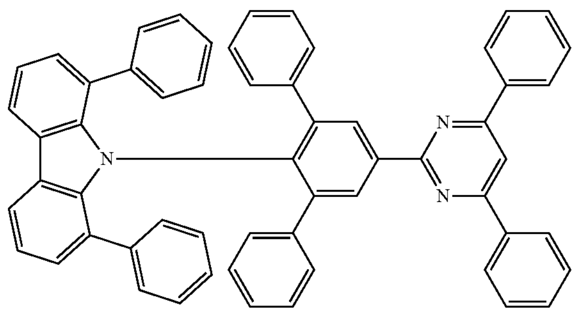
81
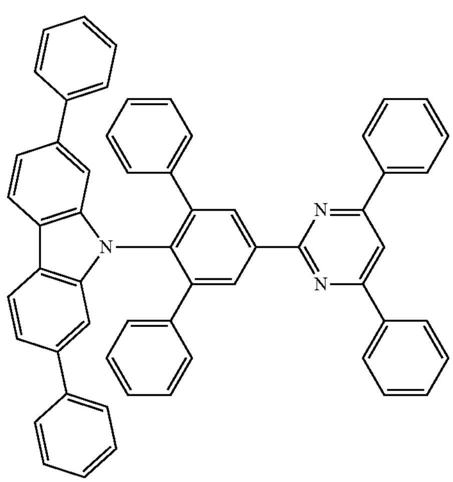
82
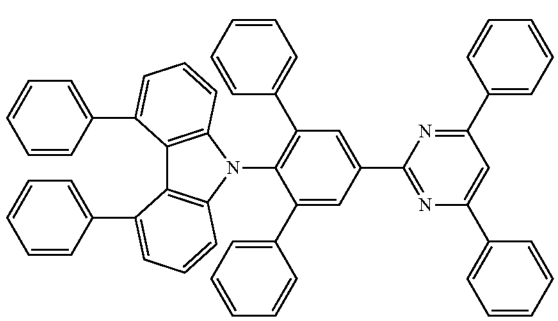
83
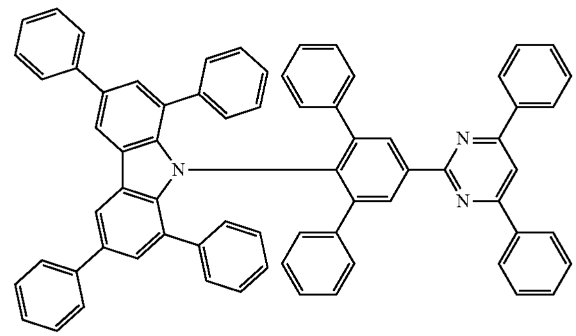
84
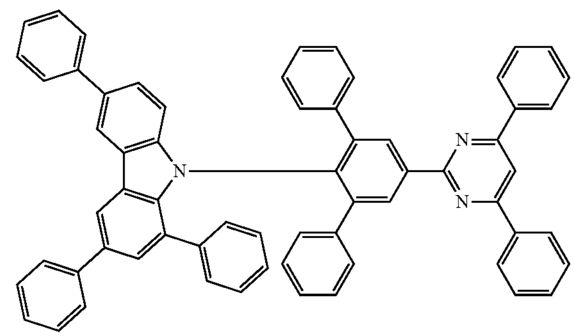
85
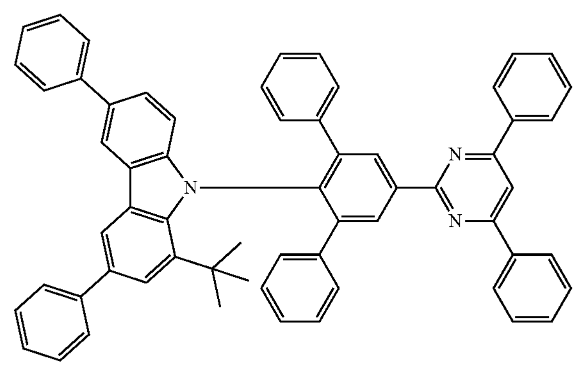
86
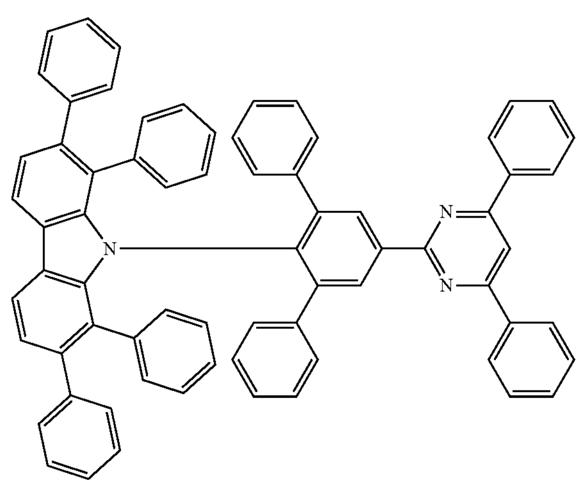

87
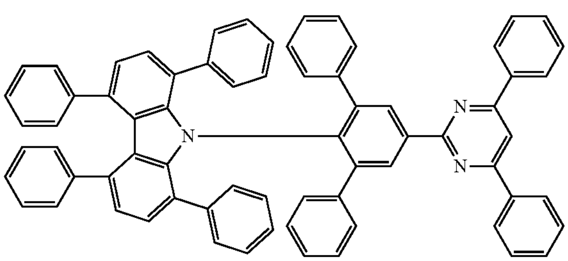
88
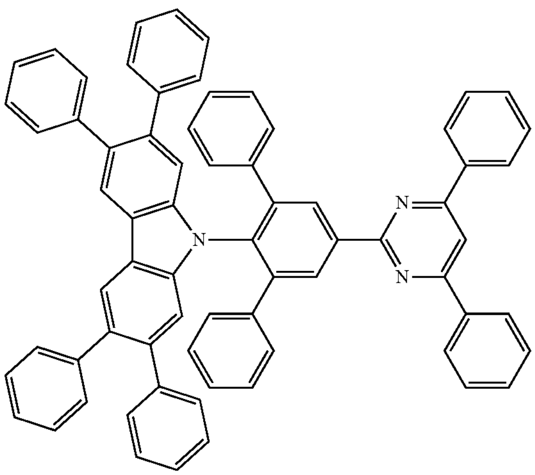
89
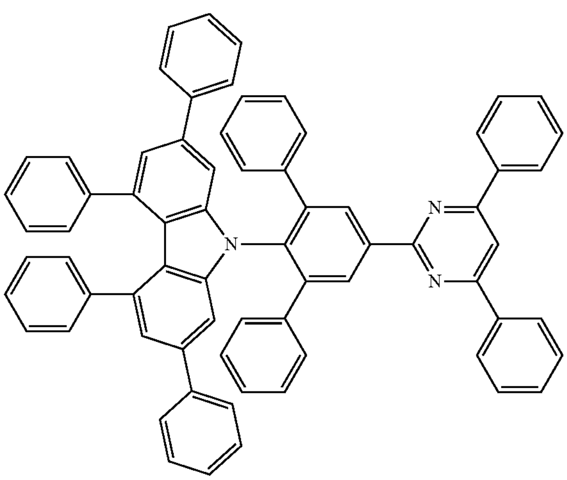
90
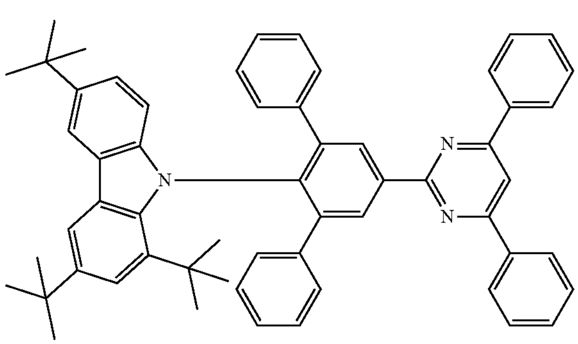
91
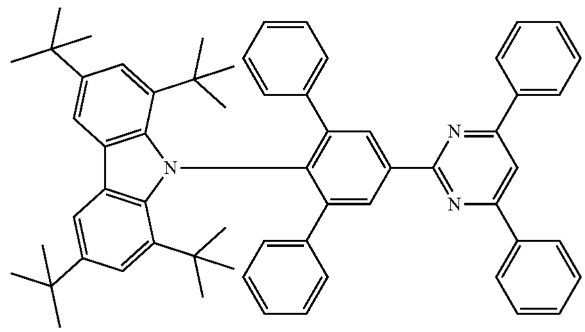
92
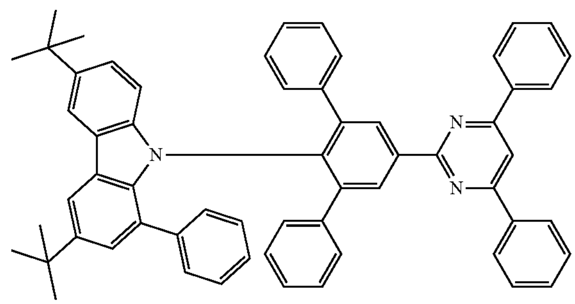
93
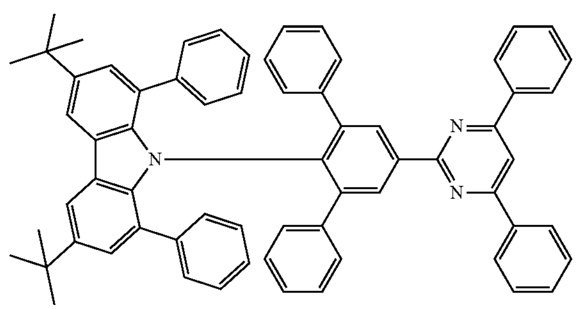
94
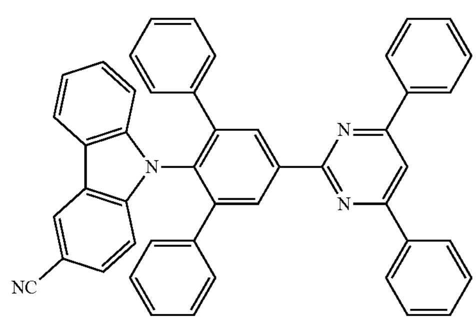
95
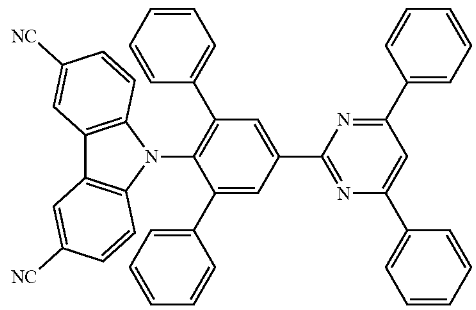

-continued
96
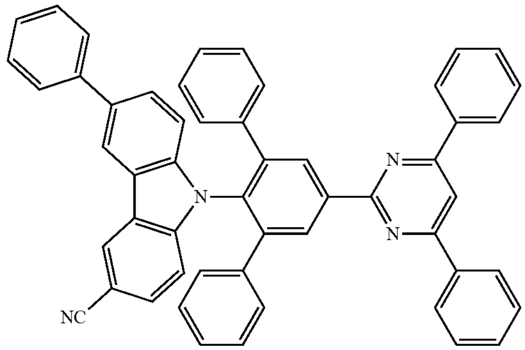
97
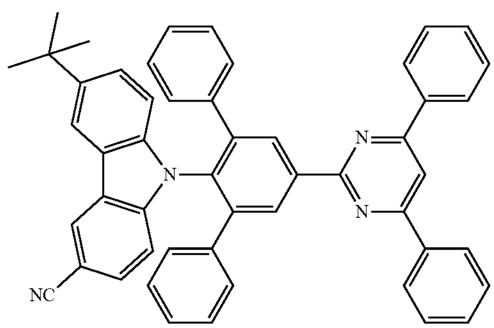
98
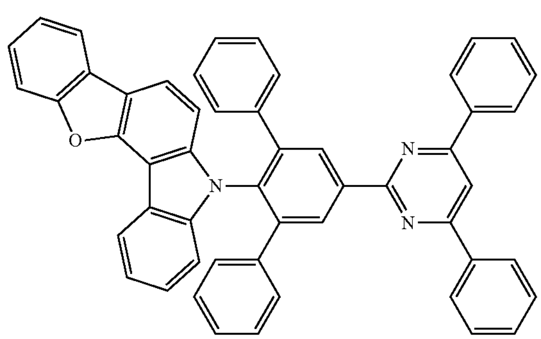
99
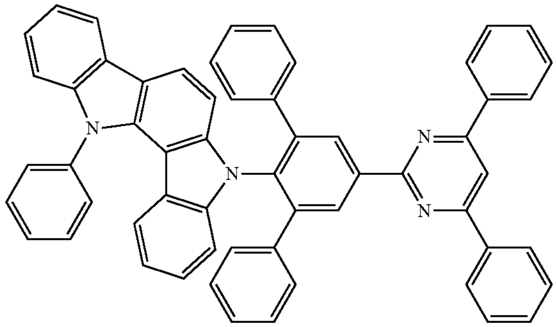
-continued
100
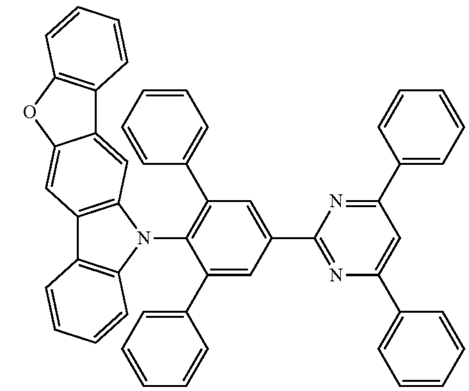
101
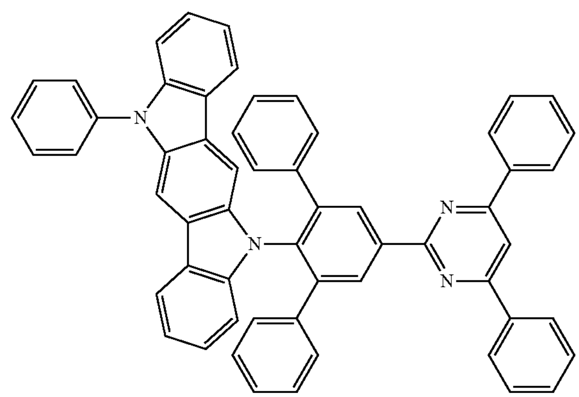
102
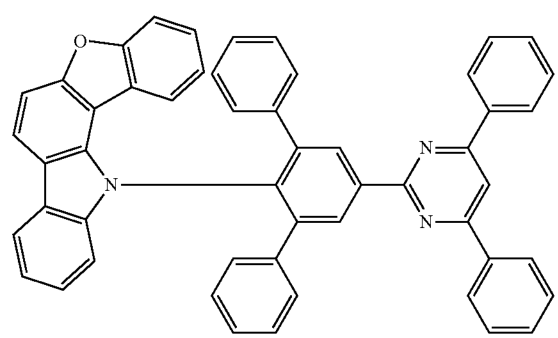
103
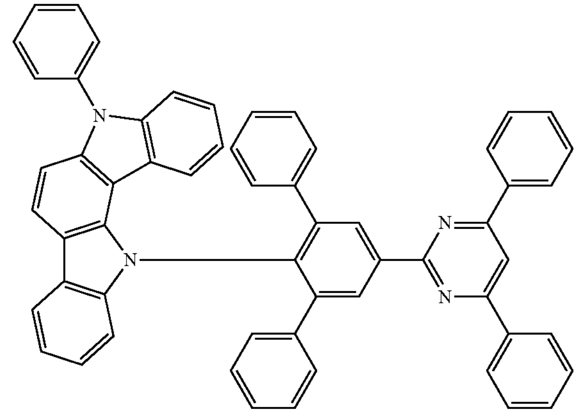

-continued
104
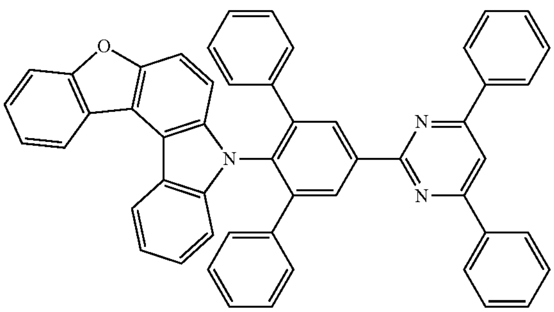
105
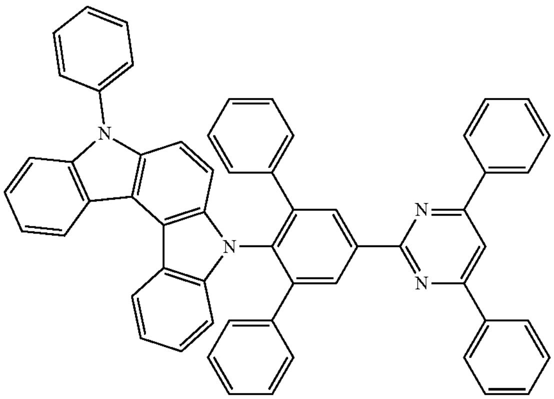
106
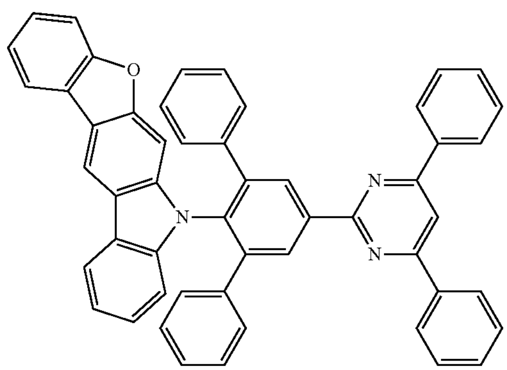
107
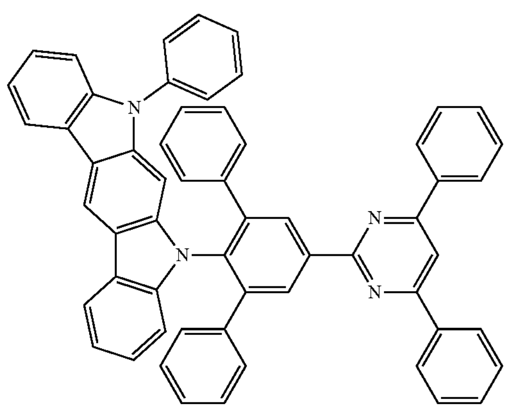
-continued
108
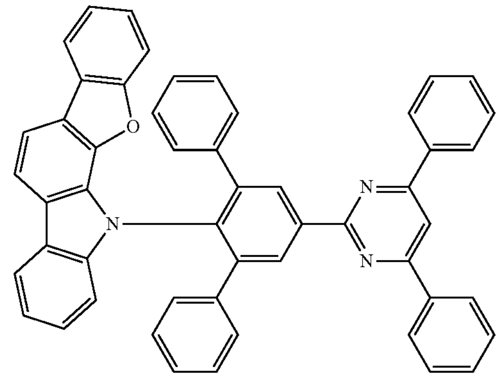
109
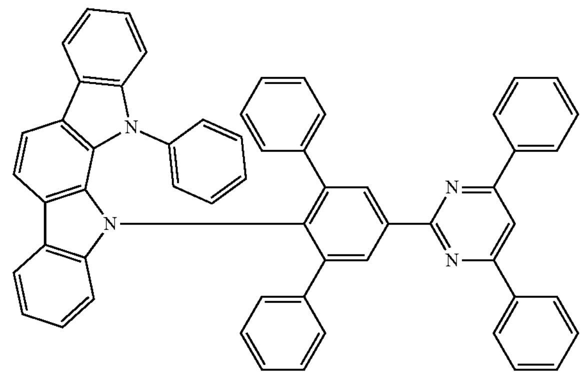
110
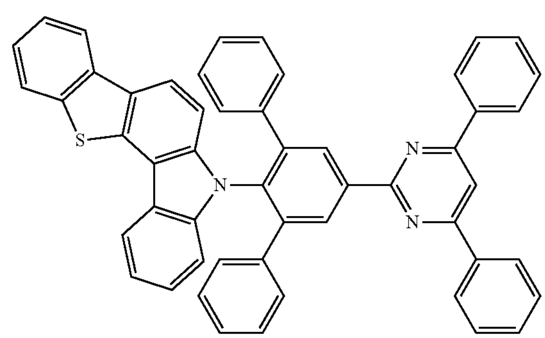
111
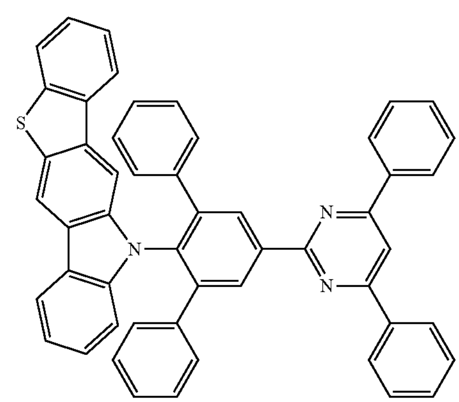

-continued
112
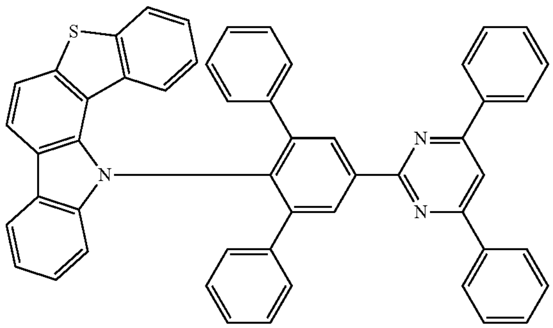
113
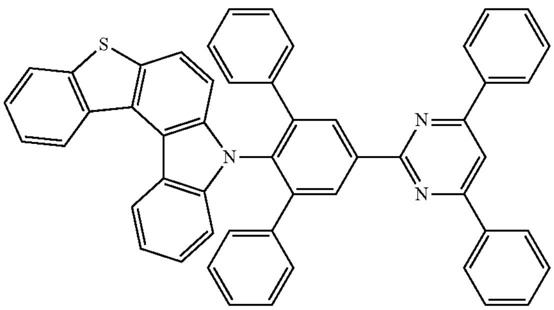
114
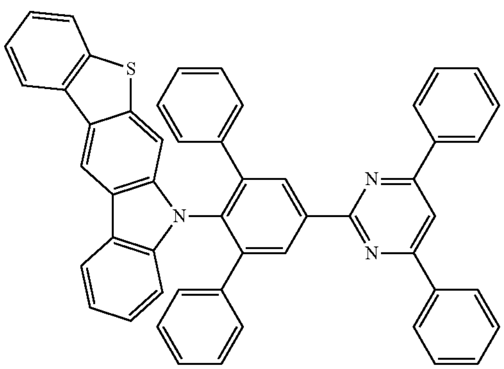
115
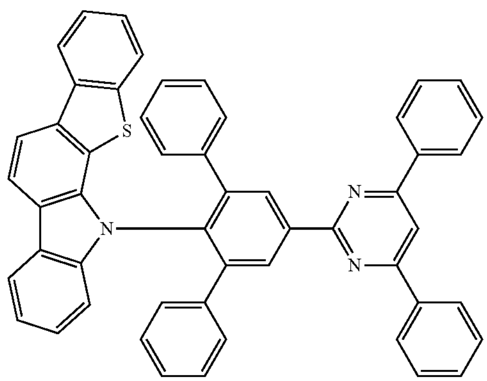
-continued
116
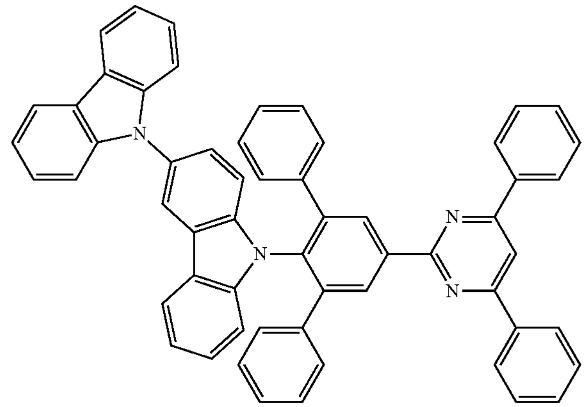
117
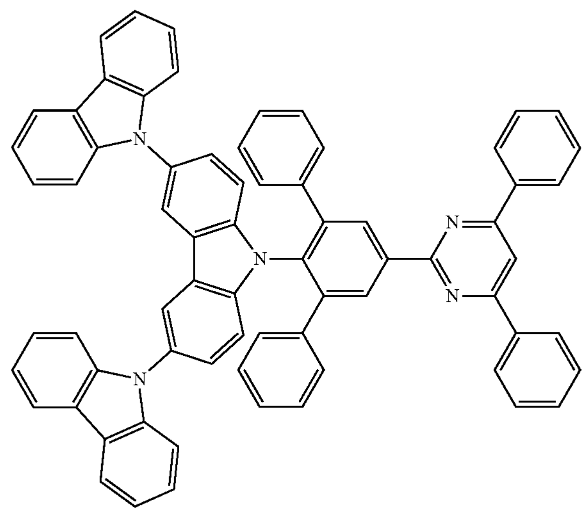
118
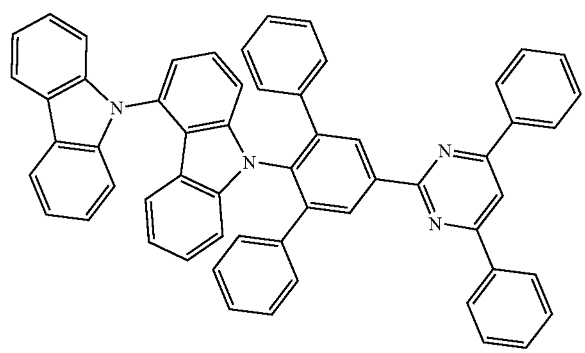

-continued
119
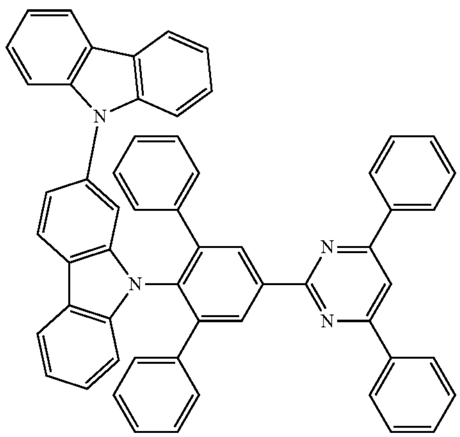
120
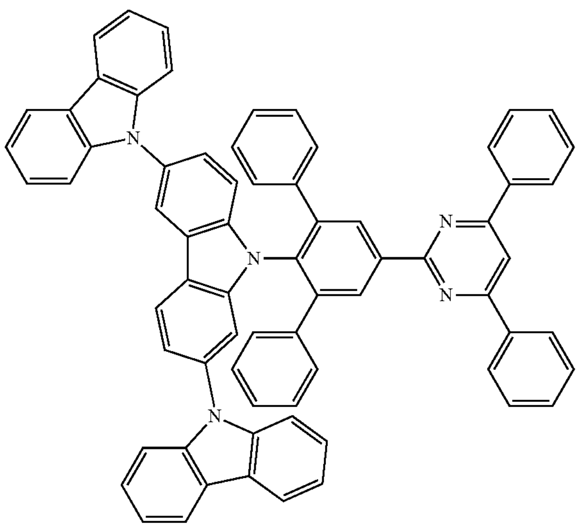
121
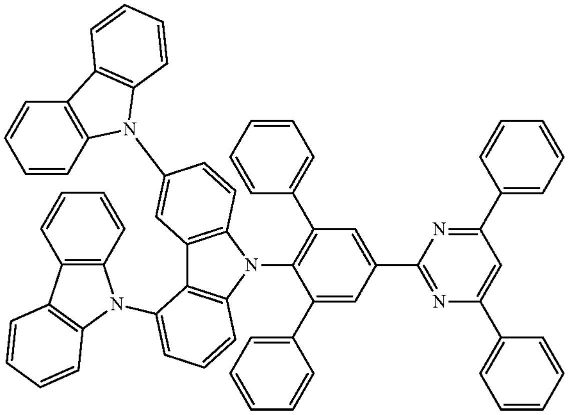
-continued
122
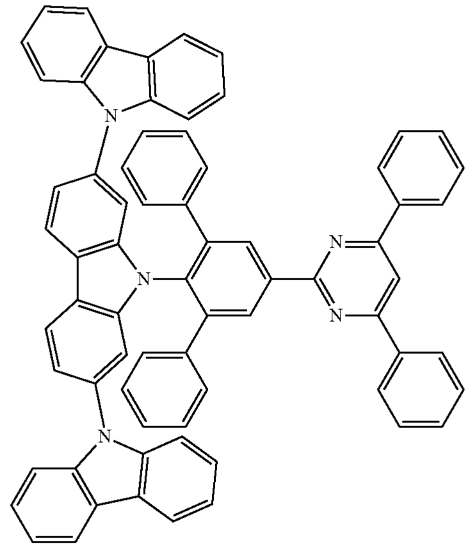
123
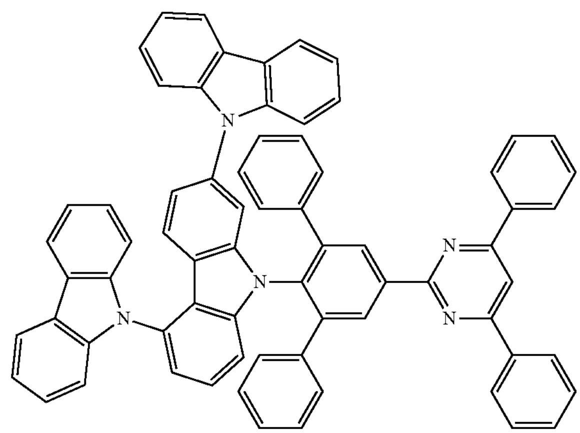
124
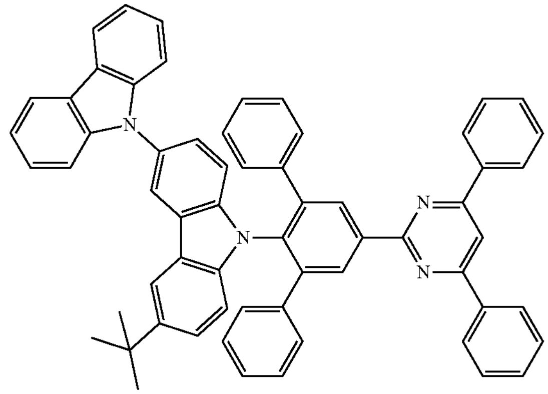

-continued
125
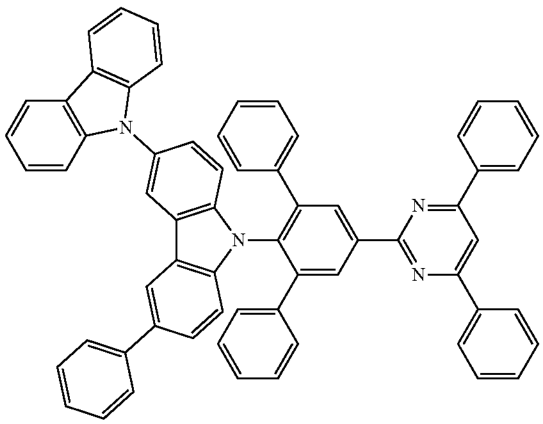
126
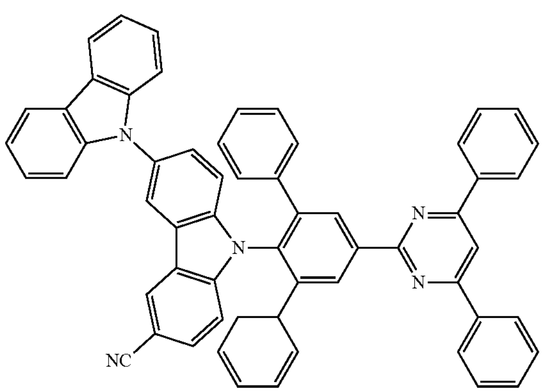
127
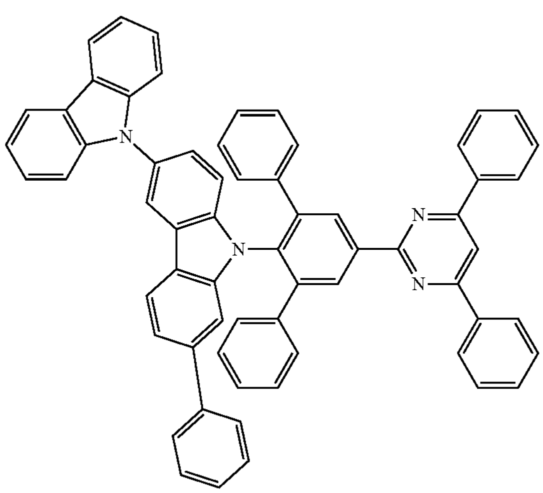
-continued
128
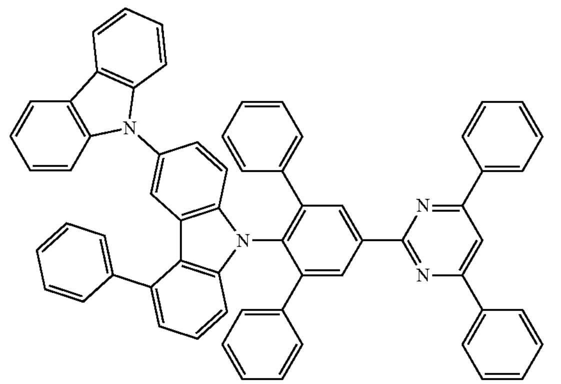
129
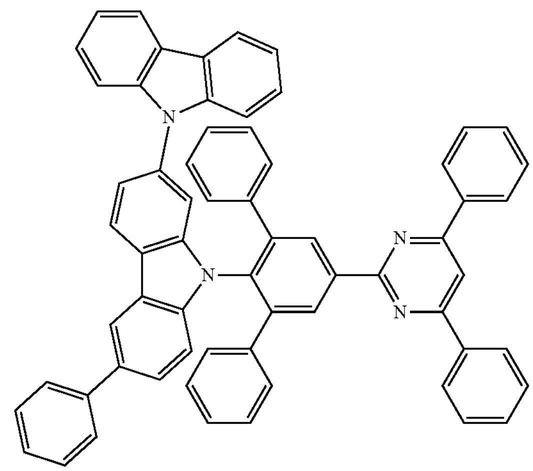
130
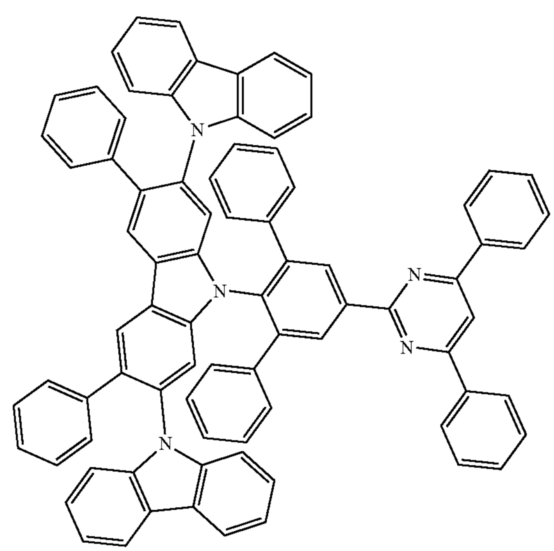

131
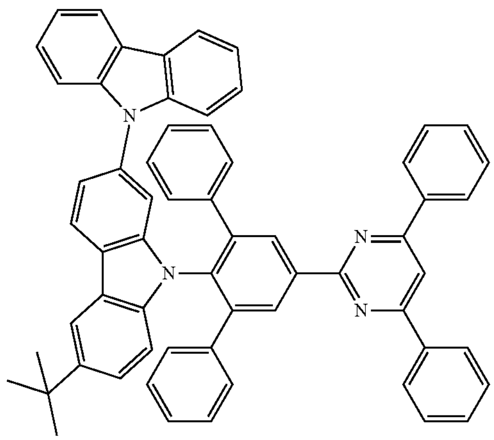
132
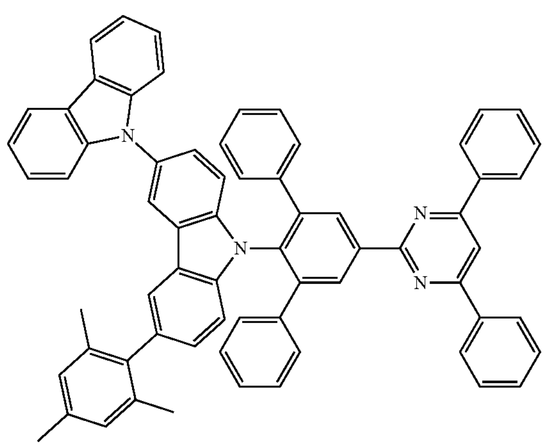
133
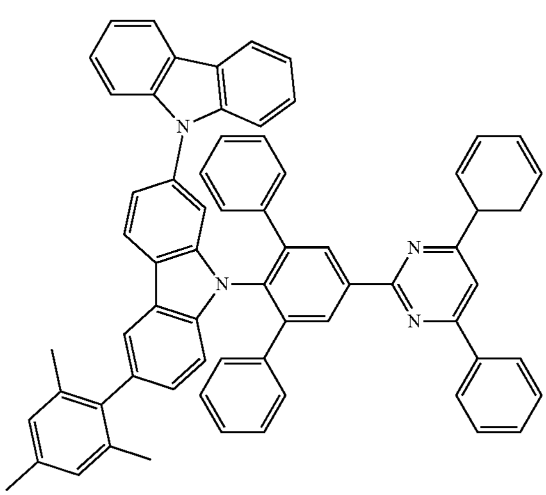
134
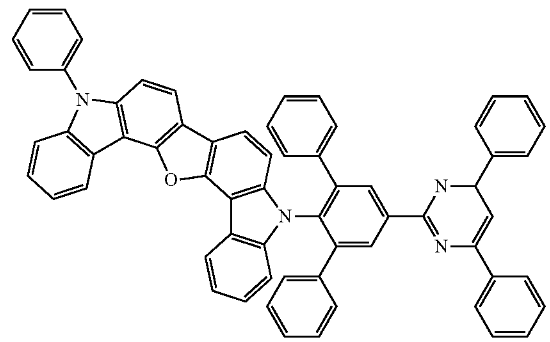
135
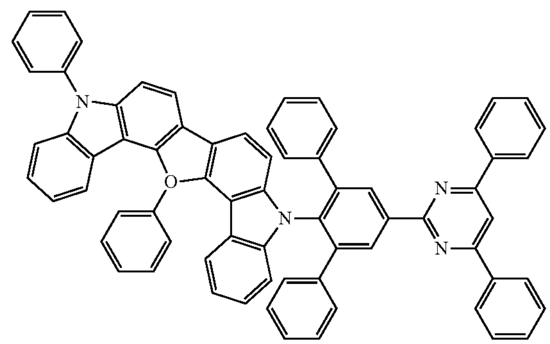
136
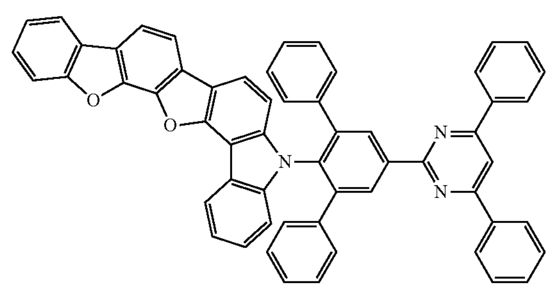
137
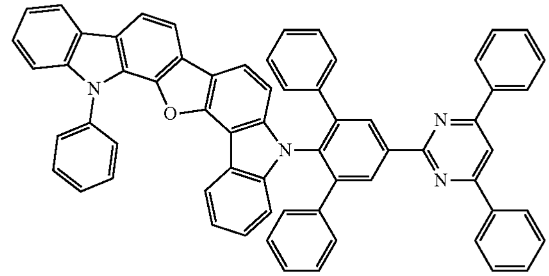

-continued
138
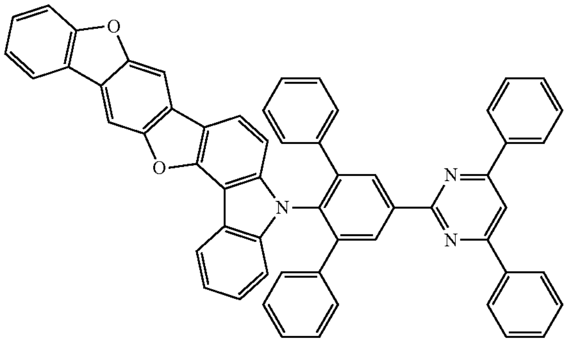
139
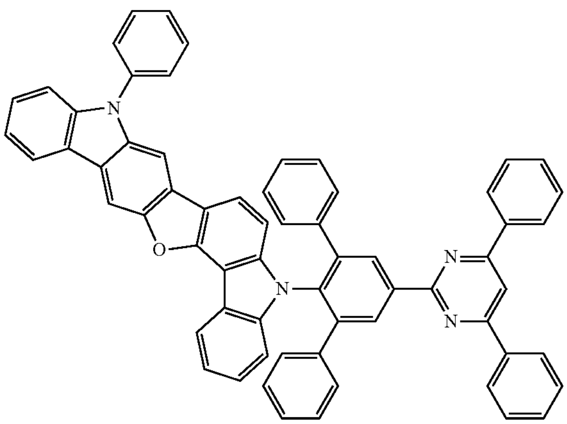
140
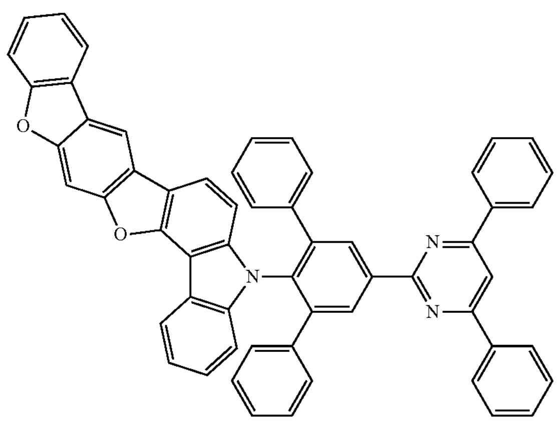
141
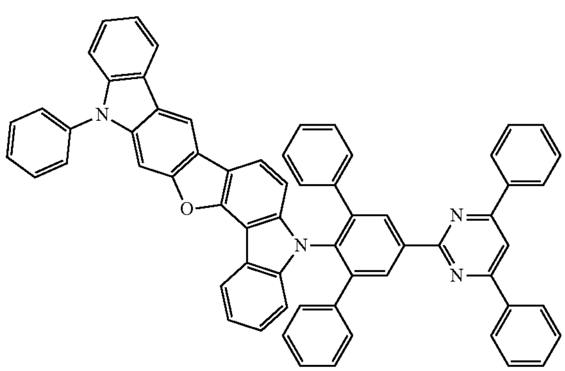
-continued
142
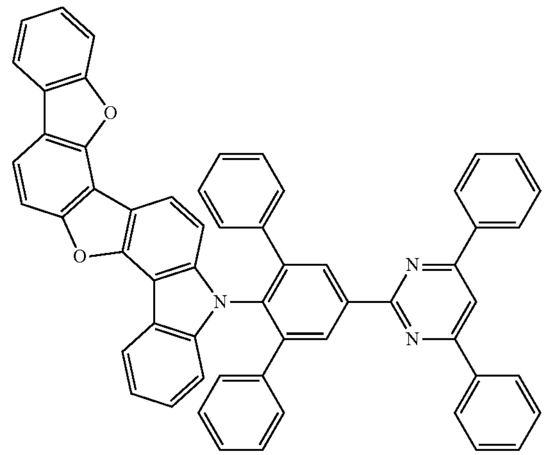
143
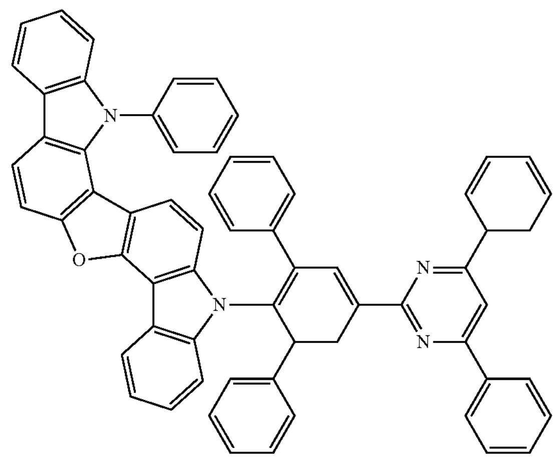
144
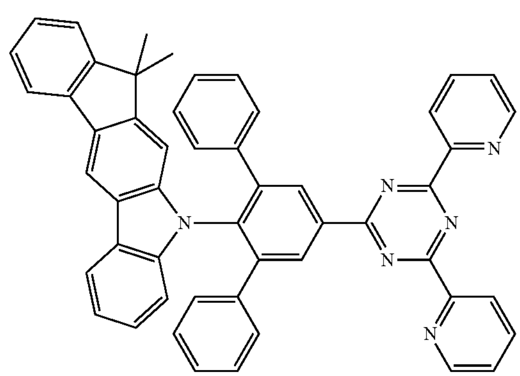

-continued
145
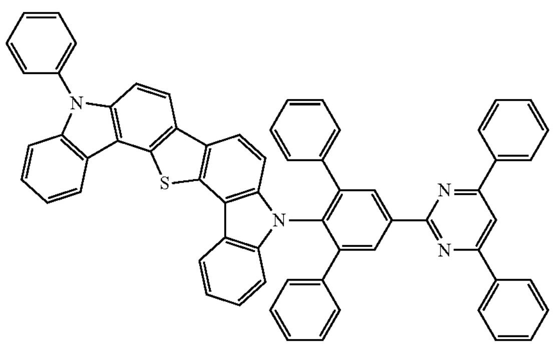
146
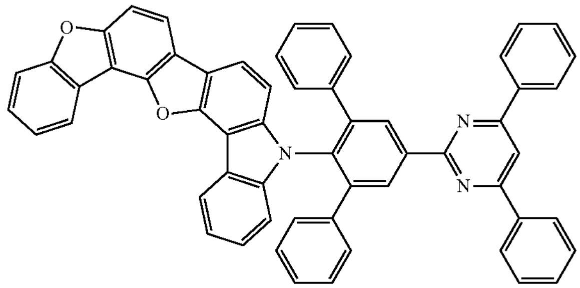
147
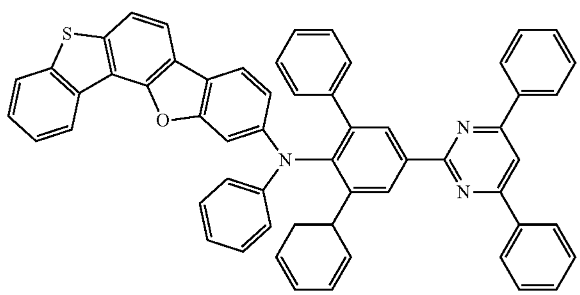
148
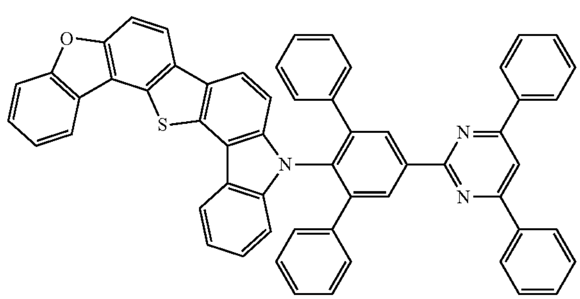
149
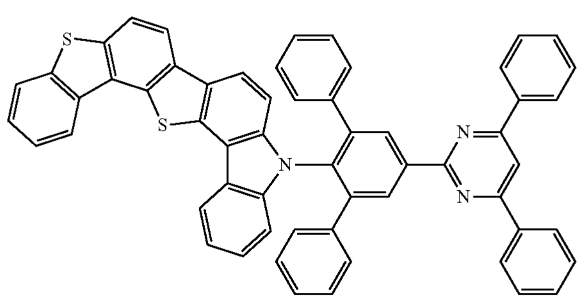
-continued
150
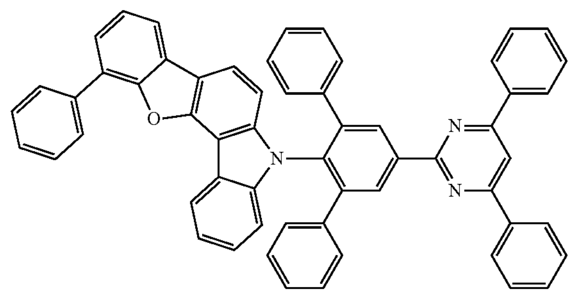
151
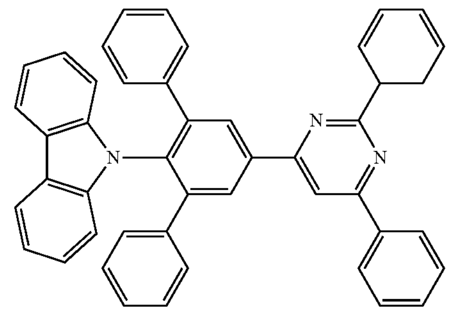
152
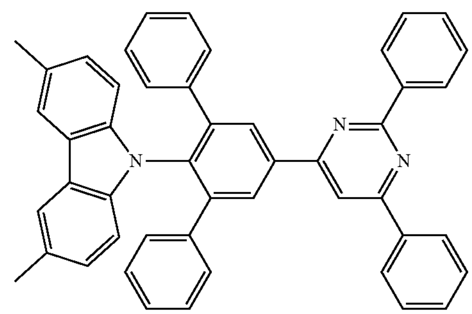
153
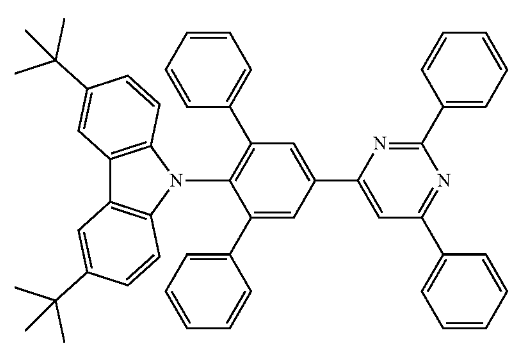

-continued
154
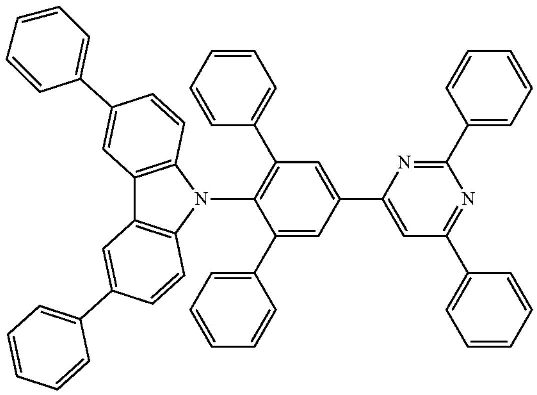
155
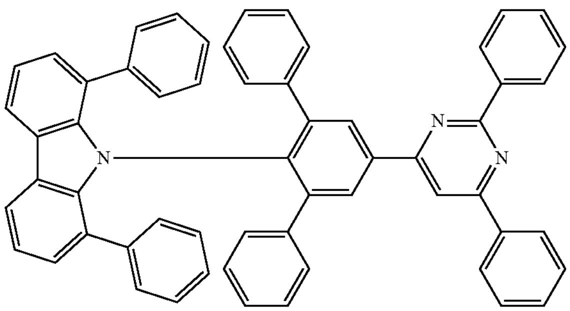
156
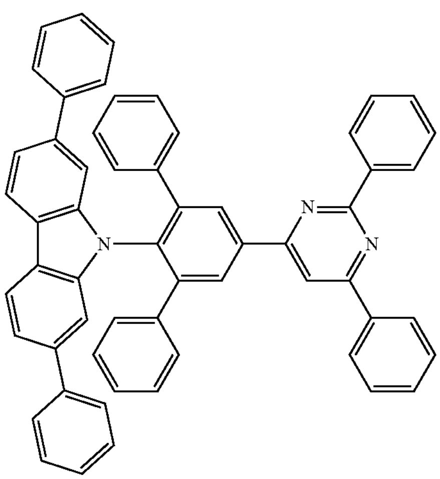
157
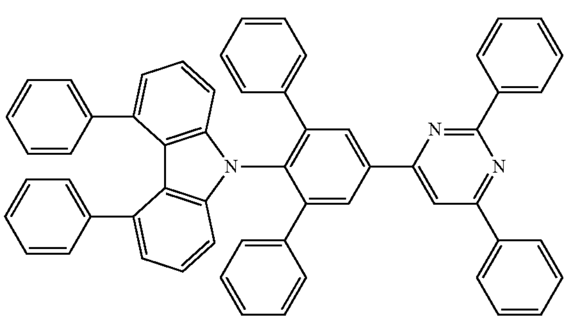
-continued
158
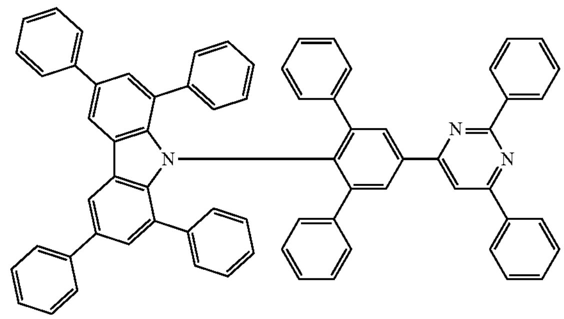
159
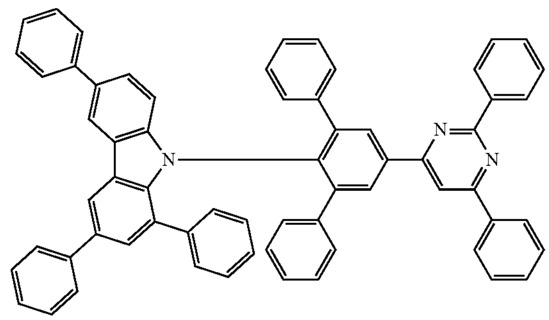
160
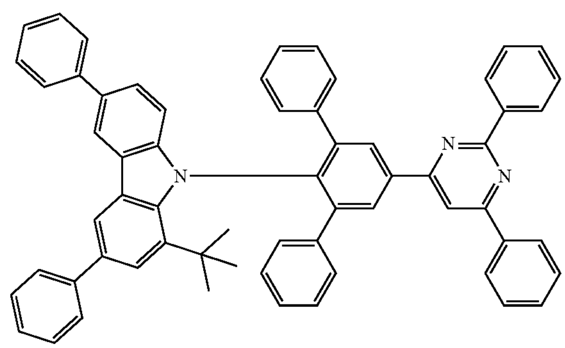
161
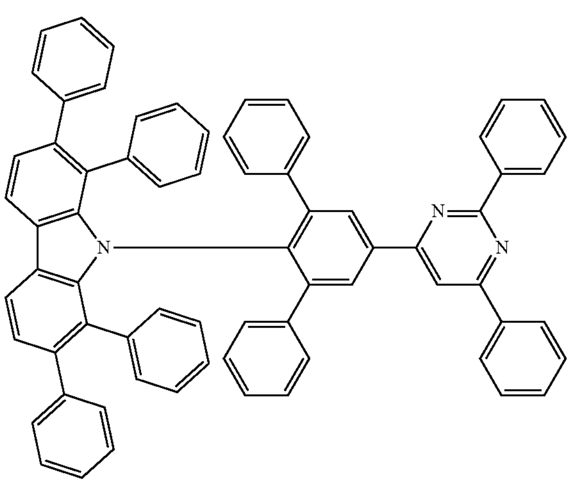

162
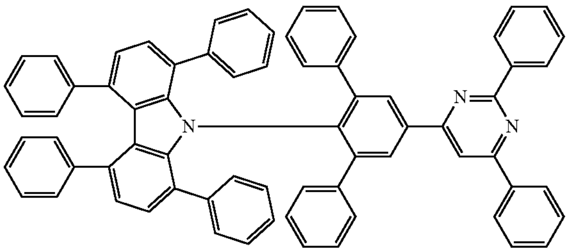
163
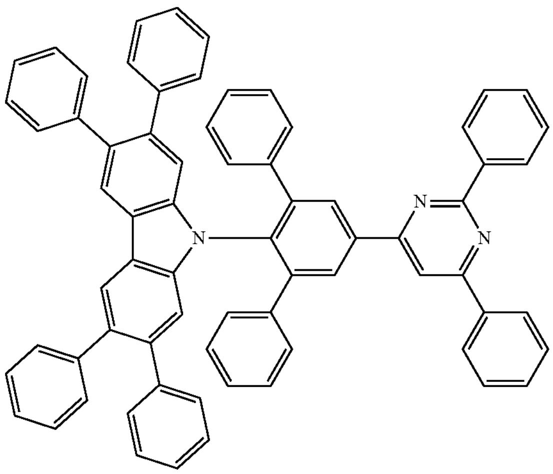
164
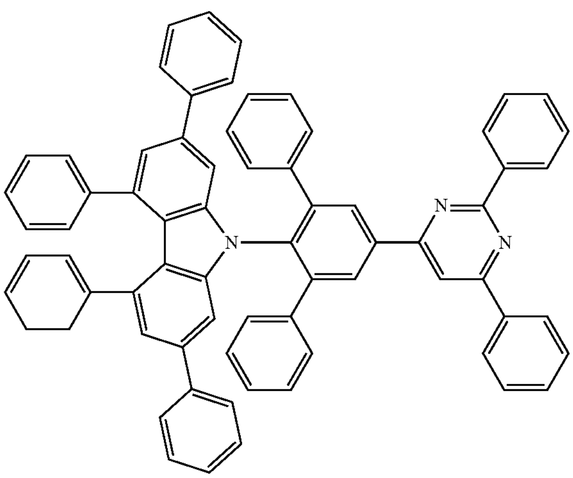
165
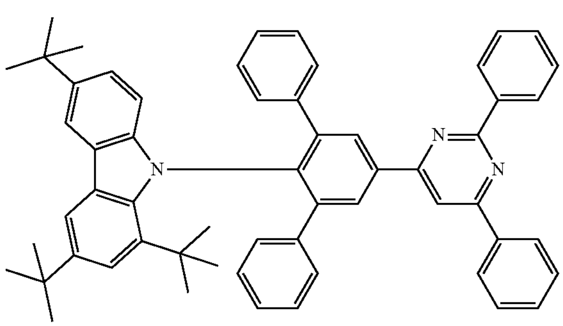
166
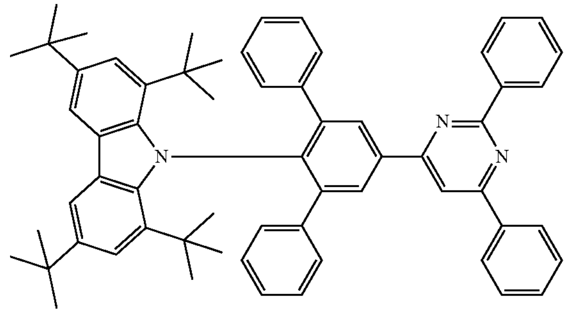
167
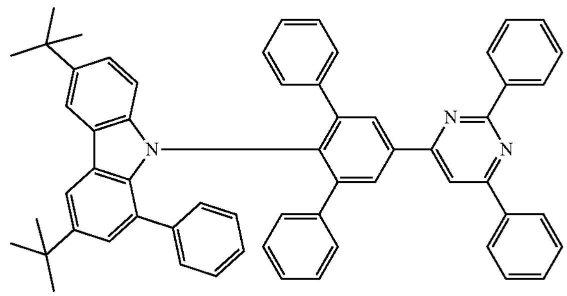
168
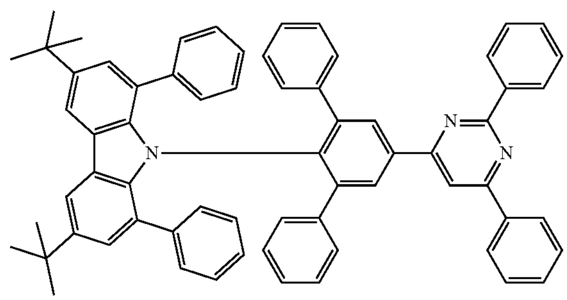
169
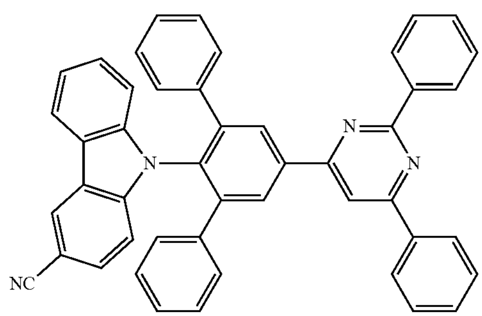
170
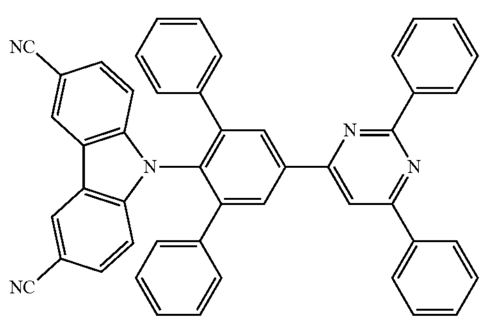

-continued
171
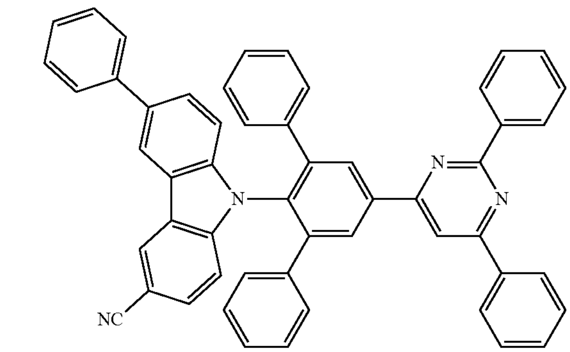
172
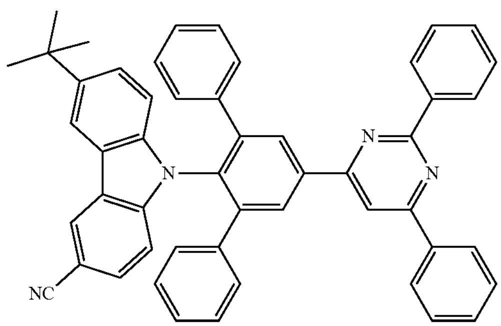
173
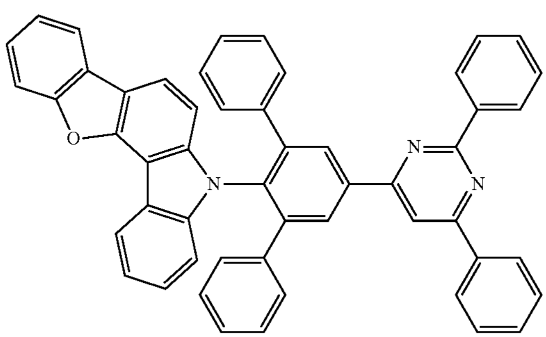
174
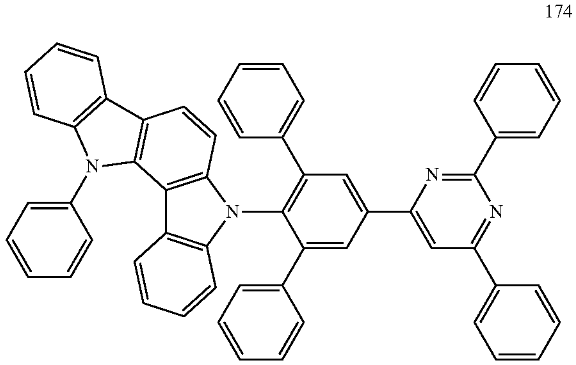
-continued
175
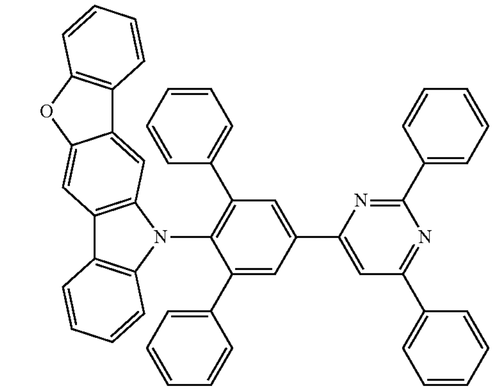
176
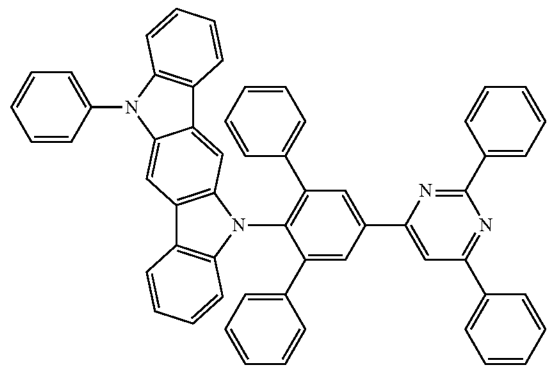
177
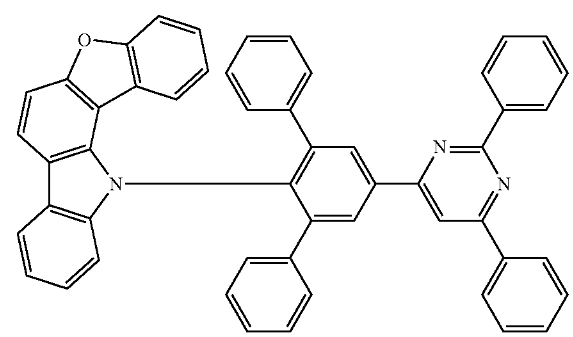
178
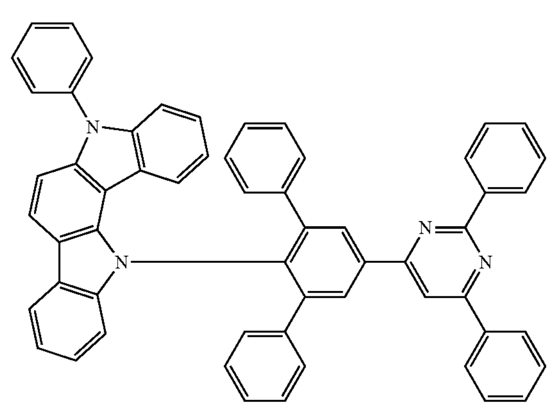

-continued
179
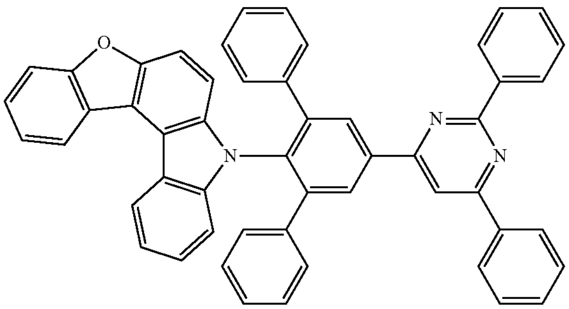
180
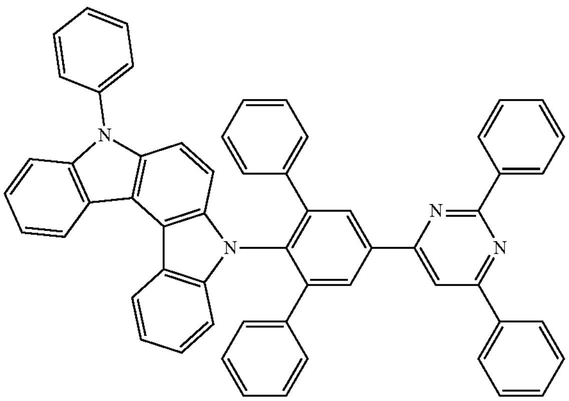
181
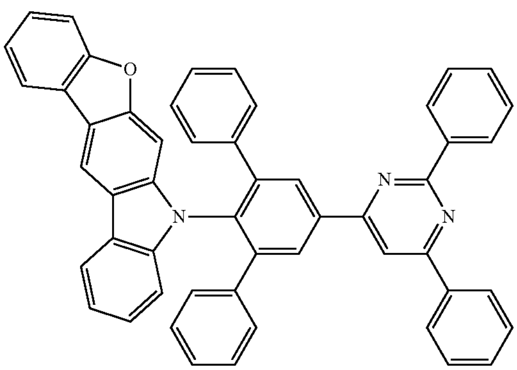
182
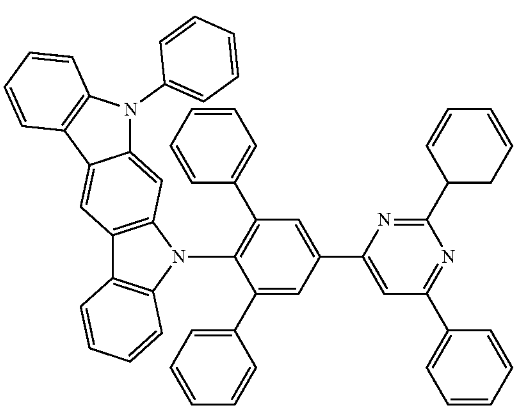
-continued
183
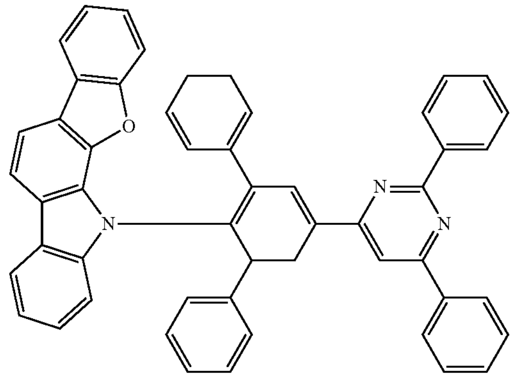
184
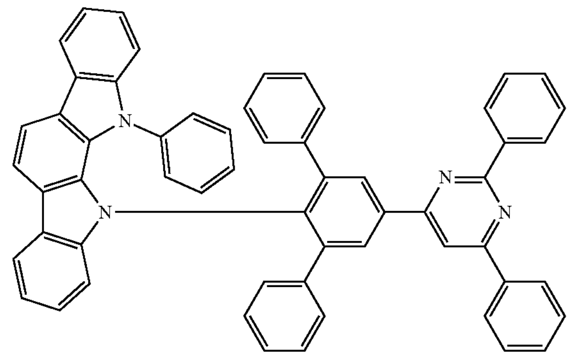
185
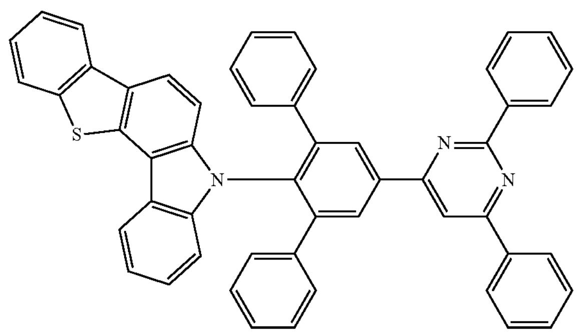
186
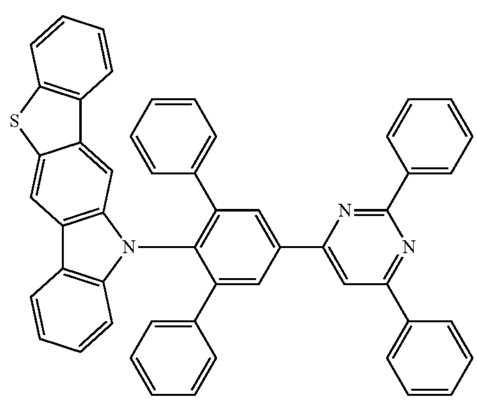

-continued
187
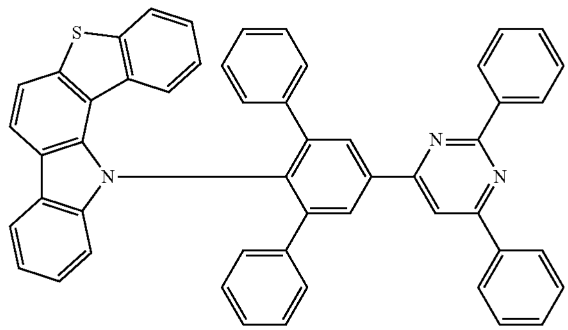
188
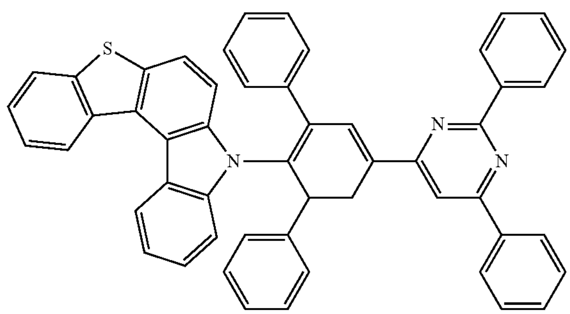
189
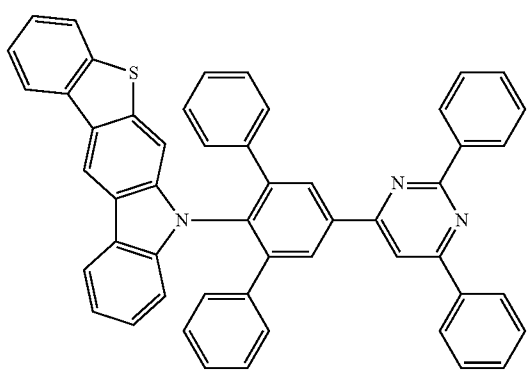
190
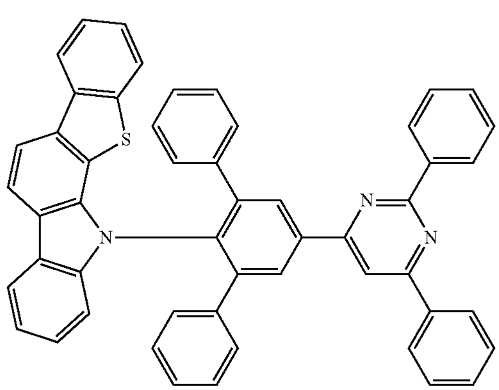
-continued
191
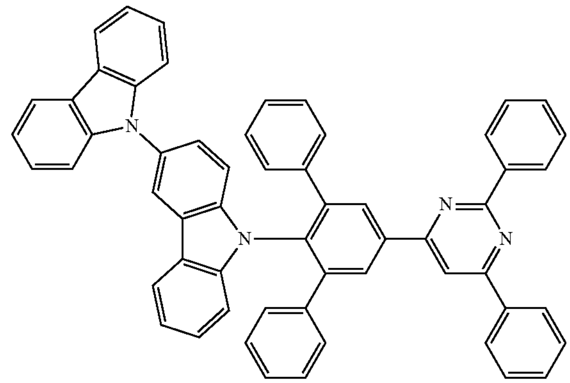
192
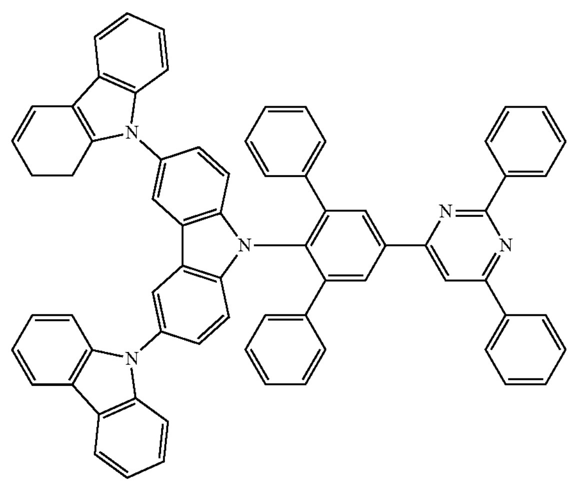
193
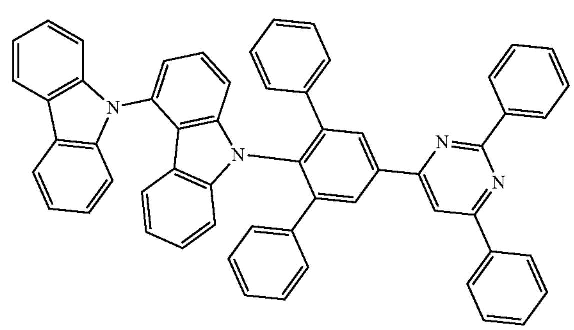

-continued
194
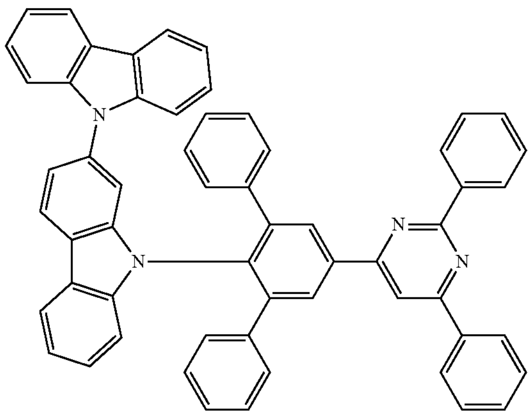
195
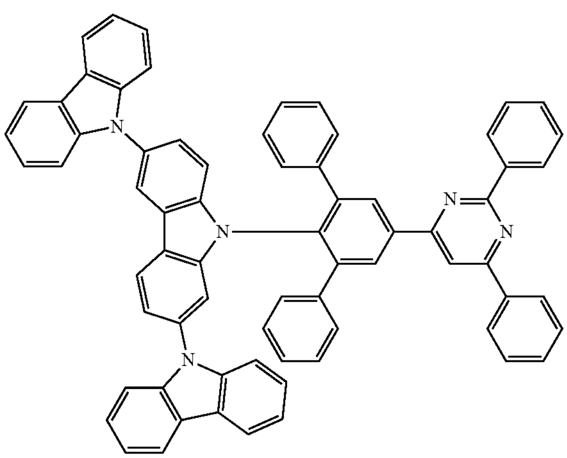
196
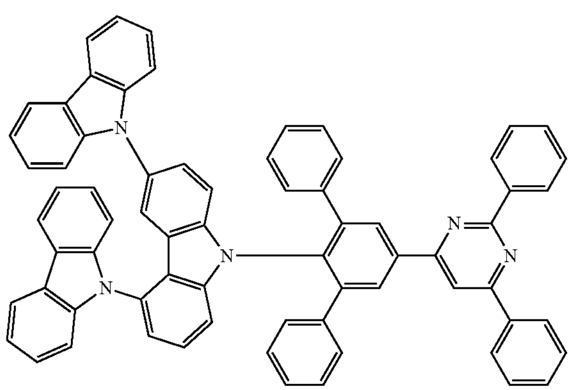
-continued
197
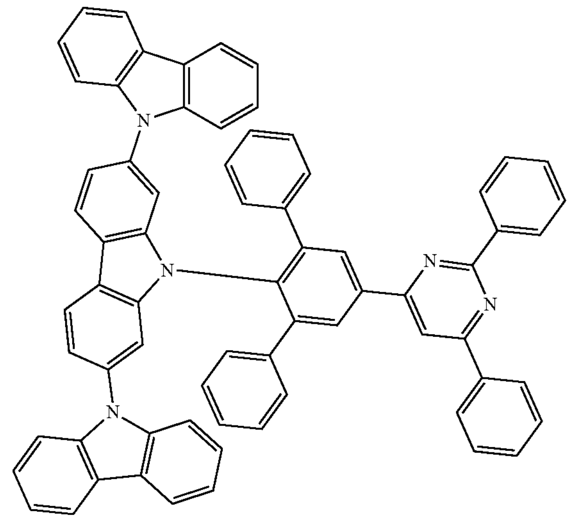
198
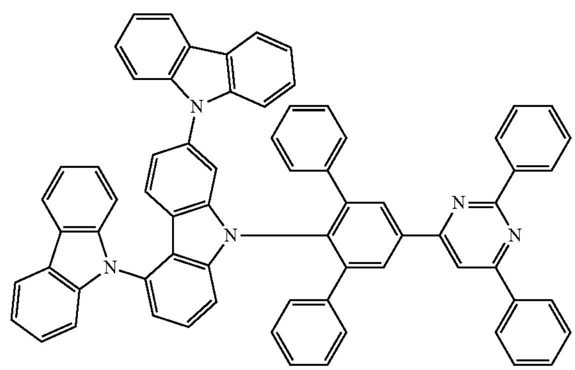
199
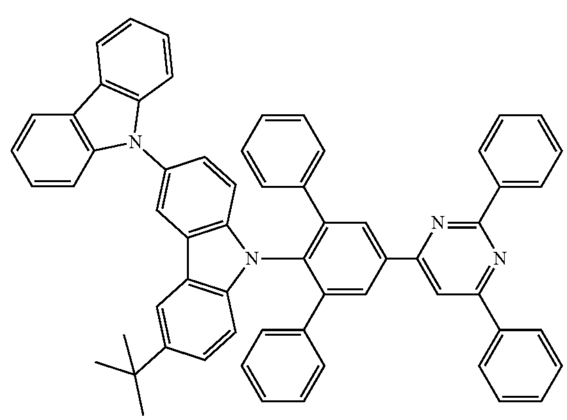

-continued
200
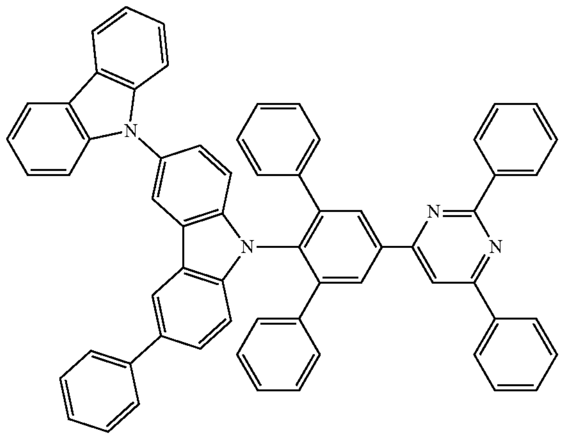
201
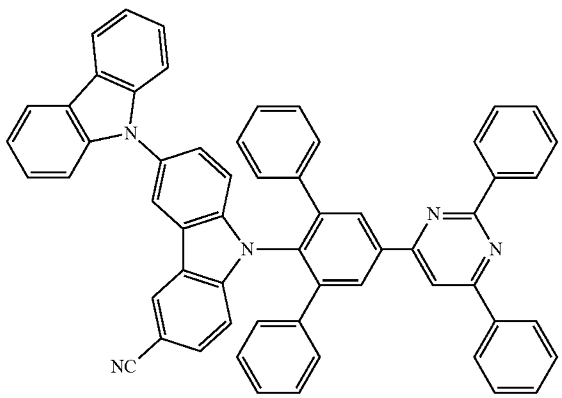
202
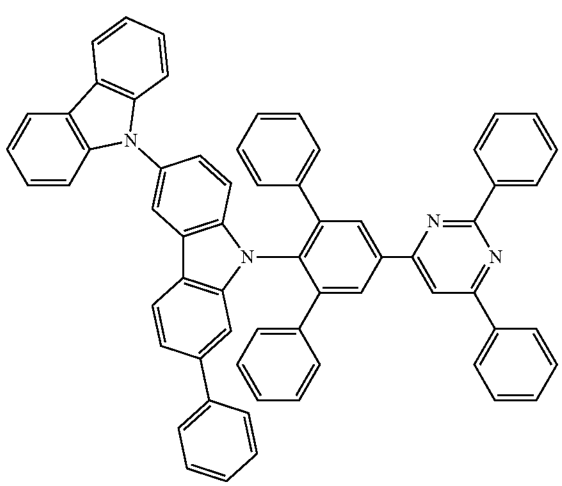
-continued
203
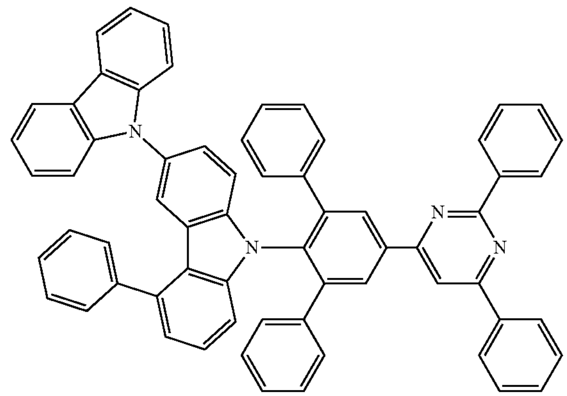
204
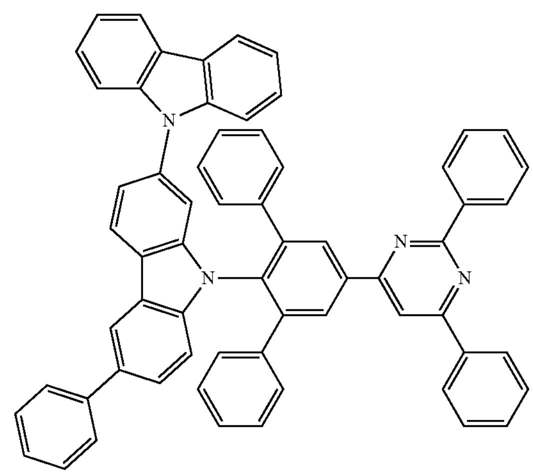
205
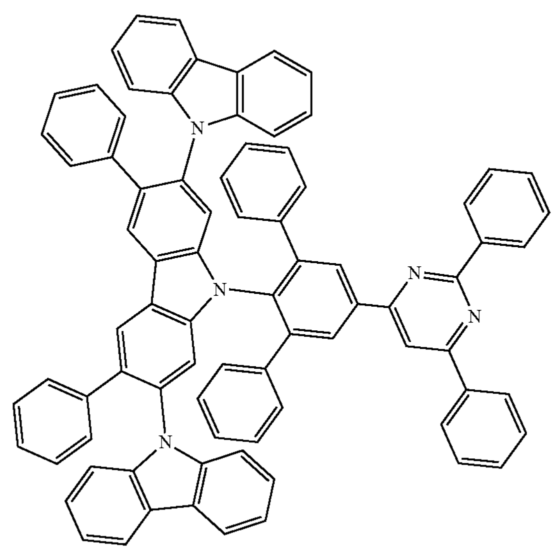

-continued
206
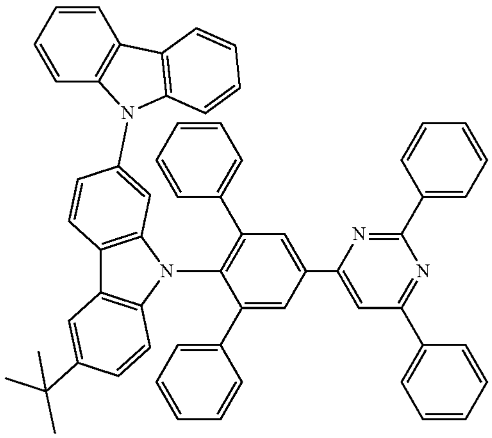
207
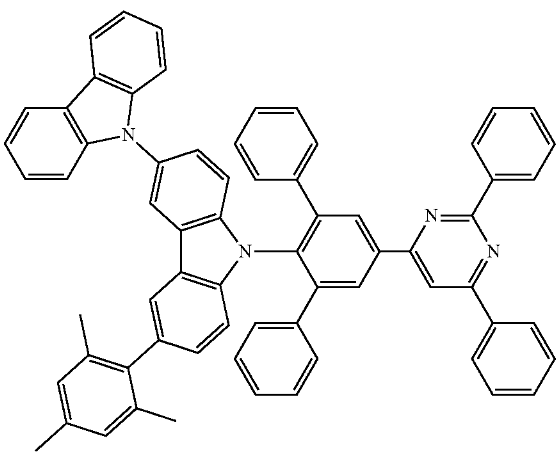
208
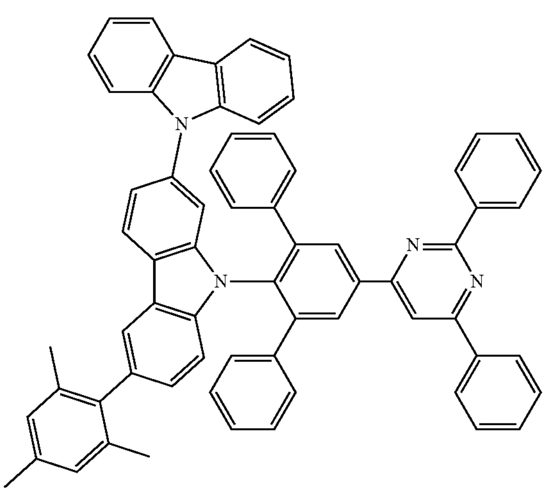
-continued
209
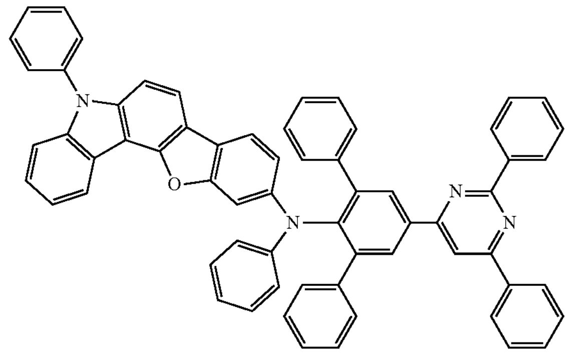
210
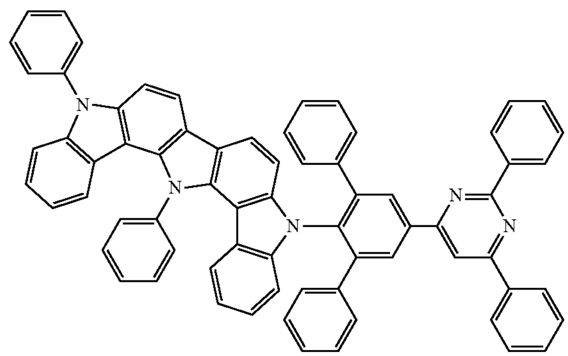
211
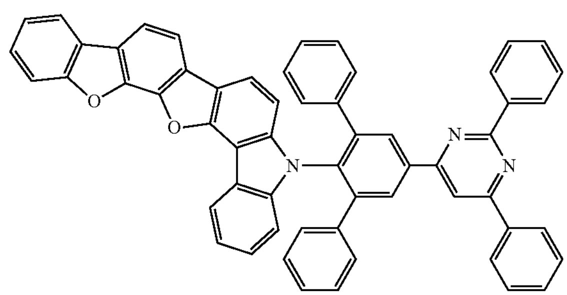
212
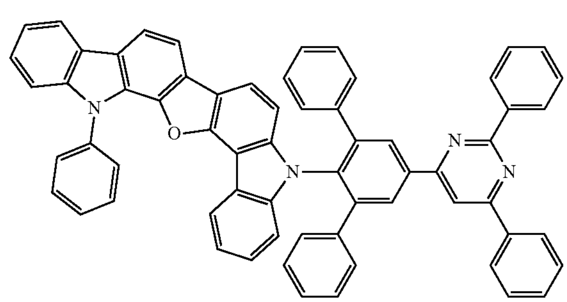

213
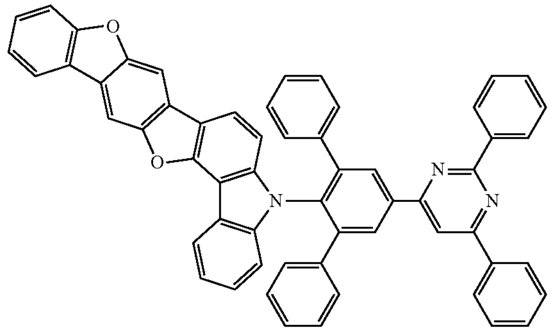
214
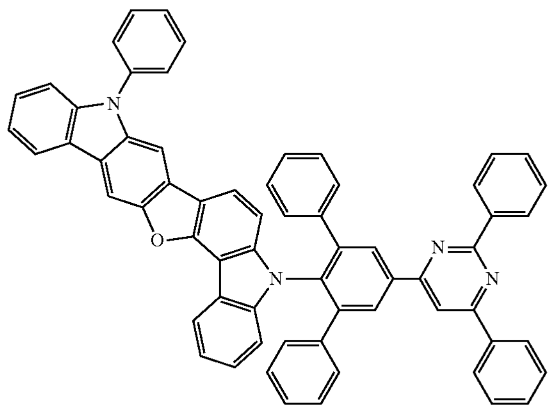
215
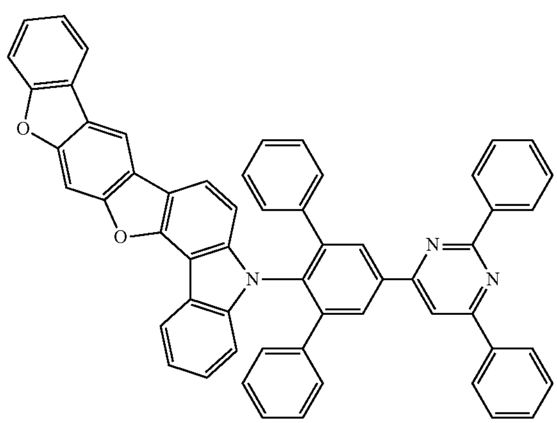
216
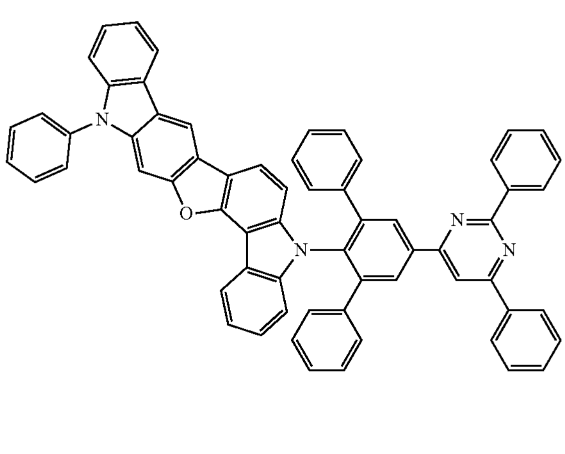
217
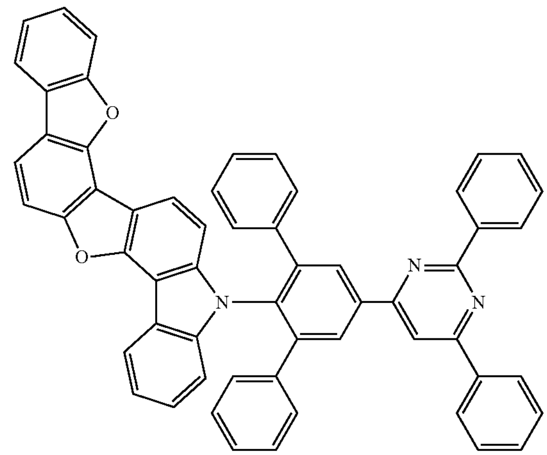
218
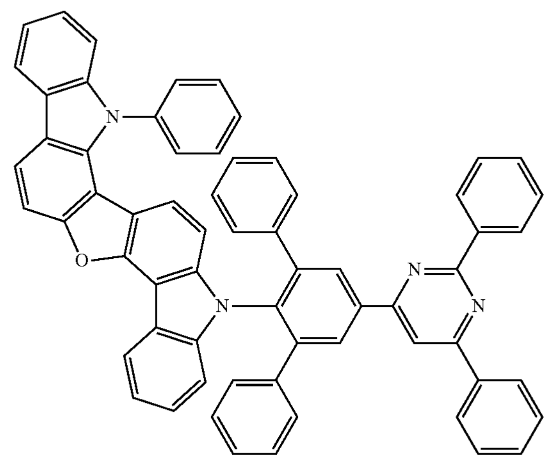
219
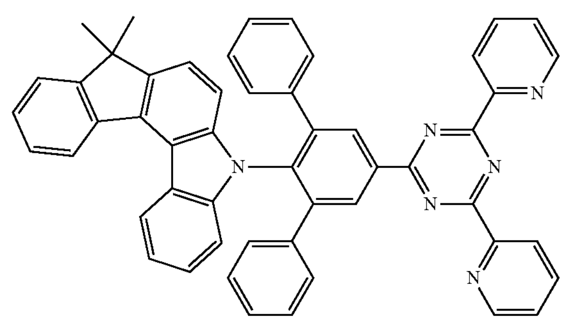
220
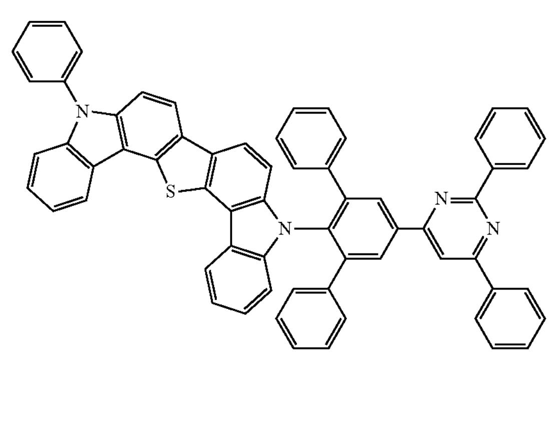

-continued
221
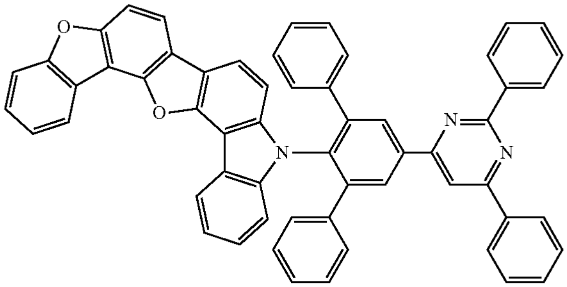
222
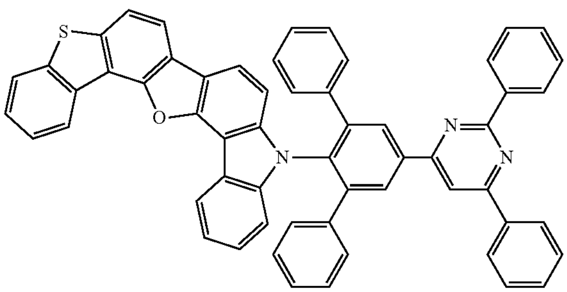
223
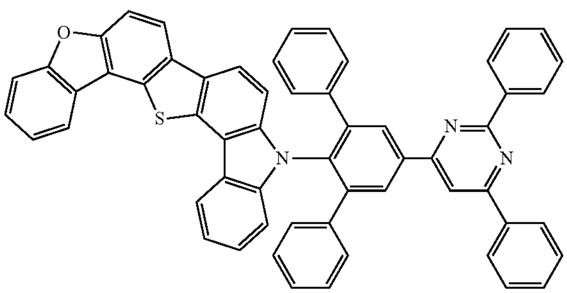
224
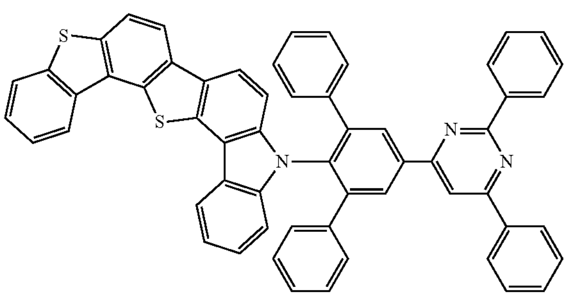
225
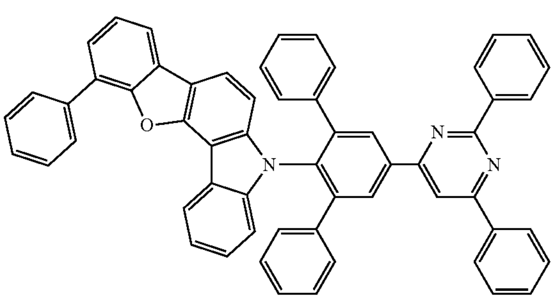
-continued
226
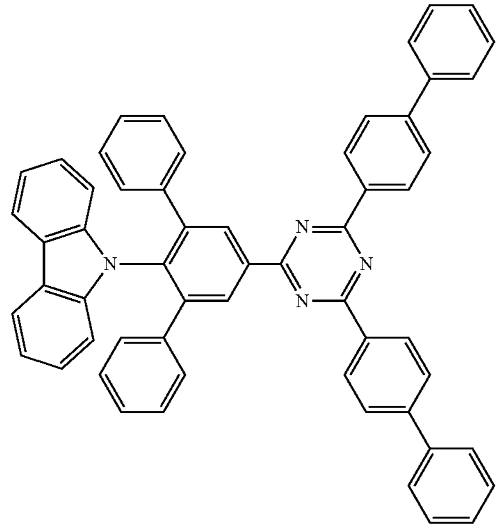
227
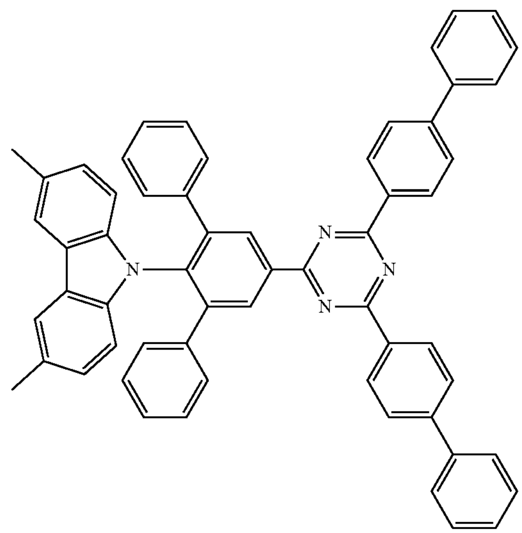
228
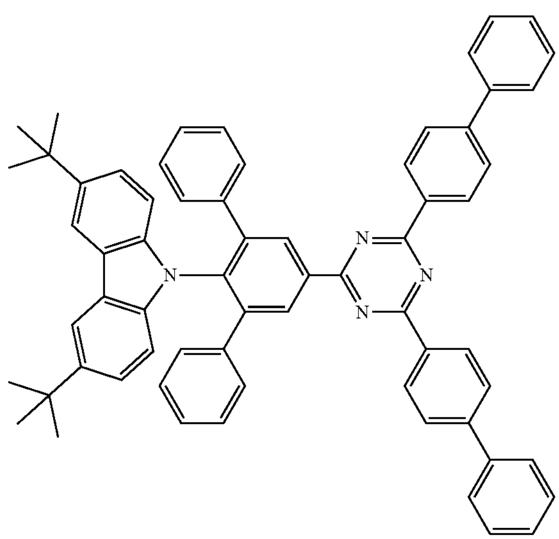

-continued
229
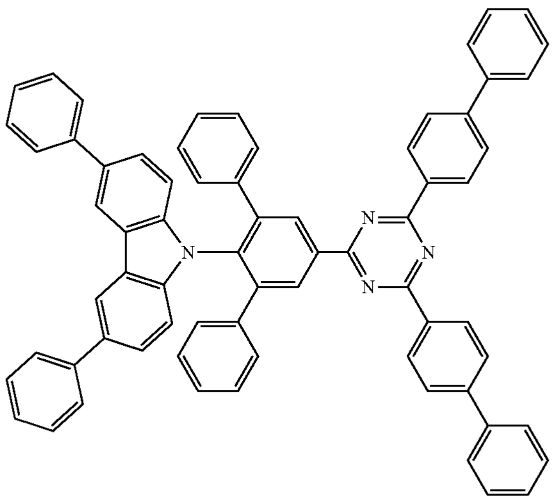
230
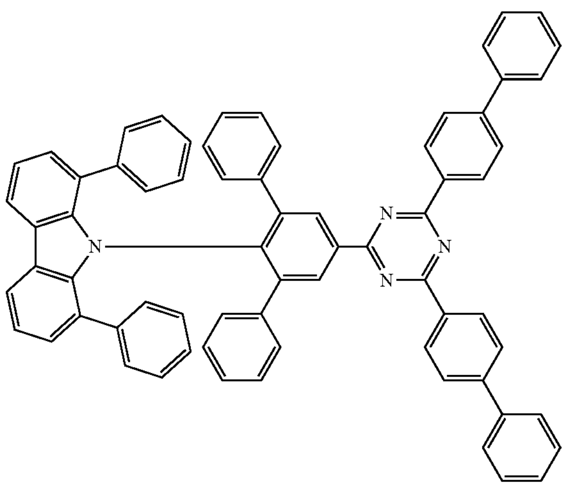
231
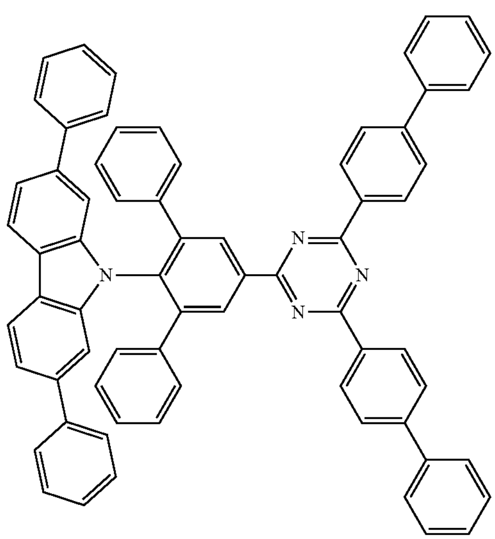
-continued
232
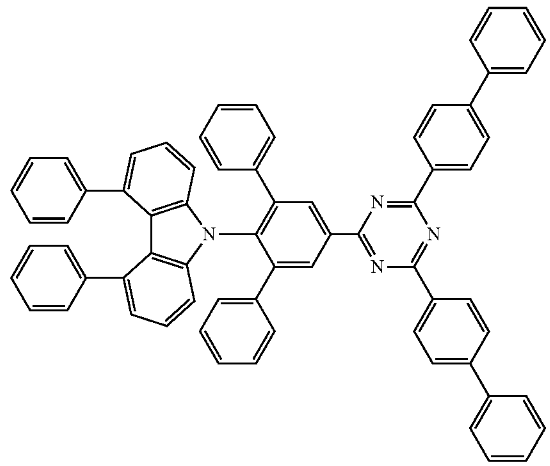
233
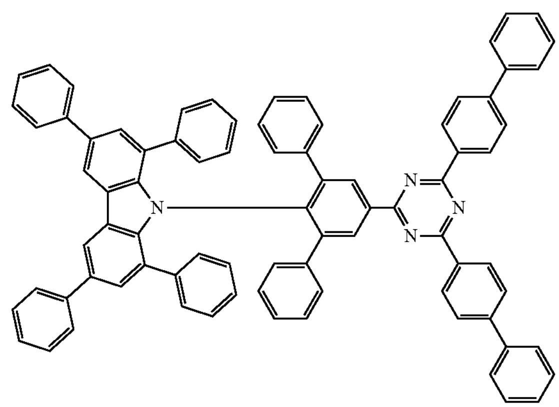
234
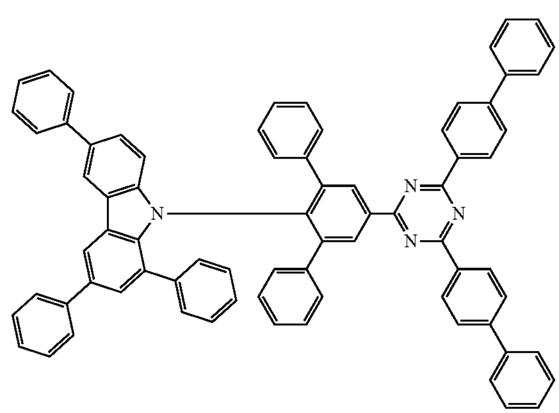

-continued
235
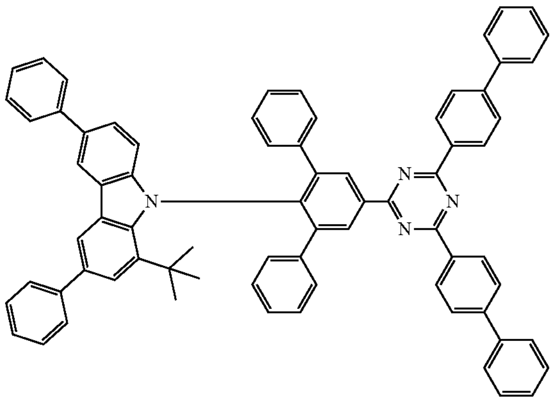
236
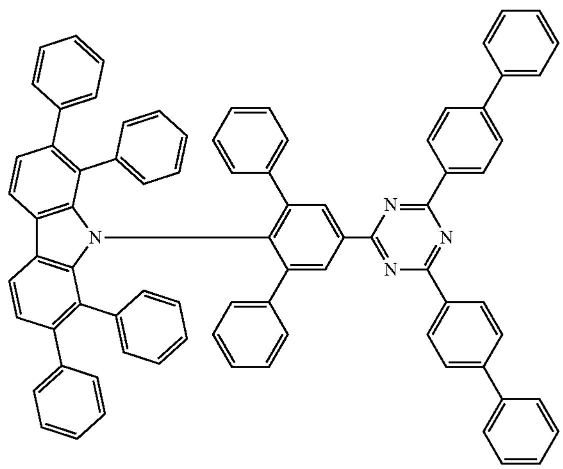
237
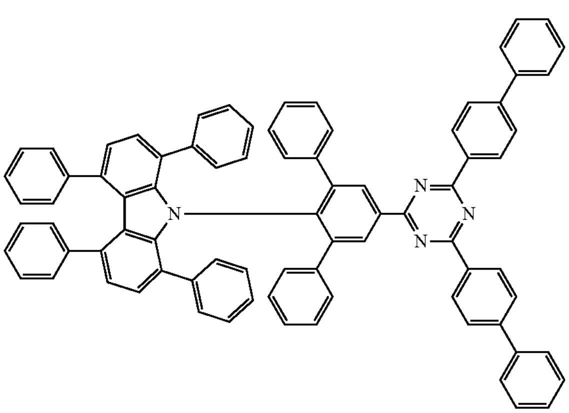
-continued
238
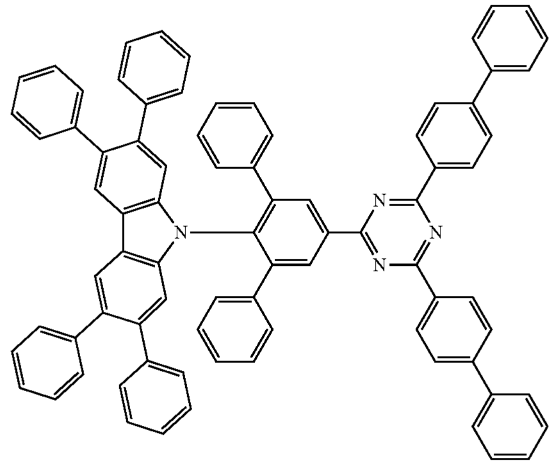
239
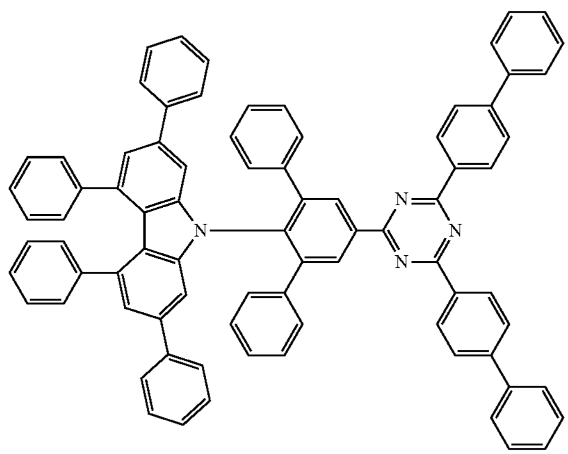
240
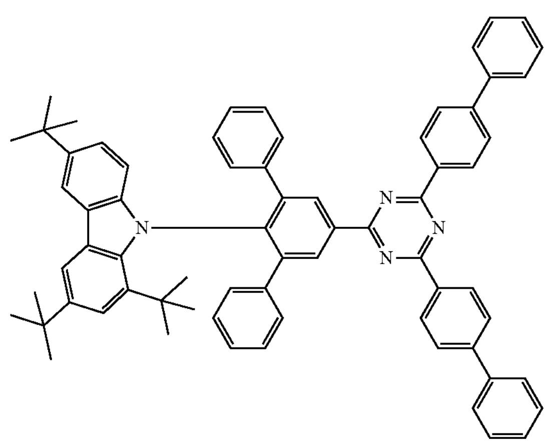

-continued
241
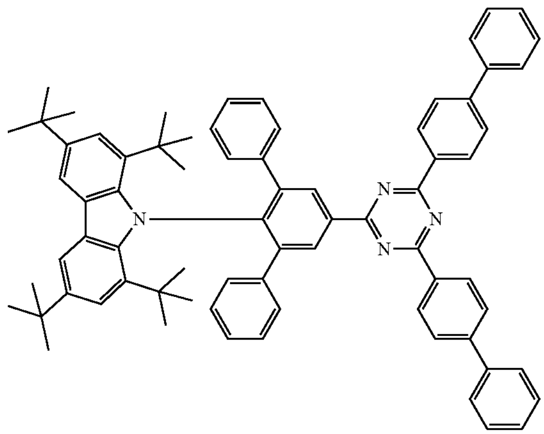
242
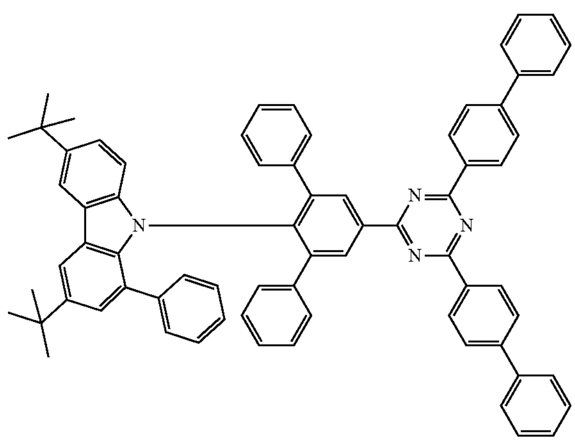
243
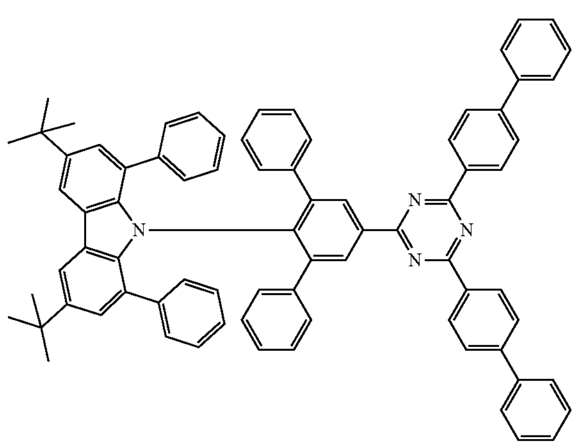
-continued
244
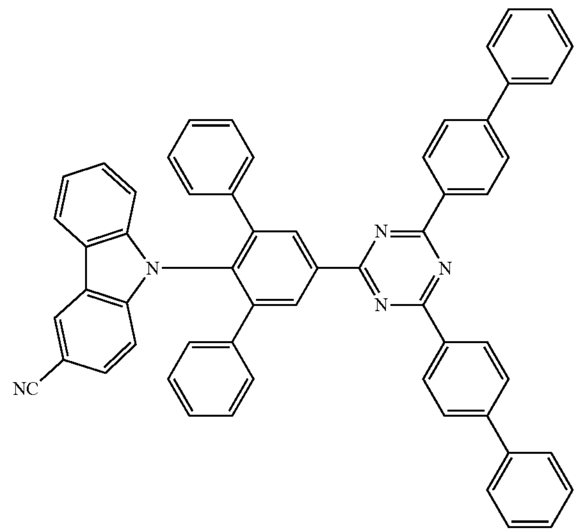
245
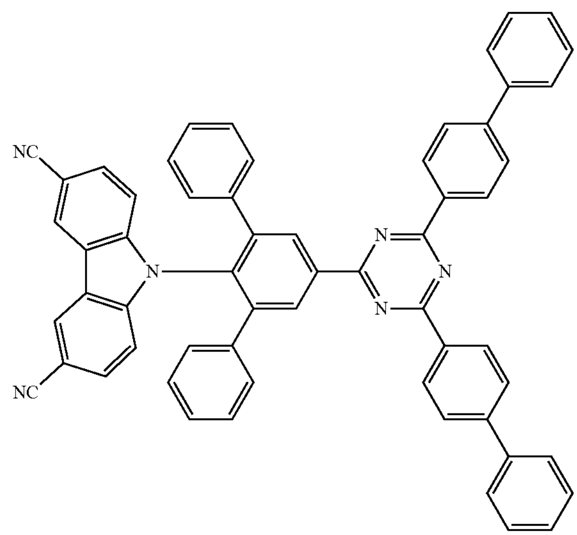
246
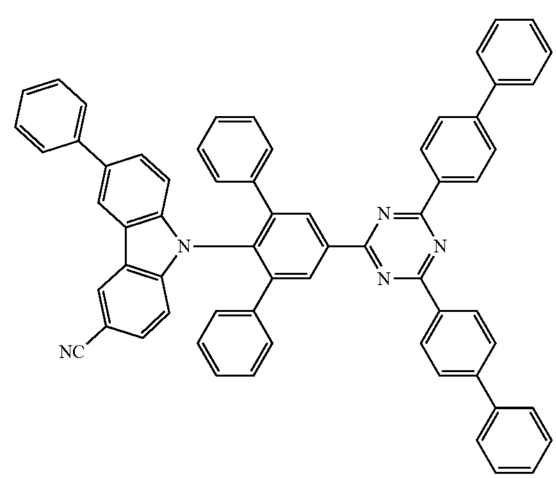

-continued
247
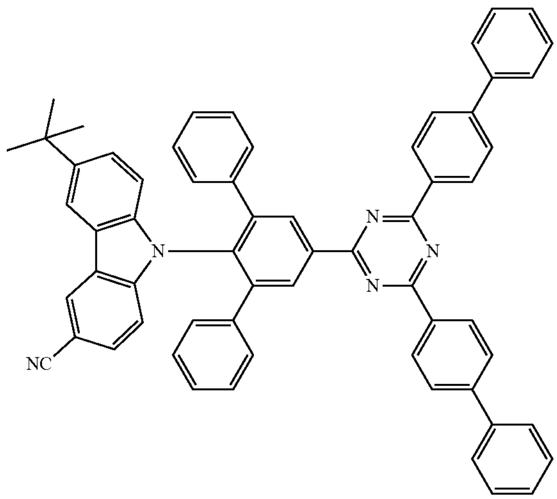
248
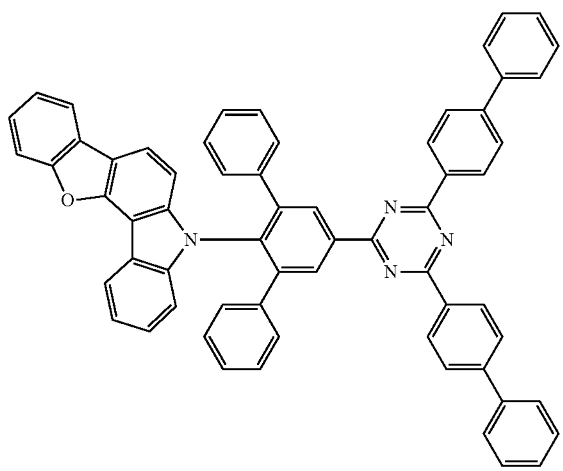
249
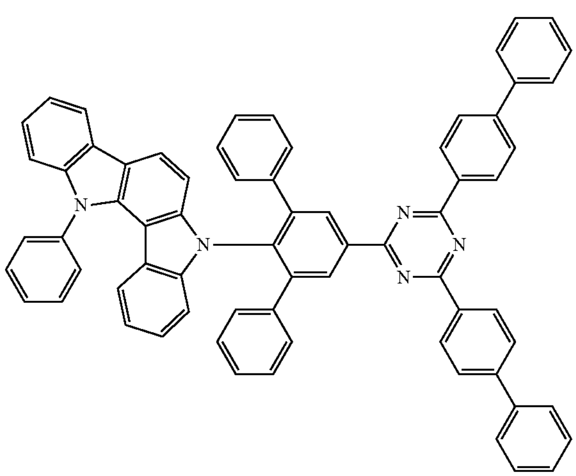
-continued
250
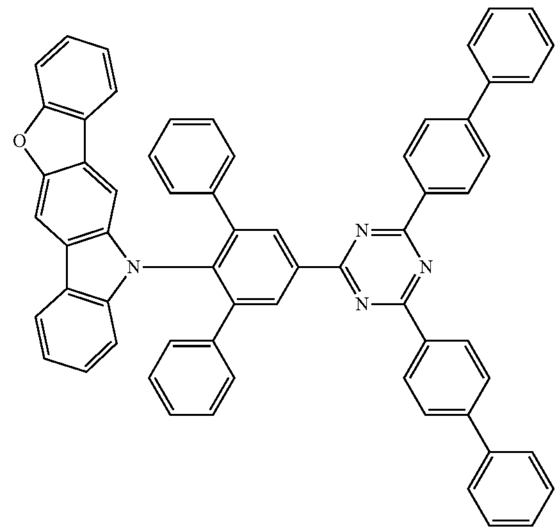
251
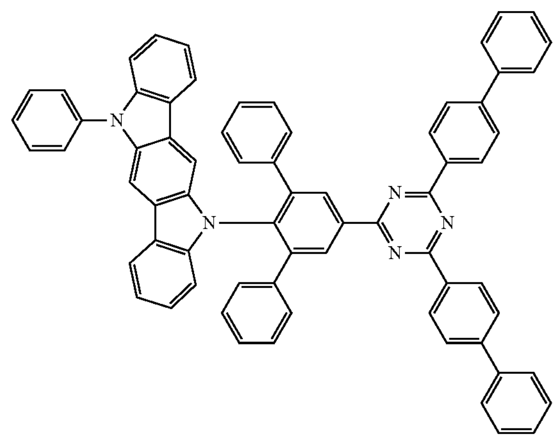
252
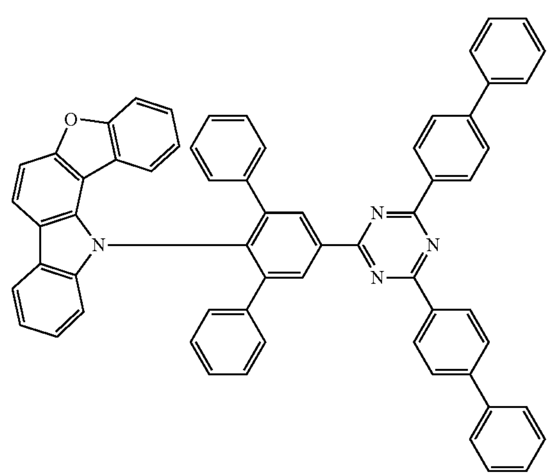

-continued
253
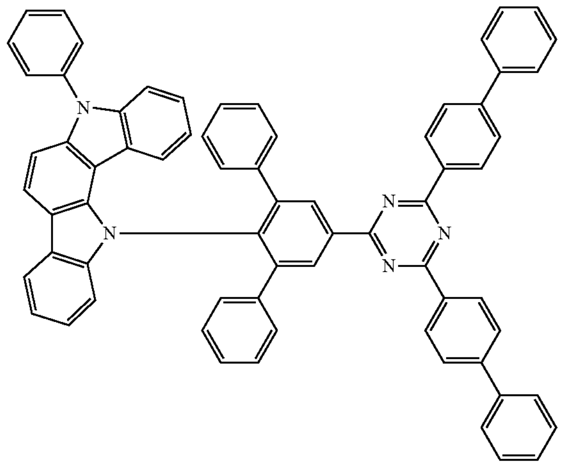
254
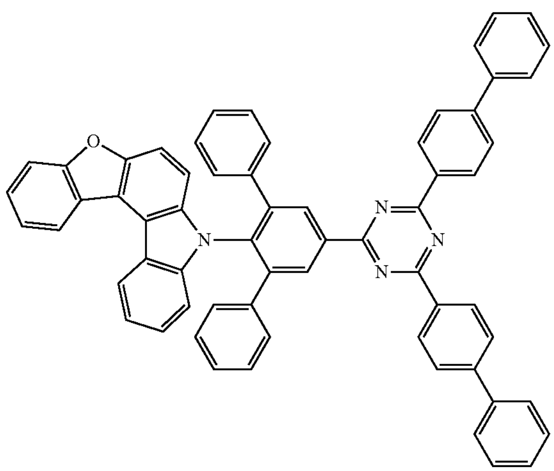
255
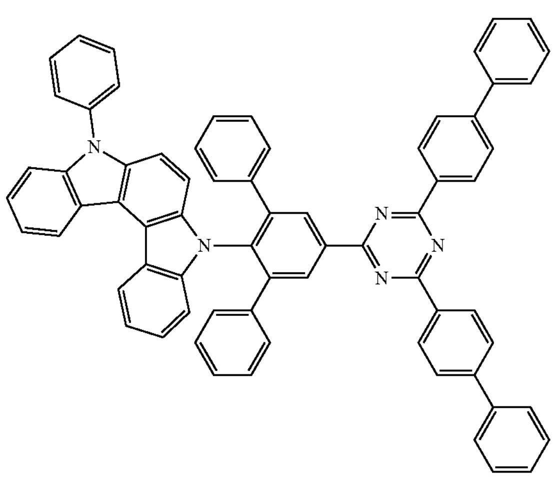
-continued
256
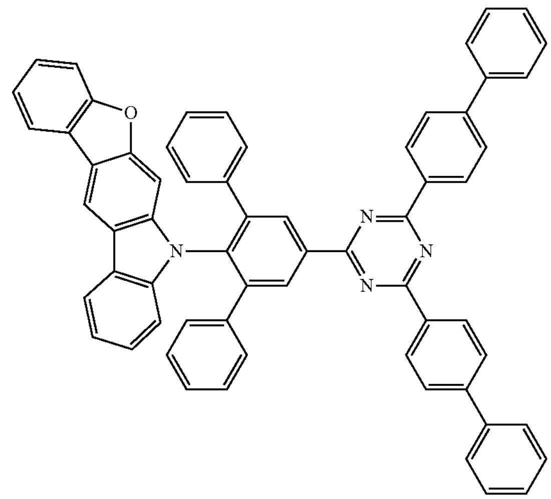
257
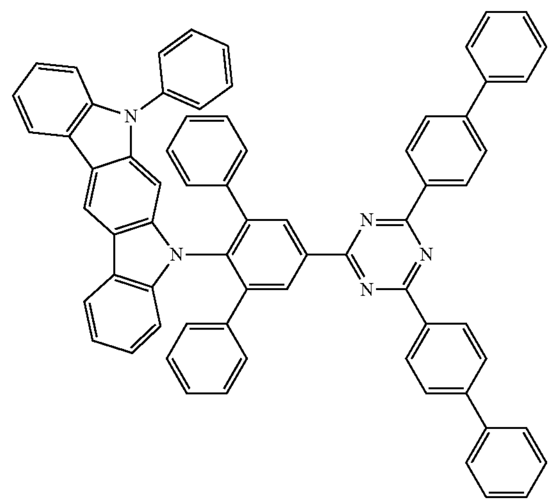
258
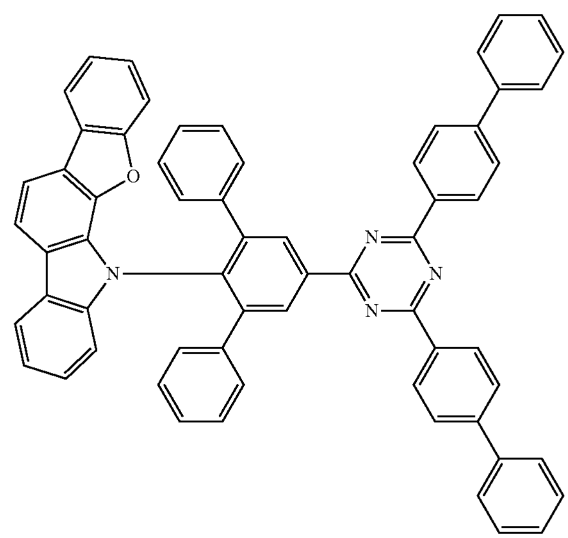

259
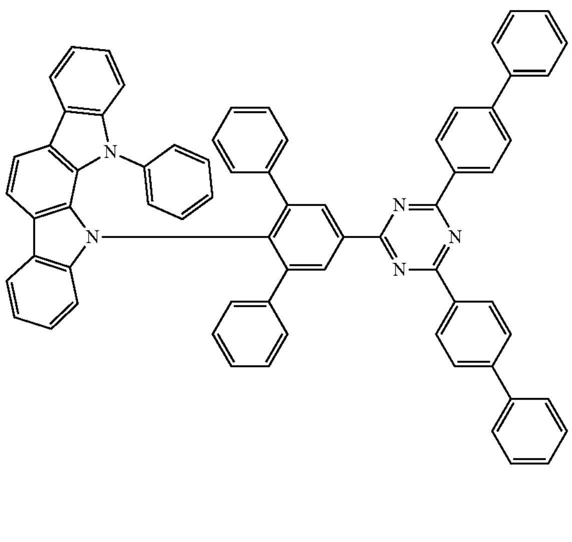
260
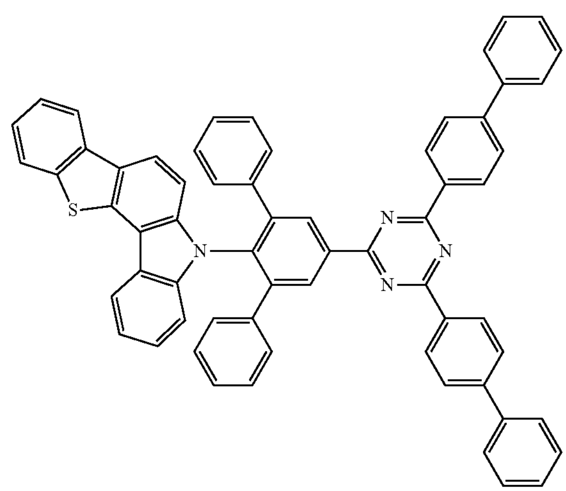
261
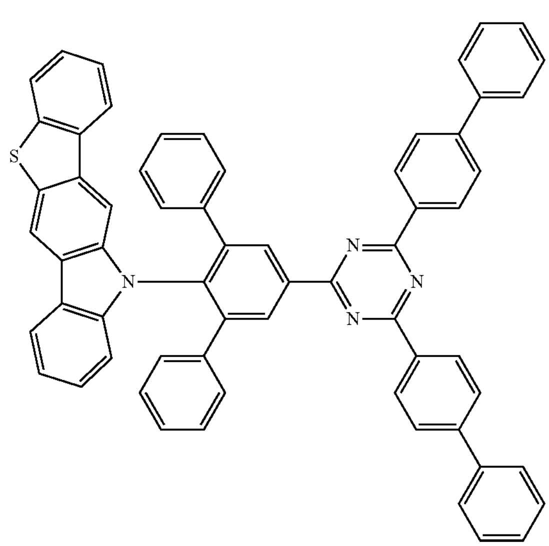
262
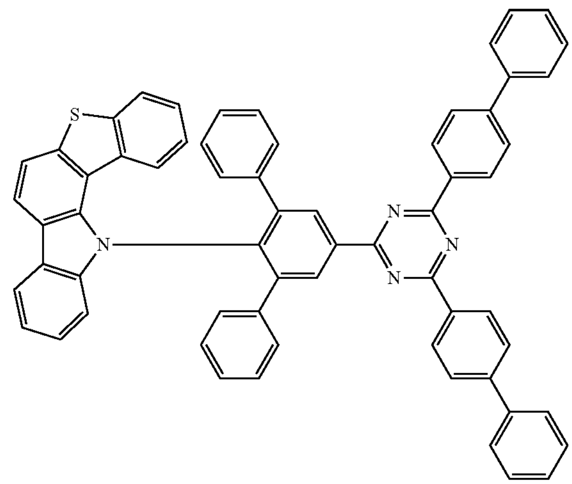
263
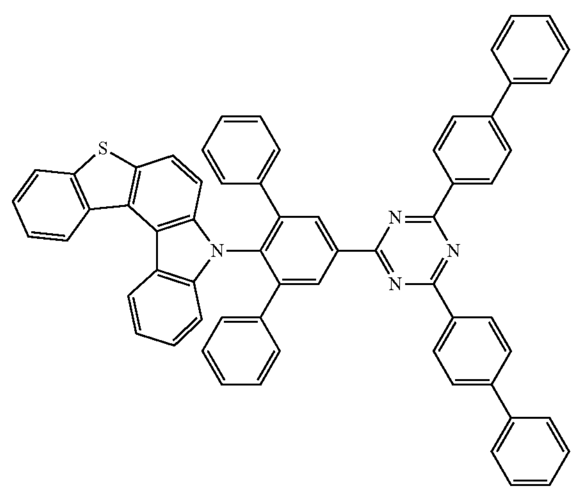
264
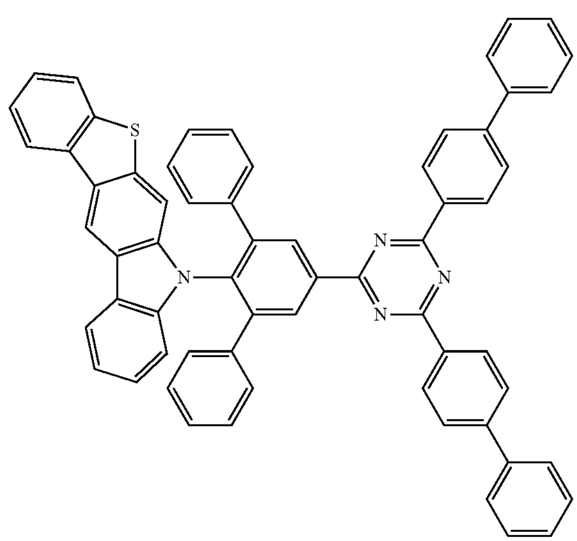

-continued
265
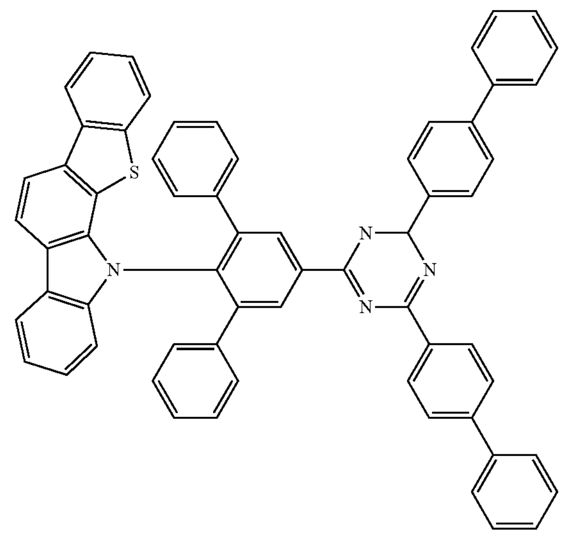
266
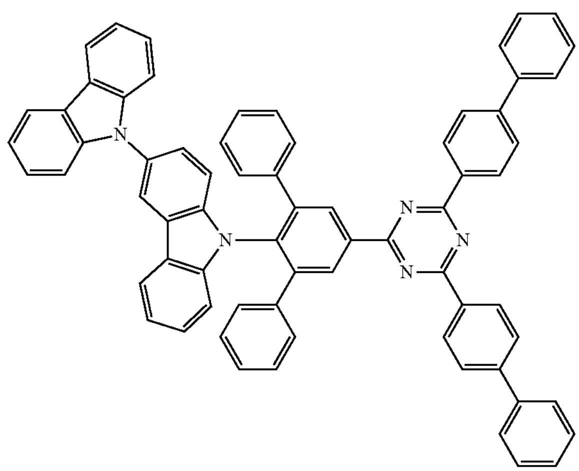
267
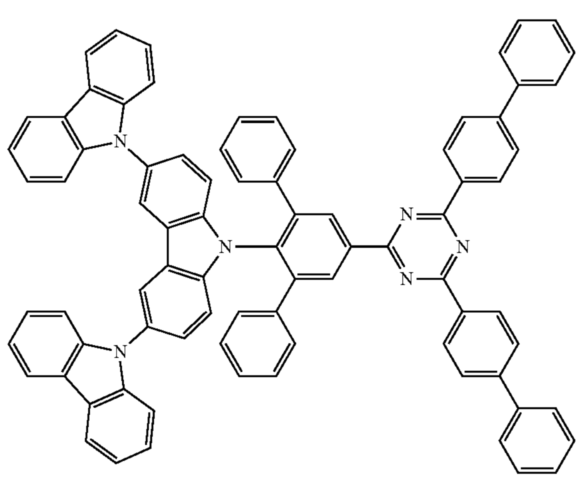
-continued
268
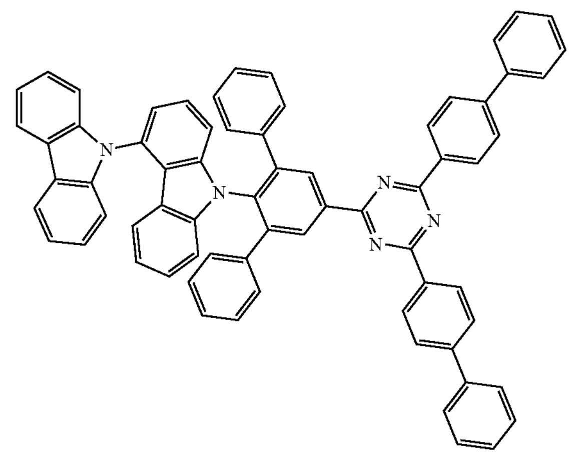
269
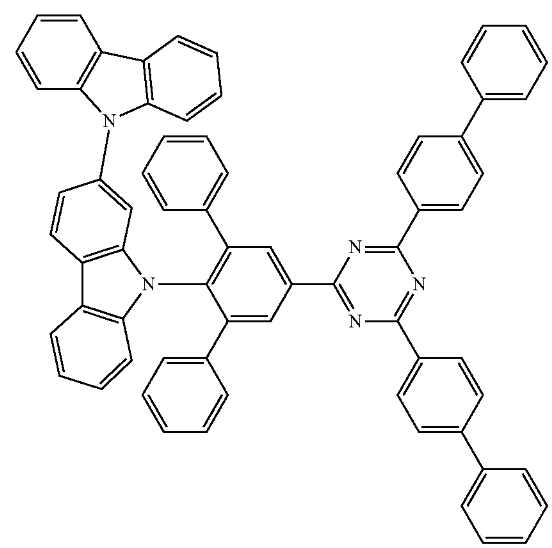
270
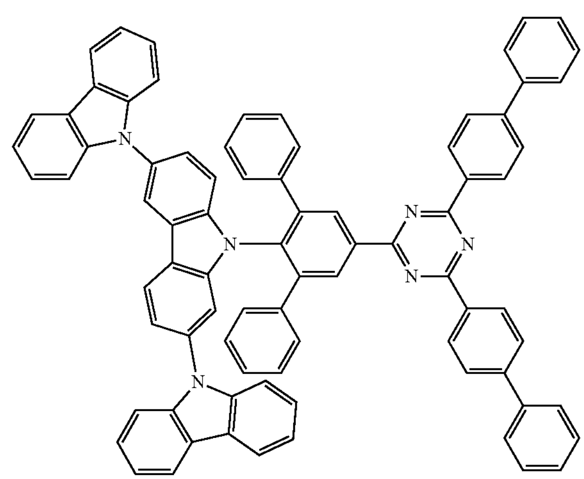

-continued
271
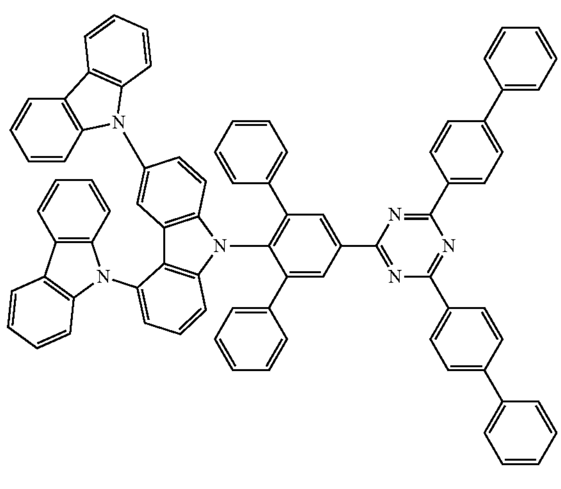
272
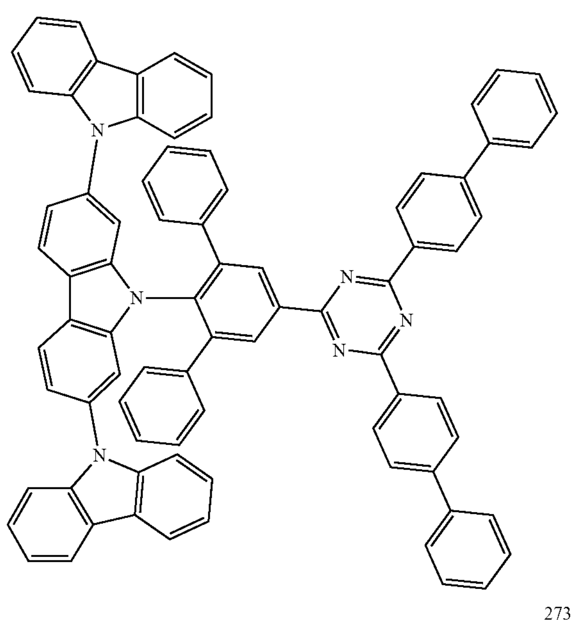
273
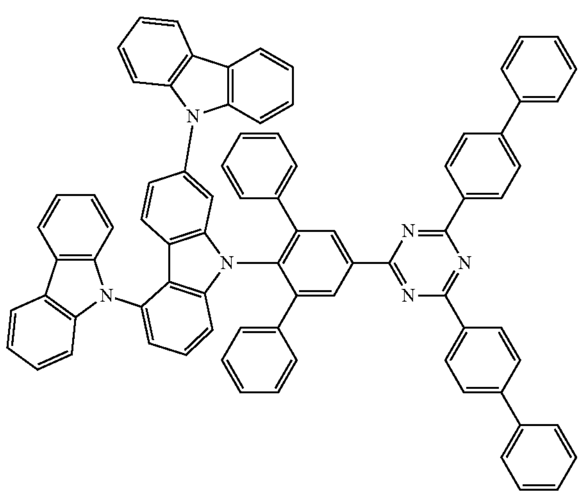
-continued
274
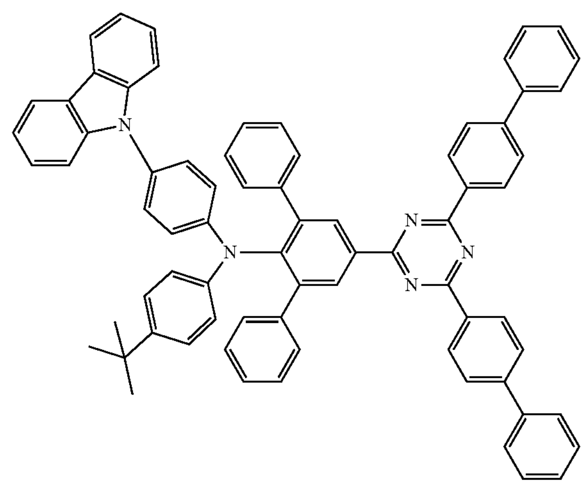
275
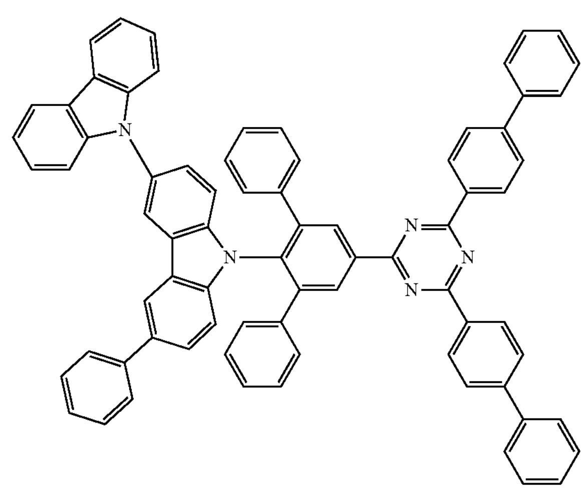
276
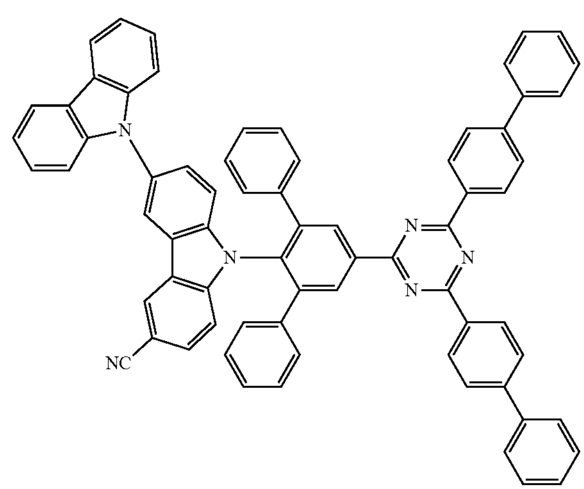

-continued
277
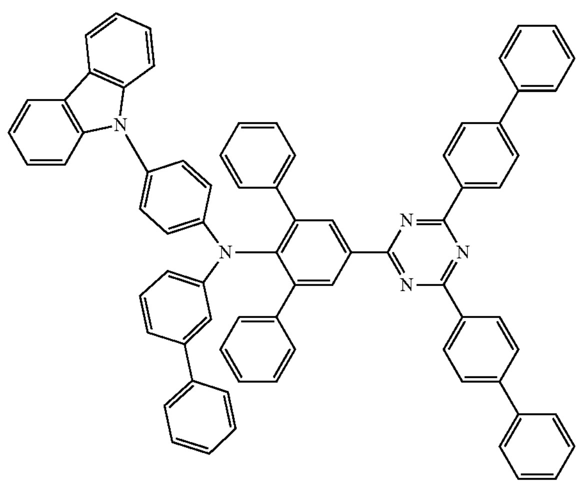
278
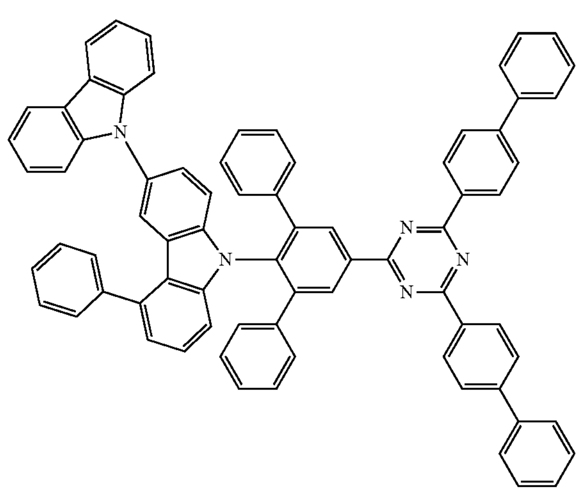
279
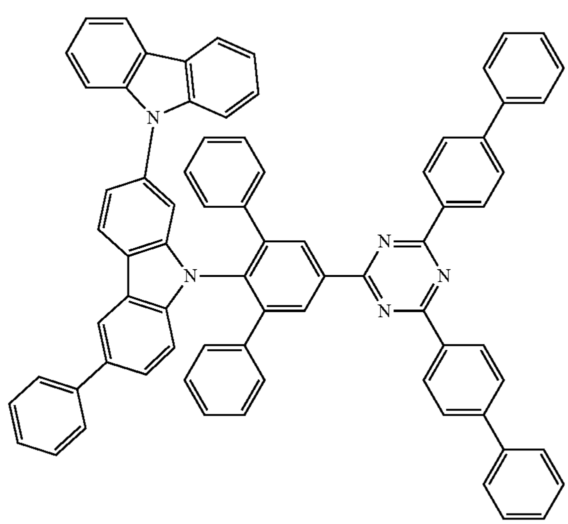
-continued
280
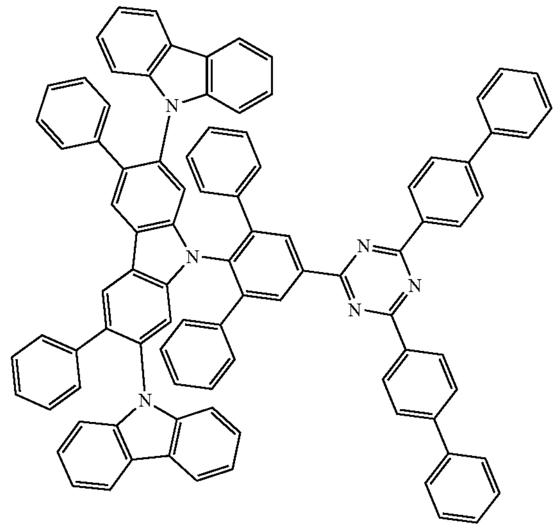
281
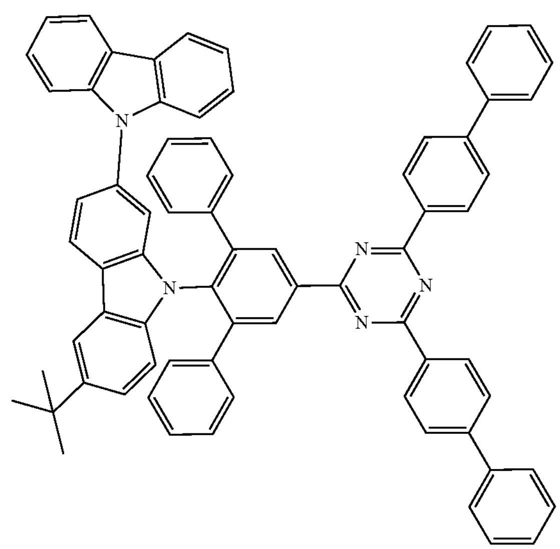
282
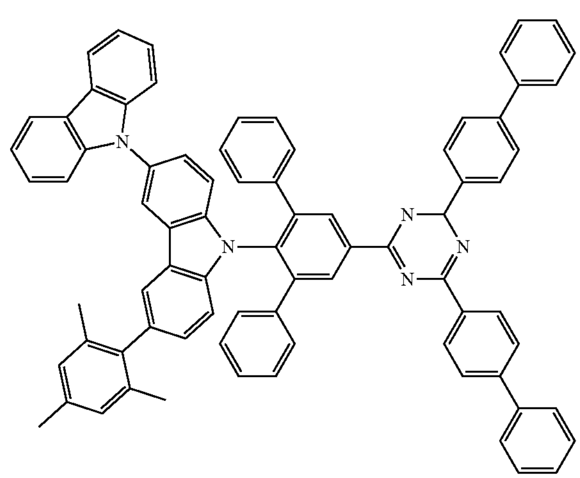

-continued
283
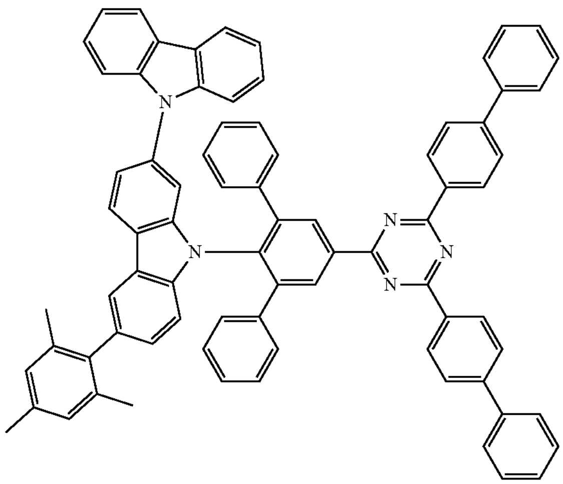
284
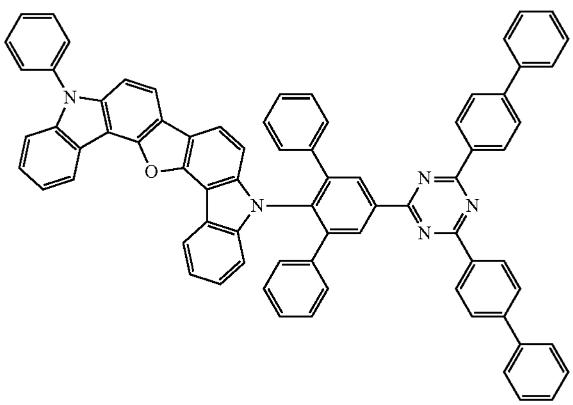
285
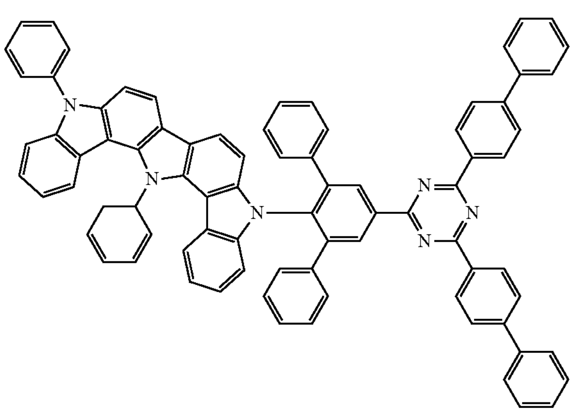
-continued
286
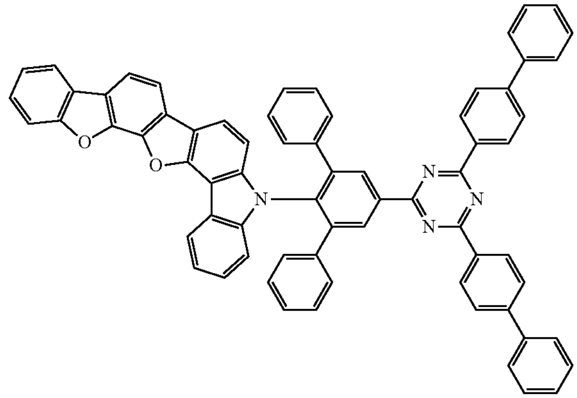
287
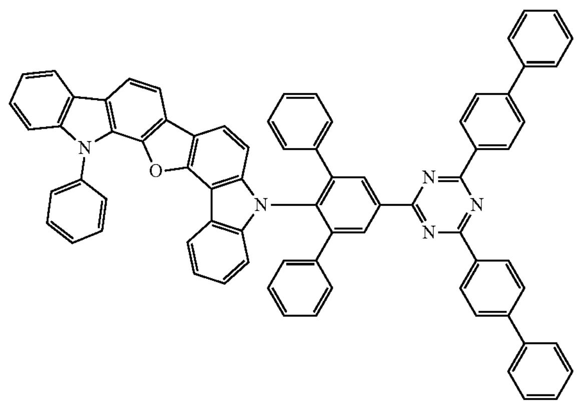
288
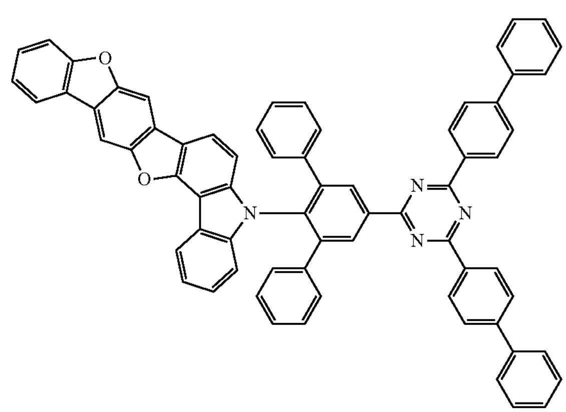

-continued
289
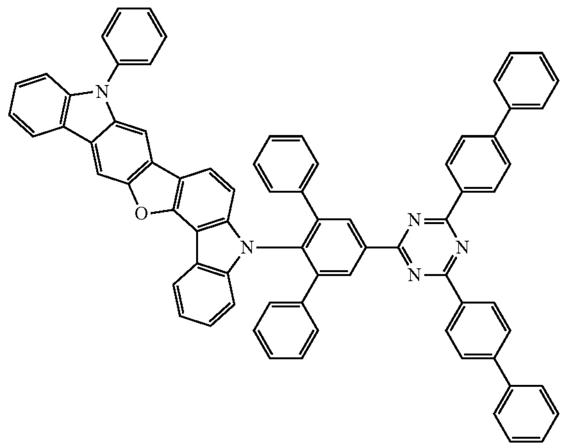
290
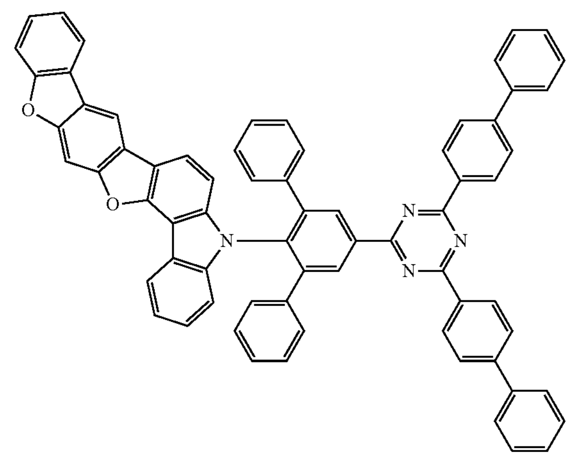
291
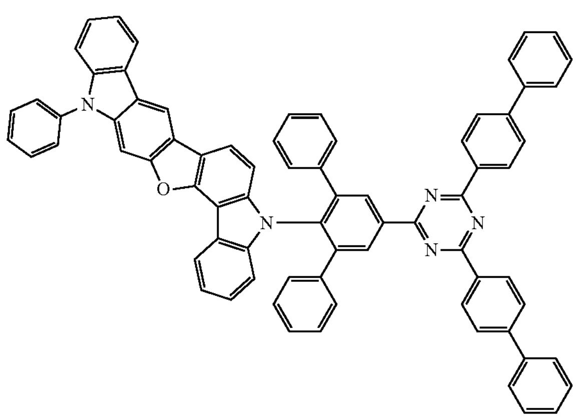
-continued
292
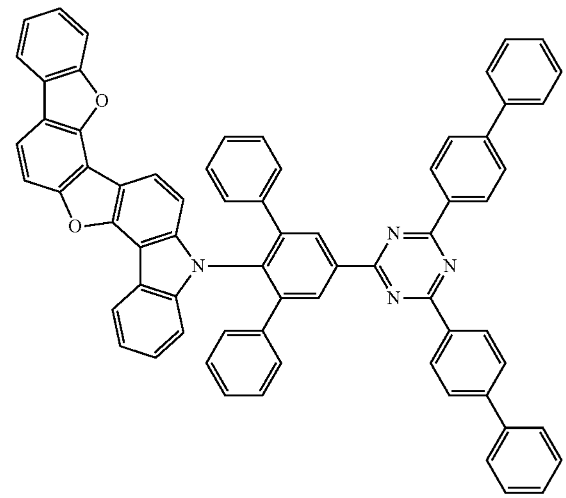
293
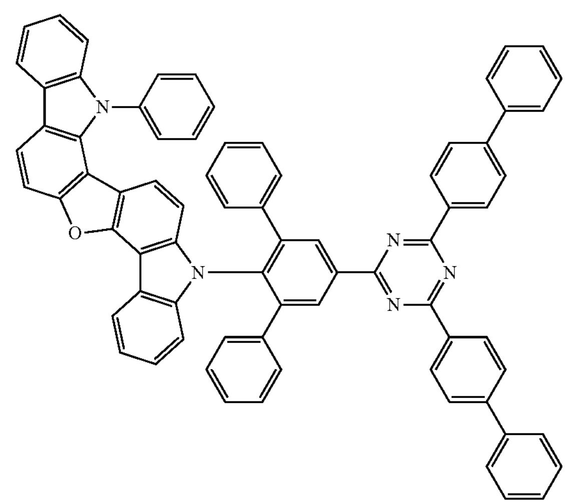
294
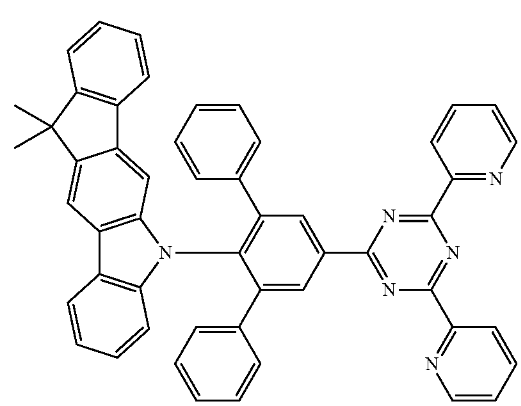

-continued
295
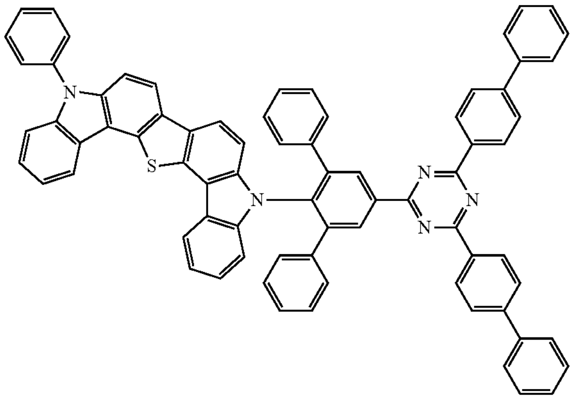
296
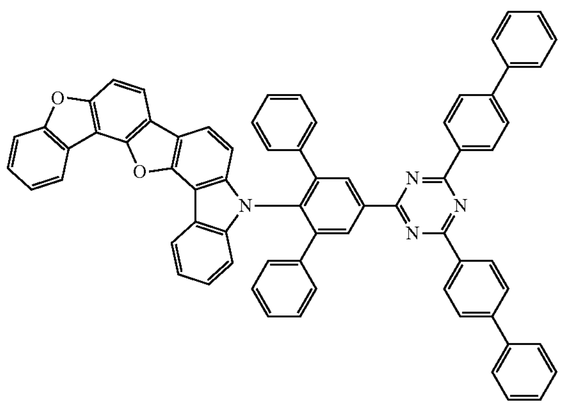
297
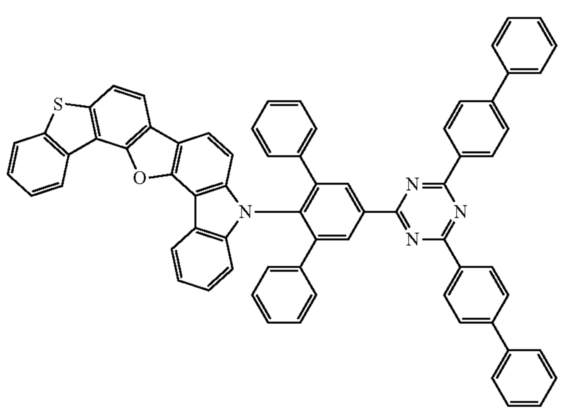
-continued
298
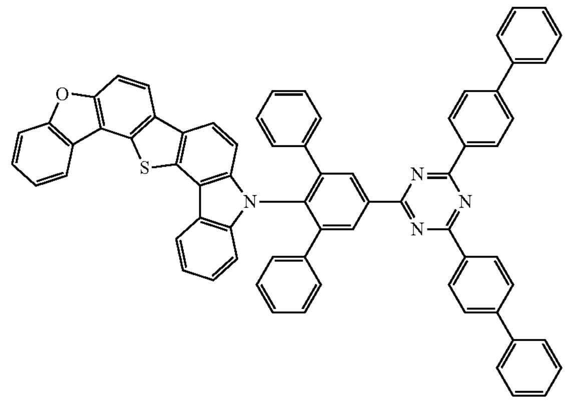
299
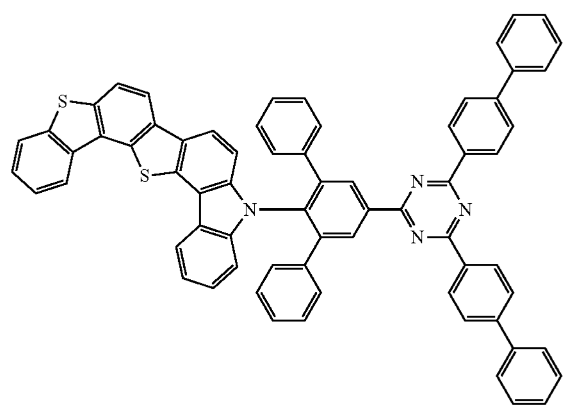
300
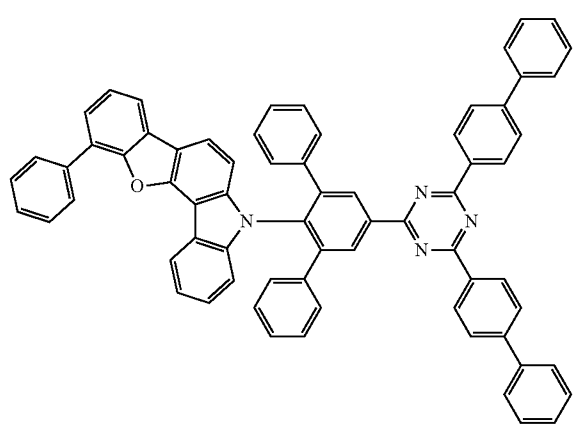

-continued
301
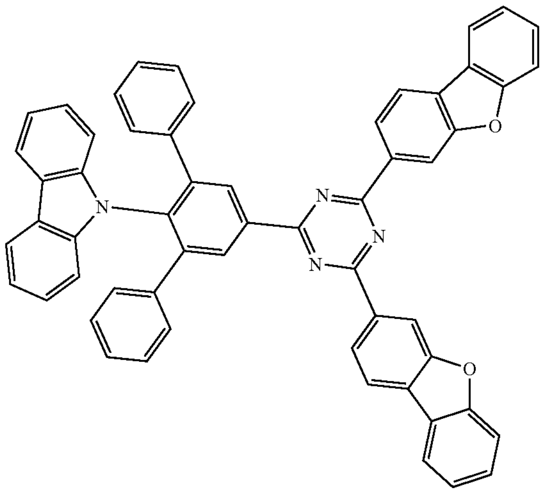
302
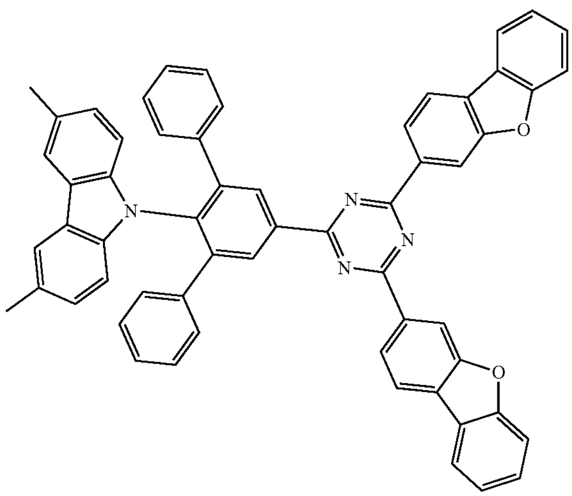
303
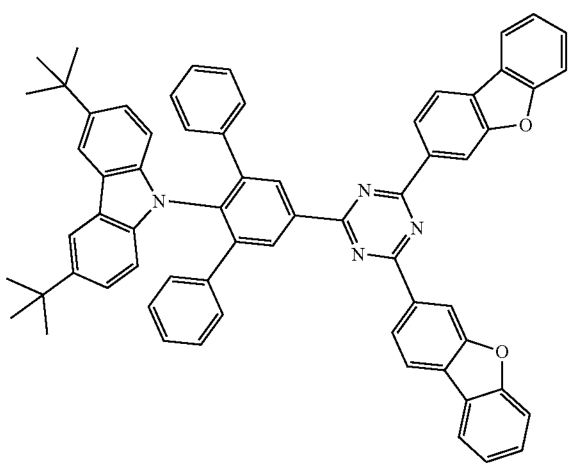
-continued
304
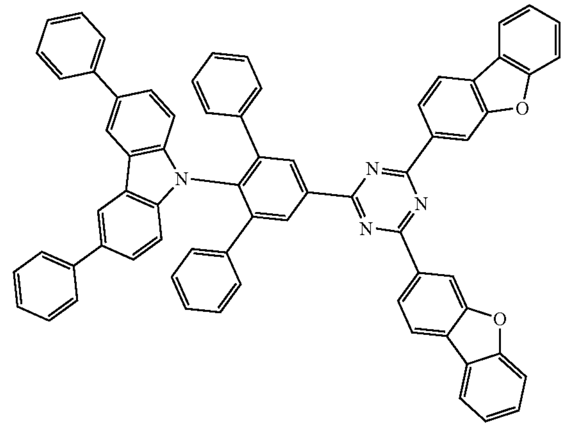
305
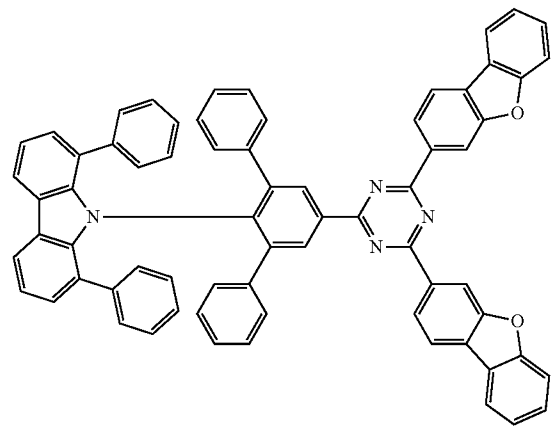
306
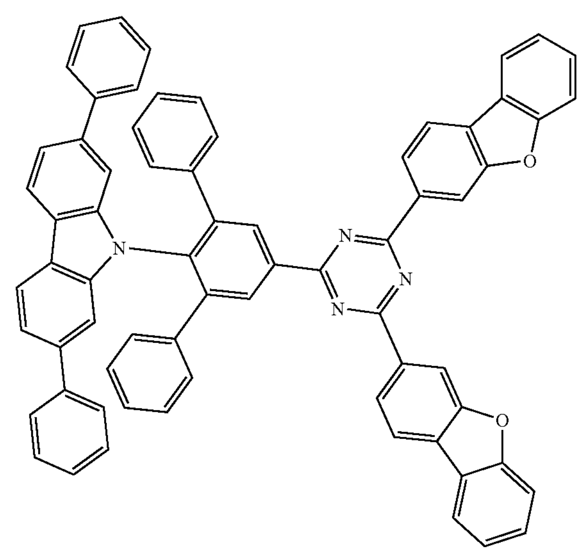

-continued
307
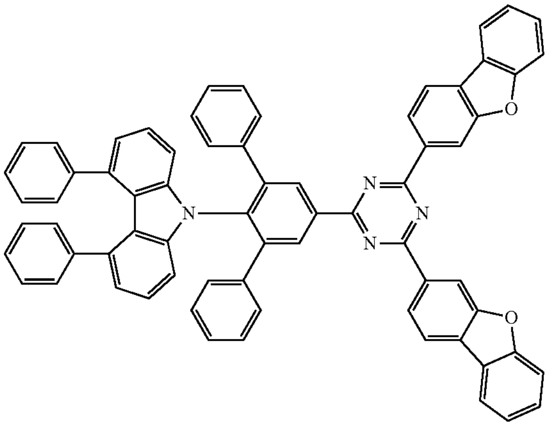
308
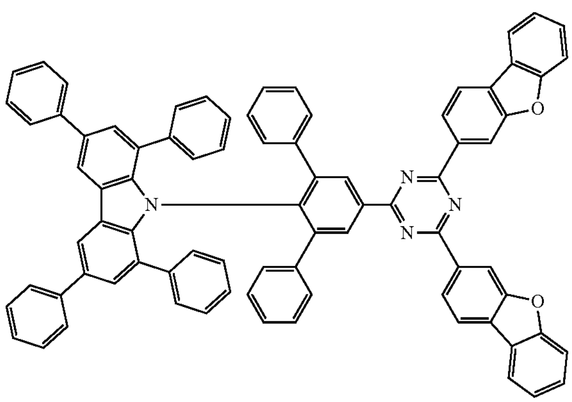
309
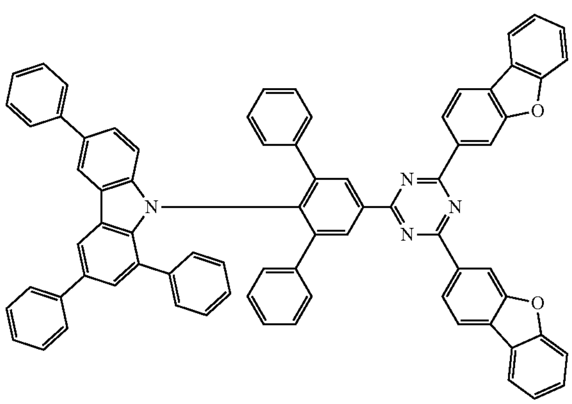
-continued
310
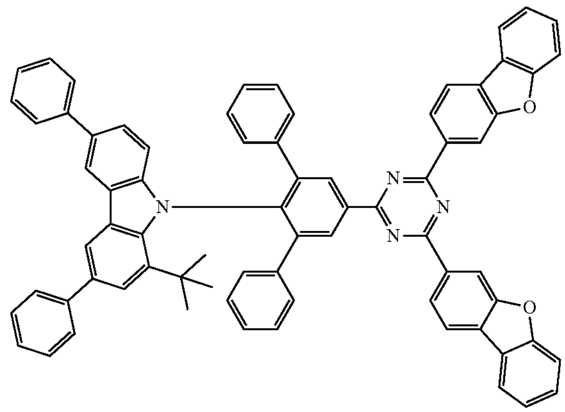
311
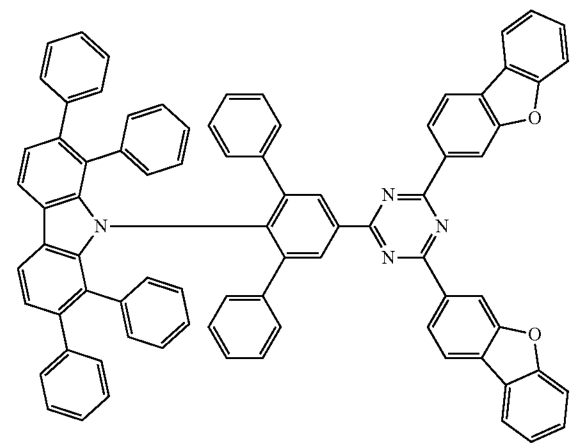
312
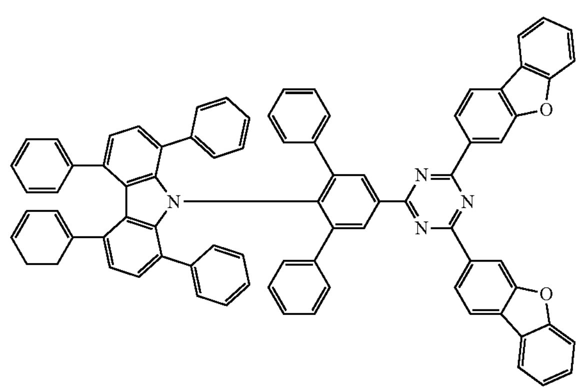

-continued
313
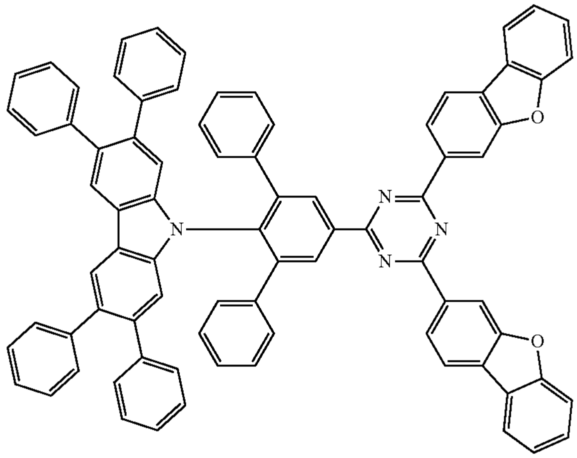
314
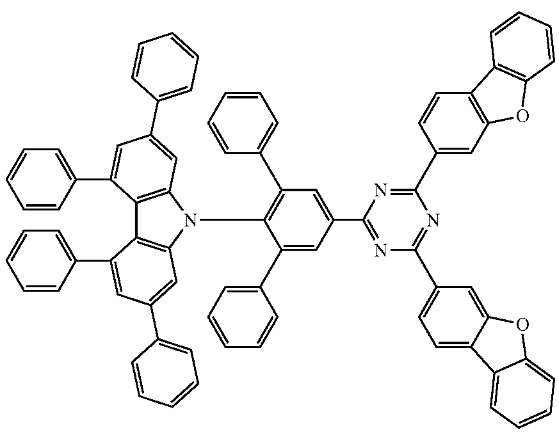
315
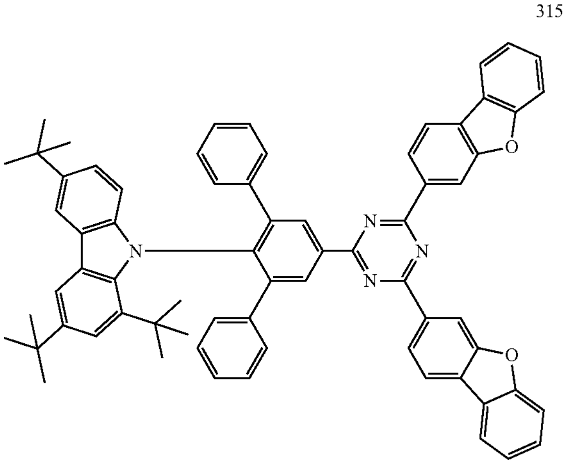
-continued
316
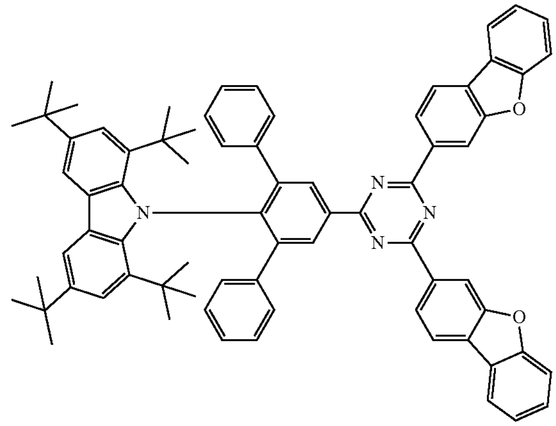
317
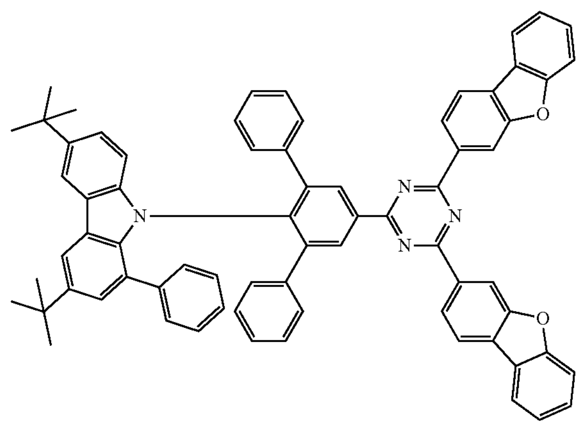
318
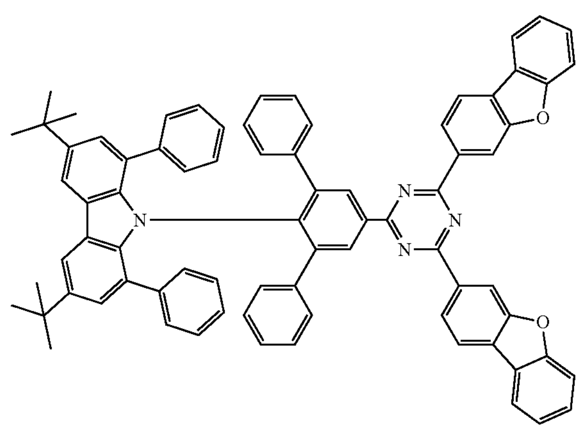

-continued
319
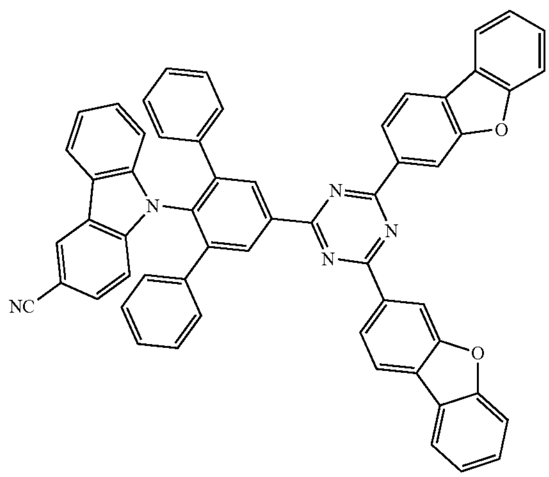
320
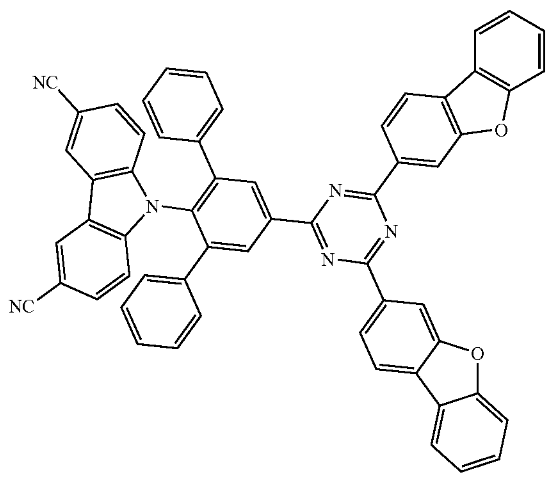
321
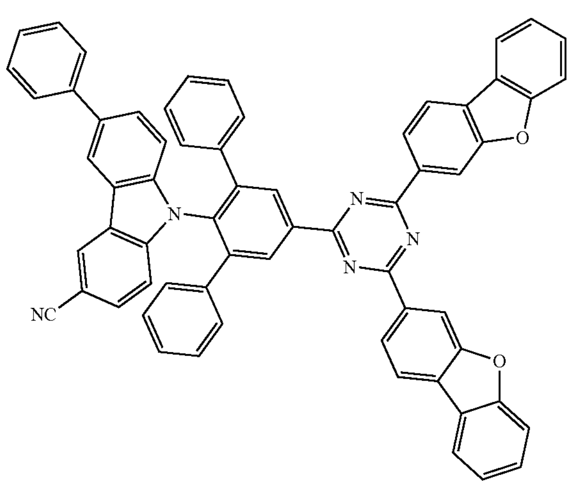
-continued
322
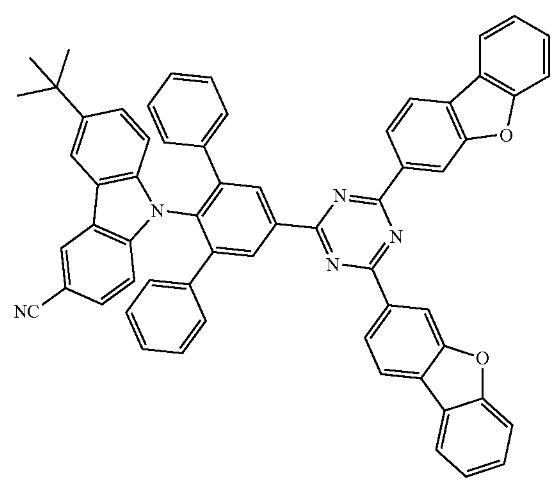
323
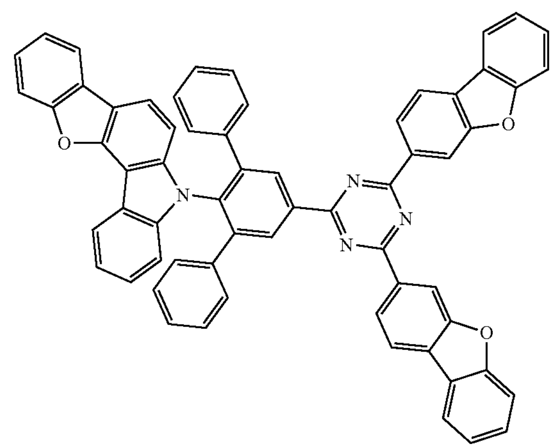
324
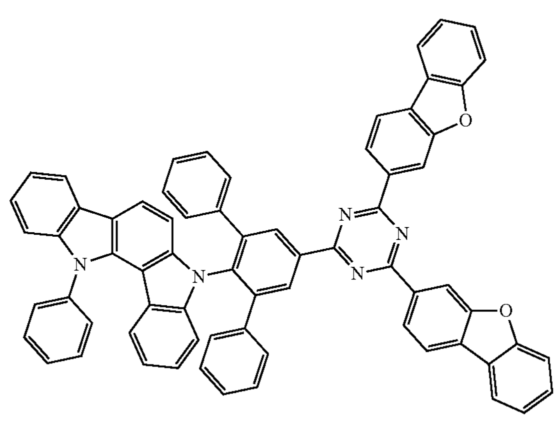

-continued
325
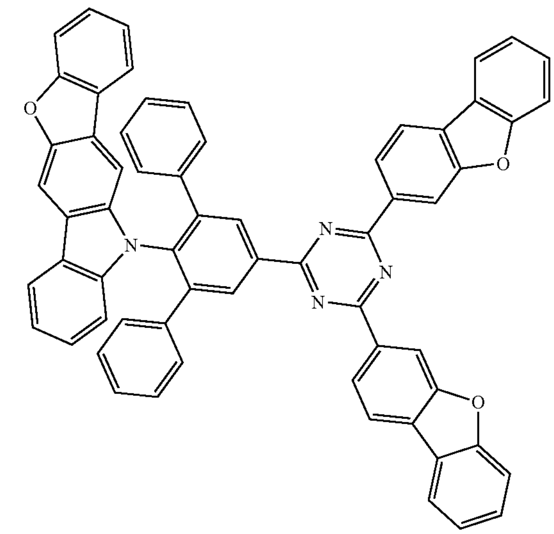
326
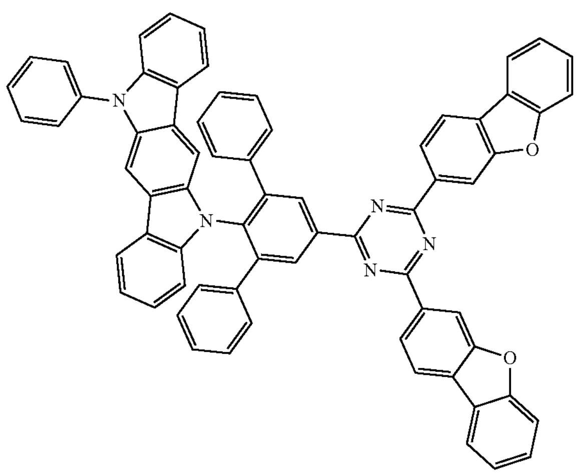
327
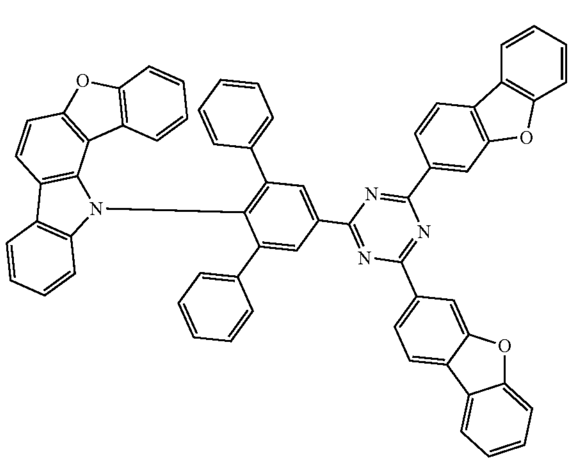
-continued
328
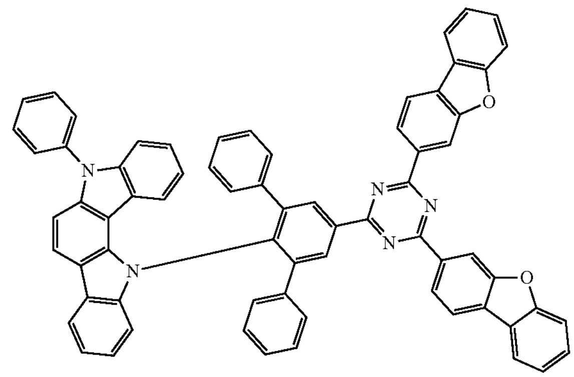
329
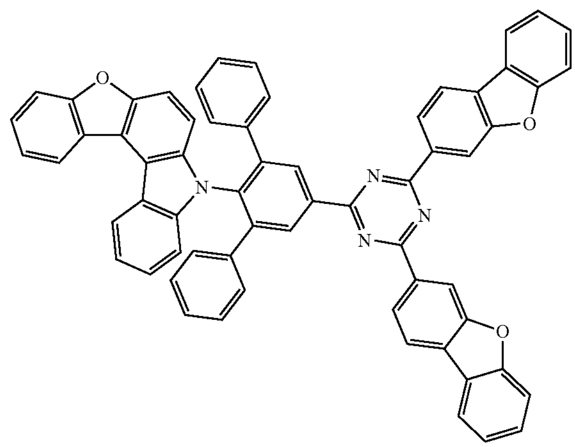
330
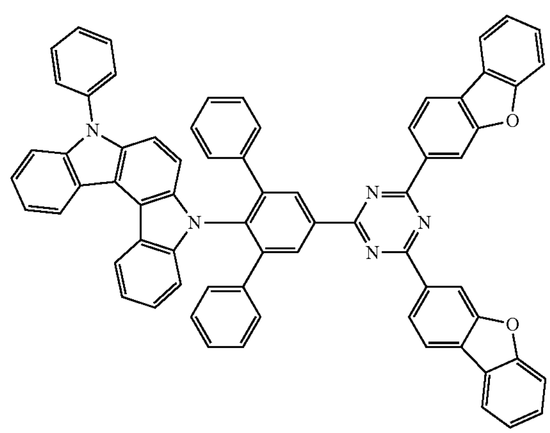

-continued
331
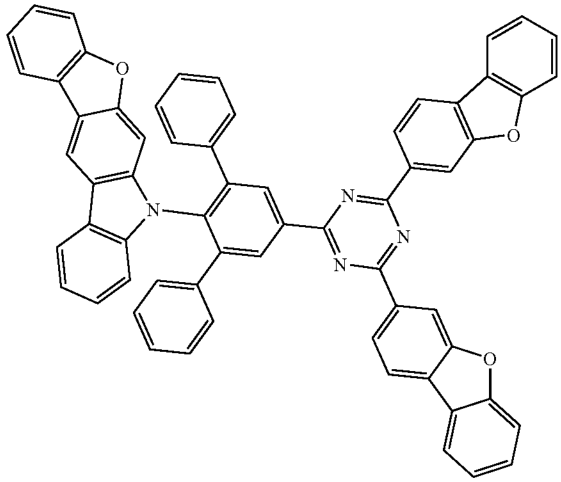
332
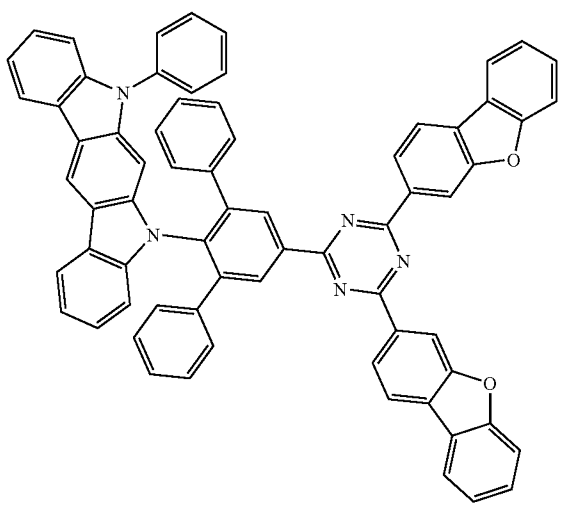
333
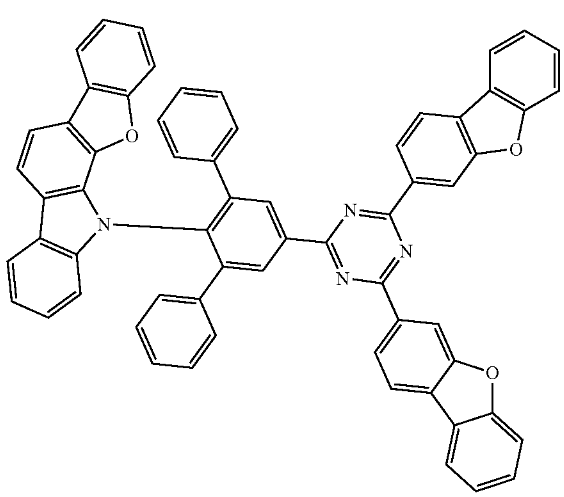
-continued
334
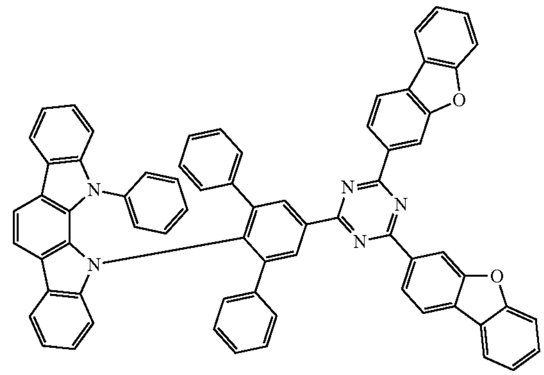
335
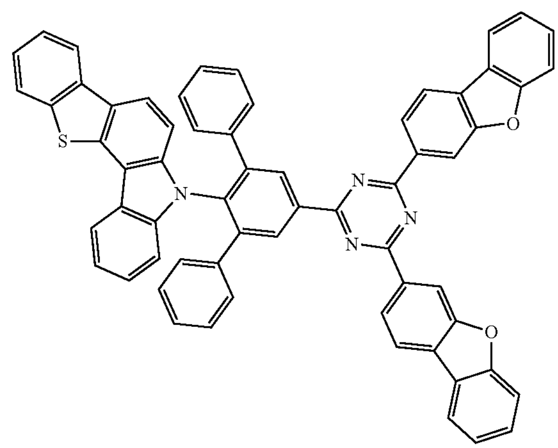
336
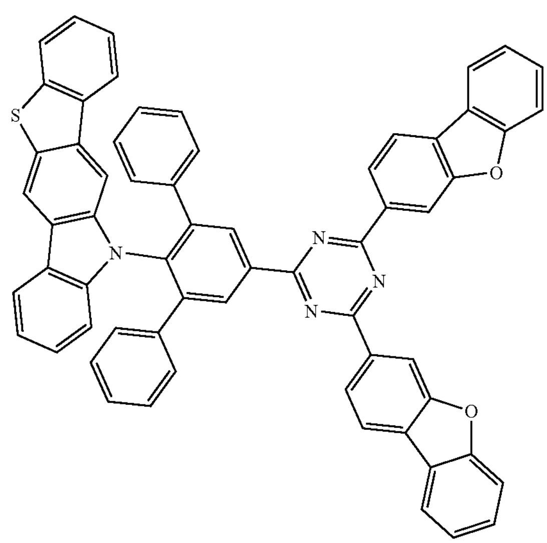

-continued
337
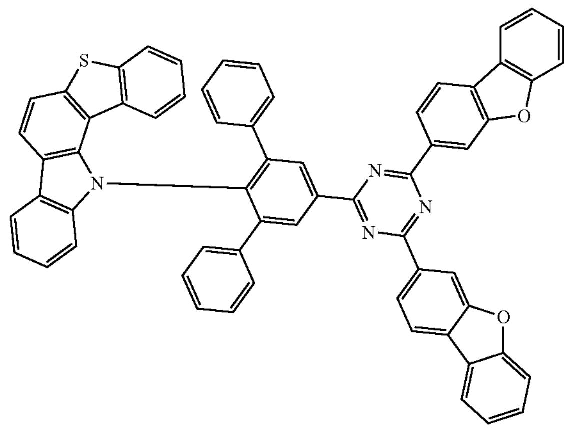
338
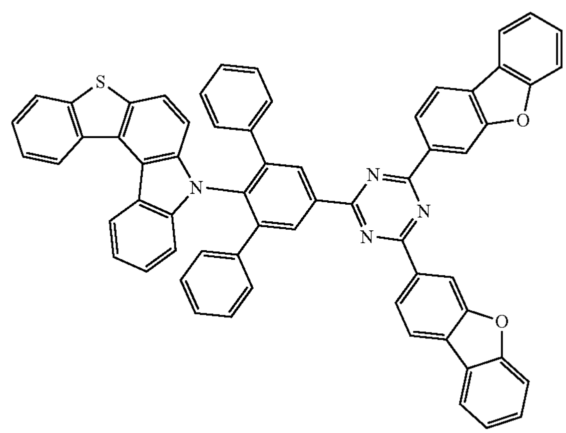
339
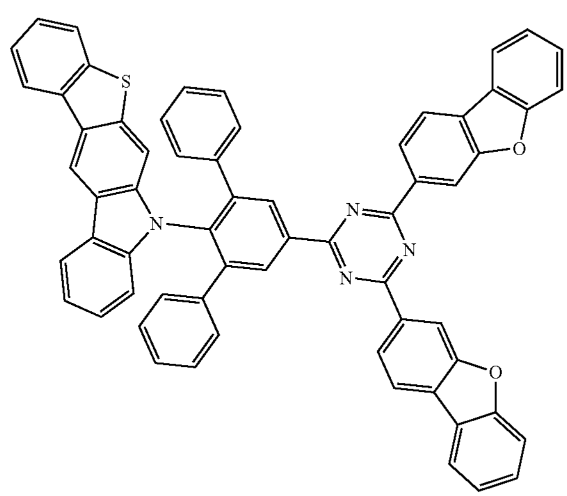
-continued
340
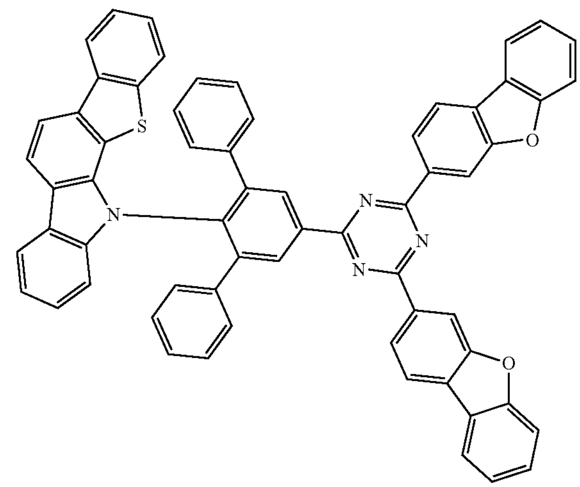
341
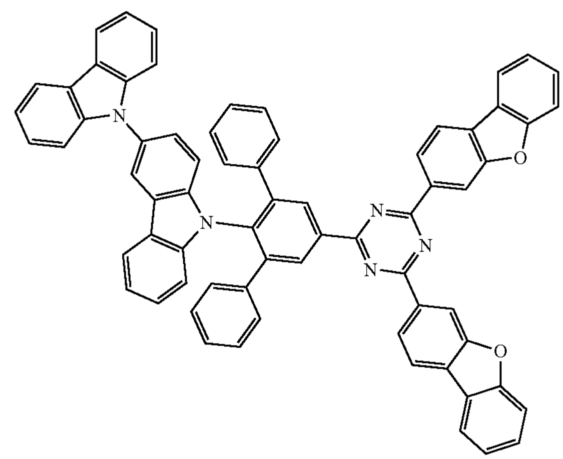
342
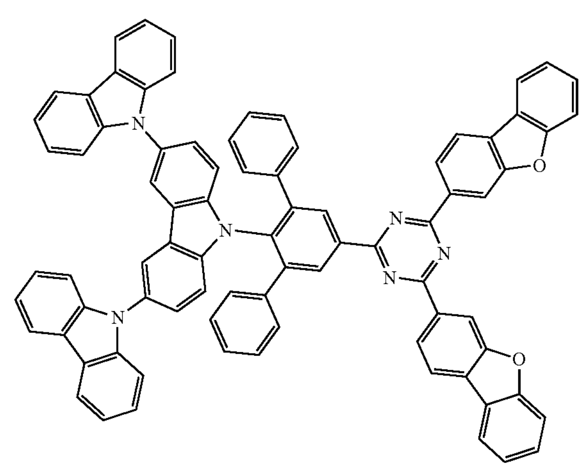

343
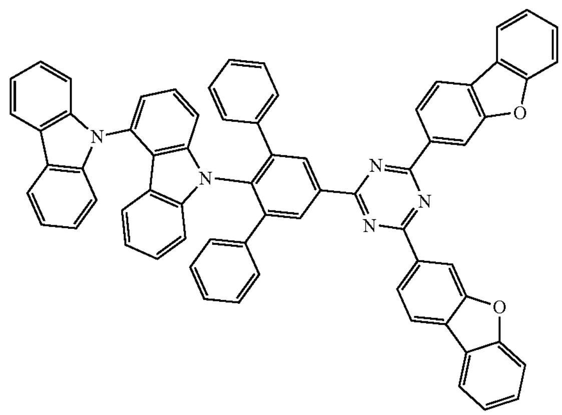
344
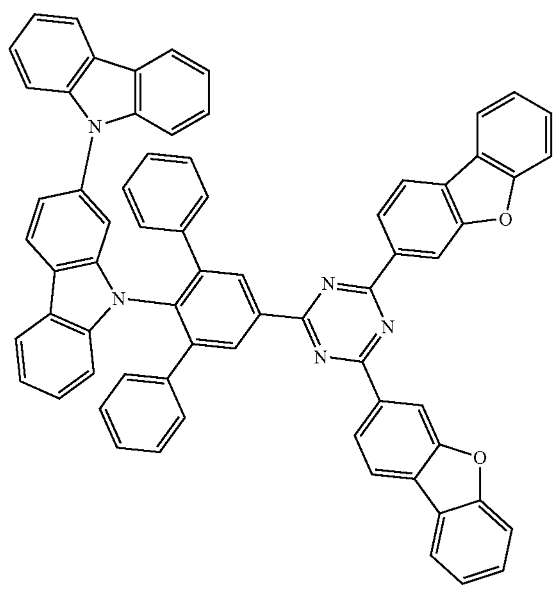
345
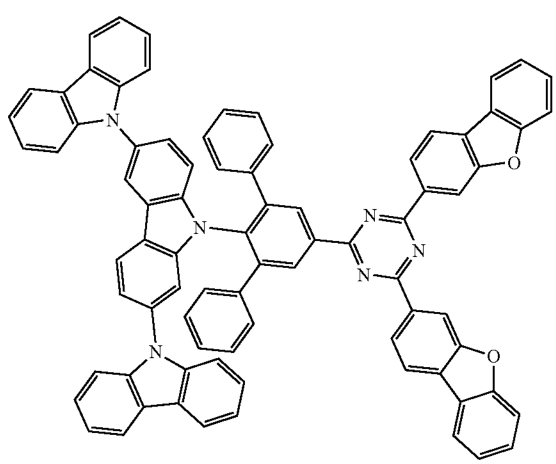
346
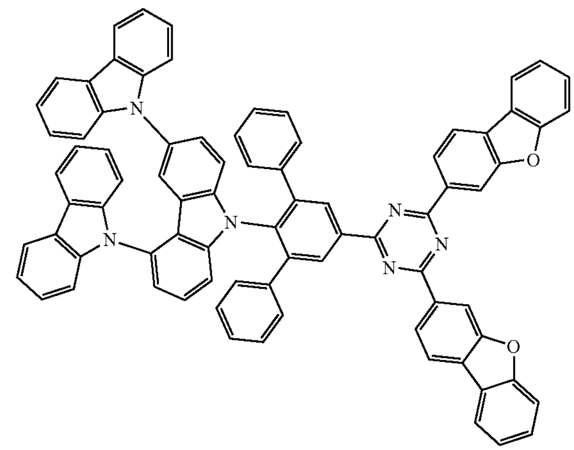
347
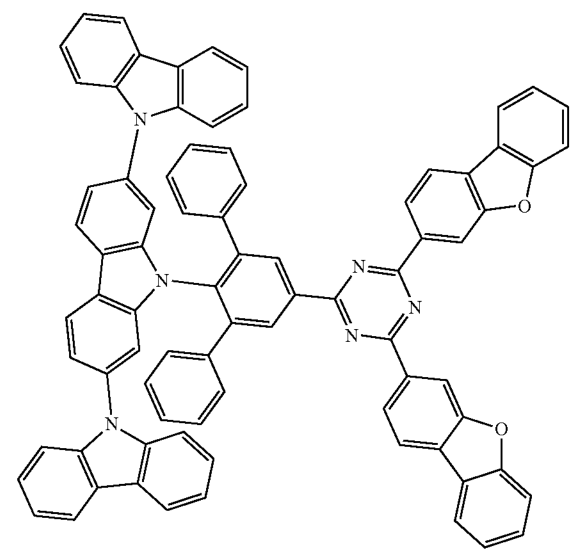
348
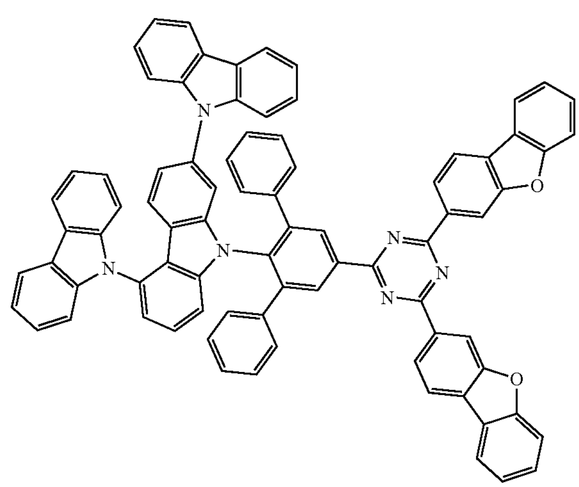

-continued
349
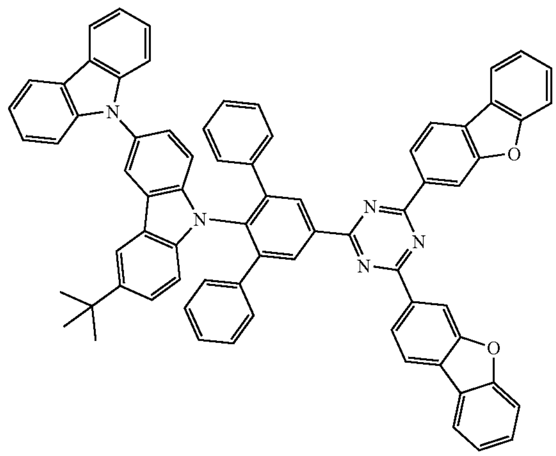
350
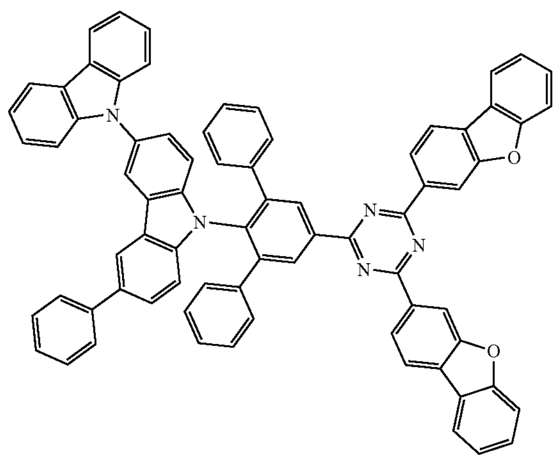
351
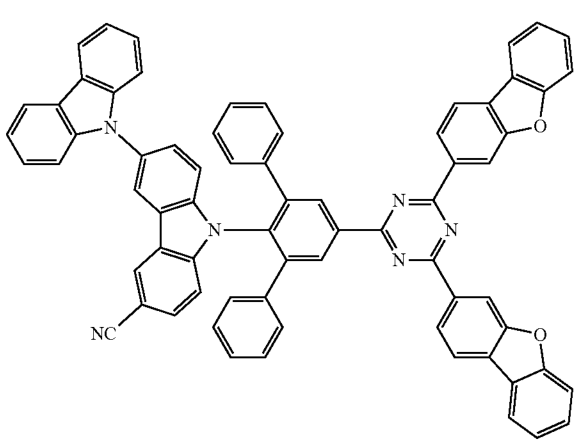
-continued
352
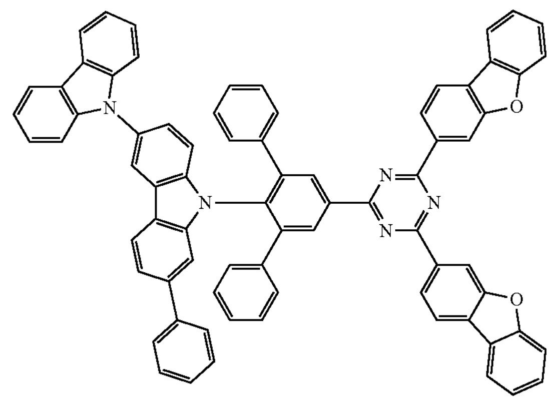
353
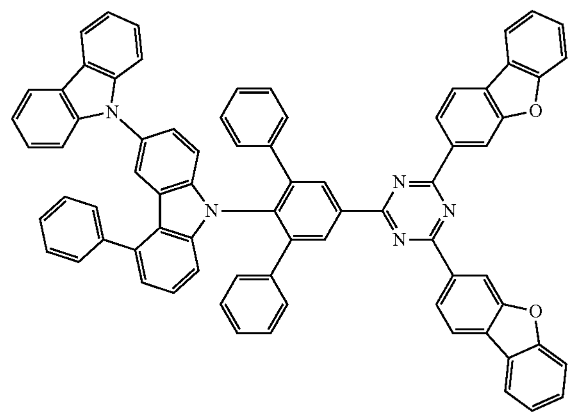
354
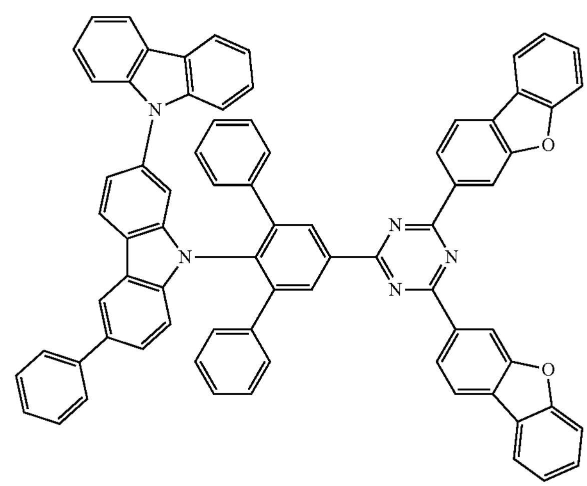

-continued
355
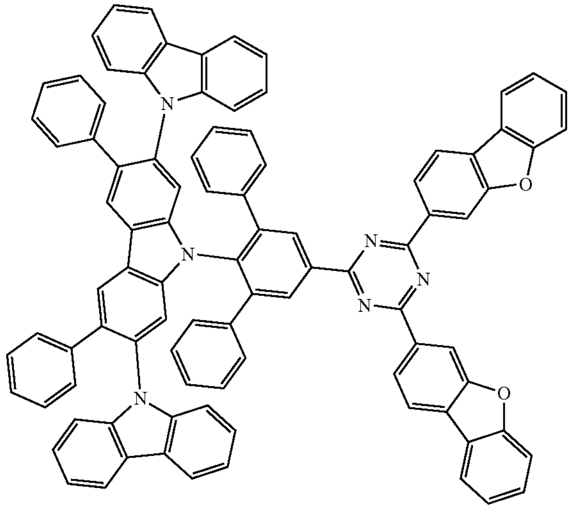
356
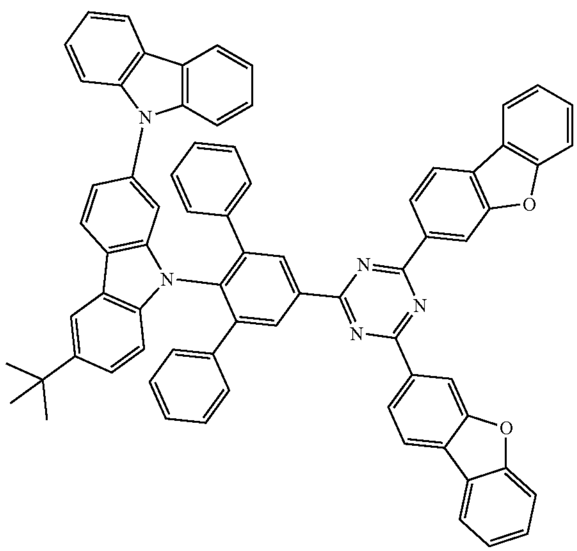
357
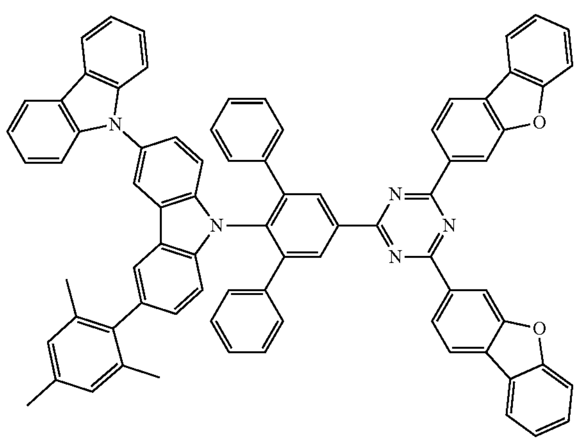
-continued
358
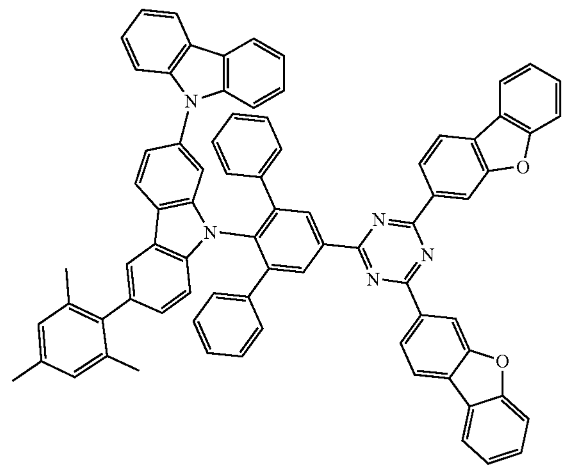
359
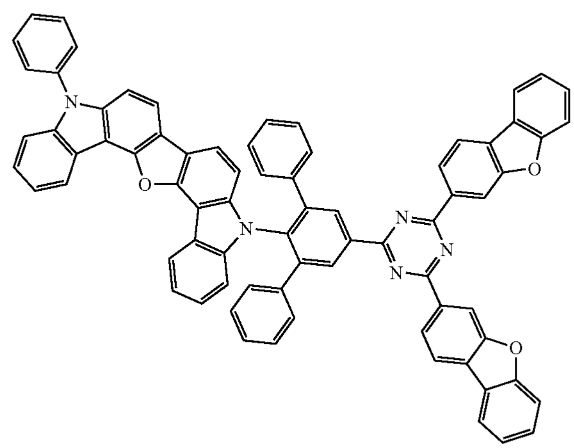
360
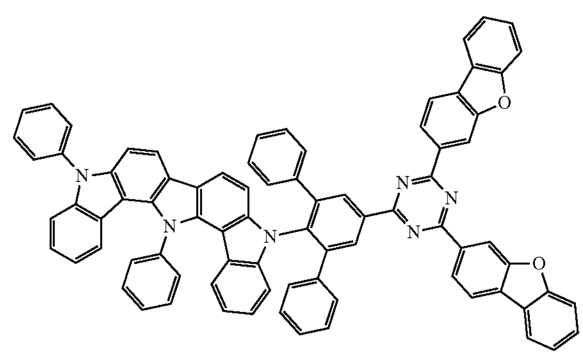

-continued
361
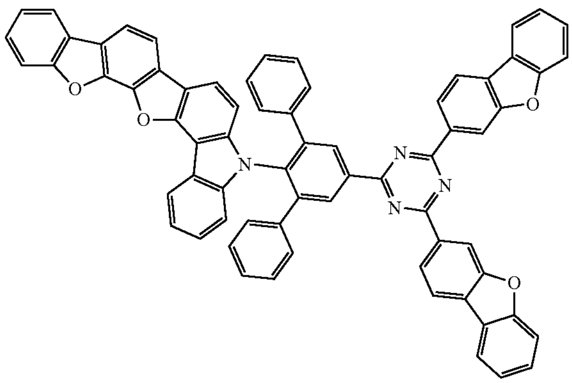
362
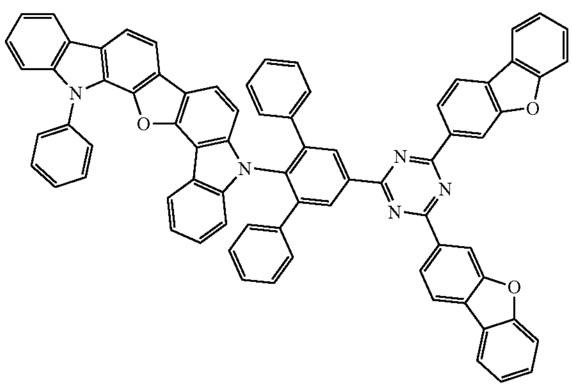
363
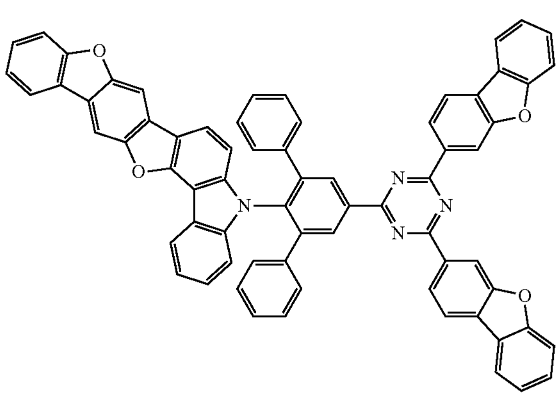
-continued
364
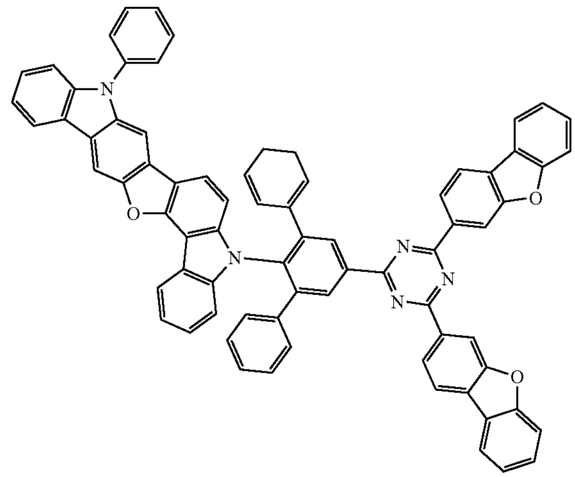
365
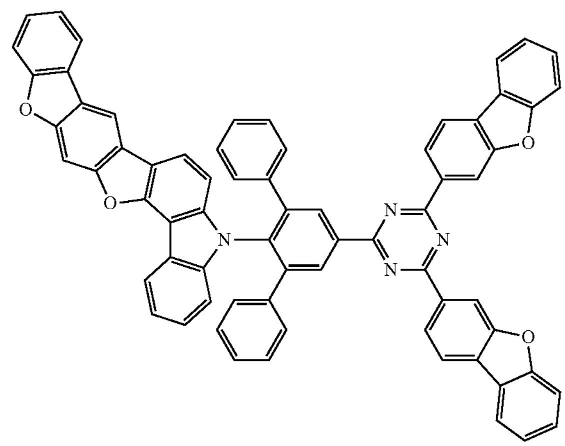
366
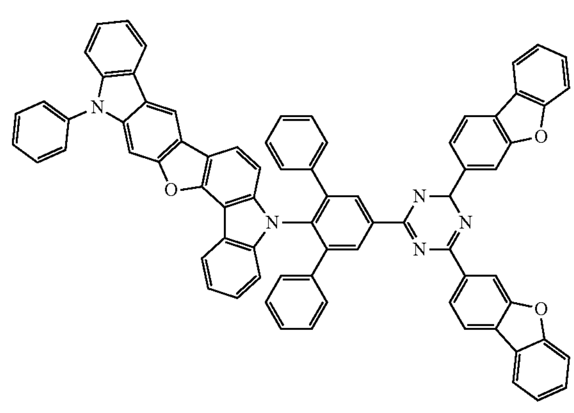

-continued
367
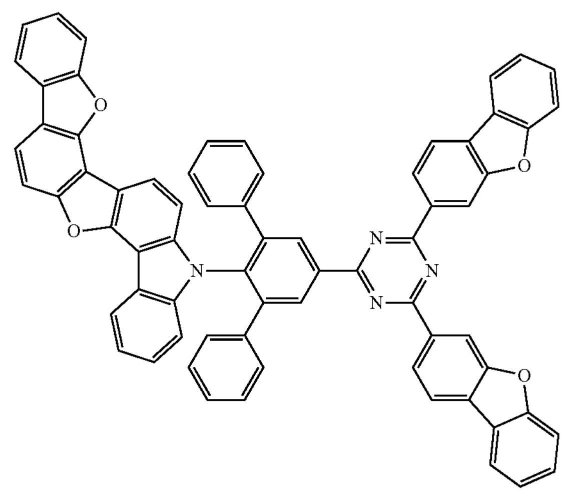
368
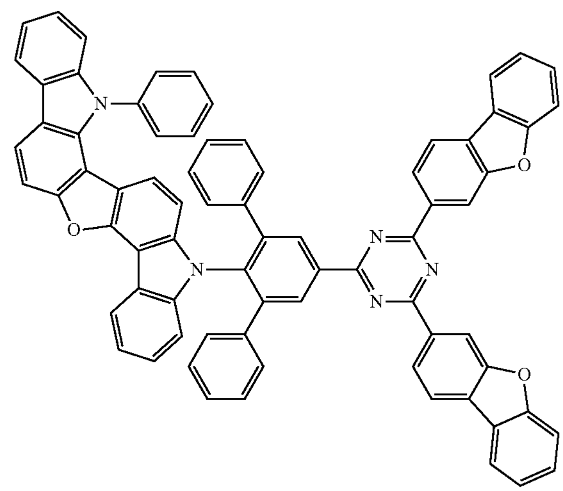
369
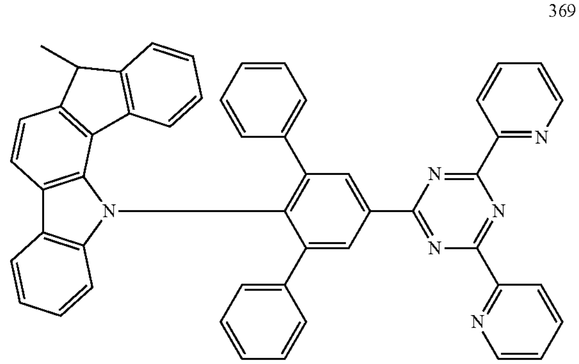
-continued
370
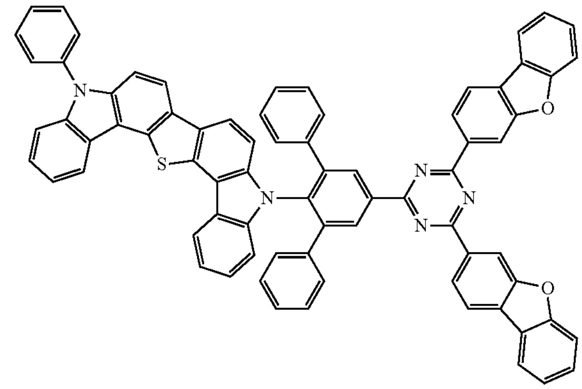
371
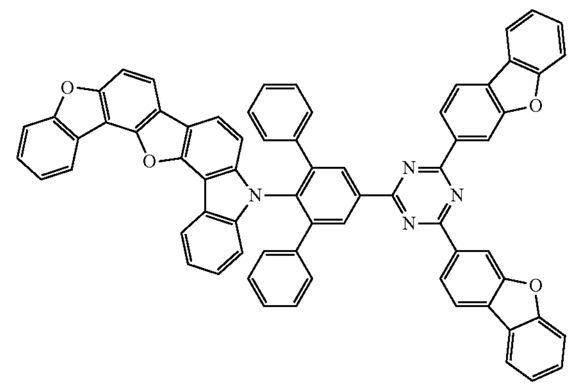
372
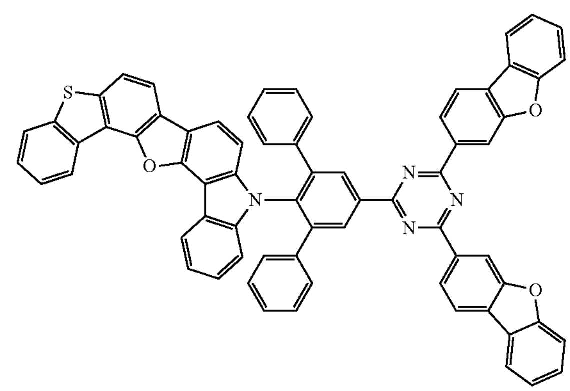
373
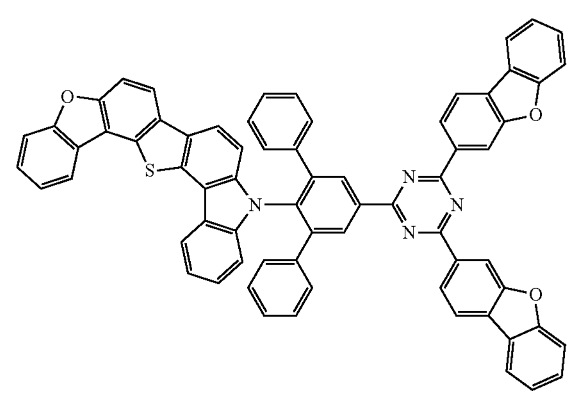

-continued
374
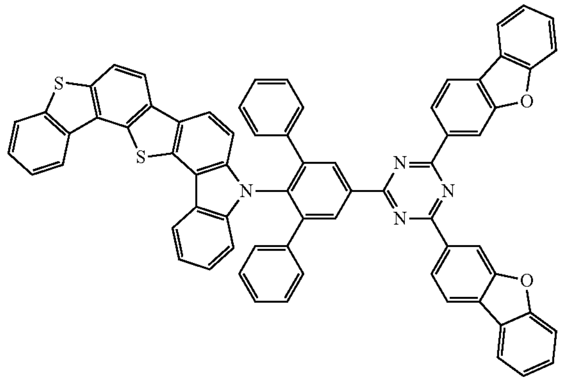
375
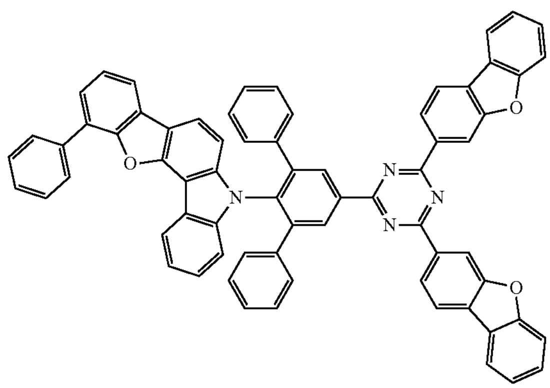
376
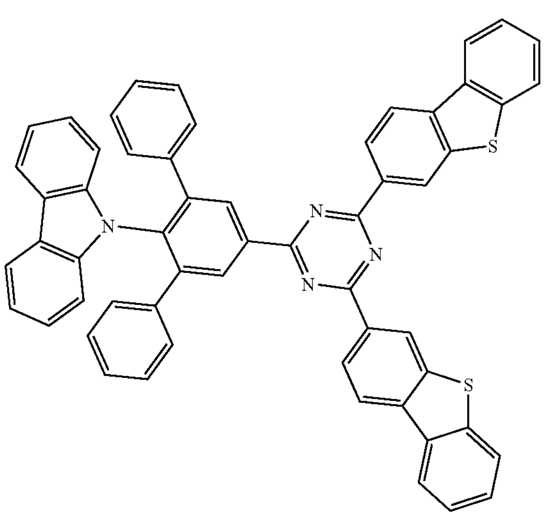
-continued
377
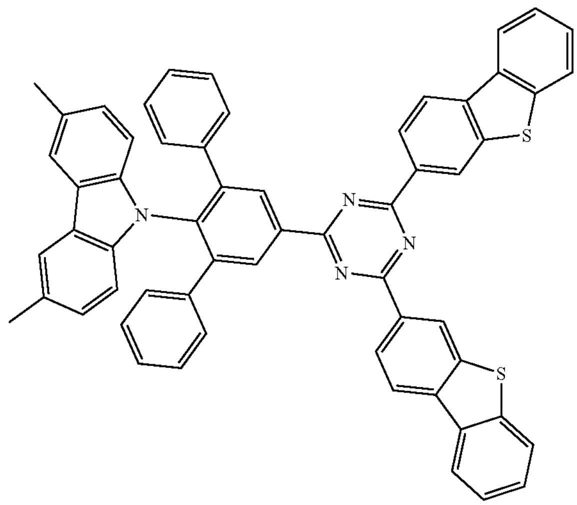
378
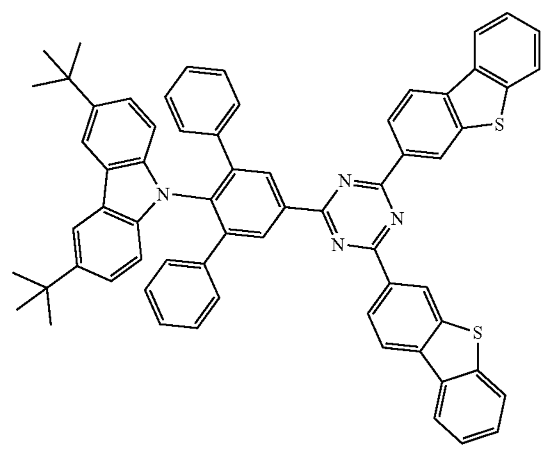
379
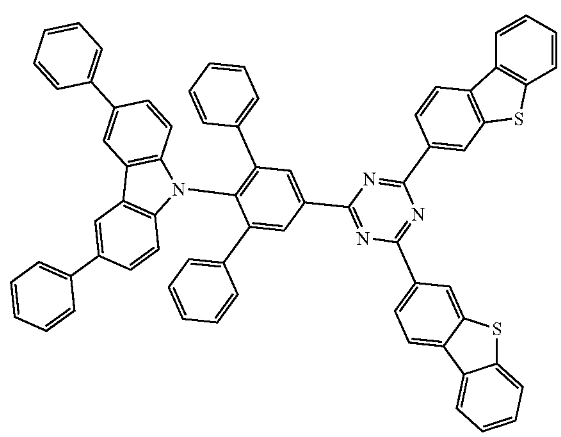

-continued
380
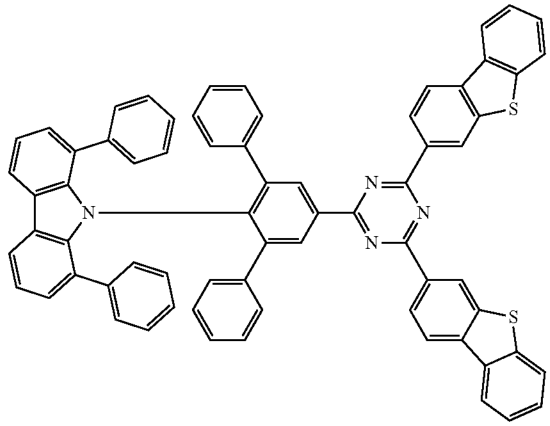
381
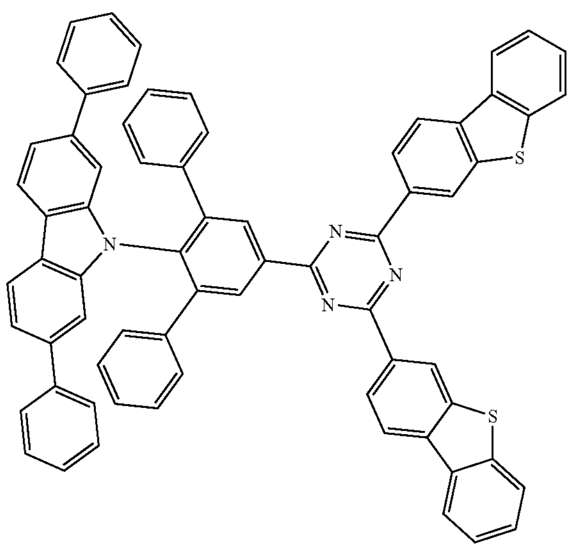
382
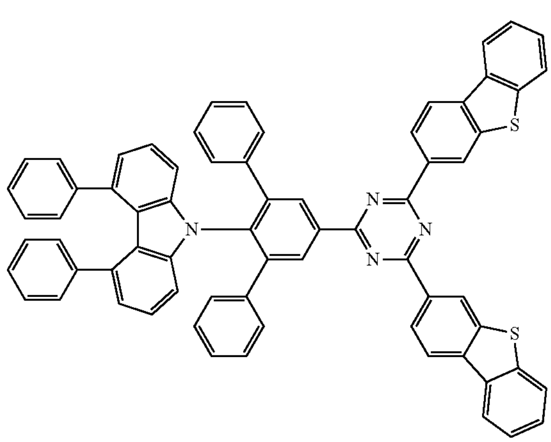
-continued
383
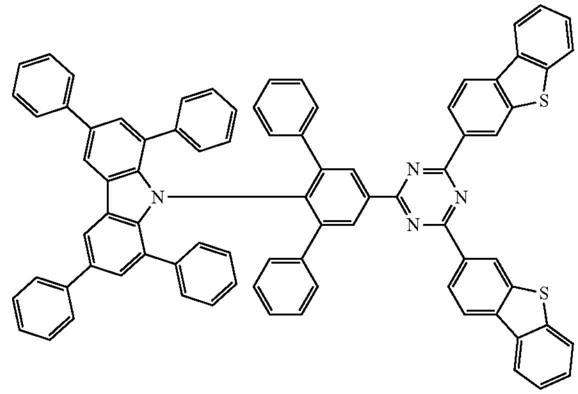
384
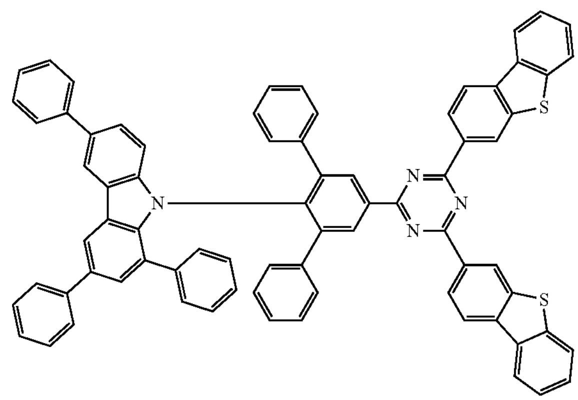
385
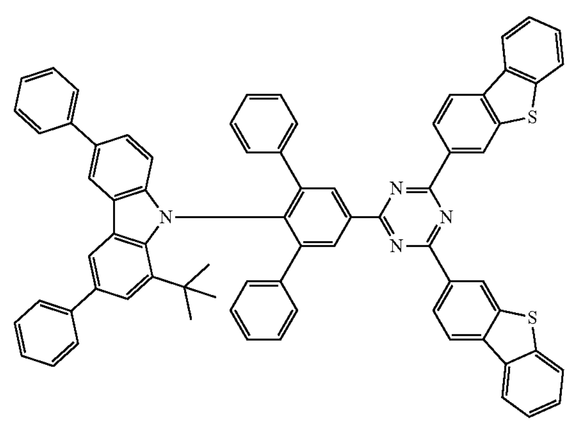

-continued
386
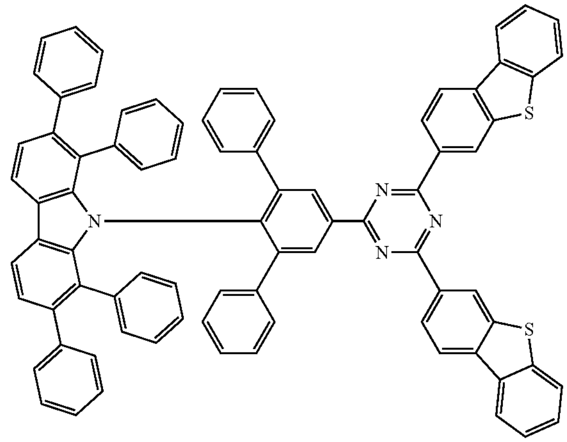
387
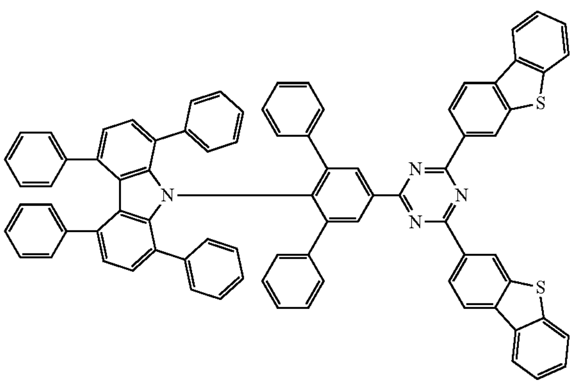
388
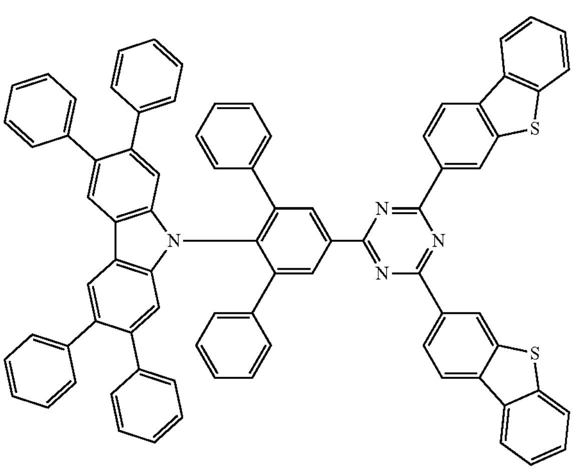
-continued
389
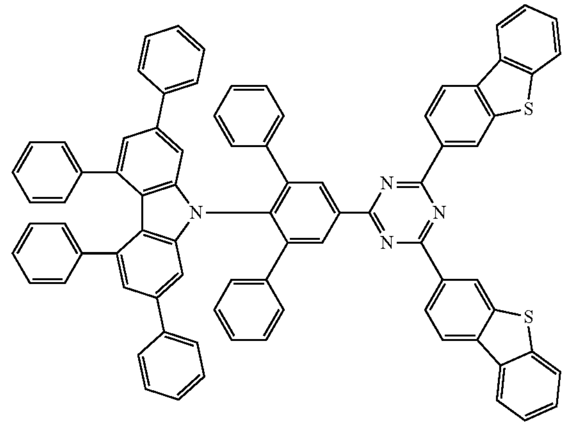
390
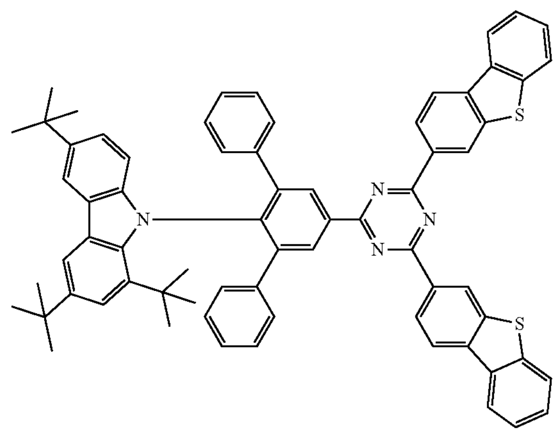
391
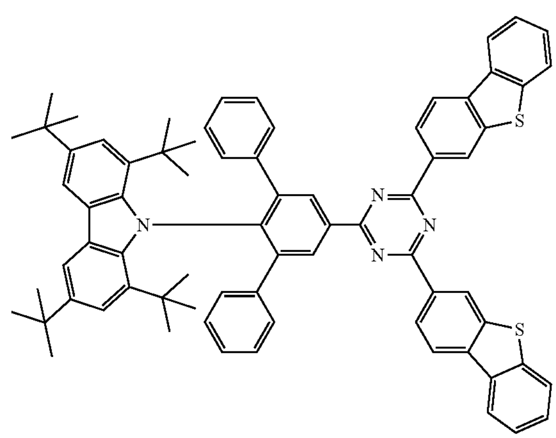

-continued
392
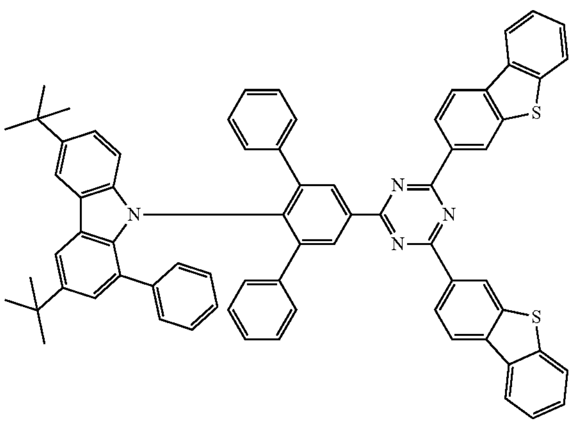
393
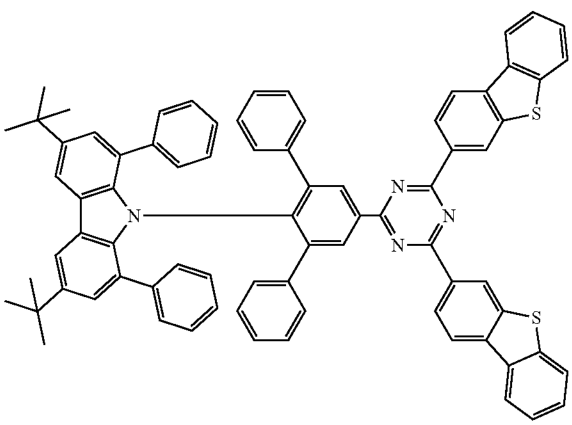
394
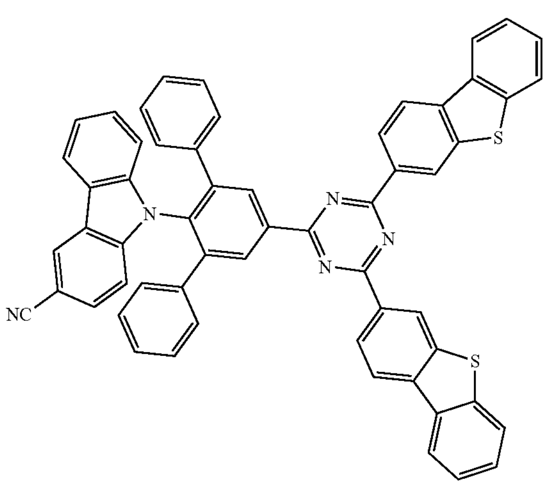
-continued
395
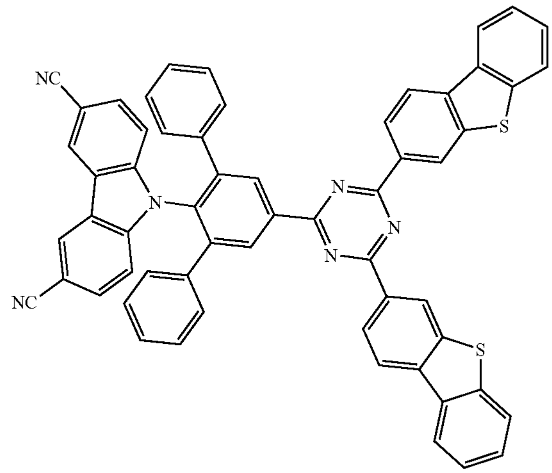
396
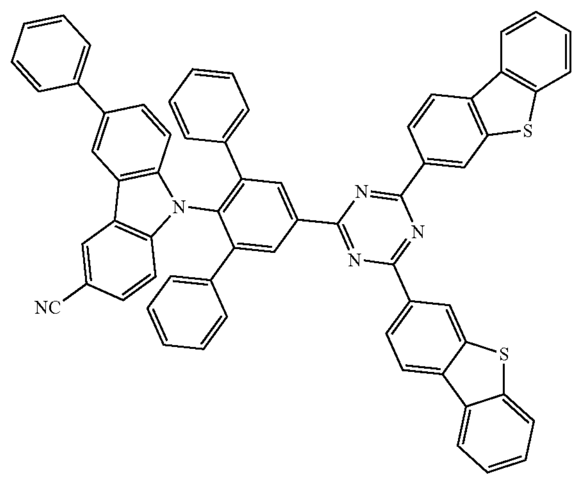
397
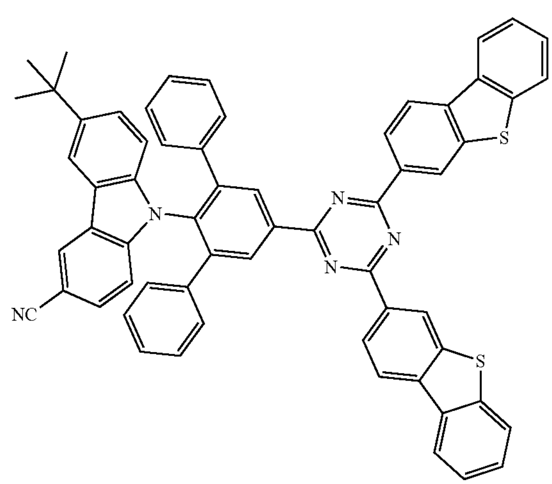

-continued
398
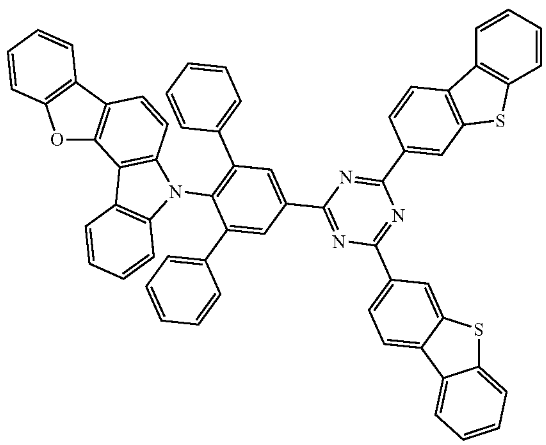
399
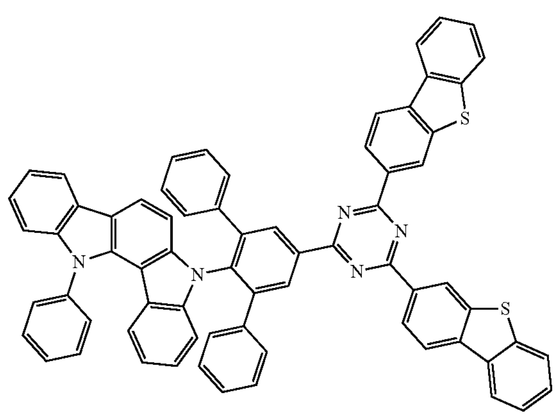
400
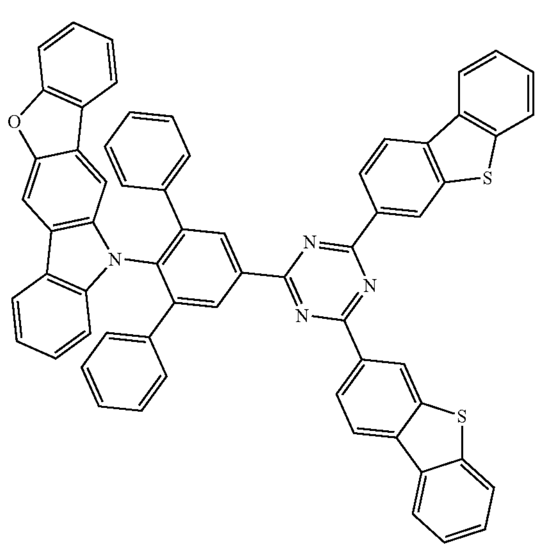
-continued
401
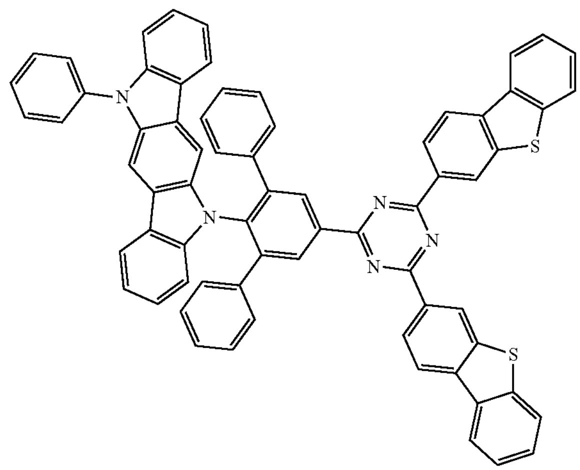
402
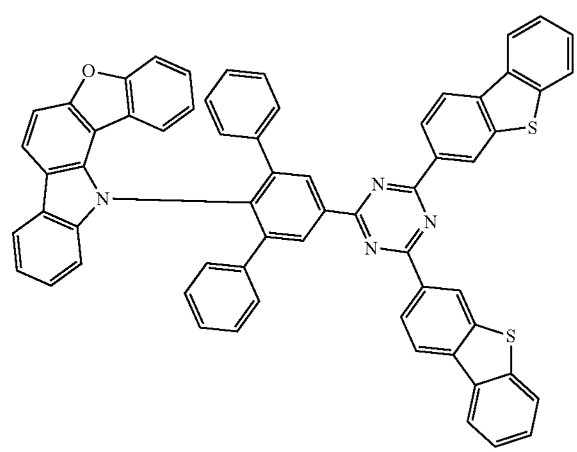
403
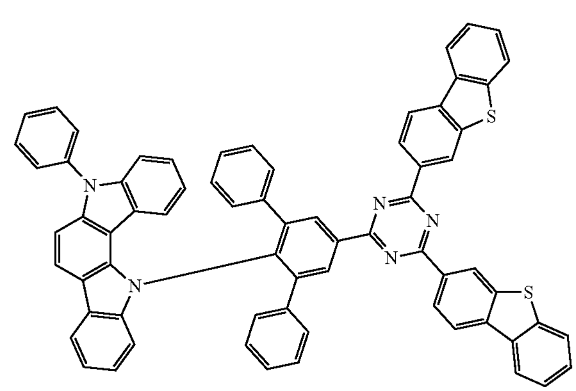

-continued
404
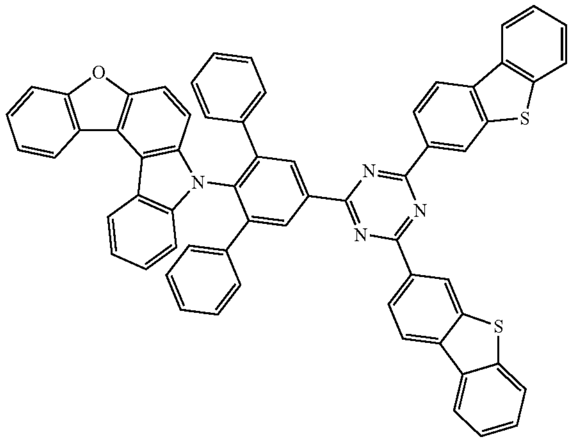
405
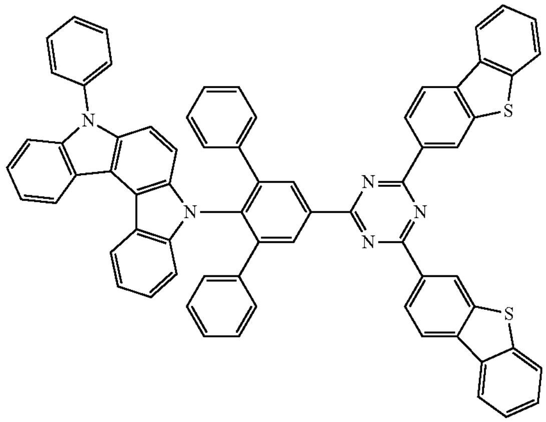
406
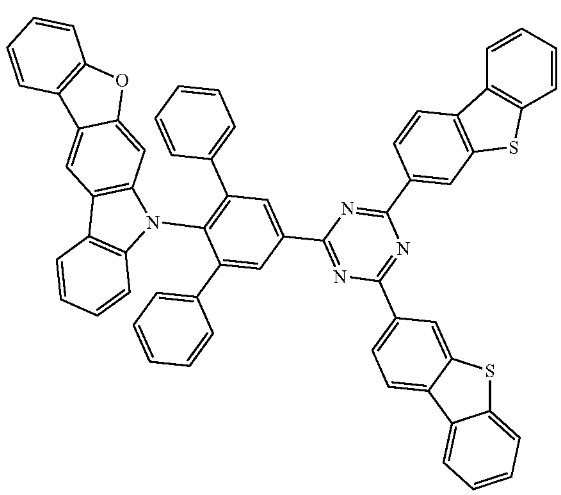
-continued
407
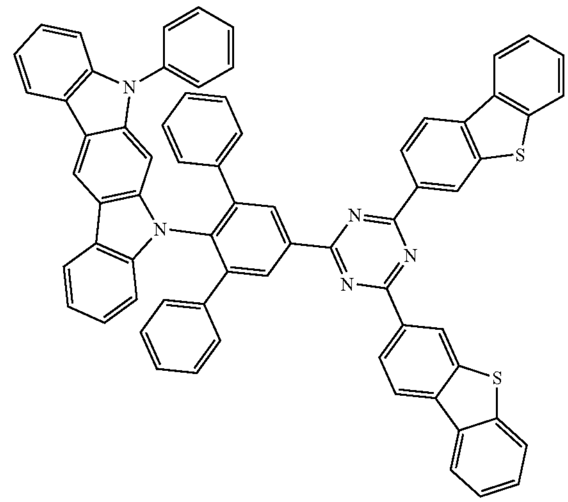
408
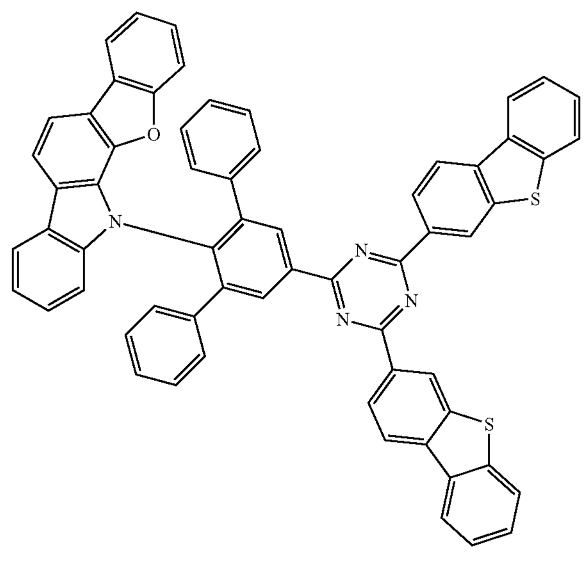
409
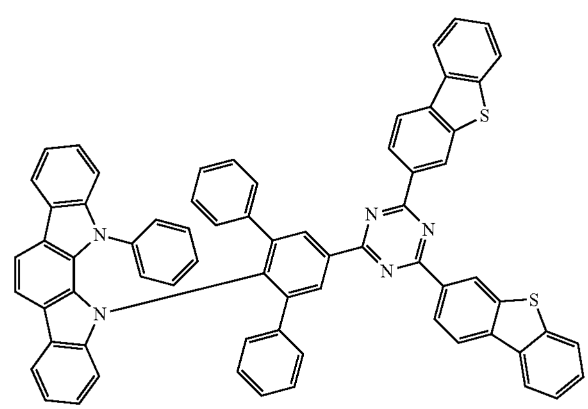

-continued
410
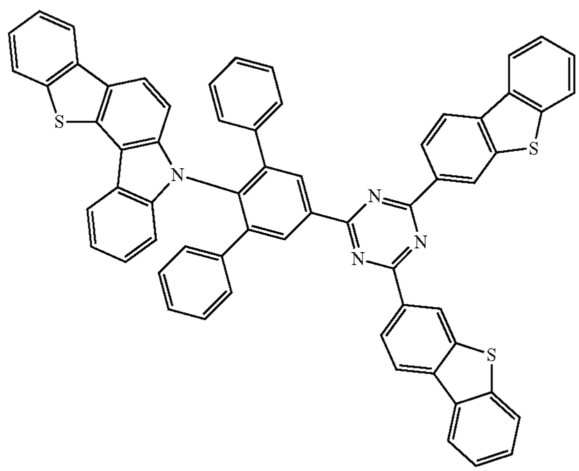
411
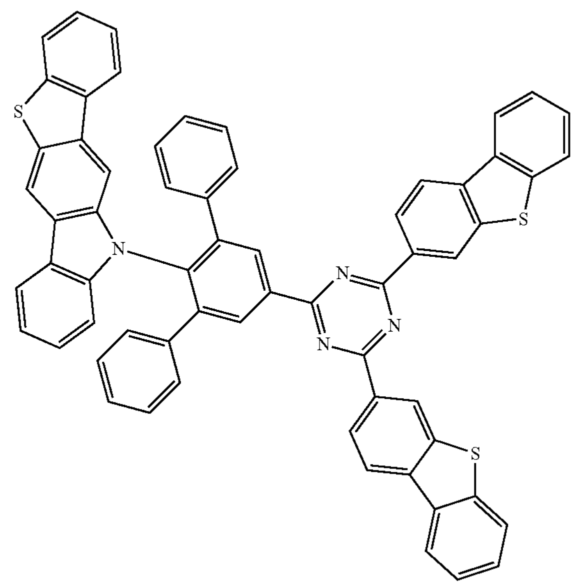
412
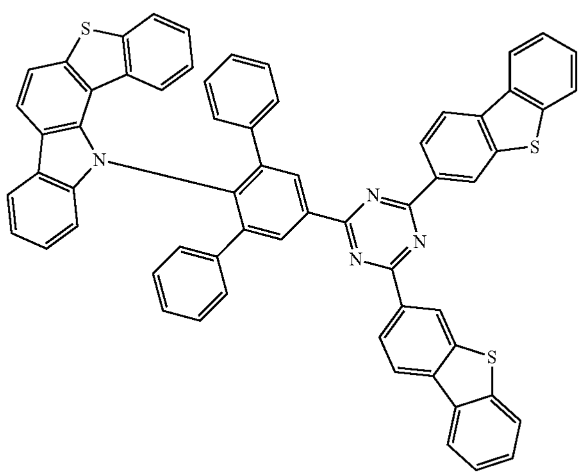
-continued
413
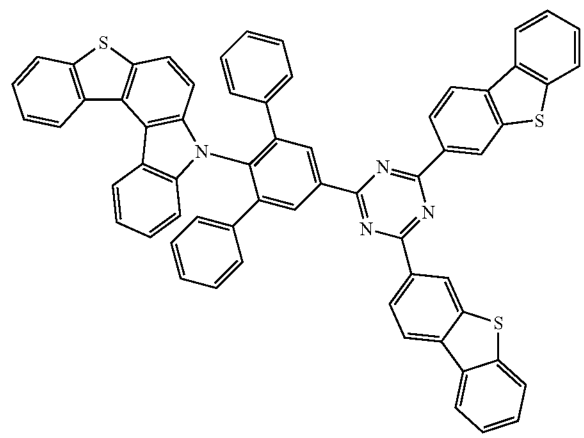
414
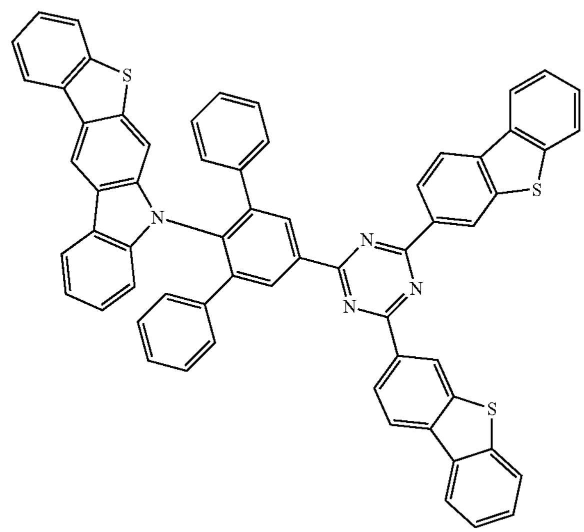
415
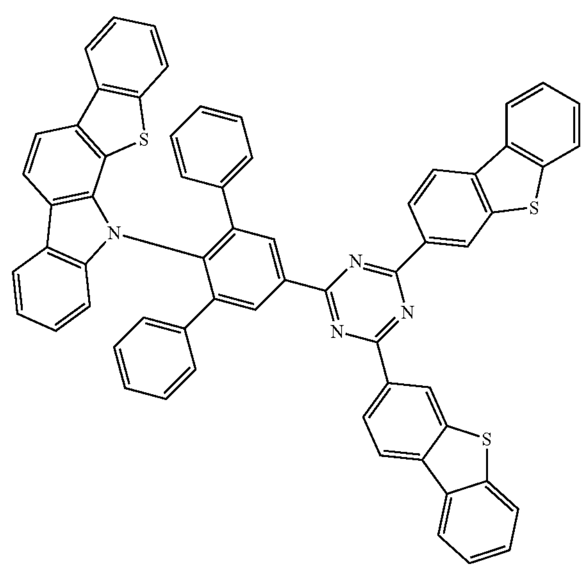

-continued
416
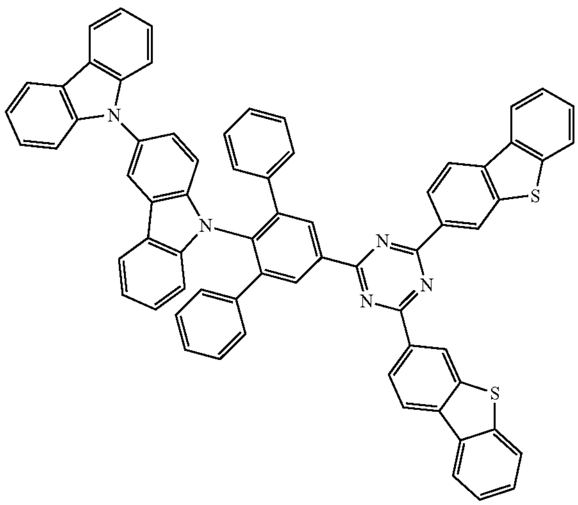
417
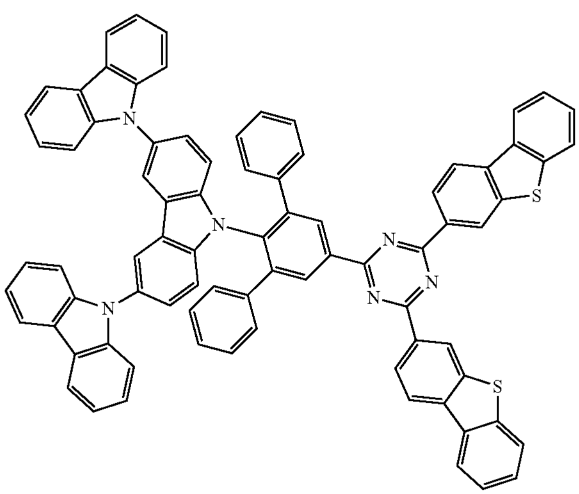
418
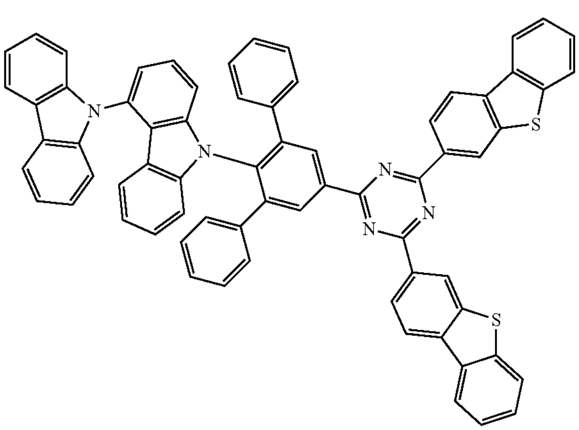
-continued
419
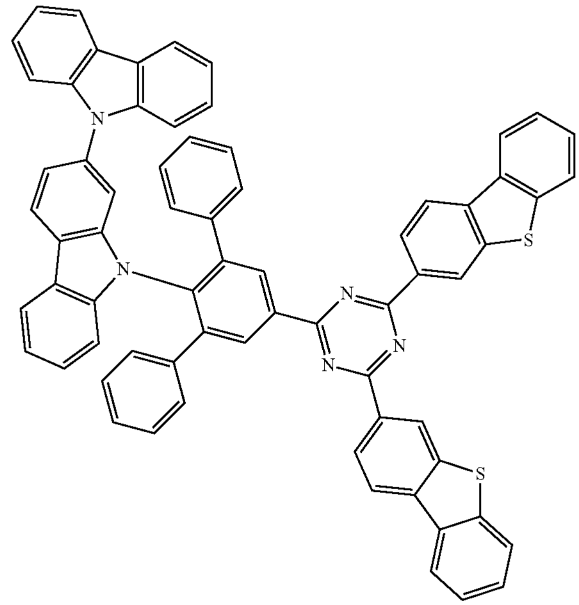
420
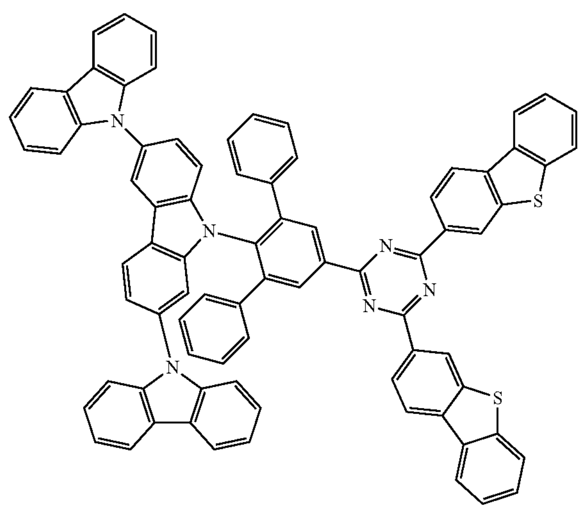
421
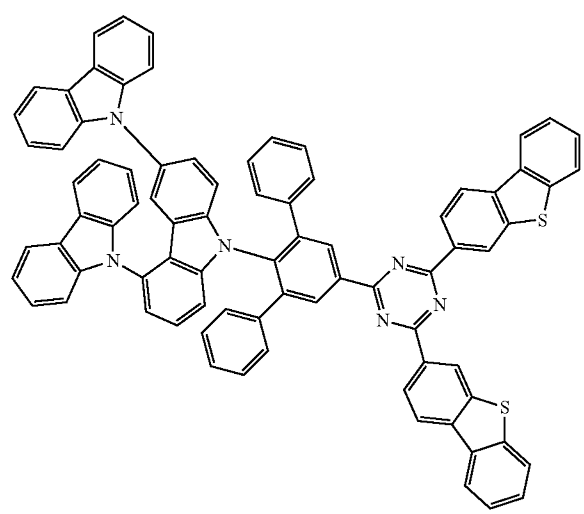

-continued
422
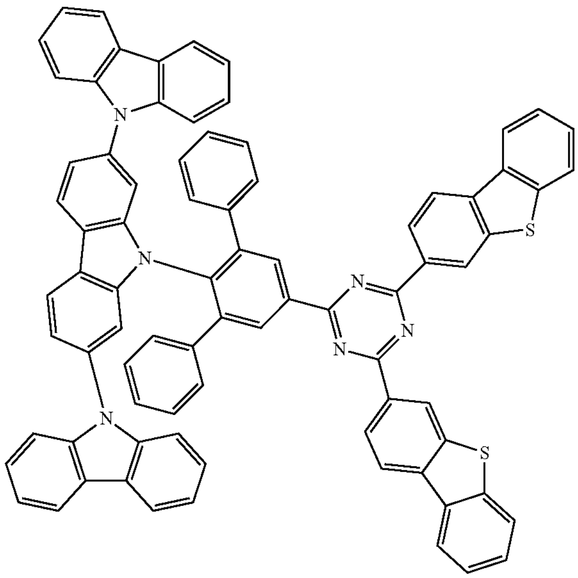
423
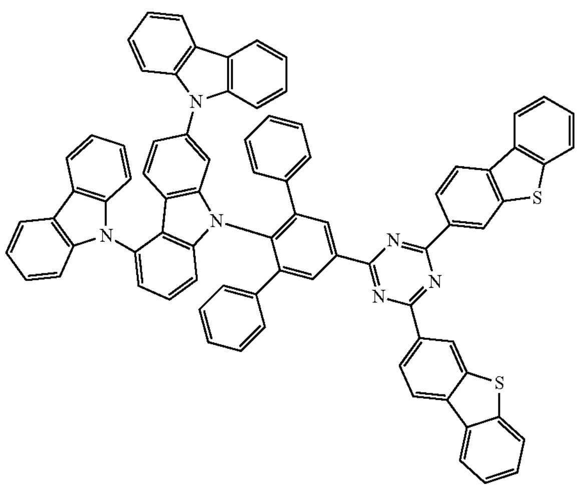
424
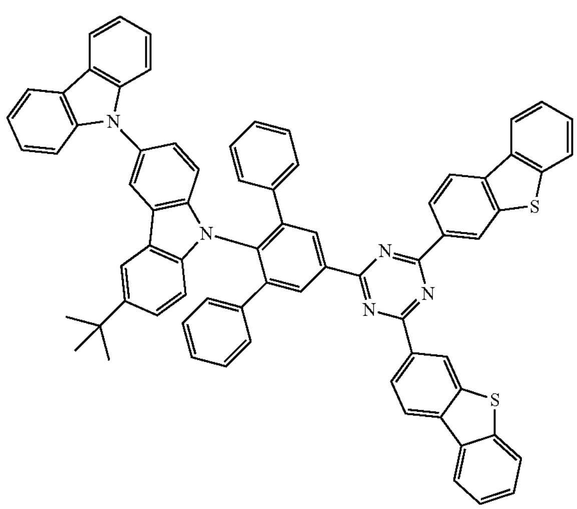
425
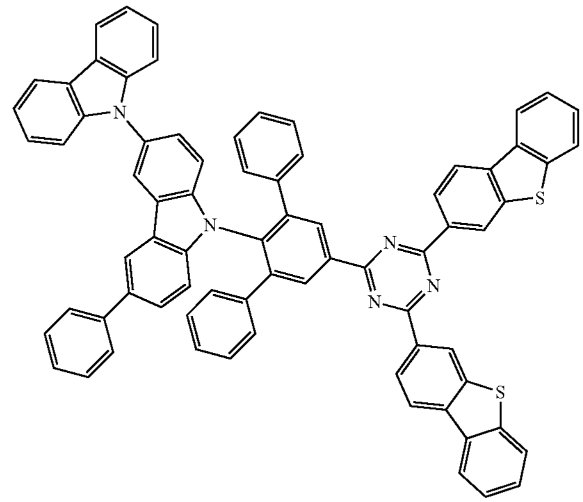
426
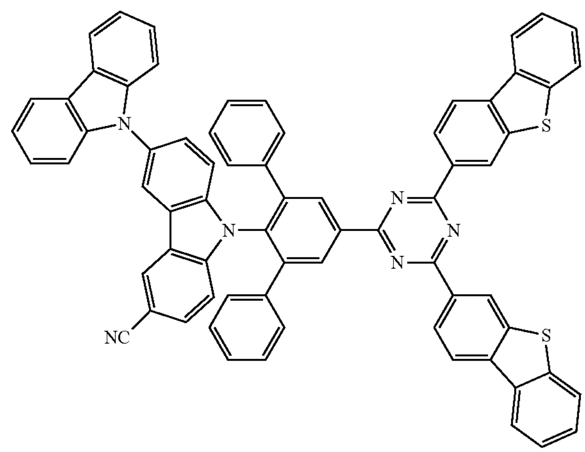
427
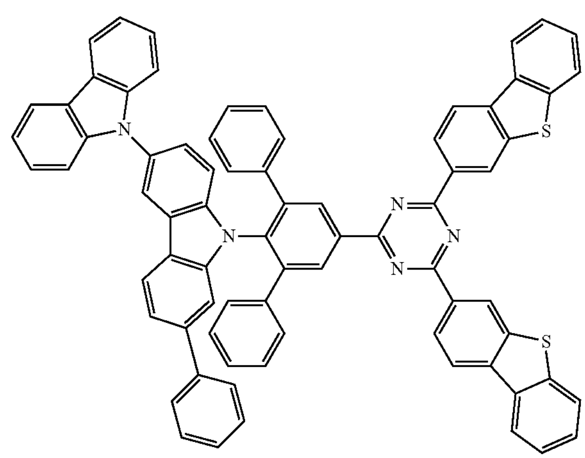

-continued
428
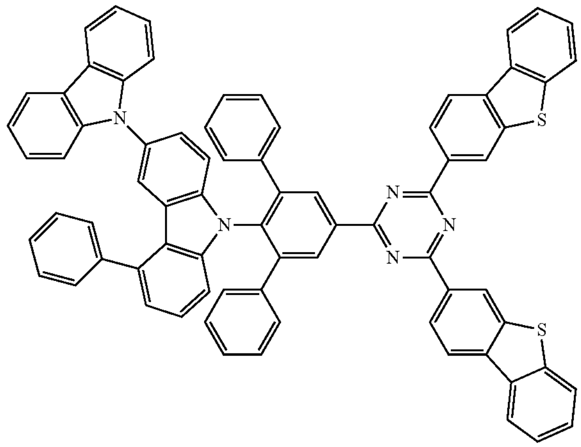
429
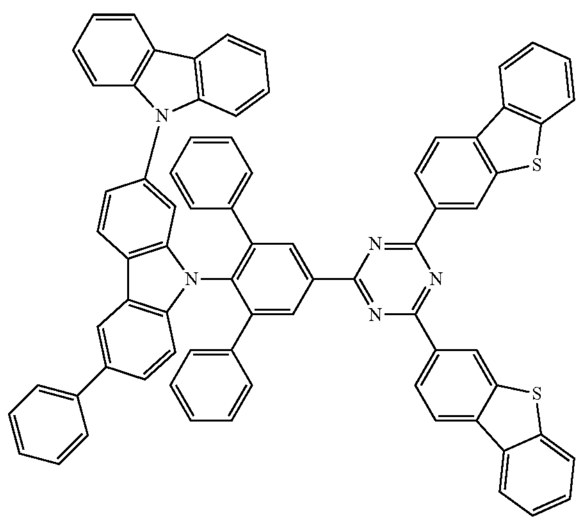
430
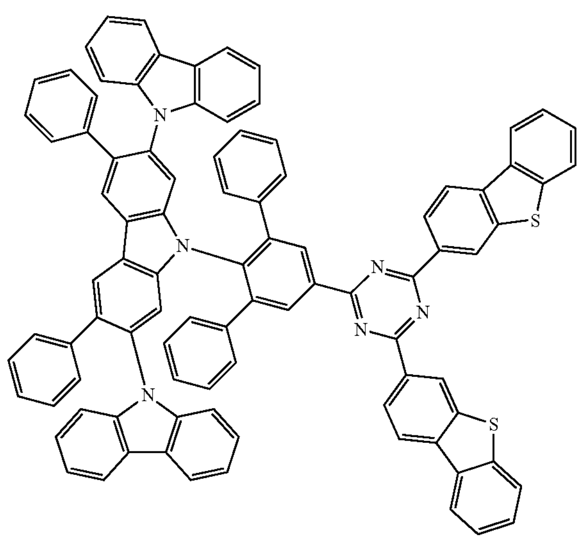
-continued
431
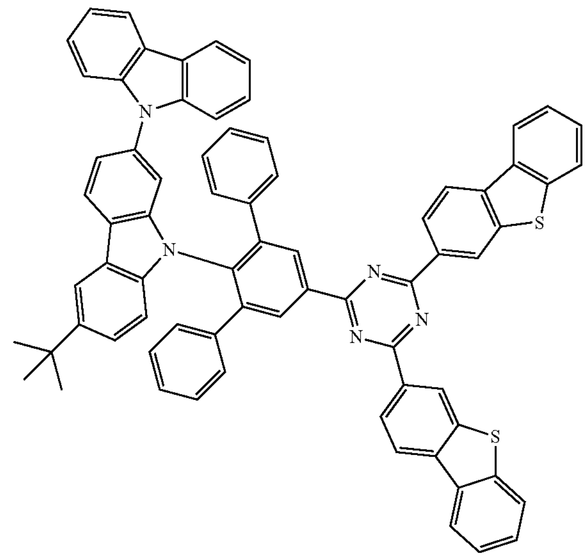
432
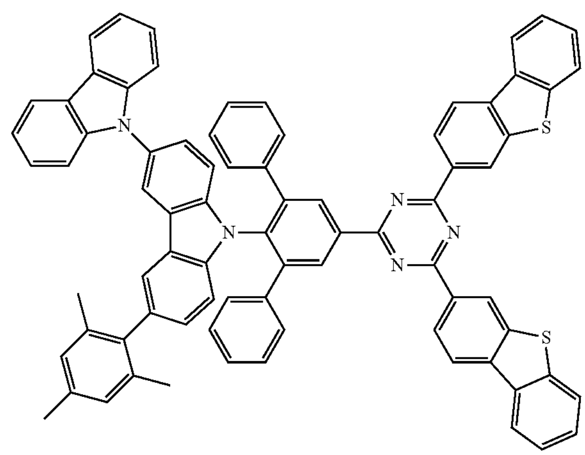
433
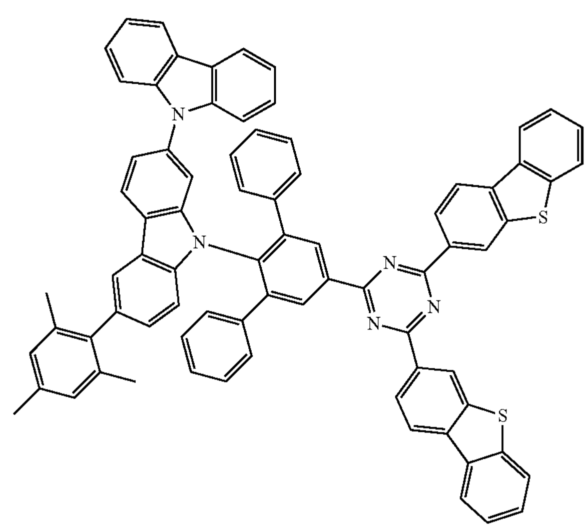

-continued
434
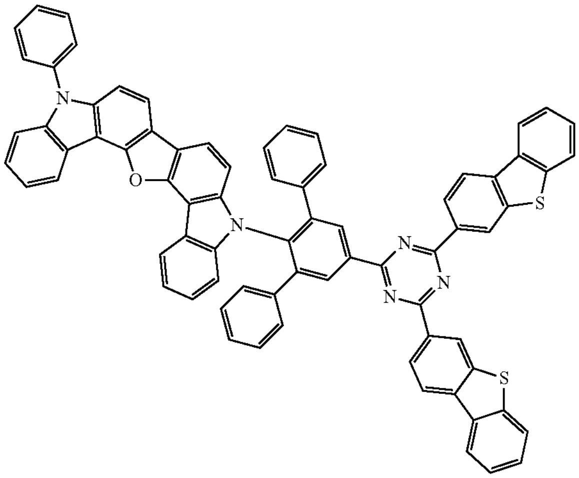
435
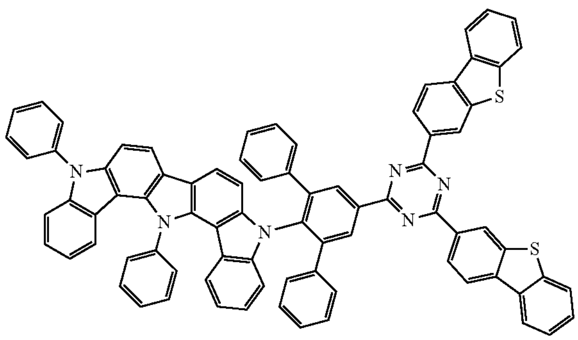
436
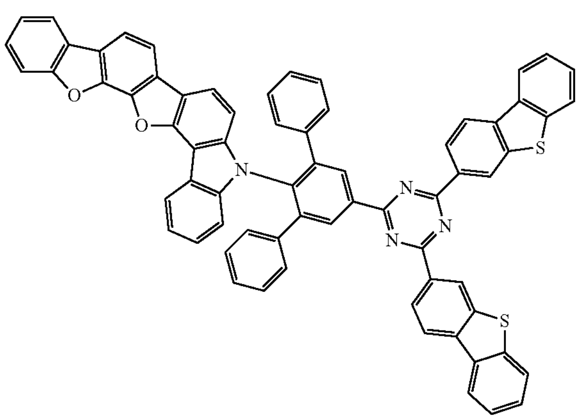
-continued
437
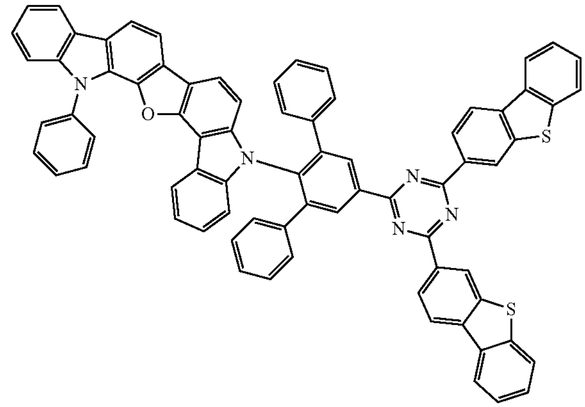
438
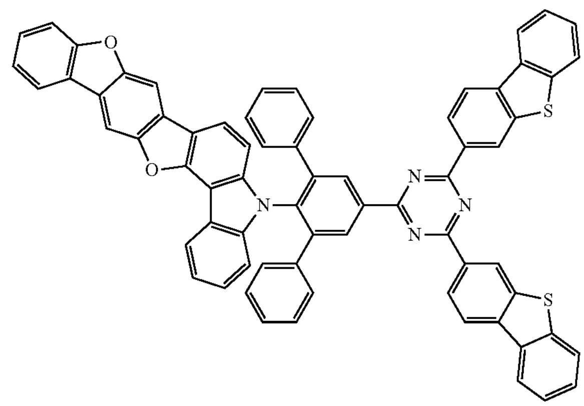
439
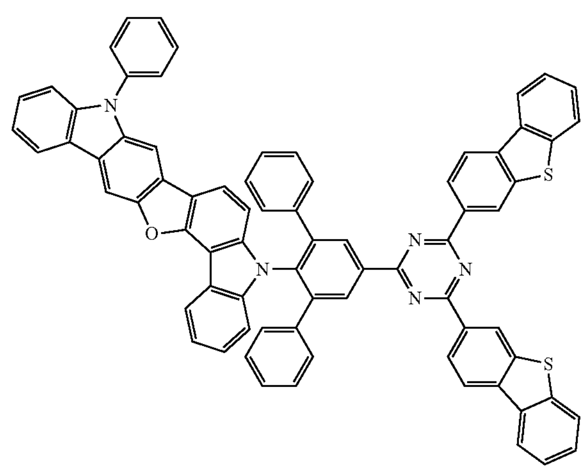

440
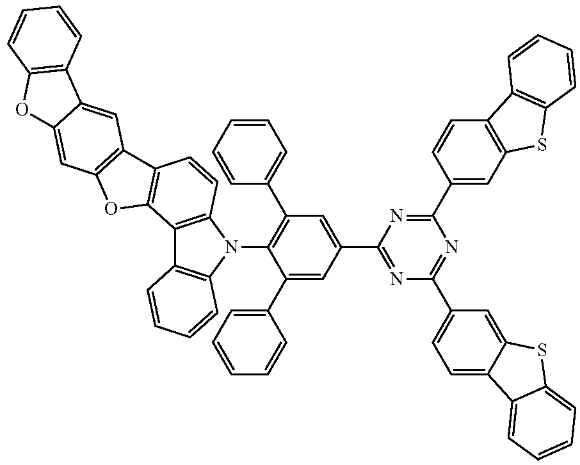
441
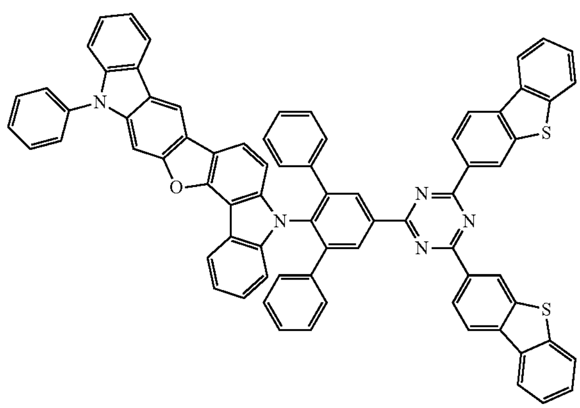
442
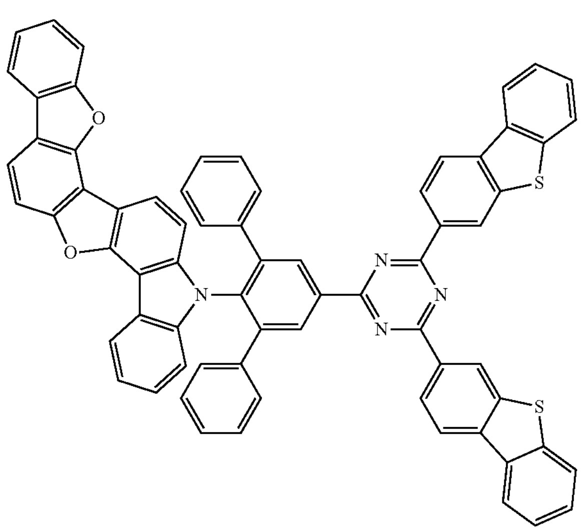
443
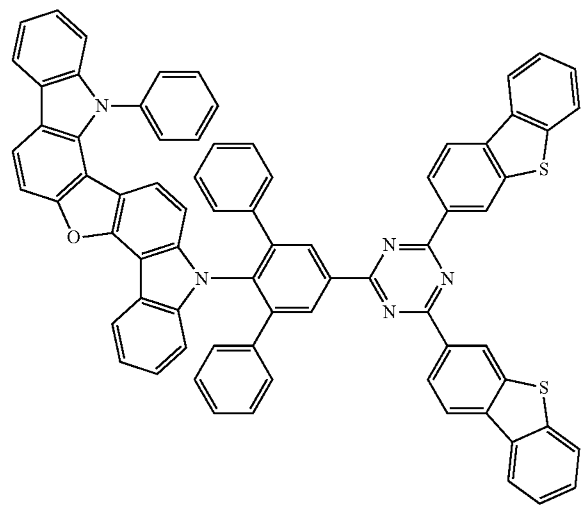
444
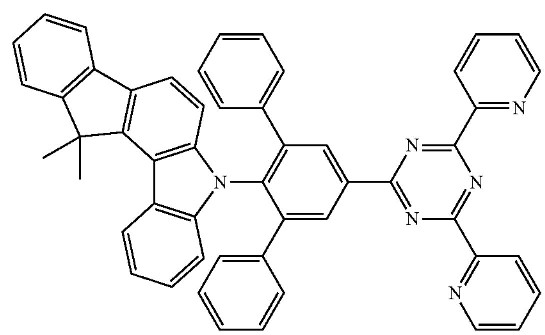
445
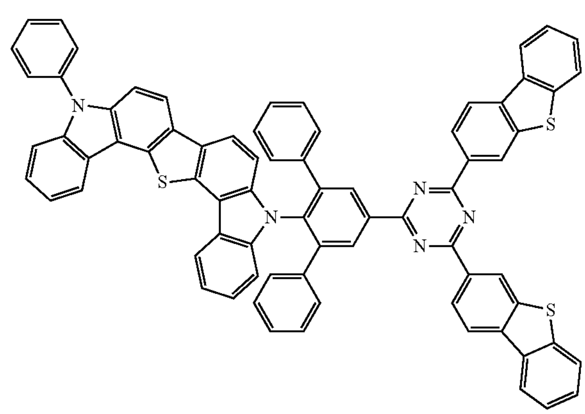

-continued
446
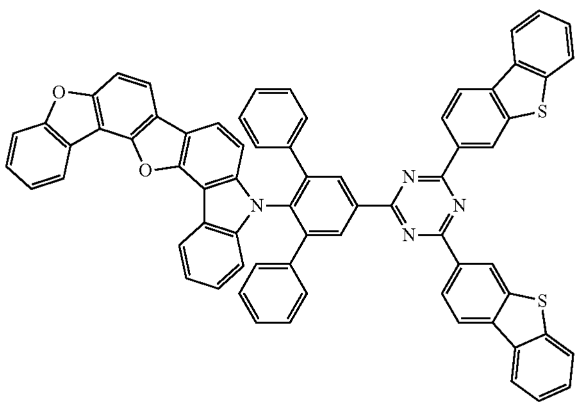
447
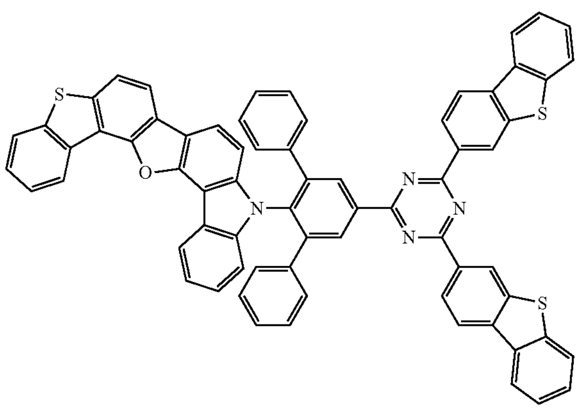
448
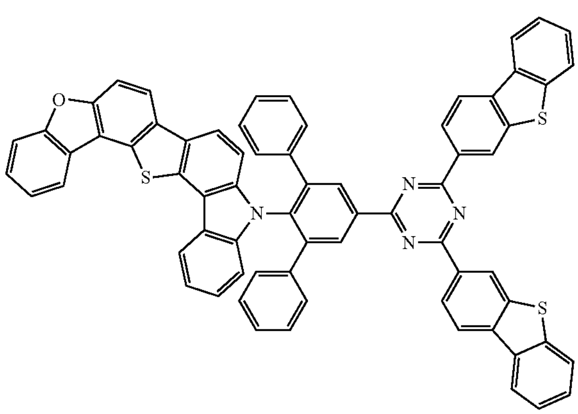
-continued
449
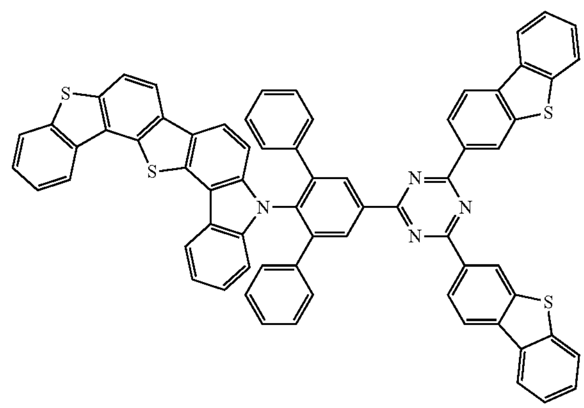
450
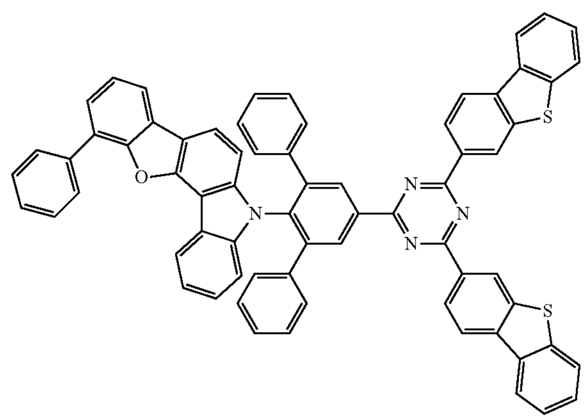
451
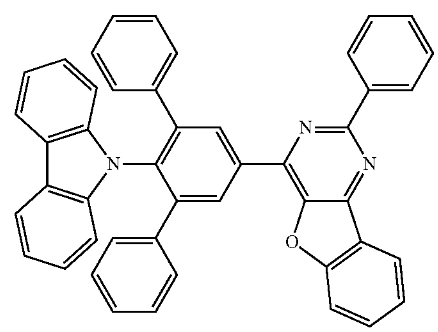
452
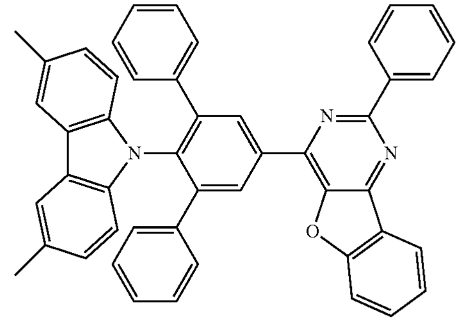

-continued
453
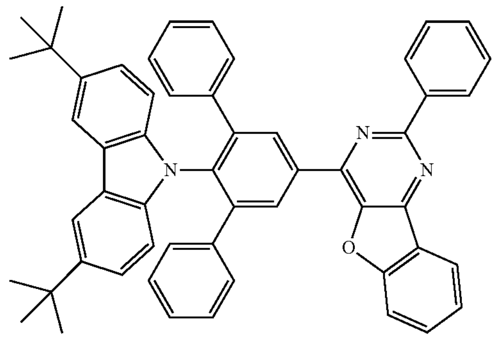
454
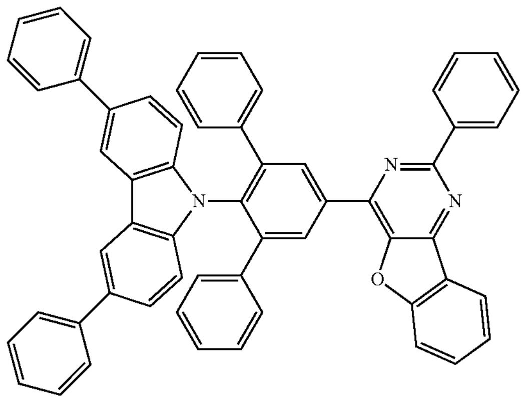
455
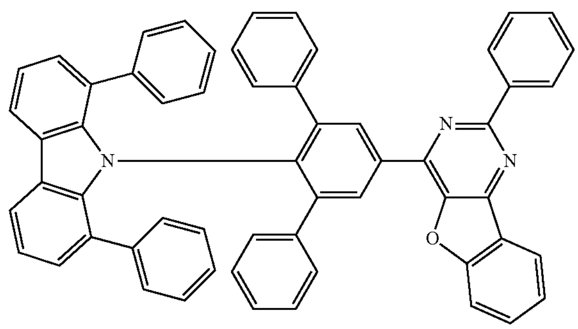
456
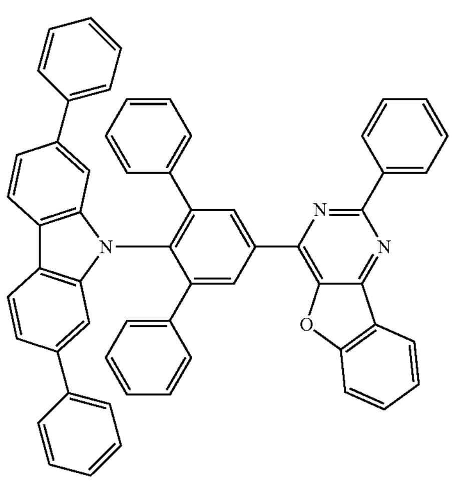
-continued
457
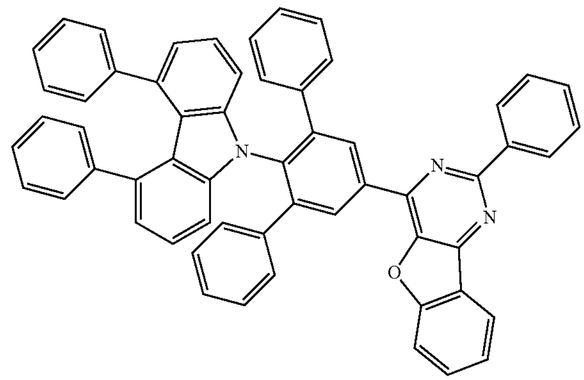
458
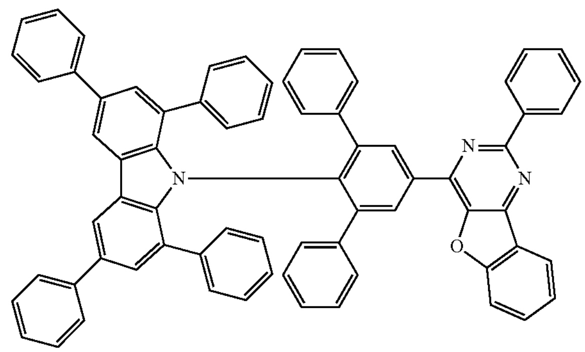
459
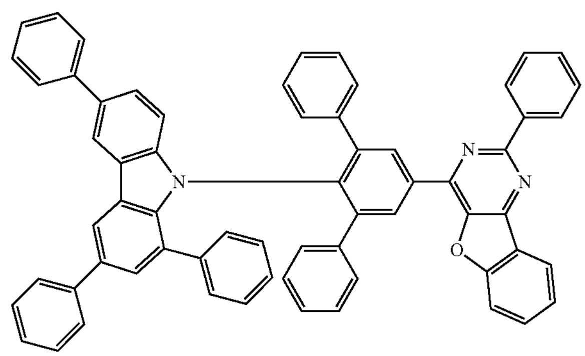
460
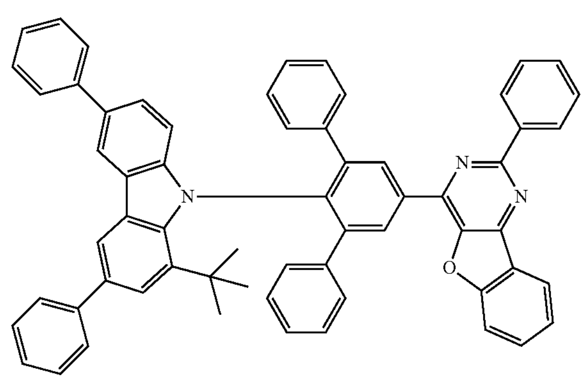

-continued
461
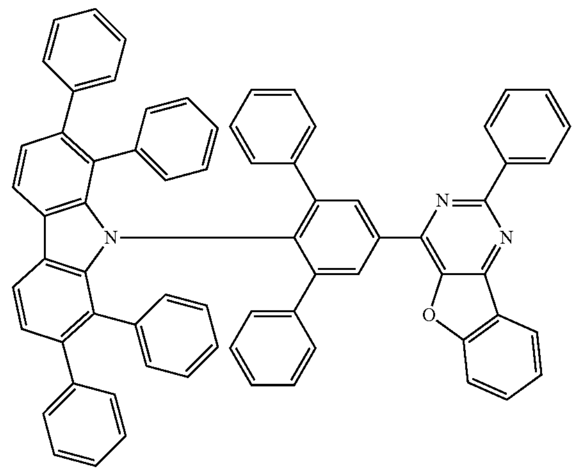
462
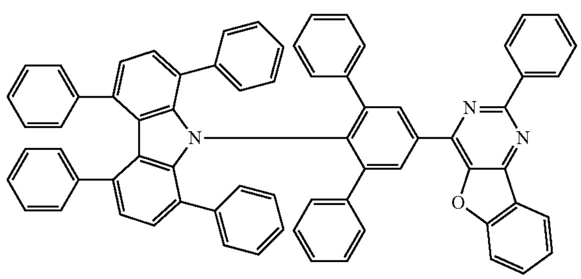
463
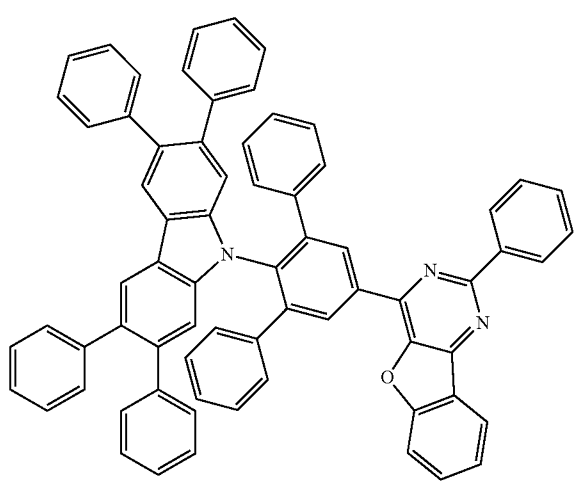
-continued
464
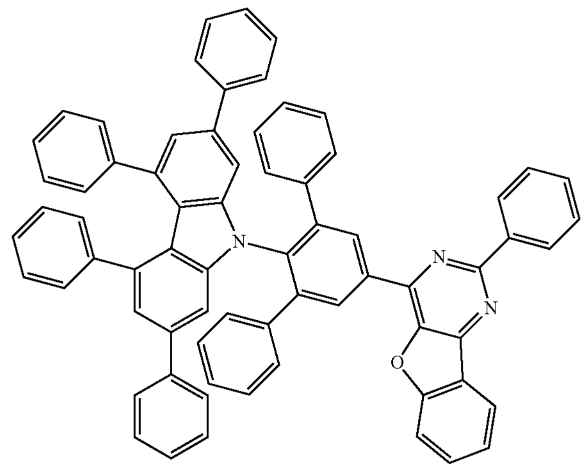
465
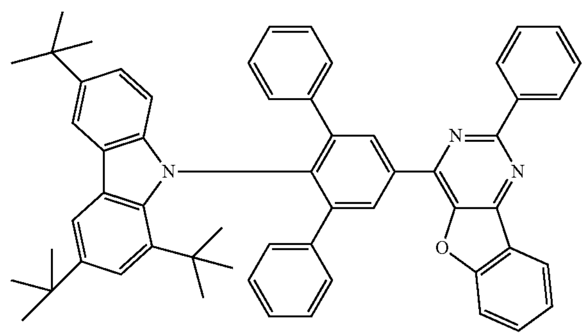
466
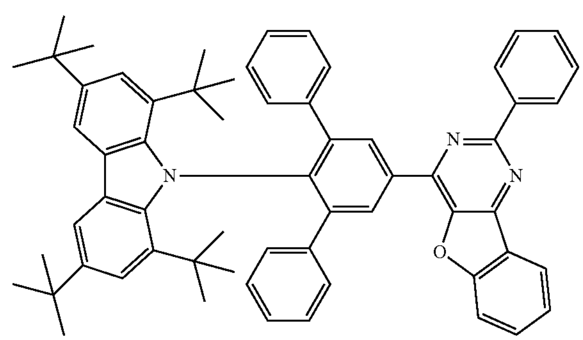
467
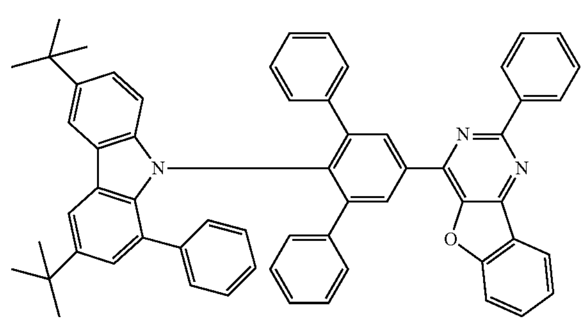

468
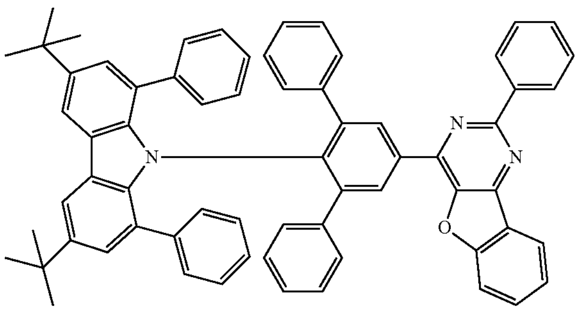
469
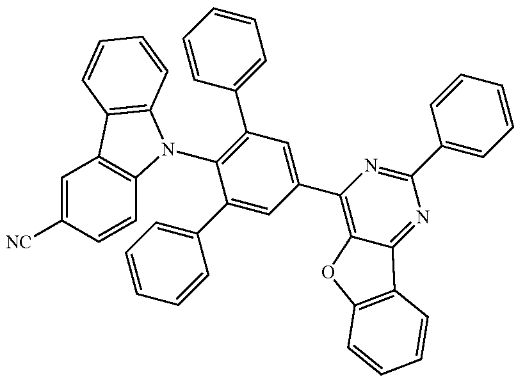
470
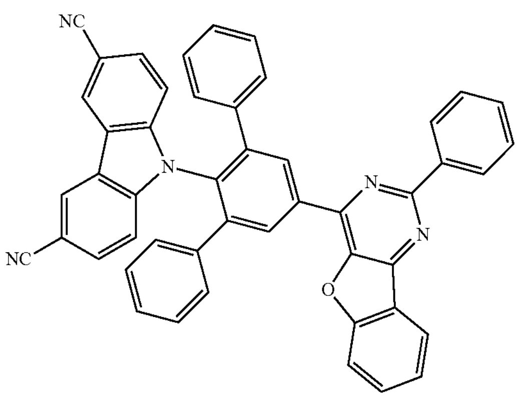
471
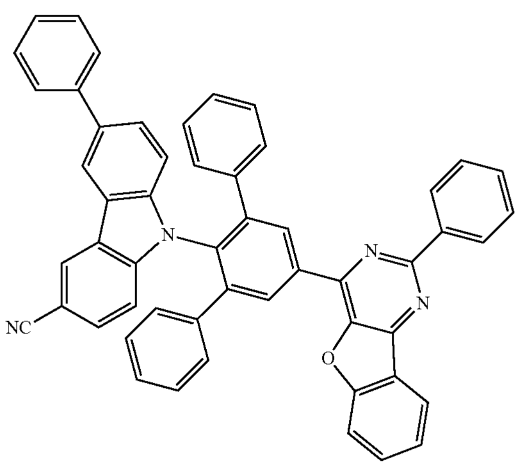
472
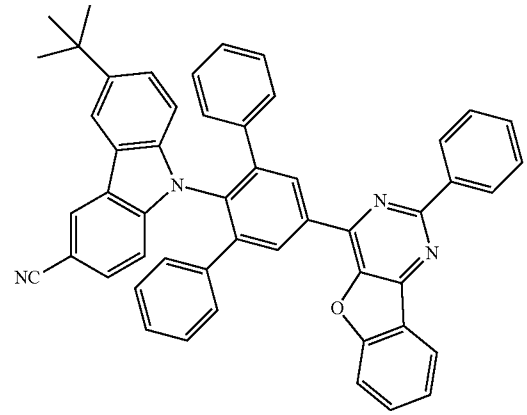
473
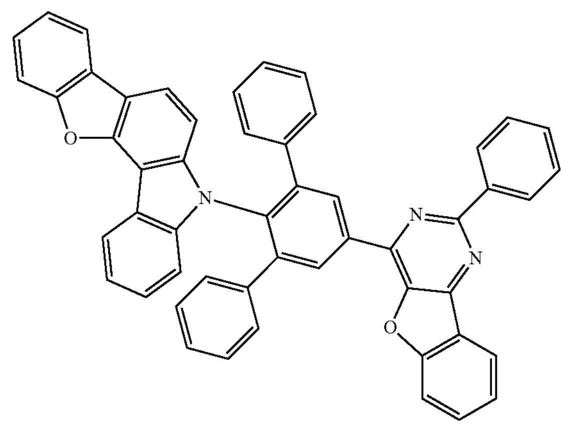
474
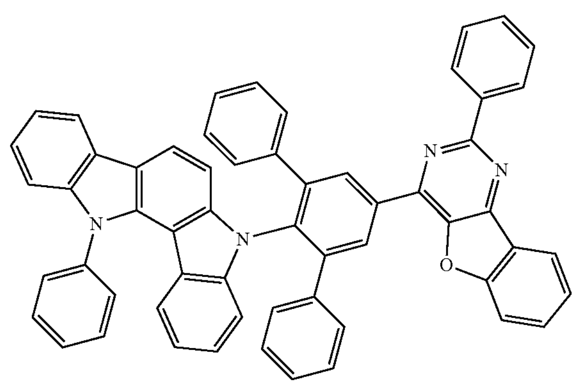

-continued
475
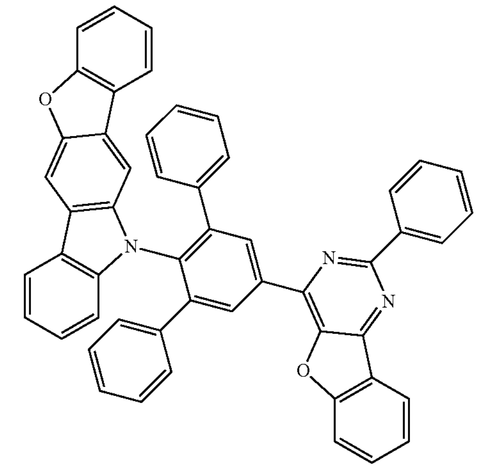
476
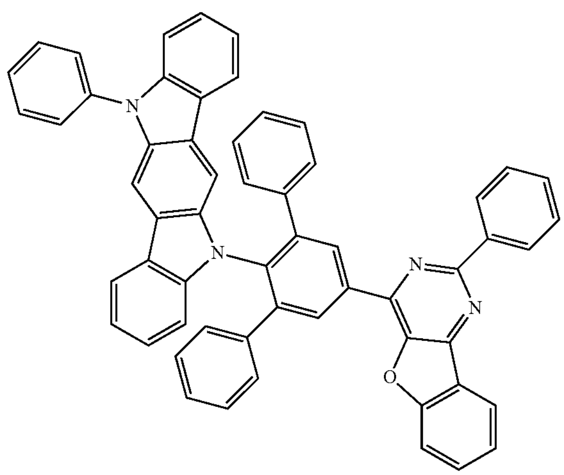
477
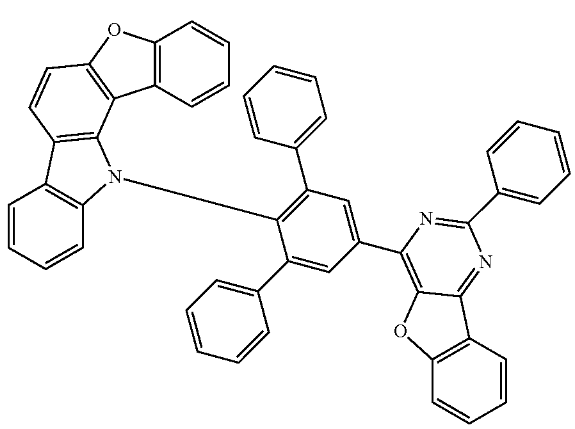
-continued
478
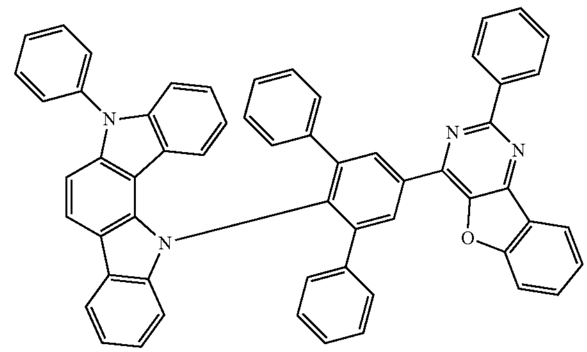
479
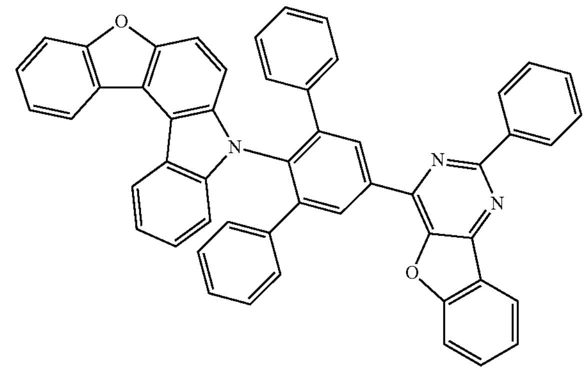
480
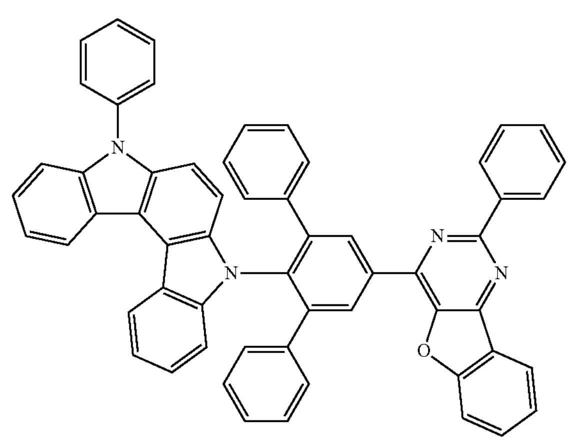

481
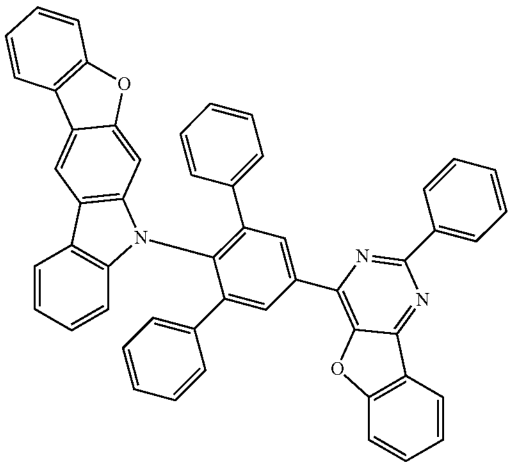
482
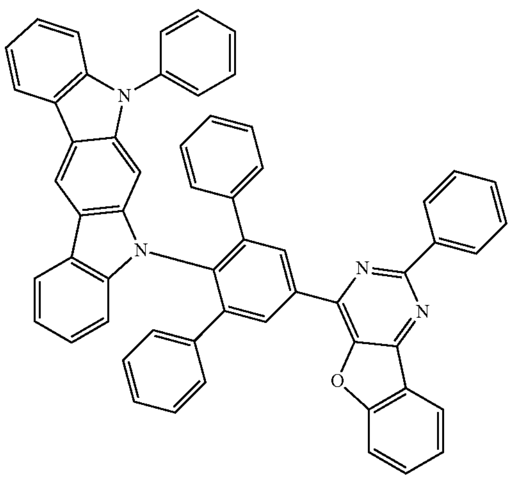
483
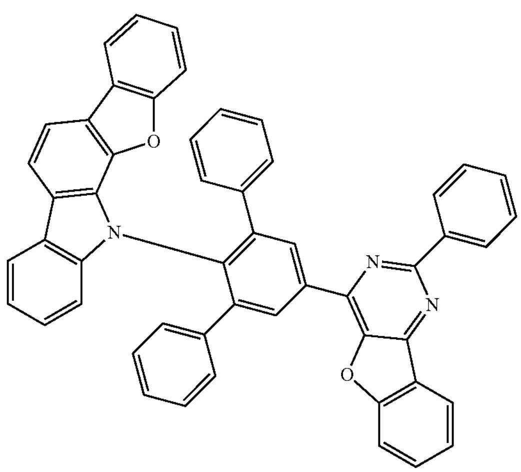
484
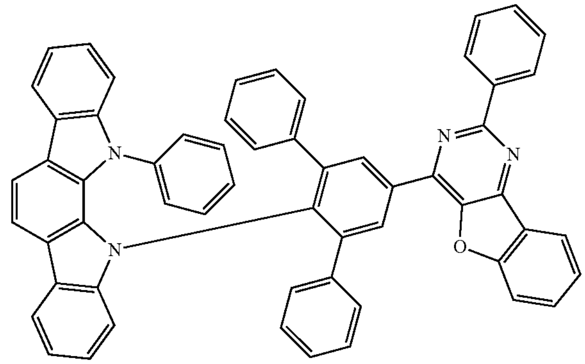
485
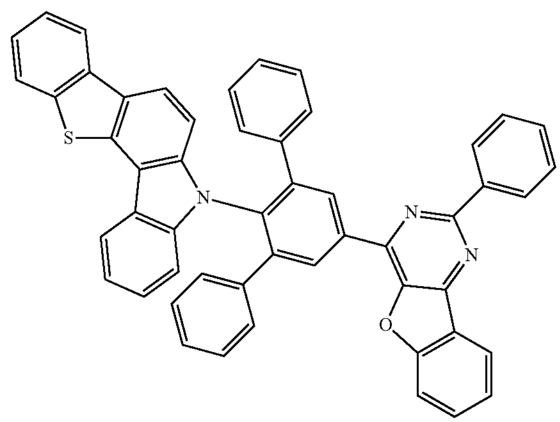
486
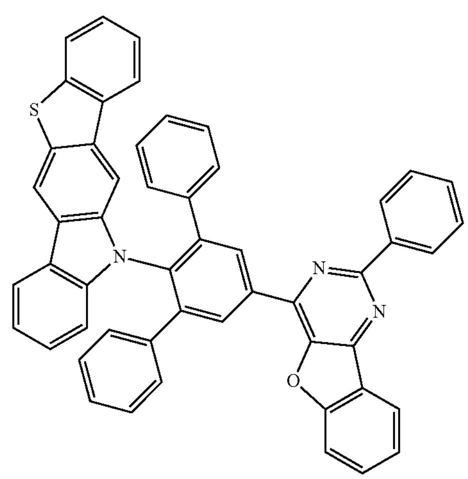

487
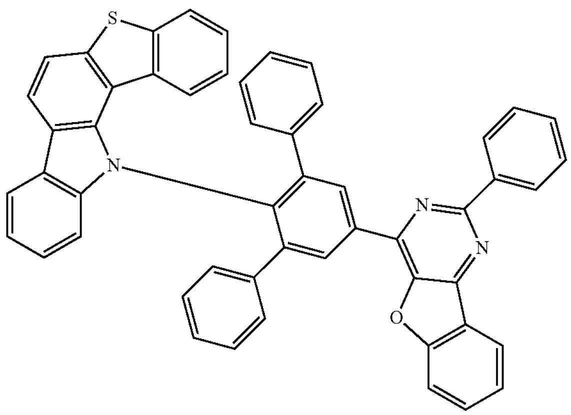
488
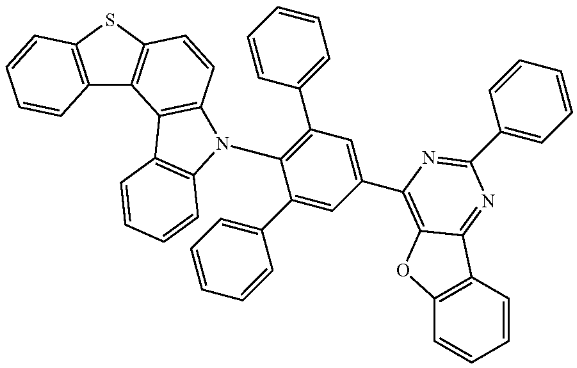
489
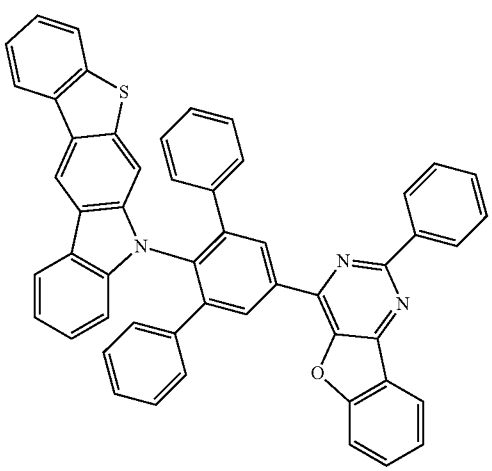
490
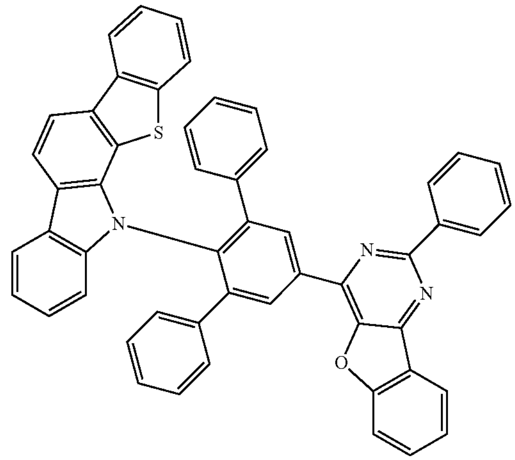
491
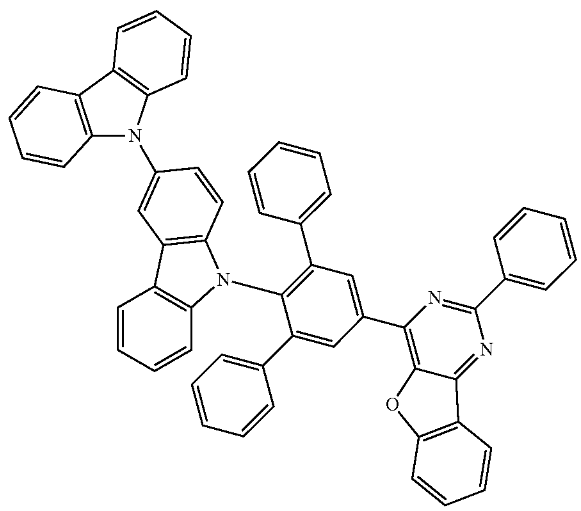
492
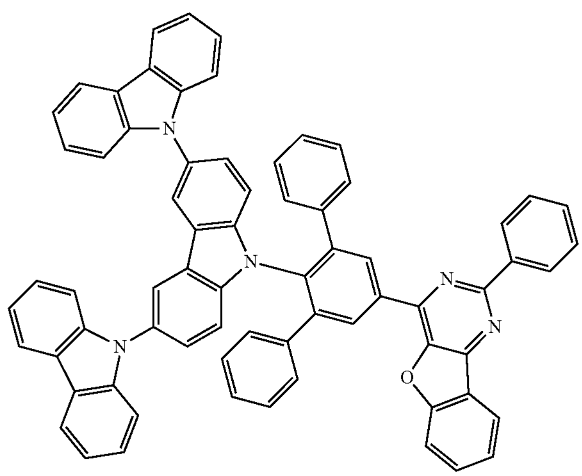

493
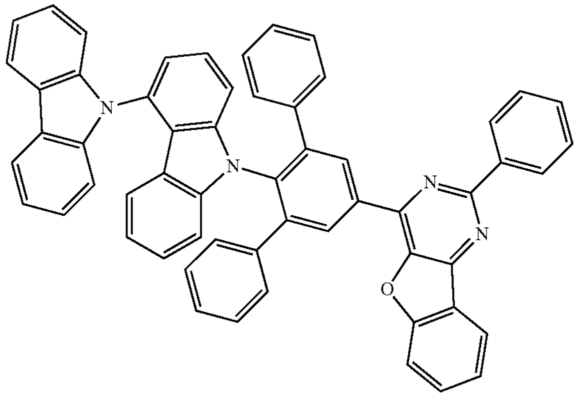
494
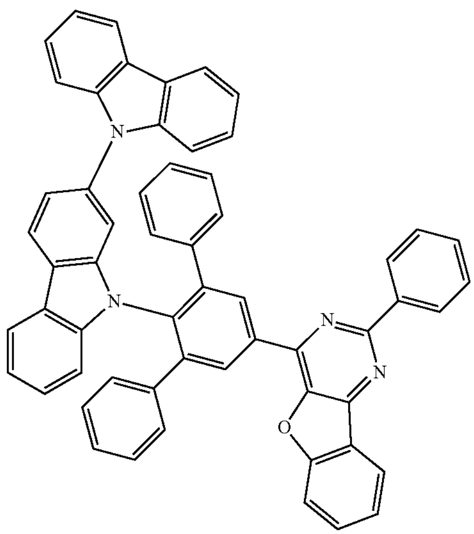
495
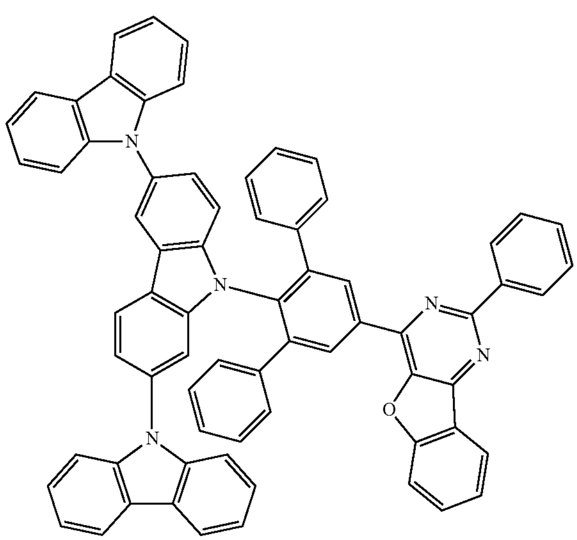
496
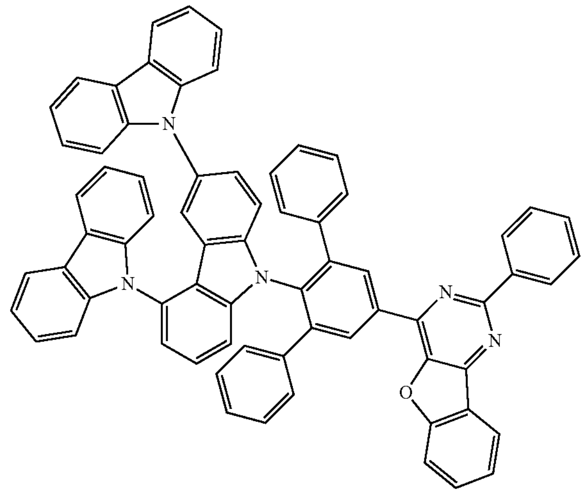
497
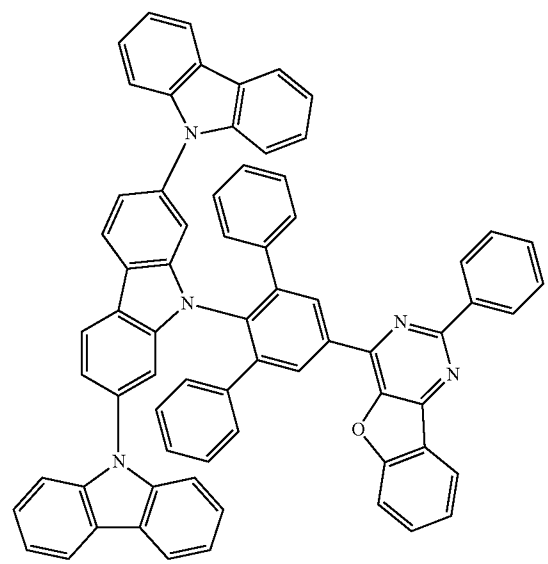
498
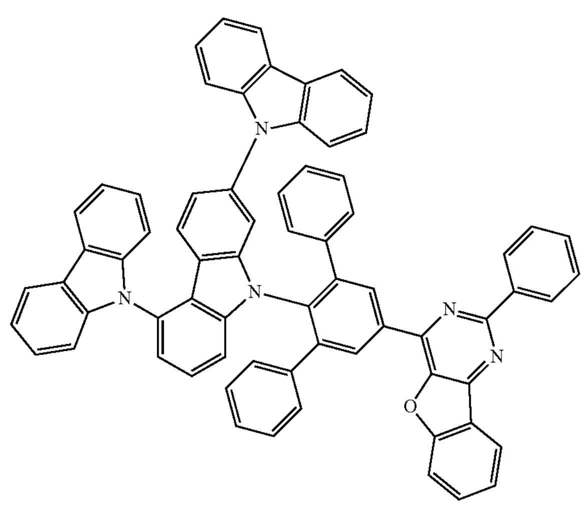

-continued
499
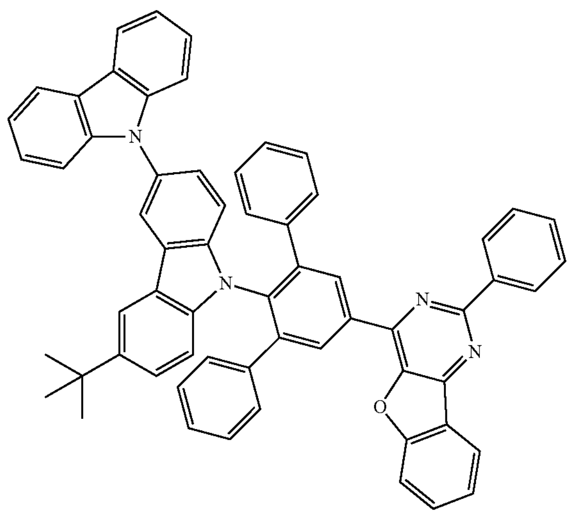
500
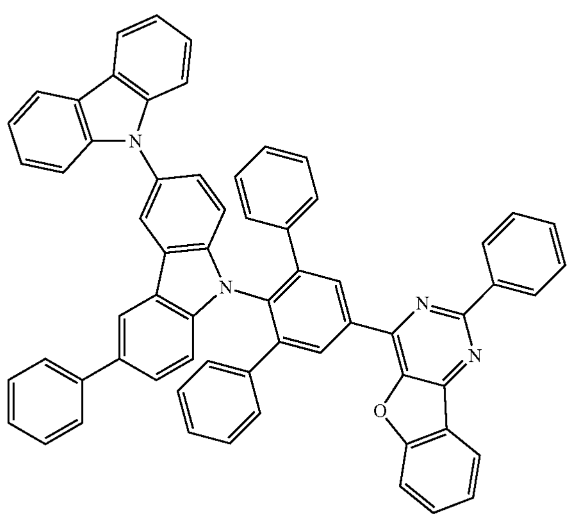
501
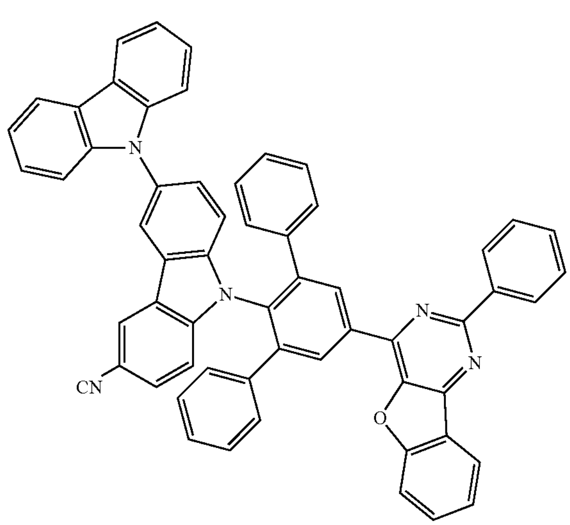
-continued
502
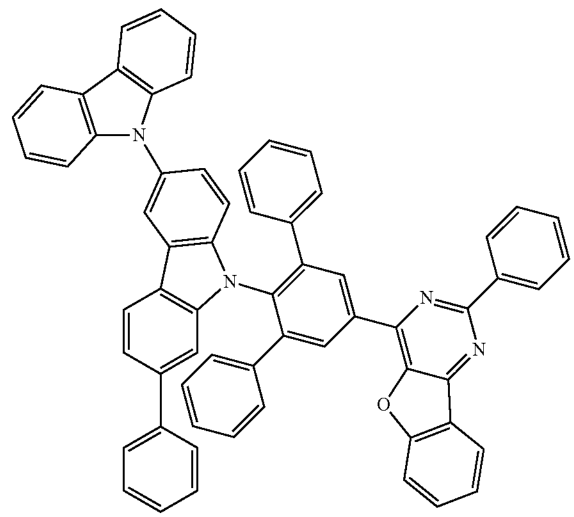
503
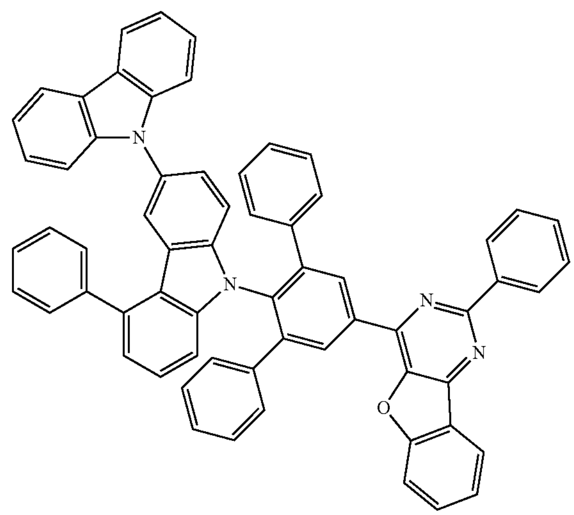
504
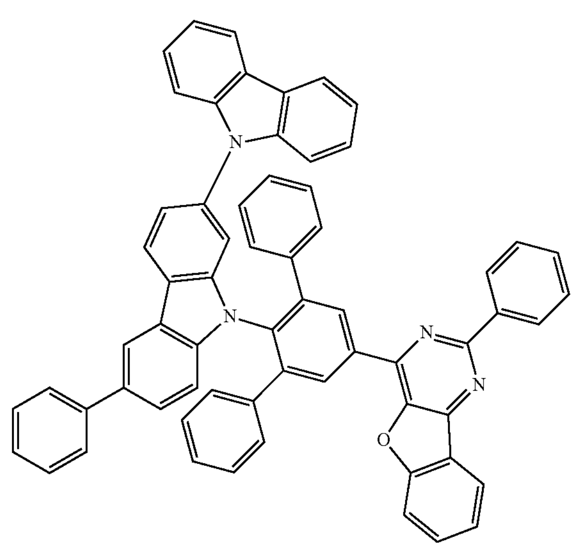

-continued
505
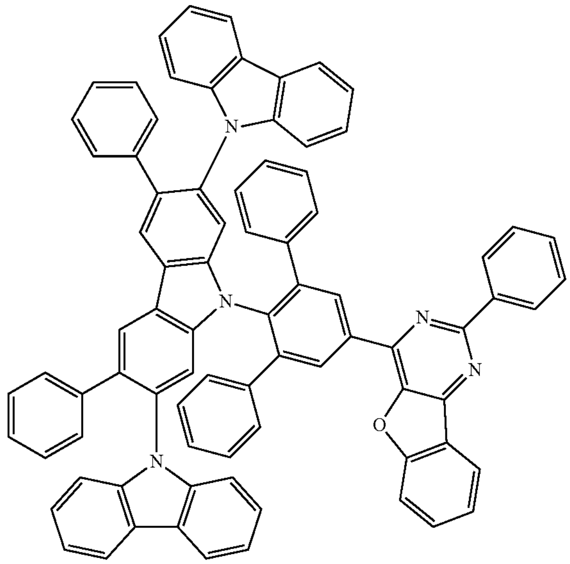
506
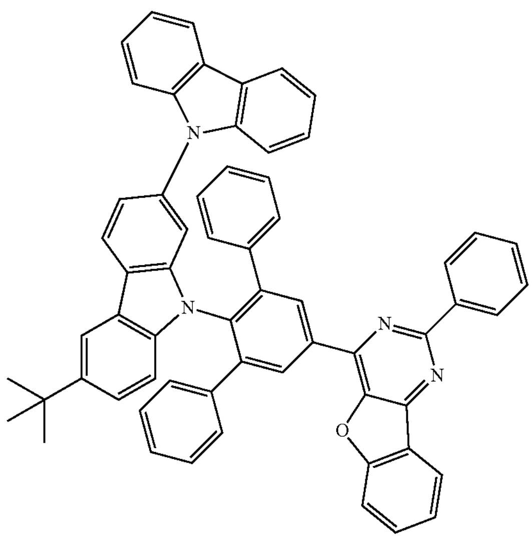
507
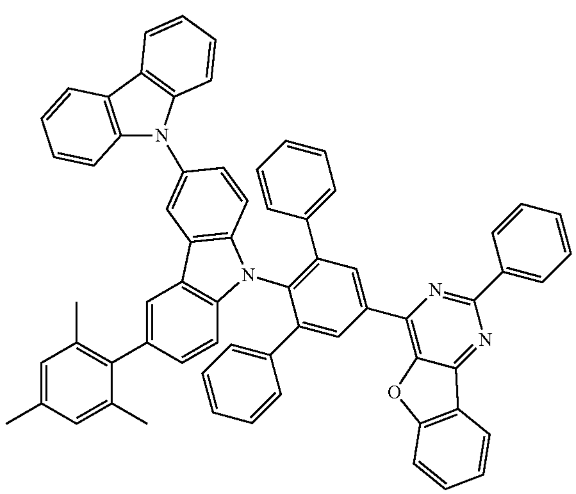
-continued
508
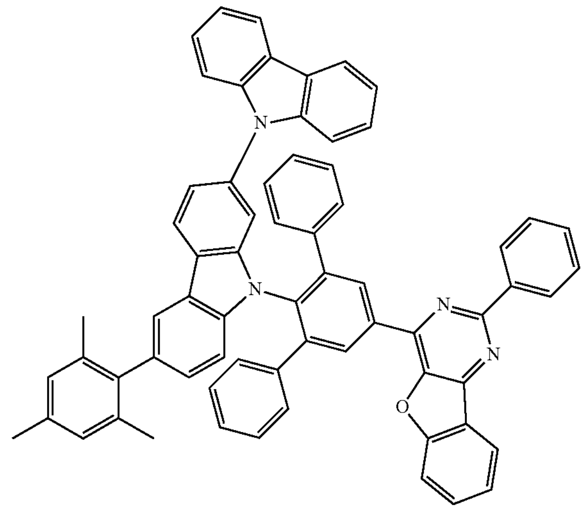
509
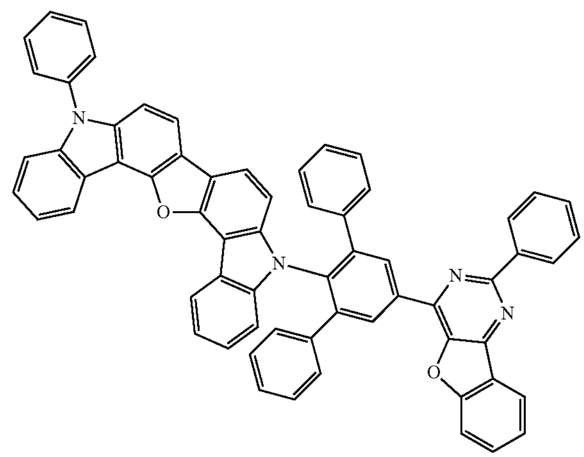
510
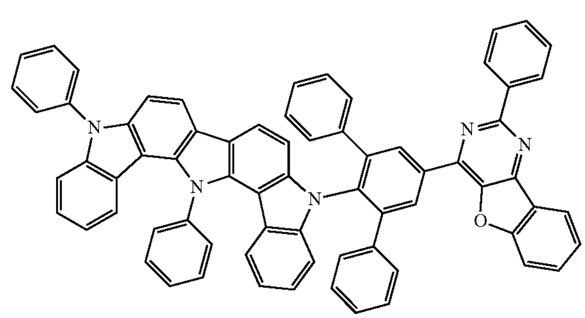

-continued
511
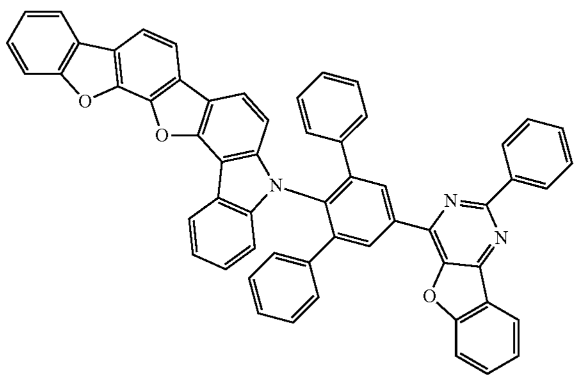
512
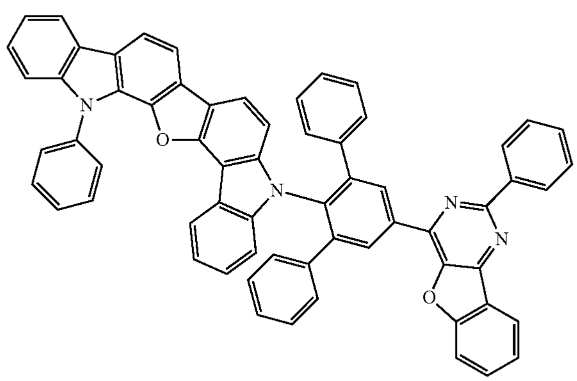
513
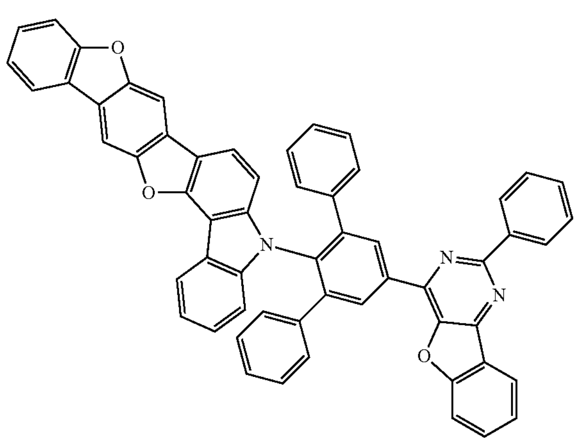
-continued
514
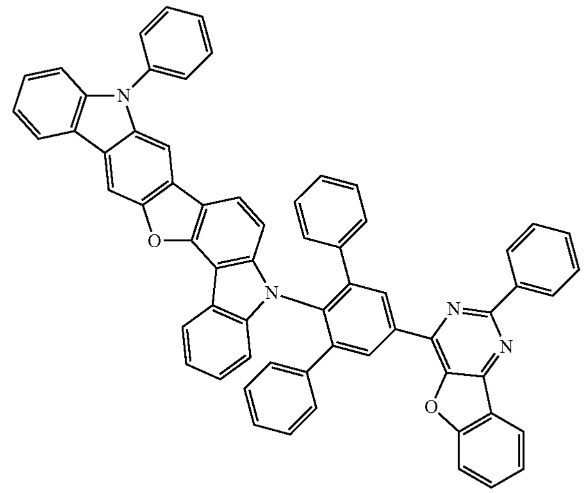
515
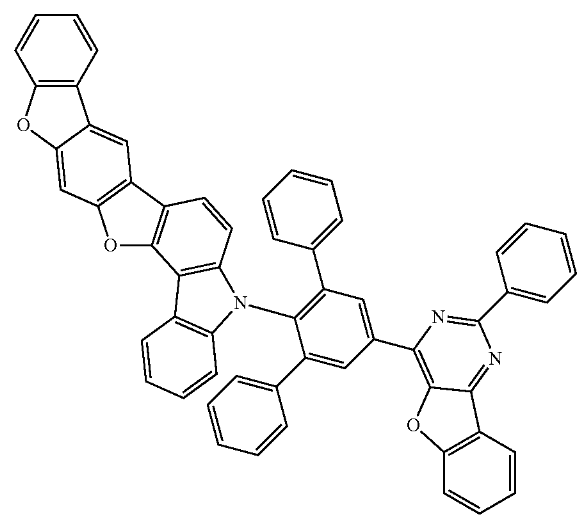
516
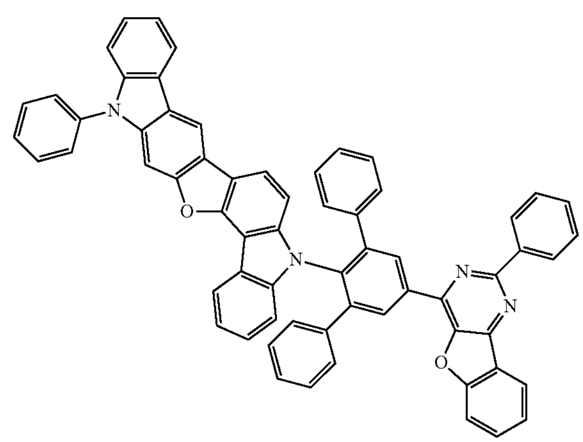

-continued
517
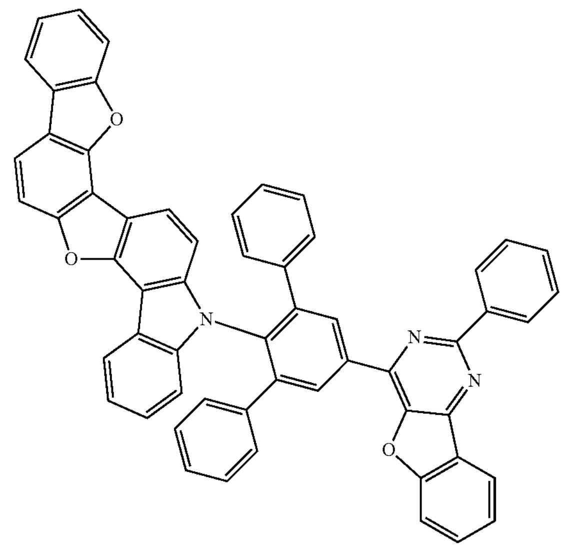
518
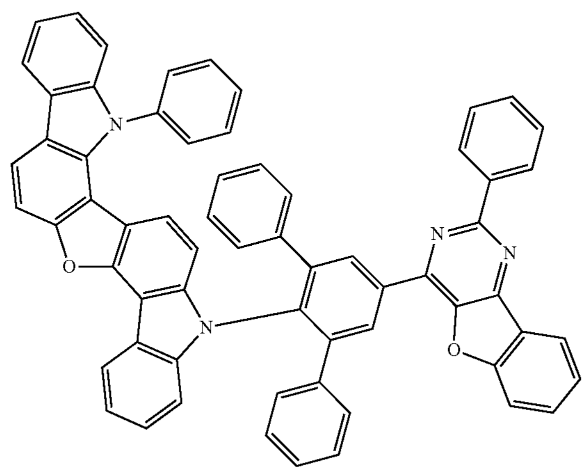
519
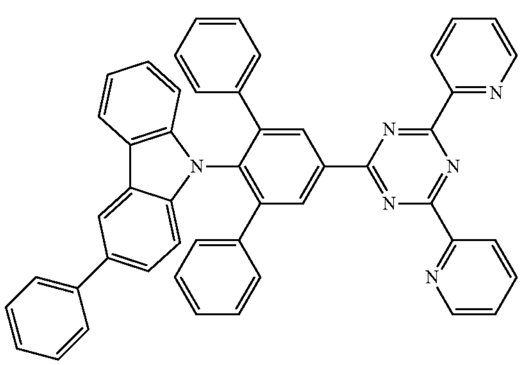
-continued
520
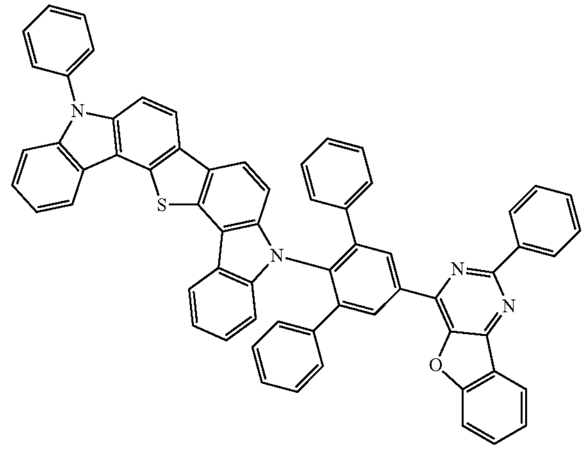
521
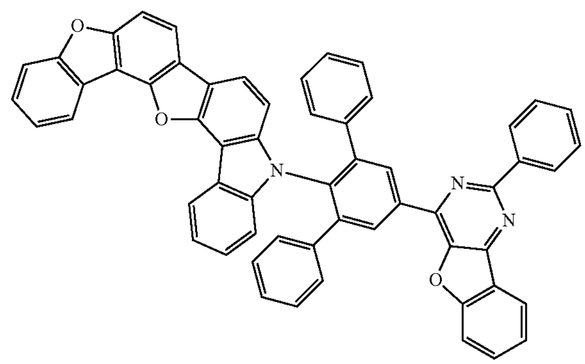
522
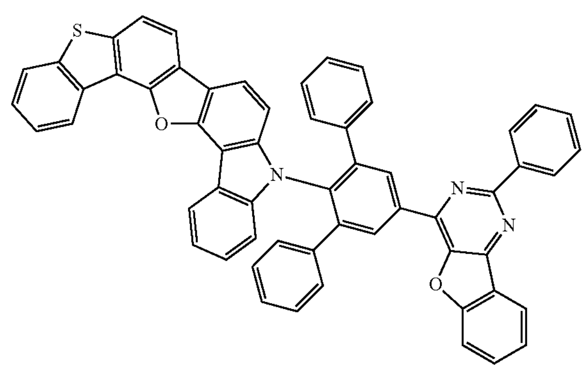
523
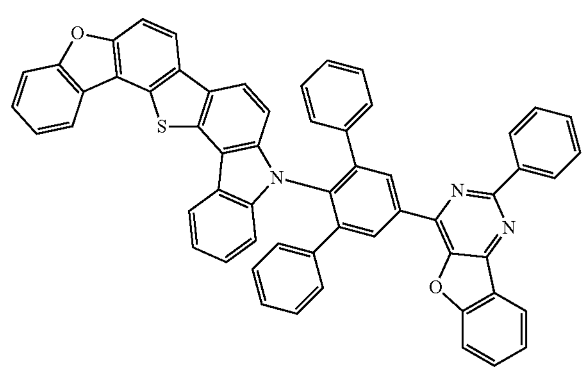

524
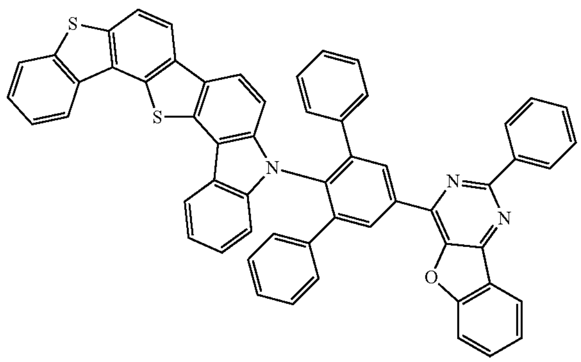
525
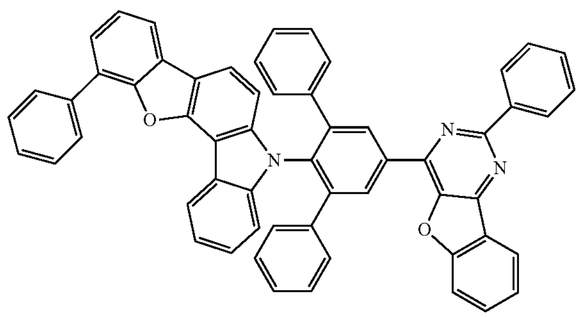
526
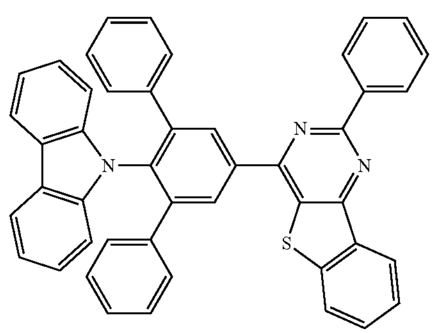
527
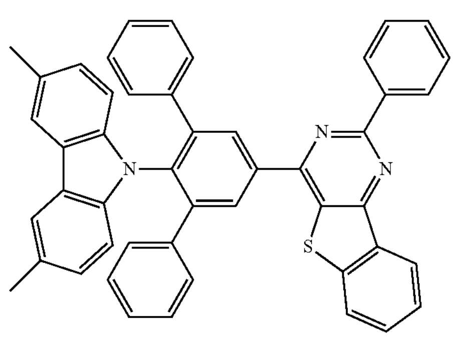
528
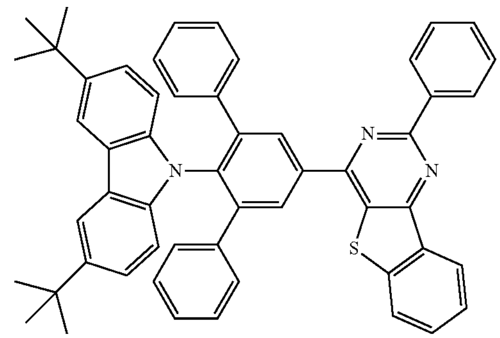
529
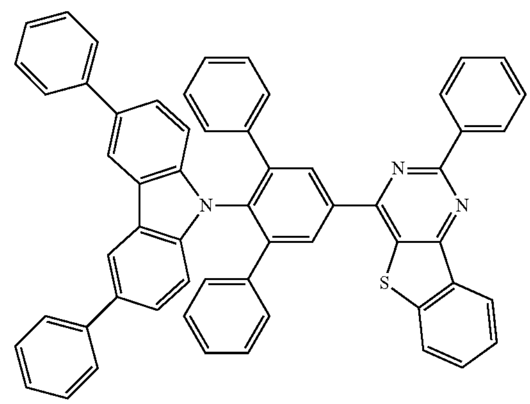
530
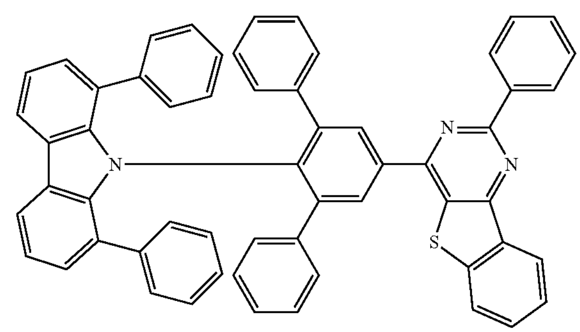
531
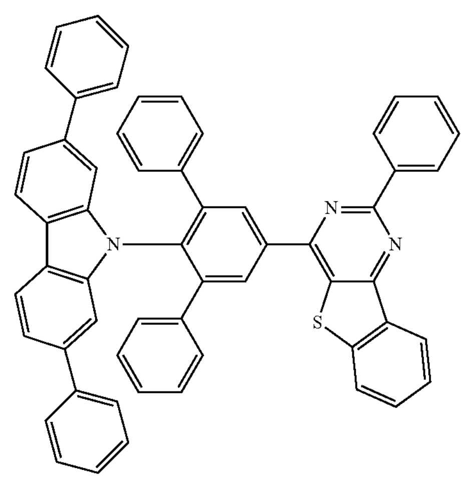

532
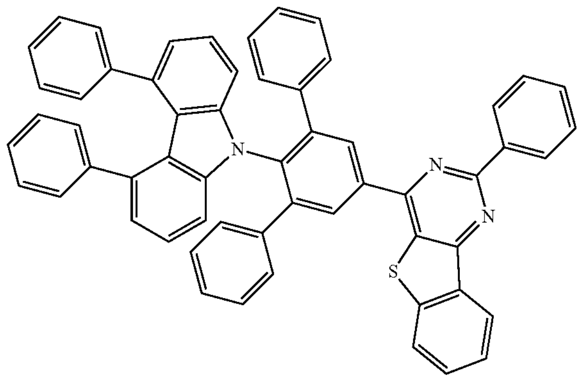
533
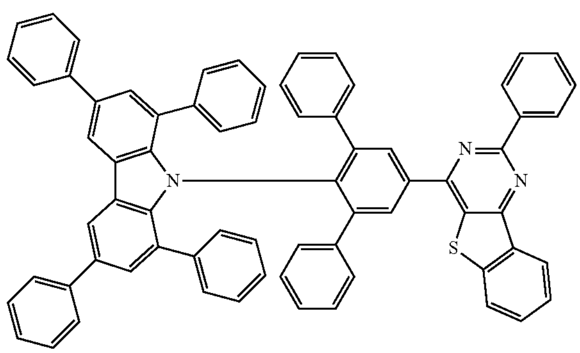
534
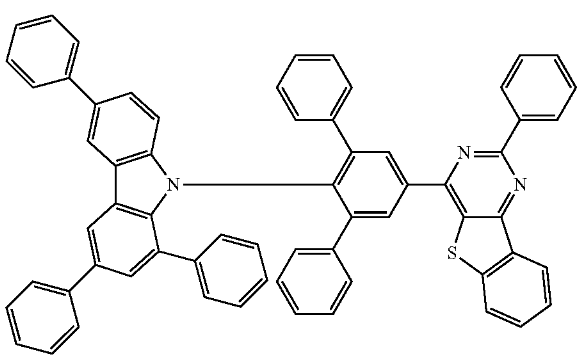
535
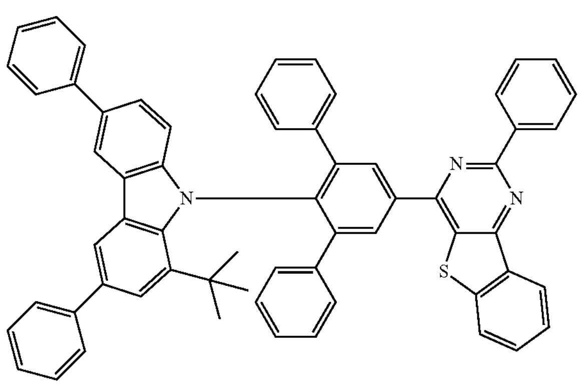
536
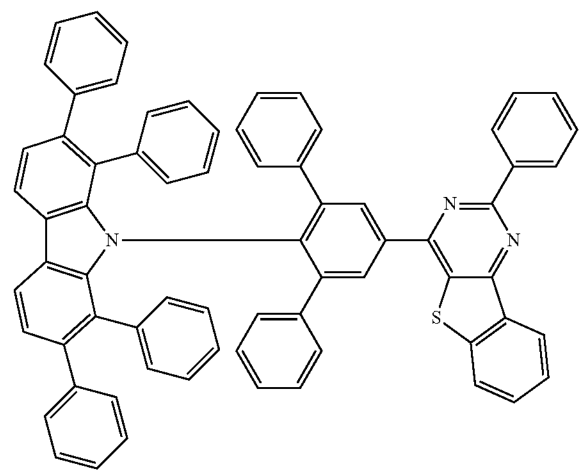
537
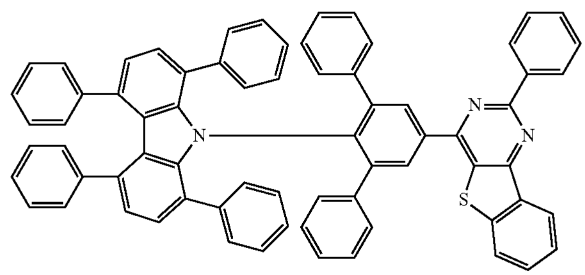
538
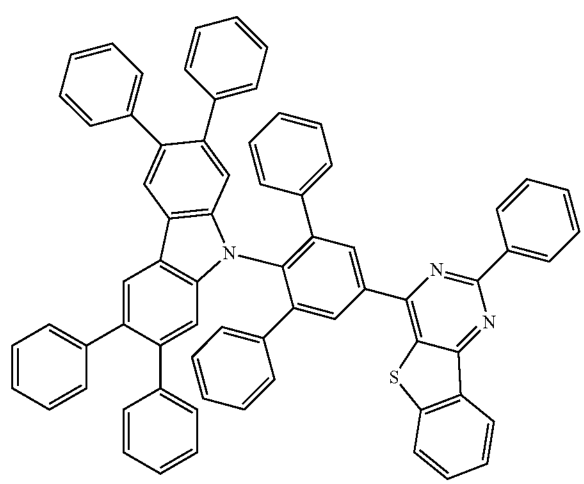

-continued
539
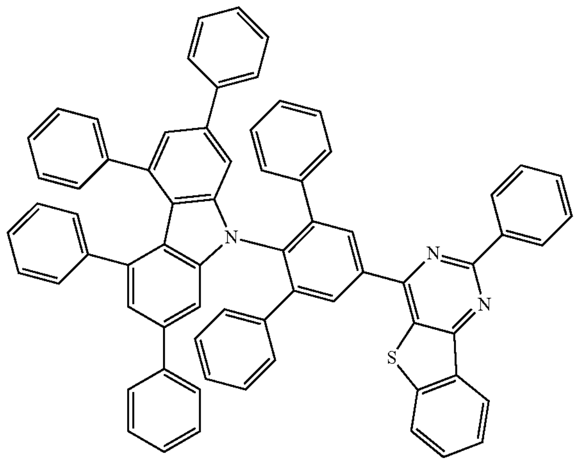
540
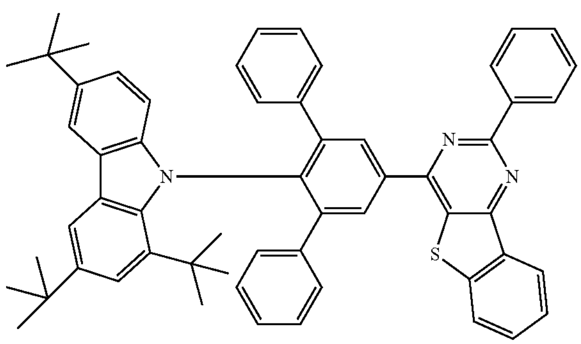
541
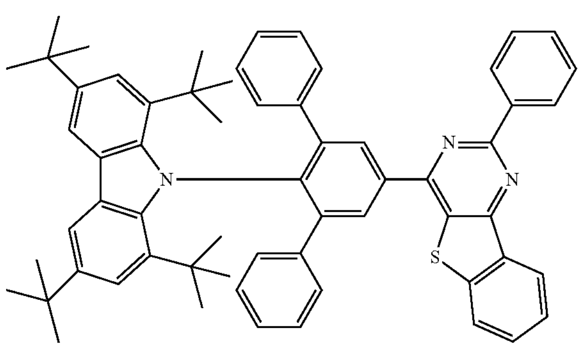
542
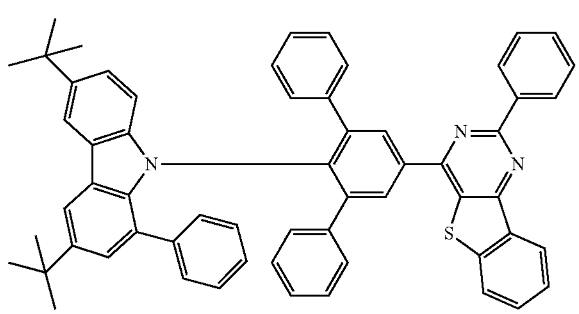
-continued
543
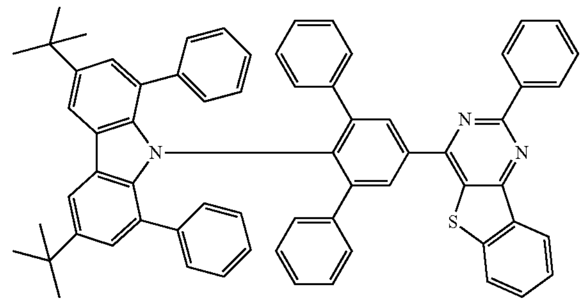
544
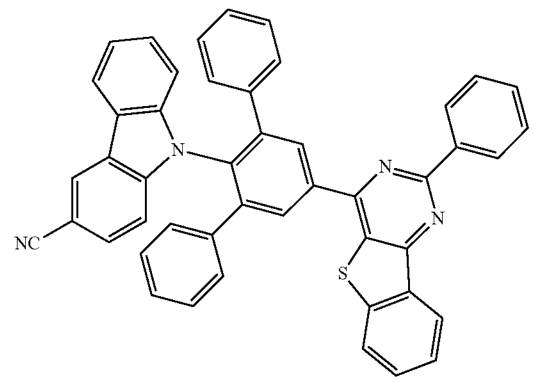
545
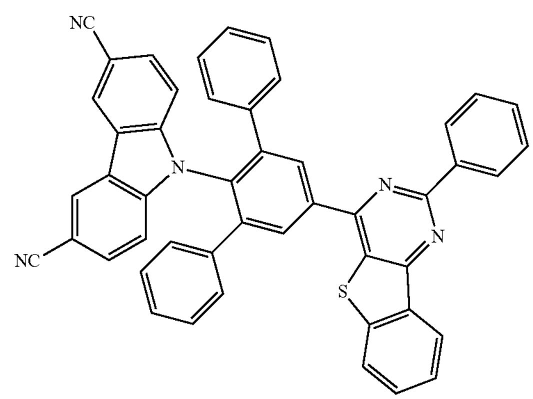
546
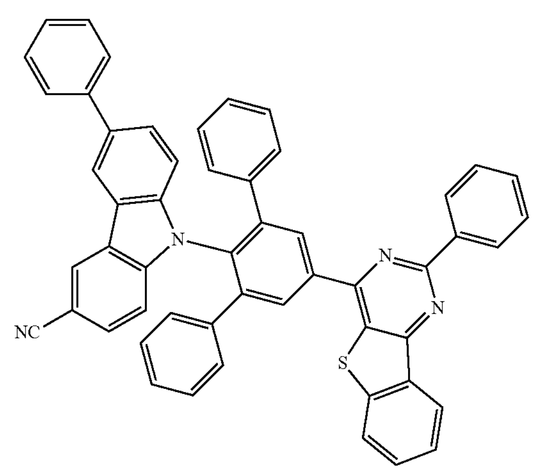

-continued
547
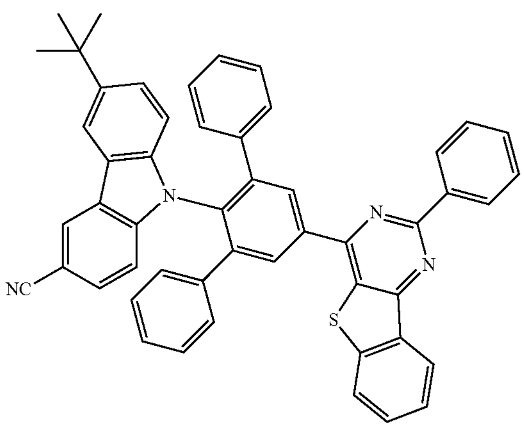
548
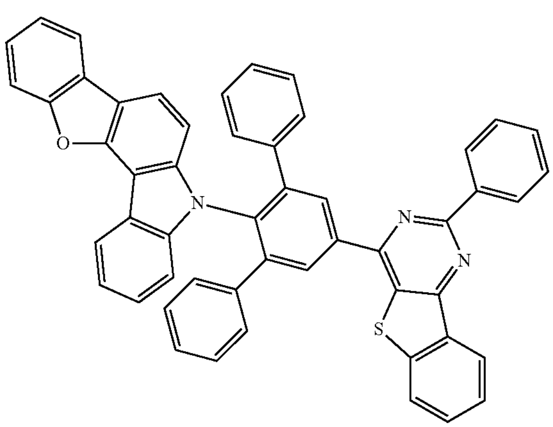
549
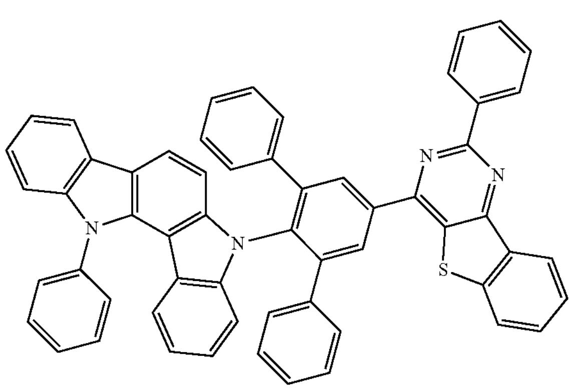
-continued
550
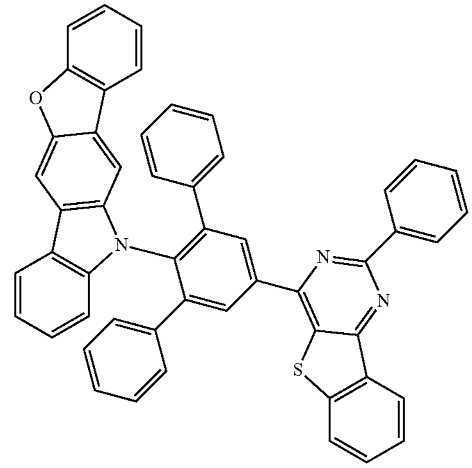
551
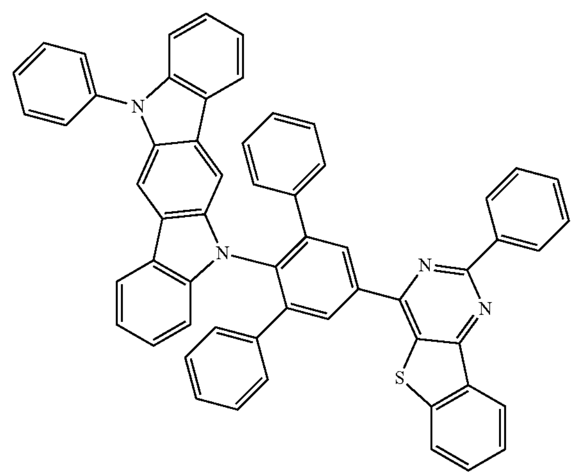
552
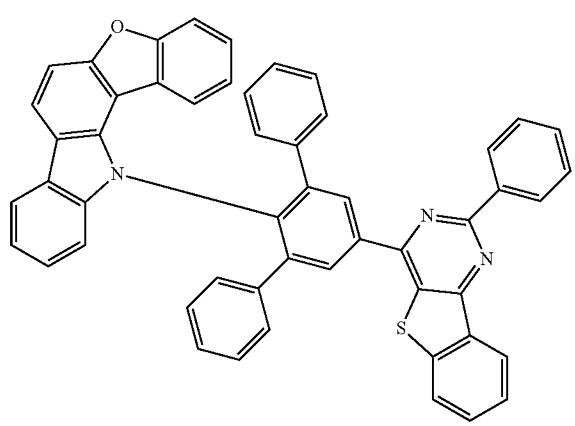

553
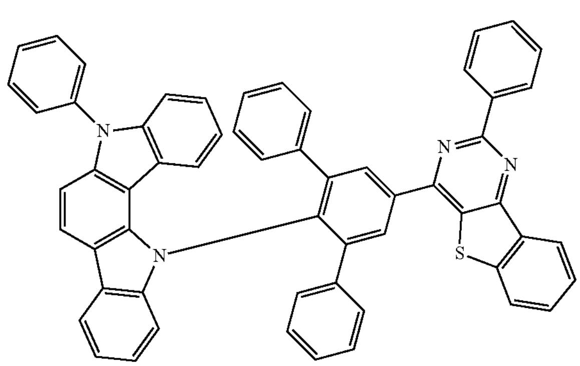
554
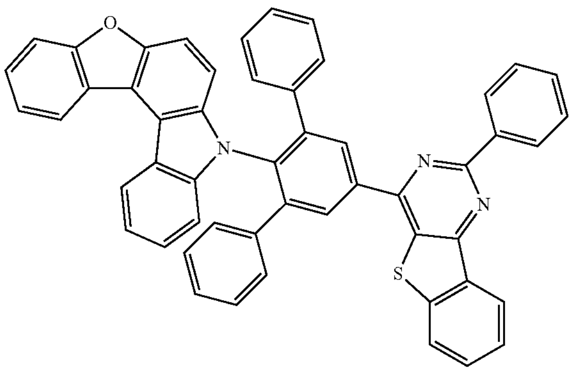
555
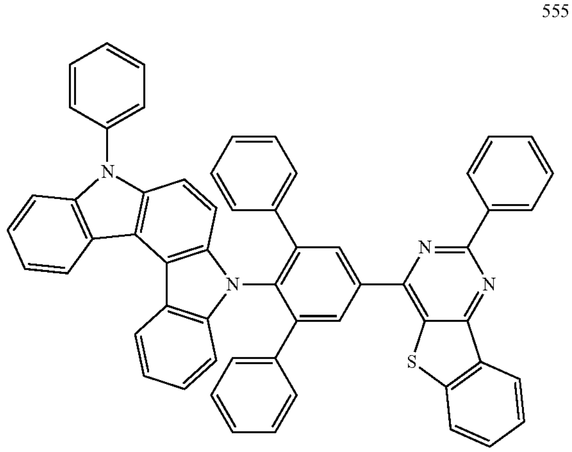
556
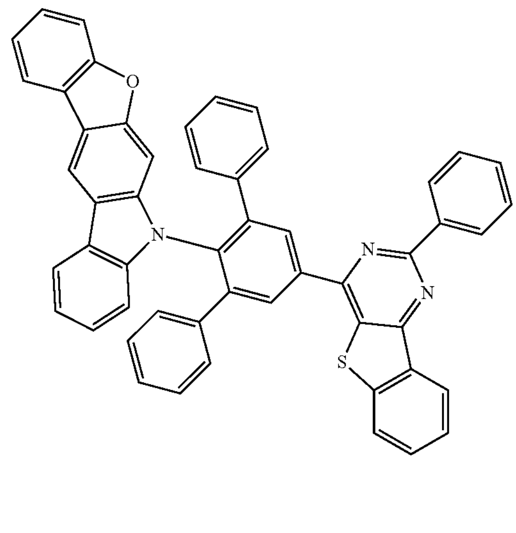
557
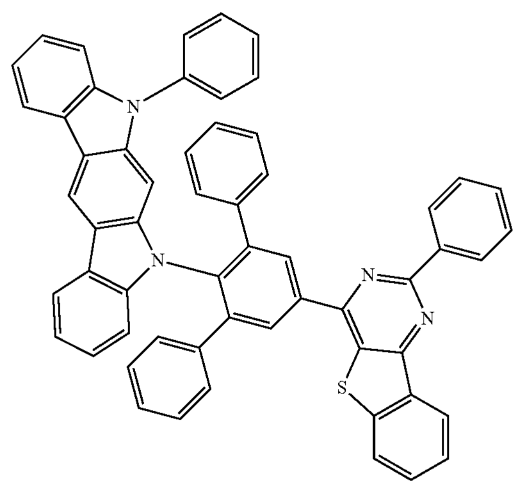
558
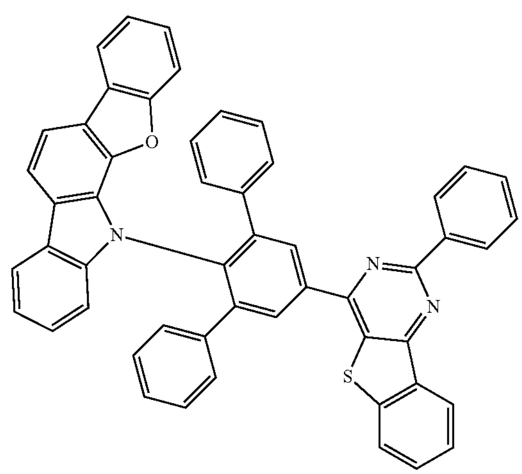

-continued
559
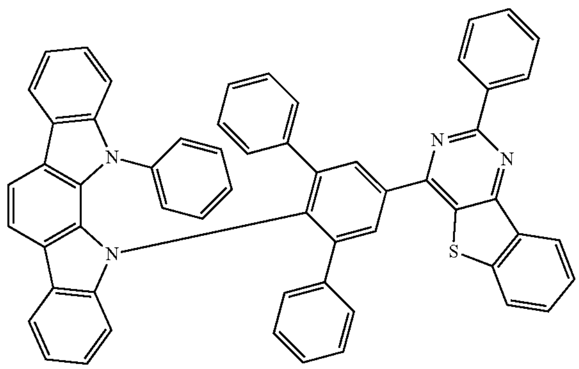
560
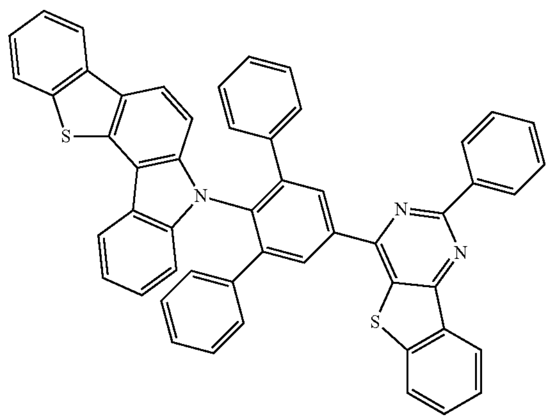
561
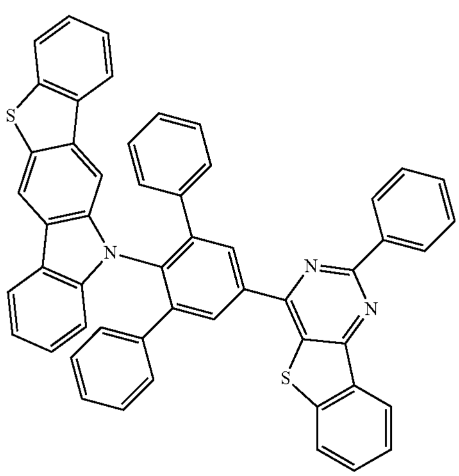
-continued
562
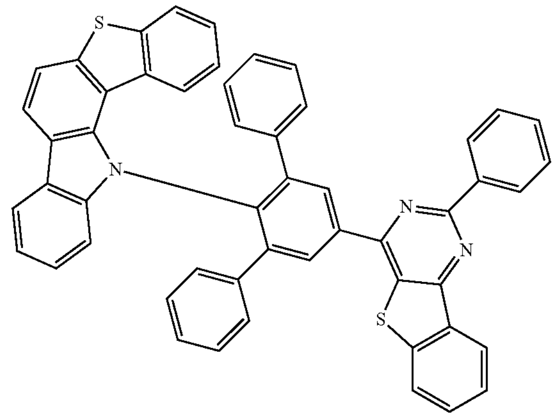
563
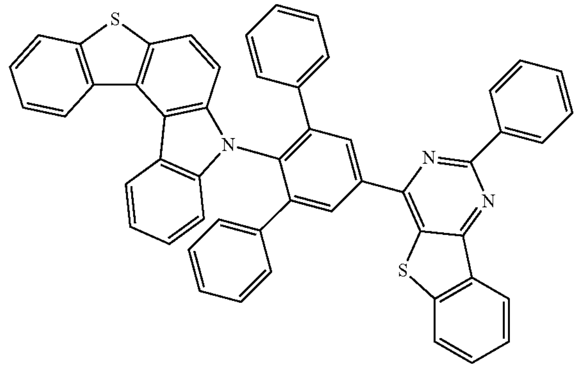
564
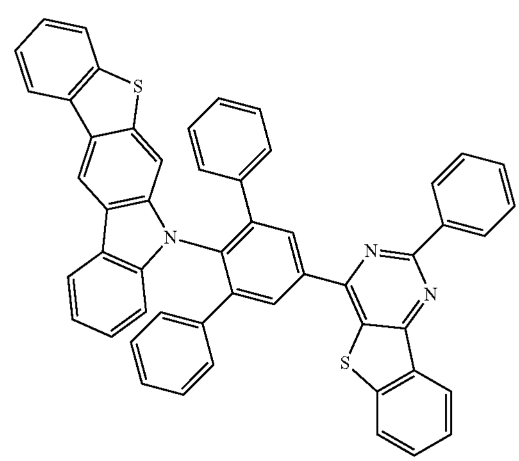

-continued
565
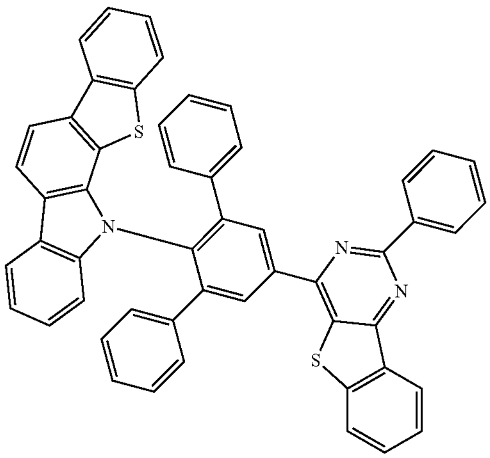
566
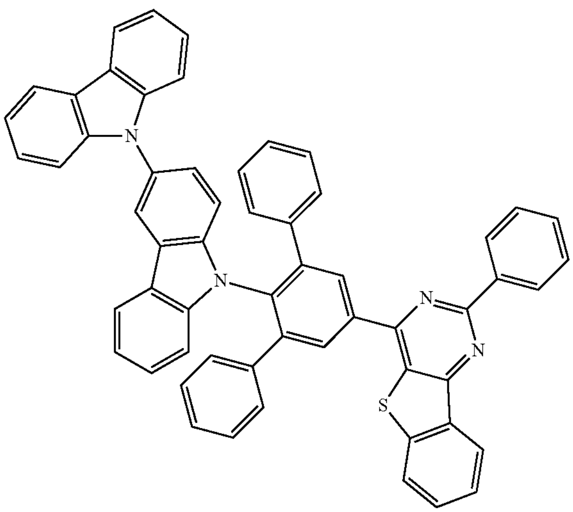
567
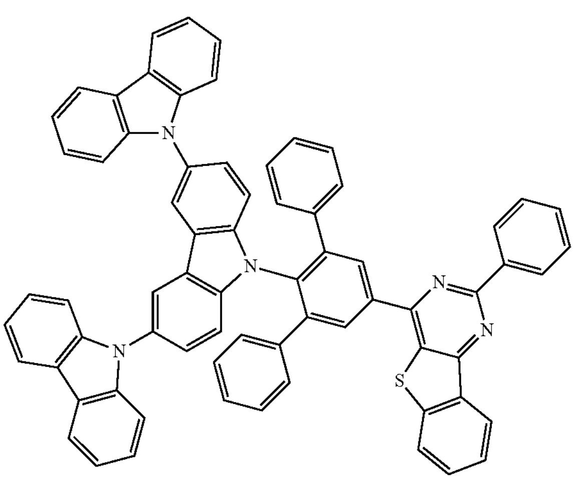
568
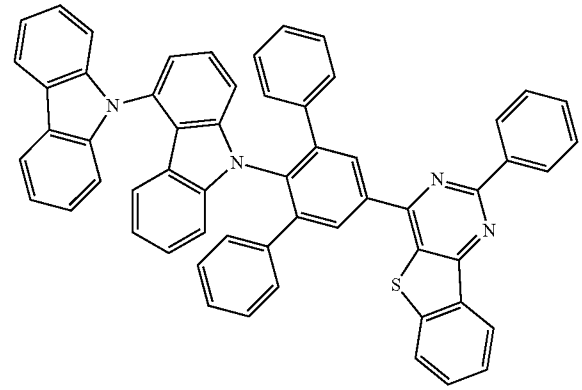
569
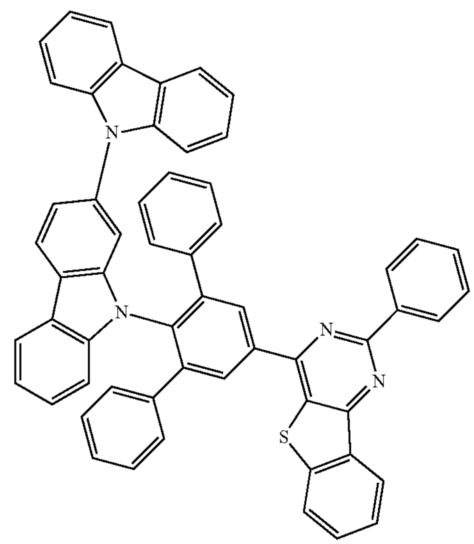
570
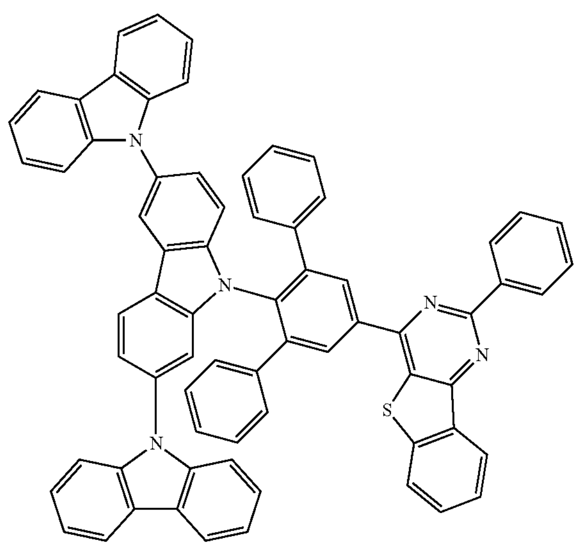

-continued
571
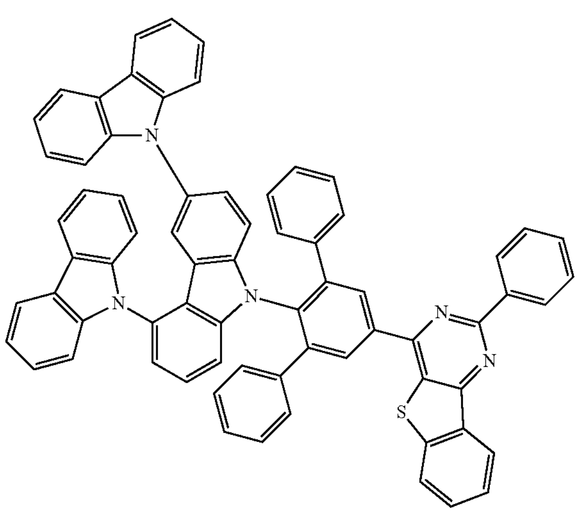
572
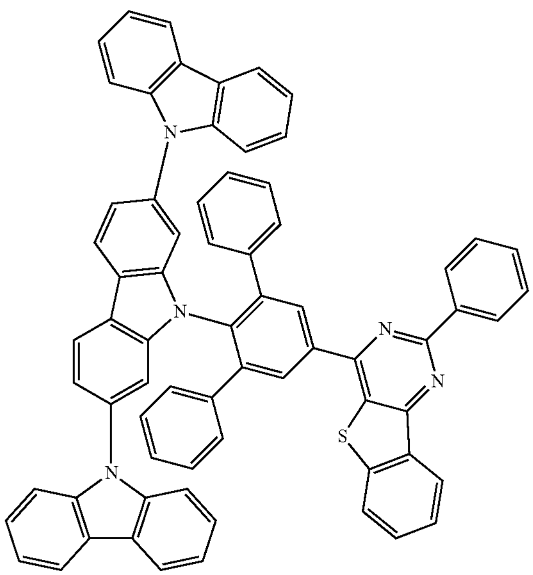
573
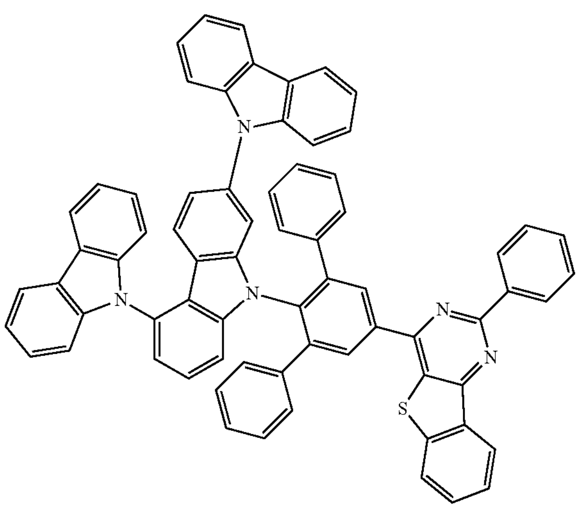
-continued
574
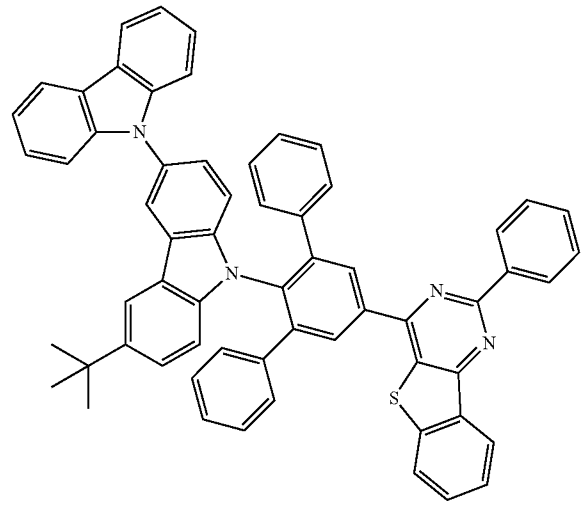
575
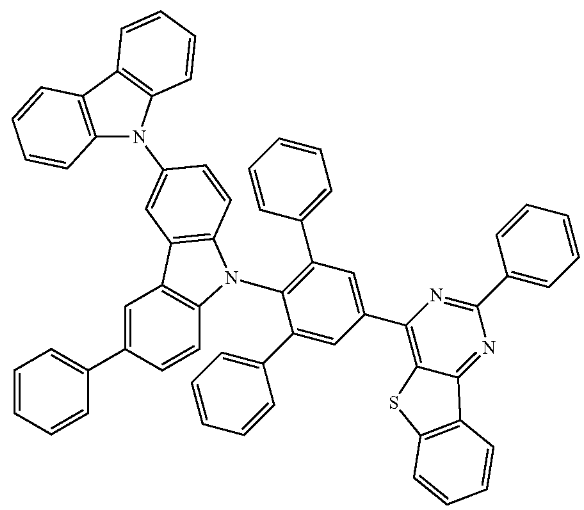
576
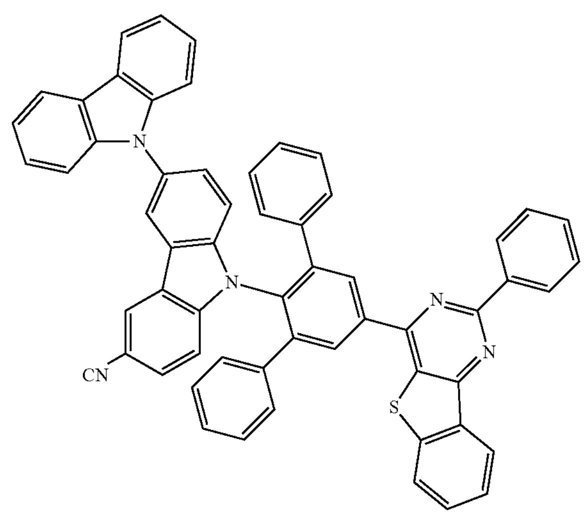

-continued
577
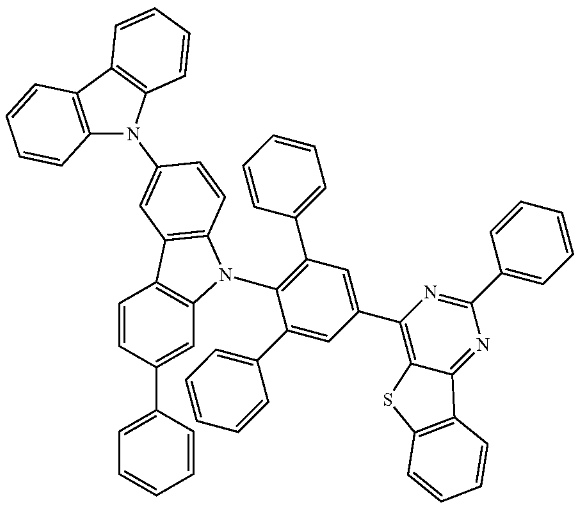
578
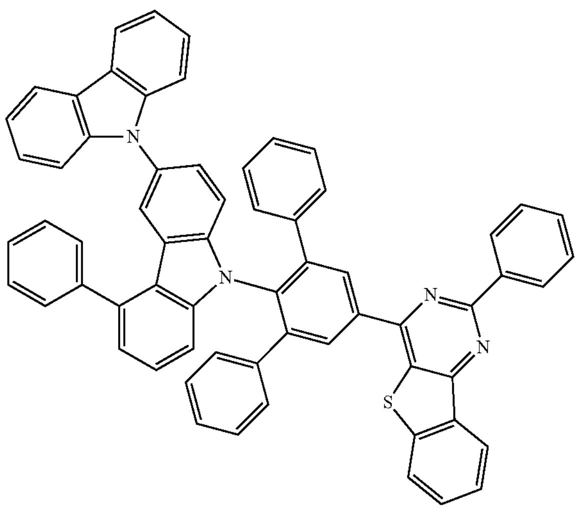
579
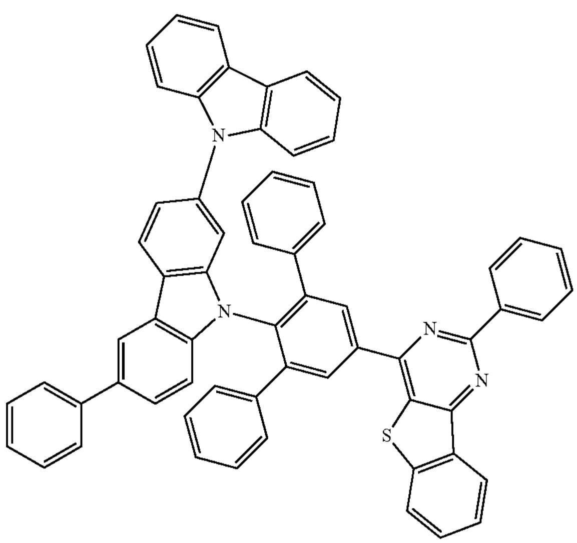
-continued
580
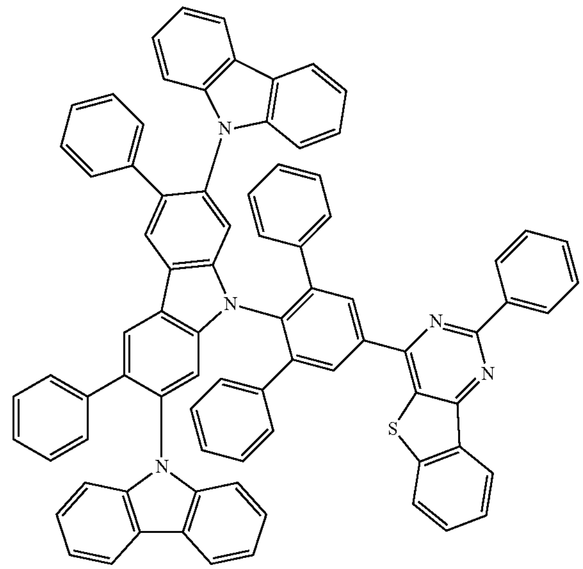
581
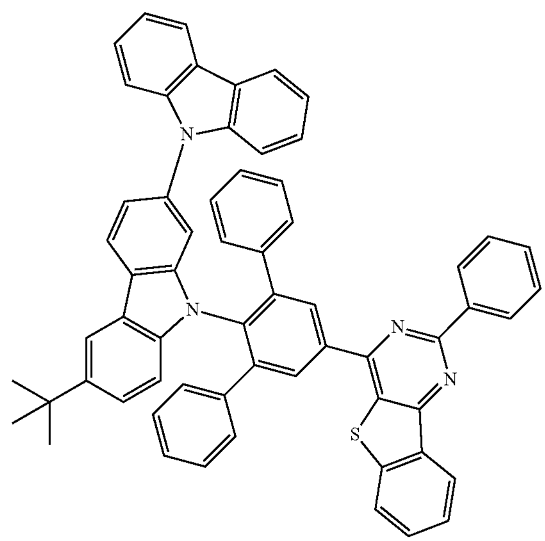
582
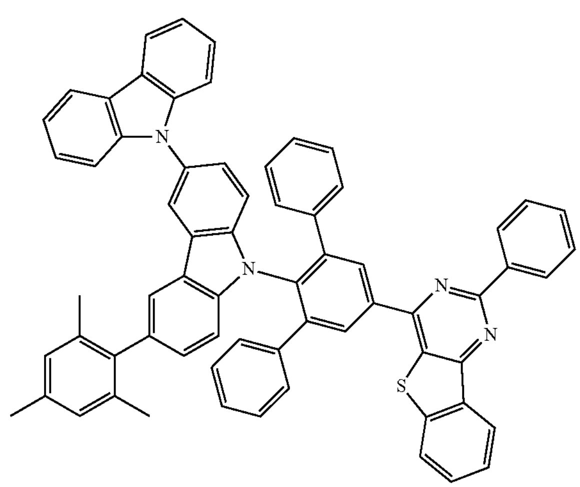

-continued
583
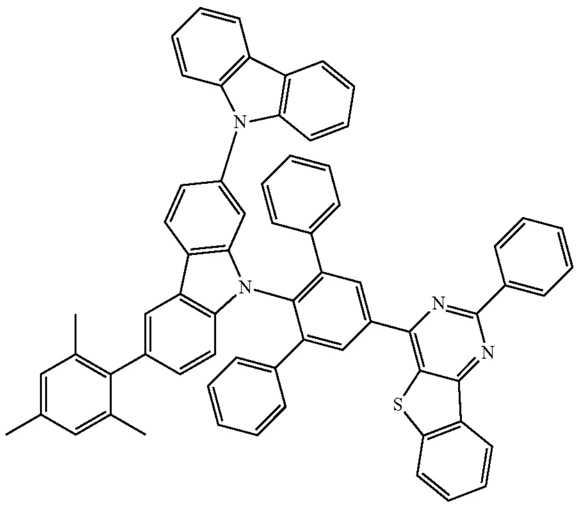
584
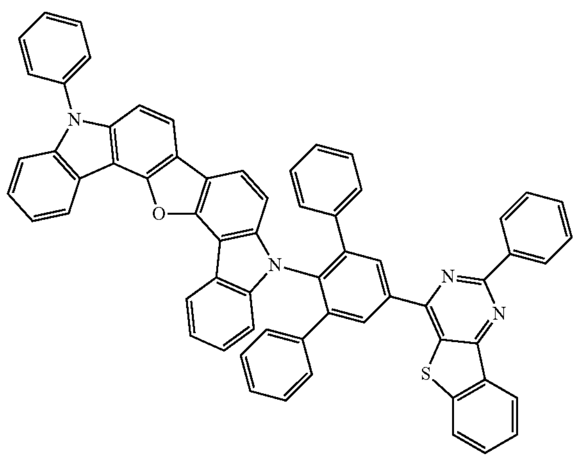
585
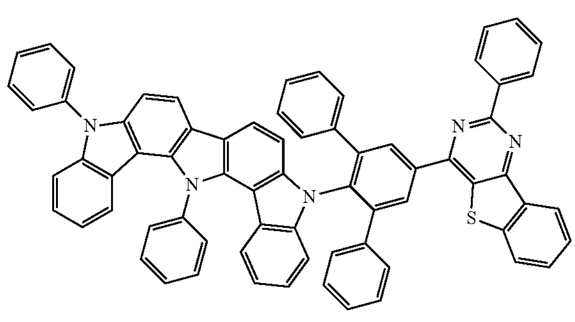
-continued
586
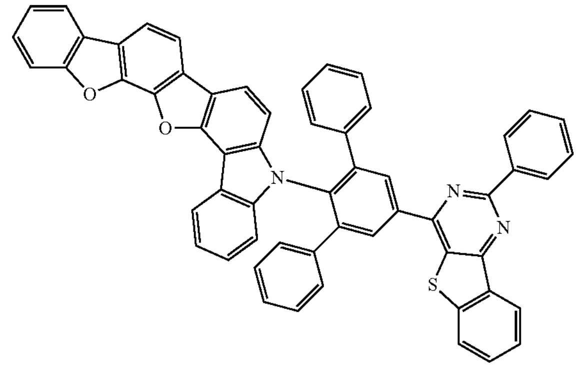
587
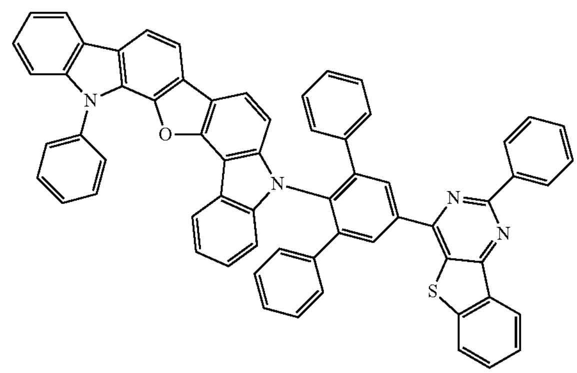
588
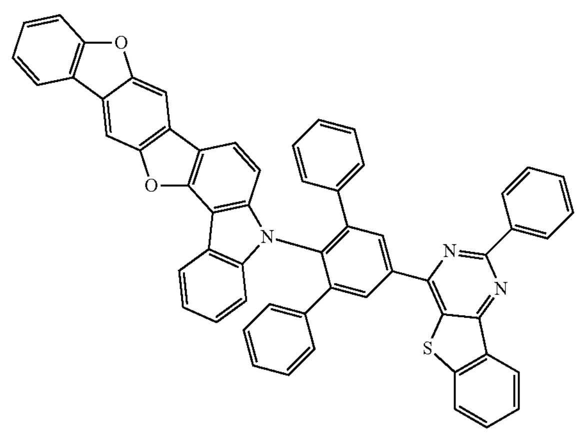

-continued
589
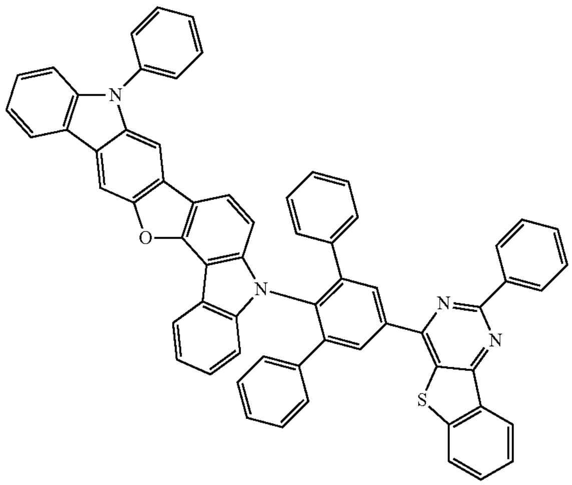
590
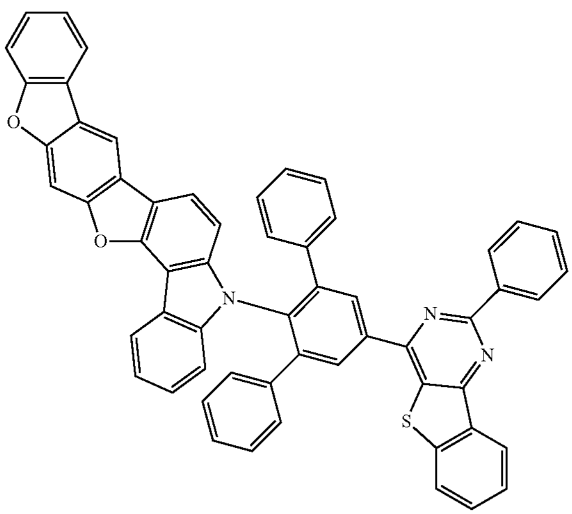
591
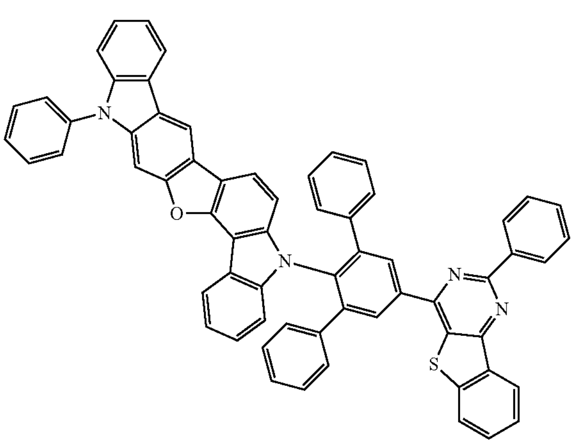
-continued
592
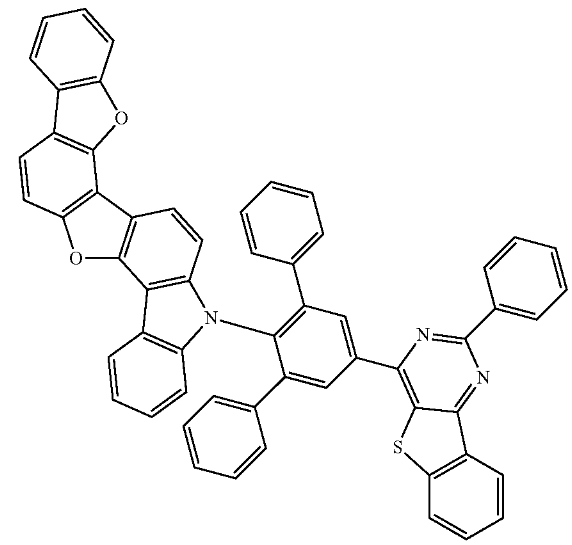
593
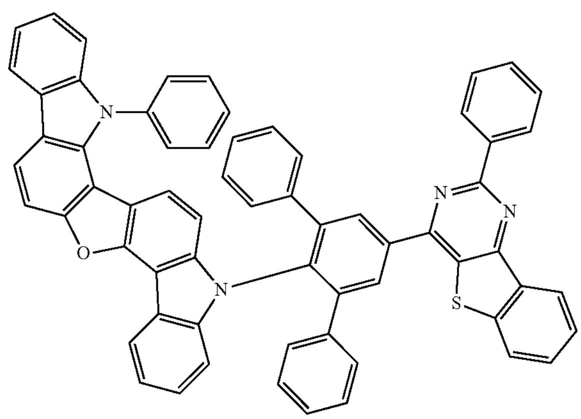
594
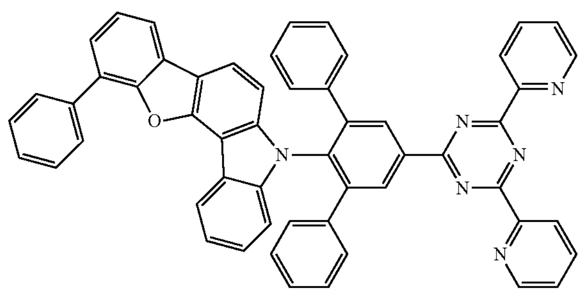

-continued
595
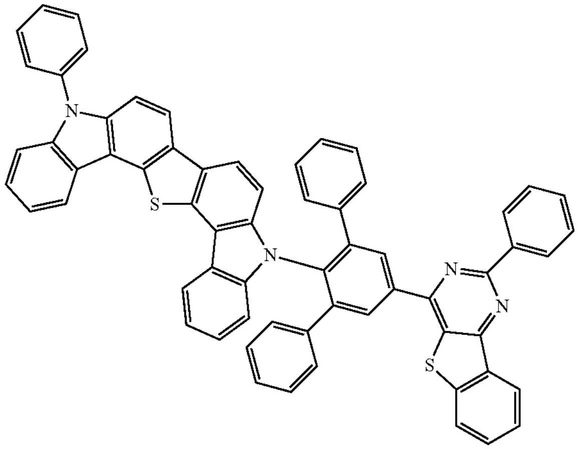
596
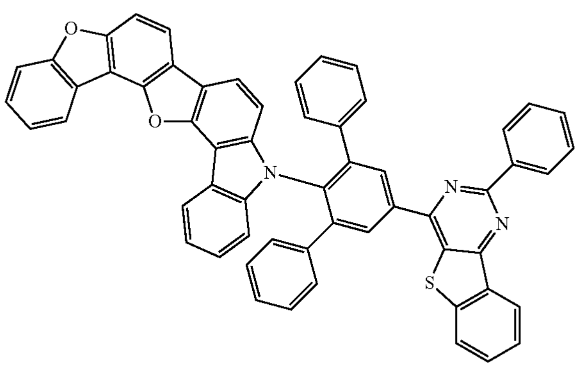
597
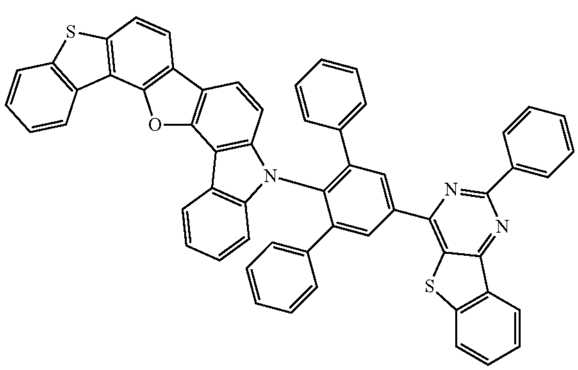
598
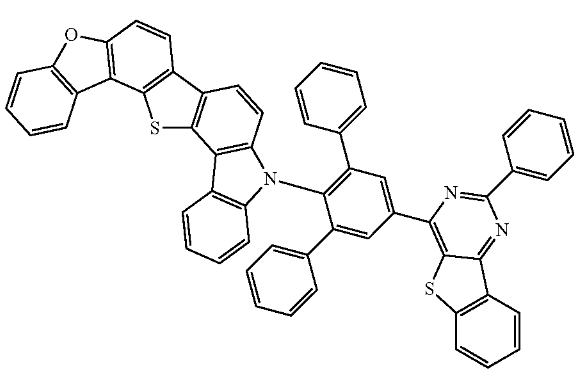
599
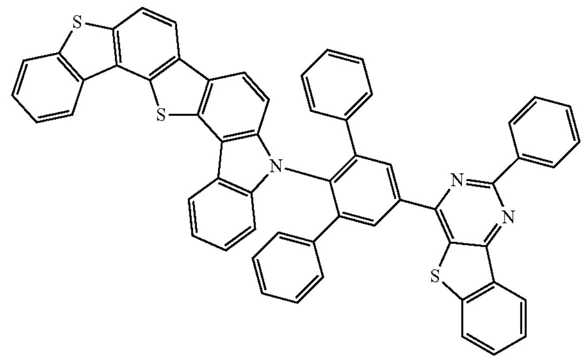
600
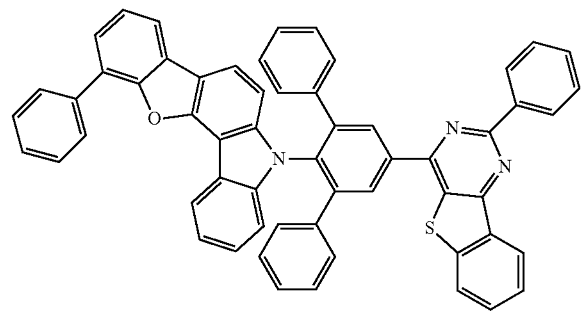
601
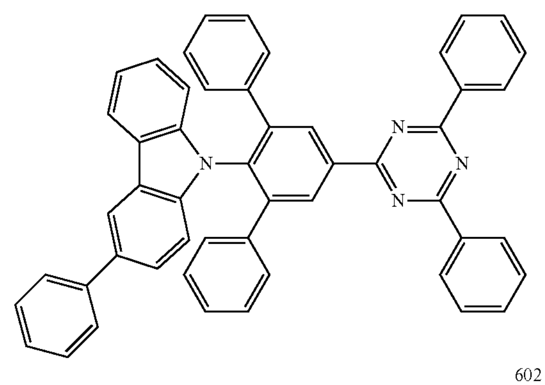
602
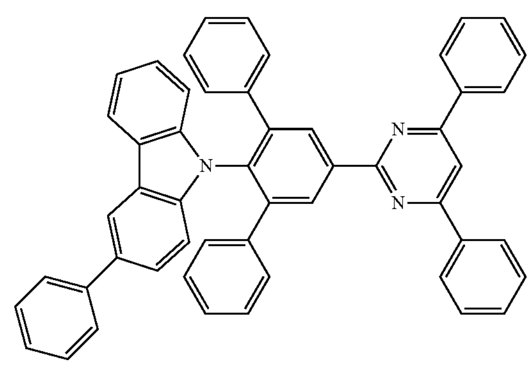

-continued
603
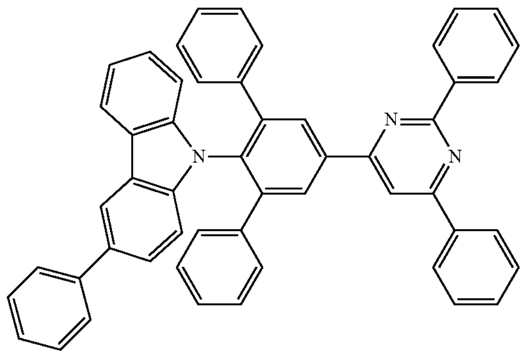
604
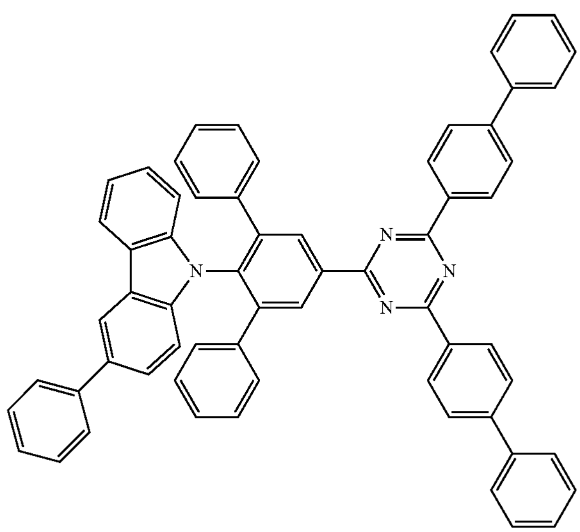
605
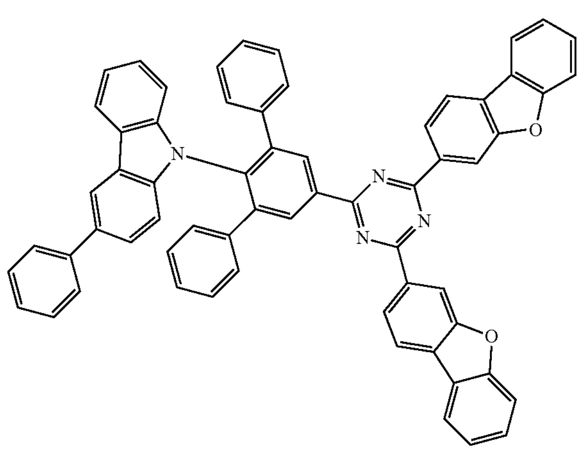
-continued
606
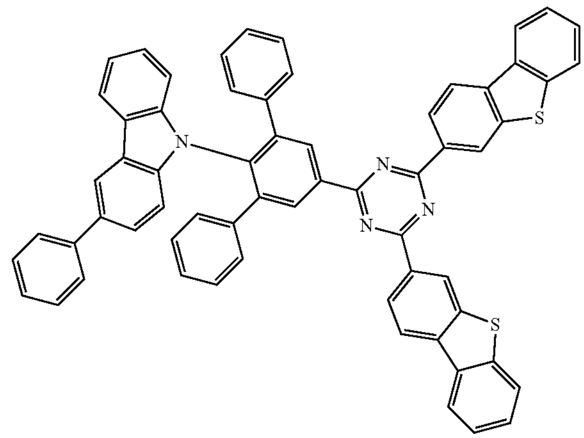
607
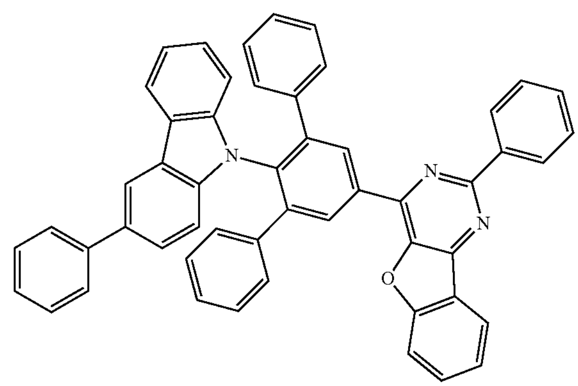
608
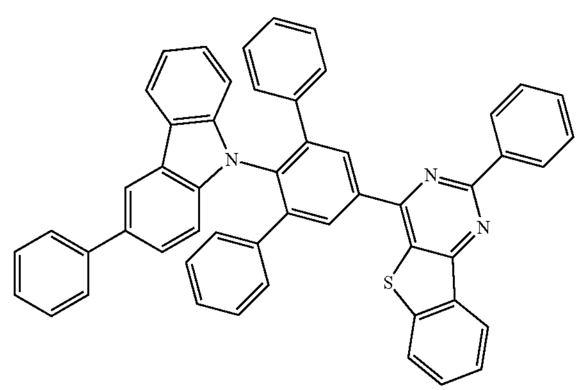

609
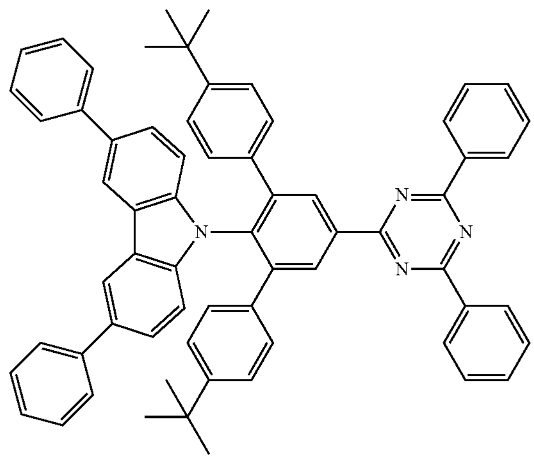
610
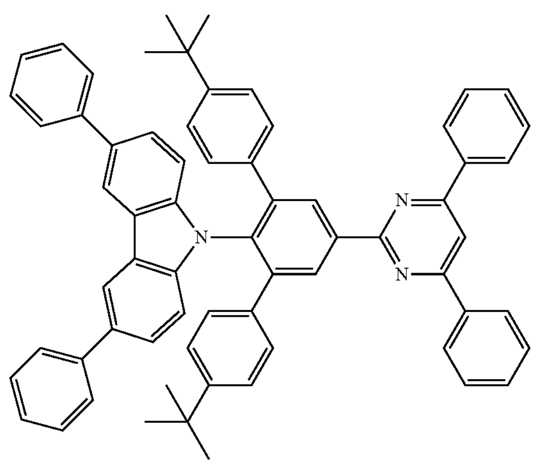
611
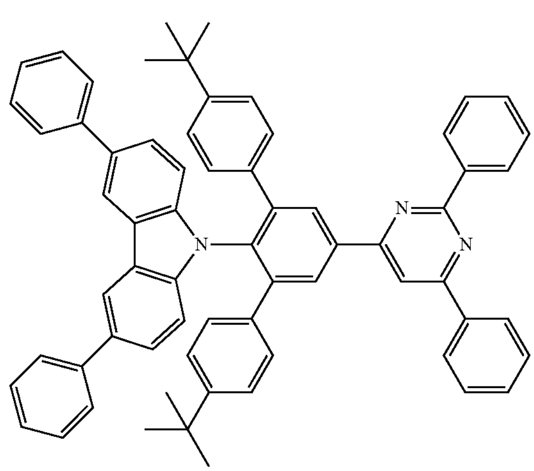
612
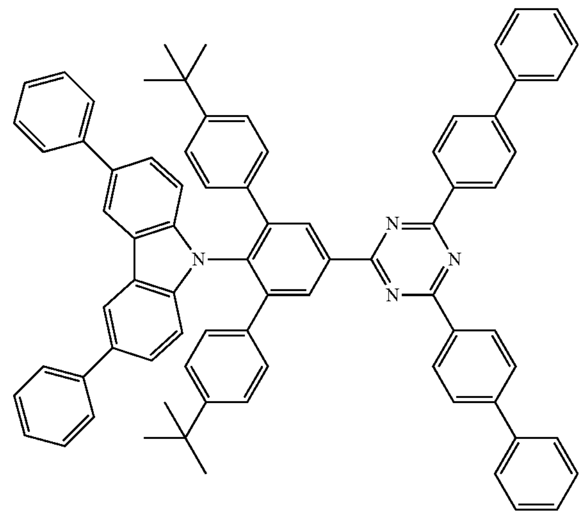
613
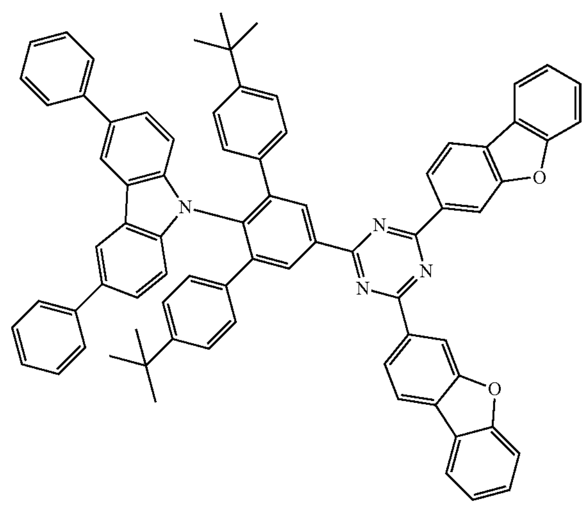
614
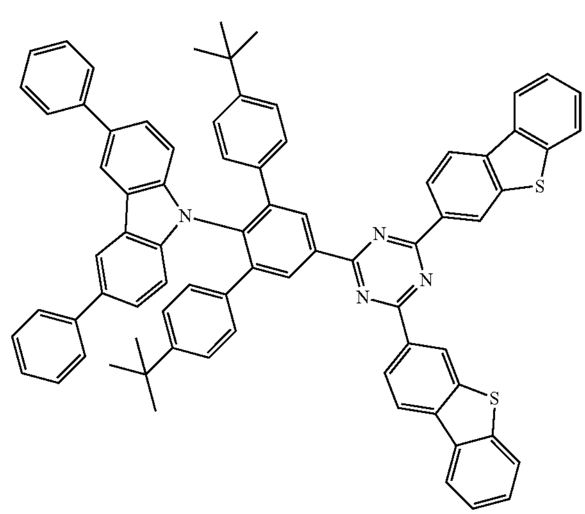

-continued
615
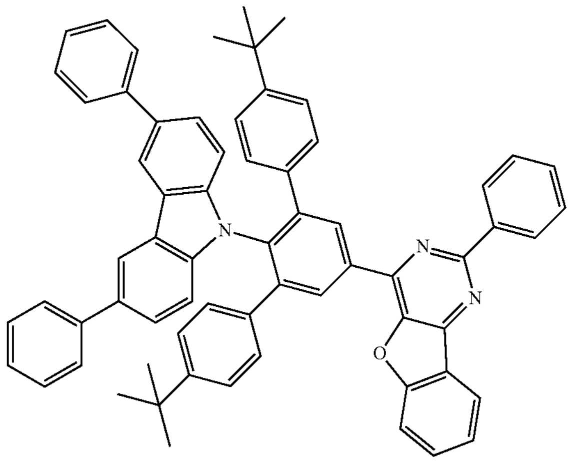
616
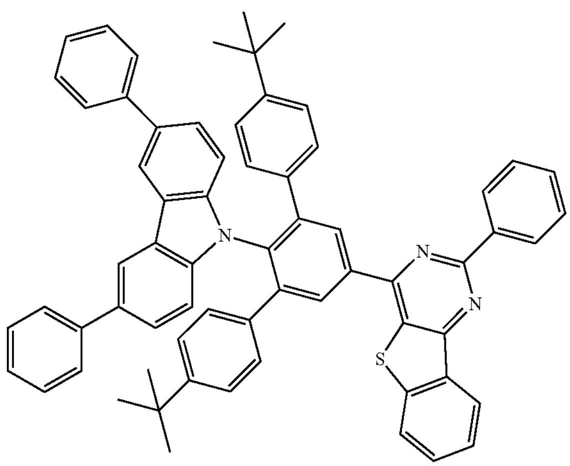
617
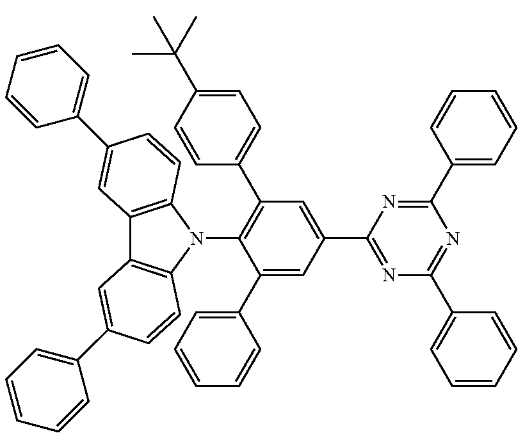
-continued
618
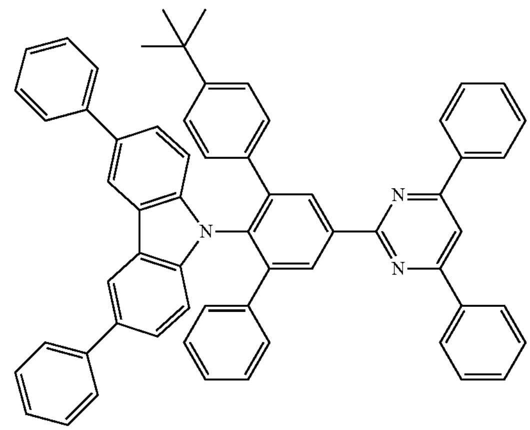
619
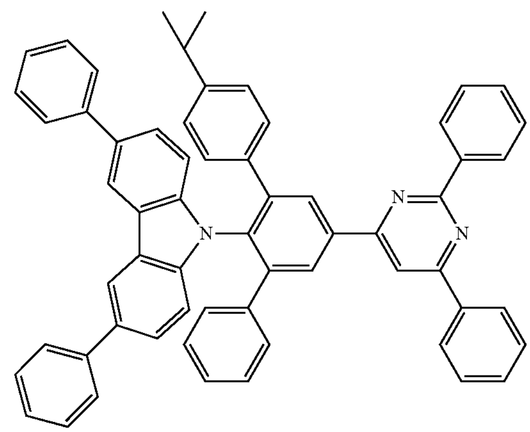
620
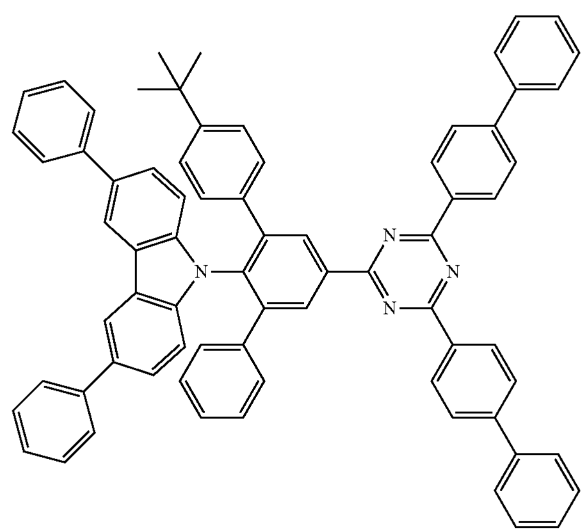

-continued
621
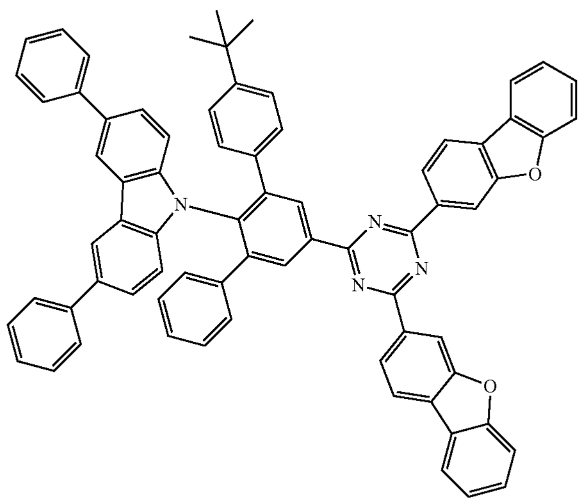
622
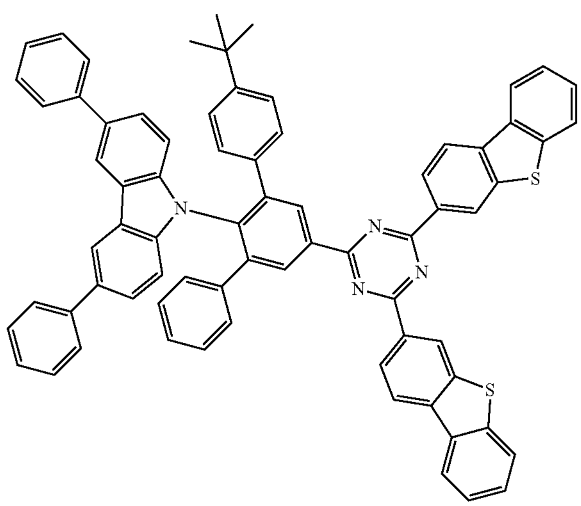
623
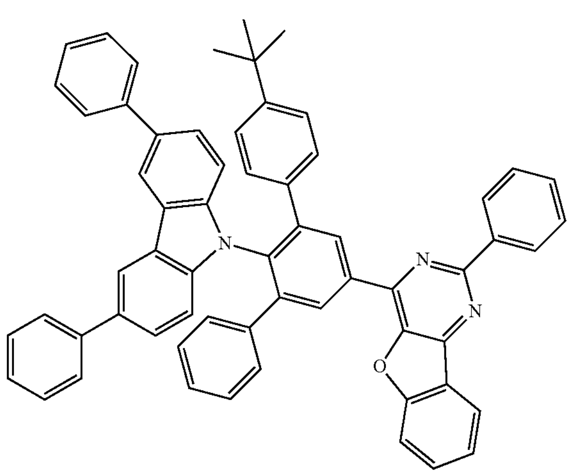
-continued
624
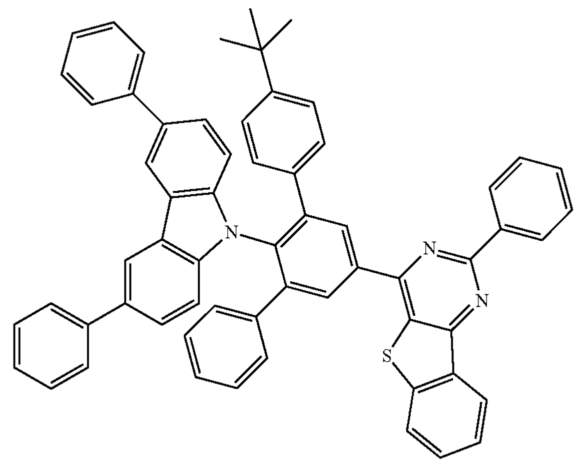
625
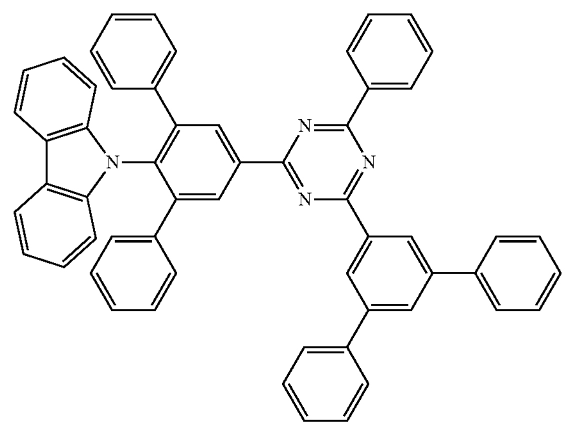
626
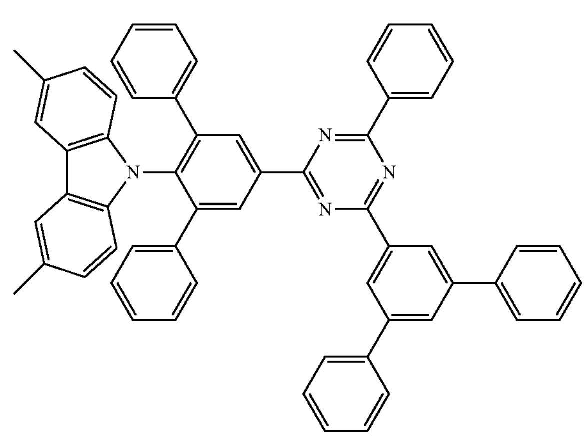

-continued
627
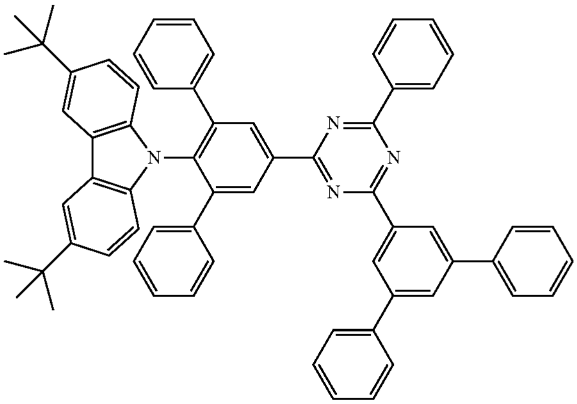
628
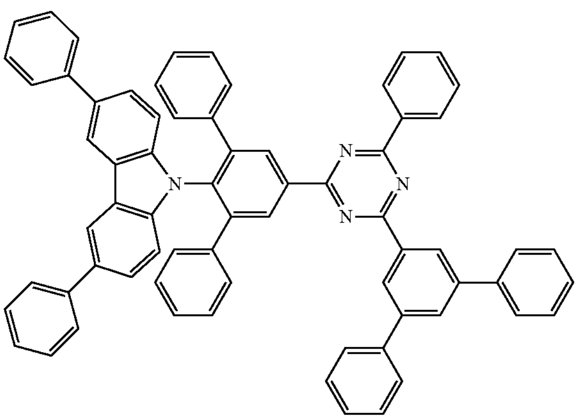
629
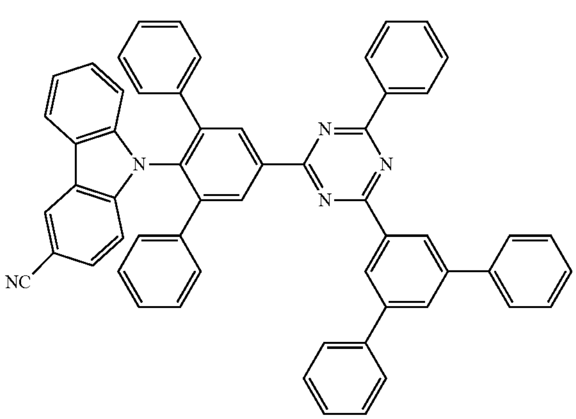
-continued
630
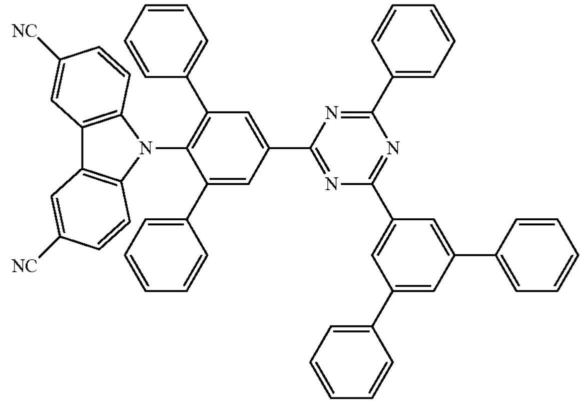
631
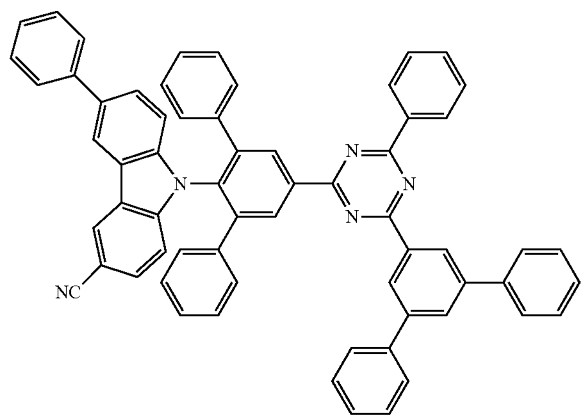
632
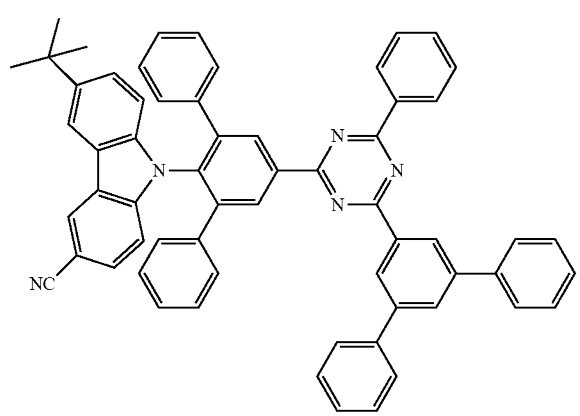

633
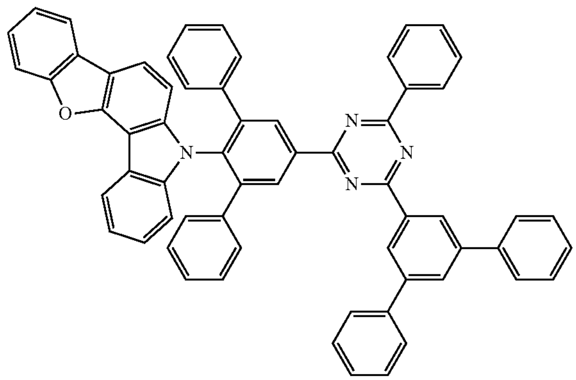
634
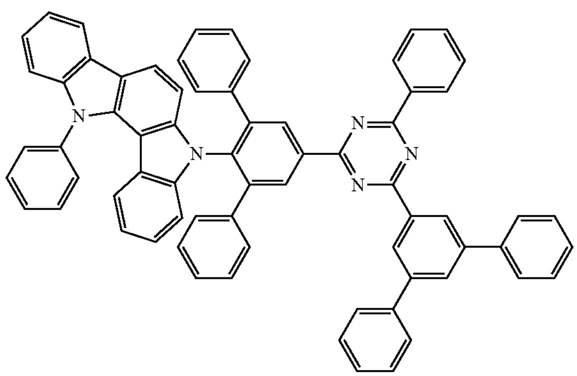
635
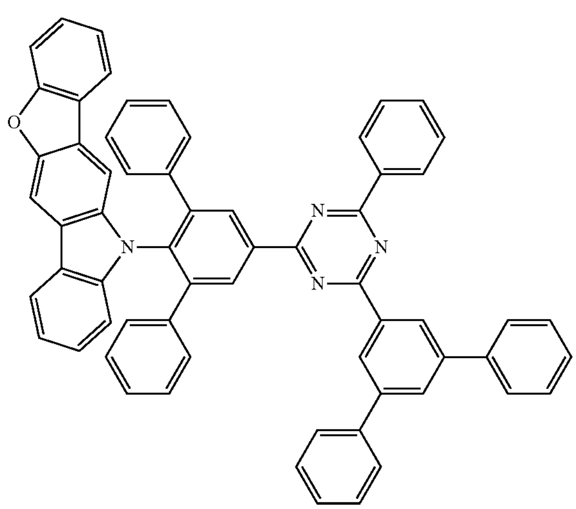
636
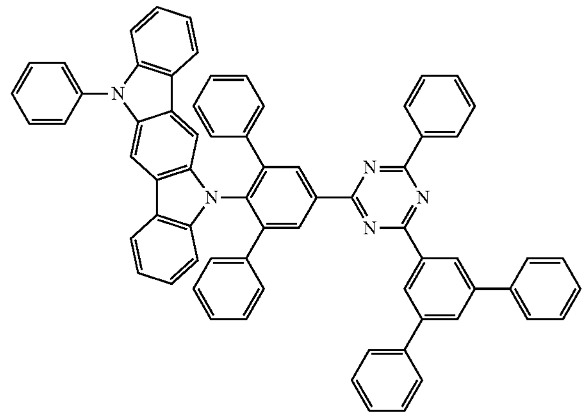
637
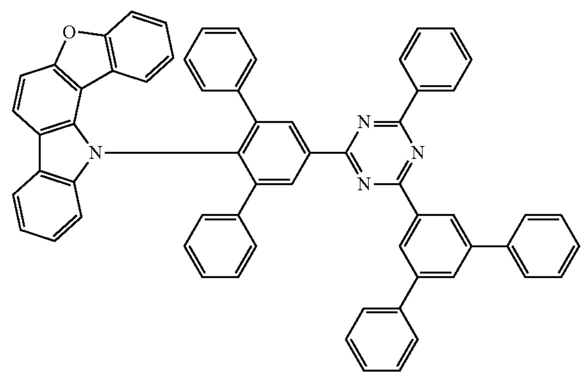
638
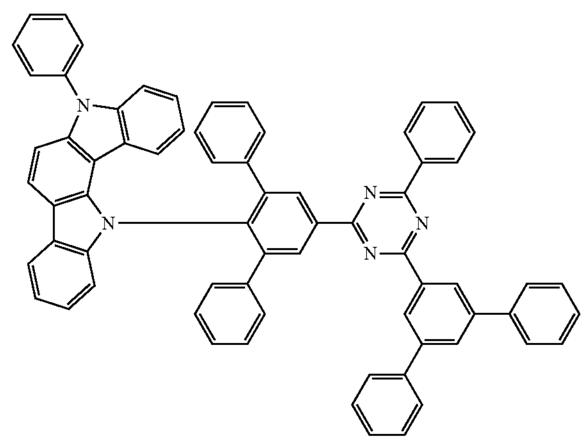
639
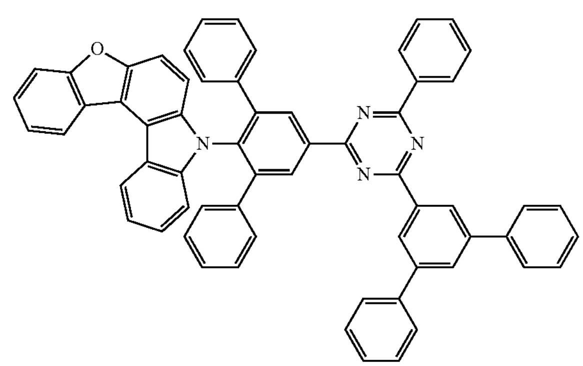

-continued
640
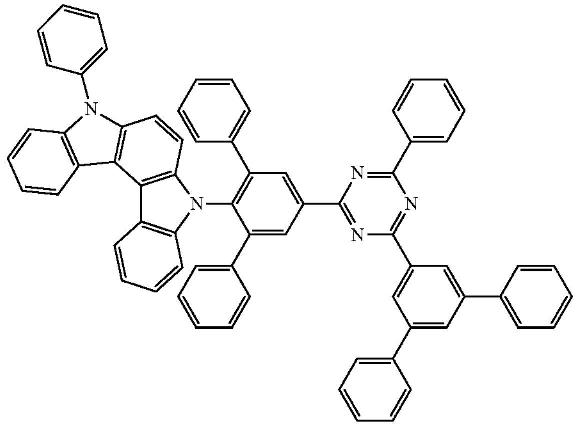
641
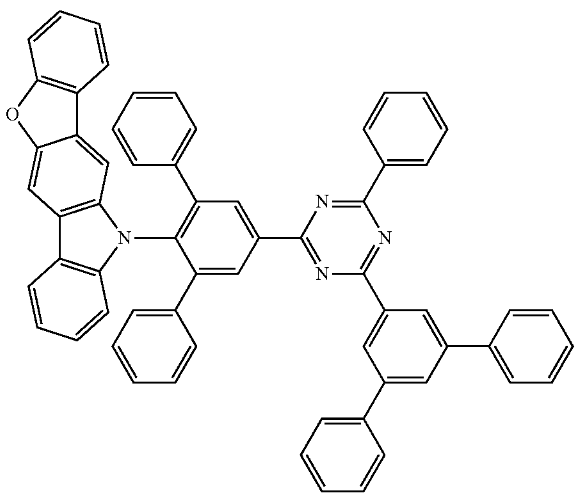
642
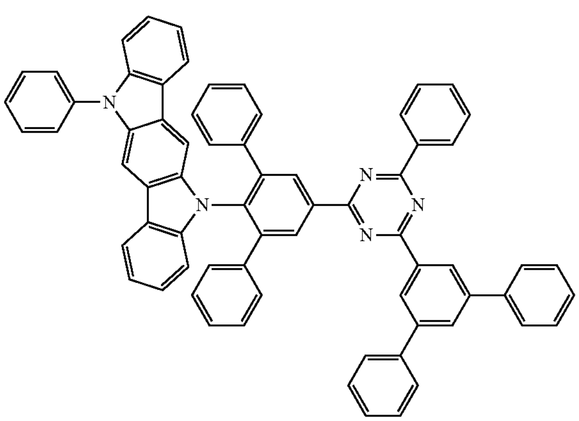
-continued
643
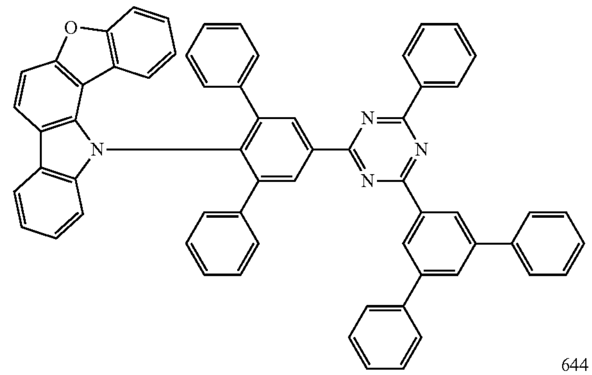
644
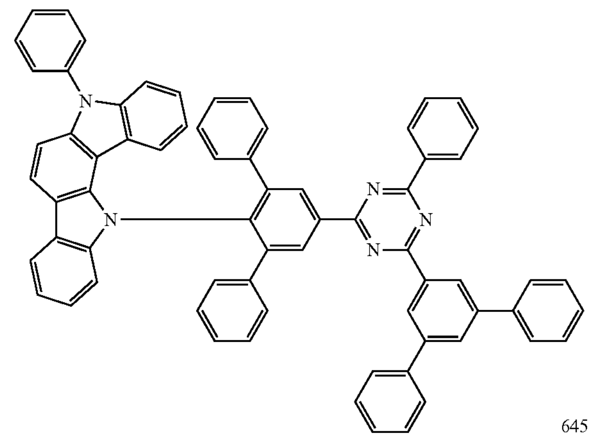
645
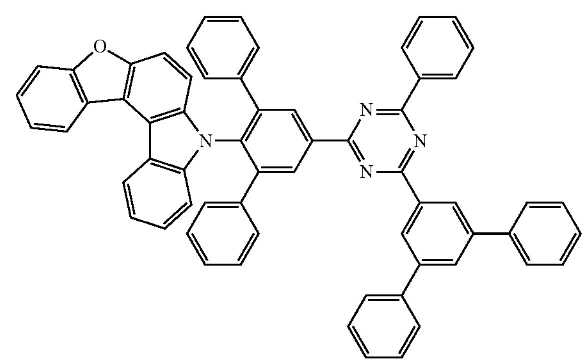
646
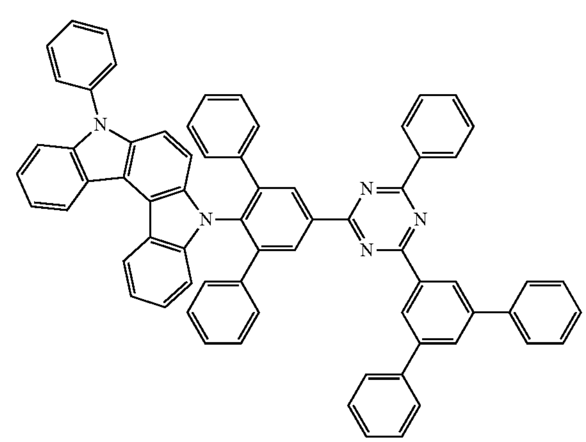

-continued
647
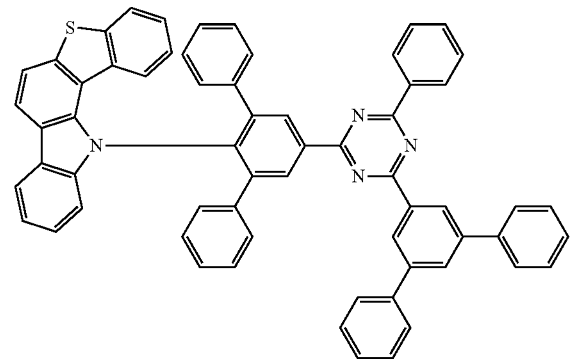
-continued
648
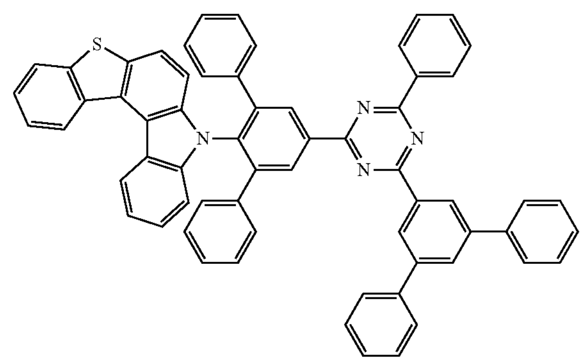
649
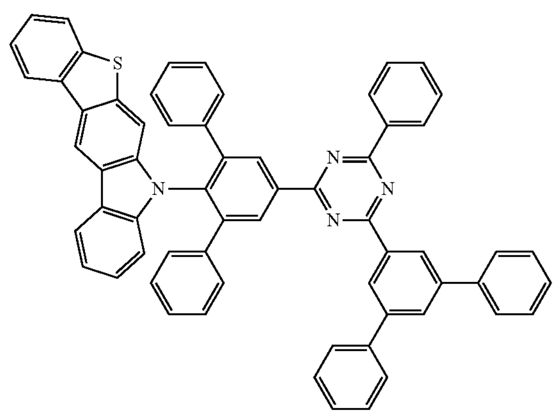
650
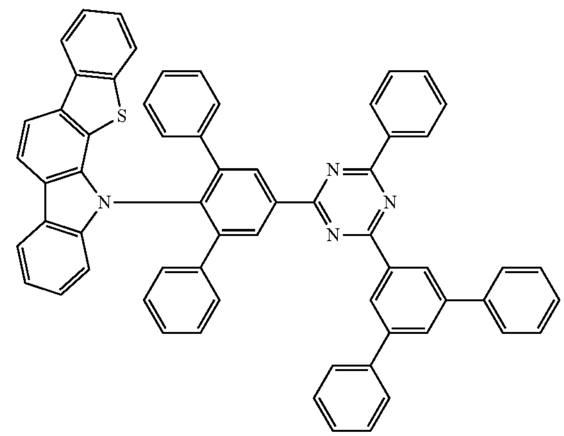
651
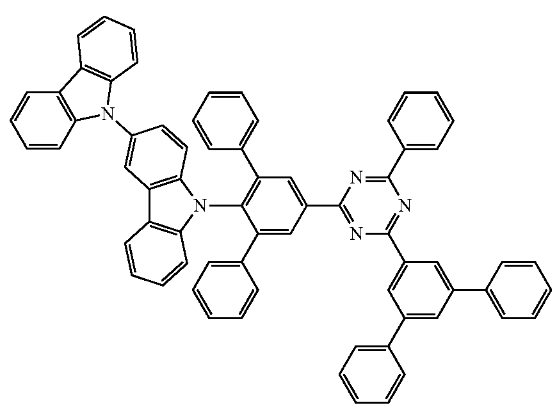
652
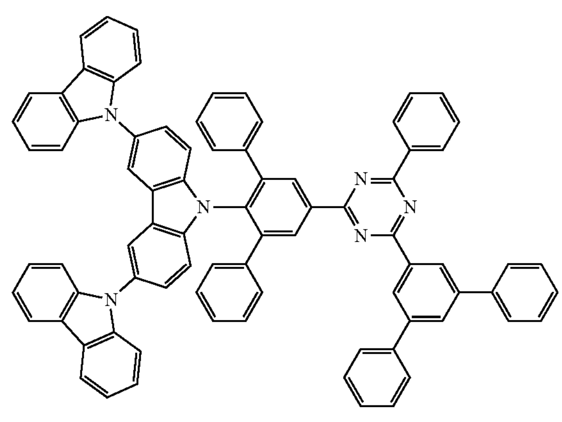

-continued
653
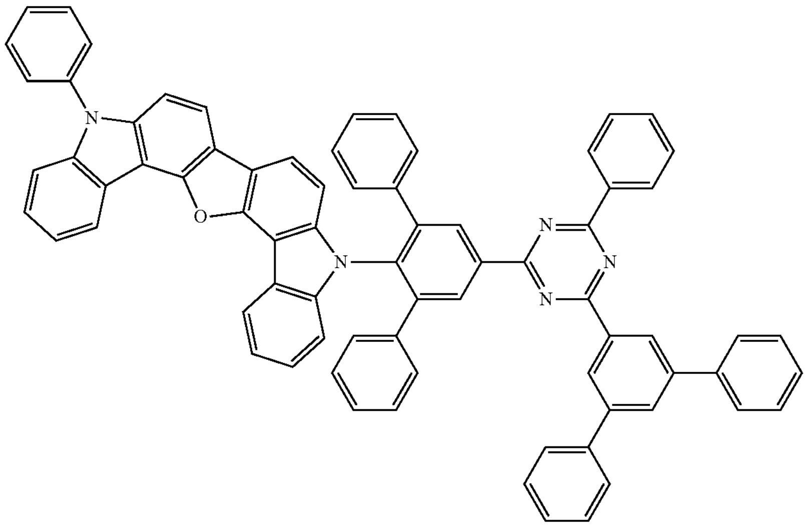
654
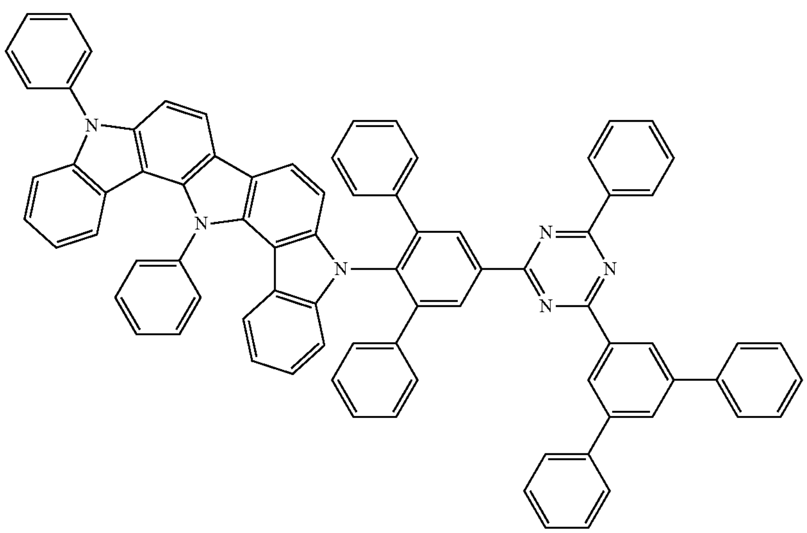
655
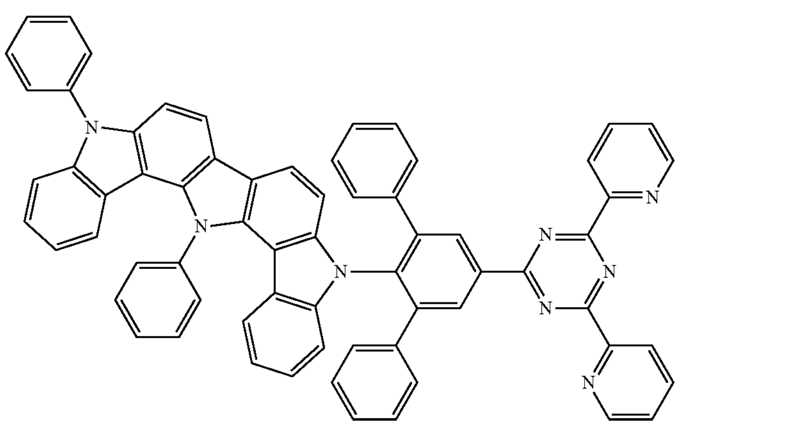

-continued
656
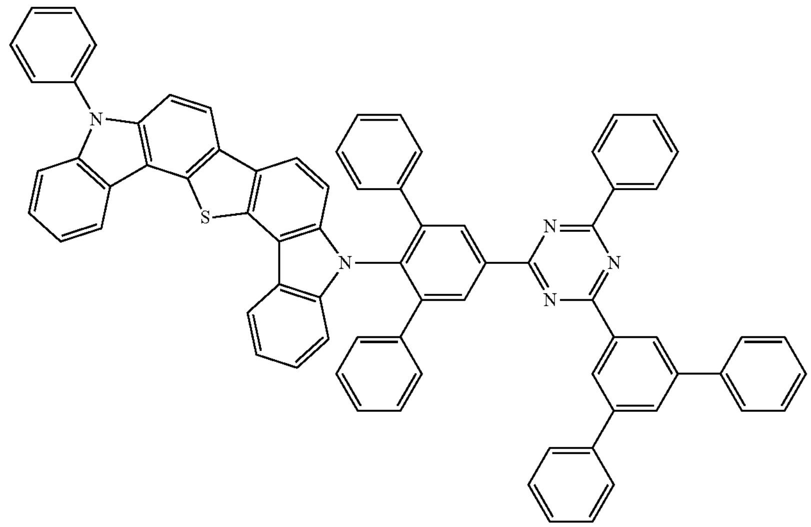
657
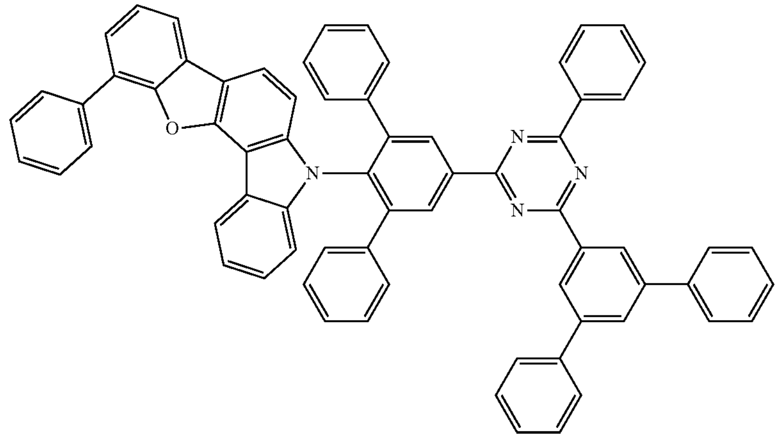
658
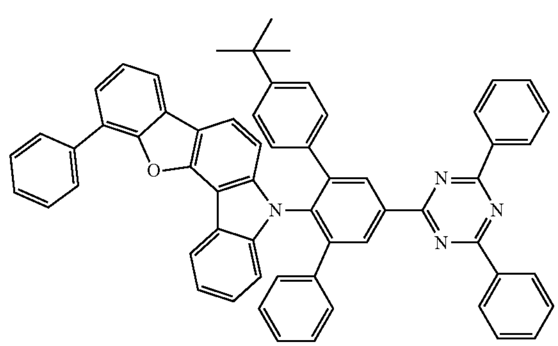
659
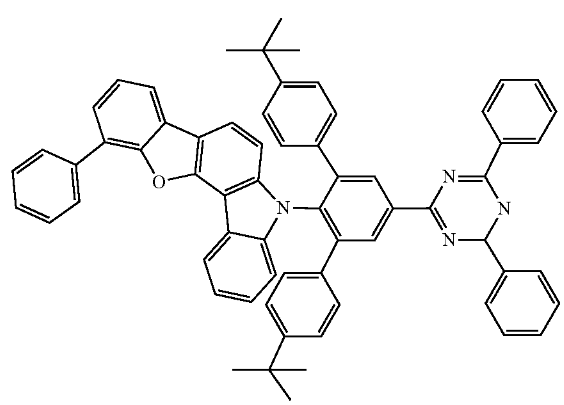

-continued
660
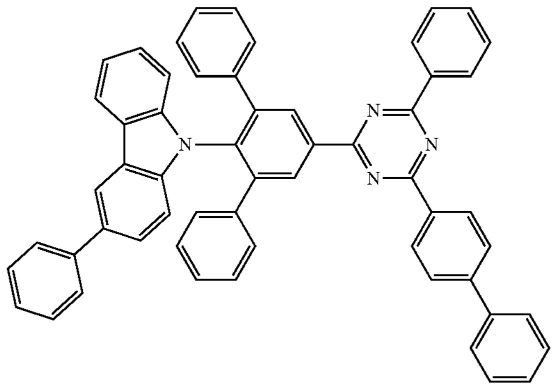
661
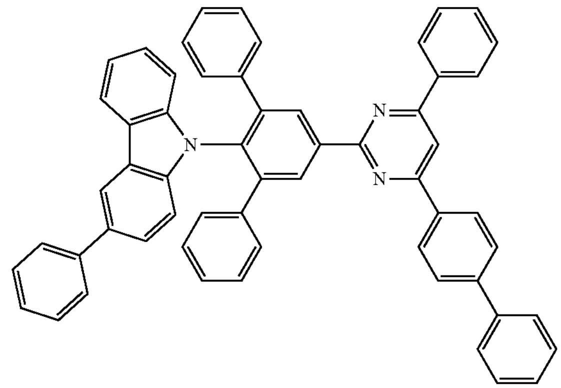
662
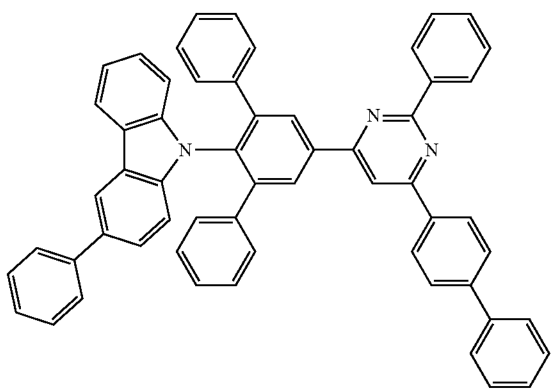
663
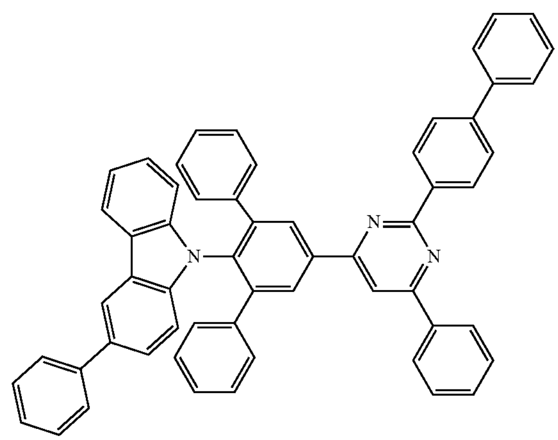
664
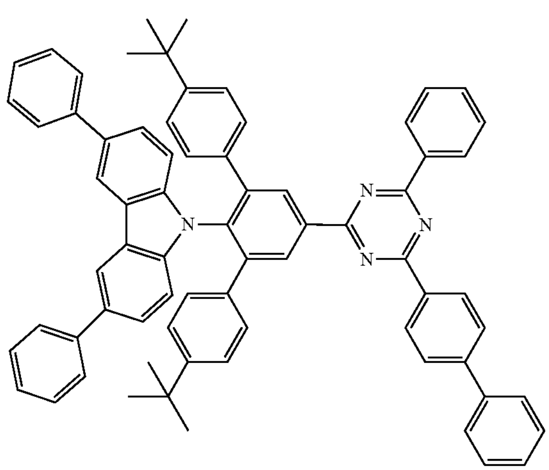
665
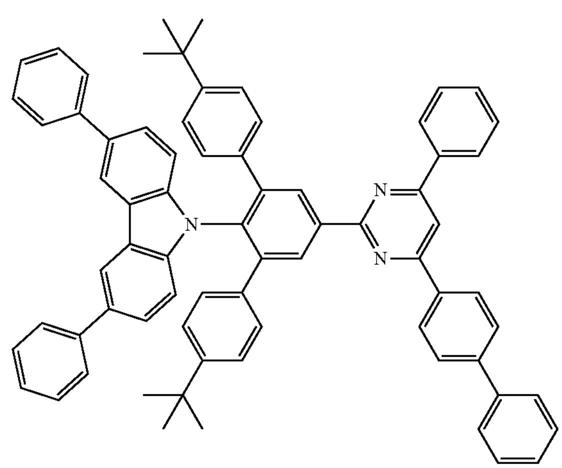

-continued
666
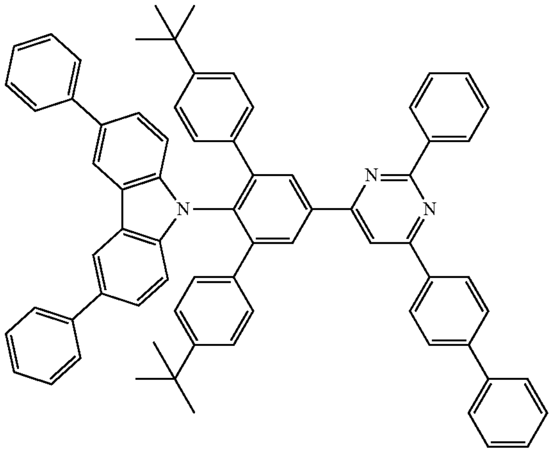
667
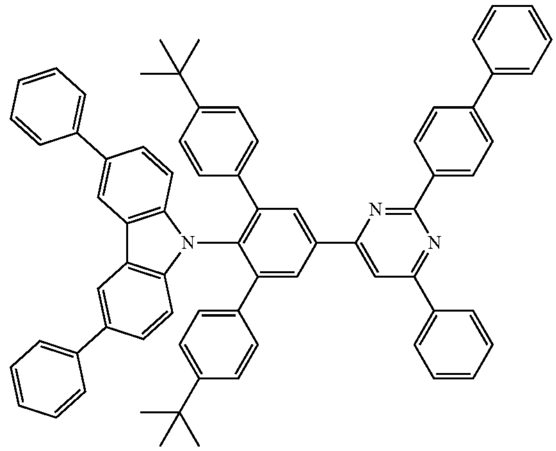
668
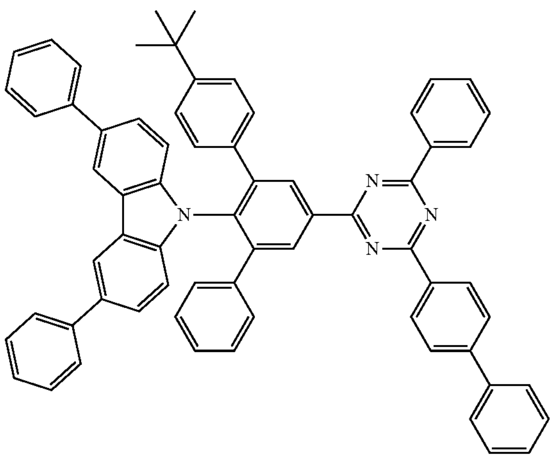
669
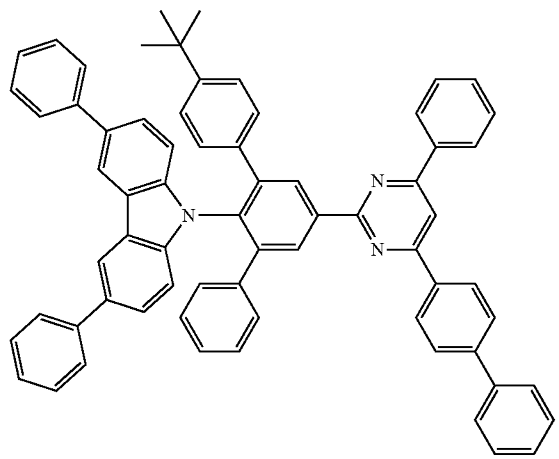
670
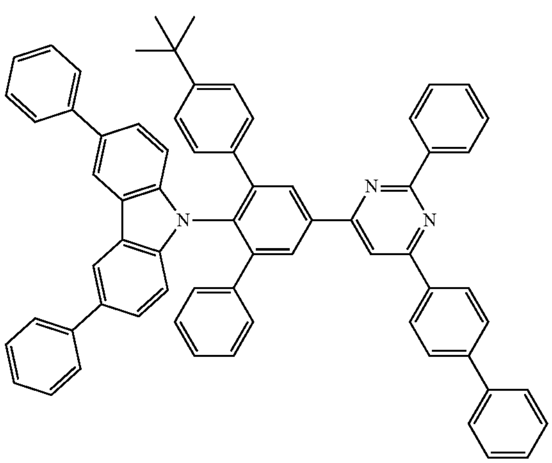
671
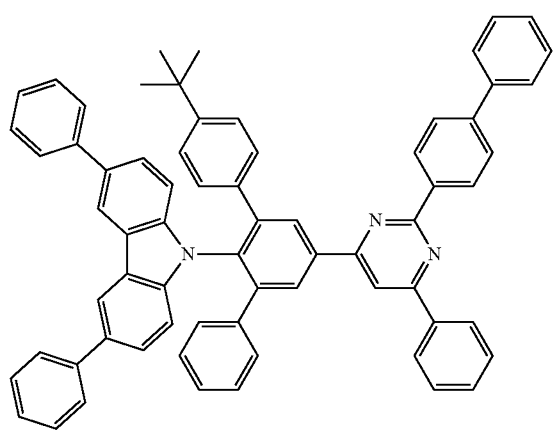

-continued
672
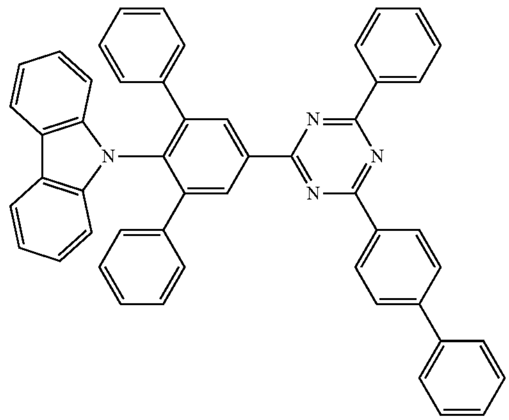
673
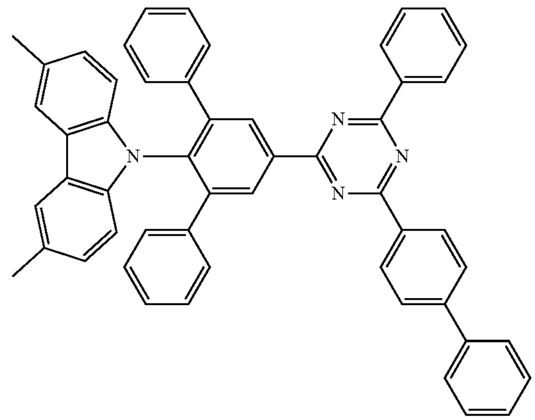
674
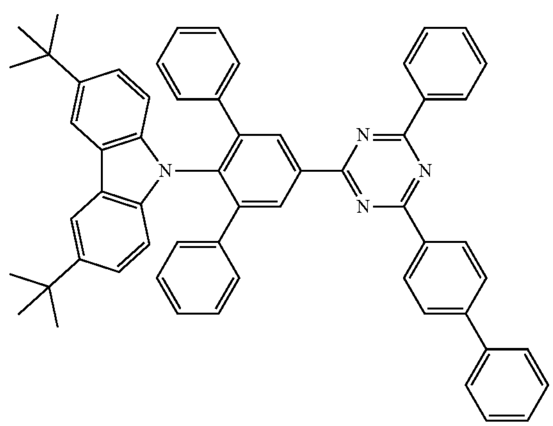
675
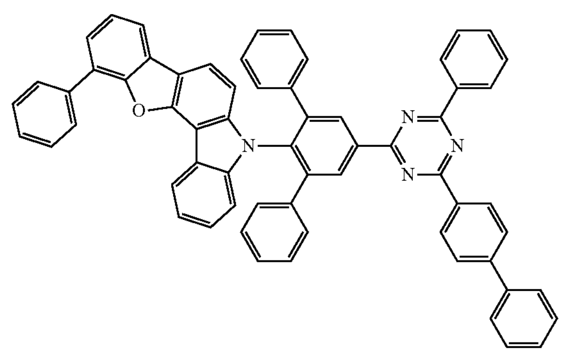
676
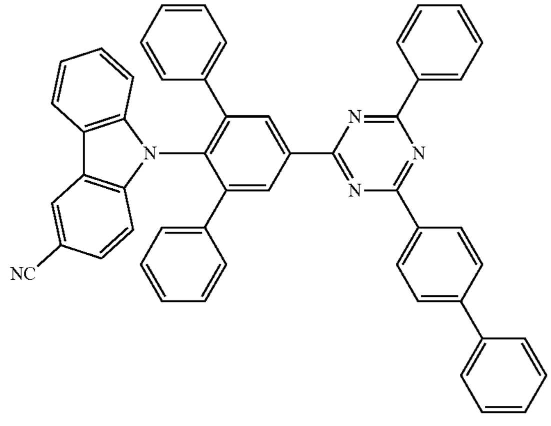
677
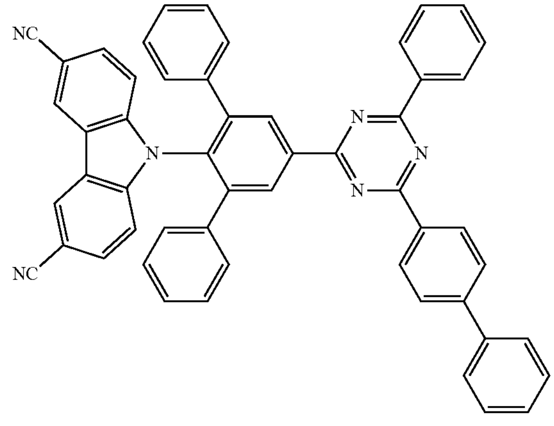

-continued
678
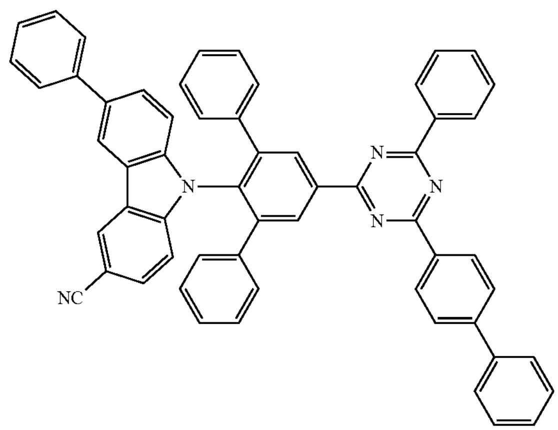
679
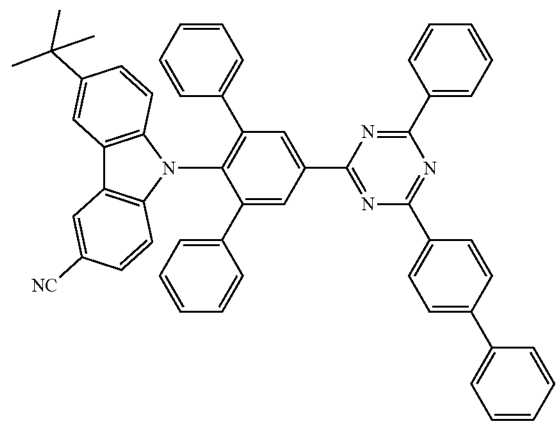
680
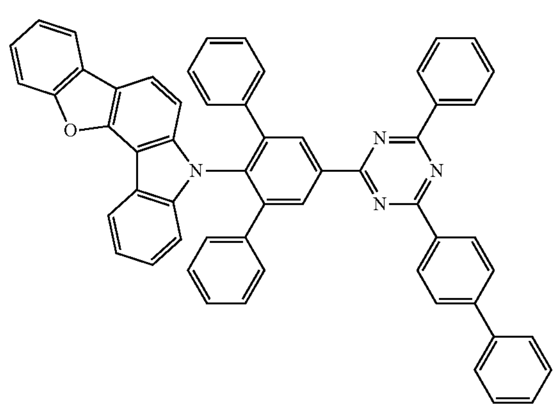
681
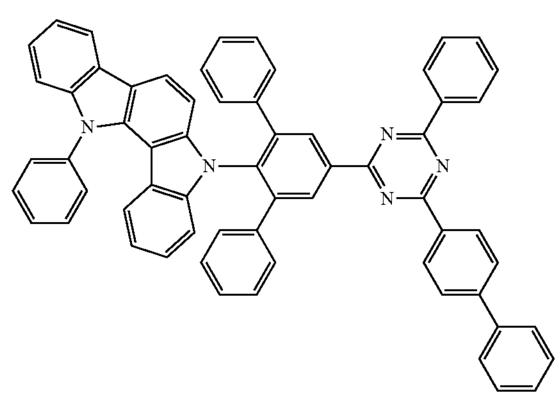
682
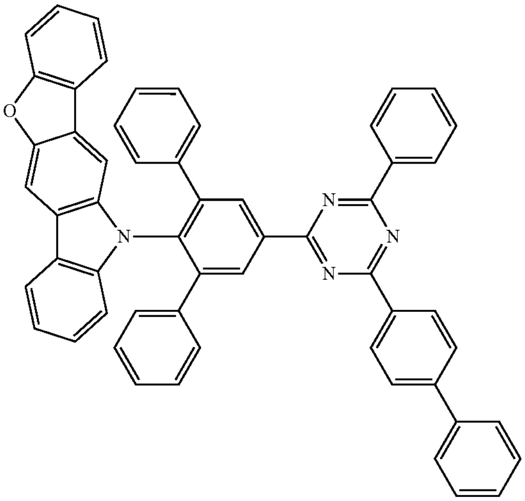
683
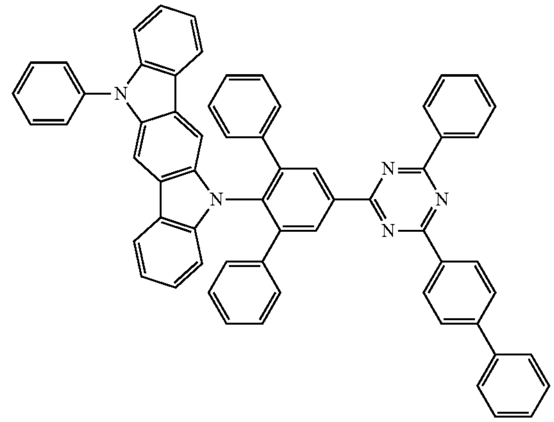

-continued
684
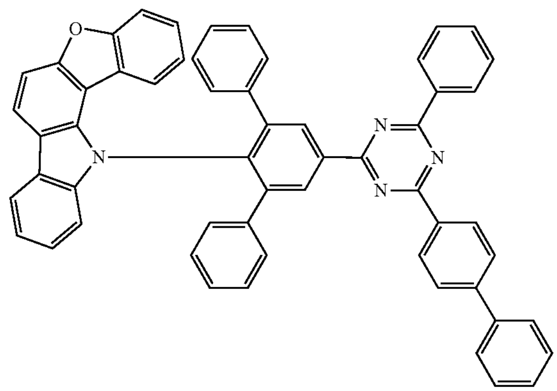
685
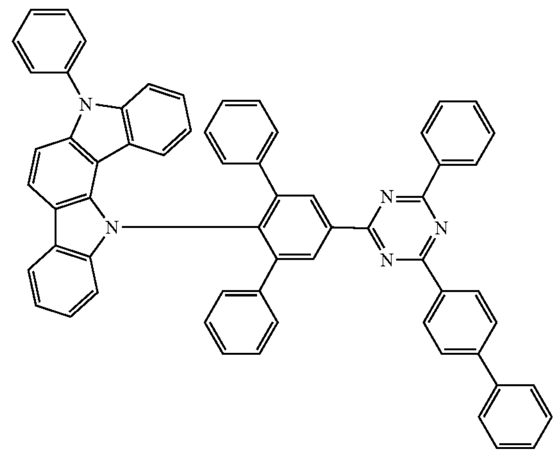
686
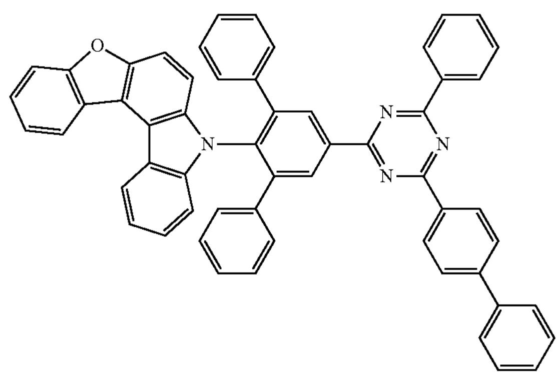
687
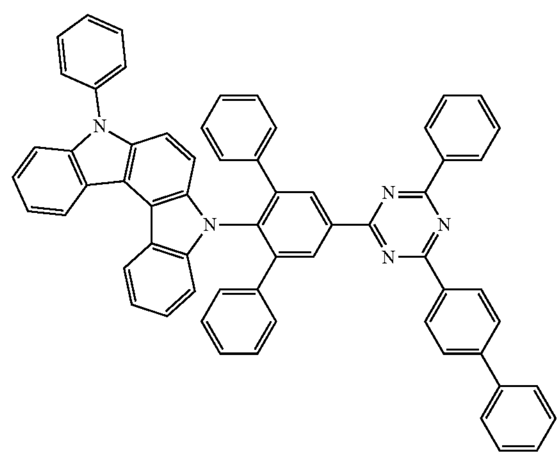
688
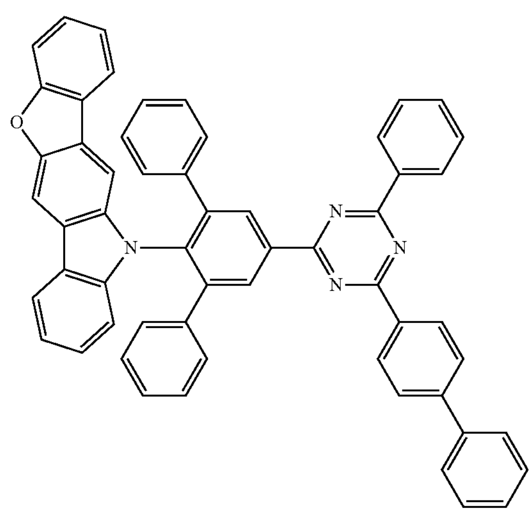
689
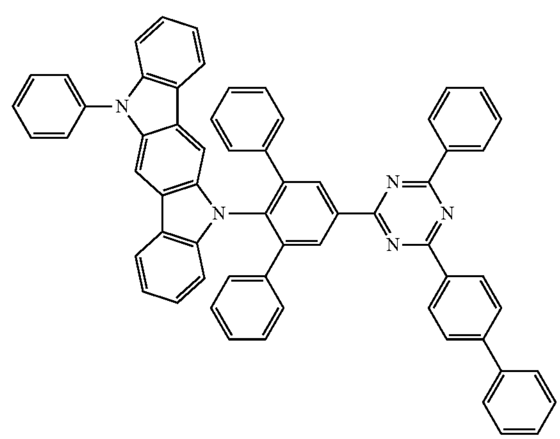

-continued
690
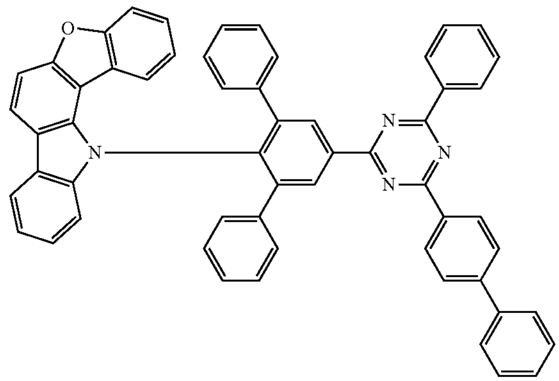
691
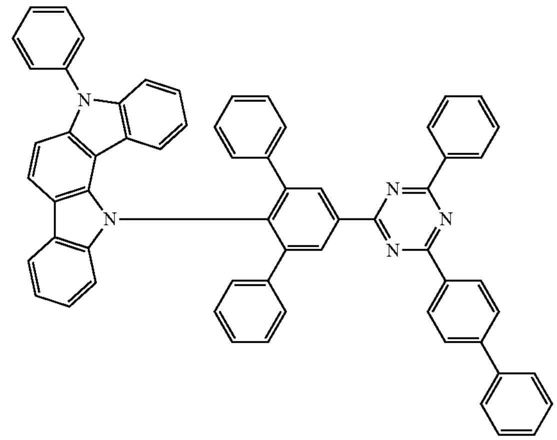
692
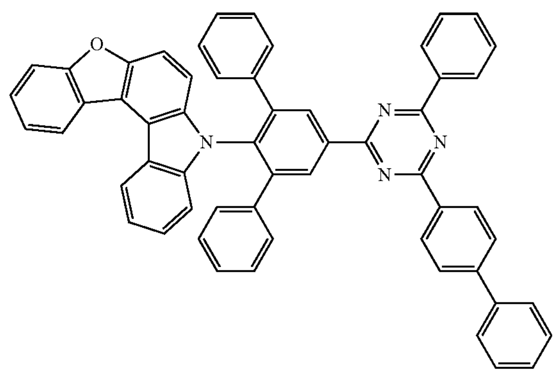
693
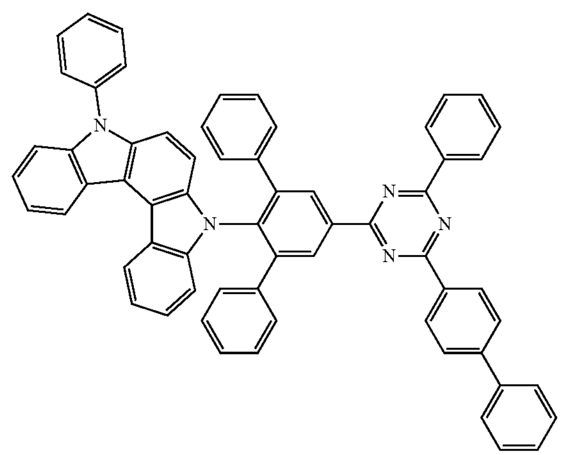
694
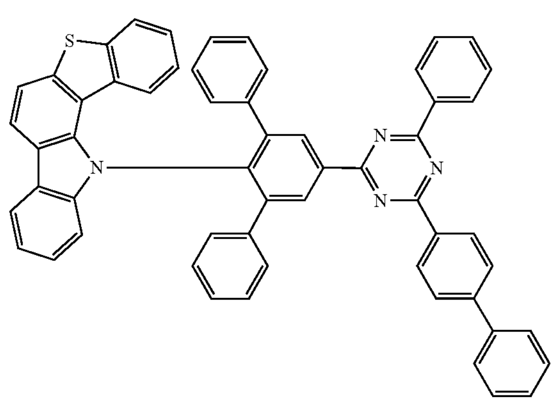
695
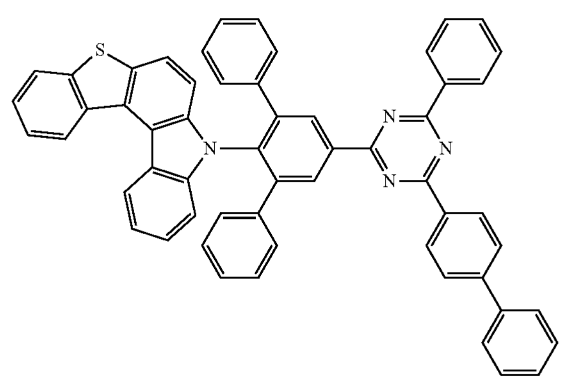

-continued
696
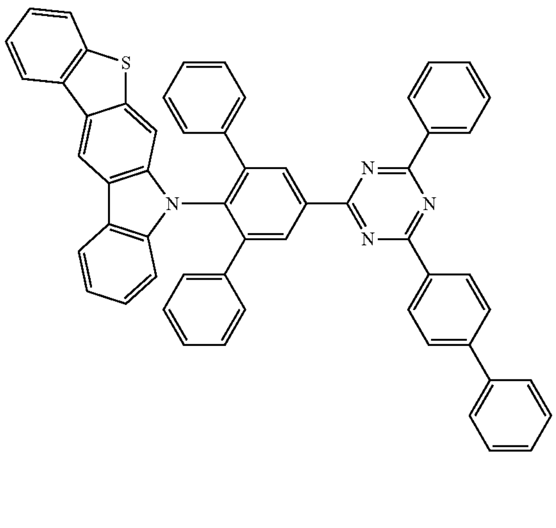
697
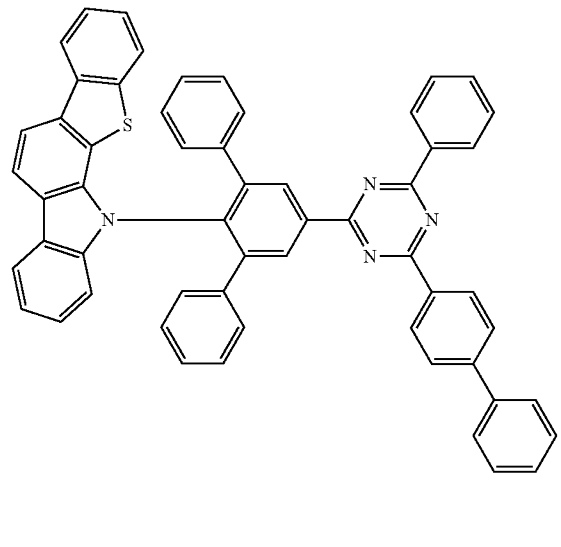
698
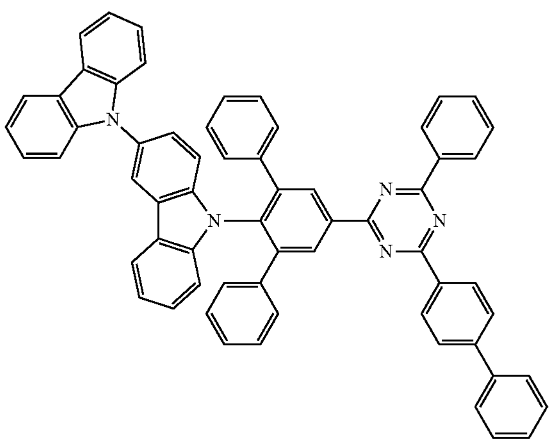
699
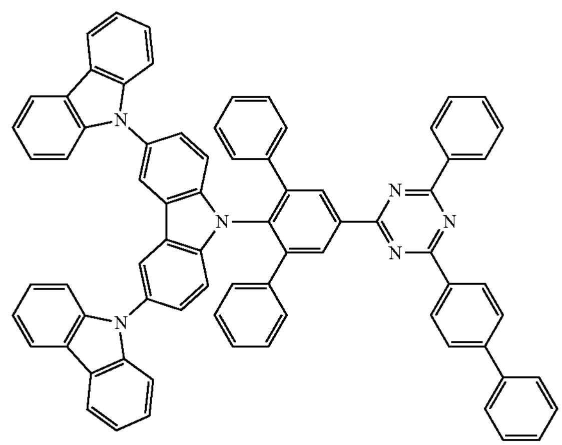
700
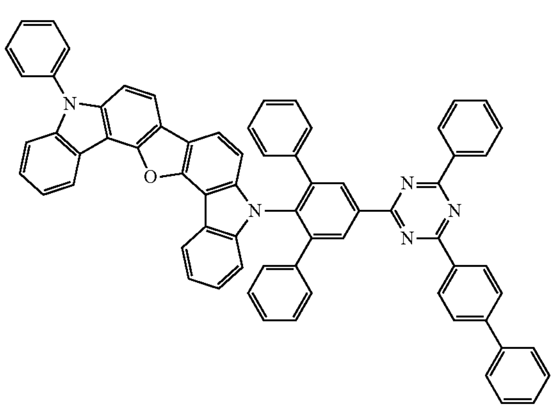
701
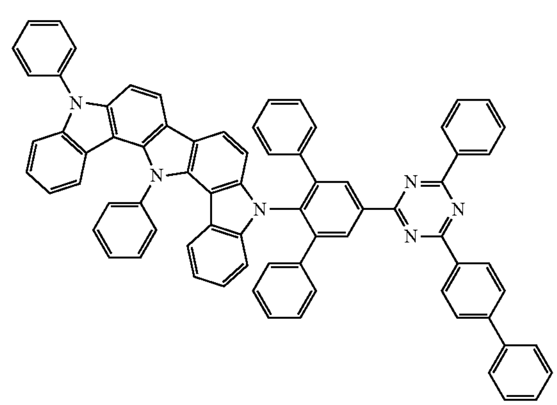

-continued
702
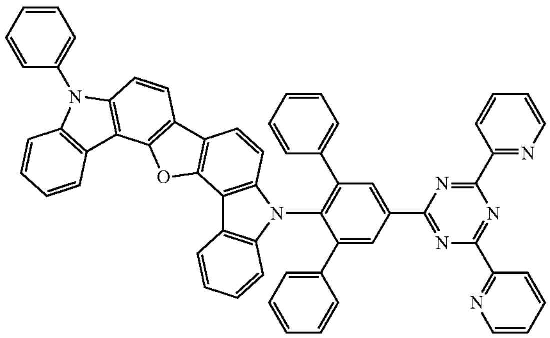
703
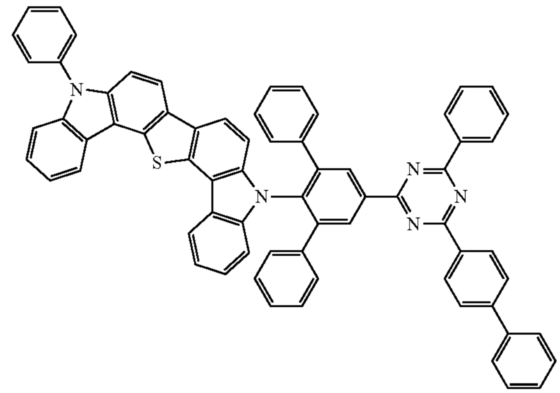
704
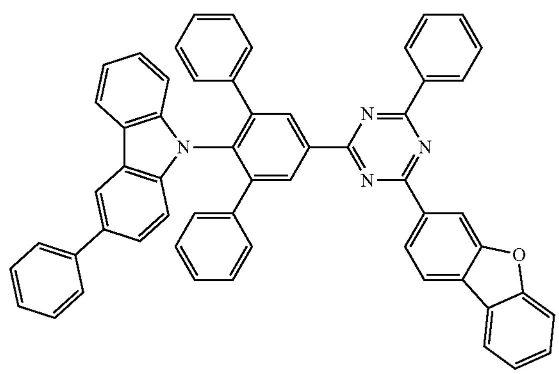
705
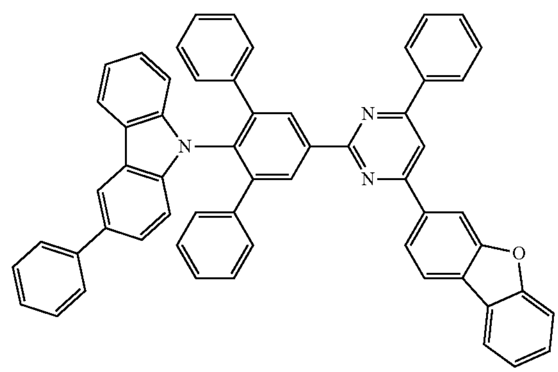
706
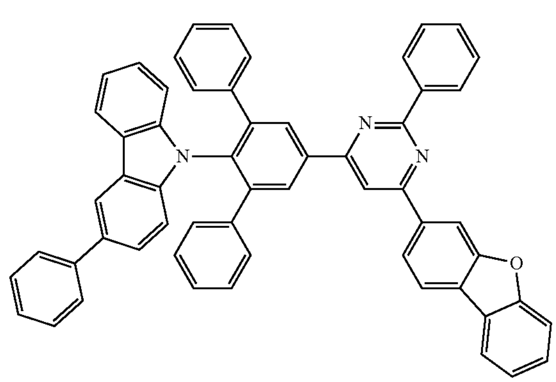
707
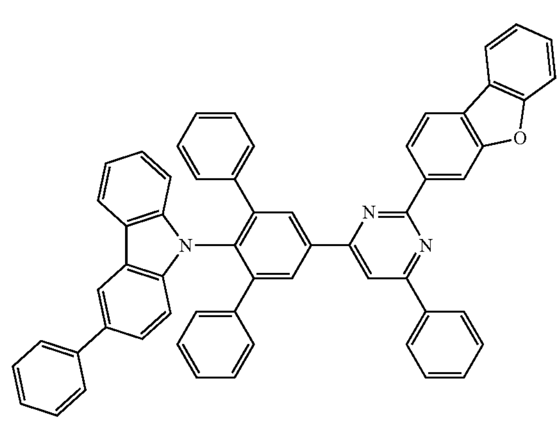

-continued
708
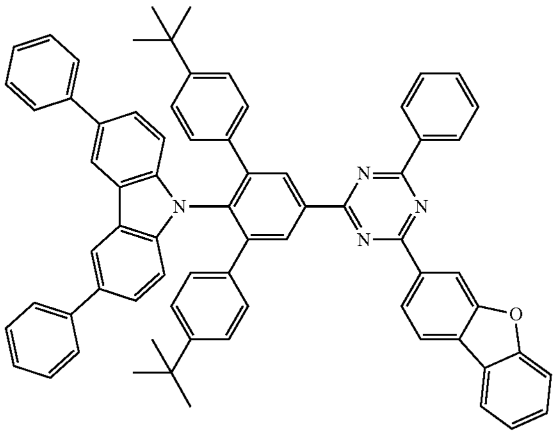
709
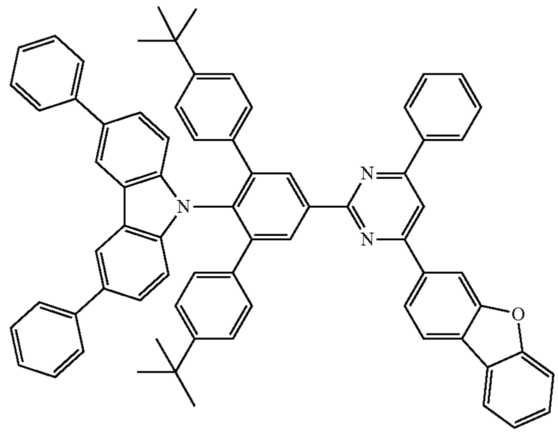
710
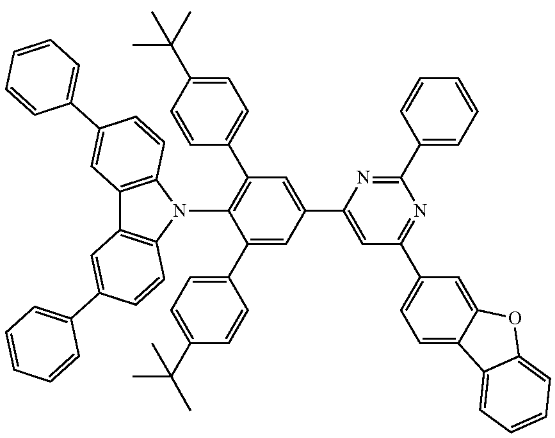
711
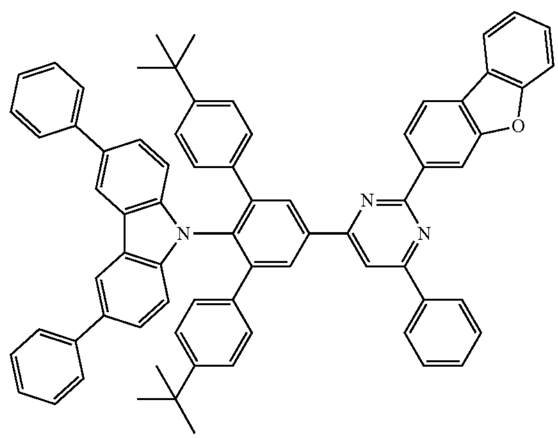
712
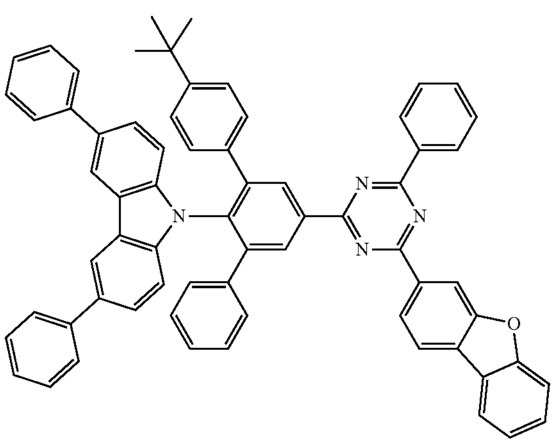
713
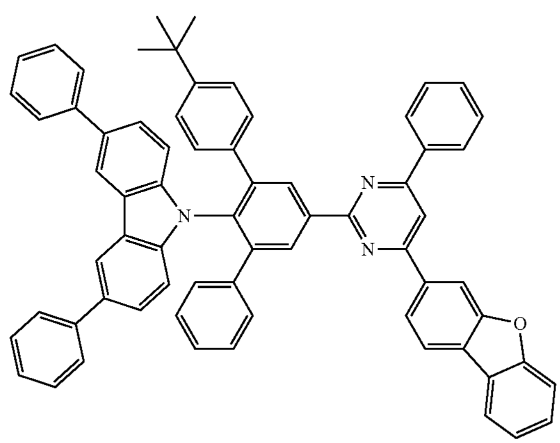

-continued
714
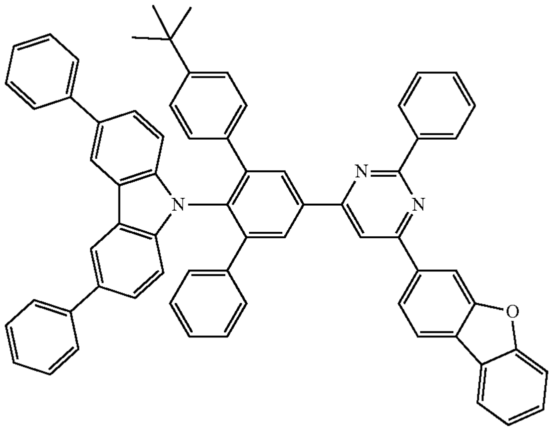
715
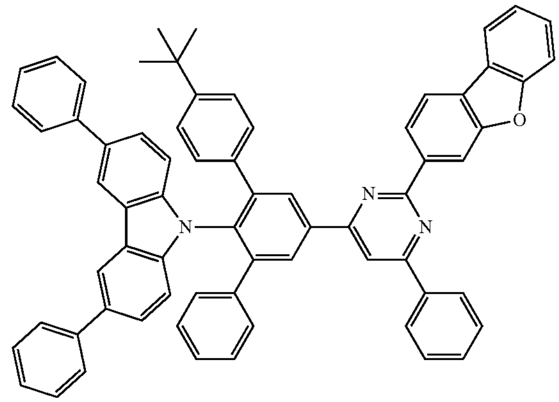
716
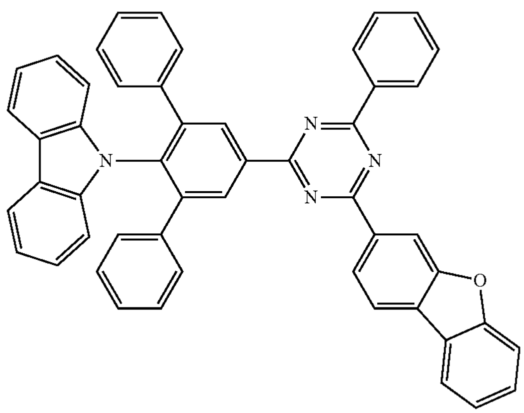
717
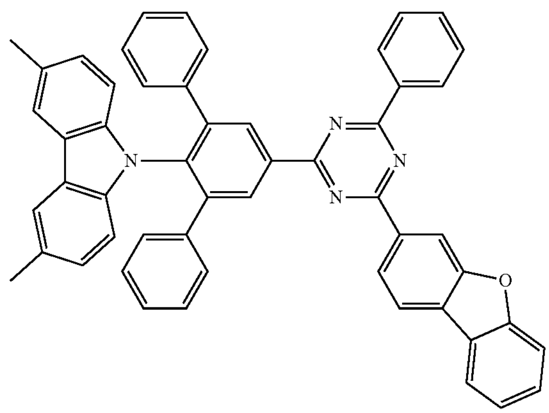
718
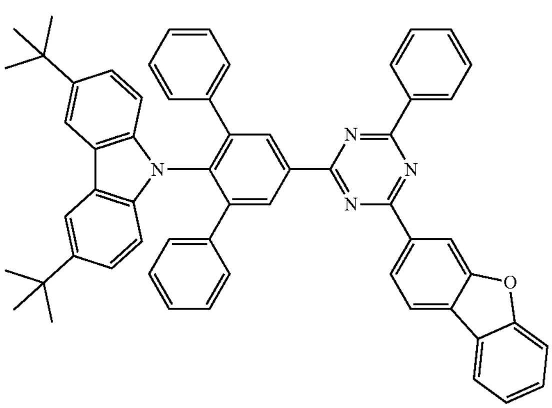
719
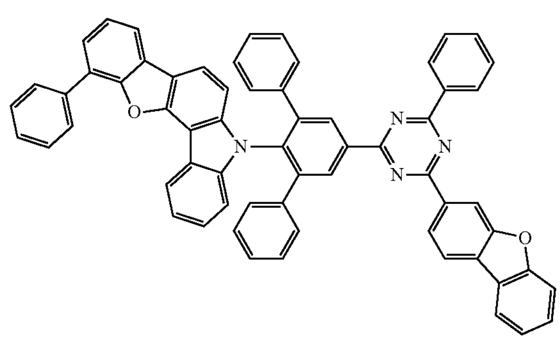

-continued
720
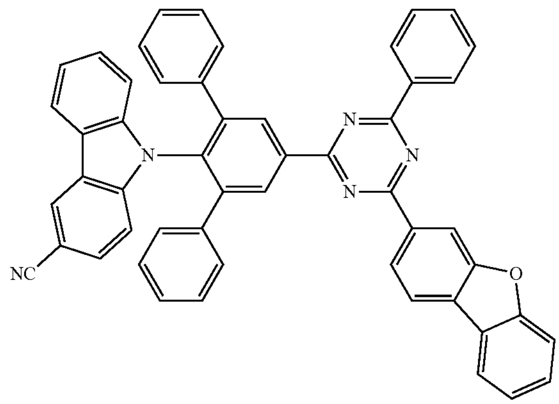
721
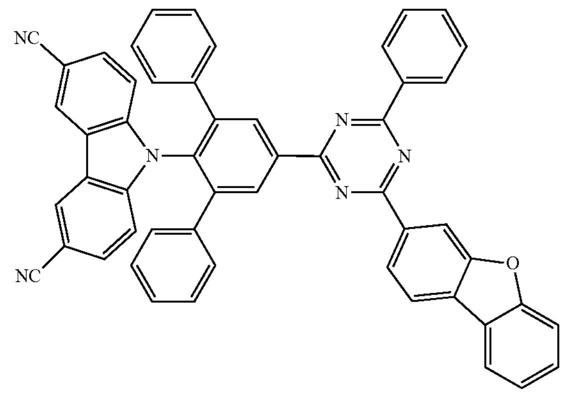
722
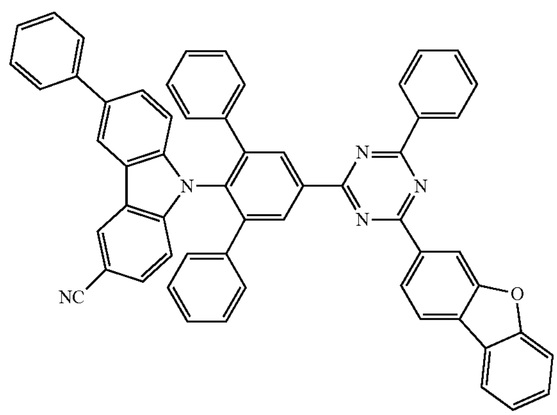
723
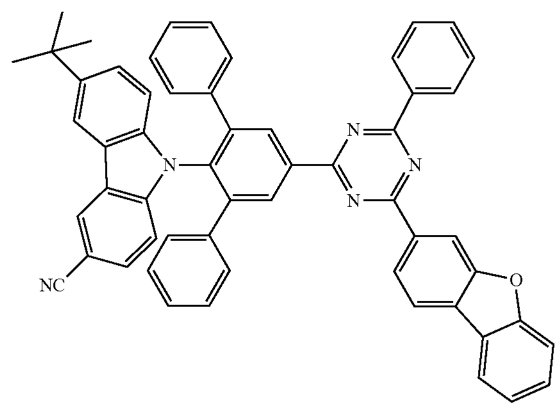
724
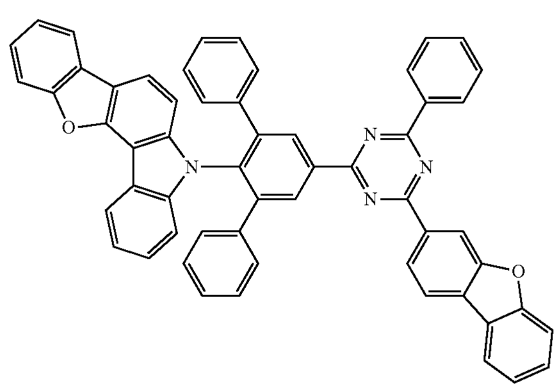
725
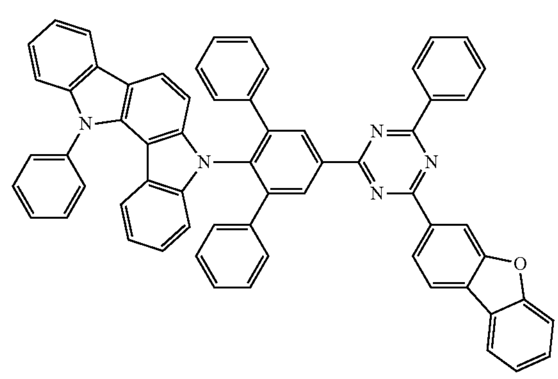

-continued
726
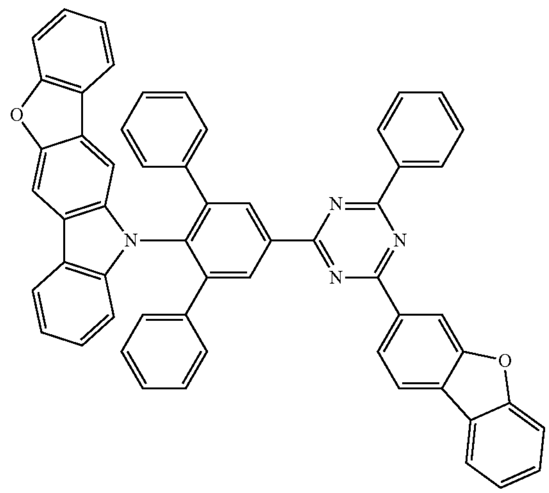
727
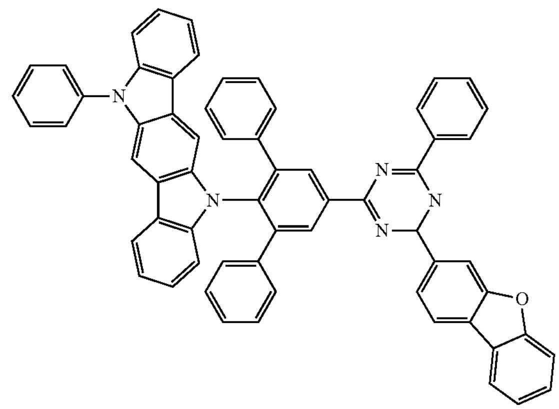
728
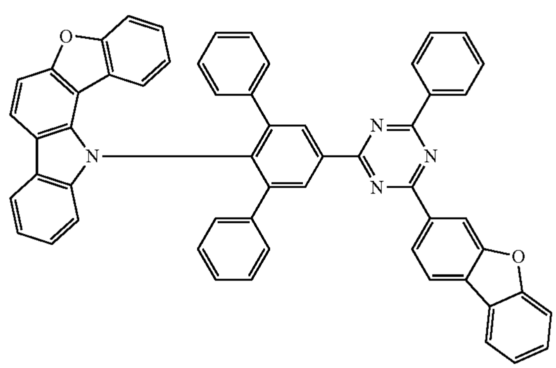
729
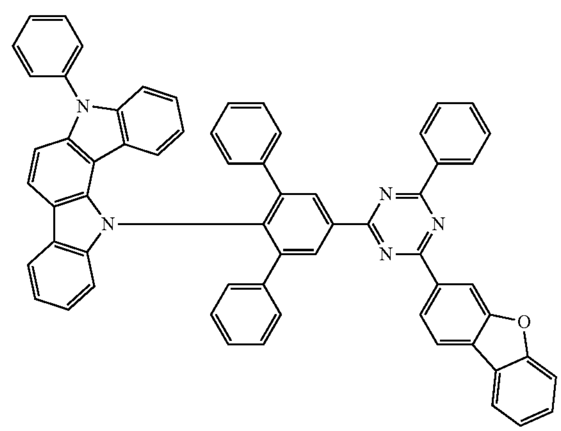
730
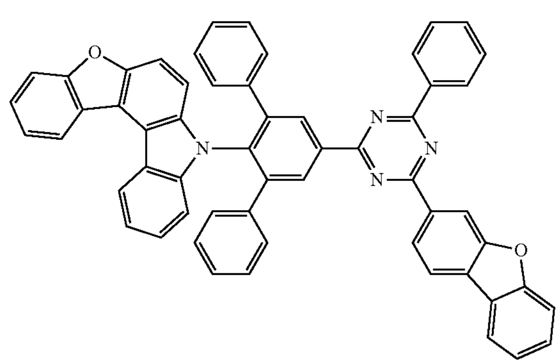
731
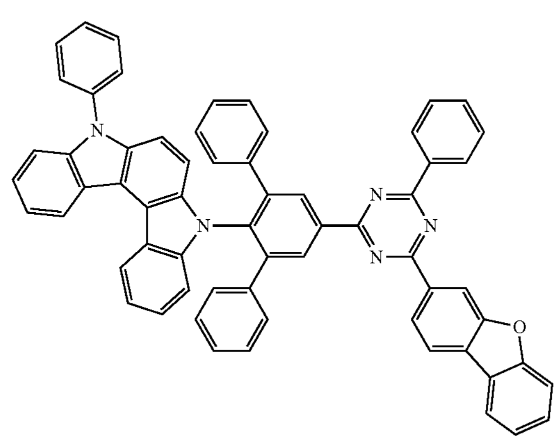

-continued
732
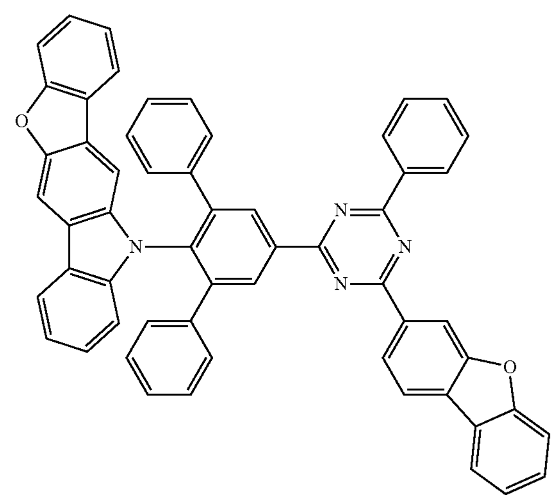
733
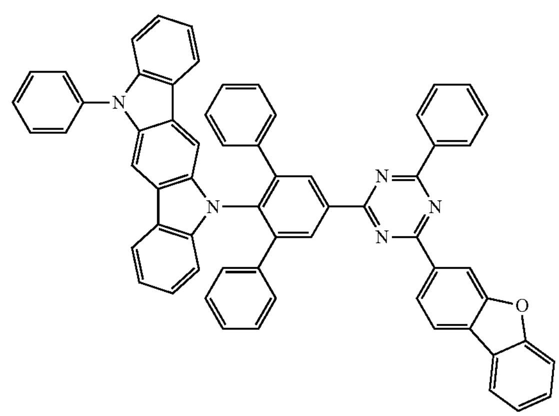
734
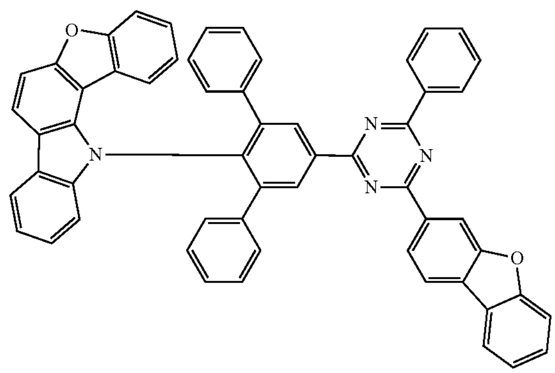
735
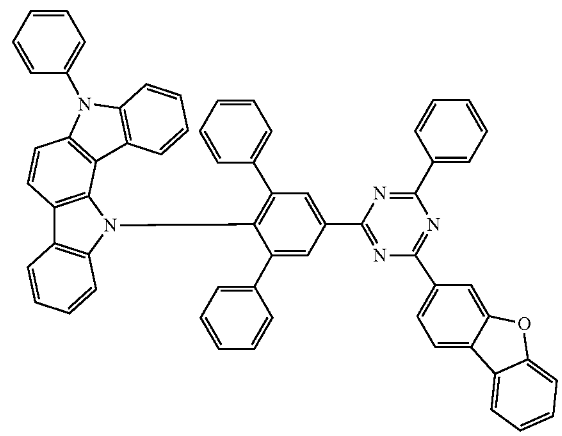
736
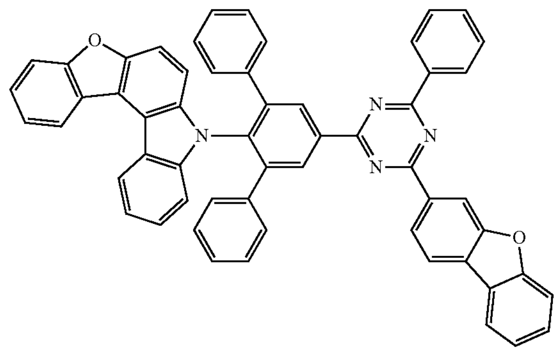
737
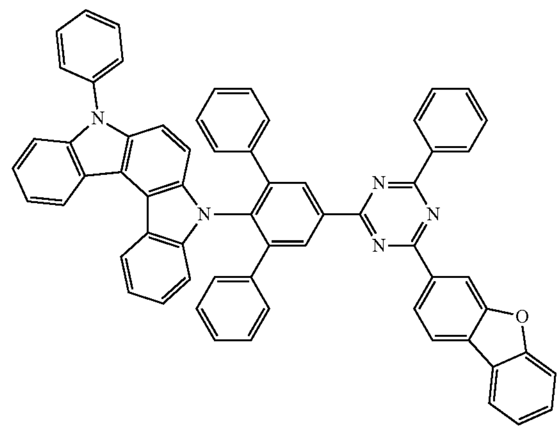

-continued
738
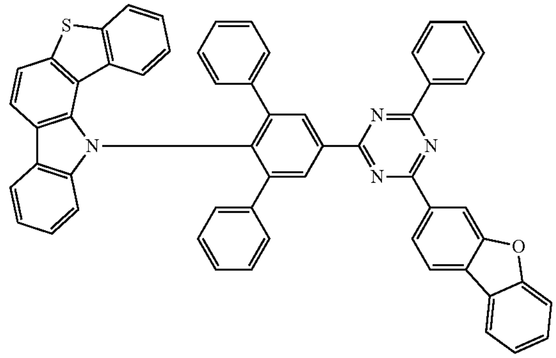
739
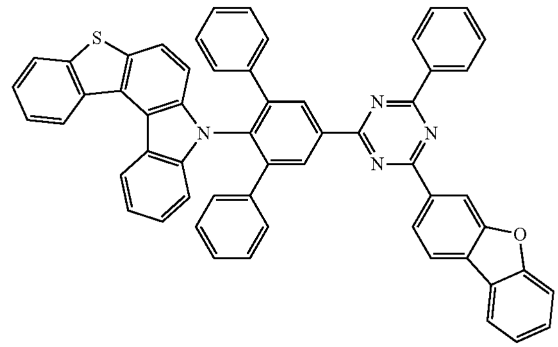
740
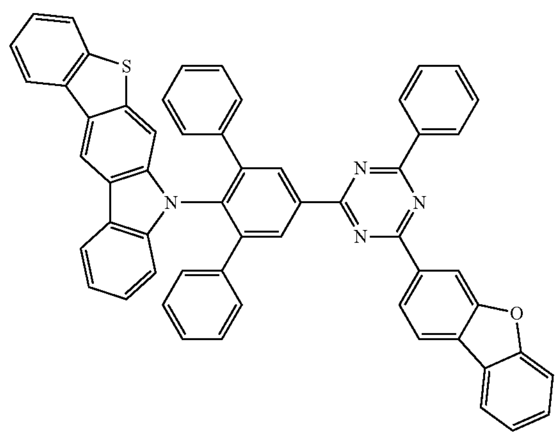
741
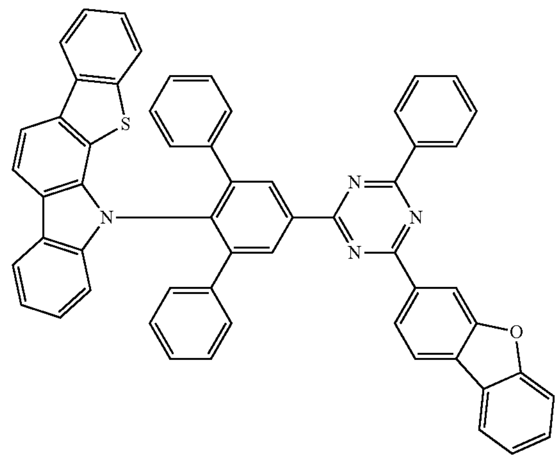
742
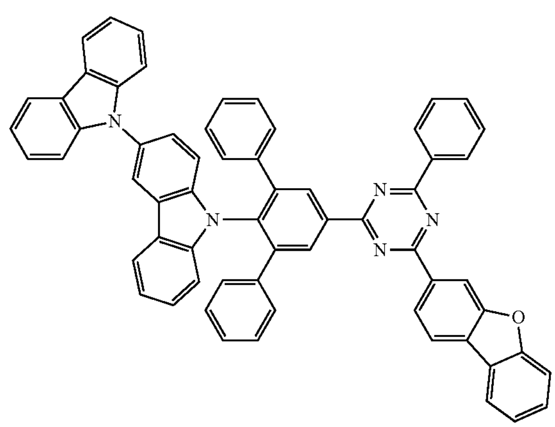
743
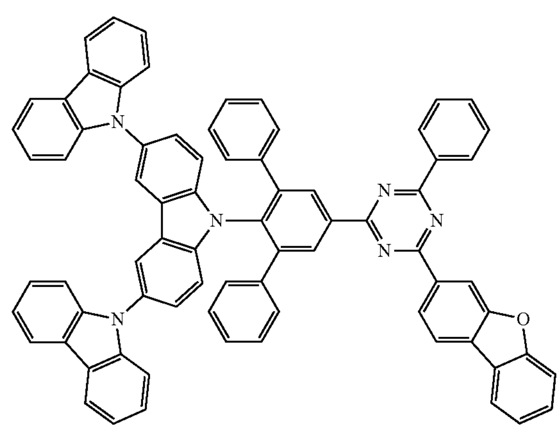

-continued
744
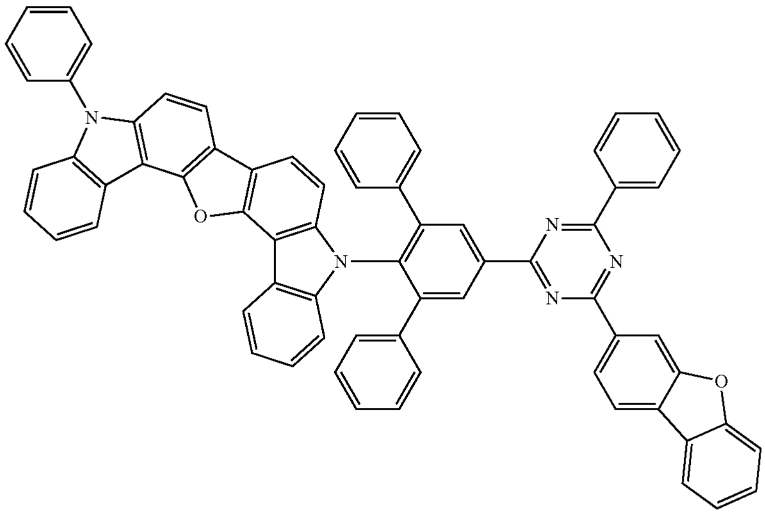
745
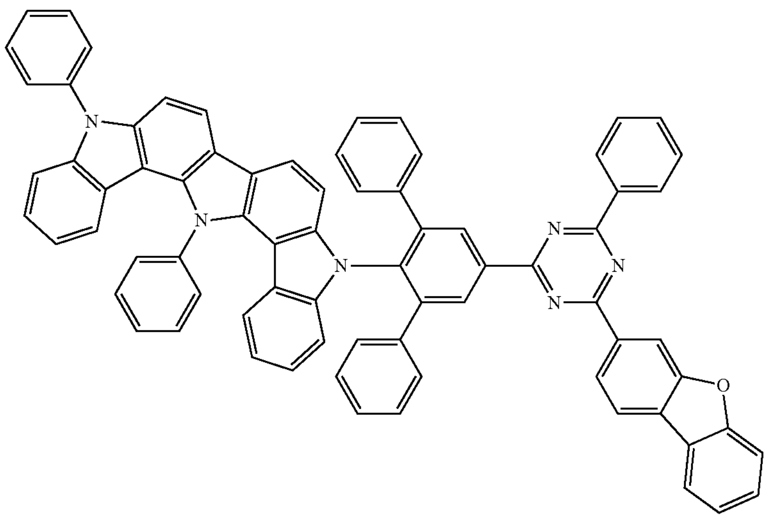
746
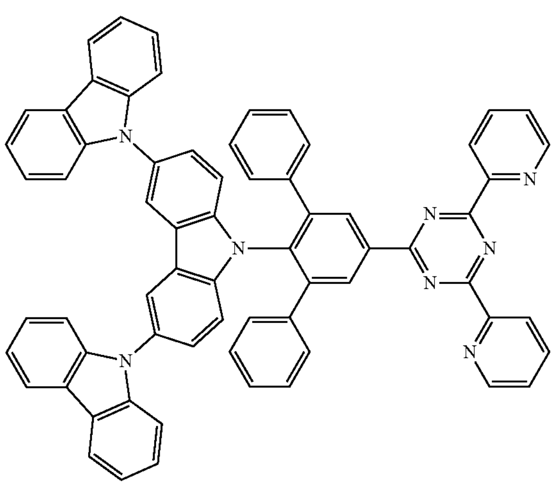
747
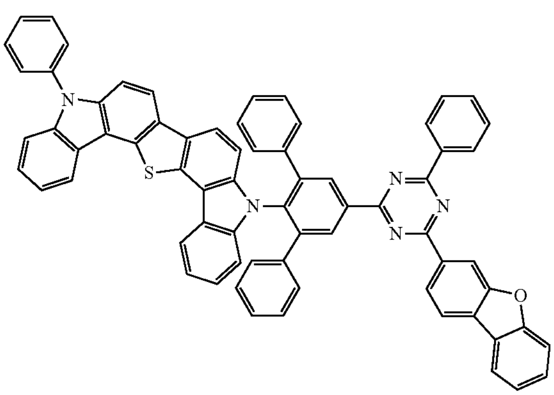

-continued
748
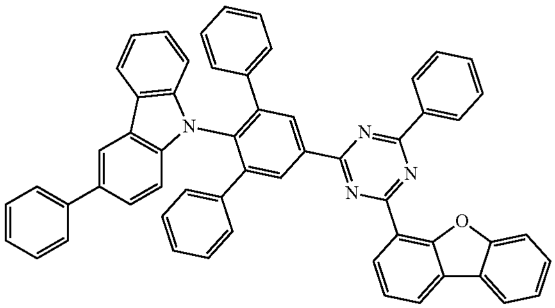
749
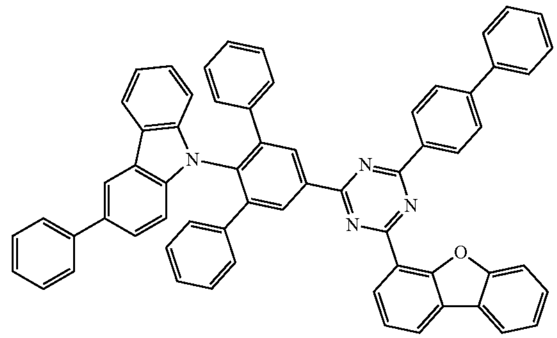
750
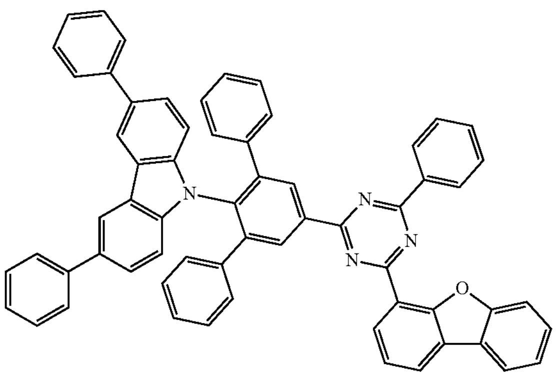
751
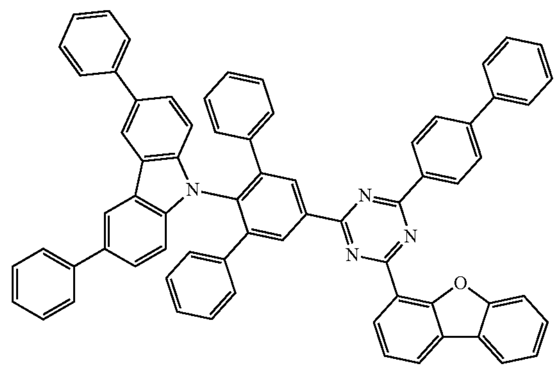
752
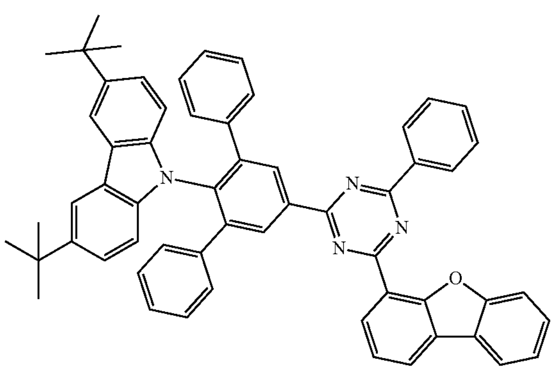
753
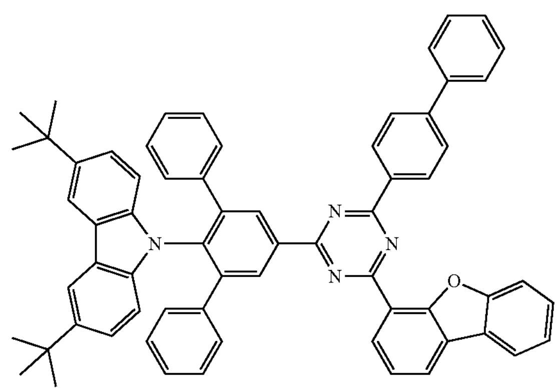

-continued
754
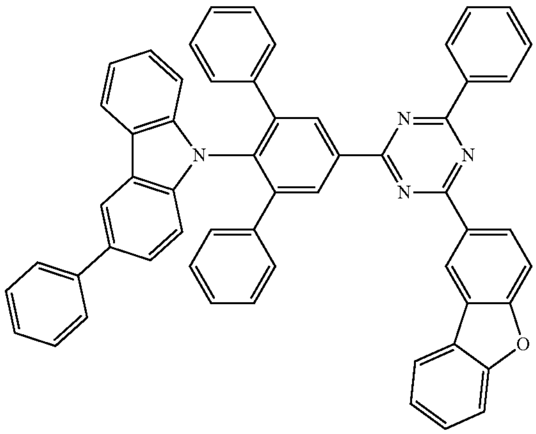
755
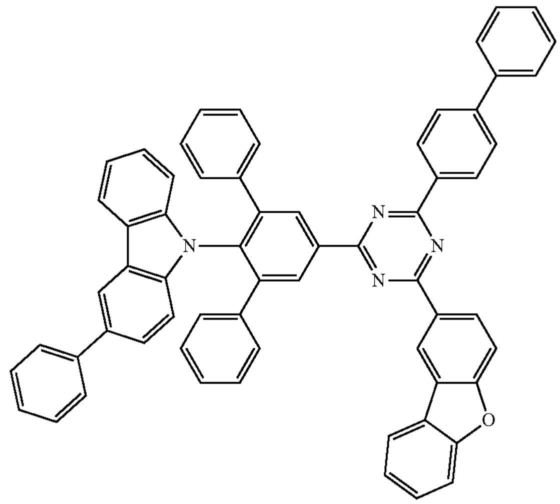
756
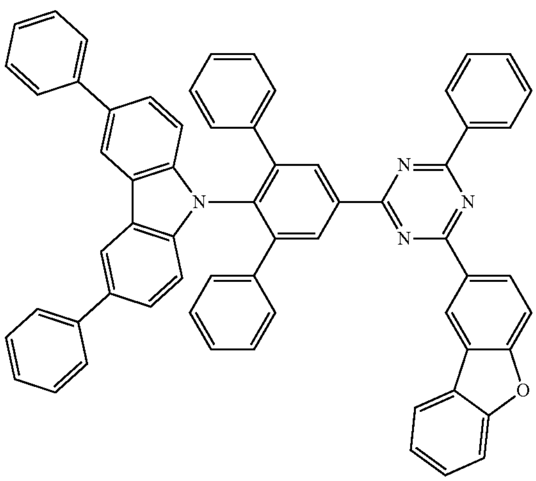
757
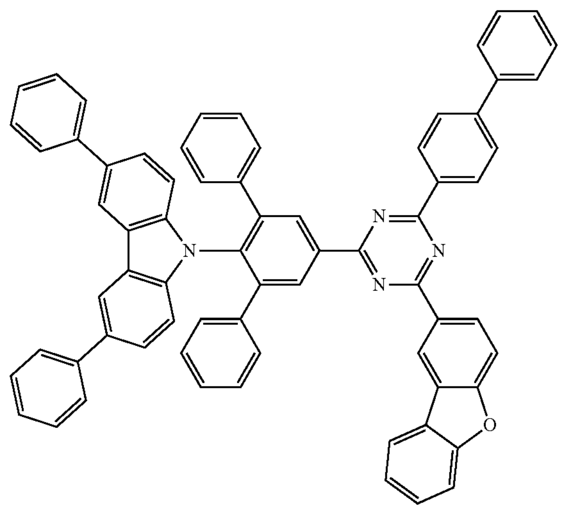
758
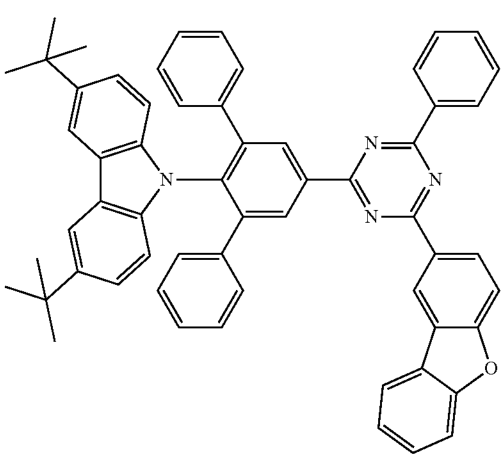
759
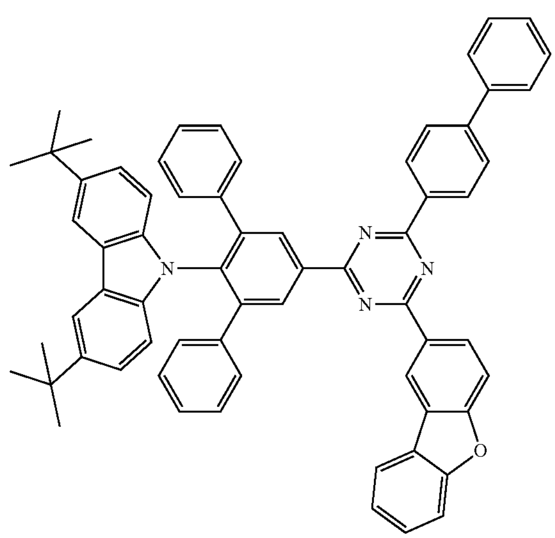

-continued
760
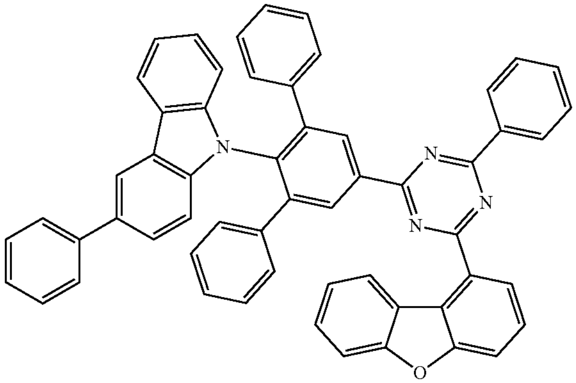
761
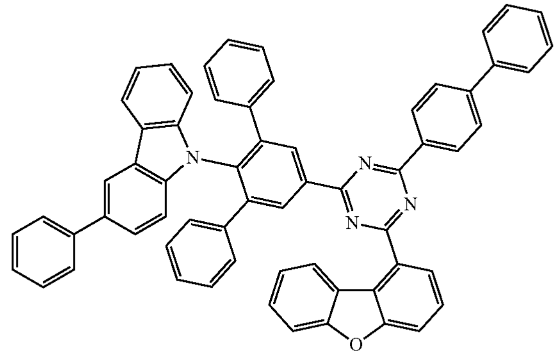
762
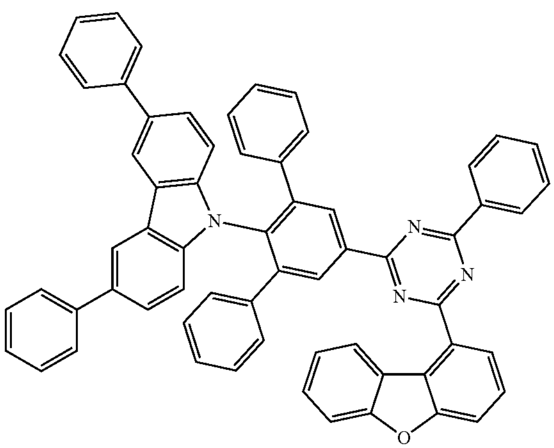
763
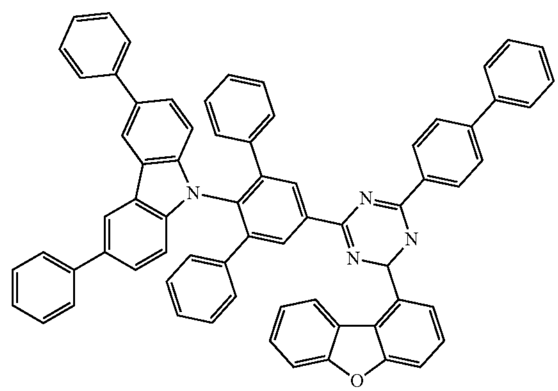
764
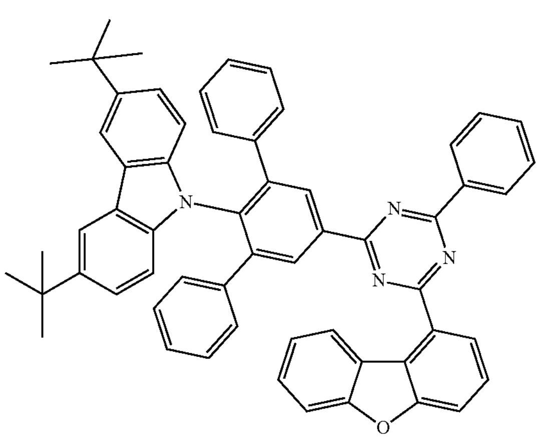
765
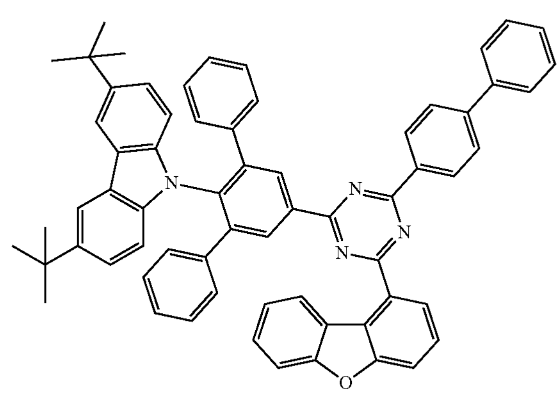

-continued
766
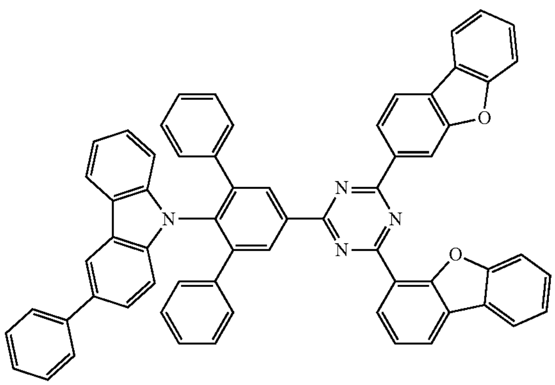
767
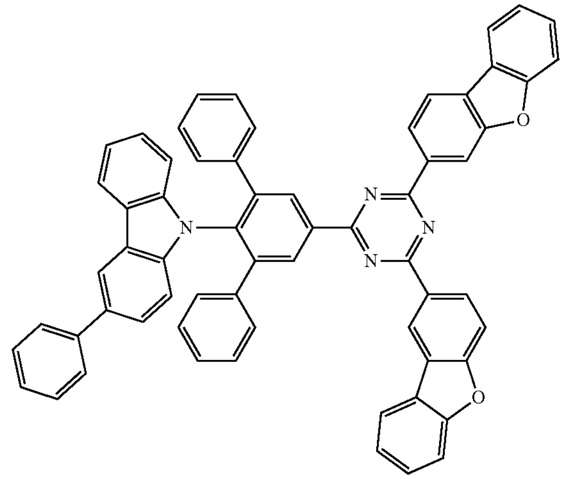
768
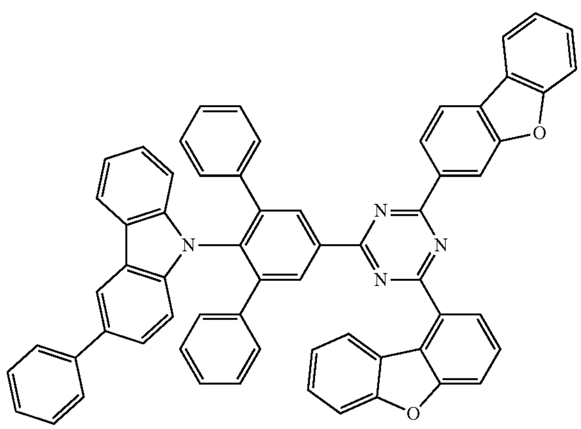
-continued
770
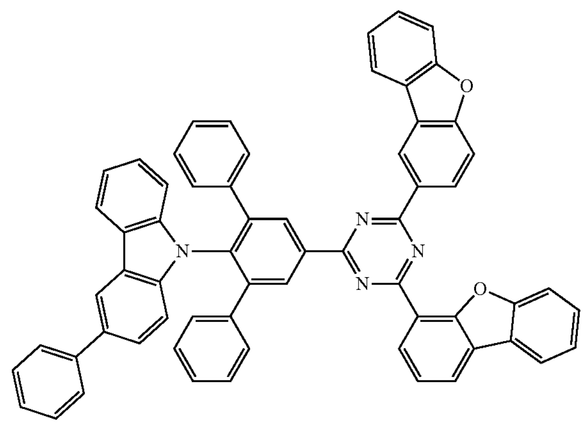
769
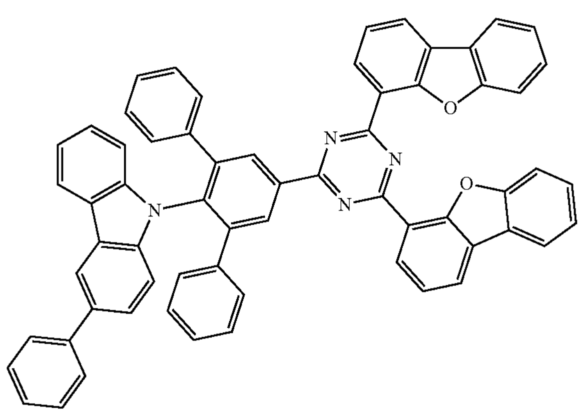
771
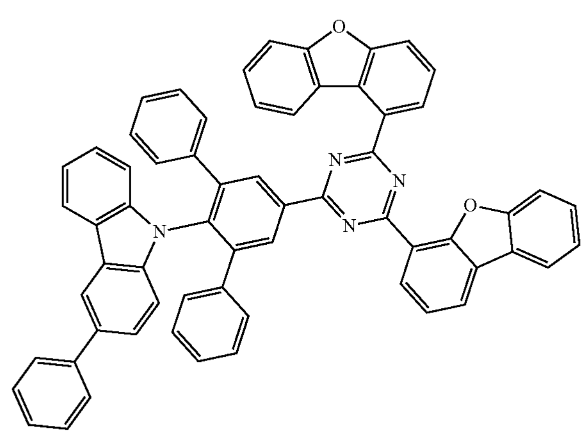

-continued
772
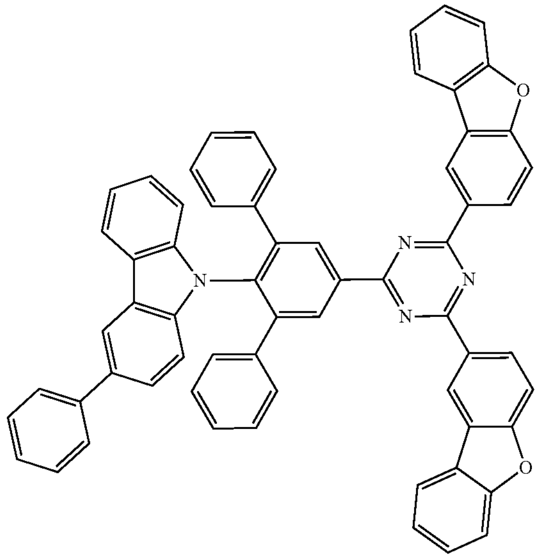
773
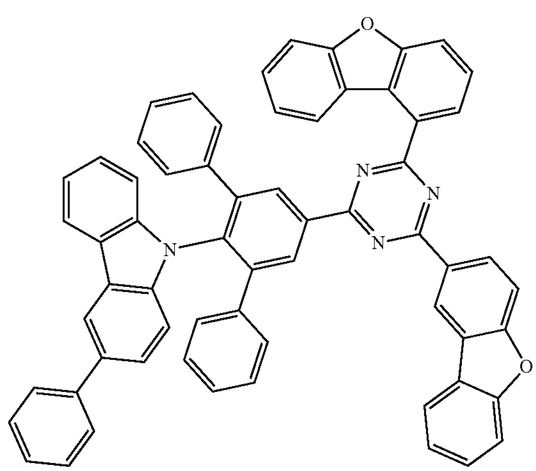
774
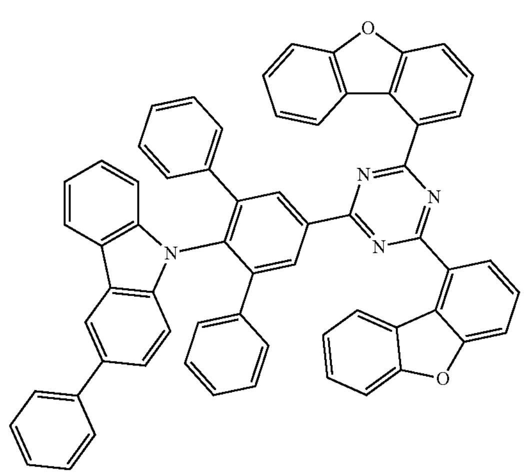
-continued
775
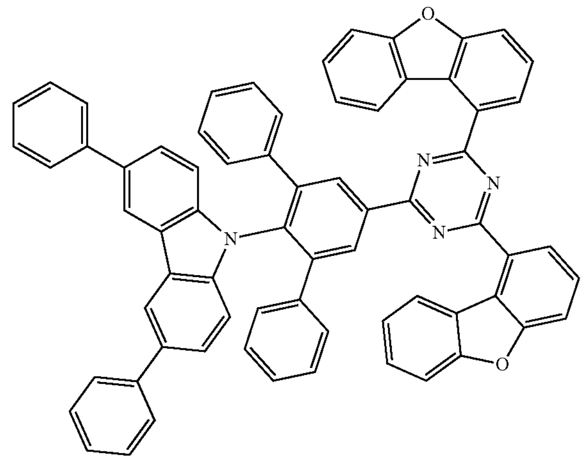
776
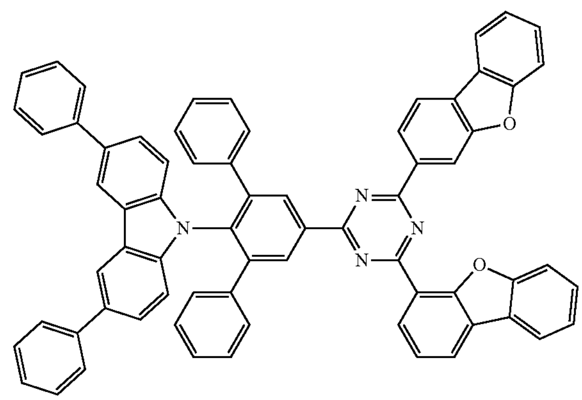
777
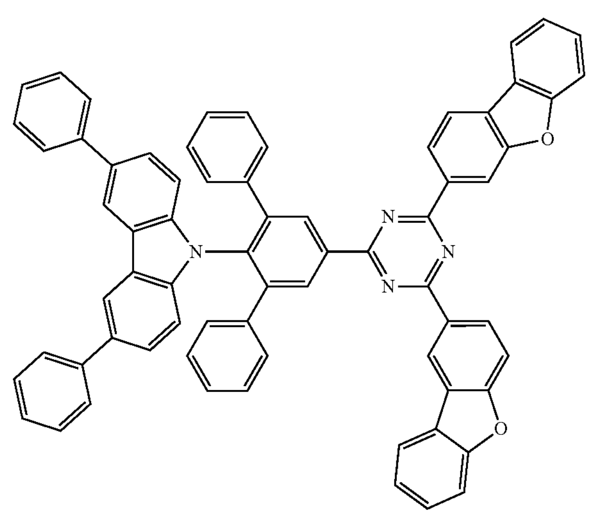

778
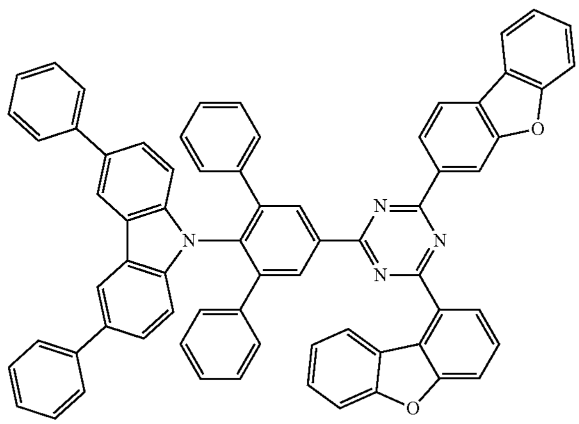
779
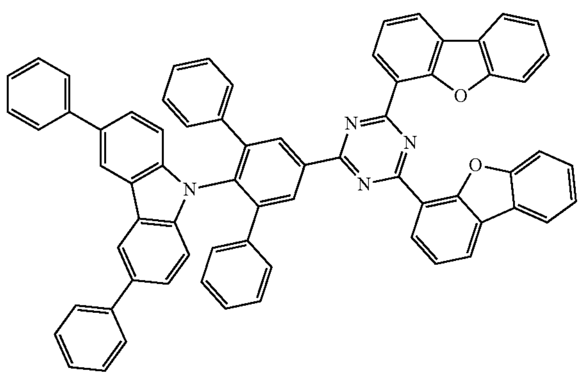
780
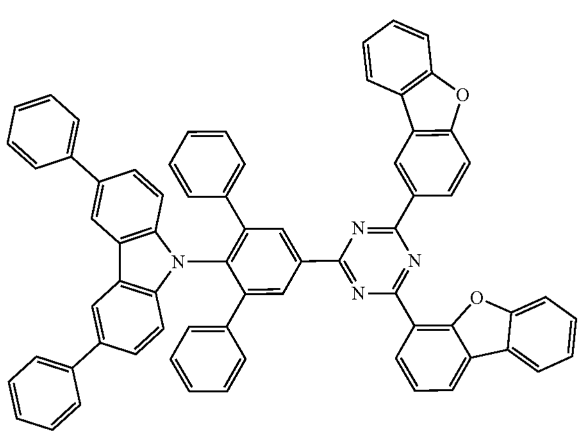
781
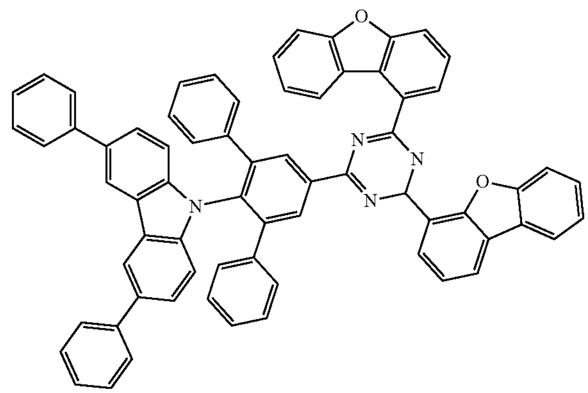
782
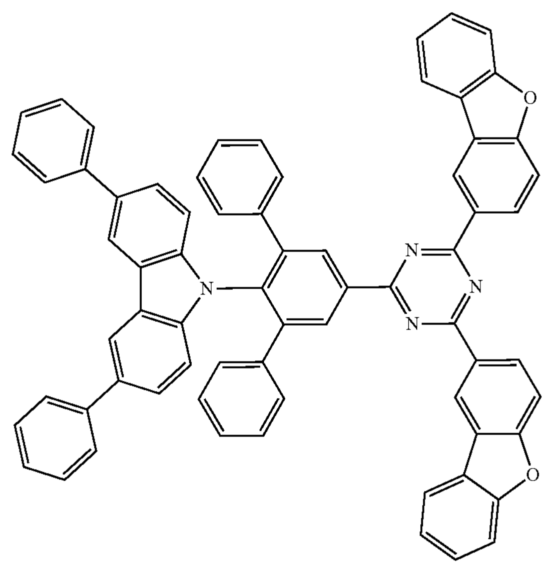
783
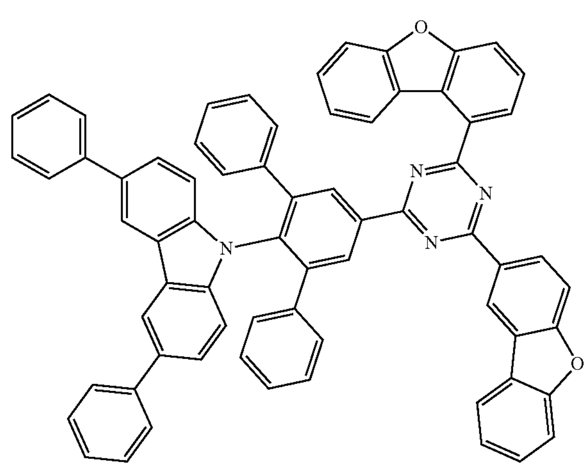

-continued
784
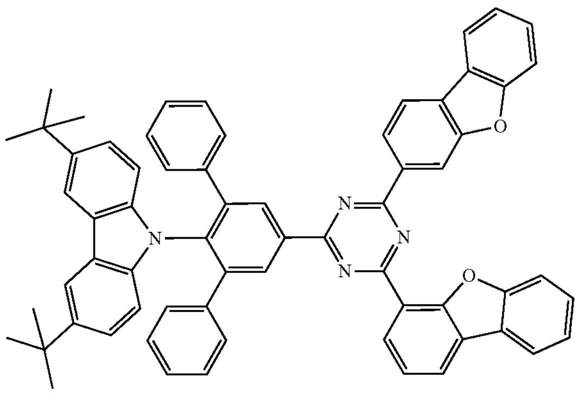
785
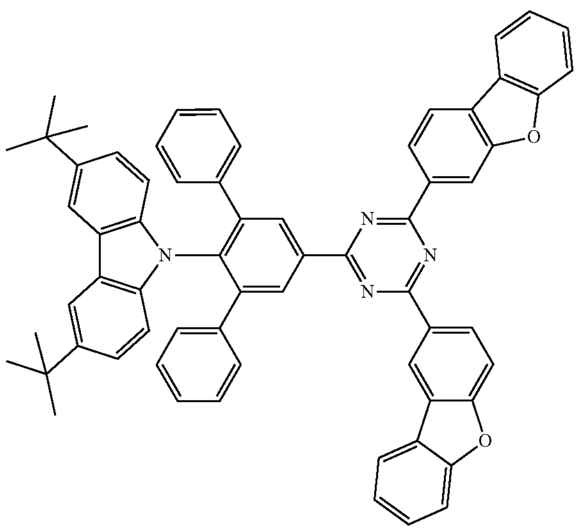
786
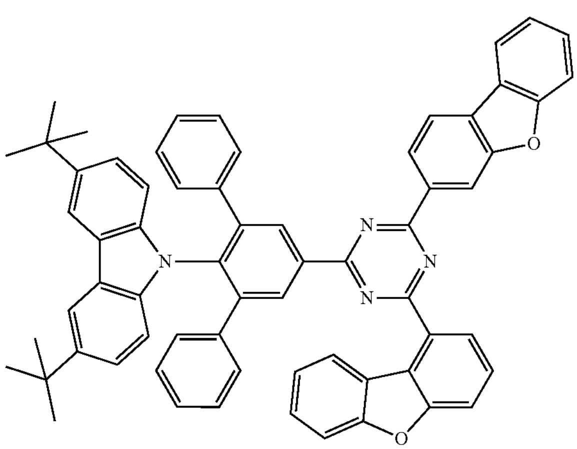
-continued
787
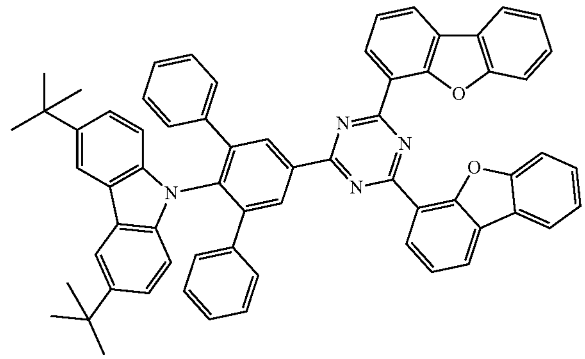
788
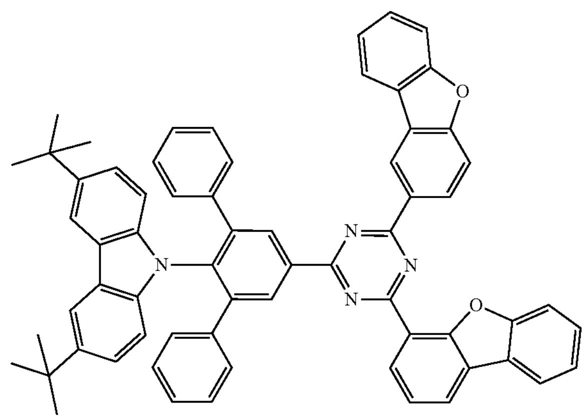
789
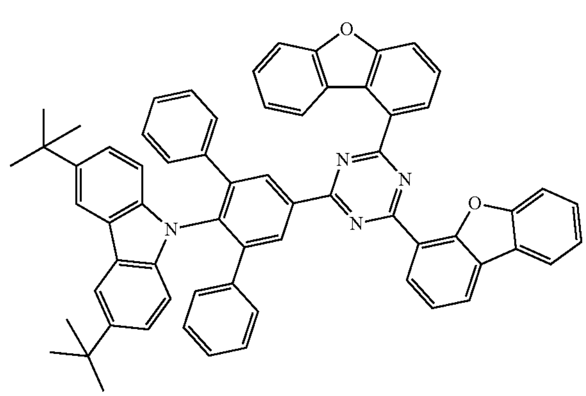

-continued
790
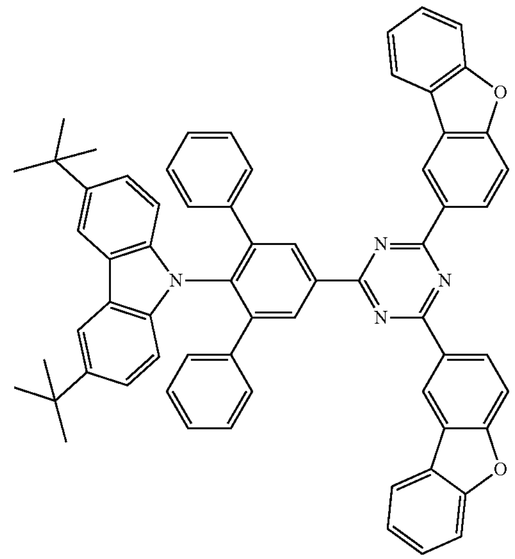
791
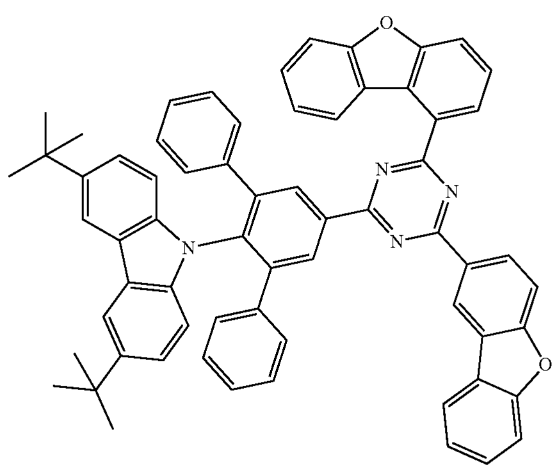
792
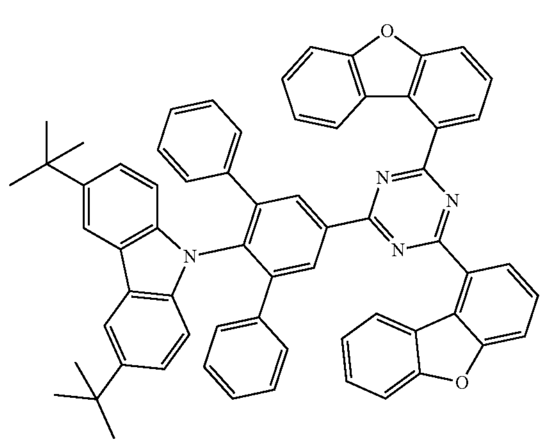
-continued
793
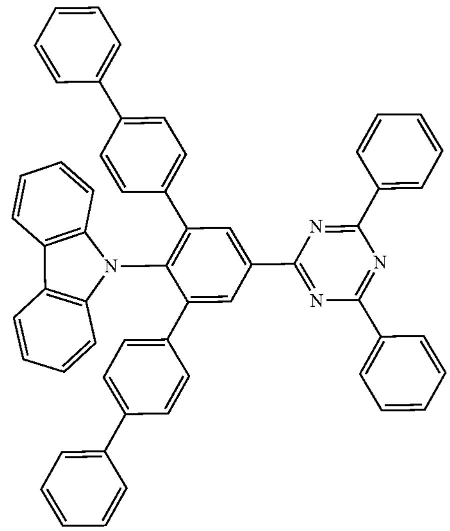
794
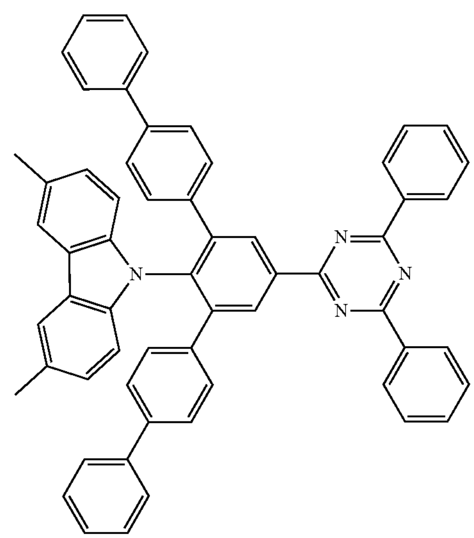
795
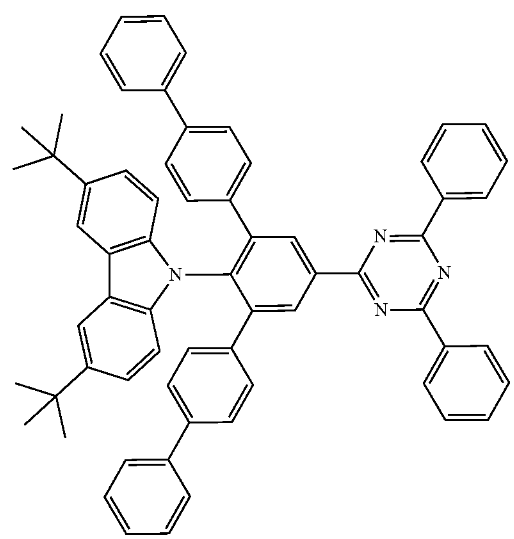

796
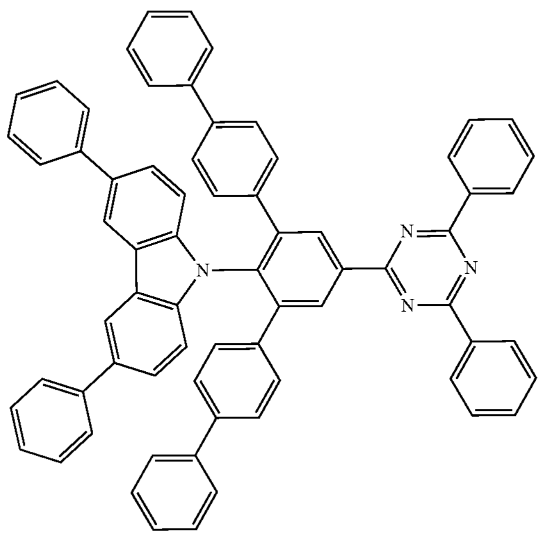
797
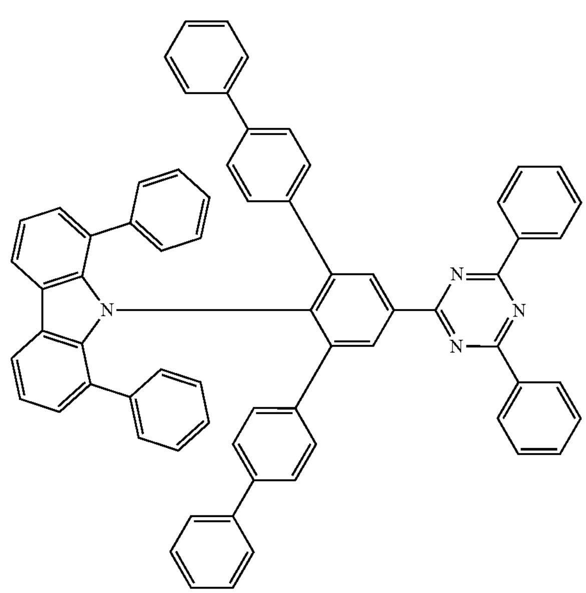
798
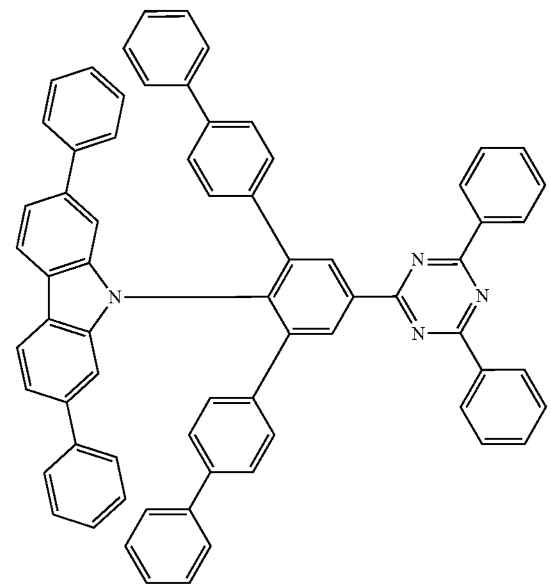
799
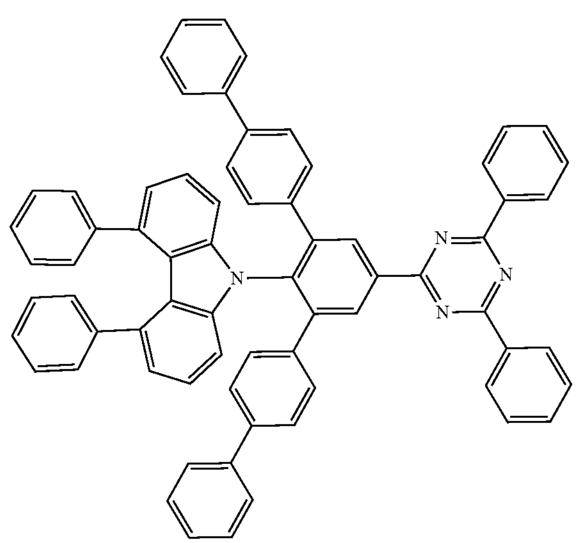

-continued
800
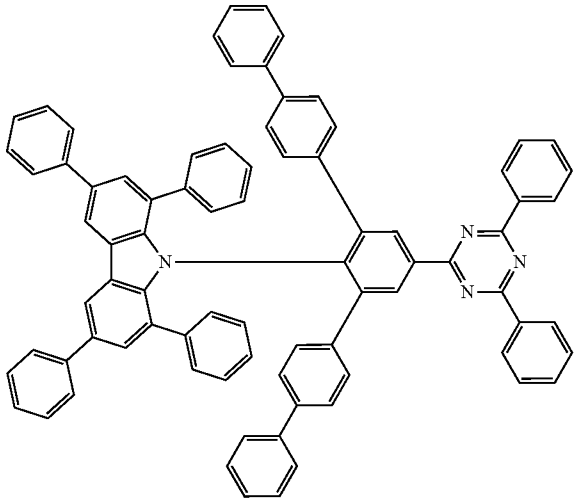
801
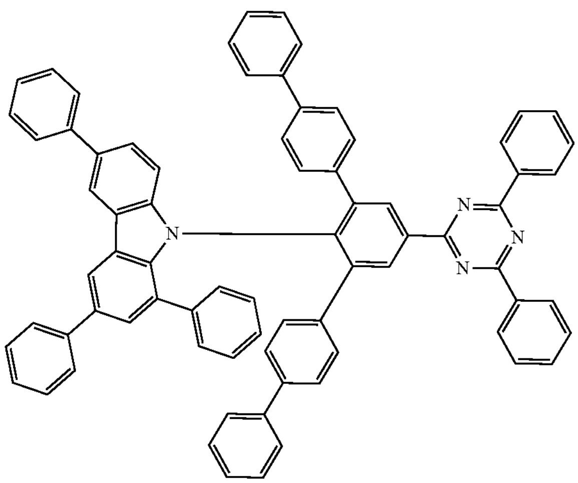
802
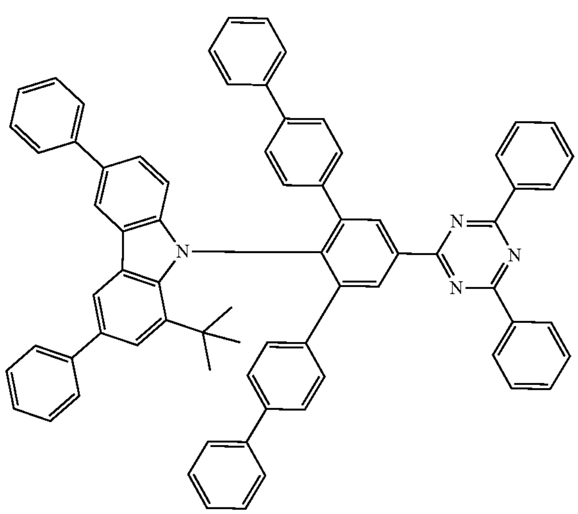
-continued
803
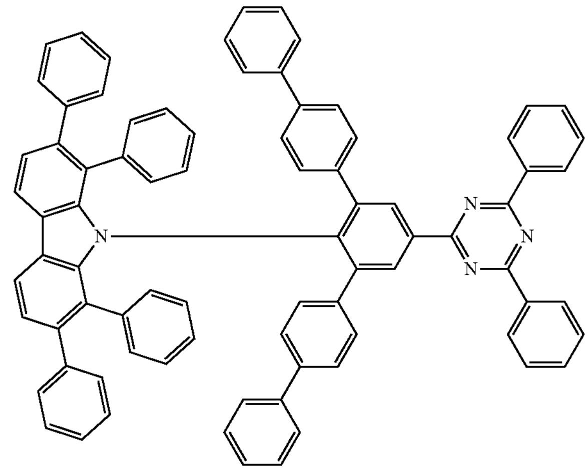
804
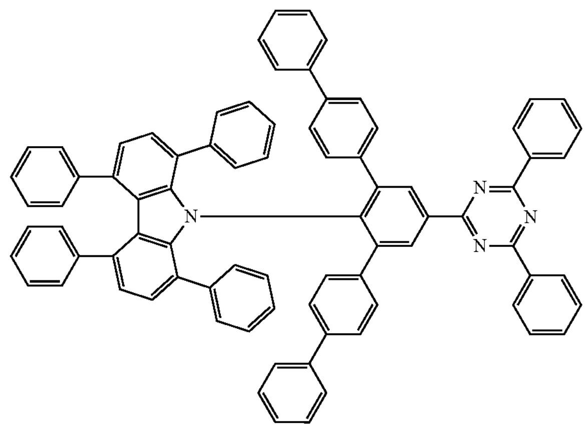
805
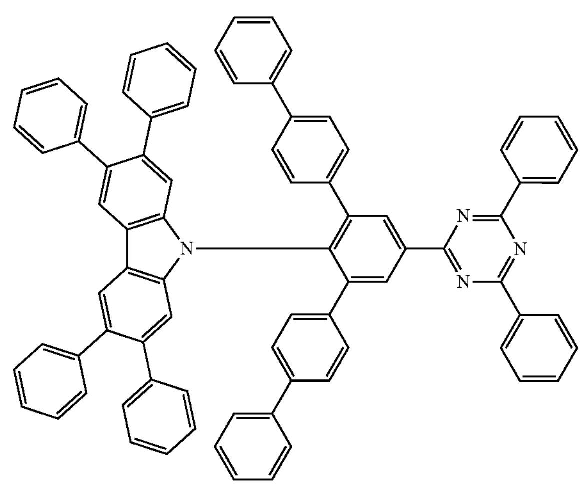

806
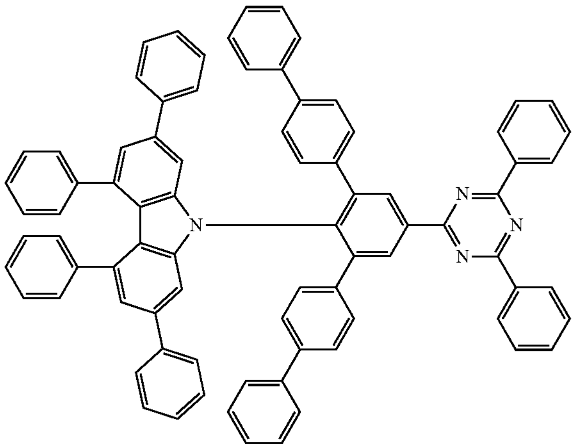
809
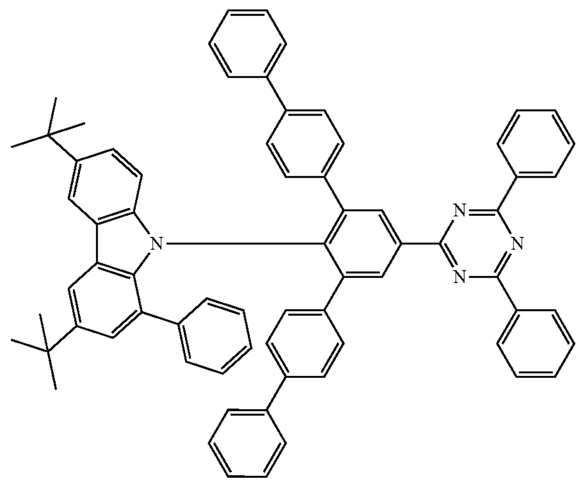
807
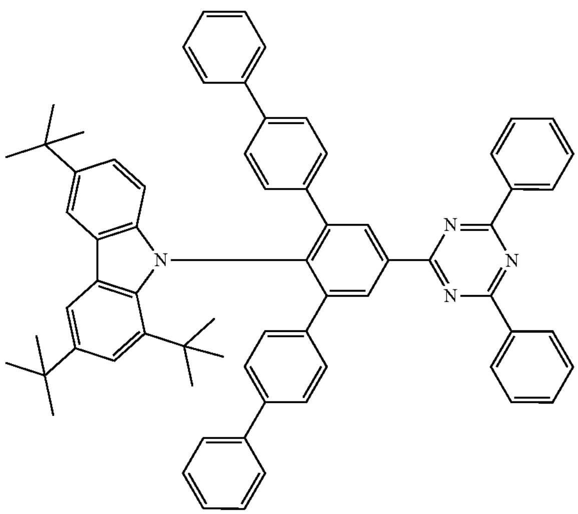
810
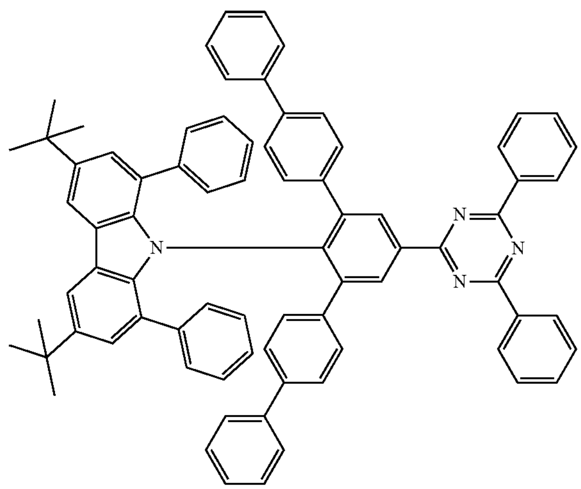
808
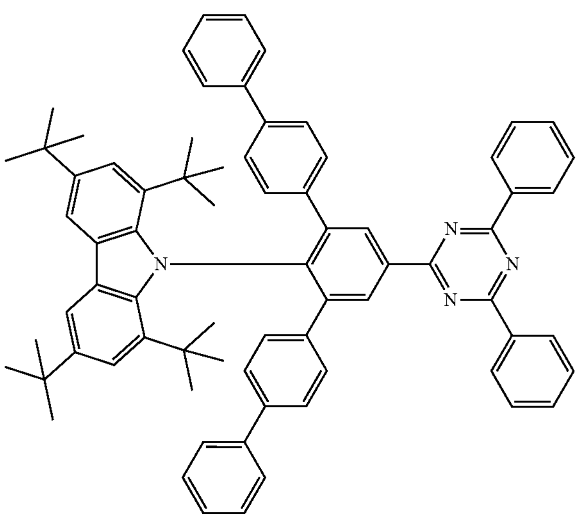
811
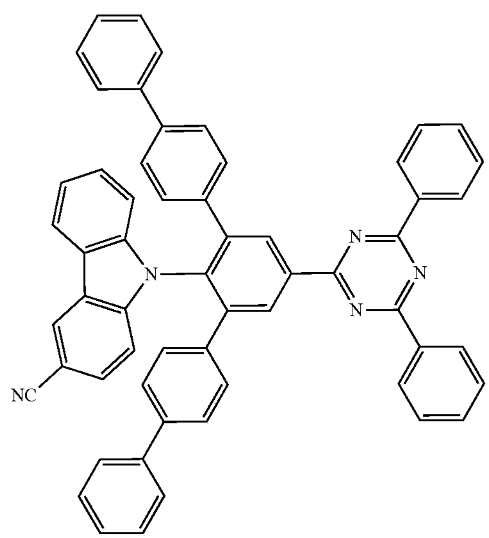

-continued
812
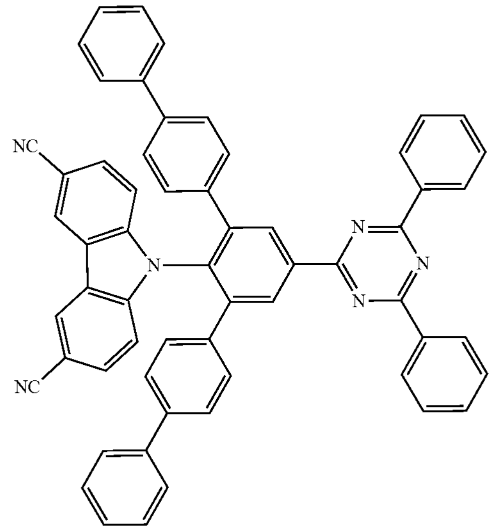
813
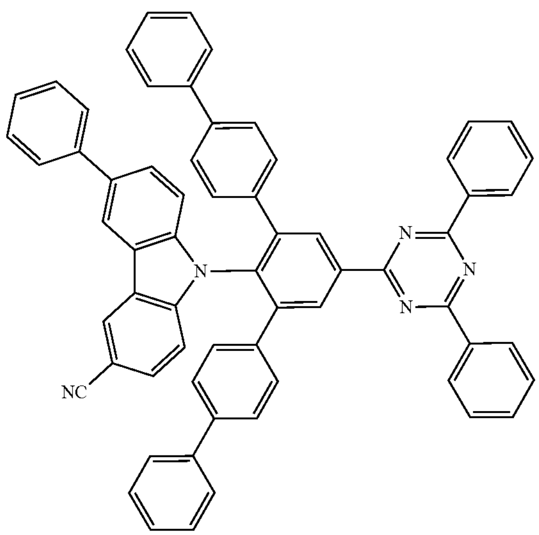
814
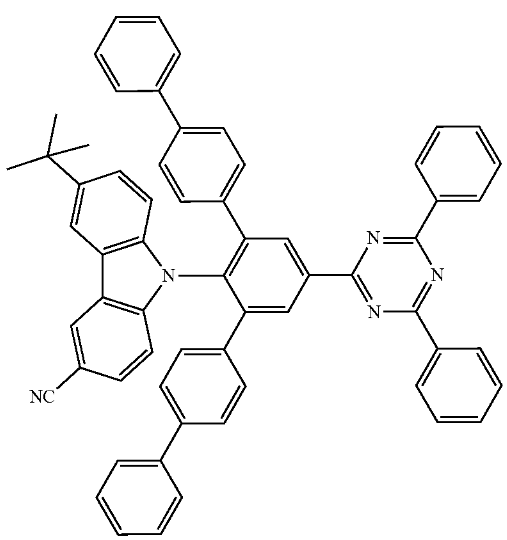
-continued
815
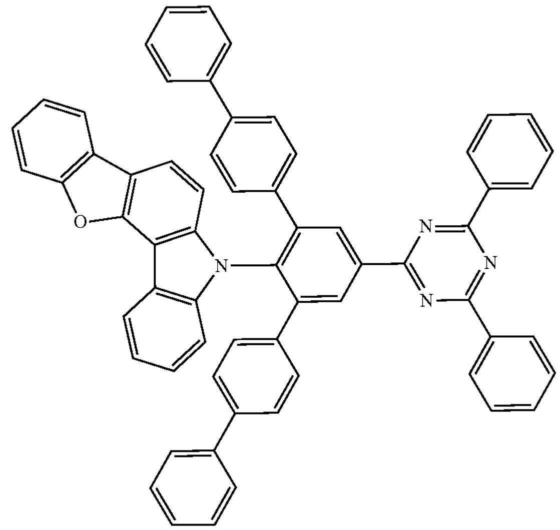
816
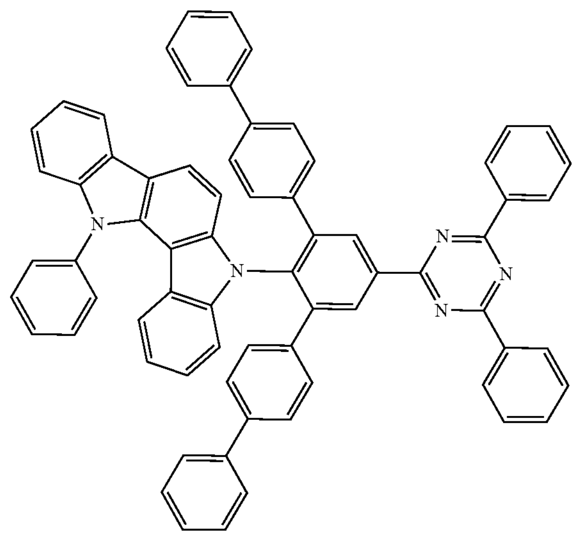
817
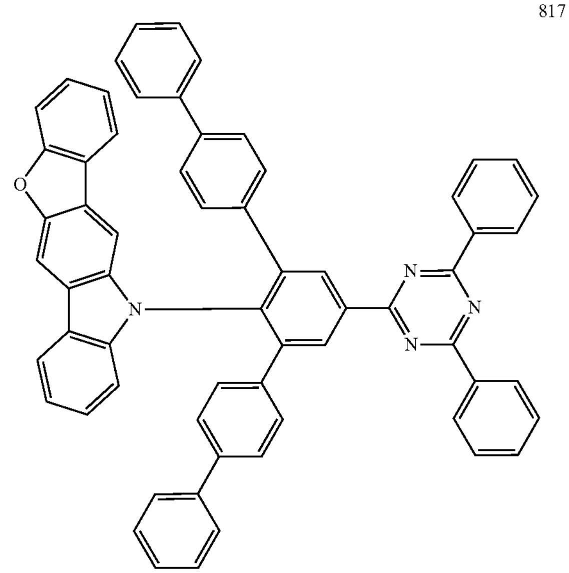

818
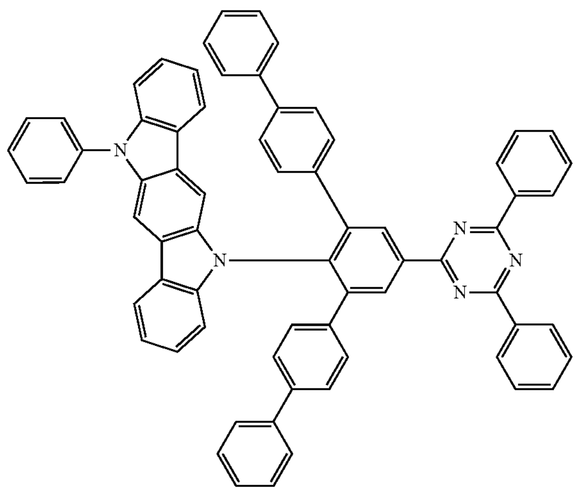
819
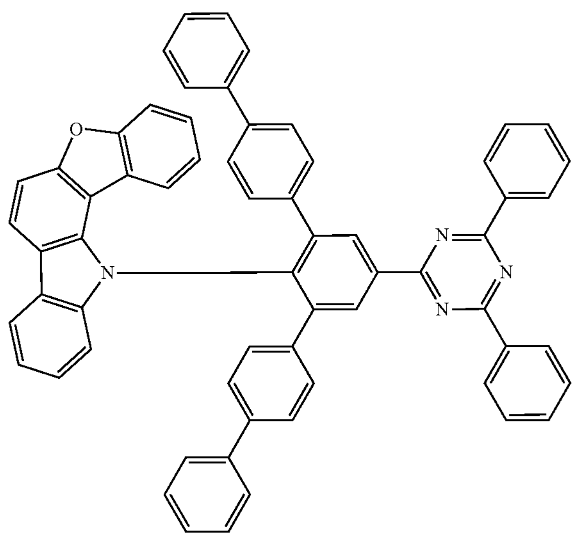
820
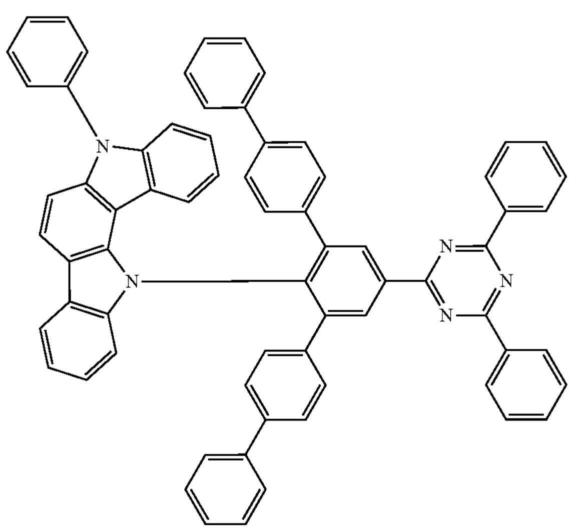
821
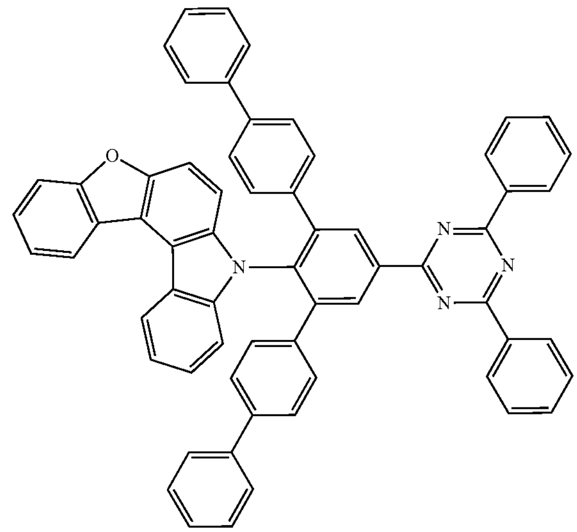
822
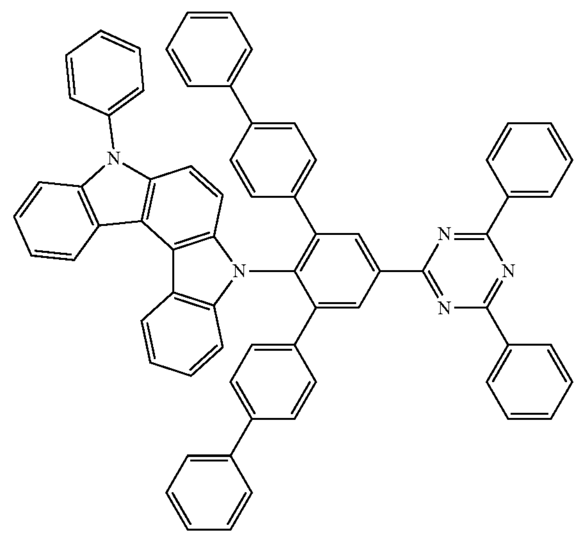
823
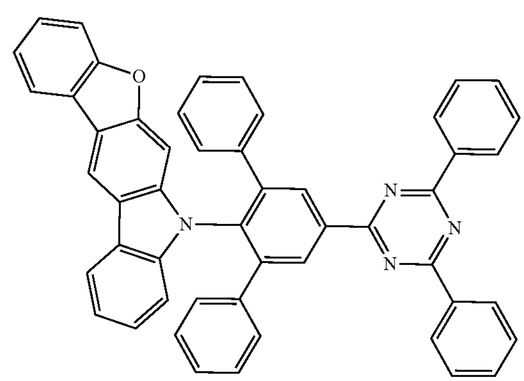

824
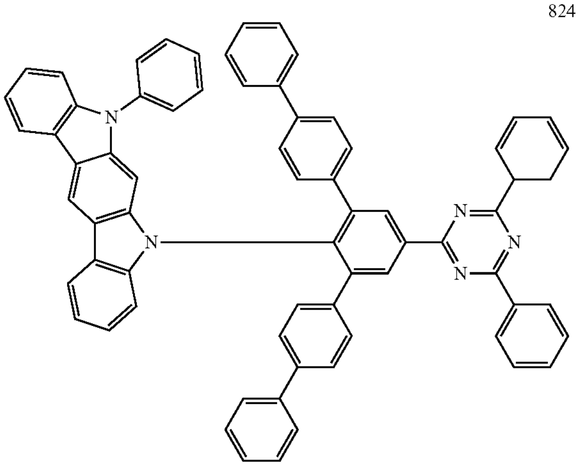
825
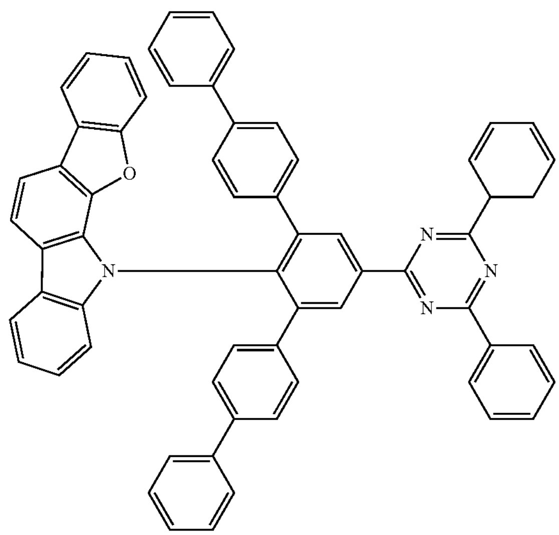
826
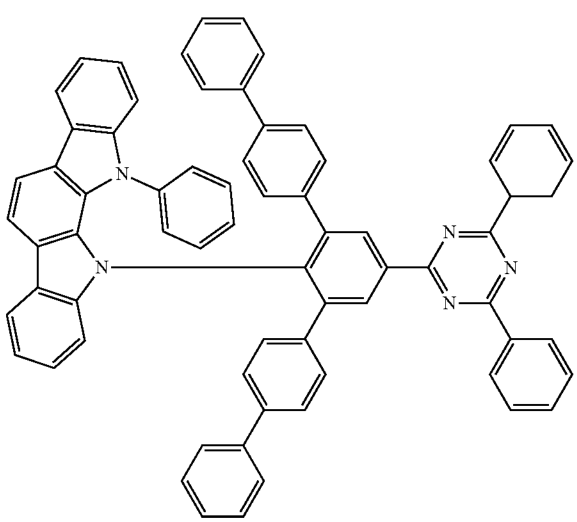
827
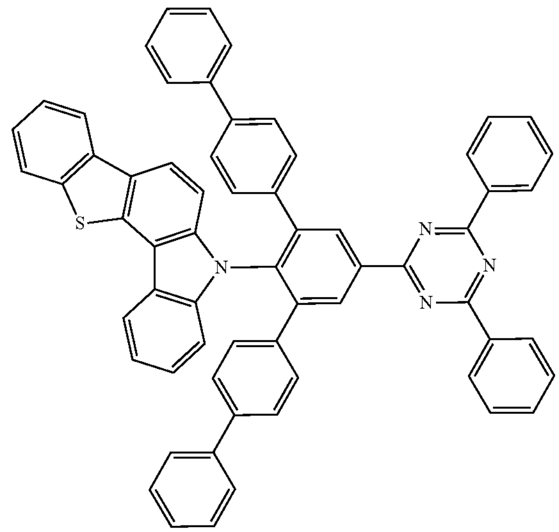
828
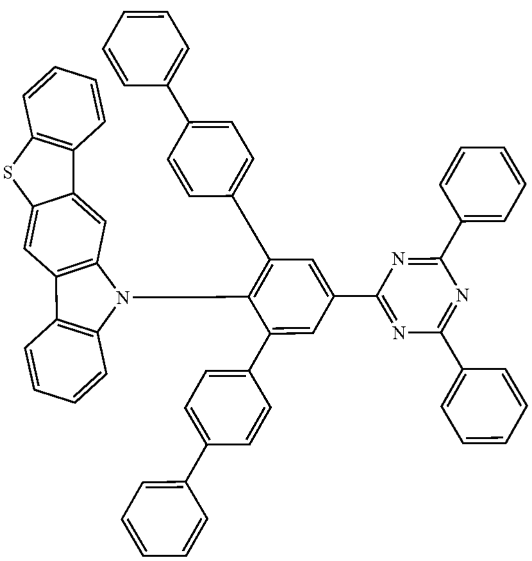
829
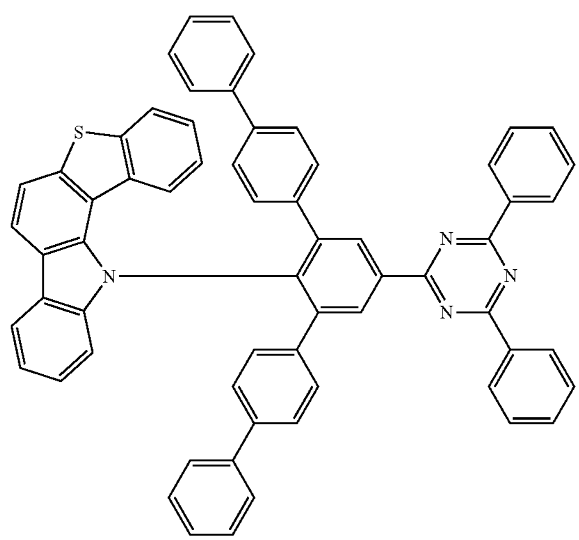

-continued
830
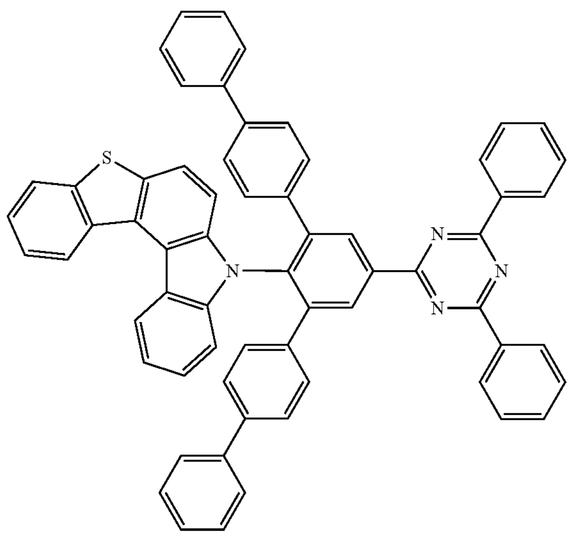
831
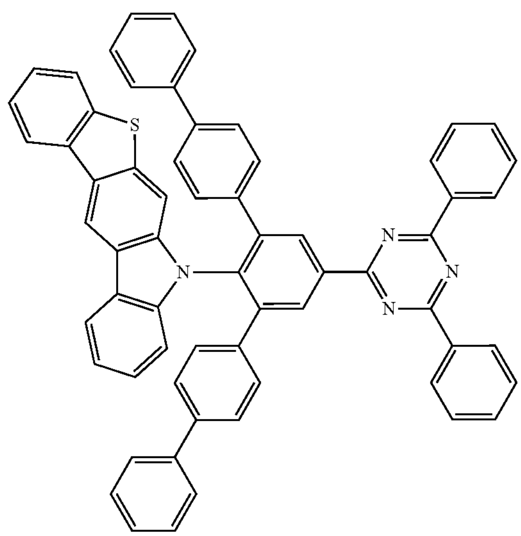
832
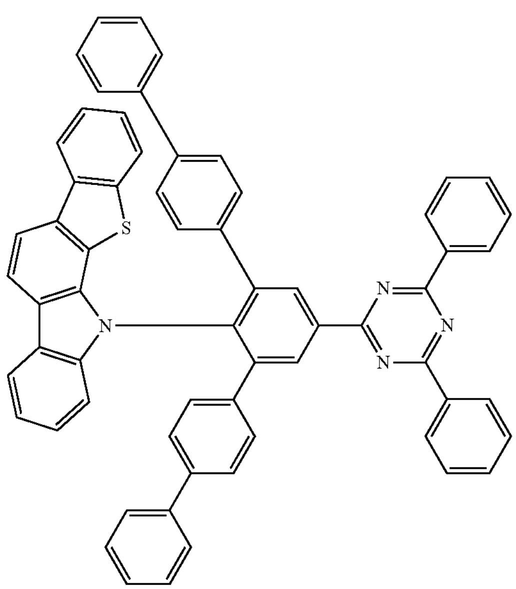
-continued
833
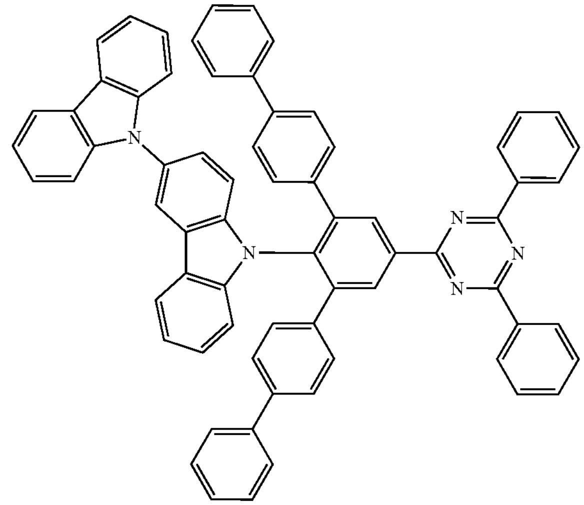
834
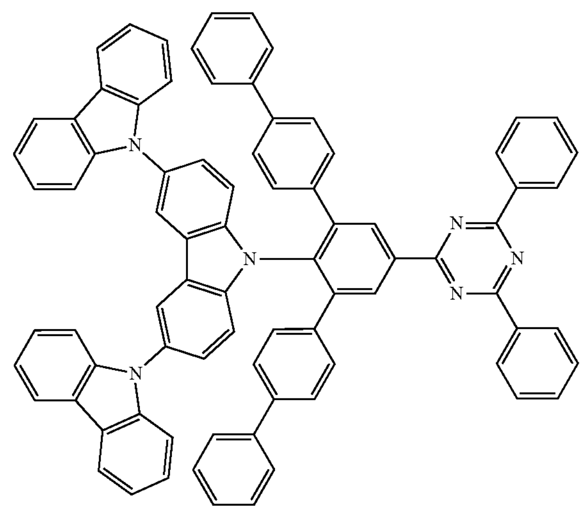
835
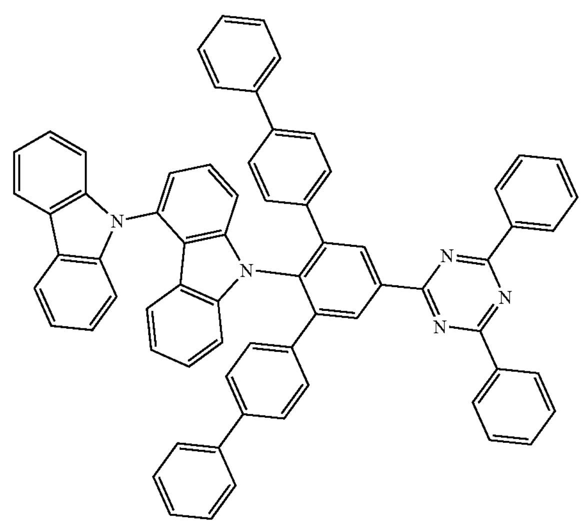

-continued
836
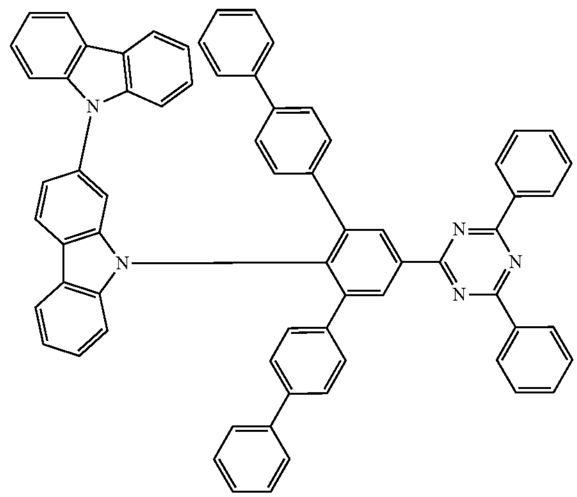
837
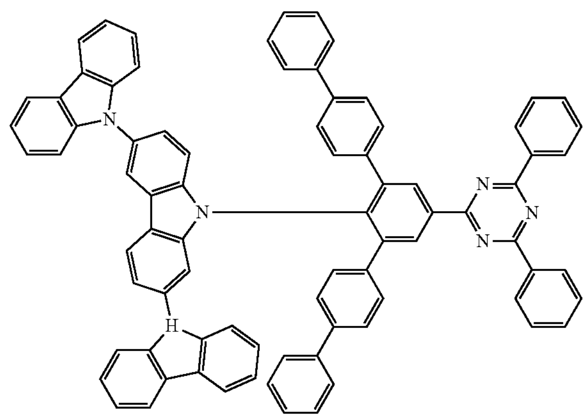
838
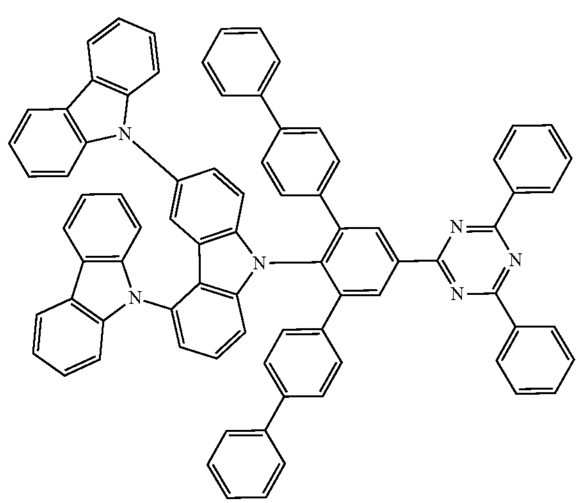
-continued
839
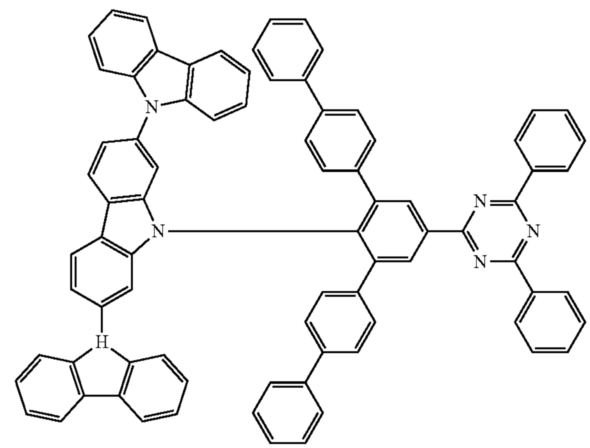
840
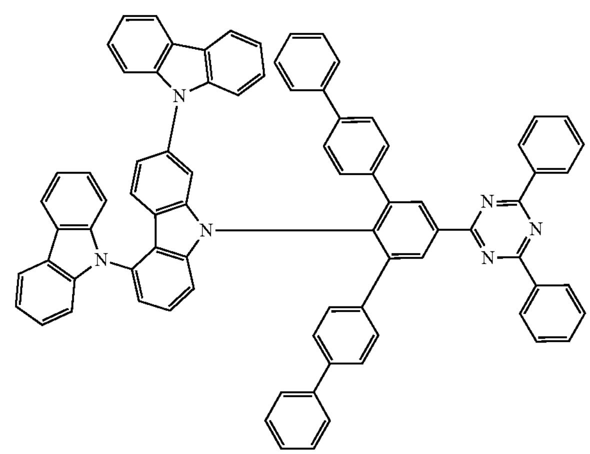
841
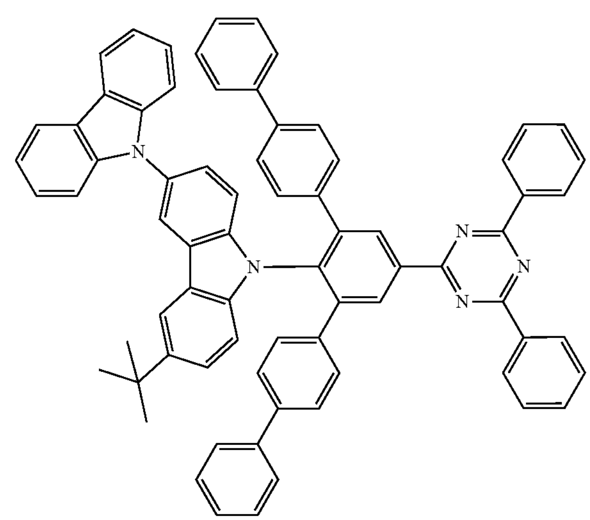

-continued
842
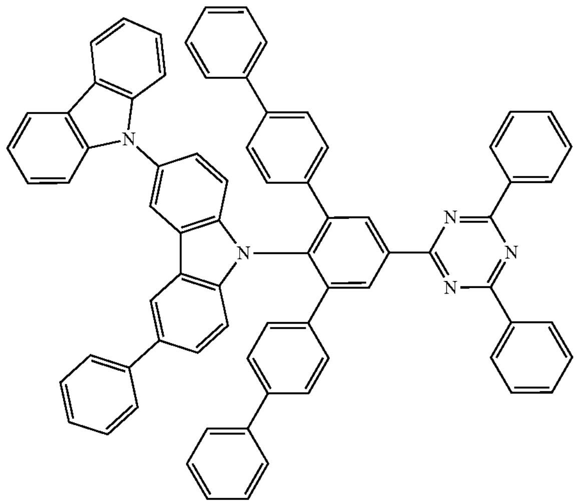
843
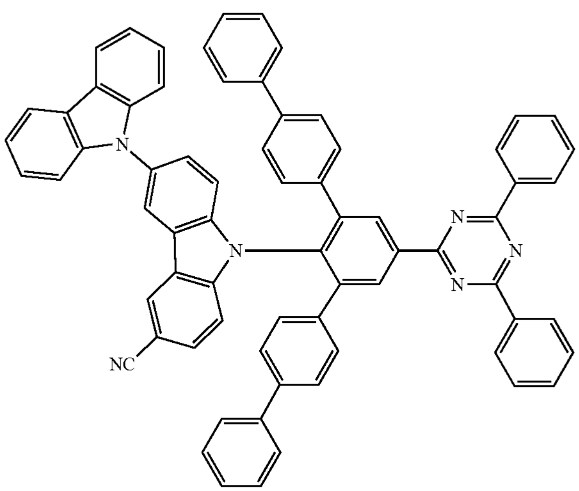
844
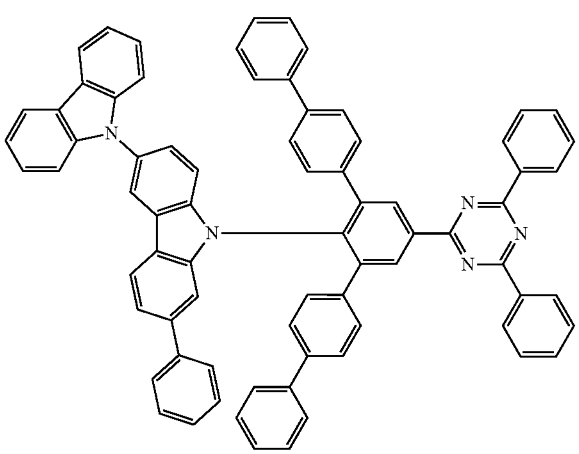
-continued
845
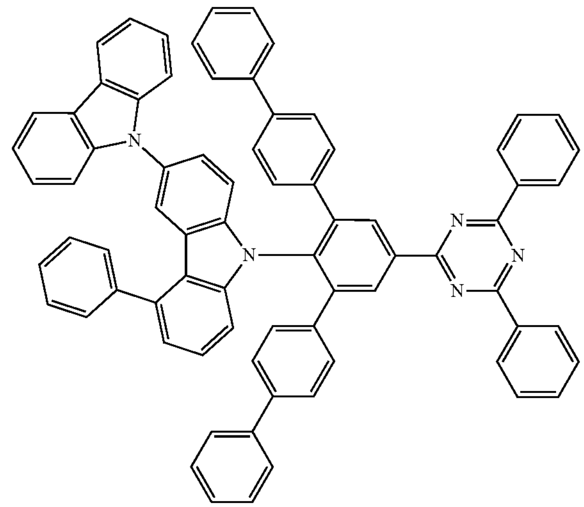
846
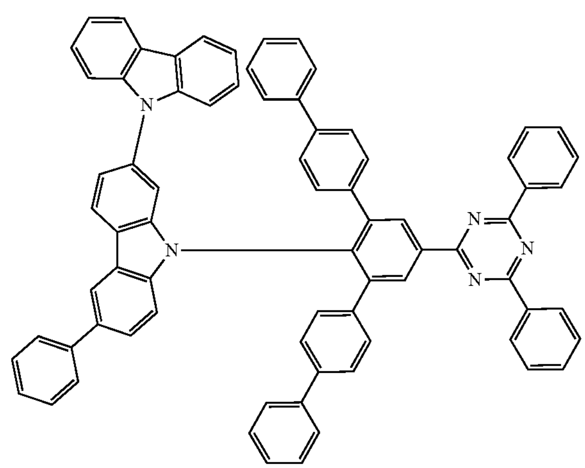
847
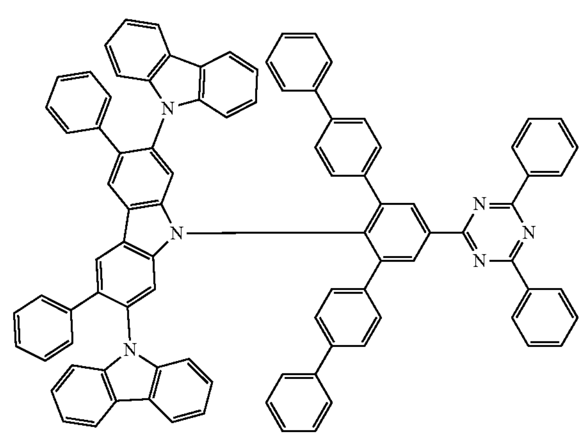

-continued
848
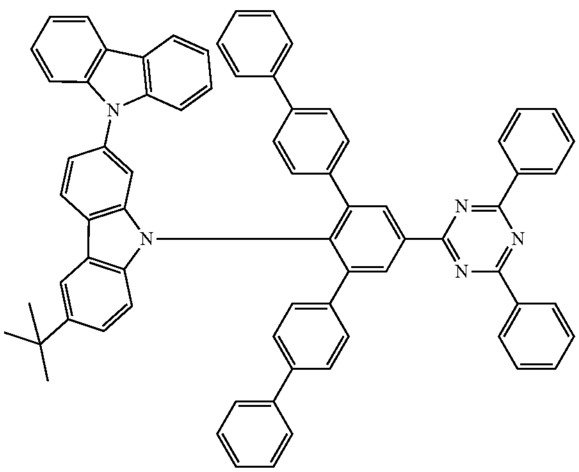
849
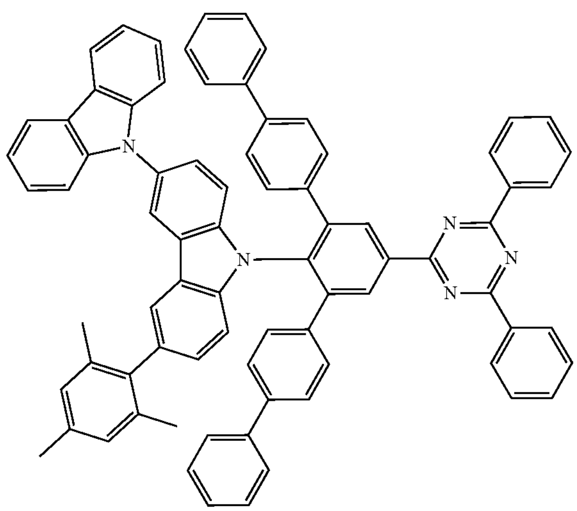
850
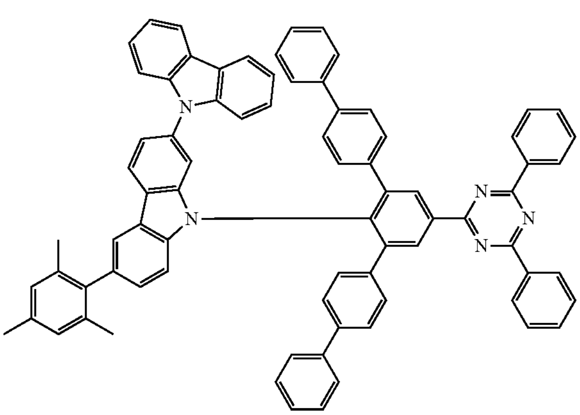
-continued
851
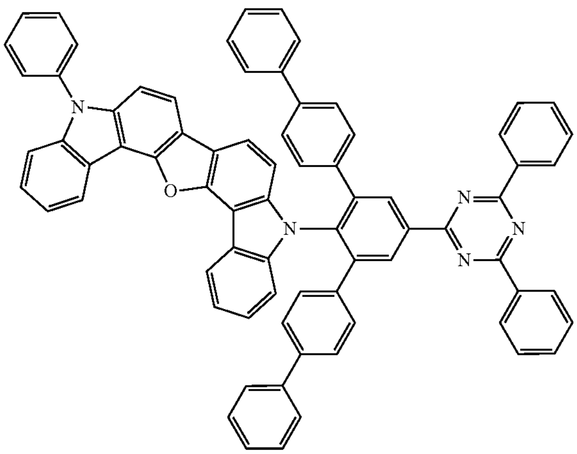
852
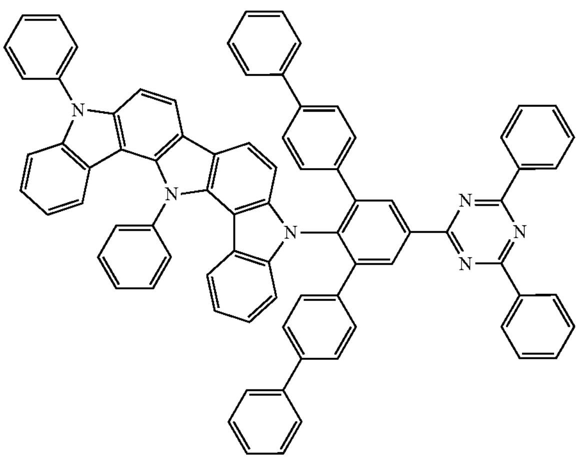
853
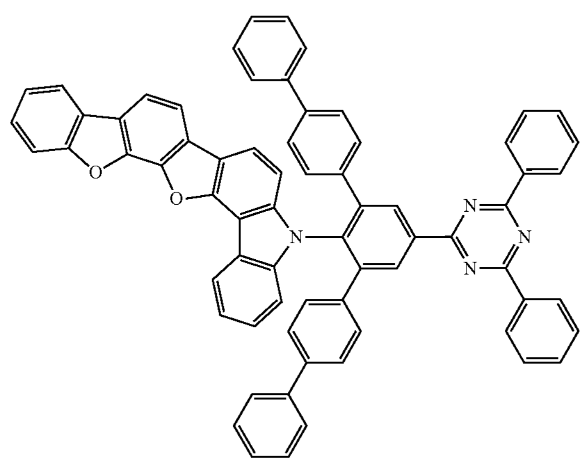

854
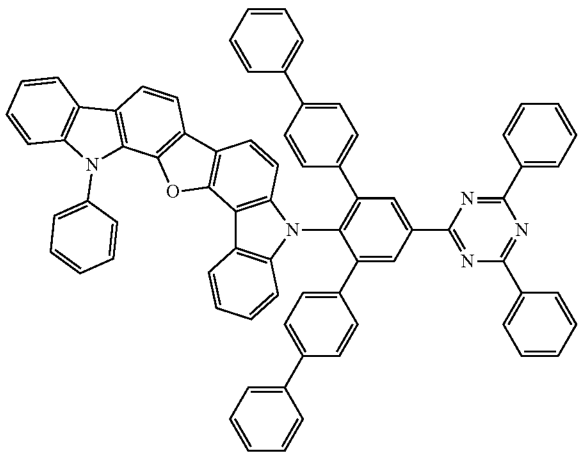
855
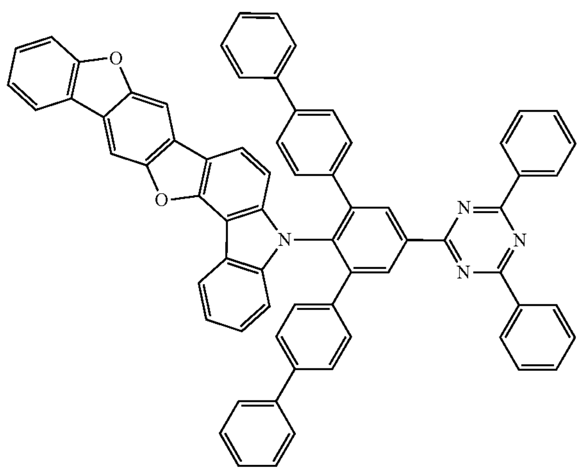
856
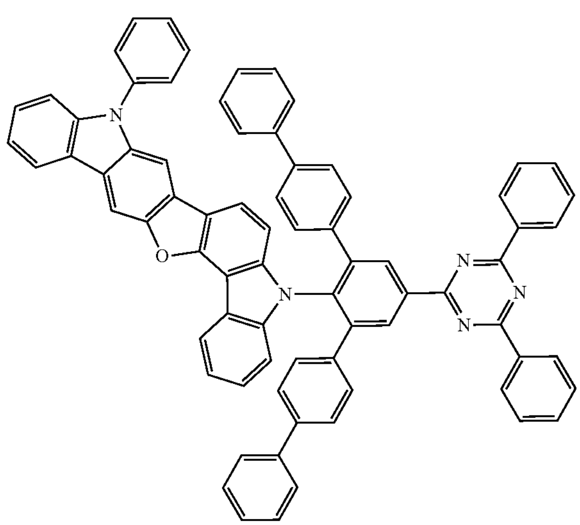
857
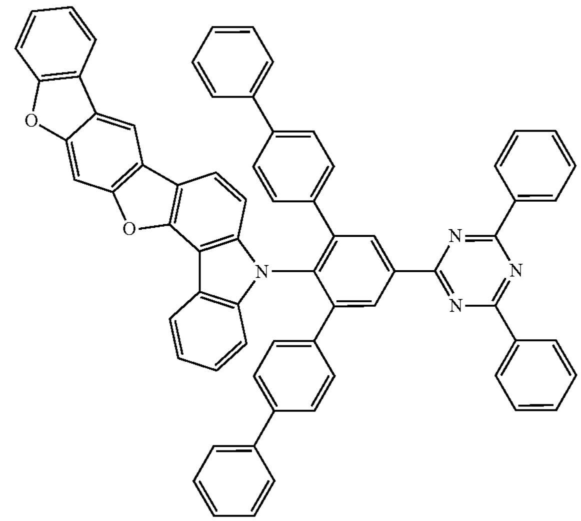
858
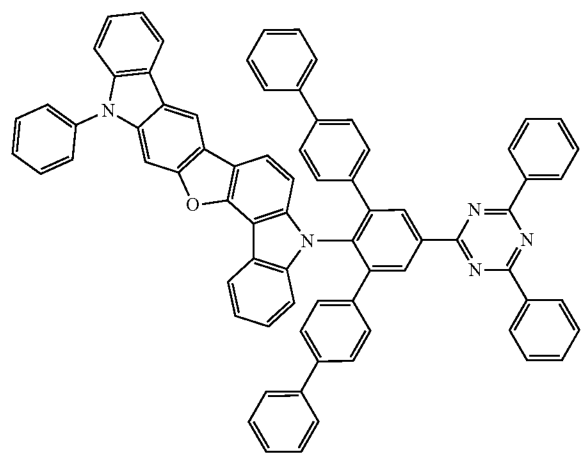
859
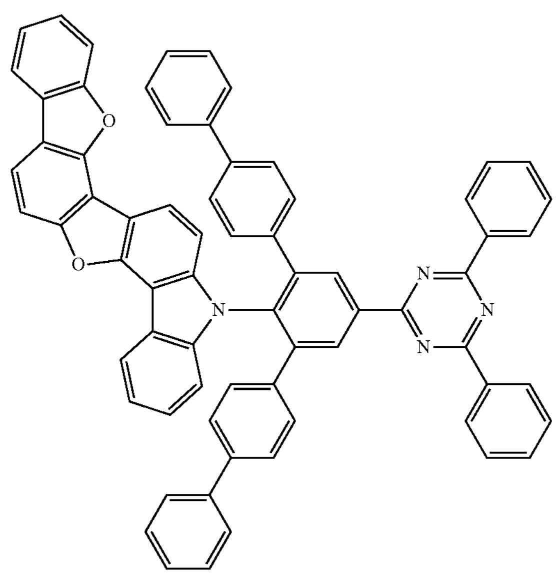

860
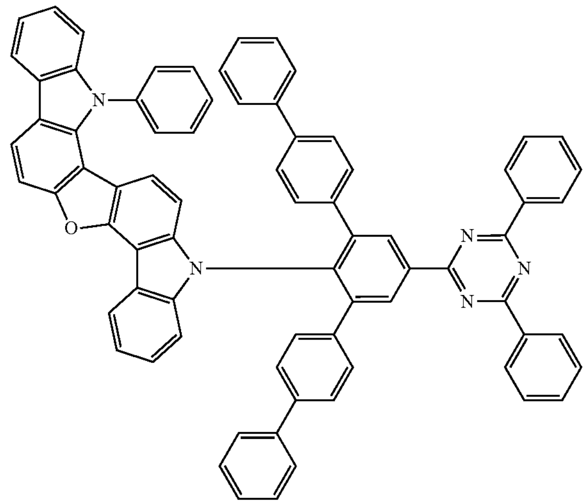
861
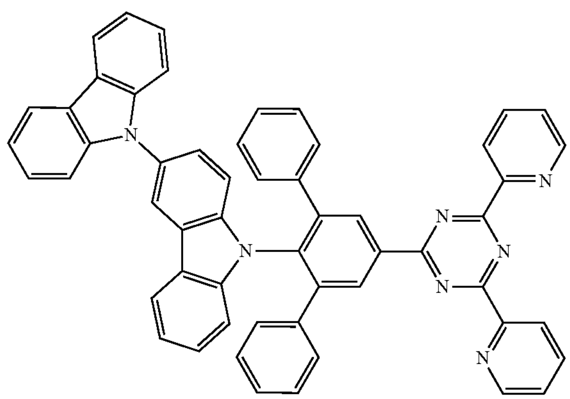
862
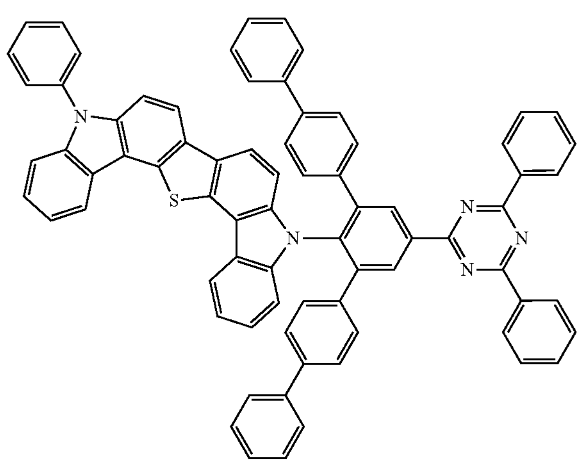
863
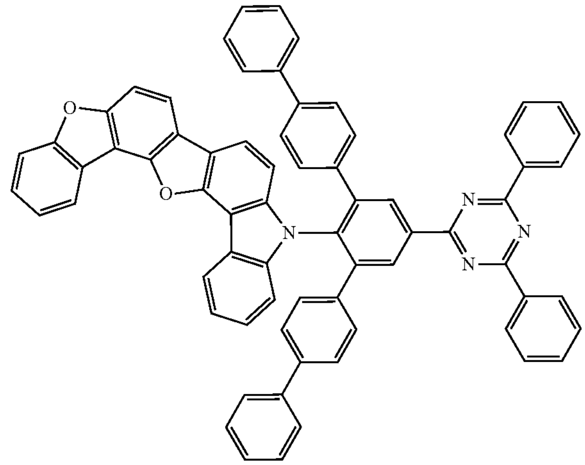
864
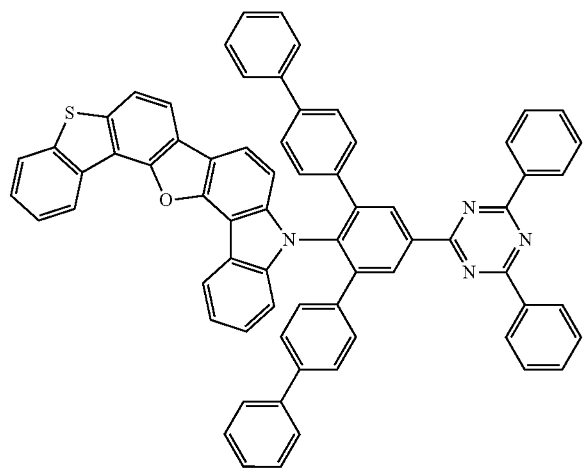
865
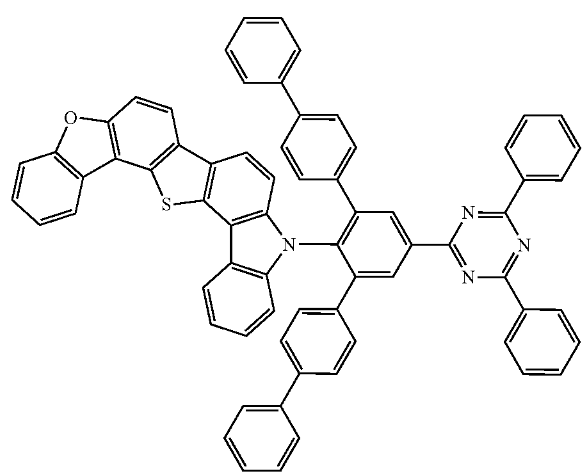

-continued
866
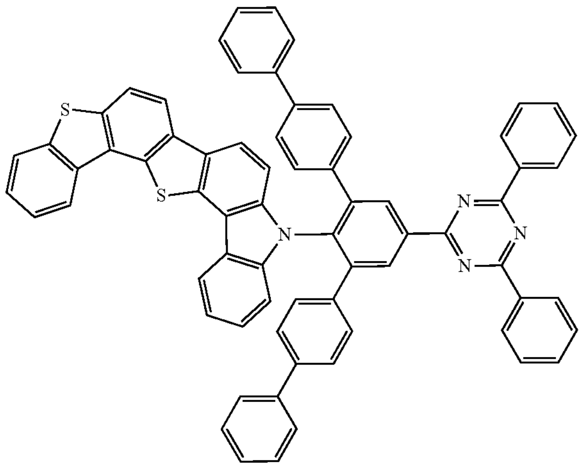
867
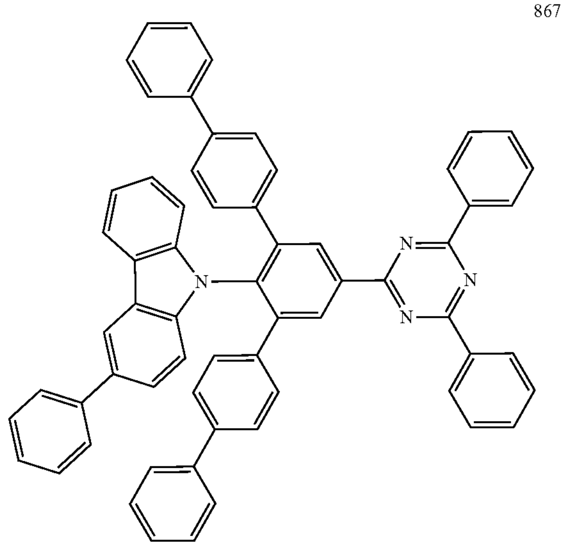
868
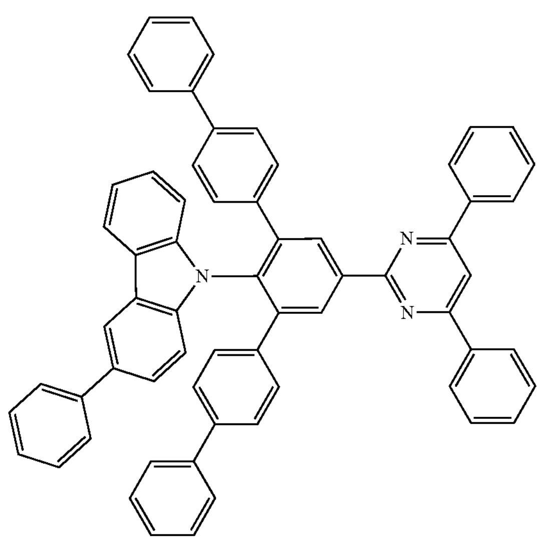
-continued
869
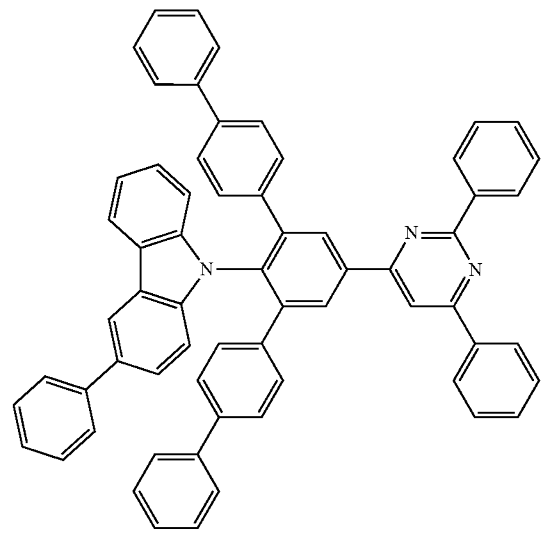
870
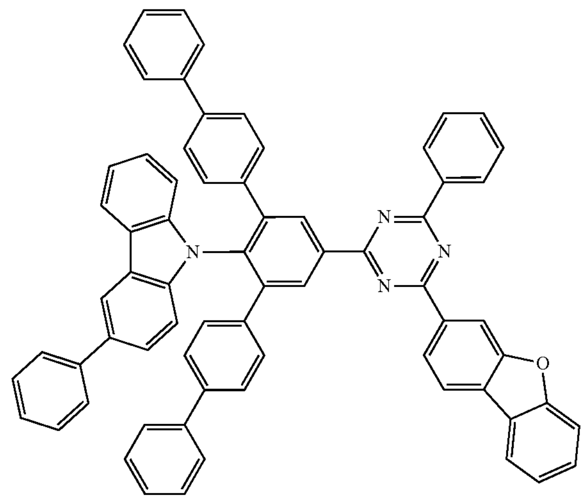
871
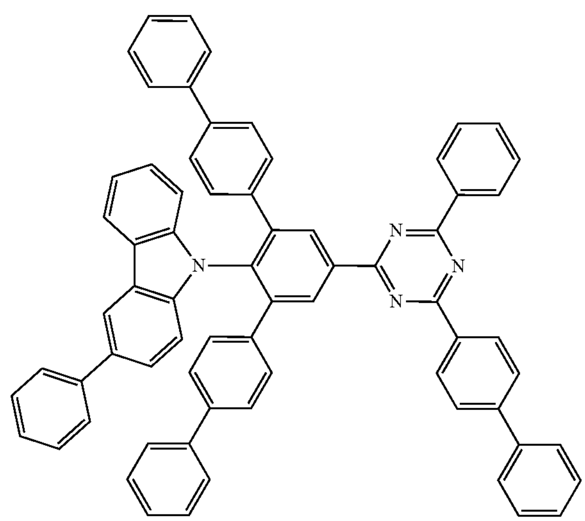

872
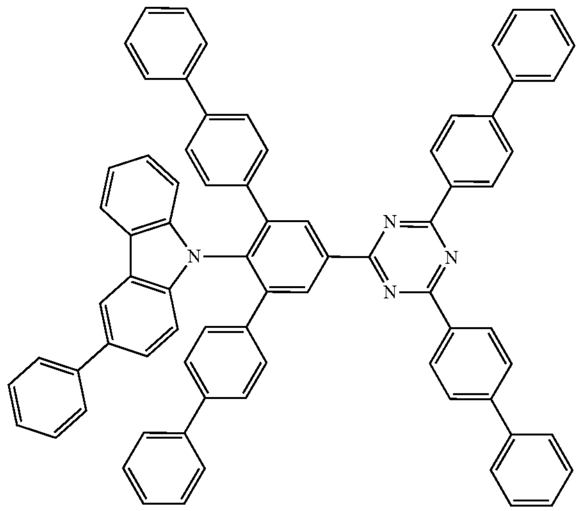
873
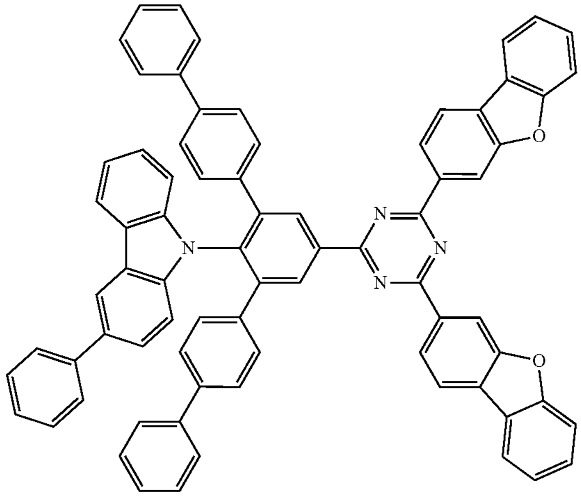
874
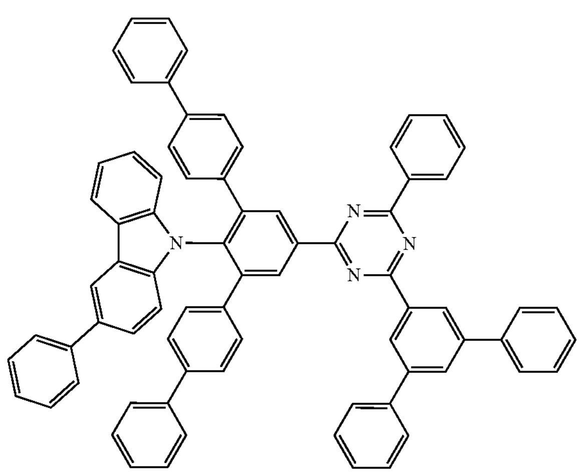
875
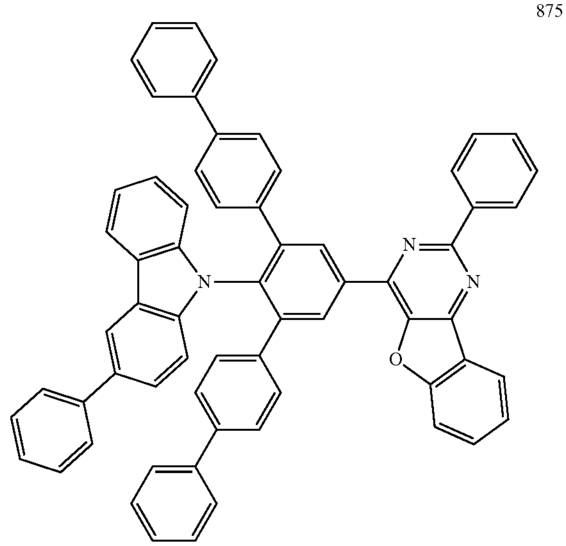
876
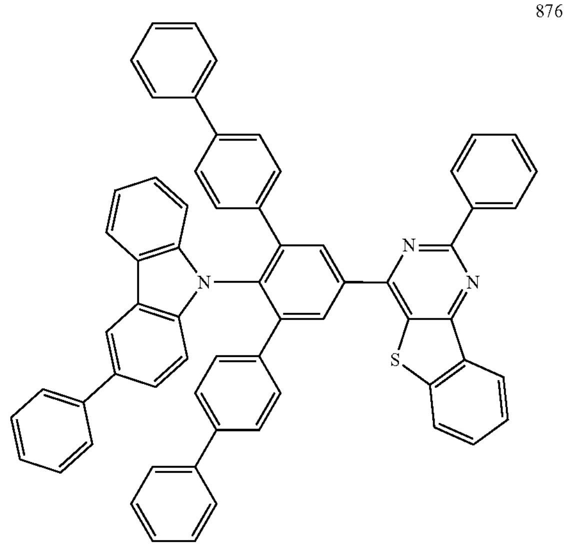
877
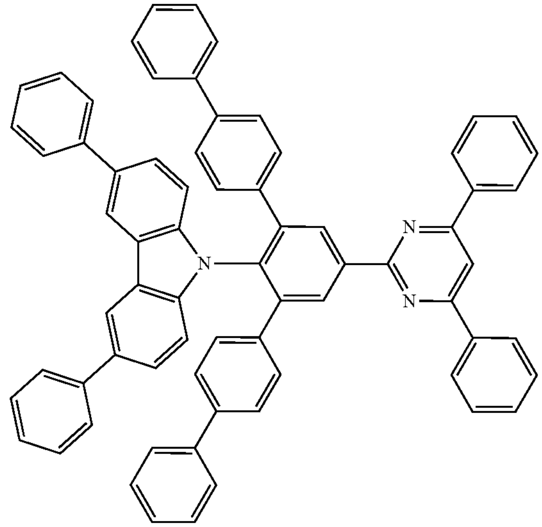

-continued
878
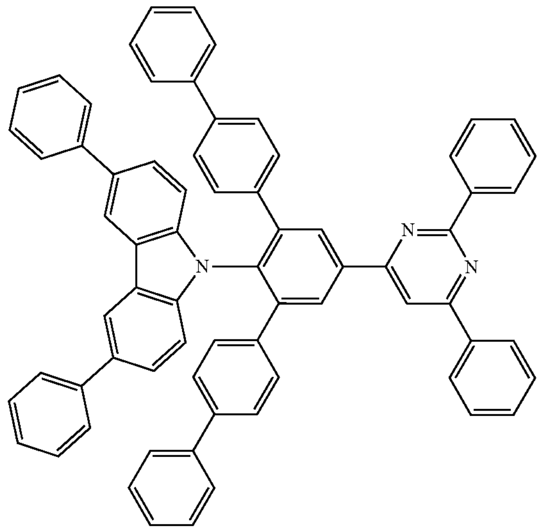
879
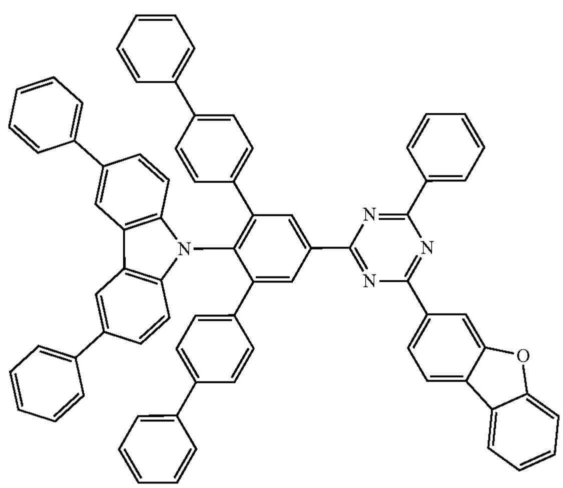
880
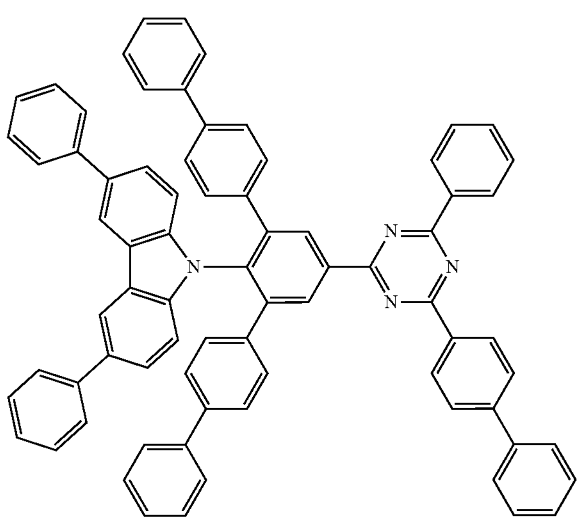
-continued
881
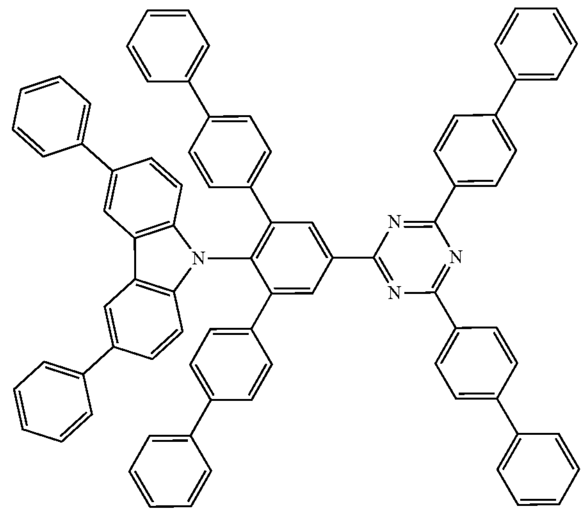
882
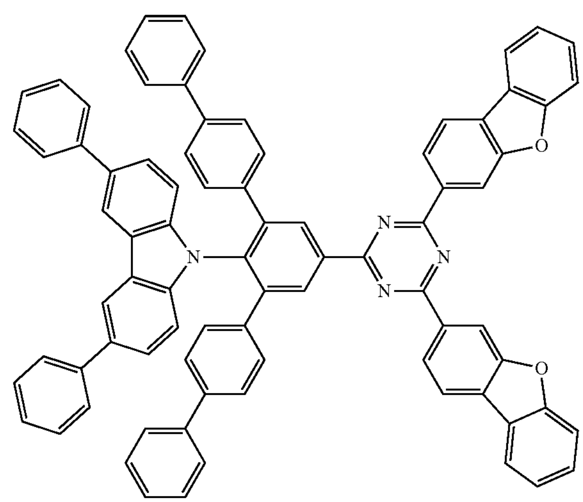
883
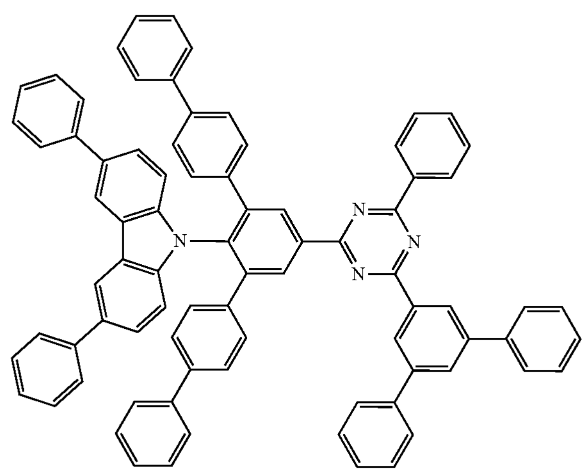

884
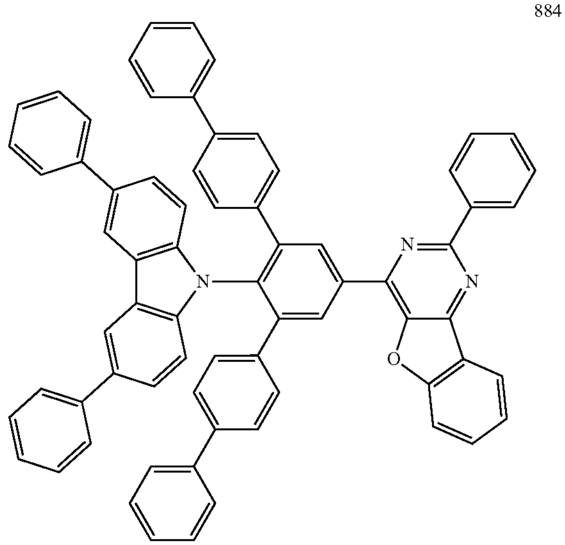
885
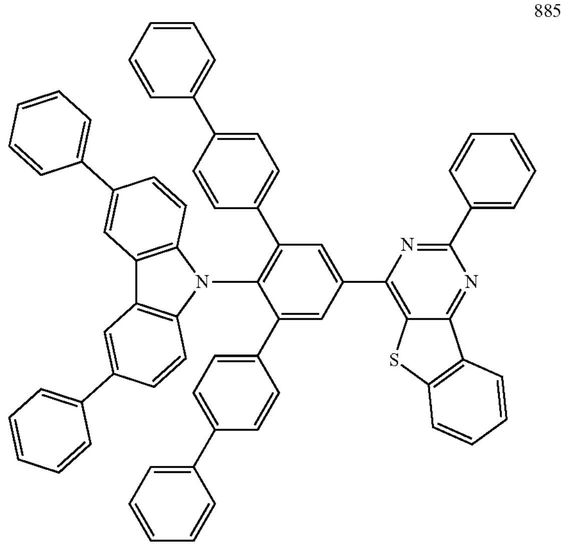
886
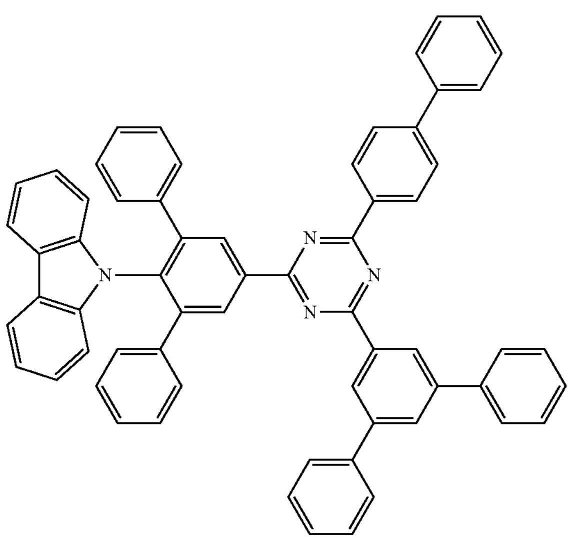
887
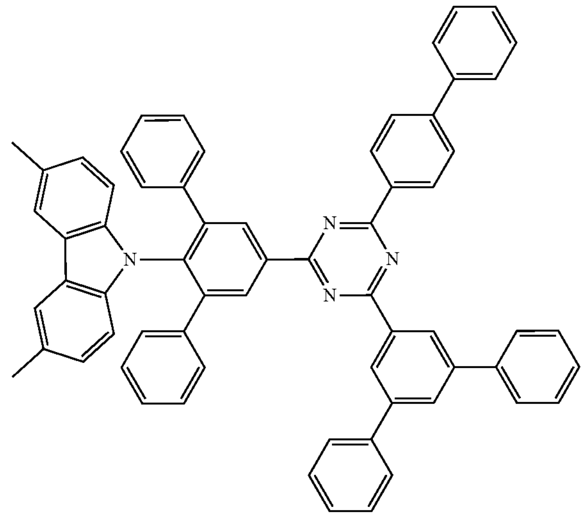
888
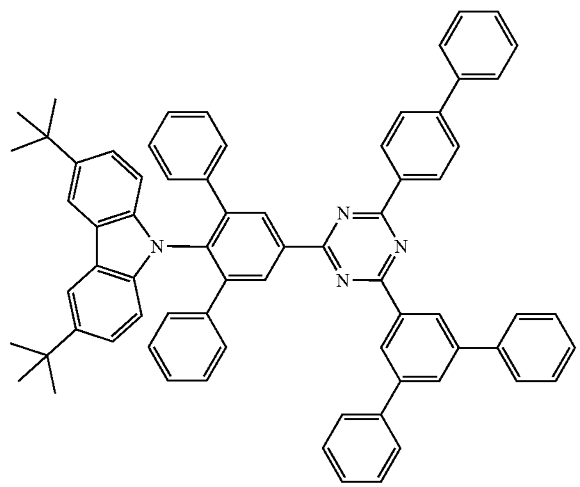
889
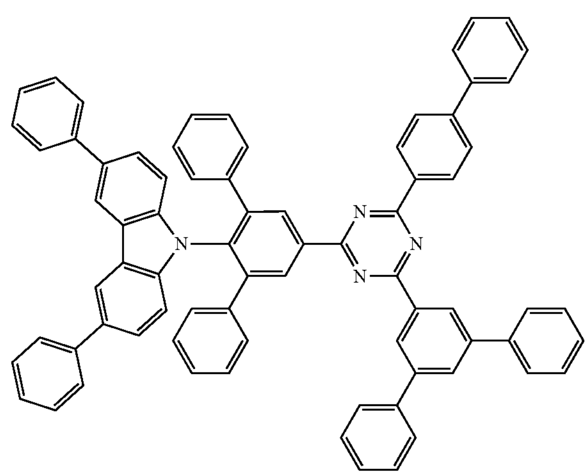

-continued
890
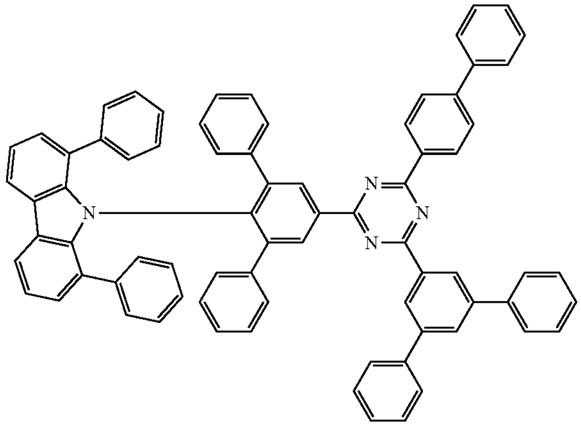
891
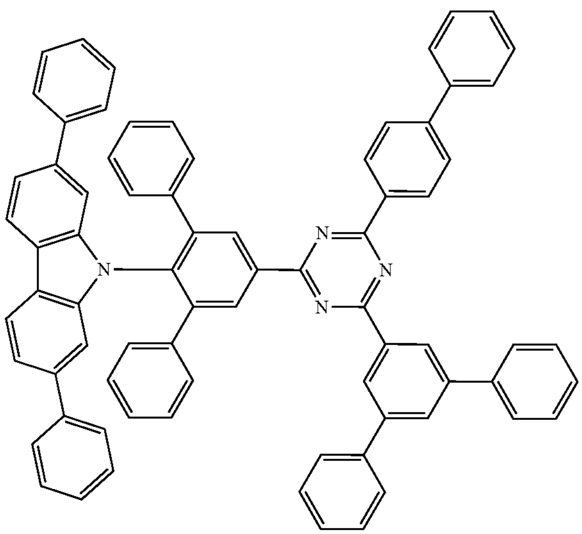
892
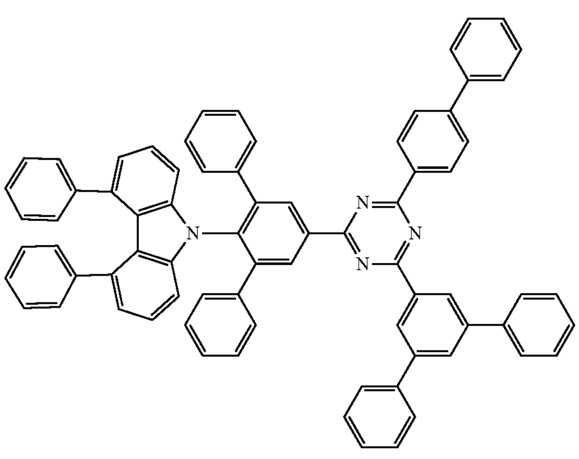
-continued
893
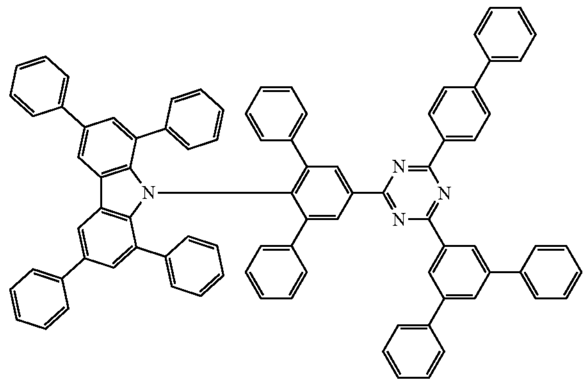
894
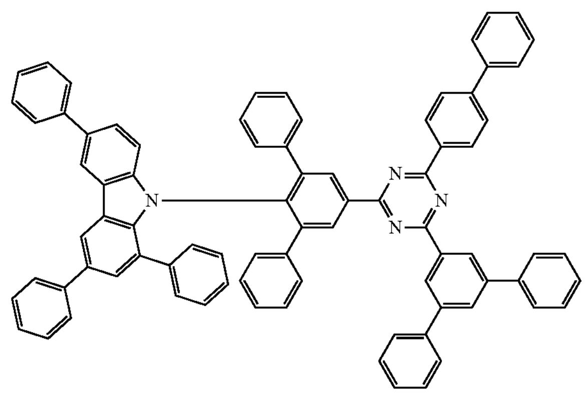
895
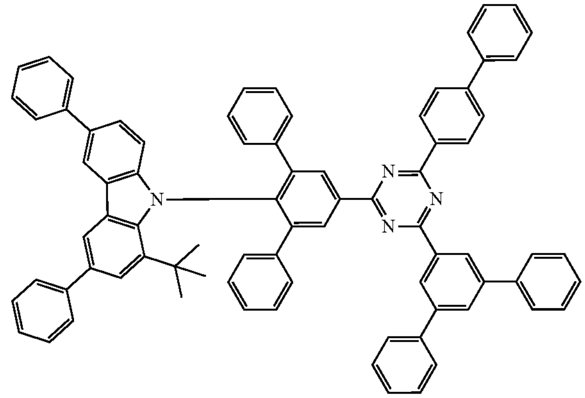

896
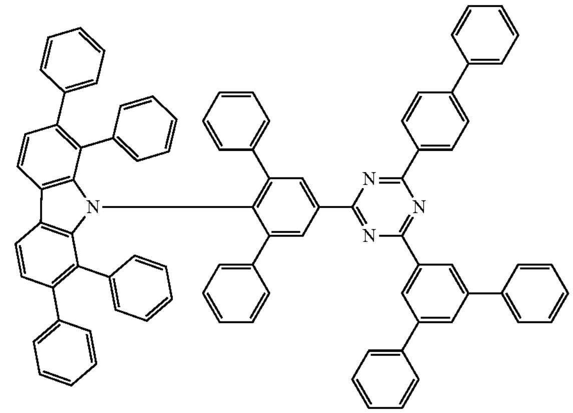
897
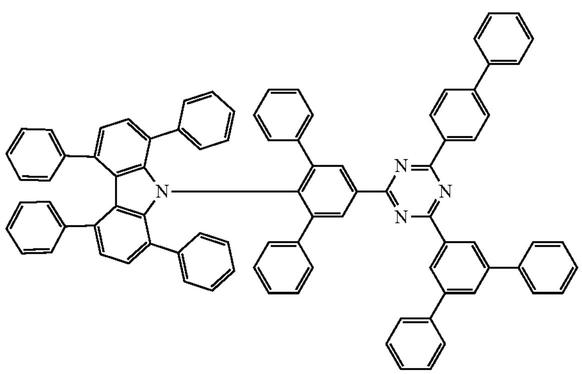
898
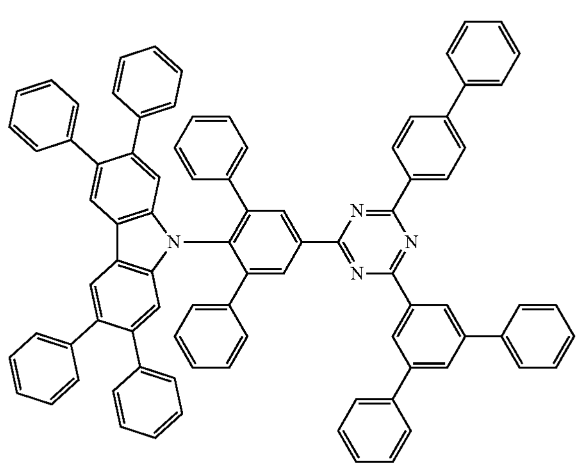
899
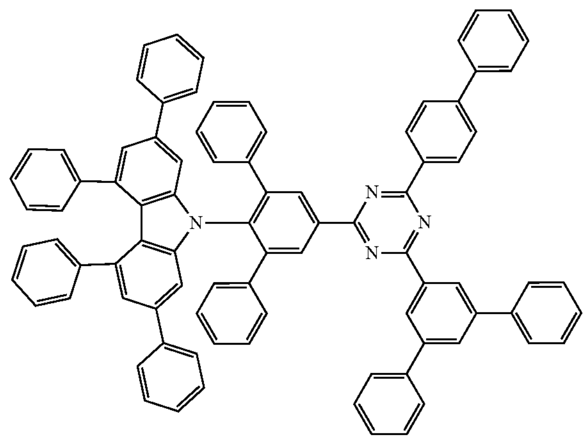
900
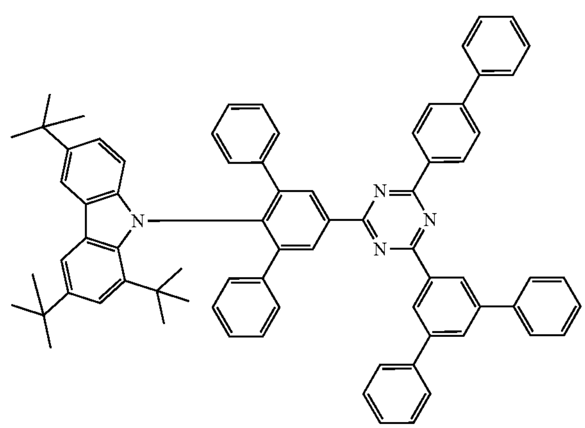
901
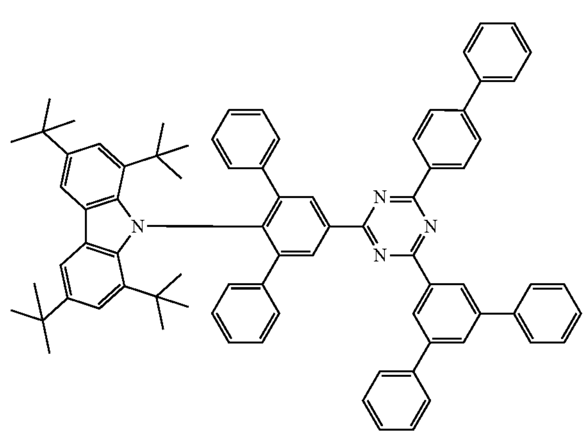

-continued
902
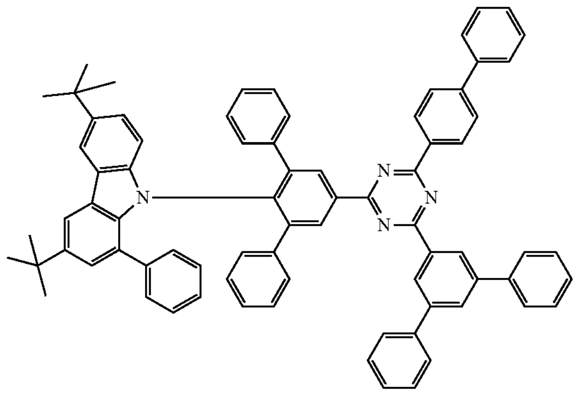
903
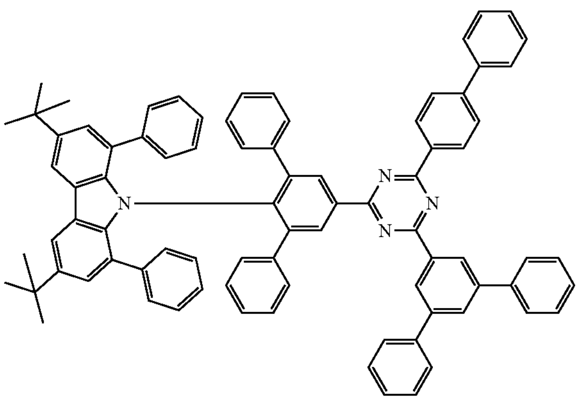
904
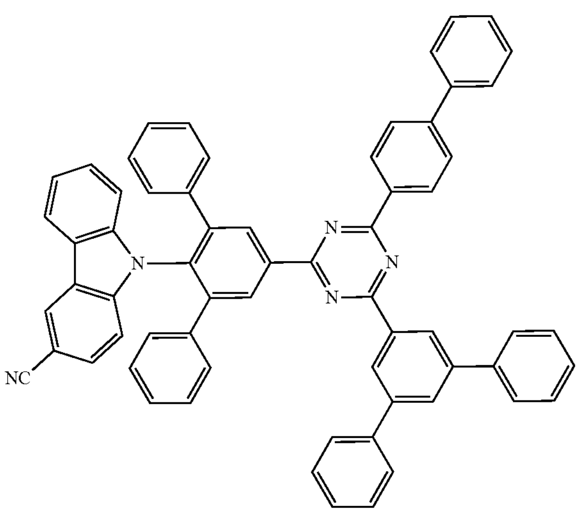
-continued
905
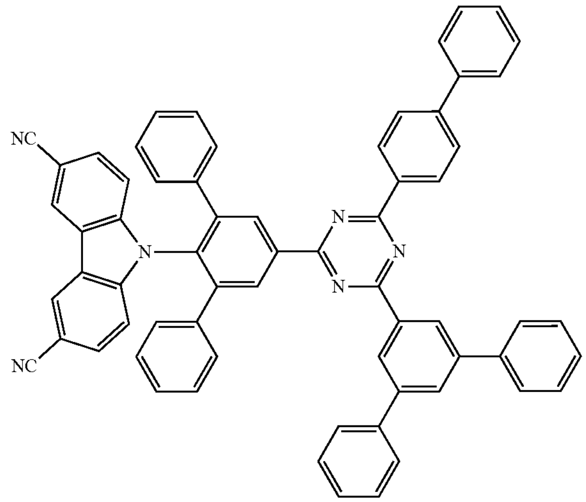
906
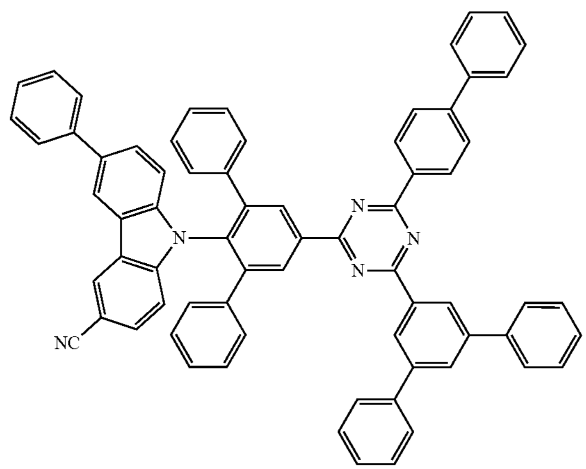
907
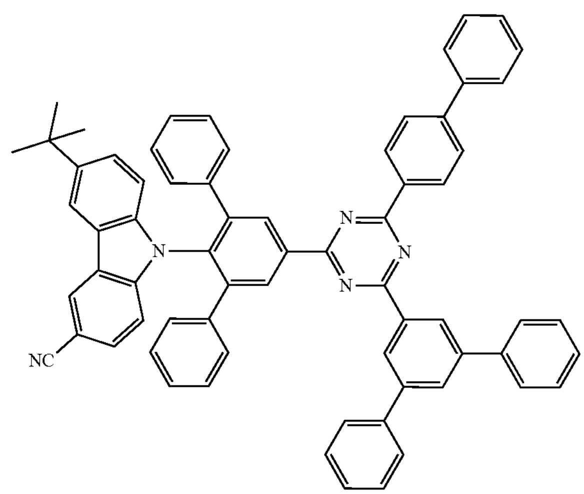

-continued
908
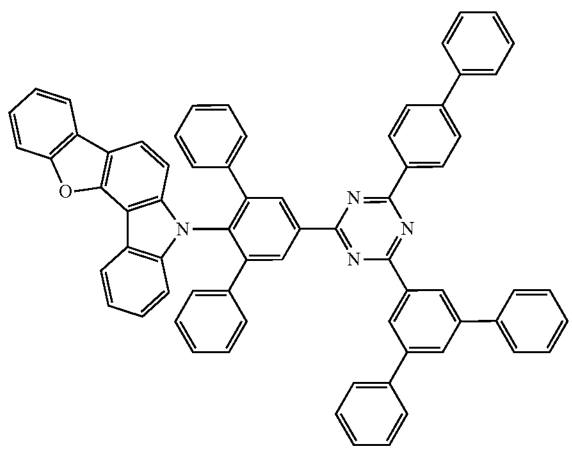
909
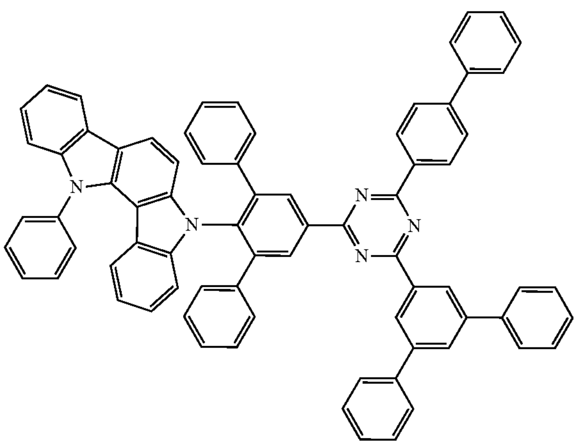
910
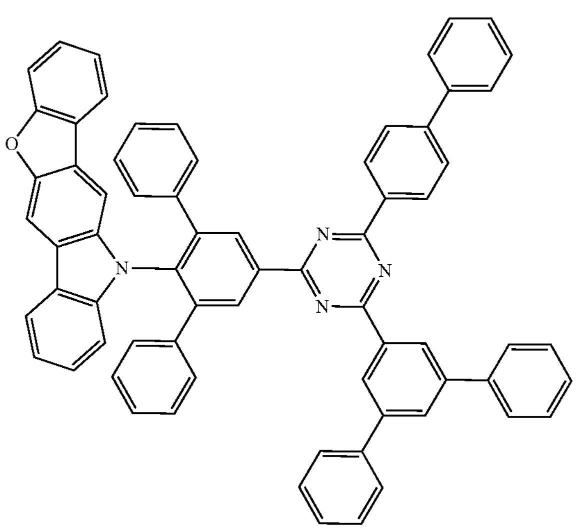
-continued
911
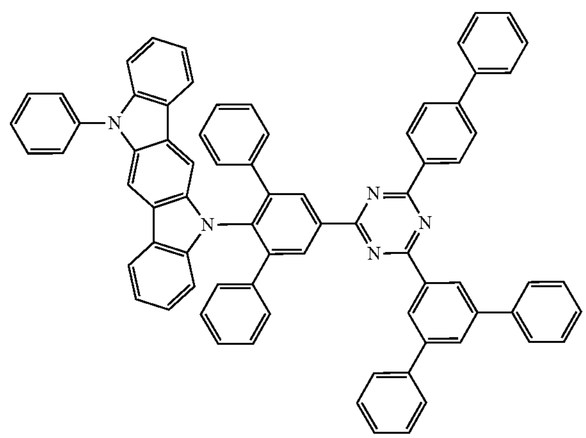
912
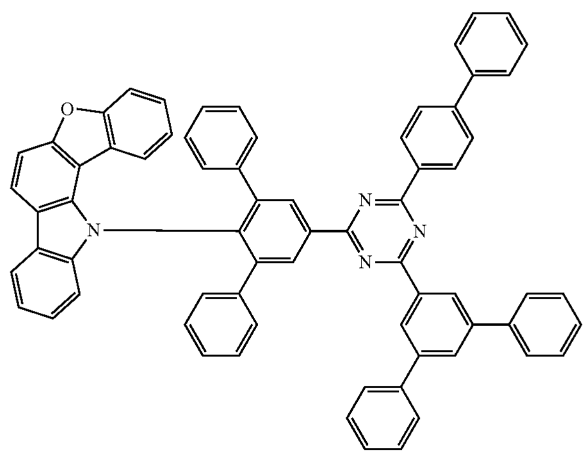
913
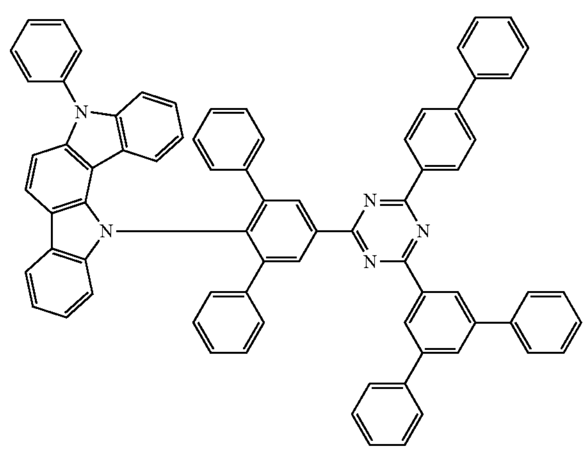

914
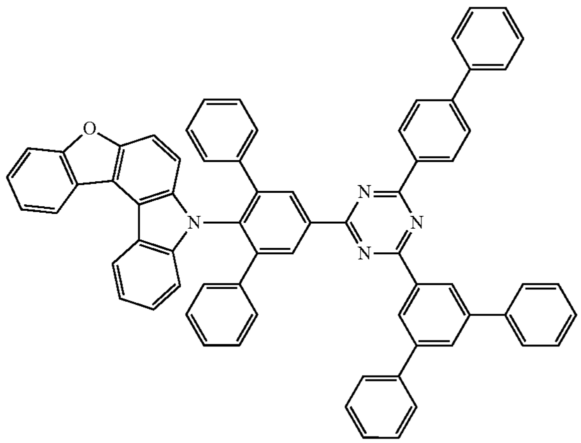
915
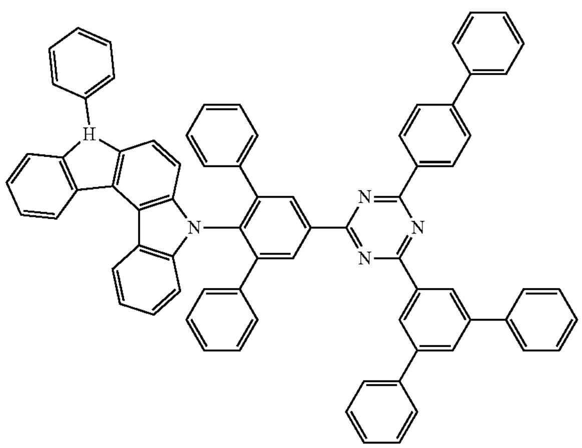
916
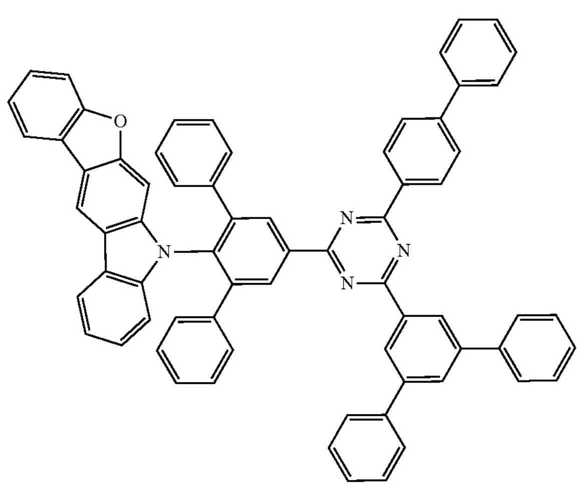
917
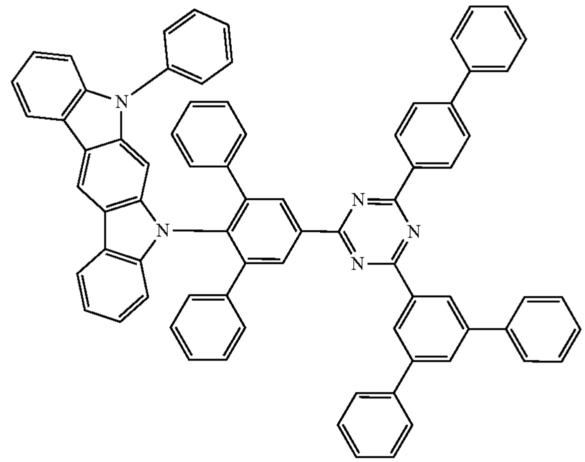
918
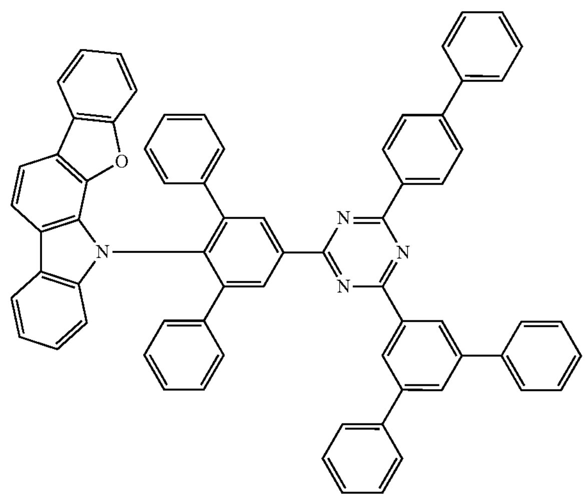
919
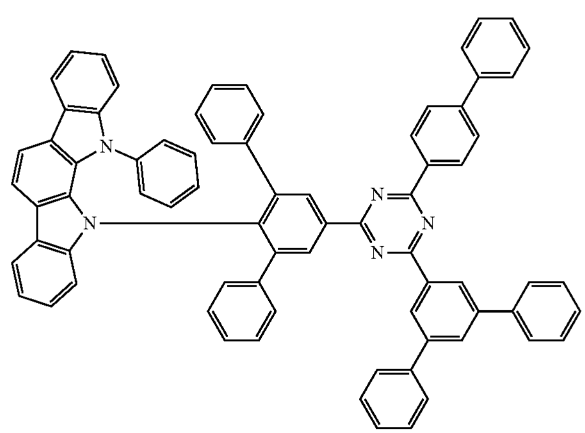

920
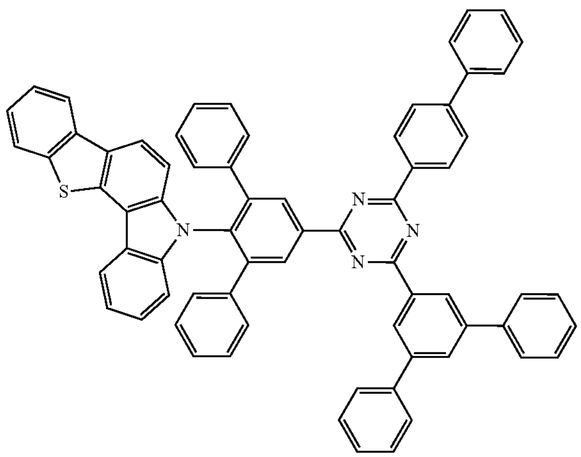
921
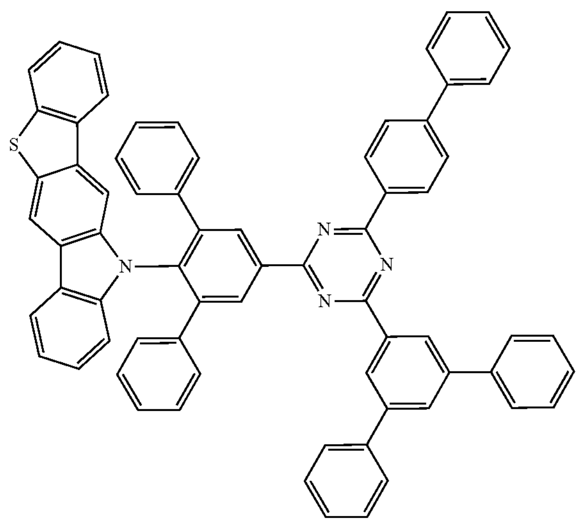
922
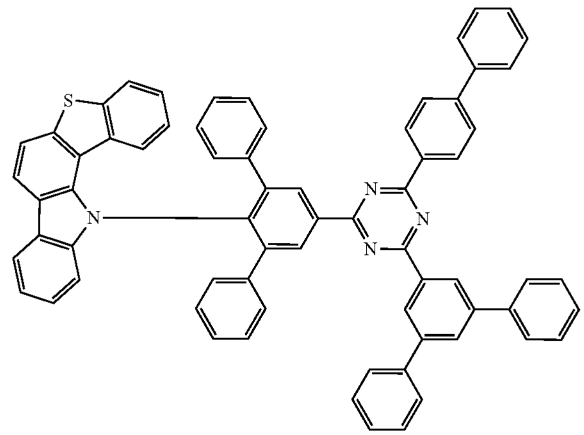
923
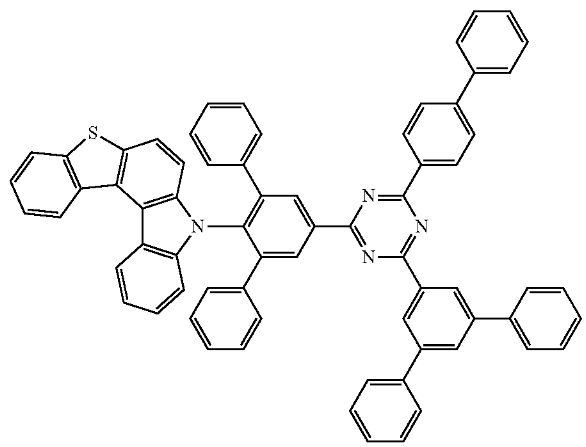
924
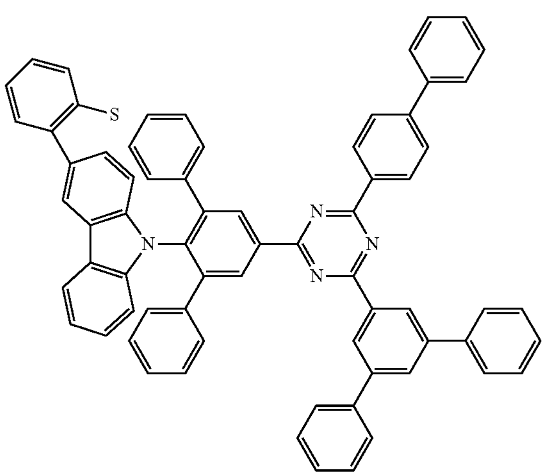
925
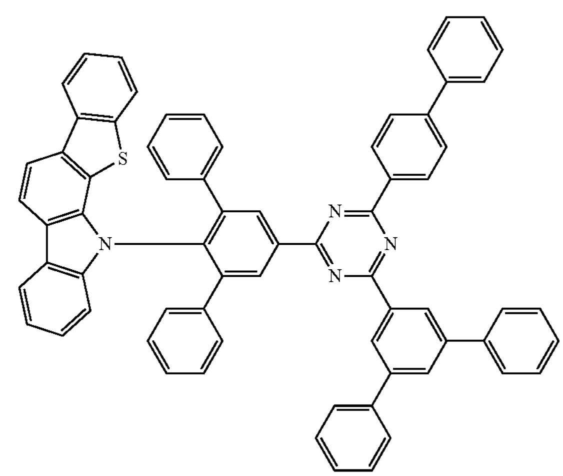

-continued
926
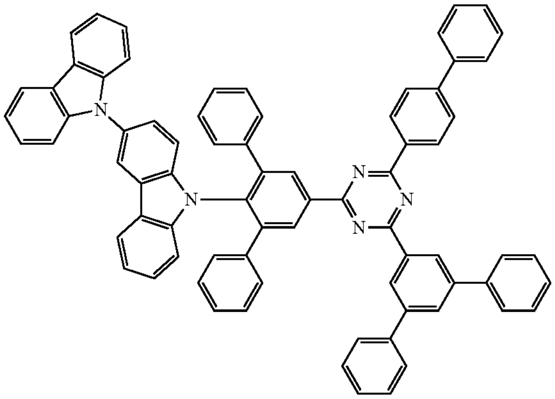
927
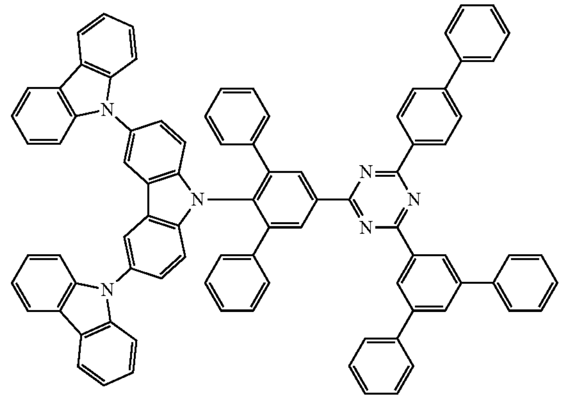
928
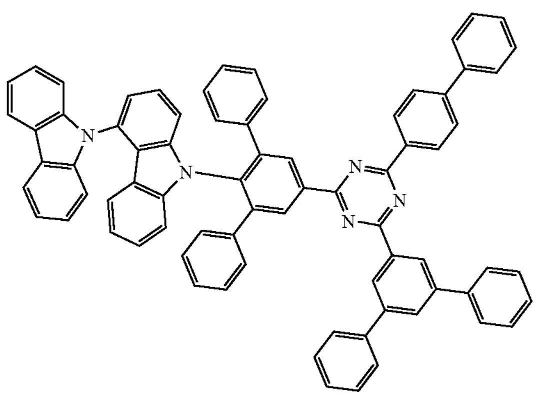
929
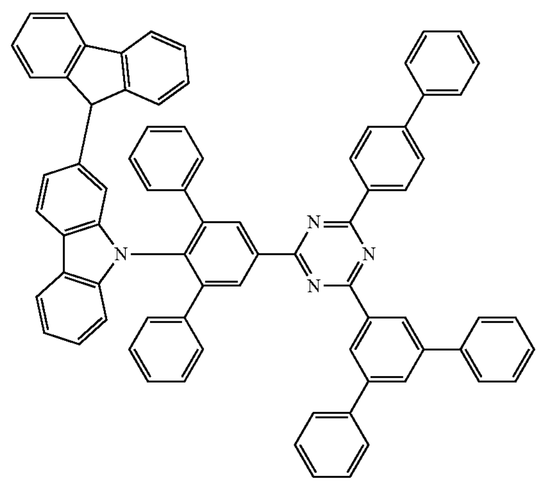
930
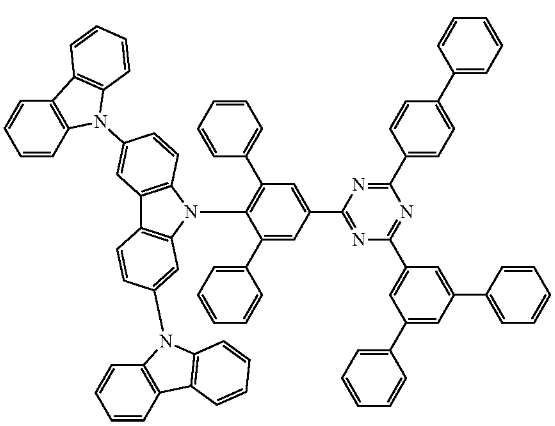
931
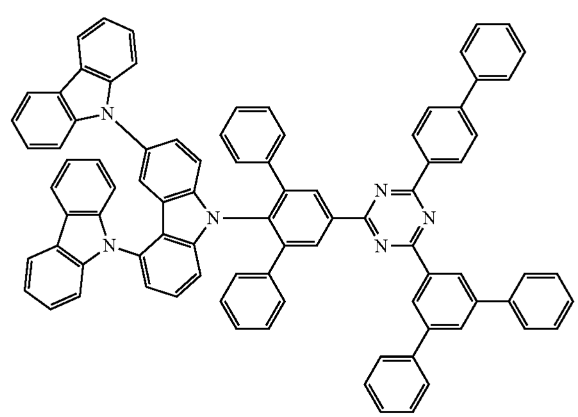

-continued
932
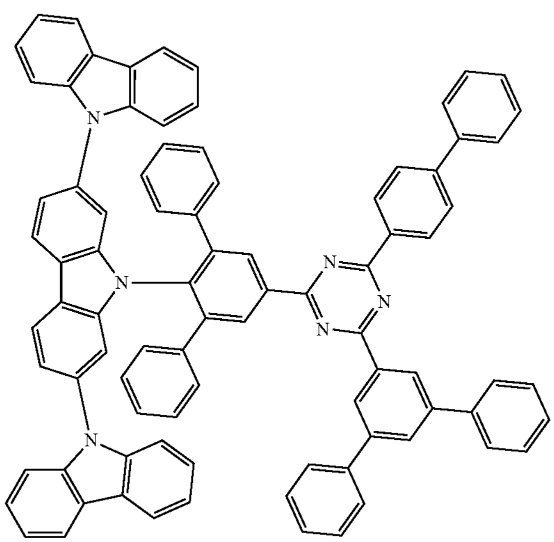
933
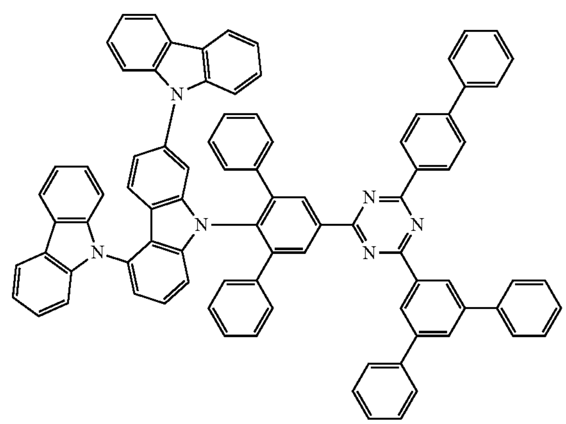
934
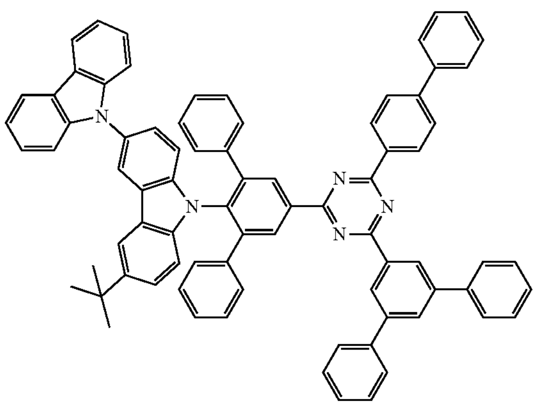
935
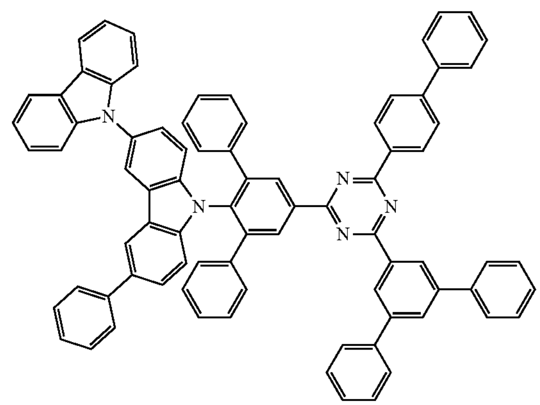
936
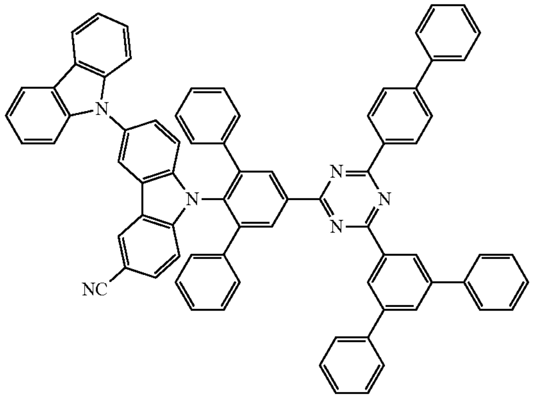
937
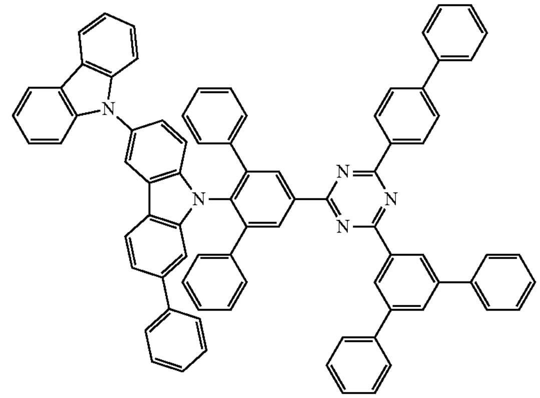

-continued
938
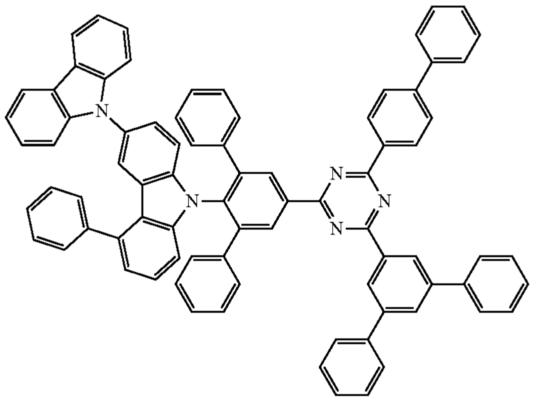
939
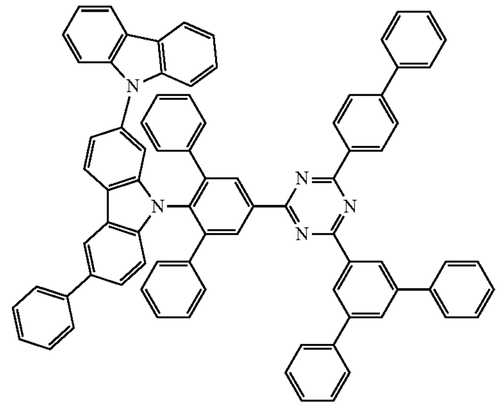
940
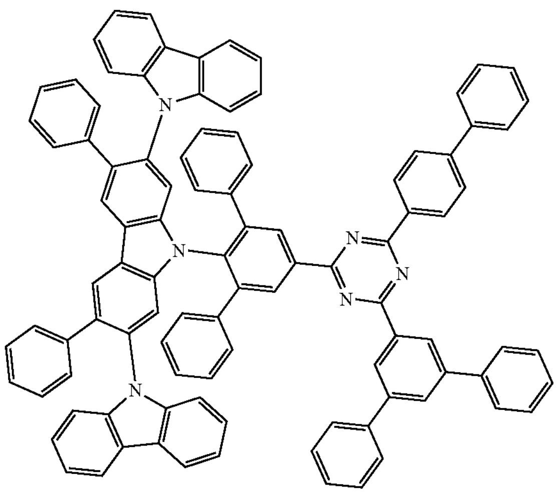
941
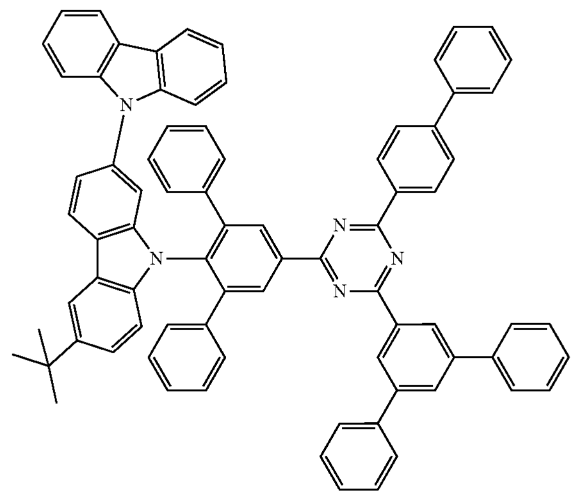
942
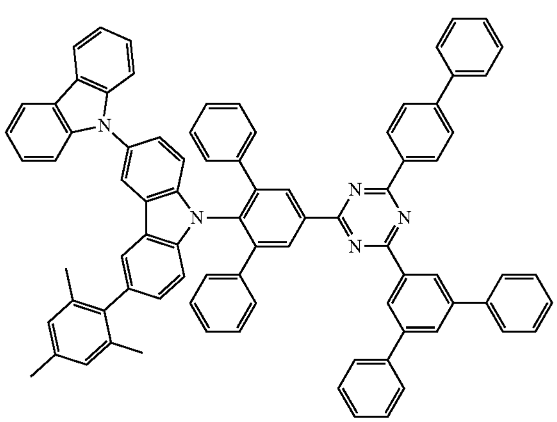
943
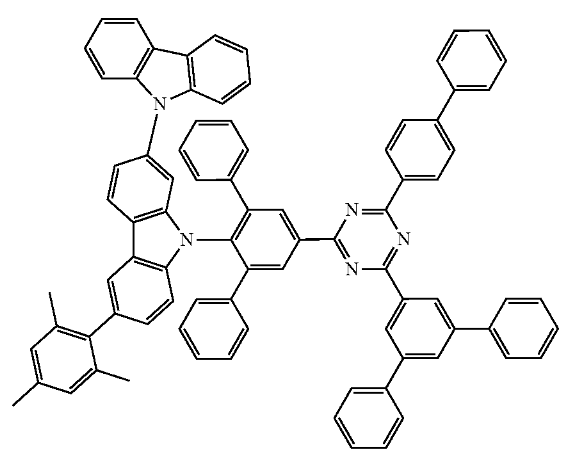

-continued
944
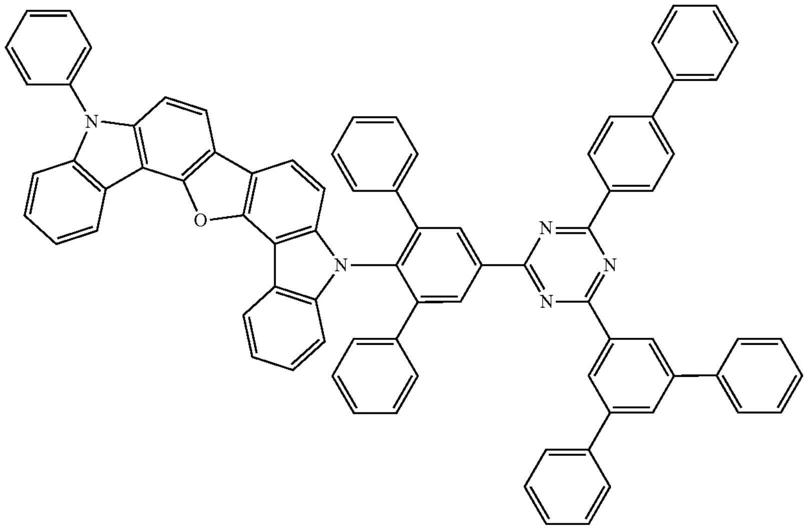
945
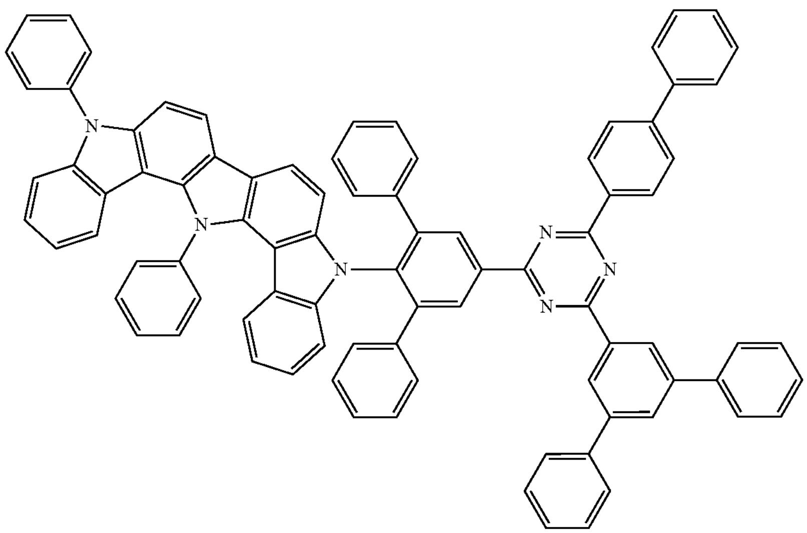
946
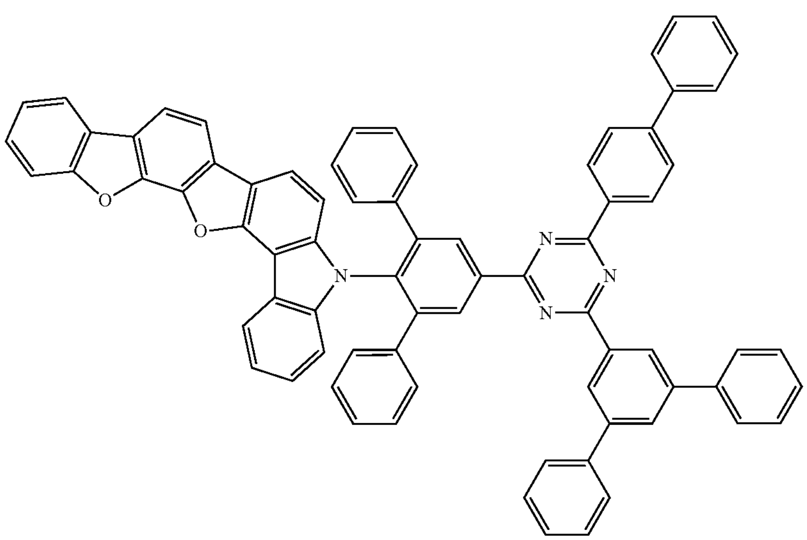

-continued
947
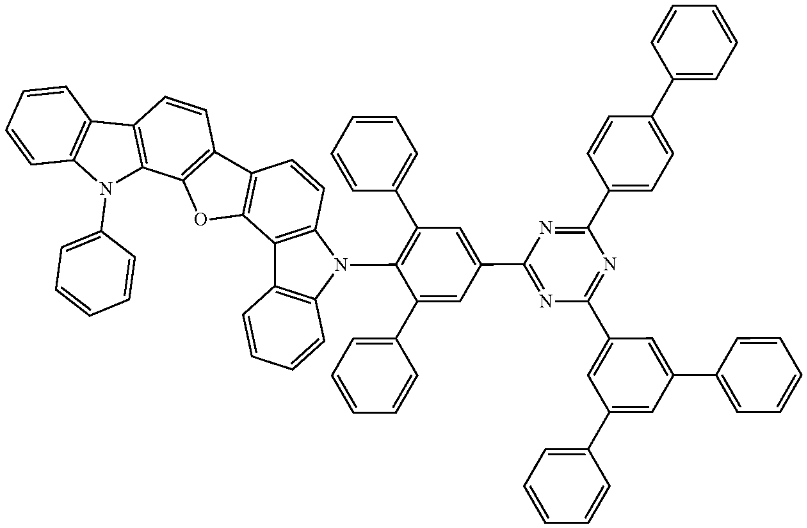
948
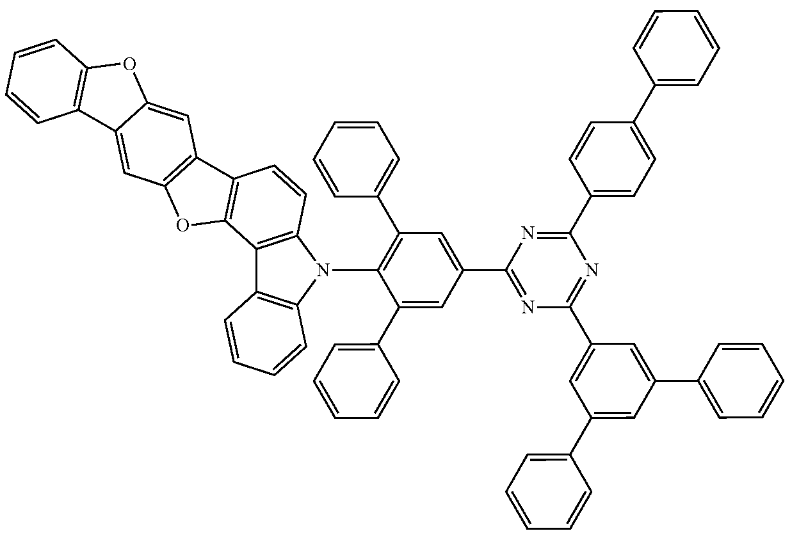
949
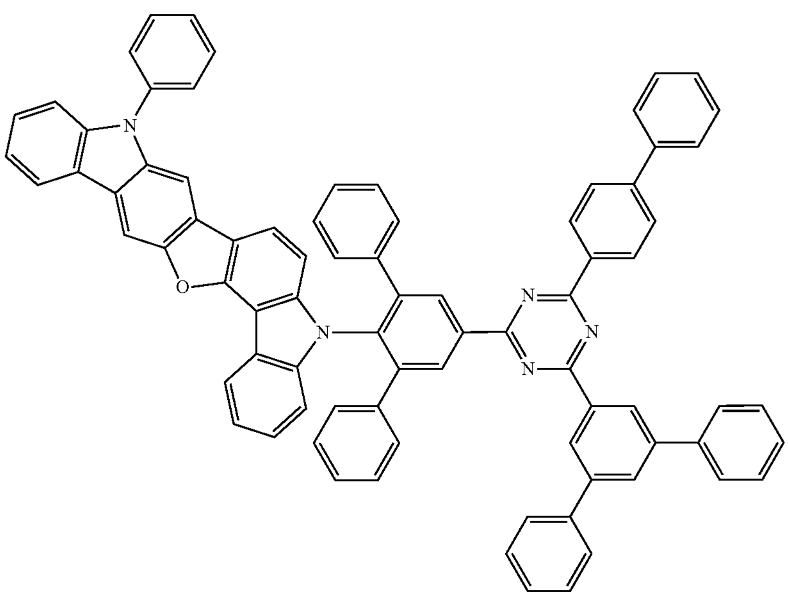

-continued
950
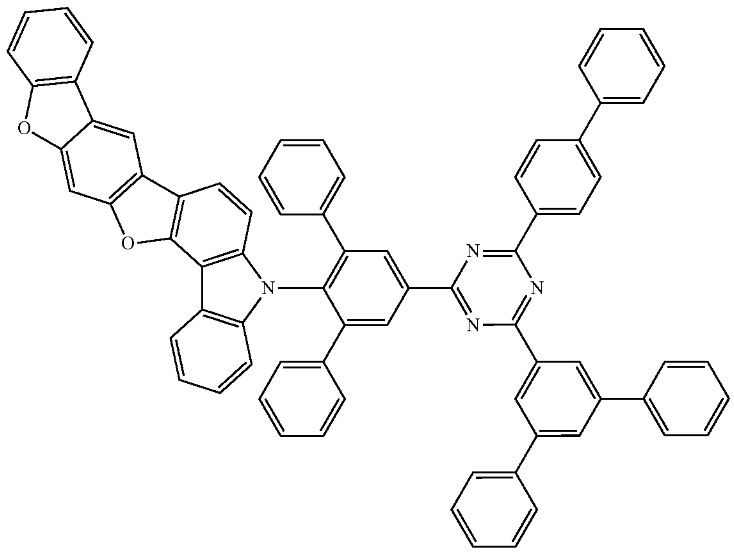
951
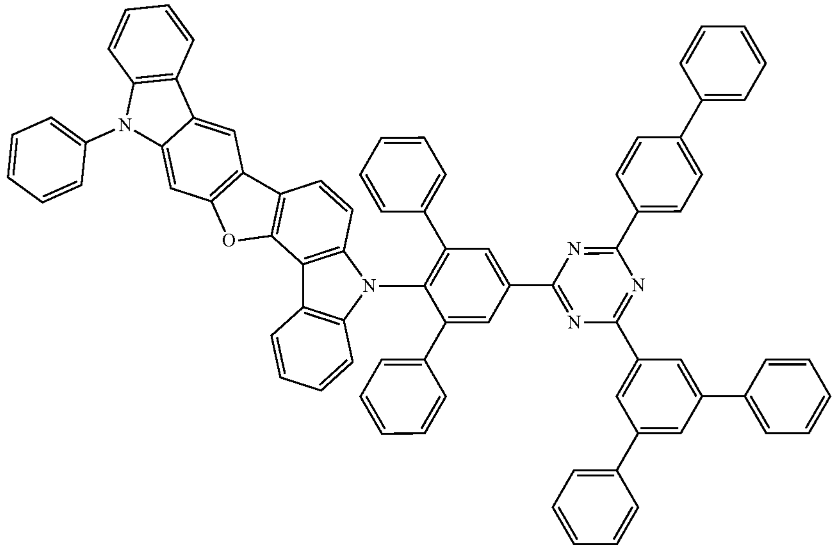
952
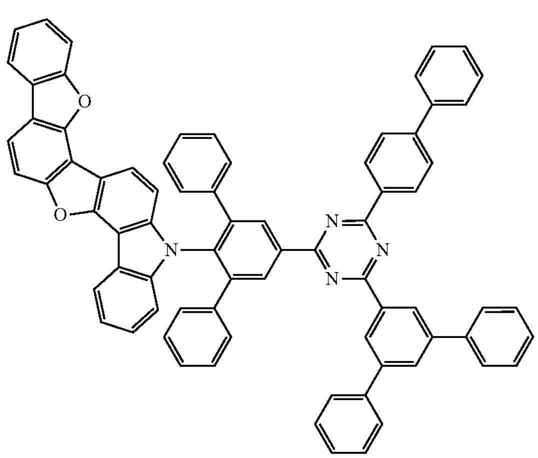
953
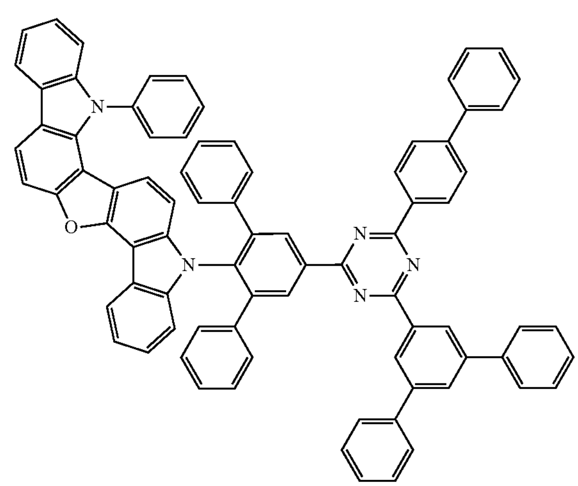

-continued
954
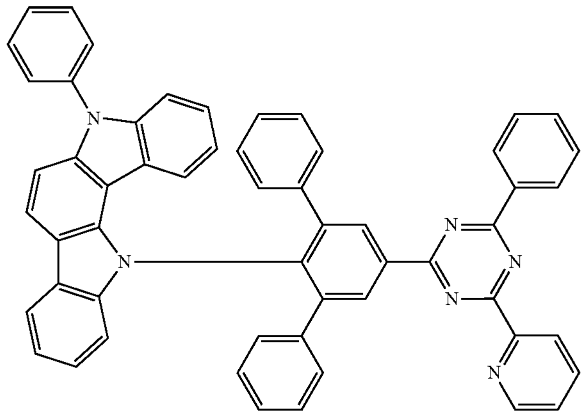
955
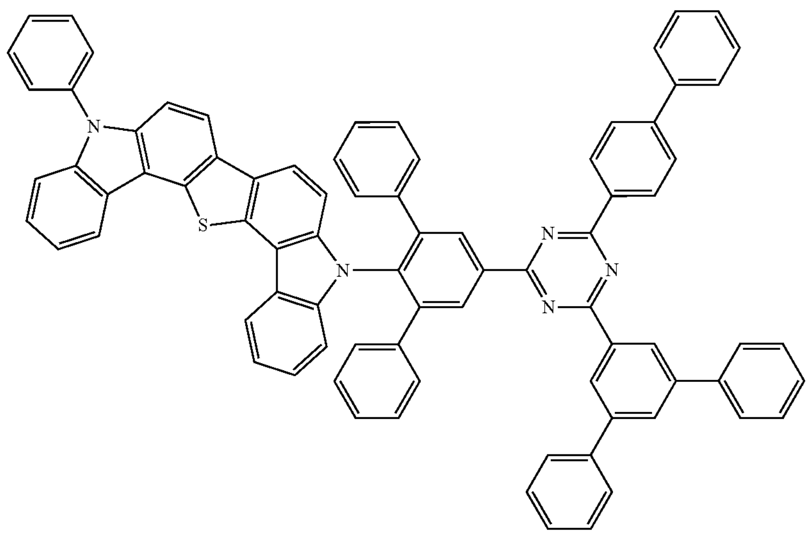
956
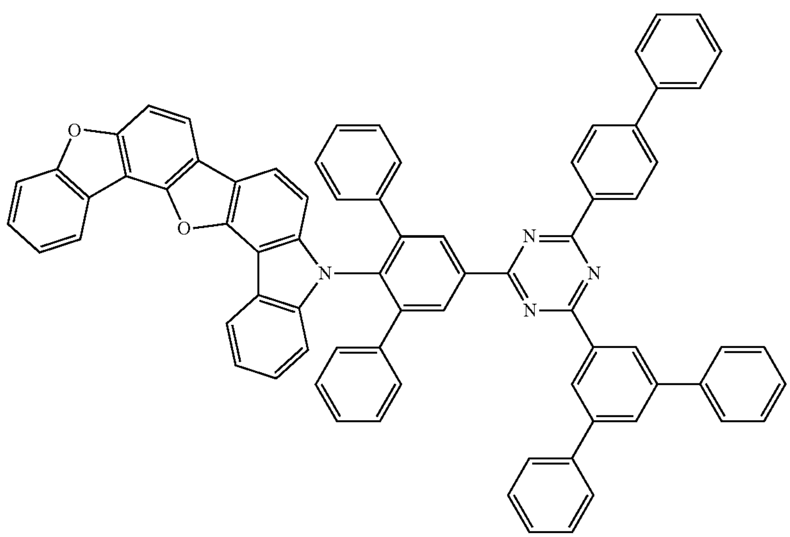

-continued
957
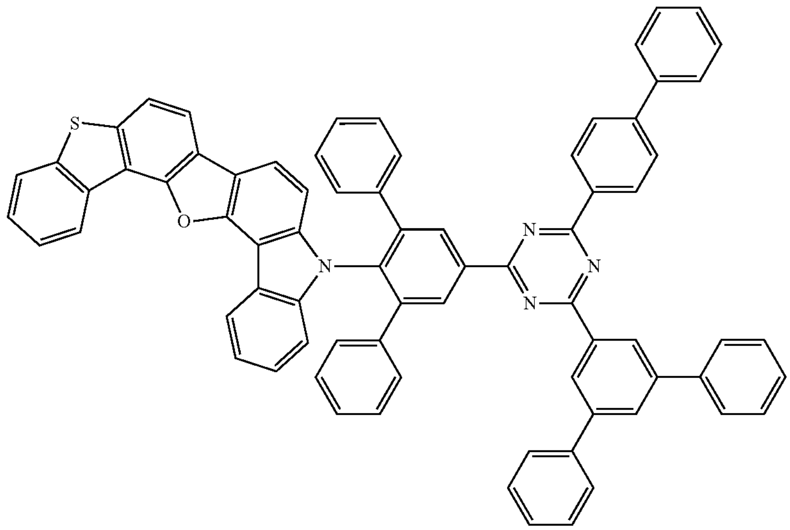
958
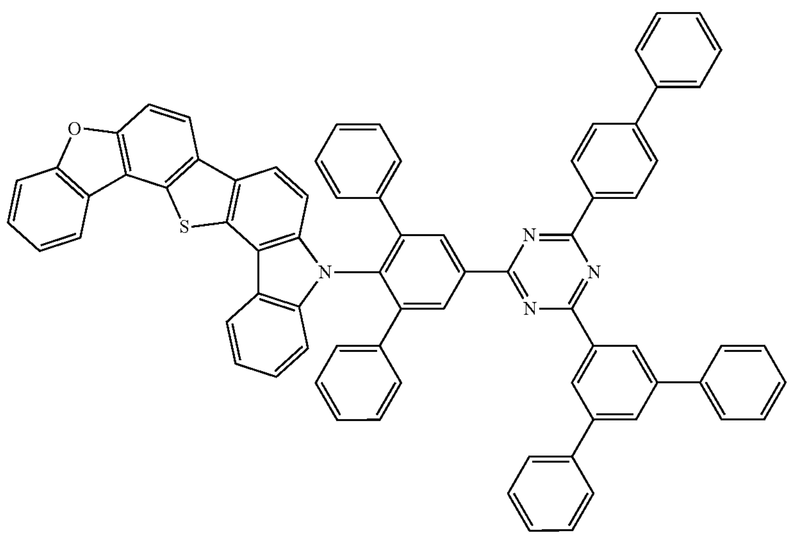
959
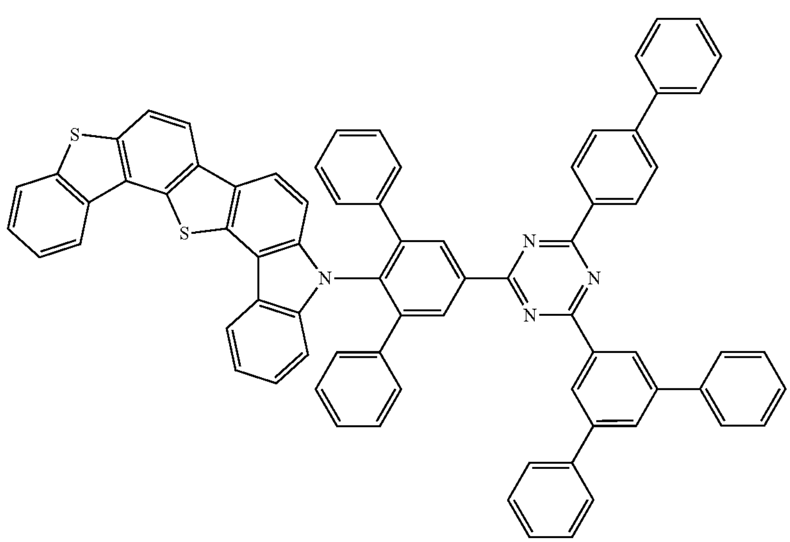

-continued
960
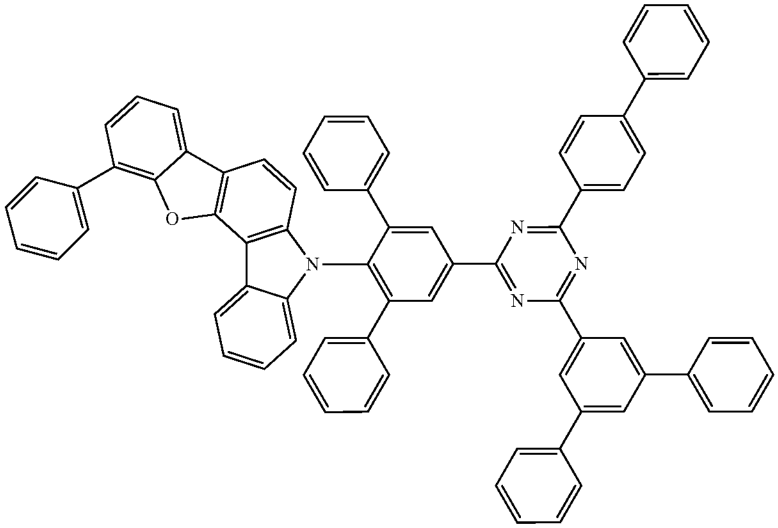
961
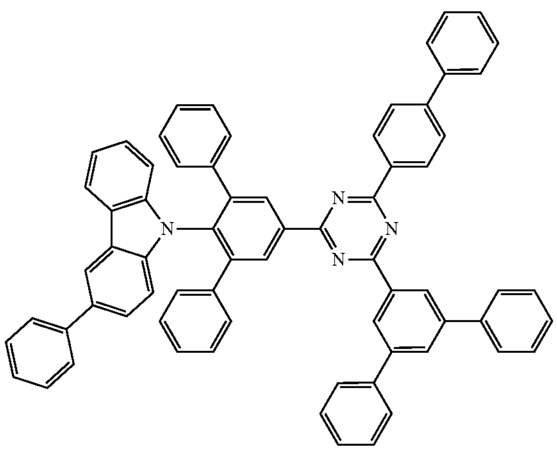
962
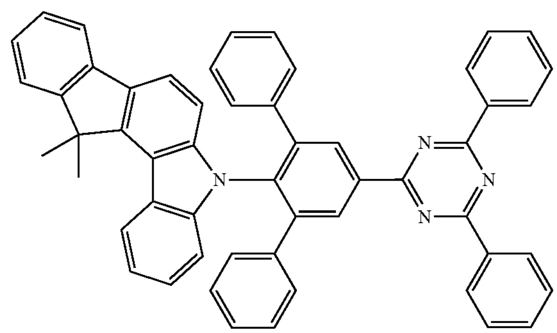
963
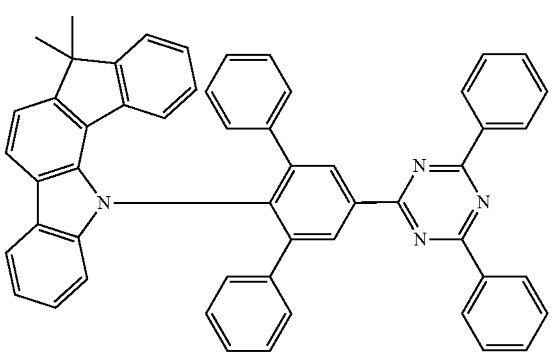
964
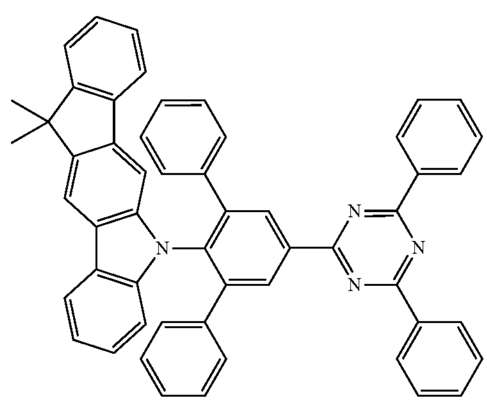

-continued
965
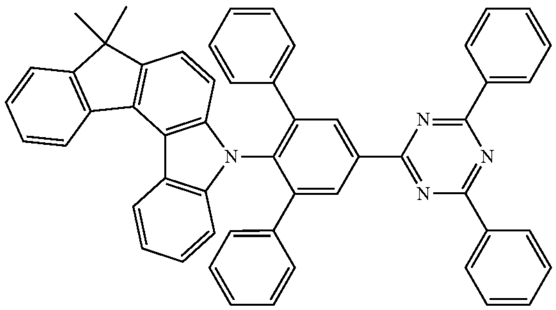
966
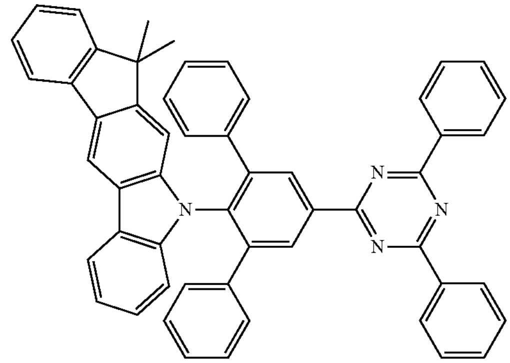
967
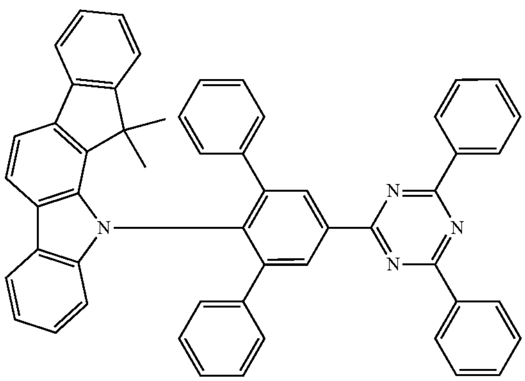
968
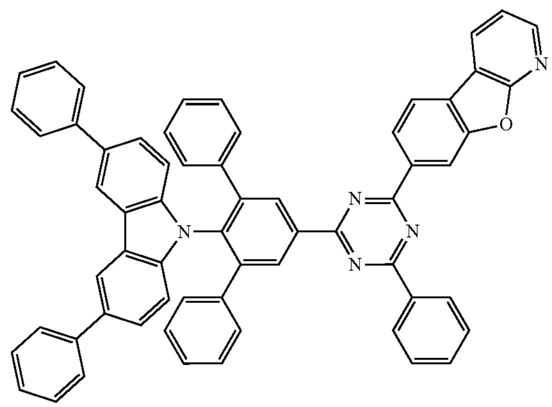
969
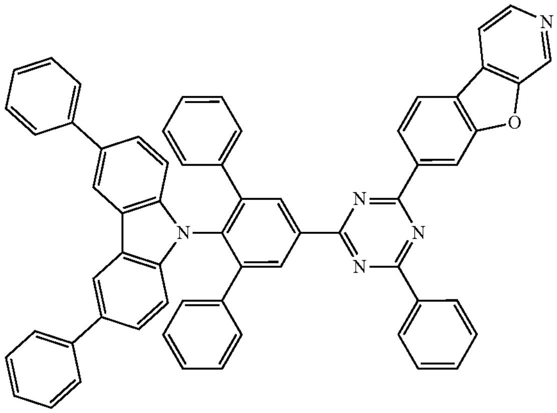
970
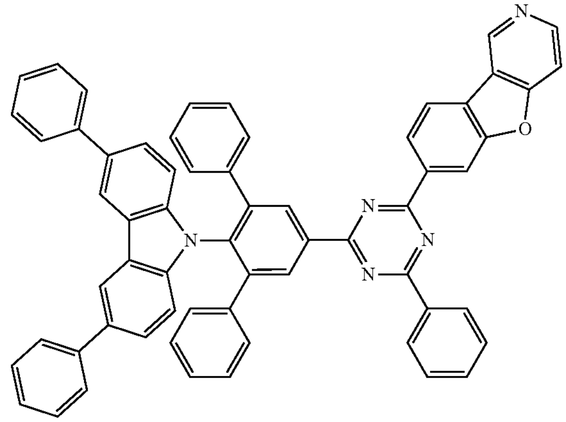

-continued
971
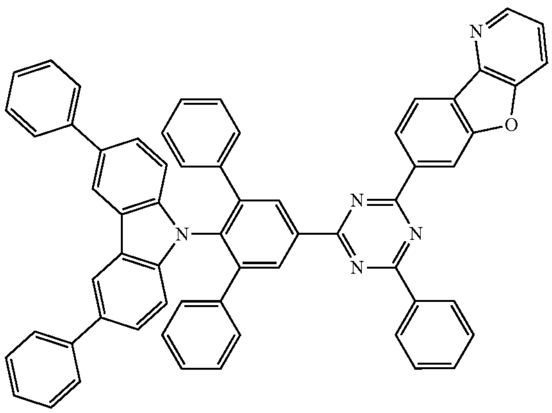
972
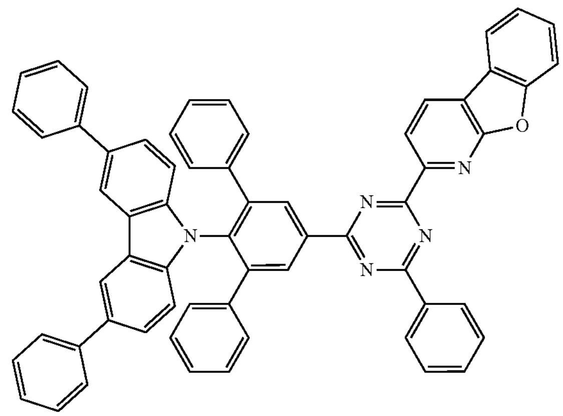
973
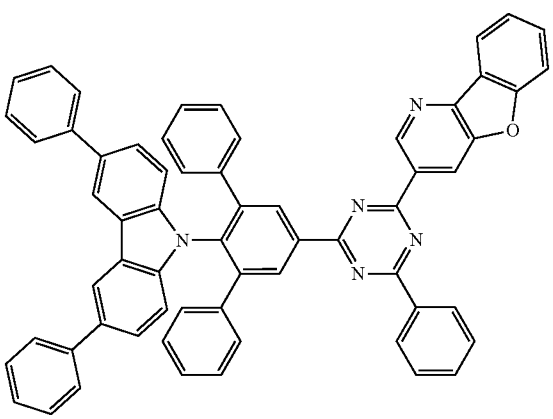
974
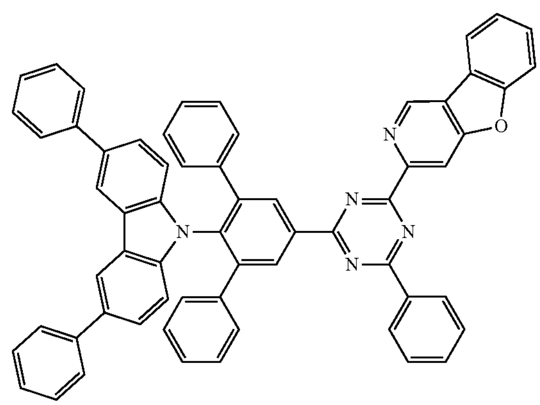
975
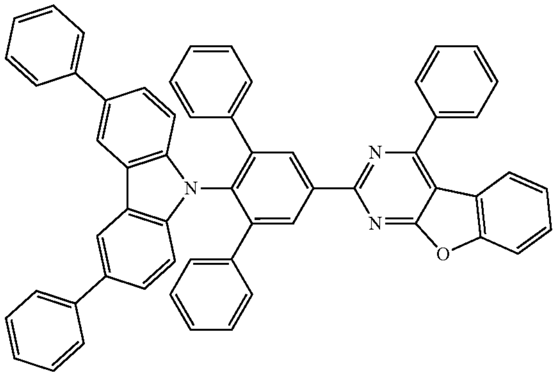
976
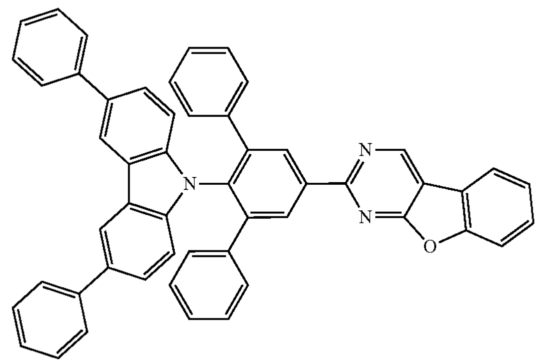

-continued
977
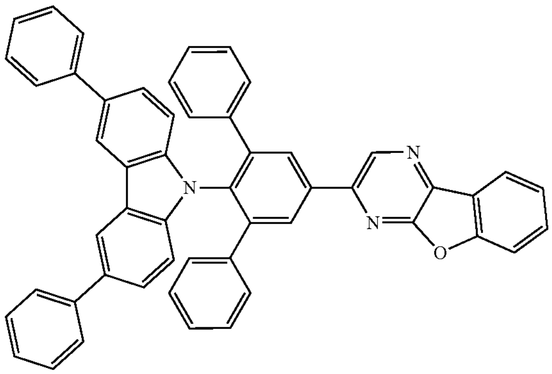
978
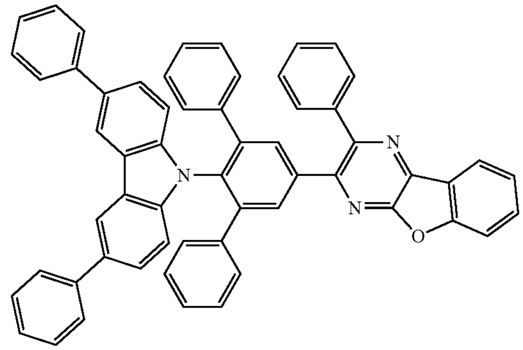
979
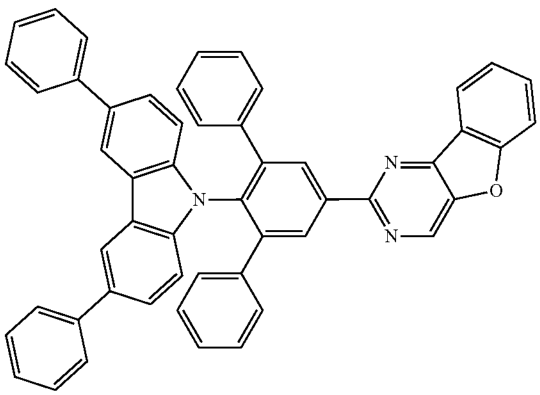
980
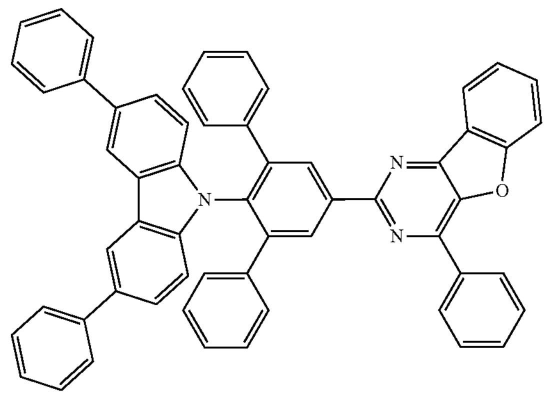
981
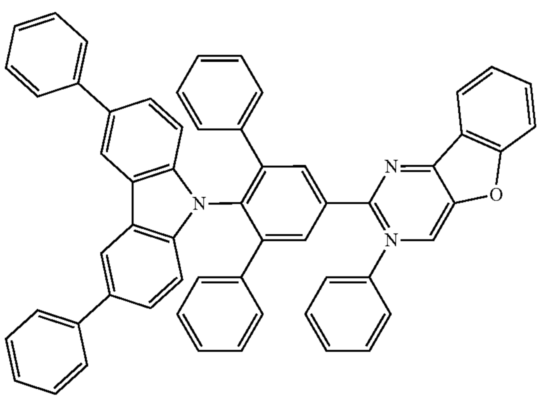
982
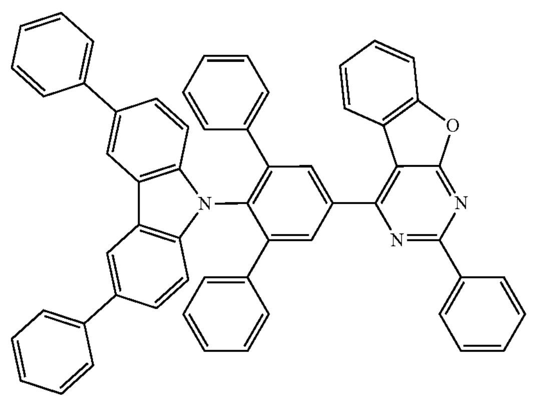
983
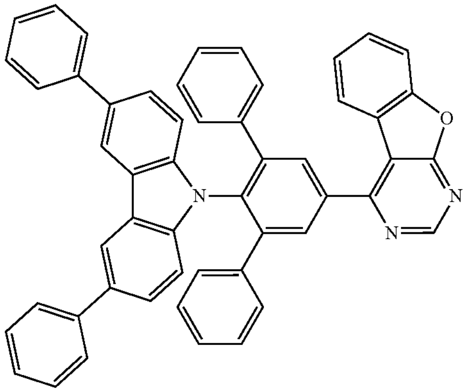
984
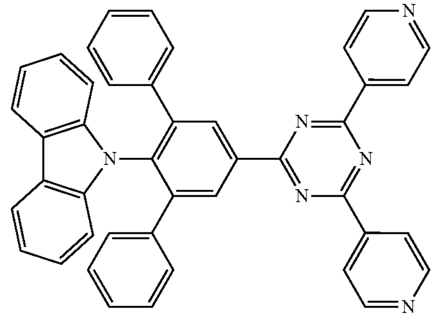

-continued
985
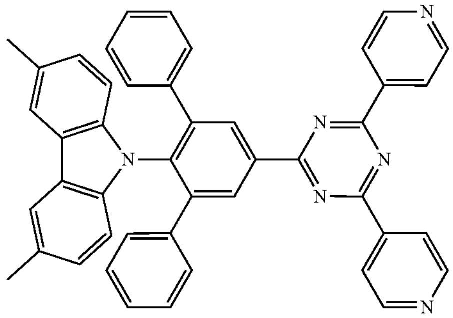
986
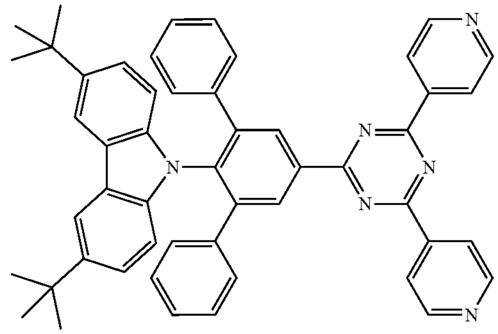
987
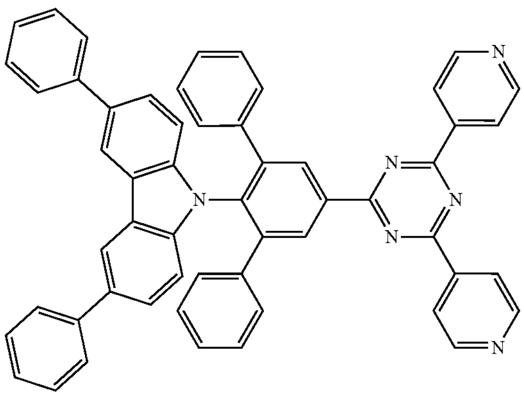
988
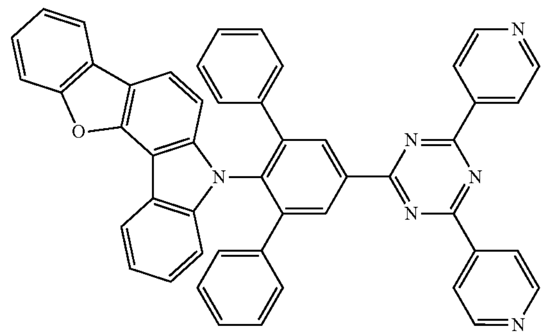
989
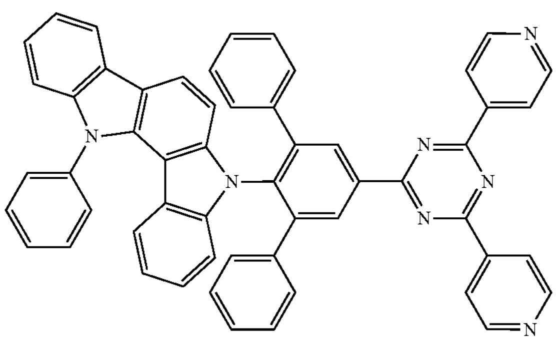
990
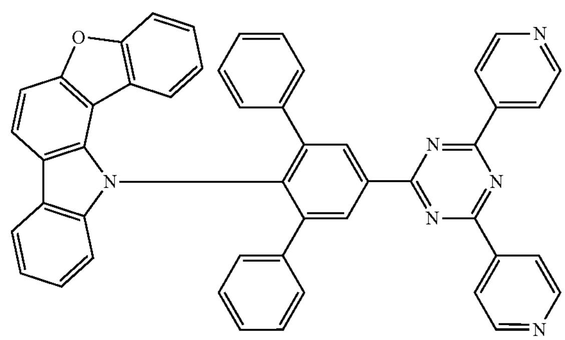
991
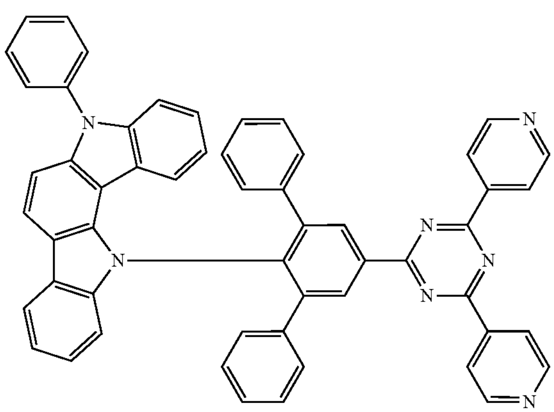
992
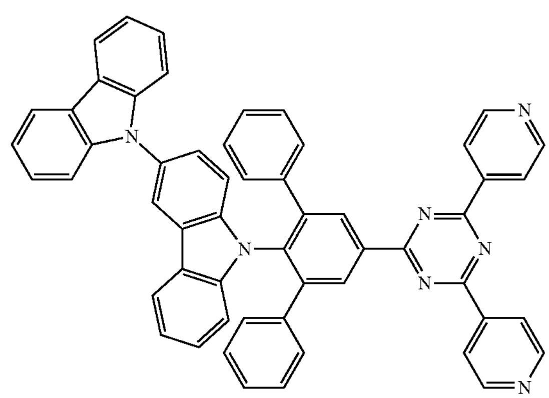

-continued
993
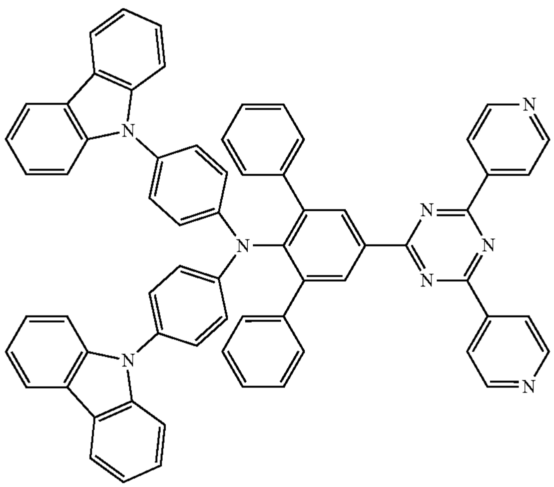
994
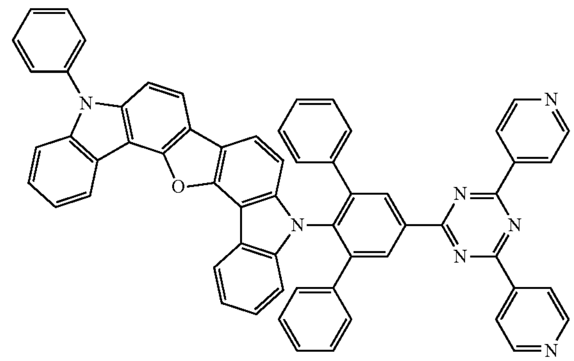
995
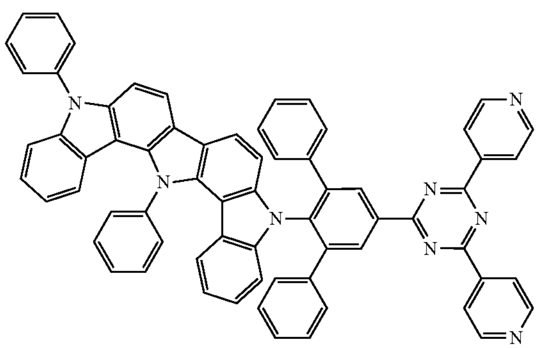
996
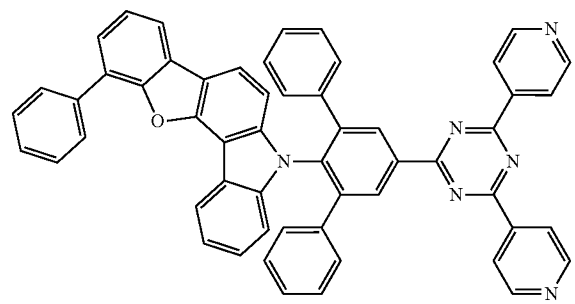
997
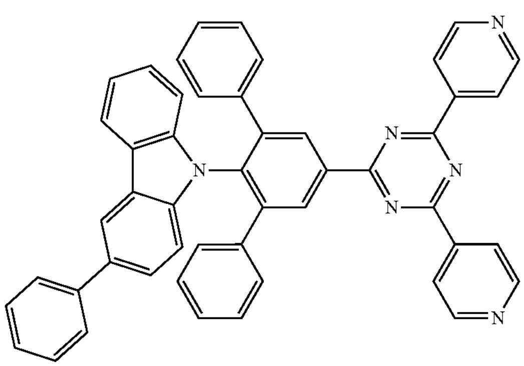
998
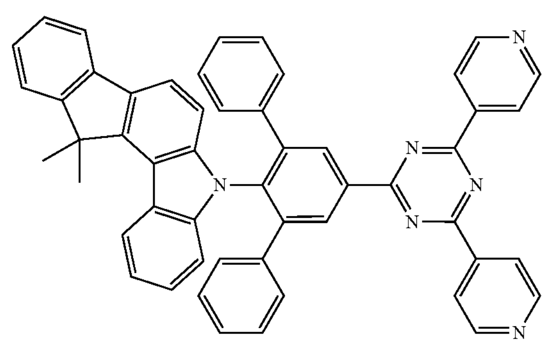

-continued
999
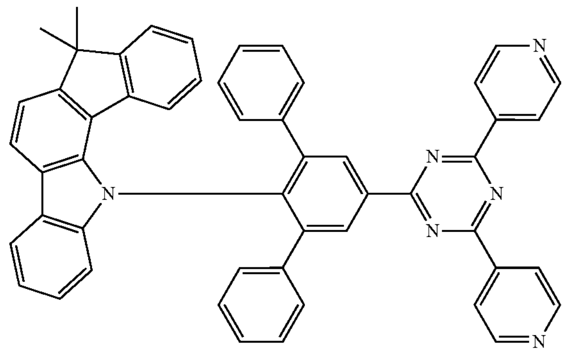
1000
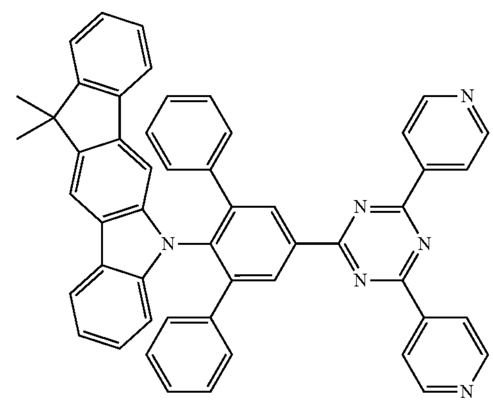
1001
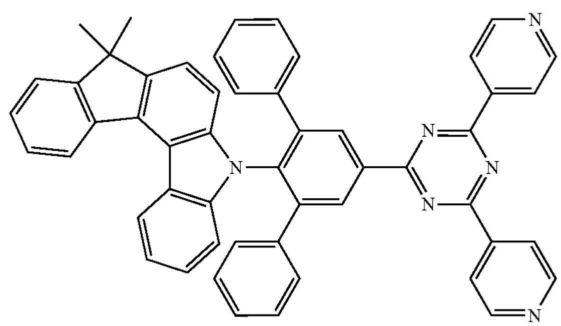
1002
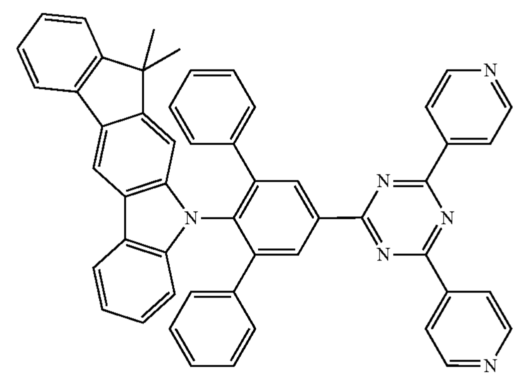
1003
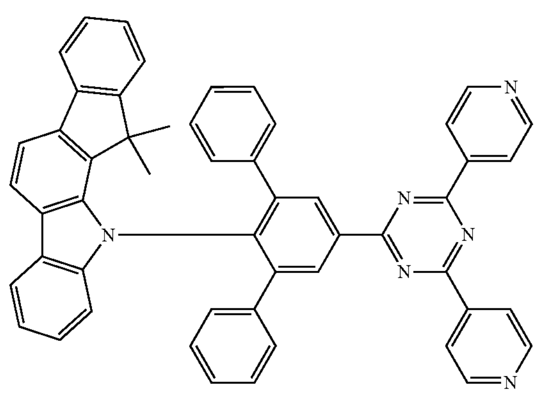
1004
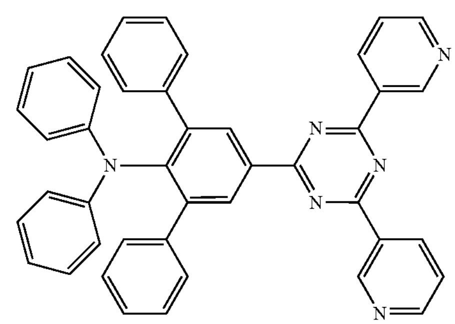
1005
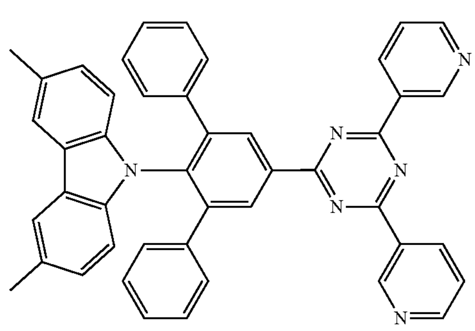
1006
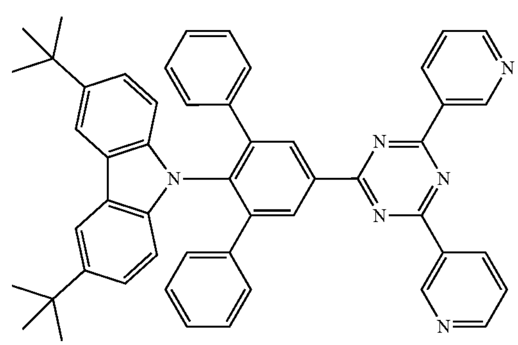

-continued
1007
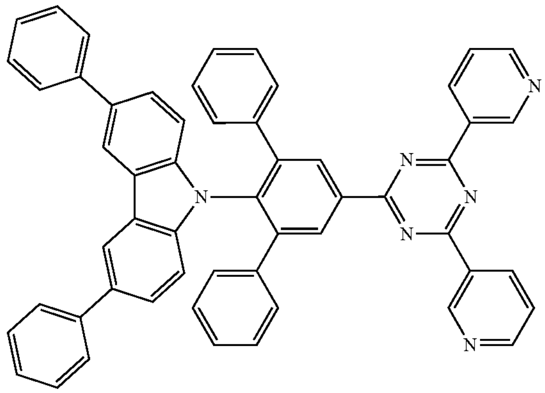
1008
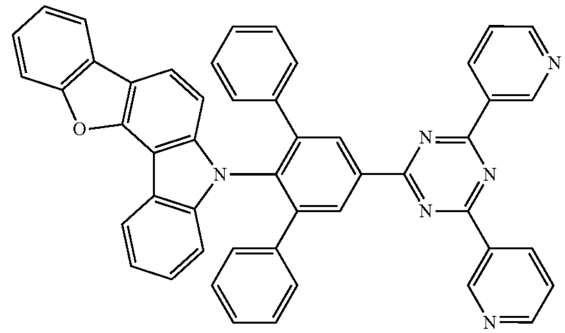
1009
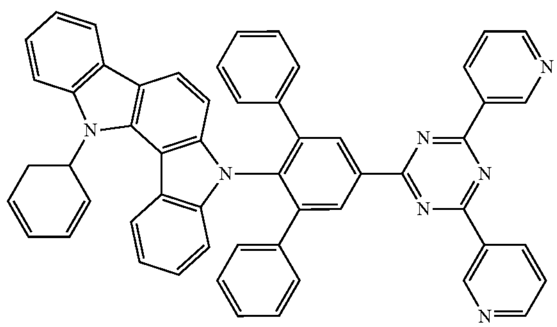
1010
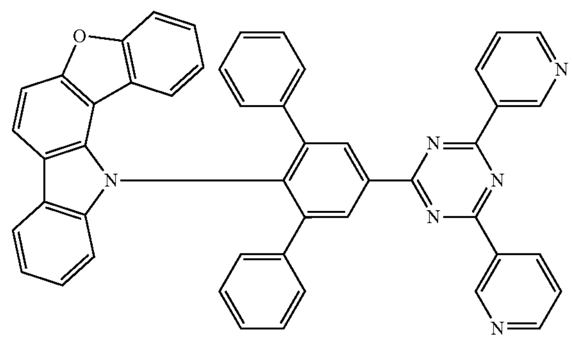
1011
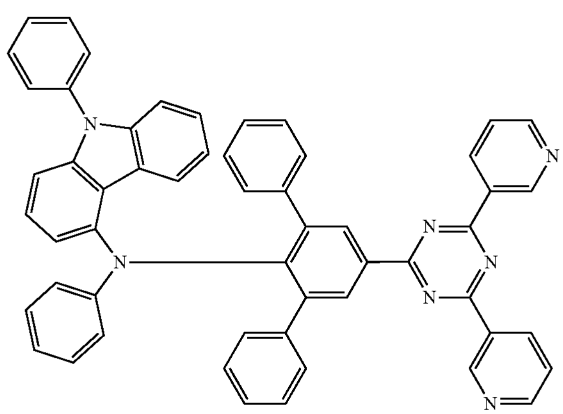
1012
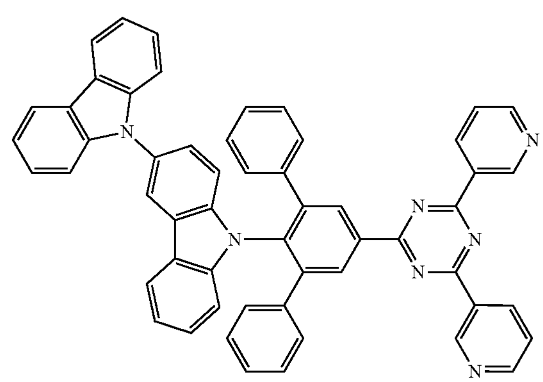

-continued
1013
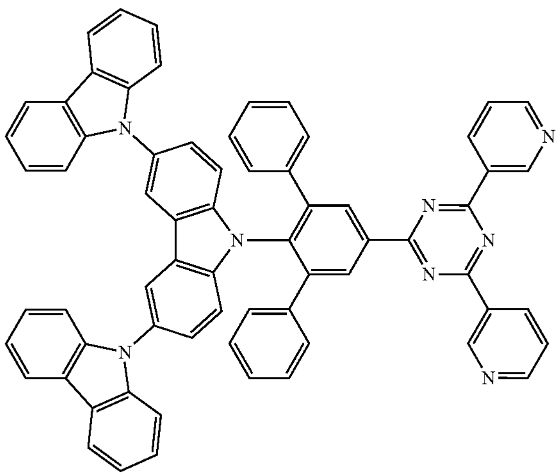
1014
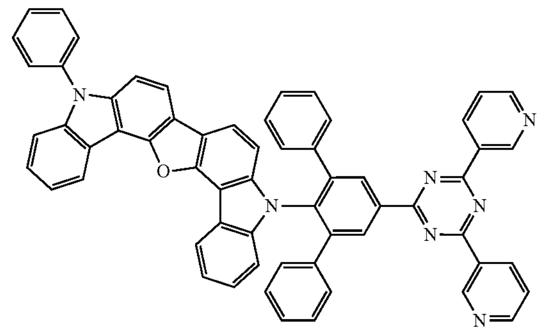
1015
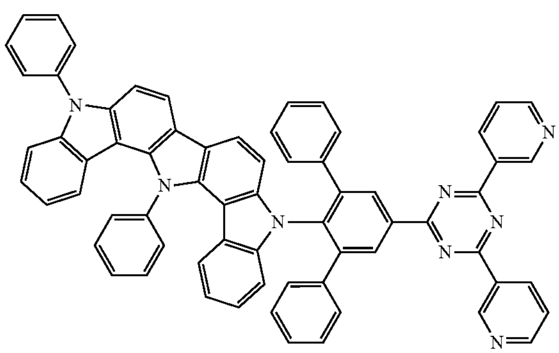
1016
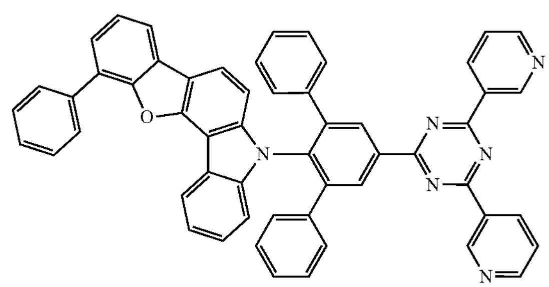
1017
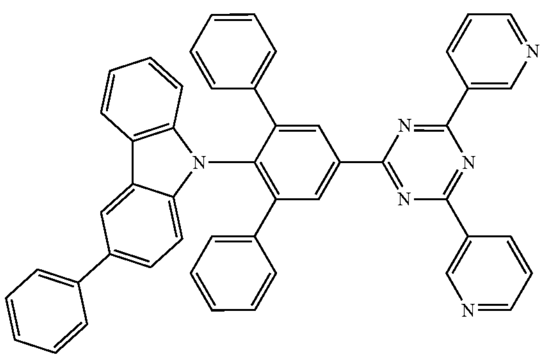
1018
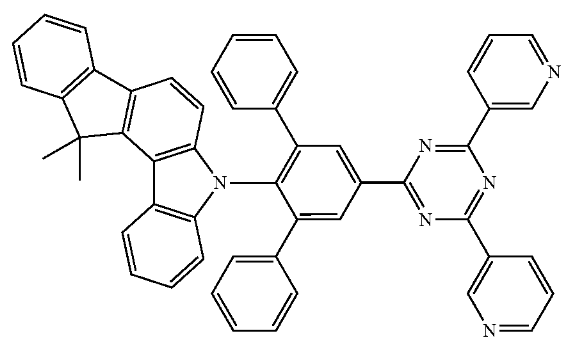
1019
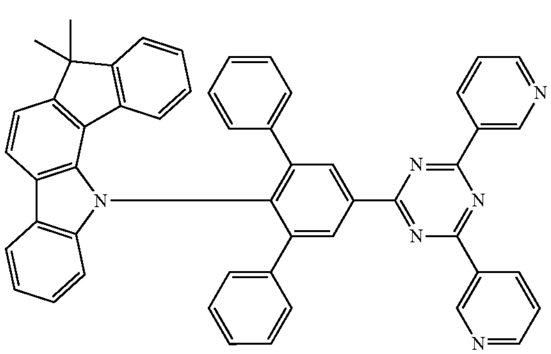
1020
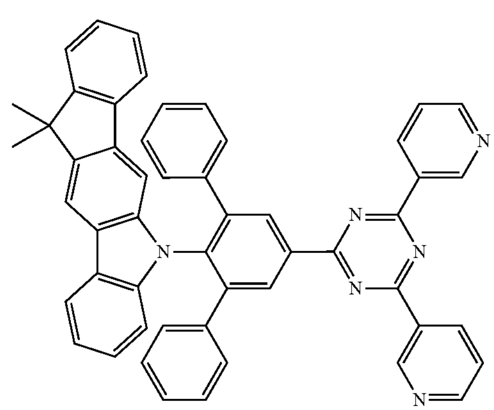

-continued
1021
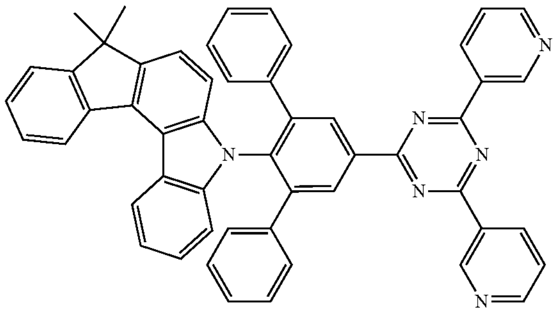
1022
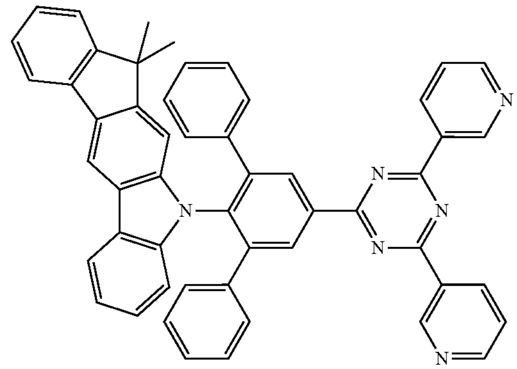
1023
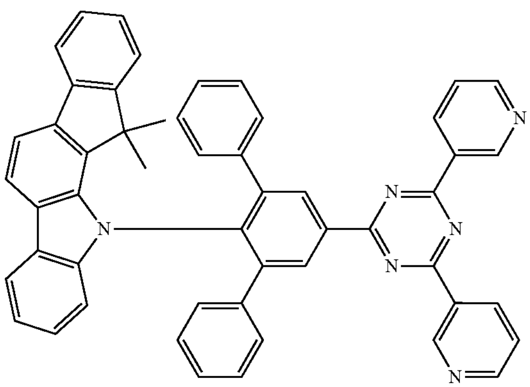
1024
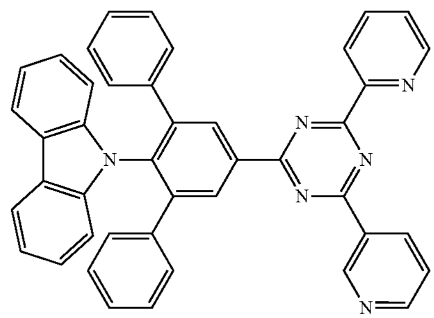
1025
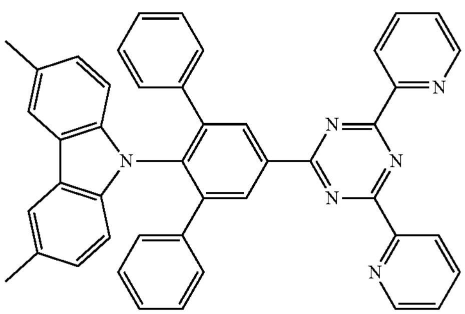
1026
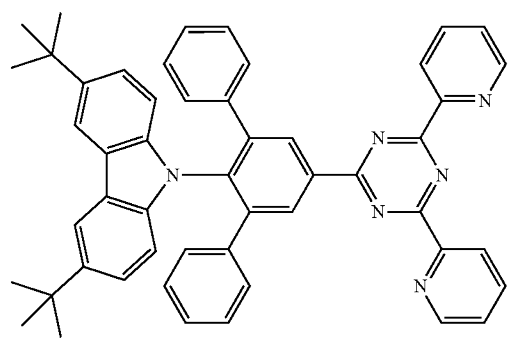
1027
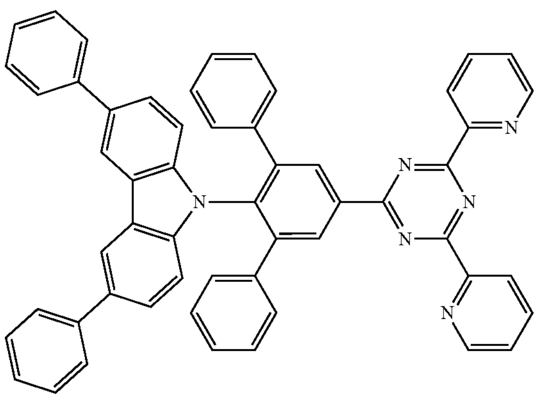
1028
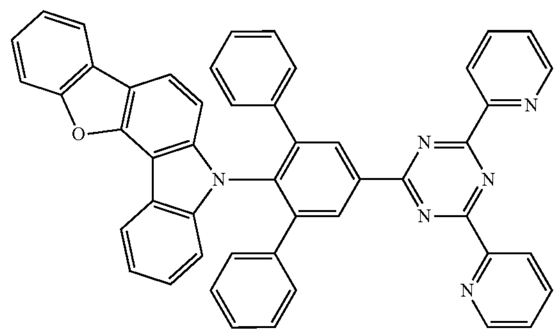

-continued
1029
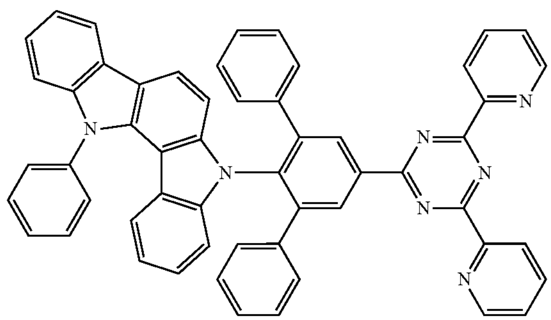
1030
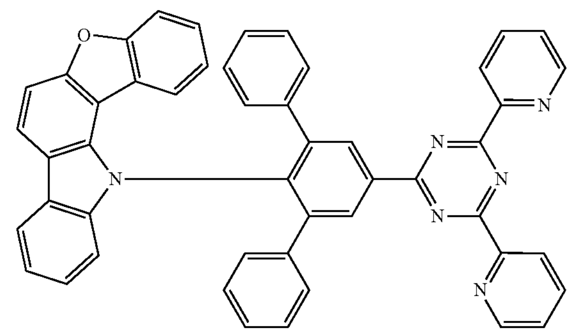
Group DF4
1
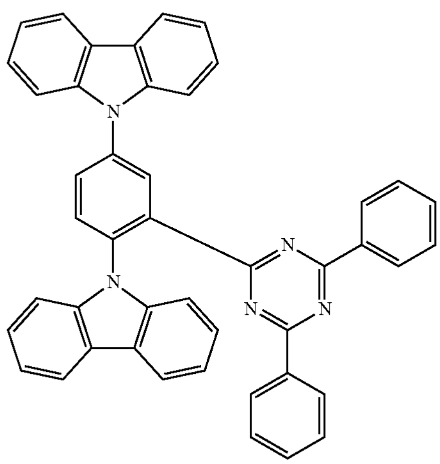
2
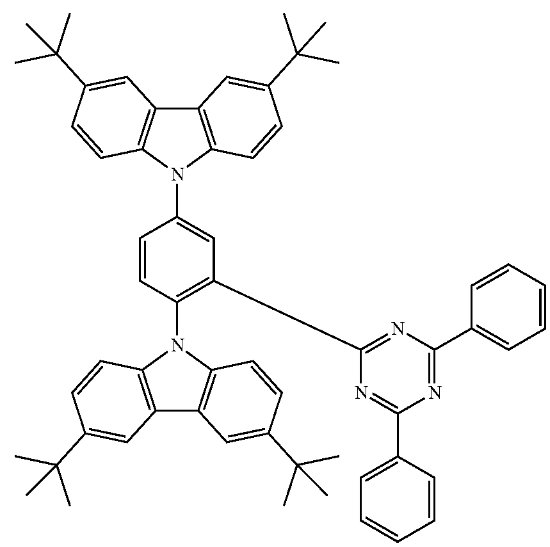
3
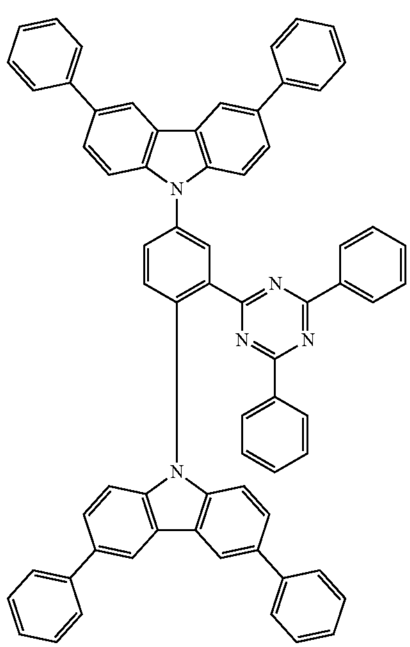
4
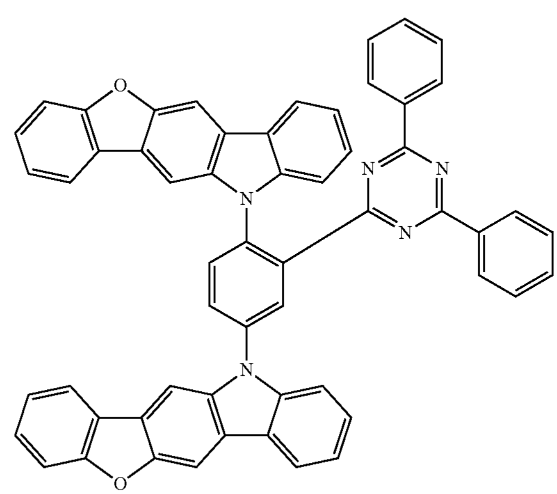

-continued
5
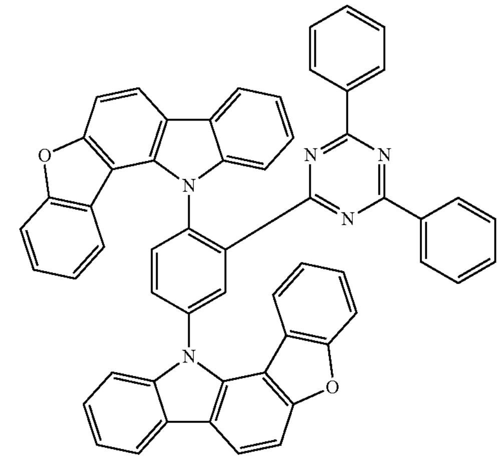
6
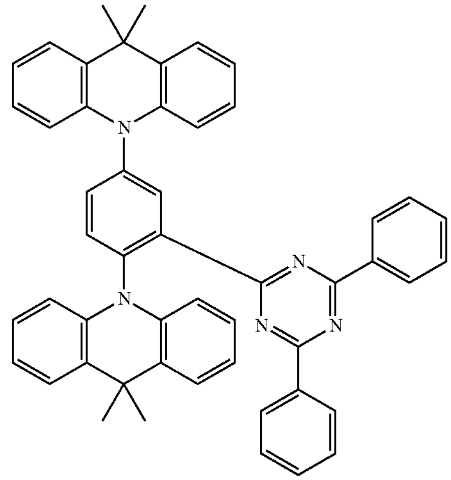
7
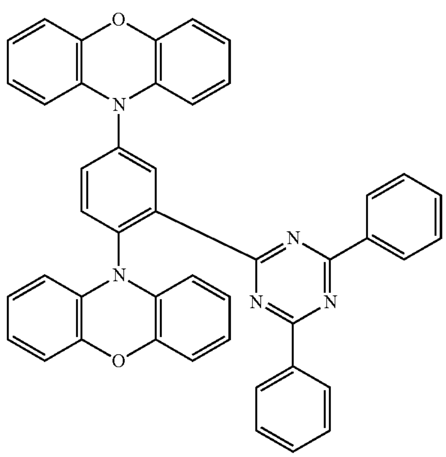
8
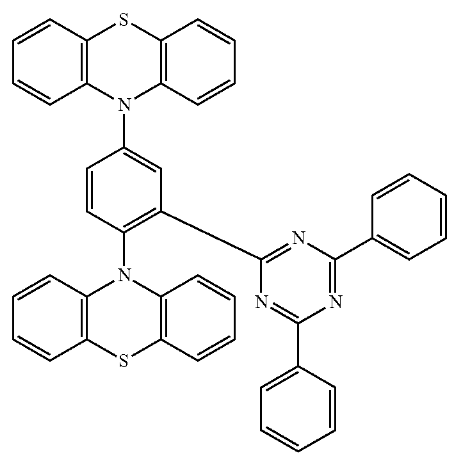
9
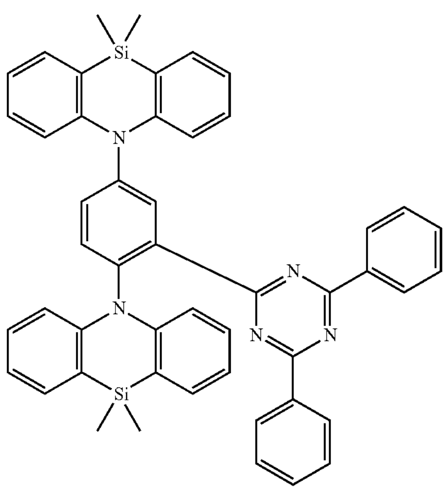
10
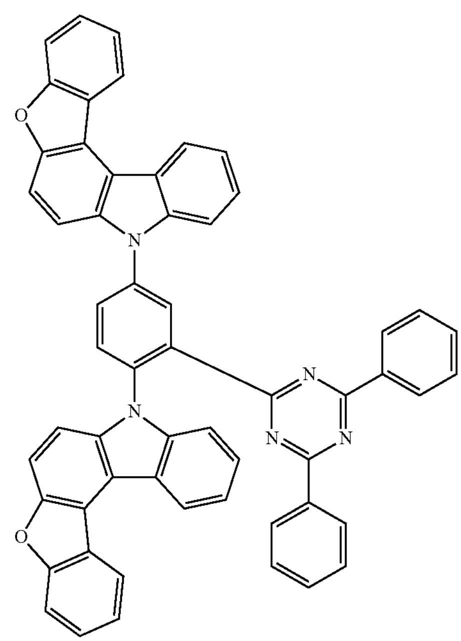

-continued
11
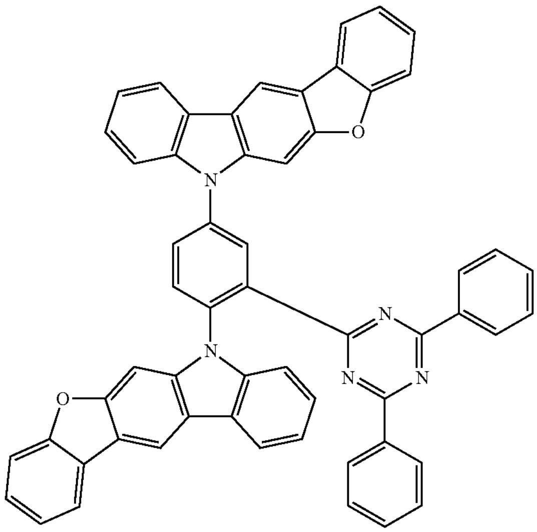
12
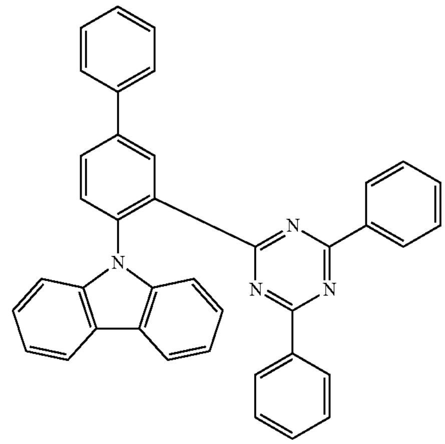
13
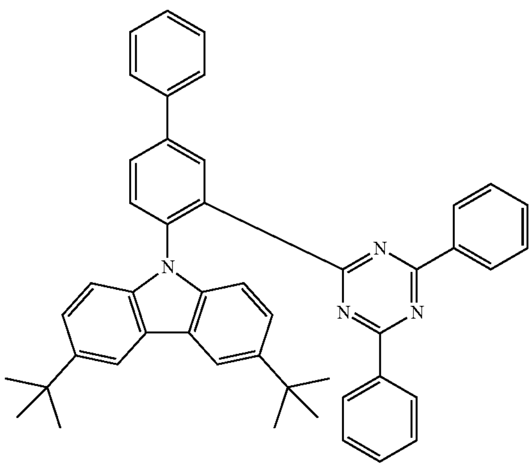
14
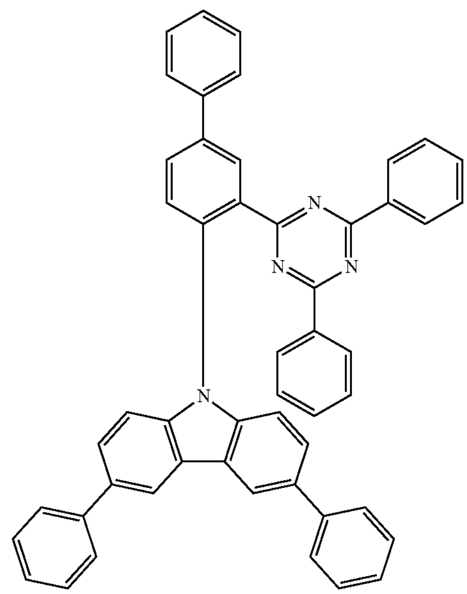
15
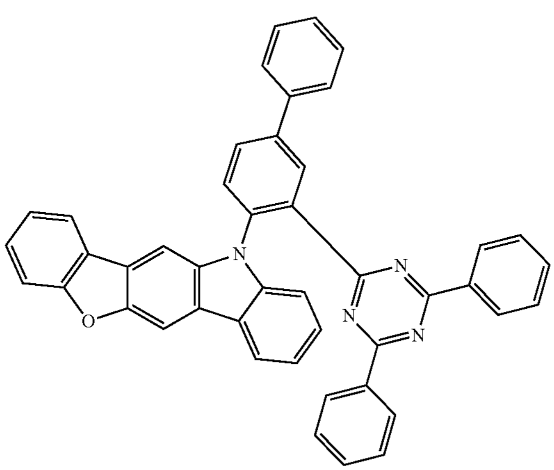
16
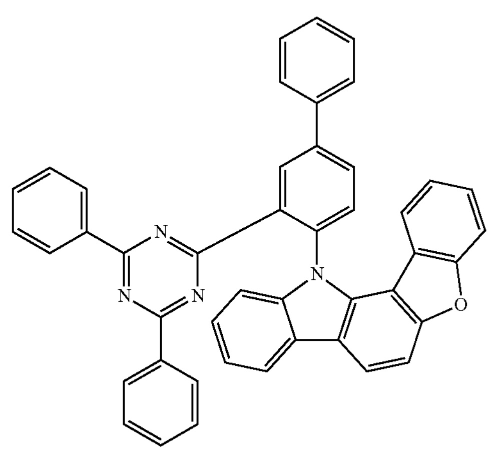

-continued
17
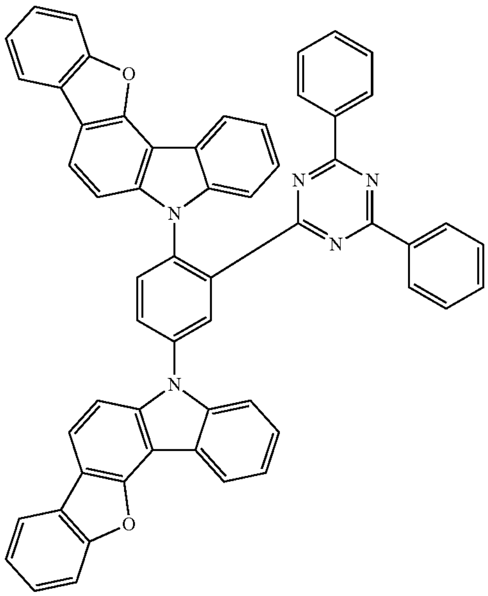
18
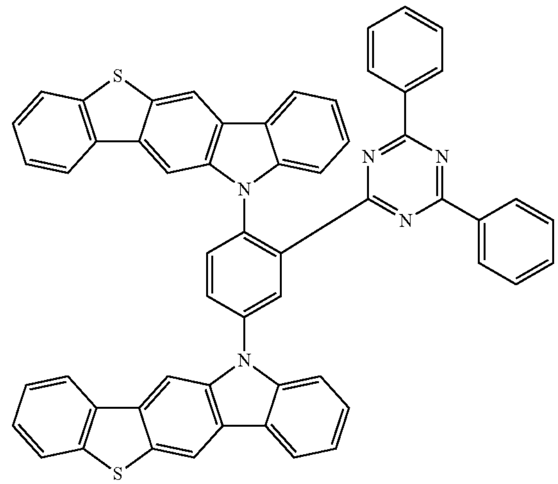
19
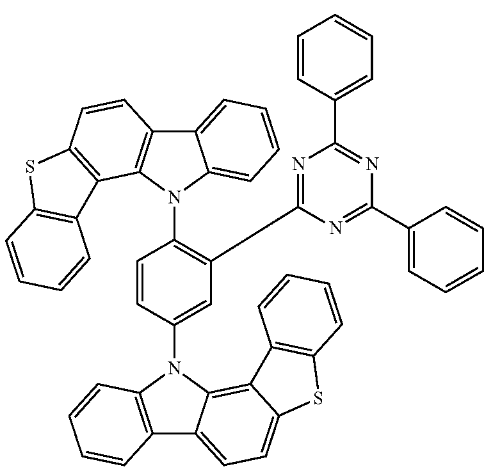
20
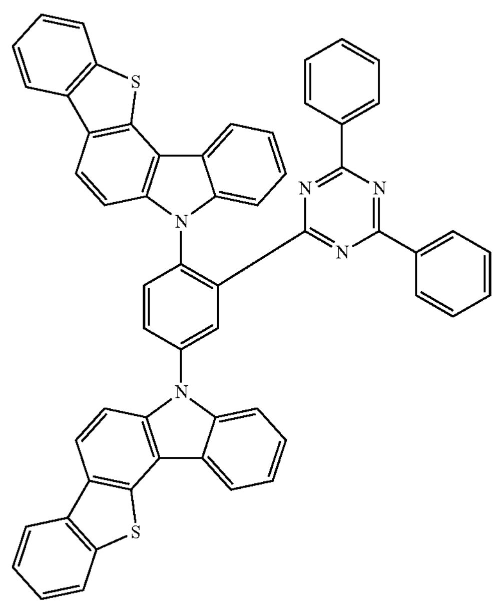

-continued
21
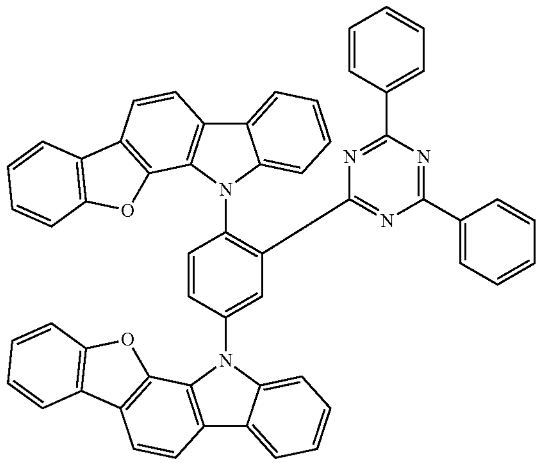
22
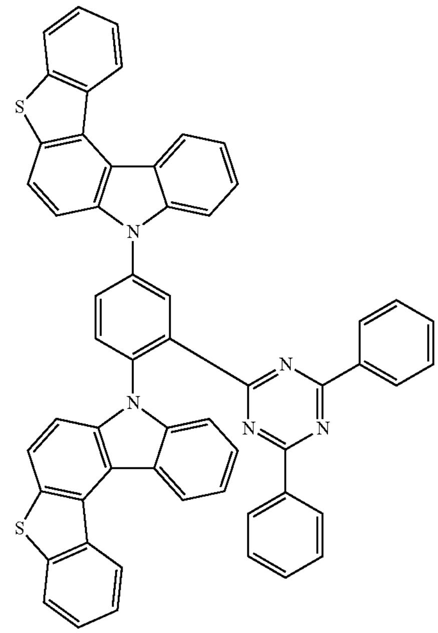
23
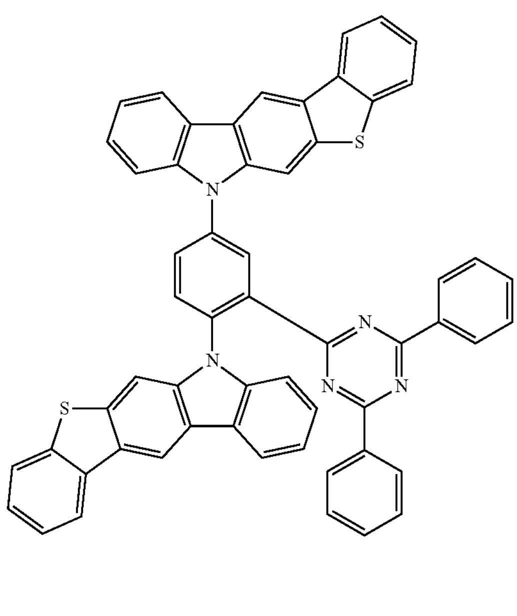
24
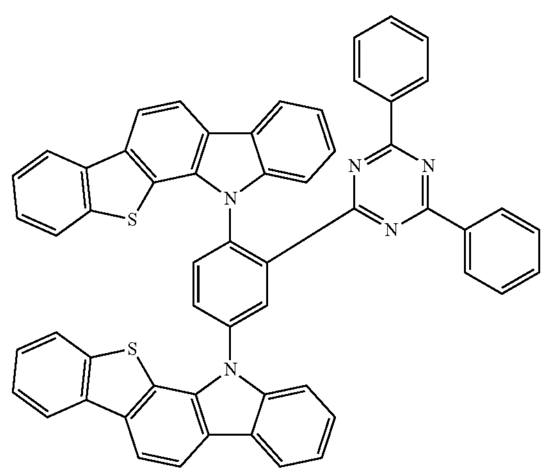

-continued
25
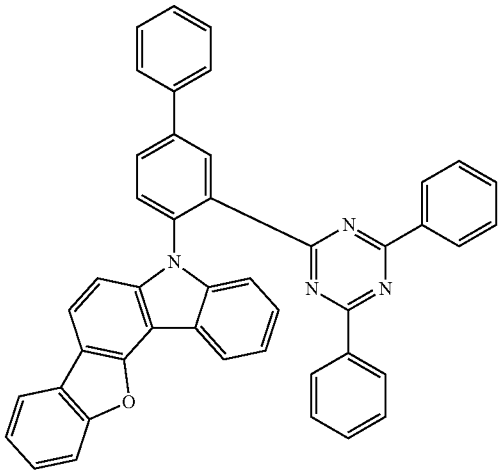
26
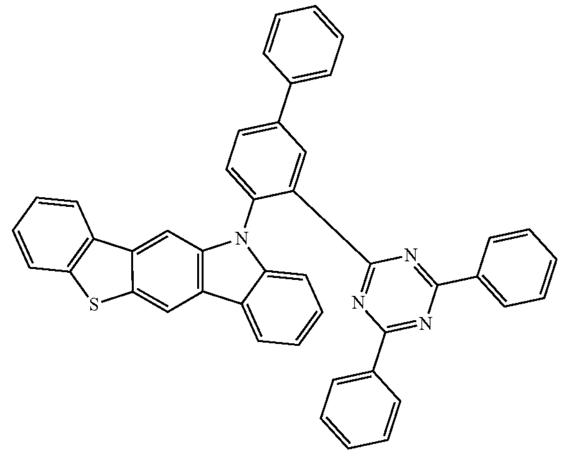
27
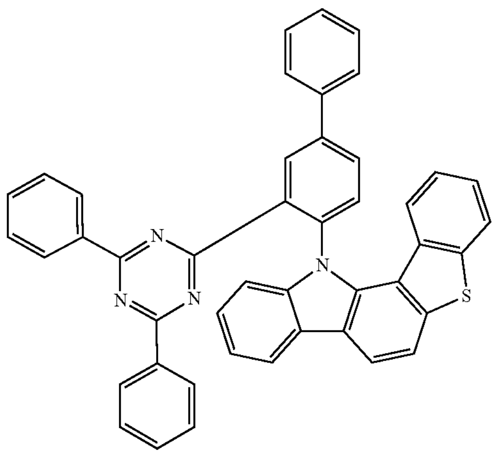
28
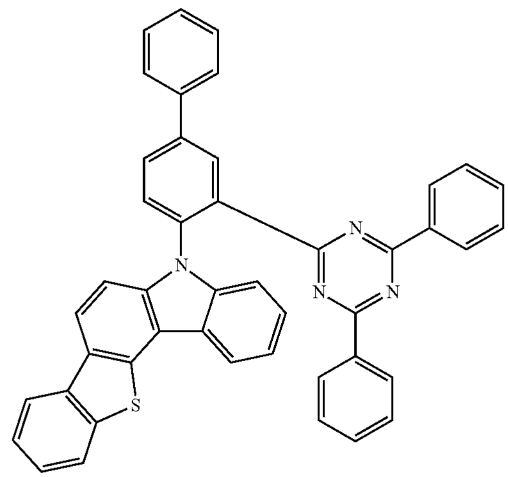
29
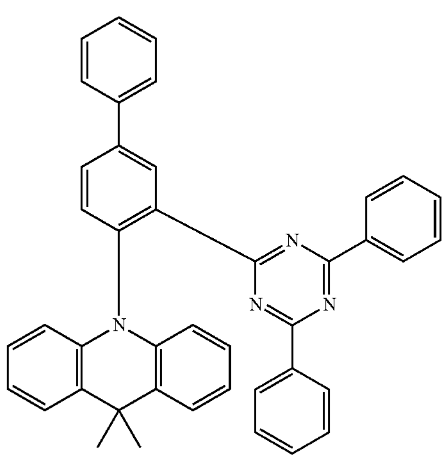
30
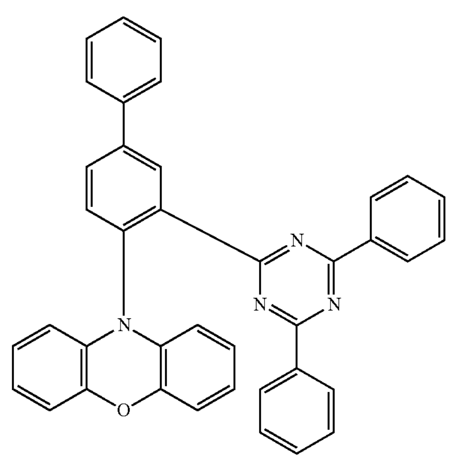

-continued
31
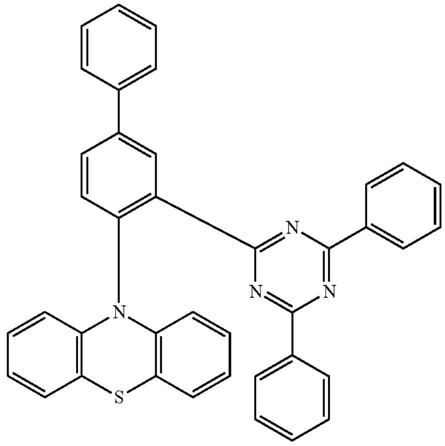
32
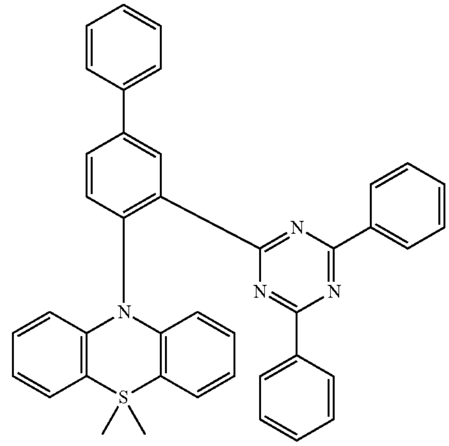
33
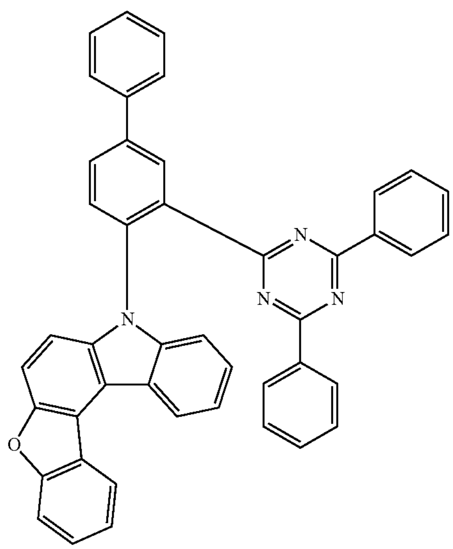
34
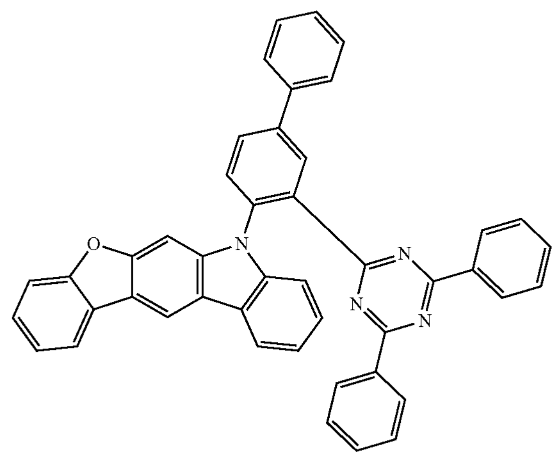
35
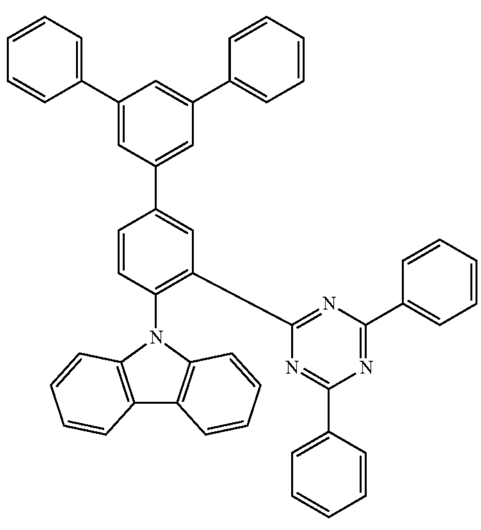
36
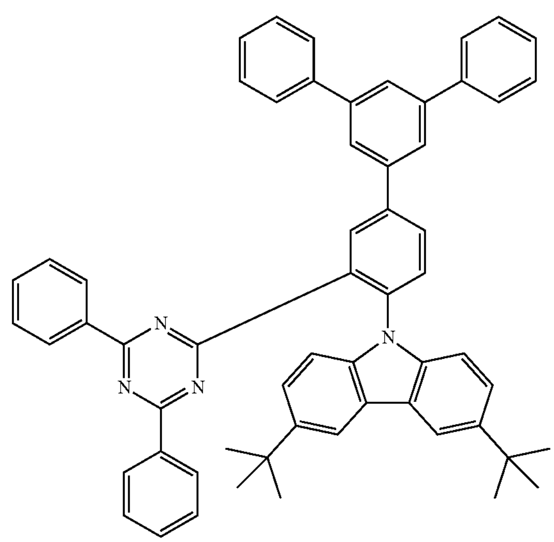

-continued
37
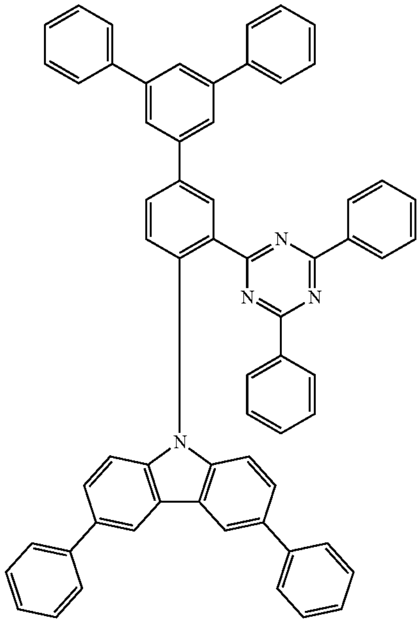
38
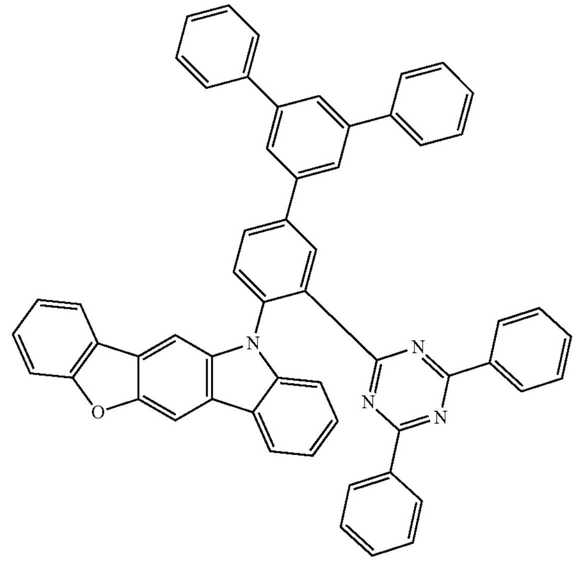
39
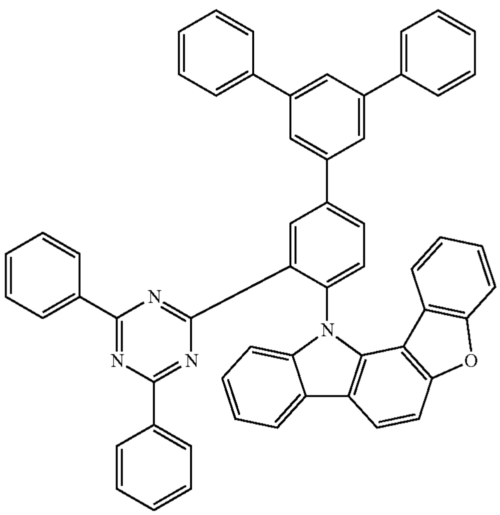
40
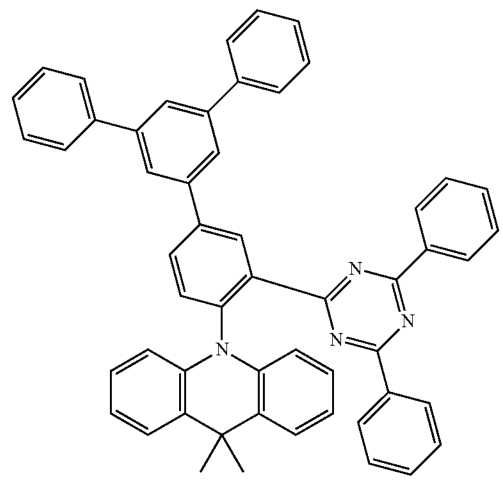
41
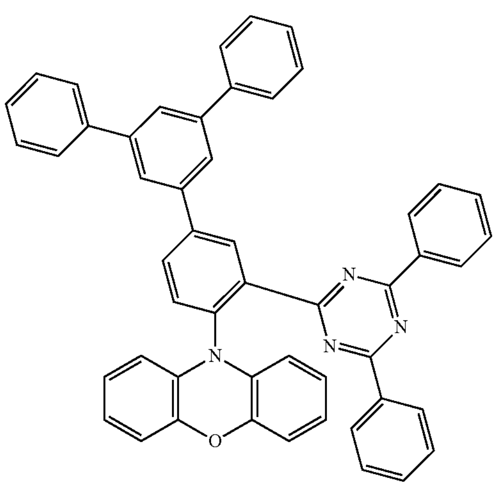
42
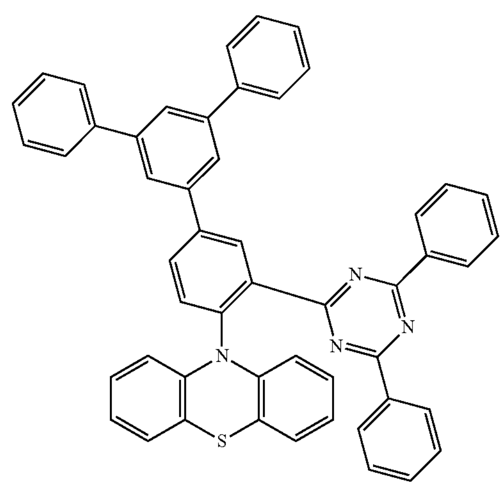

-continued
43
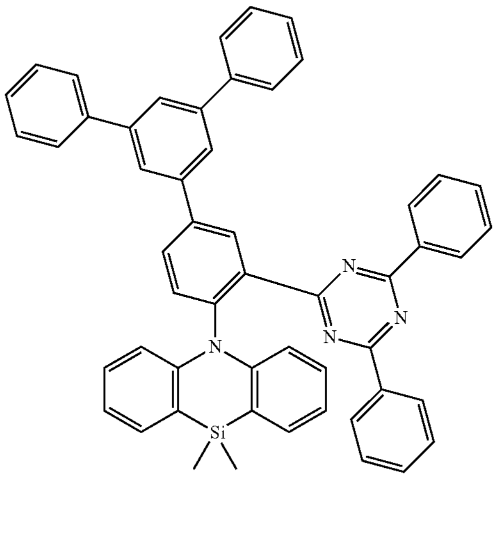
44
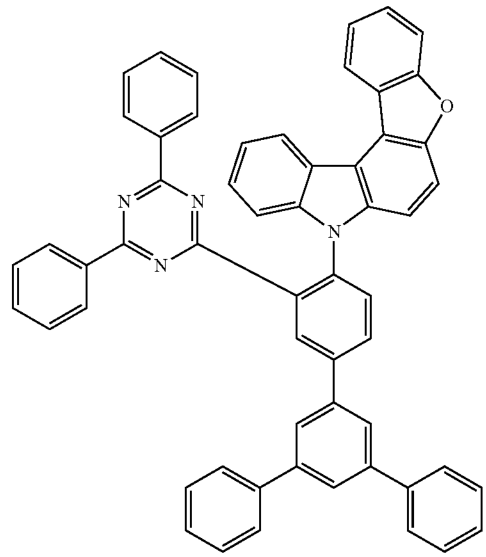
45
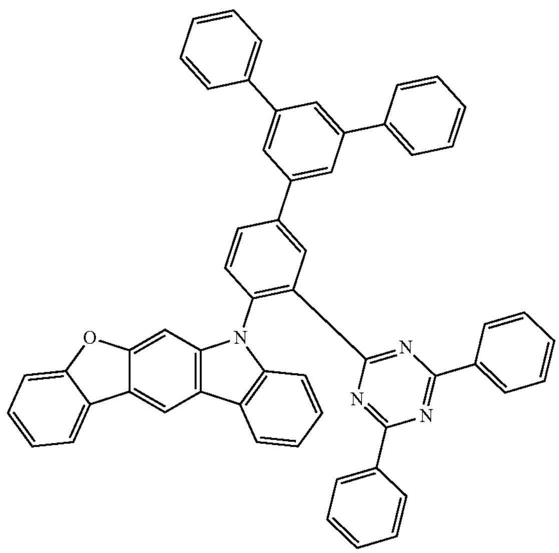
46
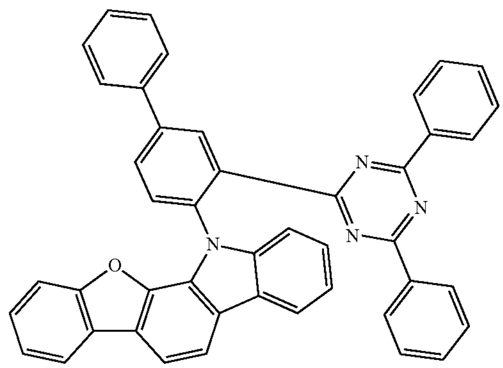
47
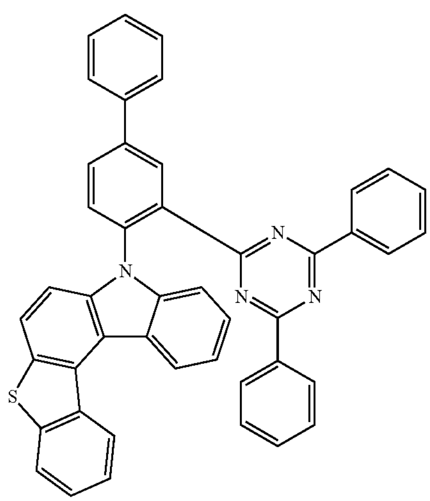
48
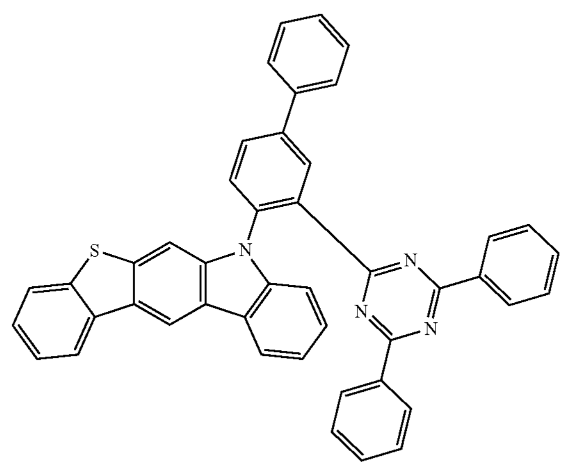

-continued
49
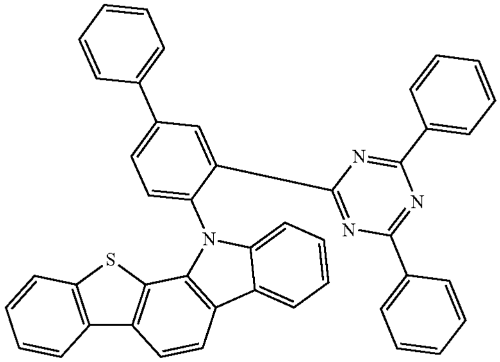
50
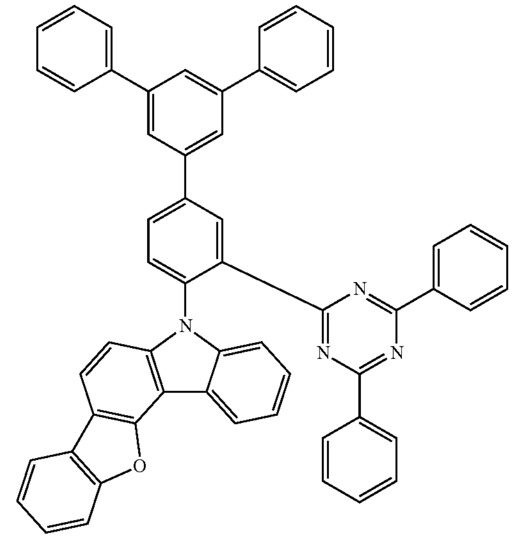
51
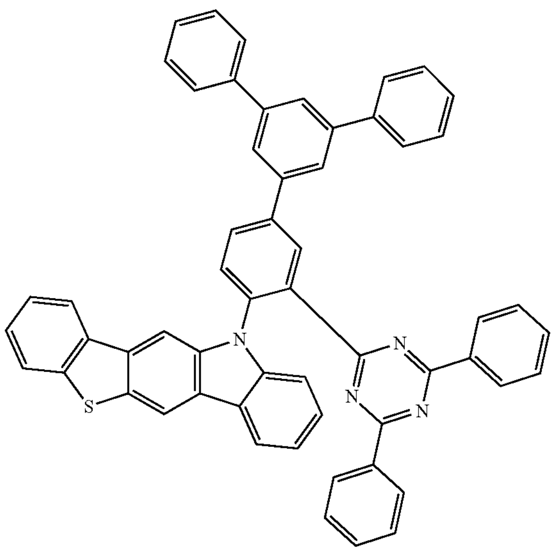
52
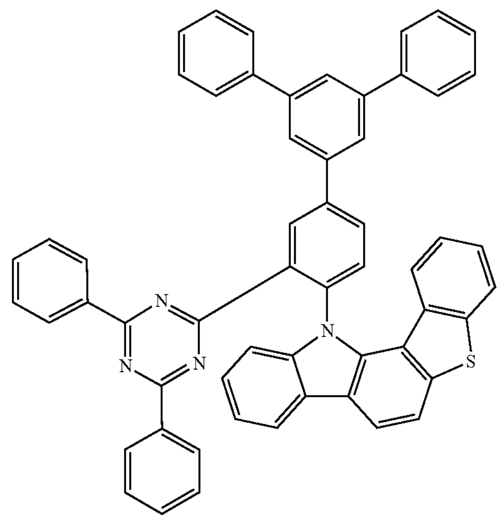
53
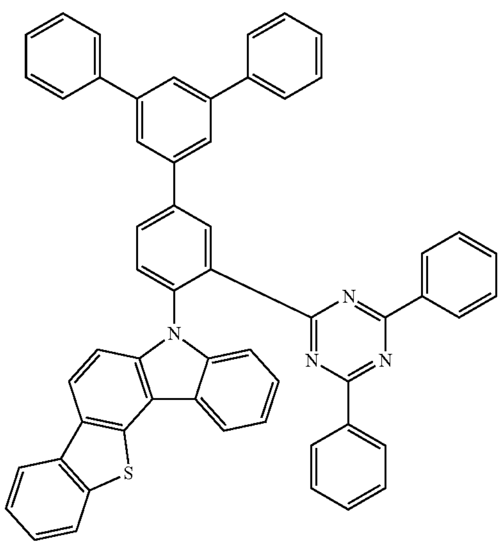
54
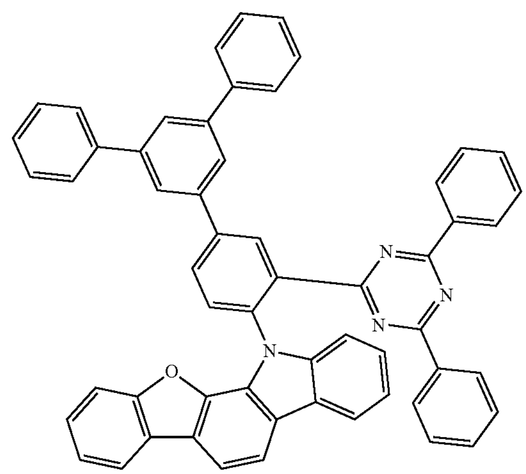

-continued
55
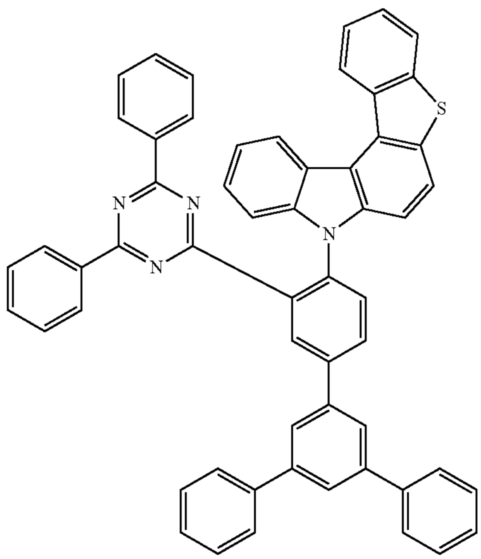
56
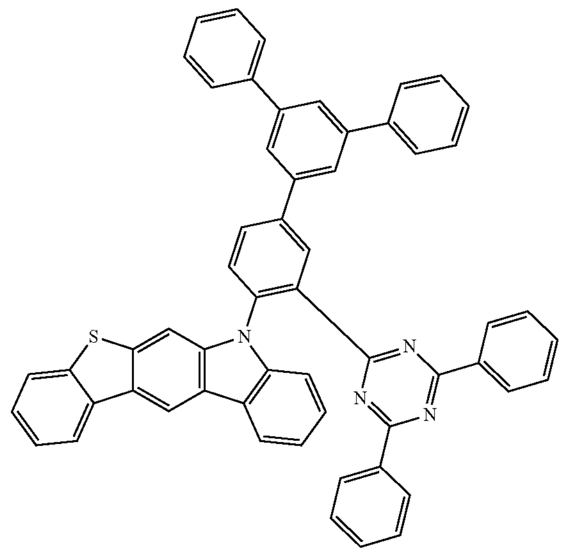
57
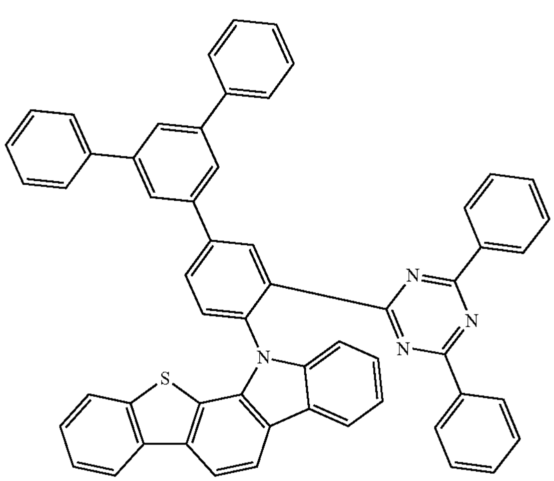
58
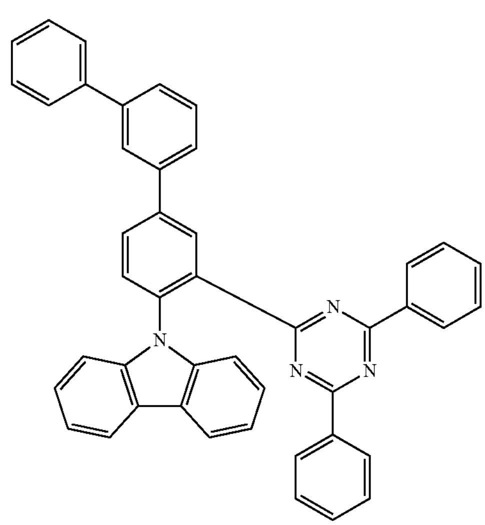

-continued
59
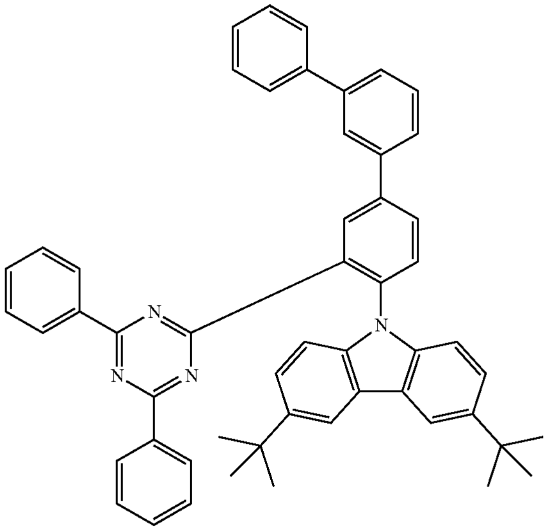
60
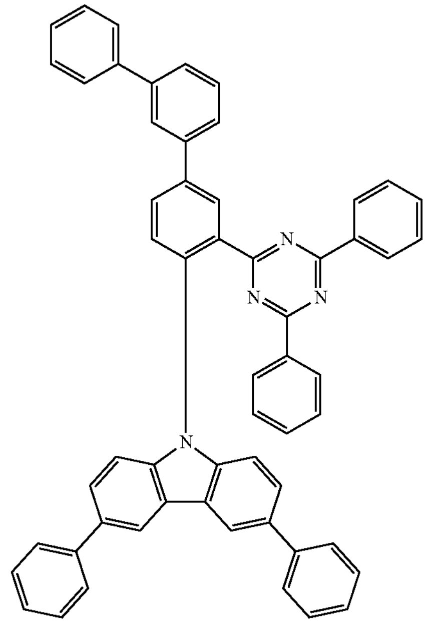
61
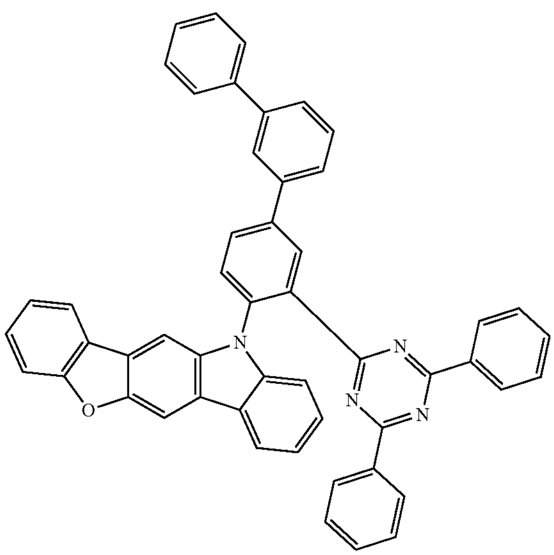
62
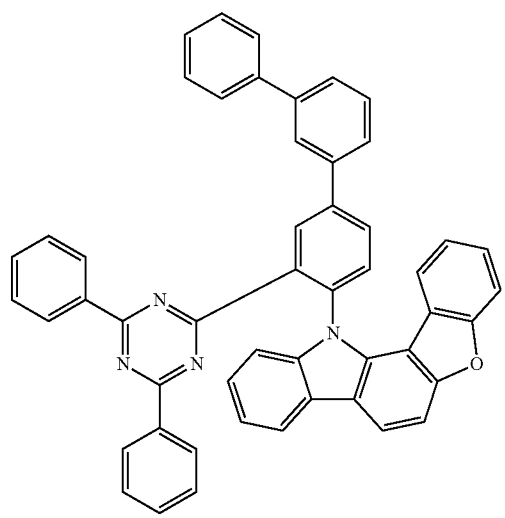
63
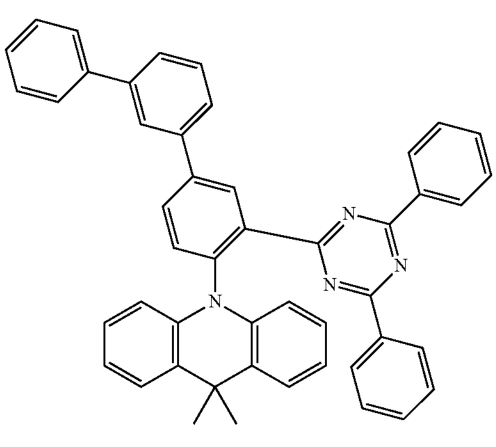
64
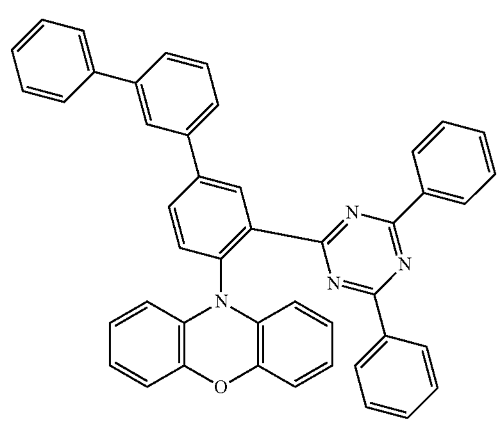

-continued
65
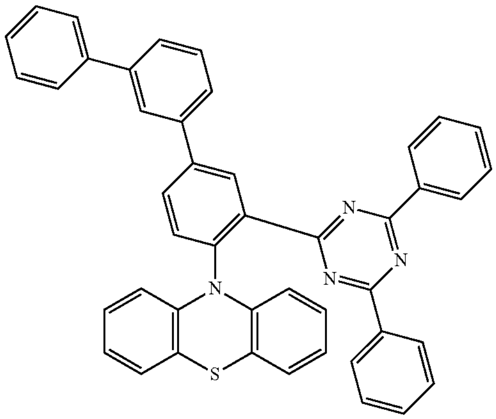
66
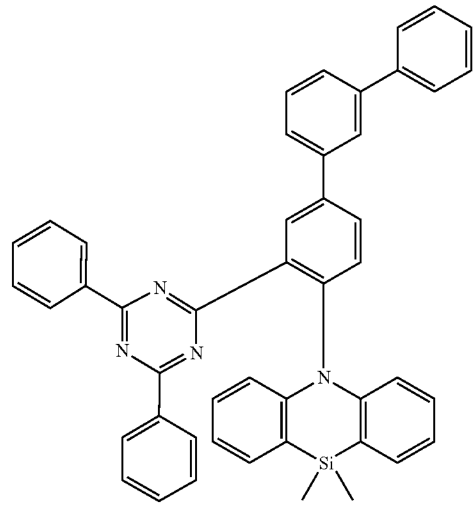
67
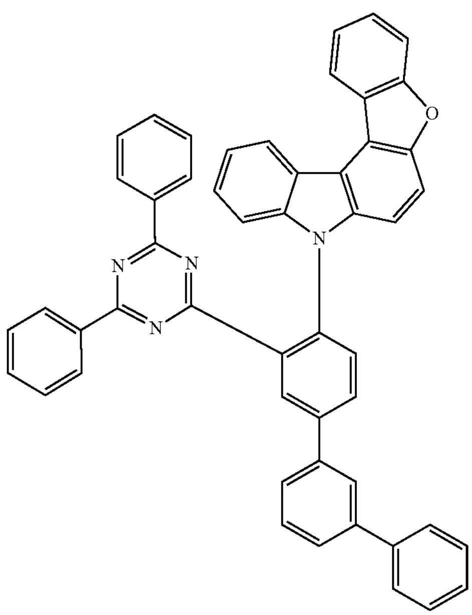
68
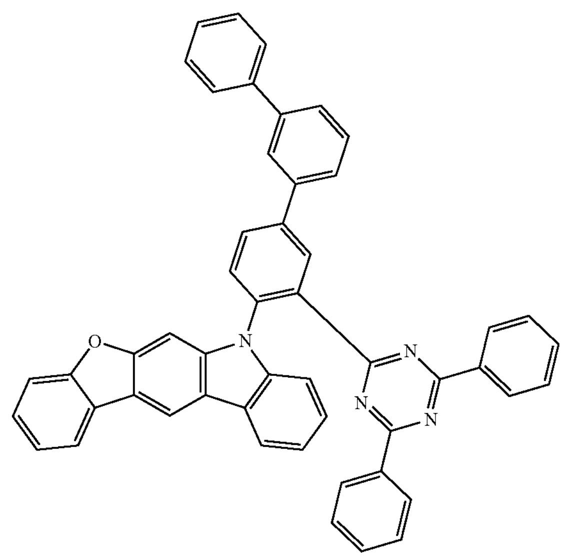
69
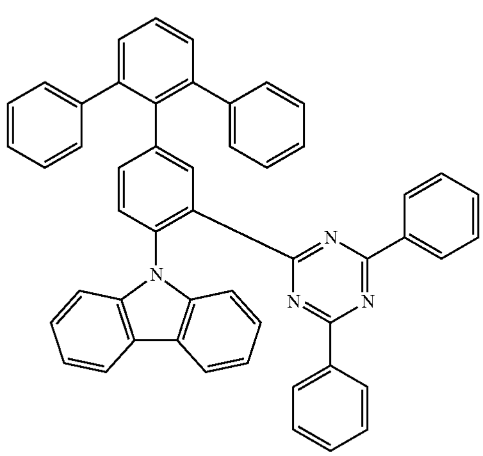
70
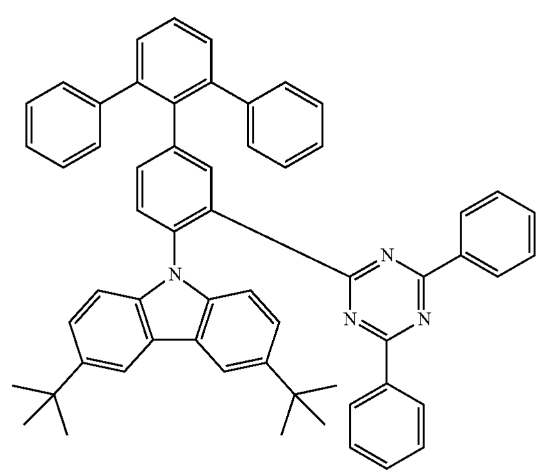

-continued
71
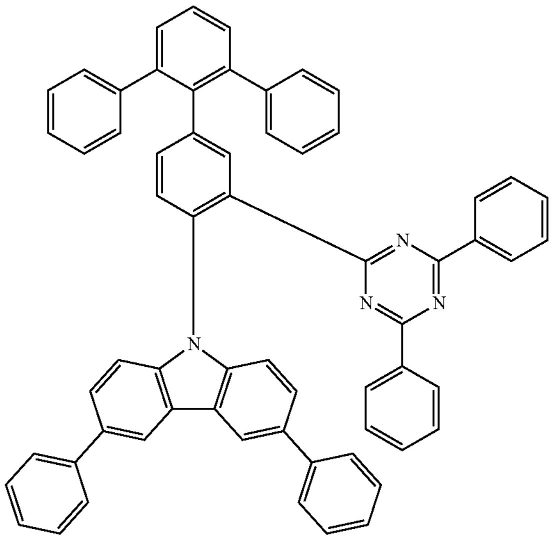
72
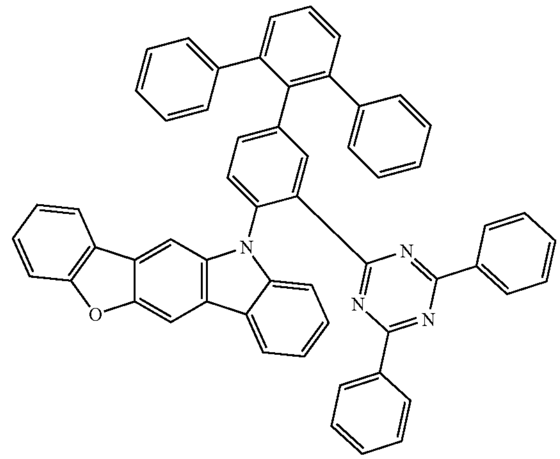
73
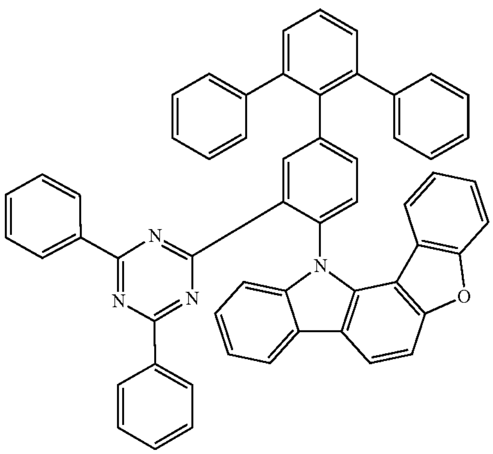
74
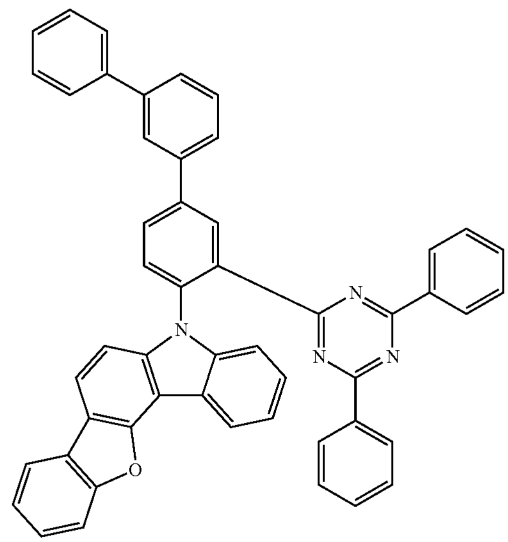
75
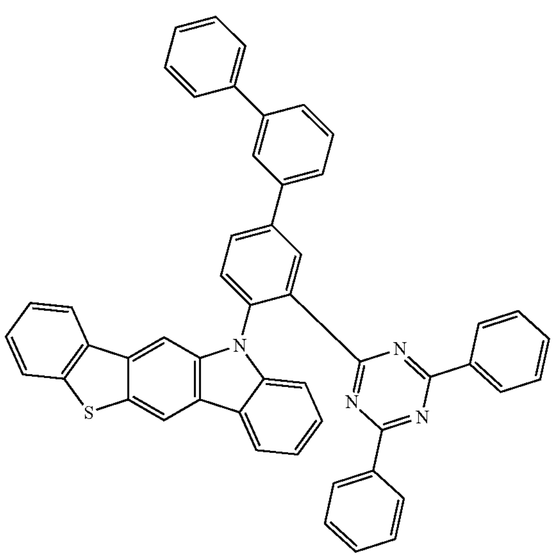
76
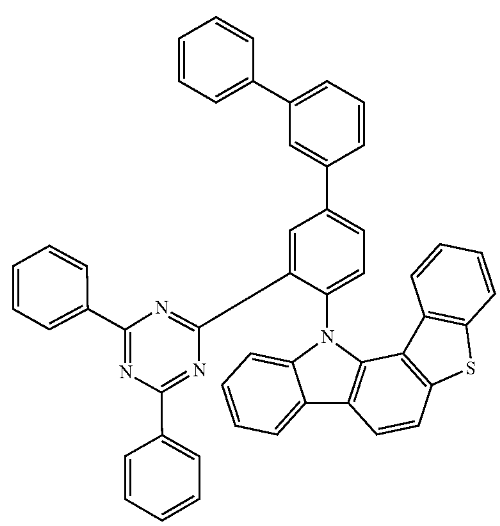

-continued
77
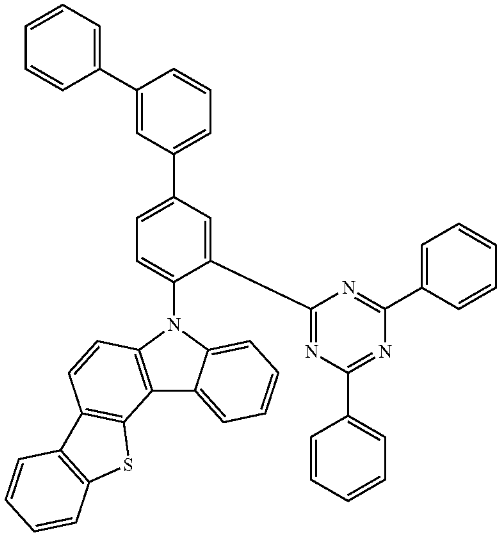
78
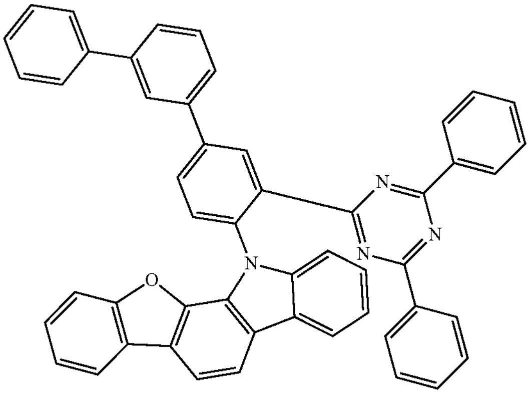
79
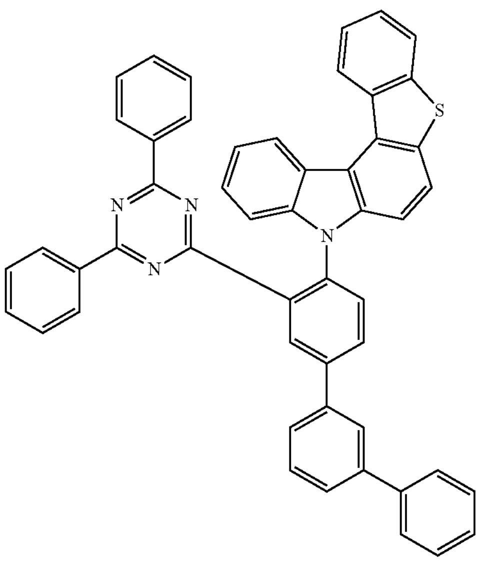
80
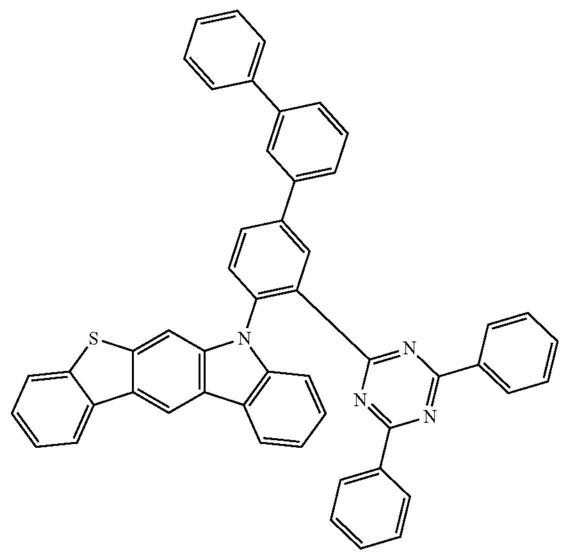
81
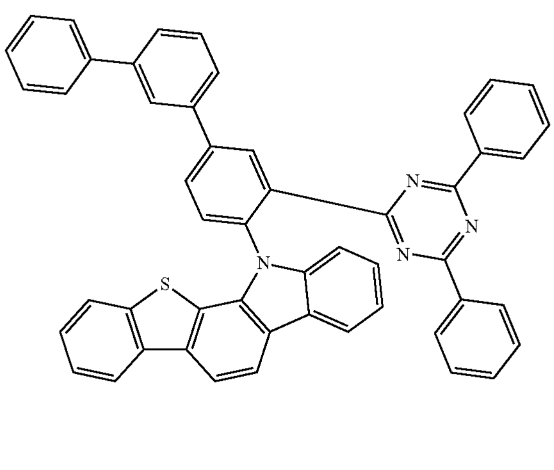
82
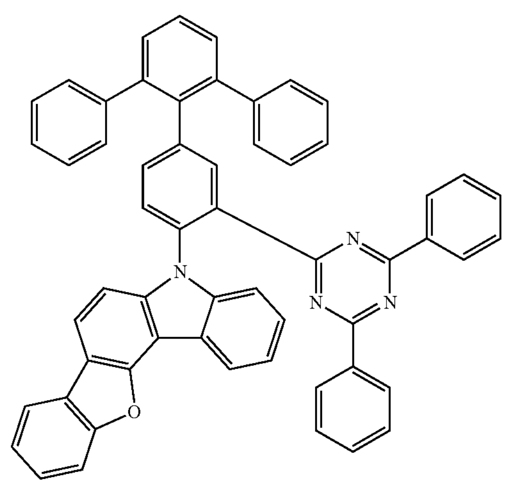

-continued
83
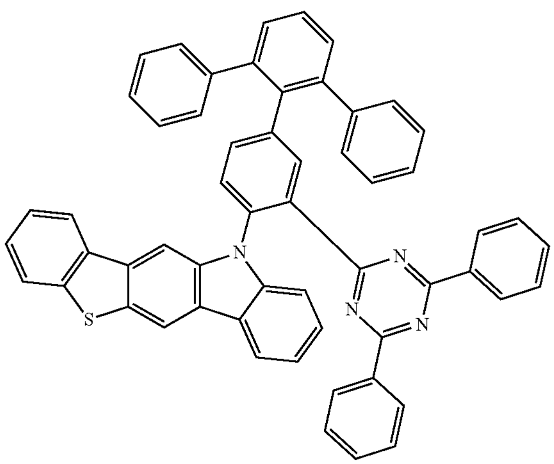
84
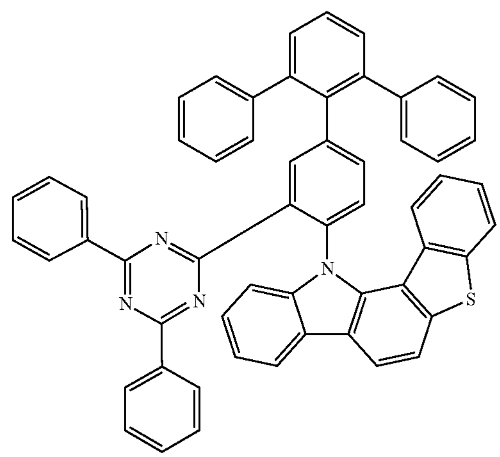
85
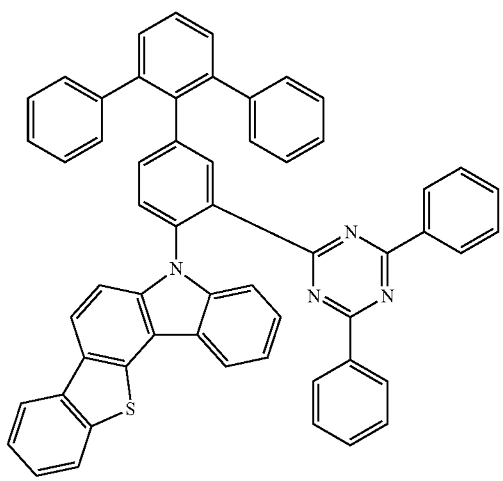
86
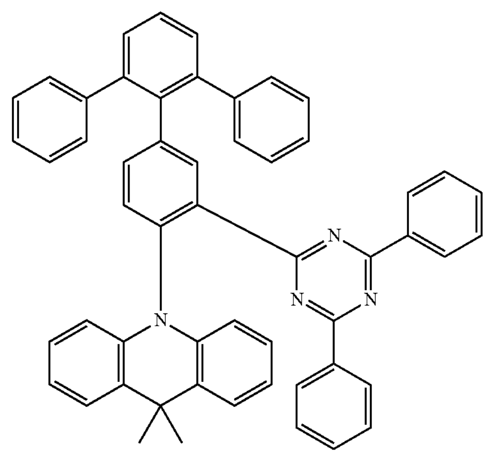
87
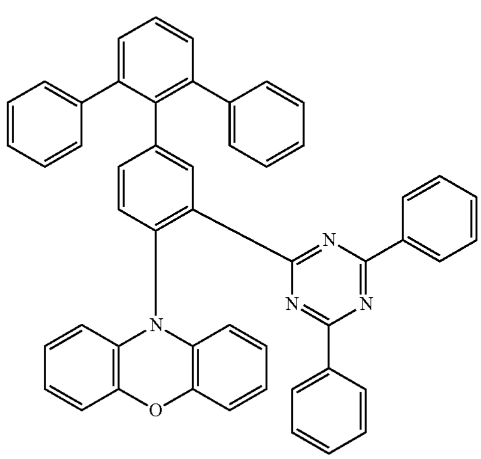
88
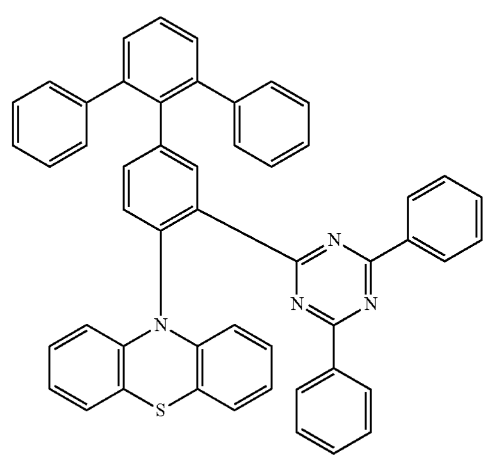

-continued
89
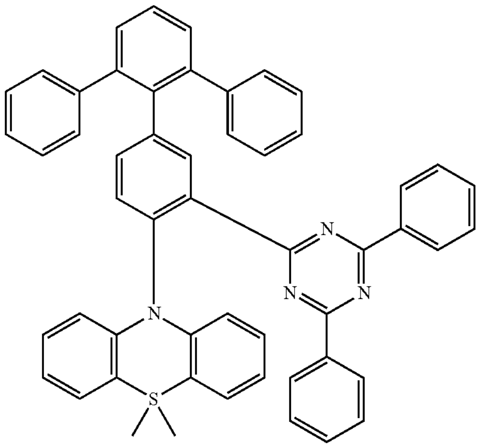
90
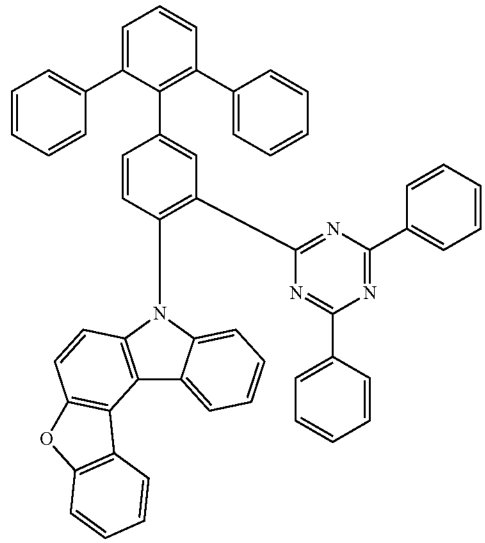
91
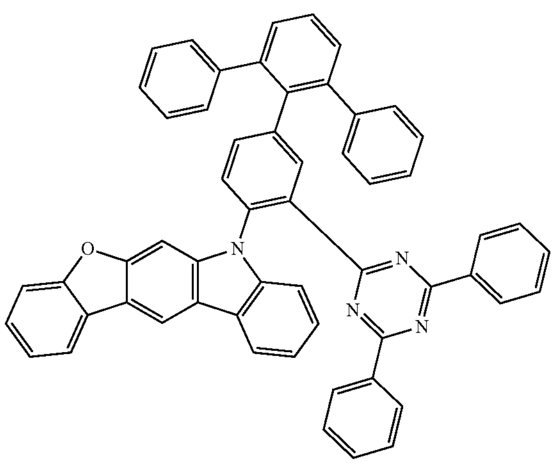
92
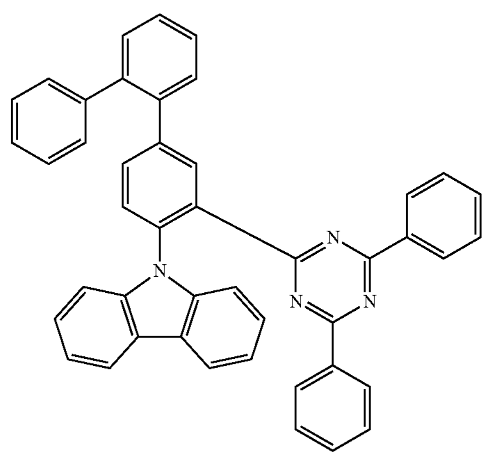
93
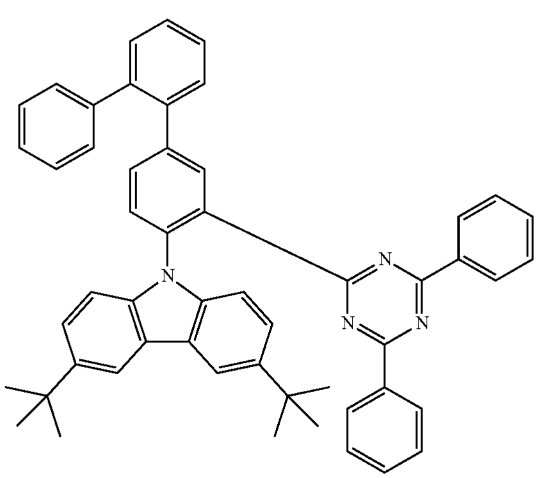
94
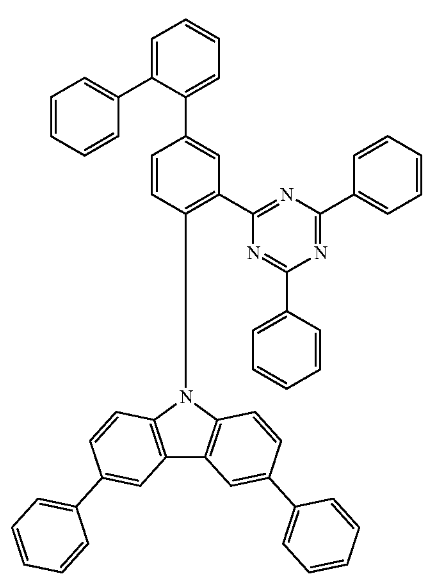

-continued
95
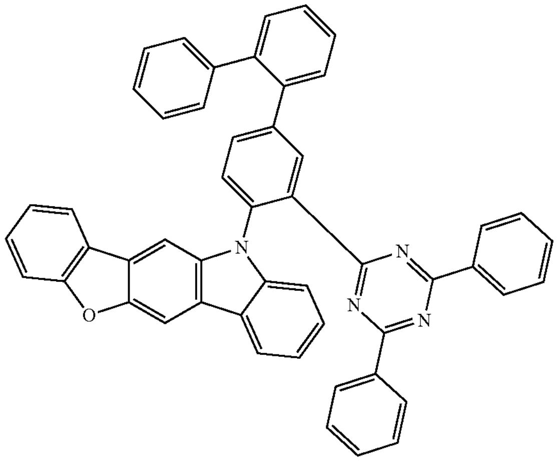
96
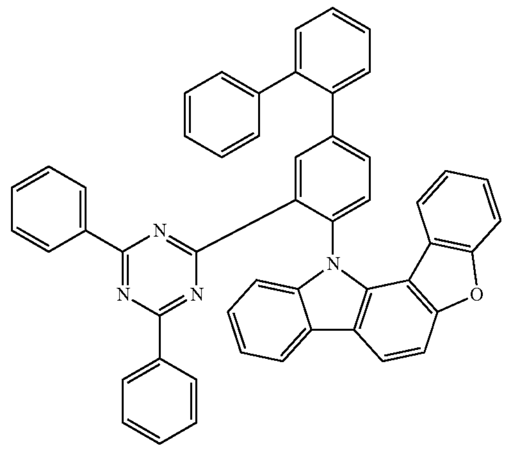
97
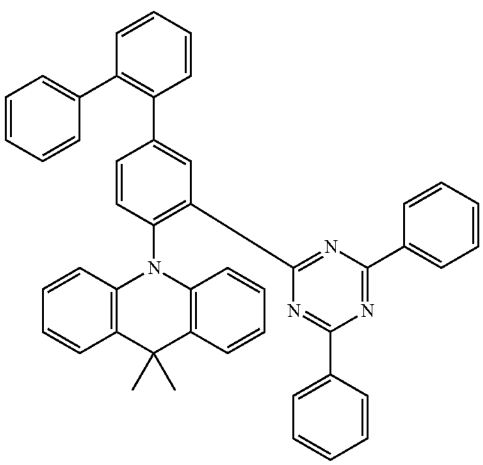
98
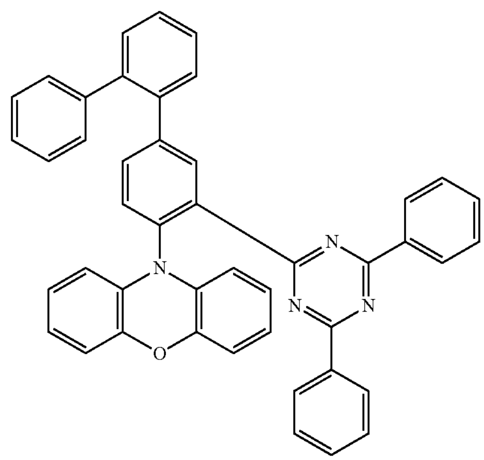
99
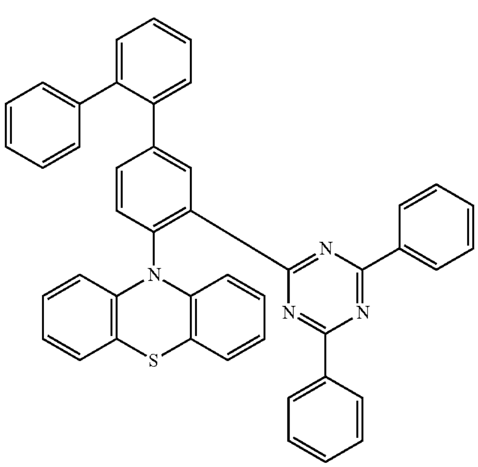
100
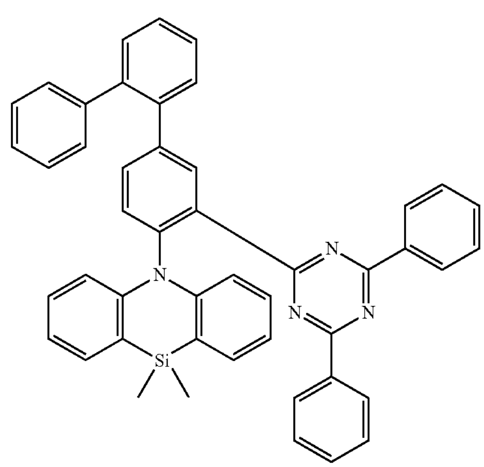

-continued
101
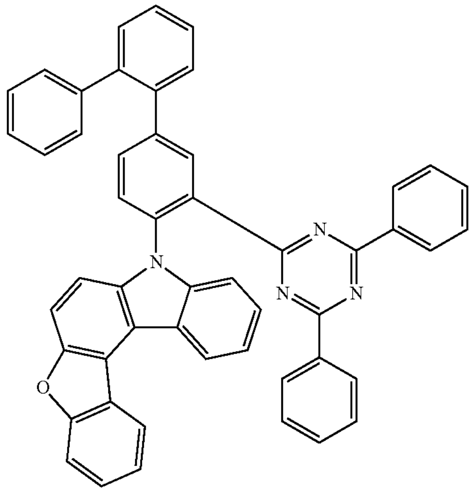
102
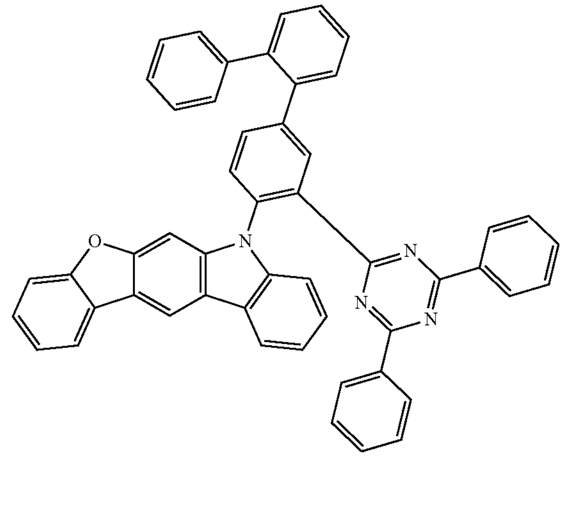
103
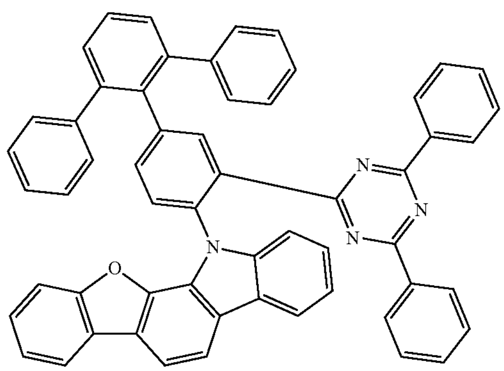
104
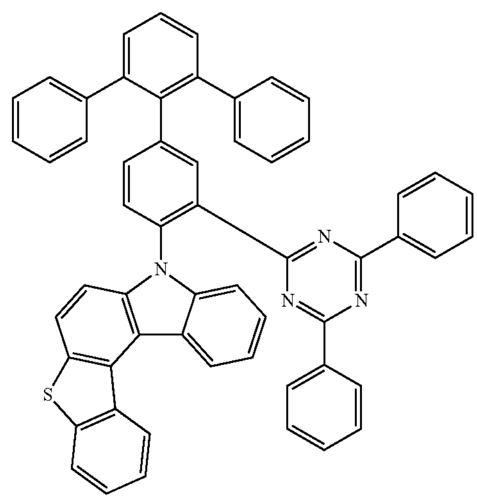
105
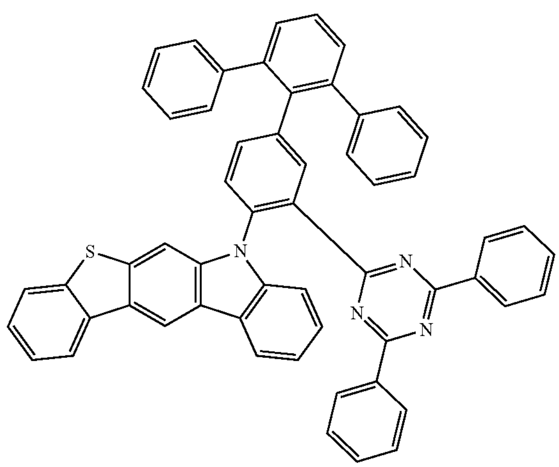
106
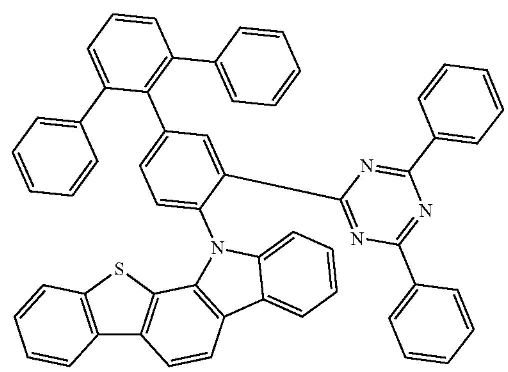

-continued
107
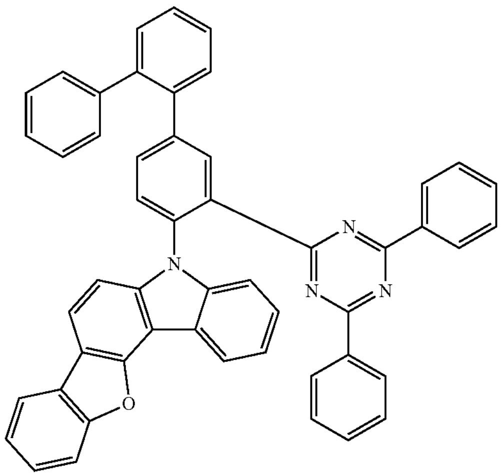
108
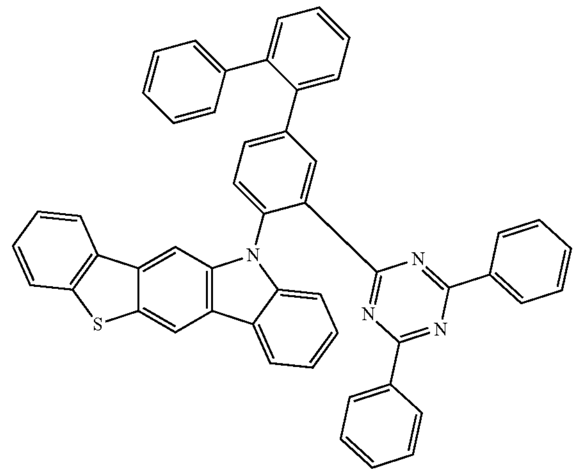
109
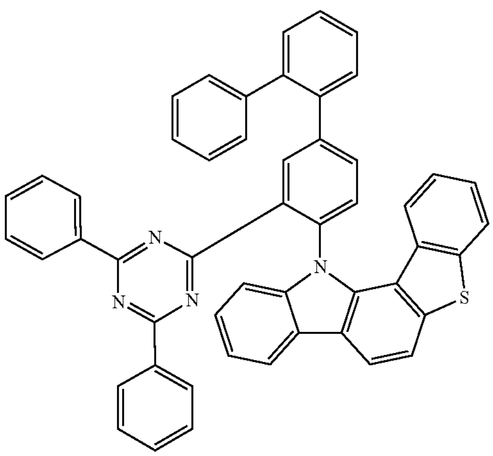
110
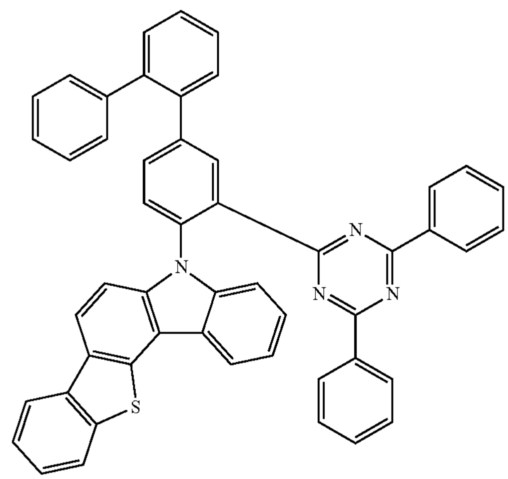
111
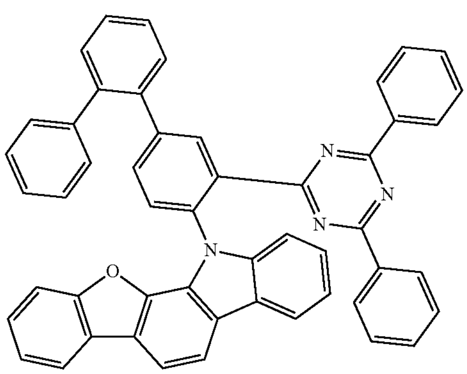
112
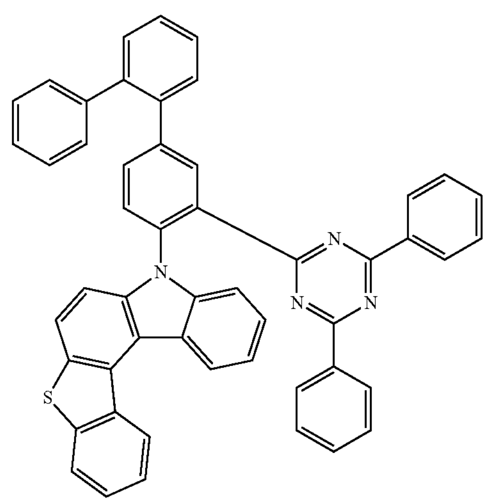

-continued
113
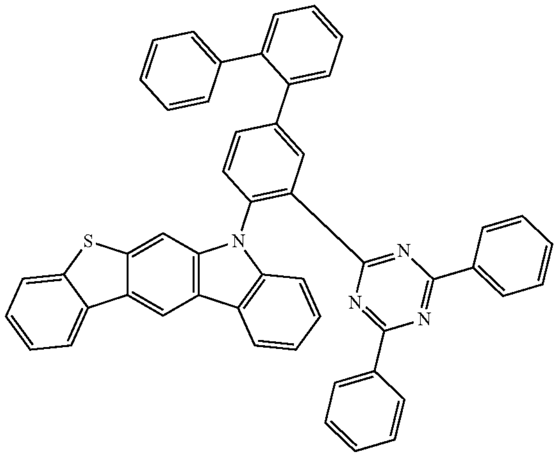
114
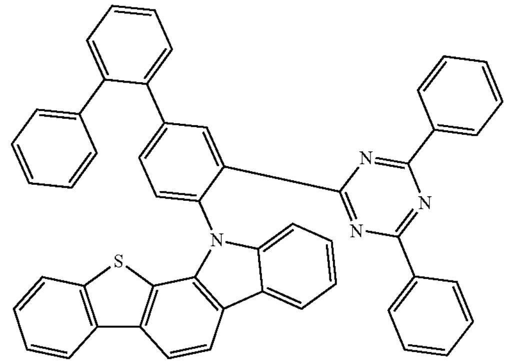
115
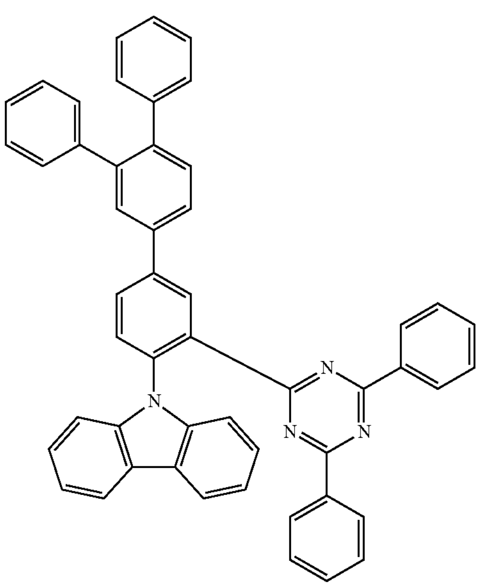
116
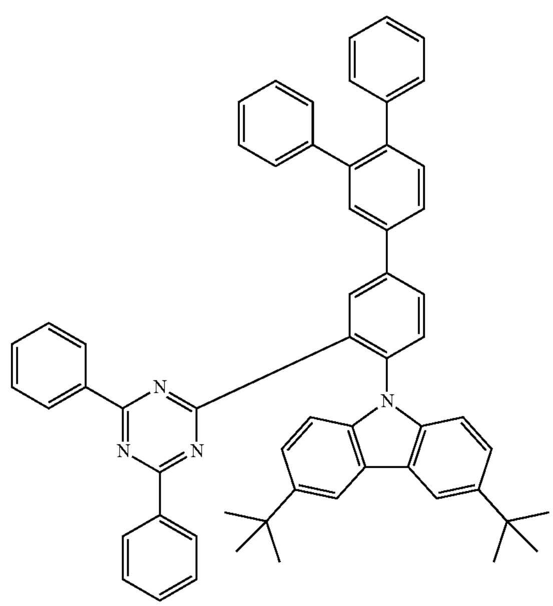

-continued
117
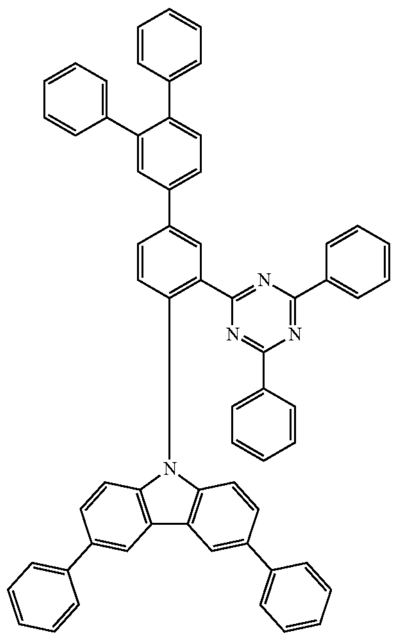
118
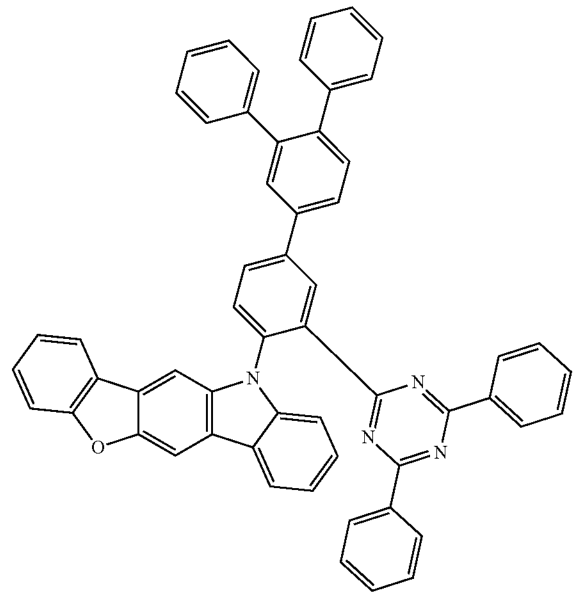
119
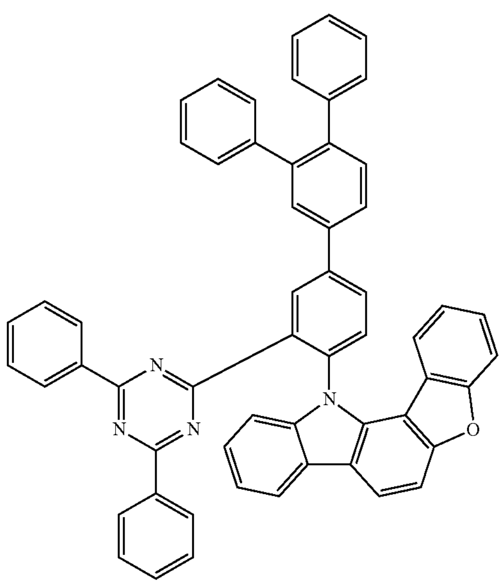
120
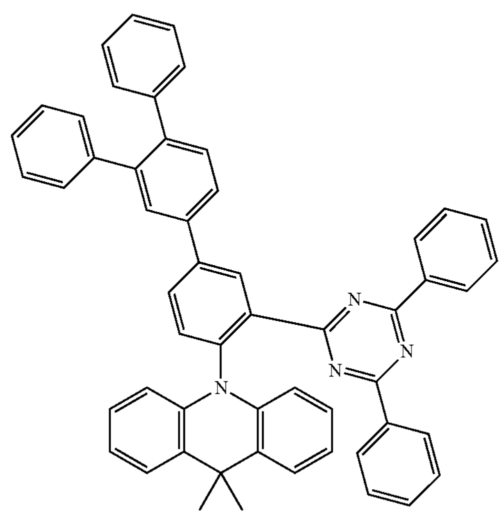

-continued
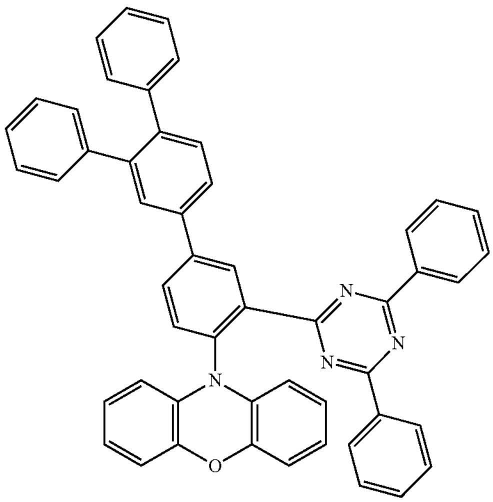
121
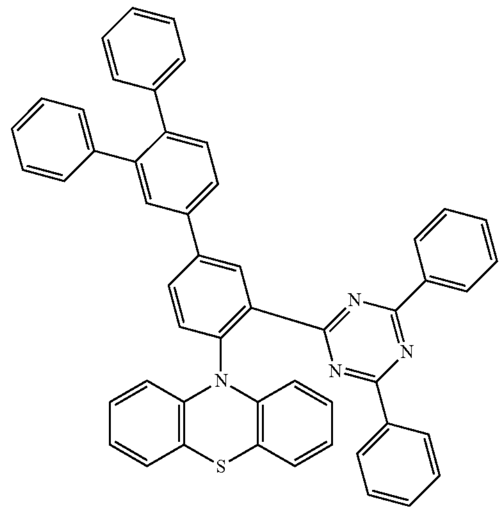
122
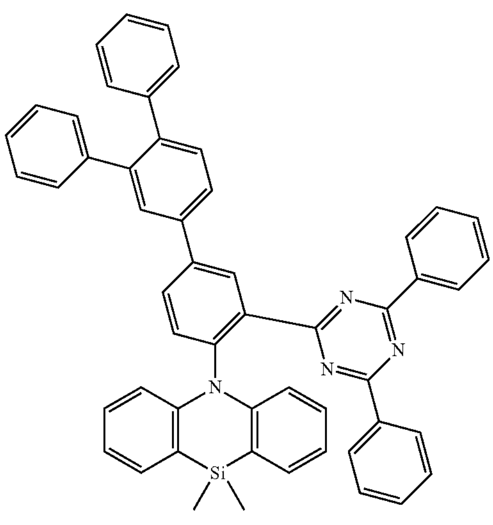
123
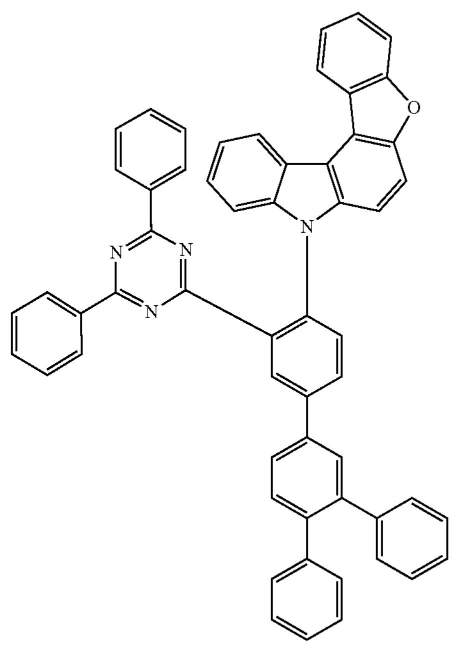
124

-continued
125
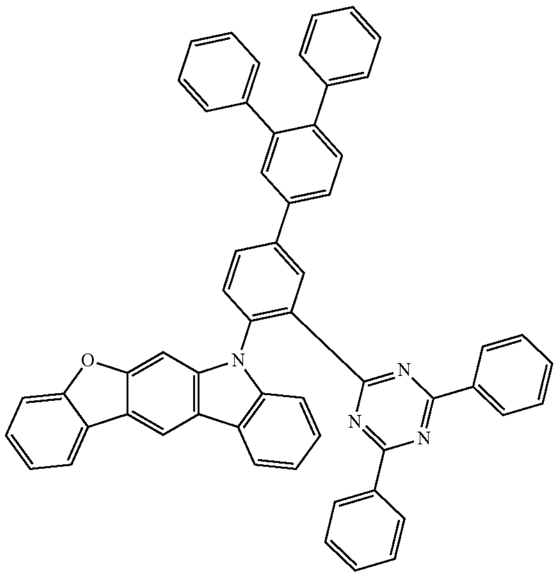
126
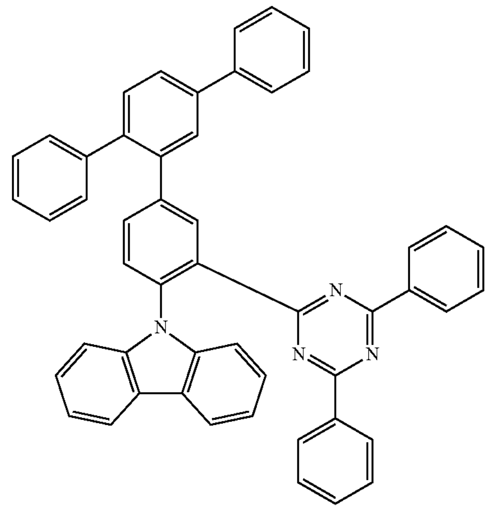
127
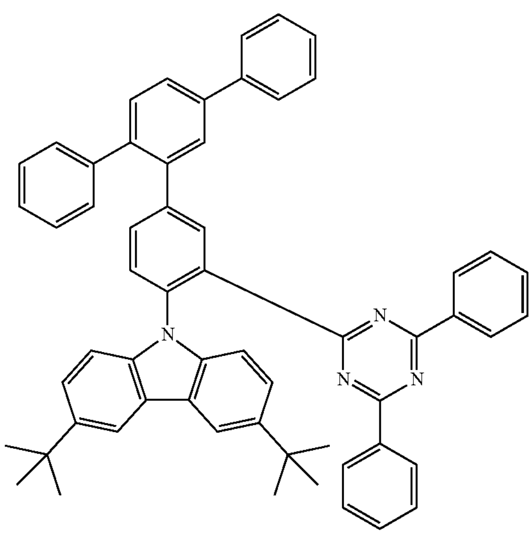
128
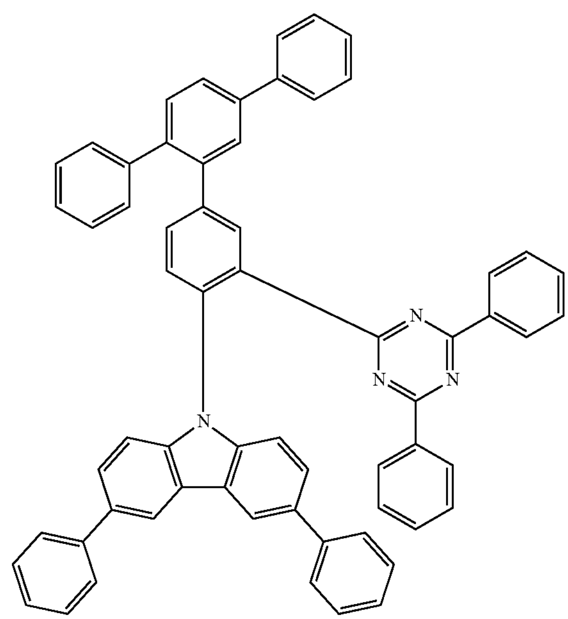

-continued
129
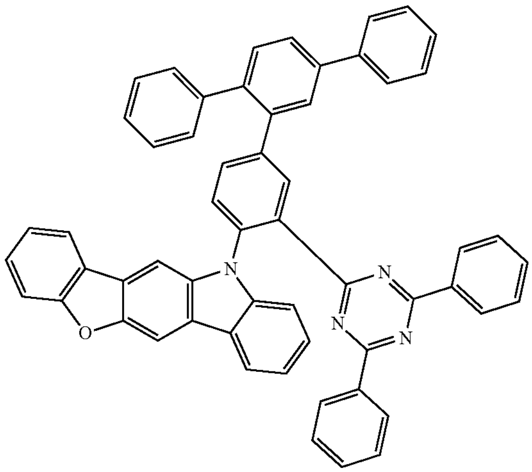
130
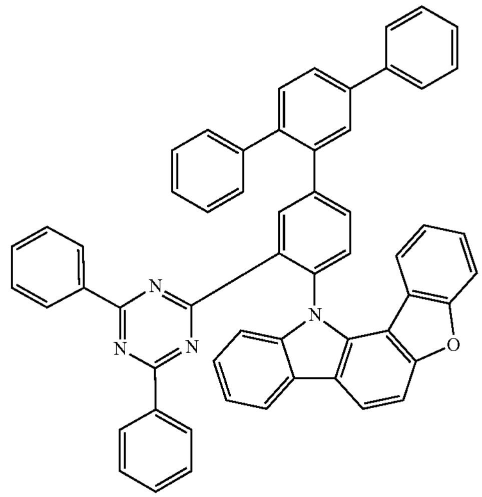
131
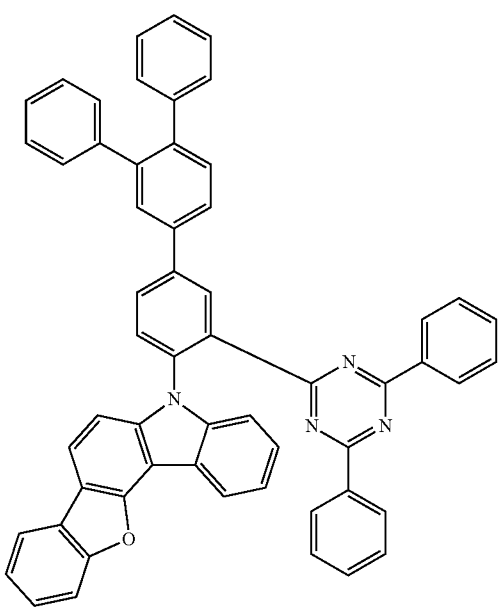
132
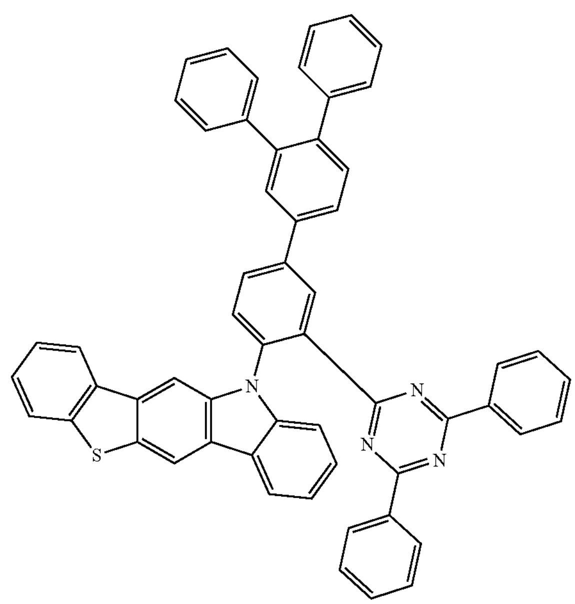

-continued
133
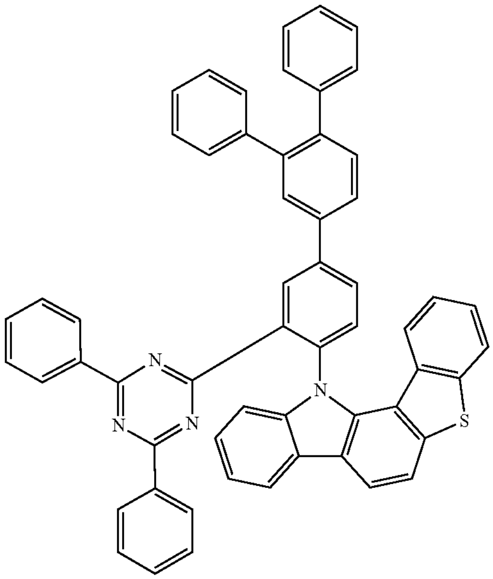
134
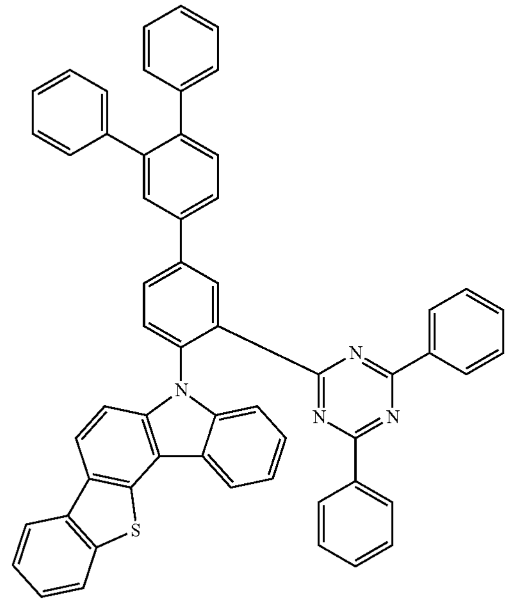
135
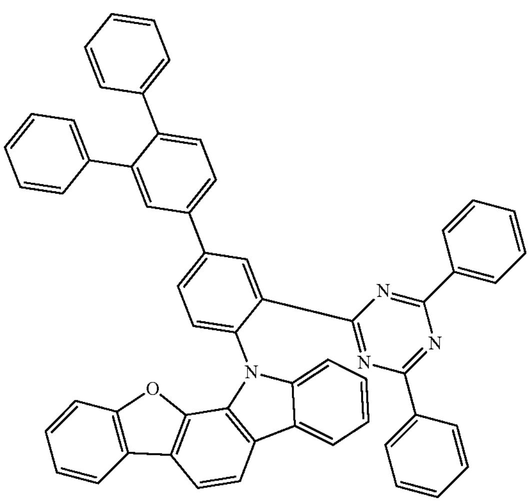
136
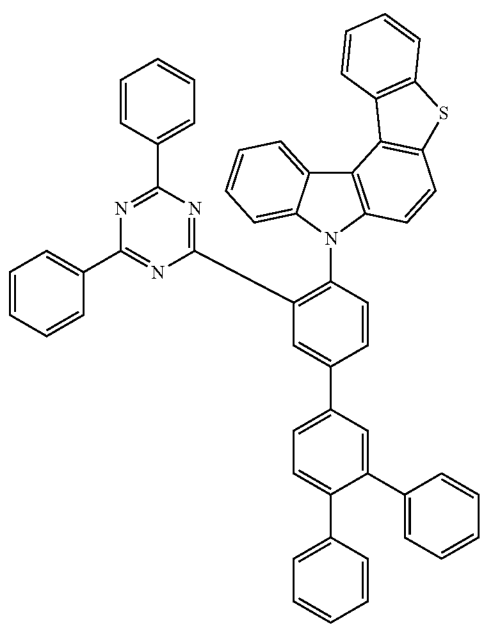

-continued
137
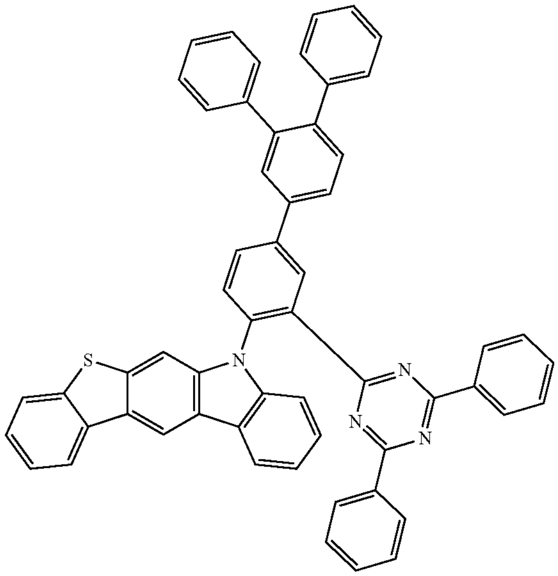
138
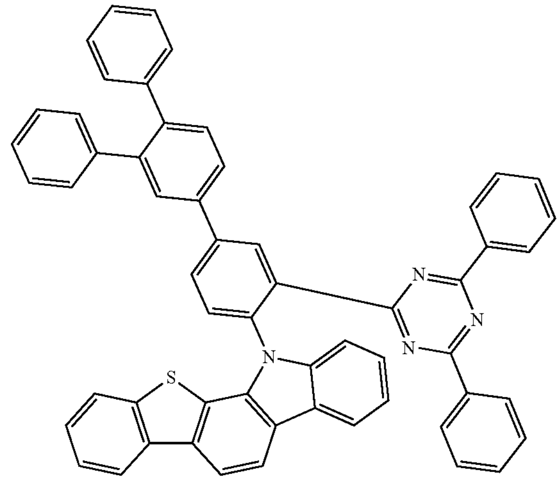
139
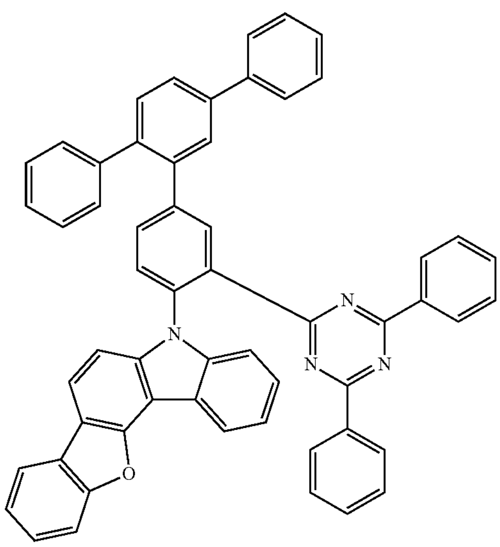
140
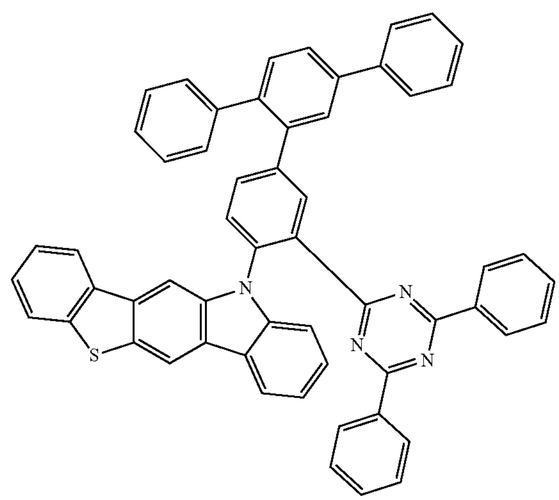

-continued
141
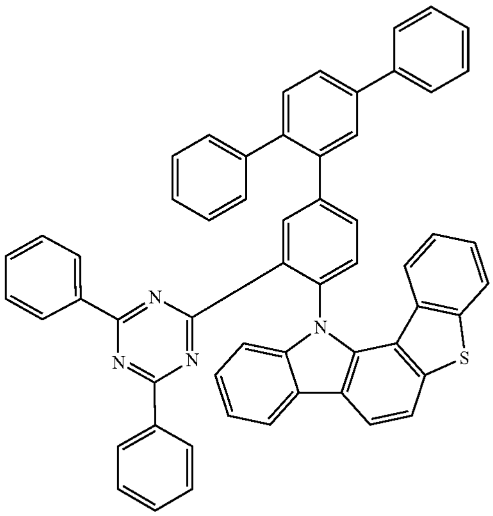
142
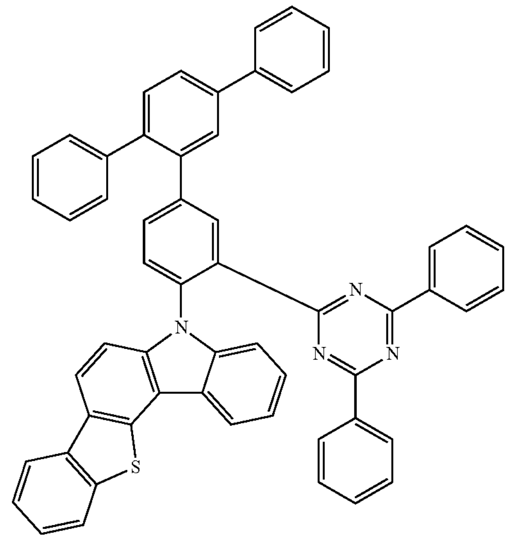
143
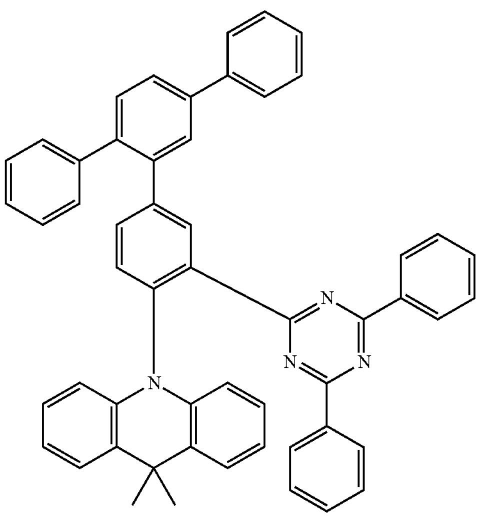
144
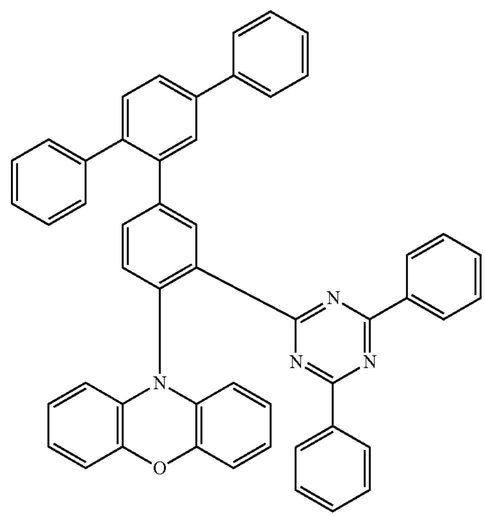
145
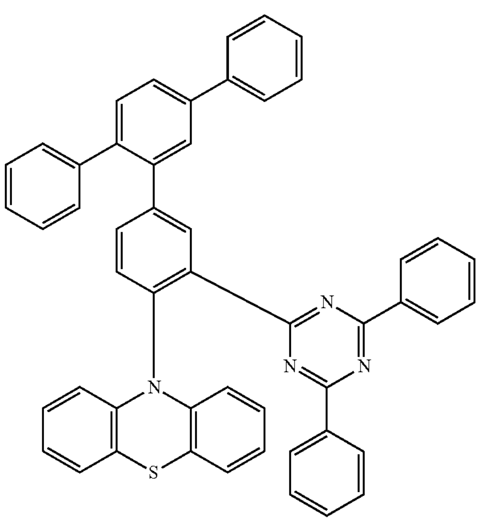
146
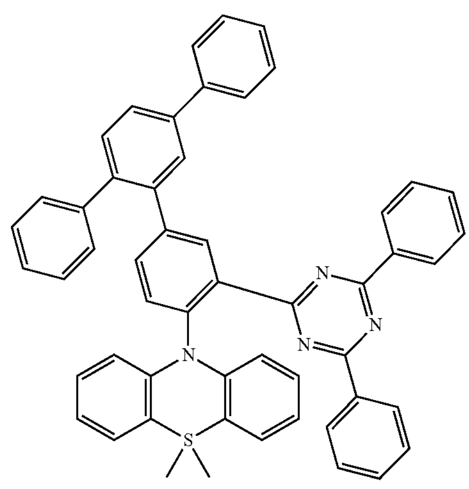

-continued
147
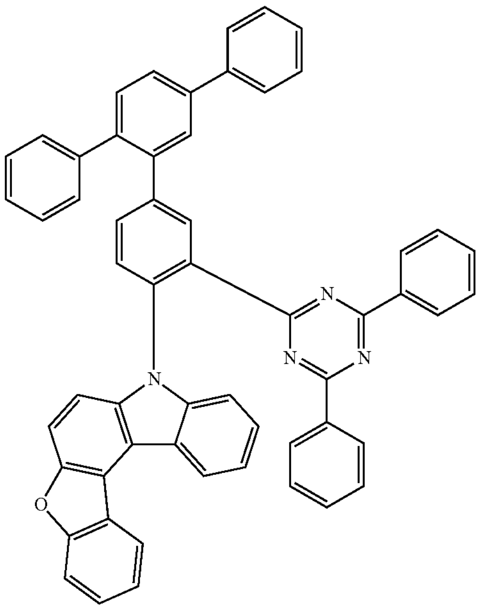
148
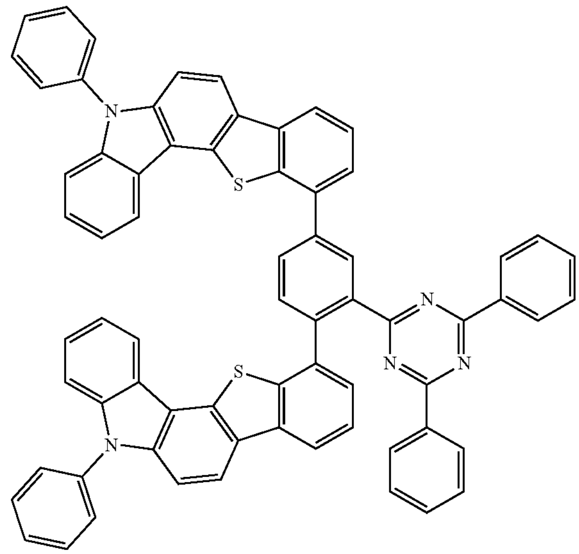
149
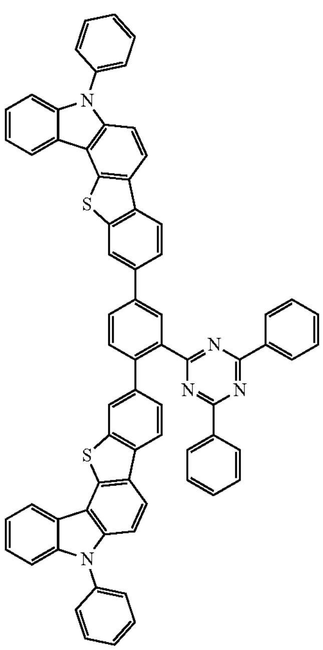
150
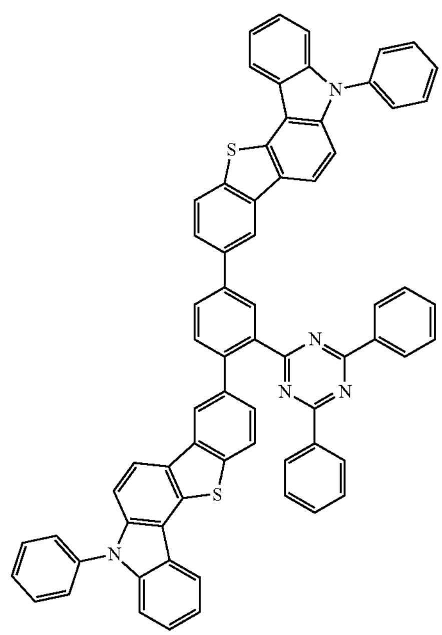

-continued
151
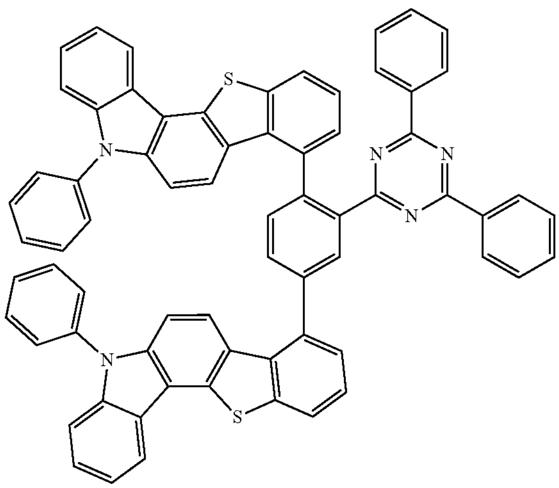
152
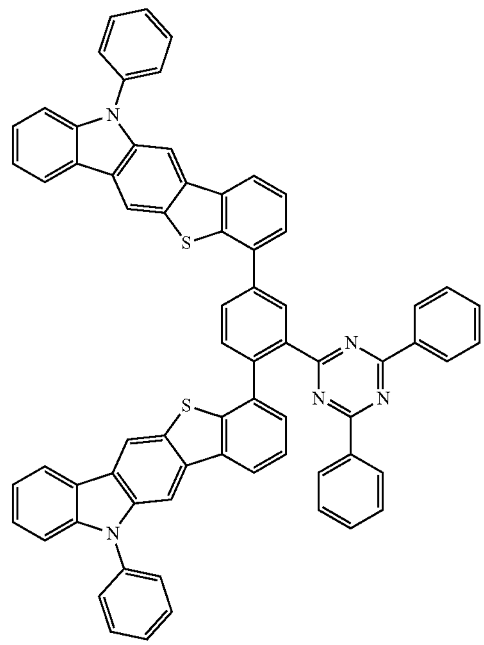
153
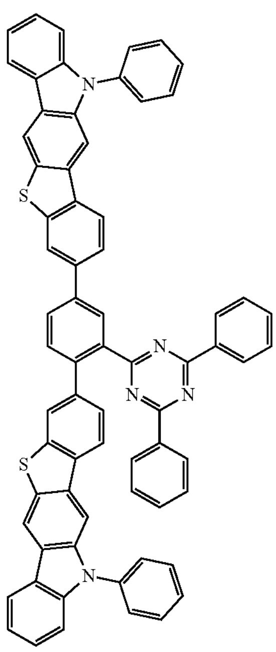
154
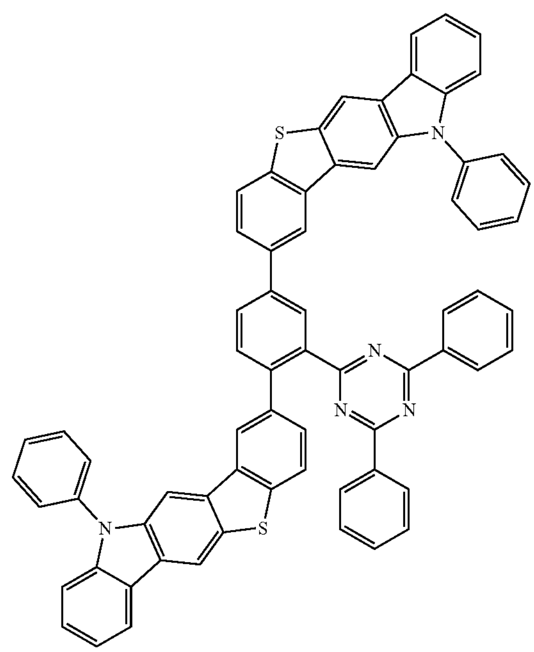

-continued
155
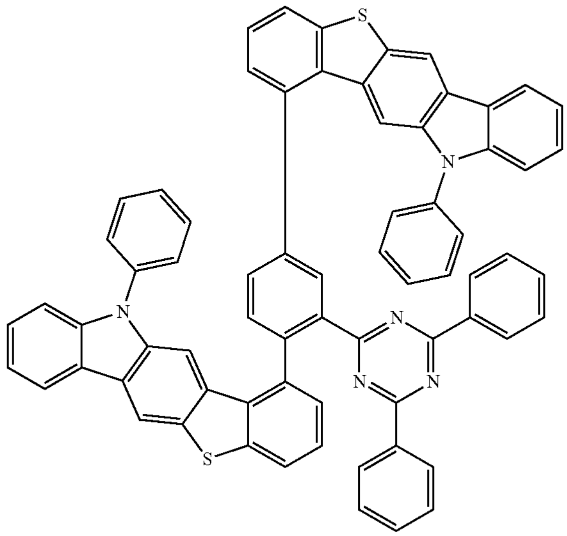
156
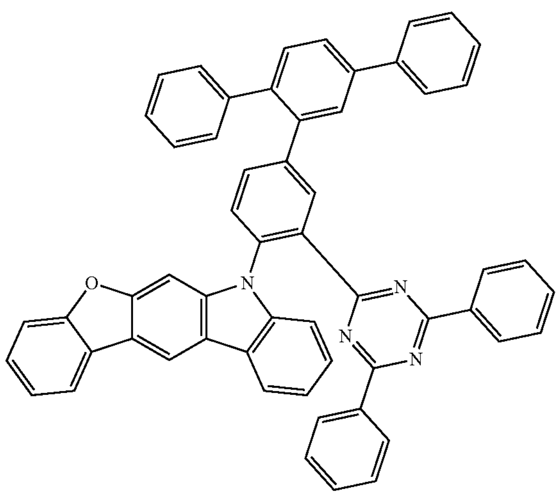
157
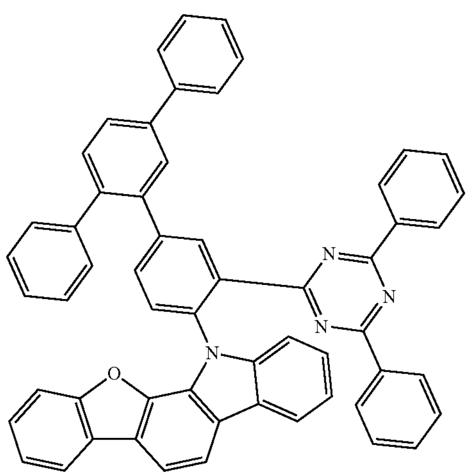
-continued
158
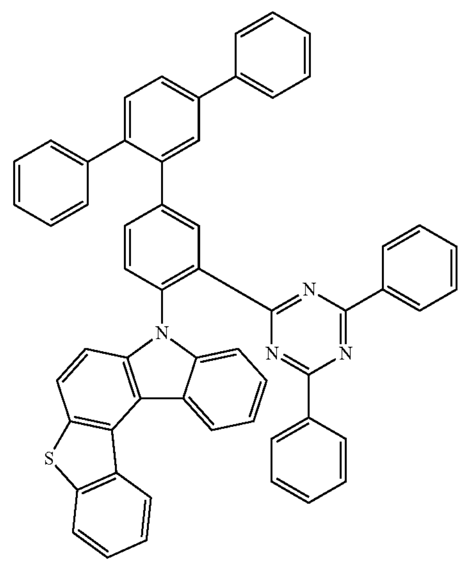
159
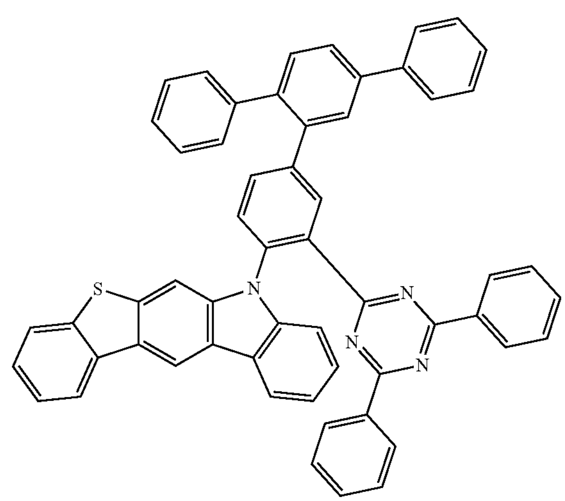

-continued
160
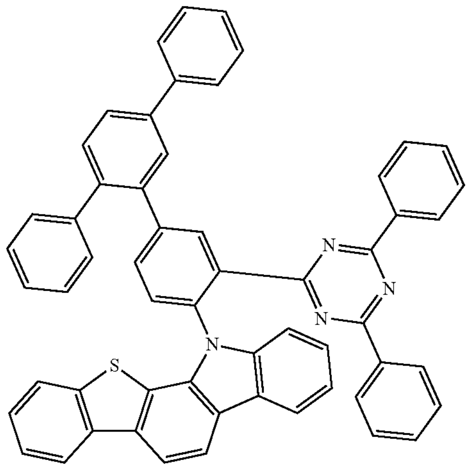
161
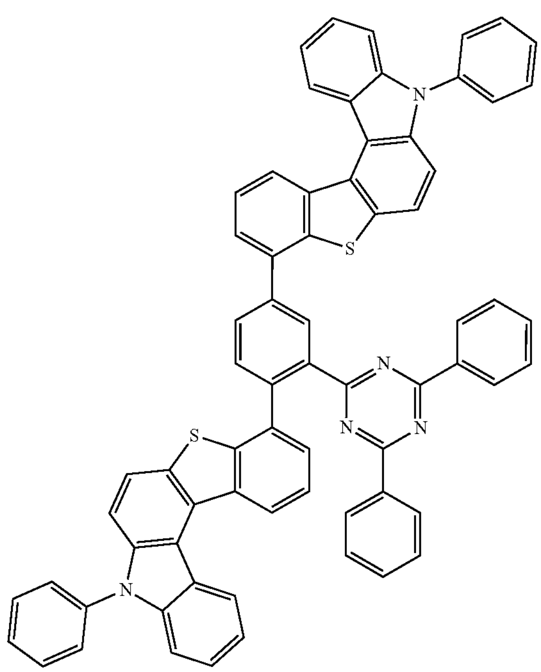
-continued
162
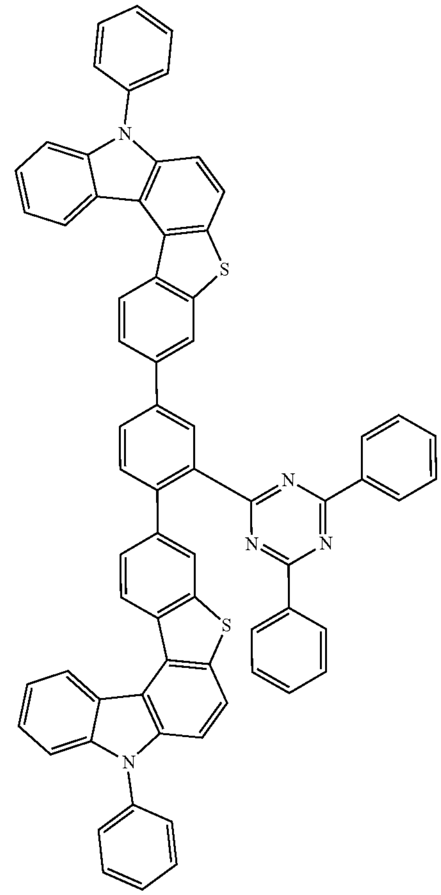
163
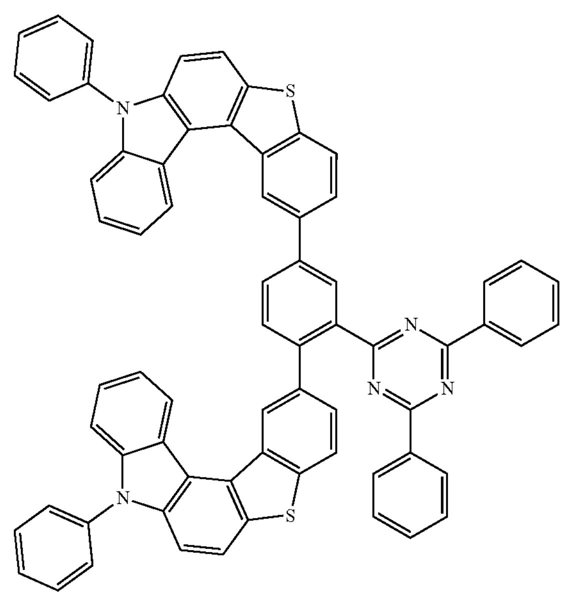

-continued
164
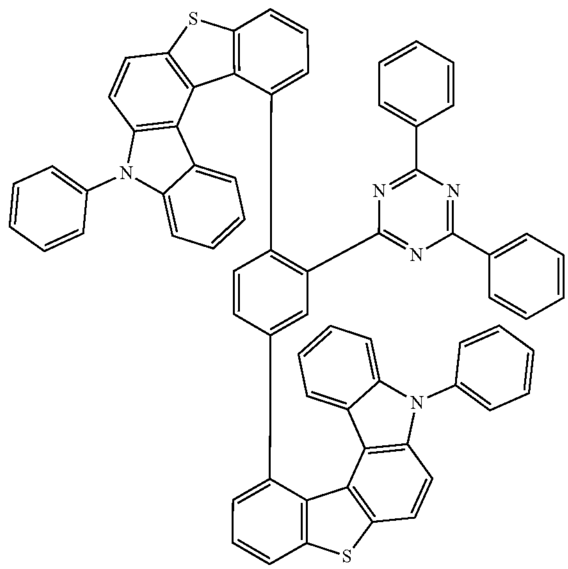
165
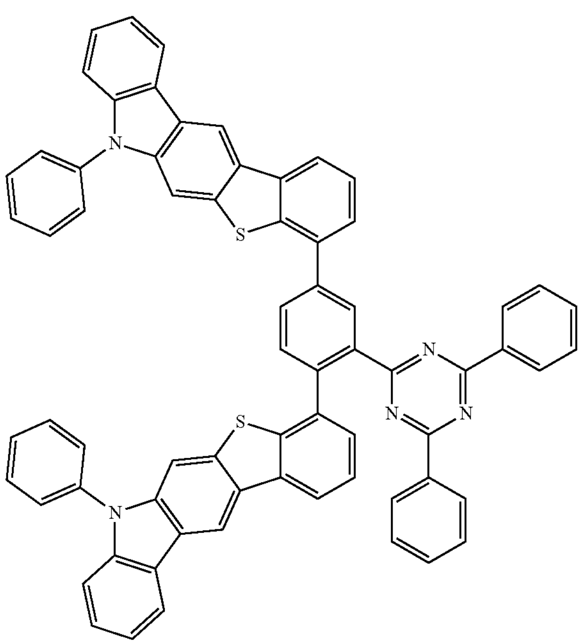
-continued
166
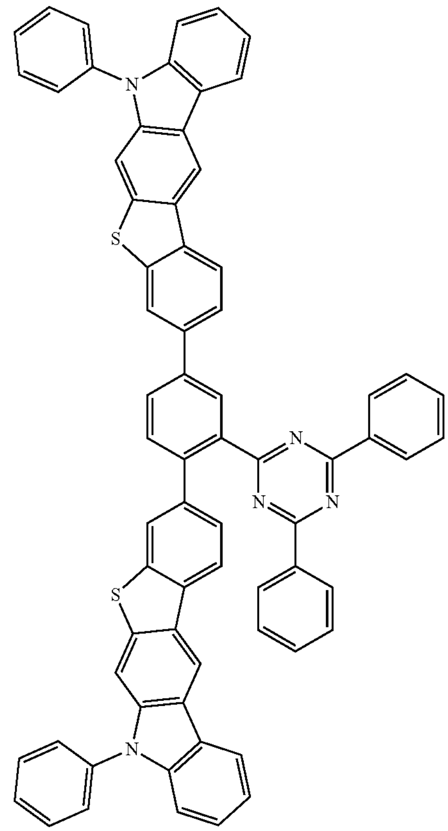
167
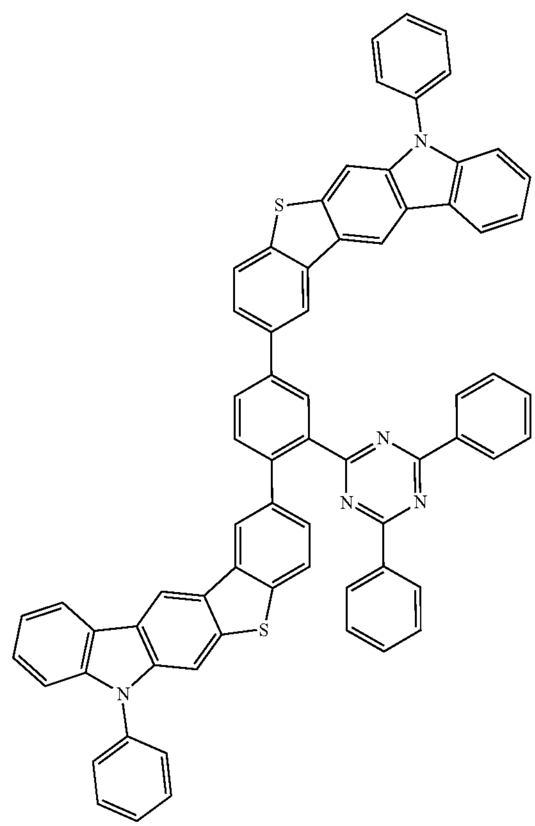

-continued
168
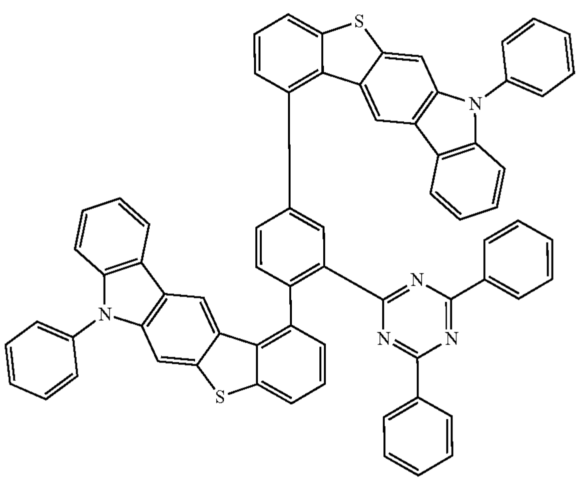
169
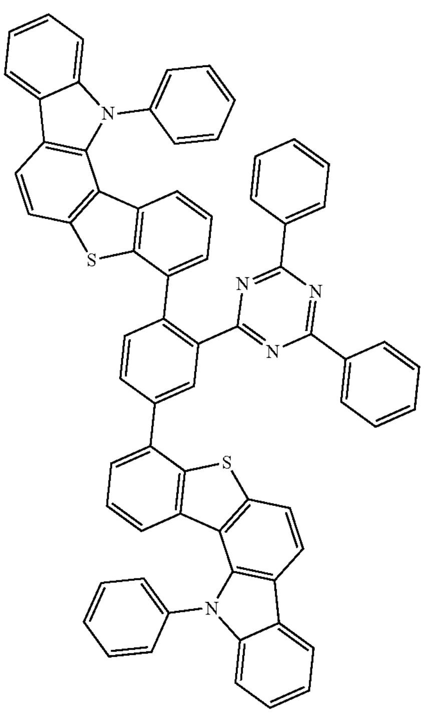
-continued
170
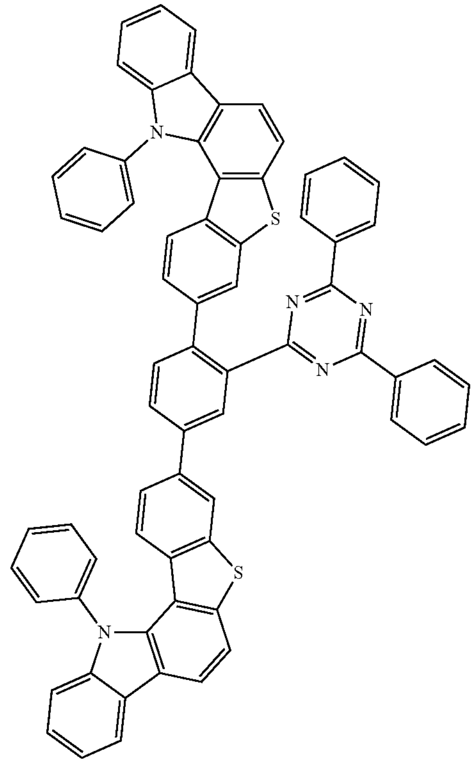
171
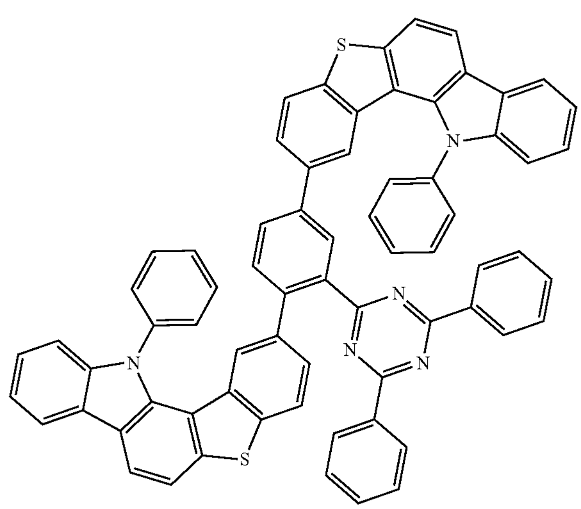

172
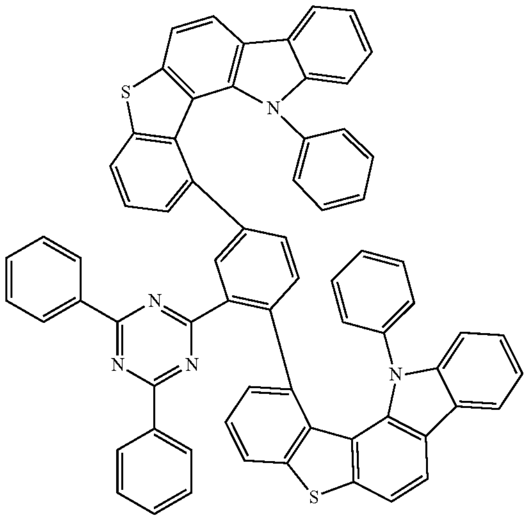
173
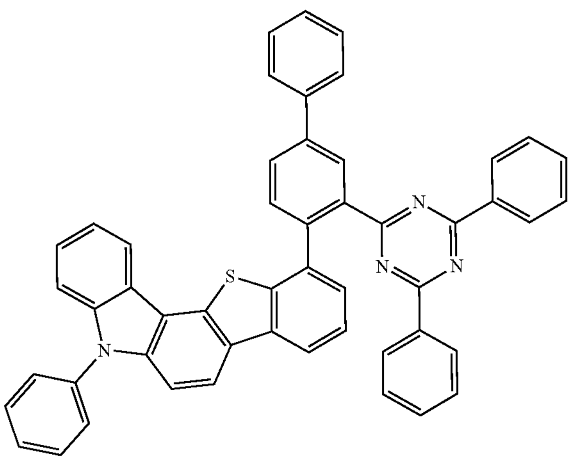
174
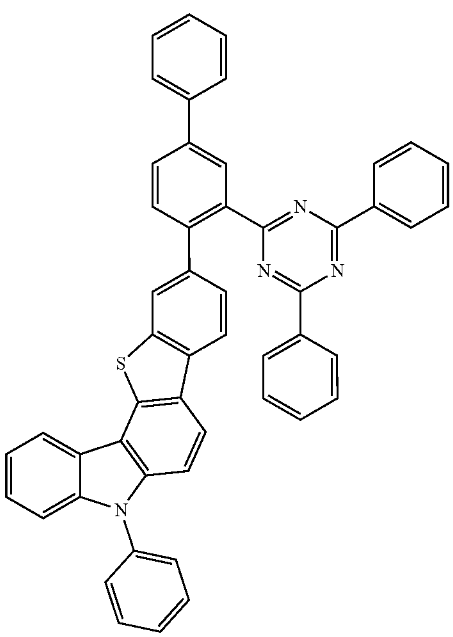
175
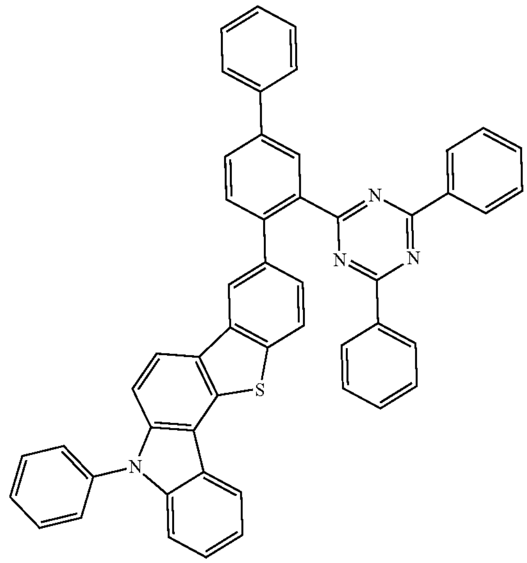
176
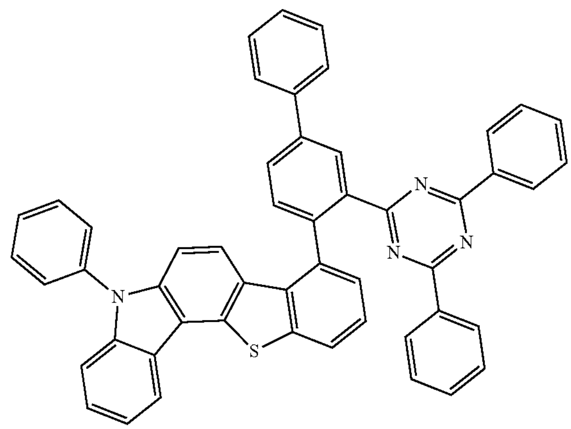
177
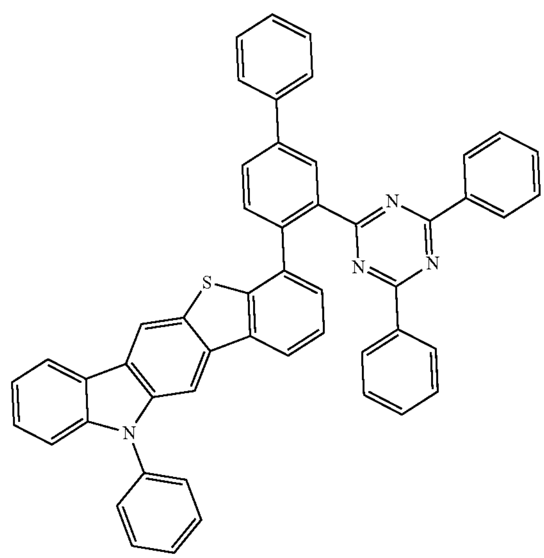

-continued
178
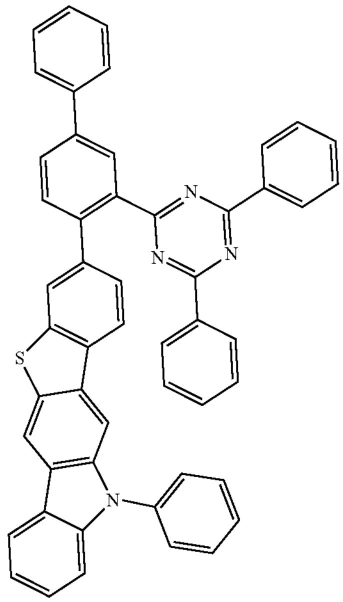
179
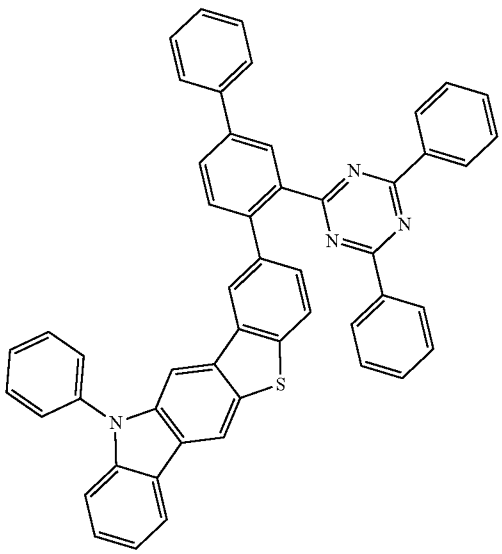
180
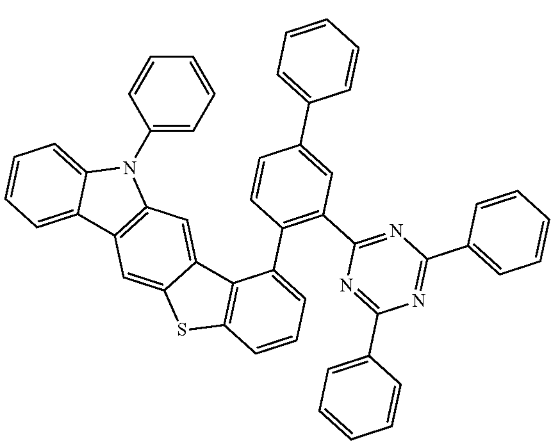
-continued
181
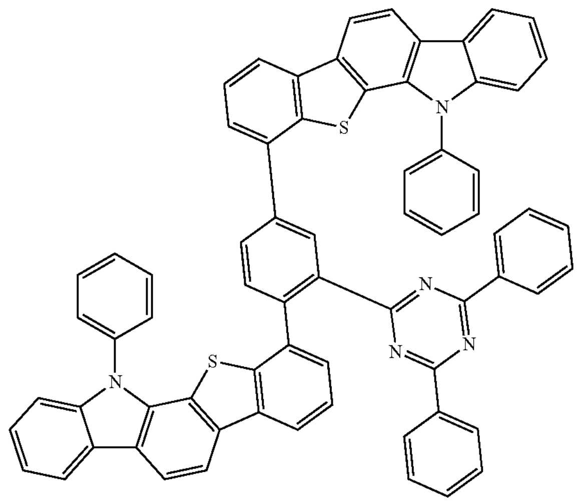
182
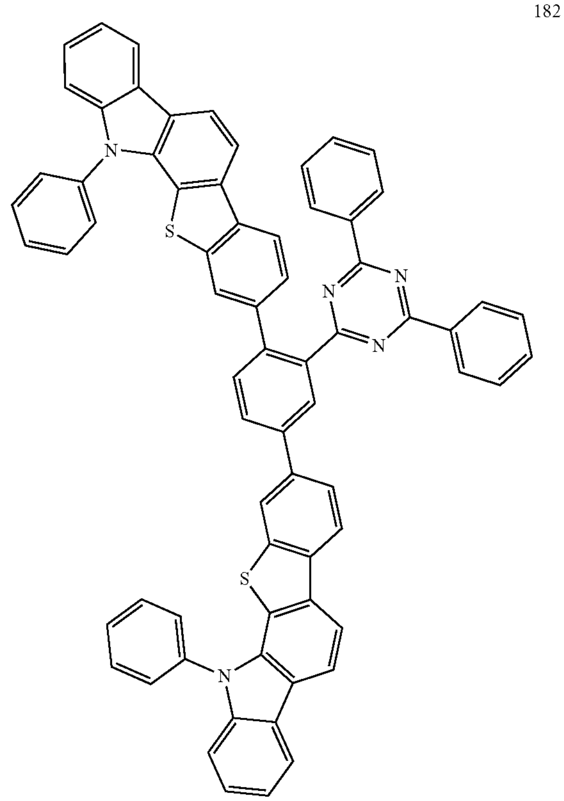

-continued
183
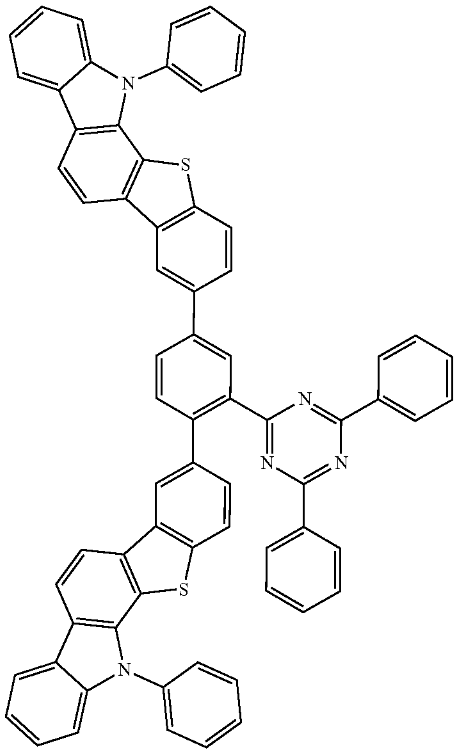
184
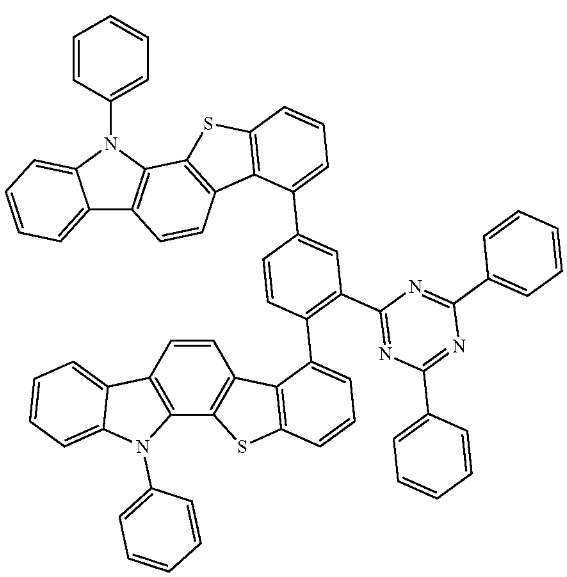
-continued
185
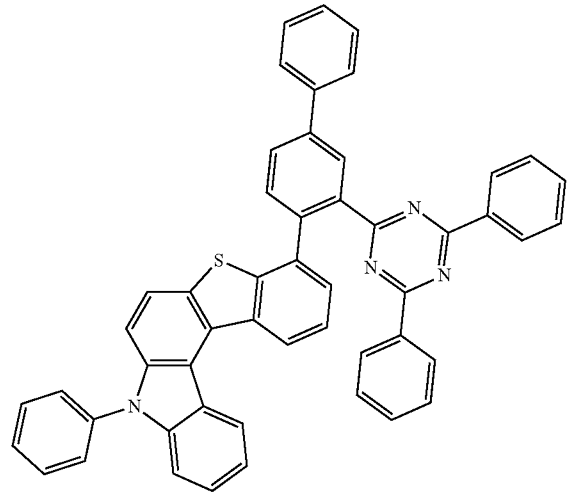
186
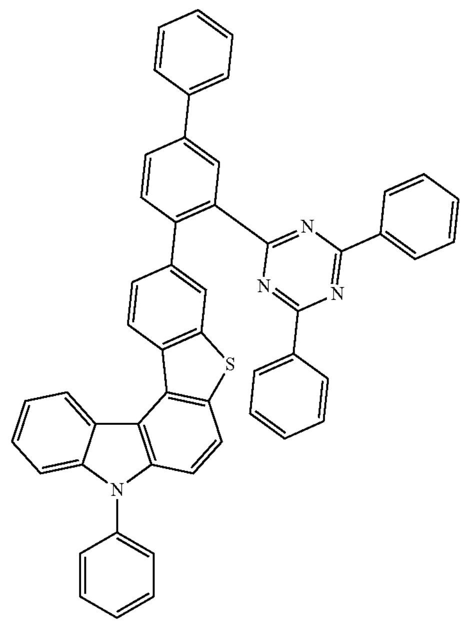
187
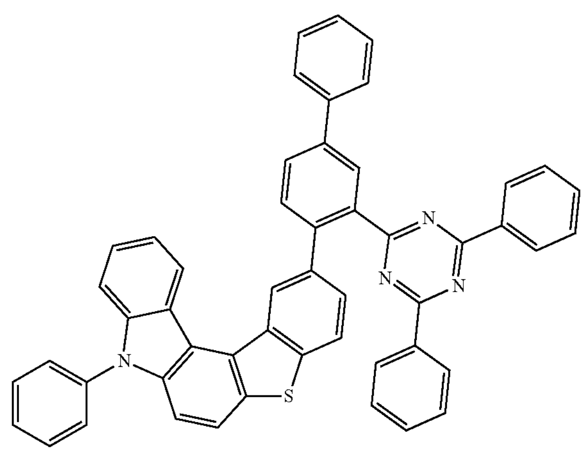

-continued
188
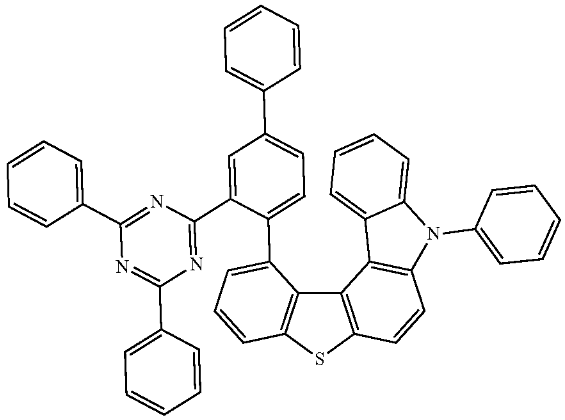
189
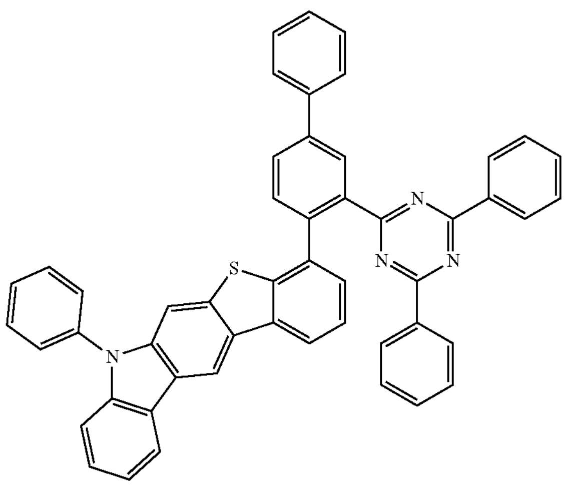
190
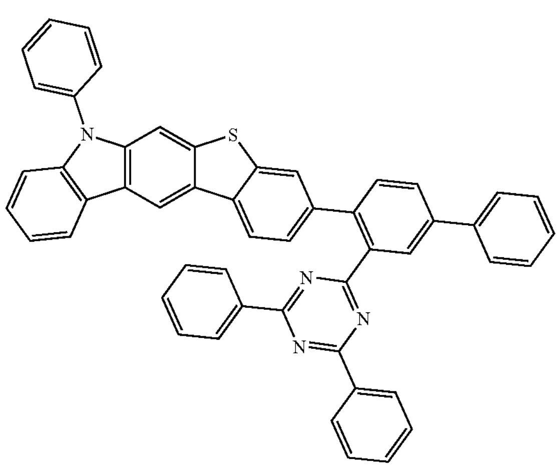
-continued
191
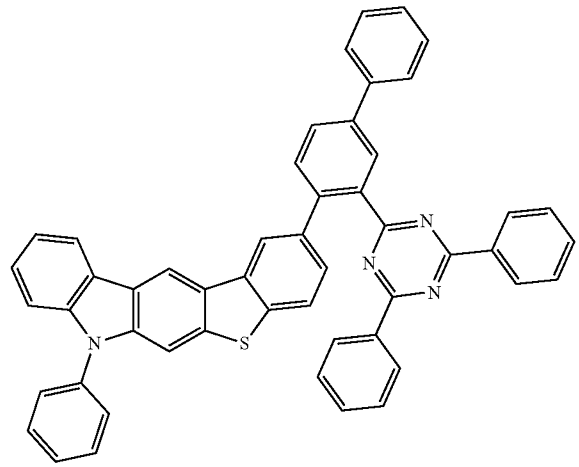
192
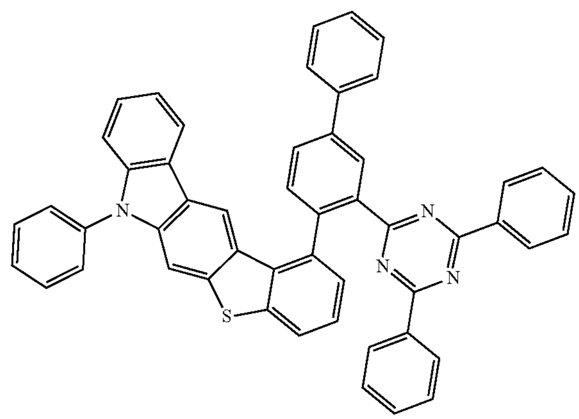
193
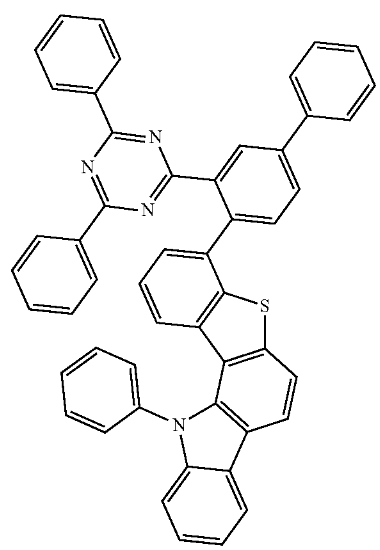

-continued
194
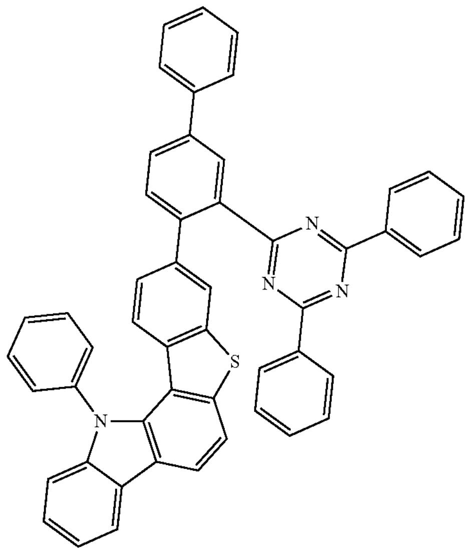
195
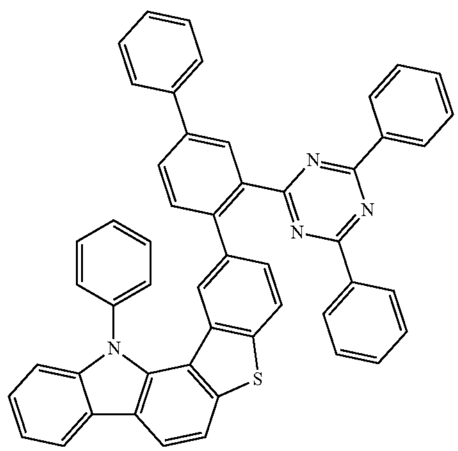
196
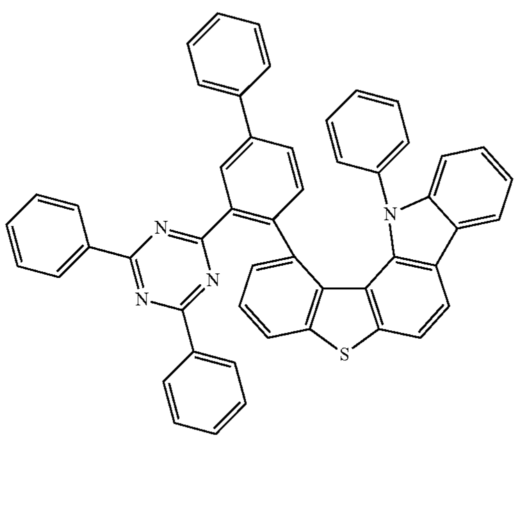
-continued
197
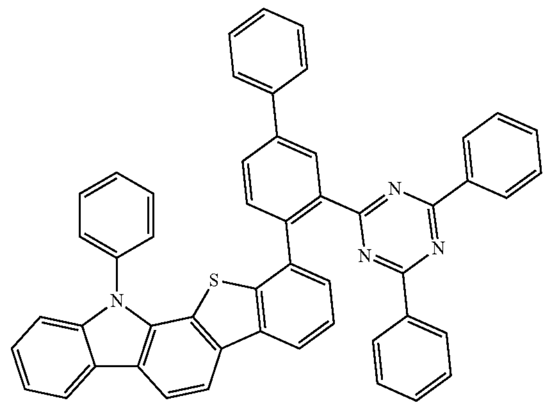
198
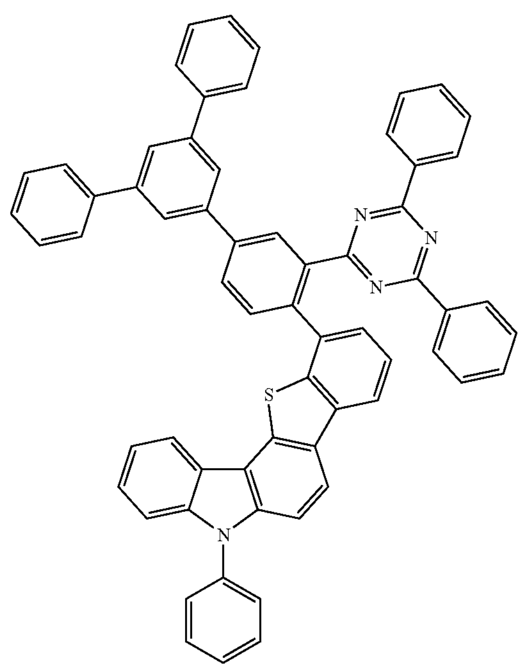

199
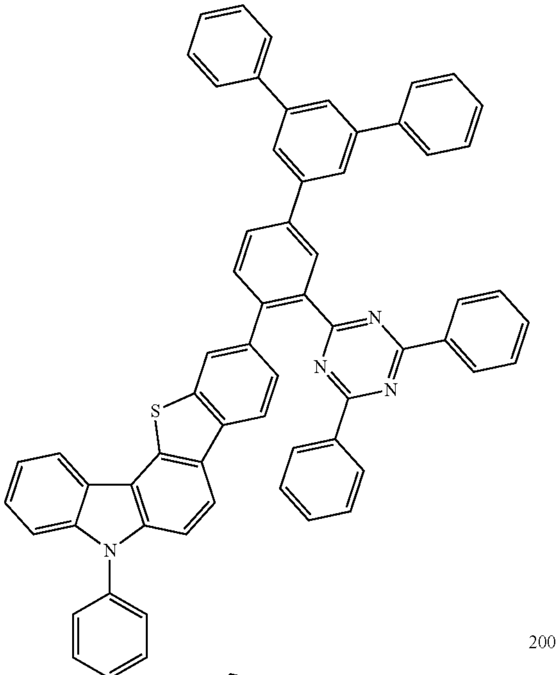
200
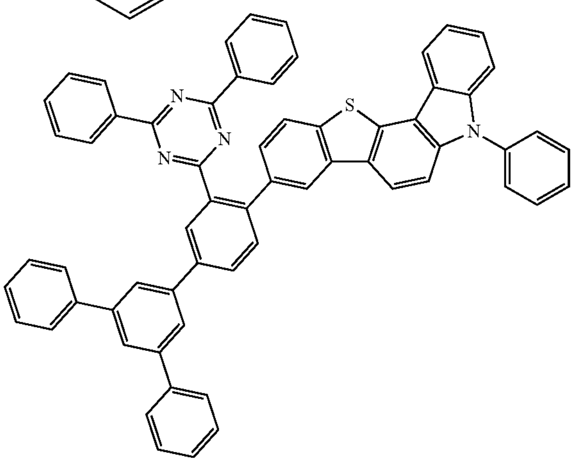
201
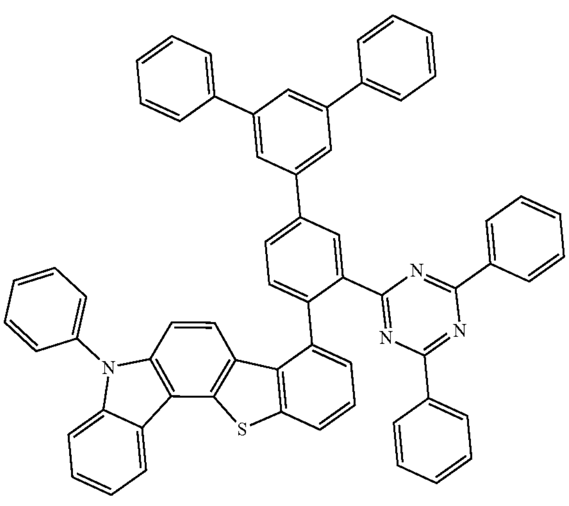
202
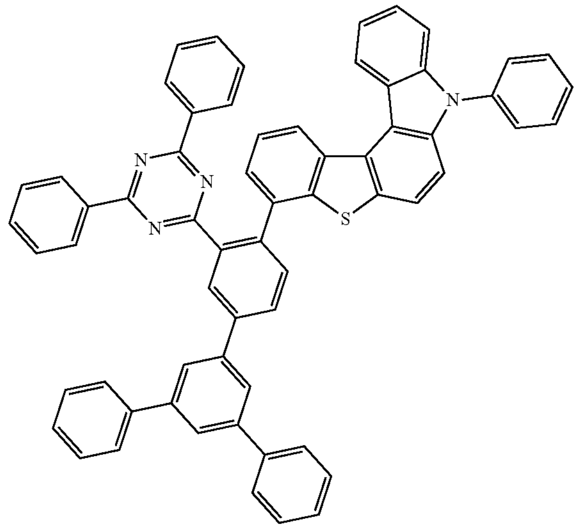
203
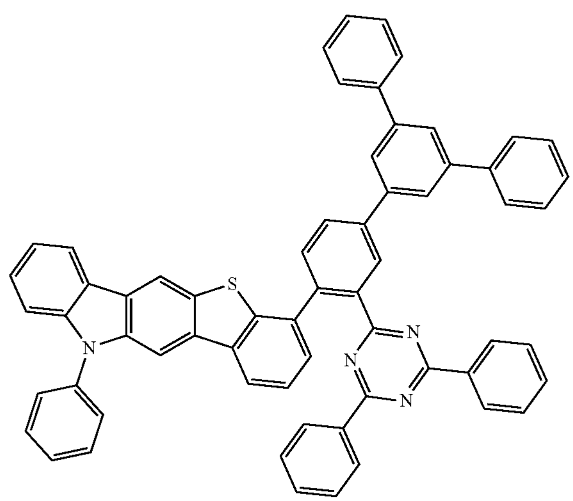

204
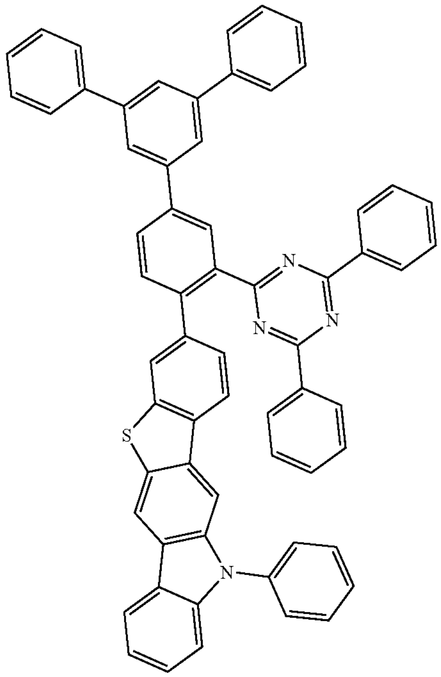
205
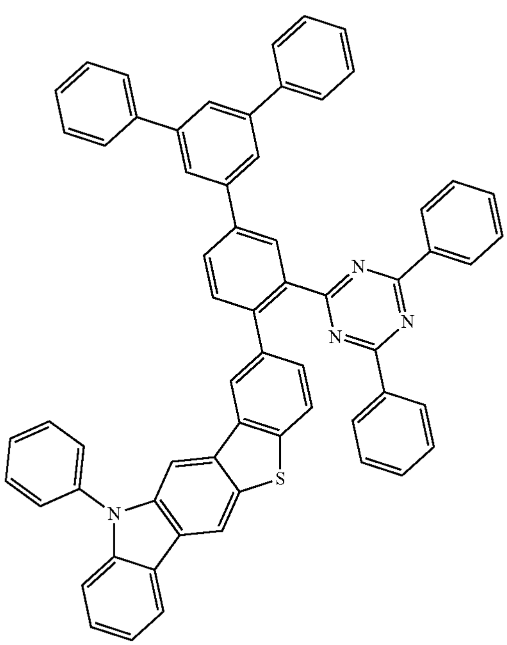
206
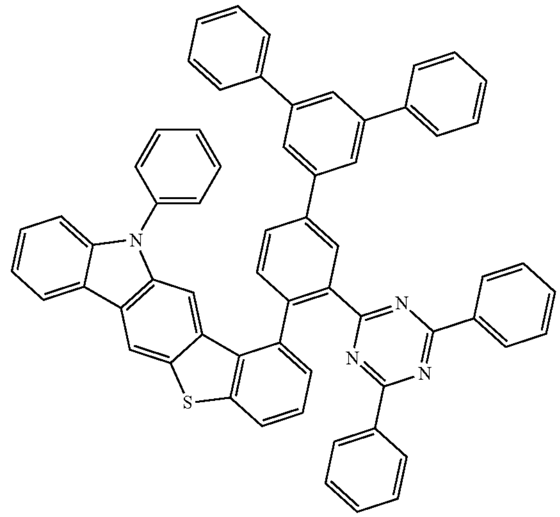
207
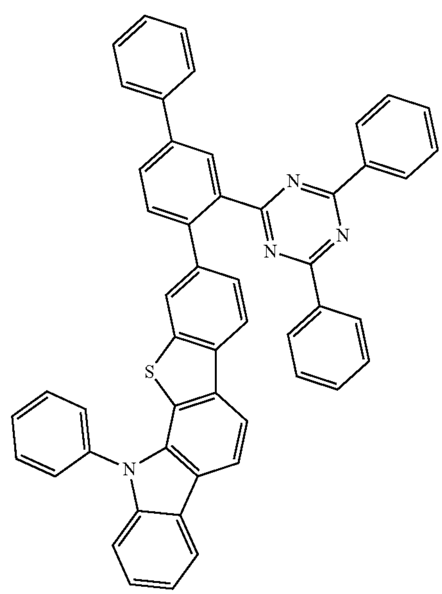

-continued
208
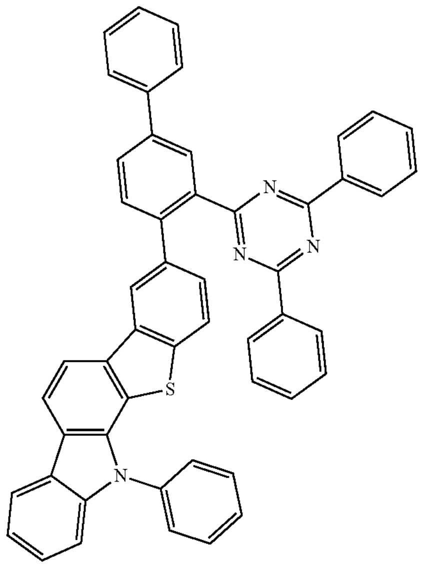
209
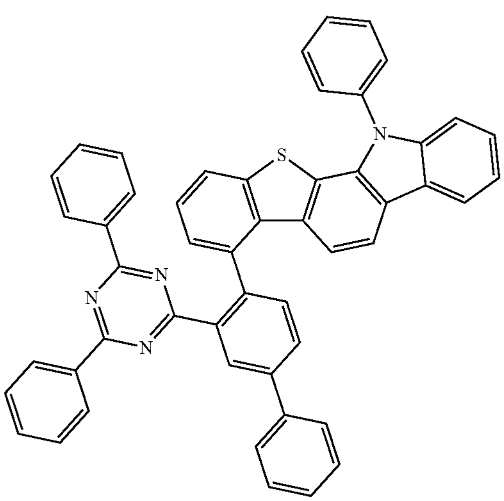
-continued
210
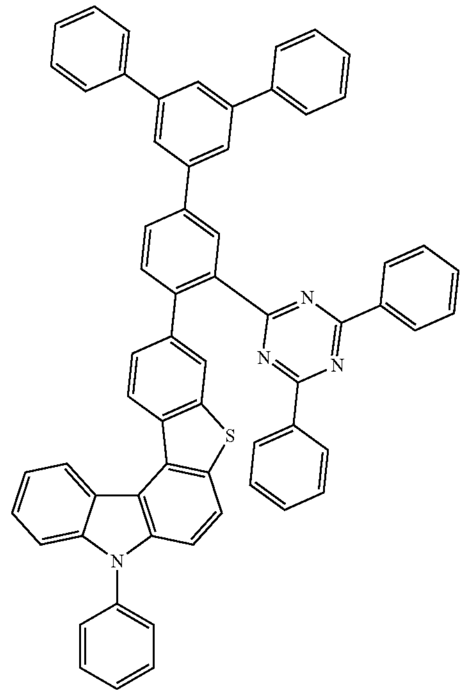
211
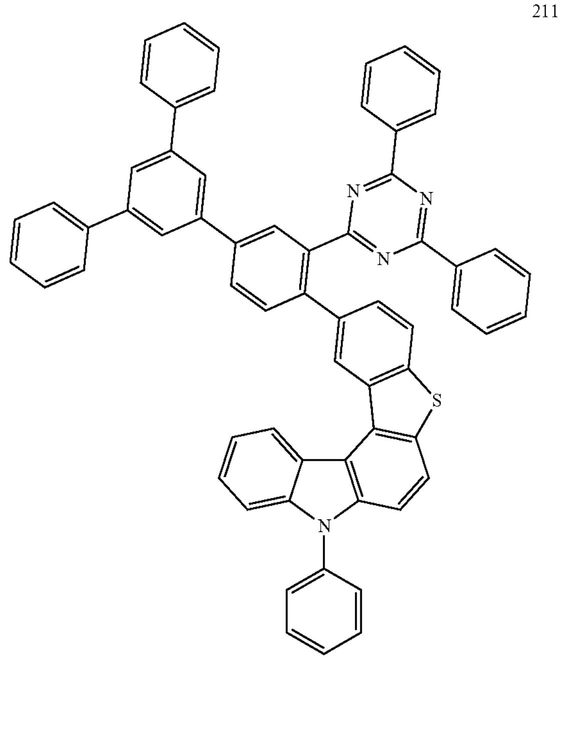

-continued
212
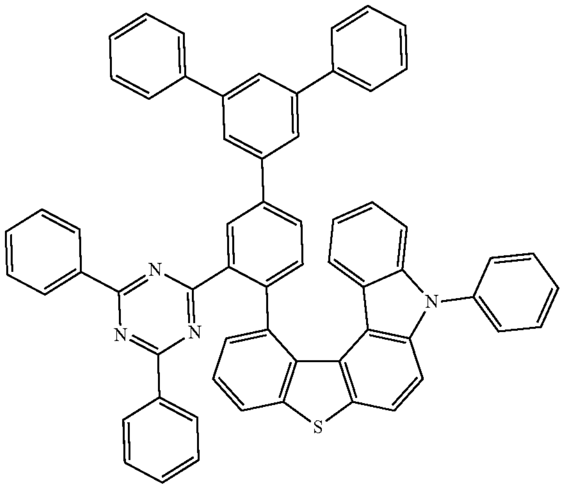
213
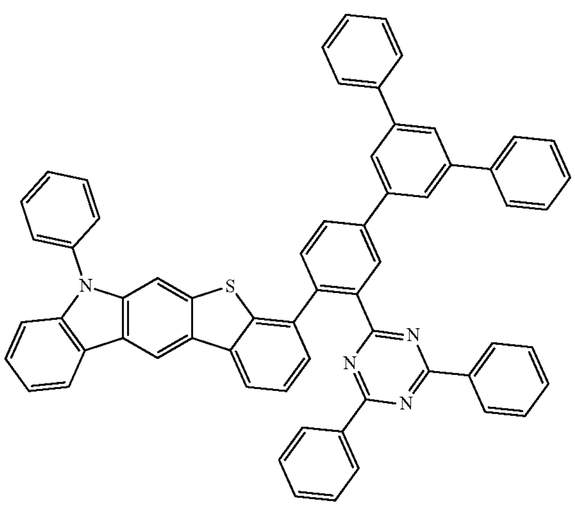
214
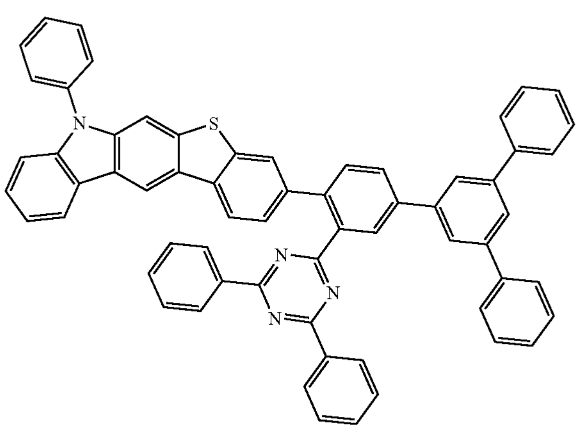
-continued
215
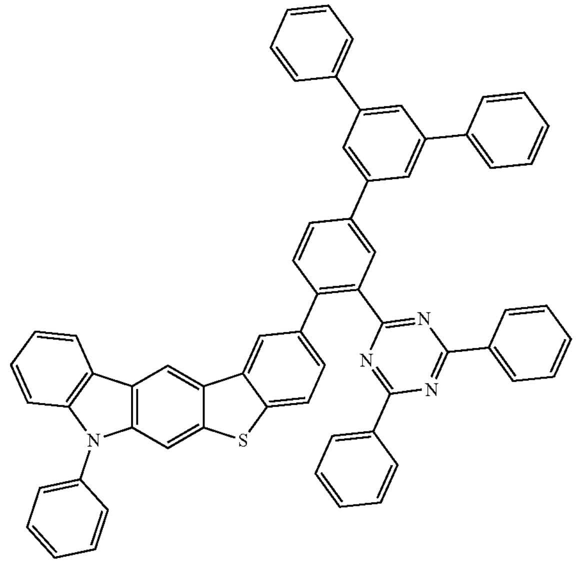
216
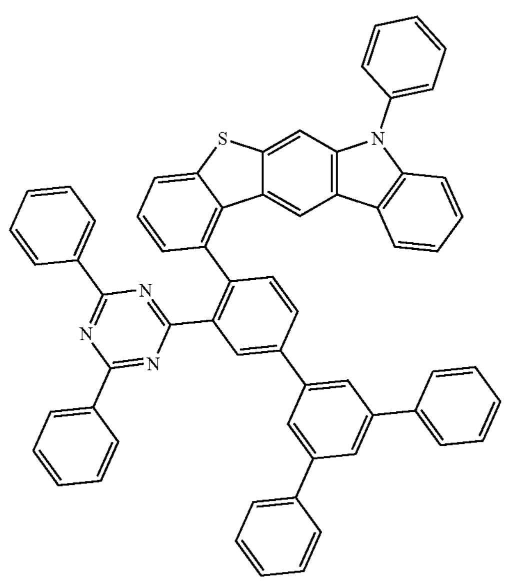

-continued
217
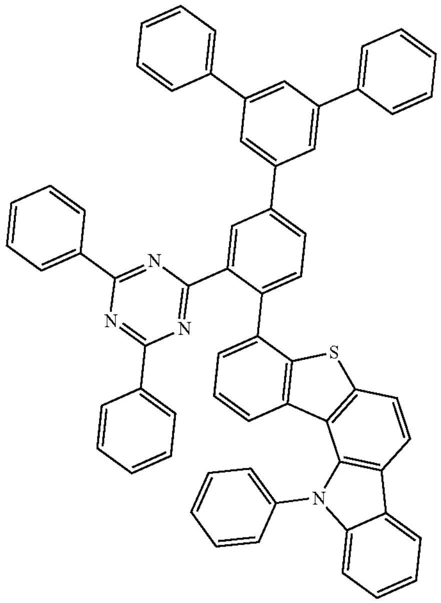
218
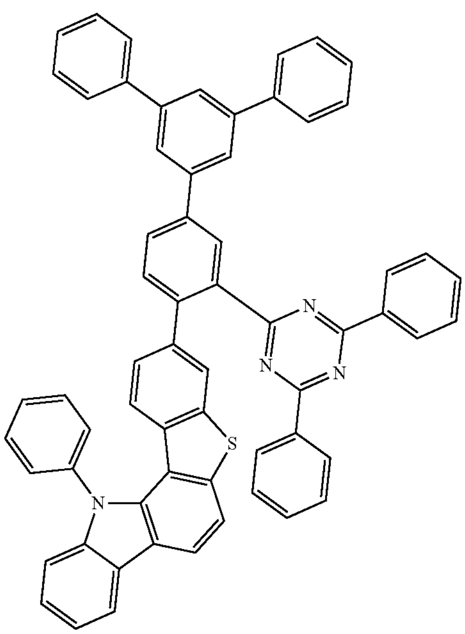
219
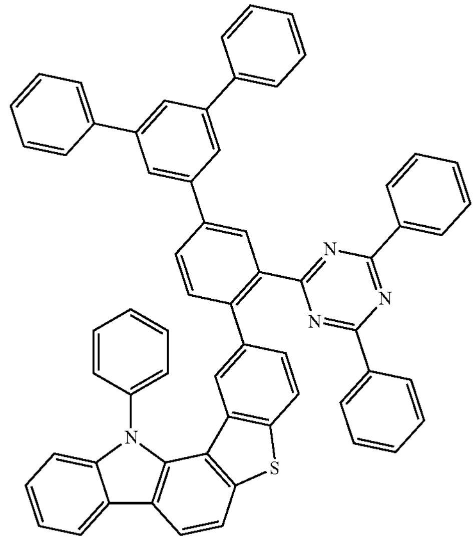
220
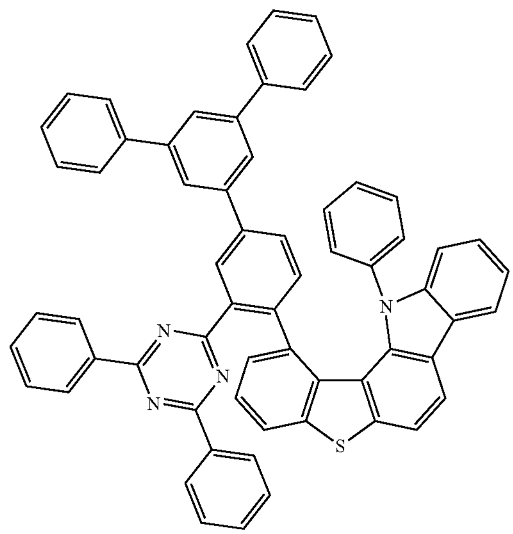
221
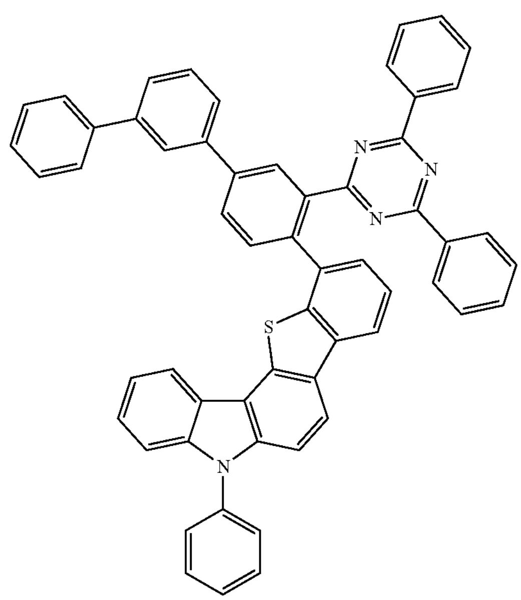

-continued
222
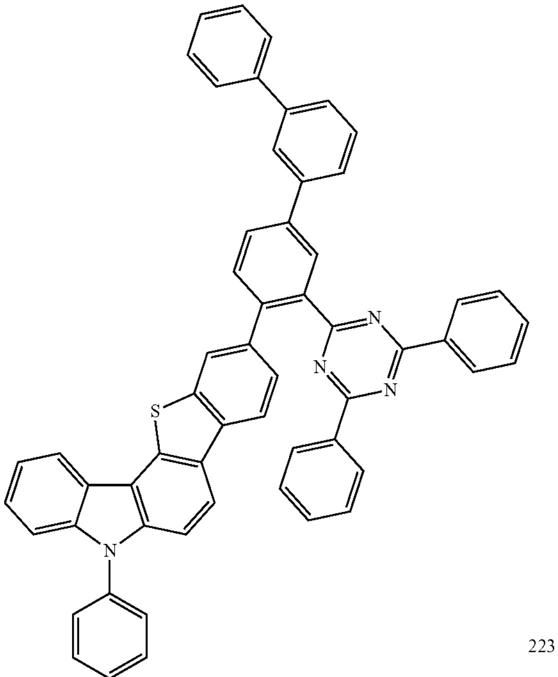
223
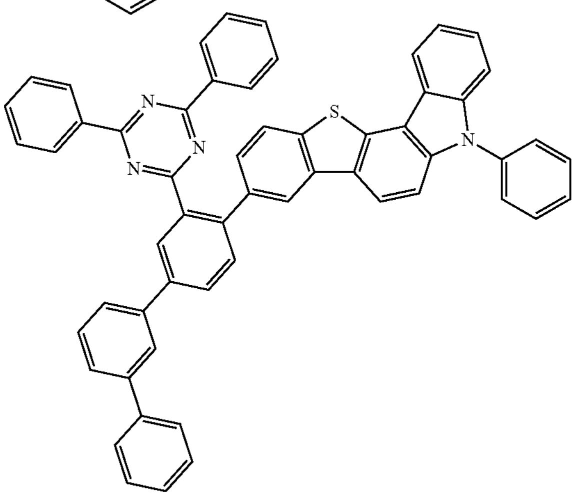
224
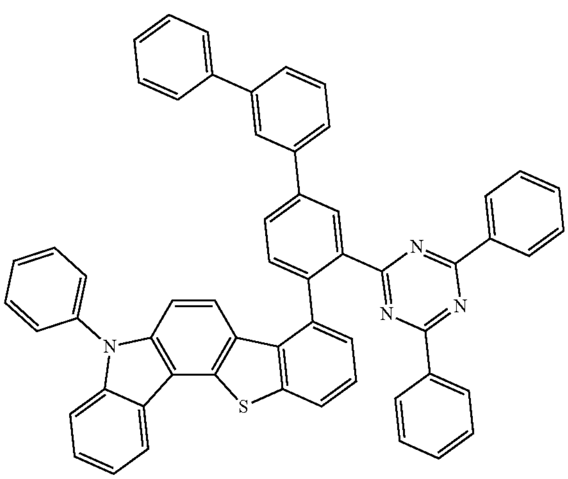
-continued
225
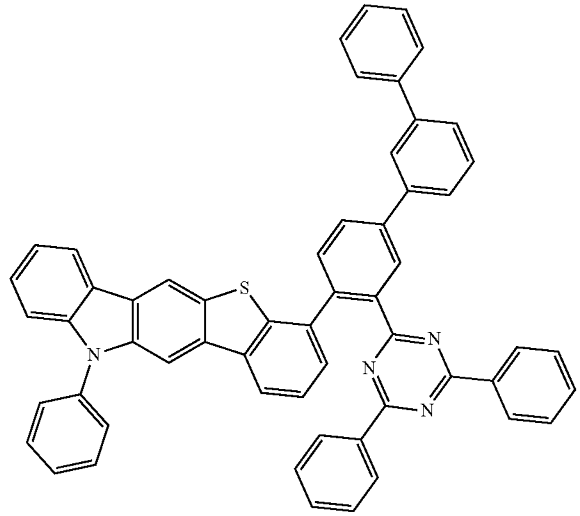
226
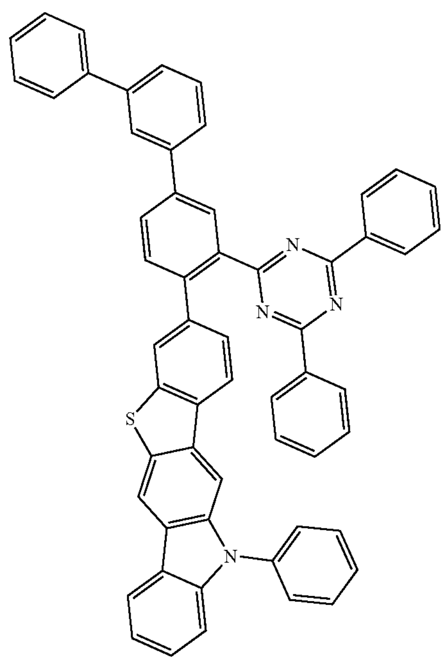

227
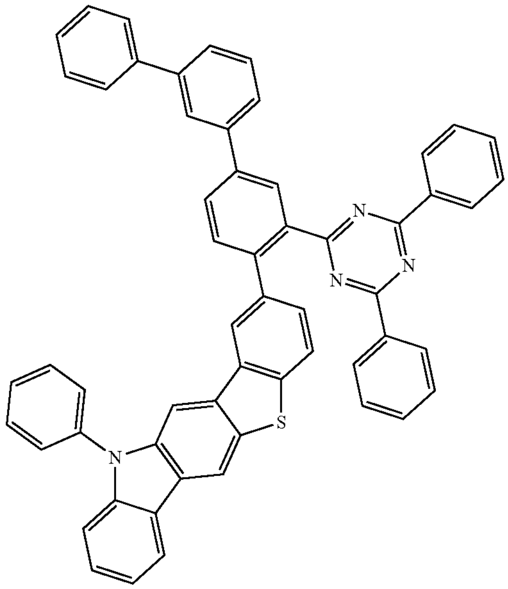
228
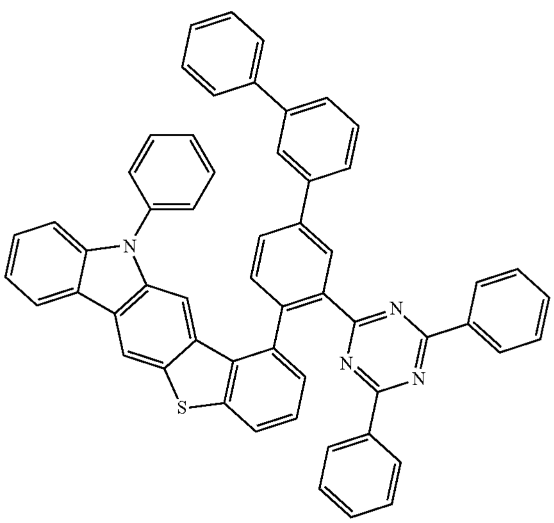
229
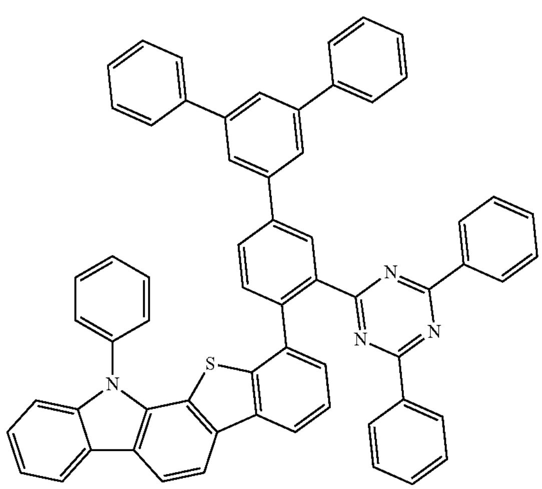
230
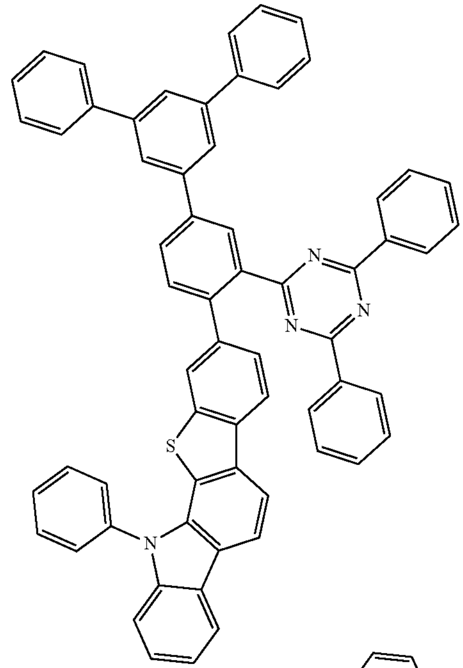
231
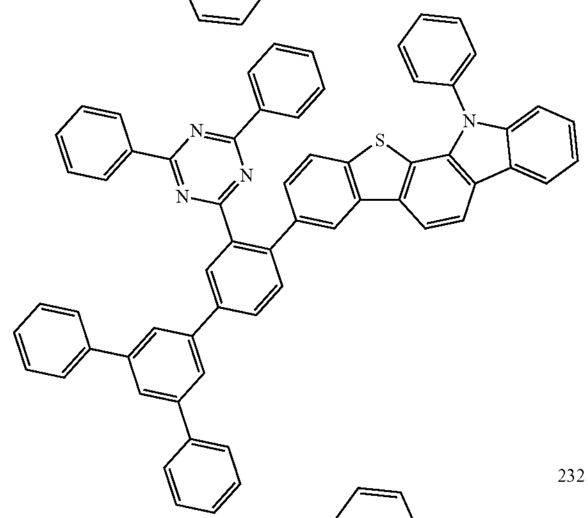
232
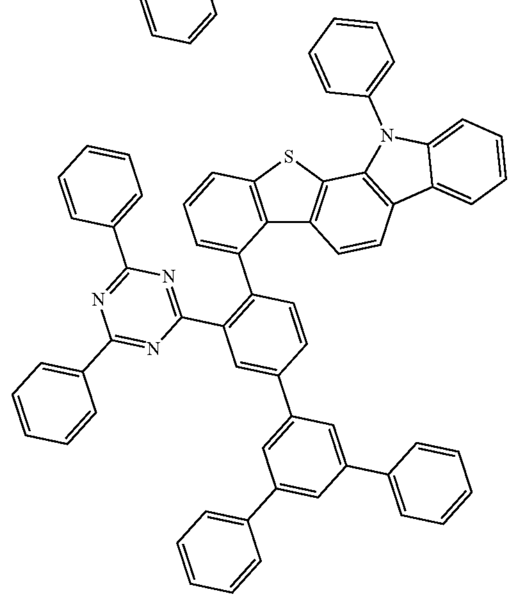

-continued
233
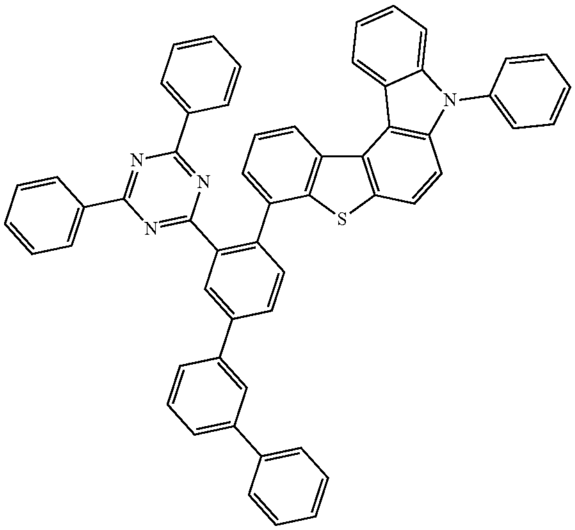
234
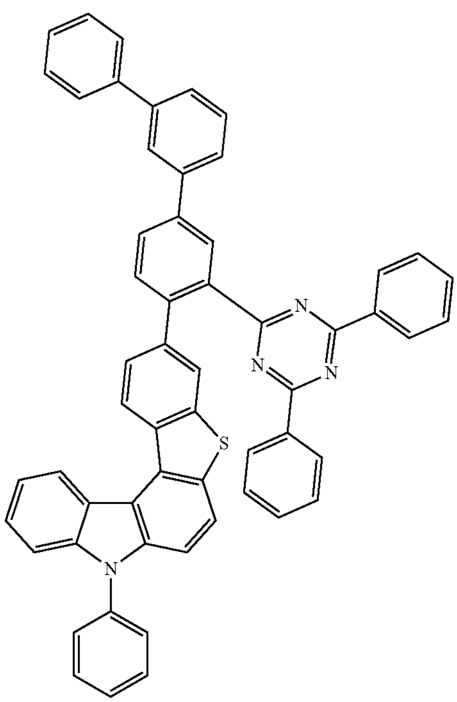
-continued
235
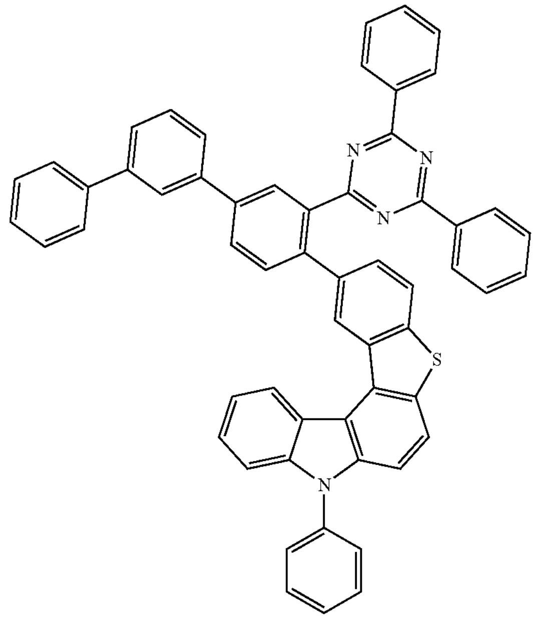
236
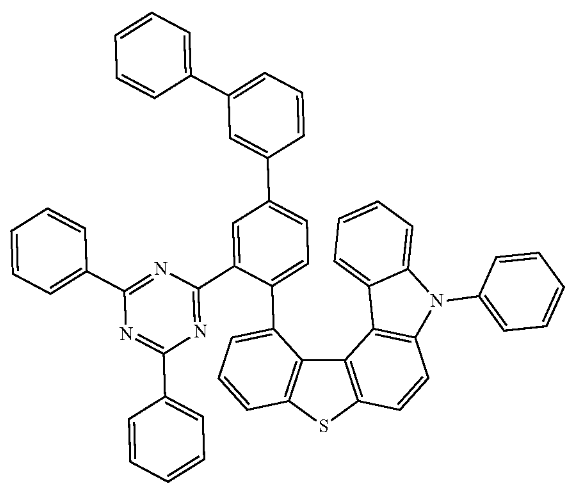
237
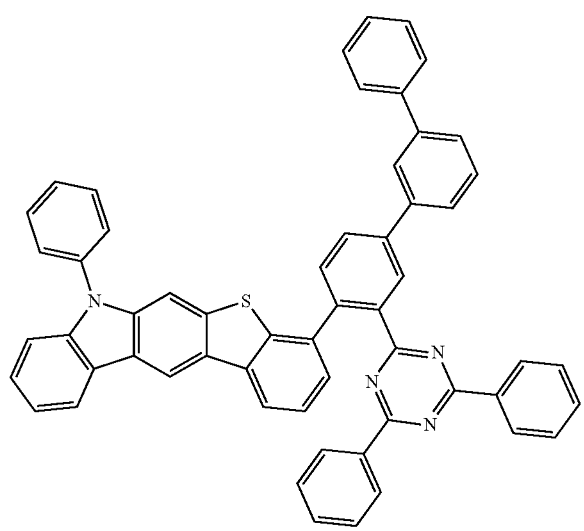

-continued
238
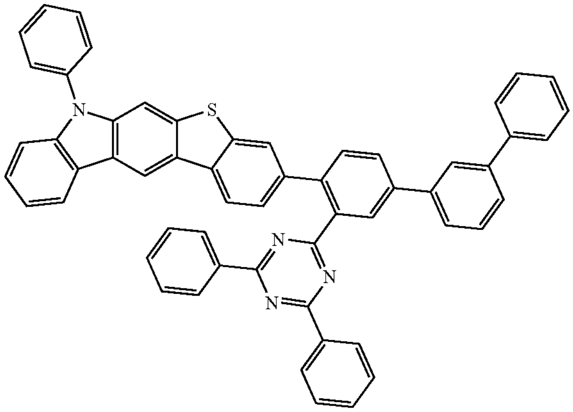
239
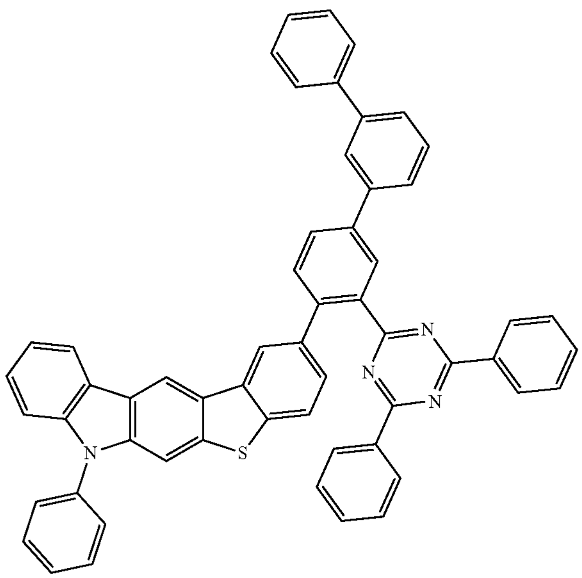
240
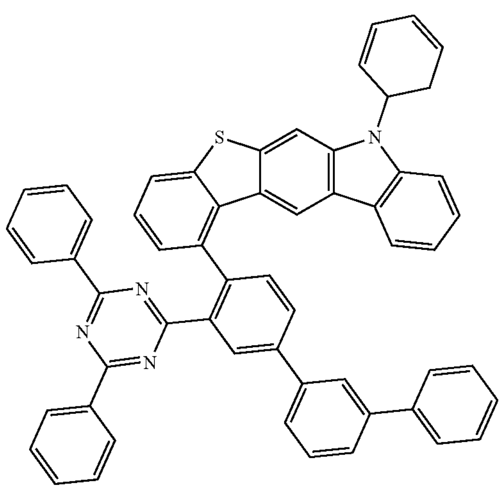
-continued
241
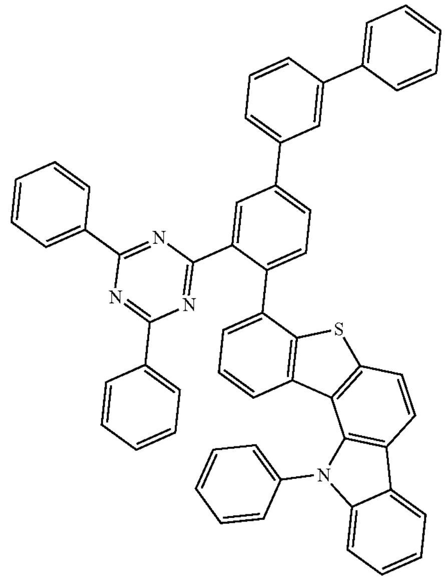
242
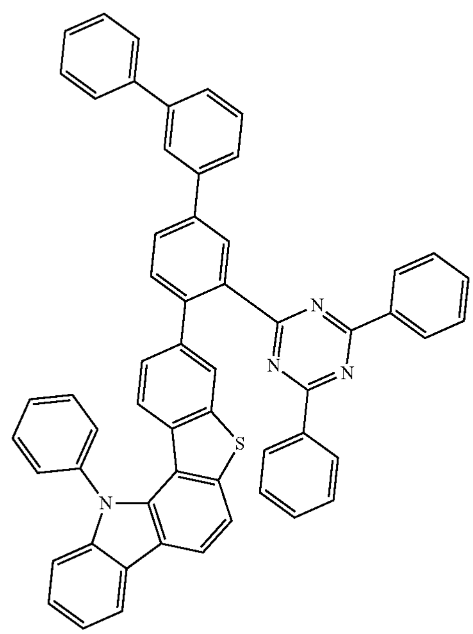

243
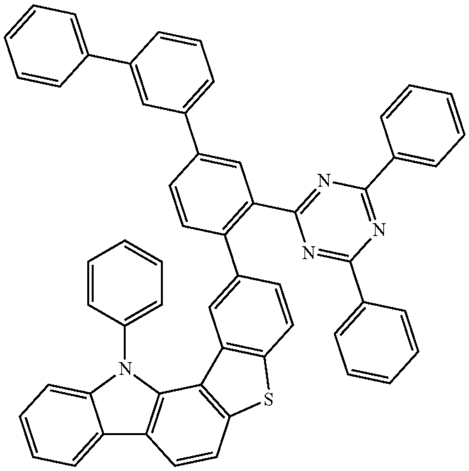
244
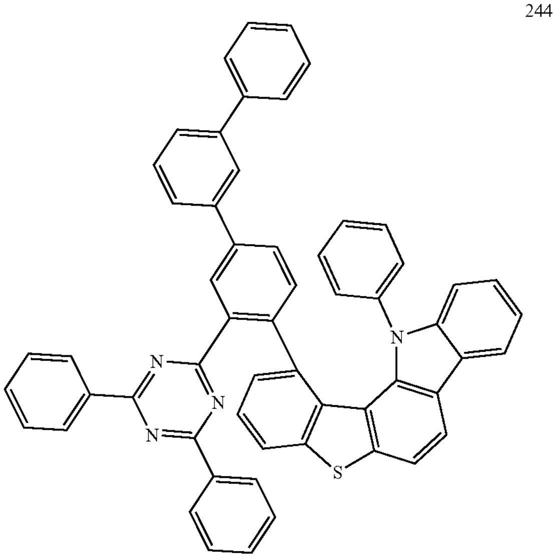
245
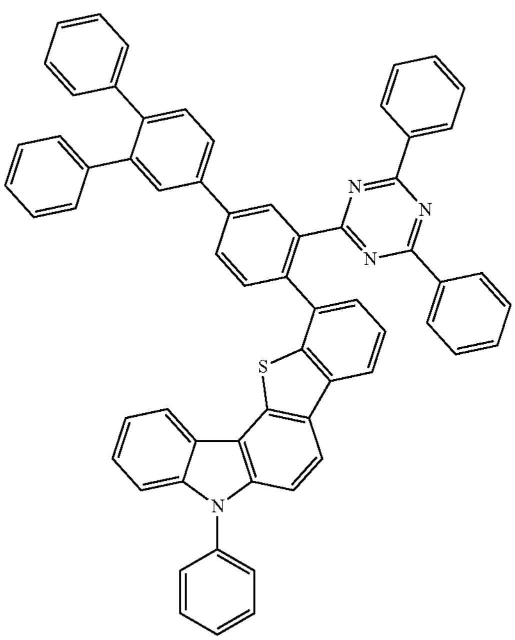
246
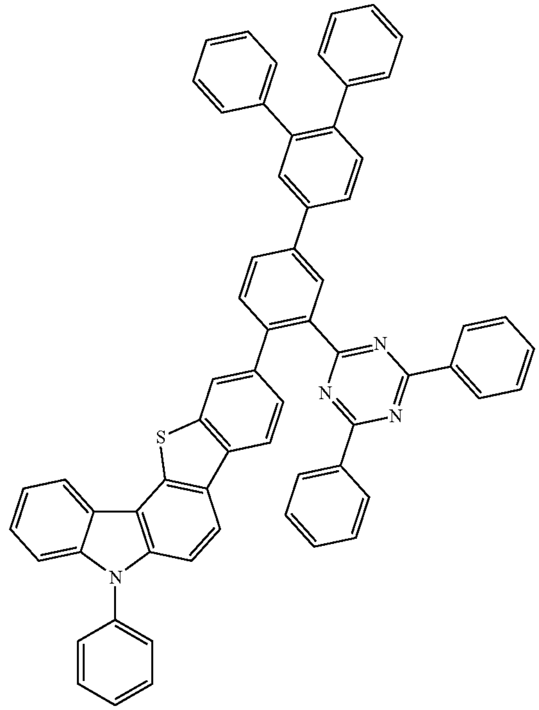
247
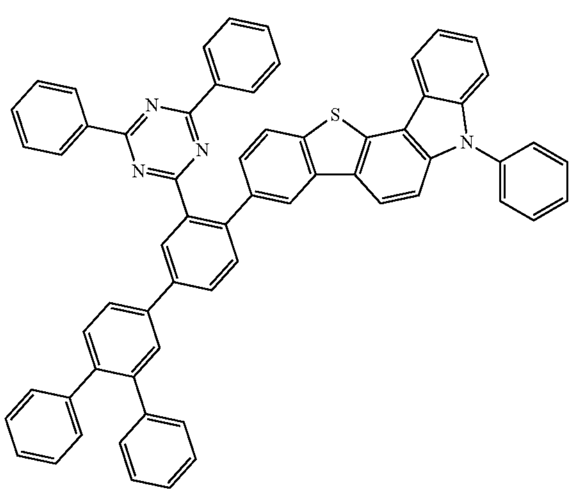

248
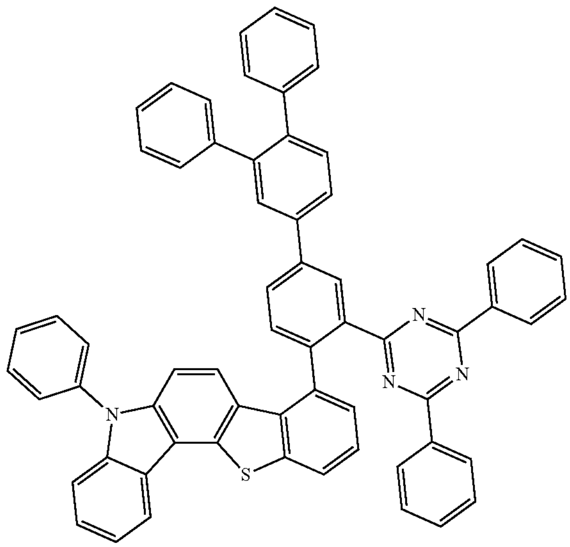
249
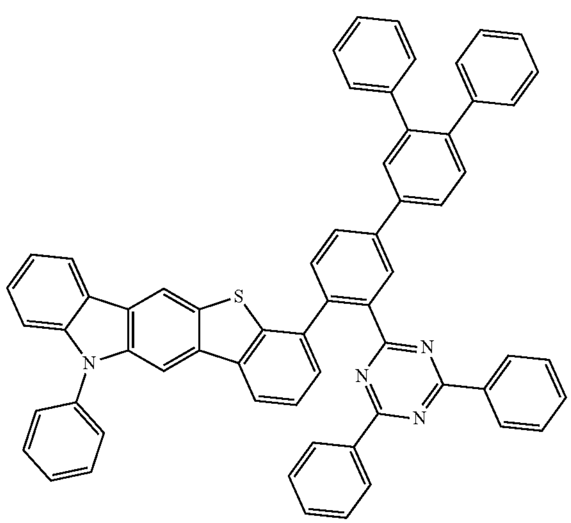
250
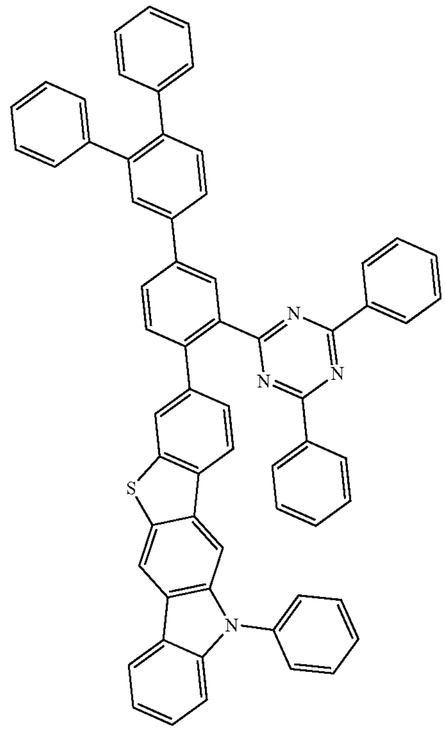
251
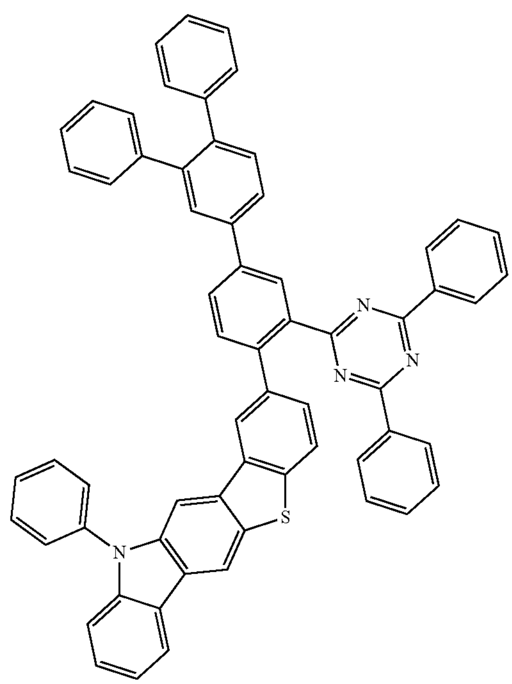

-continued
252
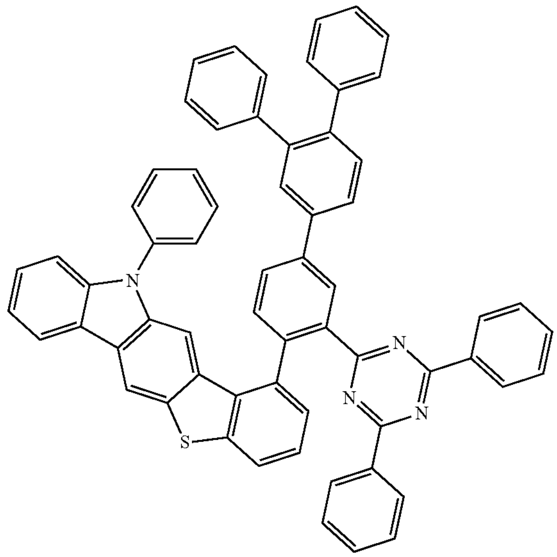
253
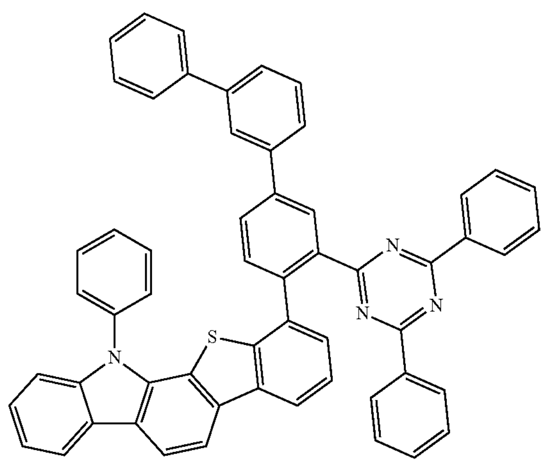
254
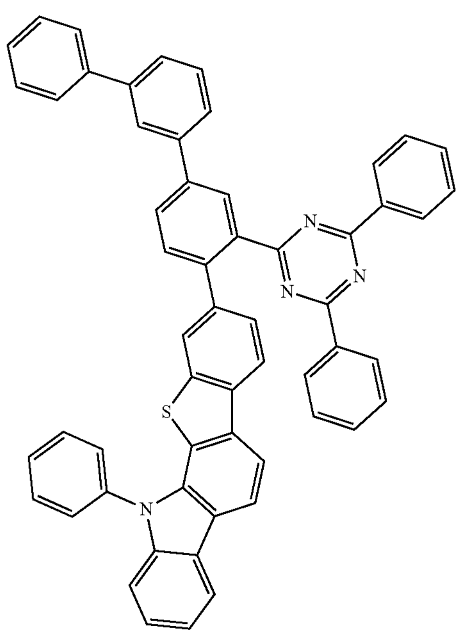
-continued
255
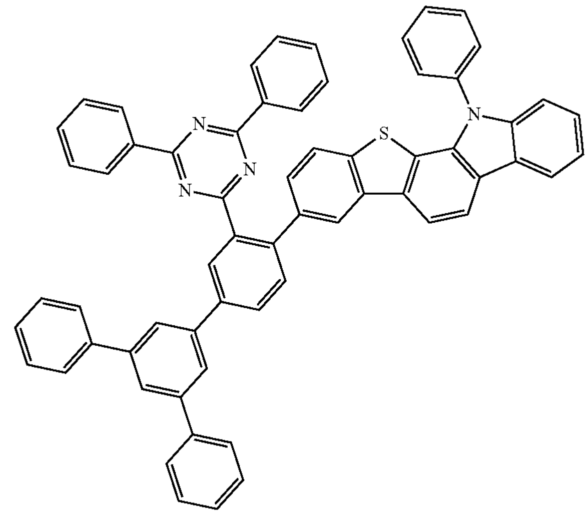
256
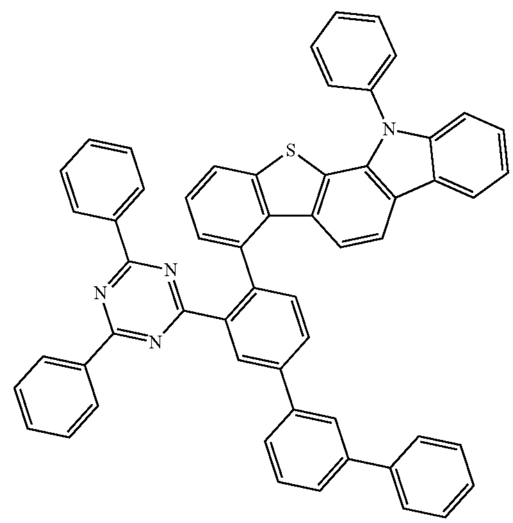
257
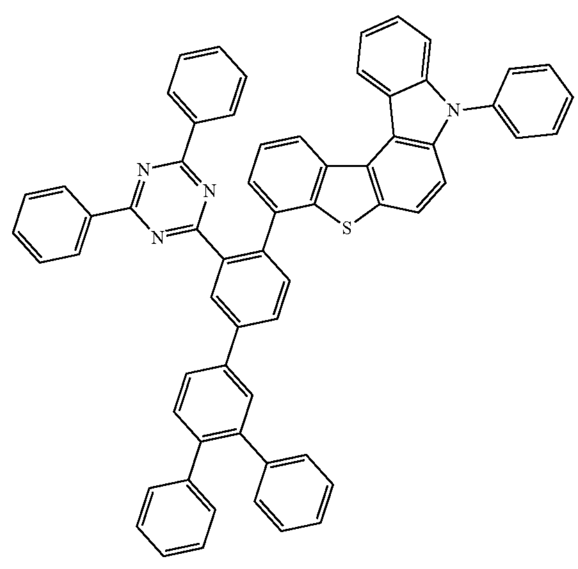

-continued
258
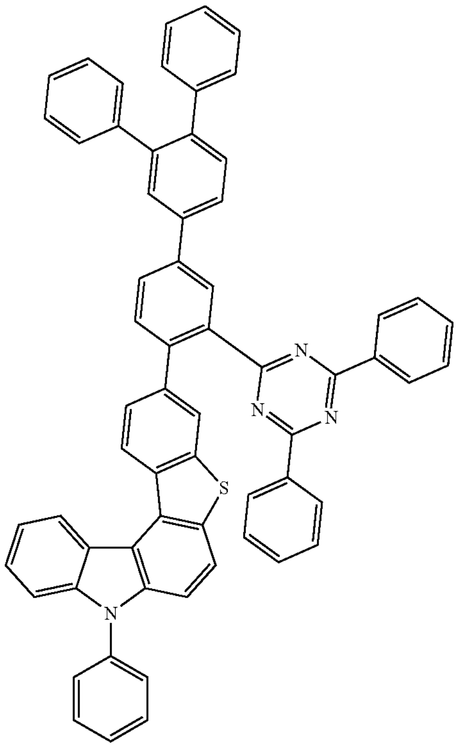
259
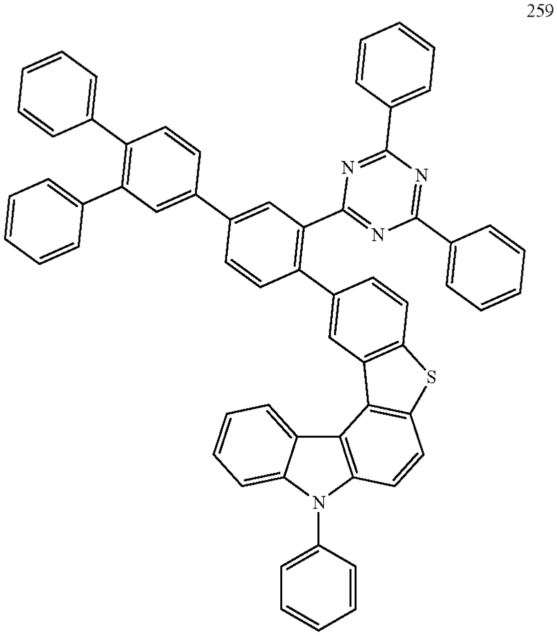
-continued
260
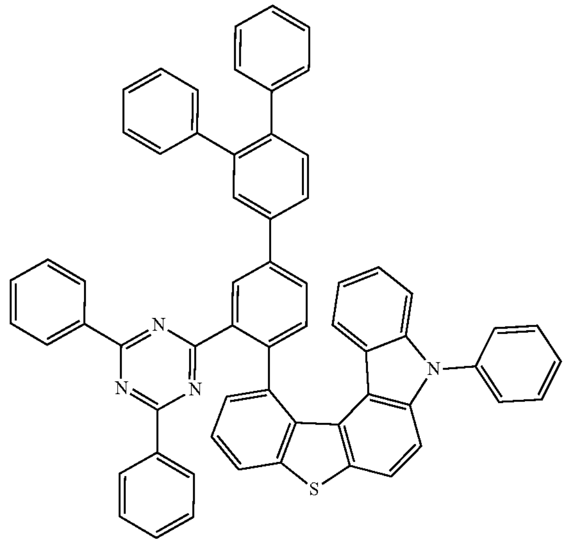
261
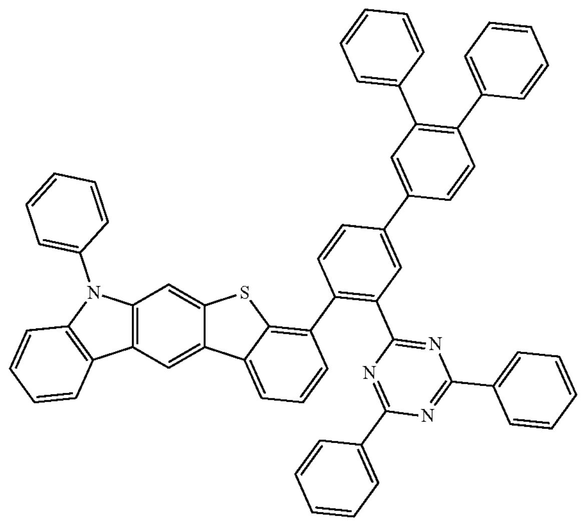
262
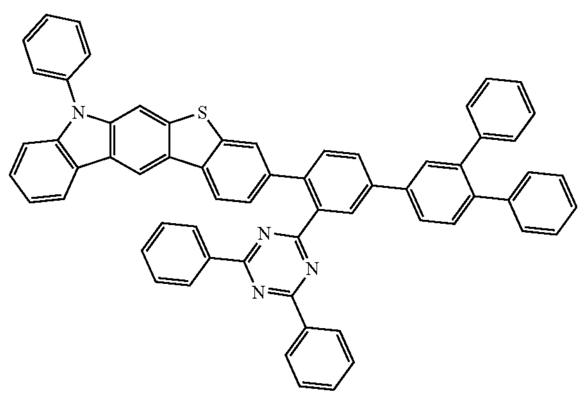

-continued
263
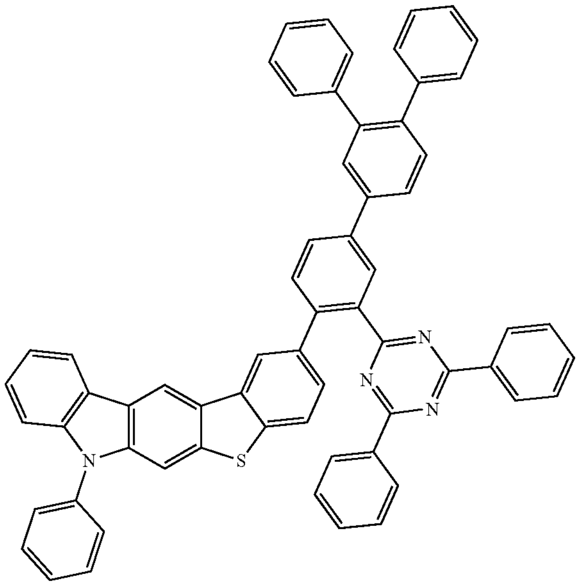
264
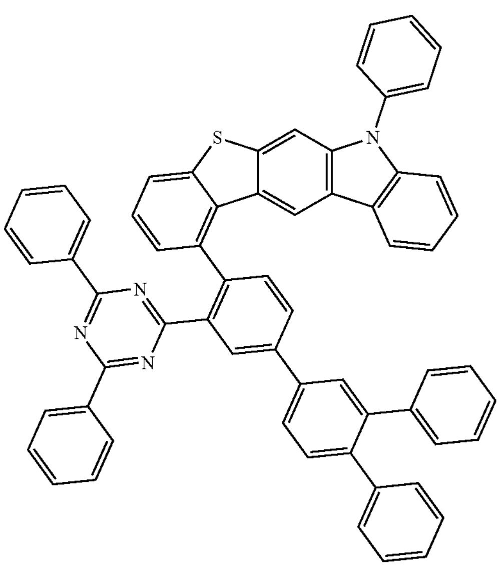
-continued
265
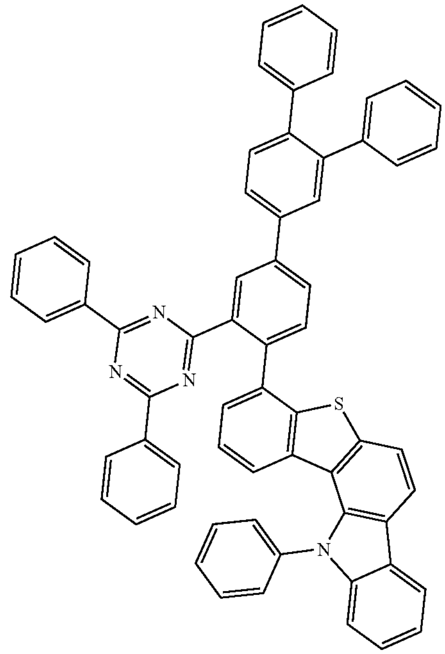
266
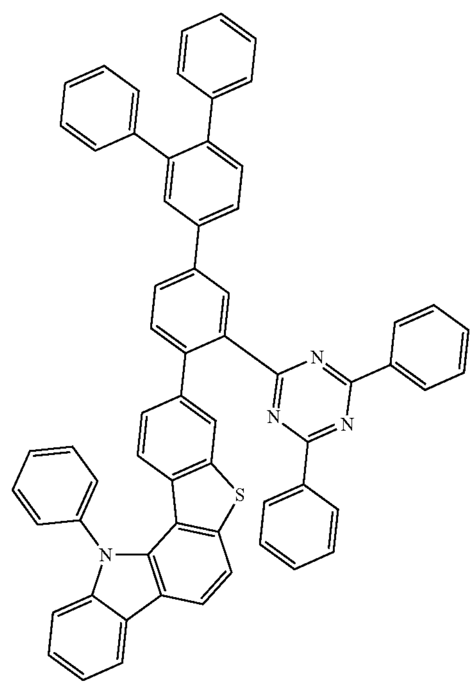

-continued
267
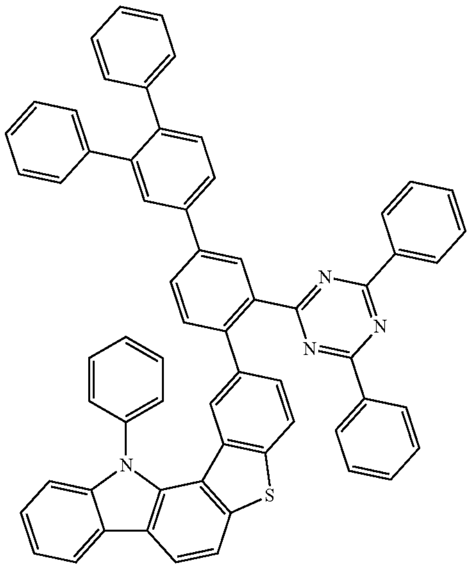
268
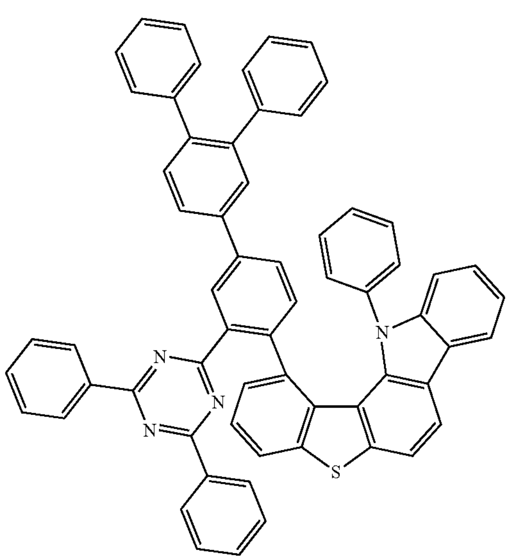
-continued
269
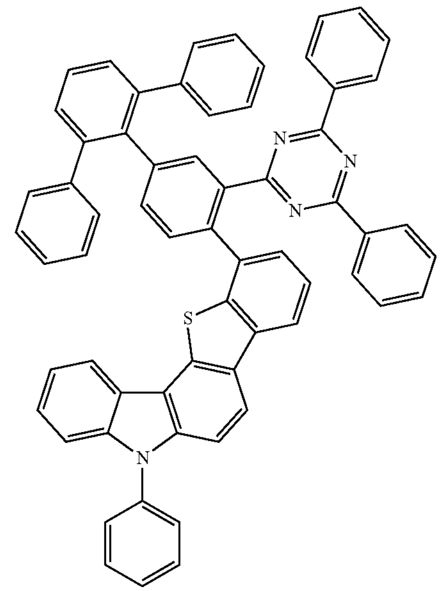
270
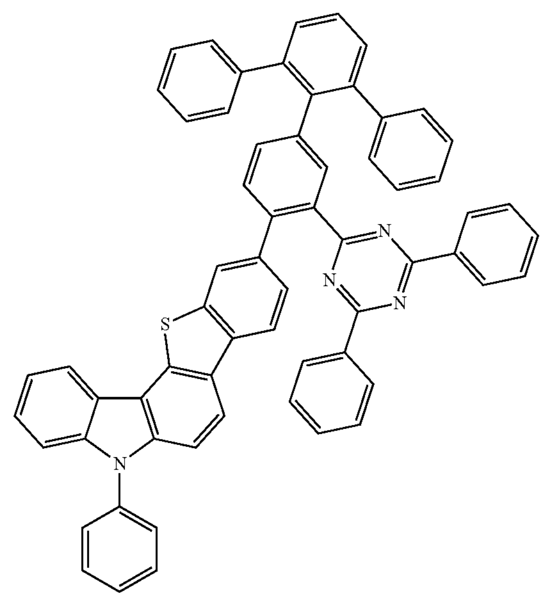
271
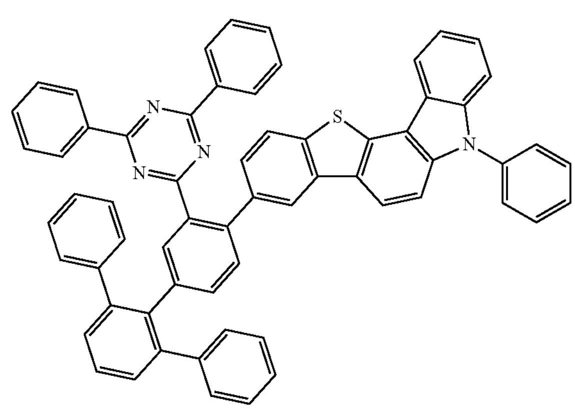

272
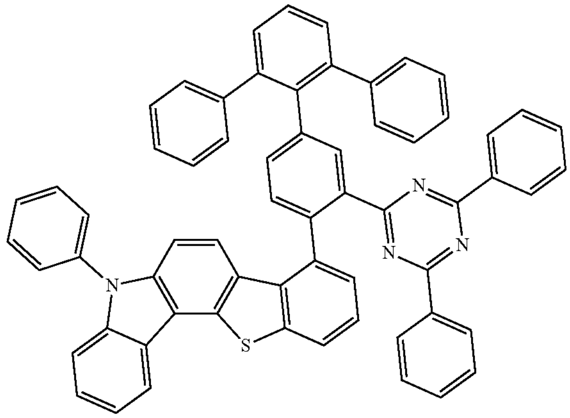
273
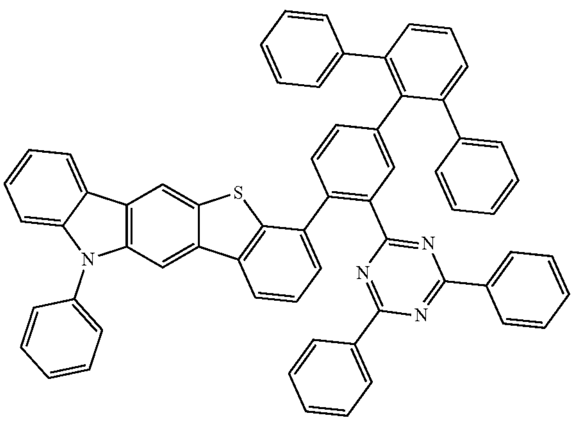
274
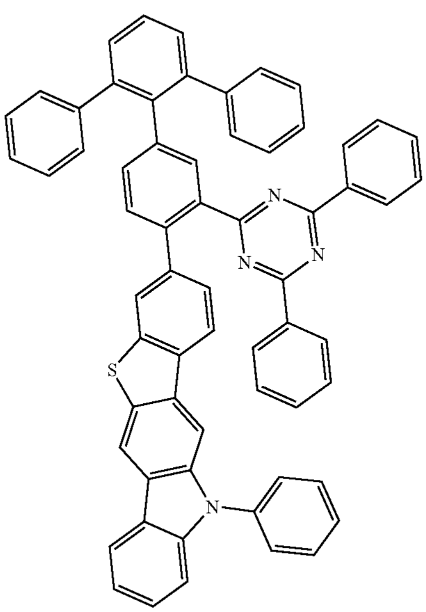
275
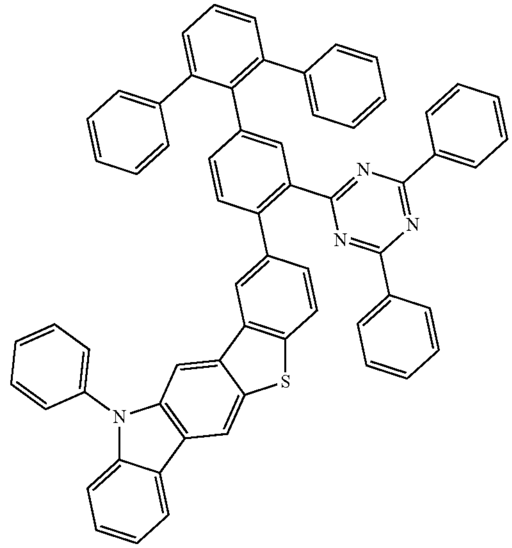
276
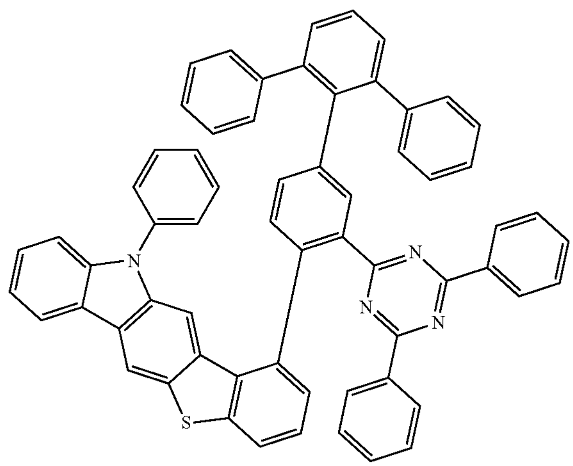
277
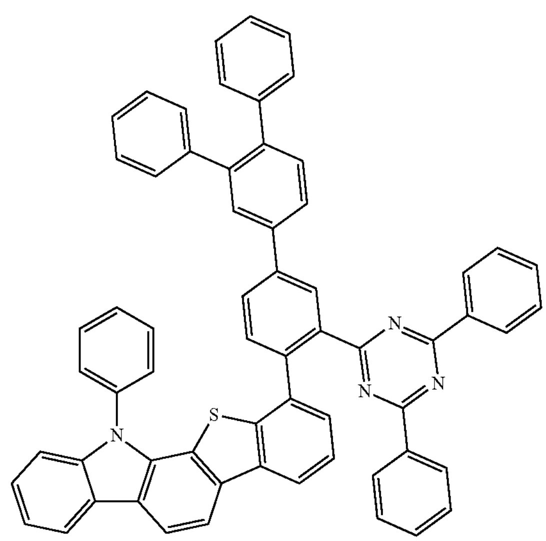

278
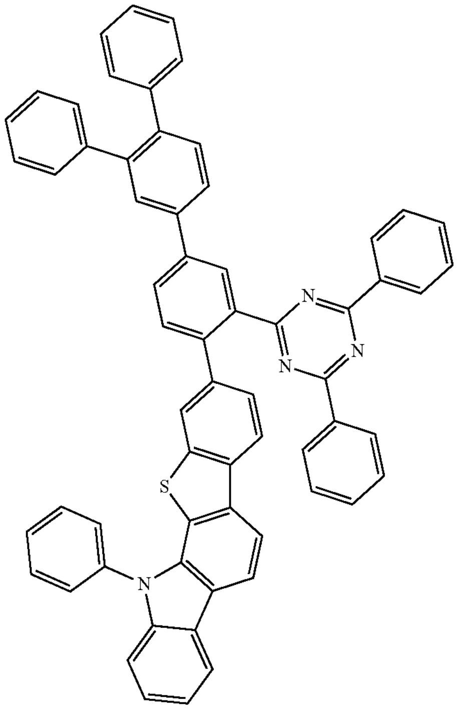
279
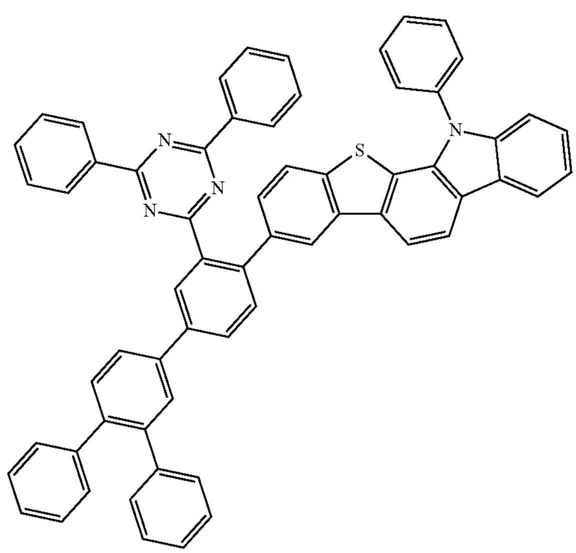
280
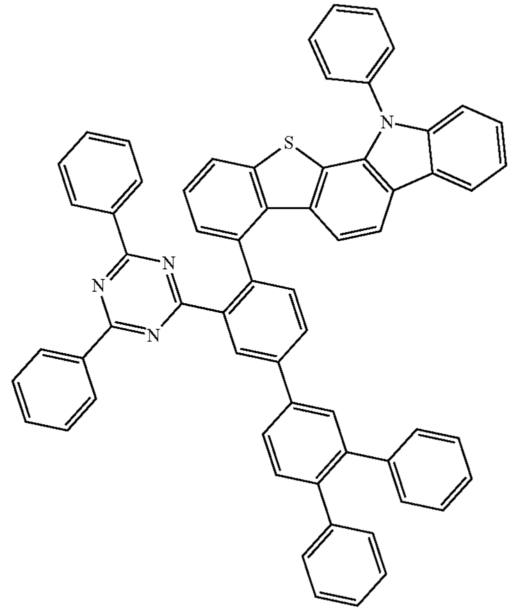
281
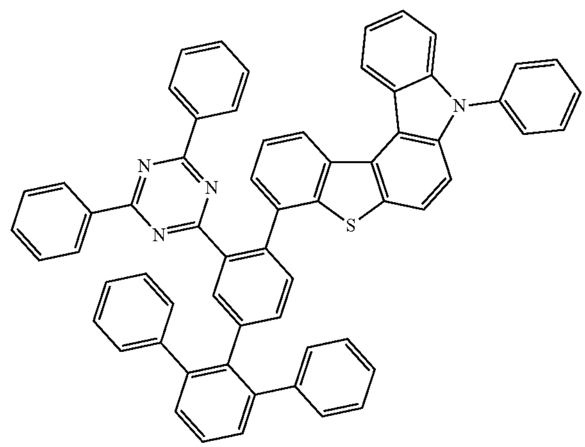
282
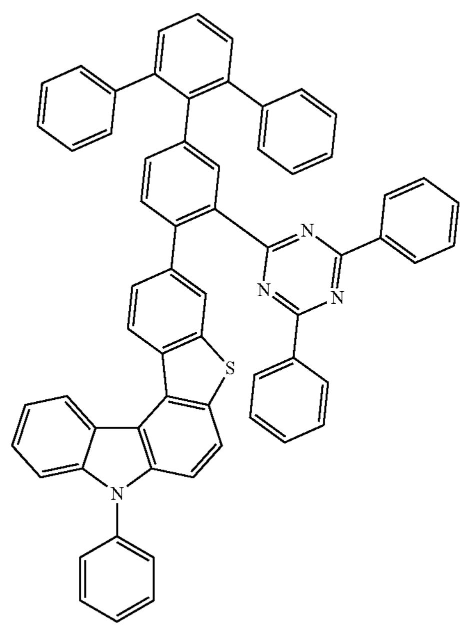

-continued
283
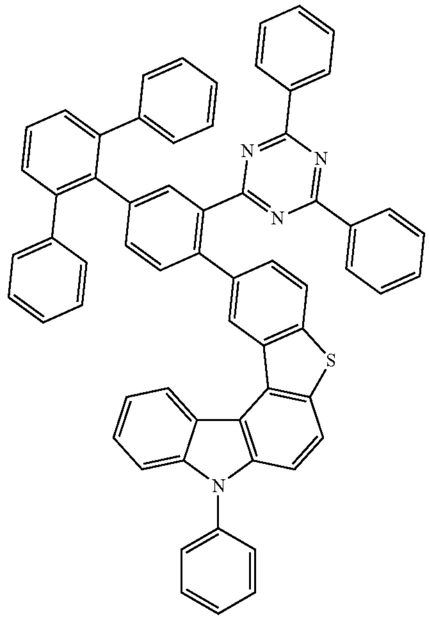
284
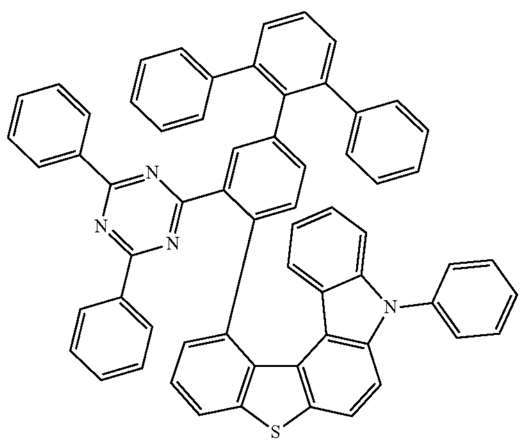
285
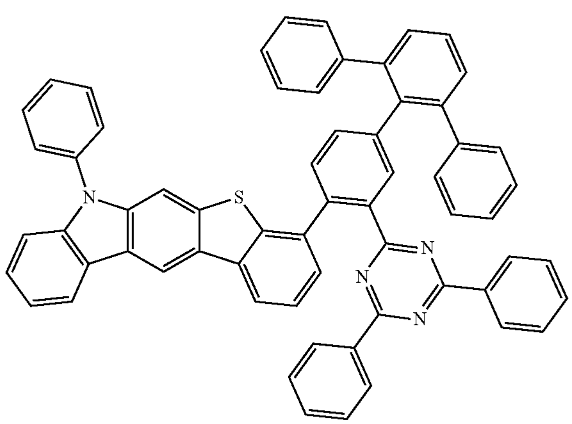
-continued
286
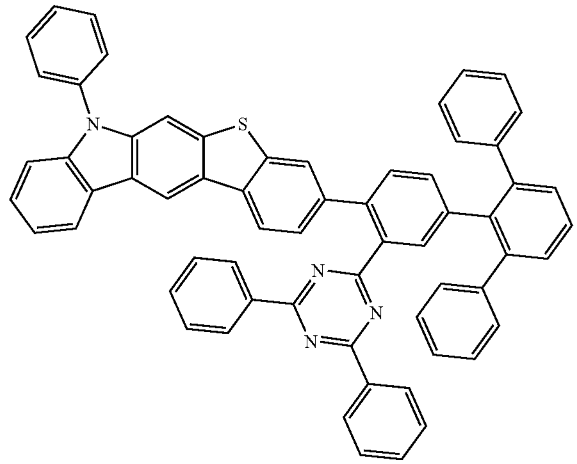
287
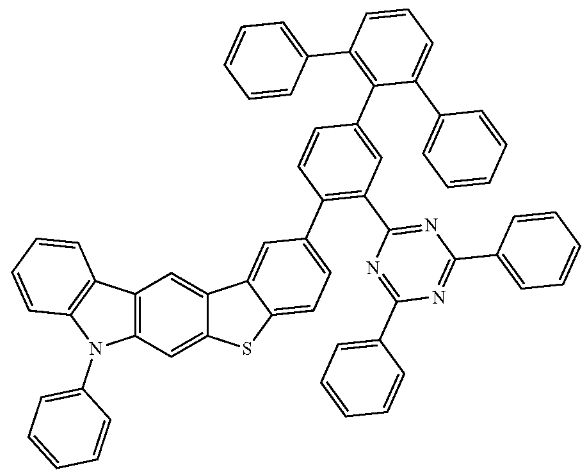
288
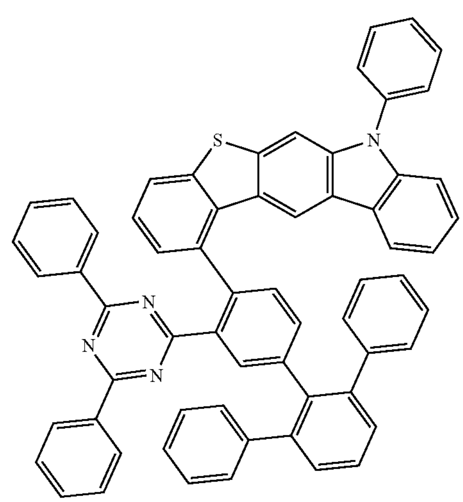

-continued
289
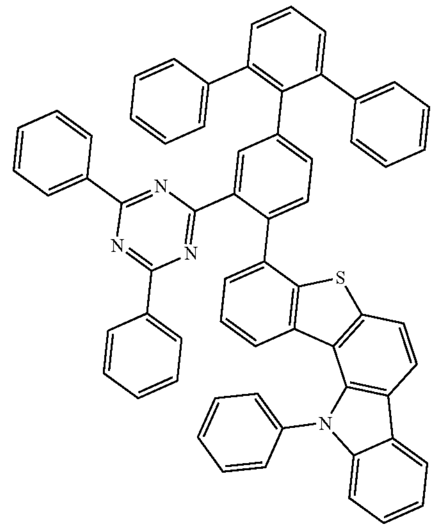
290
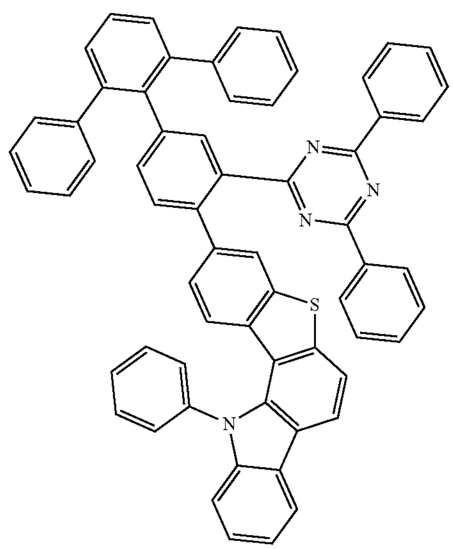
291
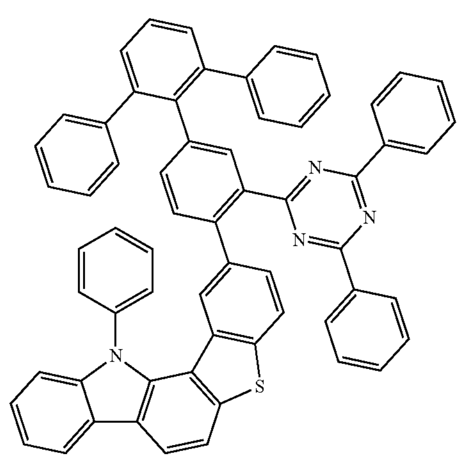
-continued
292
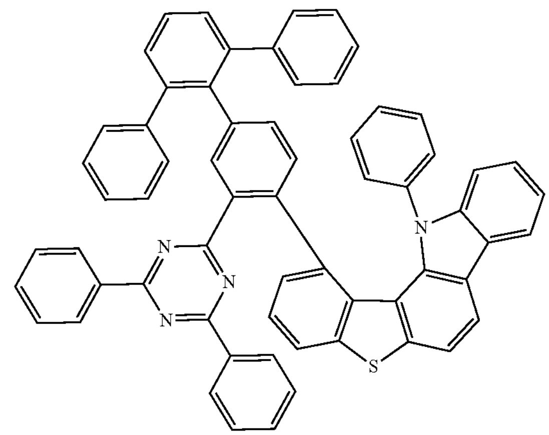
293
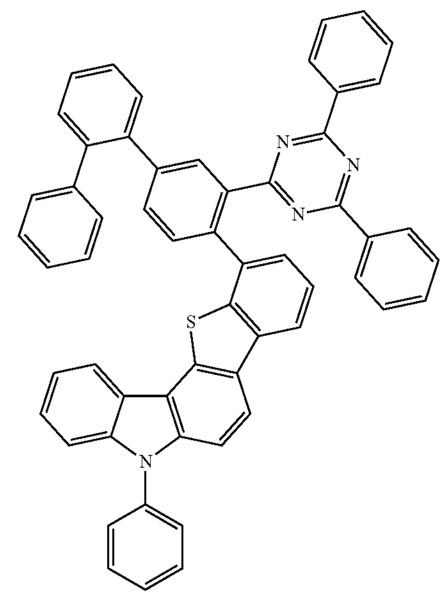
294
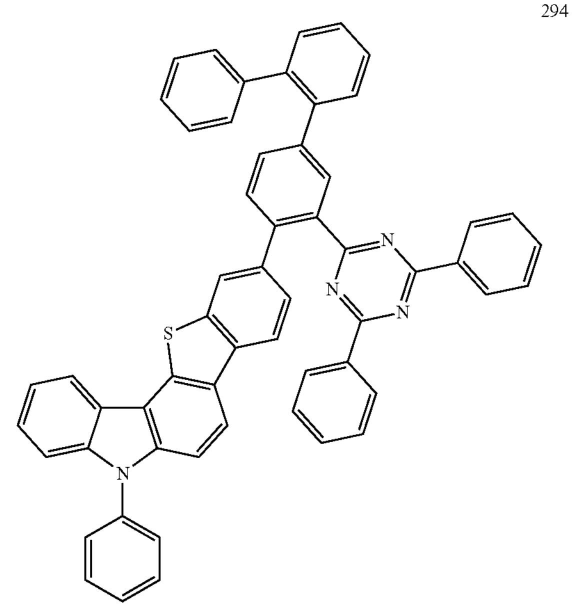

-continued
295
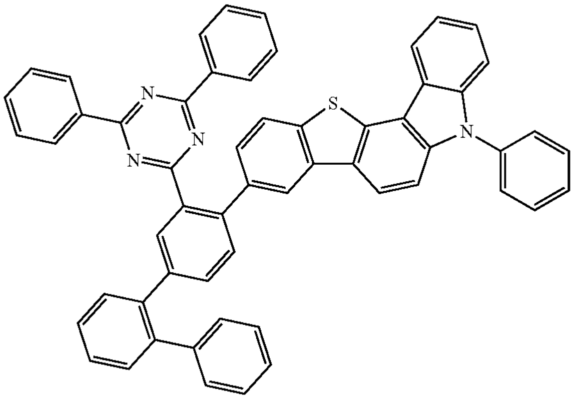
296
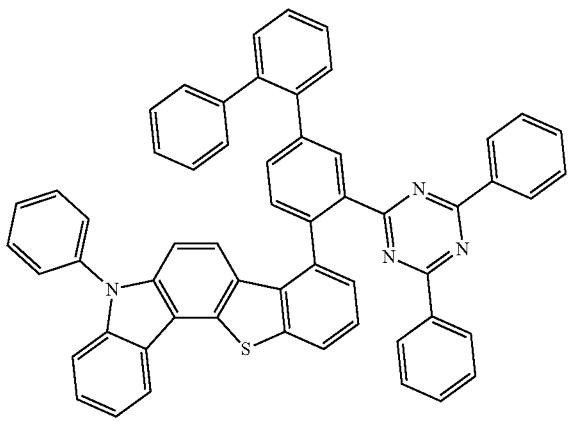
297
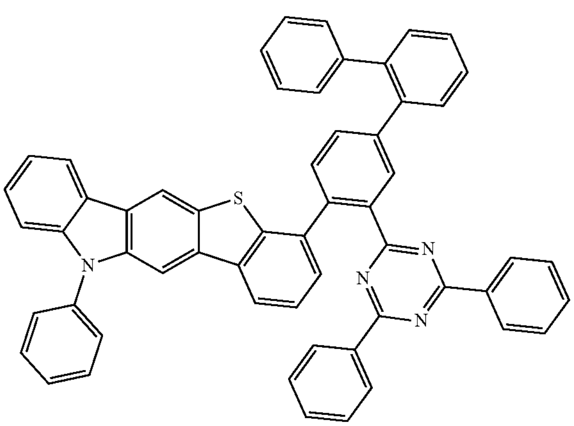
-continued
298
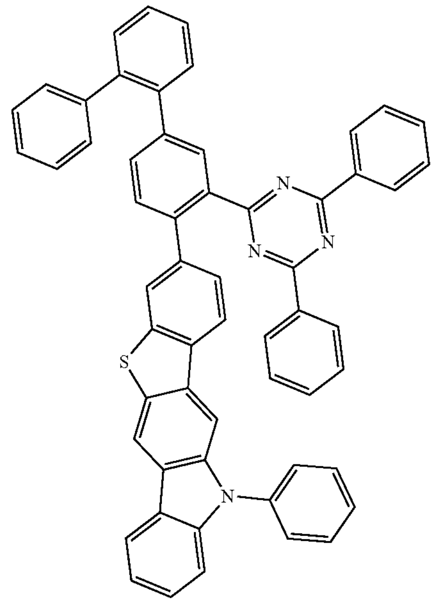
299
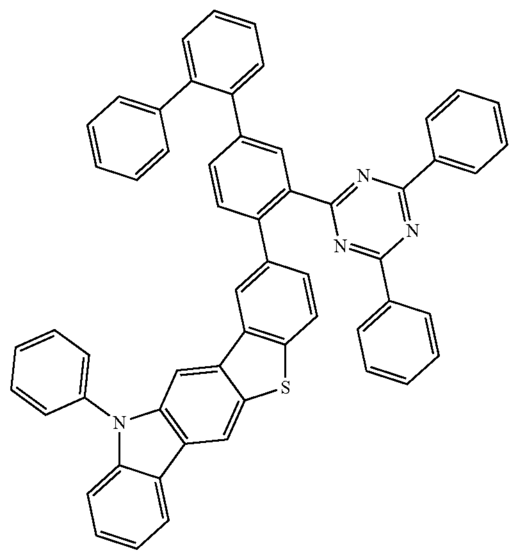
300
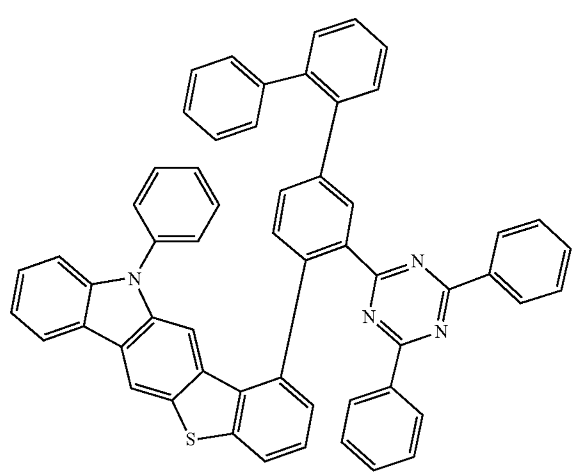

-continued
301
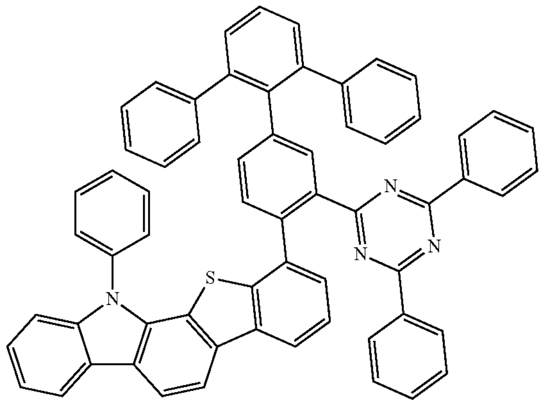
302
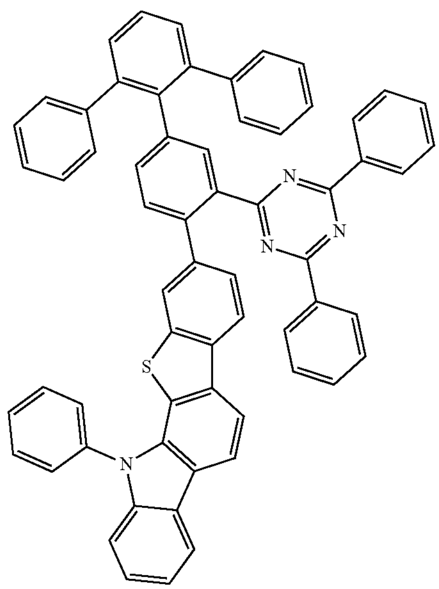
303
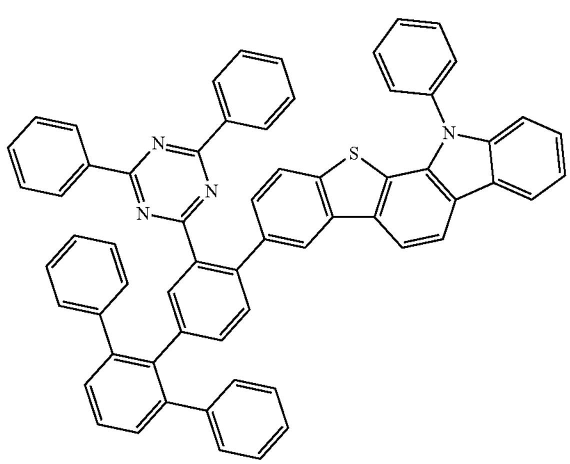
-continued
304
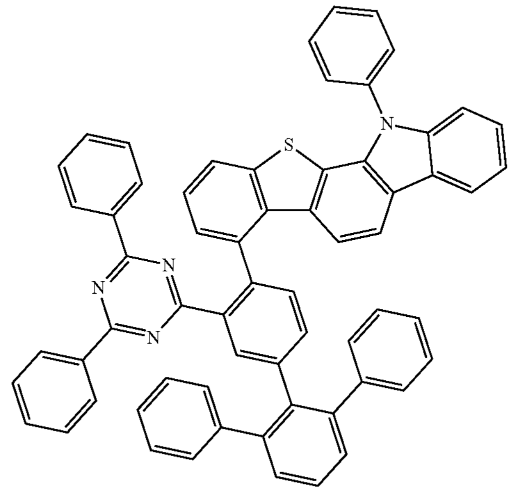
305
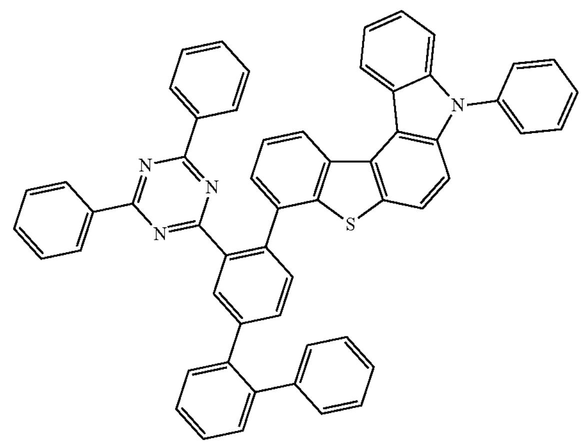
306
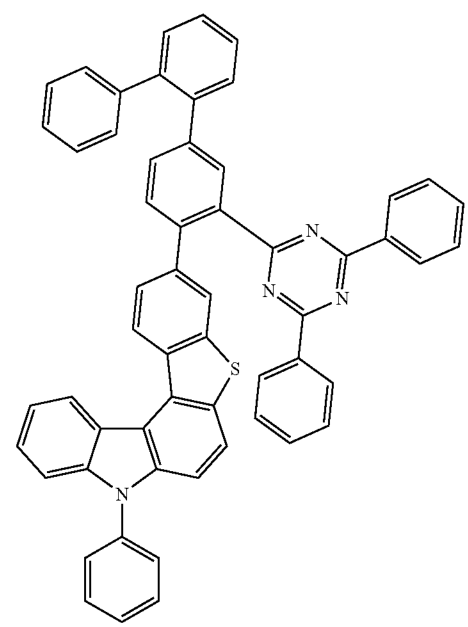

-continued
307
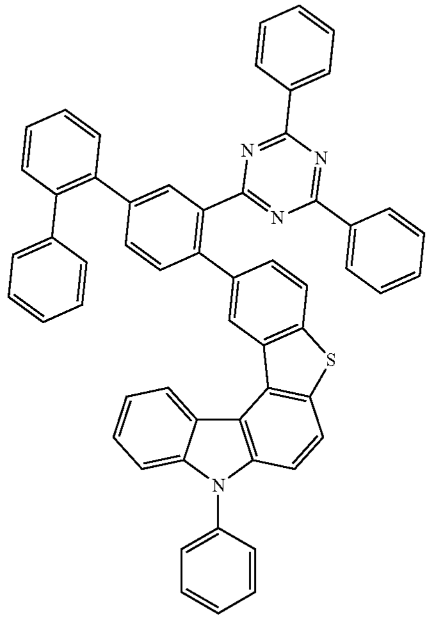
308
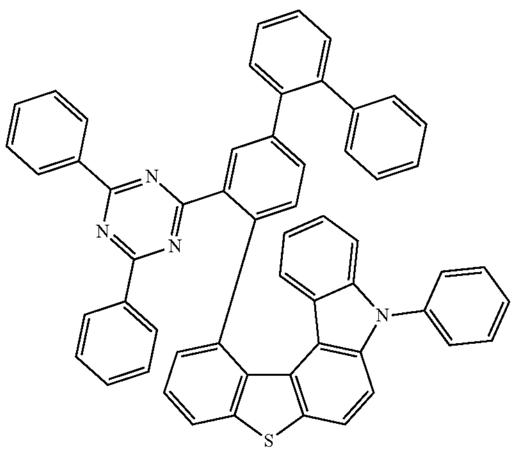
309
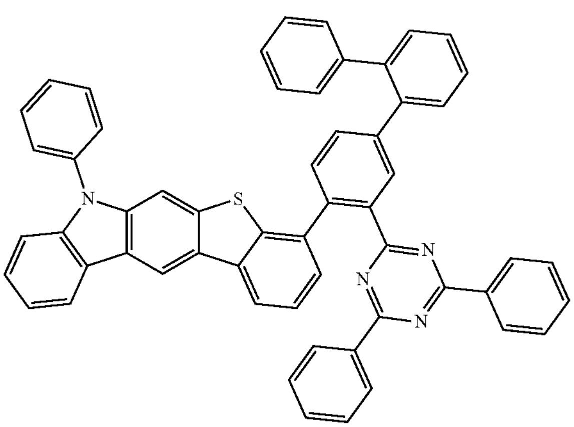
-continued
310
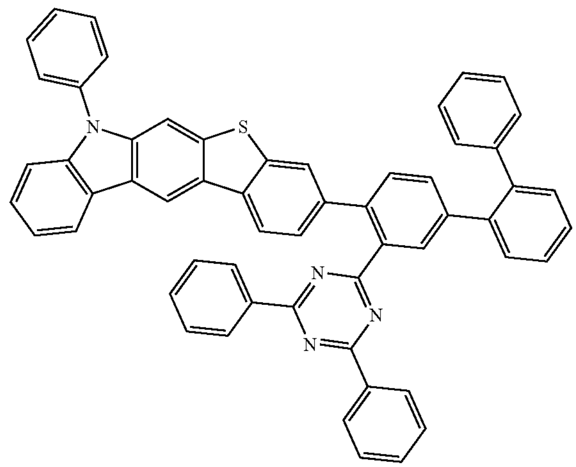
311
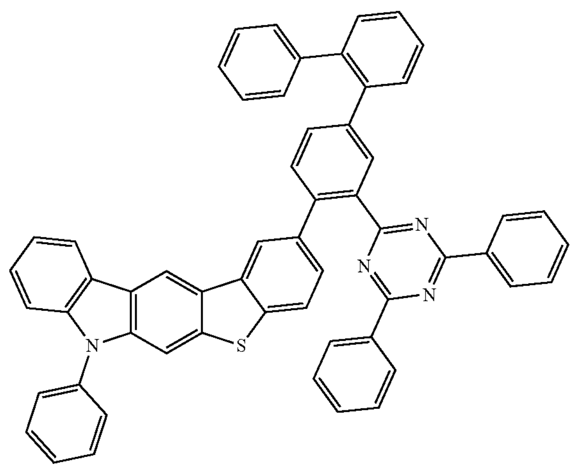
312
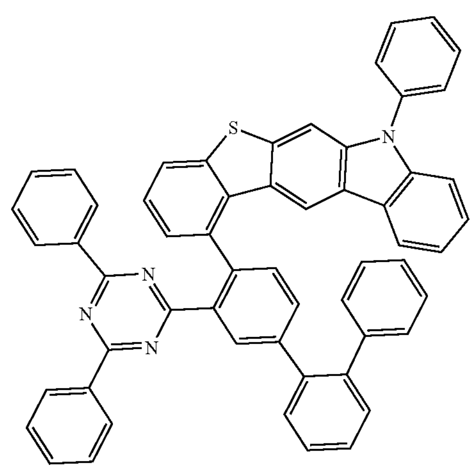

-continued
313
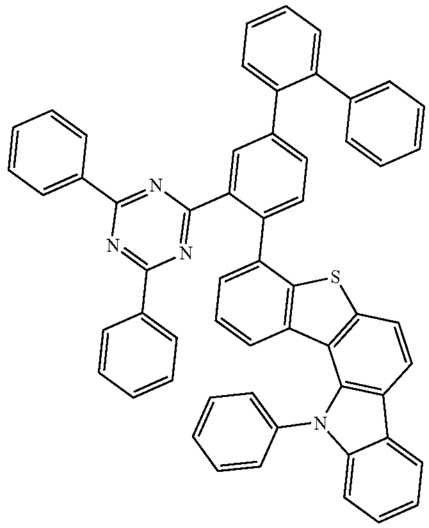
314
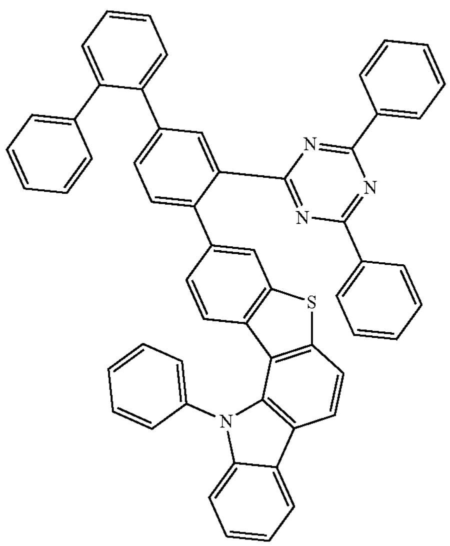
315
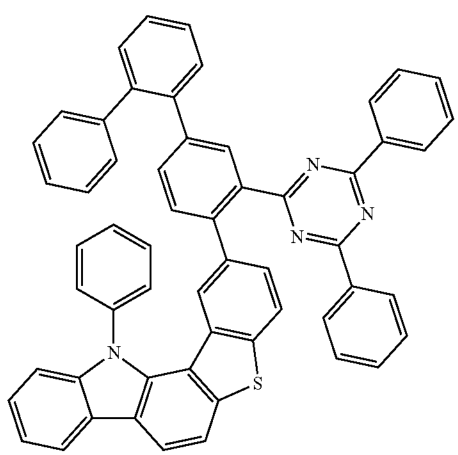
-continued
316
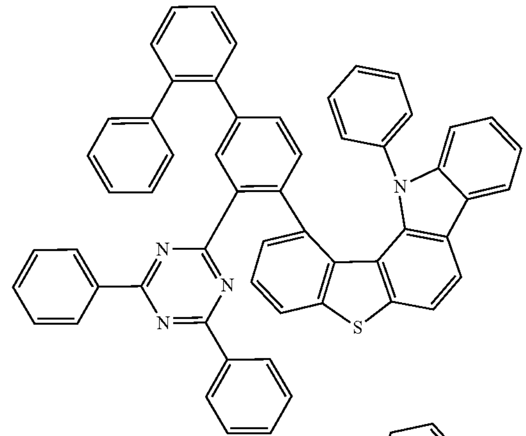
317
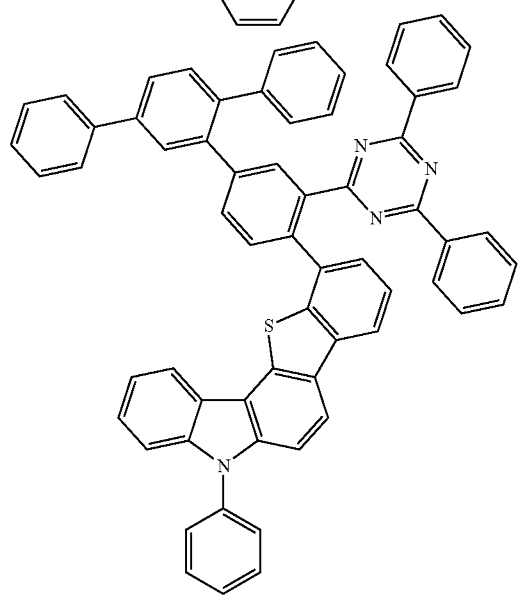
318
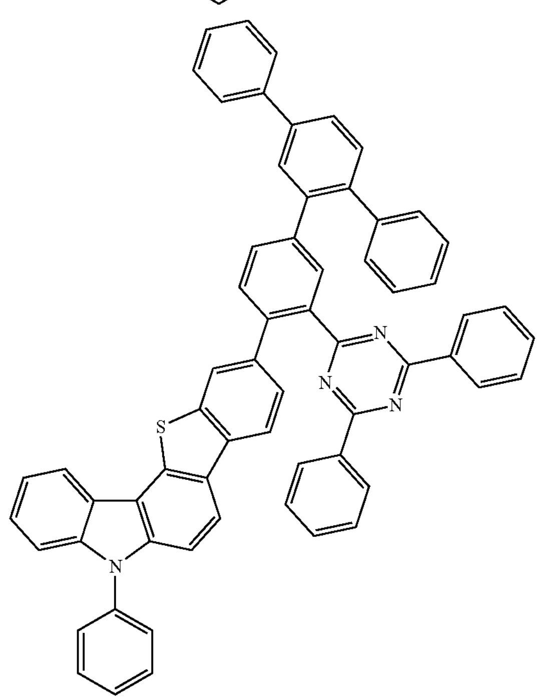

-continued
319
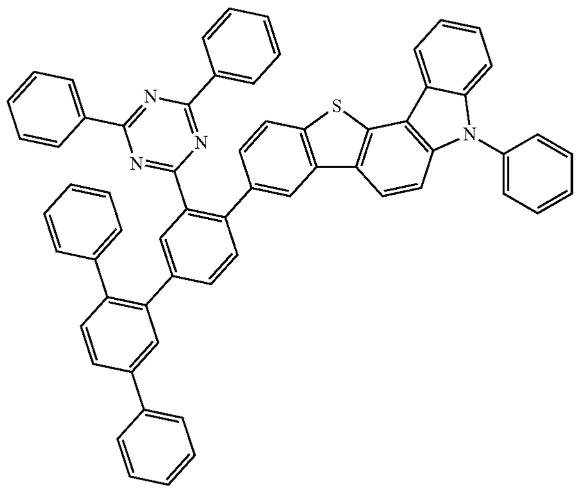
320
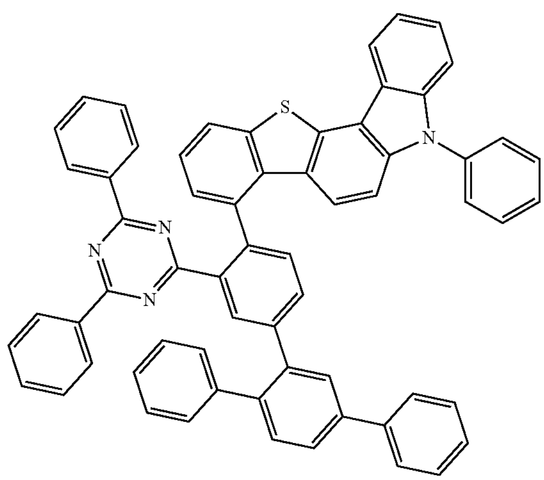
321
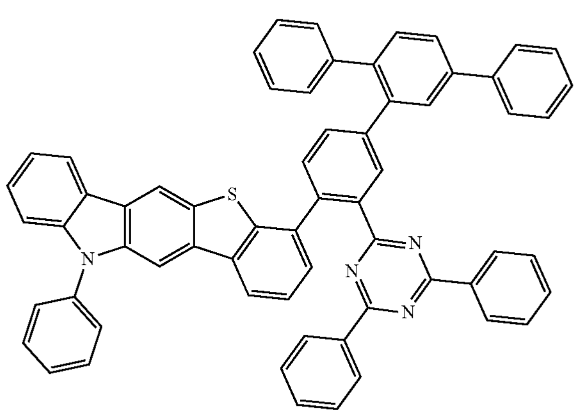
-continued
322
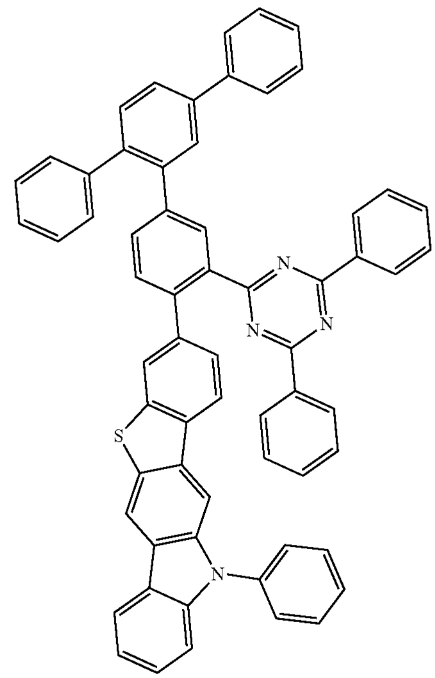
323
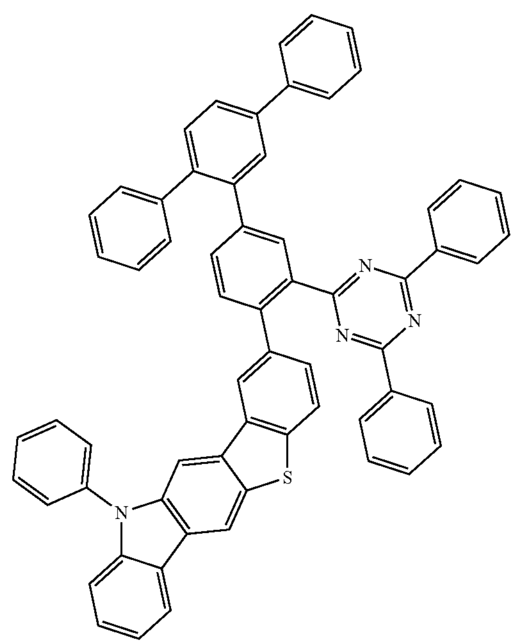

-continued
324
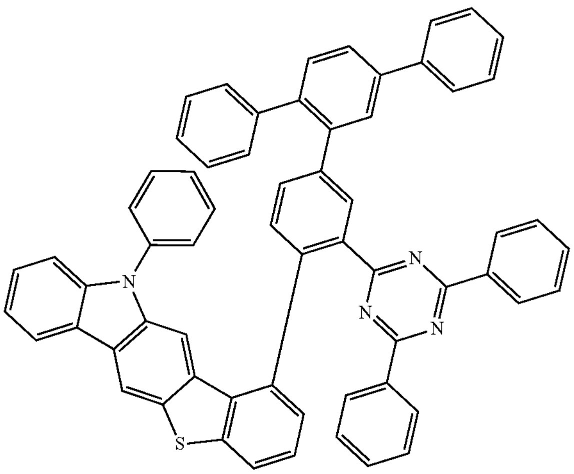
325
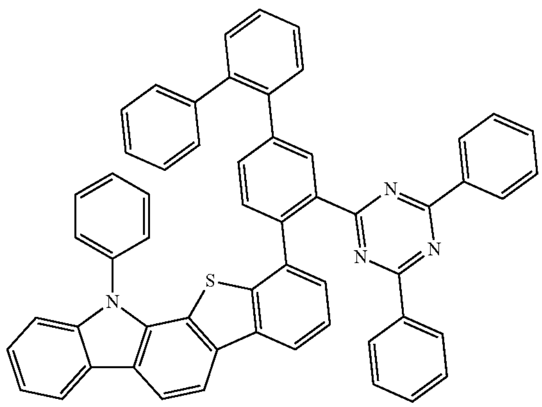
326
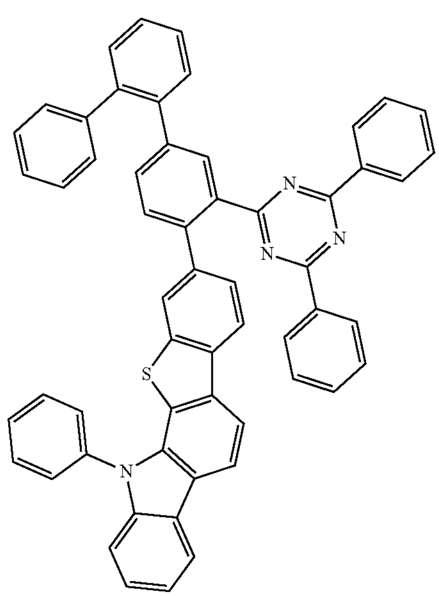
-continued
327
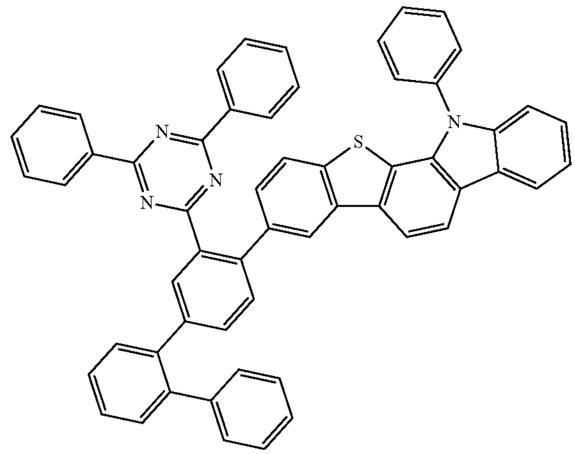
328
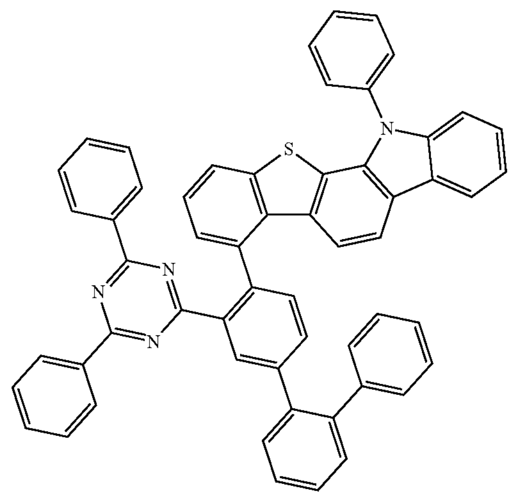
329
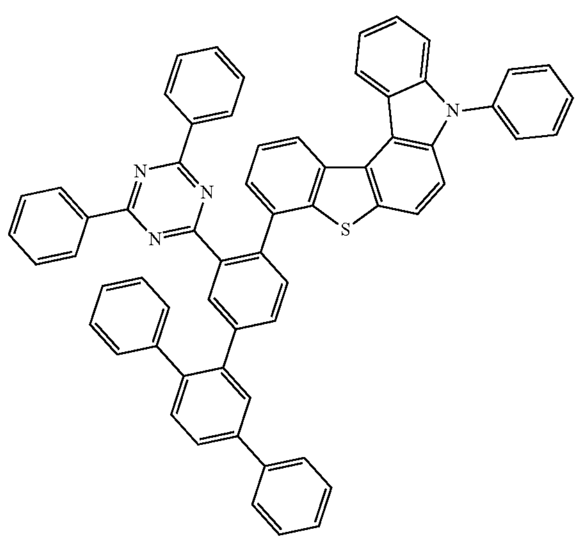

330
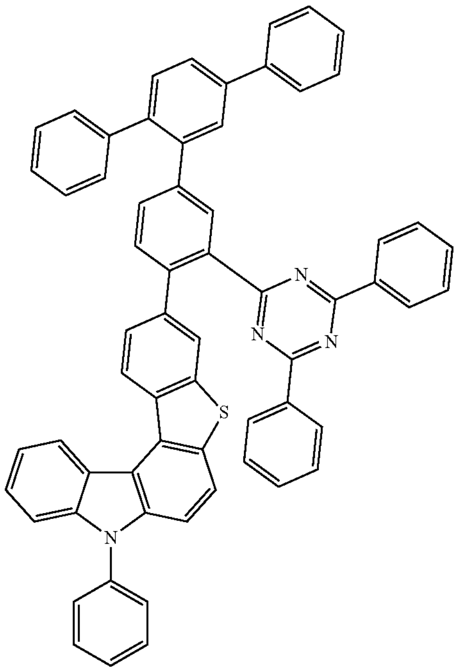
331
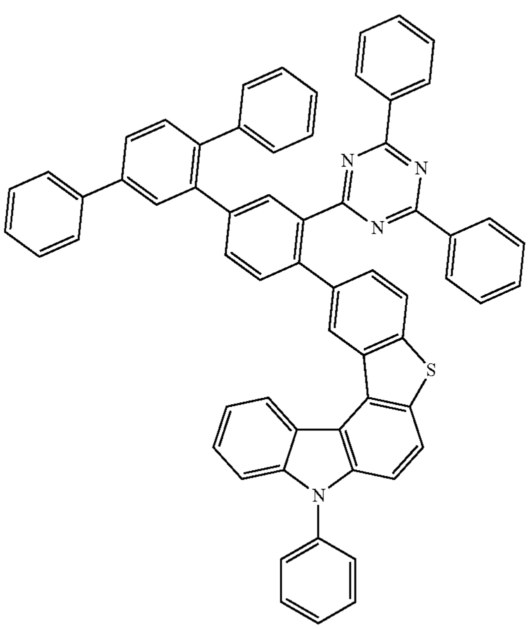
332
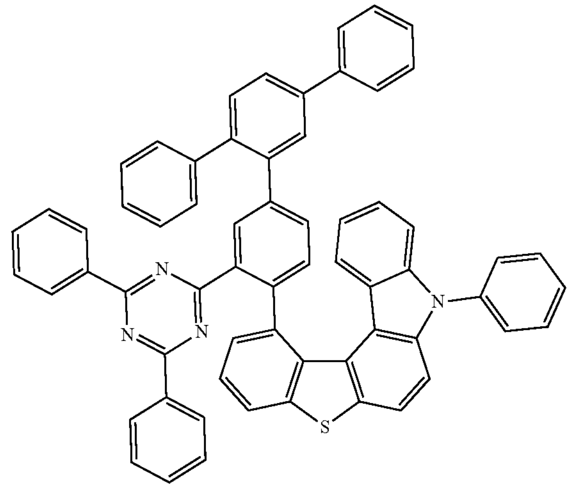
333
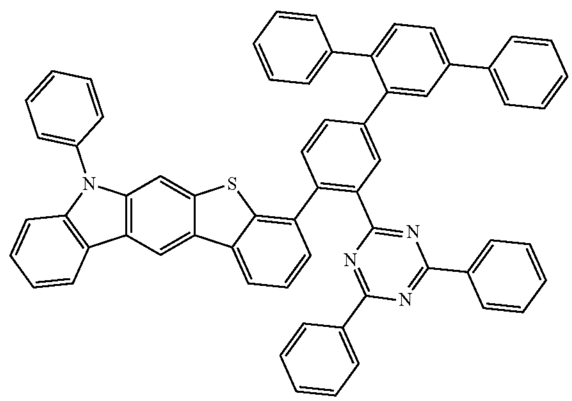
334
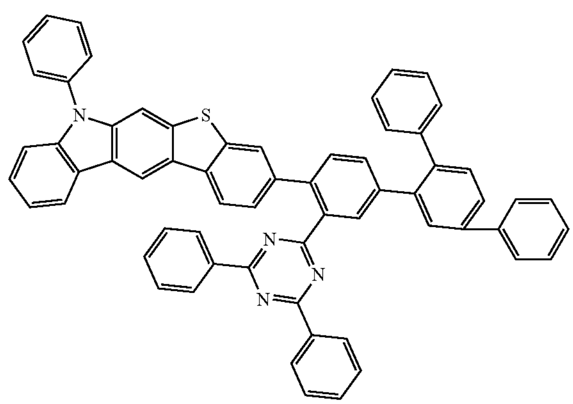

335
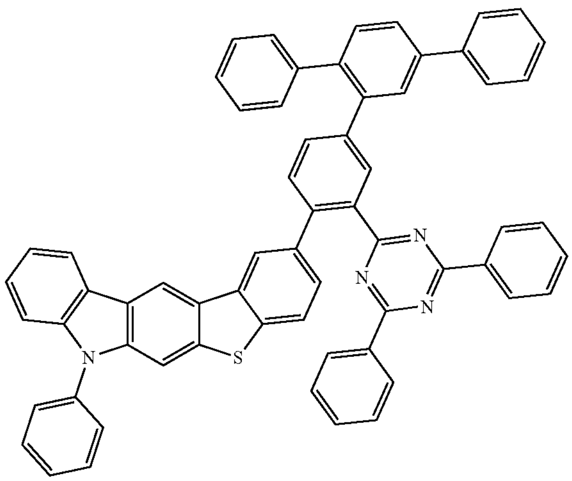
337
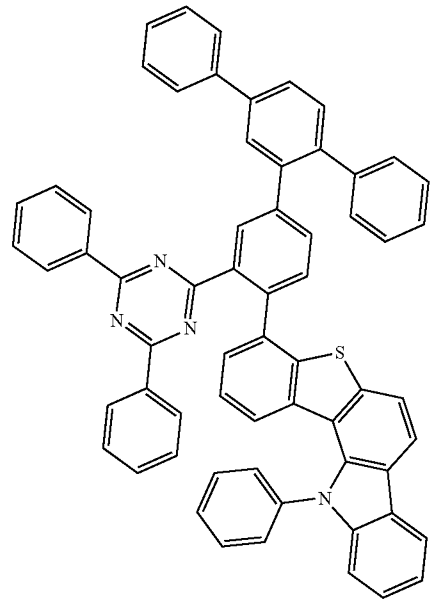
336
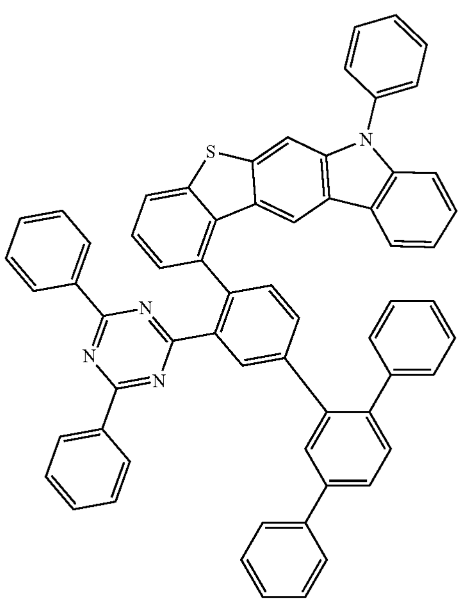
338
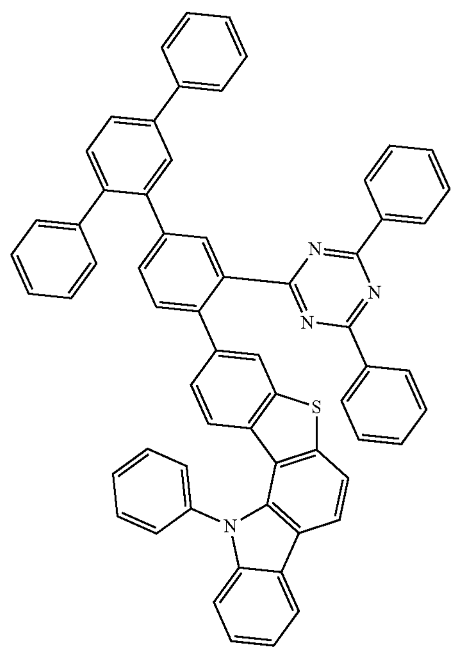

-continued
339
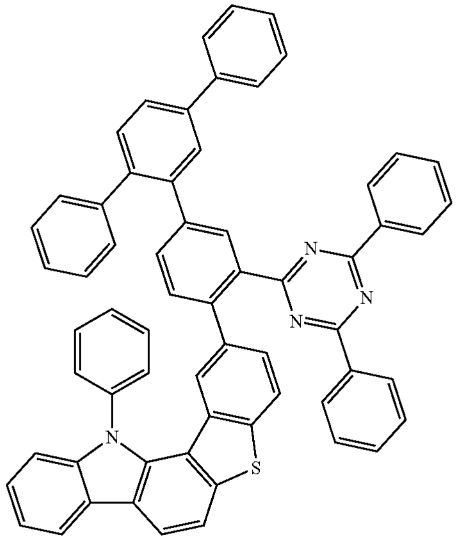
340
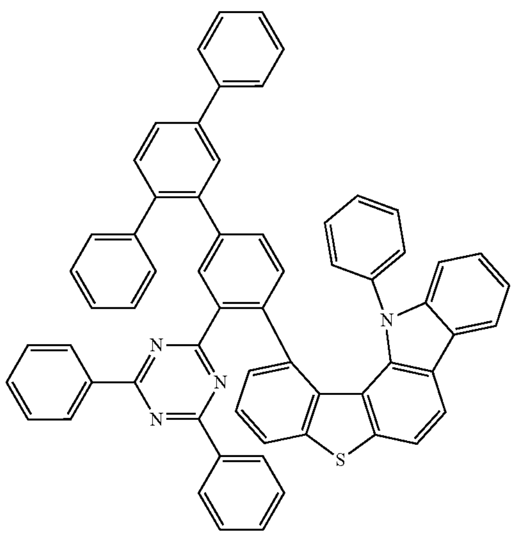
341
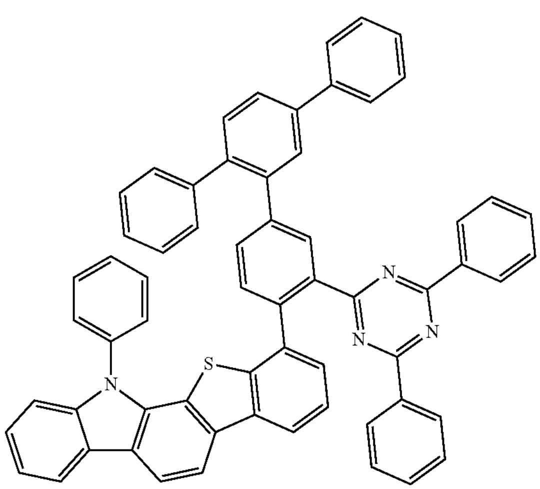
-continued
342
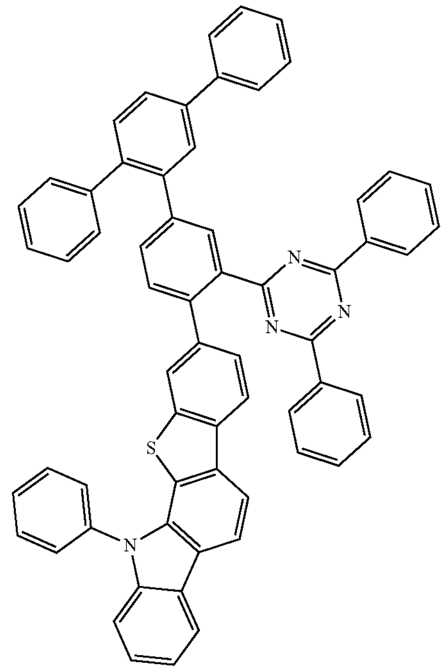
343
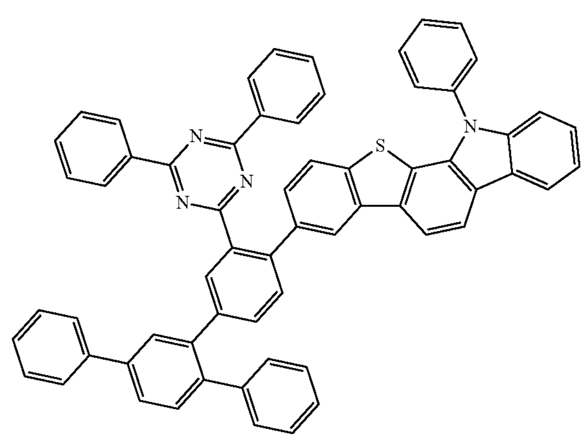

-continued
344
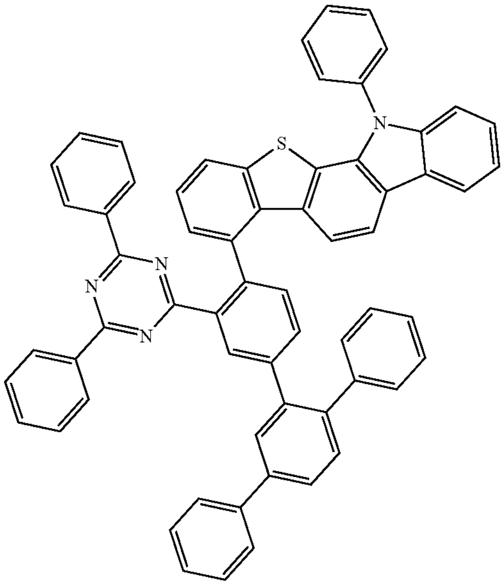
345
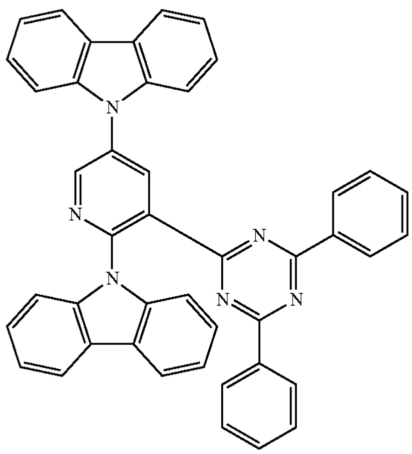
346
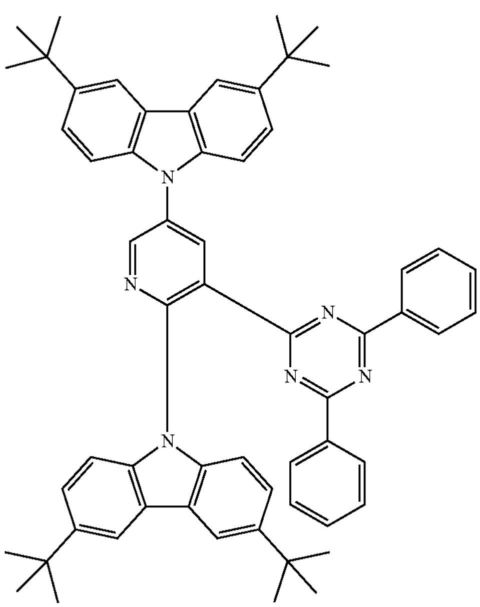
-continued
347
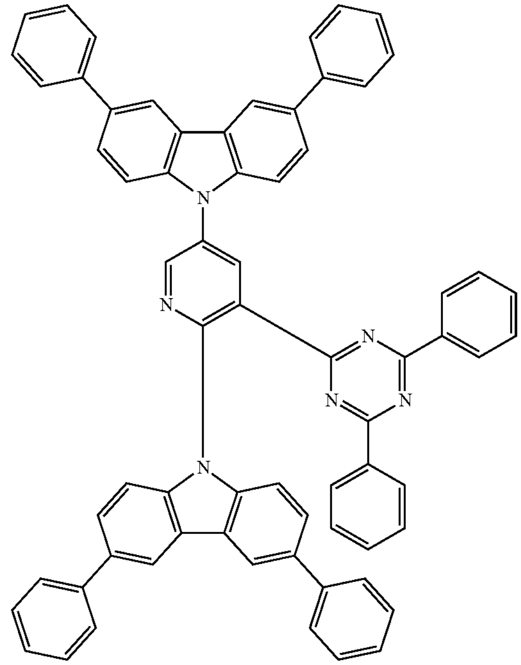
348
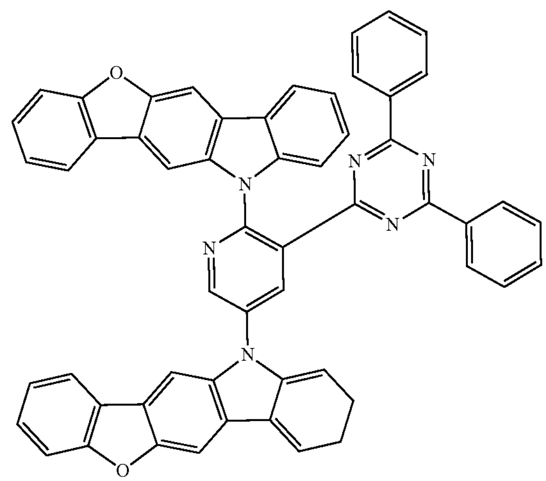
349
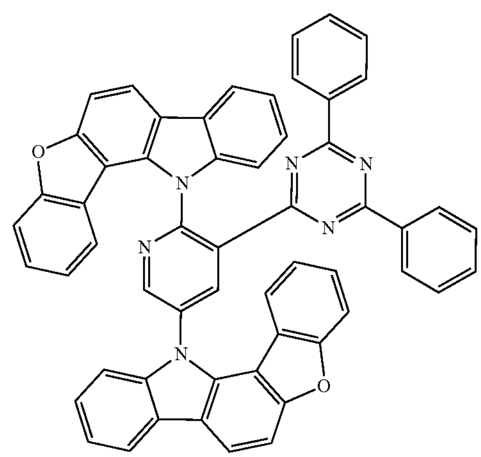

-continued
350
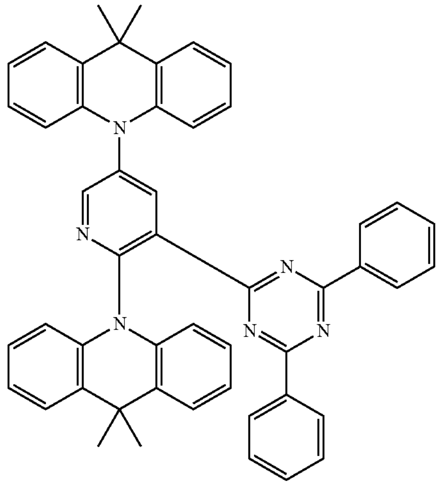
351
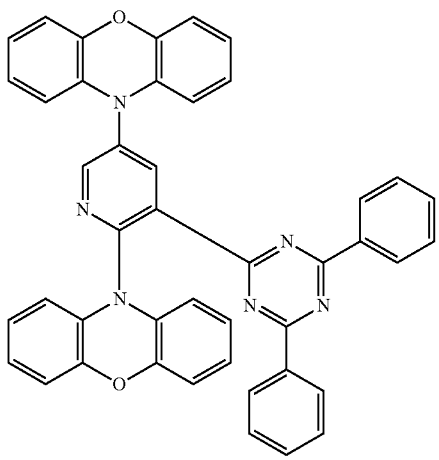
352
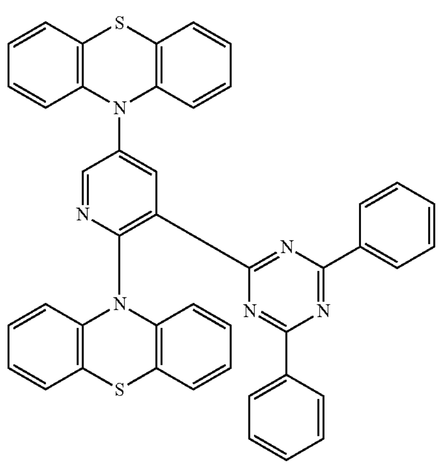
-continued
353
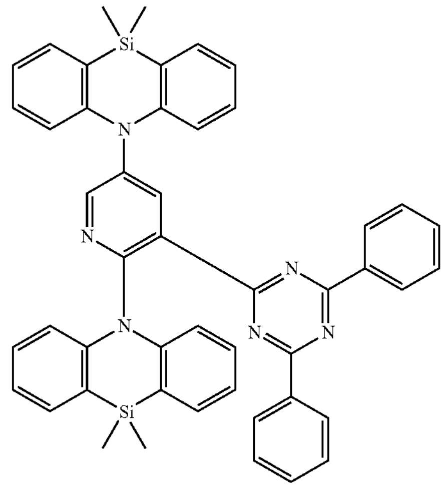
354
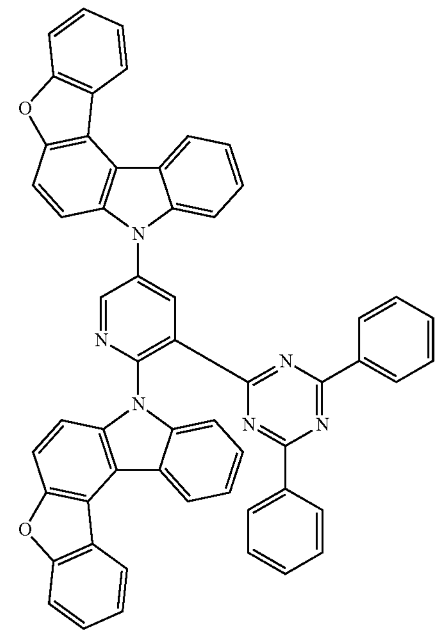
355
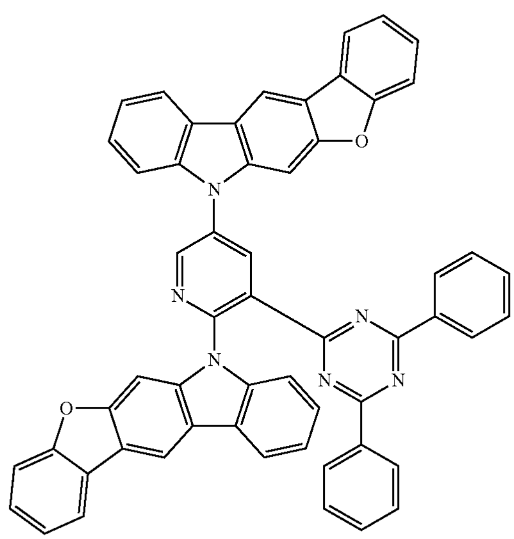

-continued
356
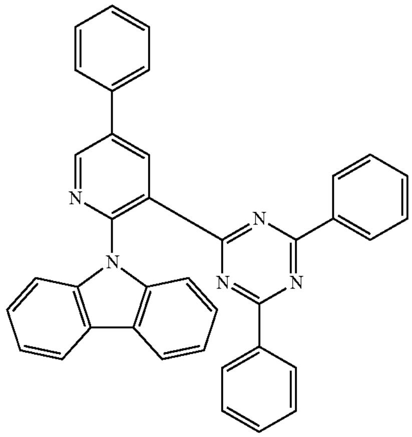
357
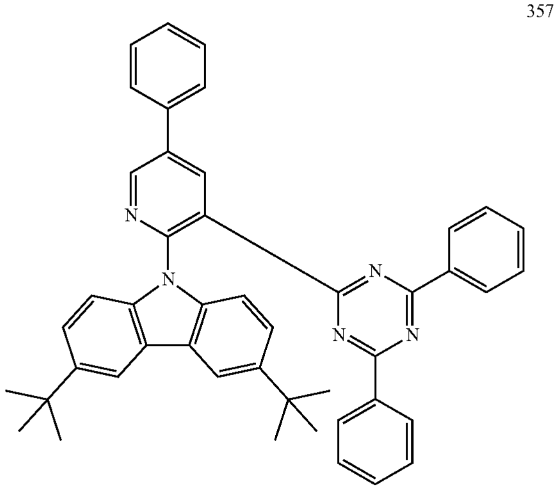
358
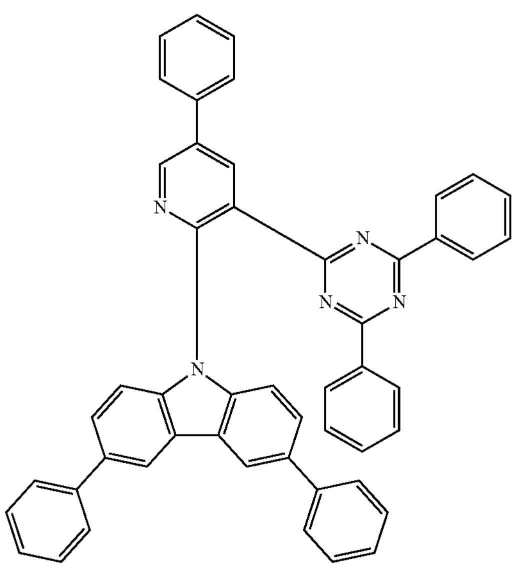
-continued
359
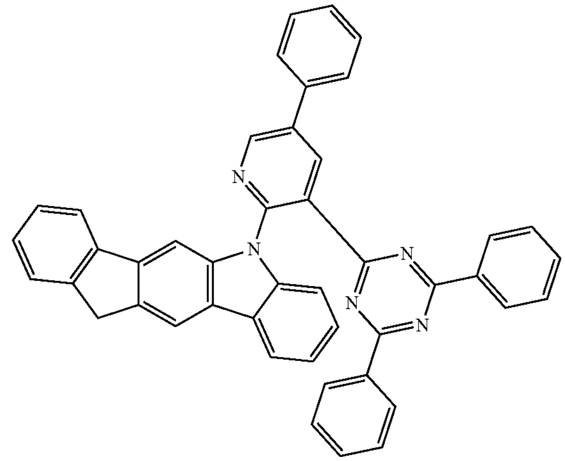
360
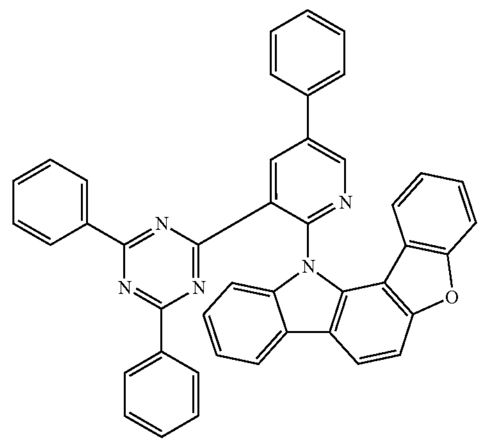
361
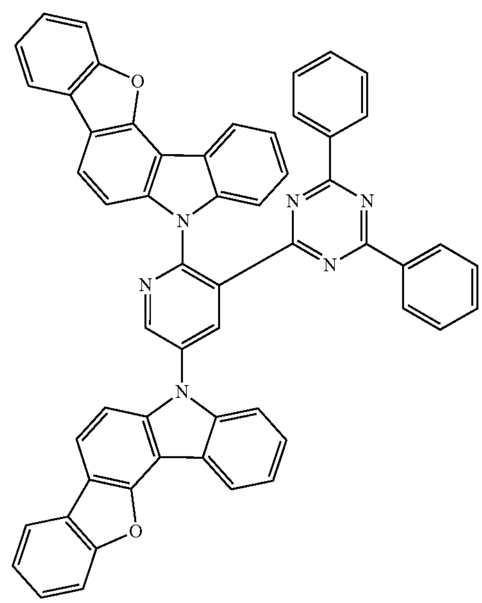

-continued
362
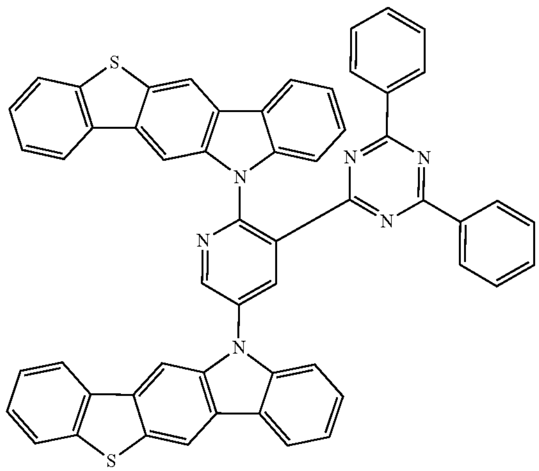
363
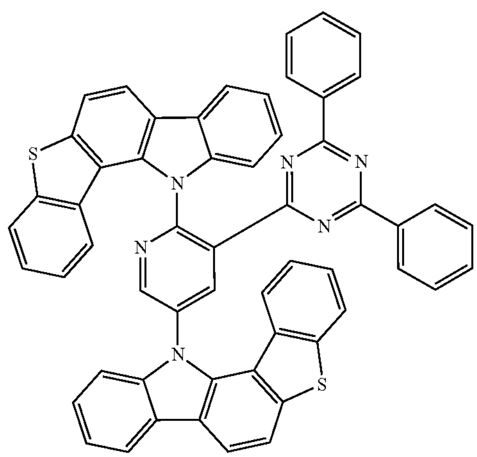
364
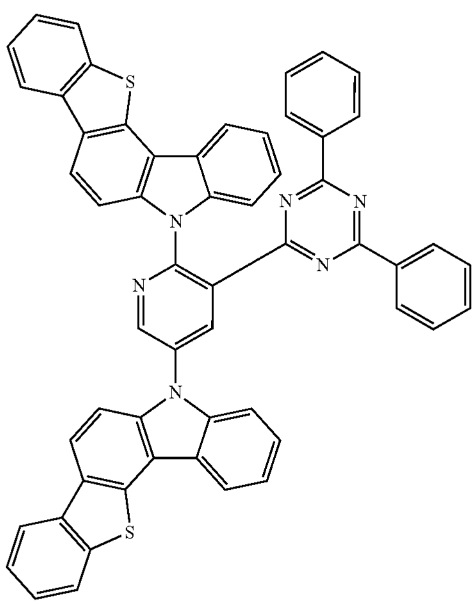
-continued
365
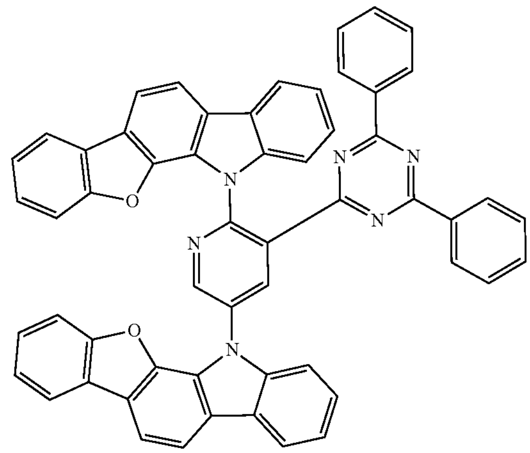
366
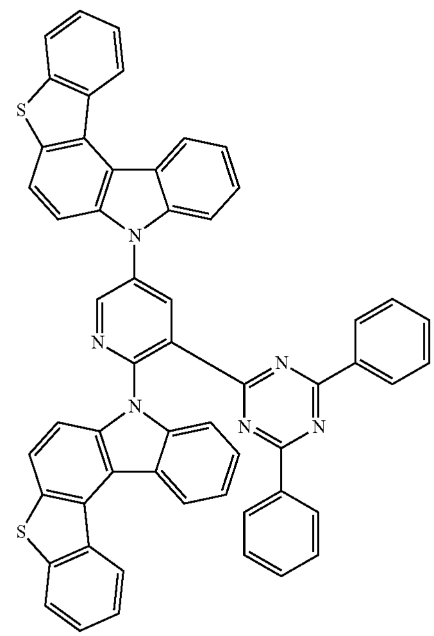
367
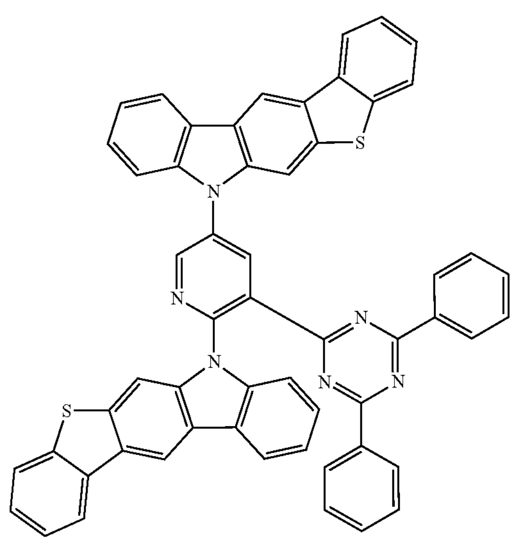

-continued
368
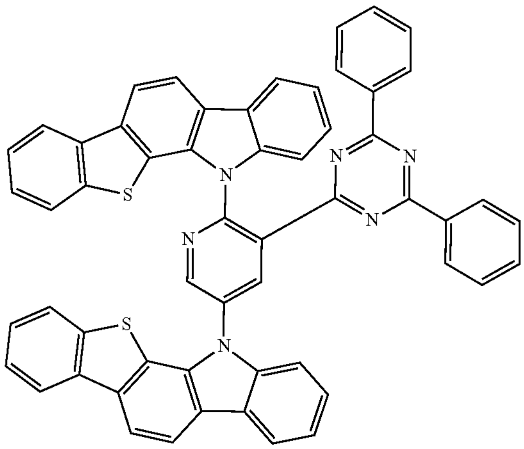
369
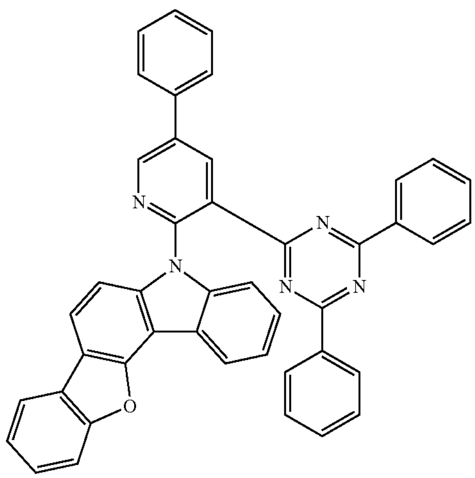
370
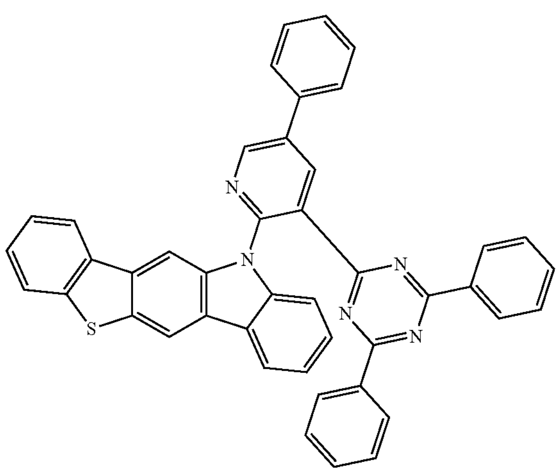
-continued
371
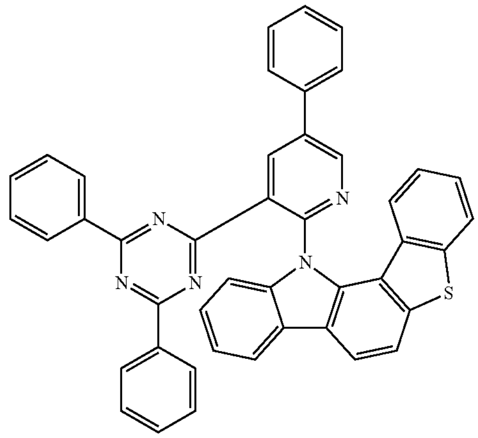
372
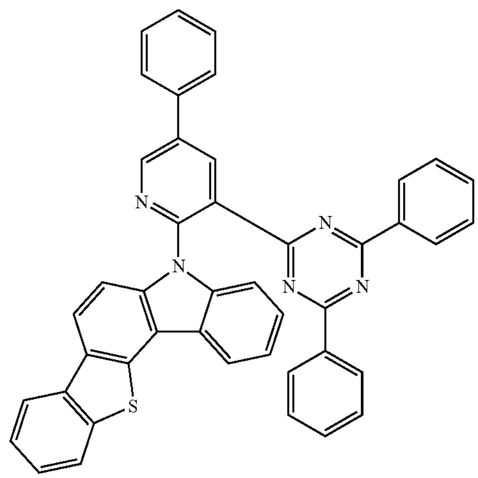
373
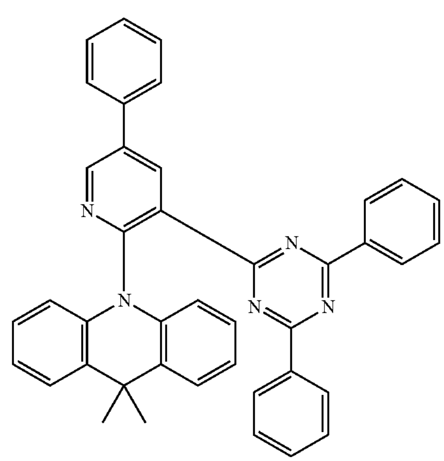

374
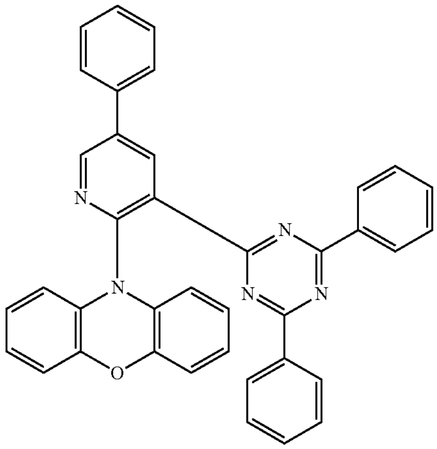
375
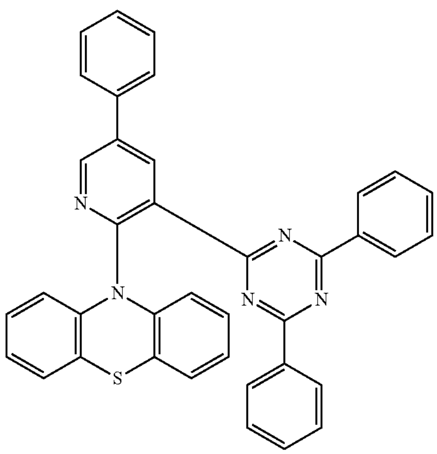
376
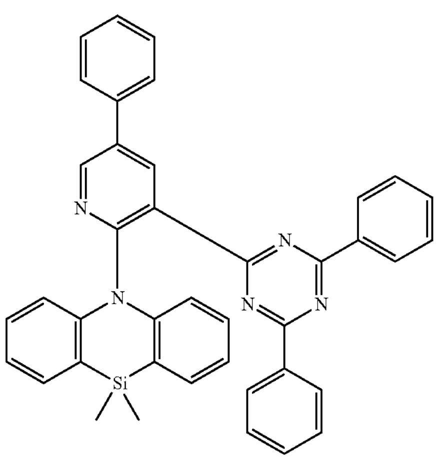
377
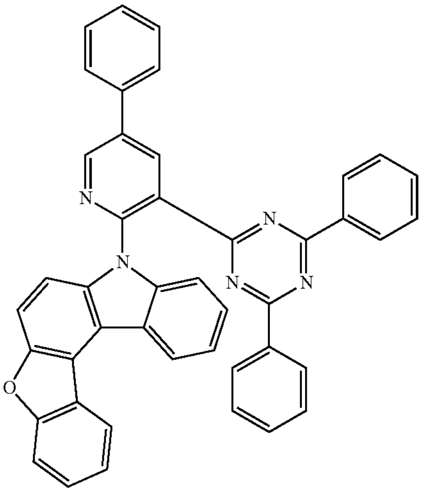
378
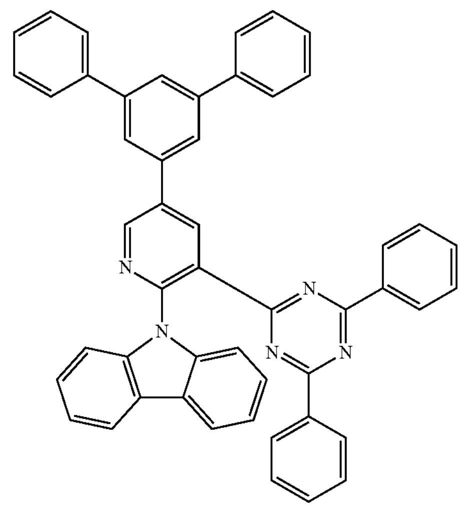
379
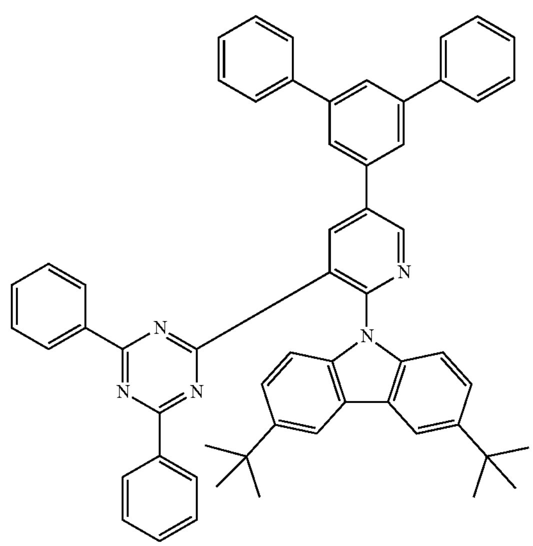

380
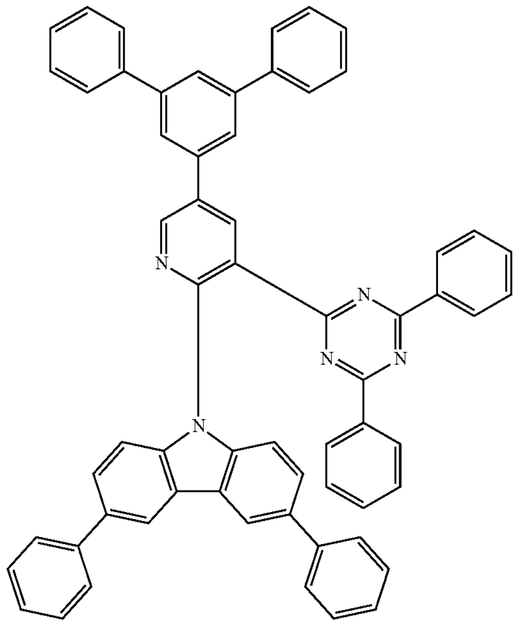
381
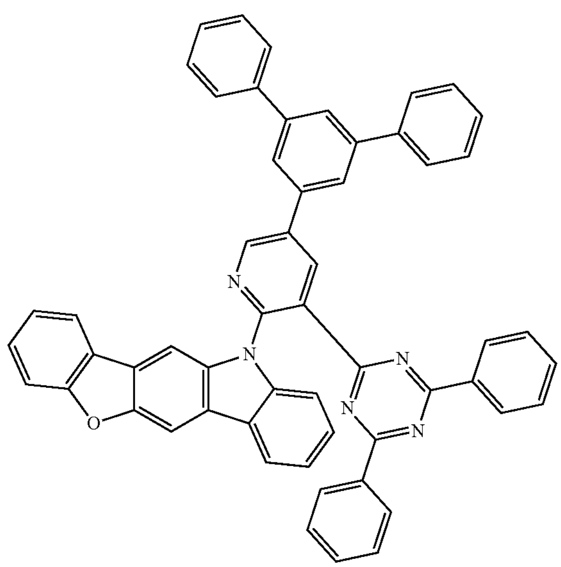
382
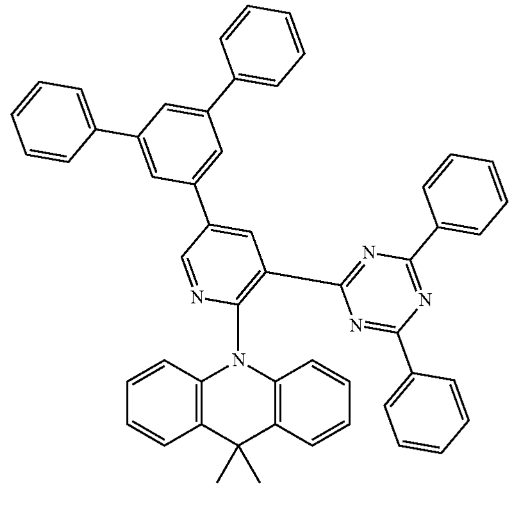
383
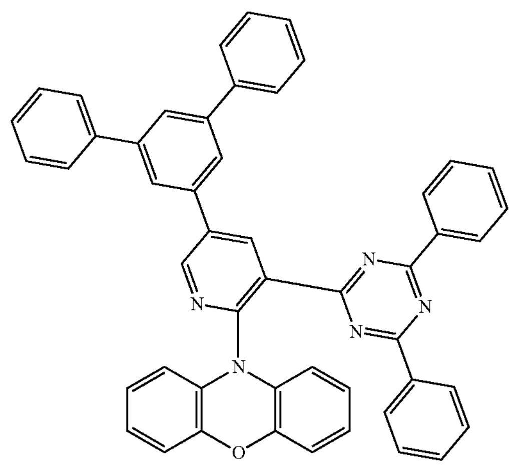
384
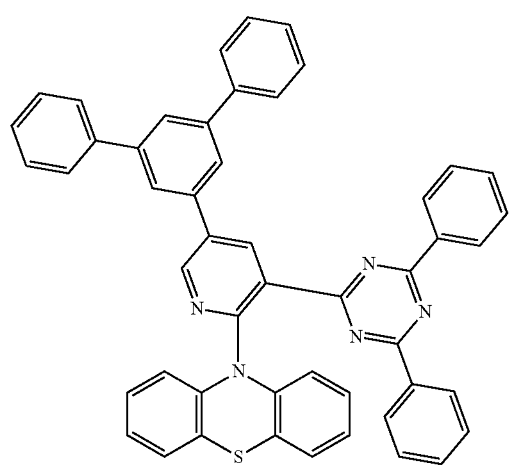

-continued
385
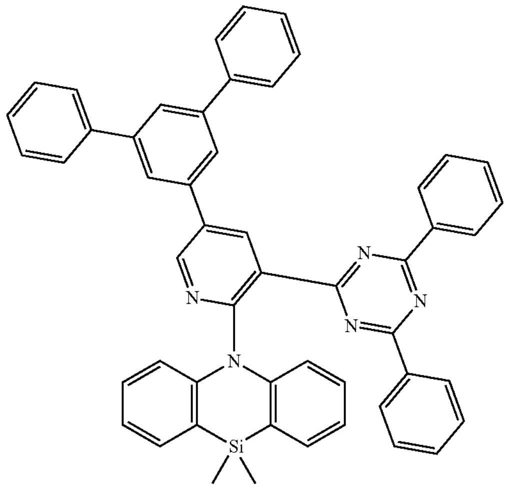
386
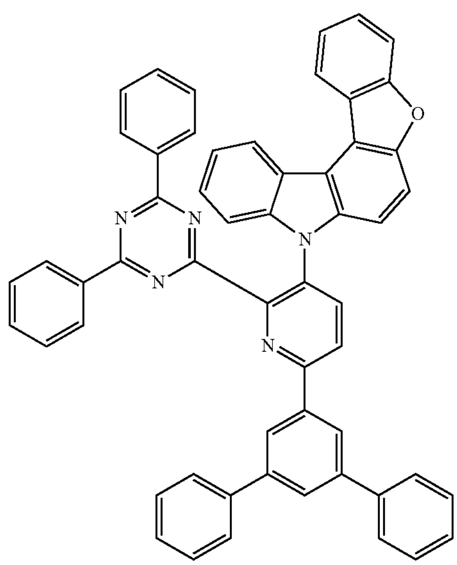
387
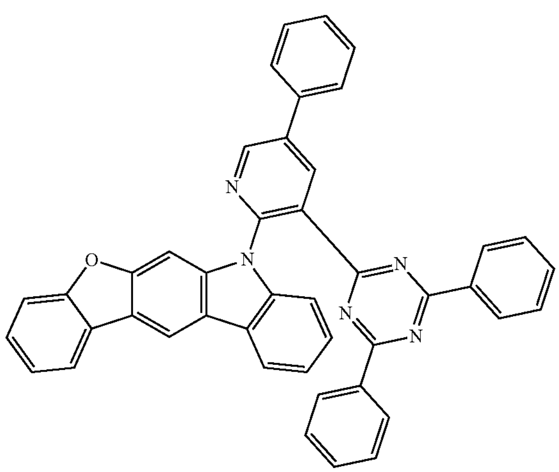
-continued
388
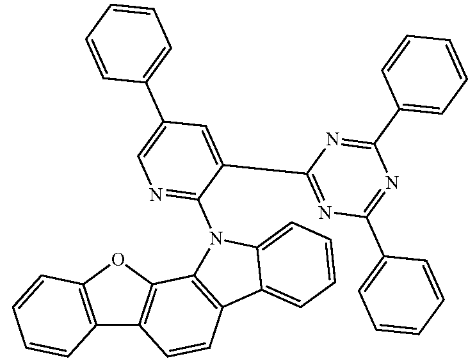
389
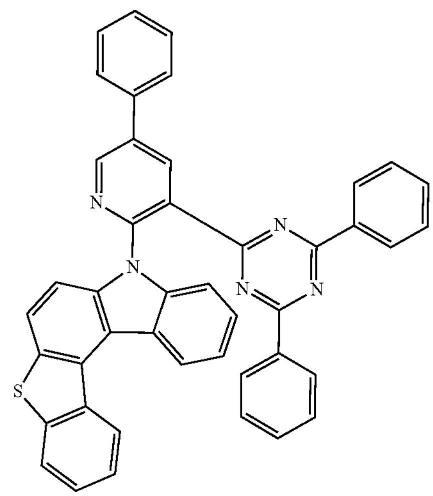
390
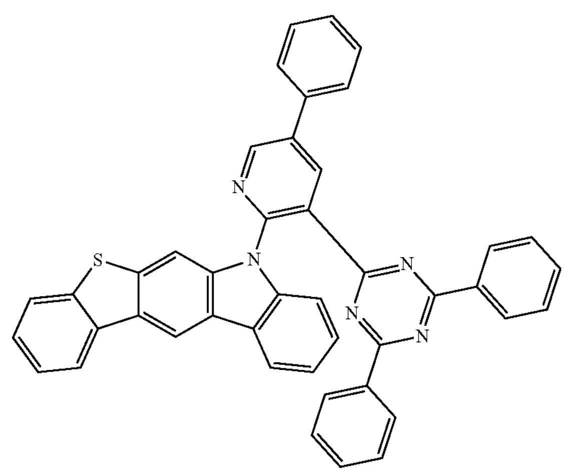

-continued
391
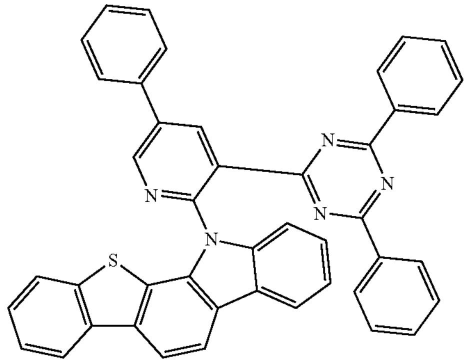
392
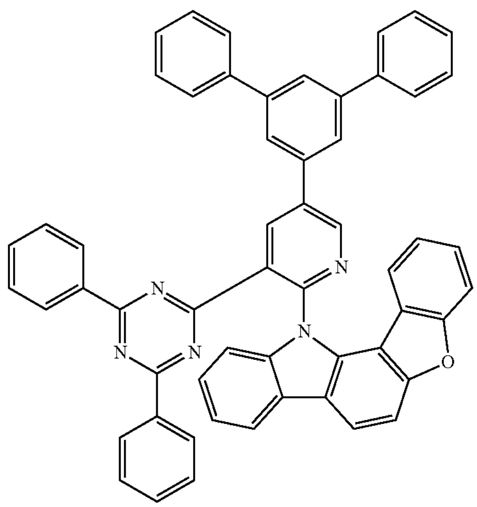
393
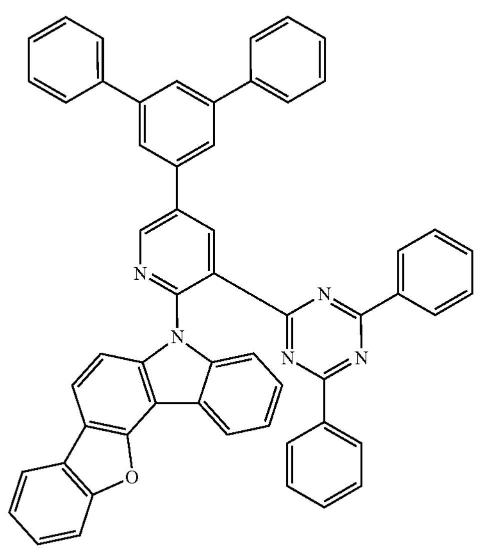
-continued
394
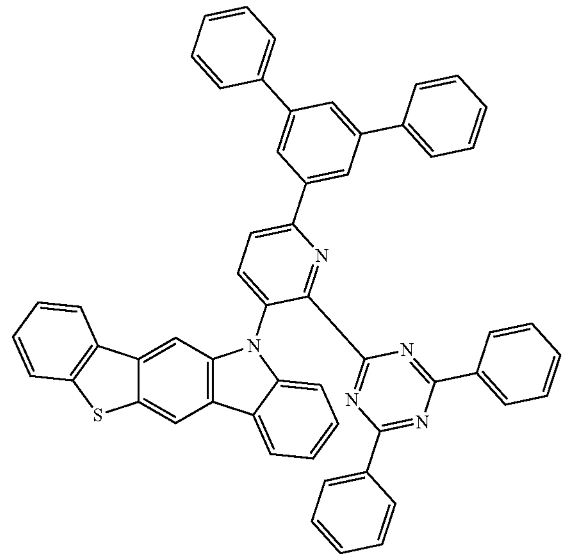
395
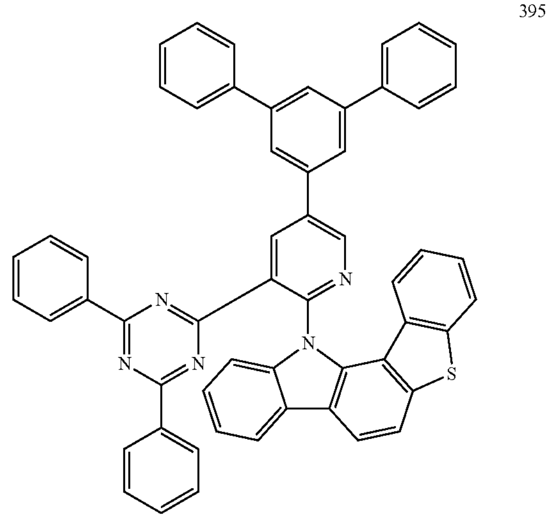 [SMILES: c1ccc(-c2cccc(-c3cnc(-n4c5ccccc5c5ccc6oc7ccccc7c6c54)c(-c4nc(-c5ccccc5)nc(-c5ccccc5)n4)c3)c2)cc1]
396
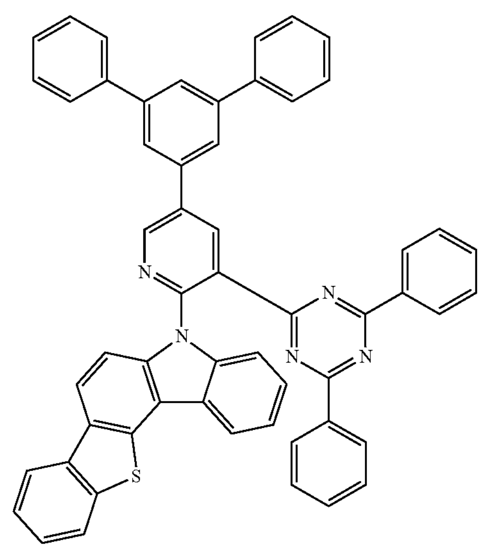

-continued
397
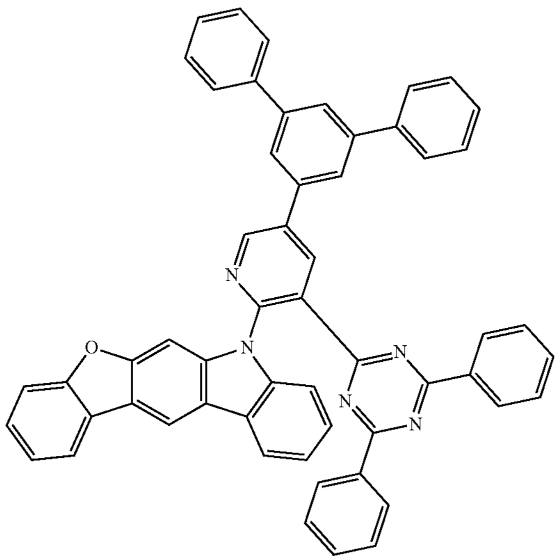
398
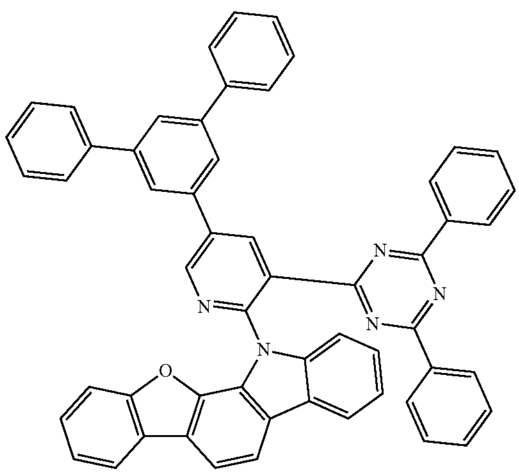
399
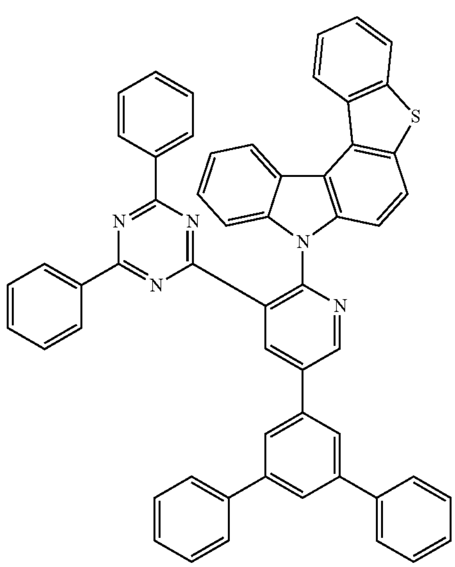
-continued
400
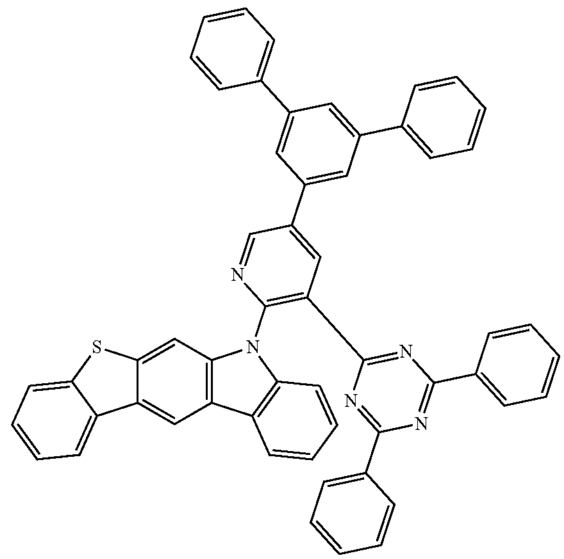
401
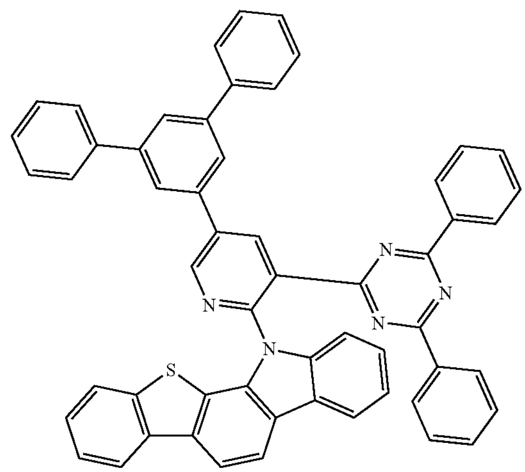
402
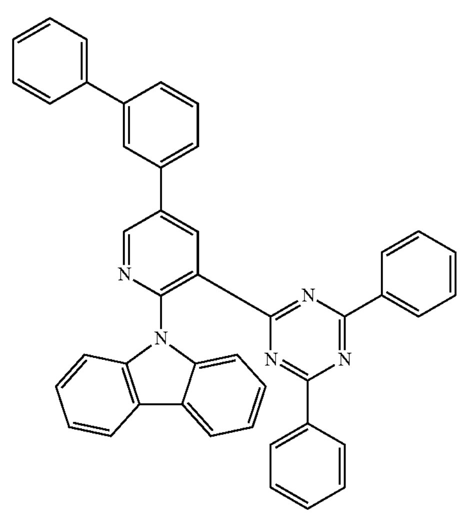

-continued
403
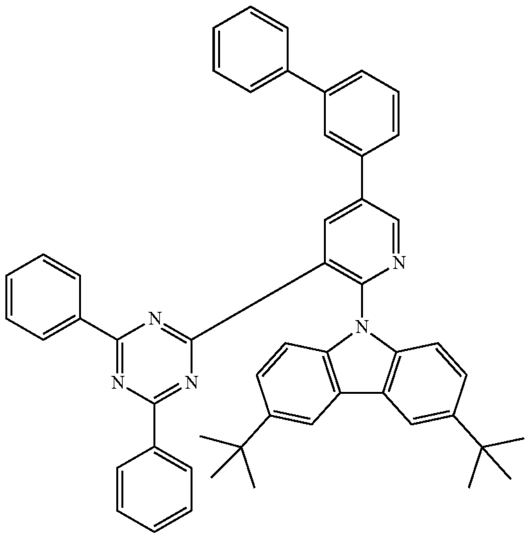
404
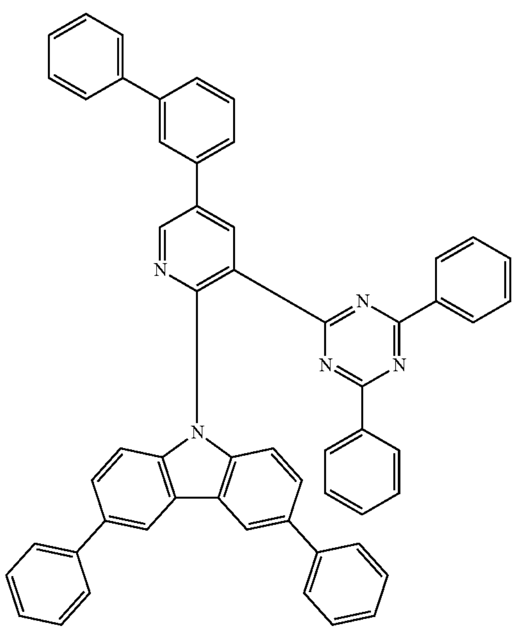
-continued
405
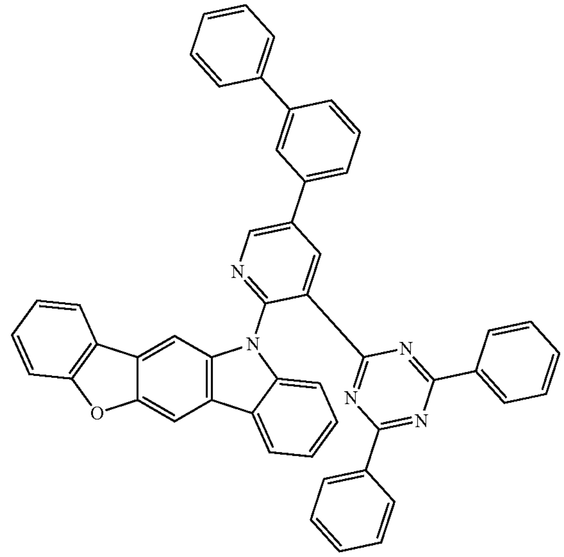
406
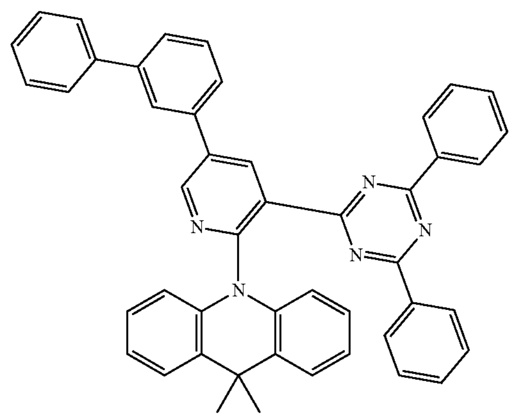
407
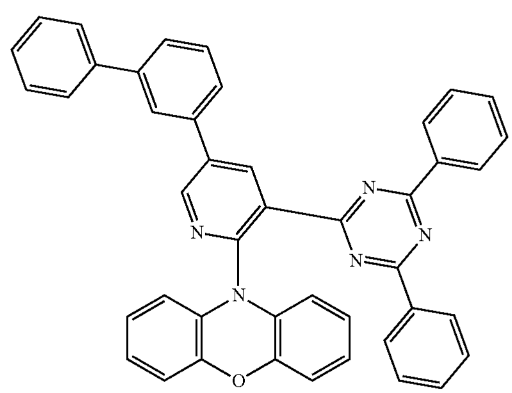

408
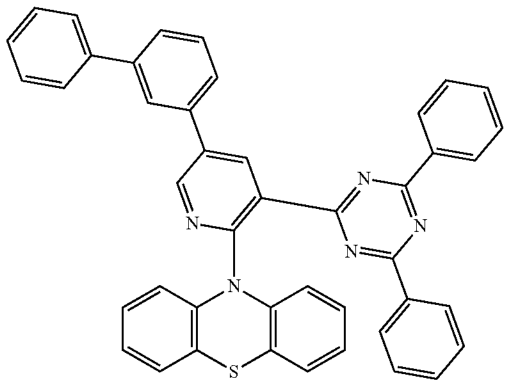
409
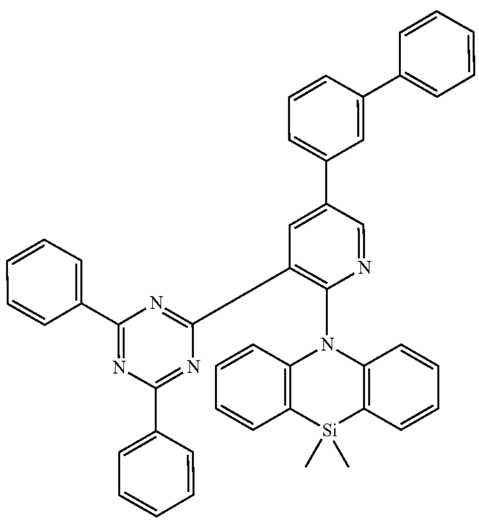
410
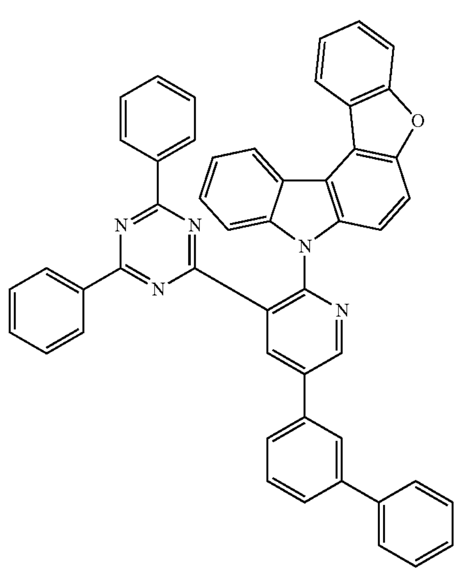
411
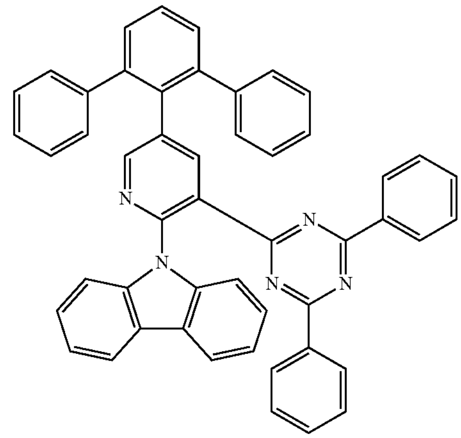
412
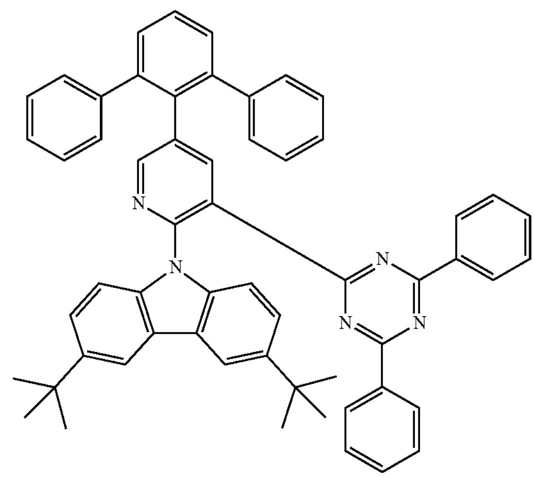
413
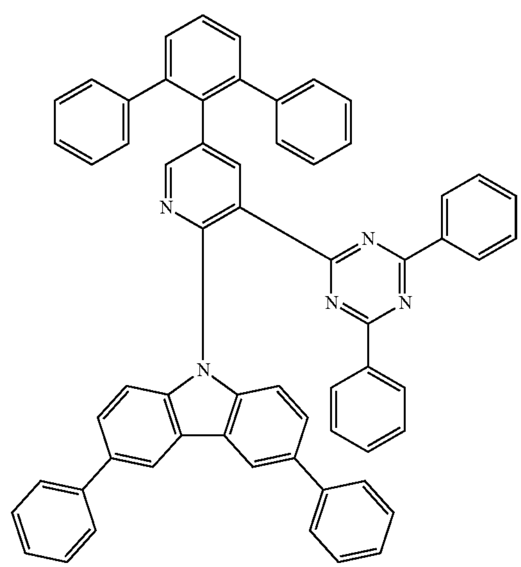

414
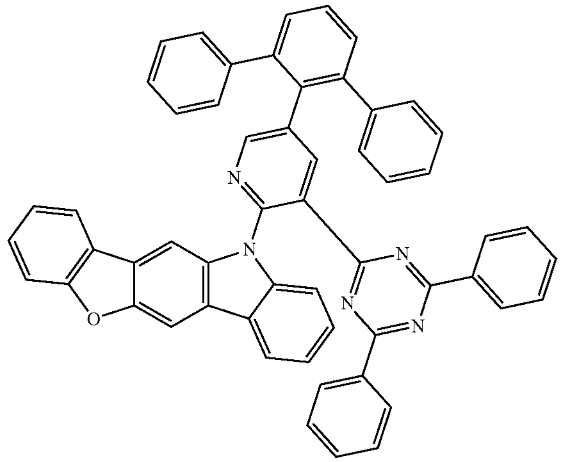
415
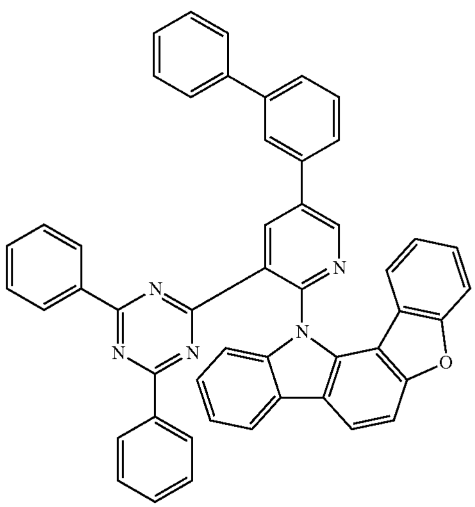
416
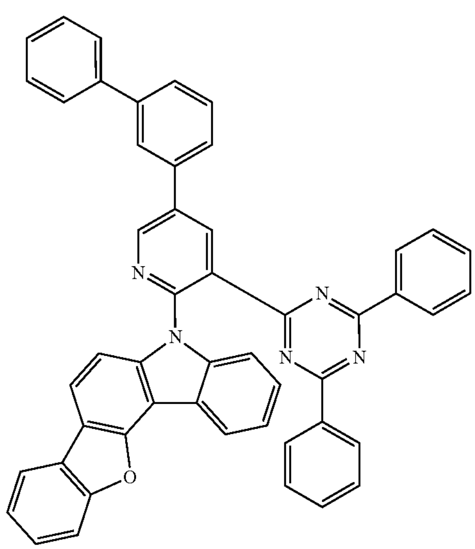
417
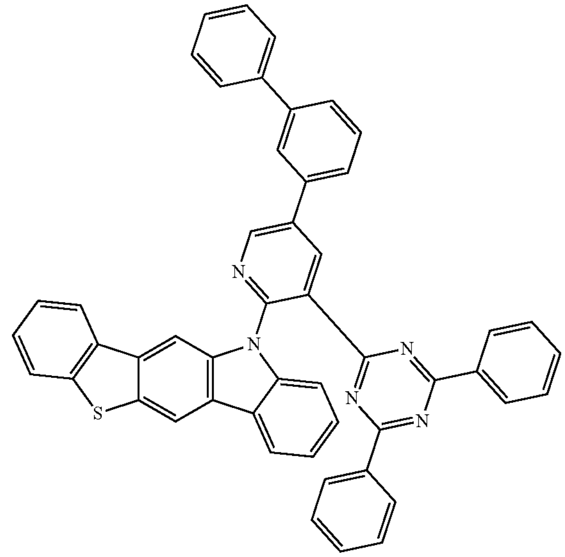
418
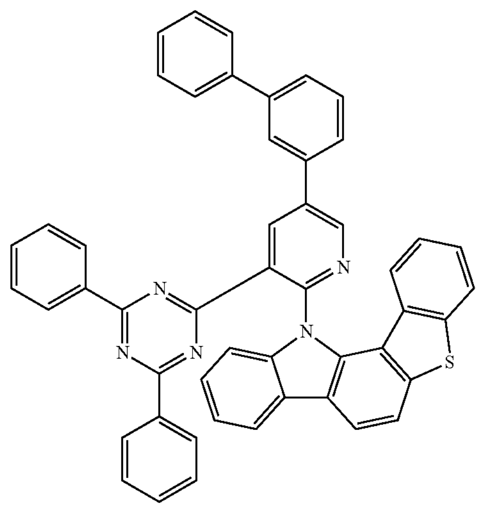
419
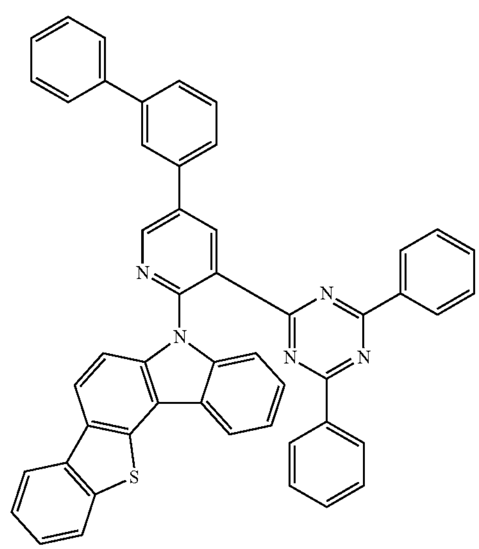

420
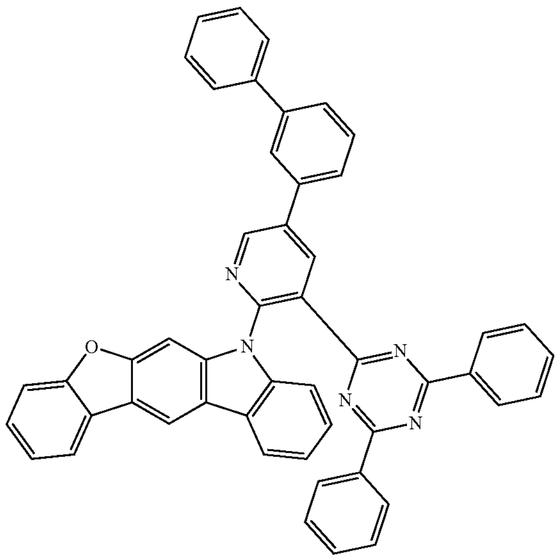
421
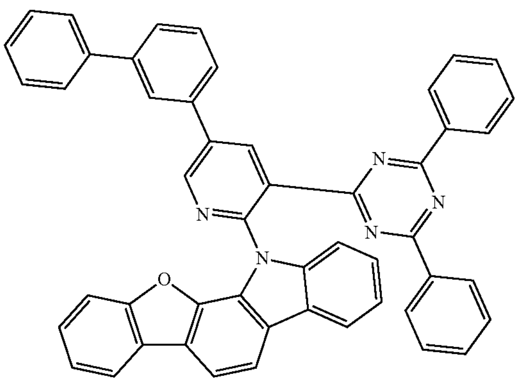
423
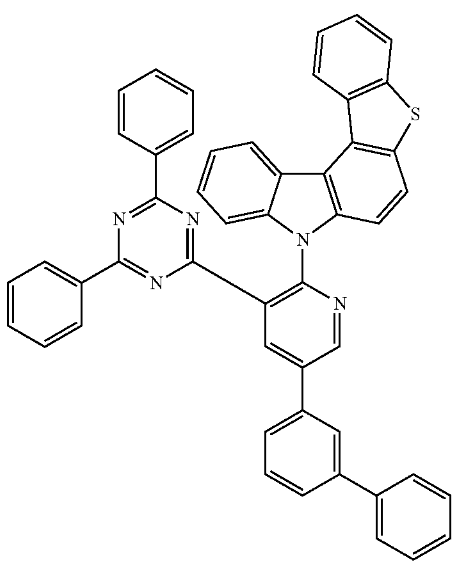
424
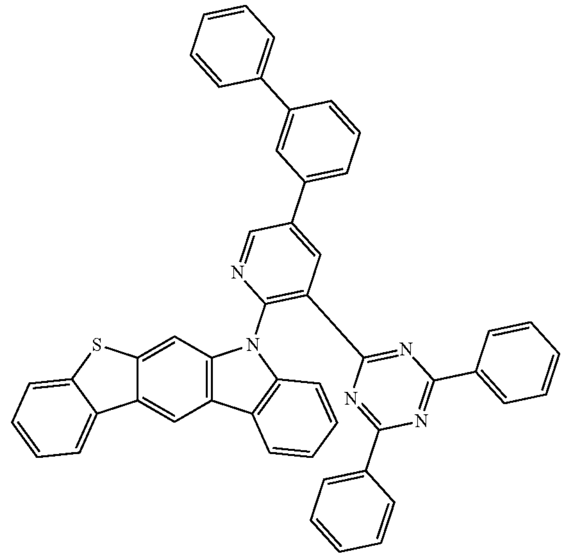
425
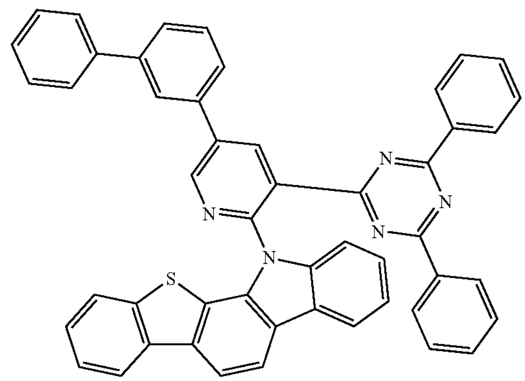
426
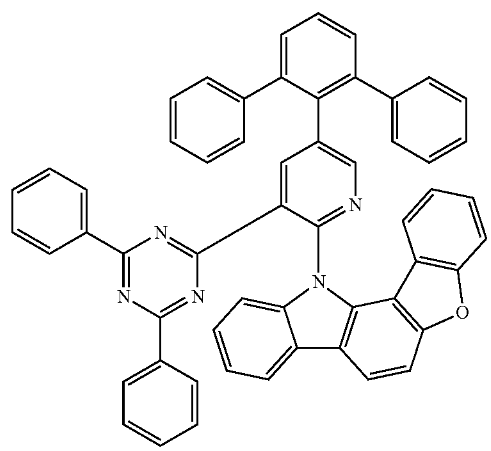

-continued
427
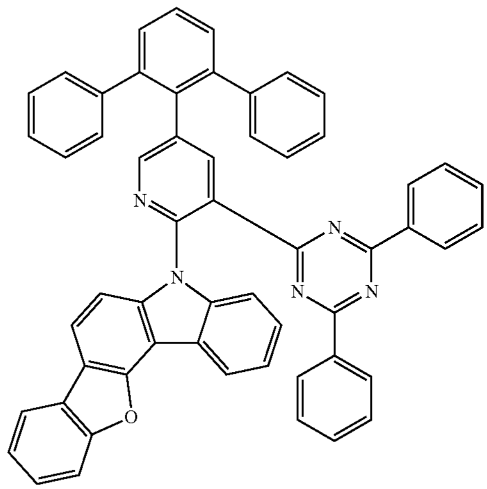
428
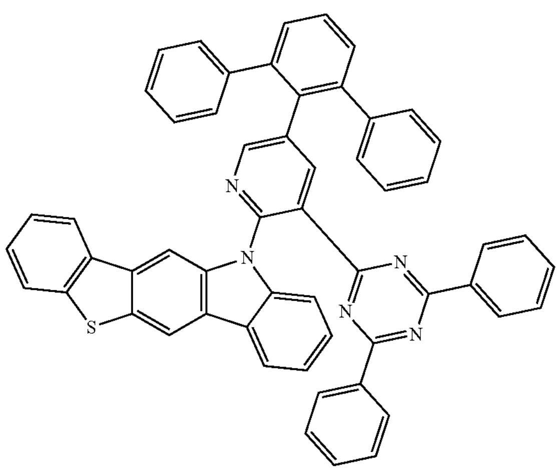
429
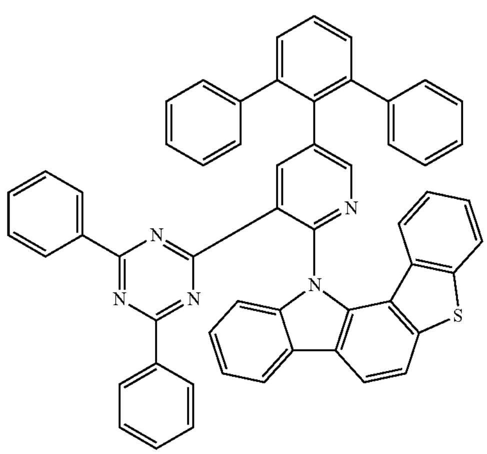
-continued
430
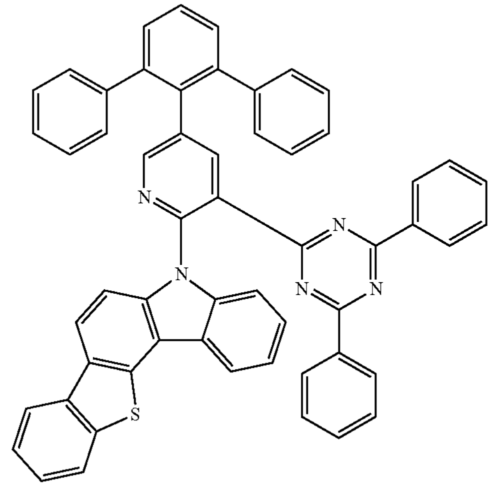
431
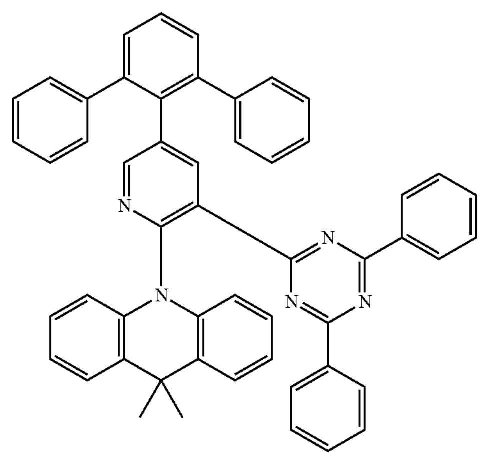
432
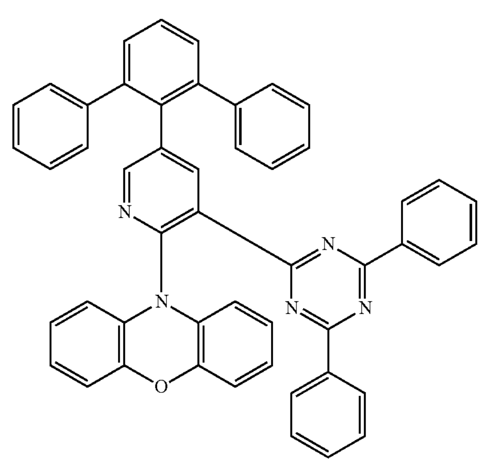

433
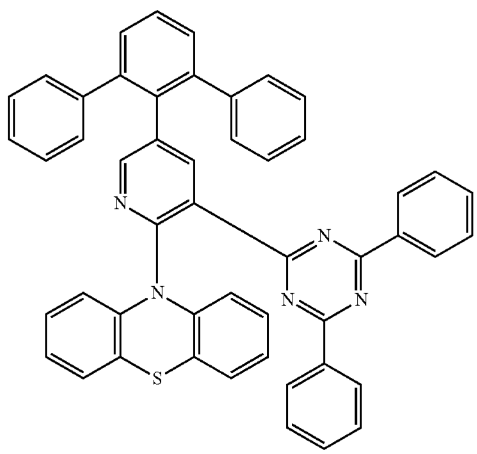
434
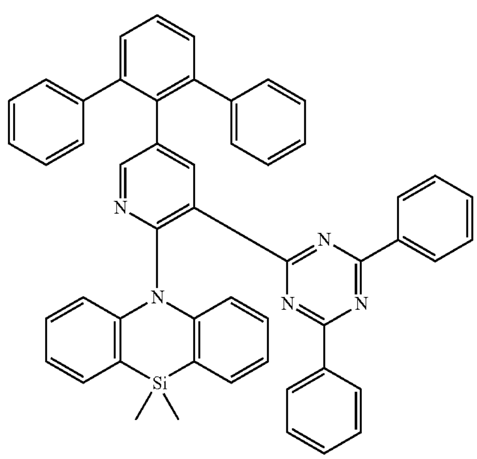
435
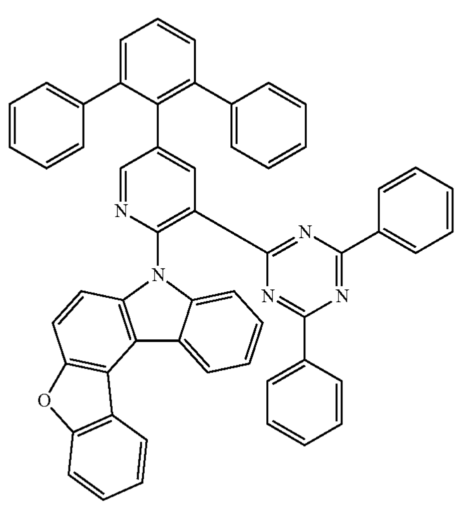
436
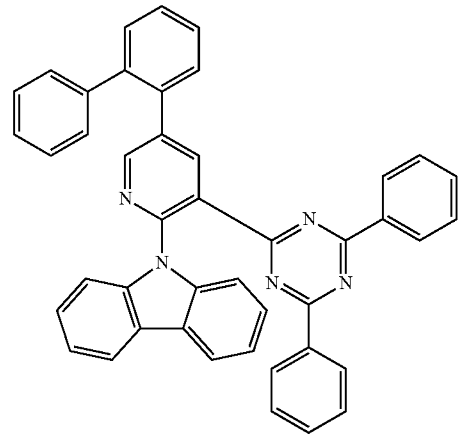
437
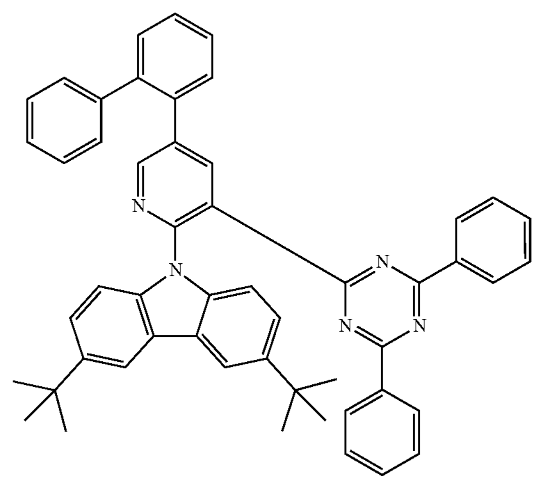
438
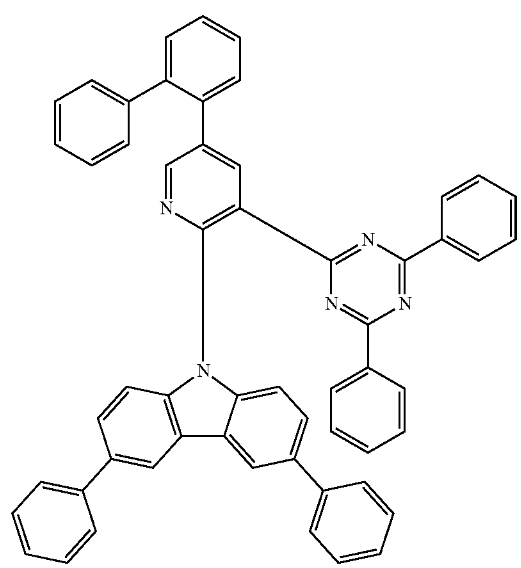

-continued
439
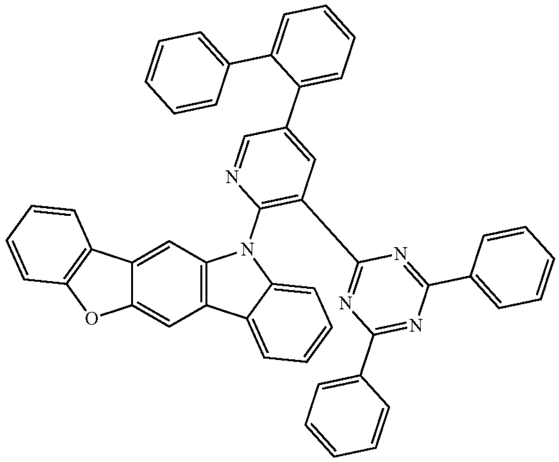
440
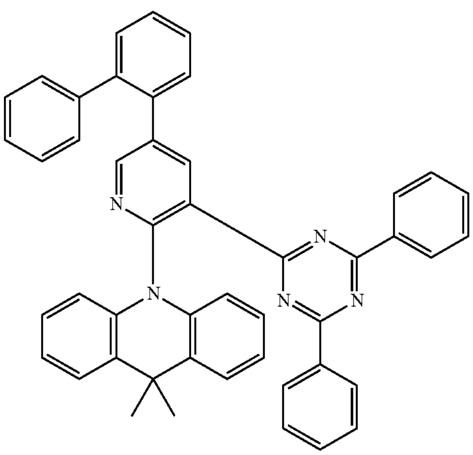
441
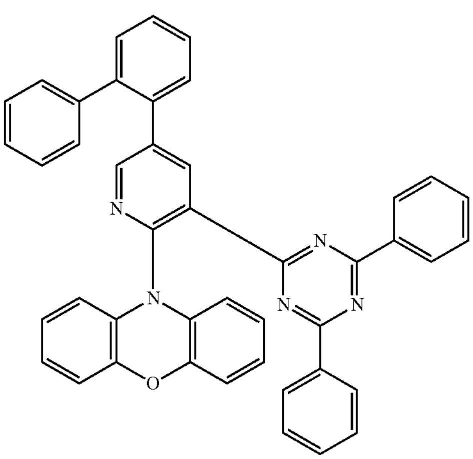
-continued
442
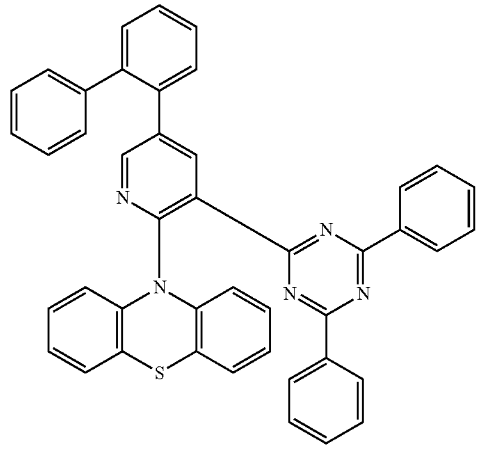
443
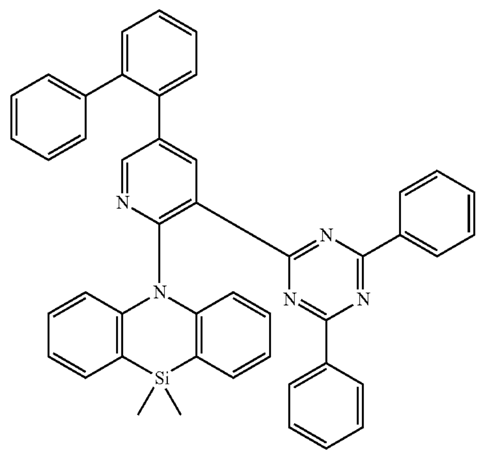
444
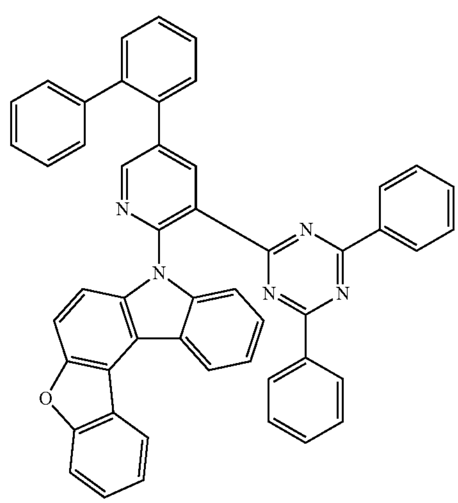

-continued
445
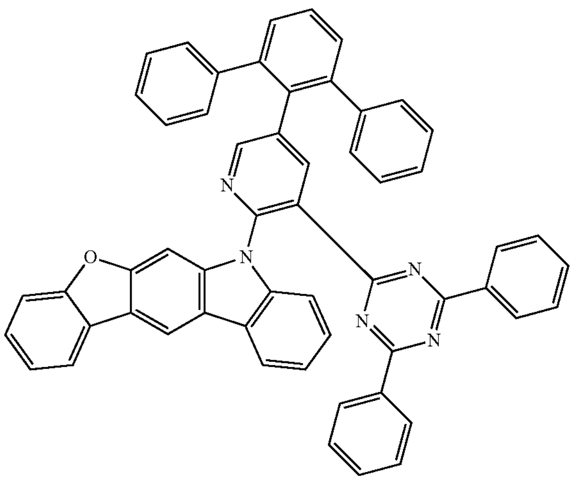
448
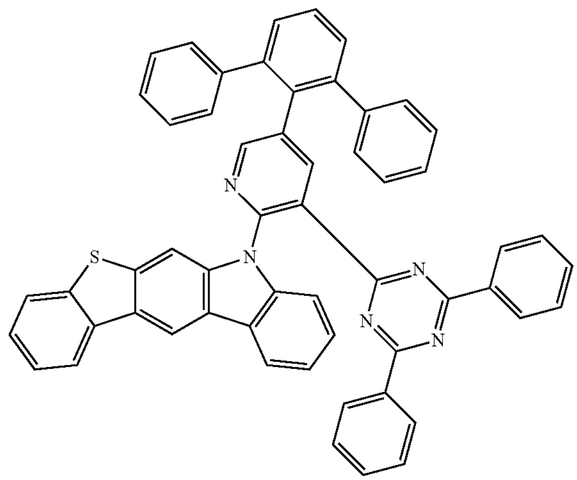
446
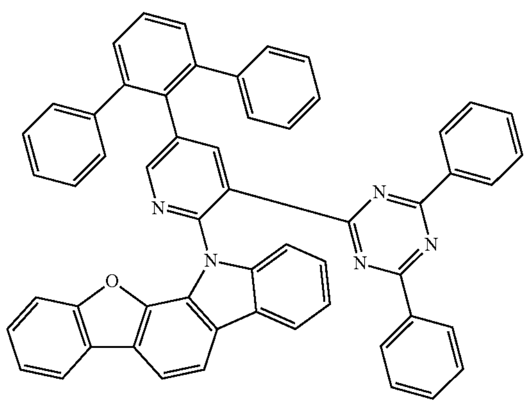
449
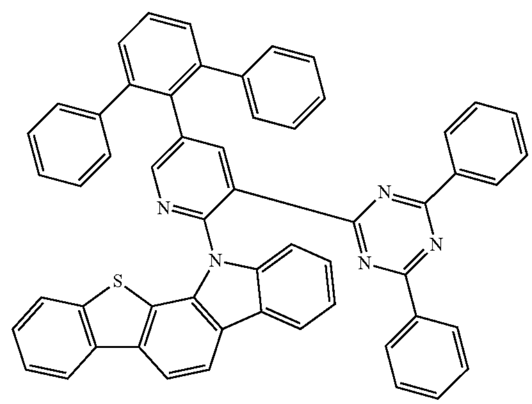
447
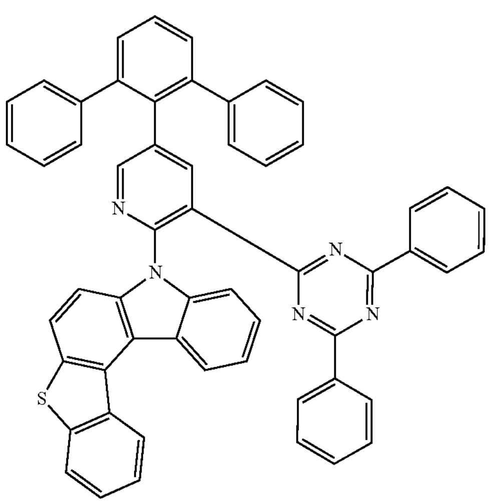
450
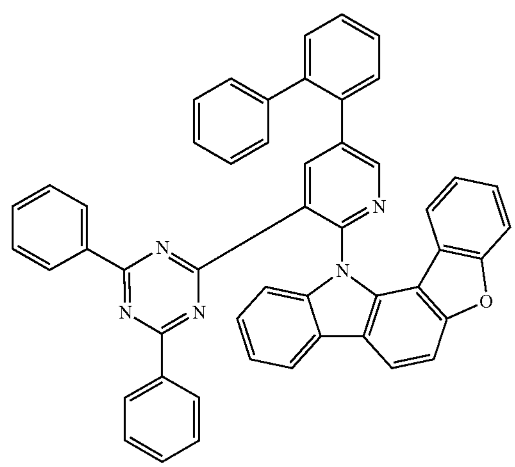

-continued
451
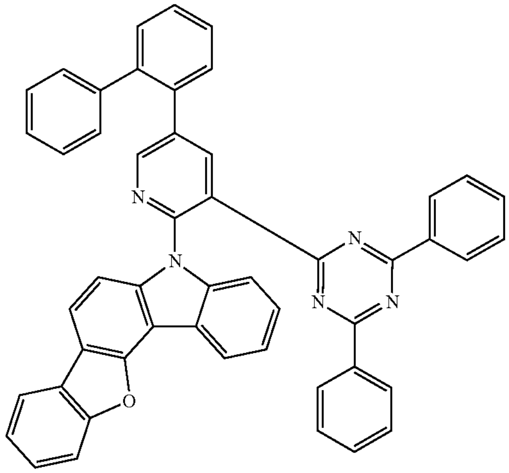
452
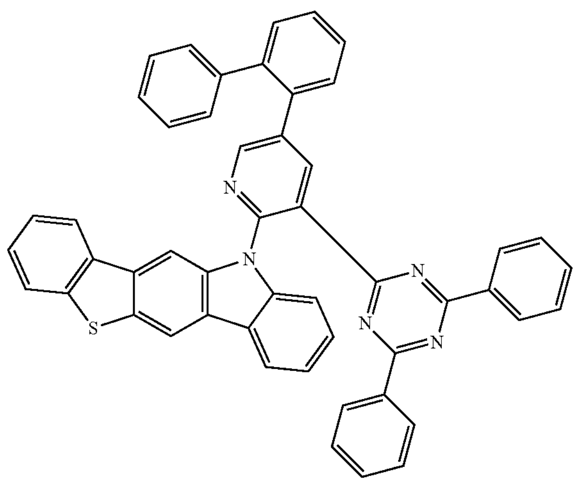
453
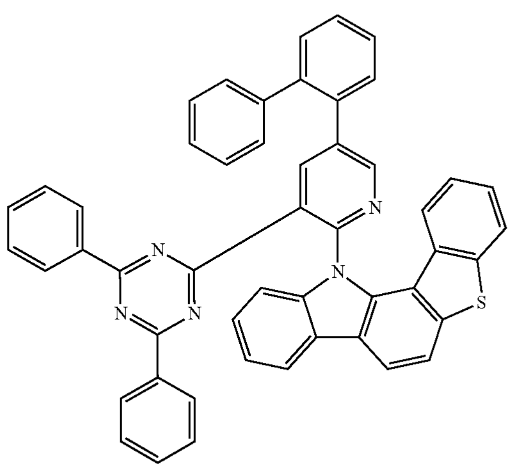
-continued
454
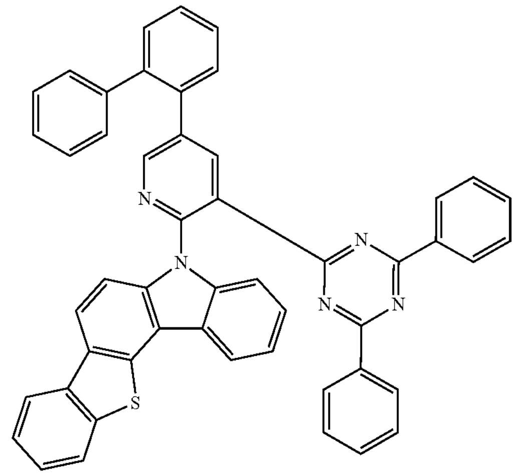
455
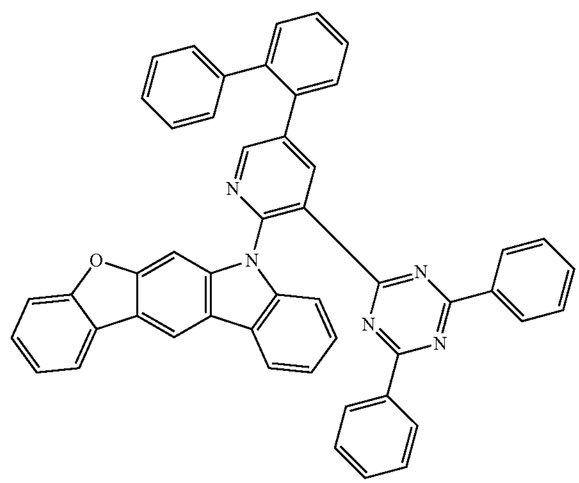
456
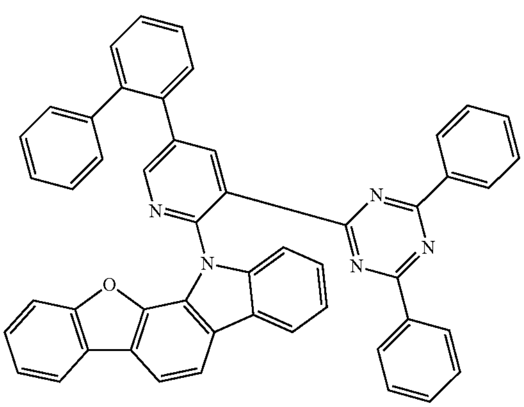

-continued
457
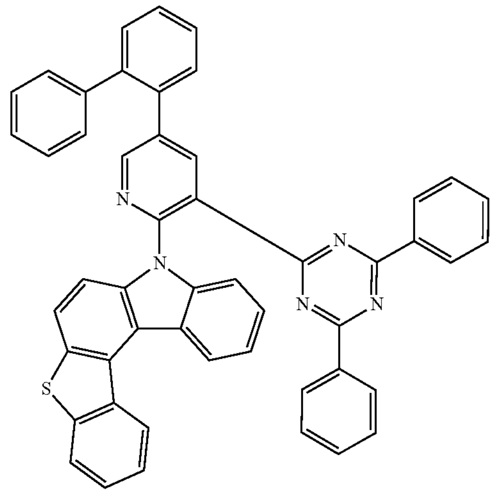
458
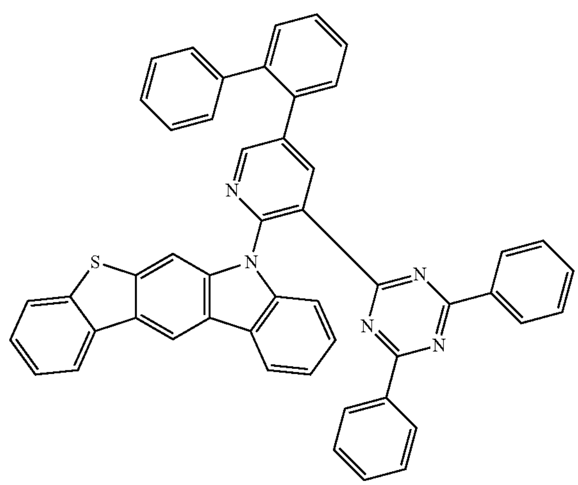
459
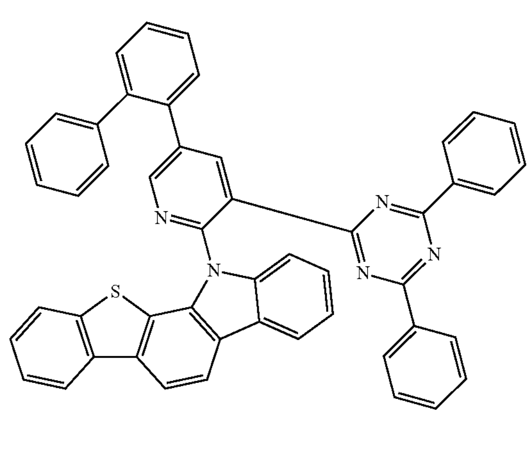
-continued
460
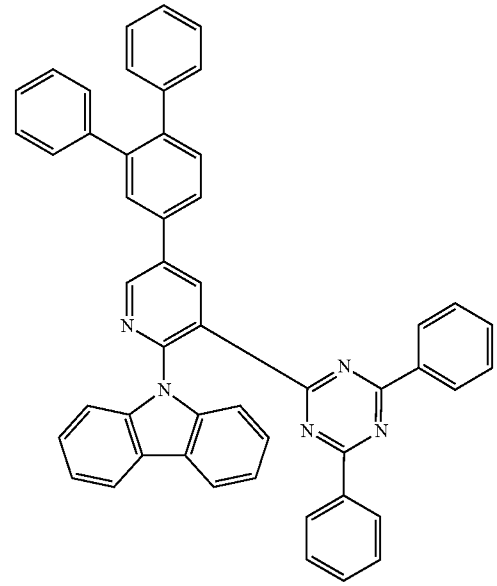
461
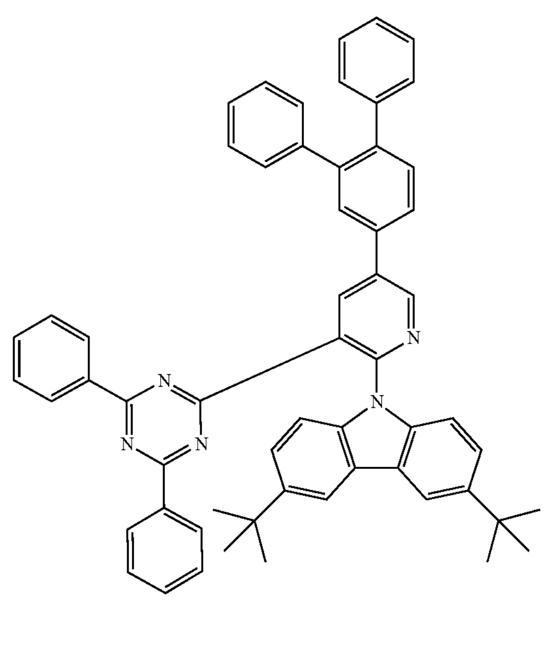

-continued
462
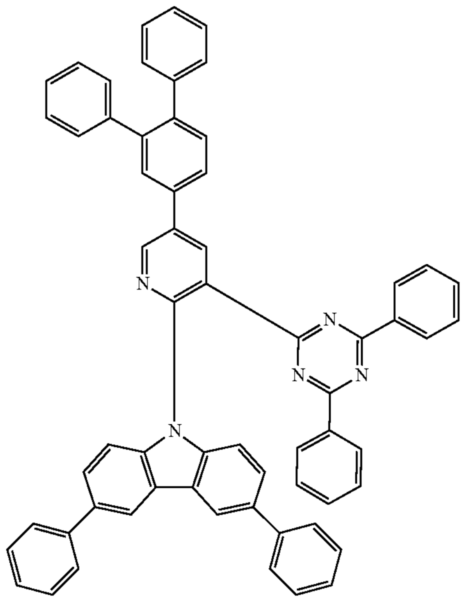
463
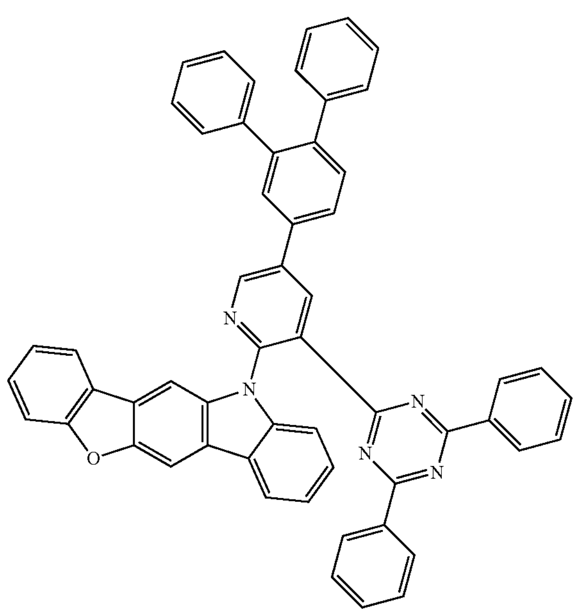
-continued
464
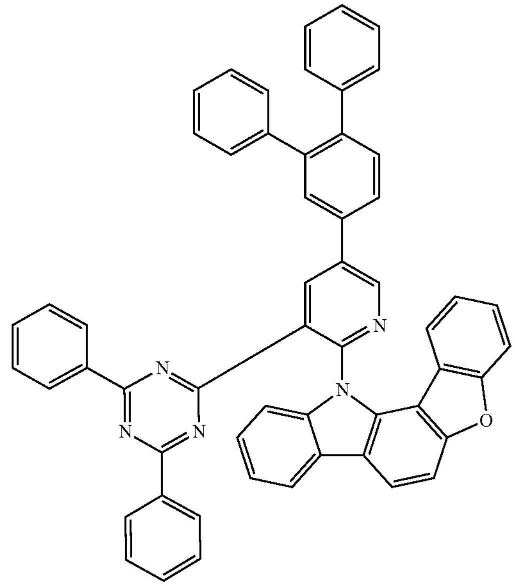
465
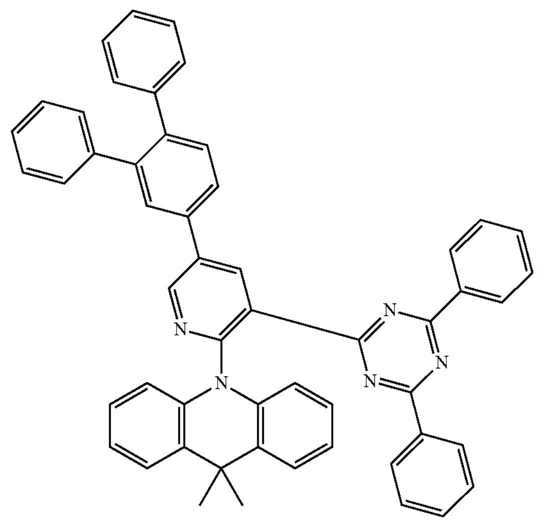
466
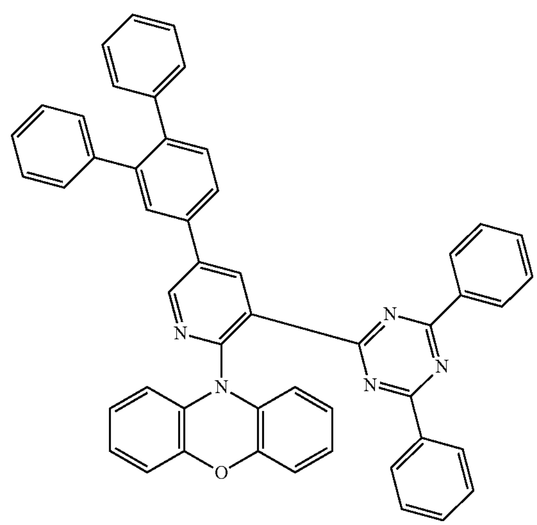

-continued
467
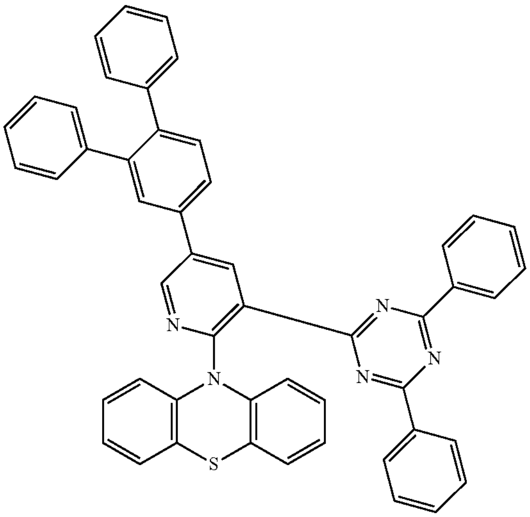
468
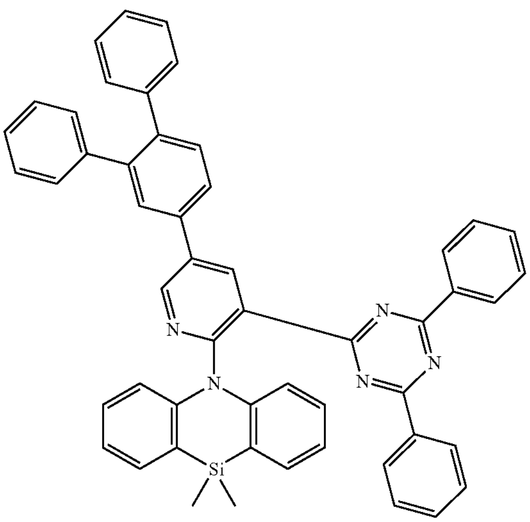
469
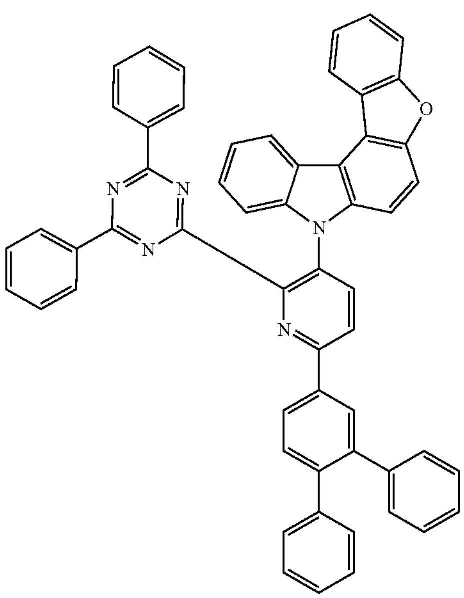
-continued
470
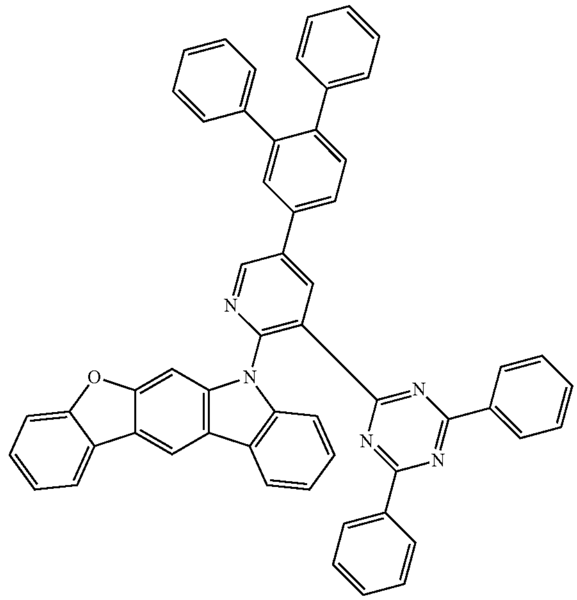
471
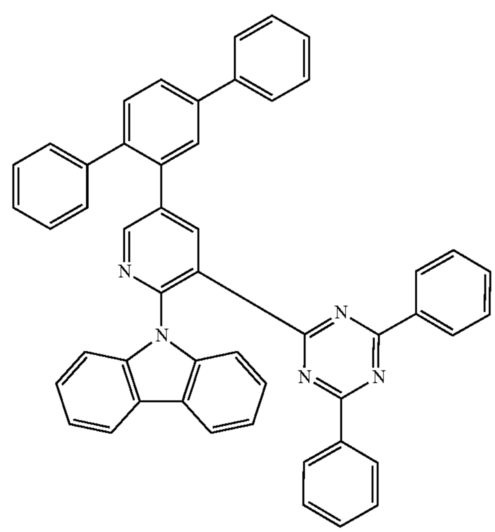

-continued
472
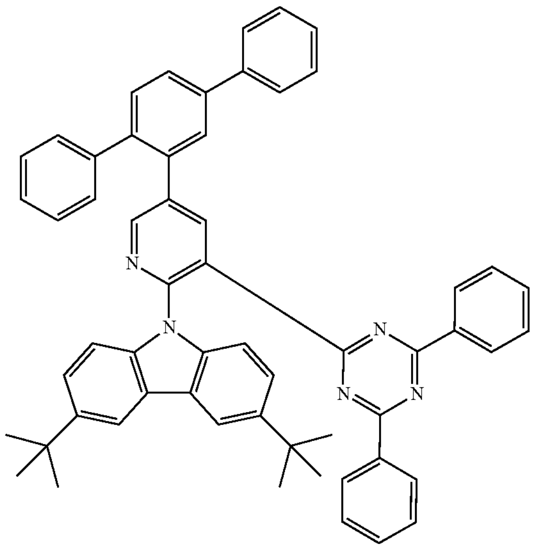
473
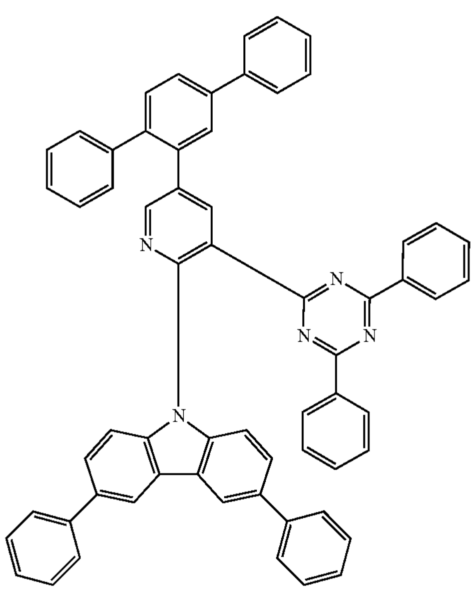
-continued
474
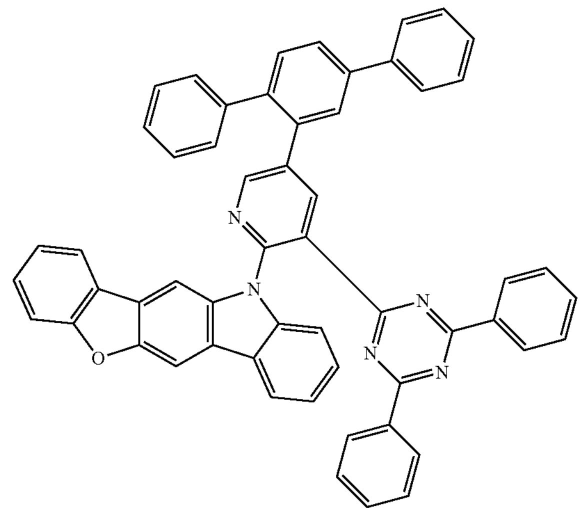
475
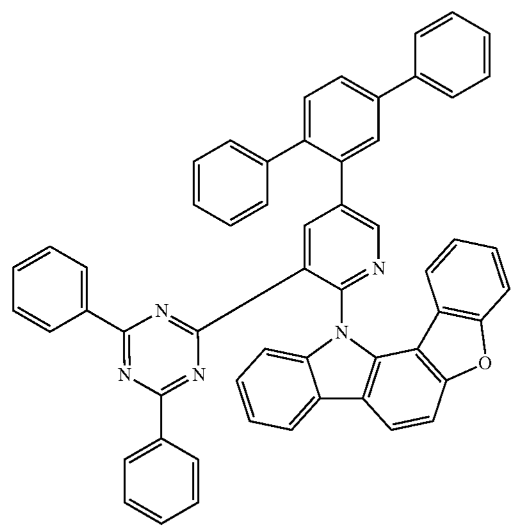
476
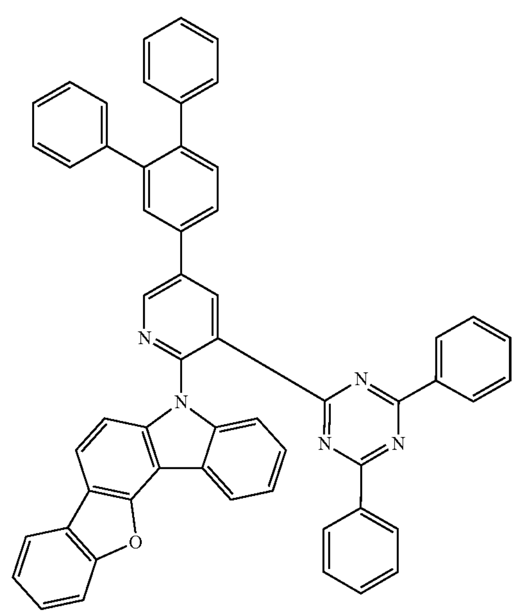

-continued
477
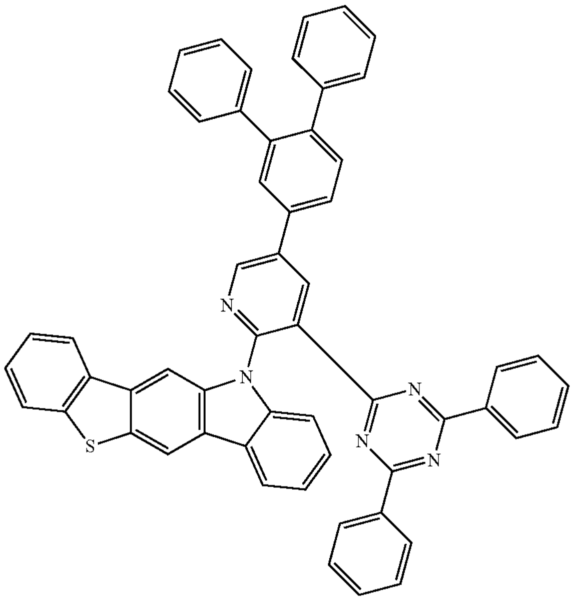
478
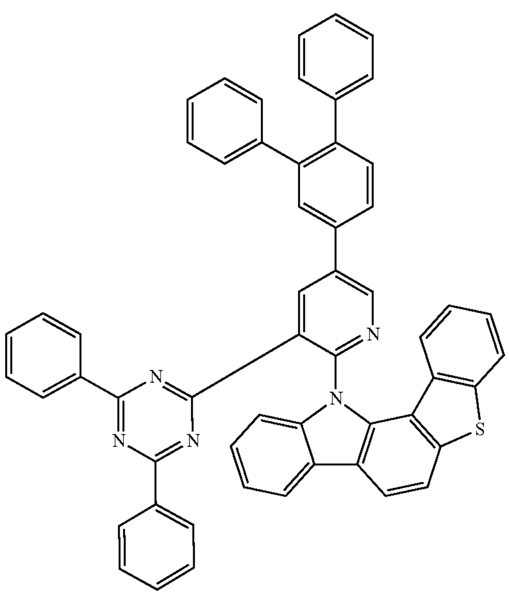
-continued
479
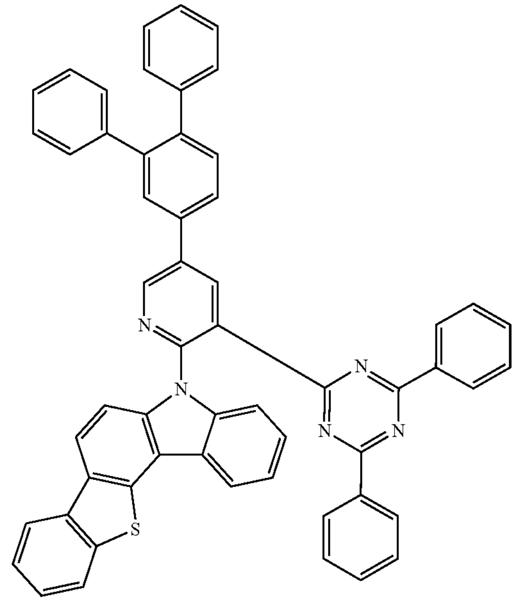
480
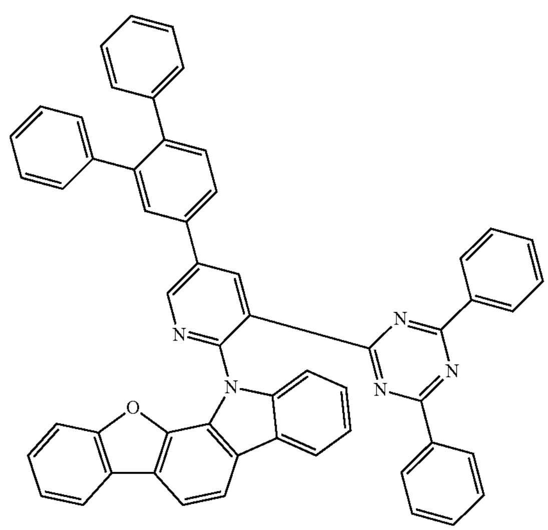

-continued
481
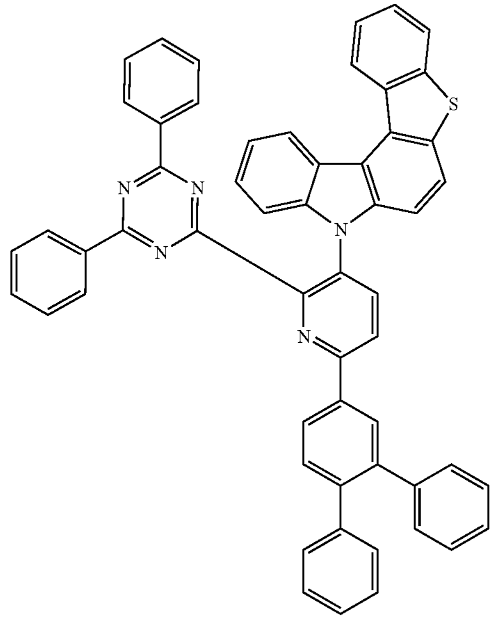
482
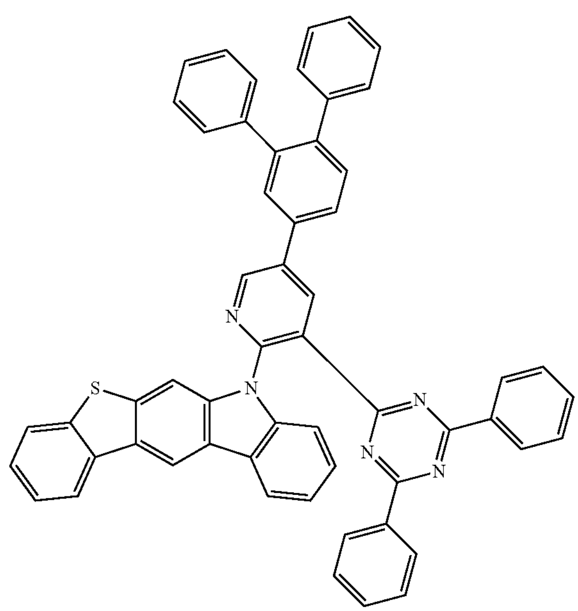
-continued
483
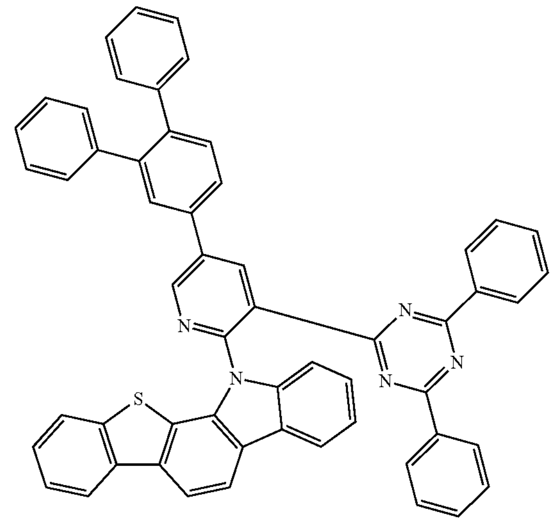
484
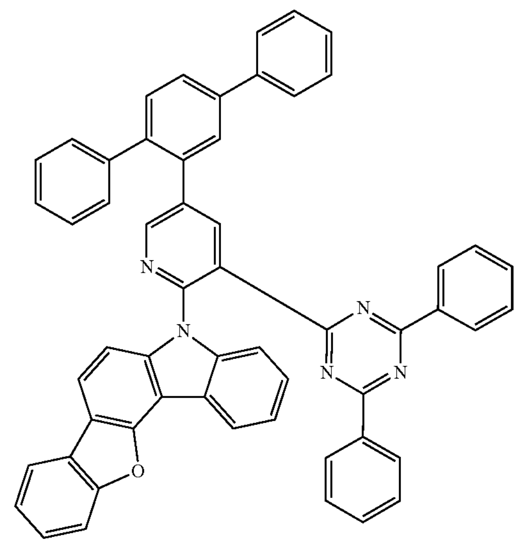
485
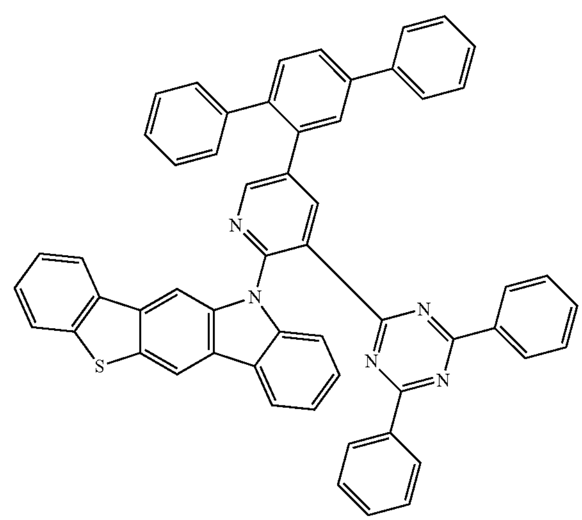

-continued
486
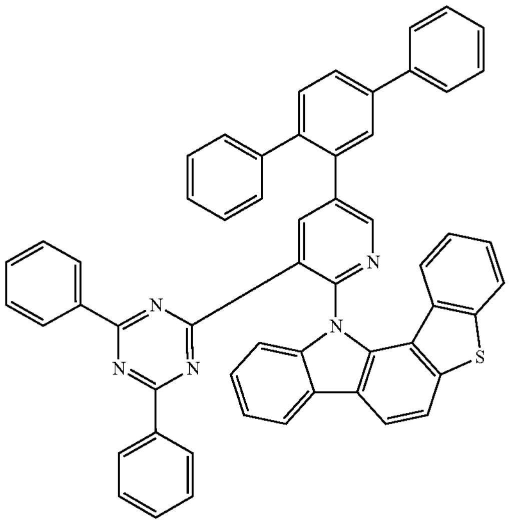
487
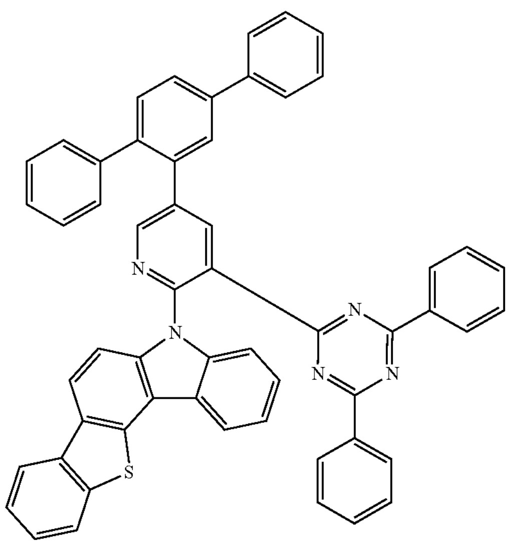
488
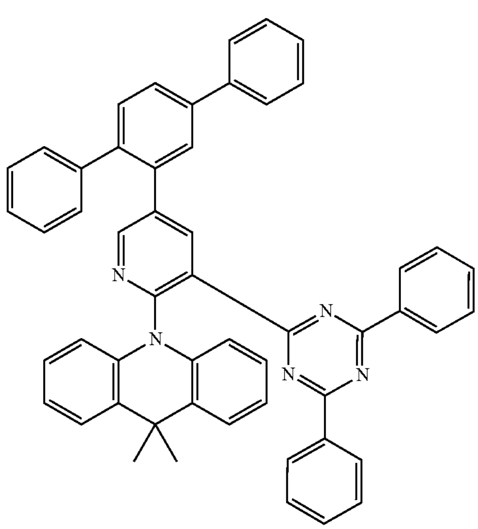
-continued
489
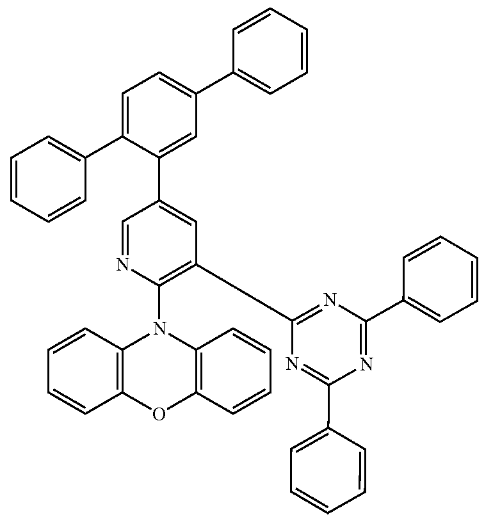
490
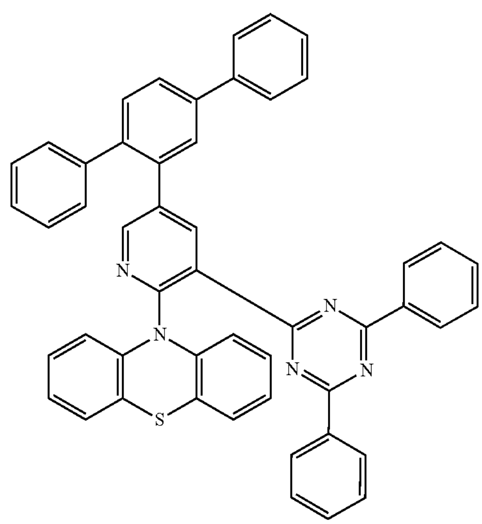
491
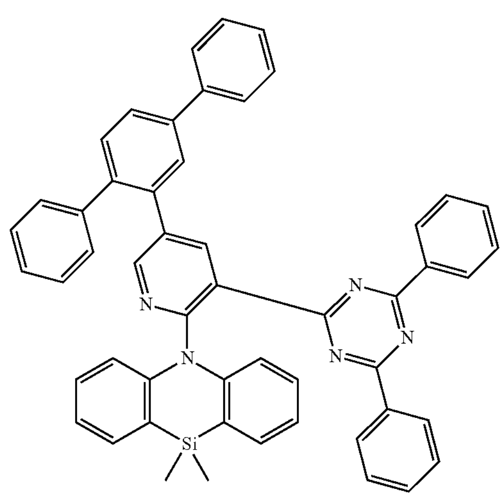

492
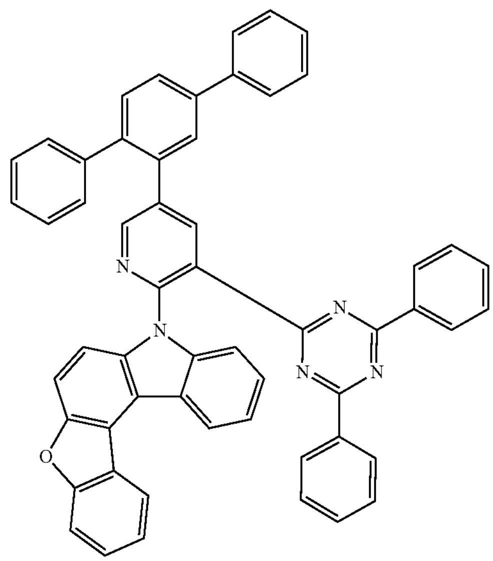
494
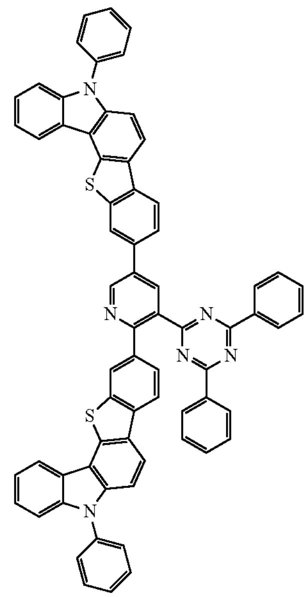
493
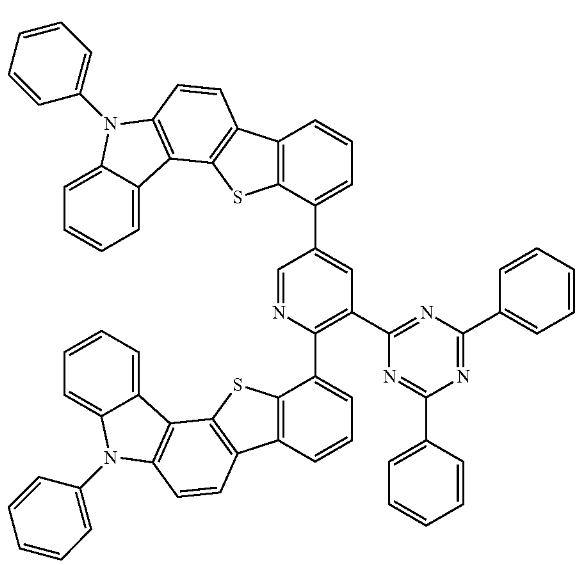
495
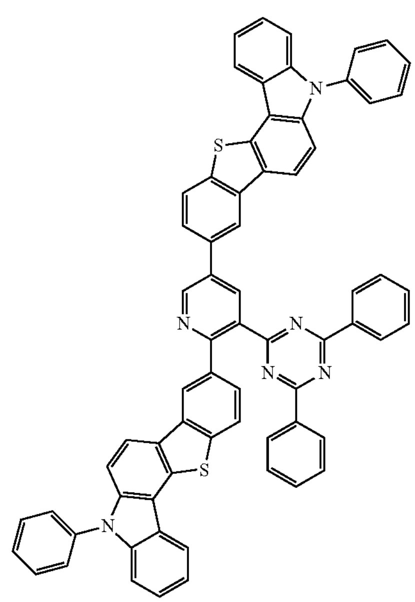

496
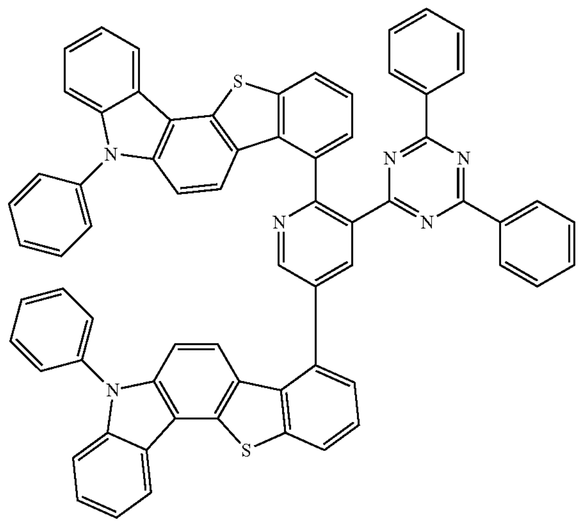
497
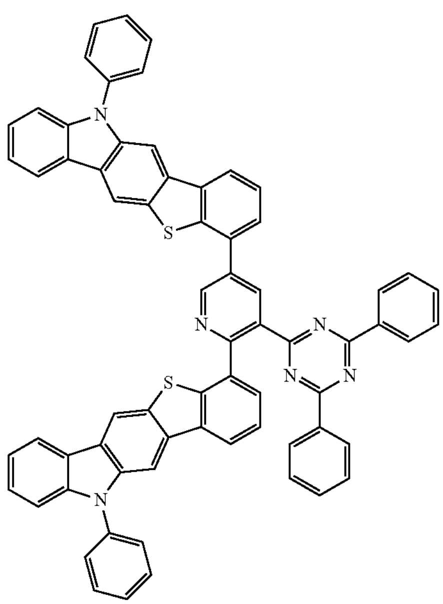
498
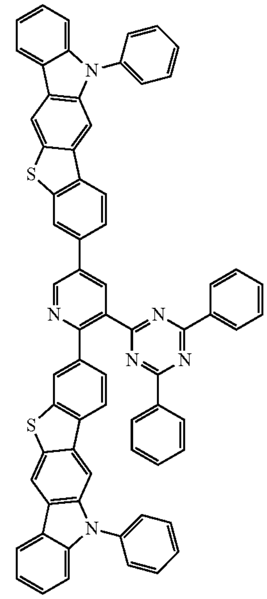
499
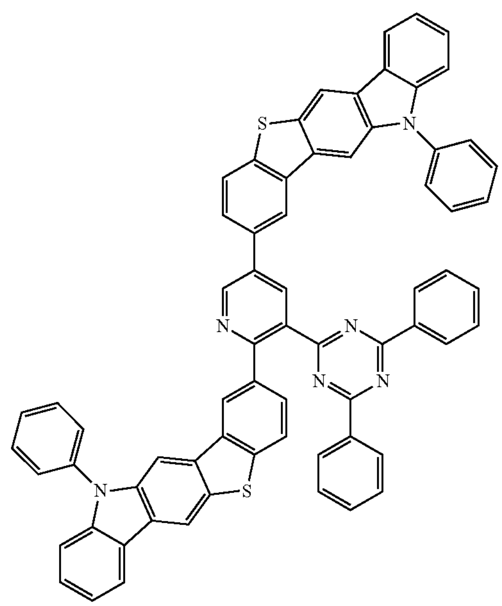

-continued
500
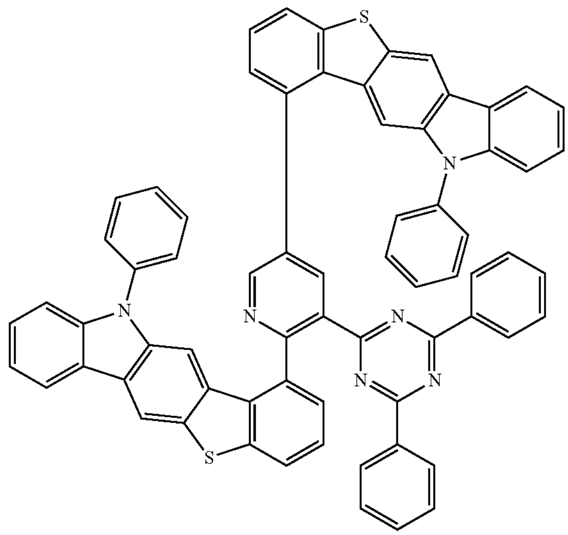
501
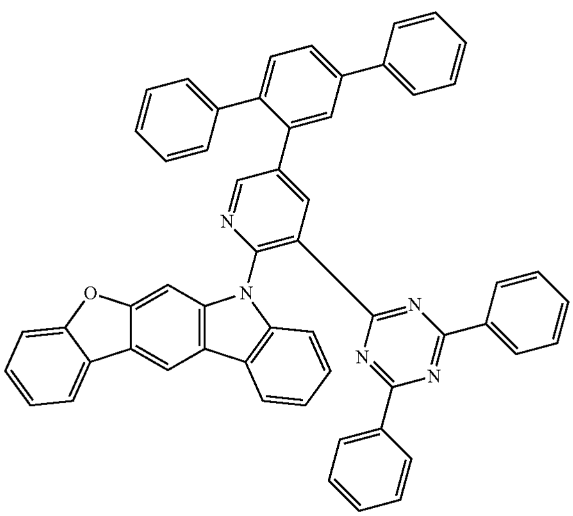
502
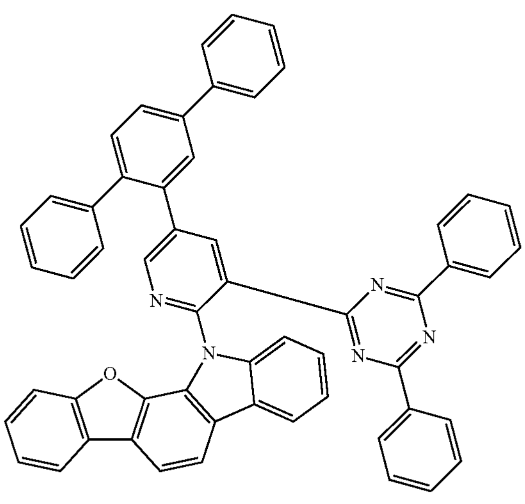
-continued
503
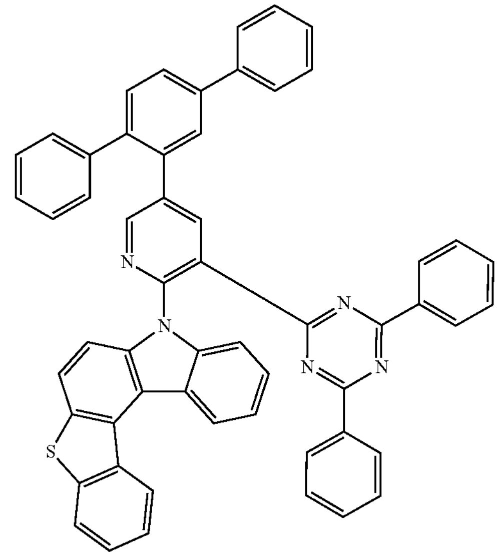
504
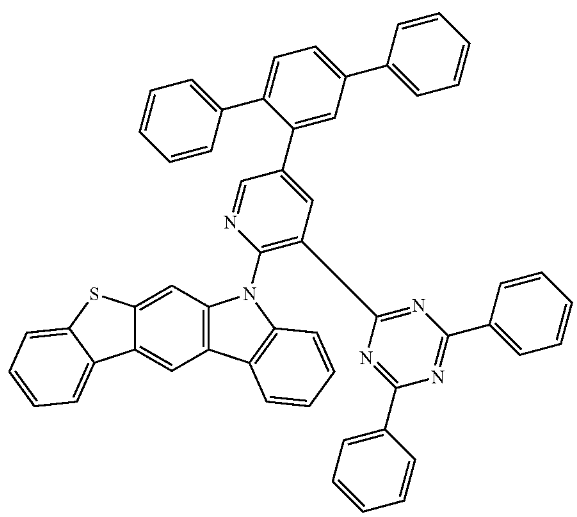
505
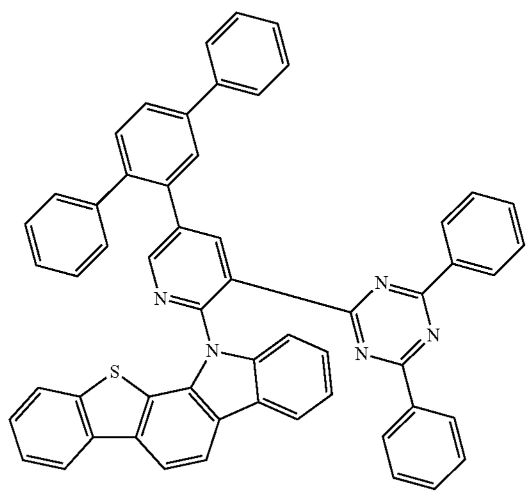

-continued
506
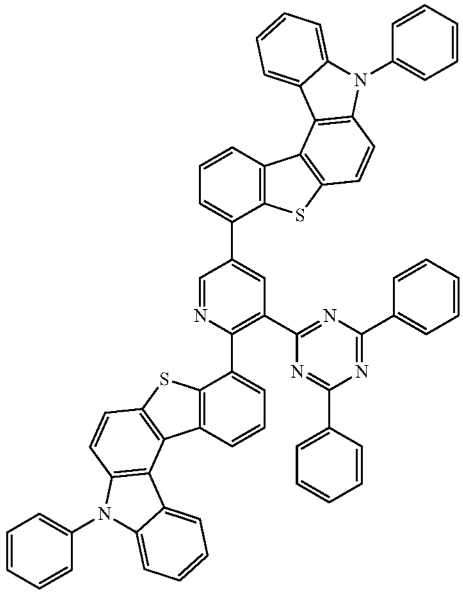
507
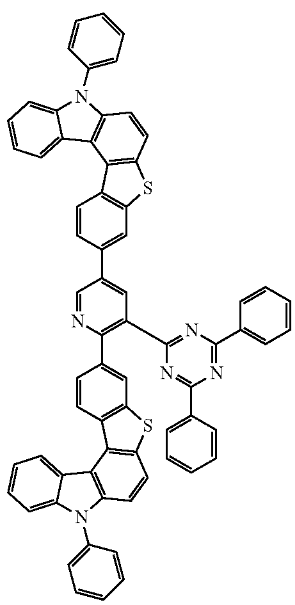
-continued
508
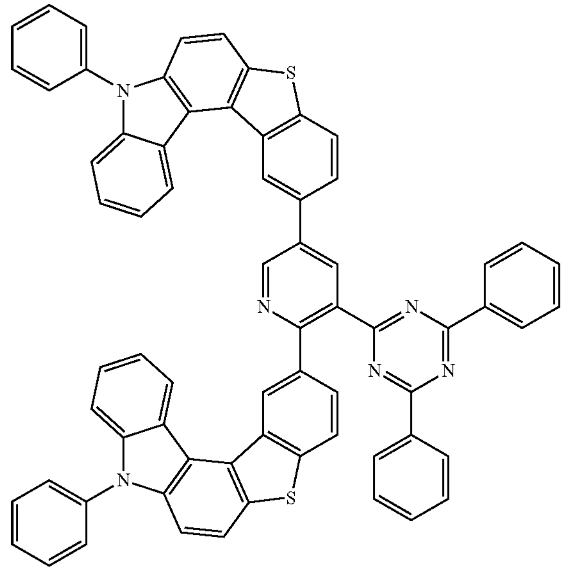
509
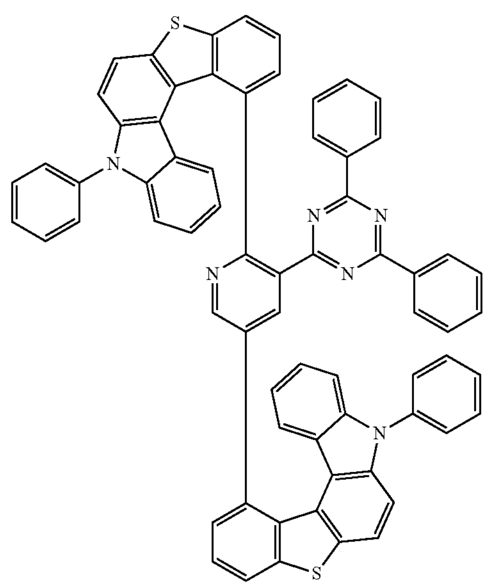

510
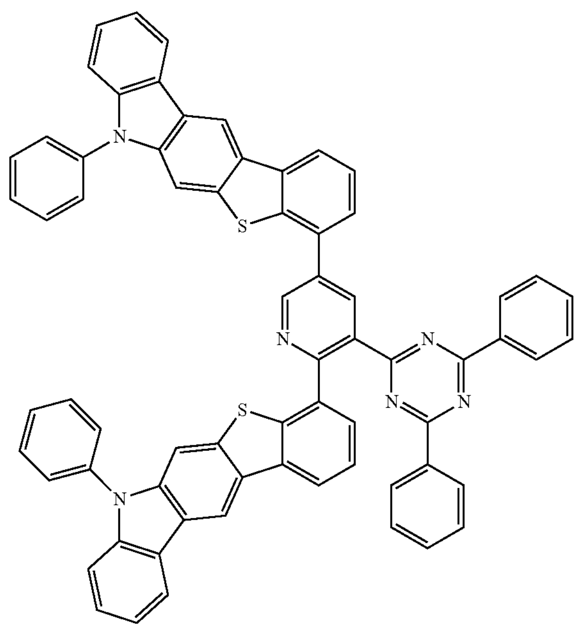
512
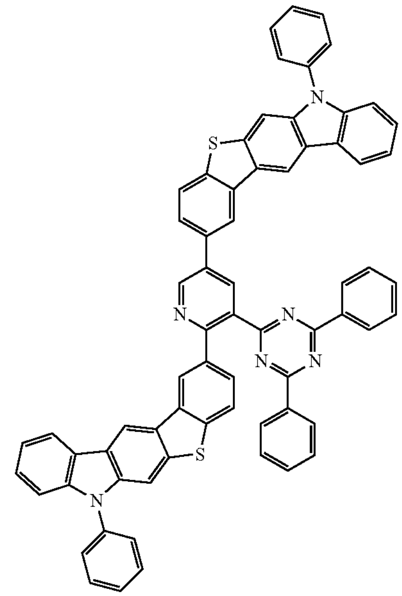
513
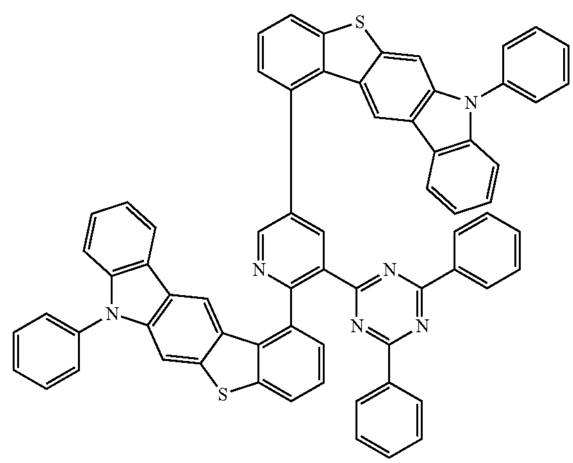
511
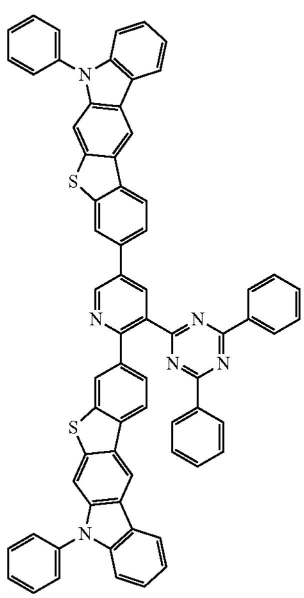
514
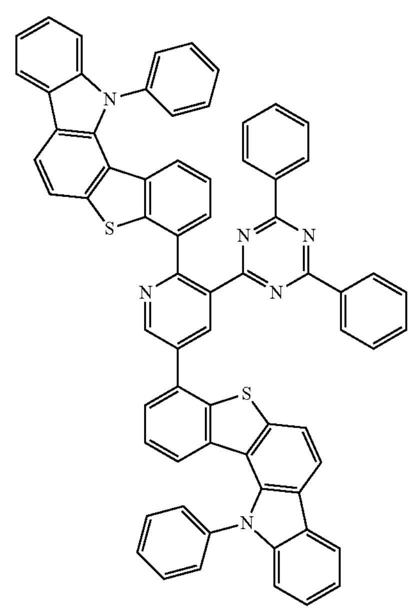

515
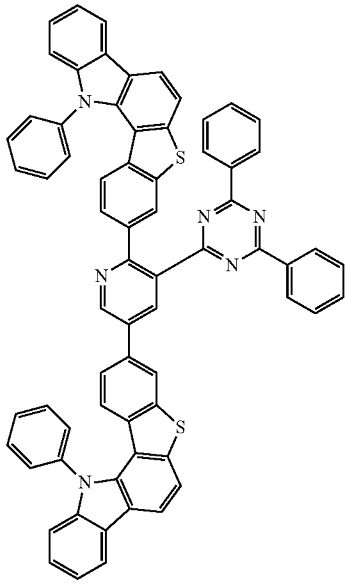
516
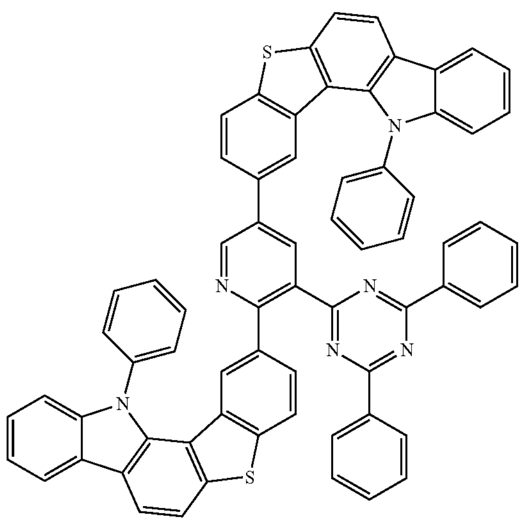
517
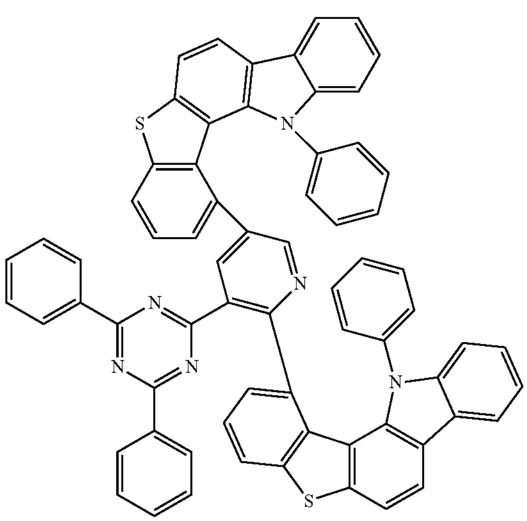
518
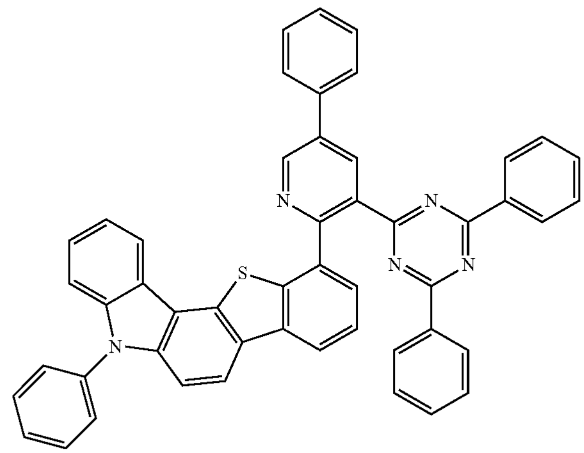
519
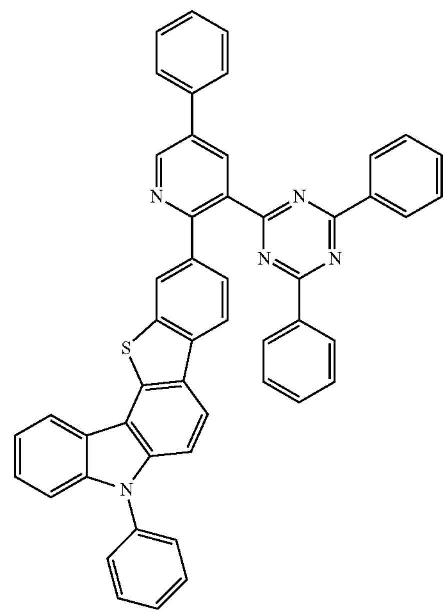
520
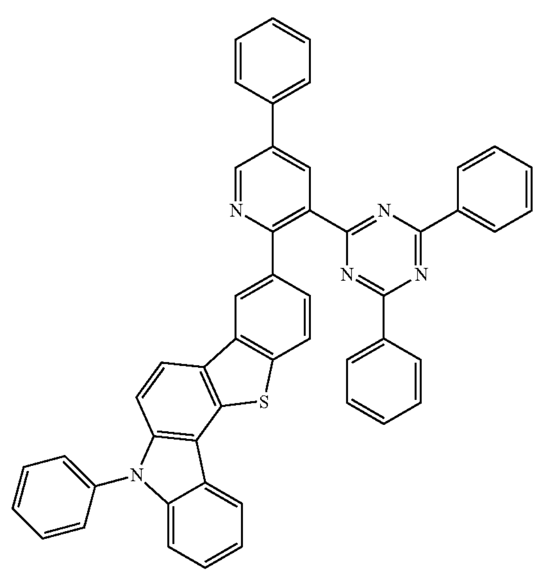

-continued
521
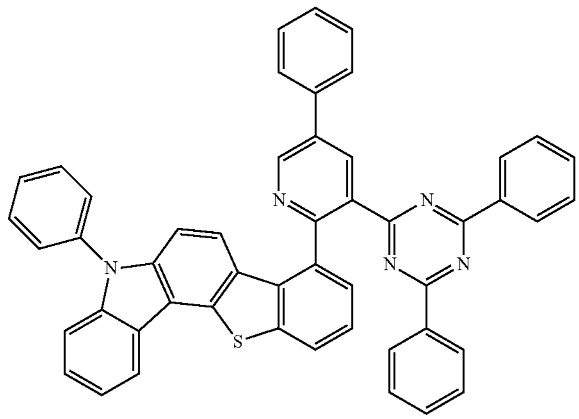
522
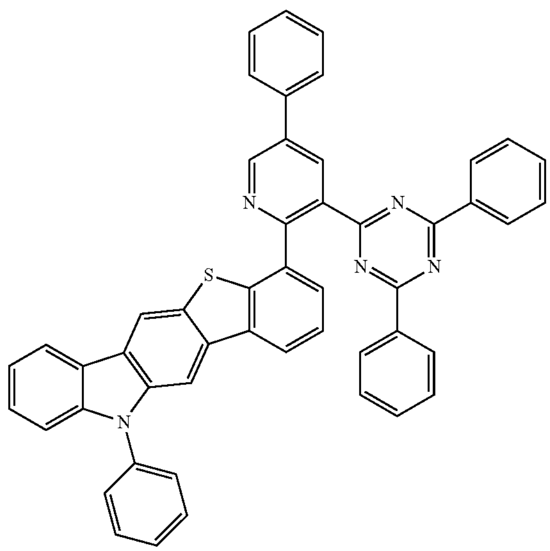
523
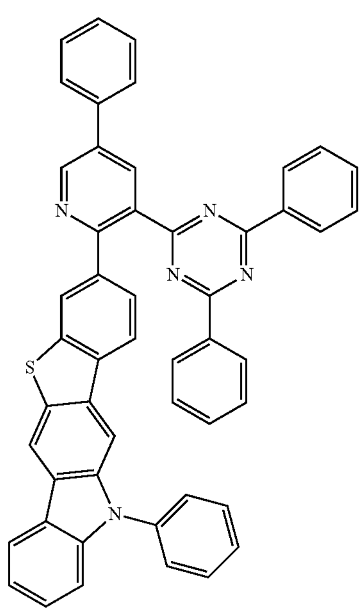
-continued
524
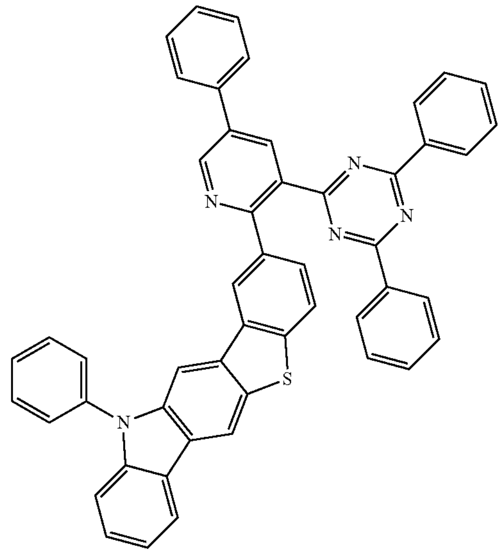
525
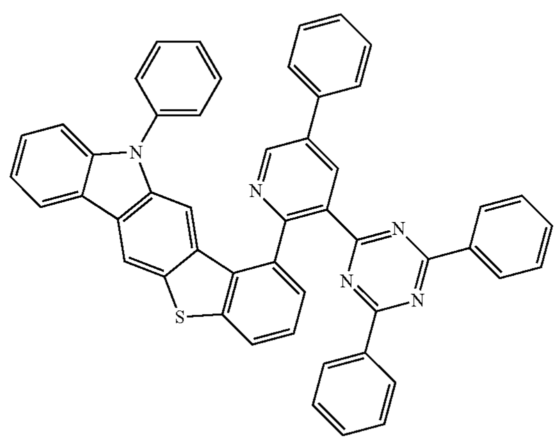
526
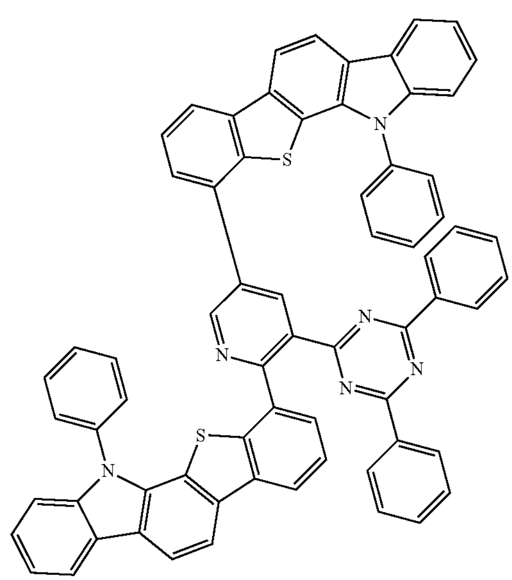

-continued
527
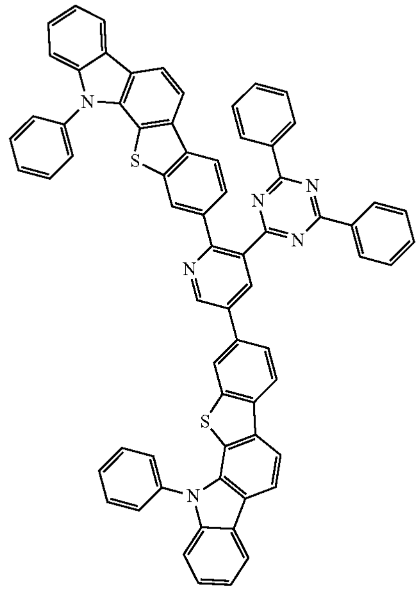
528
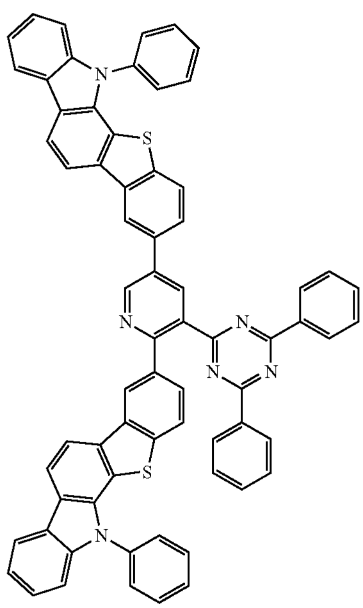
-continued
529
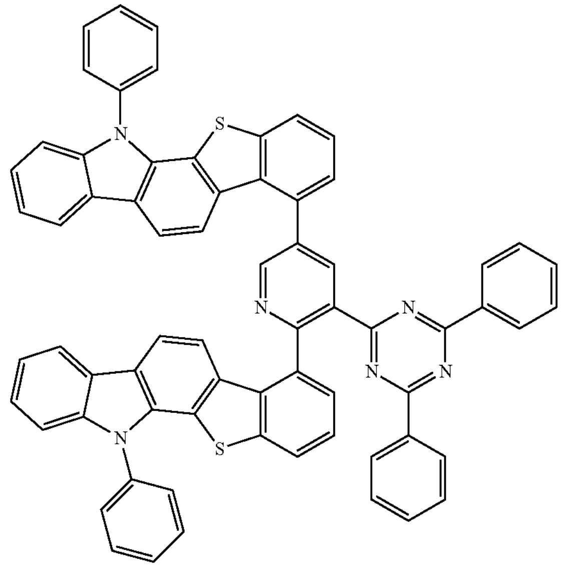
530
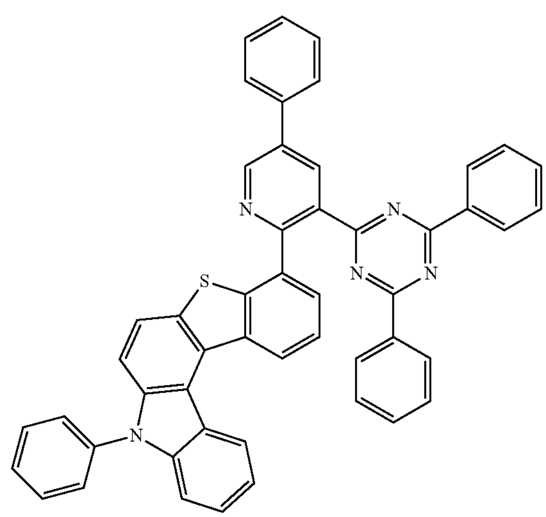

-continued
531
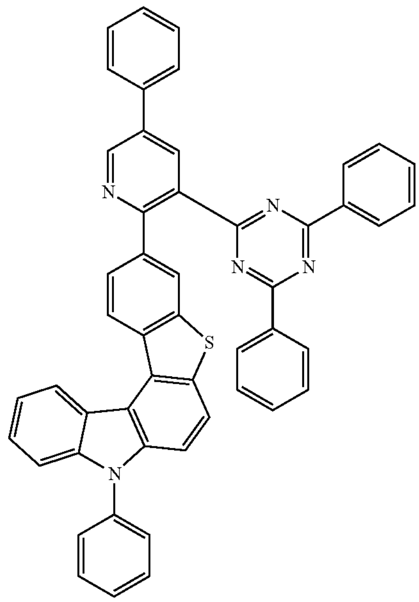
532
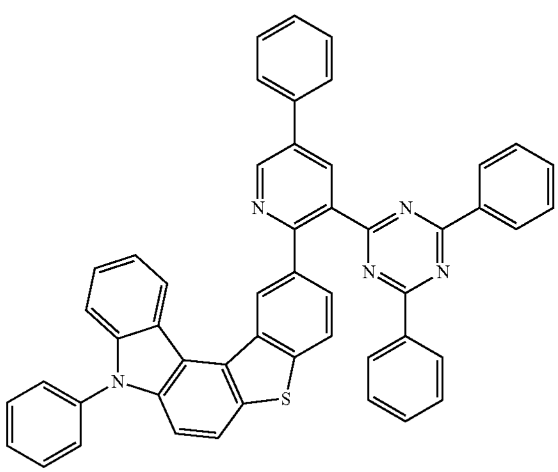
533
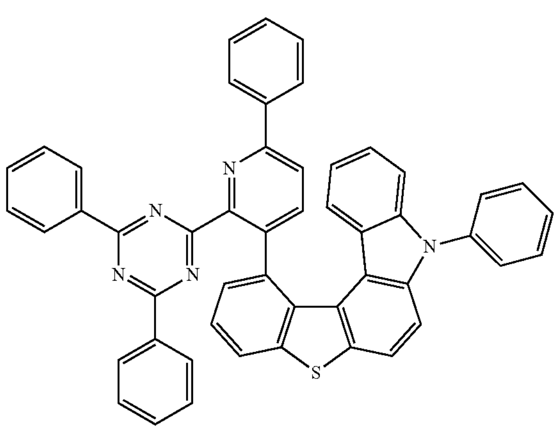
-continued
534
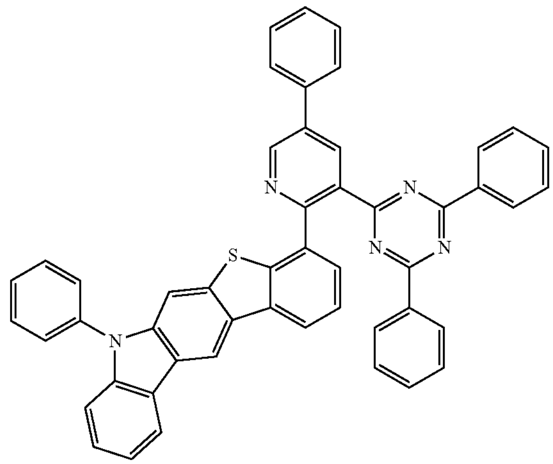
535
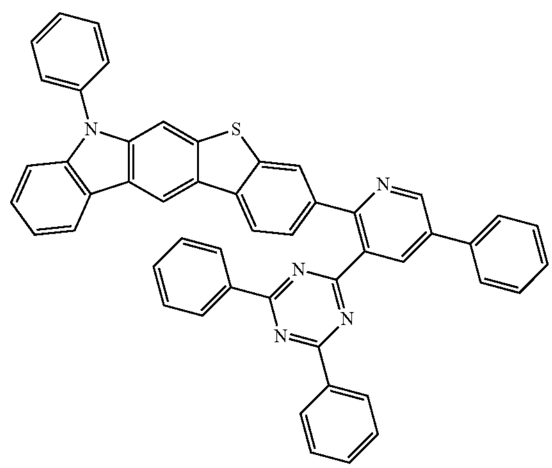
536
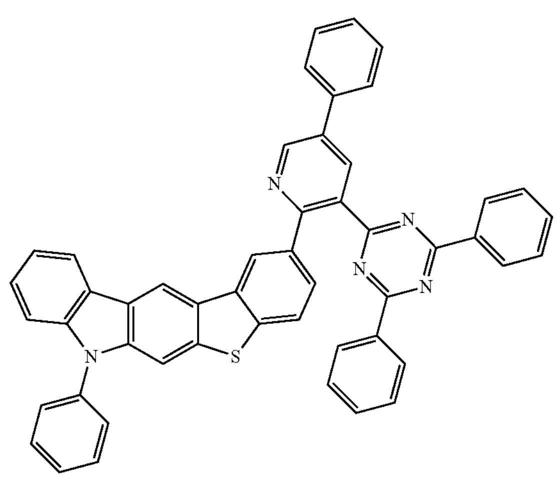

-continued
537
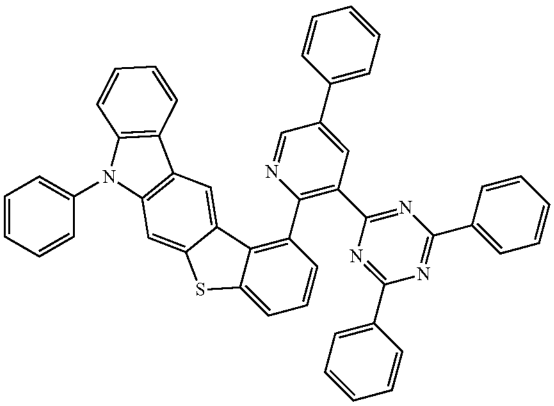
538
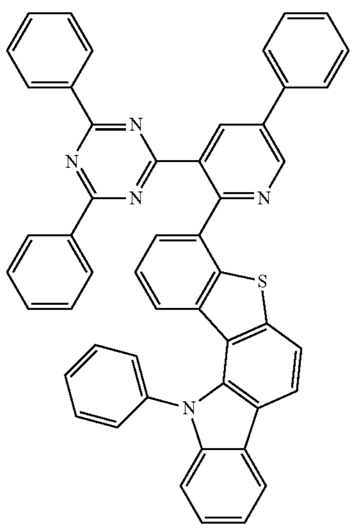
539
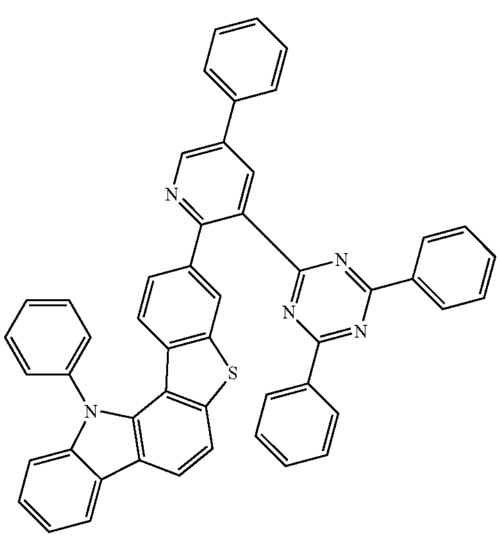
-continued
540
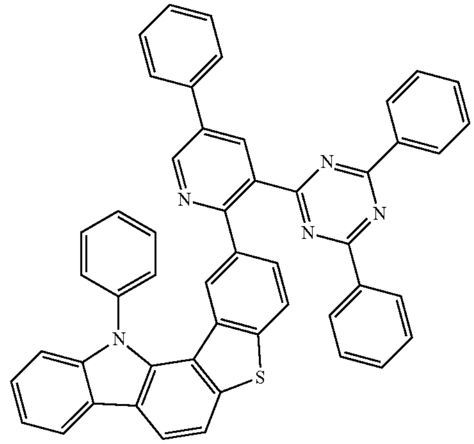
541
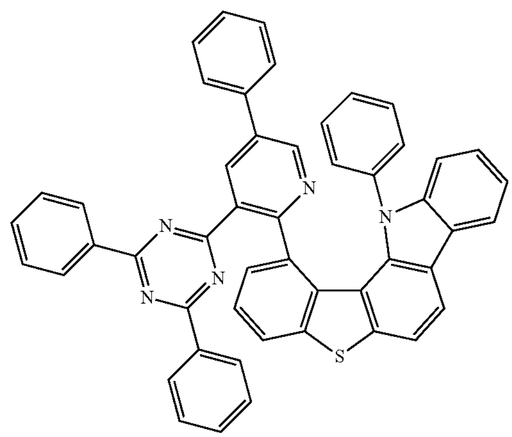
542
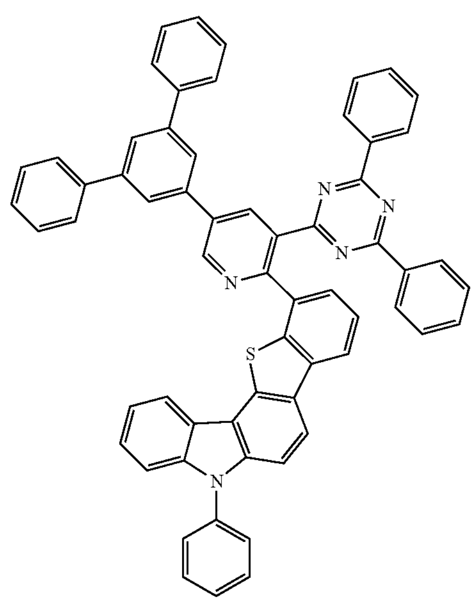

-continued
543
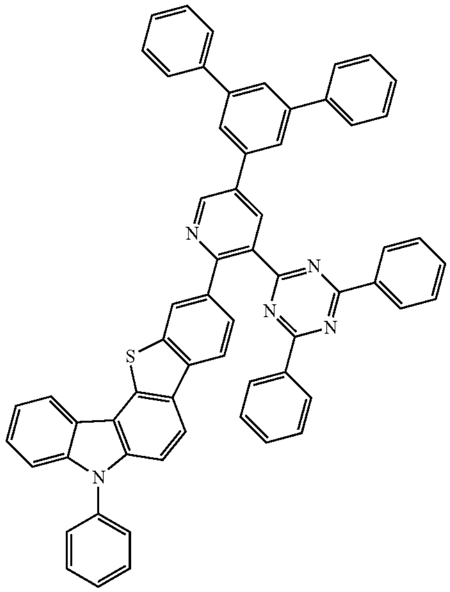
544
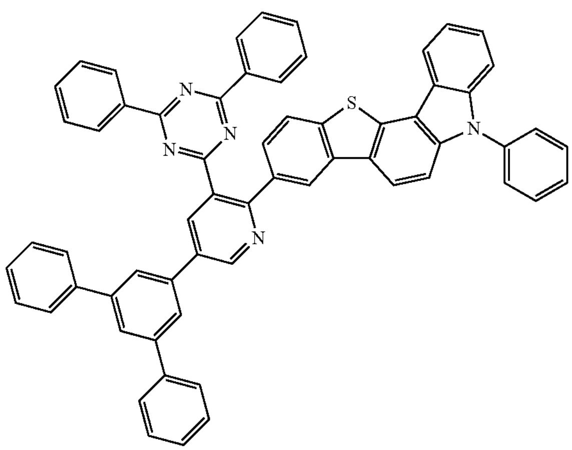
545
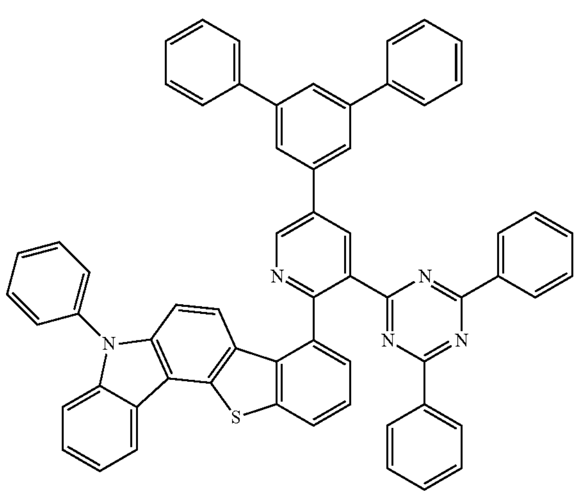
-continued
546
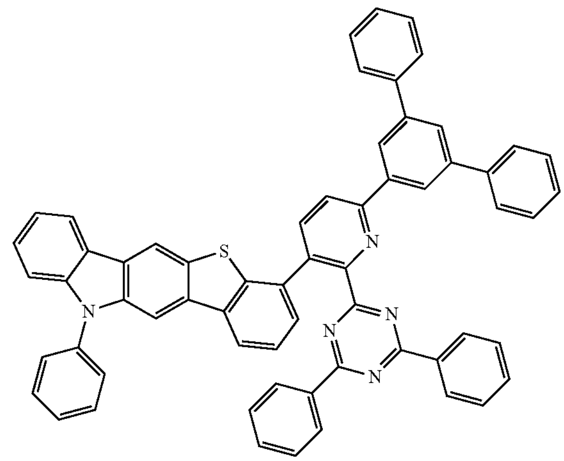
547
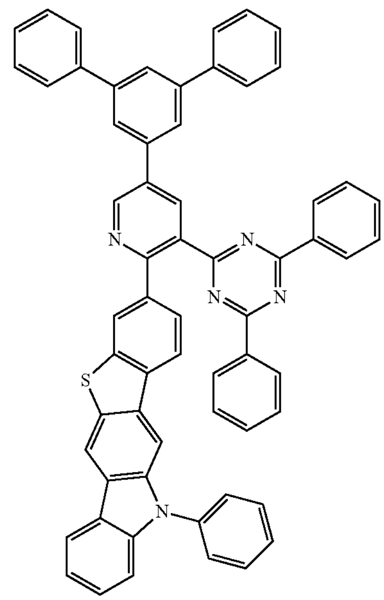
548
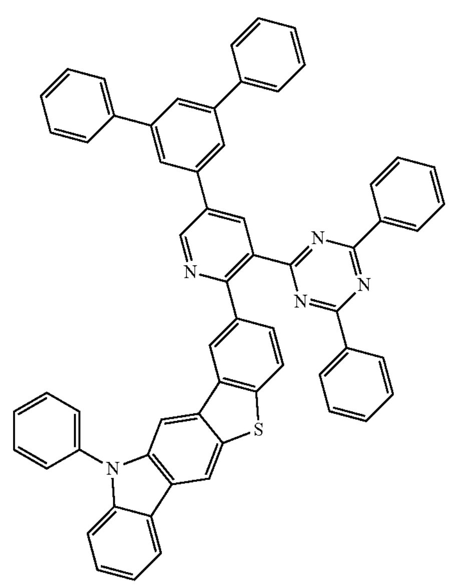

-continued
549
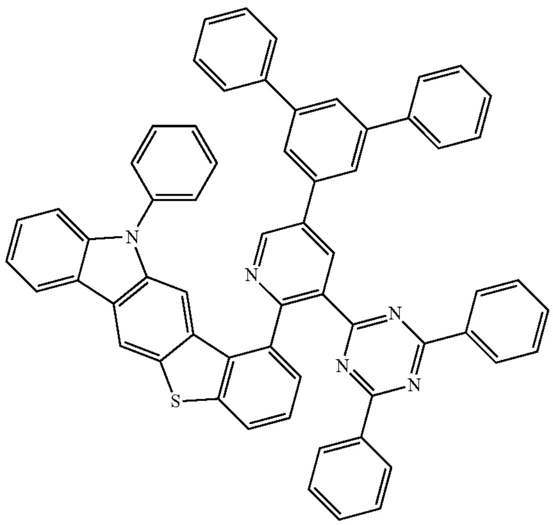
550
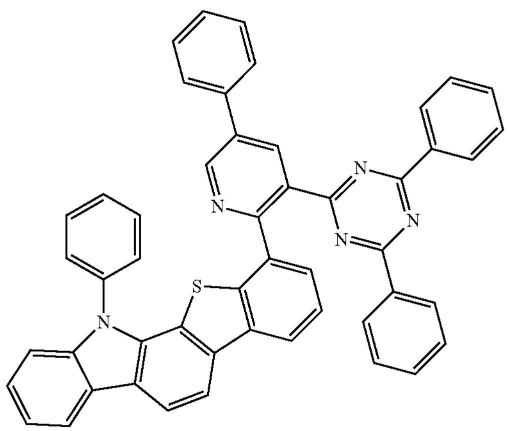
551
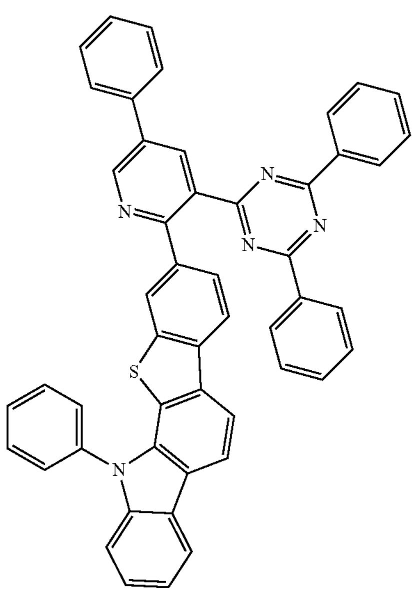
-continued
552
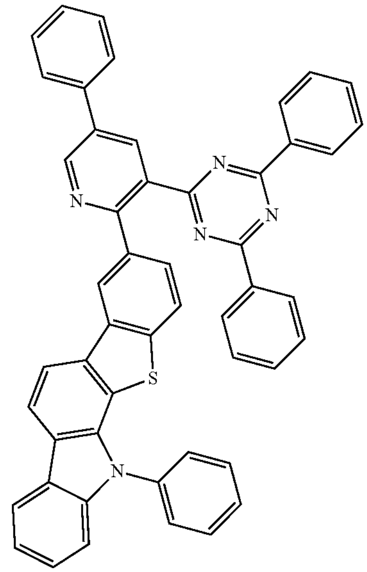
553
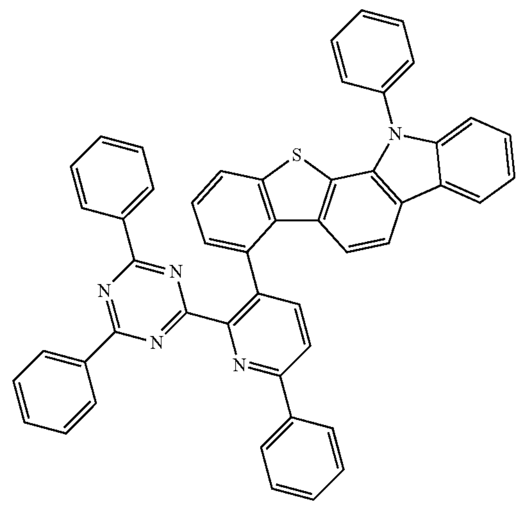
554
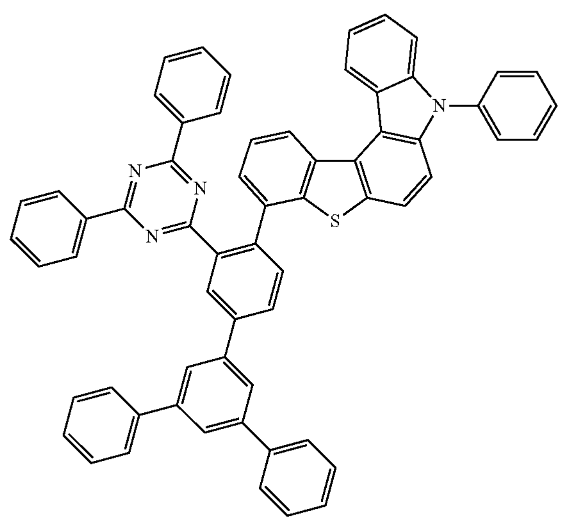

-continued
555
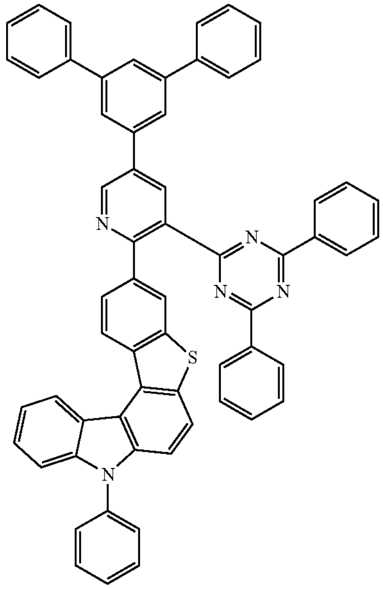
556
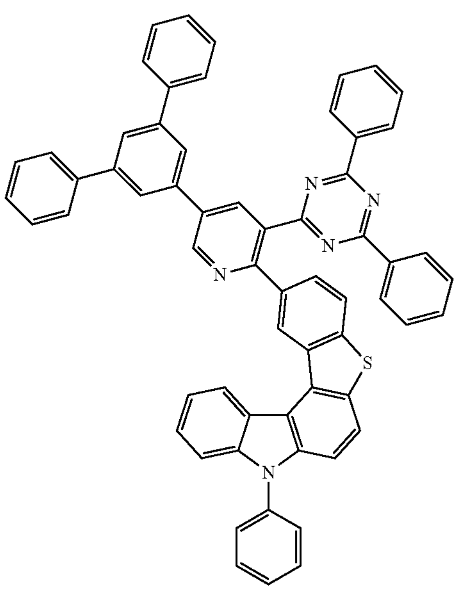
-continued
557
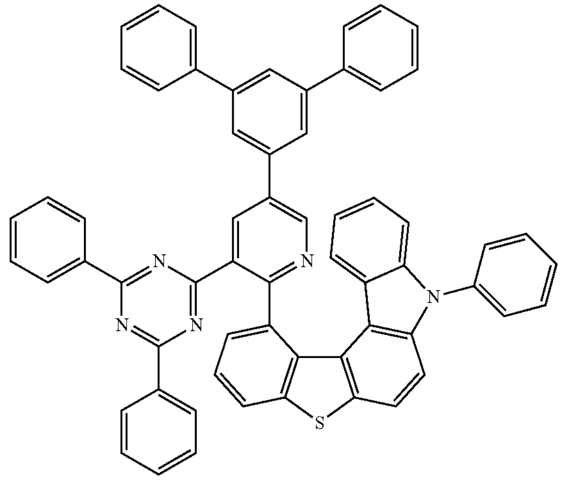
558
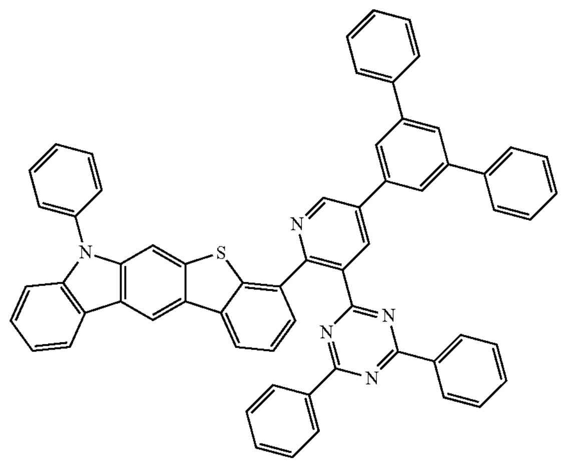
559
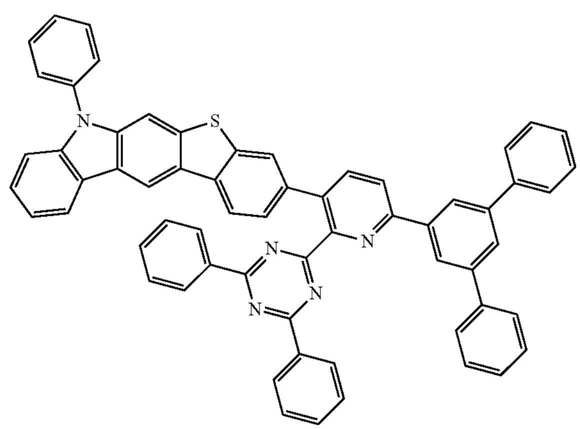

560
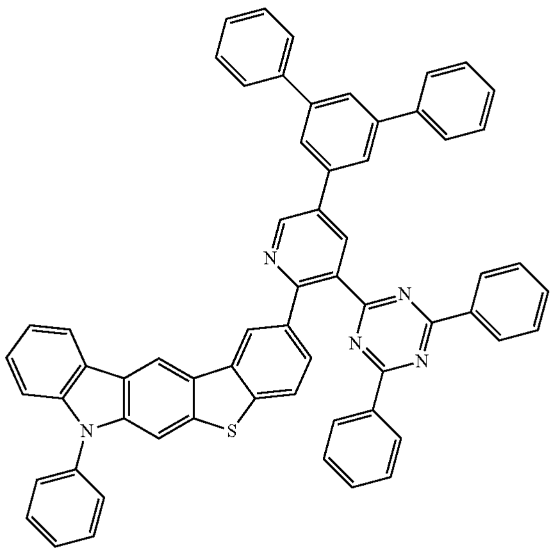
561
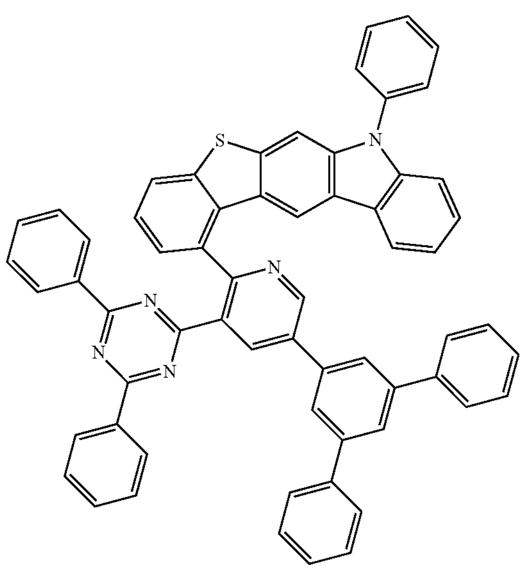
562
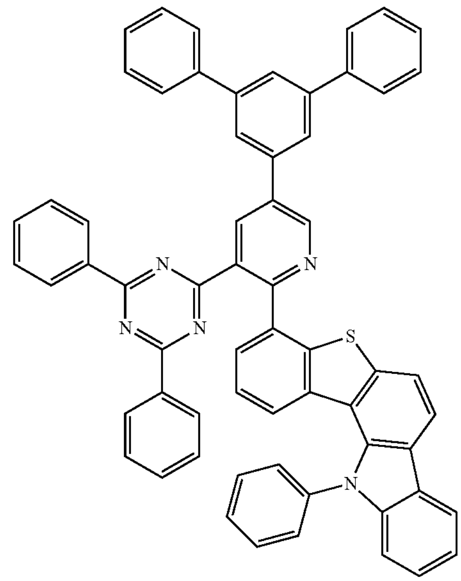
563
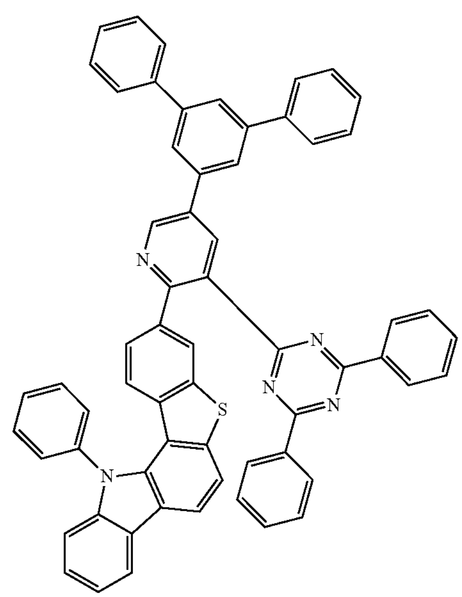

-continued
564
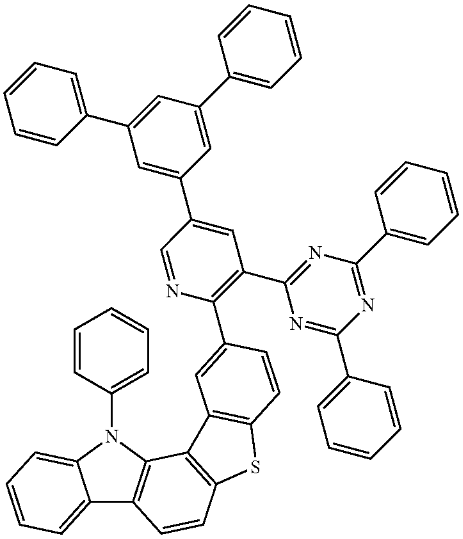
565
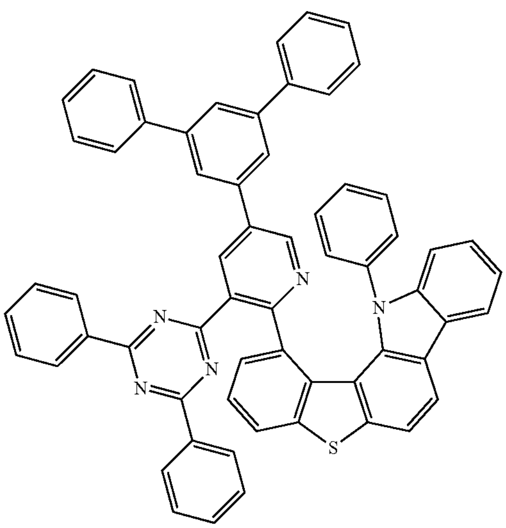
566
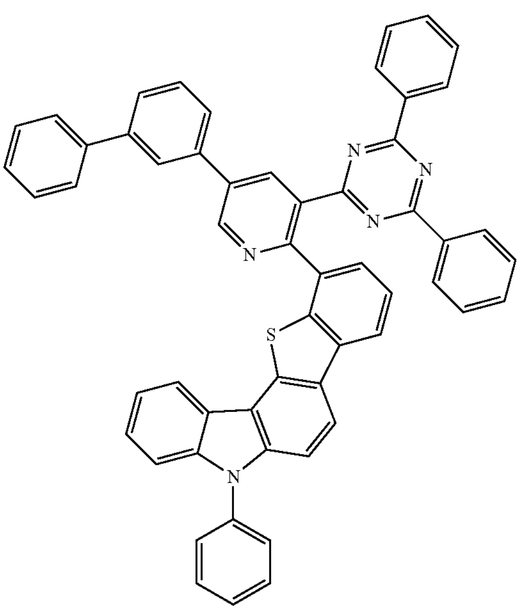
-continued
567
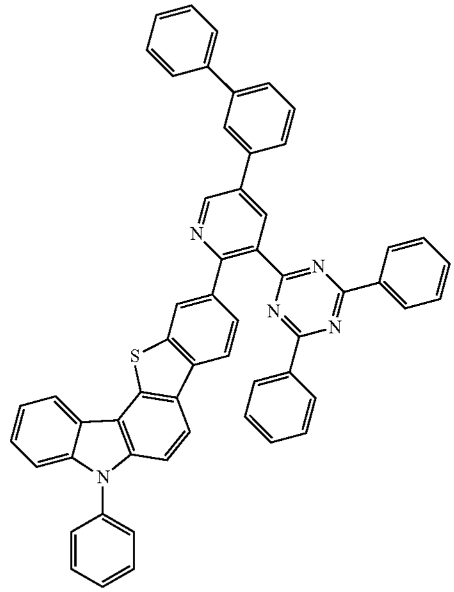
568
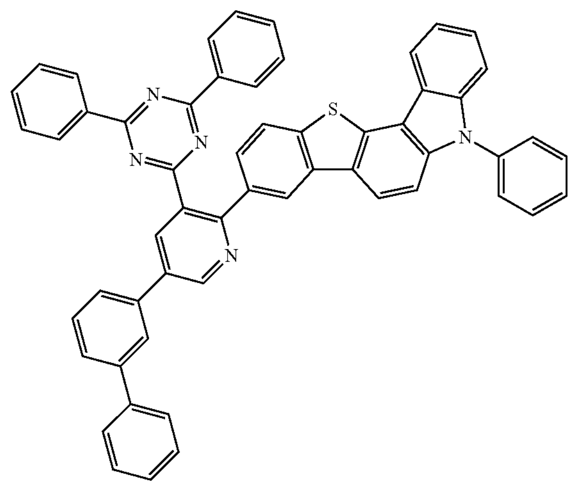
569
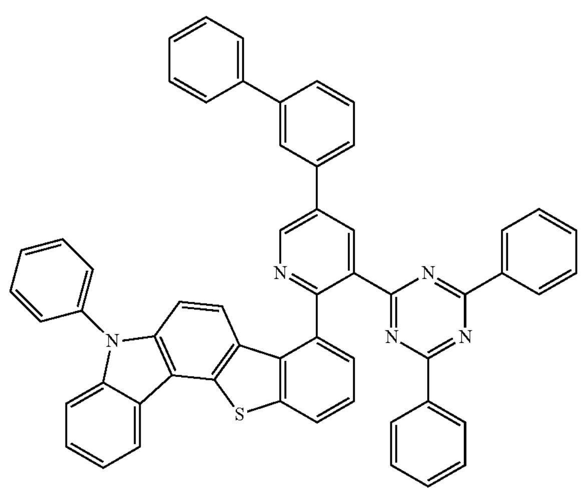

-continued
570
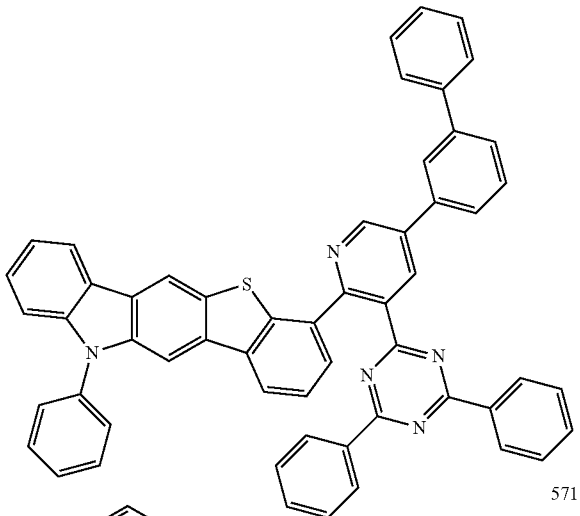
571
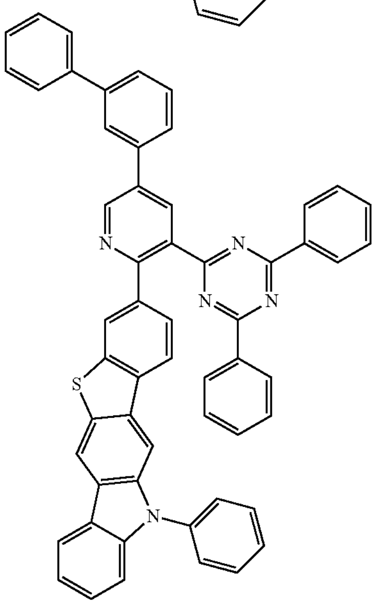
572
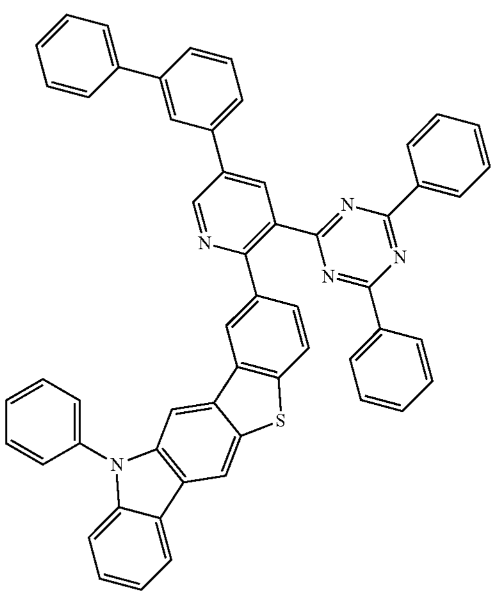
-continued
573
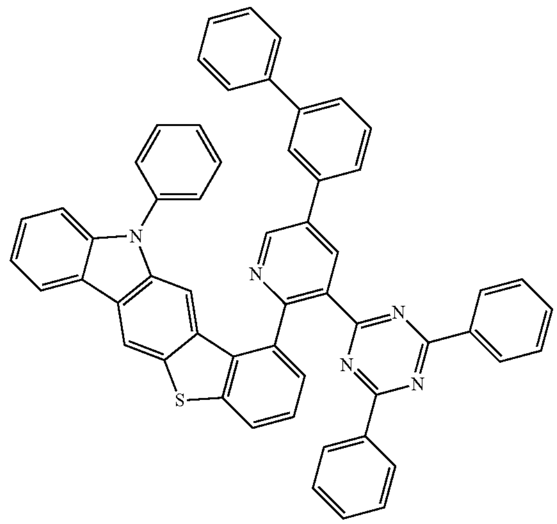
574
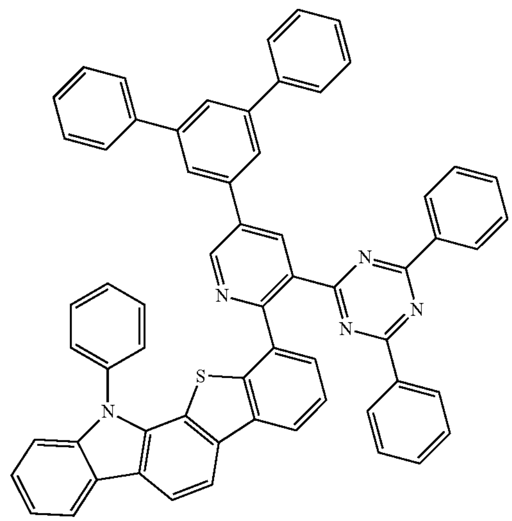
575
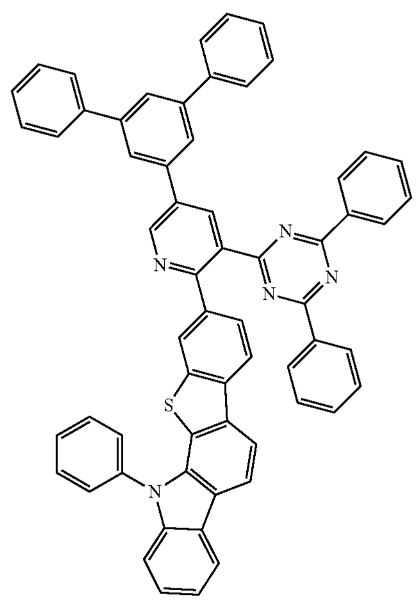

-continued
576
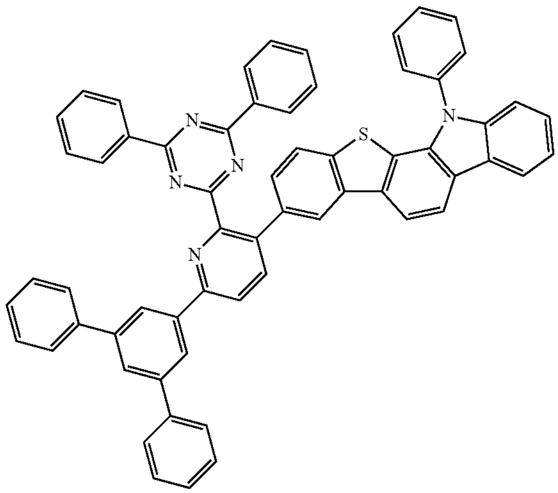
577
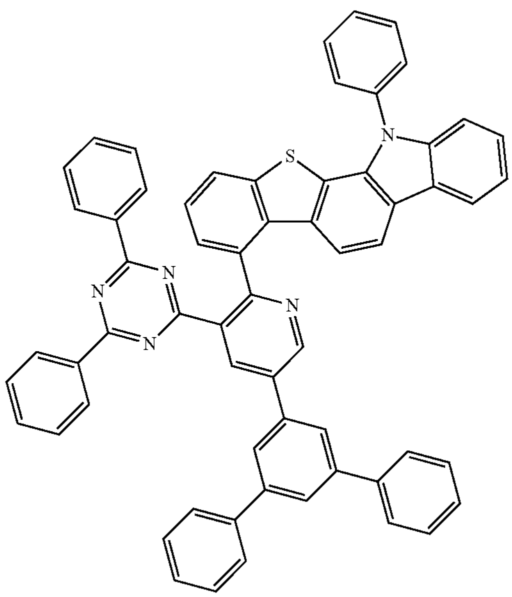
578
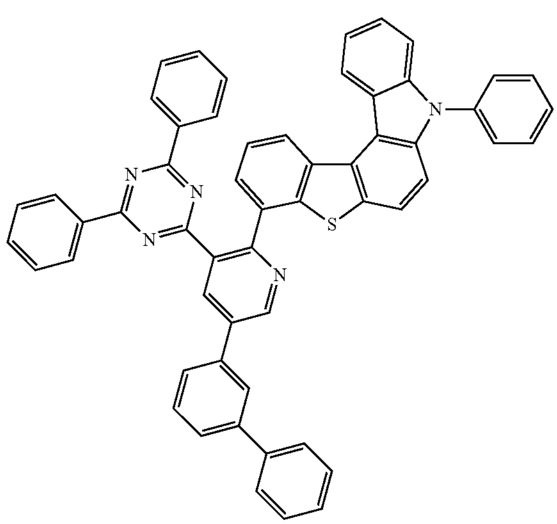
-continued
579
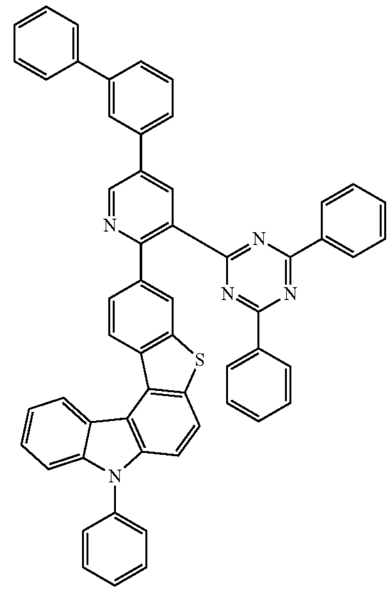
580
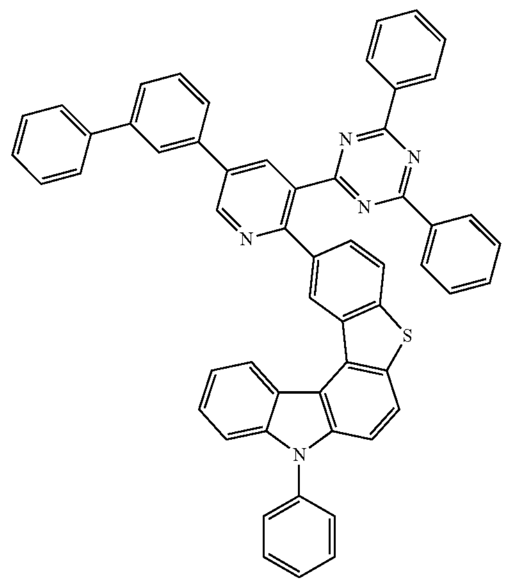
581
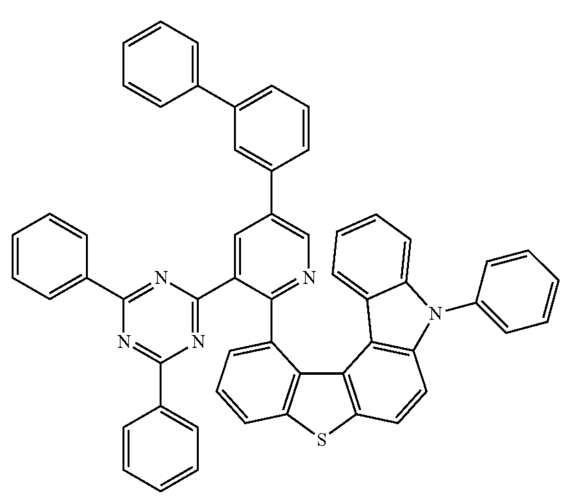

-continued
582
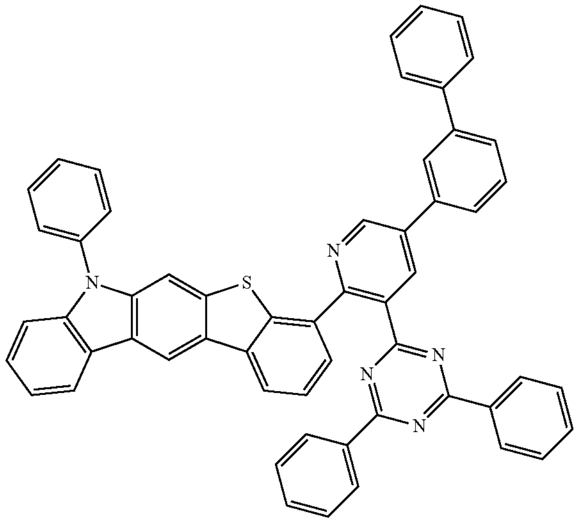
583
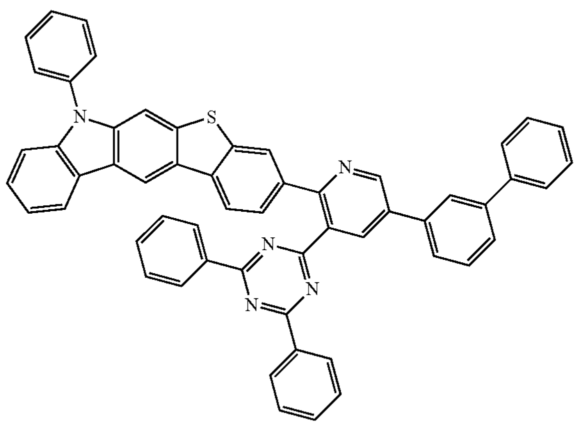
584
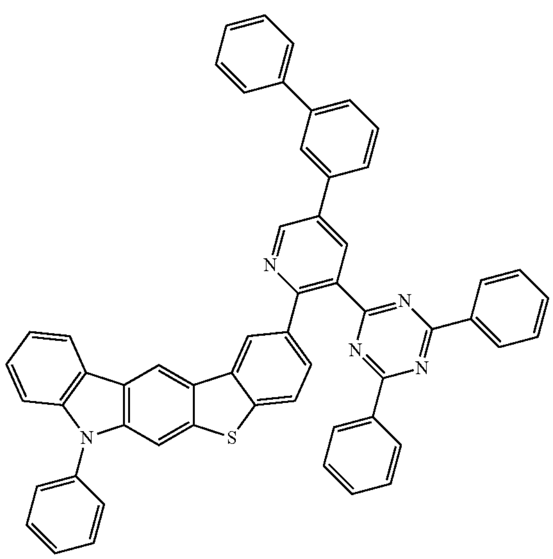
-continued
585
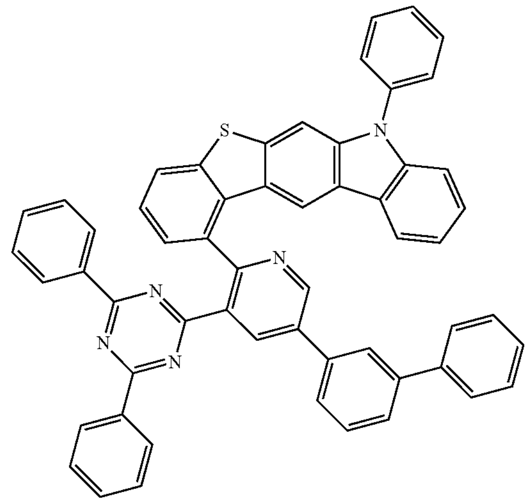
586
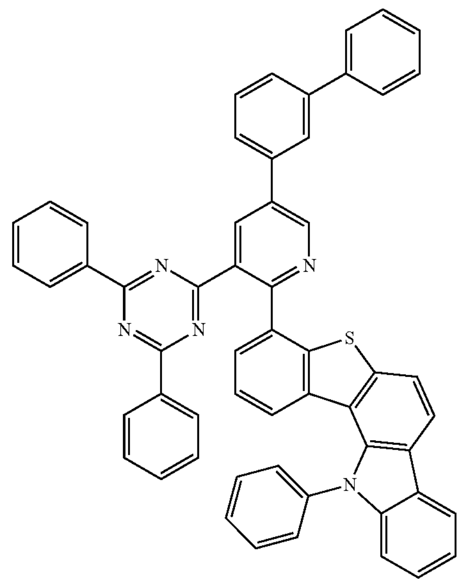
587
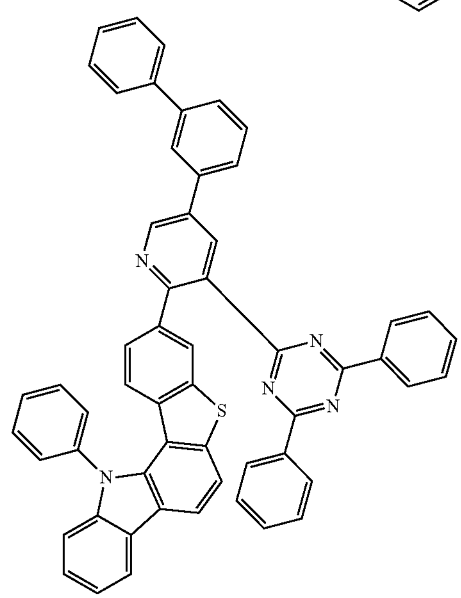

-continued
588
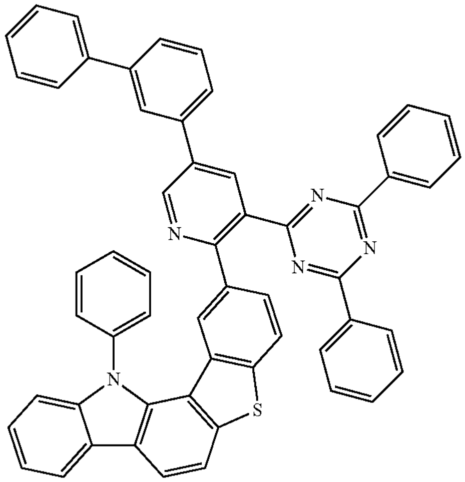
589
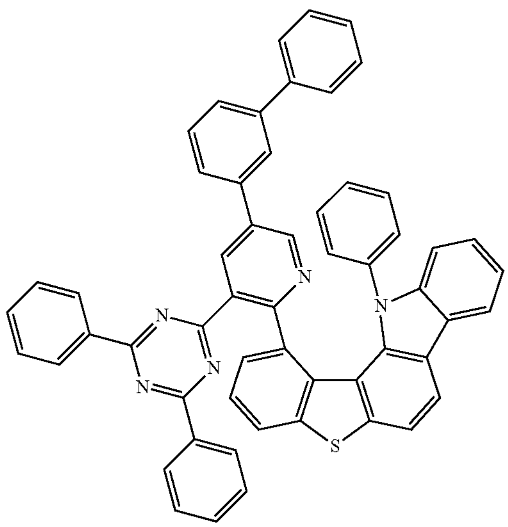
590
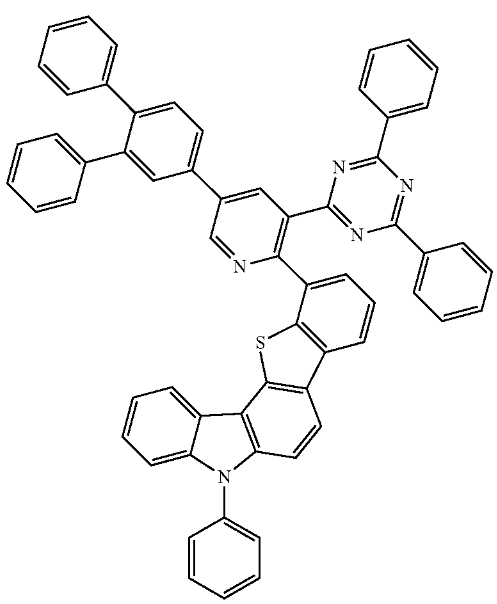
-continued
591
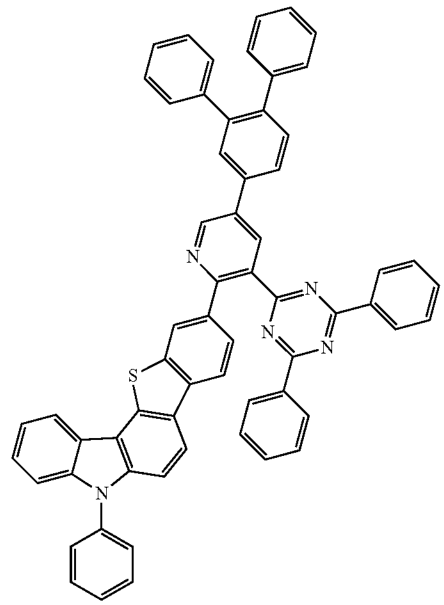
592
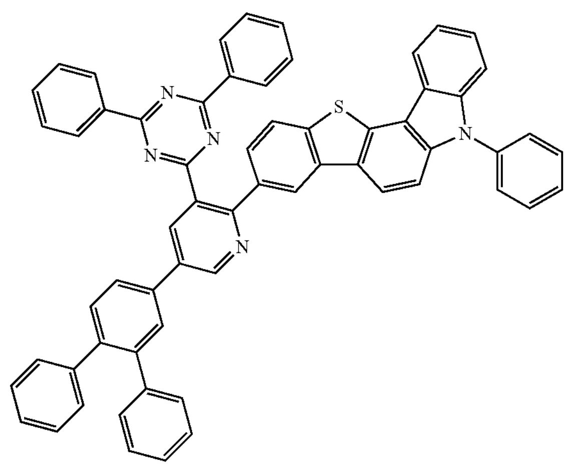
593
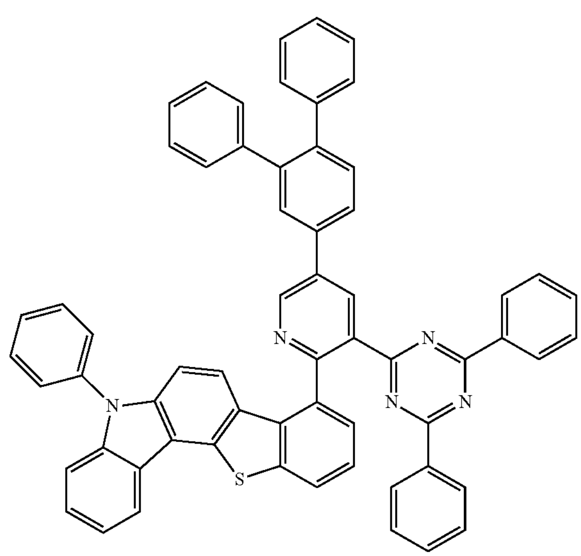

-continued
594
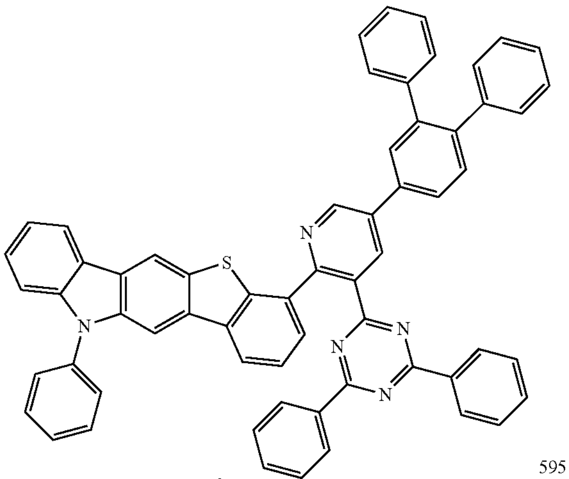
595
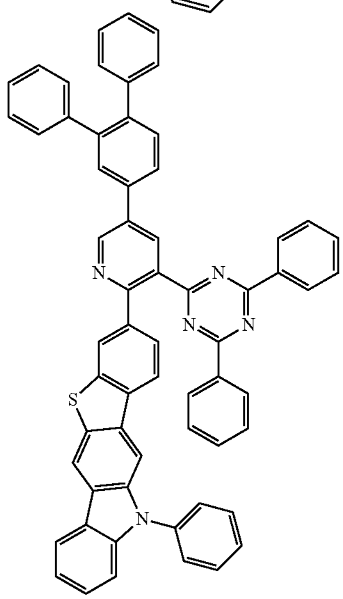
596
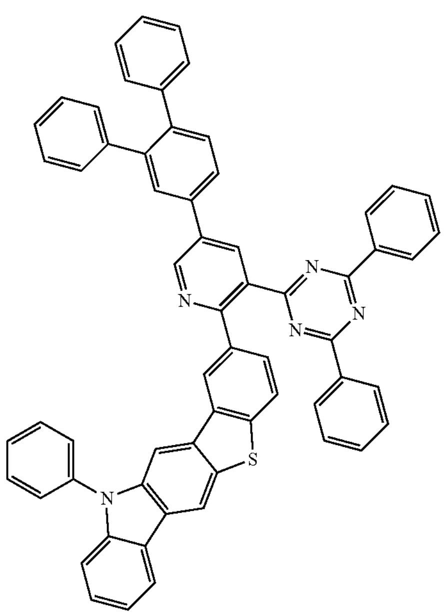
-continued
597
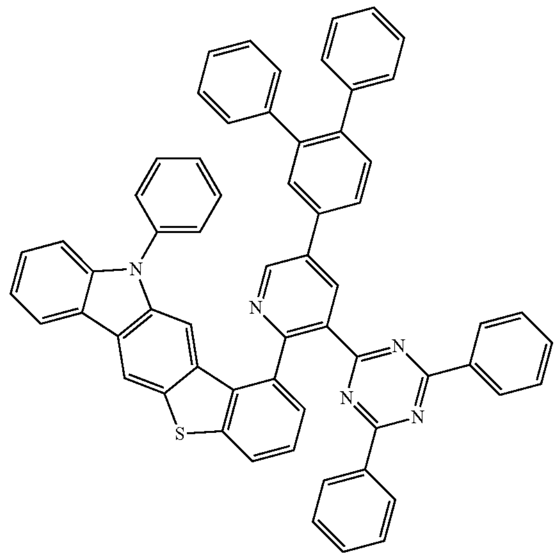
598
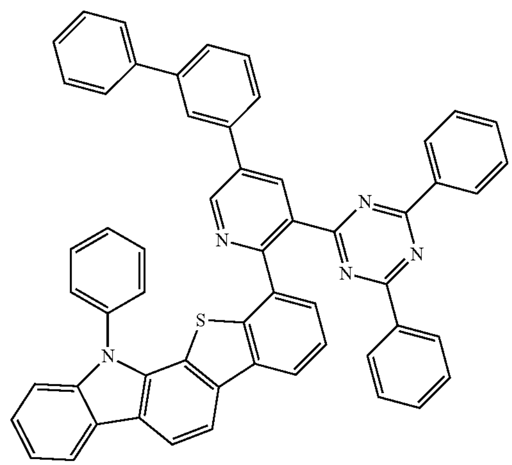
599
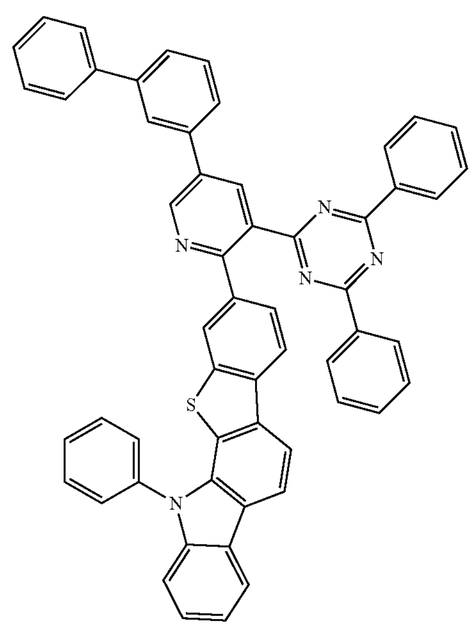

-continued
600
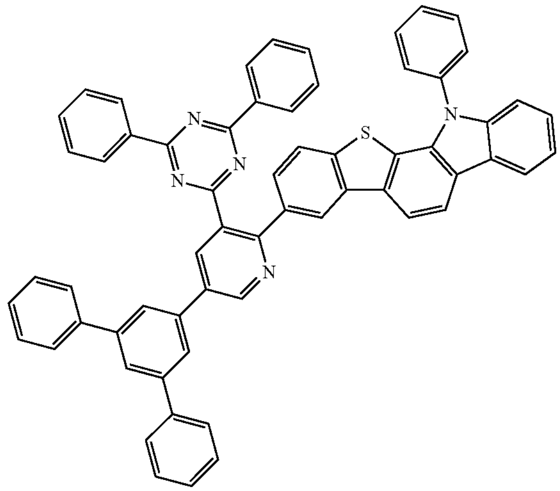
601
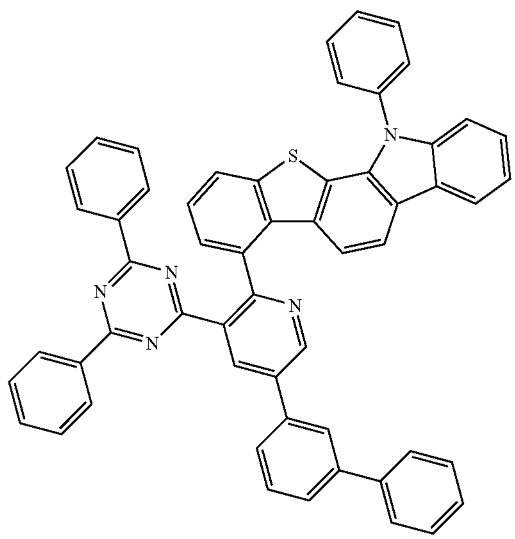
602
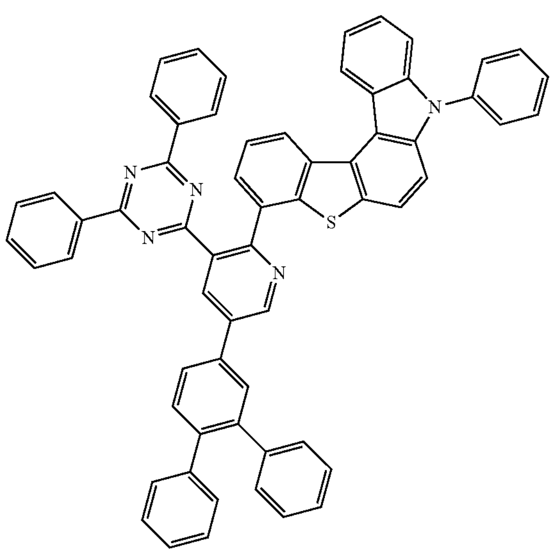
-continued
603
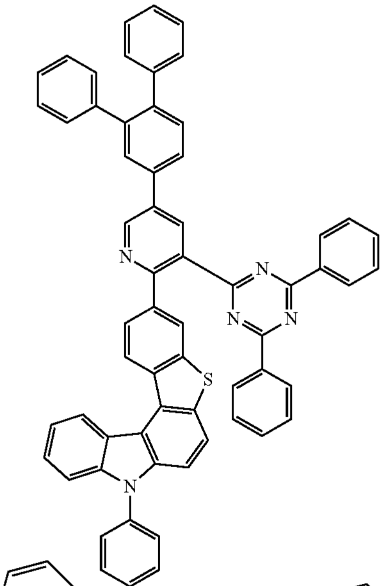
604
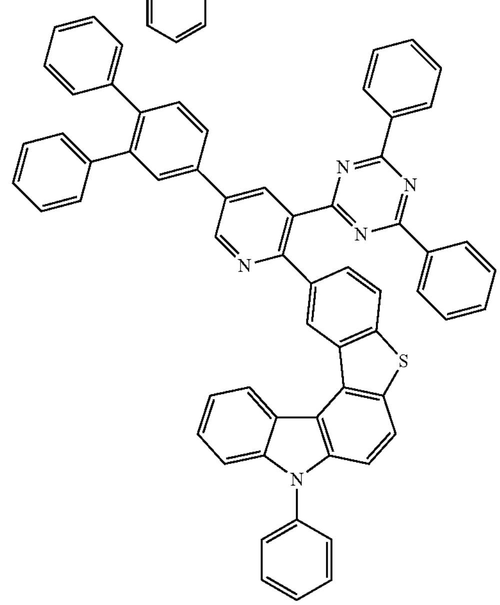
605
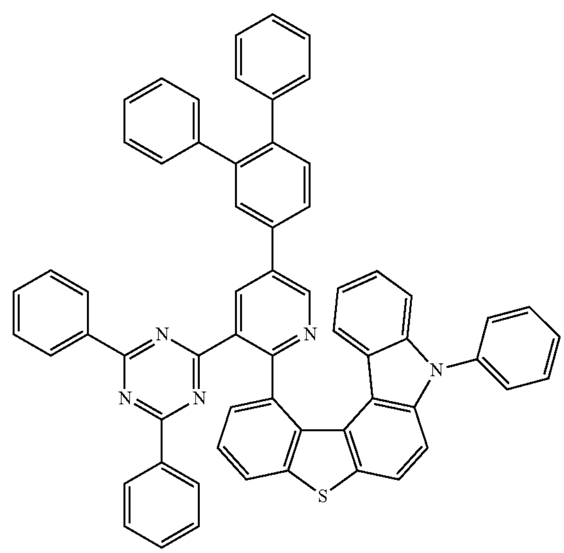

606
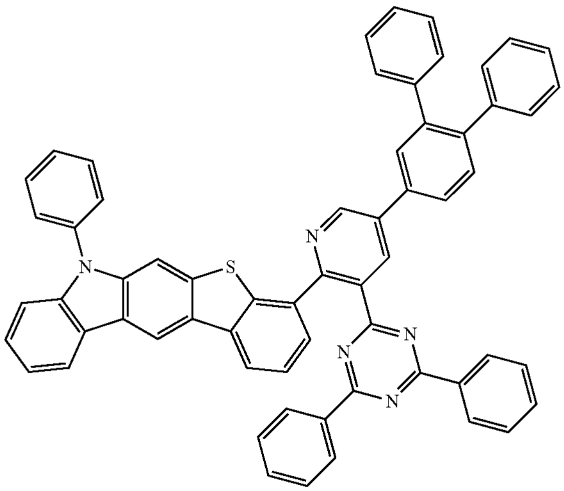
607
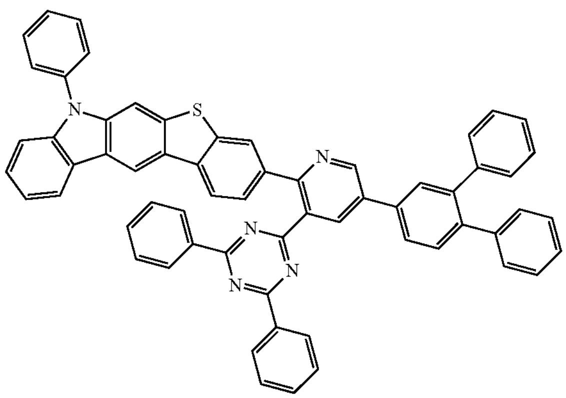
608
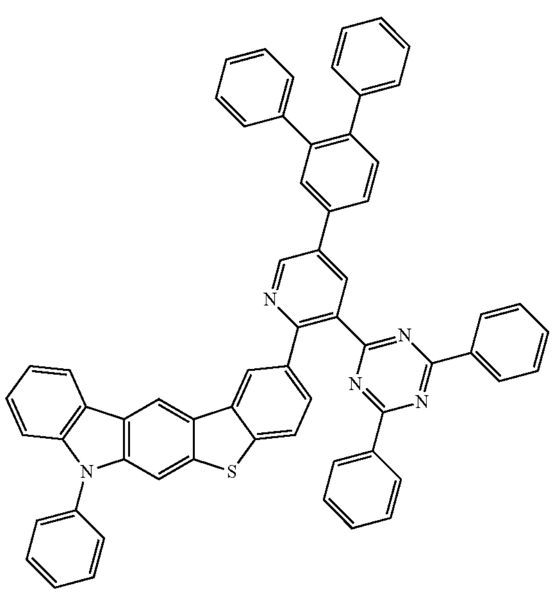
609
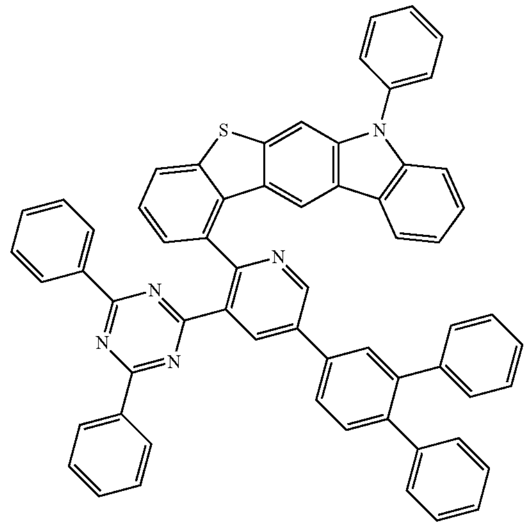
610
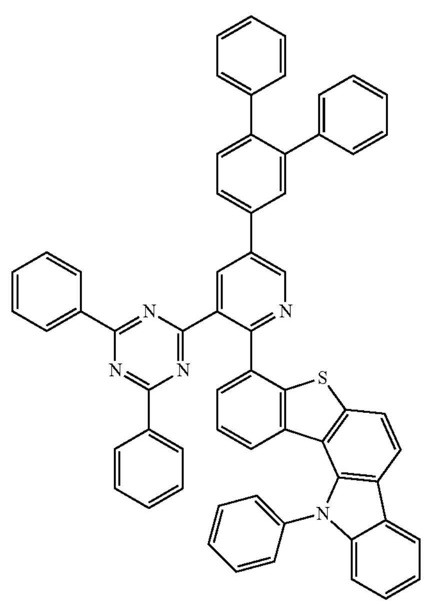

-continued
611
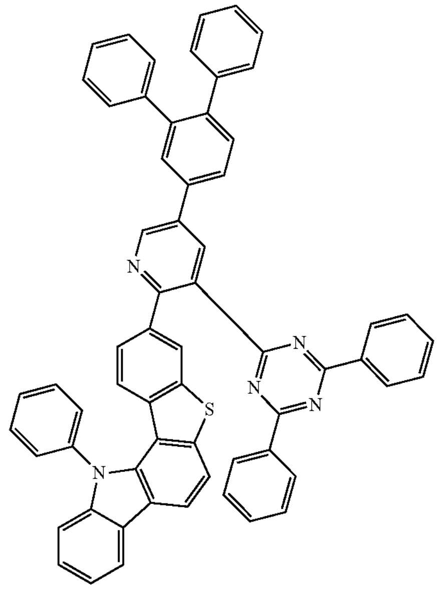
612
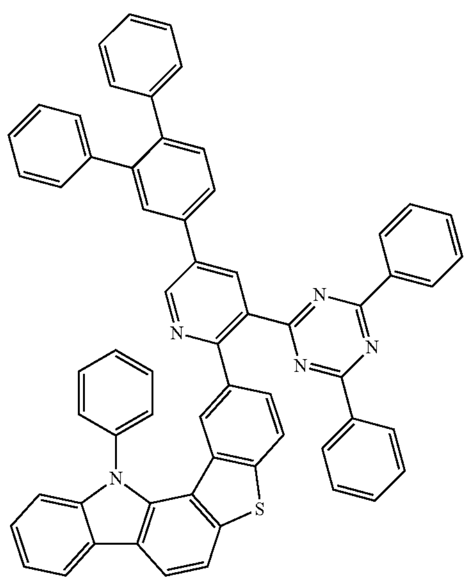
-continued
613
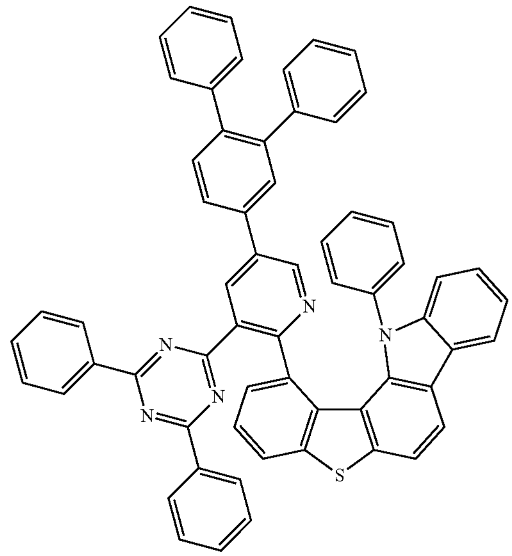
614
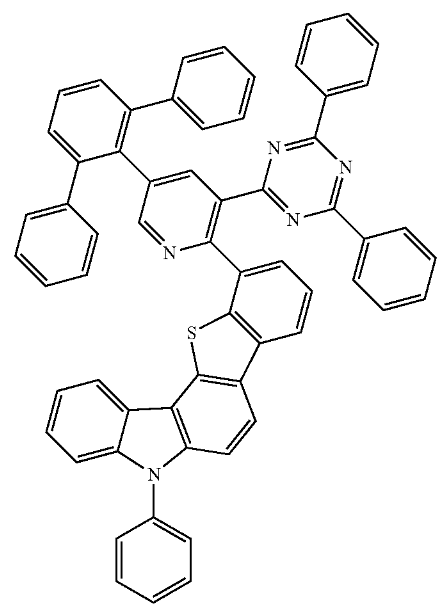

-continued
615
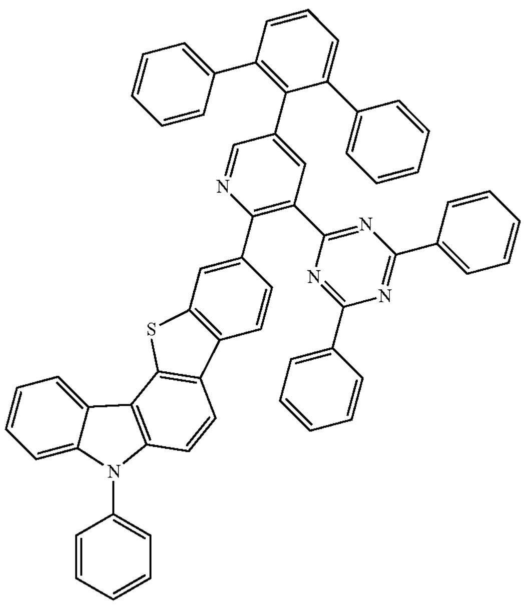
616
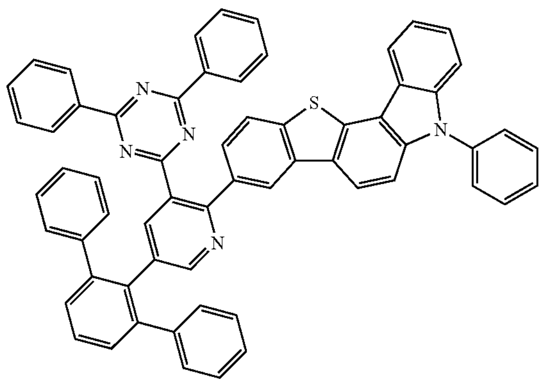
617
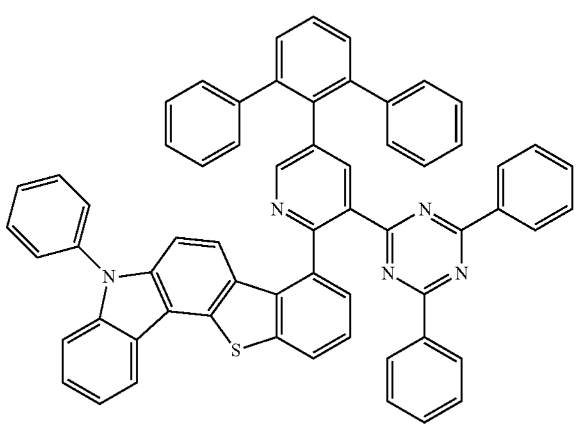
-continued
618
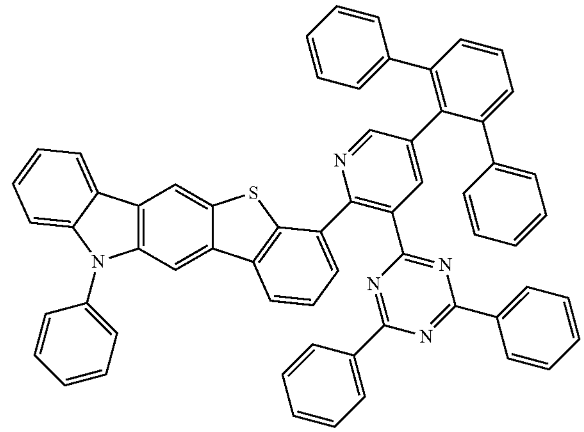
619
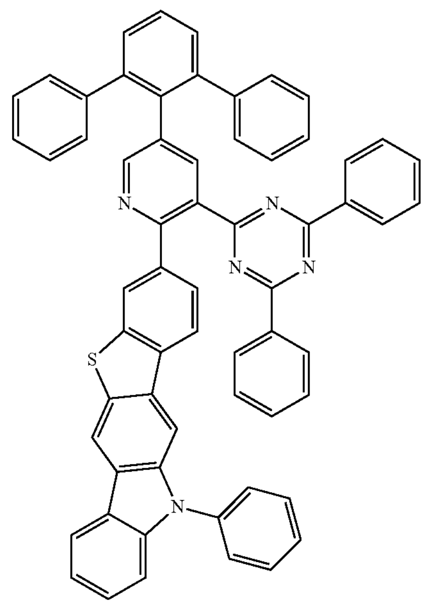
620
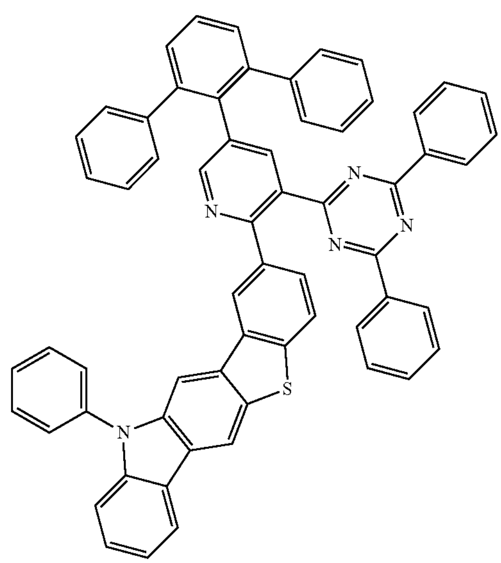

-continued
621
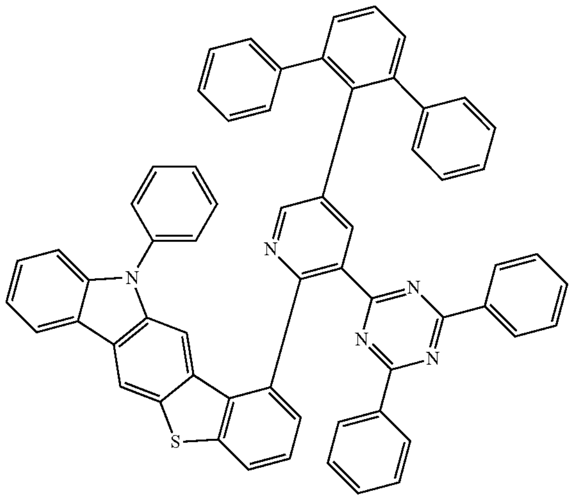
622
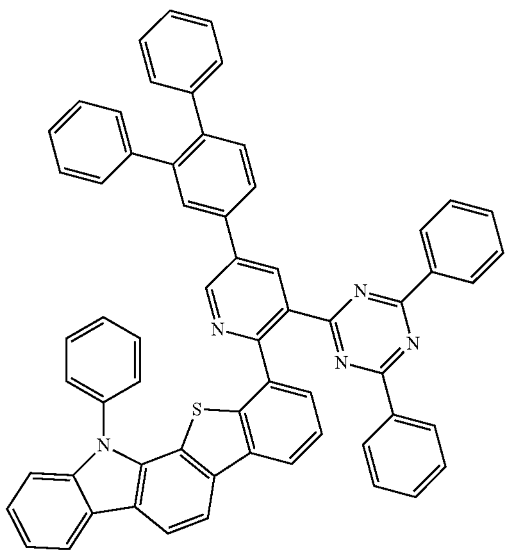
623
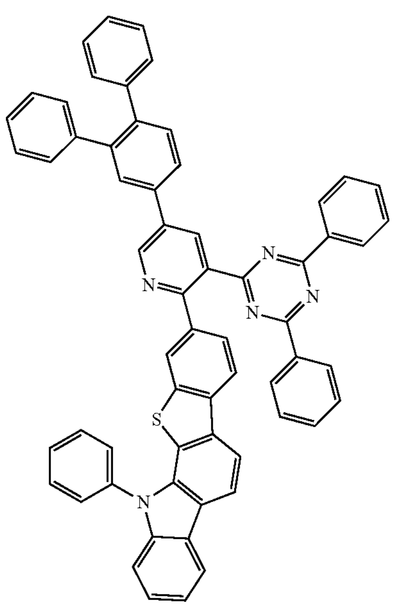
-continued
624
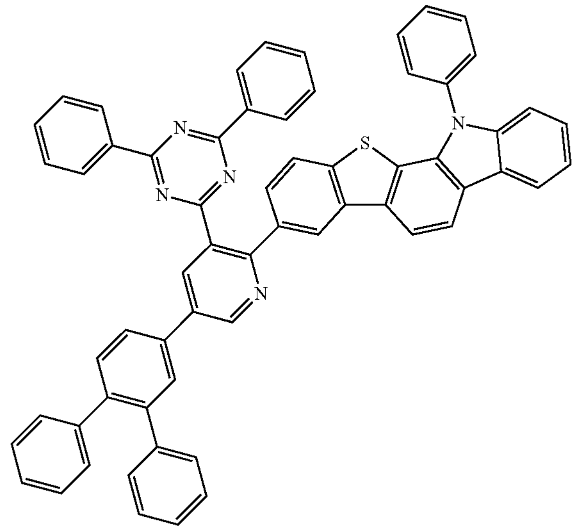
625
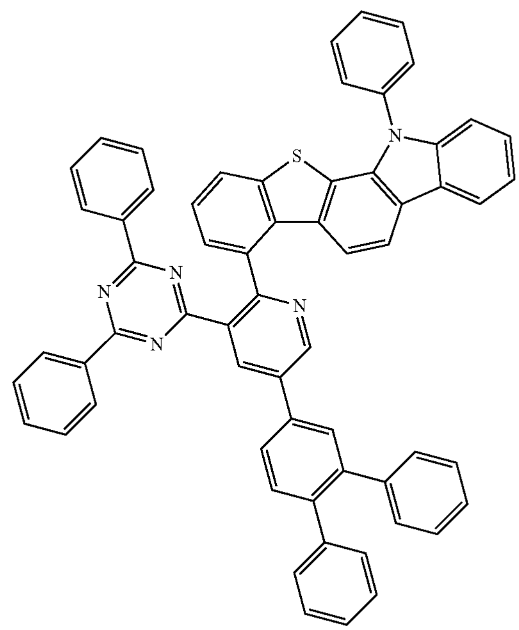
626
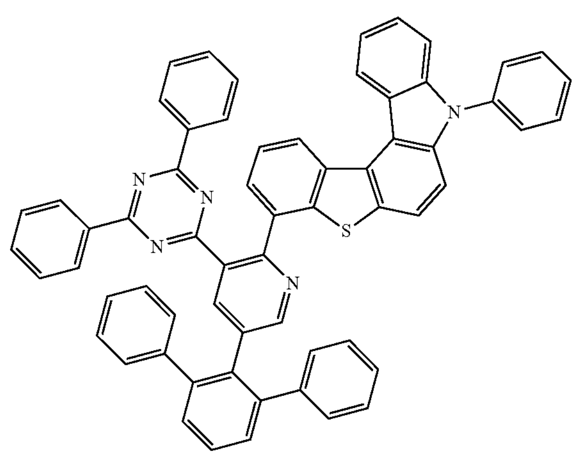

-continued
627
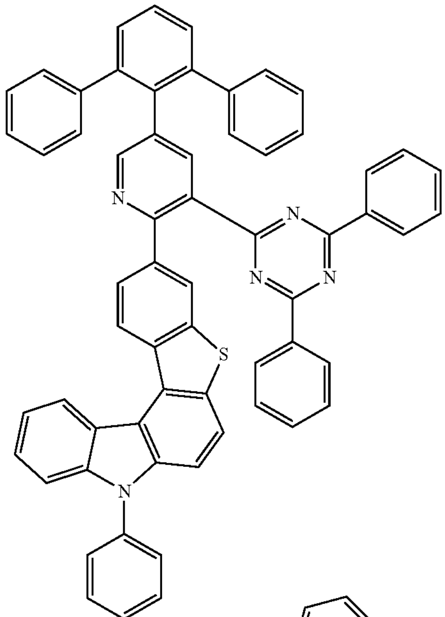
628
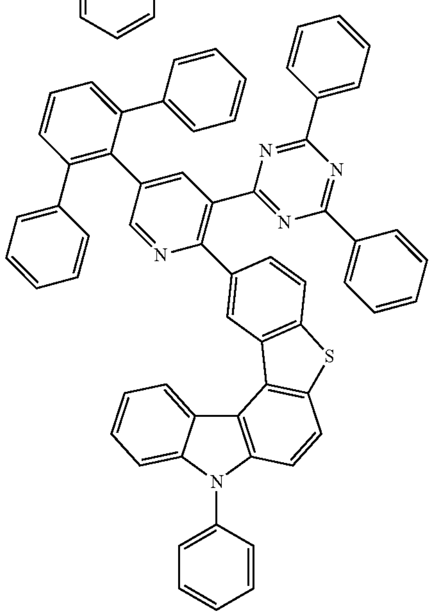
629
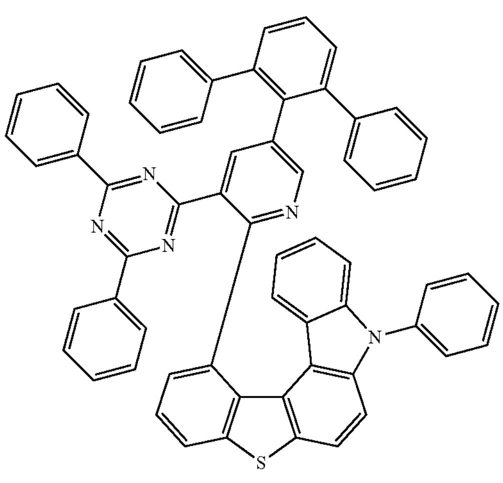
630
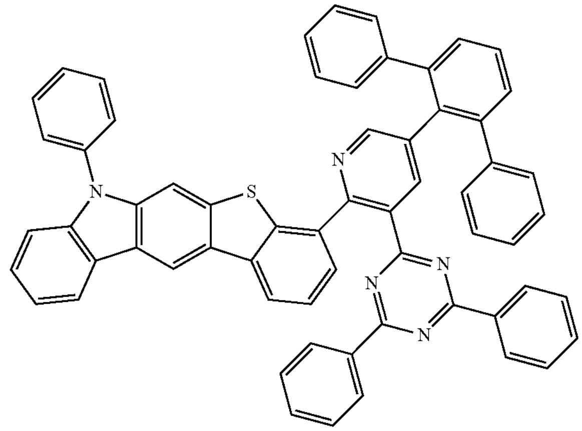
631
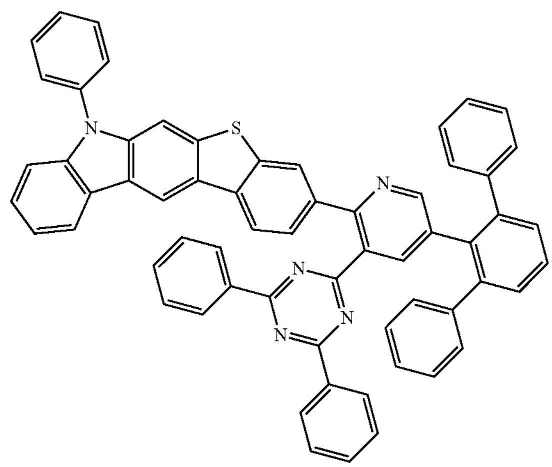
632
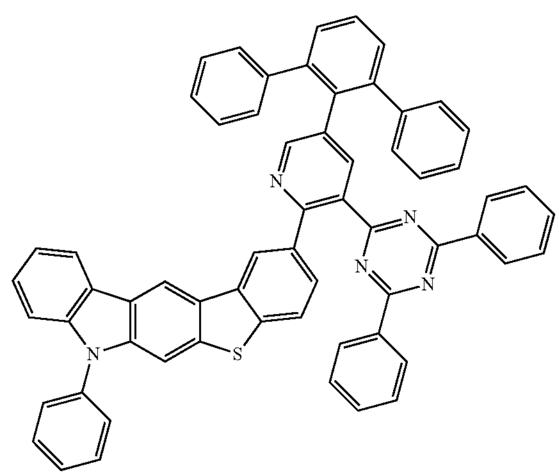

-continued
633
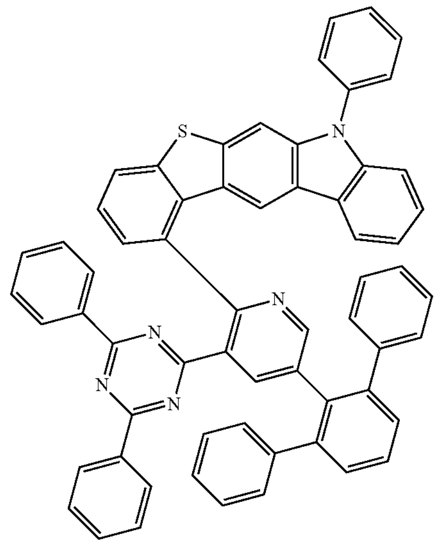
634
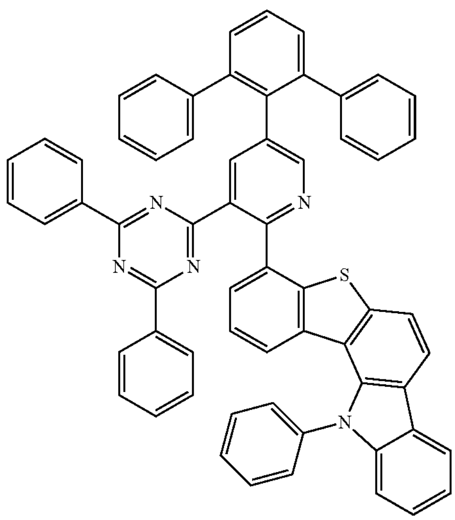
635
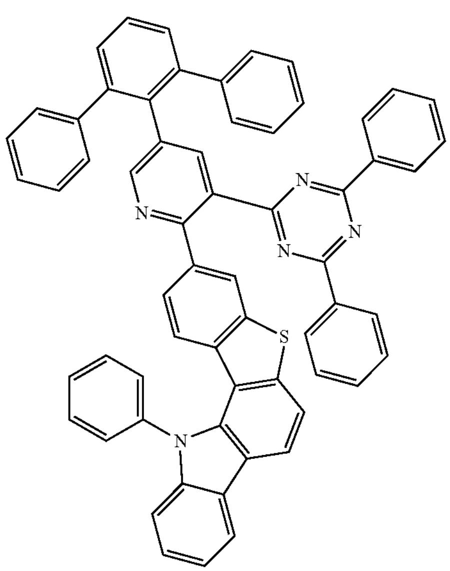
-continued
636
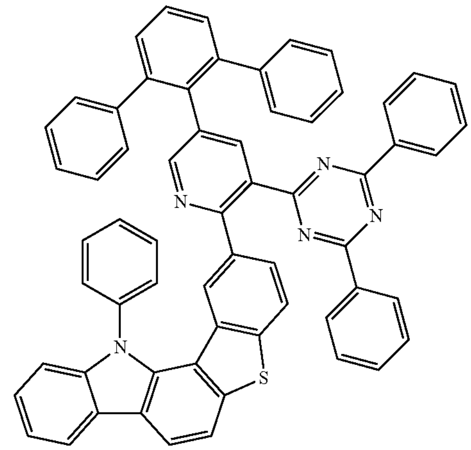
637
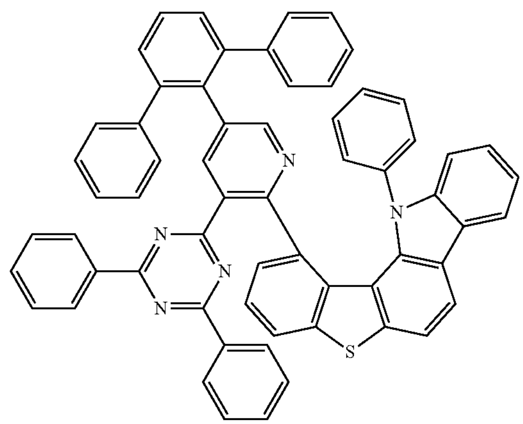
638
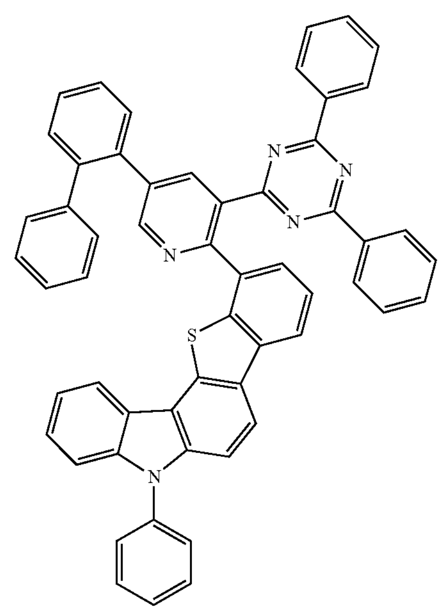

639
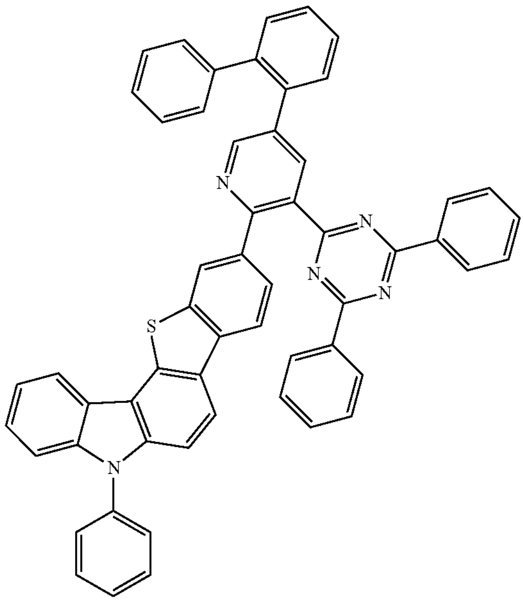
640
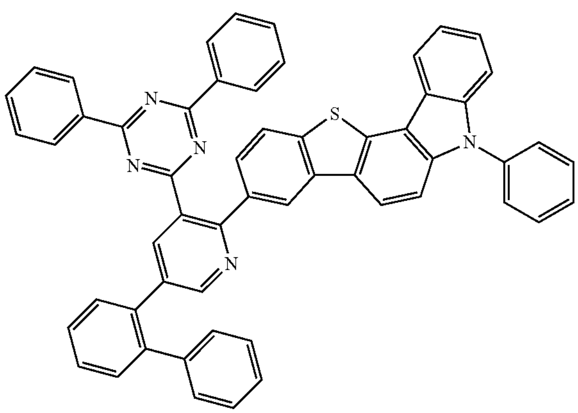
641
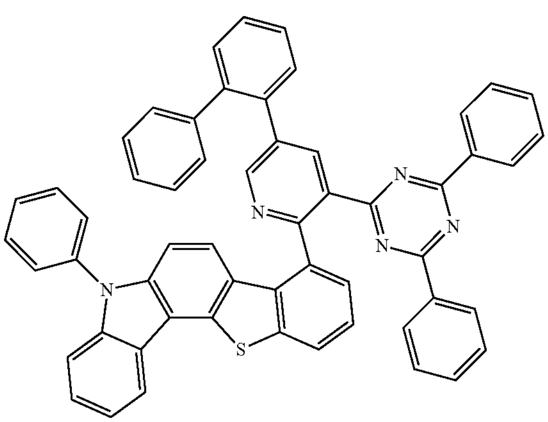
642
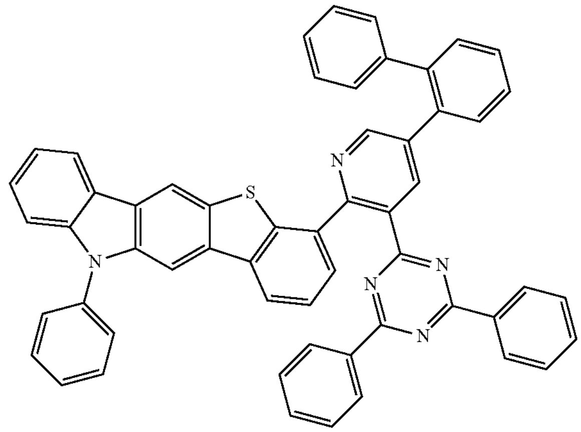
643
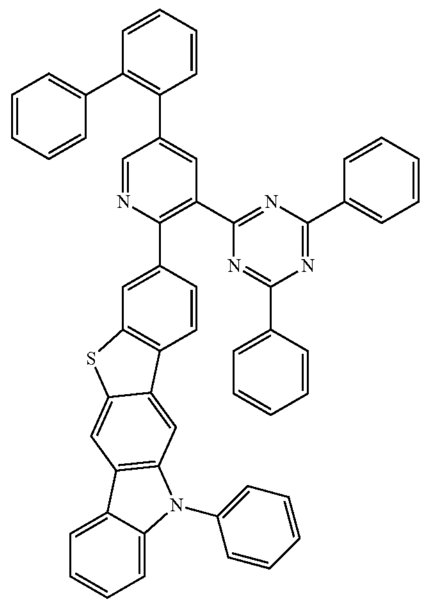
644
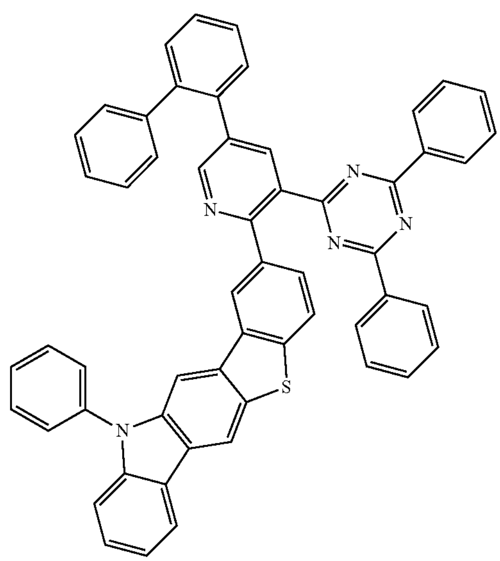

-continued
645
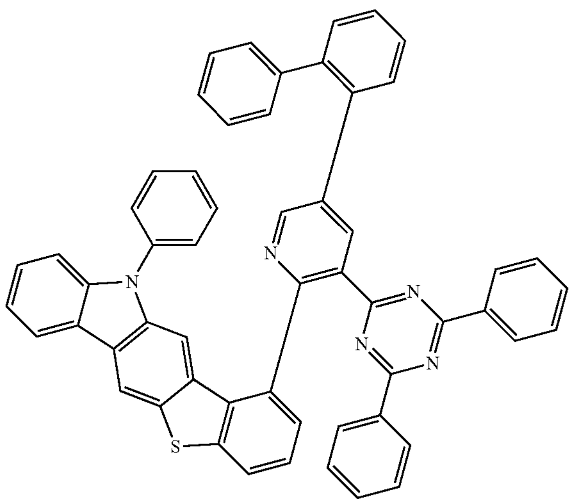
646
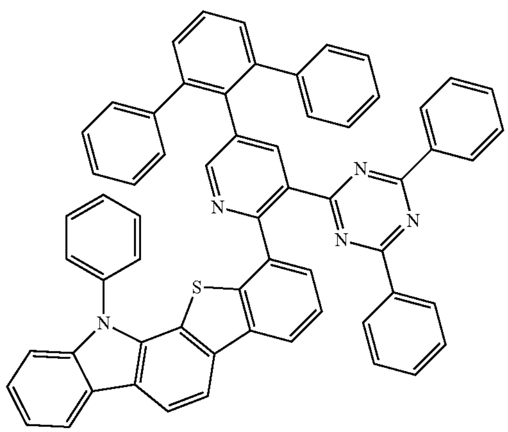
647
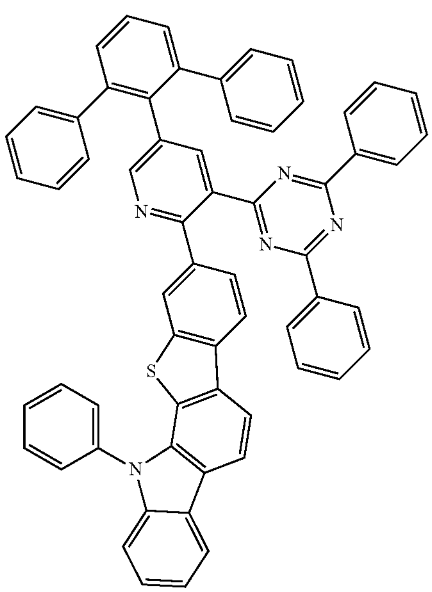
-continued
648
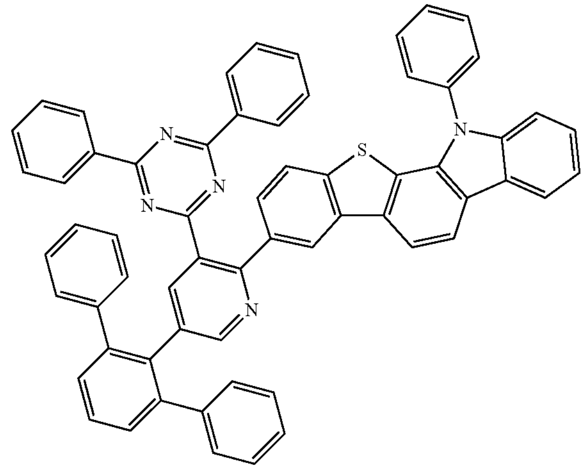
649
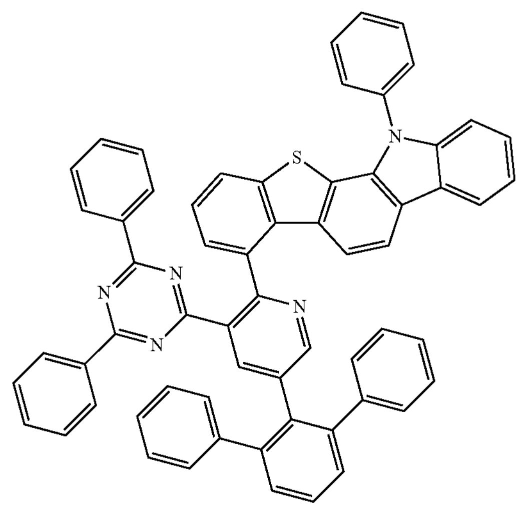
650
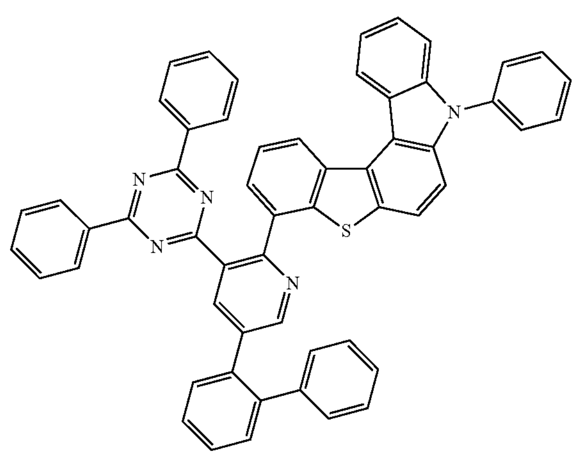

-continued
651
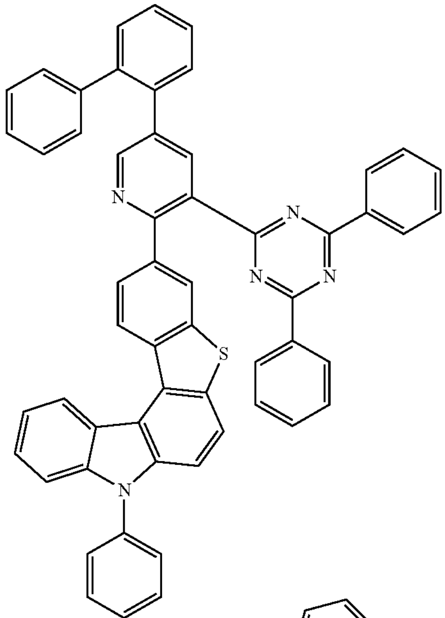
652
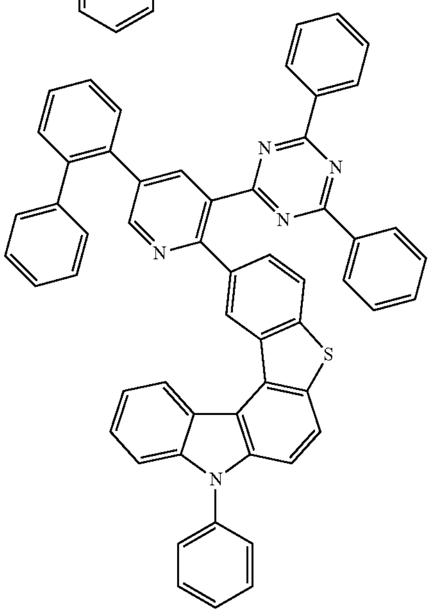
653
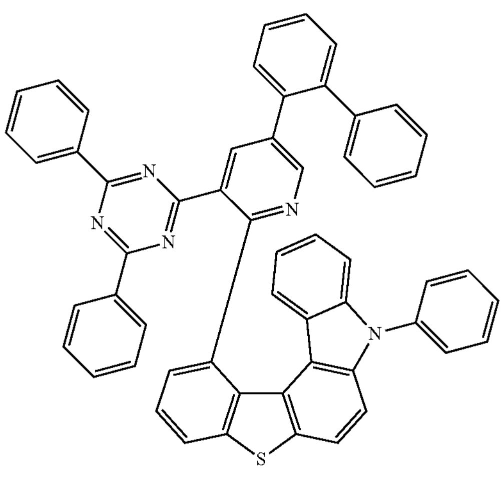
-continued
654
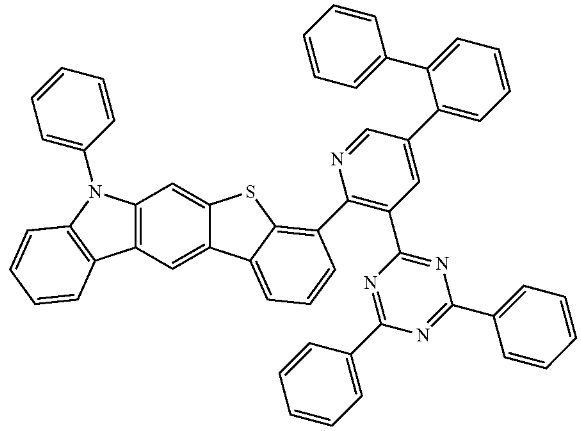
655
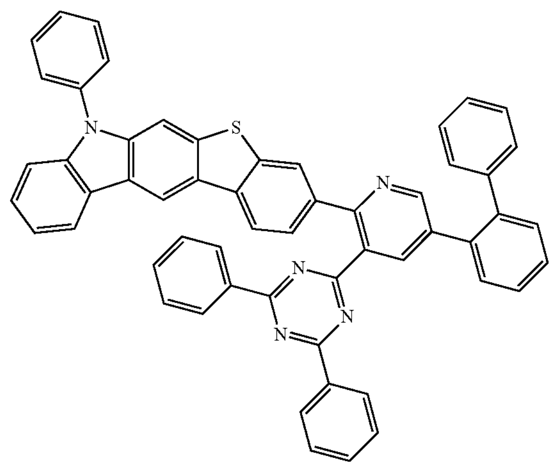
656
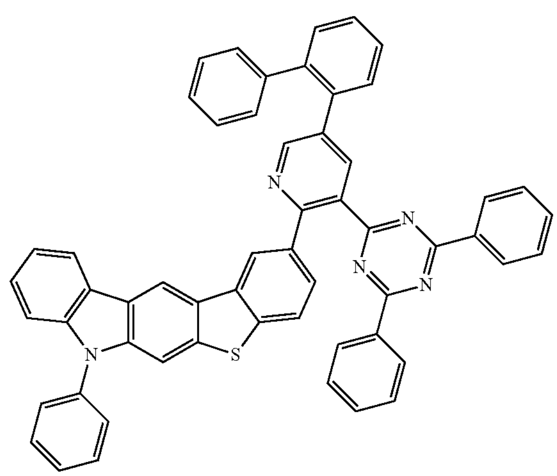

-continued
657
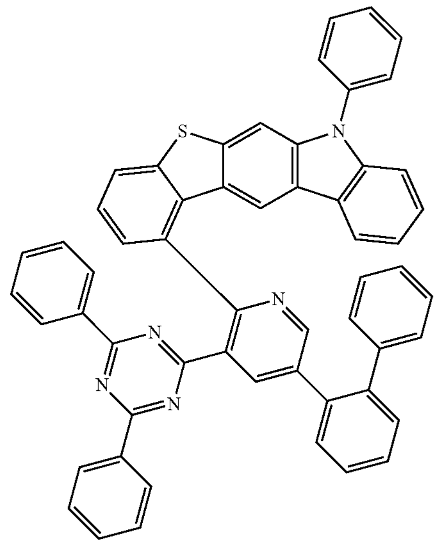
658
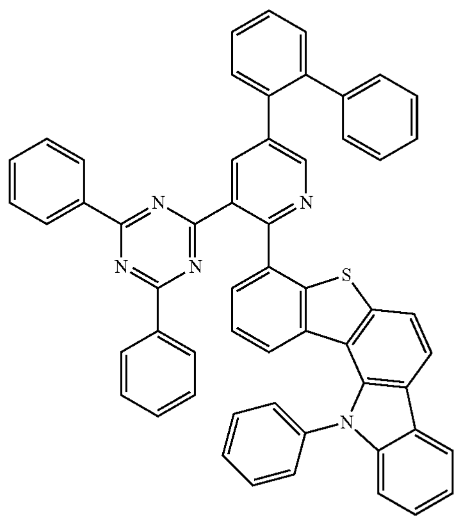
659
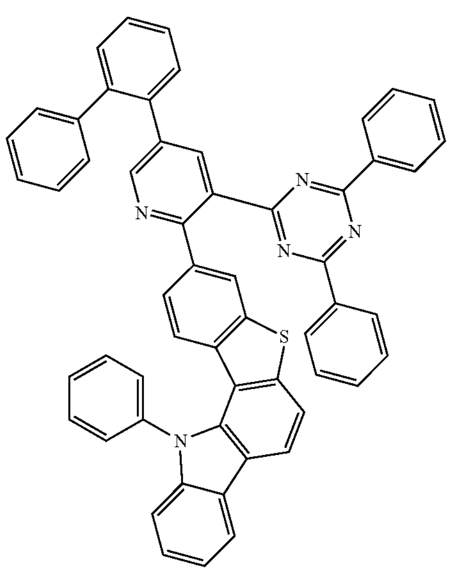
-continued
660
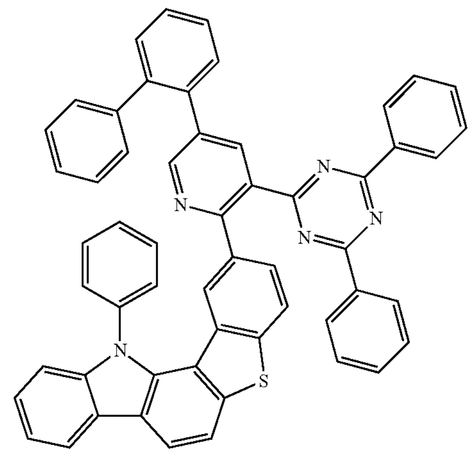
661
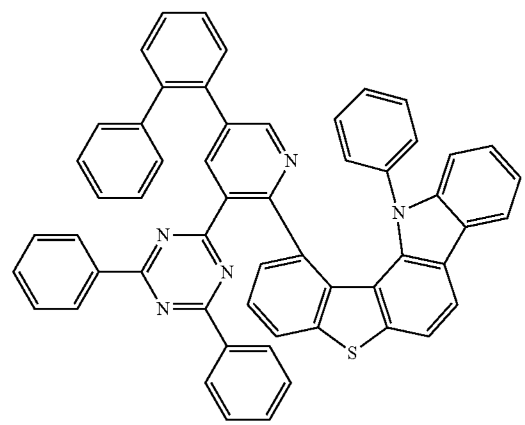
662
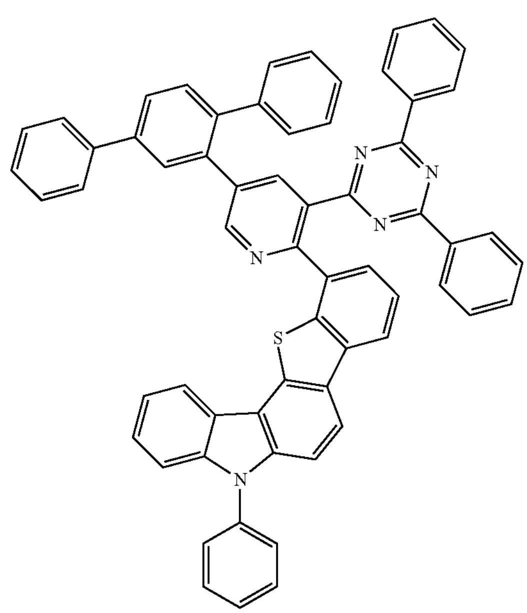

-continued
663
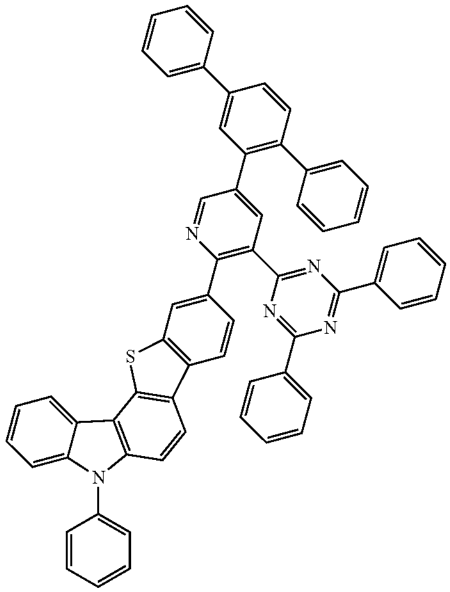
664
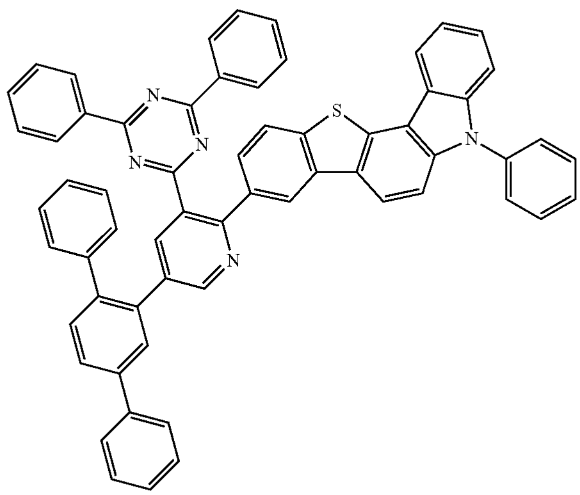
665
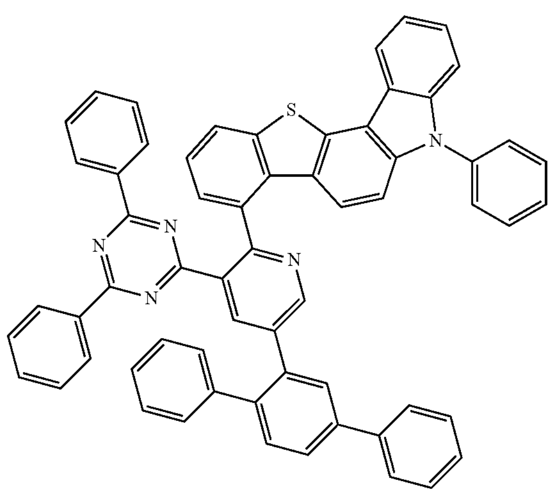
-continued
666
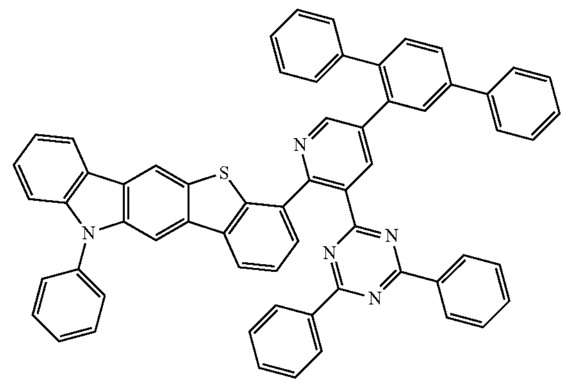
667
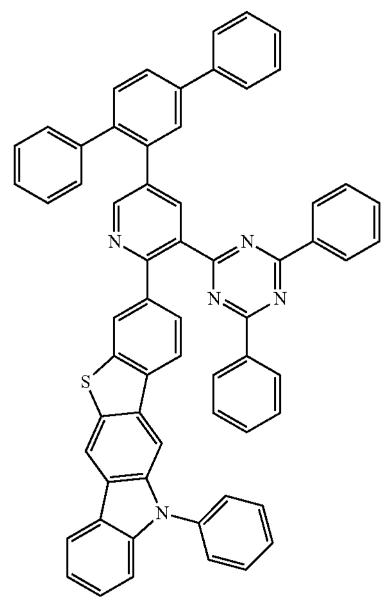
668
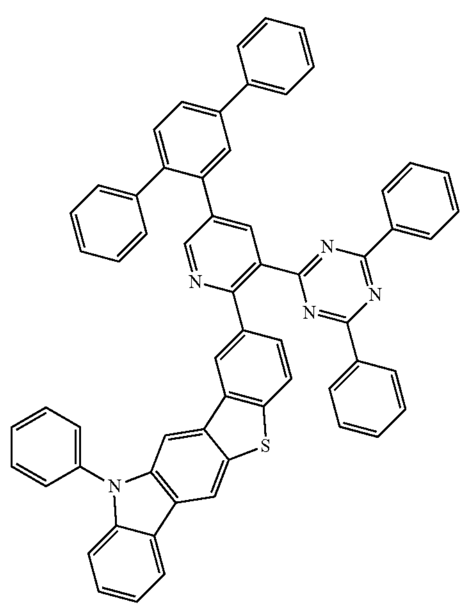

-continued
669
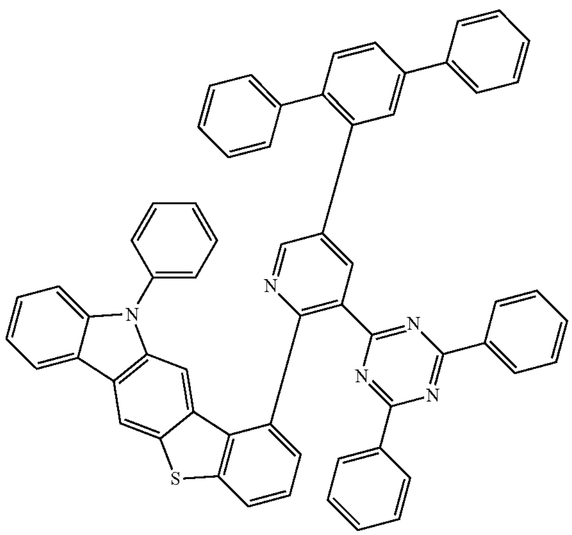
670
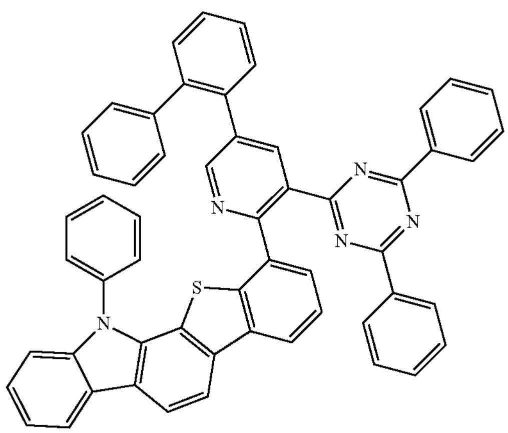
671
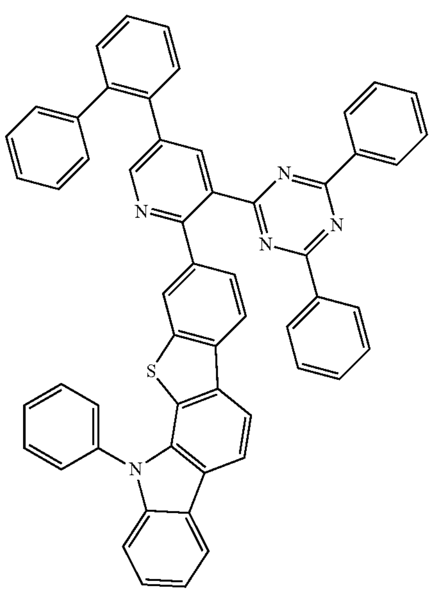
-continued
672
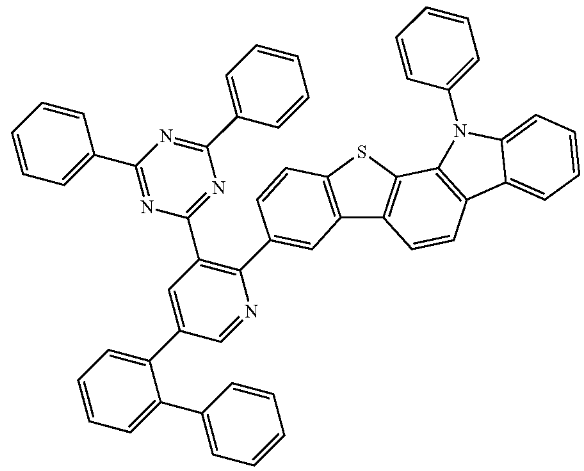
673
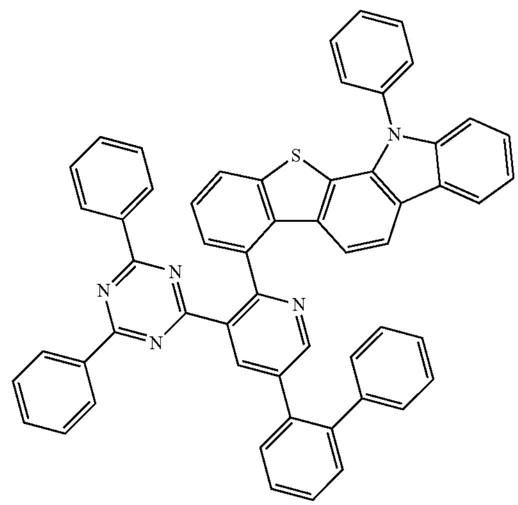
674
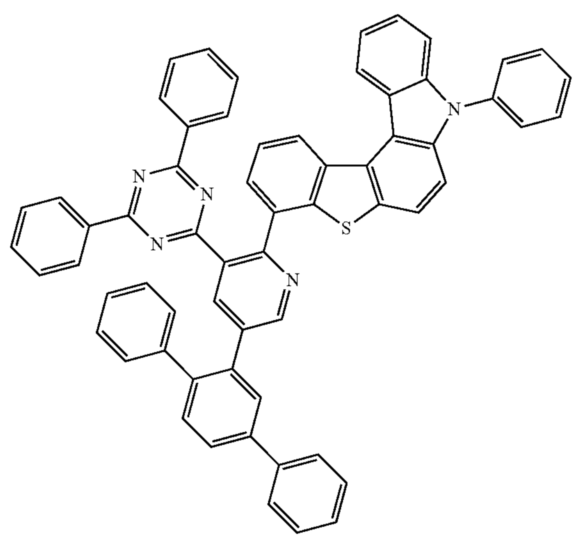

-continued
675
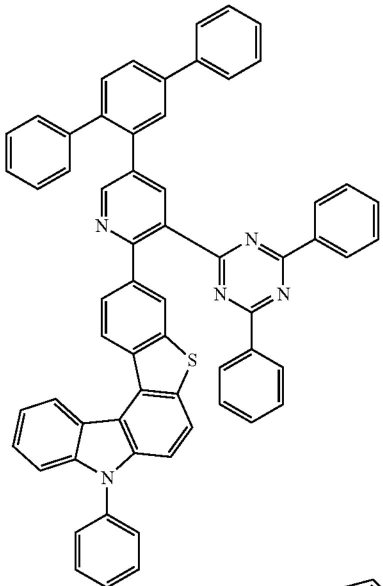
676
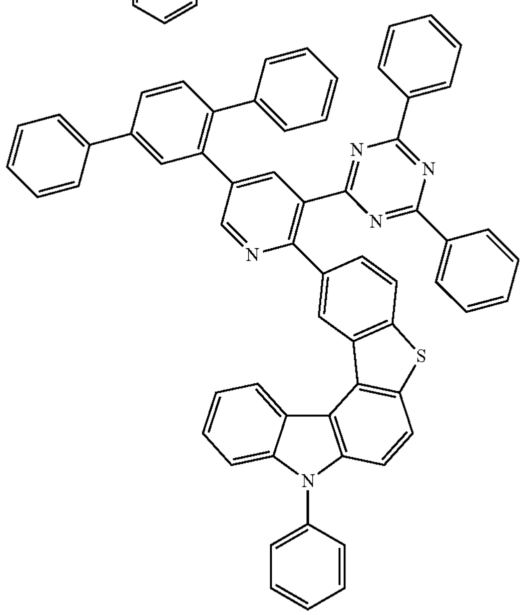
677
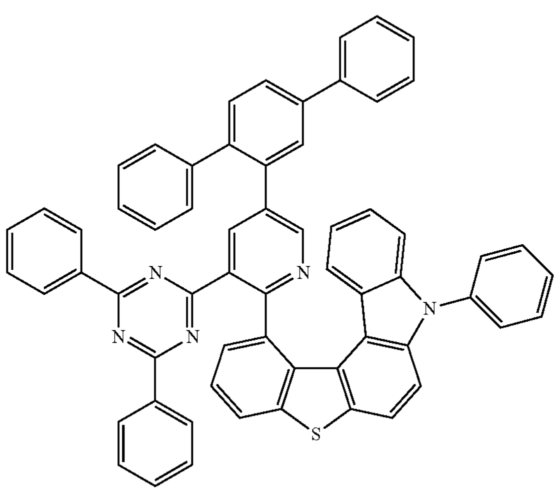
-continued
678
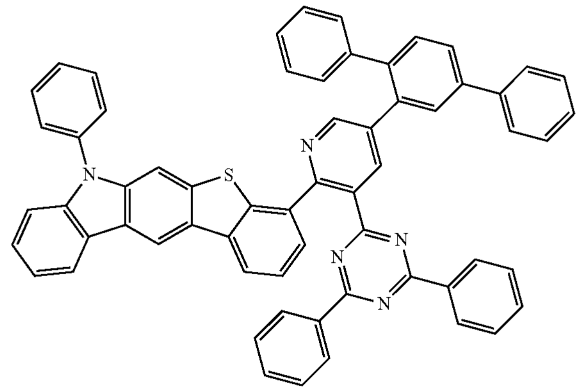
679
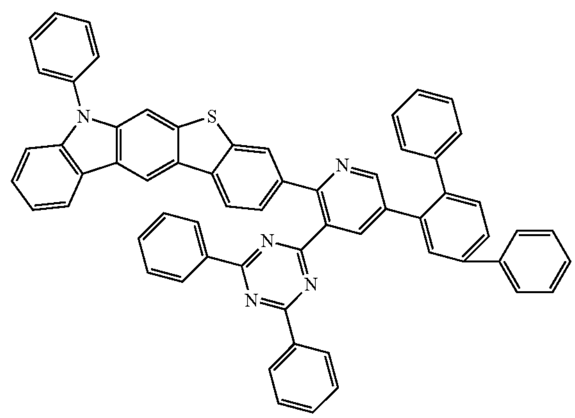
680
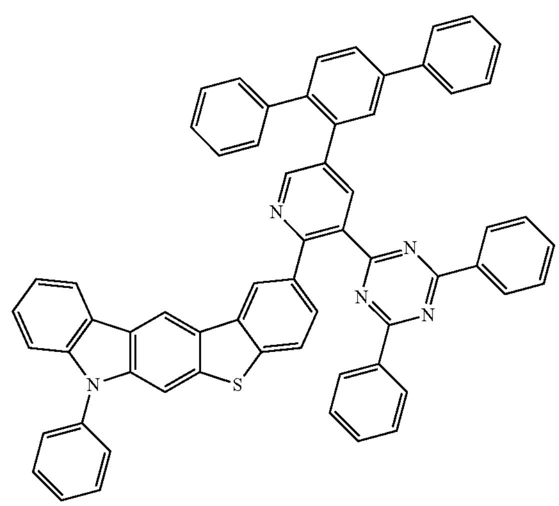

-continued
681
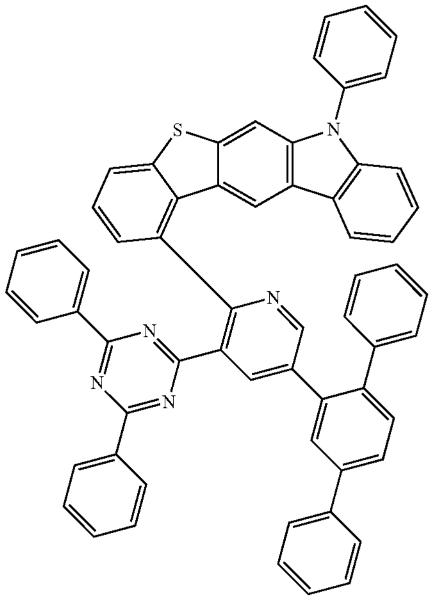
682
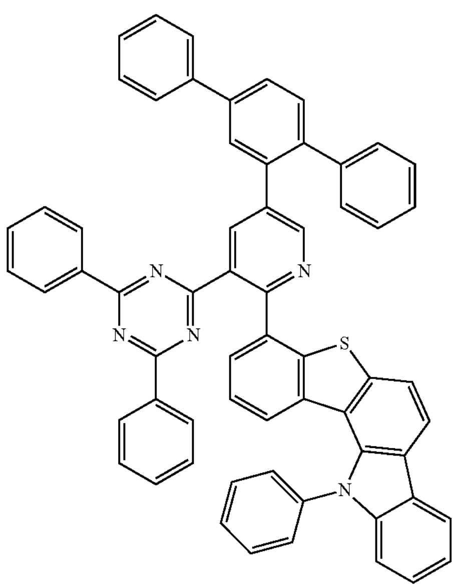
-continued
683
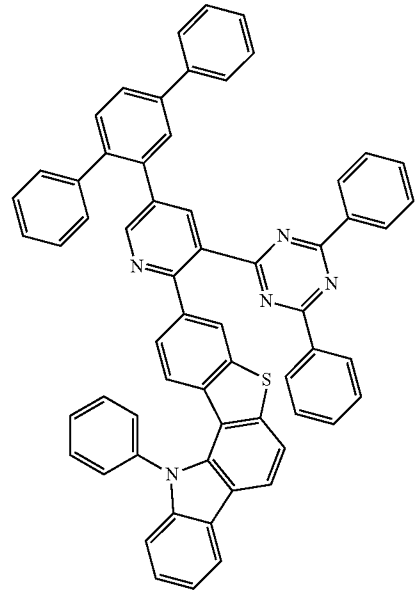
684
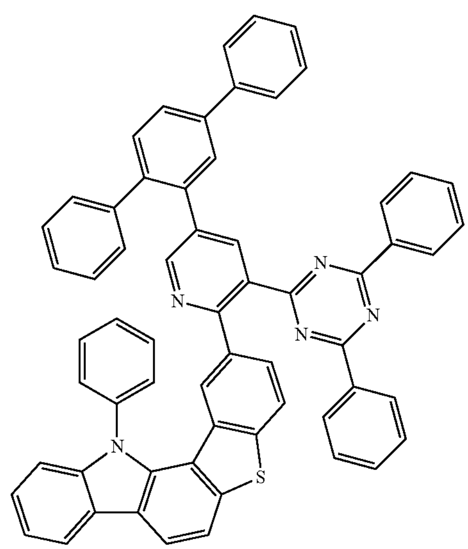

685
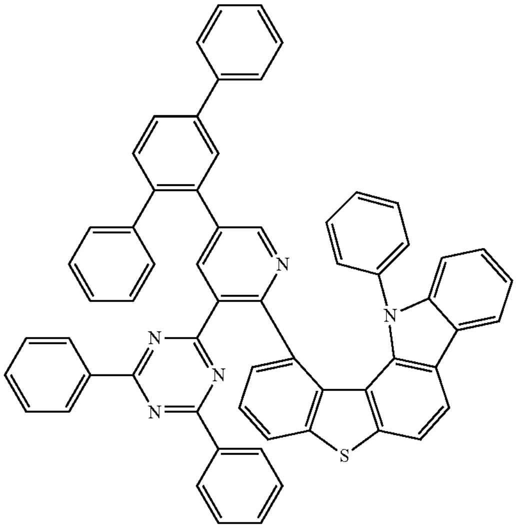
686
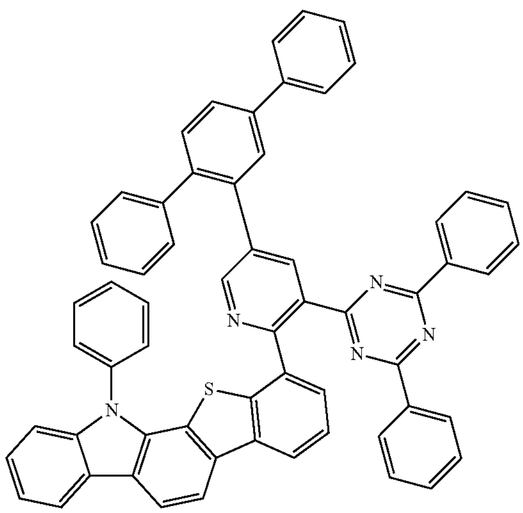
687
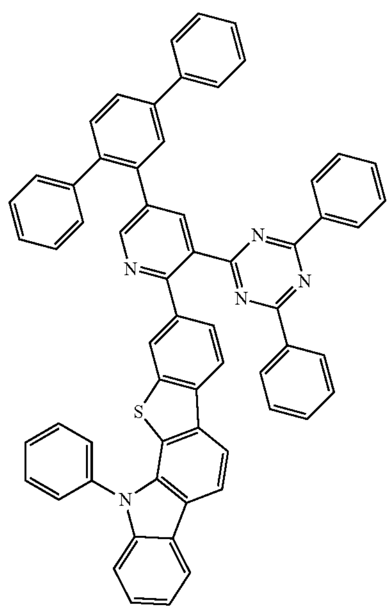
688
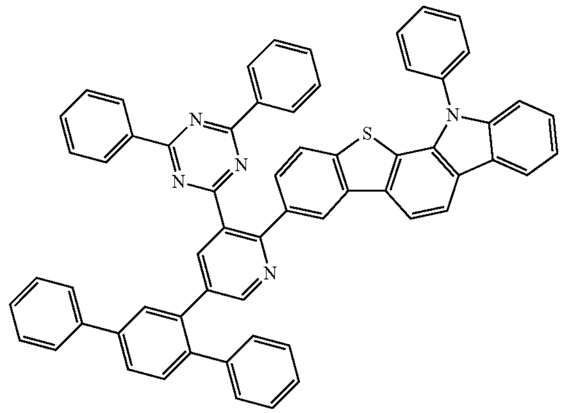
689
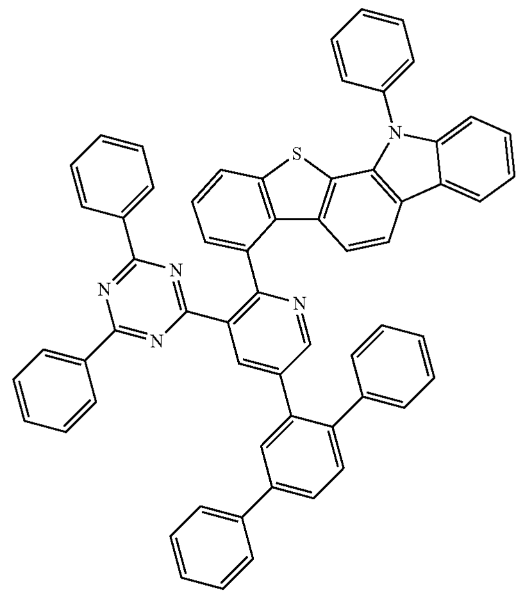
690
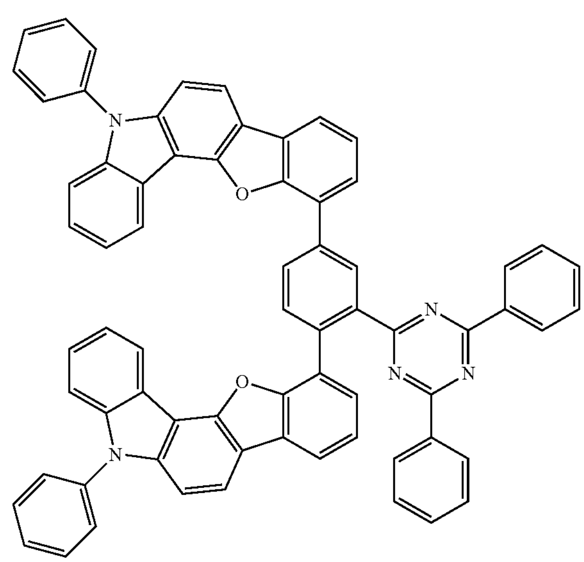

-continued
691
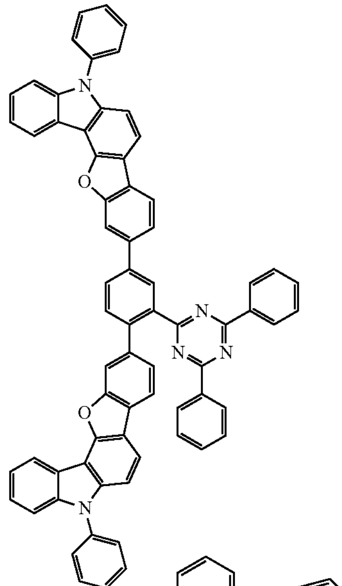
692
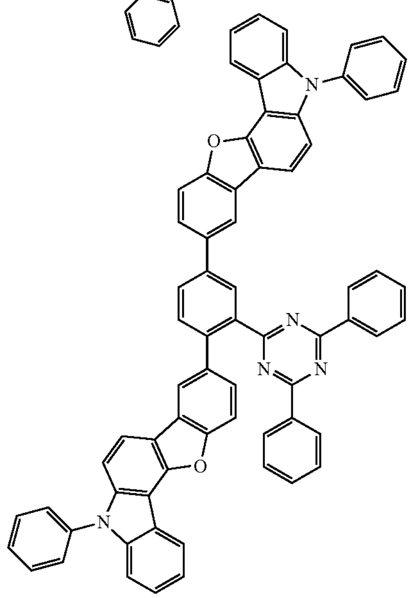
693
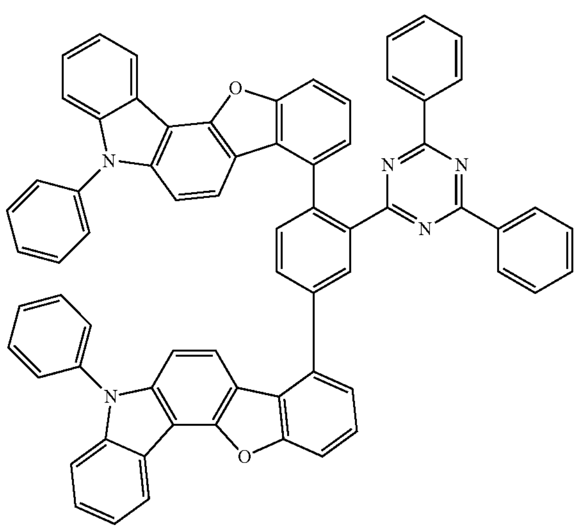
-continued
694
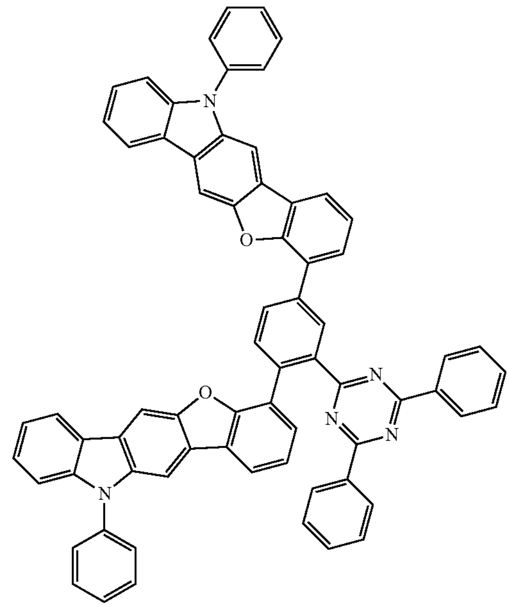
695
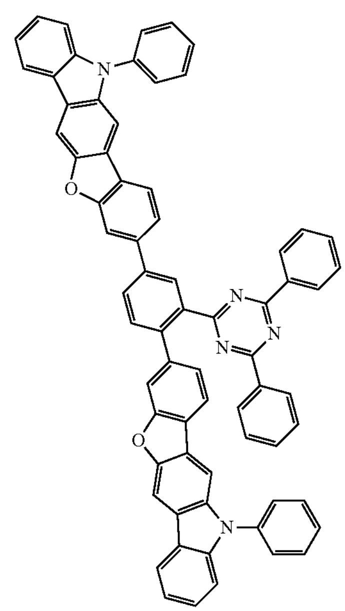

-continued
696
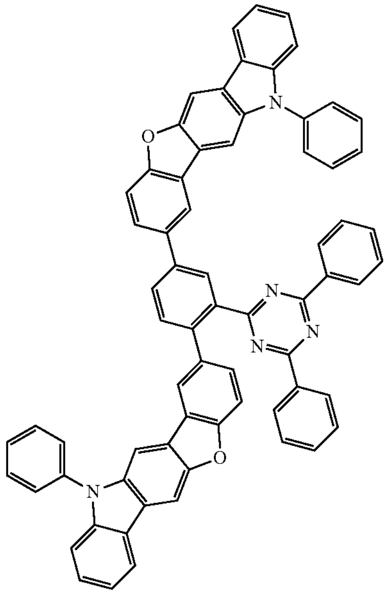
697
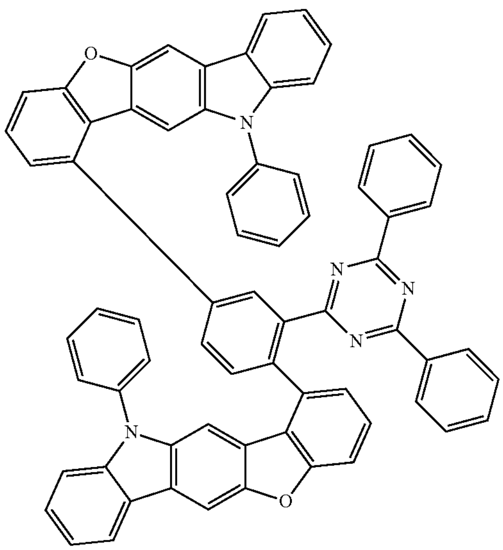
698
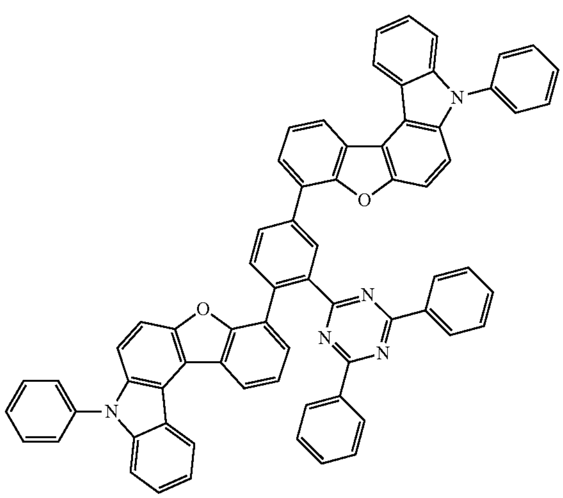
-continued
699
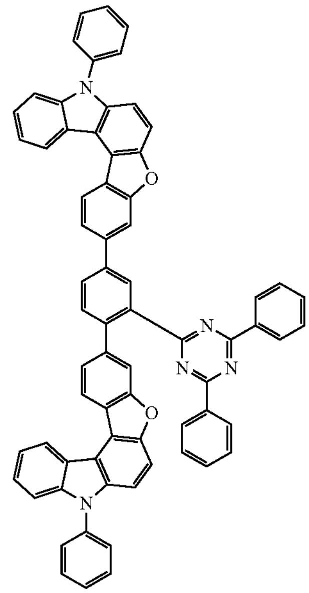
700
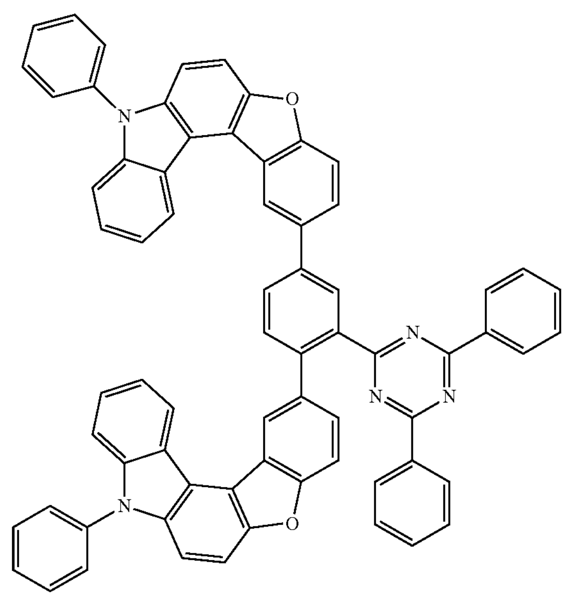

-continued
701
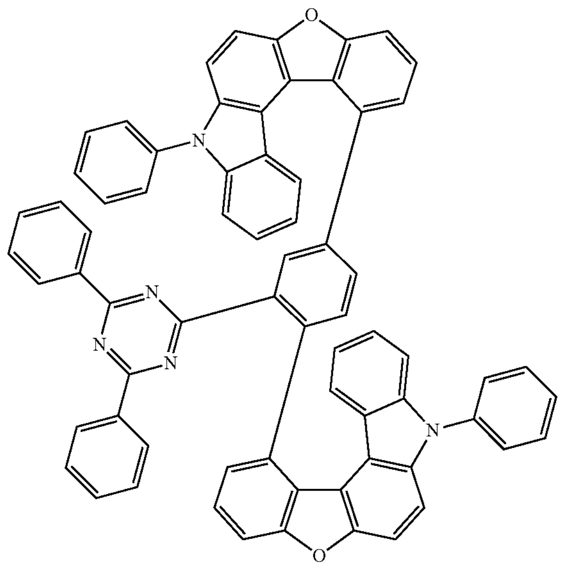
702
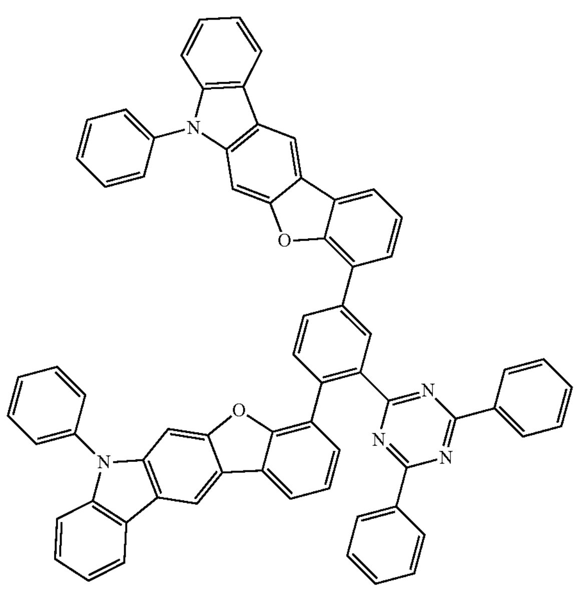
-continued
703
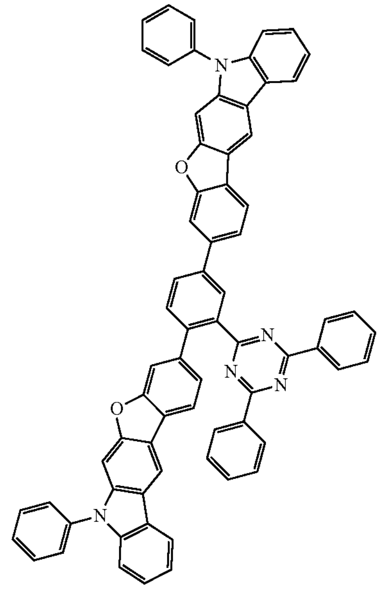
704
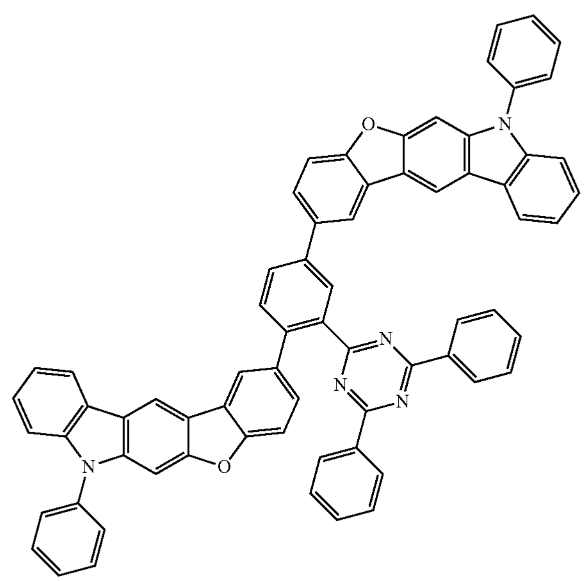

-continued
705
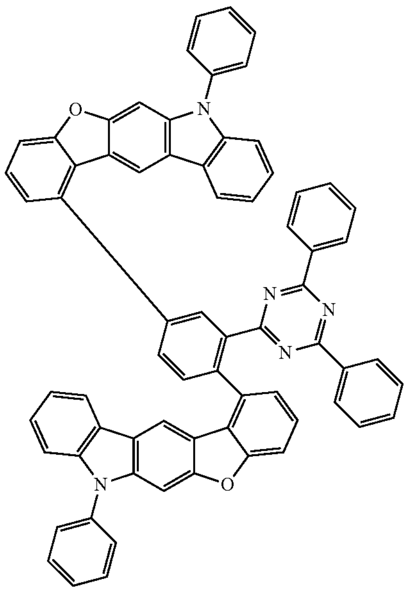
706
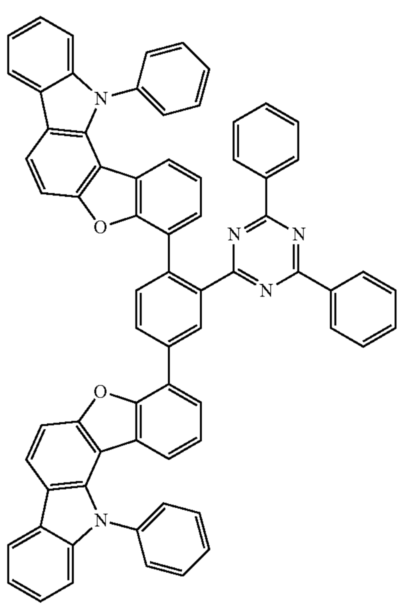
-continued
707
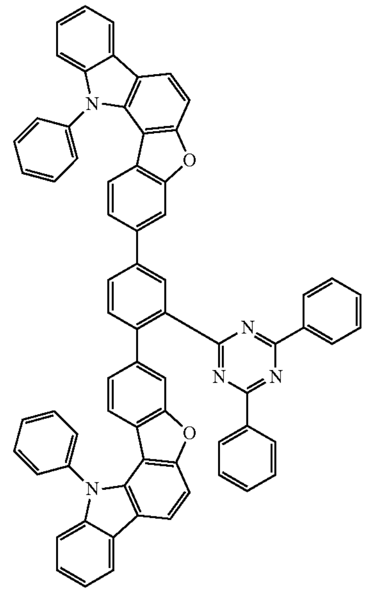
708
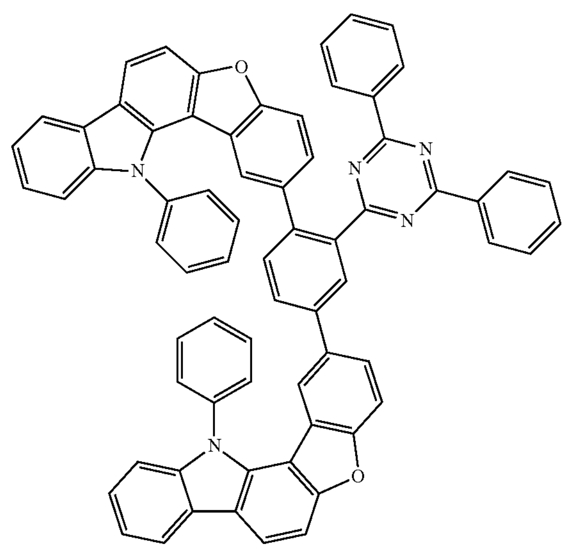
709
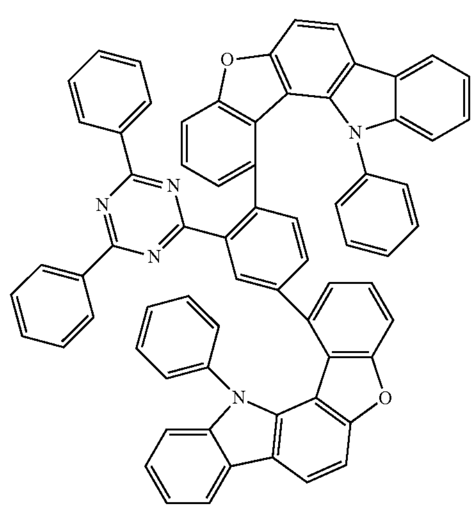

-continued
710
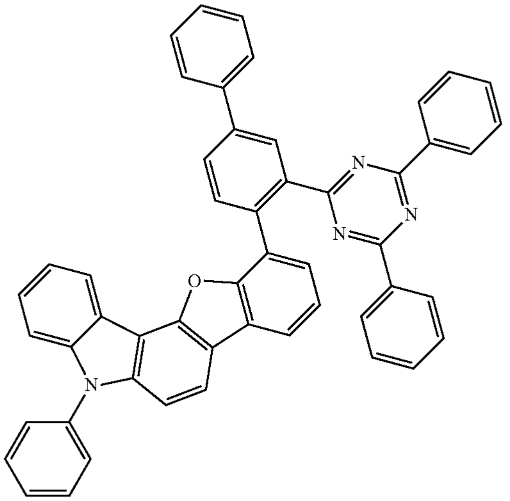
711
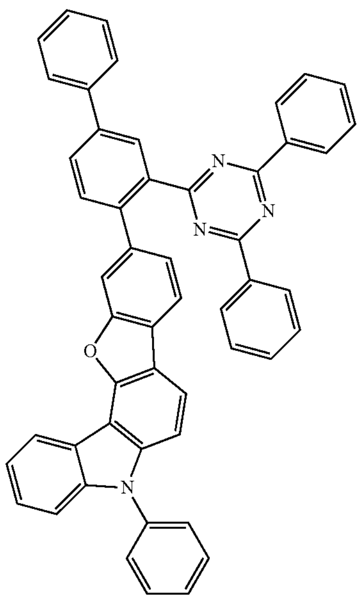
712
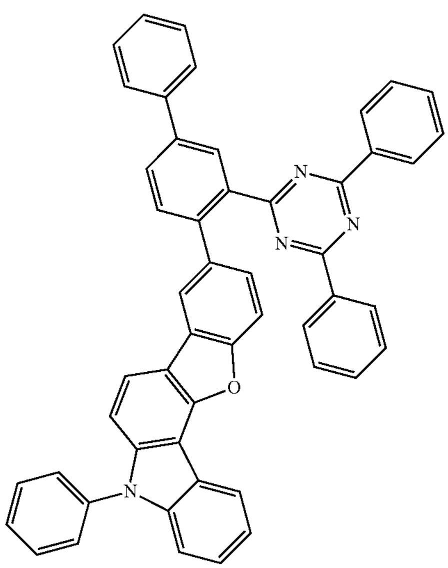
-continued
713
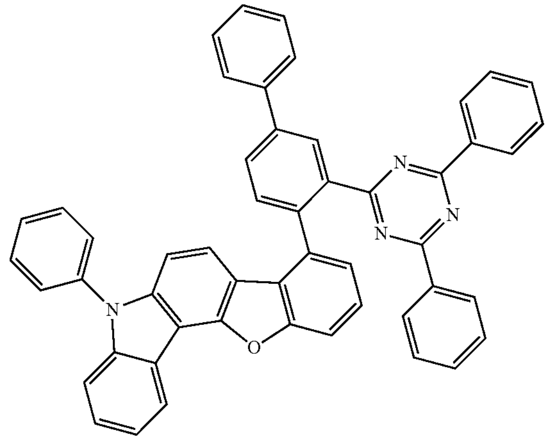
714
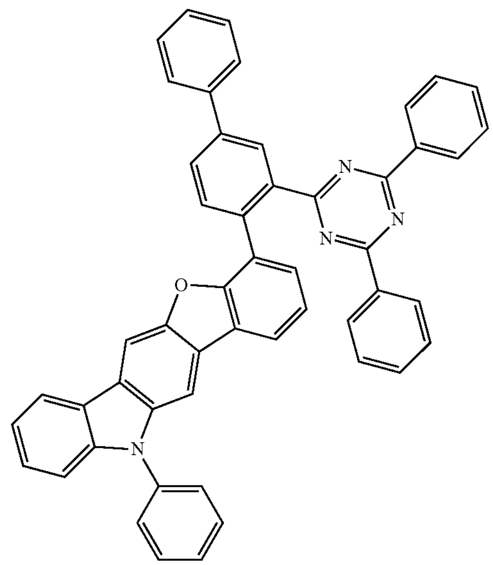
715
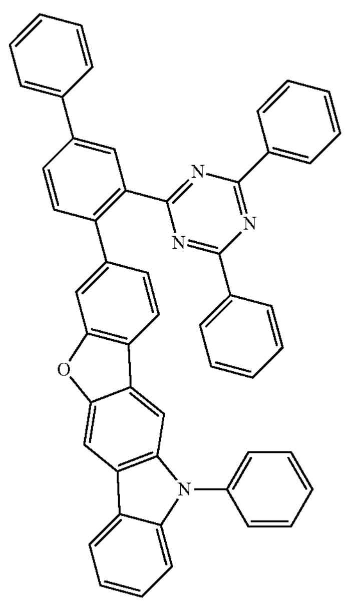

716
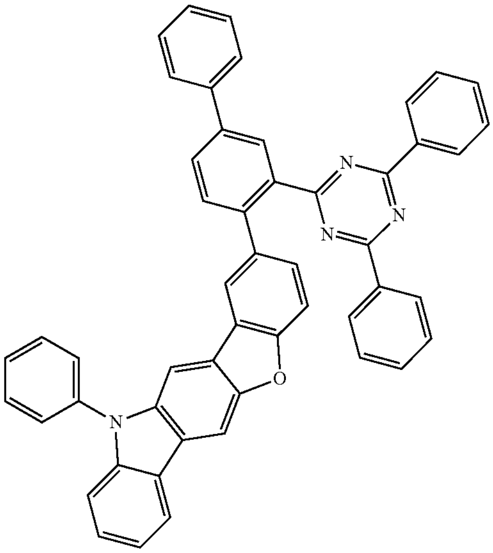
717
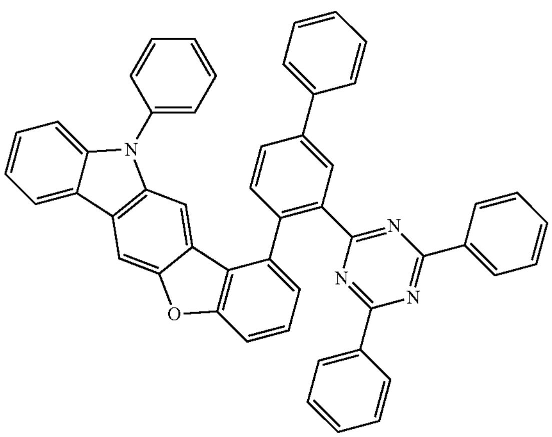
718
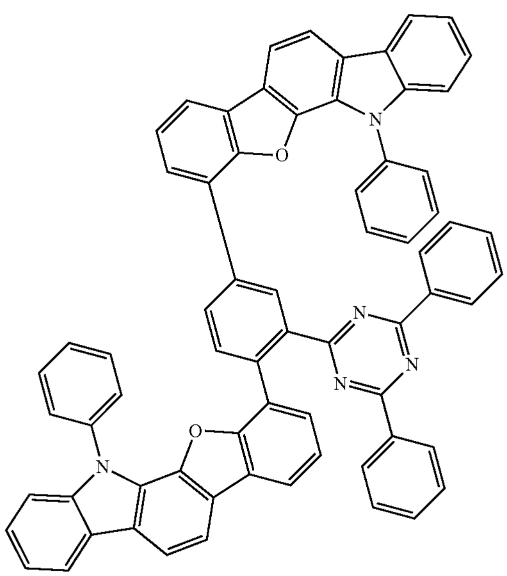
719
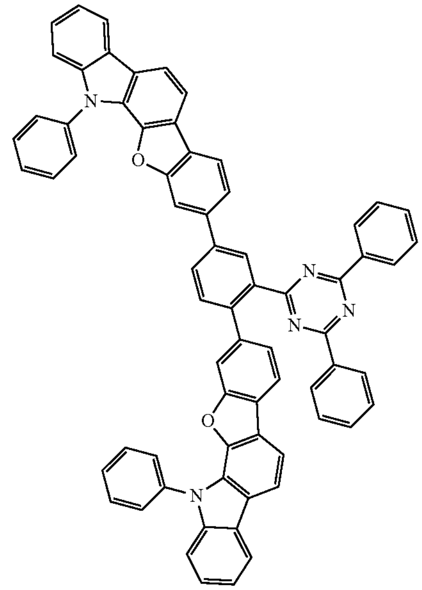
720
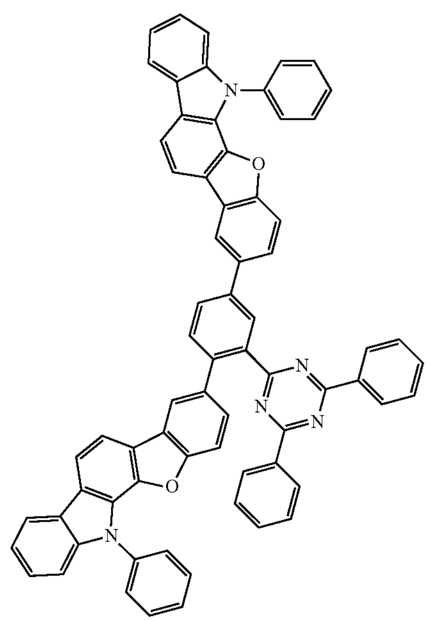

721
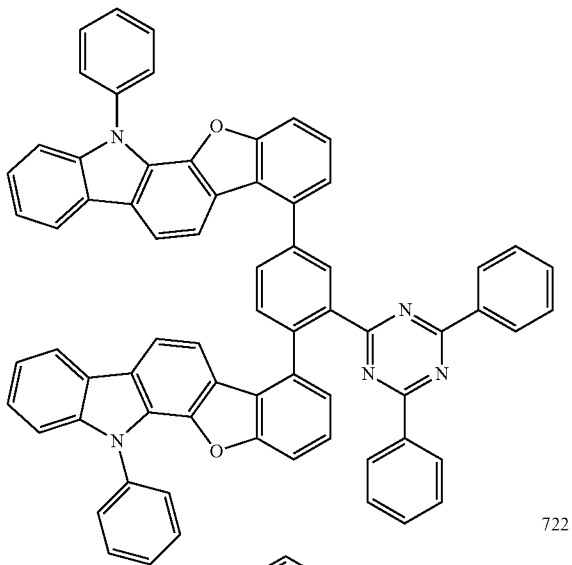
722
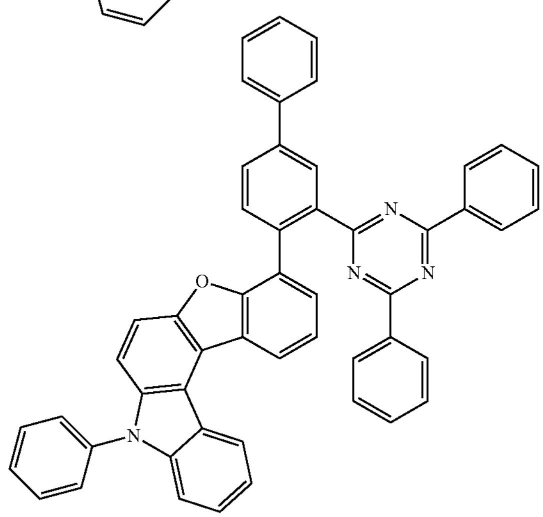
723
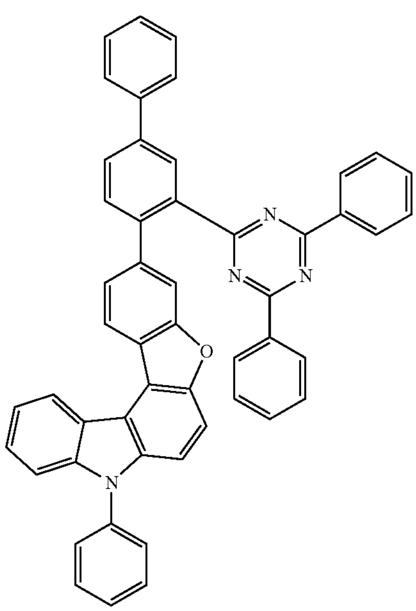
724
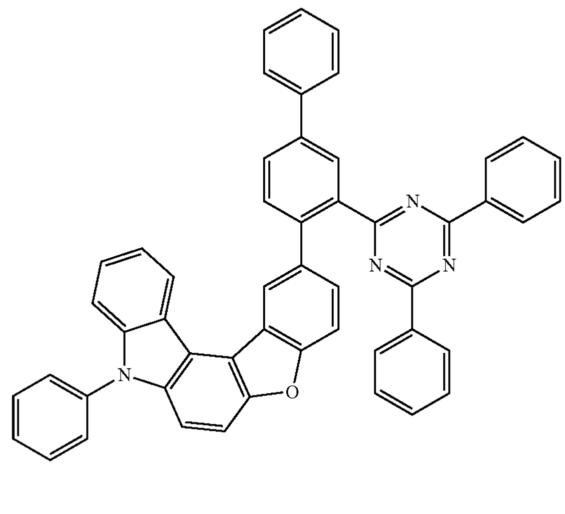
725
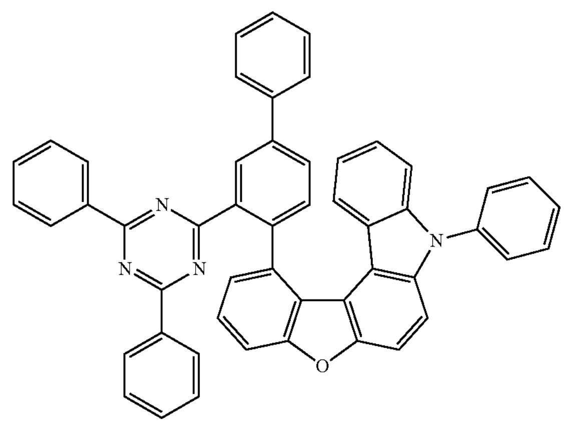
726
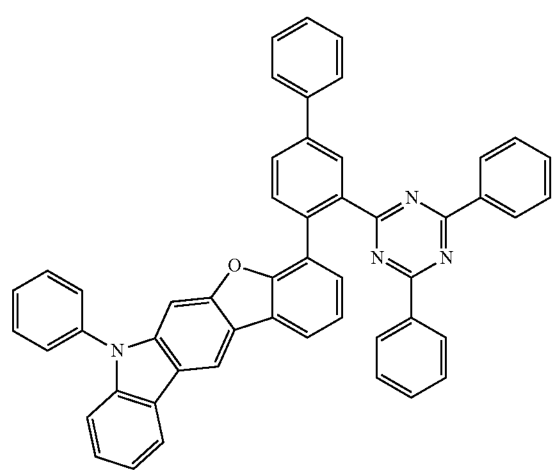

-continued
727
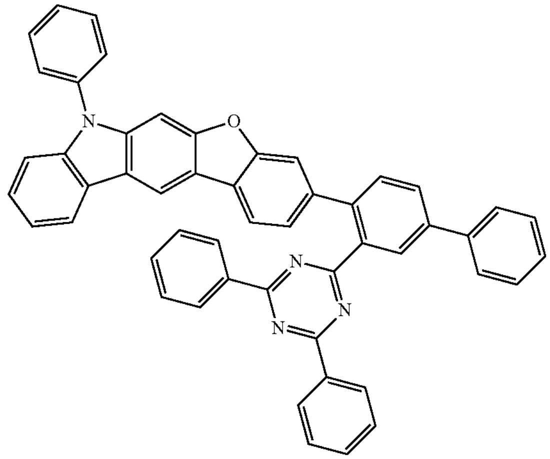
728
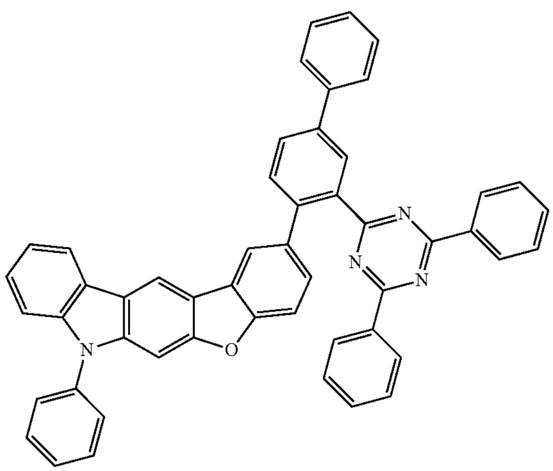
729
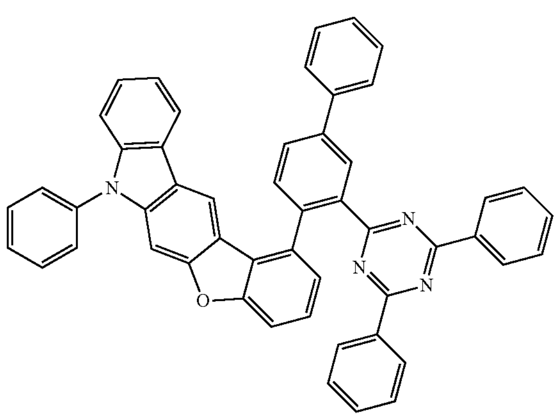
-continued
730
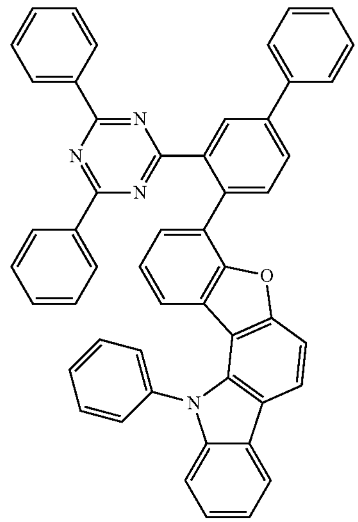
731
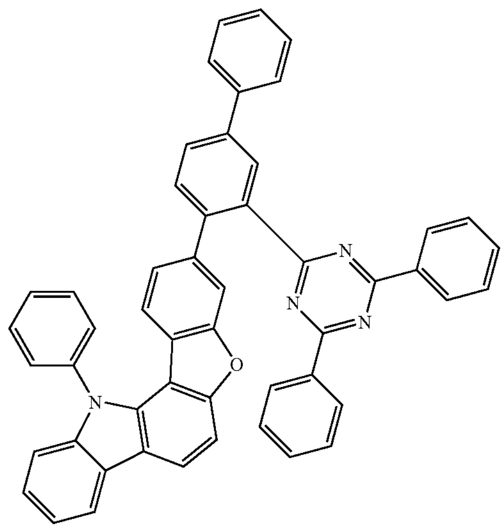
732
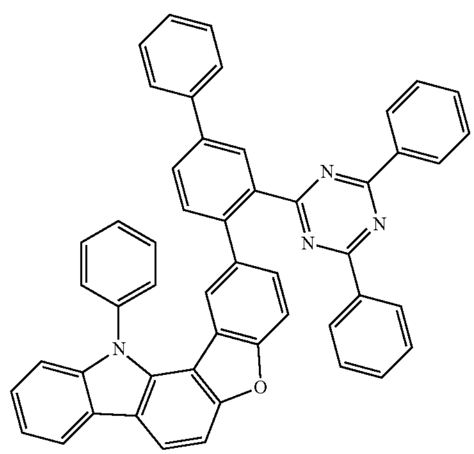

-continued
733
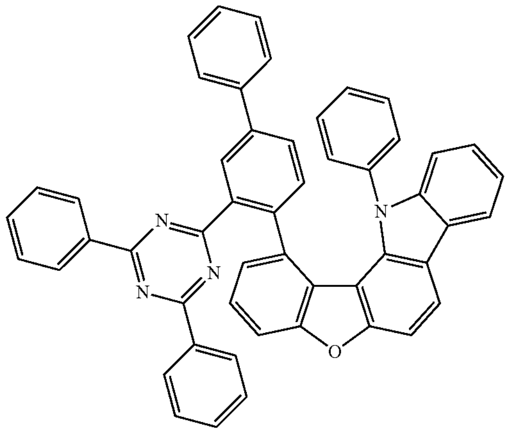
734
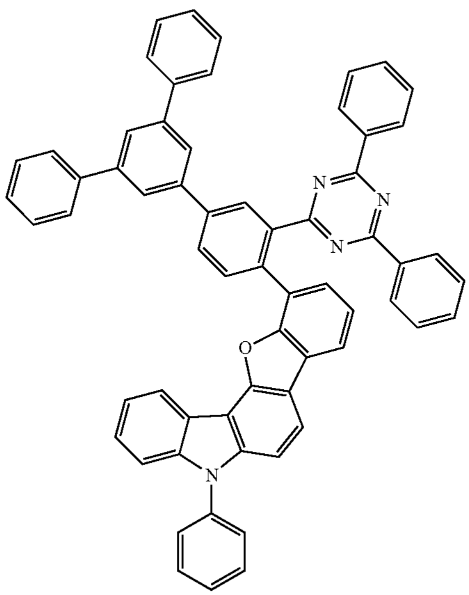
735
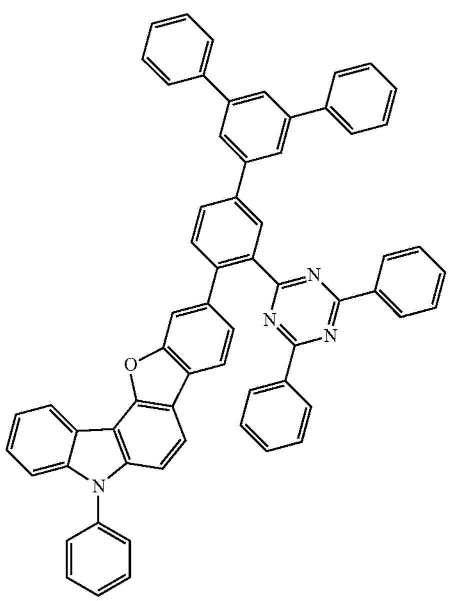
-continued
736
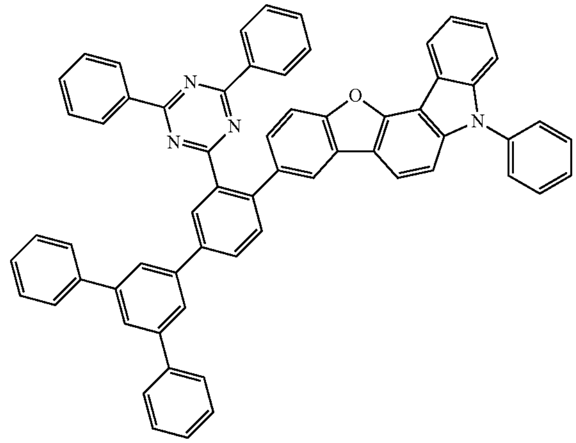
737
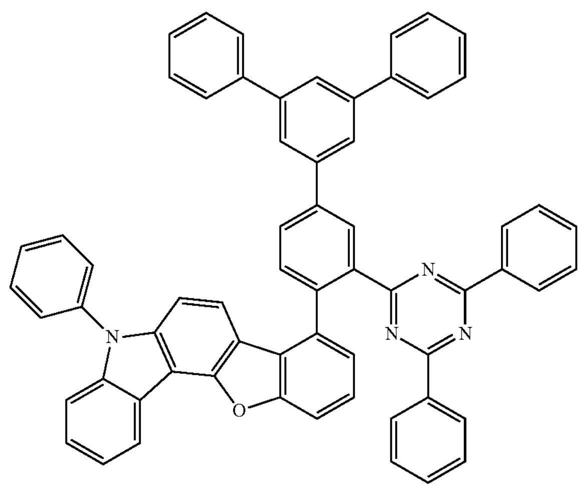
738
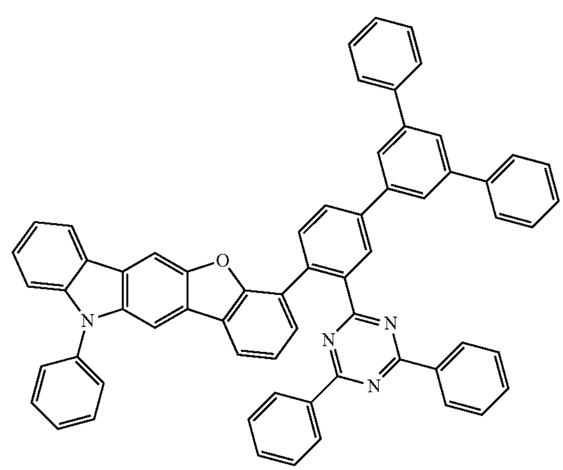

-continued
739
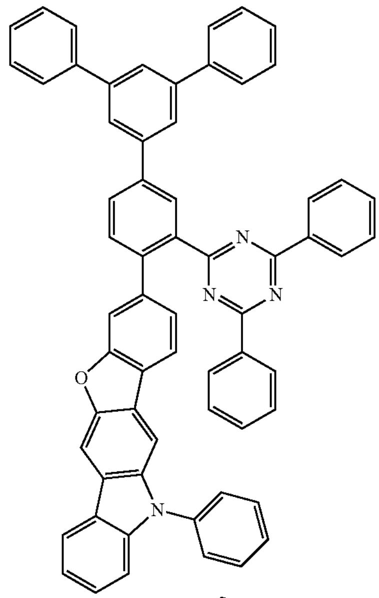
740
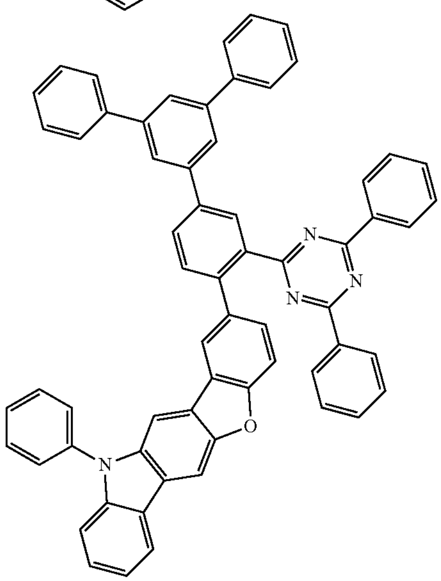
741
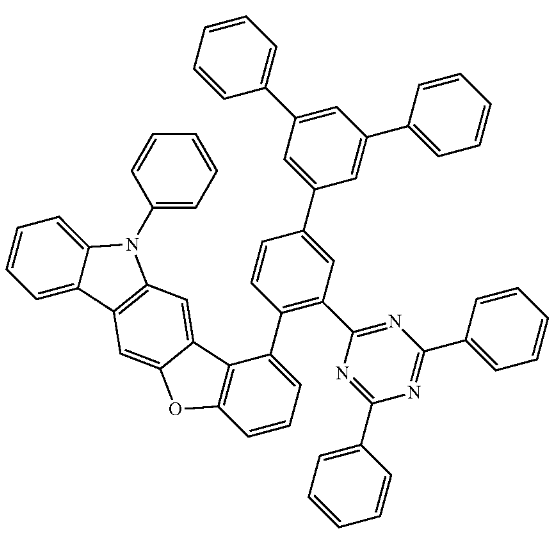
742
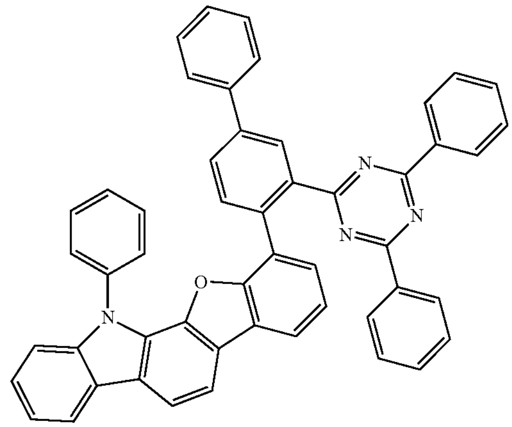
743
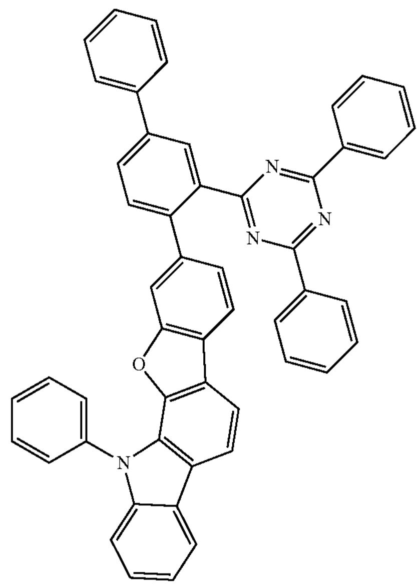
744
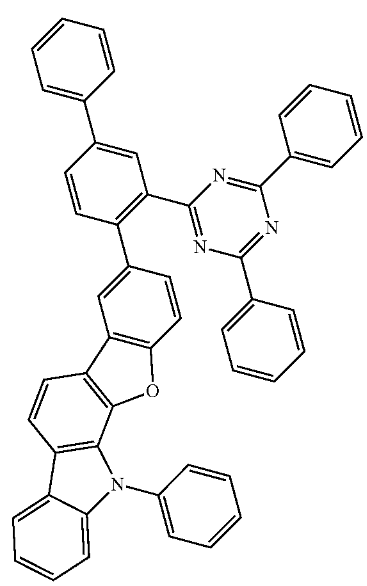

-continued
745
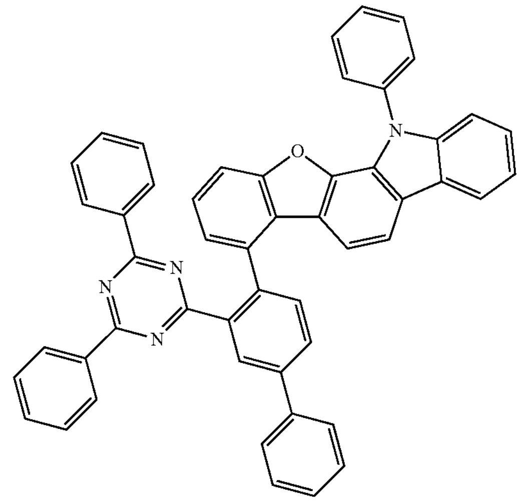
746
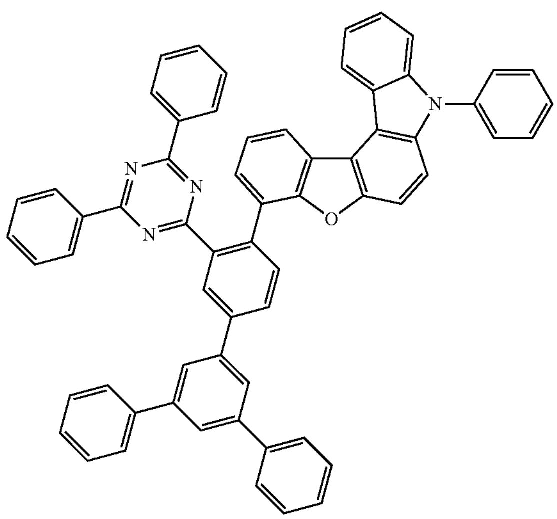
747
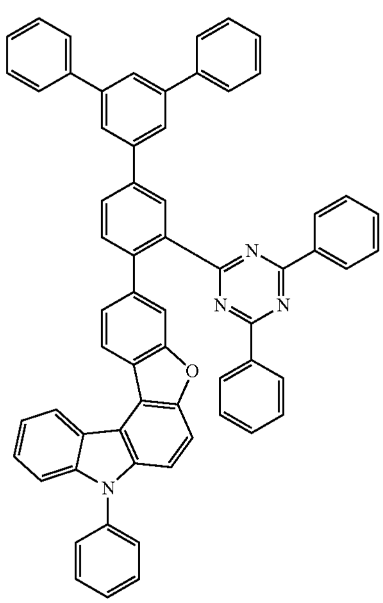
-continued
748
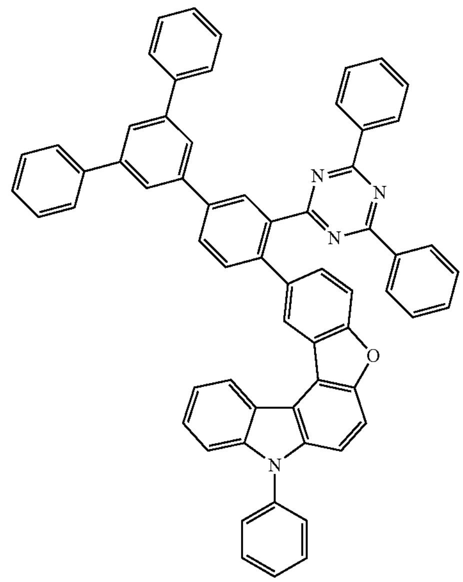
749
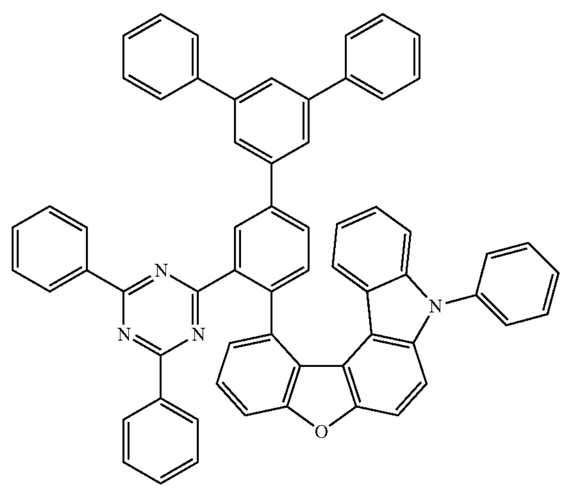
750
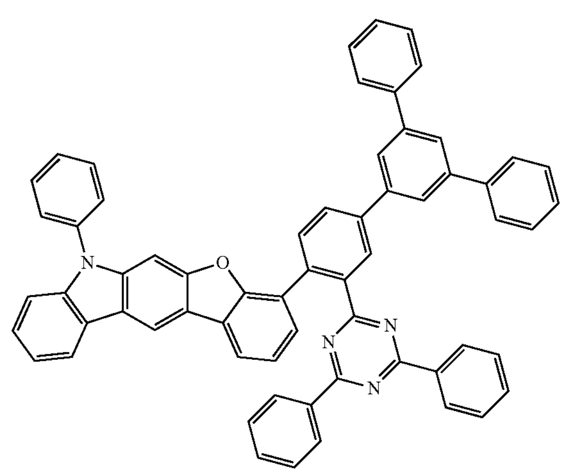

751
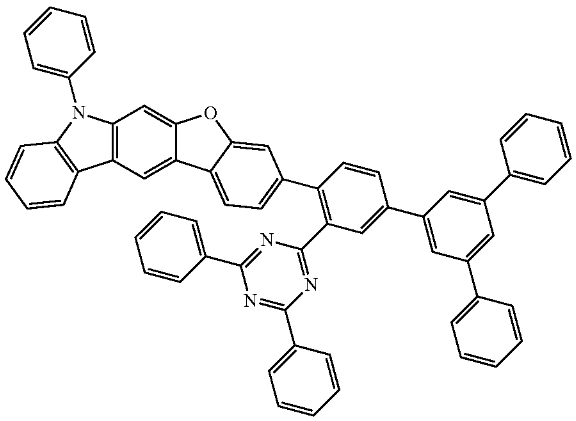
752
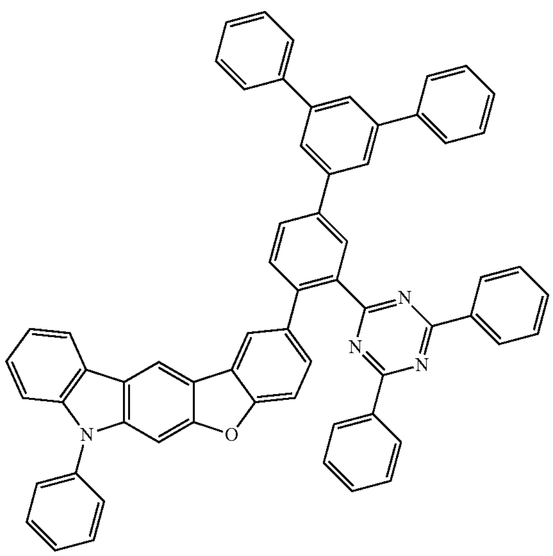
753
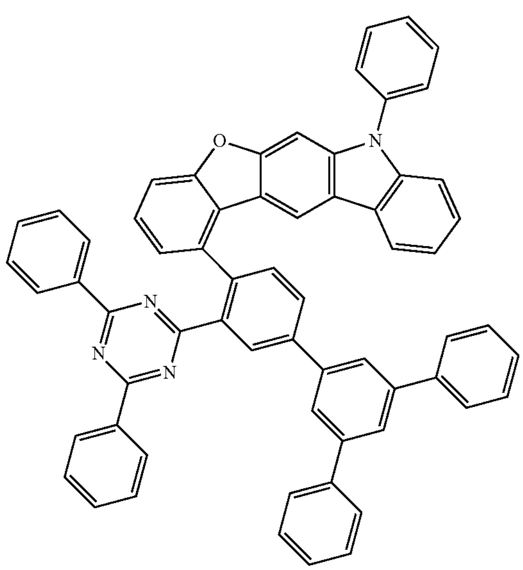
754
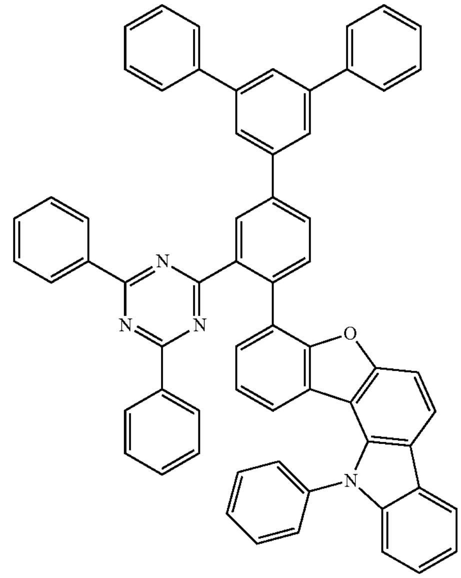
755
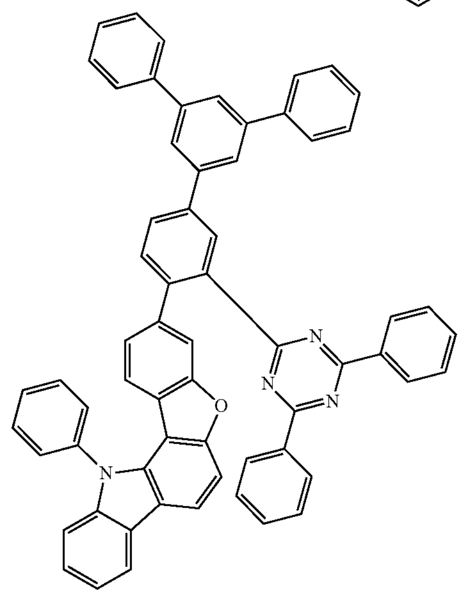
756
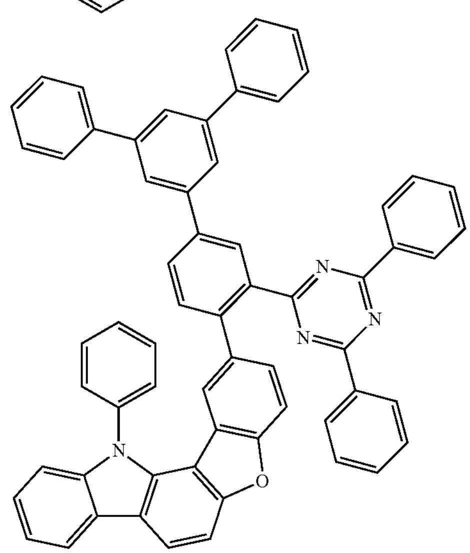

-continued
757
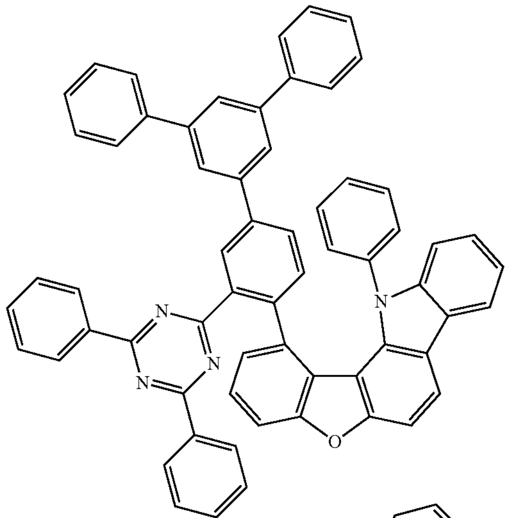
758
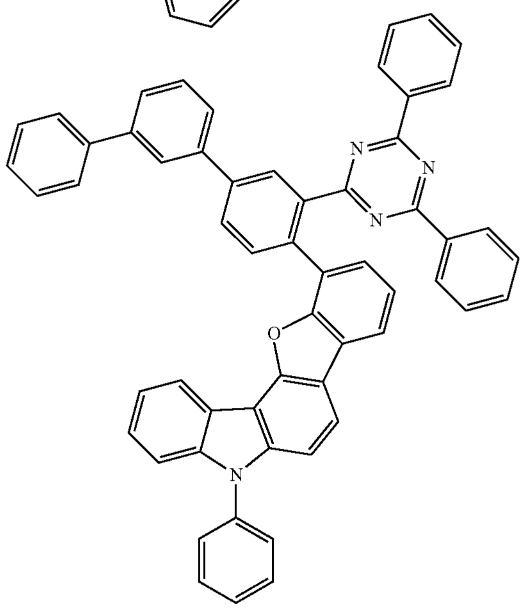
759
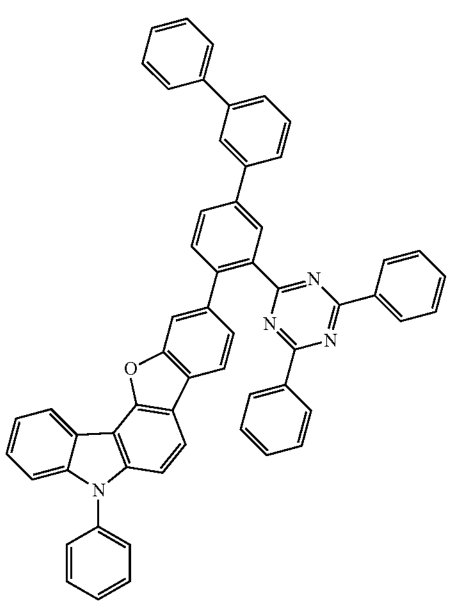
-continued
760
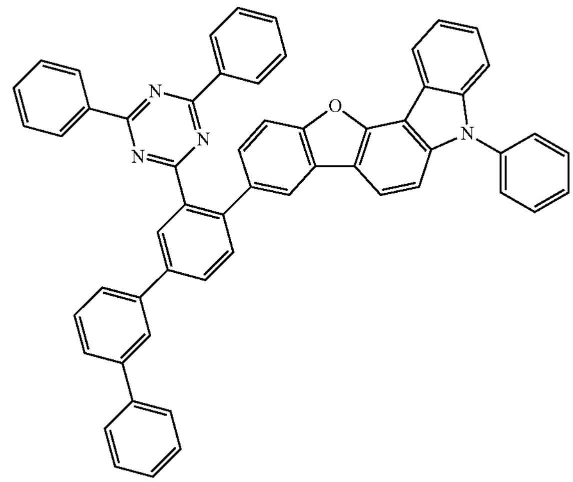
761
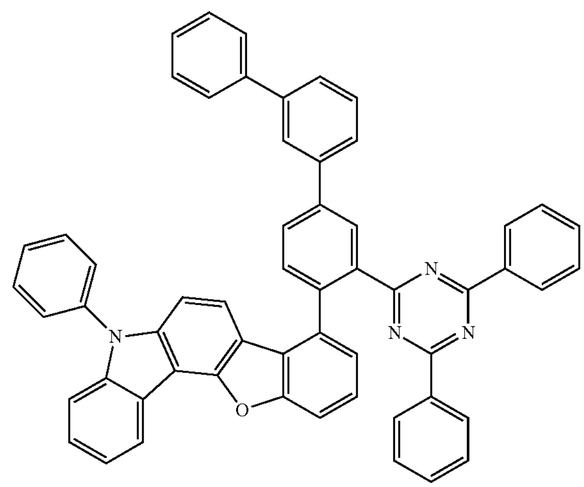
762
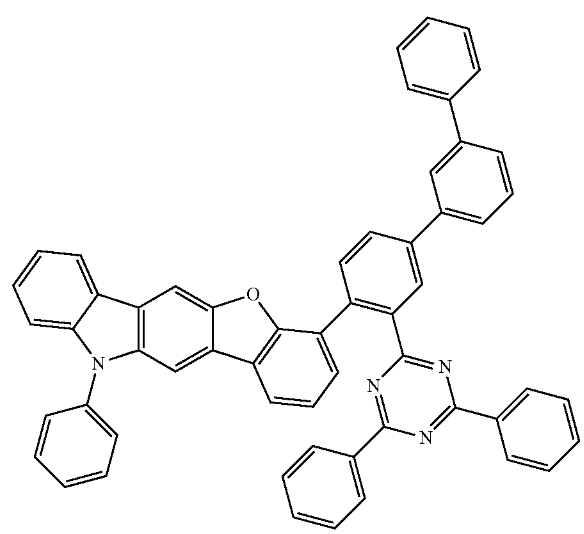

-continued
763
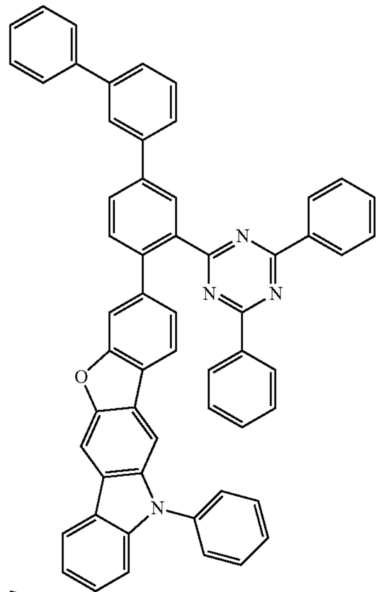
764
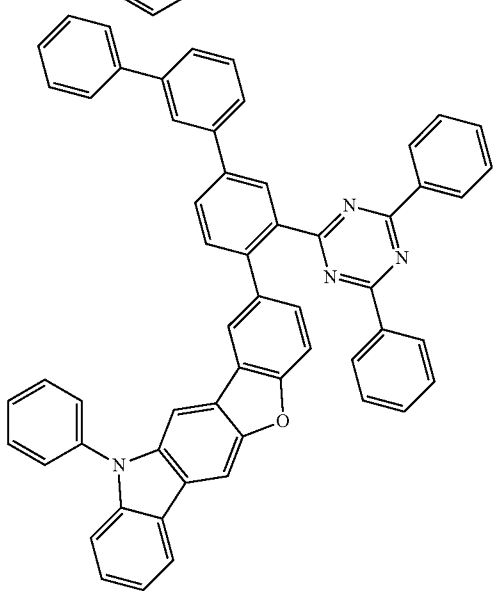
765
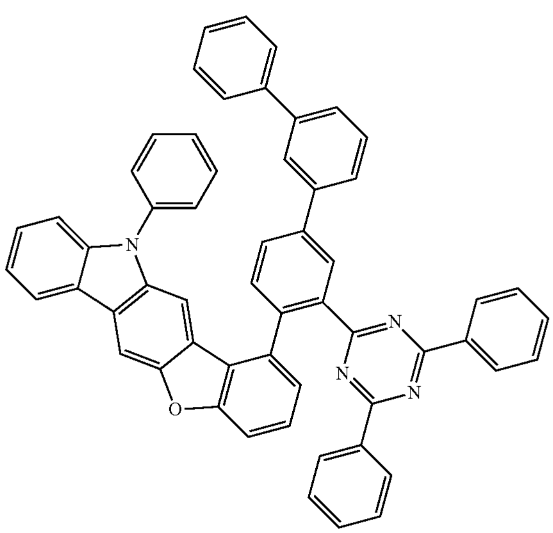
-continued
766
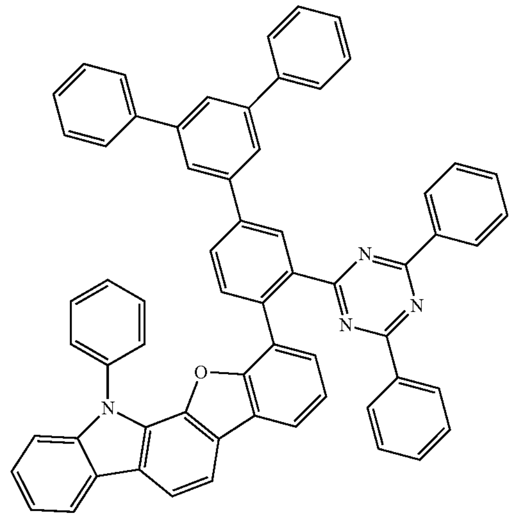
767
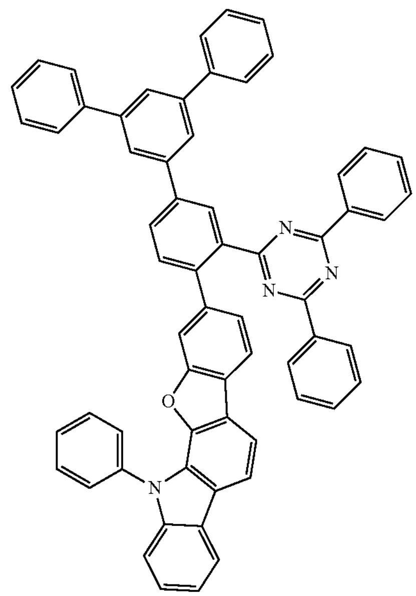
768
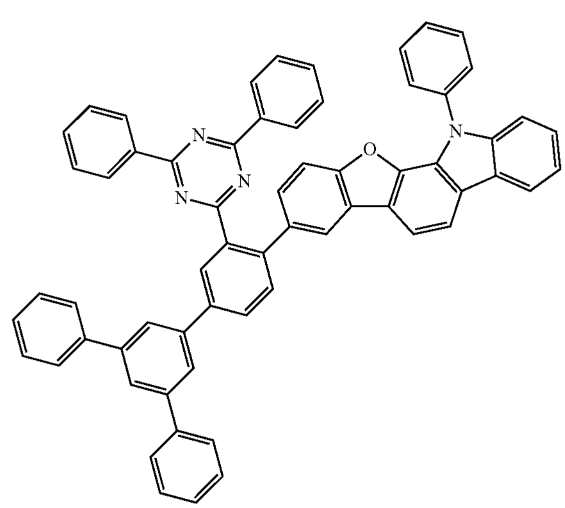

-continued
769
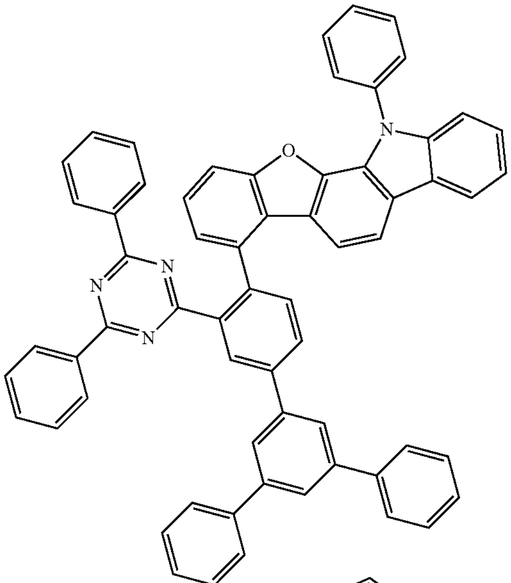
770
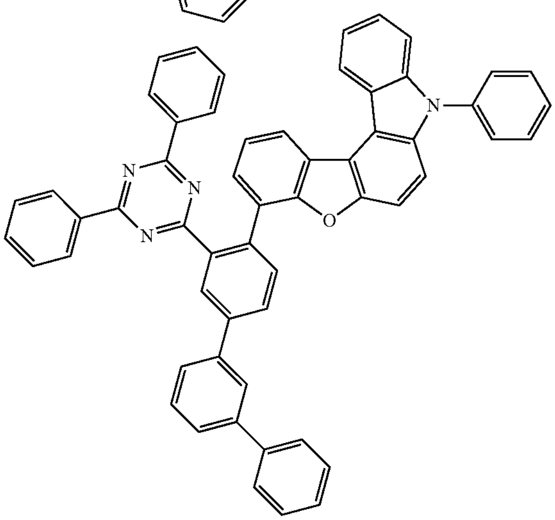
771
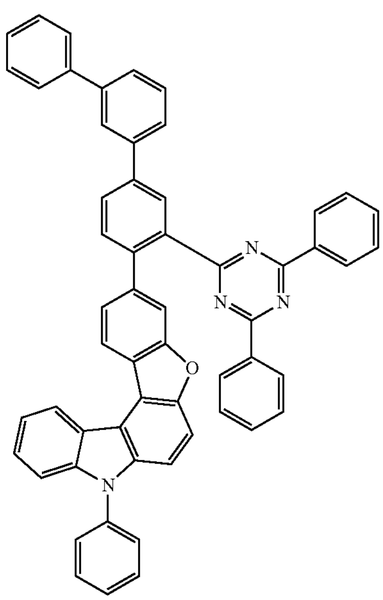
-continued
772
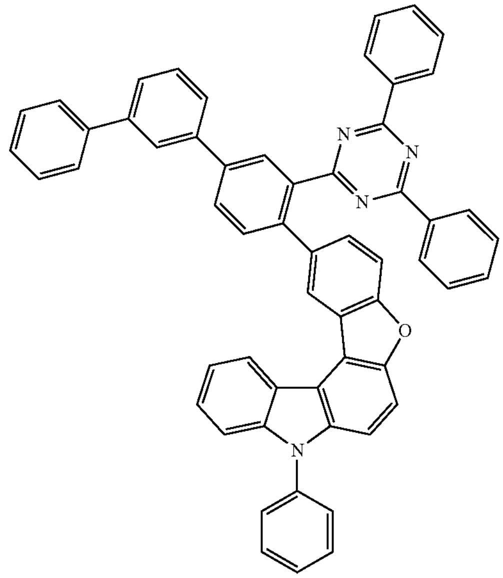
773
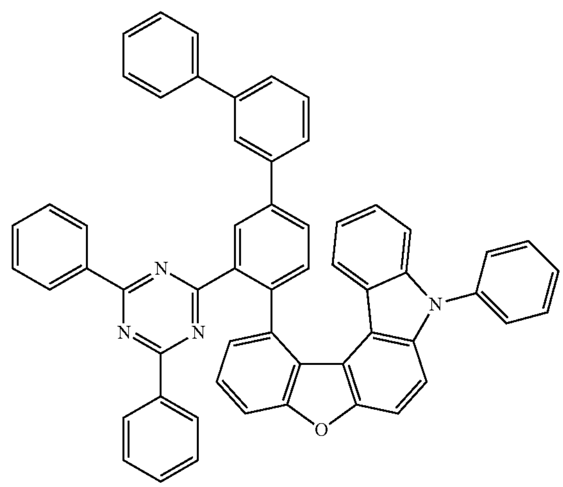
774
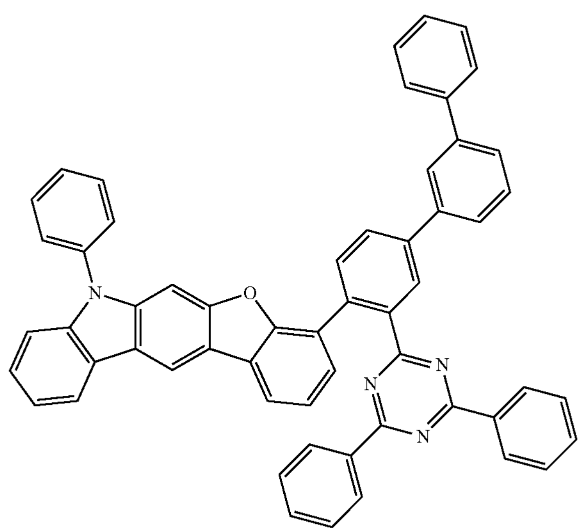

-continued
775
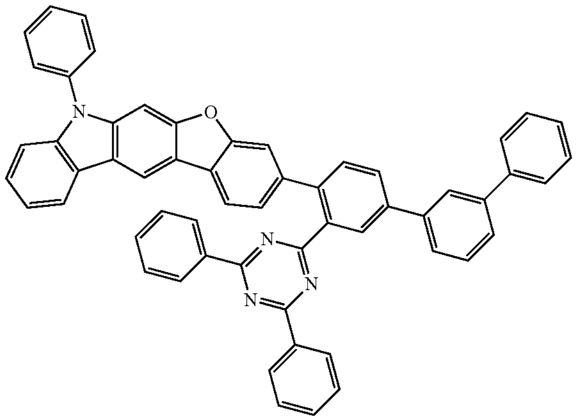
776
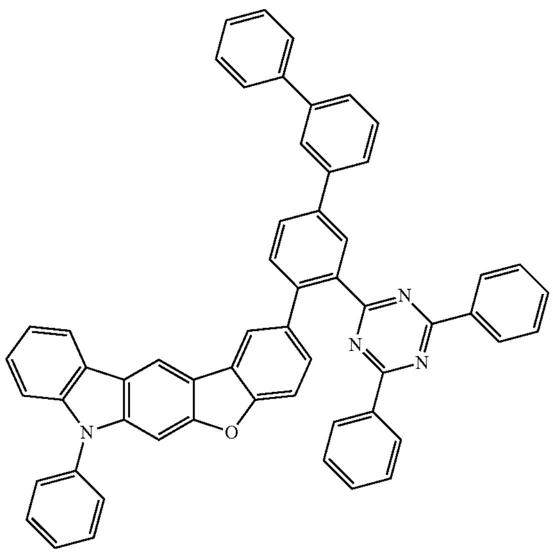
777
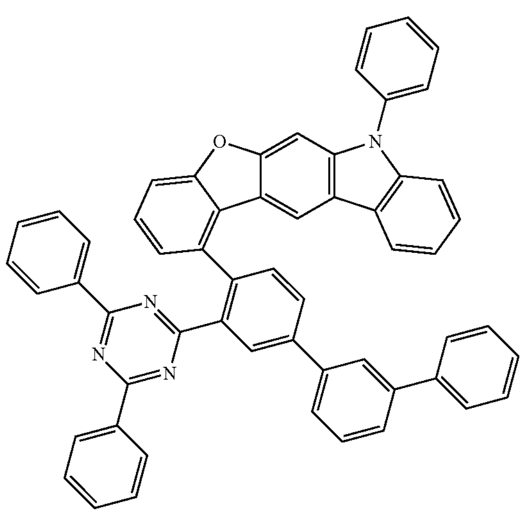
-continued
778
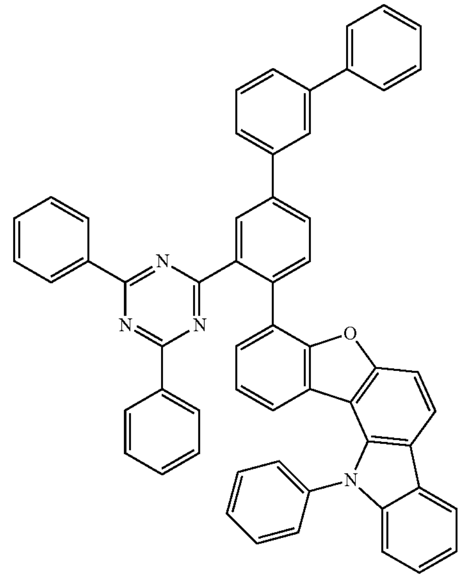
779
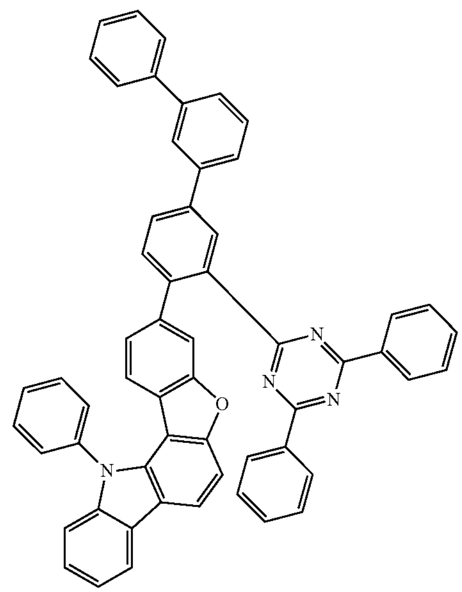
780
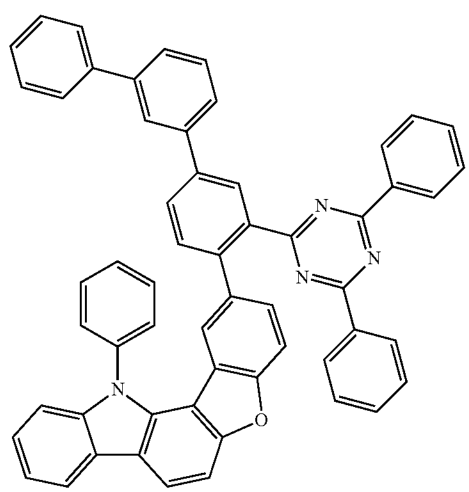

-continued
781
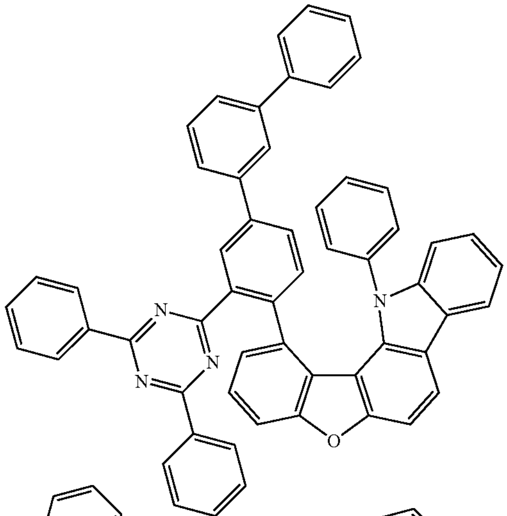
782
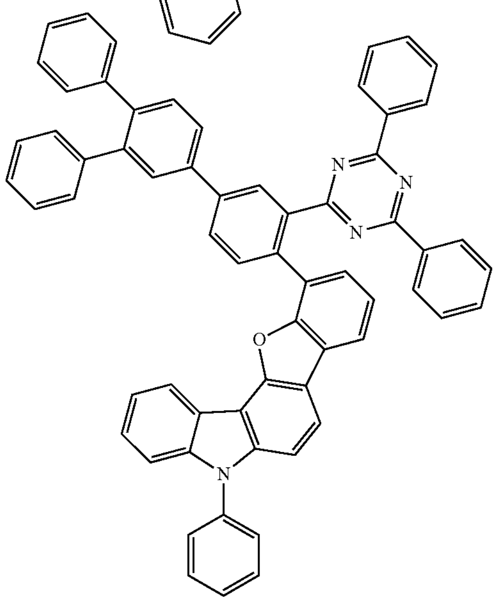
783
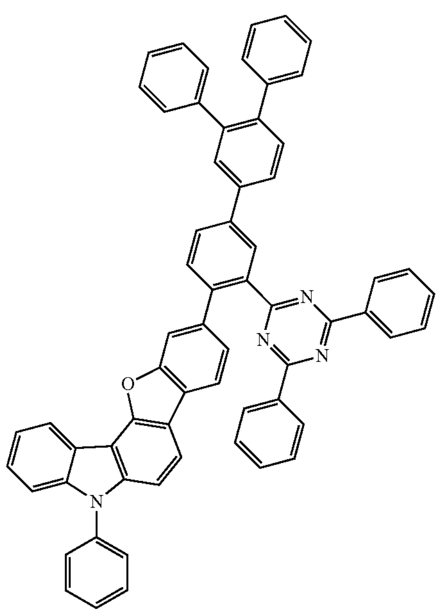
-continued
784
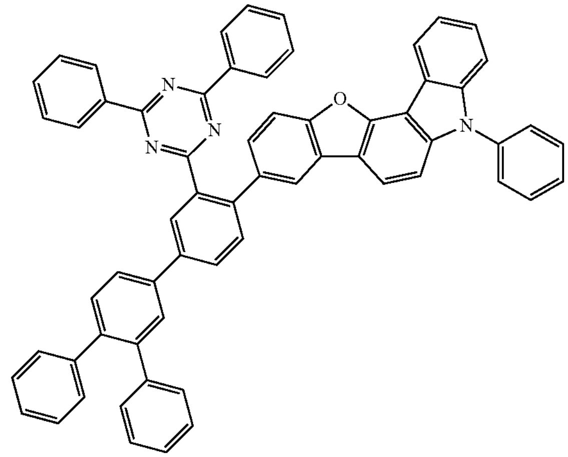
785
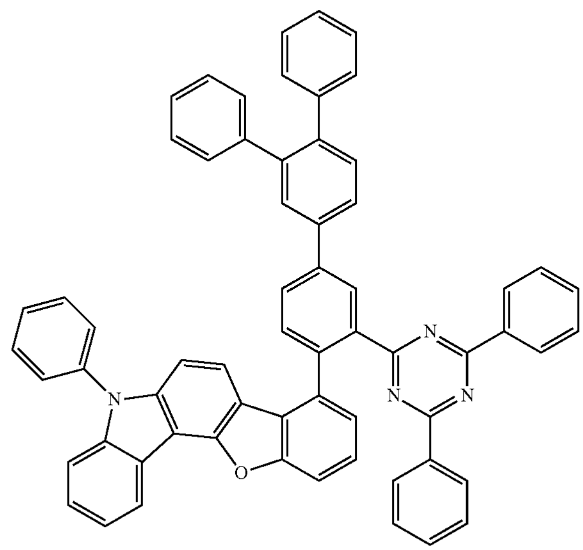
786
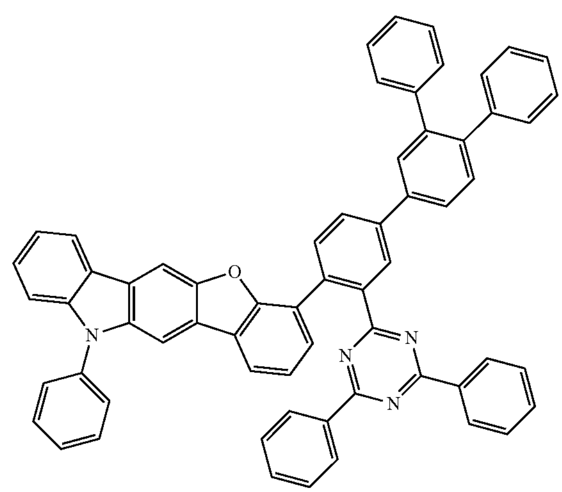

-continued
787
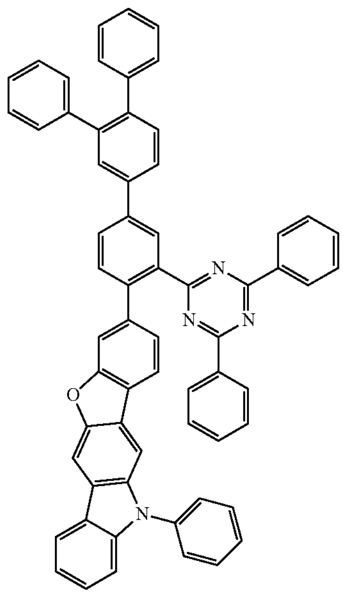
788
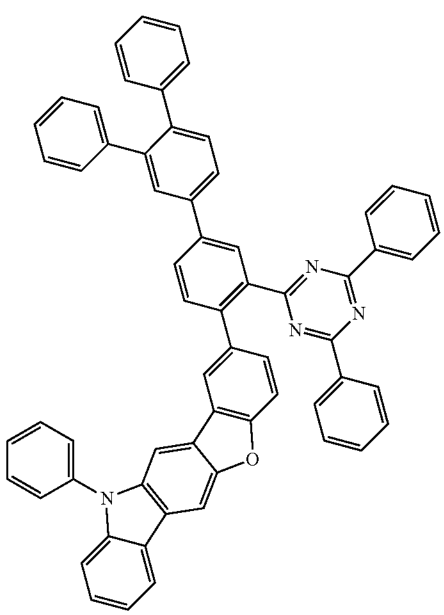
-continued
789
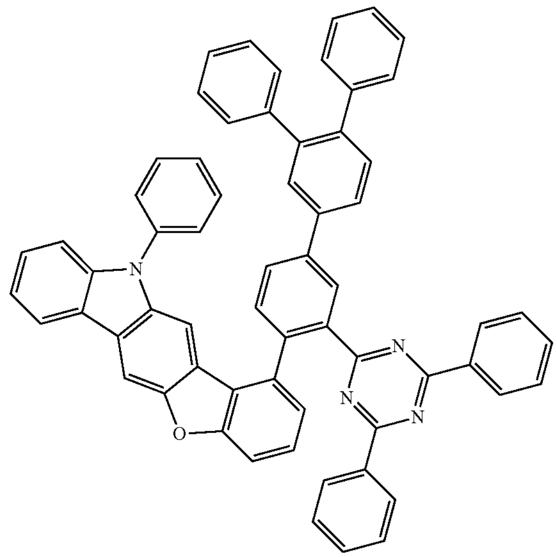
790
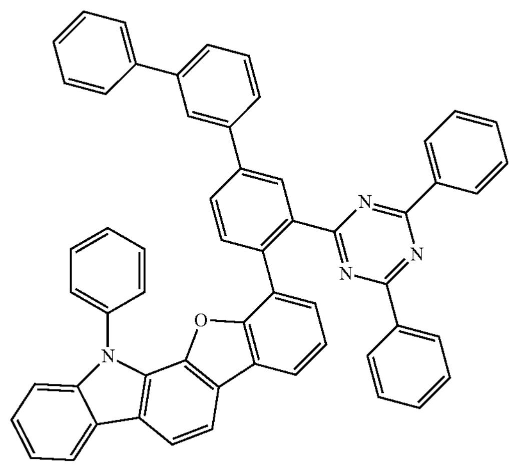
791
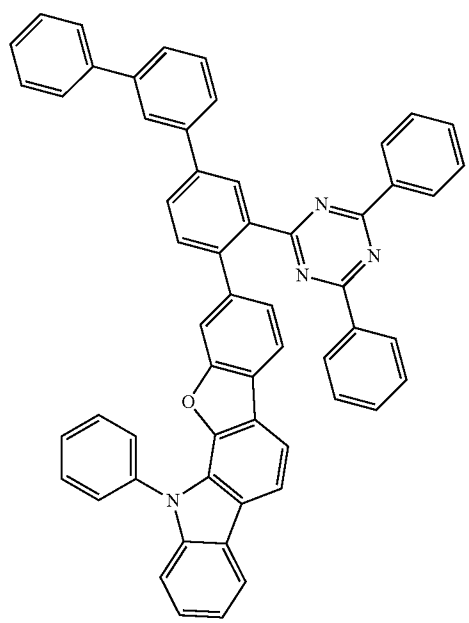

-continued
792
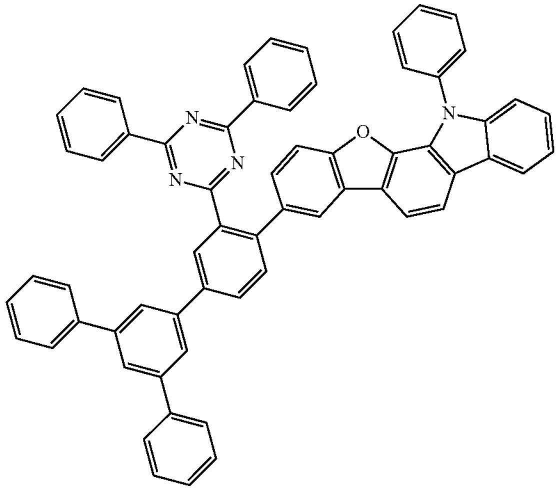
793
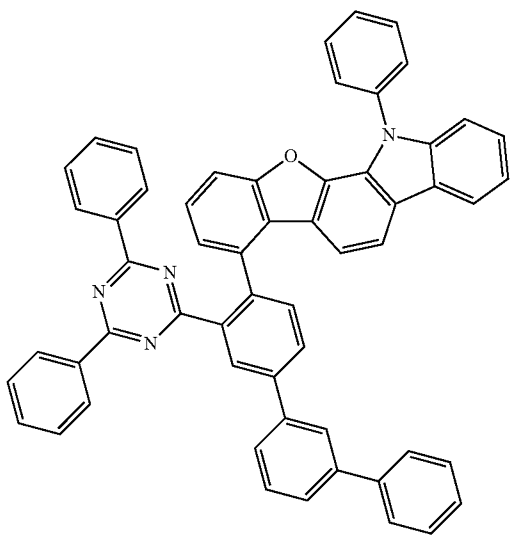
794
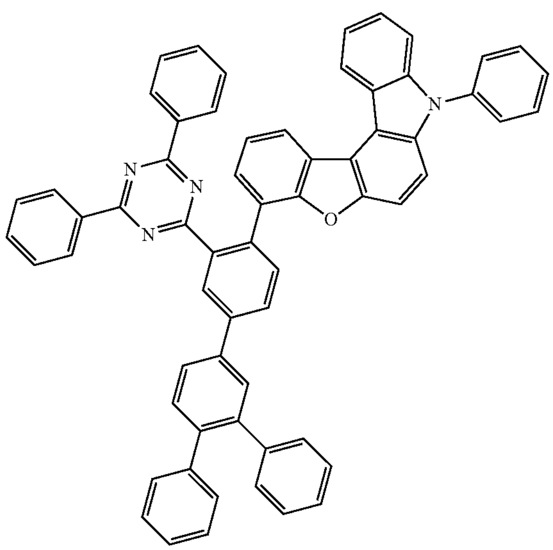
-continued
795
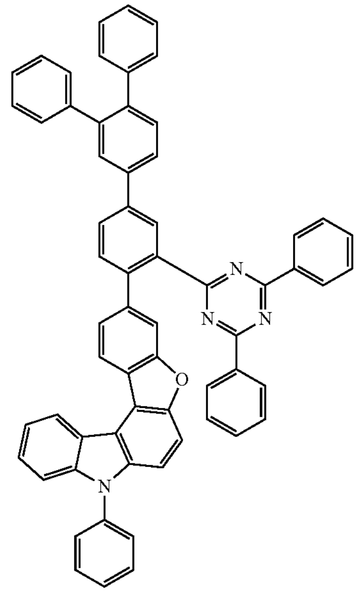
796
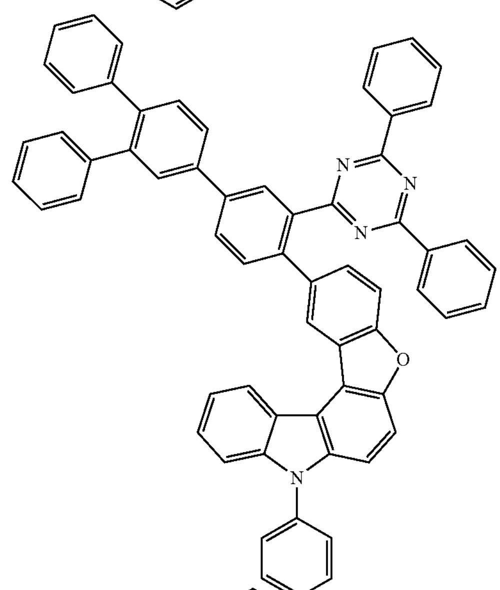
797
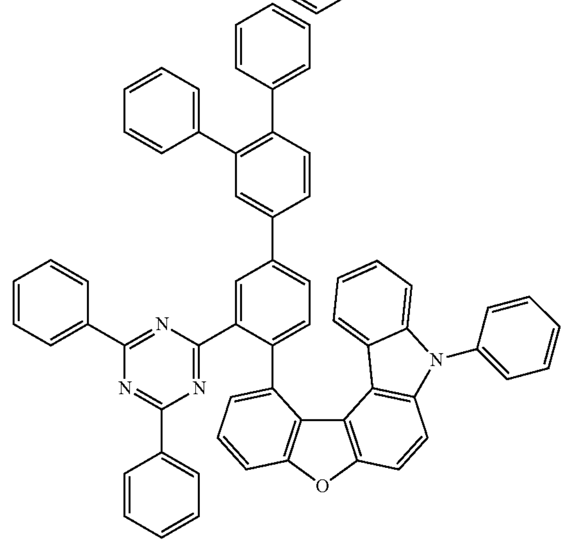

798
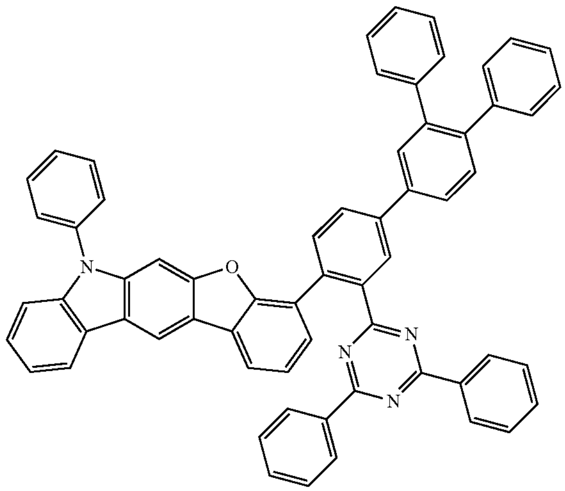
799
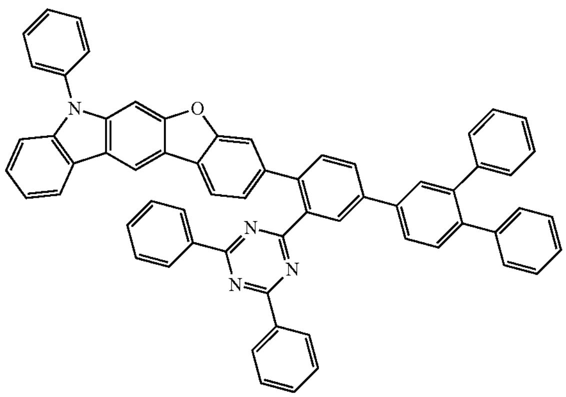
800
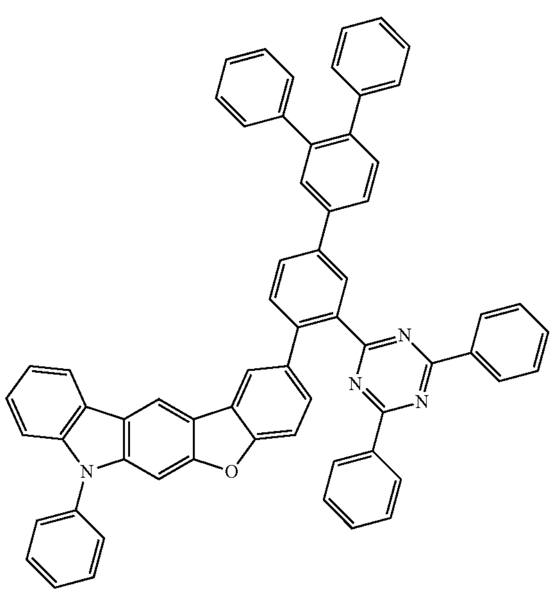
801
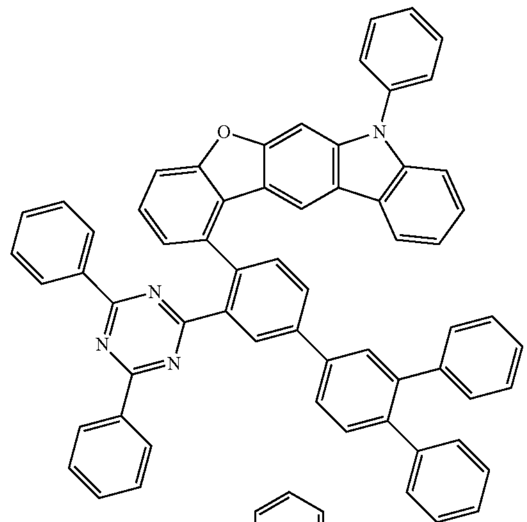
802
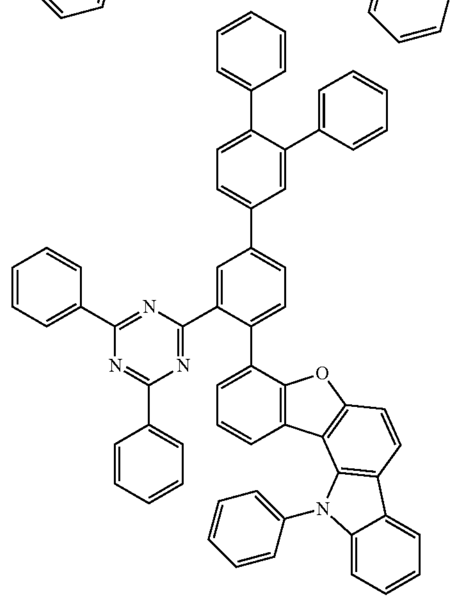
803
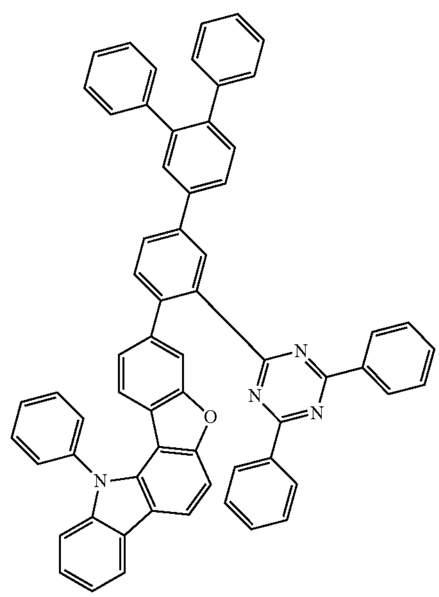

-continued
804
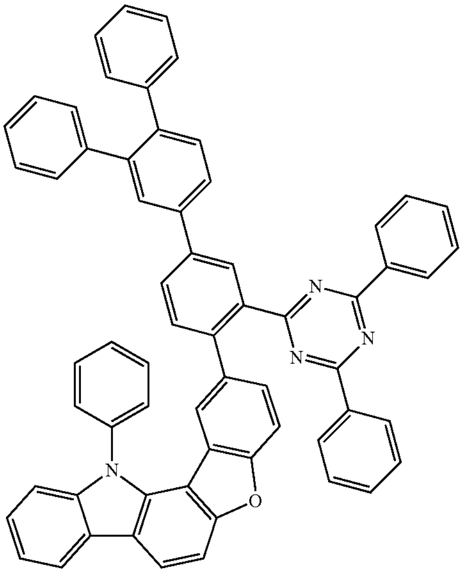
805
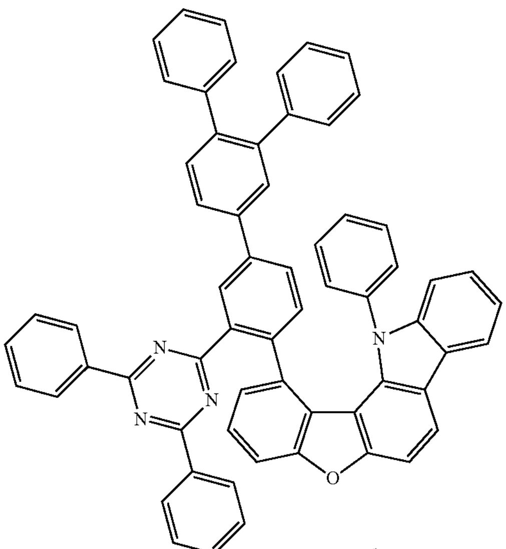
806
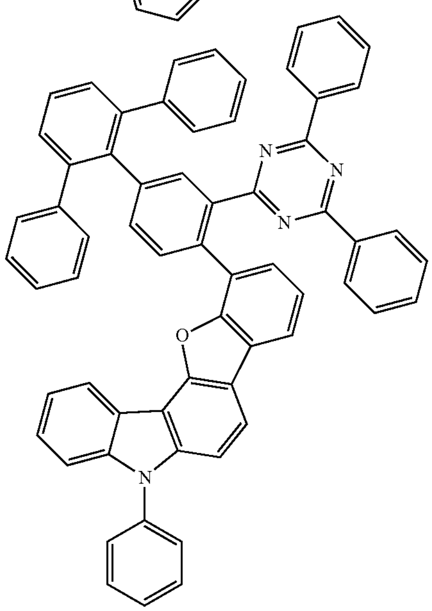
-continued
807
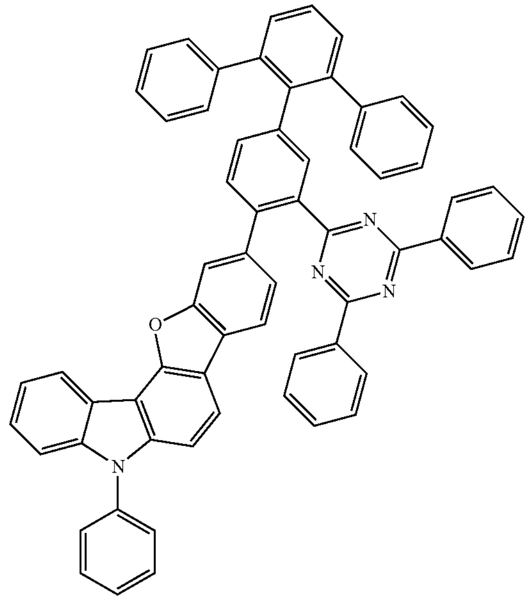
808
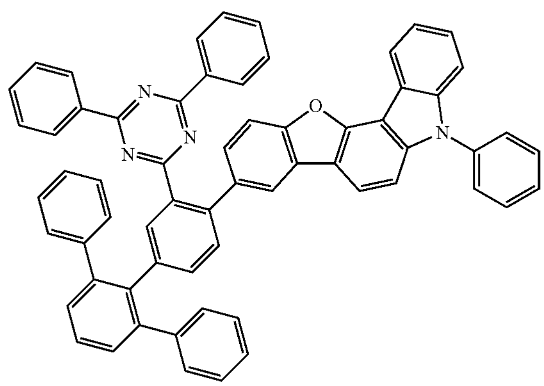
809
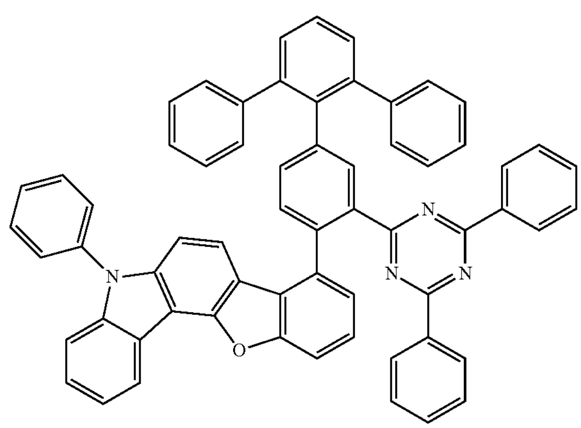

-continued
810
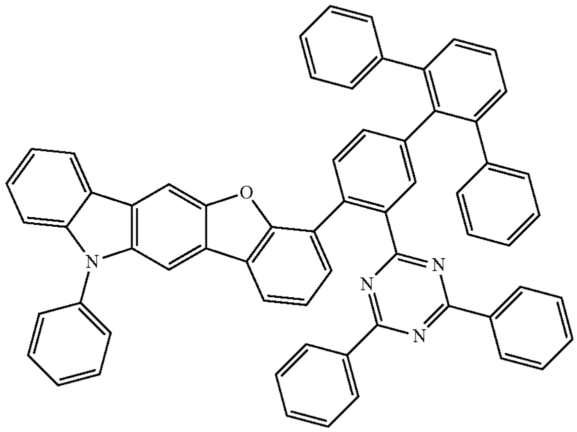
811
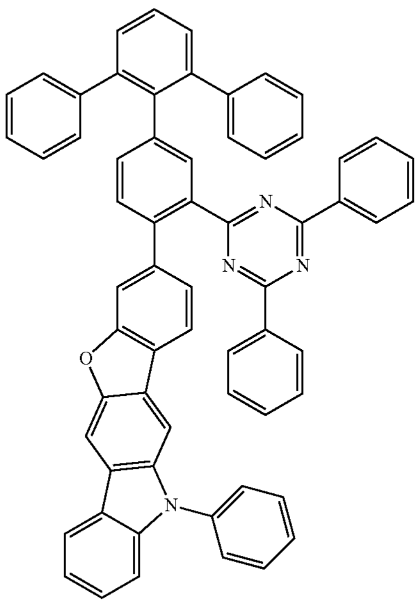
812
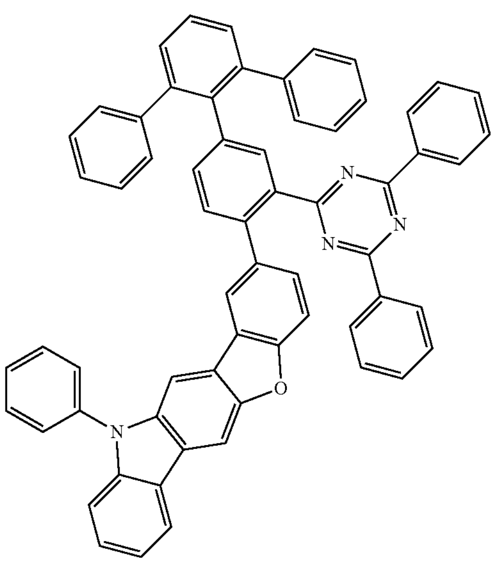
-continued
813
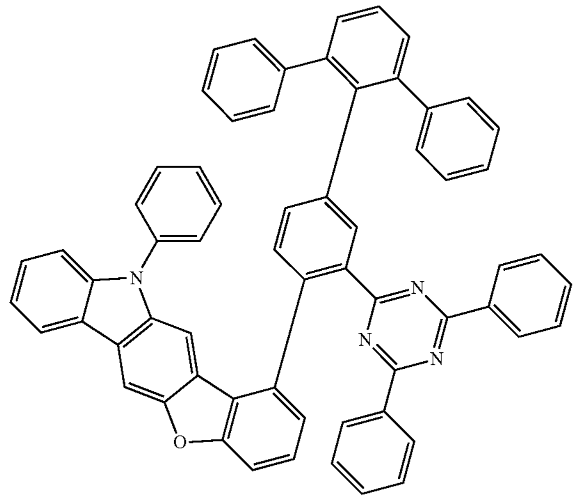
814
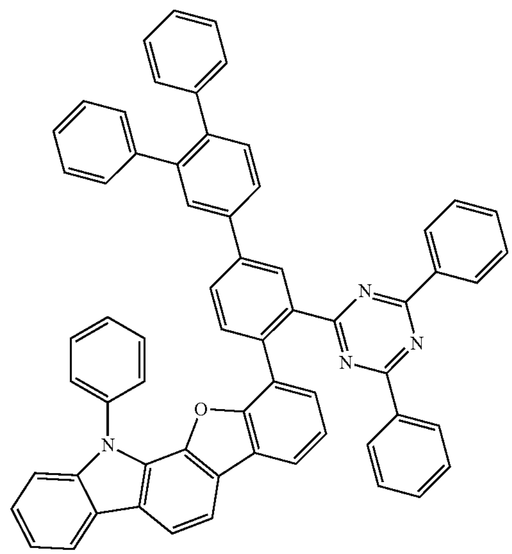
815
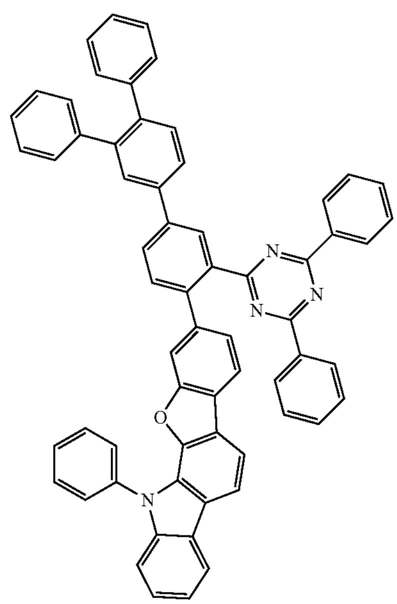

-continued
816
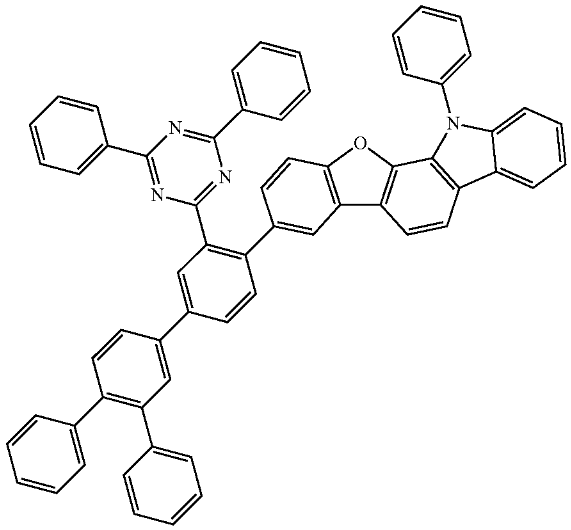
817
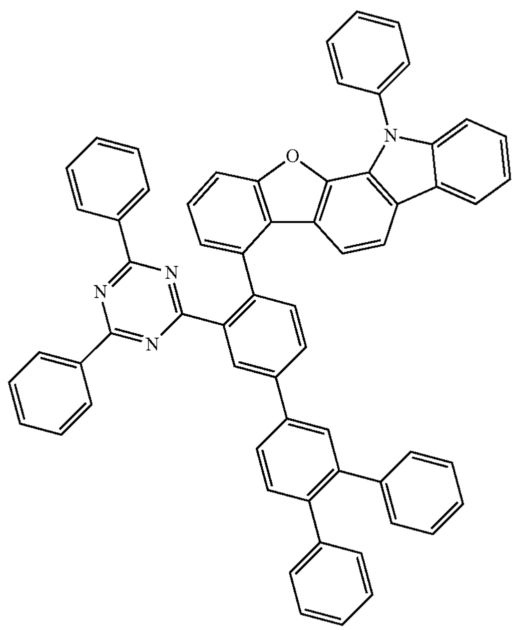
818
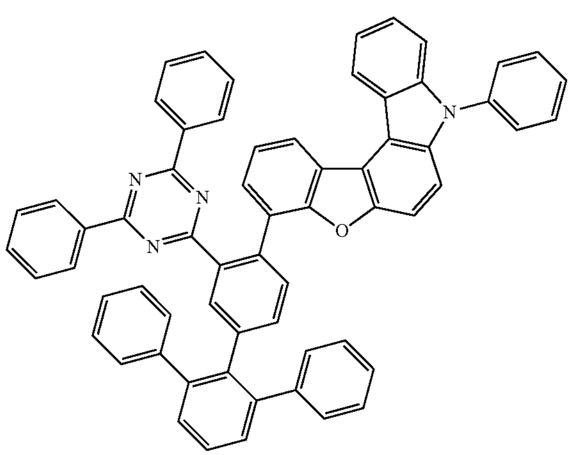
-continued
819
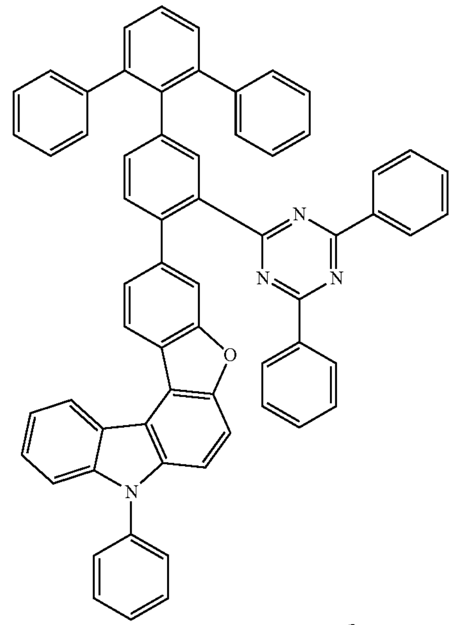
820
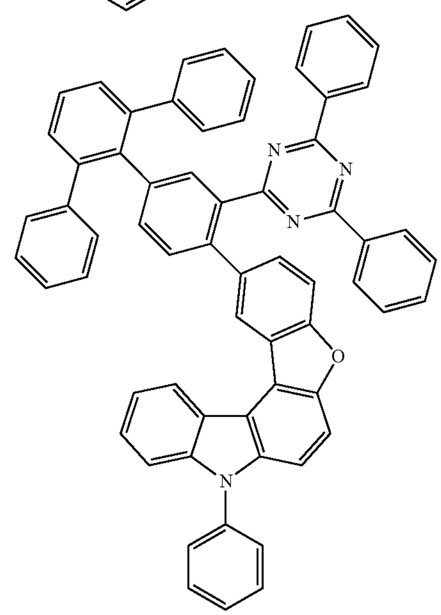
821
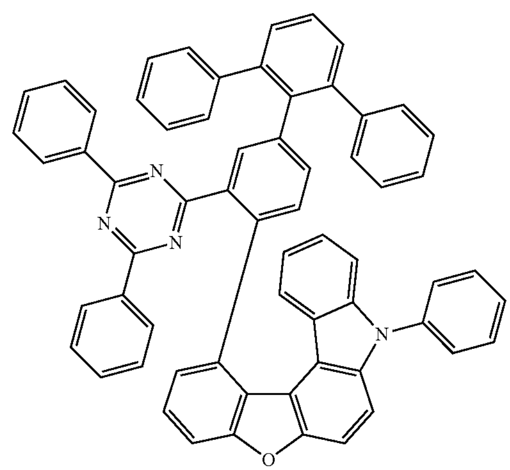

-continued
822
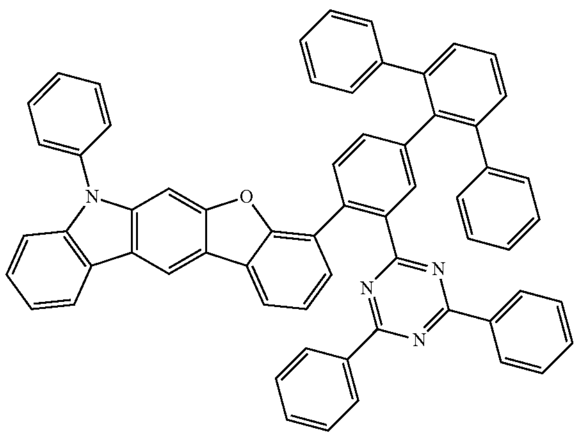
823
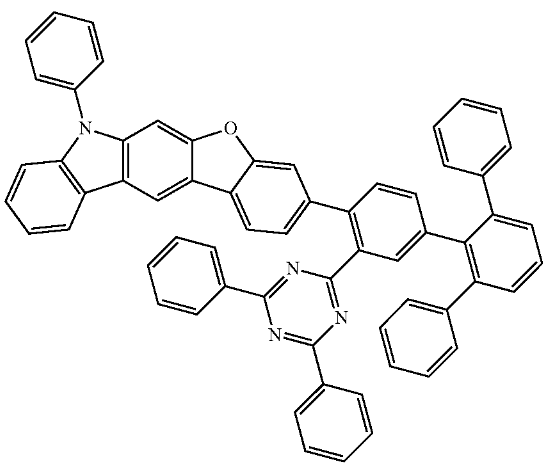
824
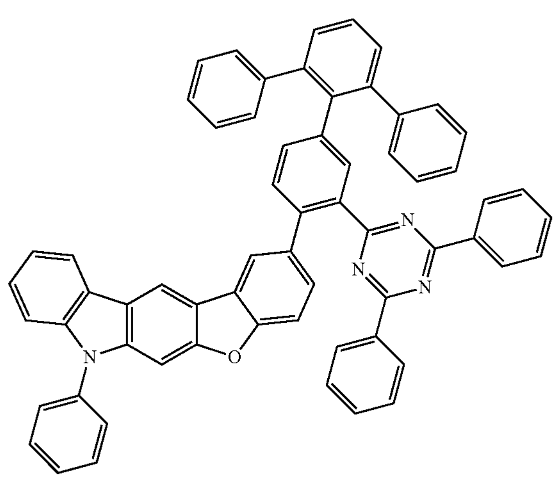
-continued
825
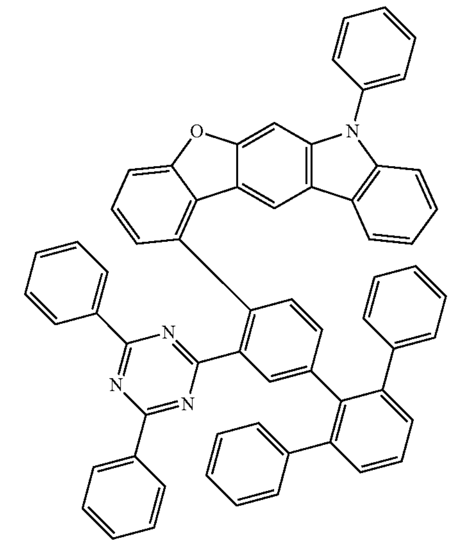
826
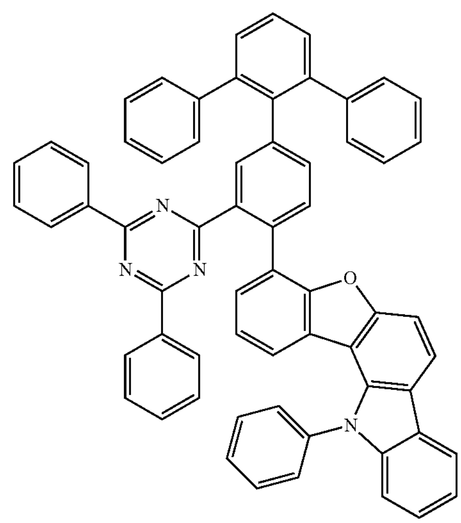
827
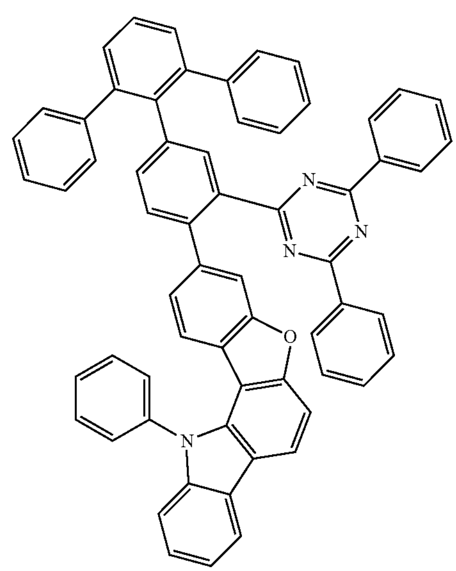

828
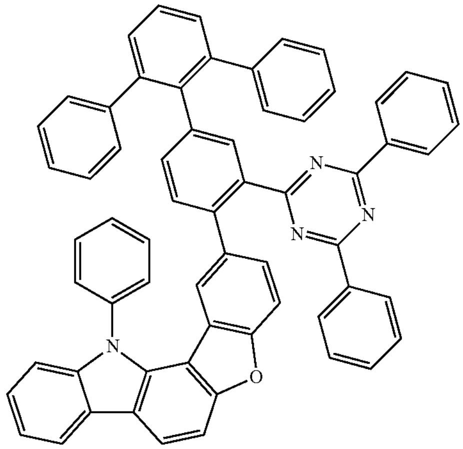
829
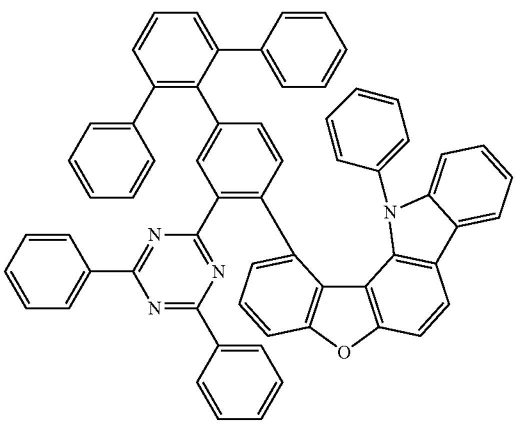
830
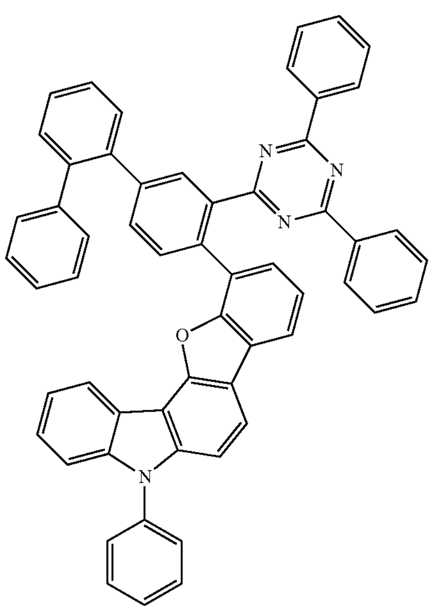
831
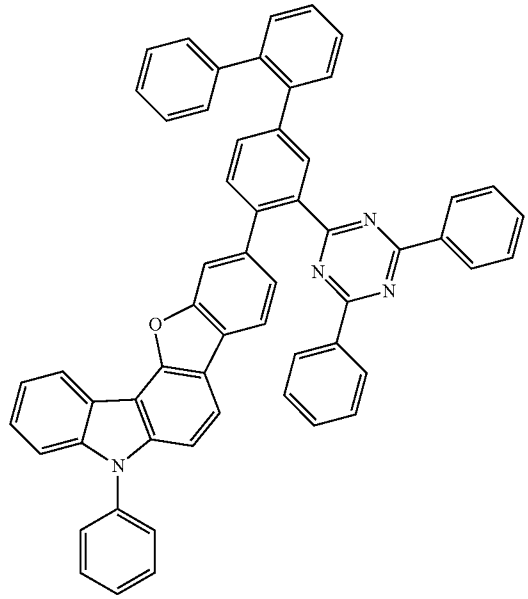
832
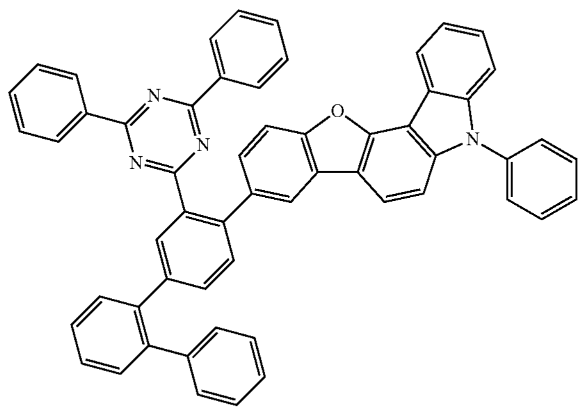
833
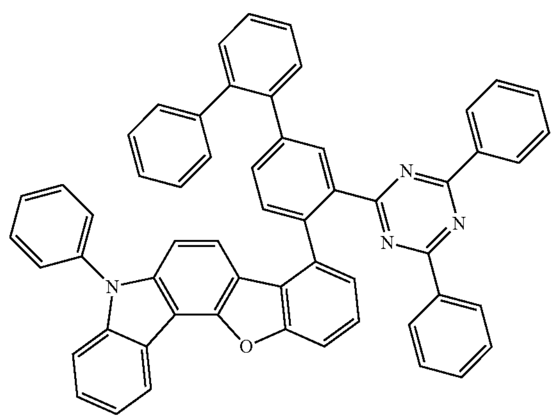

-continued
834
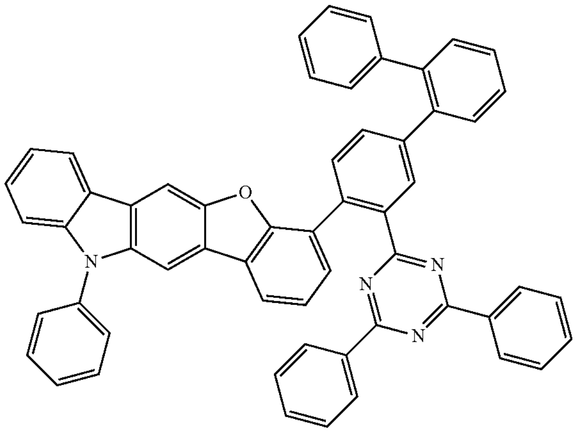
835
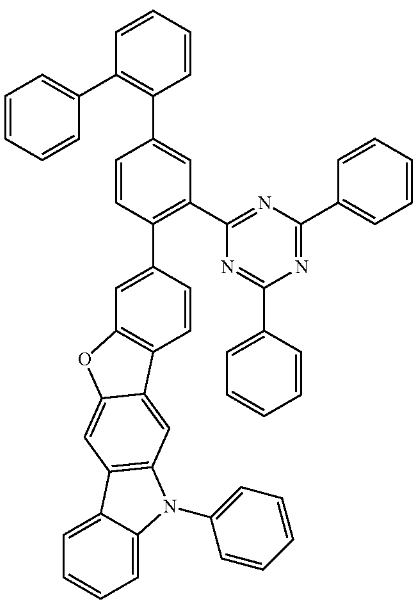
836
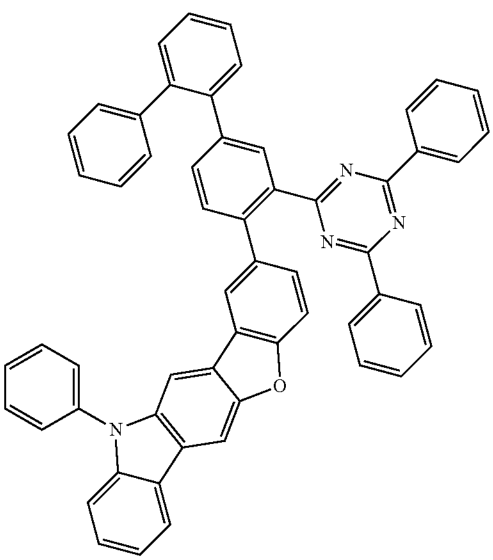
-continued
837
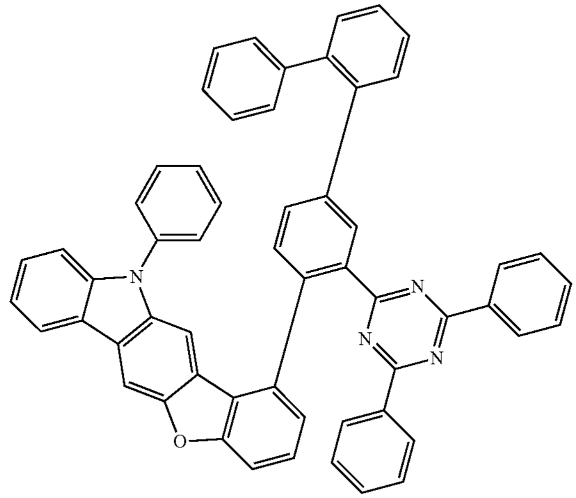
838
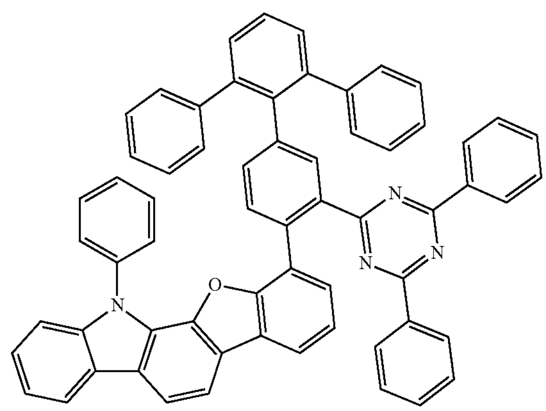
839
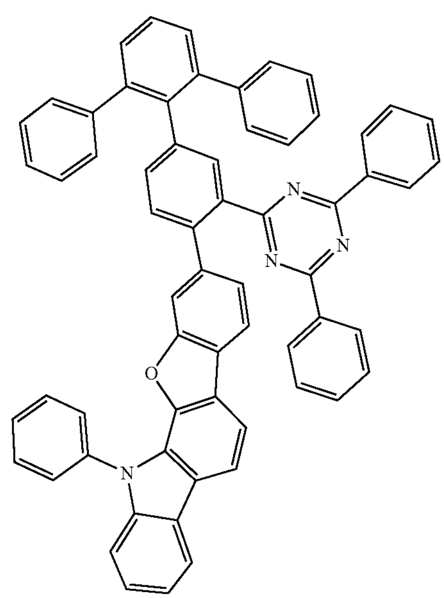

-continued
840
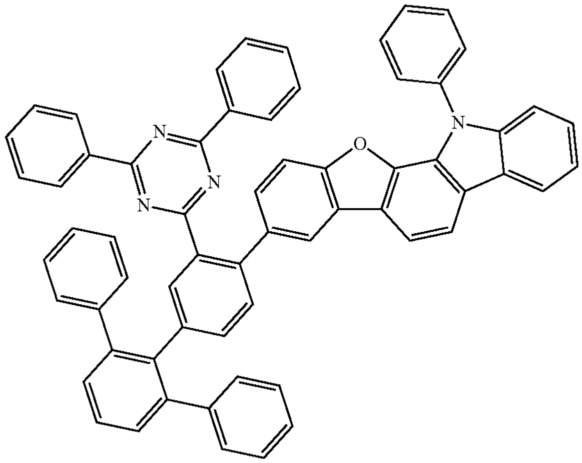
841
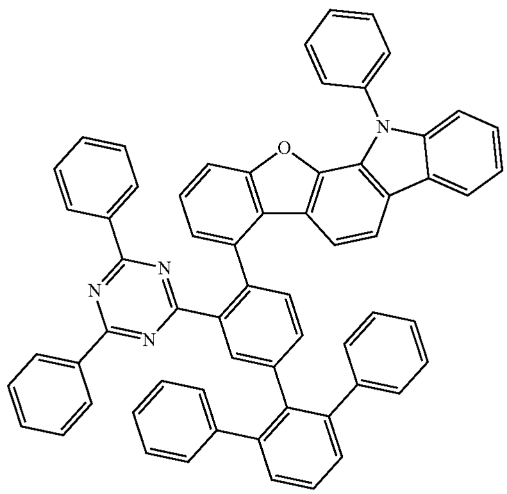
842
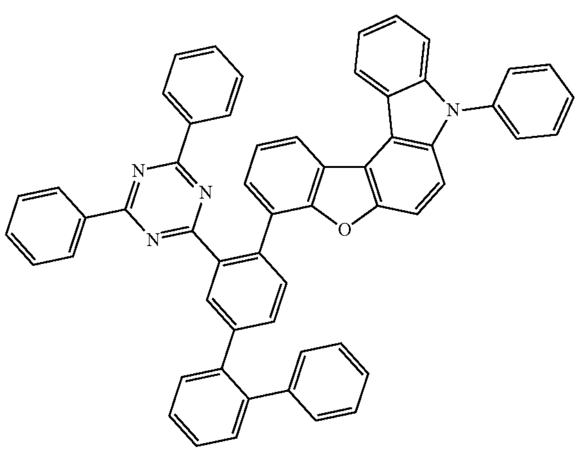
-continued
843
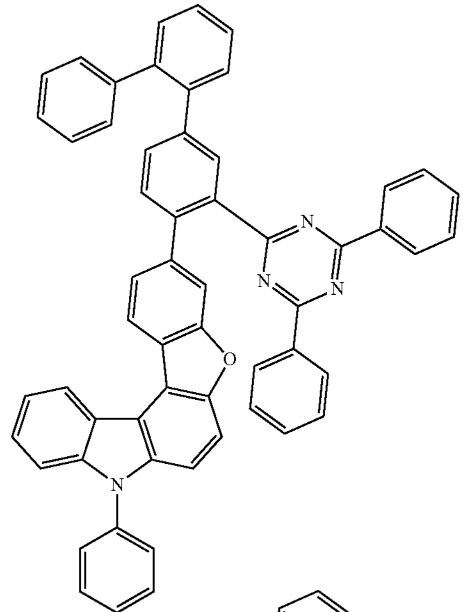
844
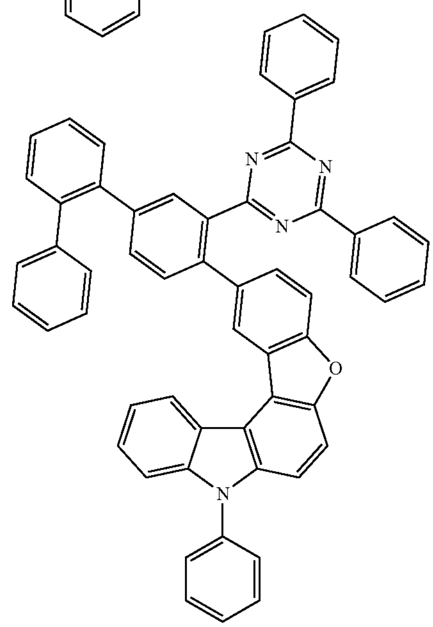
845
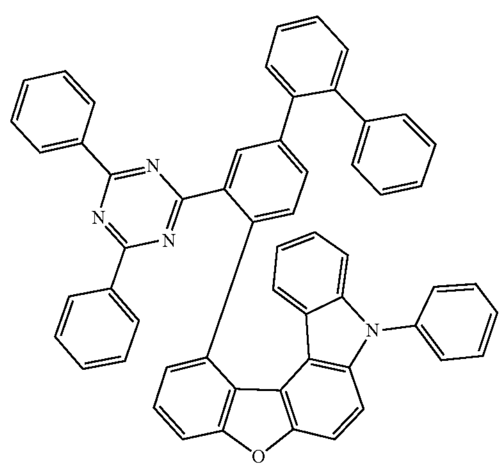

-continued
846
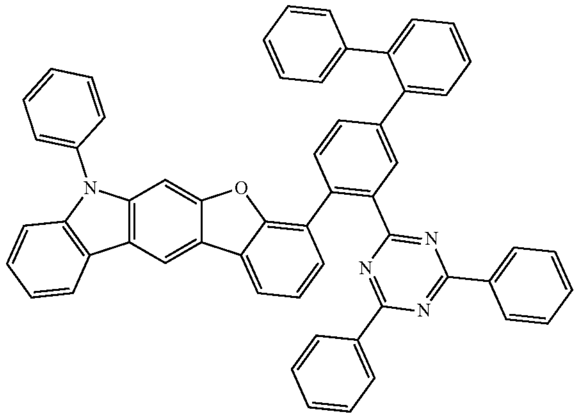
847
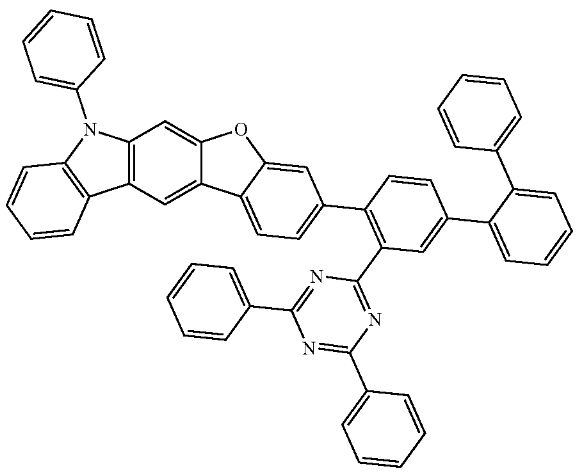
848
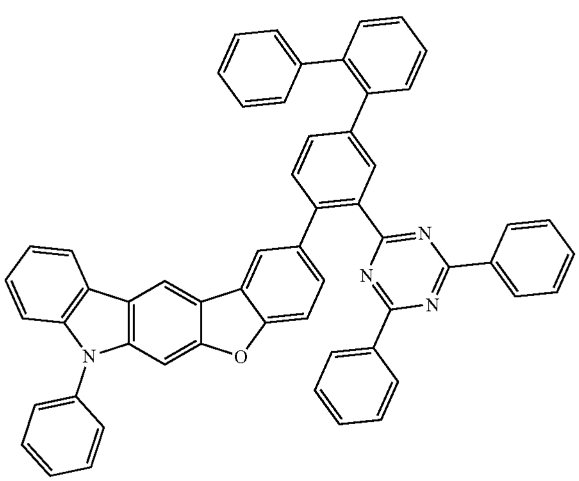
-continued
849
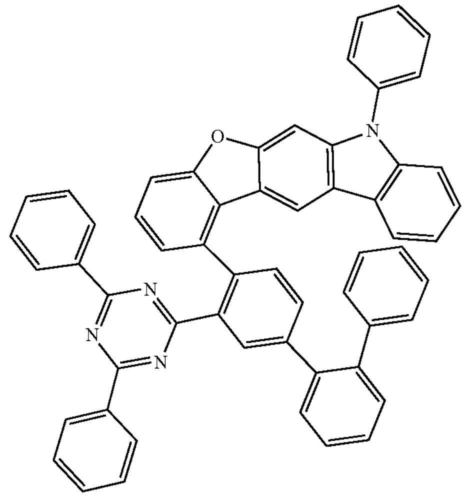
850
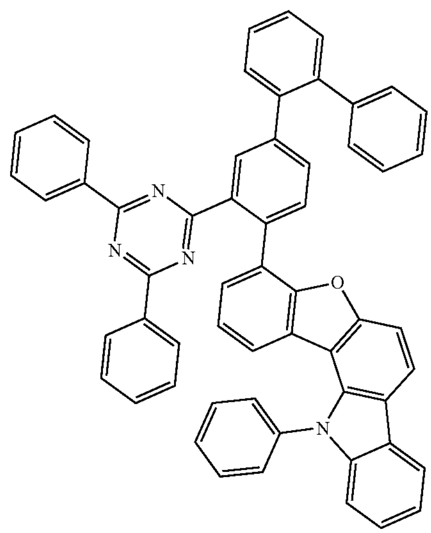
851
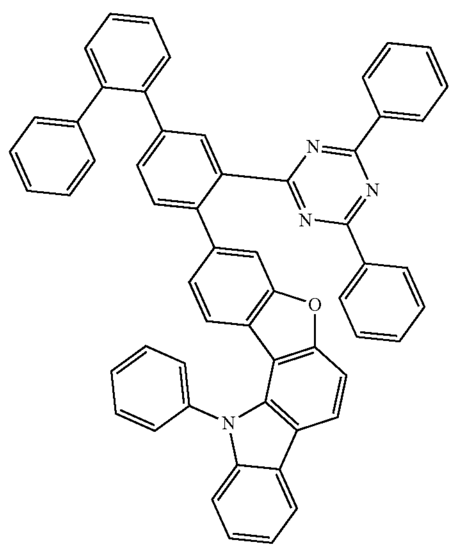

-continued
852
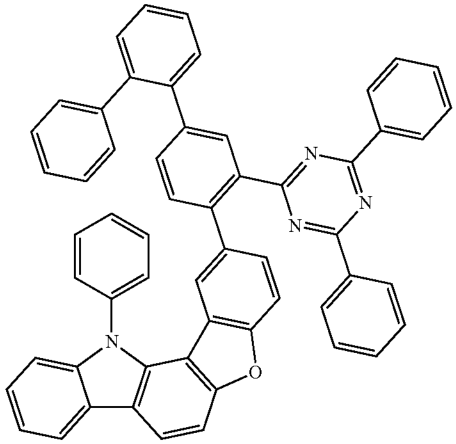
853
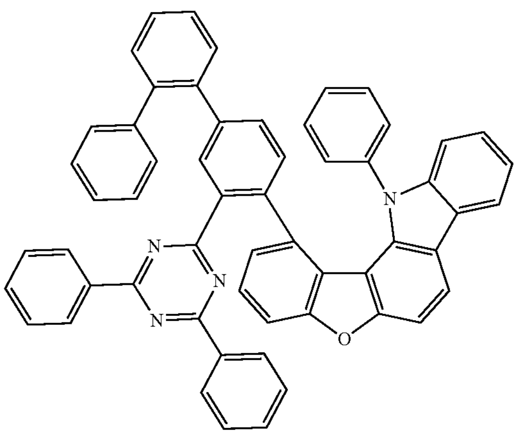
854
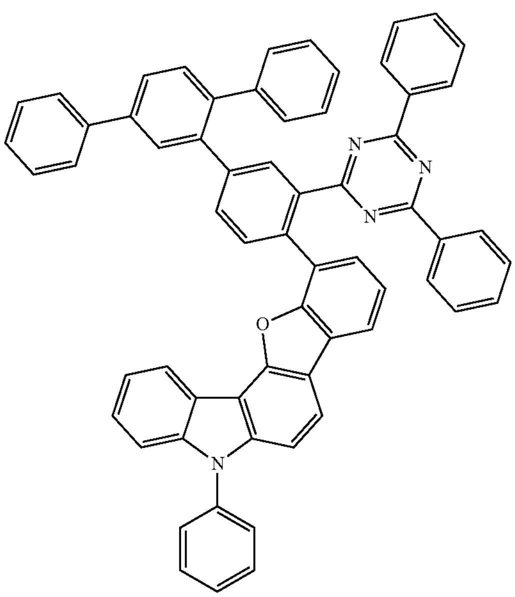
-continued
855
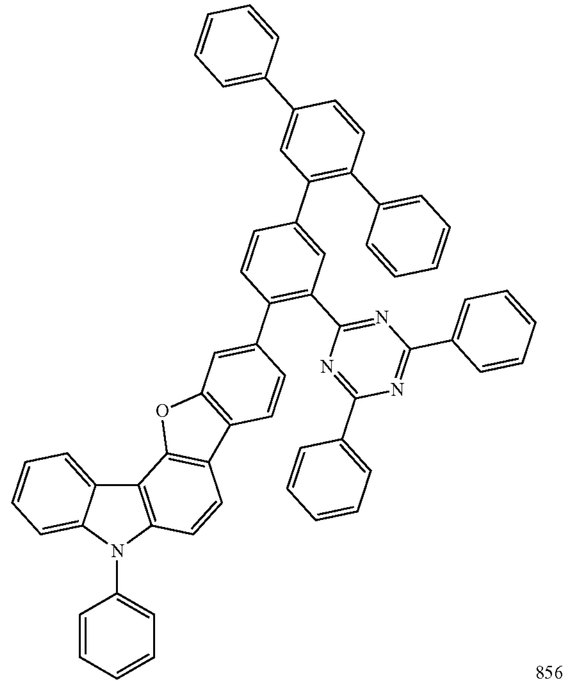
856
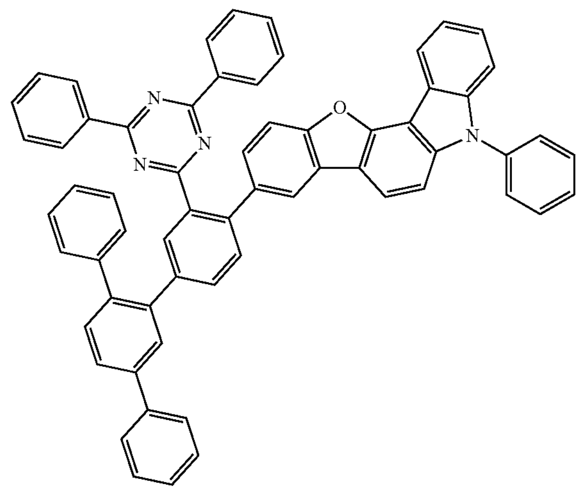
857
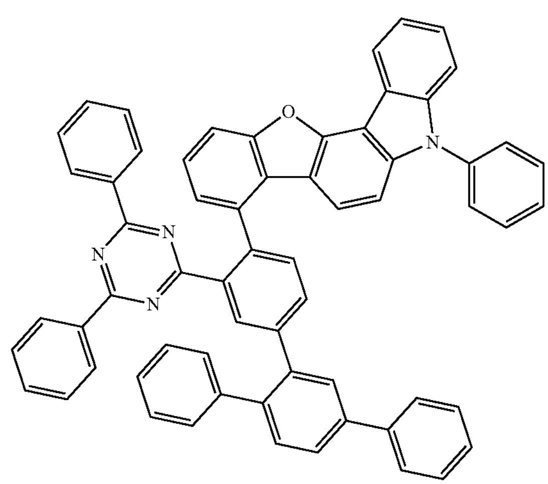

-continued
858
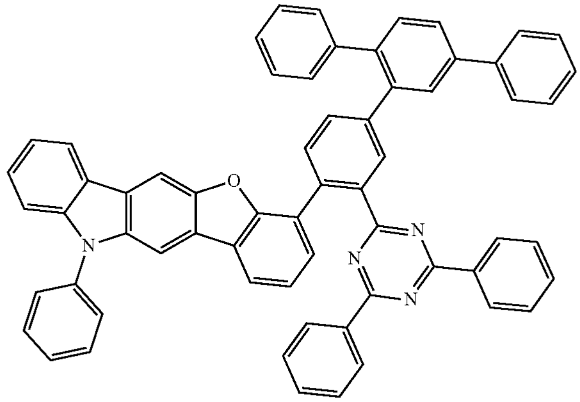
859
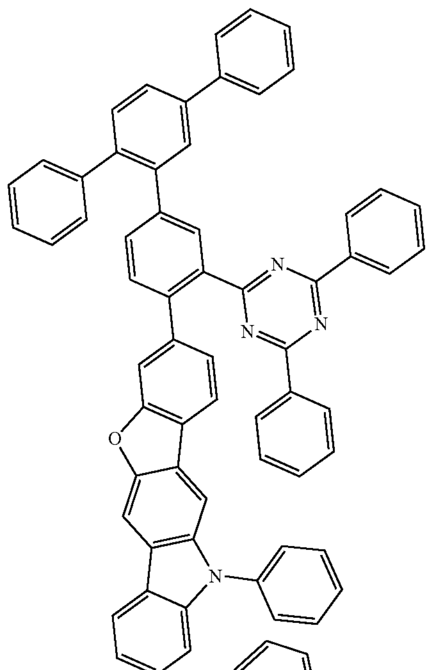
860
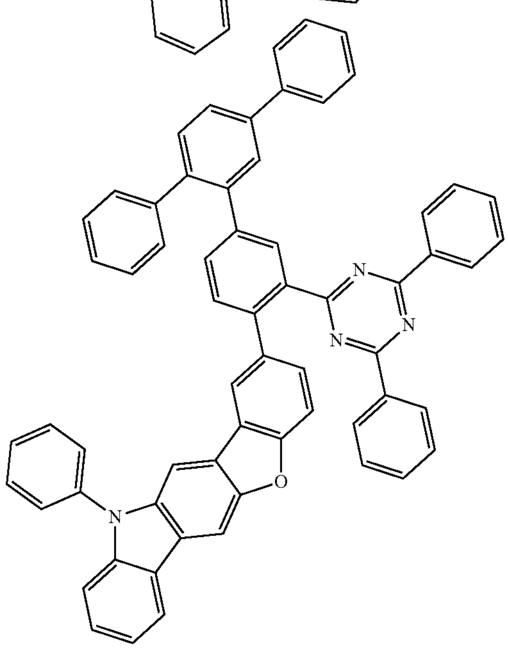
-continued
861
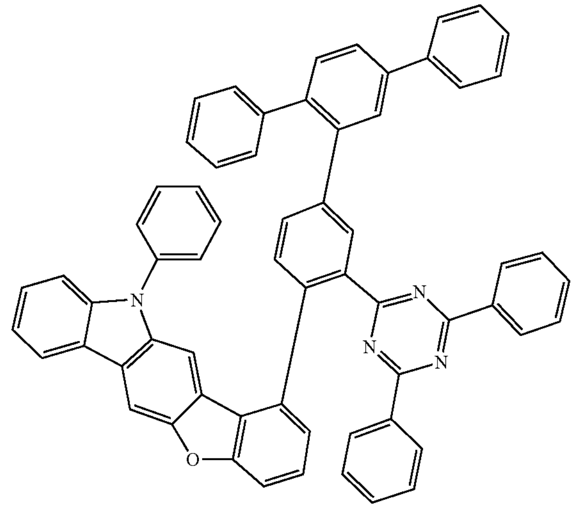
862
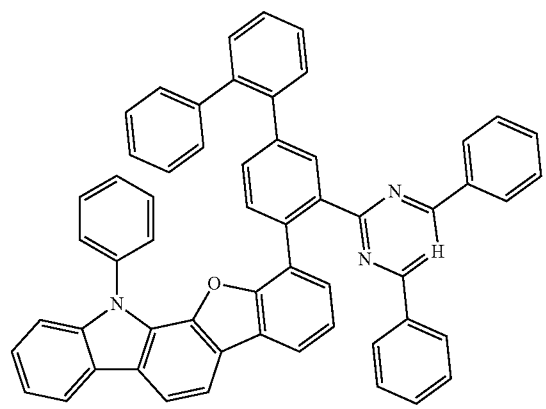
863
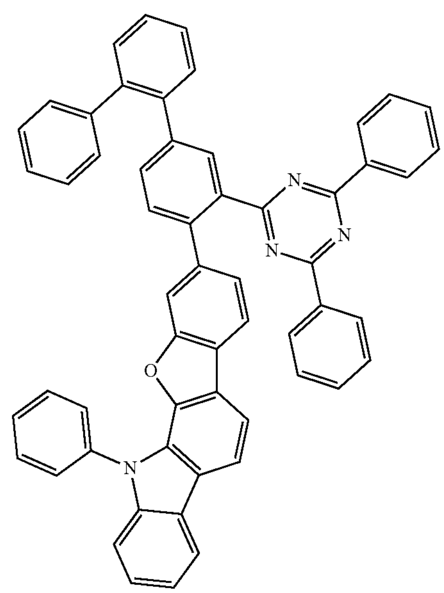

-continued
864
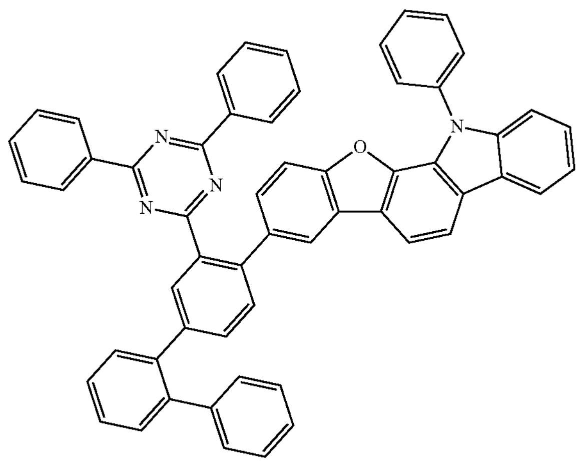
865
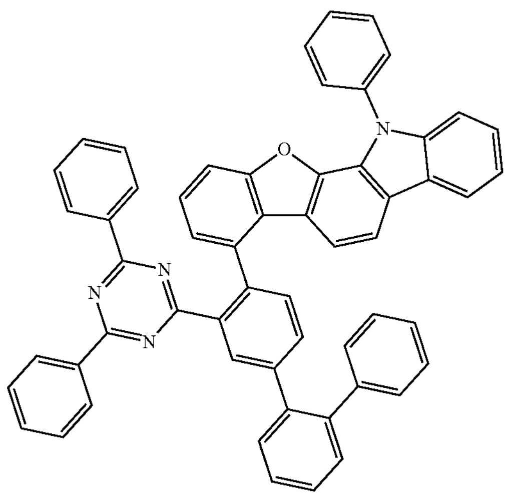
866
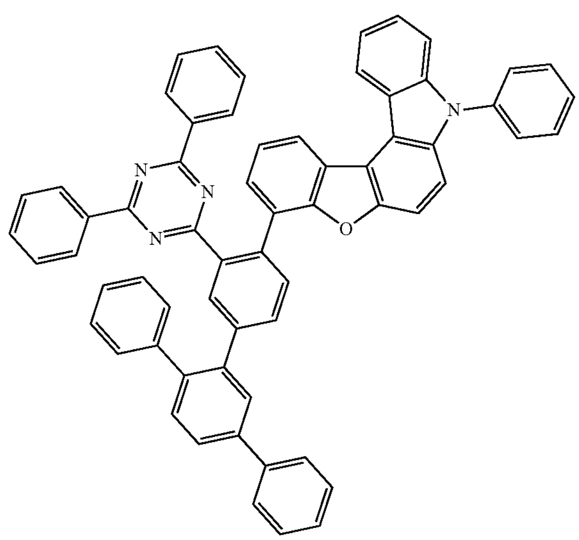
-continued
867
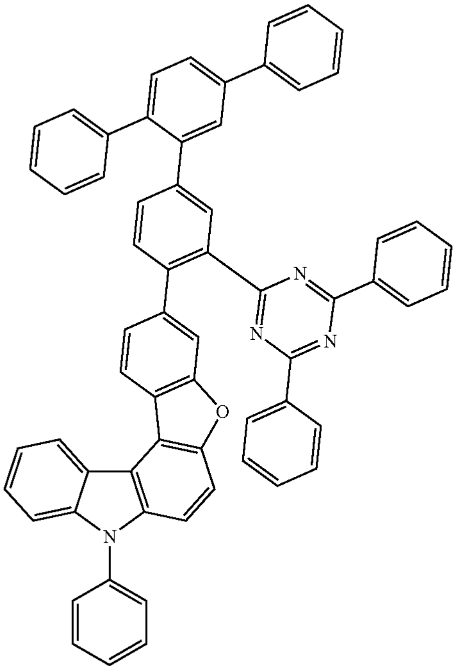
868
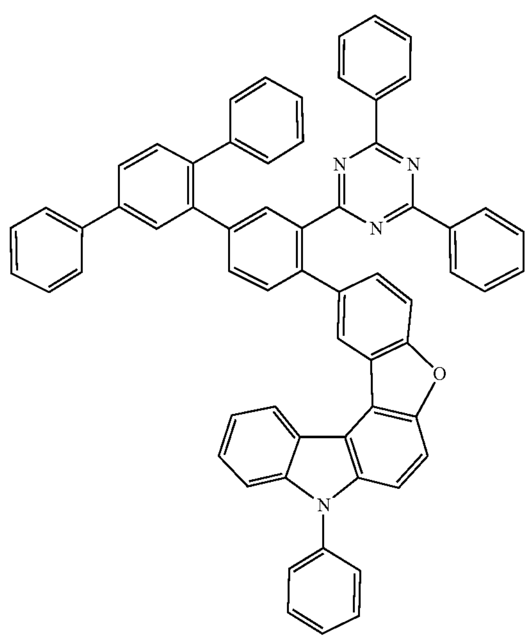

-continued
869
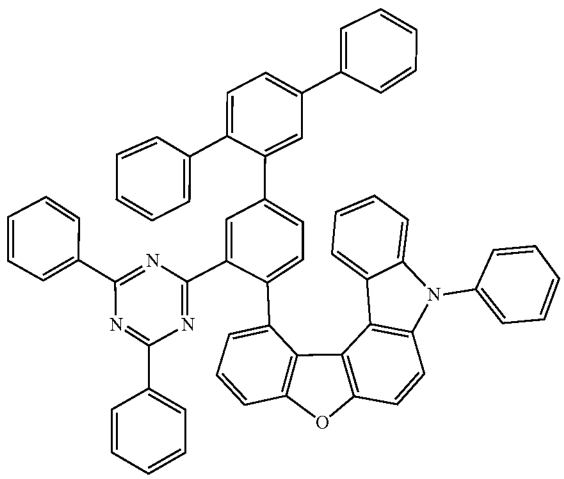
870
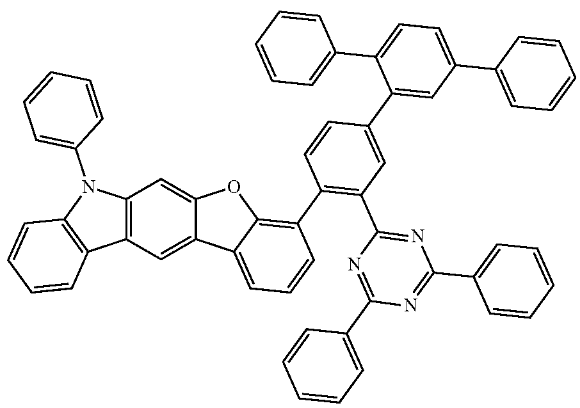
871
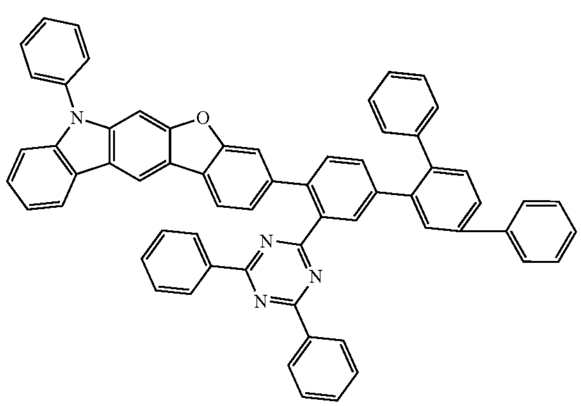
-continued
872
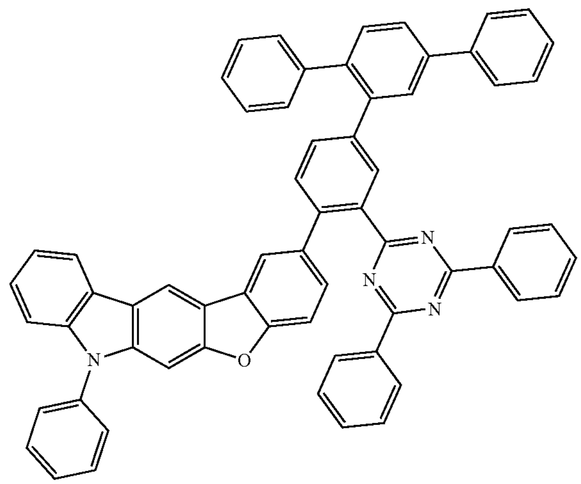
873
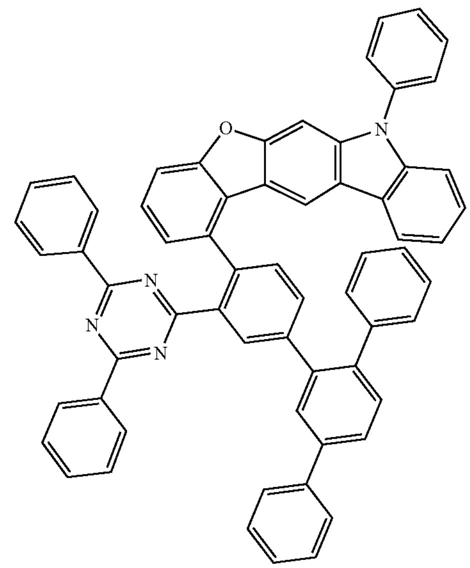
874
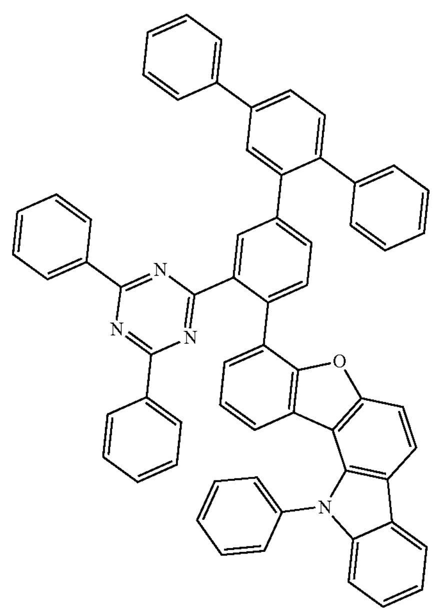

875
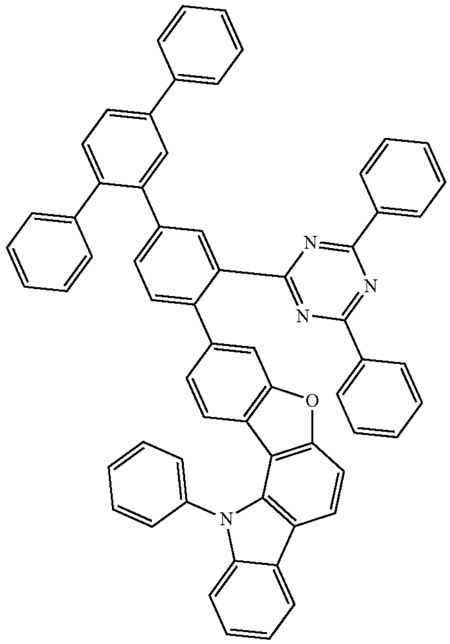
876
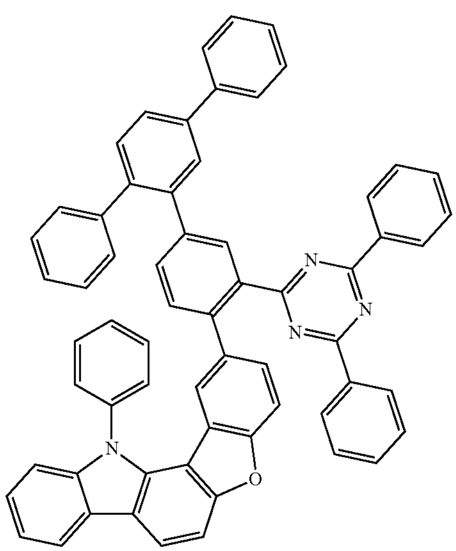
877
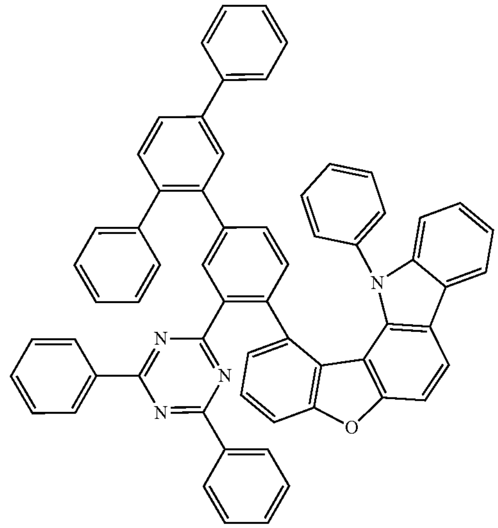
878
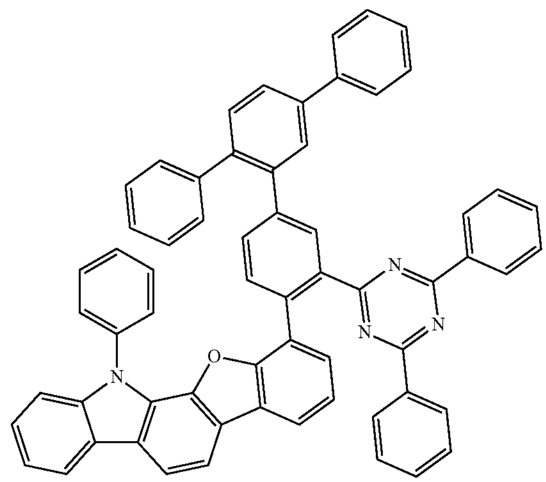
879
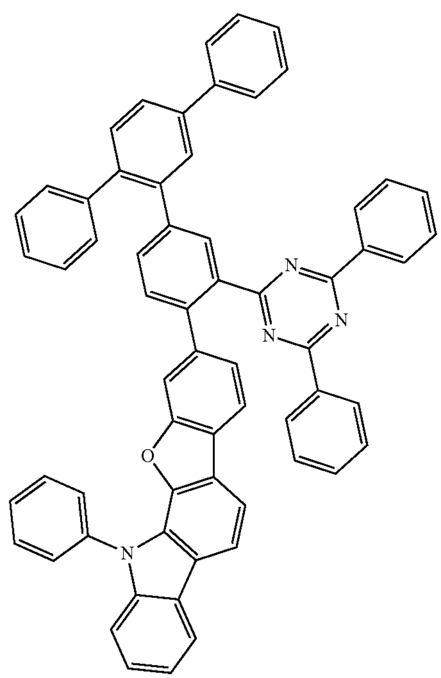

-continued
880
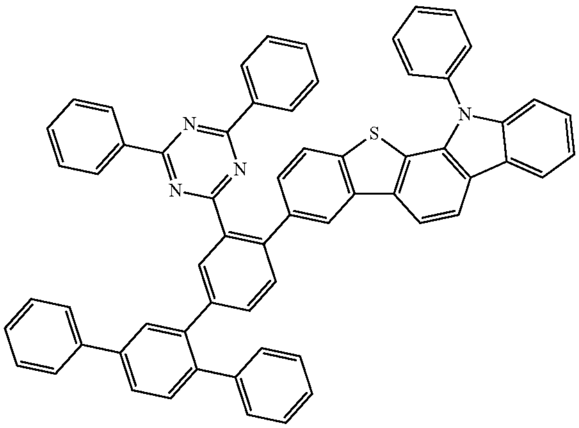
881
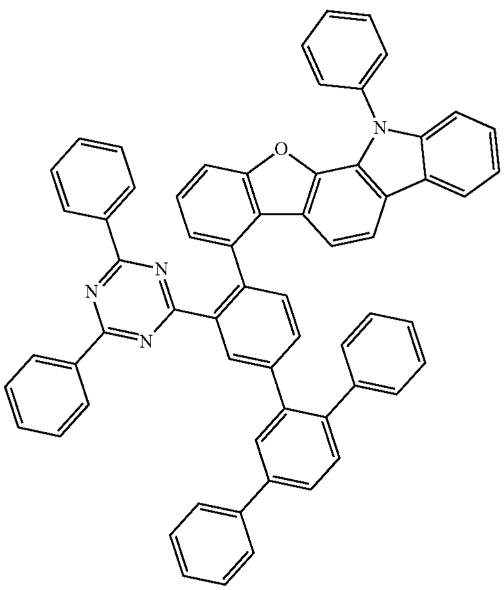
882
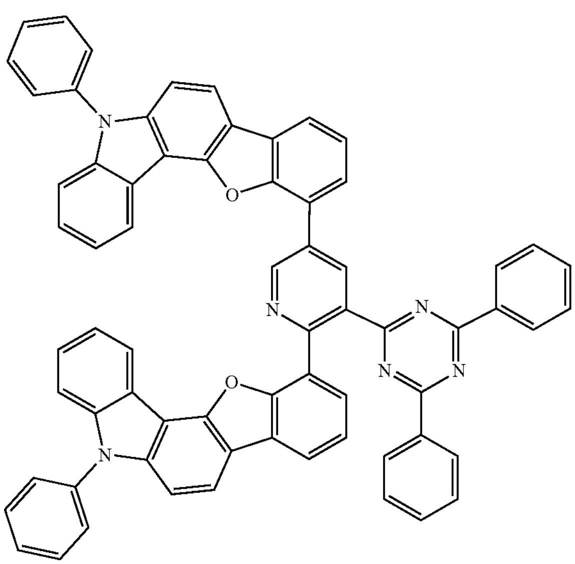
-continued
883
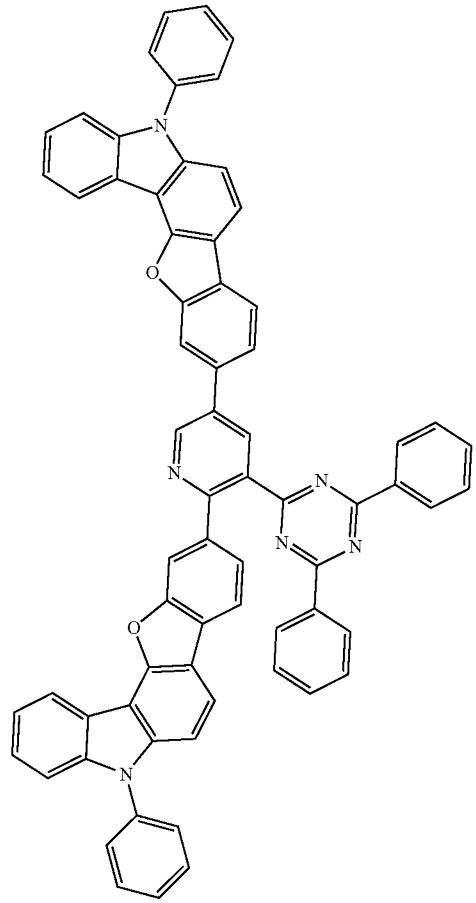
884
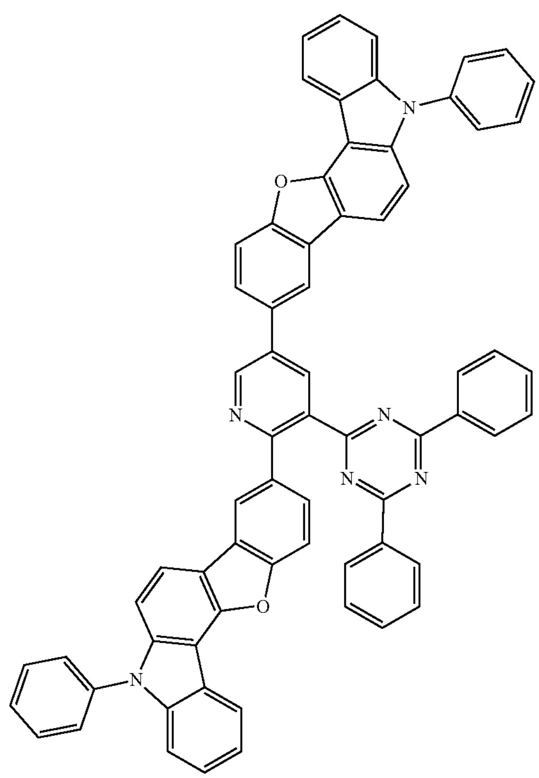

885
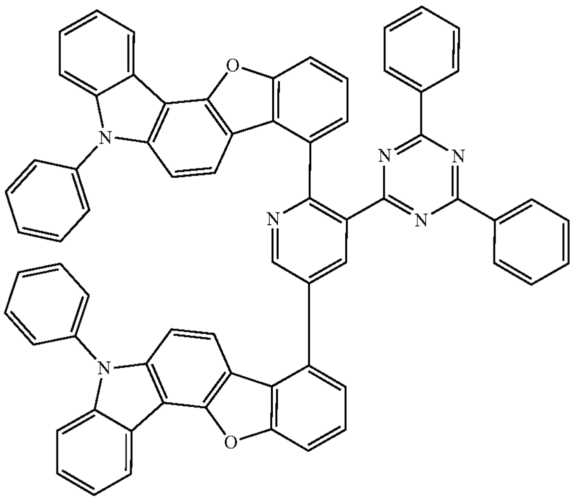
886
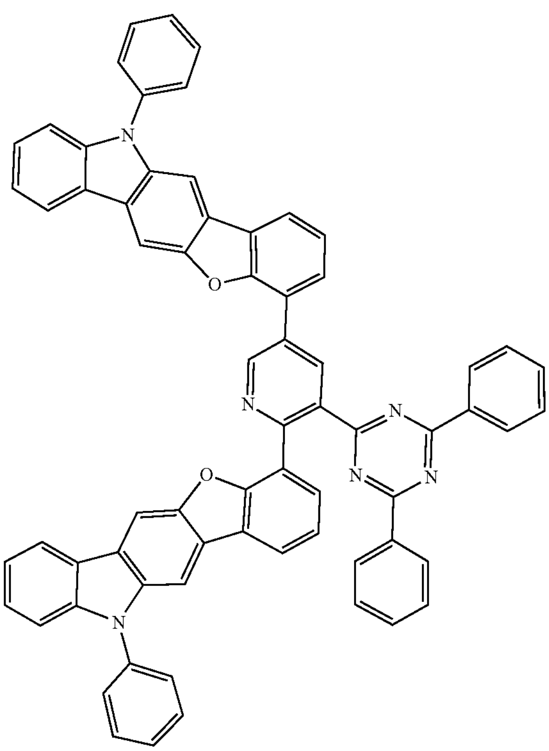
887
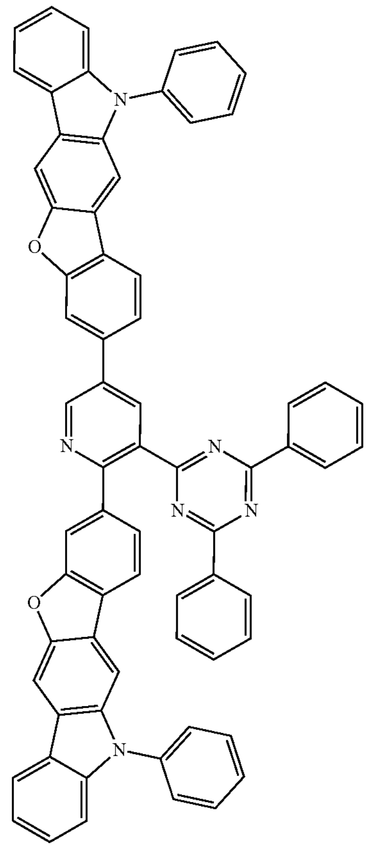
888
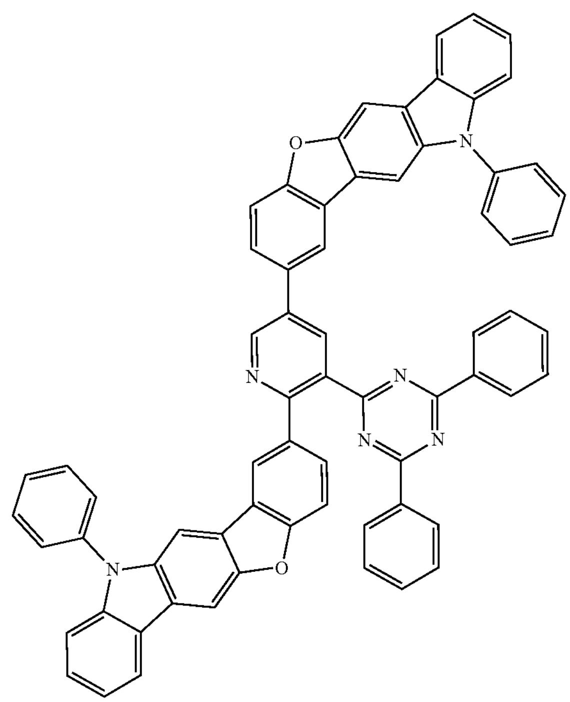

-continued
889
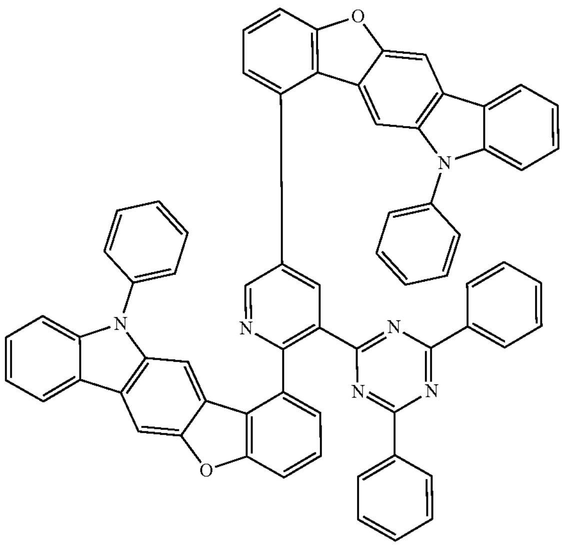
890
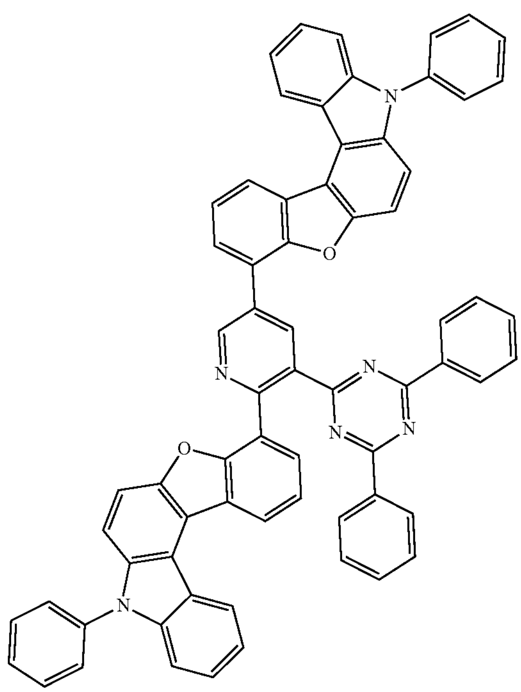
-continued
891
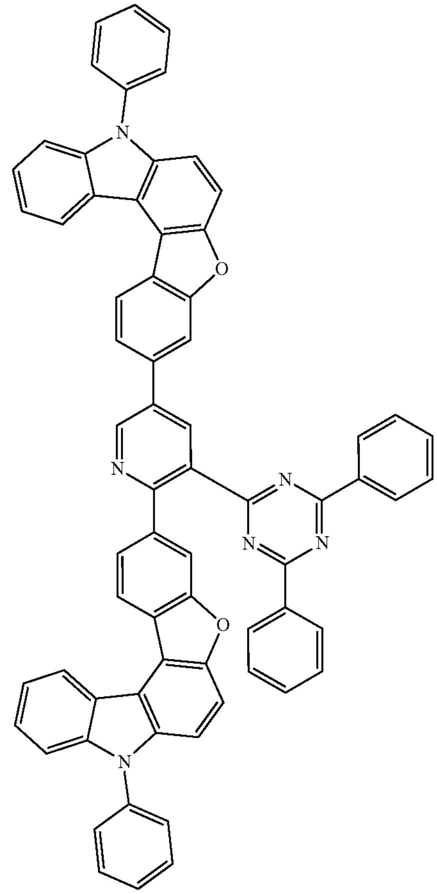
892
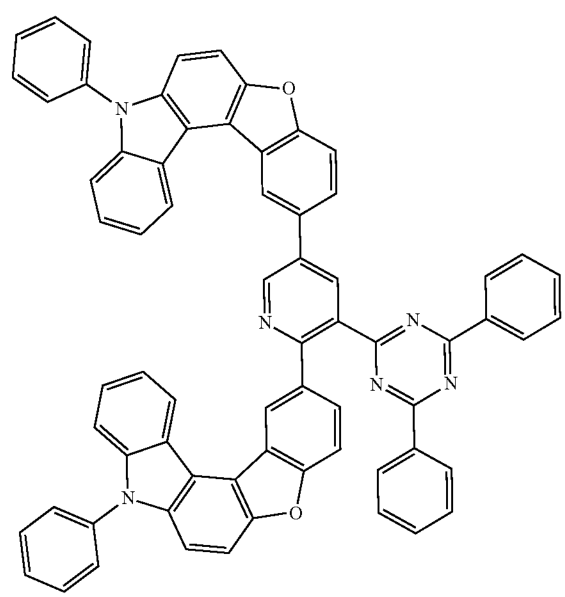

-continued
893
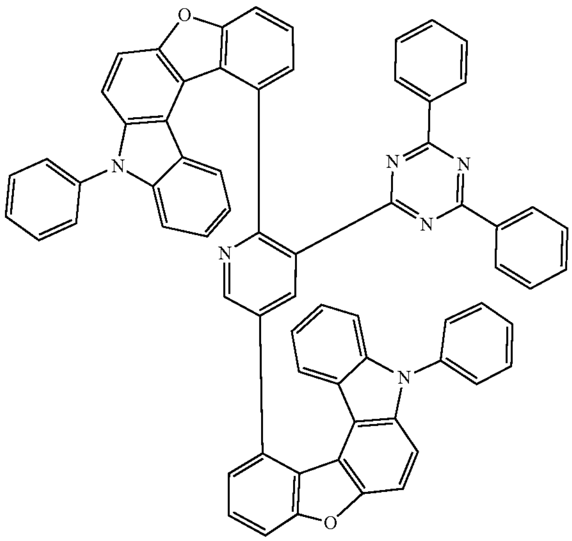
894
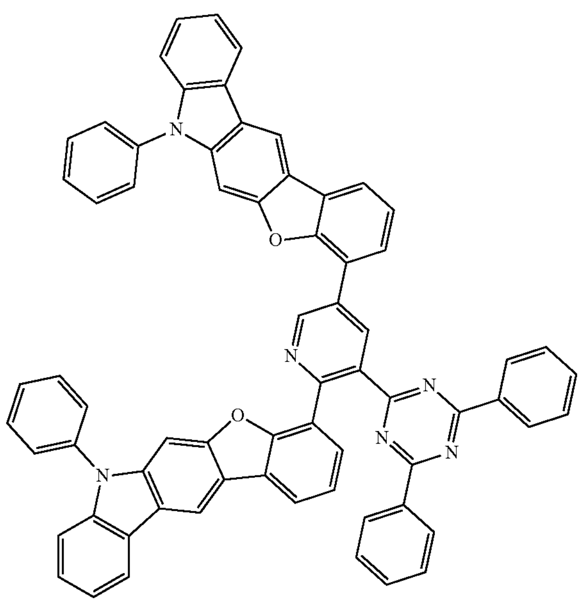
-continued
895
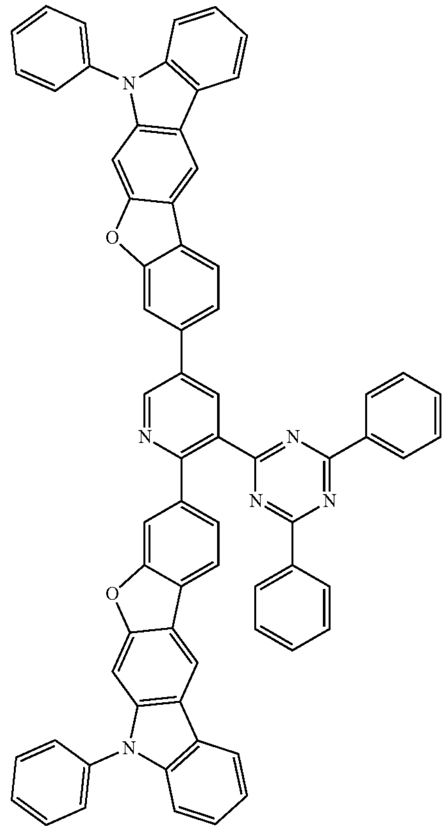
896
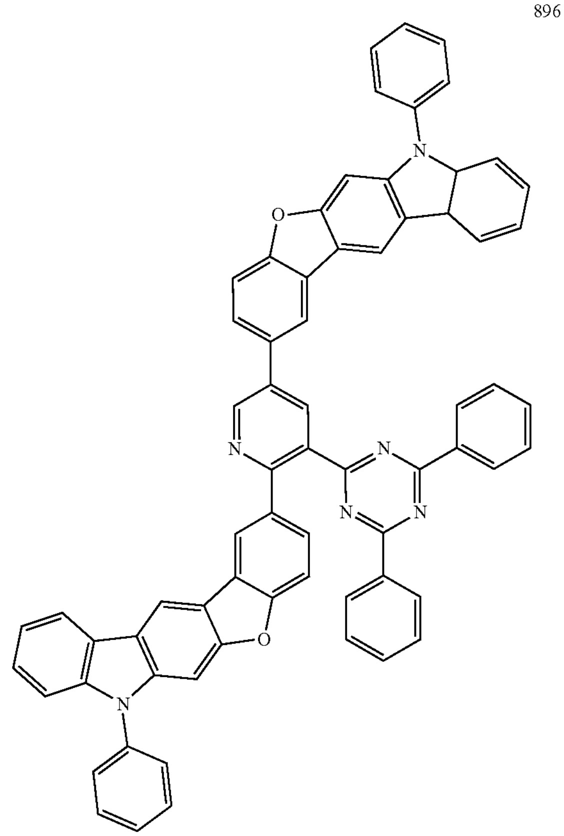

-continued
897
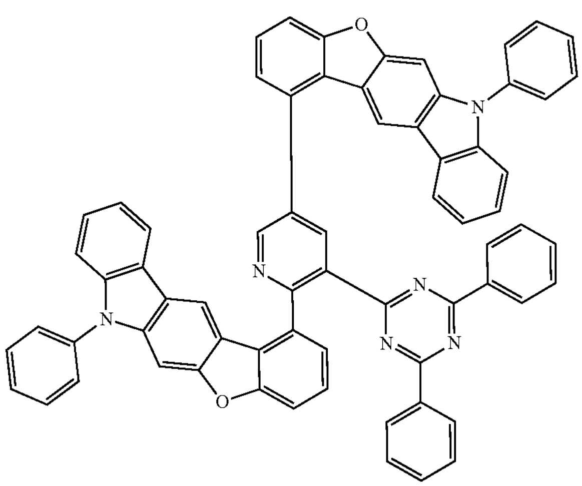
898
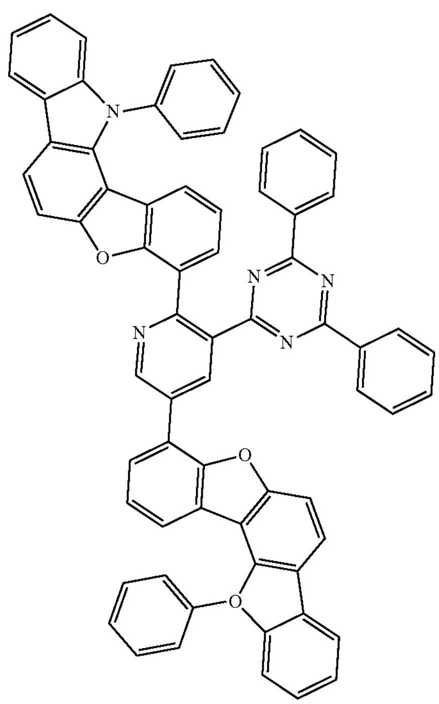
-continued
899
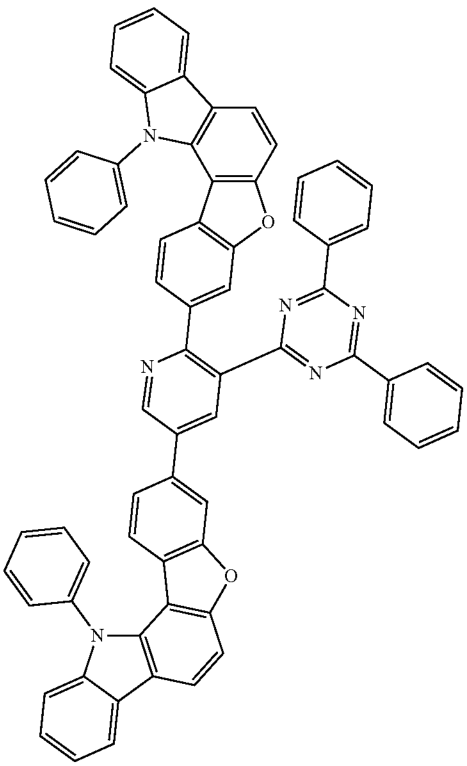
900
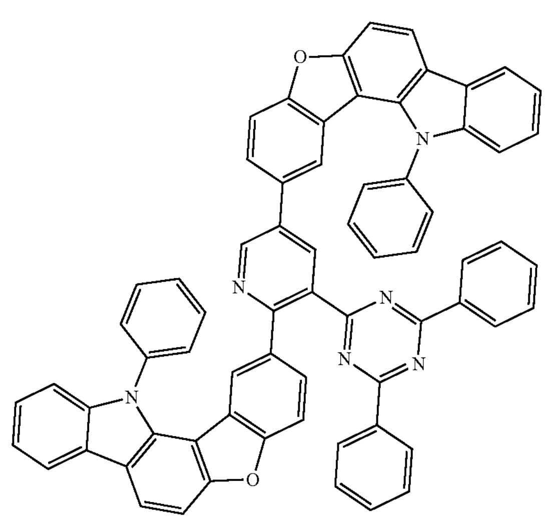

-continued
901
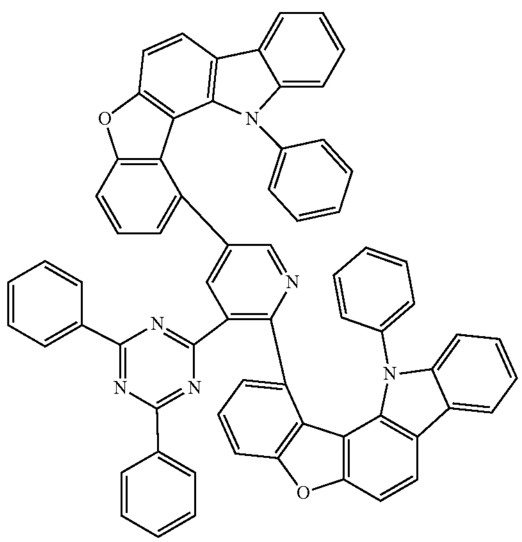
902
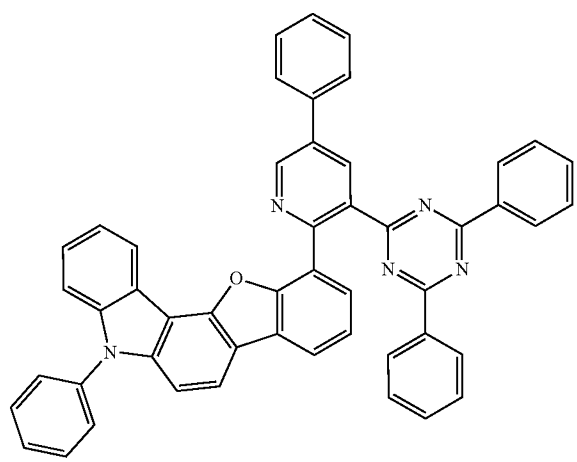
903
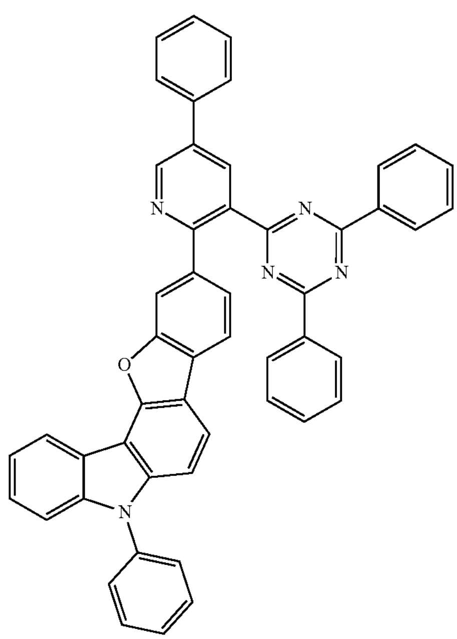
-continued
904
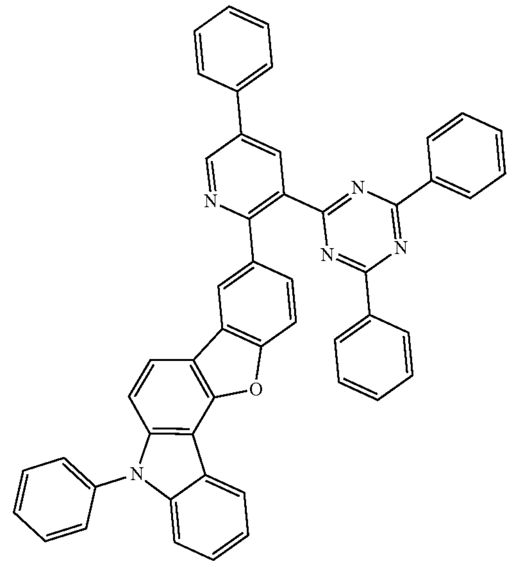
905
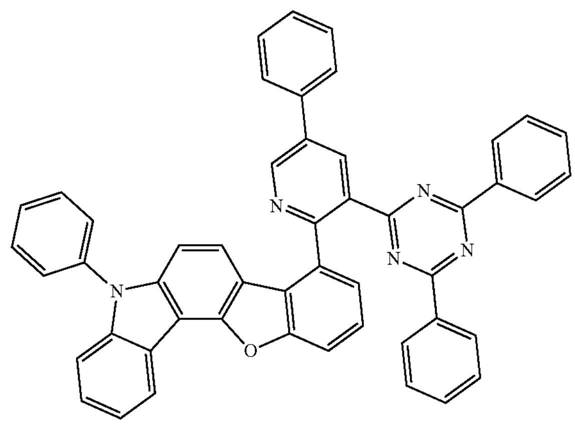
906
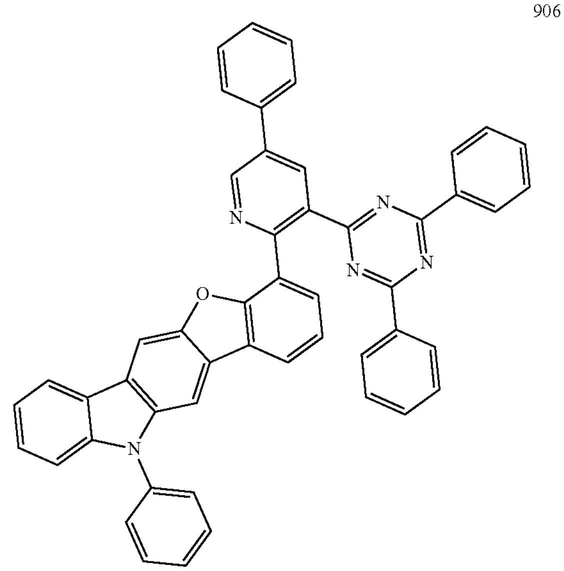

-continued
907
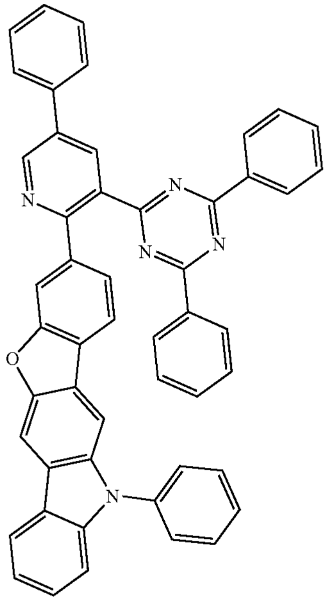
908
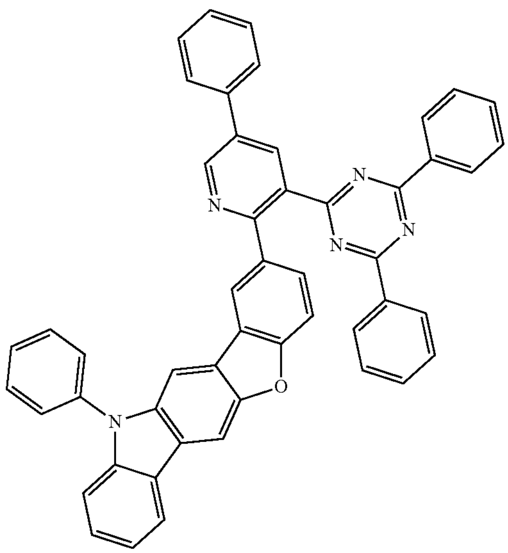
909
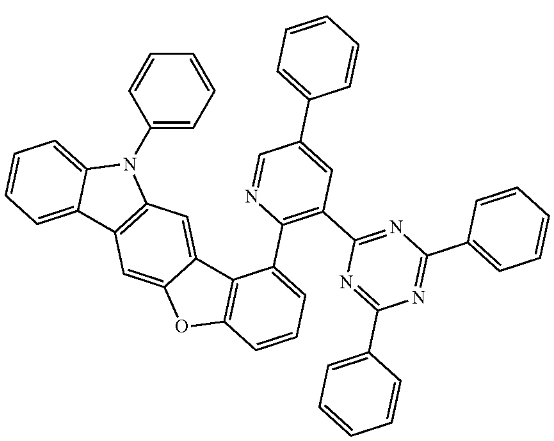
910
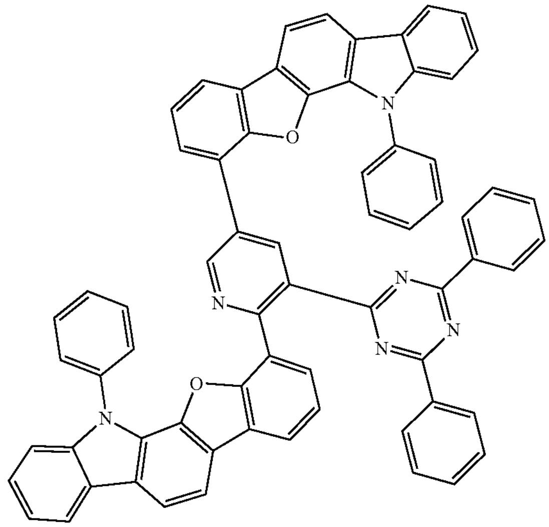
911
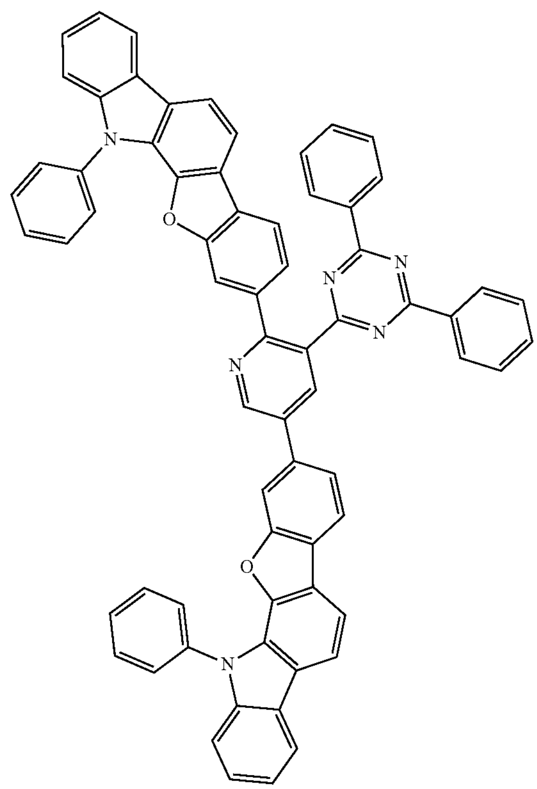

-continued
912
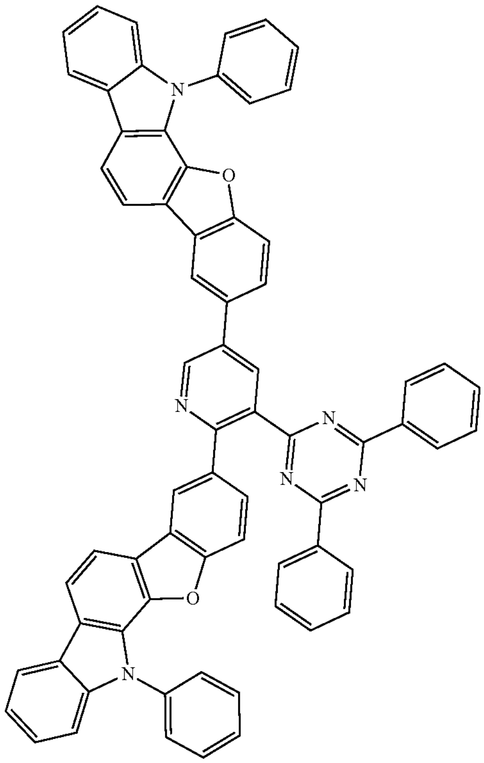
913
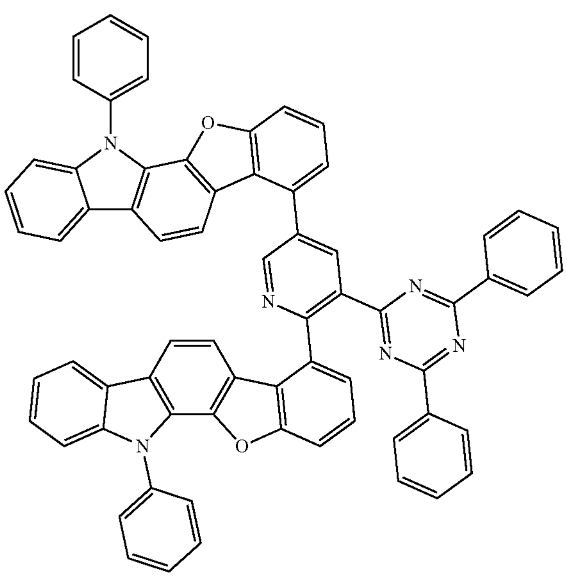
-continued
914
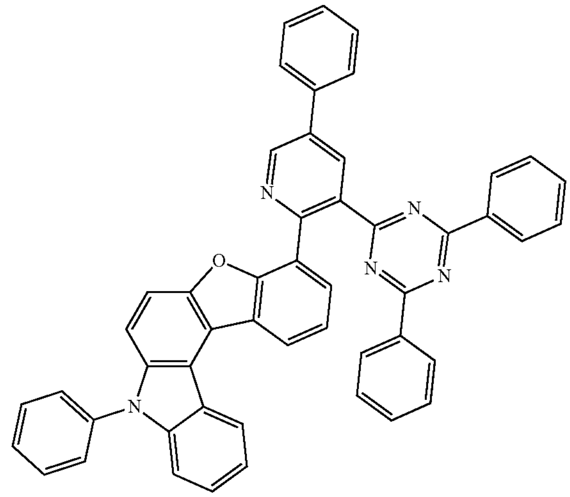
915
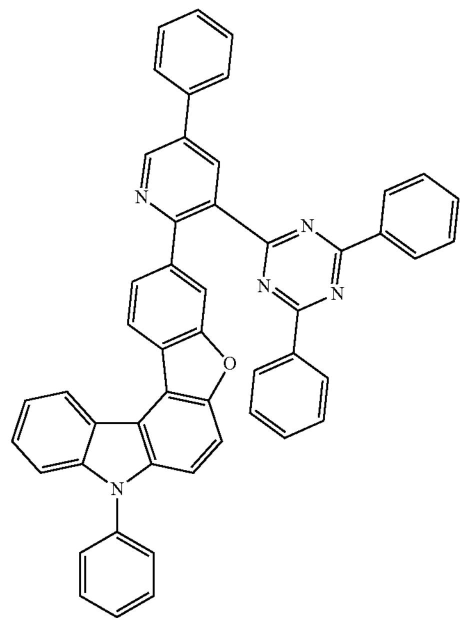
916
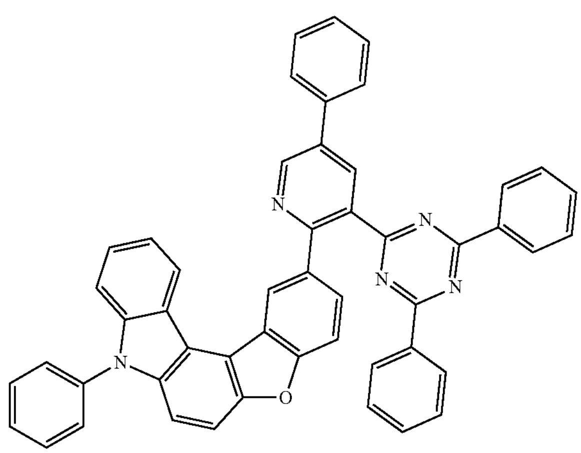

917
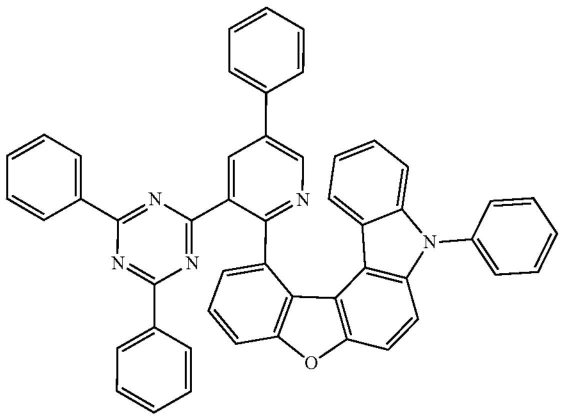
918
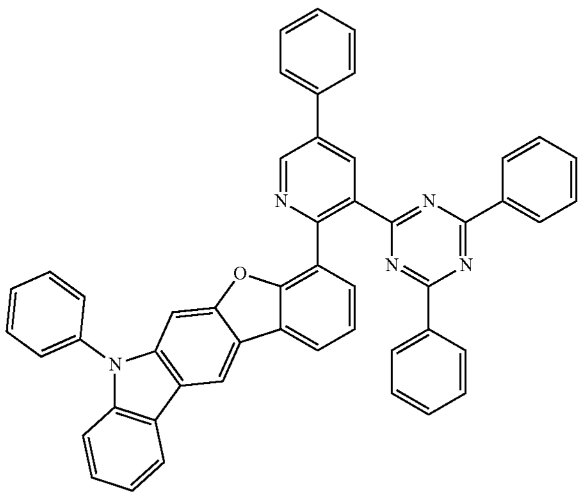
919
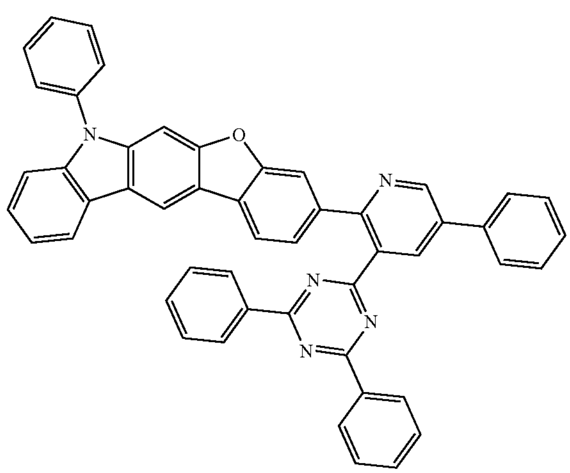
920
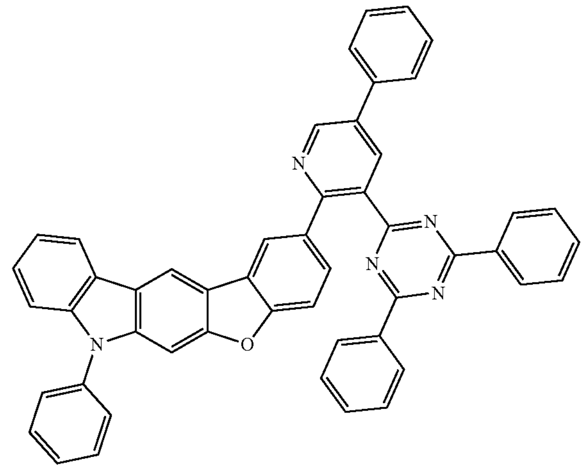
921
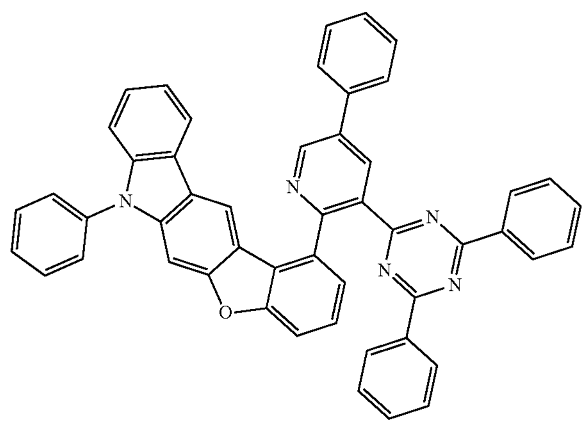
922
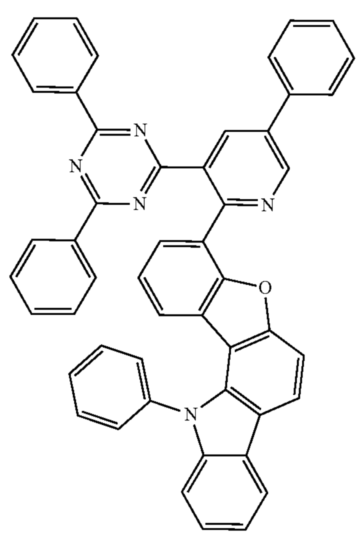

-continued
923
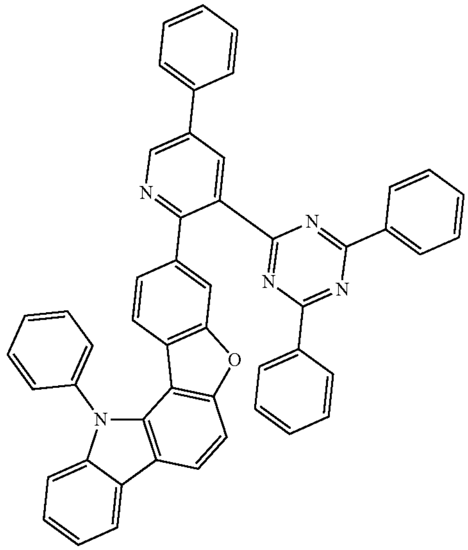
924
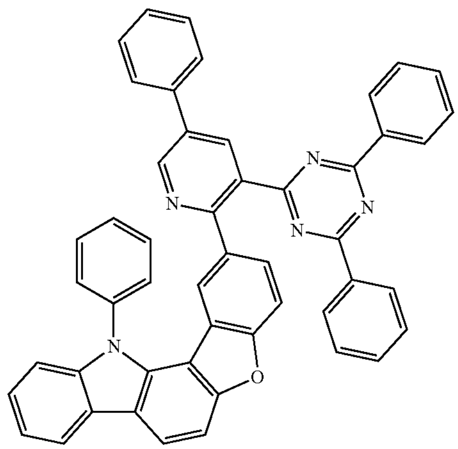
925
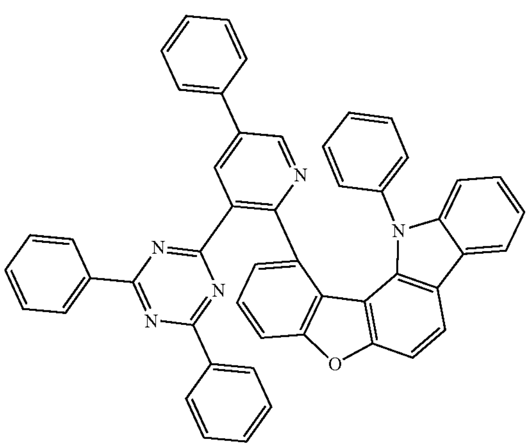
-continued
926
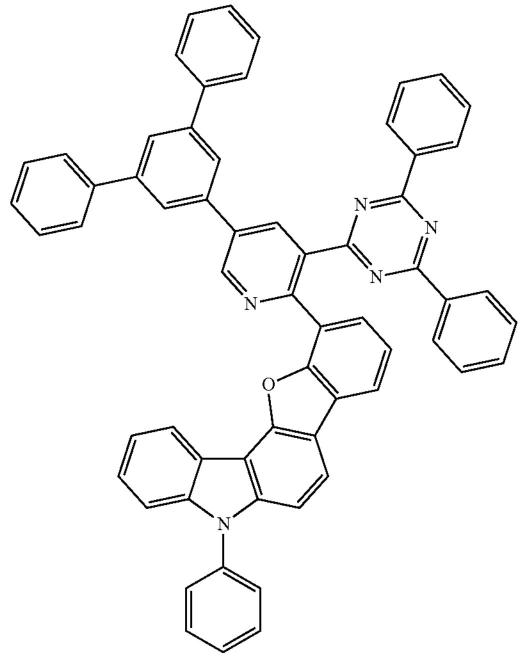
927
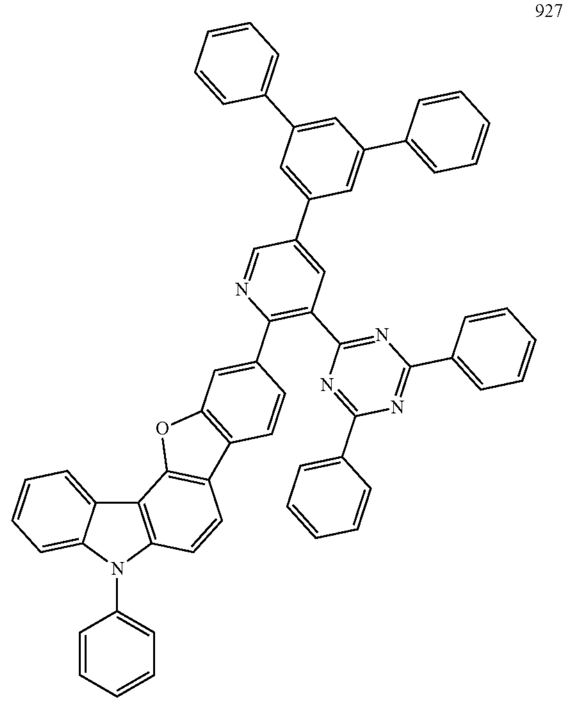

-continued
928
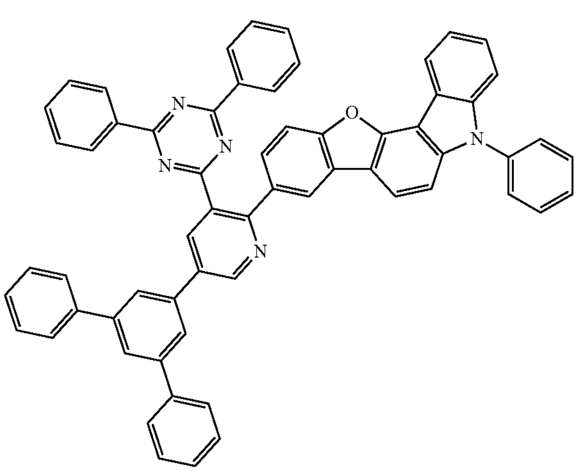
929
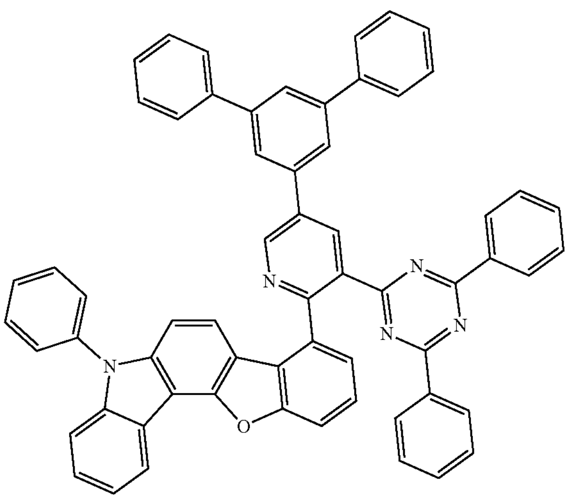
930
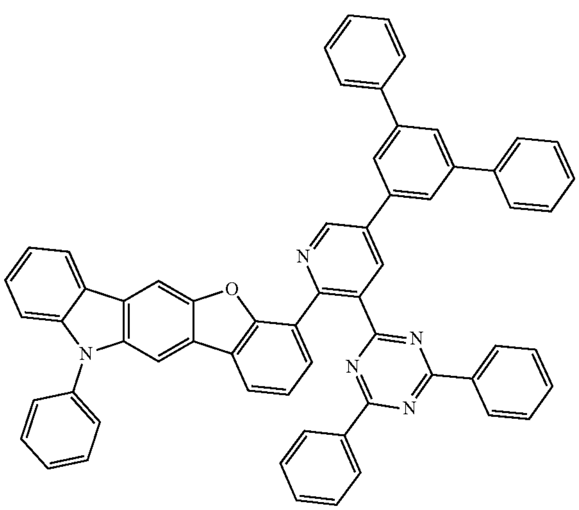
-continued
931
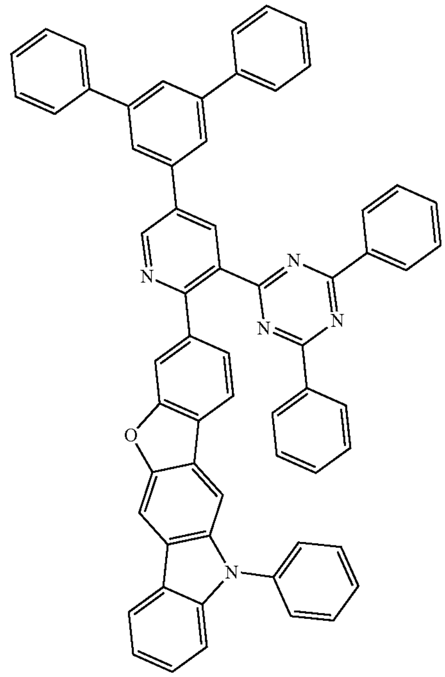
932
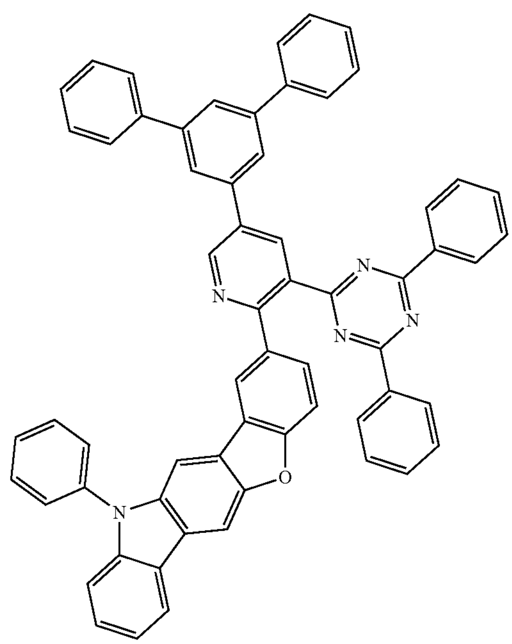

-continued
933
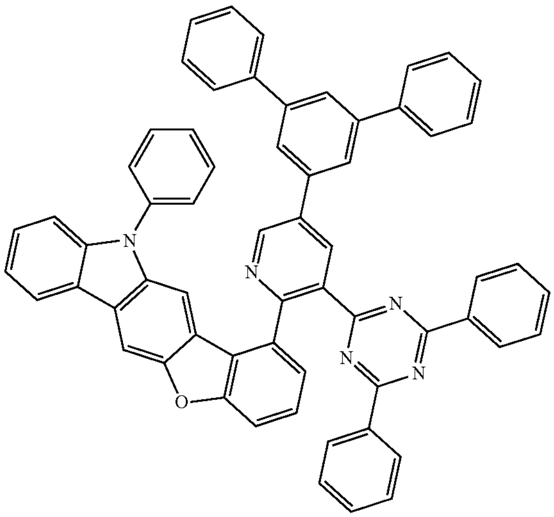
934
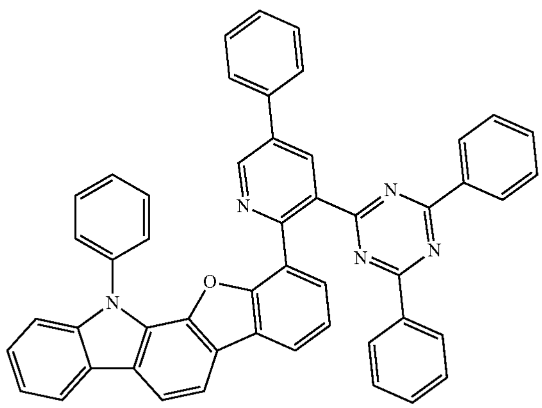
935
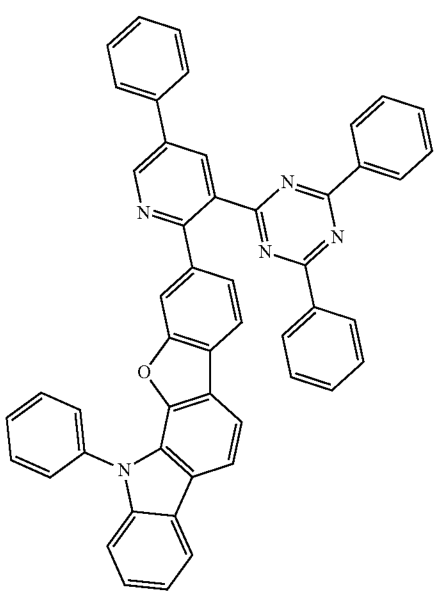
-continued
936
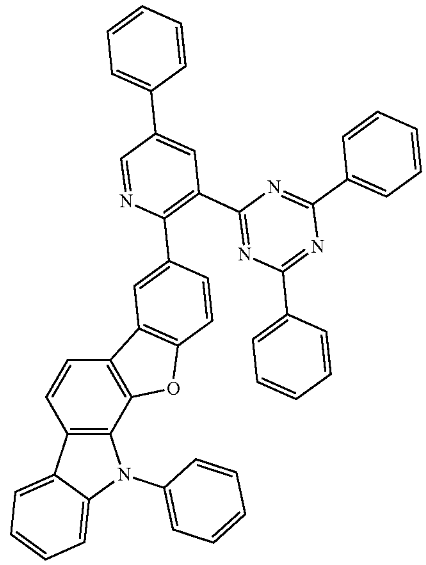
937
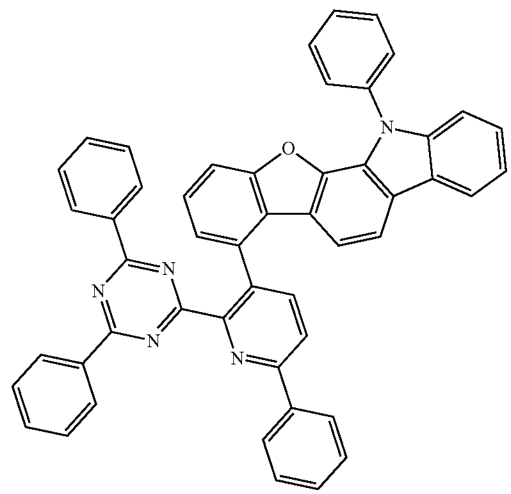
938
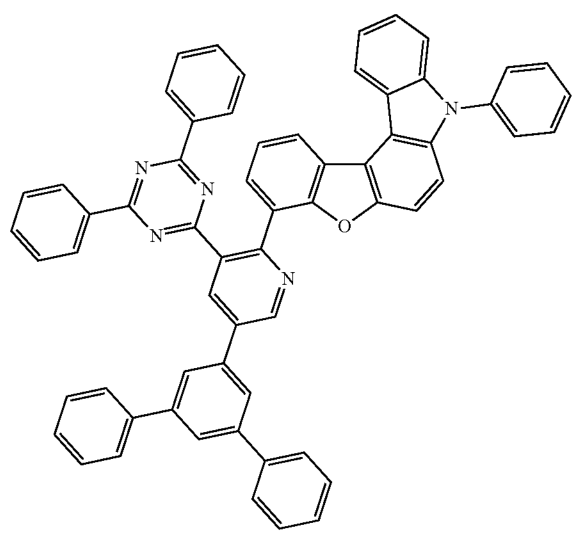

-continued
939
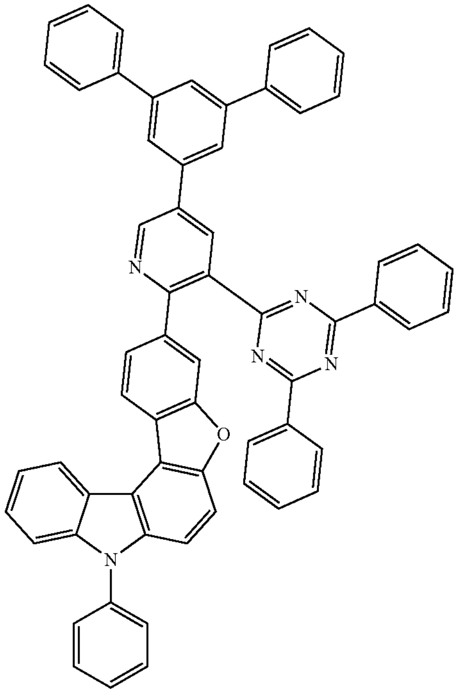
940
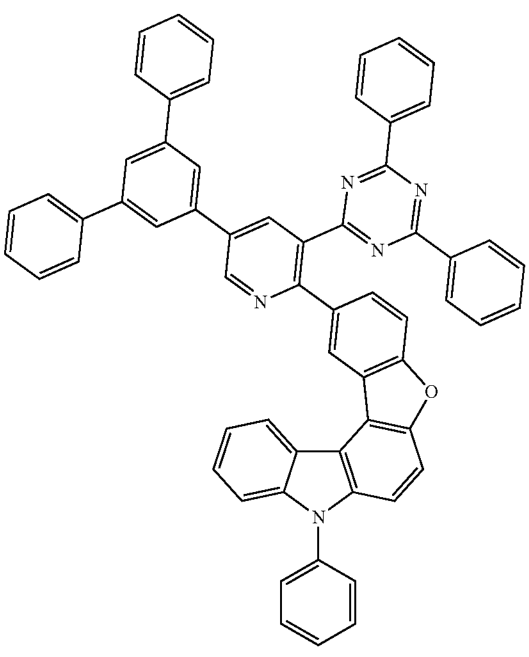
-continued
941
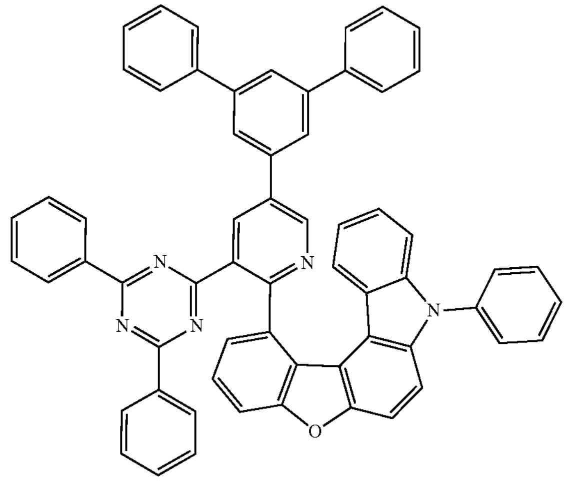
942
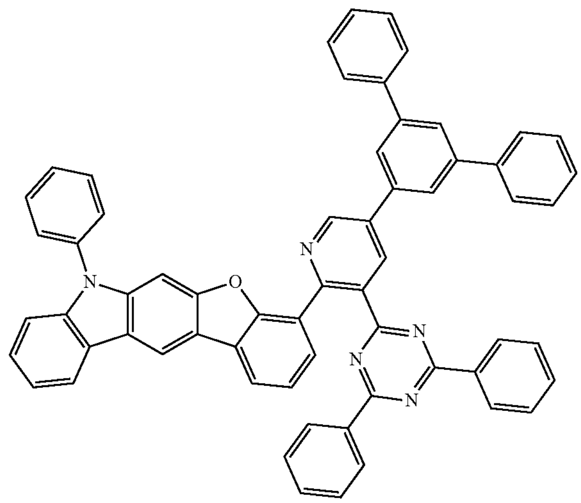
943
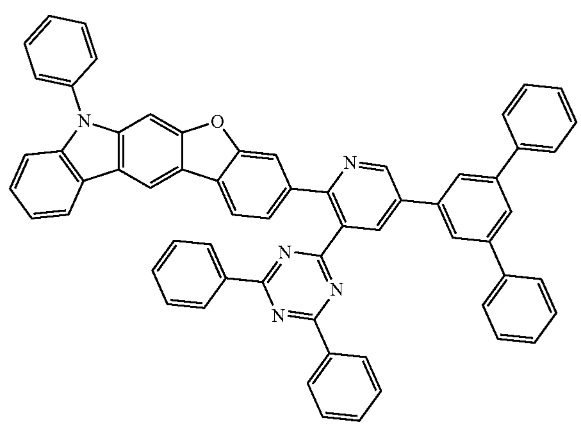

-continued
944
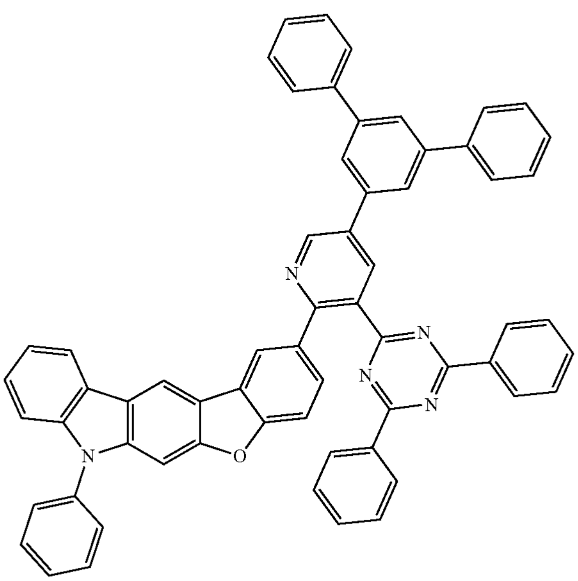
945
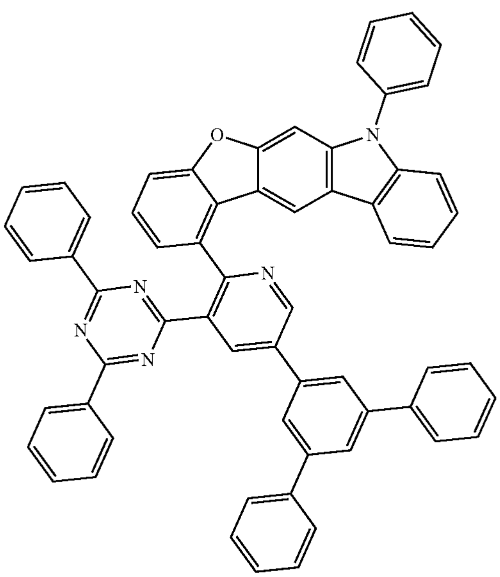
-continued
946
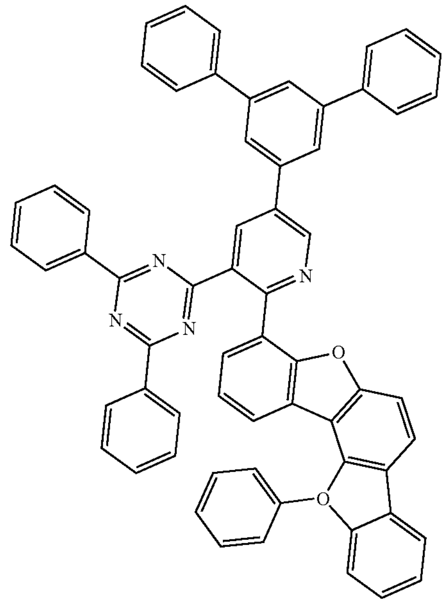
947
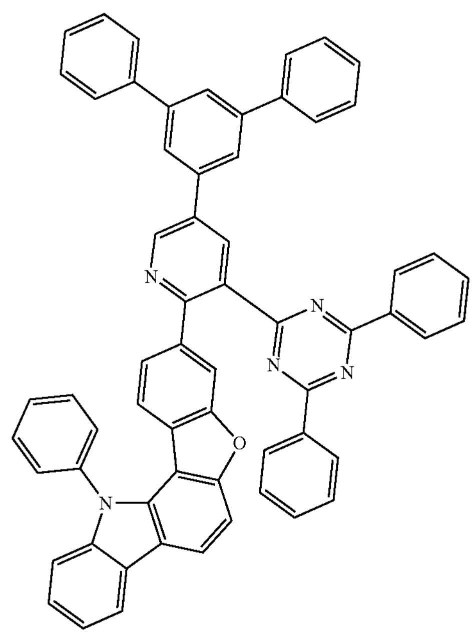

-continued
948
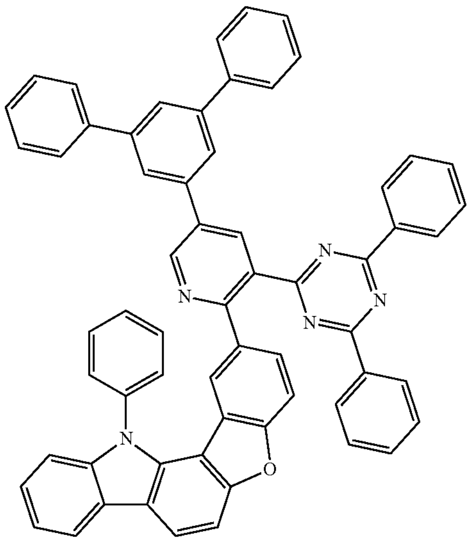
949
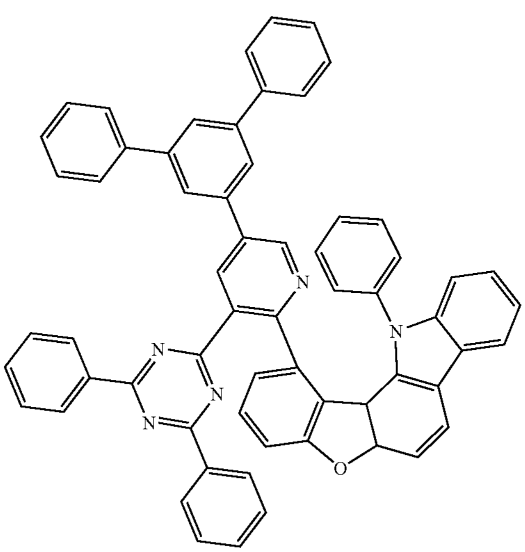
-continued
950
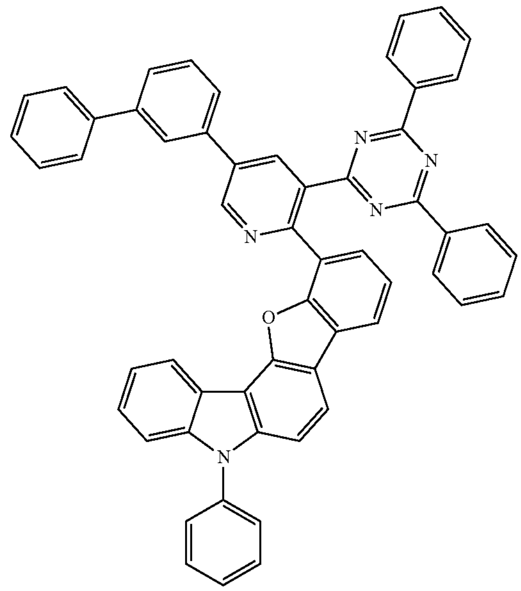
951
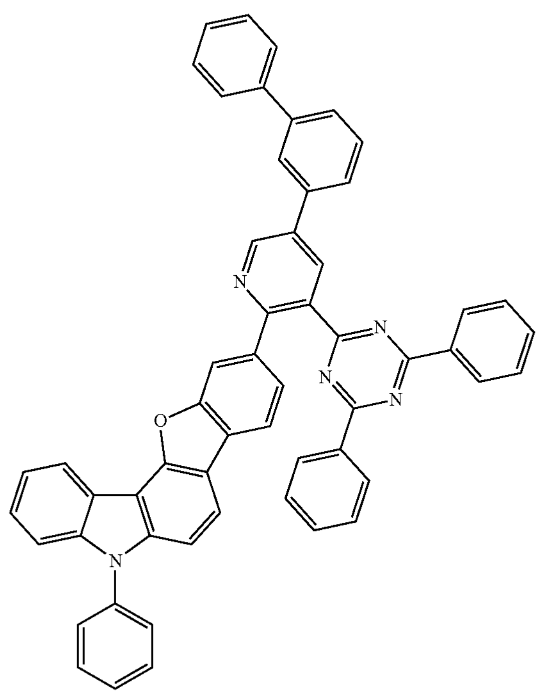

-continued
952
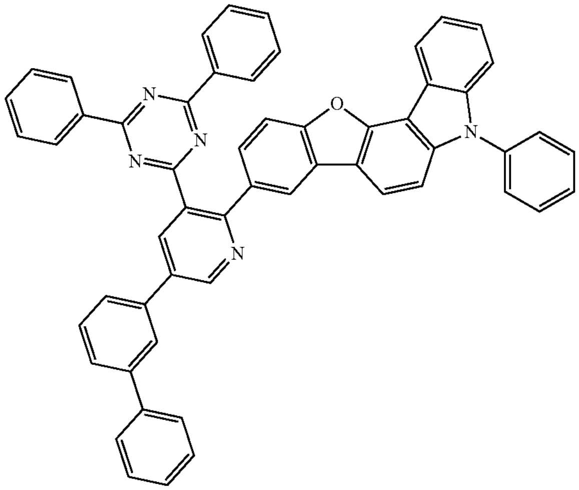
953
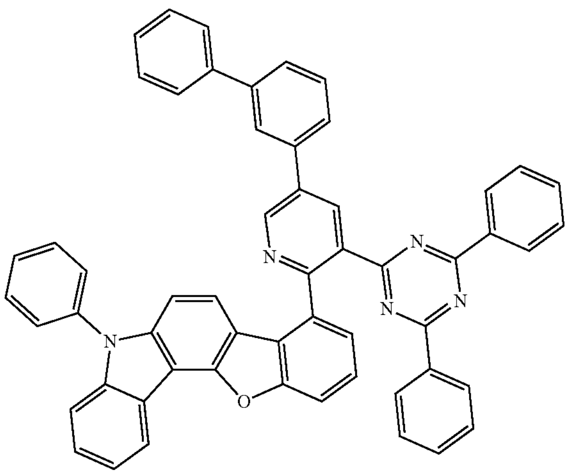
954
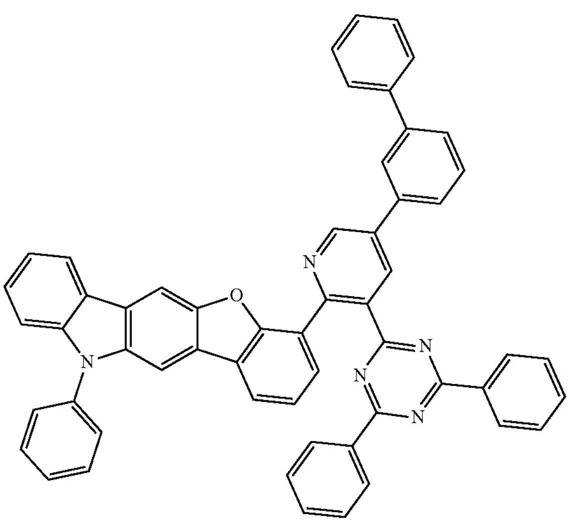
-continued
955
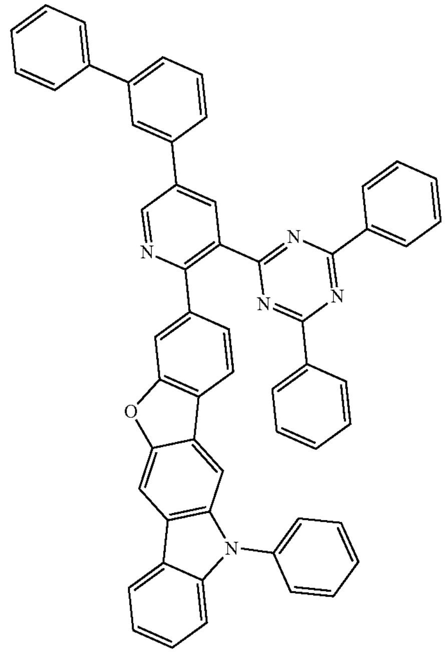
956
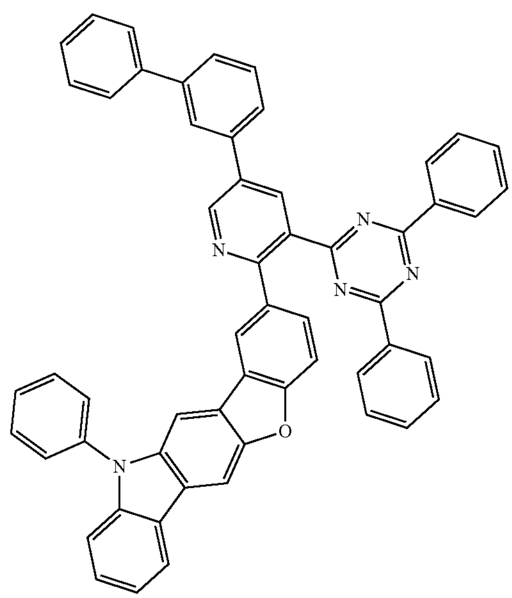

-continued
957
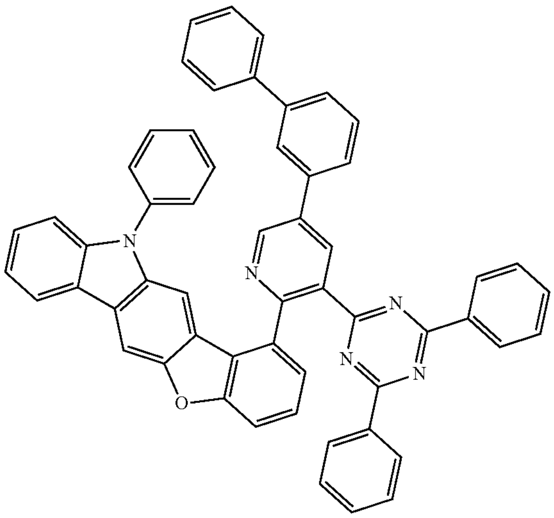
958
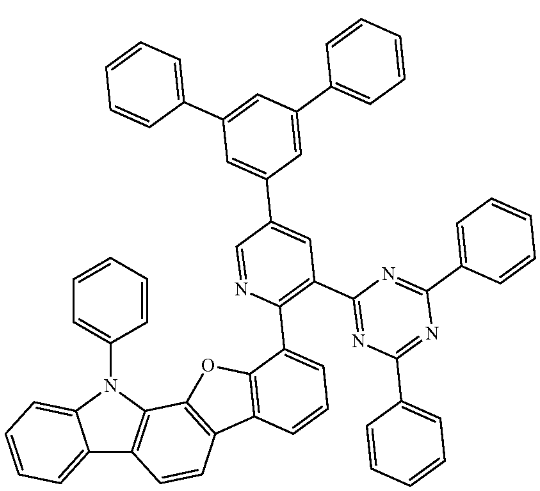
-continued
959
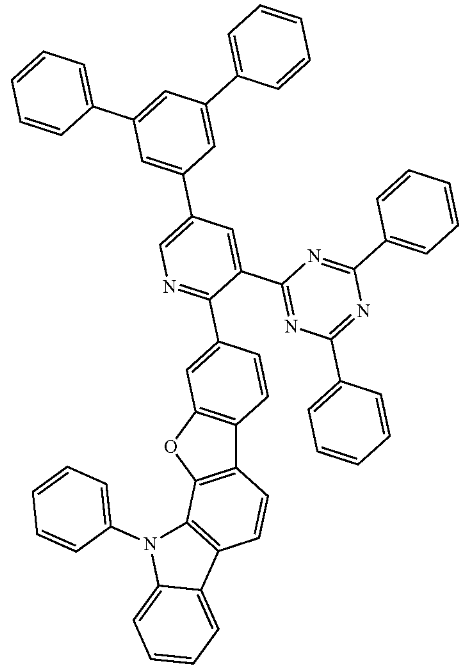
960
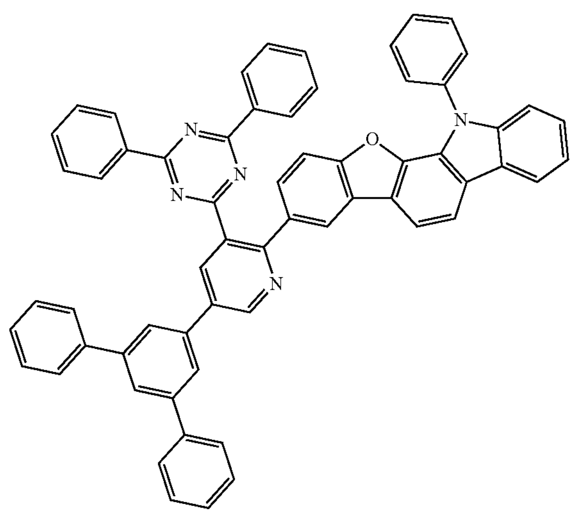

-continued
961
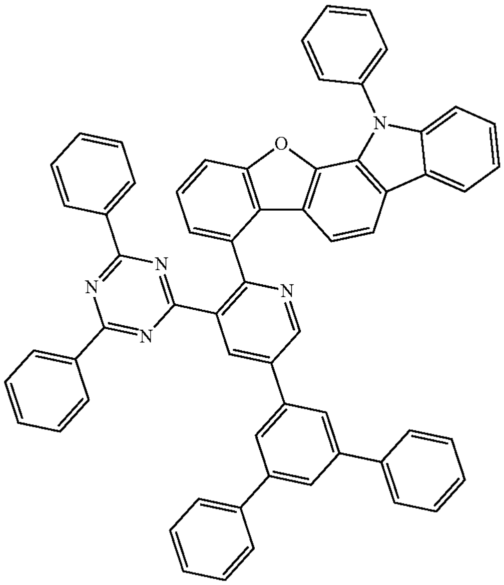
962
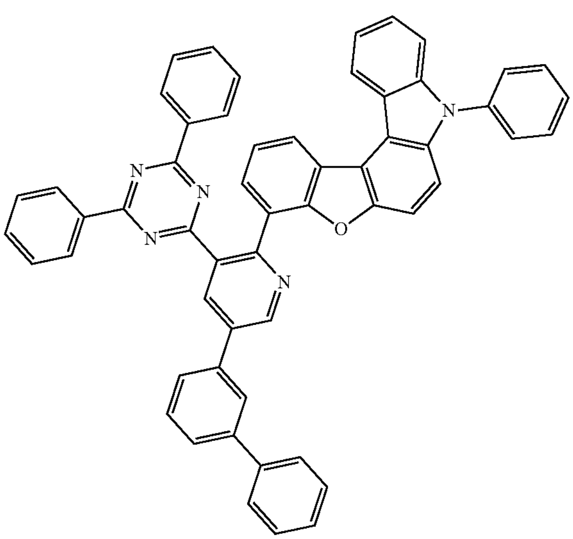
-continued
963
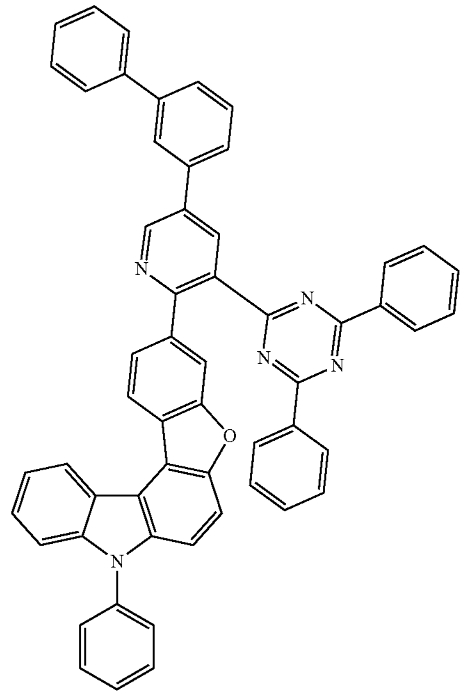
964
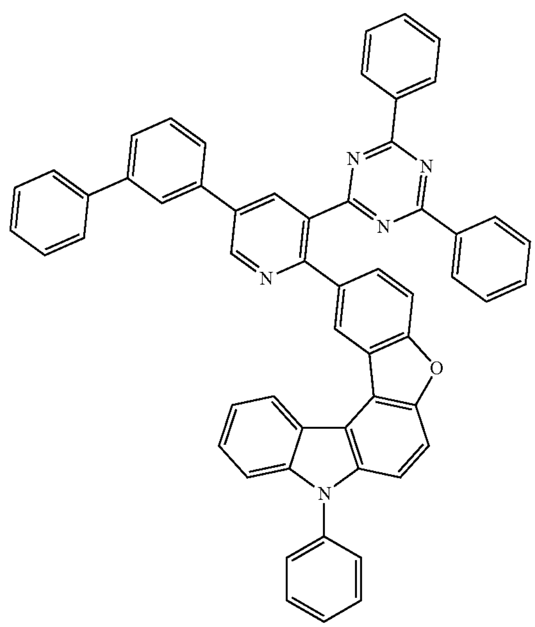

-continued
965
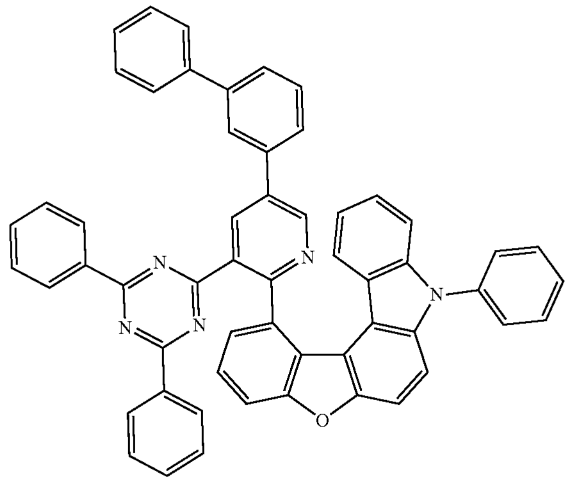
966
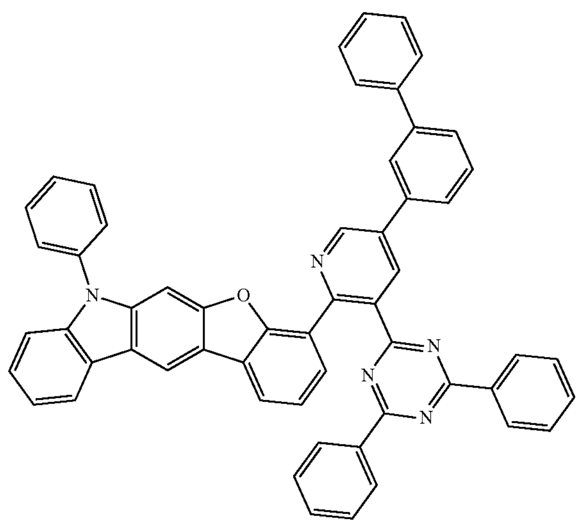
967
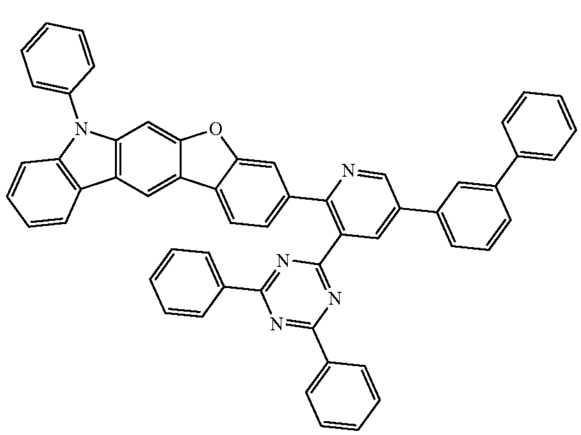
-continued
968
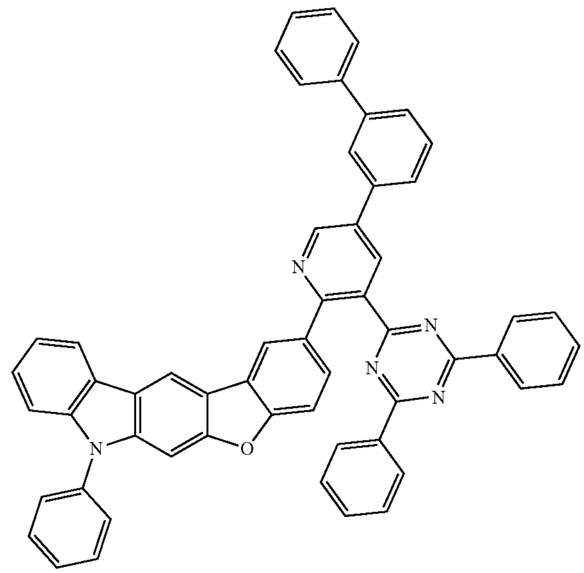
969
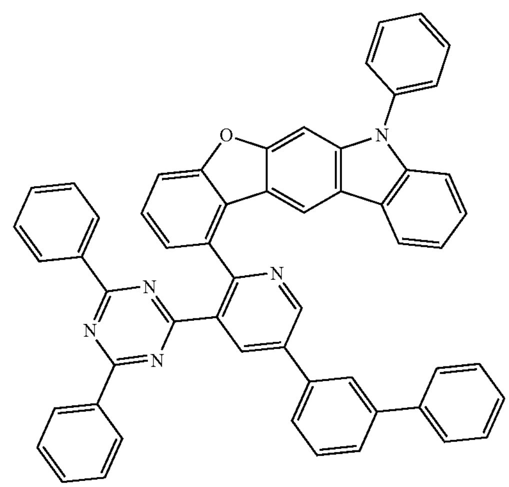
970
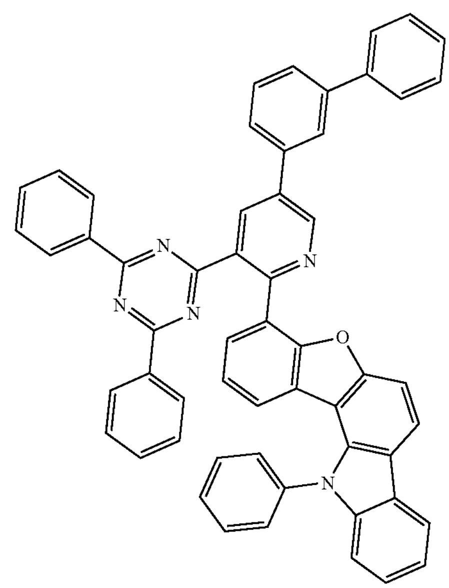

971
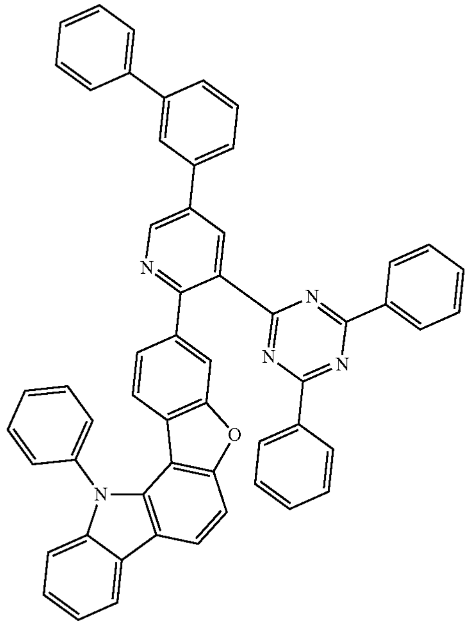
972
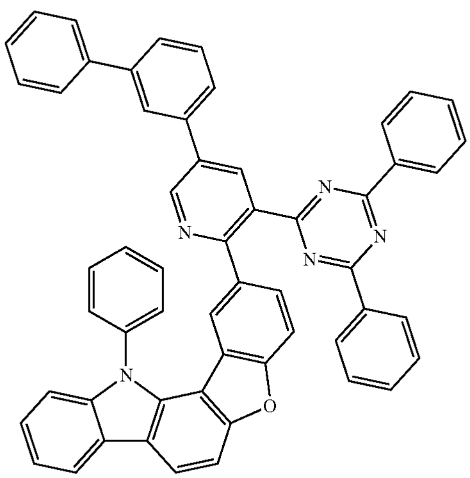
973
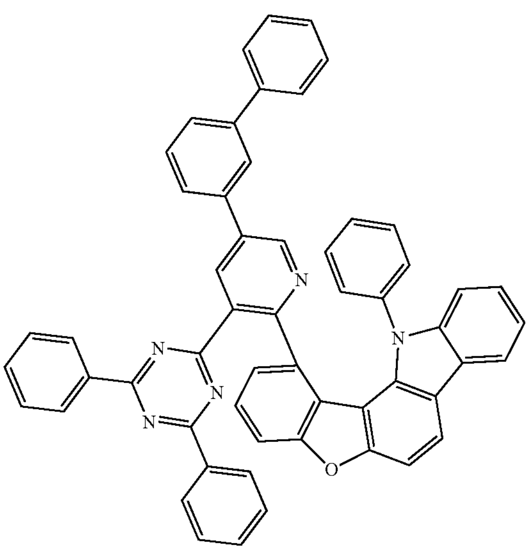
974
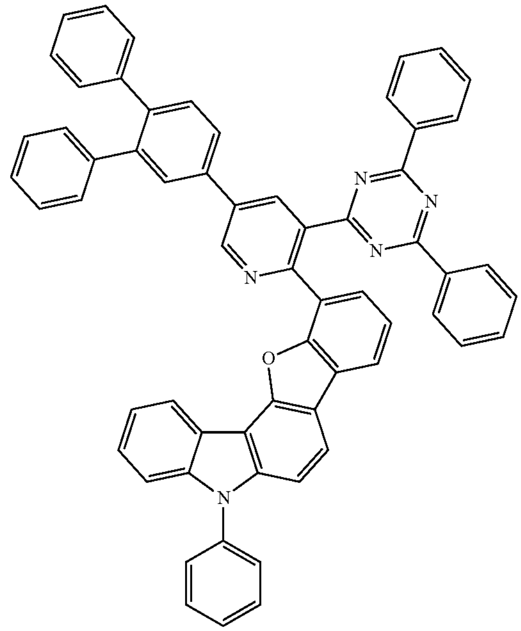
975
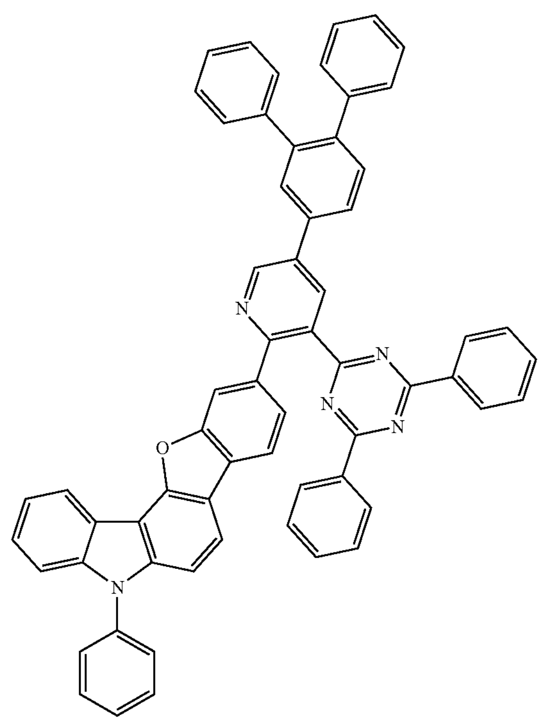

976
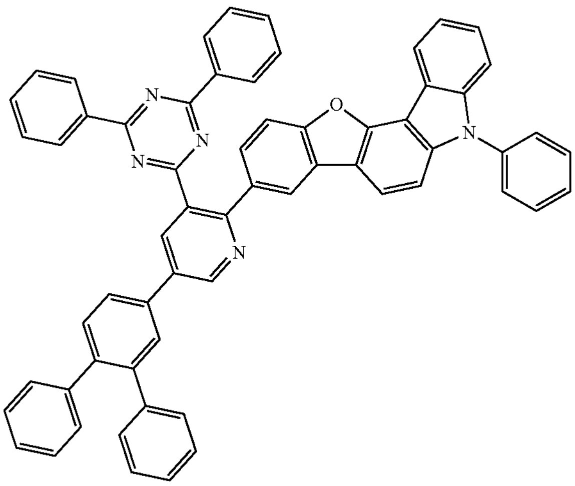
977
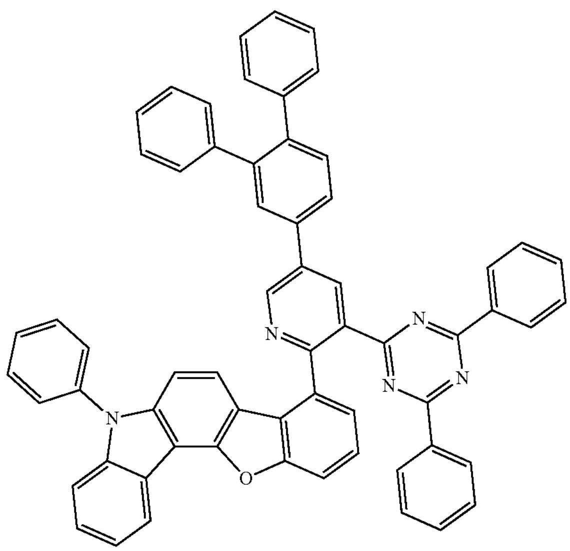
978
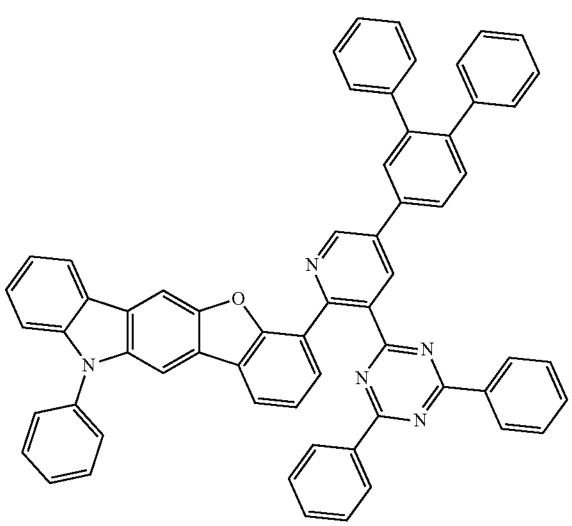
979
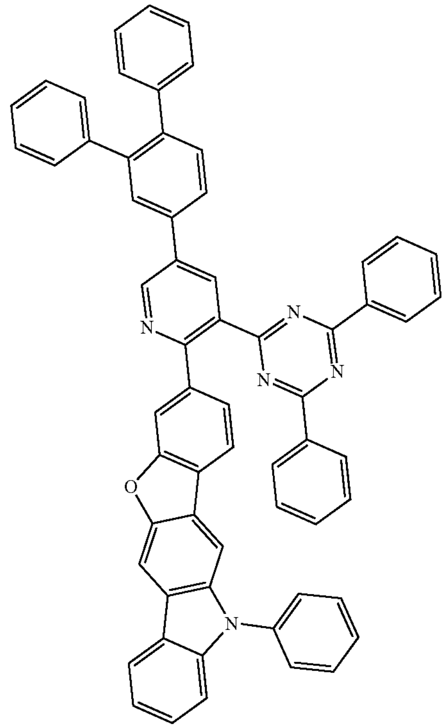
980
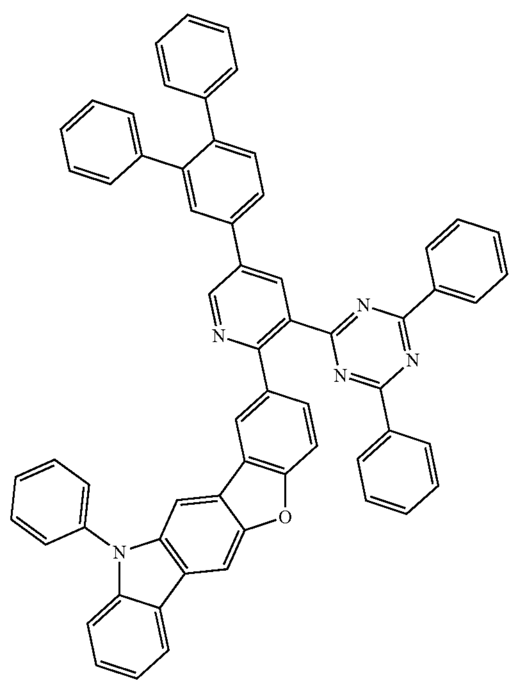

-continued
981
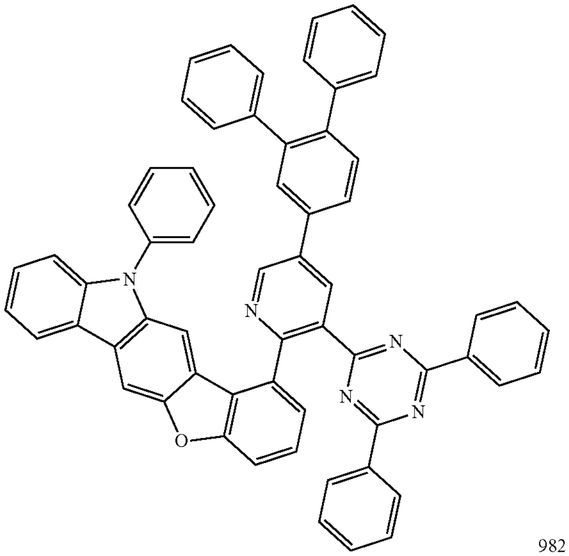
982
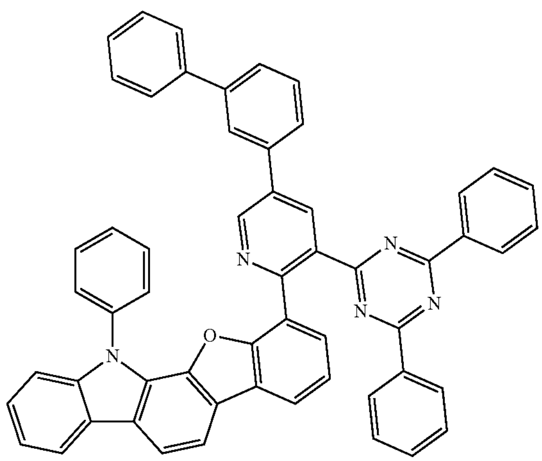
983
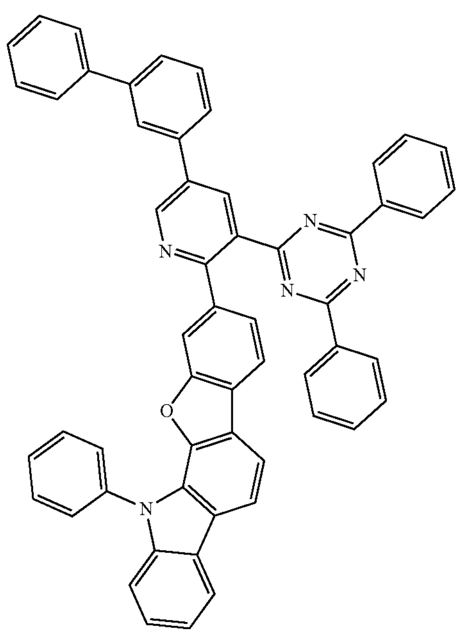
-continued
984
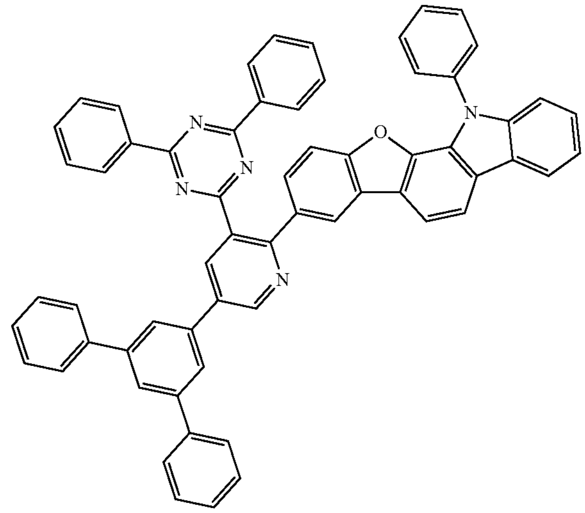
985
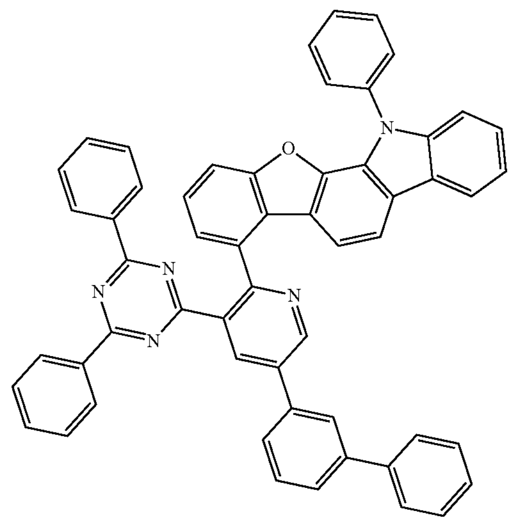
986
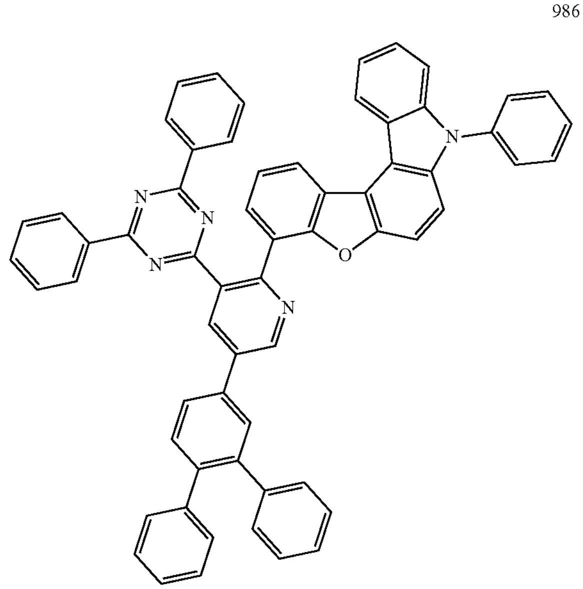

987
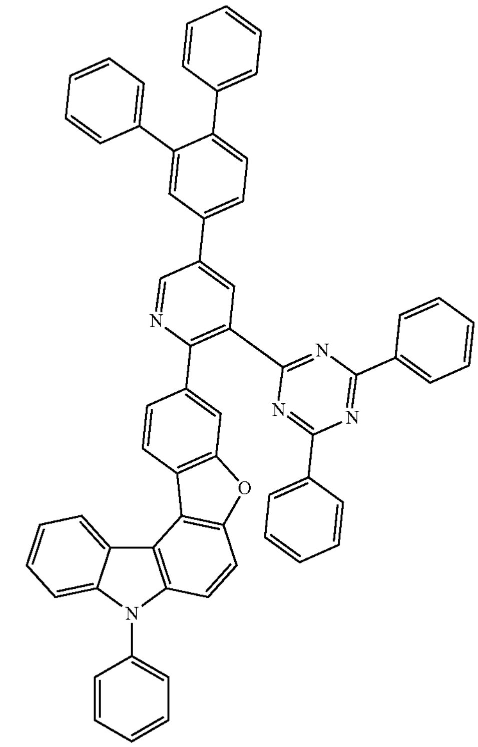
988
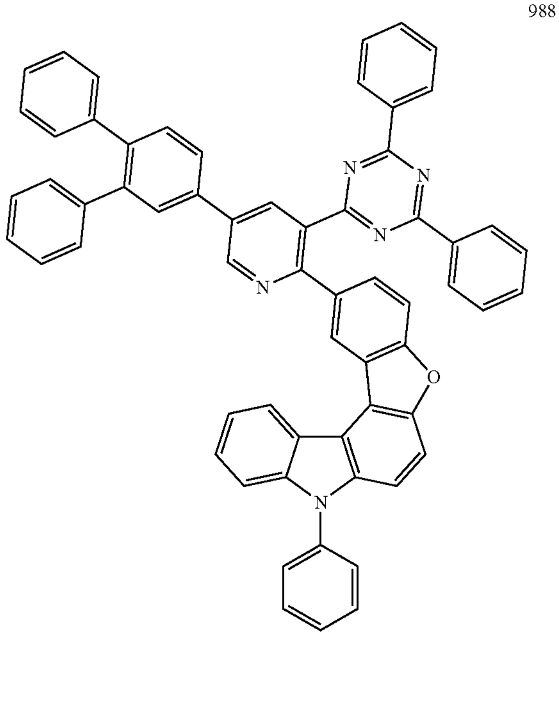
989
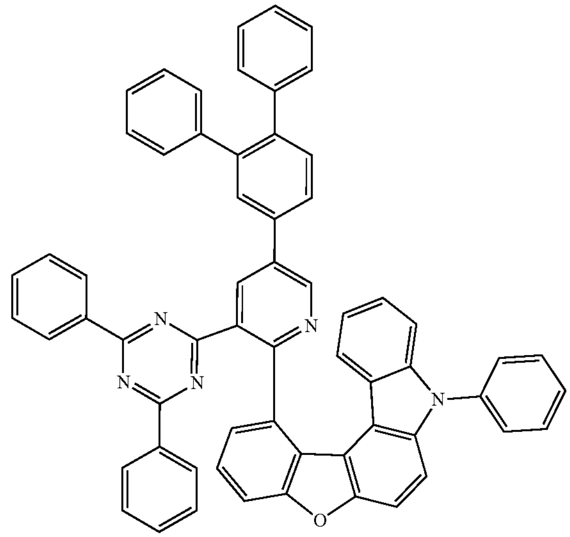
990
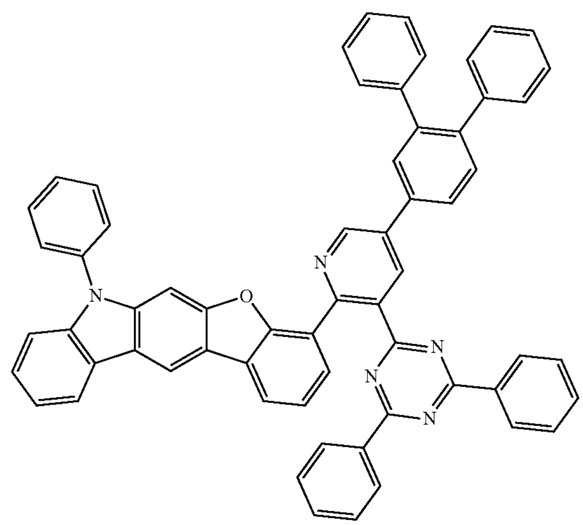
991
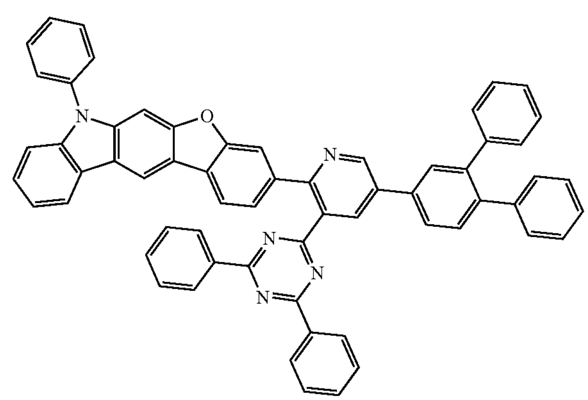

992
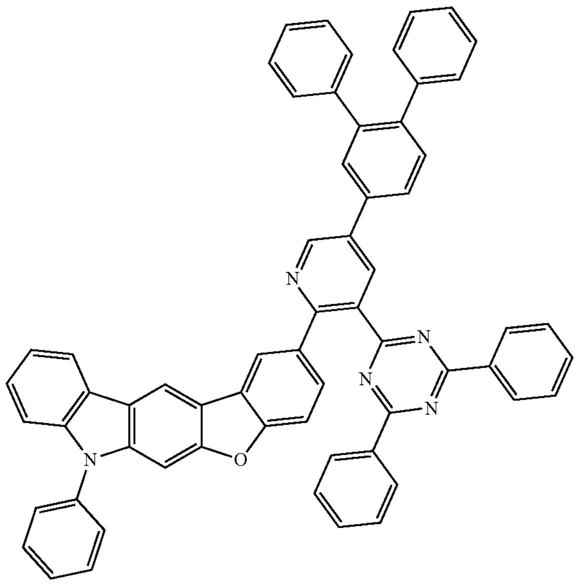
993
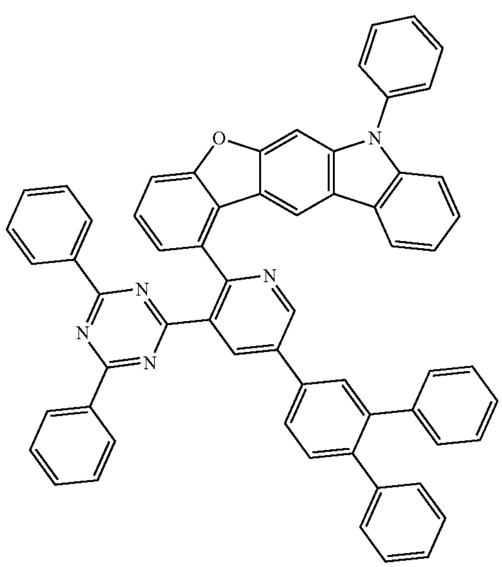
994
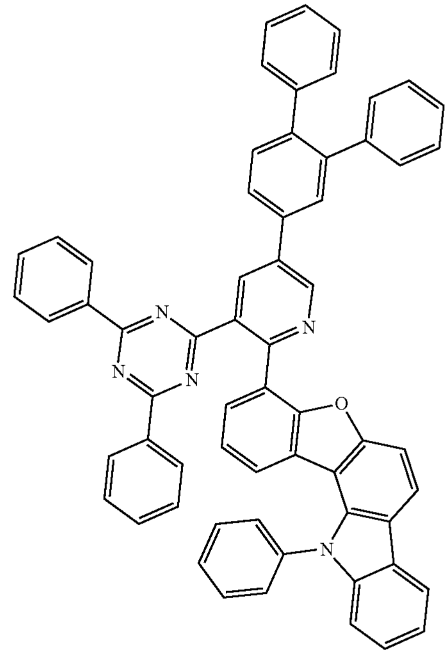
995
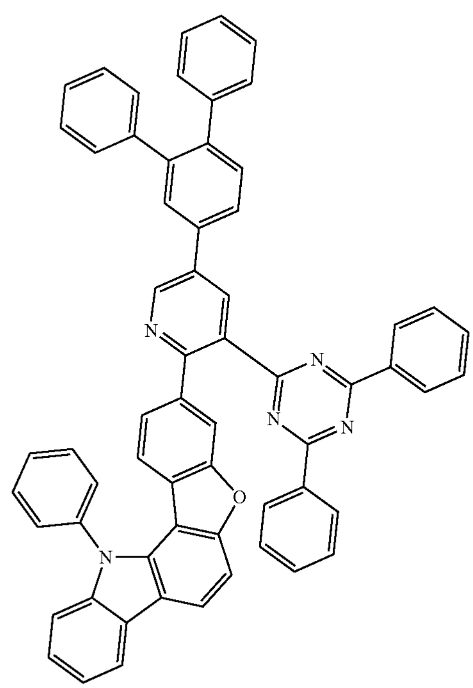

-continued
996
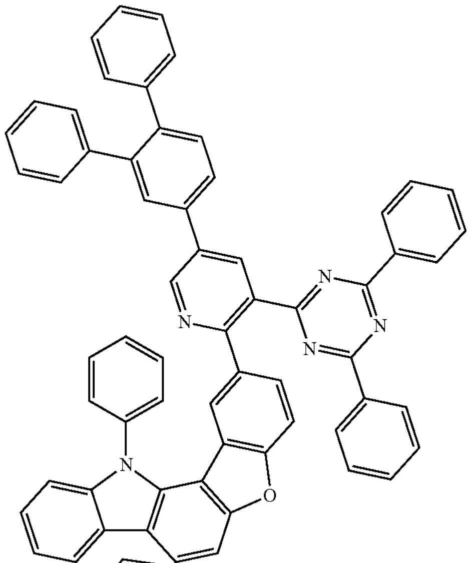
997
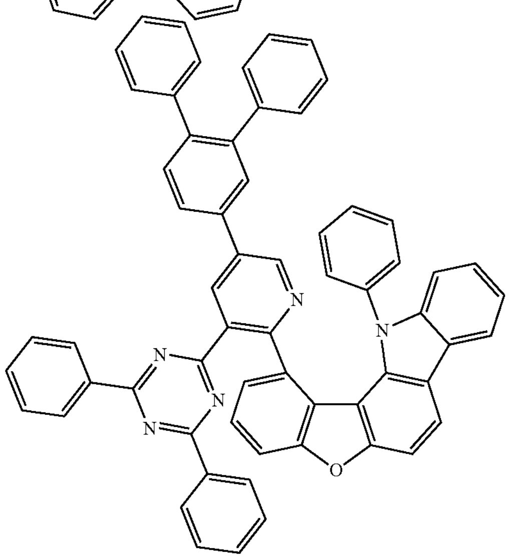
998
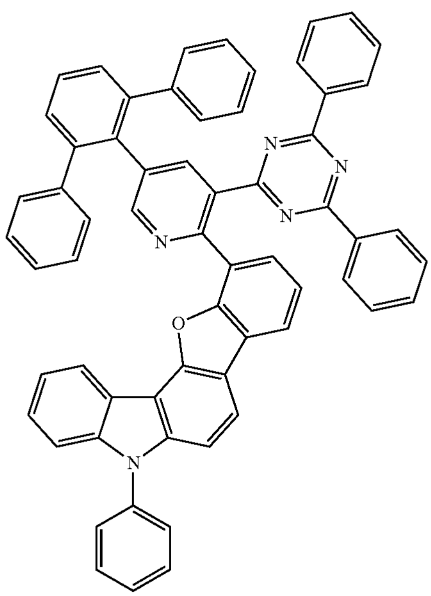
-continued
999
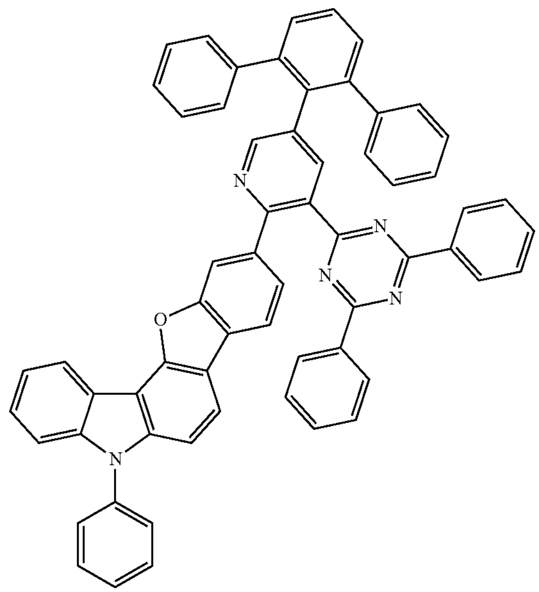
1000
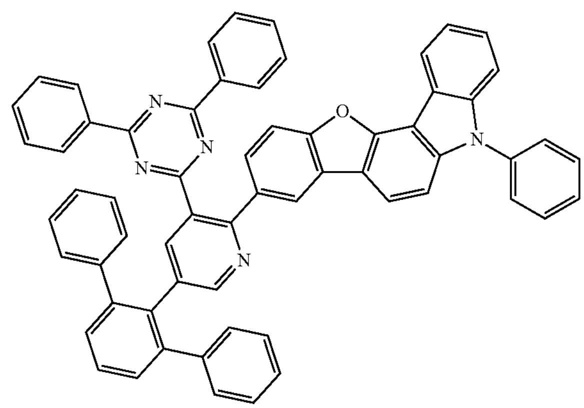
1001
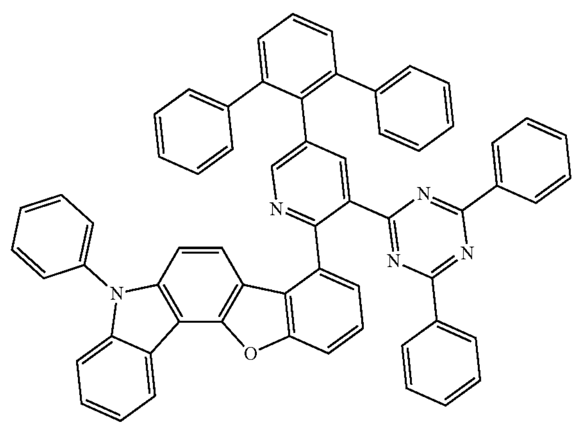

-continued
1002
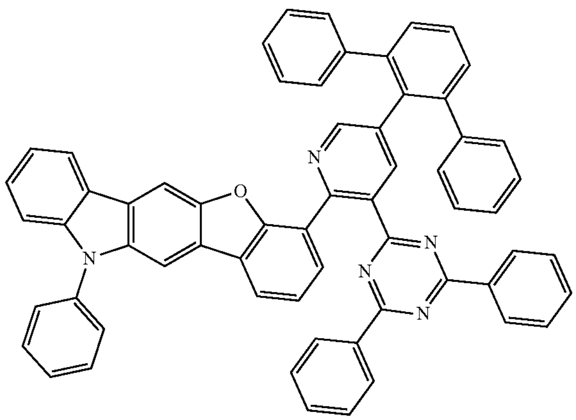
1003
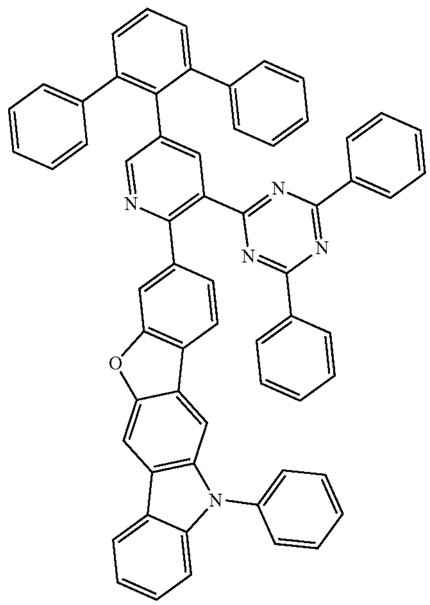
1004
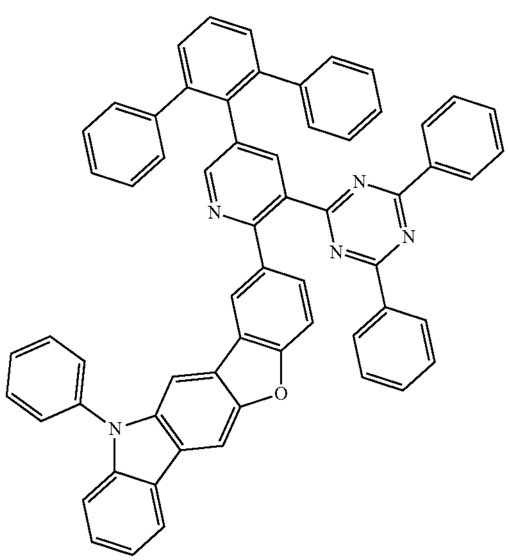
-continued
1005
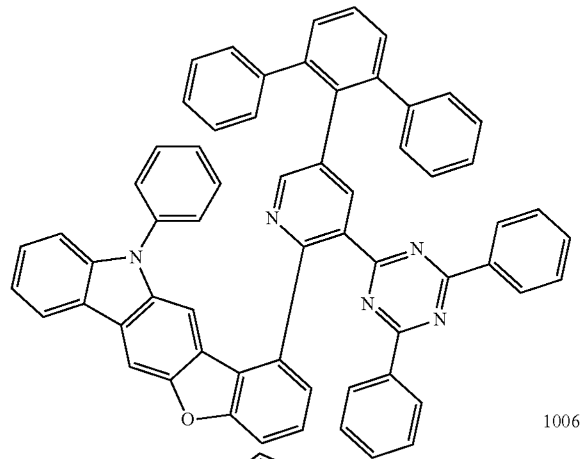
1006
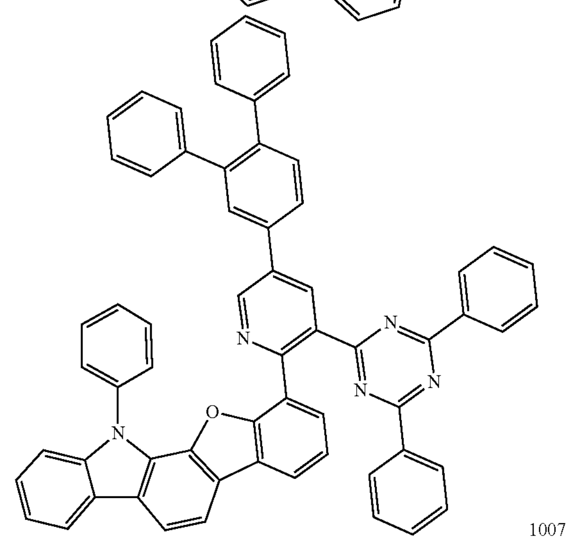
1007
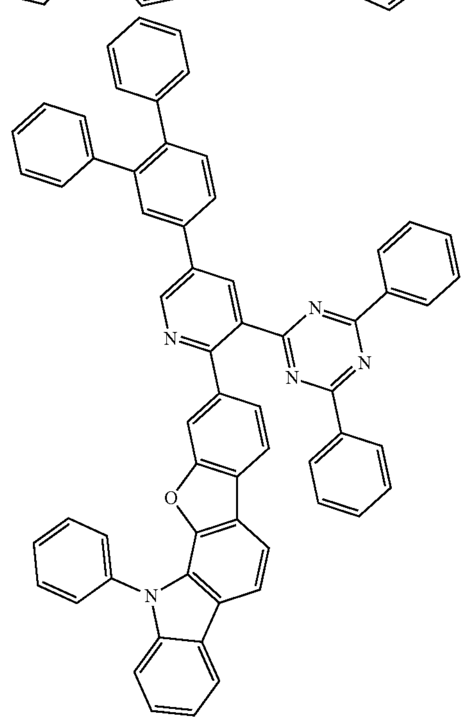

1008
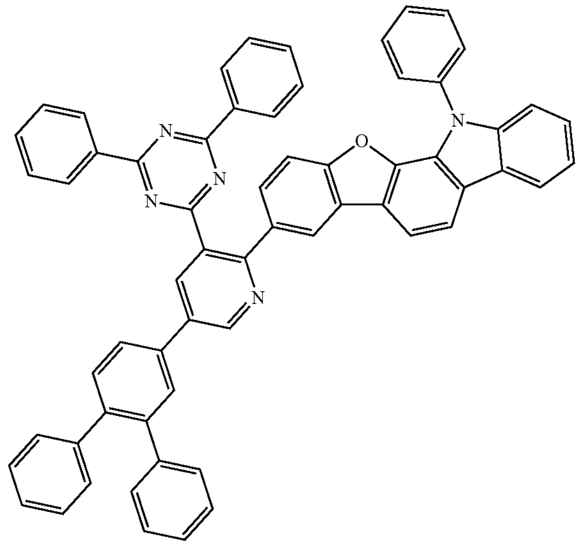
1009
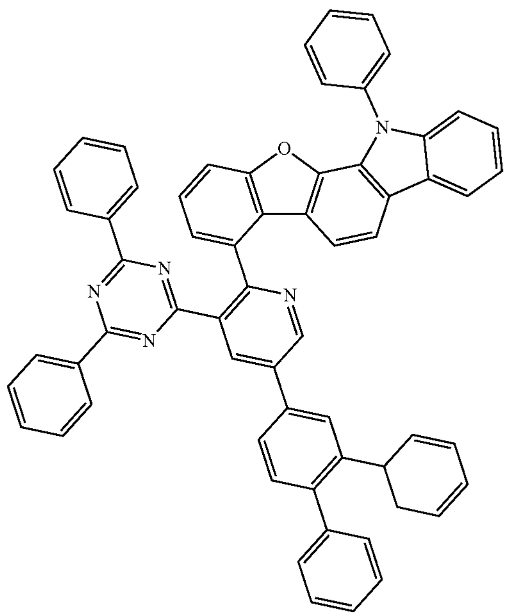
1010
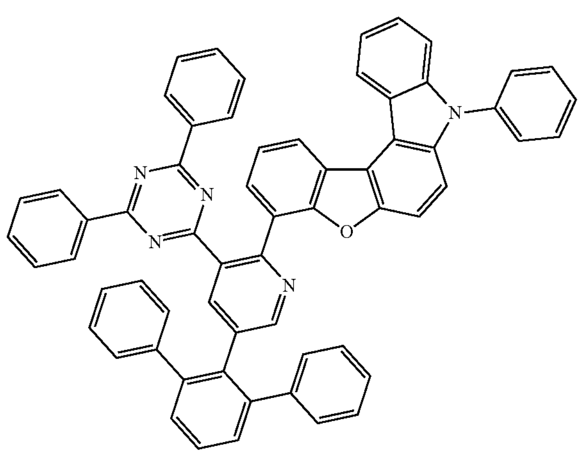
1011
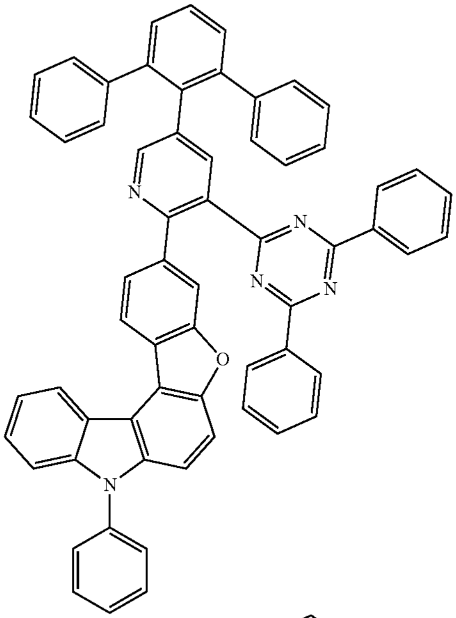
1012
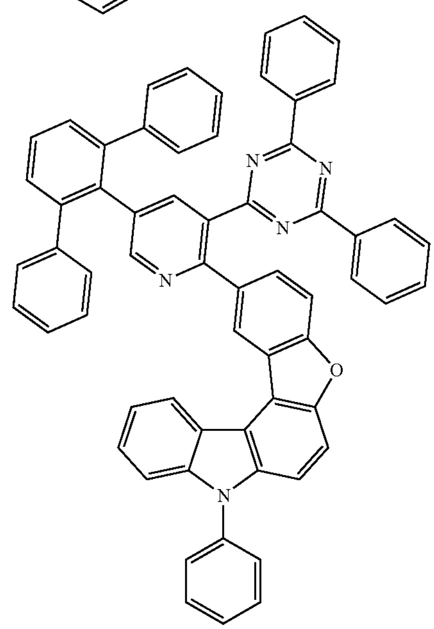
1013
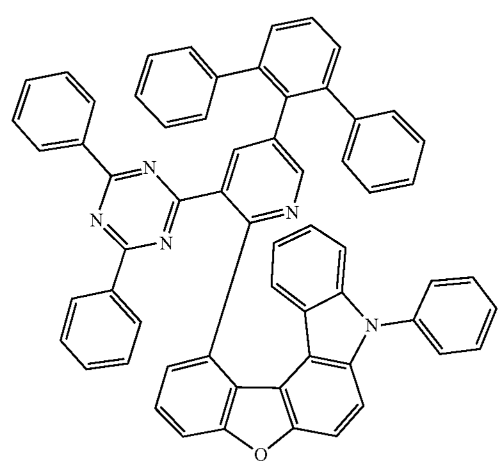

-continued
1014
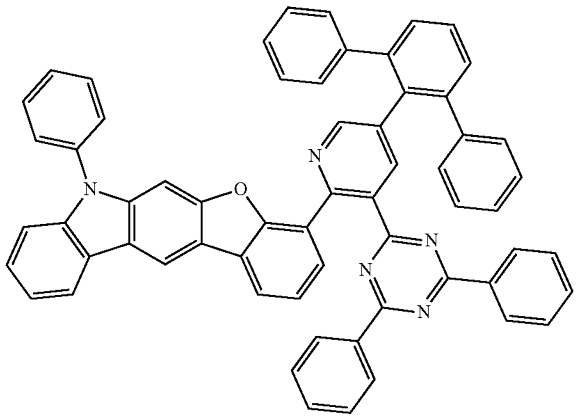
1015
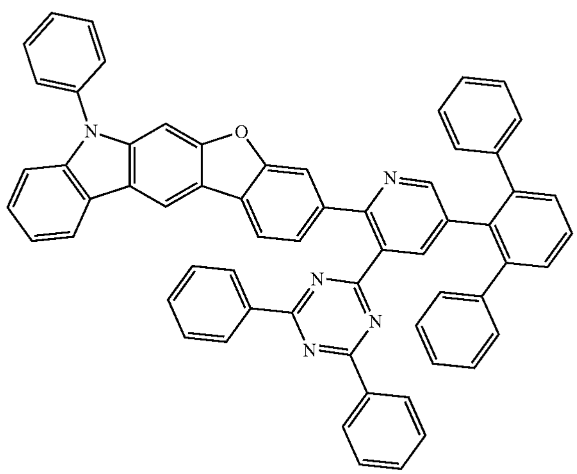
1016
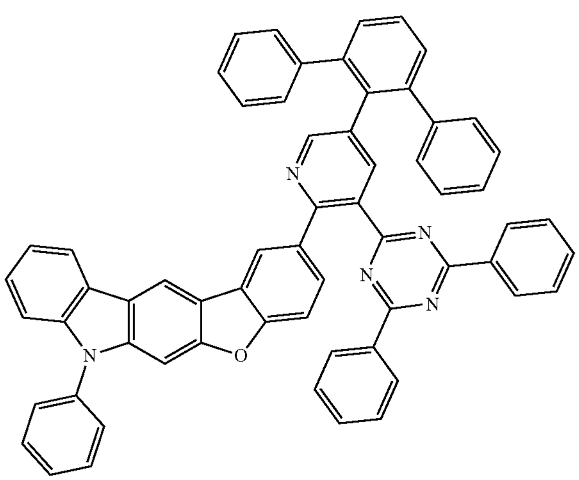
-continued
1017
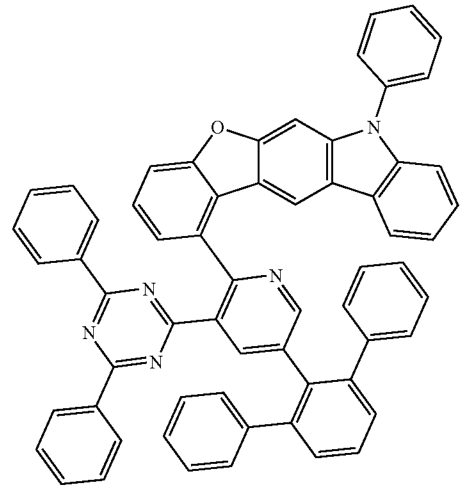
1018
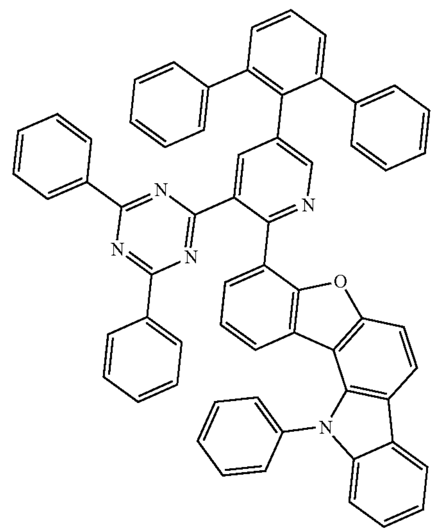
1019
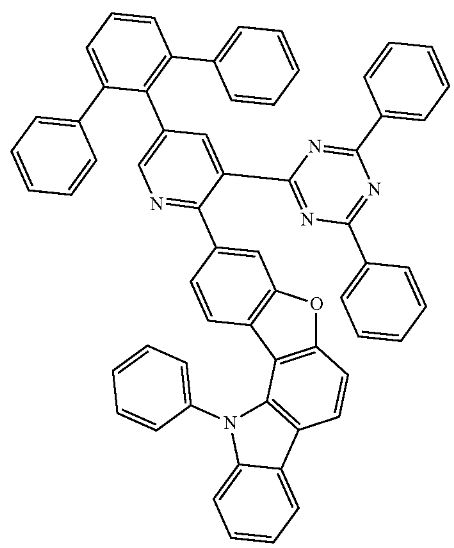

-continued
1020
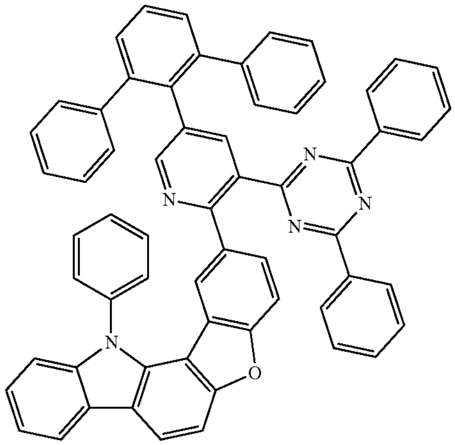
1021
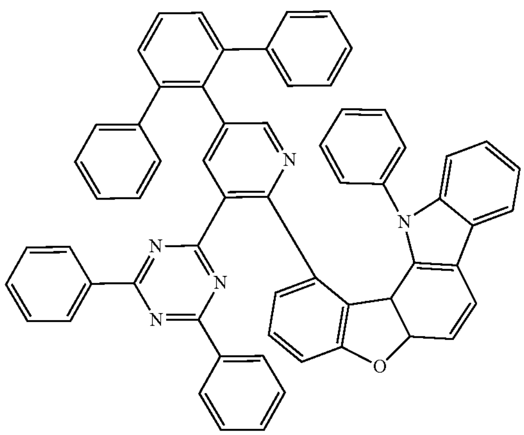
1022
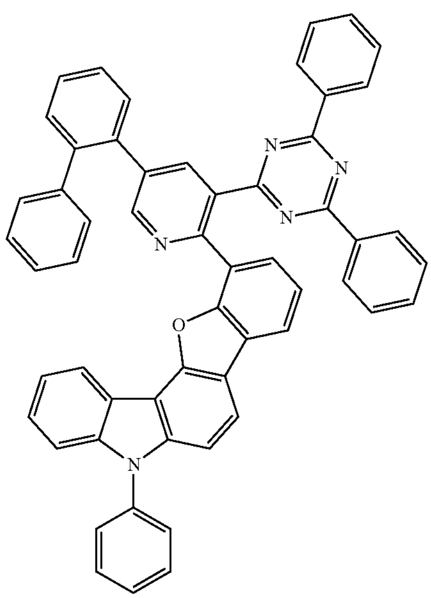
-continued
1023
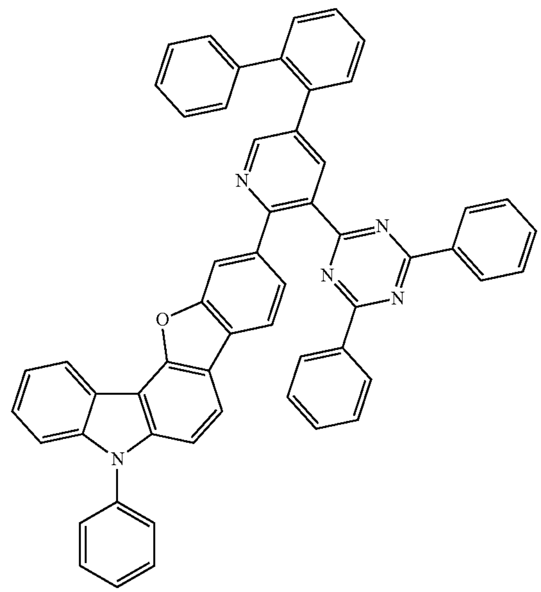
1024
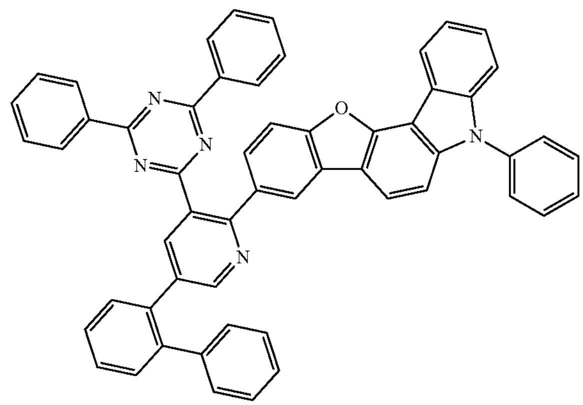
1025
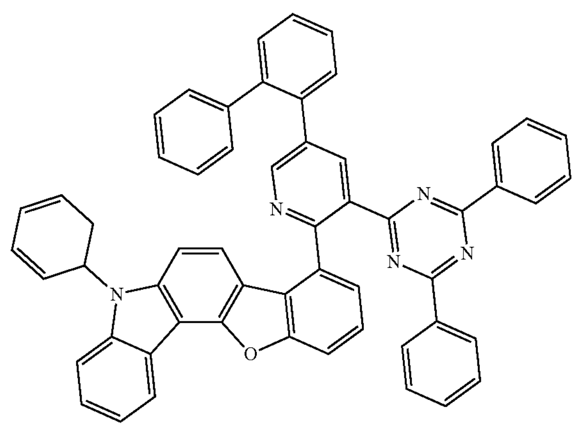

1026
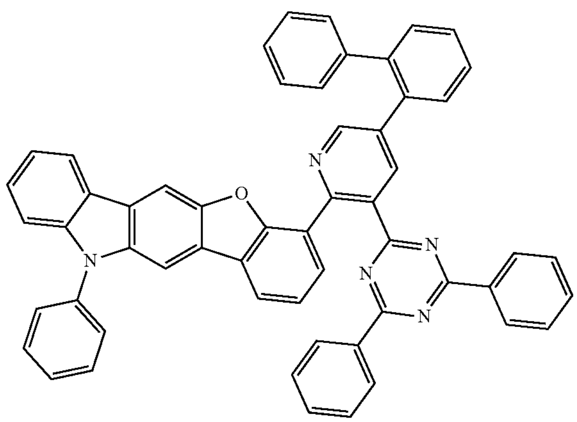
1027
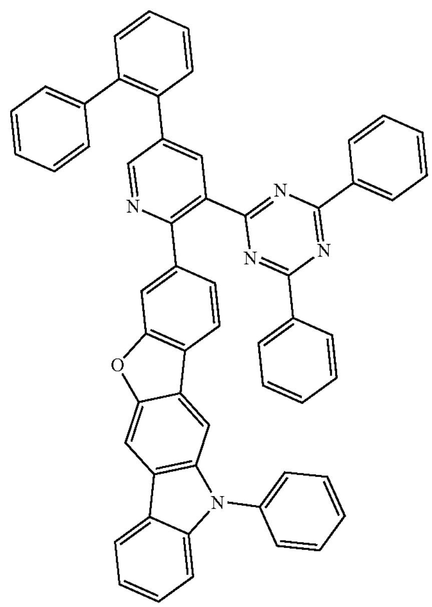
1028
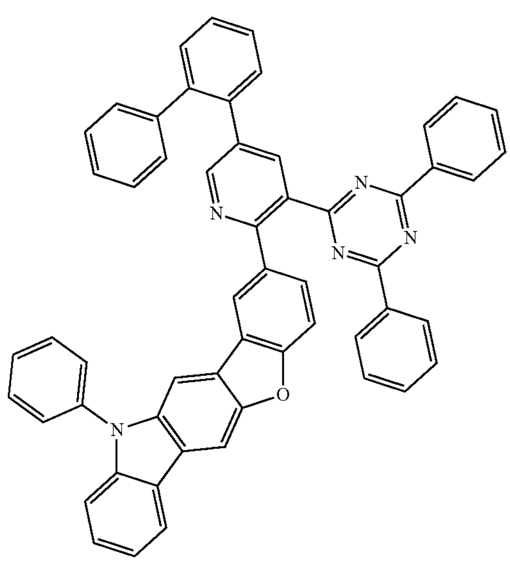
1029
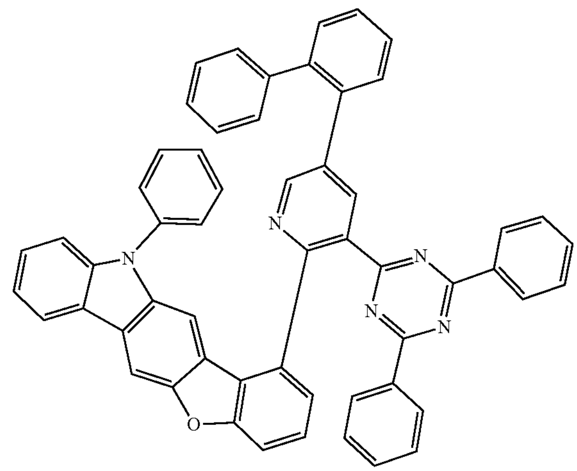
1030
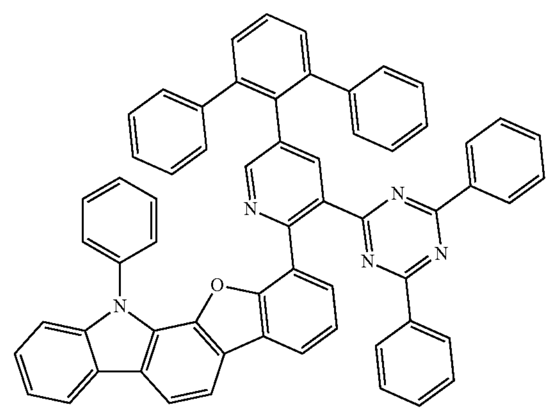
1031
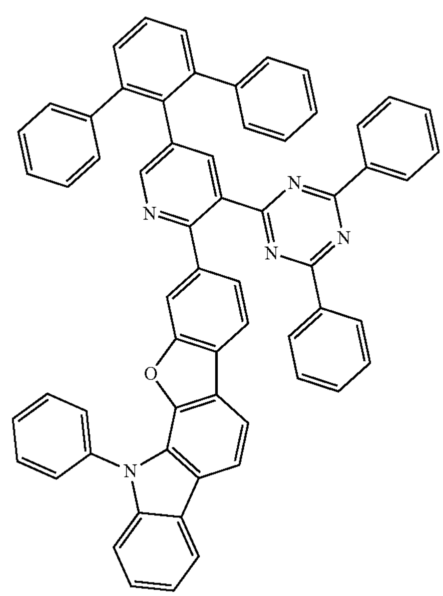

-continued
1032
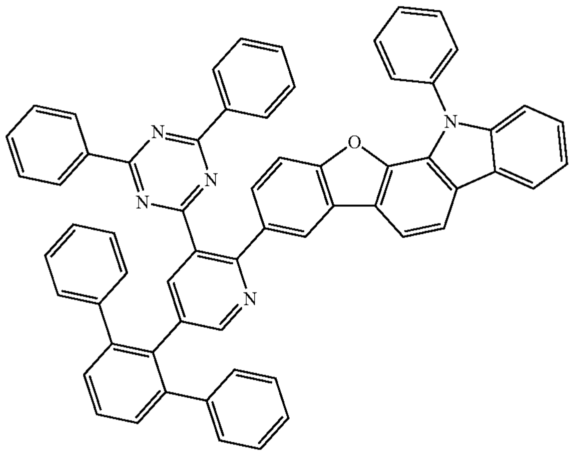
1033
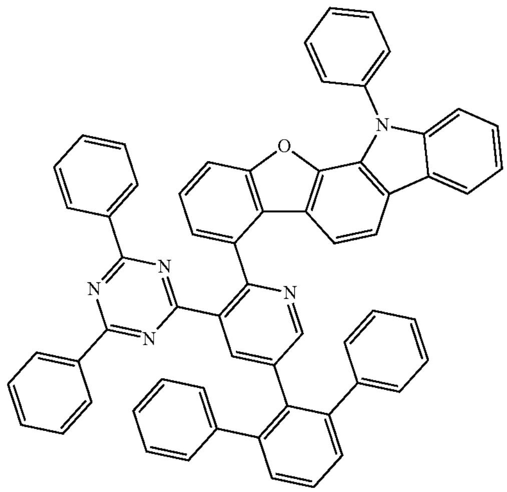
1034
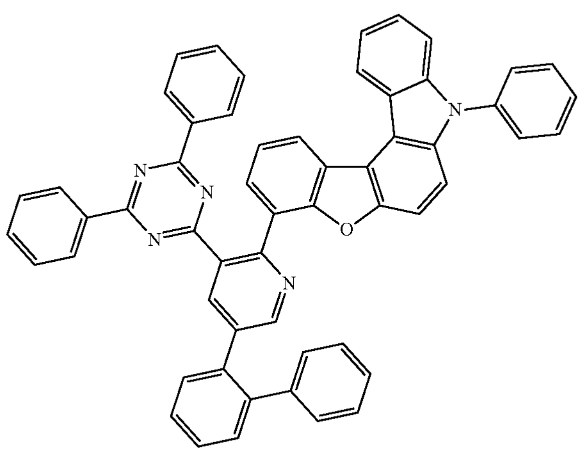
-continued
1035
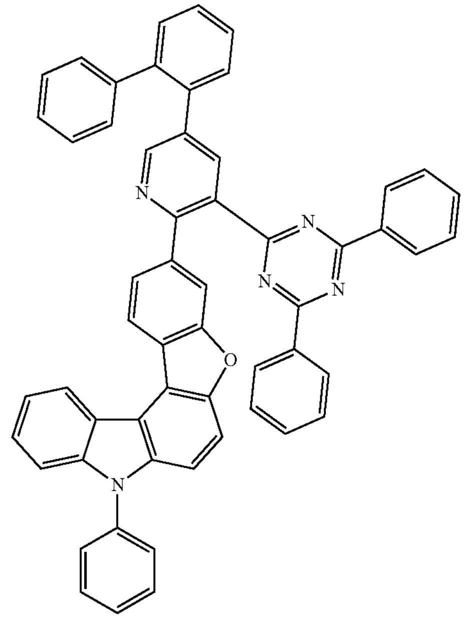
1036
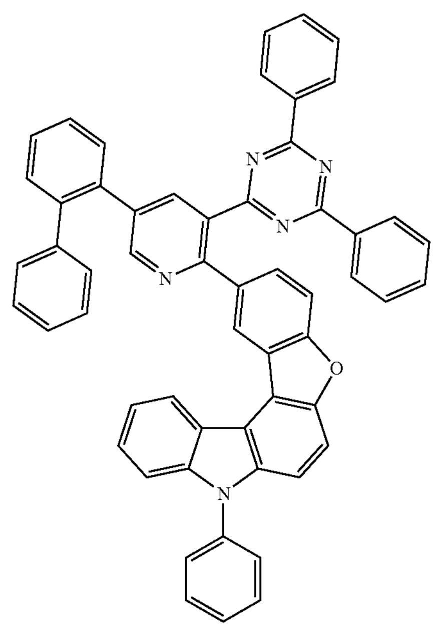

-continued
1037
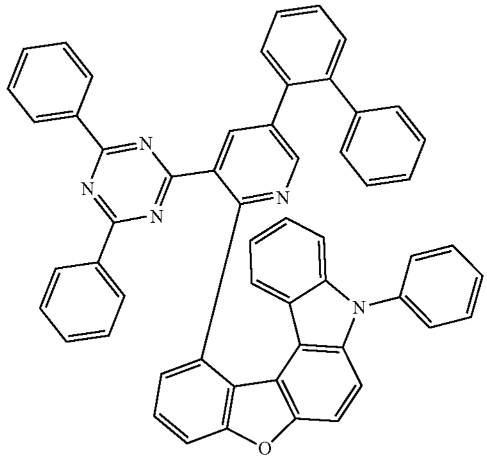
1038
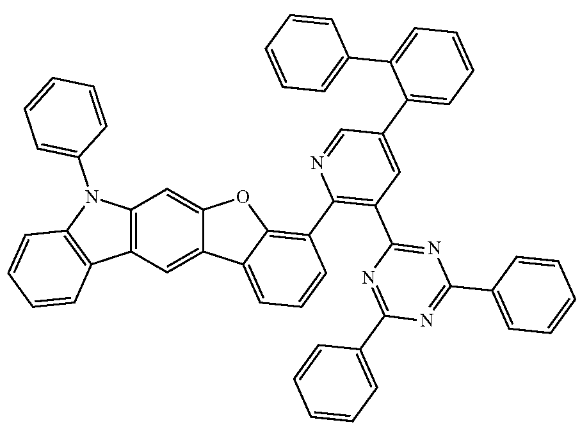
1039
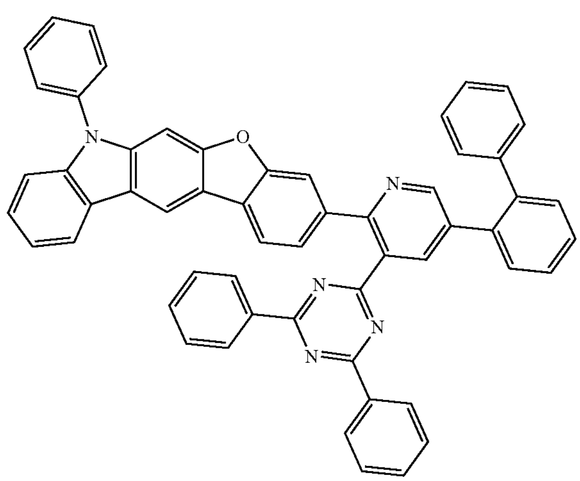
-continued
1040
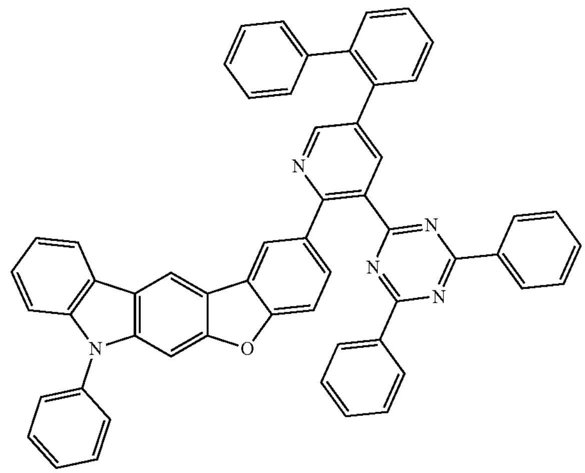
1041
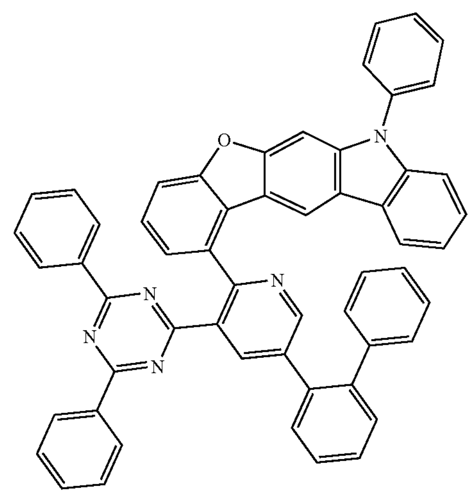
1042
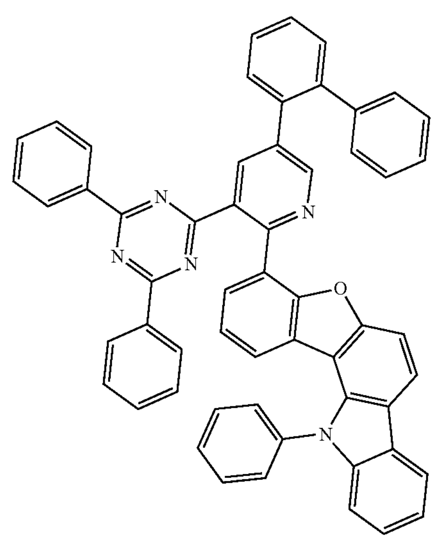

-continued
1043
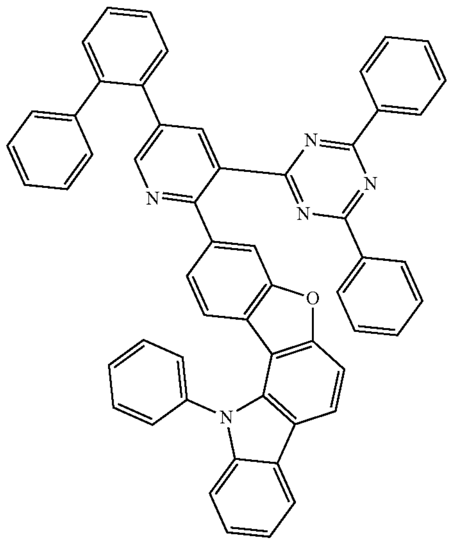
1044
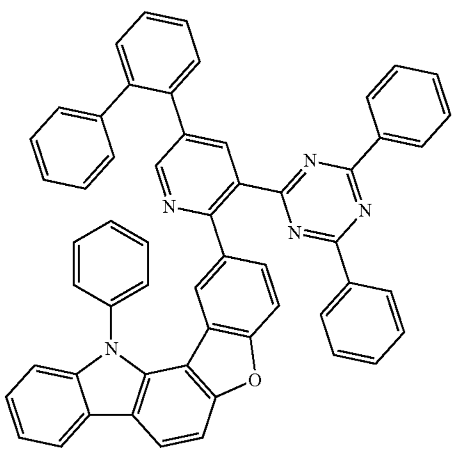
1045
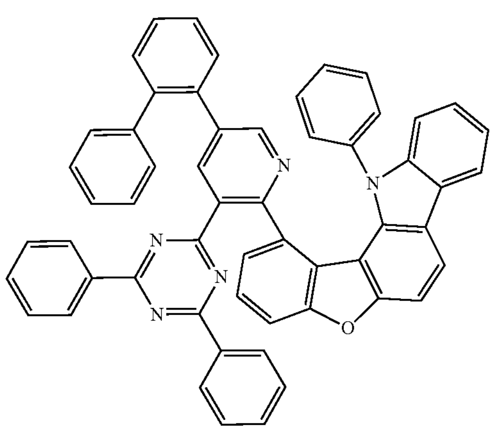
-continued
1046
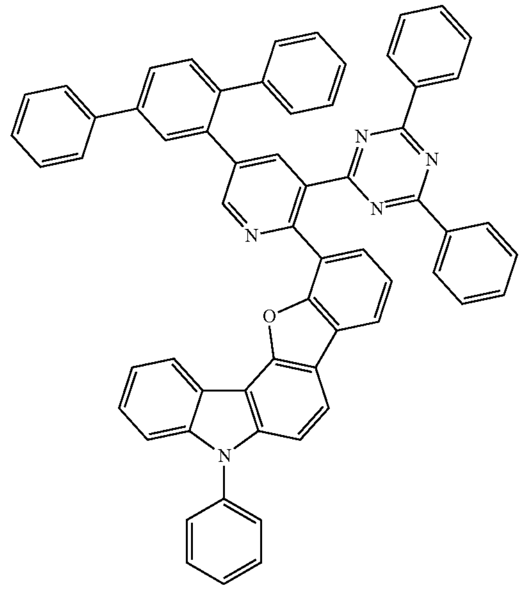
1047
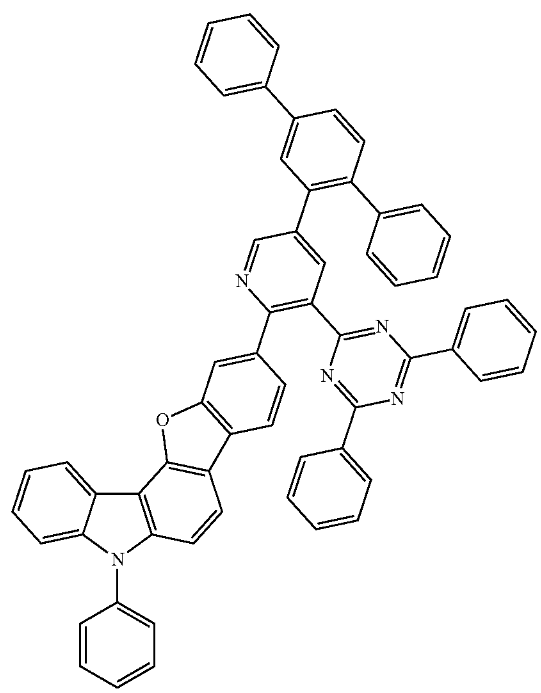

-continued
1048
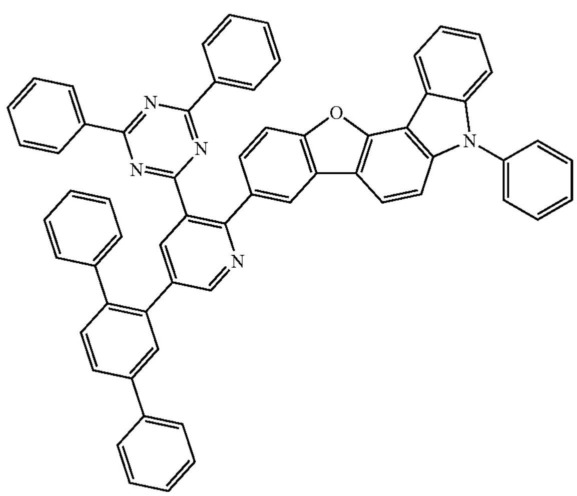
1049
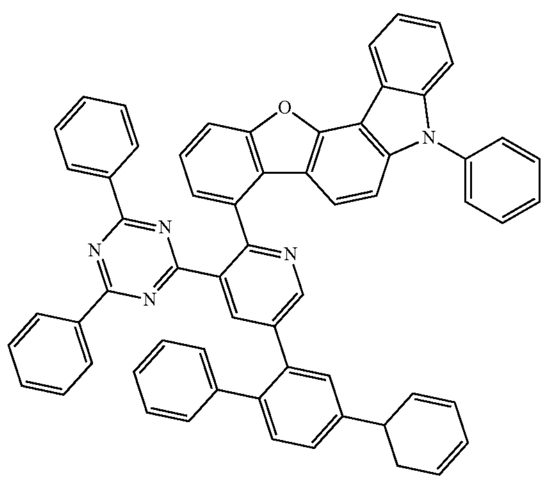
1050
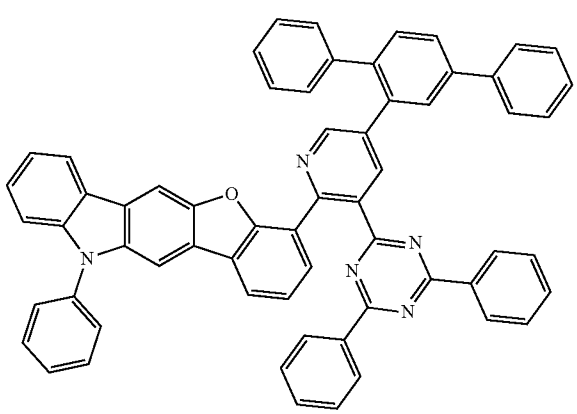
-continued
1051
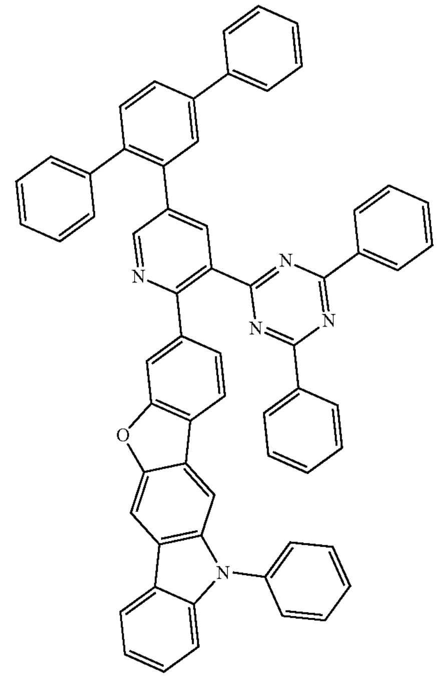
1052
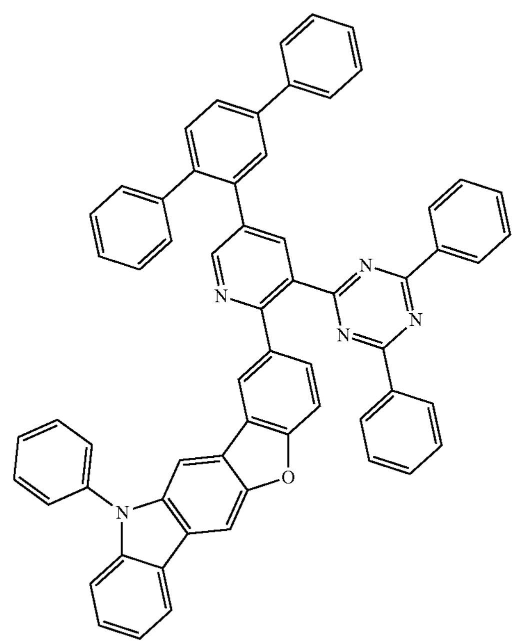

-continued
1053
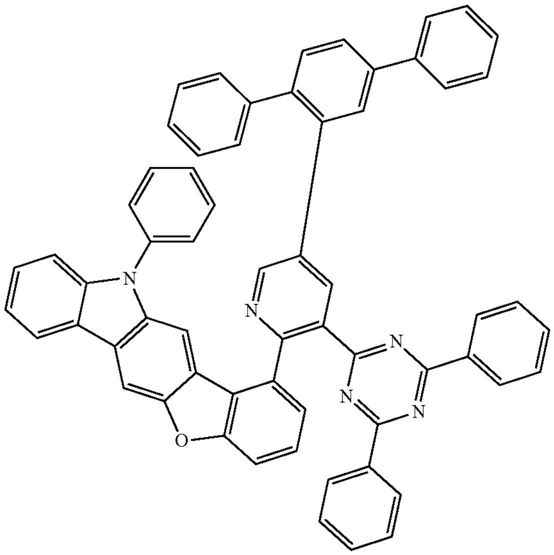
1054
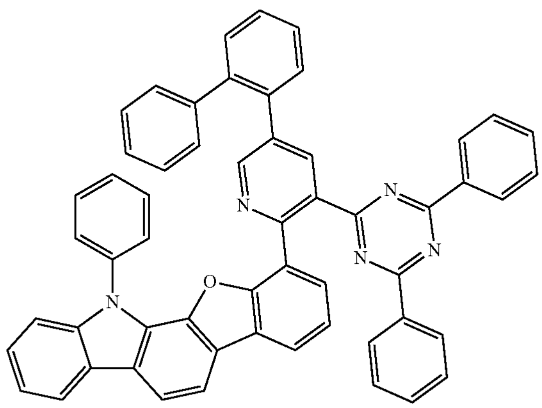
1055
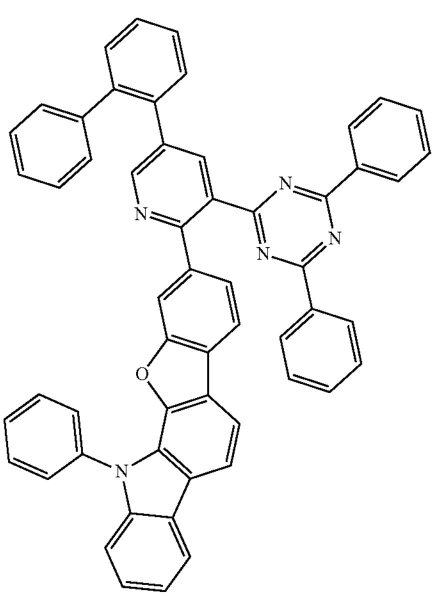
-continued
1056
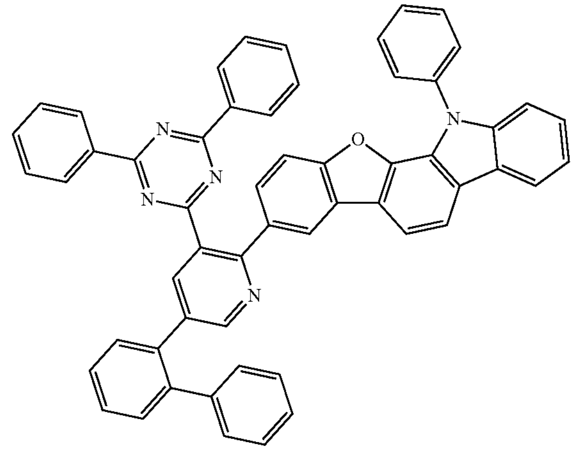
1057
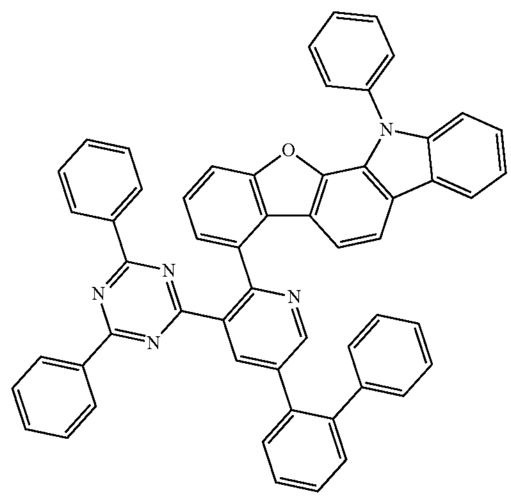
1058
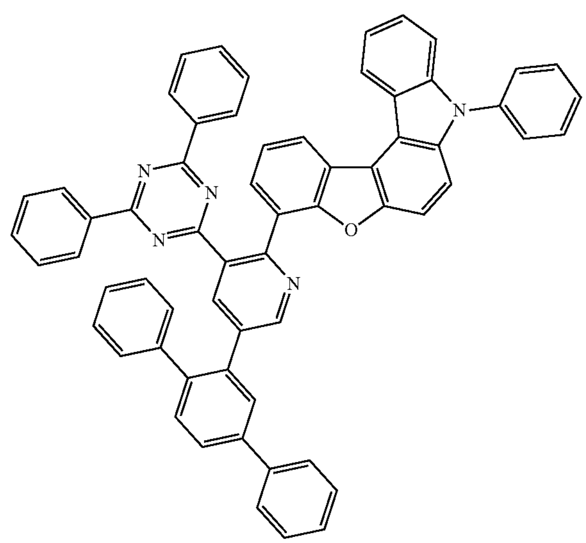

1059
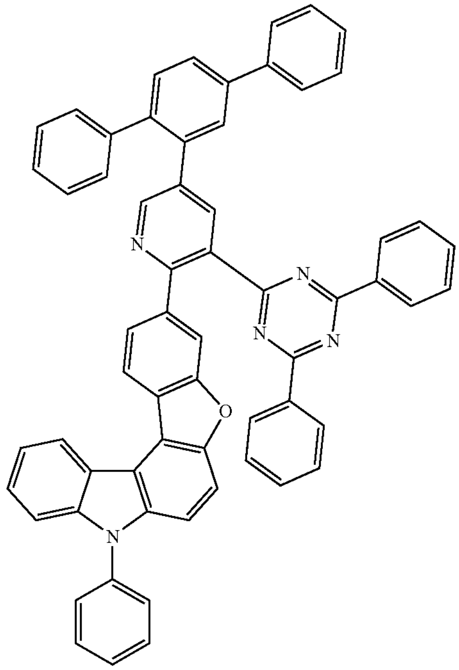
1060
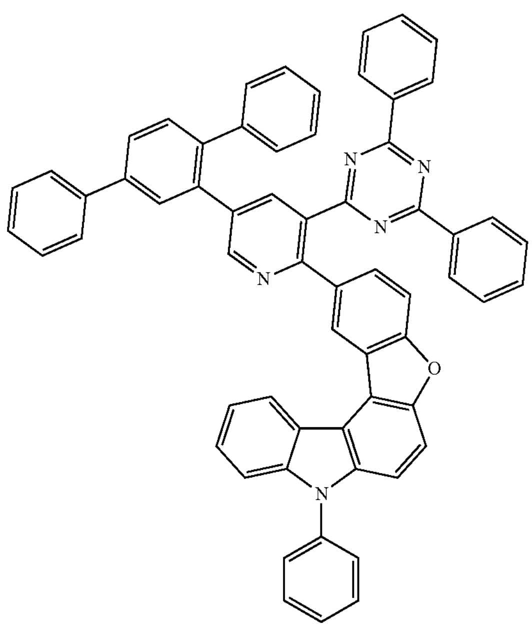
1061
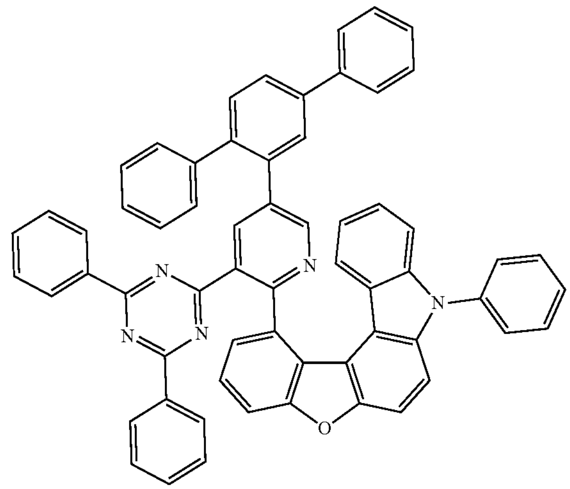
1062
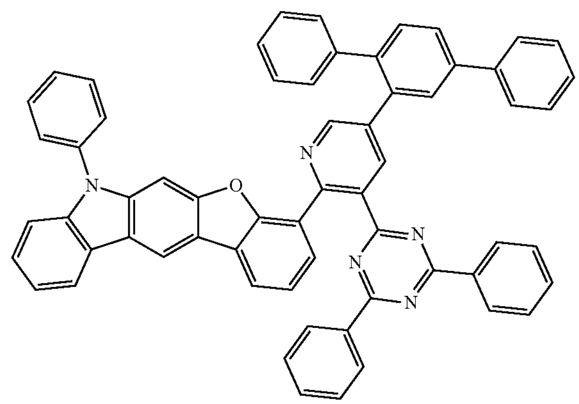
1063
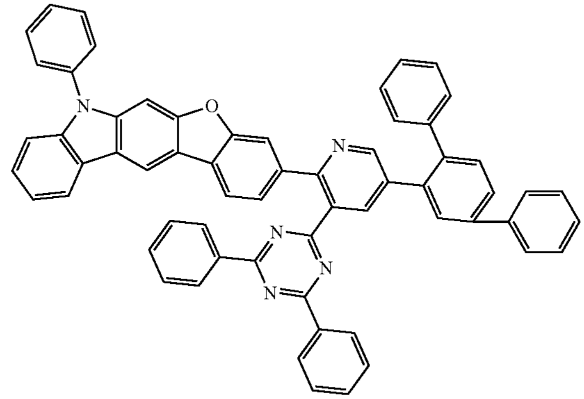

1064
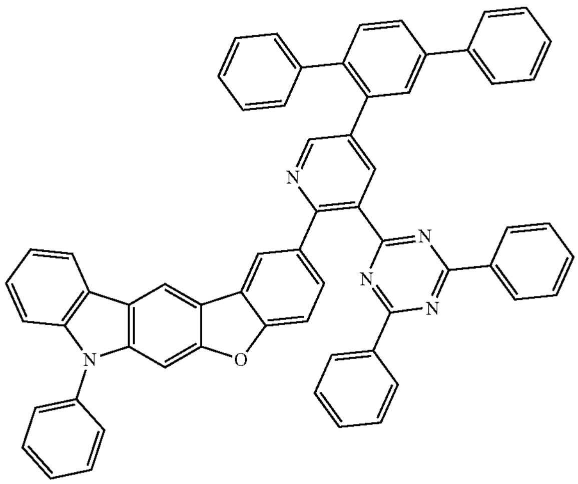
1065
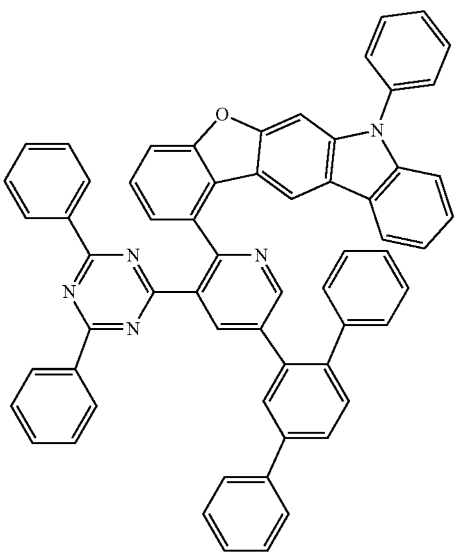
1066
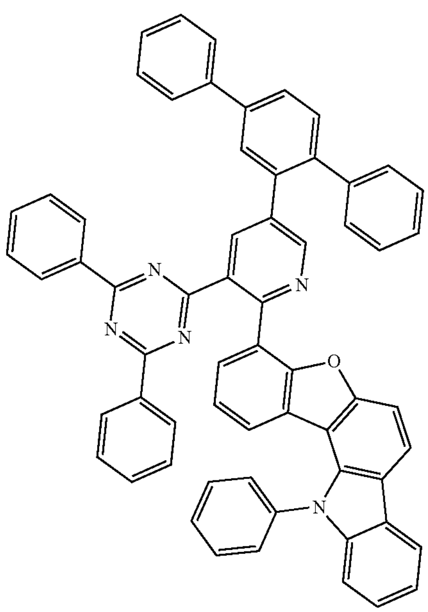
1067
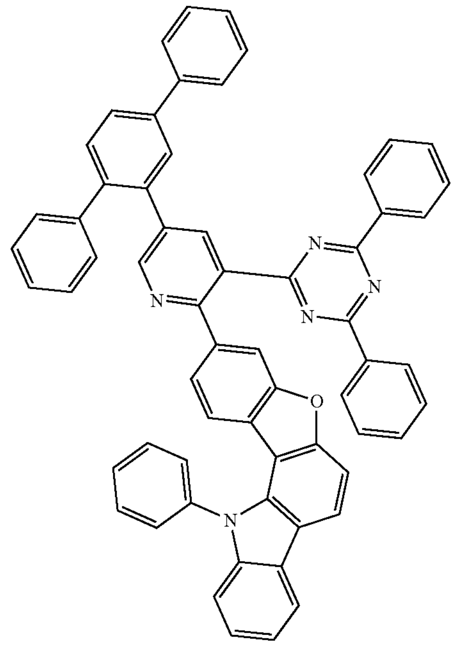
1068
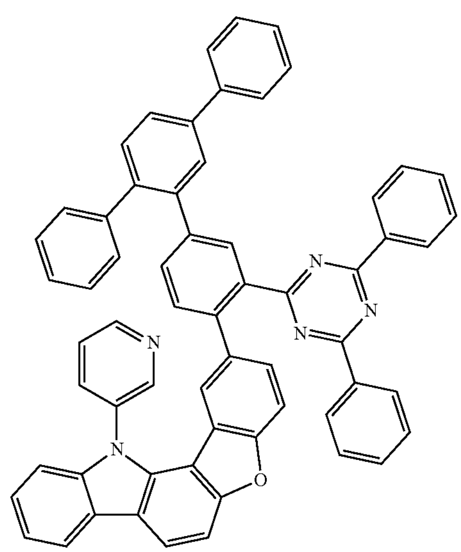

1069
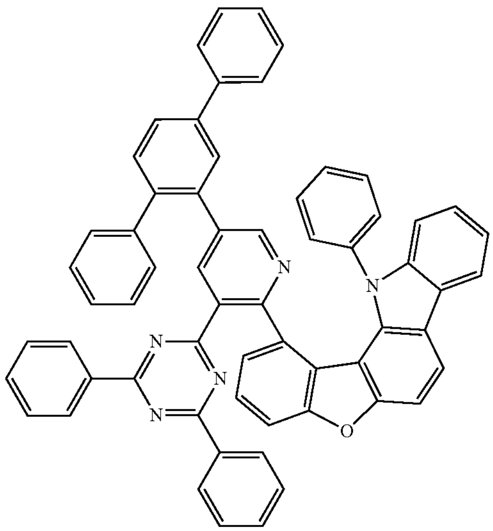
1070
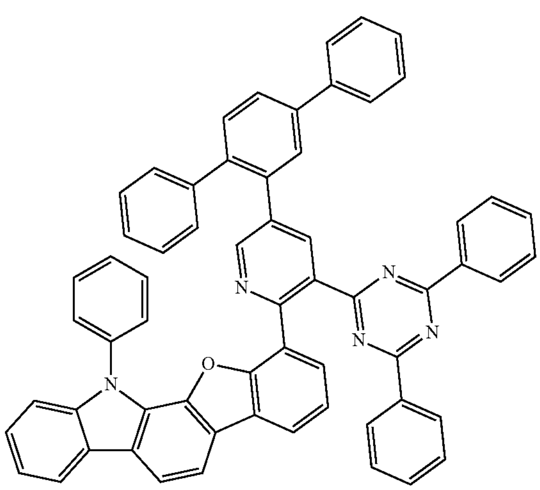
1071
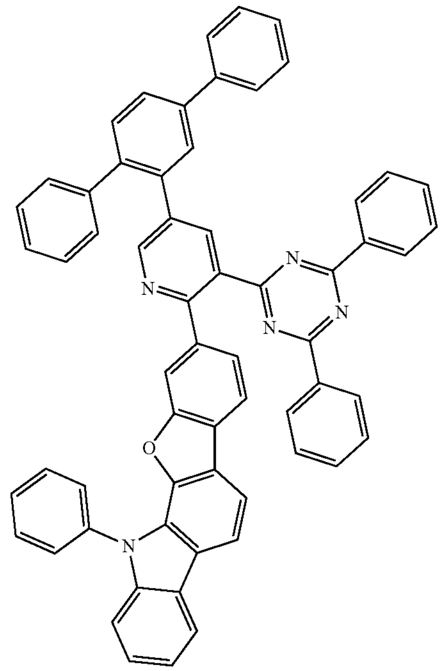
1072
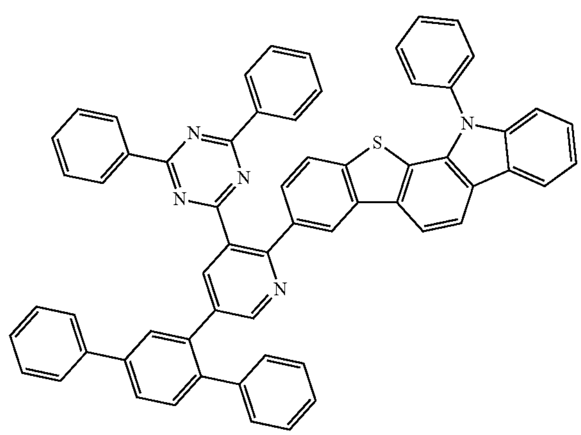

-continued
1073
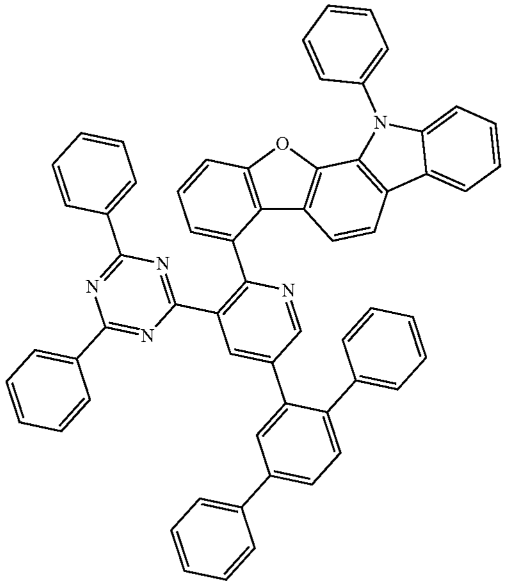
1074
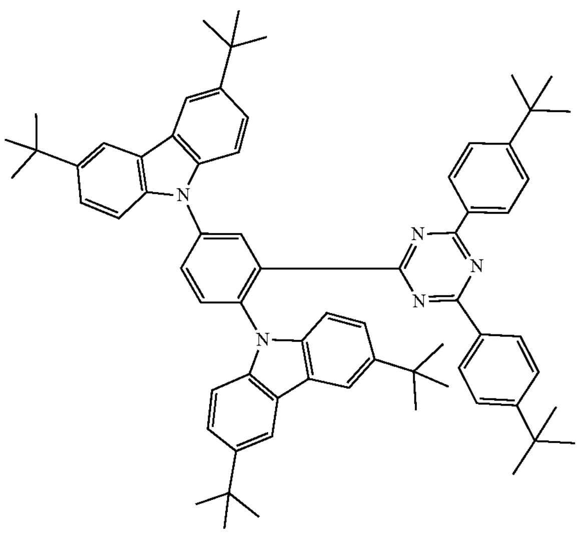
1075
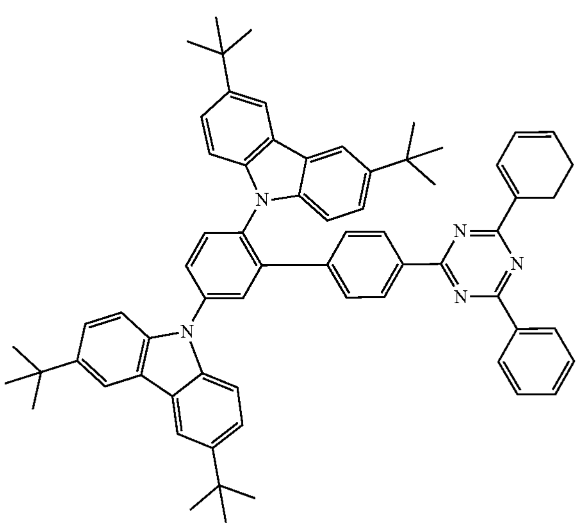
-continued
1076
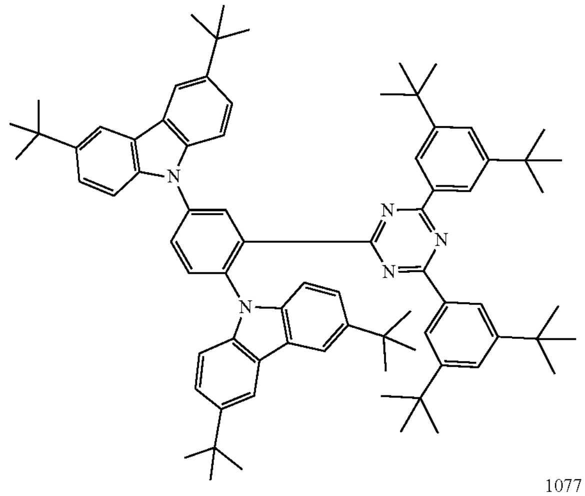
1077
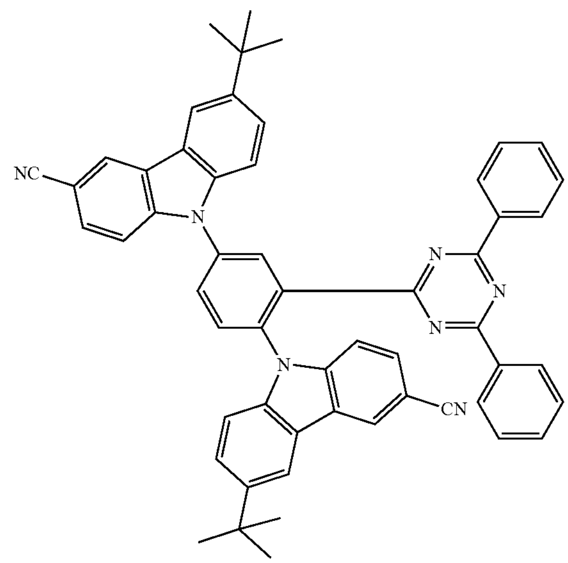
1078
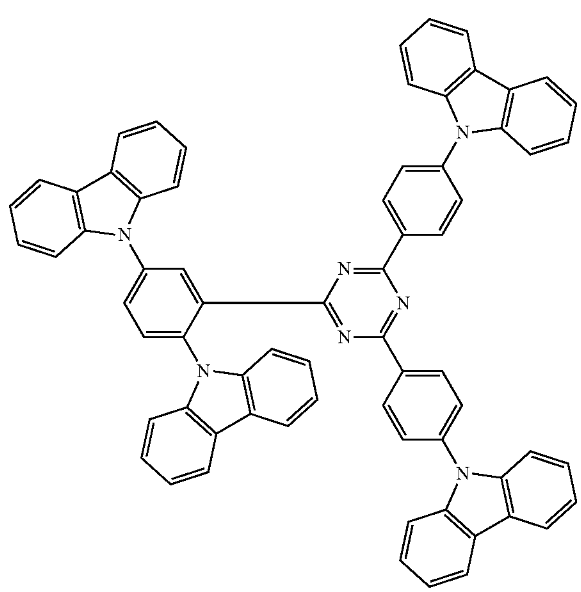

-continued
Group DF5
1
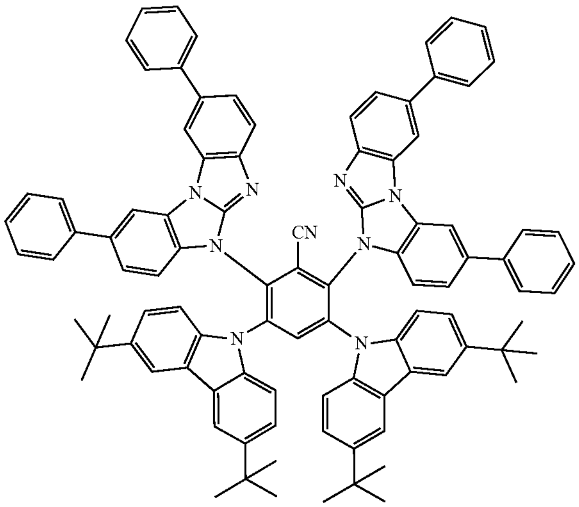
2
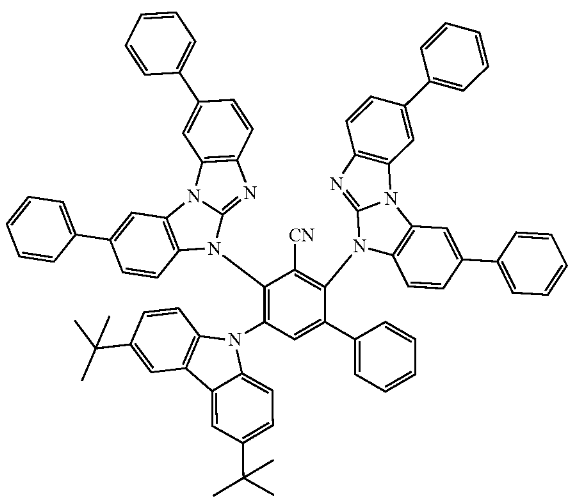
3
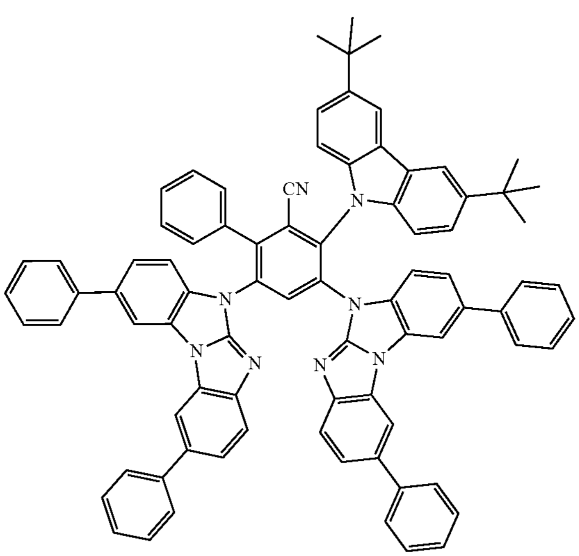
-continued
4
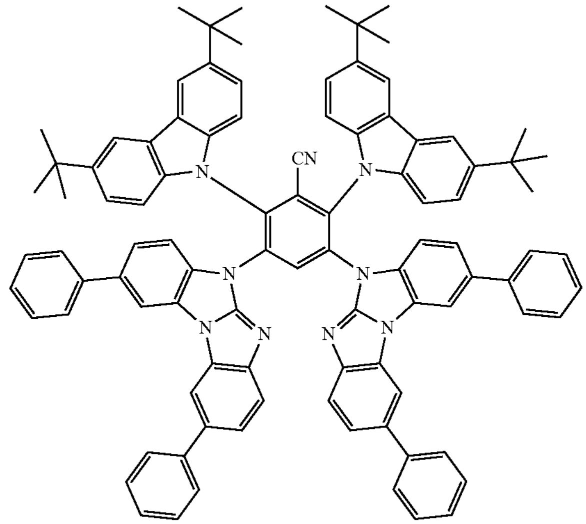
5
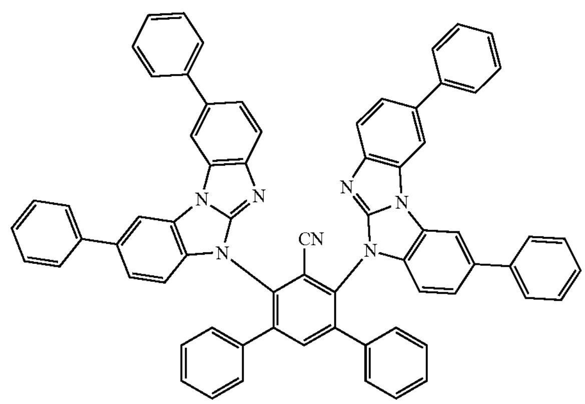
6
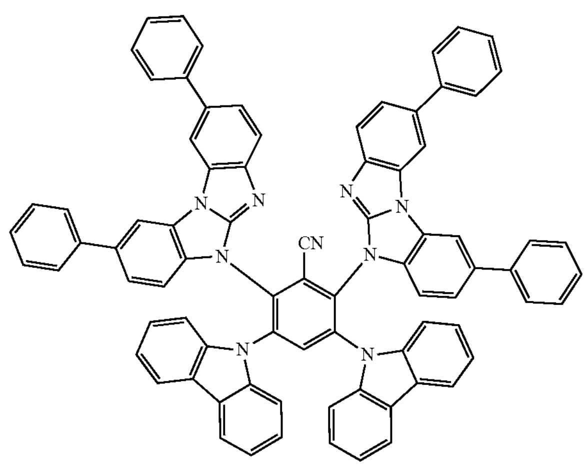

-continued
7
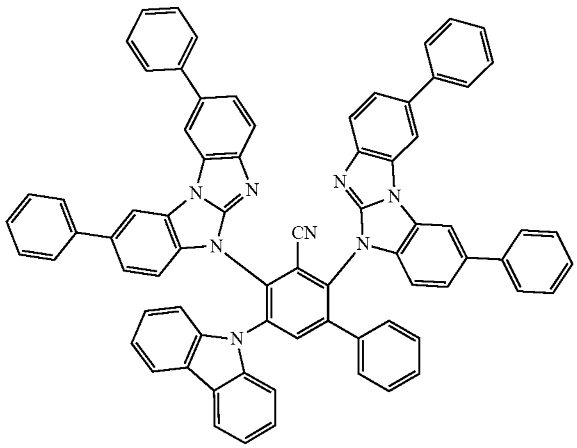
8
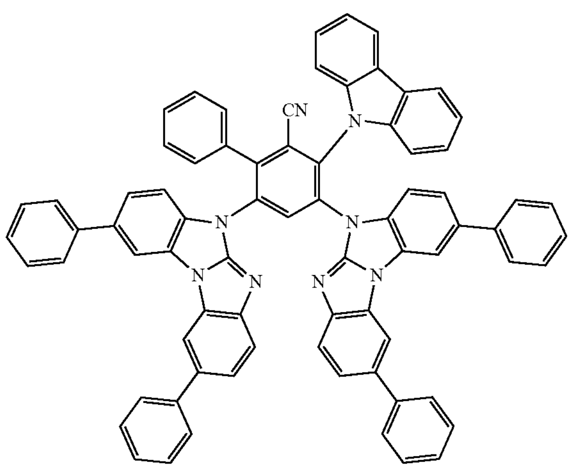
9
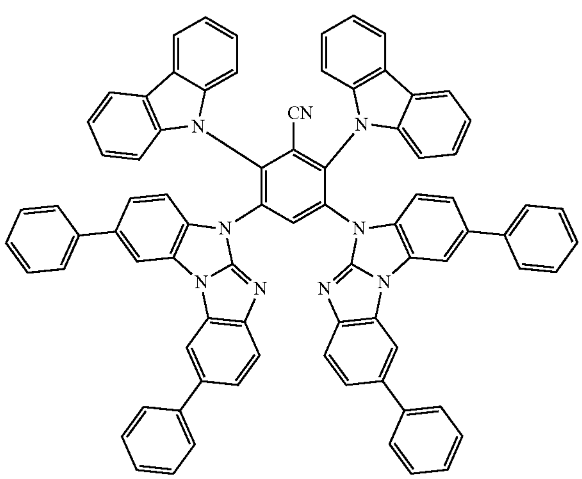
-continued
10
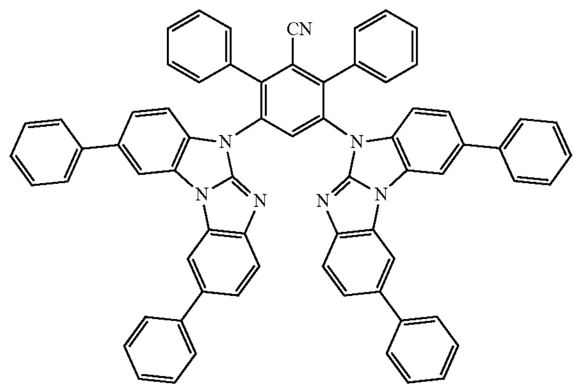
11
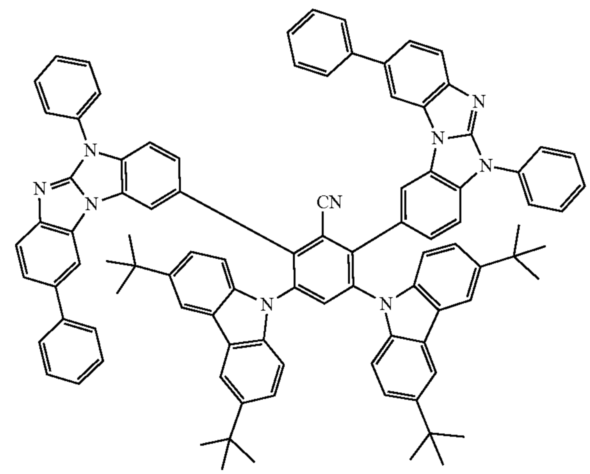
12
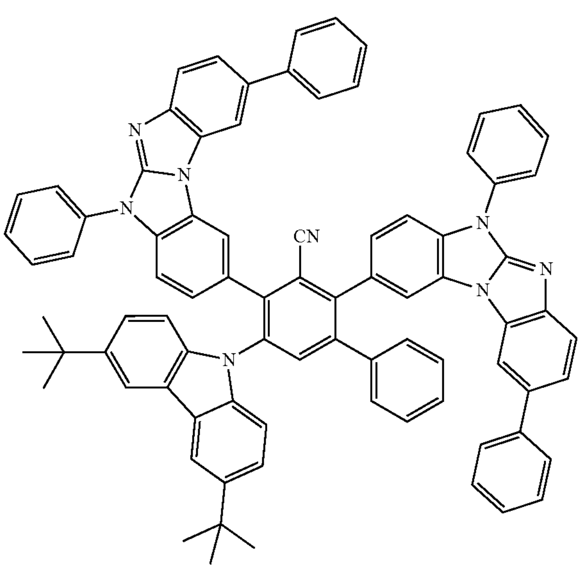

-continued
13
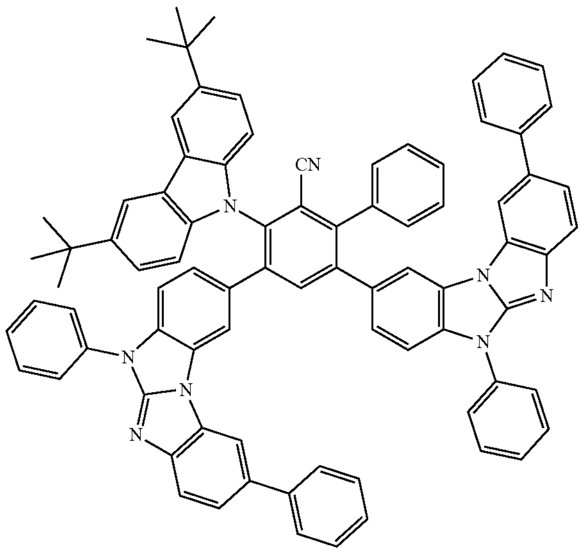
14
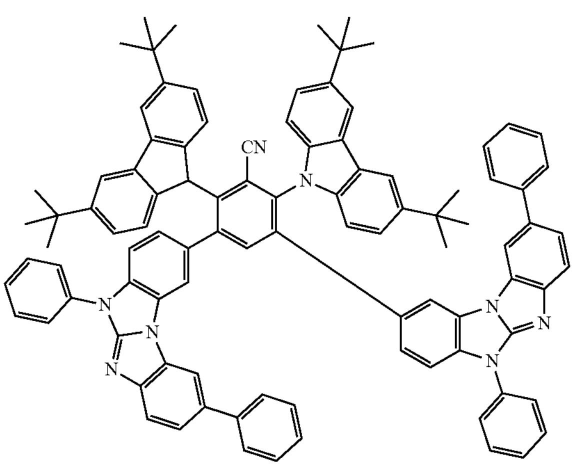
15
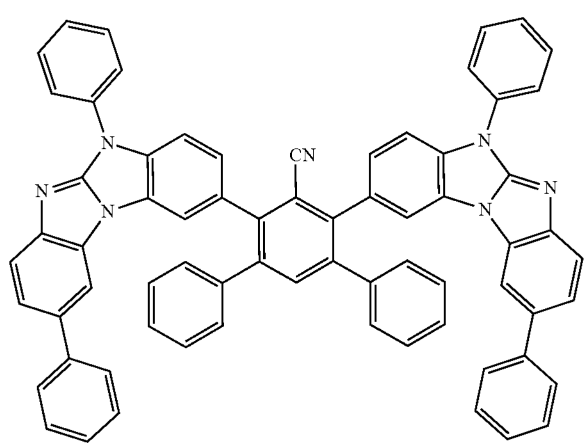
-continued
16
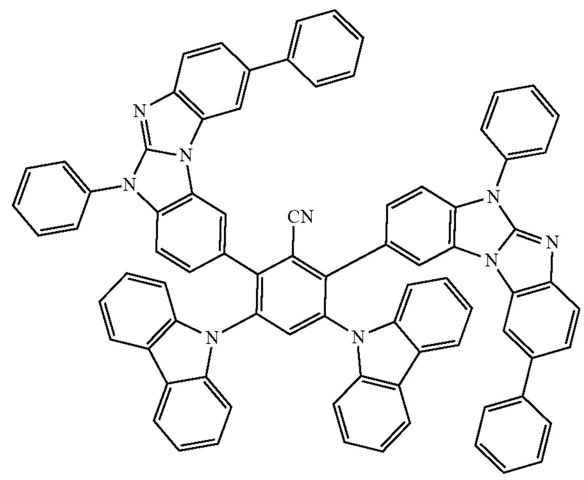
17
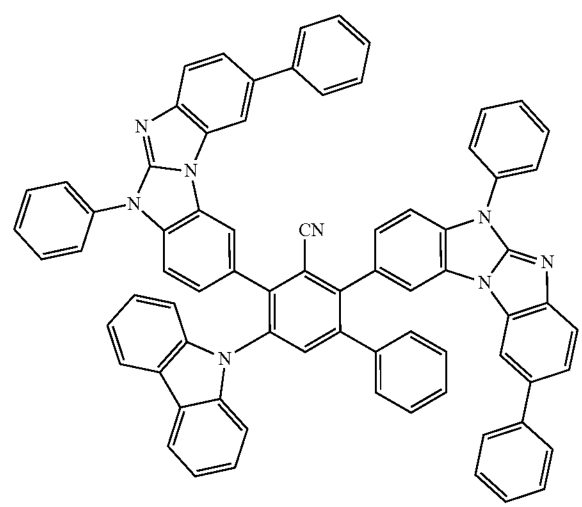
18
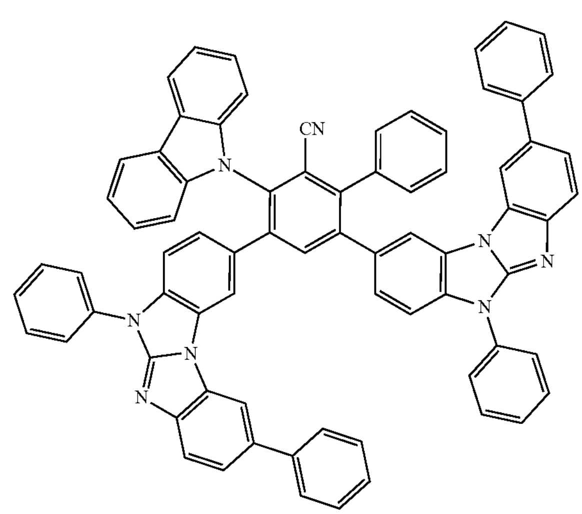

-continued
19
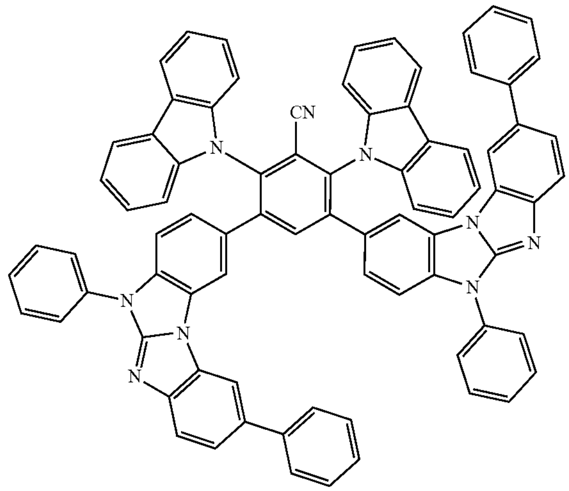
20
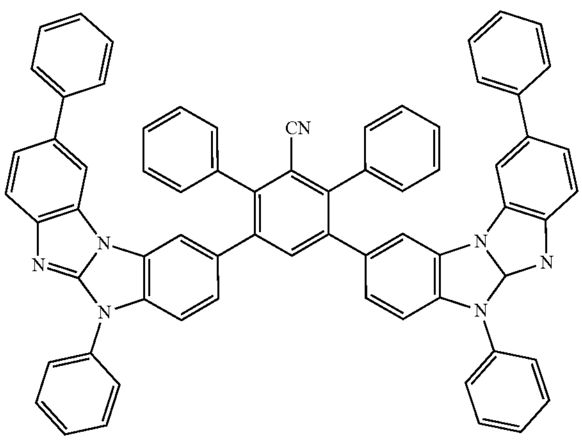
21
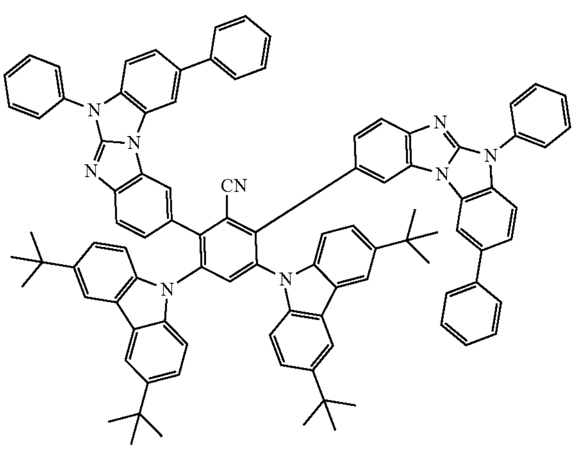
-continued
22
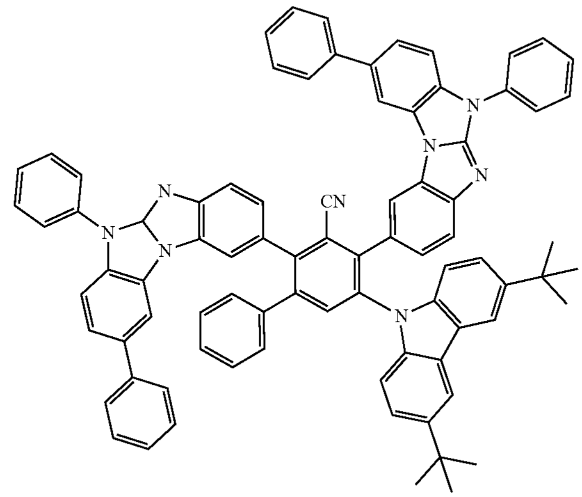
23
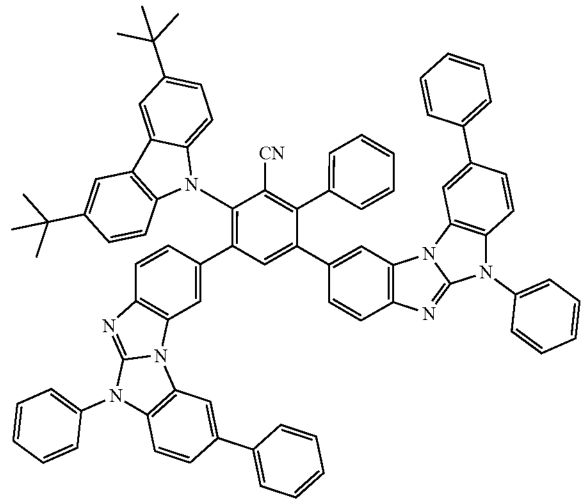
24
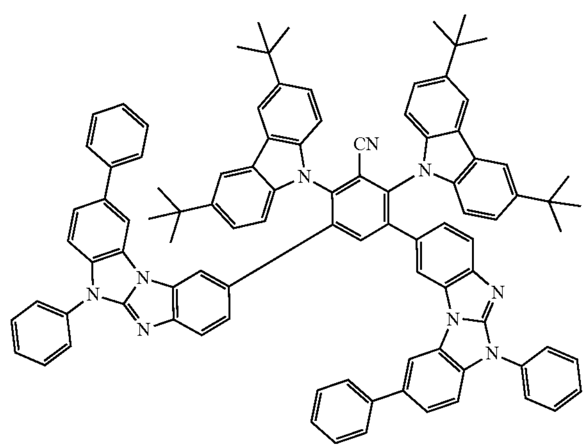

-continued
25
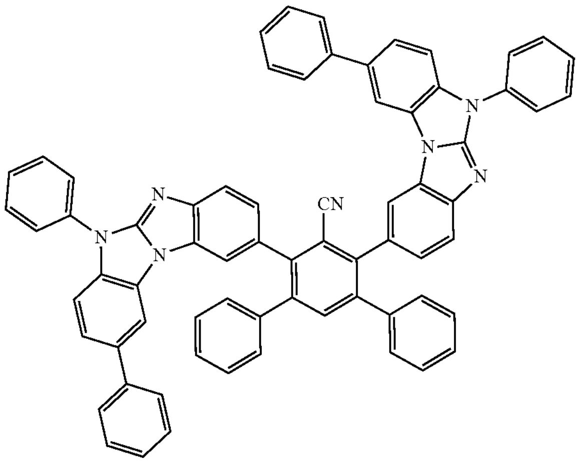
26
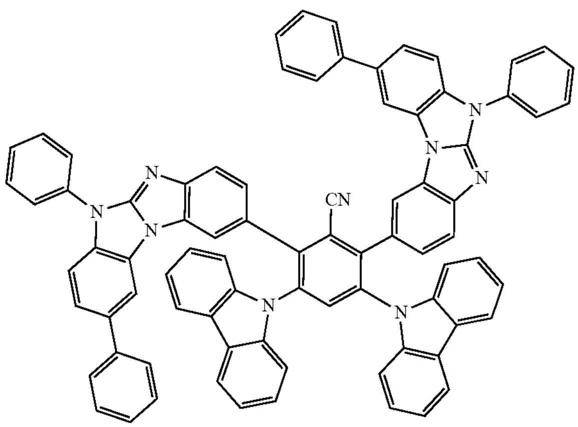
27
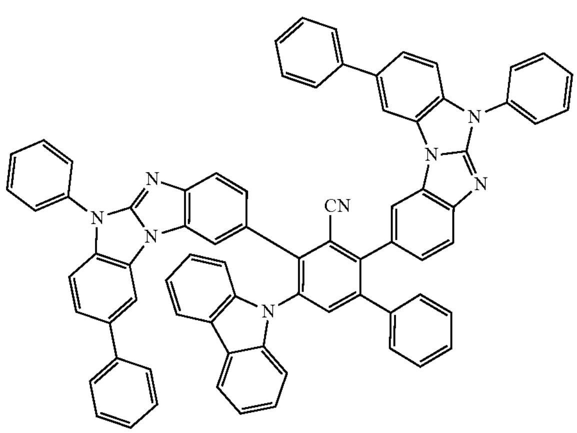
-continued
28
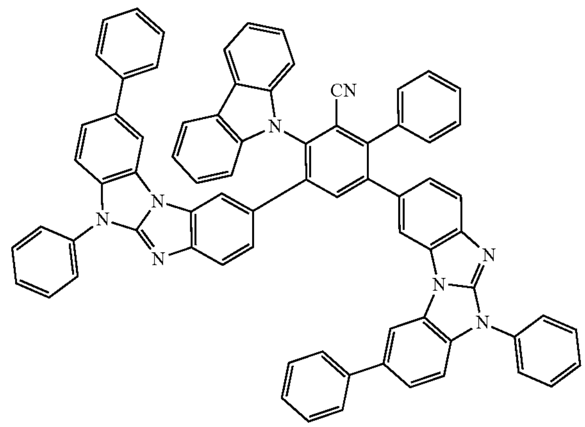
29
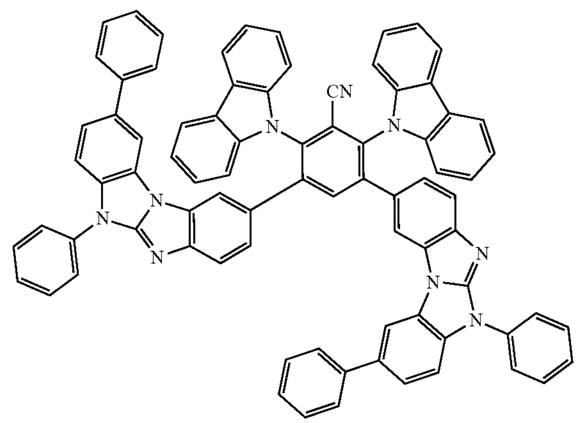
30
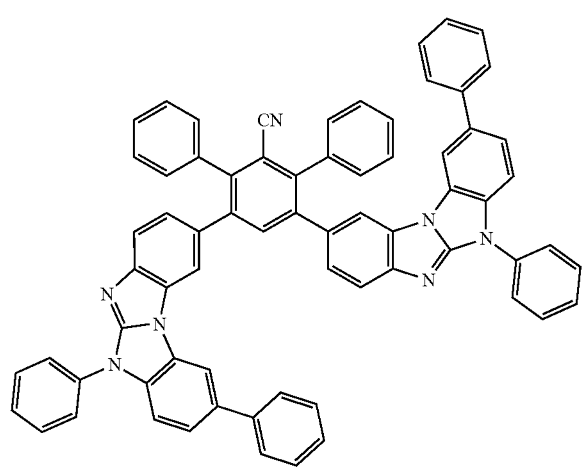

-continued
31
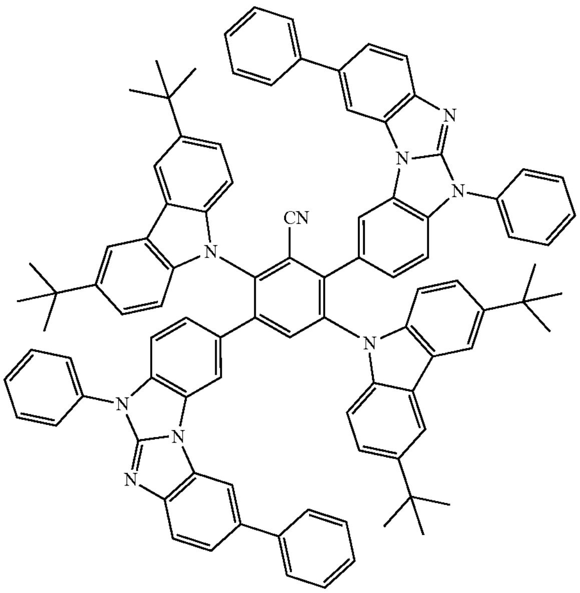
33
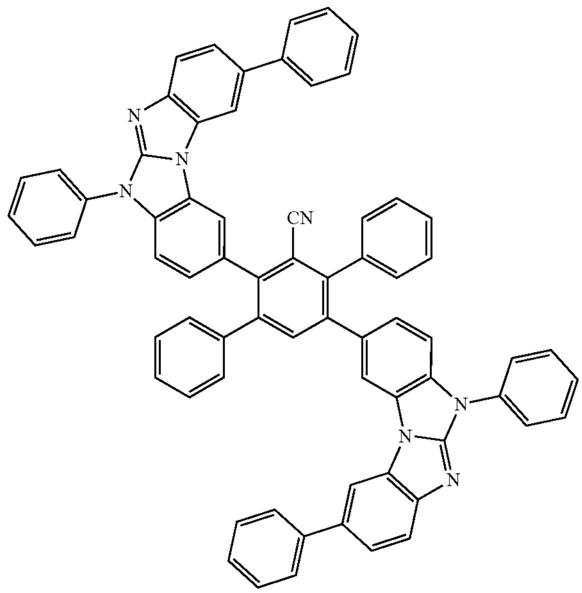
32
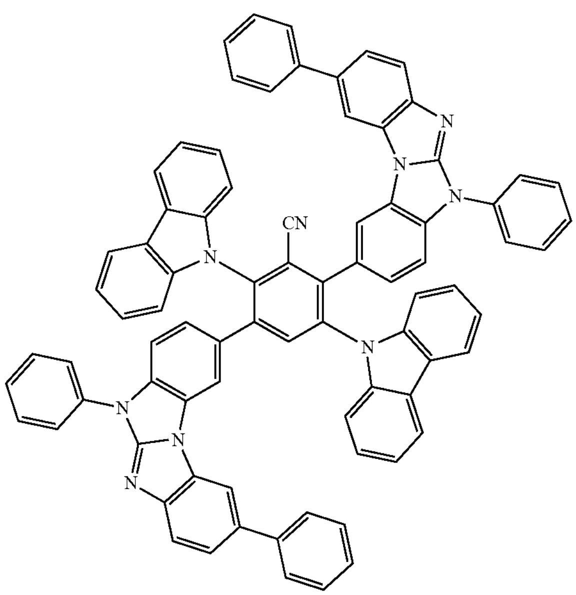
34
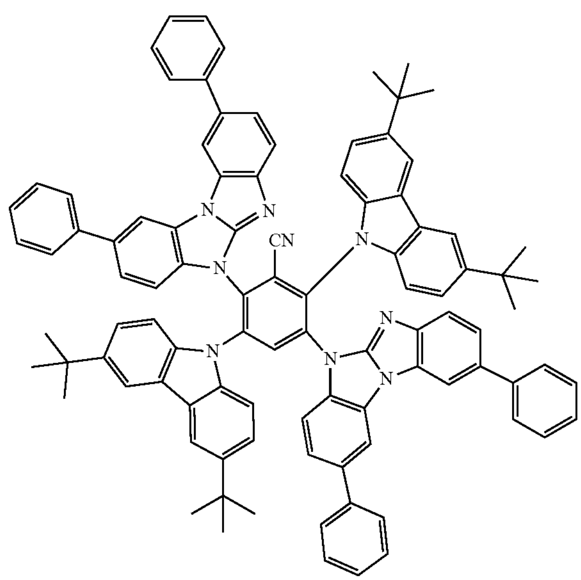

-continued
35
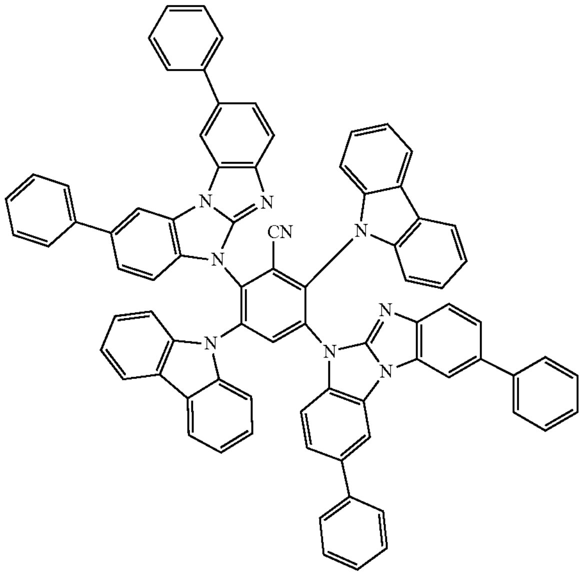
36
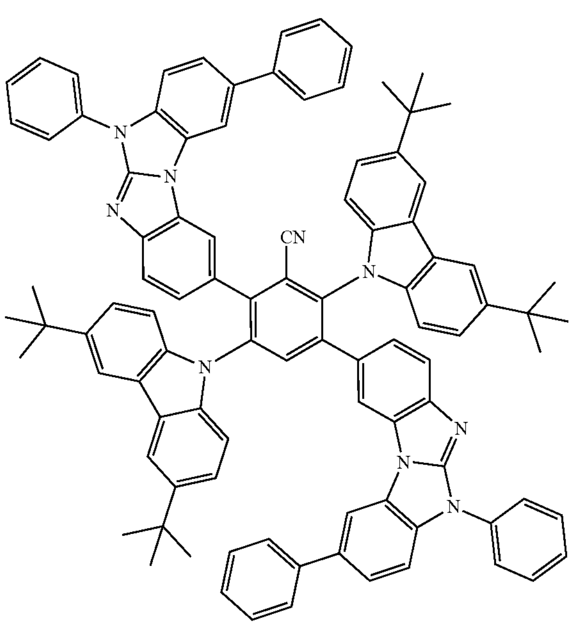
-continued
37
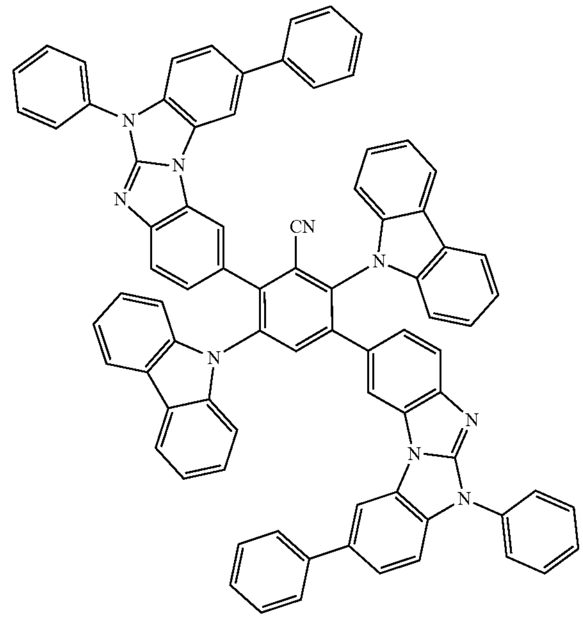
38
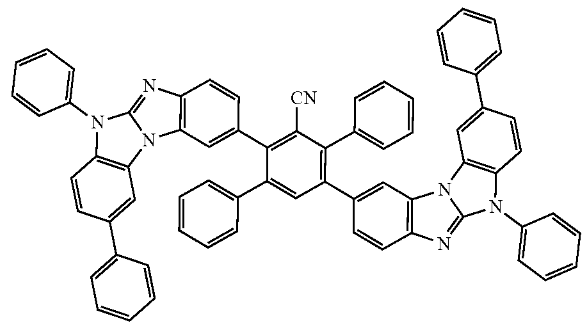
39
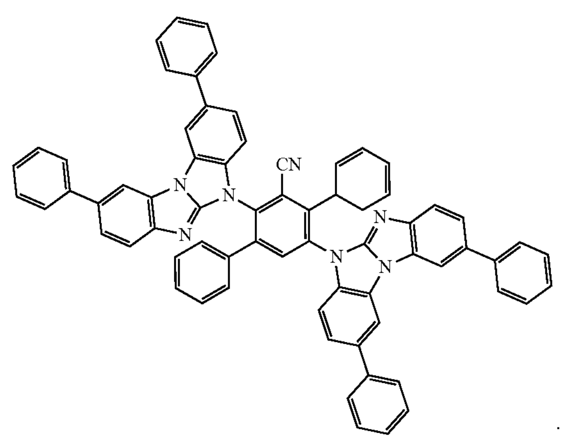
An amount of the third compound in the emission layer 15 may be from about 5 wt % to about 50 wt %. Within these ranges, it is possible to achieve effective energy transfer in the emission layer 15, and accordingly, an organic light-emitting device having high efficiency and long lifespan can be obtained.

The fourth compound may be represented by Formula 503:

Formula 503

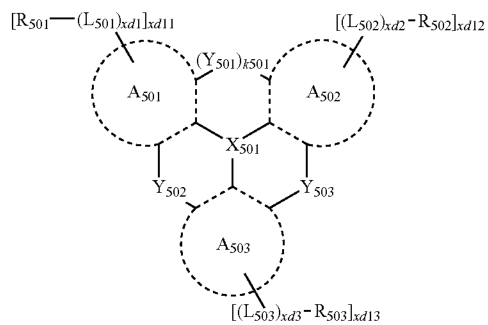

wherein, in Formula 503, $X_{501}$ may be N, B, P(=O)($R_{504}$), or P(=S)($R_{504}$), $Y_{501}$ to $Y_{502}$ may each independently be O, S, N($R_{505}$), B($R_{505}$), C($R_{505}$)($R_{506}$), or Si($R_{505}$)($R_{506}$), k501 may be 0 or 1, wherein, when k501 is 0, —$(Y_{501})_{k501}$— may not exist, $A_{501}$ to $A_{503}$ may each independently be a $C_5$-$C_{30}$ carbocyclic group or a $C_1$-$C_{30}$ heterocyclic group, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd3 may each independently be 0, 1, 2 or 3, $R_{501}$ to $R_{506}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), and $R_{501}$ to $R_{506}$ are optionally linked to each other to form a substituted or unsubstituted $C_5$-$C_{30}$ carbocyclic group and a substituted or unsubstituted $C_1$-$C_{30}$ heterocyclic group, xd11 and xd12 may each independently be an integer from 0 to 10, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

In an embodiment, in Formula 503, $X_{501}$ may be B, and $Y_{501}$ to $Y_{502}$ may each independently be O, S, or N($R_{505}$). In an embodiment, in Formula 503, $X_{501}$ may be B, and $Y_{501}$ to $Y_{502}$ may each independently be O, or N($R_{505}$).

In an embodiment, the fourth compound may be represented by Formula 1 below:

Formula 1

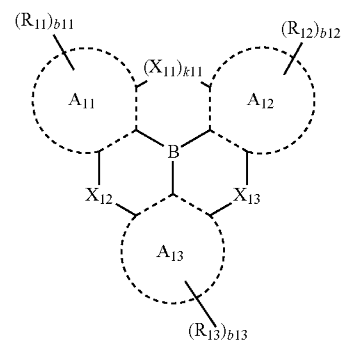

wherein, in Formula 1, $X_{11}$ may be $NR_{14}$ or O, $X_{12}$ may be $NR_{15}$ or O, $X_{13}$ may be $NR_{16}$ or O, k11 may be 0 or 1, wherein, when k11 is 0, $(X_{11})_{k11}$ may not exist, $A_{11}$ to $A_{13}$ may each independently be a $C_5$-$C_{30}$ carbocyclic group or a $C_1$-$C_{30}$ heterocyclic group, $R_{11}$ to $R_{16}$ may each independently be hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), b11 to b13 may each independently be an integer from 0 to 10, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

In an embodiment, k11 in Formula 1 may be 0.

In an embodiment, $A_{11}$ to $A_{13}$ in Formula 1 may each independently be a group represented by Formula 10A, a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group;

Formula 10A

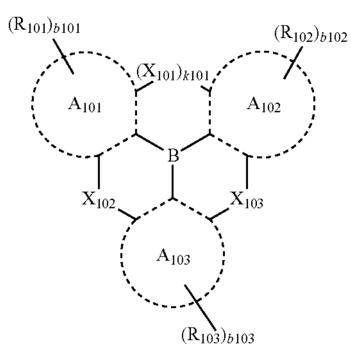

wherein, in Formula 10A, $X_{101}$ may be $NR_{104}$ or O, $X_{102}$ may be $NR_{105}$ or O, $X_{103}$ may be $NR_{106}$ or O, k101 may be 0 or 1, wherein, when k101 is 0, $(X_{101})_{k101}$ may not exist, $A_{101}$ to $A_{103}$ may each independently be a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group, $R_{101}$ to $R_{106}$ may each independently be hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted heteroarylthio group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), b101 to b103 may each independently be an integer from 0 to 10, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

In an embodiment, in Formula 1, $A_{11}$ and $A_{13}$ may each independently be a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group; $A_{12}$ may be a group represented by Formula 10A; or $A_{11}$ to $A_{13}$ may each independently be a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group.

In an embodiment, k11 and k101 in Formulae 1 and 10A may be 0.

In an embodiment, the fourth compound may be represented by Formula 1-1 or 1-2:

1-1

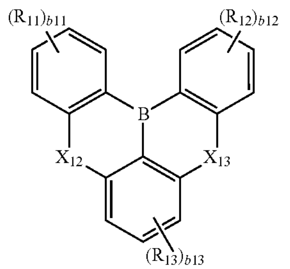

1-2

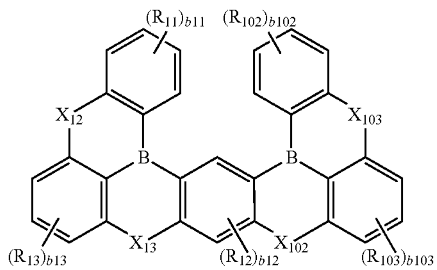

wherein, in Formulae 1-1 and 1-2, $X_{12}$ may be $NR_{15}$ or O, $X_{13}$ may be $NR_{16}$ or O, $X_{102}$ may be $NR_{105}$ or O, $X_{103}$ may be $NR_{105}$ or O, $R_{11}$ to $R_{13}$, $R_{15}$, $R_{16}$, $R_{102}$, $R_{103}$, $R_{105}$, and $R_{106}$ may each independently be hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), b11 to b13, b102, and b103 may each independently be an integer from 0 to 10, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

In an embodiment, the fourth compound may be Group BD1 below:

Group BD1

BD1-1

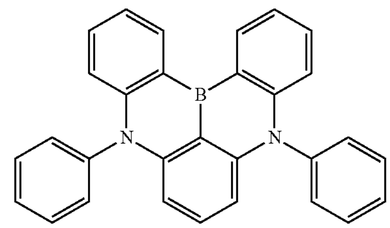

BD1-2

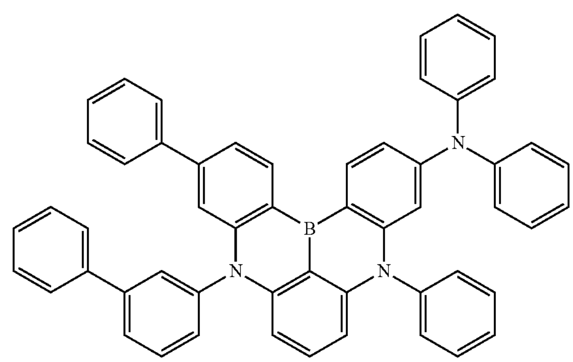

BD1-3

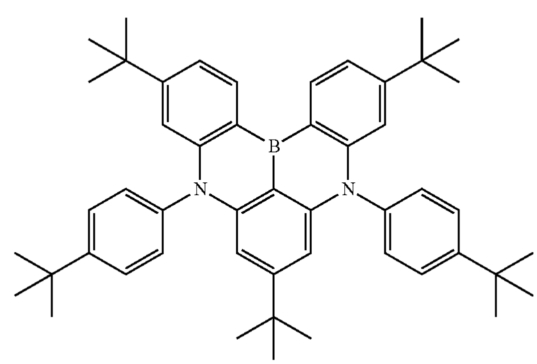

-continued

BD1-4

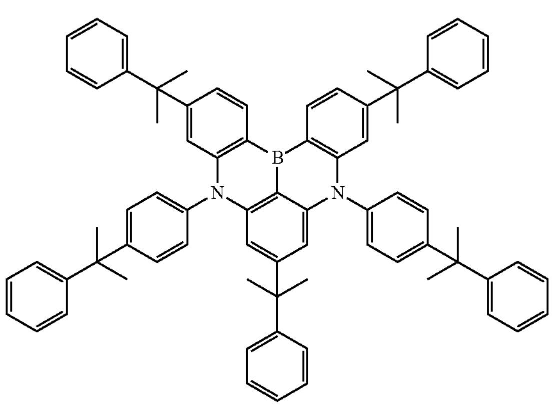

BD1-5

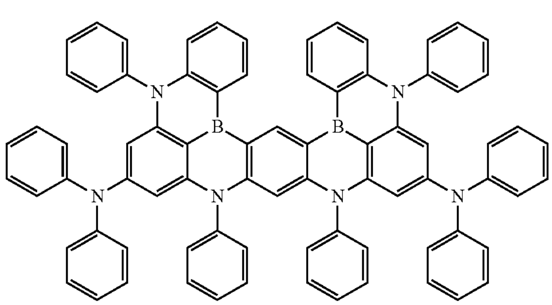

BD1-6

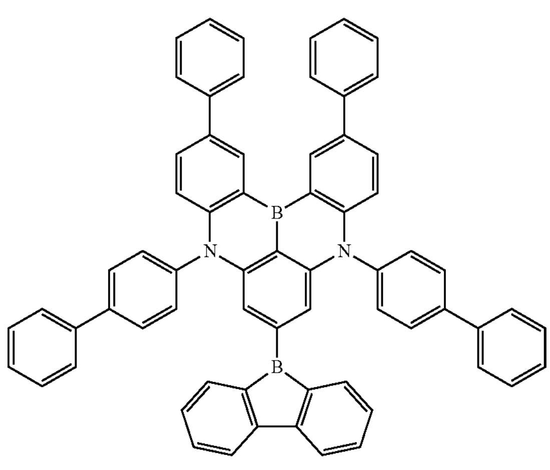

The fourth compound may be a fluorescent dopant emitting fluorescent light. Accordingly, a decay time ($T_{decay}$(C4)) of the fourth compound may be less than 100 nanoseconds.

$T_{decay}$(C4) is a value calculated from a time-resolved photoluminescence (TRPL) spectrum at room temperature with respect to a film having a thickness of 40 nm obtained by vacuum-codepositing, on a quartz substrate, the first compound, the second compound, and the fourth compound included in the emission layer 15 at a ratio of 45:45:10 and at a vacuum pressure of $10^{-7}$ torr. A detailed method of evaluating $T_{decay}$(C4) is the same as described in connection with examples below.

A maximum emission wavelength of an emission spectrum of the fourth compound may be about 400 nm or more and about 550 nm or less. In an embodiment, the maximum emission wavelength of the emission spectrum of the fourth compound may be about 400 nm or more and about 495 nm or less, or about 450 nm or more and about 495 nm or less, but embodiments of the disclosure are not limited thereto. That is, the fourth compound may emit blue light. The "maximum emission wavelength" refers to a wavelength at which the emission intensity is the greatest, and may also be referred to as "a peak emission wavelength".

An amount of the fourth compound in the emission layer 15 may be about 0.01 wt % to about 15 wt %, but embodiments of the disclosure are not limited thereto.

When the emission layer 15 further includes the fourth compound, the organic light-emitting device may further satisfy Condition 2 below:

$$T_1(Ex) > T_1(C4) \qquad \text{Condition 2}$$

wherein, in Condition 2, $T_1$(Ex) is a lowest excited triplet energy level of the exciplex, and $T_1$(C4) is a lowest excited triplet energy level of the fourth compound.

$T_1$(C4) is a value calculated from a PL spectrum at low temperature with respect to a film (hereinafter, referred to as a "film (C4)") having a thickness of 40 nm obtained by vacuum-depositing, on a quartz substrate, the fourth compound included in the emission layer 15 at a vacuum pressure of $10^{-7}$ torr. A detailed method of evaluating $T_1$(C4) is the same as described in connection with examples below.

When Condition 2 is further satisfied, the fourth compound may emit light. In an embodiment, when Condition 2 is further satisfied, the fourth compound emits light, and thus an organic light-emitting device with improved efficiency may be provided. In an embodiment, when Condition 2 is further satisfied, the light-emission ratio of the fourth compound in the organic light-emitting device may be about 85% or more. That is, when the range described above is satisfied, only the fourth compound substantially emits light in the organic light-emitting device, and the exciplex and the third compound may not substantially emit light.

In the first embodiment, a singlet and/or triplet exciton formed in the exciplex is transferred to the third compound, and then transferred again to the fourth compound via Förster resonance energy transfer (FRET). Because both the singlet exciton and the triplet exciton of the exciplex may be transmitted to the fourth compound, the organic light-emitting device may have a significantly improved lifespan and efficiency.

A thickness of the emission layer 15 may be in a range of about 100 Å to about 1,000 Å, for example, about 200 Å to about 600 Å. When the thickness of the emission layer 15 is within these ranges, excellent light-emission characteristics may be obtained without a substantial increase in driving voltage.

Second Embodiment

The emission layer 15 includes a first compound, a third compound, and a fourth compound.

In an embodiment, the emission layer 15 may consist of a first compound, a third compound, and a fourth compound.

In an embodiment, the emission layer 15 may further include a second compound, and thus the emission layer 15 may consist of the first compound, the second compound, the third compound, and the fourth compound. In this regard, the first compound and the second compound may not form an exciplex.

The first compound and the third compound may satisfy Condition 1-3:

$$T_1(C1) \leq T_1(C_3) < S_1(C1) \qquad \text{Condition 1-3}$$

wherein, in Condition 1-3, $T_1(C1)$ is a lowest excited triplet energy level of the first compound, $T_1(C3)$ is a lowest excited triplet energy level of the third compound, and $S_1(C1)$ is a lowest excited singlet energy of the first compound.

$T_1(C1)$ is a value calculated from an onset wavelength of a PL spectrum at low temperature with respect to a film (hereinafter, referred to as a "film ($C_1$)") having a thickness of 40 nm obtained by vacuum-codepositing, on a quartz substrate, the first compound included in the emission layer 15 at a vacuum pressure of $10^{-7}$ torr. A detailed method of evaluating $T_1(C1)$ is the same as described in connection with examples below.

$T_1(C3)$ is a value calculated from an onset wavelength of a PL spectrum at low temperature with respect to a sample (hereinafter, referred to as a "sample (C3)") obtained by dissolving the third compound included in the emission layer 15 in toluene at a concentration of $1\times10^{-4}$ M in a quartz cell. A detailed method of evaluating $T_1(C3)$ is the same as described in connection with examples below.

$S_1(C1)$ is a value calculated from an onset spectrum at room temperature with respect to a film (hereinafter, referred to as a "film (C1)") having a thickness of 40 nm obtained by vacuum-depositing, on a quartz substrate, the first compound included in the emission layer 15 at a vacuum pressure of $10^{-7}$ torr. A detailed method of evaluating $S_1(C1)$ is the same as described in connection with examples below.

By satisfying Condition 1-3, the organic light-emitting device may have an improved lifespan. In general, it is known that since triplet excitons stay long in an excited state, they influence the decrease in the lifespan of organic light-emitting devices. However, in the disclosure, a lowest excited triplet energy level of the first compound acting as a host is lowered to improve the lifespan of an organic light-emitting device including the first compound.

The first compound and the third compound may satisfy Condition 1-4:

$$T_1(C3) - T_1(C1) < 0.3 \text{ eV} \qquad \text{Condition 1-4}$$

wherein, in Condition 1-4, $T_1(C1)$ is a lowest excited triplet energy level of the first compound, and $T_1(C3)$ is a lowest excited triplet energy level of the third compound.

The organic light-emitting device satisfies Condition 1-4, and thus because a triplet exciton of the first compound may be rapidly converted to a triplex exciton of the third compound, the organic light-emitting device may have an implementable level of efficiency.

That is, the organic light-emitting device satisfies Conditions 1-3 and 1-4 at the same time, and thus, may have an improved lifespan and efficiency.

In an embodiment, the first compound and the third compound may further satisfy Condition 1-4-1:

$$T_1(C3) - T_1(C1) - 0.15 \text{ eV} \qquad \text{Condition 1-4-1}$$

wherein, in Condition 1-4-1, definitions of $T_1(C1)$ and $T_1(C3)$ are each the same as described above.

Each of the first compound and the second compound may not include a metal atom.

In an embodiment, the first compound may be a hole transporting host, an electron transporting host, or a bipolar host. The hole transporting host and the electron transporting host are each the same as described above.

When the emission layer 15 further includes the second compound, the first compound and the second compound are each a hole transporting host, an electron transporting host, or a bipolar host. The hole transporting host and the electron transporting host are each the same as described above, and the bipolar host is the same as described below.

In an embodiment, the first compound may be a hole transporting host and the second compound may be an electron transporting host, the first compound may be an electron transporting host and the second compound may be a hole transporting host, the first compound and the second compound may each be a bipolar host, the first compound may be a hole transporting host and the second compound may be a bipolar host, the first compound may be an electron transporting host and the second compound may be a bipolar host, the first compound may be a bipolar host and the second compound may be a hole transporting host, or the first compound may be a bipolar host and the second compound may be an electron transporting host.

The third compound and the fourth compound are each the same as described in the first embodiment.

Hole-Transporting Region 12

The hole-transporting region 12 may be located between the first electrode 11 and the emission layer 15 of the organic light-emitting device 10.

The hole-transporting region 12 may have a single-layered structure or a multi-layered structure.

In an embodiment, the hole-transporting region 12 may have a hole injection layer, a hole-transporting layer, a hole injection layer/hole-transporting layer structure, a hole injection layer/first hole-transporting layer/second hole-transporting layer structure, a hole-transporting layer/middle layer structure, a hole injection layer/hole-transporting layer/middle layer structure, a hole-transporting layer/electron blocking layer structure, or a hole injection layer/hole-transporting layer/electron blocking layer structure, but embodiments of the disclosure are not limited thereto.

The hole-transporting region 12 may include any compound having hole-transporting properties.

In an embodiment, the hole-transporting region 12 may include an amine-based compound.

In an embodiment, the hole-transporting region 12 may include at least one of a compound represented by Formula 201 to a compound represented by Formula 205, but embodiments of the disclosure are not limited thereto:

Formula 201

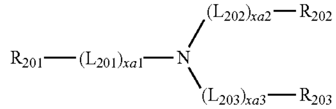

Formula 202

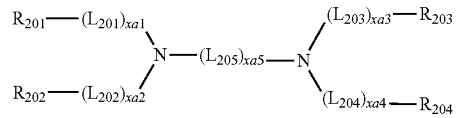

-continued

Formula 203

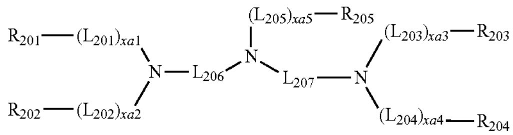

Formula 204

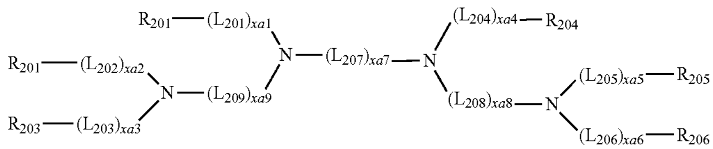

Formula 205

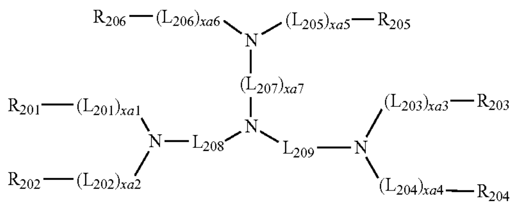

wherein, in Formulae 201 to 205, $L_{201}$ to $L_{209}$ may each independently *-be O—', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, and $R_{201}$ to $R_{206}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein neighboring two a group of $R_{201}$ to $R_{206}$ may optionally be linked to each other via a single bond, a dimethyl-methylene group, or a diphenyl-methylene group.

In an embodiment, $L_{201}$ to $L_{209}$ may be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group, each unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —Si($Q_{11}$)($Q_{12}$)($Q_{13}$), or a combination thereof, xa1 to xa9 may each independently be 0, 1, or 2, and $R_{201}$ to $R_{206}$ may each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, or a benzothienocarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, —$N(Q_{31})(Q_{32})$, or any combination thereof, wherein $Q_{11}$ to $Q_{13}$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In an embodiment, the hole-transporting region 12 may include a carbazole-containing amine-based compound.

In an embodiment, the hole-transporting region 12 may include a carbazole-containing amine-based compound and a carbazole-free amine-based compound.

The carbazole-containing amine-based compound may be, for example, a compound represented by Formula 201 including a carbazole group and further including at least one of a dibenzofuran group, a dibenzothiophene group, a fluorene group, a spiro-bifluorene group, an indenocarbazole group, an indolocarbazole group, a benzofurocarbazole group, a benzothienocarbazole group, or a combination thereof.

The carbazole-free amine-based compound may be, for example, a compound represented by Formula 201 which does not include a carbazole group and which includes at least one a dibenzofuran group, a dibenzothiophene group, a fluorene group, a spiro-bifluorene group, an indenocarbazole group, an indolocarbazole group, a benzofurocarbazole group, a benzothienocarbazole group, or a combination thereof.

In an embodiment, the hole-transporting region 12 may include at least one compound represented by Formulae 201 and 202.

In an embodiment, the hole-transporting region 12 may include at least one compound represented by Formulae 201-1, 202-1, 201-2, or a combination thereof, but embodiments of the disclosure are not limited thereto:

Formula 201-1

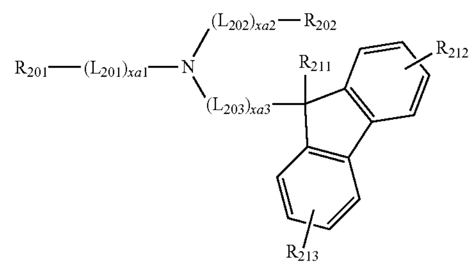

Formula 202-1

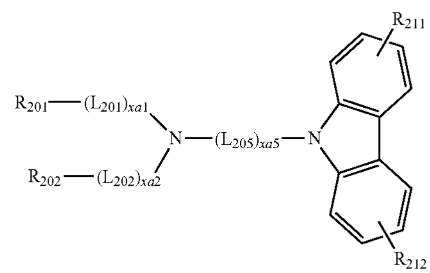

Formula 201-2

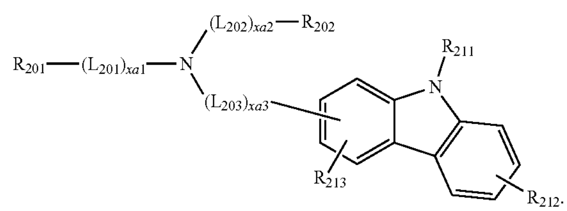

In Formulae 201-1, 202-1, and 201-2, $L_{201}$ to $L_{203}$, $L_{205}$, xa1 to xa3, xa5, $R_{201}$ and $R_{202}$ are the same as described herein, and $R_{211}$ to $R_{213}$ are each independently hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

In an embodiment, the hole-transporting region 12 may include at least one of Compounds HT1 to HT39, but embodiments of the disclosure are not limited thereto.

HT1
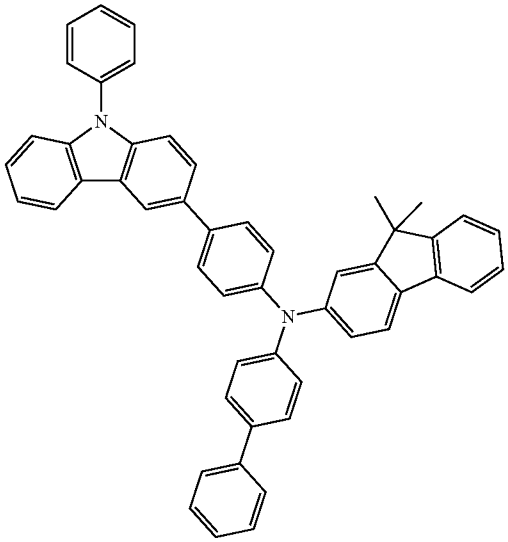
HT2
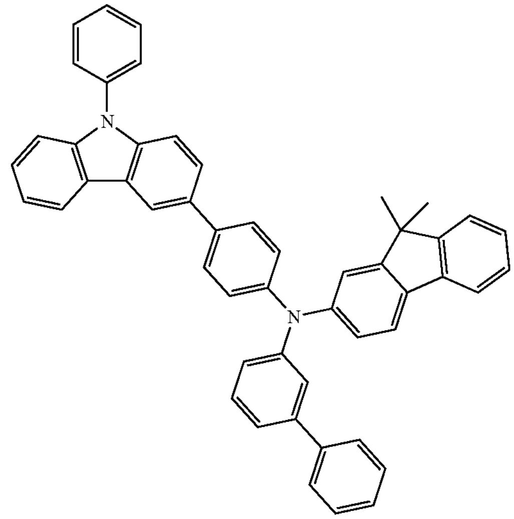
HT3
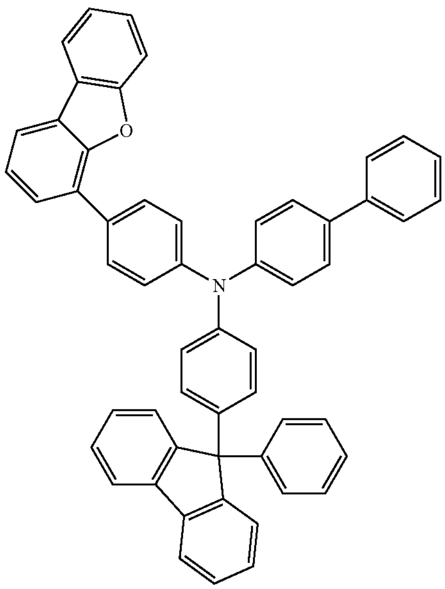
HT4
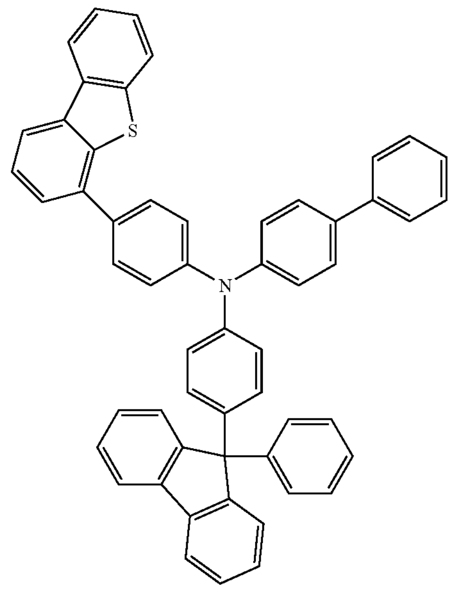
HT5
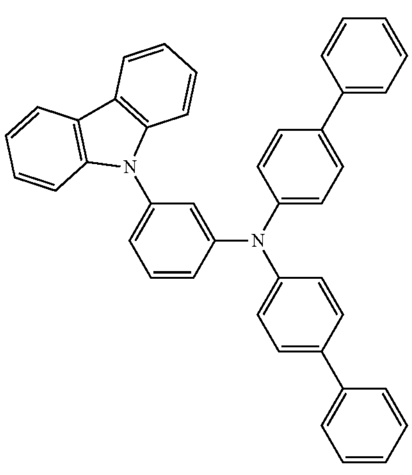
HT6
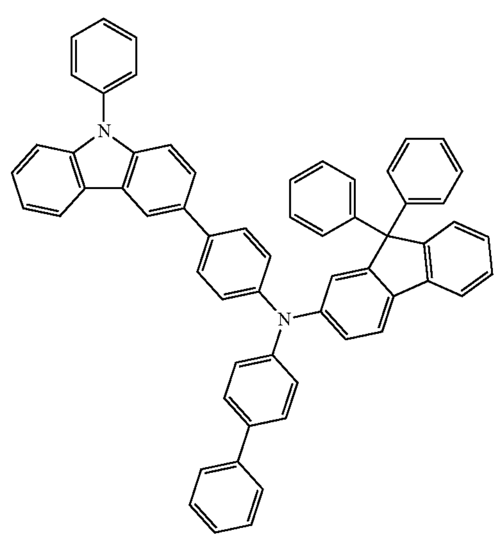

-continued
HT7
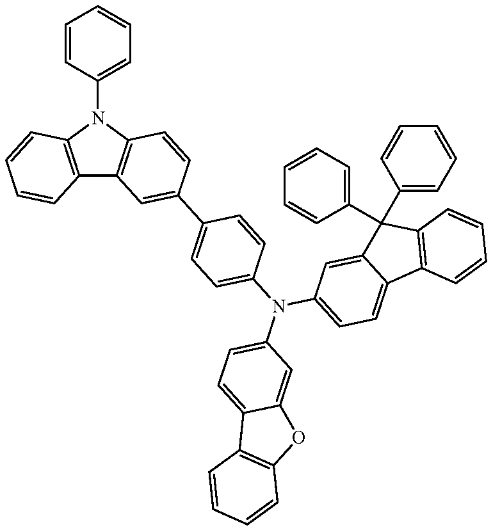
HT8
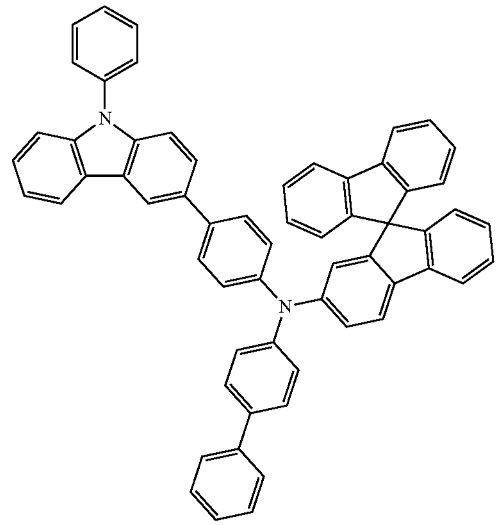
HT9
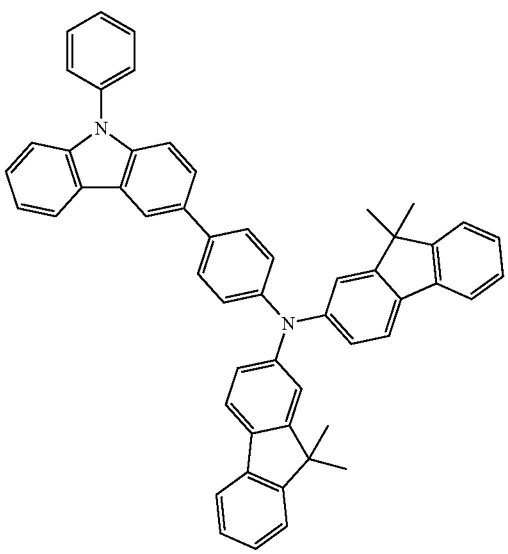
HT10
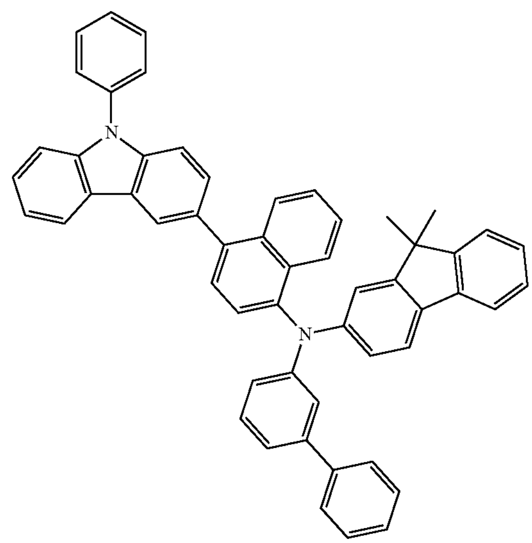
HT11
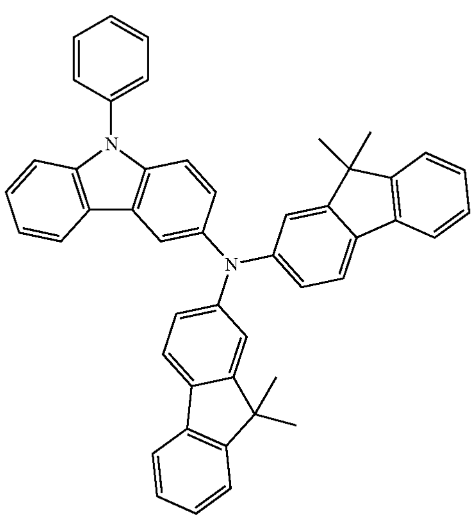
HT12
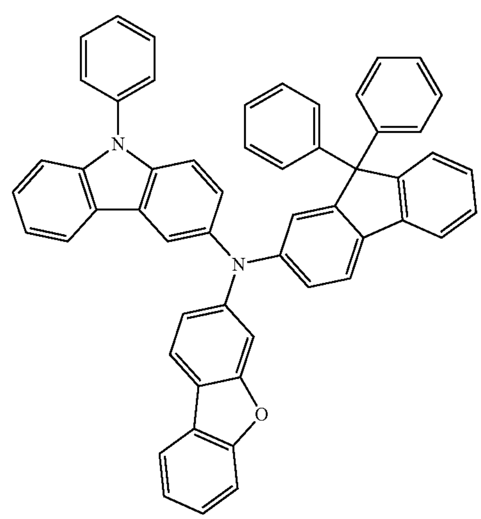

-continued
HT13
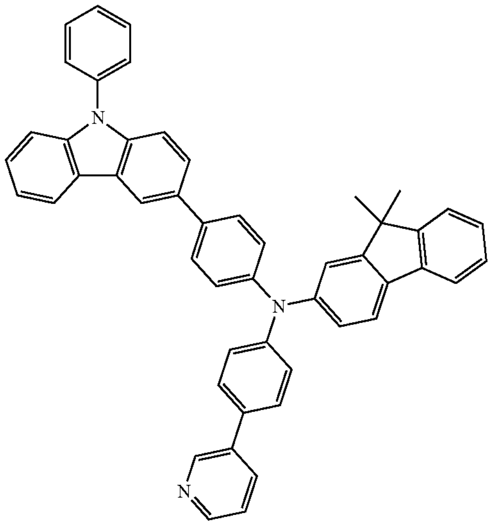
HT14
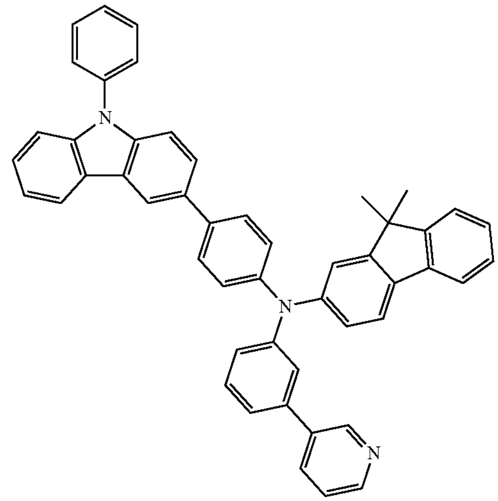
HT15
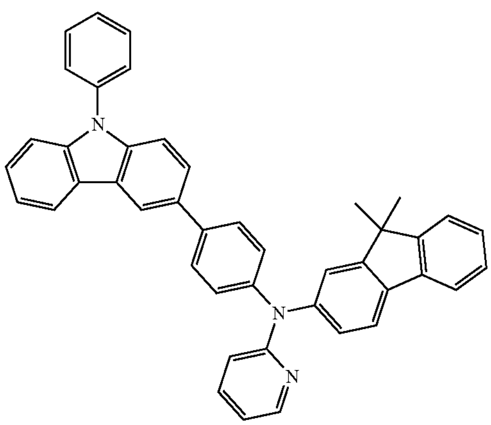
HT16
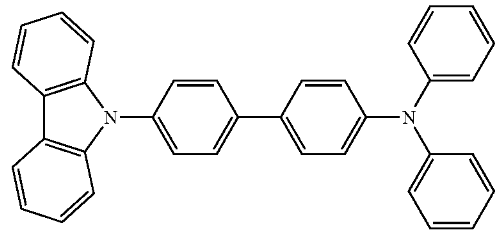
HT17
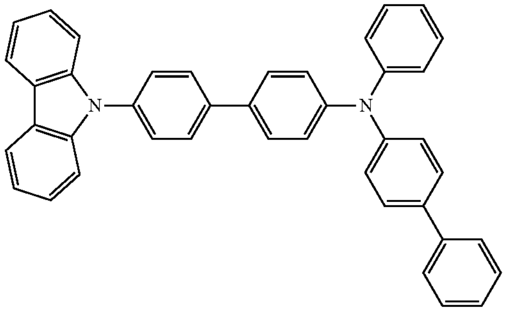
HT18
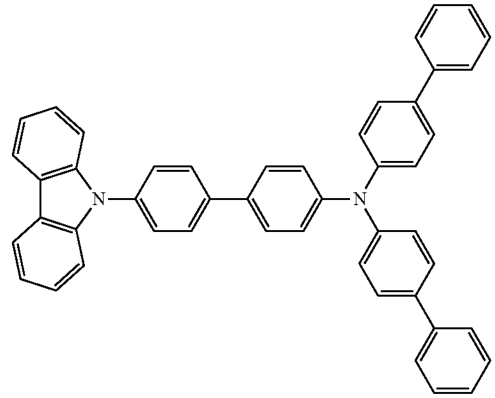

-continued
HT19
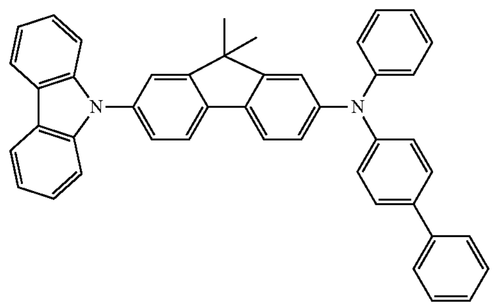
HT20
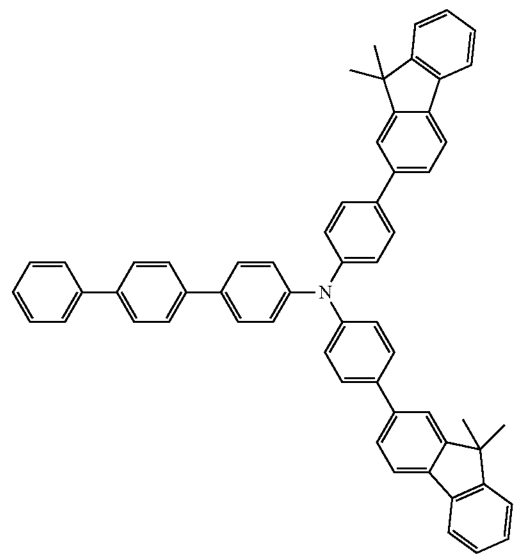
HT21
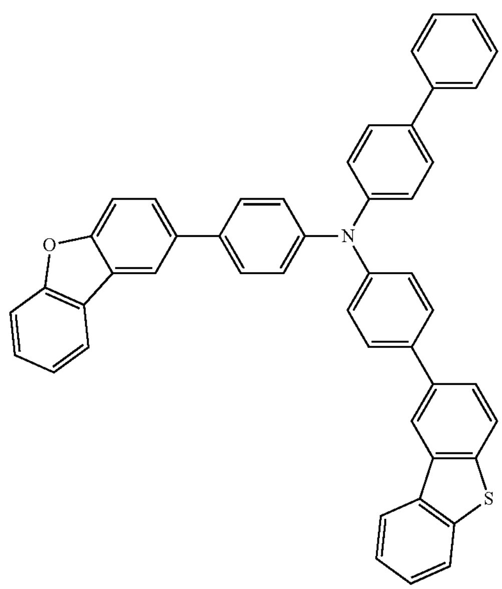
HT22
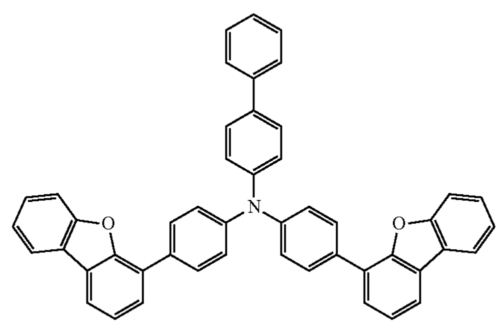
HT23
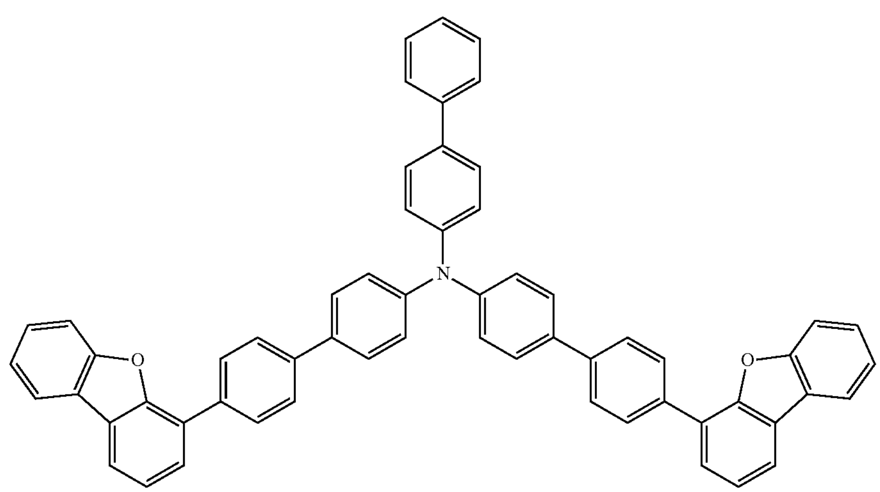

-continued
HT24
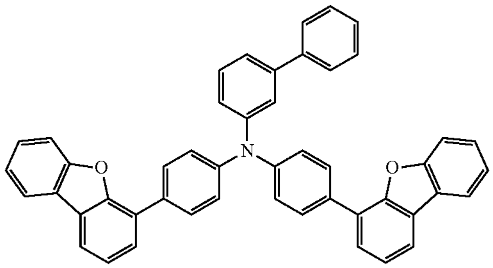
HT25
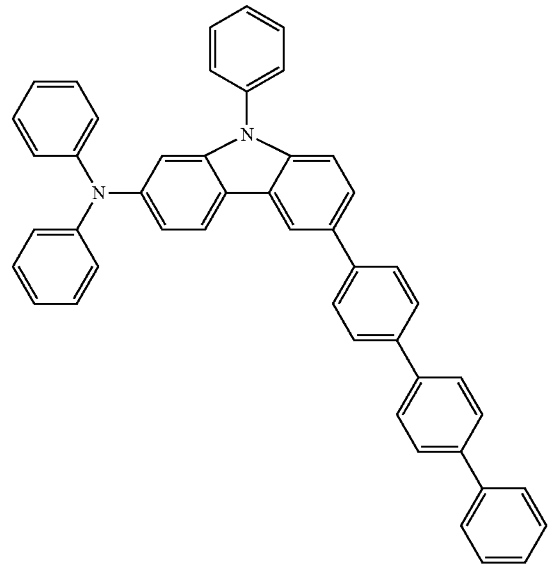
HT26
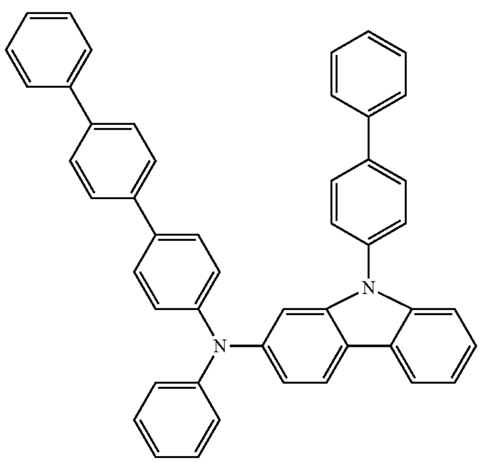
HT27
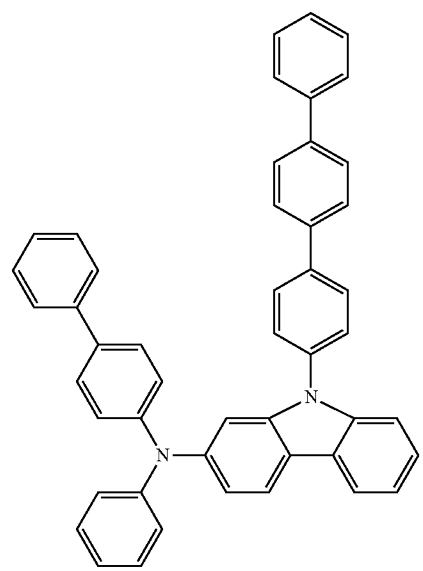
HT28
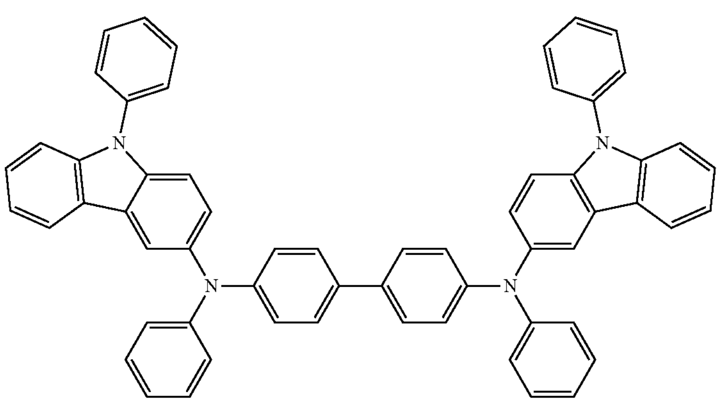

-continued
HT29
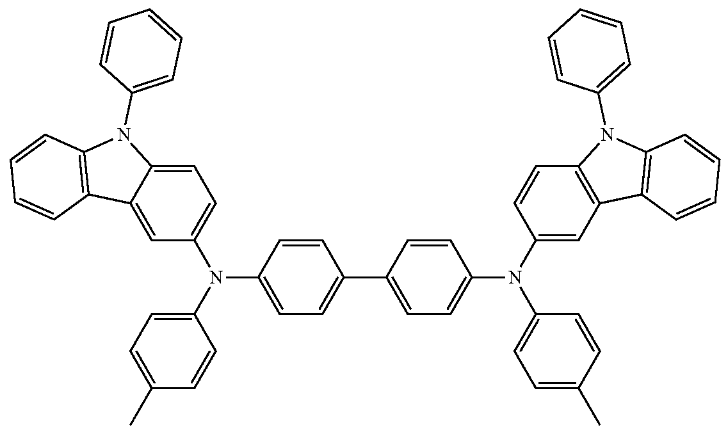
HT30
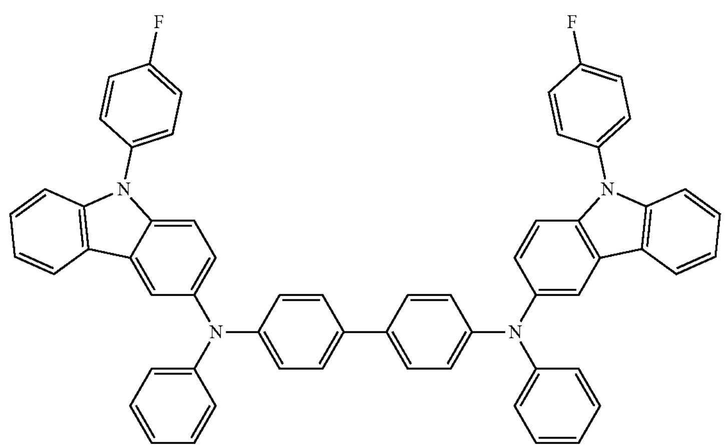
HT31
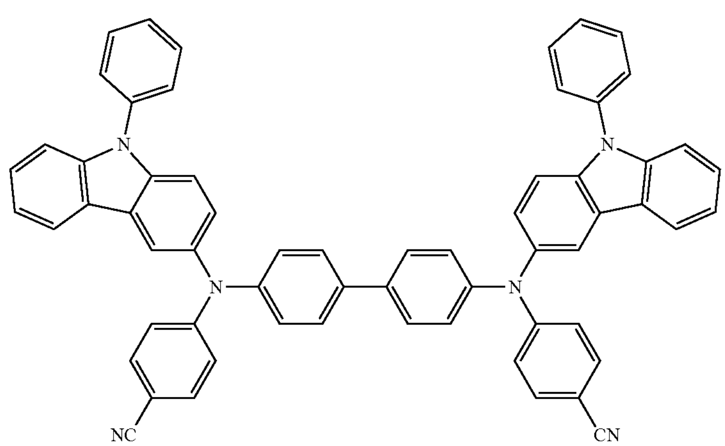

-continued
HT32
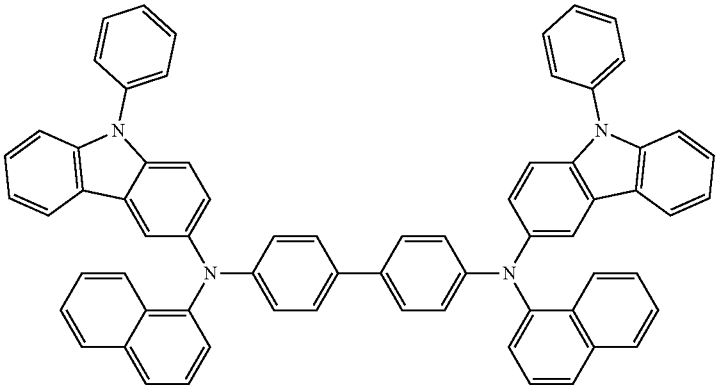
HT33
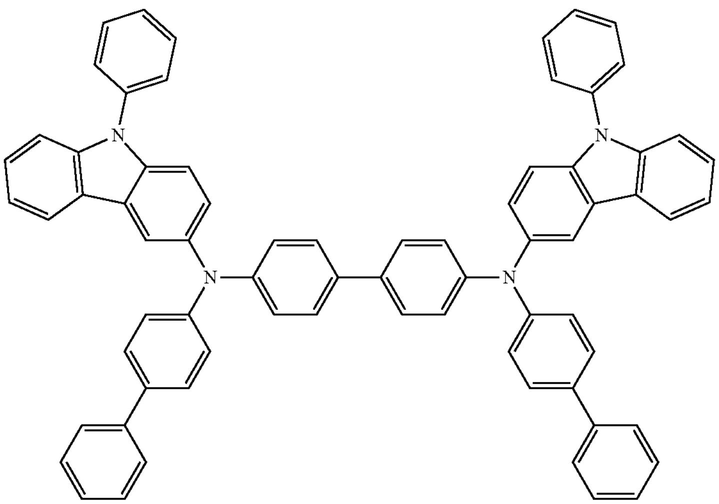
HTY34
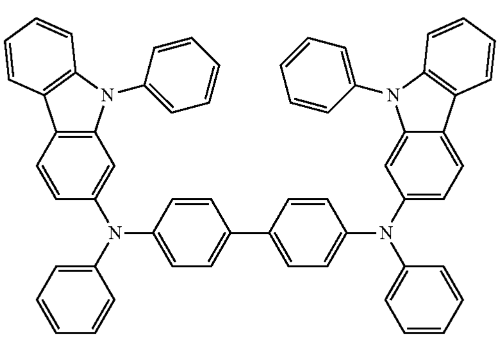
HT35
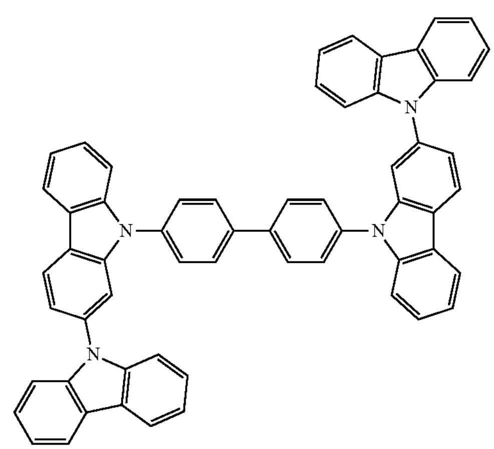

-continued

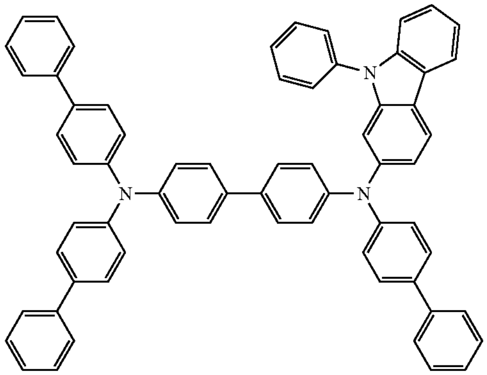
HT36

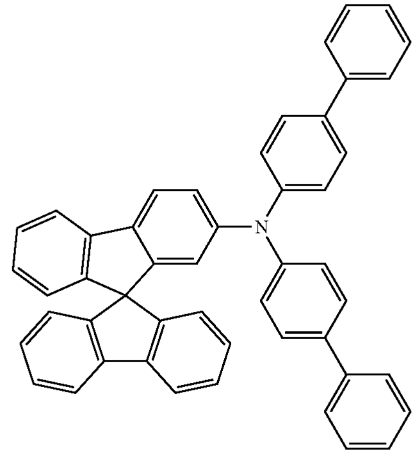
HT37

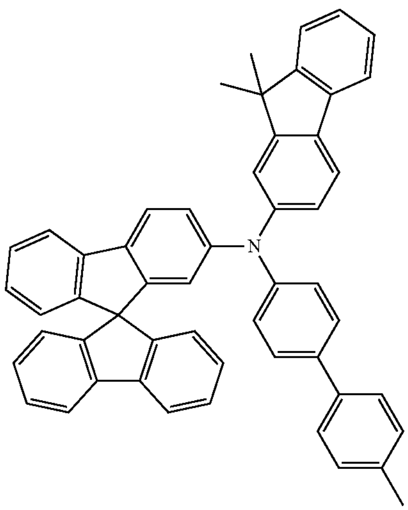
HT38

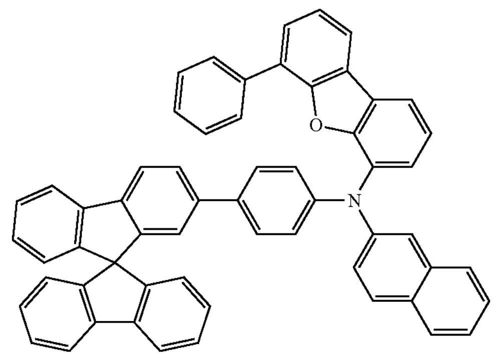
HT39

In an embodiment, the hole-transporting region 12 of the organic light-emitting device 10 may further include a p-dopant. When the hole-transporting region 12 further includes a p-dopant, the hole-transporting region 12 may have a matrix (for example, at least one of compounds represented by Formulae 201 to 205) and a p-dopant included in the matrix. The p-dopant may be uniformly or non-uniformly doped in the hole-transporting region 12.

In an embodiment, a lowest unoccupied molecular orbital (LUMO) energy level of the p-dopant may be about −3.5 eV or less.

The p-dopant may include at least one of a quinone derivative, a metal oxide, a cyano group-containing compound, or a combination thereof, but embodiments of the disclosure are not limited thereto.

In an embodiment, the p-dopant may include at least one of:

a quinone derivative, such as tetracyanoquinodimethane (TCNQ),2,3,5,6-tetrafluoro-7,7,8,8-tetracyanoquinodimethane (F4-TCNQ), and F6-TCNNQ;

a metal oxide, such as tungsten oxide or molybdenum oxide;

1,4,5,8,9,12-hexaazatriphenylene-hexacarbonitrile (HAT-CN); and a compound represented by Formula 221 below, but embodiments of the disclosure are not limited thereto:

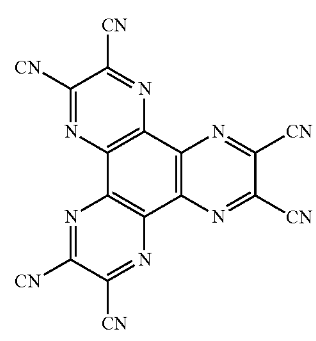
HAT-CN

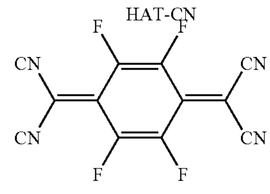
F4-TCNQ

-continued

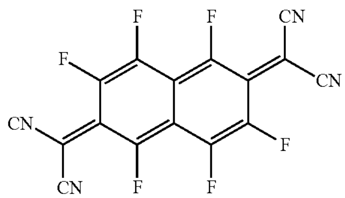

F6-TCNNQ

Formula 221

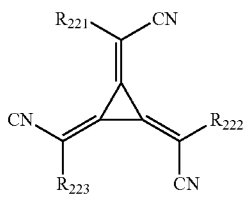

wherein, in Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and at least one $R_{221}$ to $R_{223}$ may have at least one substituent of a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, a $C_1$-$C_{20}$ alkyl group substituted with —I, or a combination thereof.

The hole-transporting region 12 may have a thickness of about 100 Å to about 10000 Å, for example, about 400 Å to about 2000 Å, and the emission layer 15 may have a thickness of about 100 Å to about 3000 Å, for example, about 300 Å to about 1000 Å. When the thickness of each of the hole-transporting region 12 and the emission layer 15 is within these ranges described above, satisfactory hole transportation characteristics and/or luminescent characteristics may be obtained without a substantial increase in driving voltage.

Electron-Transporting Region 17

The electron-transporting region 17 may be placed between the emission layer 15 and the second electrode 19 of the organic light-emitting device 10.

The electron-transporting region 17 may have a single-layered structure or a multi-layered structure.

In an embodiment, the electron-transporting region 17 may have an electron-transporting layer, an electron-transporting layer/electron injection layer structure, a buffer layer/electron-transporting layer structure, a hole blocking layer/electron-transporting layer structure, a buffer layer/electron-transporting layer/electron injection layer structure, or a hole blocking layer/electron-transporting layer/electron injection layer structure, but embodiments of the disclosure are not limited thereto. The electron-transporting region 17 may further include an electron control layer.

The electron-transporting region 17 may include known electron-transporting materials.

The electron-transporting region 17 (for example, a buffer layer, a hole blocking layer, an electron control layer, or an electron-transporting layer in the electron-transporting region) may include a metal-free compound containing at least one π electron-deficient nitrogen-containing cyclic group. The π electron-deficient nitrogen-containing cyclic group is the same as described above.

In an embodiment, the electron-transporting region may include a compound represented by Formula 601 below:

$$[Ar_{601}]_{xe11}-[(L_{601})_{xe1}-R_{601}]_{xe21} \quad \text{Formula 601}$$

wherein, in Formula 601, $Ar_{601}$ and $L_{601}$ may each independently be a substituted or unsubstituted $C_5$-$C_{60}$ carbocyclic group or a substituted or unsubstituted $C_1$-$C_{60}$ heterocyclic group, xe11 may be 1, 2, or 3, xe1 may be an integer from 0 to 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_5$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{601})(Q_{602})(Q_{603})$, $—C(=O)(Q_{601})$, $—S(=O)_2(Q_{601})$, or $P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the π electron-deficient nitrogen-containing cyclic group.

In an embodiment, ring $Ar_{601}$ and $L_{601}$ in Formula 601 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, $—Si(Q_{31})(Q_{32})(Q_{33})$, $—S(=O)_2(Q_{31})$, or $—P(=O)(Q_{31})(Q_{32})$, wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

When xe11 in Formula 601 is 2 or more, two or more of $Ar_{601}$(s) may be linked to each other via a single bond.

In an embodiment, $Ar_{601}$ in Formula 601 may be an anthracene group.

In an embodiment, a compound represented by Formula 601 may be represented by Formula 601-1 below:

Formula 601-1

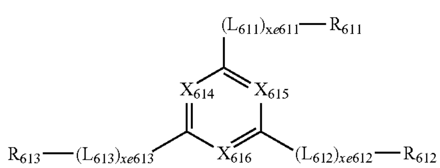

wherein, in Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, or a naphthyl group.

In an embodiment, xe1 and xe611 to xe613 in Formulae 601 and 601-1 may each independently be 0, 1, or 2.

In an embodiment, $R_{601}$ and $R_{611}$ to $R_{613}$ in Formulae 601 and 601-1 may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group; or $—S(=O)_2(Q_{601})$ and $—P(=O)(Q_{601})(Q_{602})$, wherein $Q_{601}$ and $Q_{602}$ are each the same as described above.

The electron-transporting region may include at least one compound of Compounds ET1 to ET36, but embodiments of the disclosure are not limited thereto:

ET1
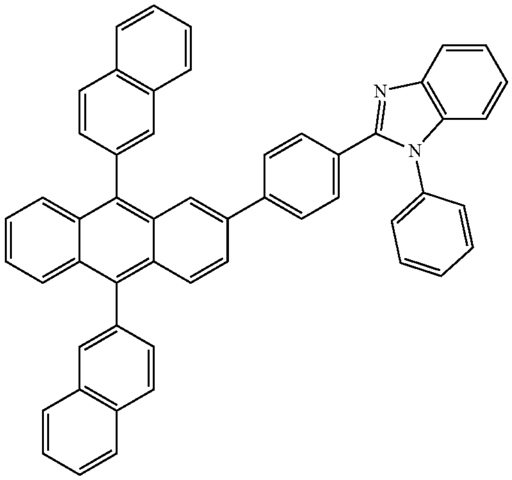
ET2
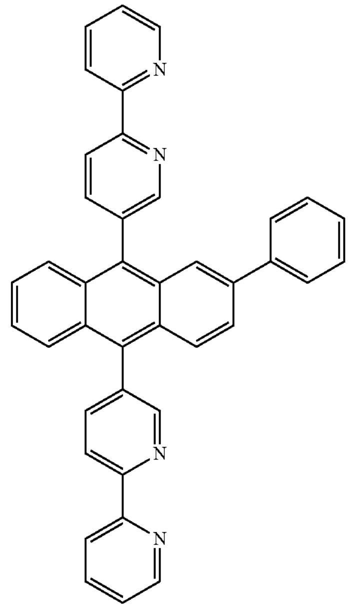
ET3
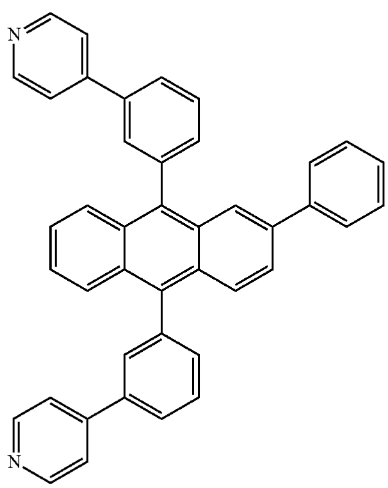
ET4
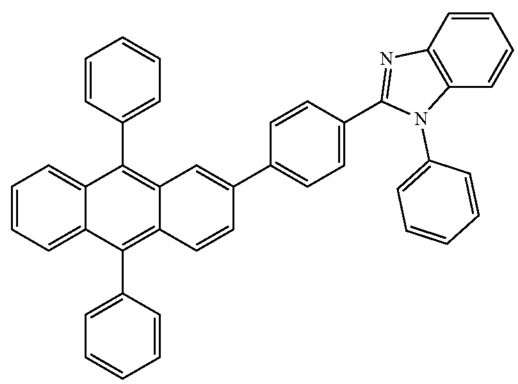
ET5
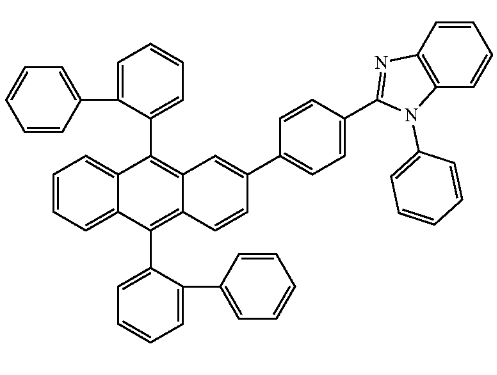
ET6
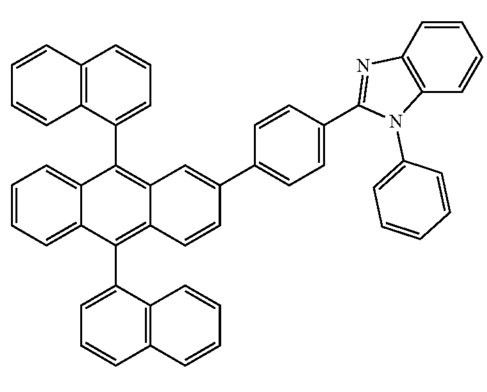

-continued
ET7
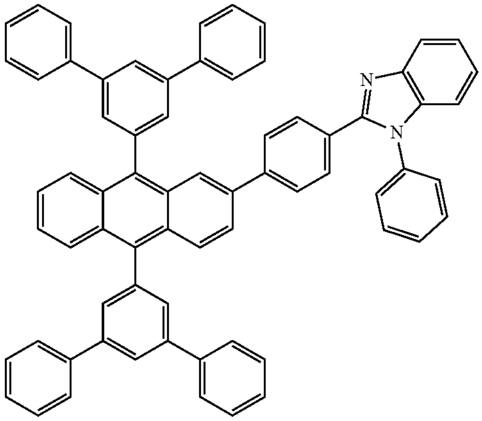
ET8
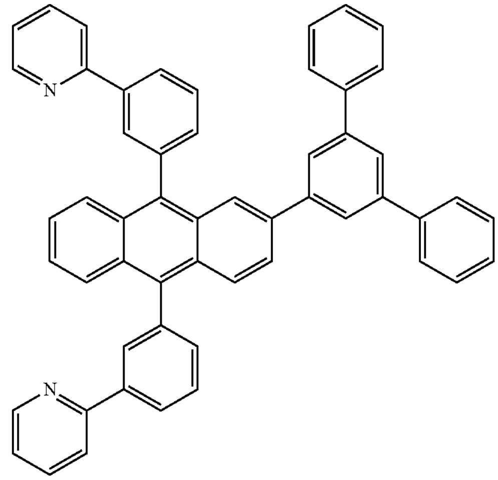
ET9
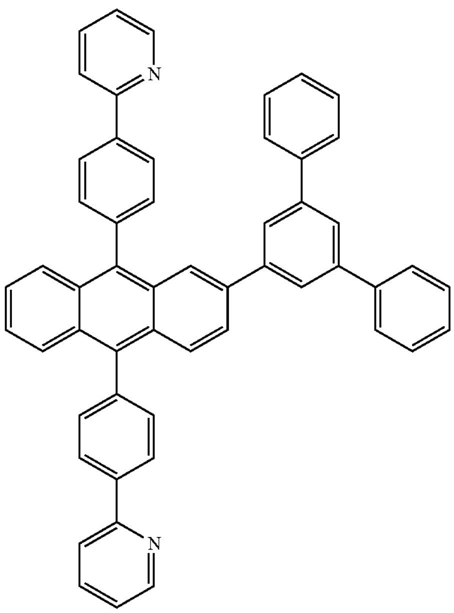
ET10
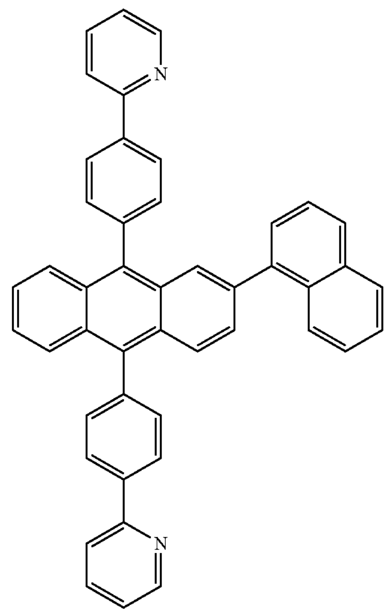
ET11
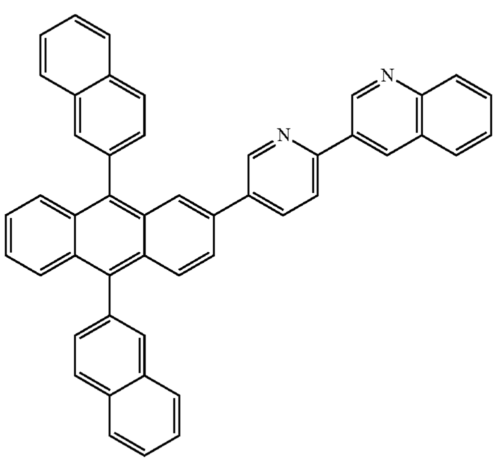
ET12
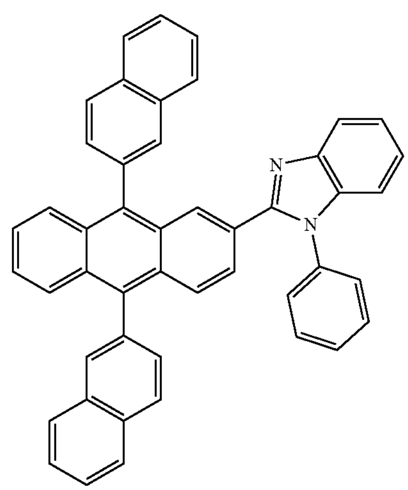

-continued
ET13
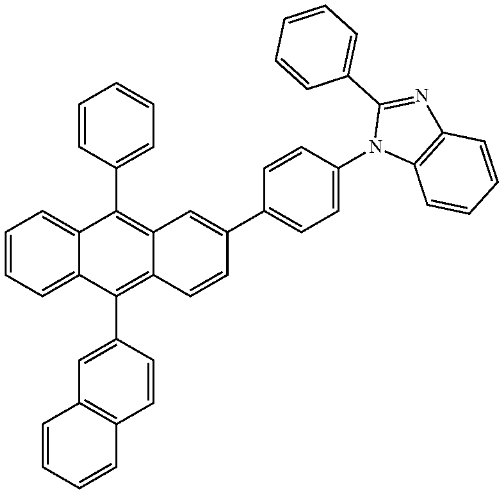
ET14
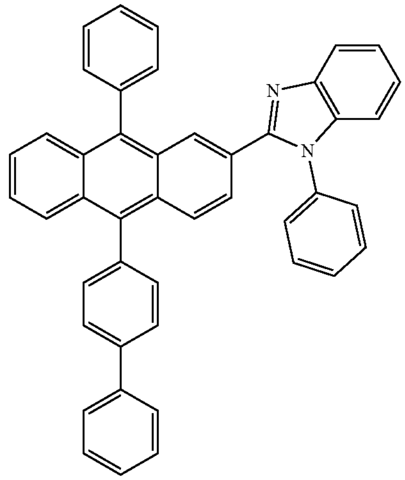
ET15
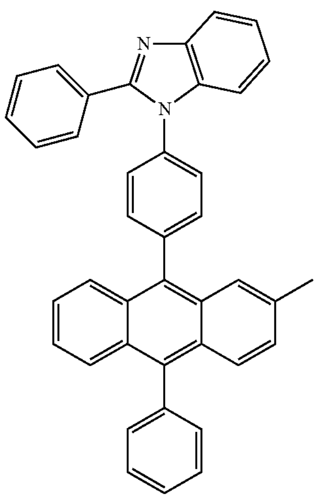
ET16
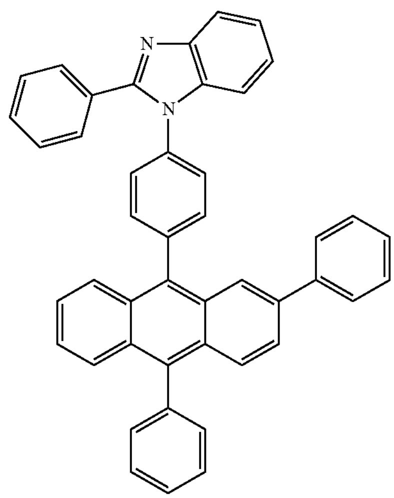
ET17
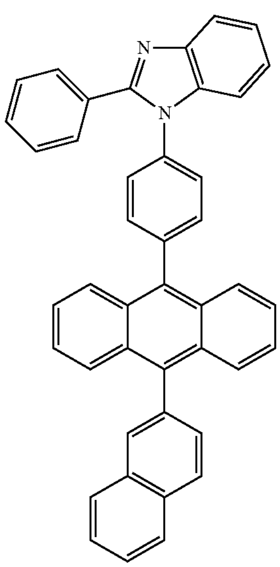
ET18
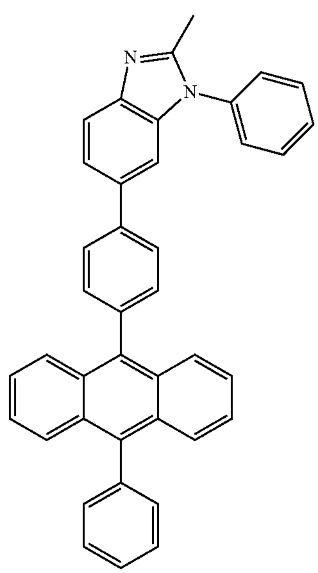

-continued
ET19
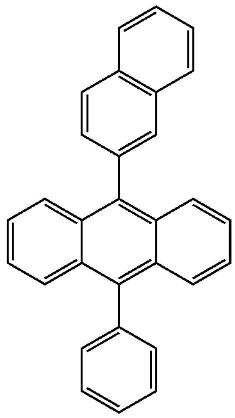
ET20
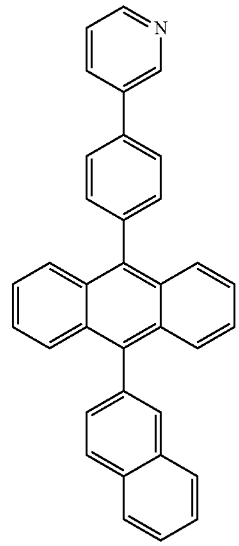
ET21
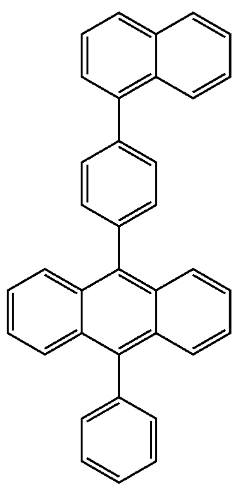
ET22
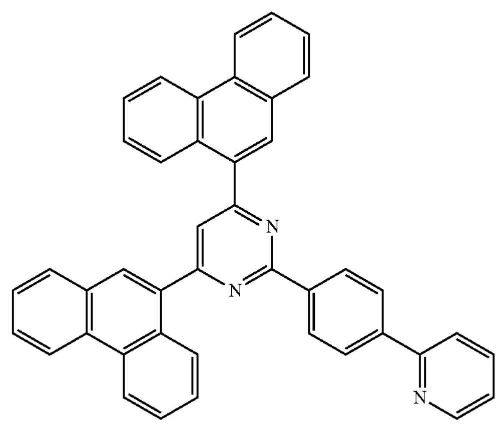
ET23
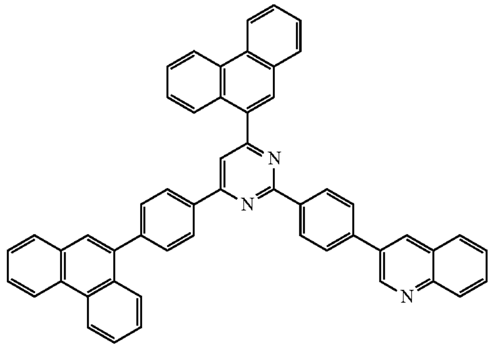
ET24
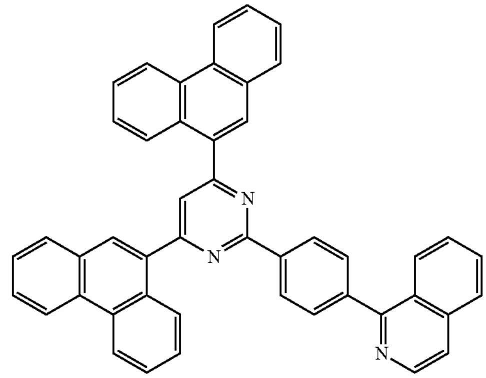

-continued
ET25
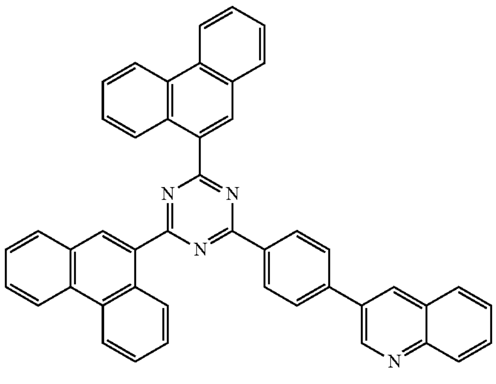
ET26
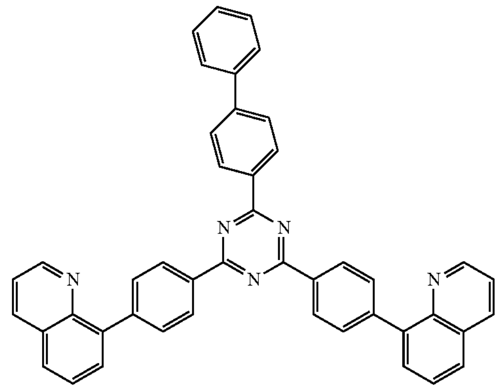
ET27
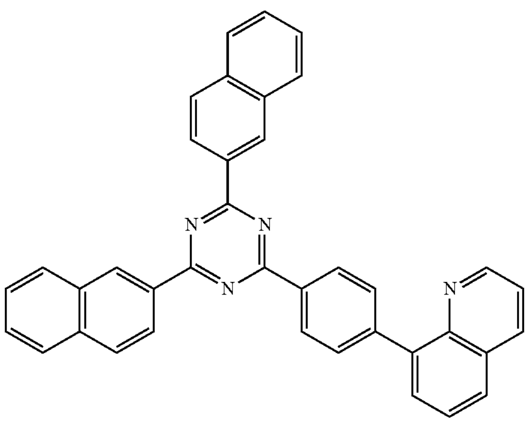
ET28
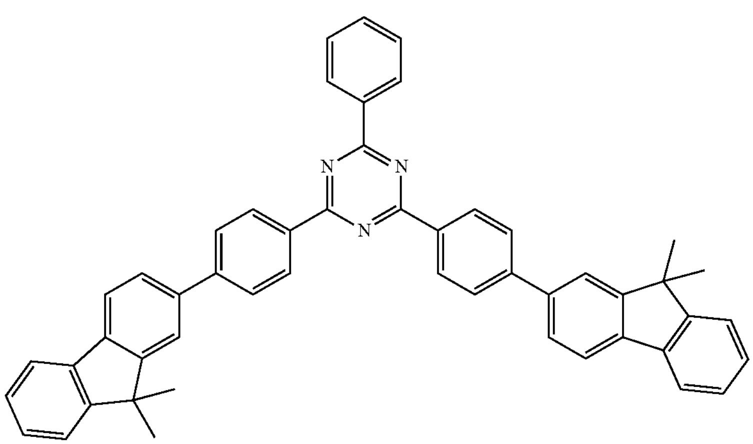

-continued
ET29
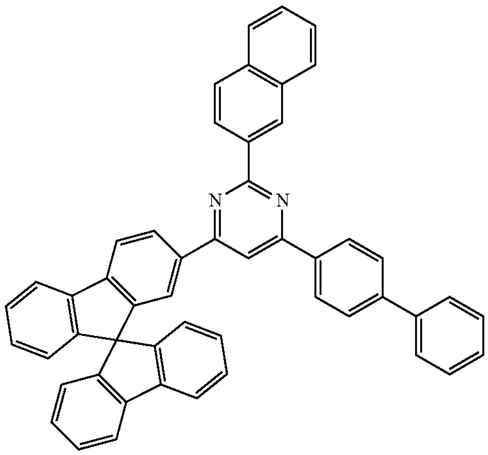
ET30
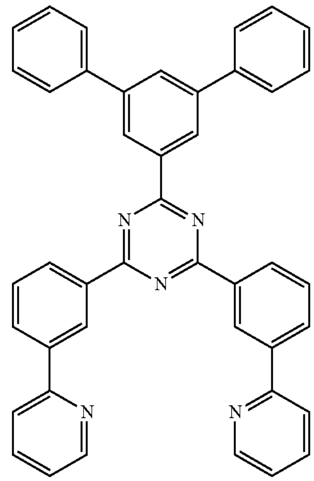
ET31
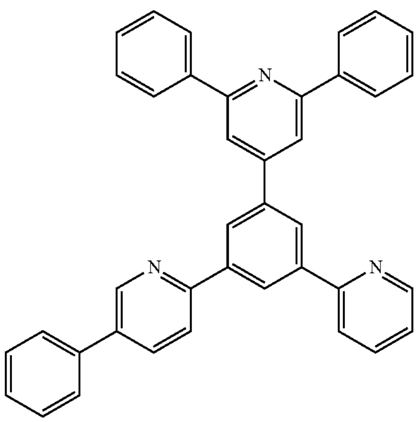
ET32
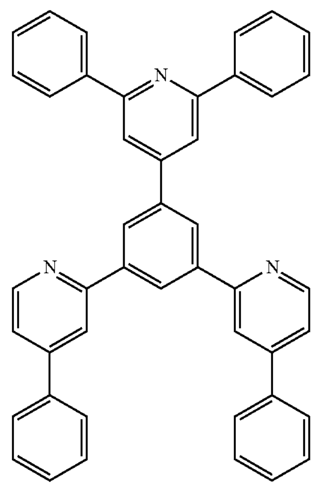
ET33
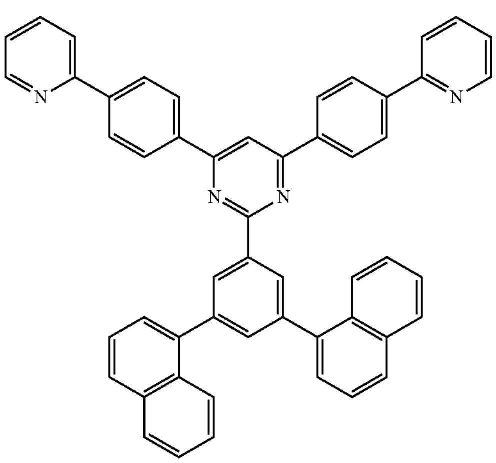
ET34
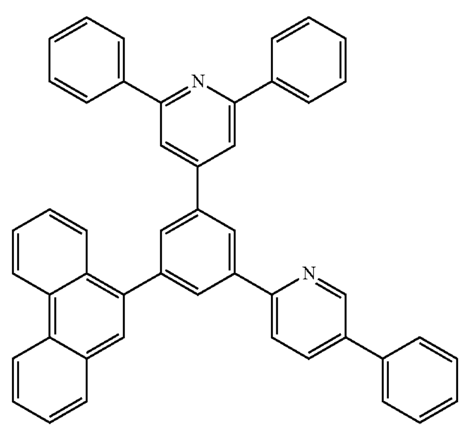

-continued

ET35

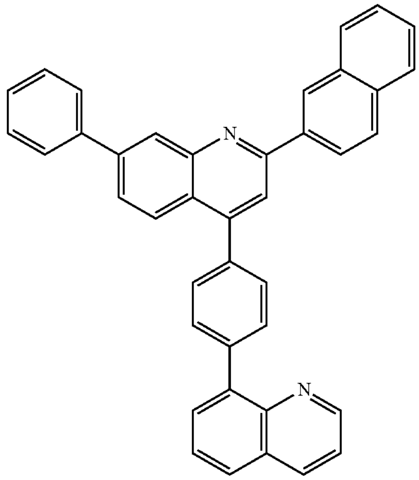

ET36

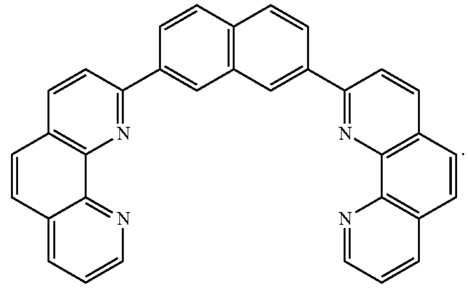

In an embodiment, the electron-transporting region may include at least one of 2,9-dimethyl-4,7-diphenyl-1,10-phenanthroline (BCP), 4,7-dphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, or a combination thereof.

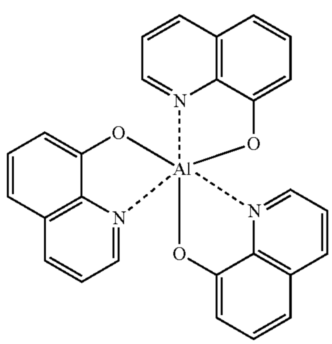

$Alq_3$

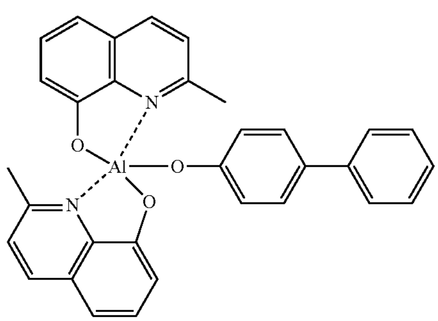

BAlq

-continued

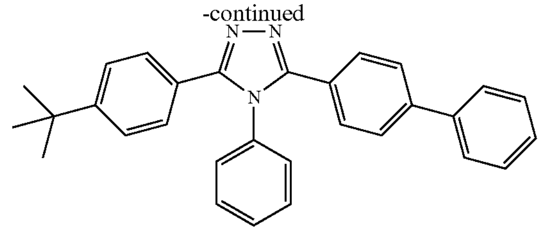

TAZ

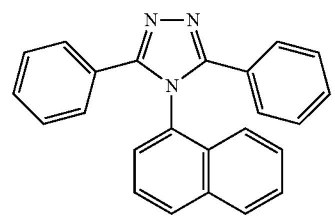

NTAZ

Thicknesses of the buffer layer, the hole blocking layer, and the electron control layer may each independently be in the range of about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron-transporting layer may be in the range of about 100 Å to about 1,000 Å, for example, about 150 Å to about 500 Å. When the thickness of the electron-transporting layer is within the range described above, the electron-transporting layer may have satisfactory electron-transporting characteristics without a substantial increase in driving voltage.

The electron-transporting region 17 (for example, the electron-transporting layer in the electron-transporting region) may further include, in addition to the materials described above, a metal-containing material.

The metal-containing material may include at least one alkali metal complex and alkaline earth-metal complex. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, or a cyclopentadiene, but embodiments of the disclosure are not limited thereto.

In an embodiment, the metal-containing material may include a Li complex. The Li complex may include, for example, Compound ET-D1 (lithium quinolate, LiQ) or ET-D2:

ET-D1

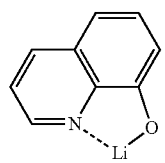

ET-D2

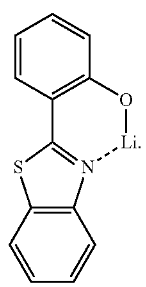

The electron-transporting region 17 may include an electron injection layer that facilitates the injection of electrons from the second electrode 19. The electron injection layer may directly contact the second electrode 19.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may include Li, Na, K, Rb, or Cs. In an embodiment, the alkali metal may be Li, Na, or Cs. In an embodiment, the alkali metal may be Li or Cs, but embodiments of the disclosure are not limited thereto.

The alkaline earth metal may be Mg, Ca, Sr, or Ba.

The rare earth metal may be Sc, Y, Ce, Tb, Yb, or Gd.

The alkali metal compound, the alkaline earth-metal compound, and the rare earth metal compound may be oxides and halides (for example, fluorides, chlorides, bromides, or iodides) of the alkali metal, the alkaline earth-metal, and the rare earth metal.

The alkali metal compound may be alkali metal oxides, such as $Li_2O$, $Cs_2O$, or $K_2O$, and alkali metal halides, such as LiF, NaF, CsF, KF, LiI, NaI, CsI, or KI. In an embodiment, the alkali metal compound may be LiF, $Li_2O$, NaF, LiI, NaI, CsI, or KI, but embodiments of the disclosure are not limited thereto.

The alkaline earth-metal compound may be alkaline earth-metal oxides, such as BaO, SrO, CaO, $Ba_xSr_{1-x}O$ ($0<x<1$), or $Ba_xCa_{1-x}O$ ($0<x<1$). In an embodiment, the alkaline earth-metal compound may be BaO, SrO, or CaO, but embodiments of the disclosure are not limited thereto.

The rare earth metal compound may be $YbF_3$, $ScF_3$, $ScO_3$, $Y_2O_3$, $Ce_2O_3$, $GdF_3$, or $TbF_3$. In an embodiment, the rare earth metal compound may be $YbF_3$, $ScF_3$, $TbF_3$, $YbI_3$, $ScI_3$, or $TbI_3$, but embodiments of the disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, or cyclopentadiene, but embodiments of the disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

Second Electrode 19

The second electrode 19 is located on the organic layer 10A having such a structure. The second electrode 19 may be a cathode which is an electron injection electrode, and in this regard, a material for forming the second electrode 19 may be a metal, an alloy, an electrically conductive compound, or a combination thereof, which have a relatively low work function.

The second electrode 19 may include at least one of lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or a combination thereof, but embodiments of the disclosure are not limited thereto. The second electrode 19 may be a transmissive electrode, a semi-transmissive electrode, or a reflective electrode.

The second electrode 19 may have a single-layered structure having a single layer or a multi-layered structure including two or more layers.

Hereinbefore, the organic light-emitting device has been described with reference to FIG. 1, but embodiments of the disclosure are not limited thereto.

Figure 2:
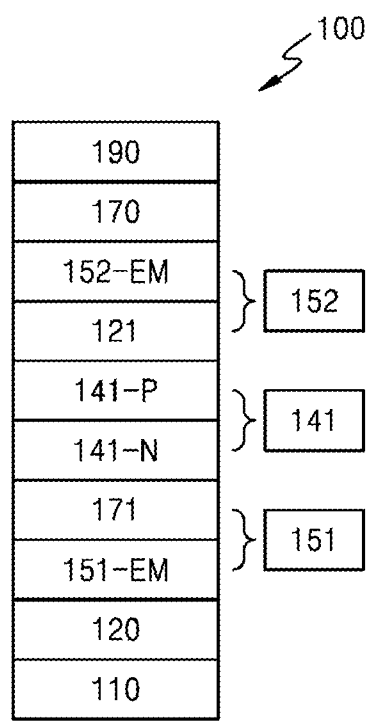
FIG. 2 is a schematic cross-sectional view of an organic light-emitting device, according to another exemplary embodiment.

Description of FIG. 2

FIG. 2 is a schematic cross-sectional view of an organic light-emitting device 100 according to another exemplary embodiment.

The organic light-emitting device 100 of FIG. 2 includes a first electrode 110, a second electrode 190 facing the first electrode 110, and a first light-emitting unit 151 and a second light-emitting unit 152 between the first electrode 110 and the second electrode 190. A charge generation layer 141 is located between the first light-emitting unit 151 and the second light-emitting unit 152, and the charge generation layer 141 may include an n-type charge generation layer 141-N and a p-type charge generation layer 141-P. The charge generation layer 141 is a layer that generates charge and supplies the charge to neighboring light-emitting units, and any known material may be used therefor.

The first light-emitting unit 151 may include a first emission layer 151-EM, and the second light-emitting unit 152 may include a second emission layer 152-EM. The maximum emission wavelength of light emitted from the first light-emitting unit 151 may be different from the maximum emission wavelength of light emitted from the second light-emitting unit 152. For example, the mixed light including the light emitted from the first light-emitting unit 151 and the light emitted from the second light-emitting unit 152 may be white light, but embodiments of the disclosure are not limited thereto.

The hole-transporting region 120 is located between the first light-emitting unit 151 and the first electrode 110, and the second light-emitting unit 152 may include the first hole-transporting region 121 located on the side of the first electrode 110.

An electron-transporting region 170 is located between the second light-emitting unit 152 and the second electrode 190, and the first light-emitting unit 151 may include a first electron-transporting region 171 located between the charge generation layer 141 and the first emission layer 151-EM.

The first emission layer 151-EM may include a first compound, a second compound, and a third compound, wherein the first compound and the second compound form an exciplex, and the exciplex and the third compound may satisfy Conditions 1-1 and 1-2 above.

The second emission layer 152-EM may include a first compound, a second compound, and a third compound, wherein the first compound and the second compound form an exciplex, and the exciplex and the third compound may satisfy Conditions 1-1 and 1-2 above.

The first electrode 110 and the second electrode 190 illustrated in FIG. 2 may be the same as described in connection with the first electrode 11 and the second electrode 19 illustrated in FIG. 1.

Figure 3:
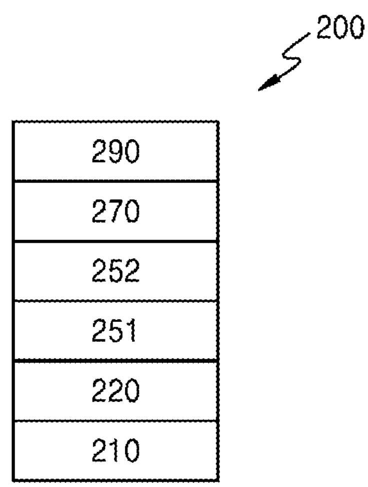
FIG. 3 is a schematic cross-sectional view of an organic light-emitting device, according to another exemplary embodiment.

The first emission layer 151-EM and the second emission layer 152-EM illustrated in FIG. 3 are each the same as described in connection with the emission layer 15 illustrated in FIG. 1.

The hole-transporting region 120 and the first hole-transporting region 121 illustrated in FIG. 2 are each the same as described in connection with the hole-transporting region 12 illustrated in FIG. 1.

The electron-transporting region 170 and the first electron-transporting region 171 illustrated in FIG. 2 are each the same as described in connection with the electron-transporting region 17 illustrated in FIG. 1.

As described above, referring to FIG. 2, an organic light-emitting device in which each of the first light-emitting unit 151 and the second light-emitting unit 152 includes an emission layer including a first compound, a second compound, and a third compound, has been described. However, the organic light-emitting device may have various other forms. For example, one of the first light-emitting unit 151 and the second light-emitting unit 152 of the organic light-emitting device 100 of FIG. 2 may be replaced with any known light-emitting unit, or may include three or more light-emitting units.

Description of FIG. 3

FIG. 3 is a schematic cross-sectional view of an organic light-emitting device 200 according to another embodiment.

The organic light-emitting device 200 includes a first electrode 210, a second electrode 290 facing the first electrode 210, and a first emission layer 251 and a second emission layer 252 which are stacked between the first electrode 210 and the second electrode 290.

The maximum emission wavelength of light emitted from the first emission layer 251 may be different from the maximum emission wavelength of light emitted from the second emission layer 252. For example, the mixed light of the light emitted from the first emission layer 251 and the light emitted from the second emission layer 252 may be white light, but embodiments of the disclosure are not limited thereto.

In one or more embodiments, a hole-transporting region 220 may be located between the first emission layer 251 and the first electrode 210, and an electron-transporting region 270 may be located between the second emission layer 252 and the second electrode 290.

The first emission layer 251 may include a first compound, a second compound, and a third compound, wherein the first compound and the second compound form an exciplex, and the exciplex and the third compound may satisfy Conditions 1-1 and 1-2 above.

The second emission layer 252 may include a first compound, a second compound, and a third compound, wherein the first compound and the second compound form an exciplex, and the exciplex and the third compound may satisfy Conditions 1-1 and 1-2 above.

The first electrode 210, the hole-transporting region 220, and the second electrode 290 illustrated in FIG. 3 are respectively the same as described in connection with the first electrode 11, the hole-transporting region 12, and the second electrode 19 illustrated in FIG. 1.

The first emission layer 251 and the second emission layer 252 illustrated in FIG. 3 are each the same as described in connection with the emission layer 15 illustrated in FIG. 1.

The electron-transporting region 270 illustrated in FIG. 3 may be the same as described in connection with the electron-transporting region 17 in FIG. 1.

As described above, referring to FIG. 3, an organic light-emitting device, in which each of the first emission layer 251 and the second emission layer 252 includes a first compound, a second compound, and a third compound, has been described. However, the organic light-emitting device may have various other forms. For example, one of the first emission layer 251 and the second emission layer 252 of the organic light-emitting device 200 of FIG. 3 may be replaced with any known emission layer, or an interlayer may be additionally located between neighboring emission layers.

Explanation of Terms

The term "first-row transition metal of the Periodic Table of Elements" as used herein refers to an element of Period 4 and the d-block of the Periodic Table of Elements, and non-limiting examples thereof include scandium (Sc), titanium (Ti), vanadium (V), chromium (Cr), manganese (Mn), iron (Fe), cobalt (Co), nickel (Ni), copper (Cu), and zinc (Zn).

The term "second-row transition metal of the Periodic Table of Elements" as used herein refers to an element of Period 5 and the d-block of the Periodic Table of Elements, and non-limiting examples thereof include yttrium (Y), zirconium (Zr), niobium (Nb), molybdenum (Mo), technetium (Tc), ruthenium (Ru), rhodium (Rh), palladium (Pd), silver (Ag), and cadmium (Cd).

The term "third-row transition metal of the Periodic Table of Elements" as used herein refers to an element of Period 6 and the d-block and the f-block of the Periodic Table of Elements, and non-limiting examples thereof include lanthanum (La), samarium (Sm), europium (Eu), terbium (Tb), thulium (Tm), ytterbium (Yb), lutetium (Lu), hafnium (Hf), tantalum (Ta), tungsten (W), rhenium (Re), osmium (Os), iridium (Ir), platinum (Pr), gold (Au), and mercury (Hg).

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" used herein refers to a monovalent group represented by $-OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocarbocyclic aromatic system that has at least one heteroatom as a ring-forming atom, and 1 to 60 carbon atoms. The term "$C_1$-$C_{60}$ heteroarylene group" as used herein refers to a divalent group having a carbocyclic aromatic system that has at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_6$-$C_{60}$ aryloxy group" as used herein indicates $—OA_{102}$ (wherein $A_{102}$ is the $C_6$-$C_{60}$ aryl group), and the term "$C_6$-$C_{60}$ arylthio group" as used herein indicates $—SA_{103}$ (wherein $A_{103}$ is the $C_6$-$C_{60}$ aryl group).

The term "monovalent non-aromatic condensed polycyclic group" used herein refers to a monovalent group in which two or more rings are condensed with each other, only carbon is used as a ring-forming atom (for example, the number of carbon atoms may be 8 to 60) and the whole molecule is a non-aromaticity group. Examples of the monovalent non-aromatic condensed polycyclic group include a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, a heteroatom N, O, P, Si, and S, other than carbon atoms (for example, having 1 to 60 carbon atoms), as a ring-forming atom, and no aromaticity in its entire molecular structure. Examples of the monovalent non-aromatic condensed heteropolycyclic group include a carbazolyl group. The term "divalent non-aromatic heterocondensed polycyclic group"

as used herein refers to a divalent group having the same structure as a monovalent non-aromatic heterocondensed polycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group, and may be a monovalent, divalent, trivalent, tetravalent, pentavalent, or hexavalent group, depending on the formula structure.

The term "$C_1$-$C_{30}$ heterocyclic group" as used herein refers to a saturated or unsaturated cyclic group having, as a ring-forming atom, at least one heteroatom N, O, Si, P, and S other than 1 to 30 carbon atoms. The $C_1$-$C_{30}$ heterocyclic group may be a monocyclic group or a polycyclic group, and may be a monovalent, divalent, trivalent, tetravalent, pentavalent, or hexavalent group, depending on the formula structure.

At least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted Cr $C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I,-$CD_3$,-$CD_2H$,-$CDH_2$, —$CF_3$, —$CF_2H$, —$CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or a combination thereof; or —$N(Q_{31})(Q_{32})$, —$Si(Q_{33})(Q_{34})(Q_{35})$, —$B(Q_{36})(Q_{37})$, or —$P(=O)(Q_{38})(Q_{39})$, wherein $Q_1$ to $Q_9$, $Q_{11}$ to $Q_{19}$, $Q_{21}$ to $Q_{29}$ and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

The term "room temperature" used herein refers to a temperature of about 25° C.

The terms "a biphenyl group, a terphenyl group, and a tetraphenyl group" used herein respectively refer to monovalent a group in which two, three, or four phenyl a group which are linked together via a single bond.

The terms "a cyano-containing phenyl group, a cyano-containing biphenyl group, a cyano-containing terphenyl group, and a cyano-containing tetraphenyl group" used herein respectively refer to a phenyl group, a biphenyl group, a terphenyl group, and a tetraphenyl group, each of which is substituted with at least one cyano group. In "a cyano-containing phenyl group, a cyano-containing biphenyl group, a cyano-containing terphenyl group, and a cyano-containing tetraphenyl group", a cyano group may be substituted to any position of the corresponding group, and the "cyano-containing phenyl group, the cyano-containing biphenyl group, the cyano-containing terphenyl group, and the cyano-containing tetraphenyl group" may further include substituents other than a cyano group. For example, a phenyl group substituted with a cyano group, and a phenyl group substituted with a cyano group and a methyl group may all belong to "a cyano-containing phenyl group."

Hereinafter, a compound and an organic light-emitting device according to embodiments are described in detail with reference to Synthesis Examples and Examples. However, the organic light-emitting device is not limited thereto. The wording "'B' was used instead of 'A'" used in describing Synthesis Examples means that an amount of 'A' used was identical to an amount of 'B' used, in terms of a molar equivalent.

EXAMPLES

Evaluation Example 1: Measurement of Lowest Excited Triplet Energy Level and Lowest Excited Singlet Energy Level The compounds described in Table 7 were vacuum-codeposited on a quartz substrate at weight ratios described in Table 7 and at a vacuum pressure of $10^{-7}$ torr to form films having a thickness of 40 nm. With respect to each of the films, the PL spectrum was evaluated at each of room temperature and low temperature (77K) by using FluoTime 300 of PicoQuant Inc. and PLS340, which is a pumping source of PicoQuant Inc., (excitation wavelength=340 nm, and spectrum width=20 nm), such that a triplet excited singlet energy level and a lowest excited triplet energy level were determined.

The compounds described in Tables 8 and 9 were dissolved in toluene having a concentration of $1\times10^{-4}$ M, and then placed into a quartz cell. Next, the PL spectrum was evaluated at each of room temperature and low temperature (77K) by using FluoTime 300 of PicoQuant Inc. and PLS340, which is a pumping source of PicoQuant Inc., (excitation wavelength=340 nm, and spectrum width=20 nm), such that a triplet excited singlet energy level and a lowest excited triplet energy level were determined.

In an embodiment, a wavelength of a main peak of a PL spectrum obtained for each film was determined, a lowest excited singlet energy level was determined from an onset of the PL spectrum at room temperature, and a lowest excited triplet energy level was determined from an onset of a peak observed only in the PL spectrum at low temperature.

TABLE 7

| Film no. | Film composition (weight ratio) | Lowest excited triplet energy level ($T_1$(Ex)) (eV) | Lowest excited singlet energy level ($S_1$(Ex)) (eV) |
|---|---|---|---|
| Film Ex 1 | HT-HOST A:ET-HOST A (5:5) | 2.81 | 3.26 |
| Film Ex 2 | HT-HOST A:ET-HOST A (1:9) | 2.81 | 3.26 |

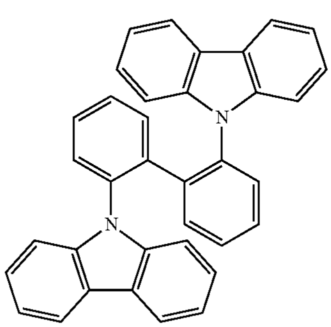

HT-HOST A

-continued

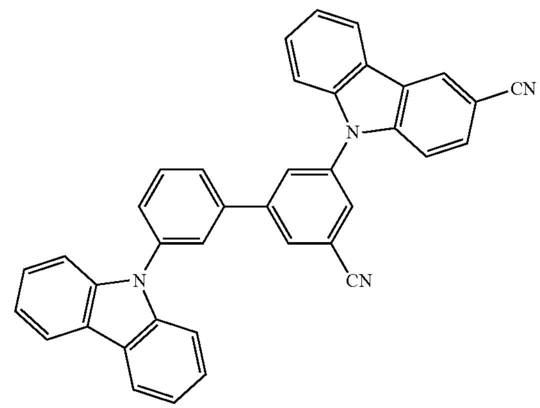

ET-HOST A

TABLE 8

| No. | Composition (weight ratio) | Lowest excited triplet energy level ($T_1$(Ex)) (eV) |
|---|---|---|
| C3 1 | TADF A (100) | 2.84 |
| C3 Comparison 1 | TADF D (100) | 2.70 |

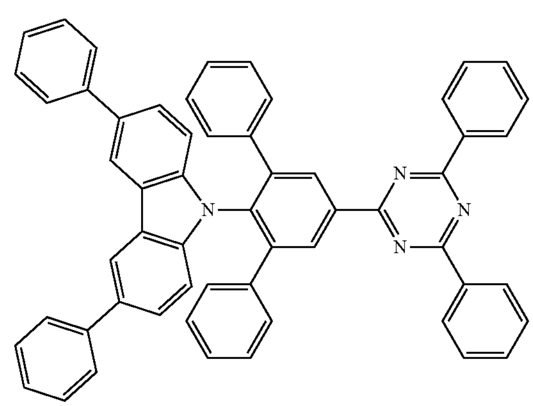

TADF A

-continued

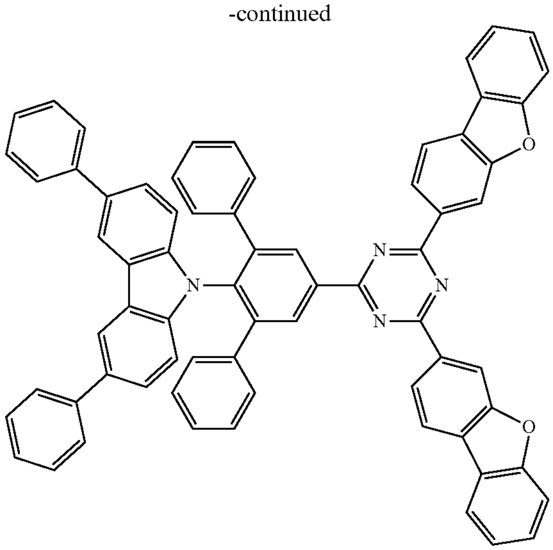

TADF D

TABLE 9

| No. | Composition (weight ratio) | Lowest excited triplet energy level ($T_1$(Ex)) (eV) |
|---|---|---|
| C4 1 | BD1-5 (100) | 2.71 |

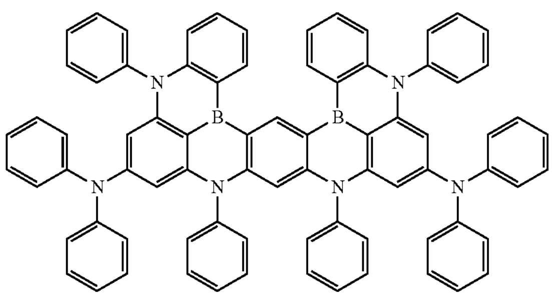

BD1-5

Example 1-1

A glass substrate patterned with an ITO electrode having a thickness of 50 nm was ultrasonically cleaned in acetone, isopropyl alcohol, and pure water for 15 minutes each, and then cleaned by UV ozone for 30 minutes.

Next, 40 nm-thick N,N'-diphenyl-N,N'-bis-[4-(phenyl-m-tolyl-amino)-phenyl]-biphenyl-4,4'-diamine (DNTPD), 10 nm-thick N,N,N'N'-tetra[(1,10-biphenyl)-4-yl]-(1,10-biphenyl)-4,4'-diamine (BPBPA), and 10 nm-thick 3,3-Di(9H-carbazol-9-yl)biphenyl (mCBP) were sequentially deposited on the ITO electrode (anode) of the glass substrate in this stated order.

Next, as an emission layer, HT-HOST A (a first compound), ET-HOST A (a second compound), TADF A (a third compound), and BD1-5 (a fourth compound) were co-deposited at a ratio described in Table 10 to thereby form an emission layer having a thickness of 30 nm.

2,8-bis(4,6-diphenyl-1,3,5-triazin-2-yl)dibenzo[b,d]thiophene (DBFTrz) was deposited on the emission layer to a thickness of 5 nm, 9,10-di(naphthalene-2-yl)anthracen-2-yl-(4,1-phenylene)(1-phenyl-1Hbenzo[d]imidazole (ZADN) was deposited thereon to a thickness of 20 nm, LiF was deposited thereon to a thickness of 1.5 nm, and Al was deposited thereon to a thickness of 200 nm, to thereby completing manufacture of an organic light-emitting device having a structure of ITO (50 nm)/DNTPD (40 nm)/BPBPA (10 nm)/mCBP (10 nm)/emission layer (30 nm)/DBFTrz (5 nm)/ZADN (20 nm)/LiF (1.5 nm)/Al (200 nm).

Examples 1-2 to 1-6 and Comparative Example 1-1

Organic light-emitting devices were manufactured in the same manner as used in Example 1-1, except that the first compound, the second compound, the third compound, and the fourth compound were each used as shown in Table 10 to form an emission layer.

TABLE 10

| | First compound | Second compound | Weight ratio of first compound to second compound | Third compound | Amount of third compound (wt %, based on total weight of emission layer) | Fourth compound | Amount of fourth compound (wt %, based on total weight of emission layer) |
|---|---|---|---|---|---|---|---|
| Example 1-1 | HT-HOST A | ET-HOST A | 1:9 | TADF A | 20 | BD1-5 | 1 |
| Example 1-2 | HT-HOST A | ET-HOST A | 1:9 | TADF A | 15 | BD1-5 | 1 |
| Example 1-3 | HT-HOST A | ET-HOST A | 1:9 | TADF A | 20 | BD1-5 | 0.5 |
| Example 1-4 | HT-HOST A | ET-HOST A | 1:9 | TADF A | 15 | BD1-5 | 0.5 |
| Example 1-5 | HT-HOST A | ET-HOST A | 1:9 | TADF A | 20 | BD1-5 | 0.2 |
| Example 1-6 | HT-HOST A | ET-HOST A | 1:9 | TADF A | 15 | BD1-5 | 0.2 |
| Comparative Example 1-1 | HT-HOST A | ET-HOST A | 1:9 | TADF D | 20 | BD1-5 | 1 |

Evaluation Example 3: Measurement of OLED Lifespan and External Quantum Efficiency With respect to each of the organic light-emitting devices manufactured in Examples 1-1 to 1-6 and Comparative Example 1-1, external quantum efficiency (EQE), maximum EQE, and lifespan were evaluated, and results are shown in Table 11. In this regard, the lifespan refers to a time ($T_{95}$) that is taken for the luminance to become 95% compared to the initial luminance of 100% at 1,000 nit.

TABLE 11

| | Lifespan (hr) | EQE (%) | Efficiency/y | Roll off (%) |
|---|---|---|---|---|
| Example 1-1 | 7.00 | 15.2 | 103.4 | 16.7 |
| Example 1-2 | 5.52 | 13.7 | 92.7 | 16.9 |
| Example 1-3 | 7.14 | 15.7 | 109.8 | 20.5 |
| Example 1-4 | 5.96 | 15.0 | 105.3 | 20.0 |
| Example 1-5 | 4.94 | 14.6 | 106.6 | 26.6 |
| Example 1-6 | 4.14 | 13.9 | 102.5 | 26.6 |
| Comparative Example 1-1 | 2.60 | 14.5 | 92.7 | 22.2 |

Referring to Table 11, it may be confirmed that each of the efficiency and the lifespan of the organic light-emitting devices of Examples 1-1 to 1-6 are improved.

The organic light-emitting device may have long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting device comprising:

a first electrode;

a second electrode; and an organic layer between the first electrode and the second electrode, wherein the organic layer comprises an emission layer, the emission layer comprises a first compound, a second compound, a third compound, and a fourth compound, wherein the first compound and the second compound form an exciplex, the exciplex and the third compound satisfy Conditions 1-1 and 1-2, and the fourth compound is represented by Formula 503:

$$T_1(Ex) \leq T_1(C3) < S_1(Ex) \quad \text{Condition 1-1}$$

$$T_1(C3) - T_1(Ex) < 0.3 \text{ eV} \quad \text{Condition 1-2}$$

wherein, in Conditions 1-1 and 1-2, $T_1(Ex)$ is a lowest excited triplet energy level of the exciplex, $T_1(C3)$ is a lowest excited triplet energy level of the third compound, and $S_1(Ex)$ is a lowest excited singlet energy level of the exciplex, Formula 503

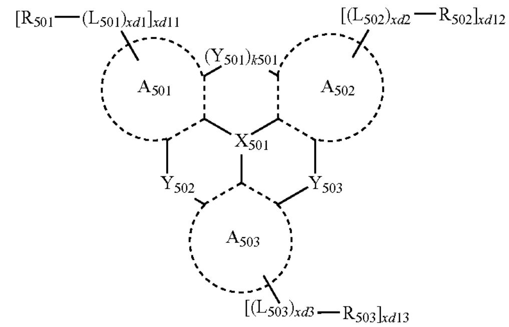

wherein, in Formula 503, $X_{501}$ is B, $Y_{501}$ to $Y_{503}$ are each independently O, S, $B(R_{505})$, $C(R_{505})(R_{506})$, or $Si(R_{505})(R_{506})$, k501 is 0 or 1, wherein, when k501 is 0, $—(Y_{501})_{k501}—$ does not exist, $A_{501}$ to $A_{503}$ are each independently a $C_5$-$C_{30}$ carbocyclic group or a $C_1$-$C_{30}$ heterocyclic group, $L_{501}$ to $L_{503}$ are each independently a substituted or unsubstituted $C_3$-$C_{10}$ cycloalkylene group, a substituted or unsubstituted heterocycloalkylene group, a substituted or unsubstituted $C_3$-$C_{10}$ cycloalkenylene group, a substituted or unsubstituted heterocycloalkenylene group, a substituted or unsubstituted $C_6$-$C_{60}$ arylene group, a substituted or unsubstituted heteroarylene group, a substituted or unsubstituted divalent non-aromatic condensed polycyclic group, or a substituted or unsubstituted divalent non-aromatic condensed heteropolycyclic group, xd1 to xd3 are each independently 0, 1, 2 or 3, i)

$R_{501}$ to $R_{506}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—C(Q_1)(Q_2)(Q_3)$, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, or $—P(=S)(Q_1)(Q_2)$, and $R_{501}$ to $R_{506}$ are optionally linked to each other to form a substituted or unsubstituted $C_5$-$C_{30}$ carbocyclic group or a substituted or unsubstituted $C_1$-$C_{30}$ heterocyclic group, xd11 and xd12 are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

2. The organic light-emitting device of claim 1, wherein the exciplex and the third compound further satisfy Condition 1-2-1:

$$T_1(C3)-T_1(Ex)\leq 0.15\text{ eV}. \qquad \text{Condition 1-2-1}$$

3. The organic light-emitting device of claim 1, wherein the first compound is a hole transporting host, the second compound is an electron transporting host, the electron transporting host comprises at least one electron transporting moiety, the hole transporting host does not comprise an electron transporting moiety, and the electron transporting moiety is a cyano group, —F, $—CFH_2$, $—CF_2H$, $—CF_3$, a π electron-deficient nitrogen-containing cyclic group, or a group represented by one of the formulae below:

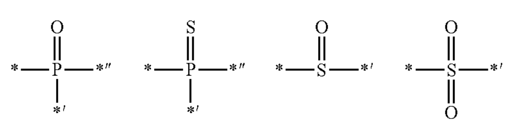

wherein *, *', and *" in the formulae above are each a binding site to a neighboring atom.

4. The organic light-emitting device of claim 1, wherein the third compound is a phosphorescent dopant or a delayed fluorescence dopant, and the third compound does not substantially emit light.

5. The organic light-emitting device of claim 1, wherein, in Formula 503, and $Y_{501}$ to $Y_{503}$ are each independently O, S, or $N(R_{505})$.

6. The organic light-emitting device of claim 1, wherein the fourth compound is represented by Formula 1:

Formula 1

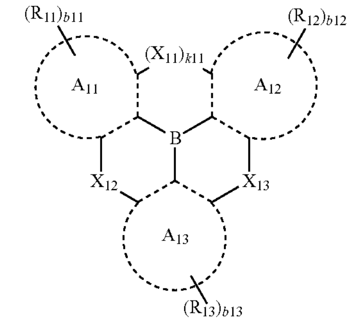

wherein, in Formula 1, $X_{11}$ is $NR_{14}$ or O, $X_{12}$ is $NR_{15}$ or O, $X_{13}$ is $NR_{16}$ or O, k11 is 0 or 1, wherein, when k11 is 0, $(X_{11})_{k11}$ does not exist, $A_{11}$ to $A_{13}$ are each independently a $C_5$-$C_{30}$ carbocyclic group or a $C_1$-$C_{30}$ heterocyclic group, $R_{11}$ to $R_{16}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $—C(Q_1)(Q_2)(Q_3)$, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, or $—P(=S)(Q_1)(Q_2)$, b11 to b13 are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

7. The organic light-emitting device of claim 6, wherein k11 is 0, and $A_{11}$ to $A_{13}$ are each independently a group represented by Formula 10A, a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group, Formula 10A

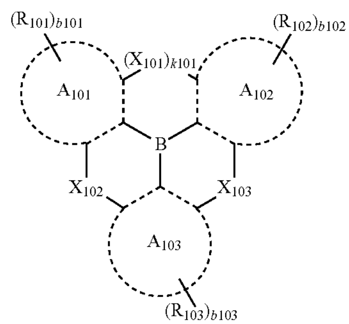

wherein, in Formula 10A, $X_{101}$ is $NR_{104}$ or O, $X_{102}$ is $NR_{105}$ or O, $X_{103}$ is $NR_{106}$ or O, k101 is 0 or 1, wherein, when k101 is 0, $(X_{101})_{k101}$ does not exist, $A_{101}$ to $A_{103}$ are each independently a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group, $R_{101}$ to $R_{106}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted heteroarylthio group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), b101 to b103 are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

8. The organic light-emitting device of claim 1, wherein the fourth compound is represented by Formula 1-1 or 1-2:

1-1

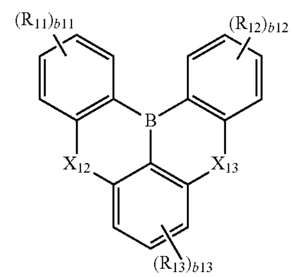

1-2

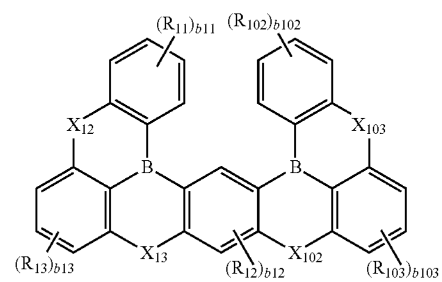

wherein, in Formulae 1-1 and 1-2, $X_{12}$ is $NR_{15}$ or O, $X_{13}$ is $NR_{16}$ or O, $X_{102}$ is $NR_{105}$ or O, $X_{103}$ is $NR_{106}$ or O, $R_{11}$ to $R_{13}$, $R_{15}$, $R_{16}$, $R_{102}$, $R_{103}$, $R_{105}$, and $R_{106}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), b11 to b13, b102, and b103 are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, a substituted $C_6$-$C_{60}$ aryl group that is substituted with at least one deuterium, —F, a cyano group, a $C_1$-$C_{60}$ alkyl group, a $C_6$-$C_{60}$ aryl group, or a combination thereof.

* * * * *